US012075597B1

(12) United States Patent
Dunsmoor et al.

(10) Patent No.: US 12,075,597 B1
(45) Date of Patent: Aug. 27, 2024

(54) HEAD MOUNTABLE DISPLAY

(71) Applicant: Apple Inc., Cupertino, CA (US)

(72) Inventors: David J. Dunsmoor, San Jose, CA (US); Enoch Mylabathula, San Jose, CA (US); Jesse T. Dybenko, Santa Cruz, CA (US); Laura M. Campo, Santa Clara, CA (US); Sivesh Selvakumar, Mountain View, CA (US)

(73) Assignee: APPLE INC., Cupertino, CA (US)

(*) Notice: Subject to any disclaimer, the term of this patent is extended or adjusted under 35 U.S.C. 154(b) by 0 days.

(21) Appl. No.: 18/478,506

(22) Filed: Sep. 29, 2023

Related U.S. Application Data

(60) Provisional application No. 63/586,403, filed on Sep. 28, 2023, provisional application No. 63/506,020,
(Continued)

(51) Int. Cl.
*H05K 7/20* (2006.01)
*G06F 1/16* (2006.01)
(Continued)

(52) U.S. Cl.
CPC ......... *H05K 7/20172* (2013.01); *G06F 1/163* (2013.01); *G06F 1/203* (2013.01); *H05K 5/03* (2013.01); *H05K 7/2039* (2013.01)

(58) Field of Classification Search
CPC .. G02B 27/017; G02B 27/0093; G02B 7/008; G02B 2027/014; G02B 27/0006;
(Continued)

(56) References Cited

U.S. PATENT DOCUMENTS 6,134,104 A 10/2000 Mohi et al.
6,239,359 B1 5/2001 Lilienthal et al.
(Continued)

FOREIGN PATENT DOCUMENTS

WO 2017100074 A1 6/2017
WO 2020226791 A1 11/2020
(Continued)

OTHER PUBLICATIONS

Amadio, Adam, U.S. Appl. No. 63/448,995 entitled "Devices, Methods, and Graphical User Interface for Adjusting Device Settings" filed Feb. 28, 2023.
(Continued)

*Primary Examiner* — Michael A Matey
(74) *Attorney, Agent, or Firm* — Dorsey & Whitney LLP

(57) ABSTRACT

A head-mountable device can include an outer frame that can define a first opening, a second opening an internal volume between the first opening and the second opening, an intake port between the first opening and the second opening, and an exhaust port between the first opening and the second opening. In some examples, a front cover assembly can be disposed in the first opening. An inner frame can be coupled to the outer frame, where the inner frame can also define a first aperture and a second aperture. In some examples, a curtain assembly can occlude the second opening. Furthermore, the curtain assembly can include an elastic layer that can define an external surface. The curtain assembly can also include an air-impermeable layer that can define the internal volume.

20 Claims, 592 Drawing Sheets

Related U.S. Application Data filed on Jun. 2, 2023, provisional application No. 63/502,408, filed on May 15, 2023.

(51) Int. Cl.
*G06F 1/20* (2006.01)
*H05K 5/03* (2006.01)

(58) Field of Classification Search
CPC .......... G02B 2027/0138; G02B 27/028; G02B 2027/0169; G02B 25/001; G06F 1/163; G06F 1/203; G06F 3/011; G06F 1/206; G06F 1/1637; G06F 1/20; G06F 3/013; H05K 5/03; H05K 7/2039; H05K 7/20145; H05K 7/20172; H05K 7/20972; H05K 7/20963; H05K 7/20209; H05K 5/0204; H05K 7/20154; A41D 13/1184; H04N 13/344; A42B 3/286; H04M 1/724097
See application file for complete search history.

(56) References Cited

U.S. PATENT DOCUMENTS 9,733,480 B2 * 8/2017 Baek ........................ G06F 1/163
10,133,305 B1 11/2018 Sullivan et al.
10,165,705 B2 12/2018 Varadarajan et al.
10,178,457 B1 * 1/2019 Tao ........................ H04R 1/028
10,212,517 B1 2/2019 Beltran et al.
10,261,555 B1 * 4/2019 Cooper .............. H05K 7/20209
10,338,647 B2 7/2019 Neukam
10,416,455 B2 9/2019 Yi et al.
10,496,130 B1 * 12/2019 Yee ........................ G06F 3/011
10,610,775 B1 4/2020 Ebert
10,806,053 B1 10/2020 Toleno et al.
10,863,637 B1 * 12/2020 Pickett ................. H05K 5/0204
11,249,514 B2 2/2022 Kuo et al.
11,662,550 B1 5/2023 Smith et al.
11,698,536 B2 * 7/2023 Pope ....................... G06F 3/011 361/679.47
11,774,705 B1 10/2023 Ebert et al.
2001/0014011 A1 8/2001 Sasa et al.
2001/0023591 A1 9/2001 Maeda et al.
2001/0050842 A1 12/2001 Katsui
2002/0186532 A1 12/2002 Tomioka et al.
2003/0156385 A1 8/2003 Askeland et al.
2006/0133048 A1 6/2006 Kobayashi et al.
2007/0030442 A1 2/2007 Howell et al.
2008/0285290 A1 11/2008 Ohashi et al.
2009/0086430 A1 4/2009 Kang et al.
2009/0195983 A1 8/2009 Reichert et al.
2010/0079356 A1 4/2010 Hoellwarth
2011/0176279 A1 7/2011 Zhao et al.
2011/0222237 A1 9/2011 Fujiwara et al.
2012/0236025 A1 9/2012 Jacobsen et al.
2013/0070172 A1 3/2013 Ooe
2013/0194744 A1 8/2013 Chen et al.
2013/0321925 A1 12/2013 Jacobs et al.
2014/0268578 A1 9/2014 Dolci et al.
2014/0320972 A1 10/2014 Magyari et al.
2014/0340628 A1 11/2014 Huang
2015/0017905 A1 1/2015 Li et al.
2015/0235426 A1 8/2015 Lyons
2015/0253574 A1 * 9/2015 Thurber ............. G02B 27/0172 359/630
2015/0378164 A1 12/2015 Bailey et al.
2016/0004085 A1 * 1/2016 Stroetmann ........ G02B 27/0176 345/8
2016/0062454 A1 * 3/2016 Wang ................. G02B 27/0172 345/633
2016/0085278 A1 3/2016 Osterhout et al.
2016/0212888 A1 7/2016 Nikkhoo et al.
2016/0246059 A1 8/2016 Halpin et al.
2016/0255748 A1 * 9/2016 Kim .................... G02B 27/017 361/695
2016/0299346 A1 10/2016 Allin et al.
2016/0327795 A1 11/2016 Jarvenpaa et al.
2016/0334628 A1 11/2016 Lyons
2017/0090212 A1 3/2017 Rinehart
2017/0090514 A1 3/2017 Byun et al.
2017/0094816 A1 * 3/2017 Yun ...................... H05K 5/0013
2017/0168303 A1 * 6/2017 Petrov .................... G02C 11/08
2017/0184863 A1 * 6/2017 Balachandreswaran ..................... G02B 27/0176
2017/0311483 A1 * 10/2017 Kawai ................ H05K 7/20963
2017/0358136 A1 12/2017 Gollier et al.
2018/0003919 A1 * 1/2018 Song ...................... G06V 40/19
2018/0039329 A1 2/2018 Tumey
2018/0095498 A1 * 4/2018 Raffle ................ G06K 7/10297
2018/0098465 A1 * 4/2018 Reynolds ........... H05K 7/20972
2018/0157043 A1 6/2018 Yi et al.
2018/0196485 A1 * 7/2018 Cheng ..................... G06F 1/206
2018/0210492 A1 7/2018 Chen et al.
2018/0267575 A1 9/2018 Sullivan et al.
2018/0307282 A1 * 10/2018 Allin ................. G02B 27/0176
2018/0338130 A1 11/2018 Miller et al.
2018/0348812 A1 * 12/2018 Miller .................. G06F 1/1686
2018/0364491 A1 12/2018 Park et al.
2018/0373371 A1 * 12/2018 Kim ..................... G09G 3/3233
2018/0376626 A1 12/2018 Hurbi et al.
2019/0014840 A1 1/2019 Fung et al.
2019/0041899 A1 2/2019 Ellis et al.
2019/0072772 A1 * 3/2019 Poore ...................... G06F 3/013
2019/0075689 A1 * 3/2019 Selvakumar ......... G02B 27/017
2019/0104650 A1 * 4/2019 McGinty ............ H05K 7/20963
2019/0107870 A1 * 4/2019 Ali .......................... G06F 1/203
2019/0171023 A1 6/2019 Carlvik et al.
2019/0265488 A1 8/2019 Lyons
2019/0266798 A1 * 8/2019 Ngai ....................... G06F 1/163
2019/0317573 A1 10/2019 Allin et al.
2019/0361488 A1 * 11/2019 Lee ................... G02B 27/0176
2019/0369660 A1 12/2019 Wen et al.
2020/0033560 A1 1/2020 Weber et al.
2020/0096775 A1 3/2020 Franklin et al.
2020/0241611 A1 7/2020 Allin et al.
2020/0278564 A1 9/2020 Thorsell et al.
2020/0341283 A1 10/2020 McCracken et al.
2020/0409150 A1 * 12/2020 Lee .......................... G02B 7/02
2021/0020542 A1 1/2021 Kumura
2021/0033916 A1 2/2021 Uchimi et al.
2021/0034100 A1 2/2021 Lesuffleur et al.
2021/0055572 A1 2/2021 Mendelsohn
2021/0063744 A1 3/2021 Maric et al.
2021/0072556 A1 3/2021 Kim et al.
2021/0089130 A1 3/2021 Novich et al.
2021/0185855 A1 * 6/2021 Maric ..................... G06F 3/011
2021/0271081 A1 9/2021 Yun et al.
2021/0278875 A1 9/2021 Allin et al.
2021/0303024 A1 * 9/2021 Kuo ........................ G06F 1/203
2021/0325631 A1 10/2021 Tao et al.
2021/0333506 A1 10/2021 Maric et al.
2021/0333823 A1 10/2021 Maric et al.
2021/0337288 A1 10/2021 Peng et al.
2021/0349322 A1 11/2021 Harris et al.
2021/0385954 A1 * 12/2021 Chang .................. H05K 5/0217
2021/0405396 A1 12/2021 Ma et al.
2022/0155909 A1 5/2022 Kawashima et al.
2022/0312631 A1 9/2022 Xi et al.
2022/0354030 A1 11/2022 Lin et al.
2022/0365355 A1 * 11/2022 Li ...................... G02B 27/0176
2022/0404578 A1 12/2022 Lee et al.
2023/0070026 A1 3/2023 Christian
2023/0209786 A1 6/2023 Dunn
2023/0214025 A1 7/2023 Lessman et al.
2023/0218159 A1 7/2023 Eadie et al.
2023/0247811 A1 8/2023 Moghaddam et al.
2023/0247861 A1 8/2023 Moghaddam et al.
2023/0276595 A1 8/2023 Moghaddam et al.
2023/0359047 A1 11/2023 Liu et al.
2023/0418019 A1 12/2023 Birnschein et al.
2023/0418370 A1 12/2023 Wu
2024/0028072 A1 1/2024 Yan et al.

(56) References Cited

U.S. PATENT DOCUMENTS

| | | | | |
|---|---|---|---|---|
| 2024/0035892 | A1 | 2/2024 | Mendez et al. | |
| 2024/0053795 | A1 | 2/2024 | Trincia et al. | |
| 2024/0094547 | A1 * | 3/2024 | Dunsmoor ......... | G02B 27/0176 |

FOREIGN PATENT DOCUMENTS

| | | | |
|---|---|---|---|
| WO | 2021061333 | A1 | 4/2021 |
| WO | 2022026220 | A2 | 2/2022 |
| WO | 2022060547 | A1 | 3/2022 |
| WO | 2022060605 | A2 | 3/2022 |
| WO | 2022093405 | A2 | 5/2022 |
| WO | 2023010052 | A1 | 2/2023 |
| WO | 2023034037 | A1 | 3/2023 |
| WO | 2023034074 | A1 | 3/2023 |
| WO | 2023038826 | A1 | 3/2023 |
| WO | 2023043595 | A1 | 3/2023 |
| WO | 2023121916 | A1 | 6/2023 |
| WO | 2023147537 | A2 | 8/2023 |
| WO | 2023235523 | A1 | 12/2023 |
| WO | 2024006632 | A1 | 1/2024 |

OTHER PUBLICATIONS

Bosch, Erin, U.S. Appl. No. 63/376,743 entitled "Removable Facial Interface" filed Sep. 22, 2022.

David, Ryan, U.S. Appl. No. 63/505,653 entitled "Adjustable Headband" filed Jun. 1, 2023.

David, Ryan, U.S. Appl. No. 63/505,657 entitled "Devices with Detachable Headbands" filed Jun. 1, 2023.

Dedonato, Amy, U.S. Appl. No. 63/409,748 entitled "Devices, Methods, and Graphical User Interfaces for Interacting with Three-Dimensional Environments" filed Sep. 24, 2022.

Dhandhania, Vedant, U.S. Appl. No. 63/426,143 entitled "Electronic Devices with Stretchable Fabrics" filed Nov. 17, 2022.

Dhandhania, Vedant, U.S. Appl. No. 63/426,262 entitled "Electronic Devices with Light-Blocking Fabrics" filed Nov. 17, 2022.

Dybenko, Jesse, U.S. Appl. No. 63/401,512 entitled "Fan with Debris Mitigation" filed Aug. 26, 2022.

Helbert, Kendall, U.S. Appl. No. 63/479,145 entitled "Modular Strap for an Electronic Device" filed Jan. 9, 2023.

Huergo, Alfred, U.S. Appl. No. 63/409,752 entitled "Devices, Methods, and Graphical User Interfaces for Providing Computer-Generated Experiences" filed Sep. 24, 2022.

Kasar, Darshan, U.S. Appl. No. 63/371,792 entitled "Face Engaging Structure" filed Aug. 18, 2022.

Kasar, Darshan, U.S. Appl. No. 63/375,919 entitled "Touch Sensitive Input Surface" filed Sep. 16, 2022.

Kasar, Darshan,, U.S. Appl. No. 63/374,741 entitled "Face Engaging Structures" filed Sep. 6, 2022.

Kollgaard, Adam, U.S. Appl. No. 63/376,761 entitled "Adjustment Mechanism" filed Sep. 22, 2022.

Matzinger, Thomas, U.S. Appl. No. 63/431,395 entitled "Electronic Devices with Movable Optical Assemblies" filed Dec. 9, 2022.

Mendez, Javier, U.S. Appl. No. 63/374,740 entitled "Conductive Fabric Architecture" filed Sep. 6, 2022.

Mendez, Javier, U.S. Appl. No. 63/376,280 entitled "Integrated Health Sensors" filed Sep. 19, 2022.

Mendez, Javier, U.S. Appl. No. 63/376,281 entitled "Health Sensing Retention Band" filed Sep. 19, 2022.

Osiroff, Nadav, U.S. Appl. No. 63/376,428 entitled "Facial Interface Having Integrated Health Sensors" filed Sep. 20, 2022.

Ravasz, Jonathan, U.S. Appl. No. 63/453,708 entitled "Devices, Methods, and Graphical User Interface for Capturing Media with a Camera Application" filed Mar. 21, 2023.

Yao, Stephen, U.S. Appl. No. 63/476,528 entitled "Electrical Connectors (LTAN)" filed Dec. 21, 2022.

Simgamsetty, Divakar, U.S. Appl. No. 63/482,957 entitled "Systems with Cover Layer Sealing Structures" filed Feb. 2, 2023.

Simgamsetty, Divakar, U.S. Appl. No. 63/505,658 entitled "Systems with Cover Layer Sealing Structures" filed Jun. 1, 2023.

Singamsetty, Divakar, U.S. Appl. No. 18/391,247 entitled "Systems with Cover Layer Sealing Structures" filed Dec. 20, 2023.

Tao, Yiwei, U.S. Appl. No. 63/376,284 entitled "Cable Tensioning System and Dial" filed Sep. 19, 2022.

Trekell, Blake, U.S. Appl. No. 63/431,394 entitled "Lens Mounting Systems" filed Dec. 9, 2022.

Trincia, Nicholas, U.S. Appl. No. 63/397,581 entitled "Nosepiece" filed Aug. 12, 2022.

Trincia, Nicholas, U.S. Appl. No. 63/504,134 entitled "Electronic Devices with Light Blocking Structures" filed May 24, 2023.

Vicente, Israel, U.S. Appl. No. 63/377,024 entitled "Methods for Interacting with User Interfaces Based on Attention" filed Sep. 24, 2022.

Wilson, James, U.S. Appl. No. 63/407,031 entitled "Systems with Transport Layers" filed Sep. 15, 2022.

Zimmerman, Aidan, U.S. Appl. No. 63/224,158 entitled "Sensor Assembly" filed Sep. 14, 2021.

Zimmerman, Aidan, U.S. Appl. No. 18/685,492 entitled "Sensor Assembly" filed Feb. 21, 2024.

* cited by examiner

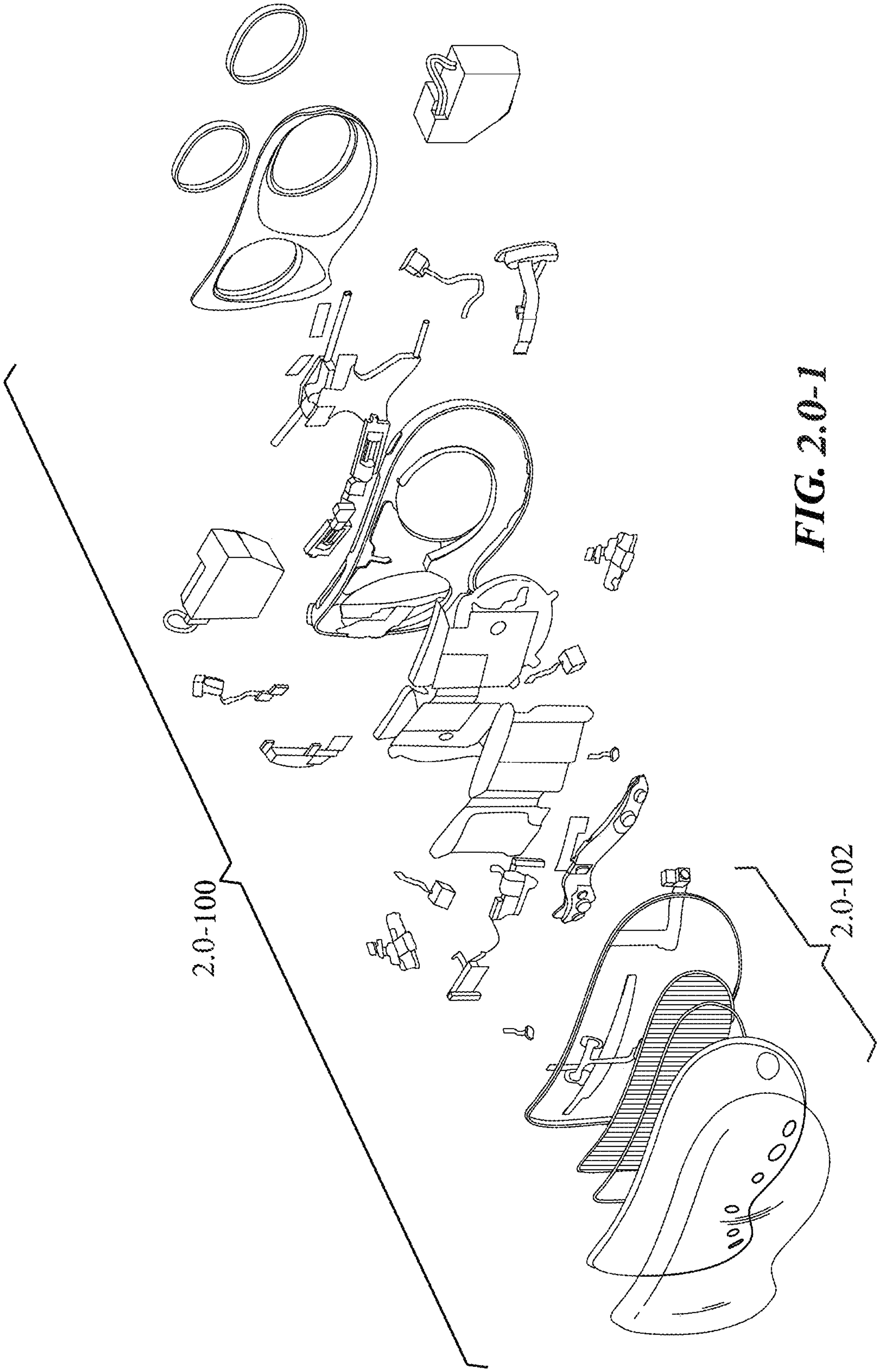
FIG. 2.0-1

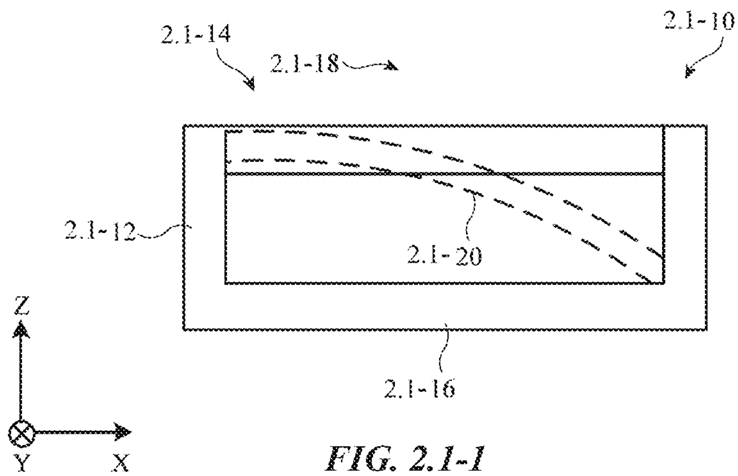
FIG. 2.1-1
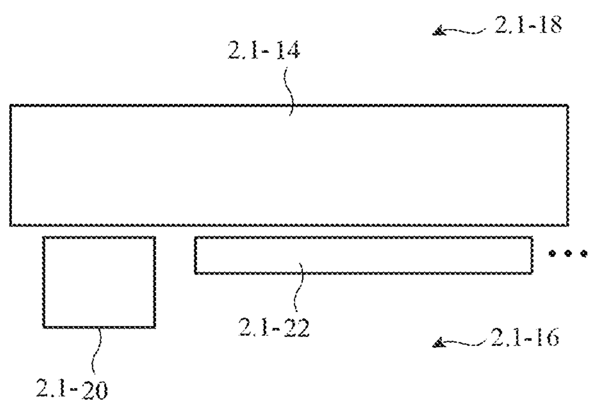
FIG. 2.1-2

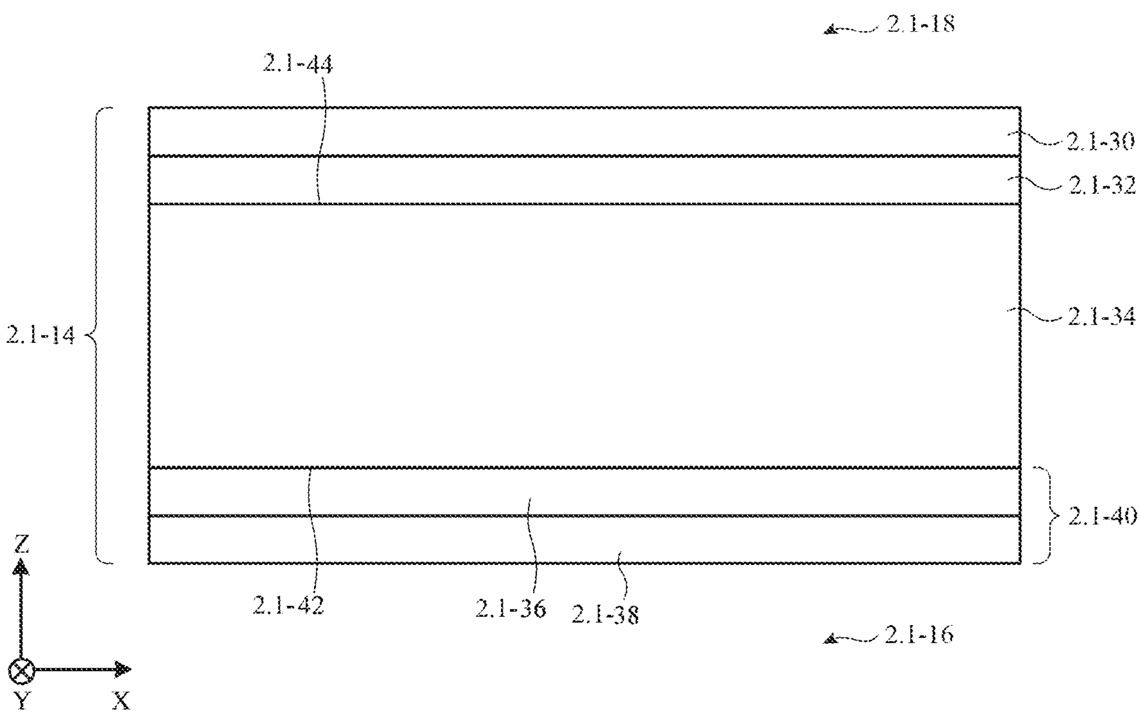
FIG. 2.1-3

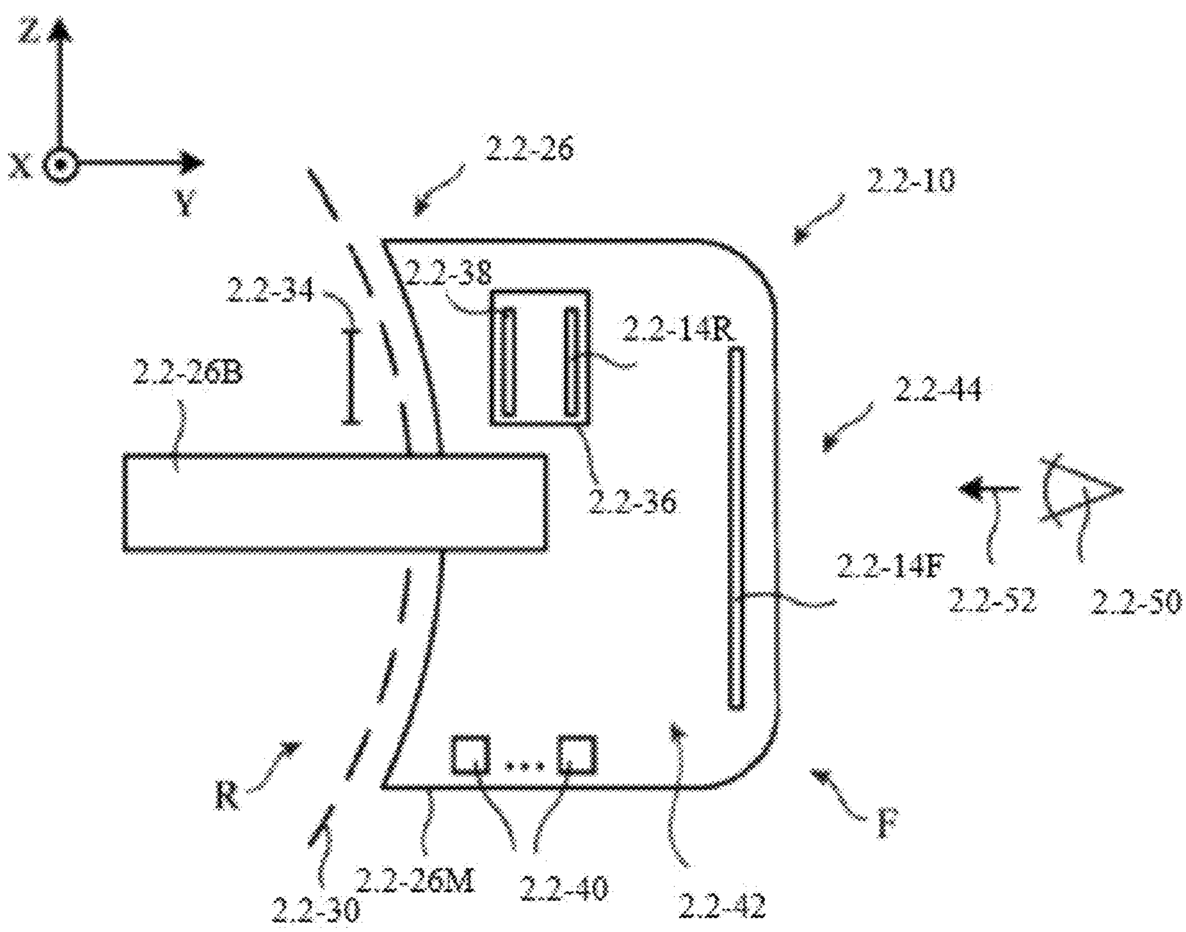
FIG. 2.2-1

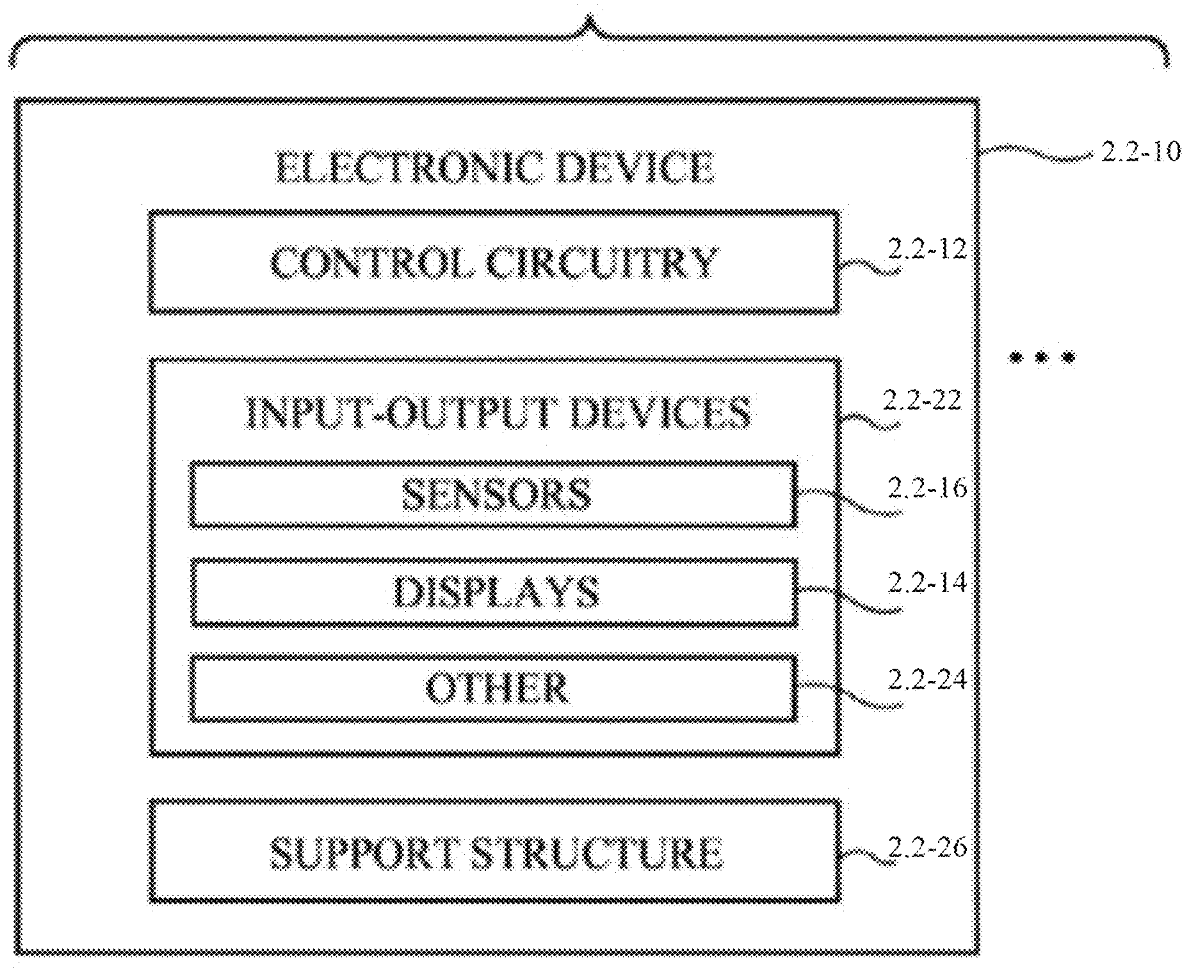
*FIG. 2.2-2*

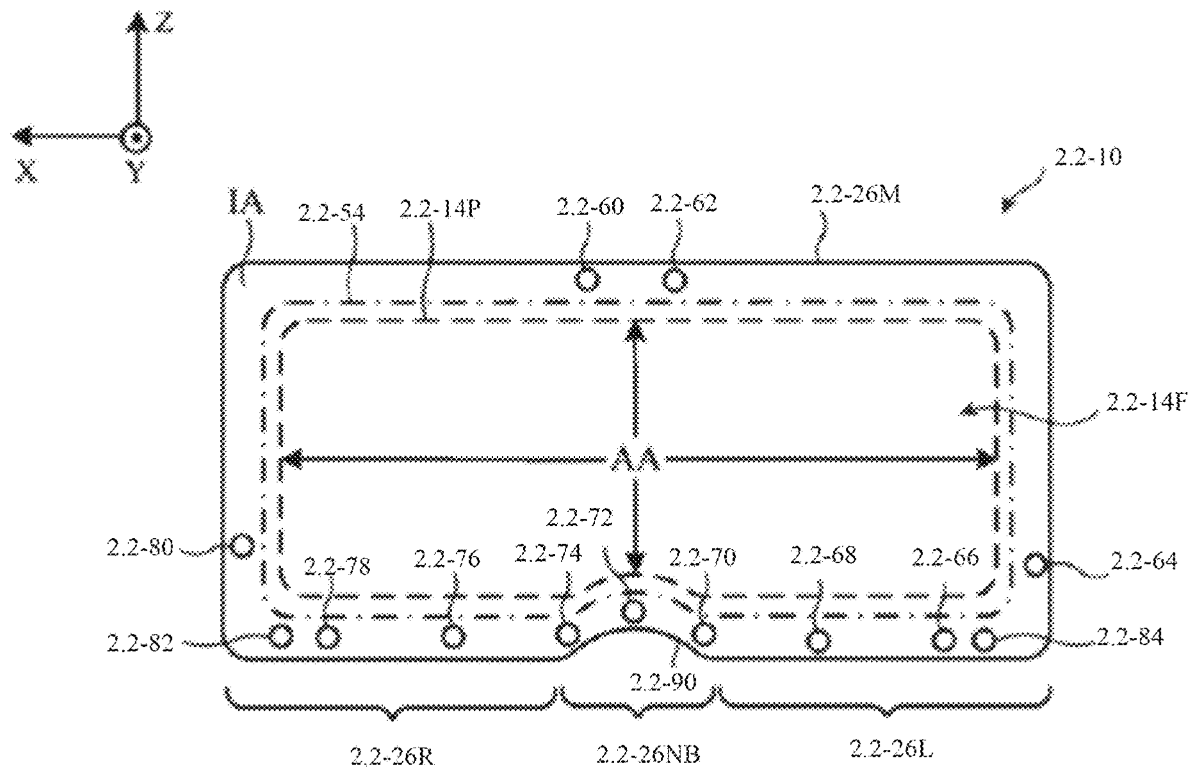
*FIG. 2.2-3*

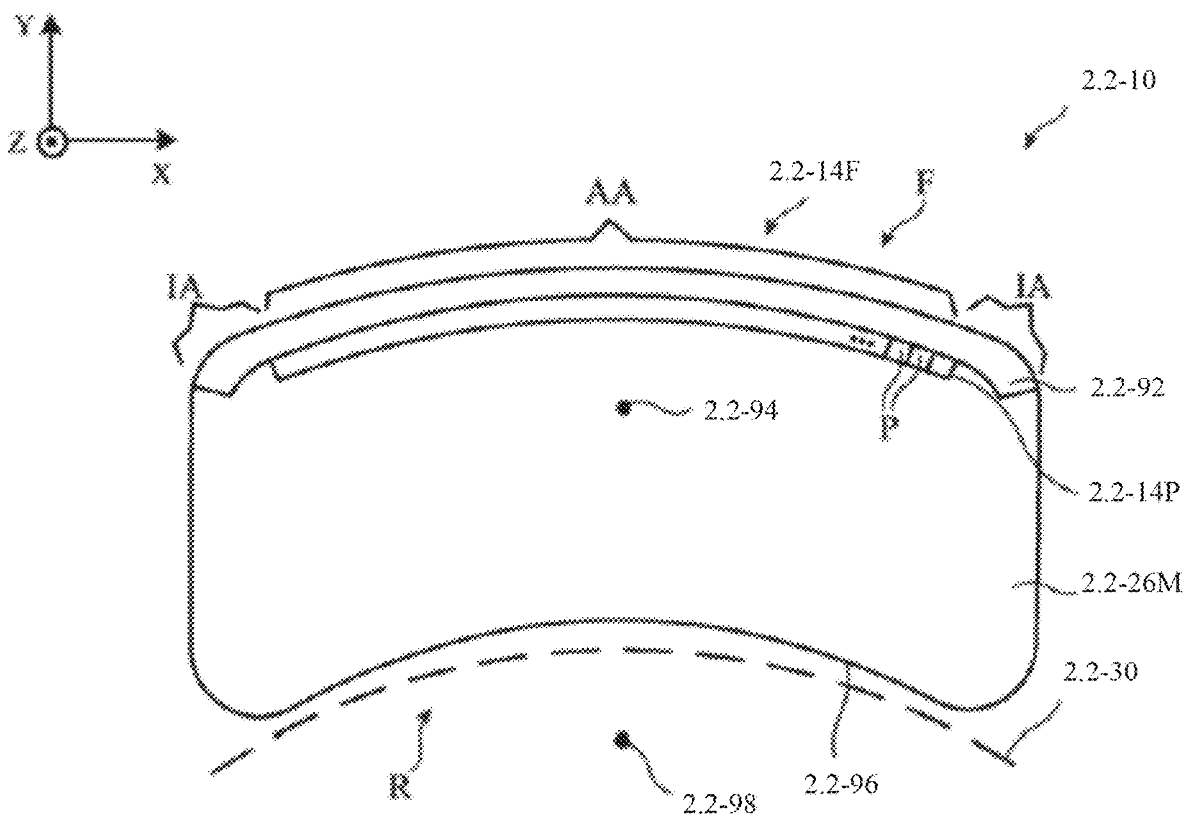
*FIG. 2.2-4*

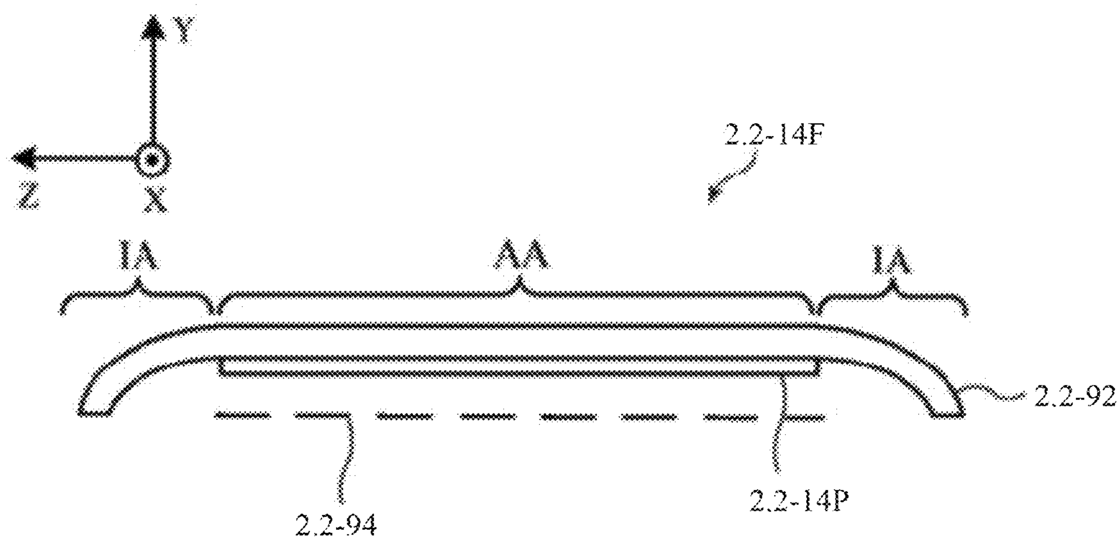
*FIG. 2.2-5A*
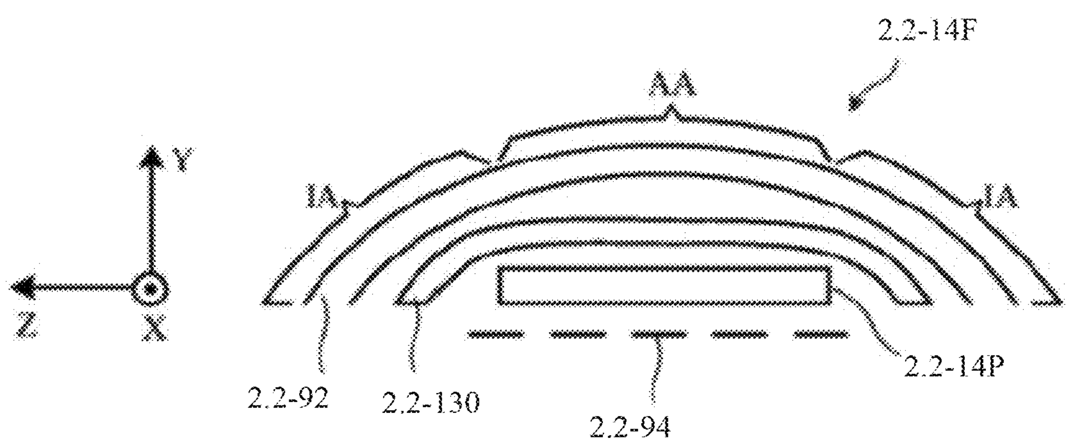
*FIG. 2.2-5B*

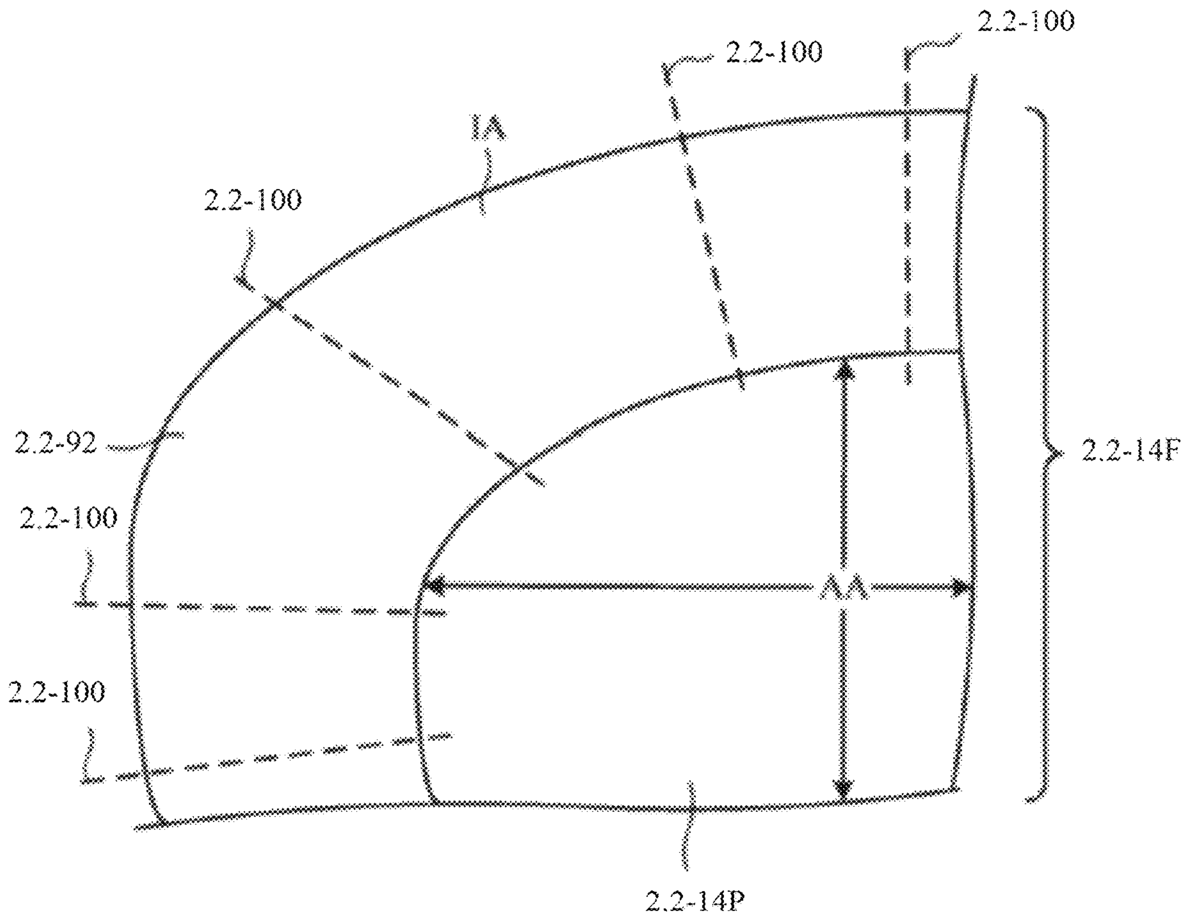
*FIG. 2.2-6*

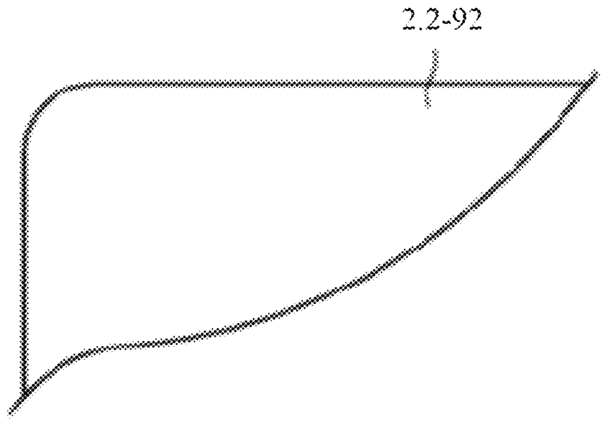
*FIG. 2.2-7*
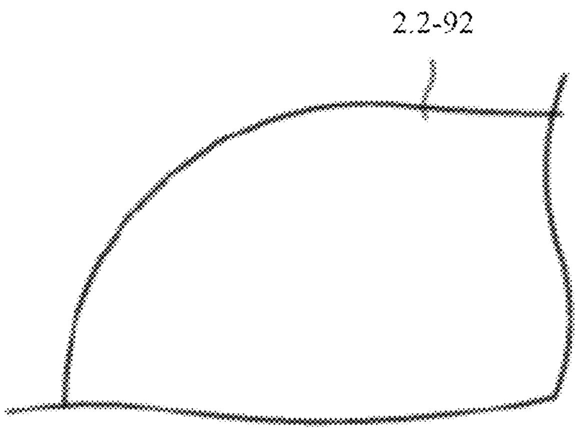
*FIG. 2.2-8*
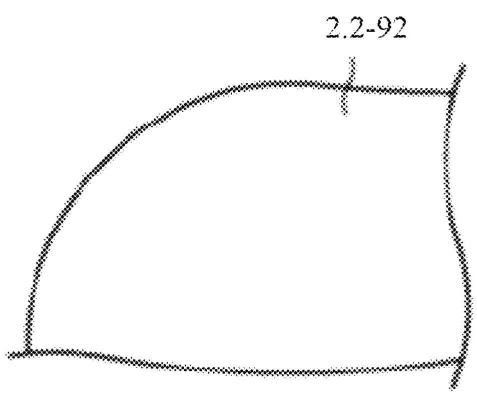
*FIG. 2.2-9*

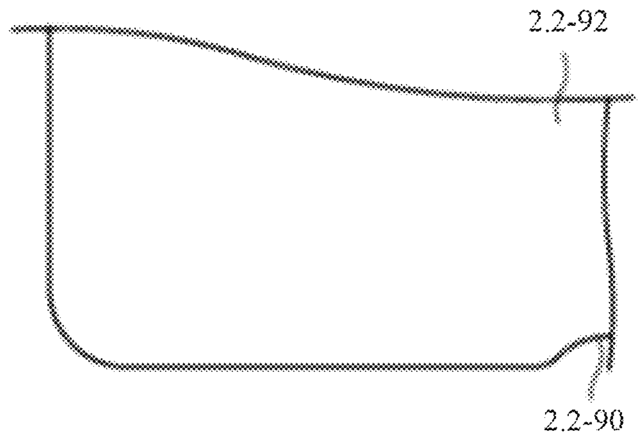
*FIG. 2.2-10*
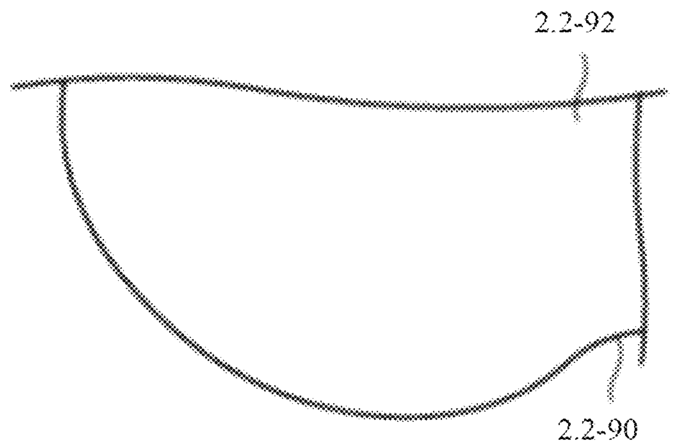
*FIG. 2.2-11*
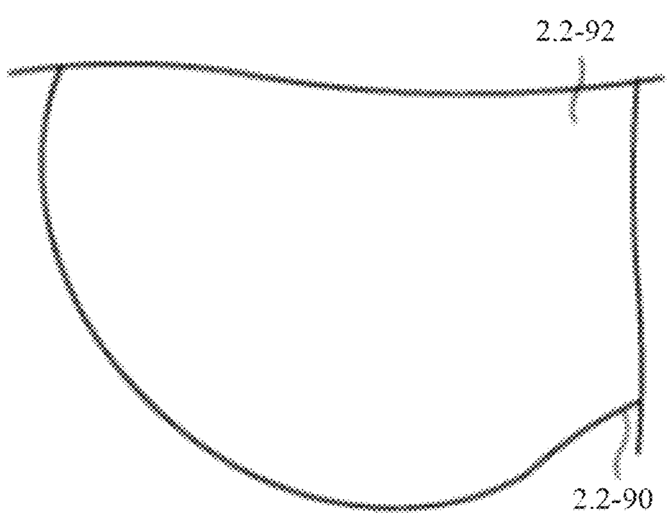
*FIG. 2.2-12*

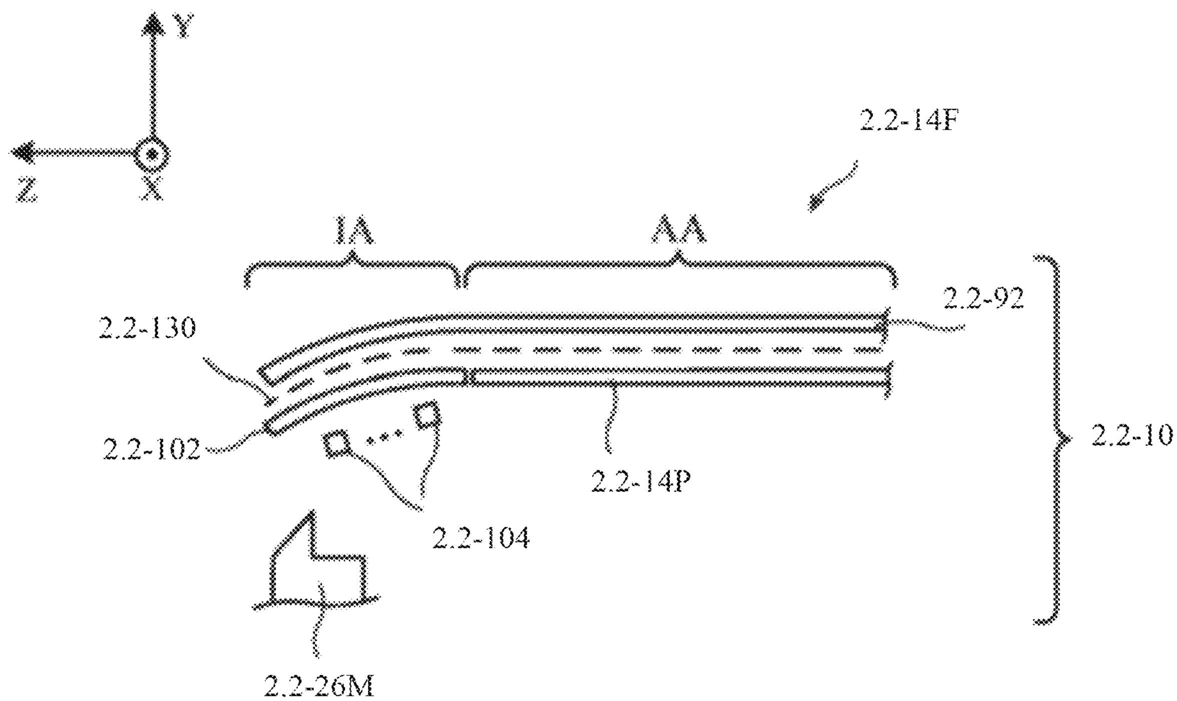
*FIG. 2.2-13*

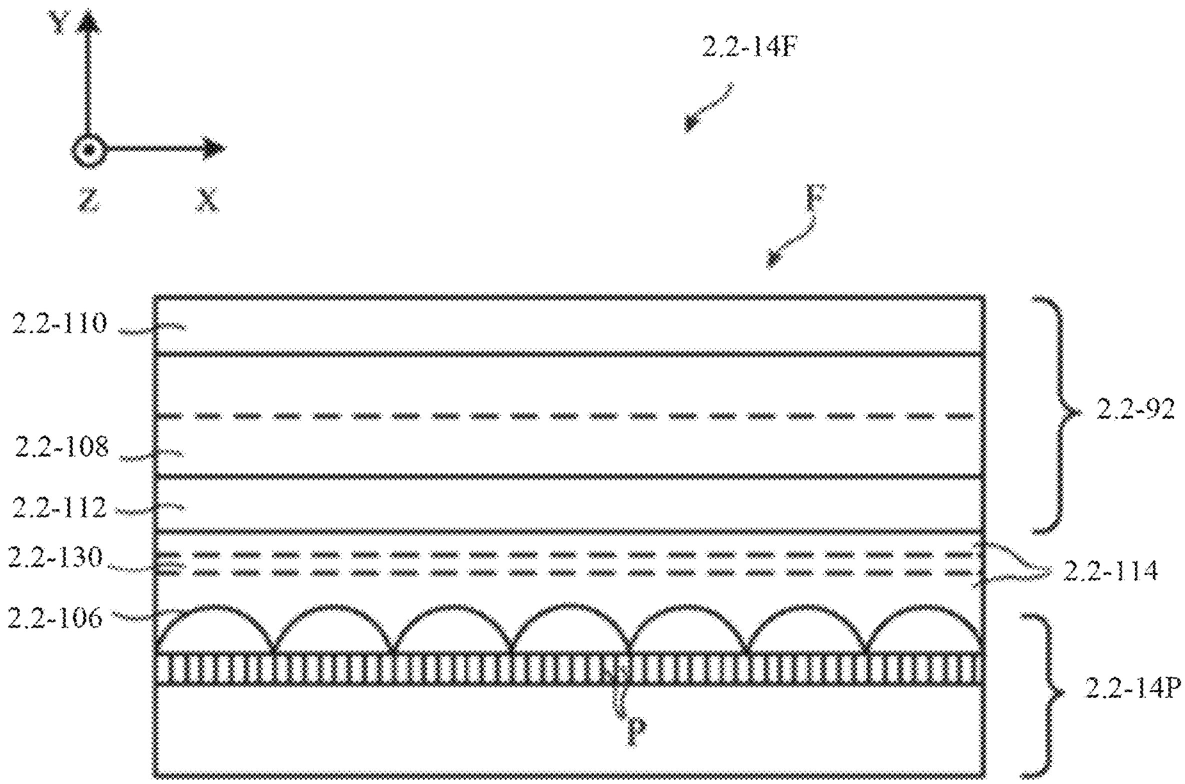
*FIG. 2.2-14*
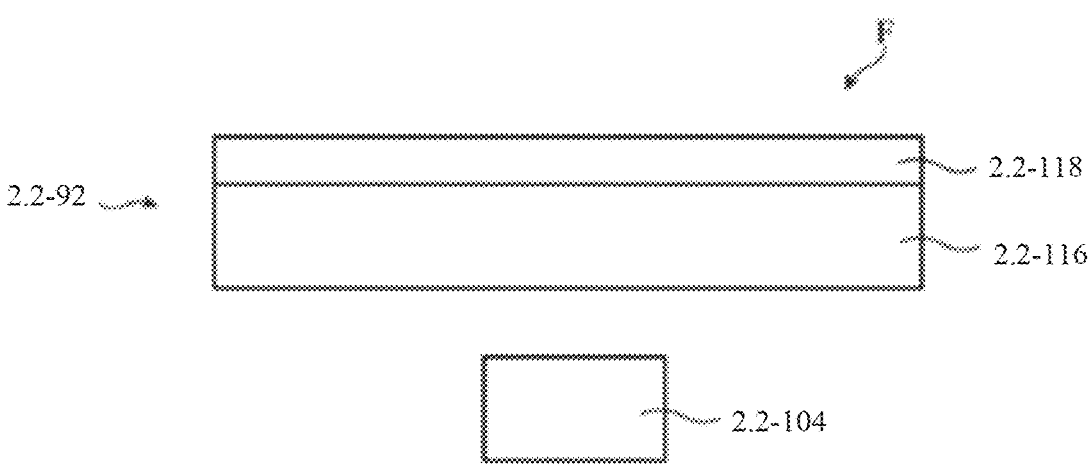
*FIG. 2.2-15*

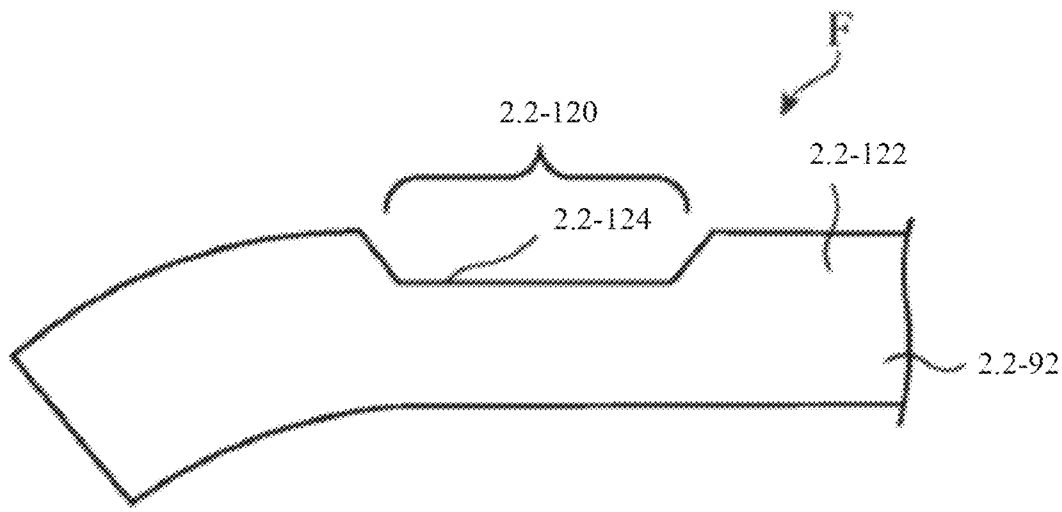
*FIG. 2.2-16*
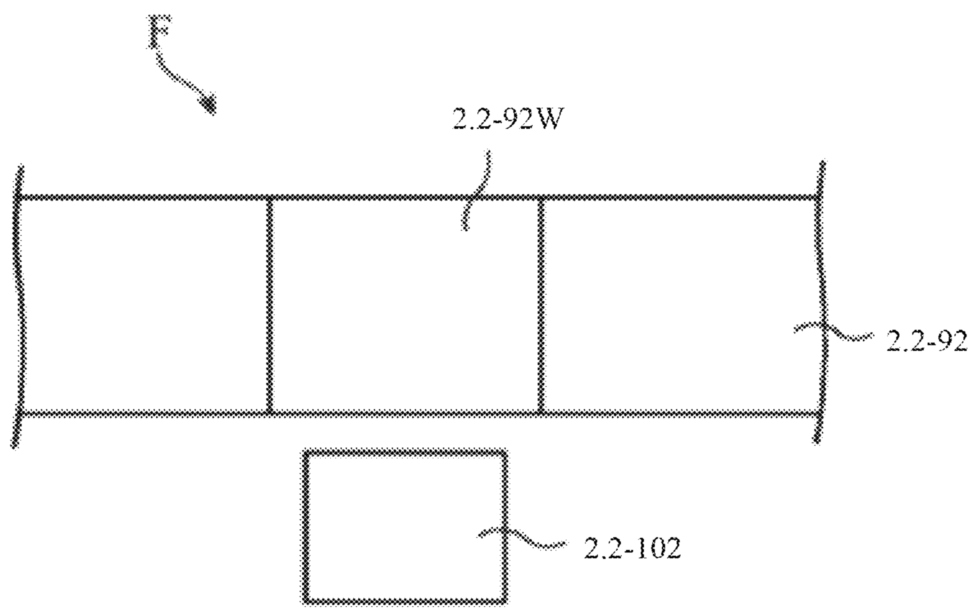
*FIG. 2.2-17*

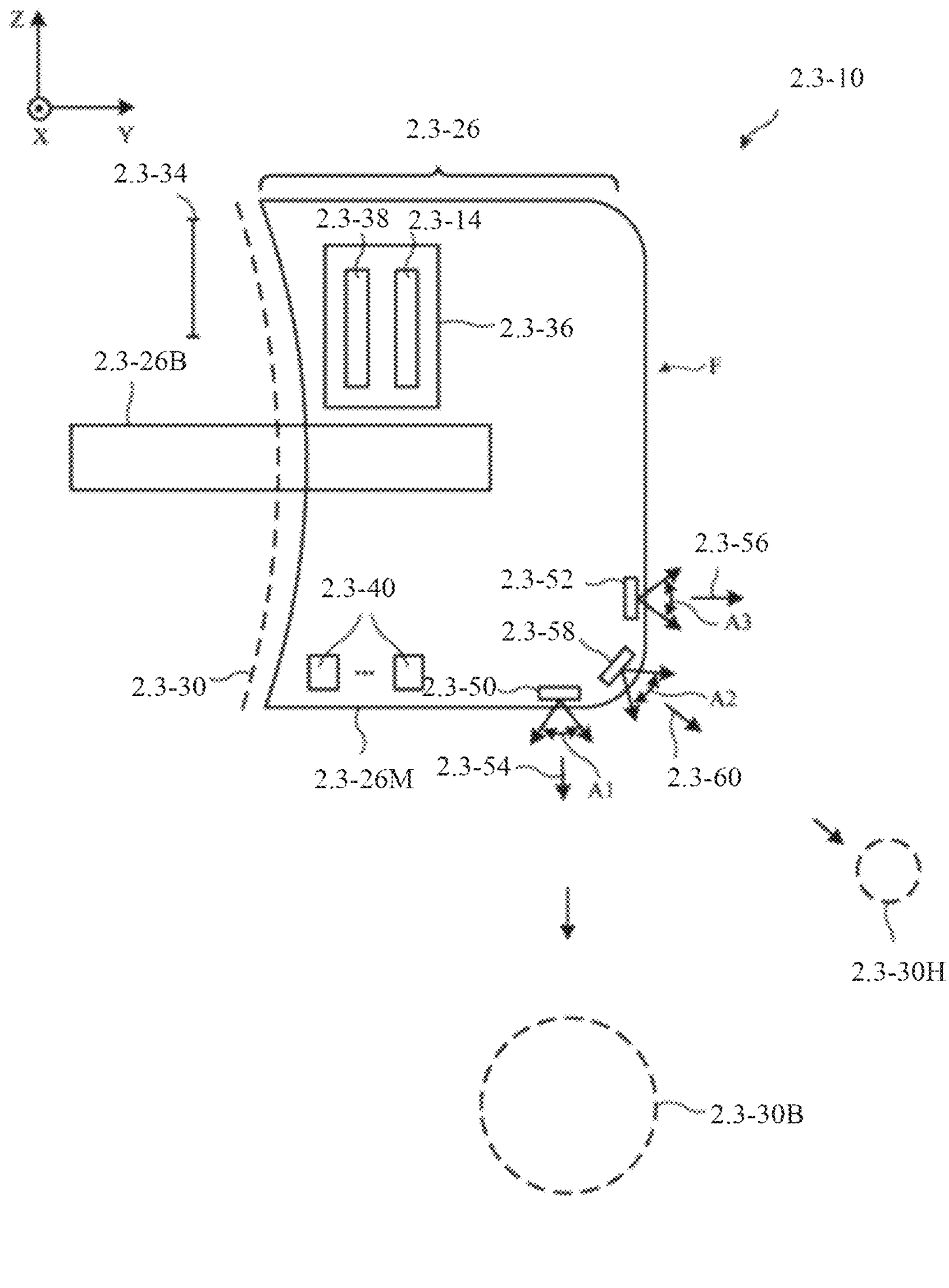
*FIG. 2.3-1*

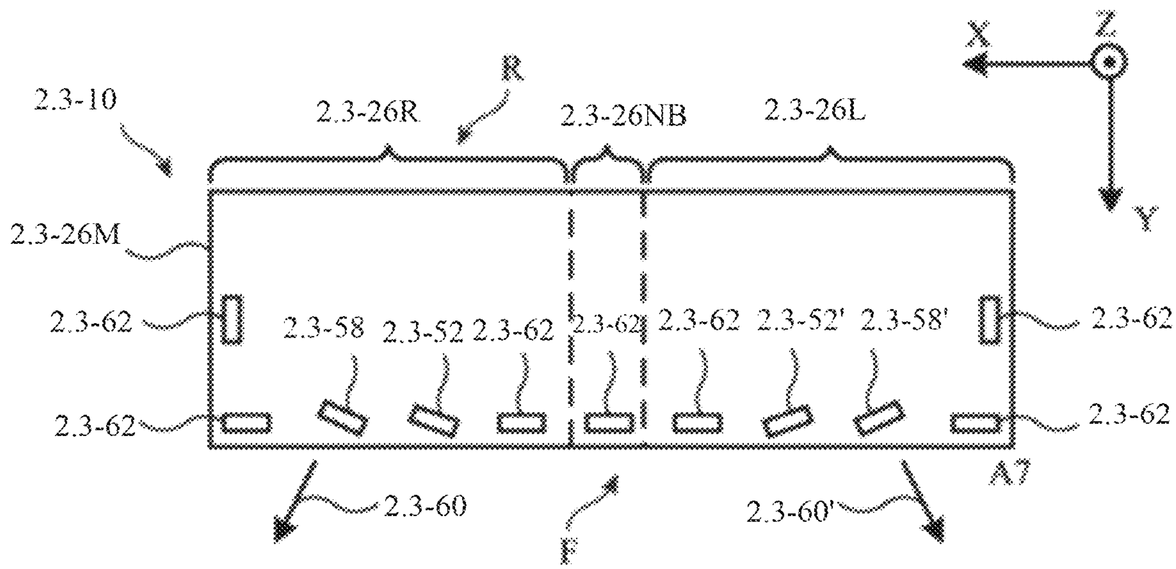
FIG. 2.3-2

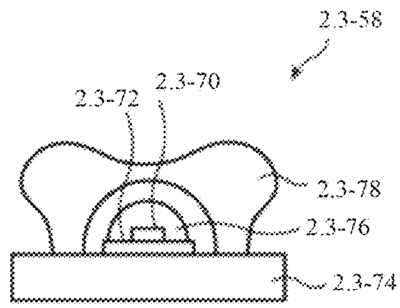
FIG. 2.3-3
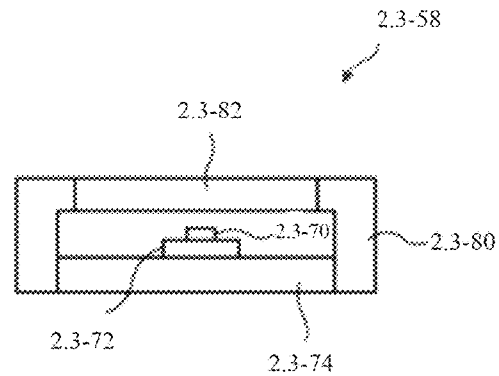
FIG. 2.3-4
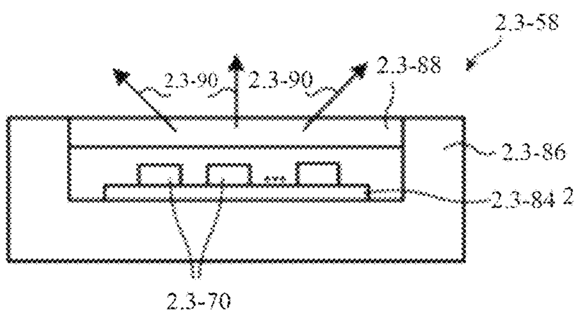
FIG. 2.3-5
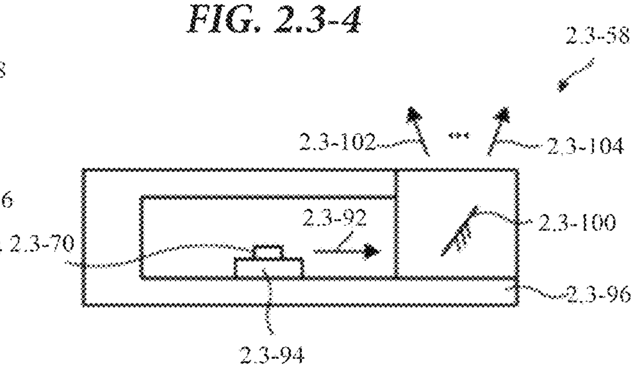
FIG. 2.3-6

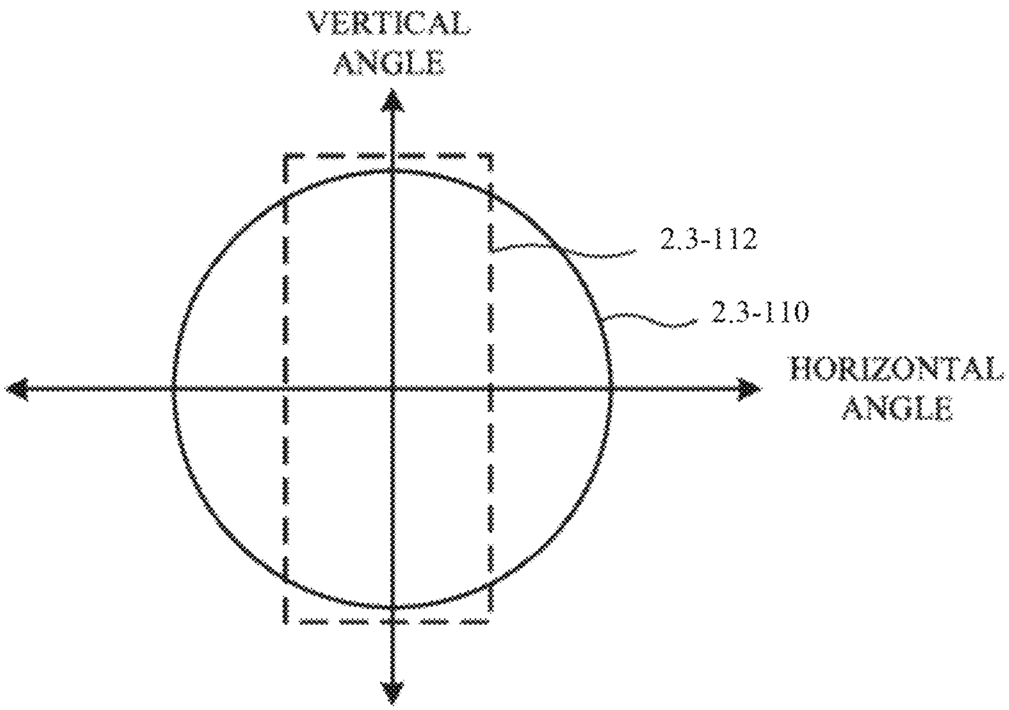
*FIG. 2.3-7*

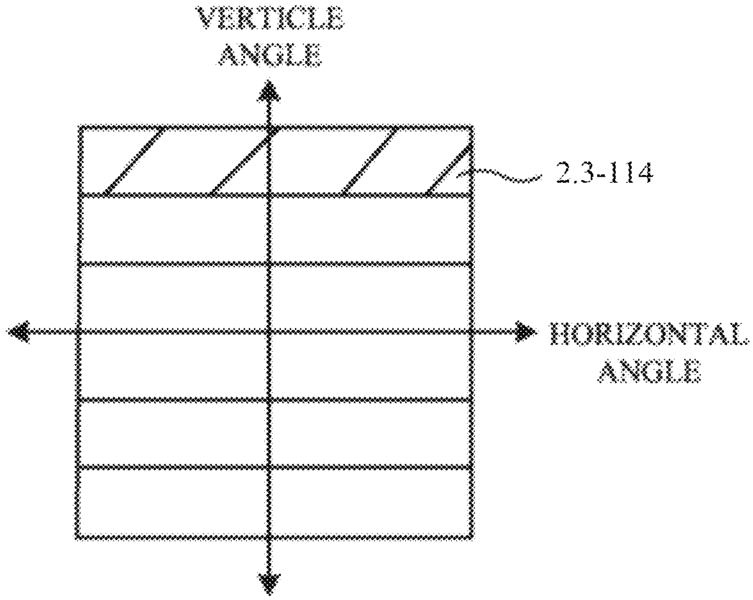
*FIG. 2.3-8*
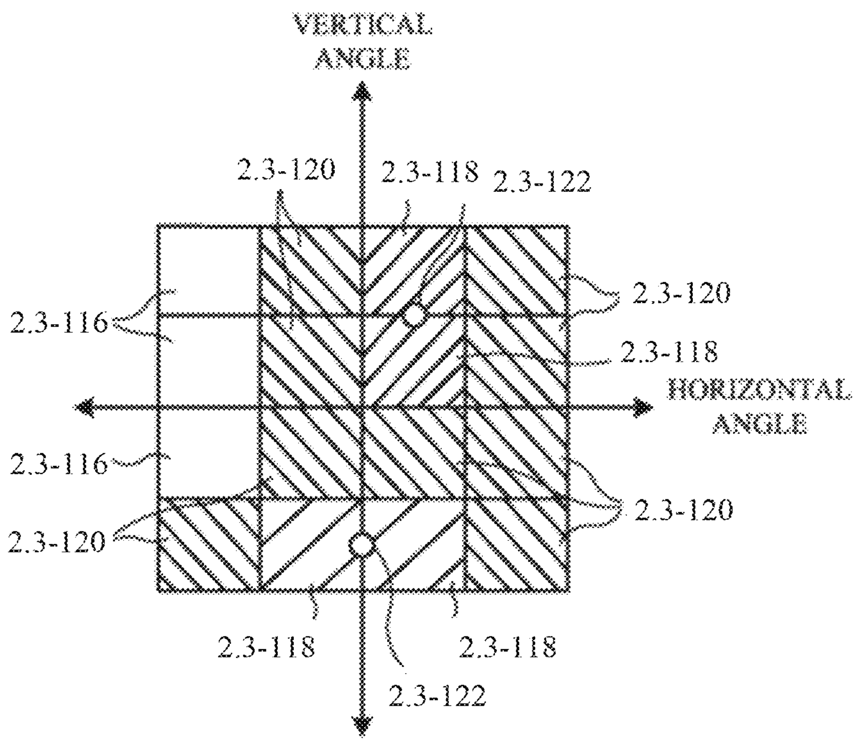
*FIG. 2.3-9*

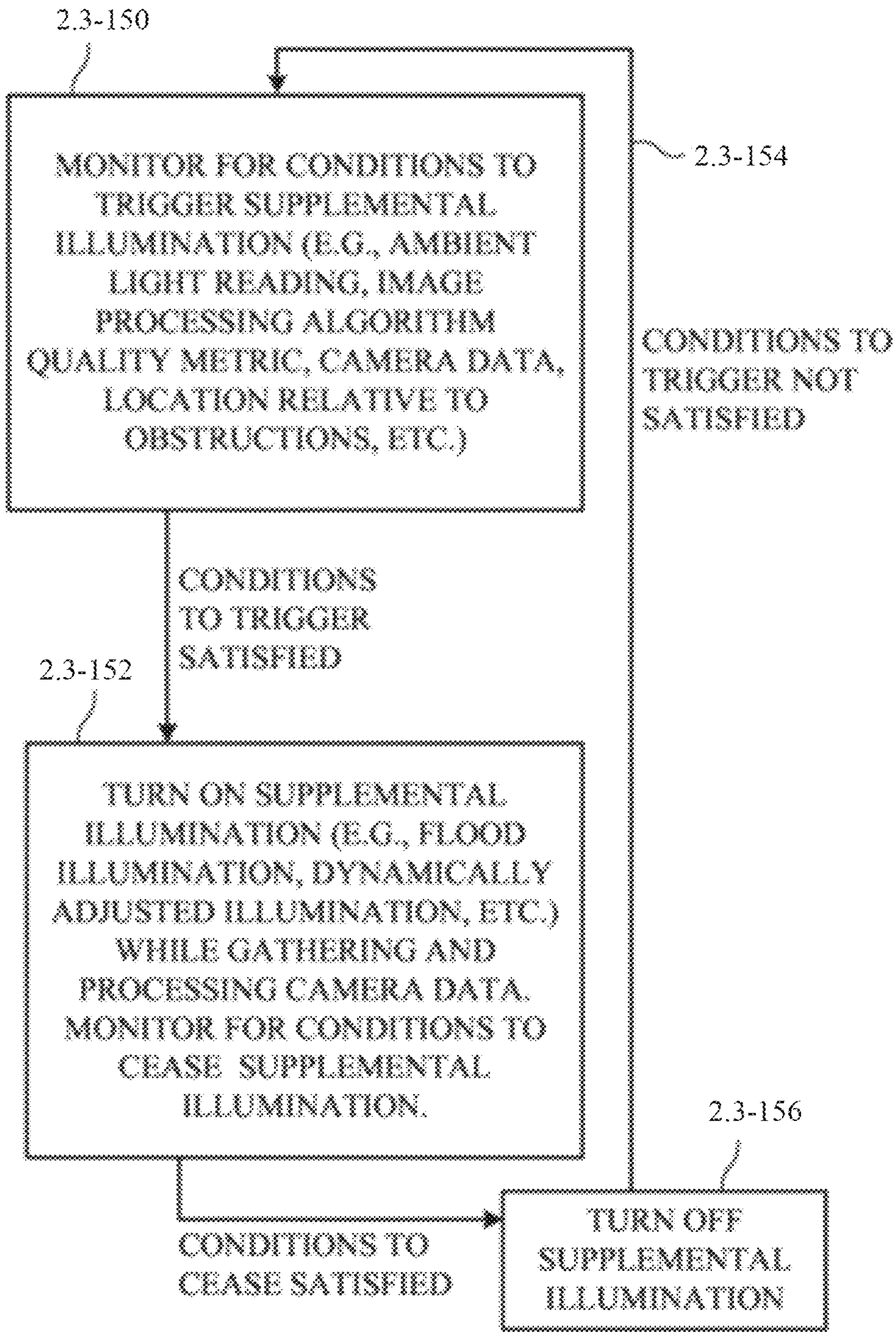
*FIG. 2.3-10*

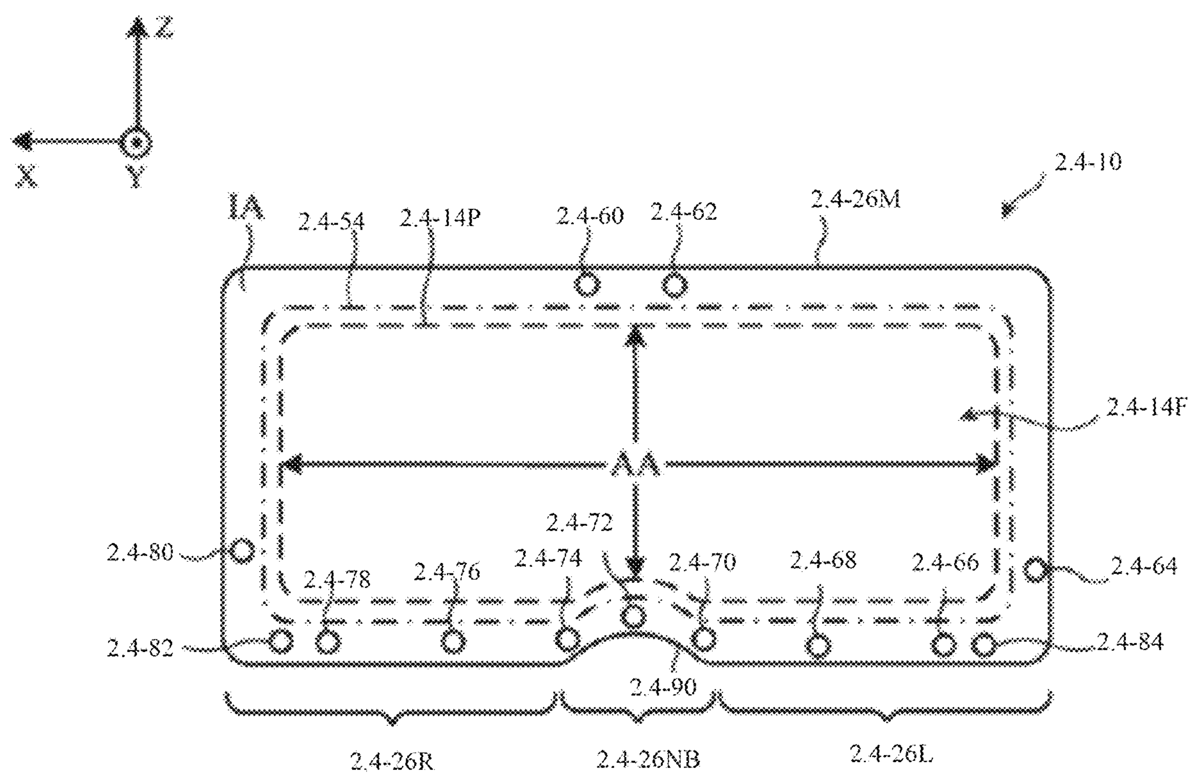
FIG. 2.4-1

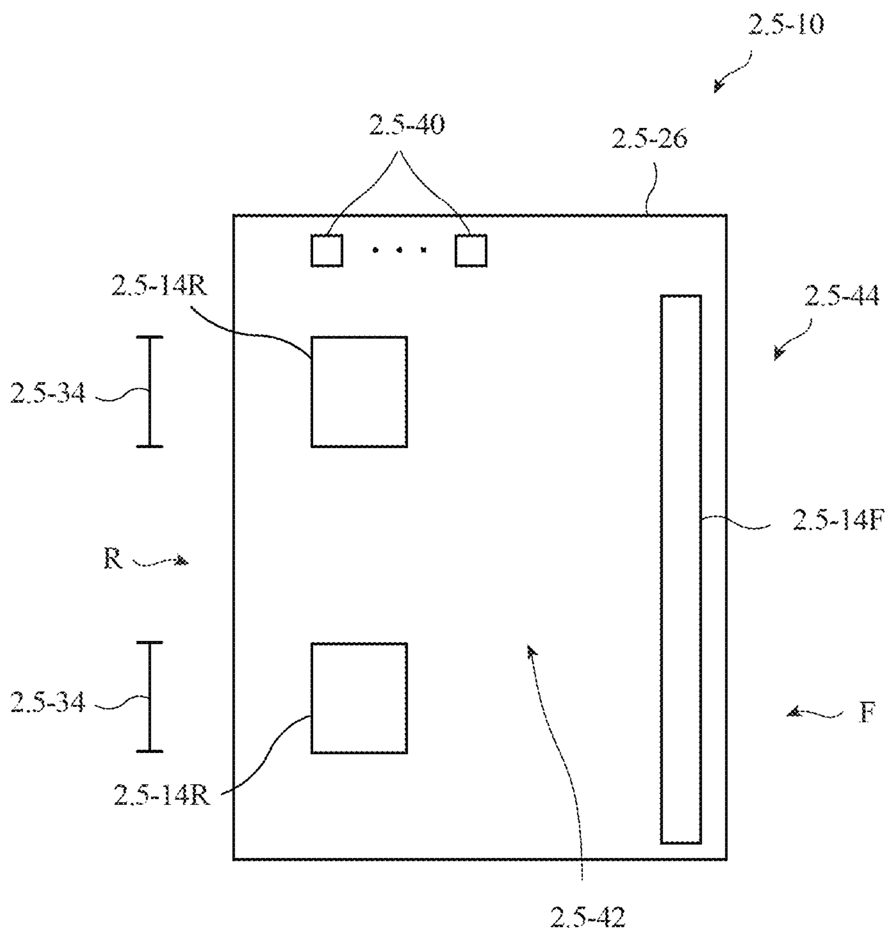
FIG. 2.5-1

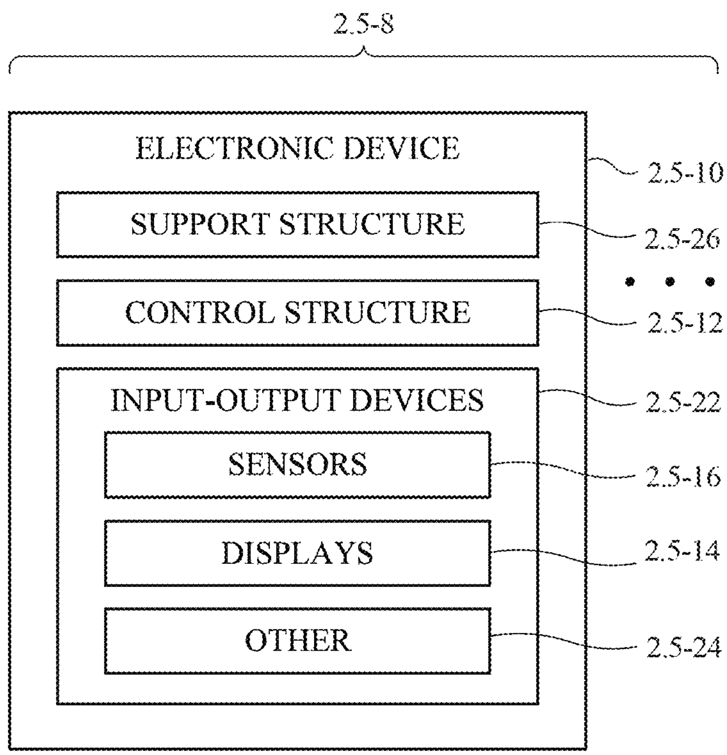
*FIG. 2.5-2*

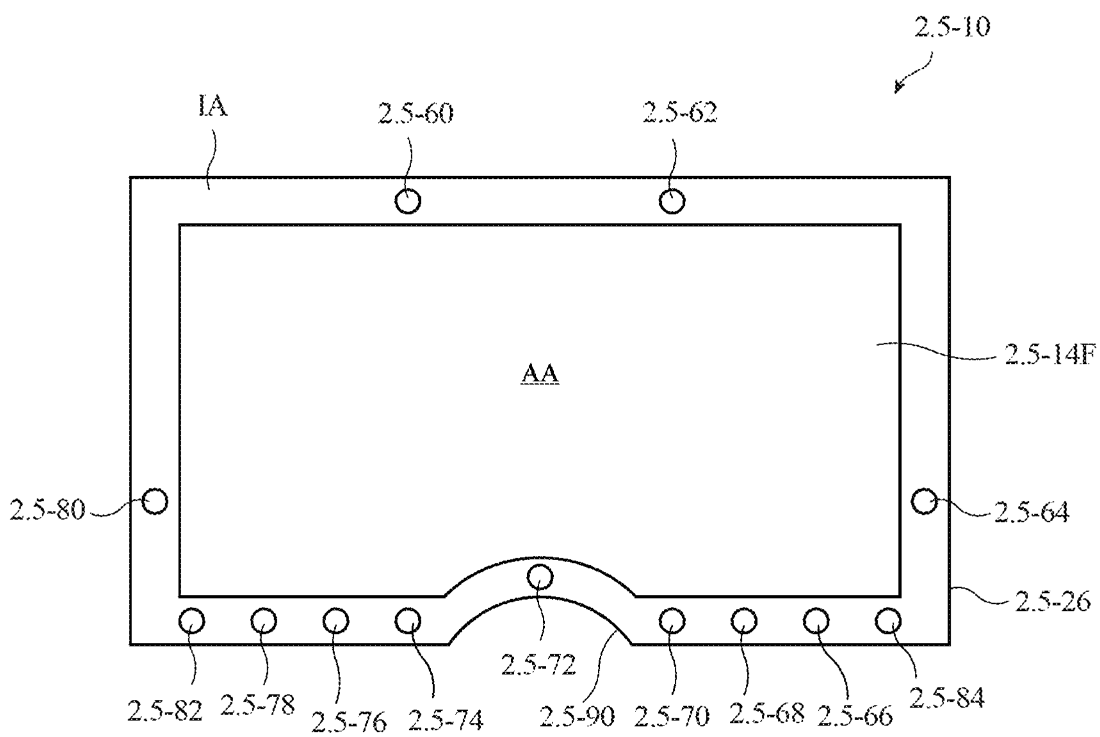
*FIG. 2.5-3*

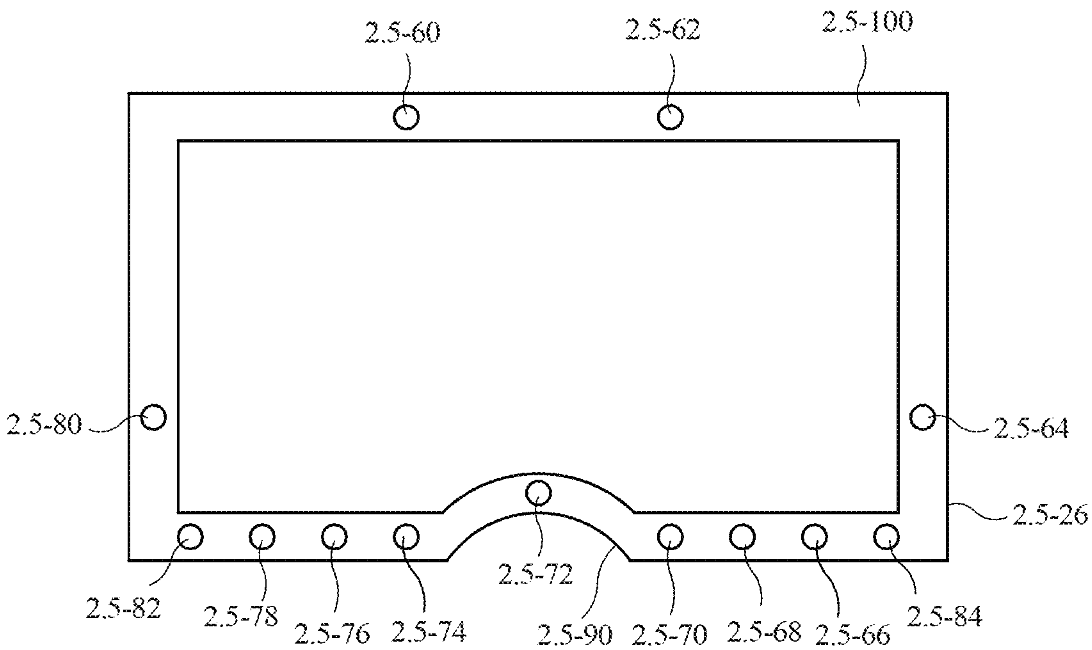
*FIG. 2.5-4*

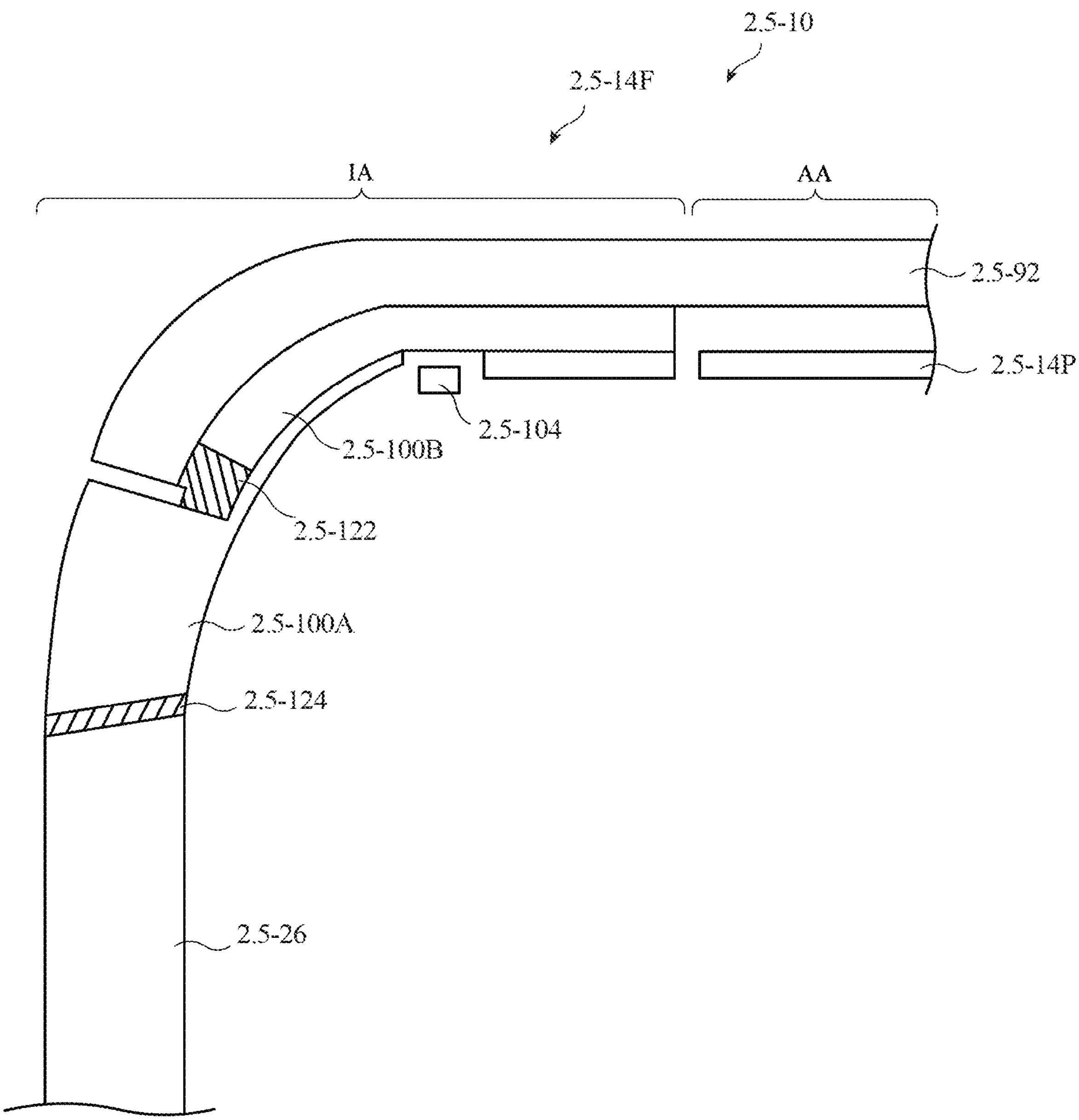
*FIG. 2.5-5*

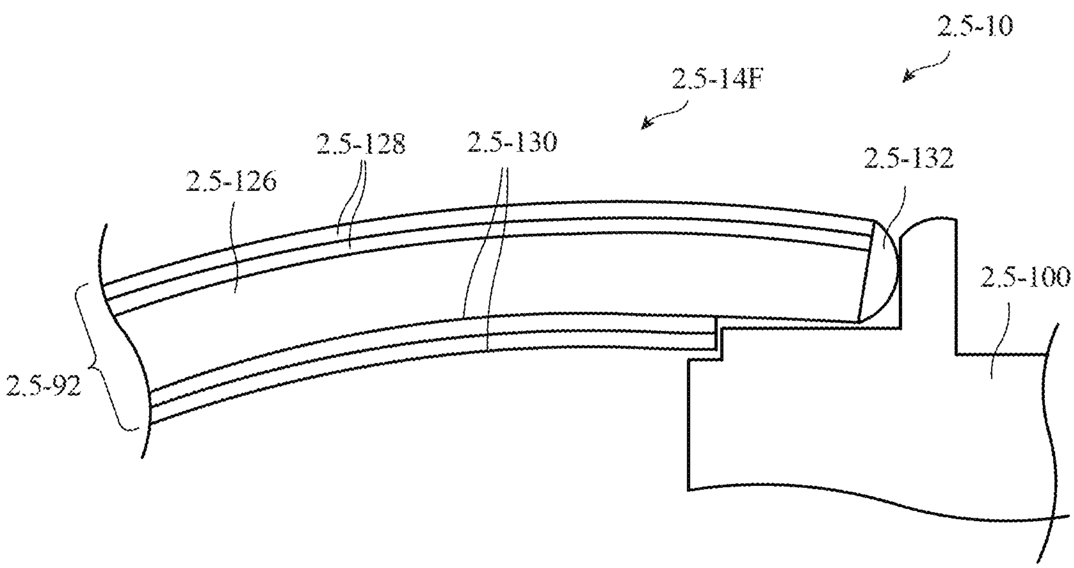
*FIG. 2.5-6*

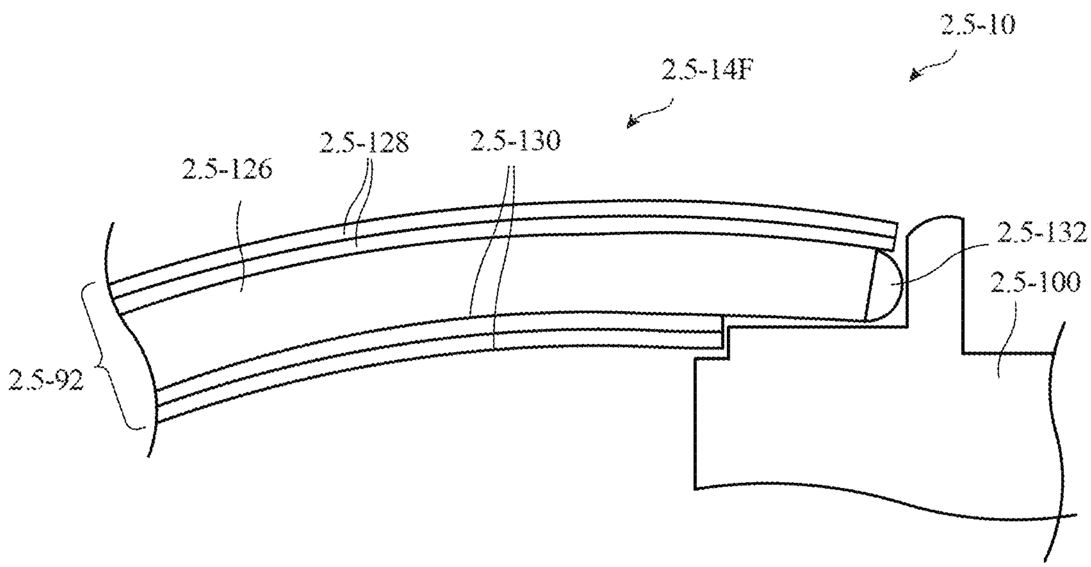
*FIG. 2.5-7*

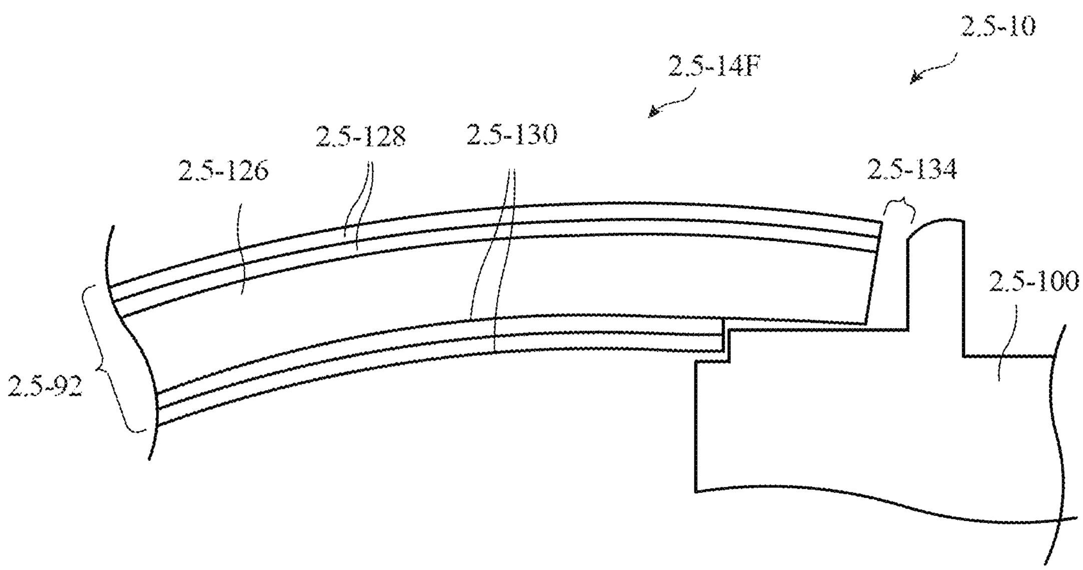
*FIG. 2.5-8*

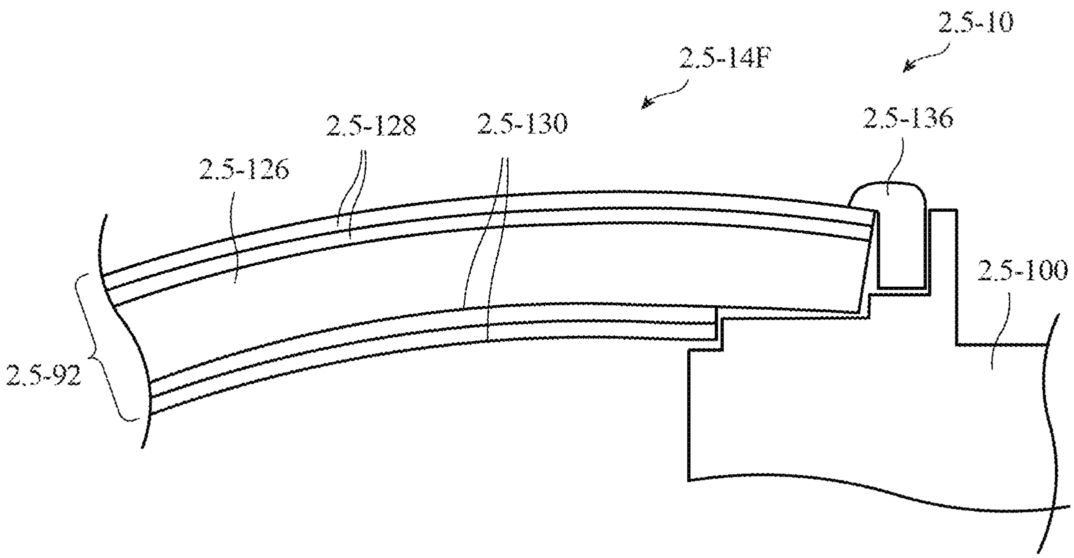
*FIG. 2.5-9*

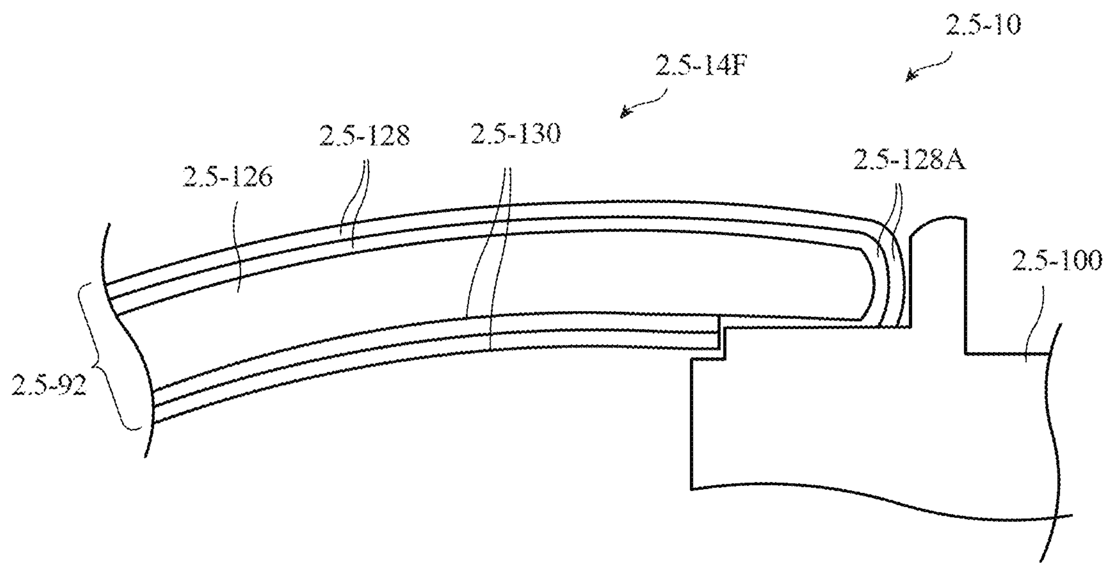
FIG. 2.5-10

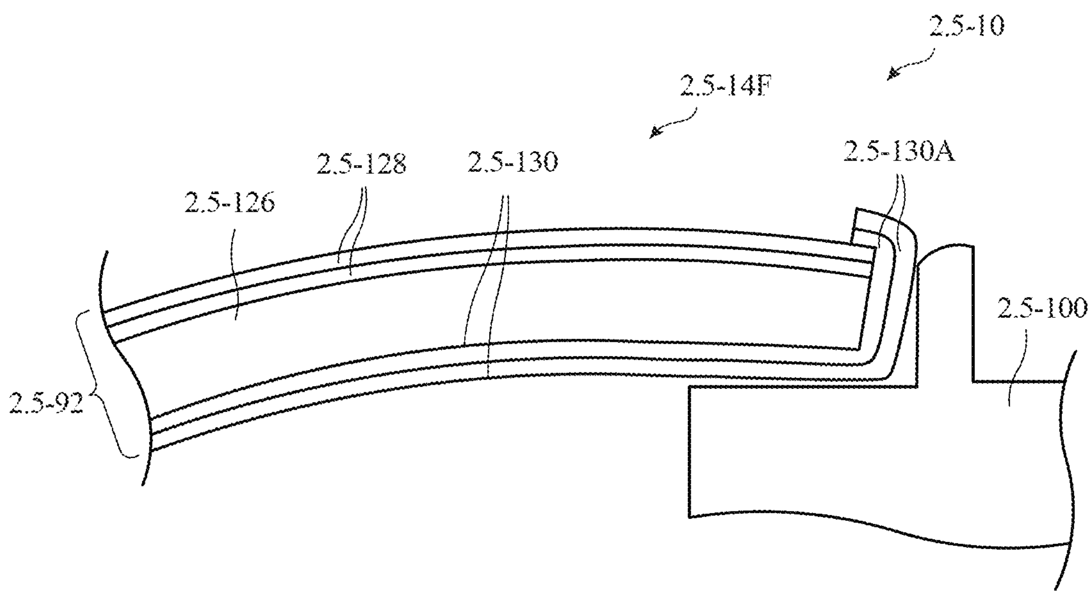
*FIG. 2.5-11*

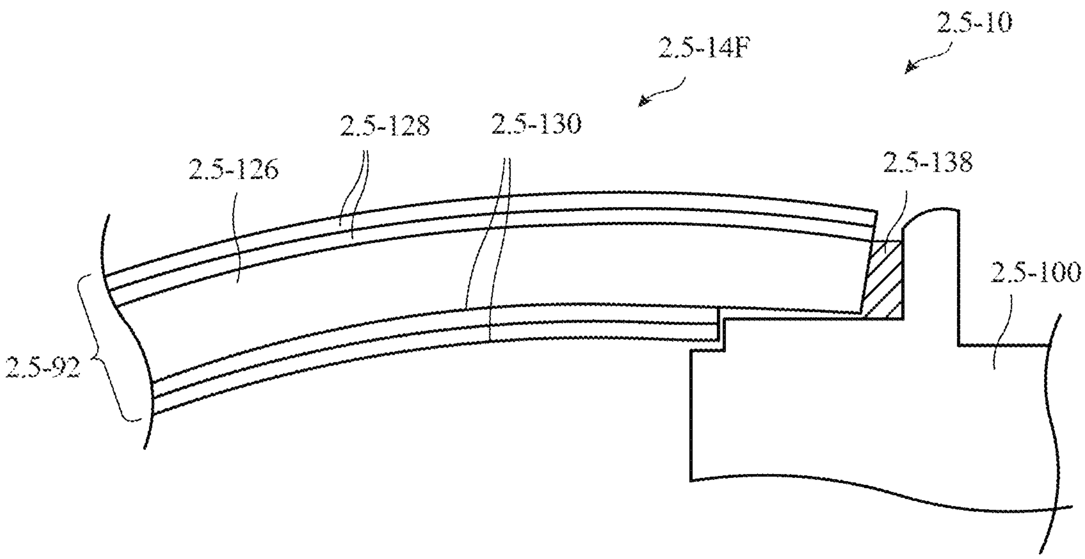
*FIG. 2.5-12*

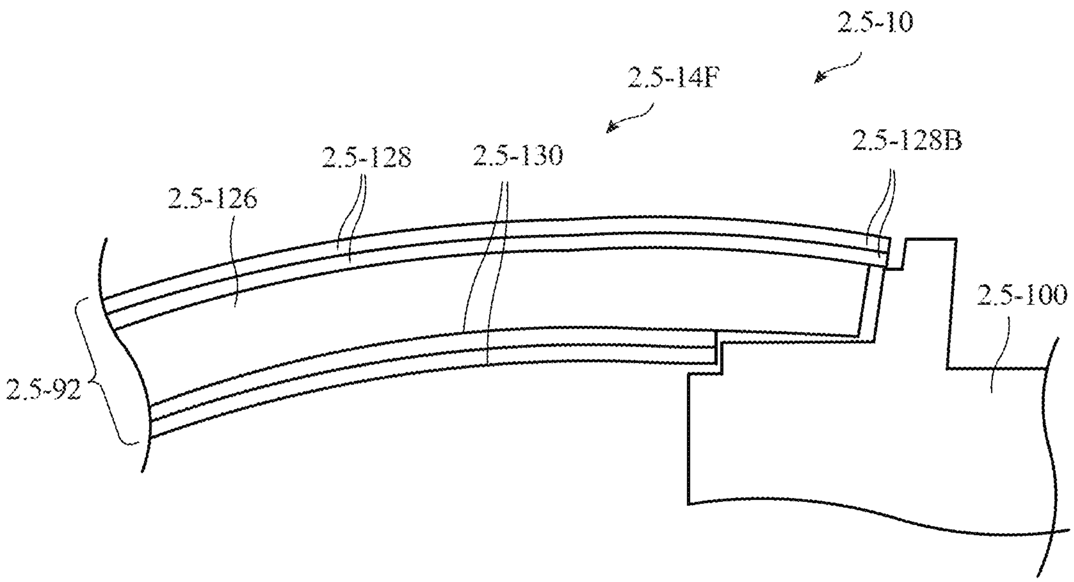
FIG. 2.5-13

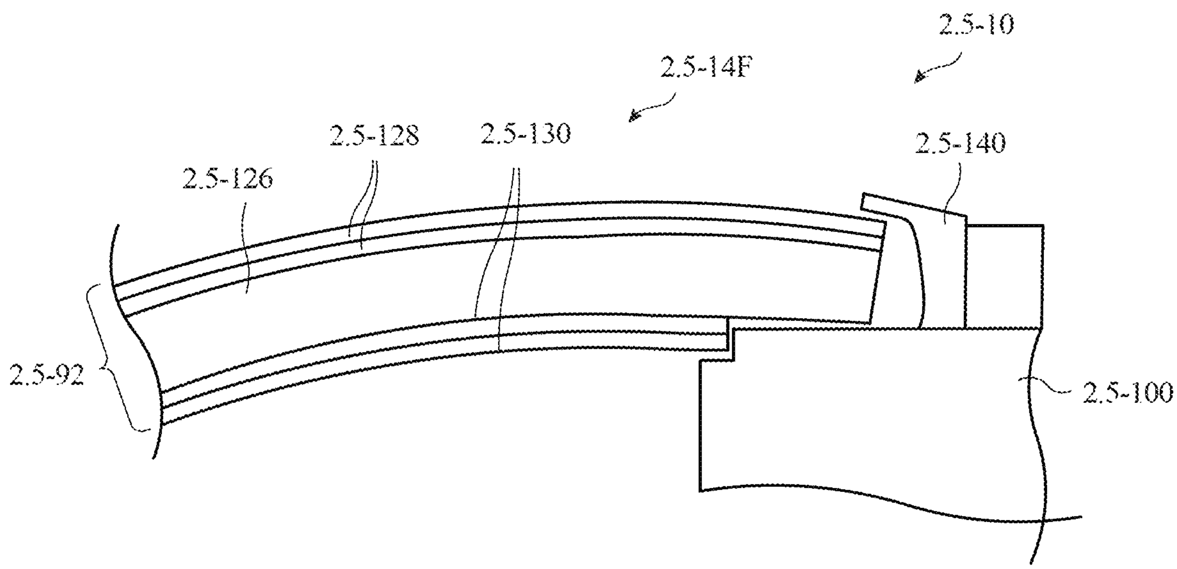
*FIG. 2.5-14*

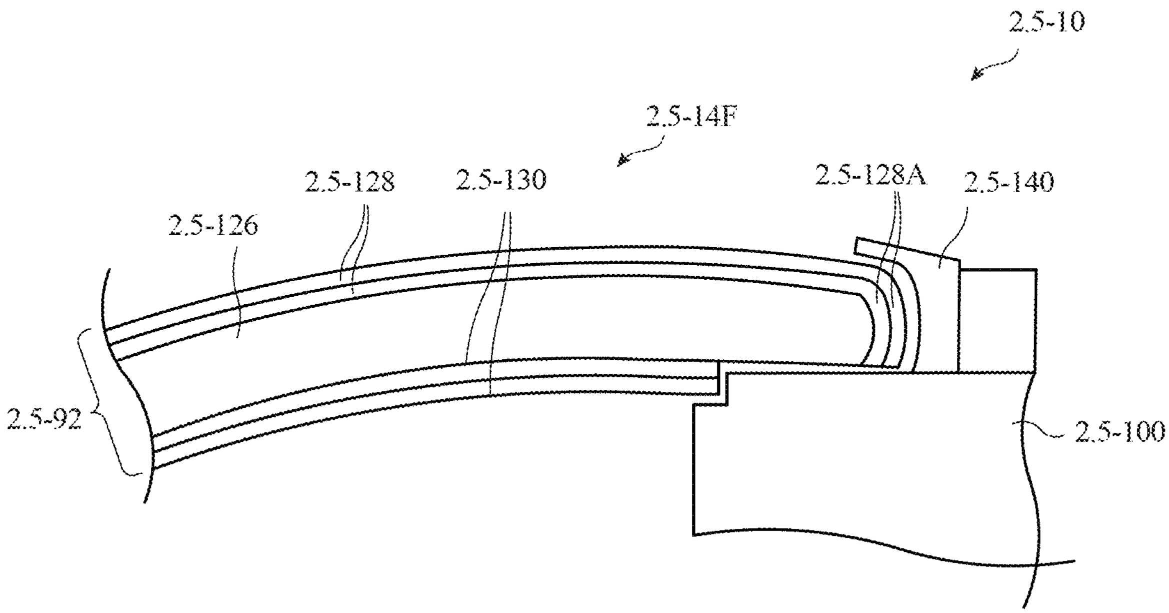
*FIG. 2.5-15*

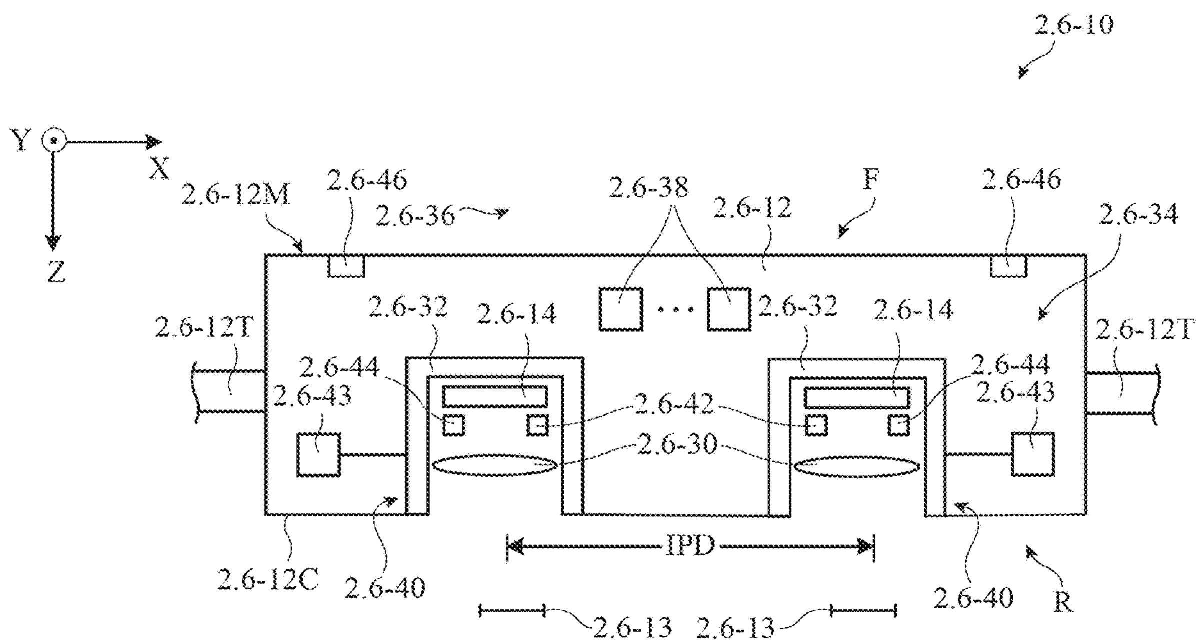
FIG. 2.6-1
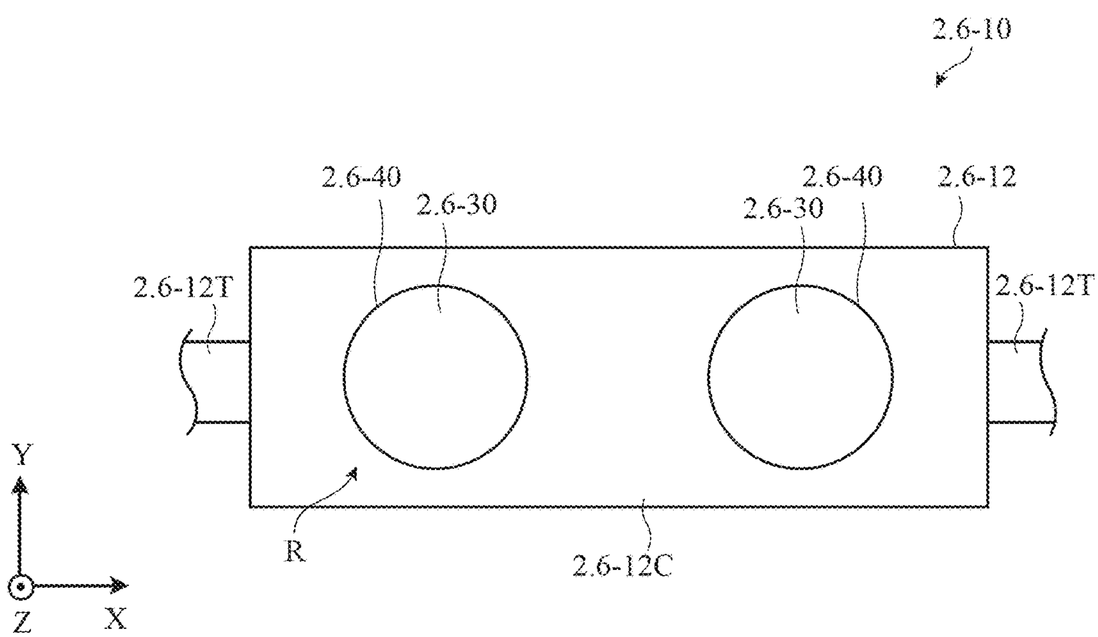
FIG. 2.6-2

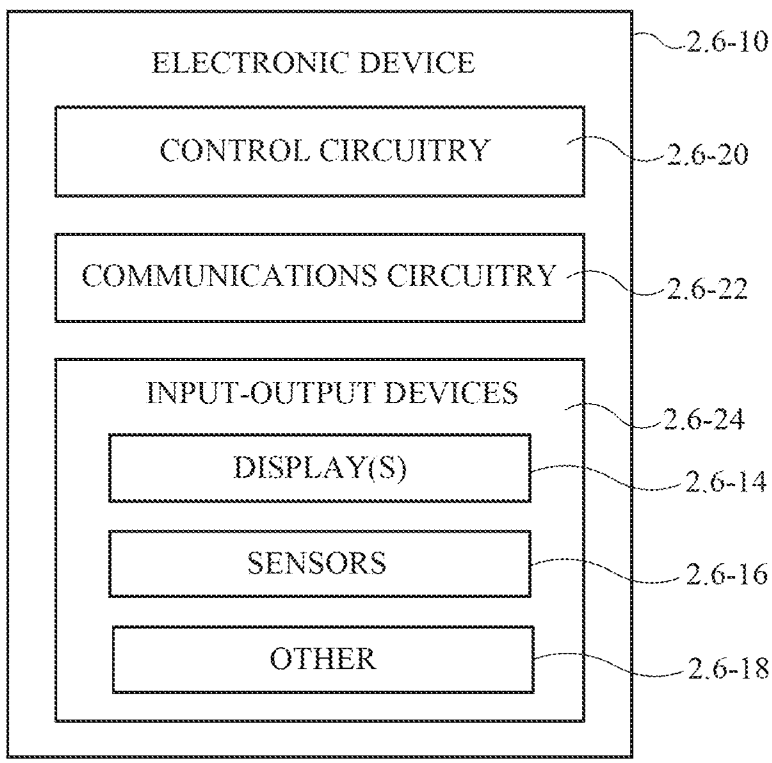
*FIG. 2.6-3*

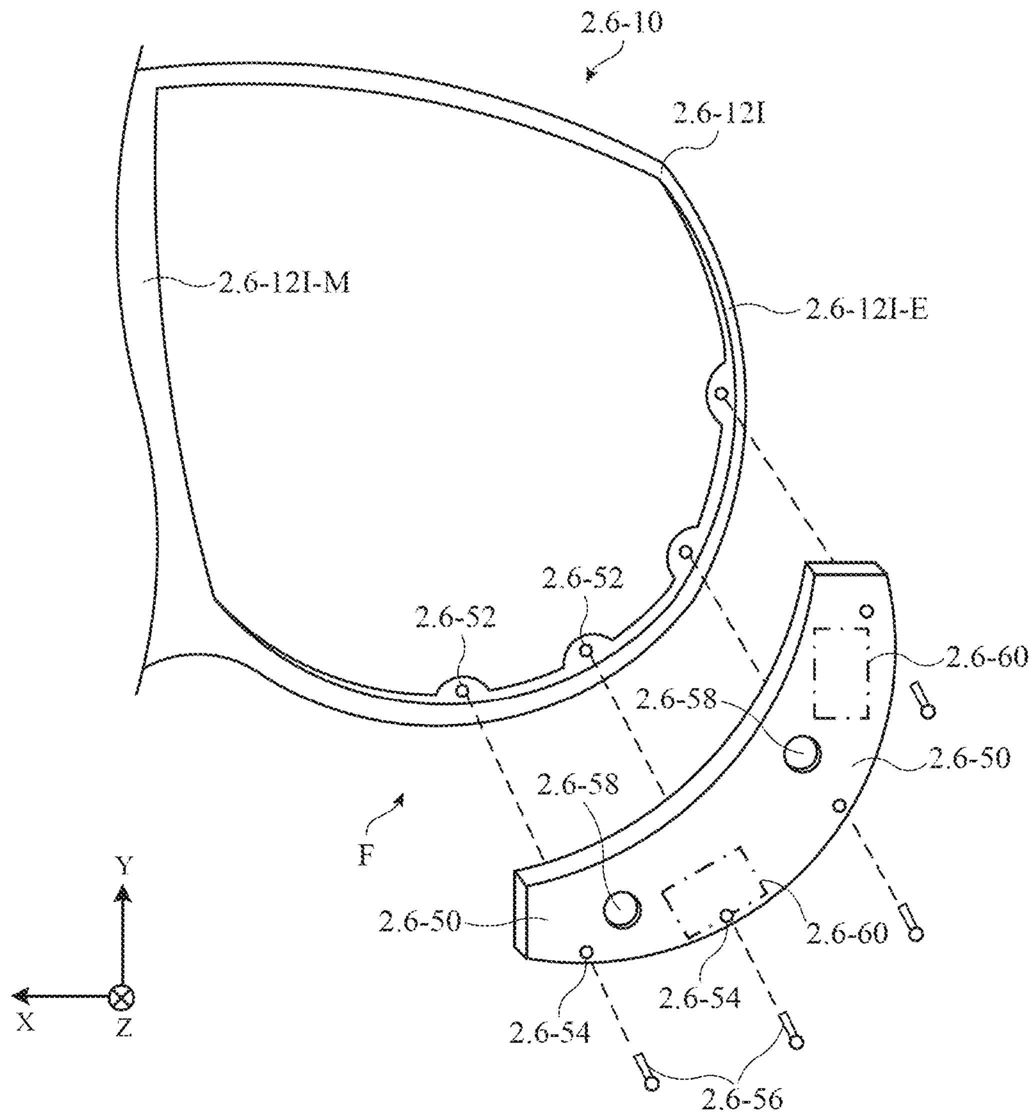
*FIG. 2.6-4*

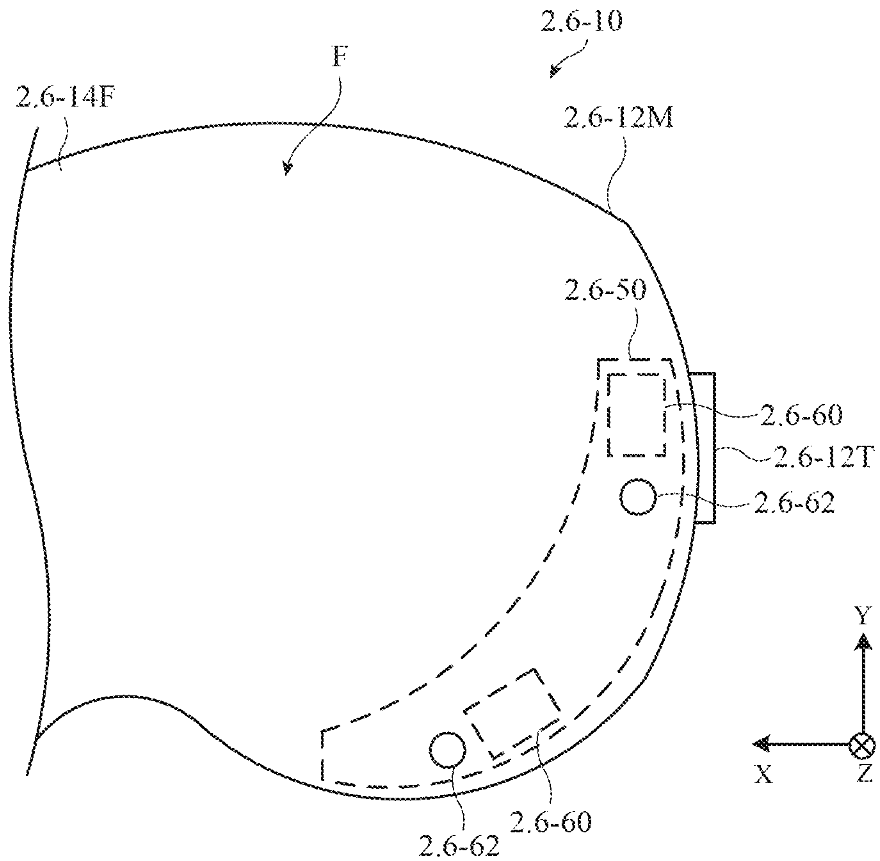
*FIG. 2.6-5*

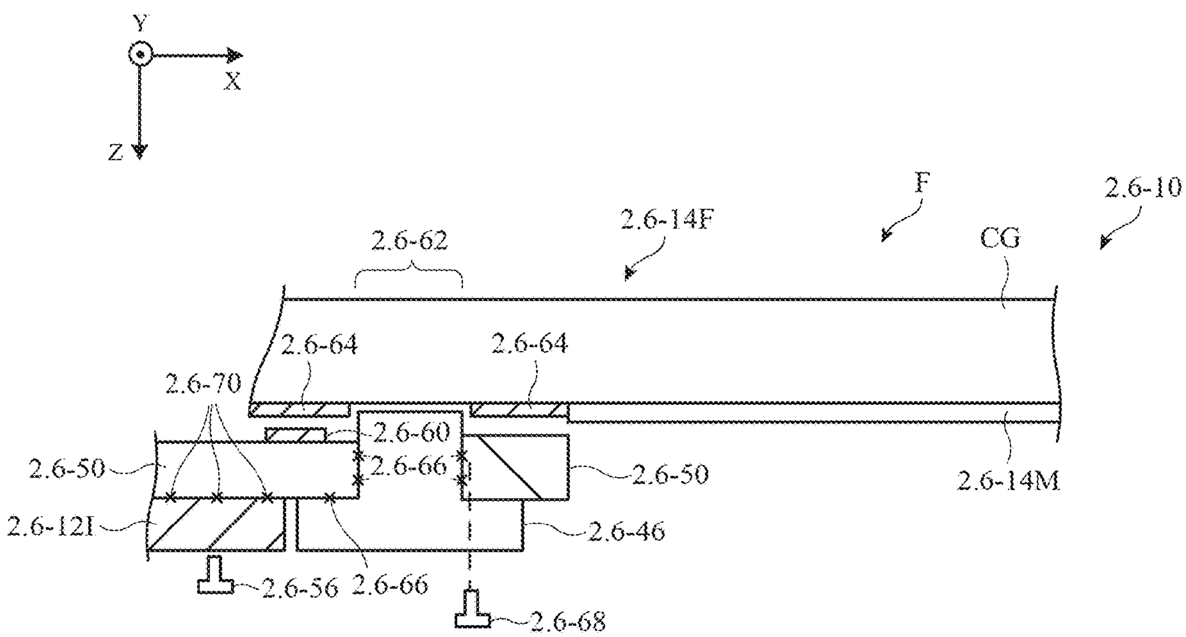
*FIG. 2.6-6*

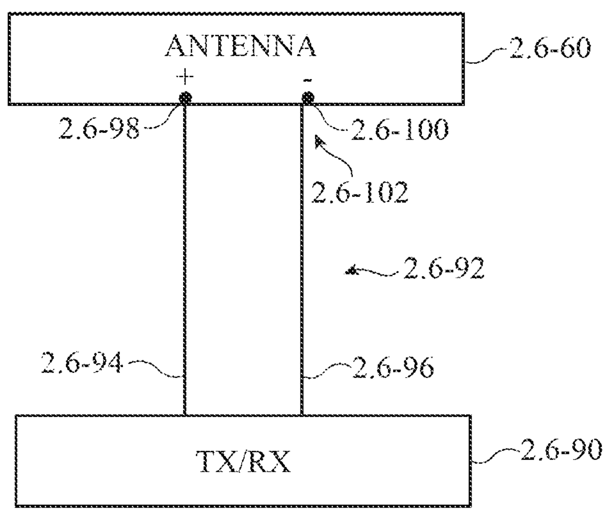
*FIG. 2.6-7*

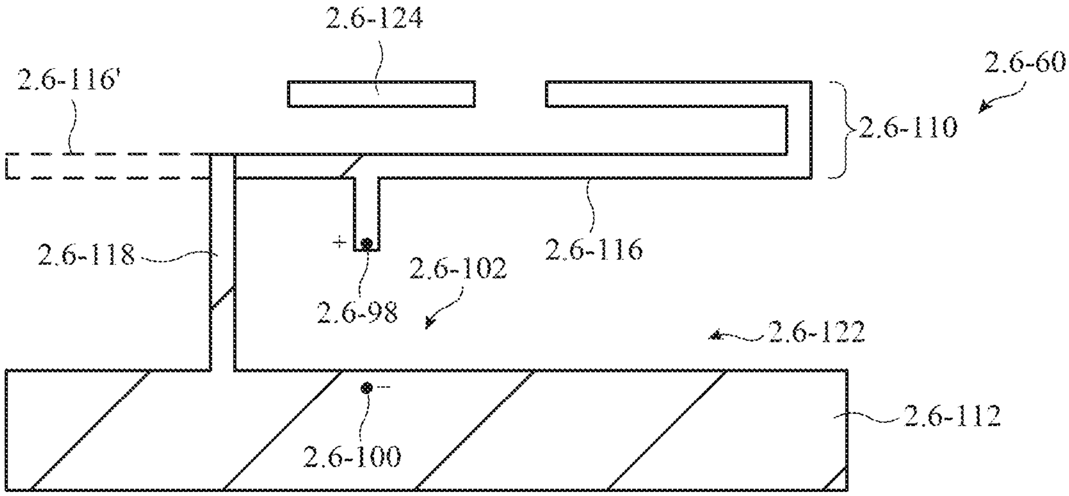
*FIG. 2.6-8*

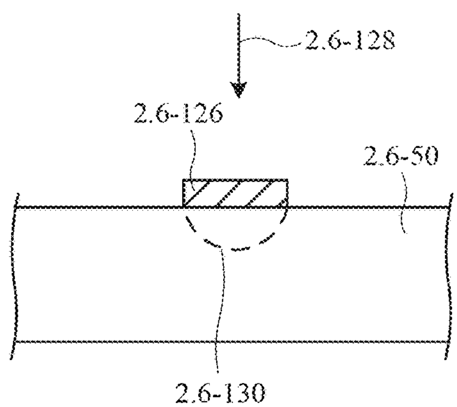
FIG. 2.6-9
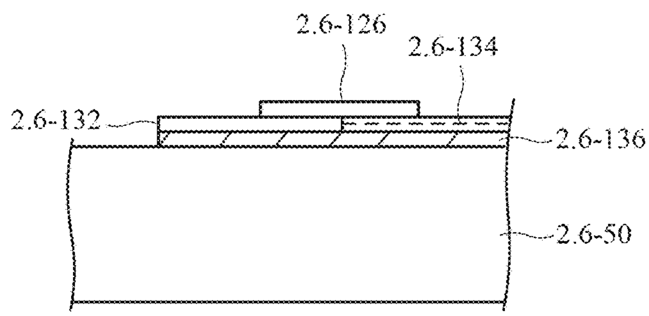
FIG. 2.6-10
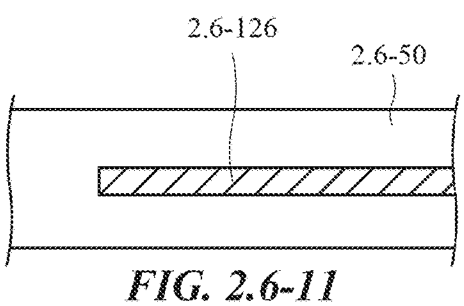
FIG. 2.6-11
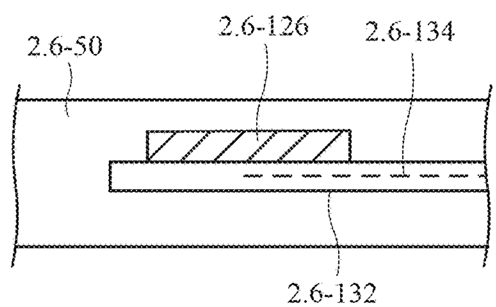
FIG. 2.6-12

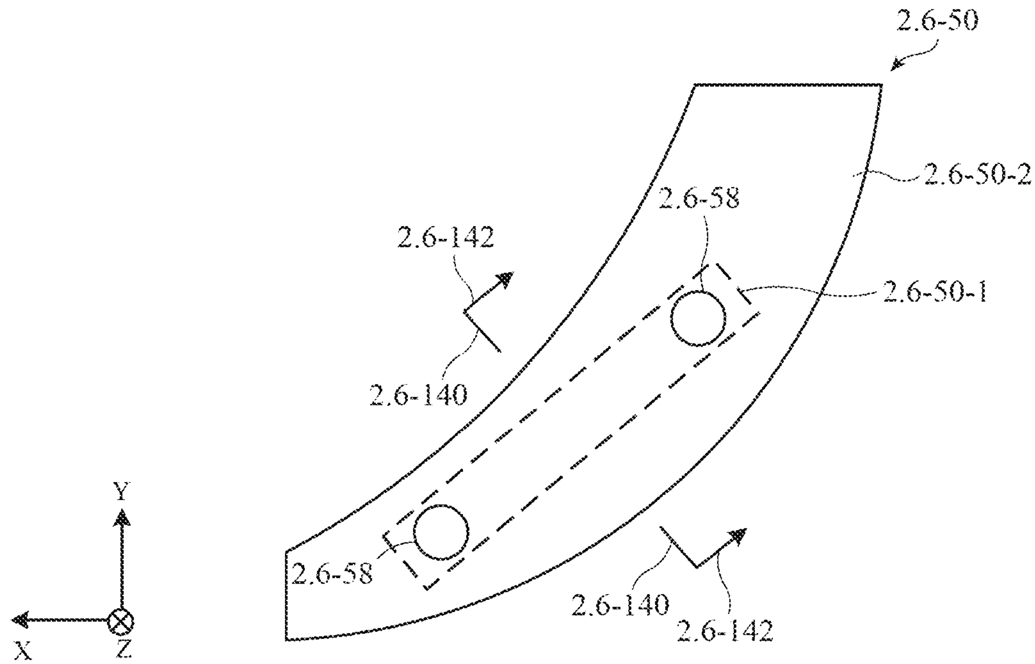
FIG. 2.6-13
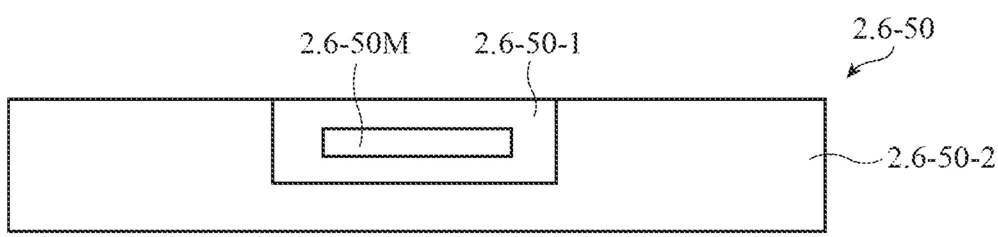
FIG. 2.6-14

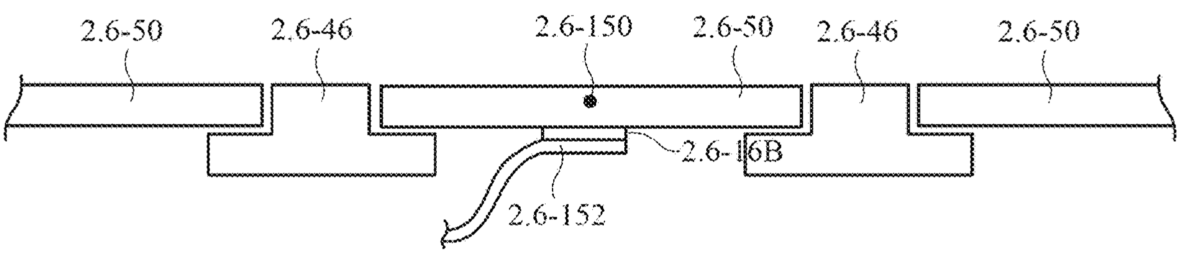
*FIG. 2.6-15*

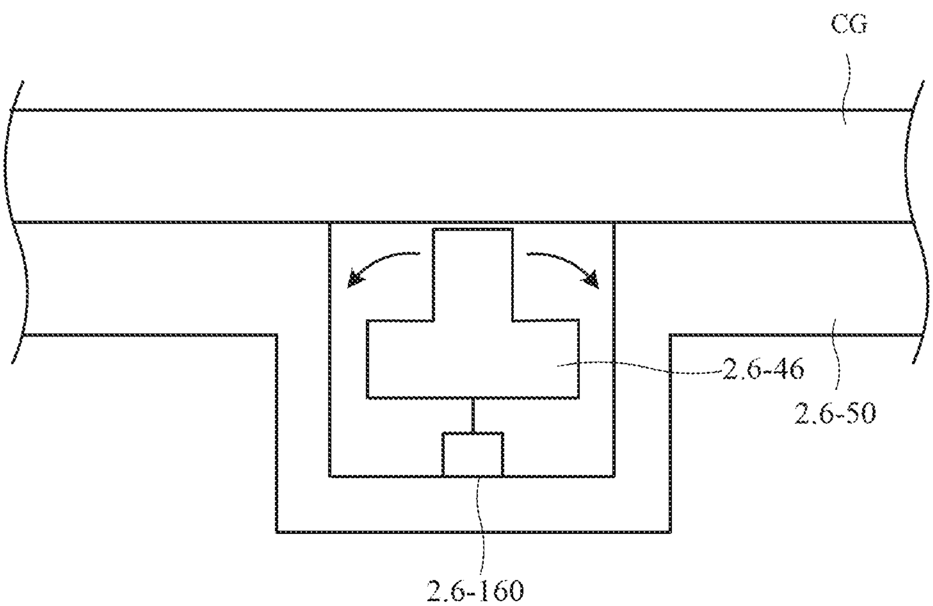
*FIG. 2.6-16*

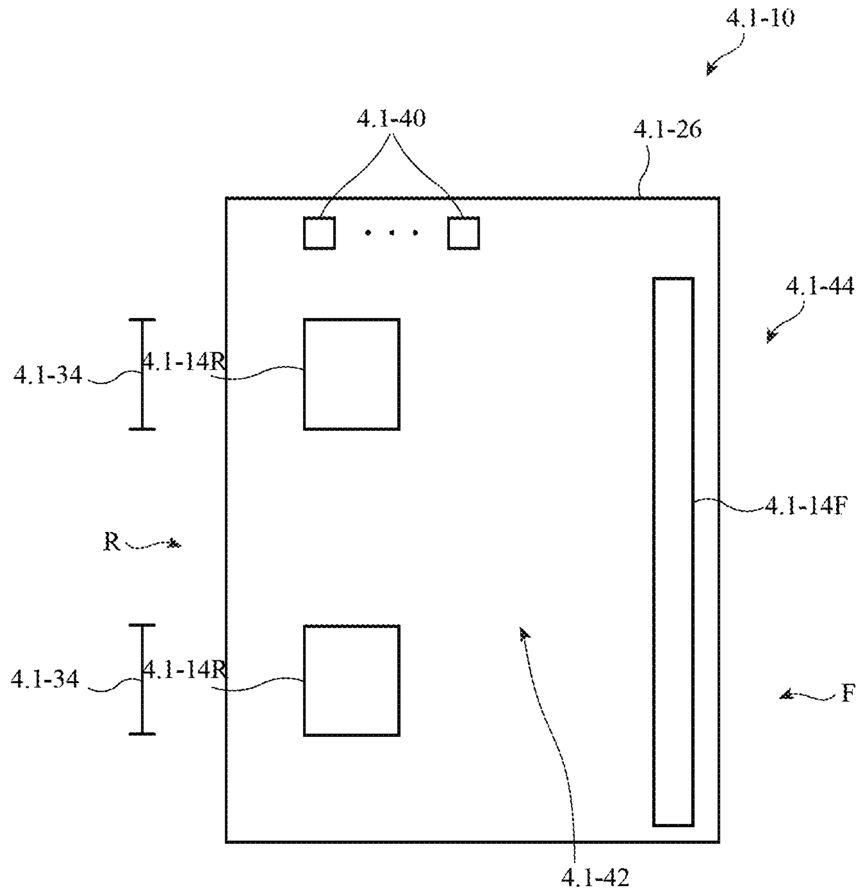
FIG. 4.1-1

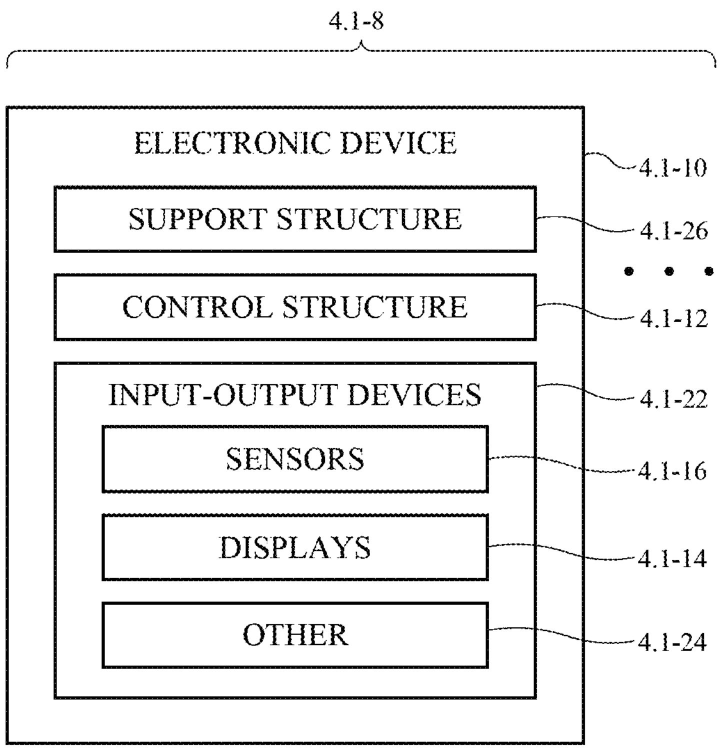
*FIG. 4.1-2*

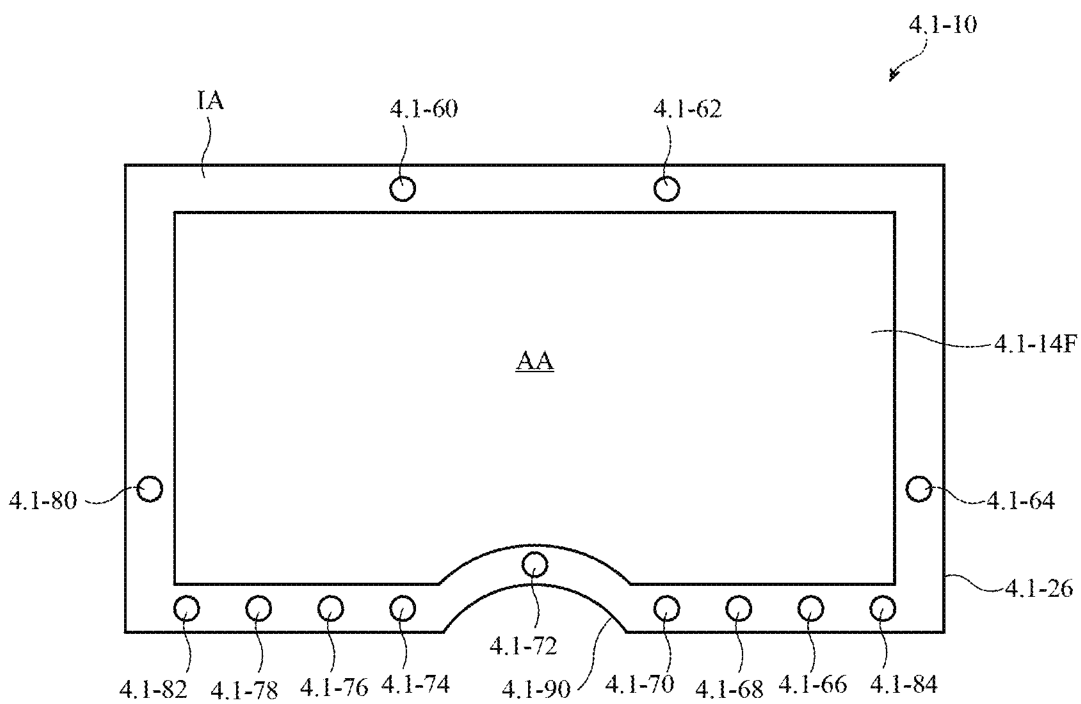
*FIG. 4.1-3*

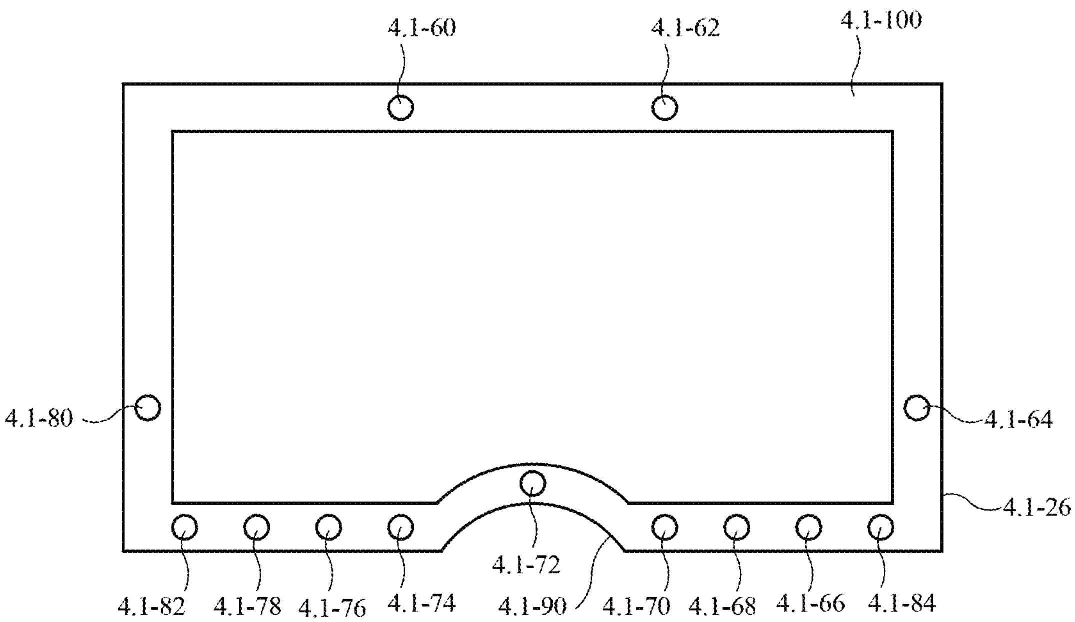
*FIG. 4.1-4*

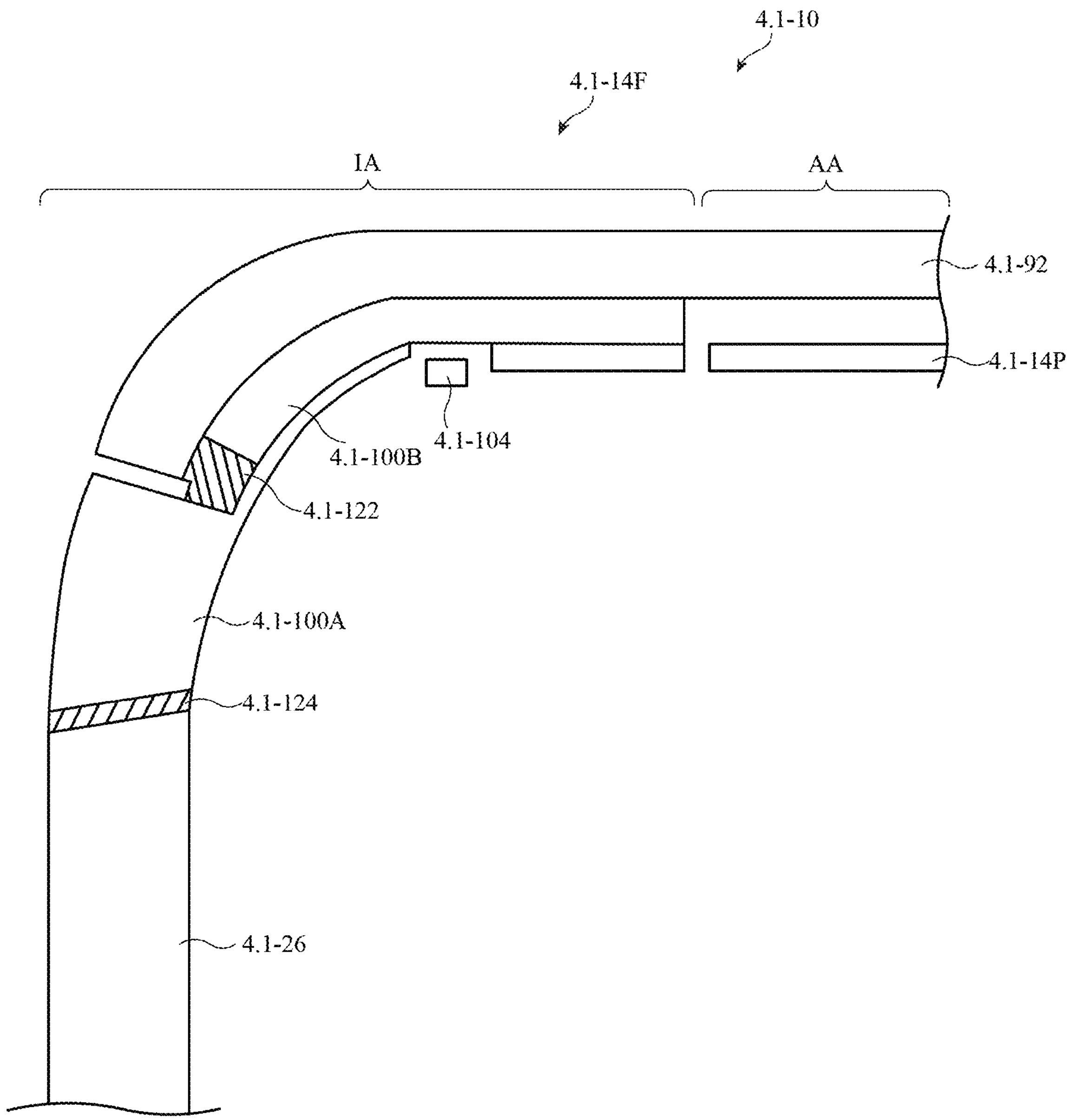
*FIG. 4.1-5*

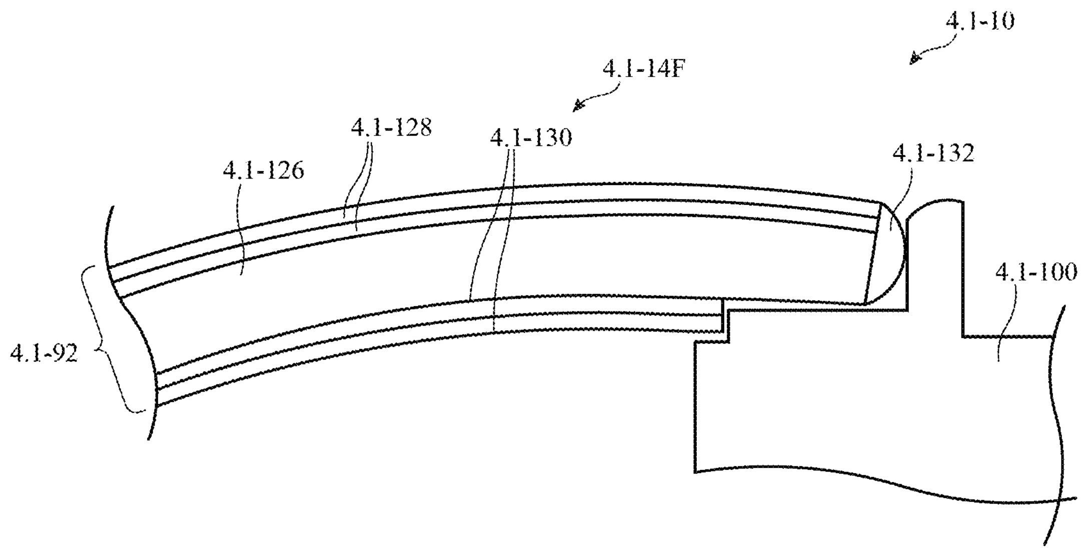
*FIG. 4.1-6*

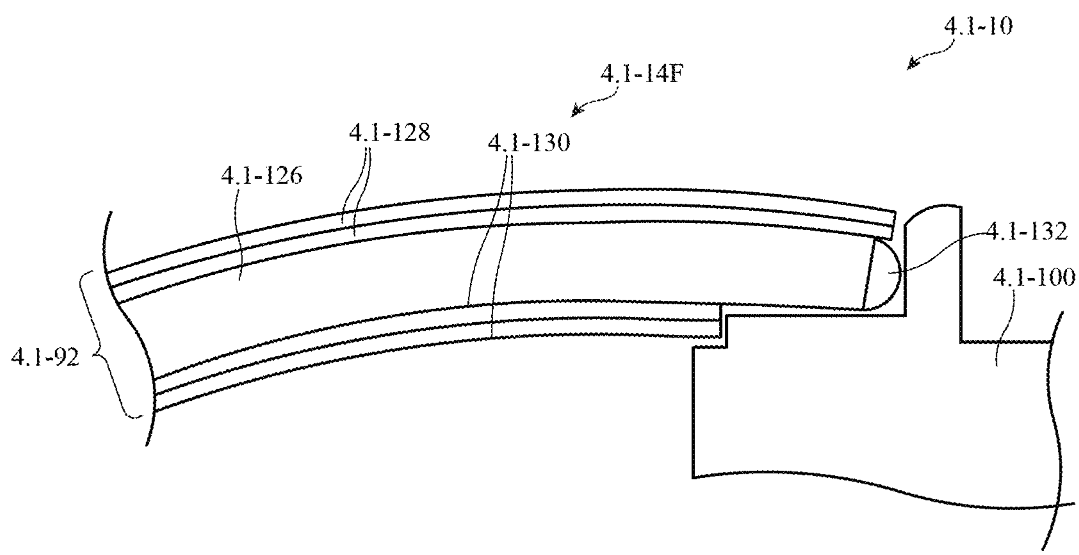
*FIG. 4.1-7*

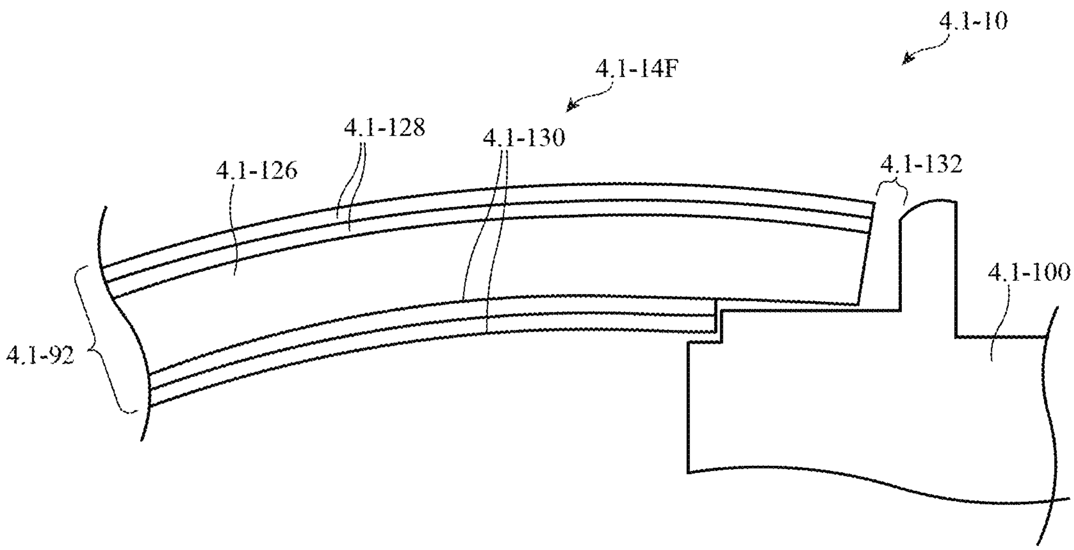
*FIG. 4.1-8*

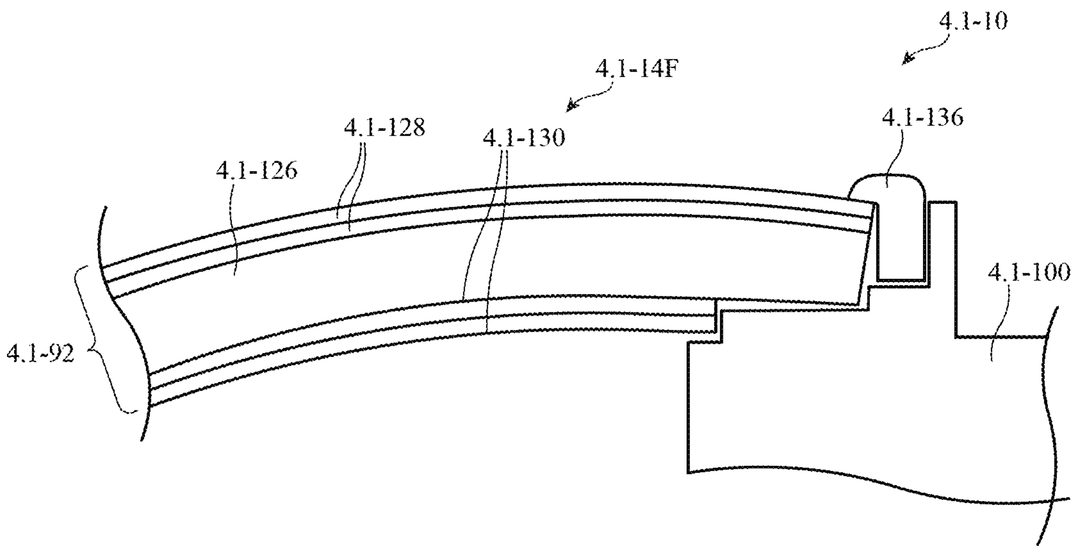
*FIG. 4.1-9*

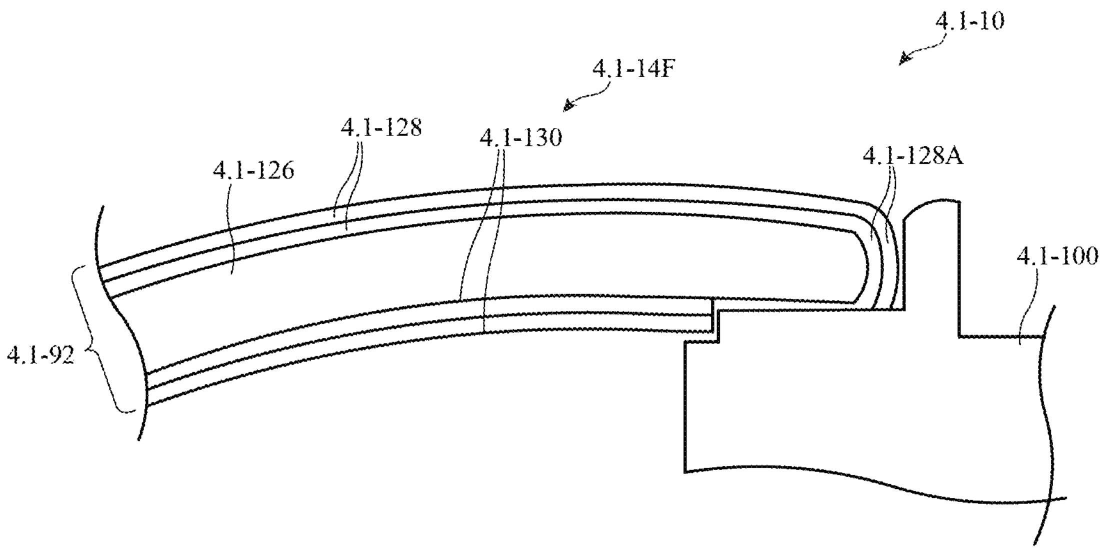
*FIG. 4.1-10*

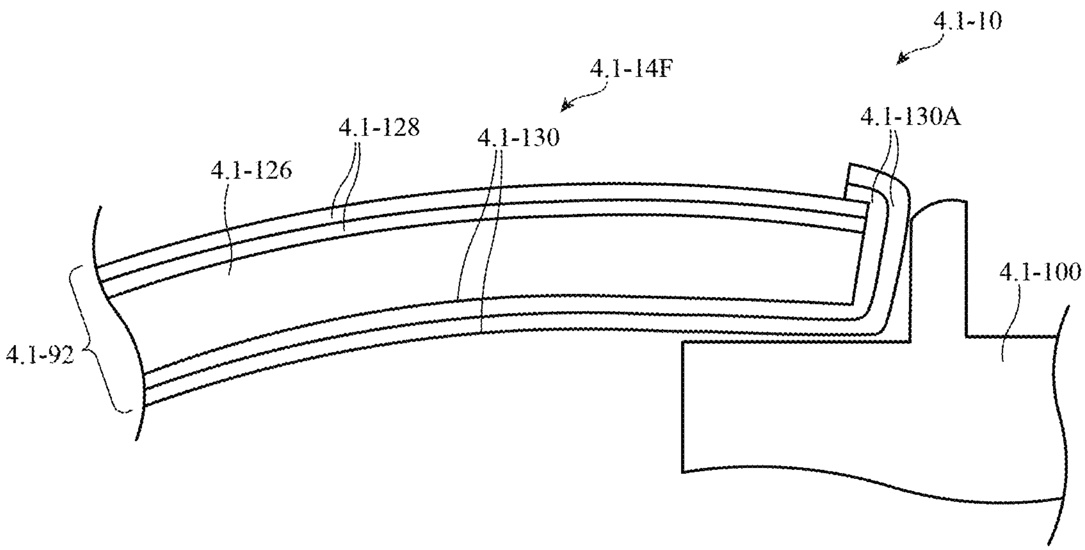
*FIG. 4.1-11*

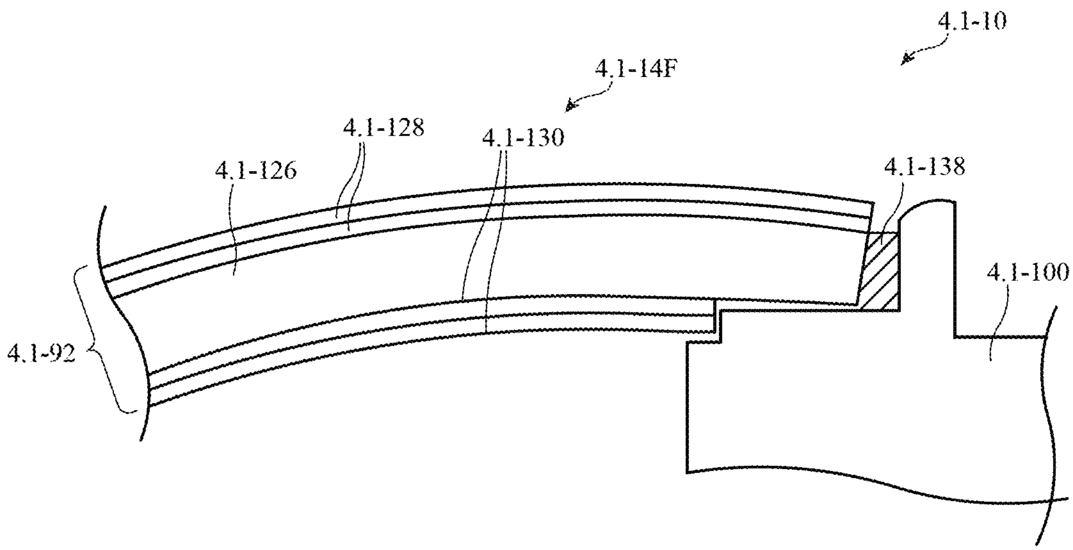
*FIG. 4.1-12*

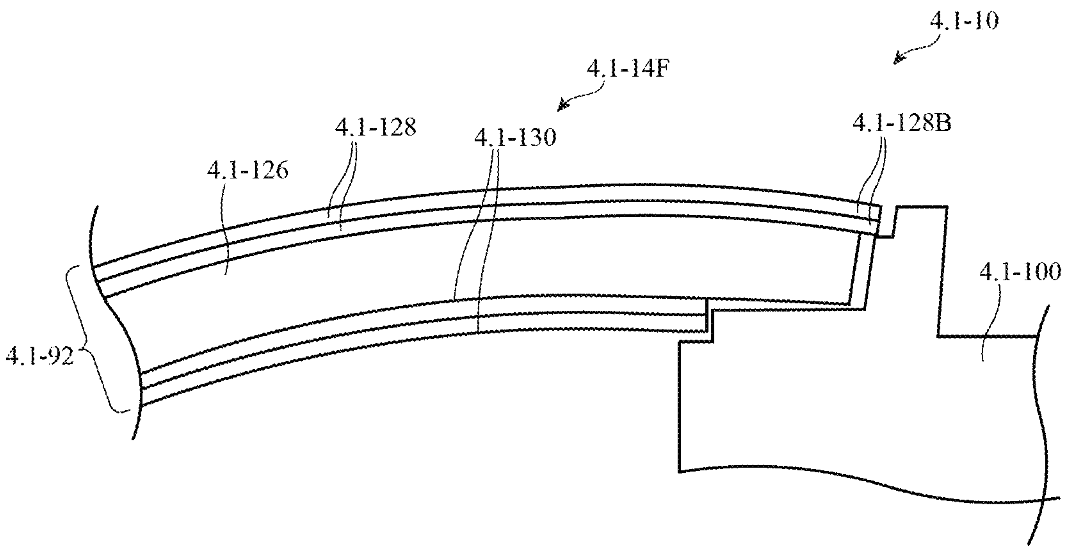
*FIG. 4.1-13*

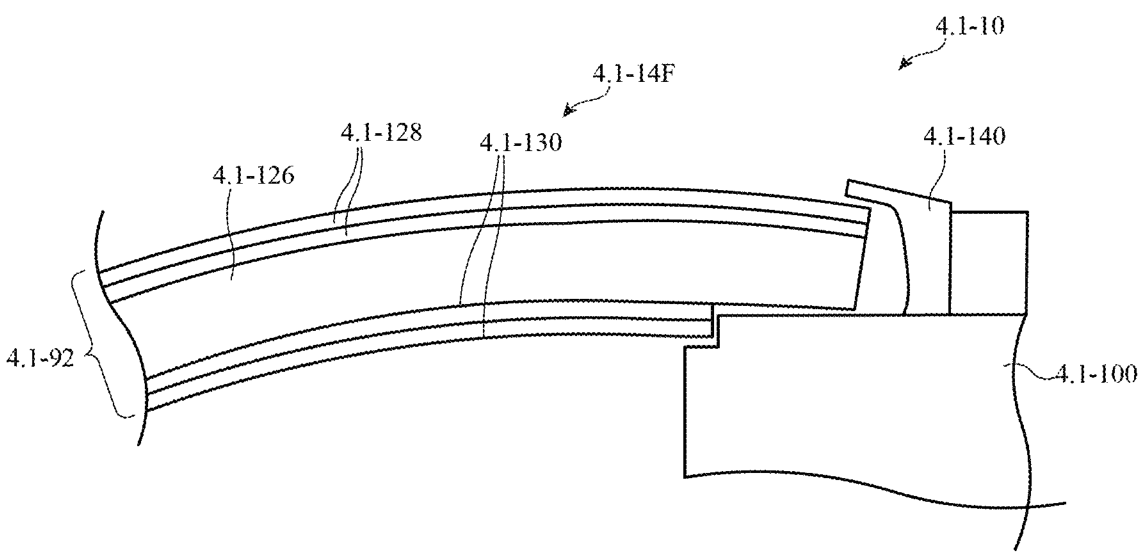
*FIG. 4.1-14*

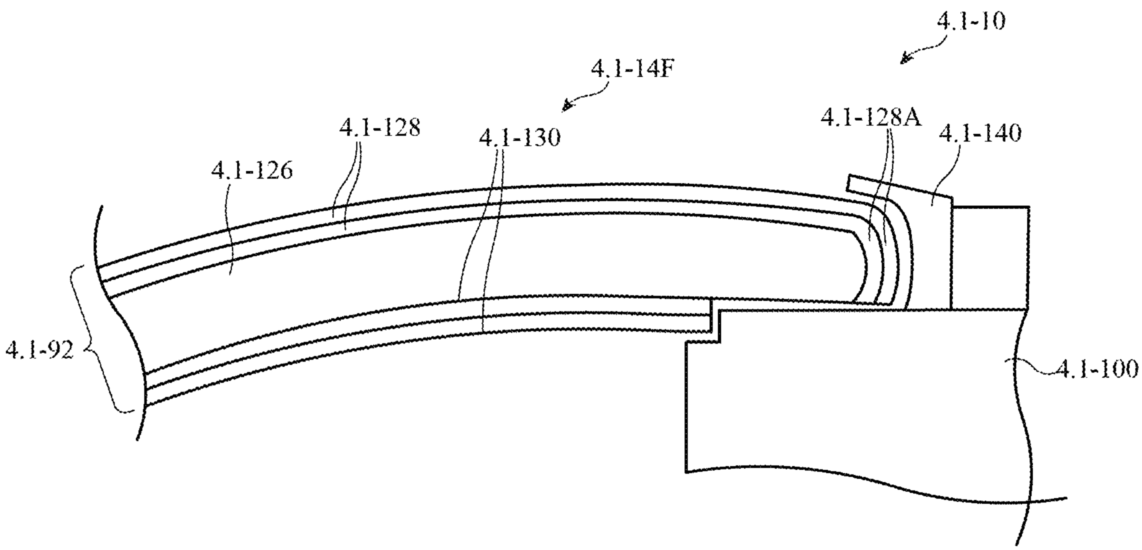
*FIG. 4.1-15*

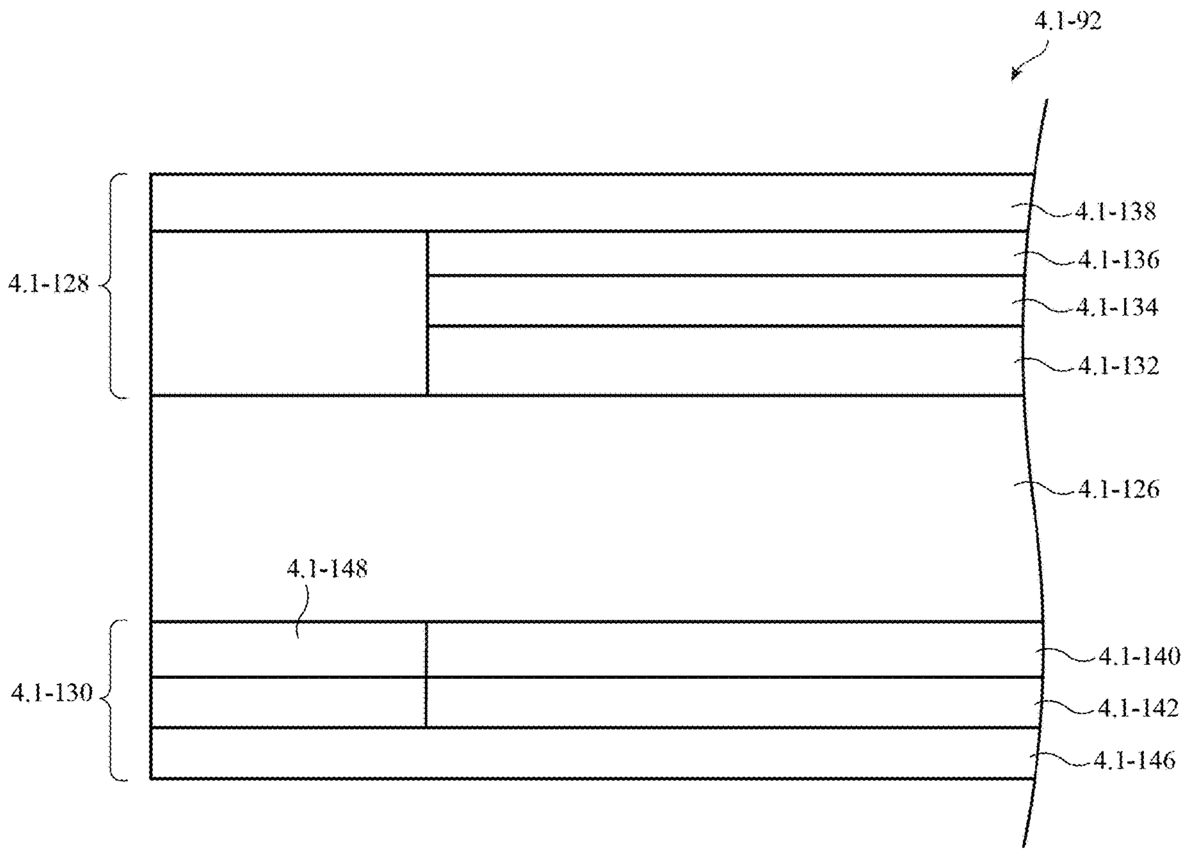
*FIG. 4.1-16*

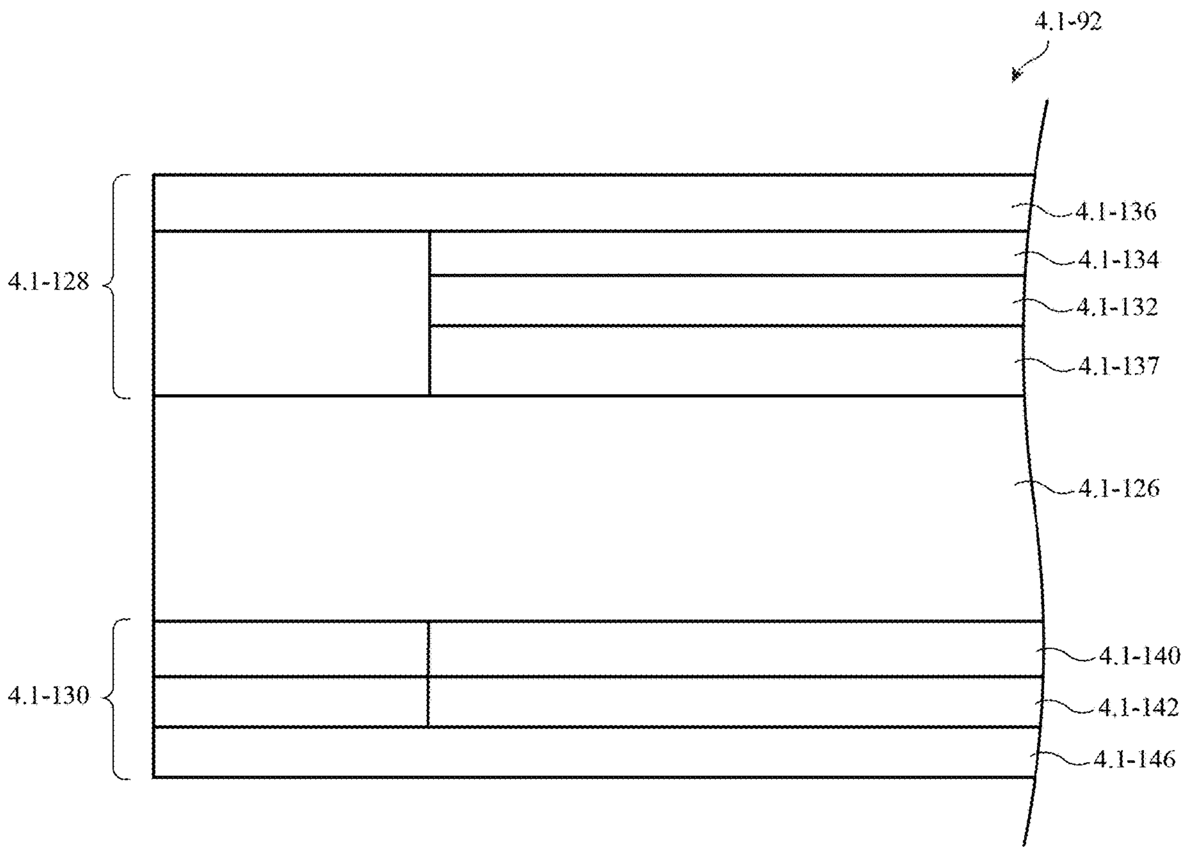
*FIG. 4.1-17*

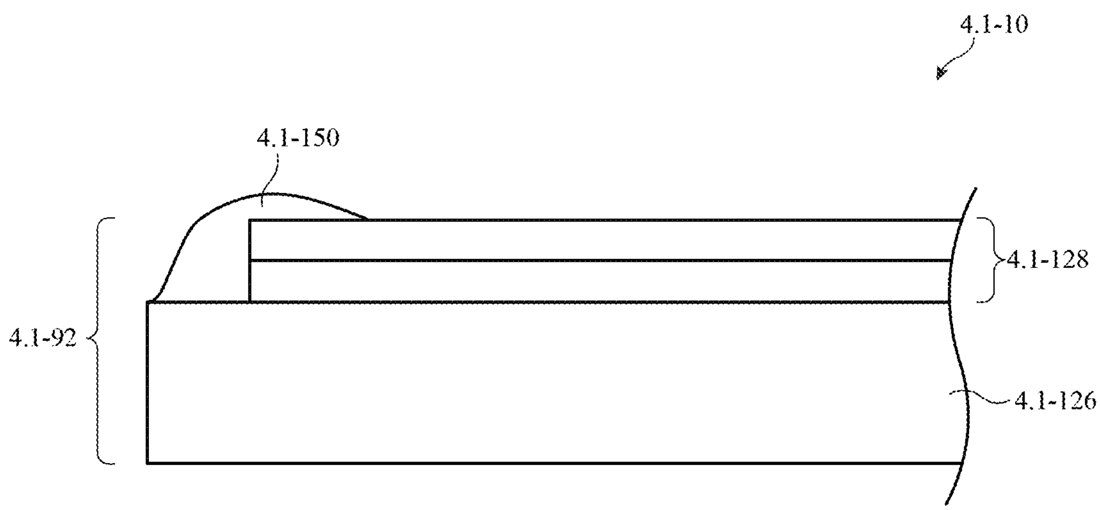
*FIG. 4.1-18*

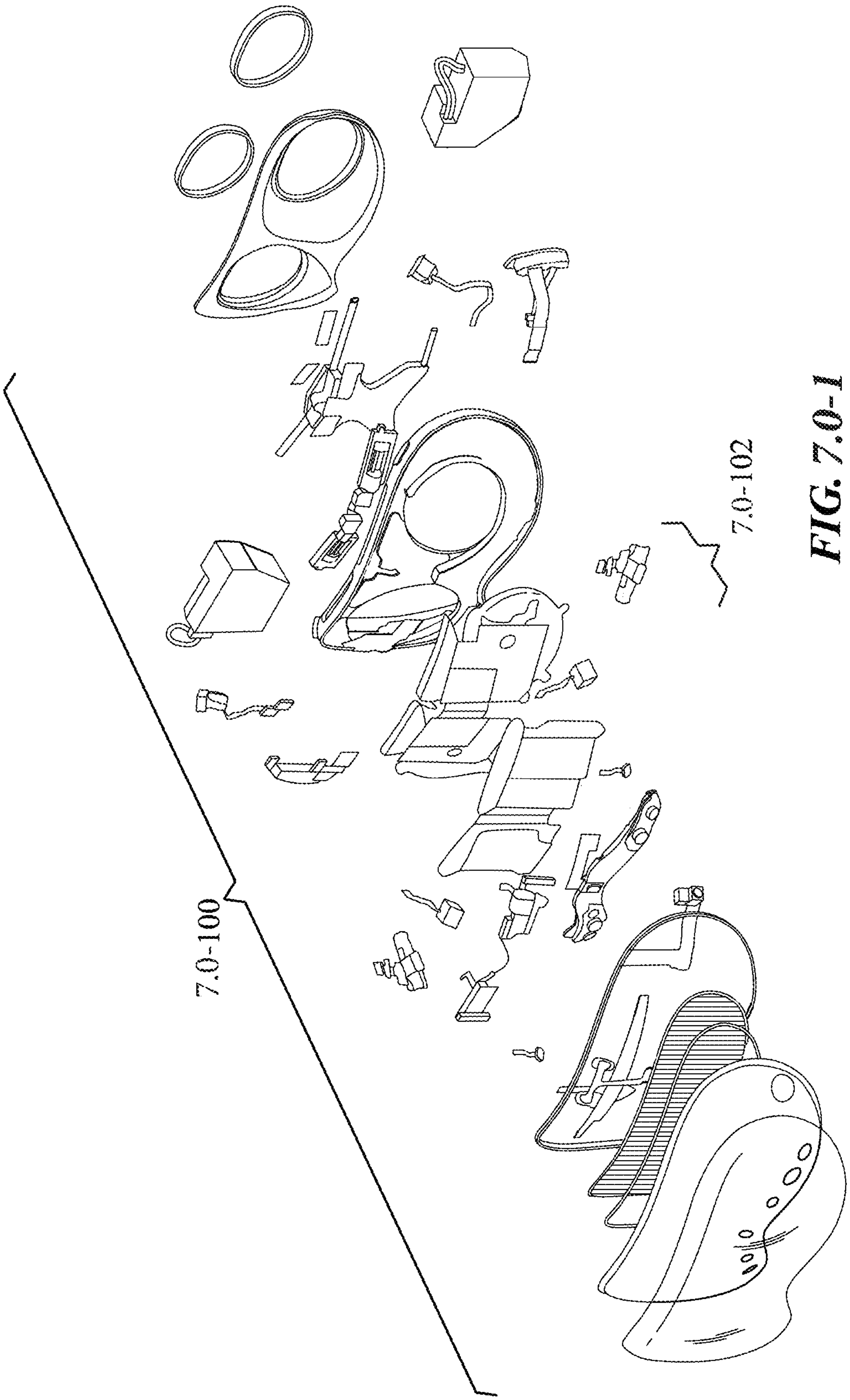
FIG. 7.0-1

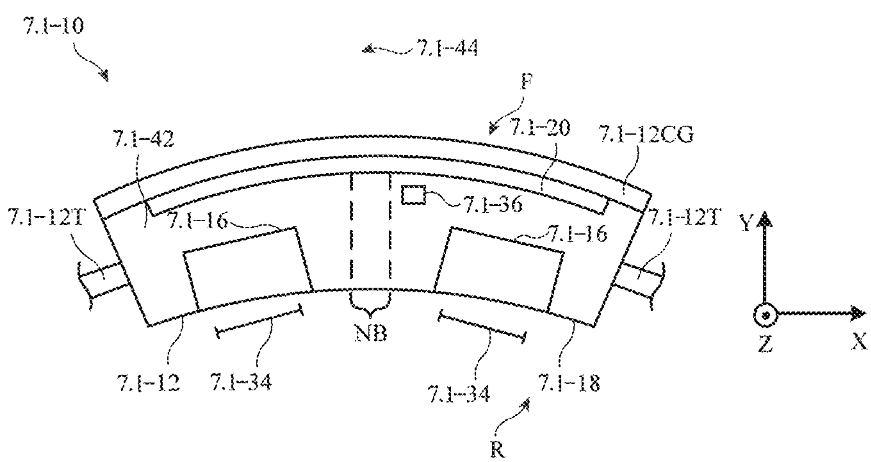
FIG. 7.1-1

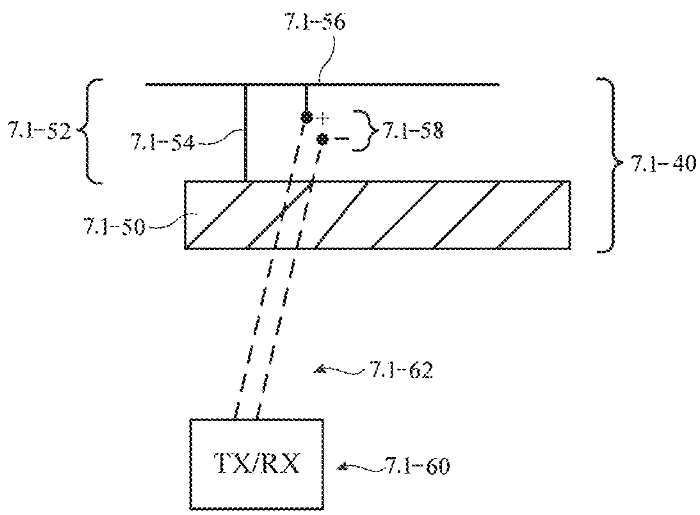
*FIG. 7.1-2*

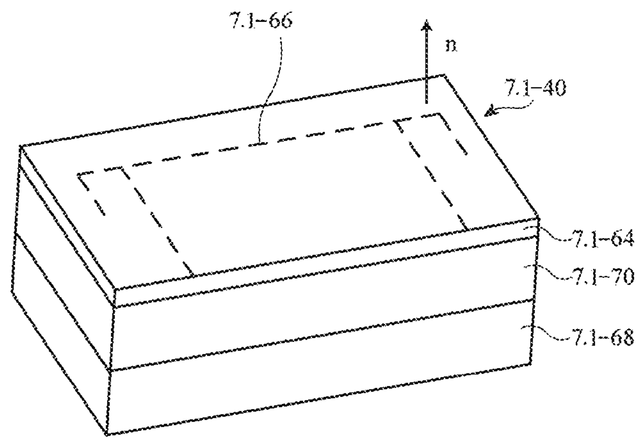
*FIG. 7.1-3*

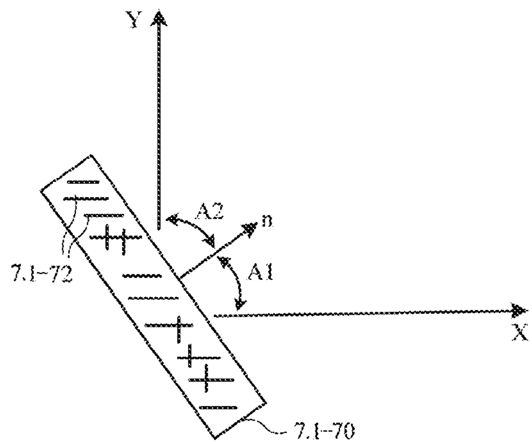
*FIG. 7.1-4*
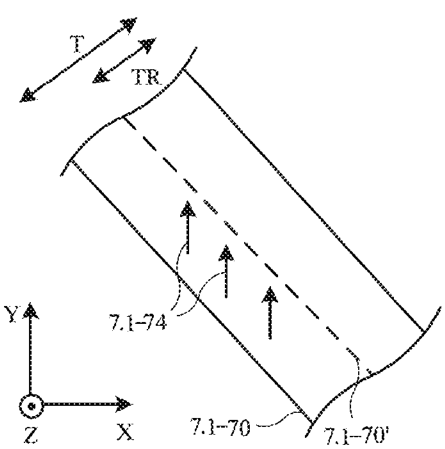
*FIG. 7.1-5*

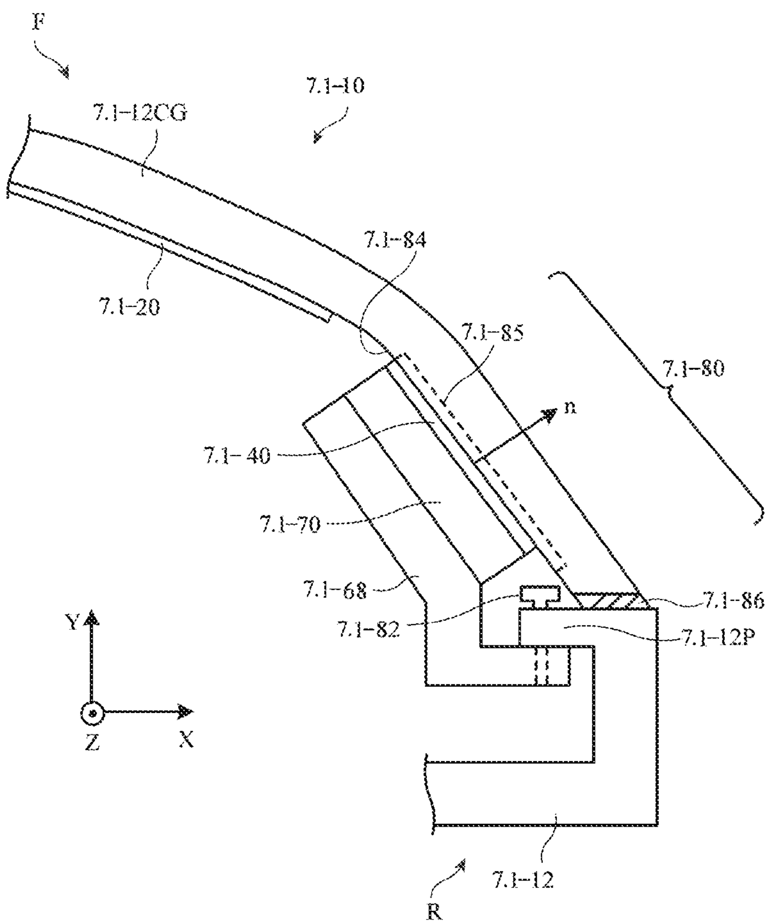
*FIG. 7.1-6*

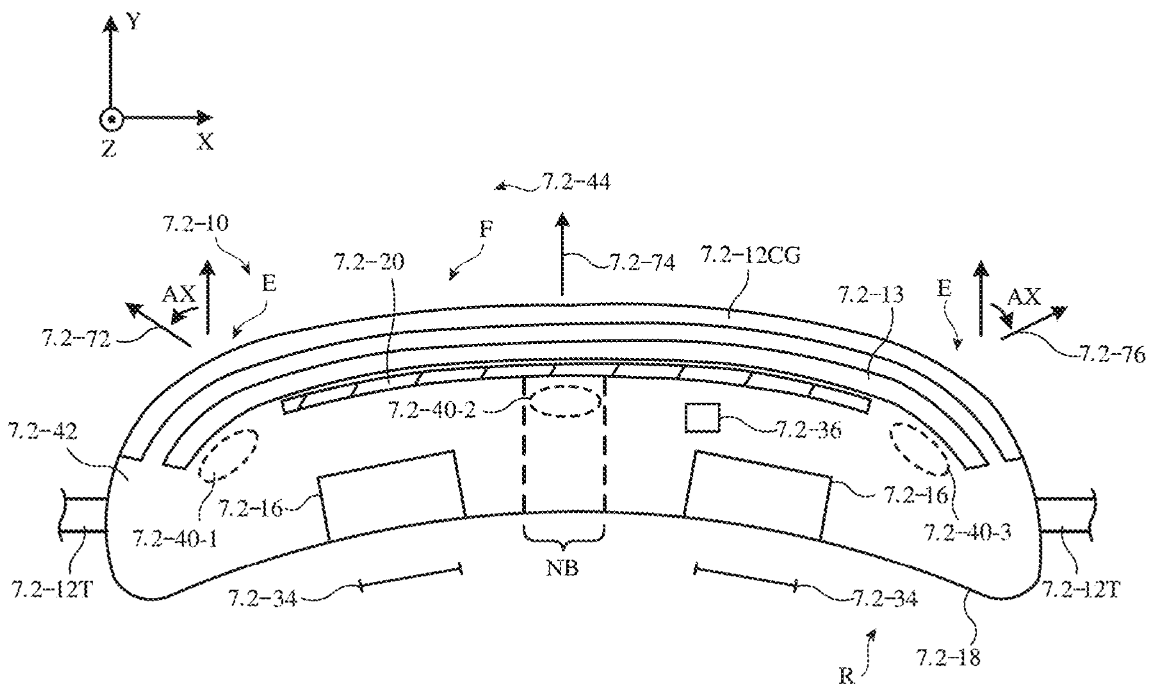
*FIG. 7.2-1*

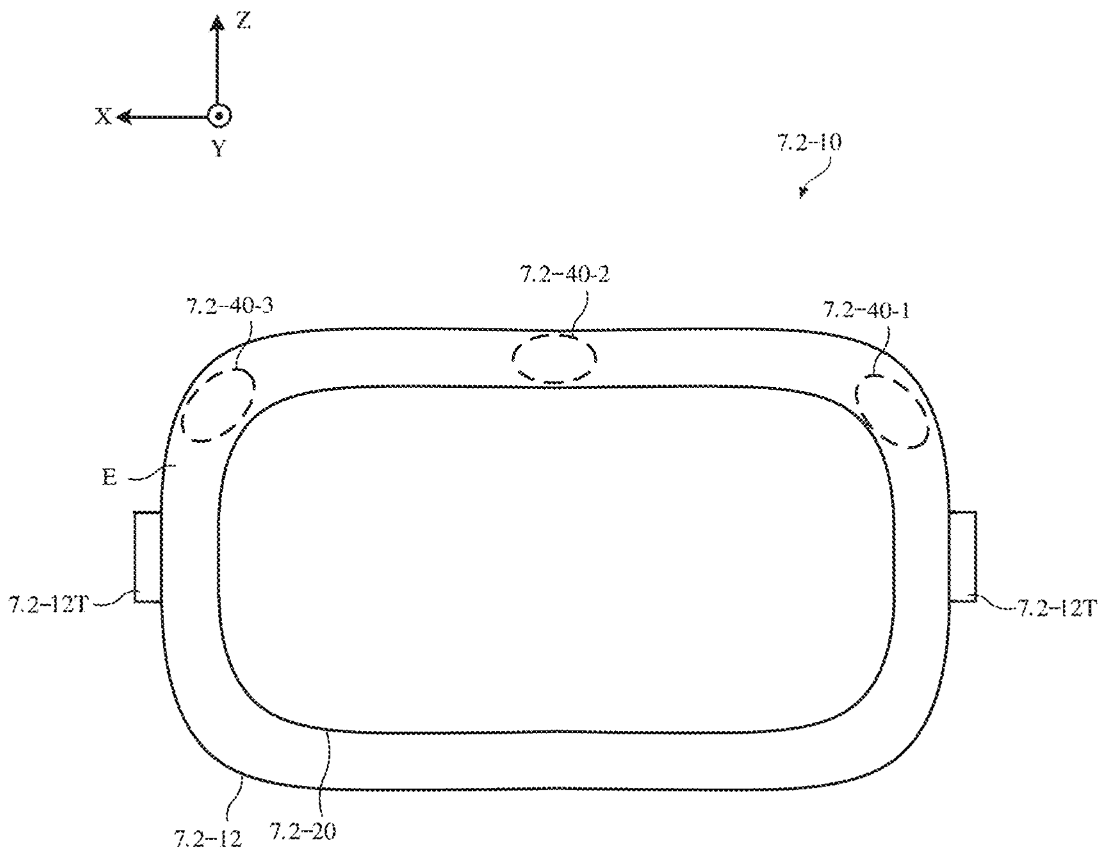
*FIG. 7.2-2*

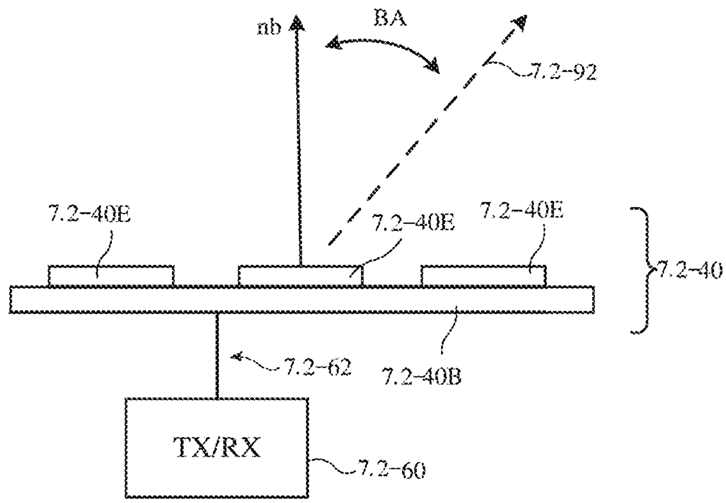
*FIG. 7.2-3*

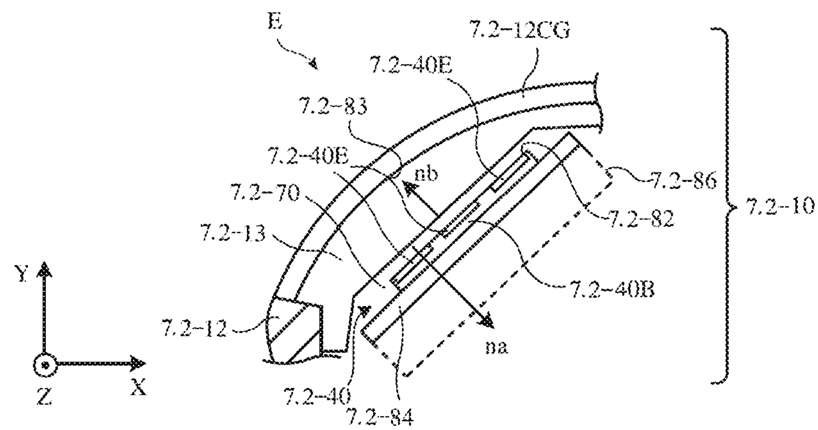
*FIG. 7.2-4*
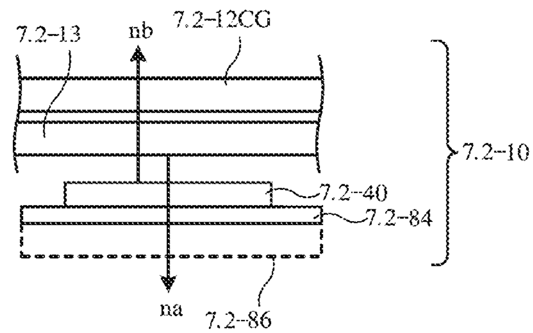
*FIG. 7.2-5*

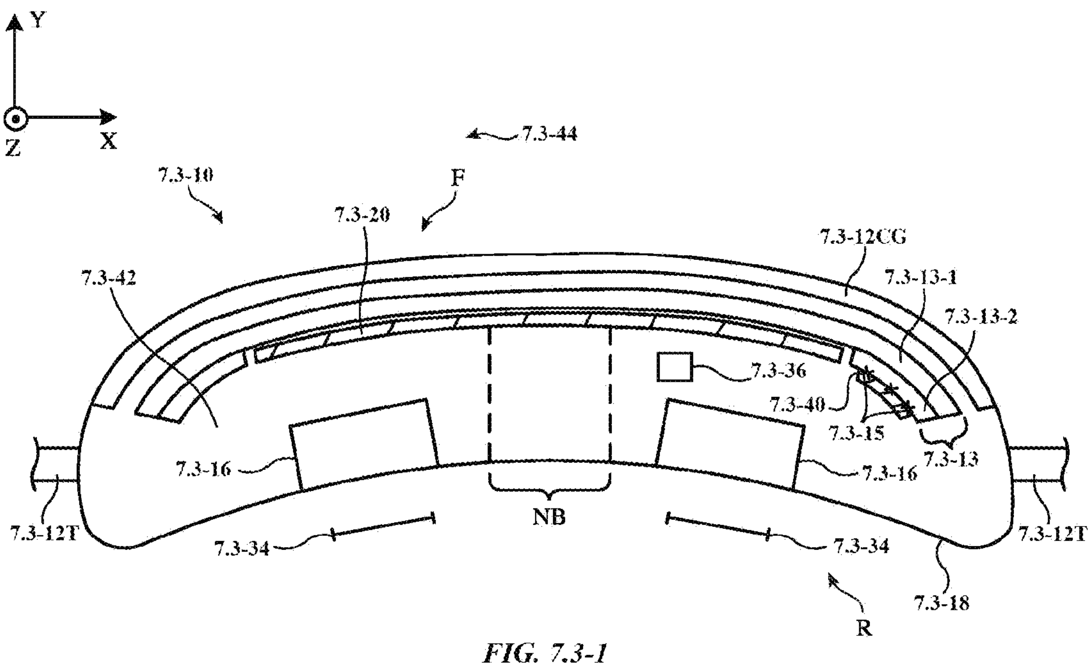
*FIG. 7.3-1*

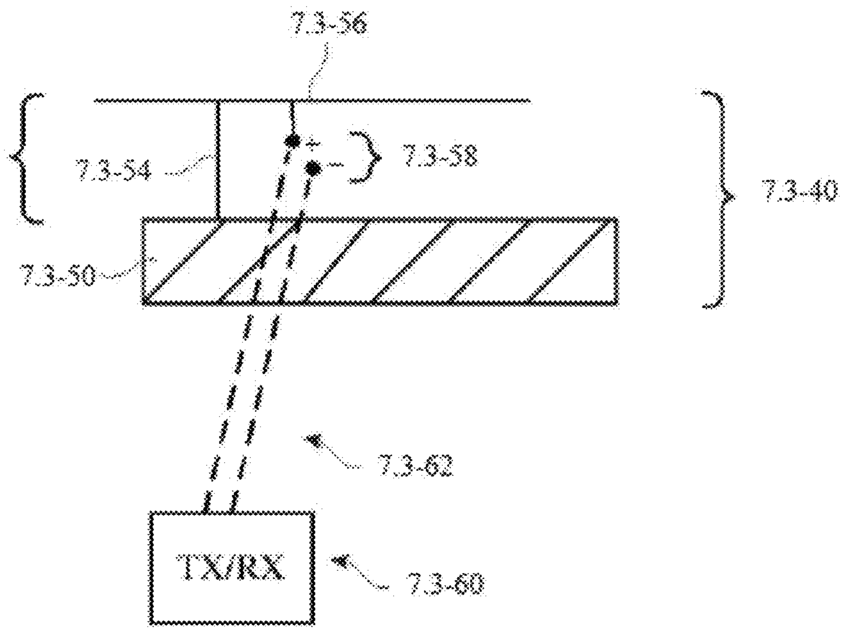
FIG. 7.3-2

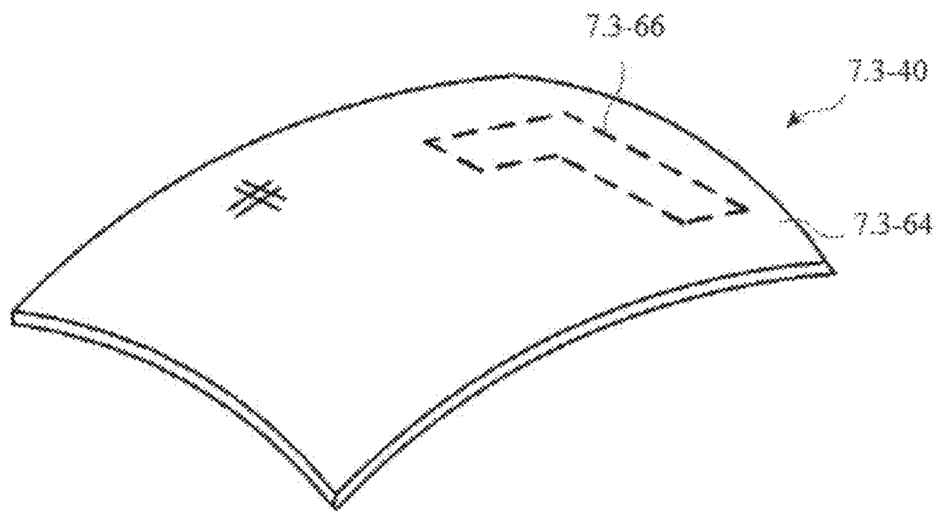
*FIG. 7.3-3*

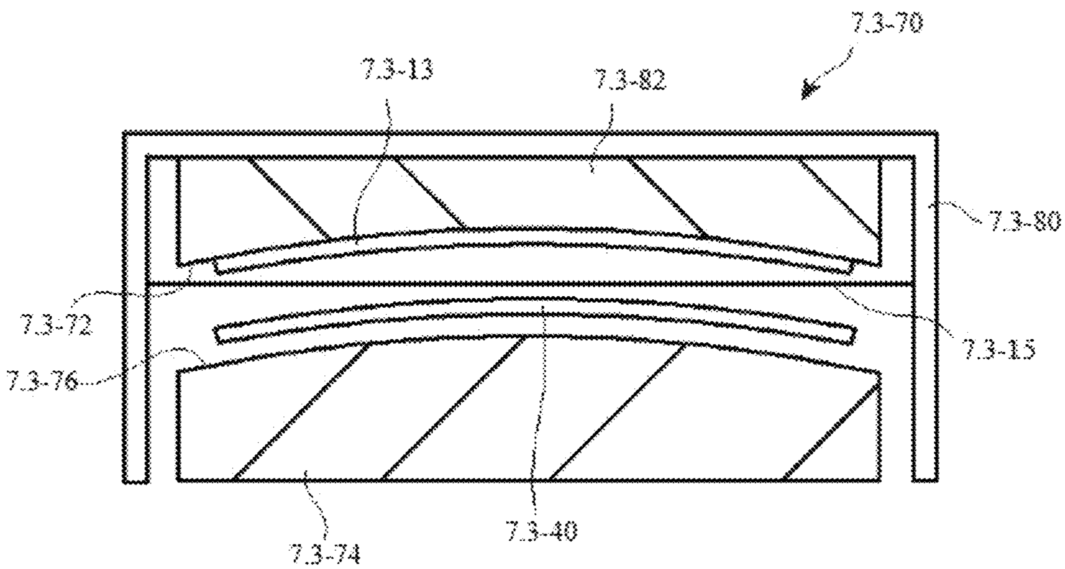
*FIG. 7.3-4*
*FIG. 7.3-5*

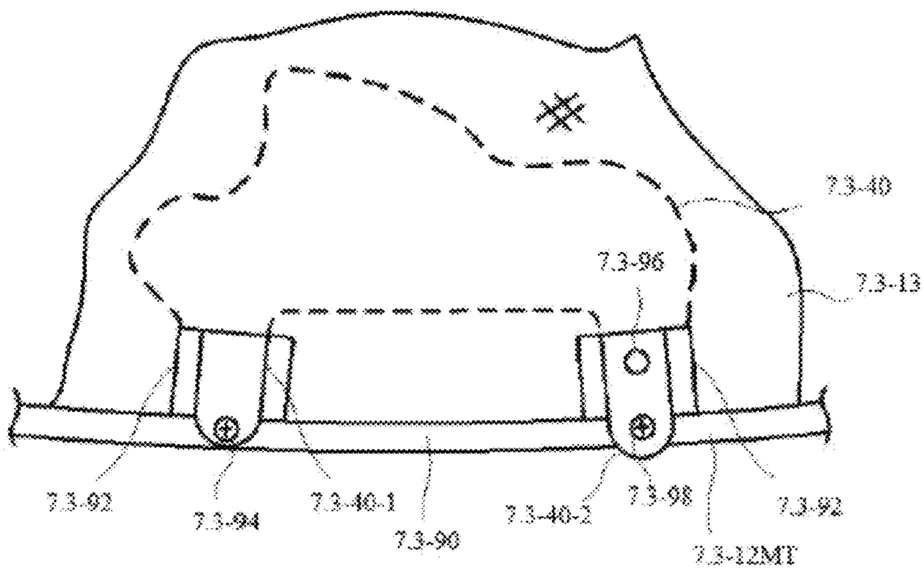
*FIG. 7.3-6*

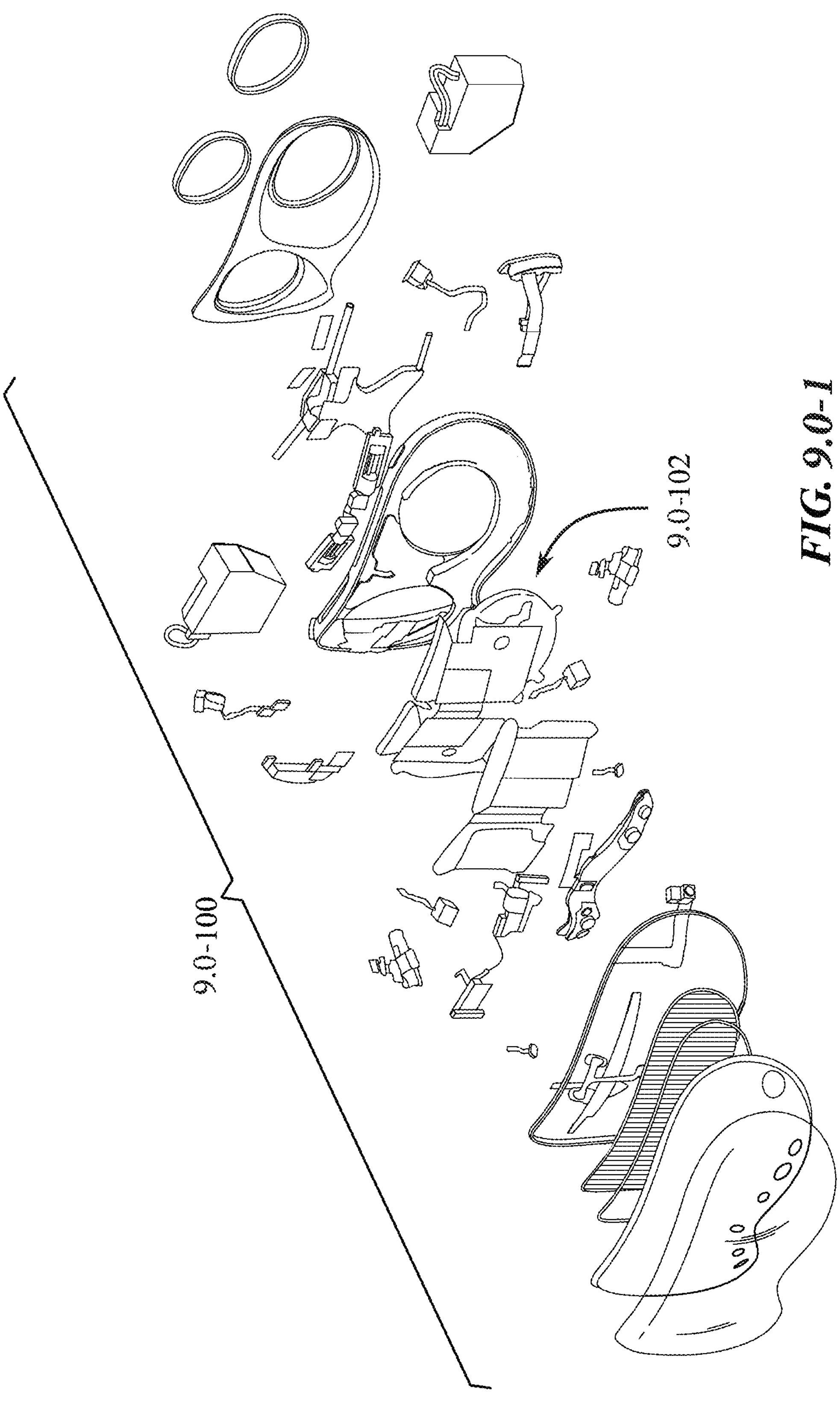
FIG. 9.0-1

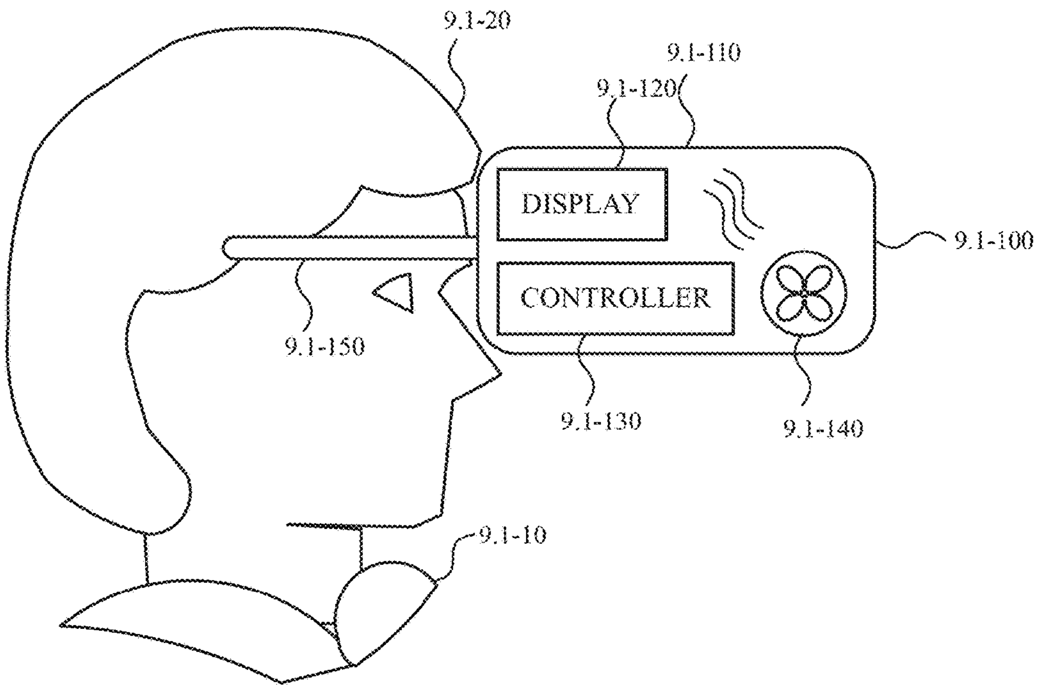
*FIG. 9.1-1*
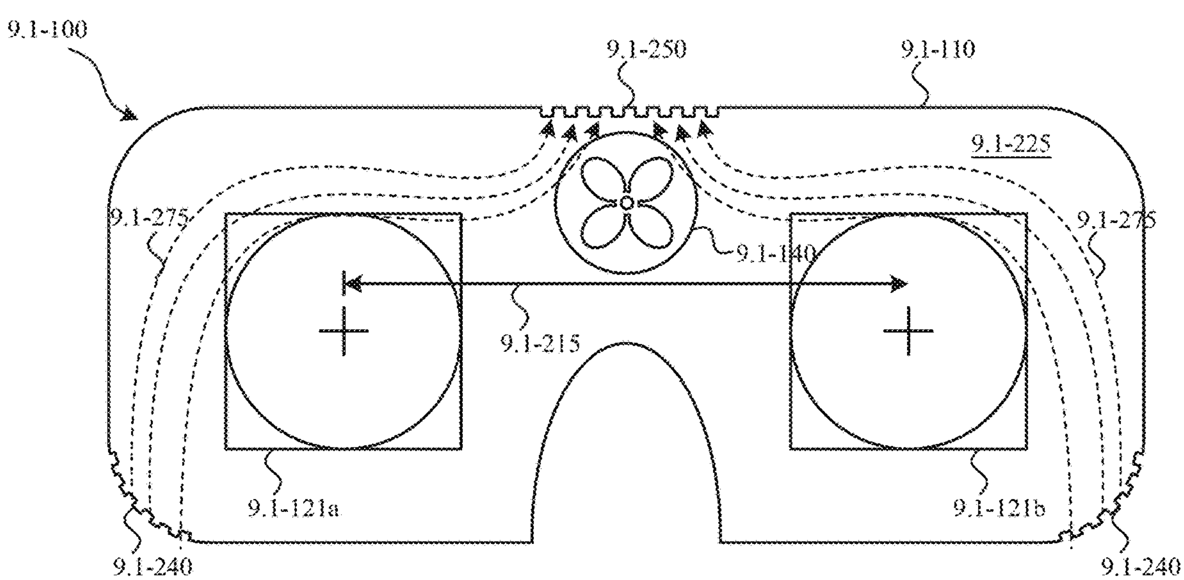
*FIG. 9.1-2*

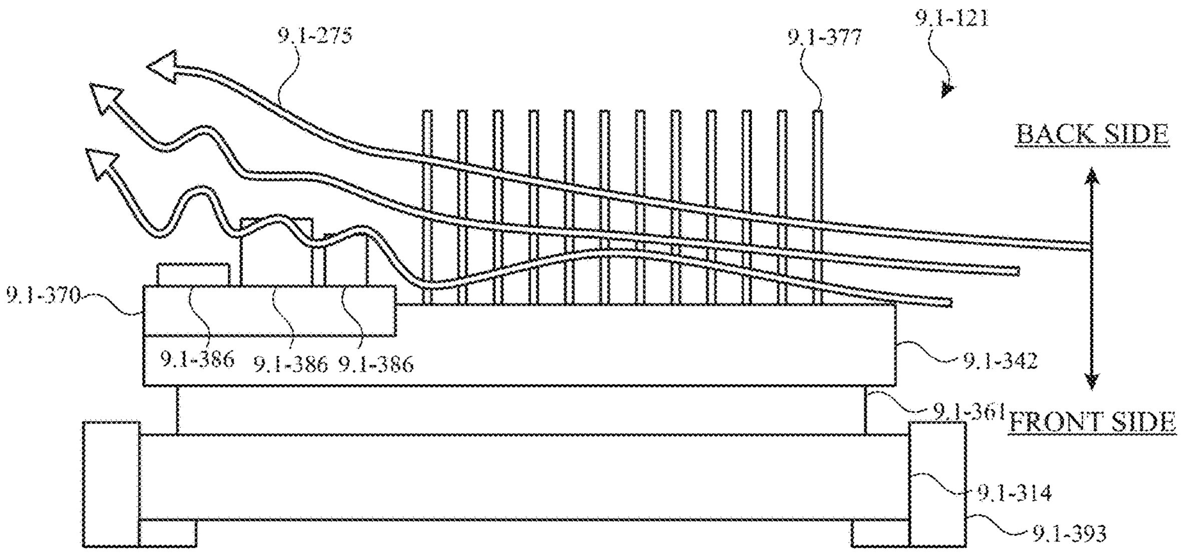
*FIG. 9.1-3*
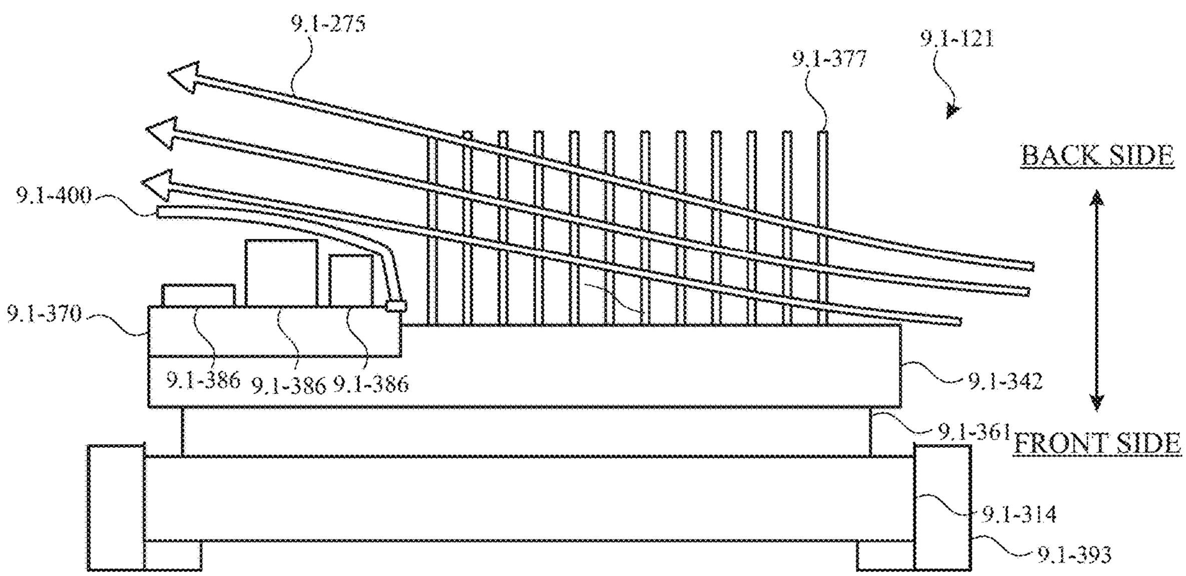
*FIG. 9.1-4*

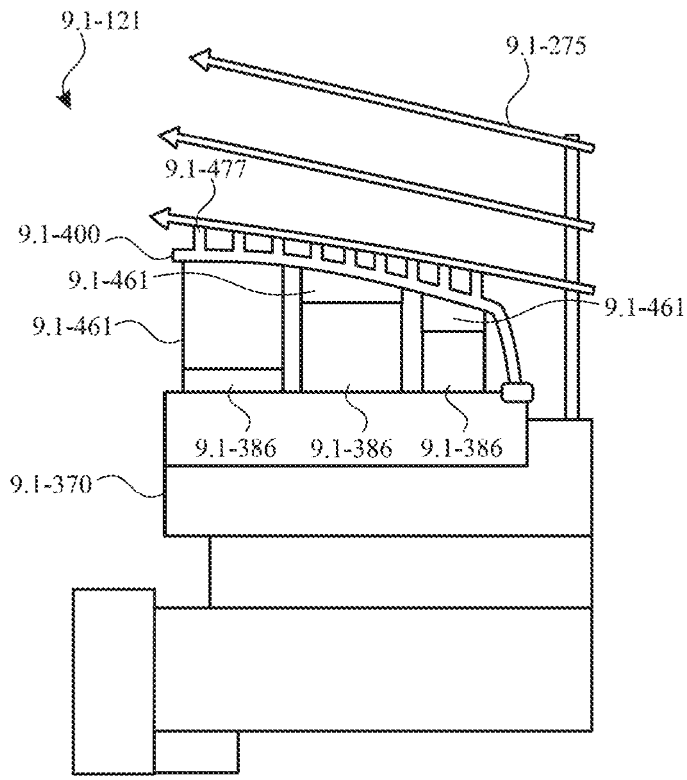
*FIG. 9.1-5*
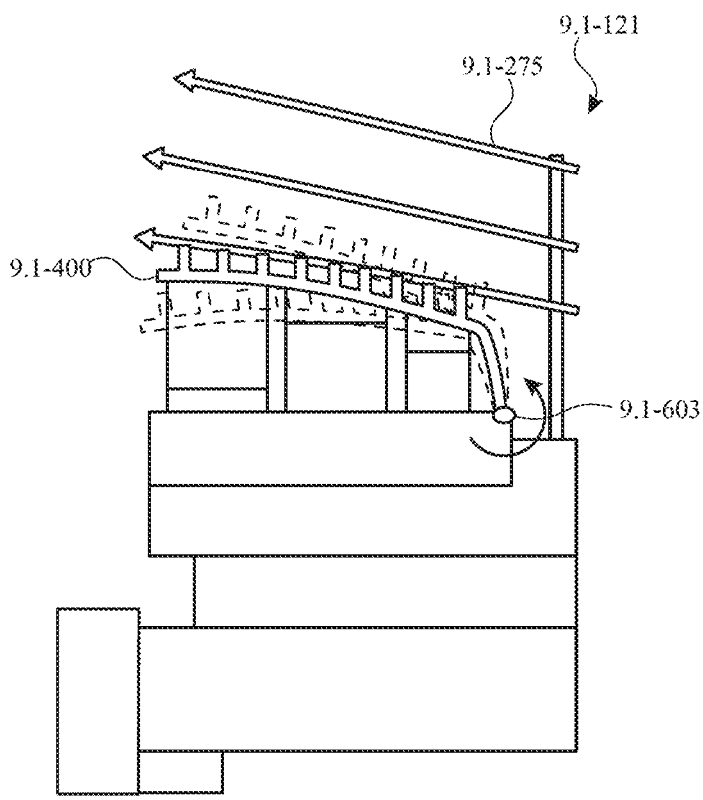
*FIG. 9.1-6*

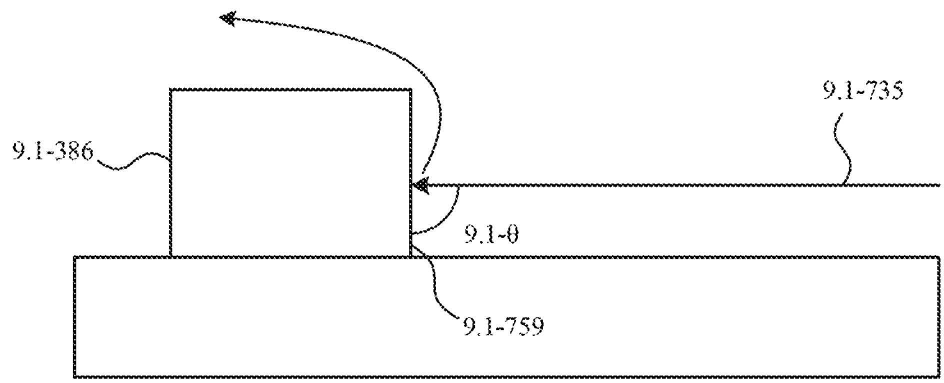
*FIG. 9.1-7*
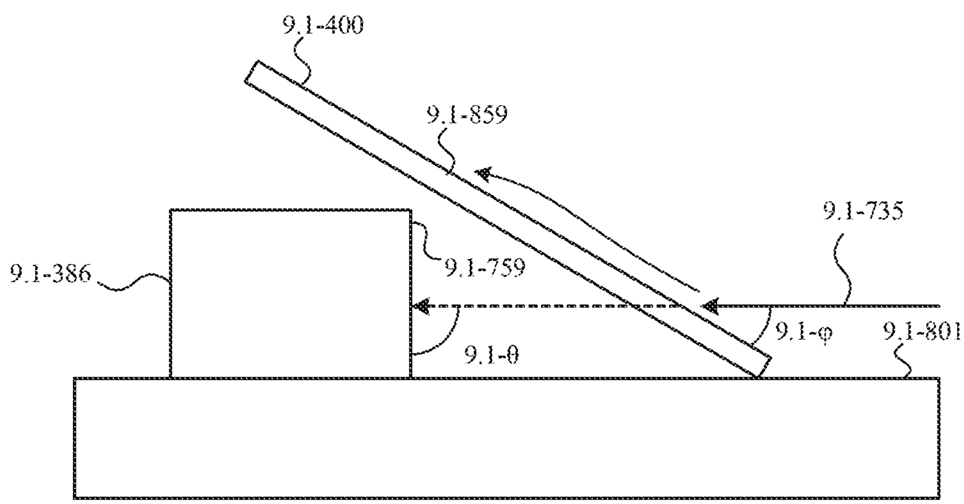
*FIG. 9.1-8*

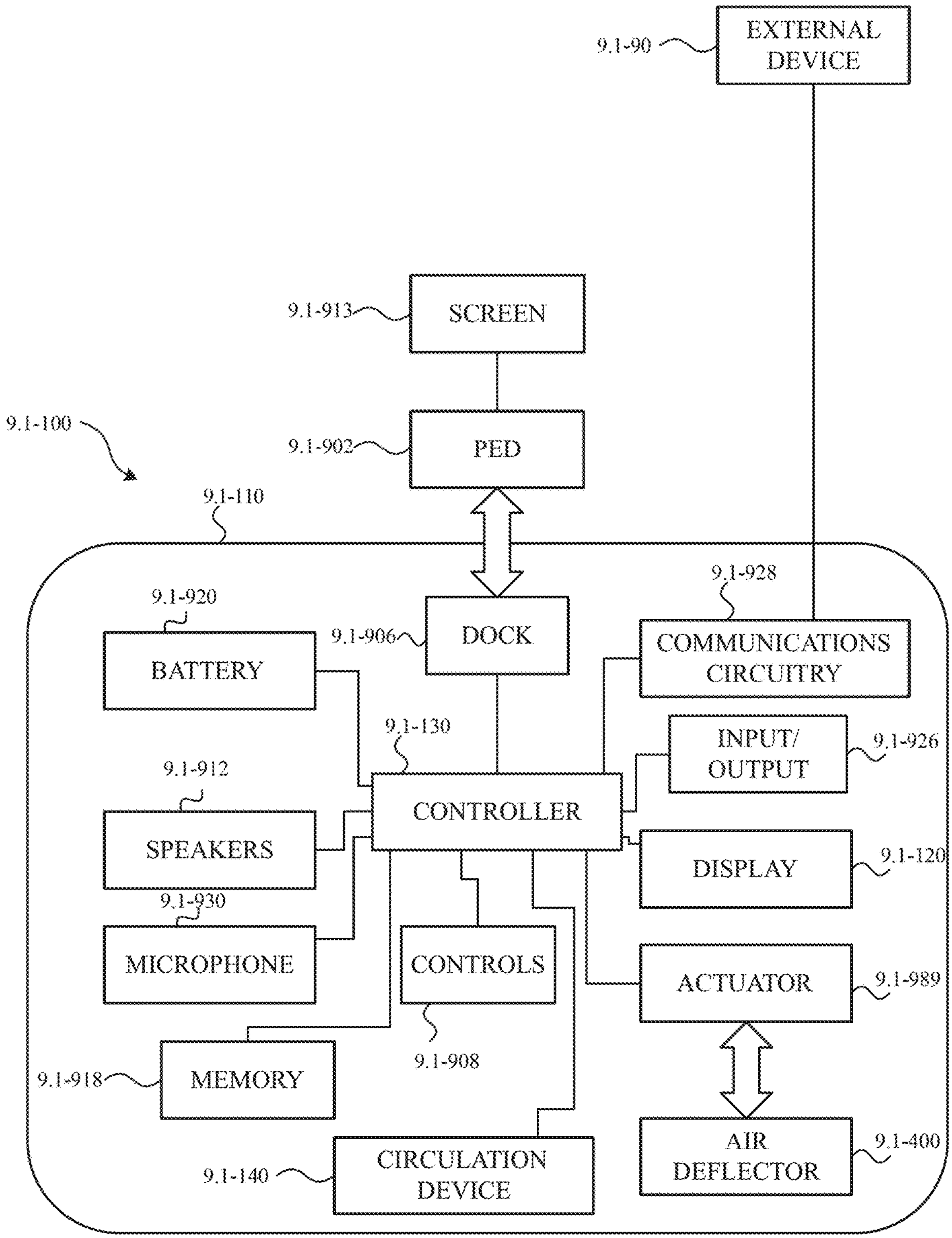
*FIG. 9.1-9*

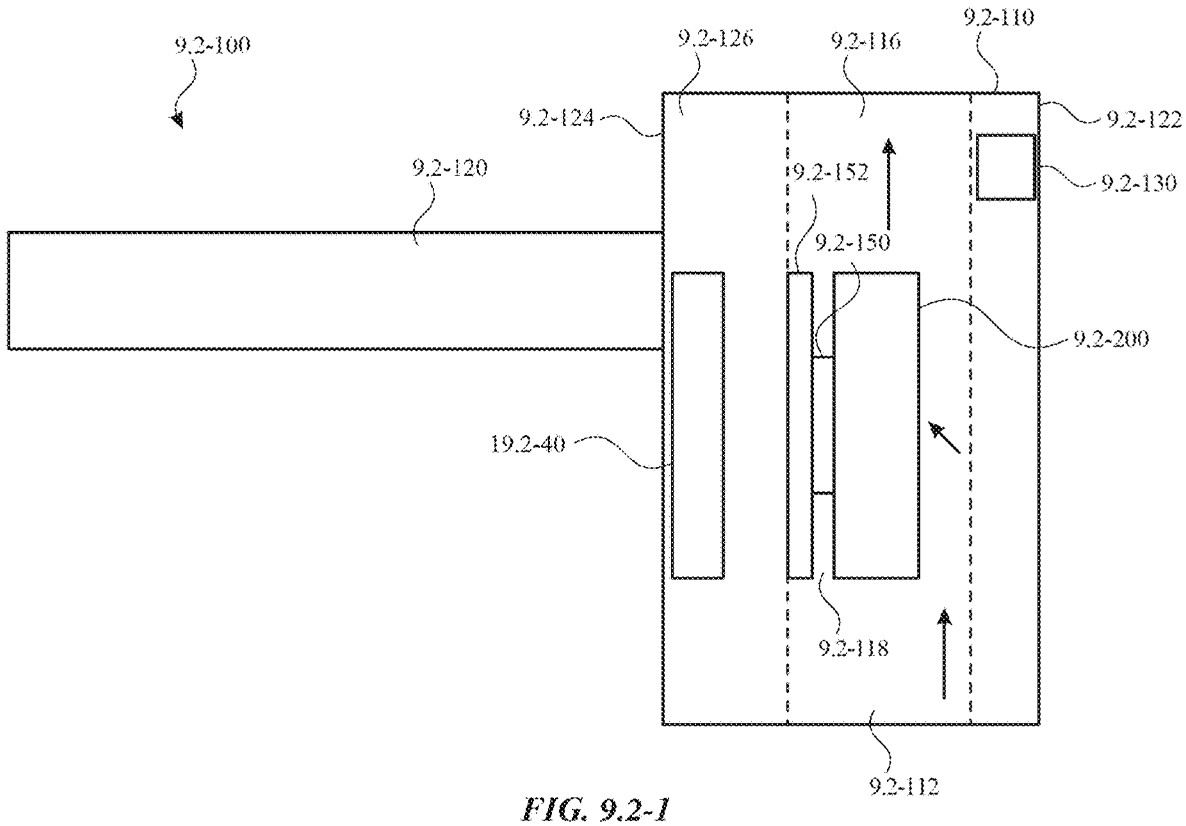
*FIG. 9.2-1*
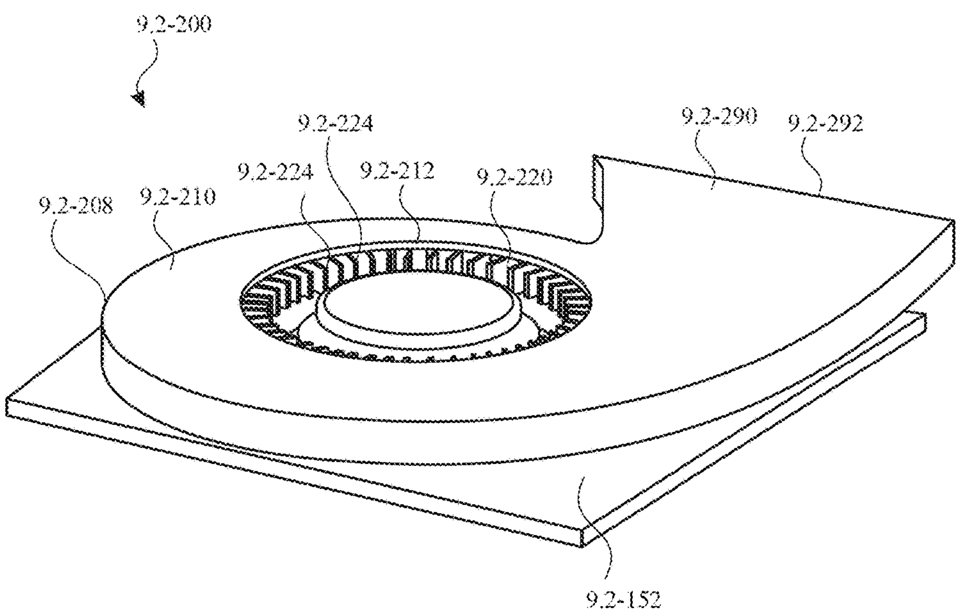
*FIG. 9.2-2*

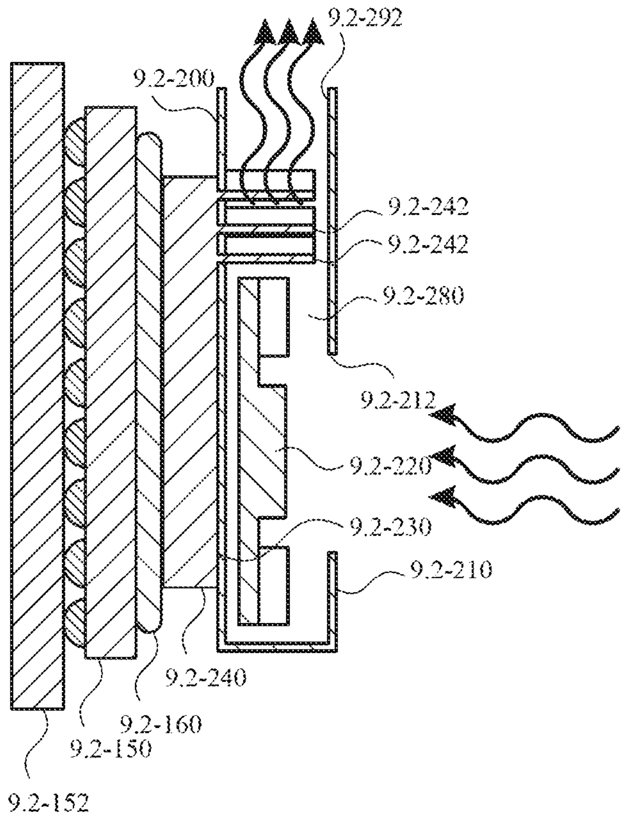
FIG. 9.2-3
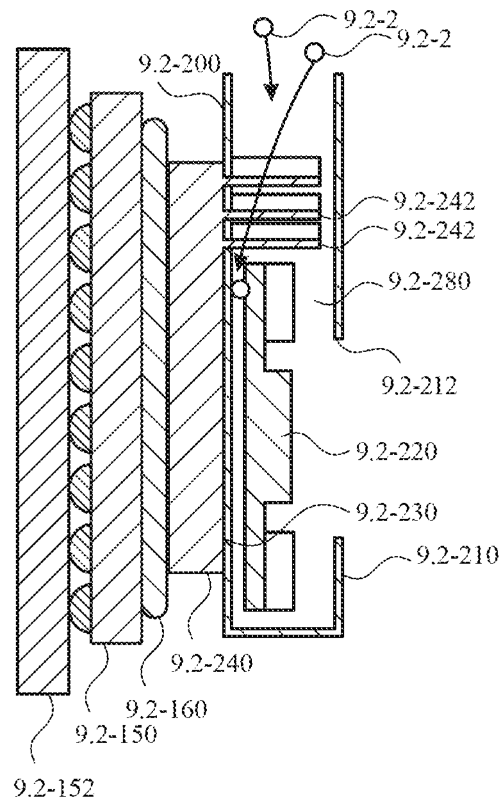
FIG. 9.2-4

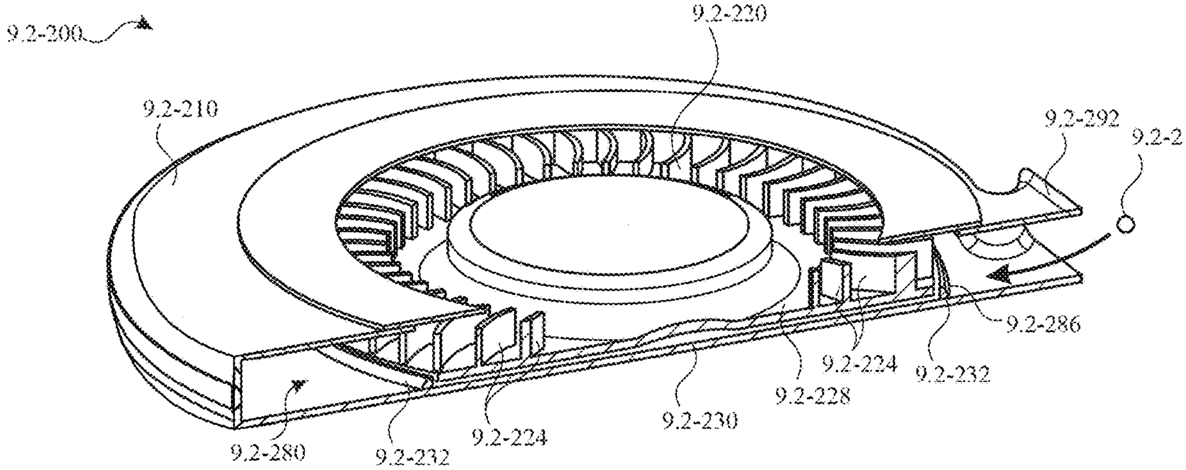
*FIG. 9.2-5*
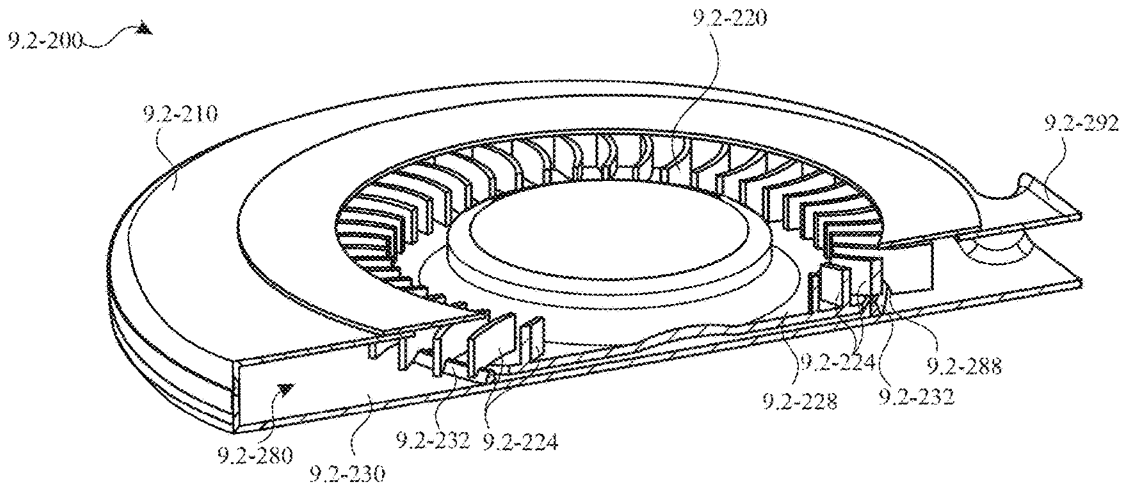
*FIG. 9.2-6*
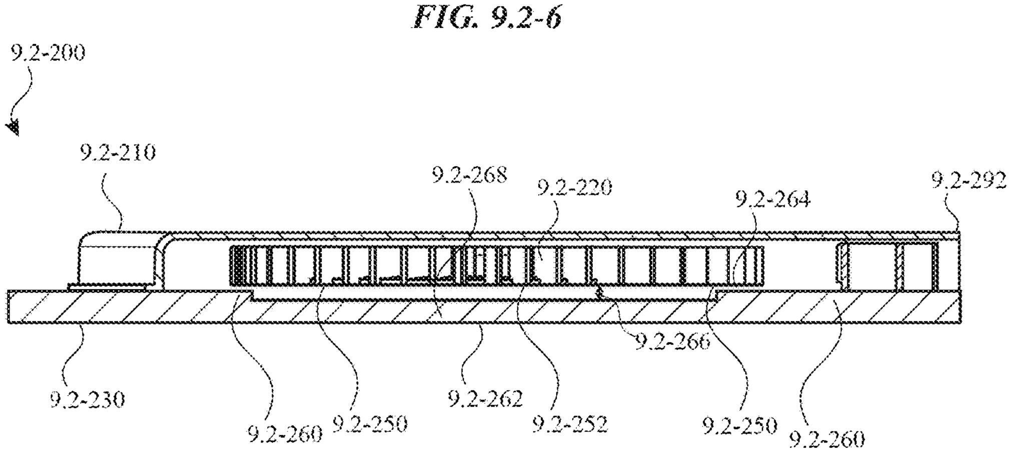
*FIG. 9.2-7*

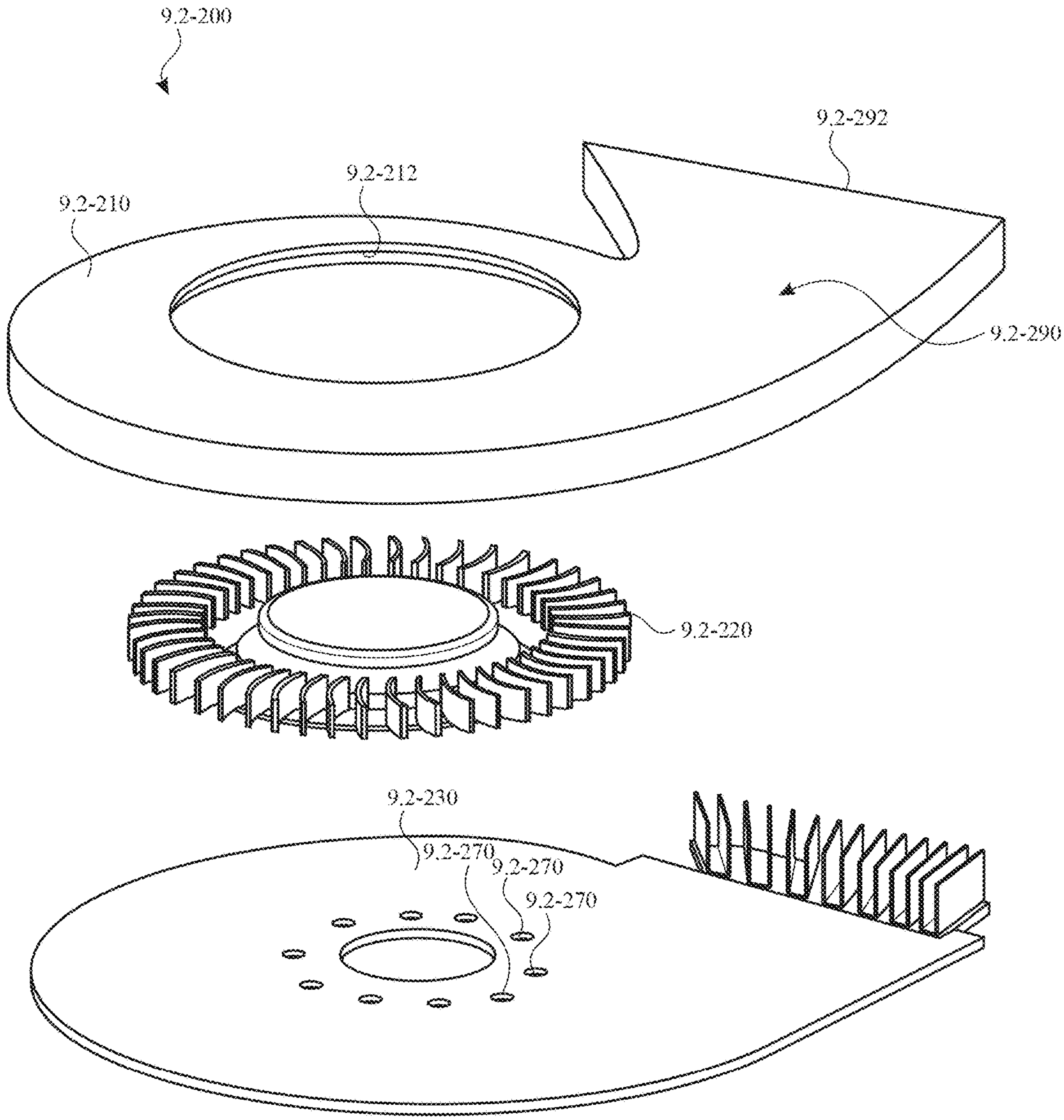
*FIG. 9.2-8*

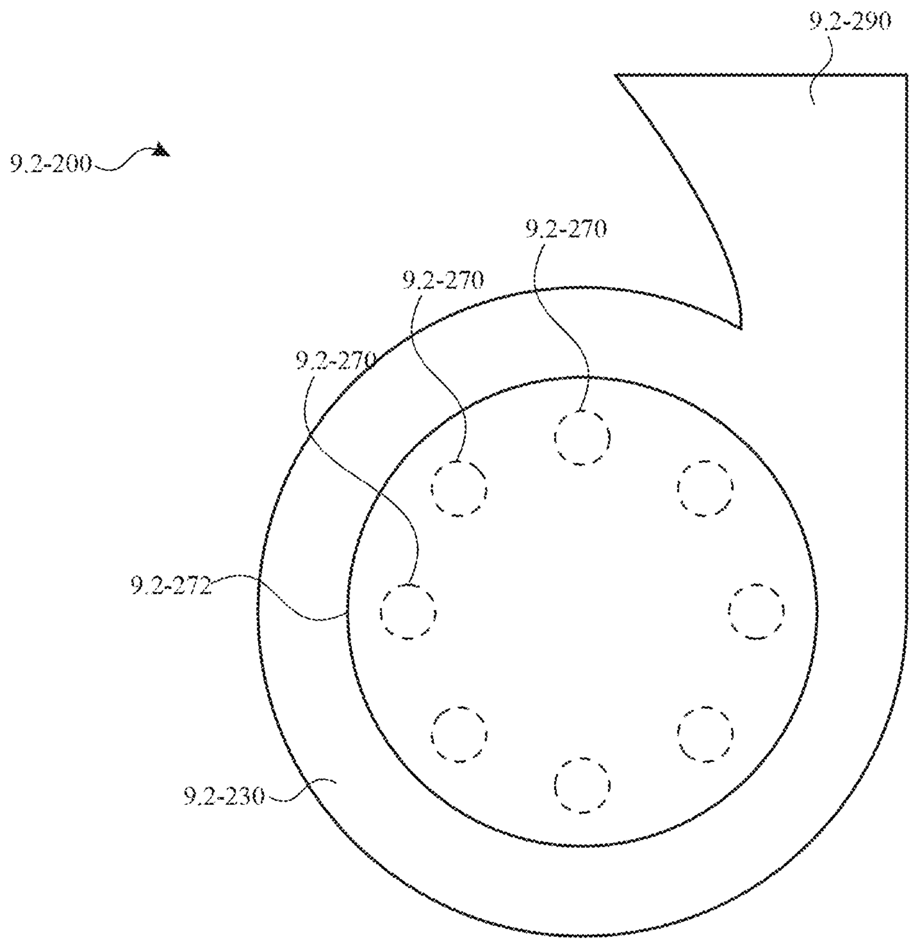
*FIG. 9.2-9*
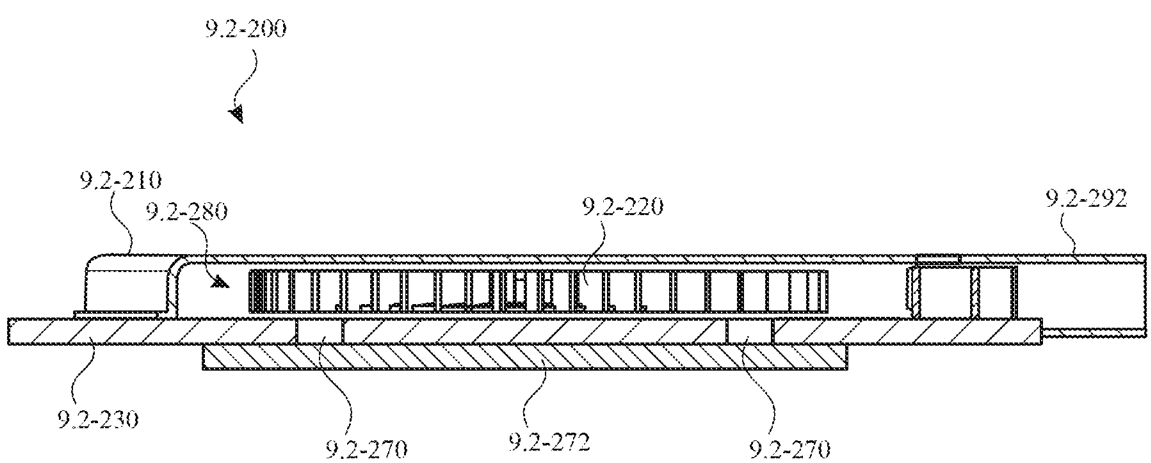
*FIG. 9.2-10*

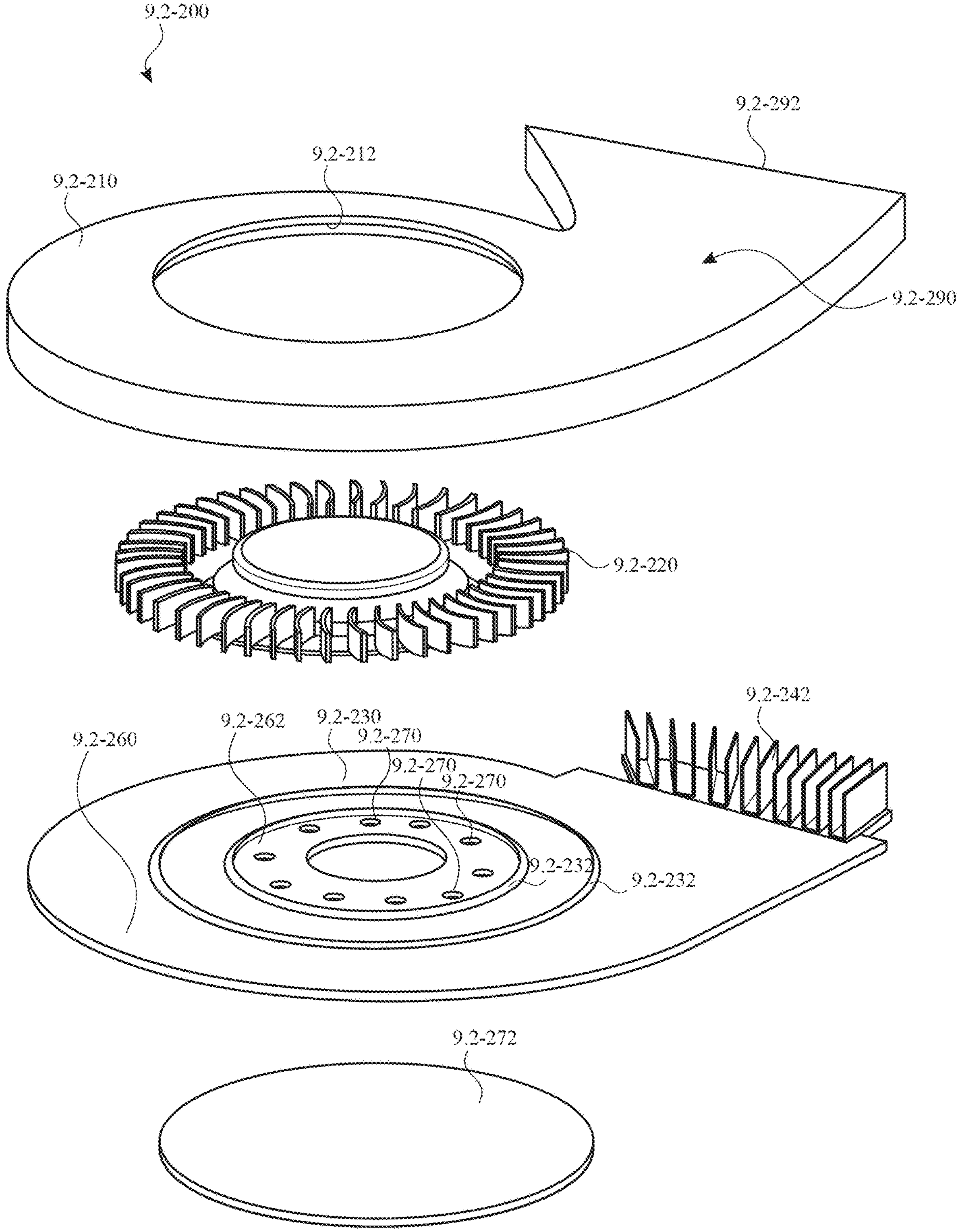
*FIG. 9.2-11*

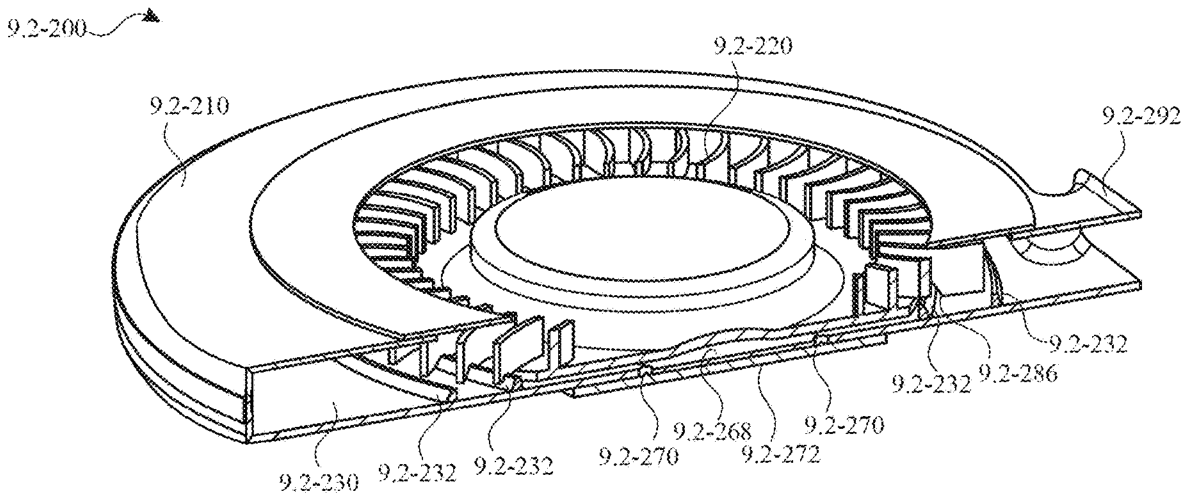
*FIG. 9.2-12*
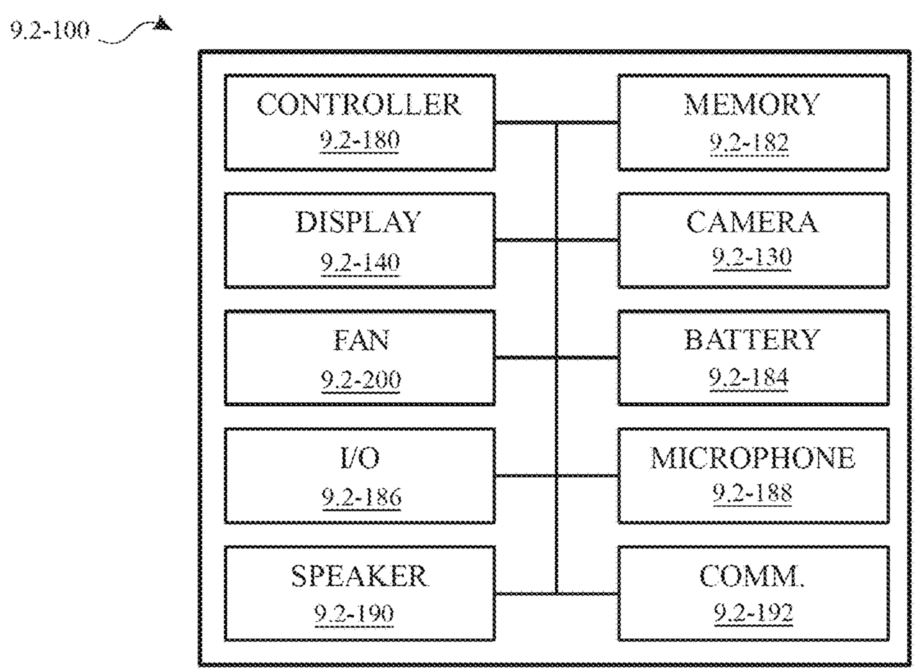
*FIG. 9.2-13*

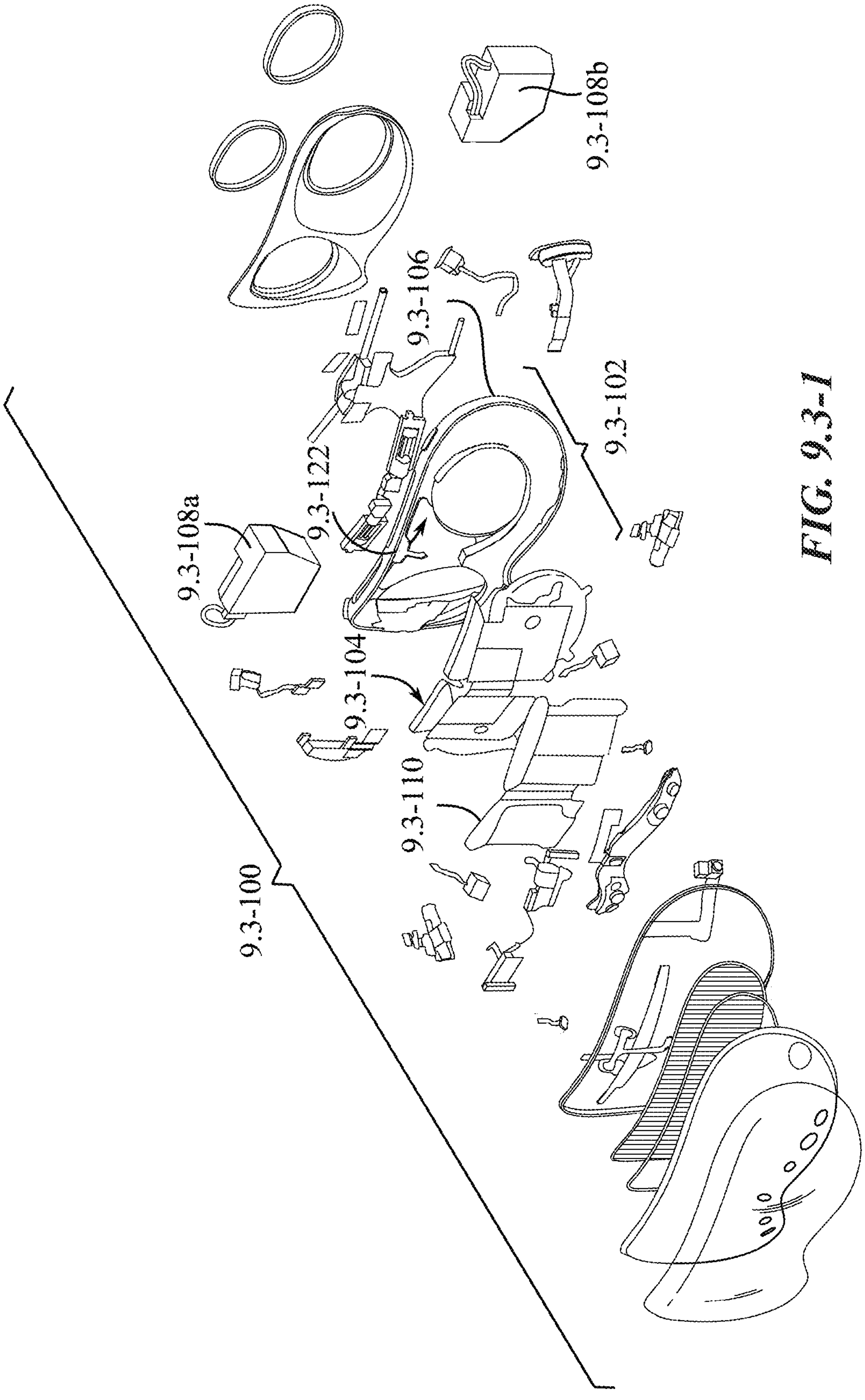
FIG. 9.3-1

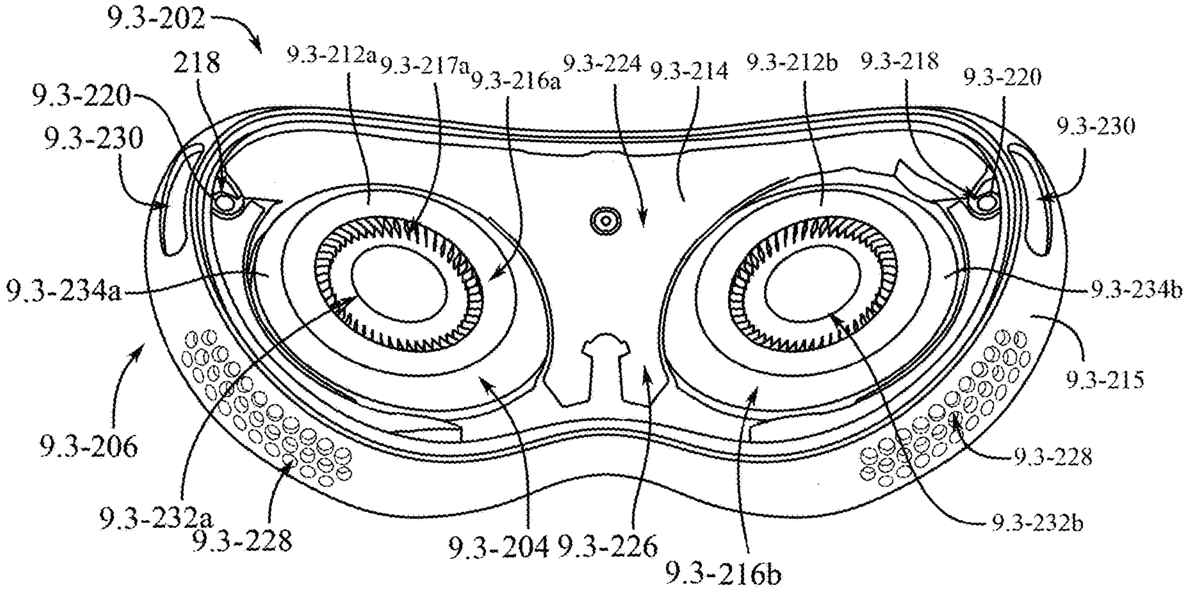
9.3-2
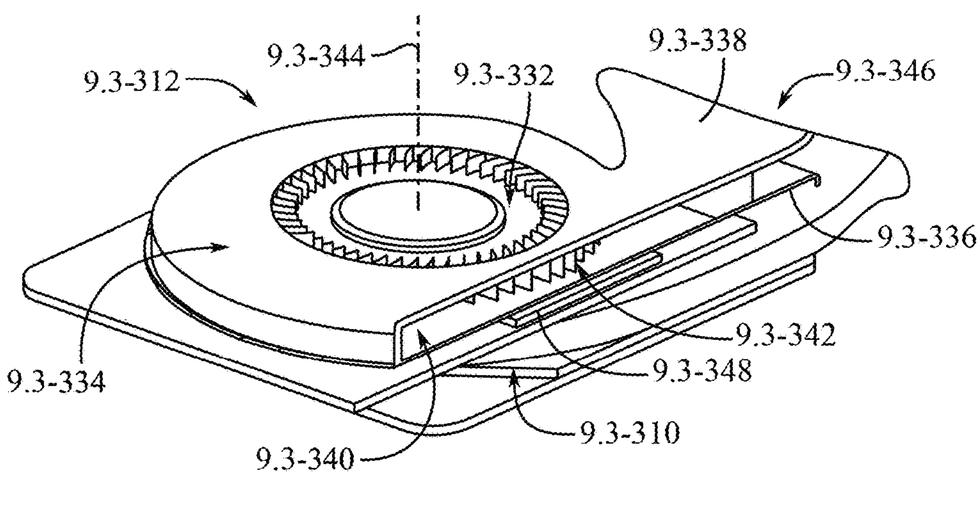
9.3-3

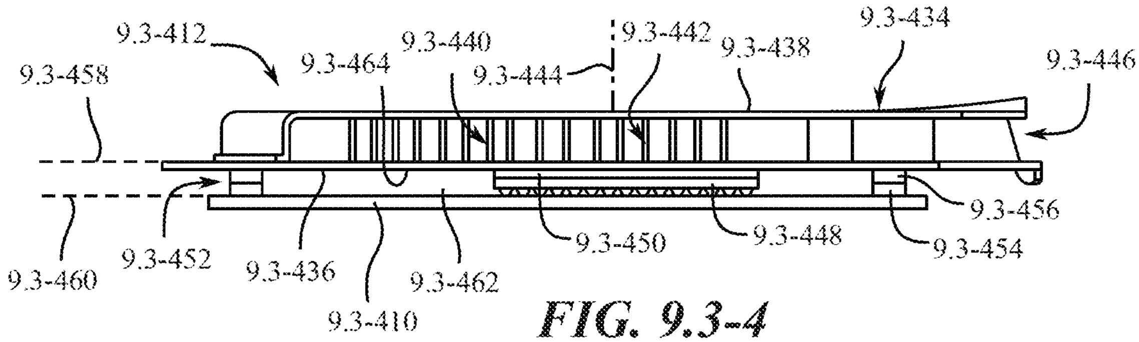
FIG. 9.3-4
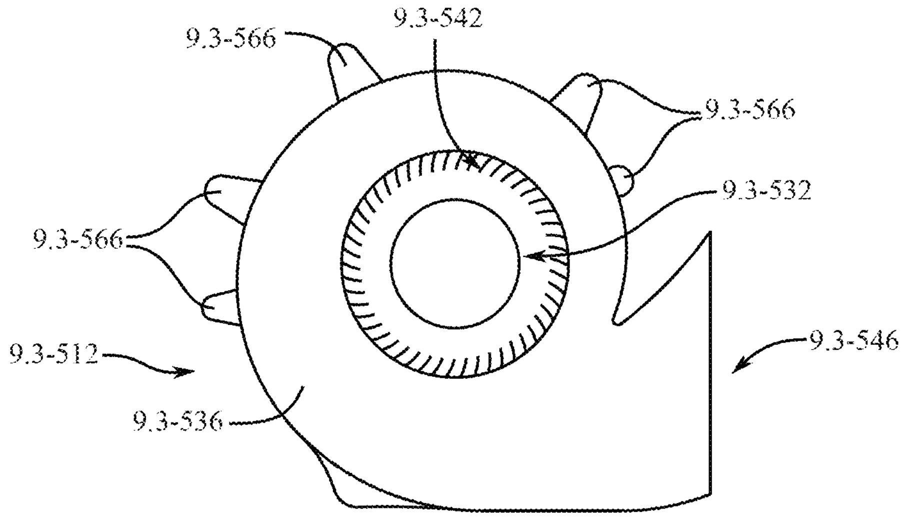
FIG. 9.3-5
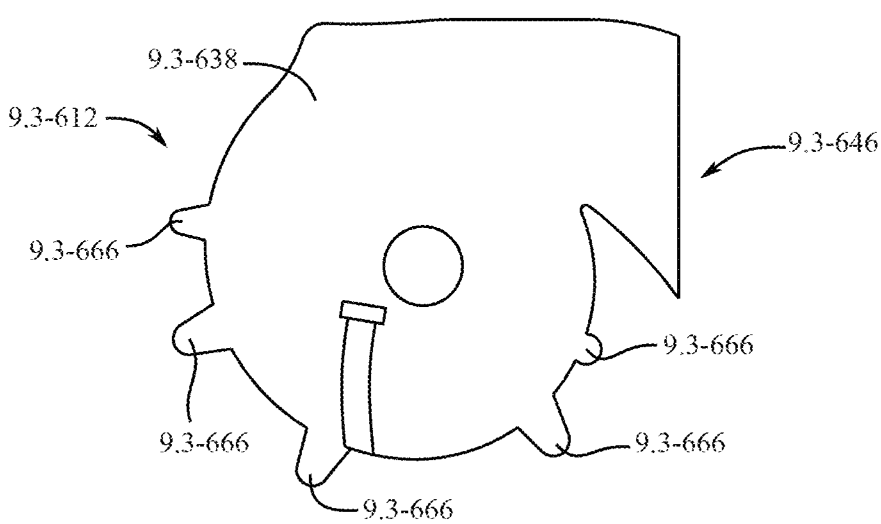
FIG. 9.3-6

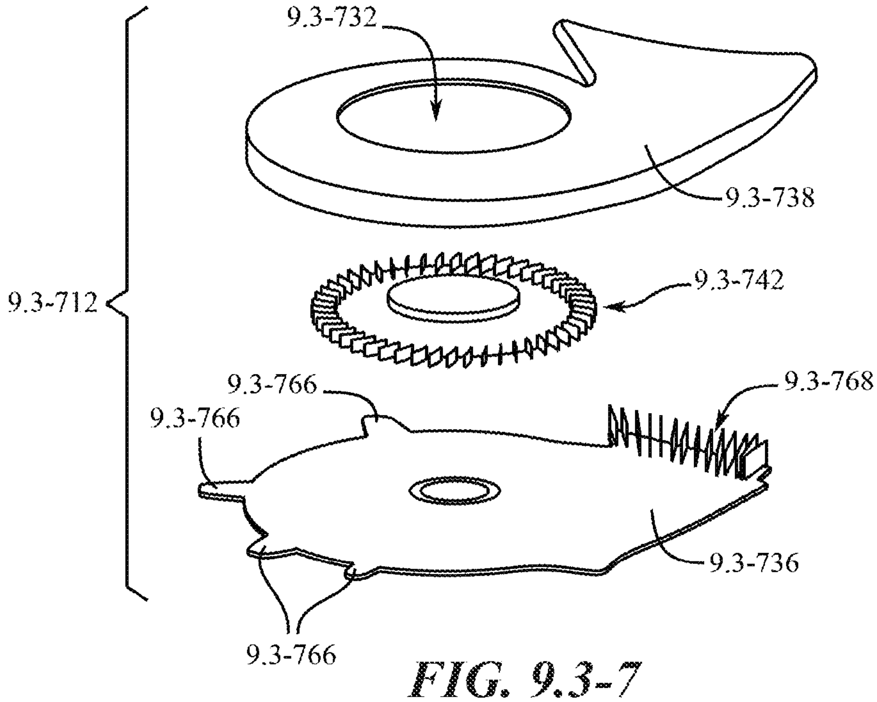
*FIG. 9.3-7*
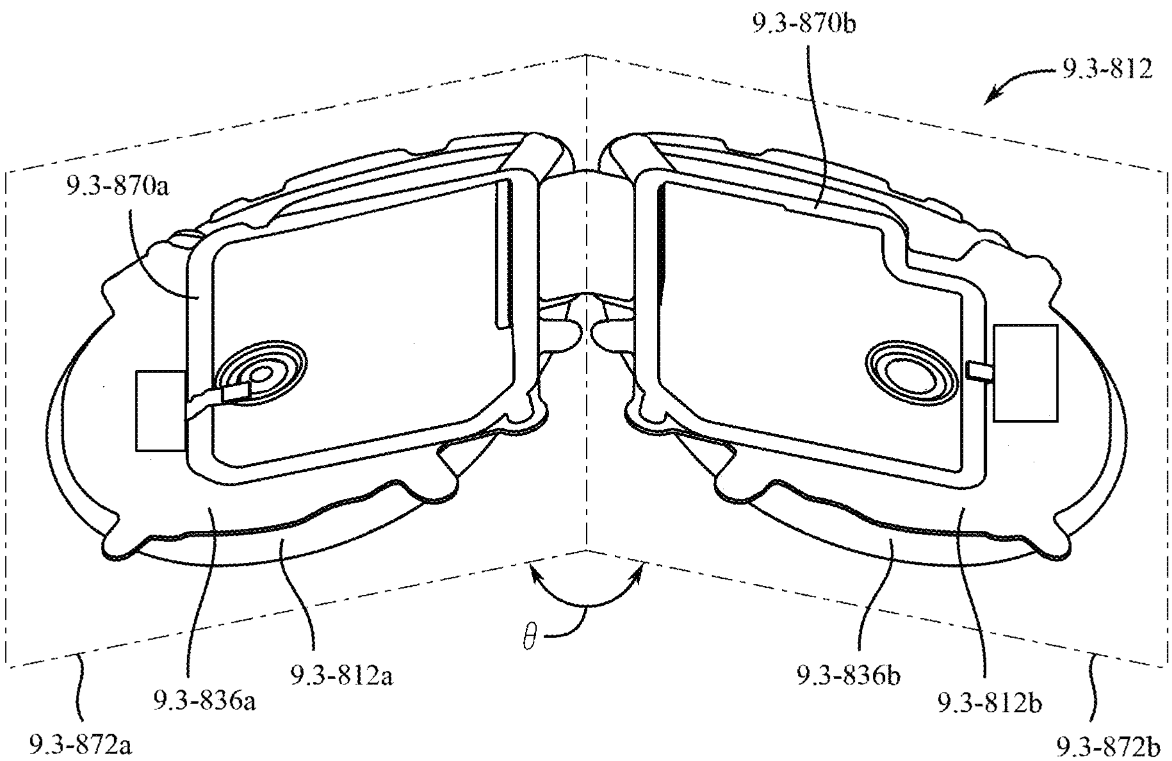
*FIG. 9.3-8*

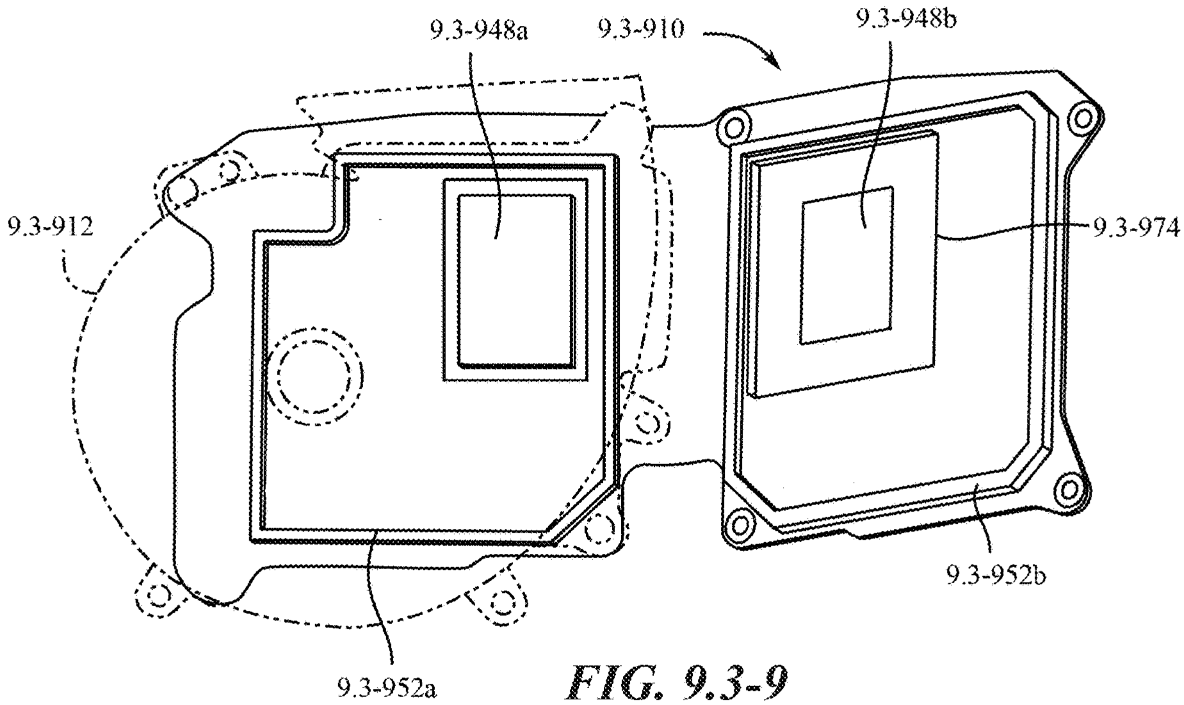
*FIG. 9.3-9*
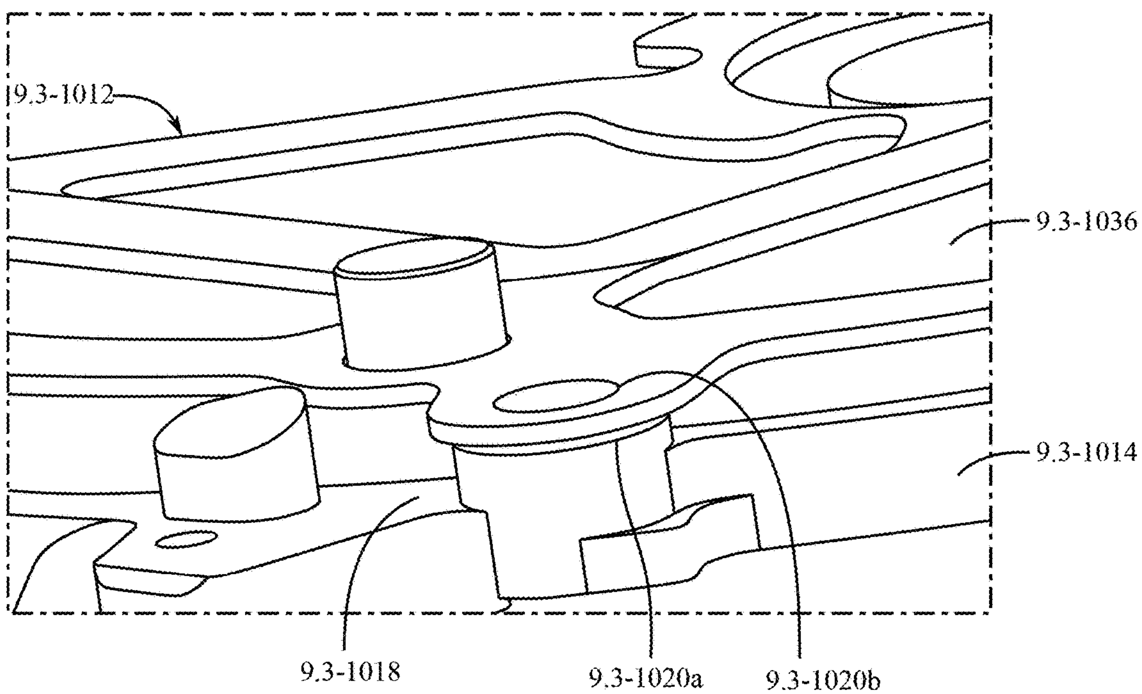
*FIG. 9.3-10*

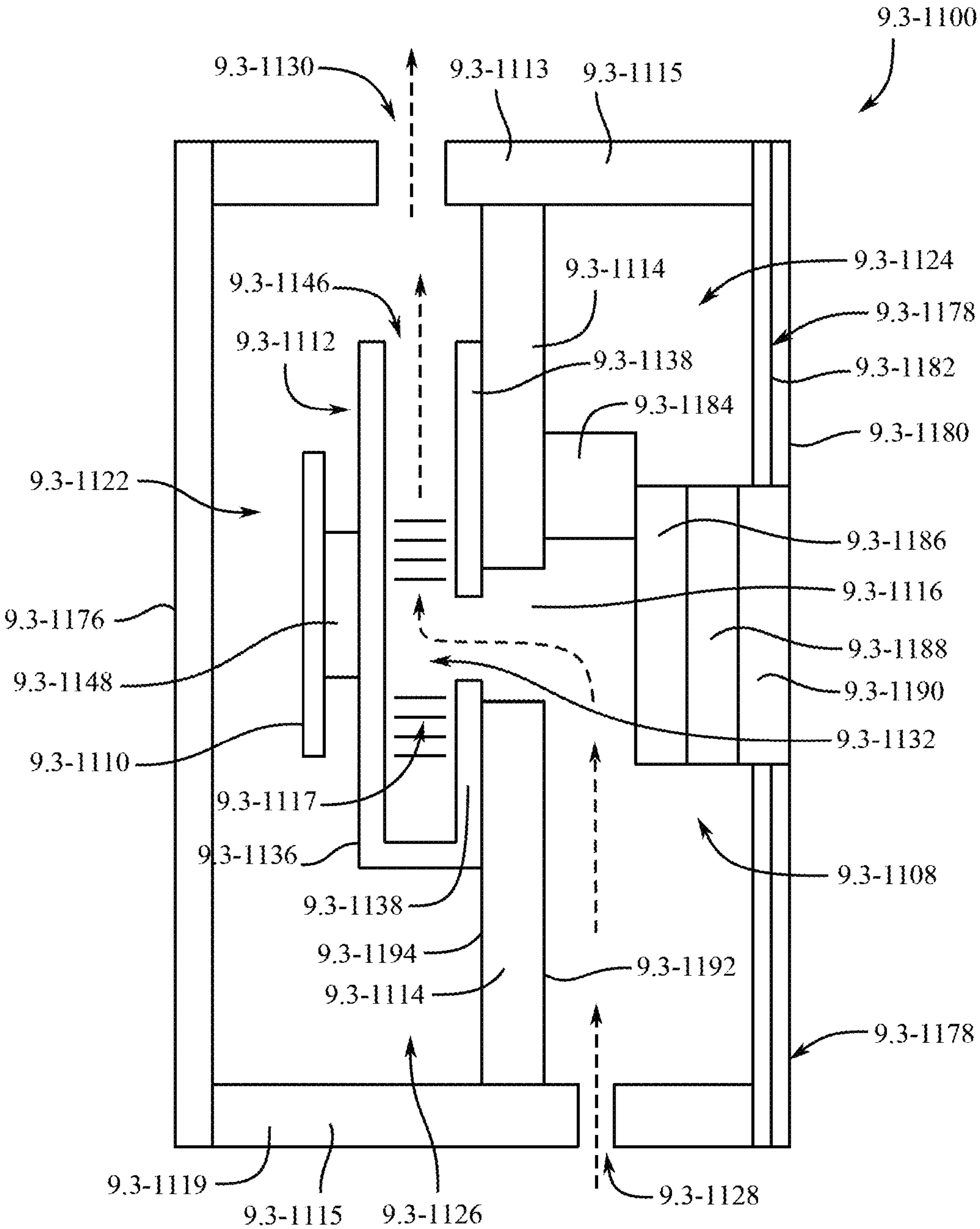
*FIG. 9.3-11*

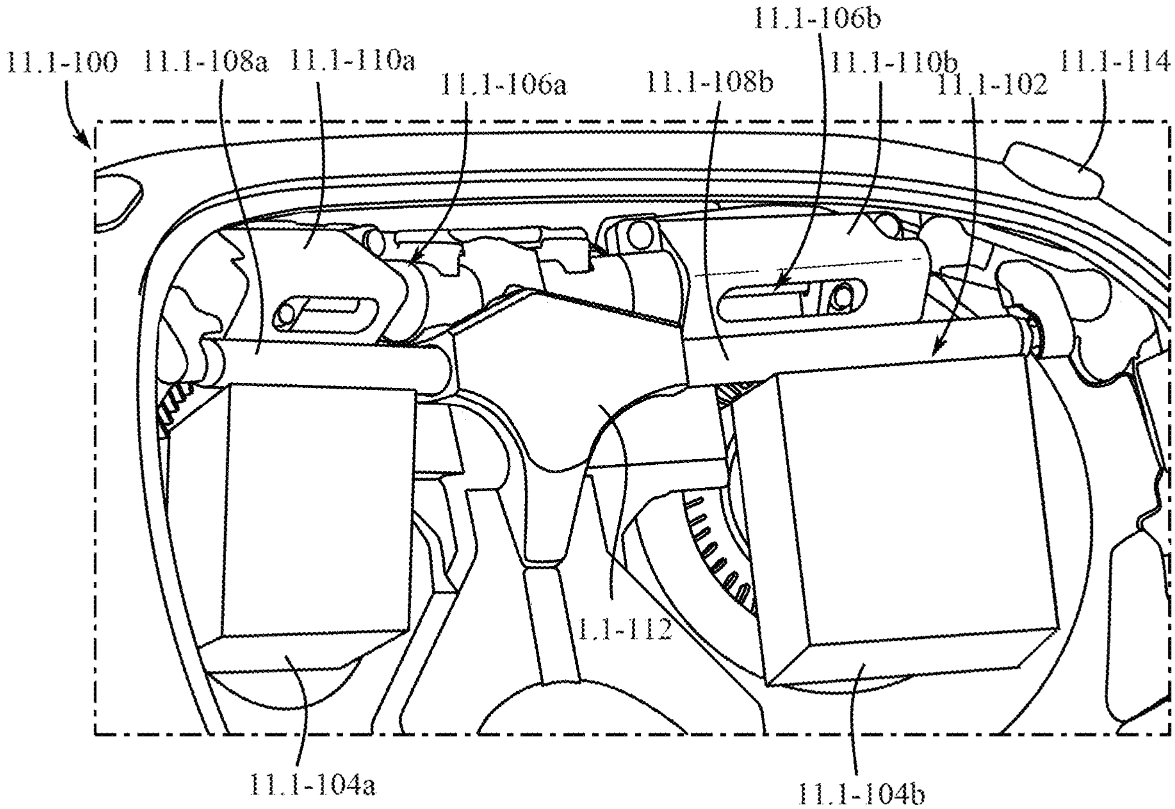
*FIG. 11.1-1*

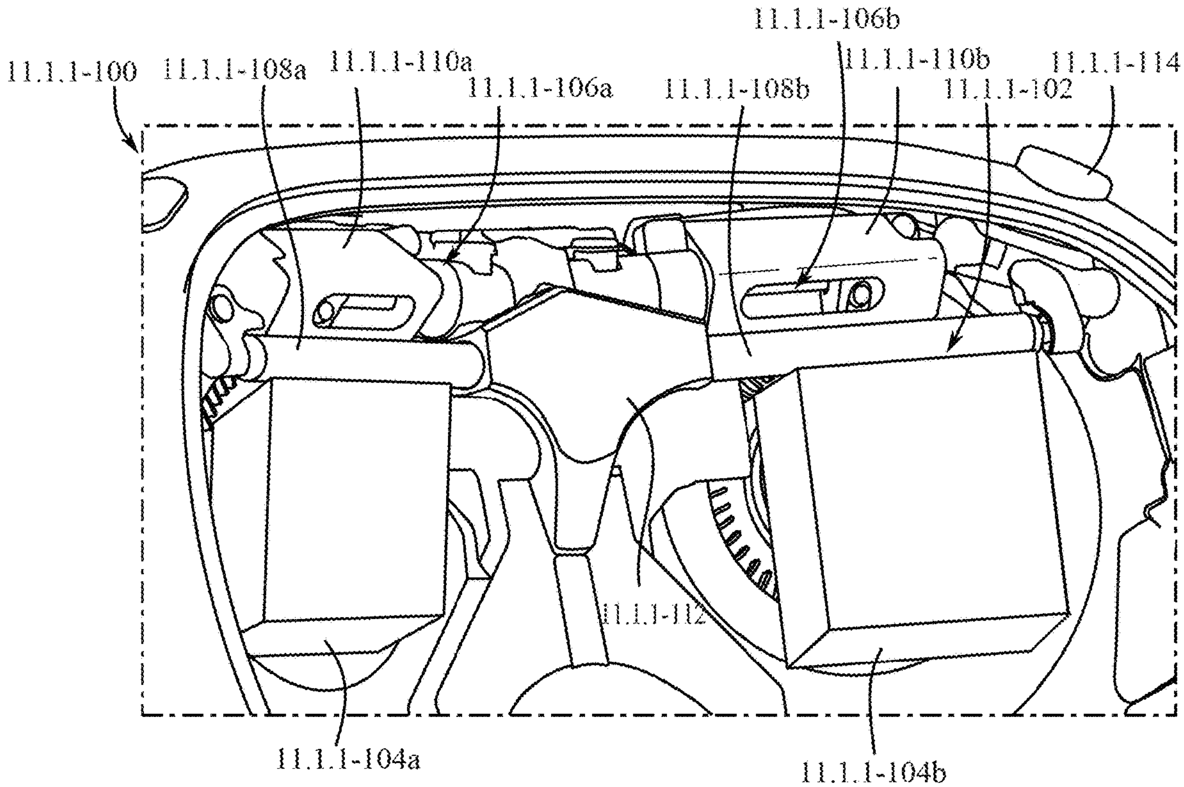
FIG. 11.1.1-1

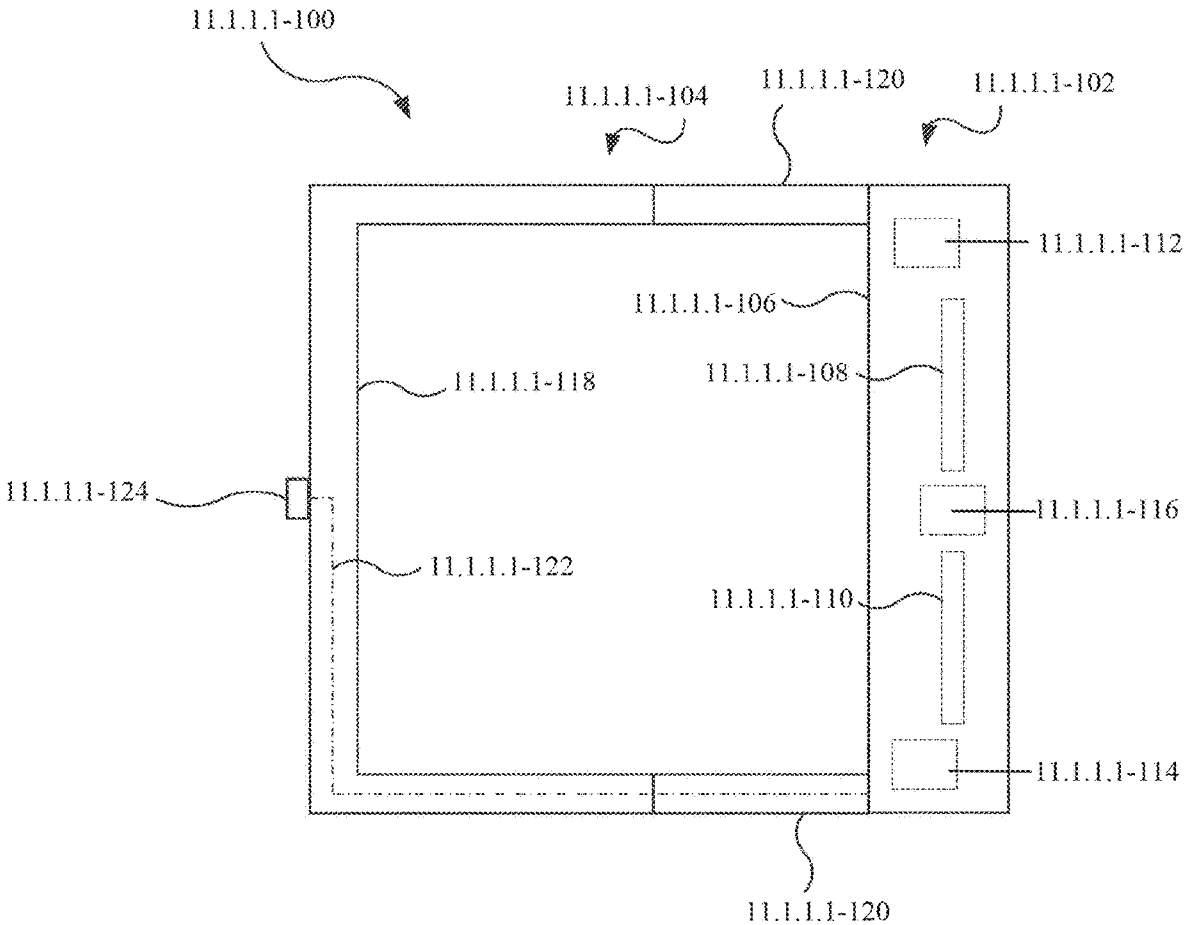
*FIG. 11.1.1.1-1*

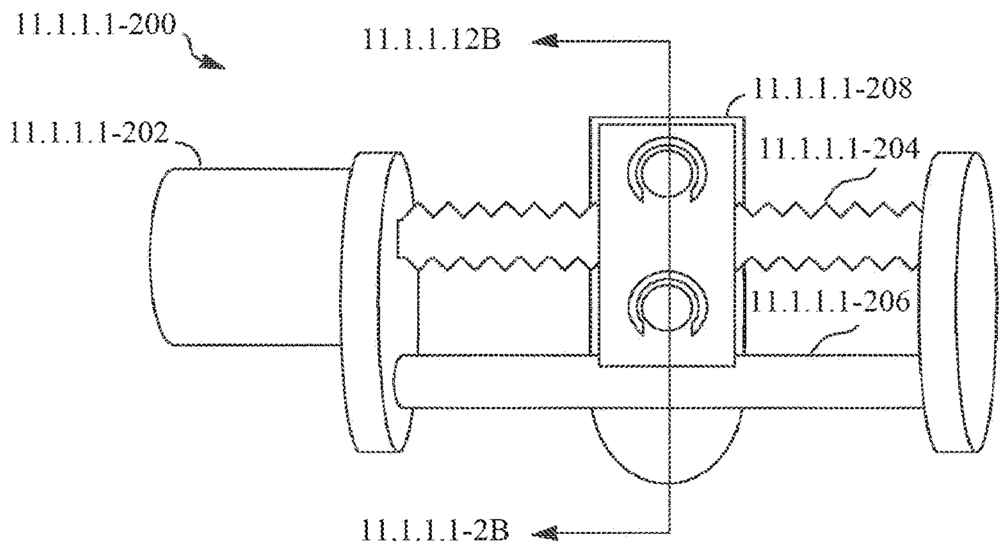
*FIG. 11.1.1.1-2A*
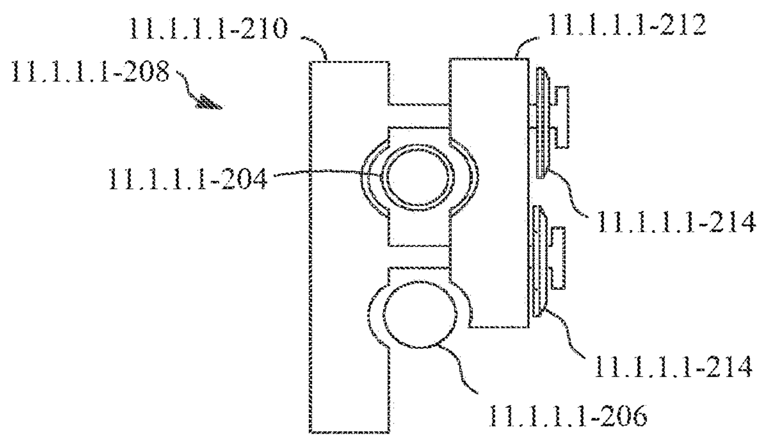
*FIG. 11.1.1.1-2B*

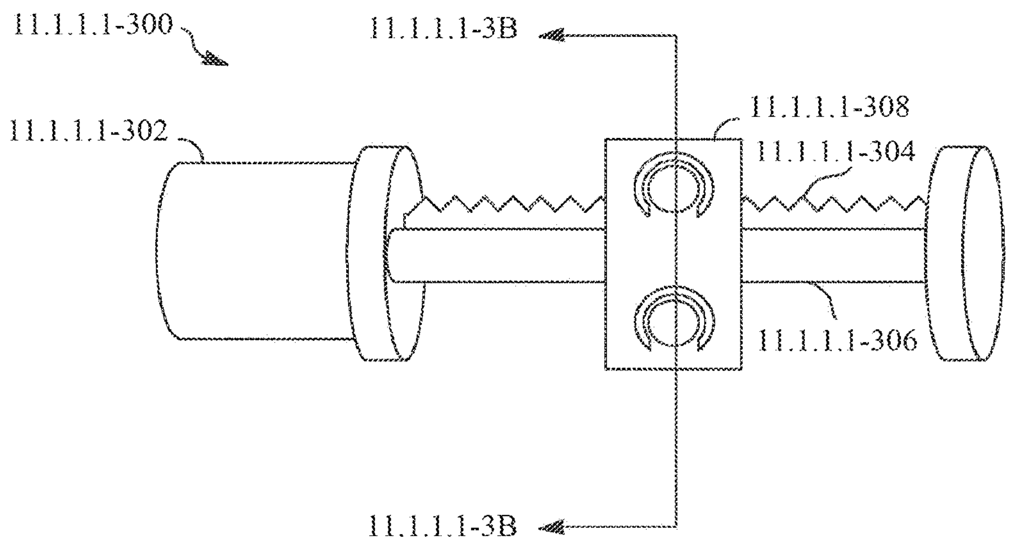
*FIG. 11.1.1.1-3A*
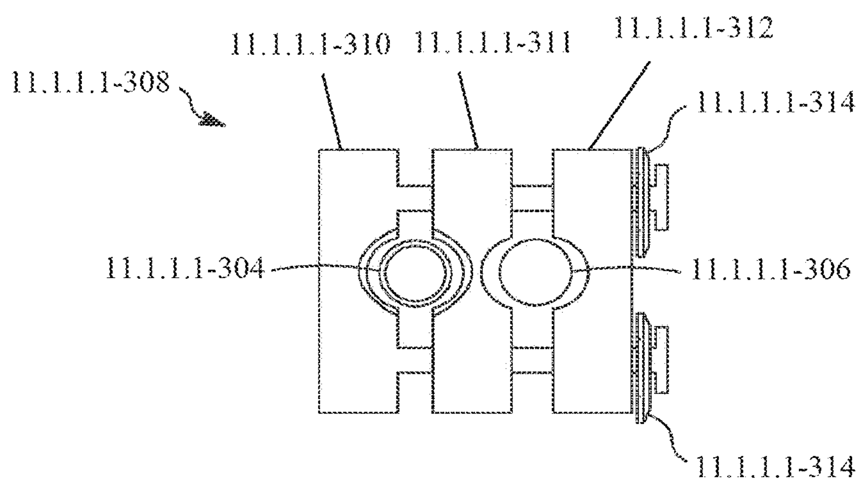
*FIG. 11.1.1.1-3B*

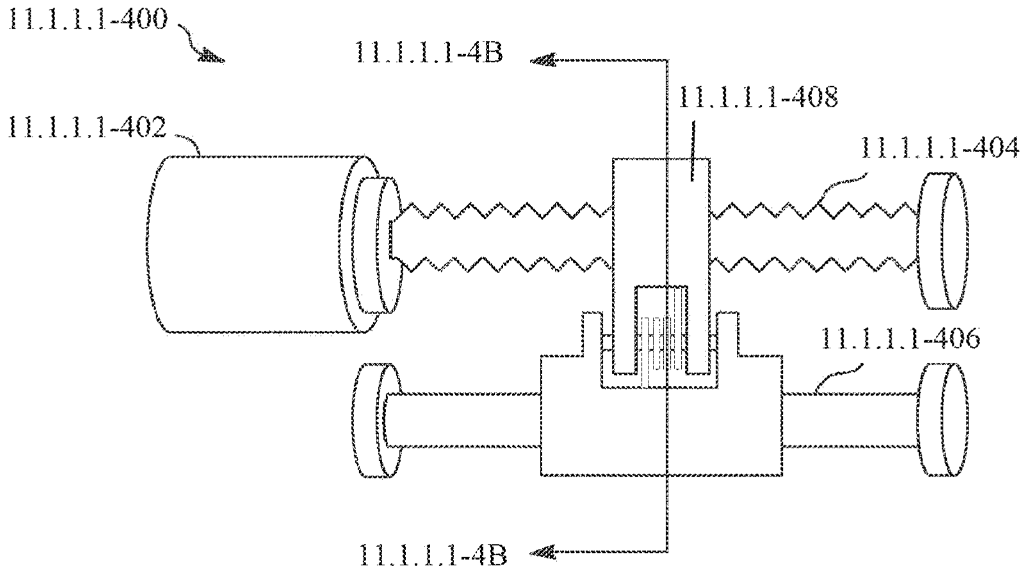
*FIG. 11.1.1.1-4A*
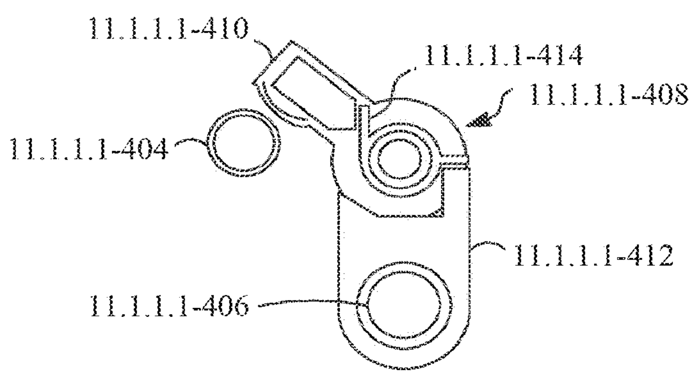
*FIG. 11.1.1.1-4B*

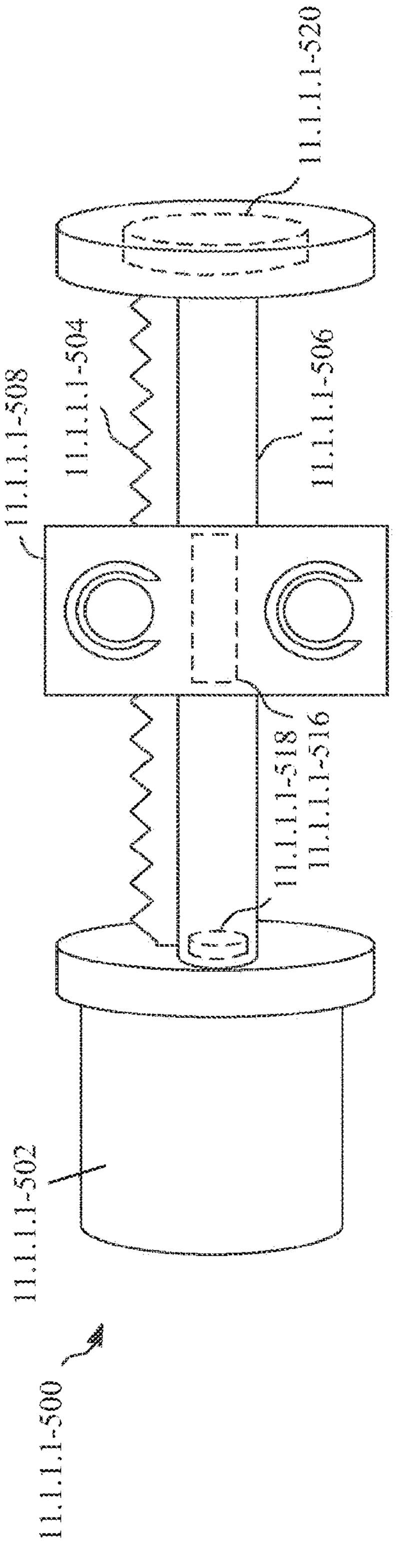
FIG. 11.1.1.1-5A
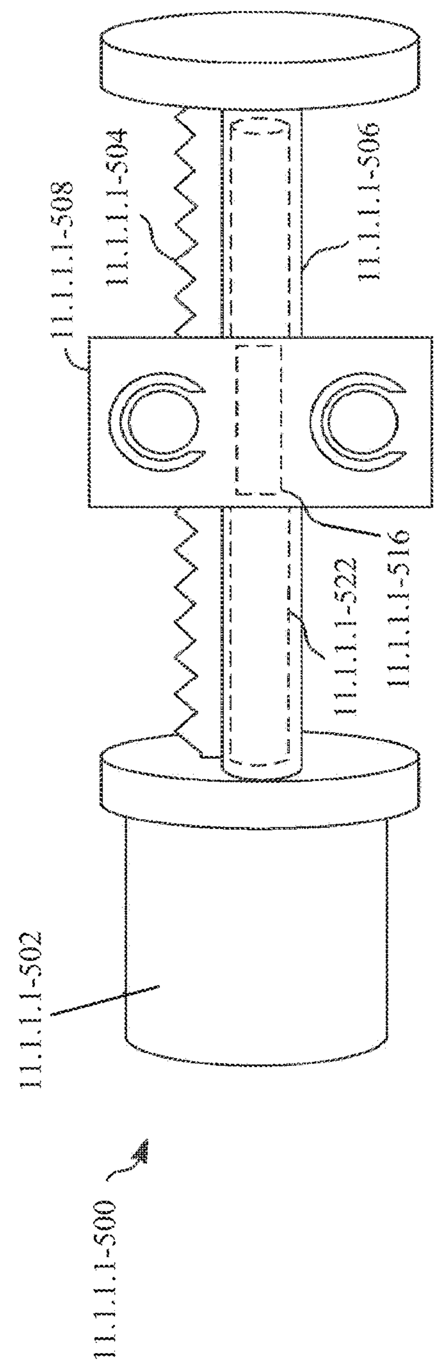
FIG. 11.1.1.1-5B

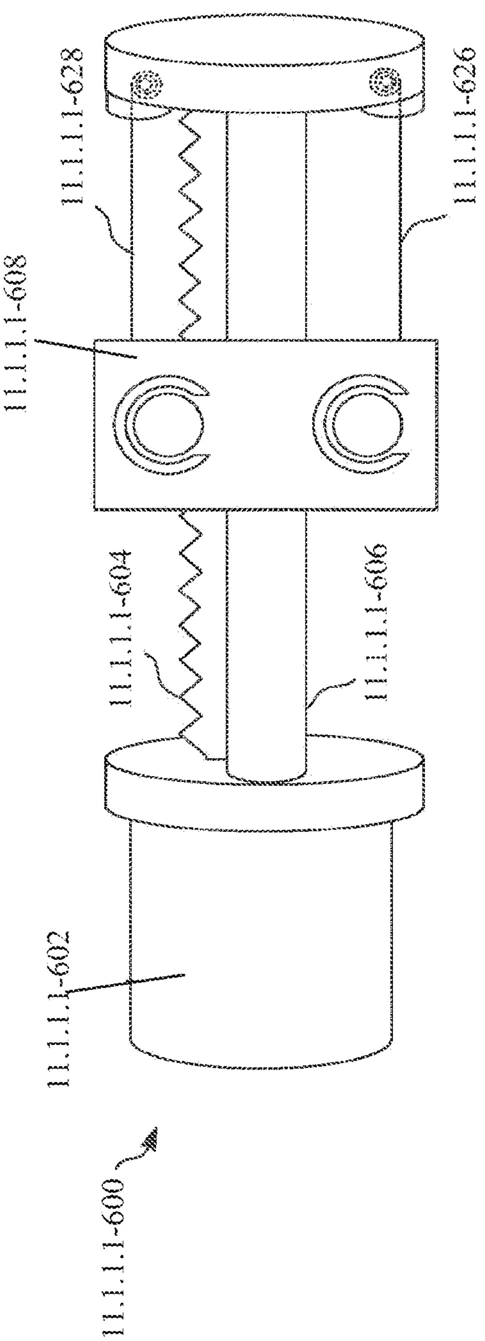
*FIG. 11.1.1.1-6A*
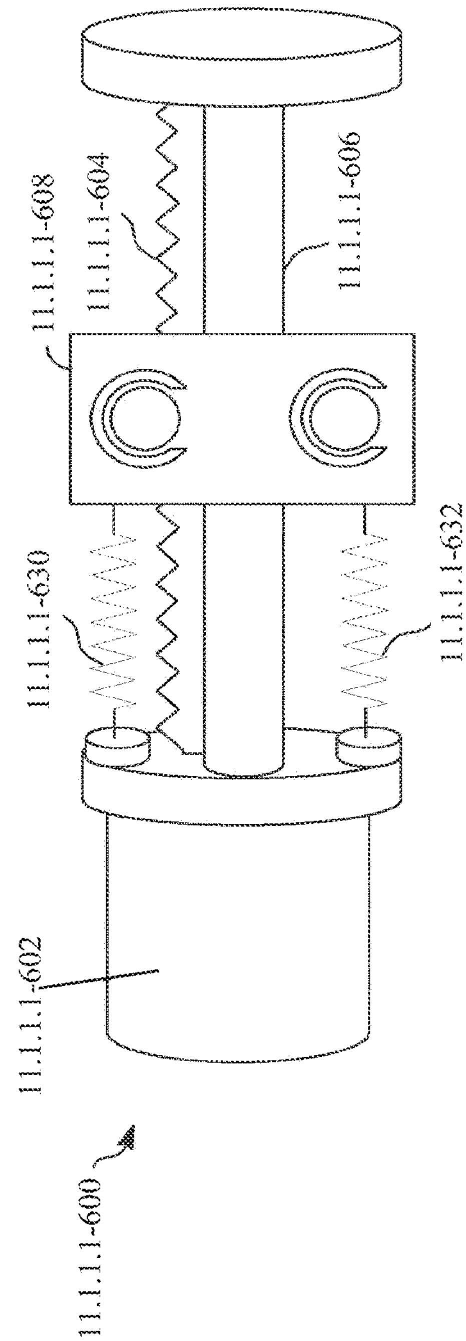
*FIG. 11.1.1.1-6B*

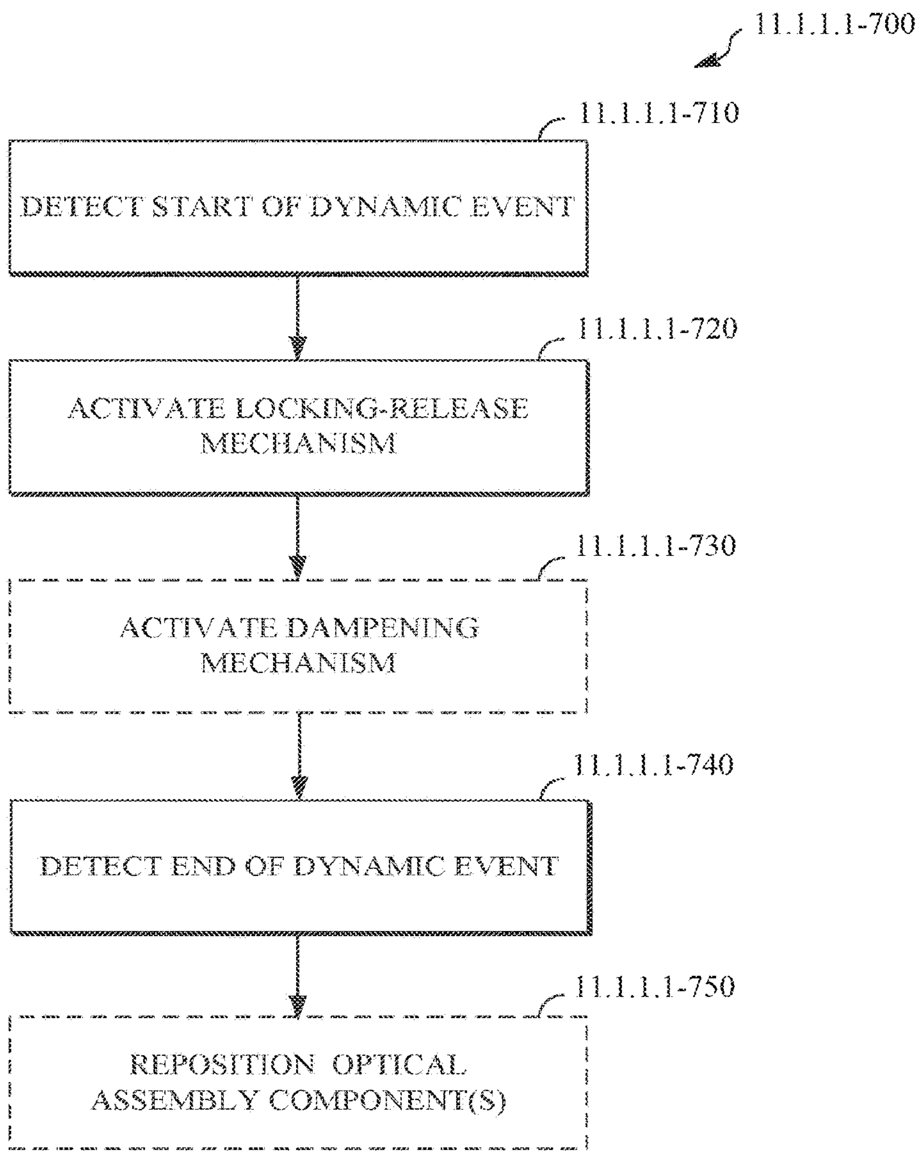
*FIG. 11.1.1.1-7*

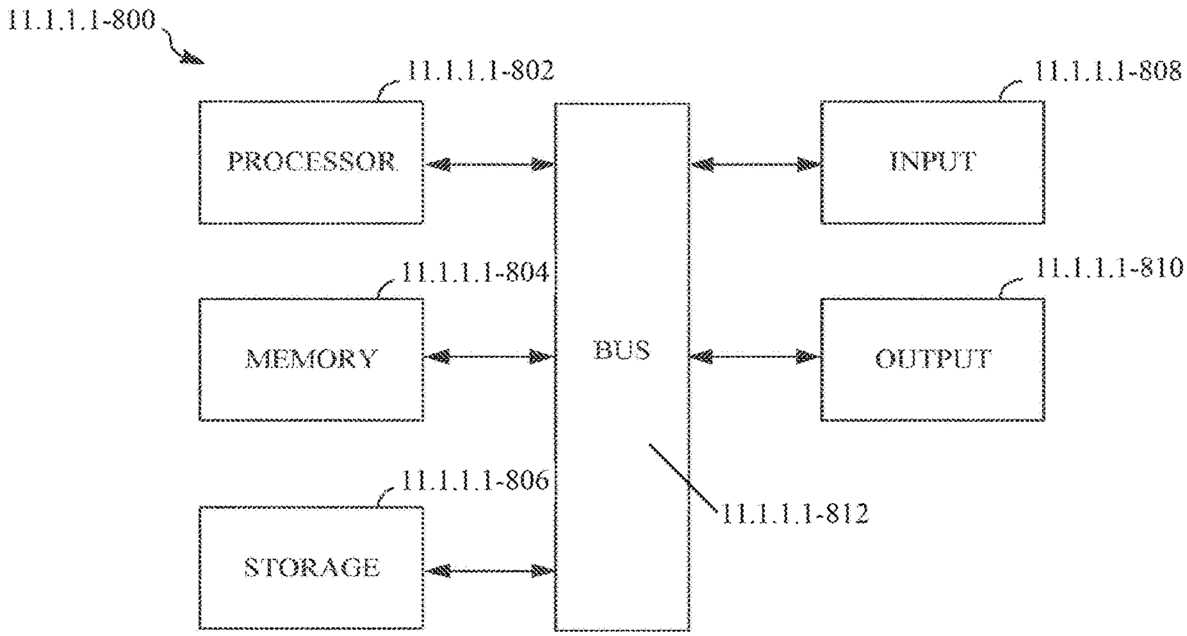
*FIG. 11.1.1.1-8*

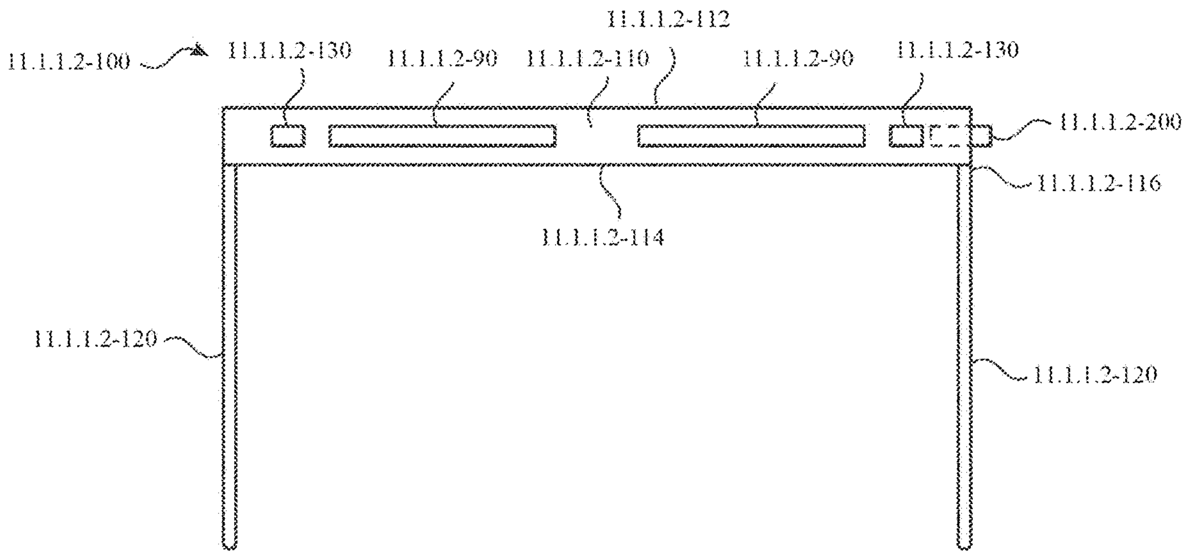
*FIG. 11.1.1.2-1*
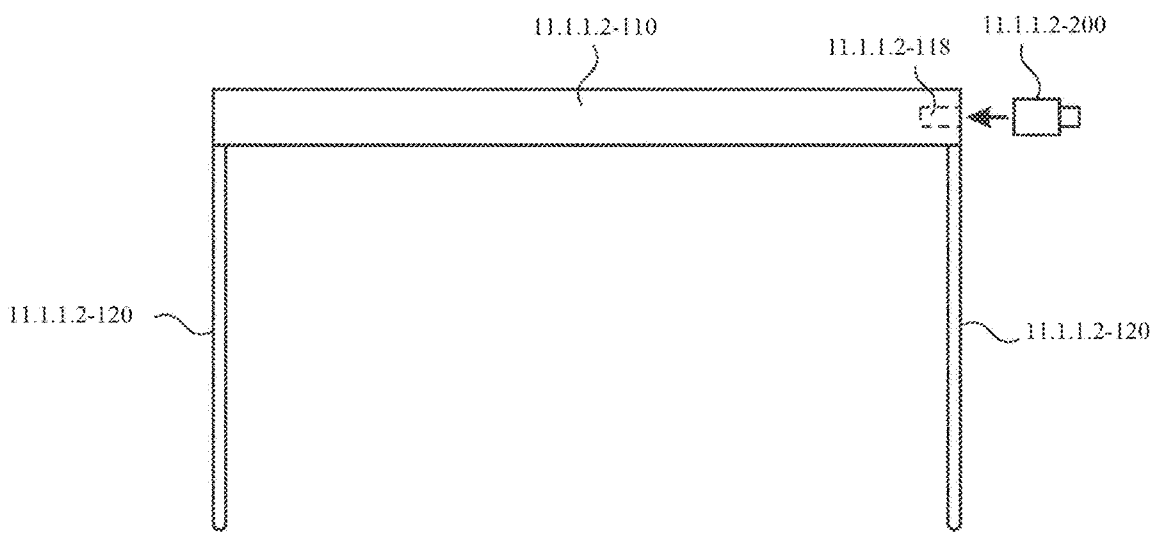
*FIG. 11.1.1.2-2*

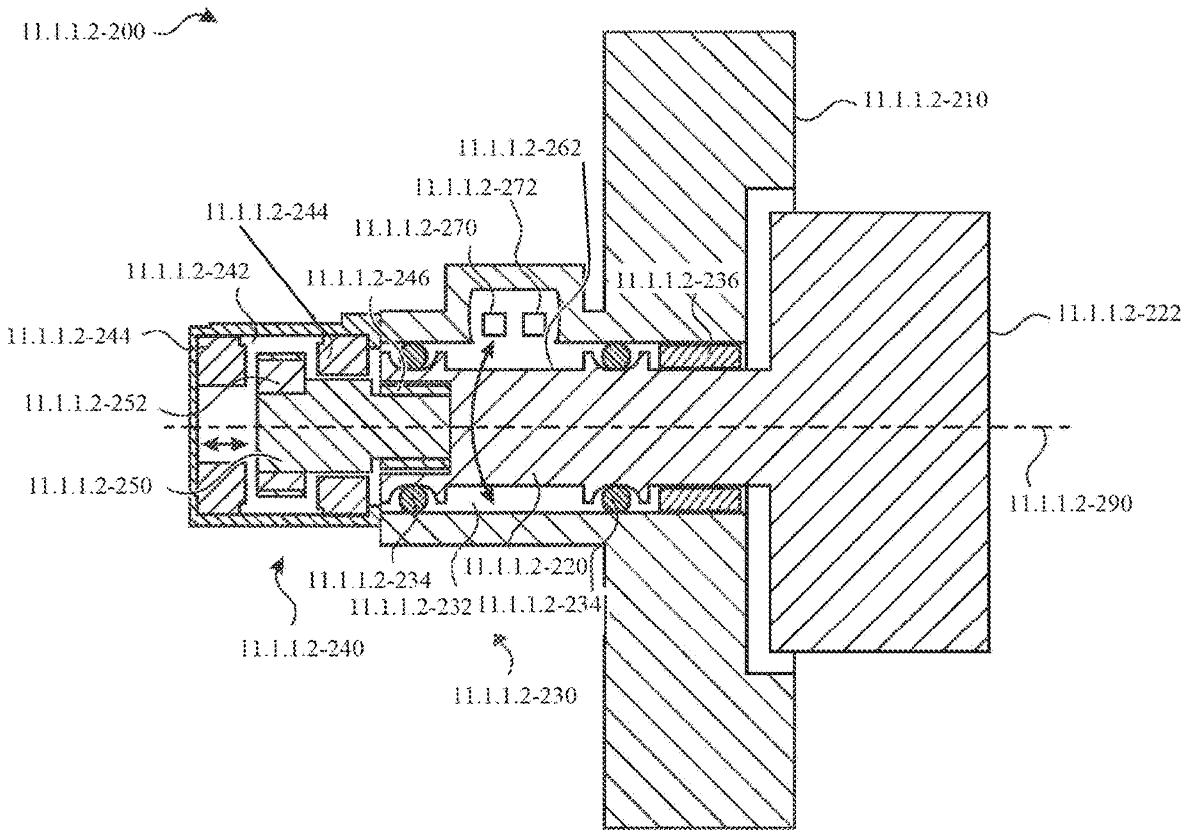
*FIG. 11.1.1.2-3*

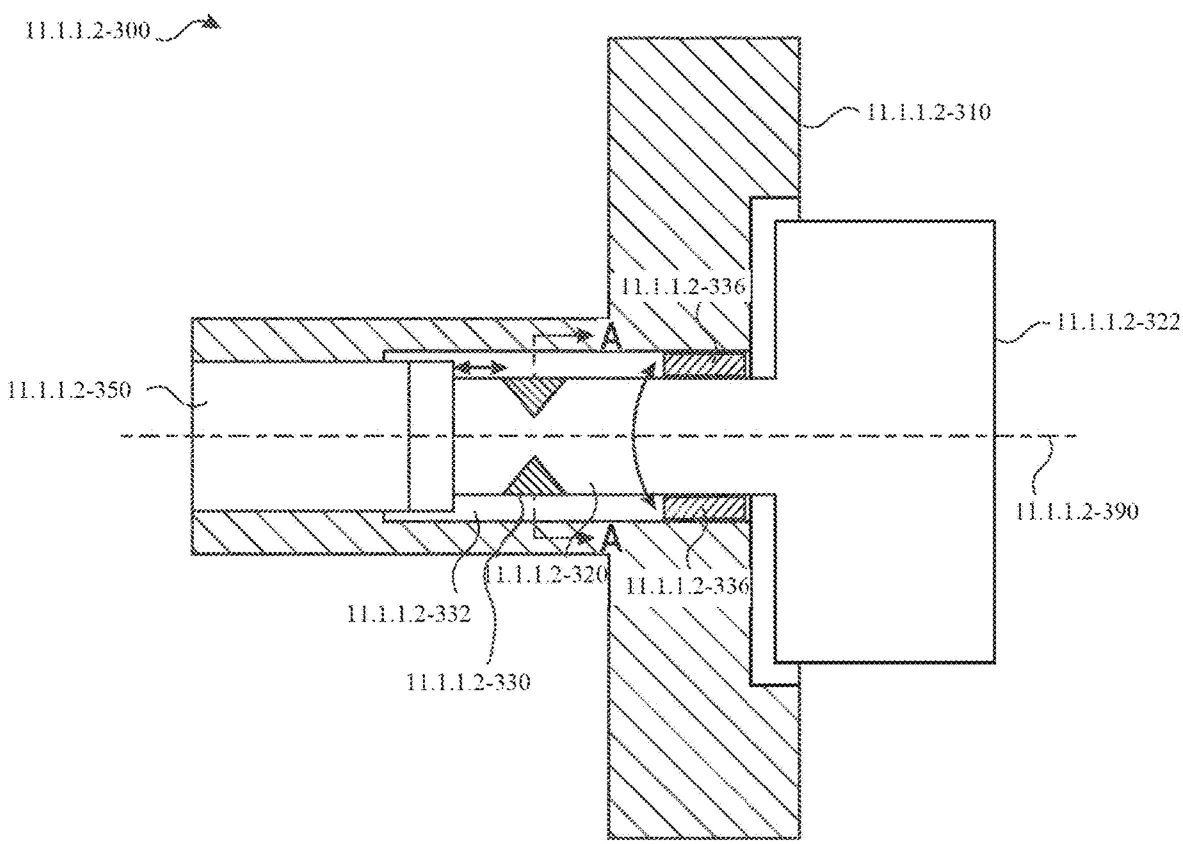
FIG. 11.1.1.2-4

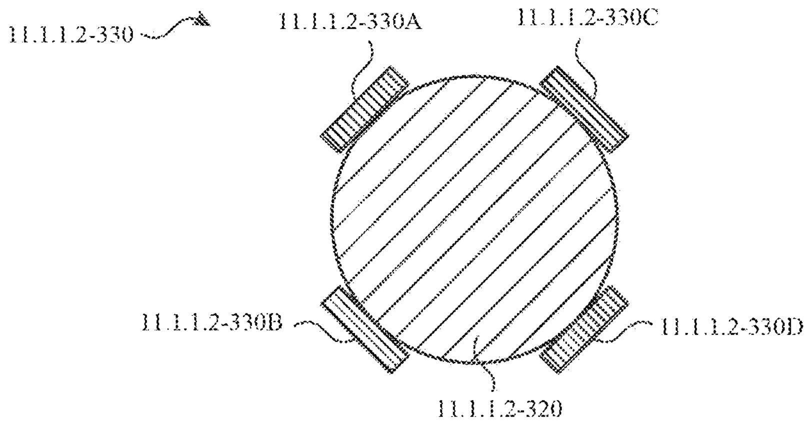
FIG. 11.1.1.2-5
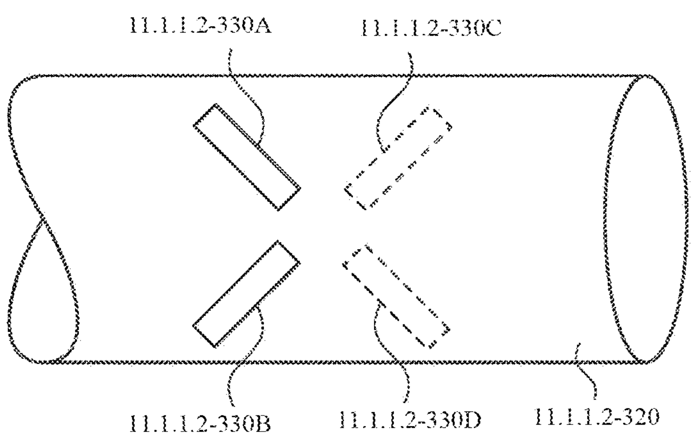
FIG. 11.1.1.2-6
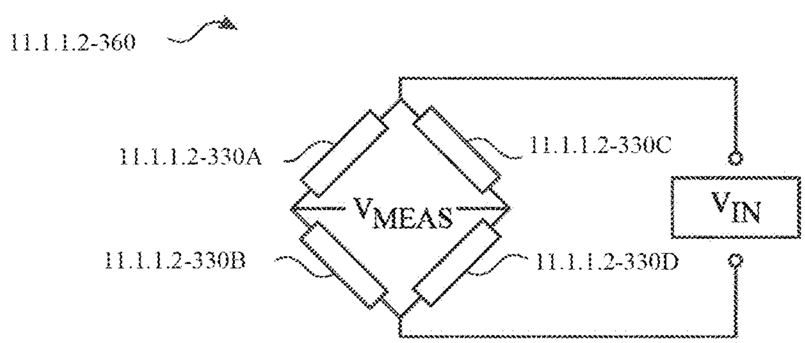
FIG. 11.1.1.2-7

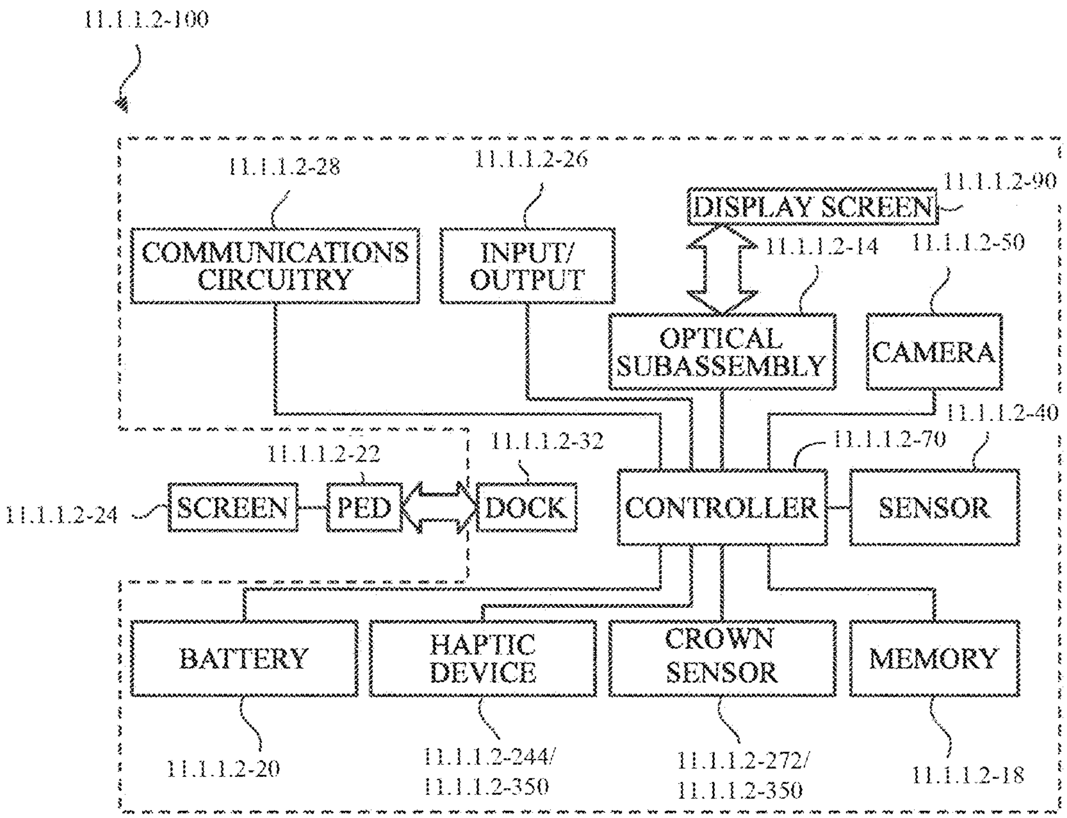
*FIG. 11.1.1.2-8*

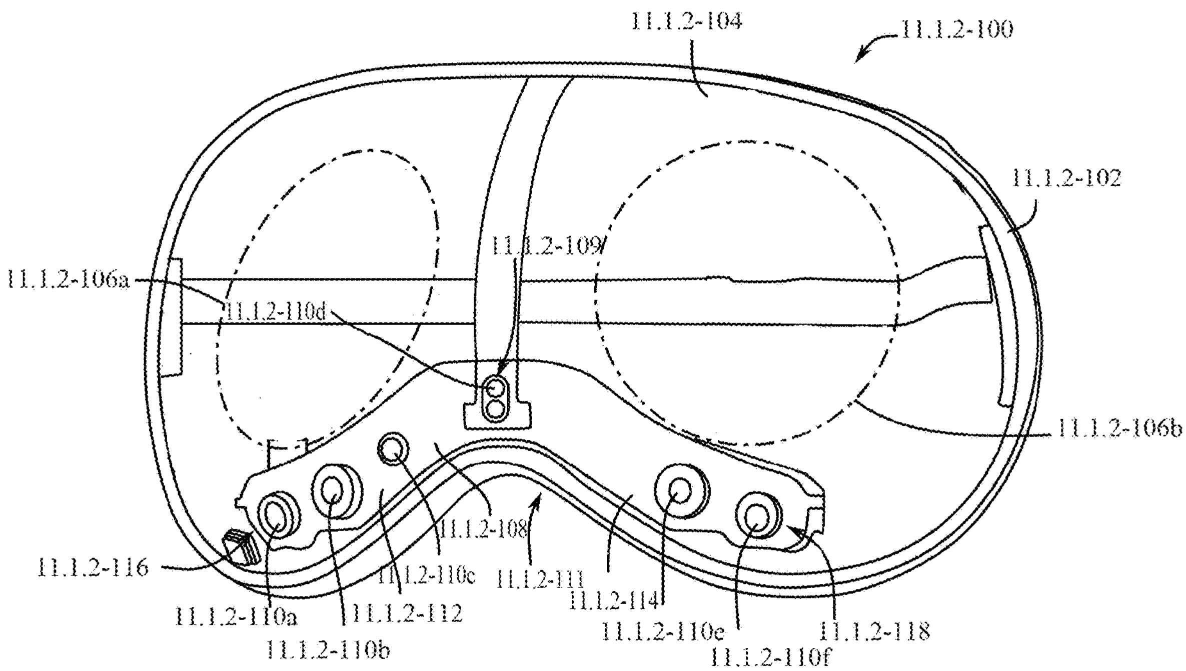
*FIG. 11.1.2-1*
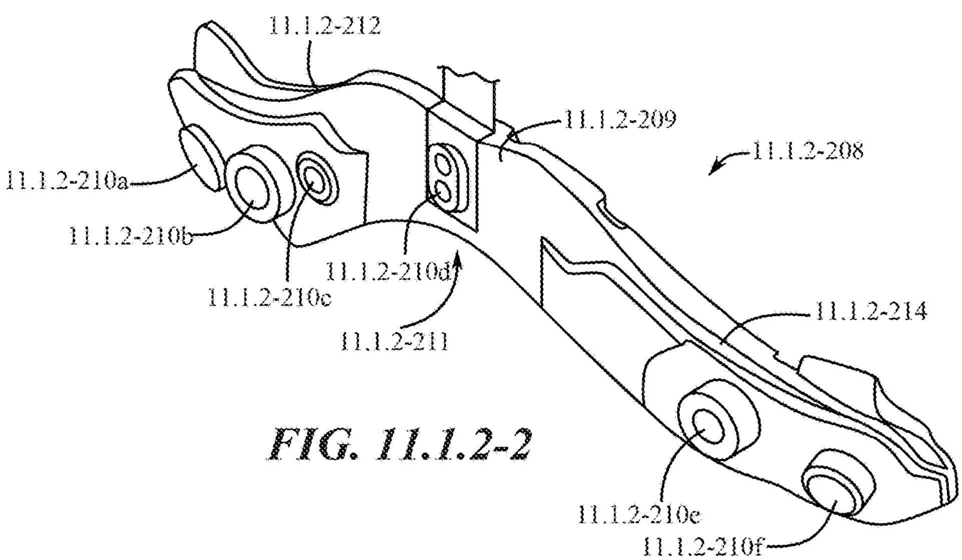
*FIG. 11.1.2-2*

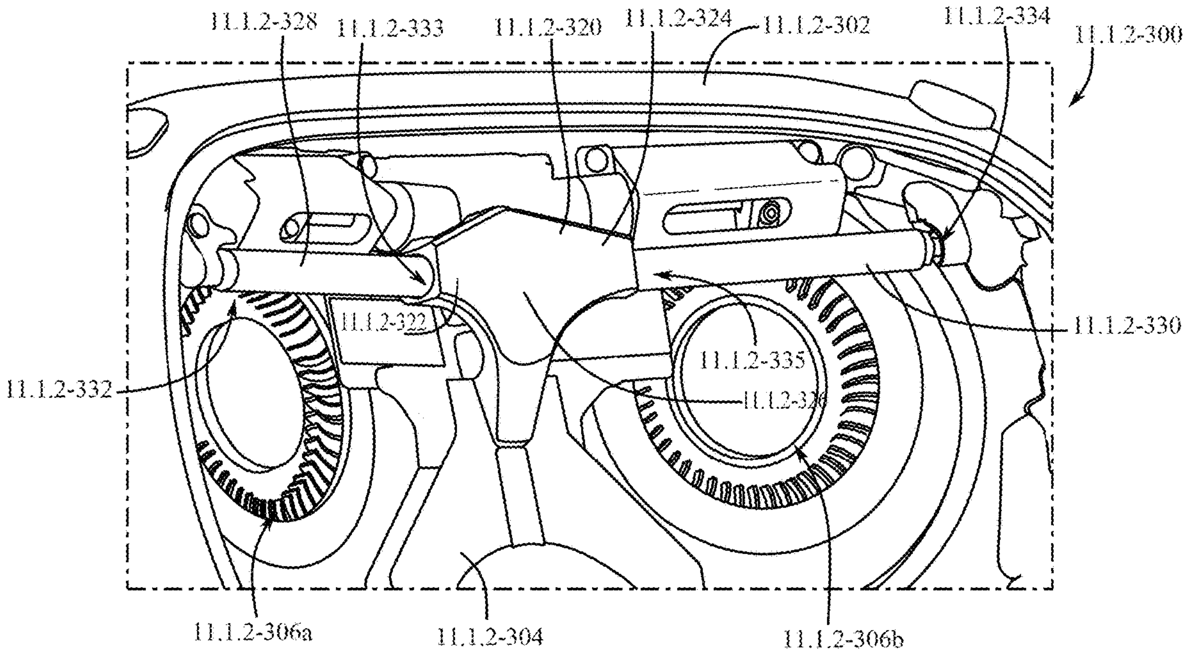
*FIG. 11.1.2-3*
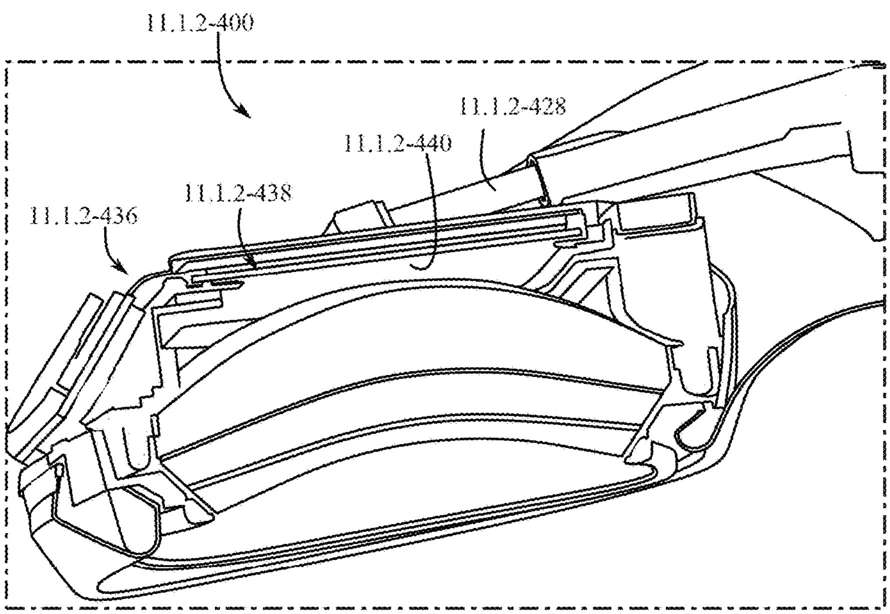
*FIG. 11.1.2-4*

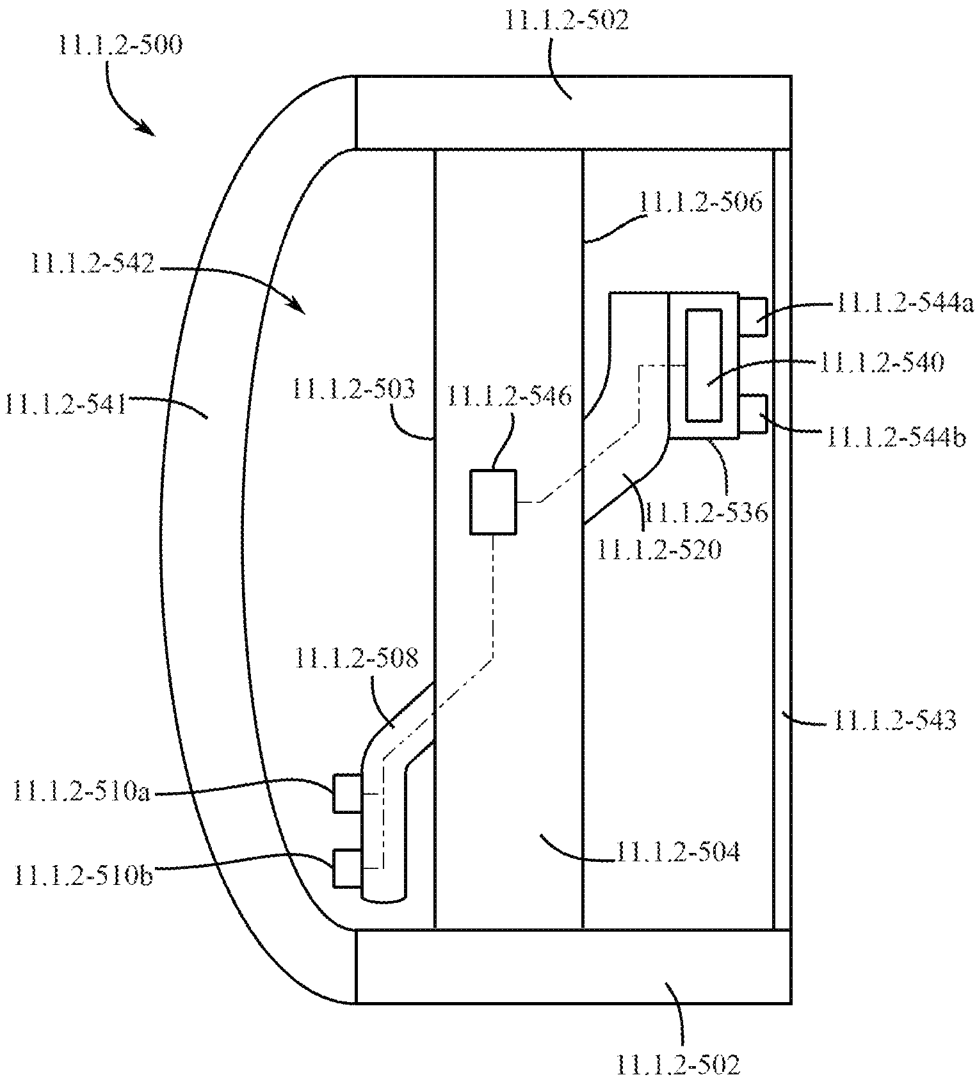
*FIG. 11.1.2-5*

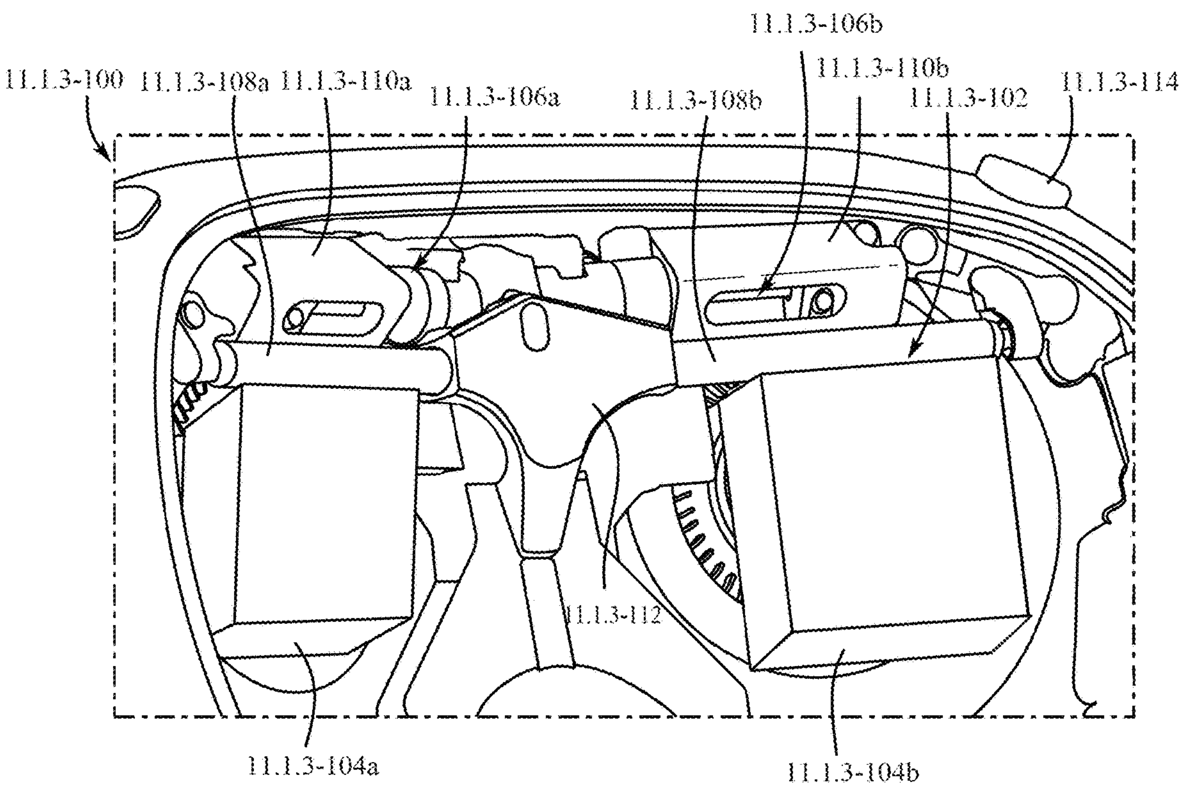
*FIG. 11.1.3-1*

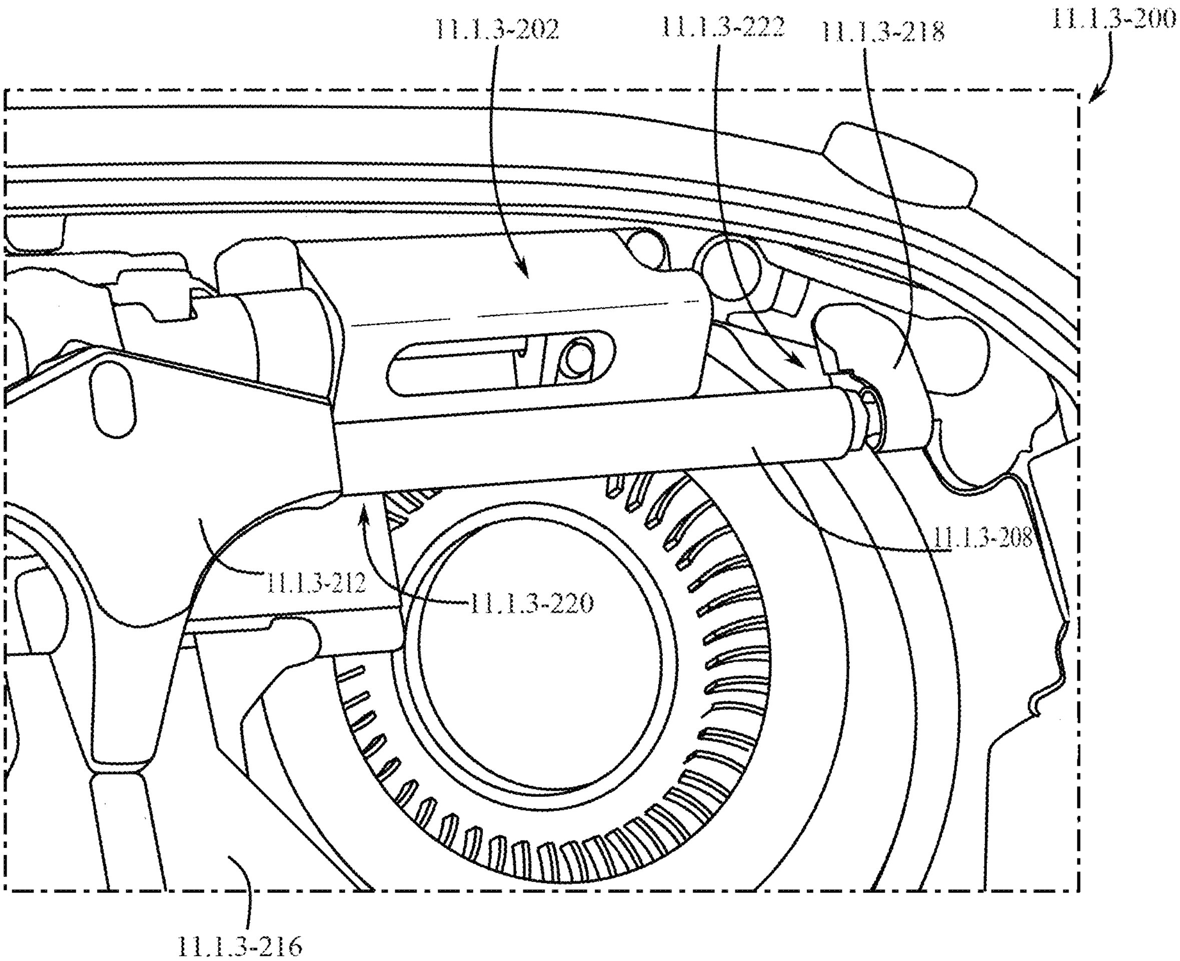
*FIG. 11.1.3-2*

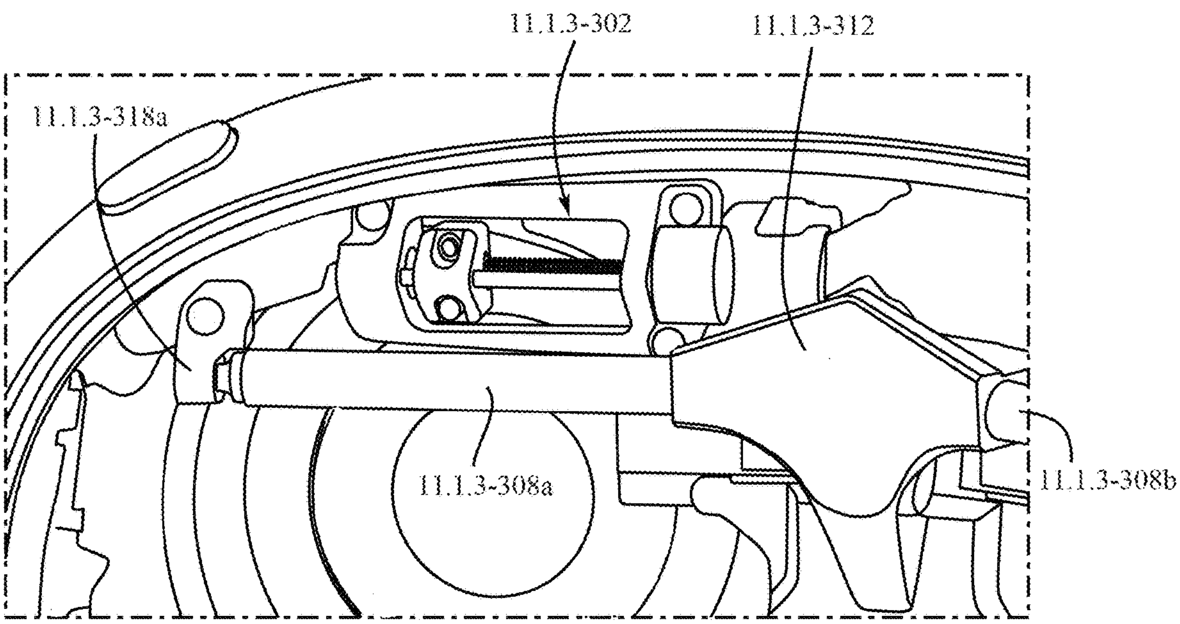
FIG. 11.1.3-3

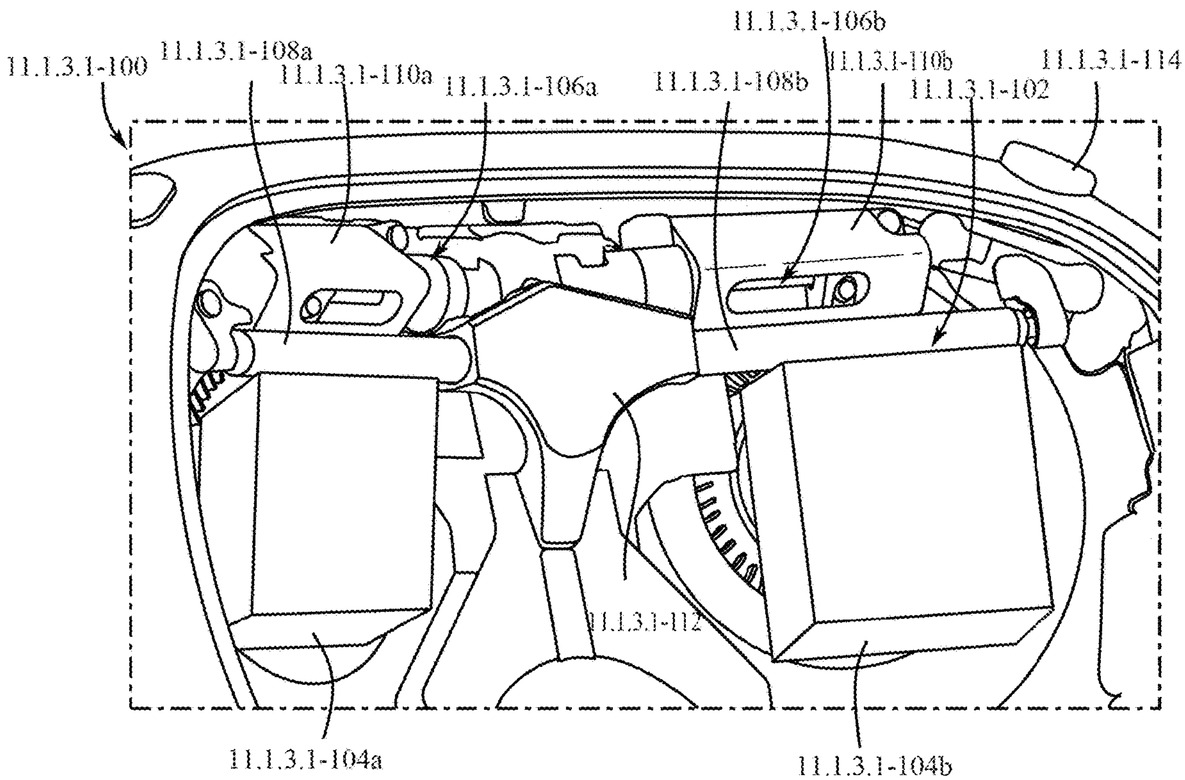
*FIG. 11.1.3.1-1*

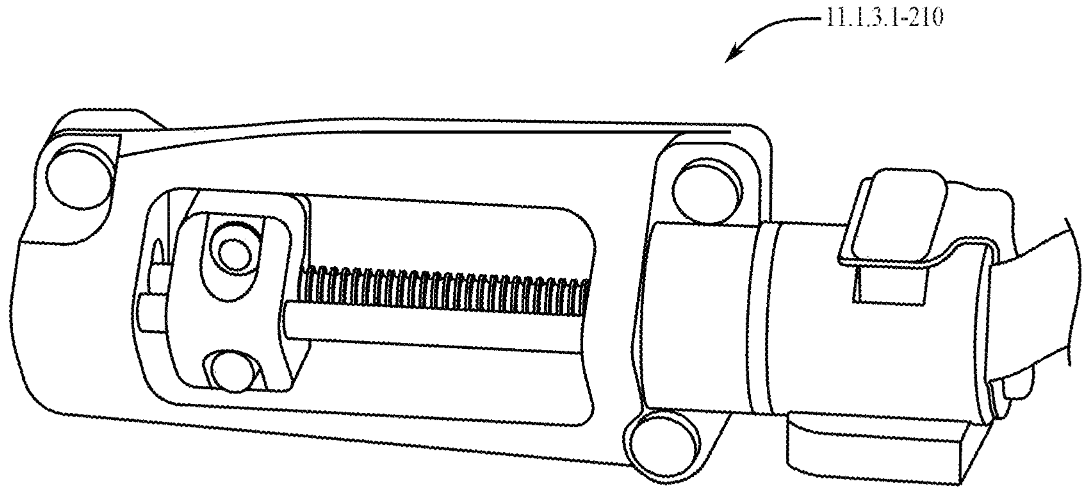
FIG. 11.1.3.1-2
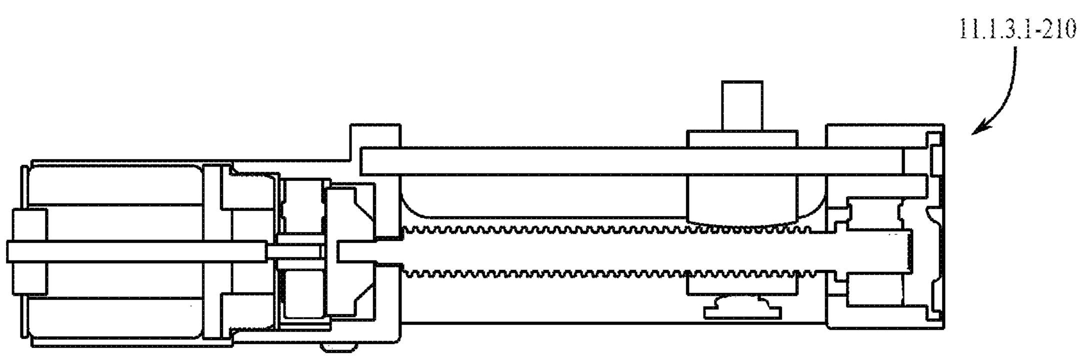
FIG. 11.1.3.1-3

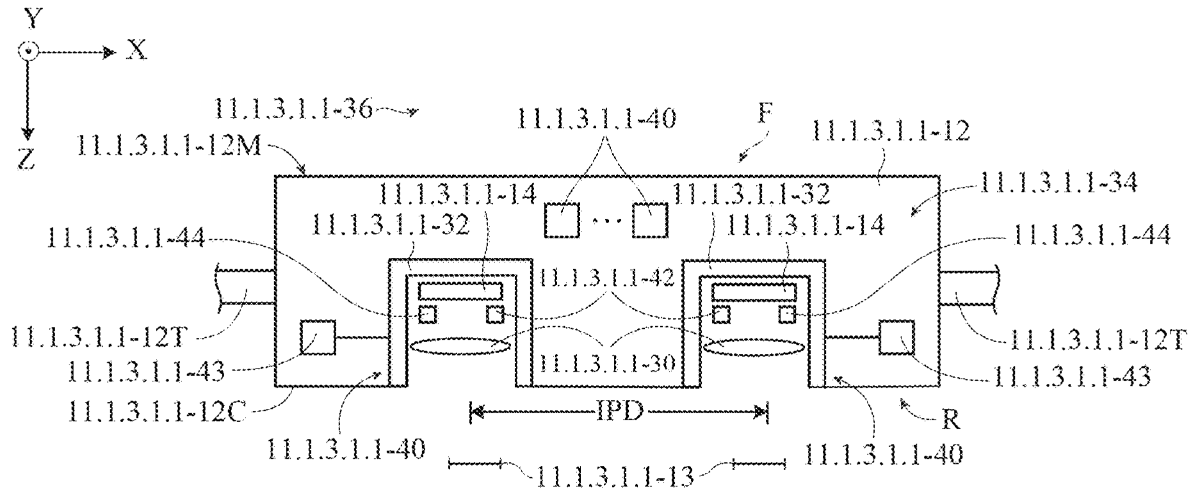
FIG. 11.1.3.1.1-1
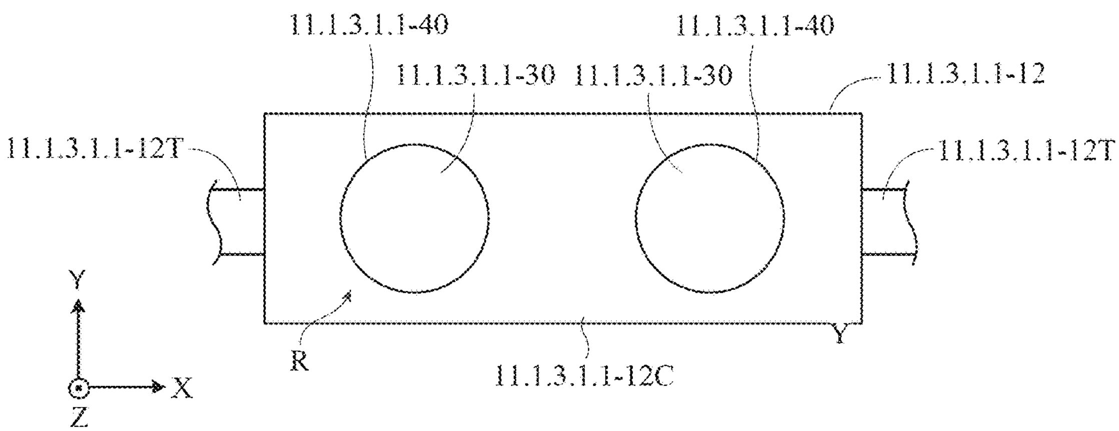
FIG. 11.1.3.1.1-2

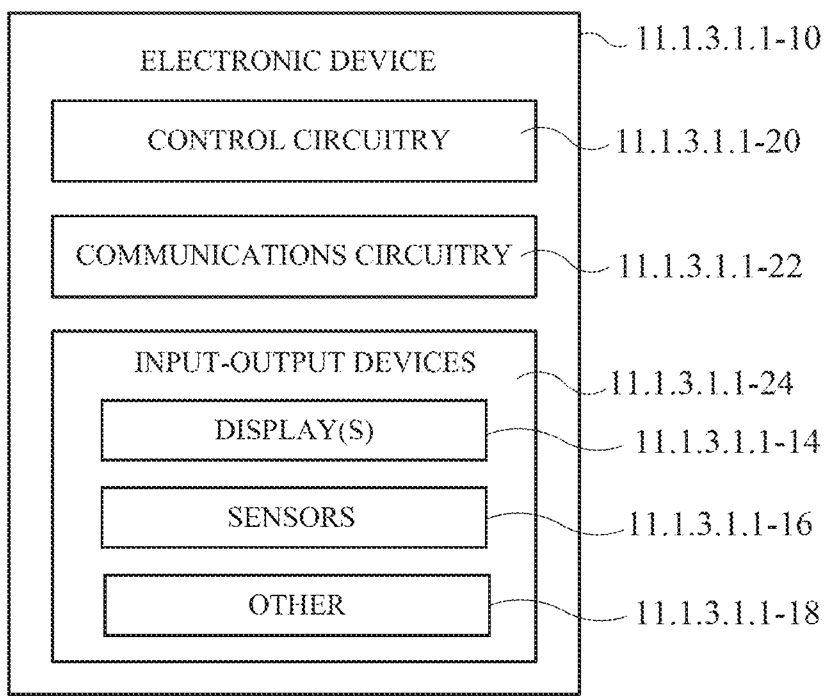
*FIG. 11.1.3.1.1-3*

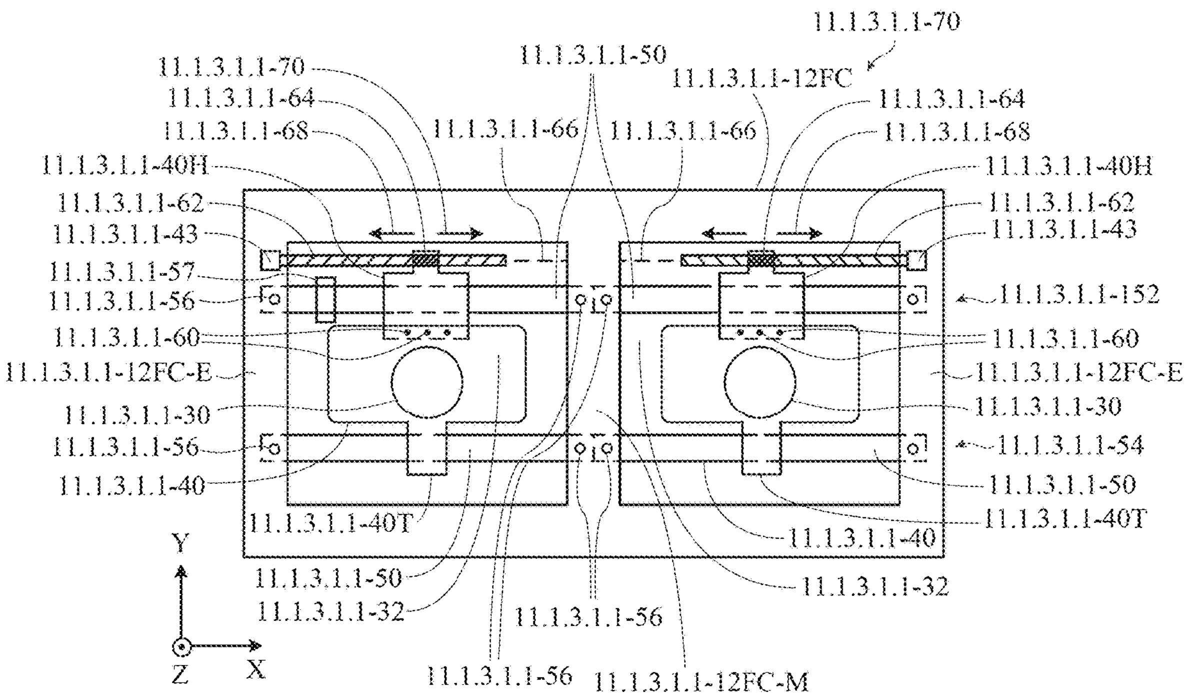
*FIG. 11.1.3.1.1-4*

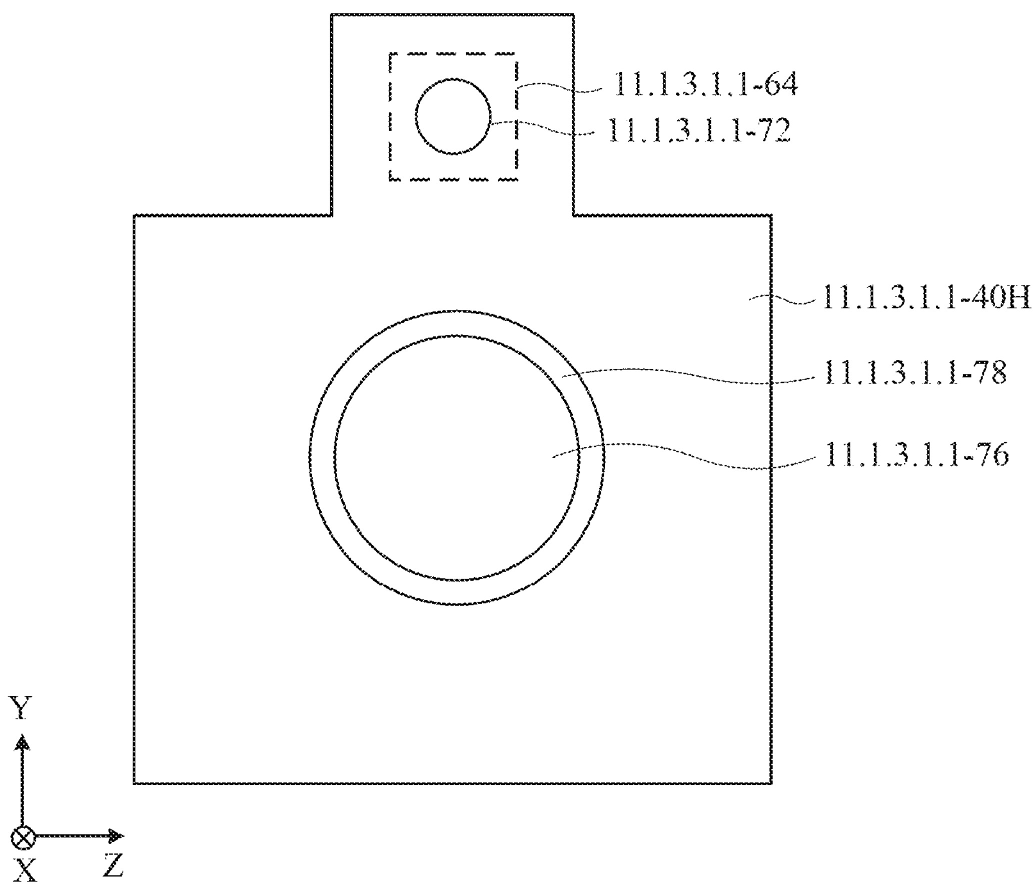
*FIG. 11.1.3.1.1-5*

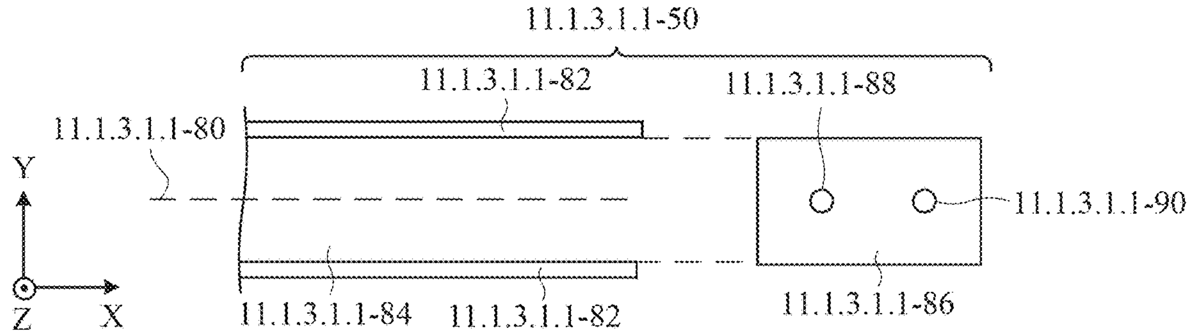
*FIG. 11.1.3.1.1-6*
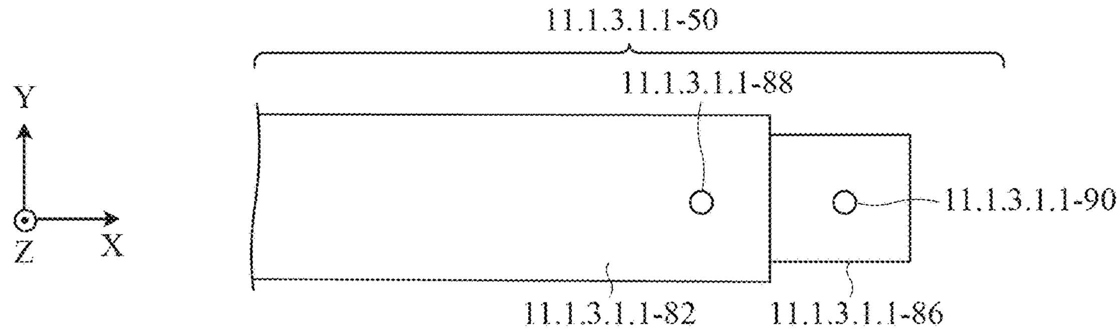
*FIG. 11.1.3.1.1-7*
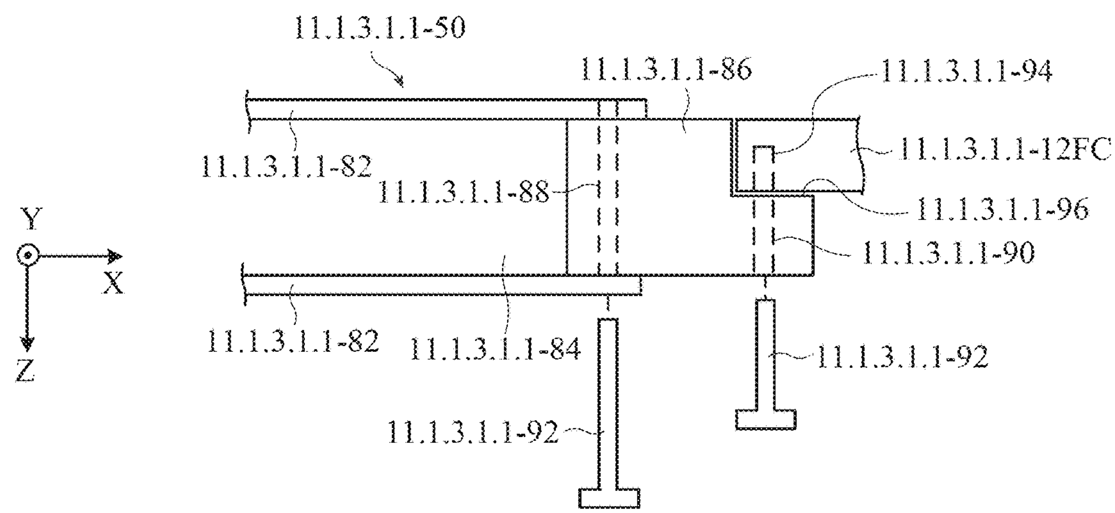
*FIG. 11.1.3.1.1-8*

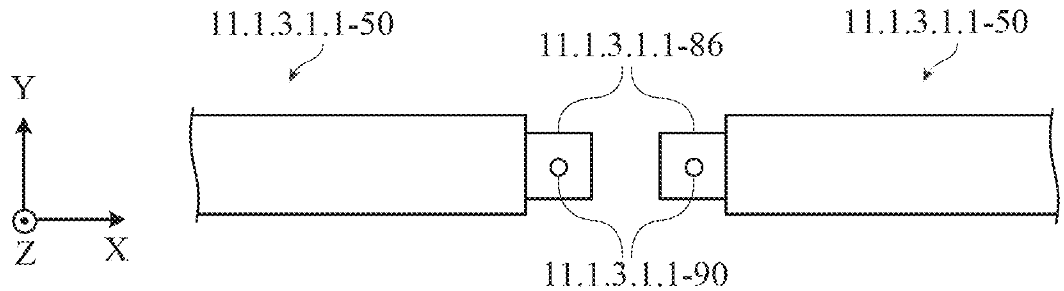
FIG. 11.1.3.1.1-9
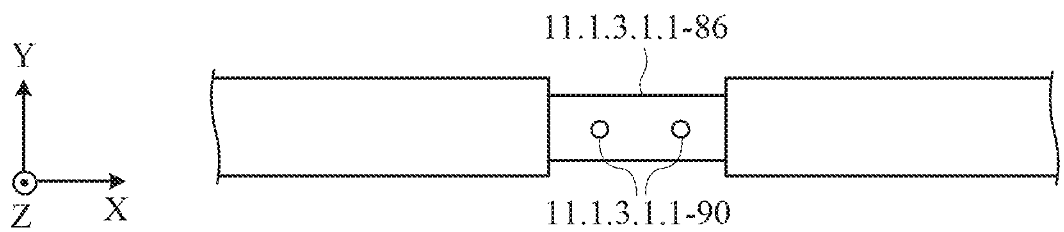
FIG. 11.1.3.1.1-10
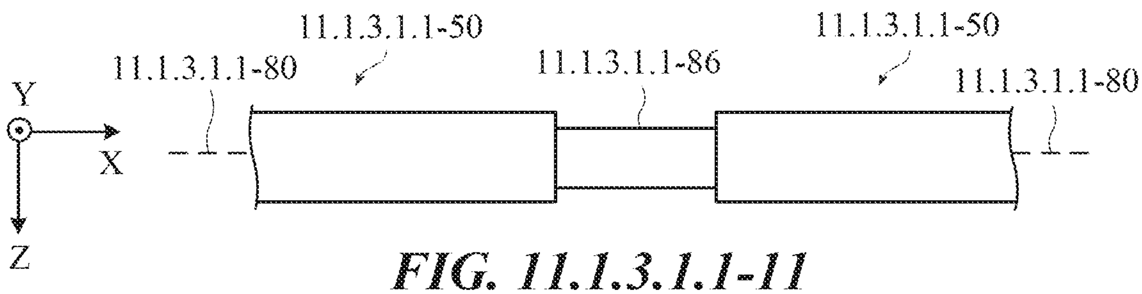
FIG. 11.1.3.1.1-11
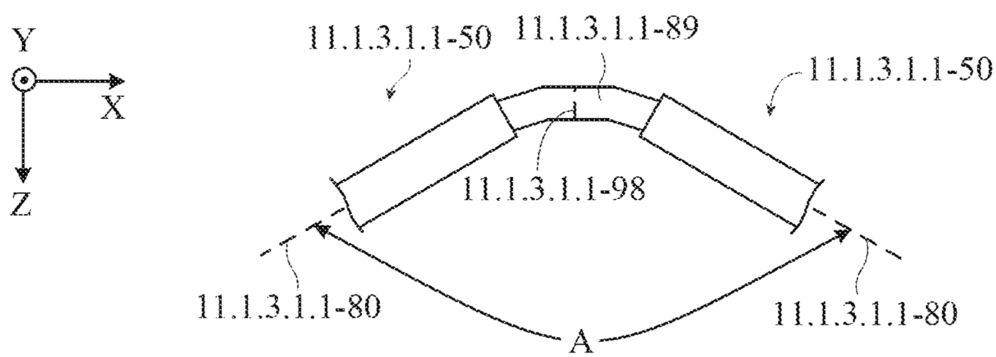
FIG. 11.1.3.1.1-12

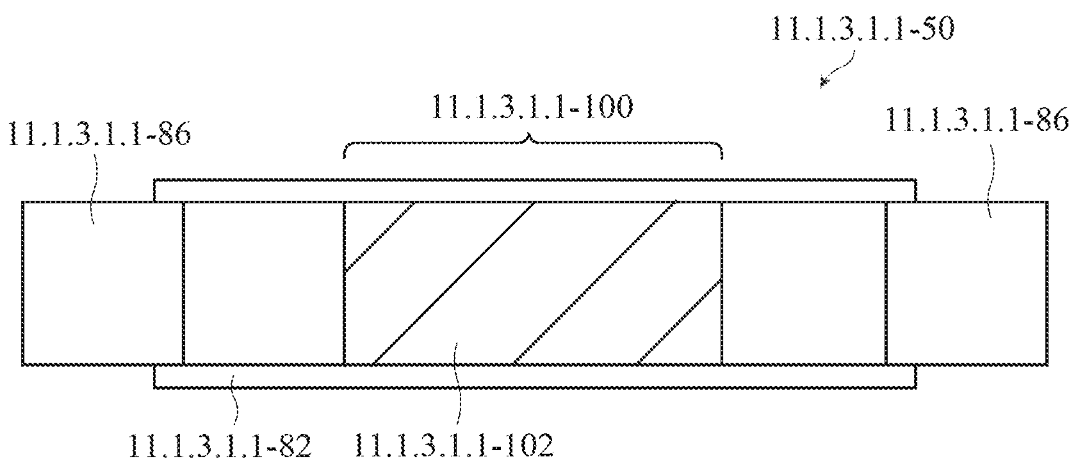
*FIG. 11.1.3.1.1-13*

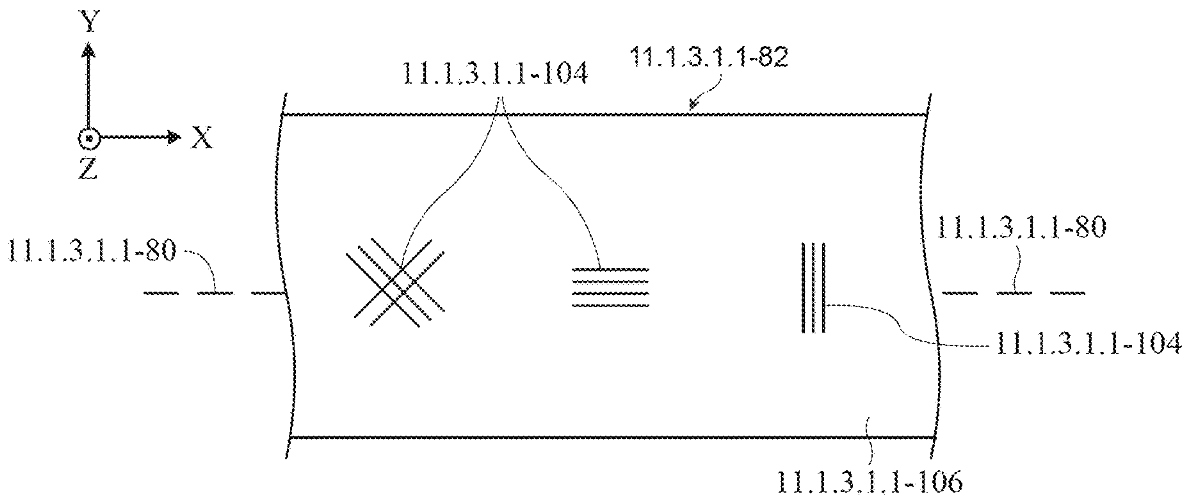
*FIG. 11.1.3.1.1-14*
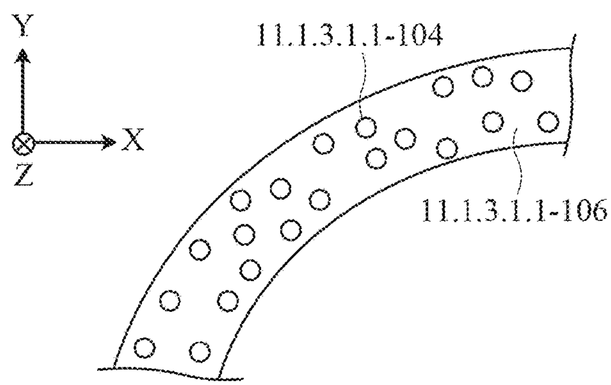
*FIG. 11.1.3.1.1-15*

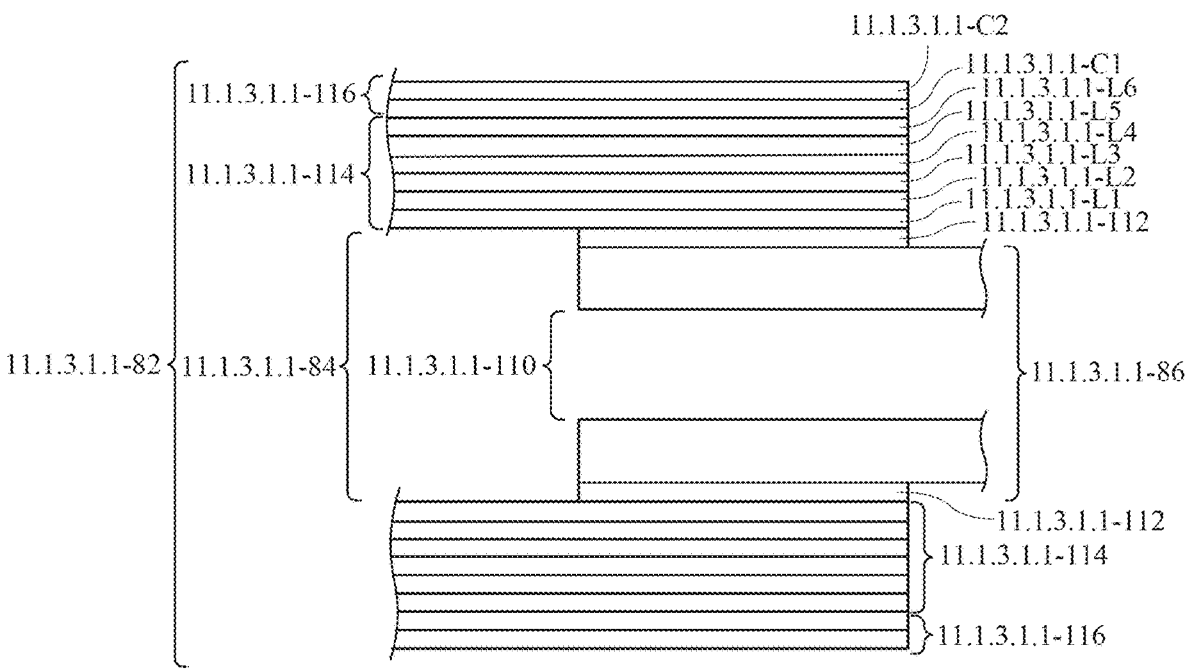
FIG. 11.1.3.1.1-16

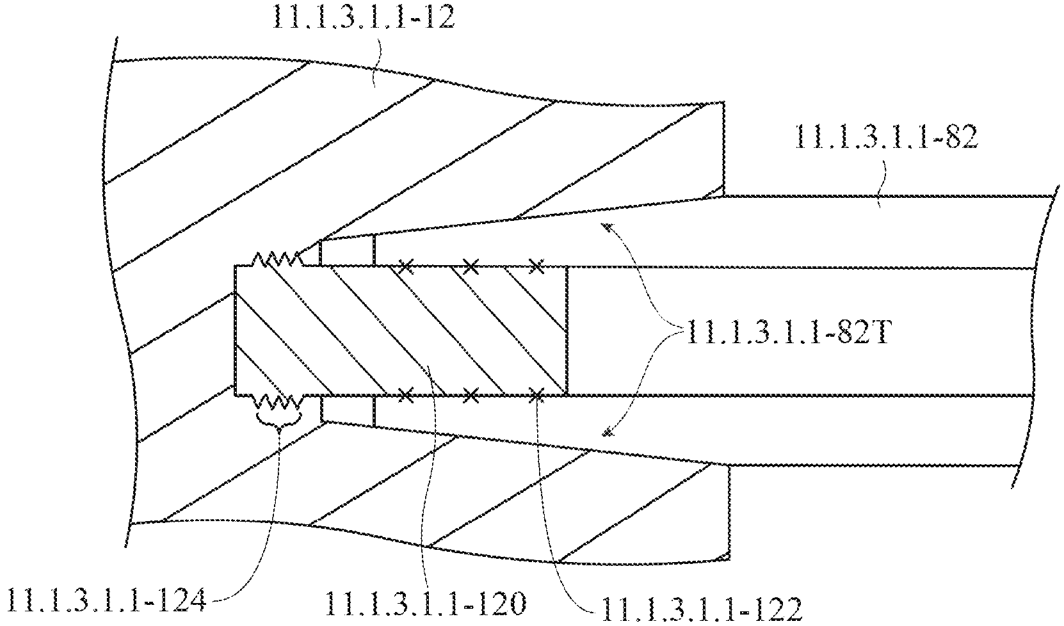
*FIG. 11.1.3.1.1-17*

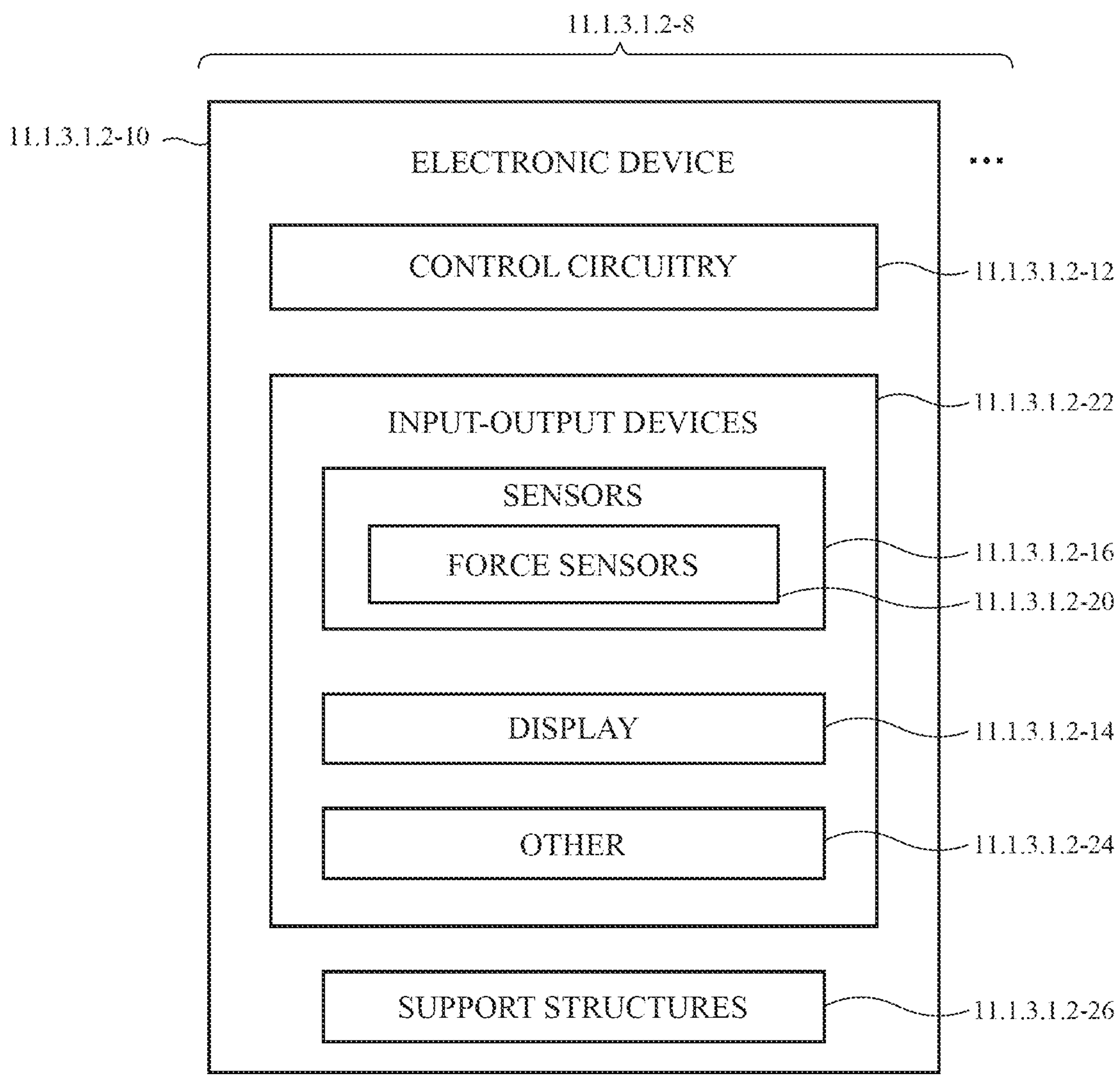
*FIG. 11.1.3.1.2-1*

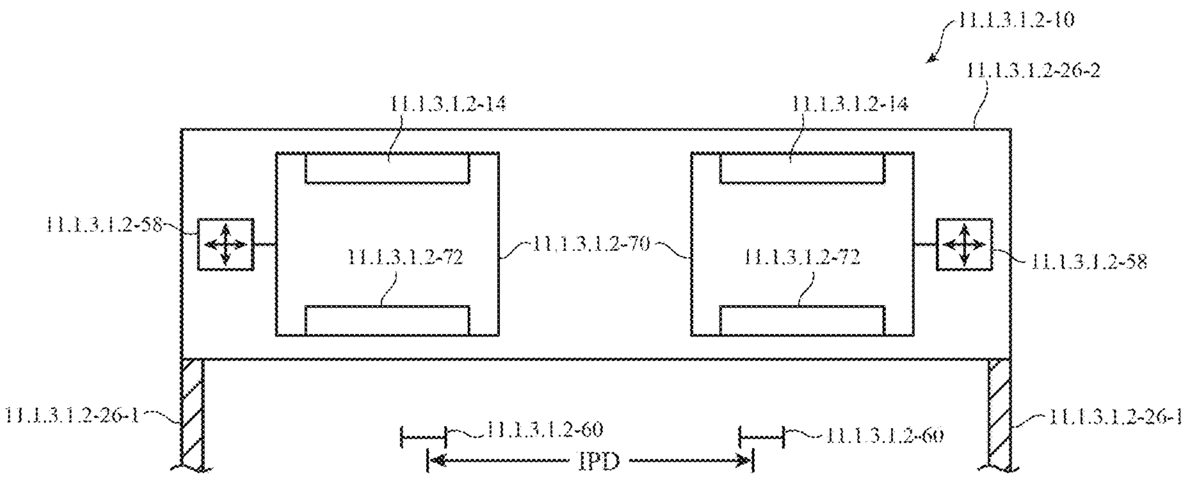
*FIG. 11.1.3.1.2-2*

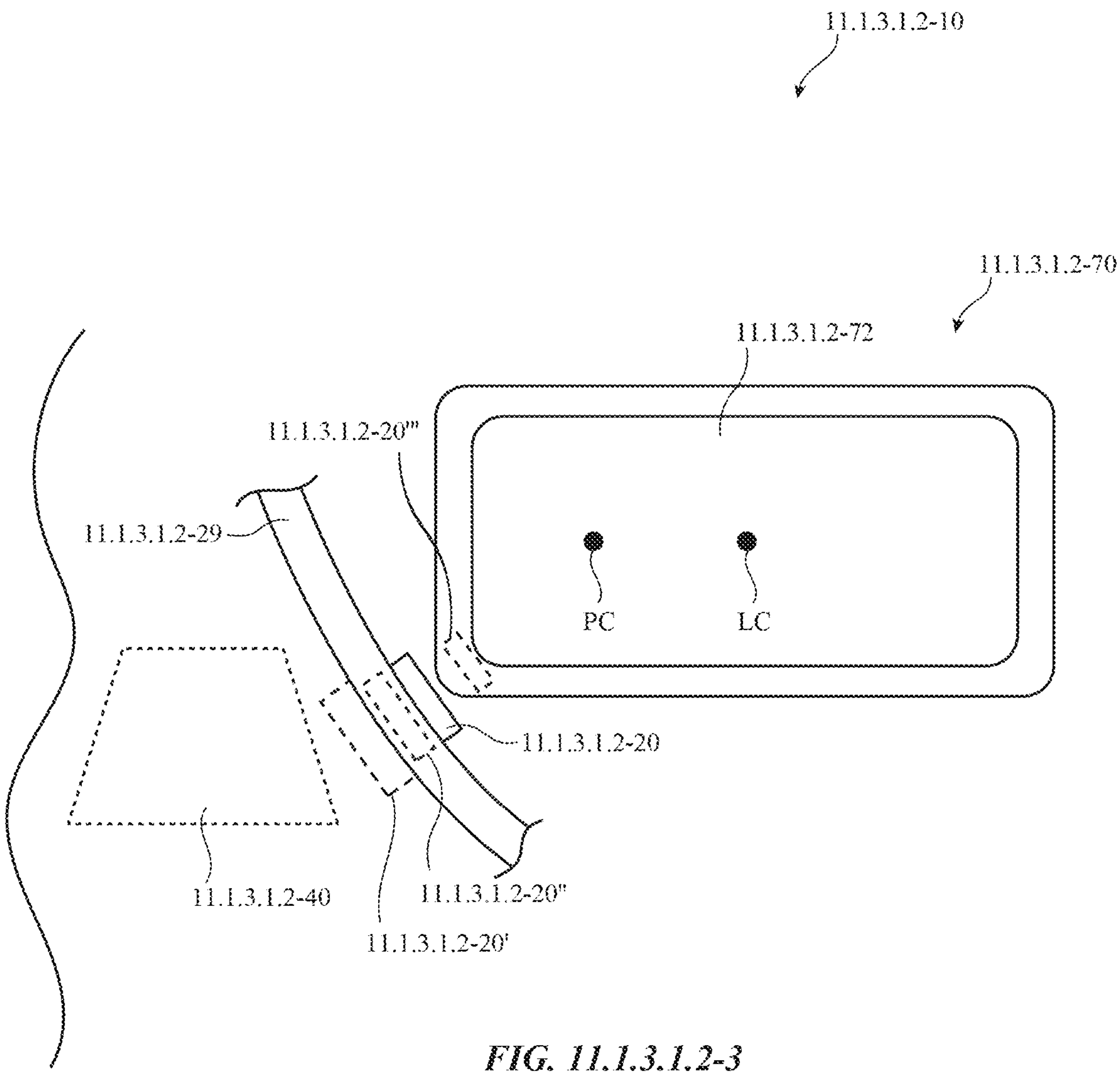
FIG. 11.1.3.1.2-3

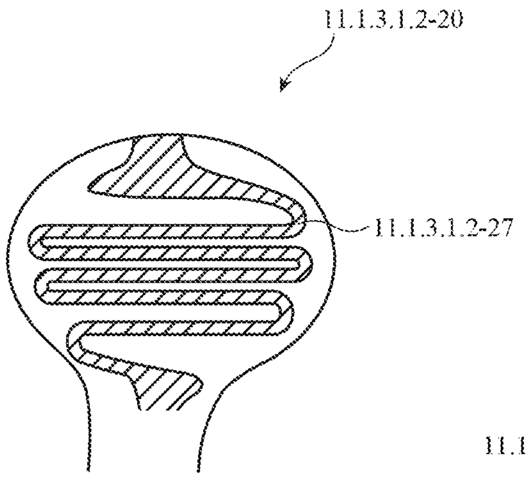
FIG. 11.1.3.1.2-4A
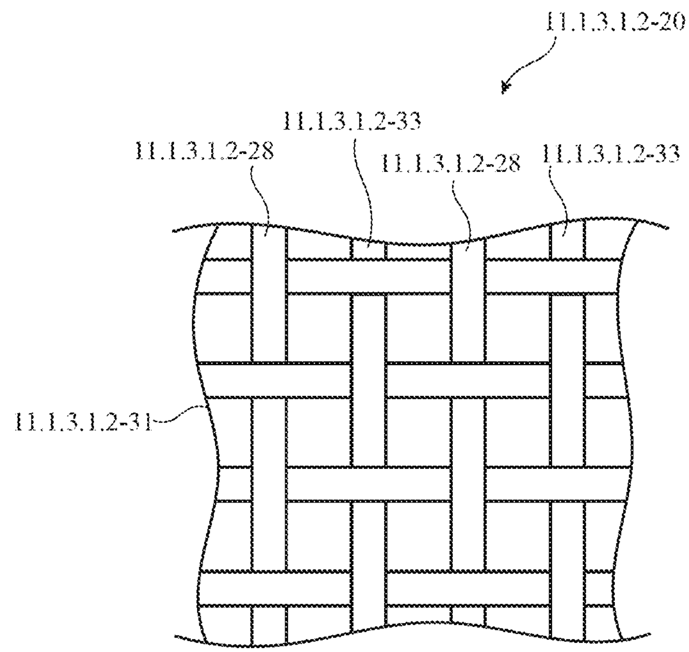
FIG. 11.1.3.1.2-4B
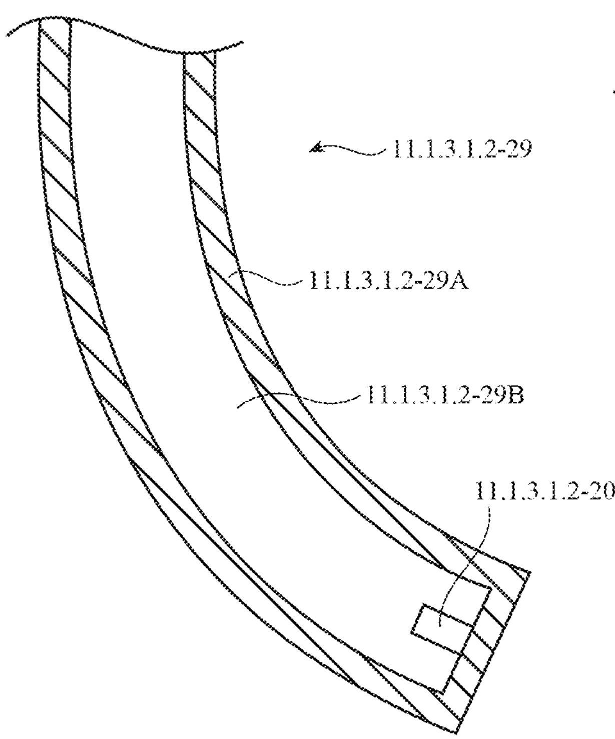
FIG. 11.1.3.1.2-4C

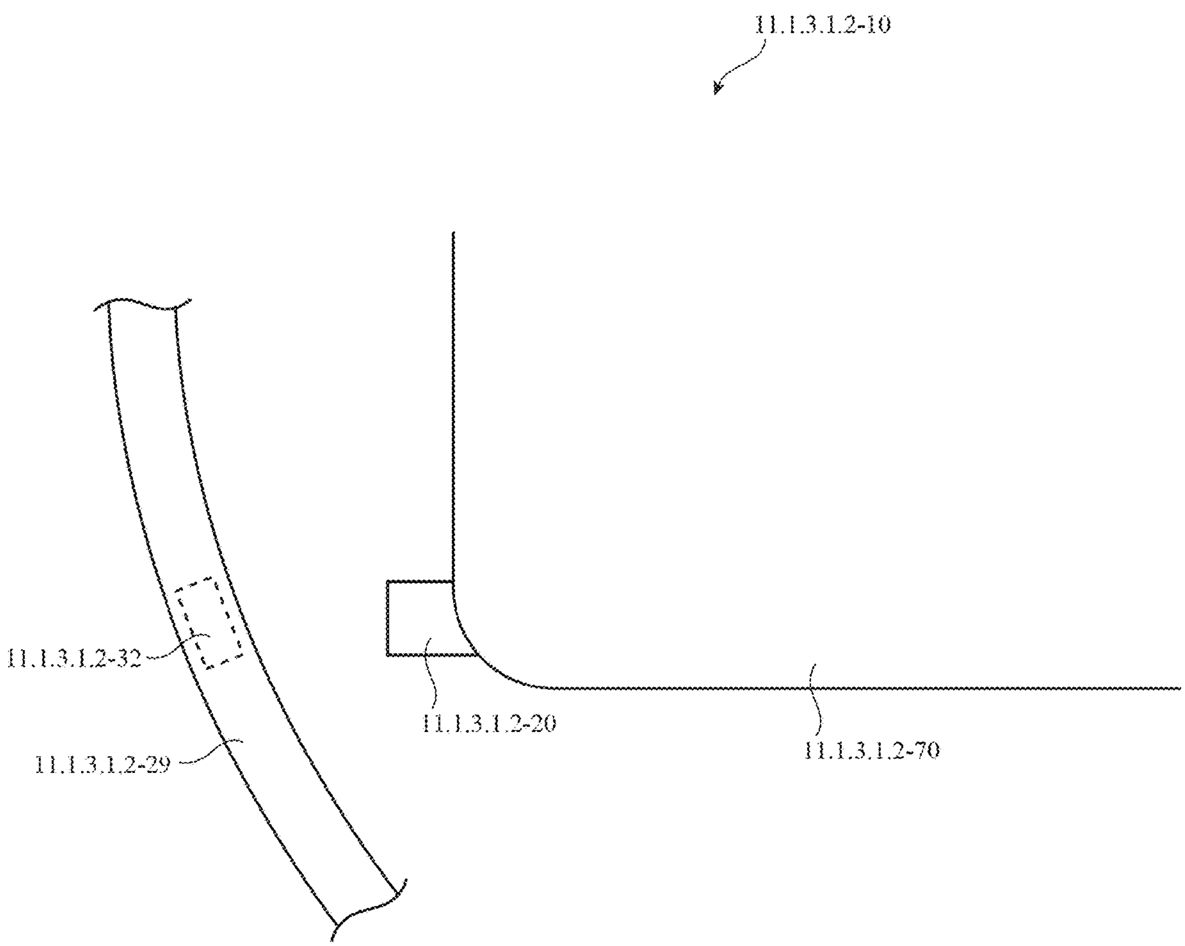
*FIG. 11.1.3.1.2-5*

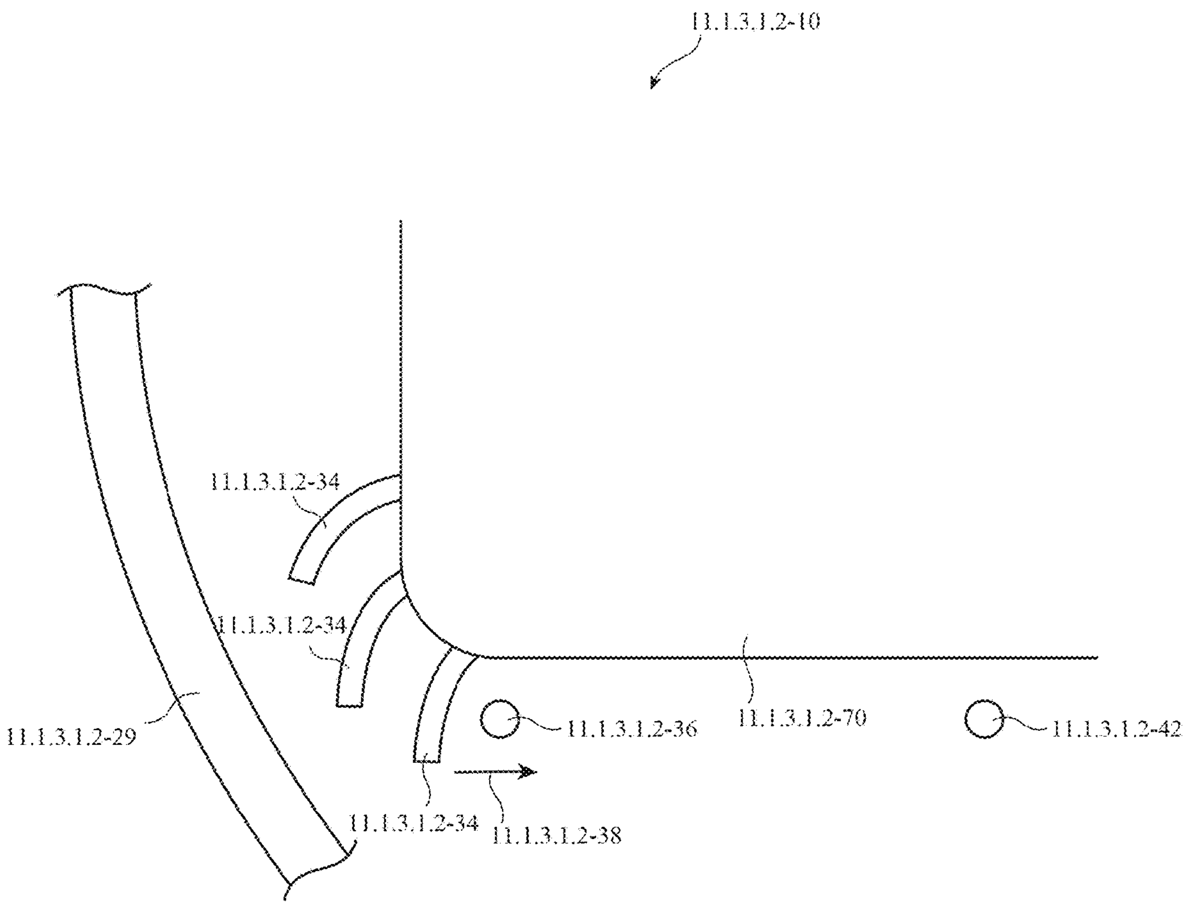
*FIG. 11.1.3.1.2-6*

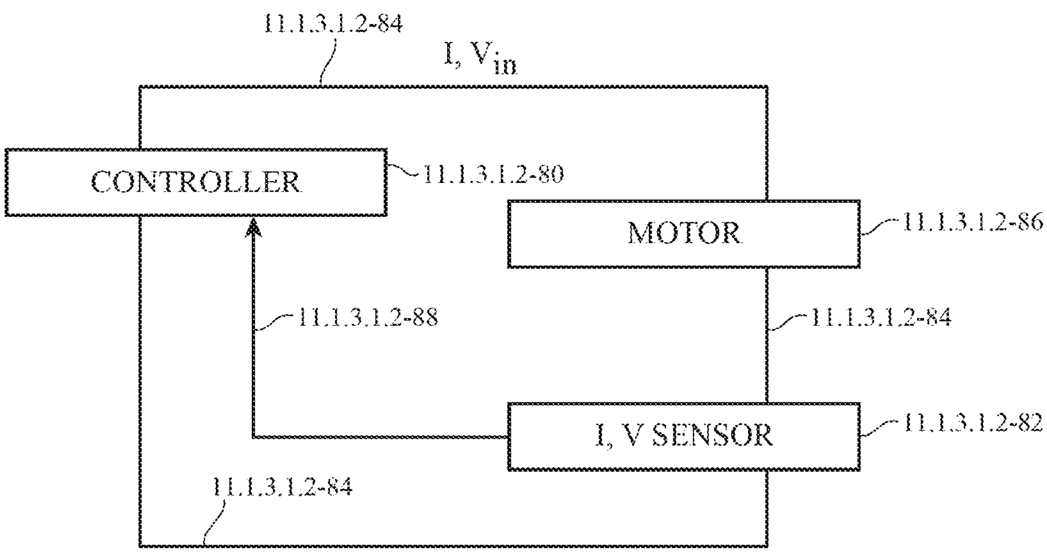
*FIG. 11.1.3.1.2-7*

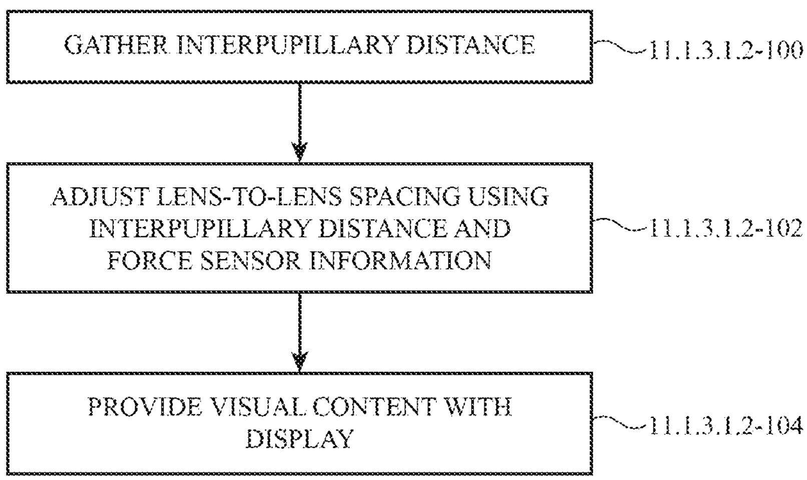
*FIG. 11.1.3.1.2-8*

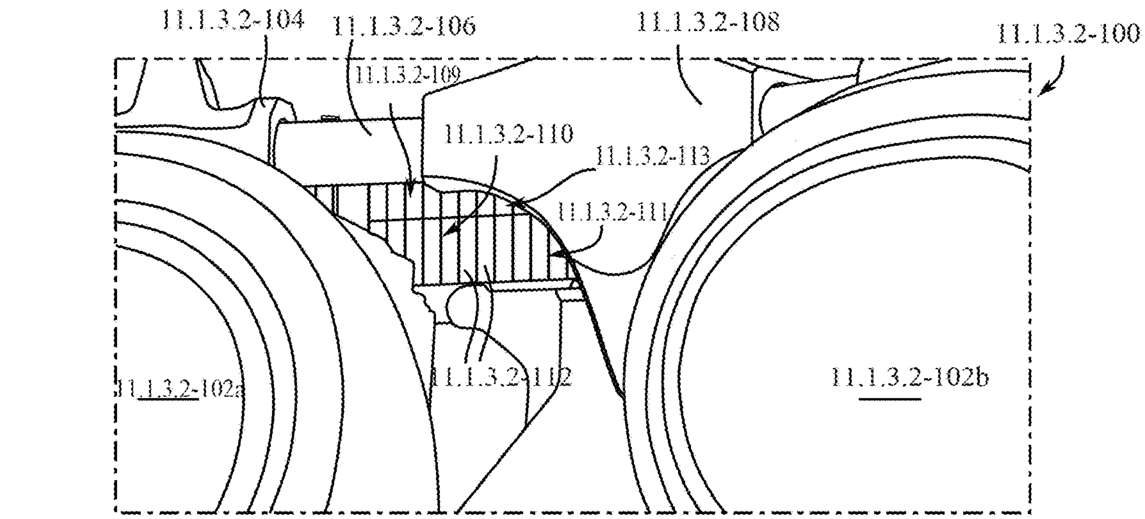
FIG. 11.1.3.2-1
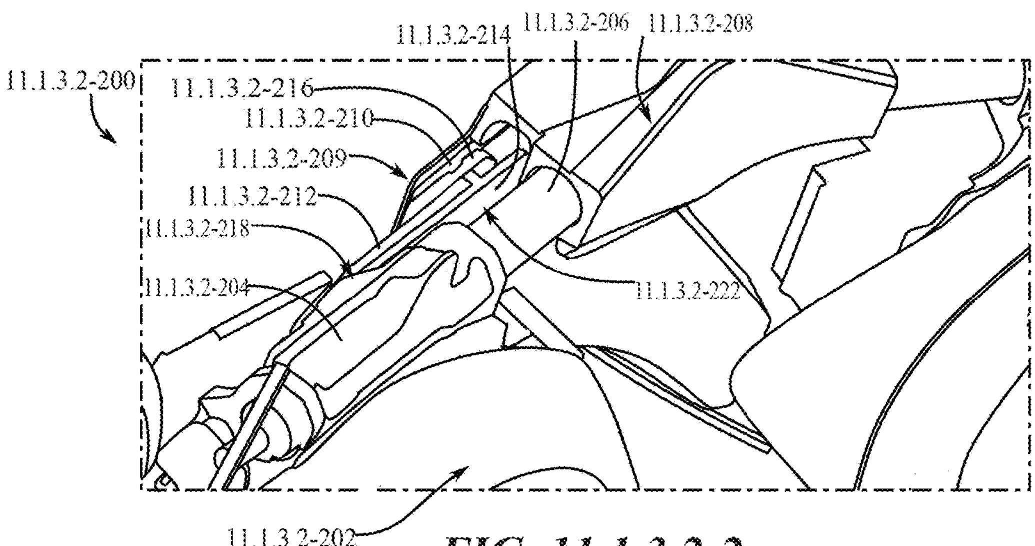
FIG. 11.1.3.2-2
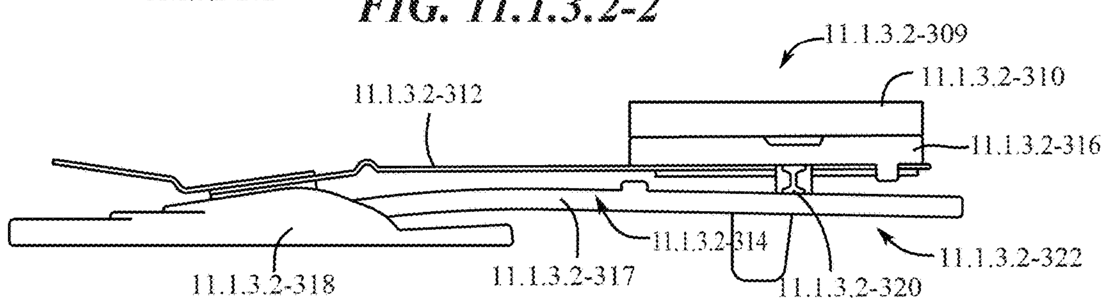
FIG. 11.1.3.2-3

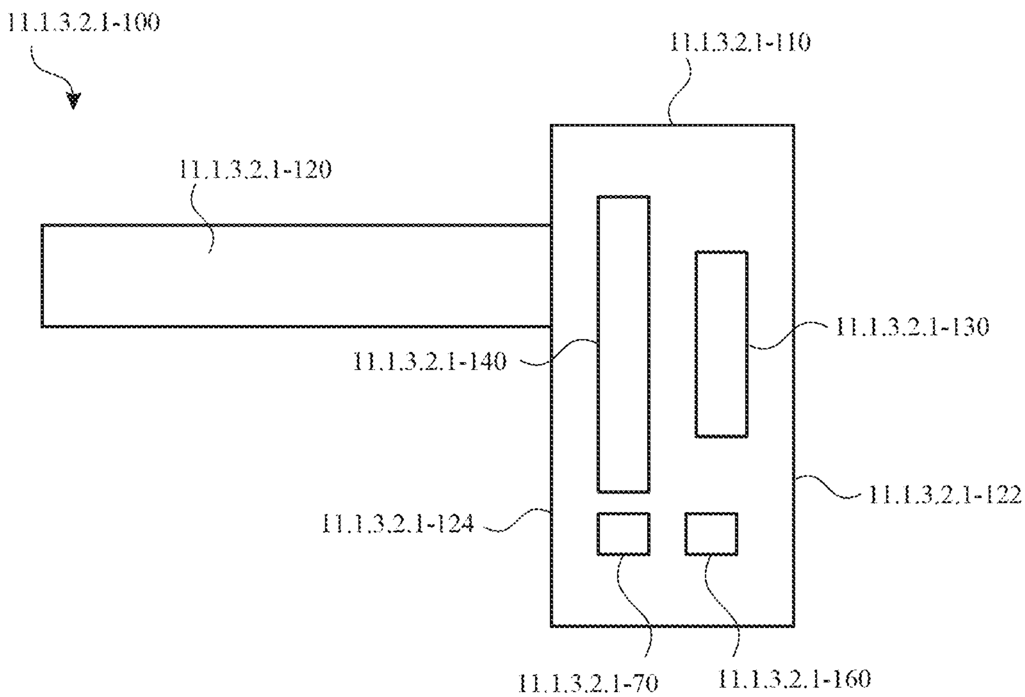
*FIG. 11.1.3.2.1-1*

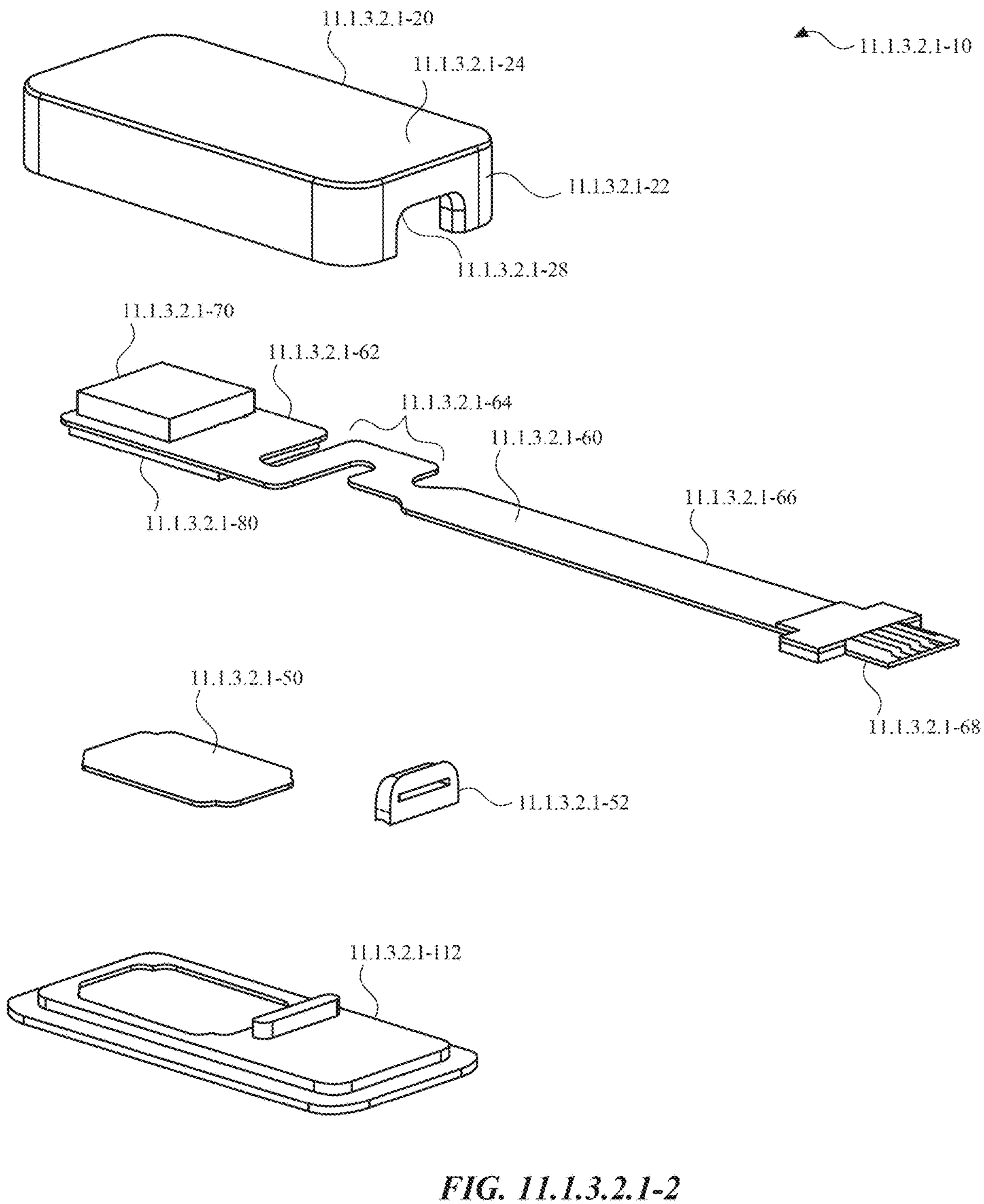
*FIG. 11.1.3.2.1-2*

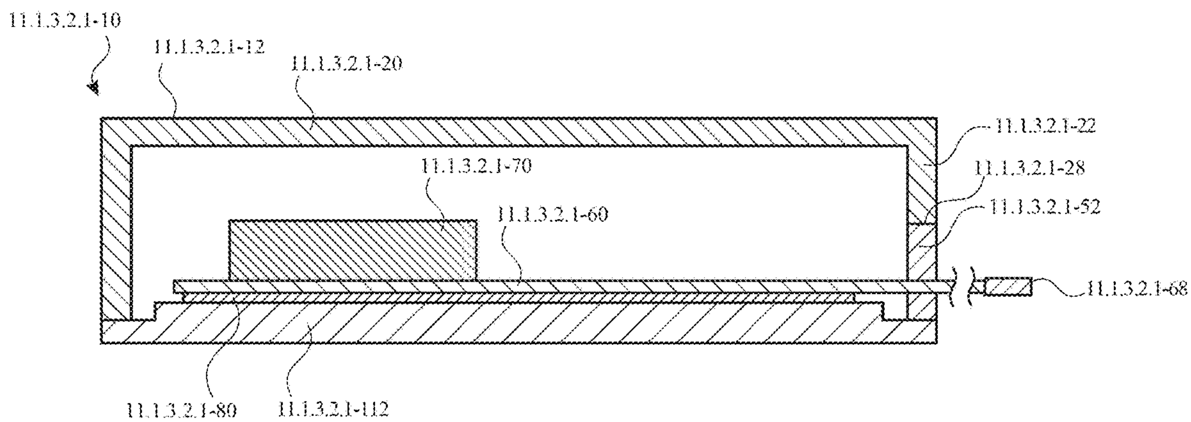
FIG. 11.1.3.2.1-3
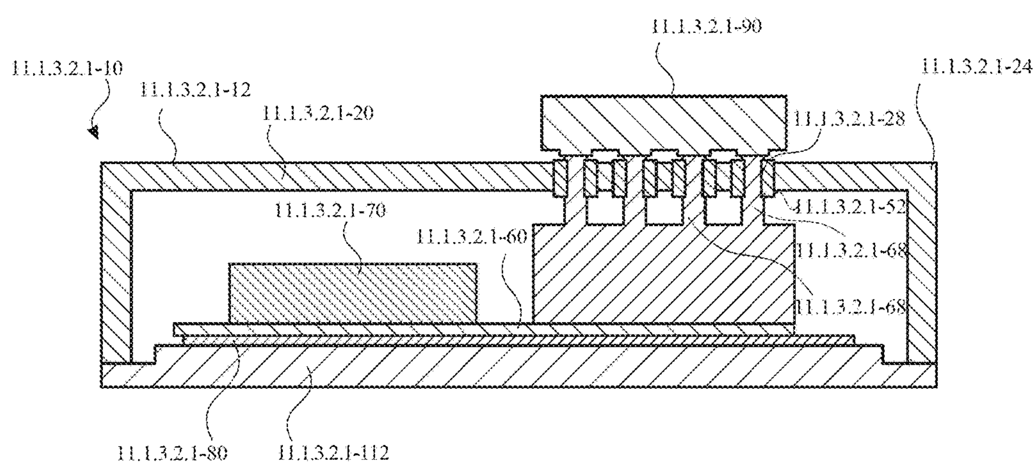
FIG. 11.1.3.2.1-4

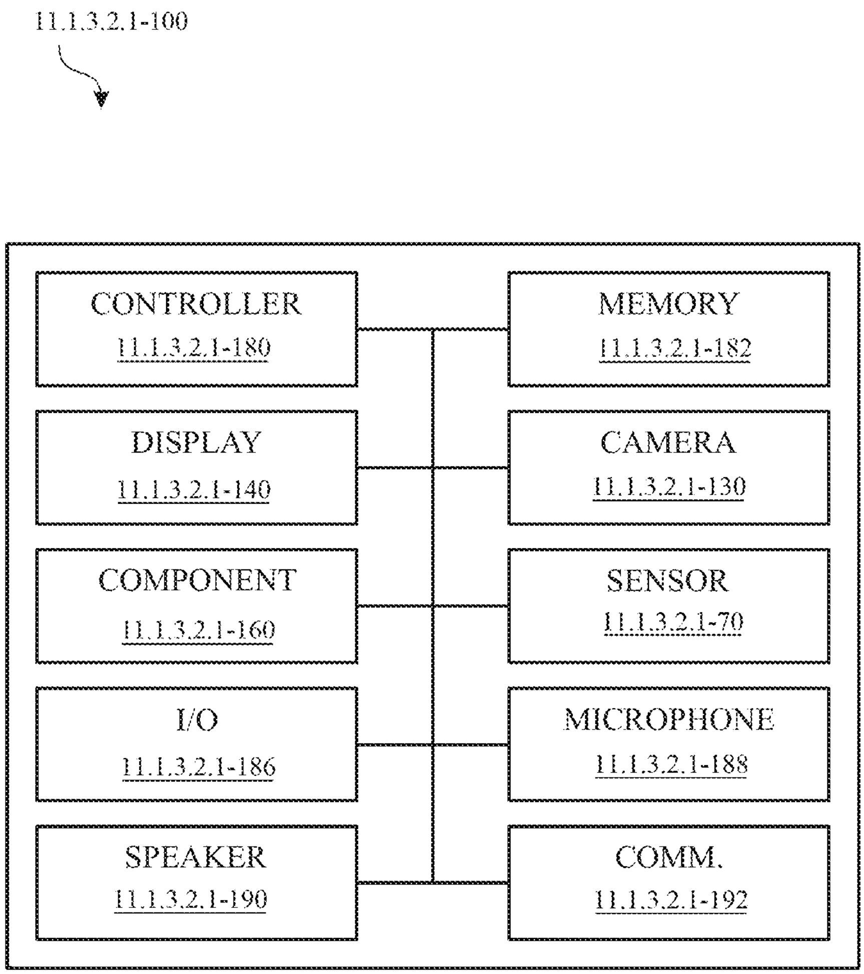
*FIG. 11.1.3.2.1-5*

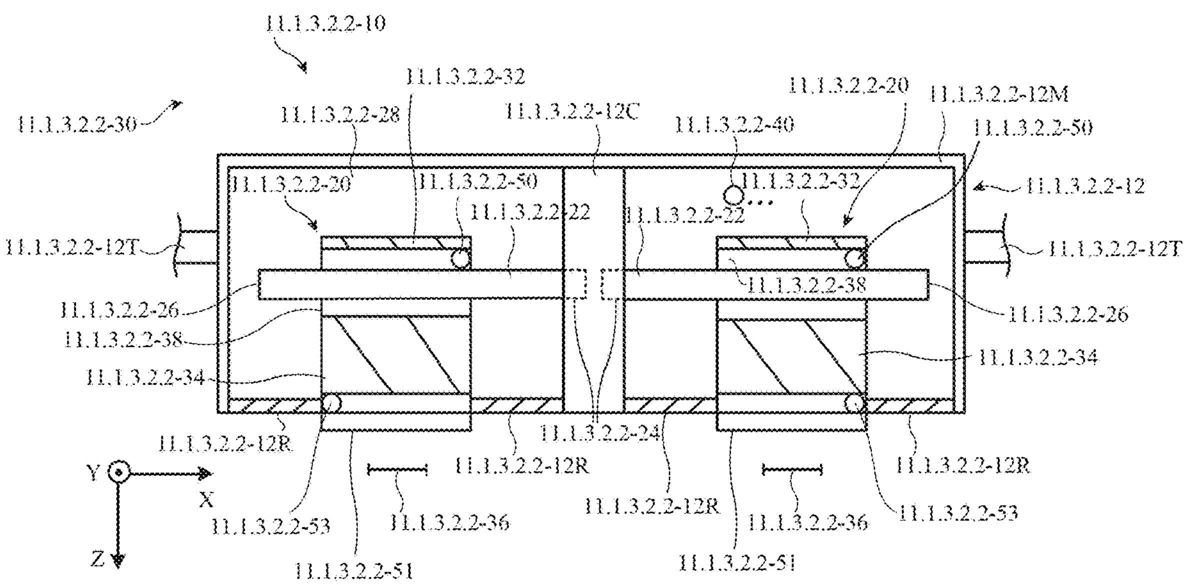
FIG. 11.1.3.2.2-1

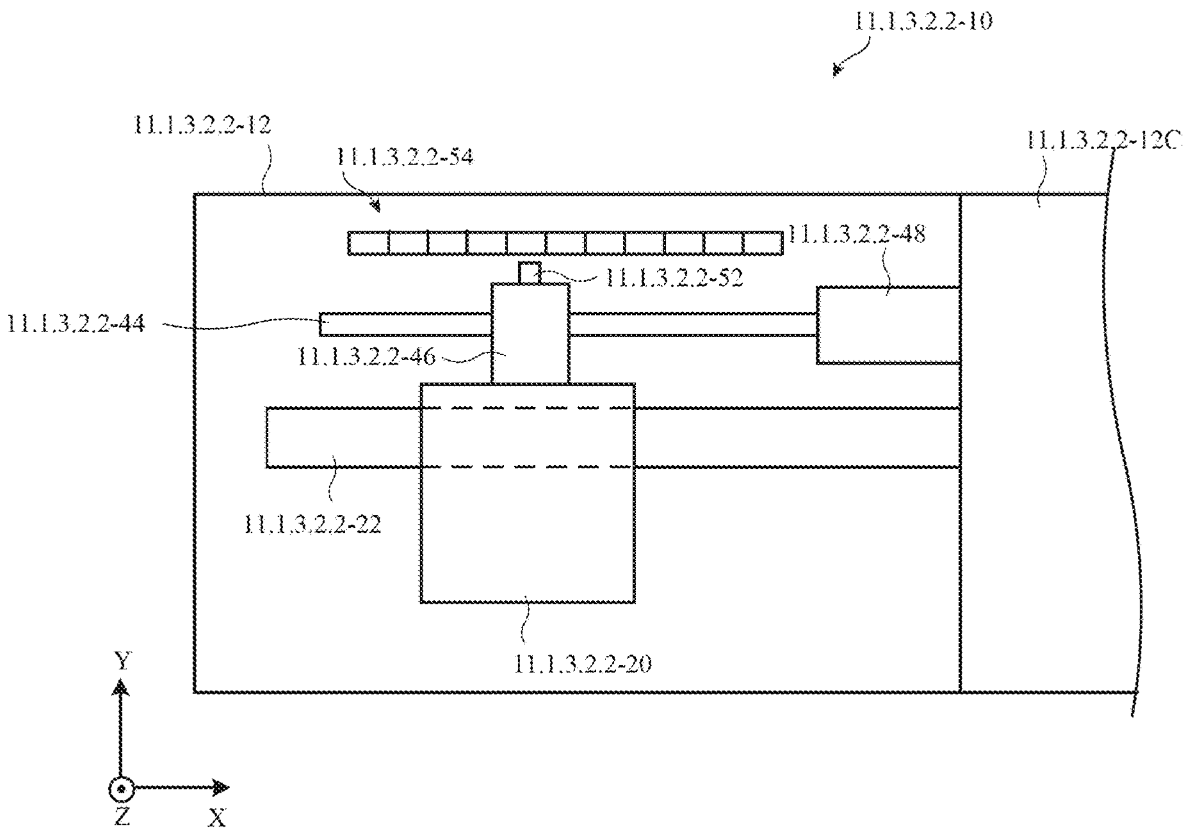
FIG. 11.1.3.2.2-2

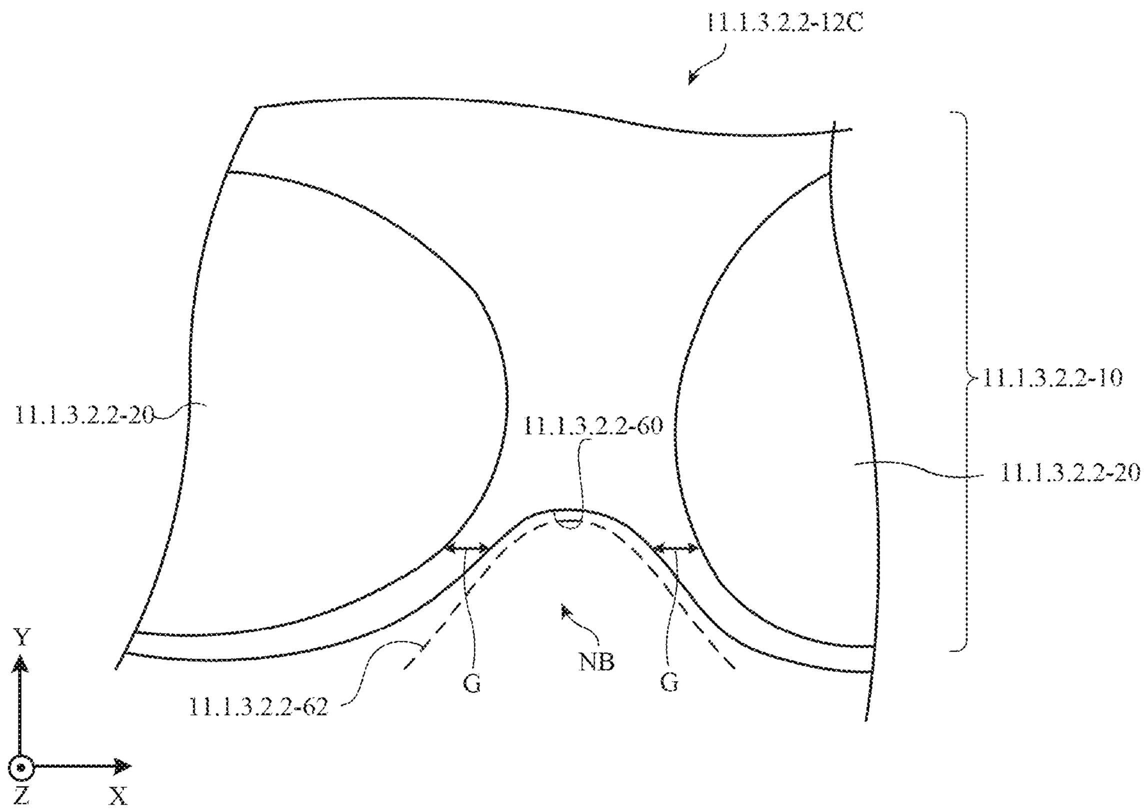
*FIG. 11.1.3.2.2-3*

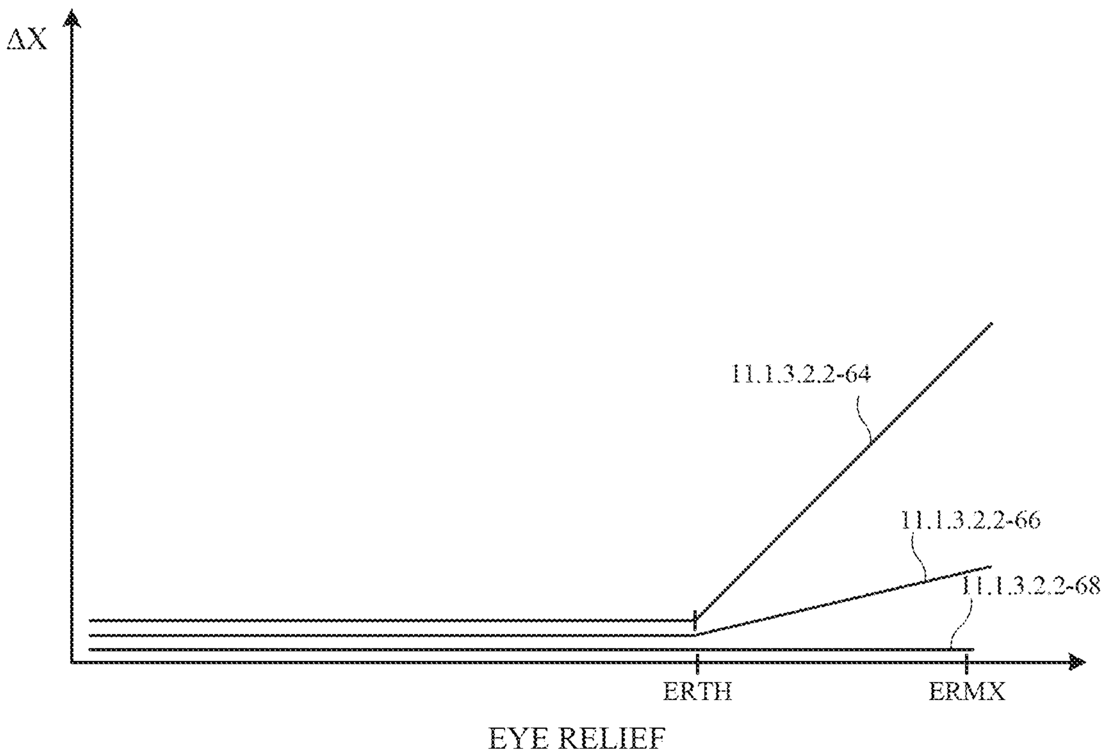
*FIG. 11.1.3.2.2-4*

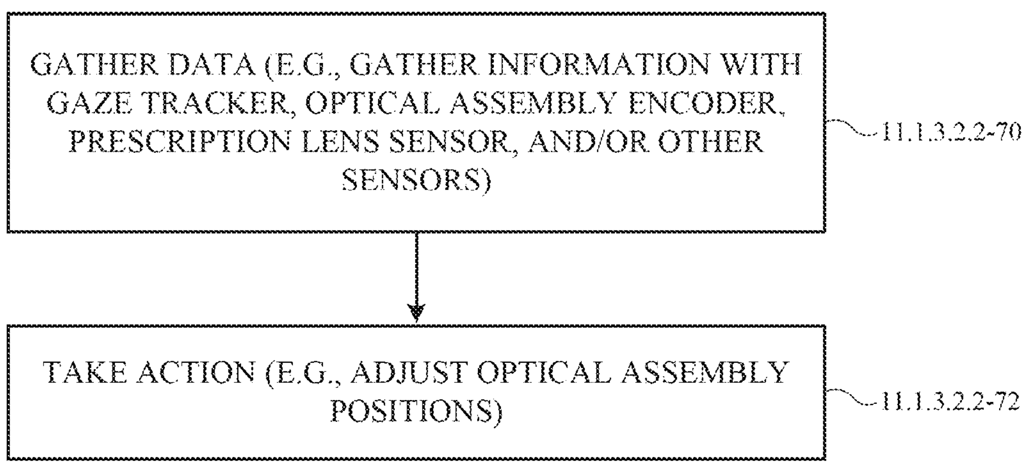
*FIG. 11.1.3.2.2-5*

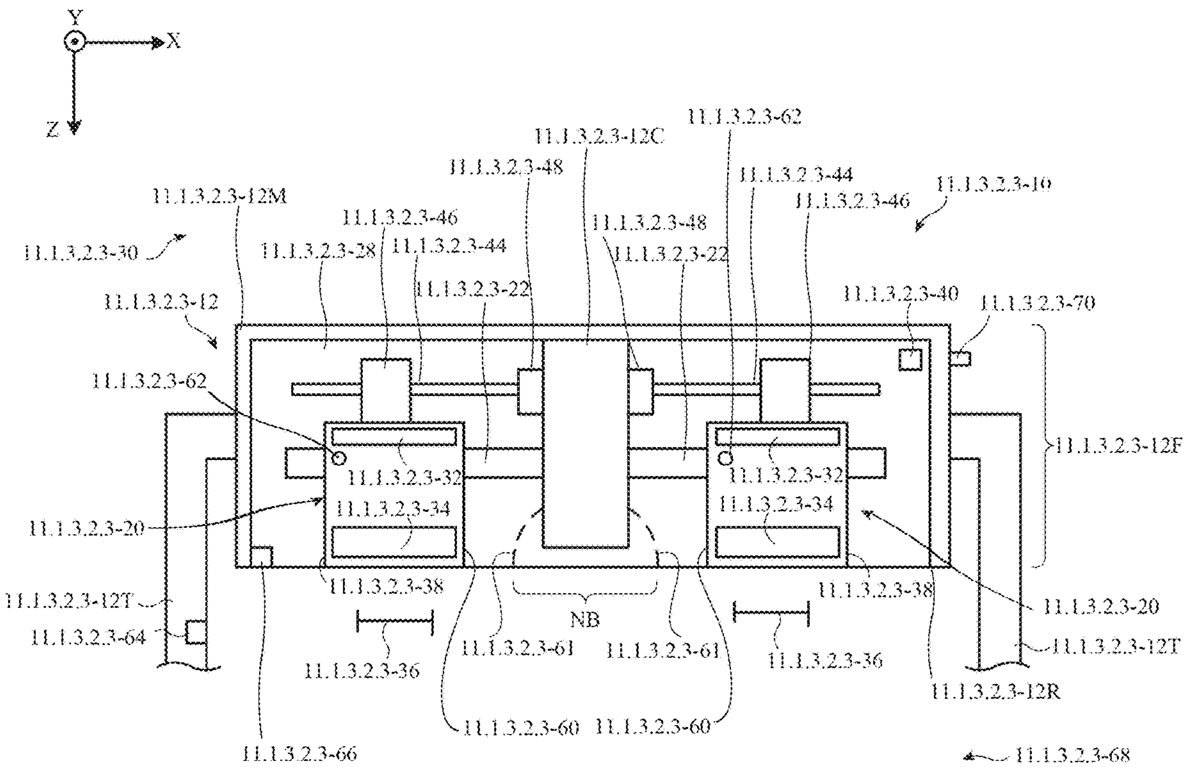
*FIG. 11.1.3.2.3-1*

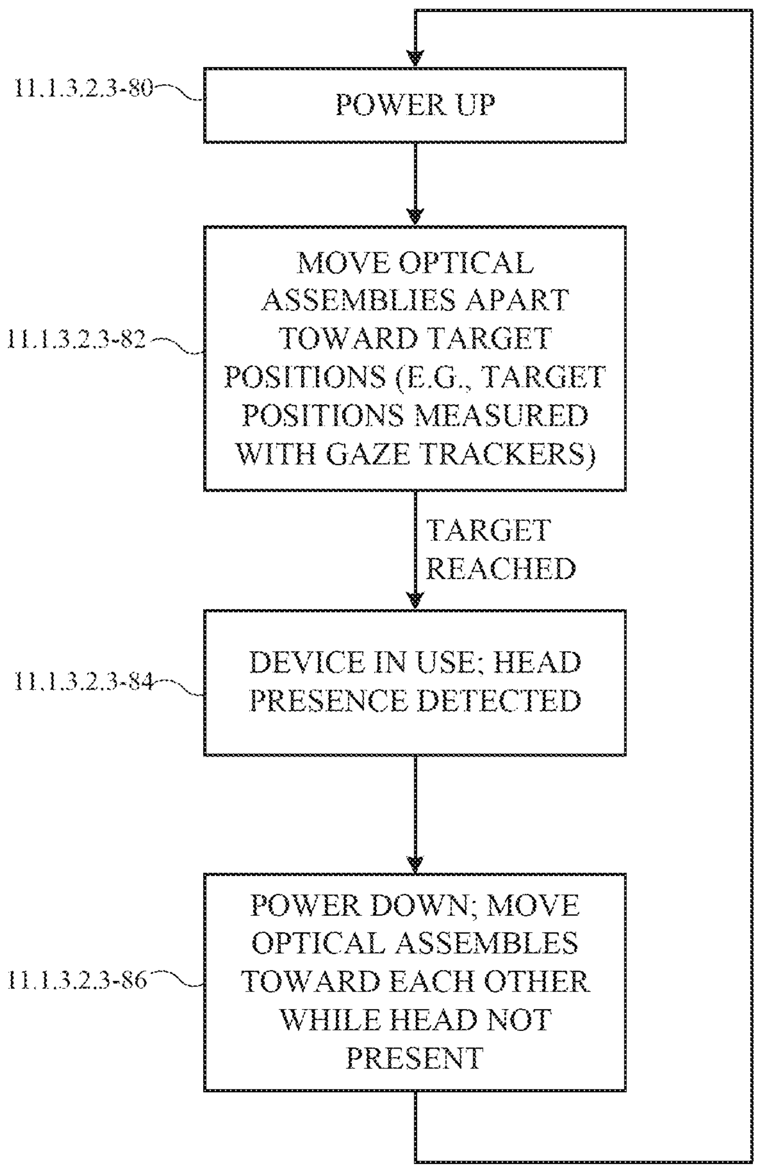
*FIG. 11.1.3.2.3-2*

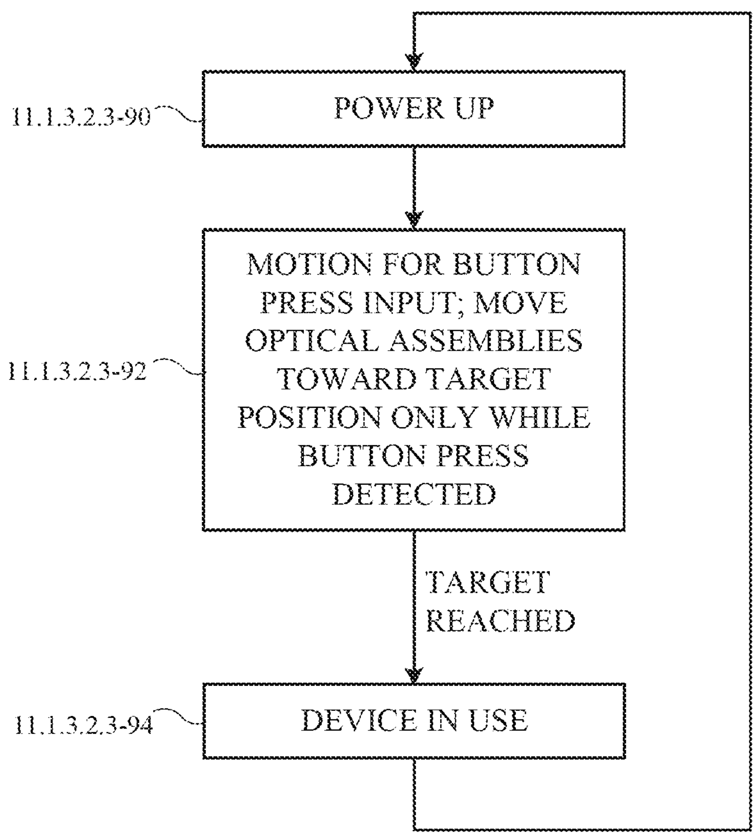
FIG. 11.1.3.2.3-3

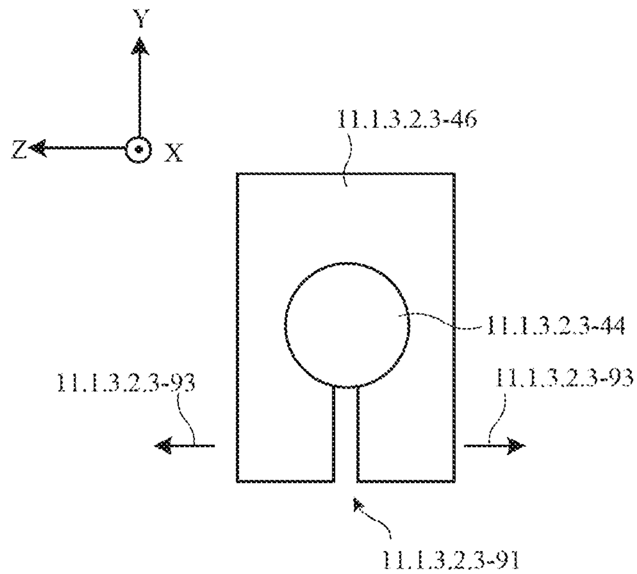
*FIG. 11.1.3.2.3-4*
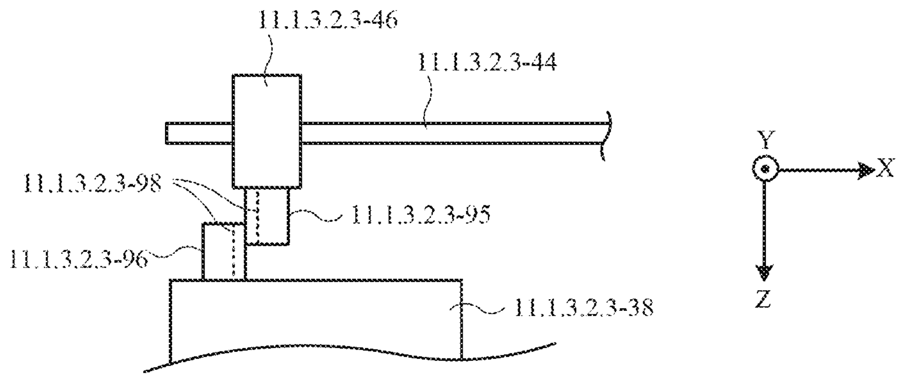
*FIG. 11.1.3.2.3-5*
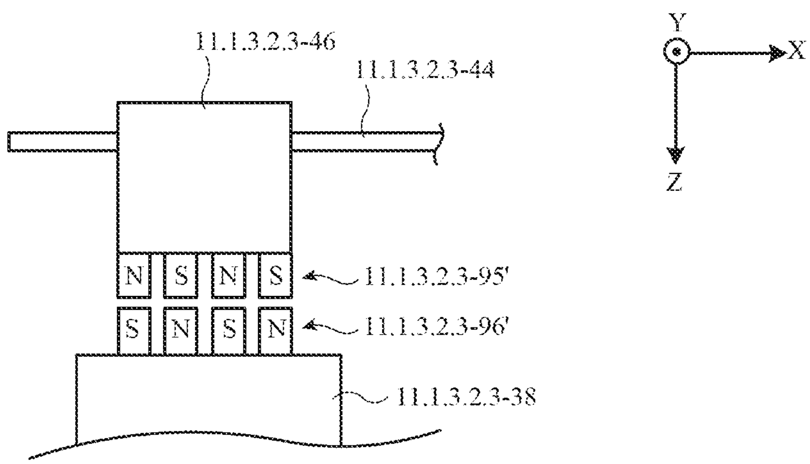
*FIG. 11.1.3.2.3-6*

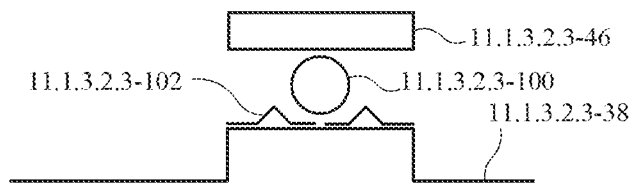
FIG. 11.1.3.2.3-7
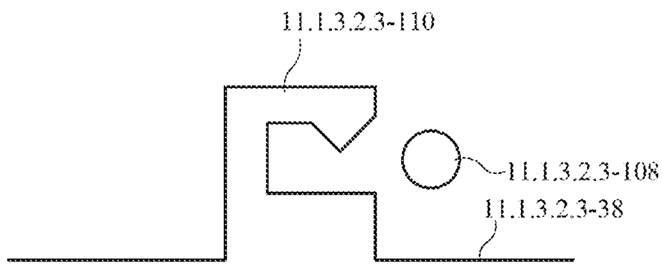
FIG. 11.1.3.2.3-8
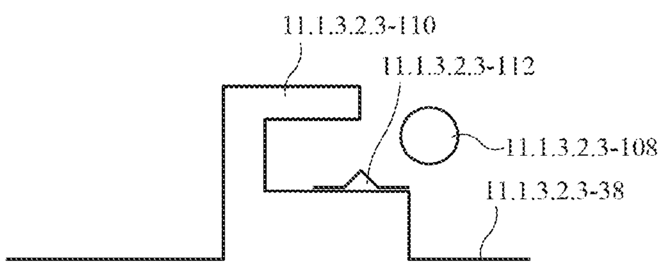
FIG. 11.1.3.2.3-9
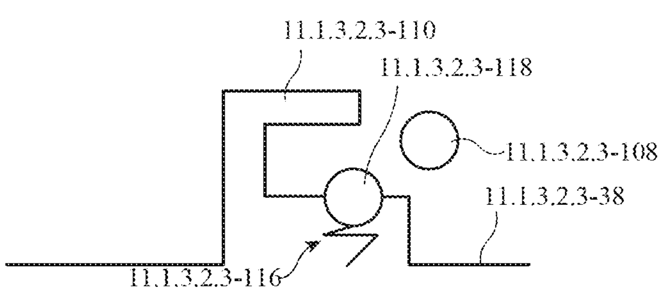
FIG. 11.1.3.2.3-10

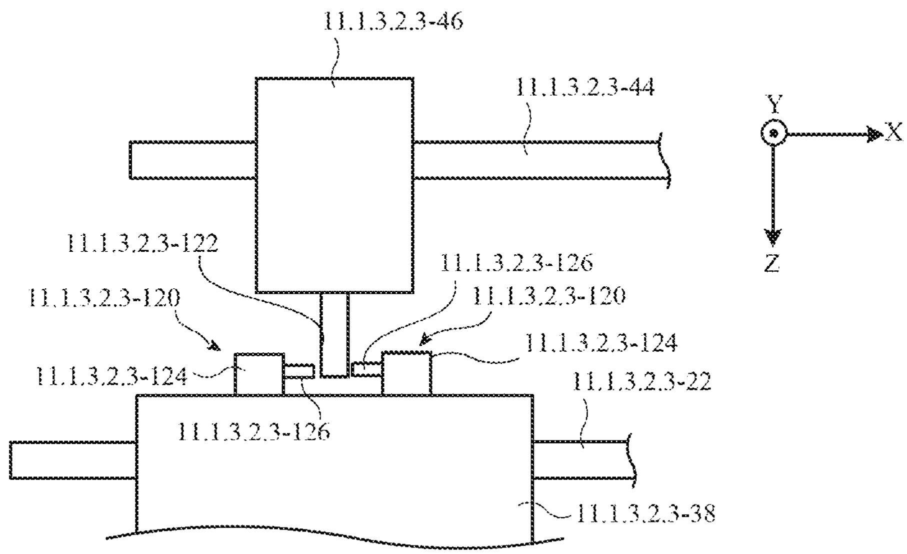
*FIG. 11.1.3.2.3-11*
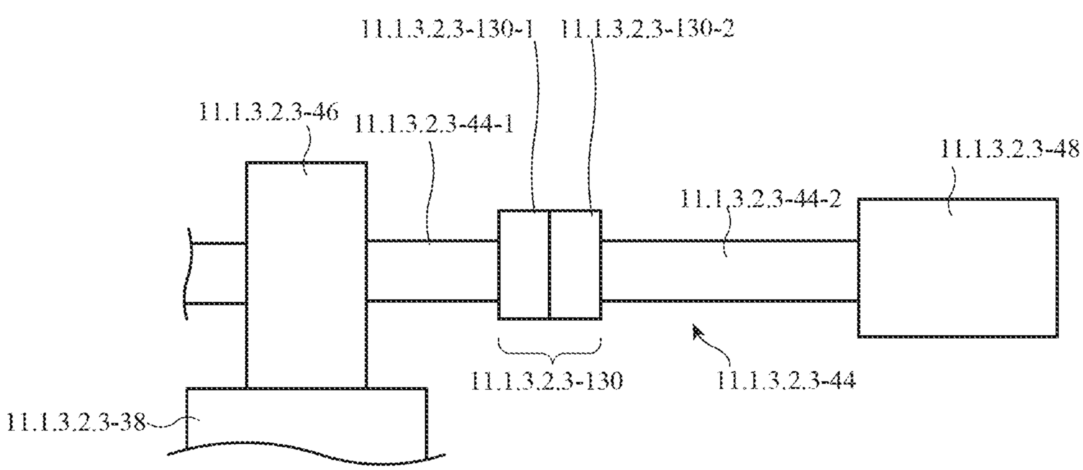
*FIG. 11.1.3.2.3-12*

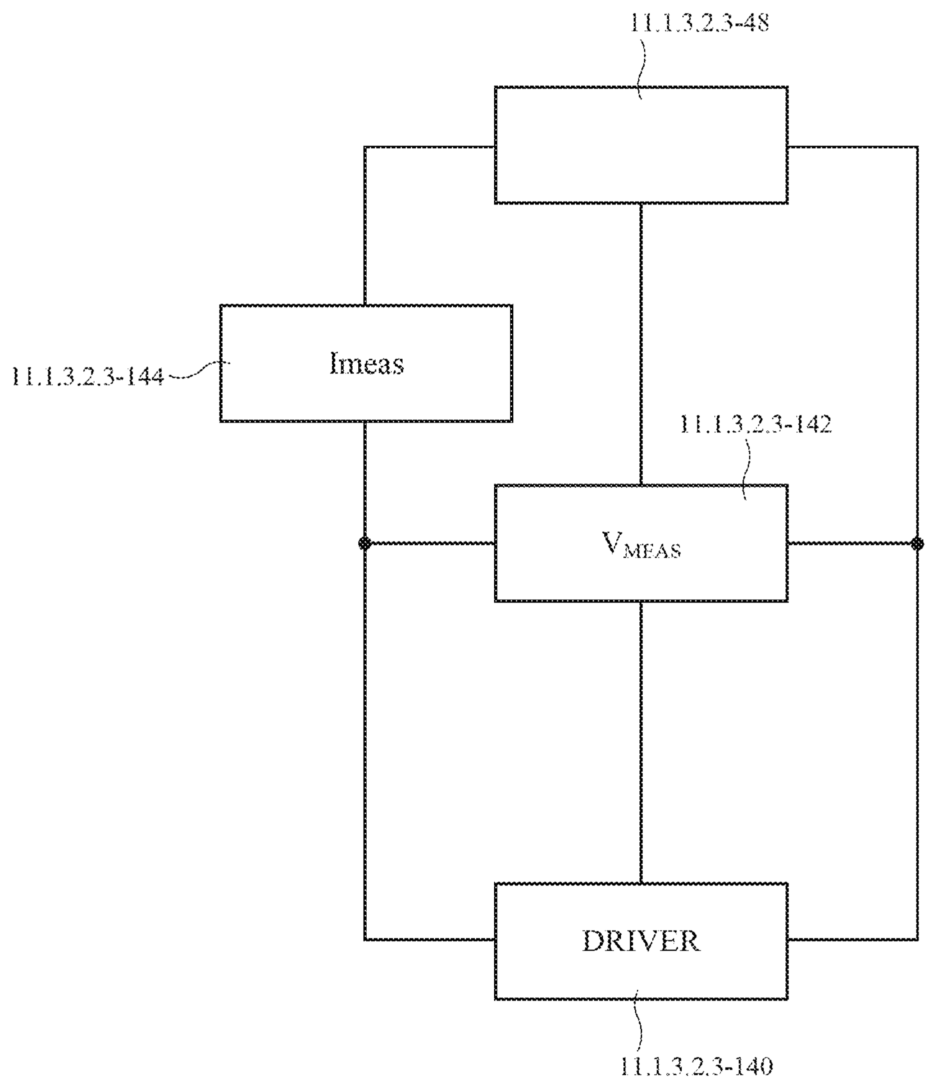
FIG. 11.1.3.2.3-13
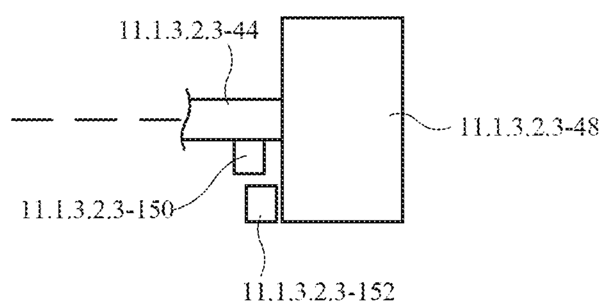
FIG. 11.1.3.2.3-14

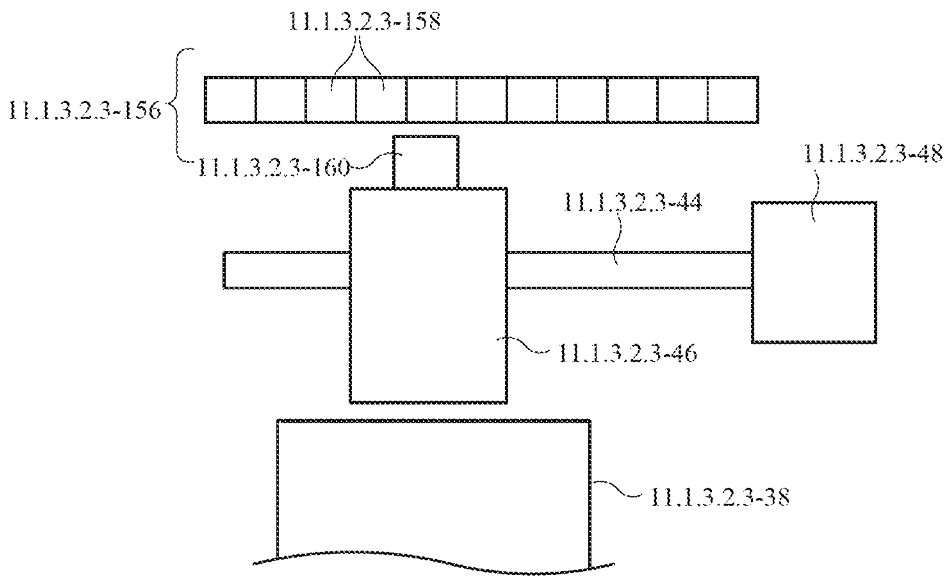
*FIG. 11.1.3.2.3-15*
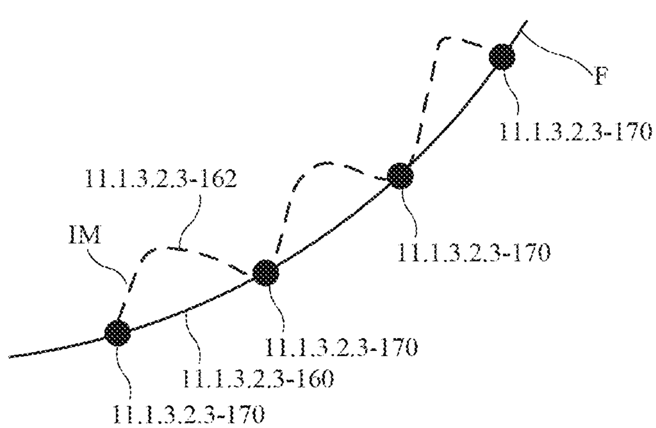
*FIG. 11.1.3.2.3-16*

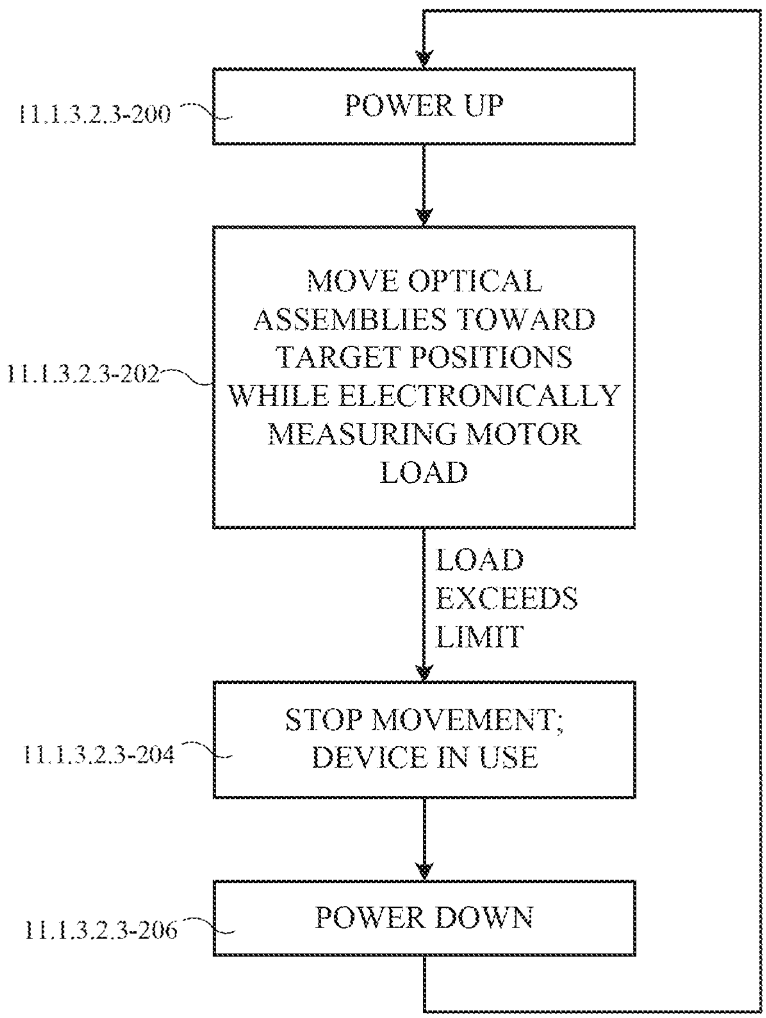
*FIG. 11.1.3.2.3-17*

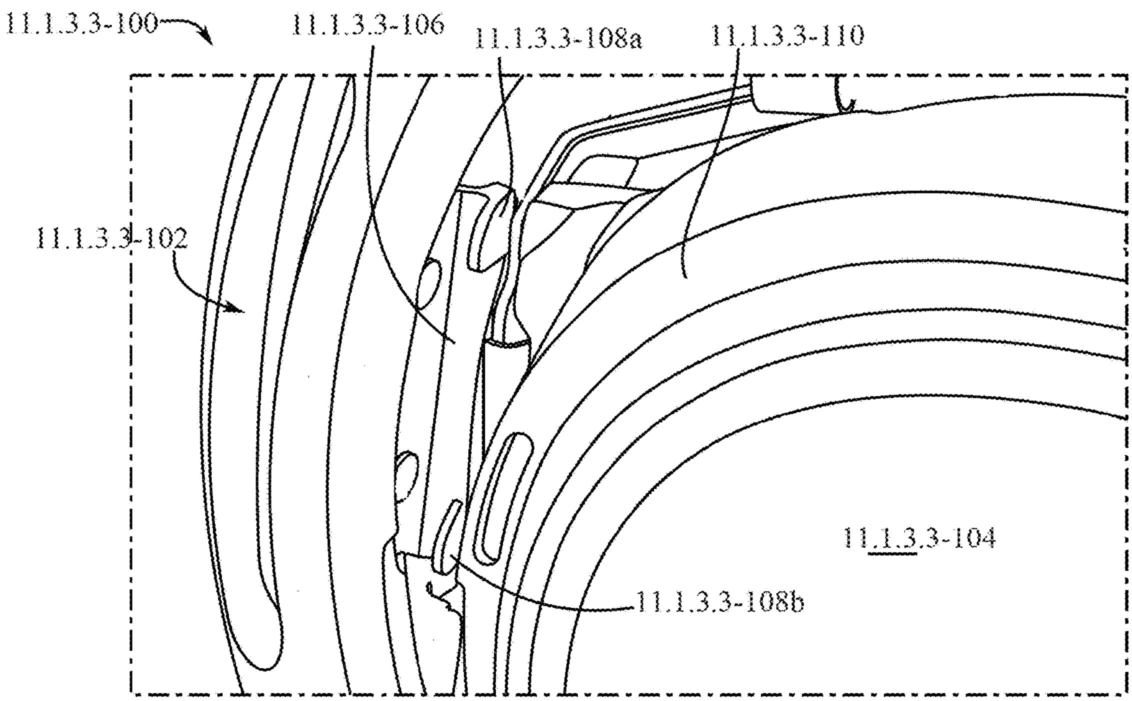
*FIG. 11.1.3.3-1*
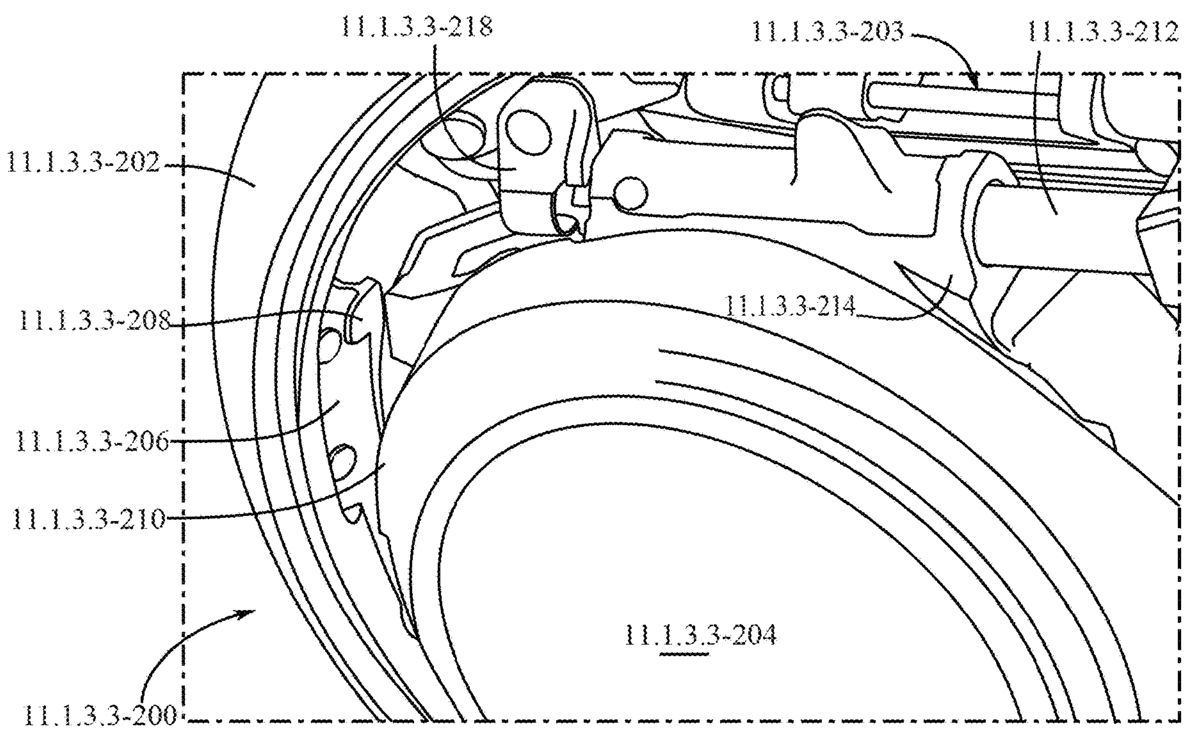
*FIG. 11.1.3.3-2*

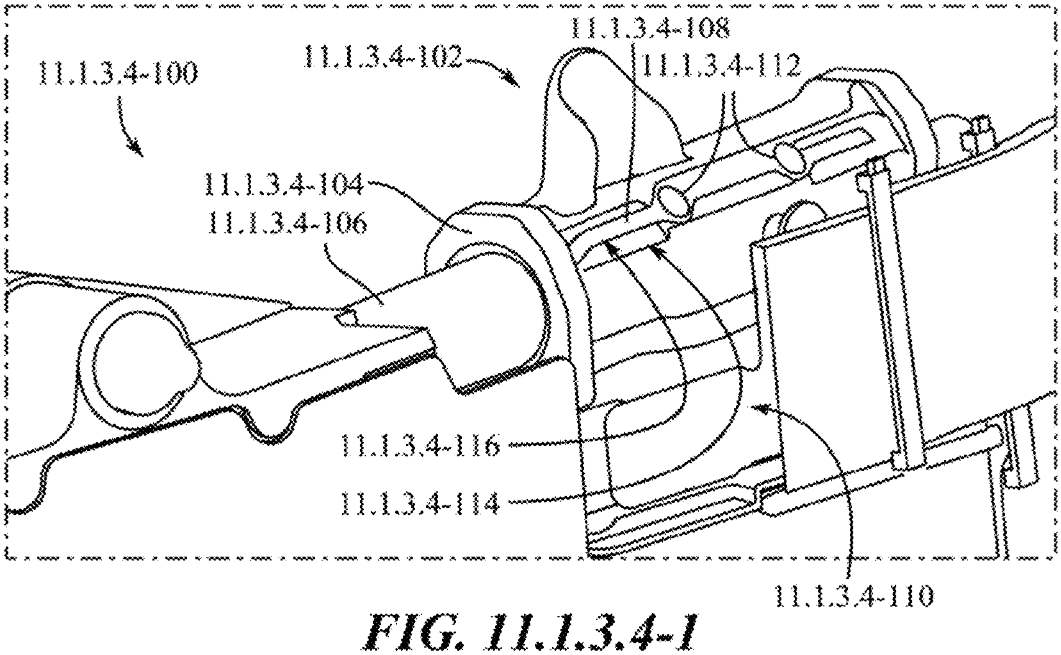
*FIG. 11.1.3.4-1*
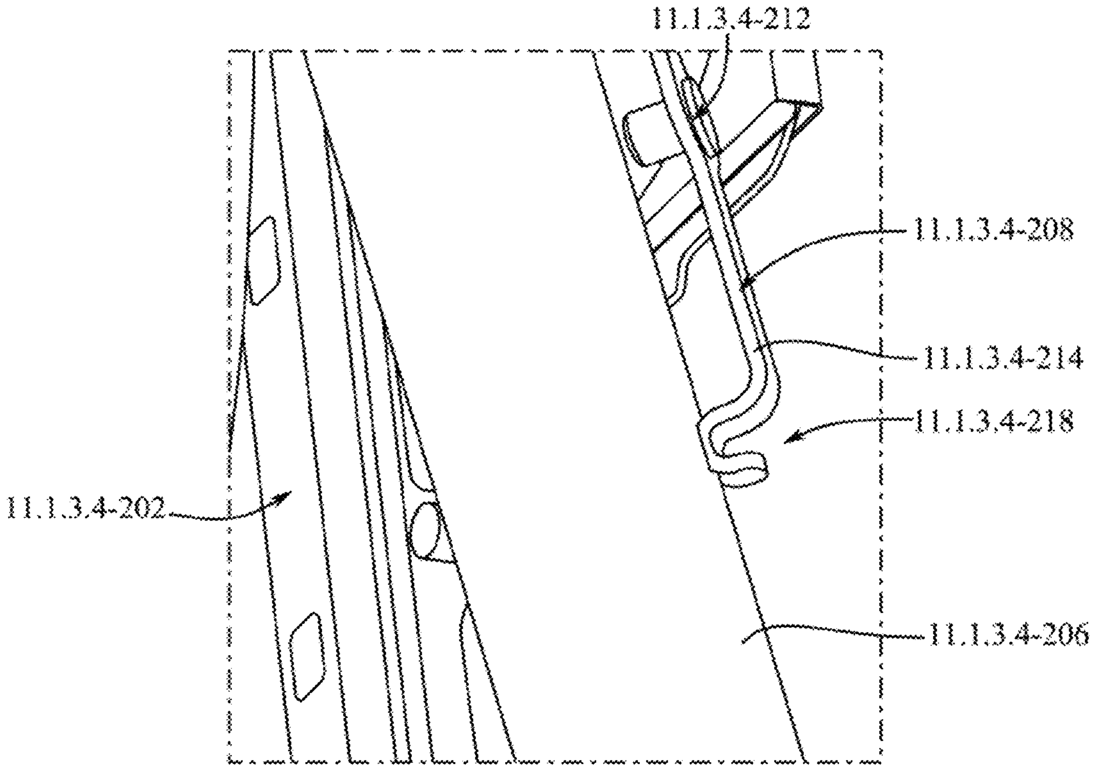
*FIG. 11.1.3.4-2*

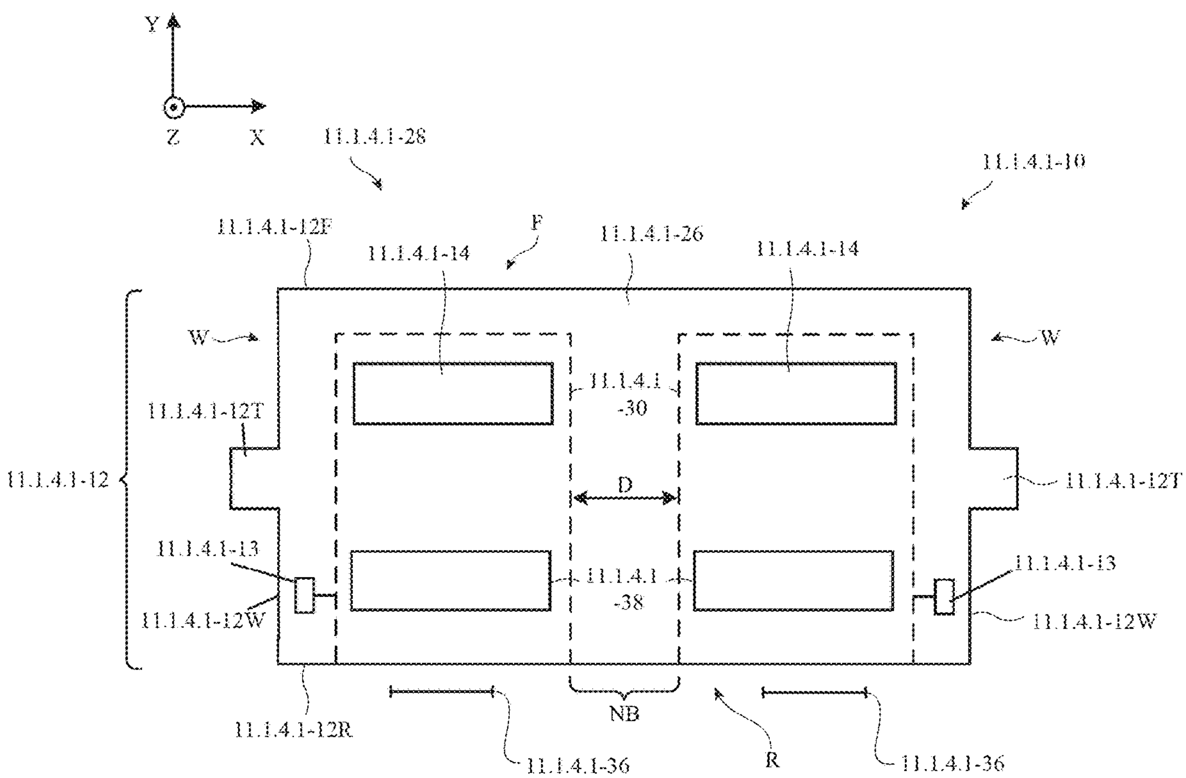
FIG. 11.1.4.1-1

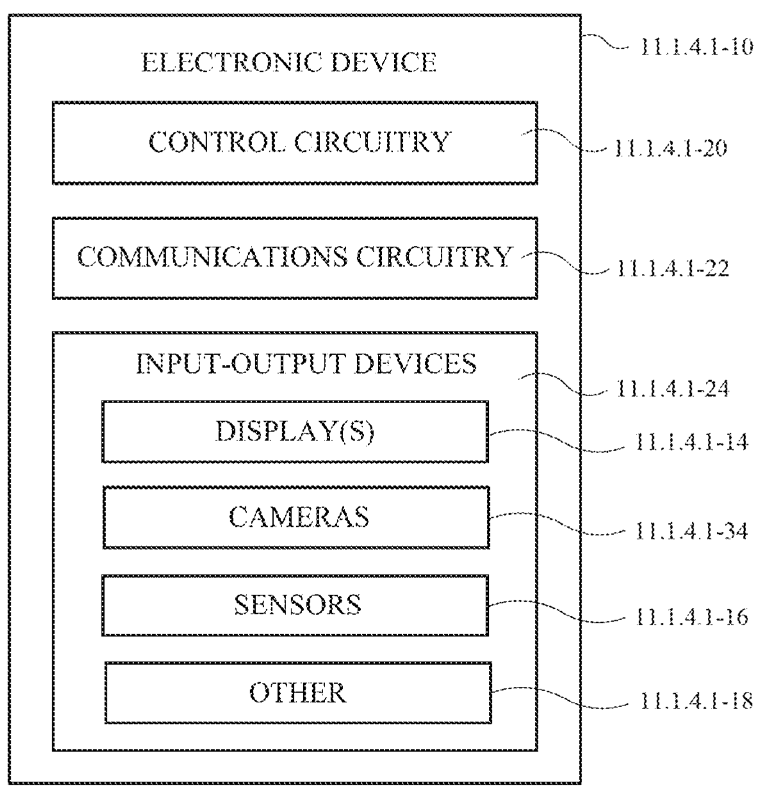
*FIG. 11.1.4.1-2*

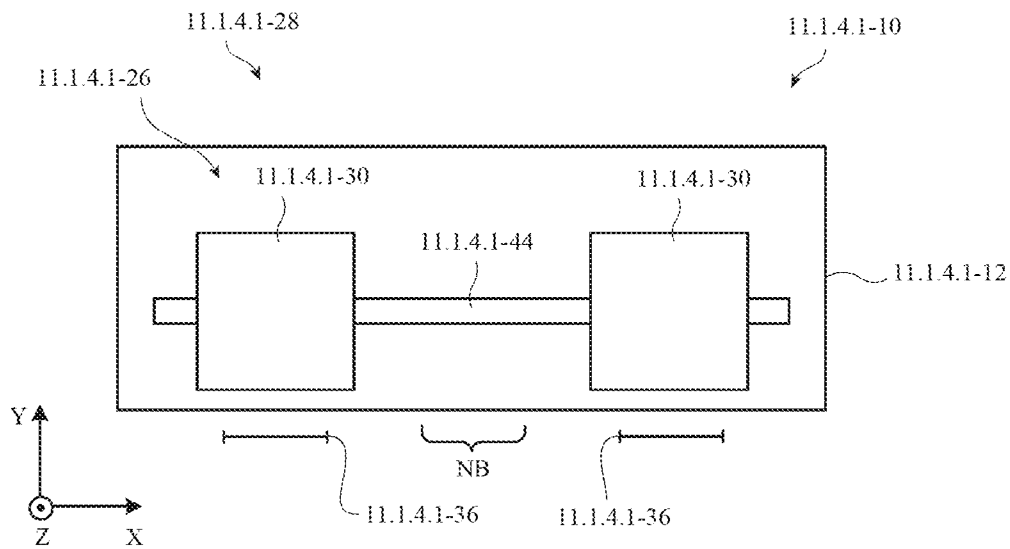
*FIG. 11.1.4.1-3*
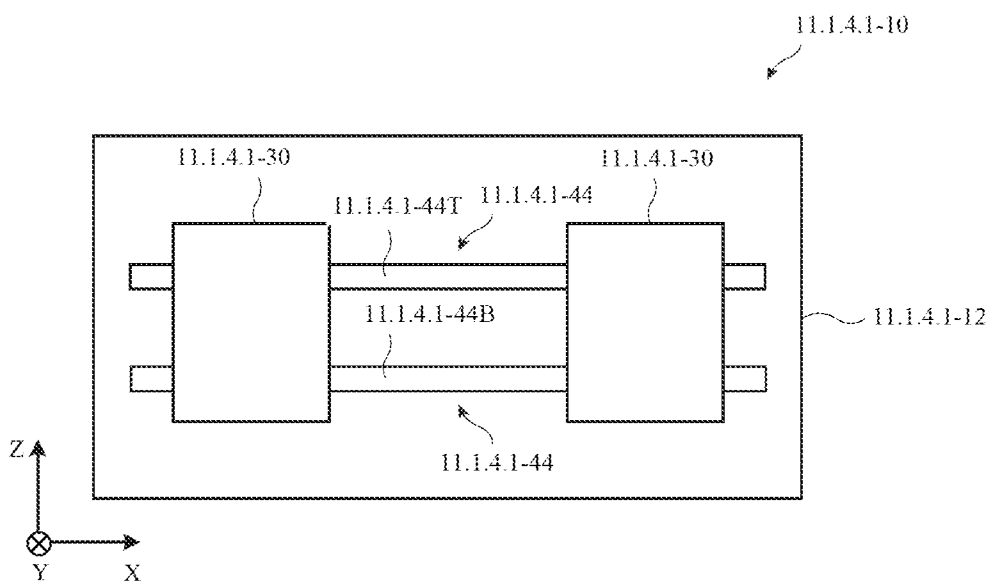
*FIG. 11.1.4.1-4*

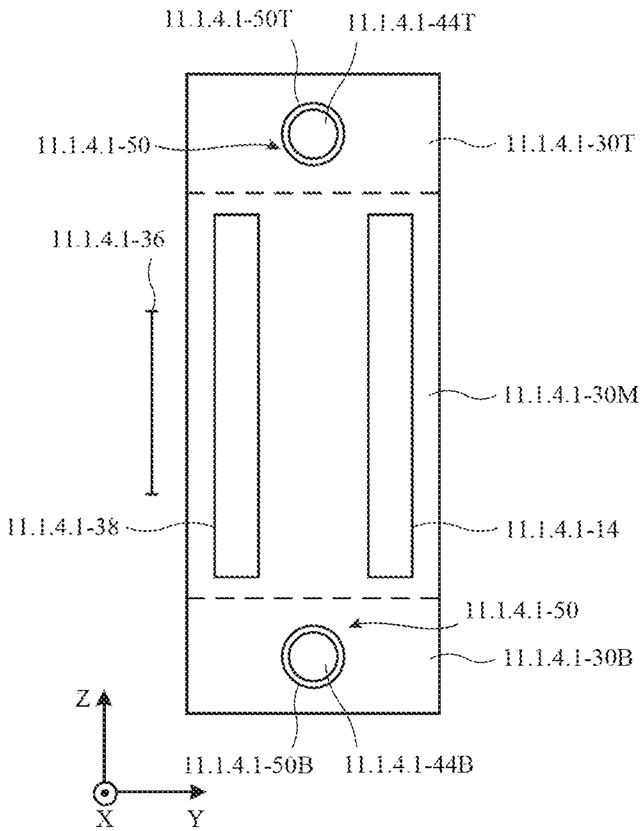
*FIG. 11.1.4.1-5*

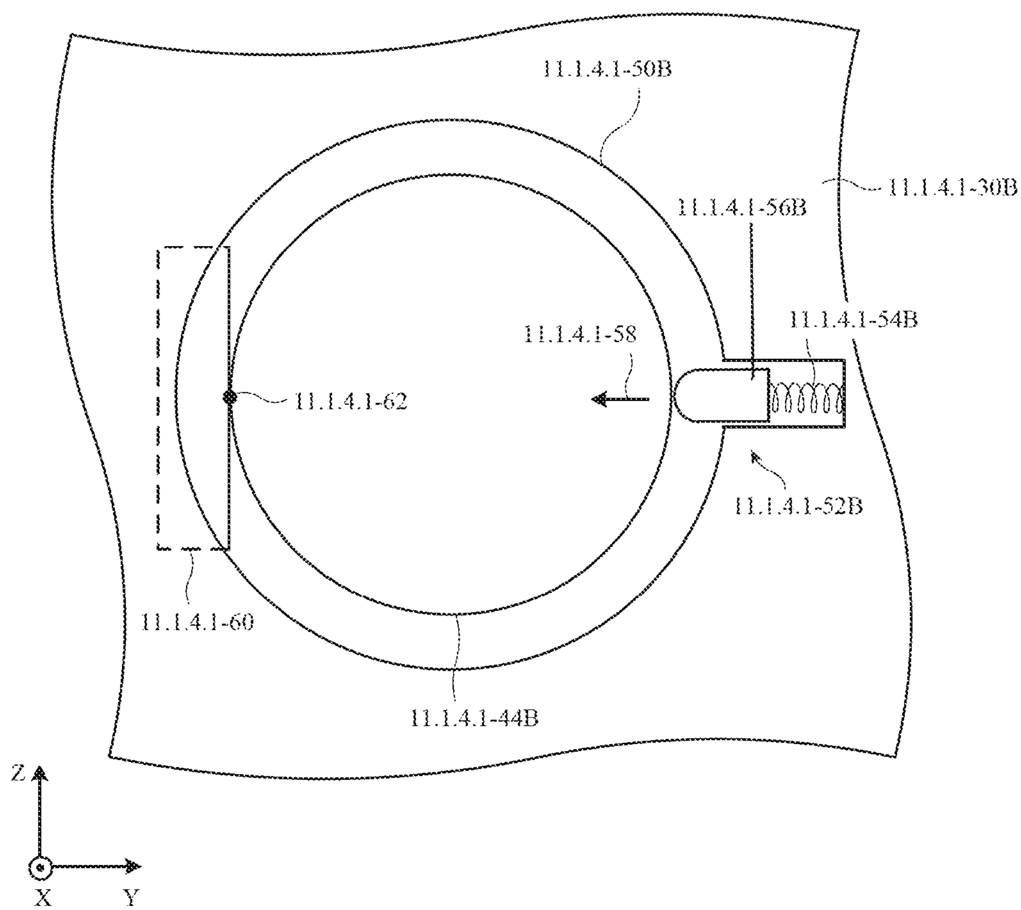
*FIG. 11.1.4.1-6A*

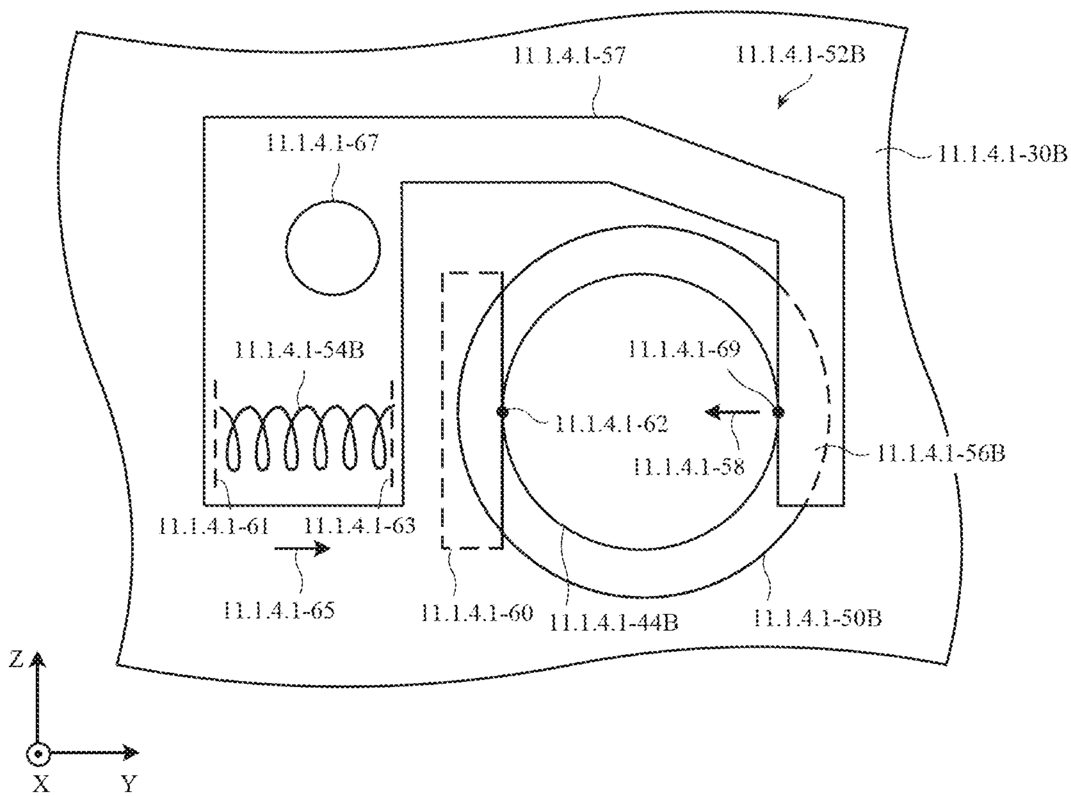
*FIG. 11.1.4.1-6B*

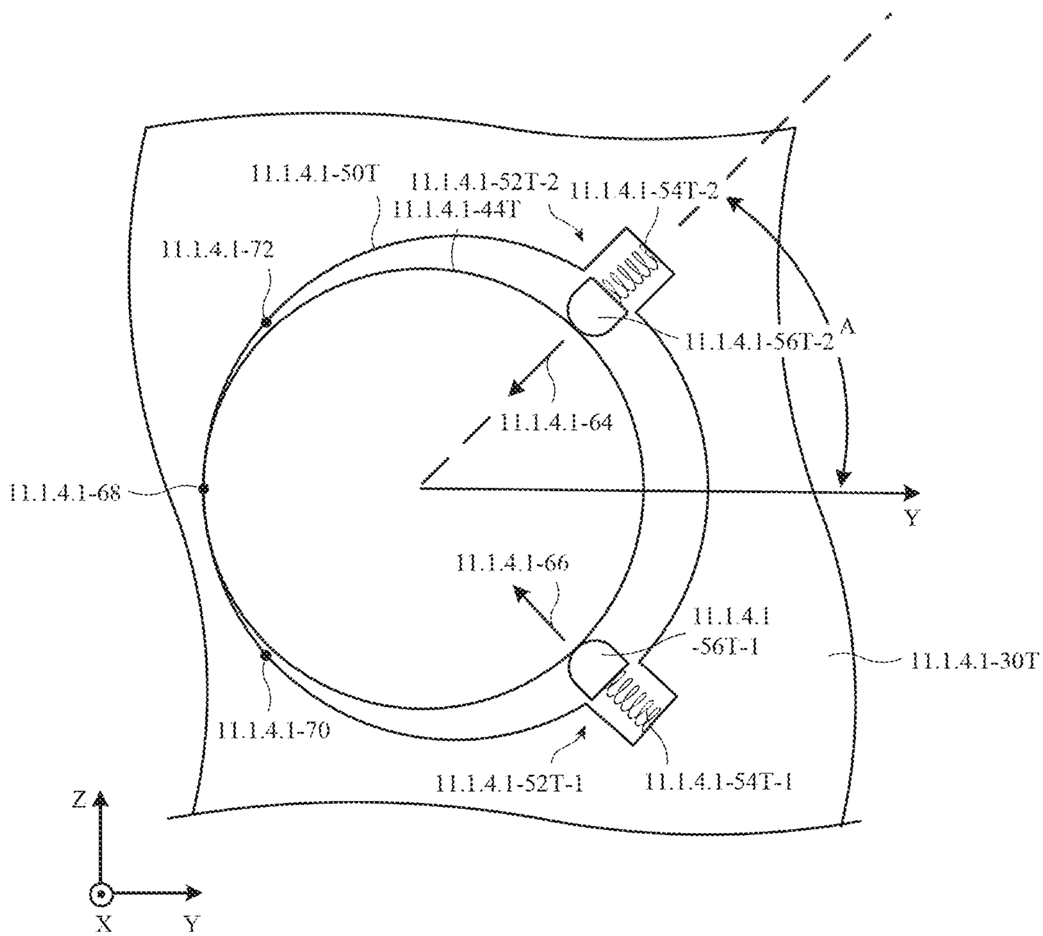
*FIG. 11.1.4.1-7*

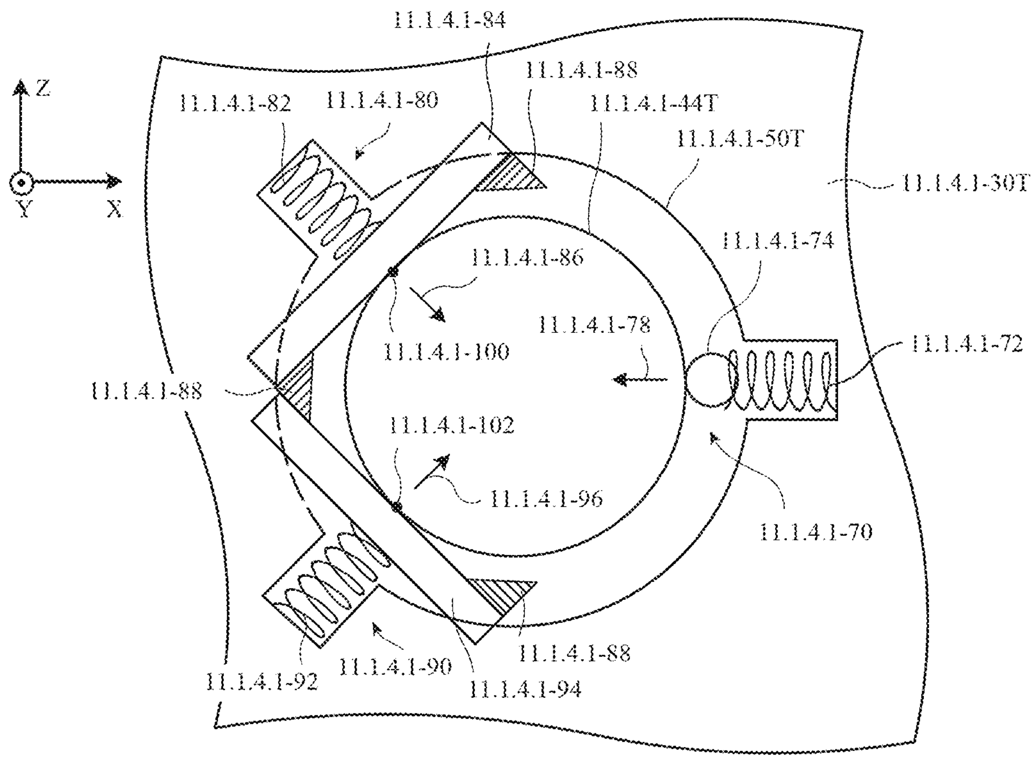
*FIG. 11.1.4.1-8*
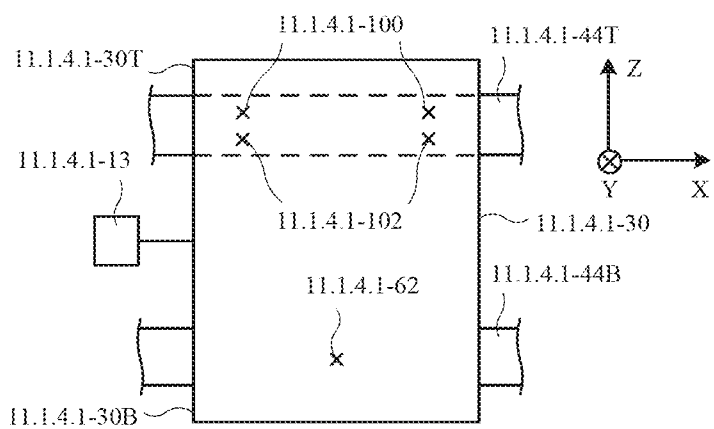
*FIG. 11.1.4.1-9*

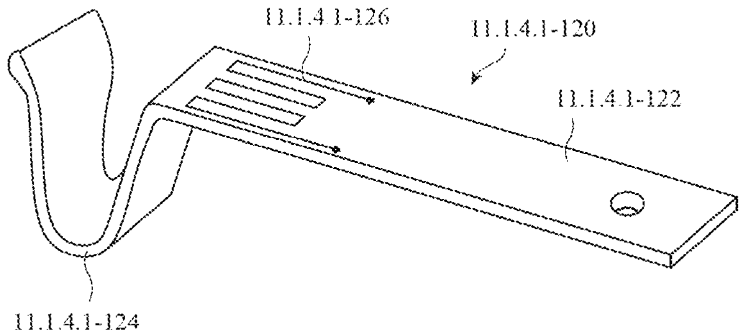
FIG. 11.1.4.1-10
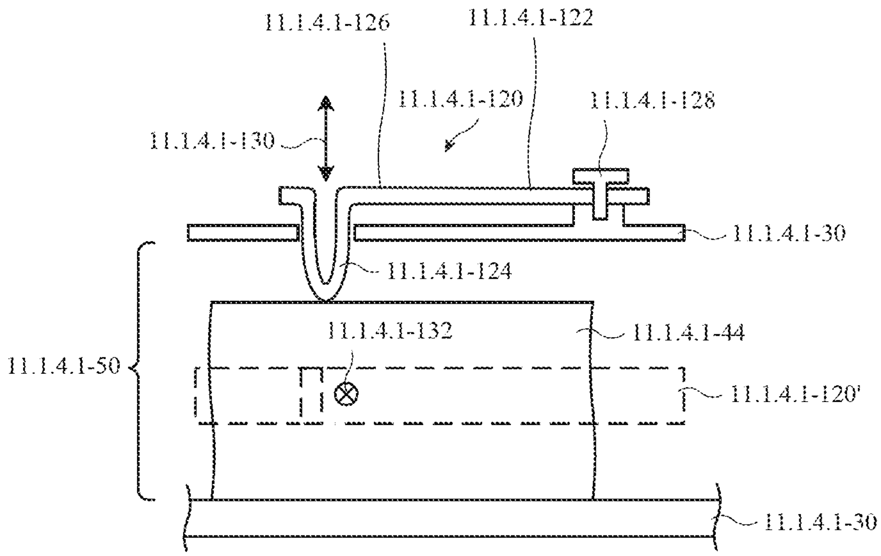
FIG. 11.1.4.1-11

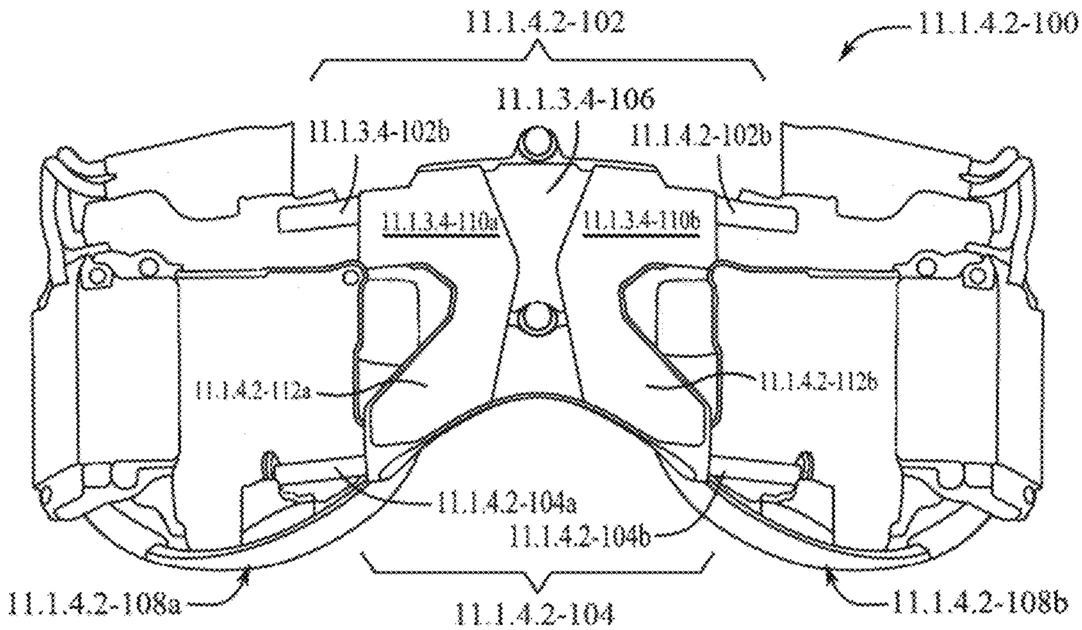
*FIG. 11.1.4.2-1*

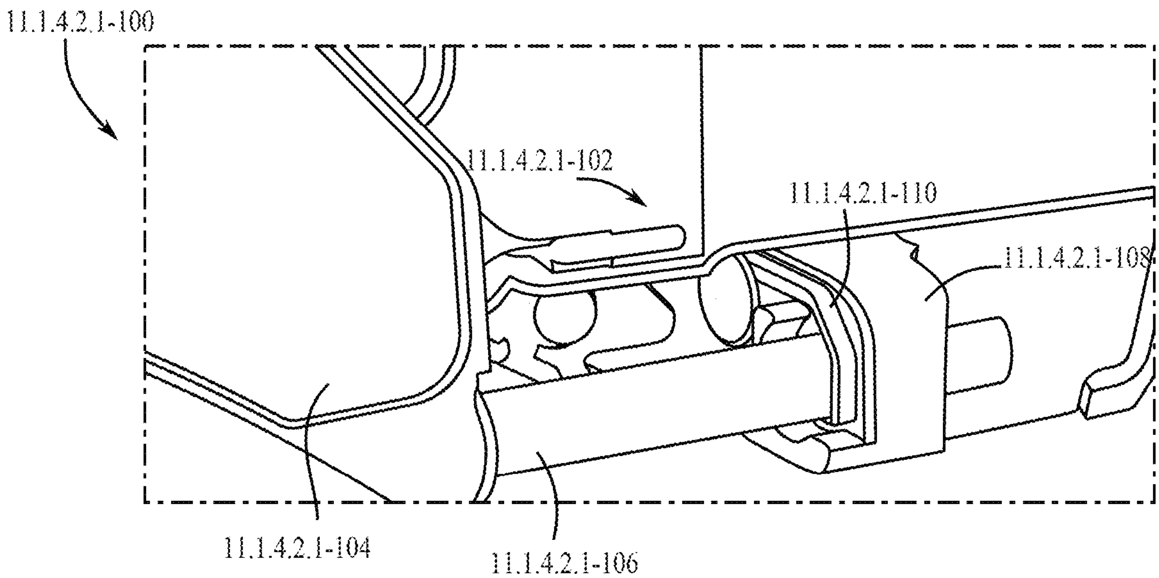
*FIG. 11.1.4.2.1-1*

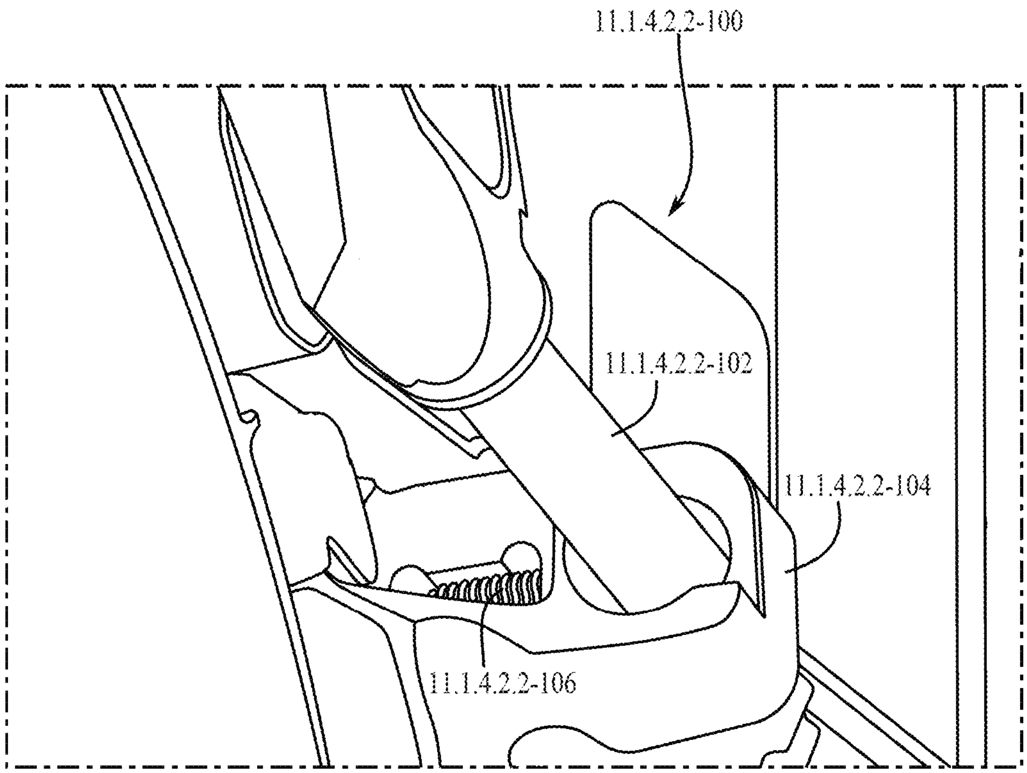
*FIG. 11.1.4.2.2-1*

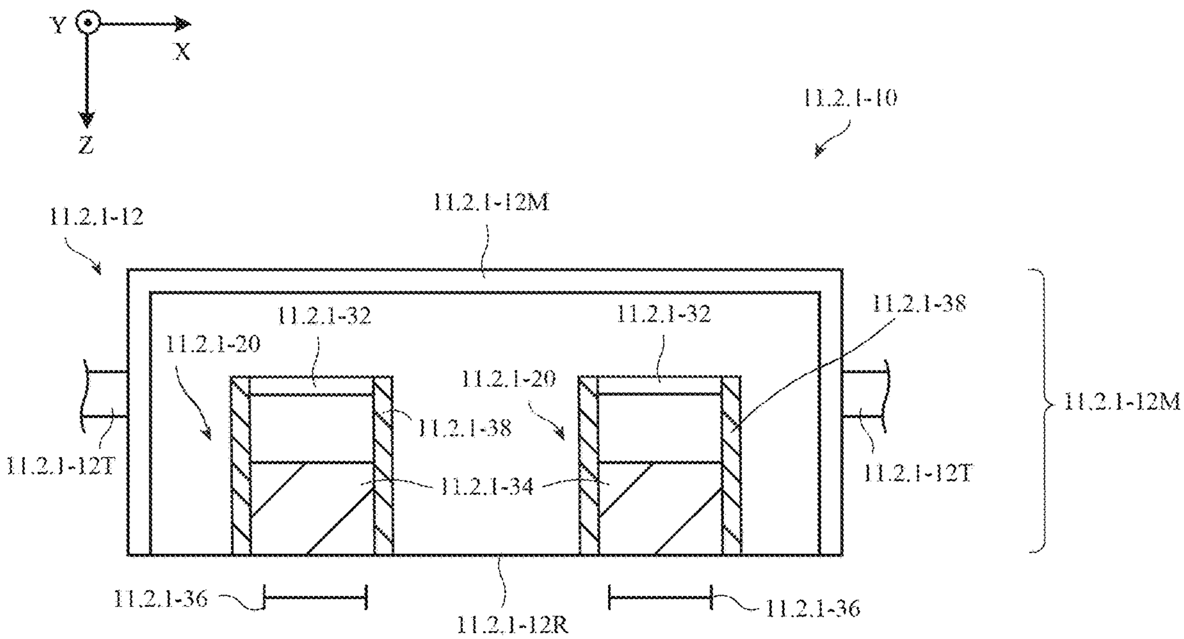
*FIG. 11.2.1-1*

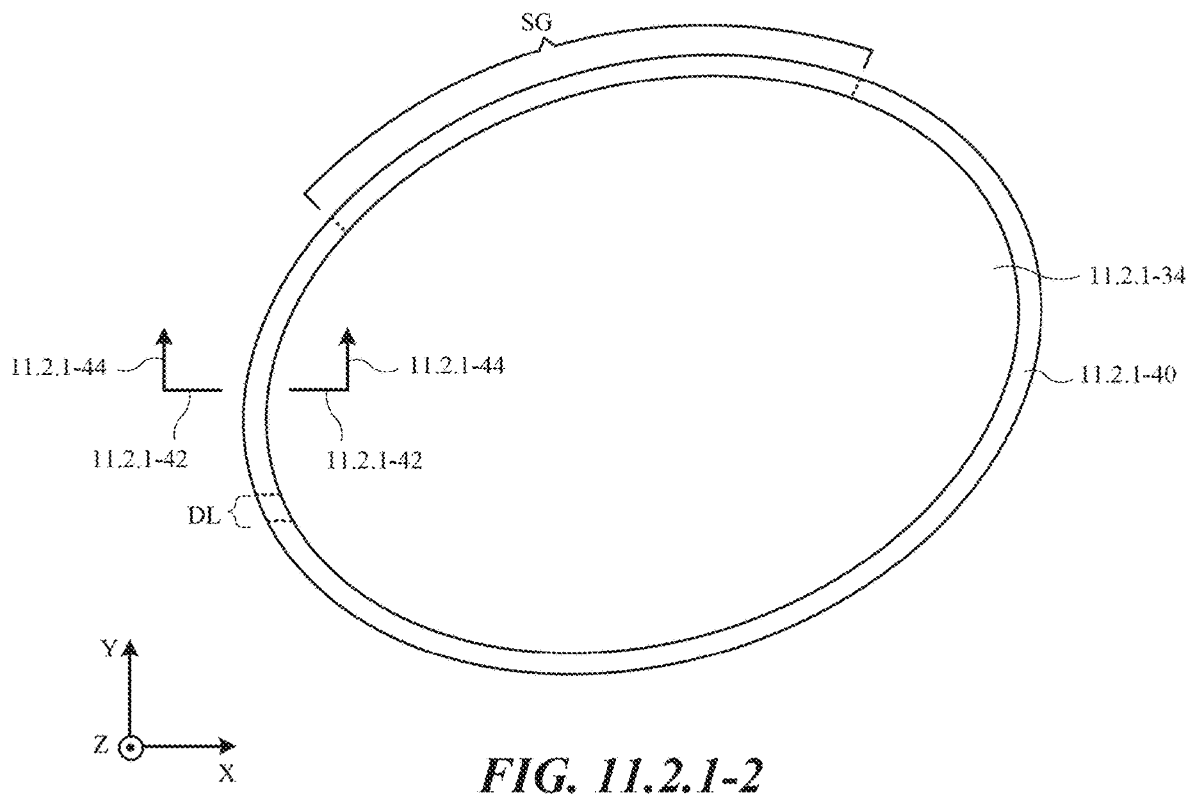
*FIG. 11.2.1-2*
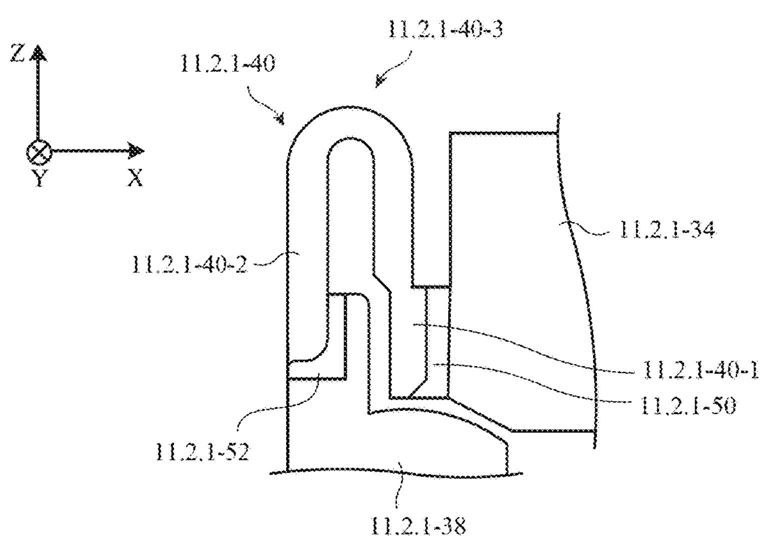
*FIG. 11.2.1-3*

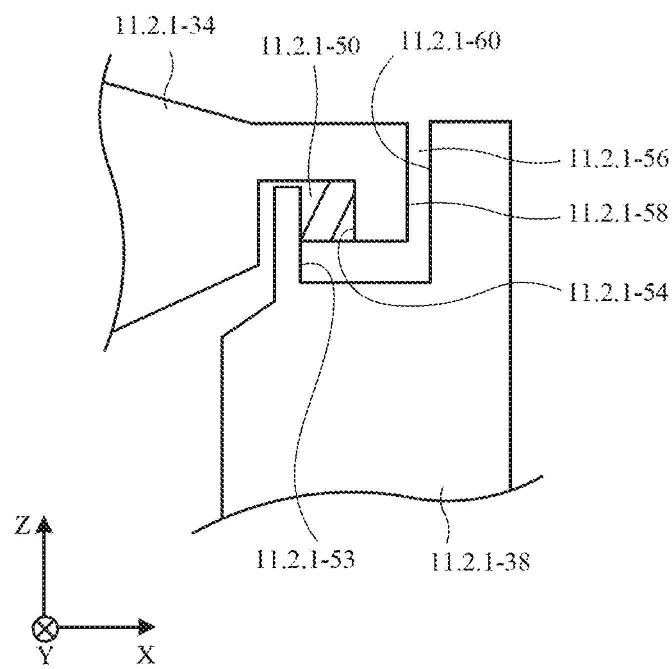
FIG. 11.2.1-4

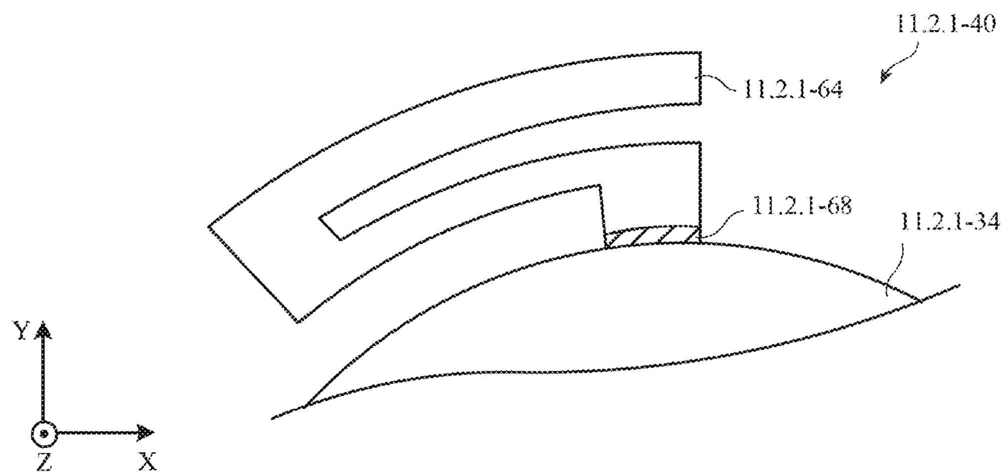
FIG. 11.2.1-5
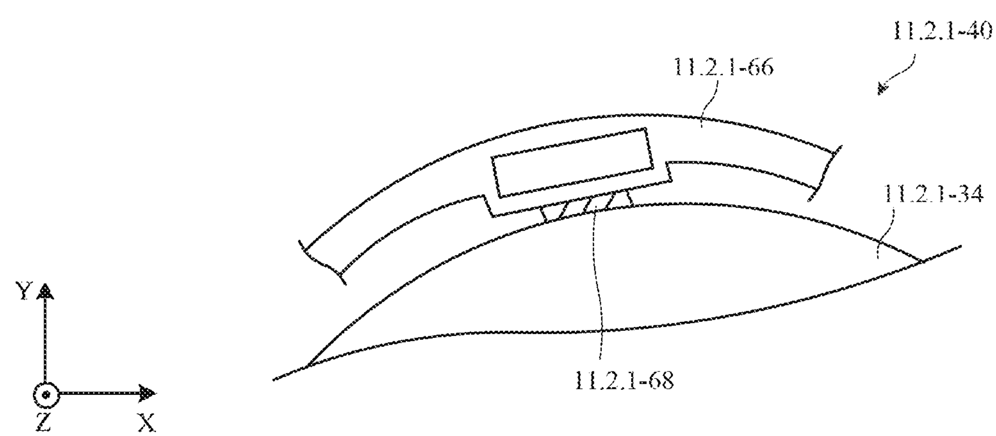
FIG. 11.2.1-6

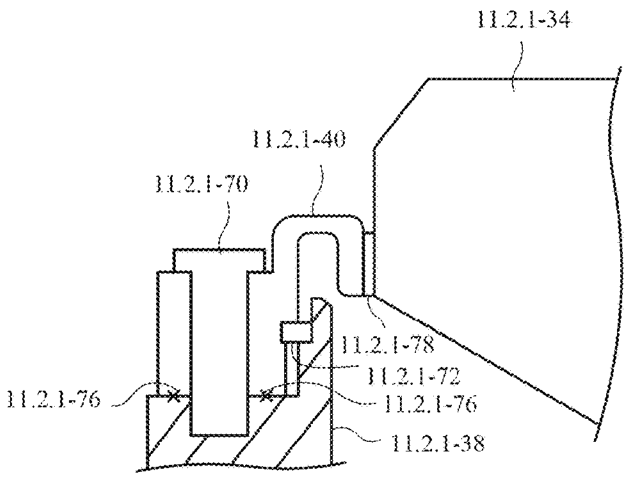
FIG. 11.2.1-7
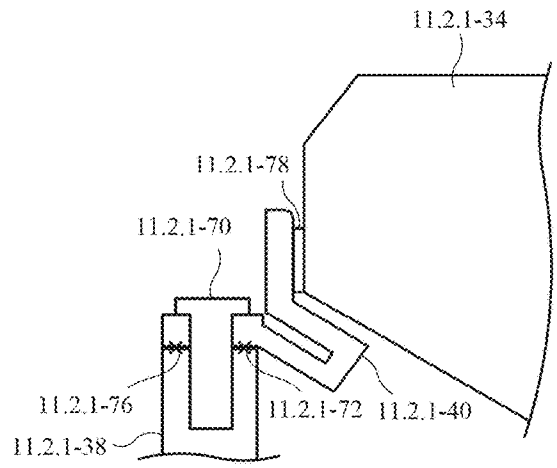
FIG. 11.2.1-8
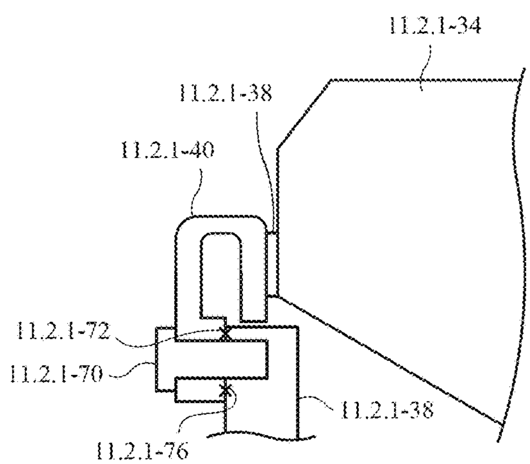
FIG. 11.2.1-9
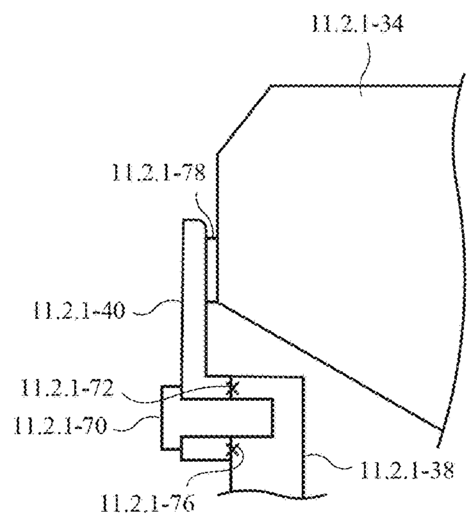
FIG. 11.2.1-10

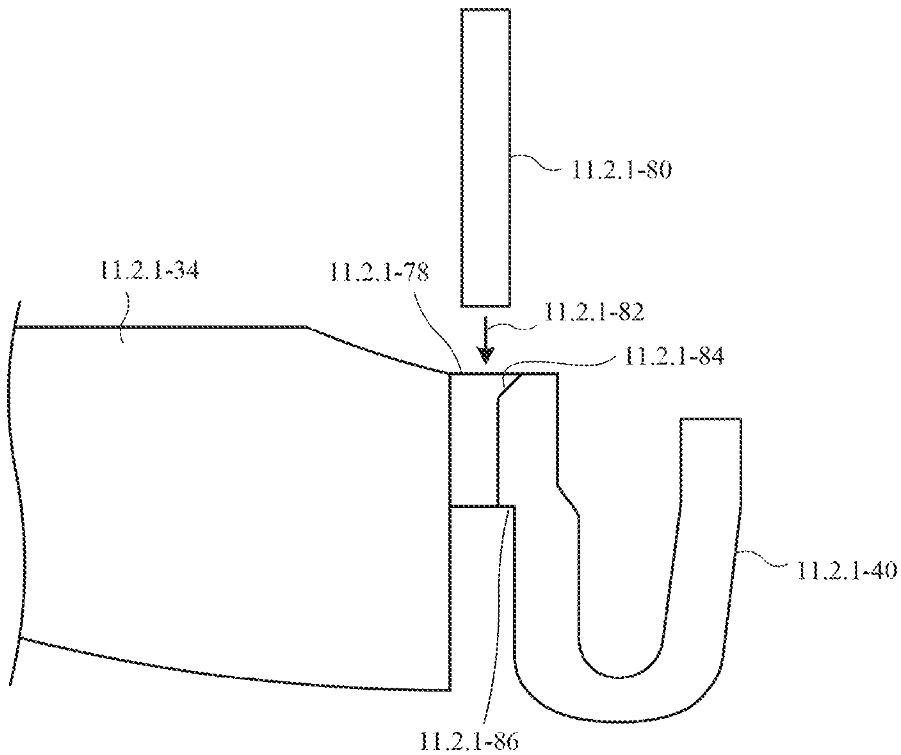
*FIG. 11.2.1-11*

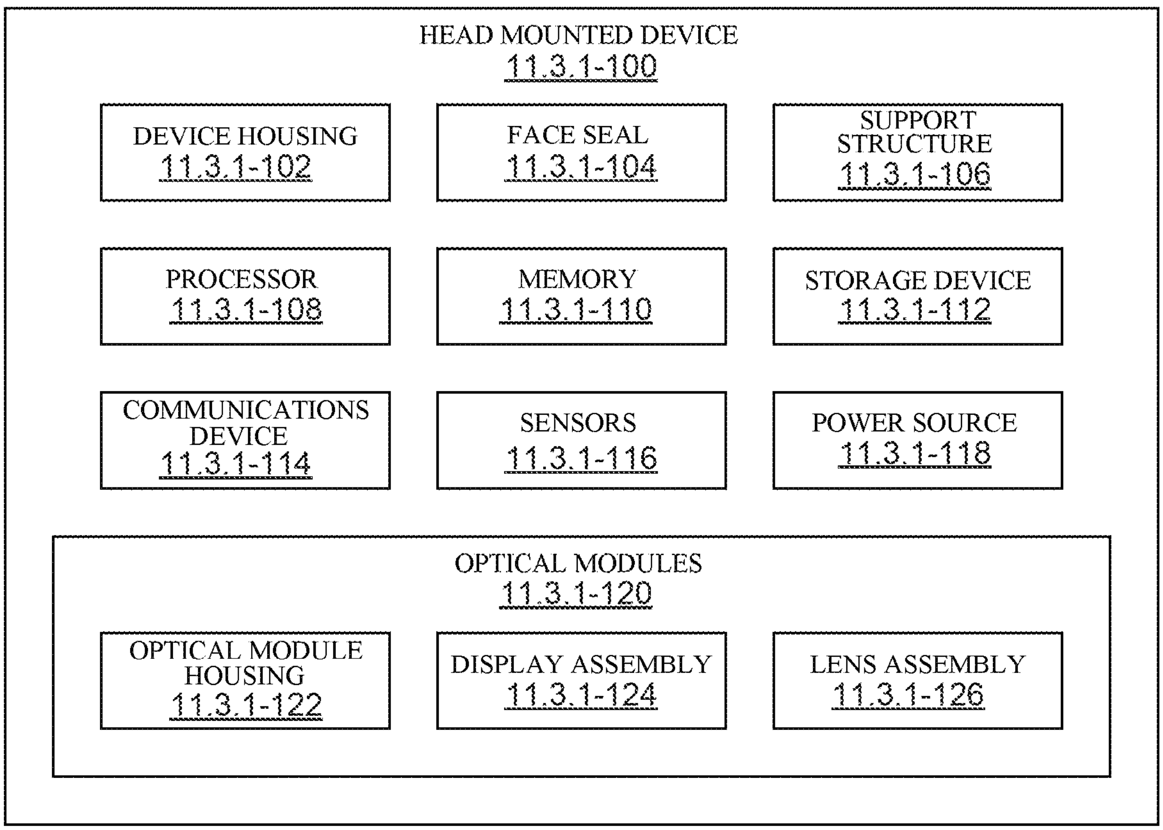
FIG. 11.3.1-1

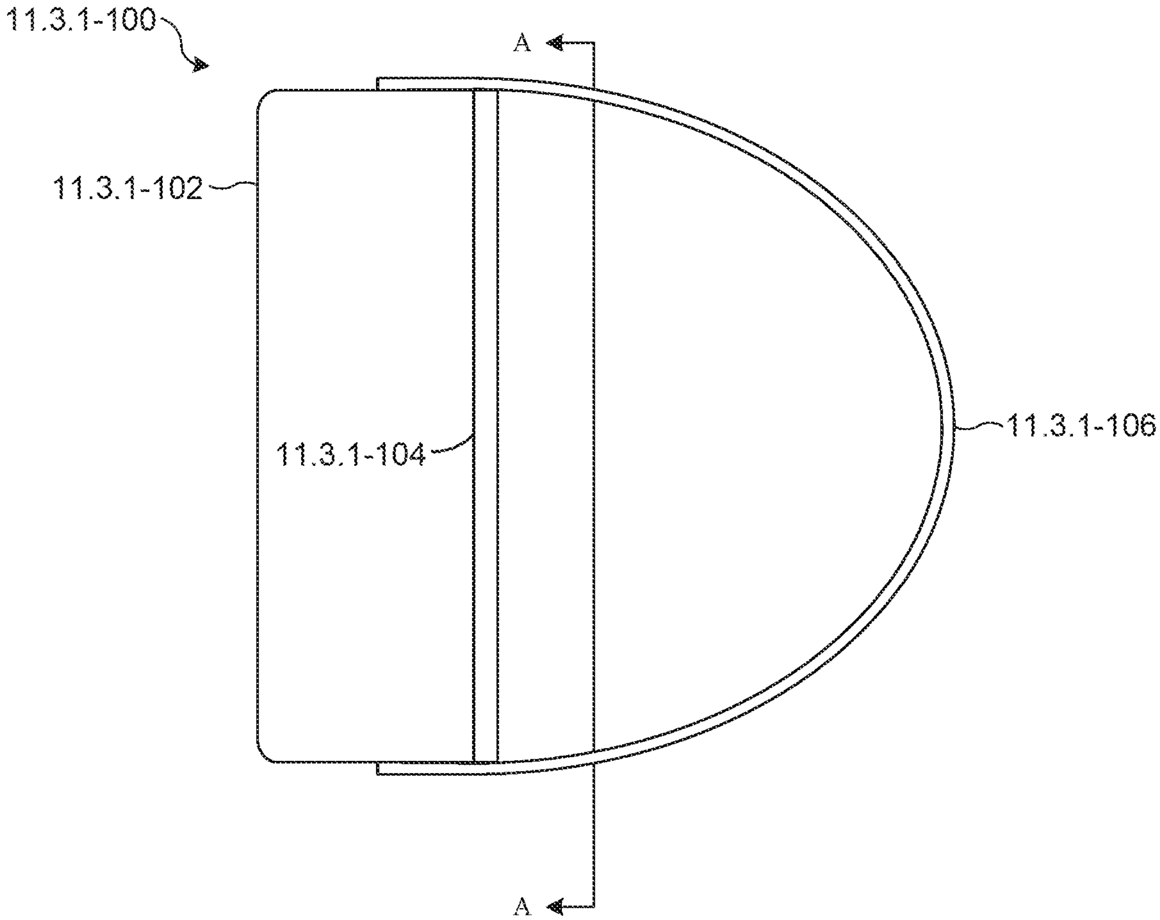
FIG. 11.3.1-2
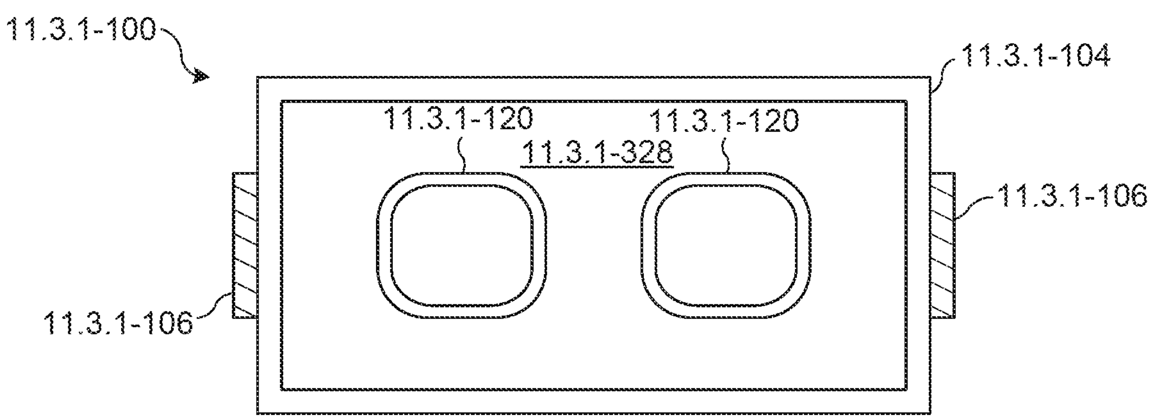
FIG. 11.3.1-3

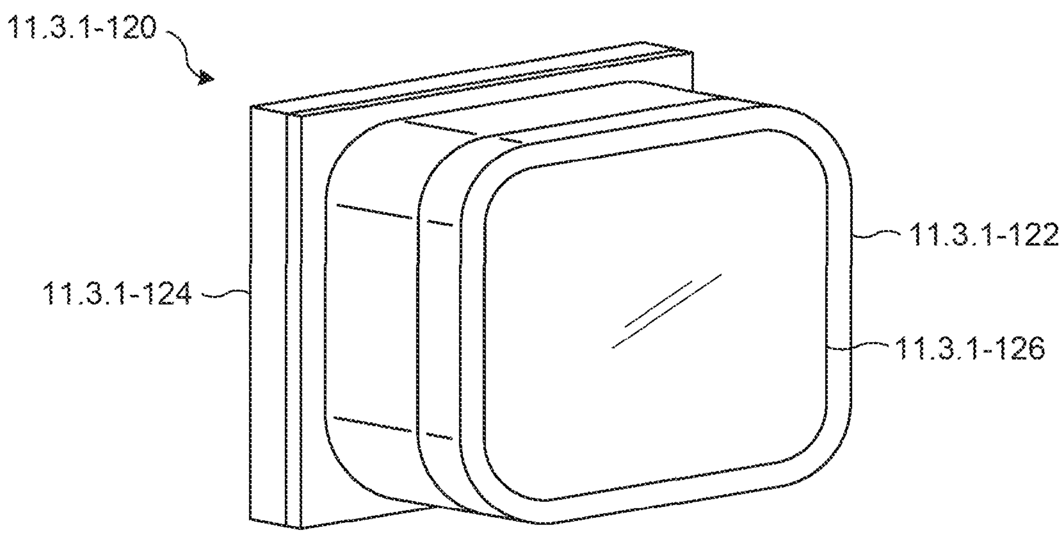
*FIG. 11.3.1-4*

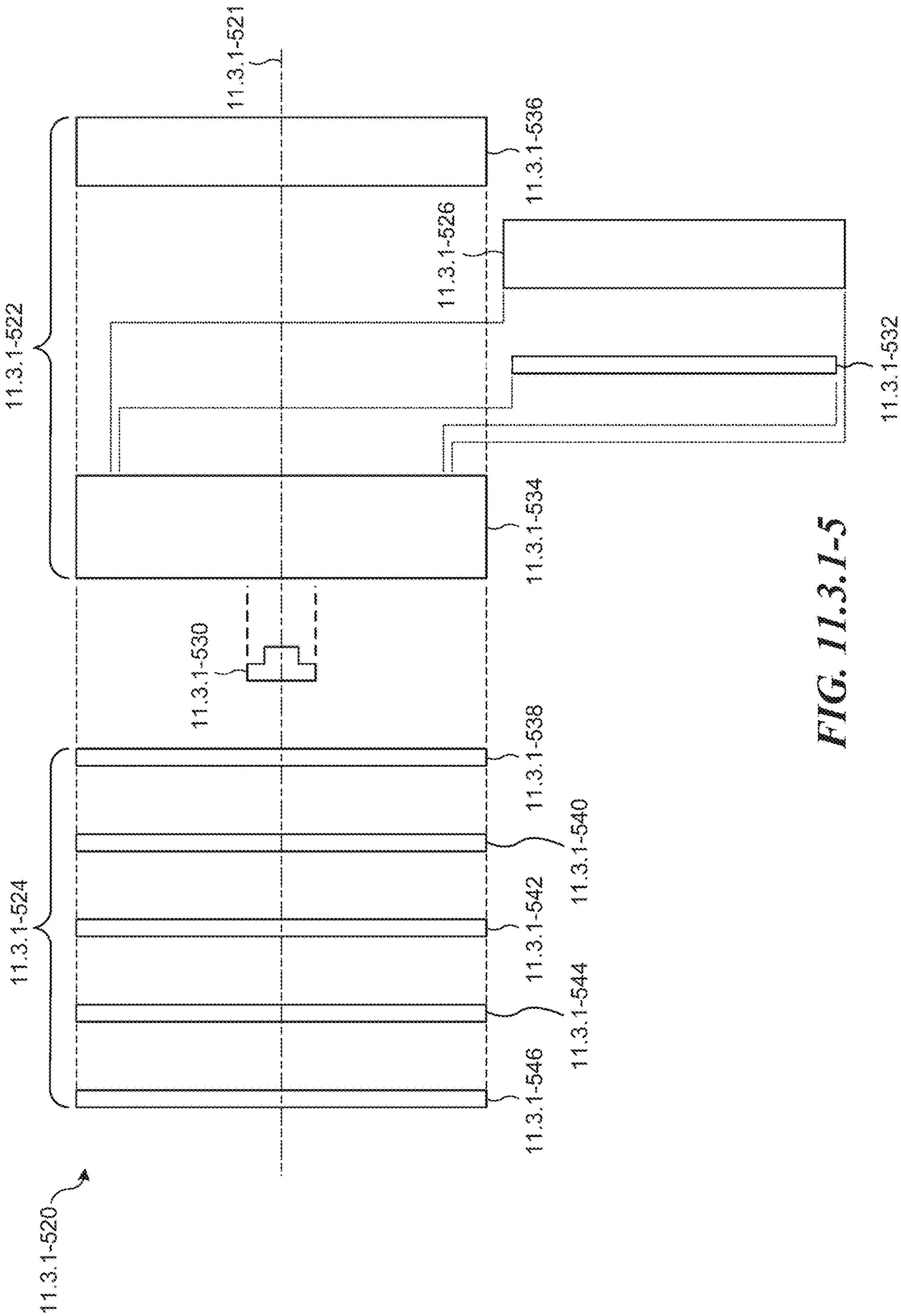
FIG. 11.3.1-5

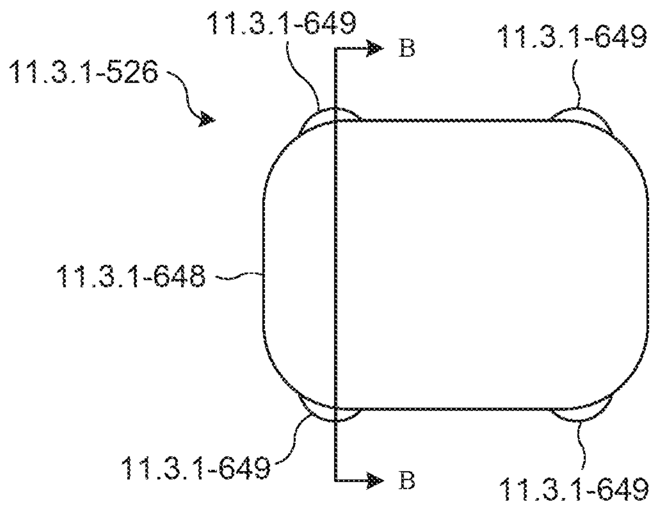
FIG. 11.3.1-6
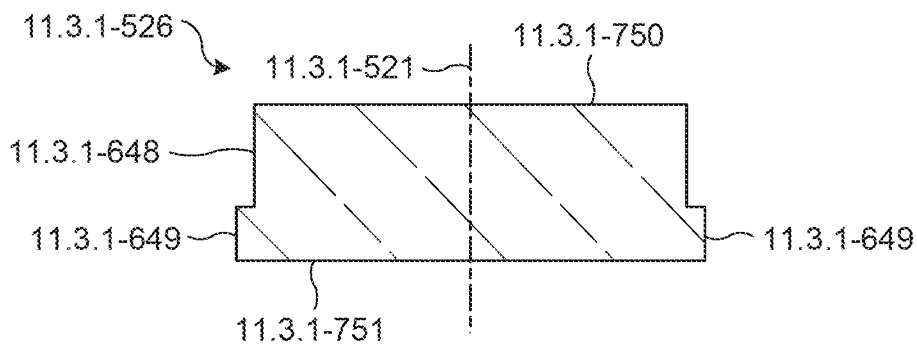
FIG. 11.3.1-7

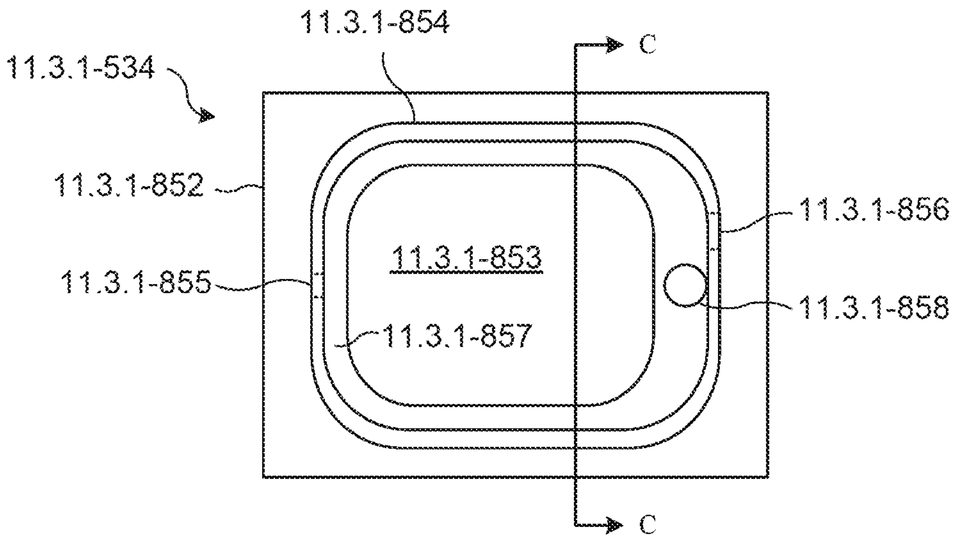
*FIG. 11.3.1-8*
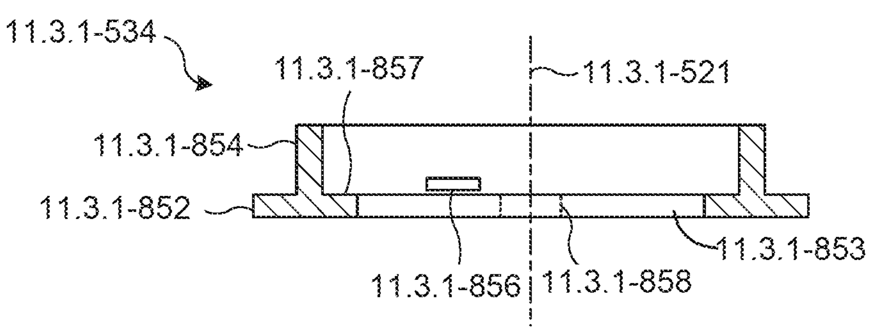
*FIG. 11.3.1-9*

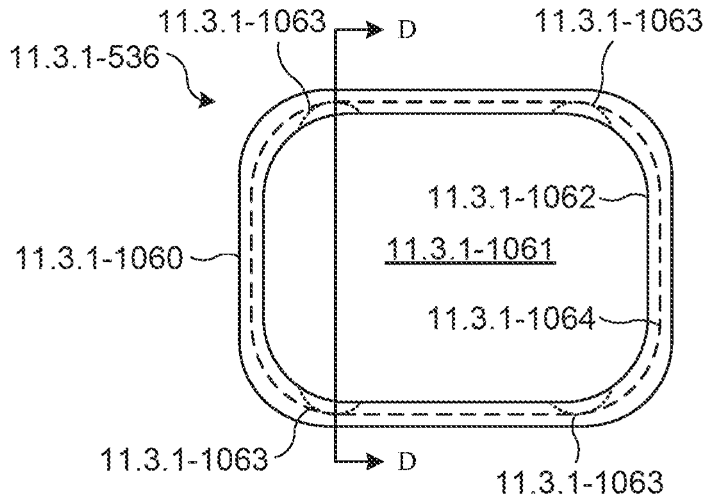
*FIG. 11.3.1-10*
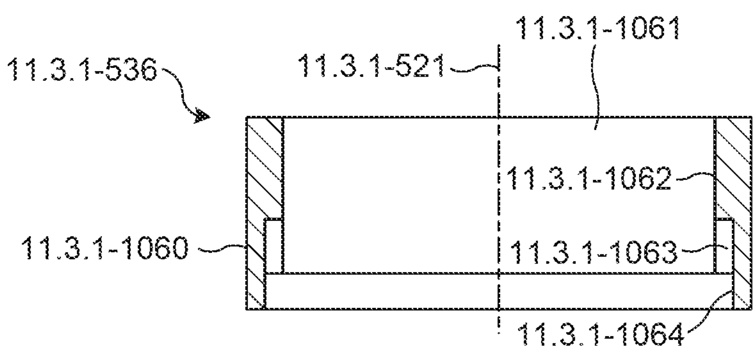
*FIG. 11.3.1-11*

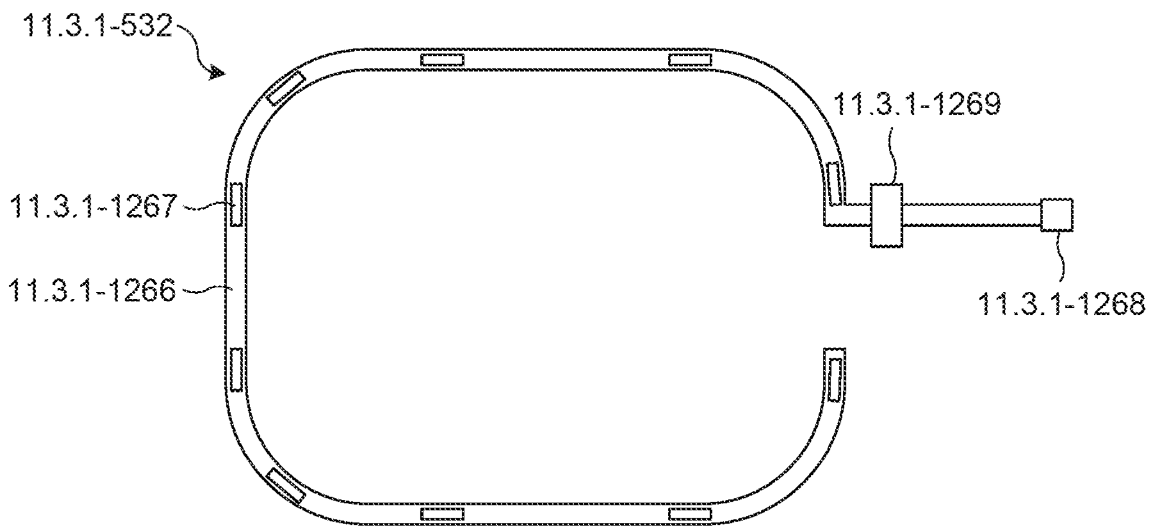
*FIG. 11.3.1-12*
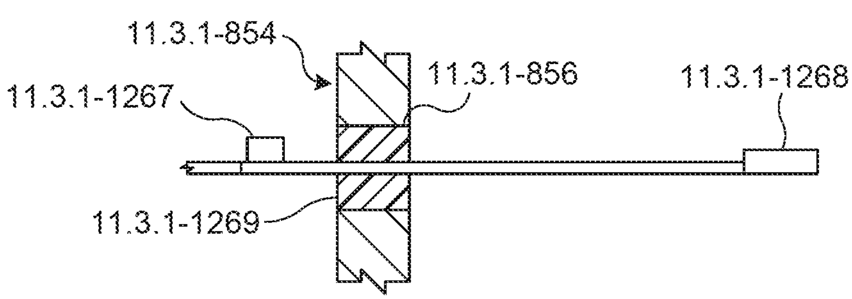
*FIG. 11.3.1-13*

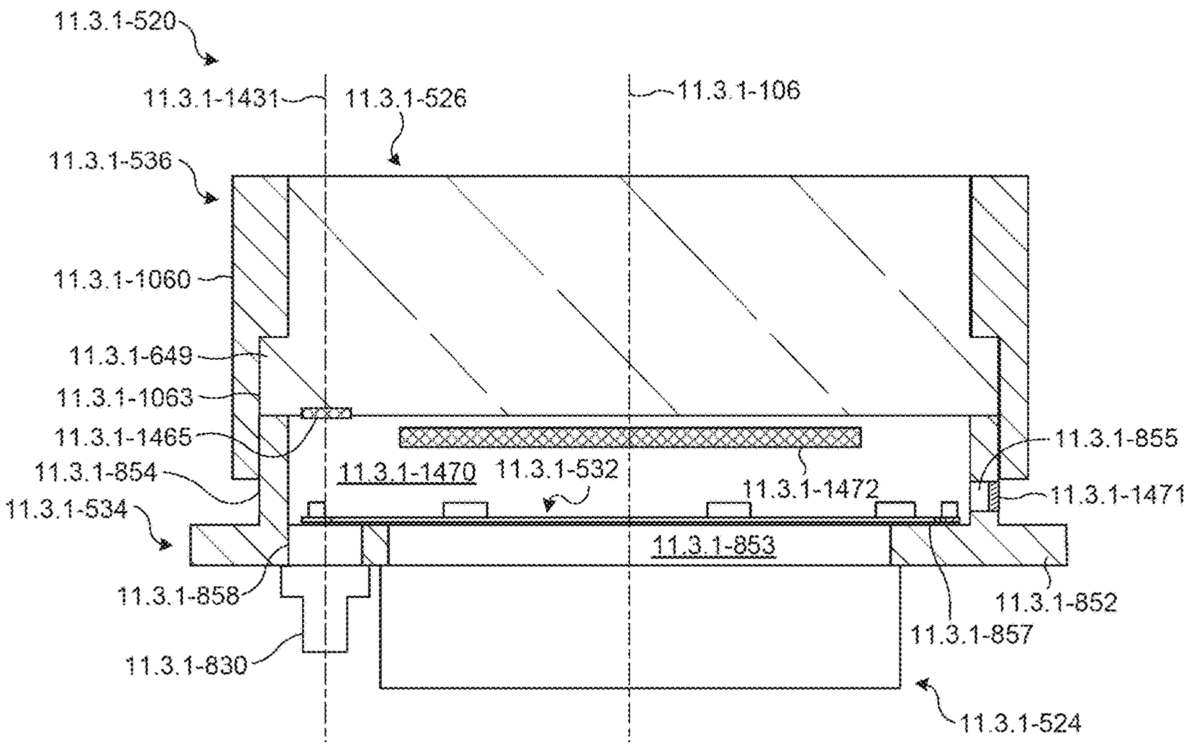
*FIG. 11.3.1-14*

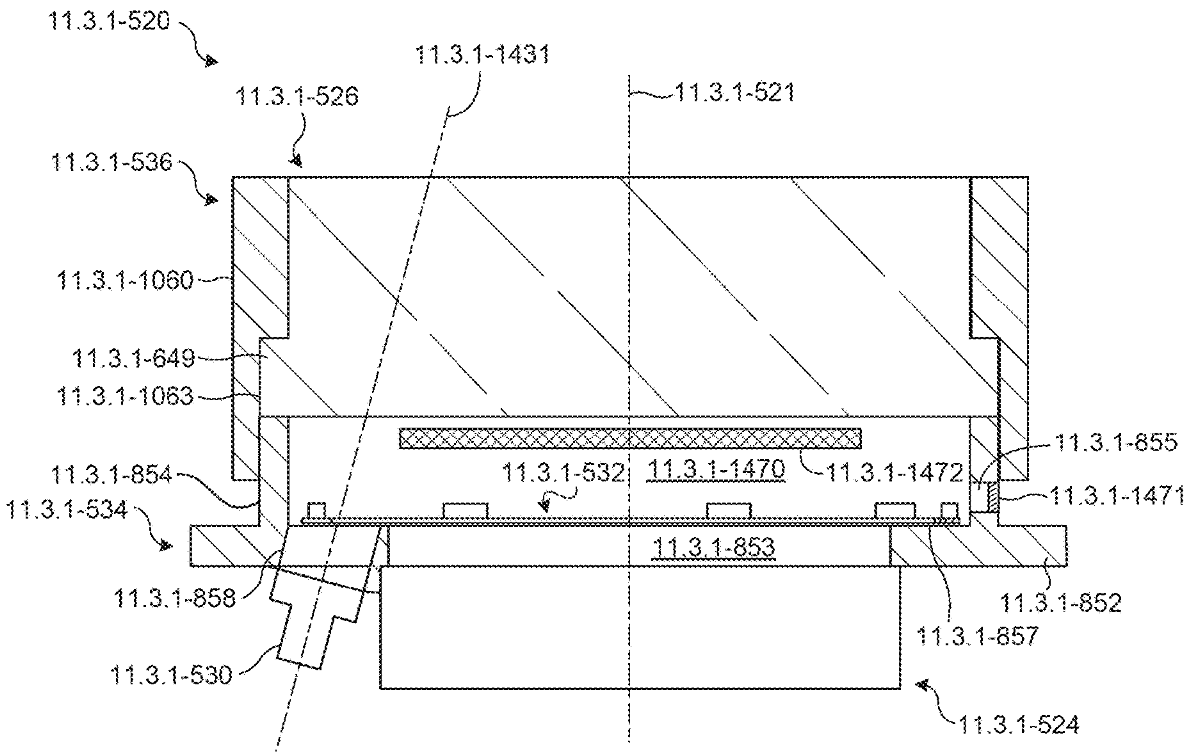
*FIG. 11.3.1-15*

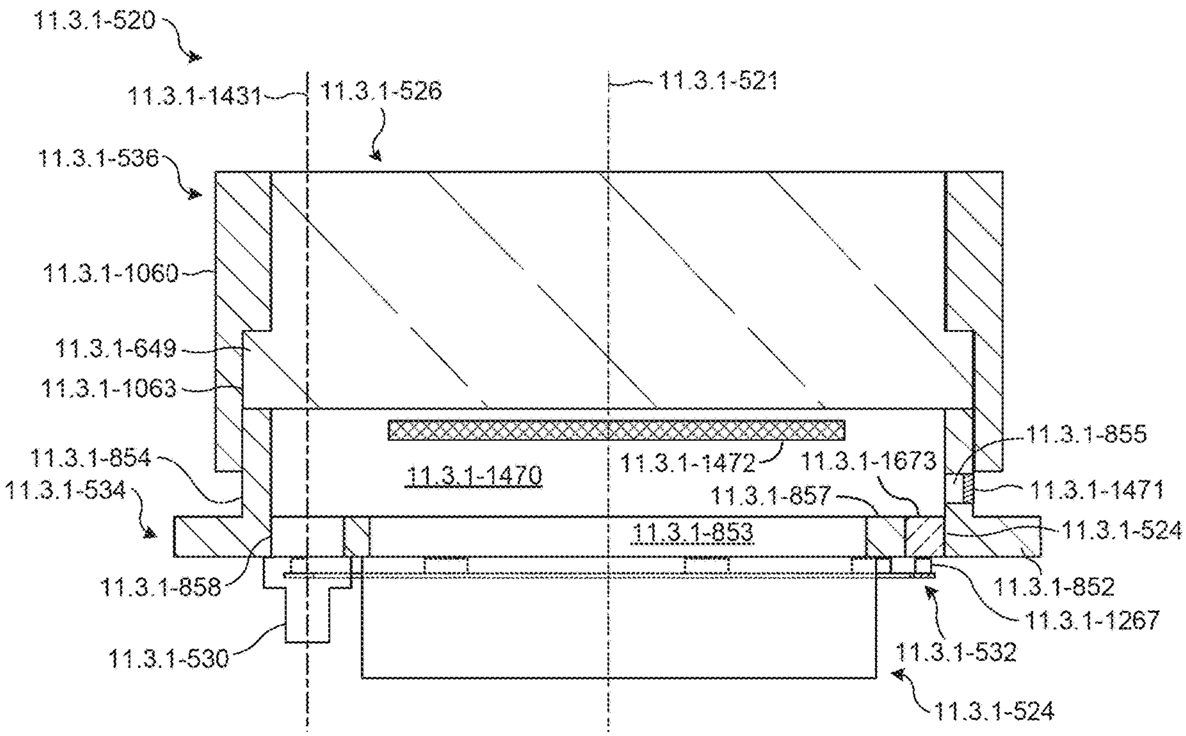
*FIG. 11.3.1-16*

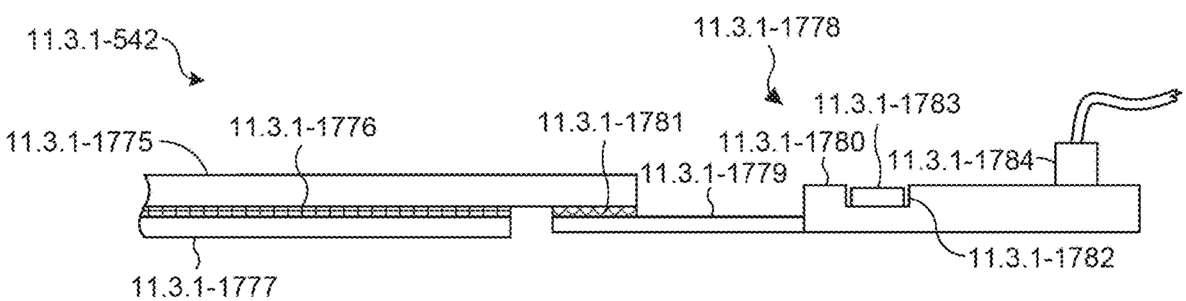
*FIG. 11.3.1-17*

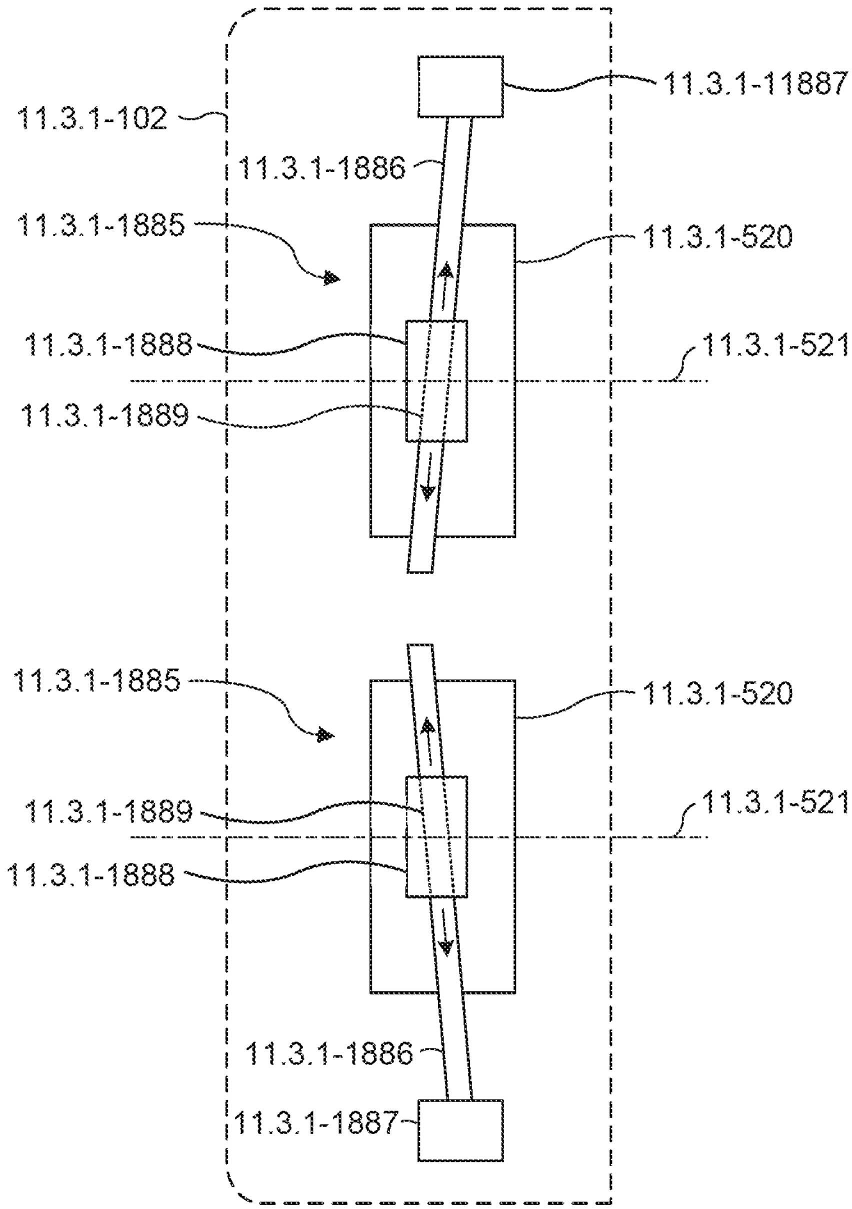
*FIG. 11.3.1-18*

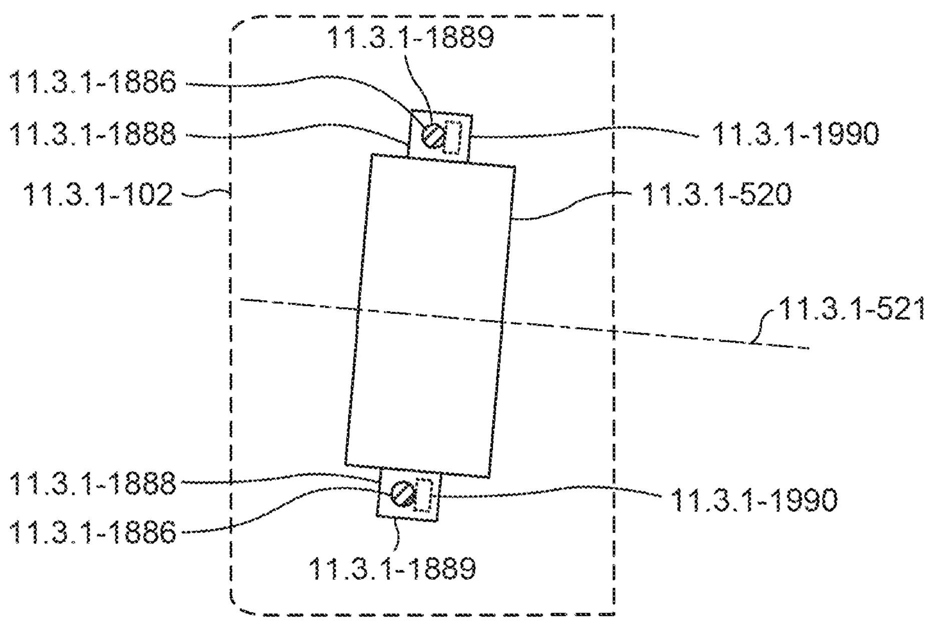
*FIG. 11.3.1-19*

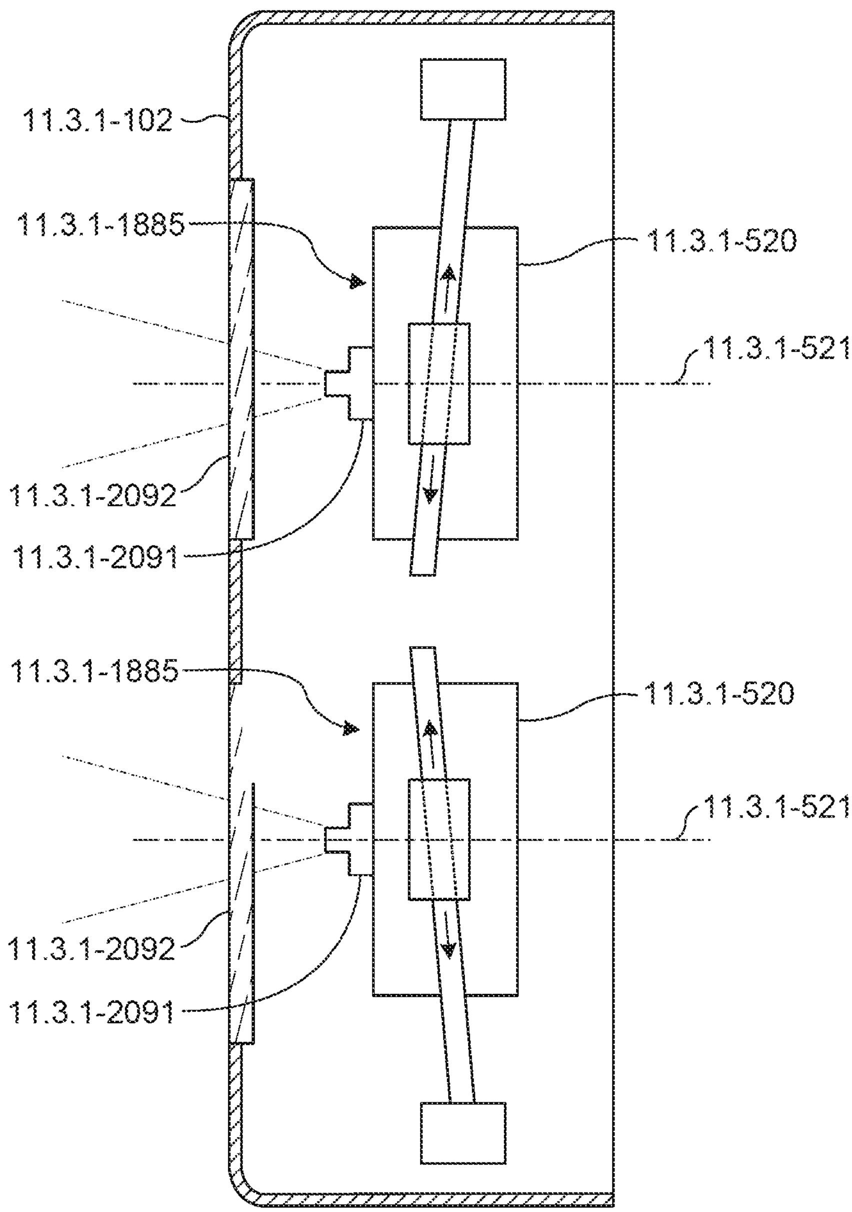
*FIG. 11.3.1-20*

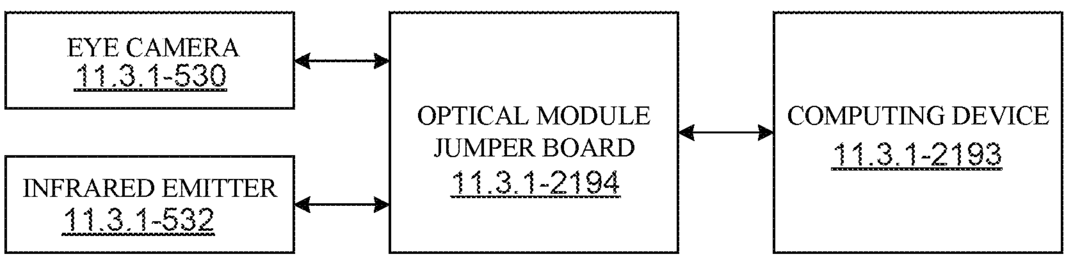
*FIG. 11.3.1-21*

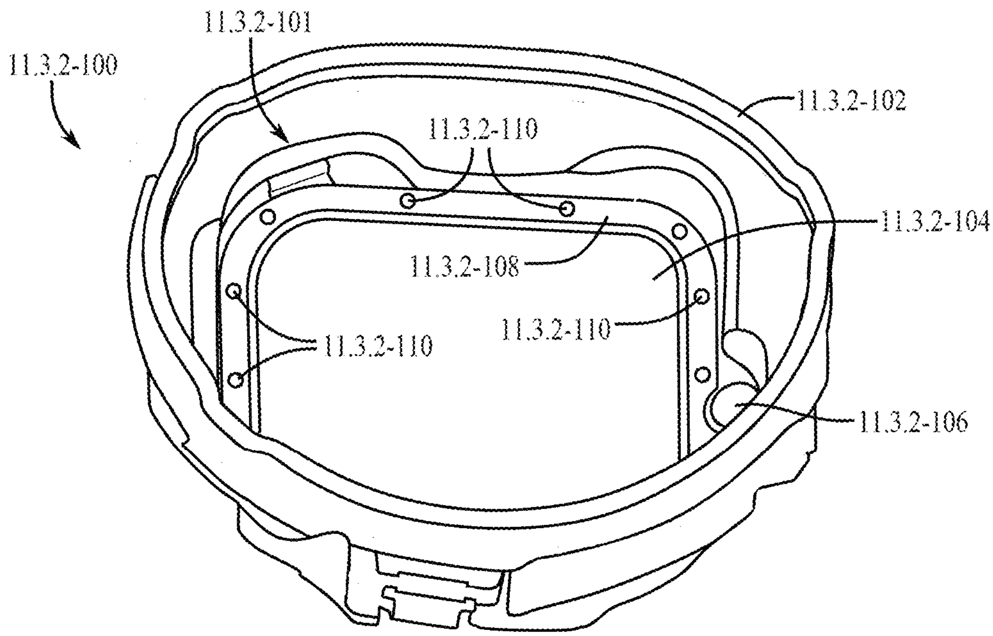
*FIG. 11.3.2-1*

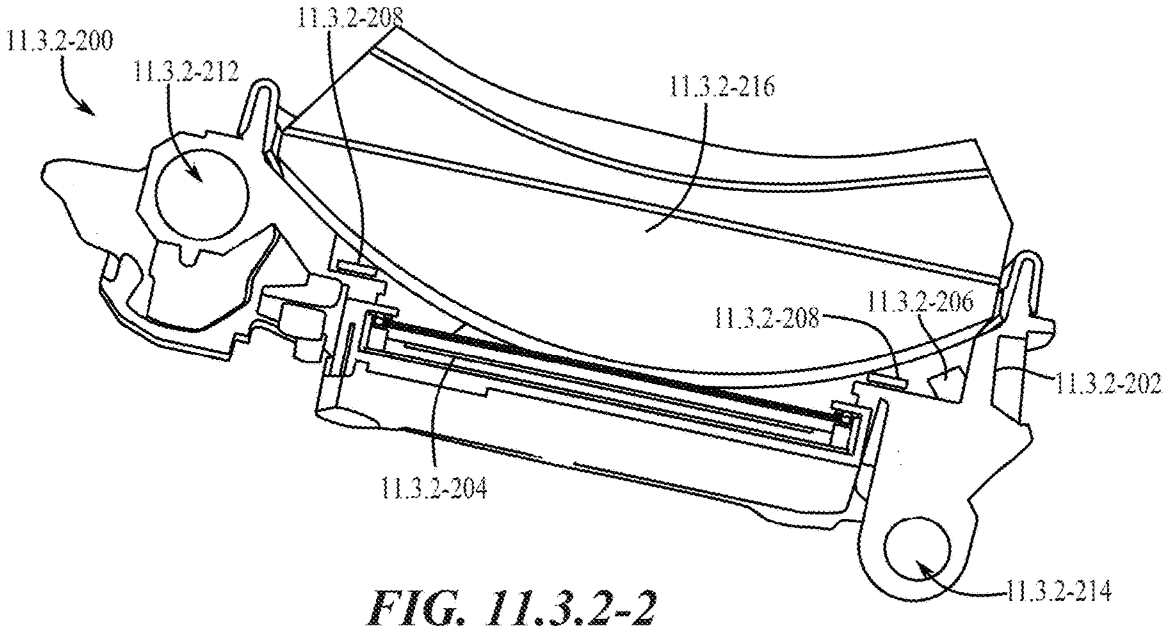
*FIG. 11.3.2-2*
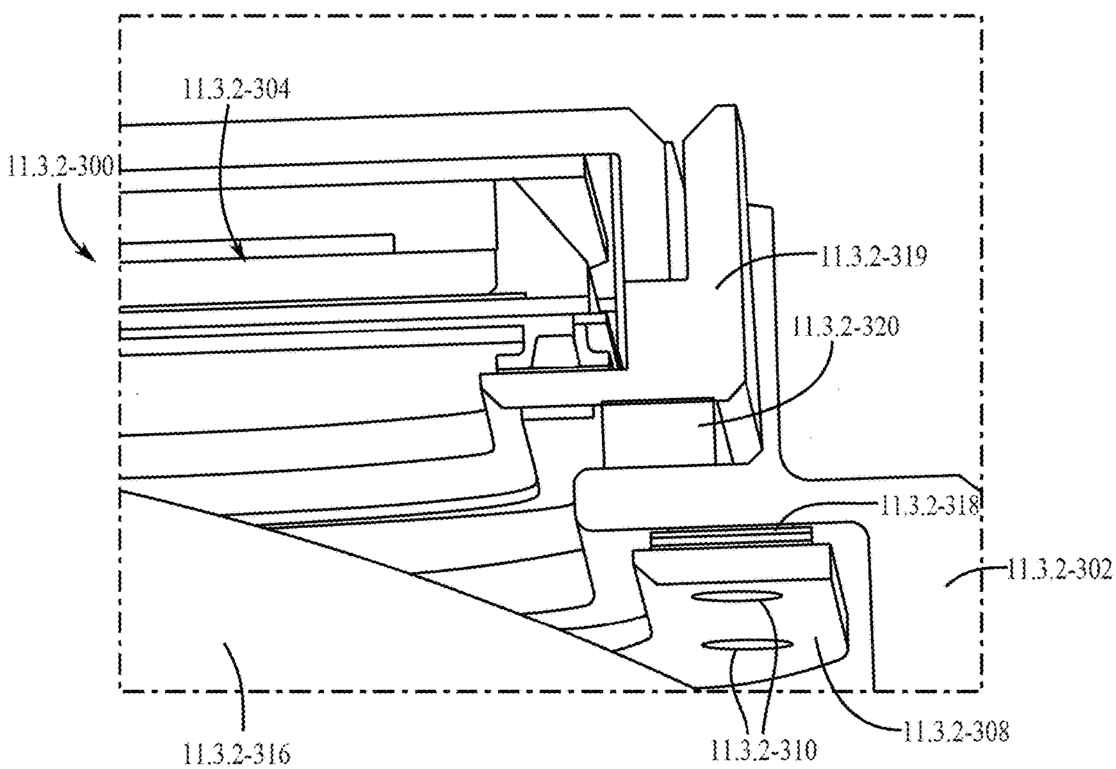
*FIG. 11.3.2-3*

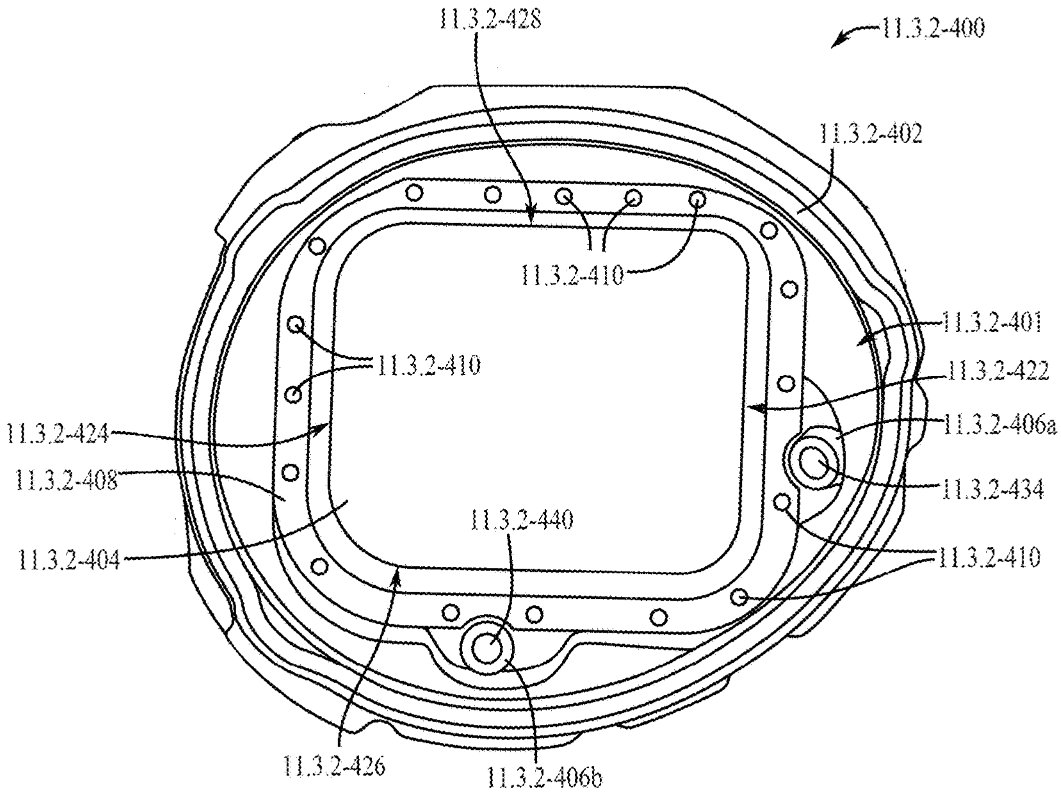
FIG. 11.3.2-4
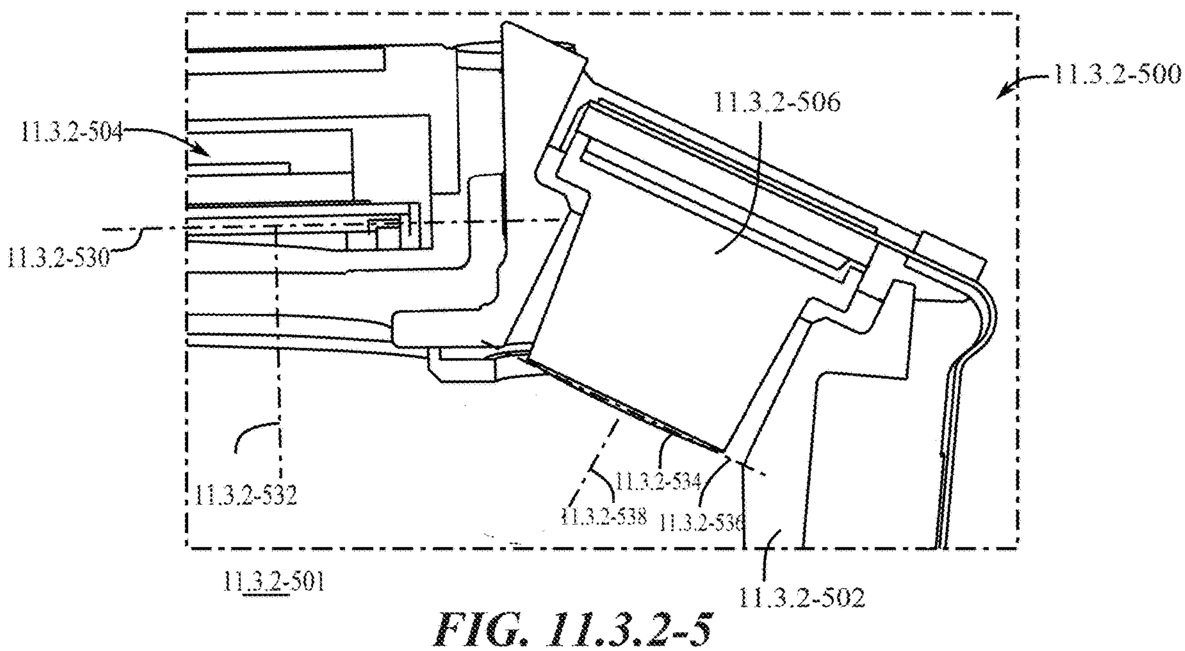
FIG. 11.3.2-5

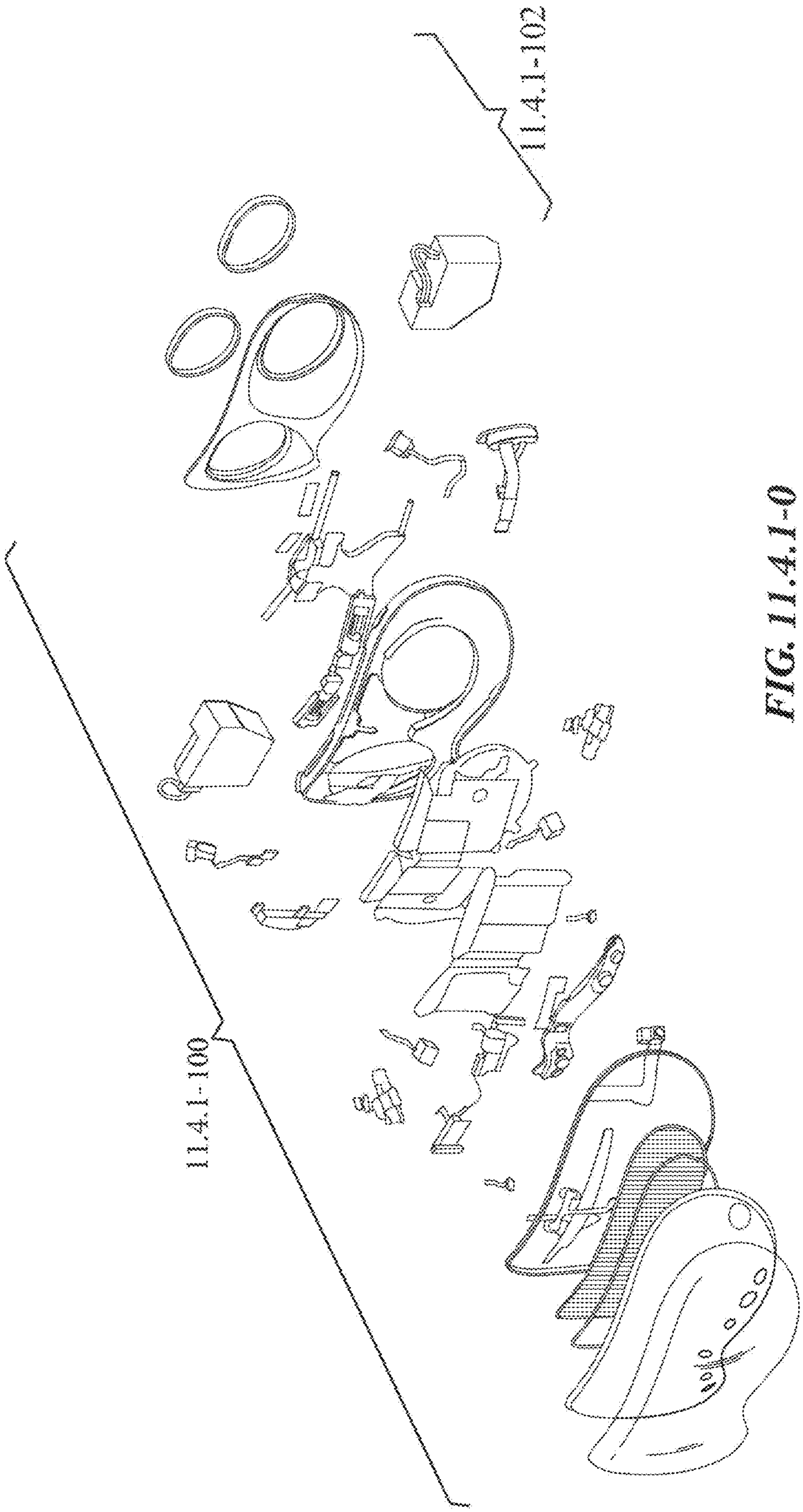
FIG. 11.4.1-0

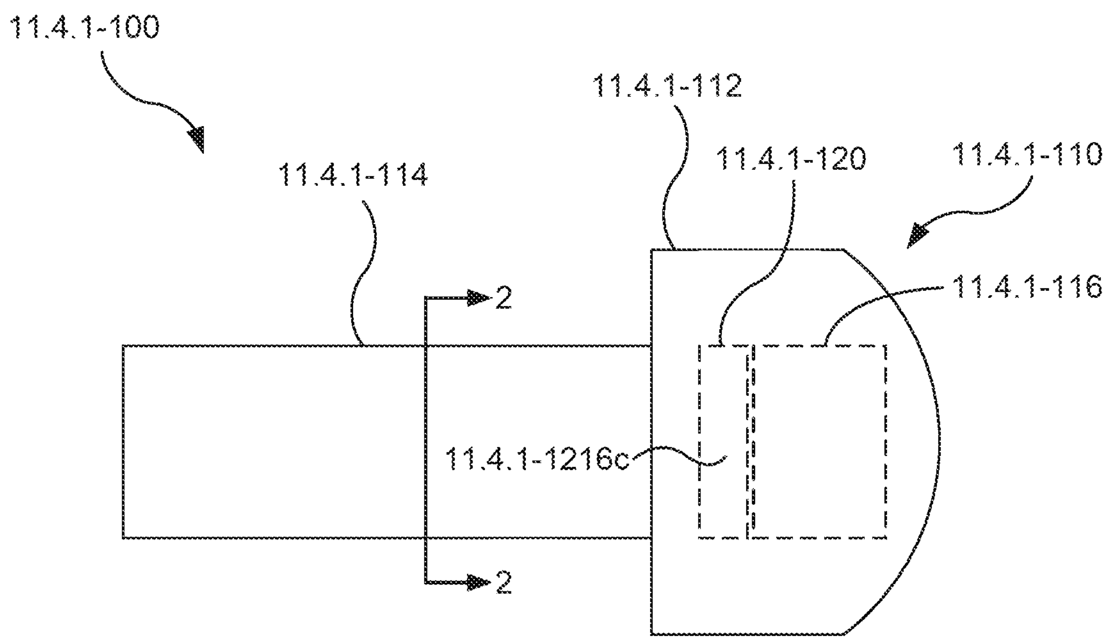
*FIG. 11.4.1-1*
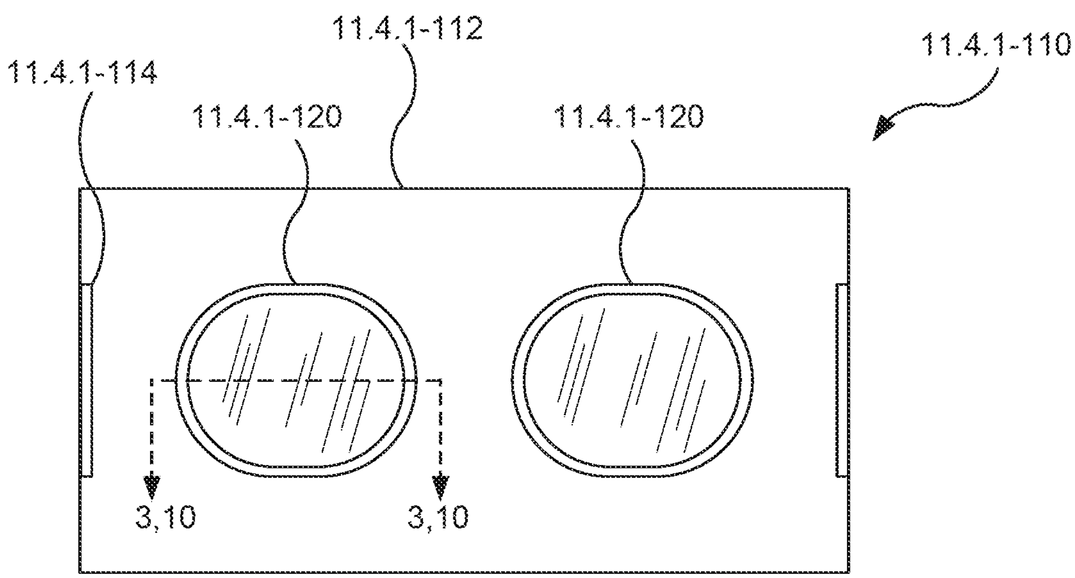
*FIG. 11.4.1-2*

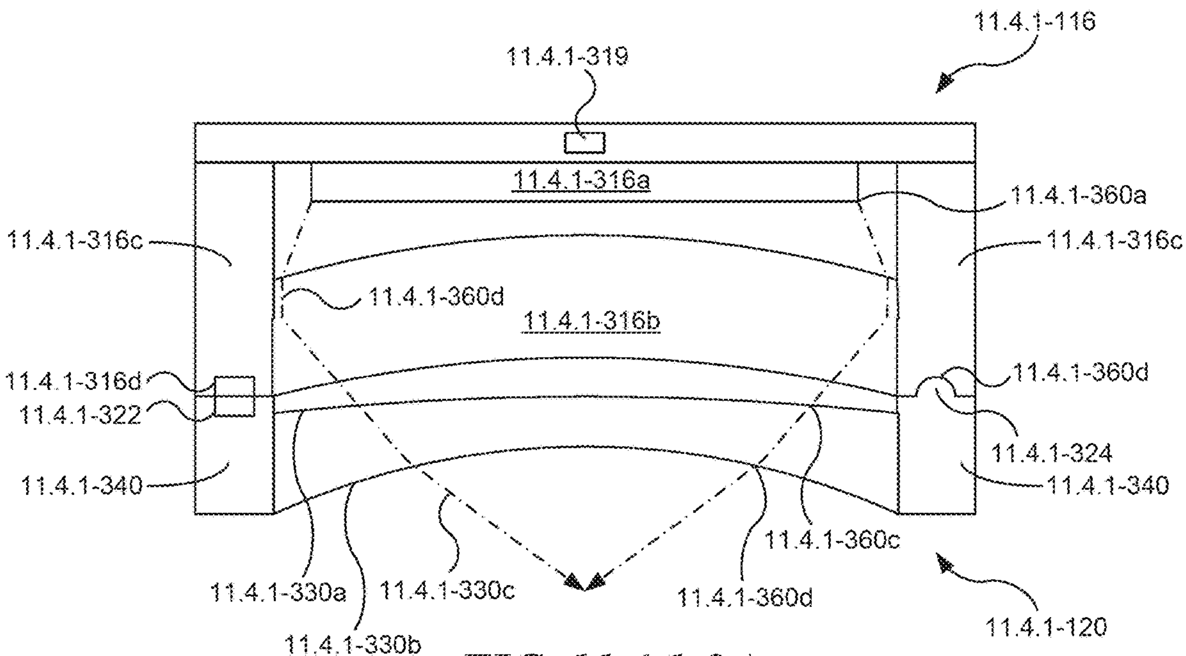
*FIG. 11.4.1-3A*
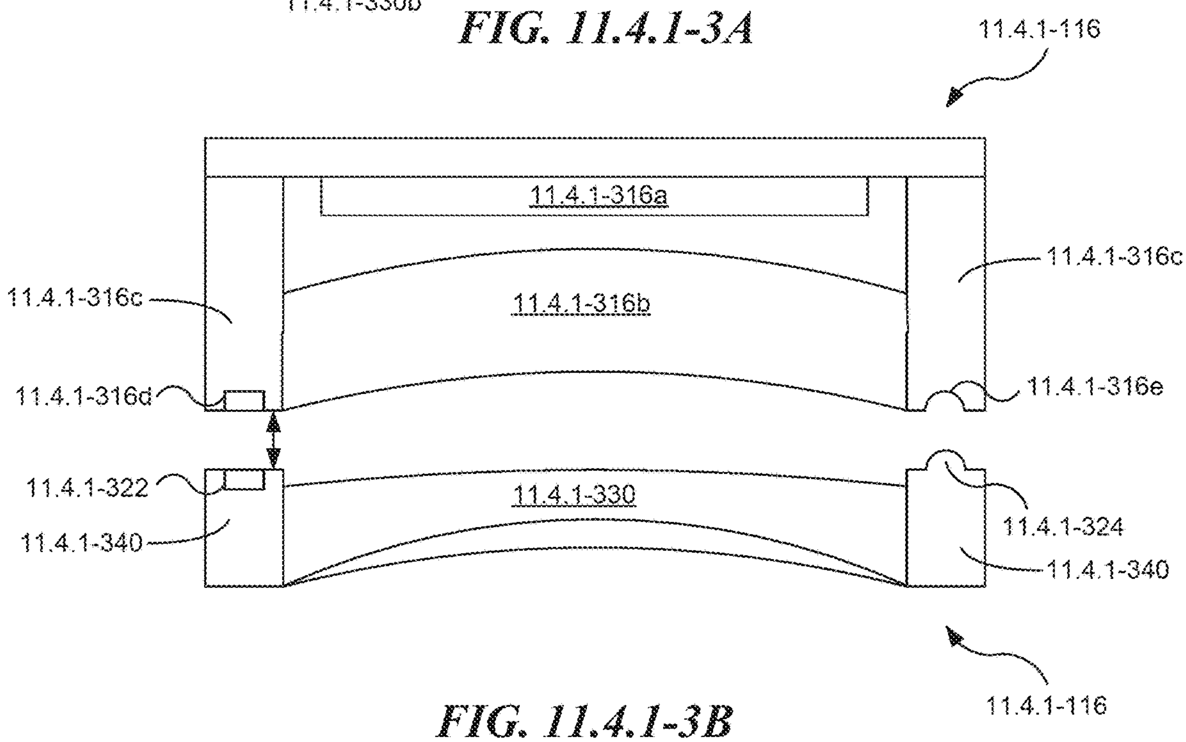
*FIG. 11.4.1-3B*

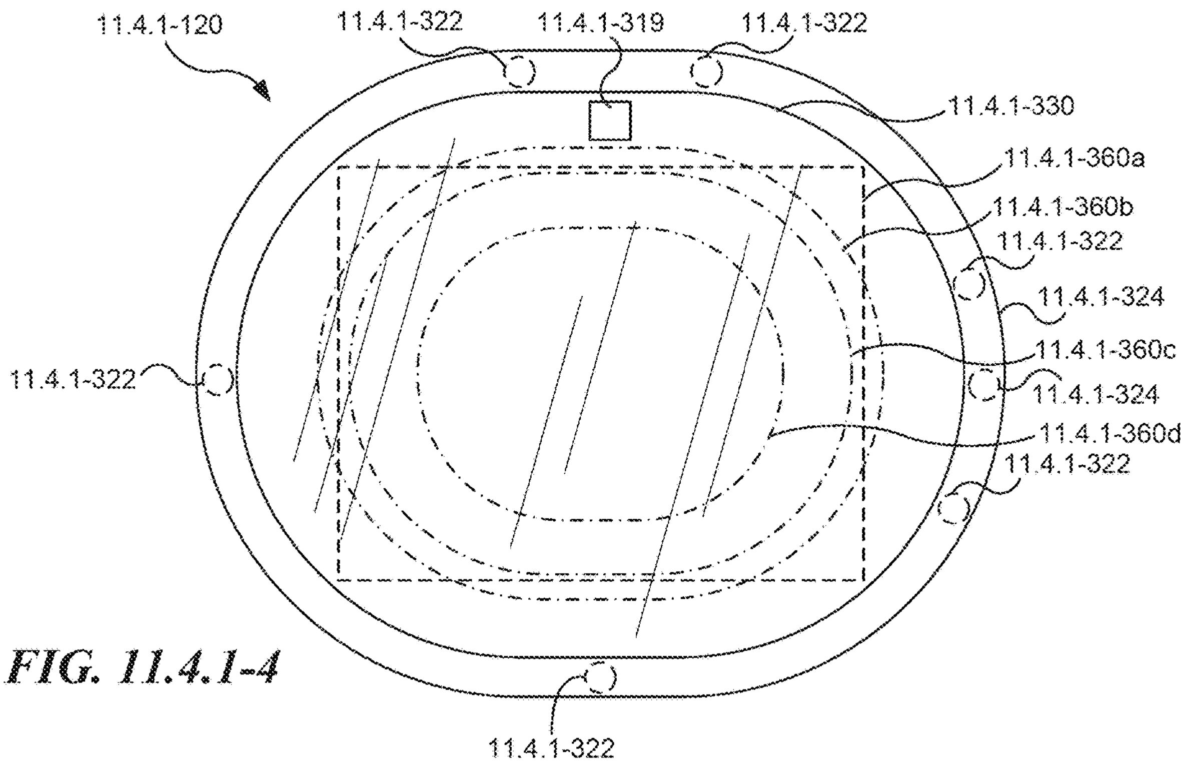
FIG. 11.4.1-4
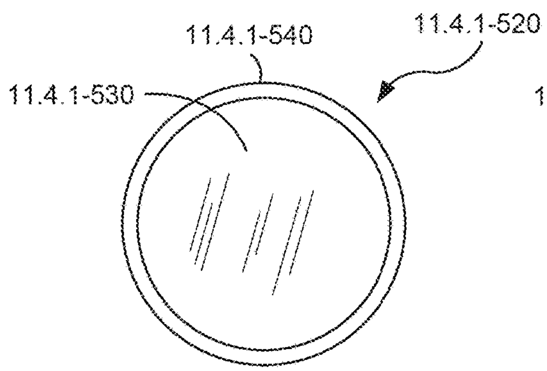
FIG. 11.4.1-5
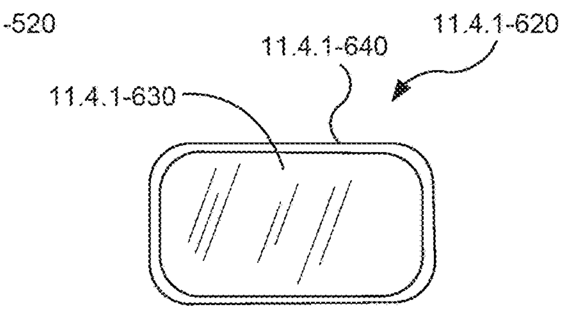
FIG. 11.4.1-6

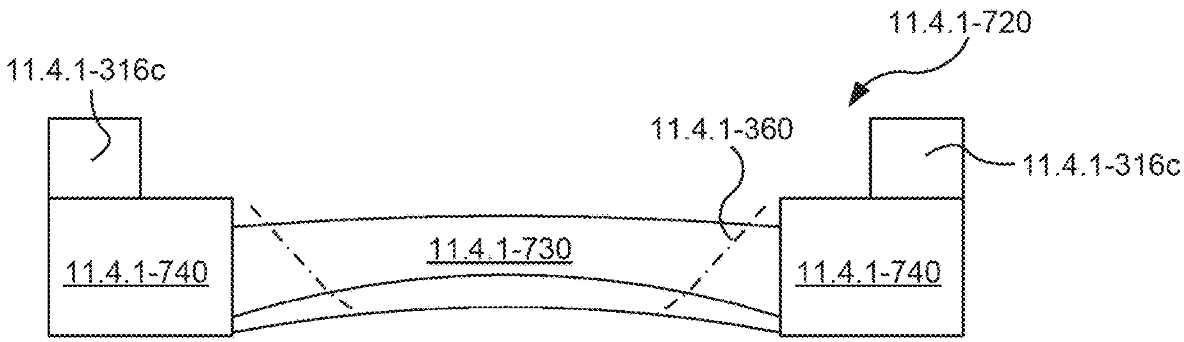
FIG. 11.4.1-7
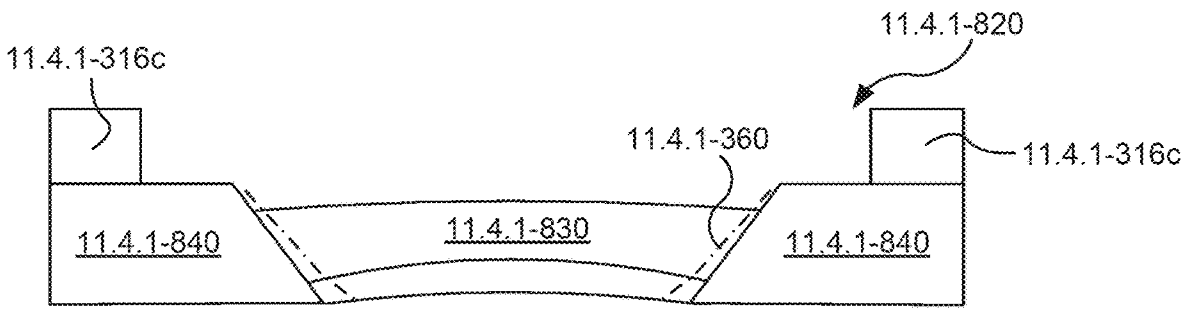
FIG. 11.4.1-8
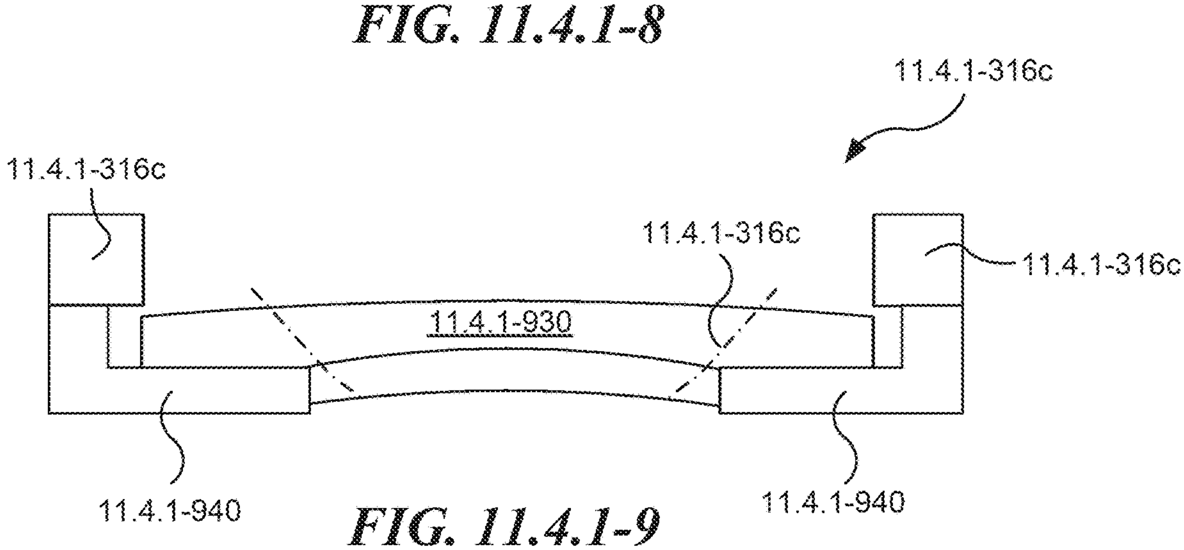
FIG. 11.4.1-9

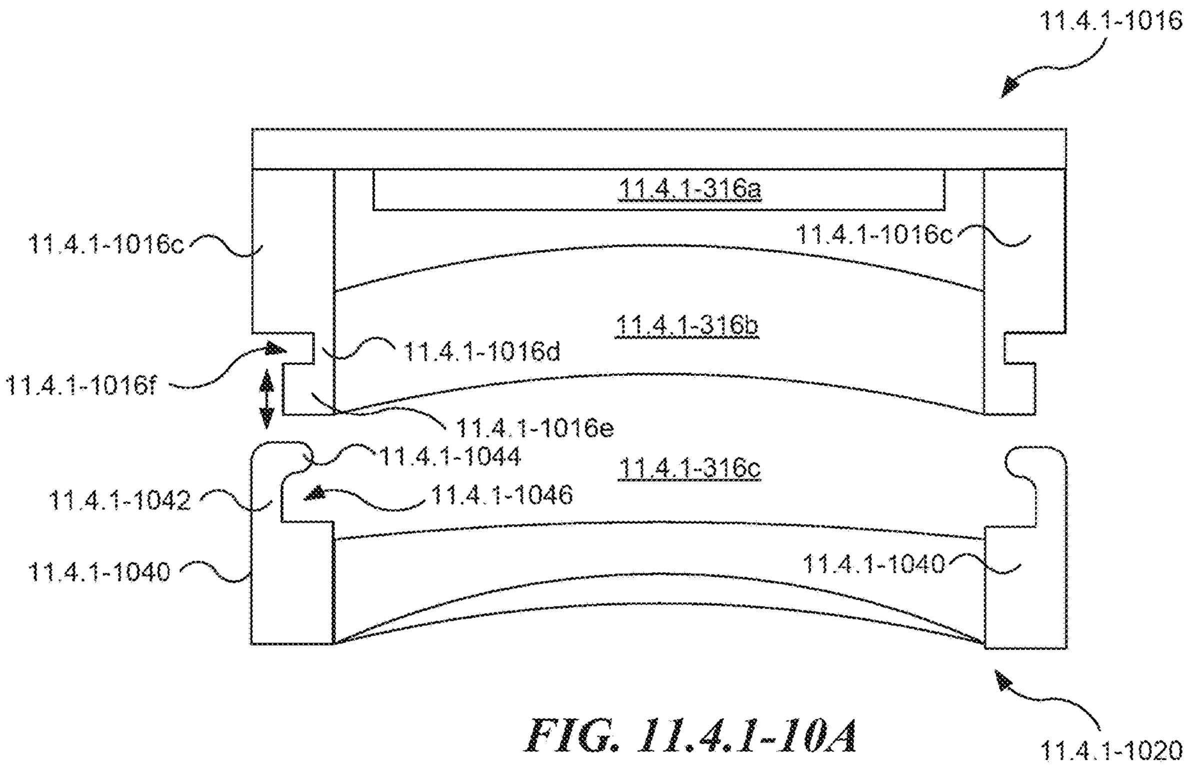
FIG. 11.4.1-10A
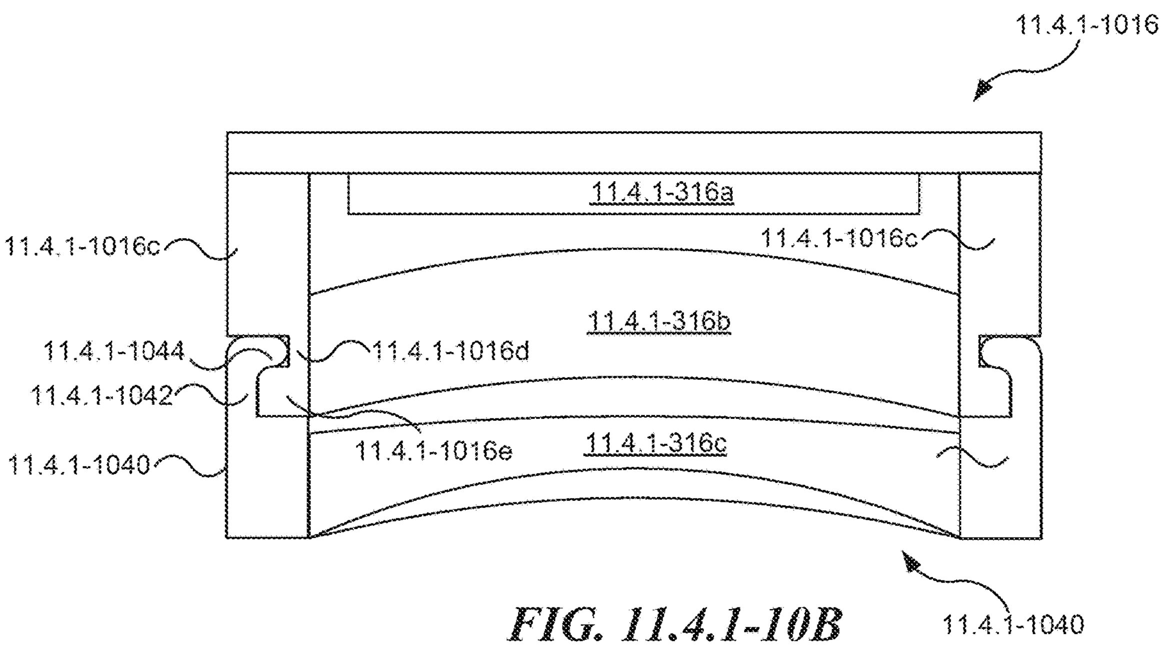
FIG. 11.4.1-10B

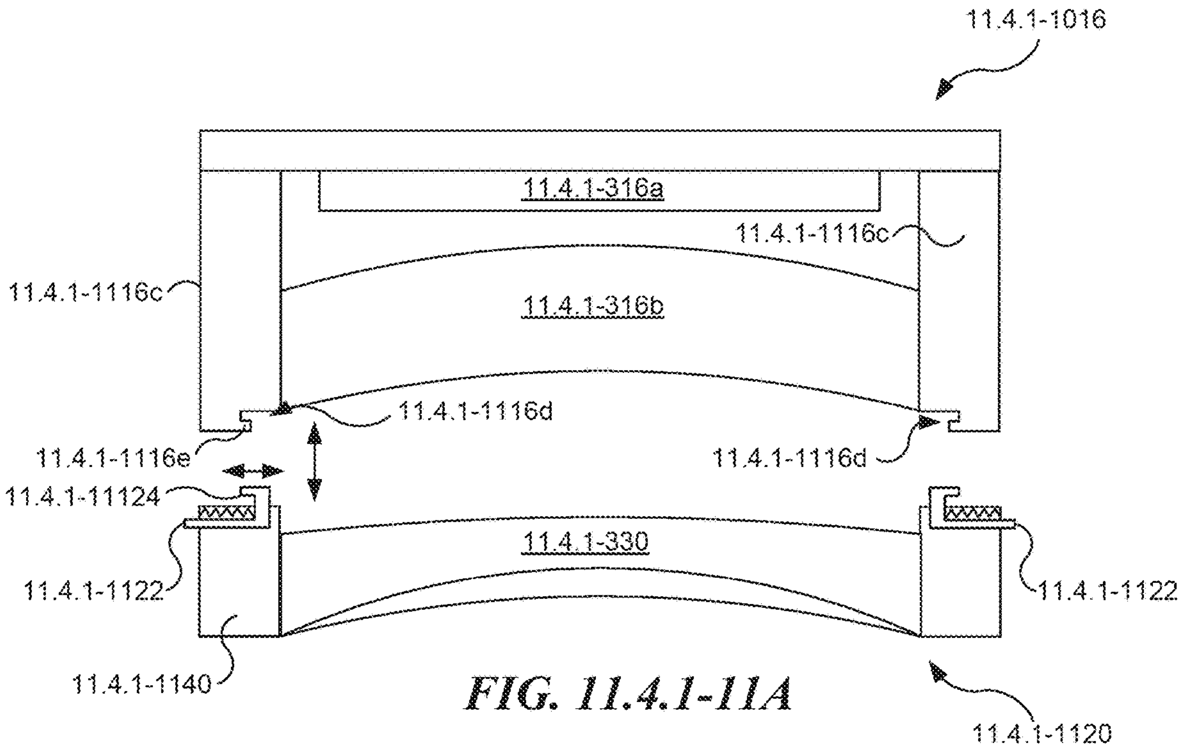
*FIG. 11.4.1-11A*
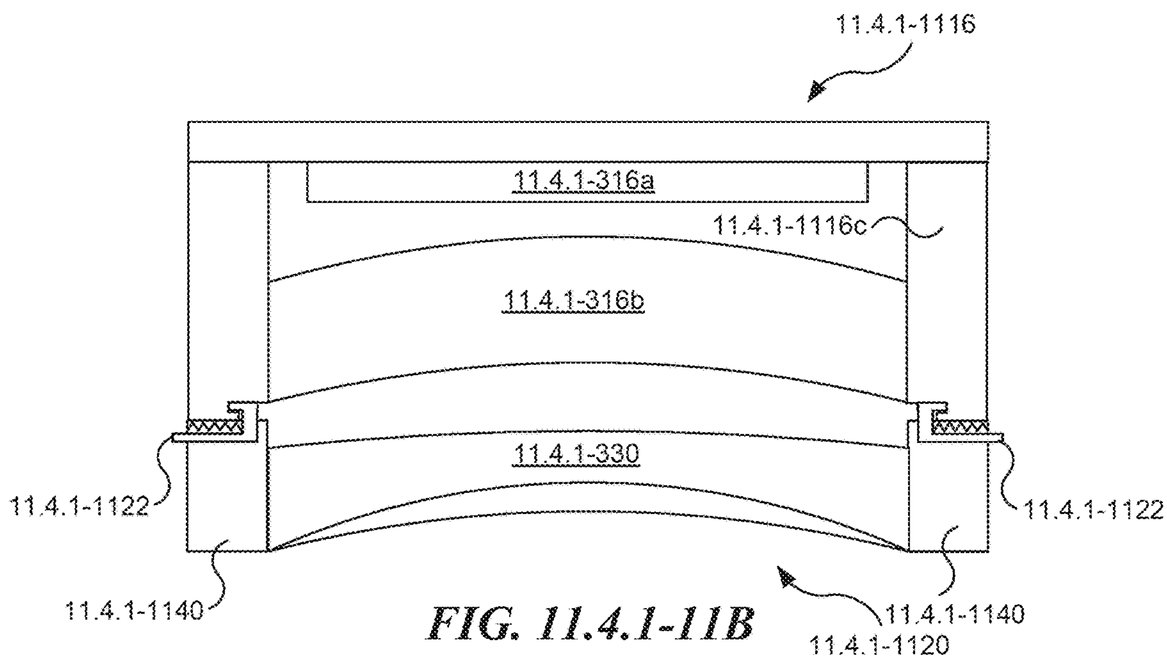
*FIG. 11.4.1-11B*

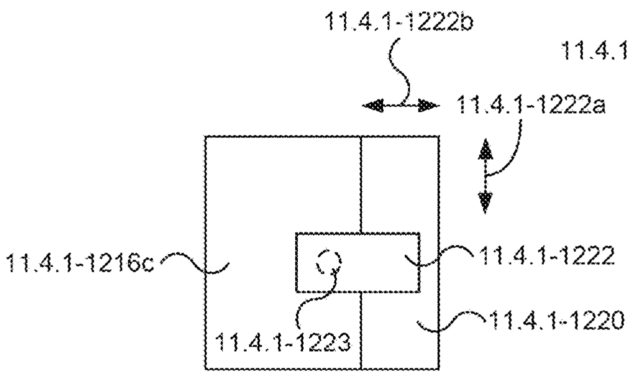
FIG. 11.4.1-12A
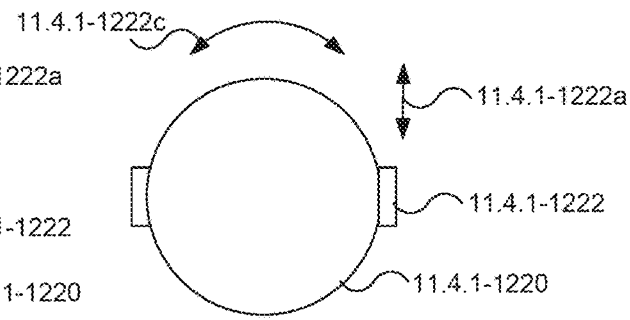
FIG. 11.4.1-12B
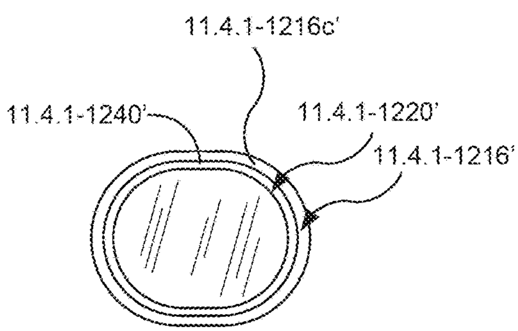
FIG. 11.4.1-12C
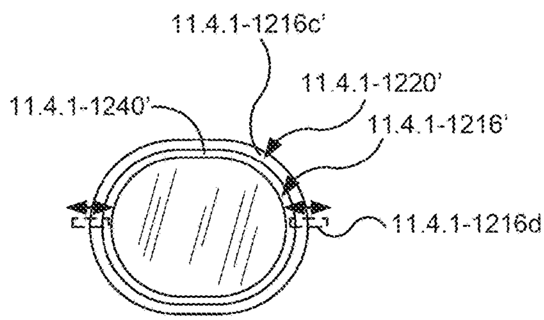
FIG. 11.4.1-12D

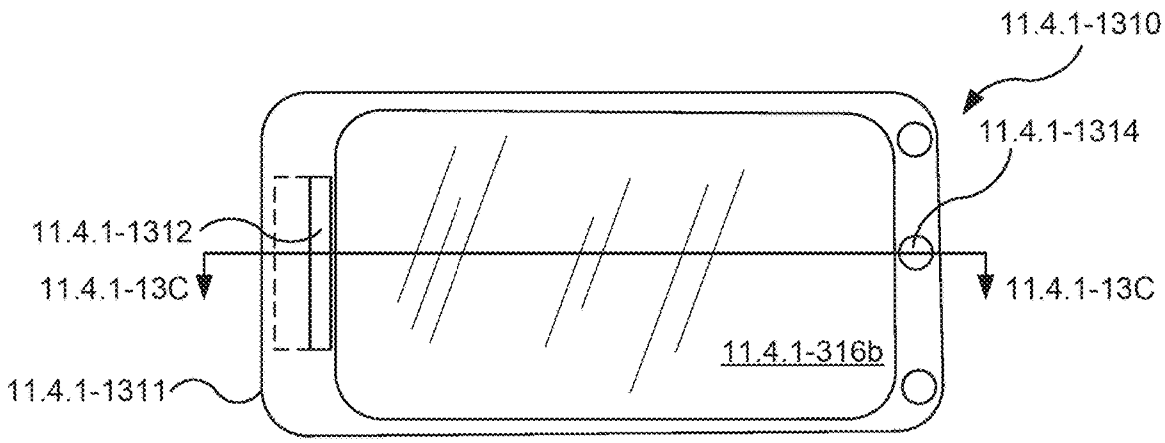
FIG. 11.4.1-13A
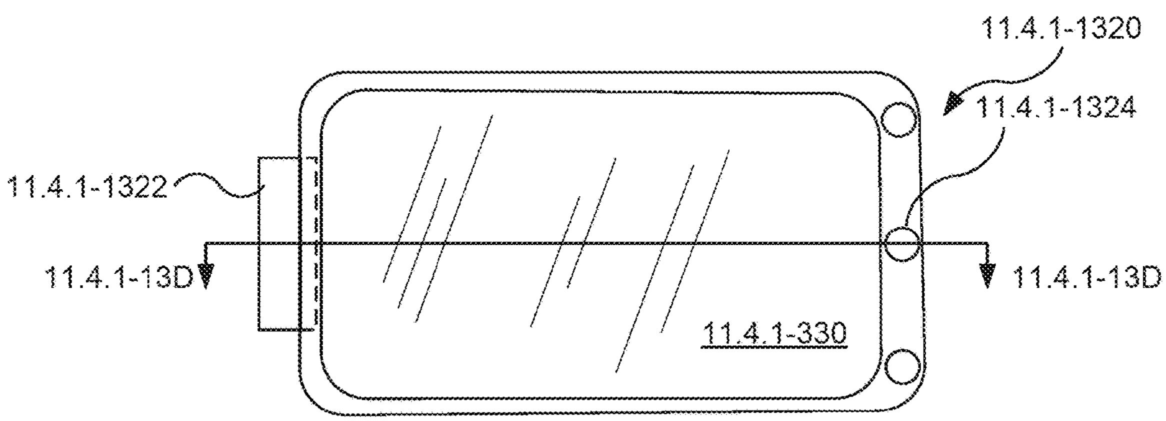
FIG. 11.4.1-13B

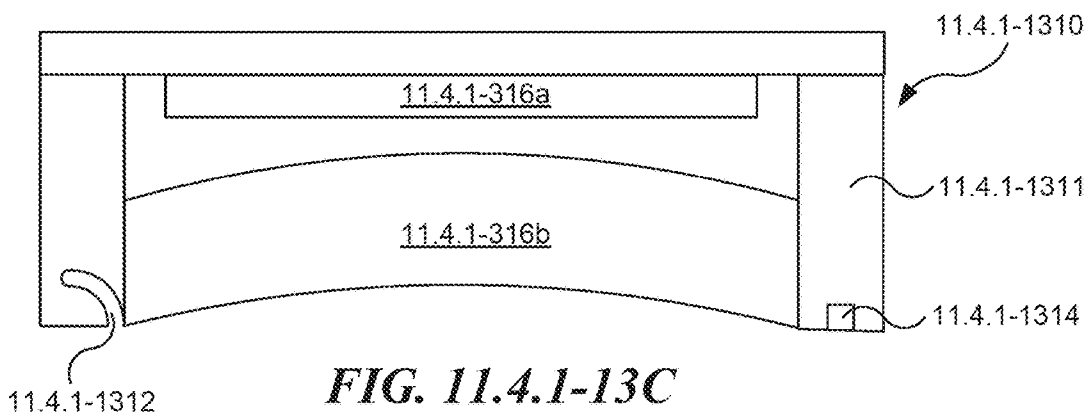
FIG. 11.4.1-13C
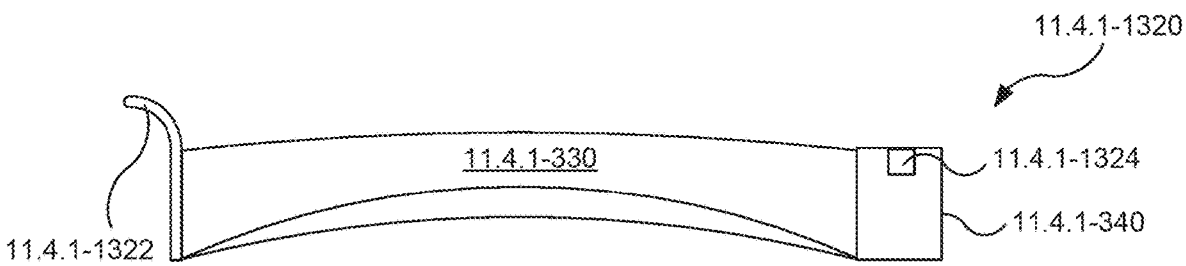
FIG. 11.4.1-13D

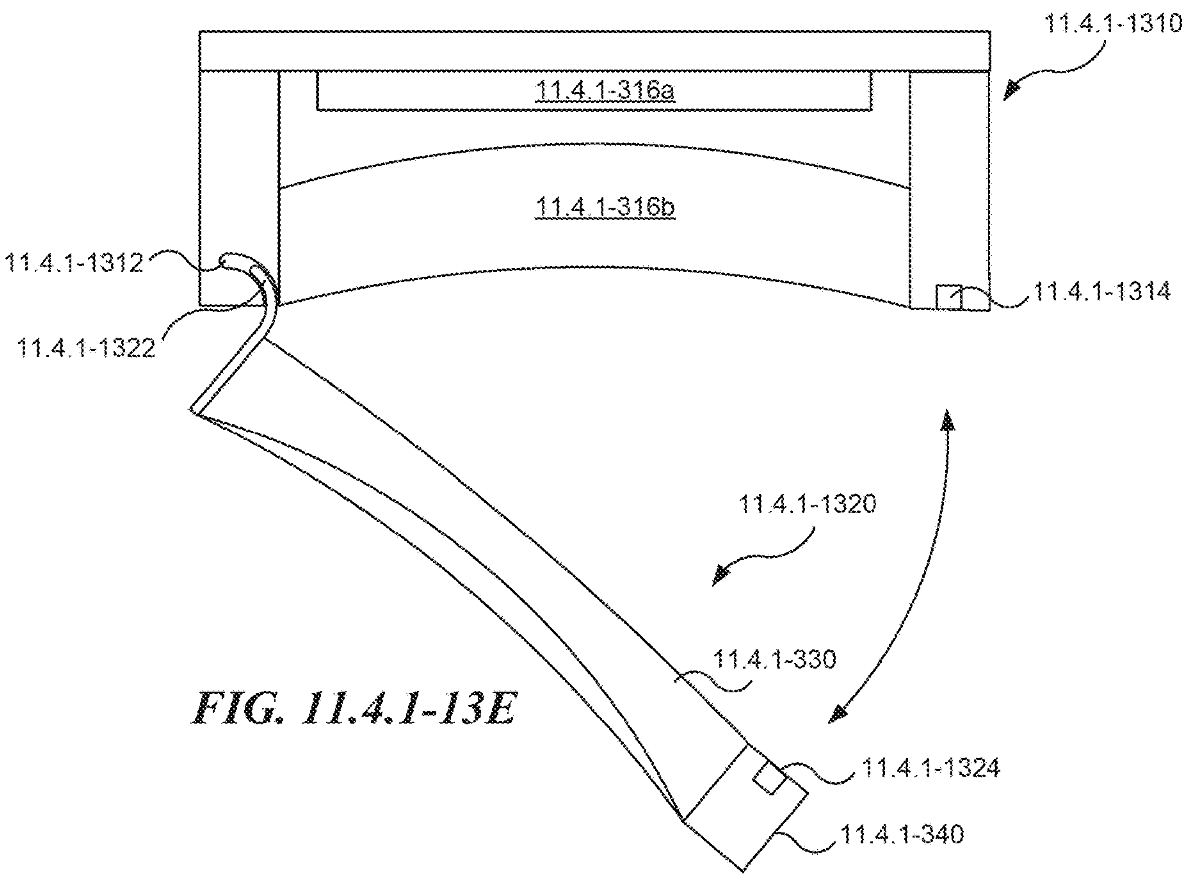
FIG. 11.4.1-13E
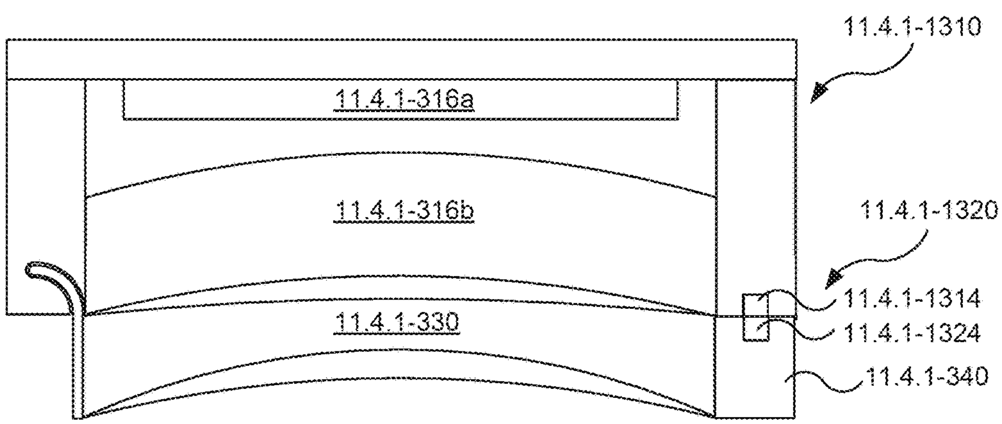
FIG. 11.4.1-13F

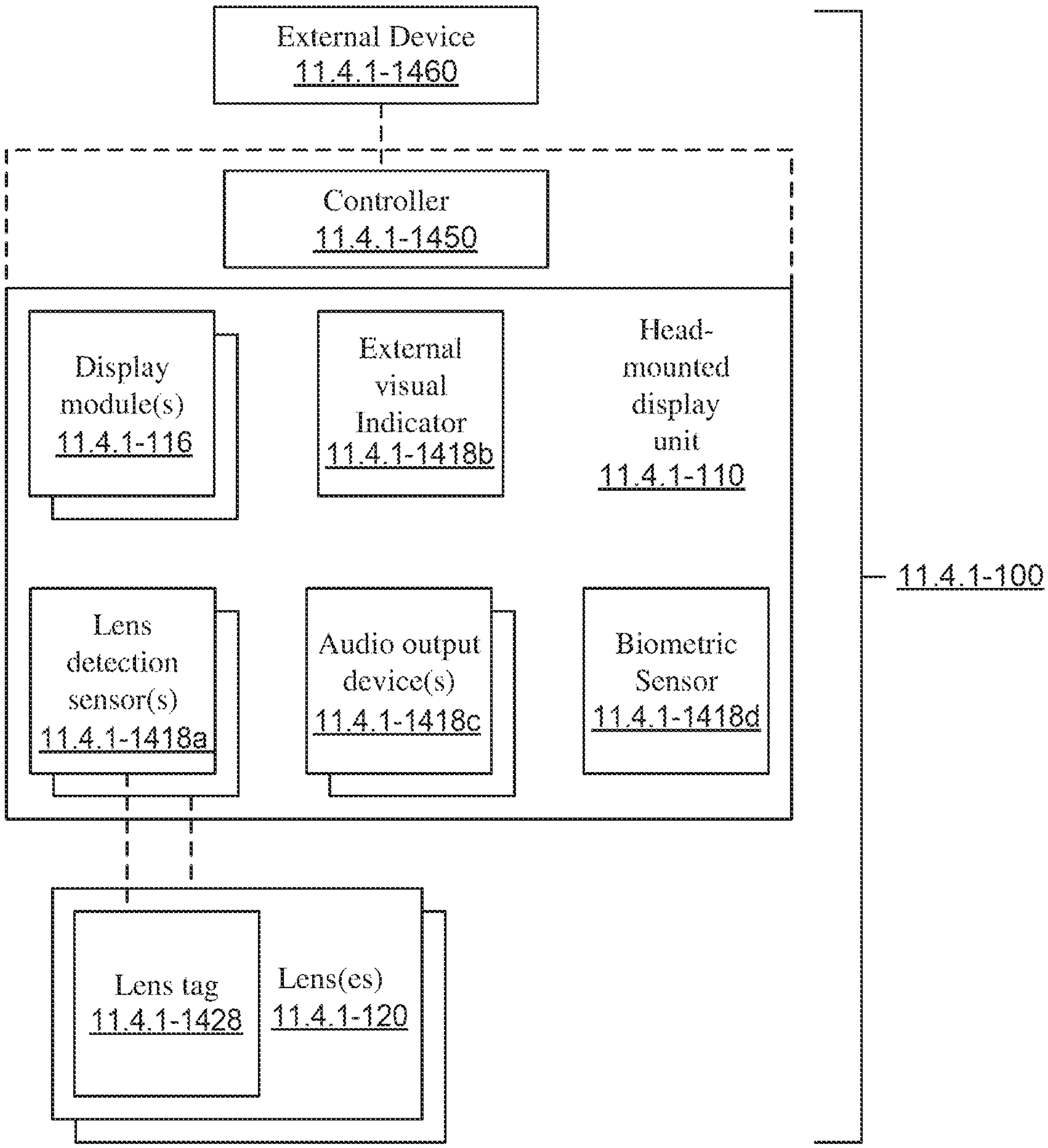
*FIG. 11.4.1-14A*

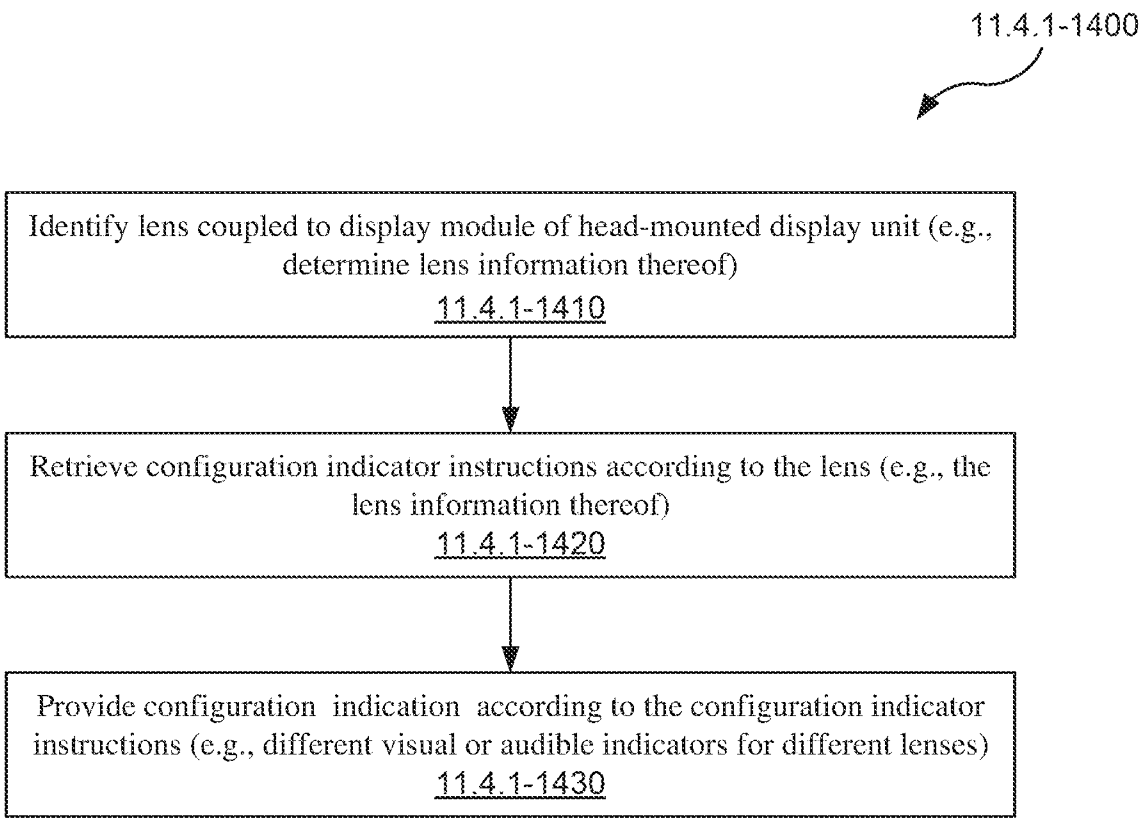
*FIG. 11.4.1-14B*

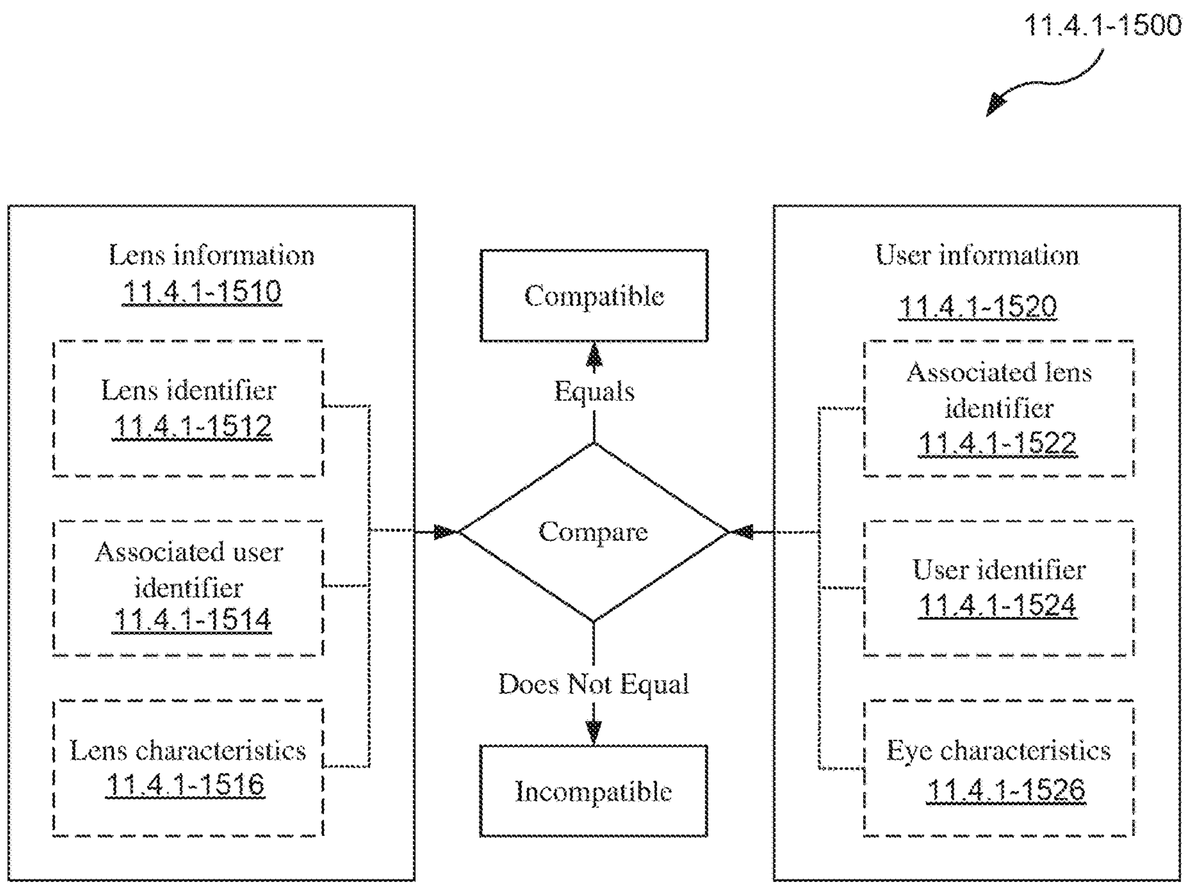
*FIG. 11.4.1-15*

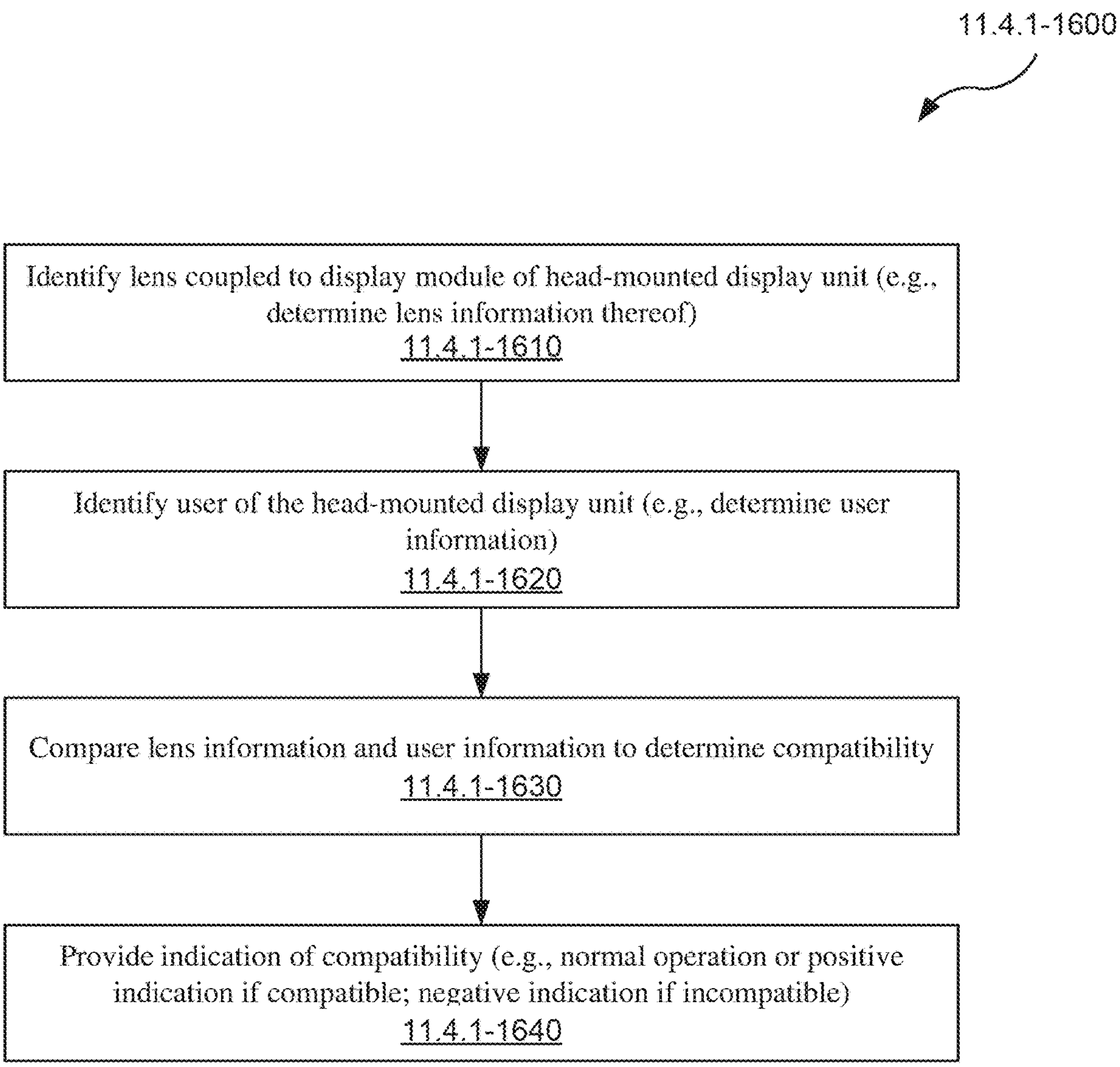
*FIG. 11.4.1-16*

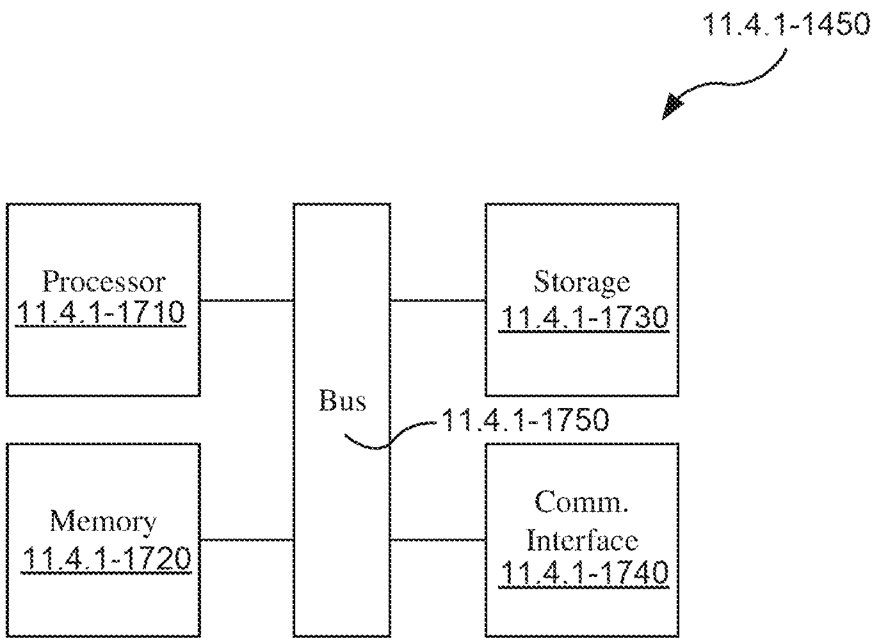
*FIG. 11.4.1-17*

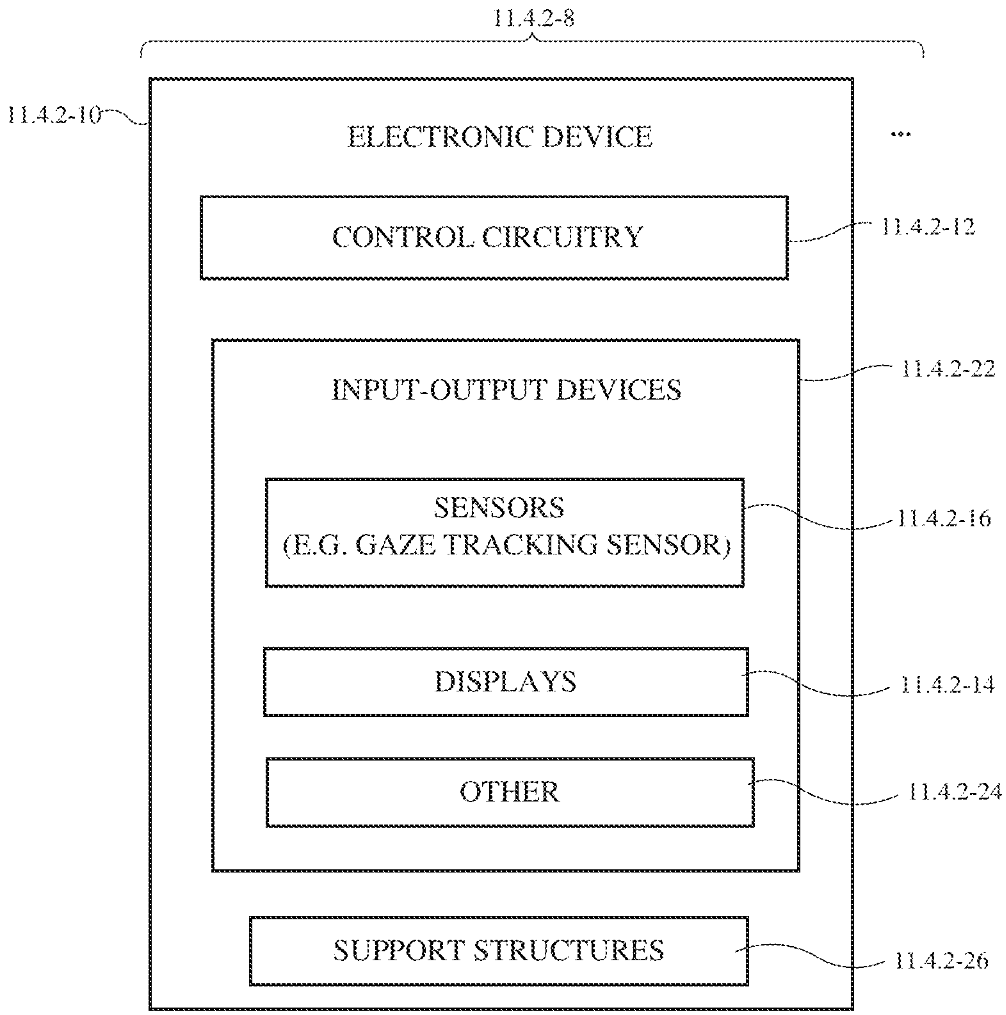
*FIG. 11.4.2-1*

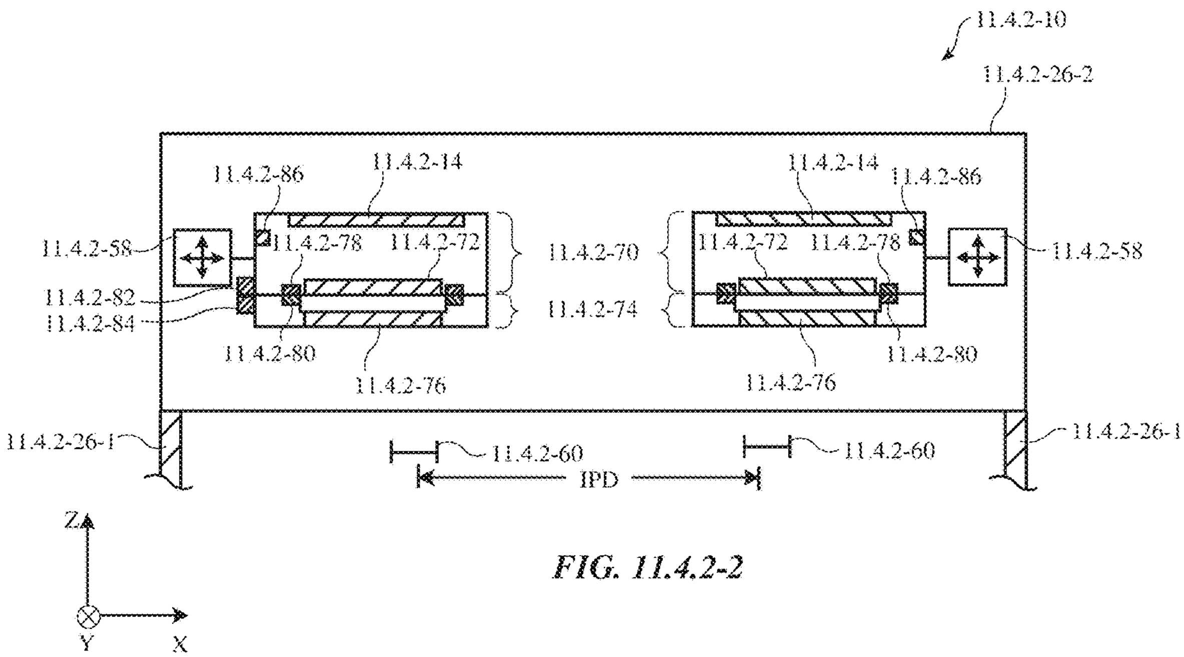
FIG. 11.4.2-2

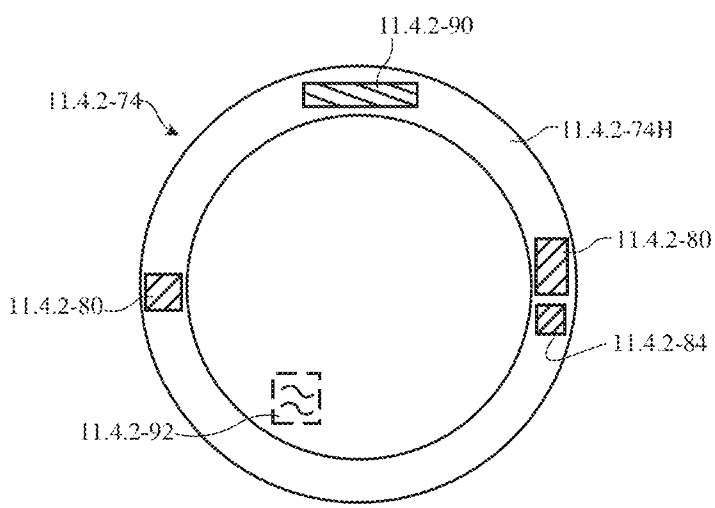
*FIG. 11.4.2-3*

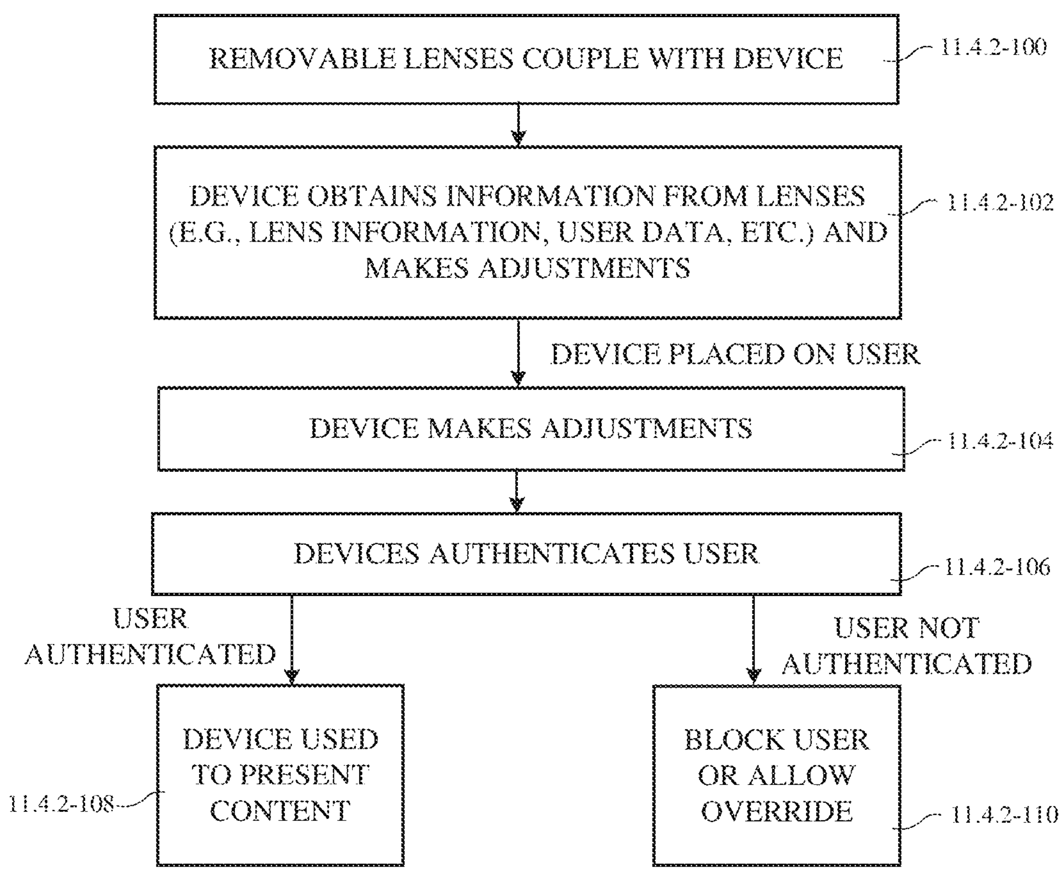
*FIG. 11.4.2-4*

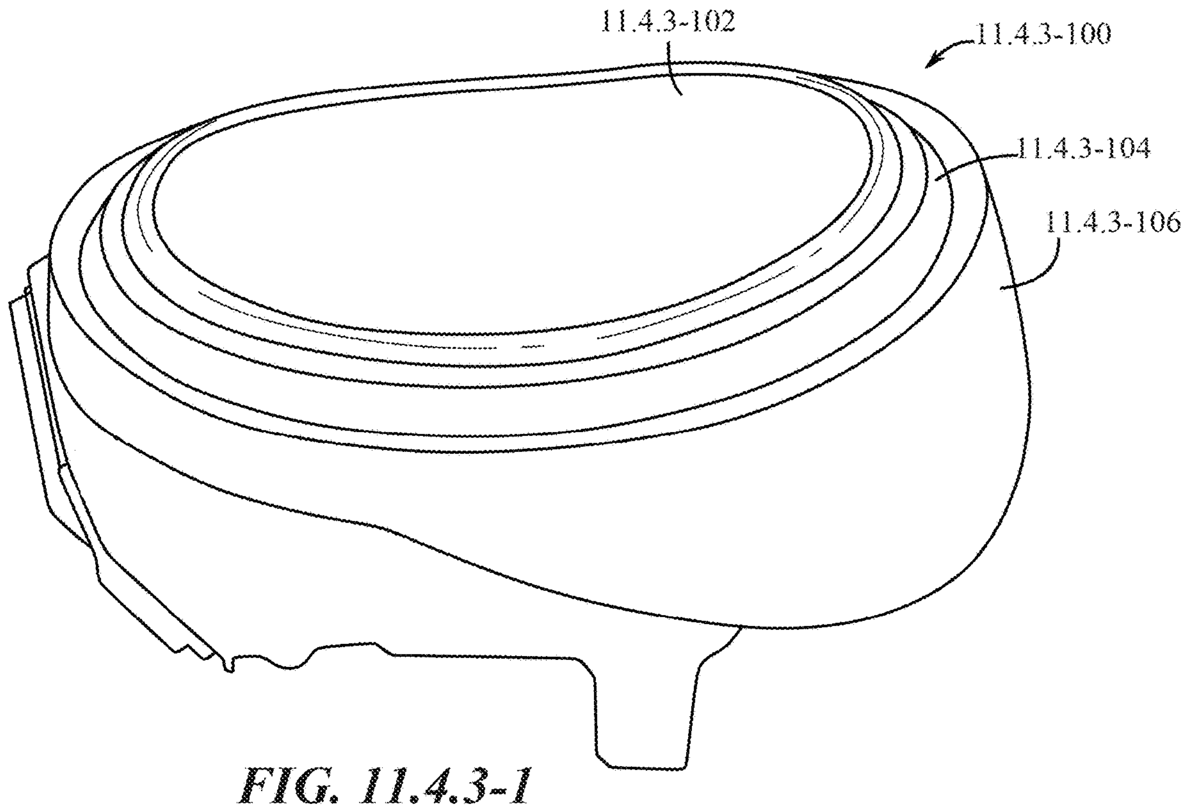
FIG. 11.4.3-1
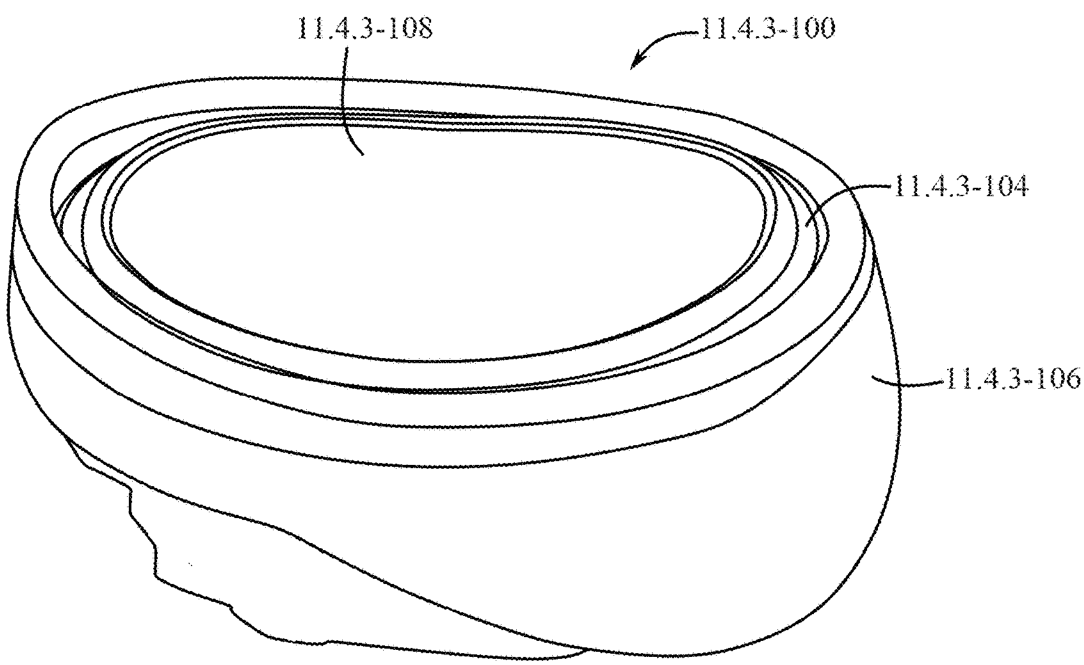
FIG. 11.4.3-2

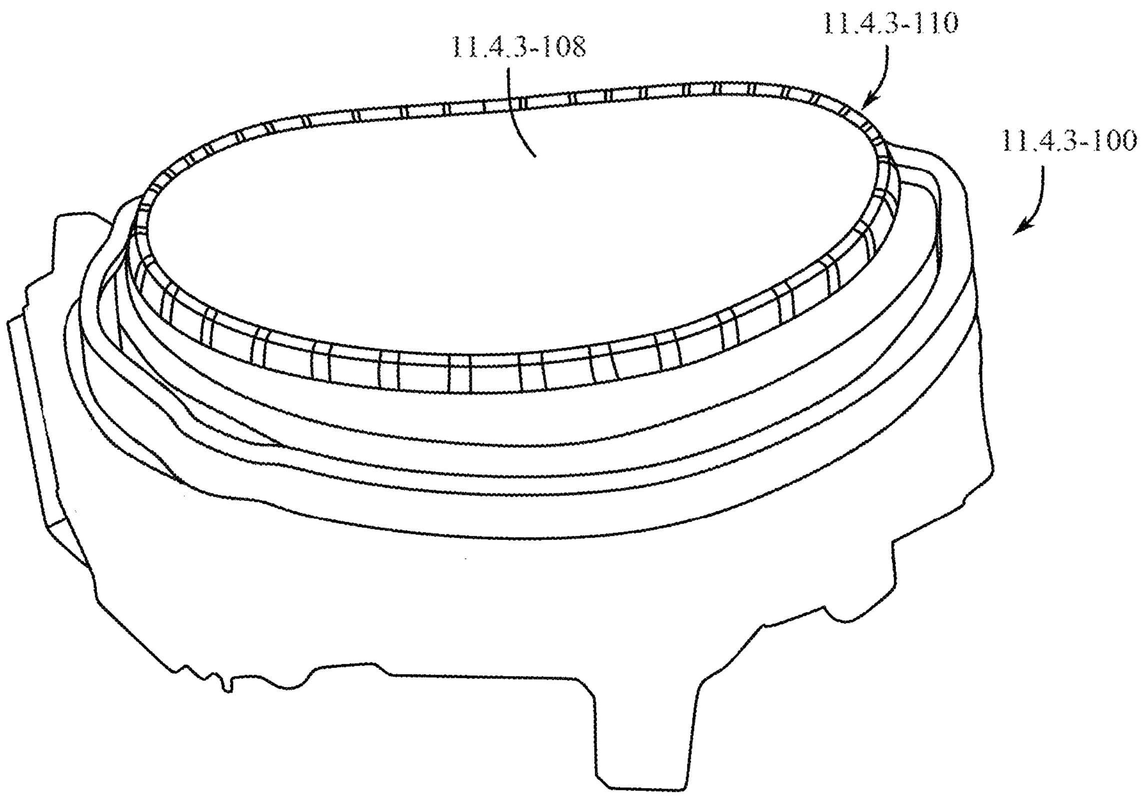
*FIG. 11.4.3-3*

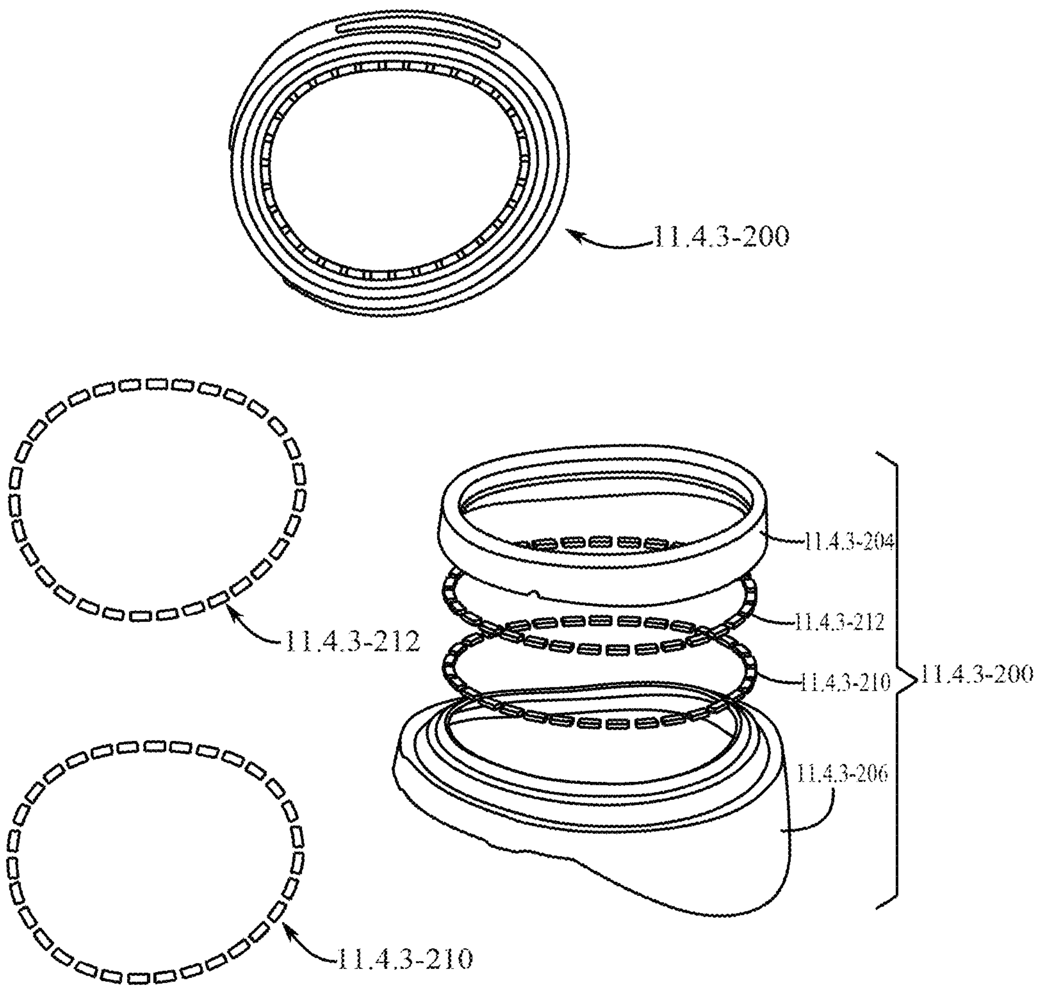
FIG. 11.4.3-4
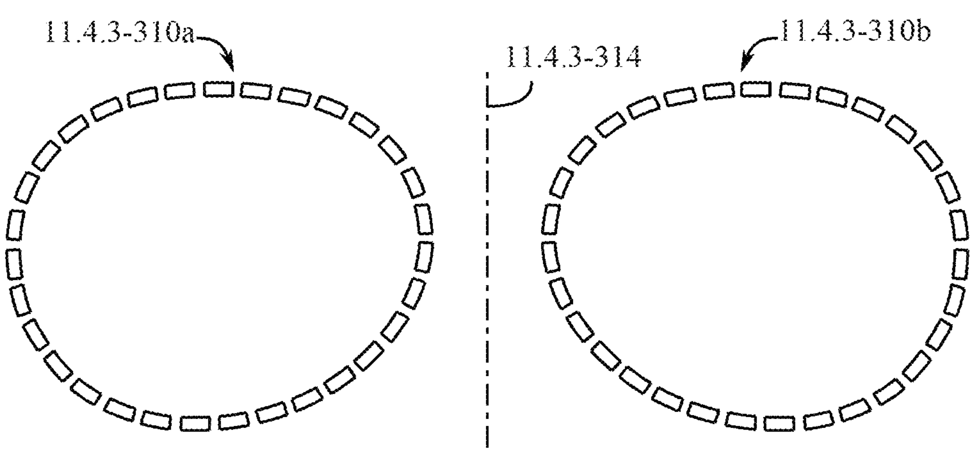
FIG. 11.4.3-5

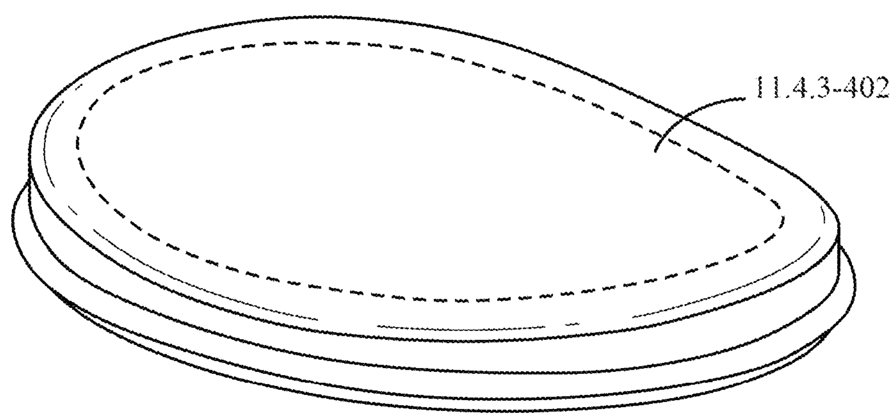
*FIG. 11.4.3-6*
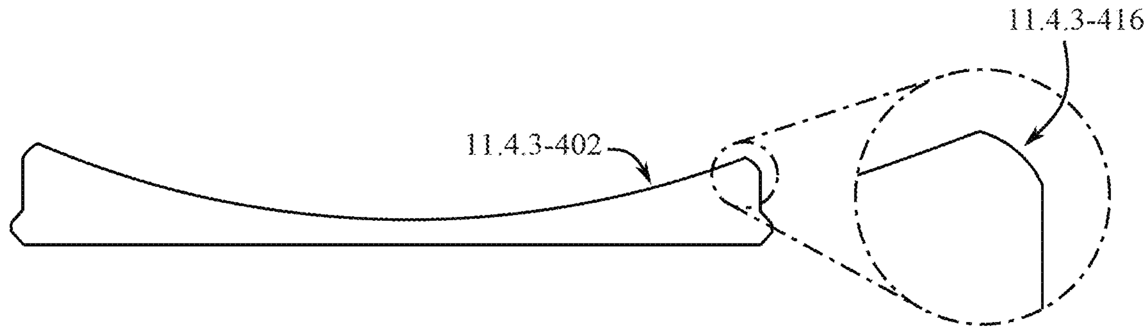
*FIG. 11.4.3-7*

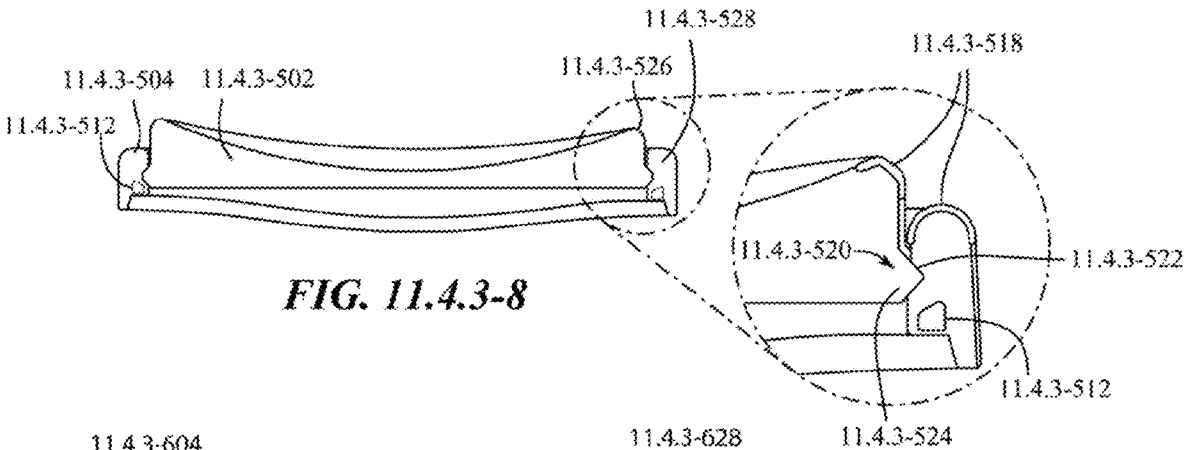
FIG. 11.4.3-8
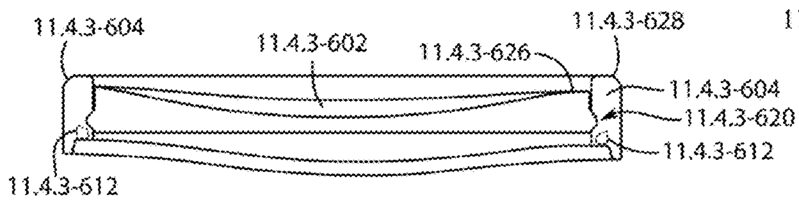
FIG. 11.4.3-9
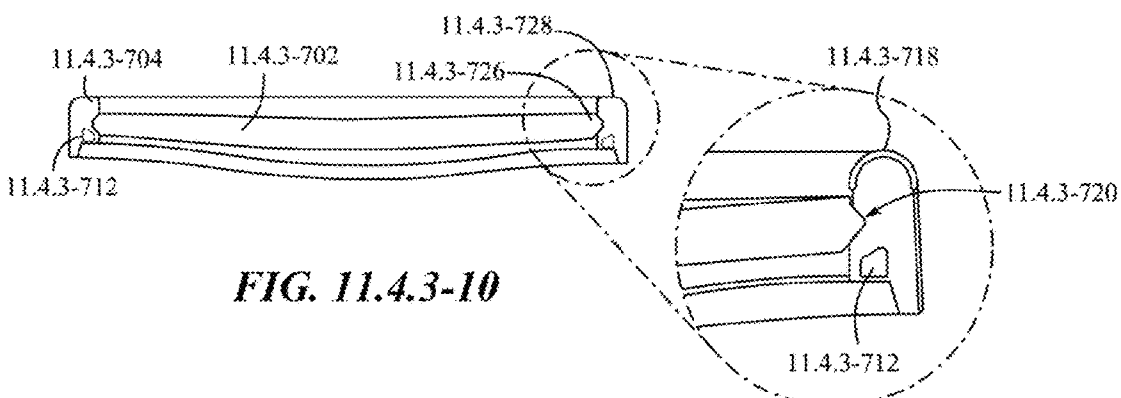
FIG. 11.4.3-10
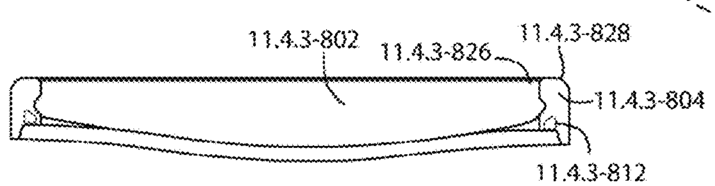
FIG. 11.4.3-11

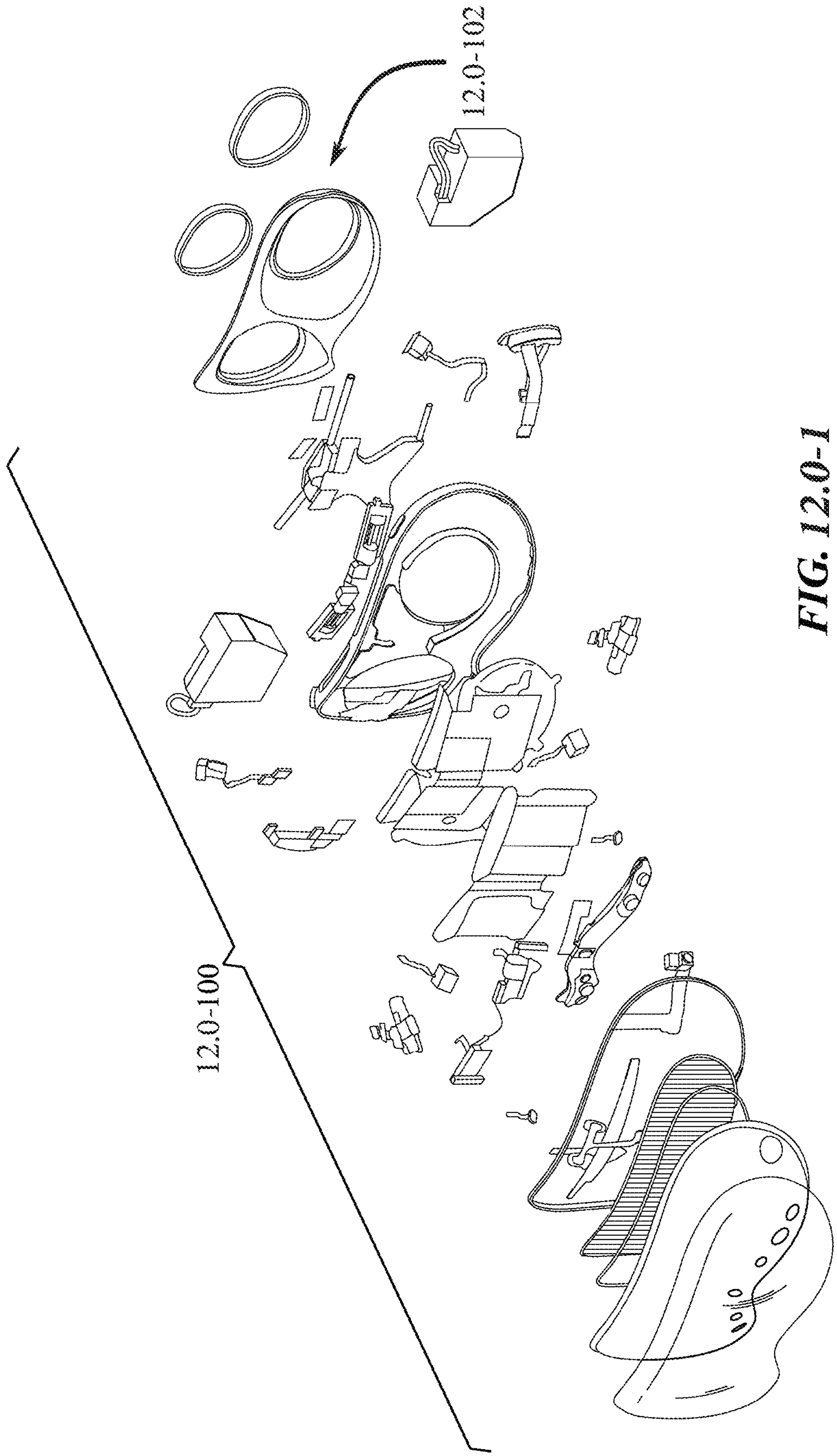
FIG. 12.0-1

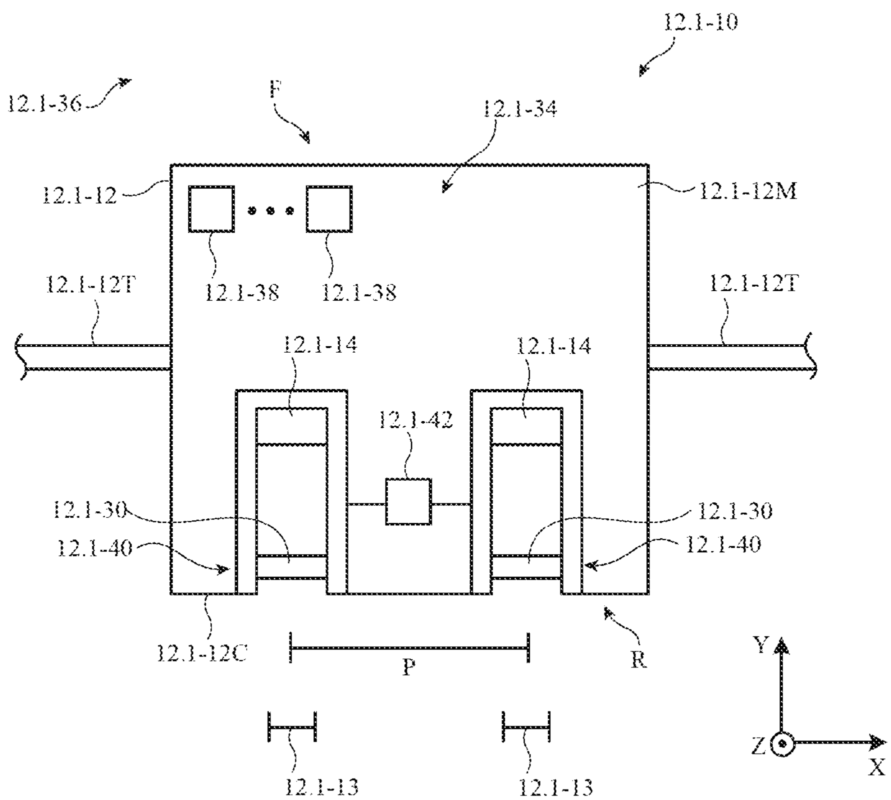
FIG. 12.1-1

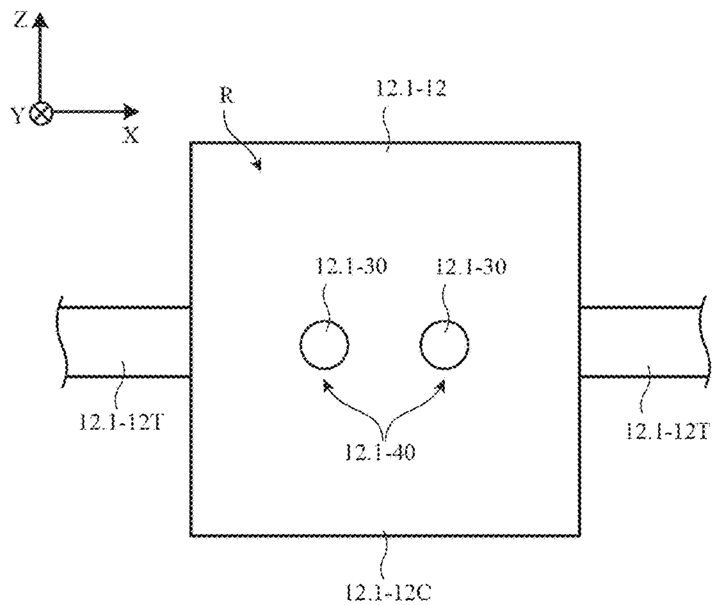
*FIG. 12.1-2*
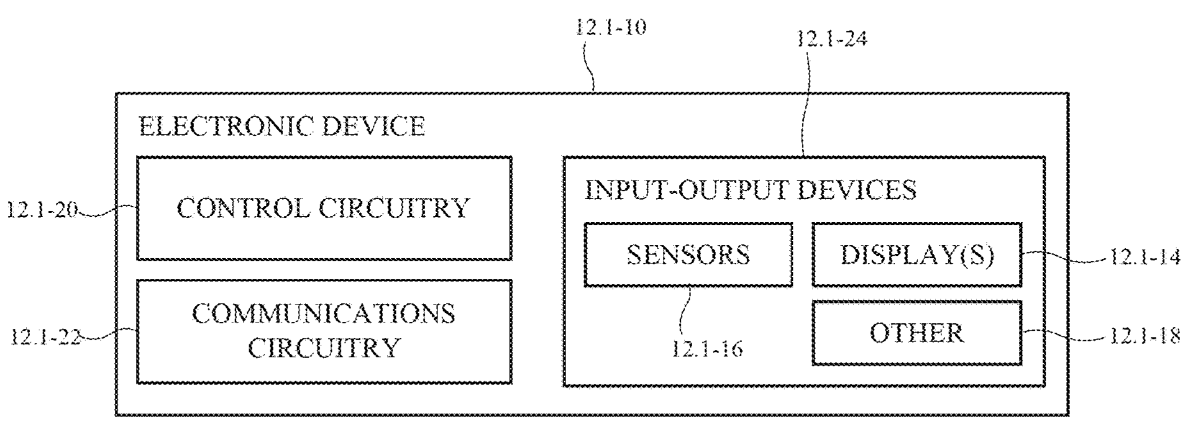
*FIG. 12.1-3*

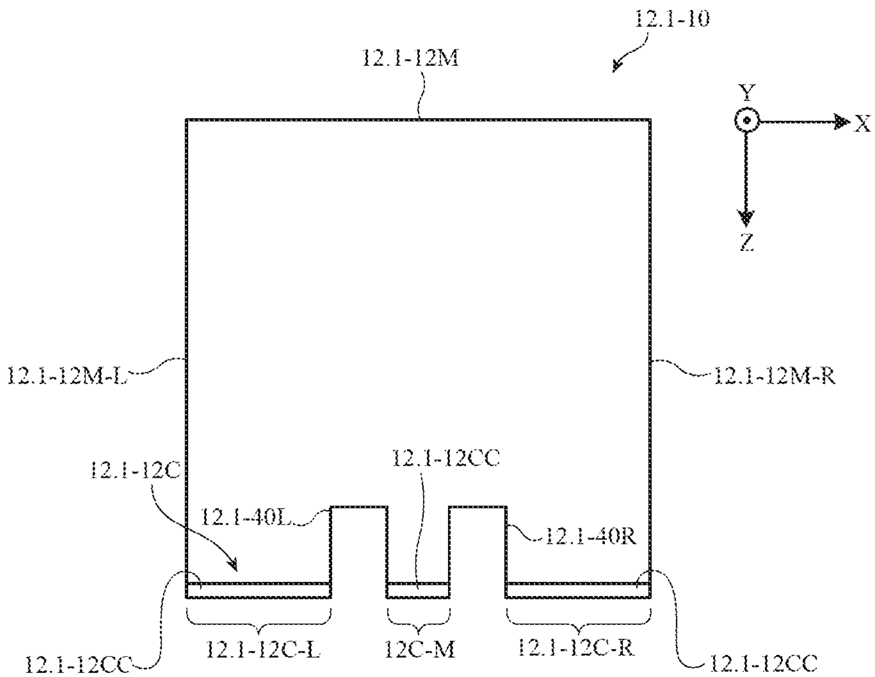
*FIG. 12.1-4*
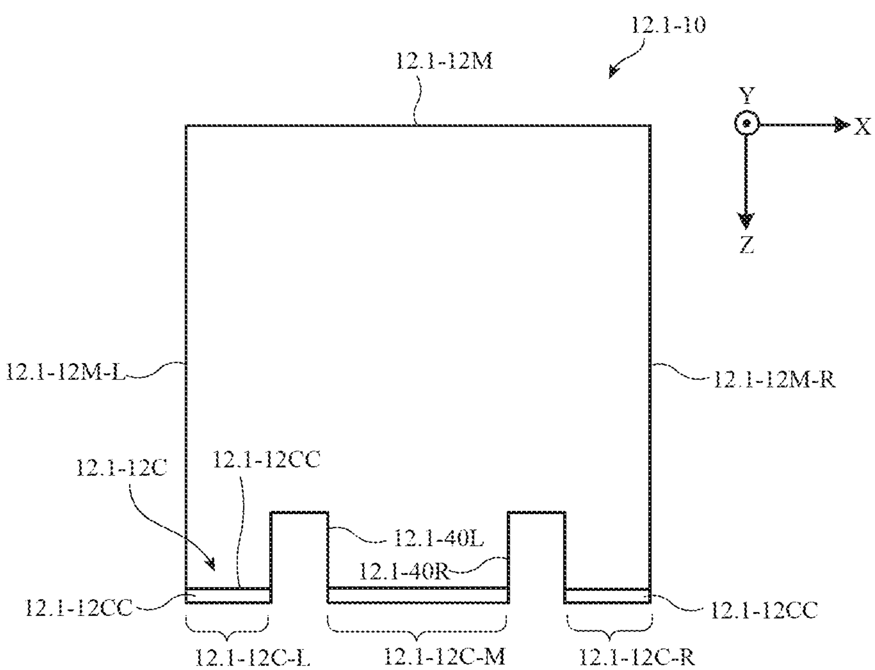
*FIG. 12.1-5*

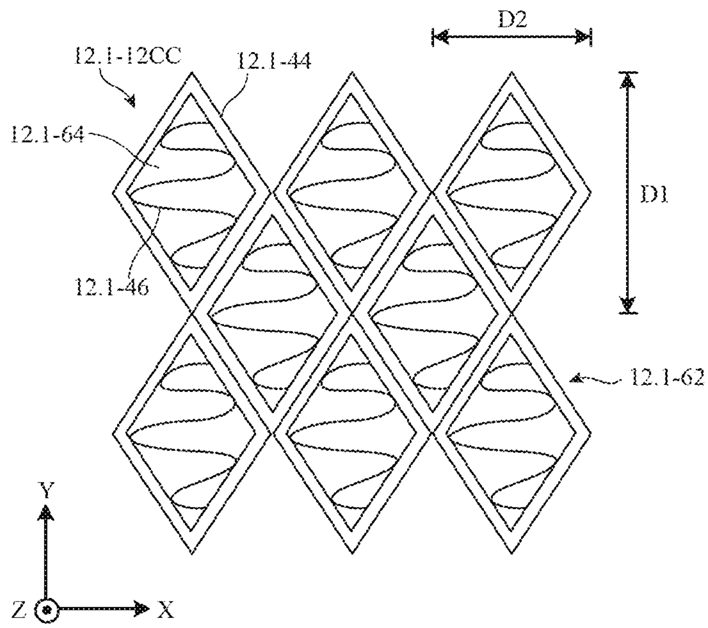
*FIG. 12.1-6*
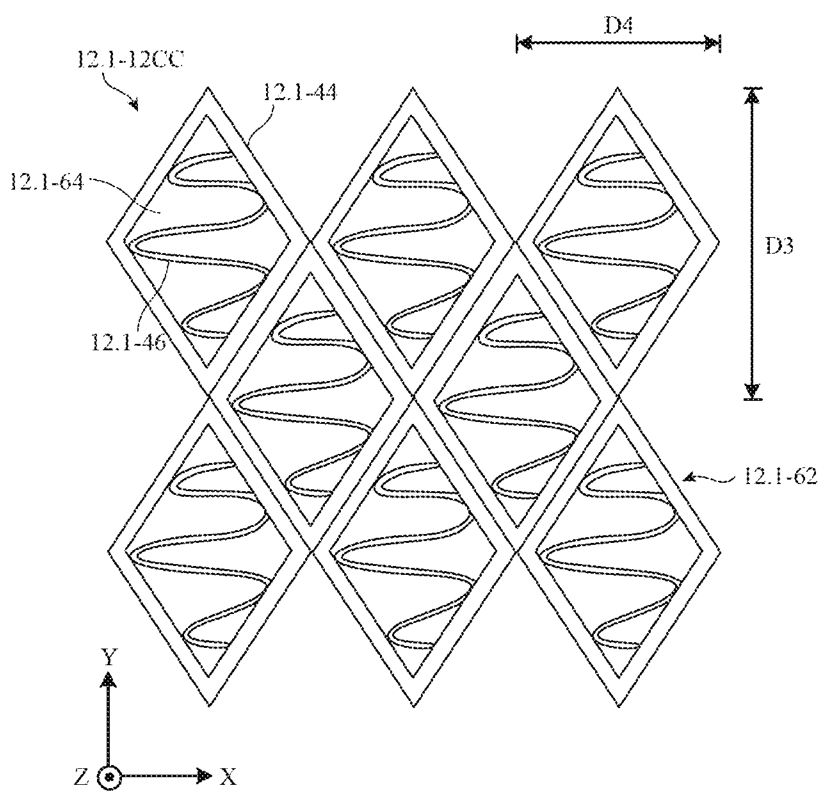
*FIG. 12.1-7*

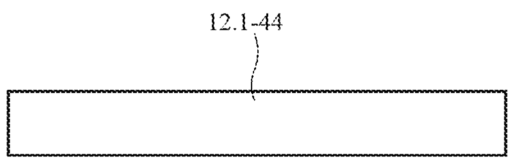
*FIG. 12.1-8*
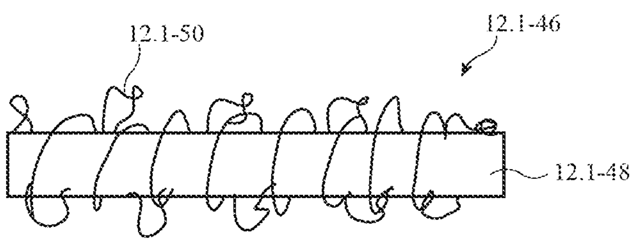
*FIG. 12.1-9*

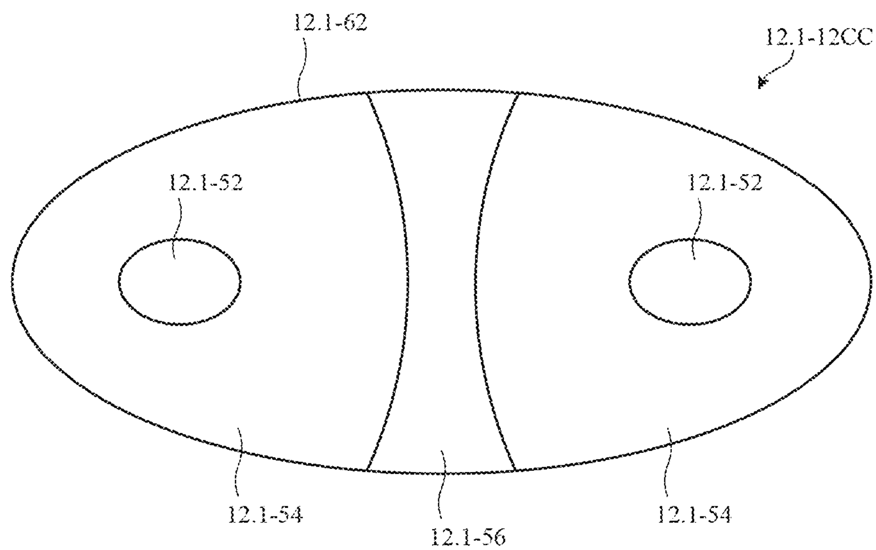
*FIG. 12.1-10*
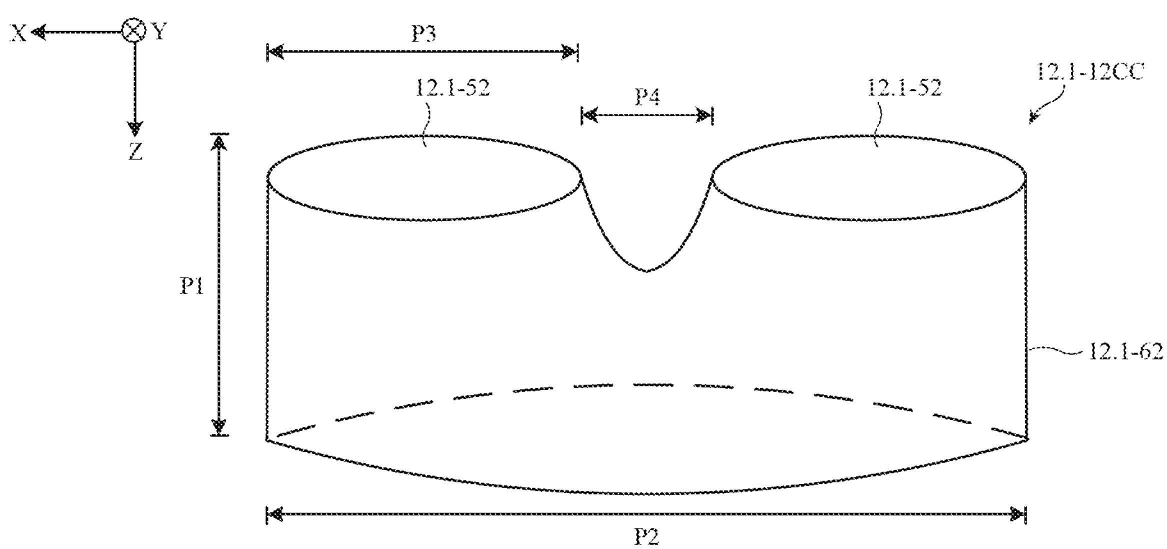
*FIG. 12.1-11*

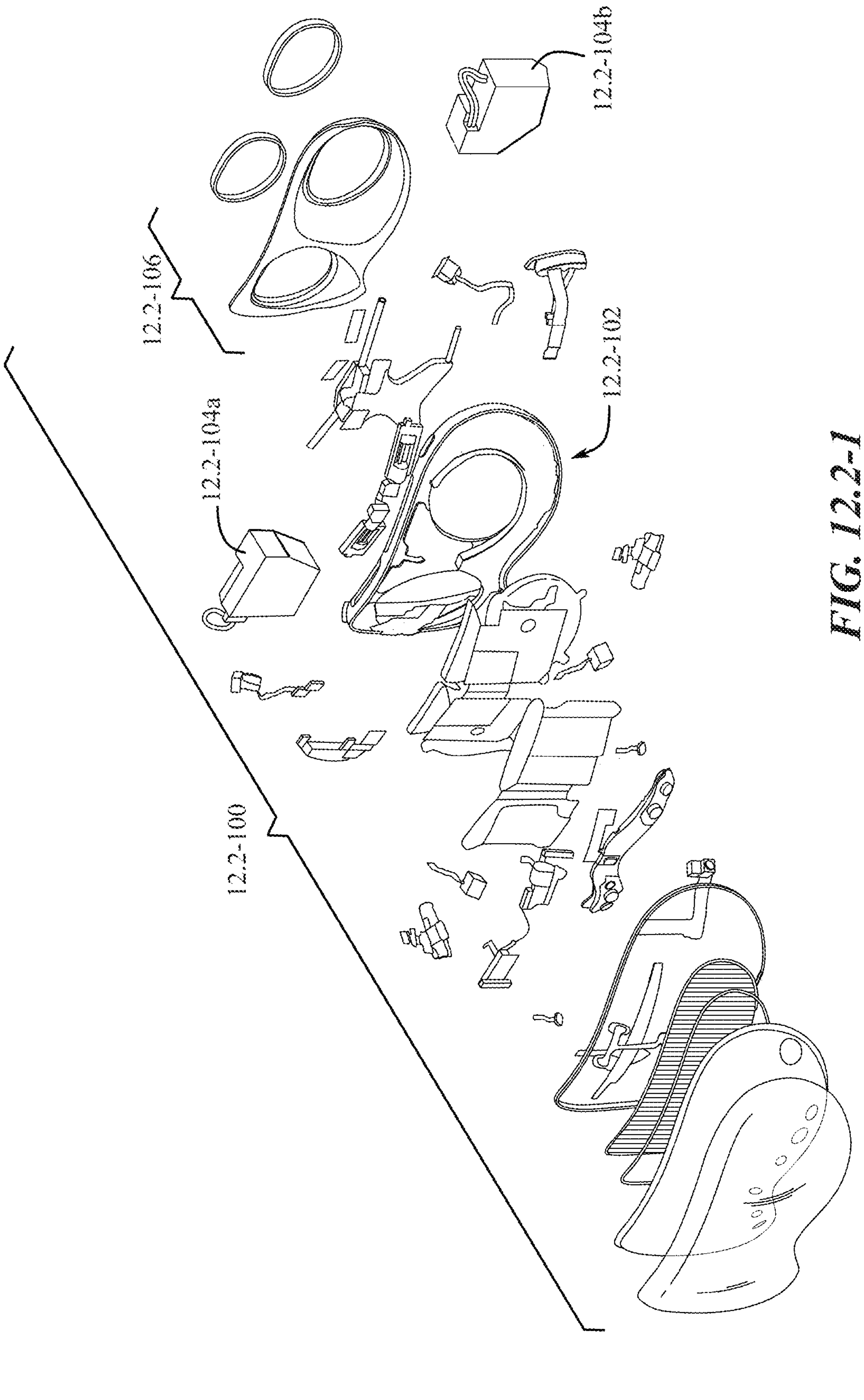
FIG. 12.2-1

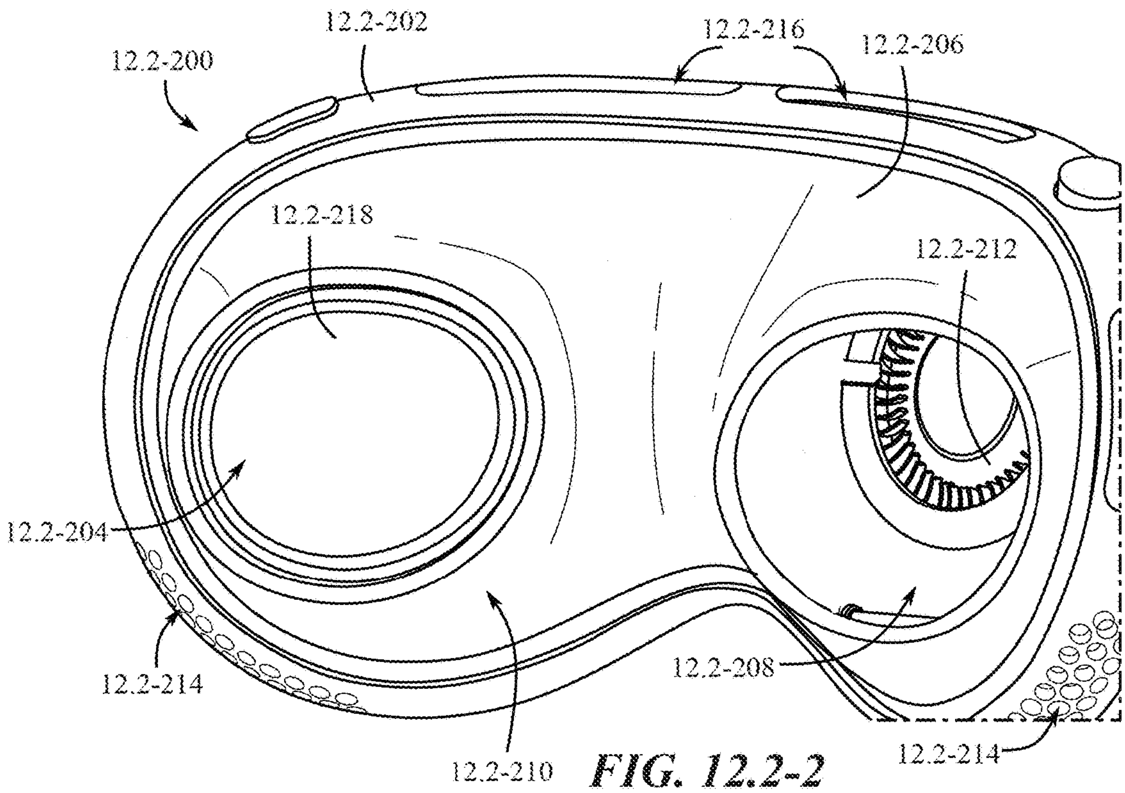
FIG. 12.2-2
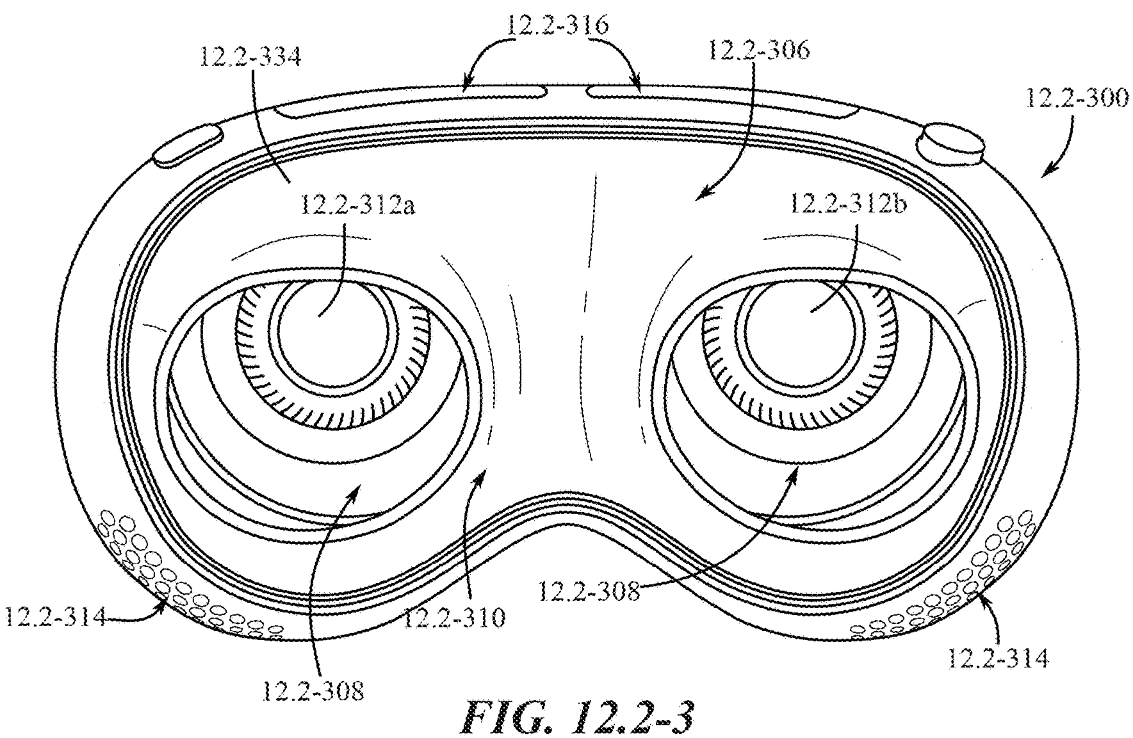
FIG. 12.2-3

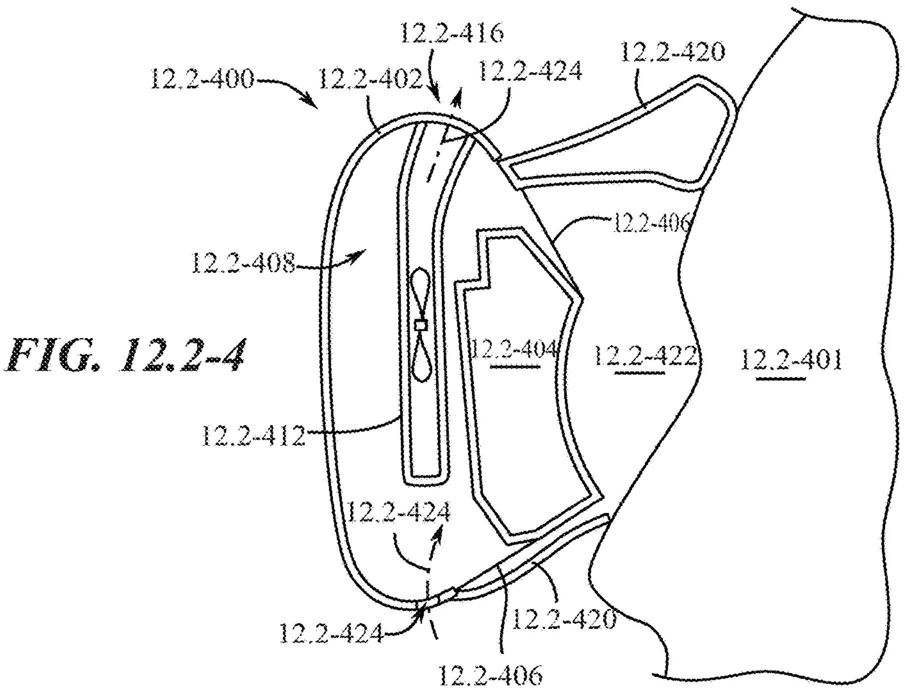
FIG. 12.2-4
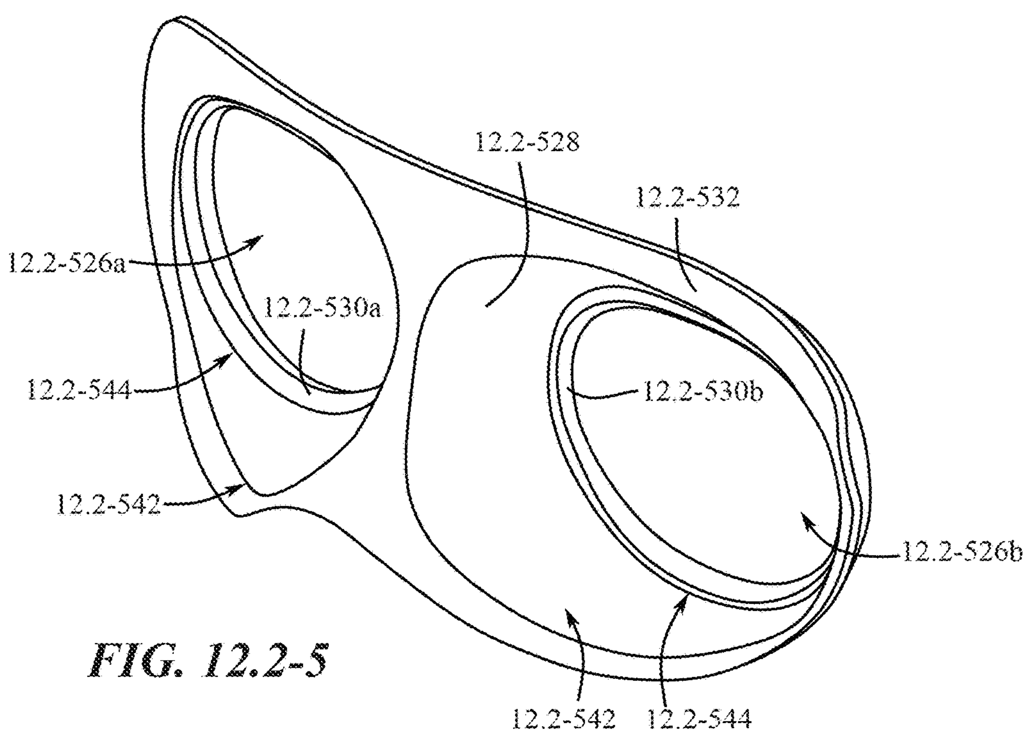
FIG. 12.2-5

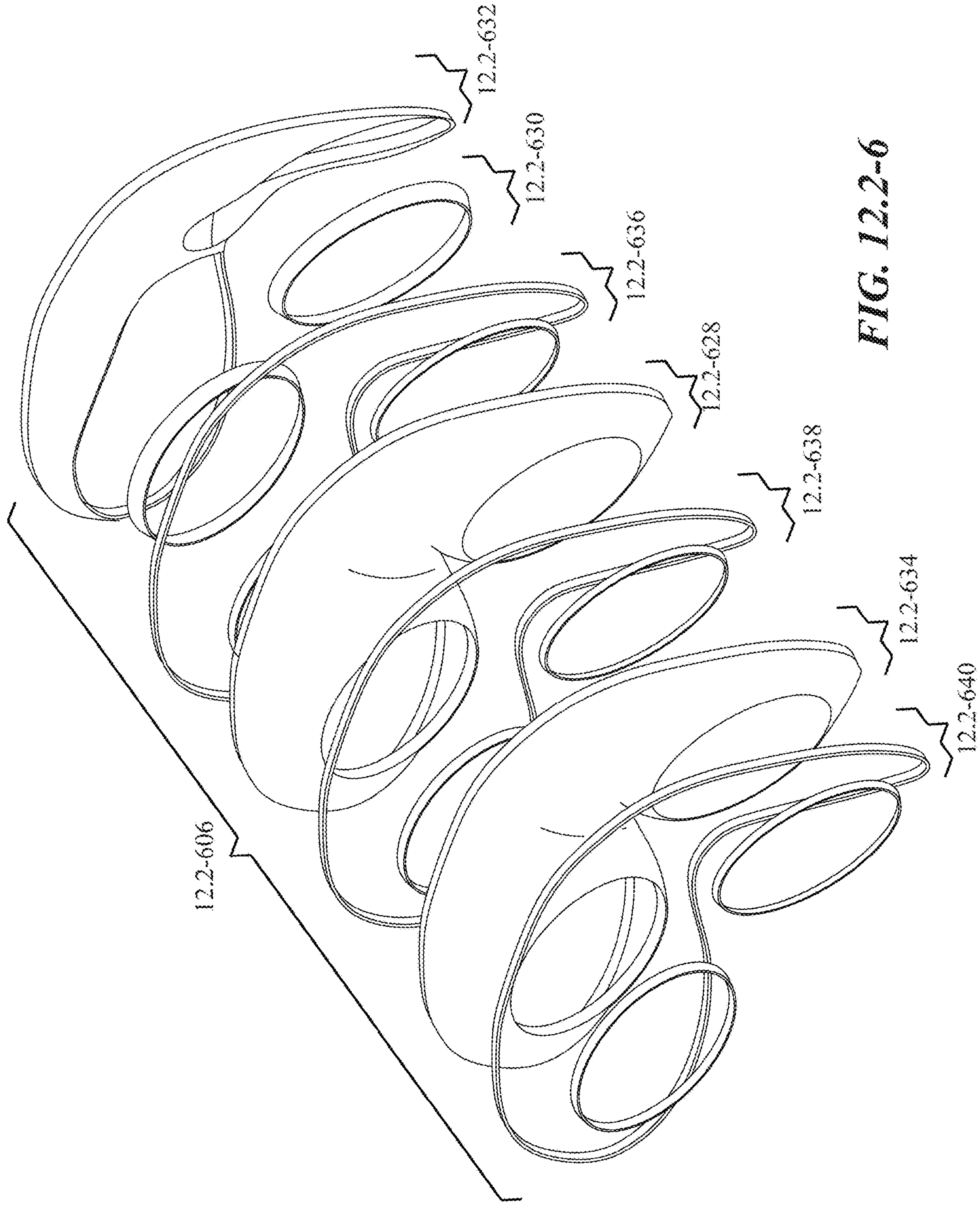
*FIG. 12.2-6*

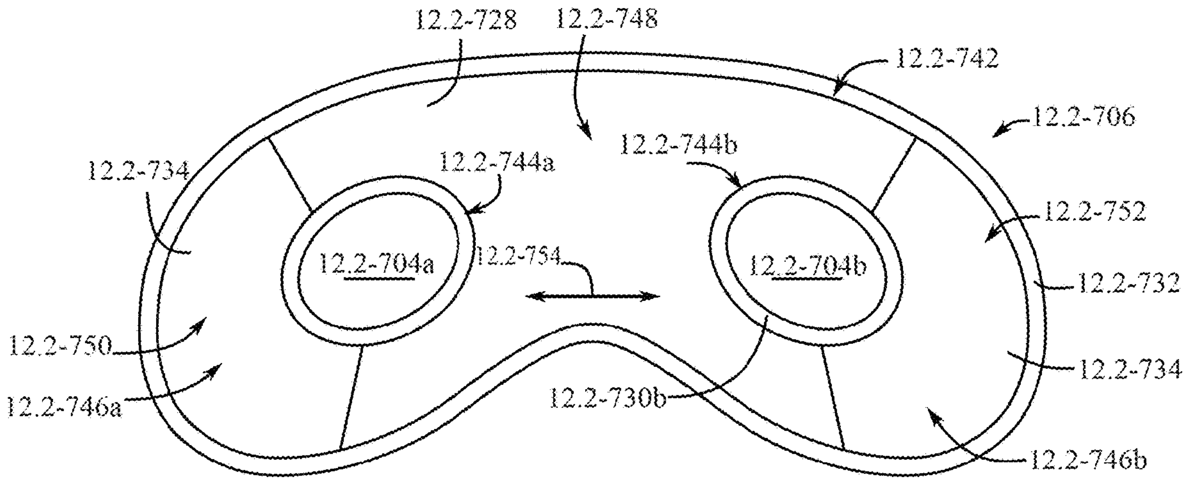
*FIG. 12.2-7*
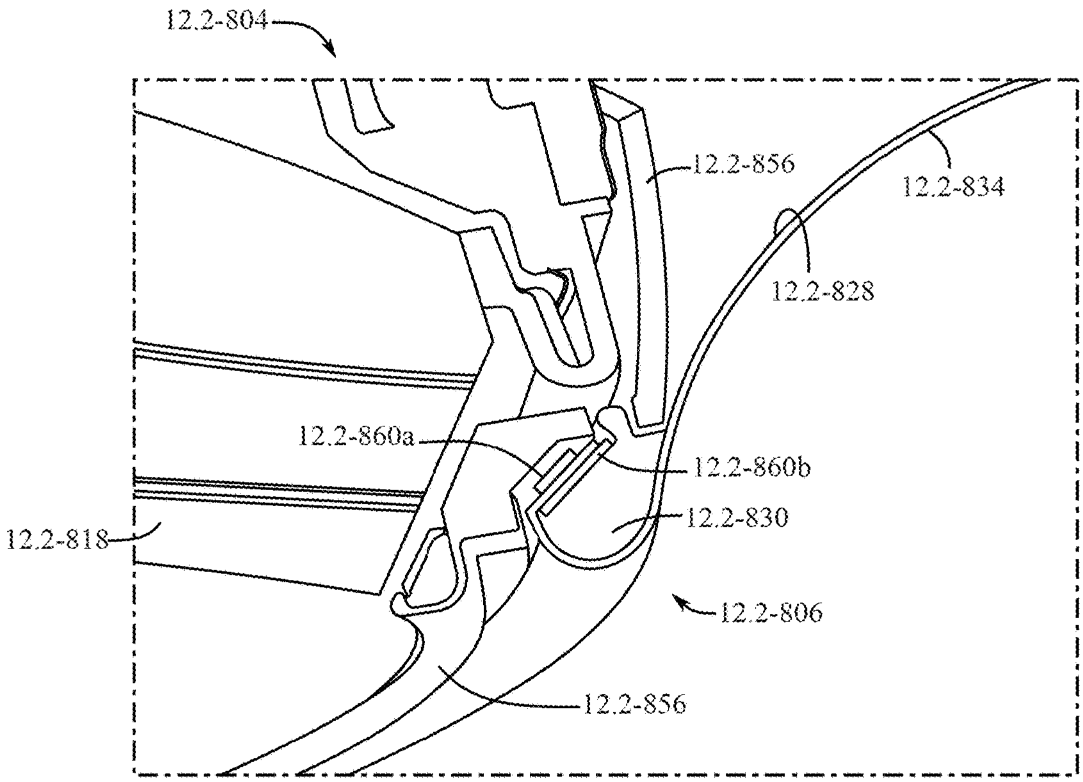
*FIG. 12.2-8*

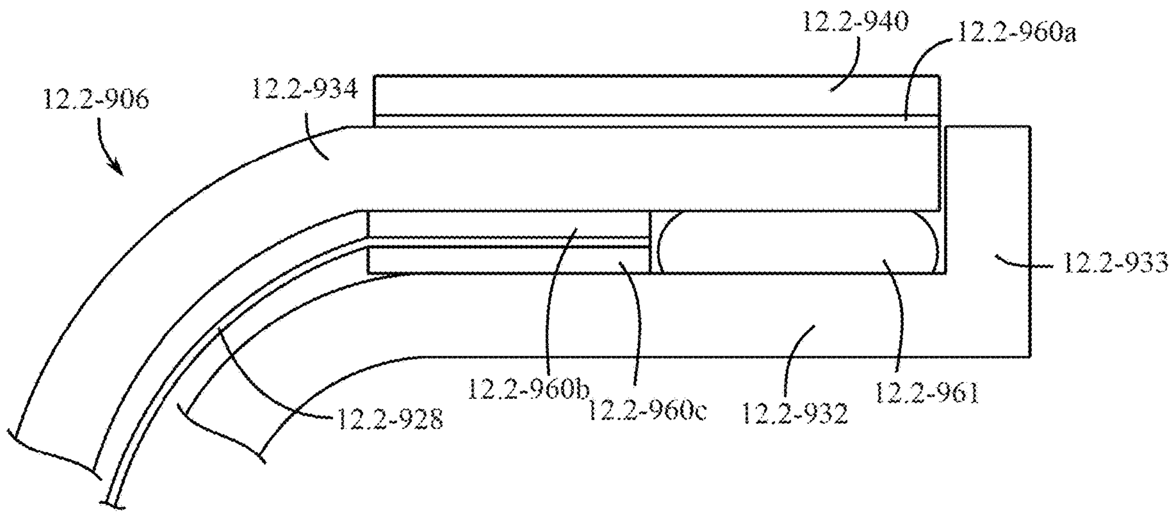
FIG. 12.2-9
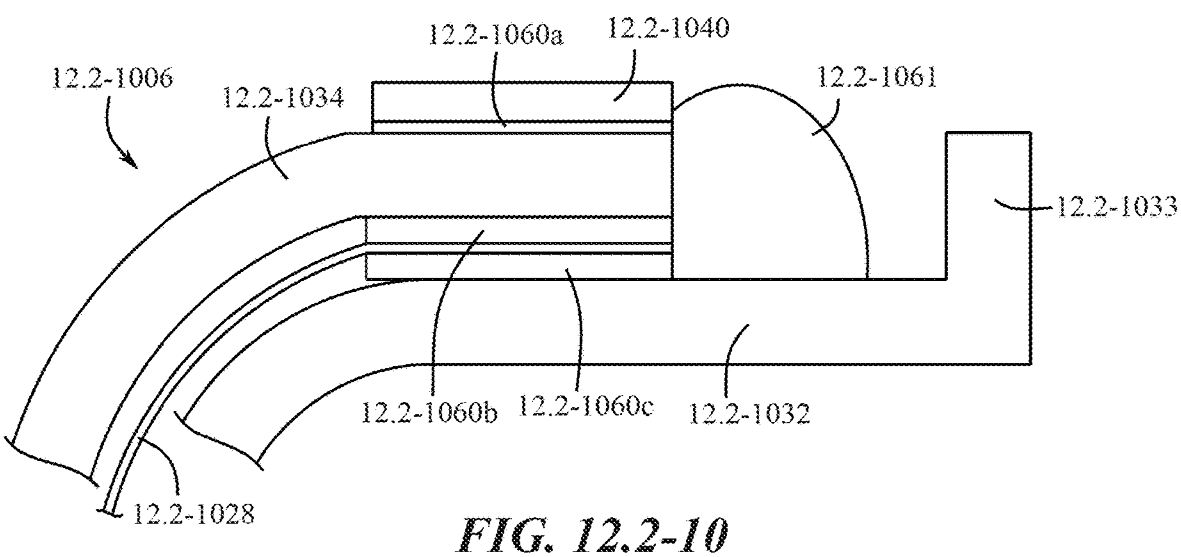
FIG. 12.2-10

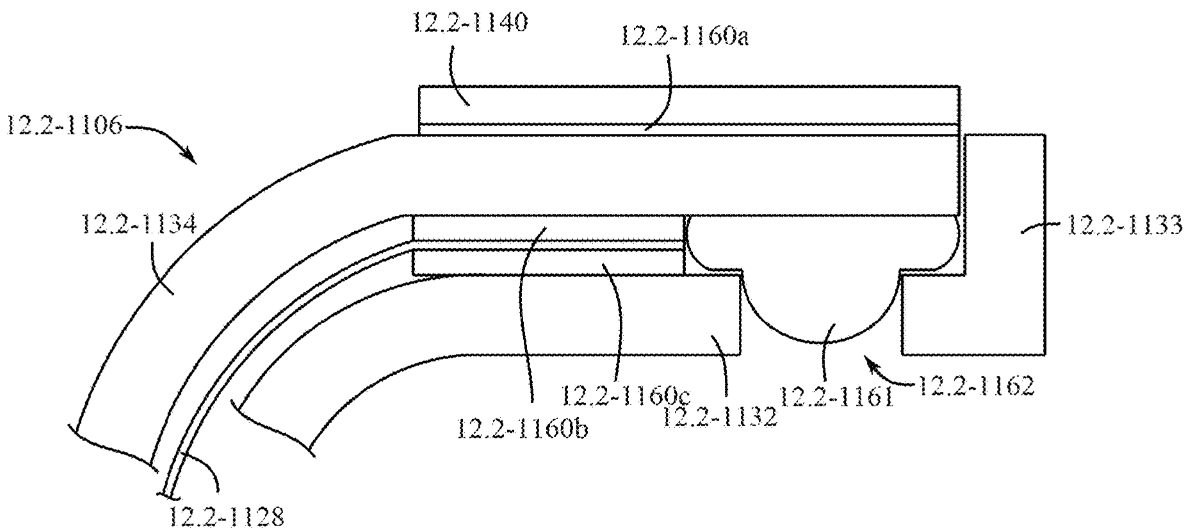
*FIG. 12.2-11*
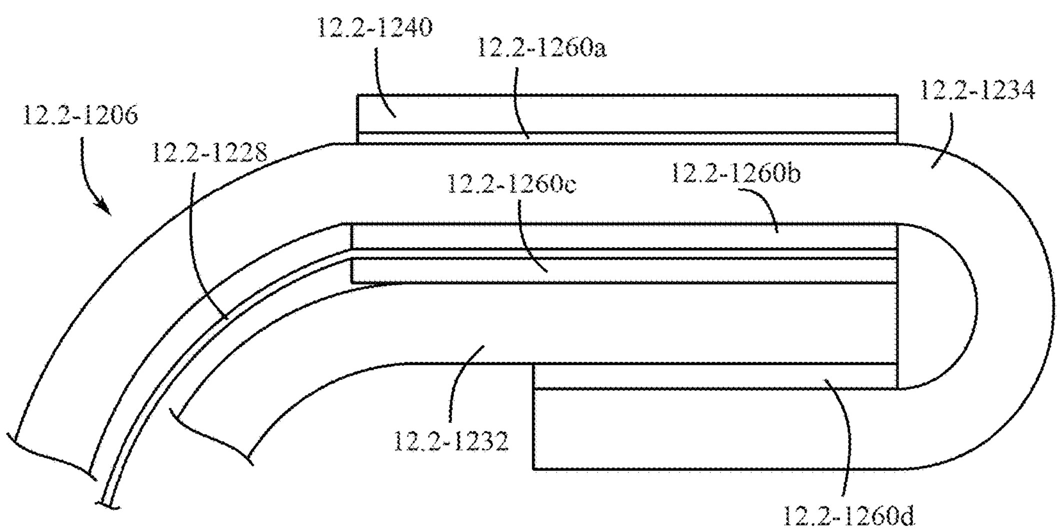
*FIG. 12.2-12*

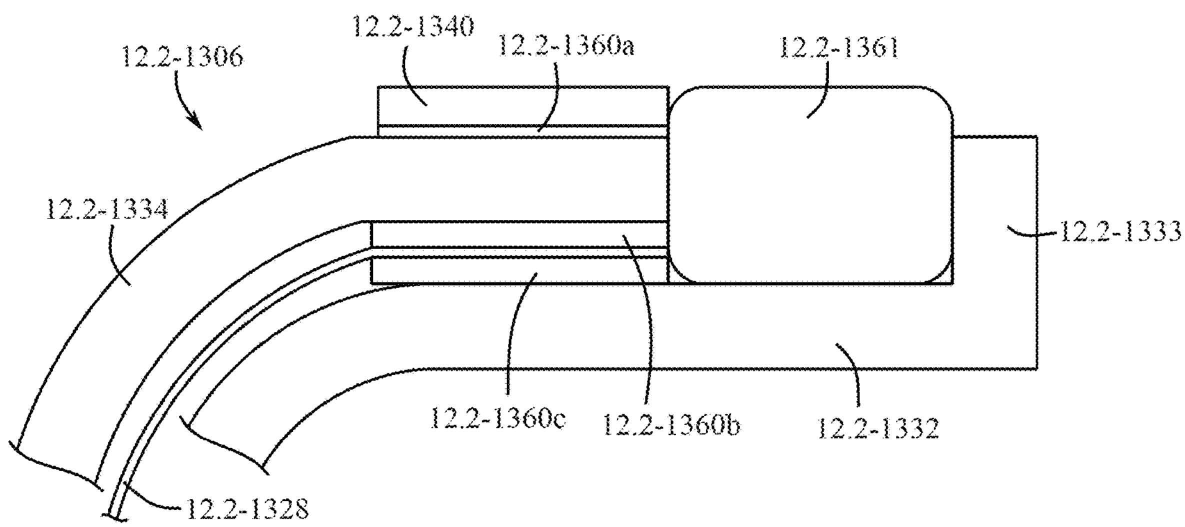
*FIG. 12.2-13*

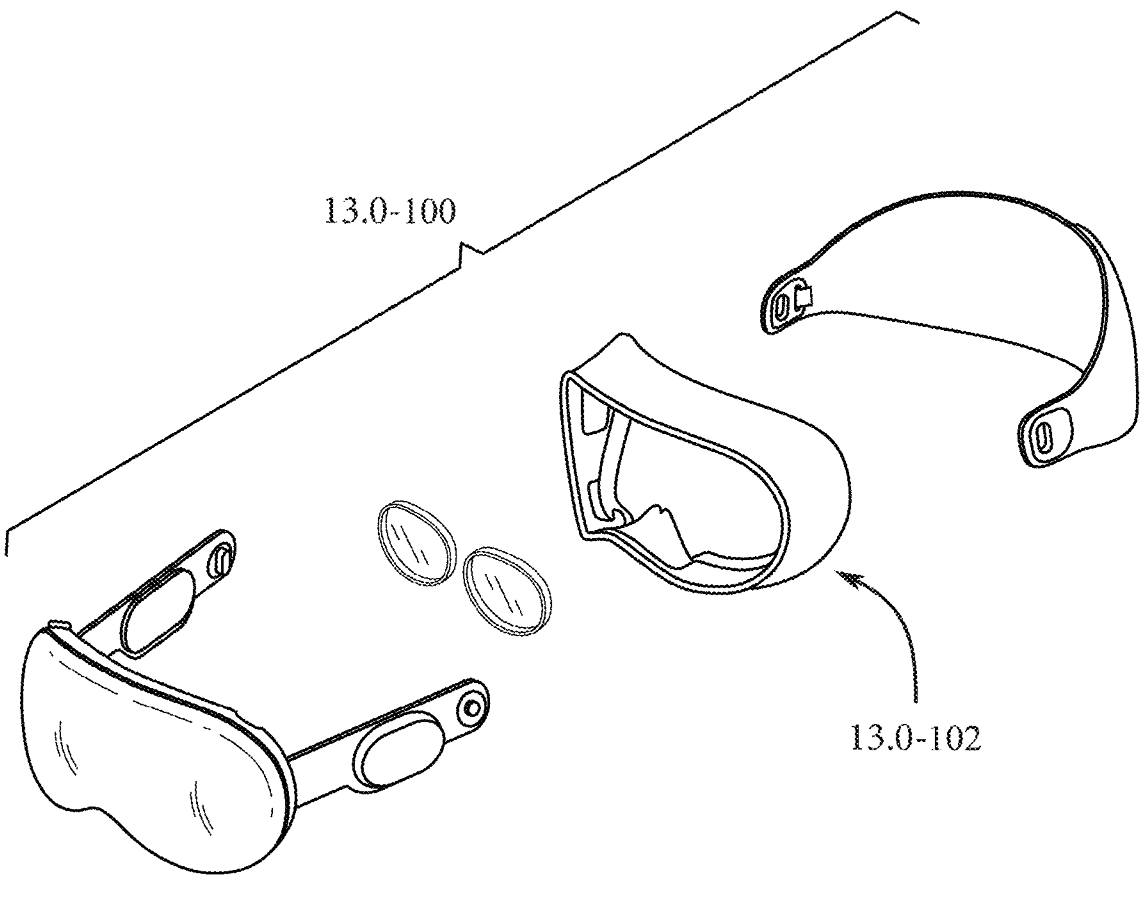
*FIG. 13.0-1*

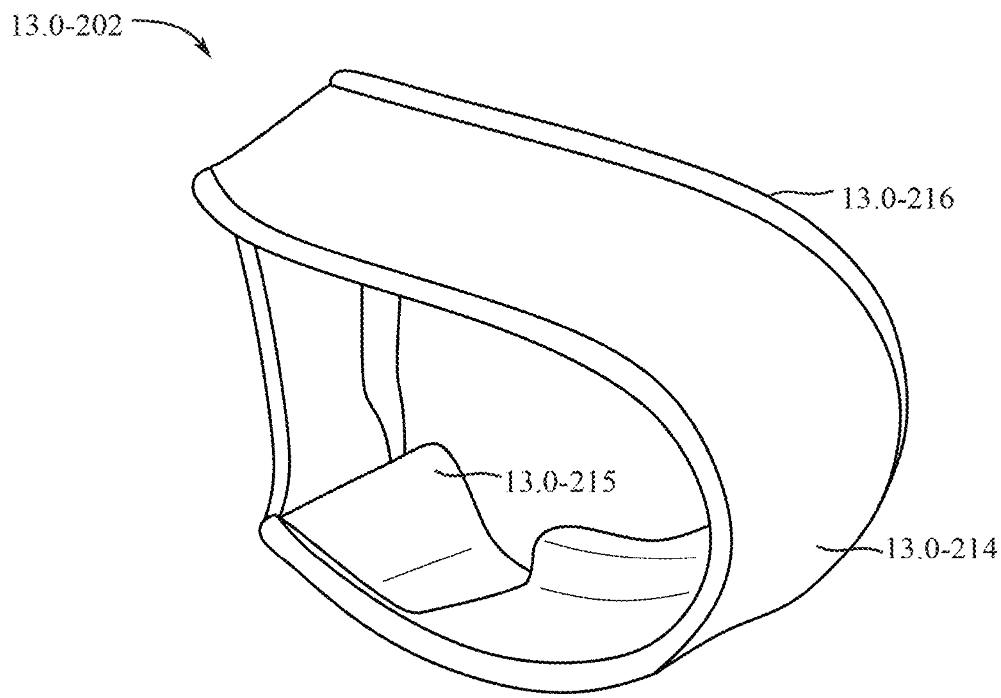
*FIG. 13.0-2A*

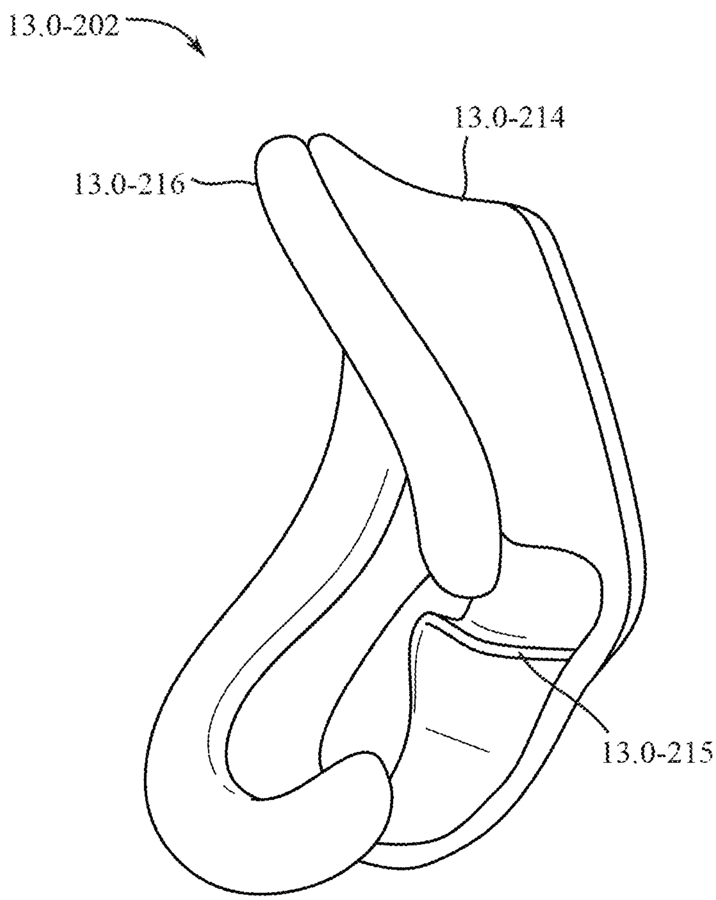
*FIG. 13.0-2B*

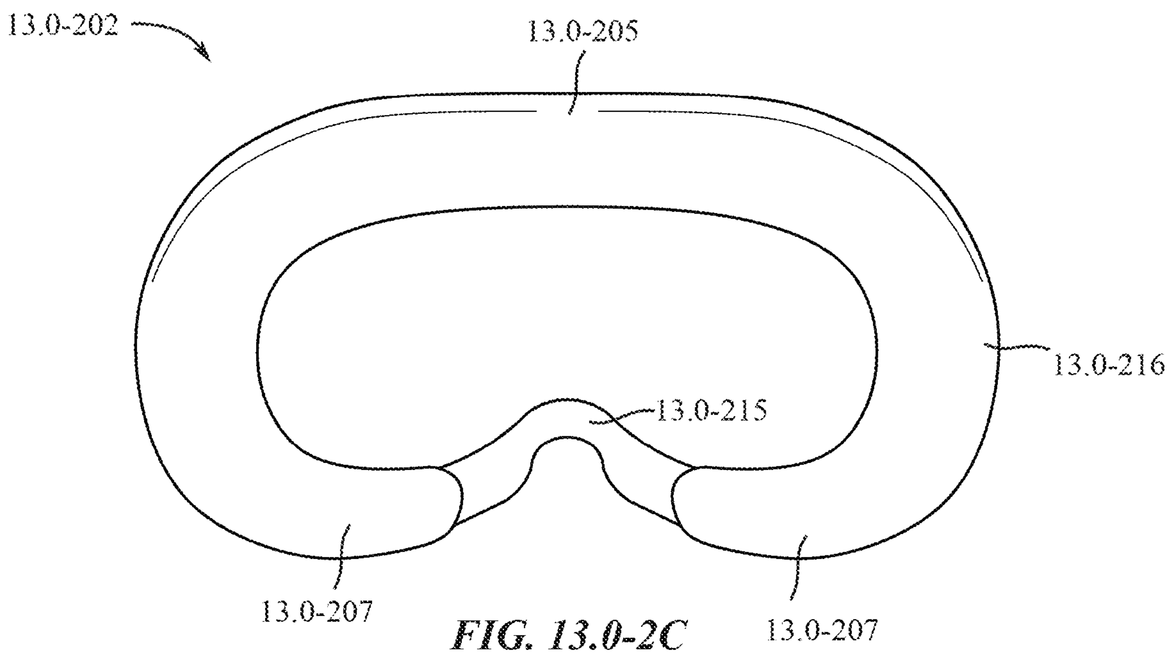
FIG. 13.0-2C

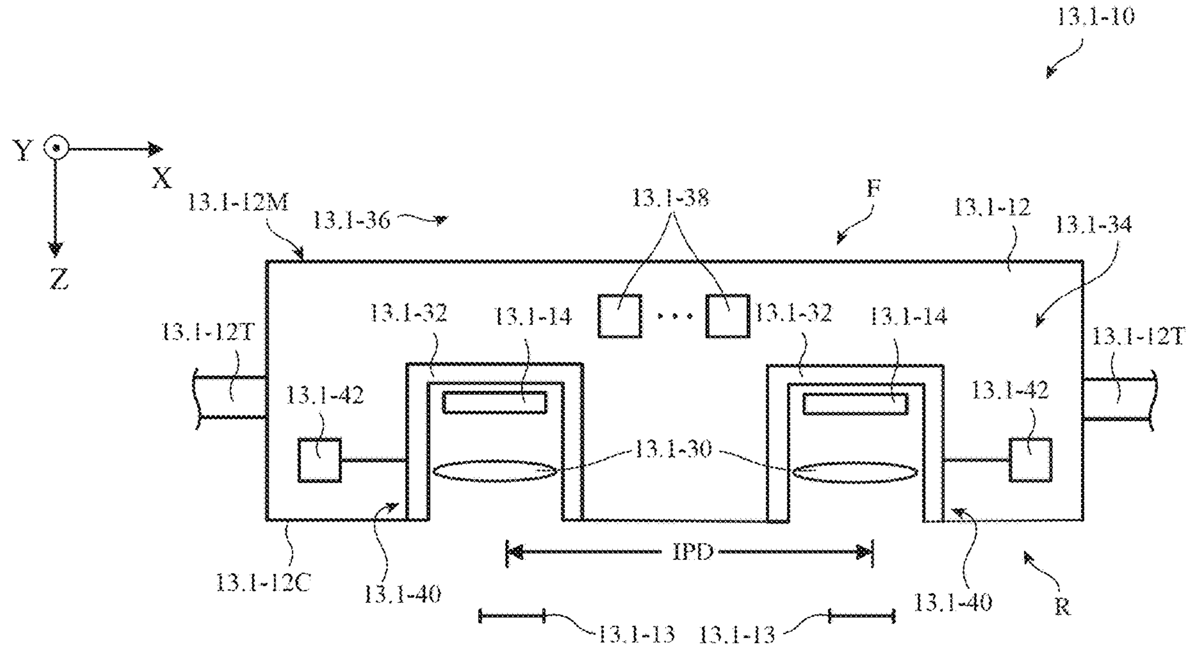
*FIG. 13.1-1*
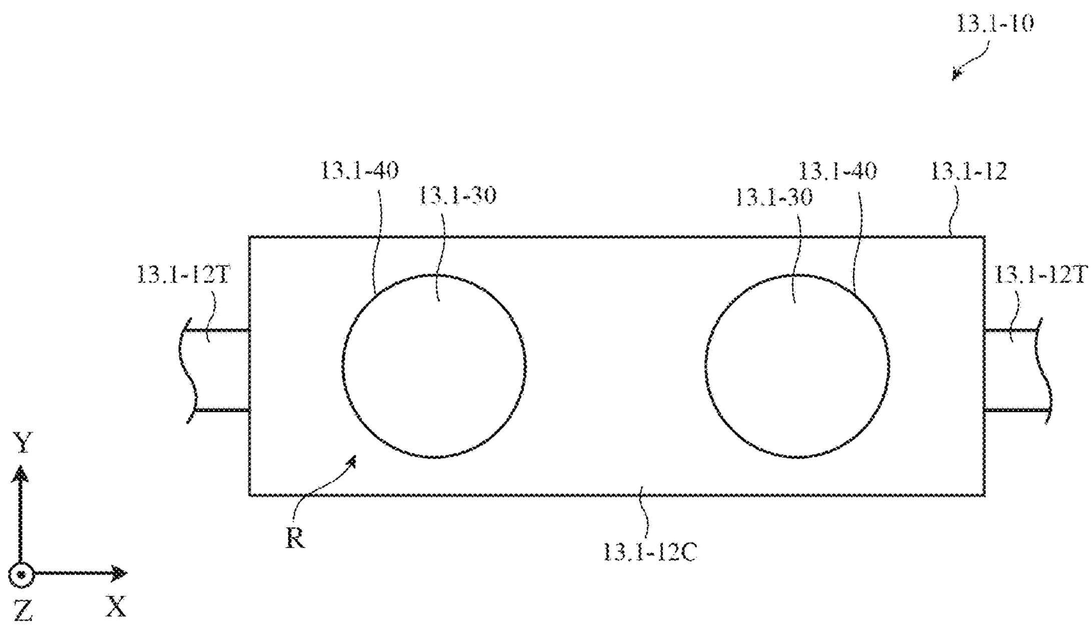
*FIG. 13.1-2*

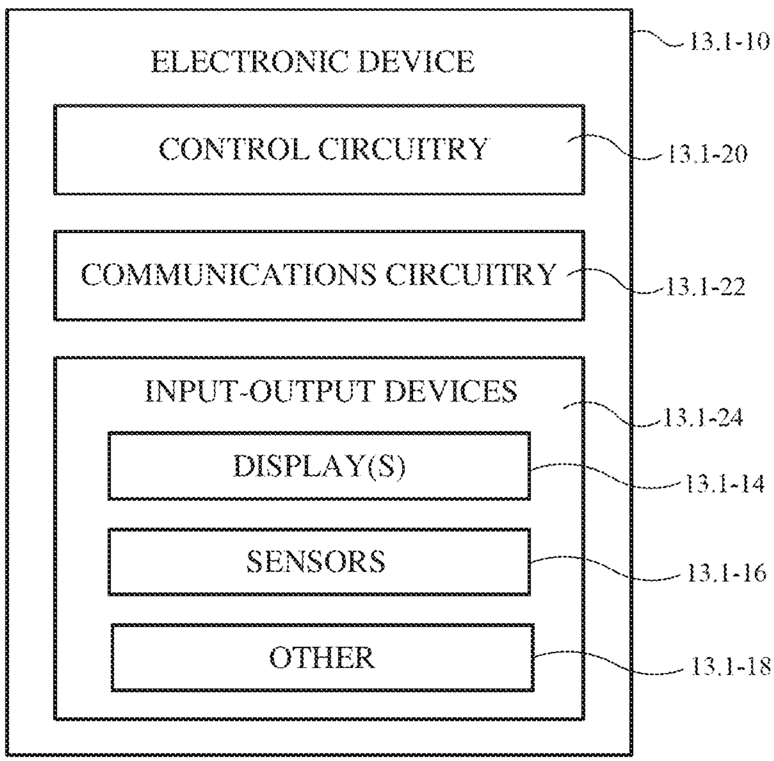
*FIG. 13.1-3*

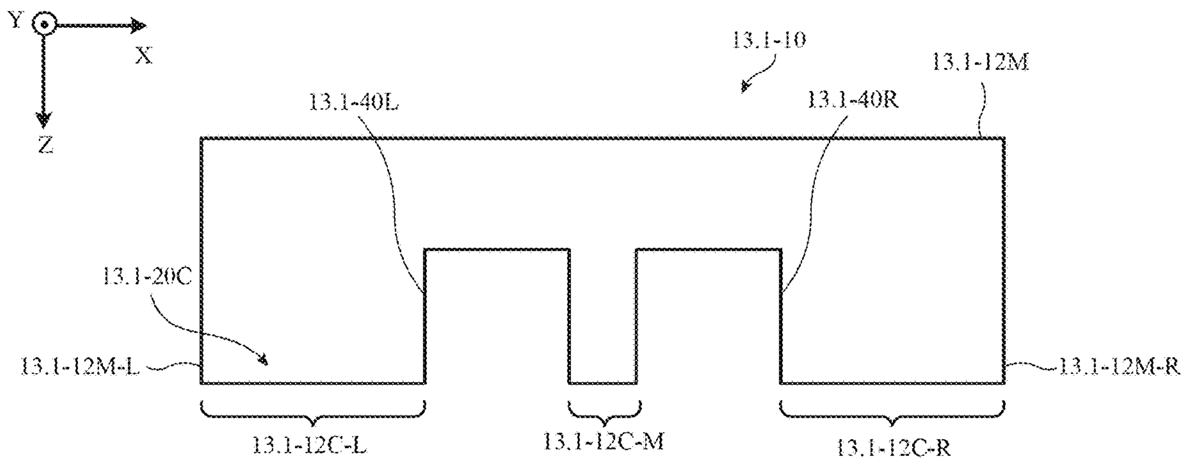
*FIG. 13.1-4*
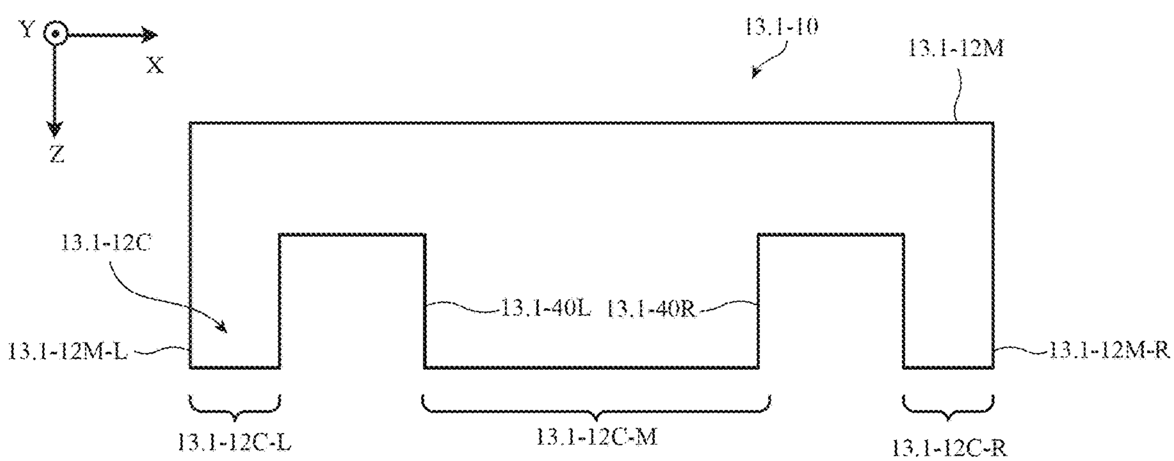
*FIG. 13.1-5*

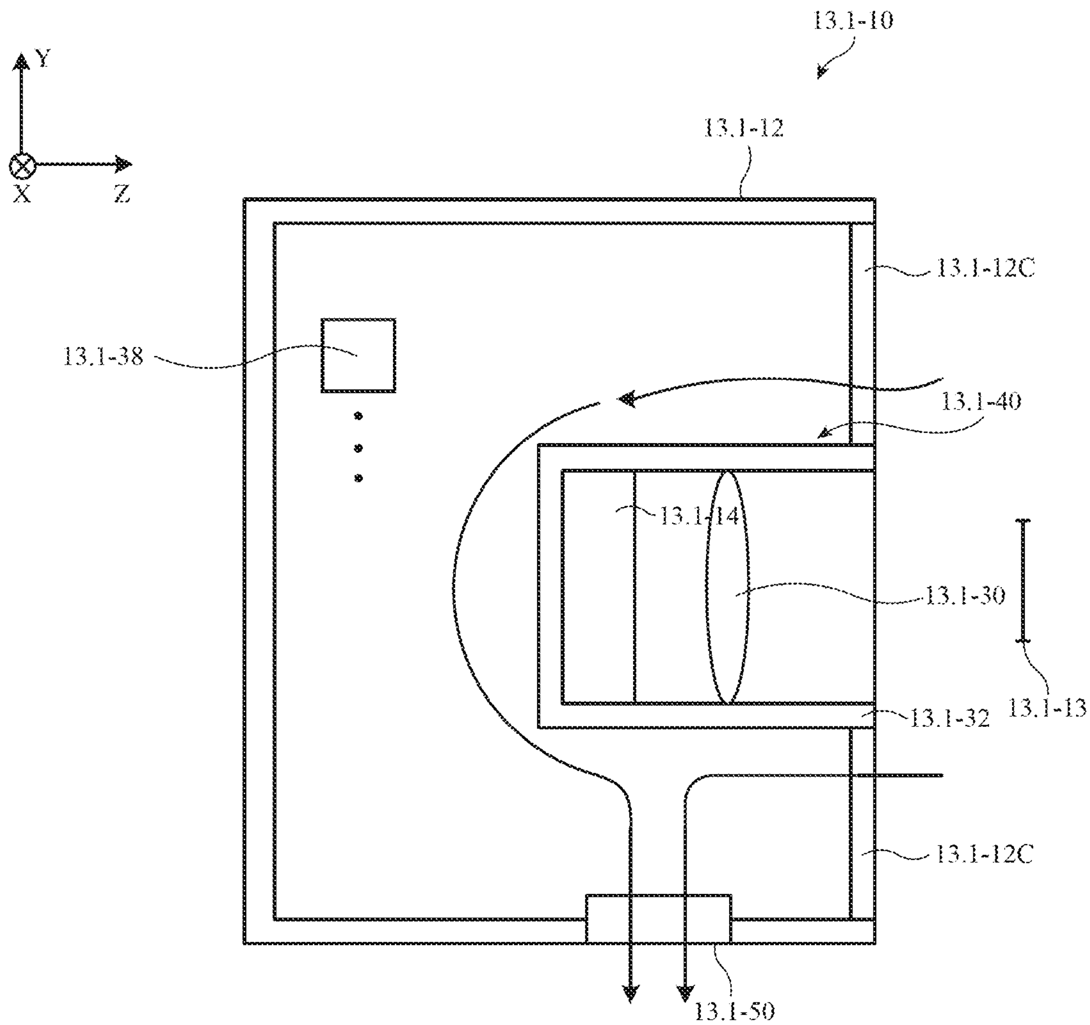
*FIG. 13.1-6*

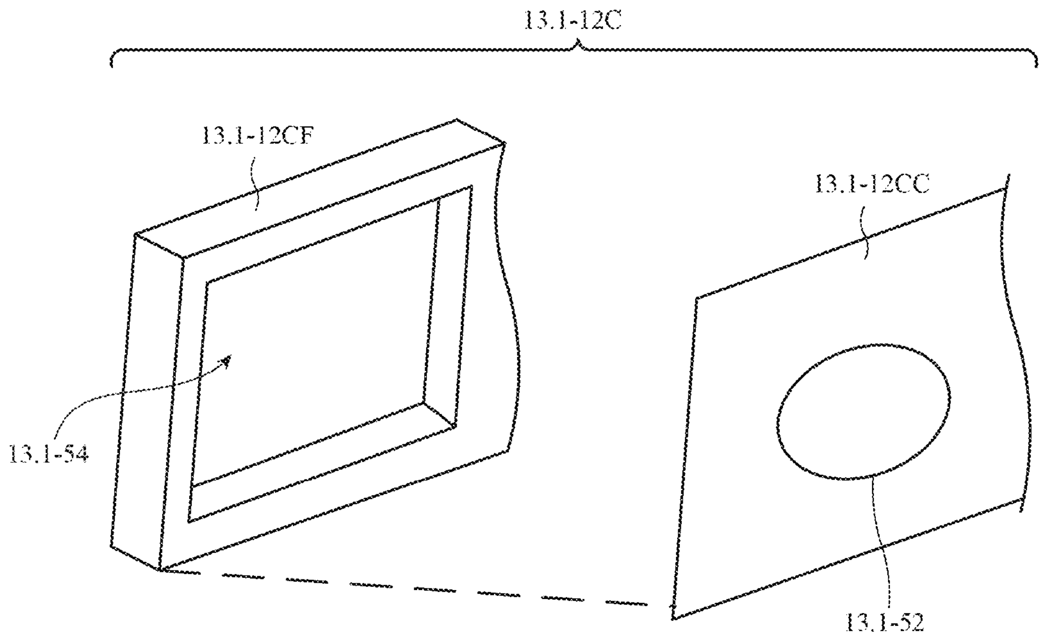
*FIG. 13.1-7*

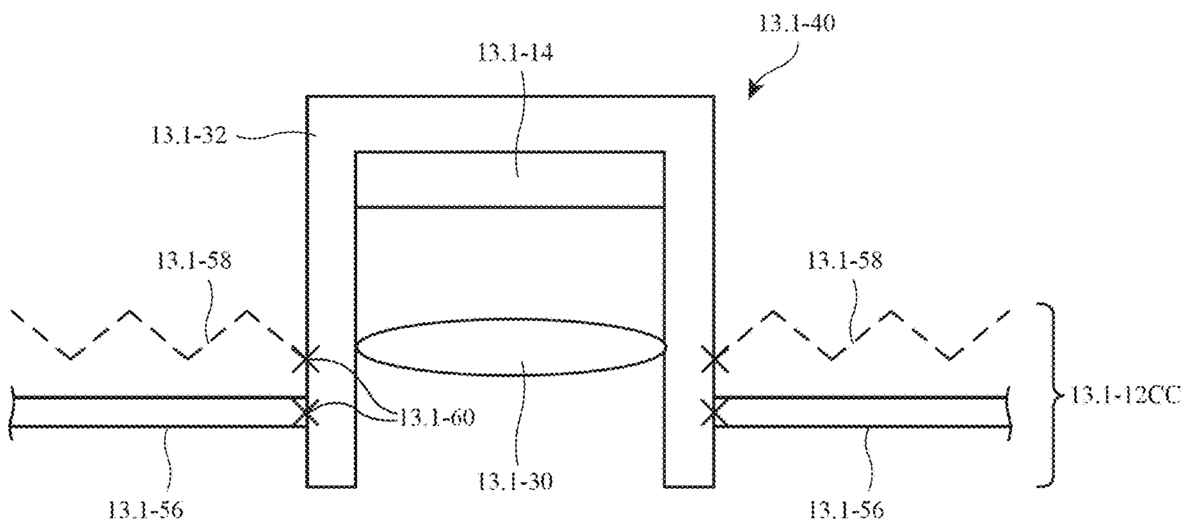
FIG. 13.1-8

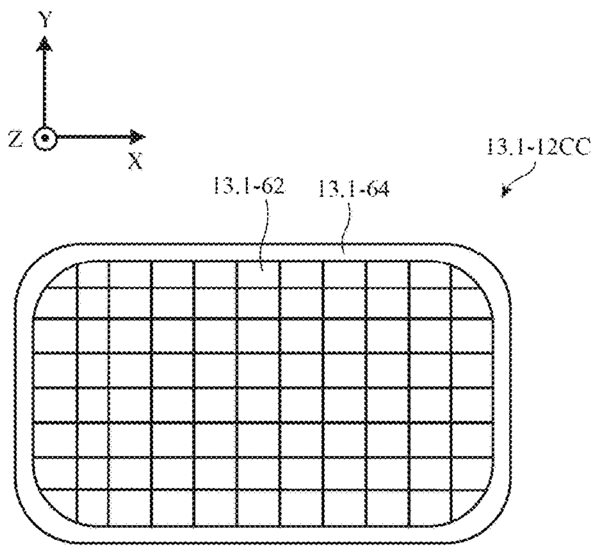
FIG. 13.1-9
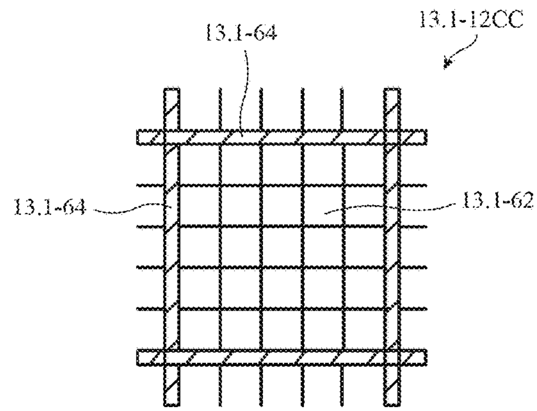
FIG. 13.1-10
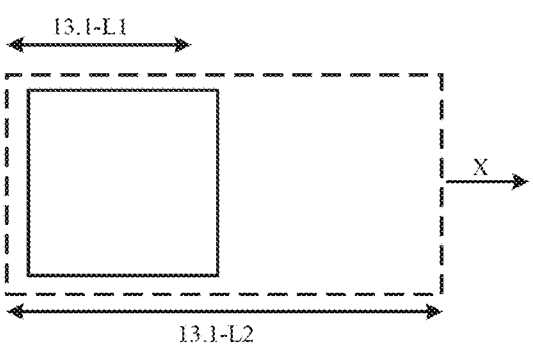
FIG. 13.1-11
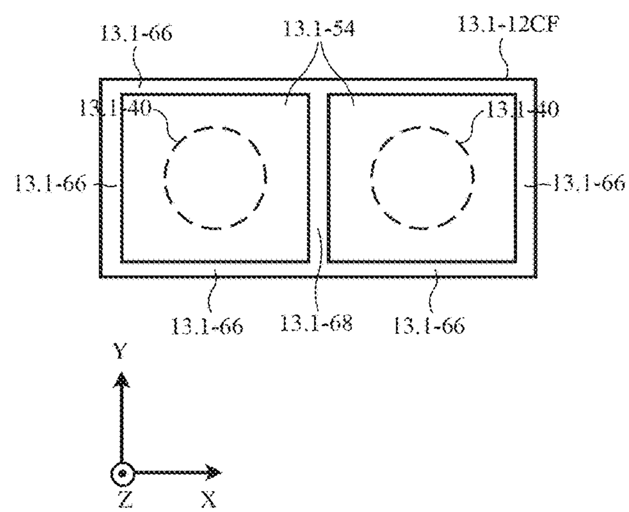
FIG. 13.1-12

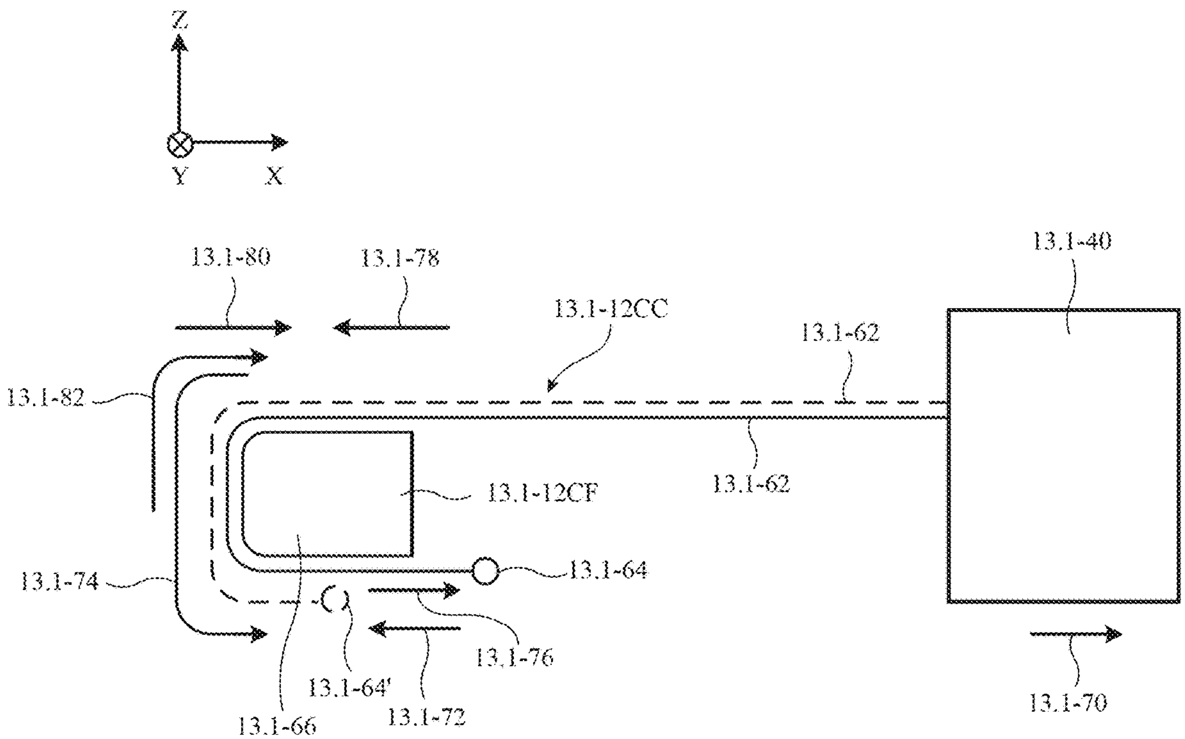
*FIG. 13.1-13*

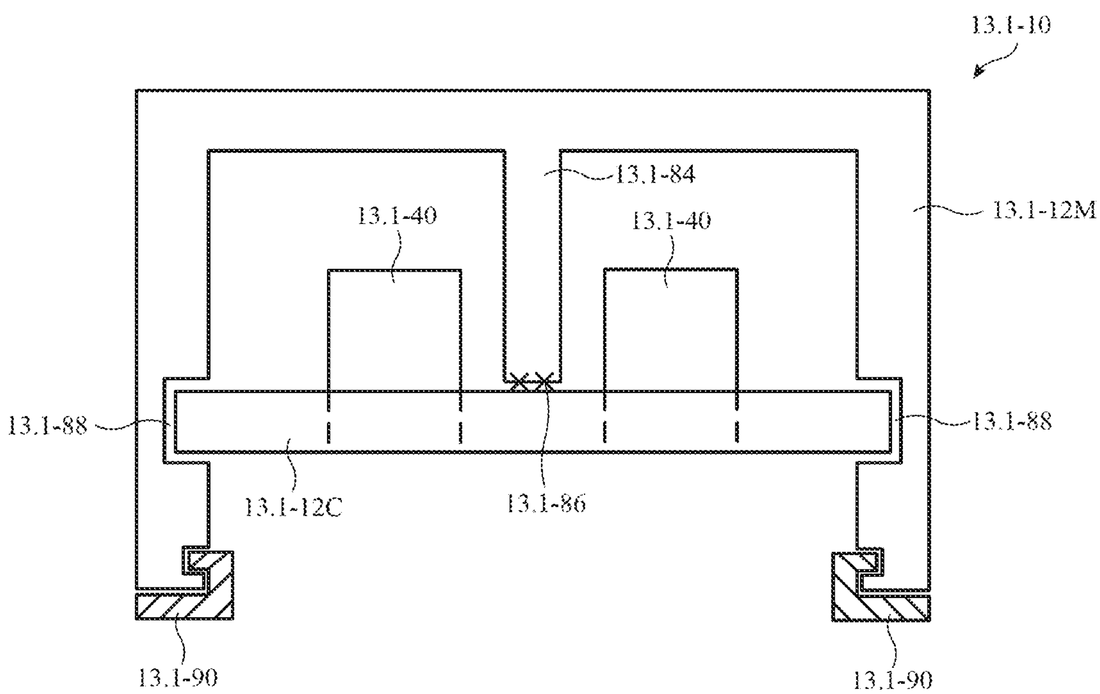
*FIG. 13.1-14*

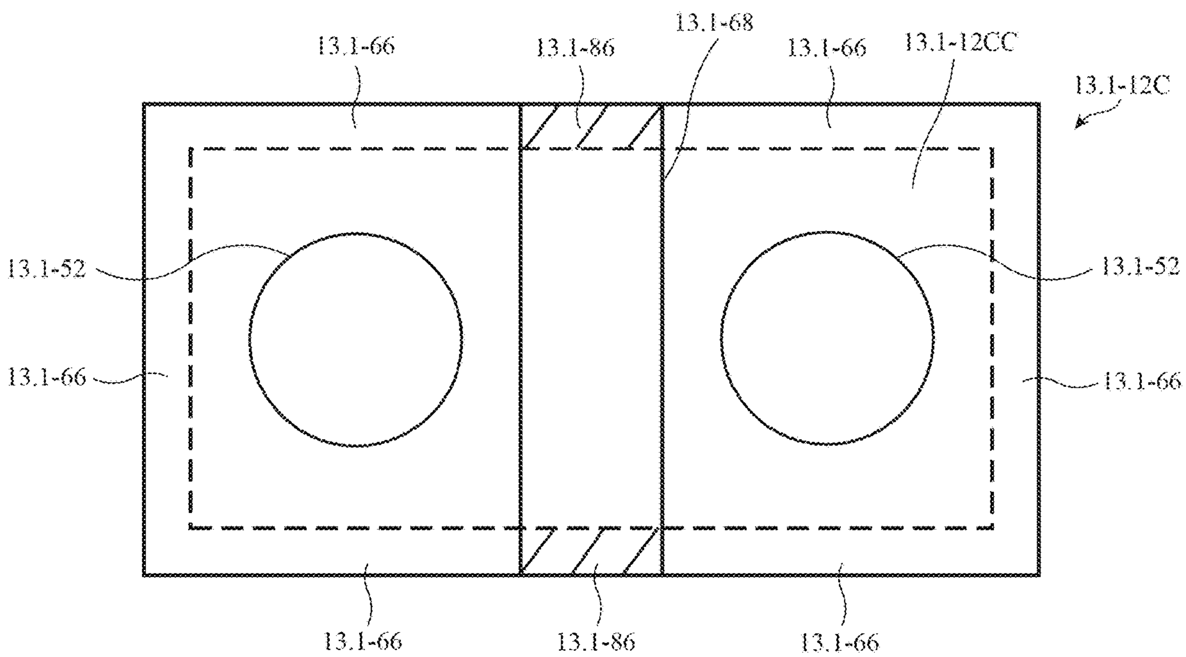
FIG. 13.1-15

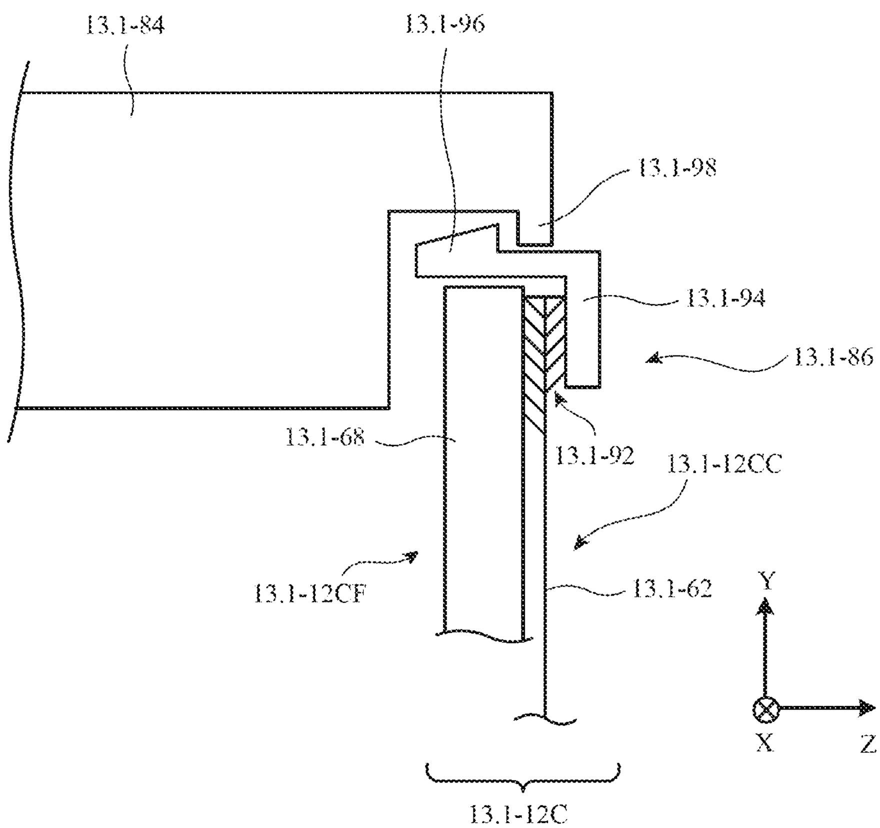
*FIG. 13.1-16*

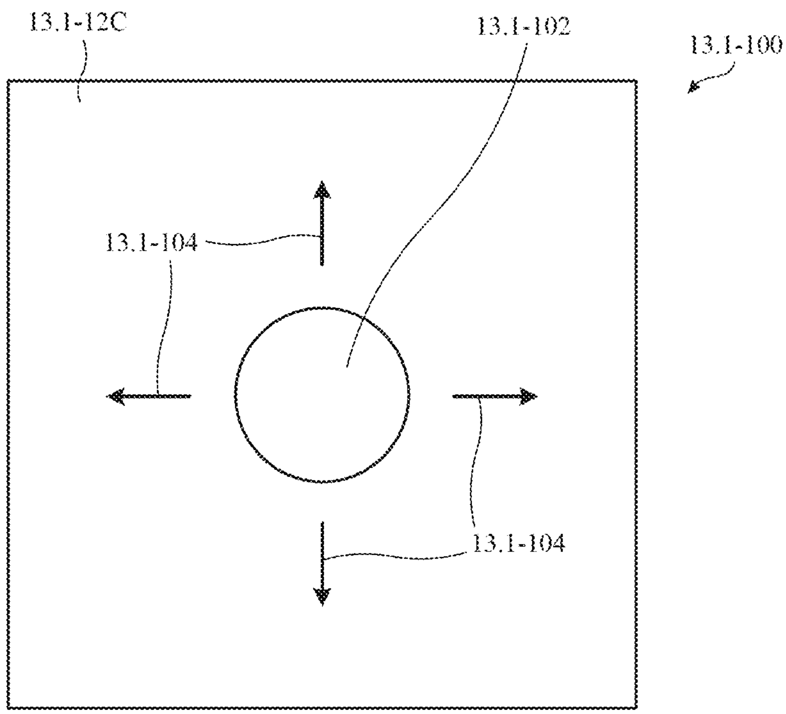
*FIG. 13.1-17*

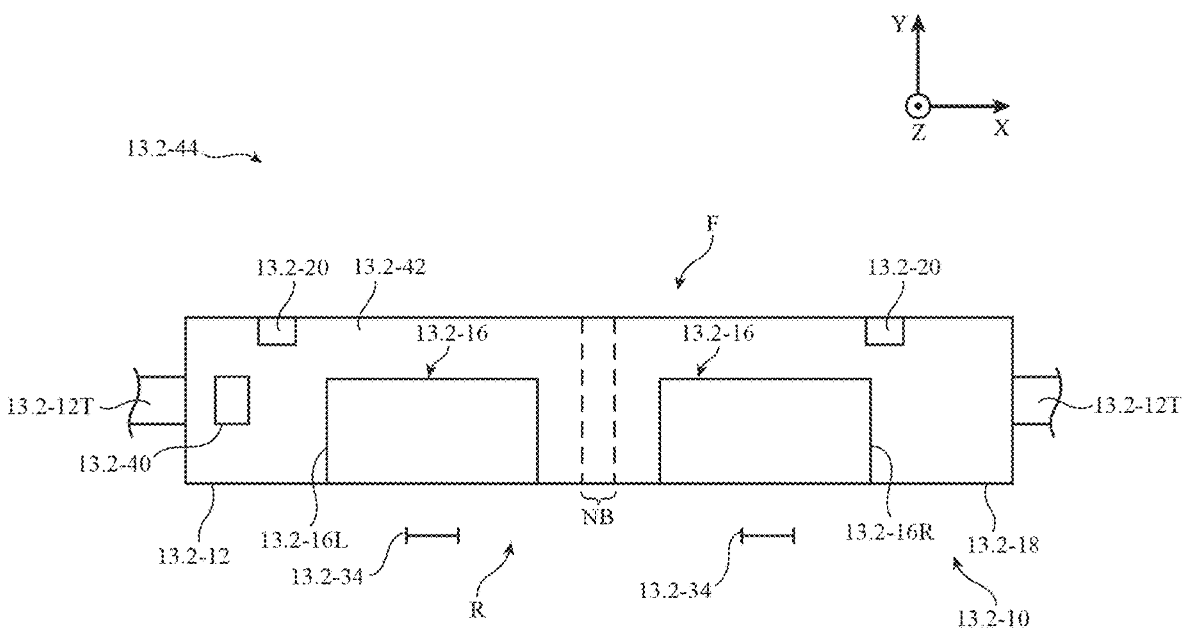
*FIG. 13.2-1*

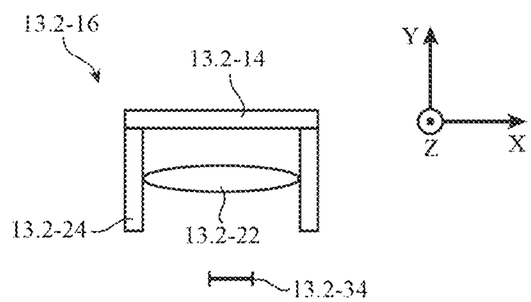
*FIG. 13.2-2*

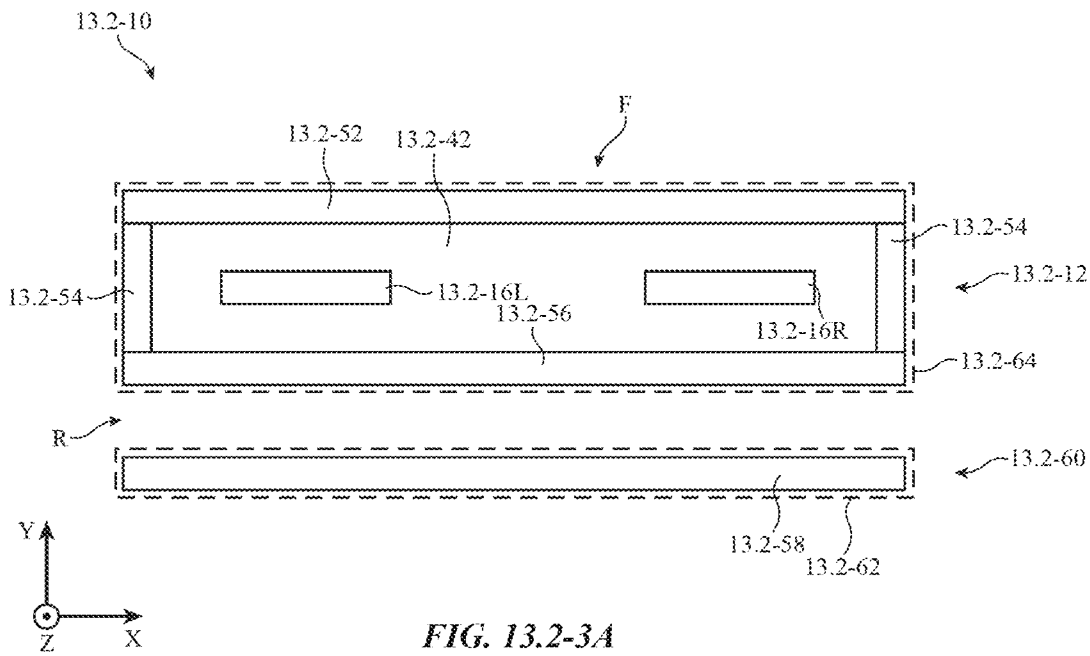
*FIG. 13.2-3A*

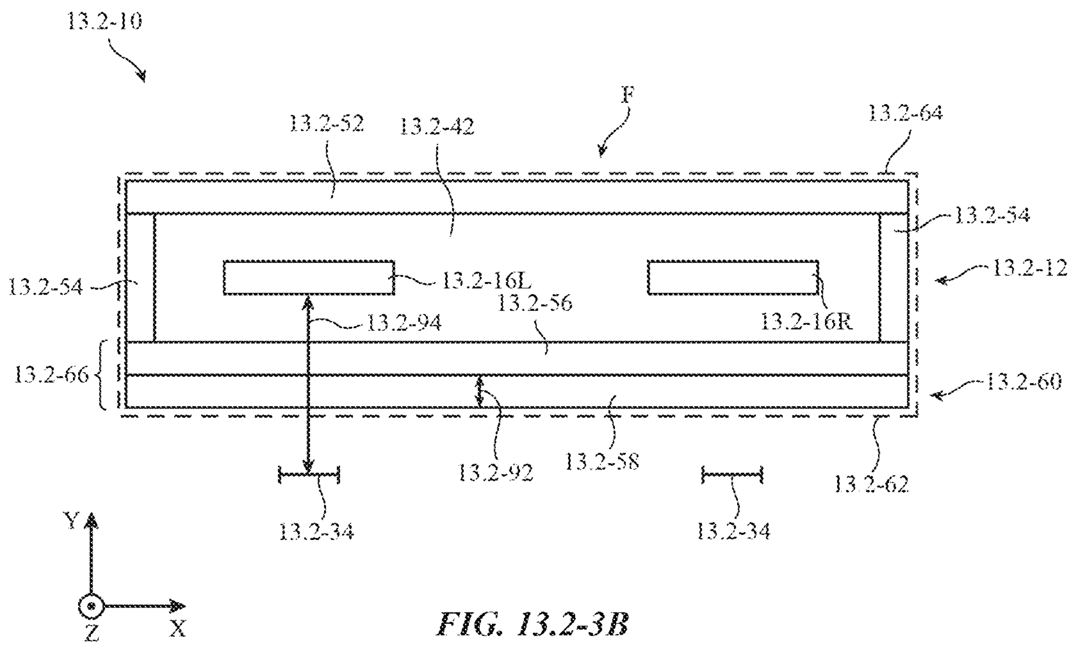
*FIG. 13.2-3B*

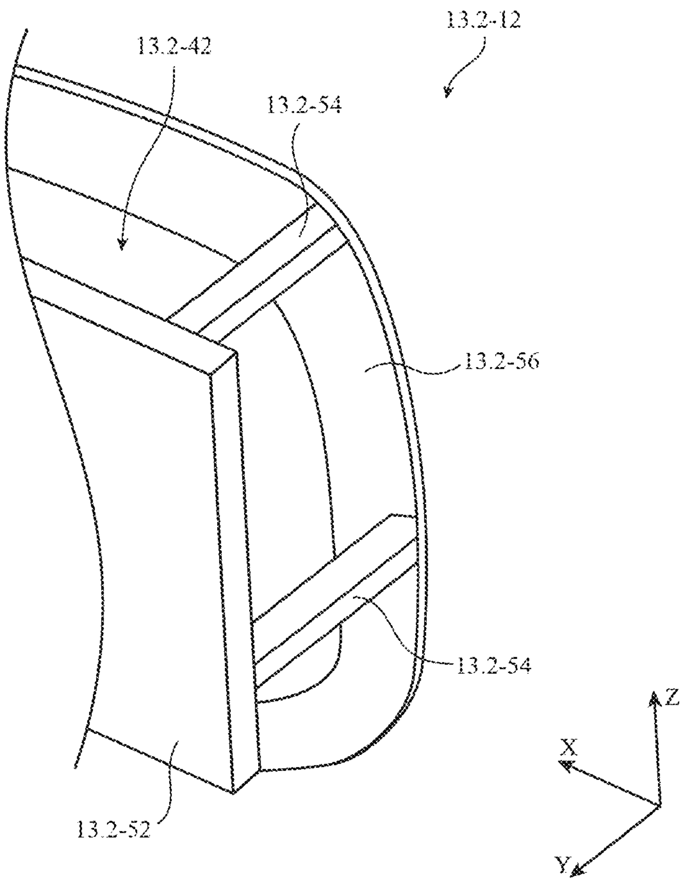
*FIG. 13.2-4*

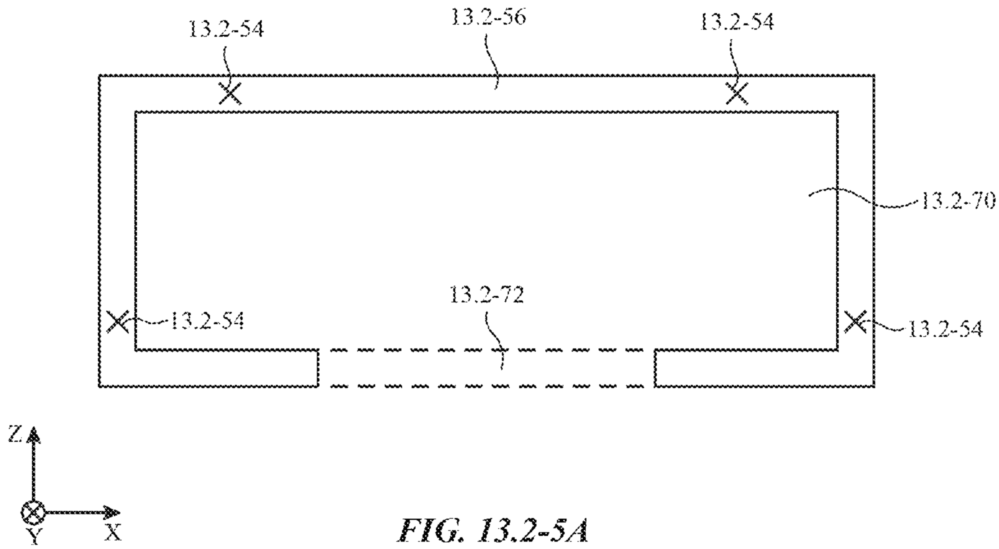
*FIG. 13.2-5A*
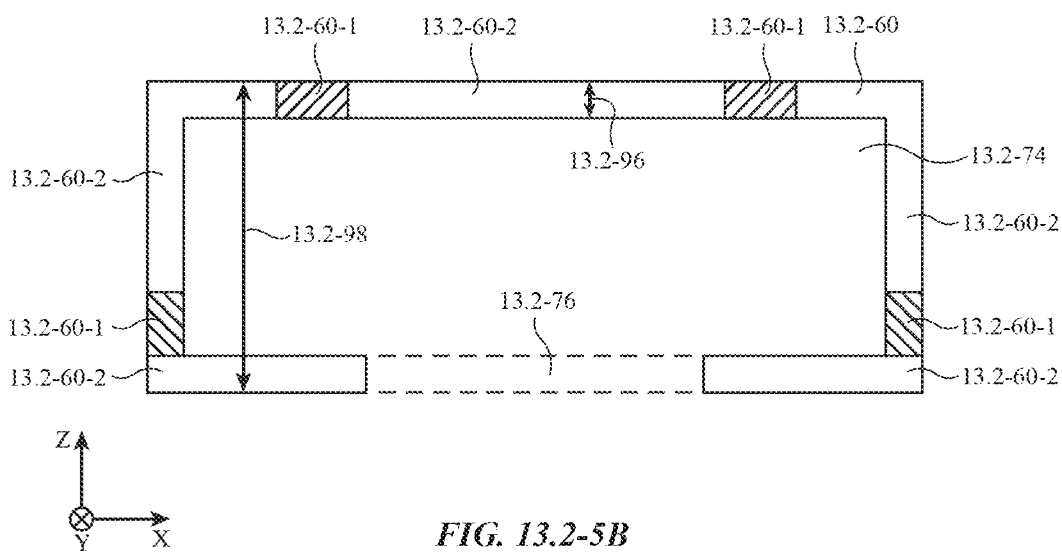
*FIG. 13.2-5B*

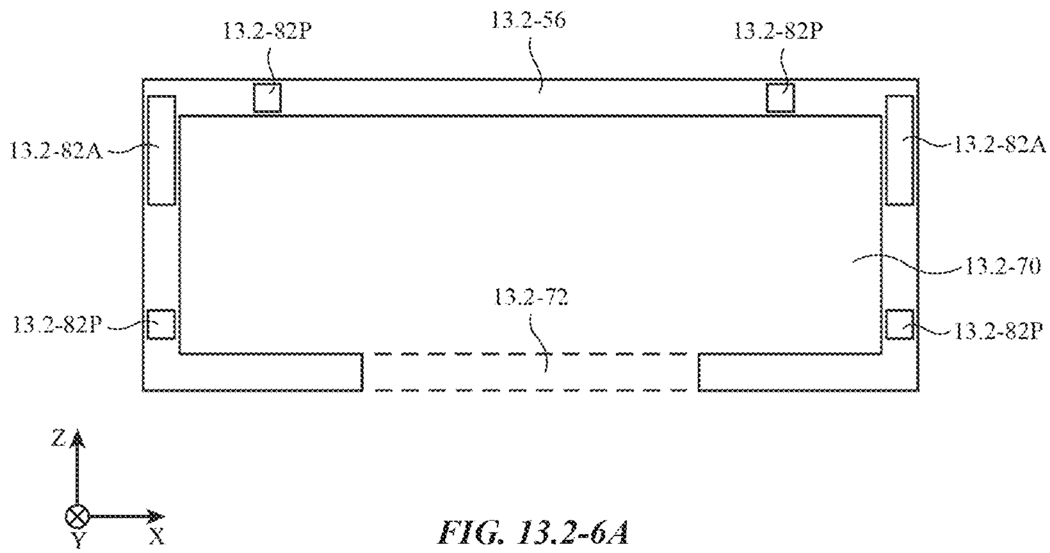
*FIG. 13.2-6A*
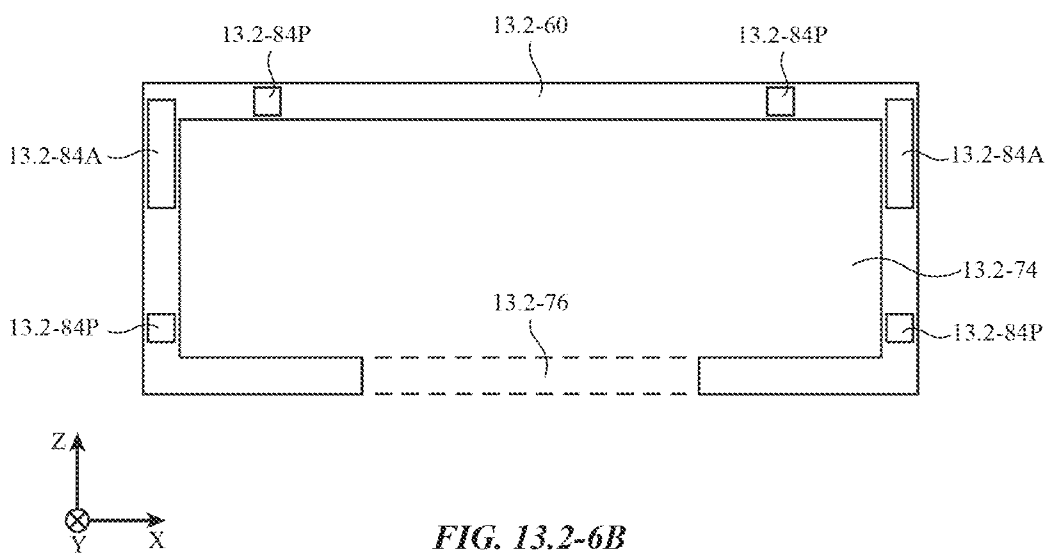
*FIG. 13.2-6B*

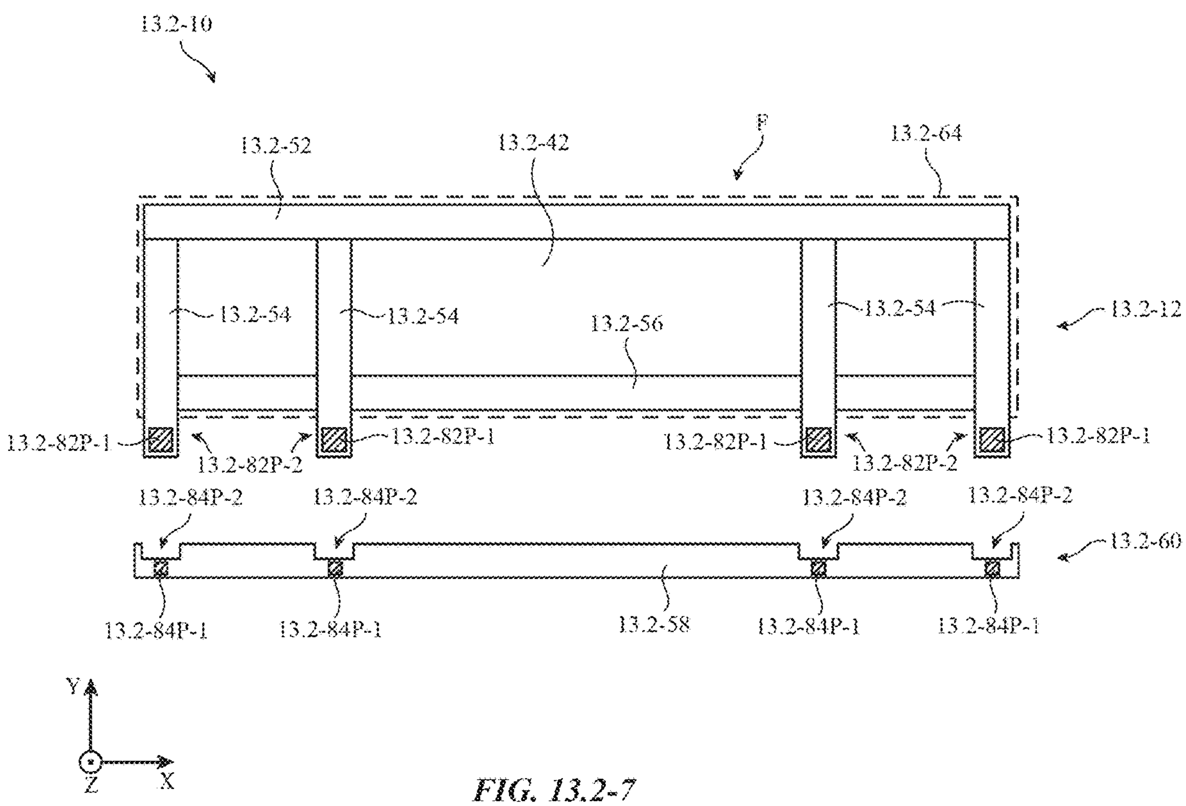
FIG. 13.2-7

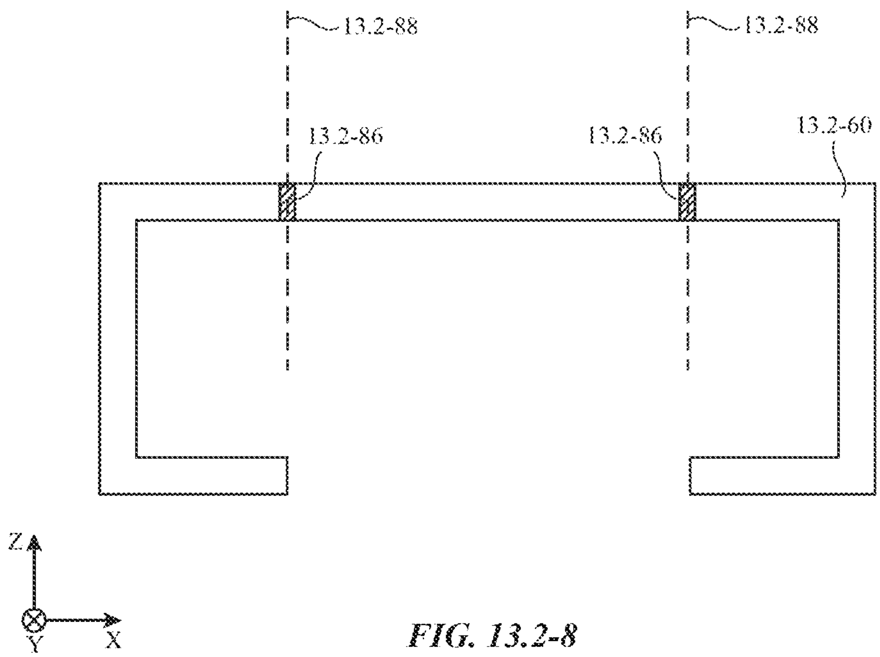
*FIG. 13.2-8*

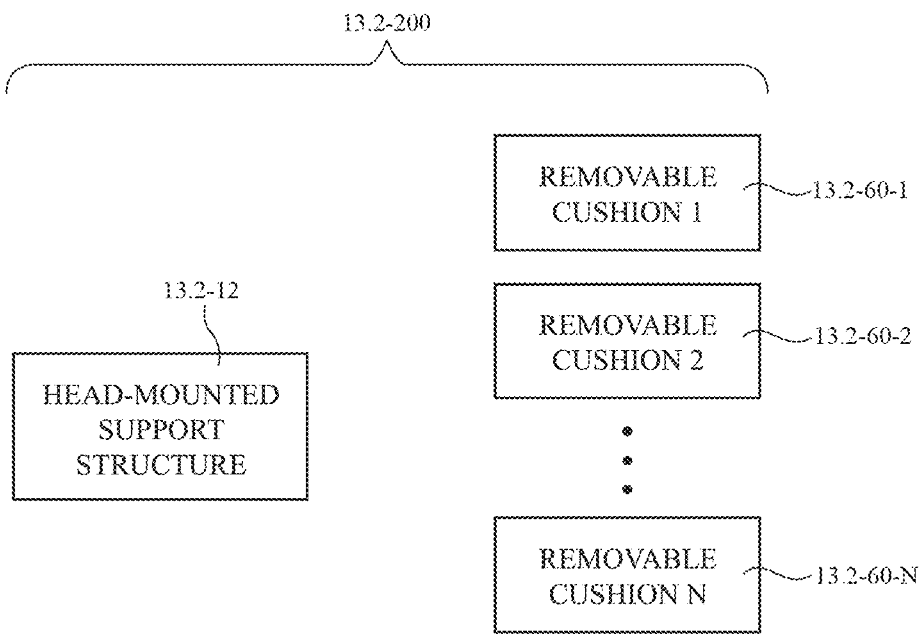
*FIG. 13.2-9*

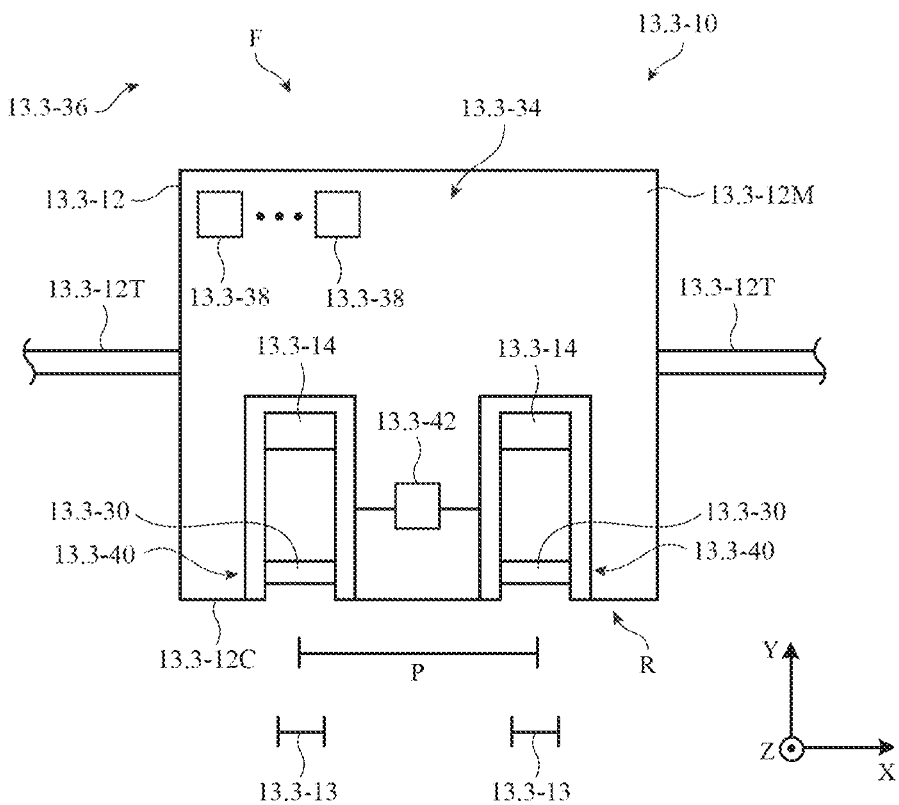
FIG. 13.3-1

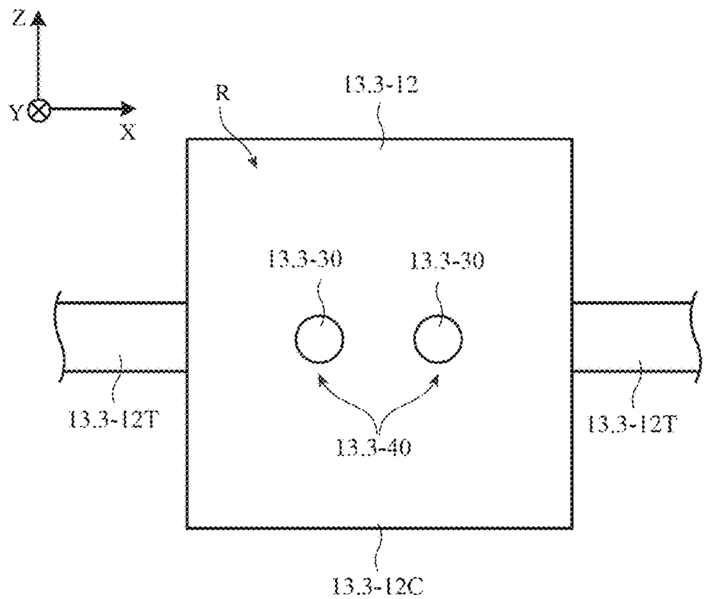
*FIG. 13.3-2*
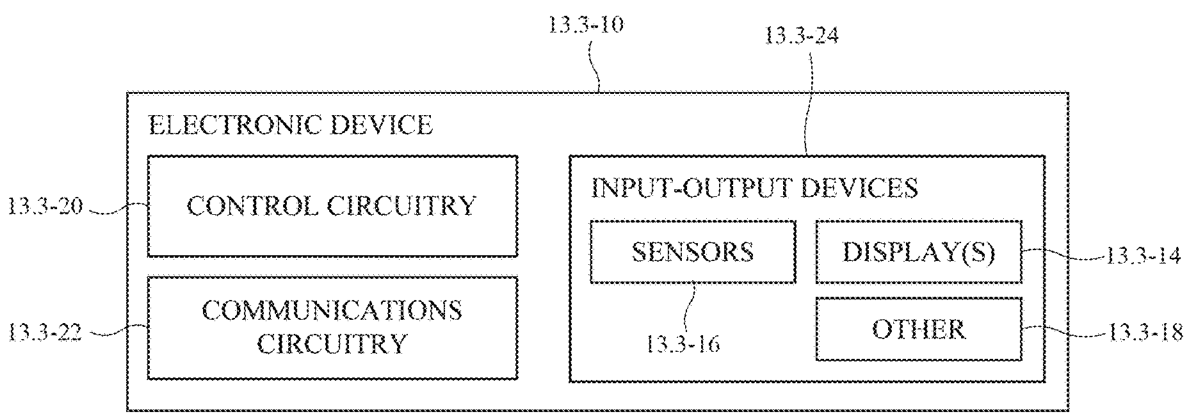
*FIG. 13.3-3*

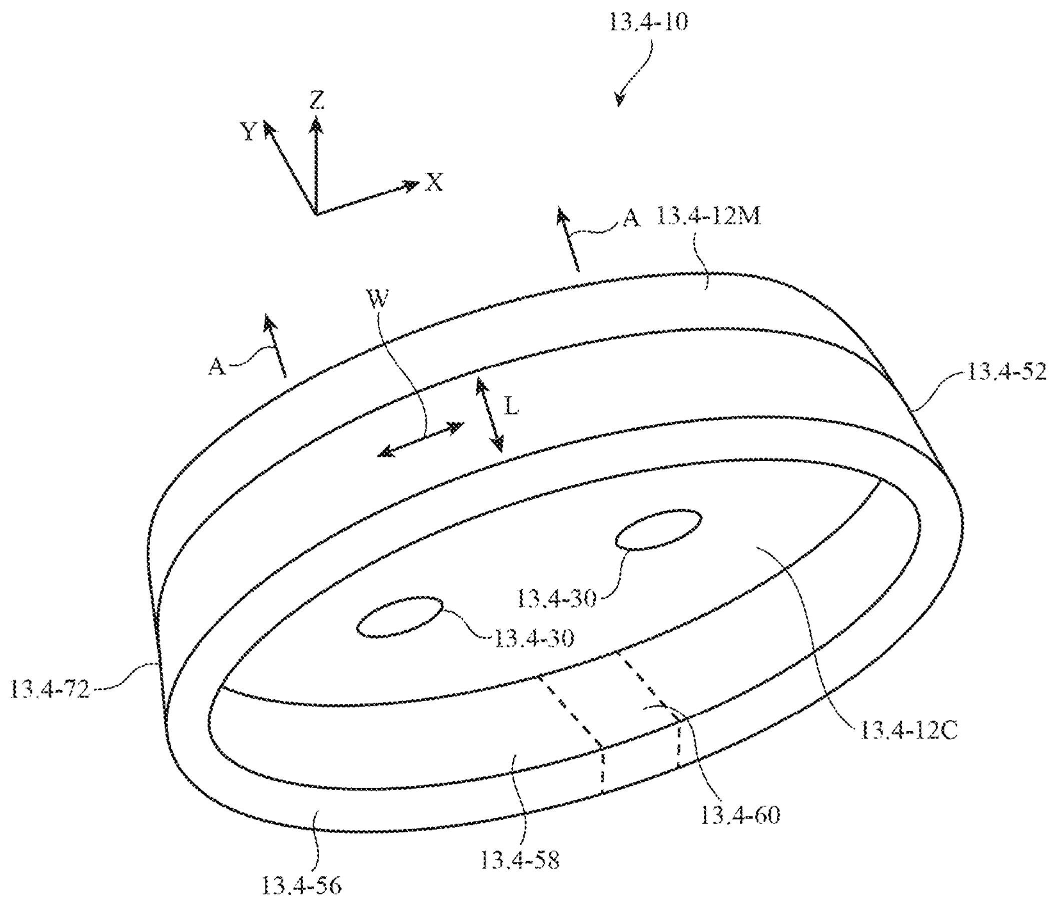
*FIG. 13.3-4*

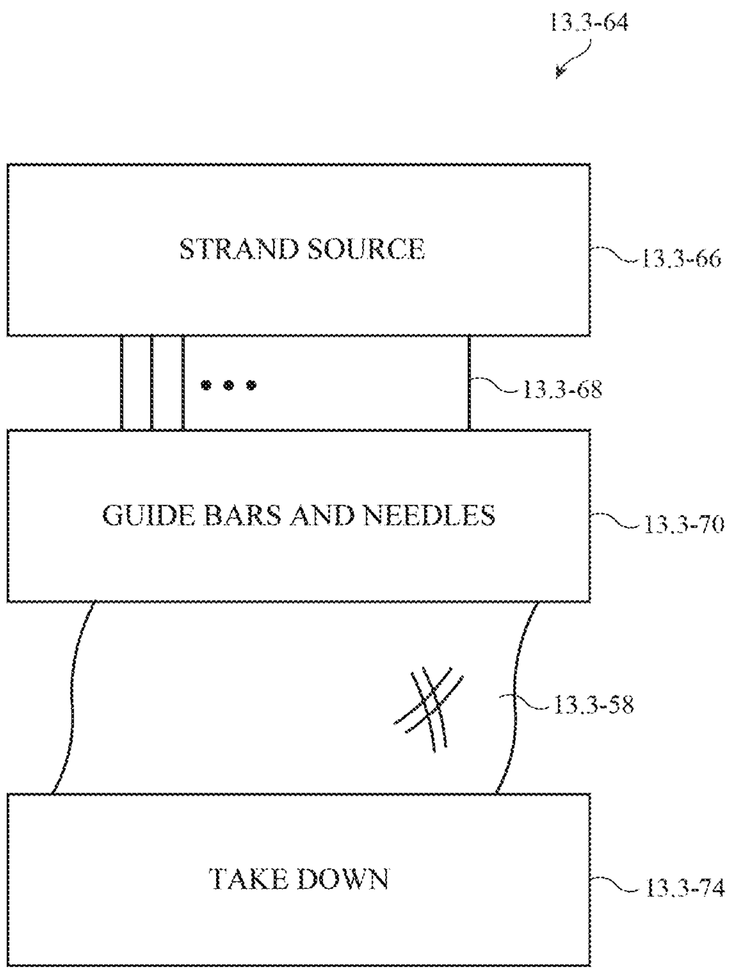
*FIG. 13.3-5A*

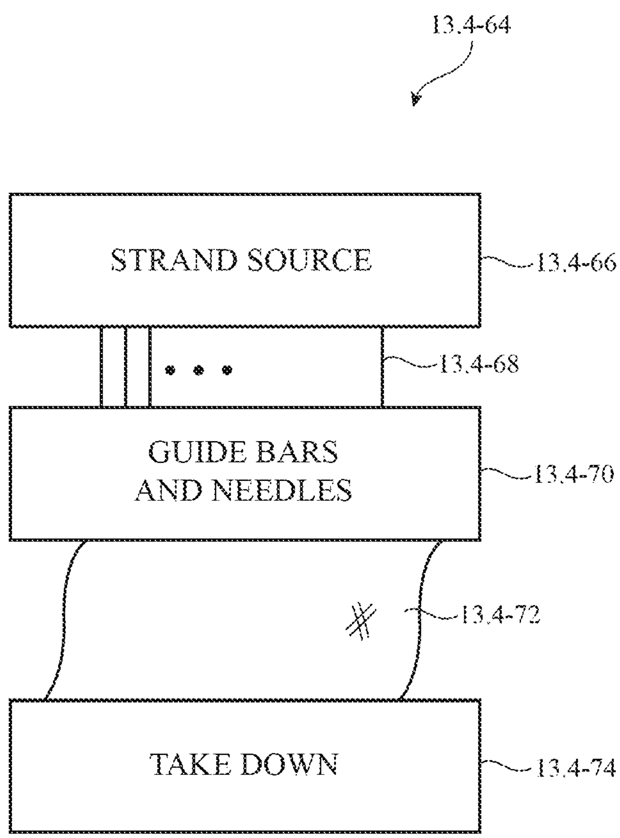
*FIG. 13.3-5B*

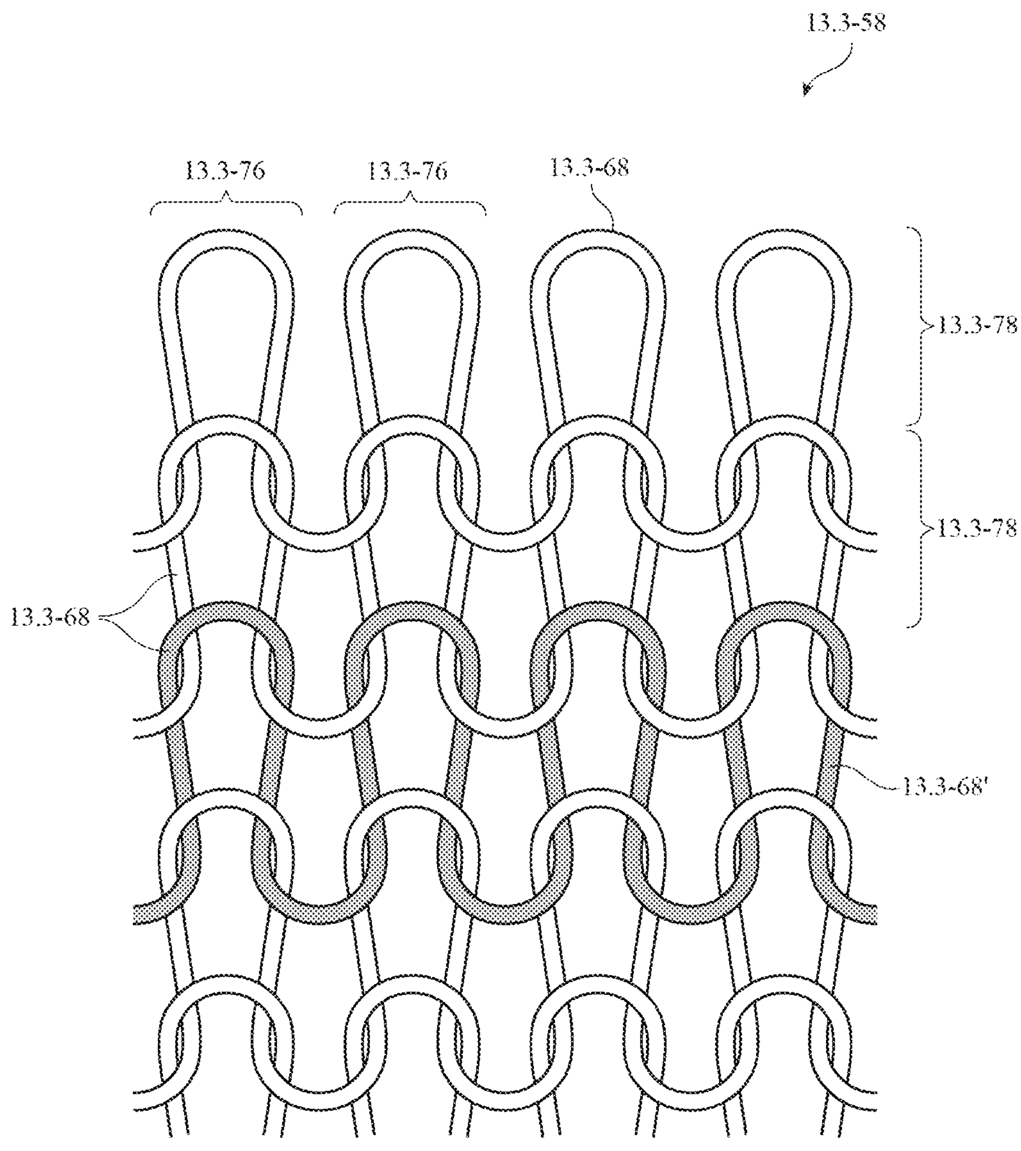
*FIG. 13.3-6*

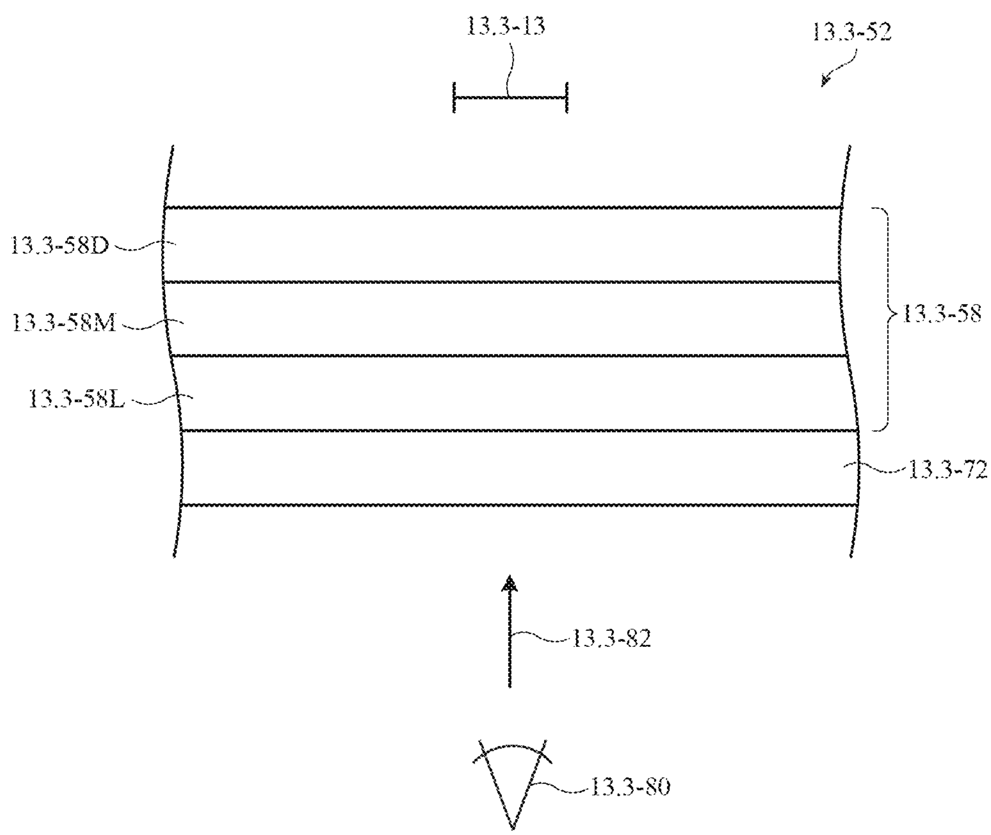
*FIG. 13.3-7*

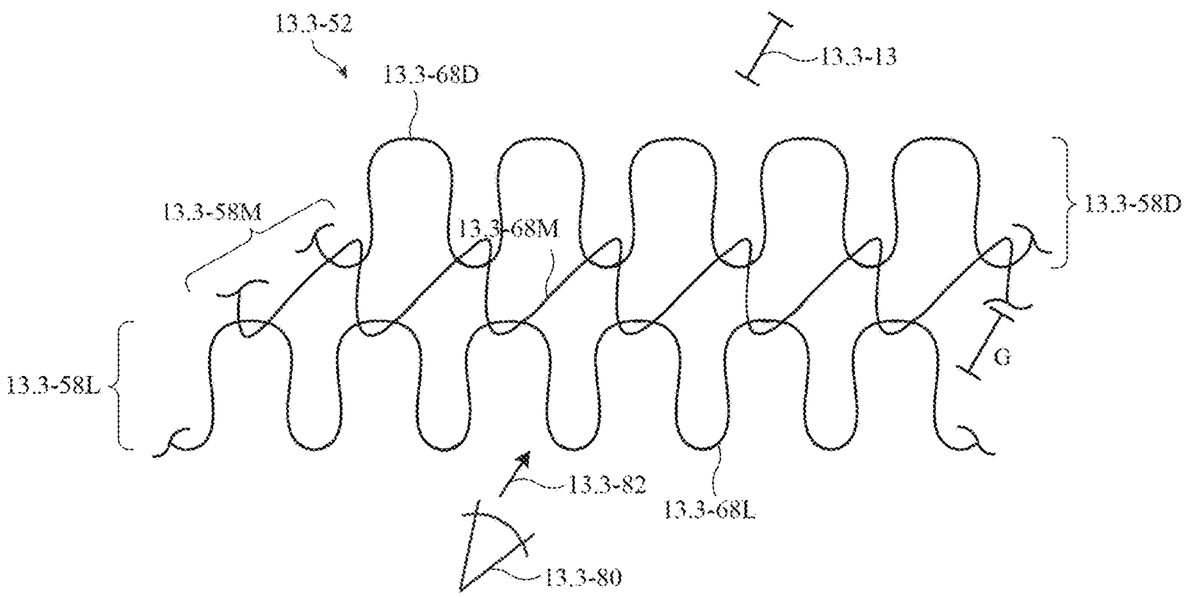
*FIG. 13.3-8*

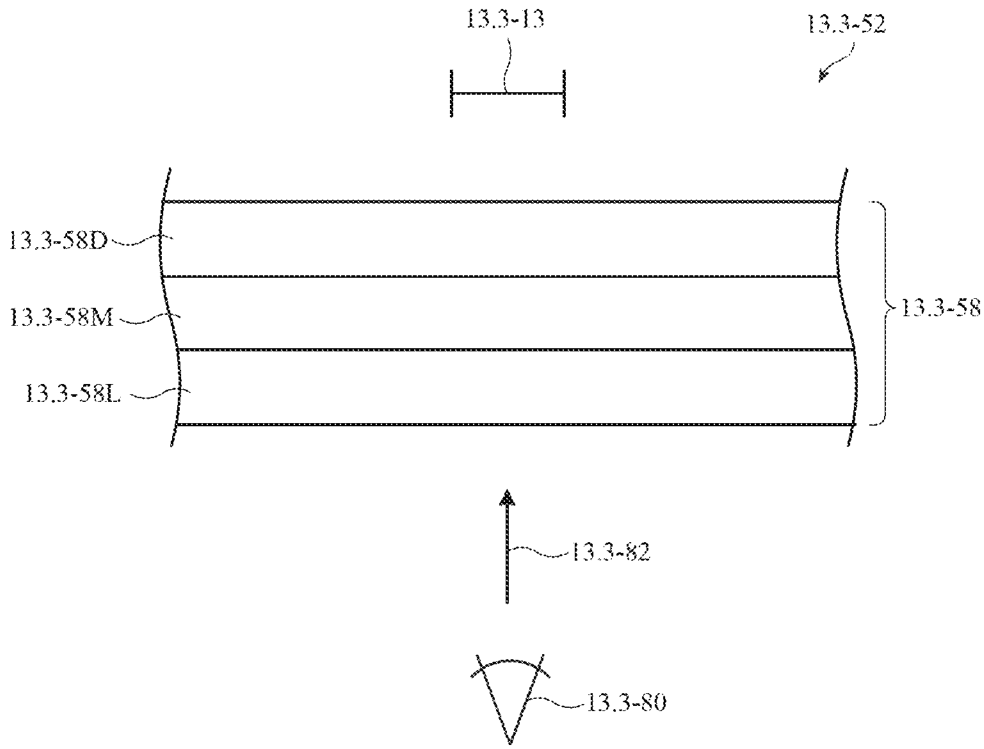
*FIG. 13.3-9*

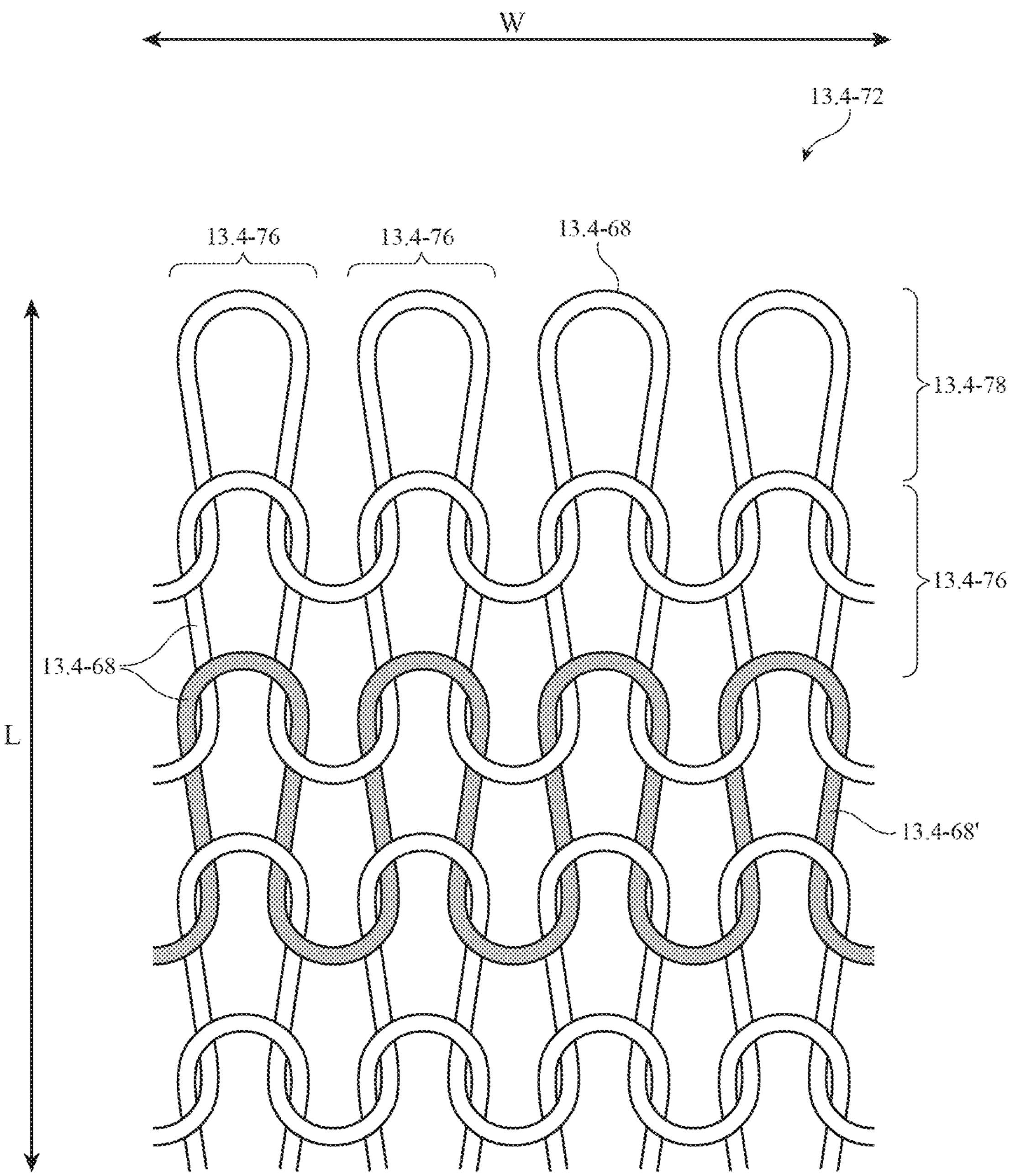
*FIG. 13.4-6*

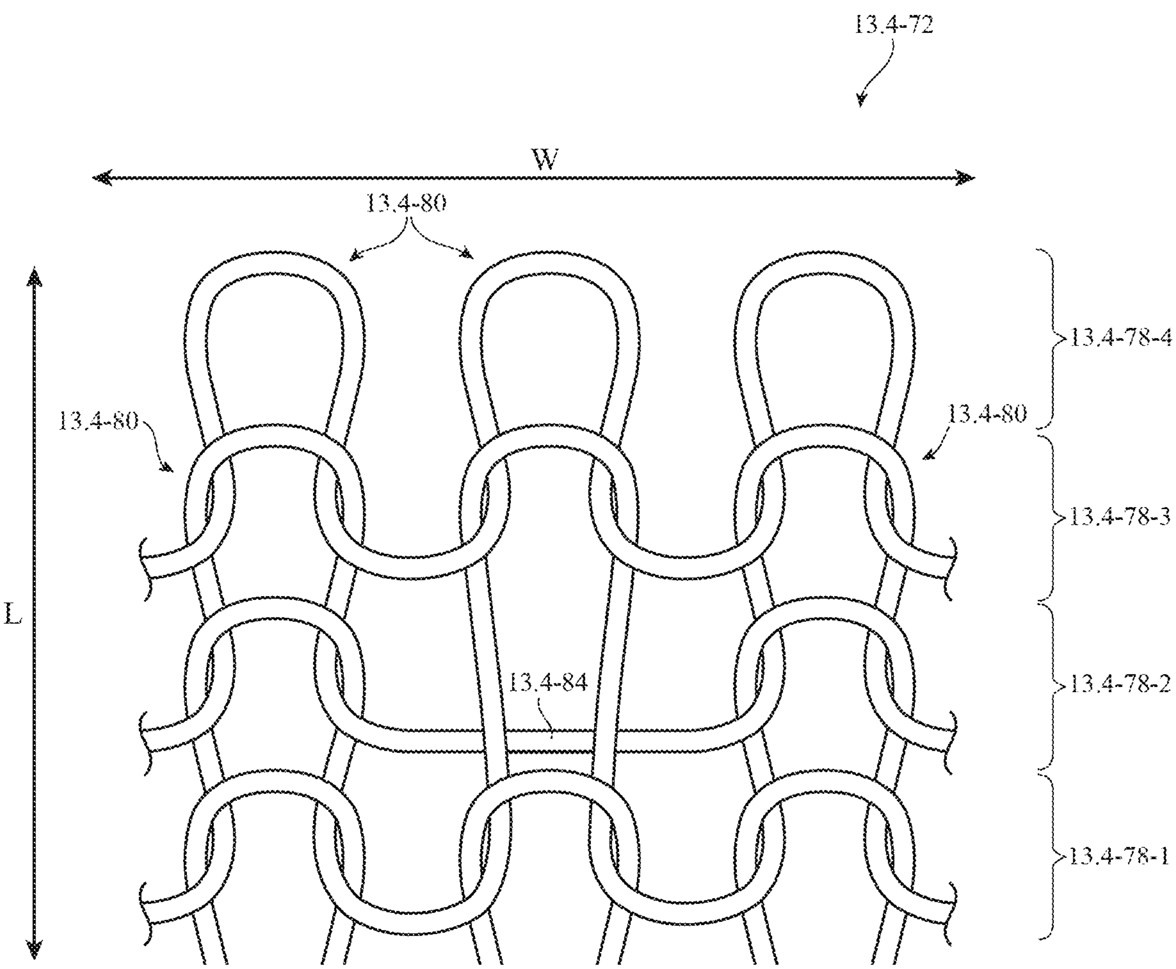
*FIG. 13.4-7*

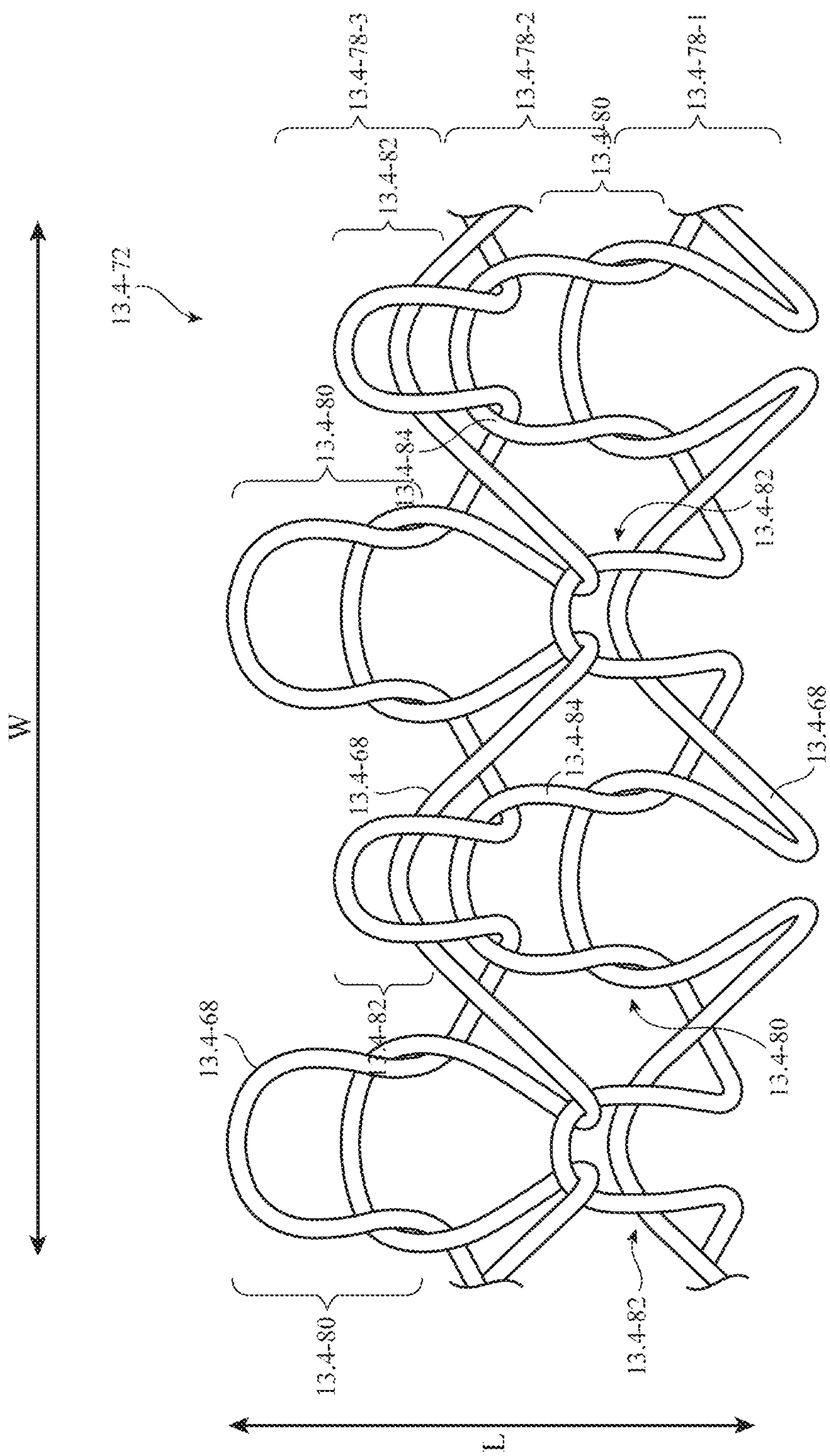
*FIG. 13.4-8*

WALE

COURSE

| | 1 | 2 | 3 | 4 |
|---|---|---|---|---|
| 4 | O | O | O | O |
| 3 | O | V | O | V |
| 2 | O | O | O | O |
| 1 | V | O | V | O |

*FIG. 13.4-9*

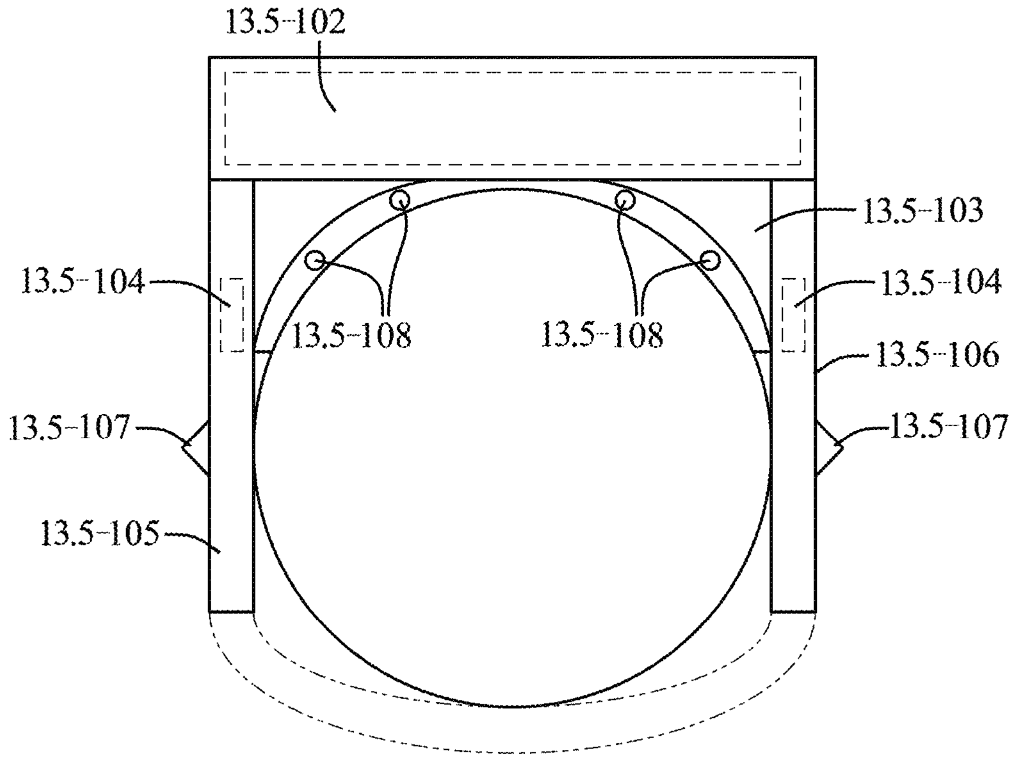
FIG. 13.5-1
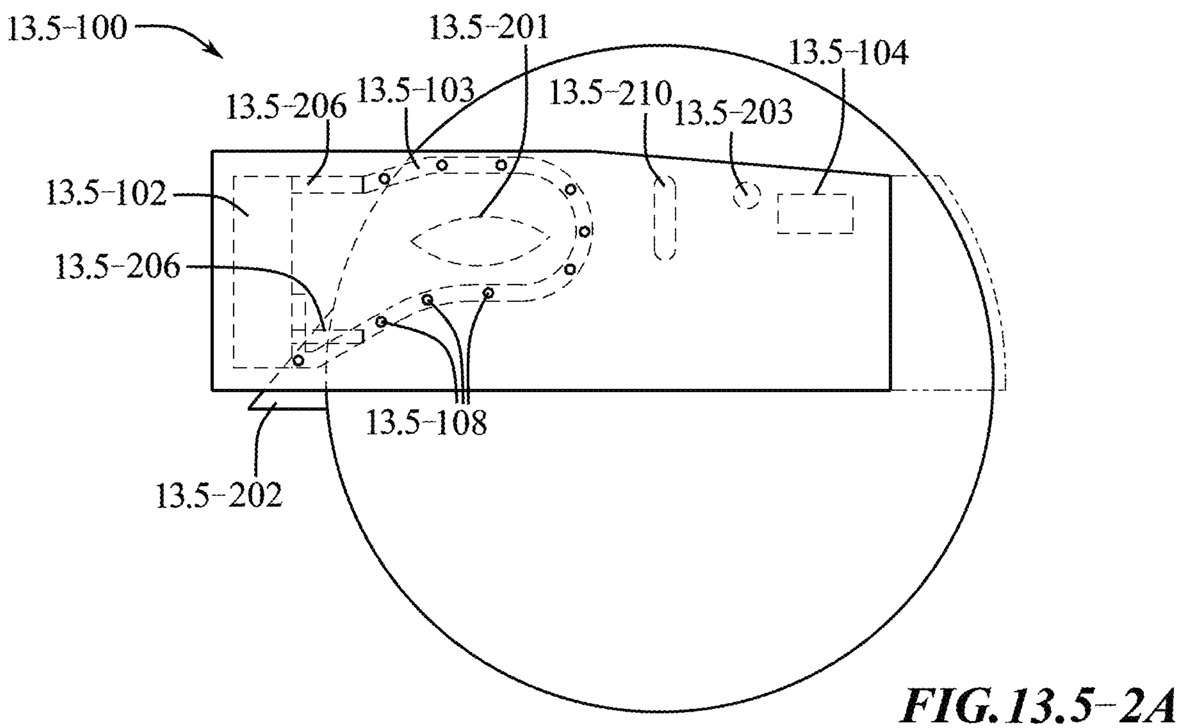
FIG.13.5-2A

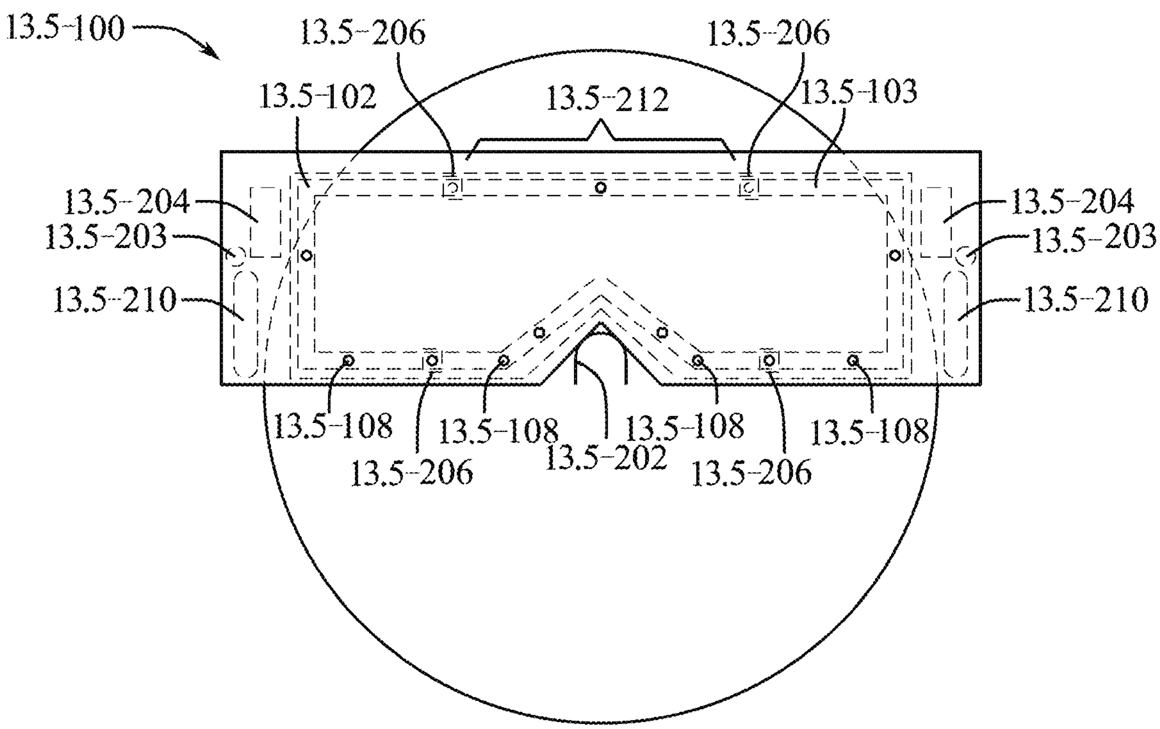
*FIG.13.5-2B*
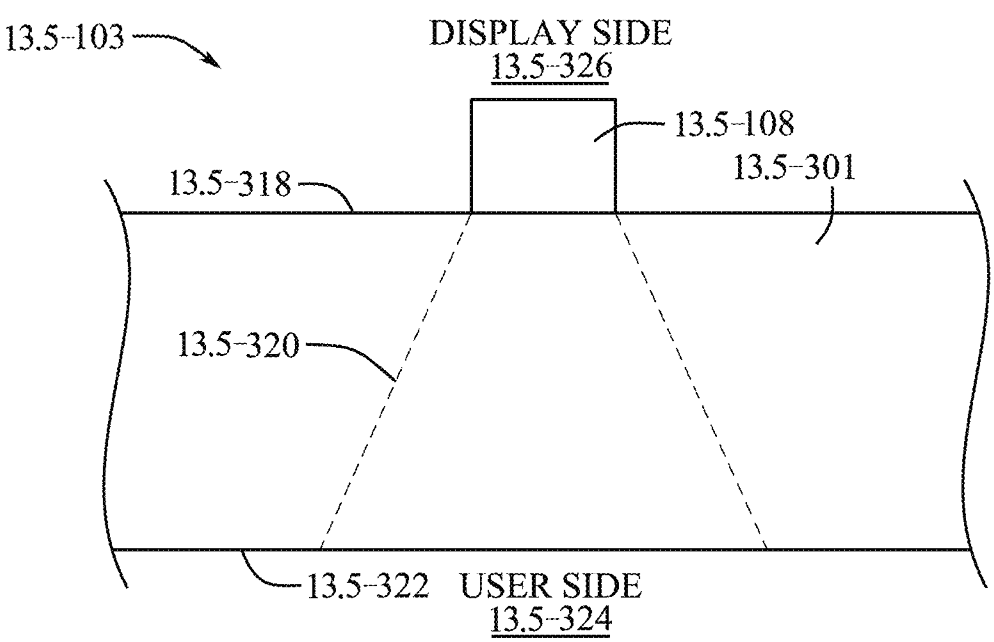
*FIG.13.5-3*

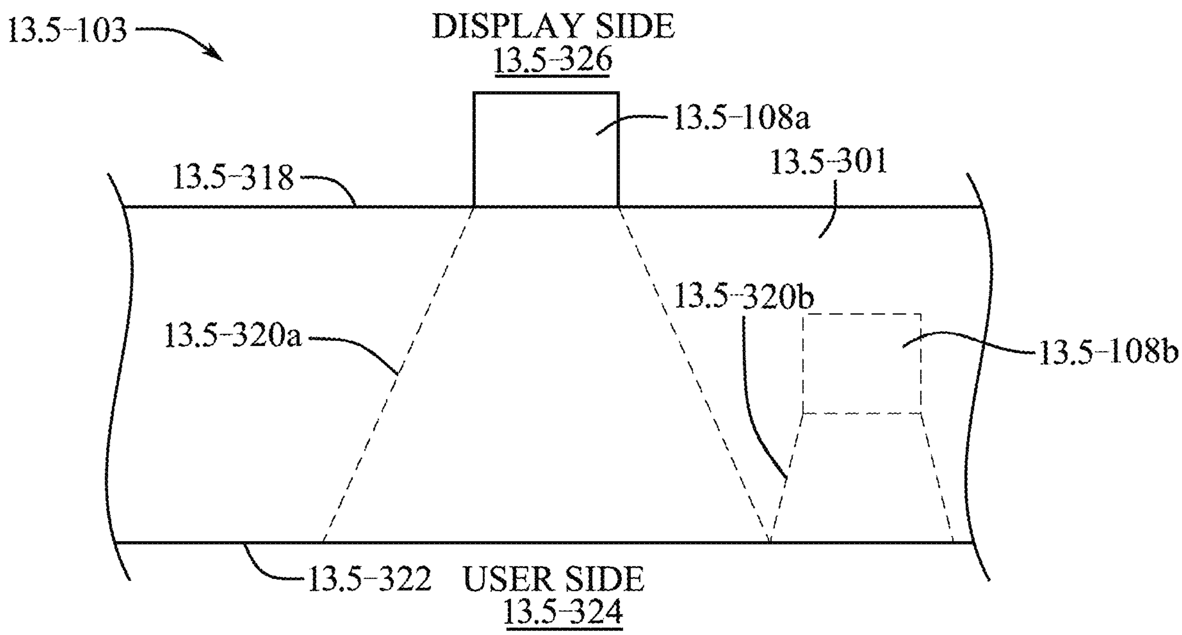
FIG.13.5-4
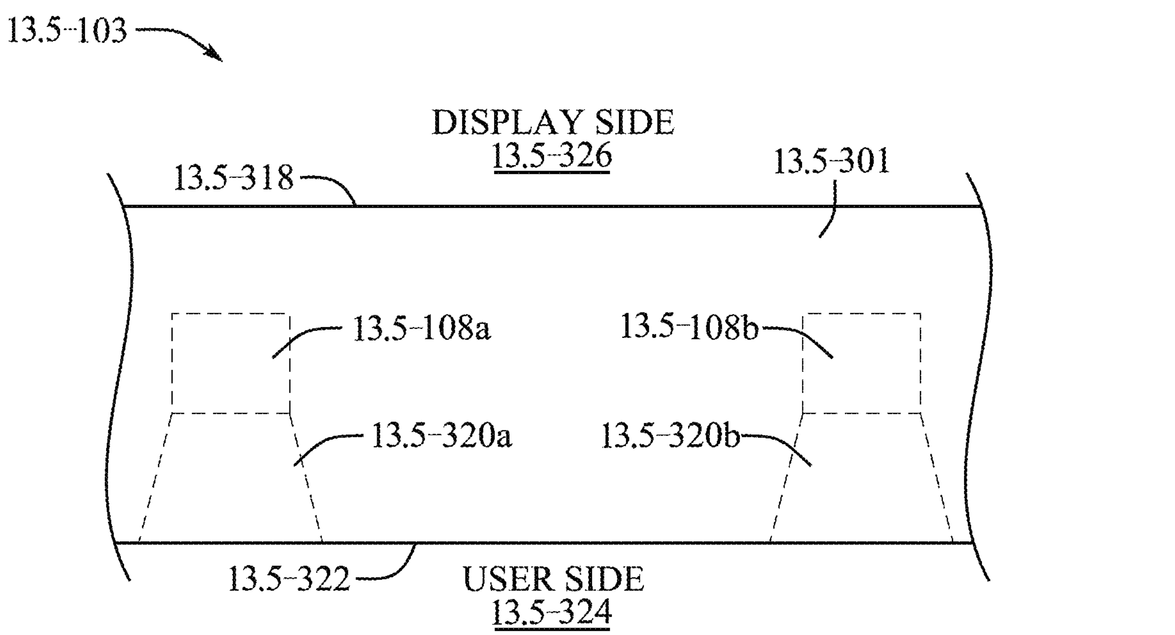
FIG.13.5-5

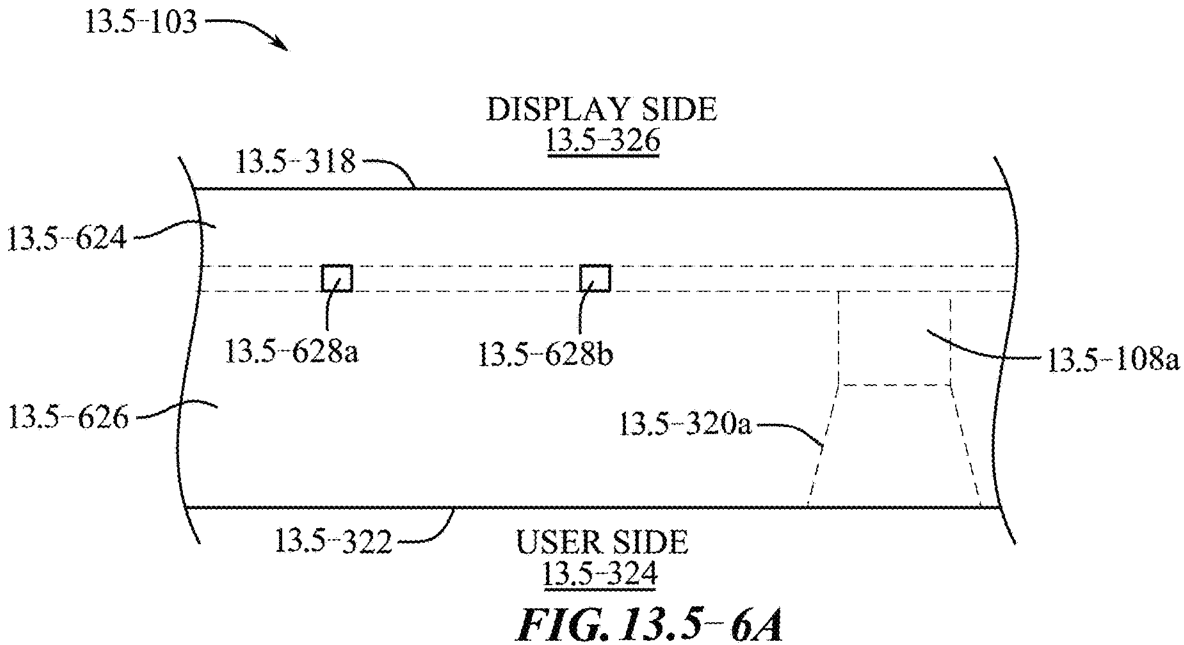
*FIG. 13.5-6A*
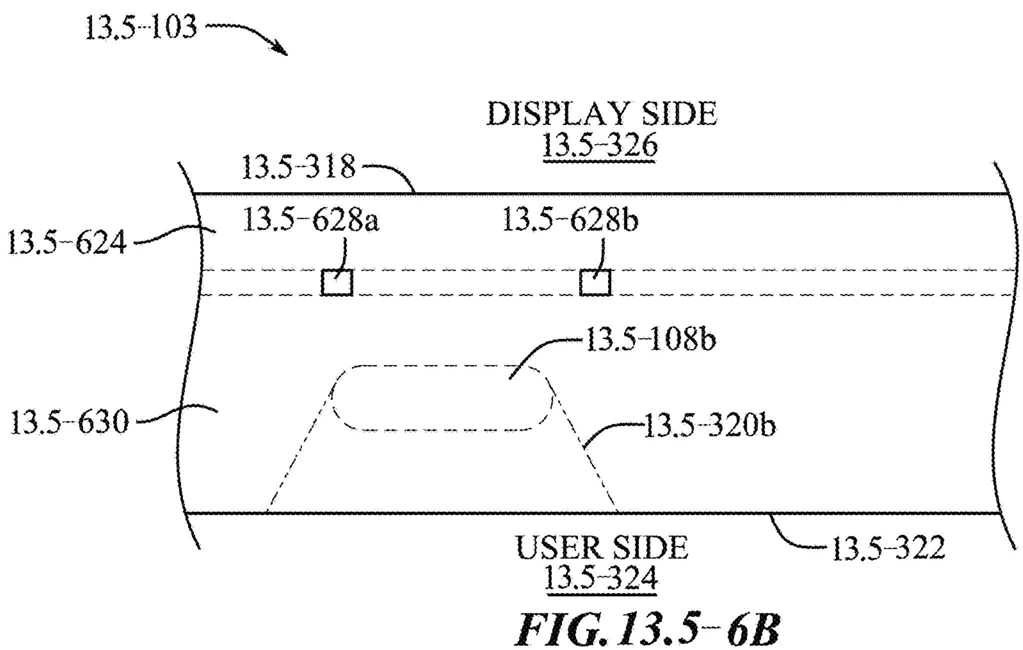
*FIG. 13.5-6B*

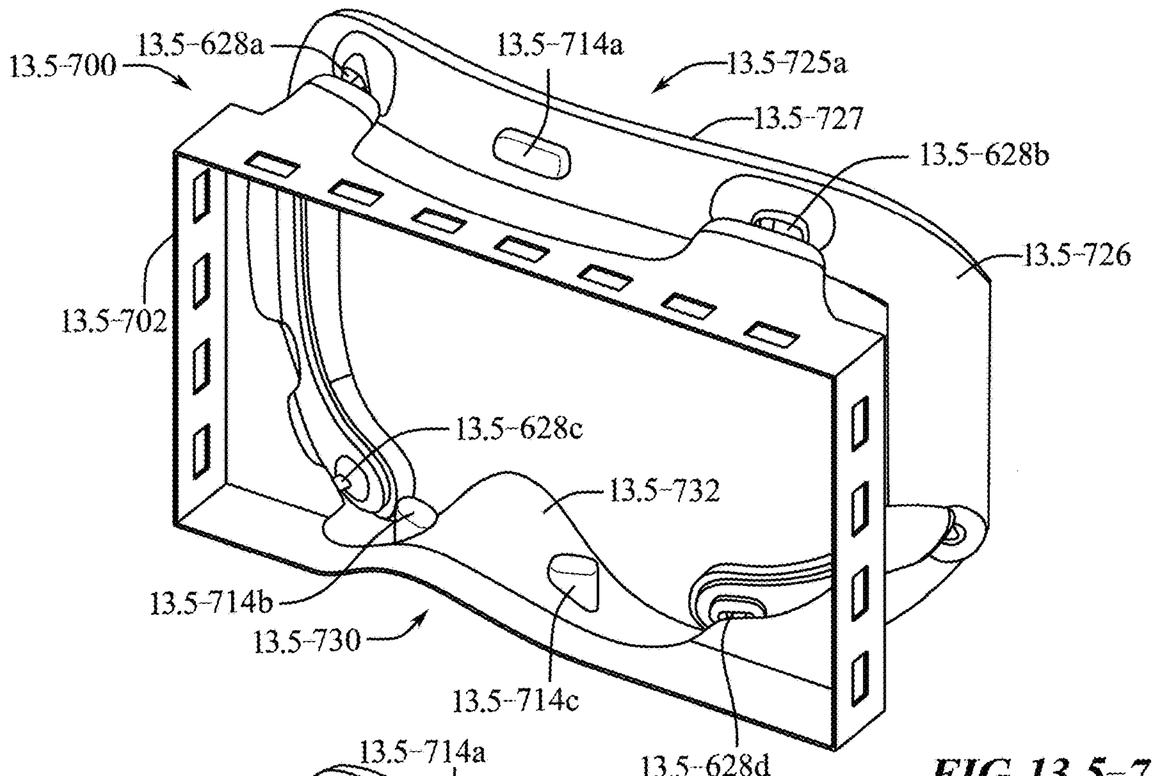
FIG. 13.5-7A
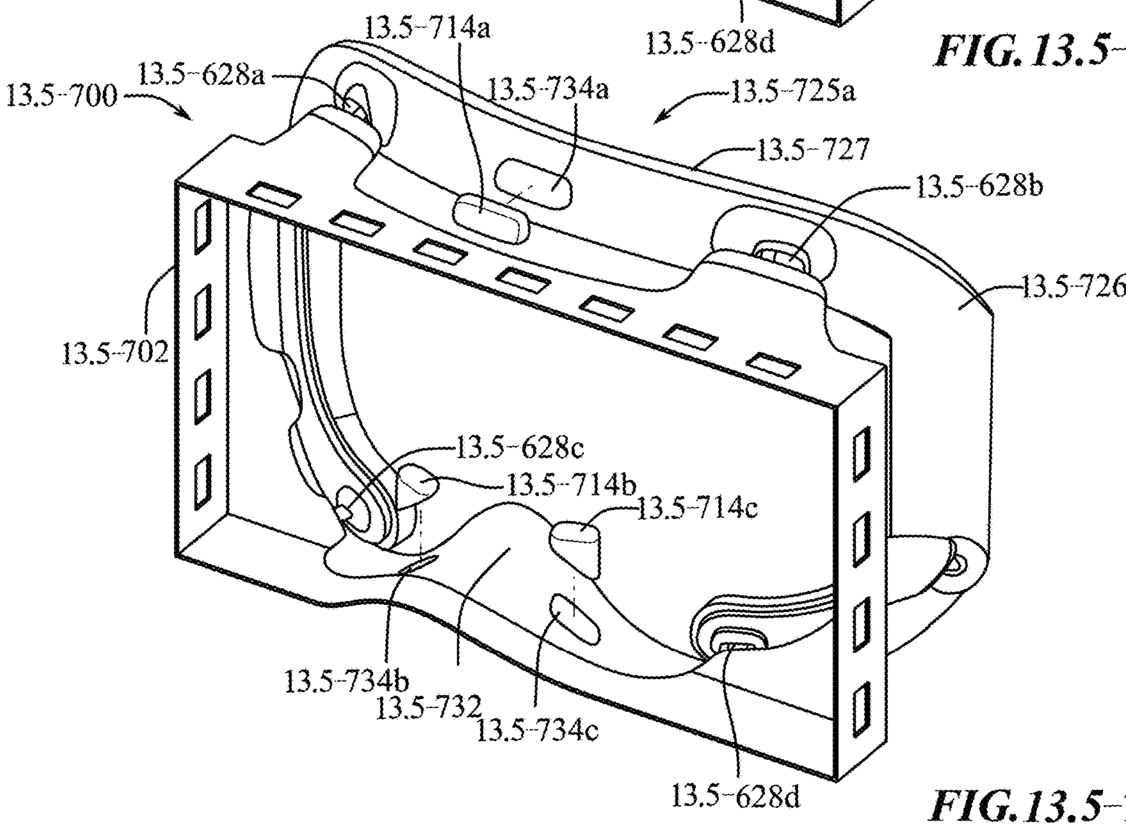
FIG. 13.5-7B

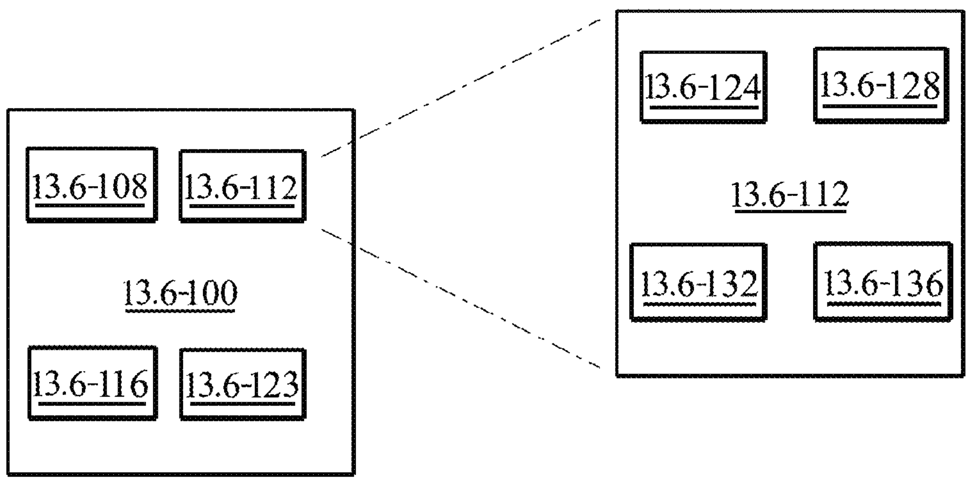
*FIG. 13.6-1*

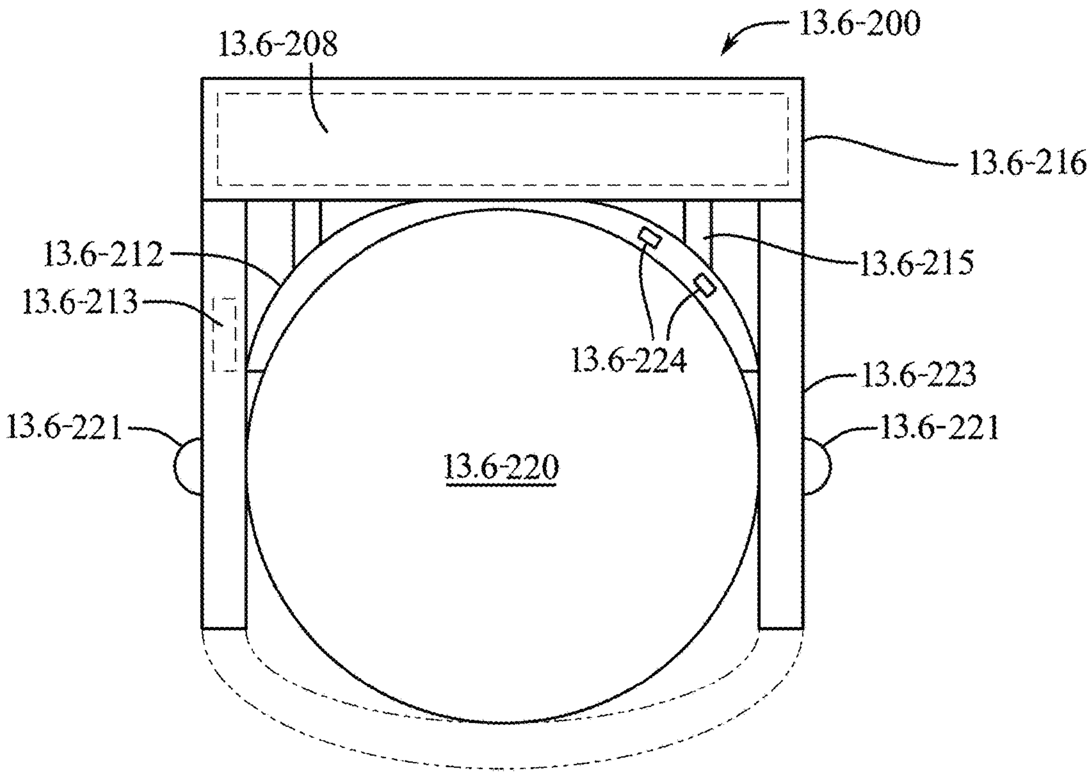
FIG.13.6-2
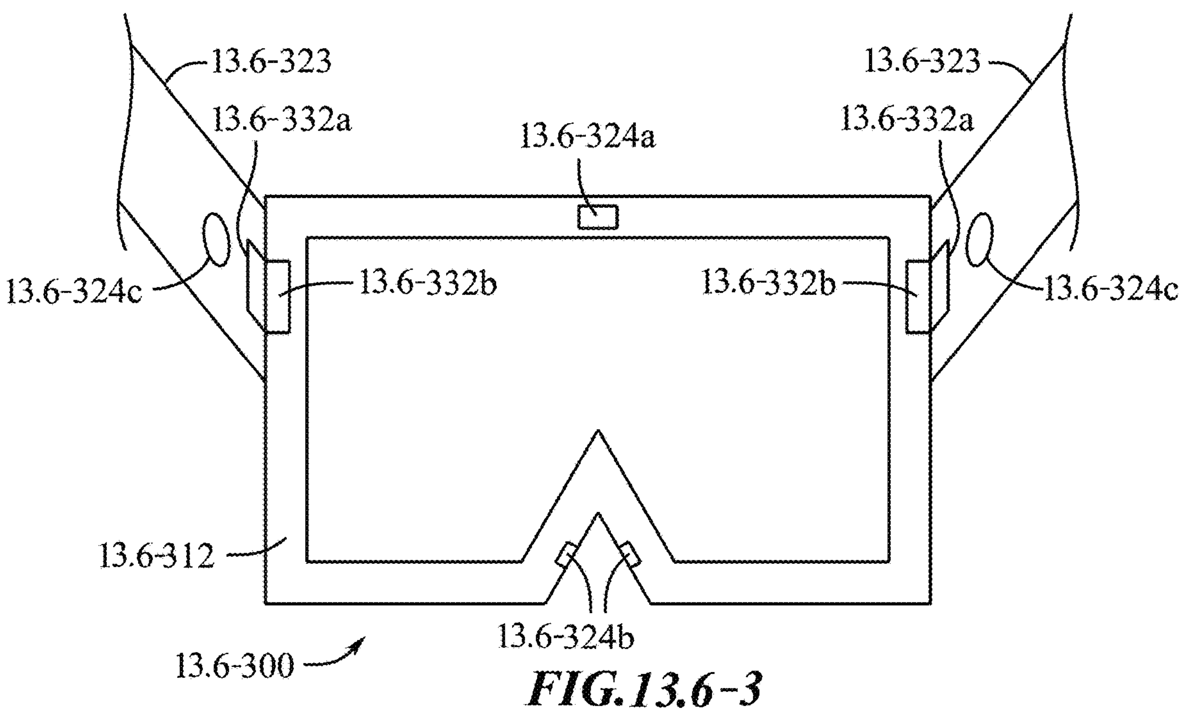
FIG.13.6-3

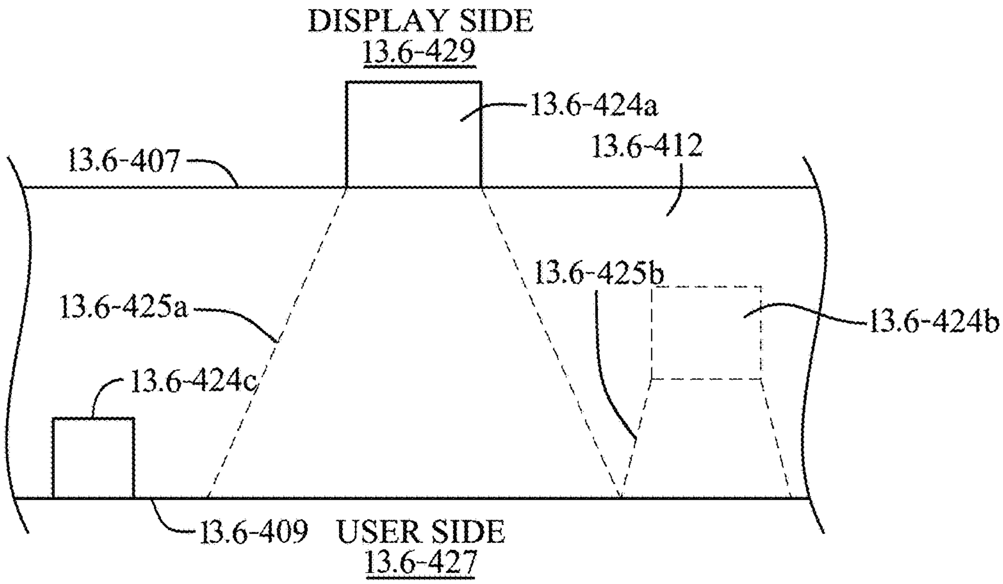
FIG. 13.6-4
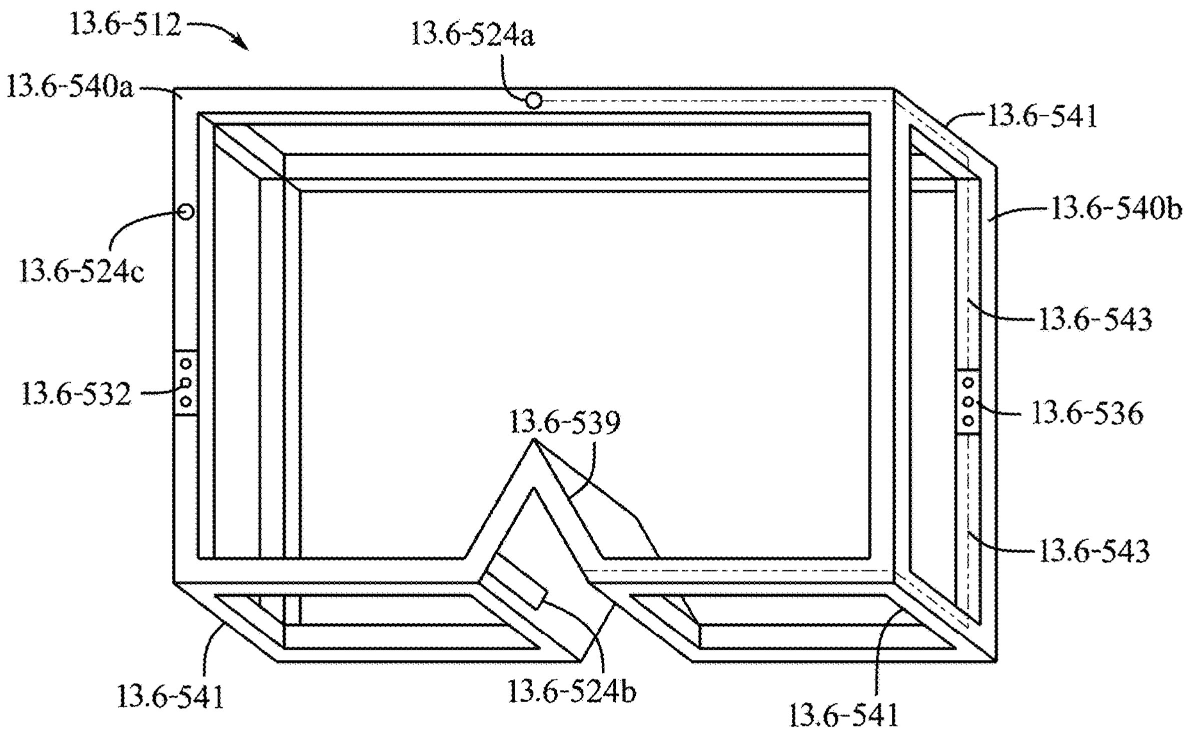
FIG. 13.6-5

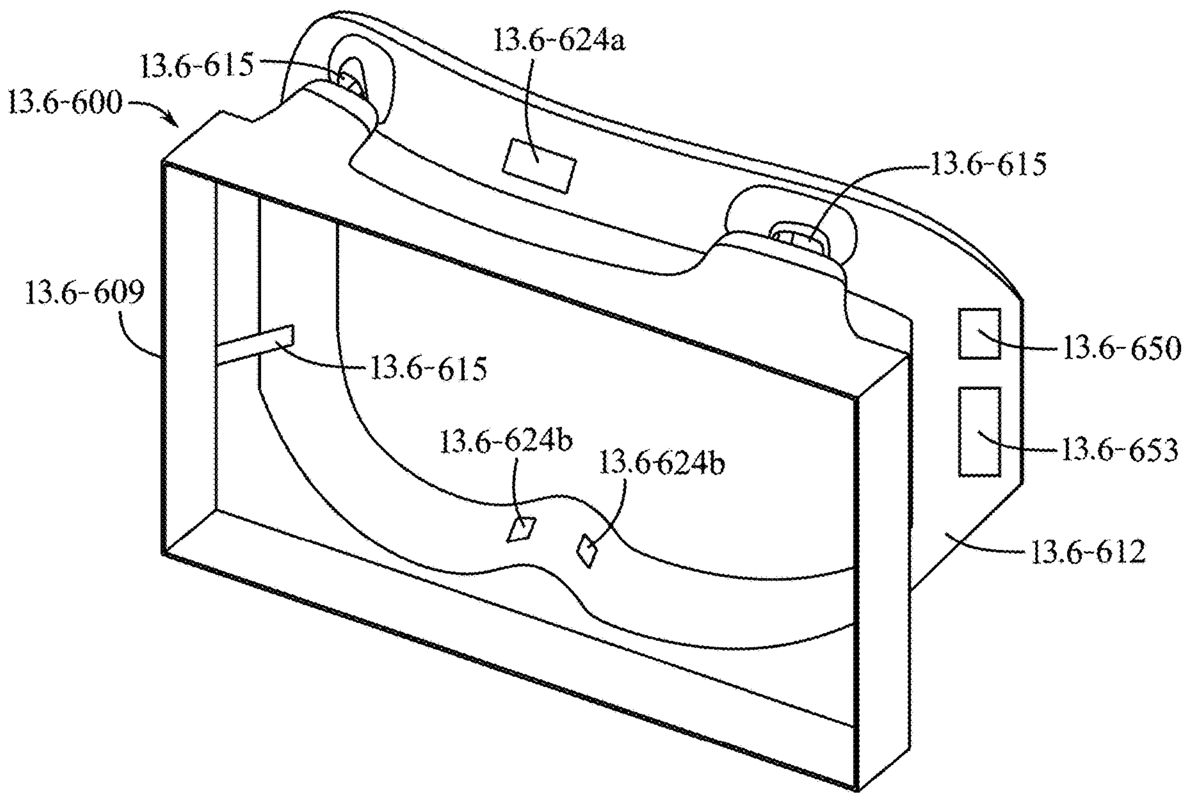
*FIG. 13.6-6*

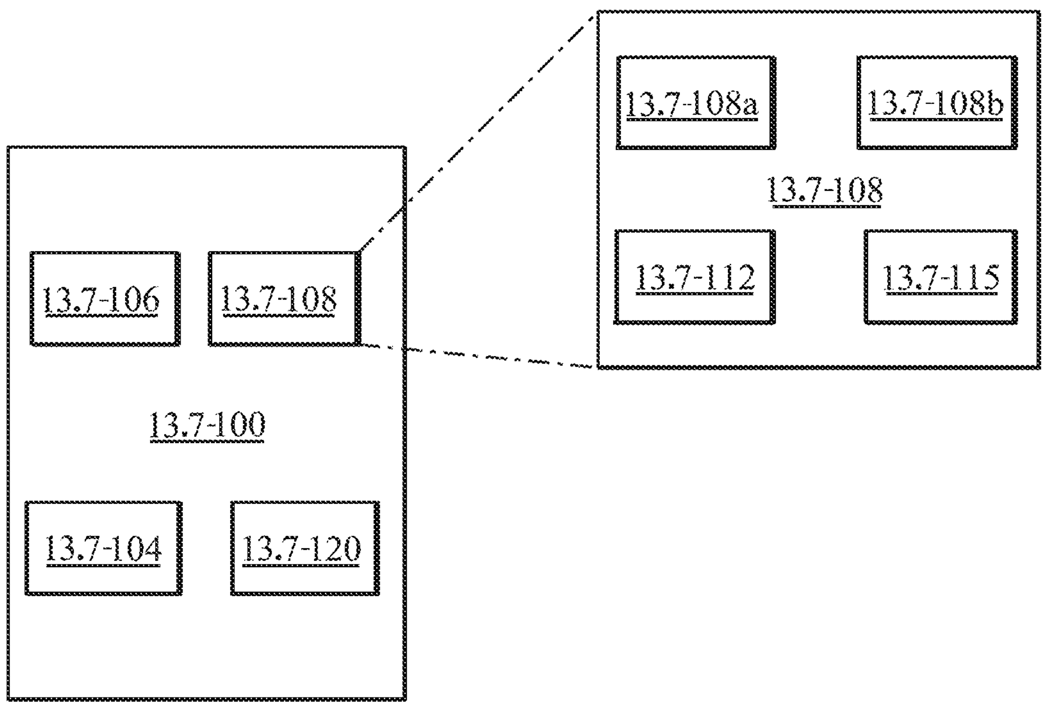
*FIG. 13.7-1*

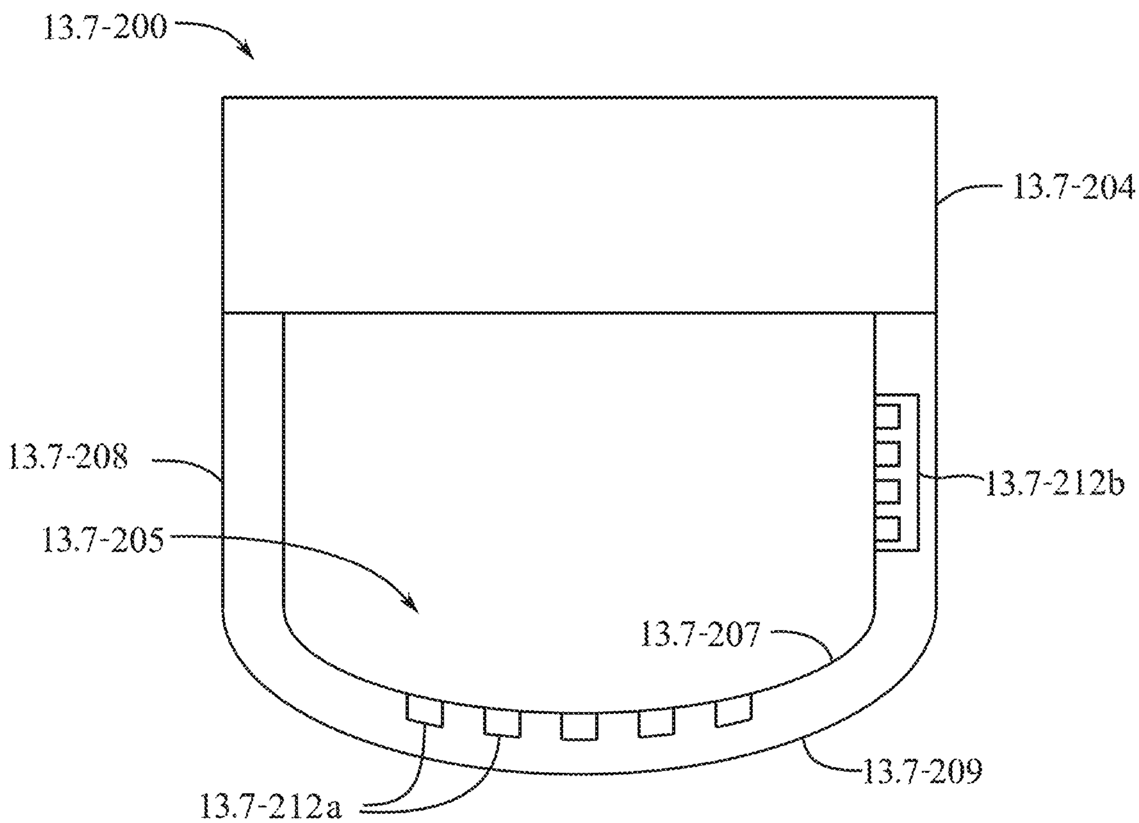
*FIG. 13.7-2*

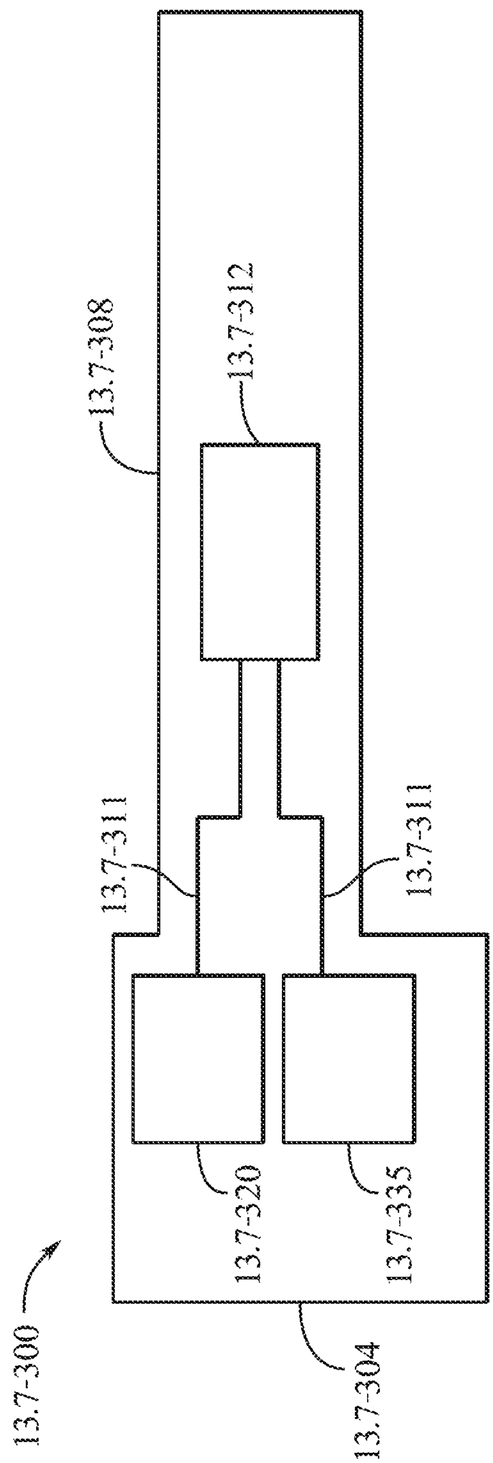
*FIG. 13.7-3*

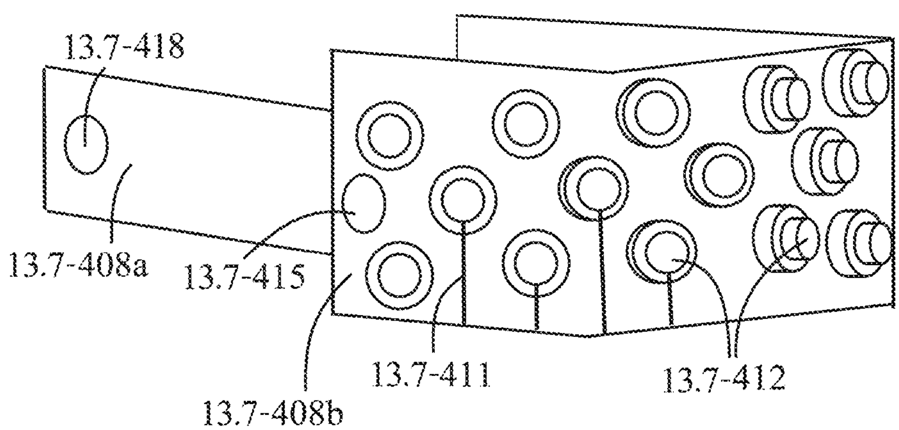
*FIG. 13.7-4A*

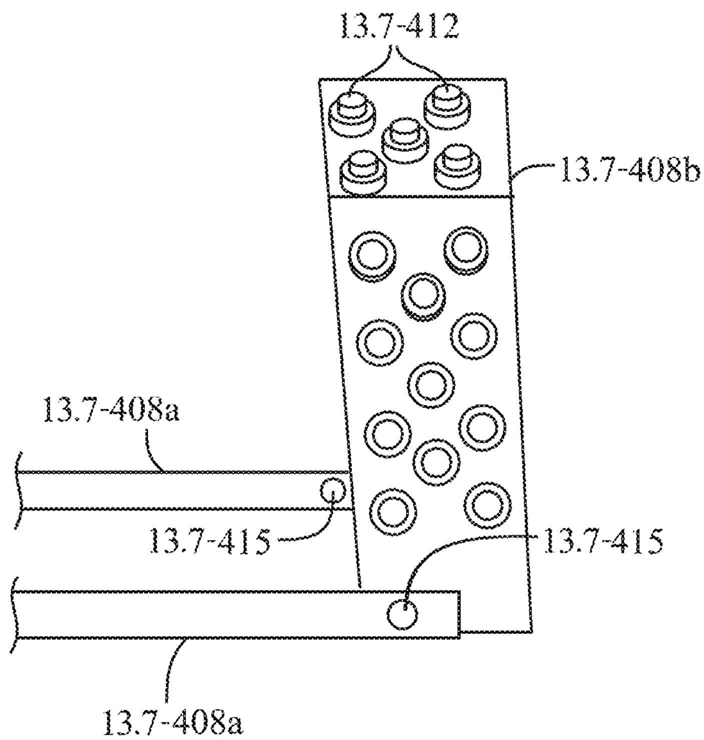
FIG. 13.7-4B
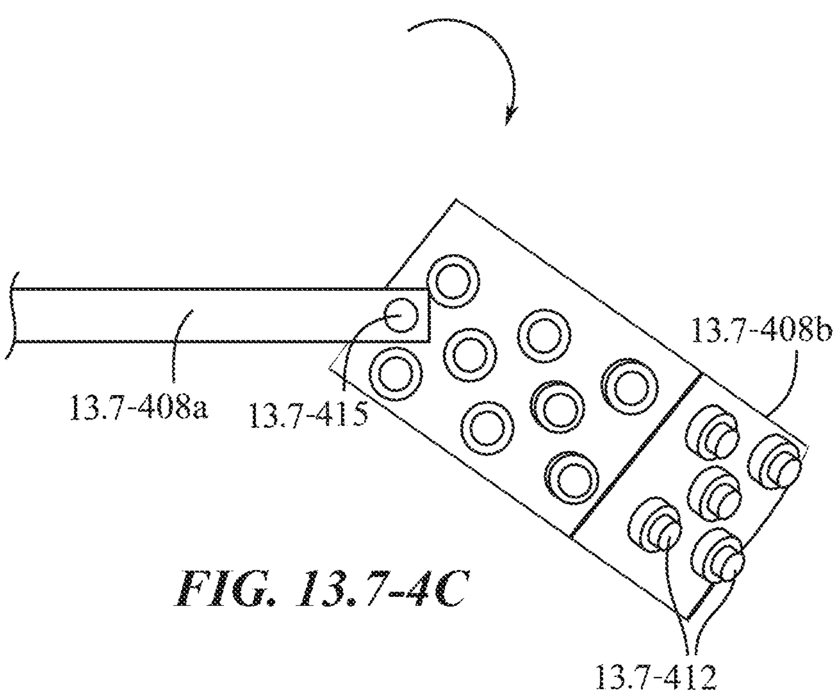
FIG. 13.7-4C

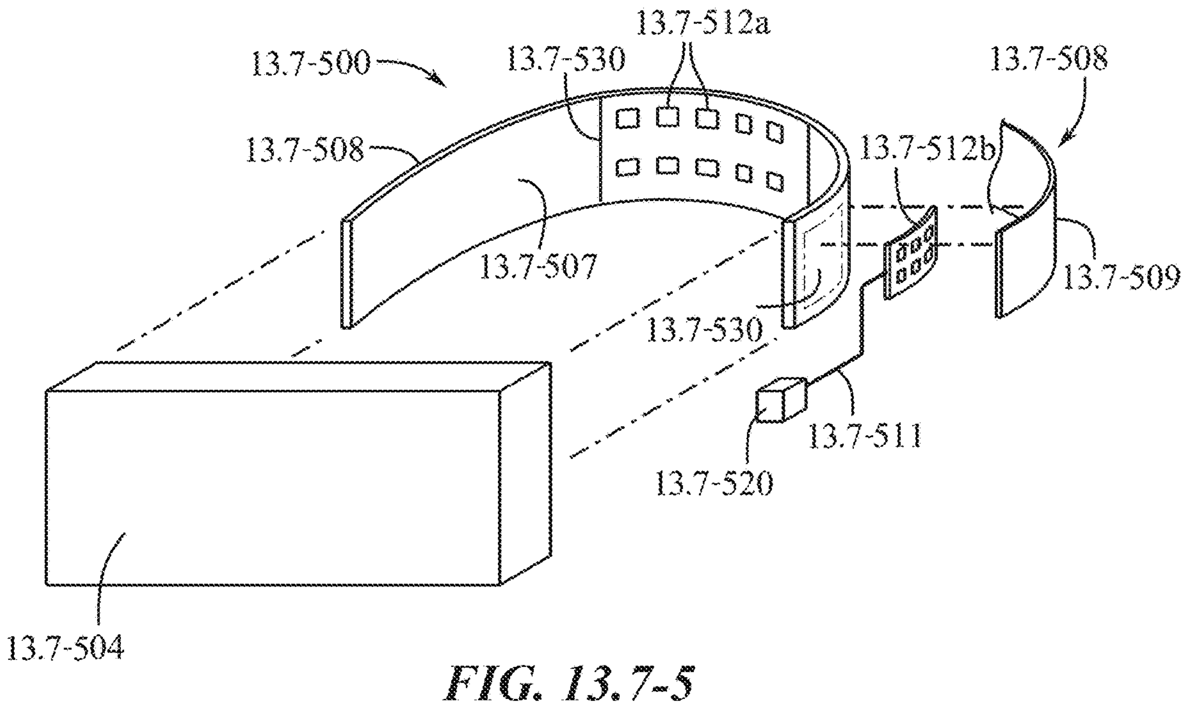
*FIG. 13.7-5*
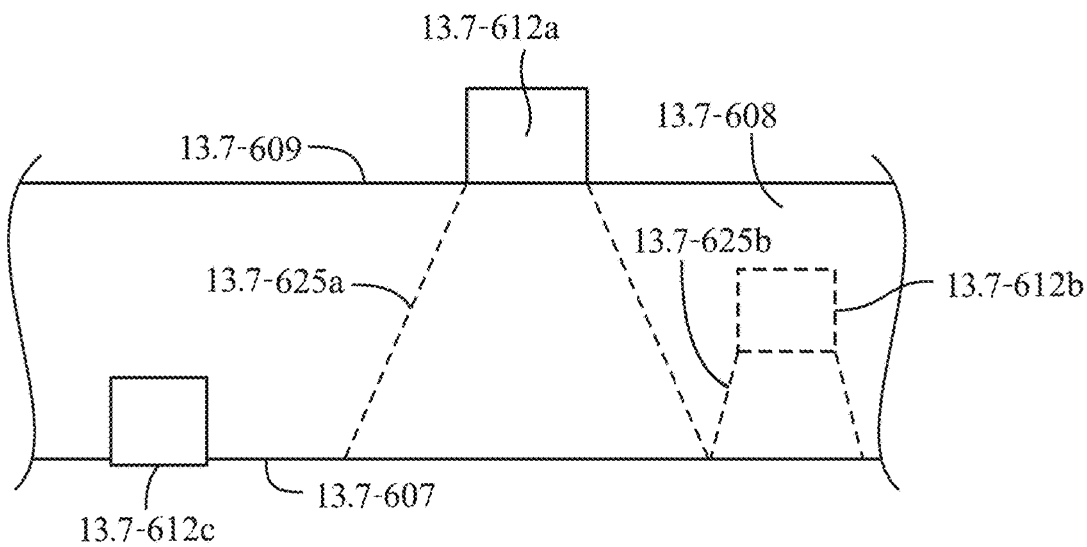
*FIG. 13.7-6*

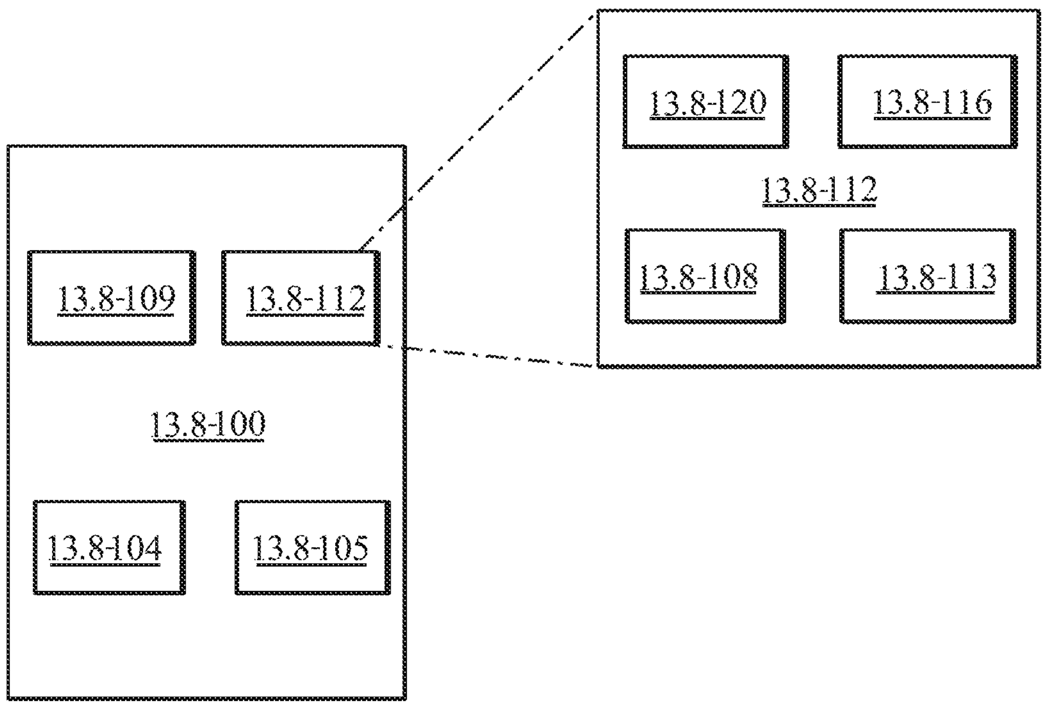
*FIG. 13.8-1A*

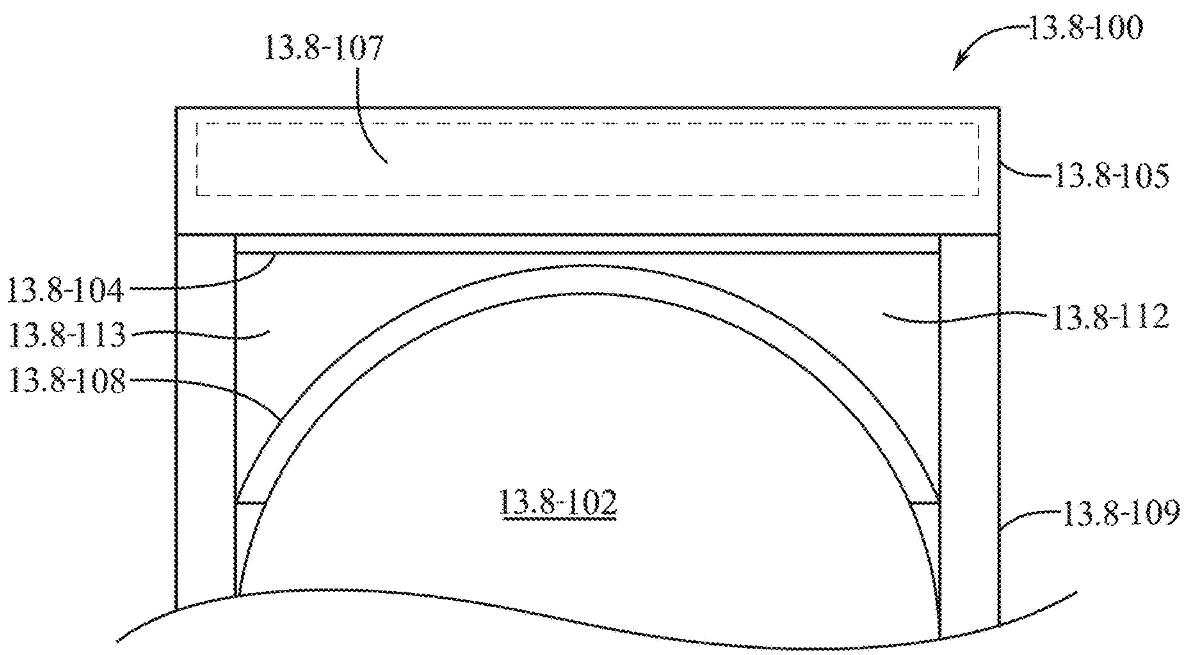
*FIG. 13.8-1B*

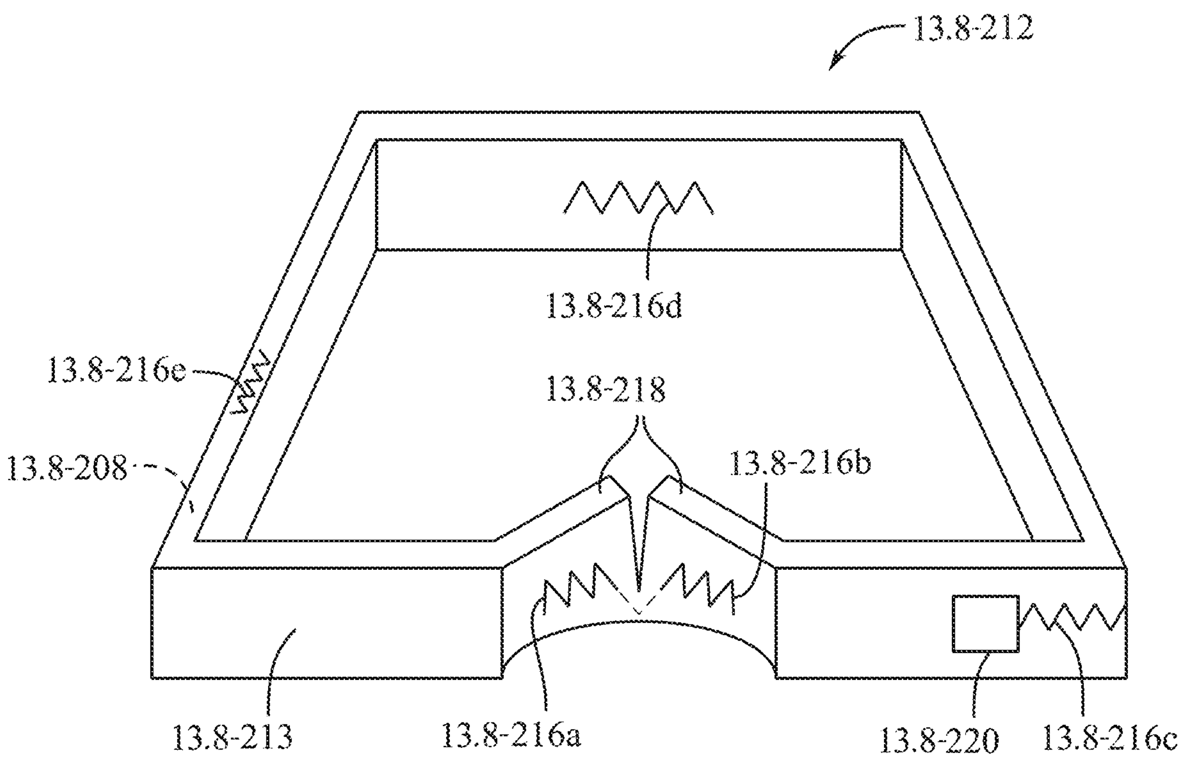
*FIG. 13.8-2*

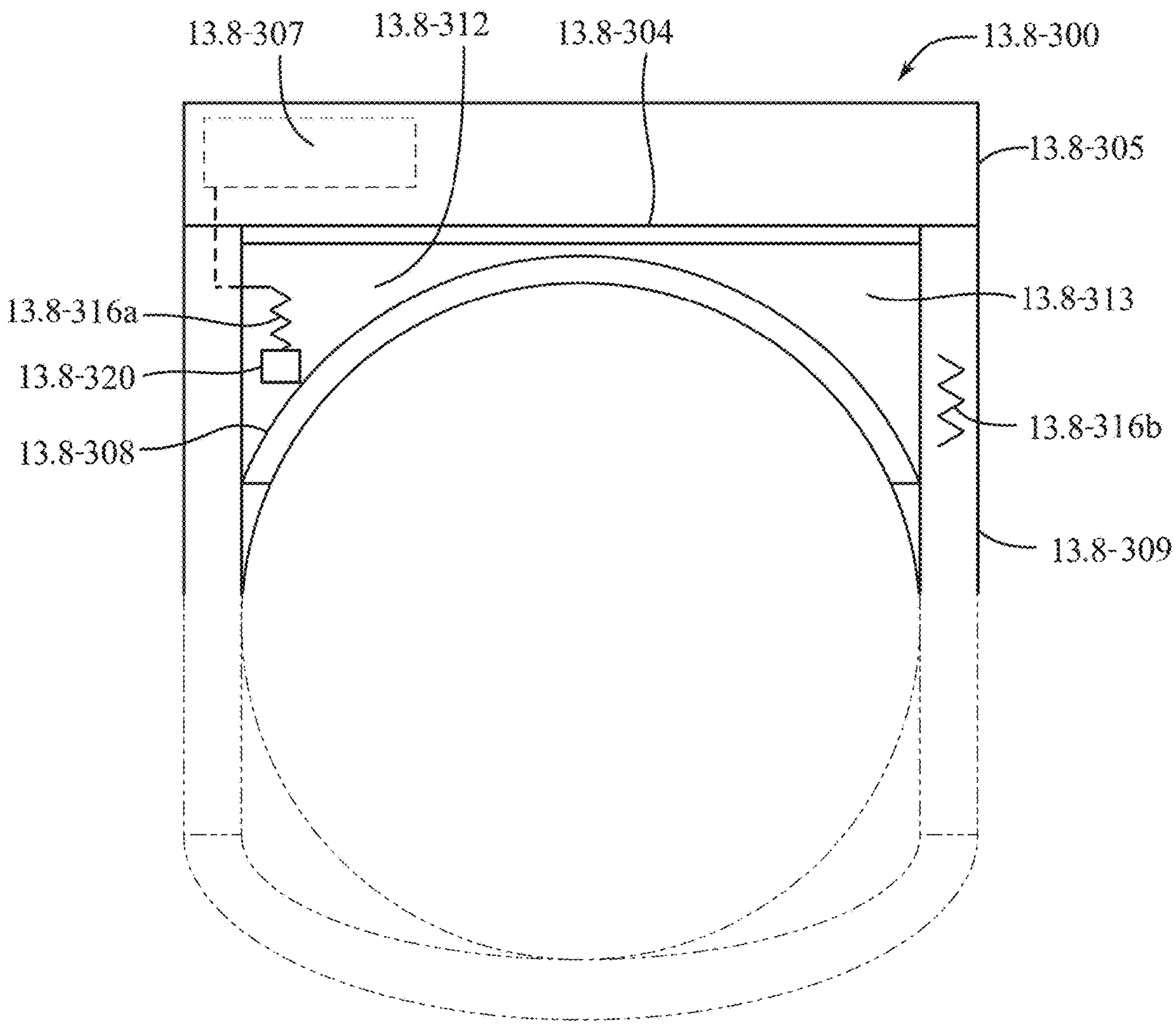
*FIG. 13.8-3*

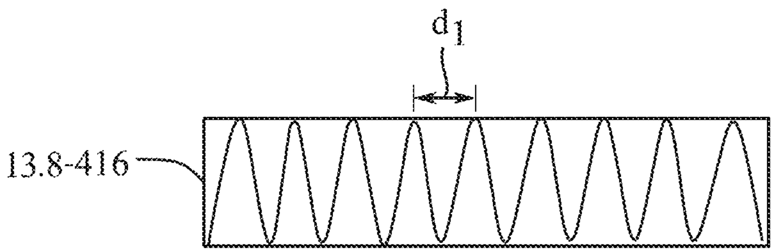
FIG. 13.8-4A
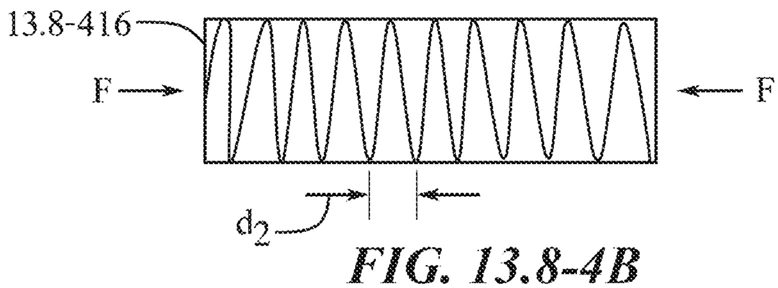
FIG. 13.8-4B
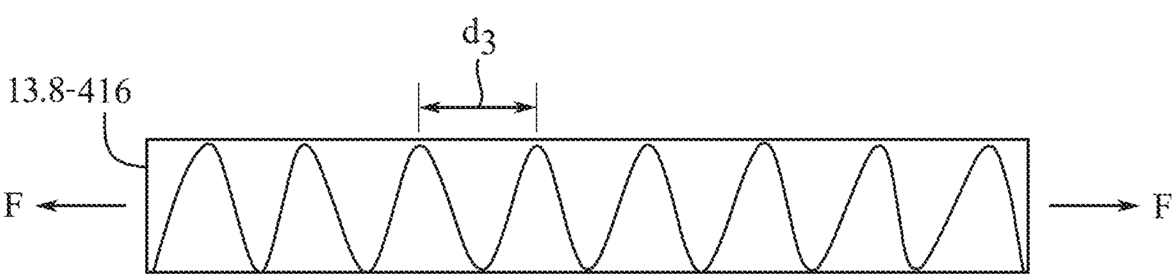
FIG. 13.8-4C

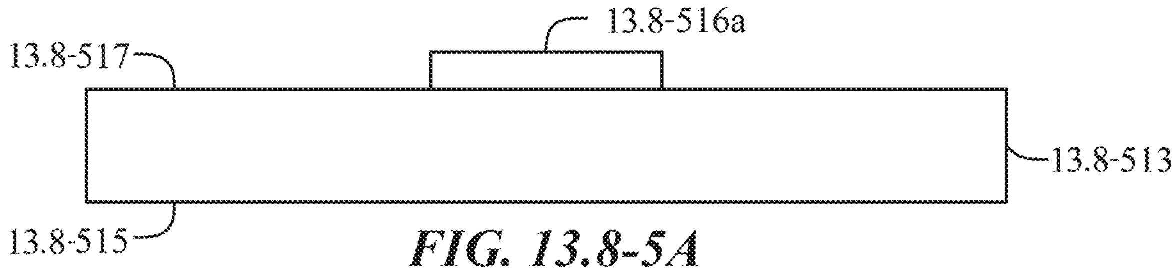
FIG. 13.8-5A
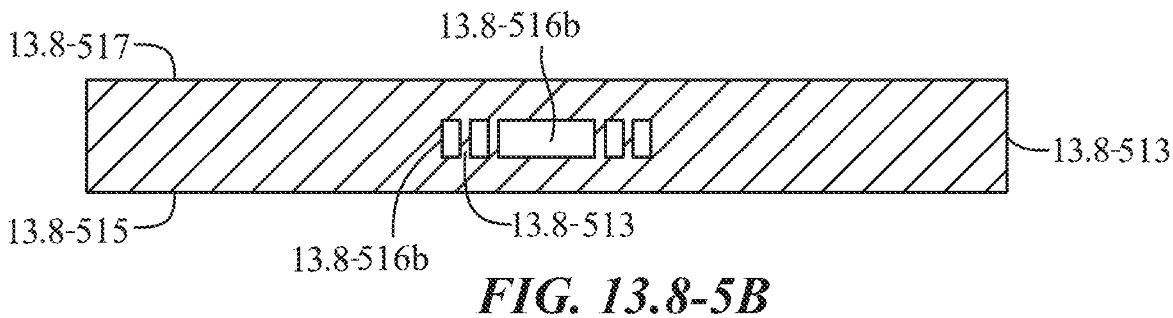
FIG. 13.8-5B
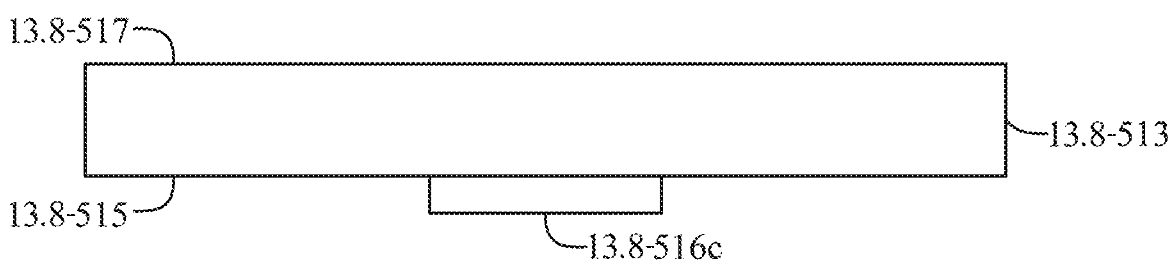
FIG. 13.8-5C
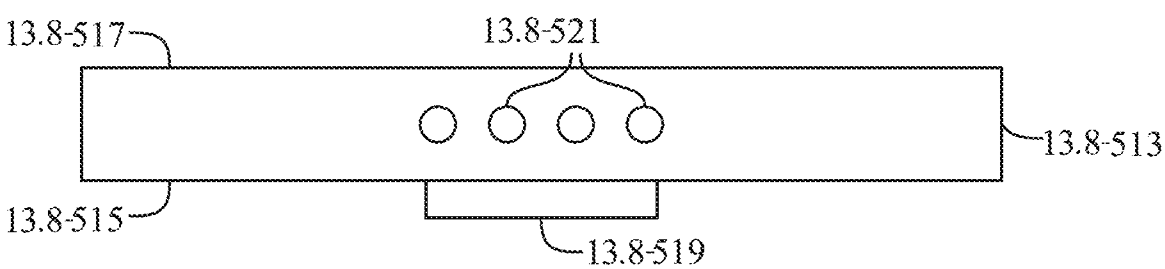
FIG. 13.8-5D

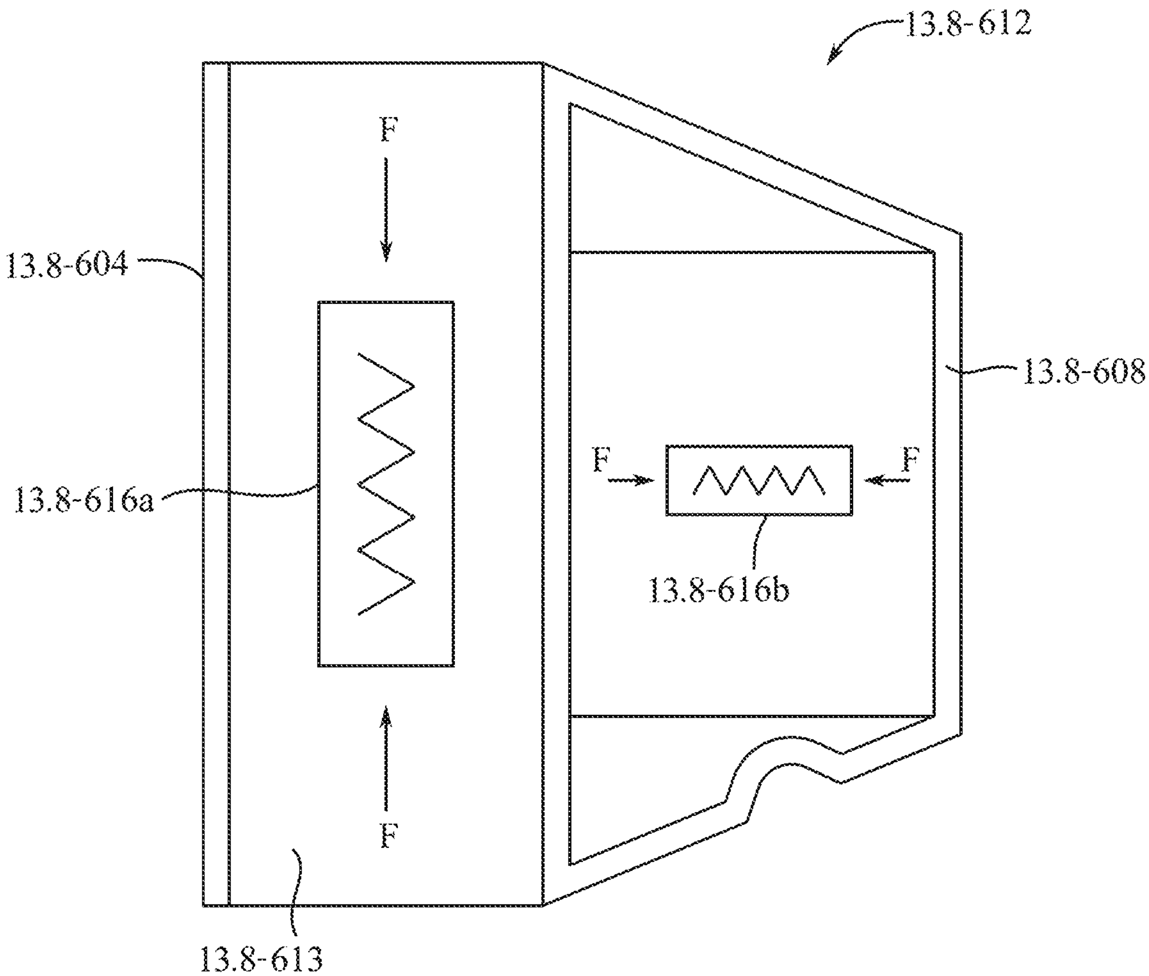
*FIG. 13.8-6*

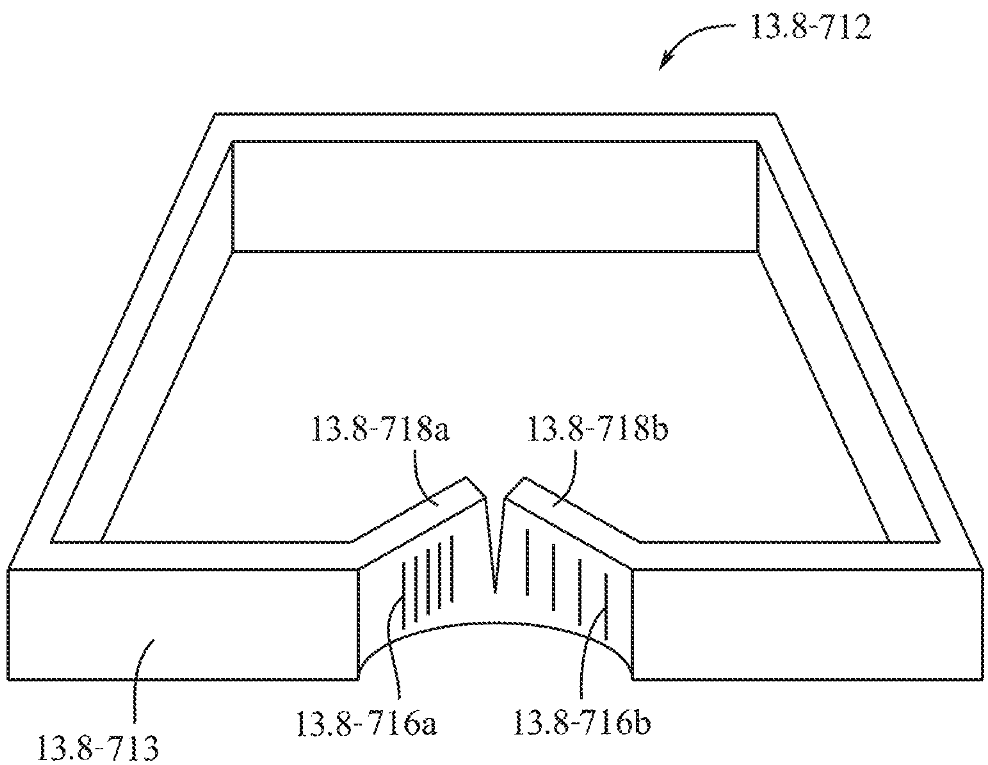
FIG. 13.8-7

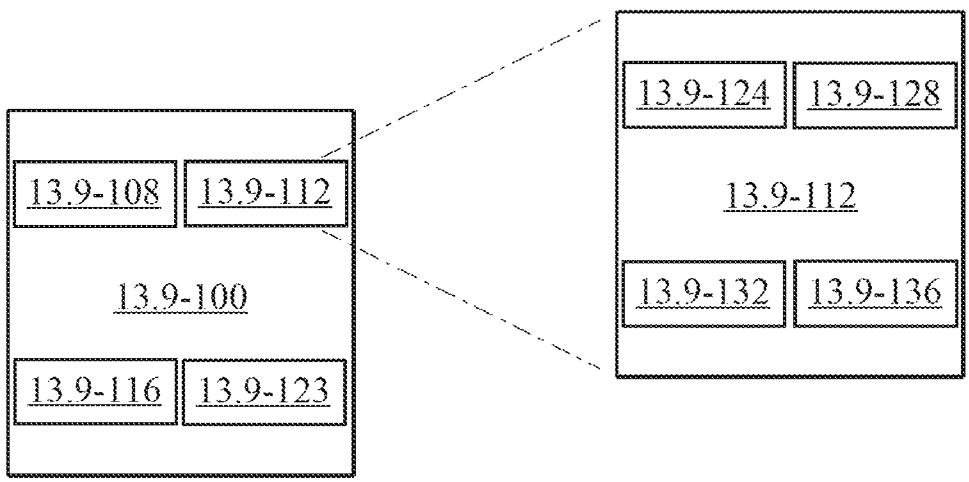
*FIG. 13.9-1*

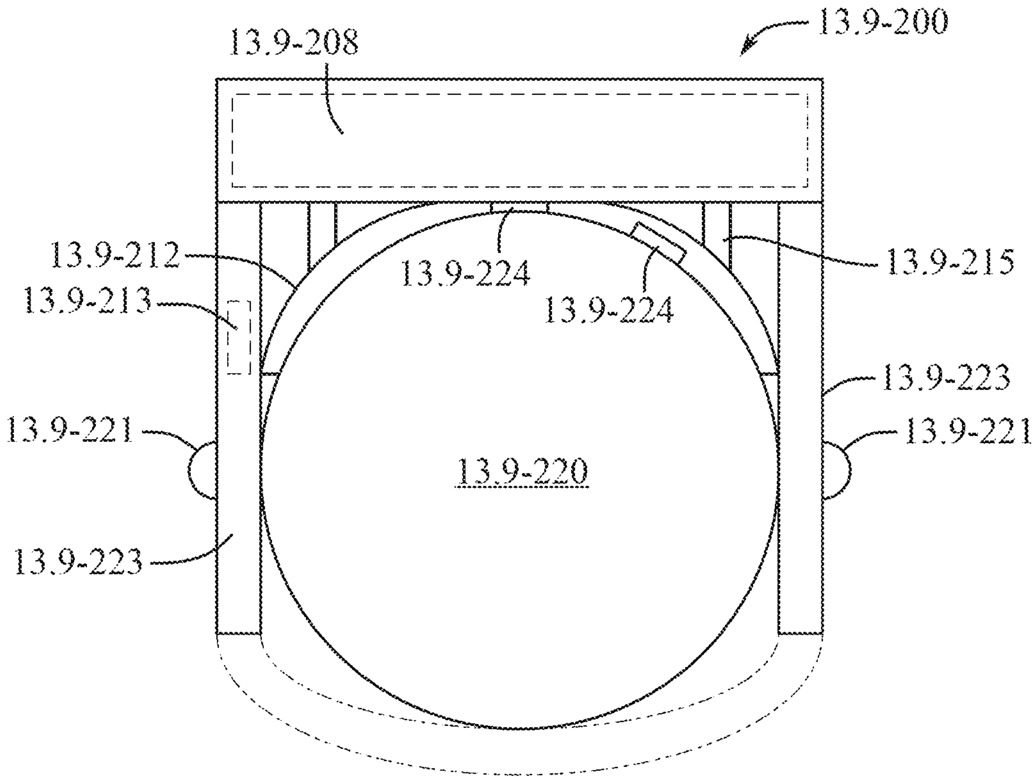
*FIG. 13.9-2A*
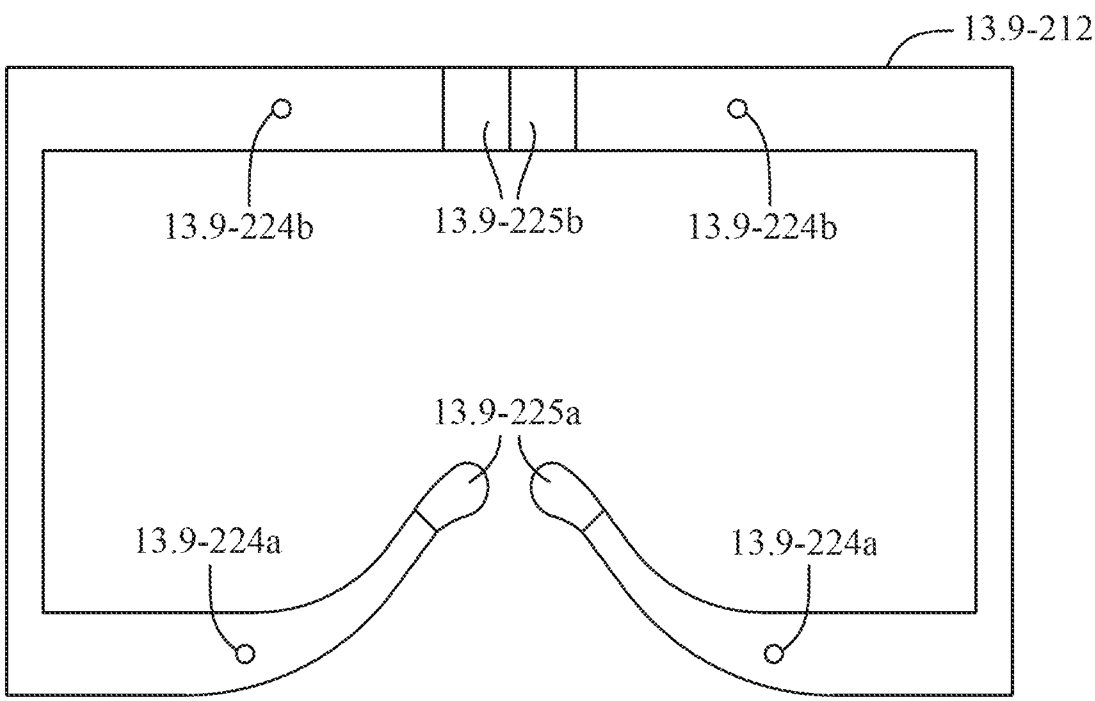
*FIG. 13.9-2B*

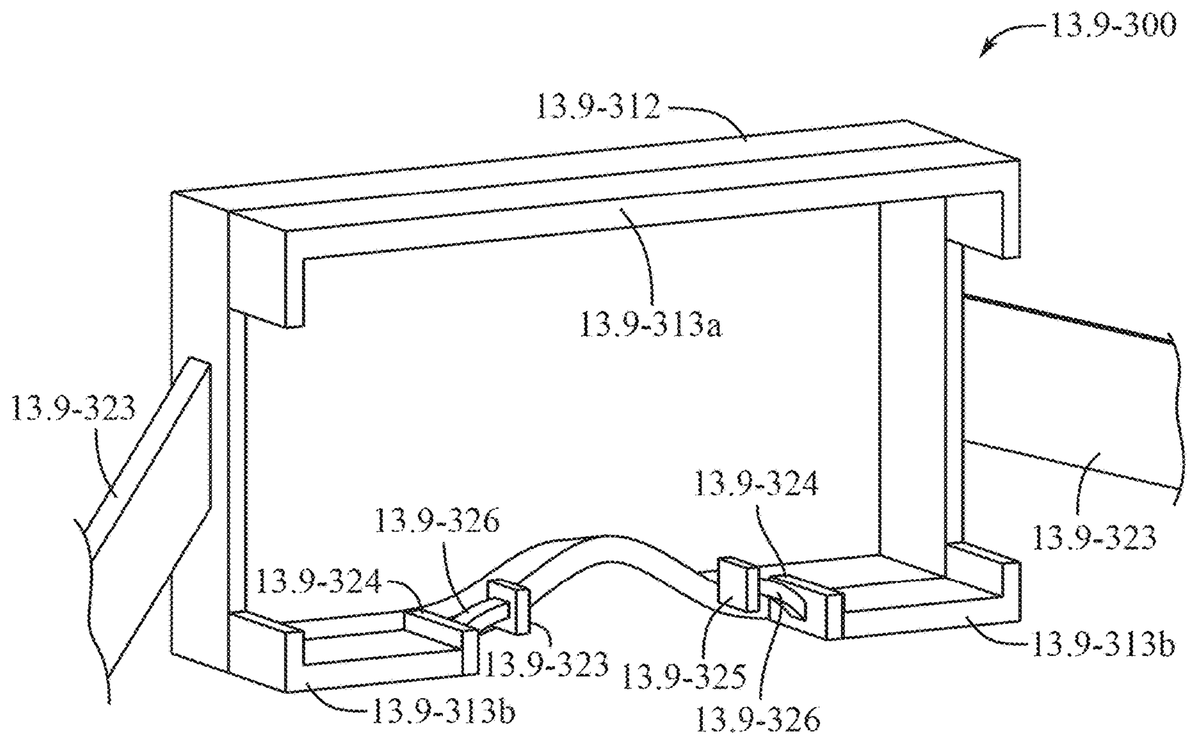
*FIG. 13.9-3*

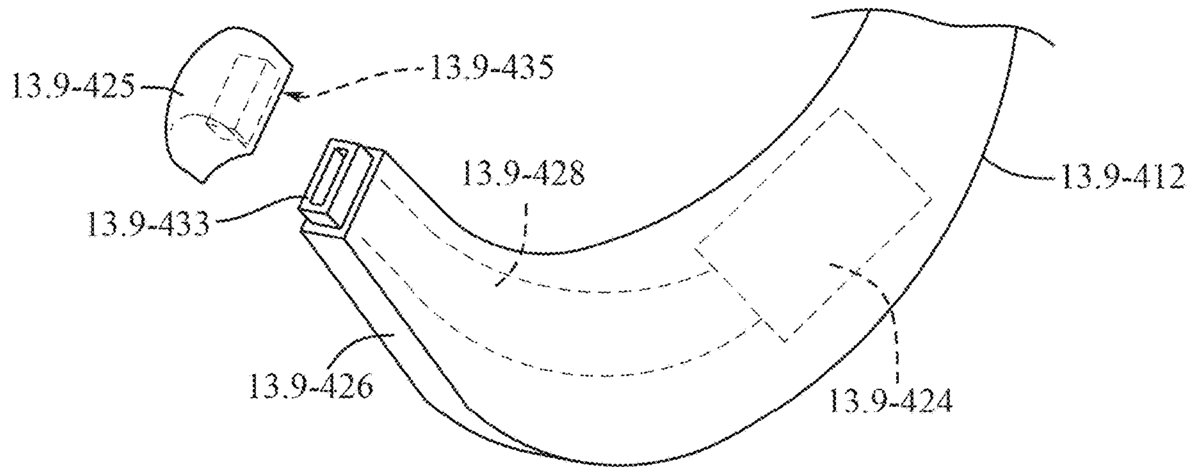
*FIG. 13.9-4A*
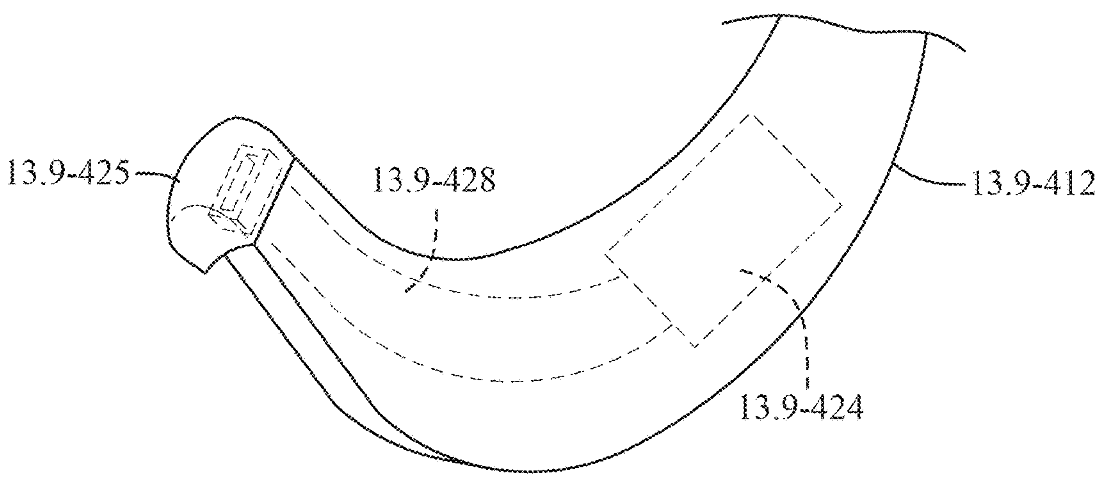
*FIG. 13.9-4B*

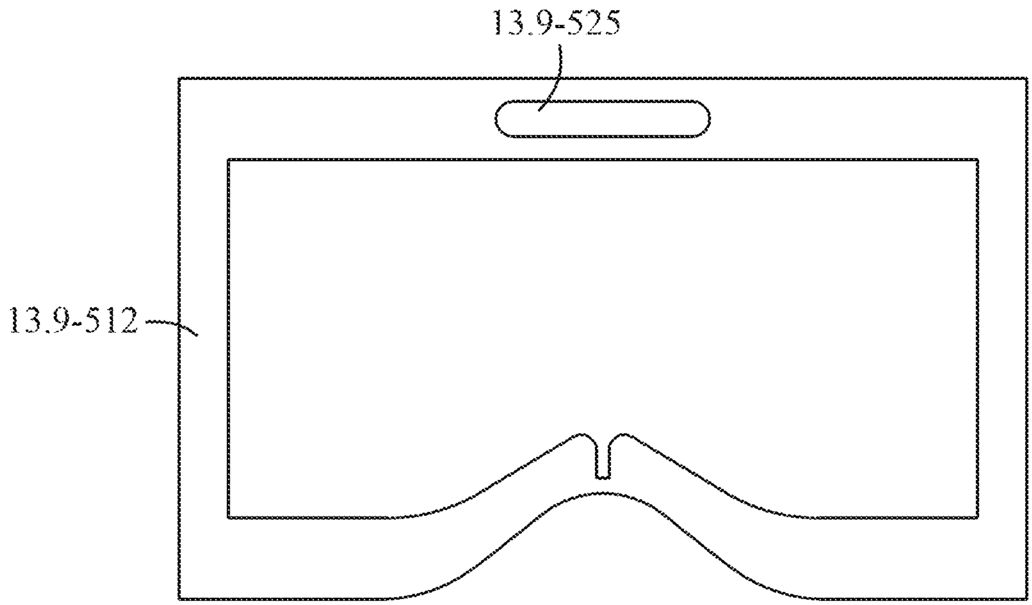
FIG. 13.9-5A
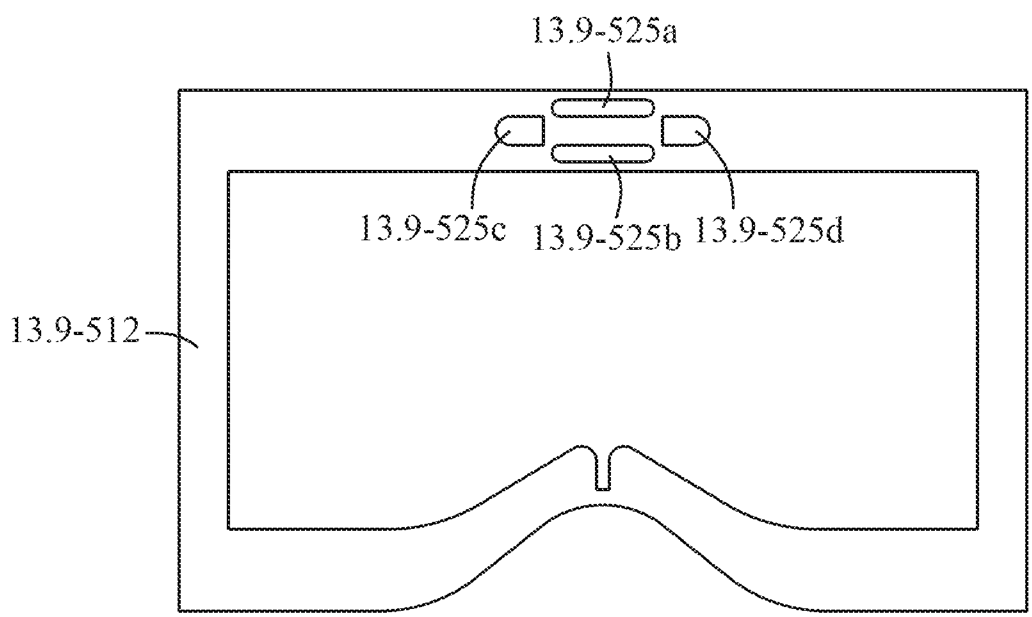
FIG. 13.9-5B

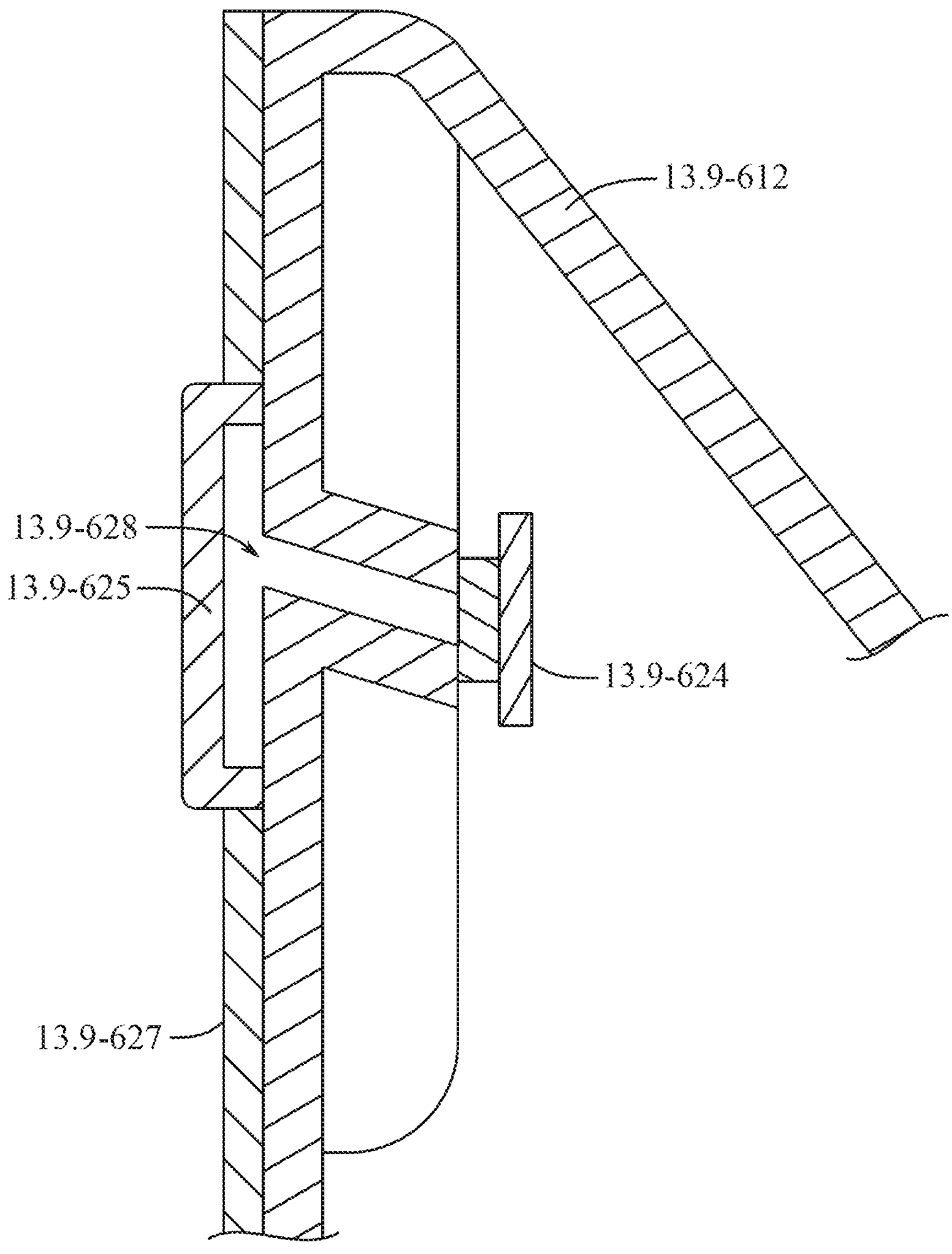
*FIG. 13.9-6*

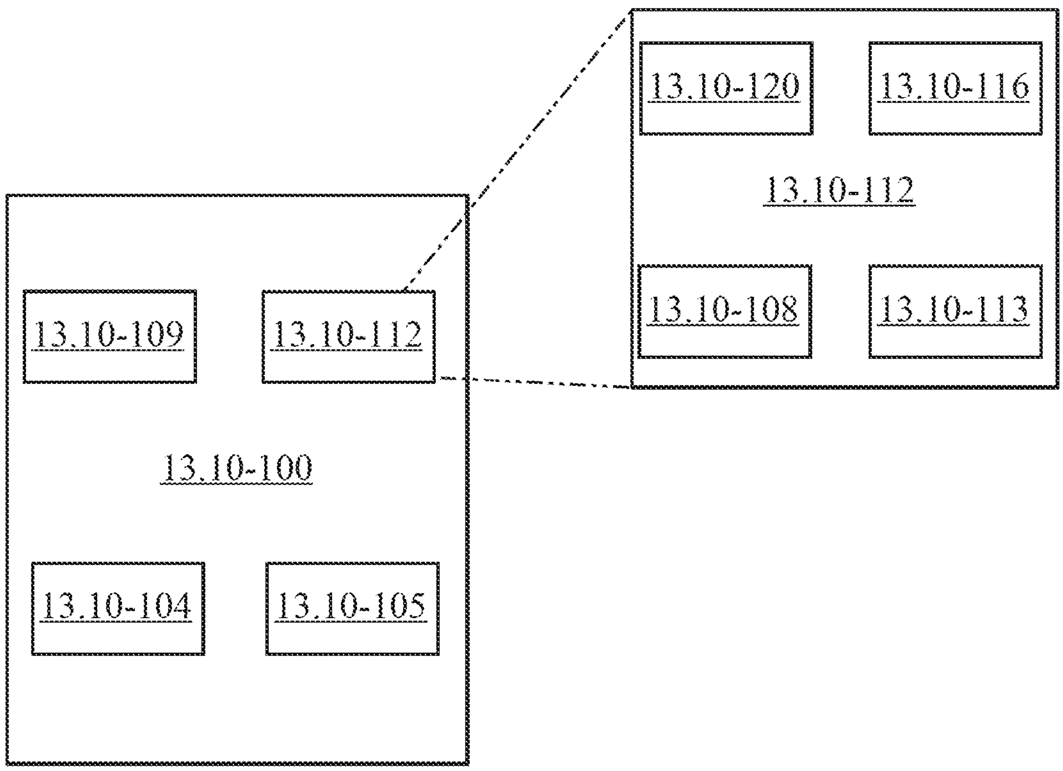
FIG. 13.10-1A
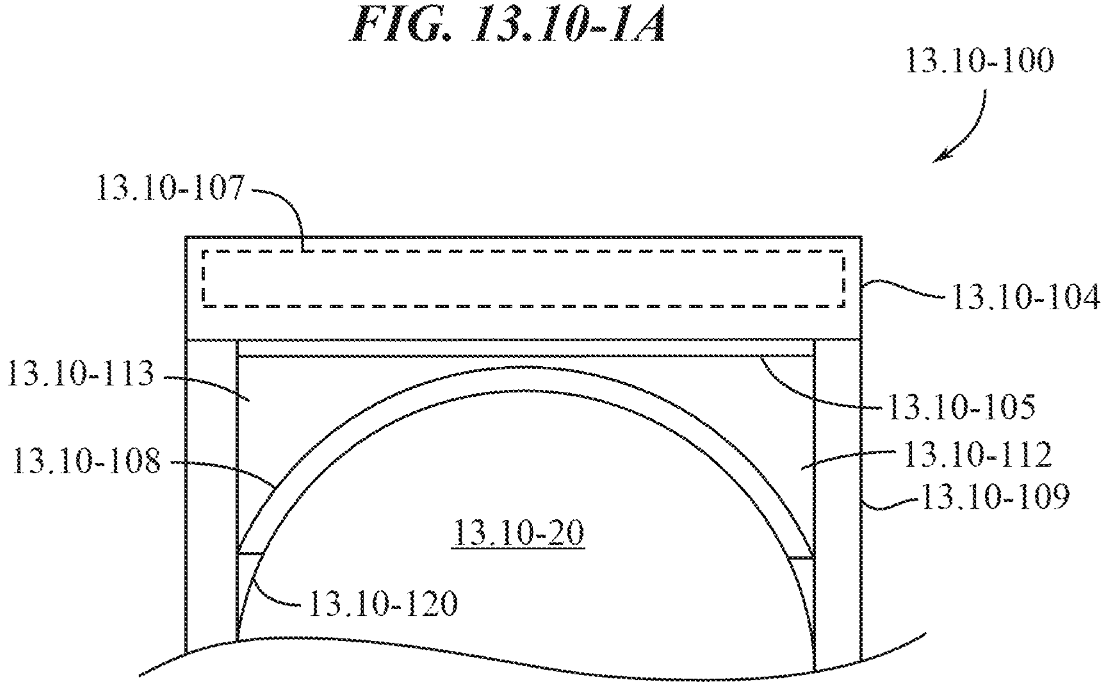
FIG. 13.10-1B

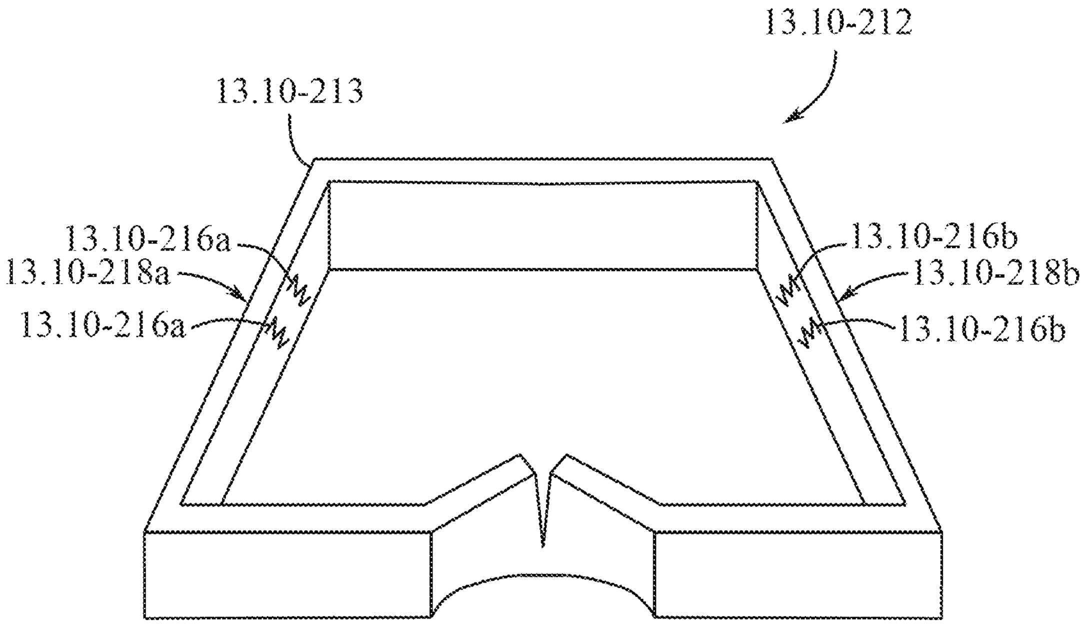
*FIG. 13.10-2*
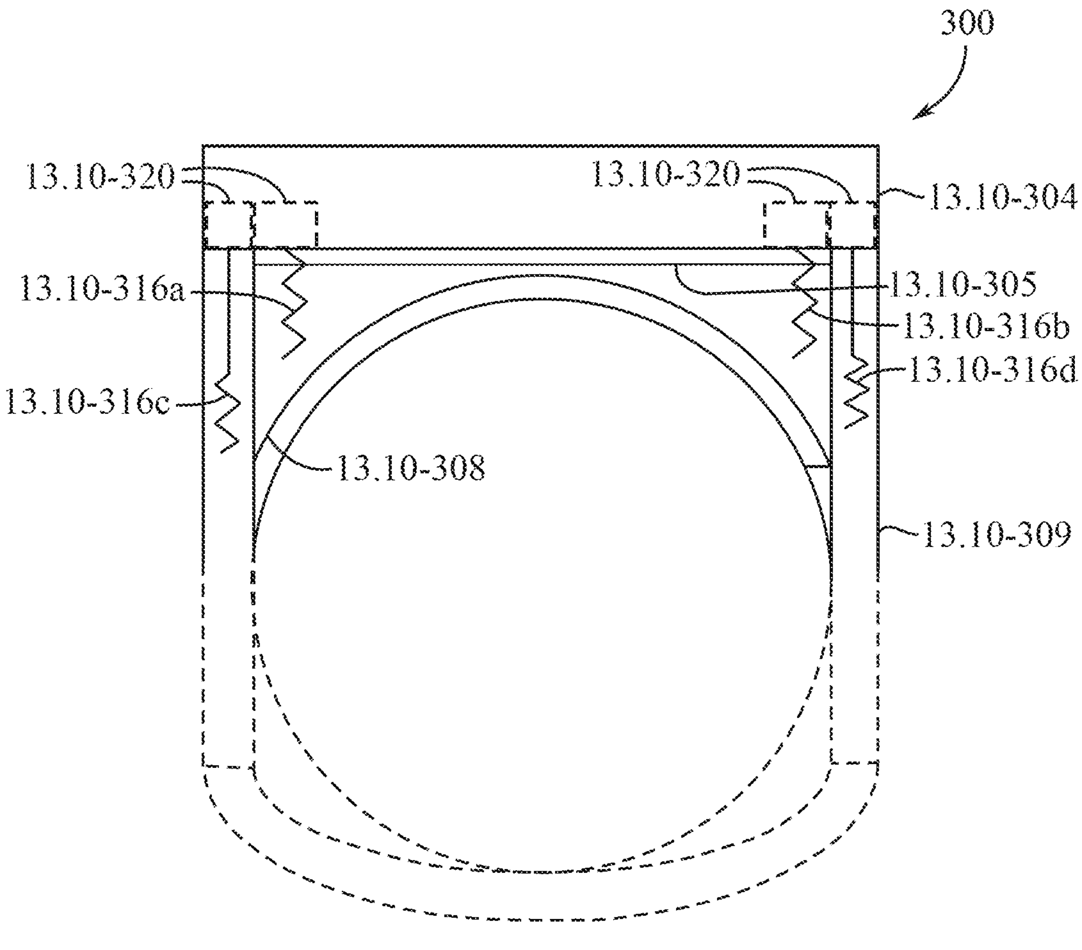
*FIG. 13.10-3A*

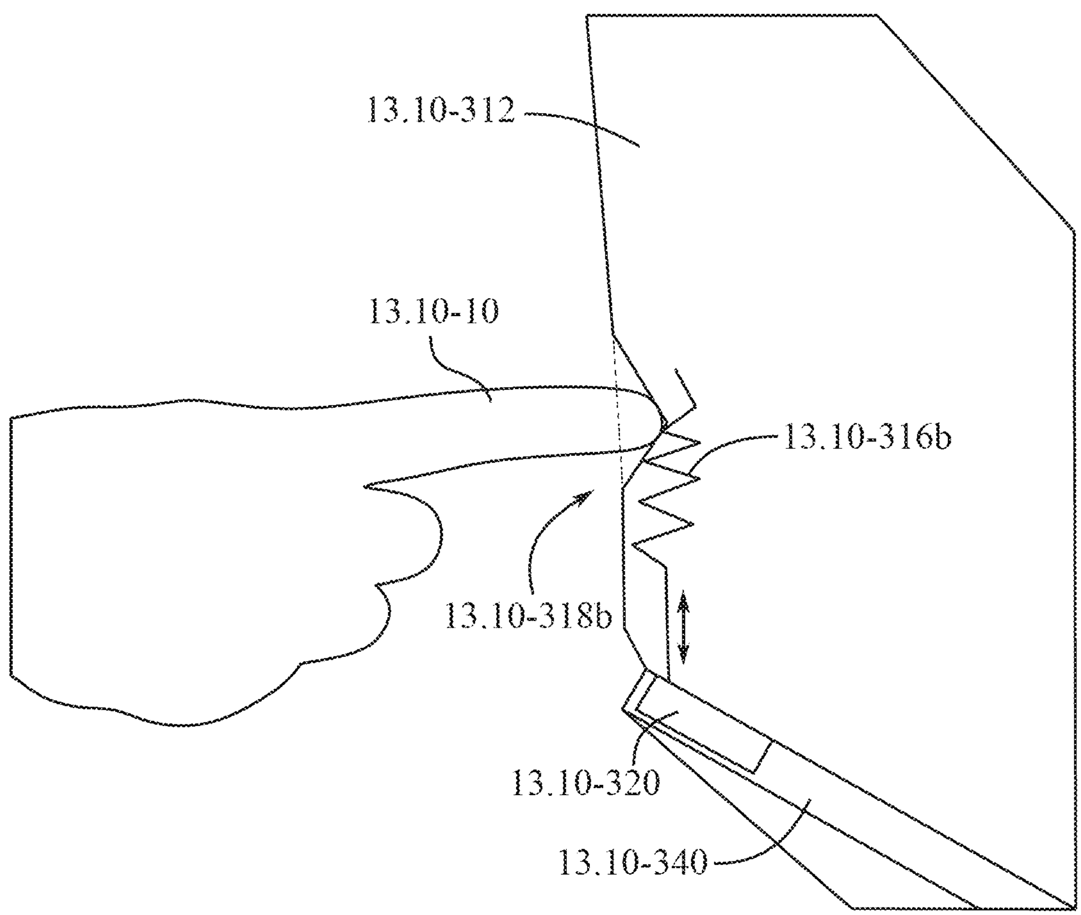
*FIG. 13.10-3B*

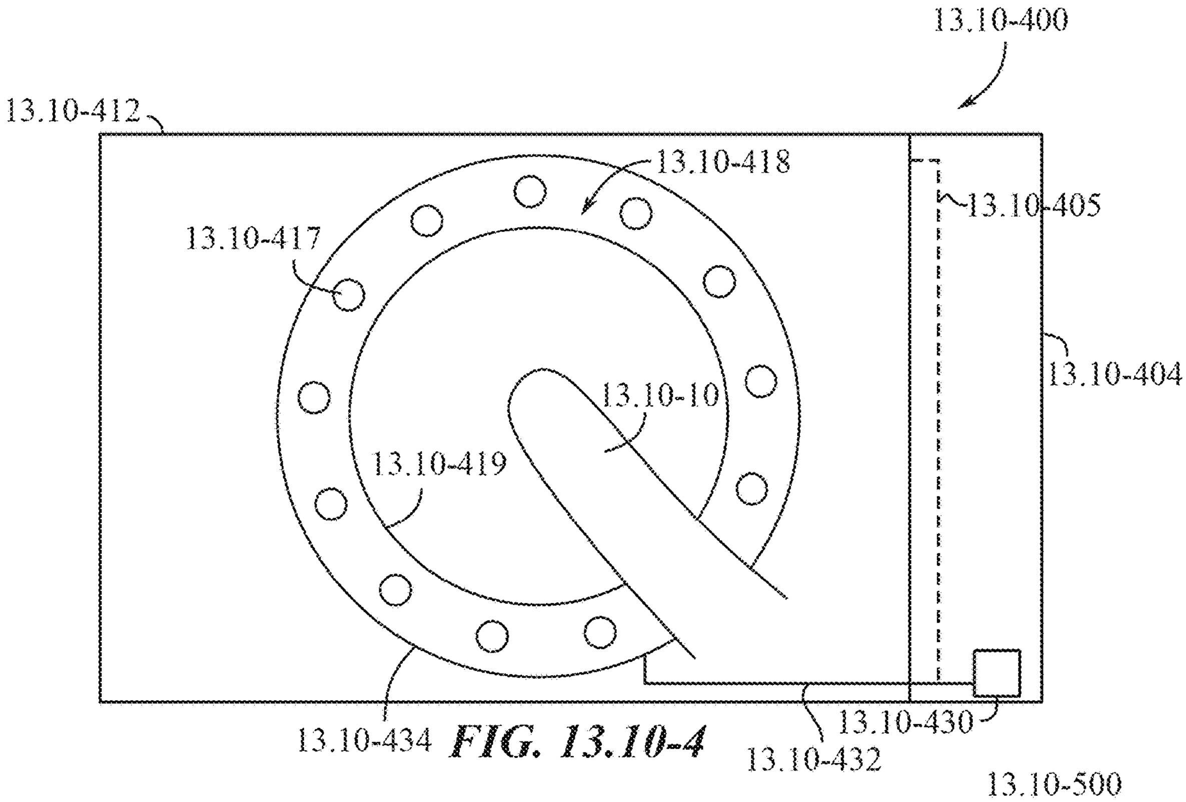
*FIG. 13.10-4*
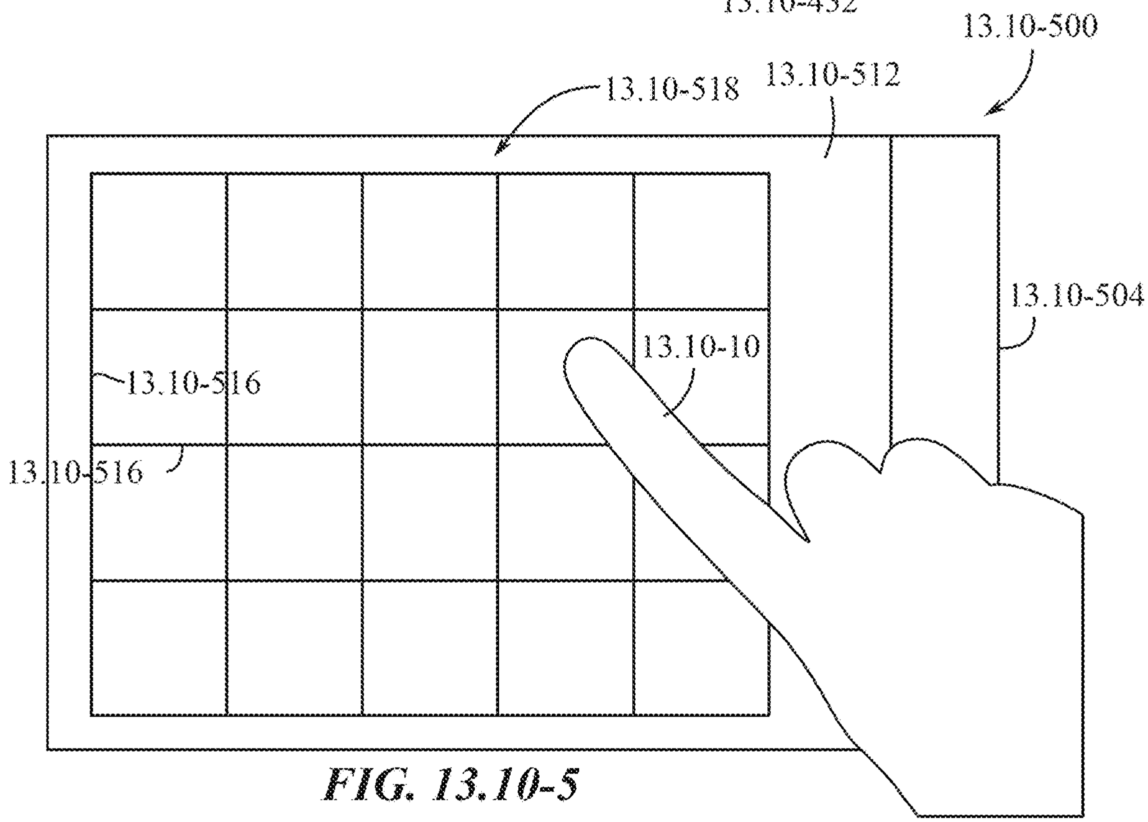
*FIG. 13.10-5*

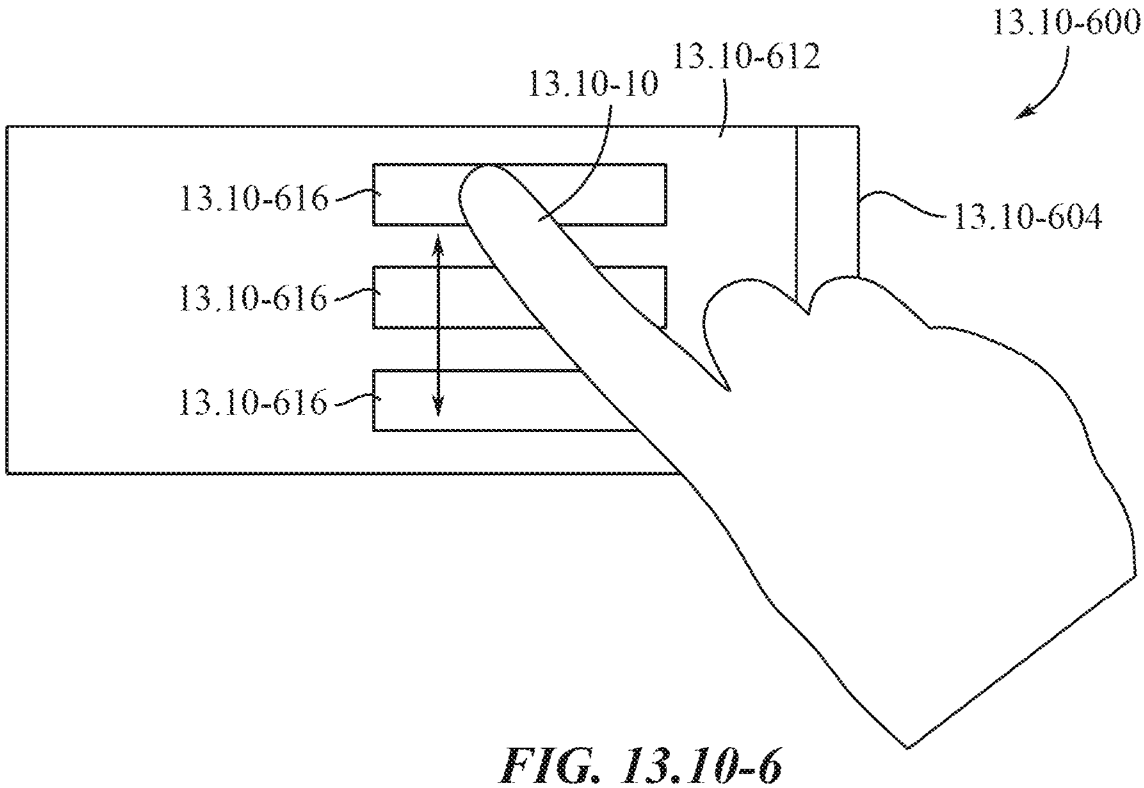
*FIG. 13.10-6*
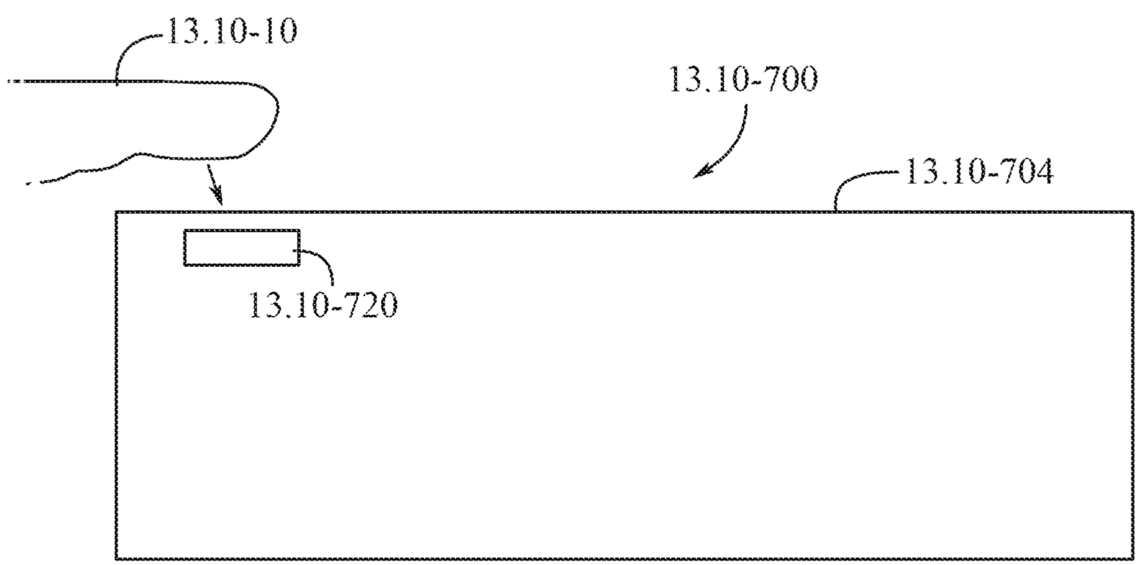
*FIG. 13.10-7*

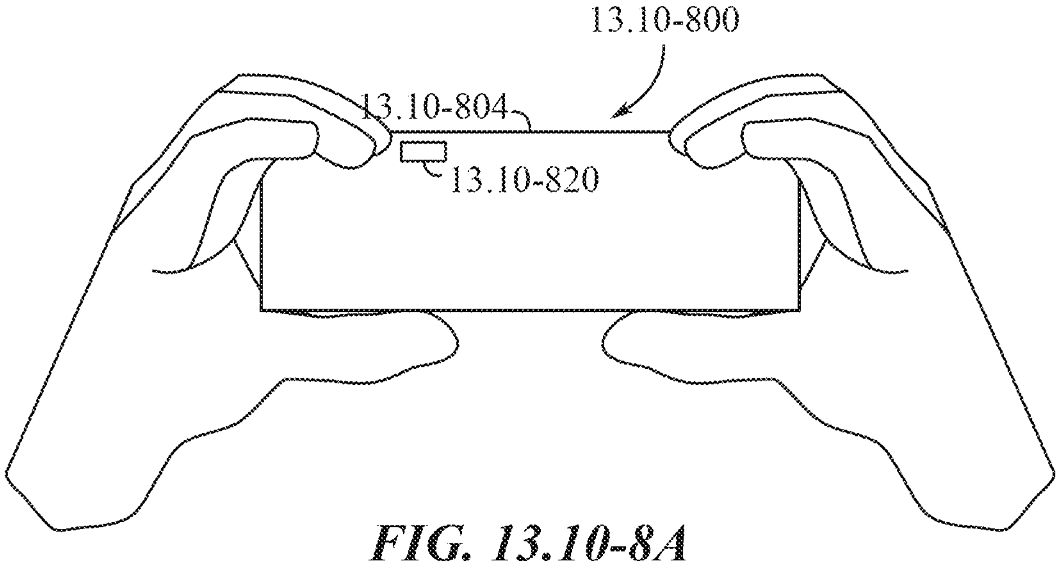
*FIG. 13.10-8A*
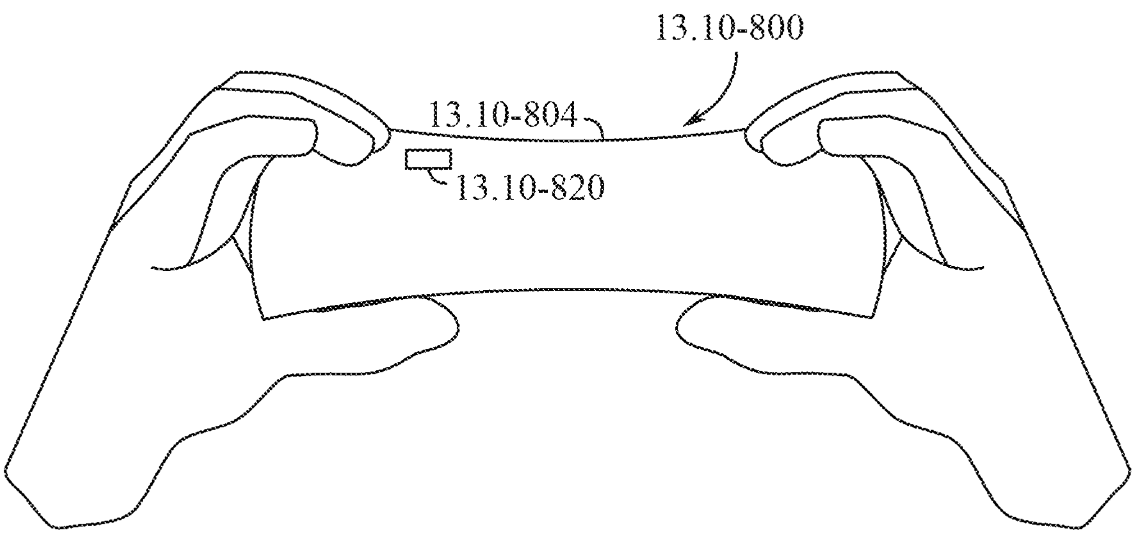
*FIG. 13.10-8B*

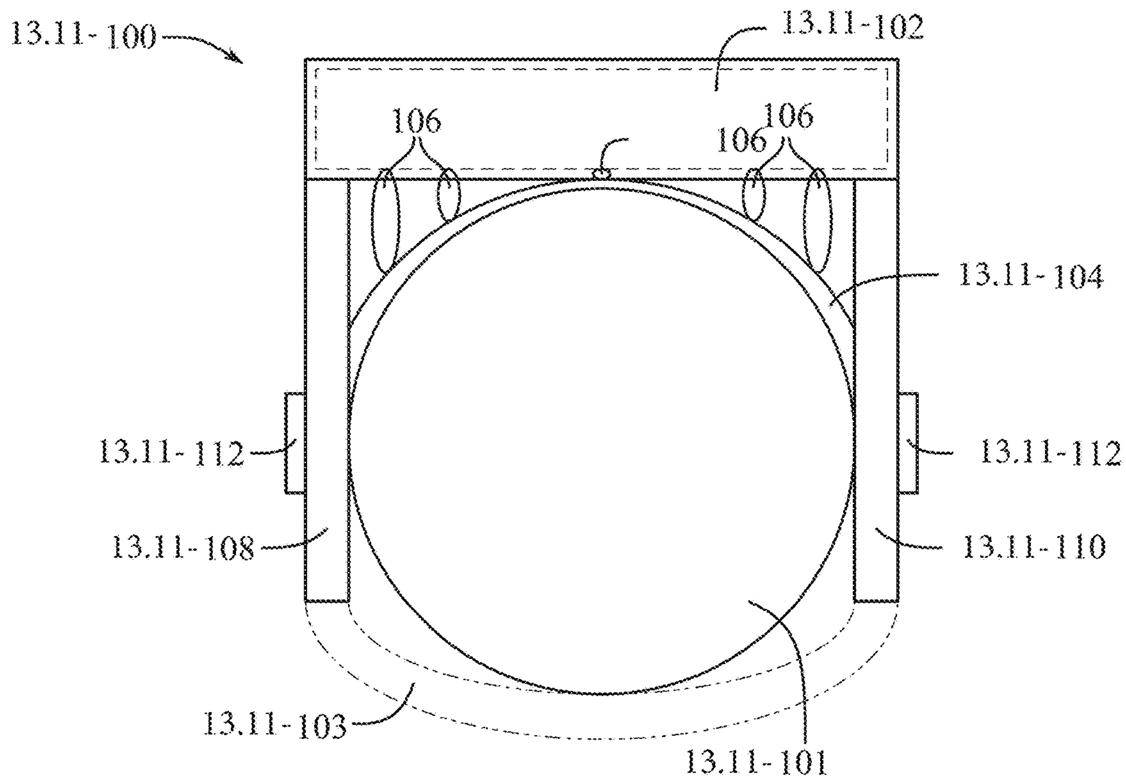
FIG. 13.11-1
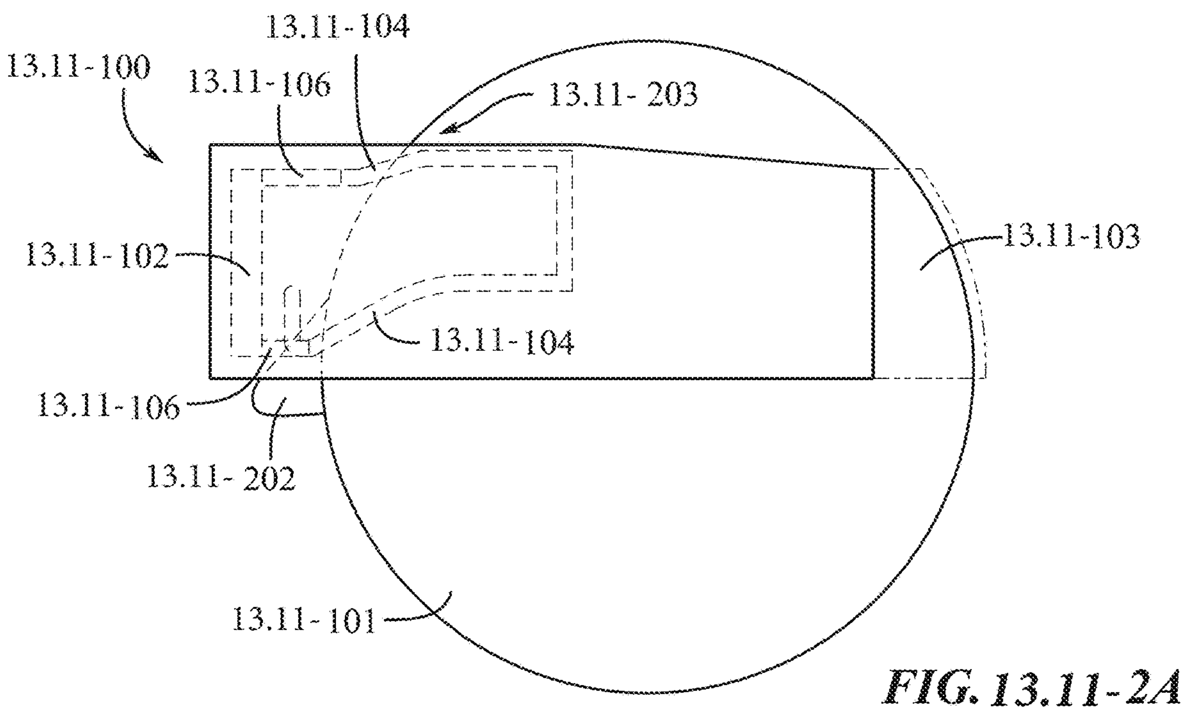
FIG. 13.11-2A

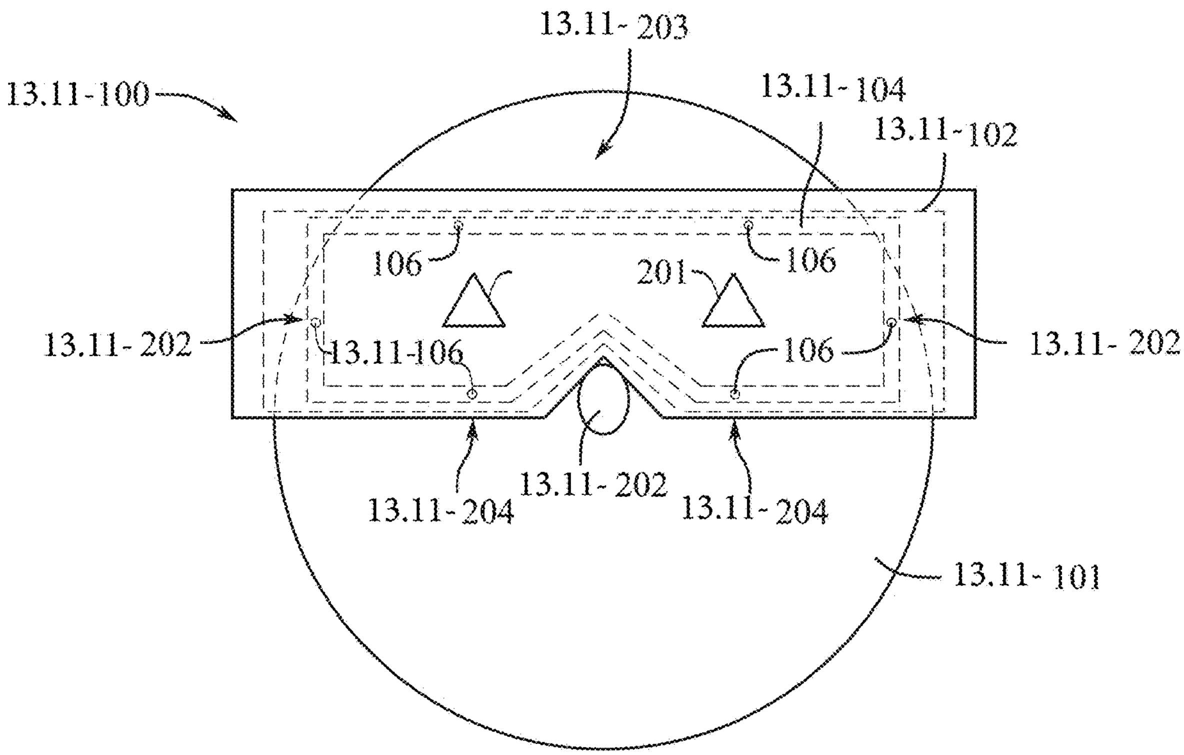
FIG. 13.11-2B

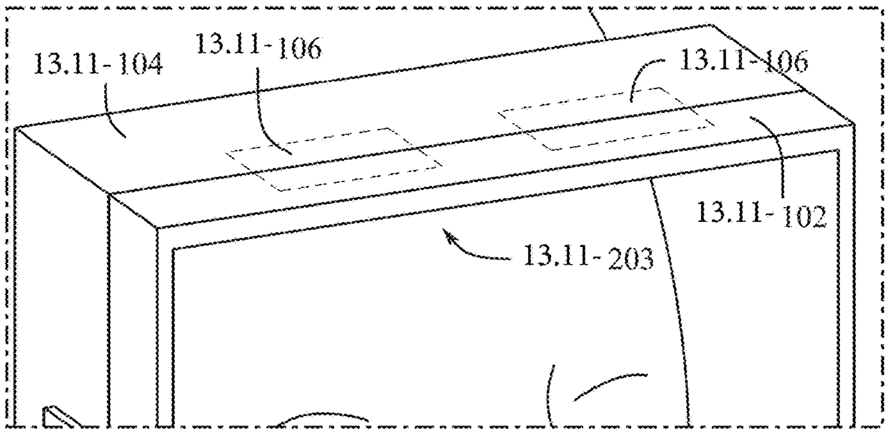
FIG. 13.11-3A
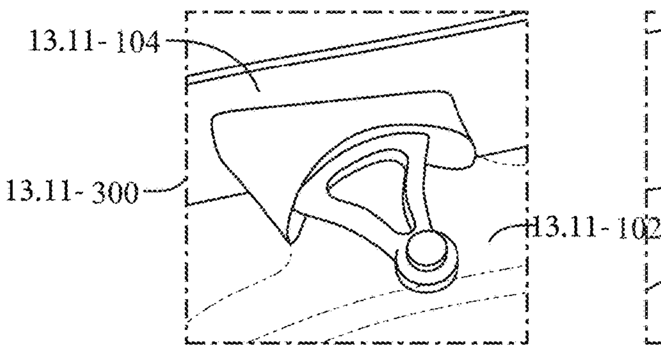
FIG. 13.11-3B
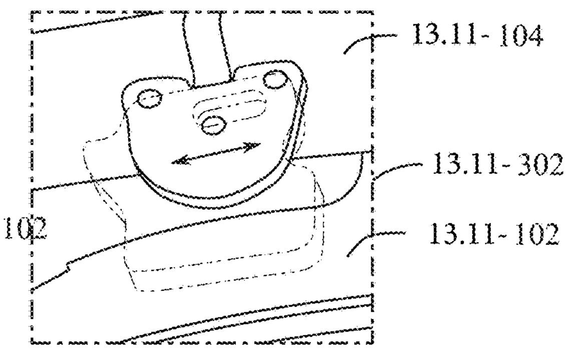
FIG. 13.11-3C
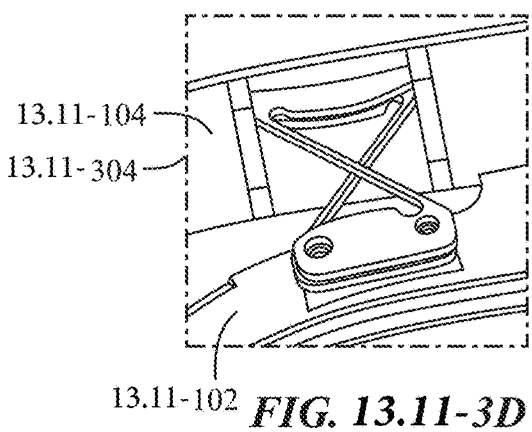
FIG. 13.11-3D
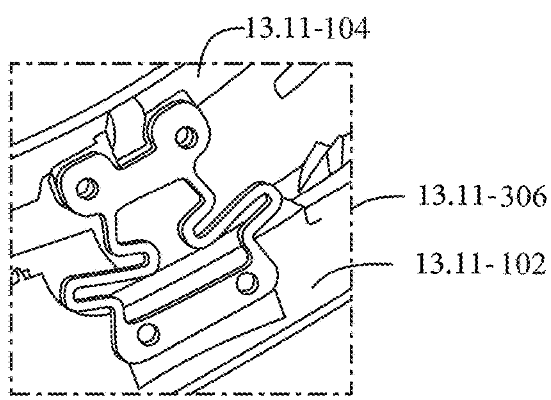
FIG. 13.11-3E

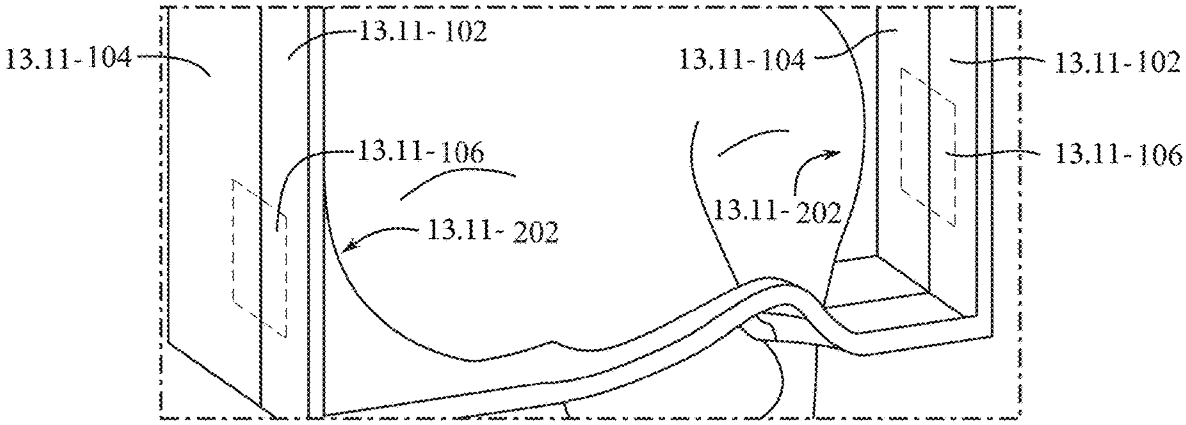
FIG. 13.11-4A
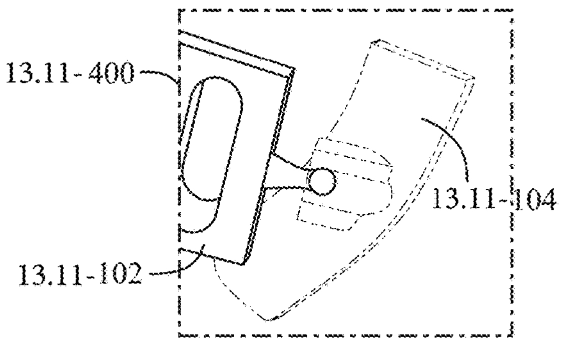
FIG. 13.11-4B
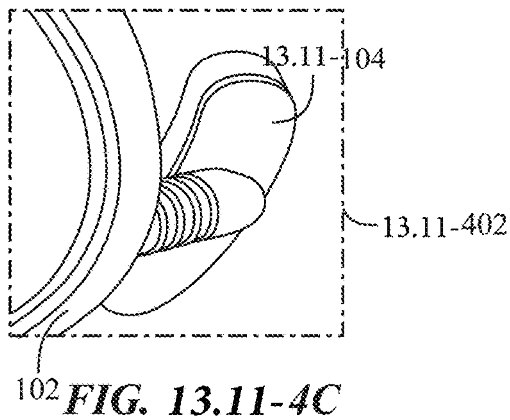
FIG. 13.11-4C
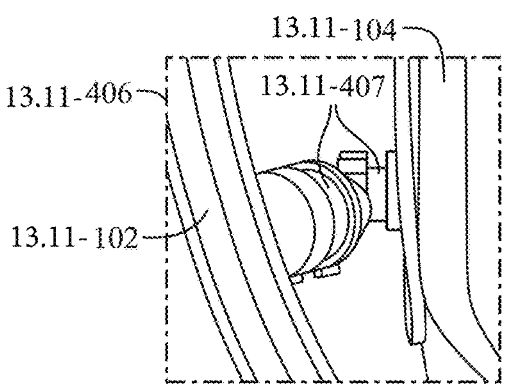
FIG. 13.11-4D
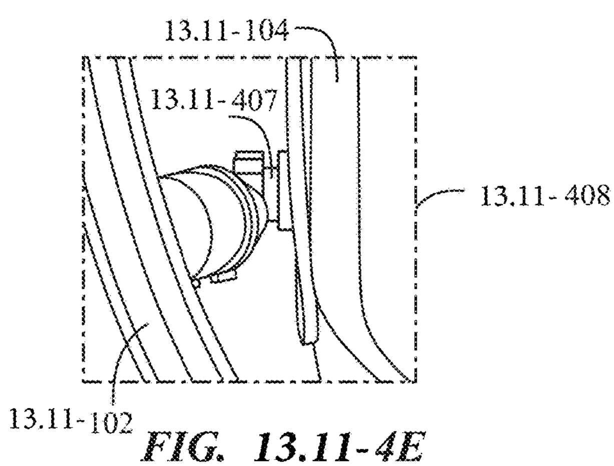
FIG. 13.11-4E

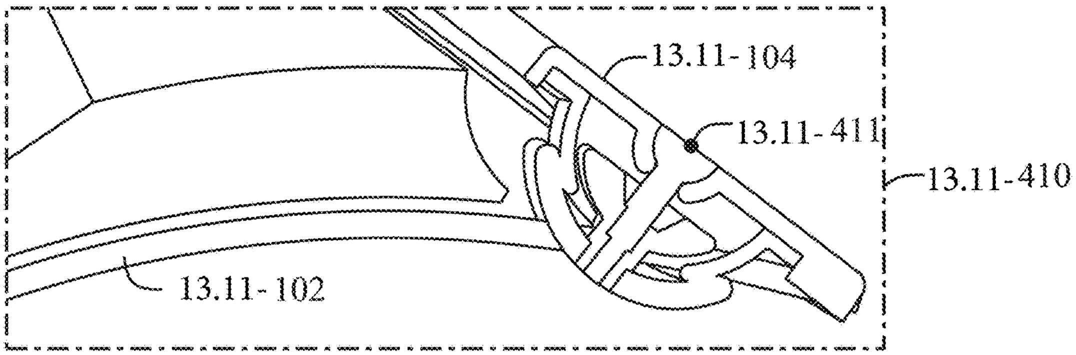
FIG. 13.11-4F
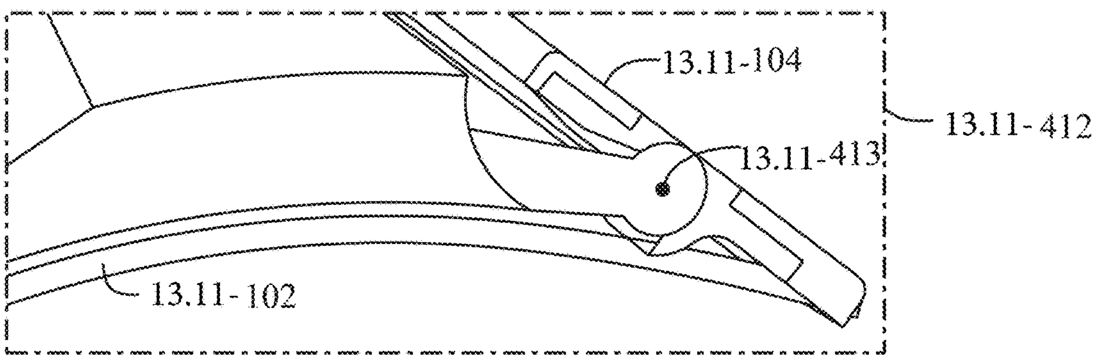
FIG. 13.11-4G
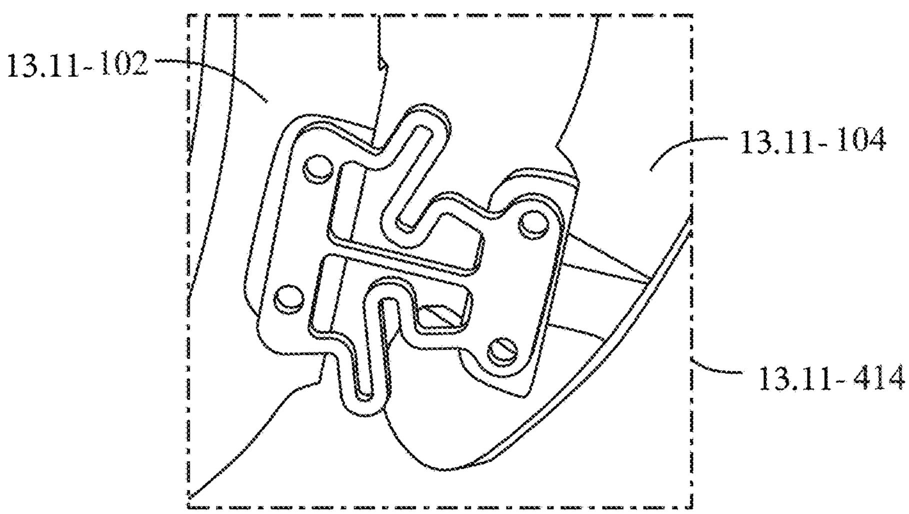
FIG. 13.11-4H

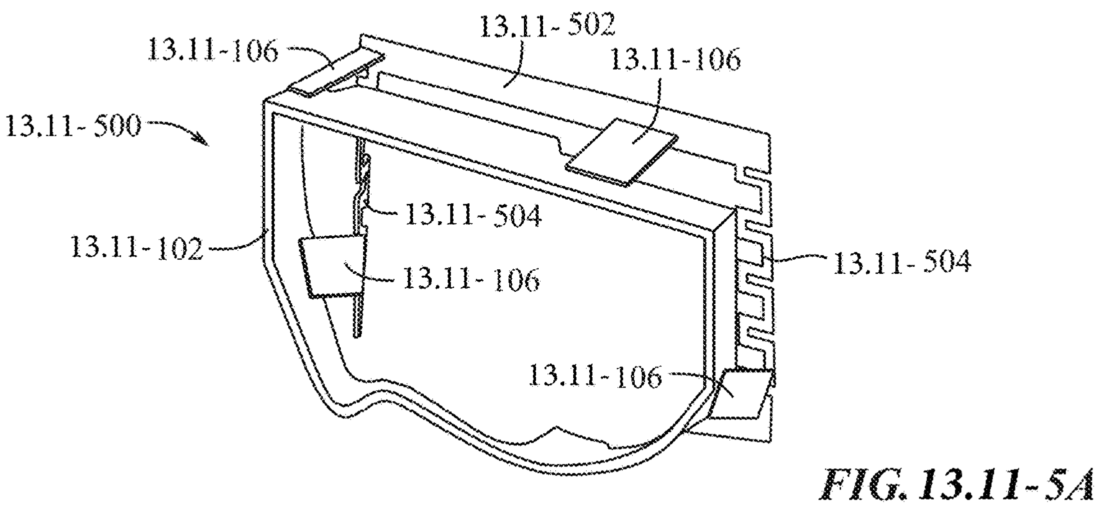
FIG. 13.11-5A
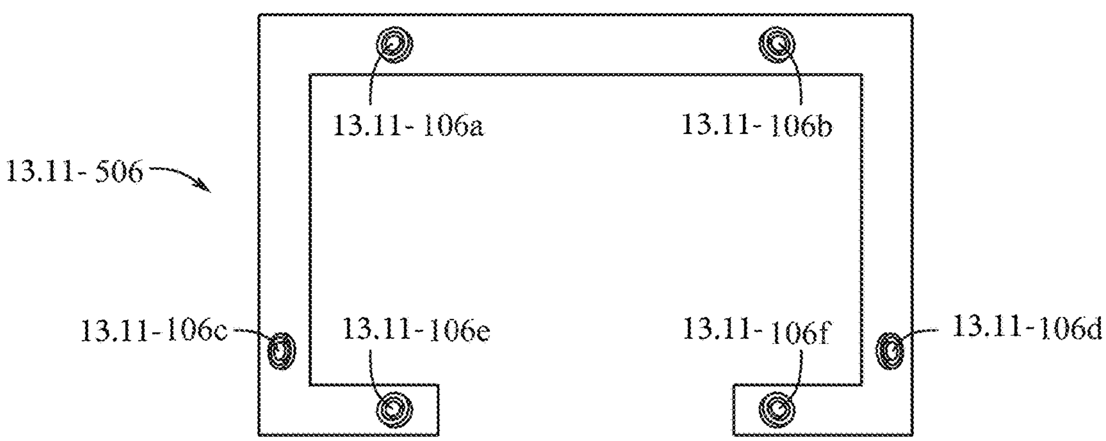
FIG. 13.11-5B
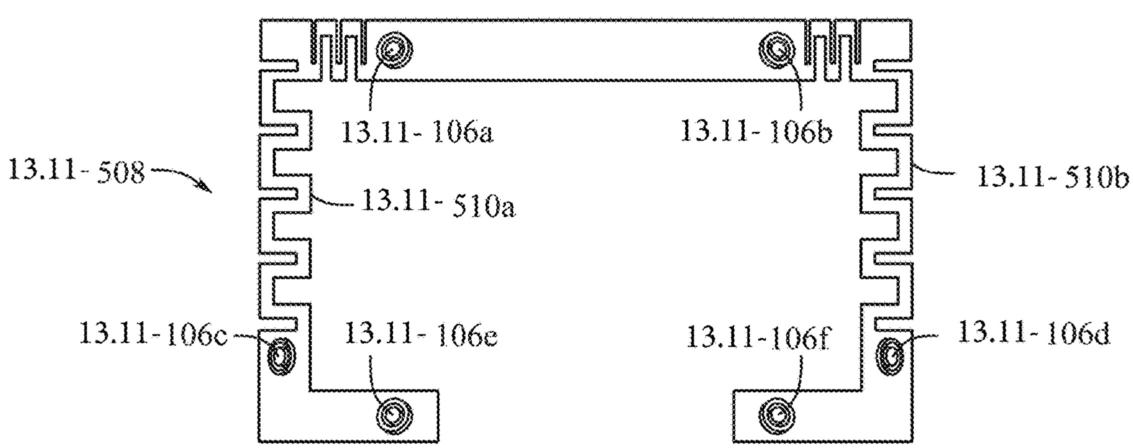
FIG. 13.11-5C

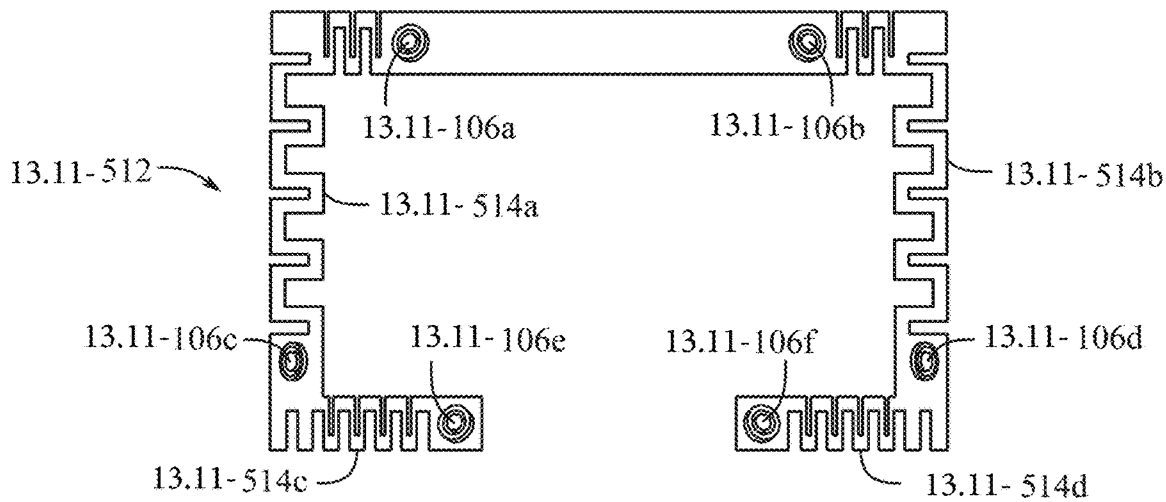
*FIG. 13.11-5D*
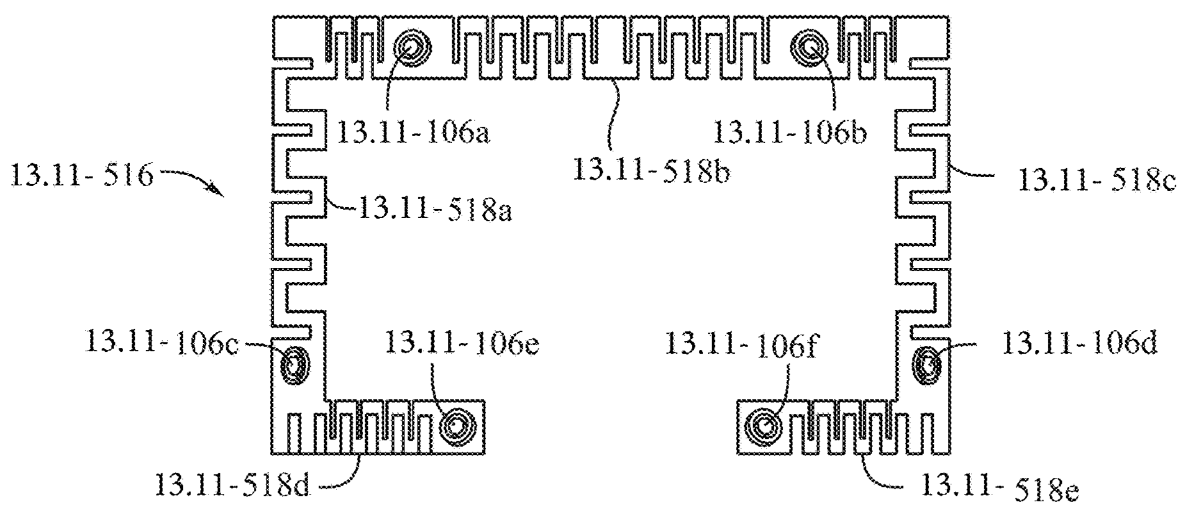
*FIG. 13.11-5E*

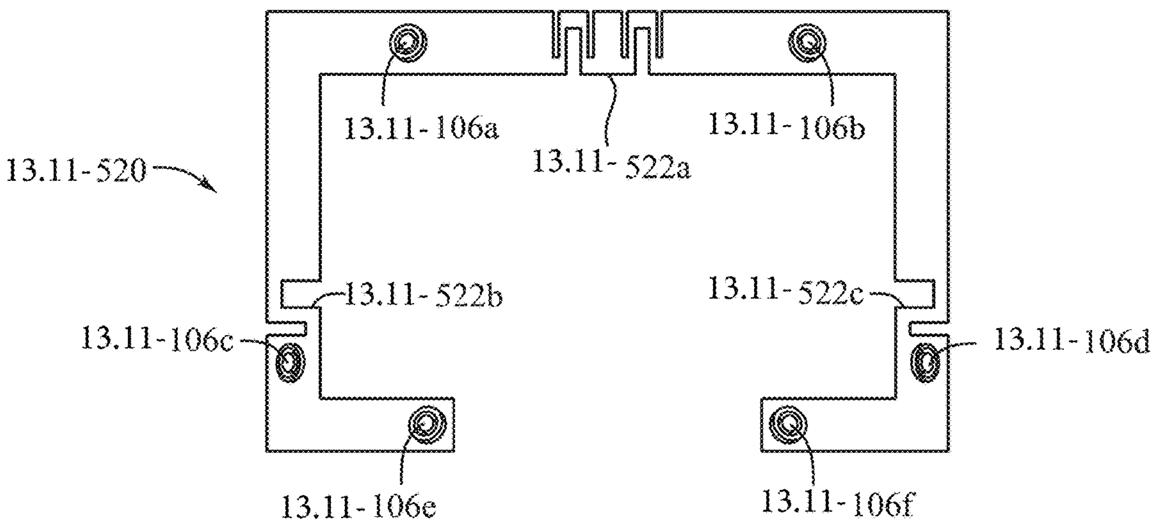
FIG. 13.11-5F
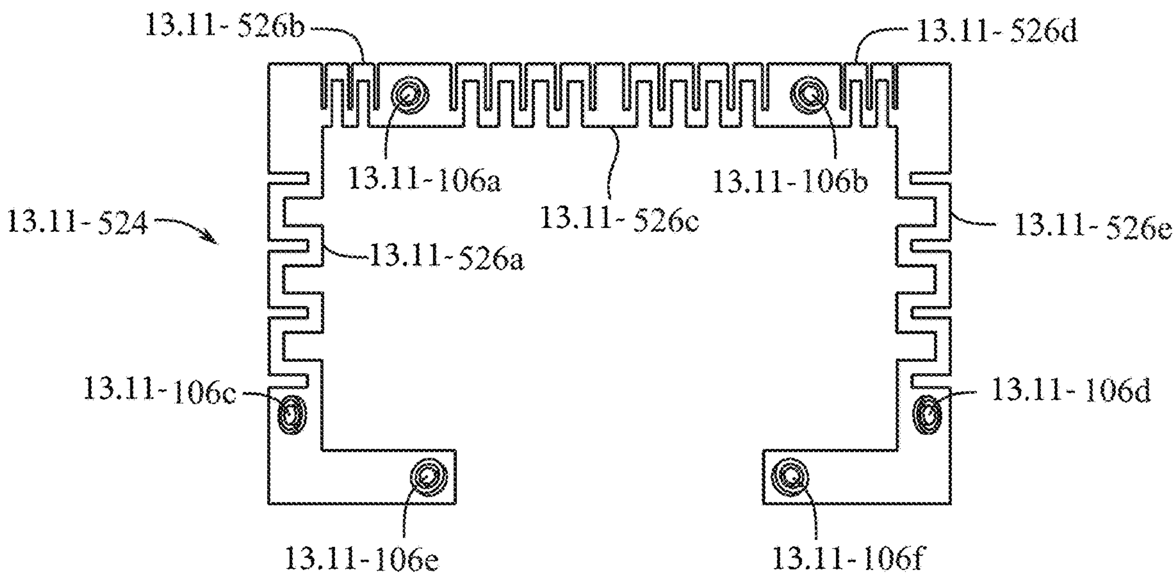
FIG. 13.11-5G

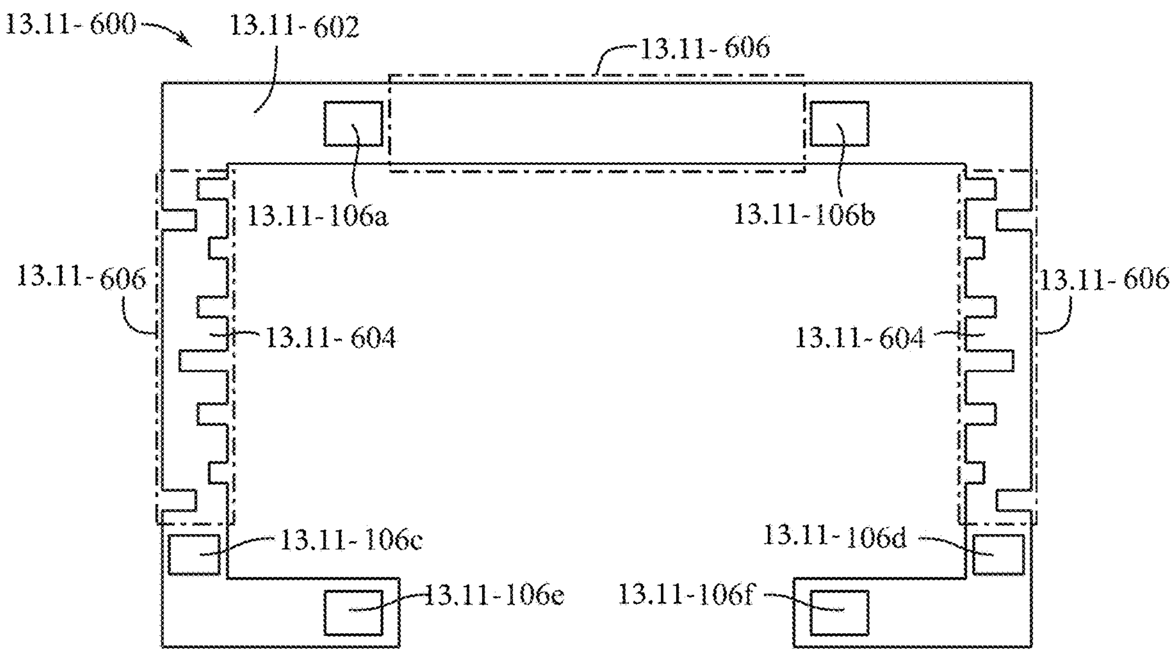
*FIG. 13.11-6A*
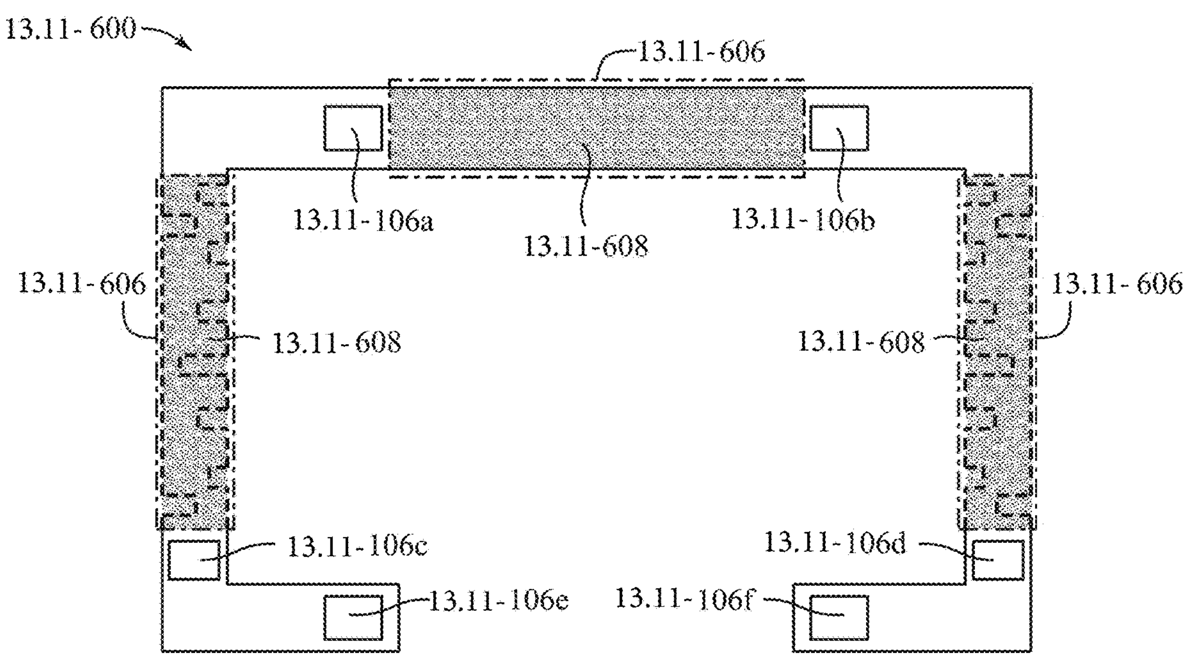
*FIG. 13.11-6B*

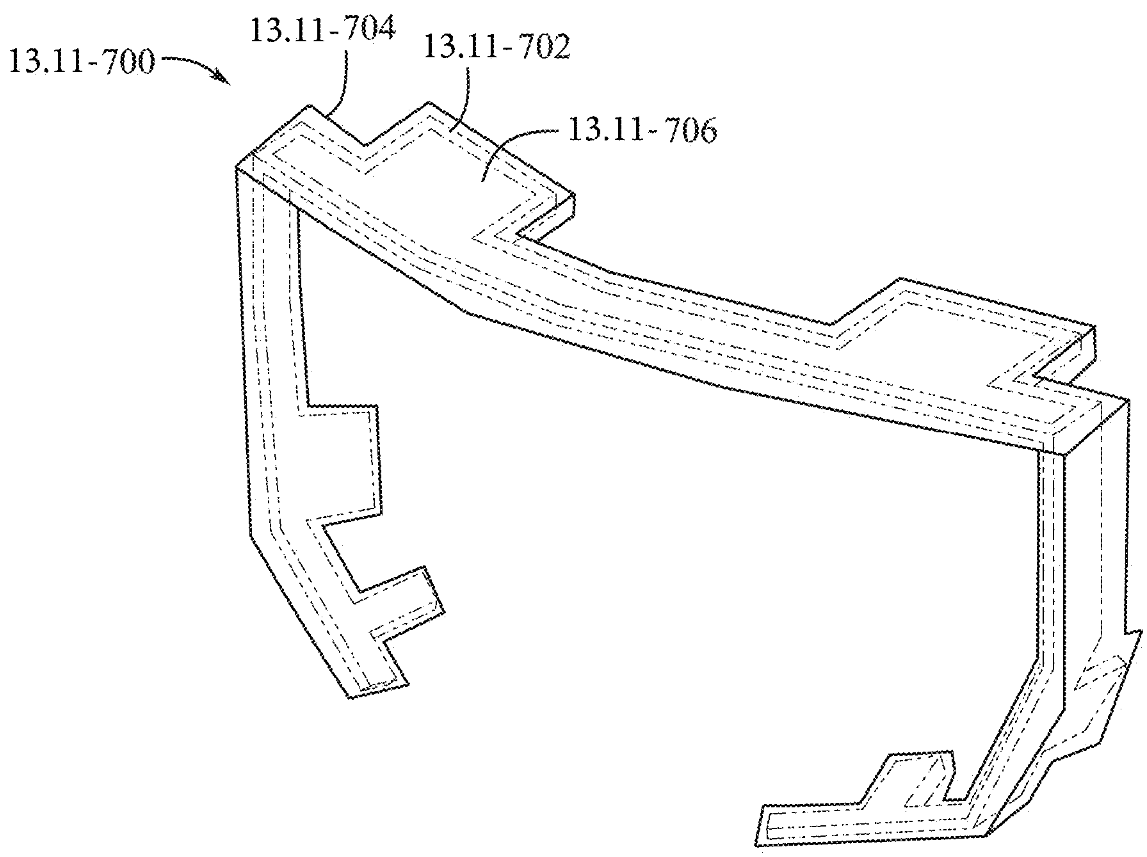
*FIG. 13.11-7A*

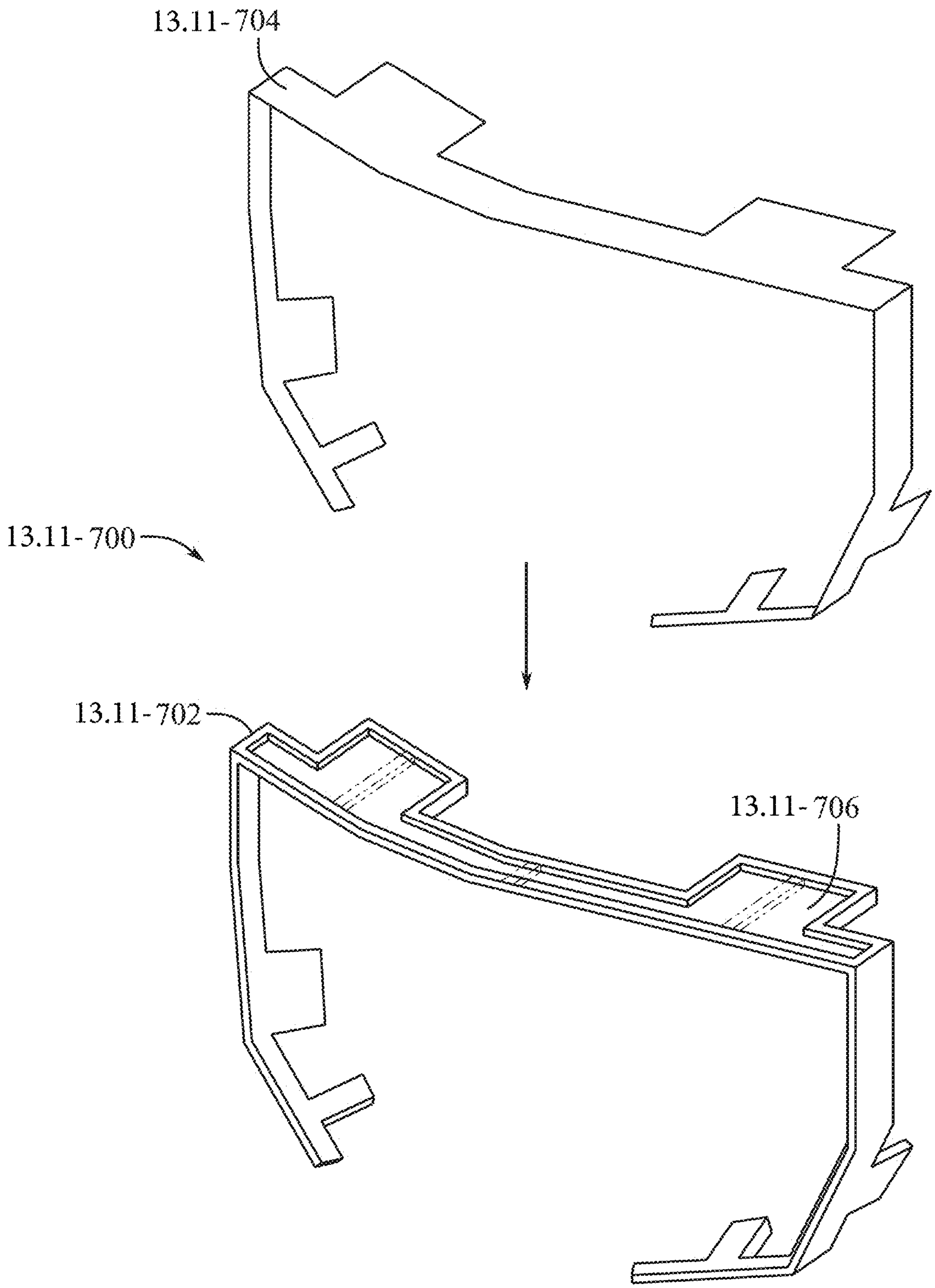
FIG. 13.11-7B

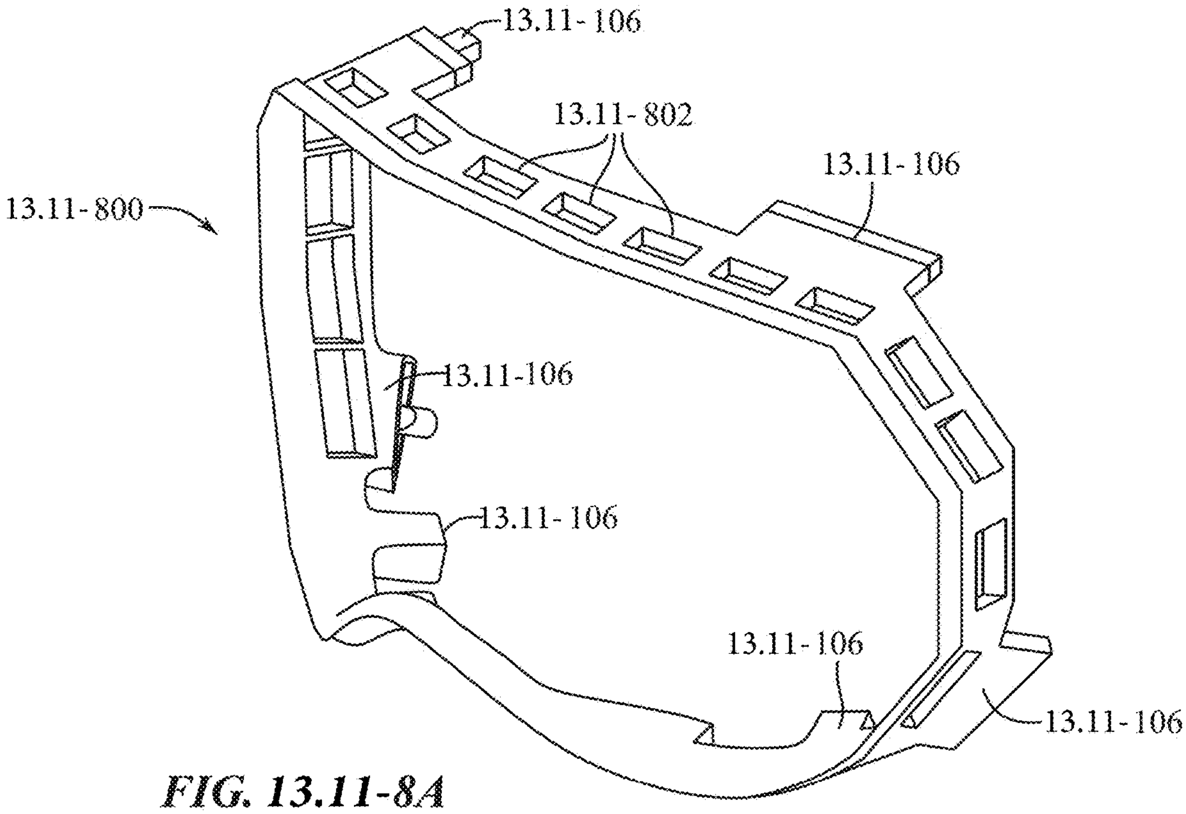
*FIG. 13.11-8A*
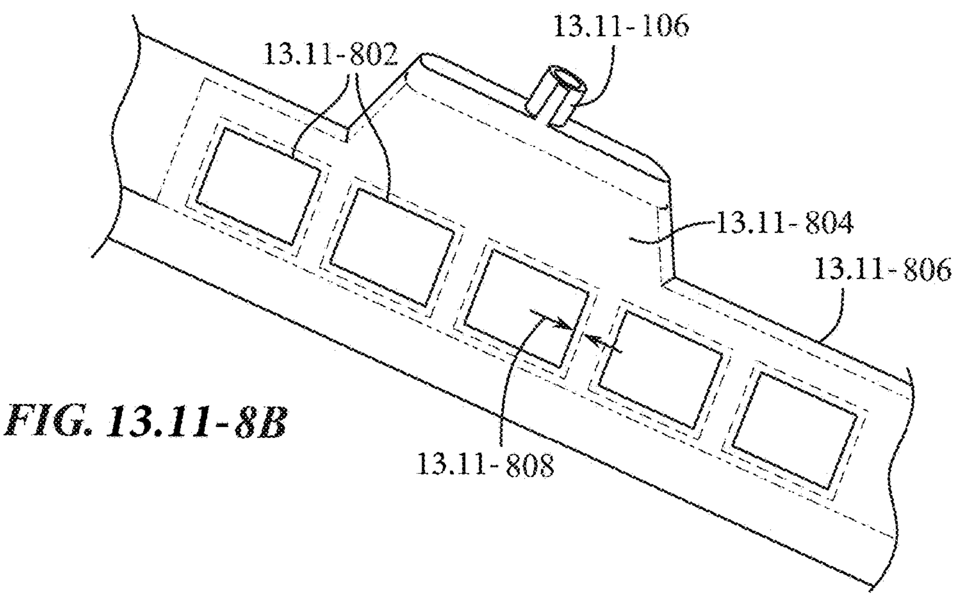
*FIG. 13.11-8B*

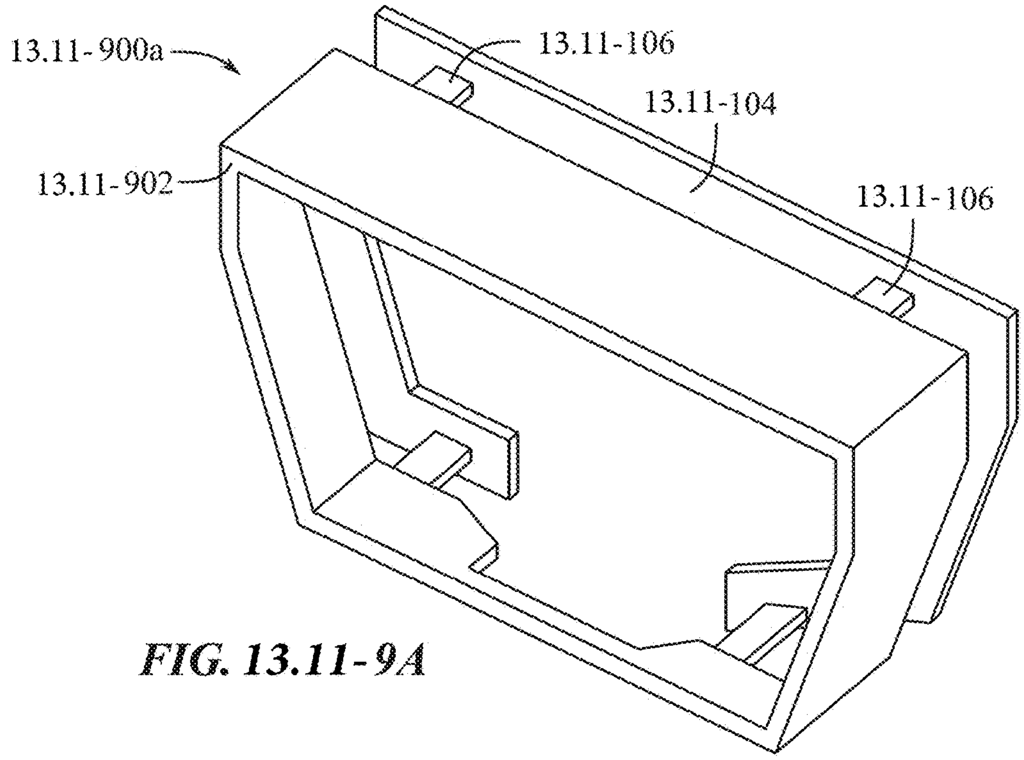
FIG. 13.11-9A
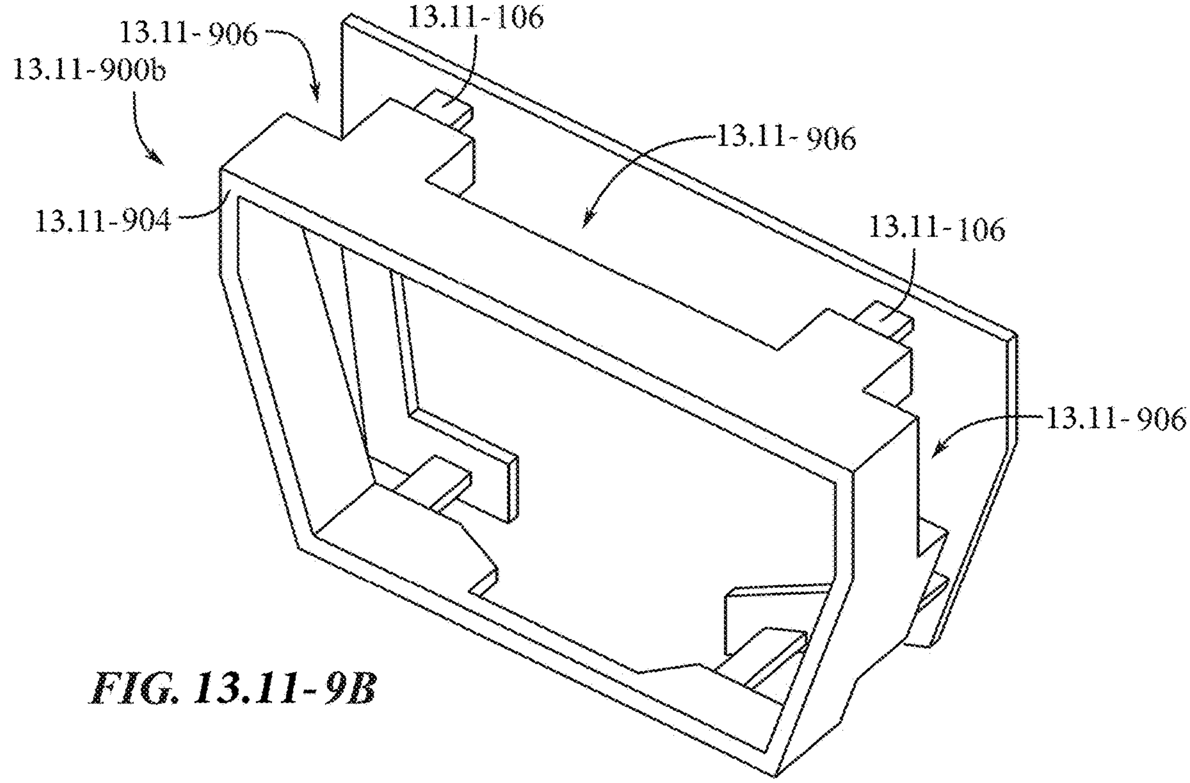
FIG. 13.11-9B

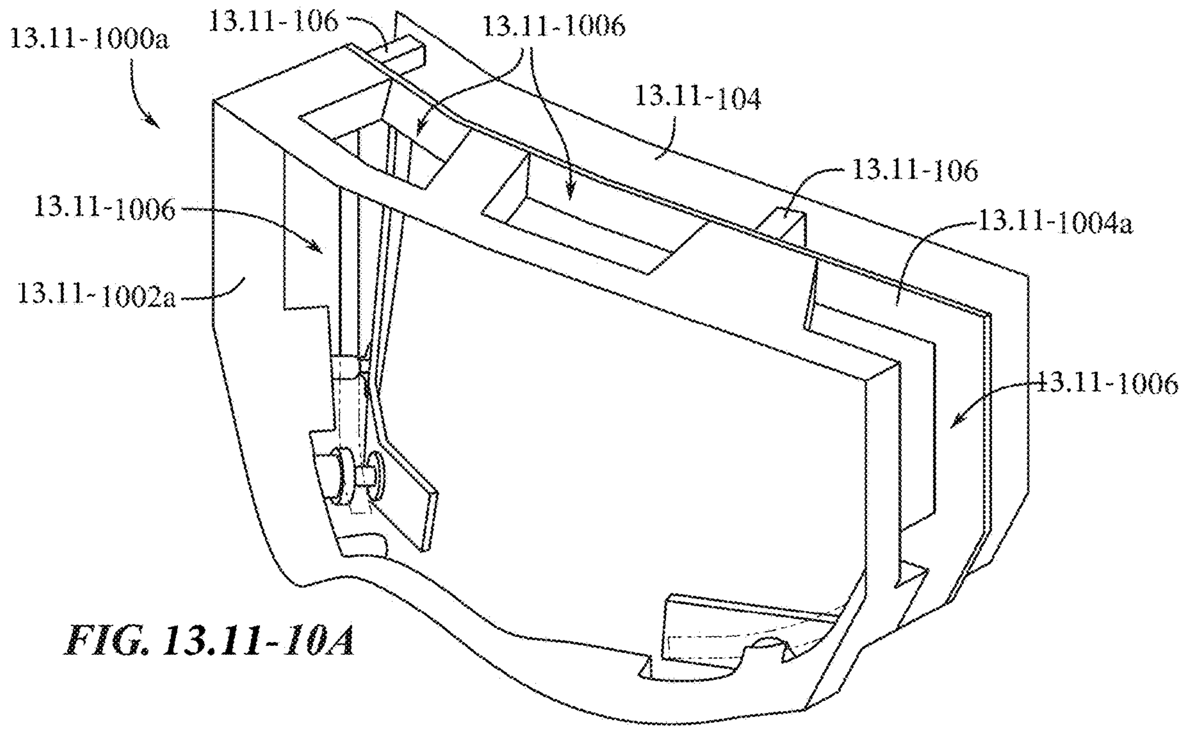
FIG. 13.11-10A
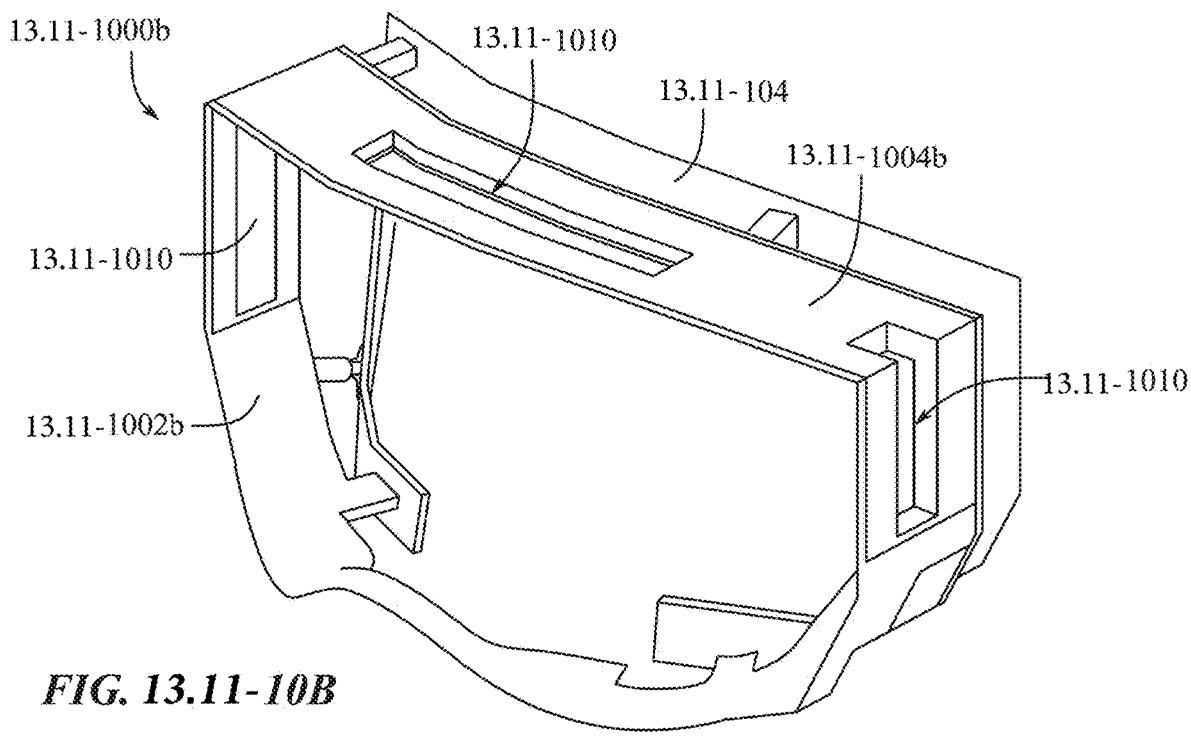
FIG. 13.11-10B

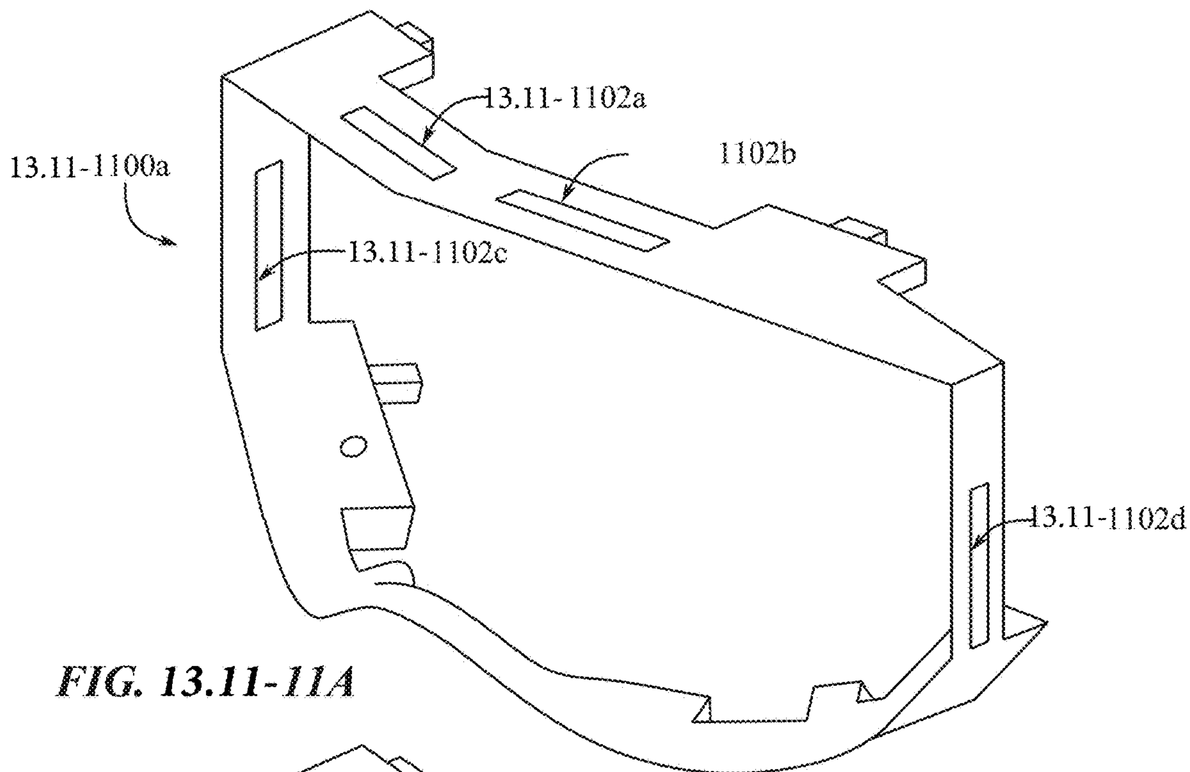
FIG. 13.11-11A
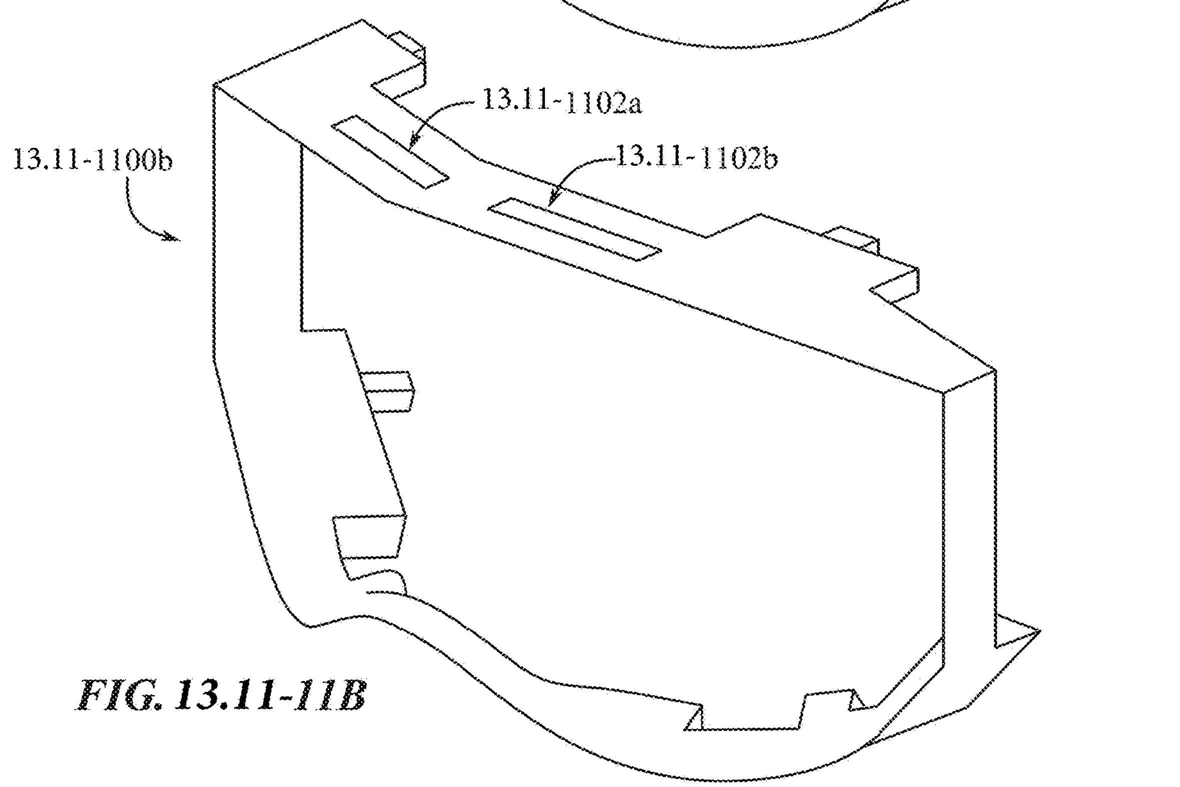
FIG. 13.11-11B

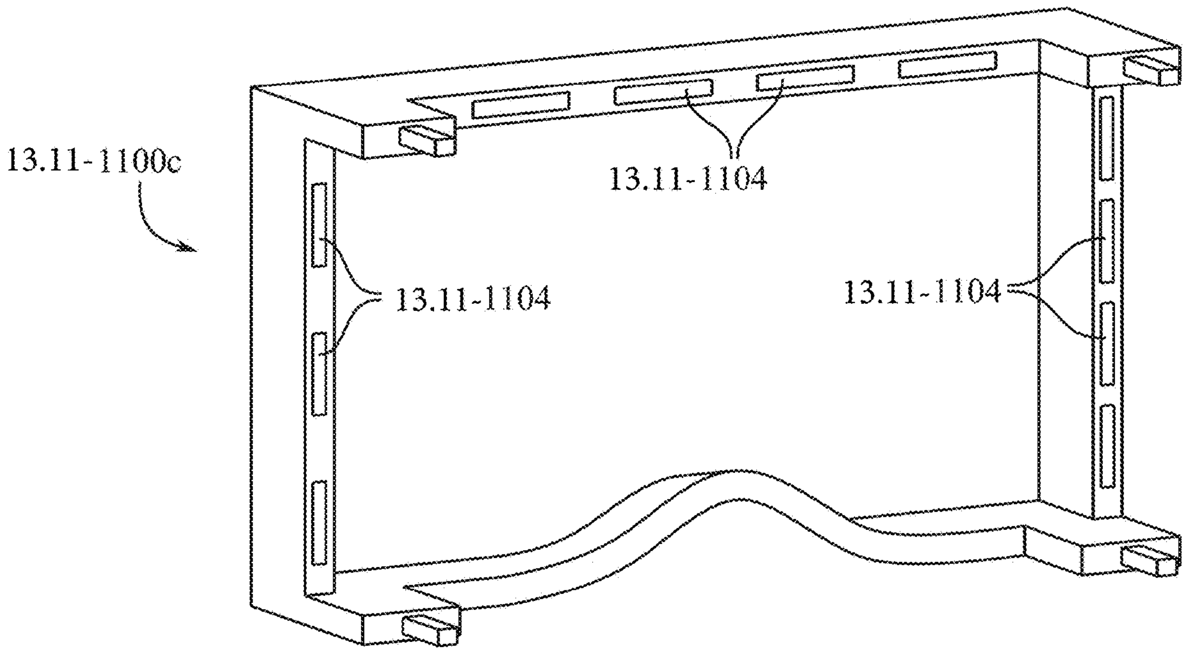
FIG. 13.11-11C
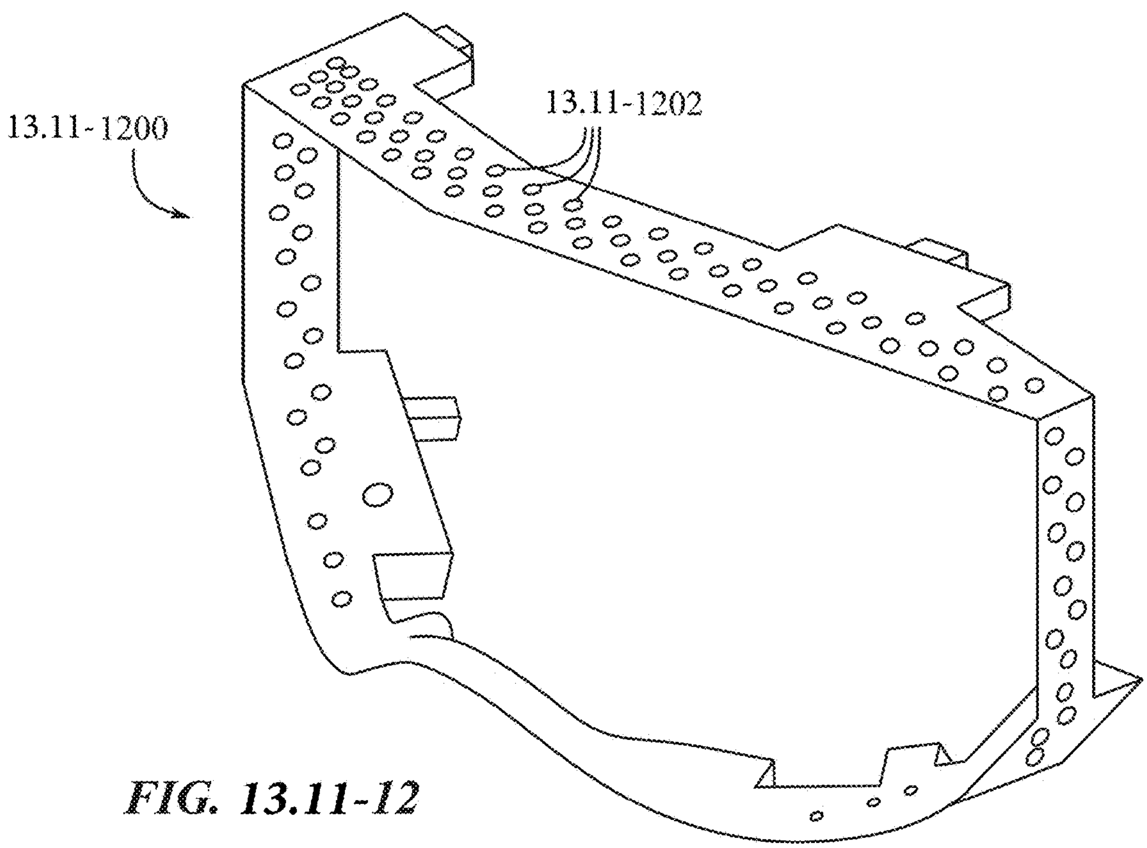
FIG. 13.11-12

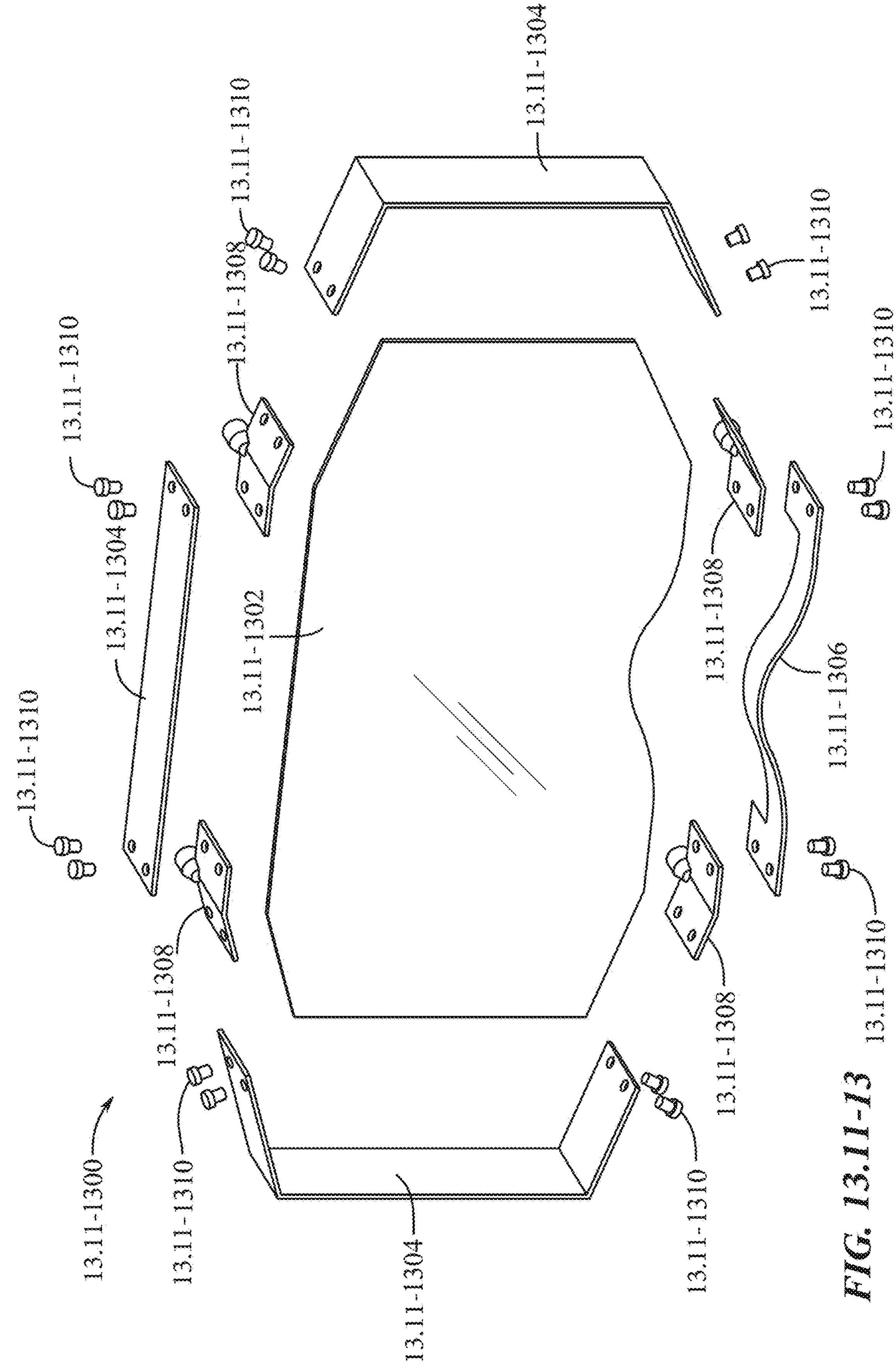
*FIG. 13.11-13*

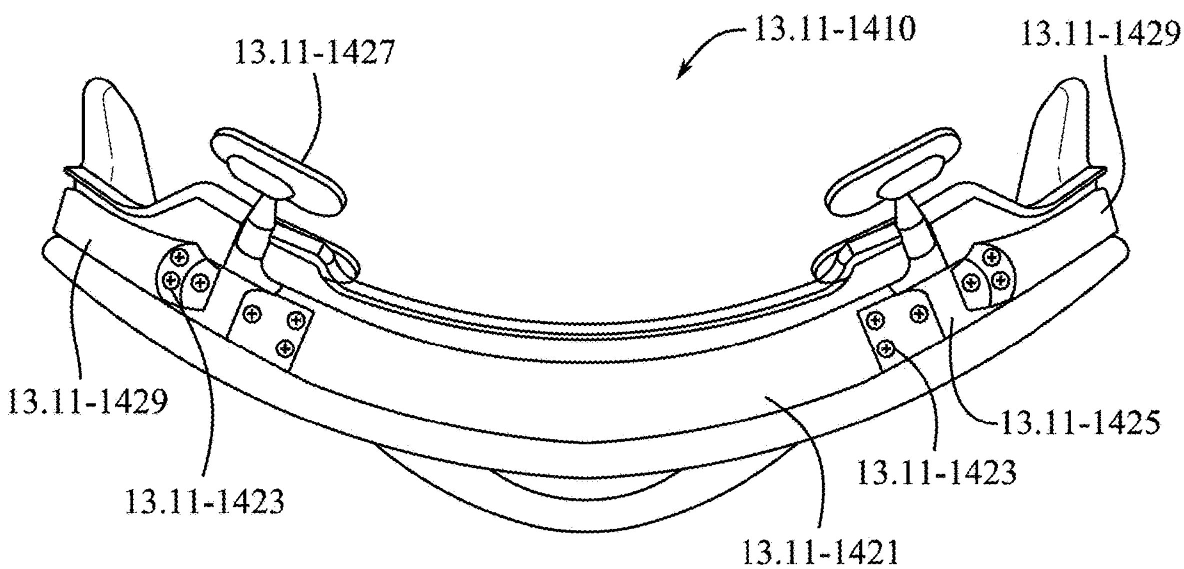
*FIG. 13.11-14A*

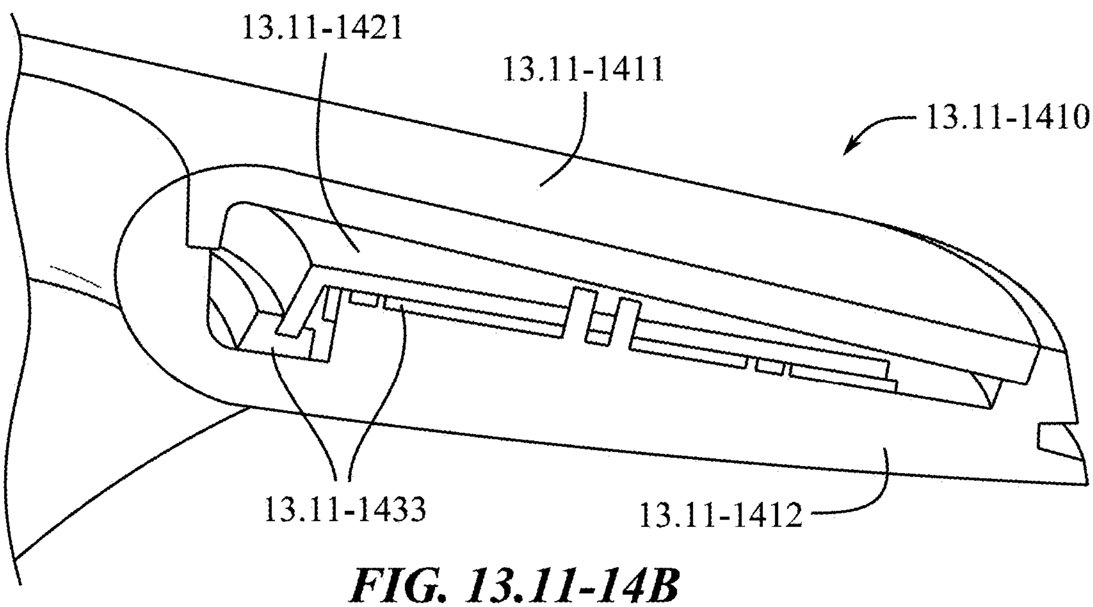
*FIG. 13.11-14B*

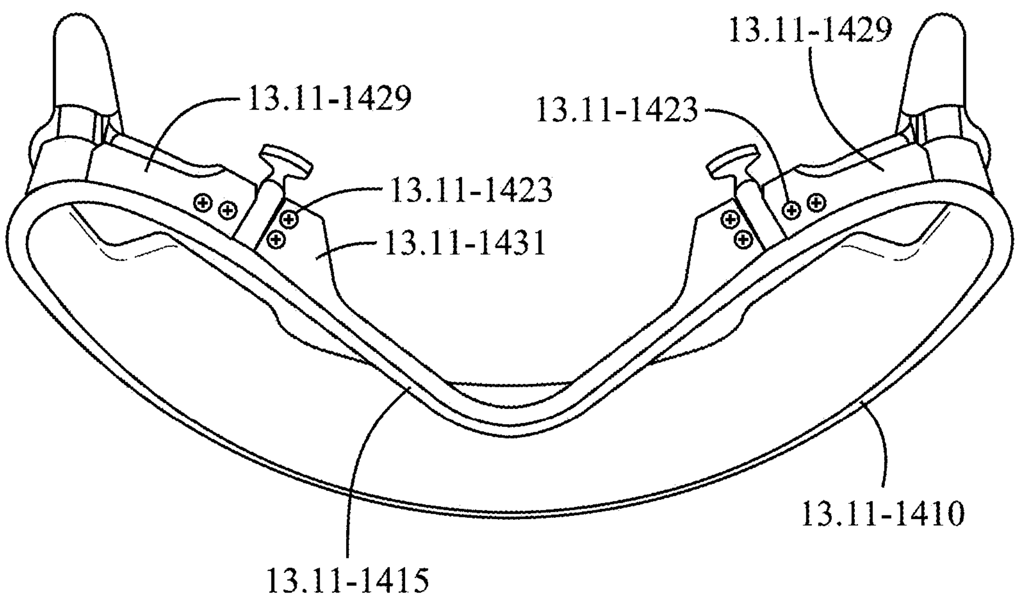
*FIG. 13.11-14C*

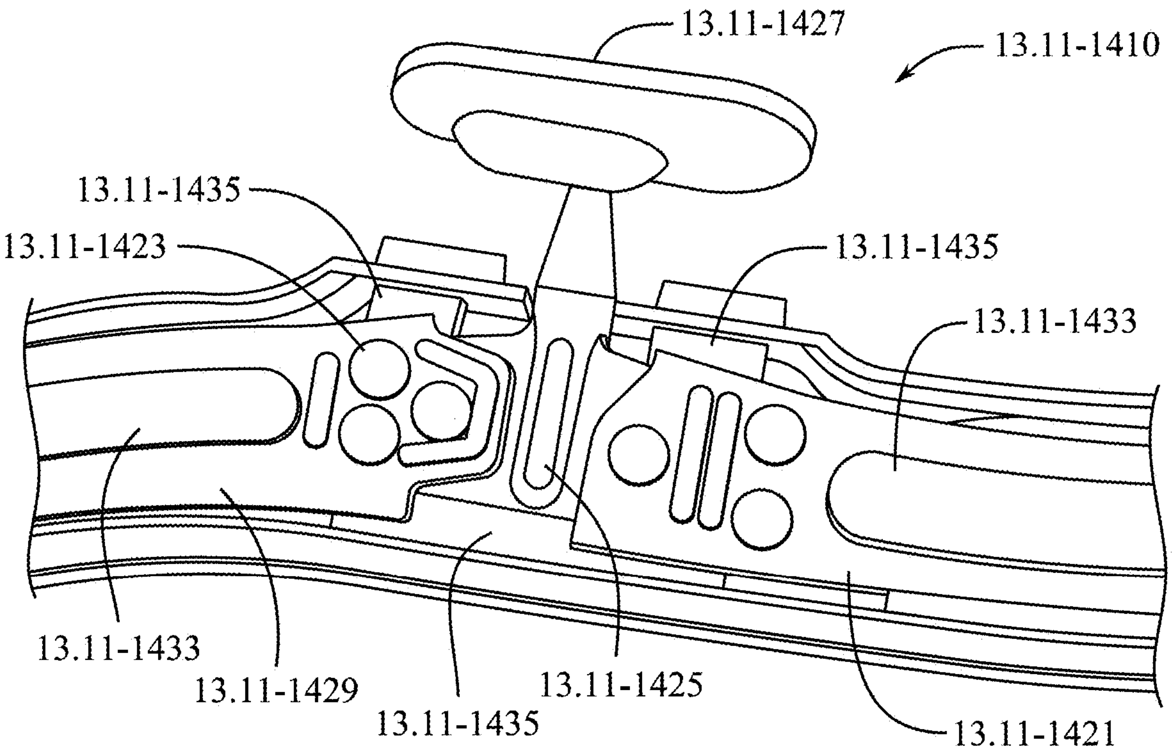
*FIG. 13.11-14D*

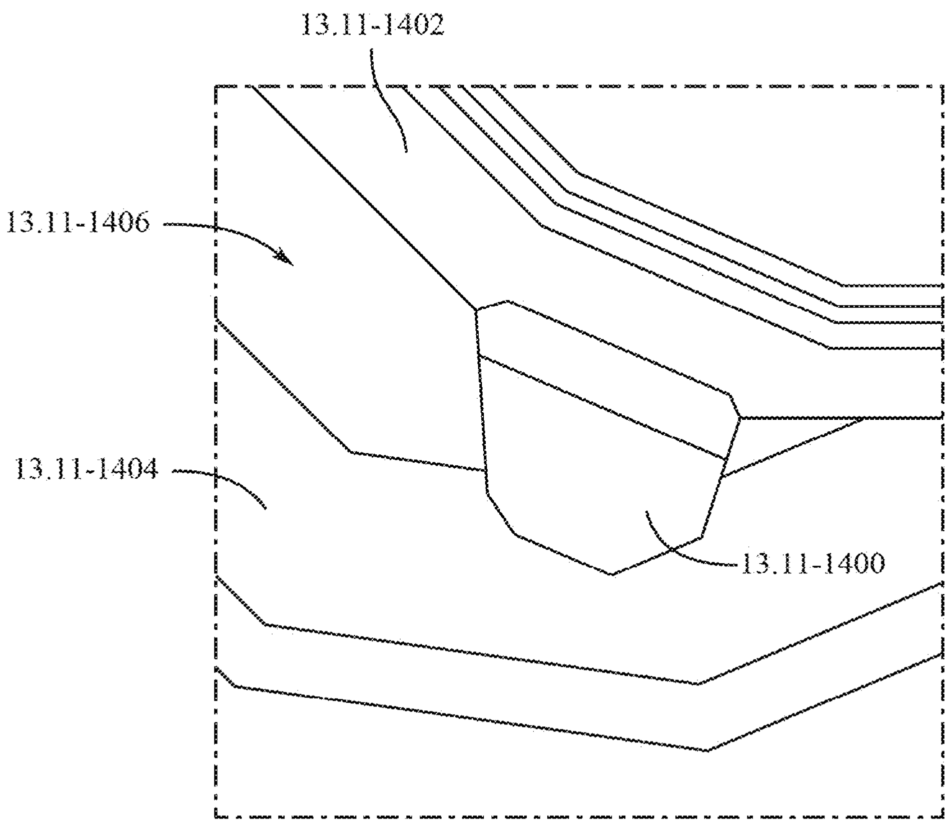
*FIG. 13.11-14*

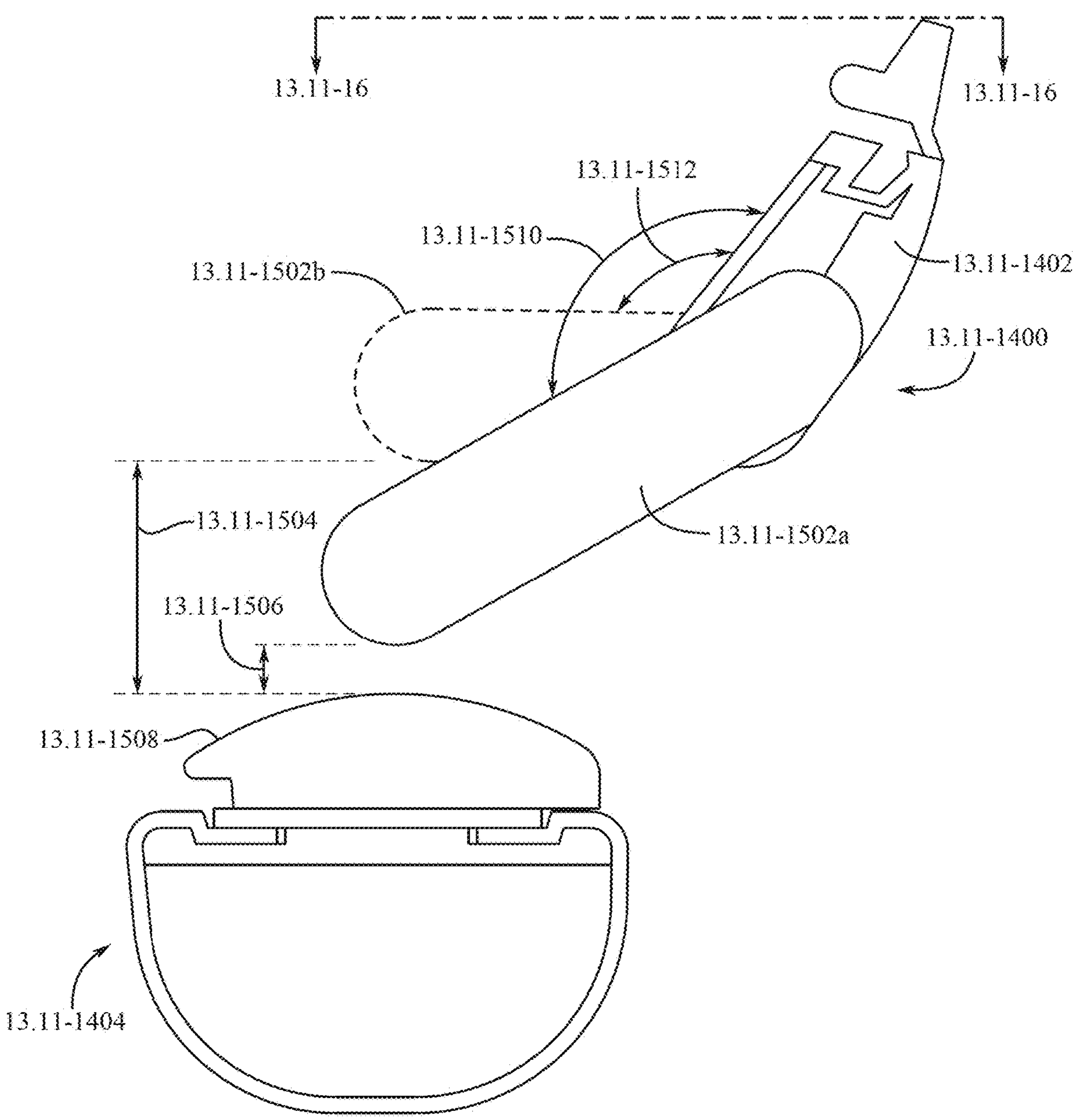
*FIG. 13.11-15A*

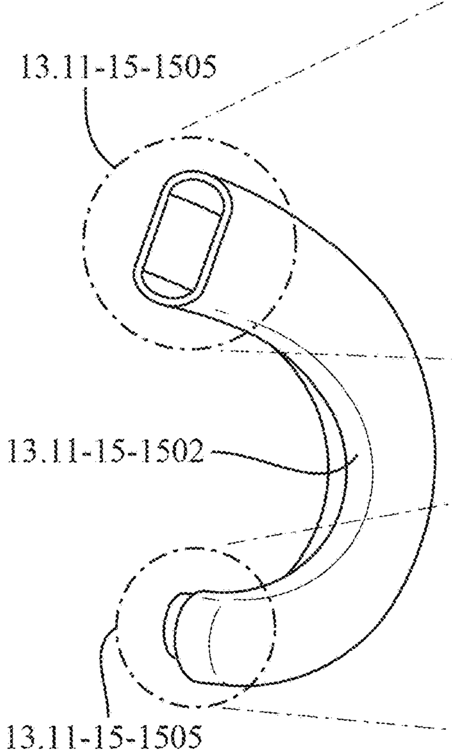
FIG. 13.11-15B
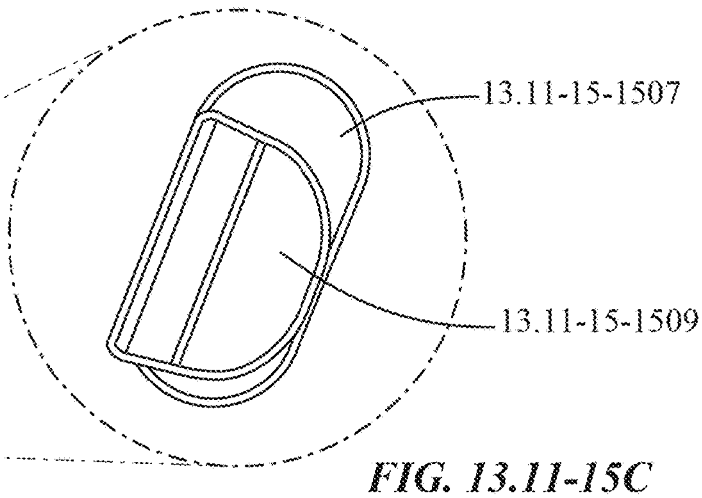
FIG. 13.11-15C
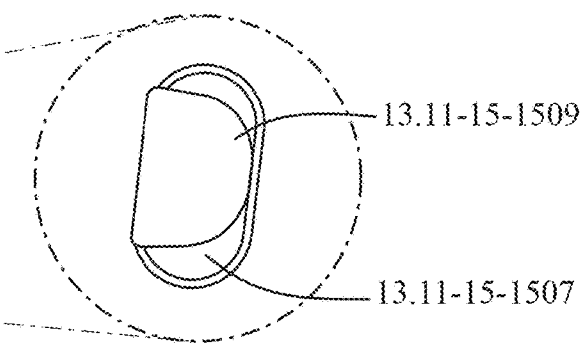
FIG. 13.11-15D

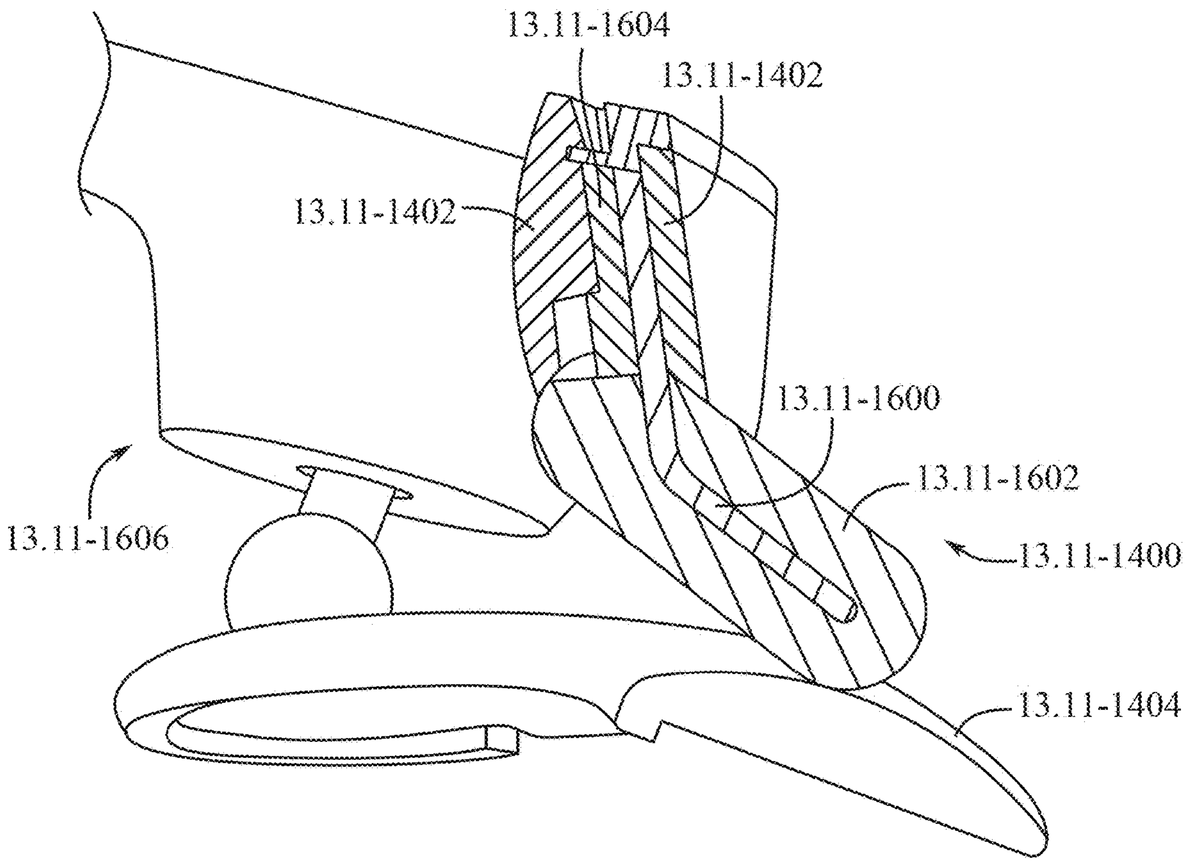
*FIG. 13.11-16*

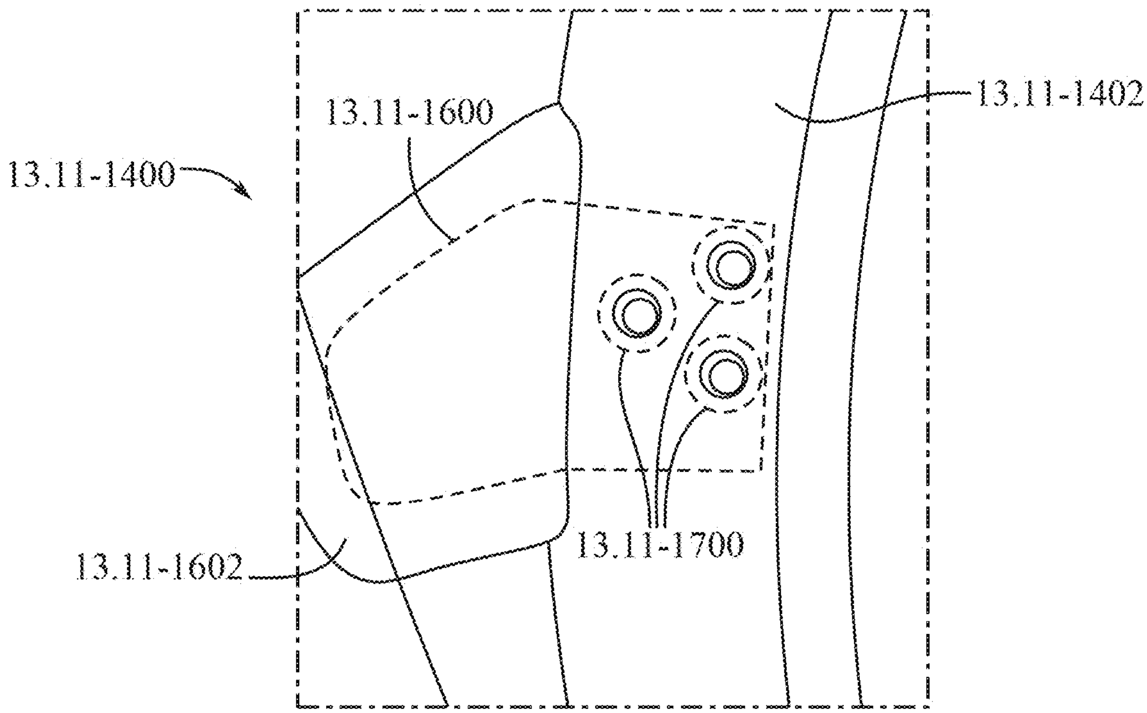
*FIG. 13.11-17*
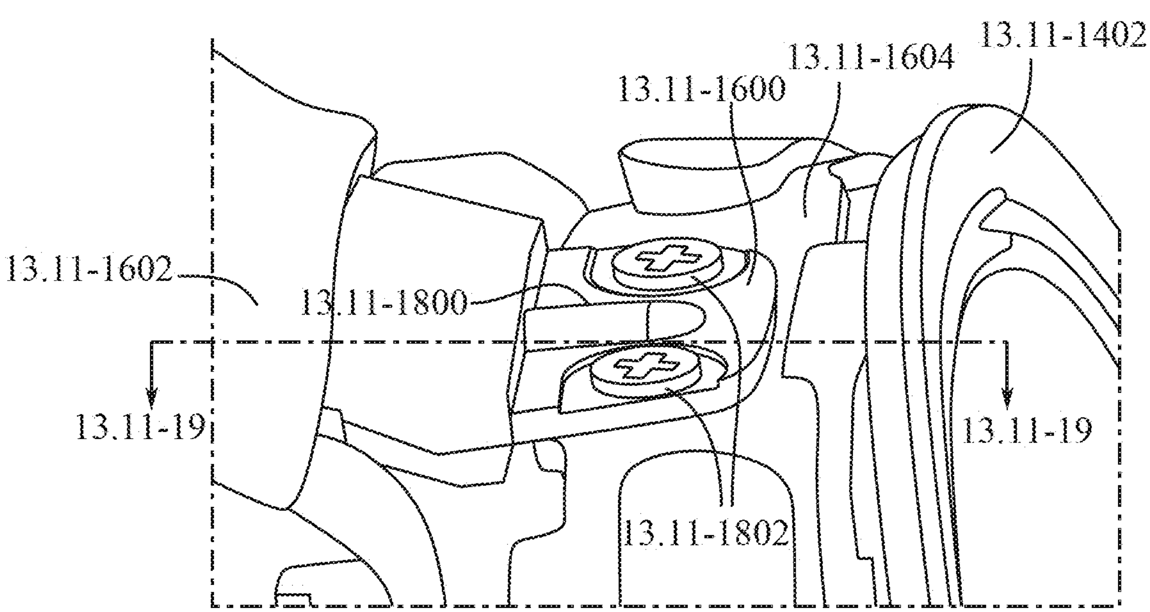
*FIG. 13.11-18*

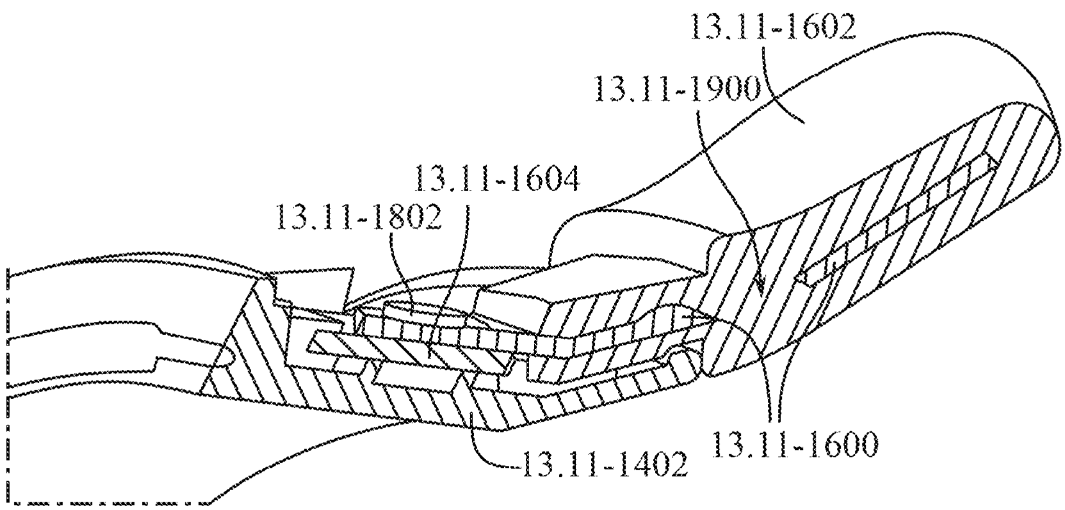
*FIG. 13.11-19*

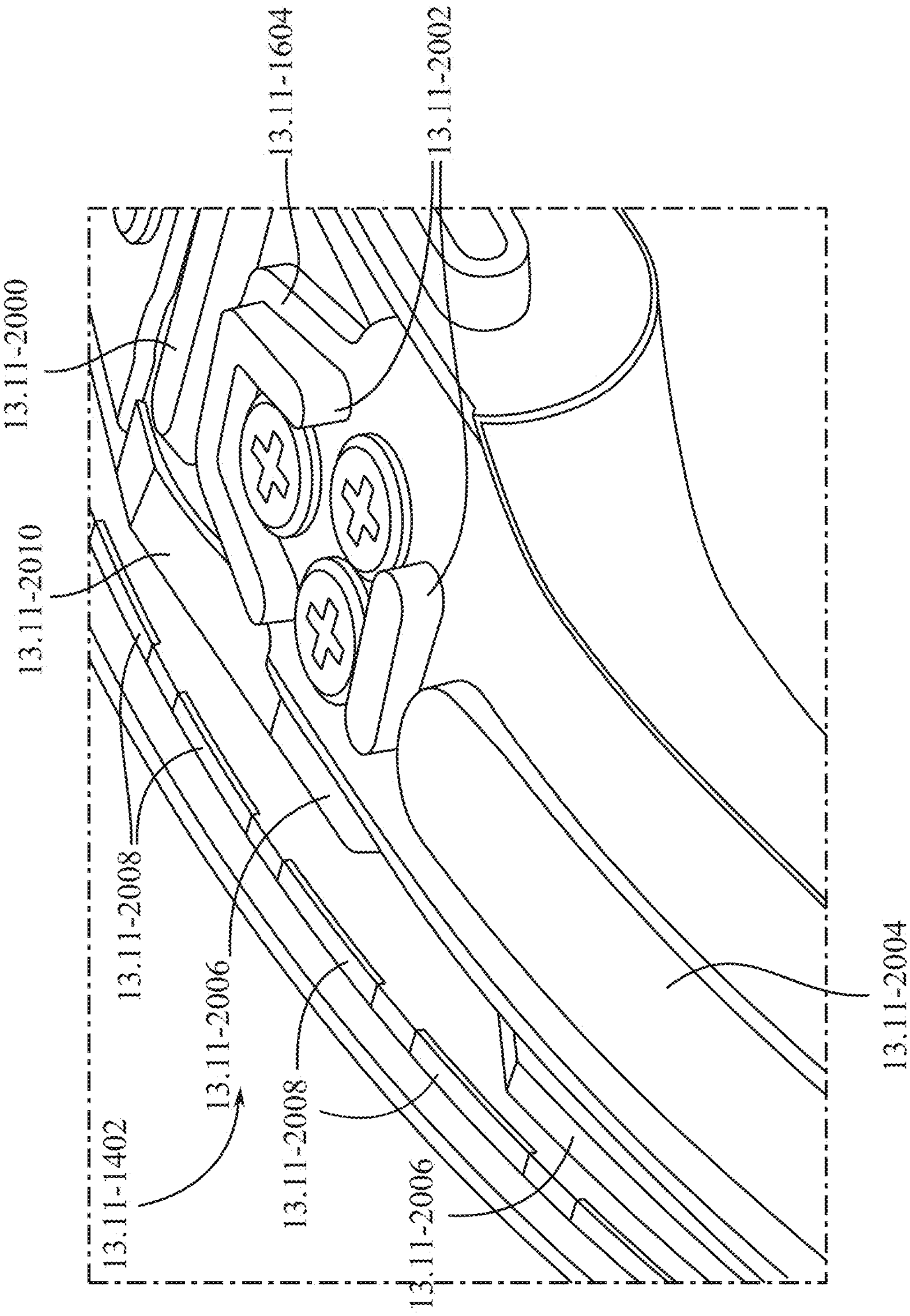
*FIG. 13.11-20*

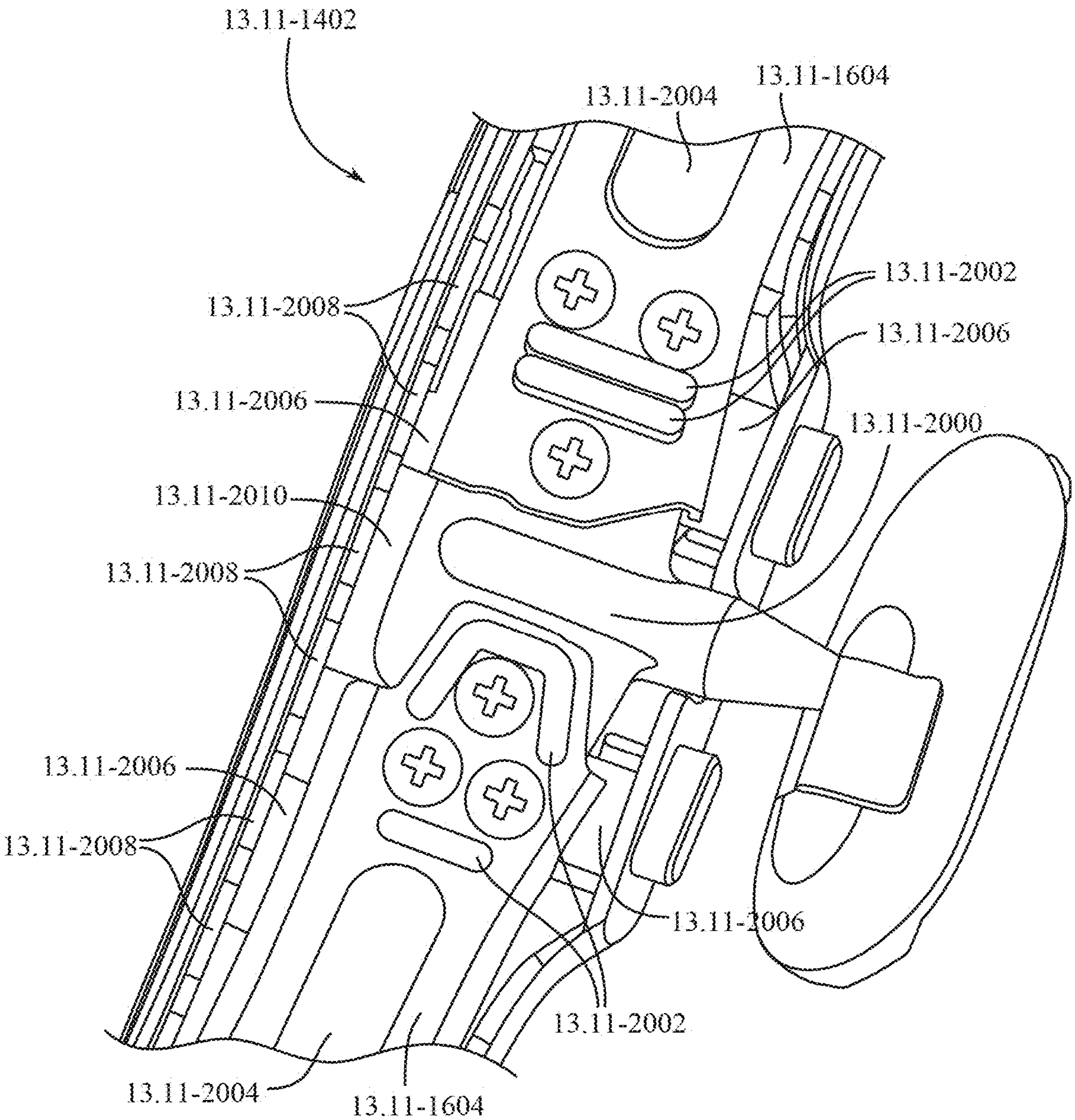
*FIG. 13.11-21*

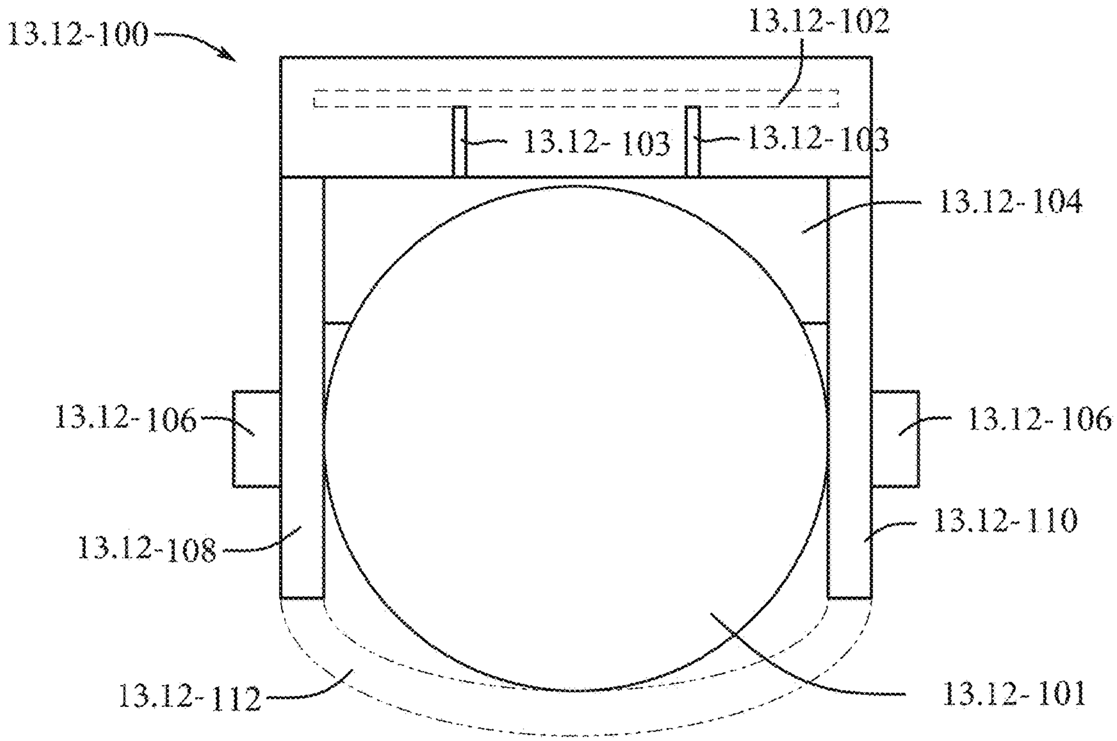
*FIG. 13.12-1*
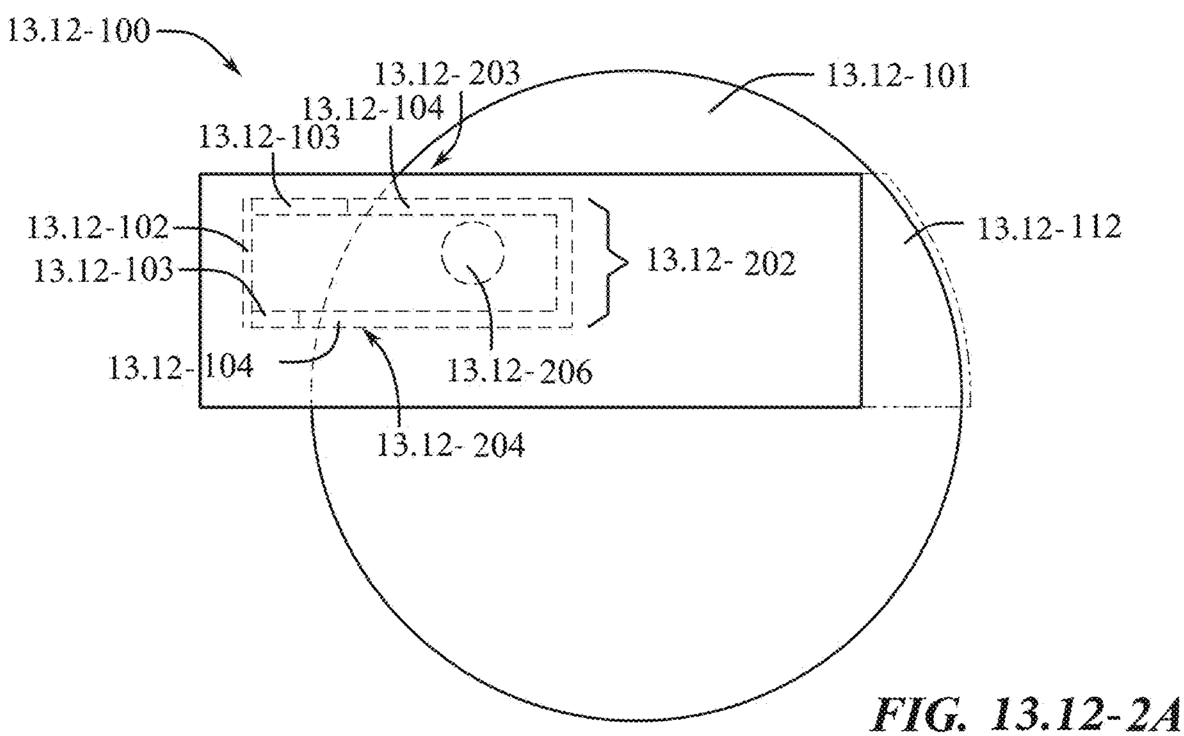
*FIG. 13.12-2A*

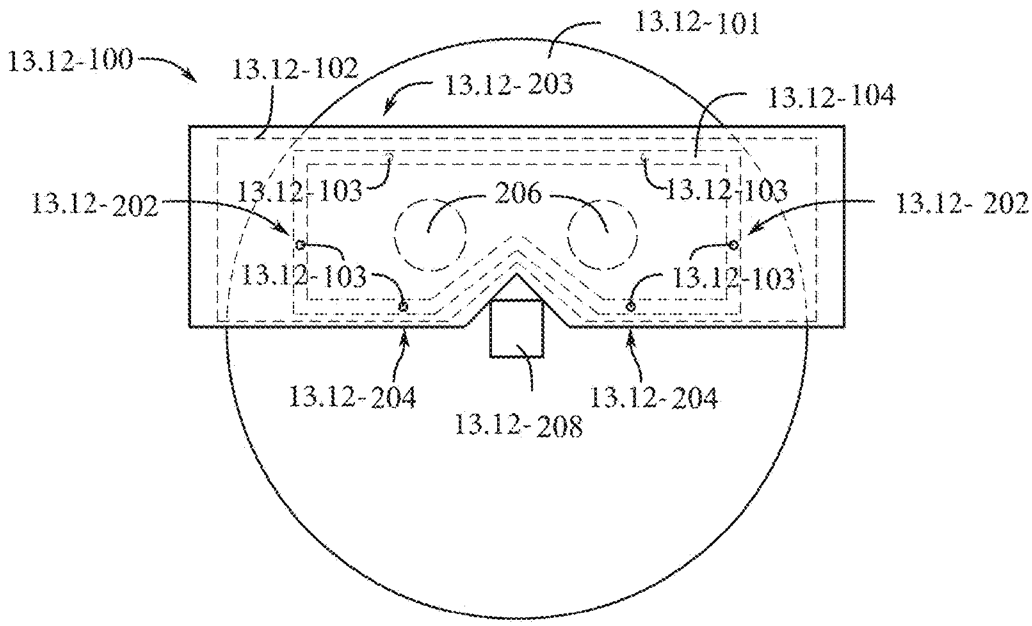
FIG. 13.12-2B
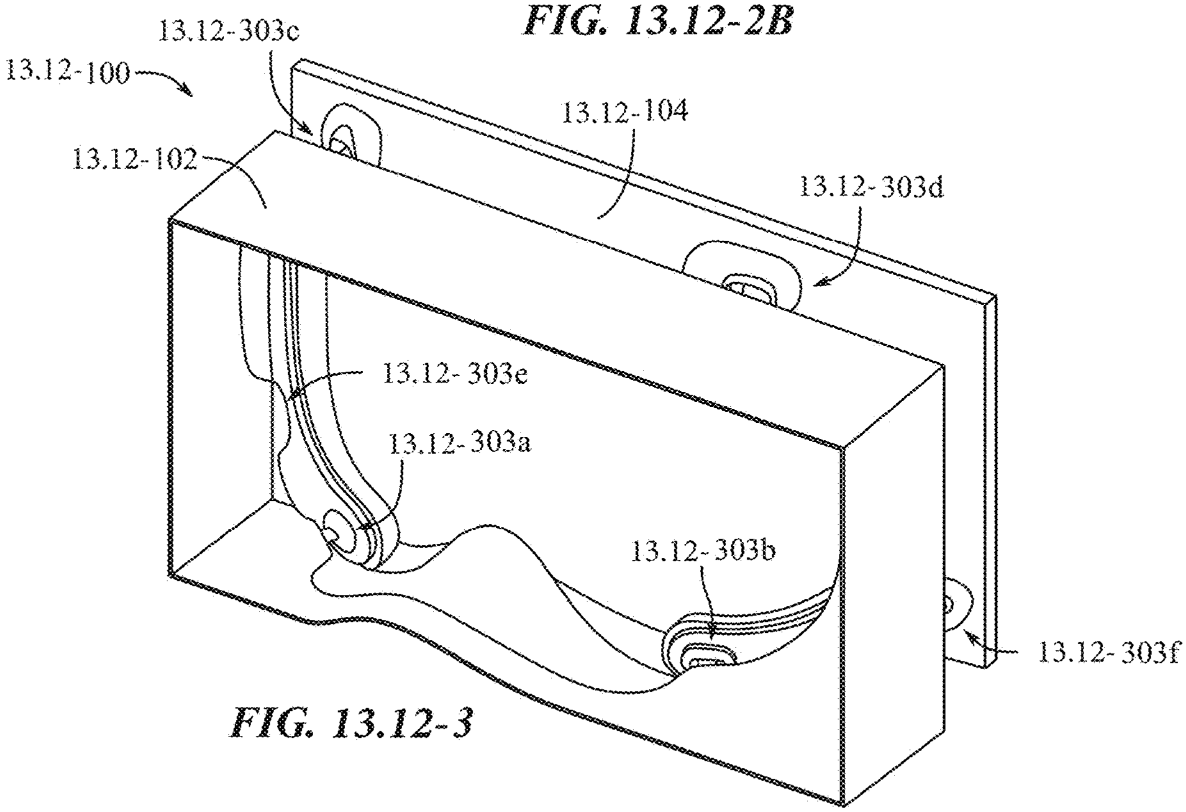
FIG. 13.12-3

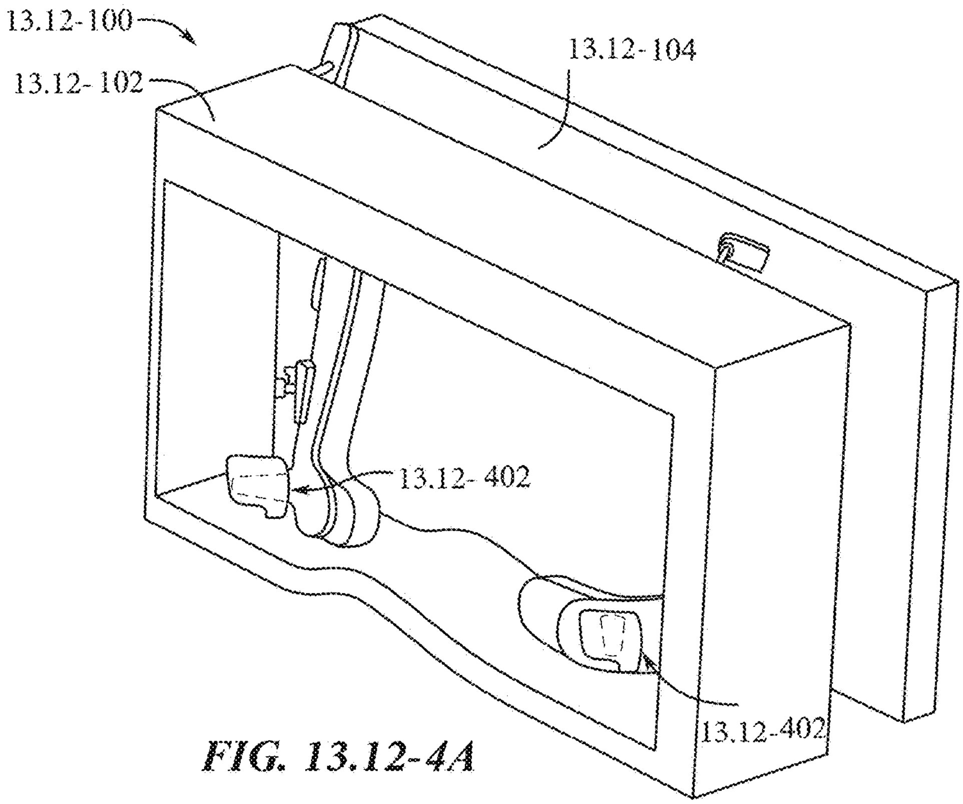
FIG. 13.12-4A
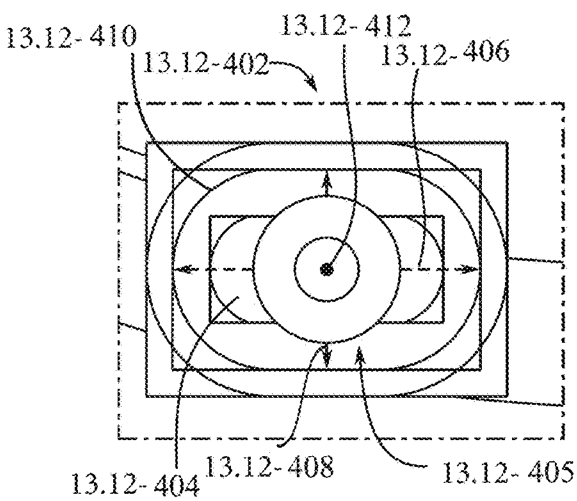
FIG. 13.12-4B
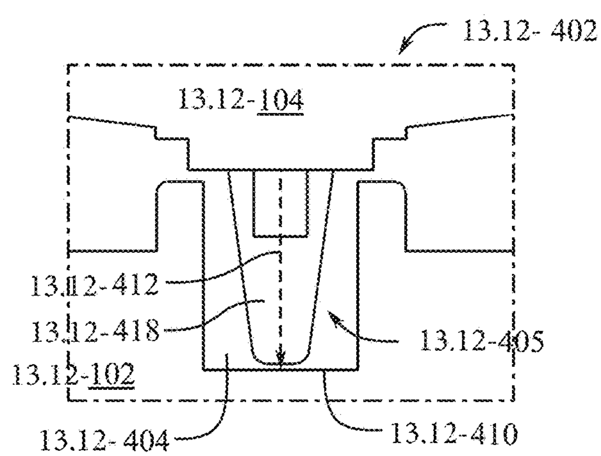
FIG. 13.12-4C

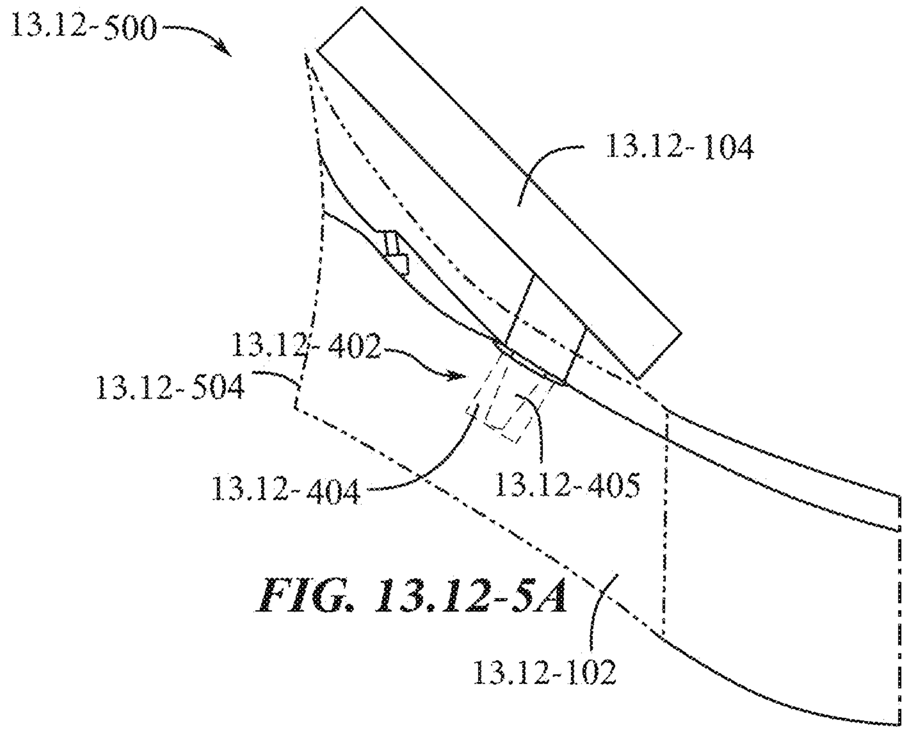
FIG. 13.12-5A
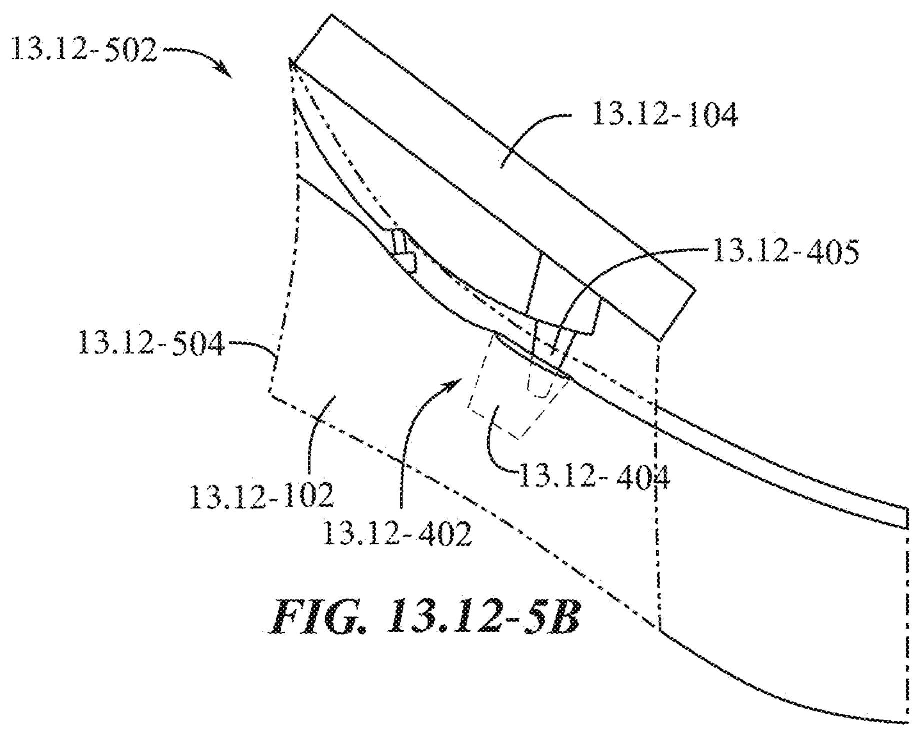
FIG. 13.12-5B

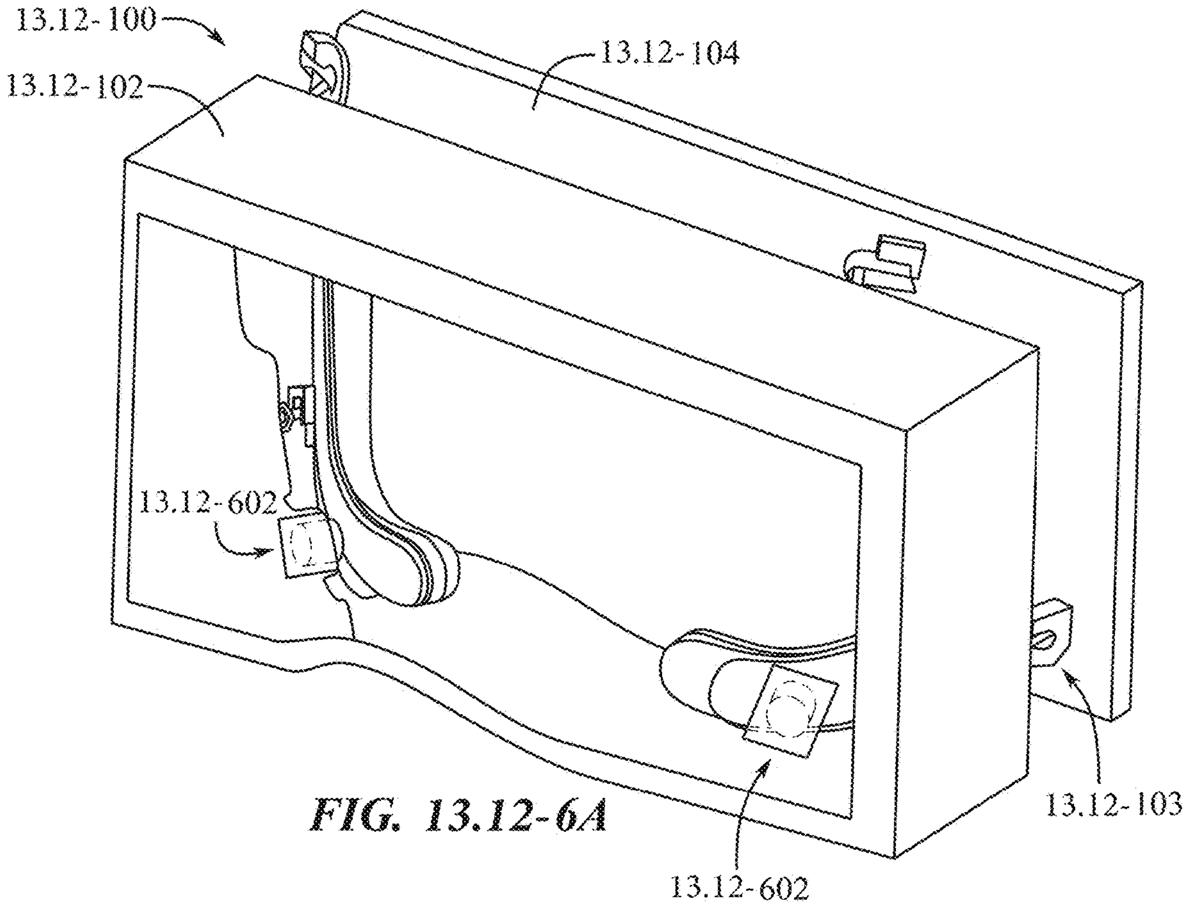
*FIG. 13.12-6A*
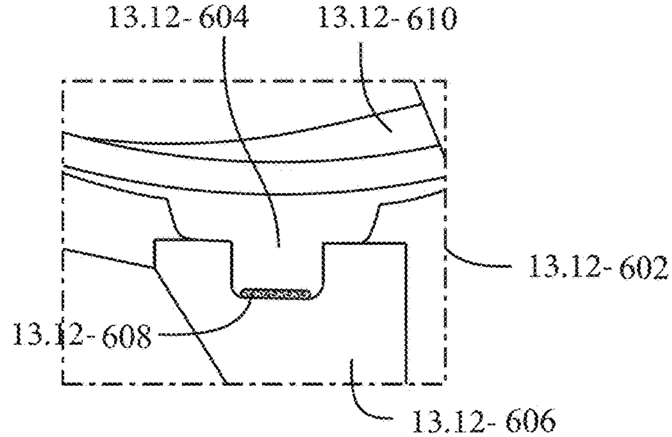
*FIG. 13.12-6B*

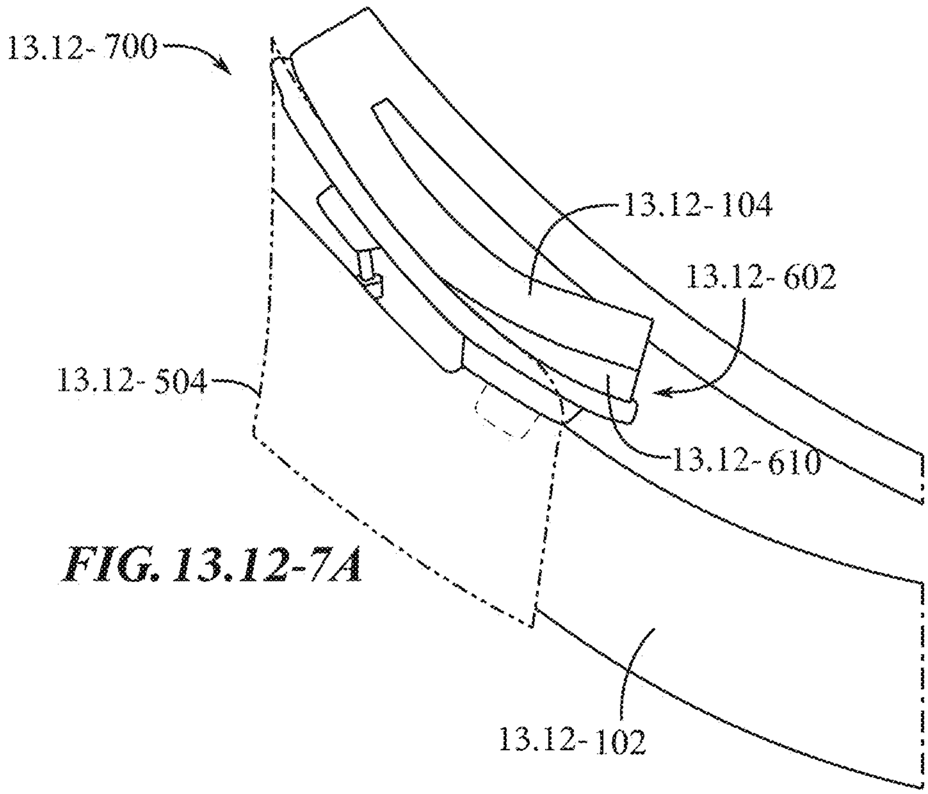
FIG. 13.12-7A
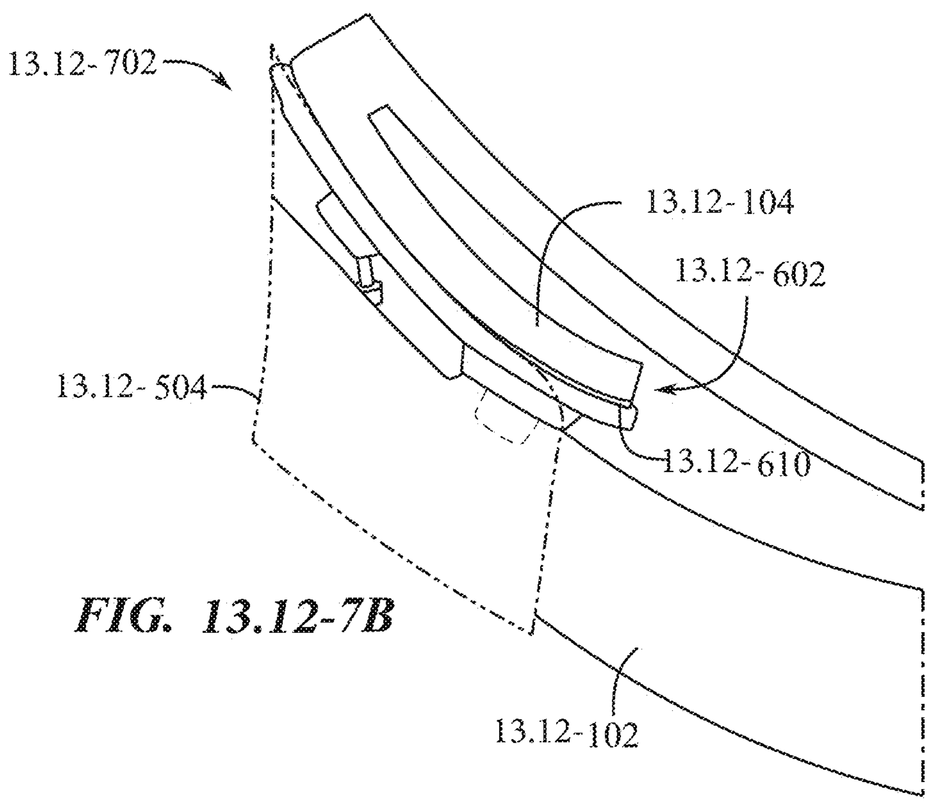
FIG. 13.12-7B

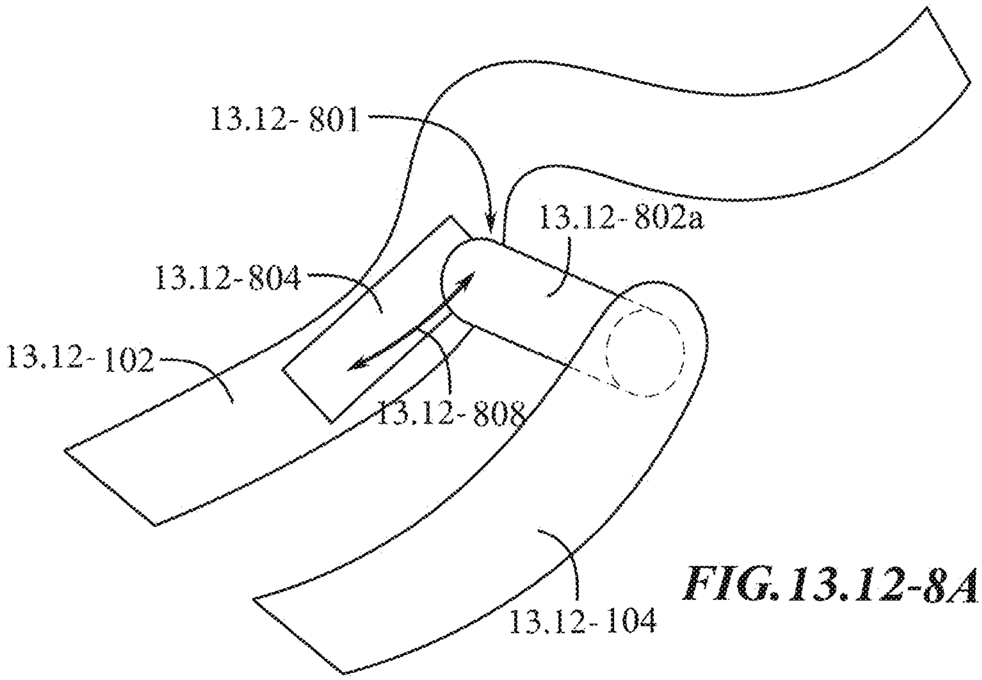
FIG.13.12-8A
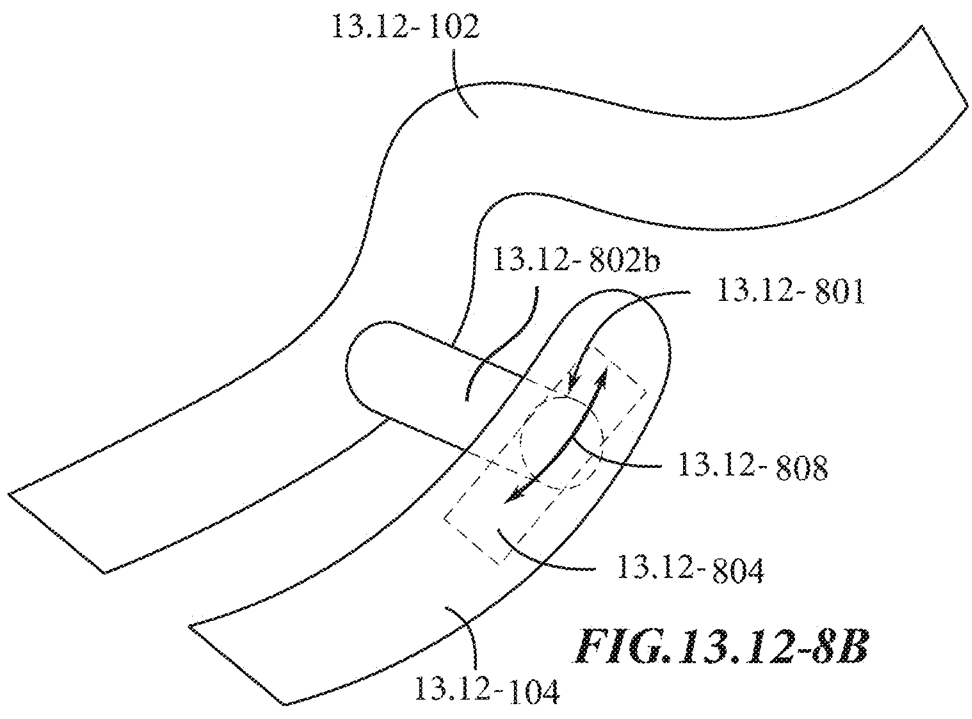
FIG.13.12-8B

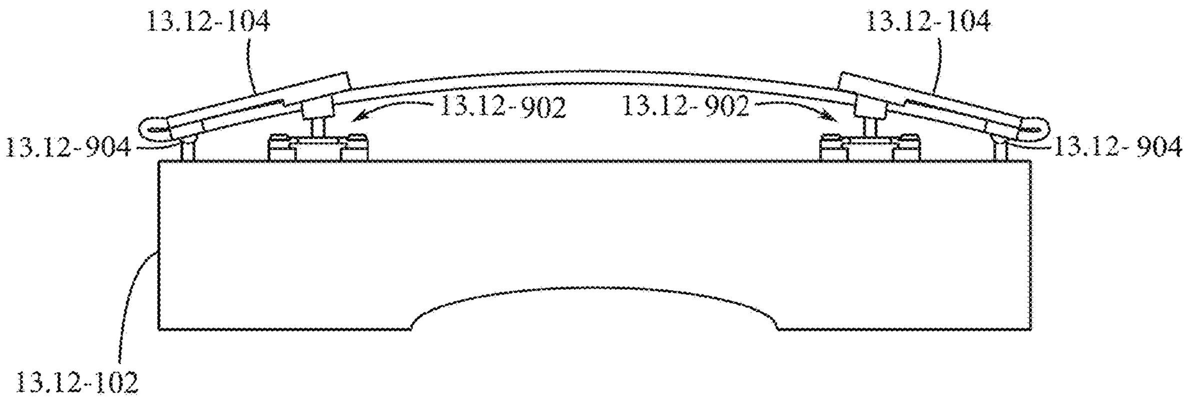
*FIG. 13.12-9A*
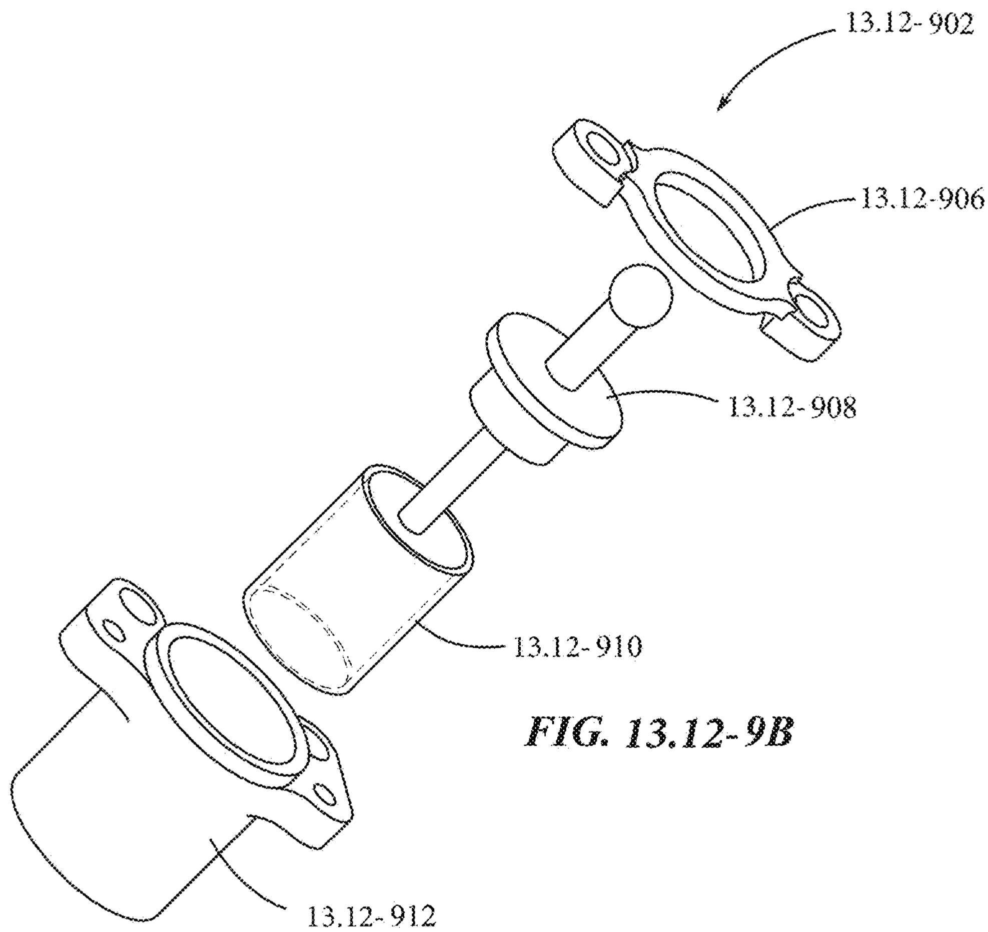
*FIG. 13.12-9B*

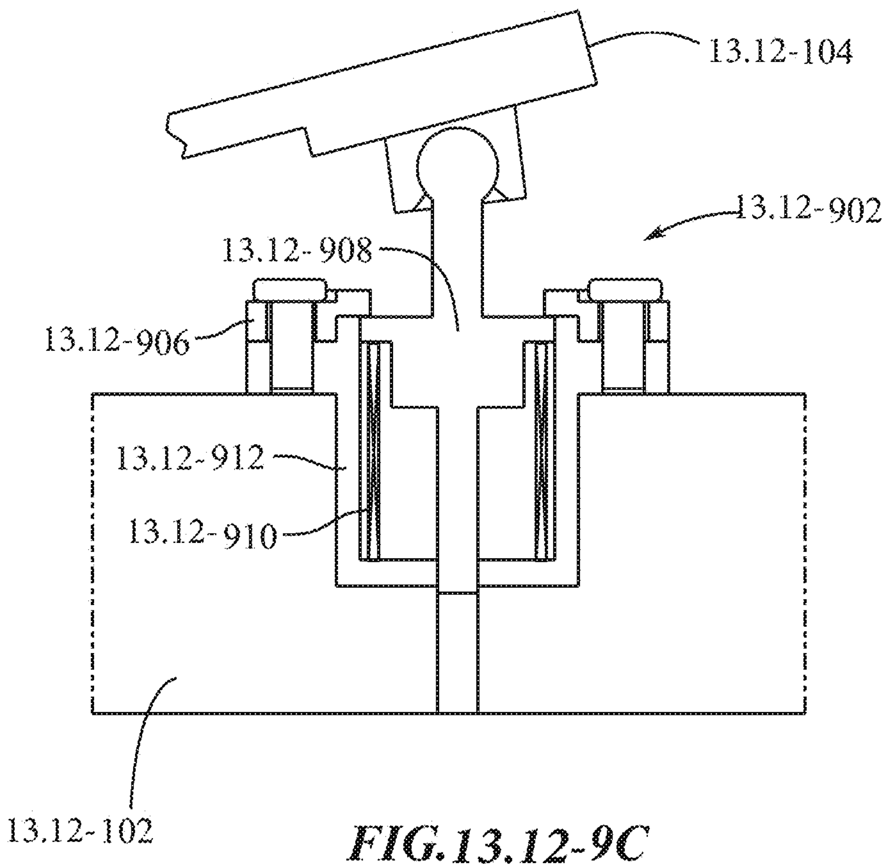
FIG.13.12-9C
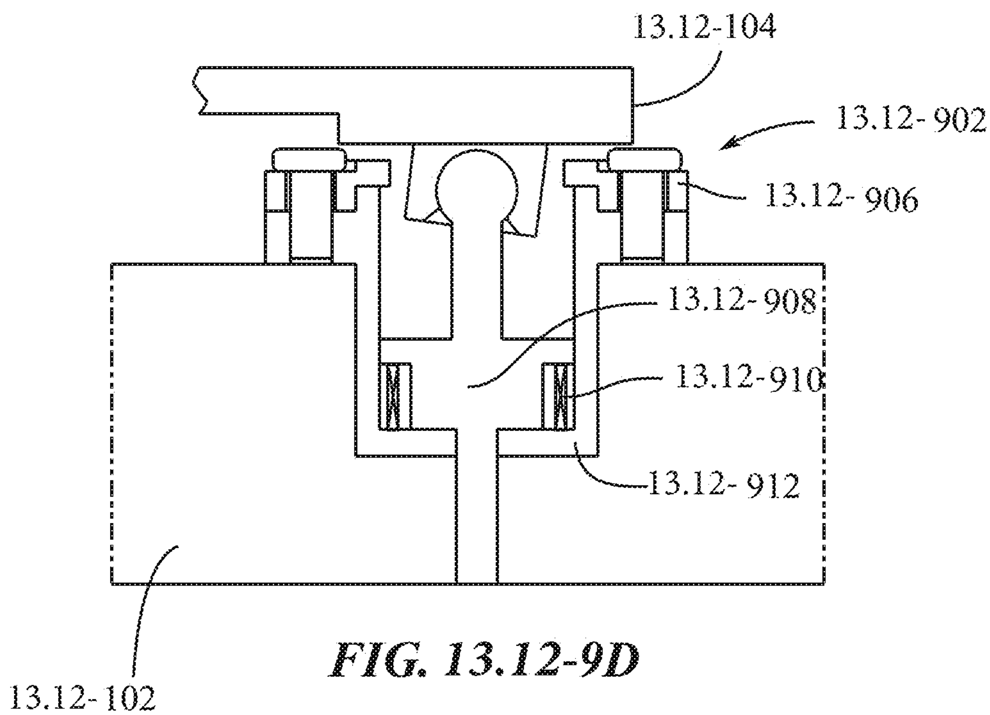
FIG. 13.12-9D

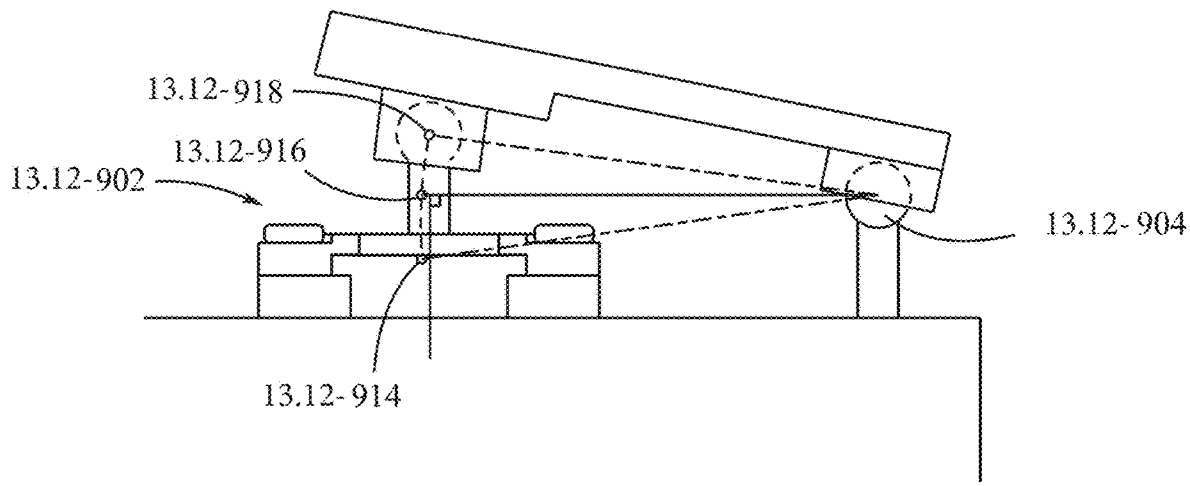
FIG. 13.12-9E
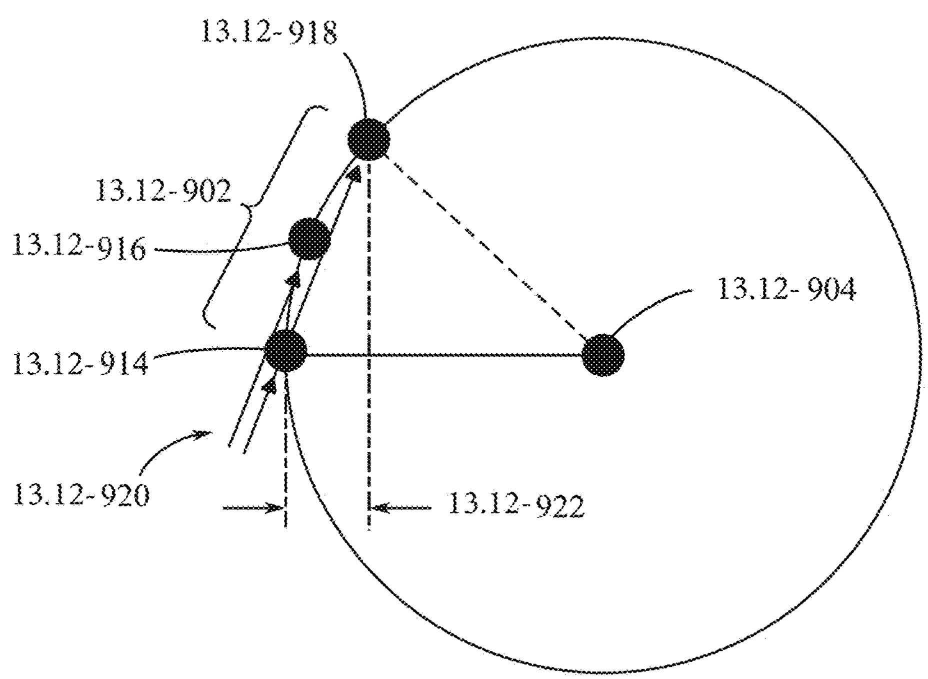
FIG. 13.12-9F

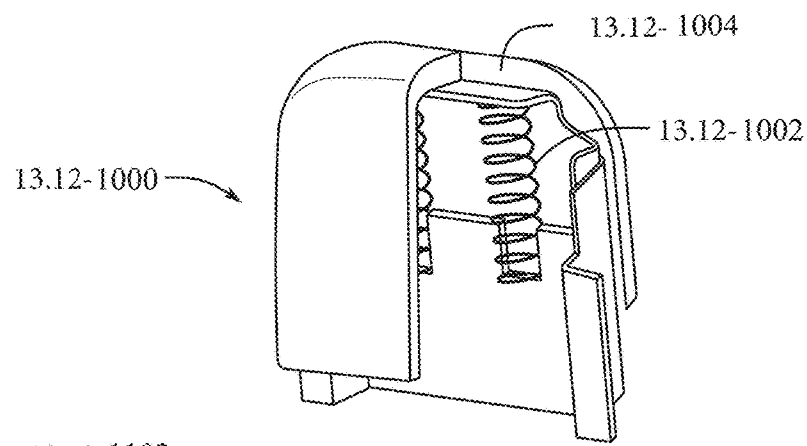
FIG. 13.12-10
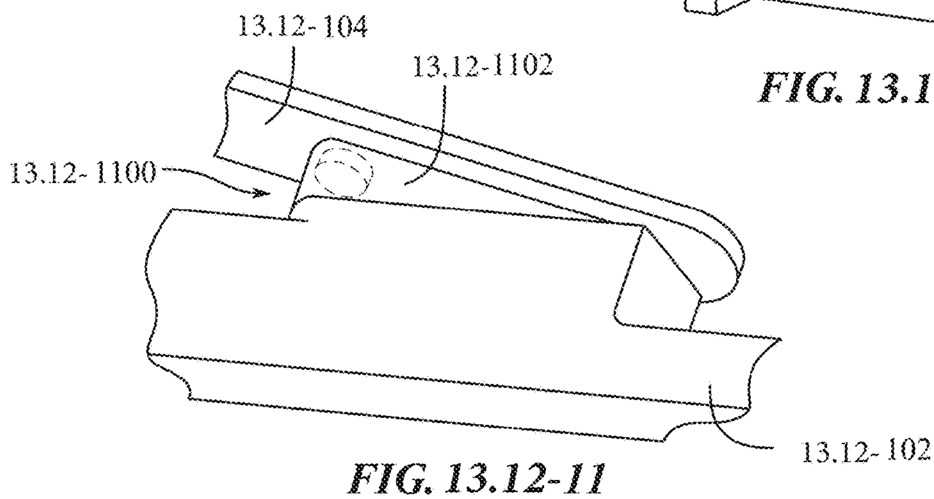
FIG. 13.12-11
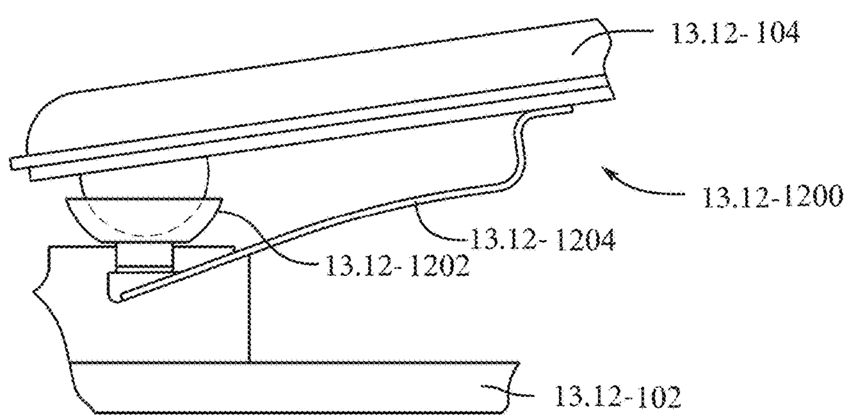
FIG. 13.12-12

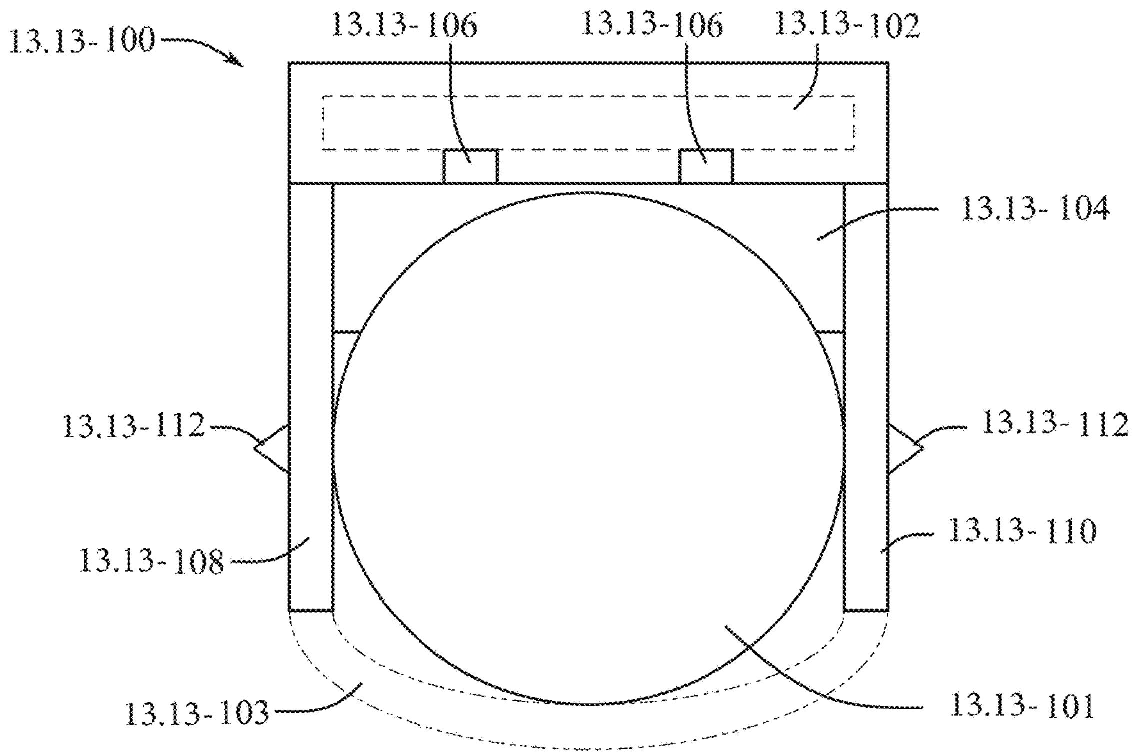
FIG. 13.13-1
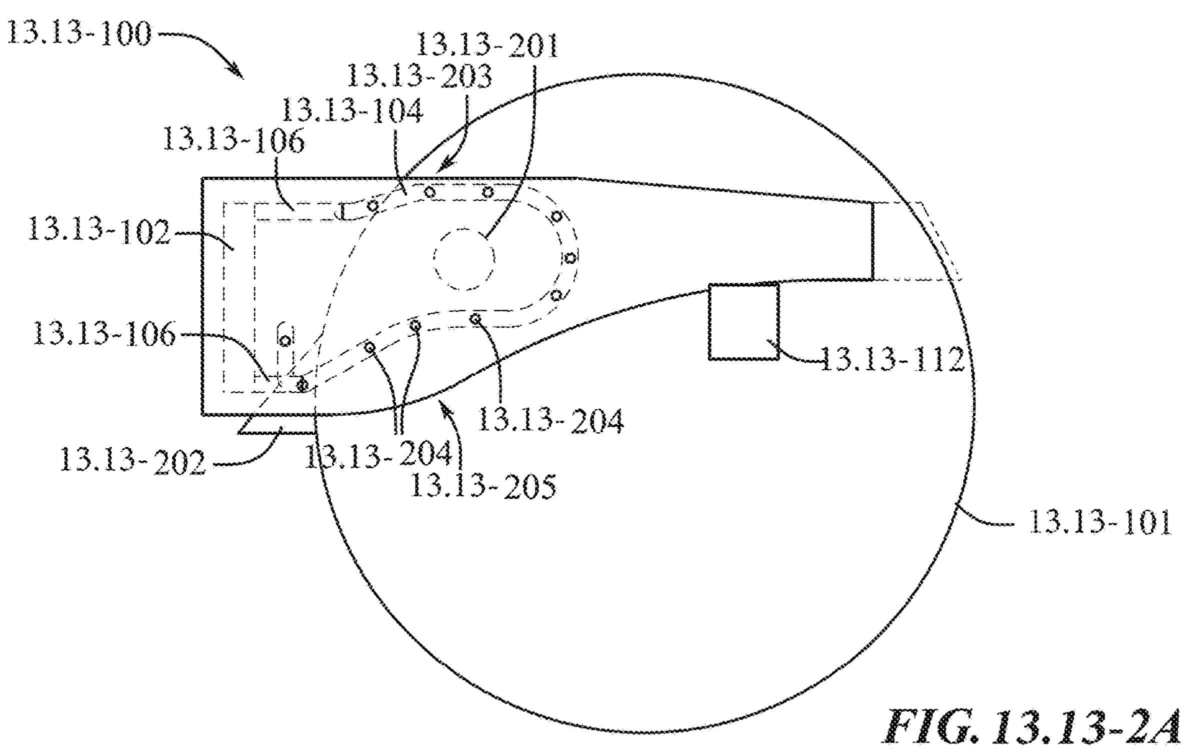
FIG. 13.13-2A

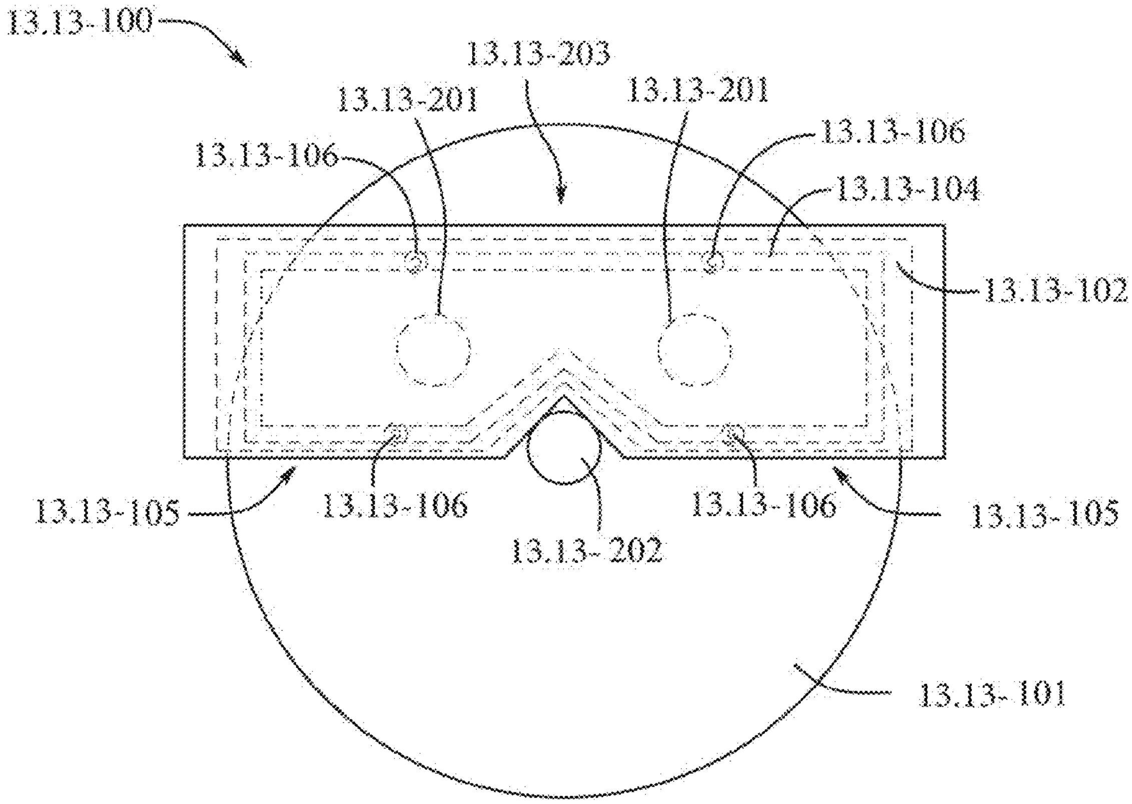
*FIG. 13.13-2B*

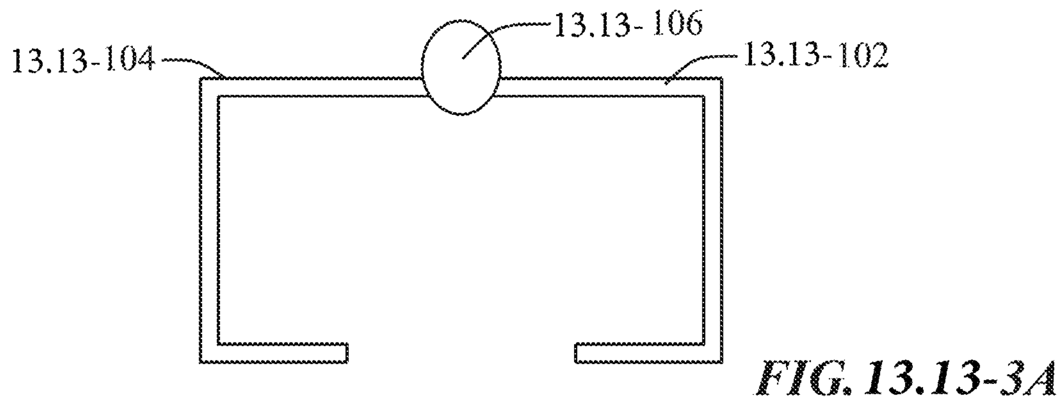
FIG. 13.13-3A
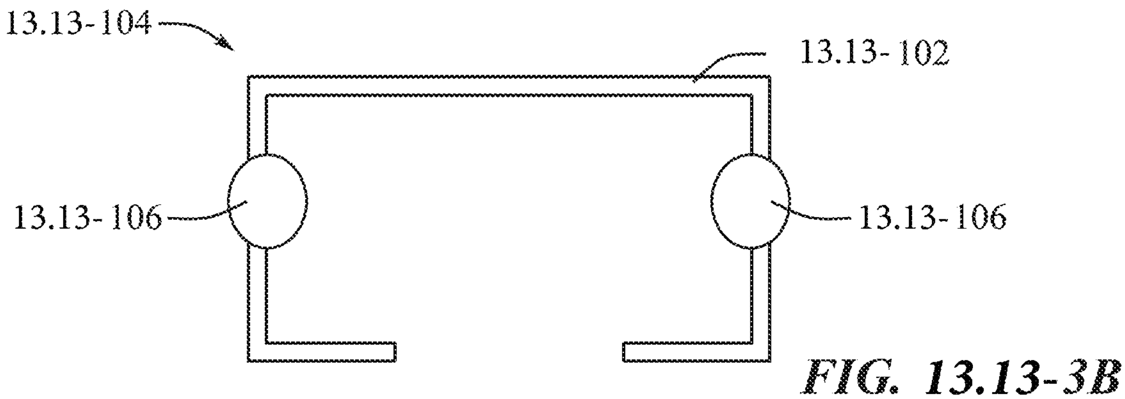
FIG. 13.13-3B
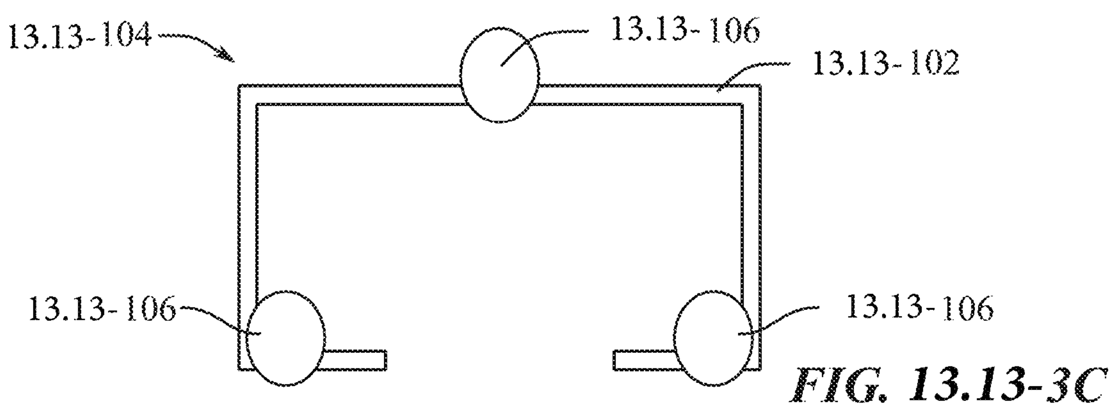
FIG. 13.13-3C
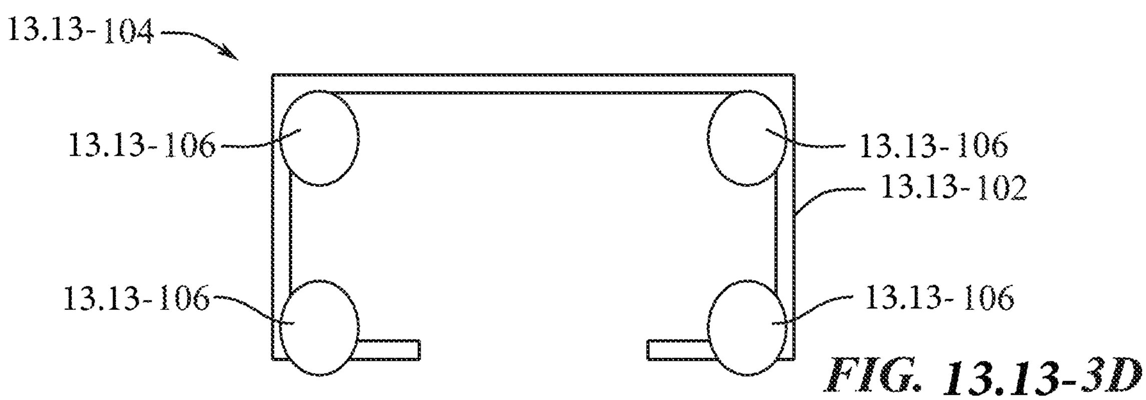
FIG. 13.13-3D

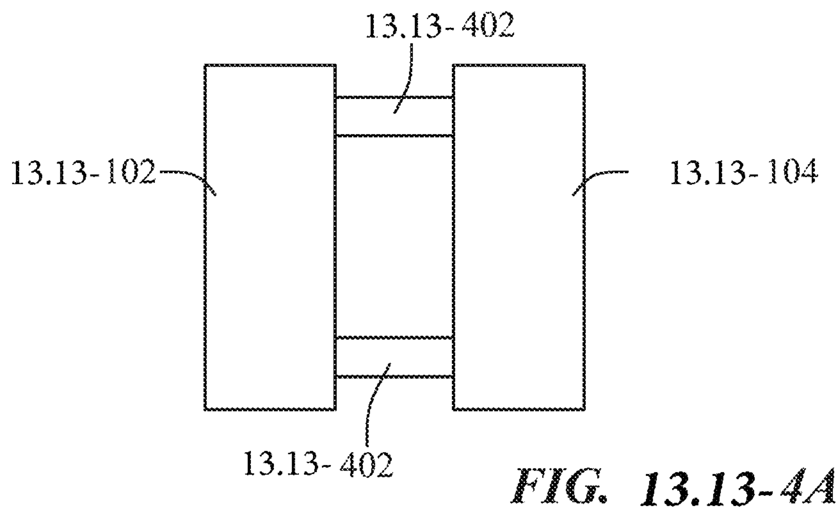
FIG. 13.13-4A
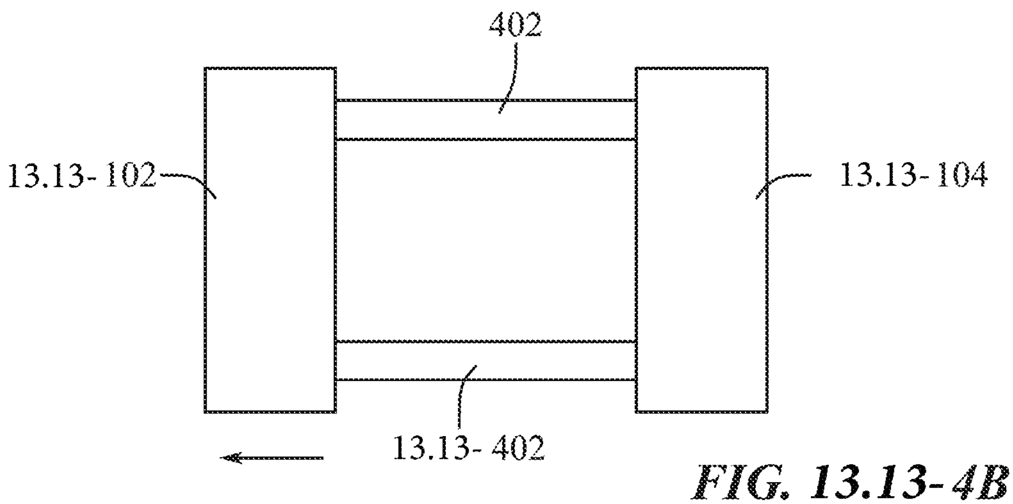
FIG. 13.13-4B
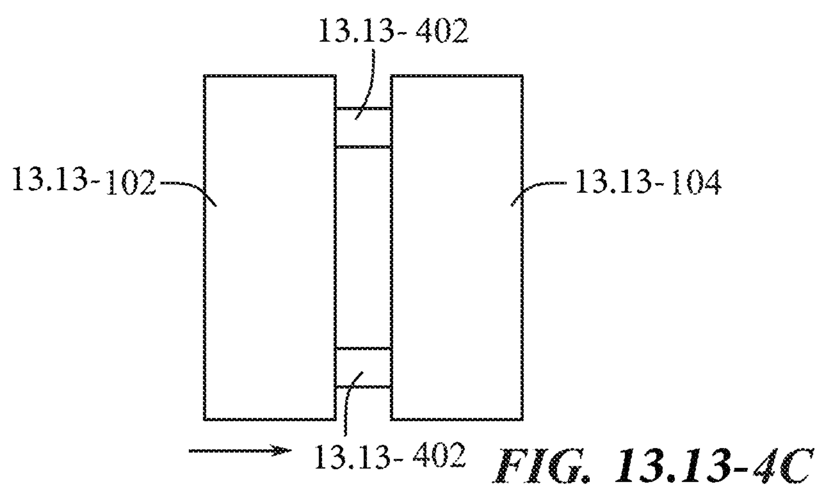
FIG. 13.13-4C

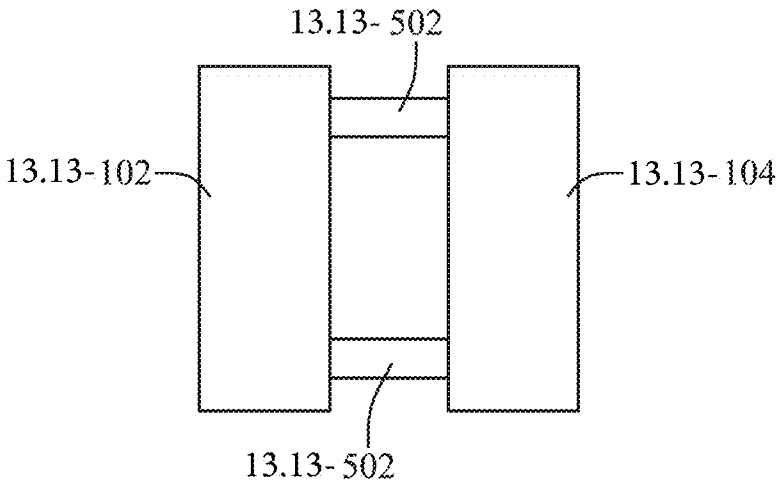
FIG. 13.13-5A
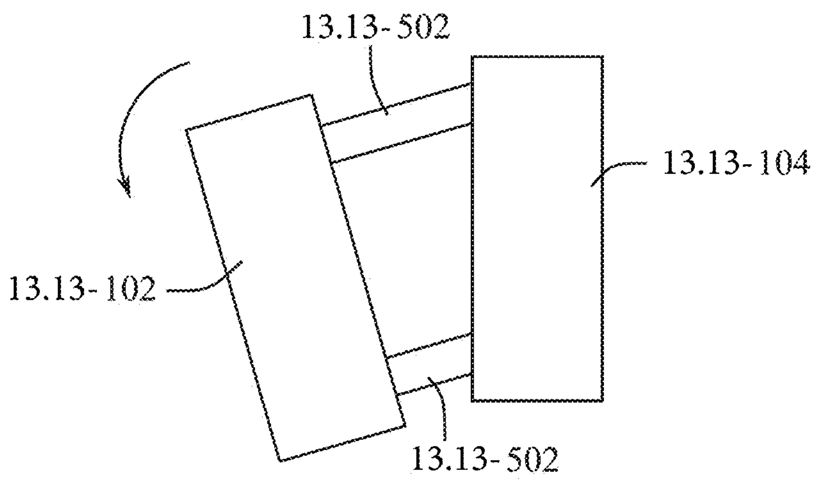
FIG. 13.13-5B
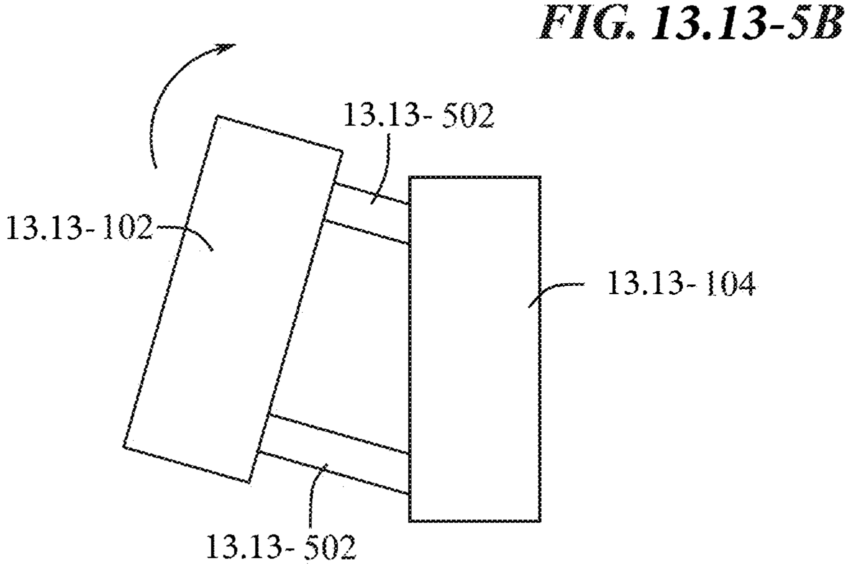
FIG. 13.13-5C

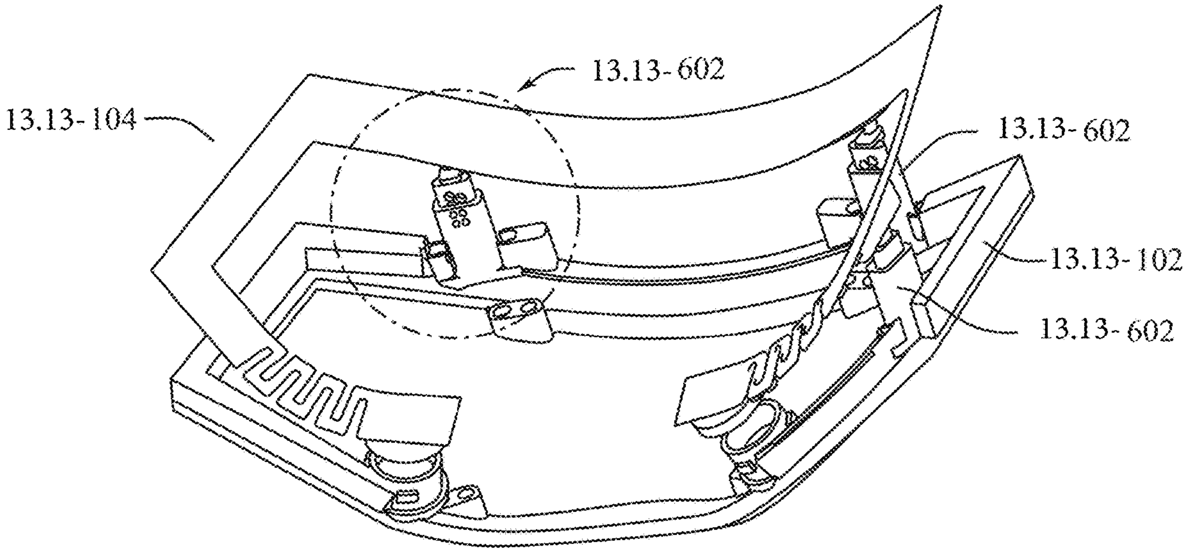
*FIG. 13.13-6A*
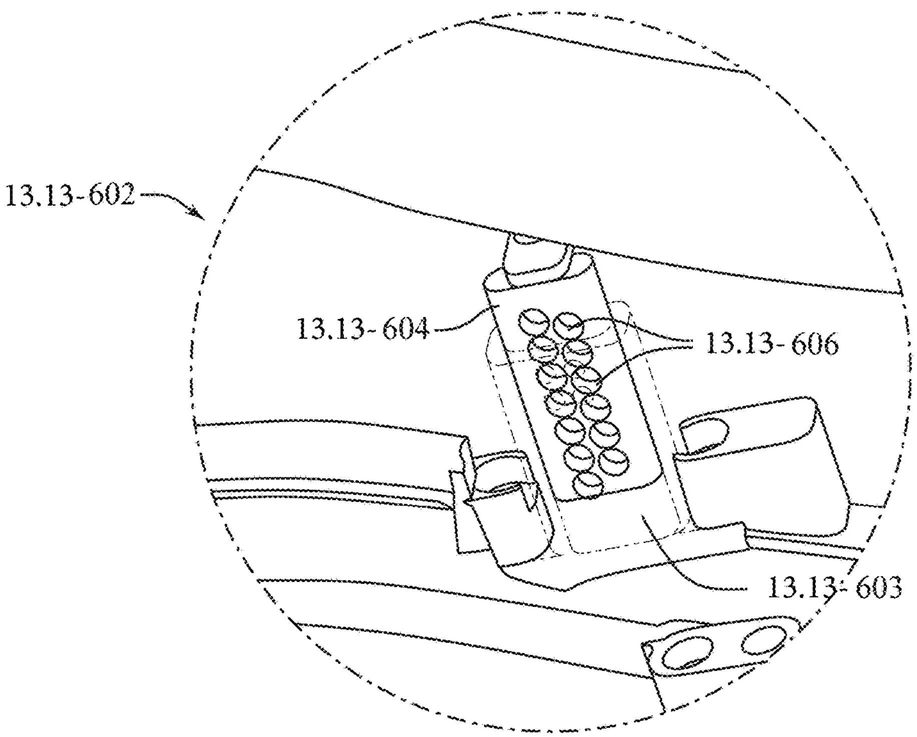
*FIG. 13.13-6B*

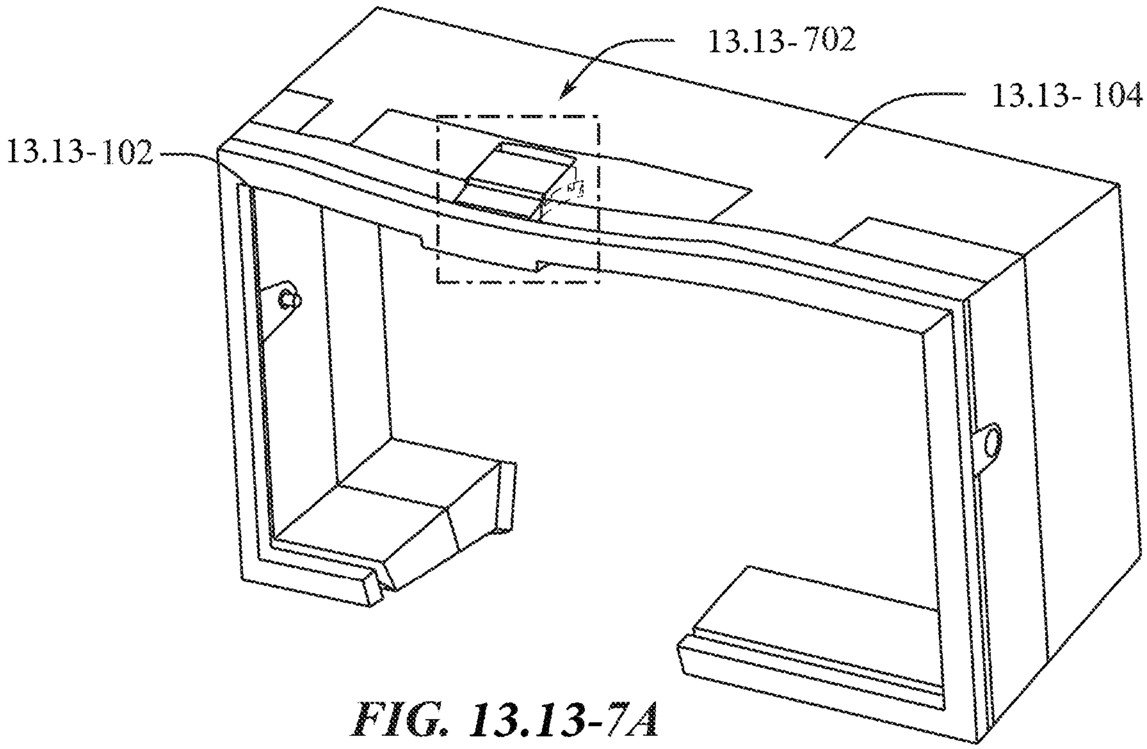
FIG. 13.13-7A
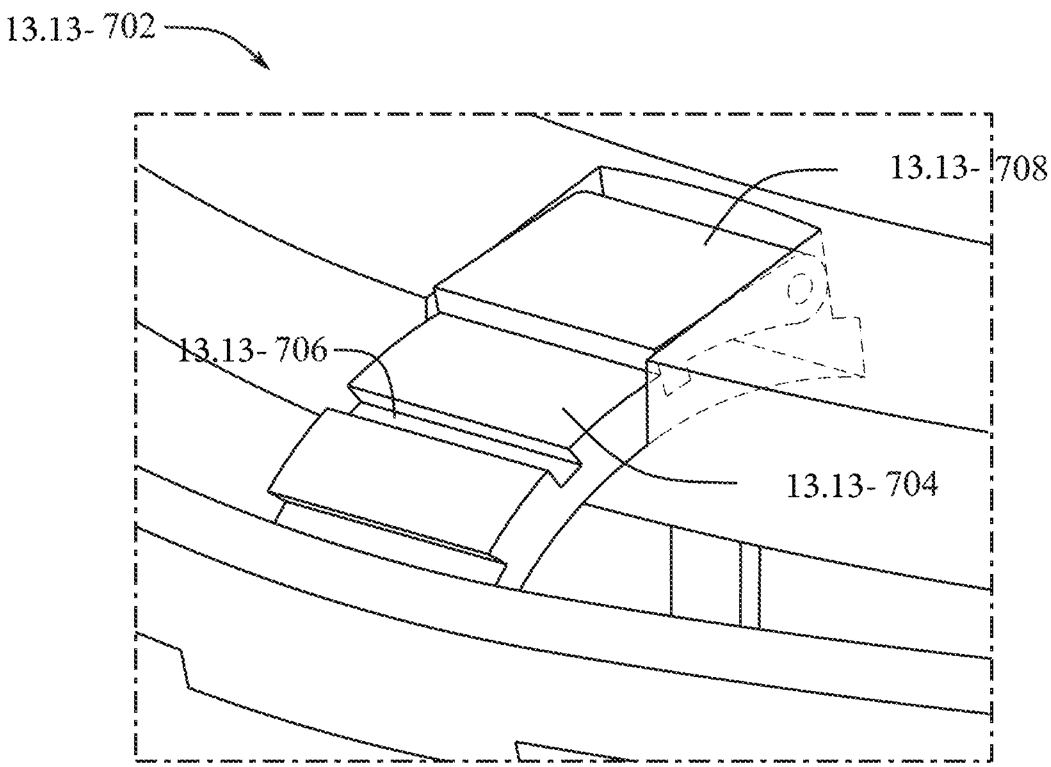
FIG. 13.13-7B

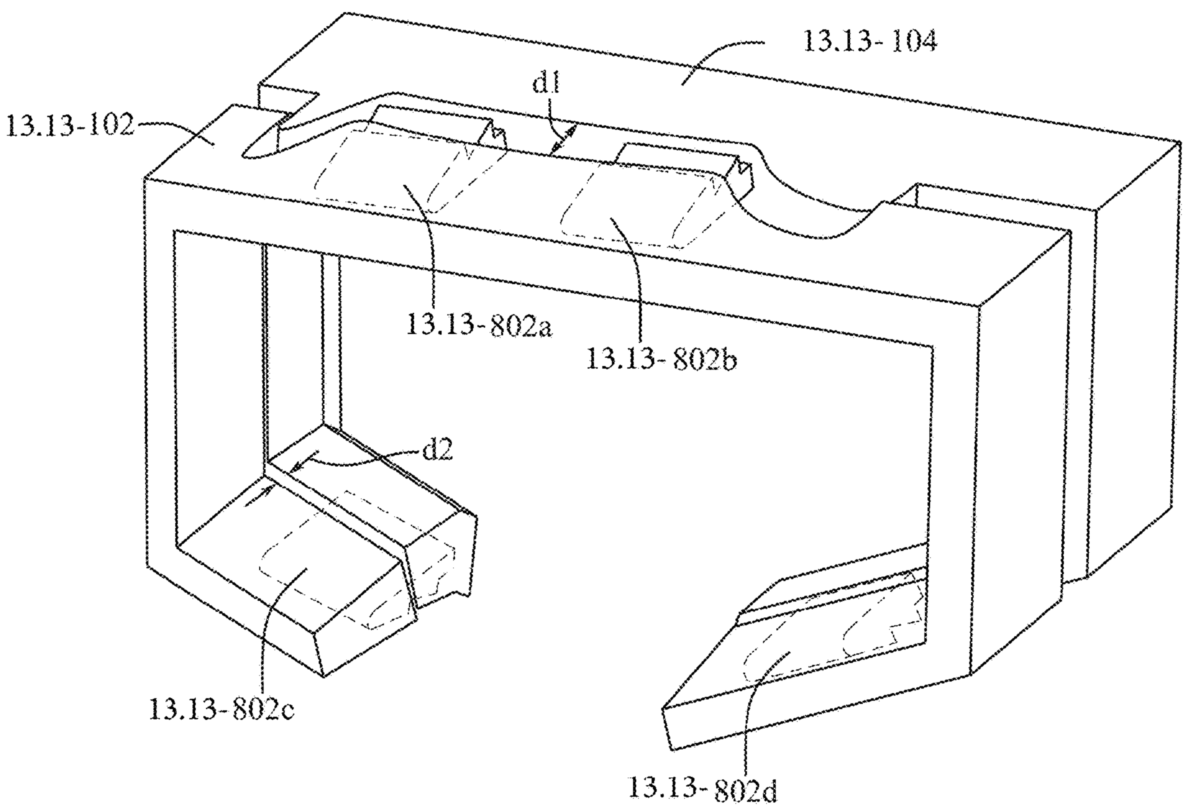
*FIG. 13.13-8*

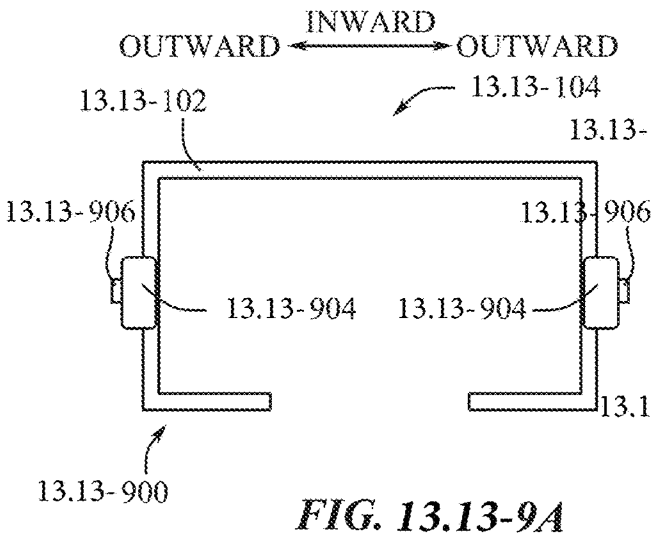
FIG. 13.13-9A
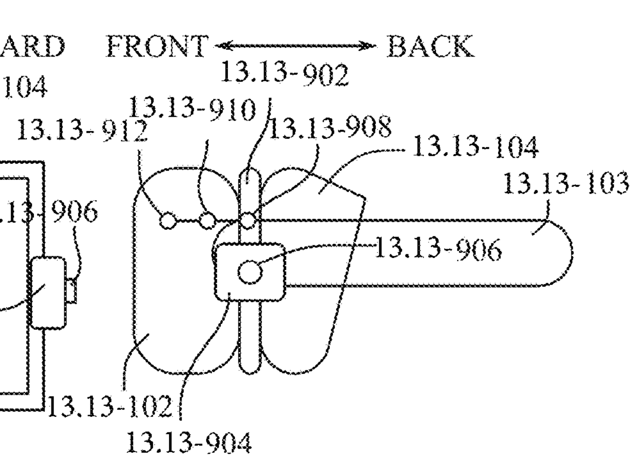
FIG. 13.13-9B
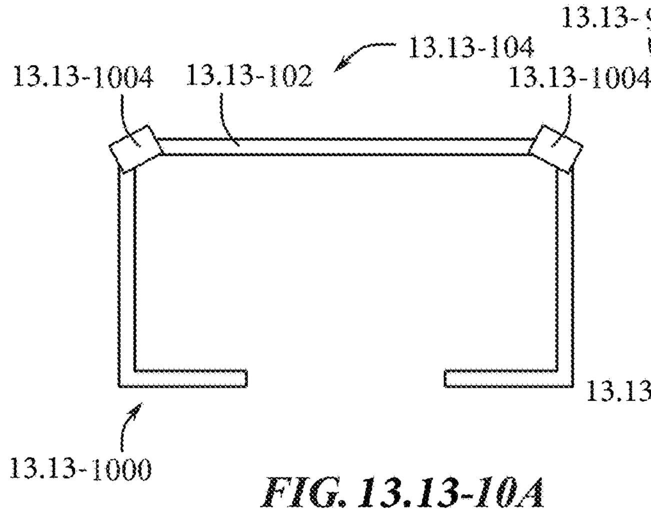
FIG. 13.13-10A
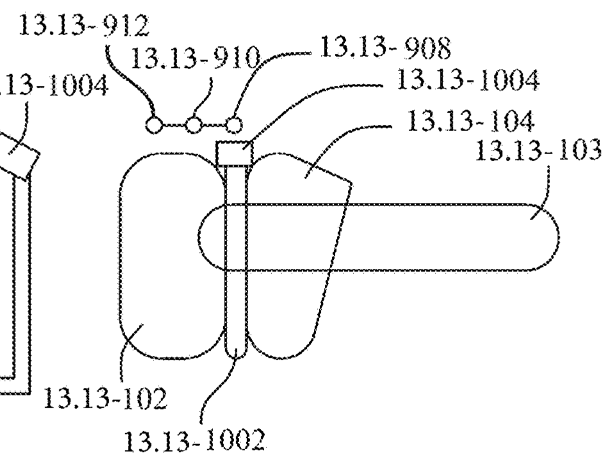
FIG. 13.13-10B

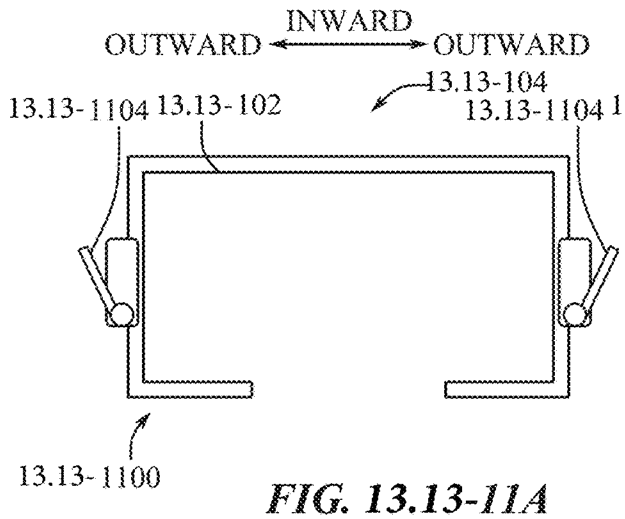
*FIG. 13.13-11A*
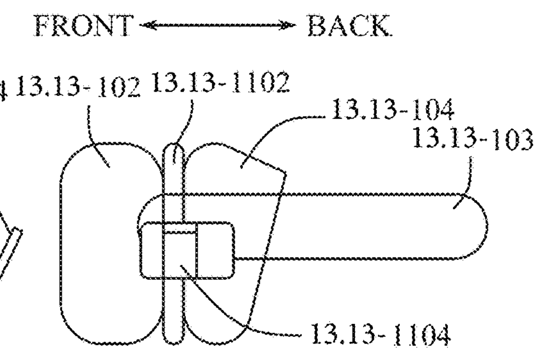
*FIG. 13.13-11B*
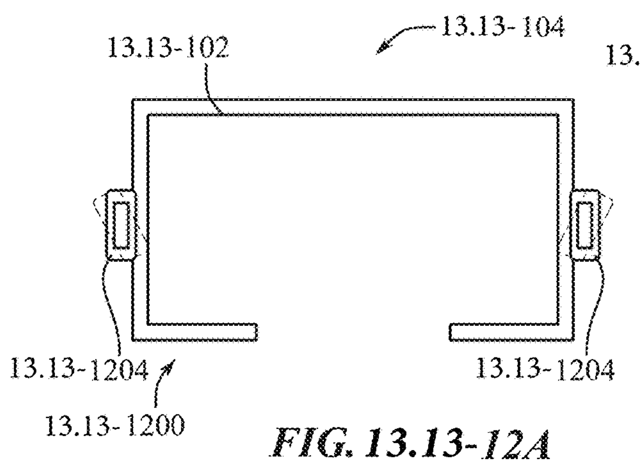
*FIG. 13.13-12A*
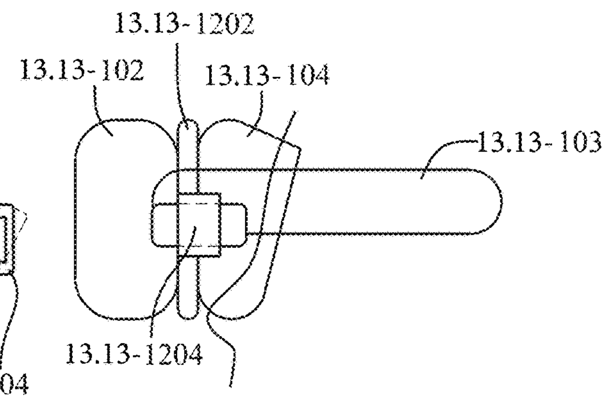
*FIG. 13.13-12B*
UP
DOWN
UP
DOWN

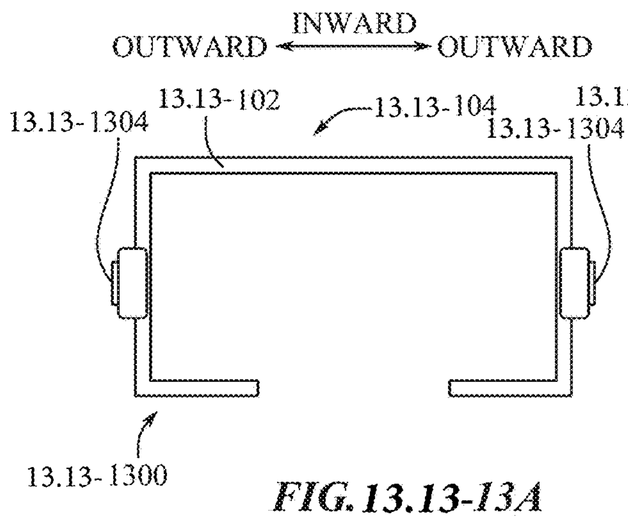
*FIG. 13.13-13A*
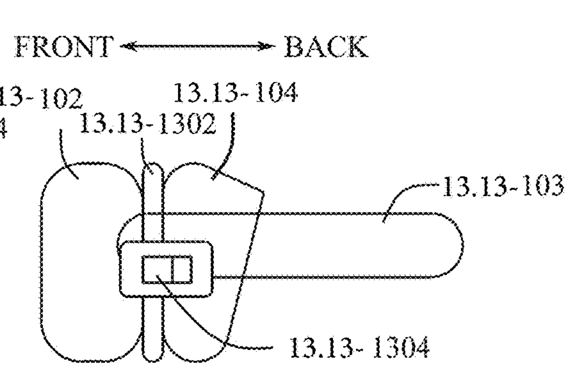
*FIG. 13.13-13B*
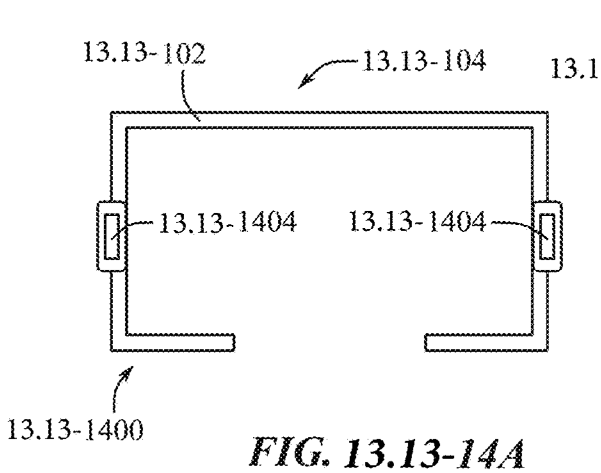
*FIG. 13.13-14A*
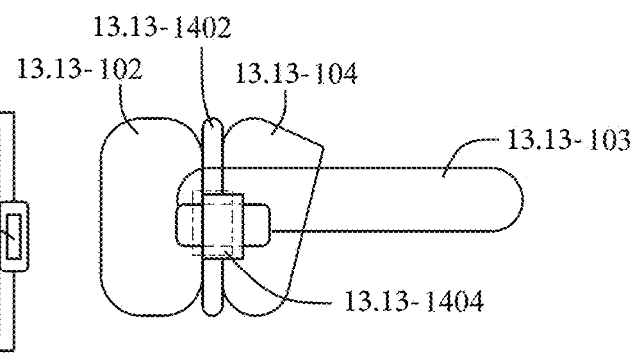
*FIG. 13.13-14B*
UP
DOWN
UP
DOWN

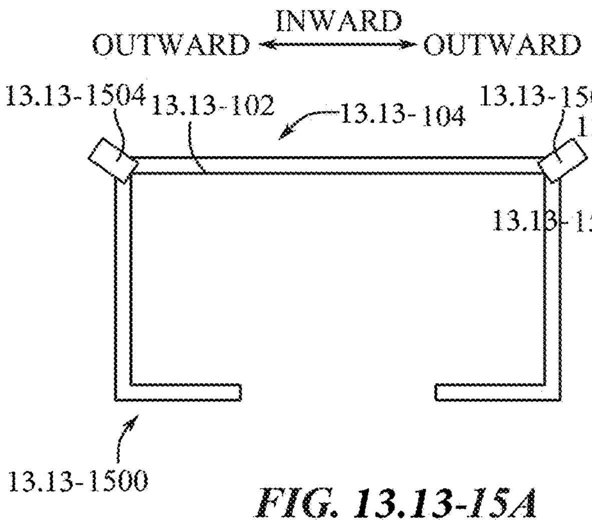
FIG. 13.13-15A
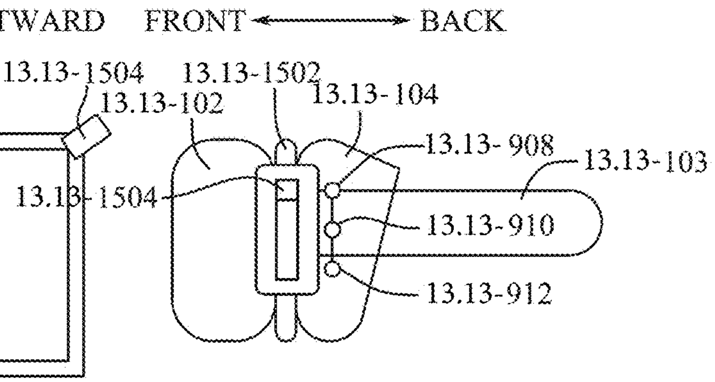
FIG. 13.13-15B
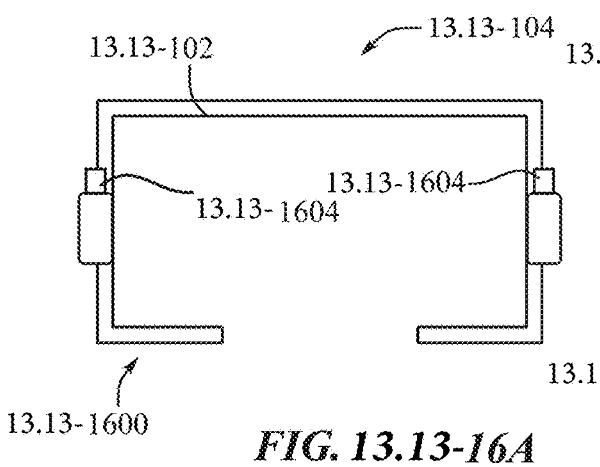
FIG. 13.13-16A
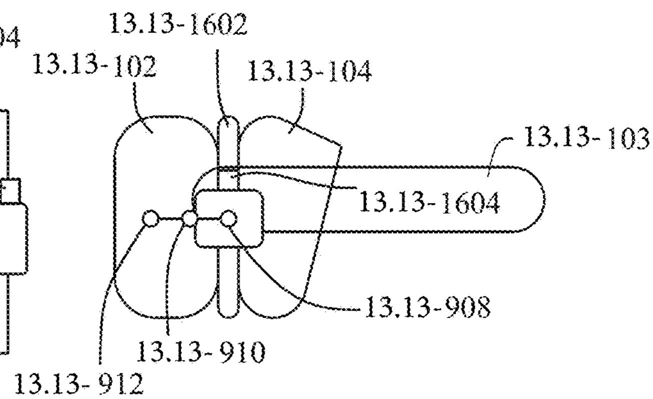
FIG. 13.13-16B

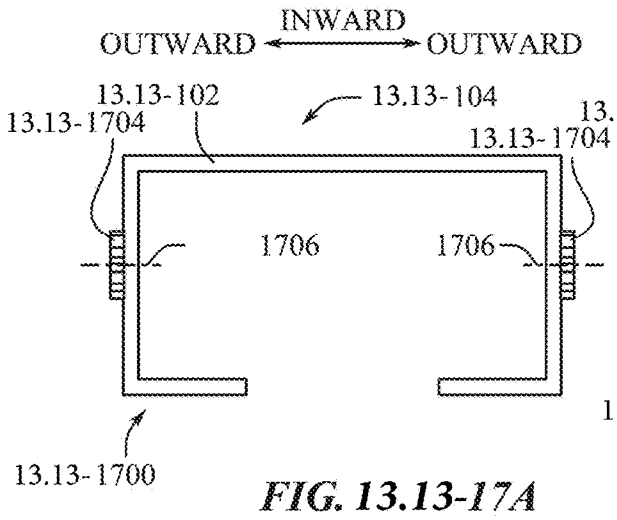
FIG. 13.13-17A
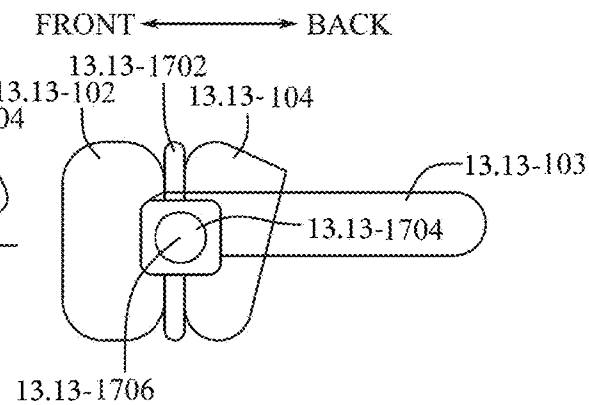
FIG. 13.13-17B
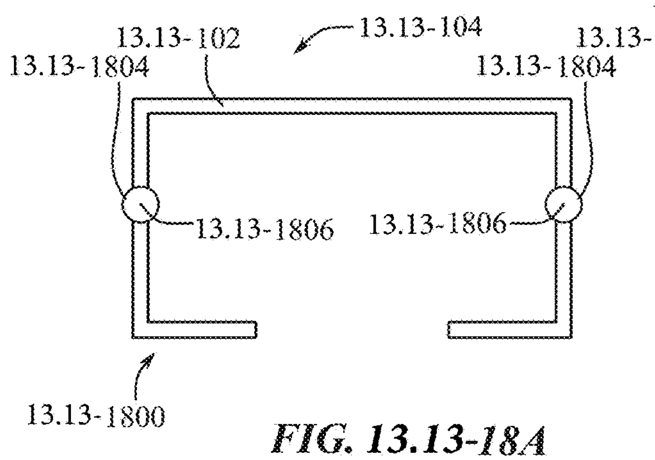
FIG. 13.13-18A
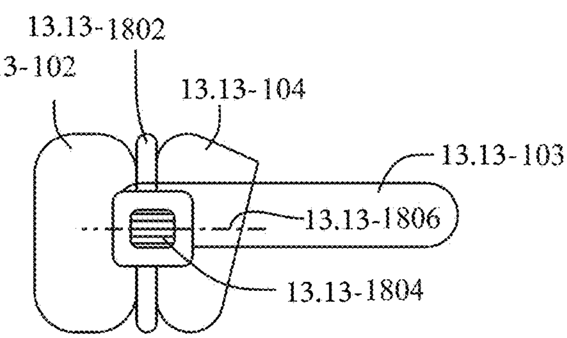
FIG. 13.13-18B
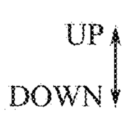

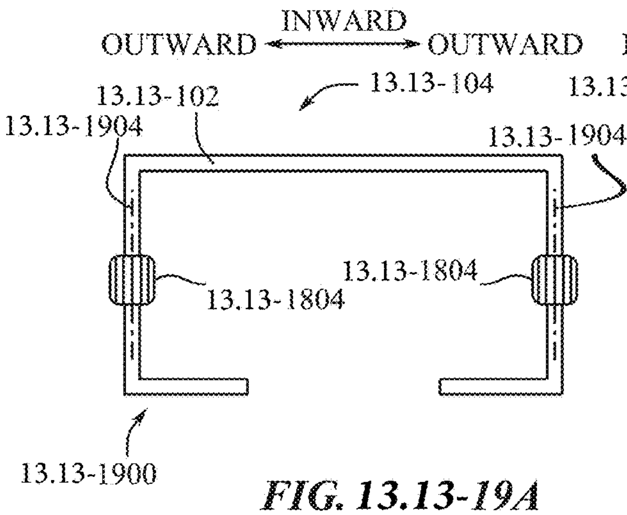
FIG. 13.13-19A
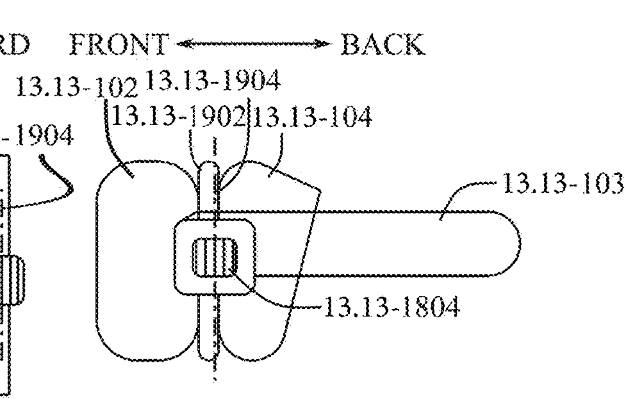
FIG. 13.13-19B
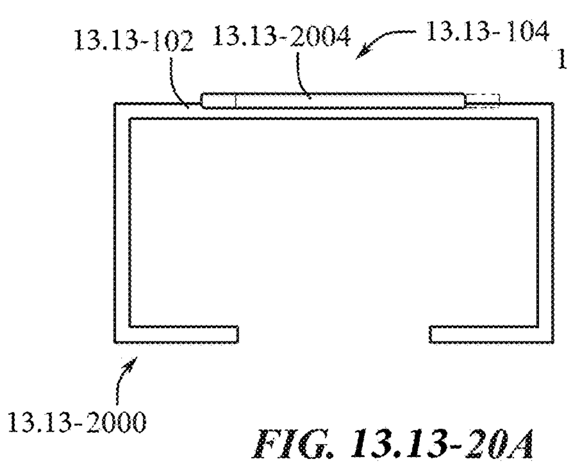
FIG. 13.13-20A
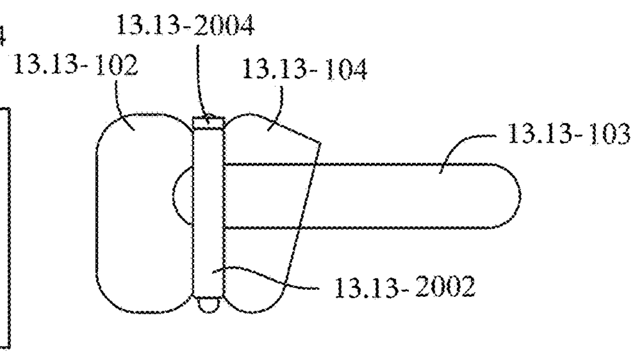
FIG. 13.13-20B
UP
DOWN
UP
DOWN

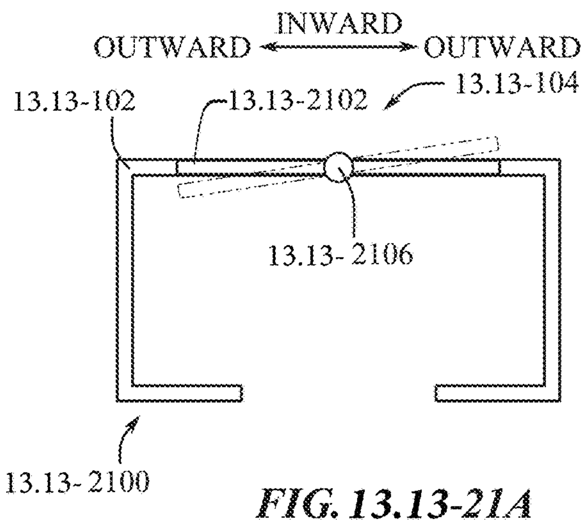
FIG. 13.13-21A
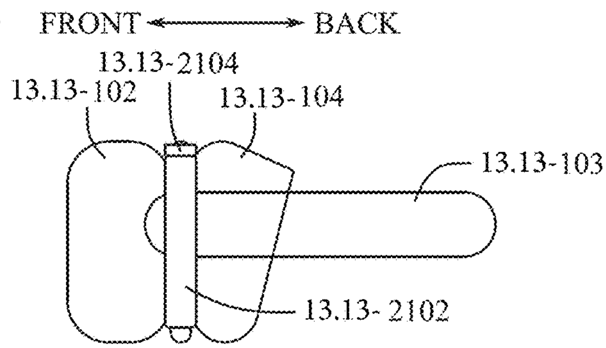
FIG. 13.13-21B
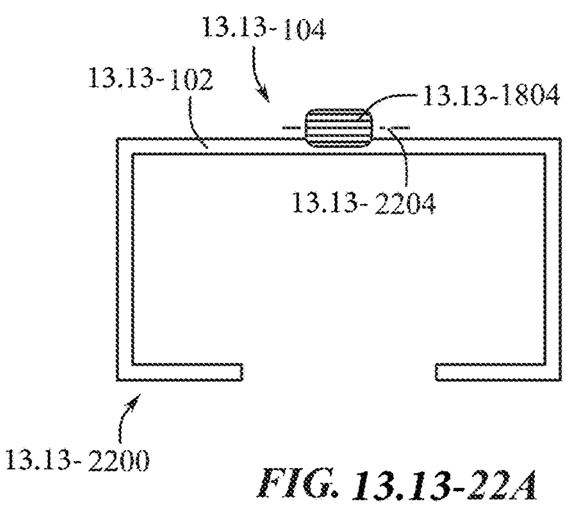
FIG. 13.13-22A
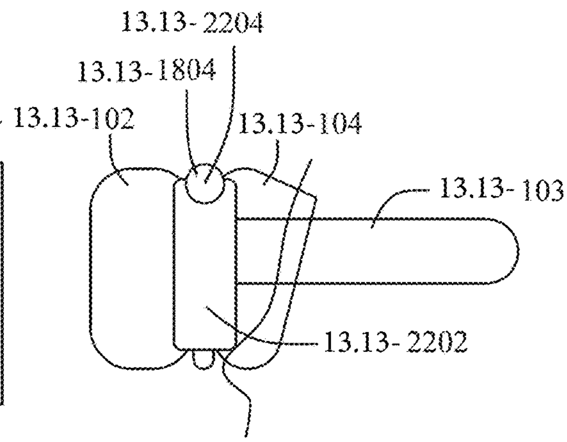
FIG. 13.13-22B

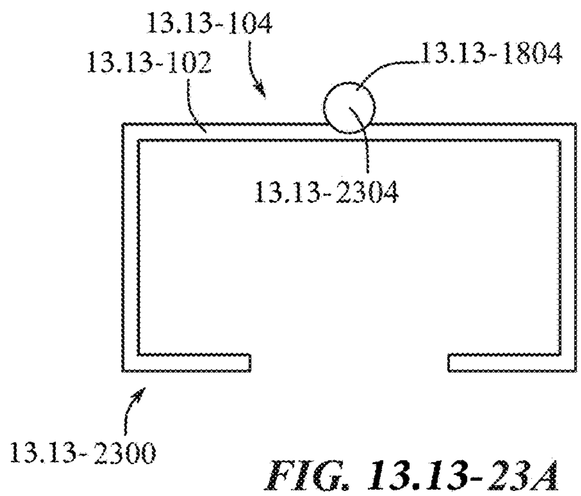
FIG. 13.13-23A
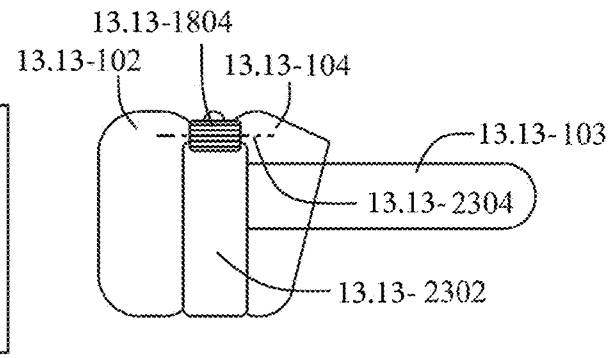
FIG. 13.13-23B
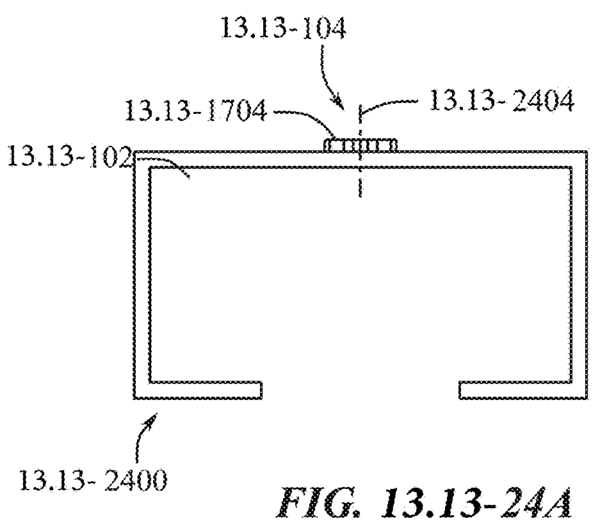
FIG. 13.13-24A
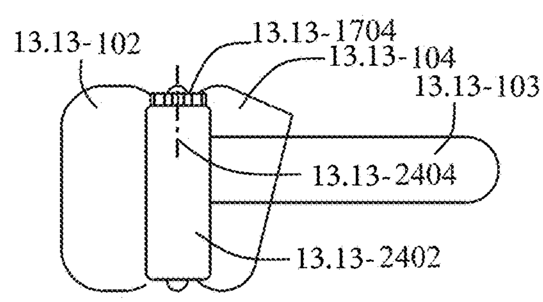
FIG. 13.13-24B
UP
DOWN
UP
DOWN

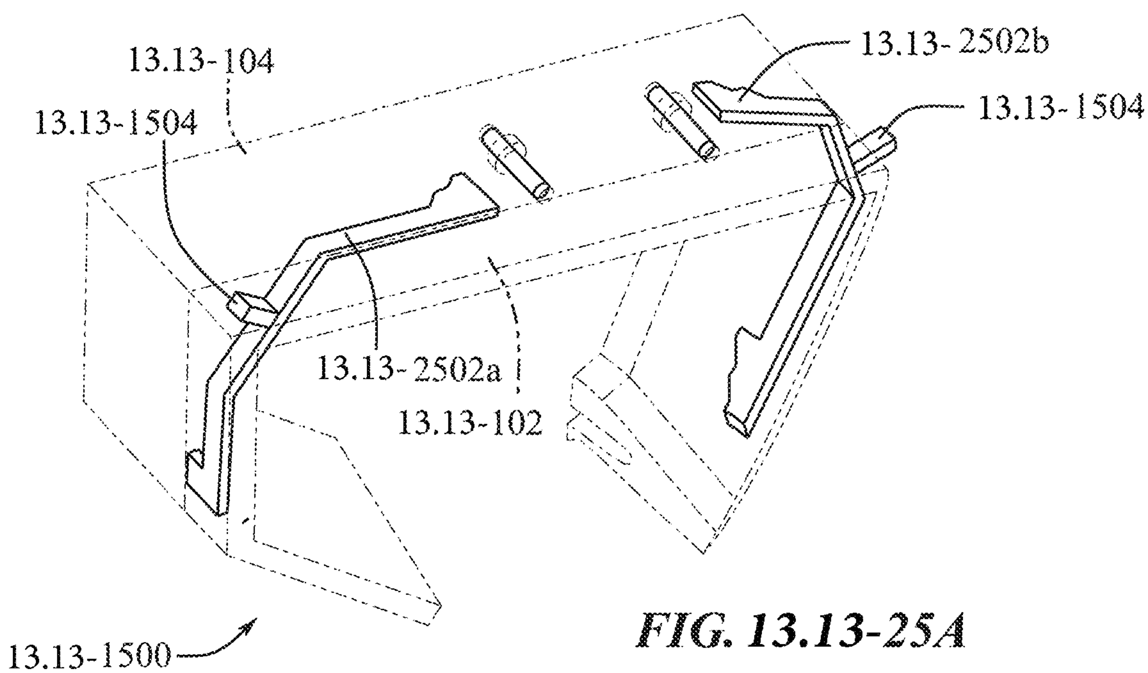
*FIG. 13.13-25A*

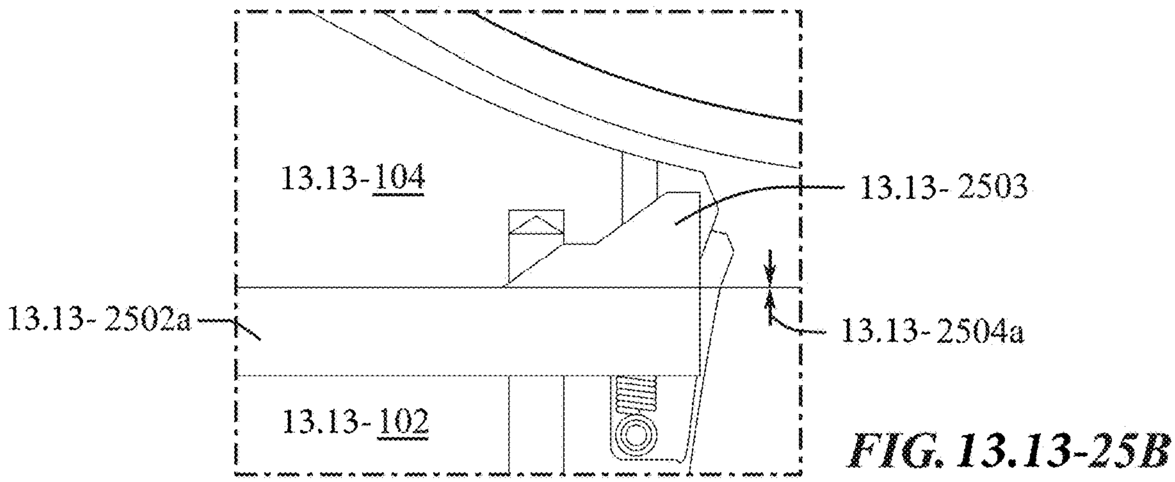
FIG. 13.13-25B
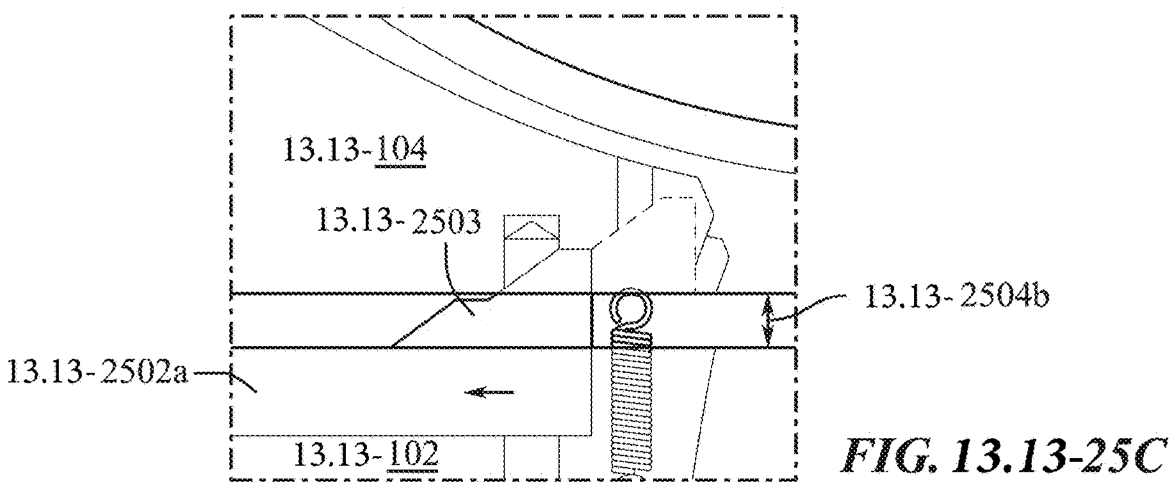
FIG. 13.13-25C
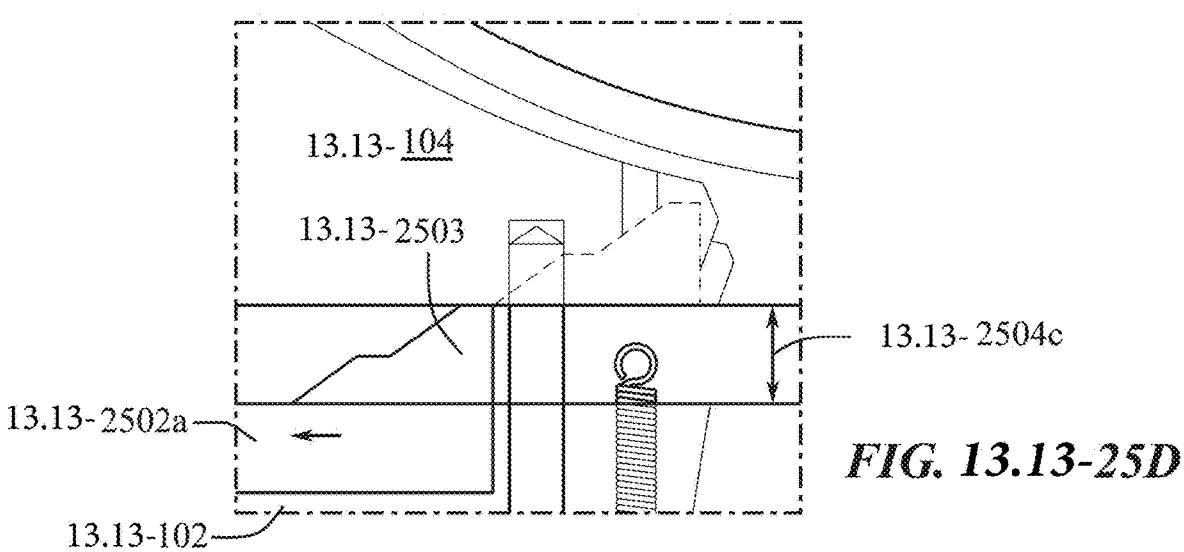
FIG. 13.13-25D

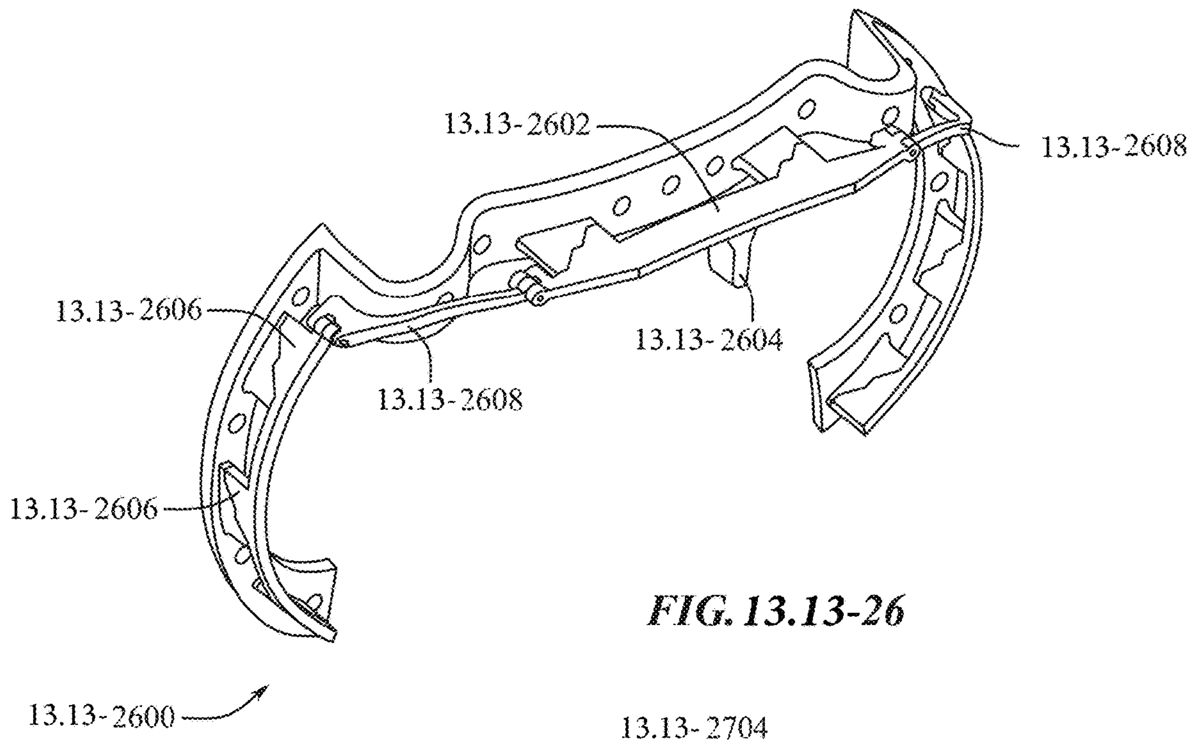
FIG. 13.13-26
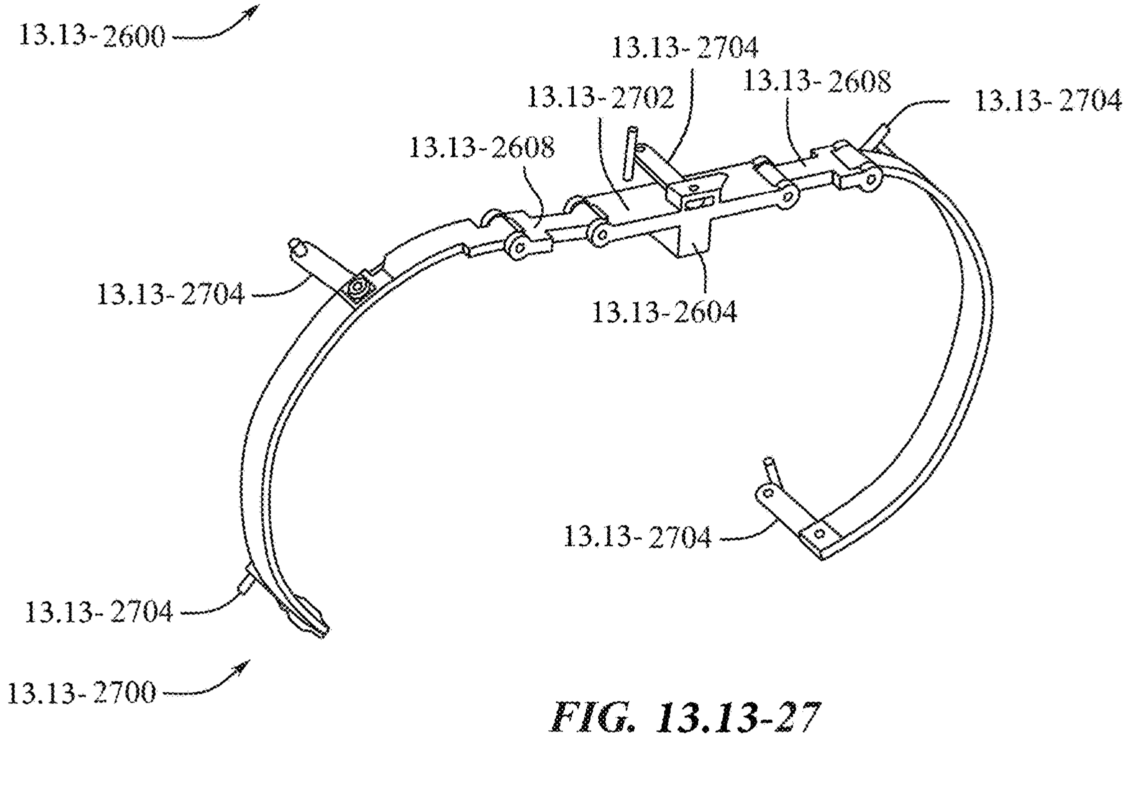
FIG. 13.13-27

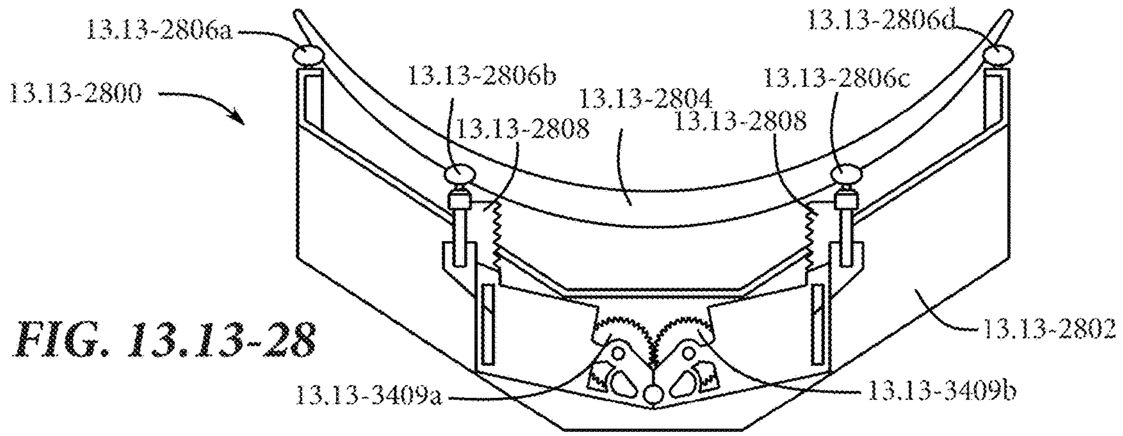
FIG. 13.13-28
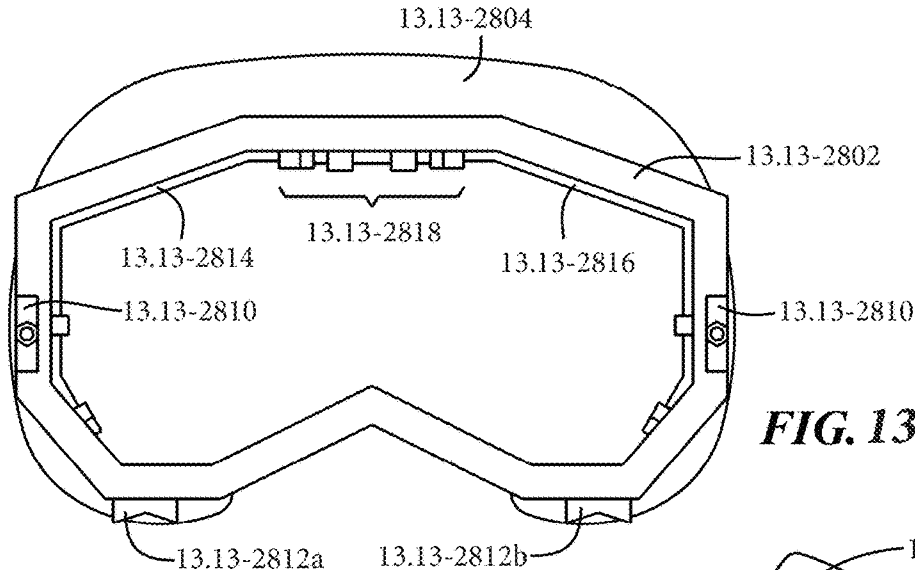
FIG. 13.13-29
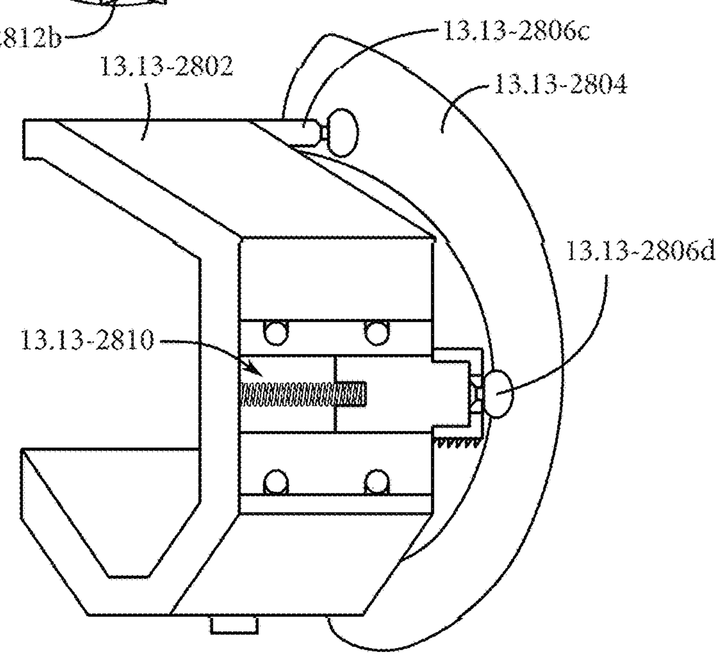
FIG. 13.13-30

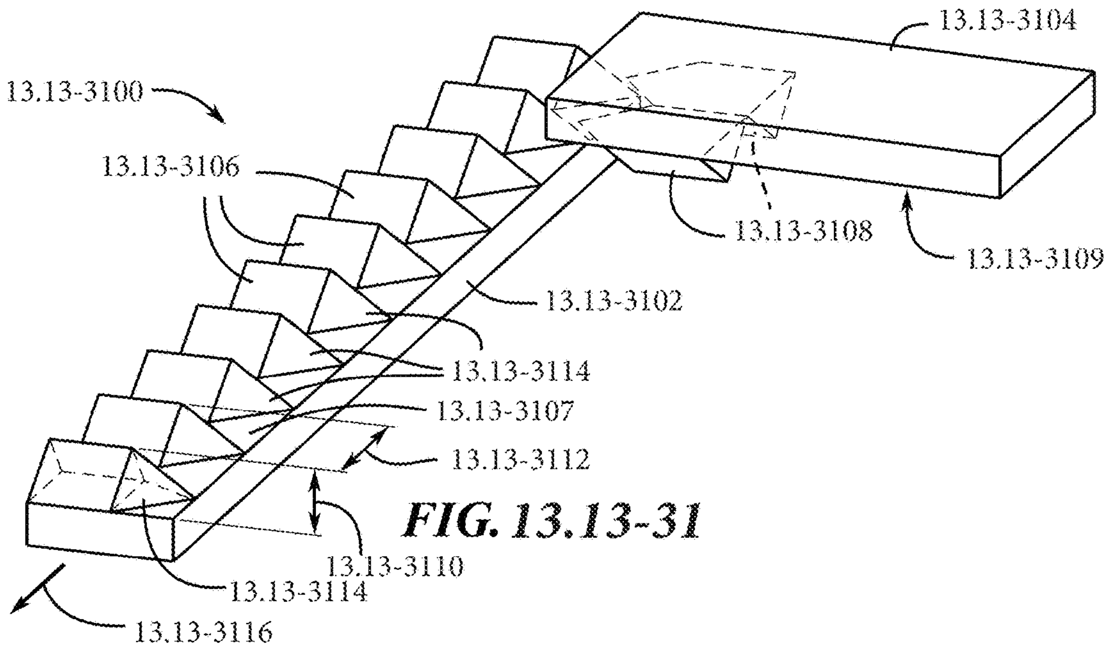
FIG. 13.13-31
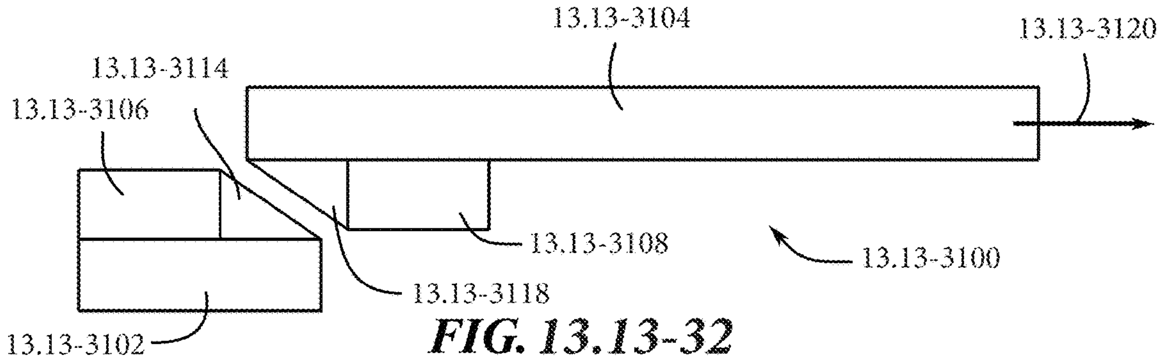
FIG. 13.13-32
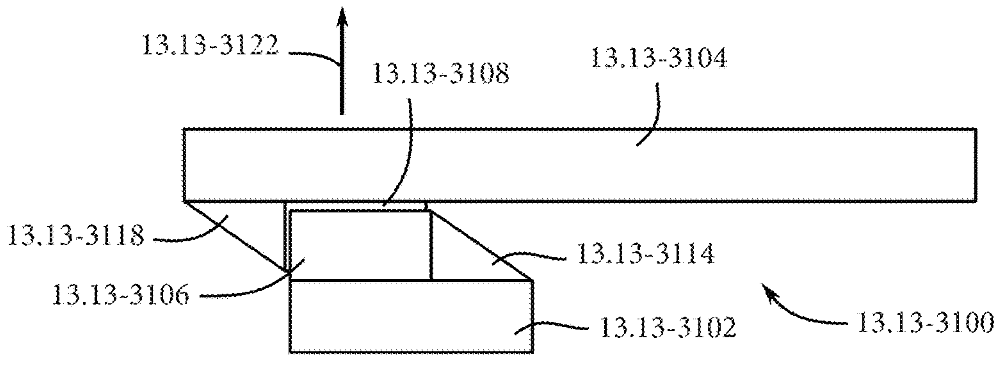
FIG. 13.13-33

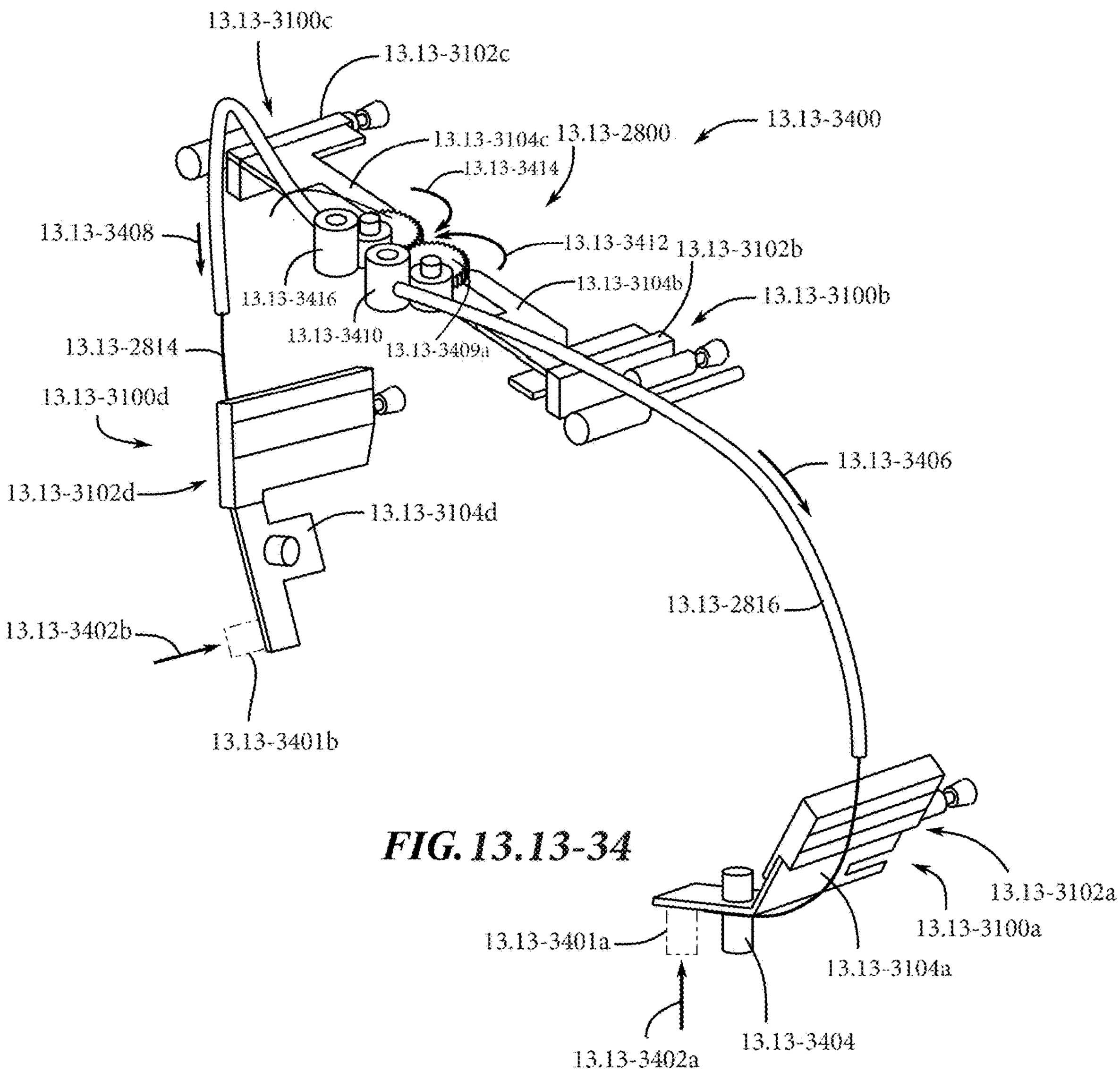
FIG. 13.13-34

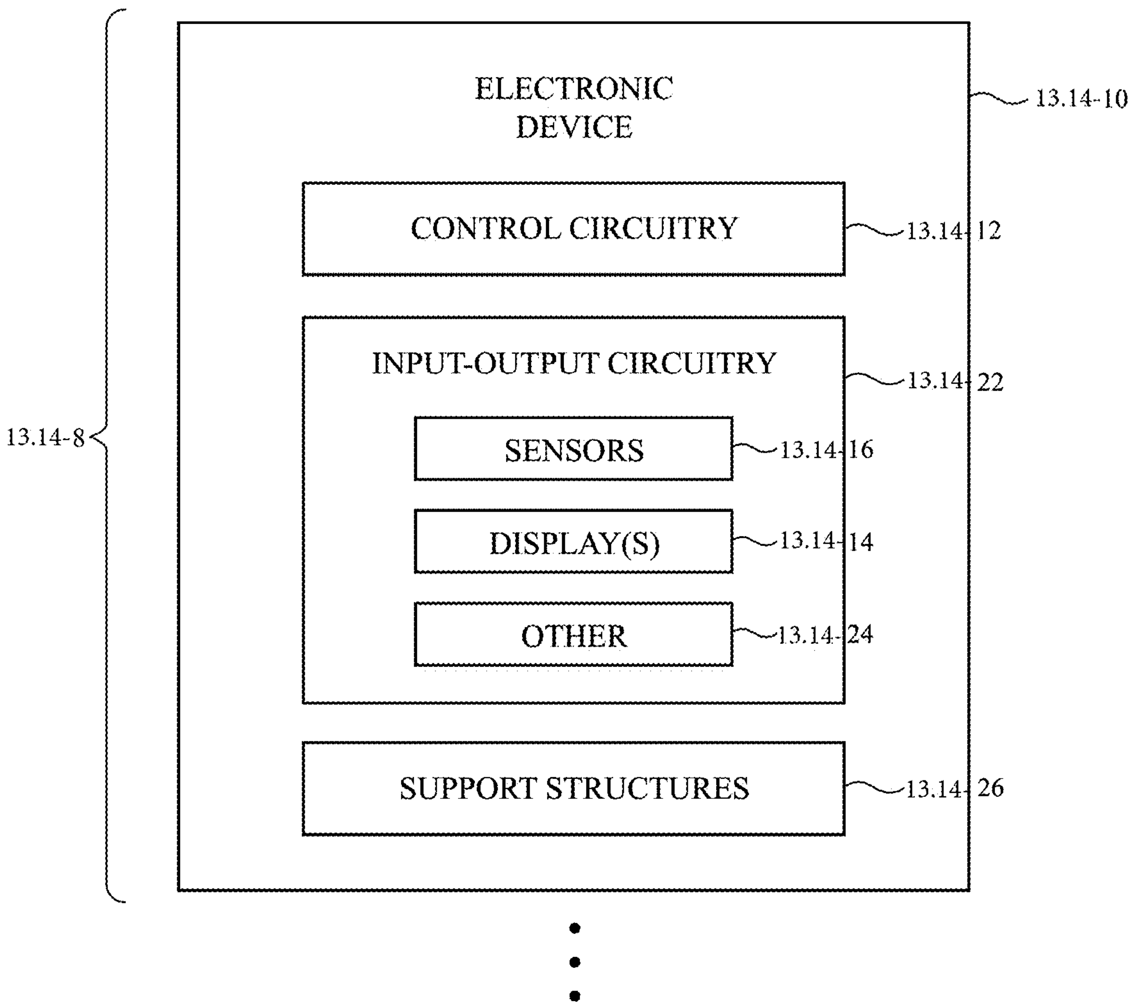
*FIG. 13.14-1*

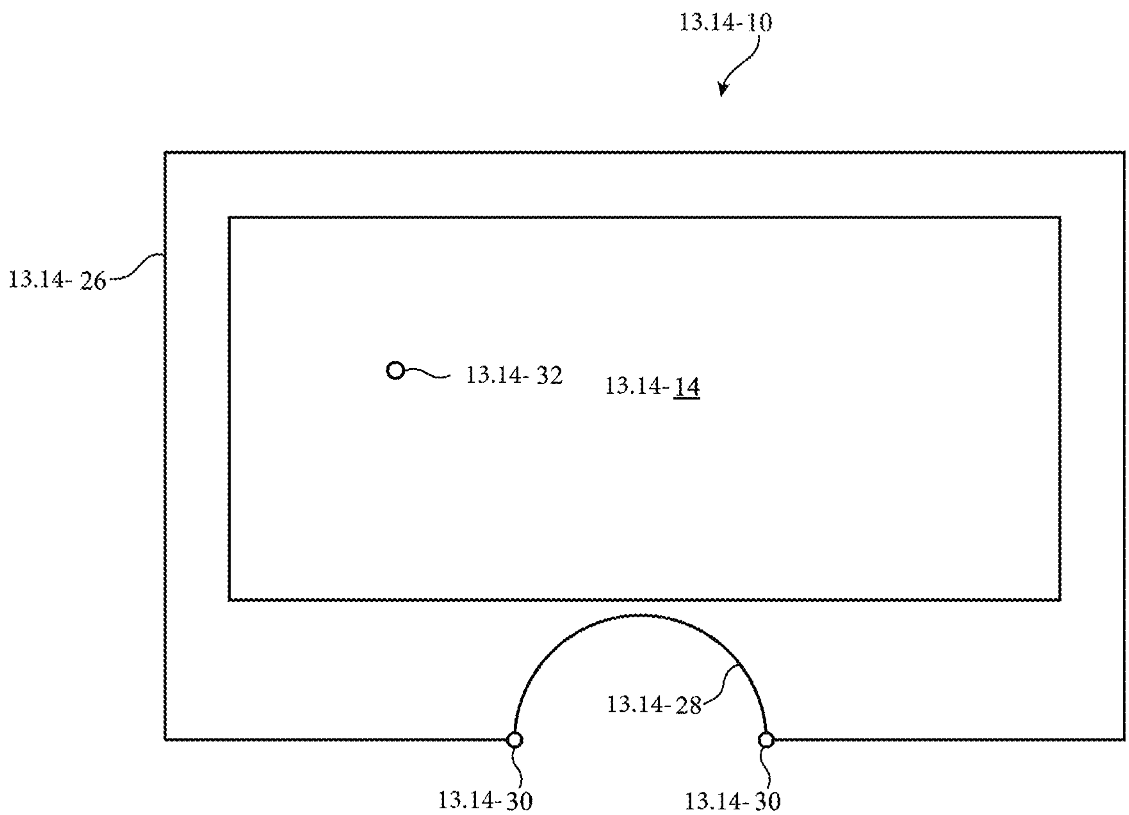
*FIG. 13.14-2*

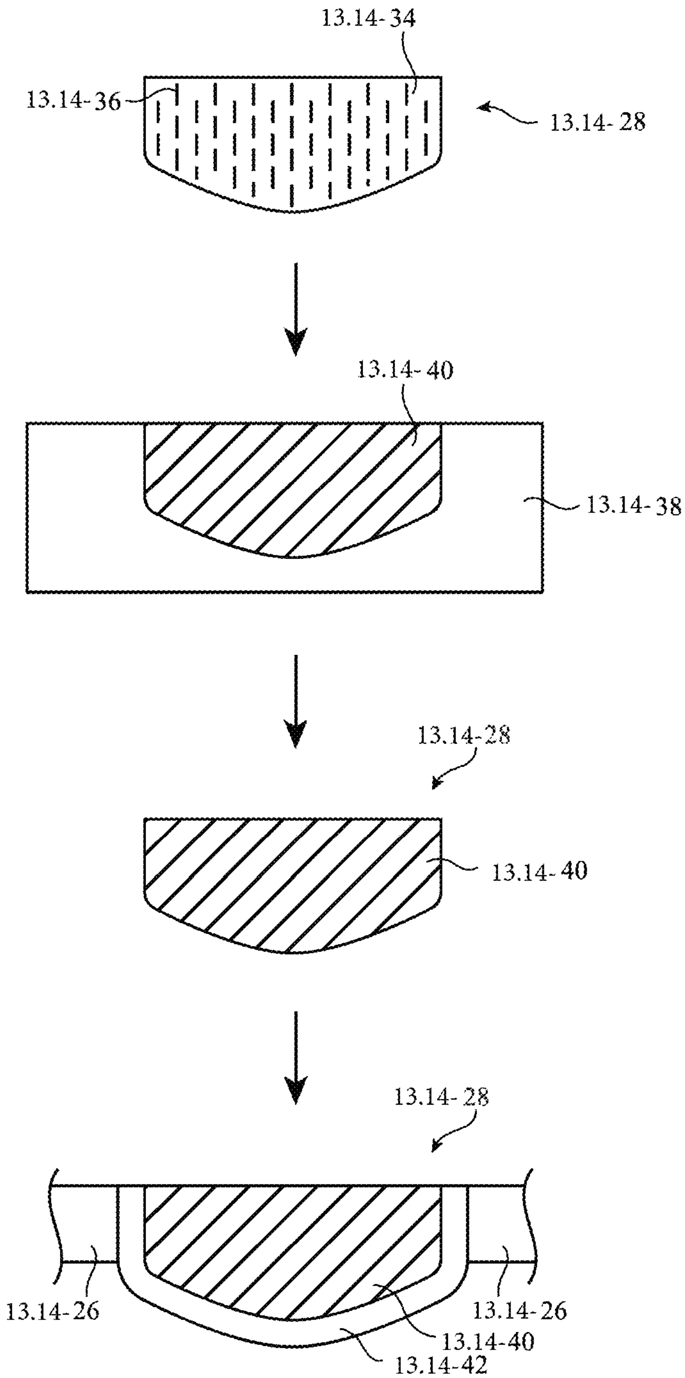
*FIG. 13.14-3*

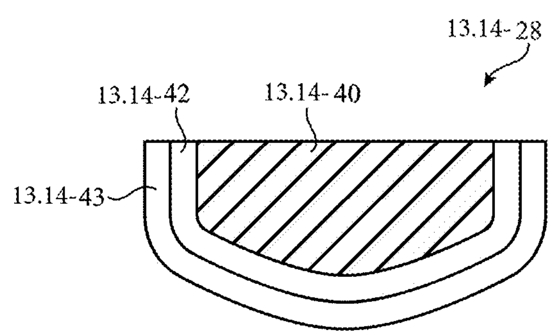
*FIG. 13.14-4*

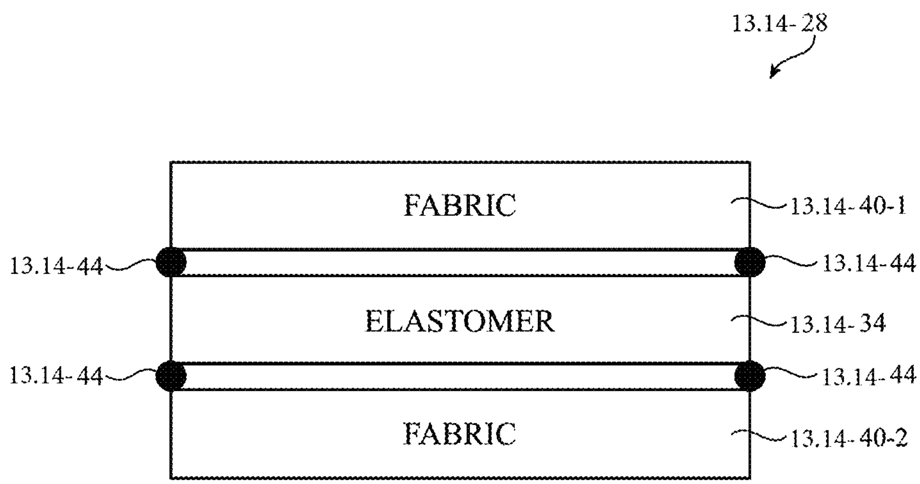
*FIG. 13.14-5*

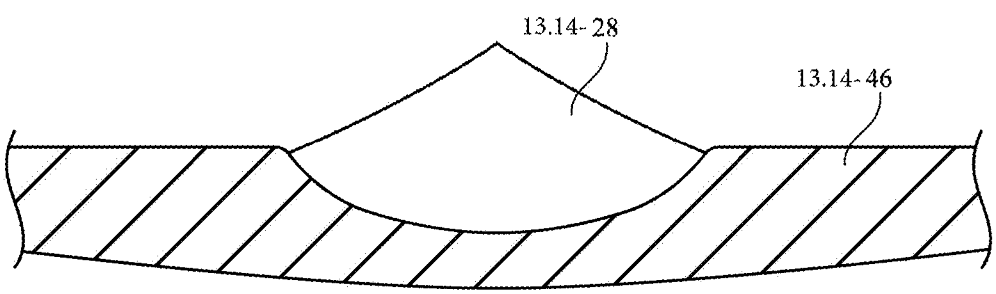
*FIG. 13.14-6*

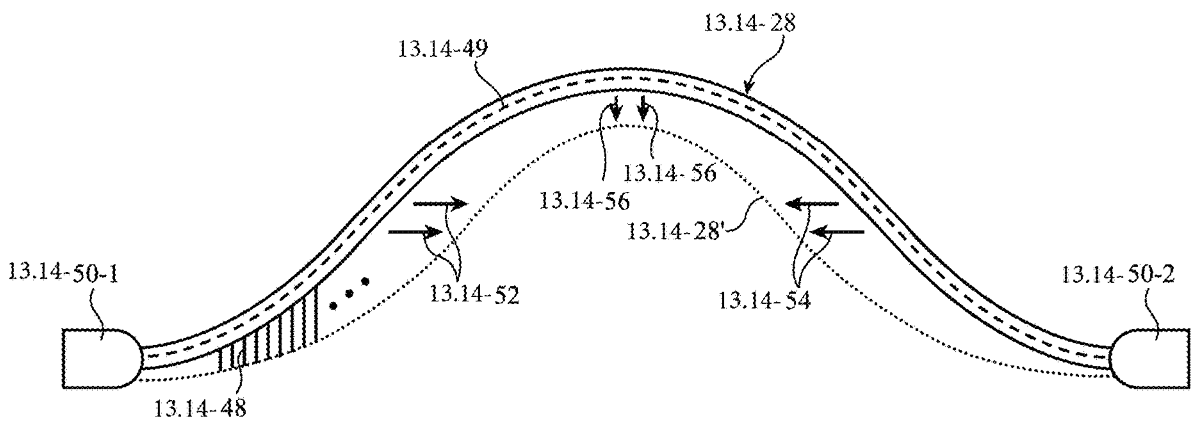
*FIG. 13.14-7*

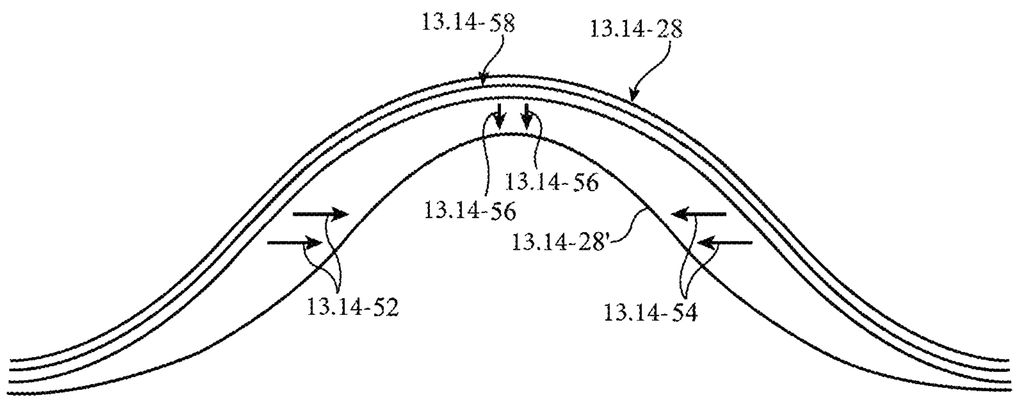
*FIG. 13.14-8*

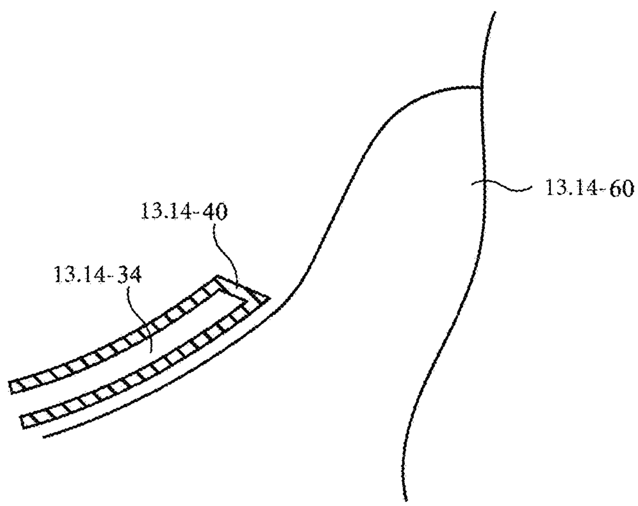
FIG. 13.14-9A
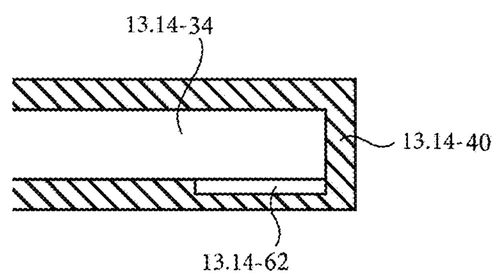
FIG. 13.14-9B
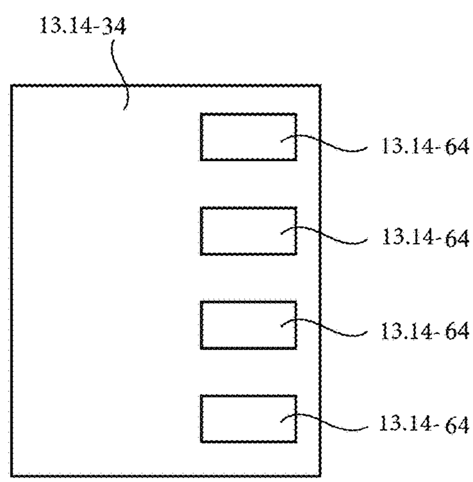
FIG. 13.14-9C

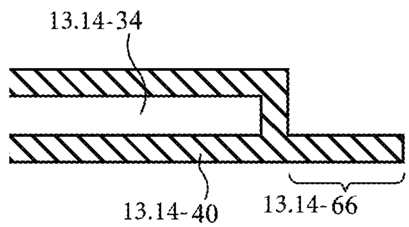
FIG. 13.14-9D
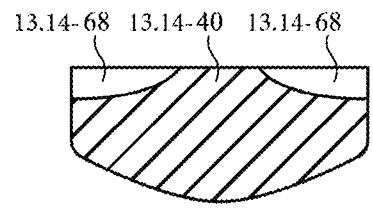
FIG. 13.14-9E
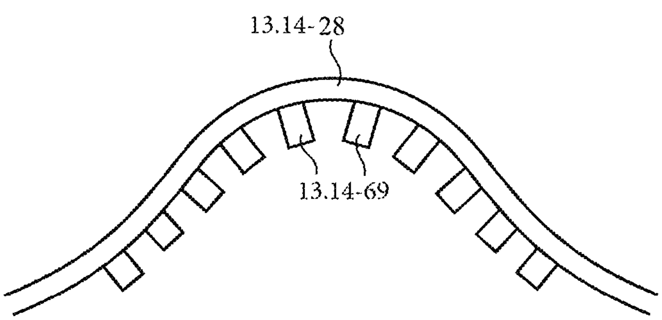
FIG. 13.14-9F
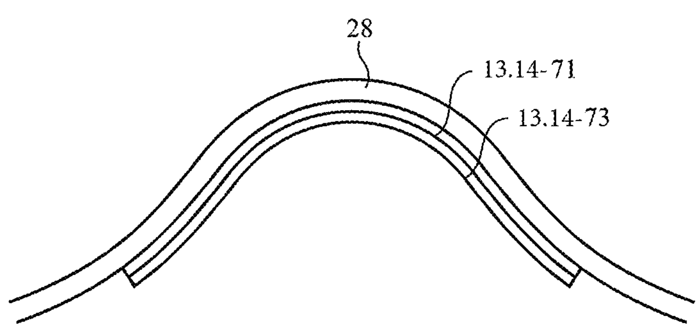
FIG. 13.14-9G

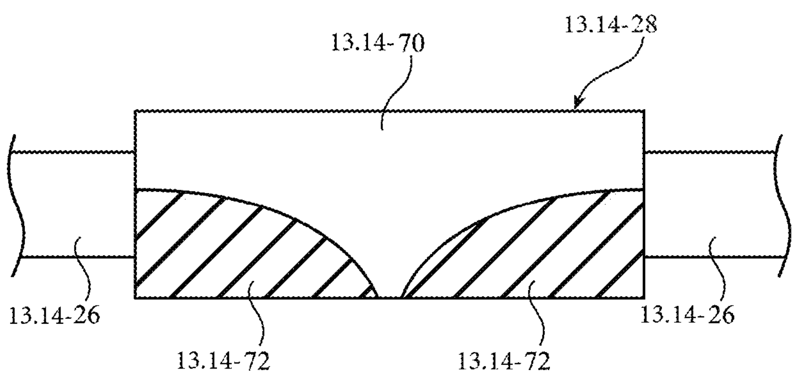
*FIG. 13.14-10*

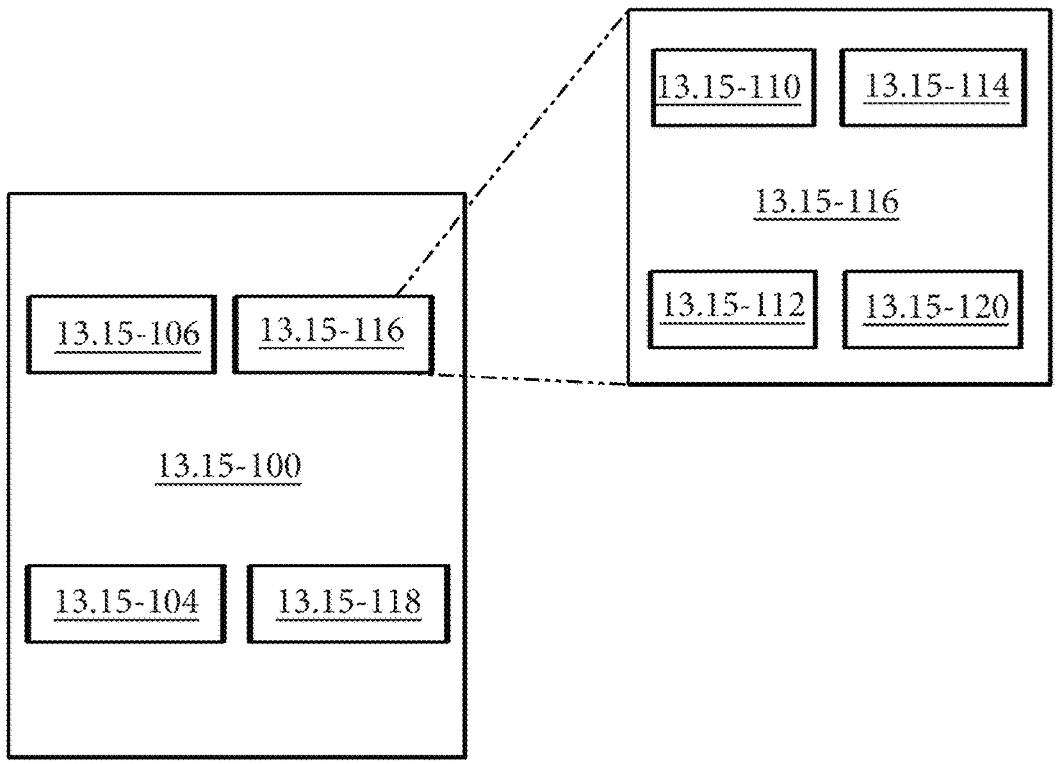
*FIG. 13.15-1A*
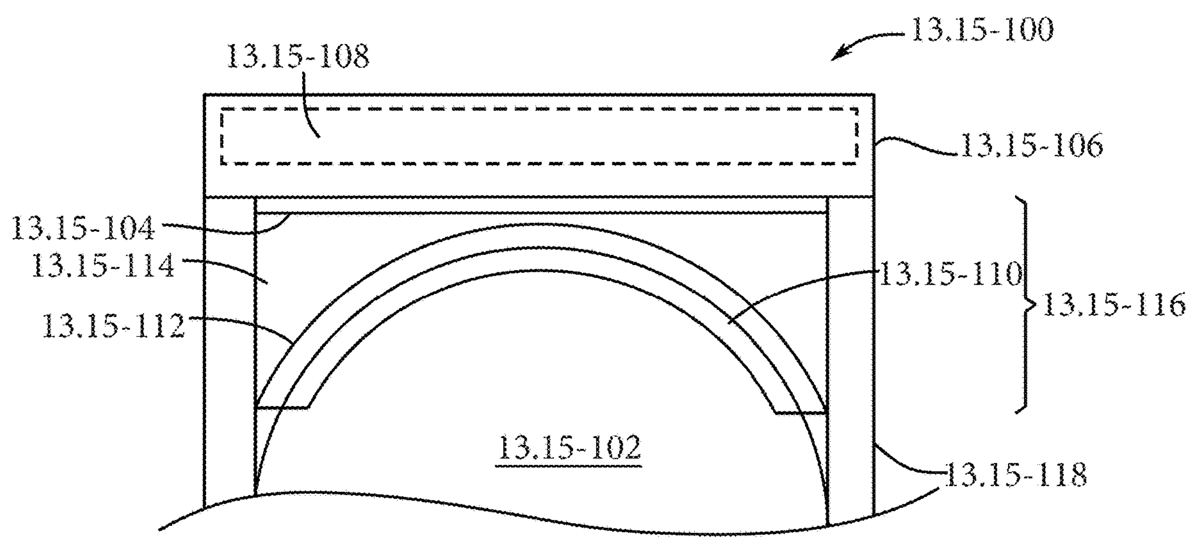
*FIG. 13.15-1B*

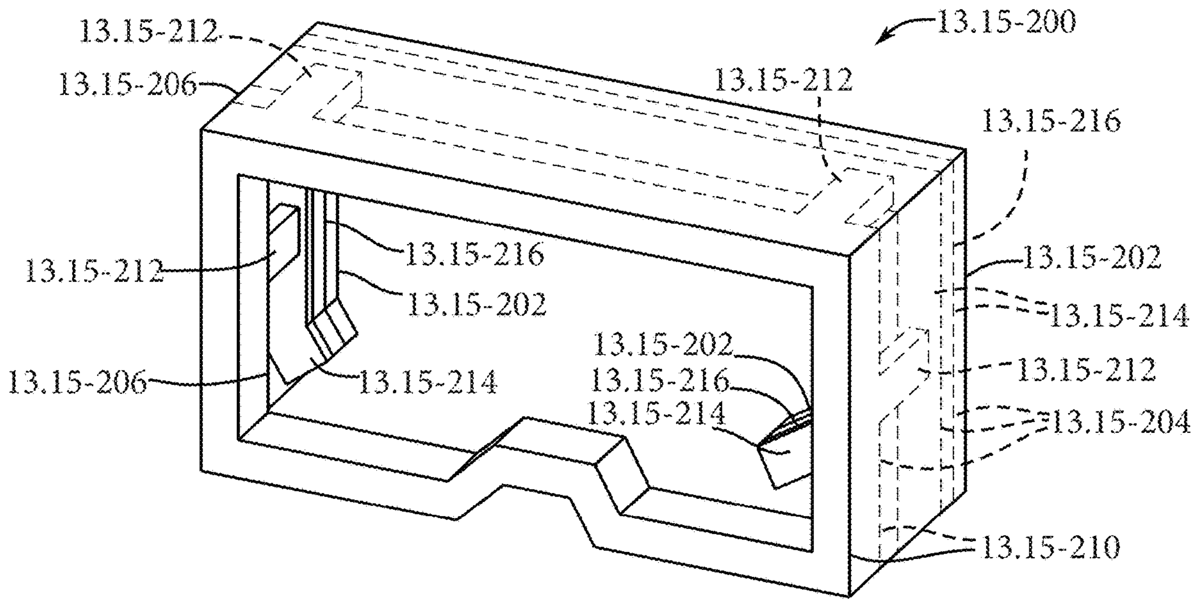
*FIG. 13.15-2A*
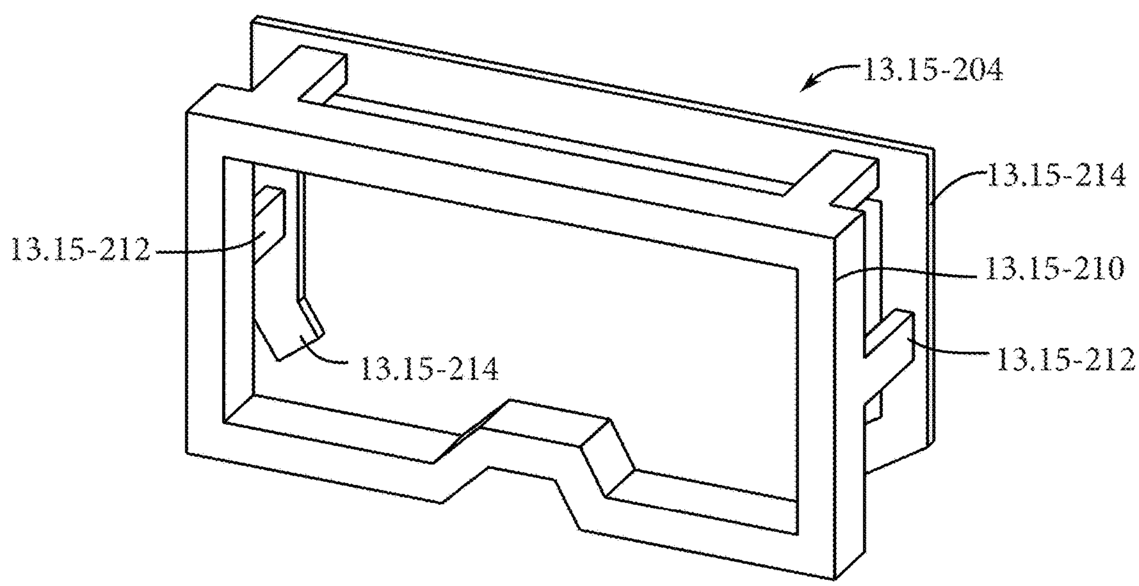
*FIG. 13.15-2B*

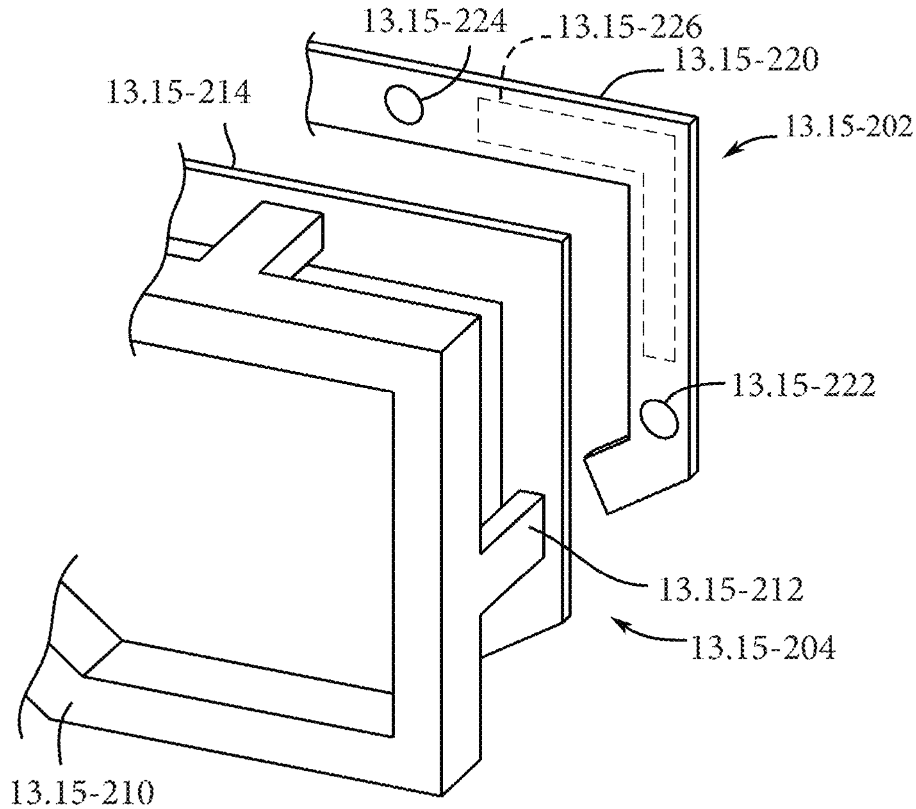
*FIG. 13.15-2C*
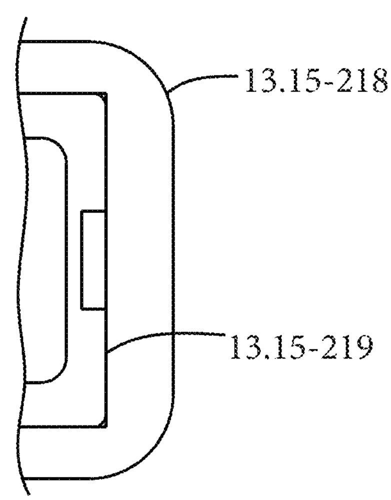
*FIG. 13.15-2D*

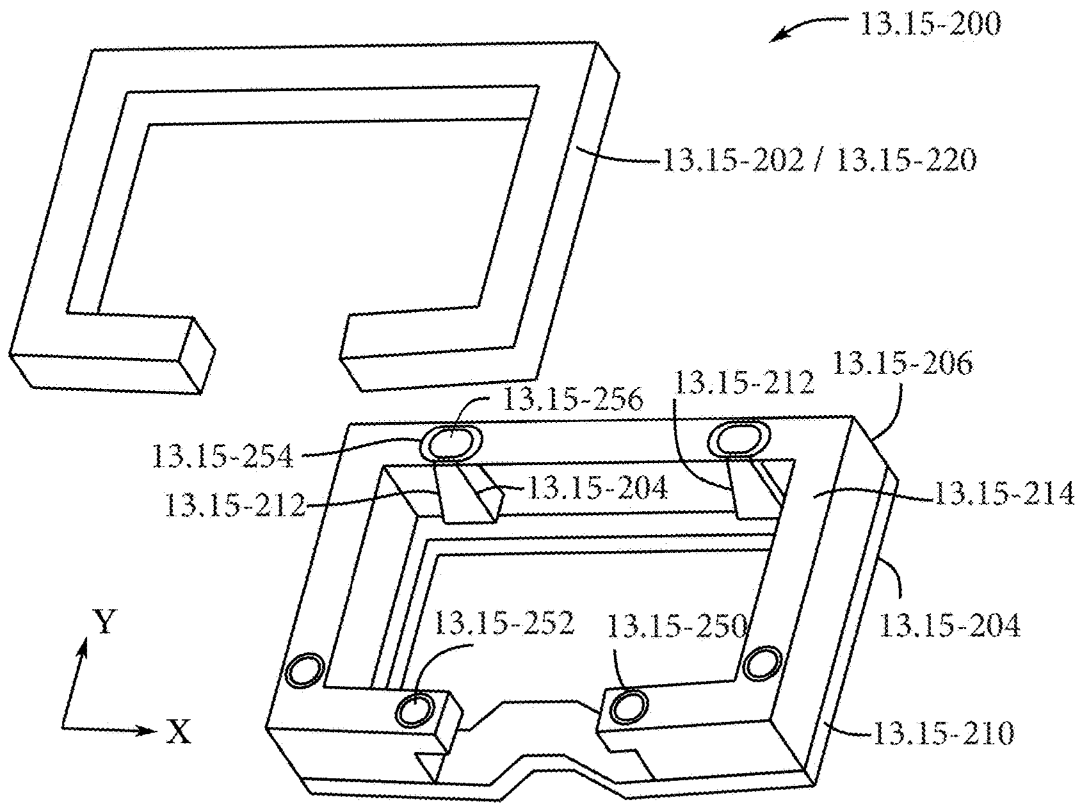
*FIG. 13.15-3A*
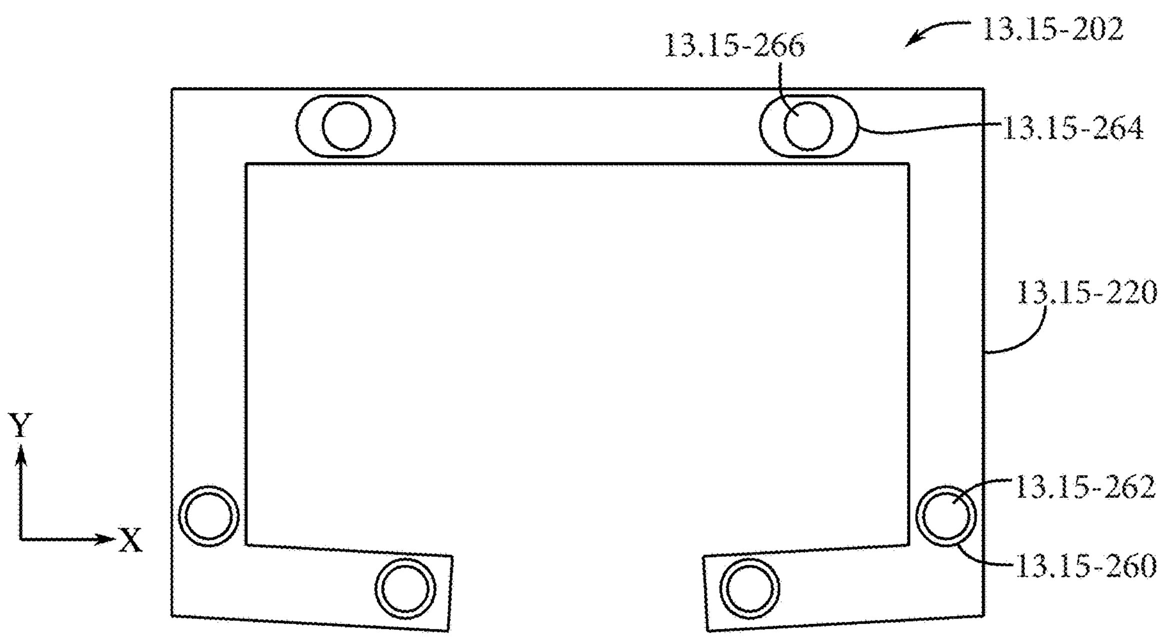
*FIG. 13.15-3B*

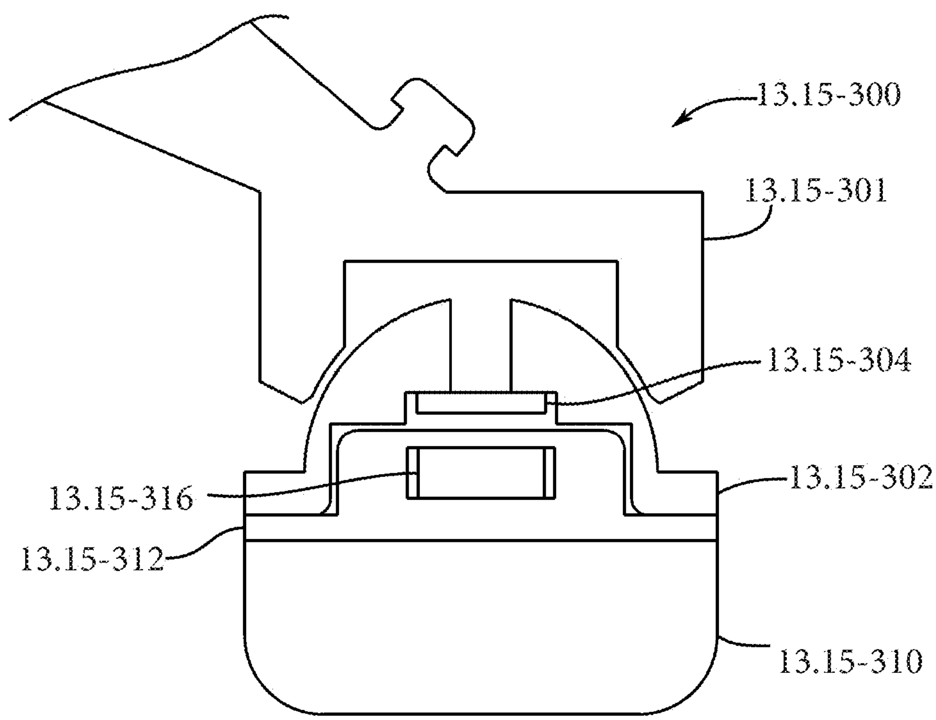
*FIG. 13.15-4*

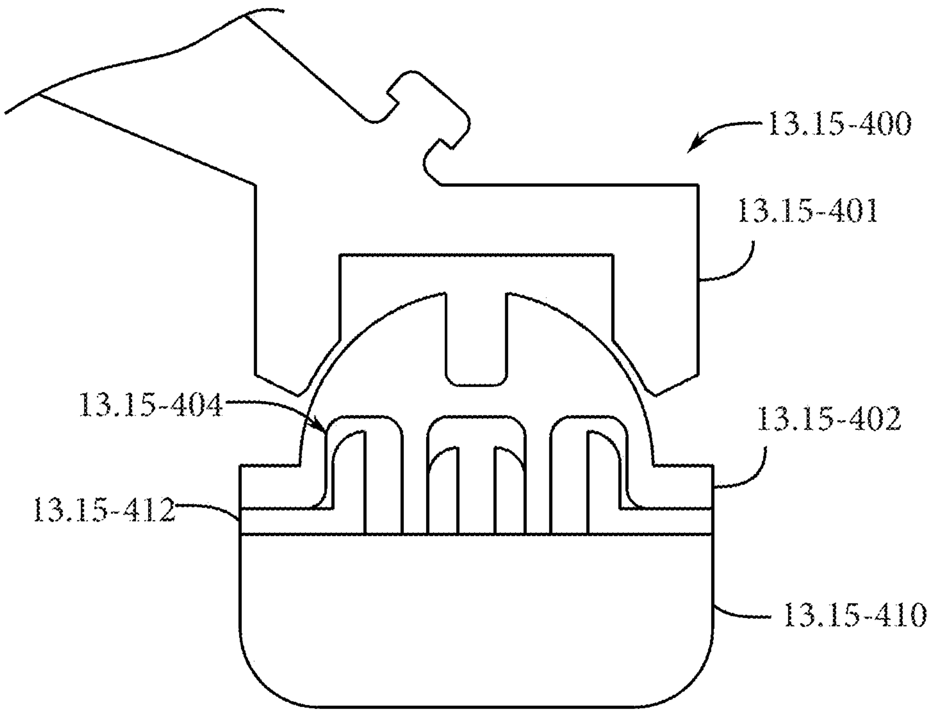
*FIG. 13.15-5A*
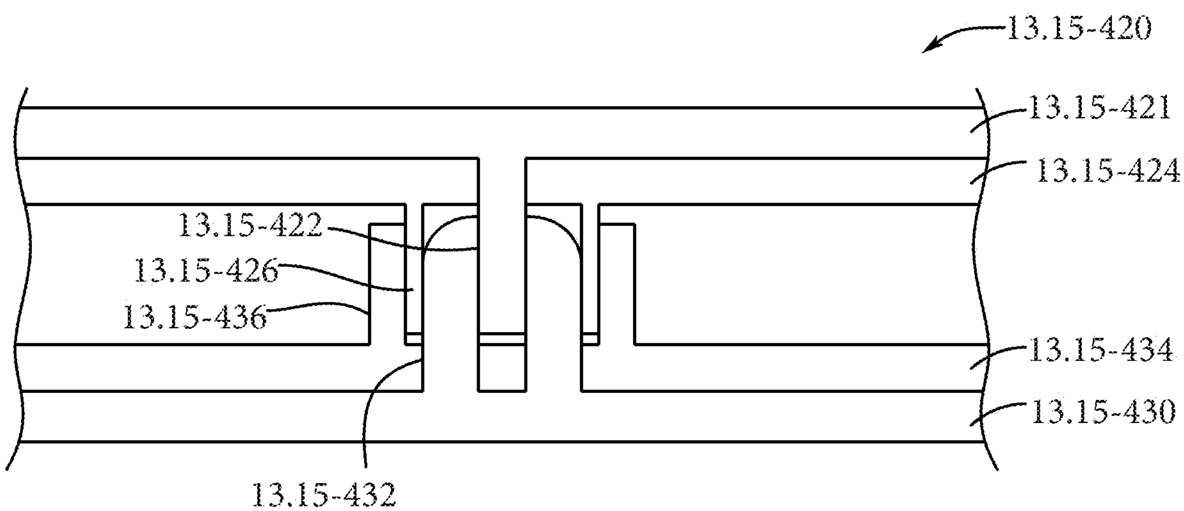
*FIG. 13.15-5B*

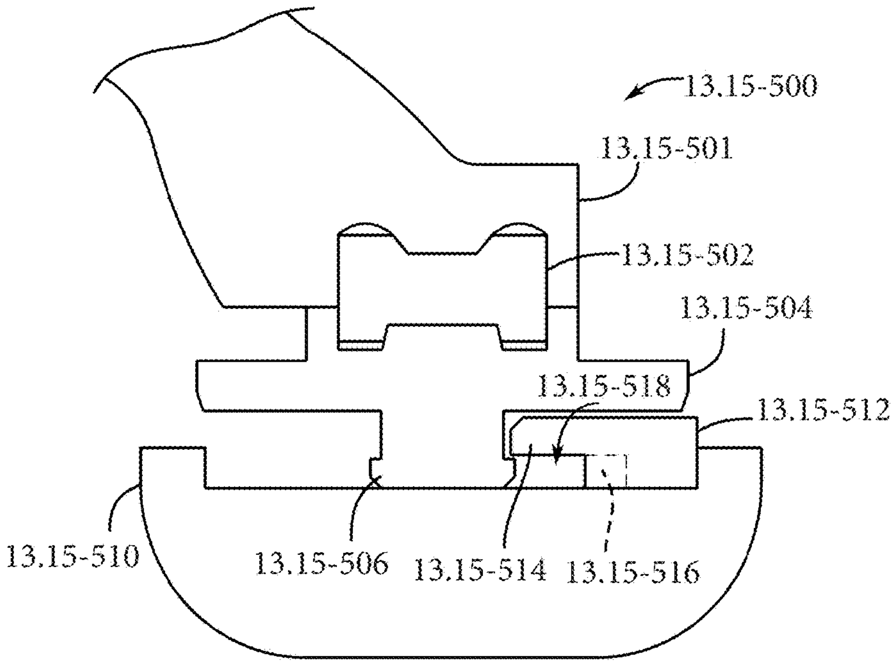
FIG. 13.15-6
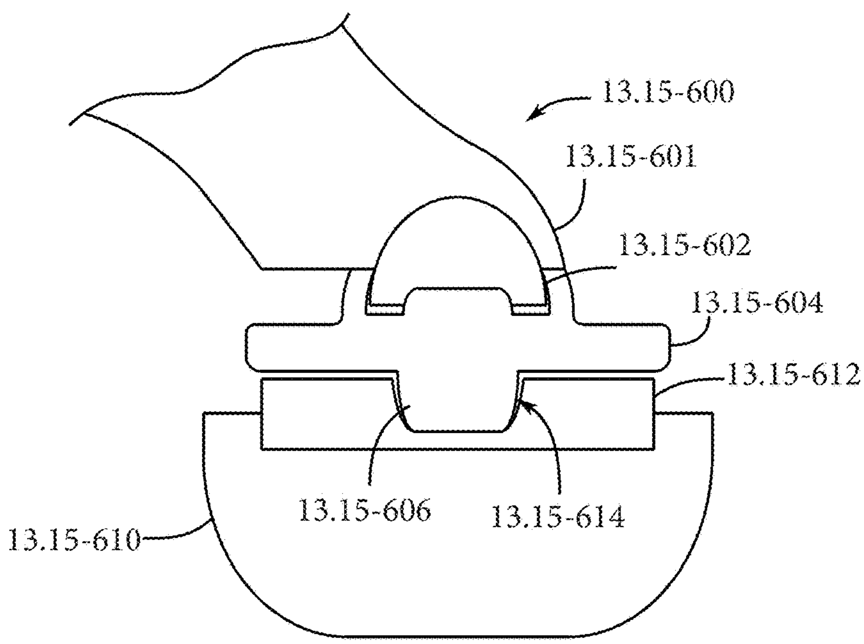
FIG. 13.15-7

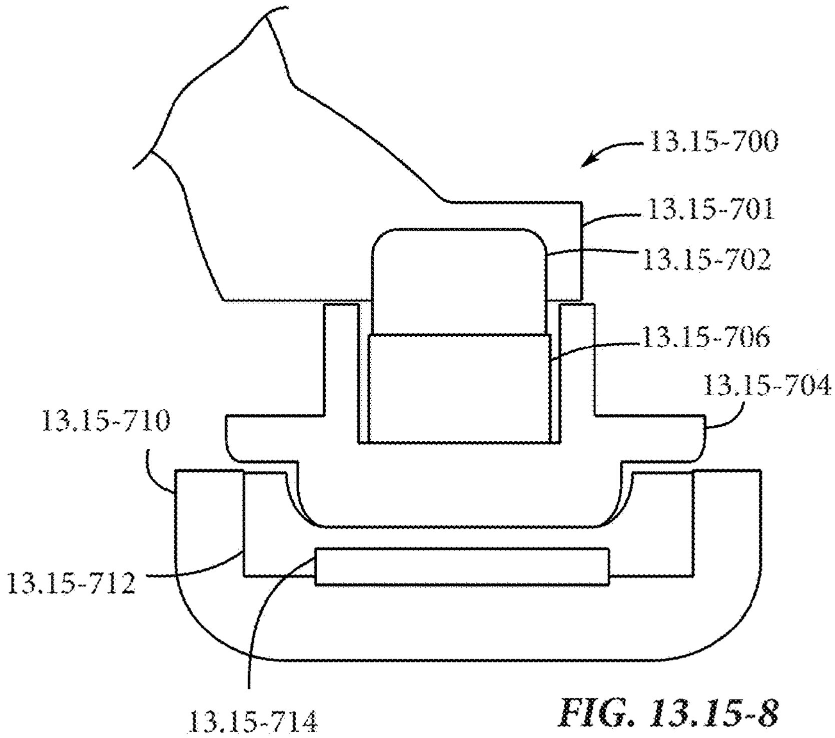
*FIG. 13.15-8*
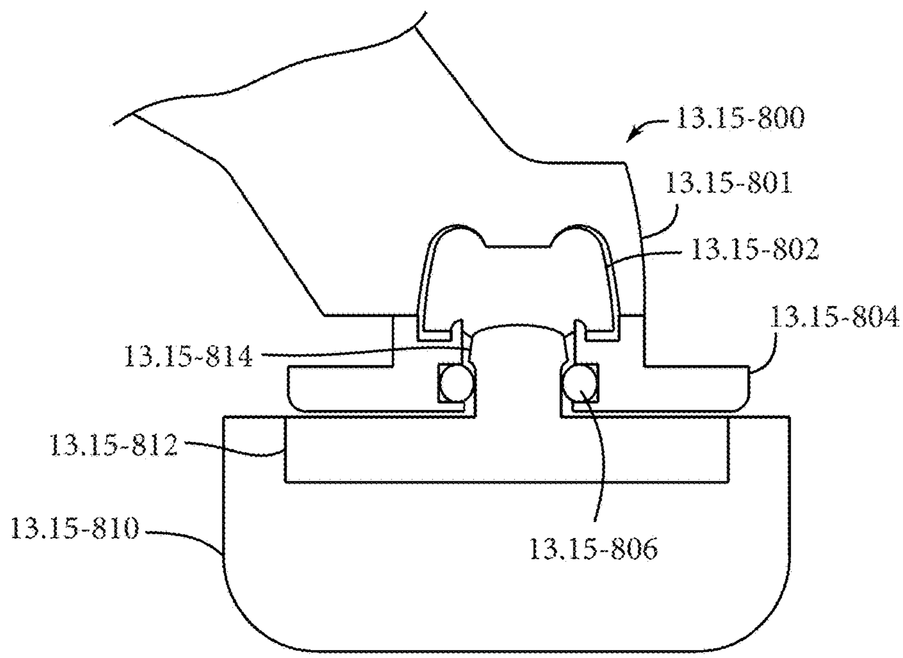
*FIG. 13.15-9*

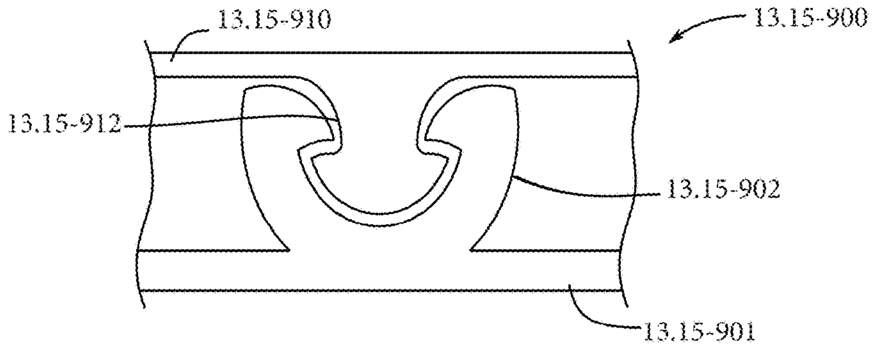
FIG. 13.15-10
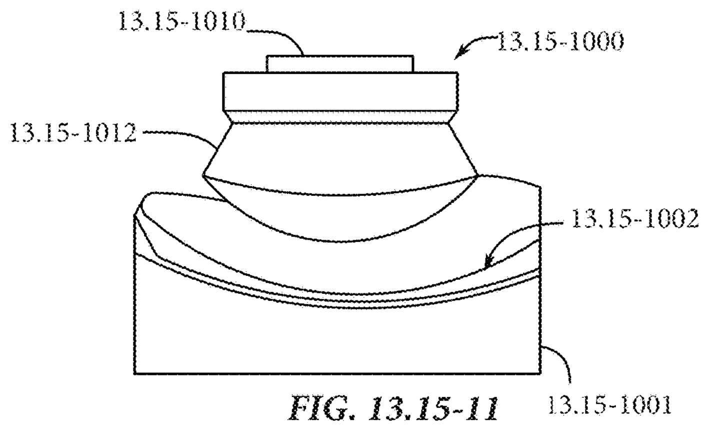
FIG. 13.15-11
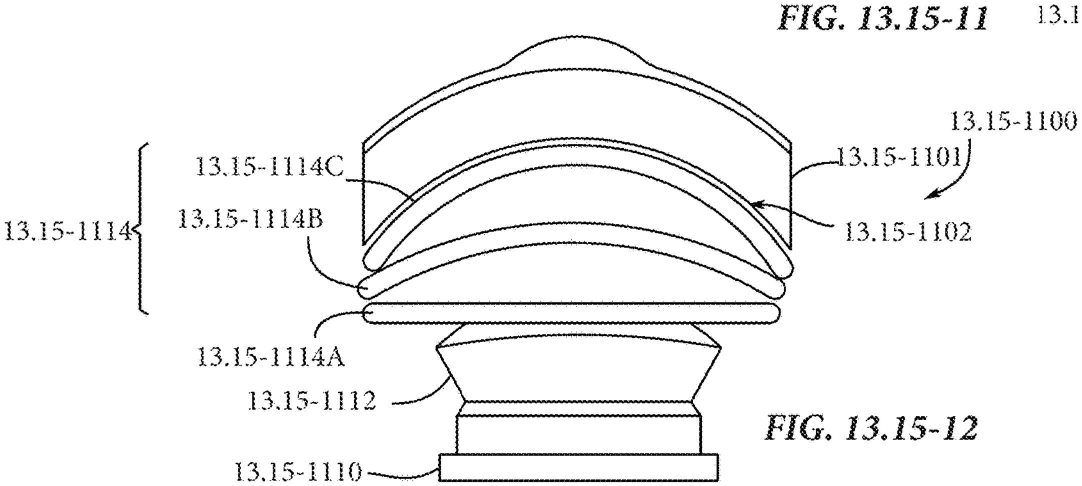
FIG. 13.15-12

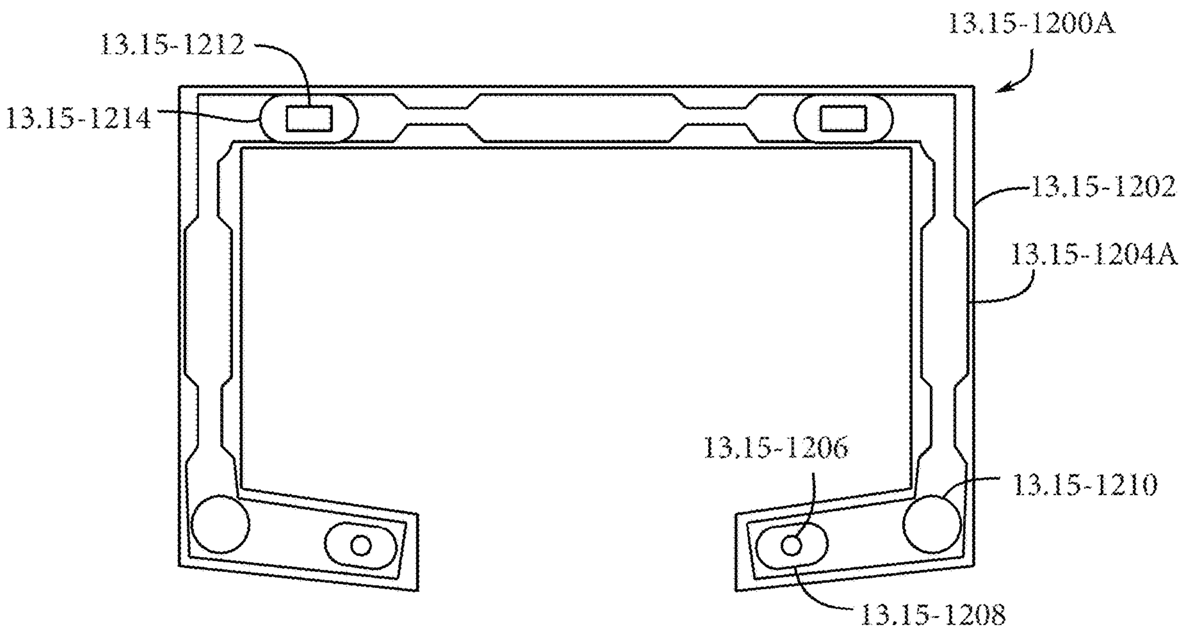
*FIG. 13.15-13A*
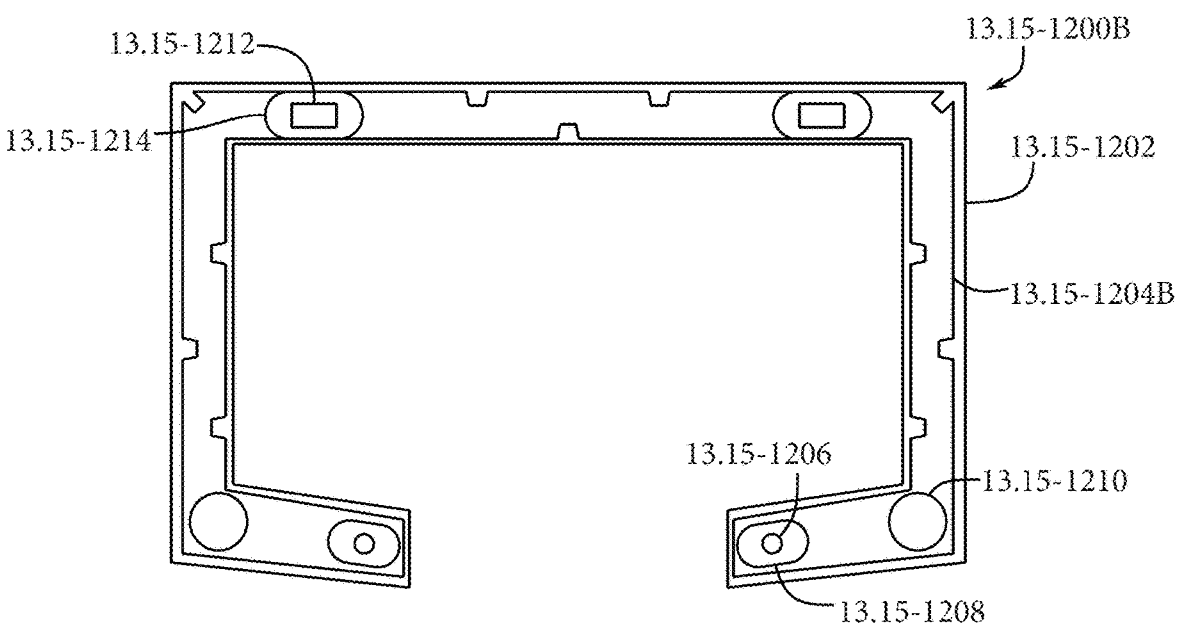
*FIG. 13.15-13B*

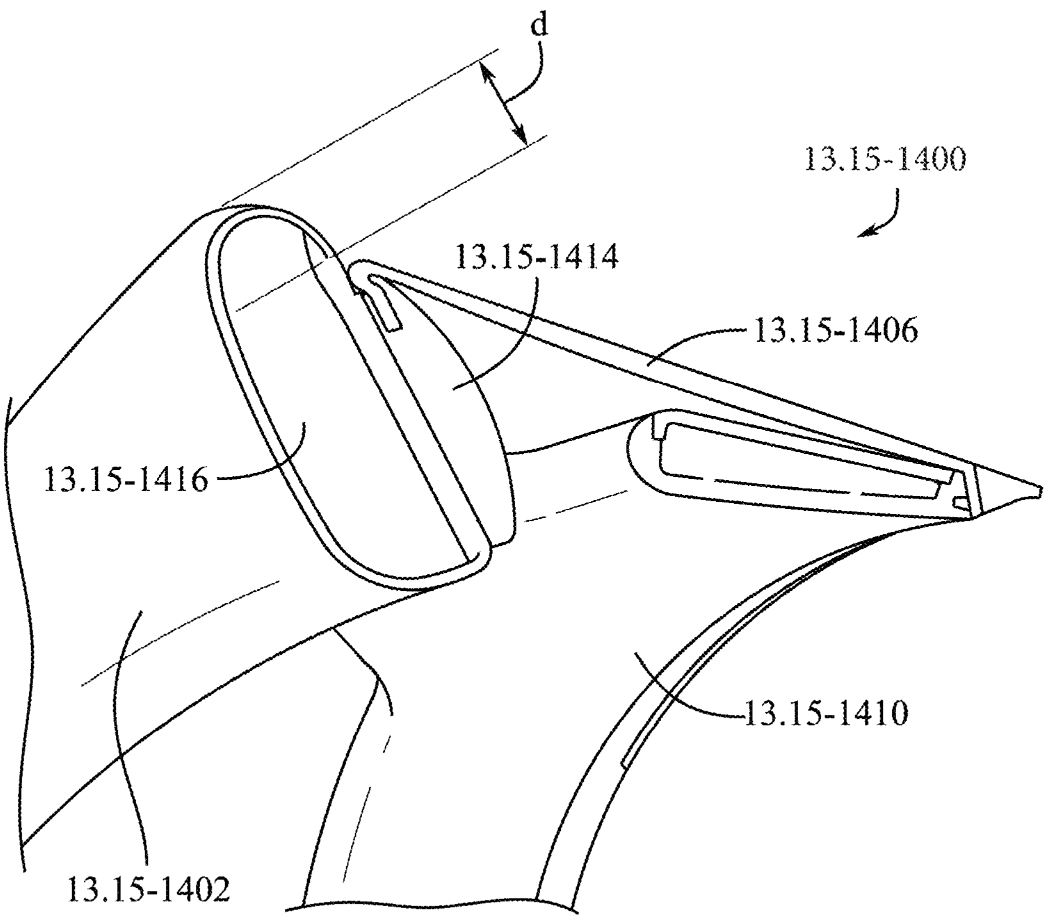
*FIG. 13.15-14*

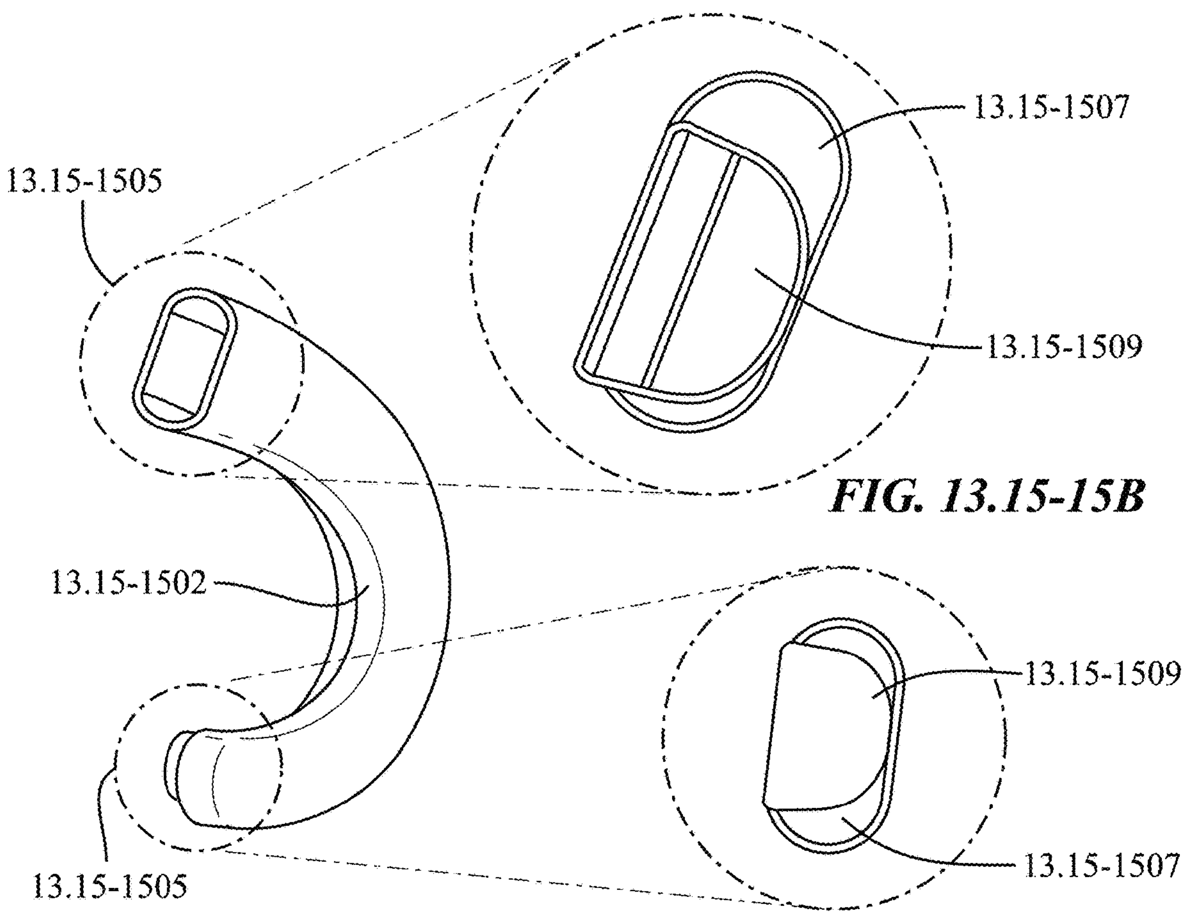
FIG. 13.15-15B
FIG. 13.15-15A
FIG. 13.15-15C

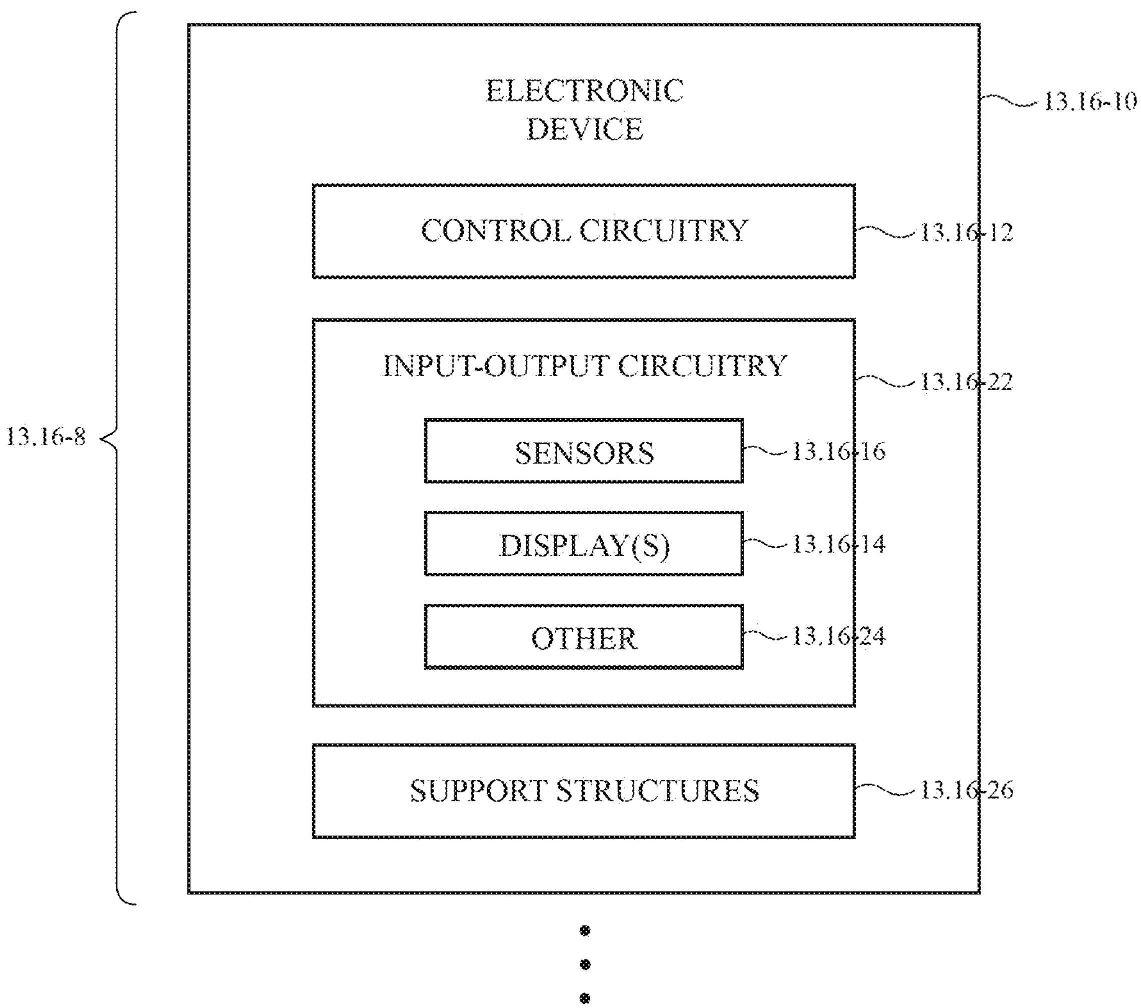
*FIG. 13.16-1*

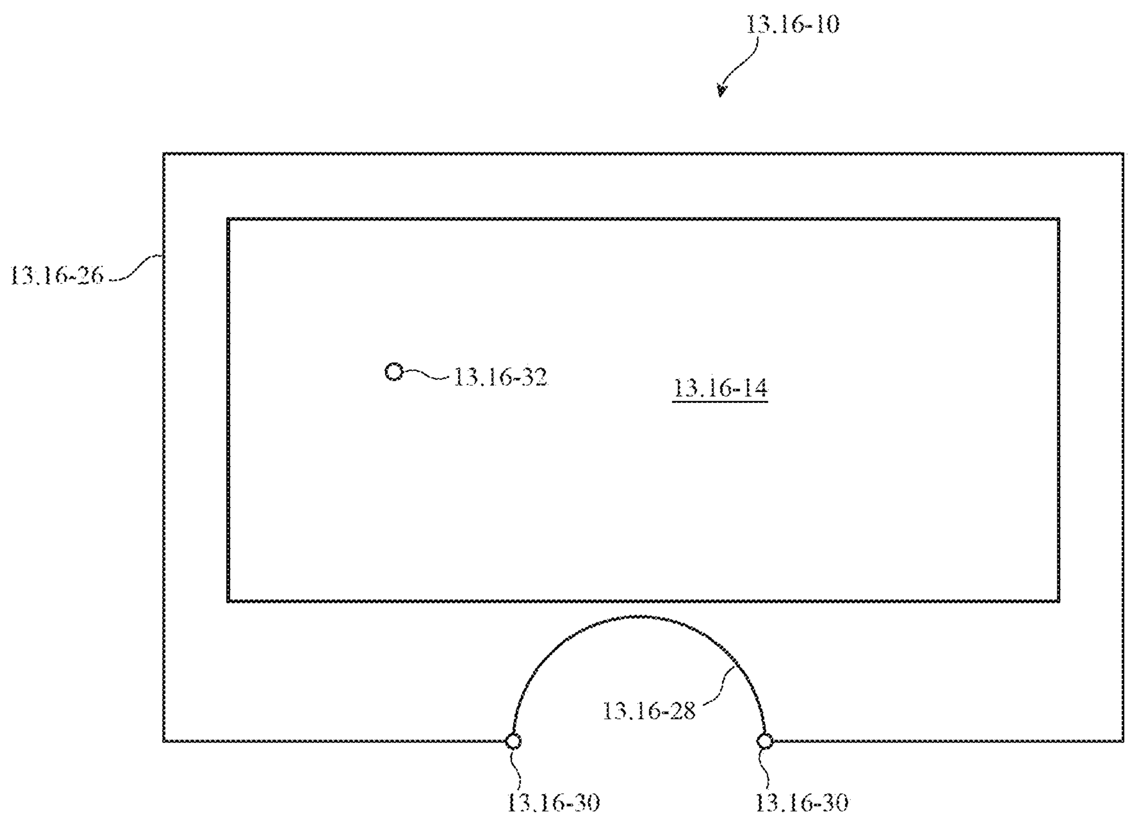
*FIG. 13.16-2*

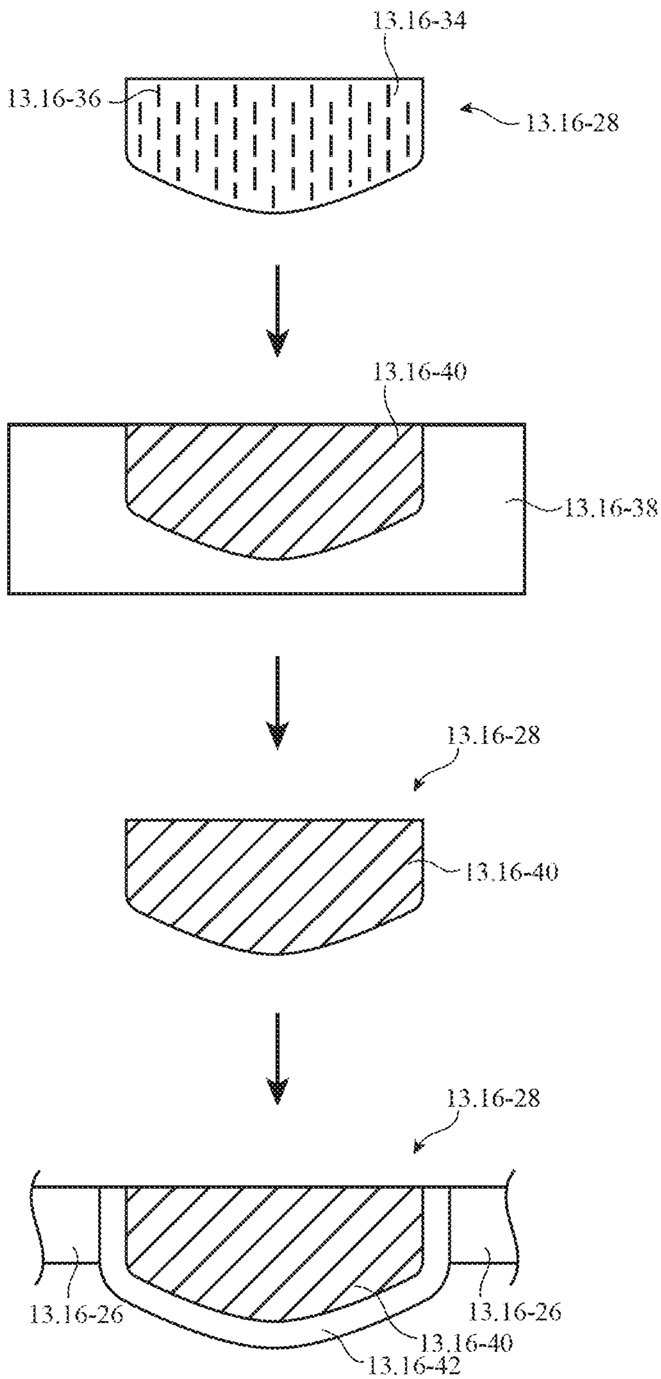
*FIG. 13.16-3*

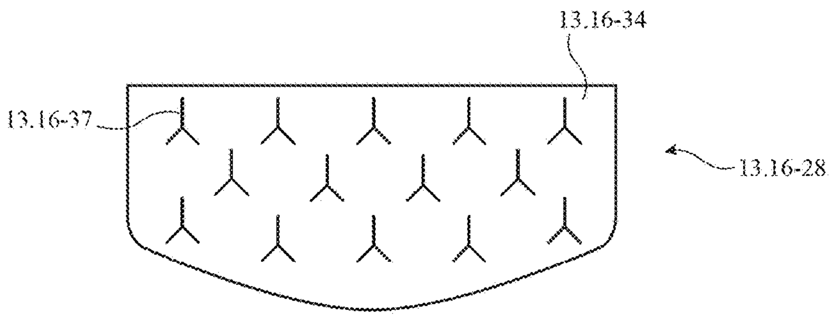
*FIG. 13.16-4A*
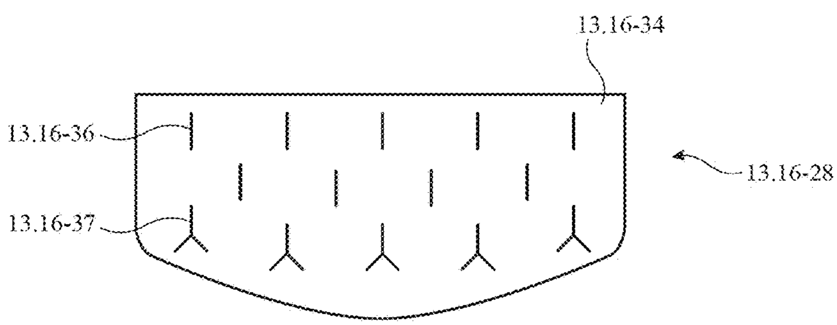
*FIG. 13.16-4B*

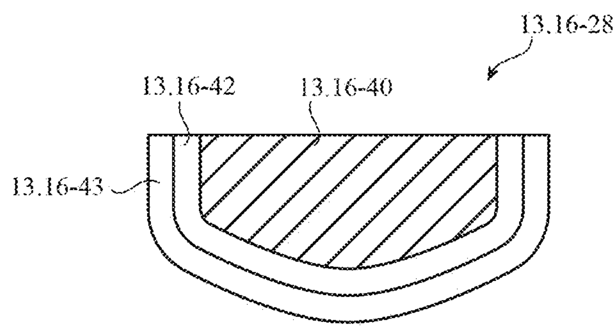
*FIG. 13.16-5*

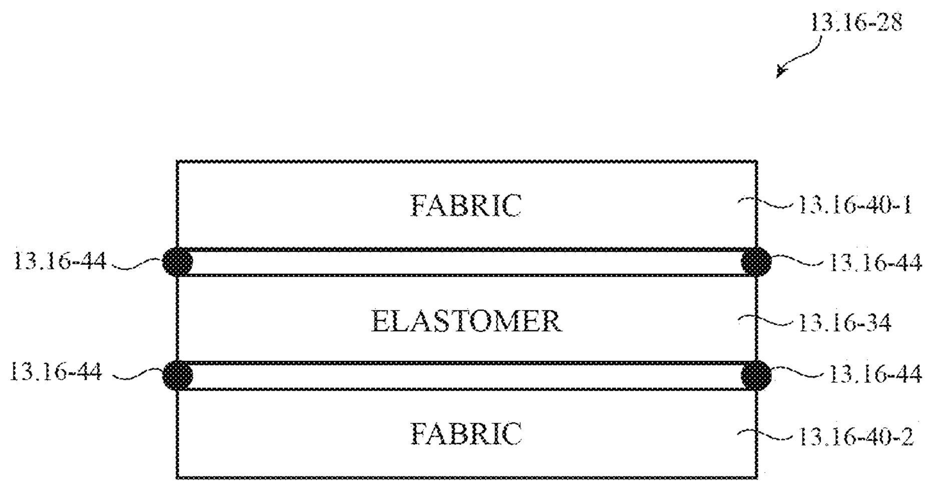
*FIG. 13.16-6*

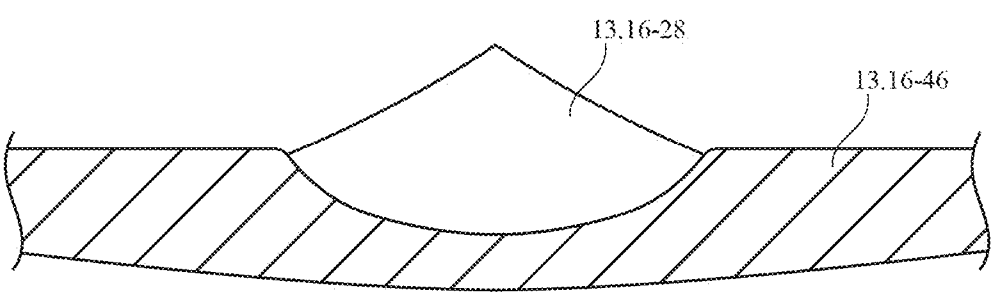
*FIG. 13.16-7*

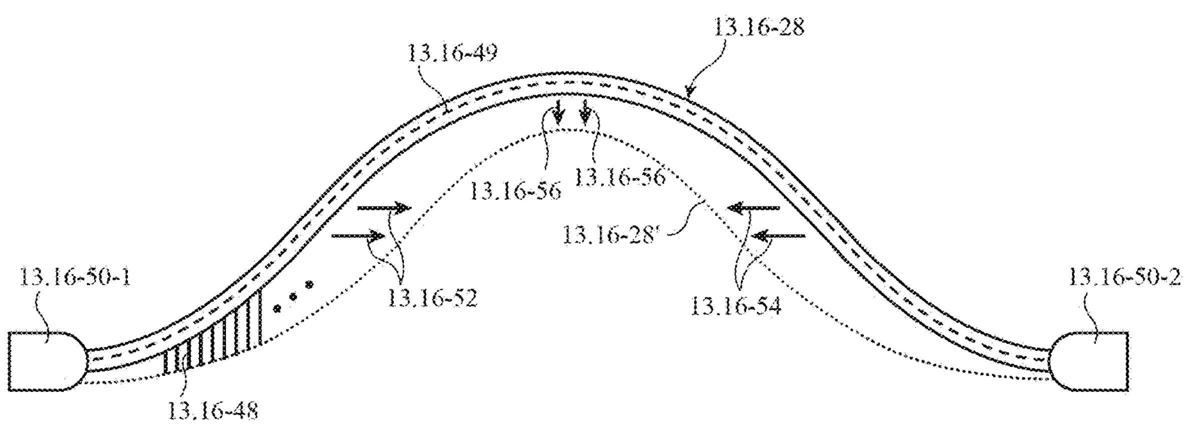
*FIG. 13.16-8*

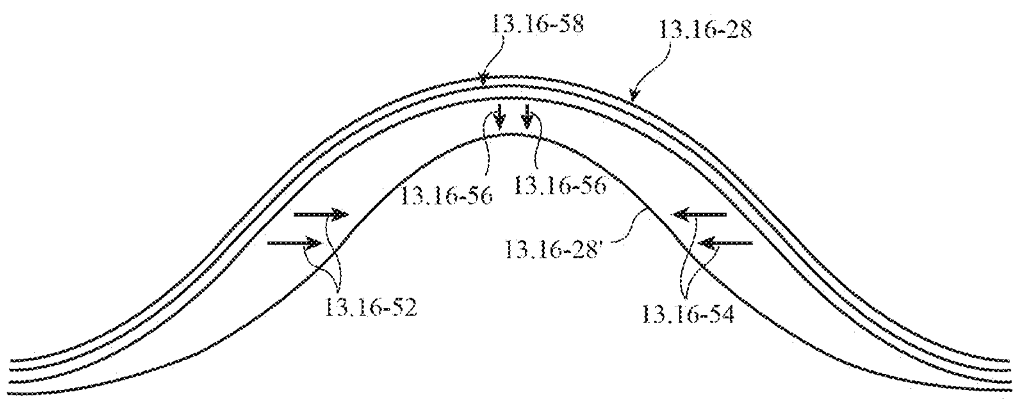
*FIG. 13.16-9*

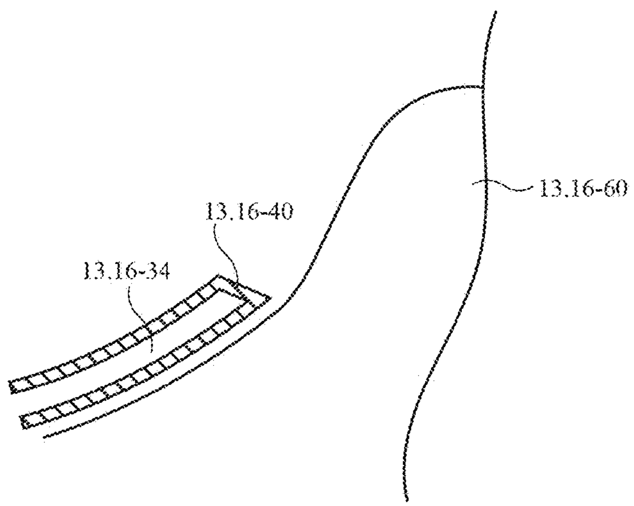
FIG. 13.16-10A
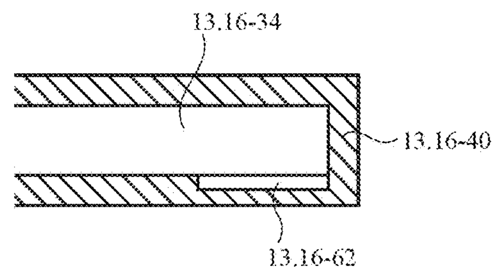
FIG. 13.16-10B
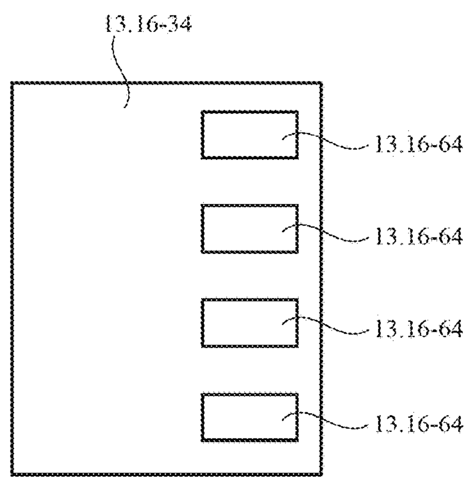
FIG. 13.16-10C

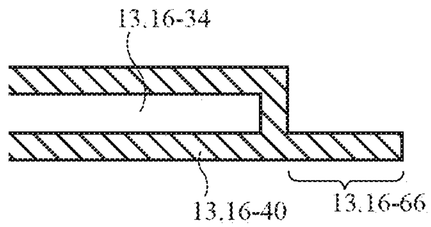
*FIG. 13.16-10D*
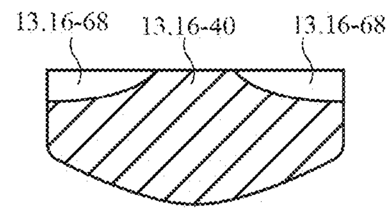
*FIG. 13.16-10E*
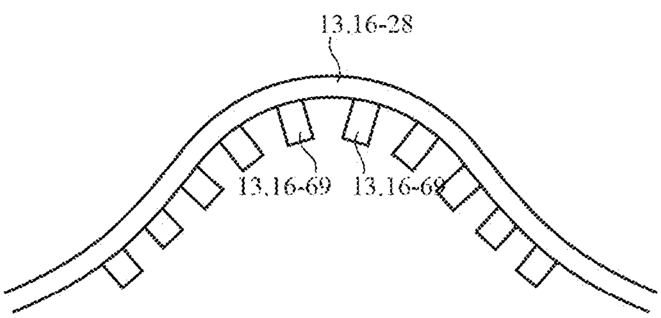
*FIG. 13.16-10F*
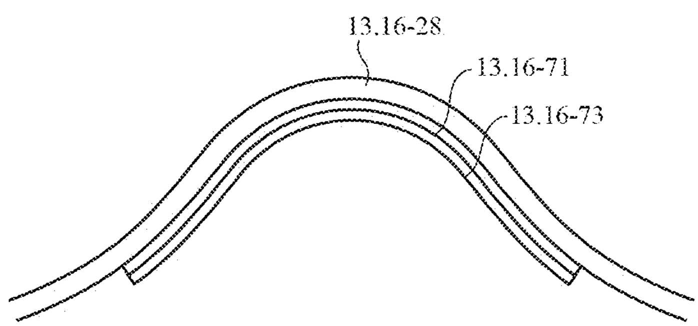
*FIG. 13.16-10G*

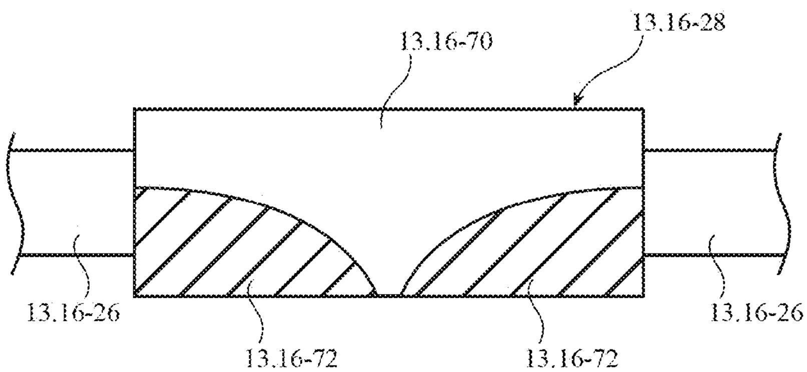
*FIG. 13.16-11*

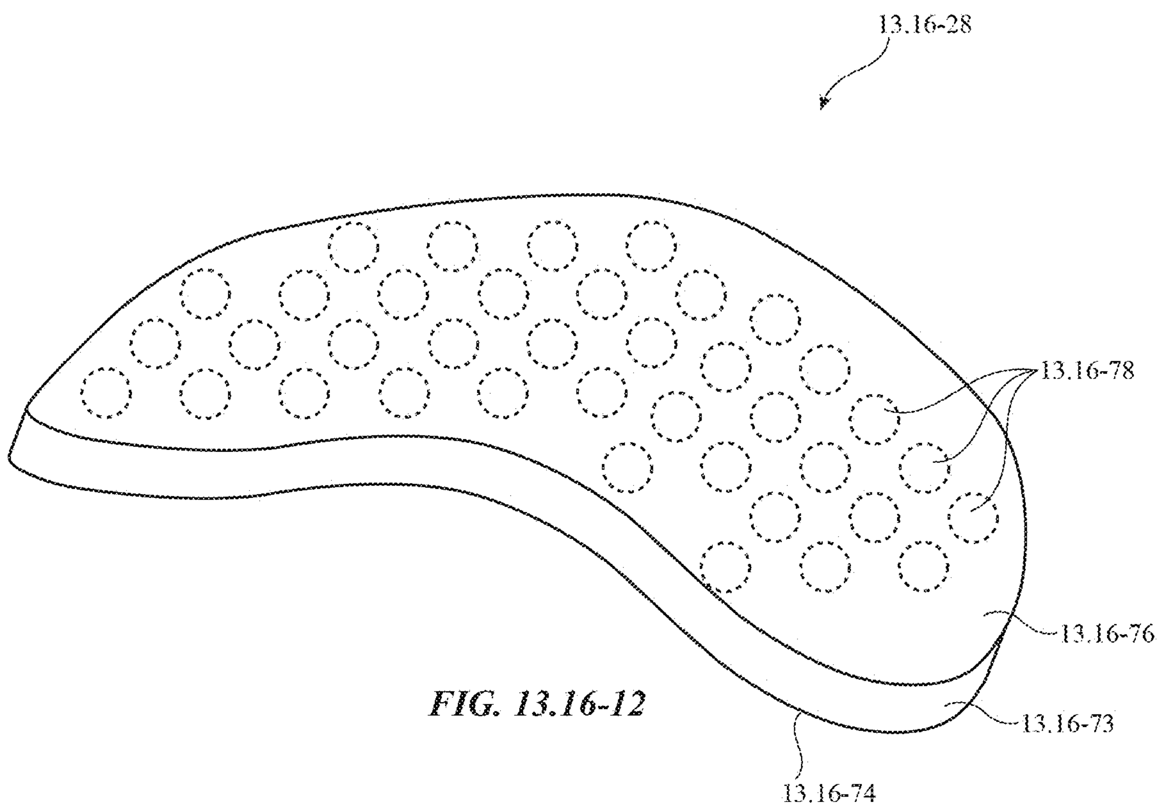
*FIG. 13.16-12*

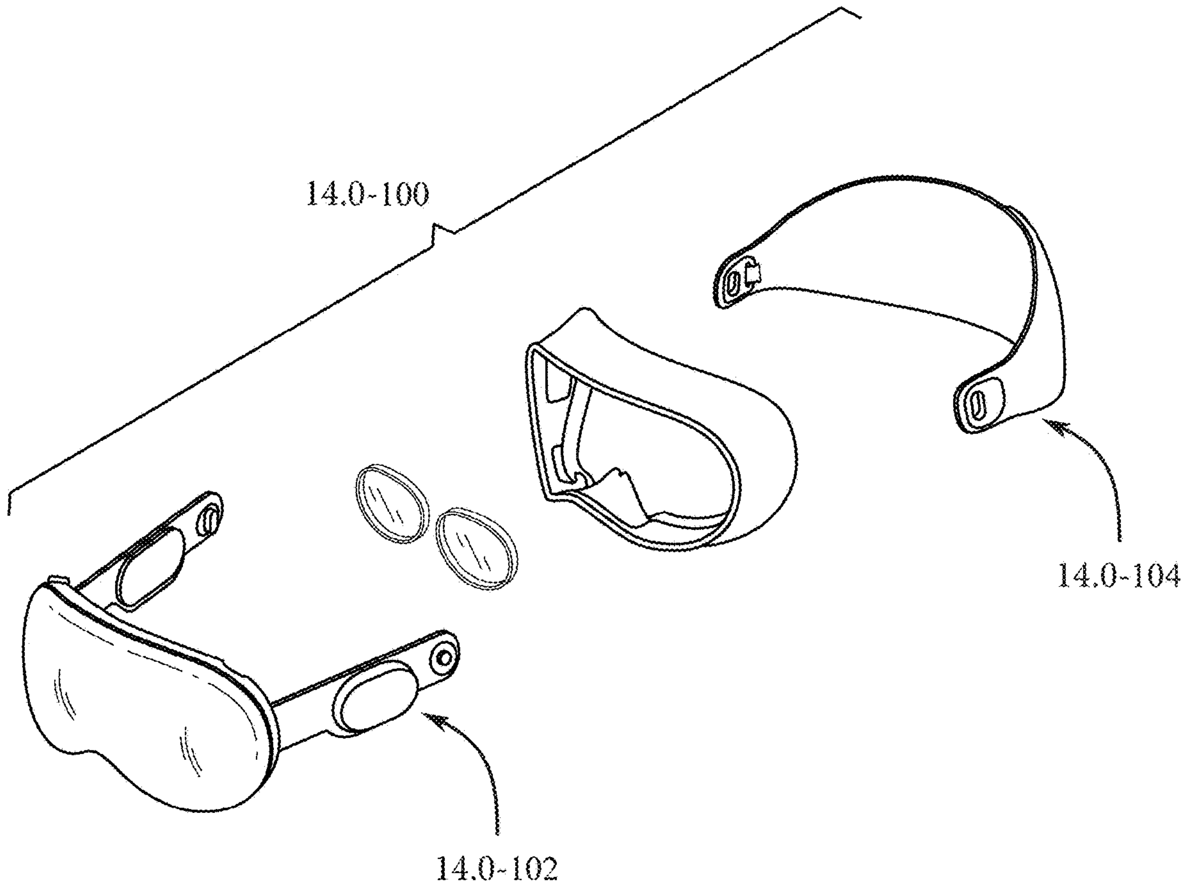
*FIG. 14.0-1*

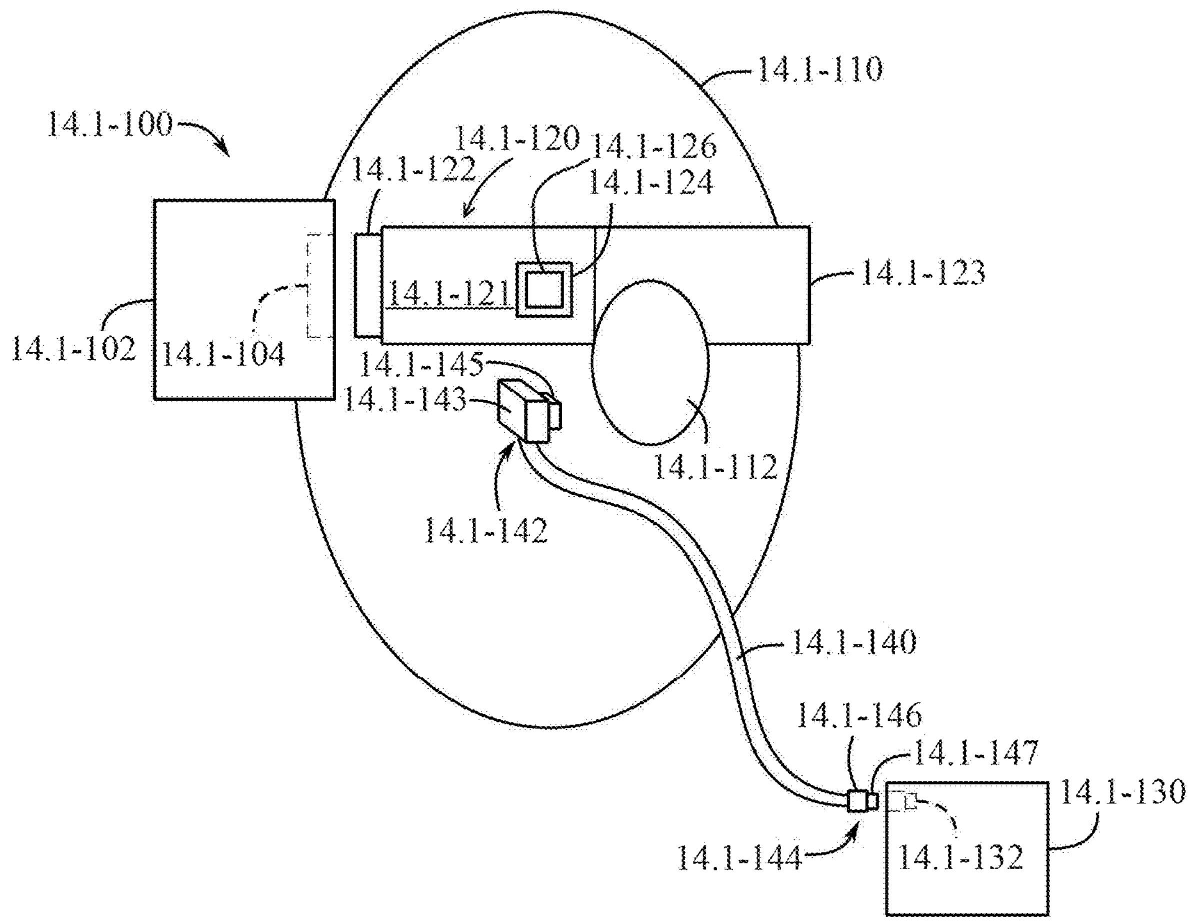
*FIG. 14.1-1A*

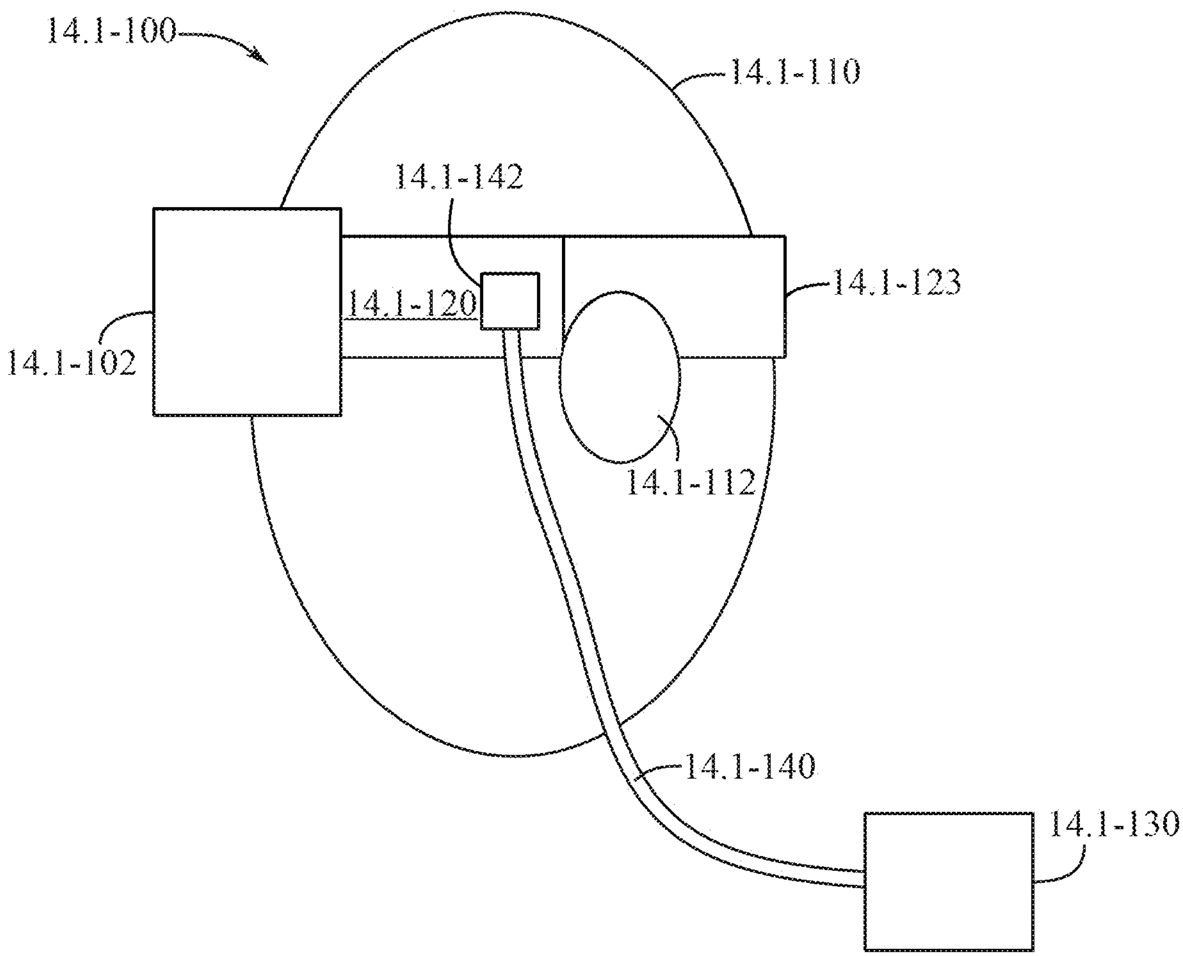
*FIG. 14.1-1B*

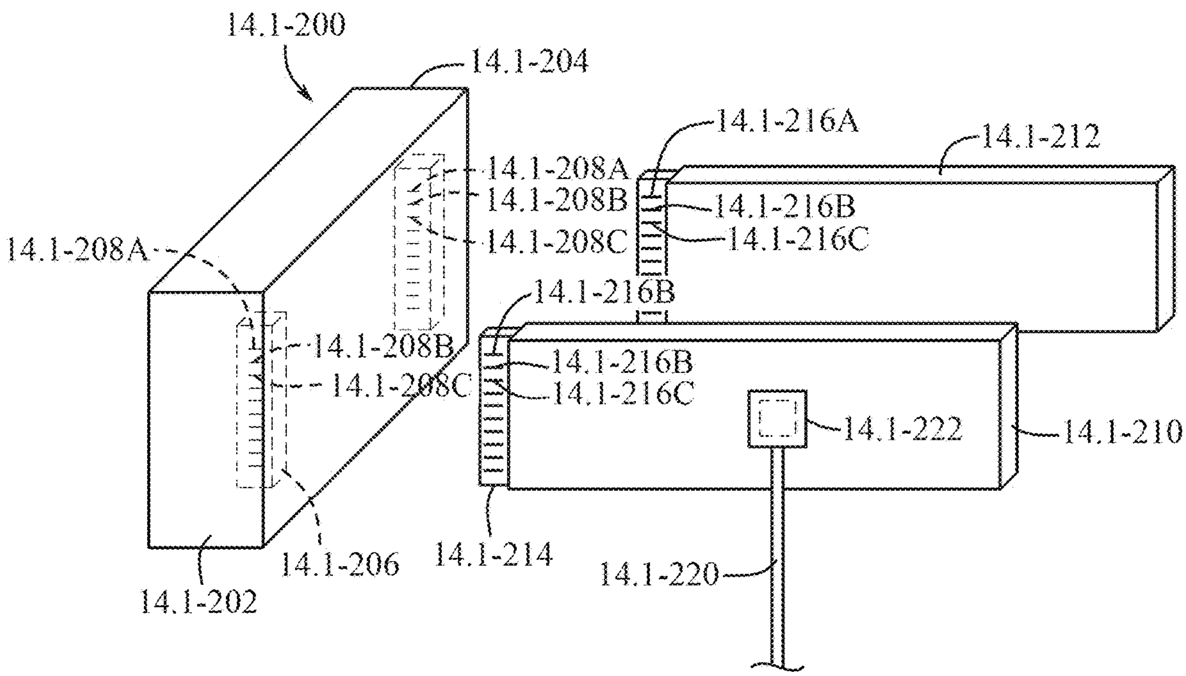
FIG. 14.1-2

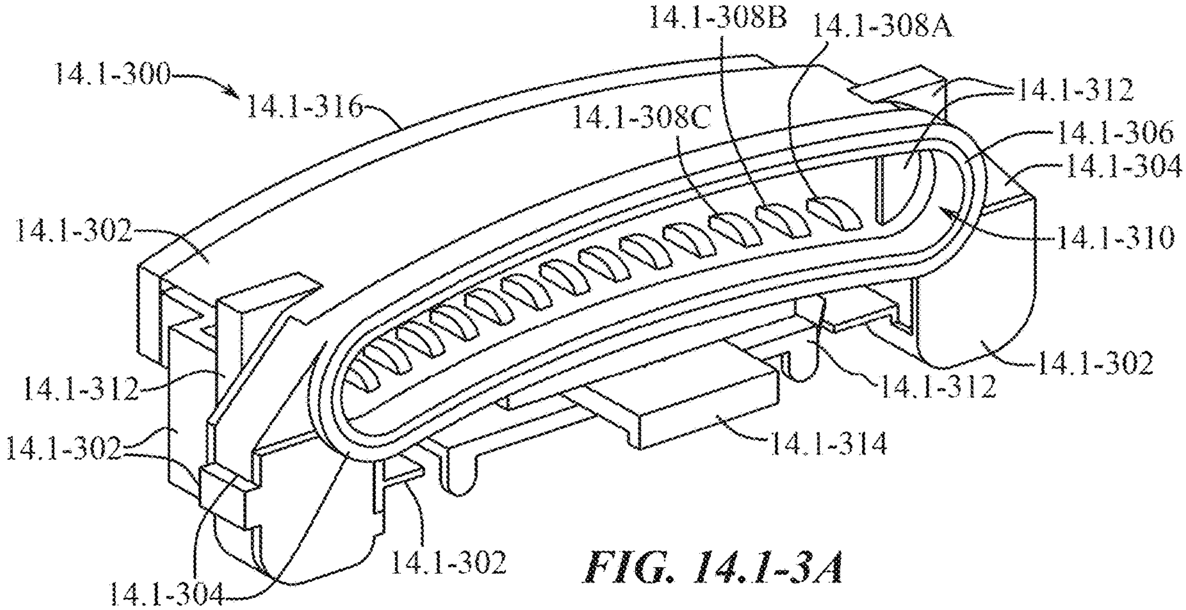
FIG. 14.1-3A
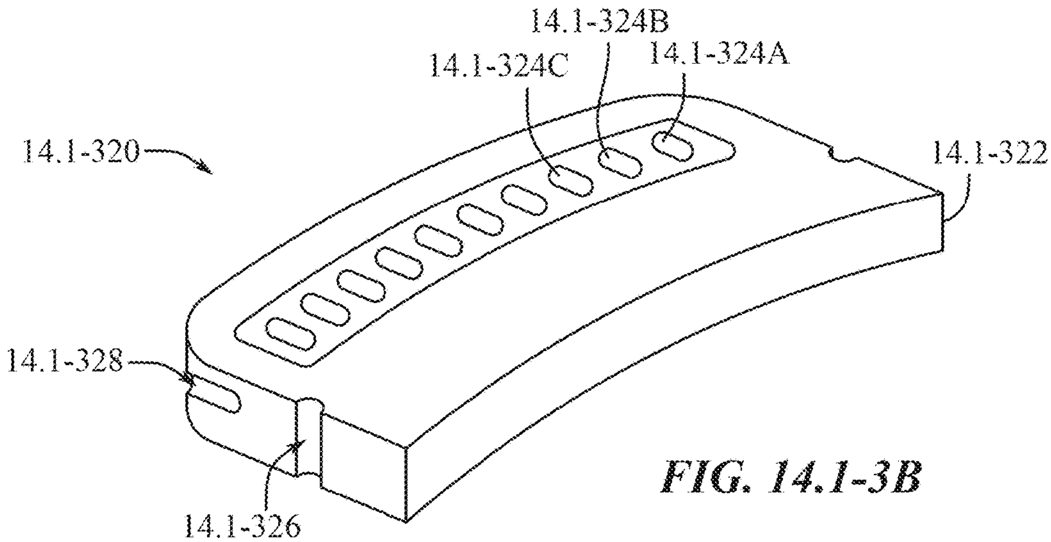
FIG. 14.1-3B

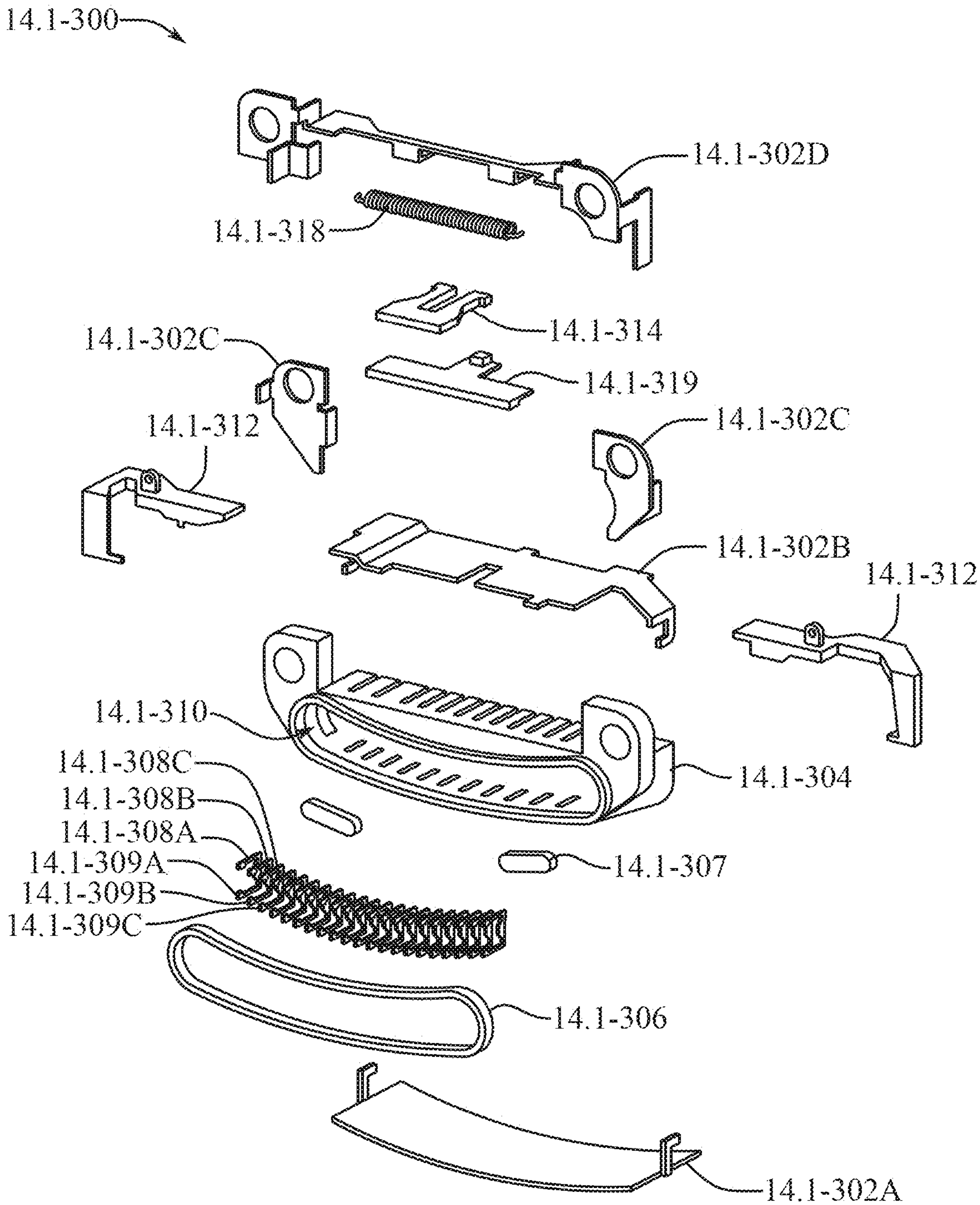
*FIG. 14.1-4*

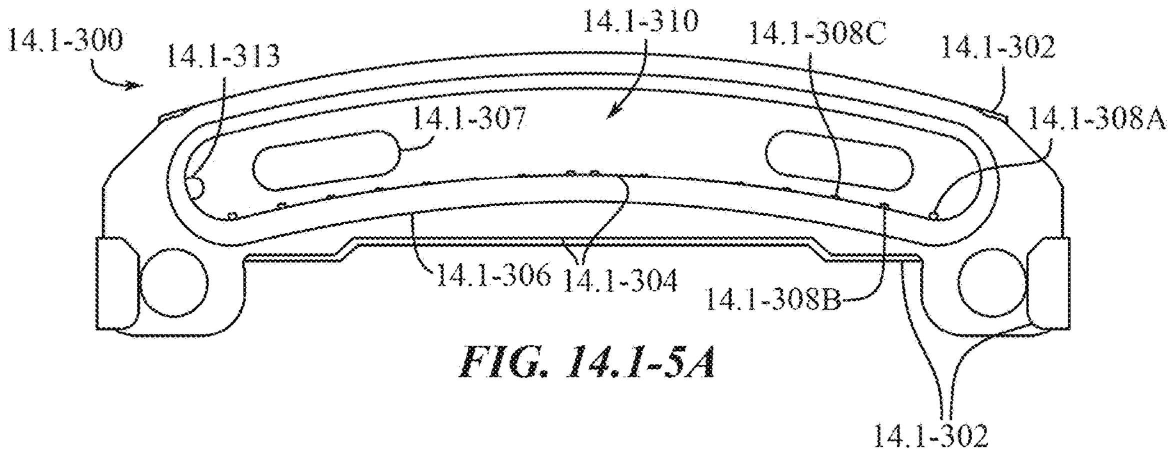
*FIG. 14.1-5A*
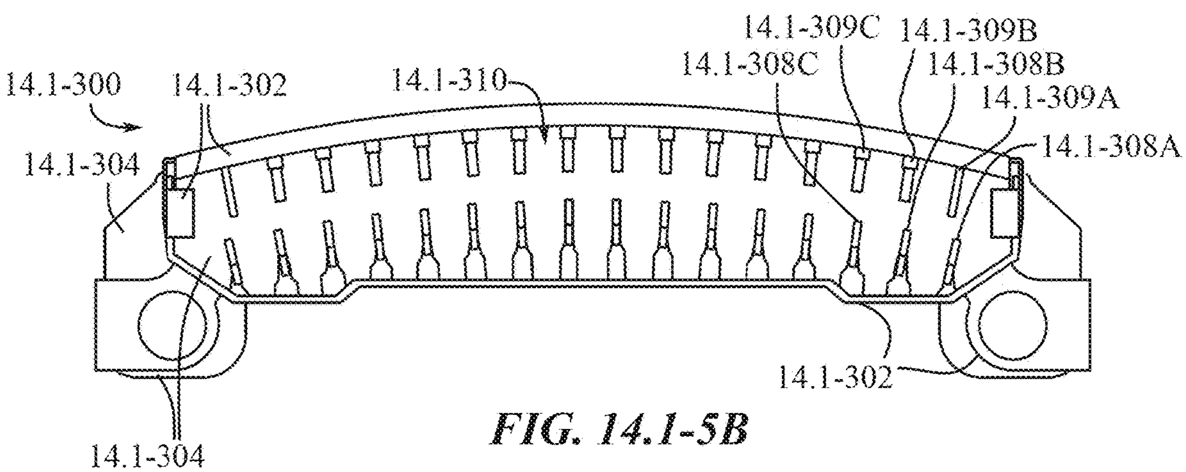
*FIG. 14.1-5B*

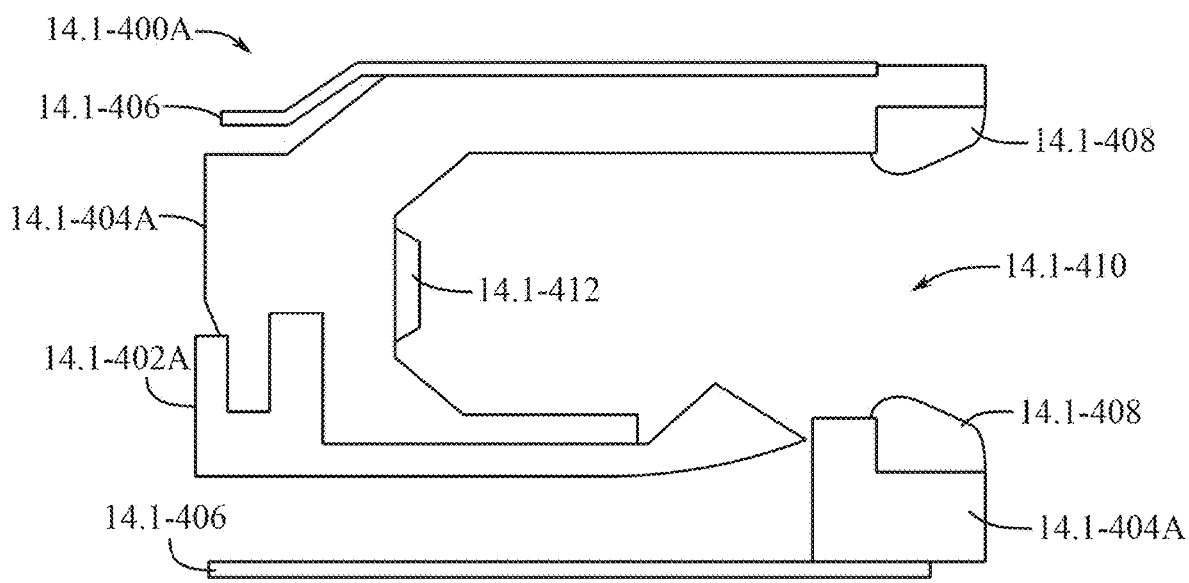
*FIG. 14.1-6A*
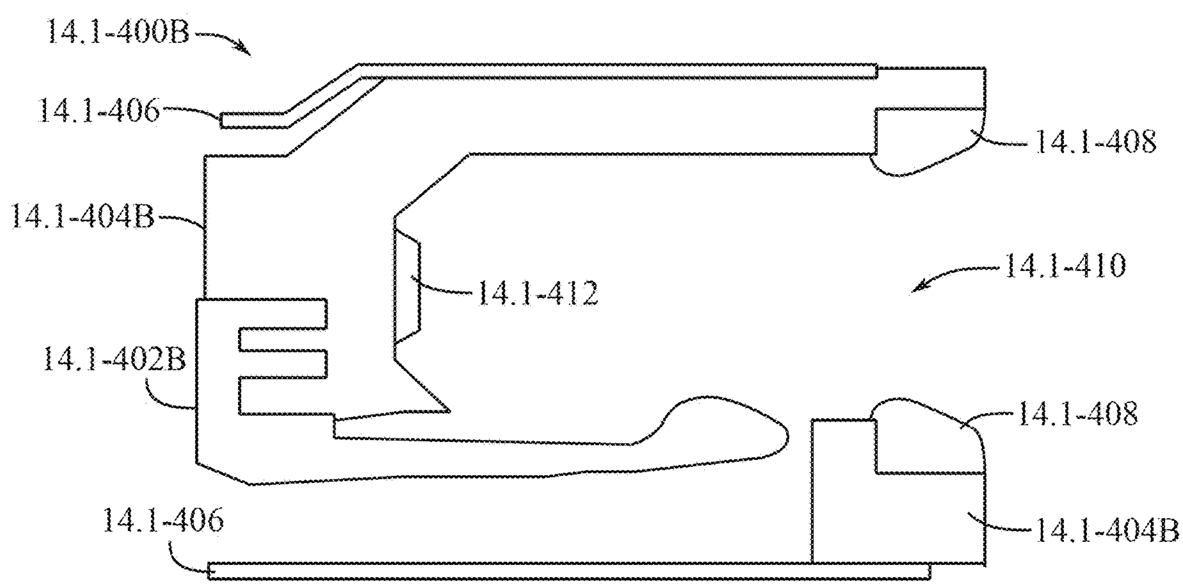
*FIG. 14.1-6B*

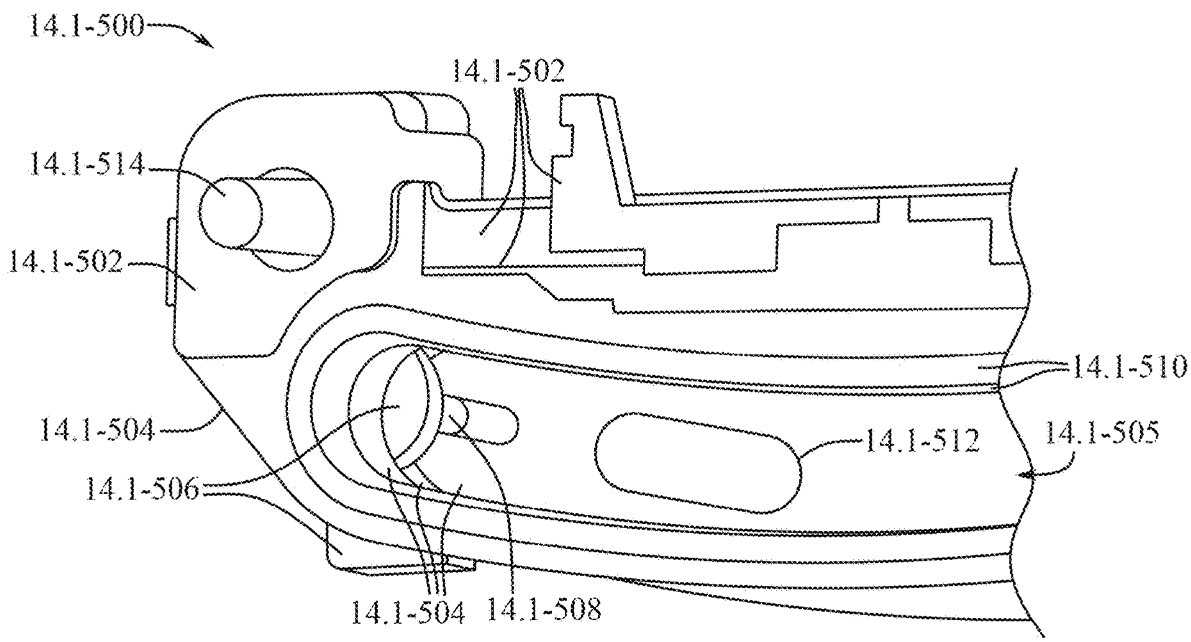
*FIG. 14.1-7A*
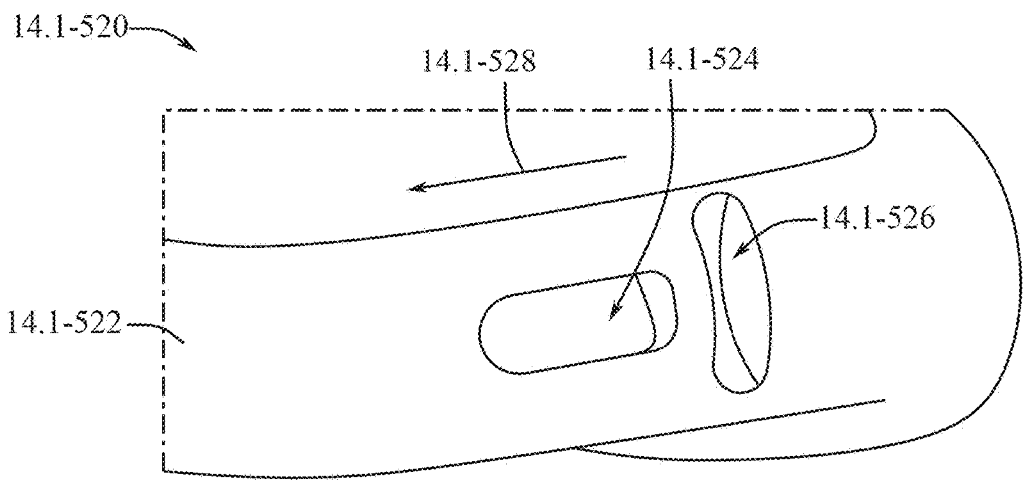
*FIG. 14.1-7B*

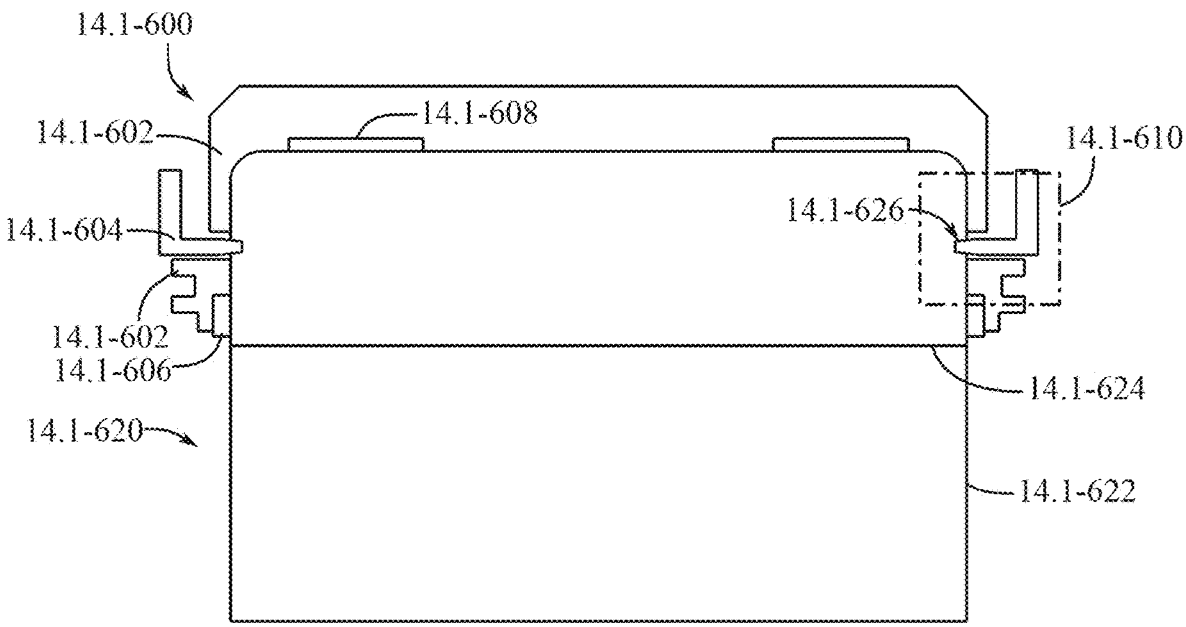
FIG. 14.1-8A
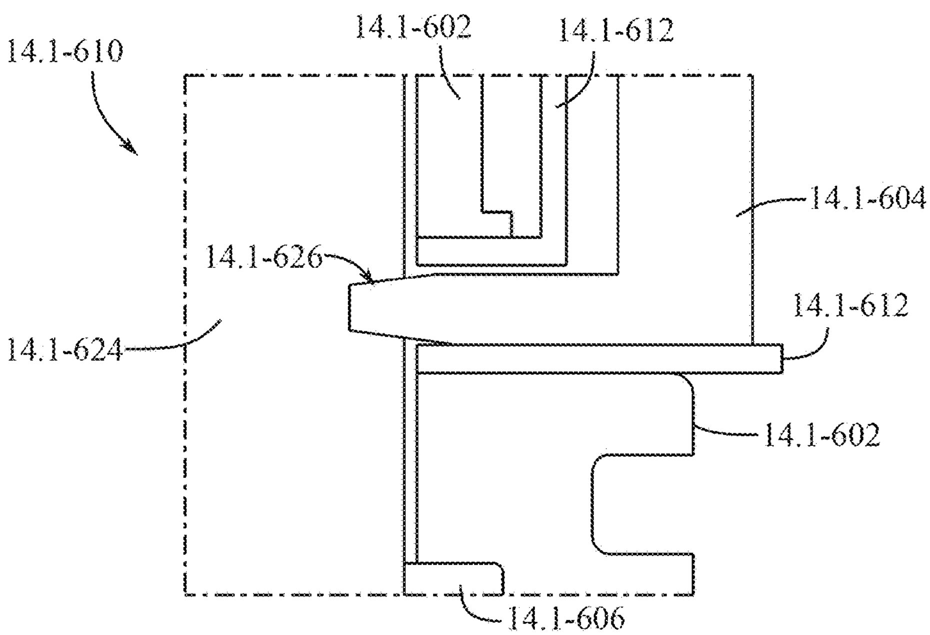
FIG. 14.1-8B

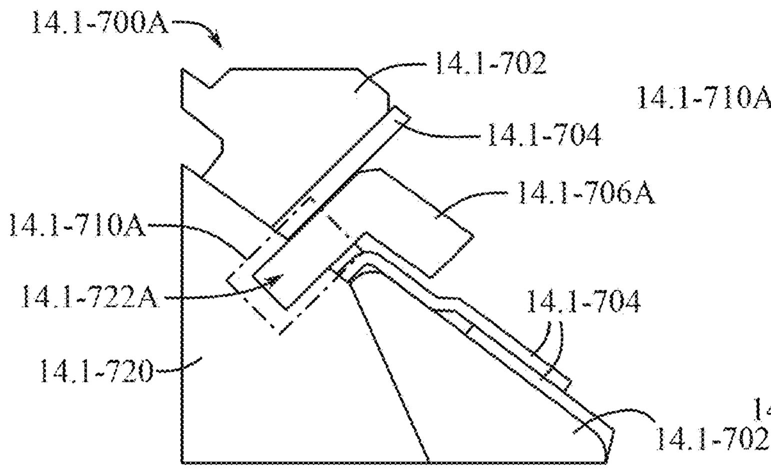
FIG. 14.1-9A
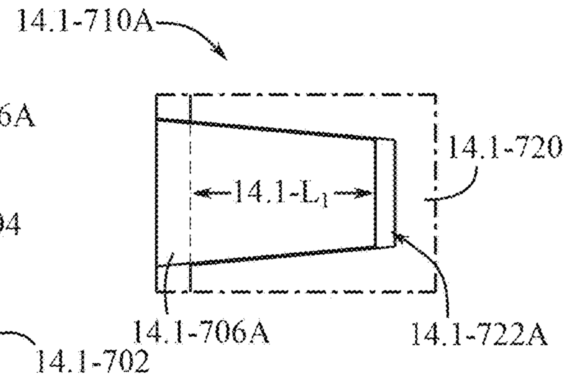
FIG. 14.1-9B
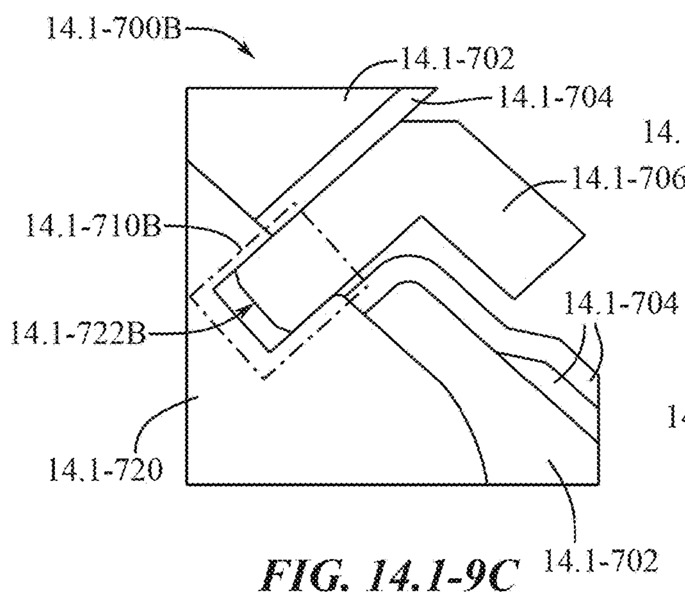
FIG. 14.1-9C
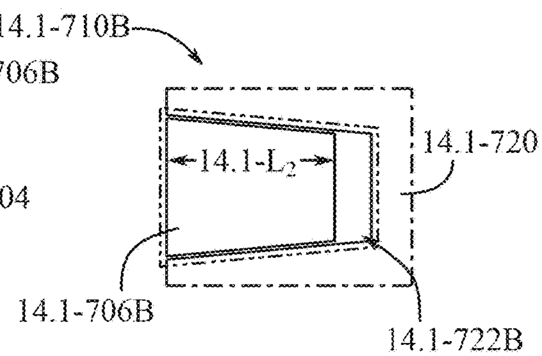
FIG. 14.1-9D

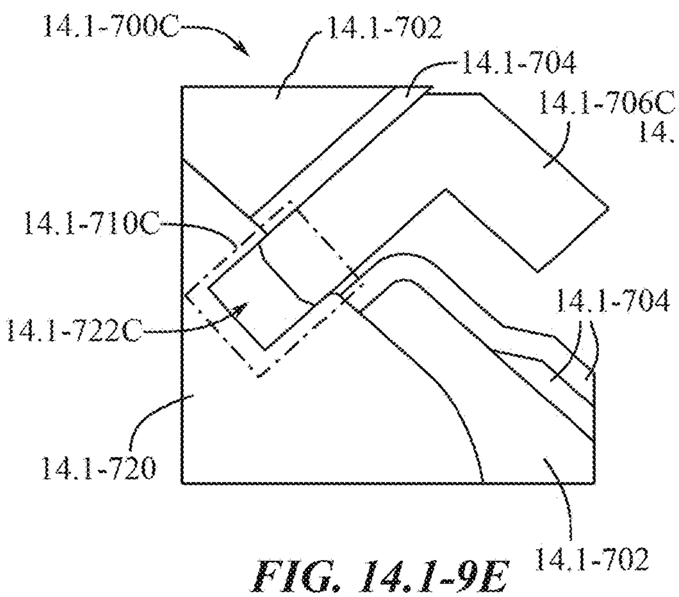
FIG. 14.1-9E
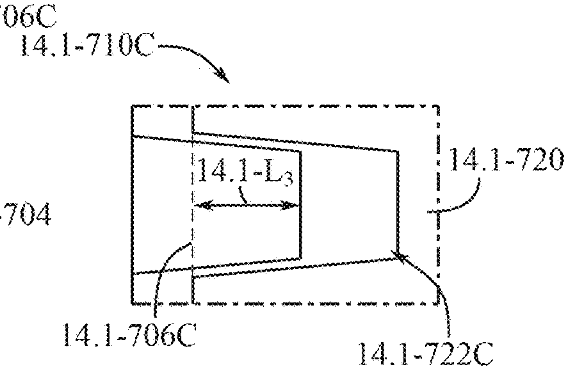
FIG. 14.1-9F

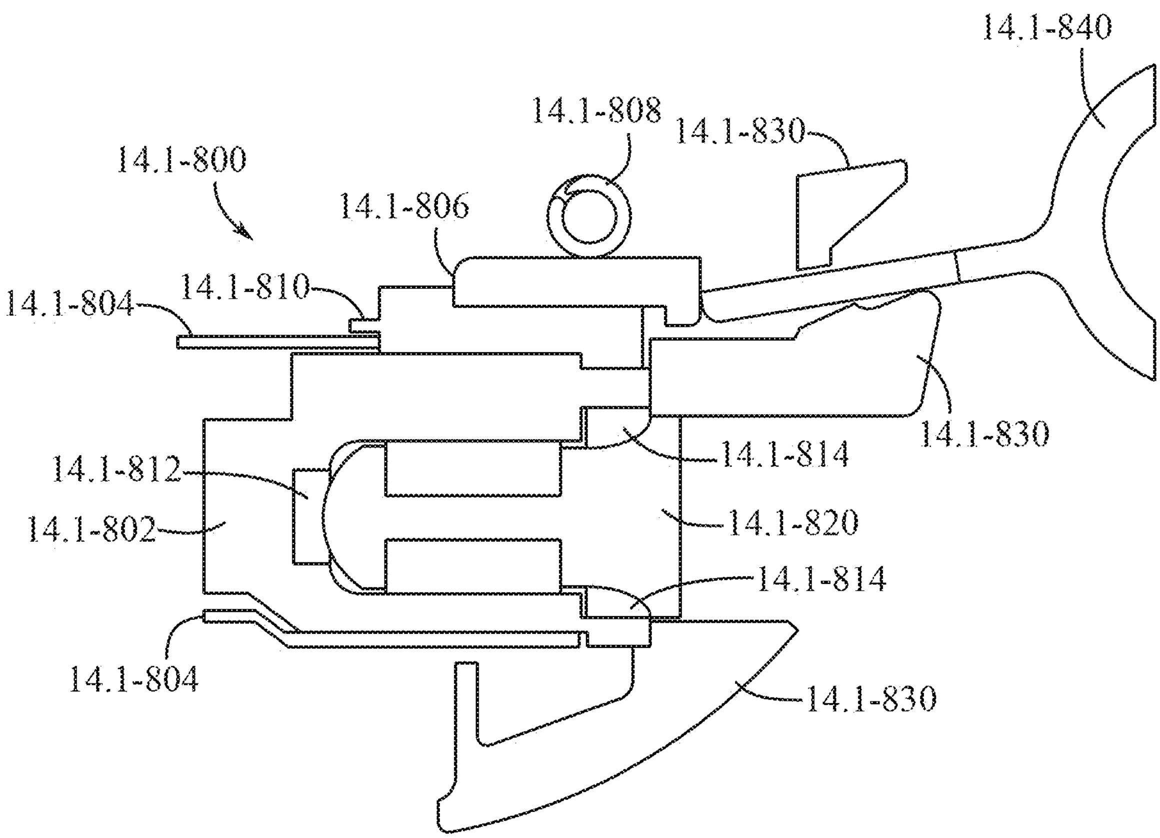
*FIG. 14.1-10*

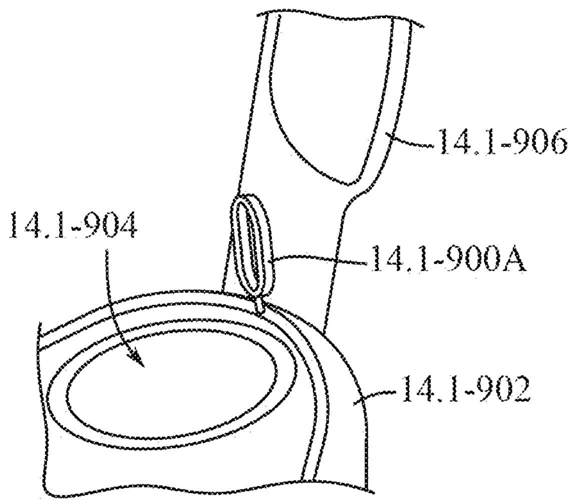
FIG. 14.1-11A
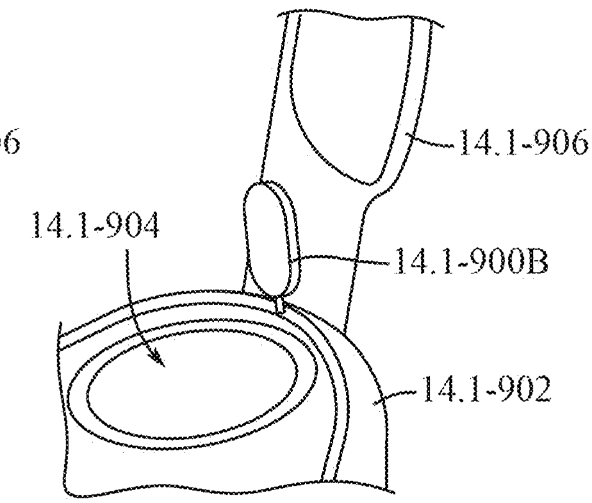
FIG. 14.1-11B
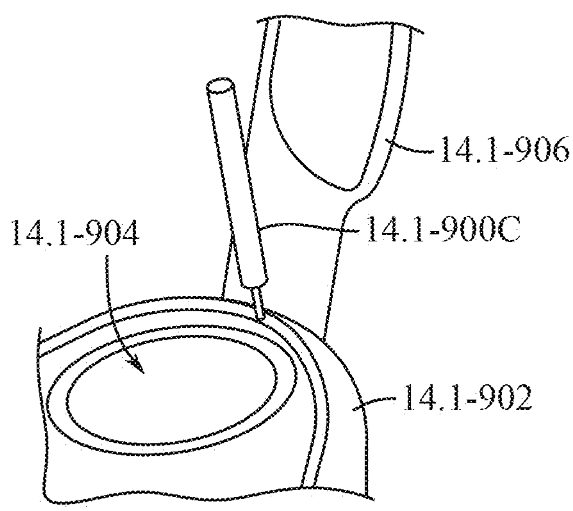
FIG. 14.1-11C
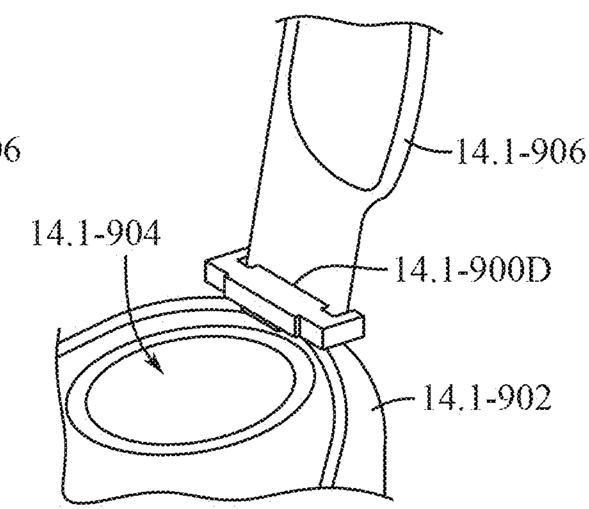
FIG. 14.1-11D

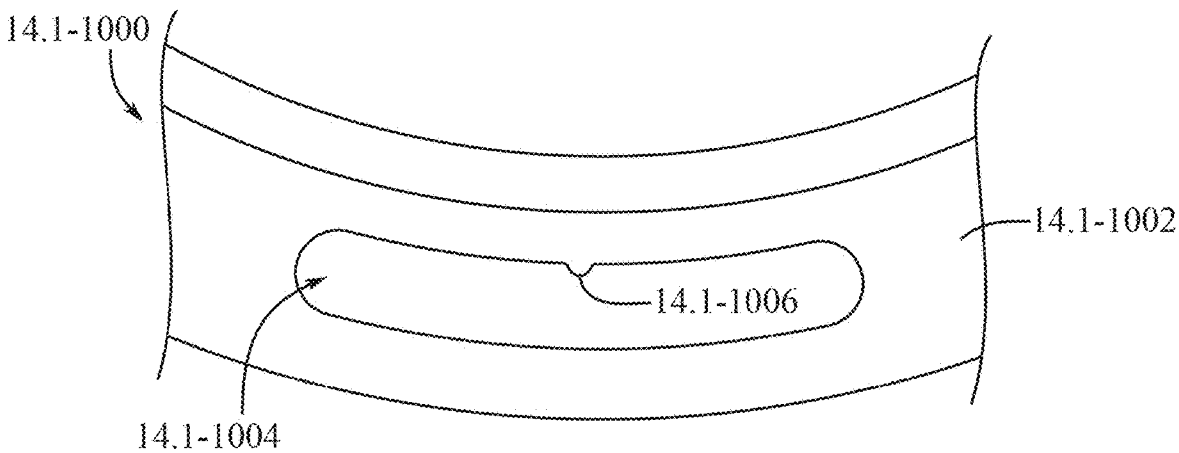
*FIG. 14.1-12A*
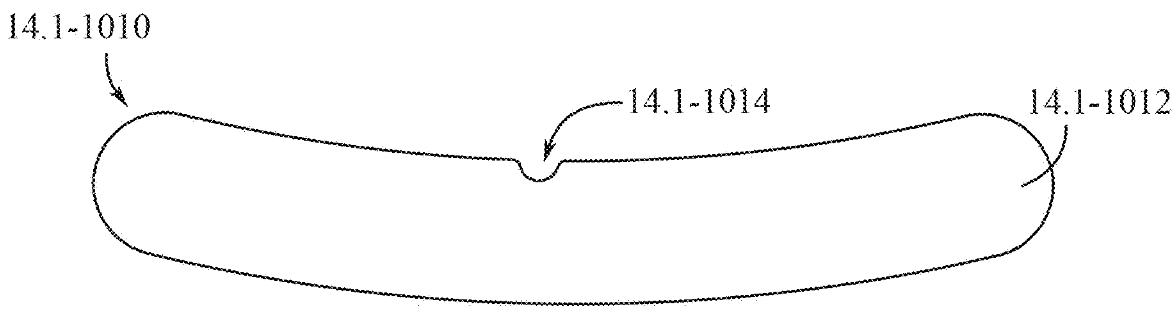
*FIG. 14.1-12B*

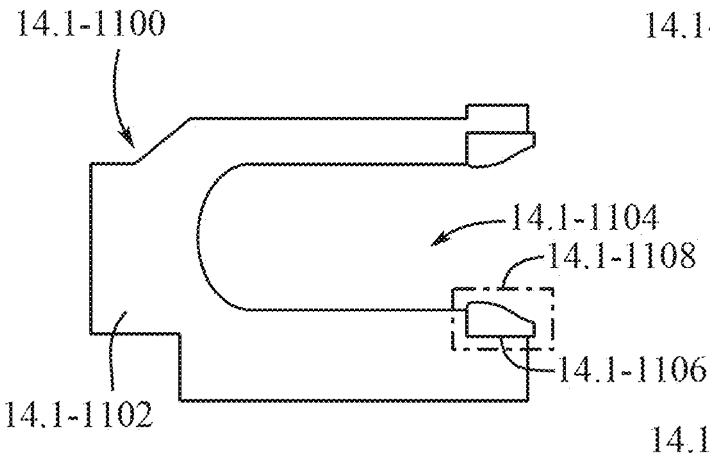
FIG. 14.1-13A
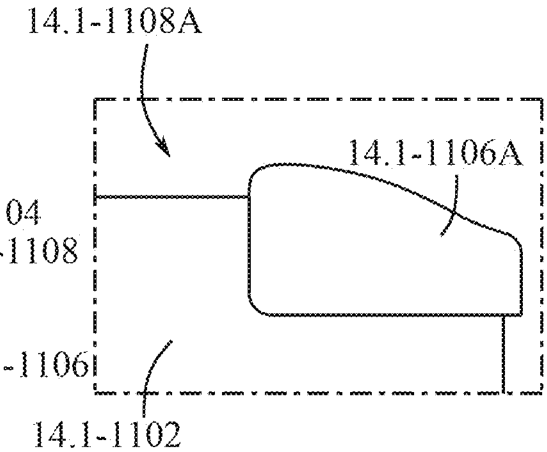
FIG. 14.1-13B
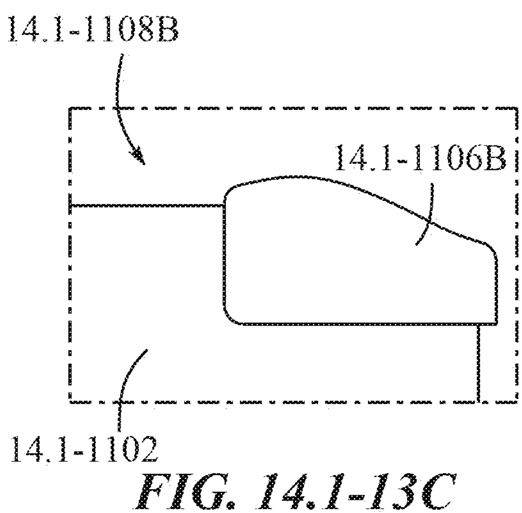
FIG. 14.1-13C
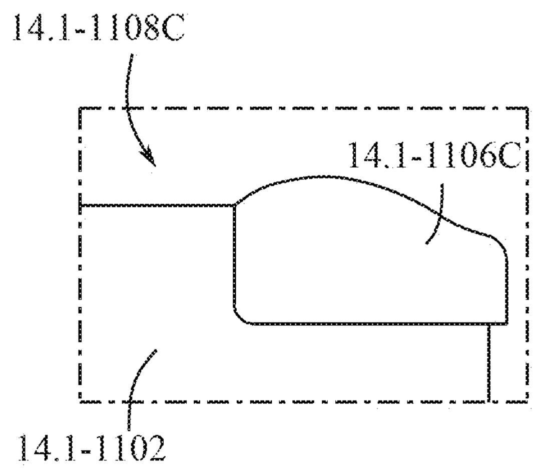
FIG. 14.1-13D

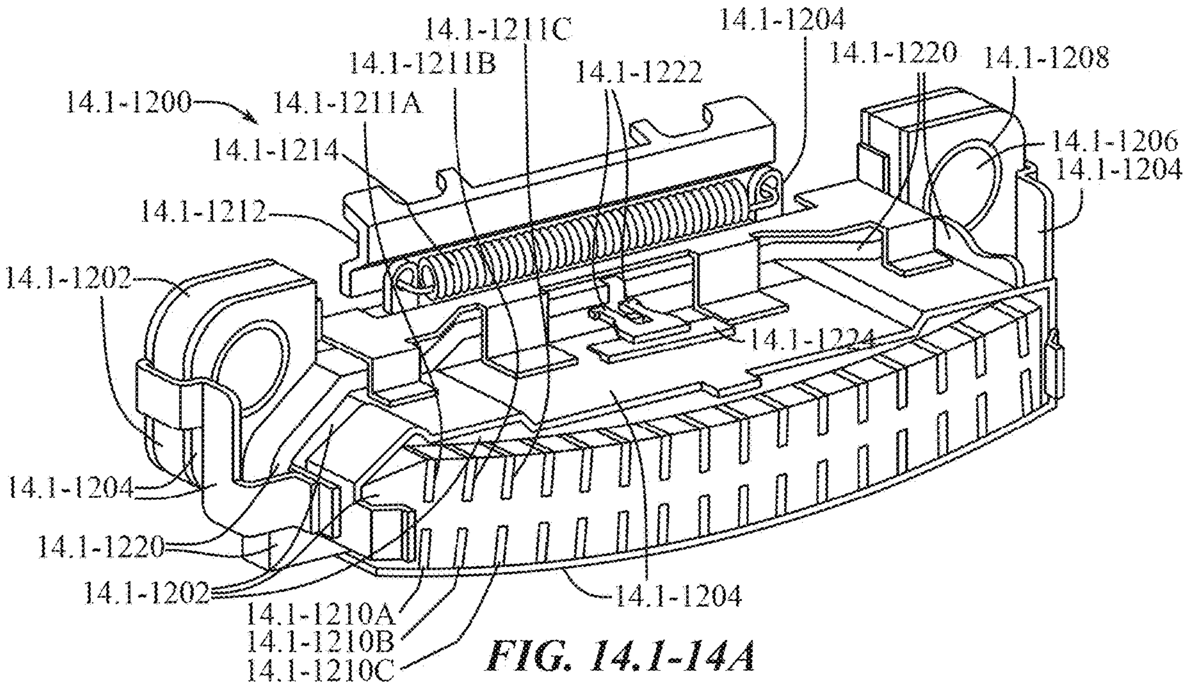
*FIG. 14.1-14A*
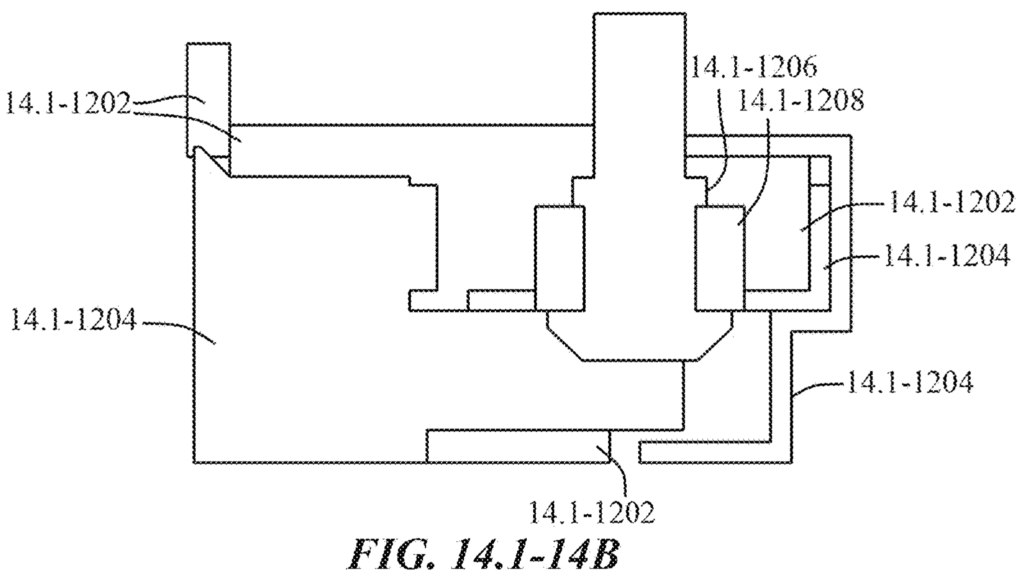
*FIG. 14.1-14B*

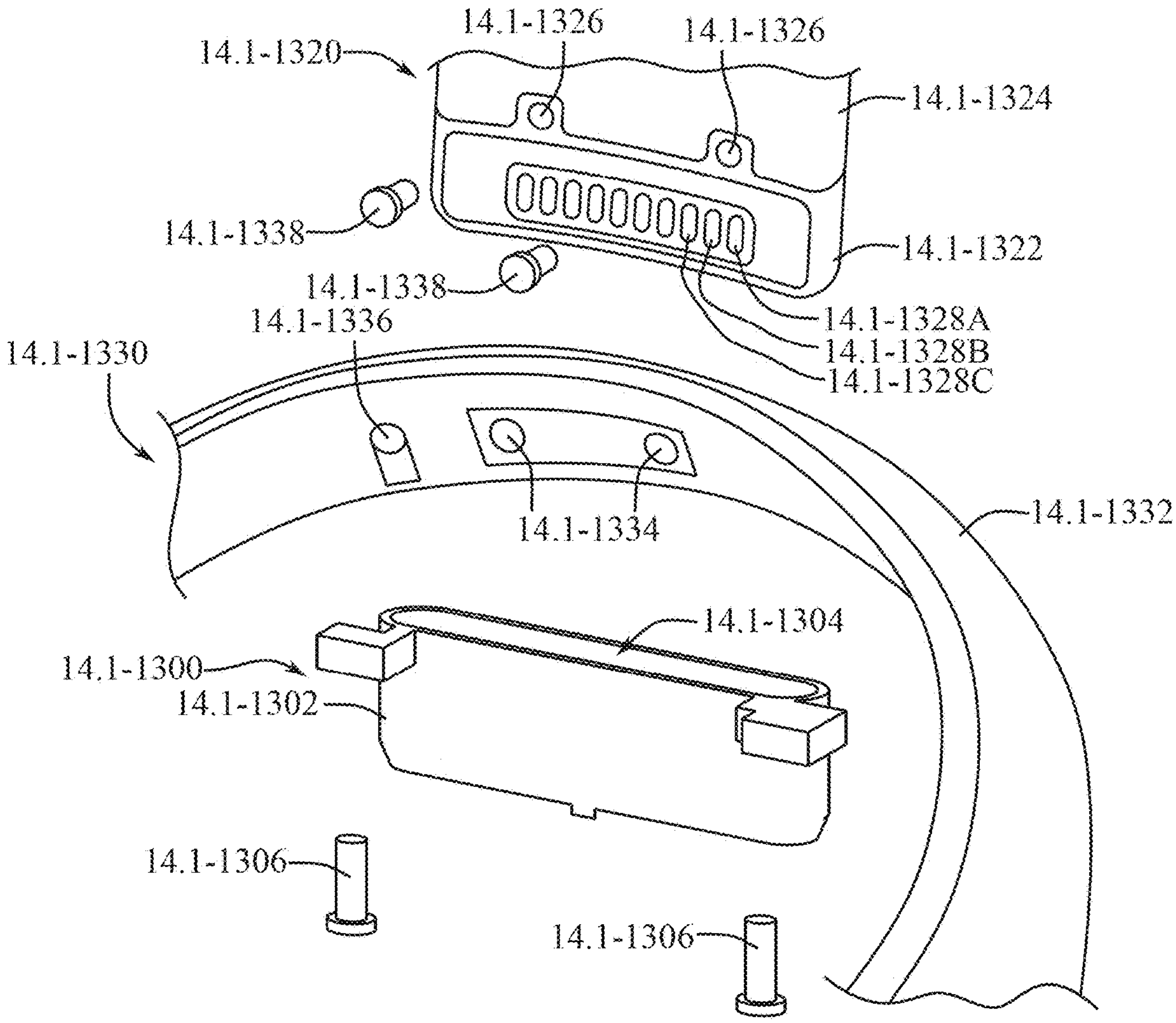
*FIG. 14.1-15*

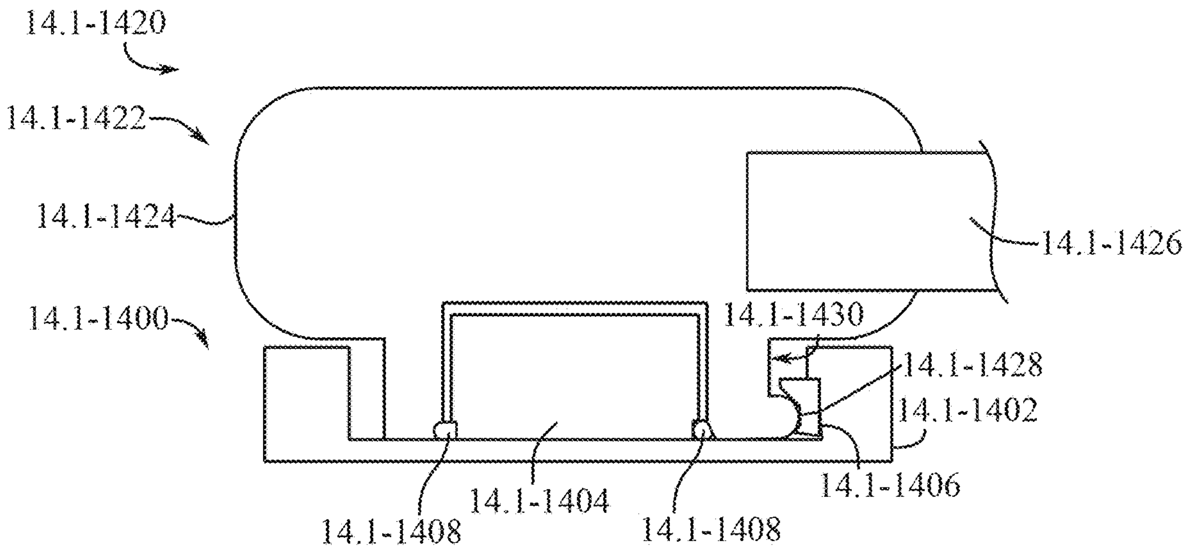
FIG. 14.1-16A
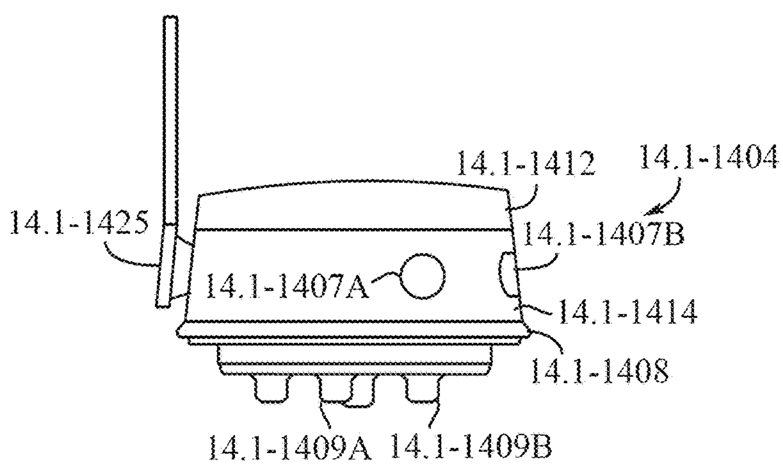
FIG. 14.1-16B

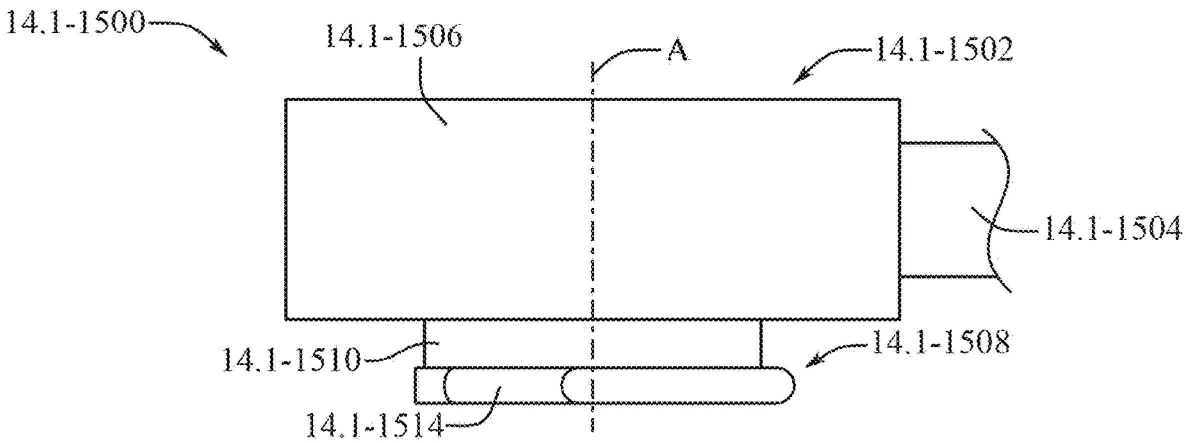
*FIG. 14.1-17A*
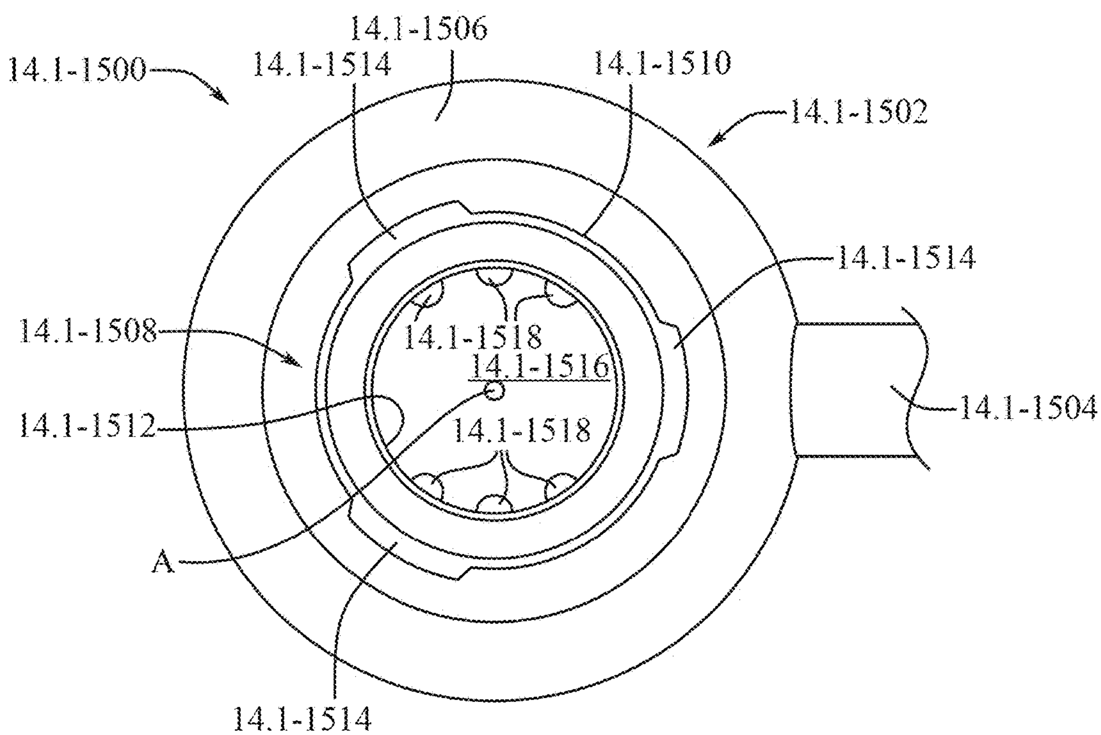
*FIG. 14.1-17B*

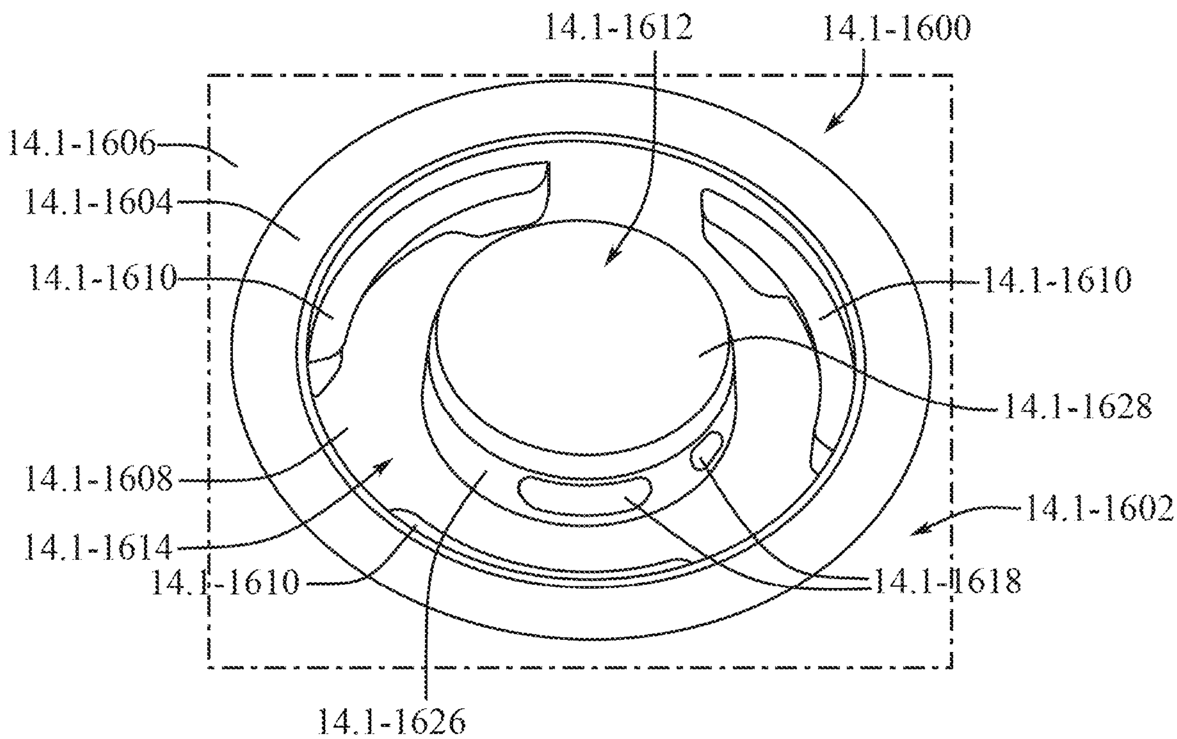
*FIG. 14.1-18A*
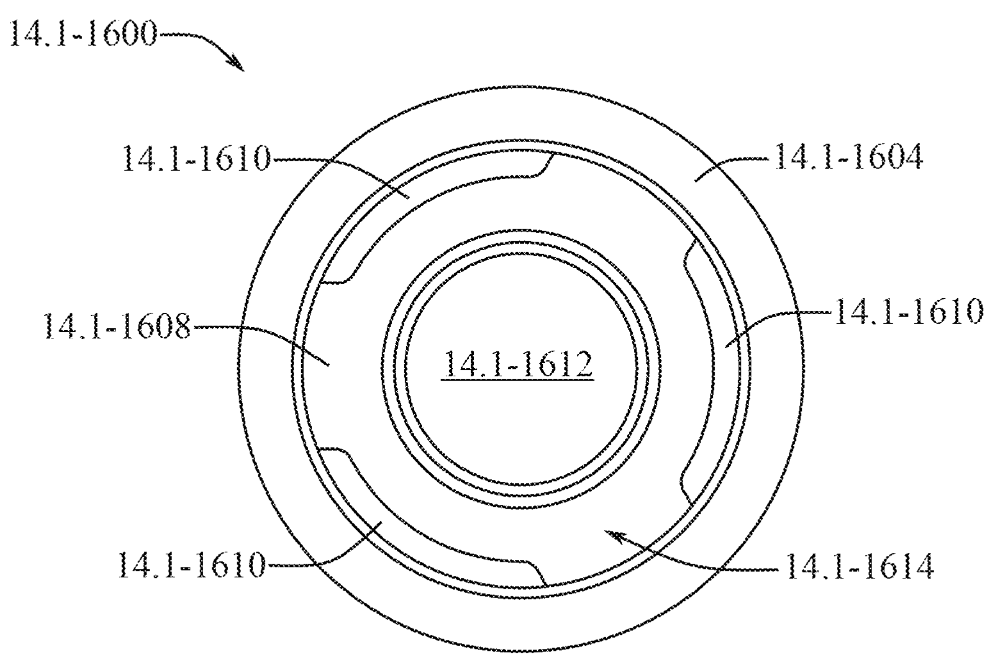
*FIG. 14.1-18B*

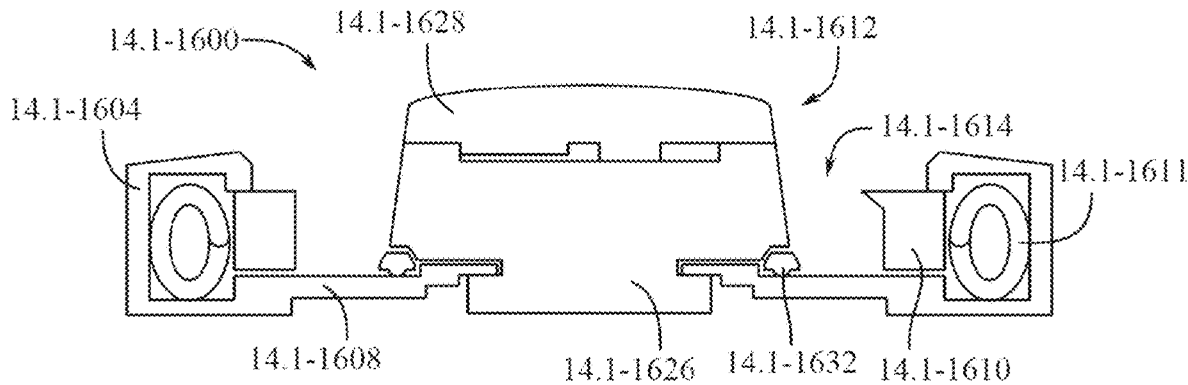
*FIG. 14.1-18C*

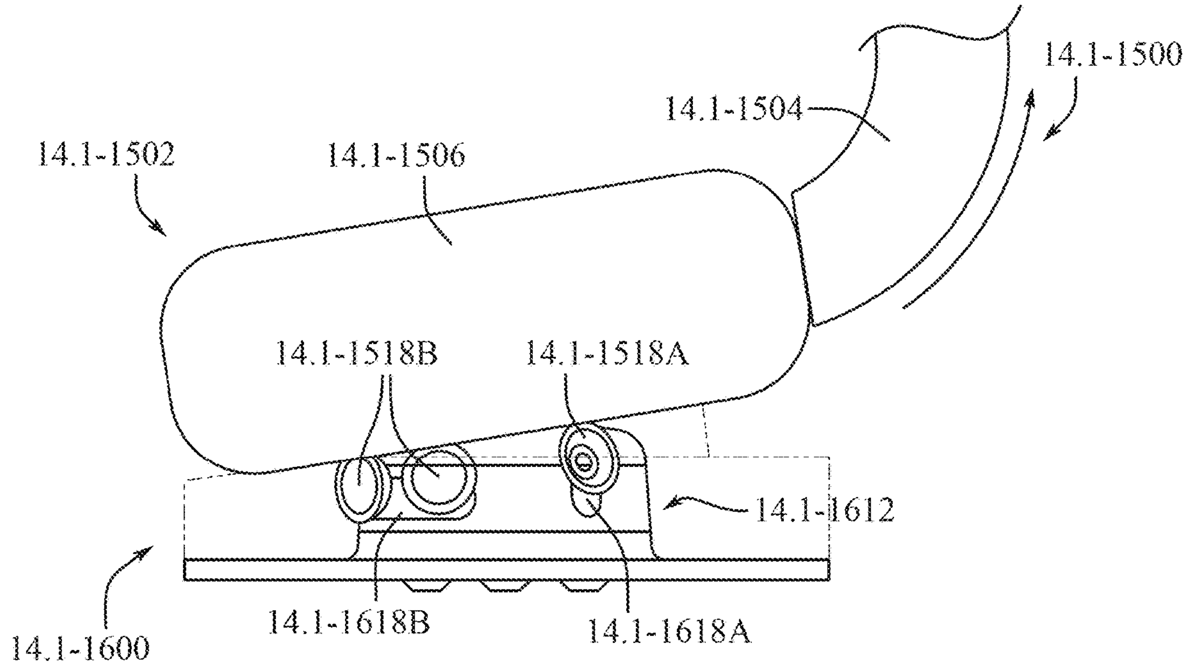
FIG. 14.1-18D
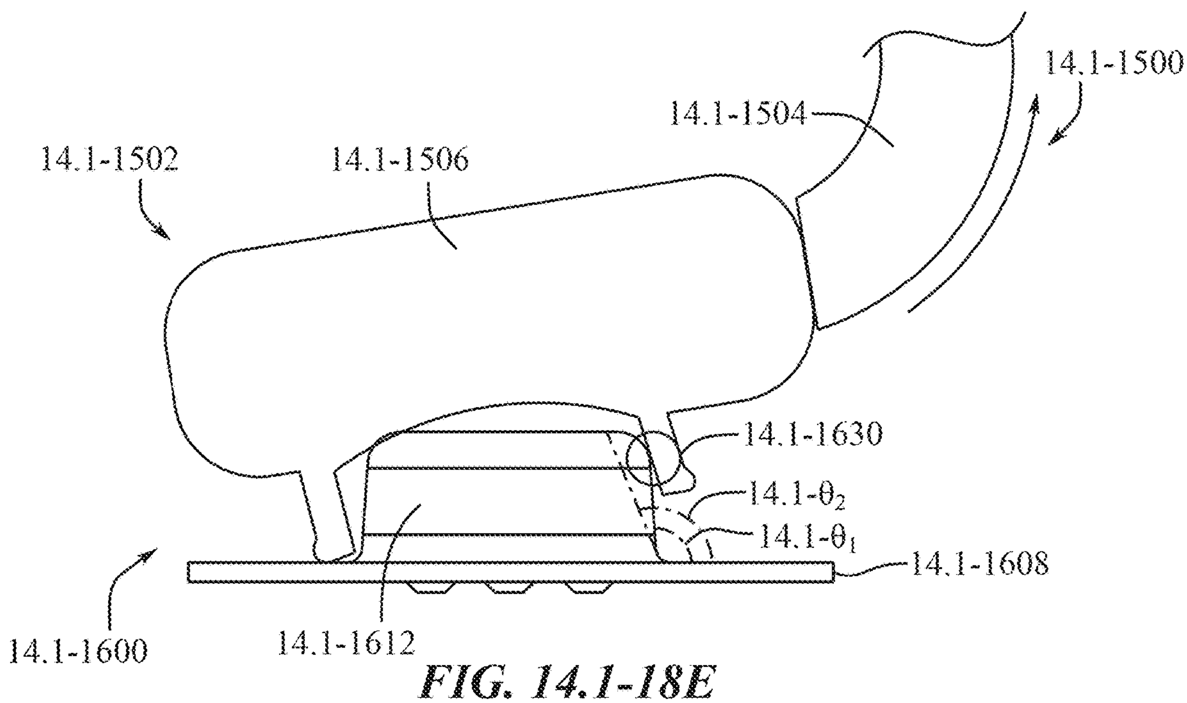
FIG. 14.1-18E

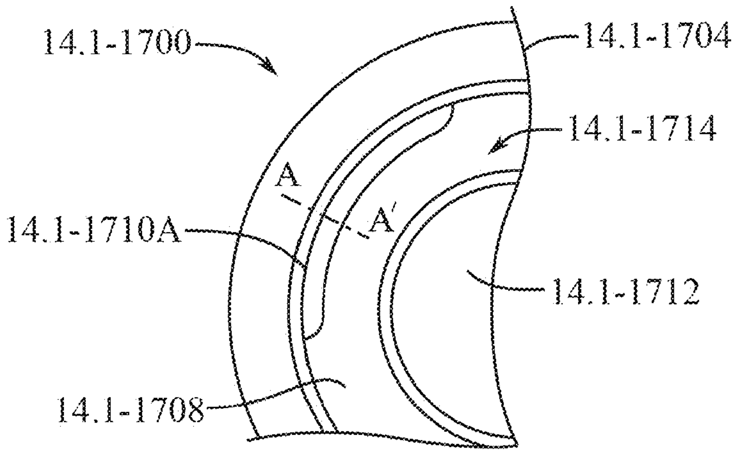
*FIG. 14.1-19A*
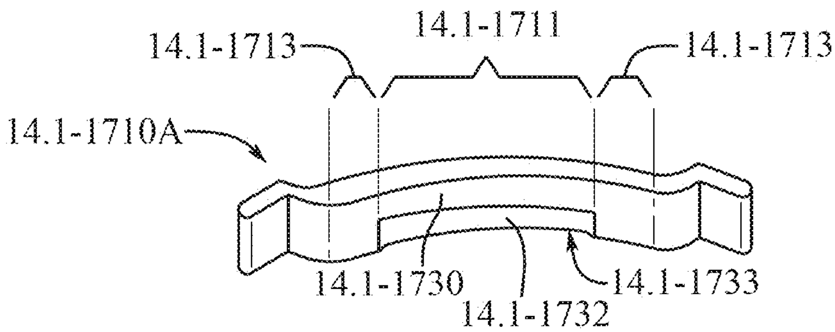
*FIG. 14.1-19B*
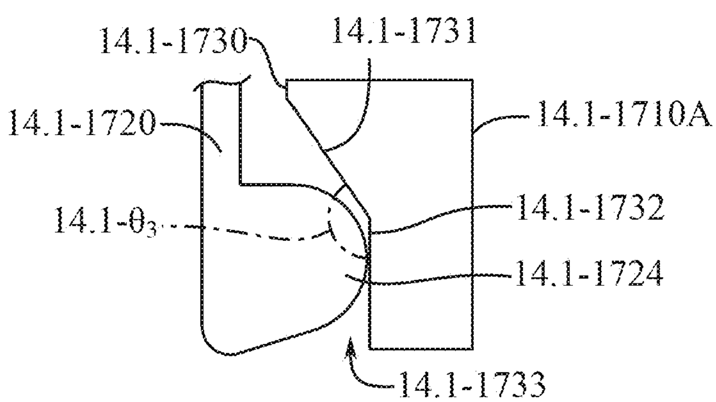
*FIG. 14.1-19C*

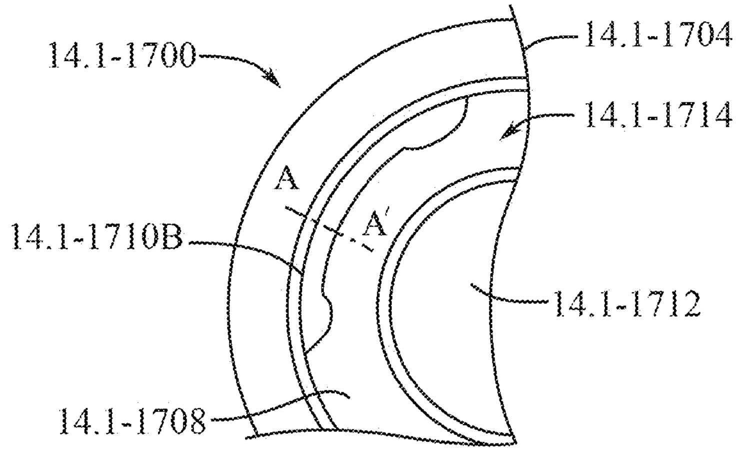
*FIG. 14.1-19D*
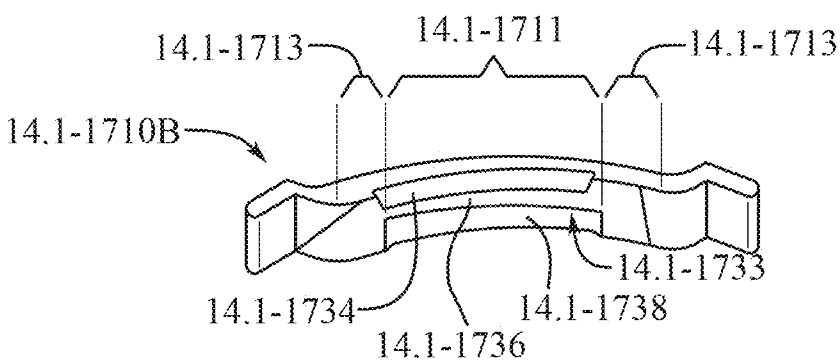
*FIG. 14.1-19E*
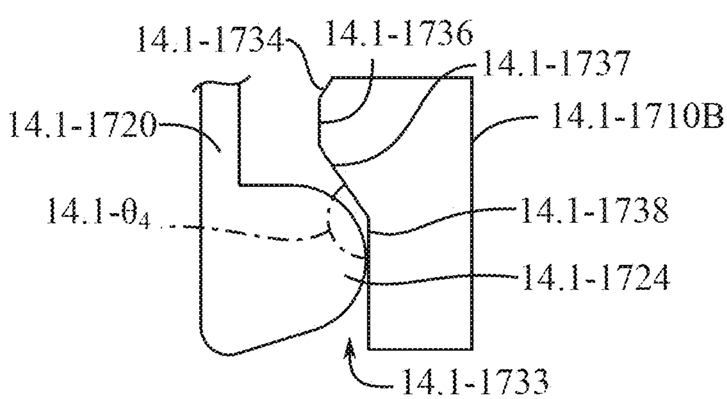
*FIG. 14.1-19F*

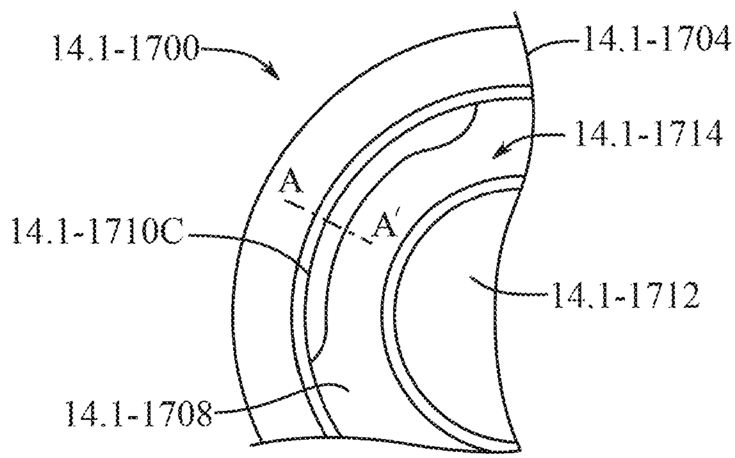
*FIG. 14.1-19G*
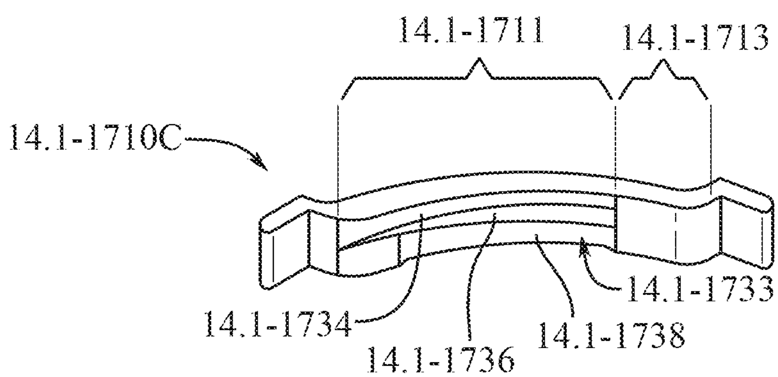
*FIG. 14.1-19H*

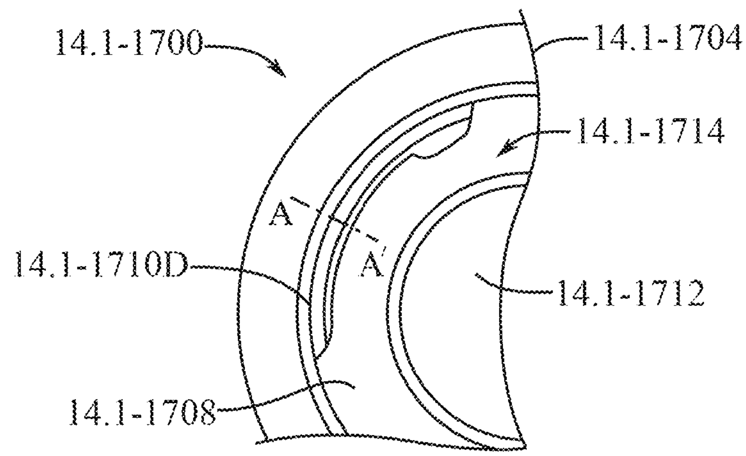
FIG. 14.1-19I
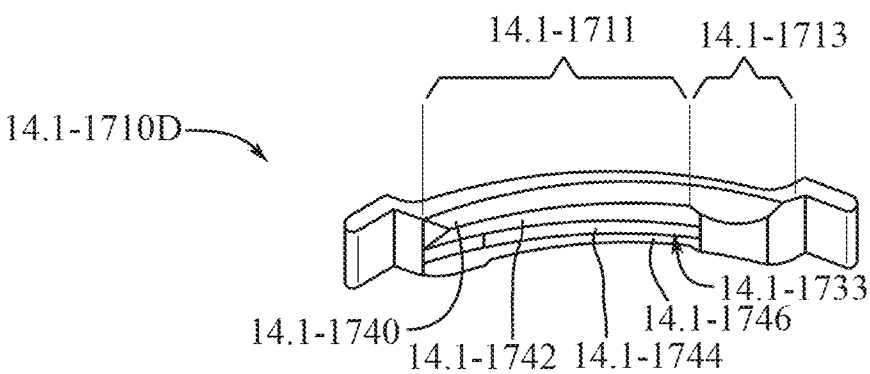
FIG. 14.1-19J
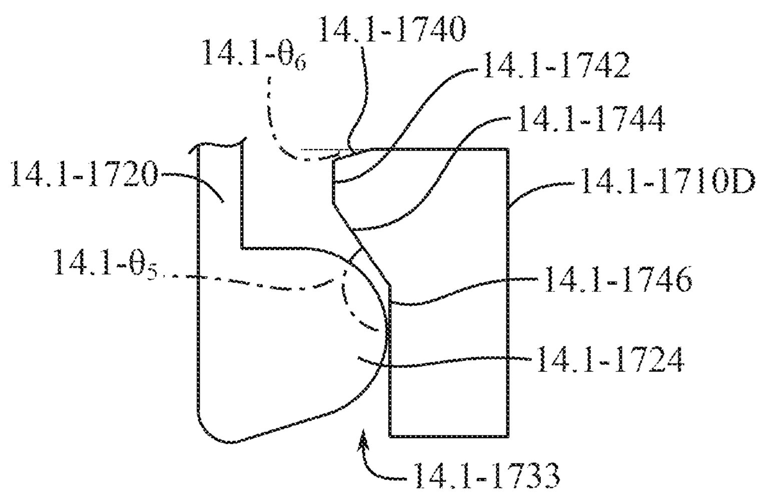
FIG. 14.1-19K

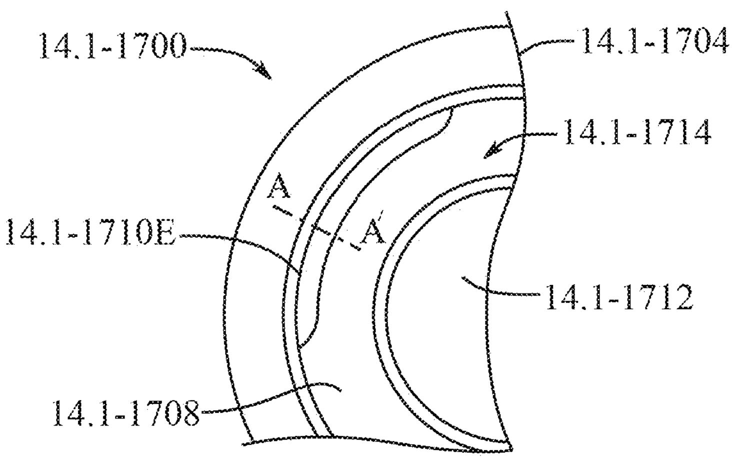
*FIG. 14.1-19L*
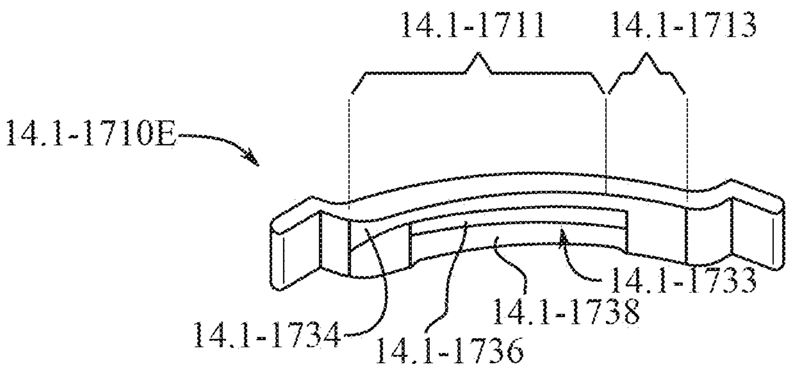
*FIG. 14.1-19M*

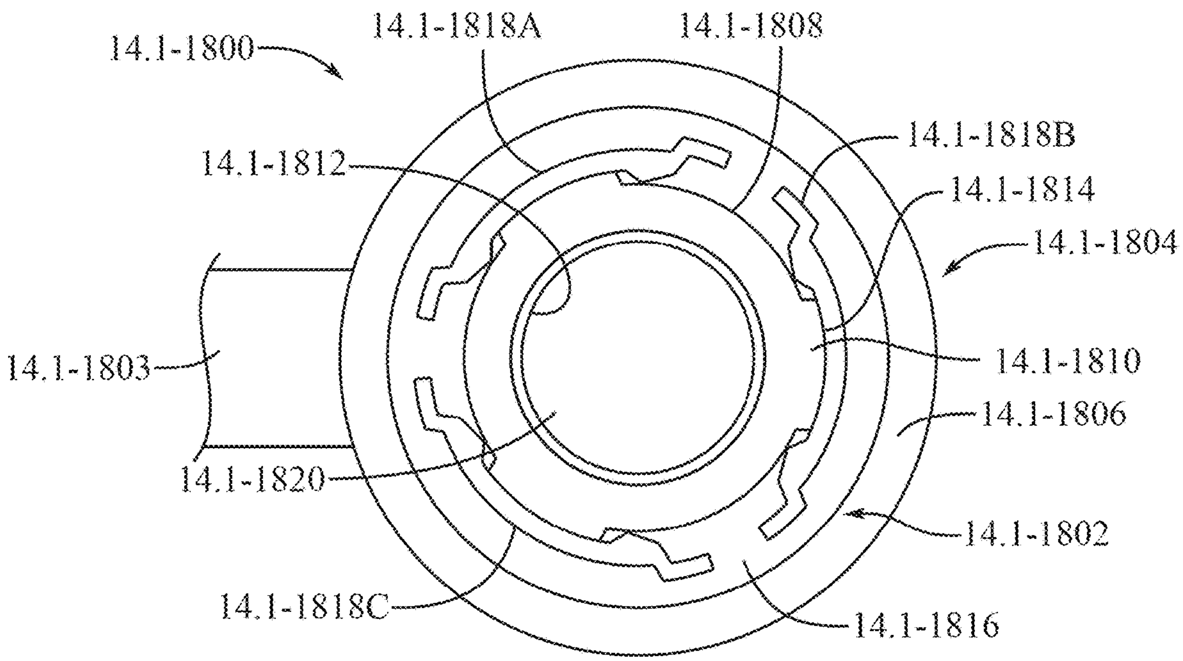
FIG. 14.1-20A
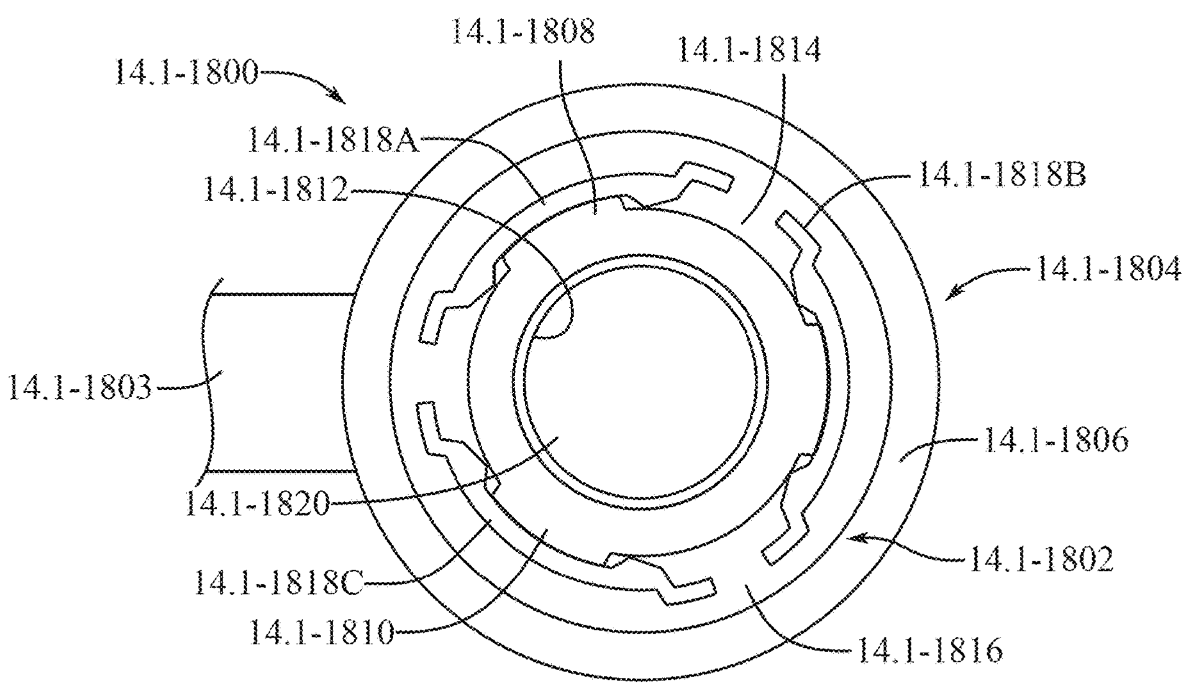
FIG. 14.1-20B

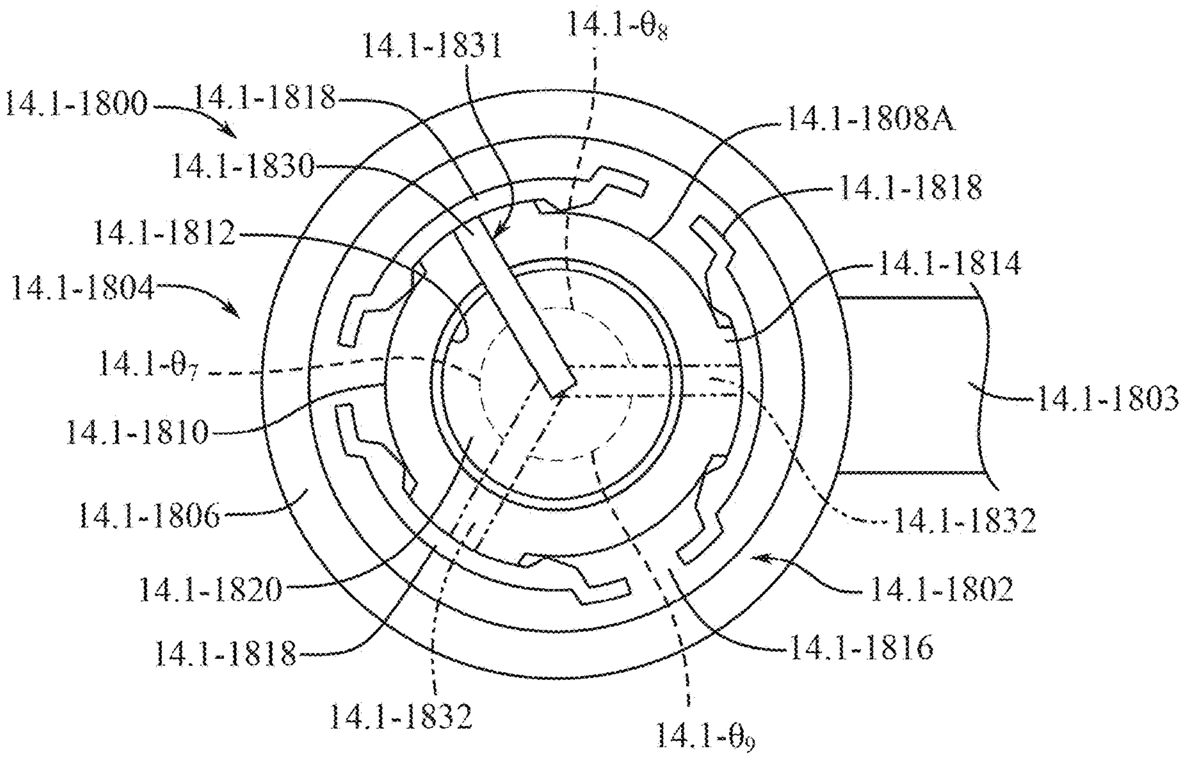
FIG. 14.1-21A
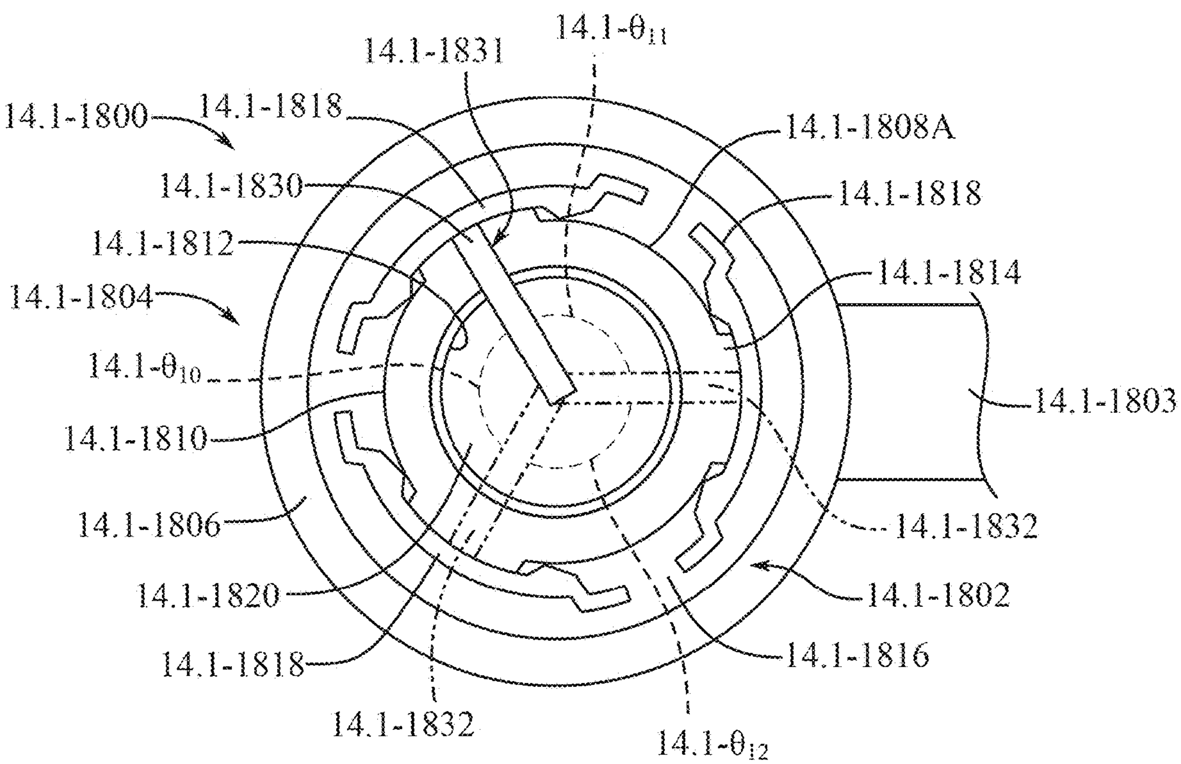
FIG. 14.1-21B

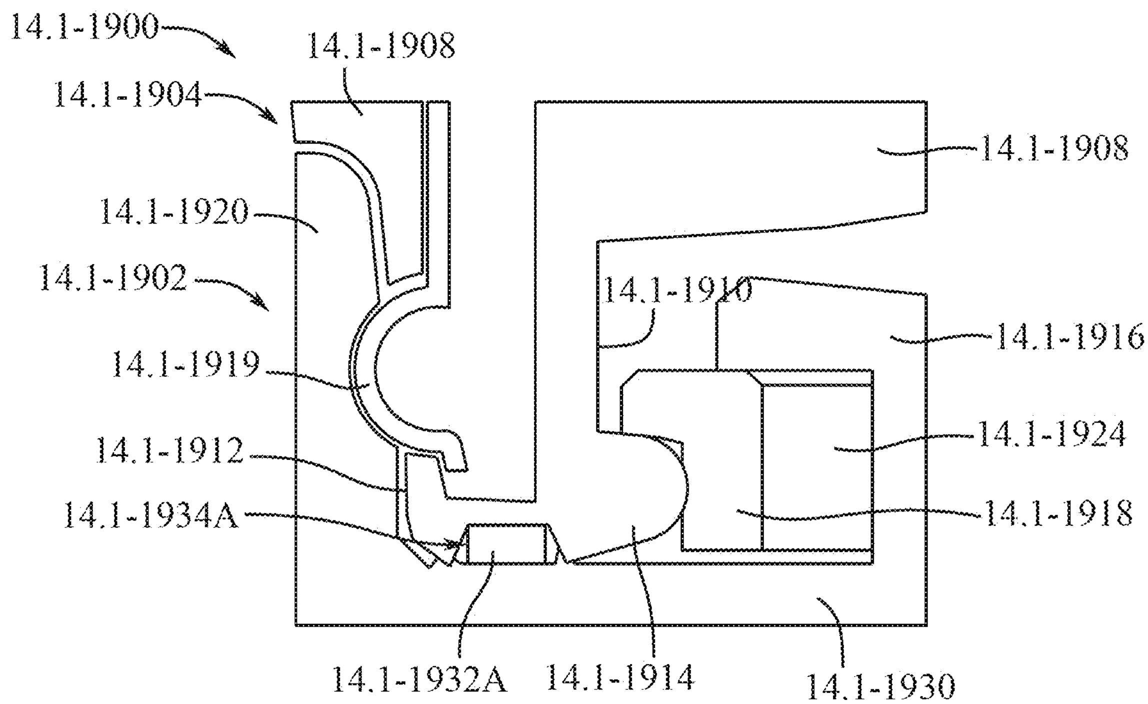
*FIG. 14.1-22A*
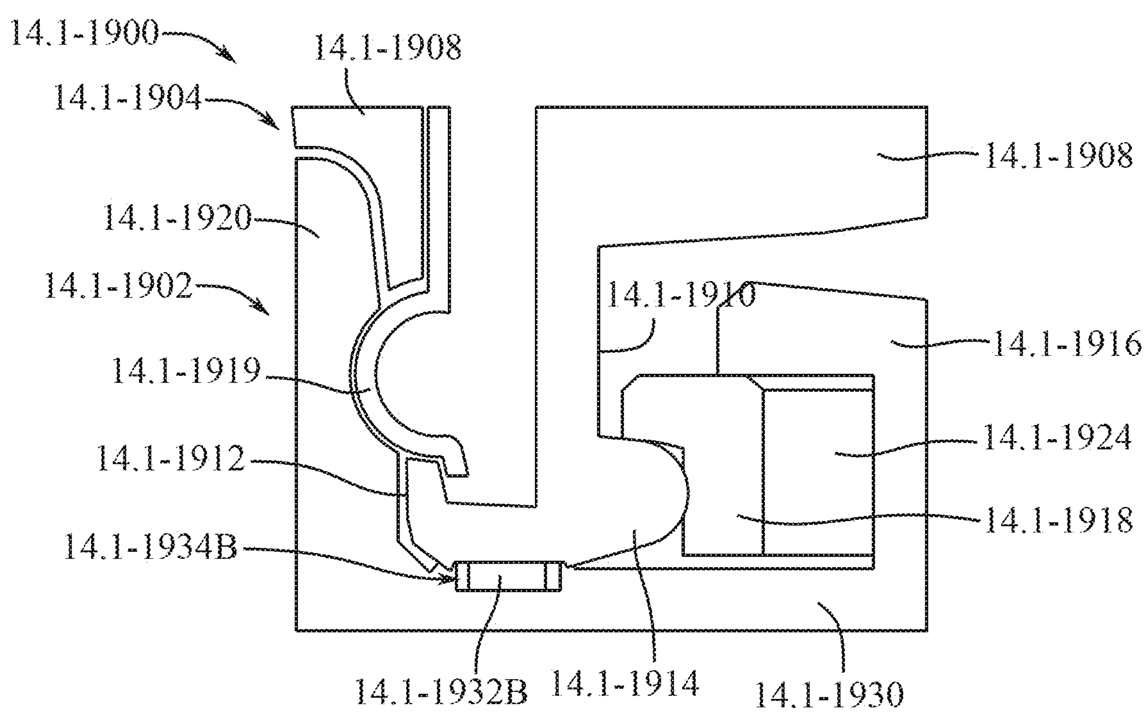
*FIG. 14.1-22B*

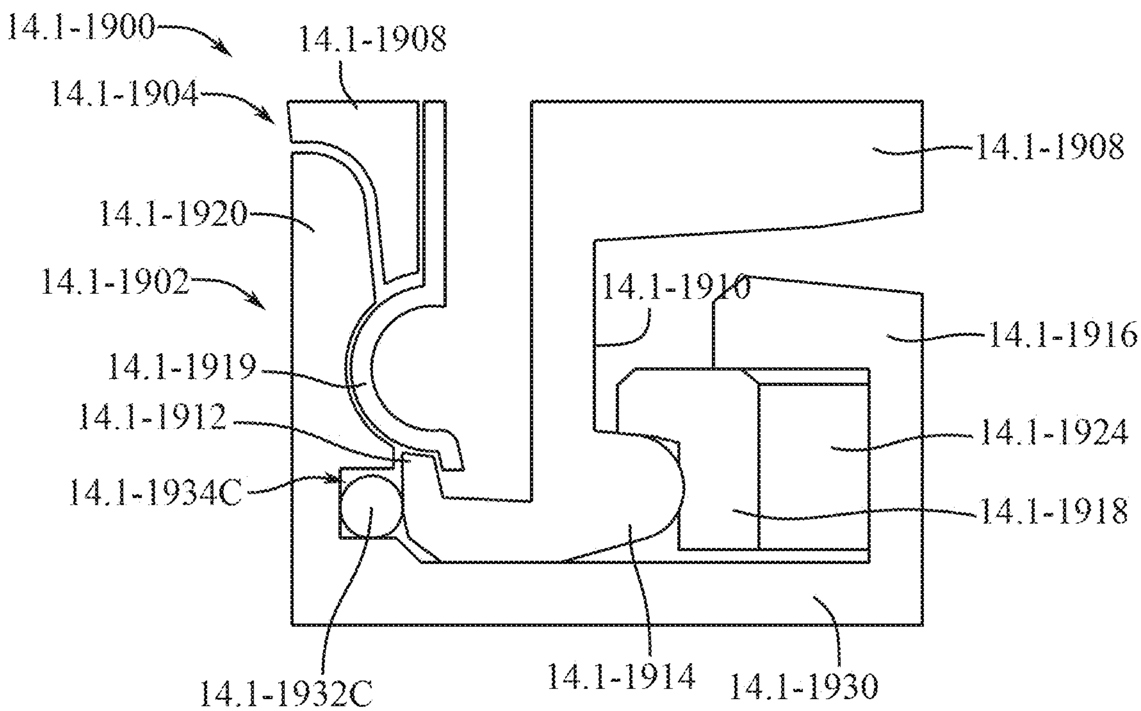
*FIG. 14.1-22C*

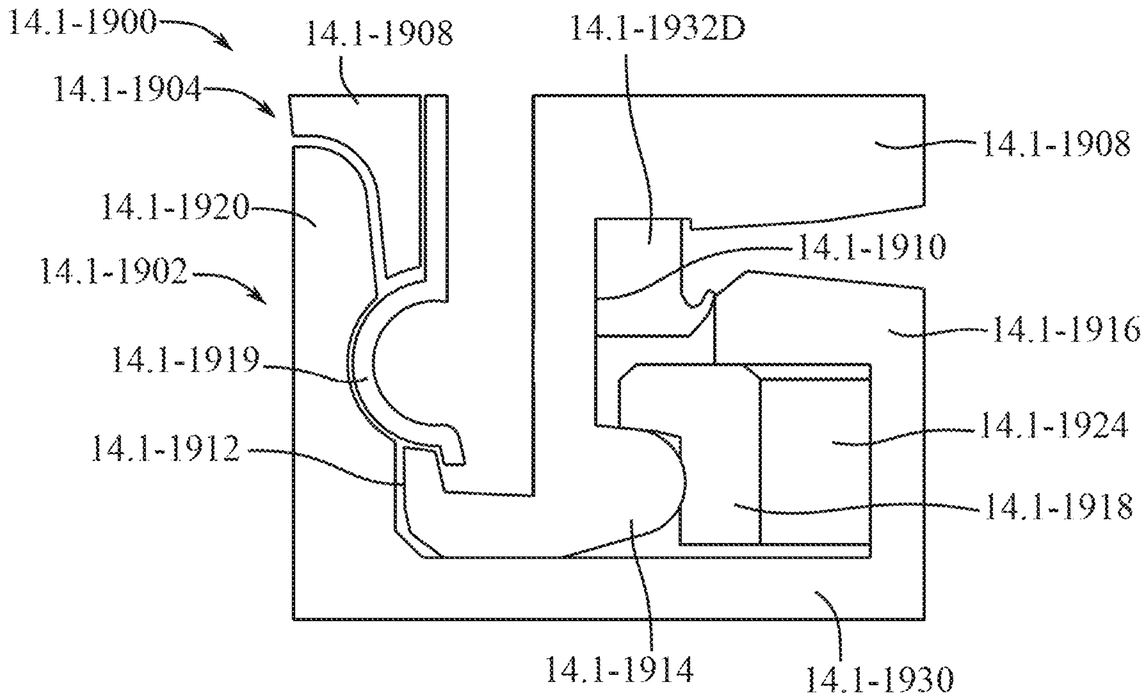
*FIG. 14.1-22D*
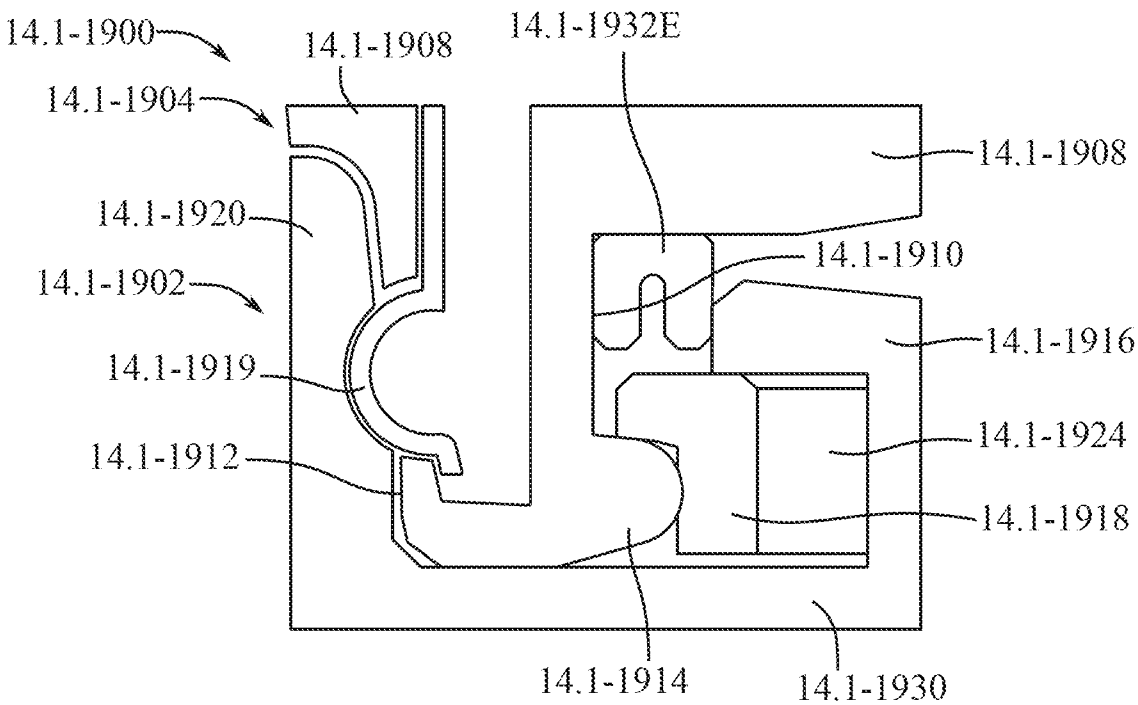
*FIG. 14.1-22E*

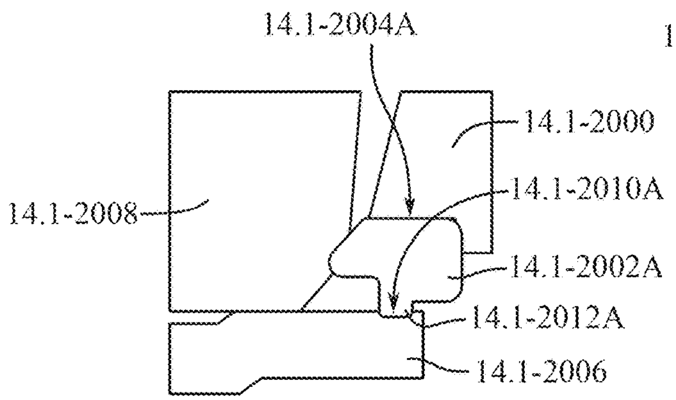
FIG. 14.1-23A
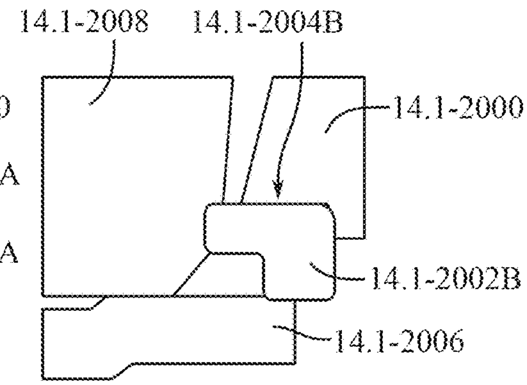
FIG. 14.1-23B
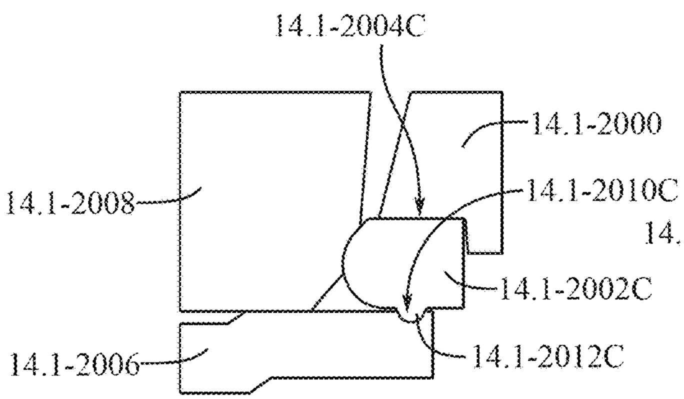
FIG. 14.1-23C
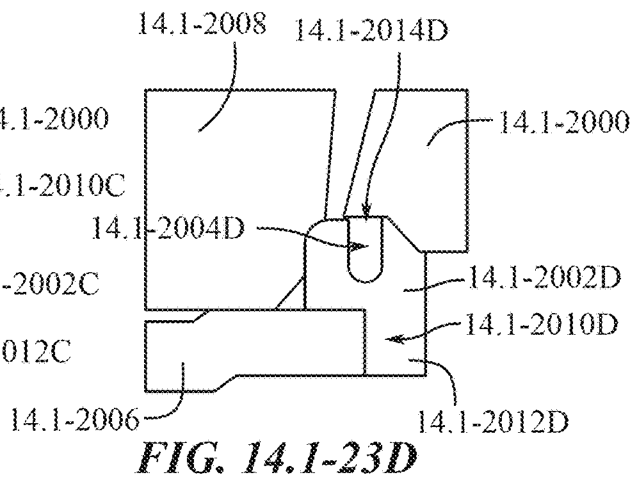
FIG. 14.1-23D

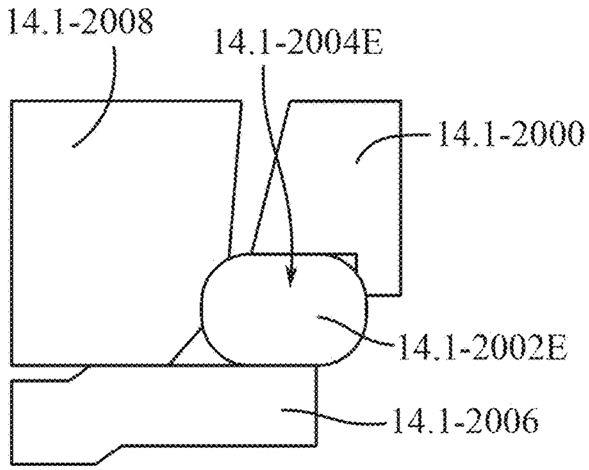
*FIG. 14.1-23E*
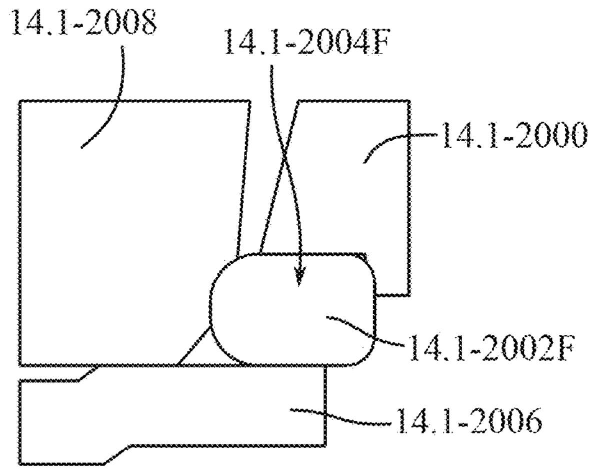
*FIG. 14.1-23F*
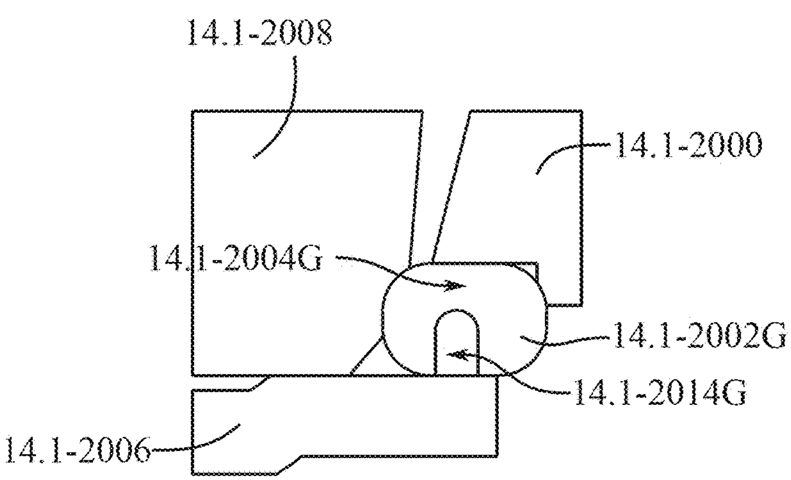
*FIG. 14.1-23G*

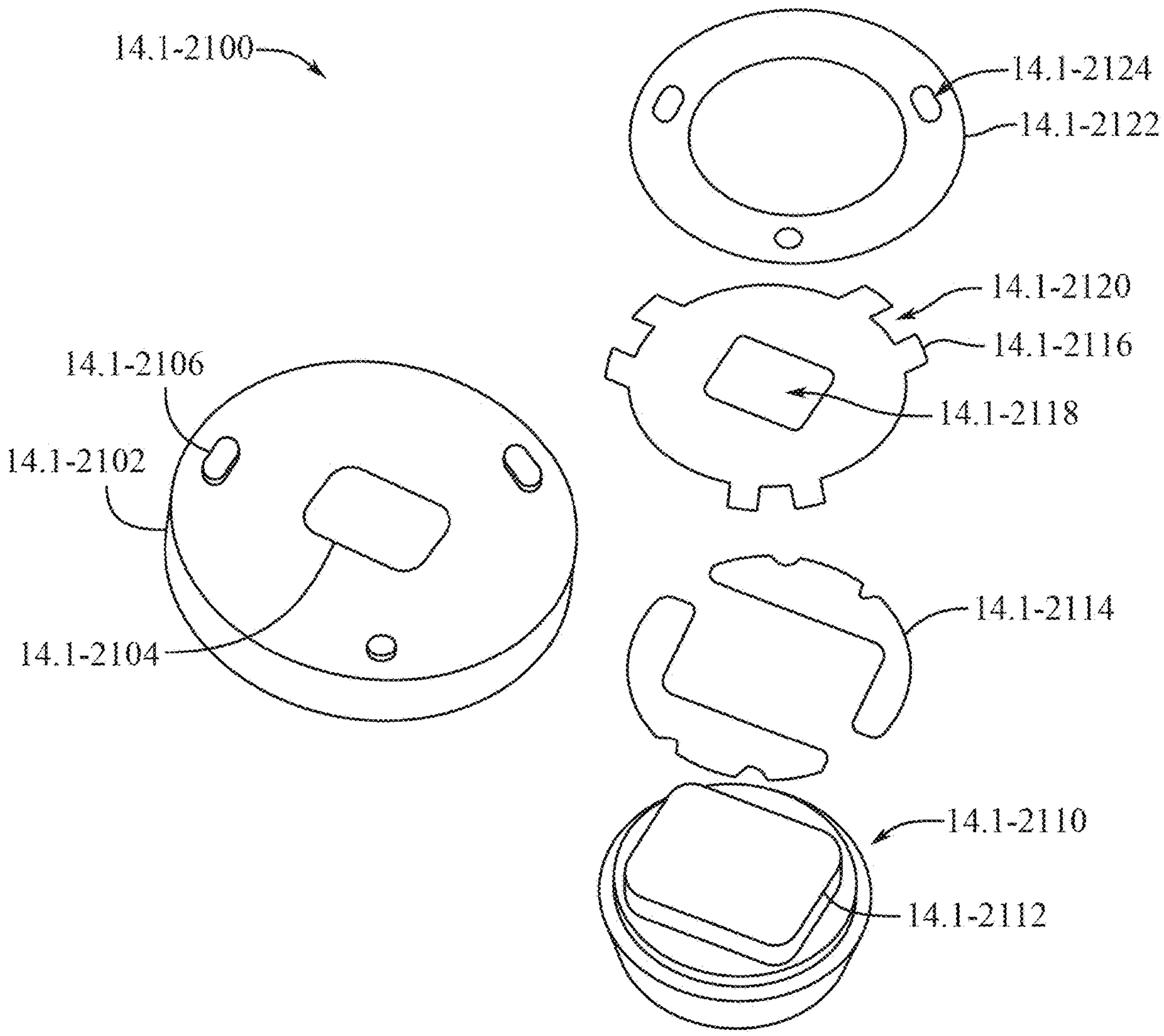
*FIG. 14.1-24A*

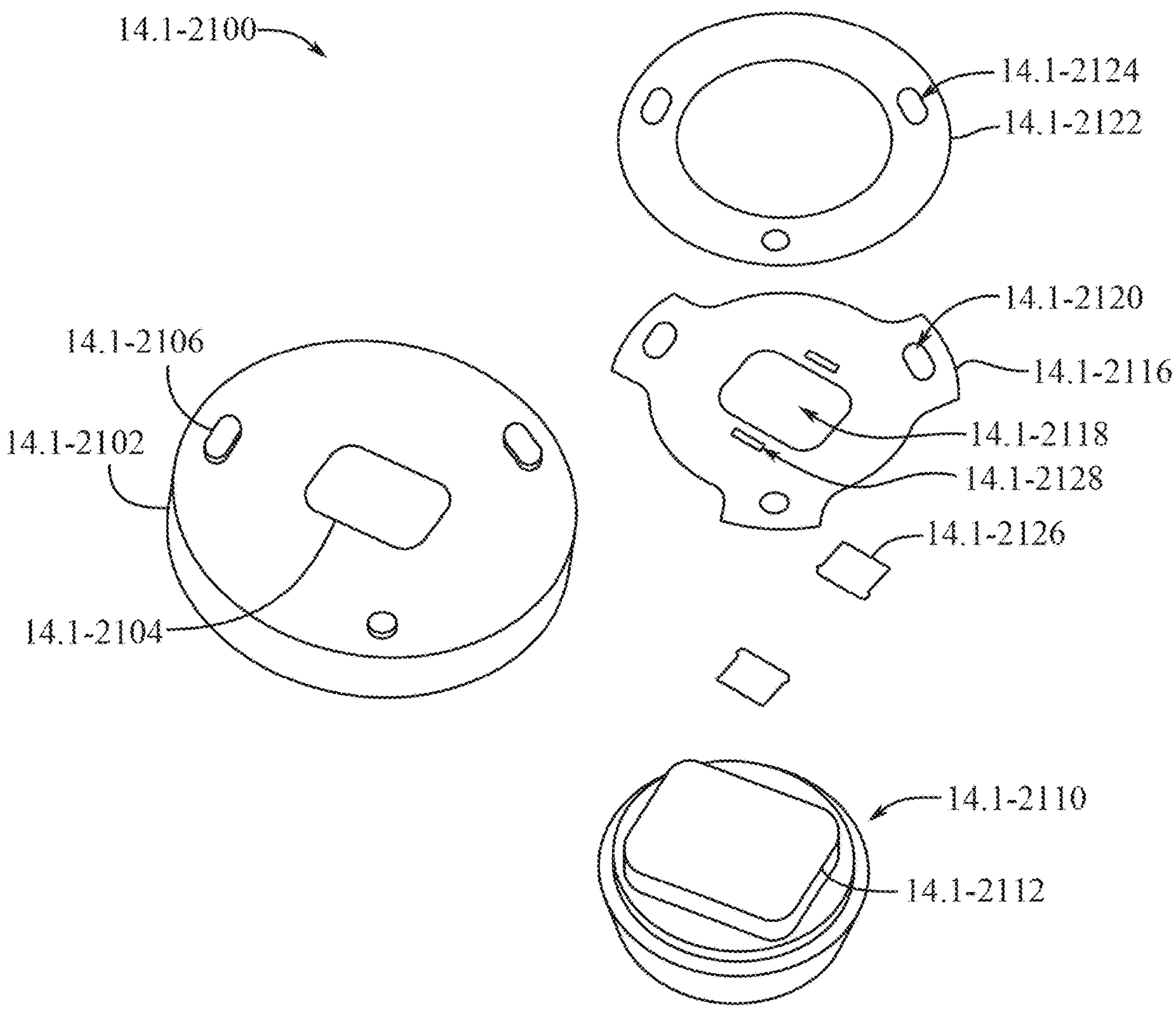
*FIG. 14.1-24B*

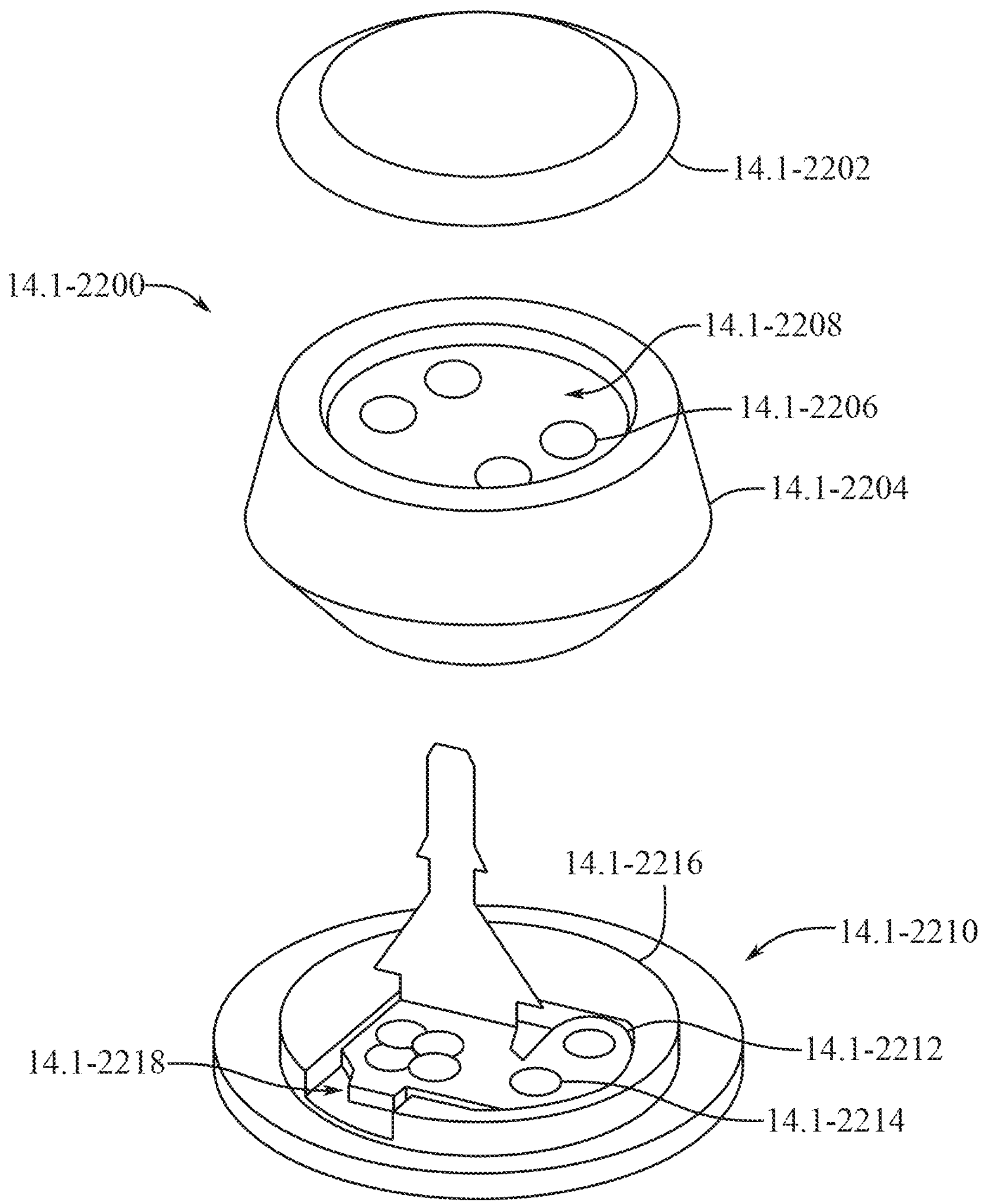
*FIG. 14.1-25A*

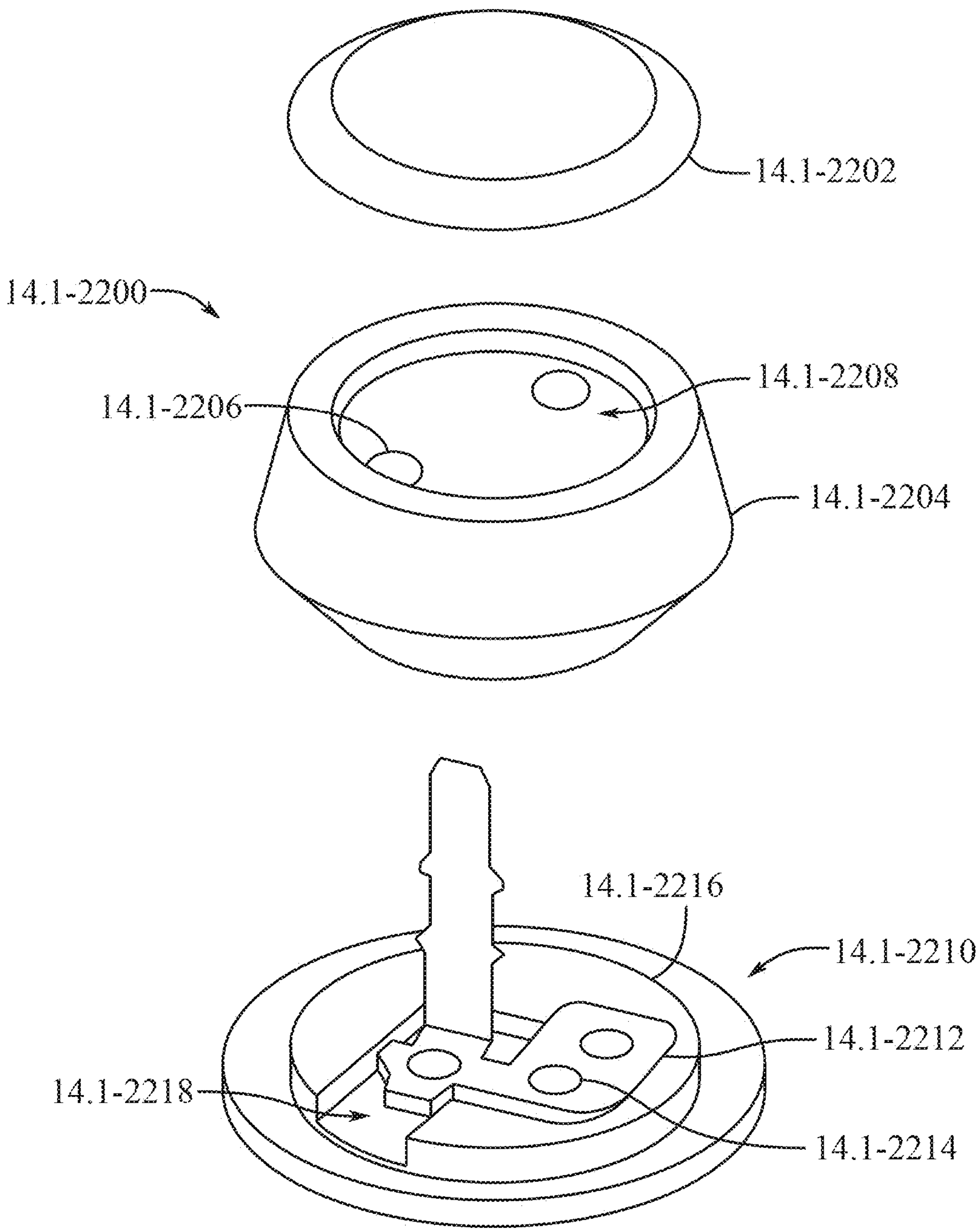
*FIG. 14.1-25B*

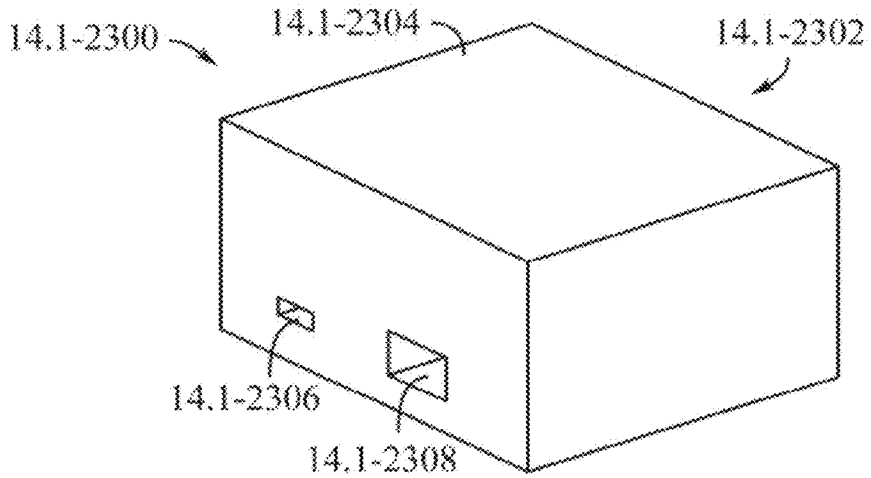
*FIG. 14.1-26A*
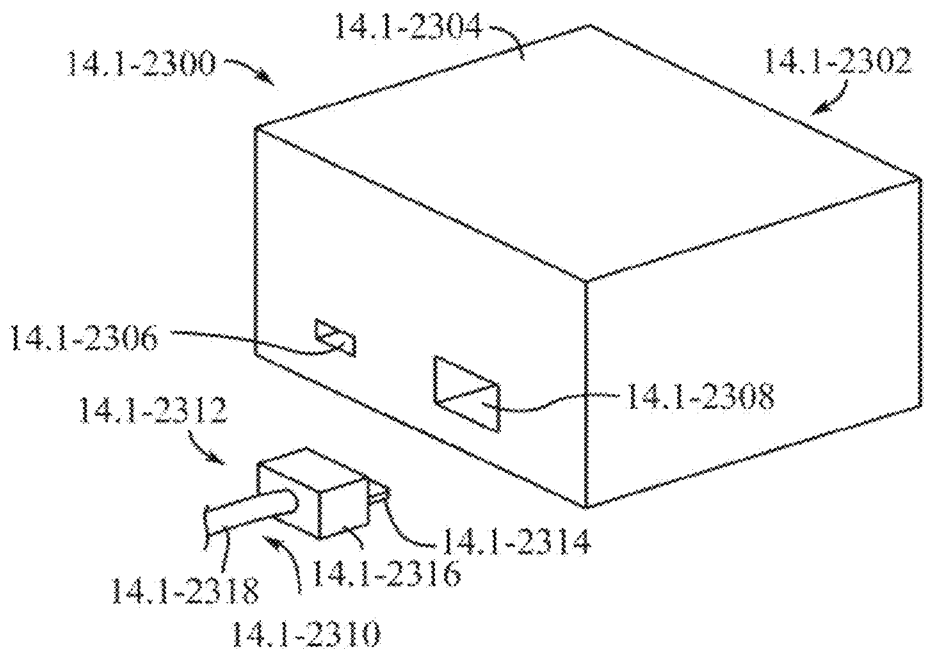
*FIG. 14.1-26B*

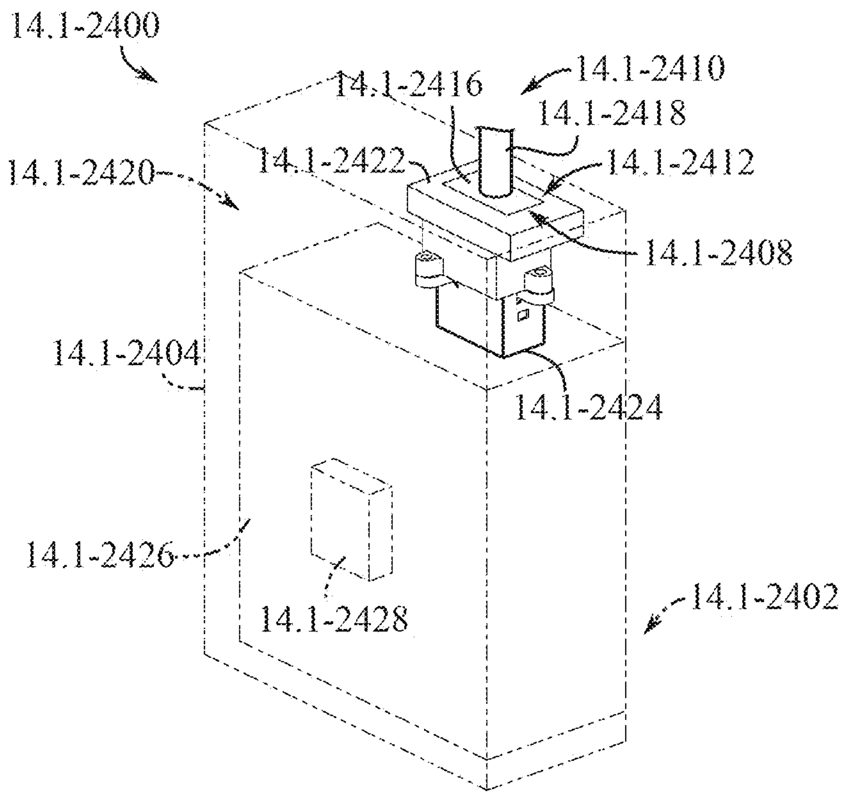
*FIG. 14.1-27A*

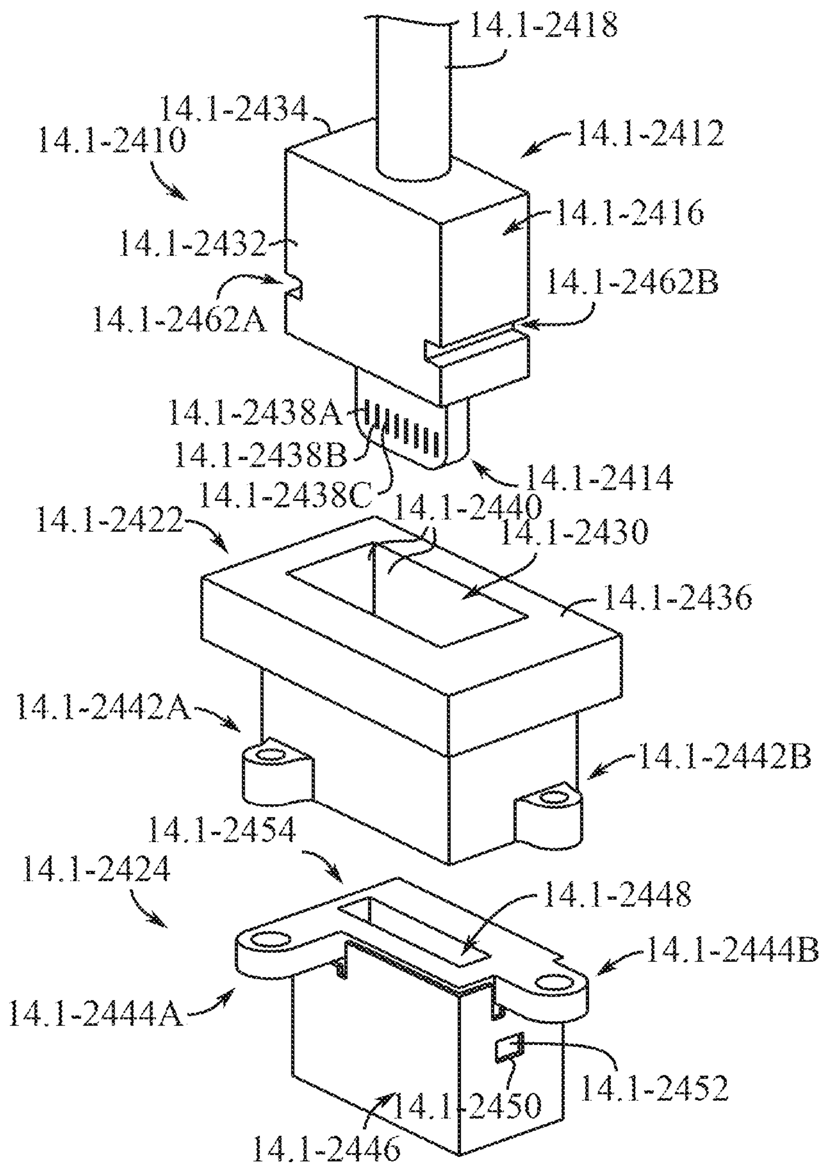
*FIG. 14.1-27B*

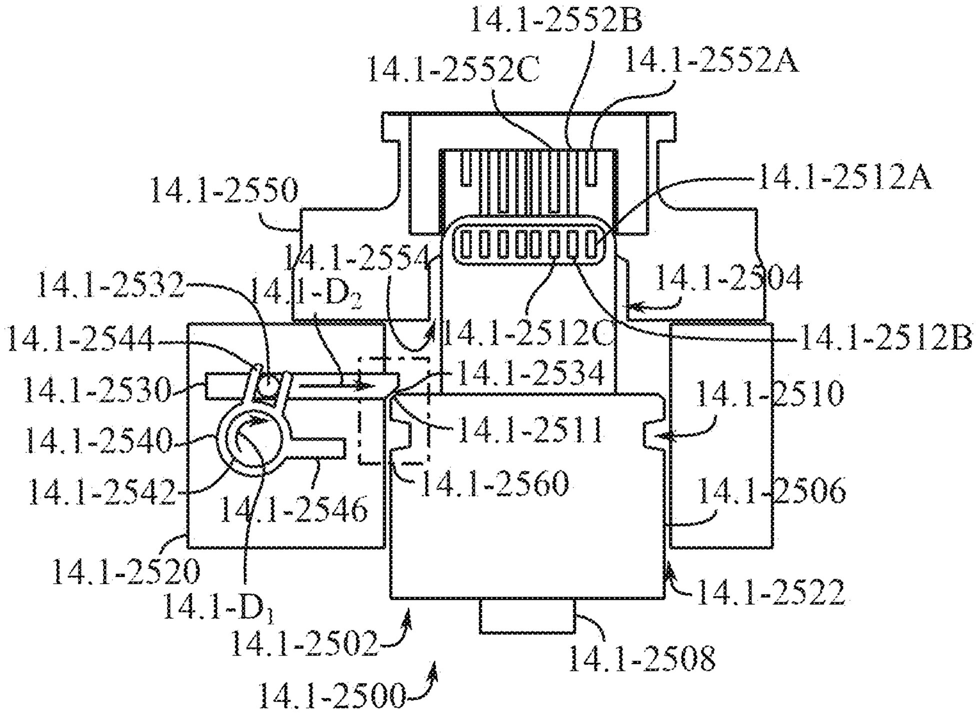
*FIG. 14.1-28A*
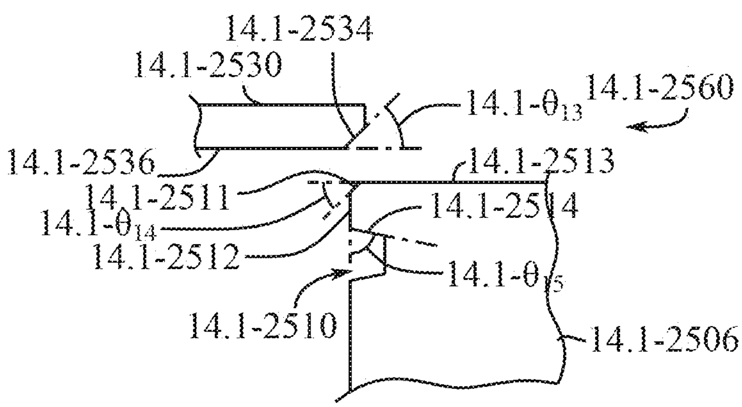
*FIG. 14.1-28B*

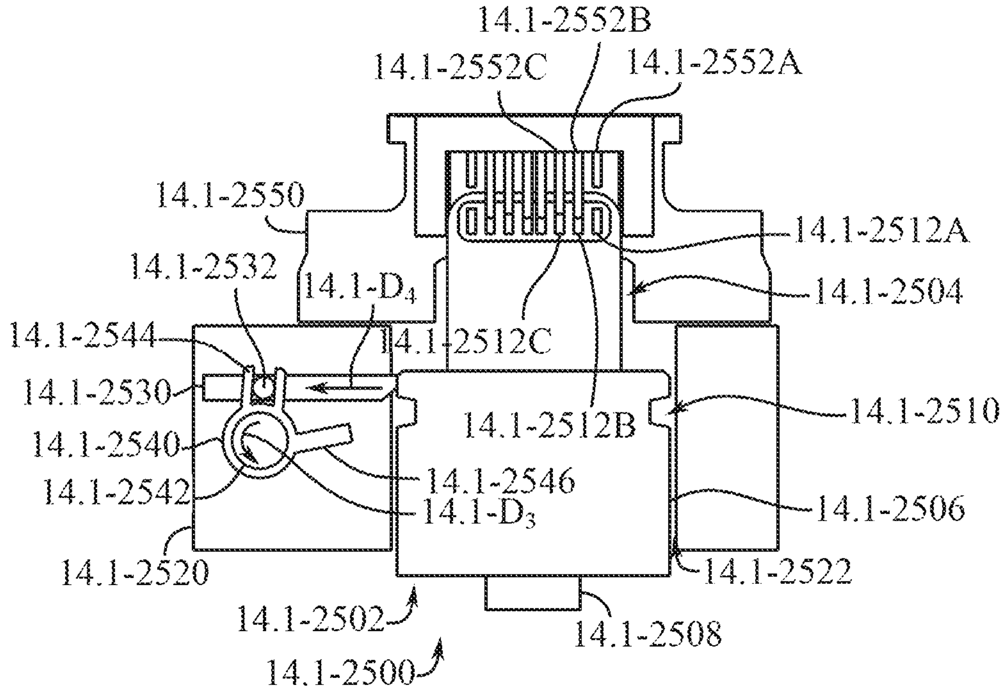
*FIG. 14.1-28C*
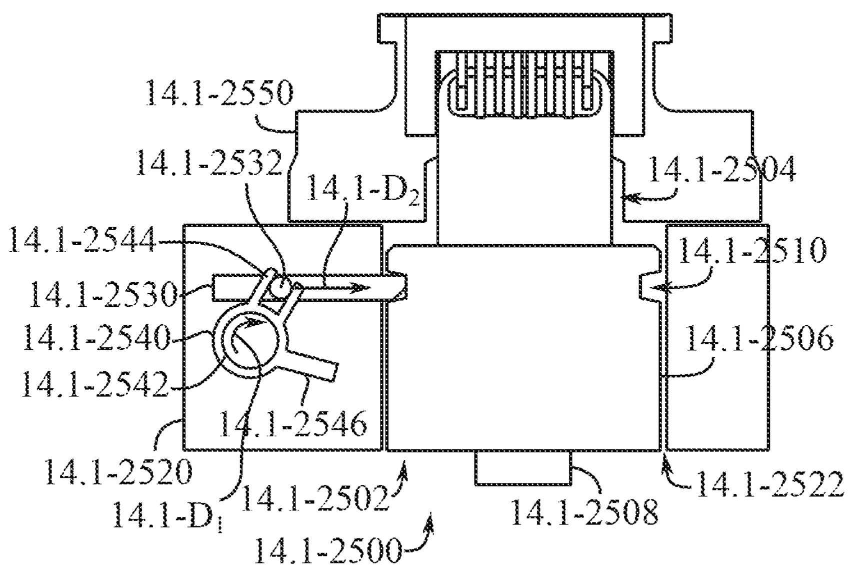
*FIG. 14.1-28D*

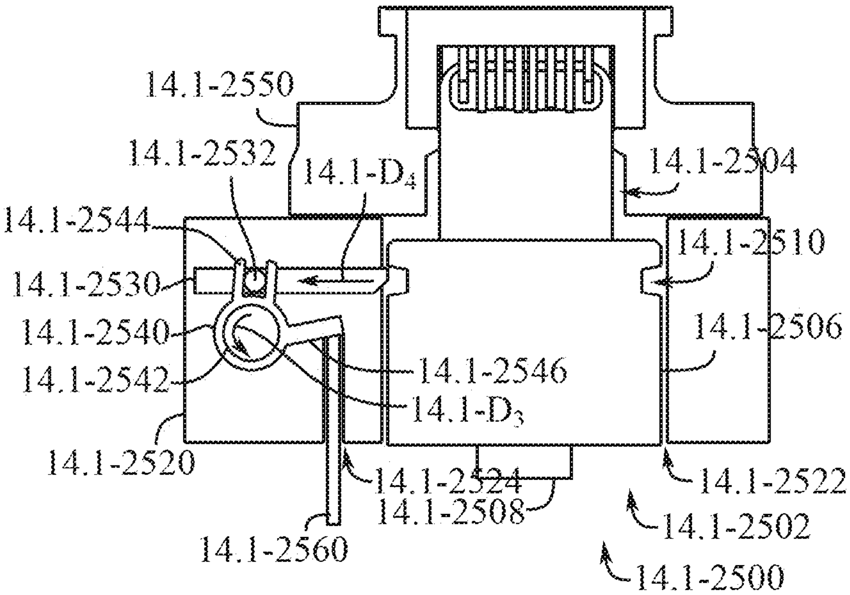
*FIG. 14.1-28E*
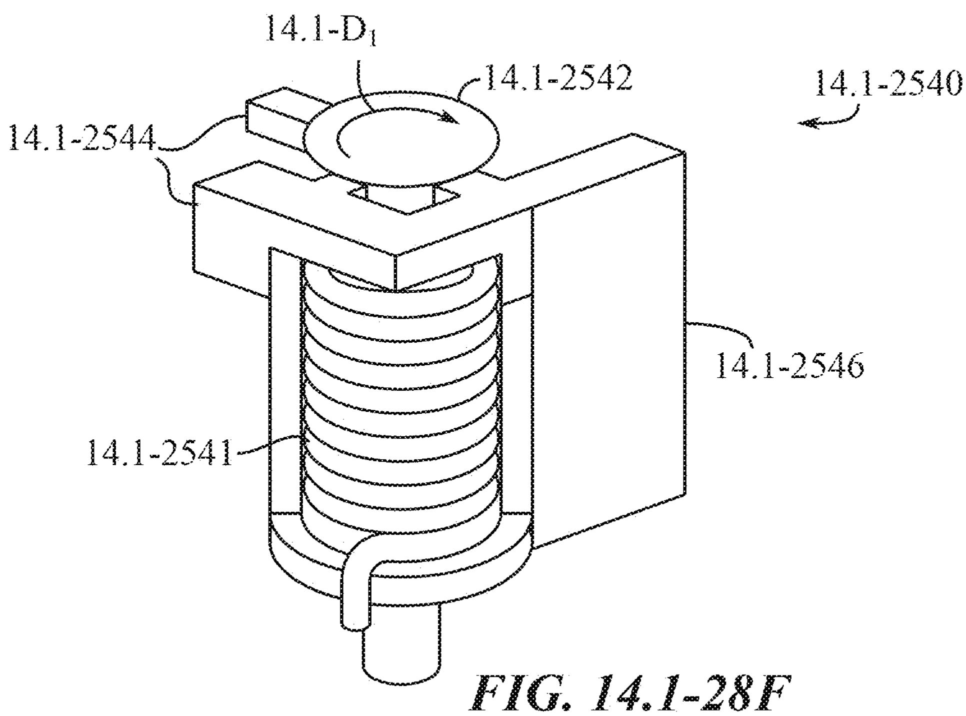
*FIG. 14.1-28F*

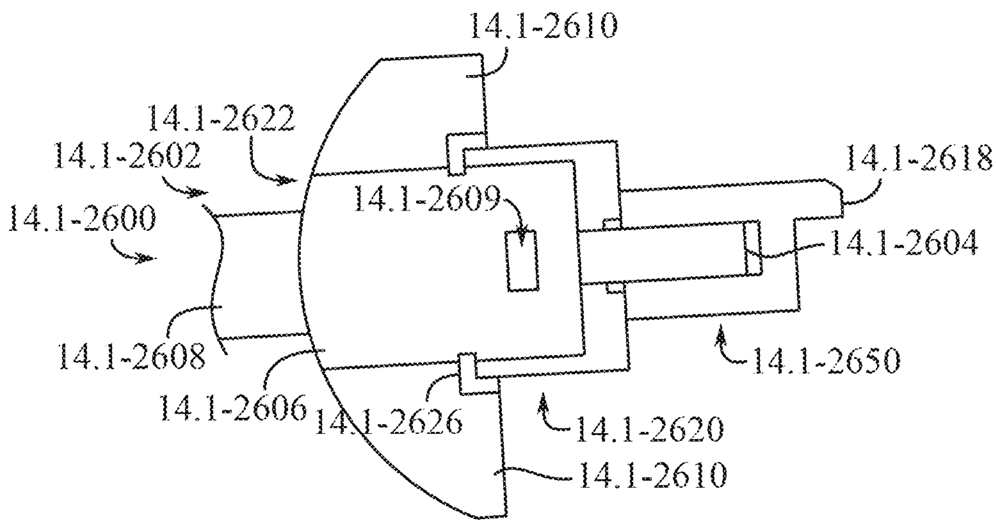
FIG. 14.1-29A
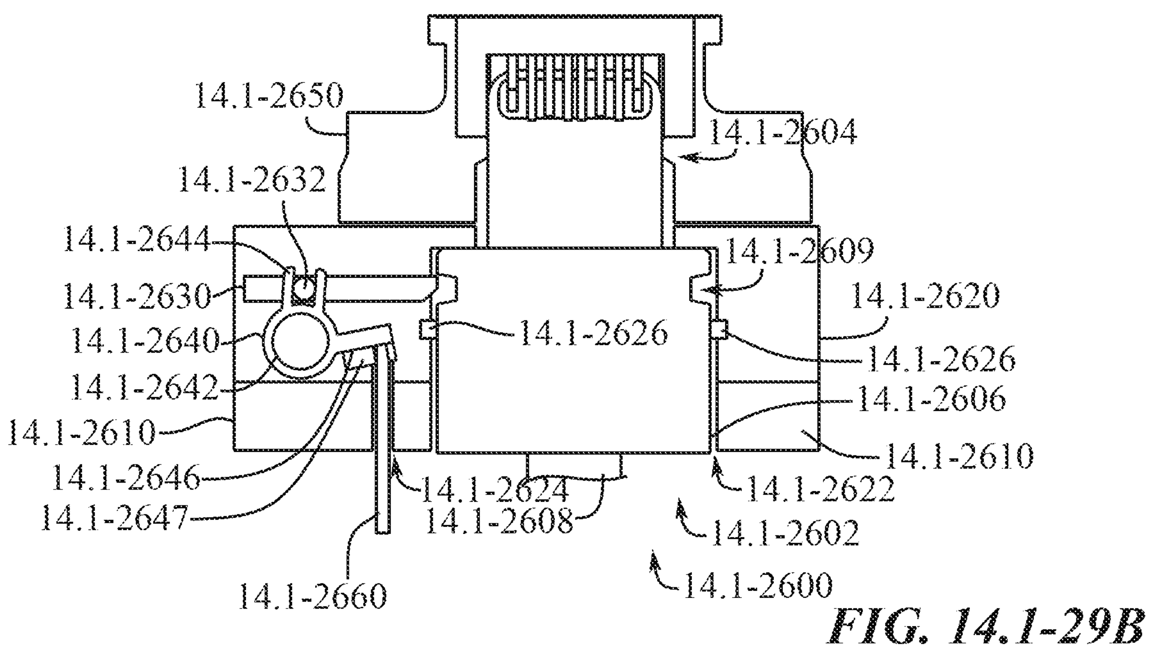
FIG. 14.1-29B

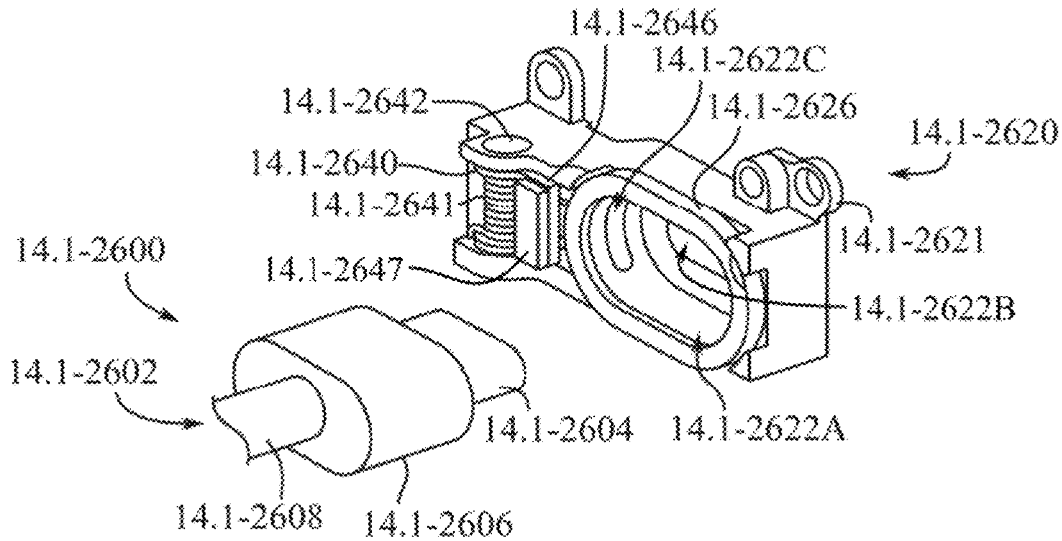
*FIG. 14.1-29C*
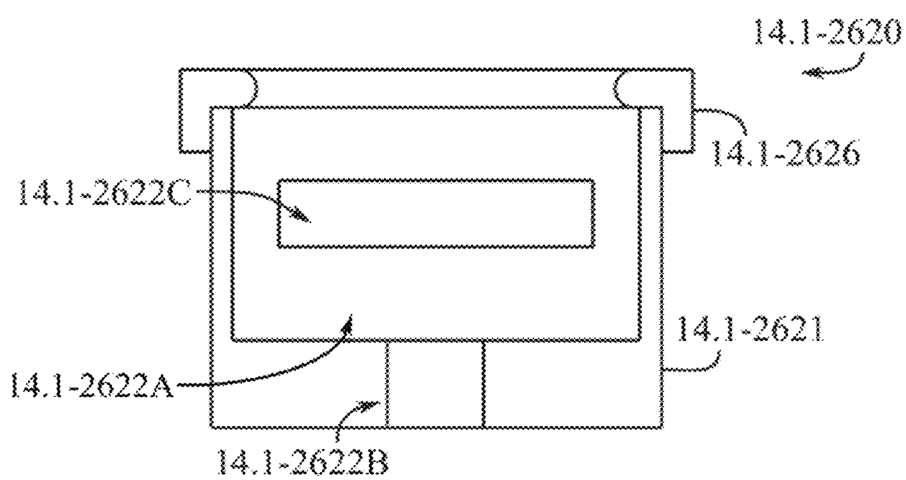
*FIG. 14.1-29D*

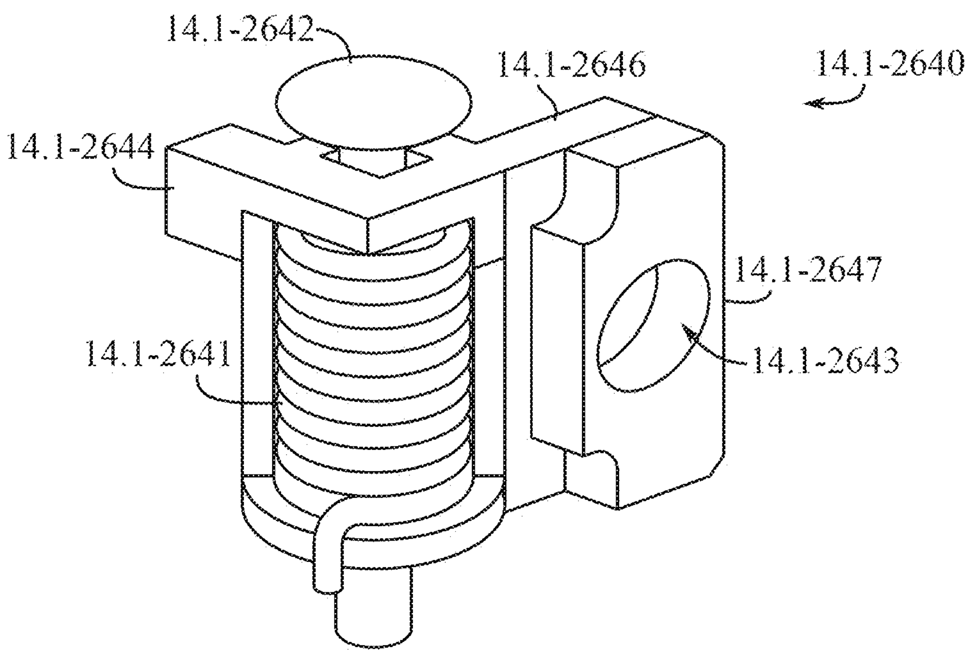
*FIG. 14.1-29E*

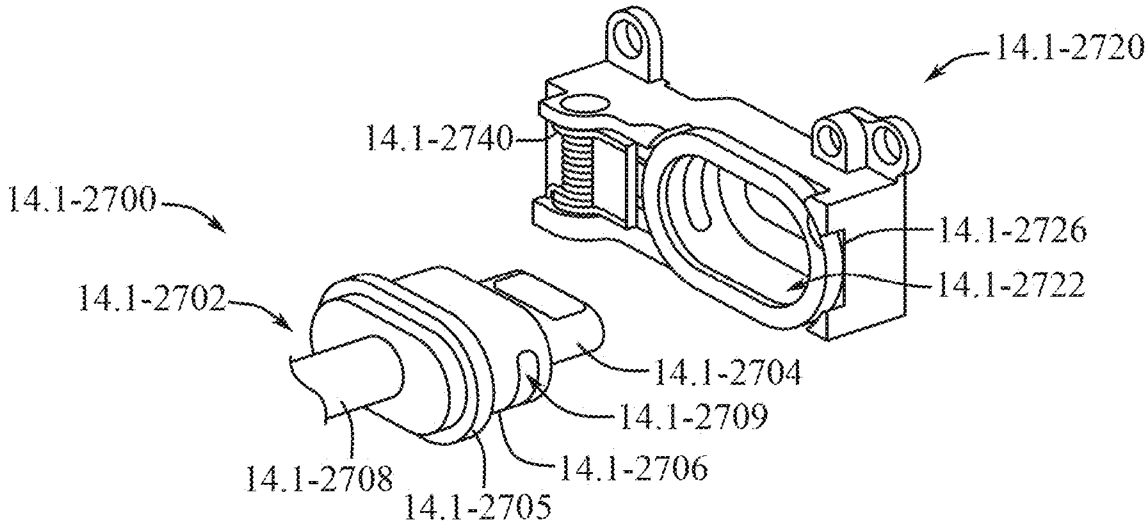
*FIG. 14.1-30A*
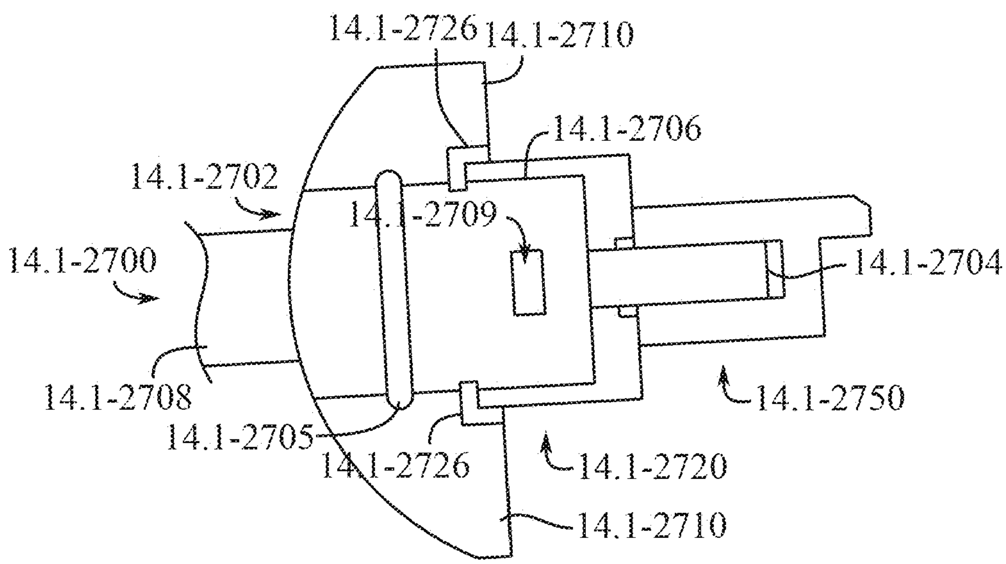
*FIG. 14.1-30B*

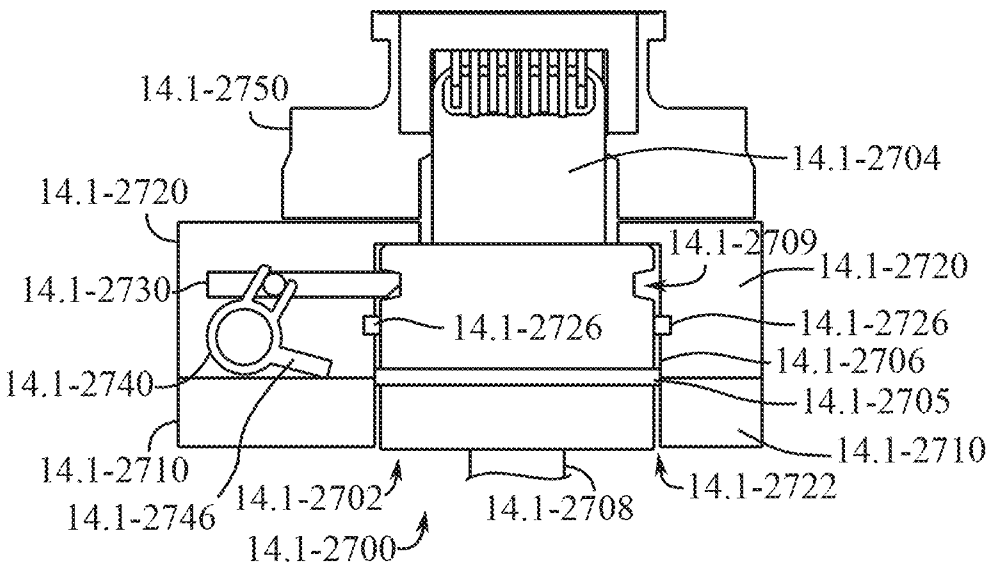
*FIG. 14.1-30C*

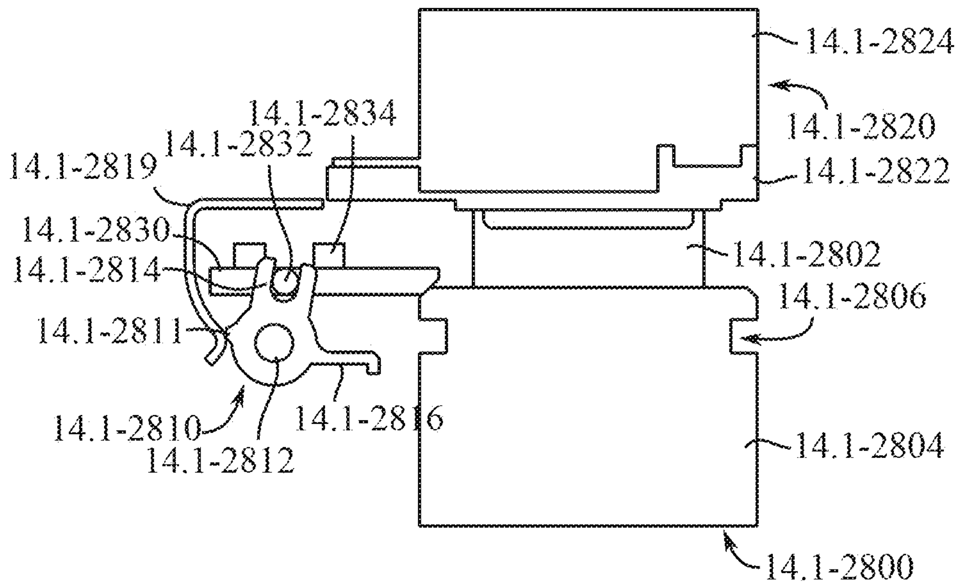
*FIG. 14.1-31A*
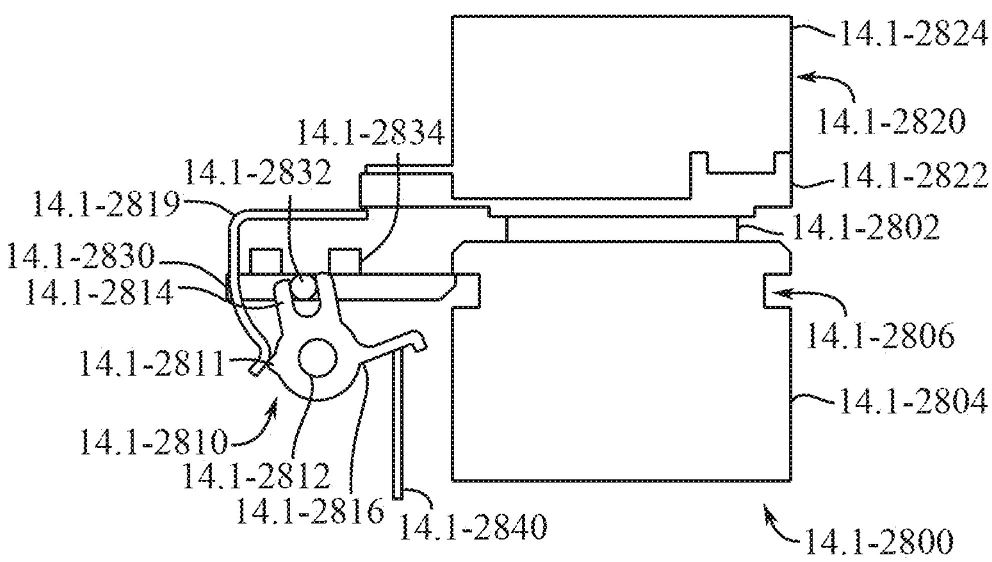
*FIG. 14.1-31B*

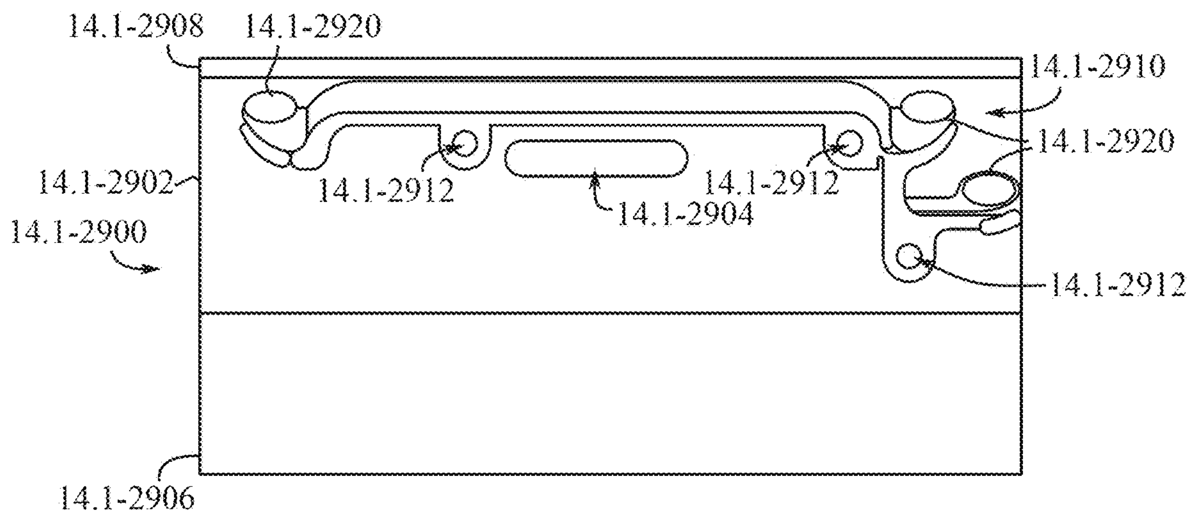
*FIG. 14.1-32A*
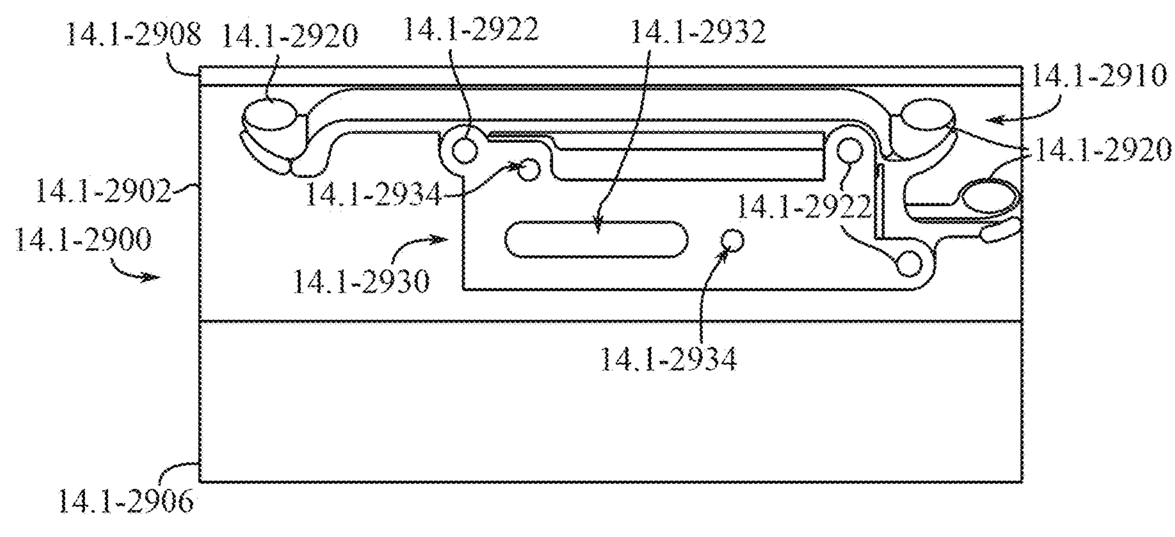
*FIG. 14.1-32B*

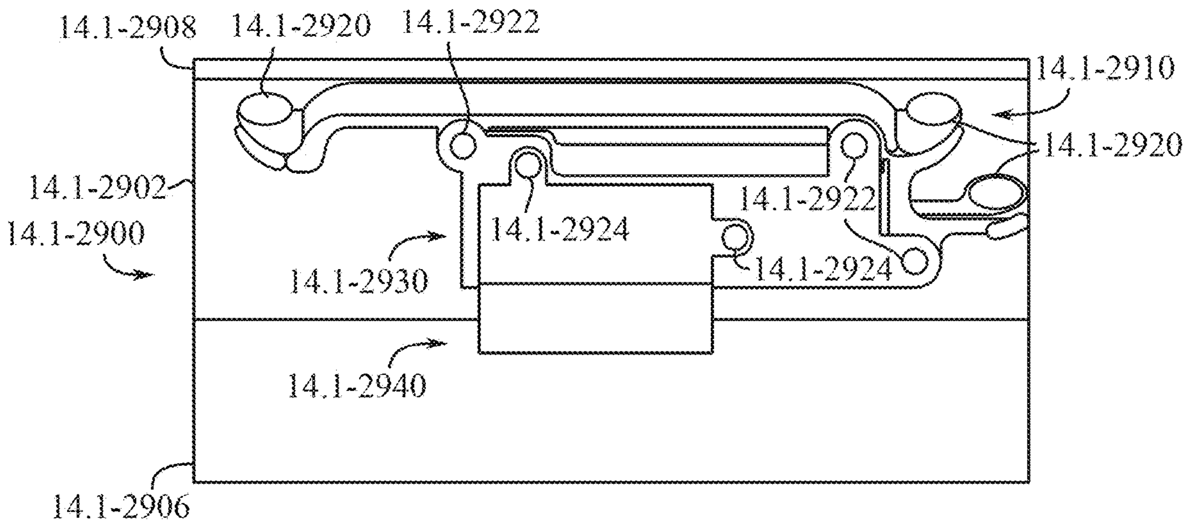
*FIG. 14.1-32C*

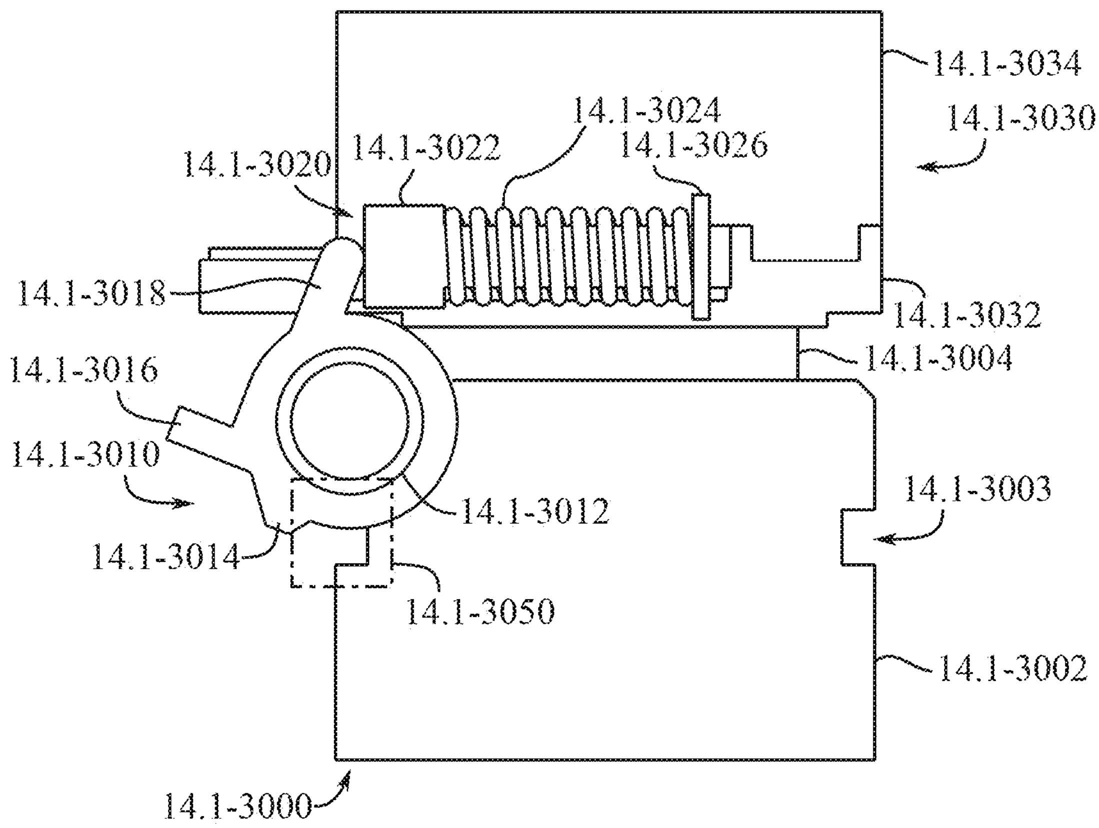
FIG. 14.1-33A
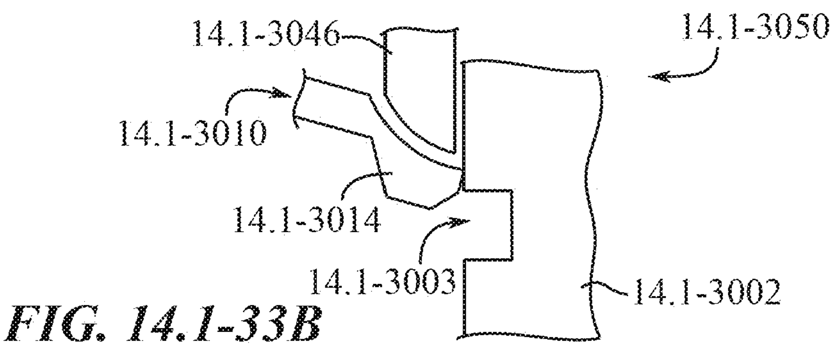
FIG. 14.1-33B

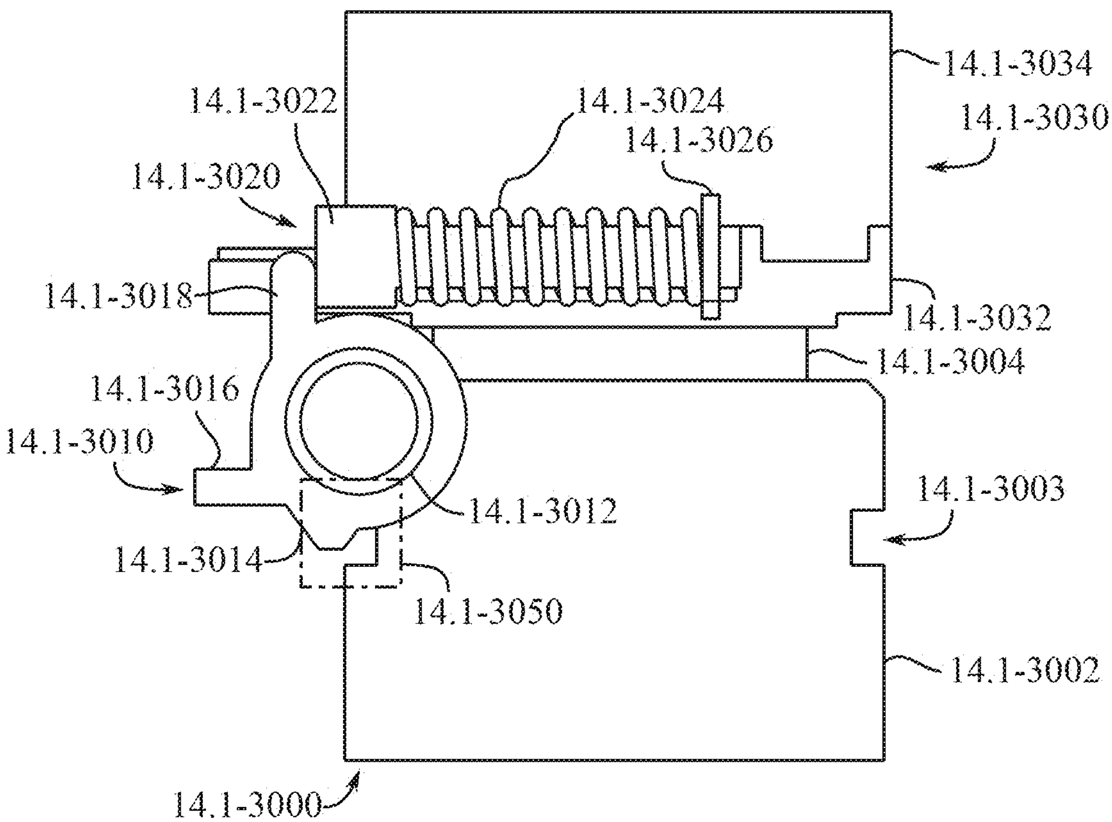
FIG. 14.1-33C
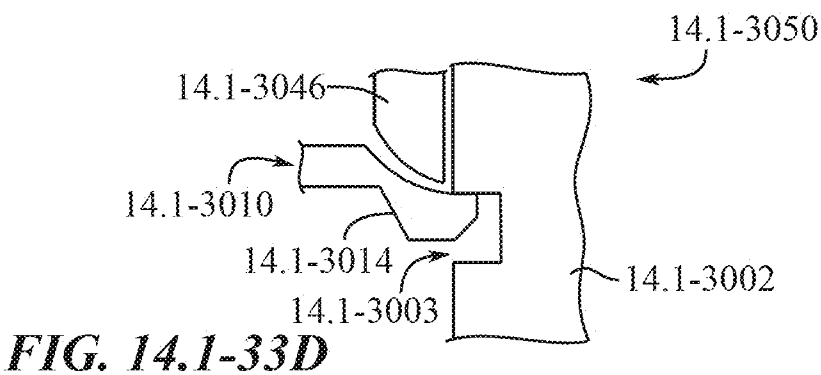
FIG. 14.1-33D

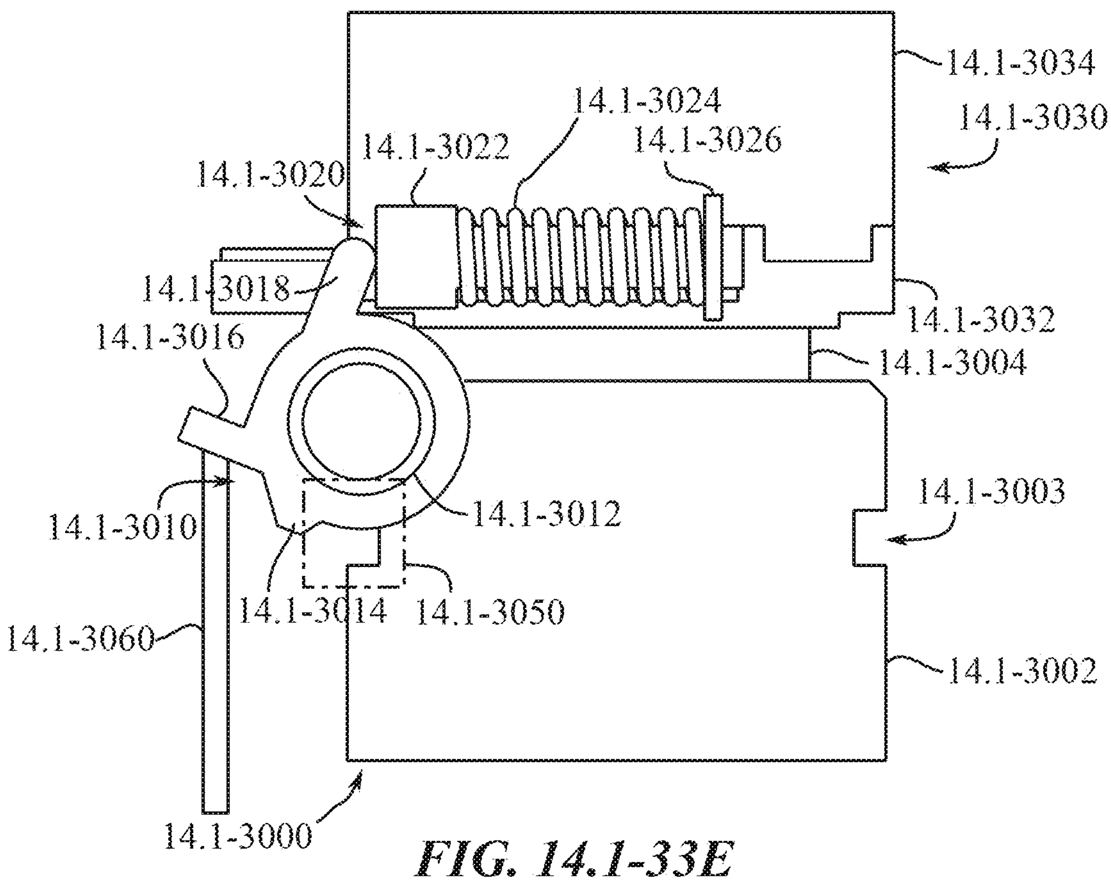
FIG. 14.1-33E
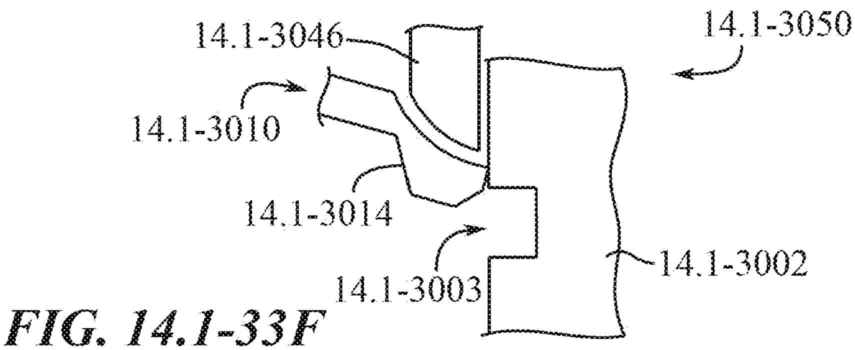
FIG. 14.1-33F

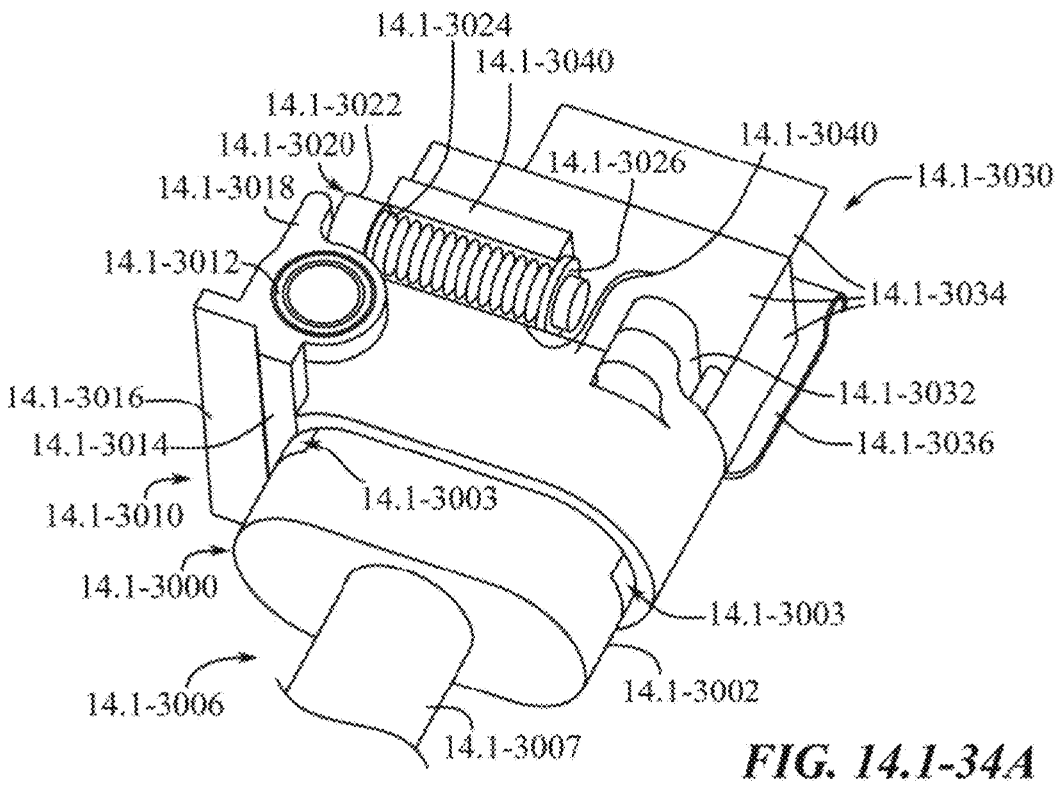
*FIG. 14.1-34A*
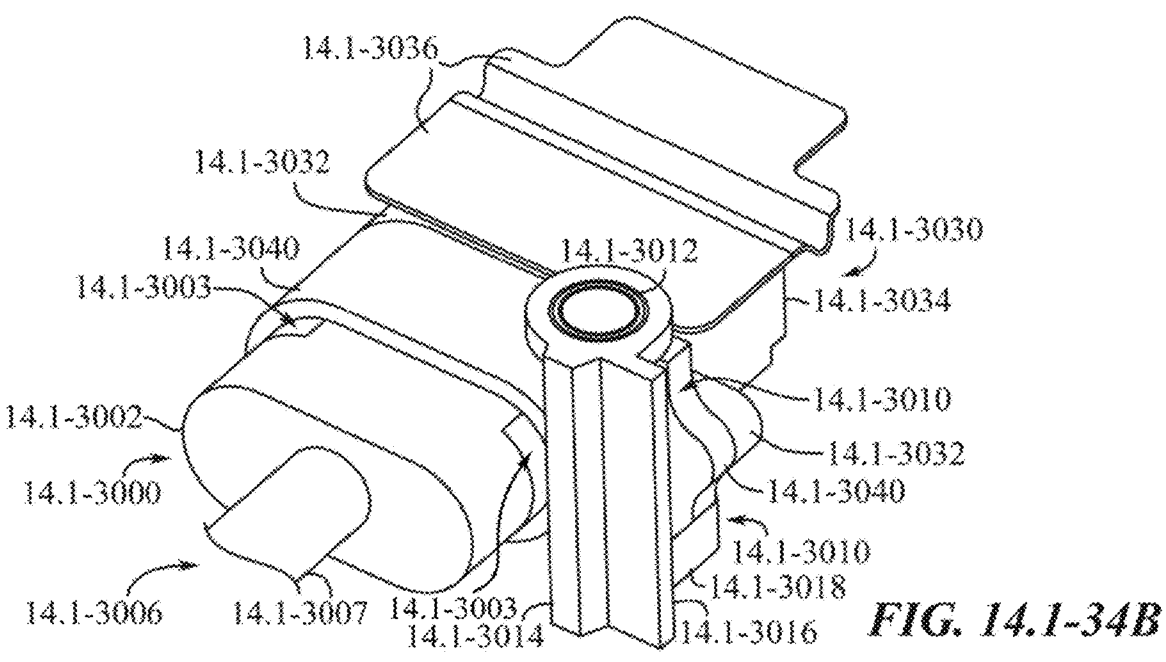
*FIG. 14.1-34B*

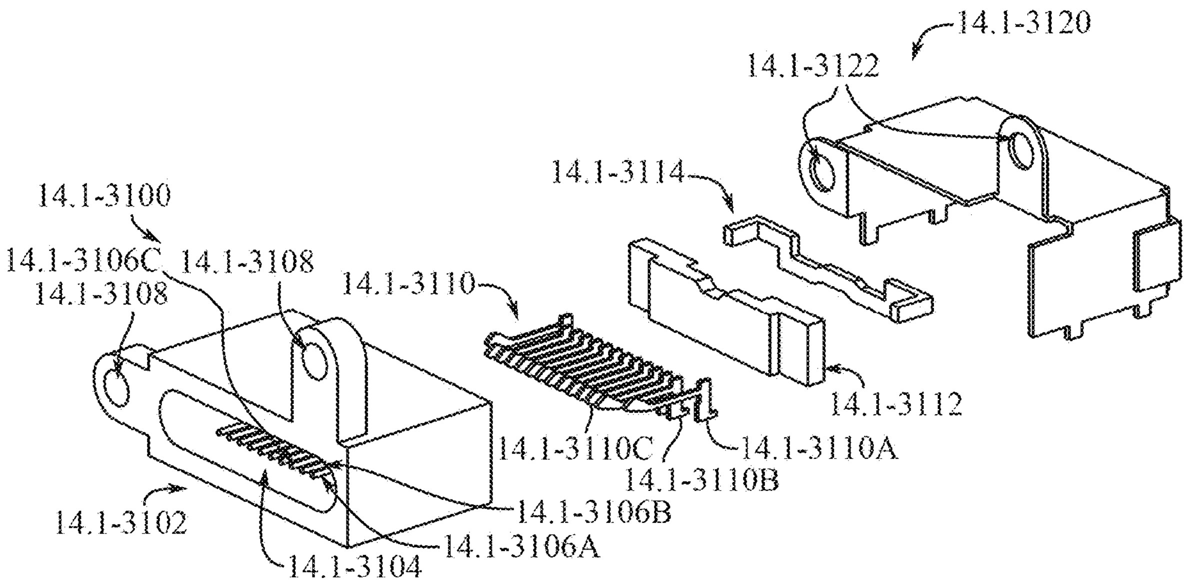
FIG. 14.1-35A
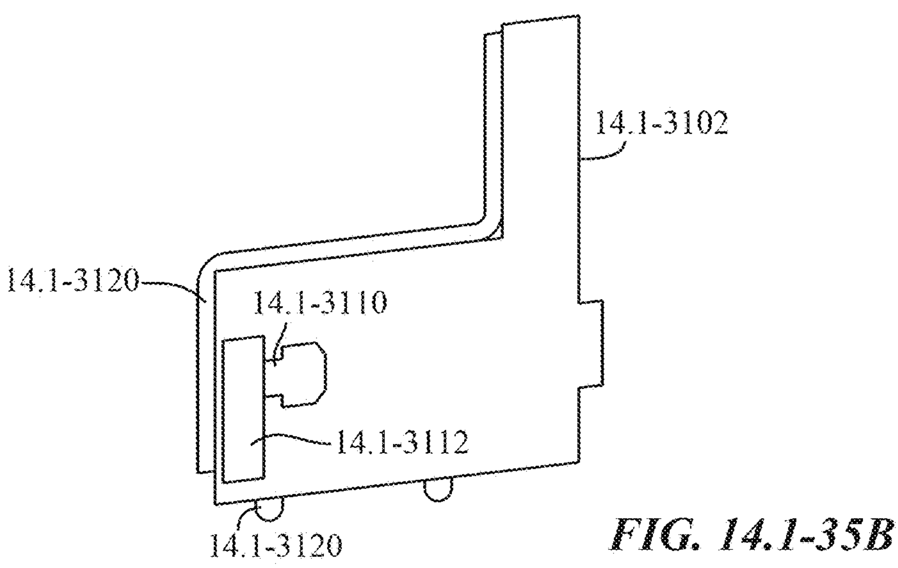
FIG. 14.1-35B

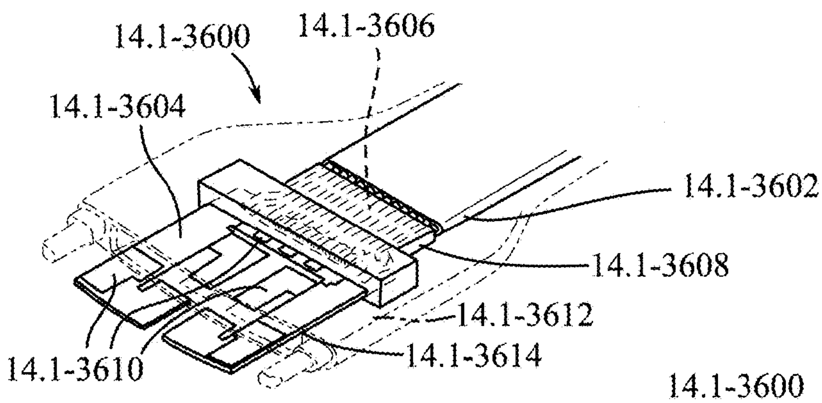
FIG. 14.1-36A
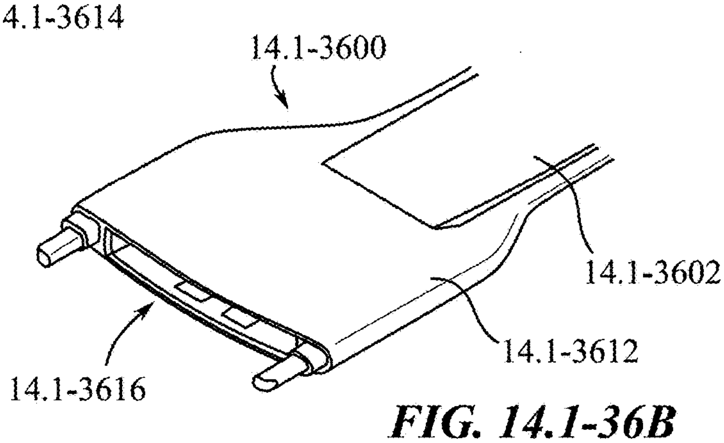
FIG. 14.1-36B
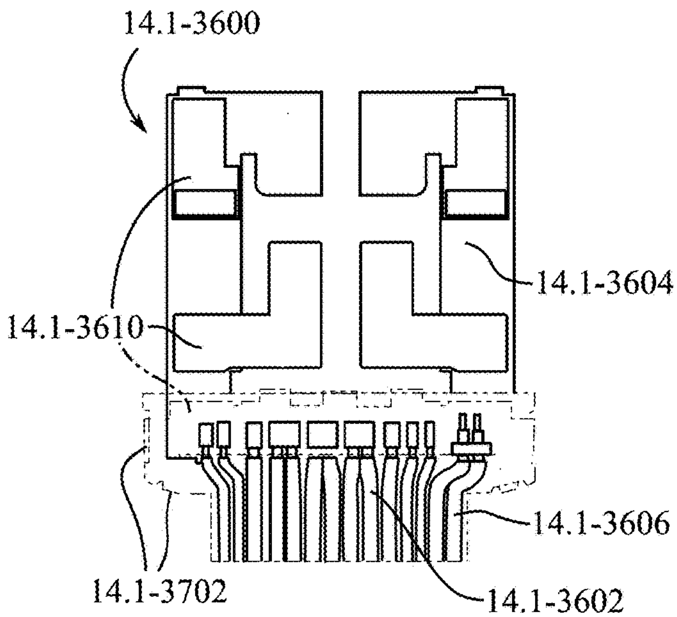
FIG. 14.1-37
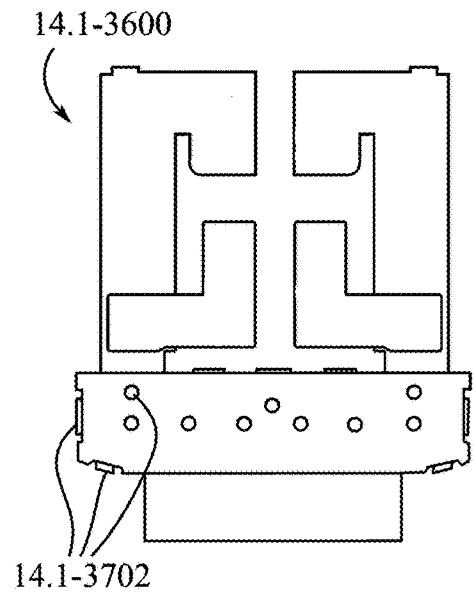
FIG. 14.1-38

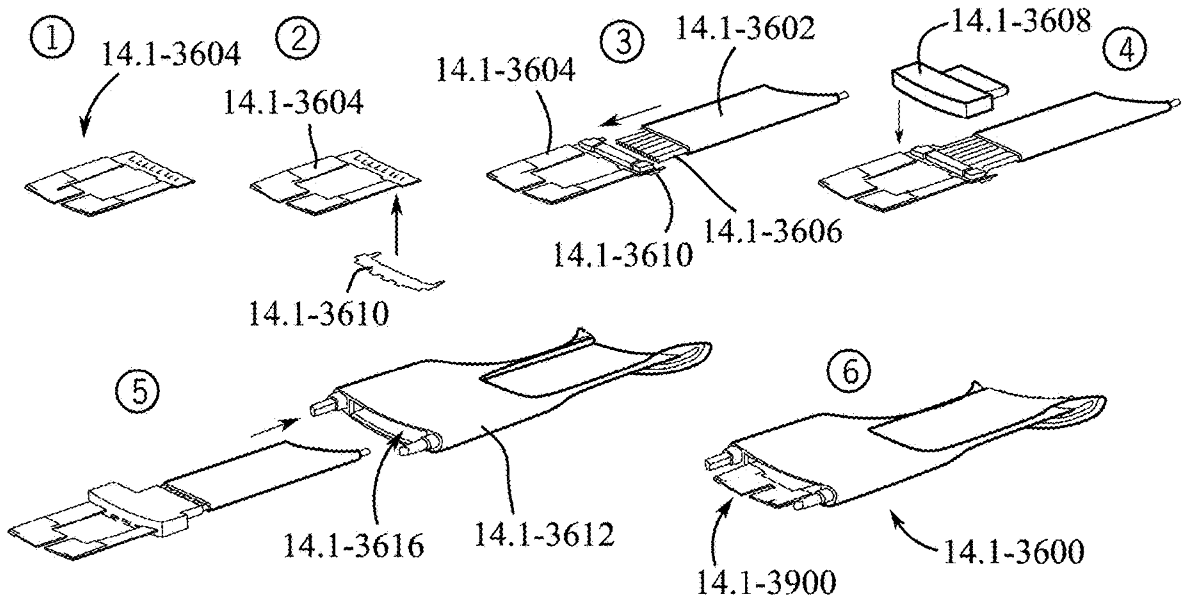
*FIG. 14.1-39*
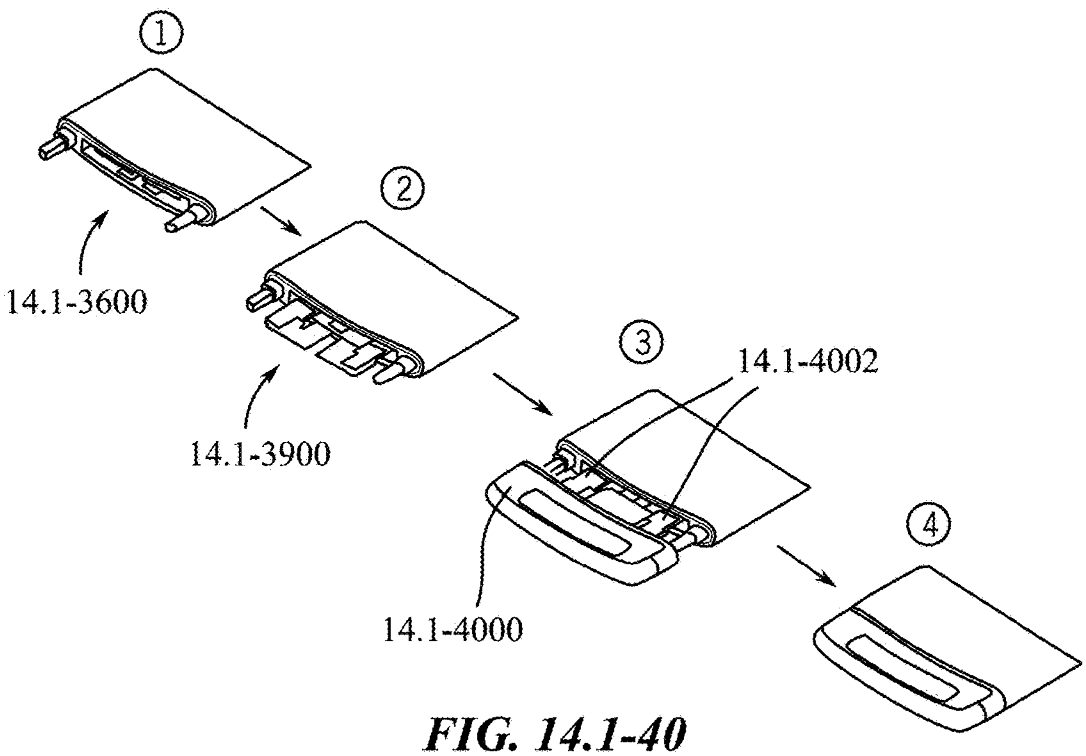
*FIG. 14.1-40*

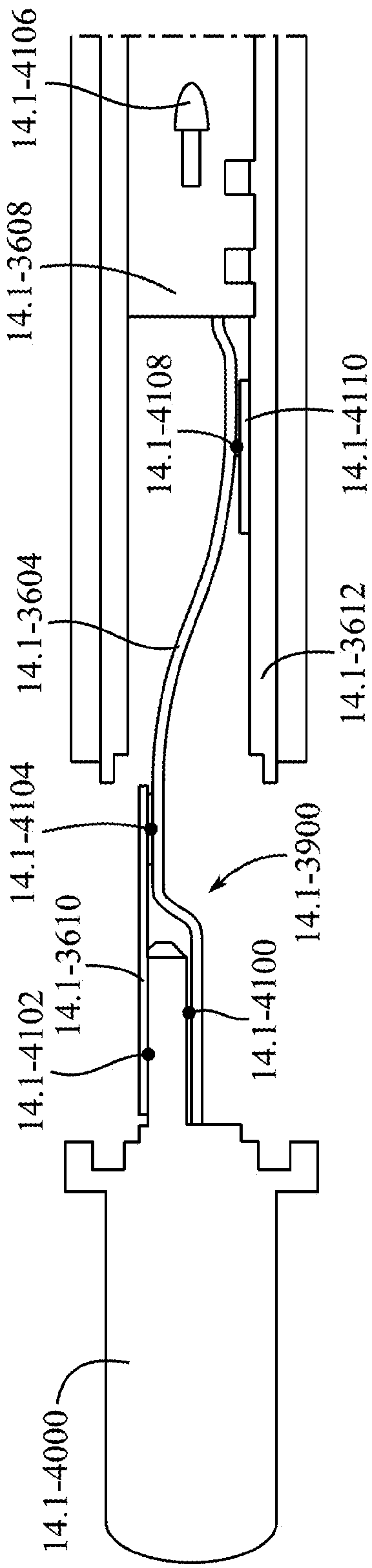
FIG. 14.1-41A
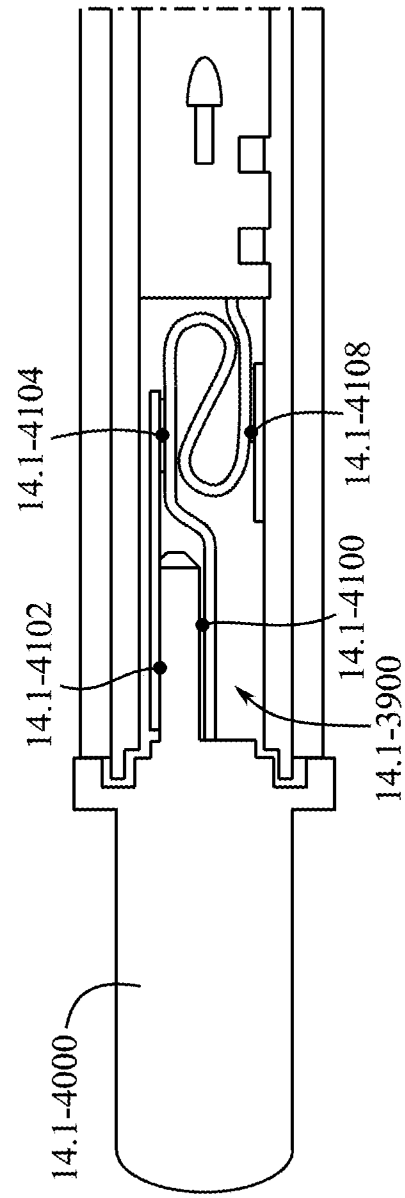
FIG. 14.1-41B

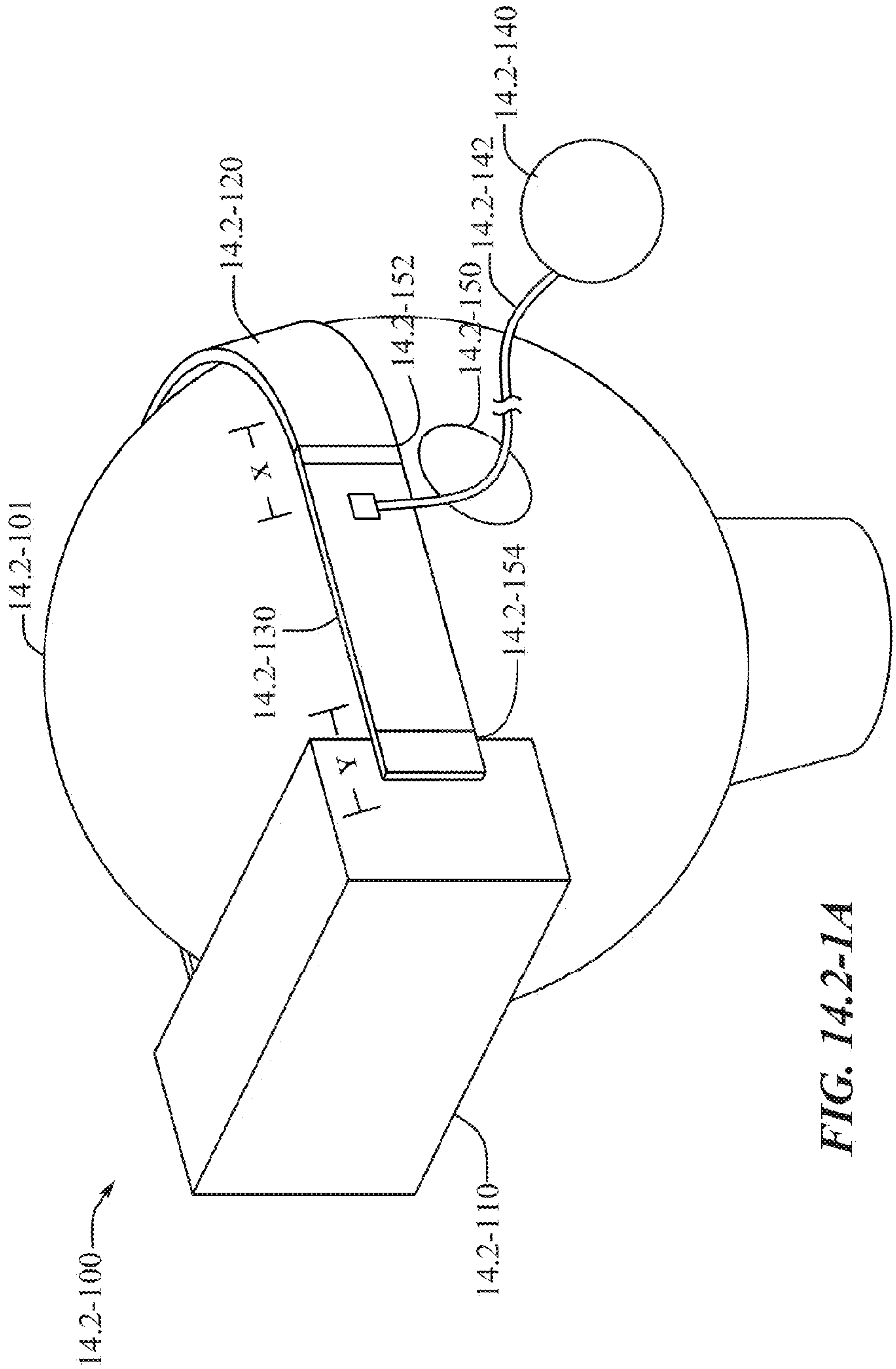
FIG. 14.2-1A

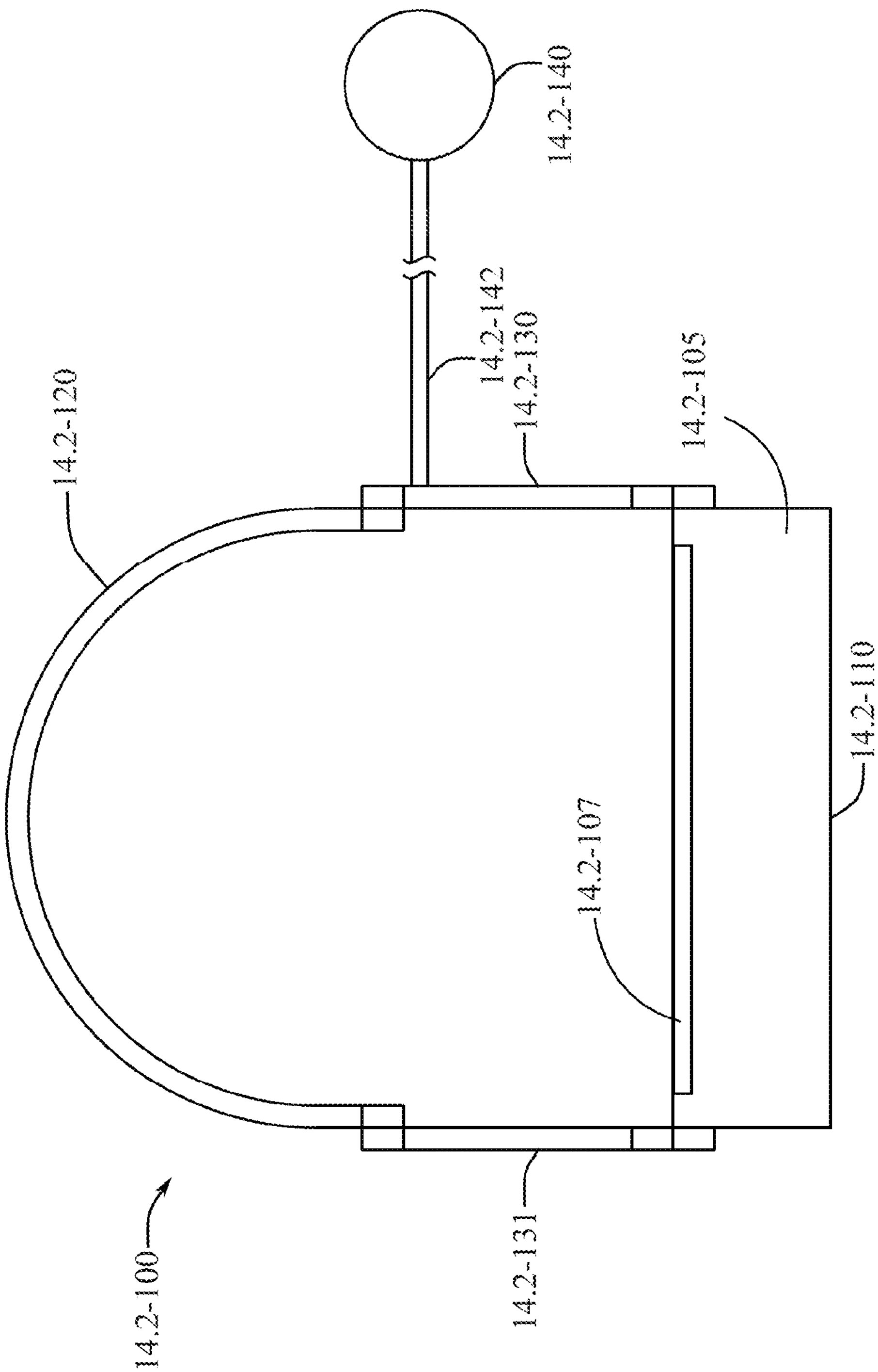
*FIG. 14.2-1B*

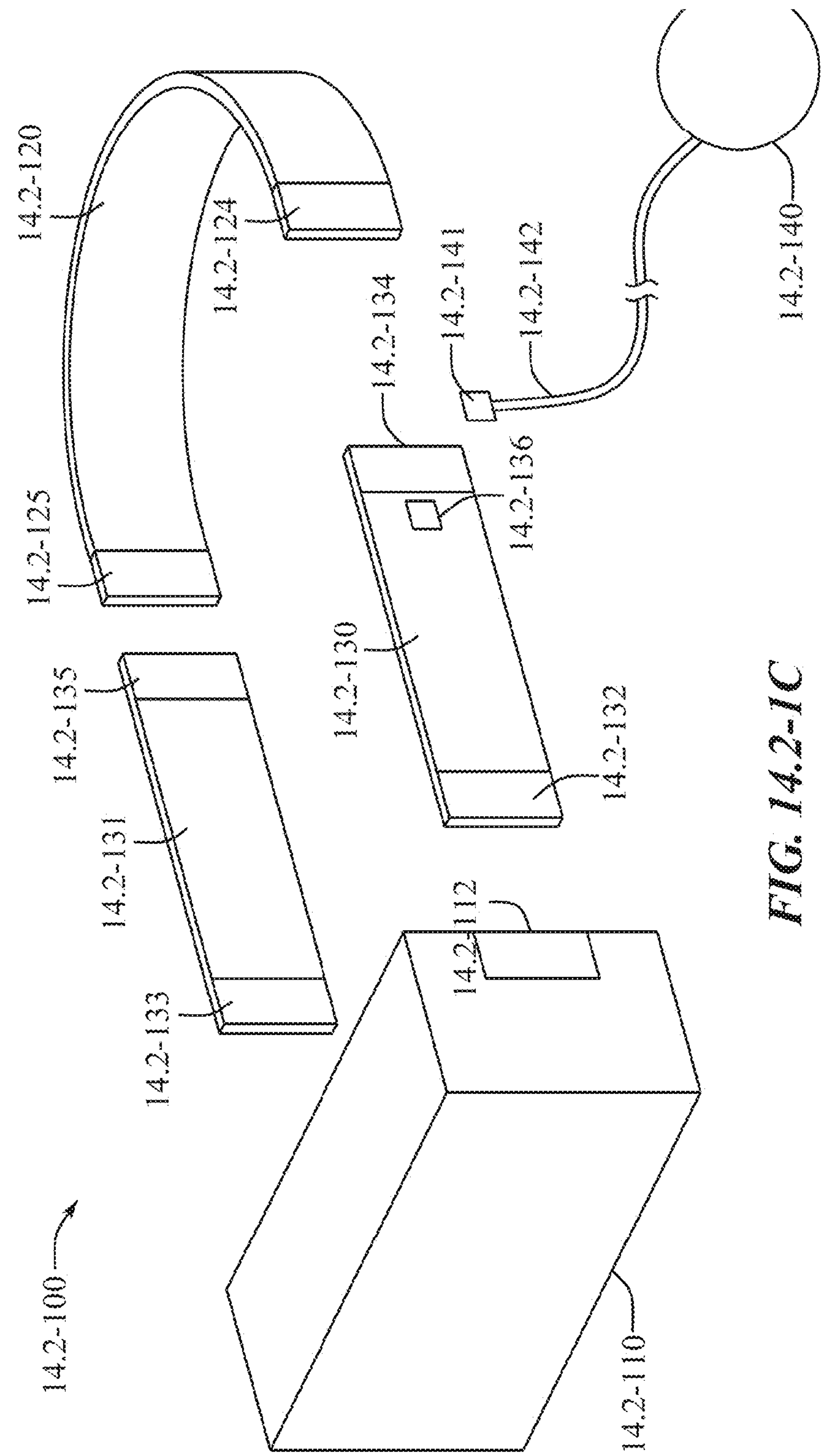
FIG. 14.2-1C

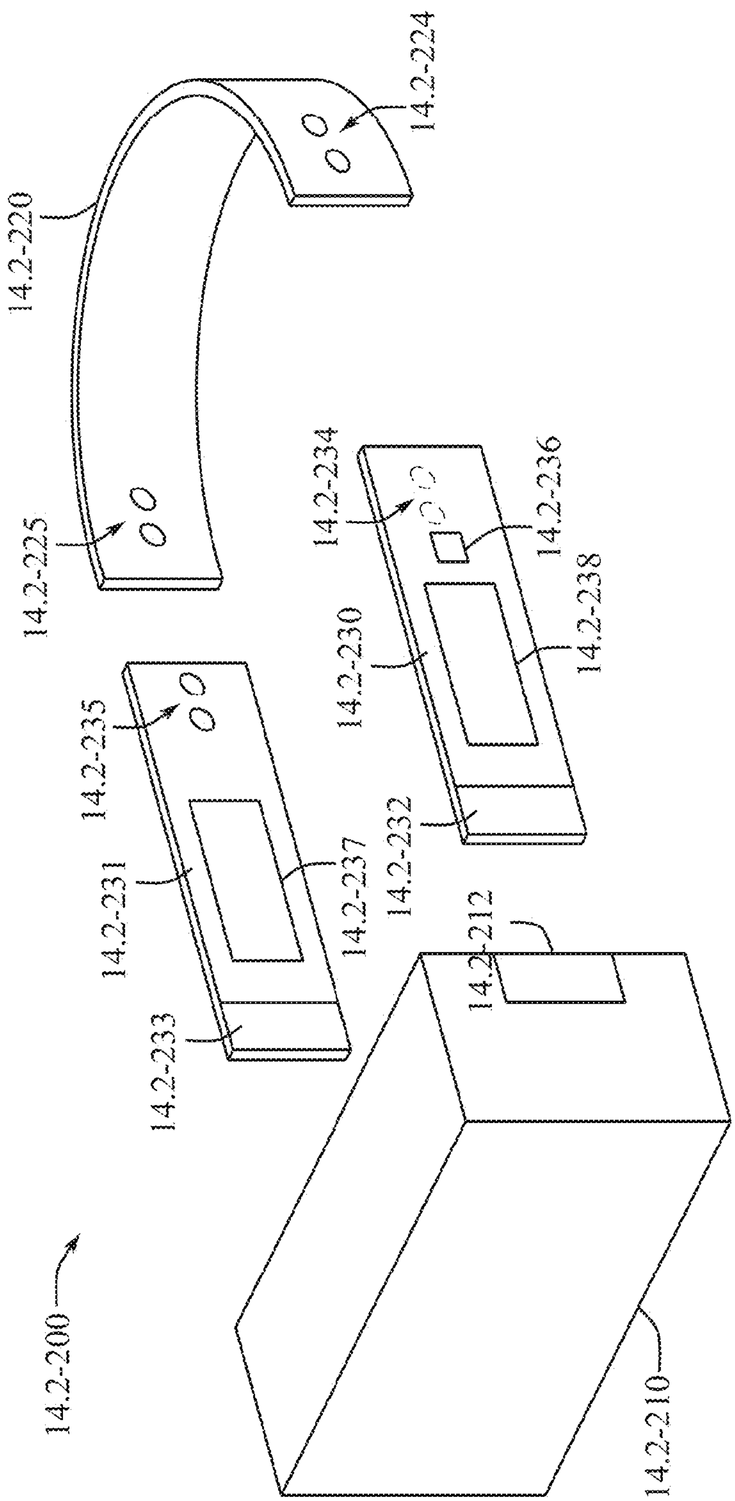
FIG. 14.2-2A

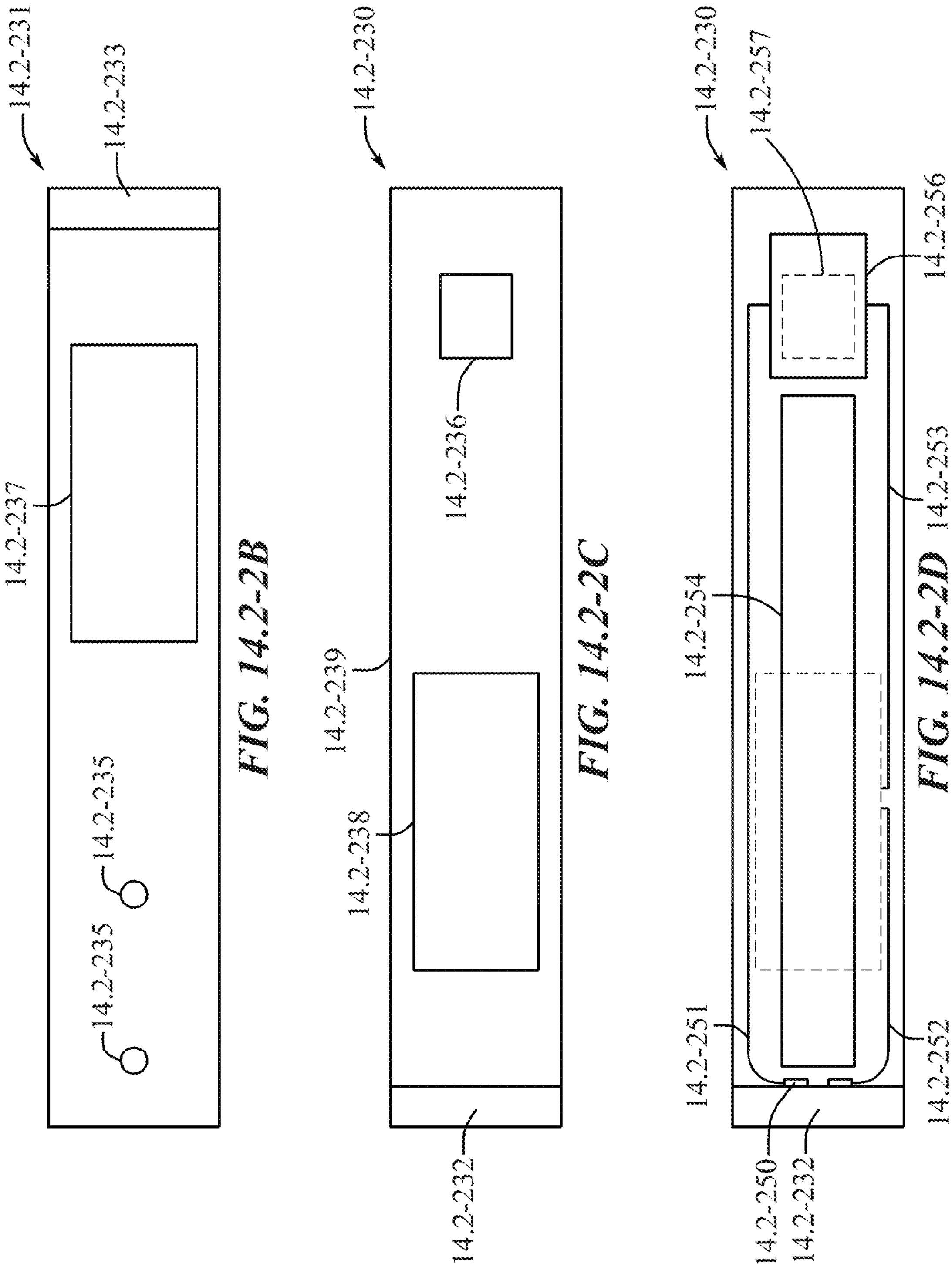
FIG. 14.2-2B
FIG. 14.2-2C
FIG. 14.2-2D

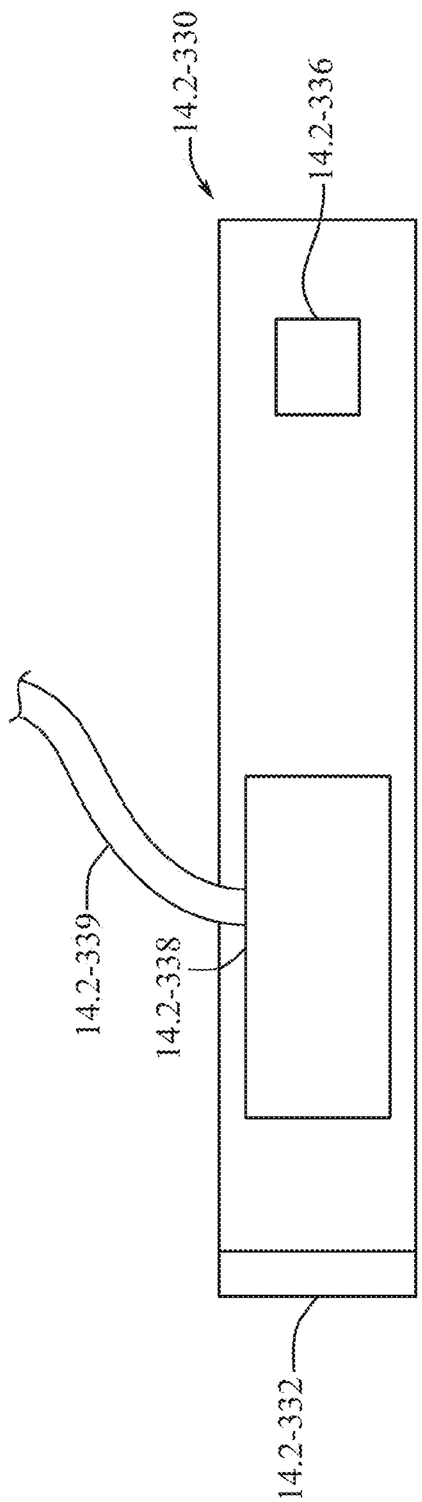
*FIG. 14.2-3*
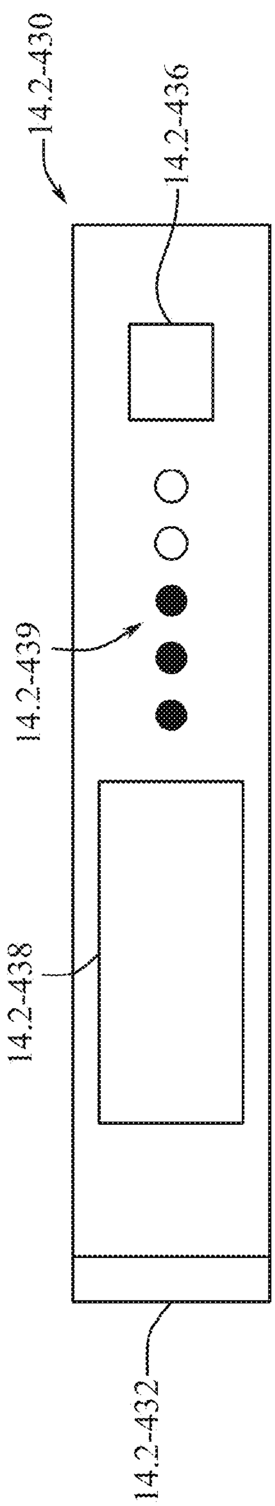
*FIG. 14.2-4*

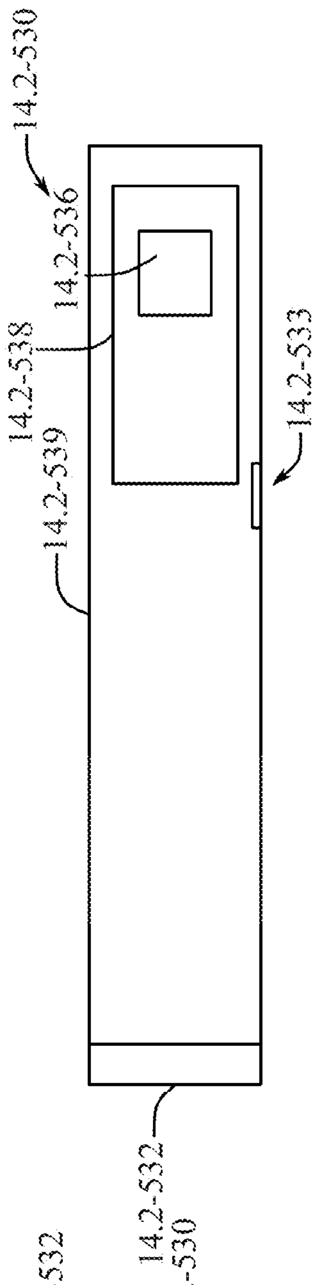
FIG. 14.2-5B
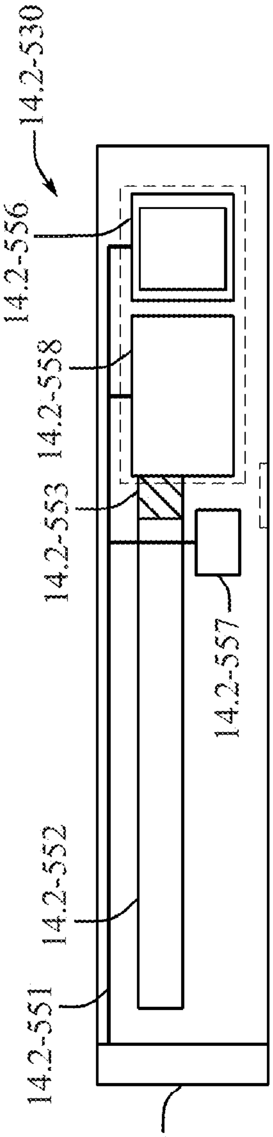
FIG. 14.2-5C
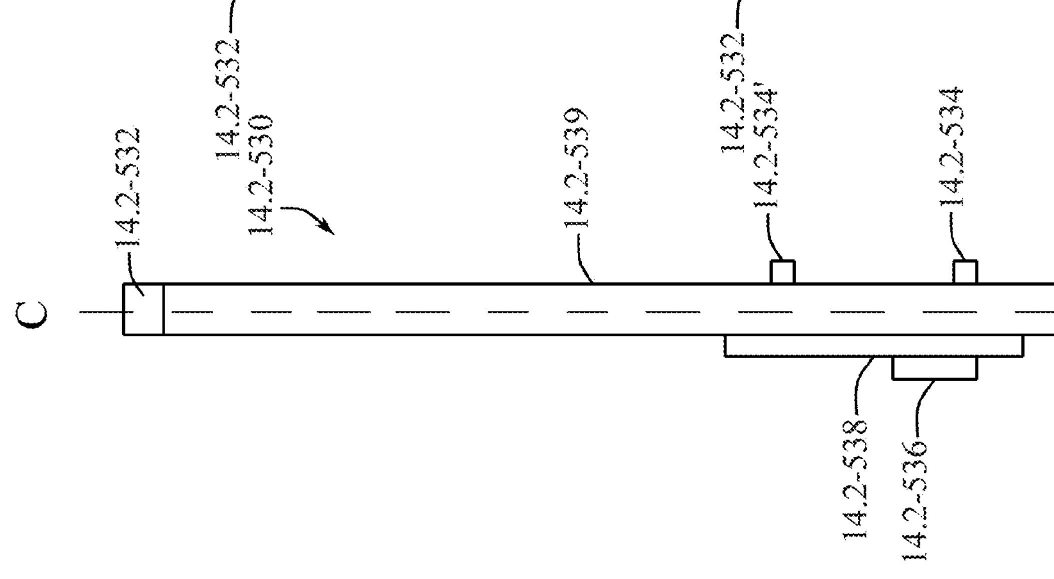
FIG. 14.2-5A

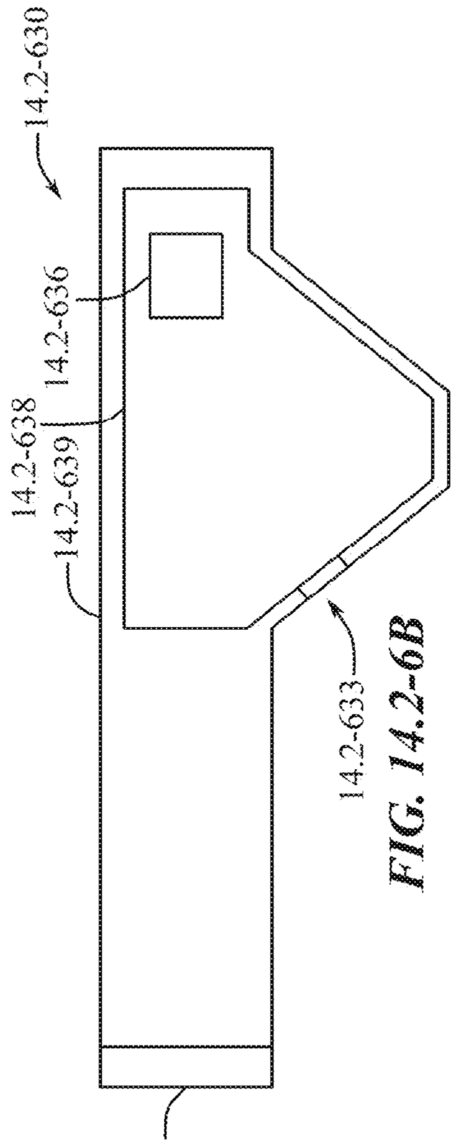
FIG. 14.2-6B
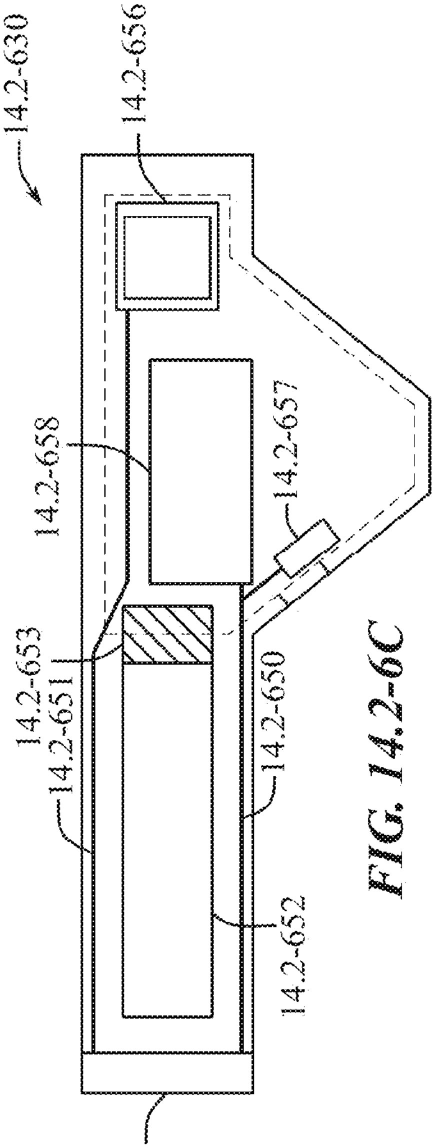
FIG. 14.2-6C
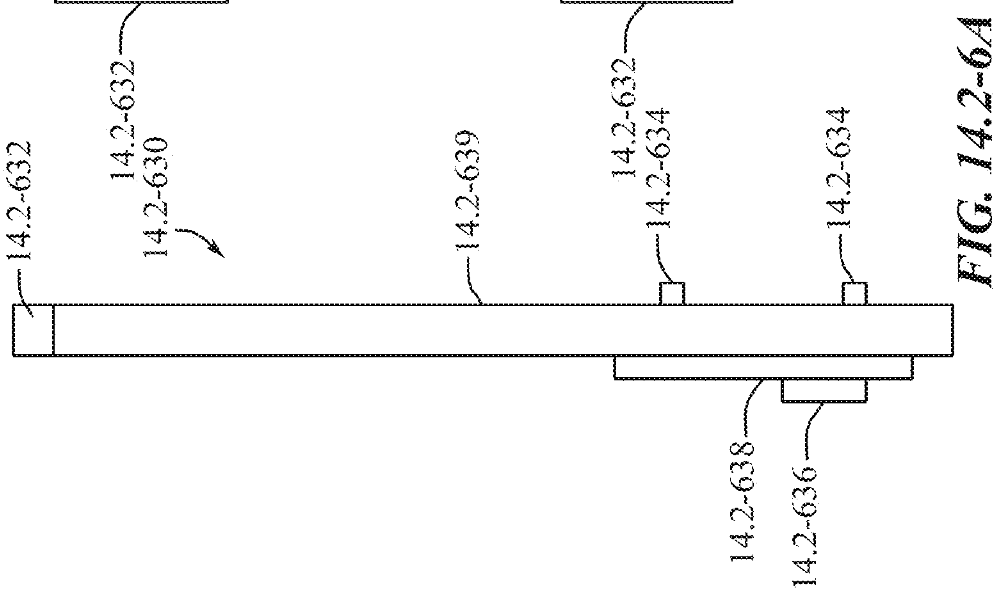
FIG. 14.2-6A

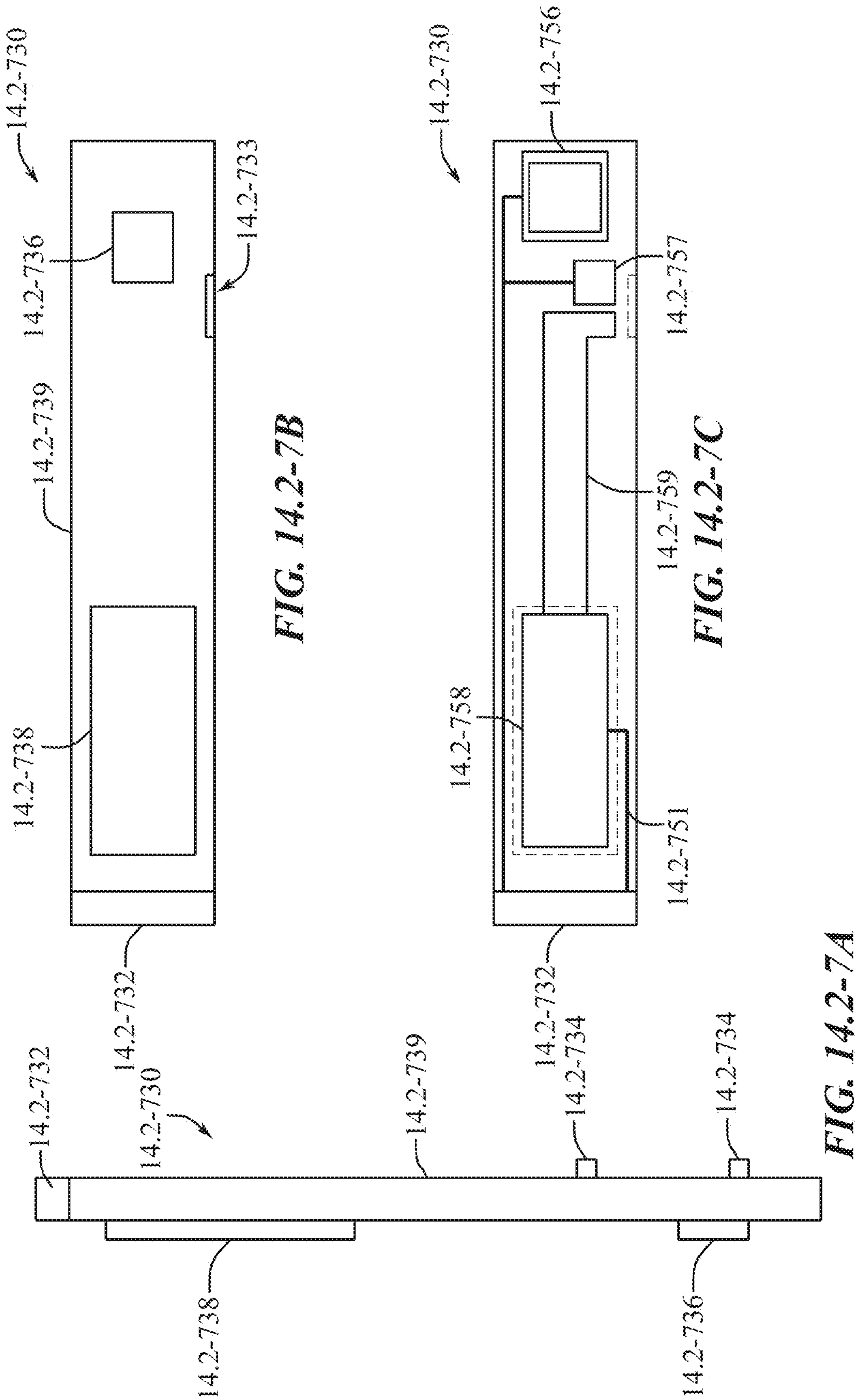
FIG. 14.2-7B
FIG. 14.2-7C
FIG. 14.2-7A

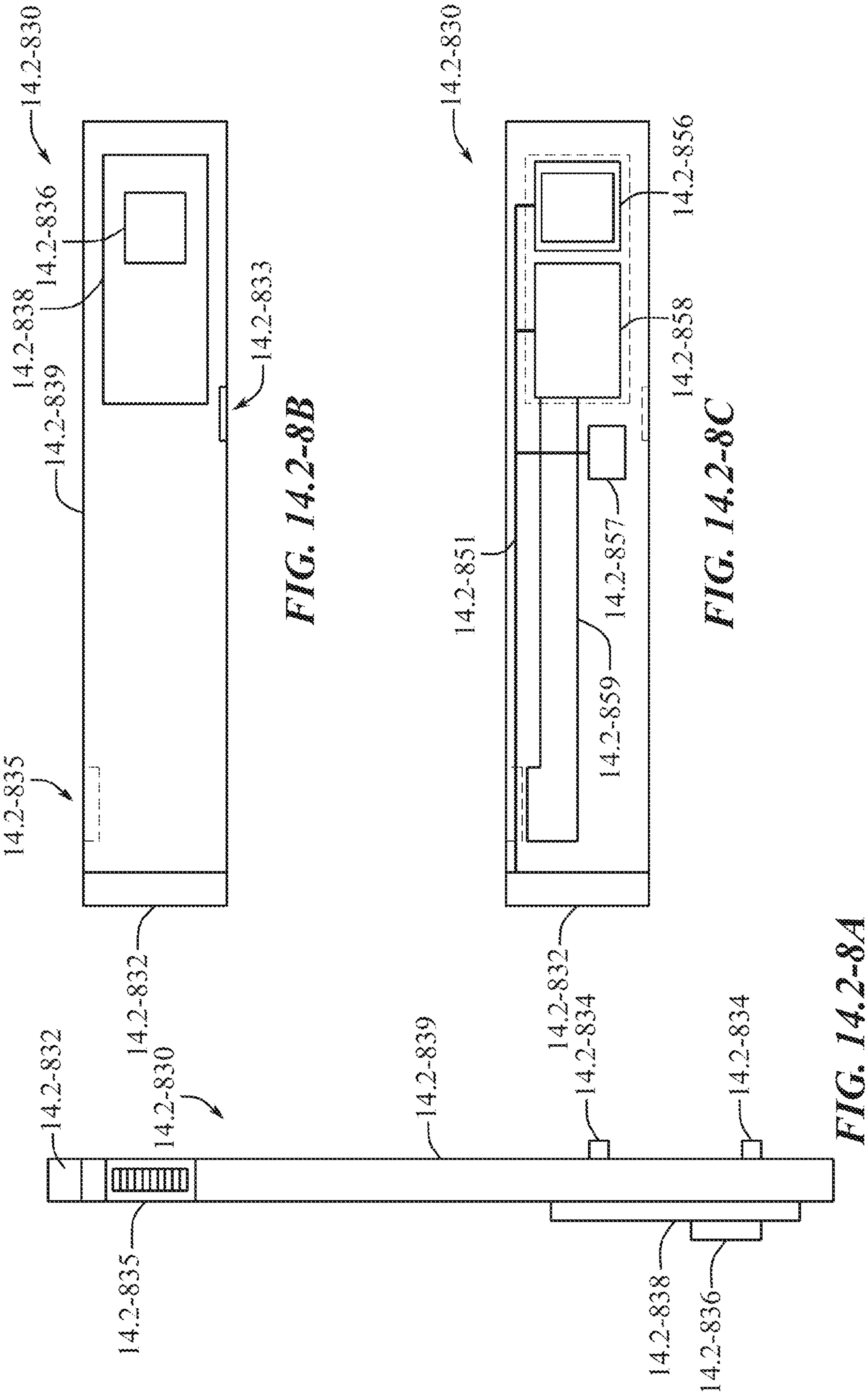
FIG. 14.2-8B
FIG. 14.2-8C
FIG. 14.2-8A

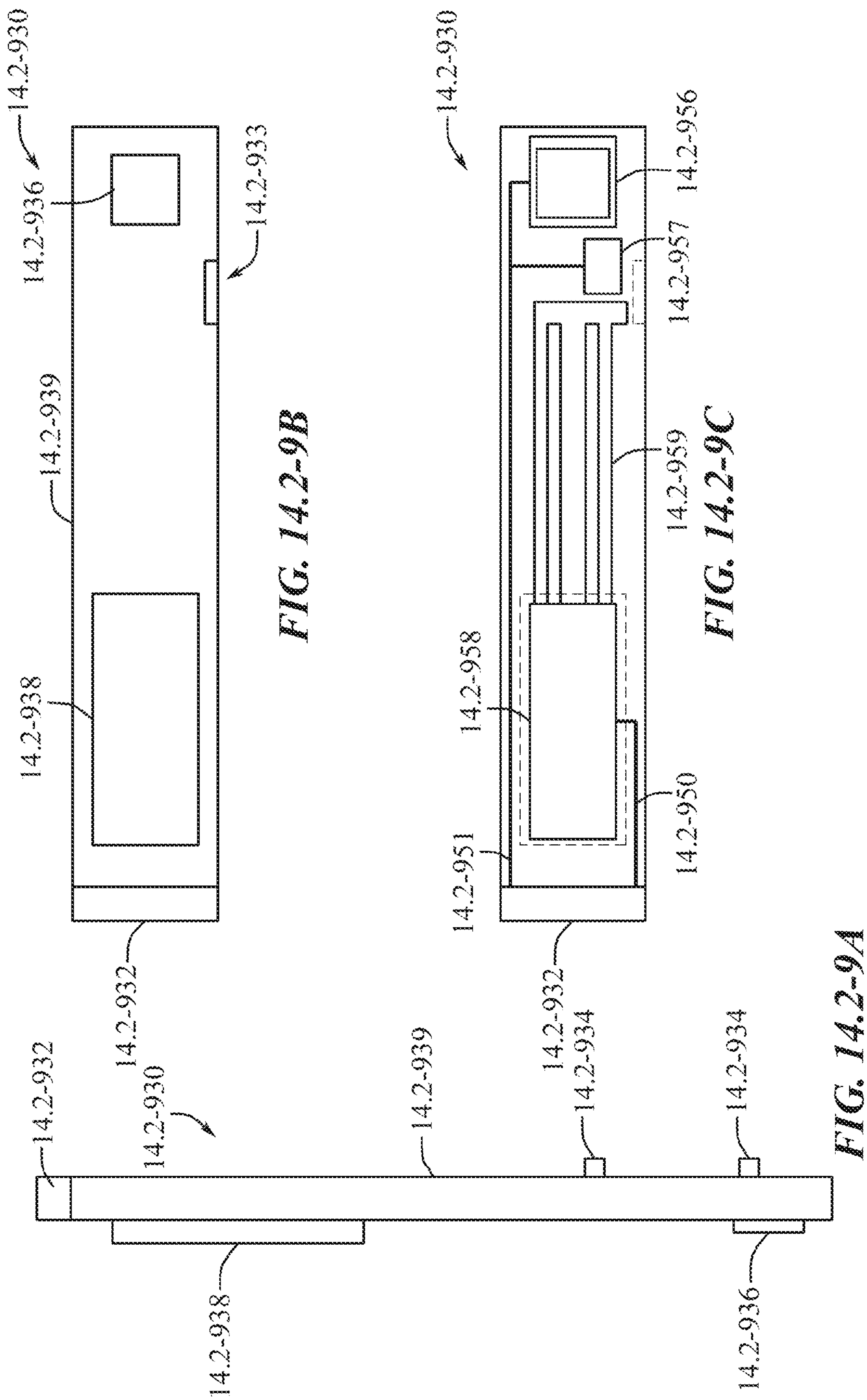
FIG. 14.2-9B
FIG. 14.2-9C
FIG. 14.2-9A

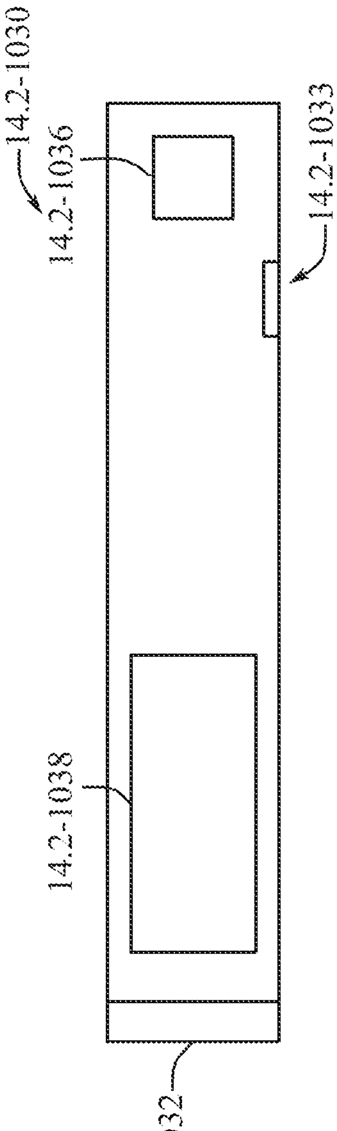
FIG. 14.2-10B
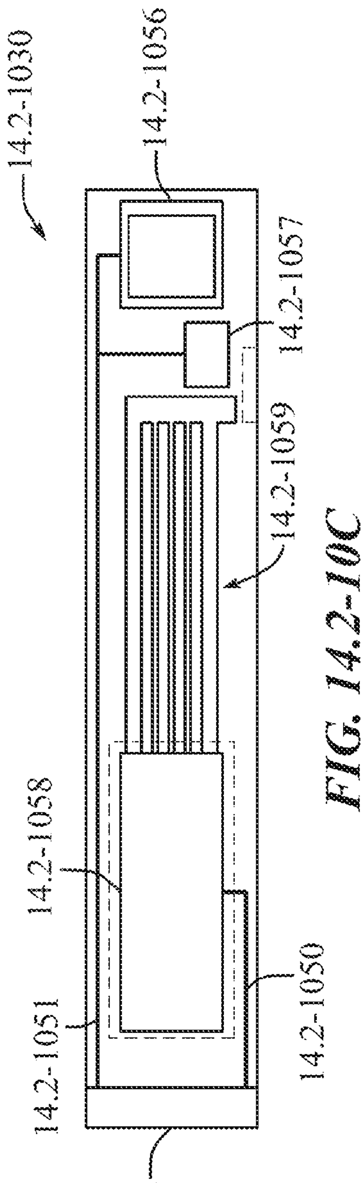
FIG. 14.2-10C
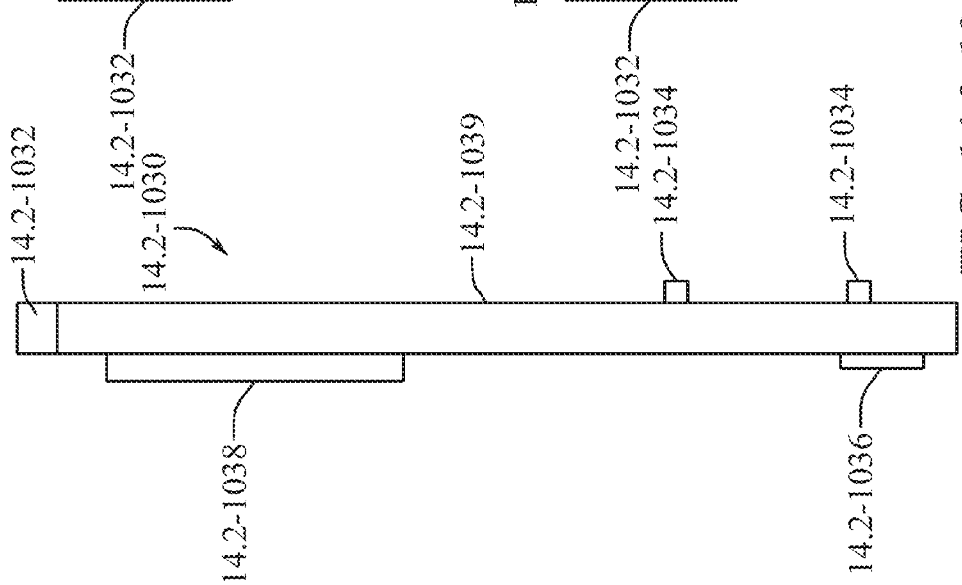
FIG. 14.2-10A

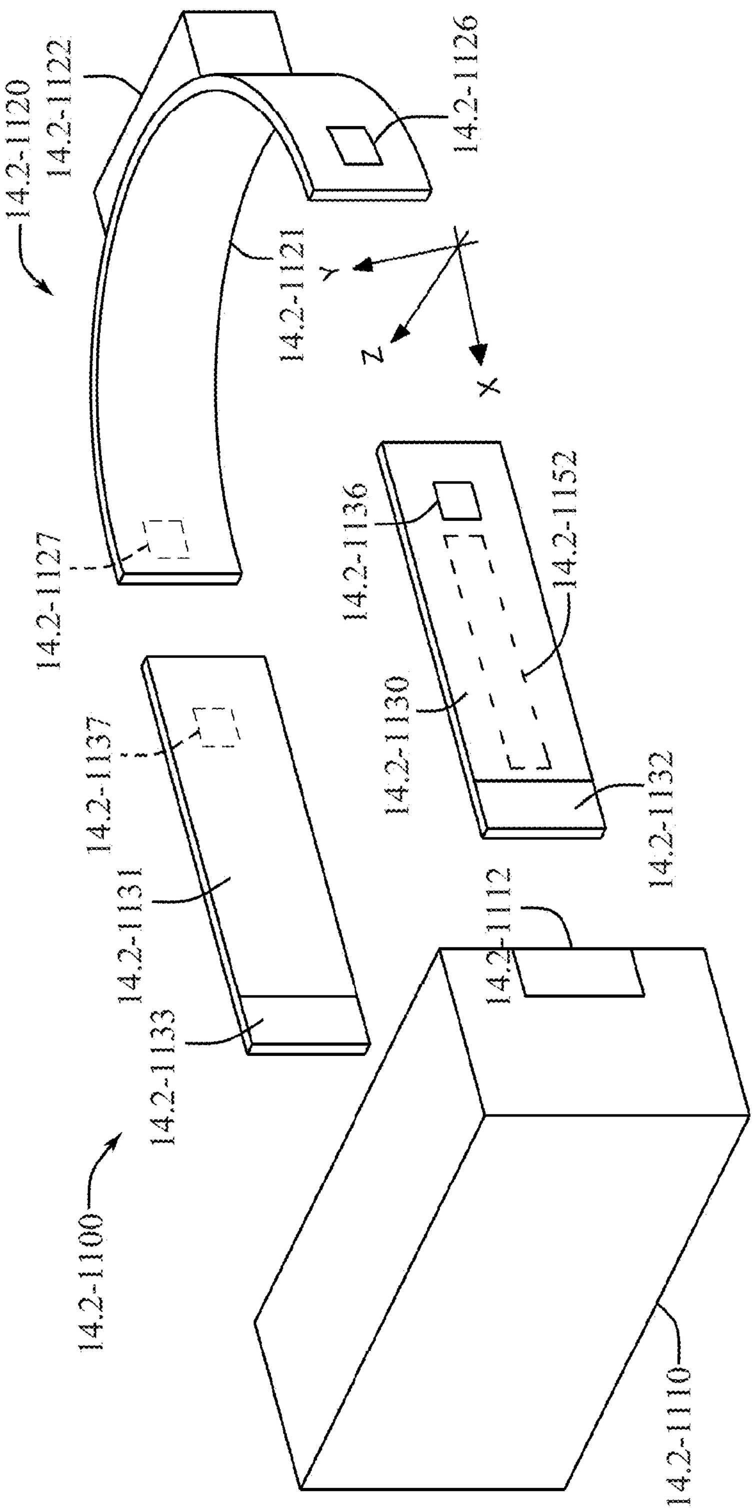
*FIG. 14.2-11*

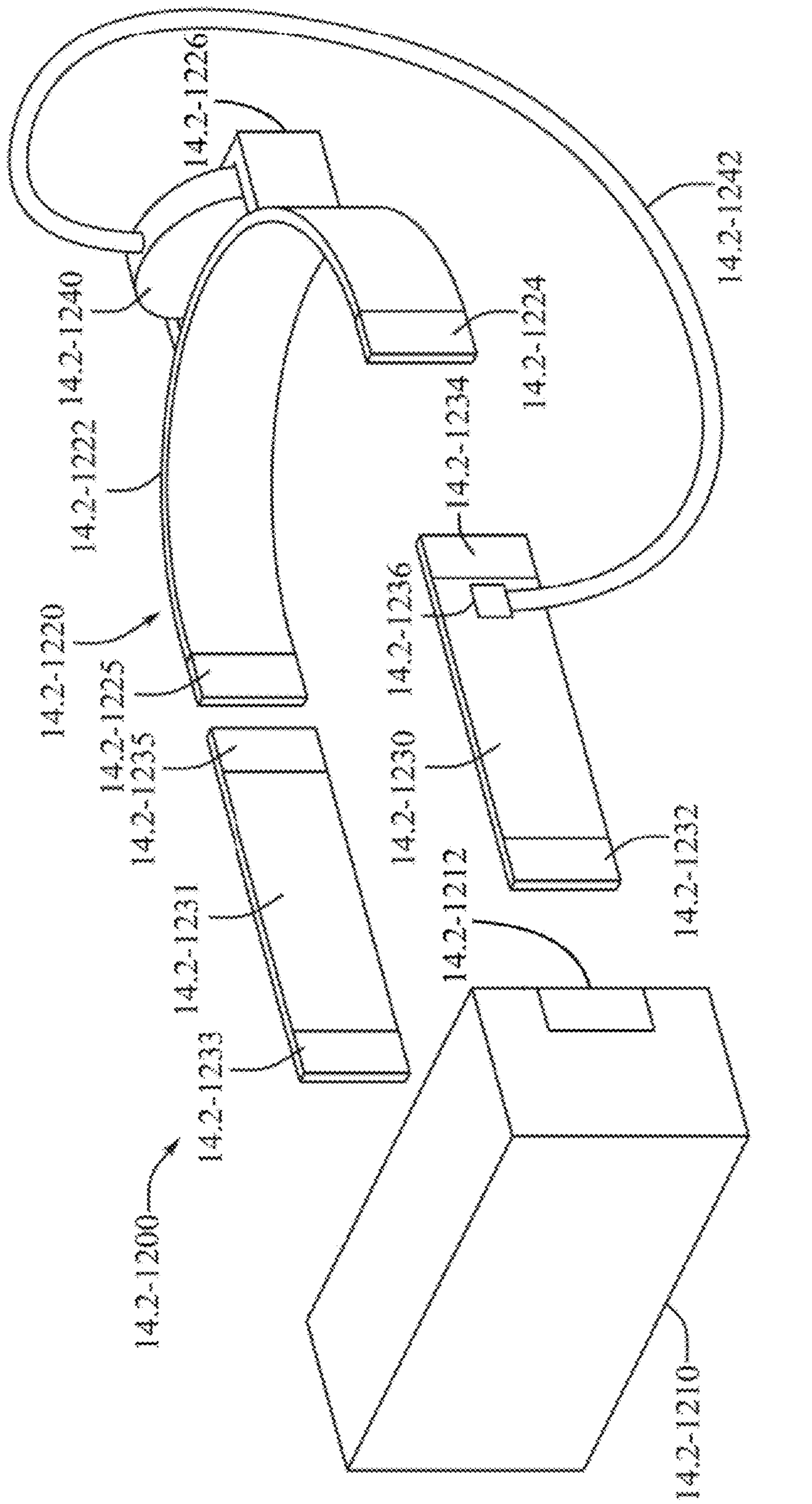
*FIG. 14.2-12*

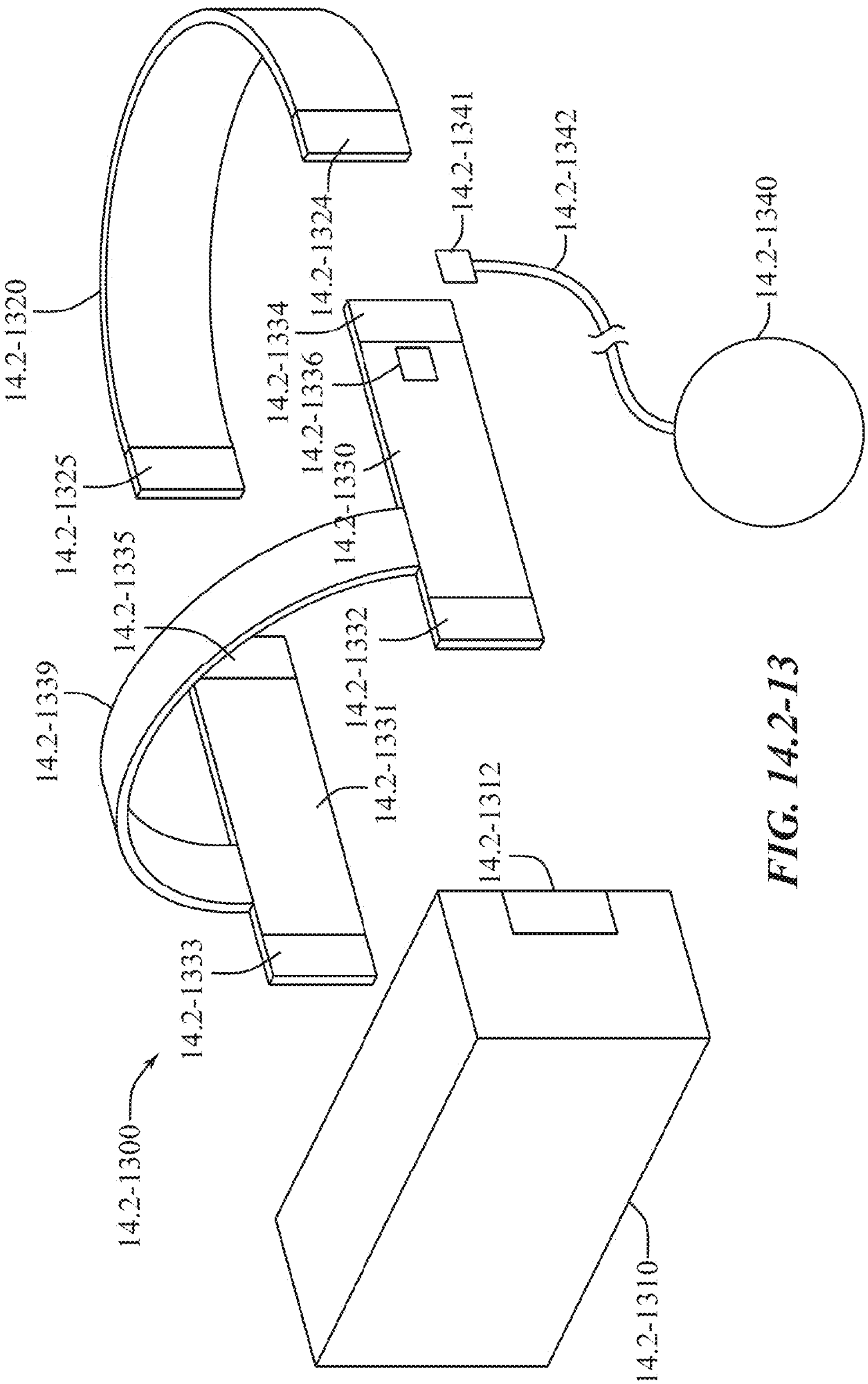
FIG. 14.2-13

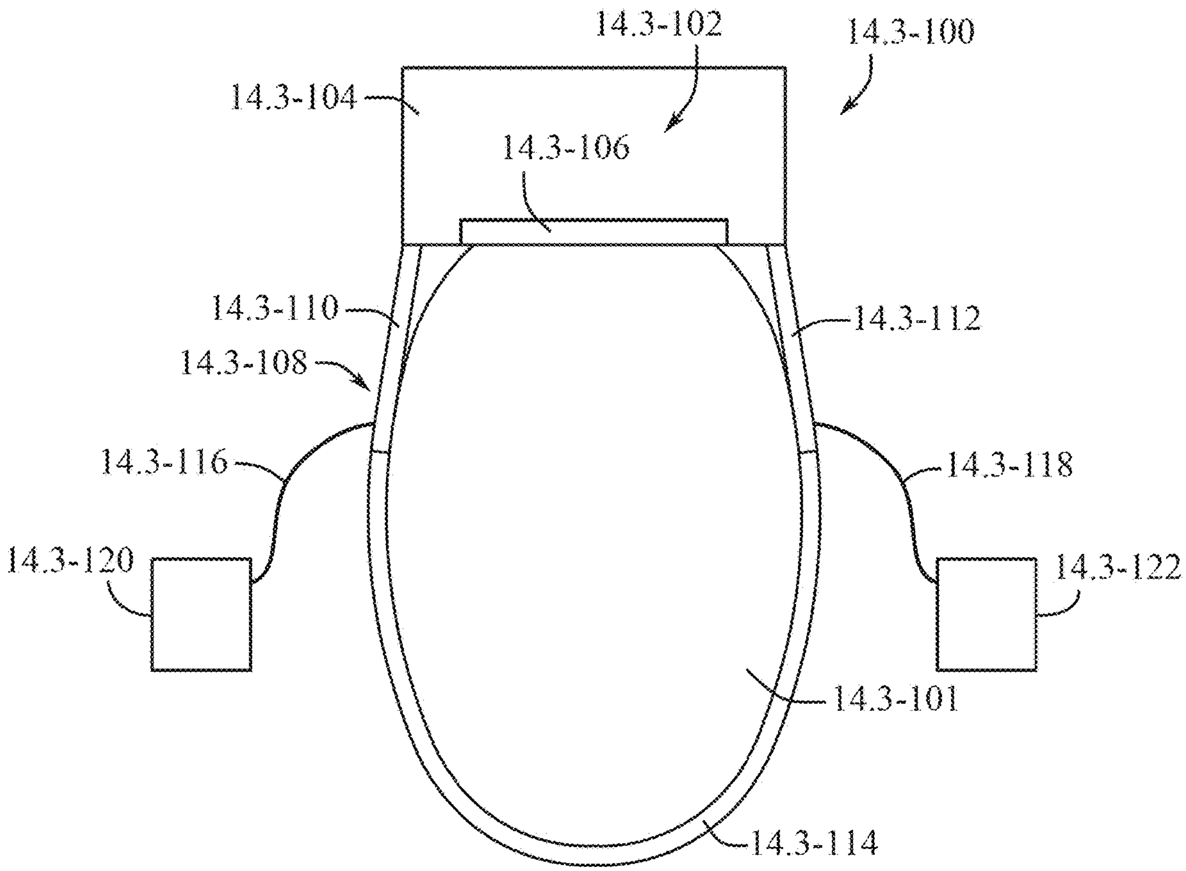
*FIG. 14.3-1*

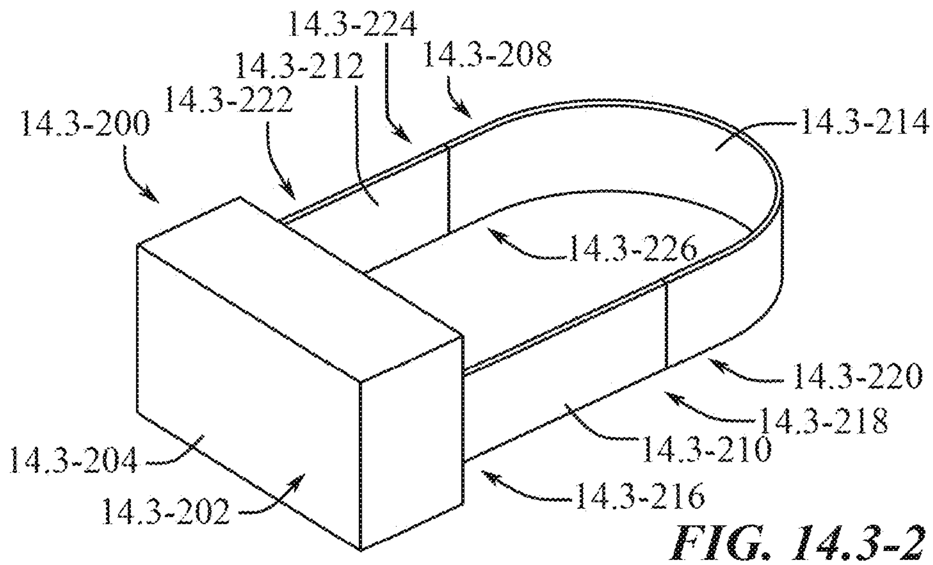
FIG. 14.3-2
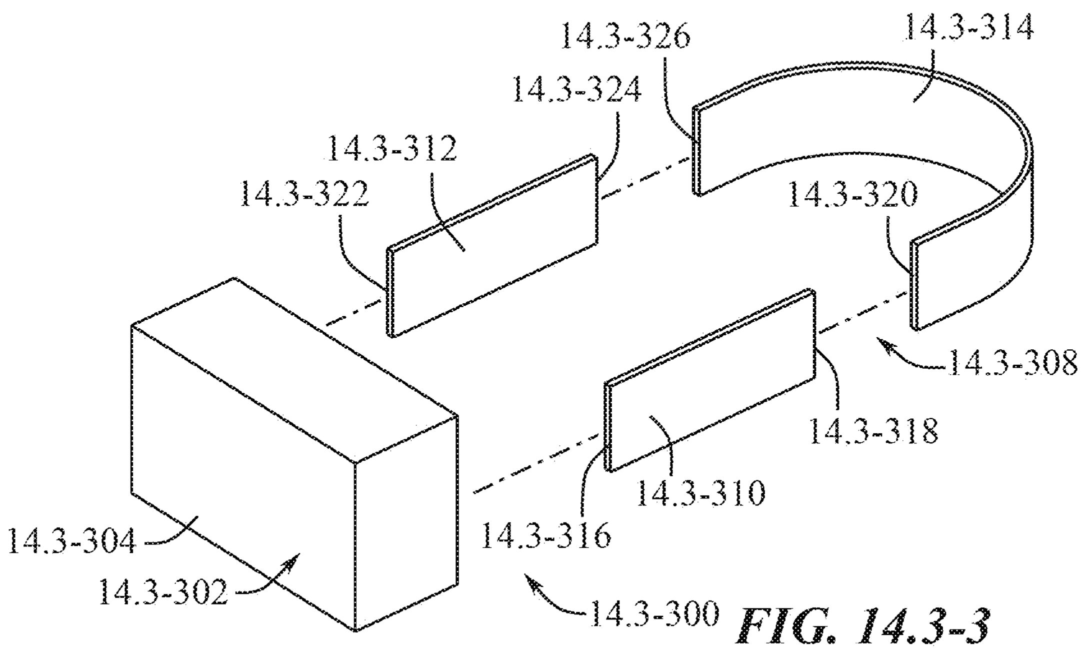
FIG. 14.3-3

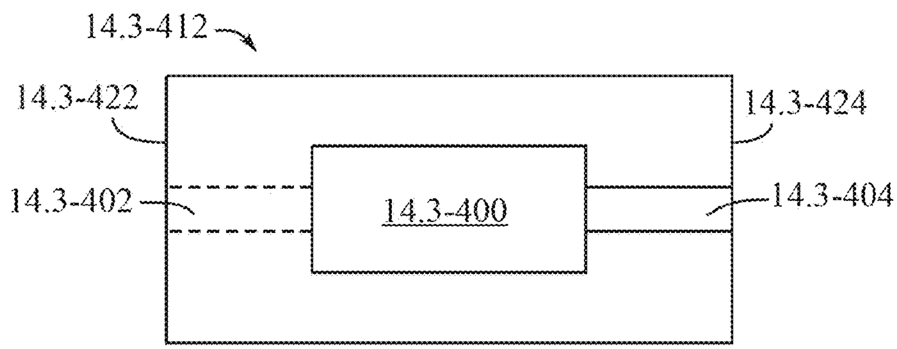
*FIG. 14.3-4*
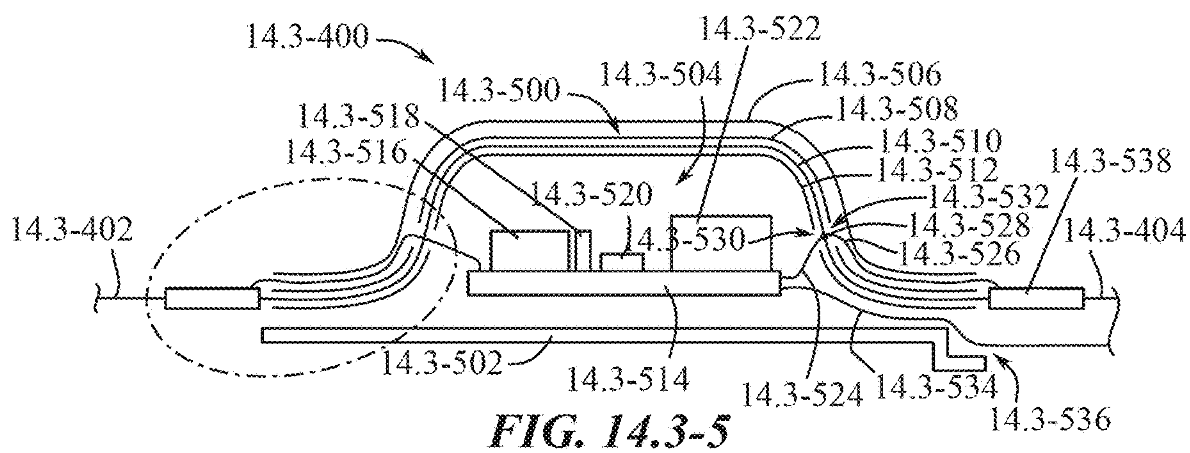
*FIG. 14.3-5*

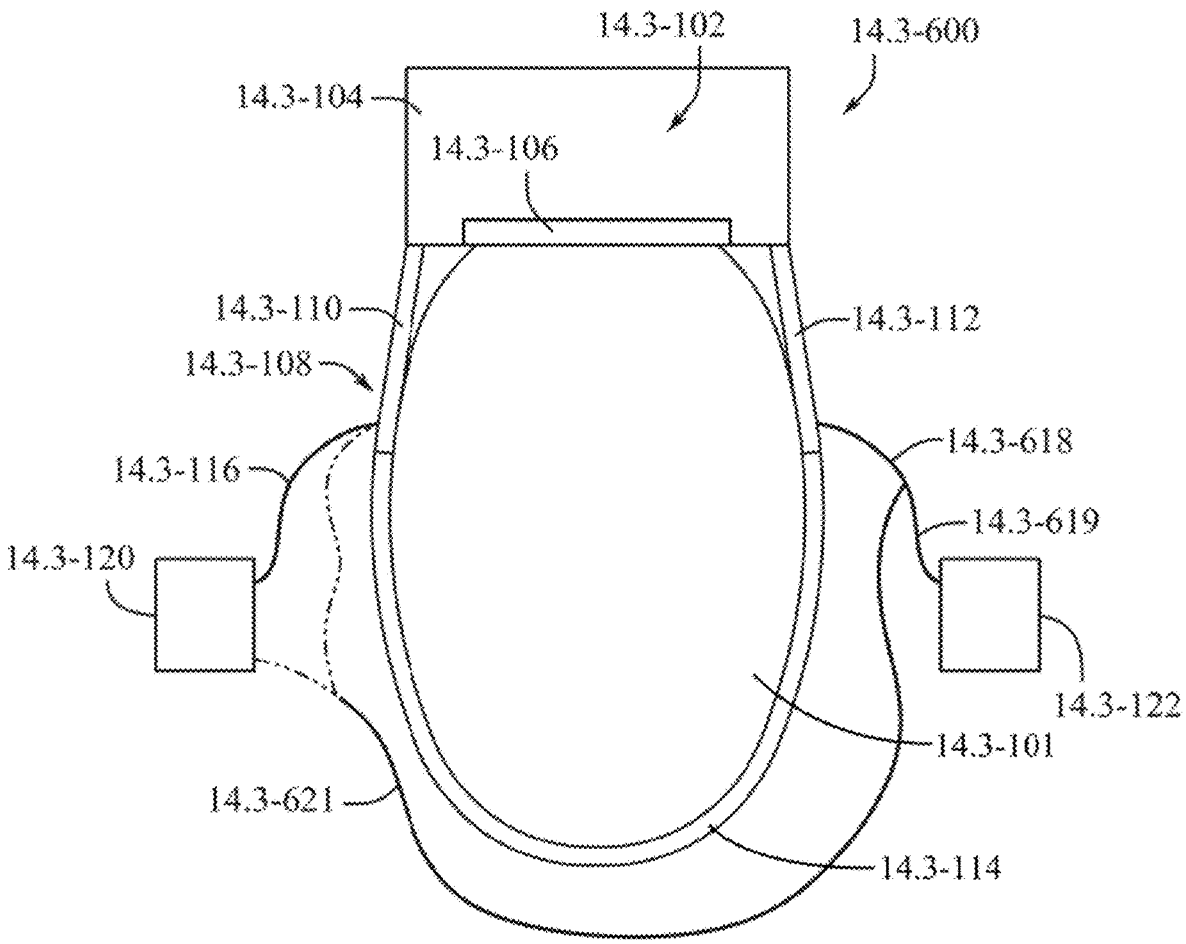
*FIG. 14.3-6*

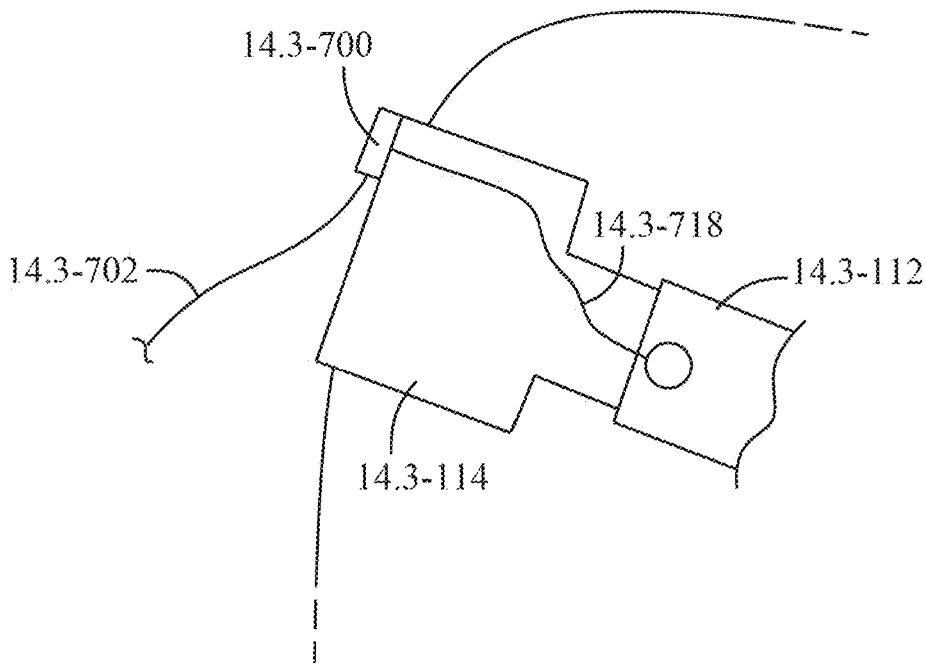
*FIG. 14.3-7*
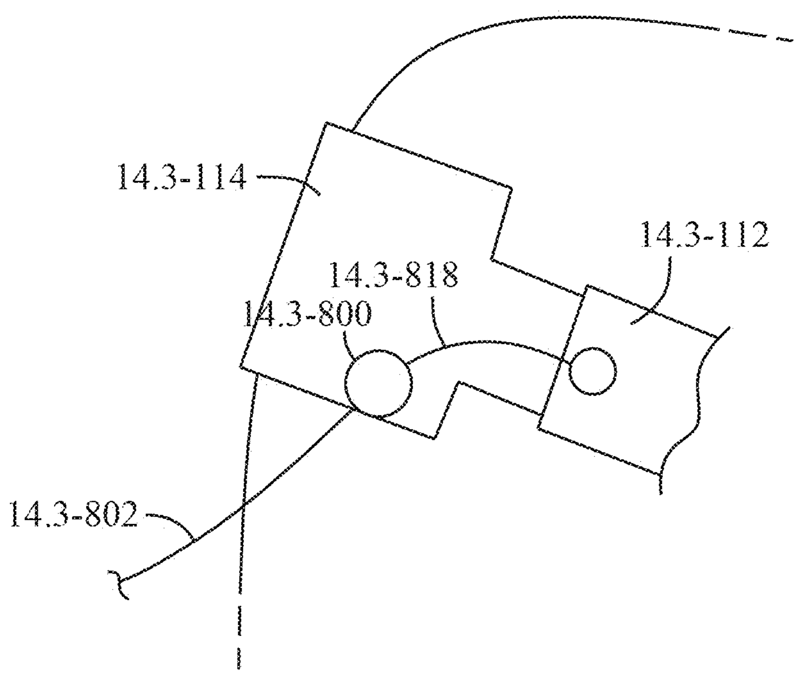
*FIG. 14.3-8*

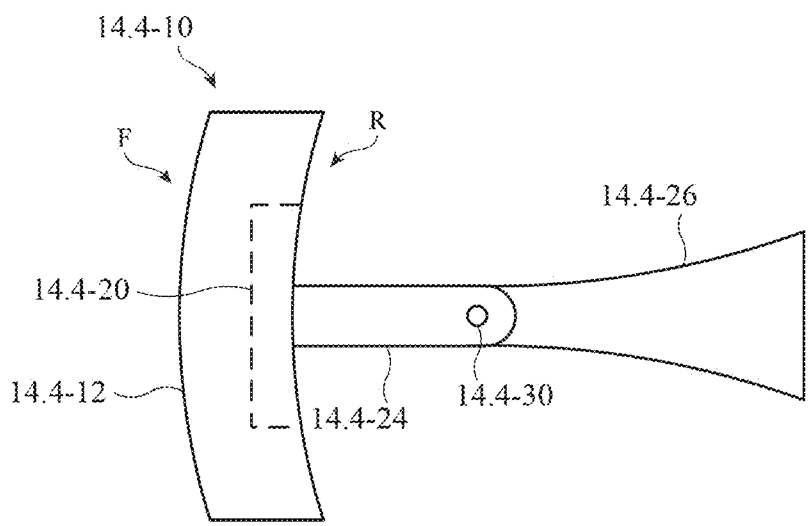
*FIG. 14.4-1*

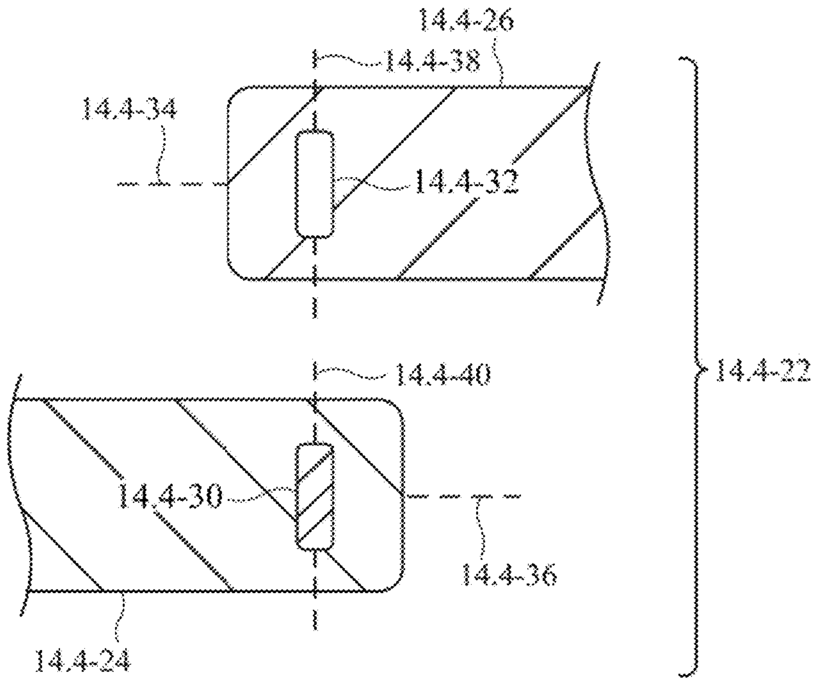
*FIG. 14.4-2*

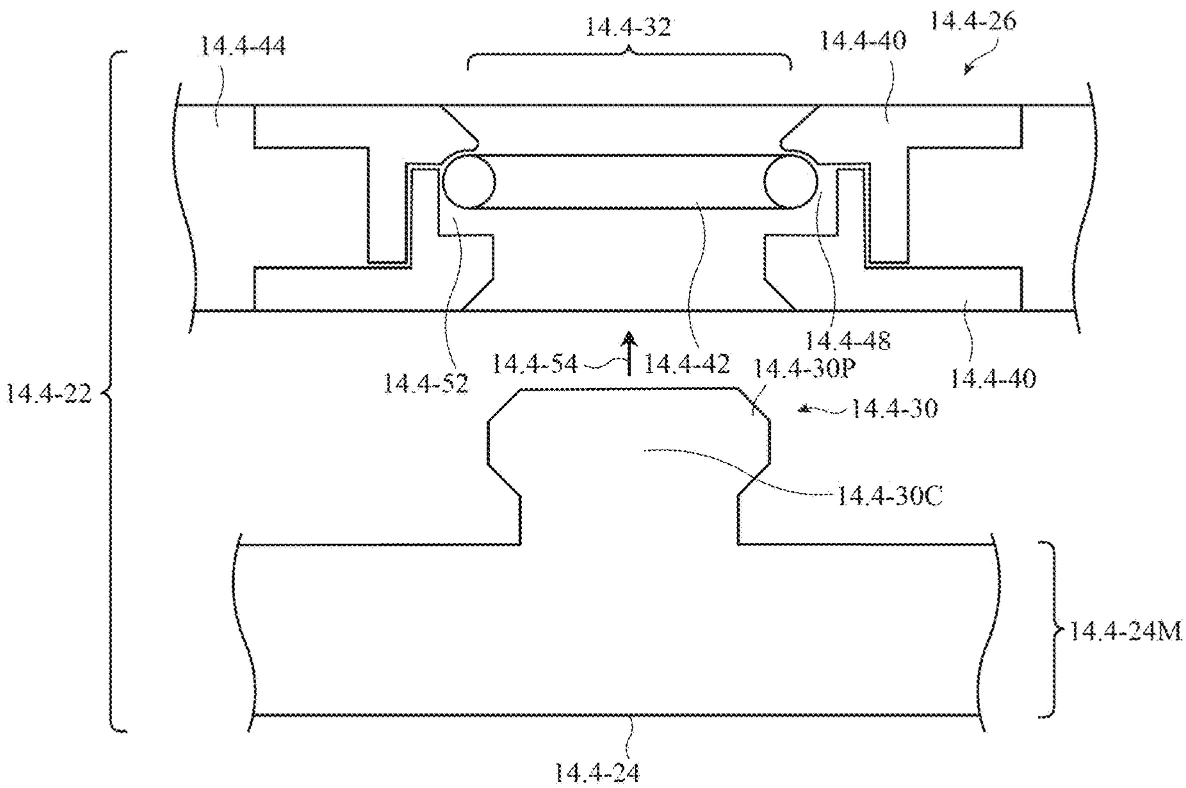
*FIG. 14.4-3*
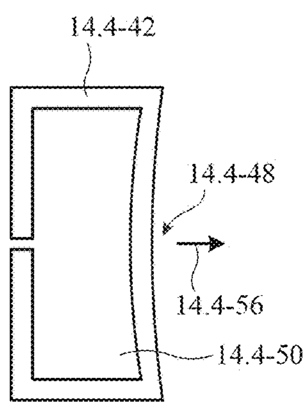
*FIG. 14.4-4*

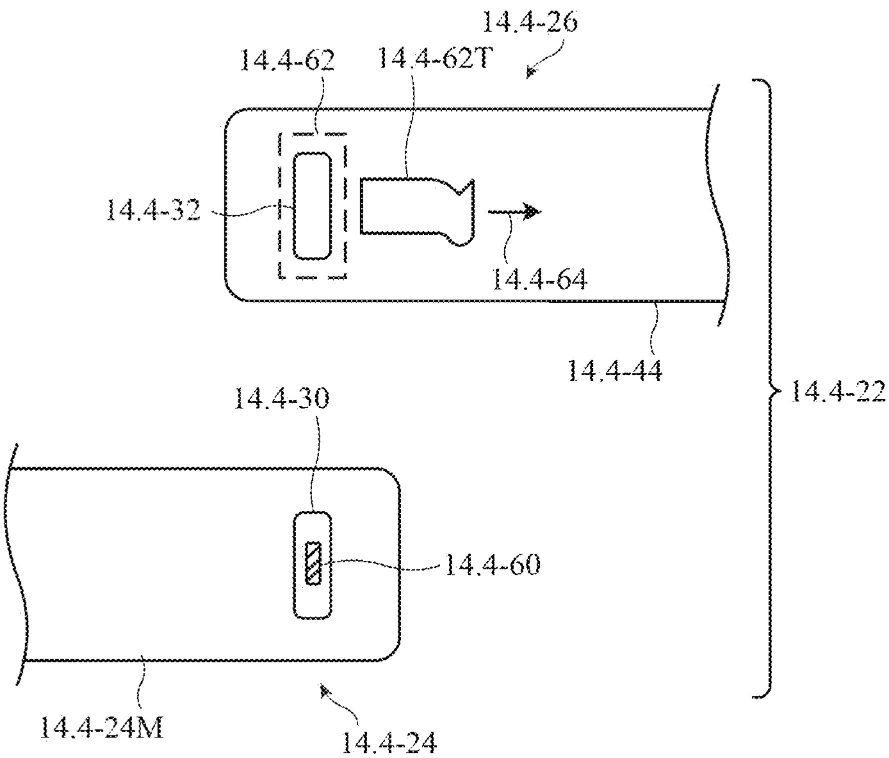
*FIG. 14.4-5*

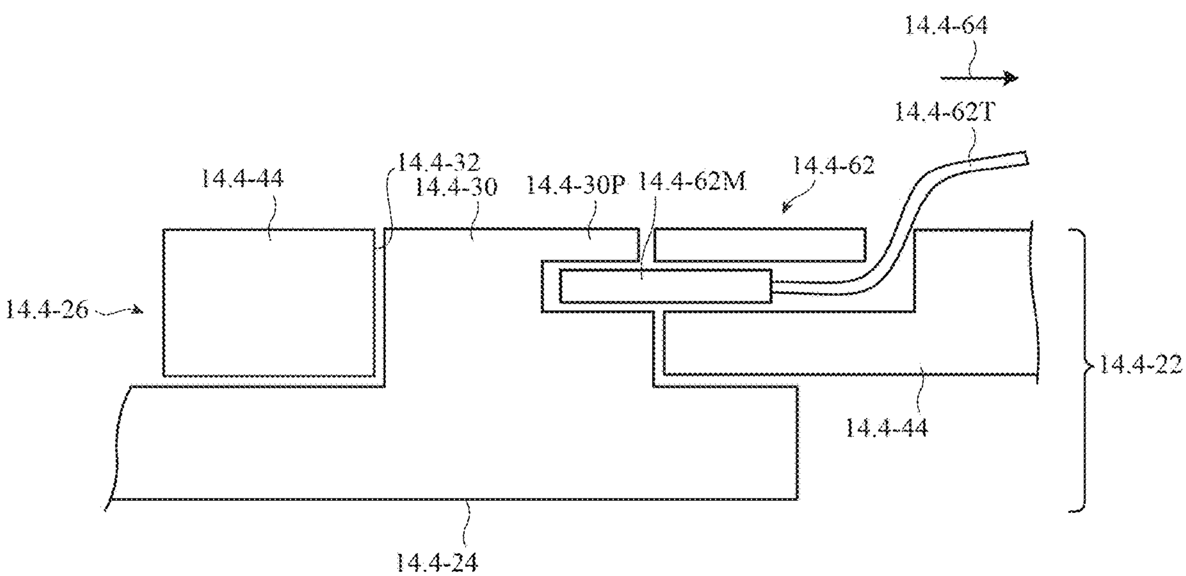
*FIG. 14.4-6*

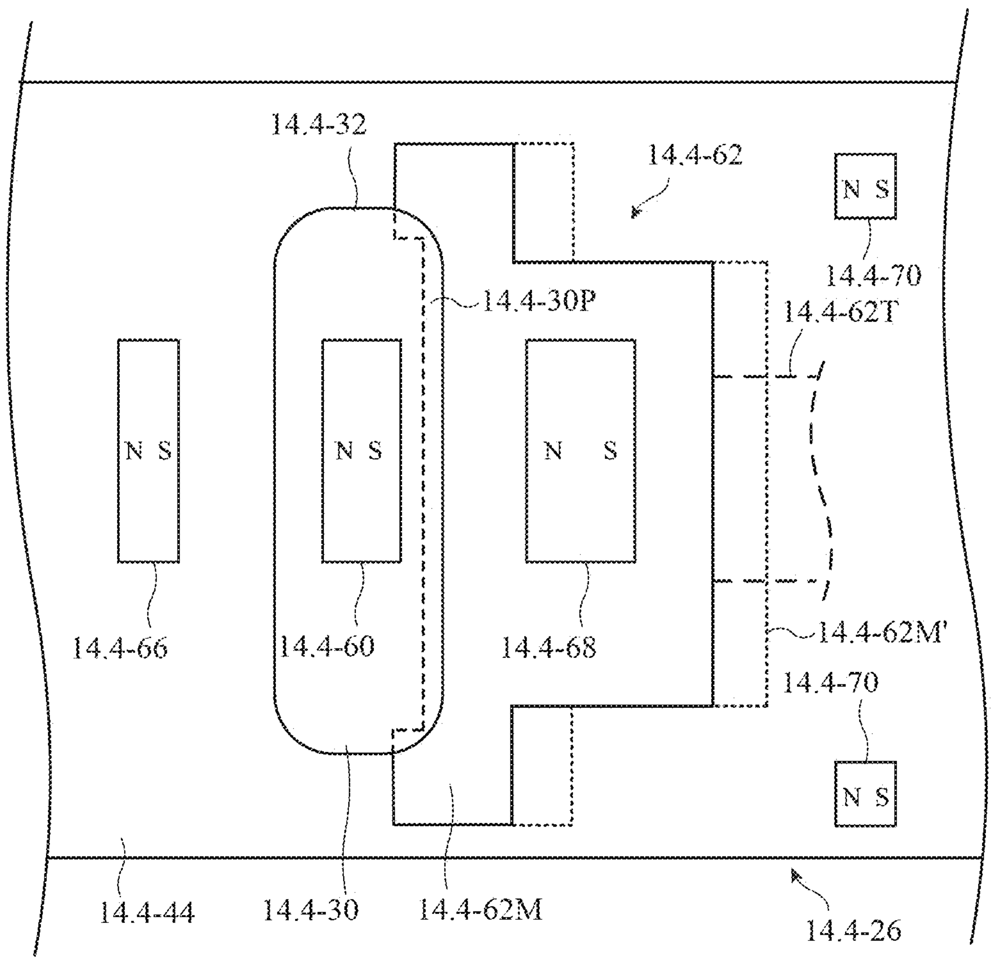
*FIG. 14.4-7*

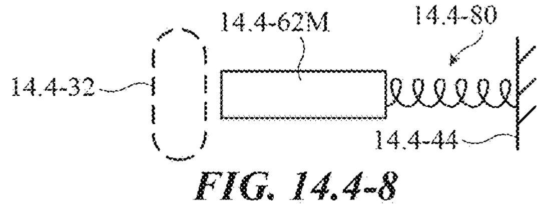
FIG. 14.4-8
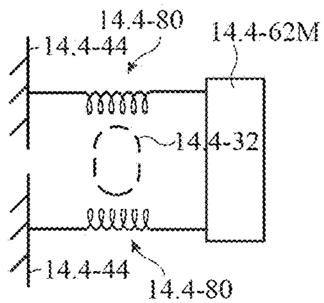
FIG. 14.4-9
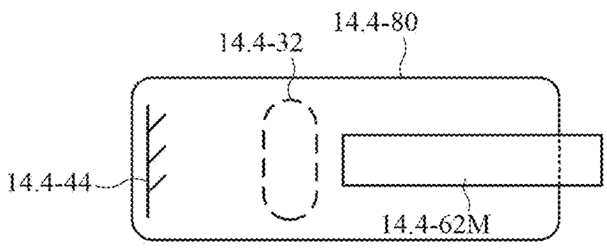
FIG. 14.4-10
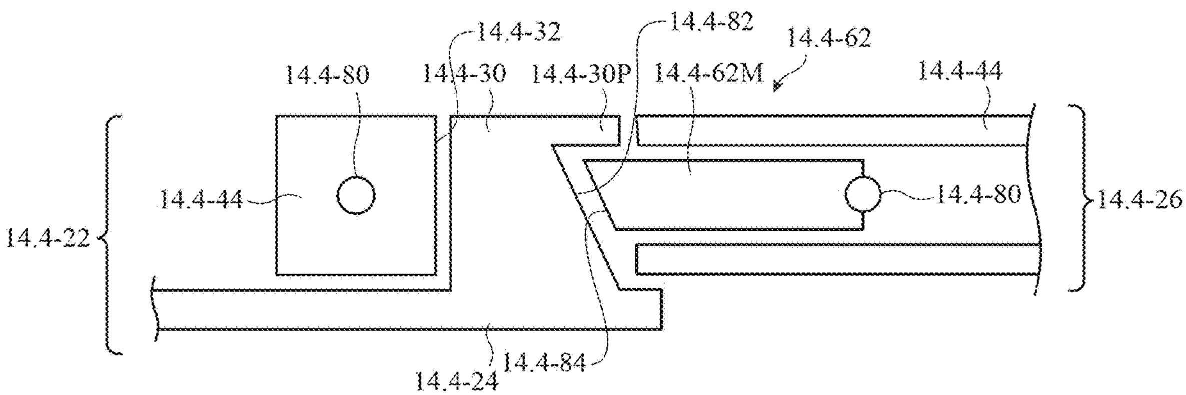
FIG. 14.4-11

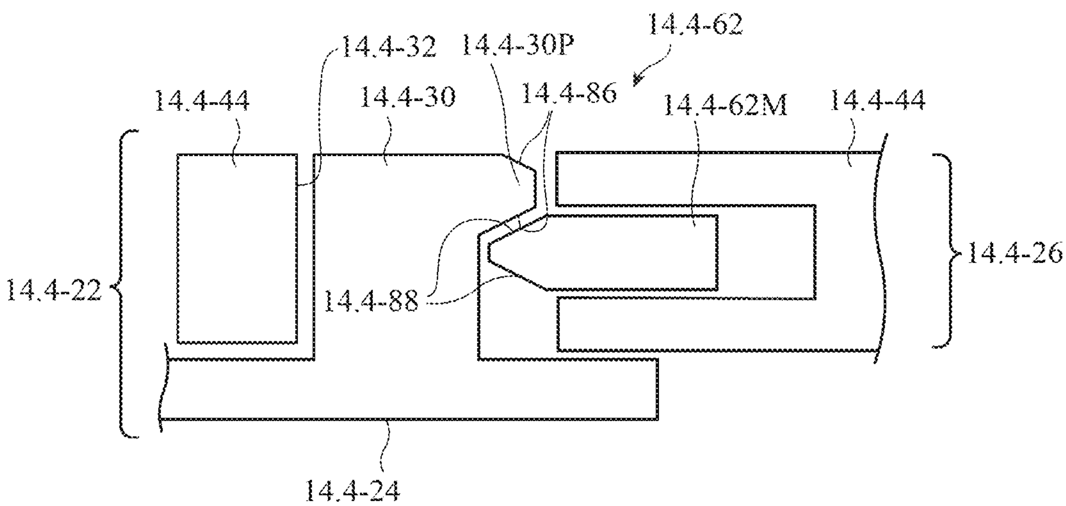
*FIG. 14.4-12*

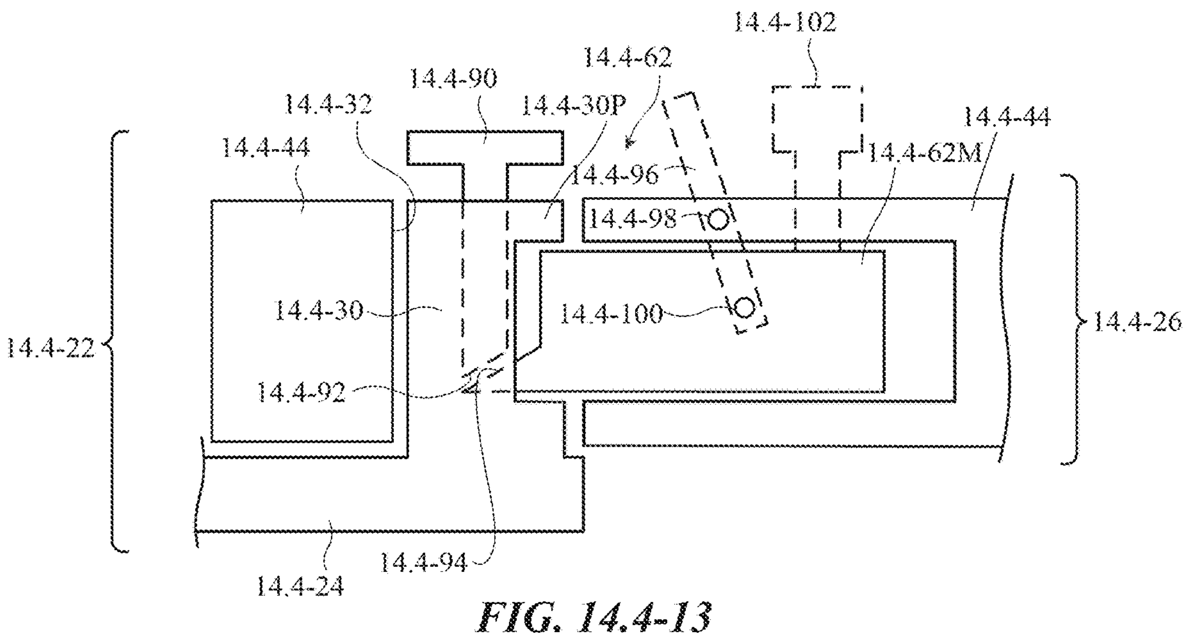
FIG. 14.4-13

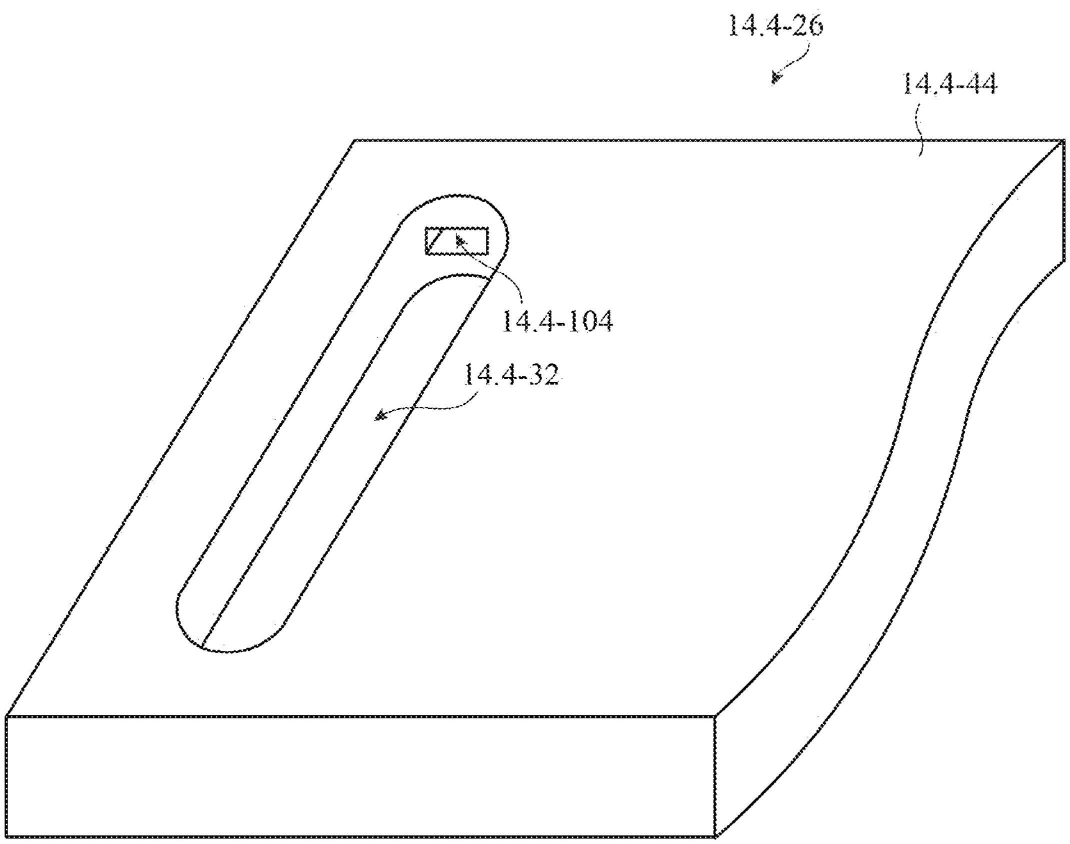
*FIG. 14.4-14*

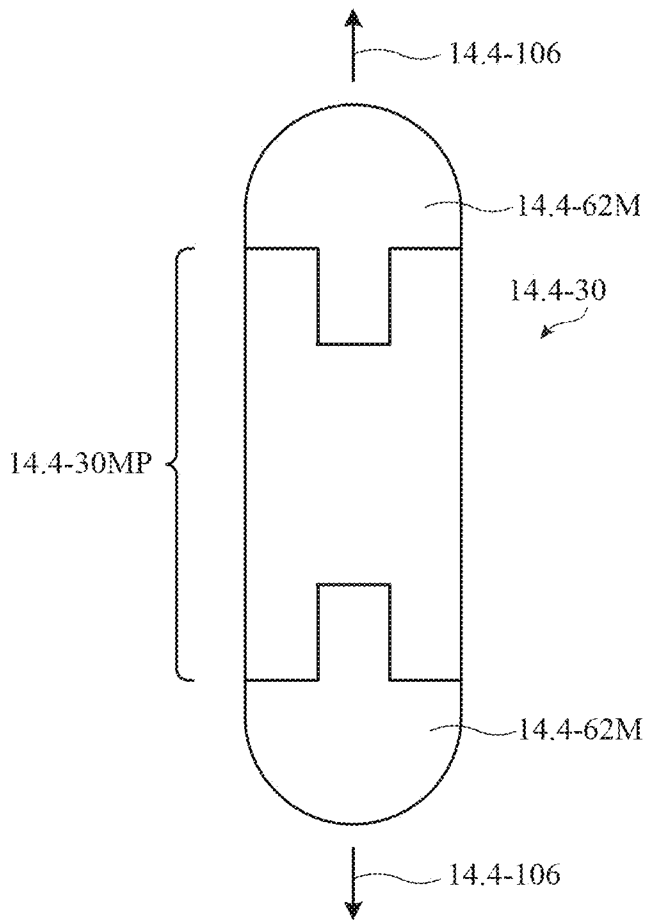
*FIG. 14.4-15*

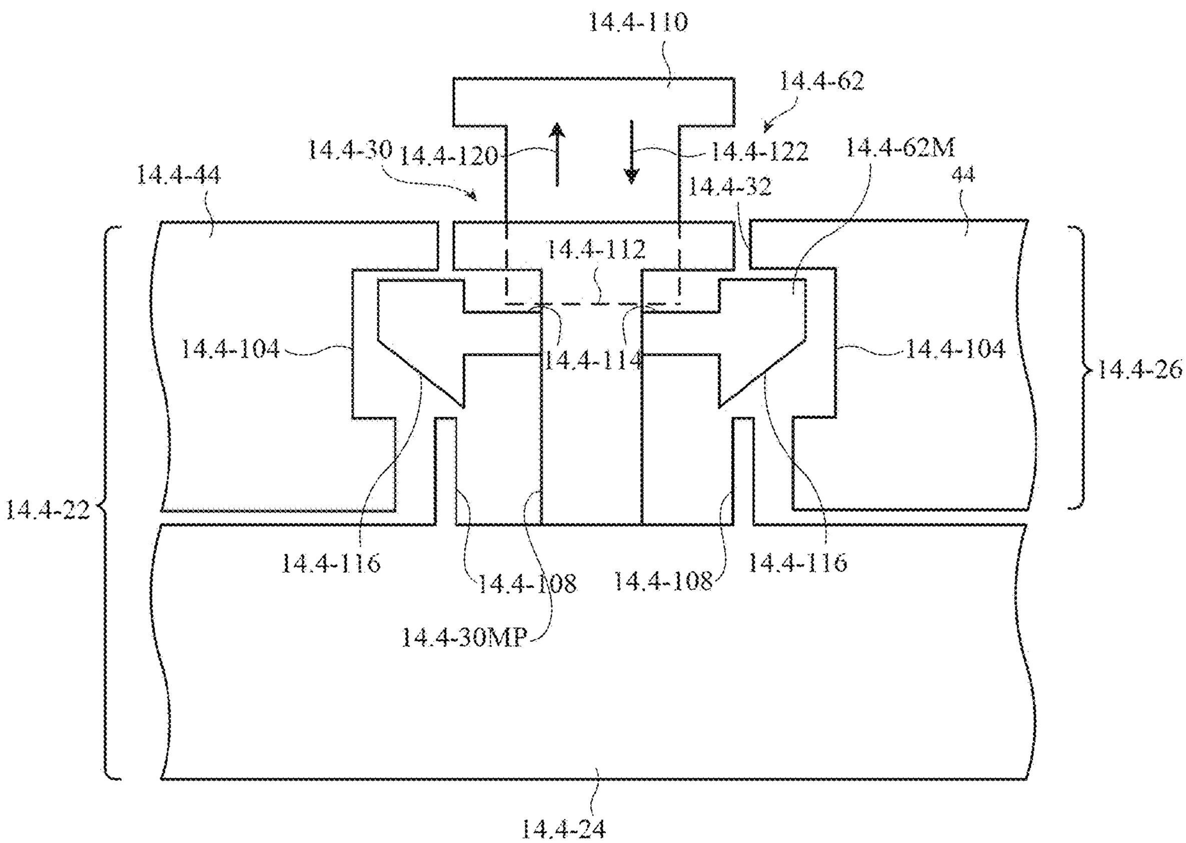
*FIG. 14.4-16*

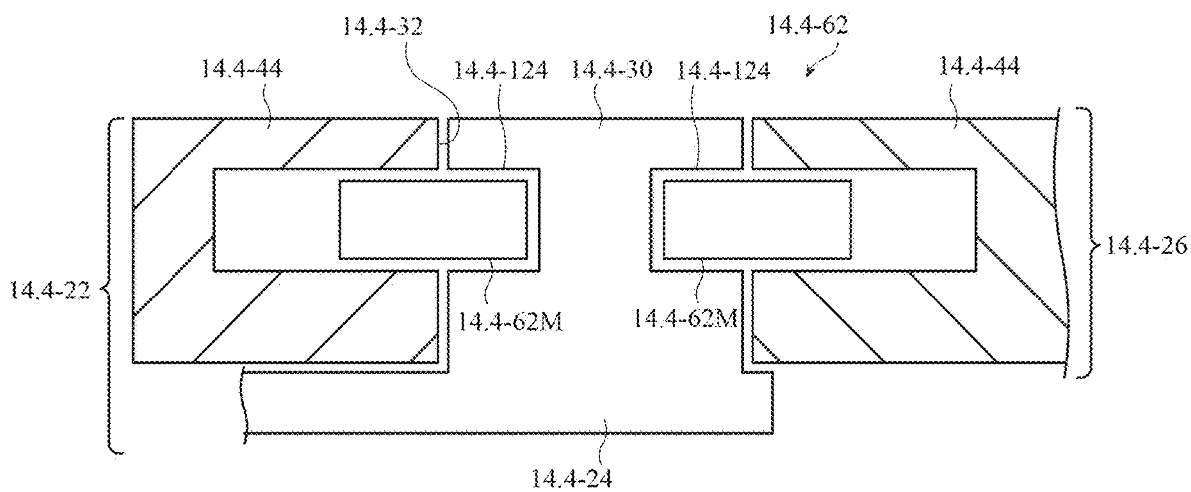
*FIG. 14.4-17*

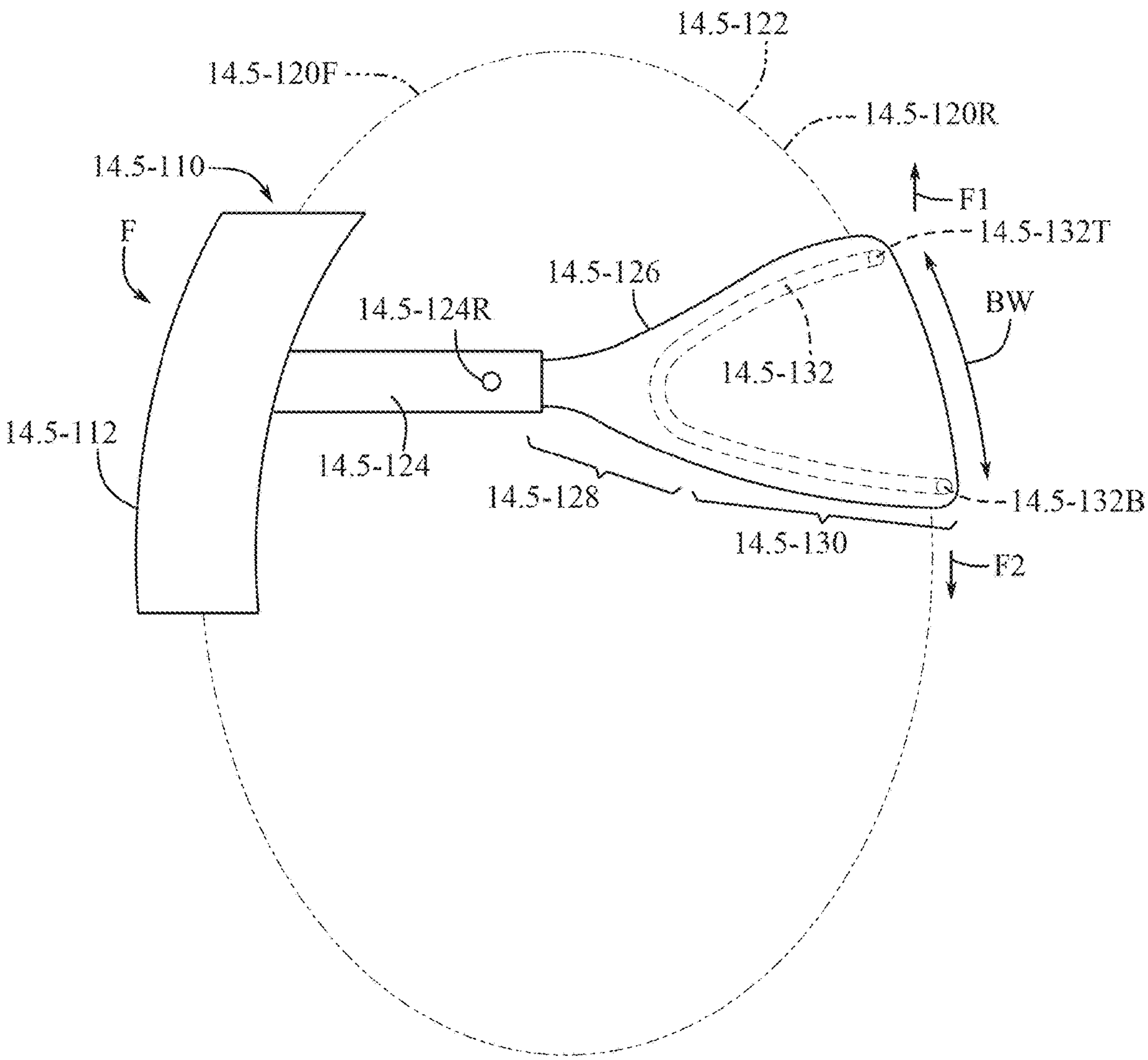
*FIG. 14.5-1*

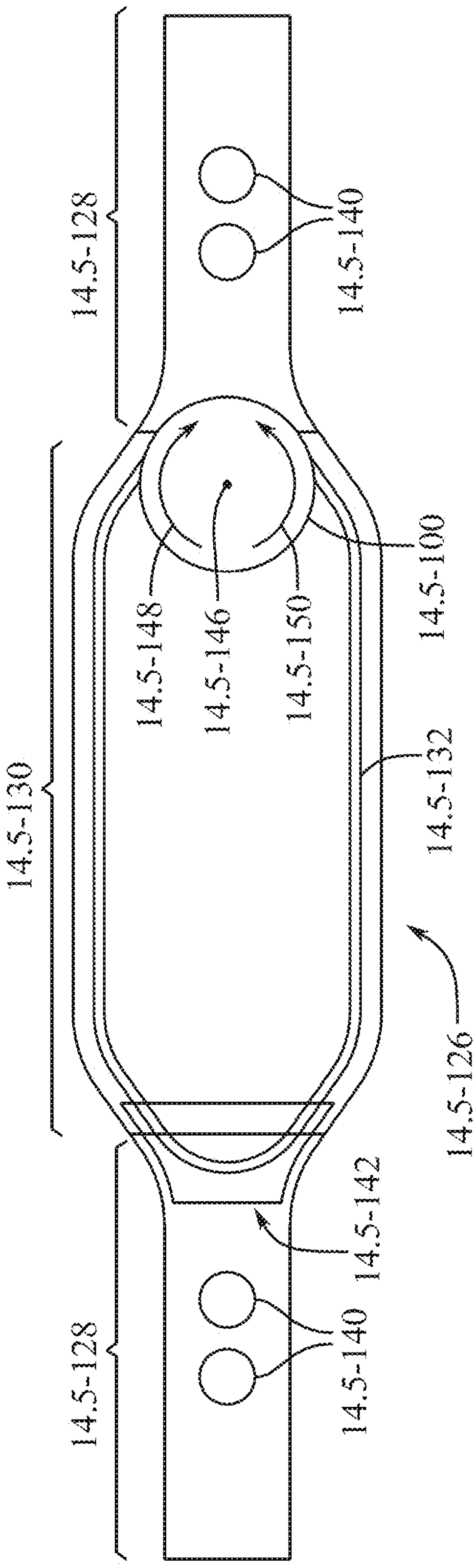
FIG. 14.5-2

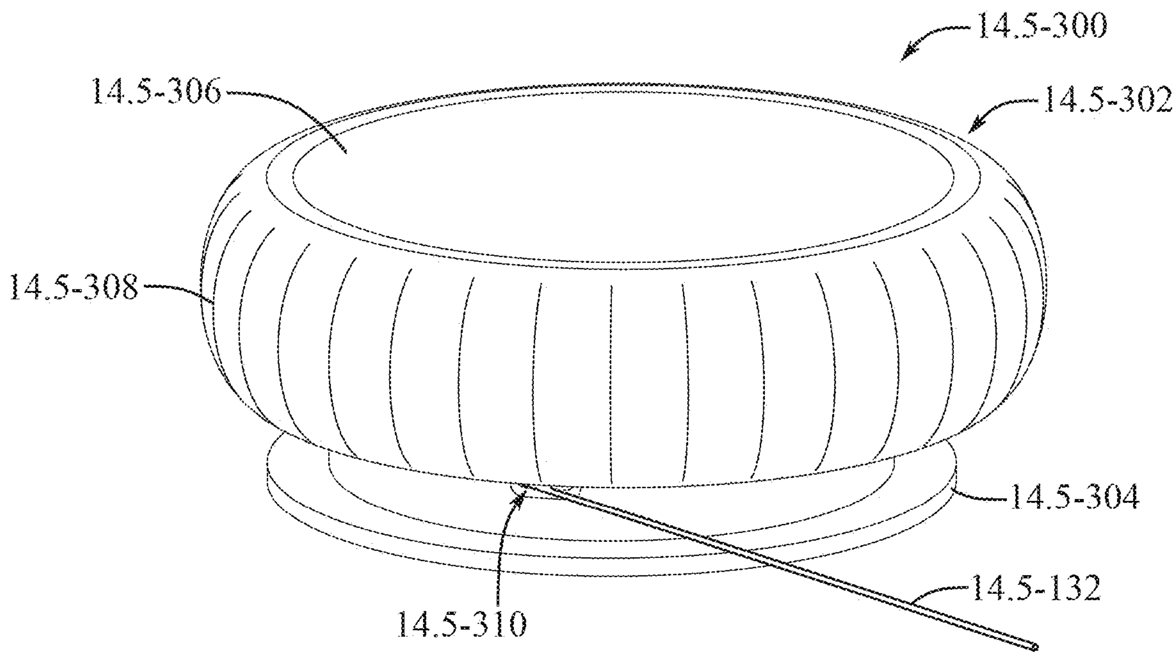
*FIG. 14.5-3*

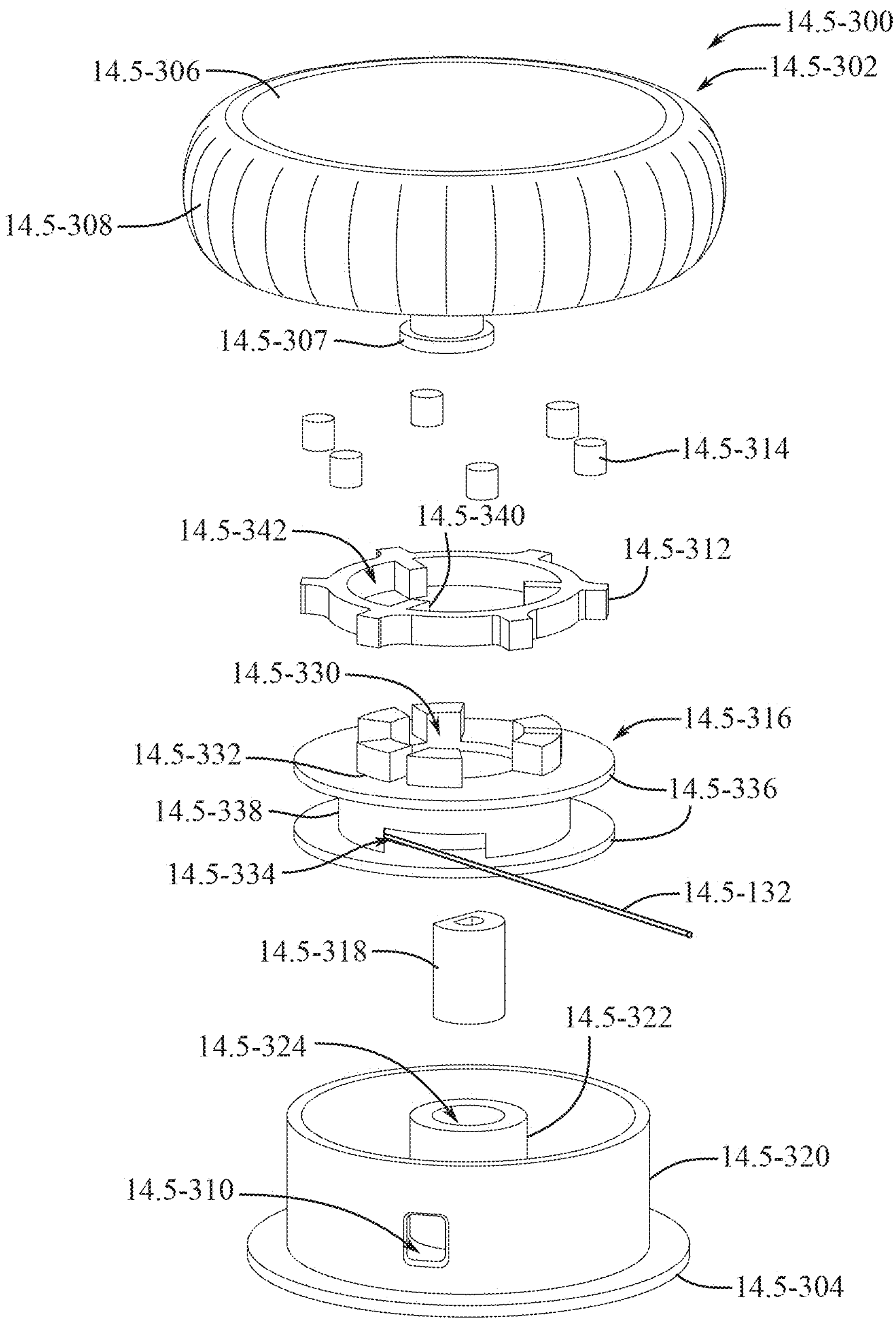
*FIG. 14.5-4*

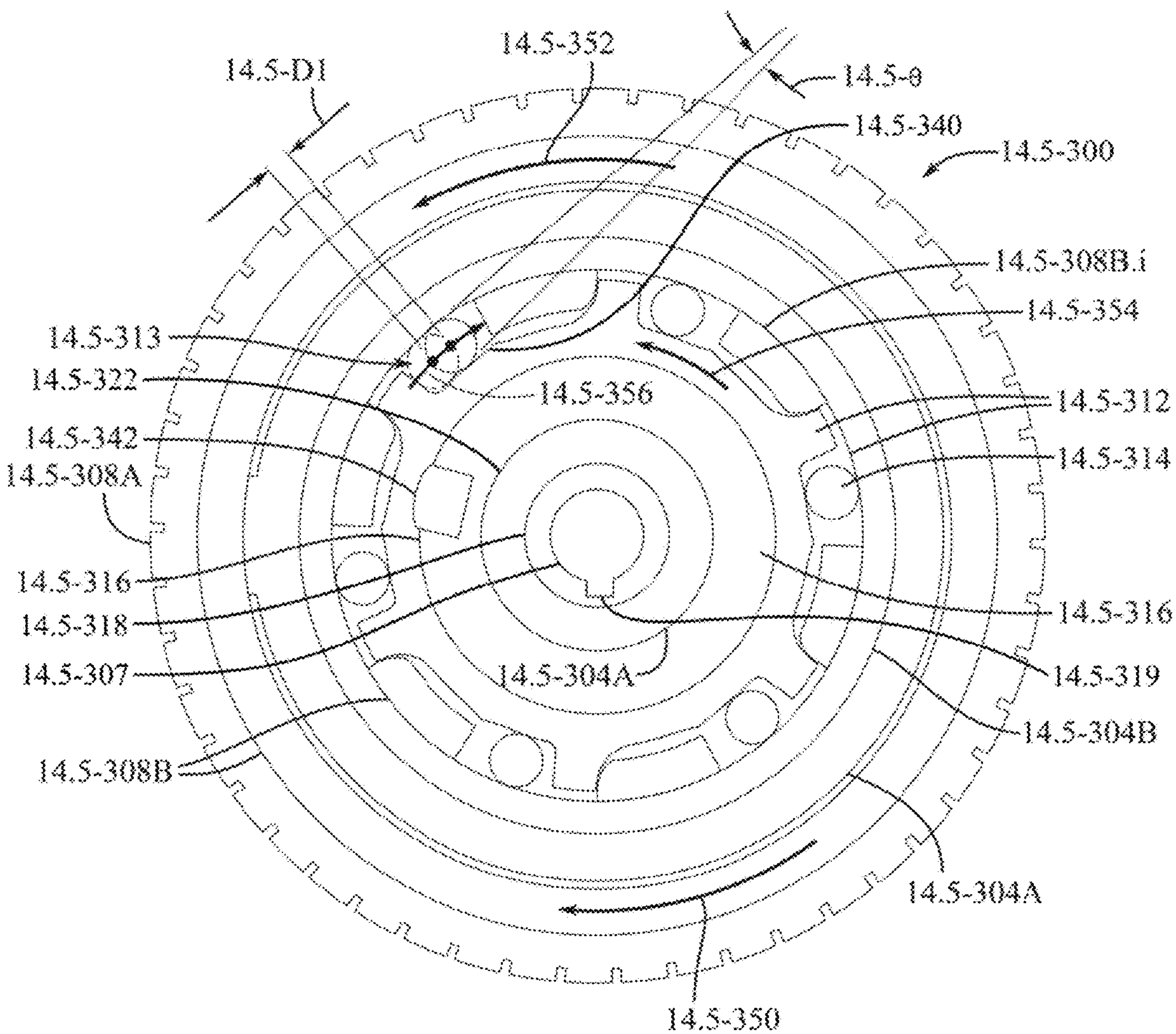
*FIG. 14.5-5*

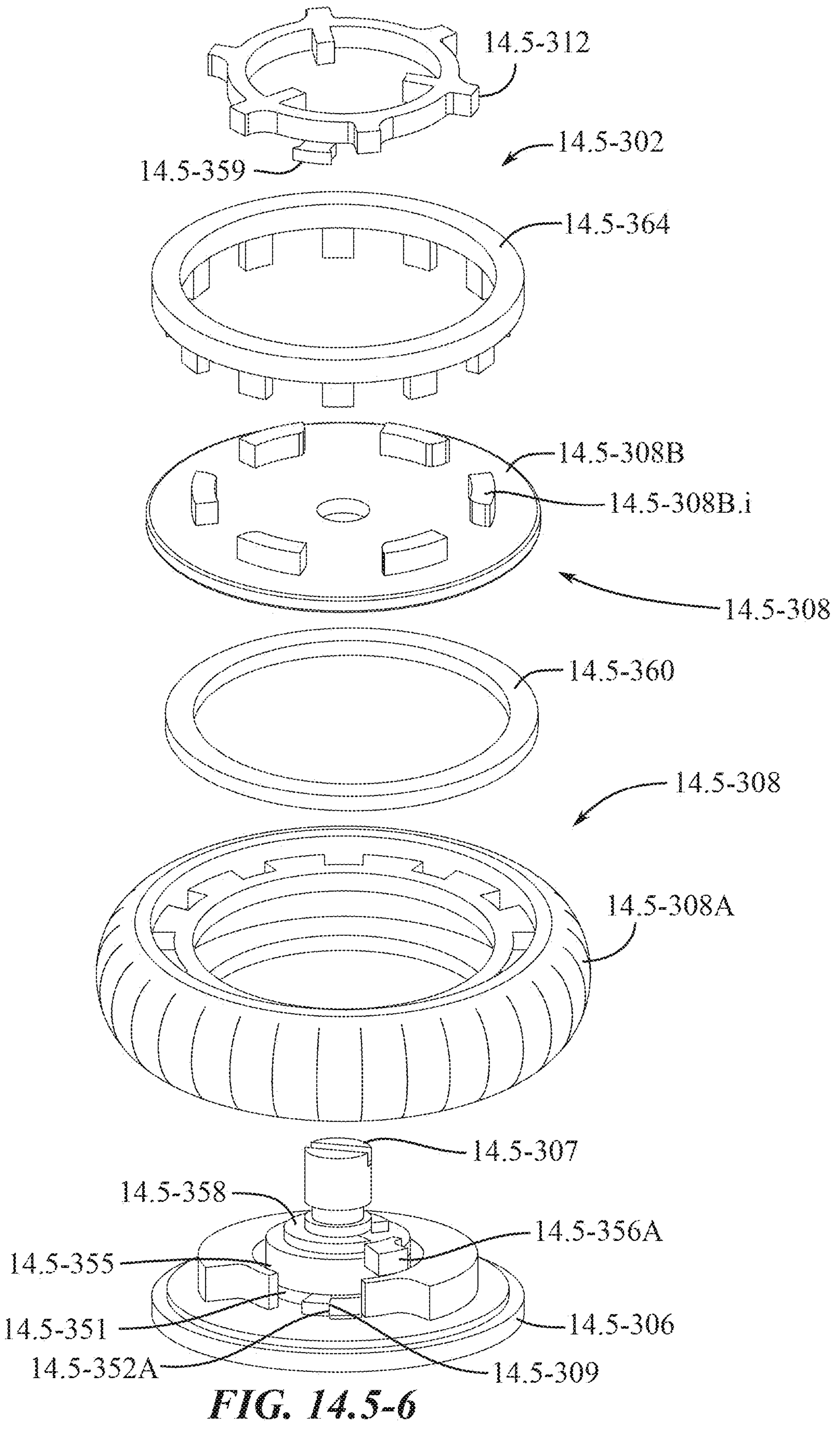
*FIG. 14.5-6*

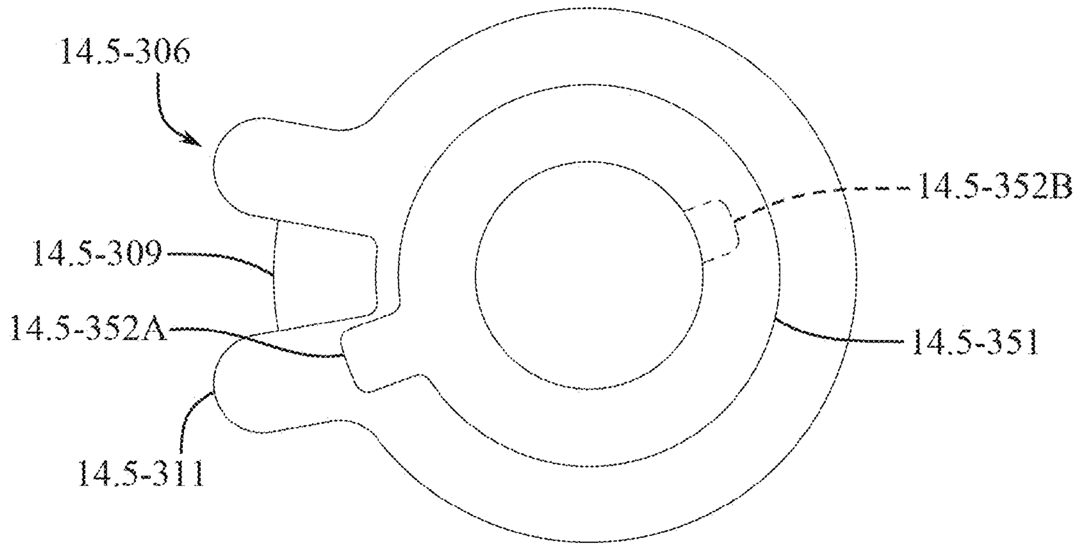
*FIG. 14.5-7A*
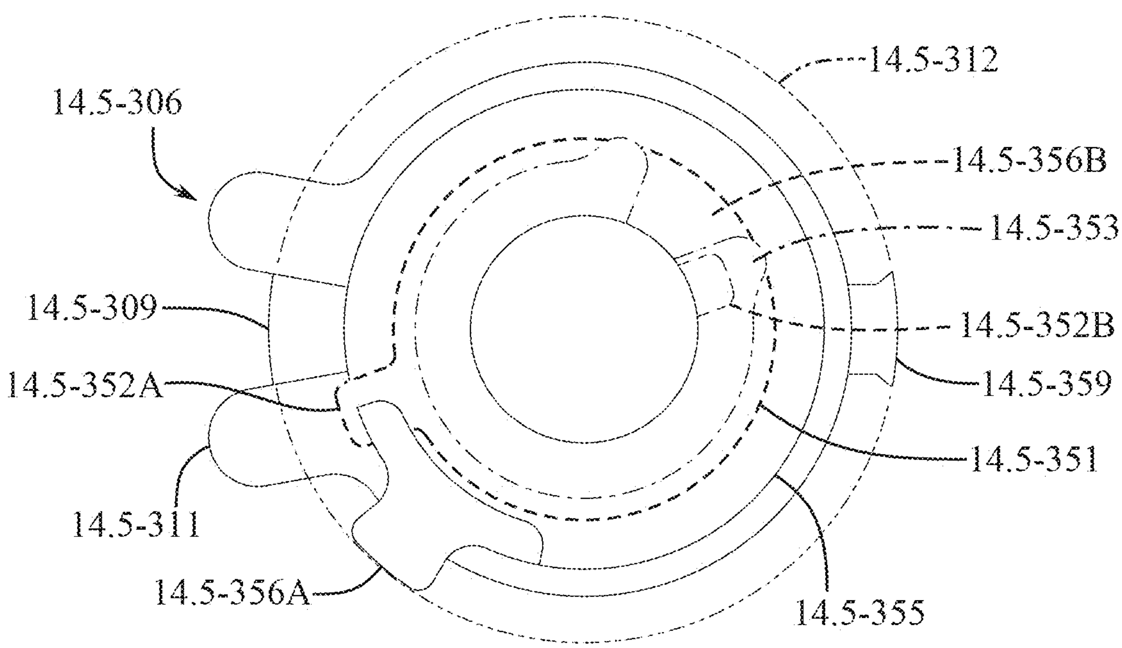
*FIG. 14.5-7B*

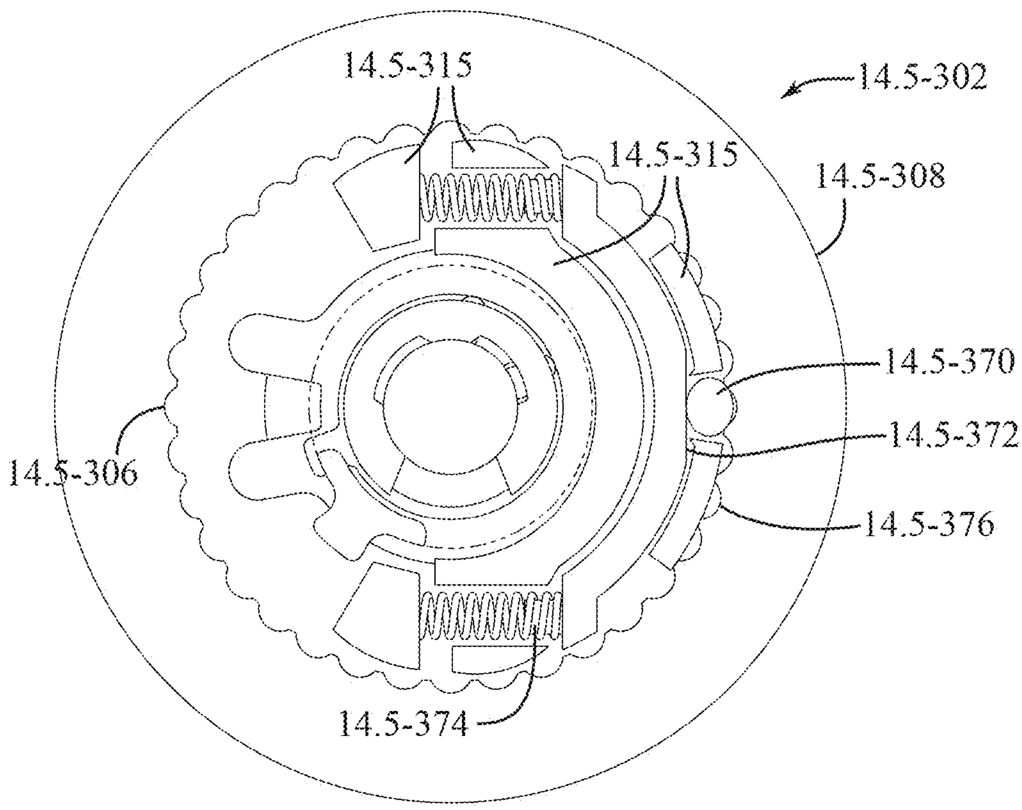
*FIG. 14.5-8*

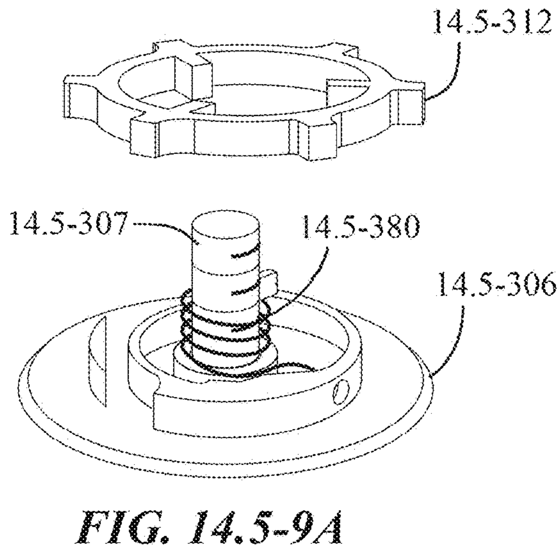
FIG. 14.5-9A
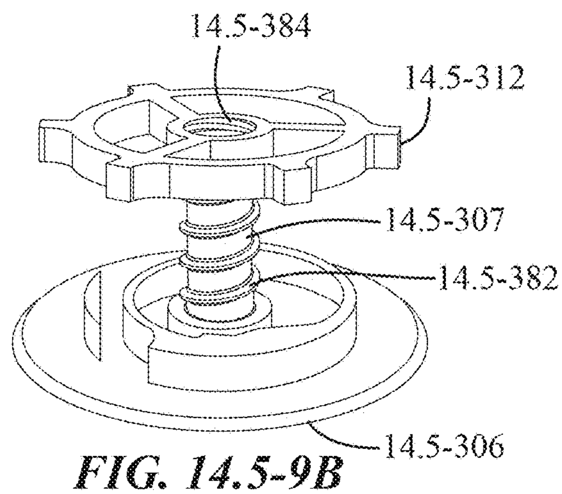
FIG. 14.5-9B
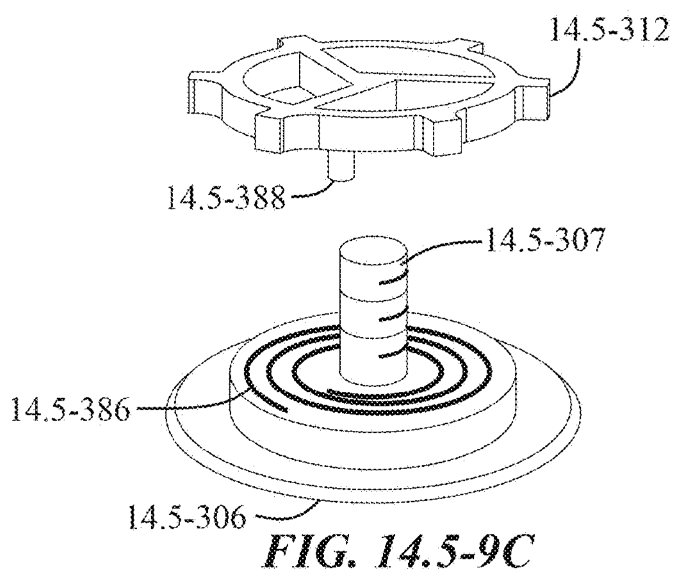
FIG. 14.5-9C

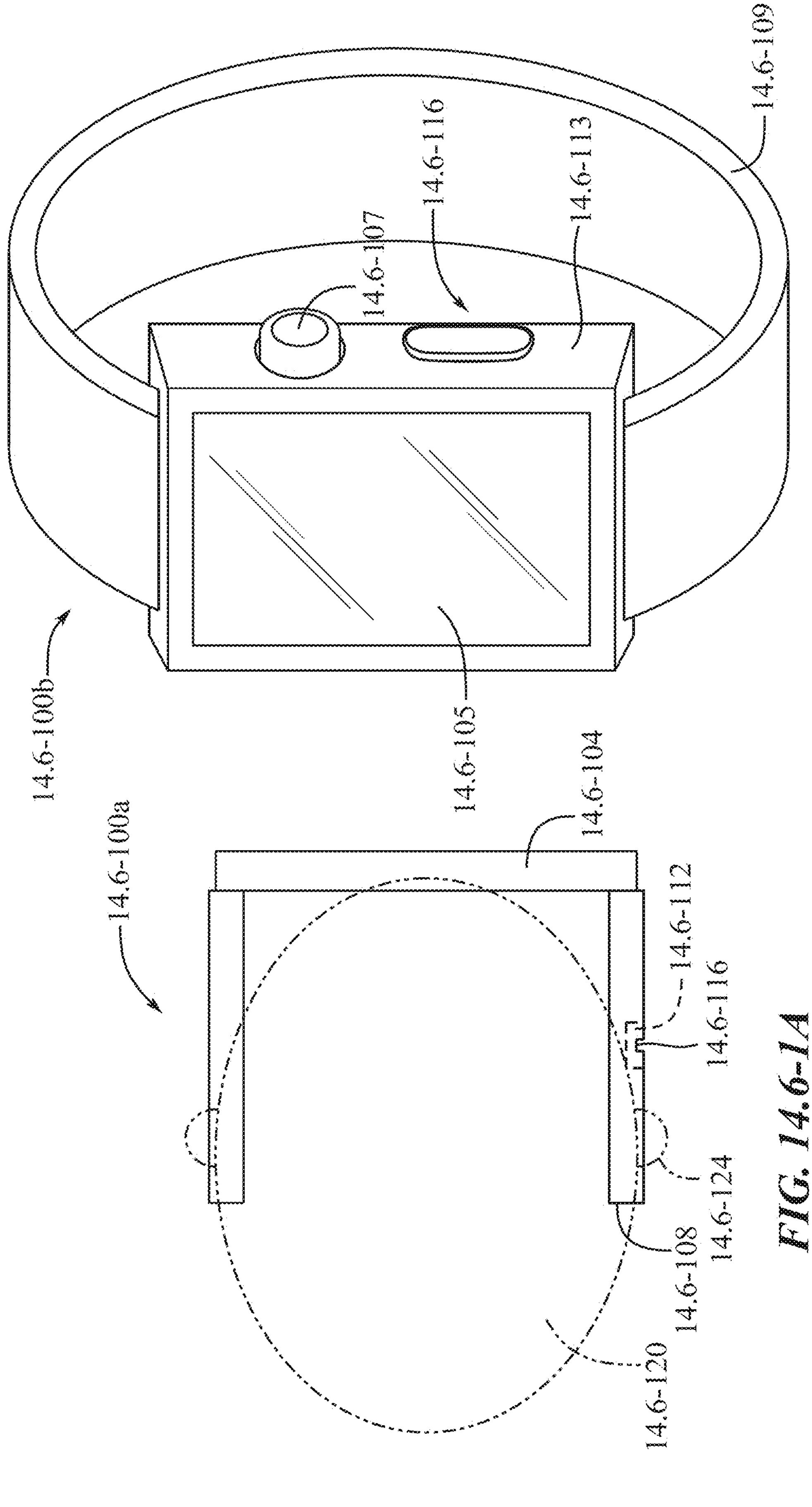
FIG. 14.6-1B
FIG. 14.6-1A

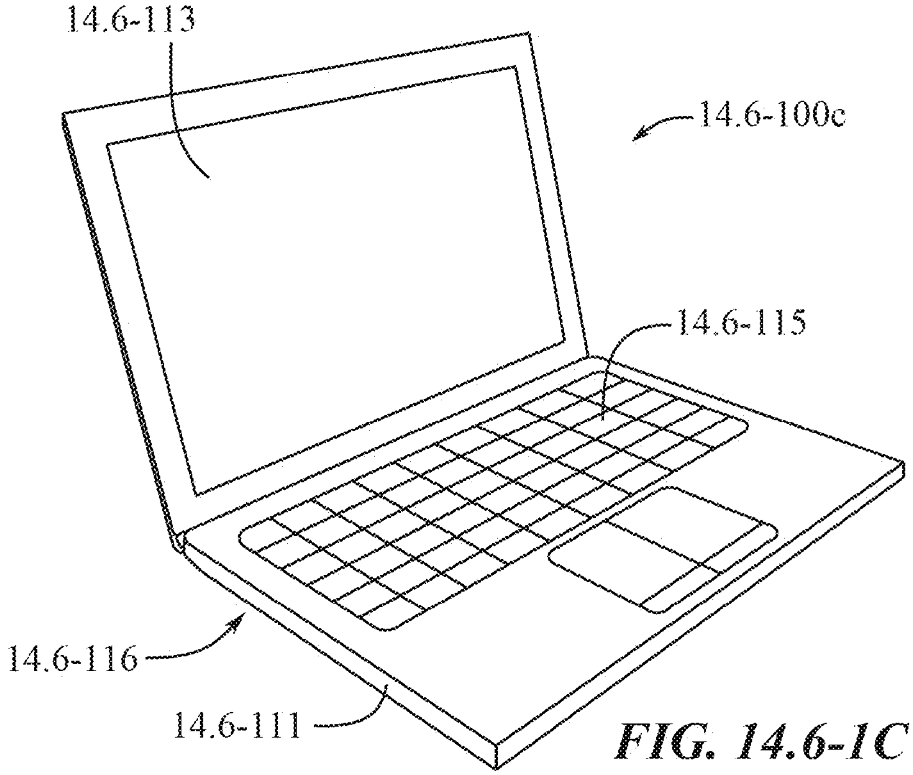
FIG. 14.6-1C
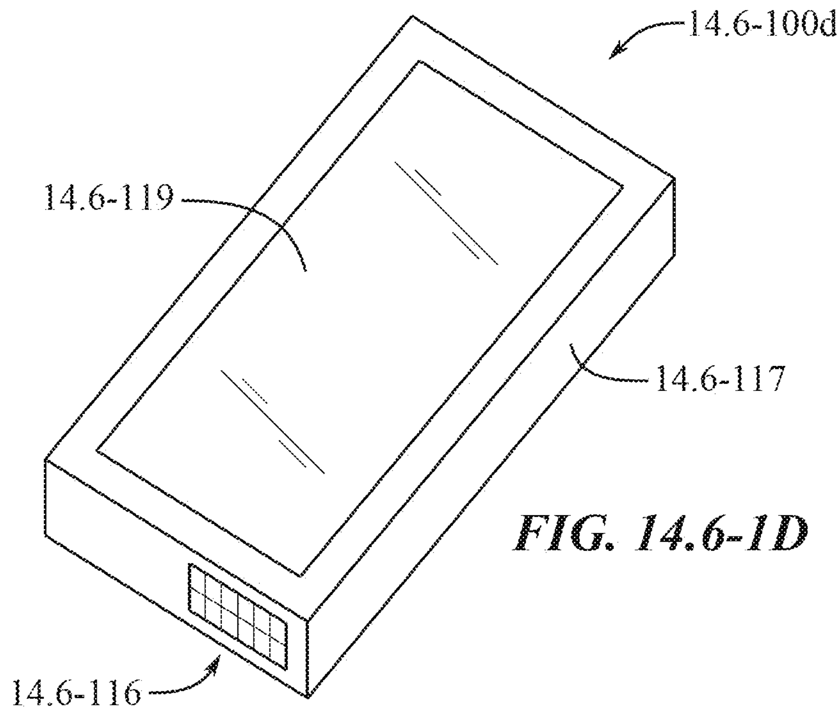
FIG. 14.6-1D

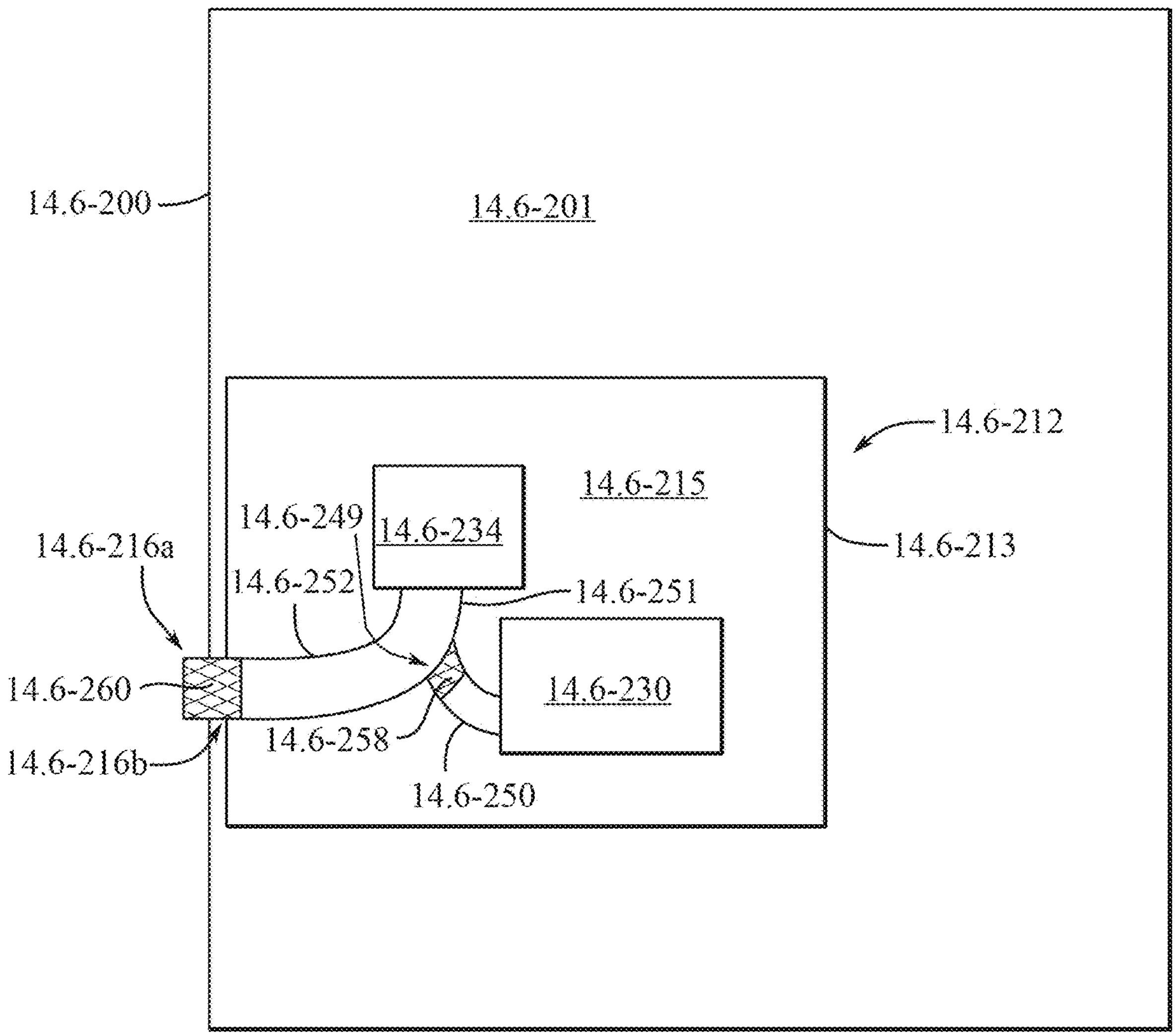
FIG. 14.6-2

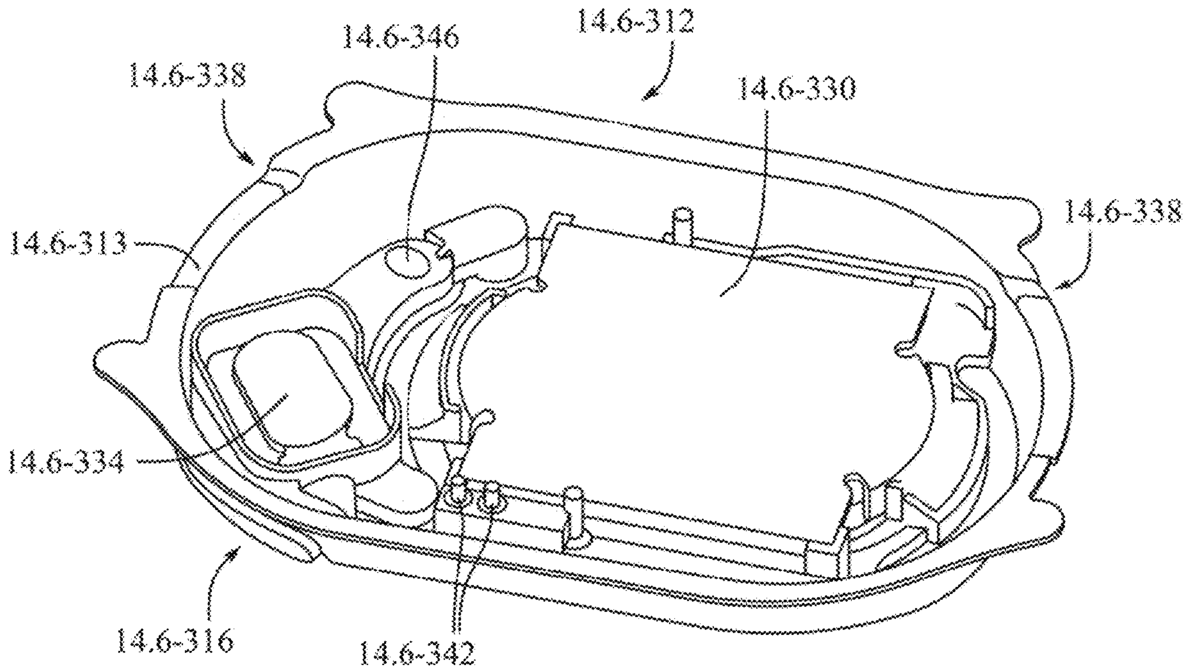
FIG. 14.6-3A
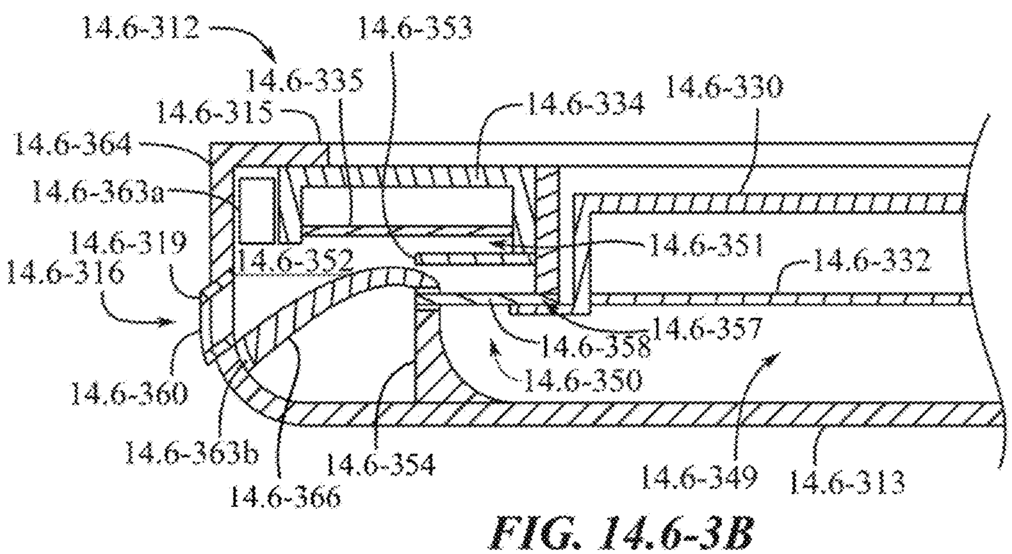
FIG. 14.6-3B

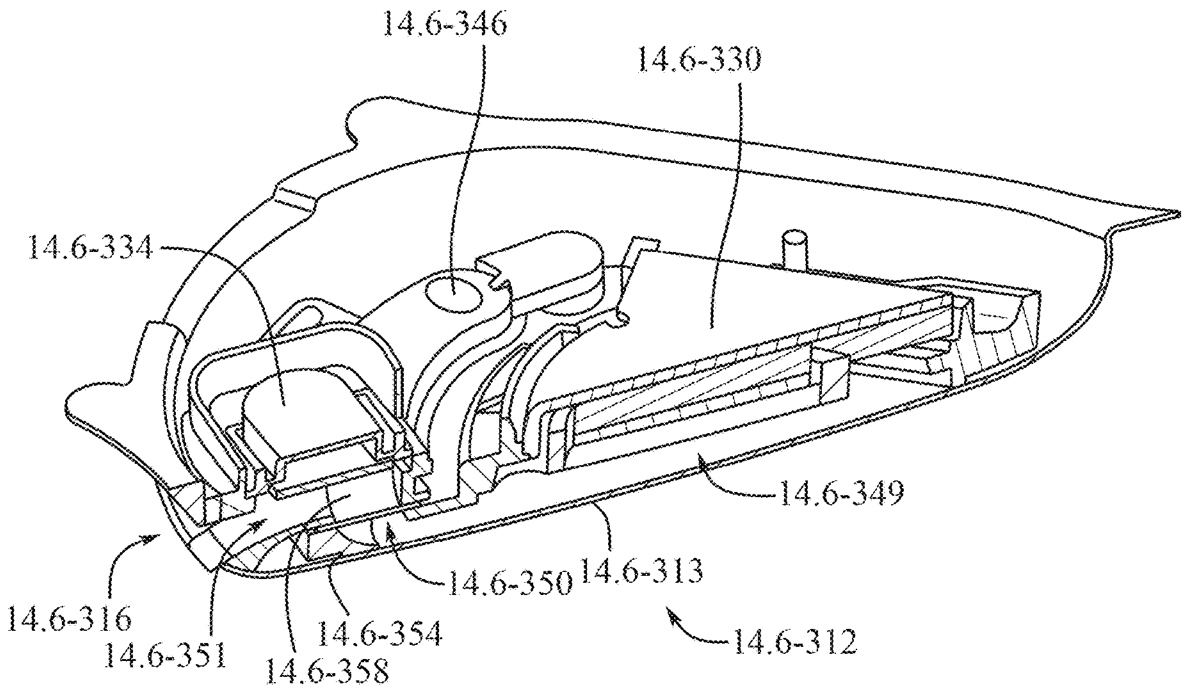
FIG. 14.6-3C

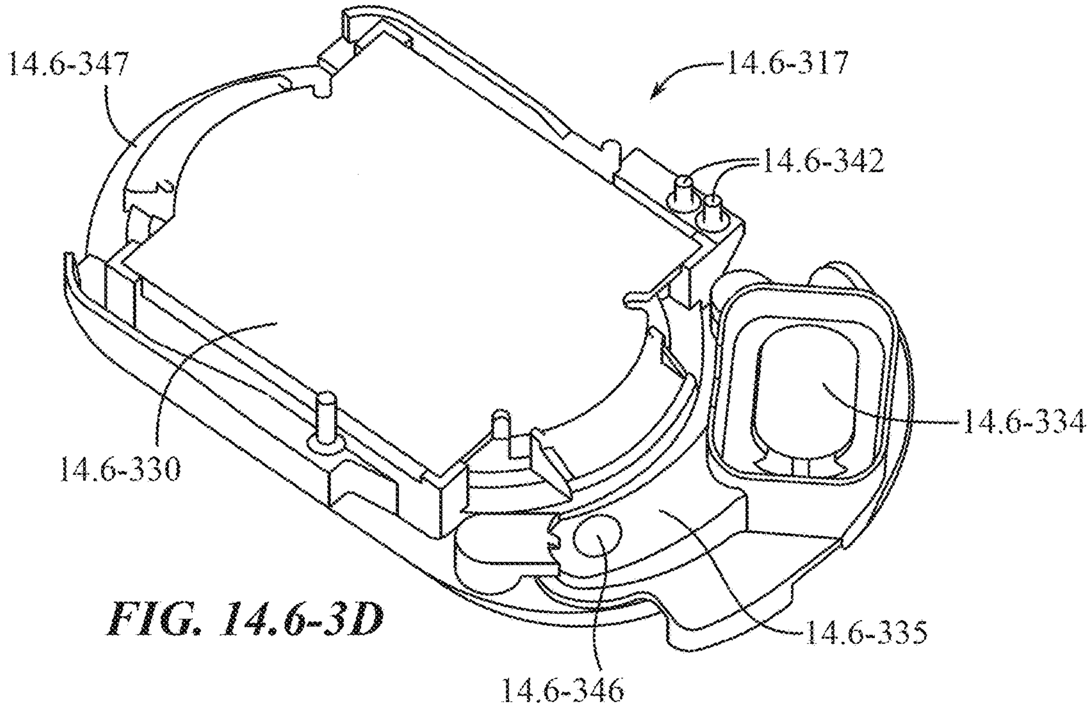
FIG. 14.6-3D
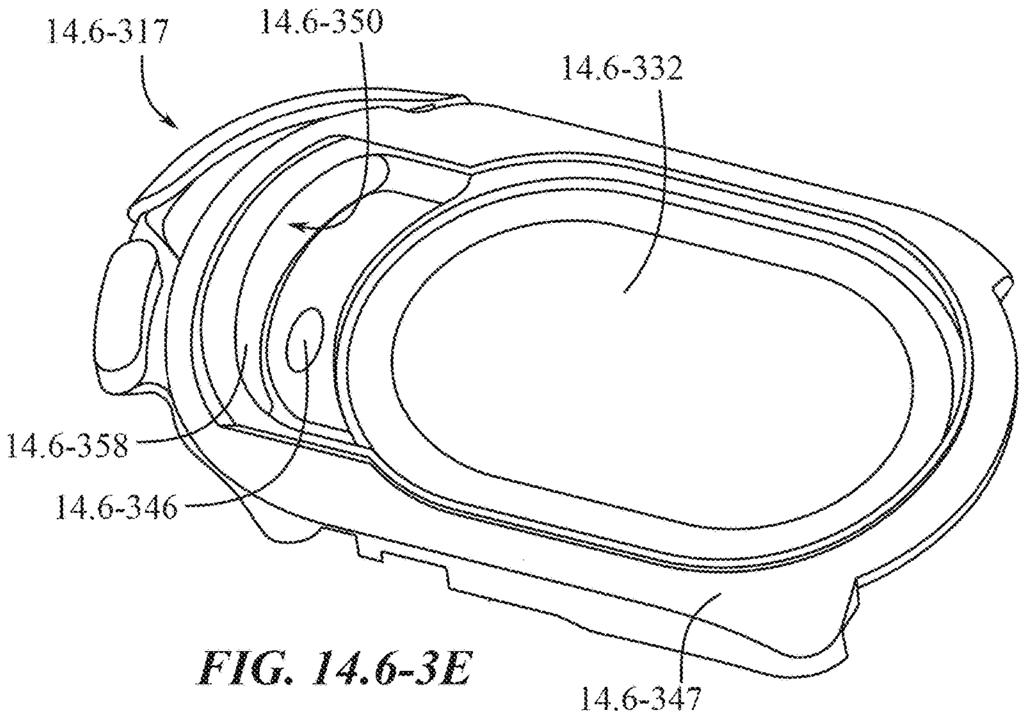
FIG. 14.6-3E

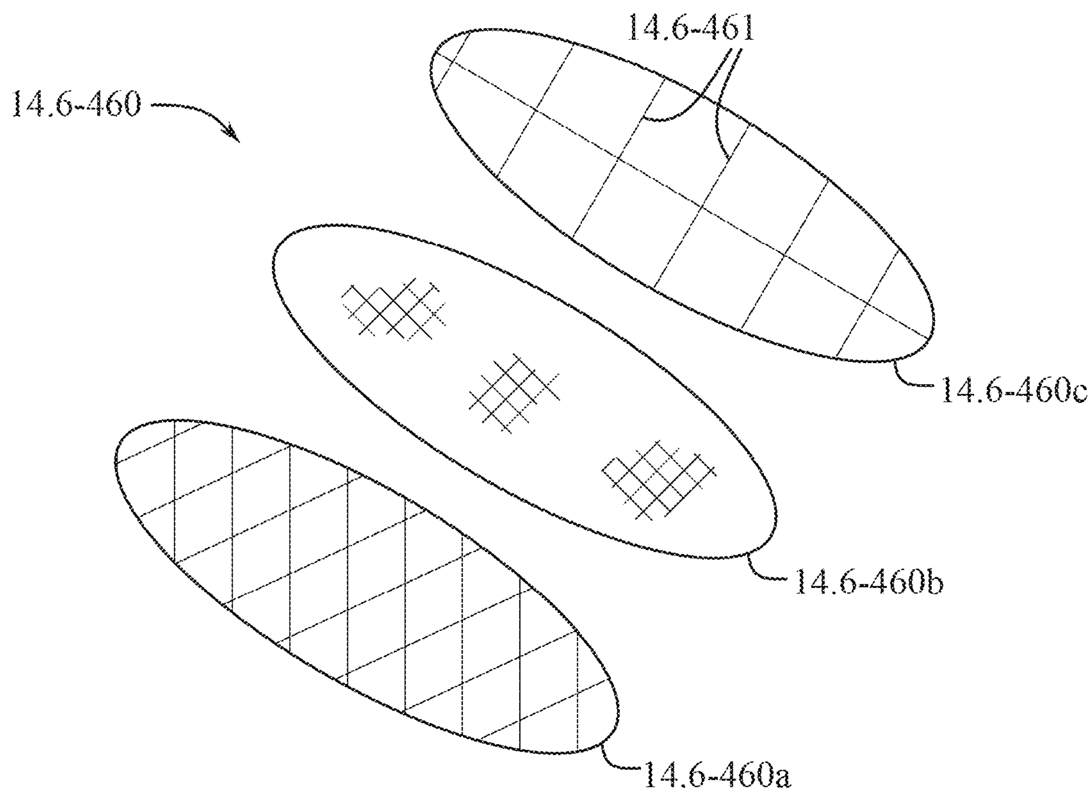
*FIG. 14.6-4*

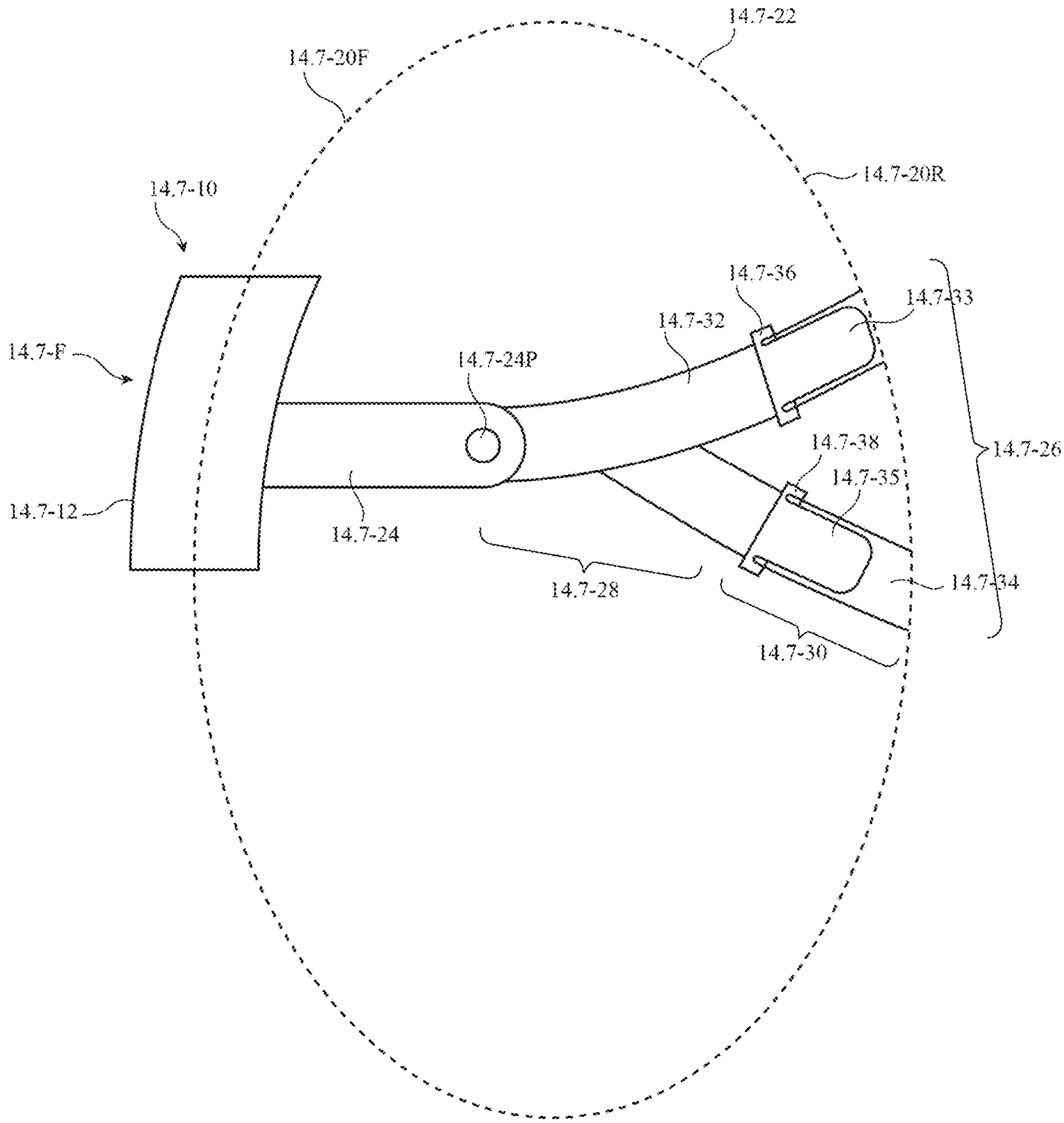
*FIG. 14.7-1*

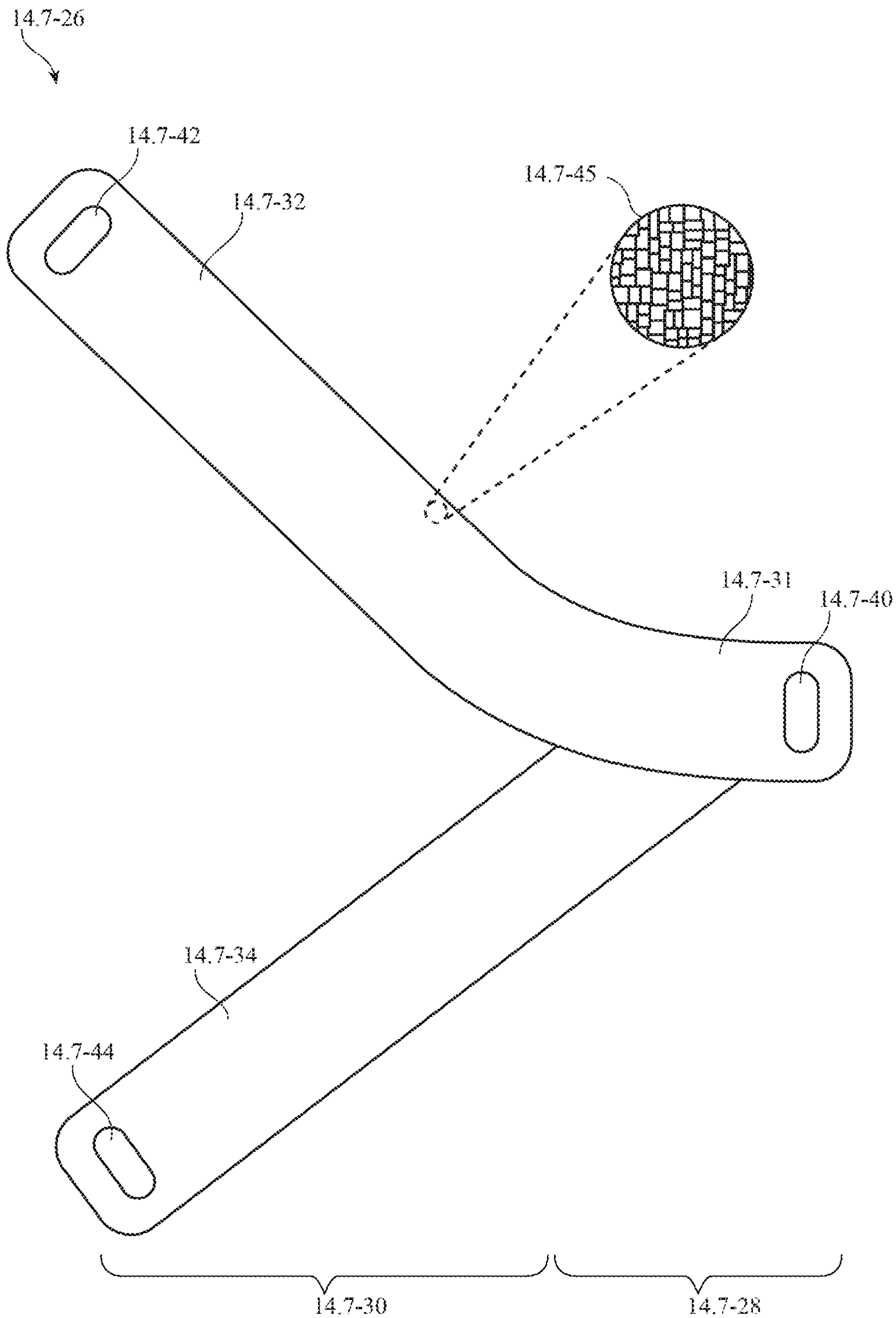
*FIG. 14.7-2A*

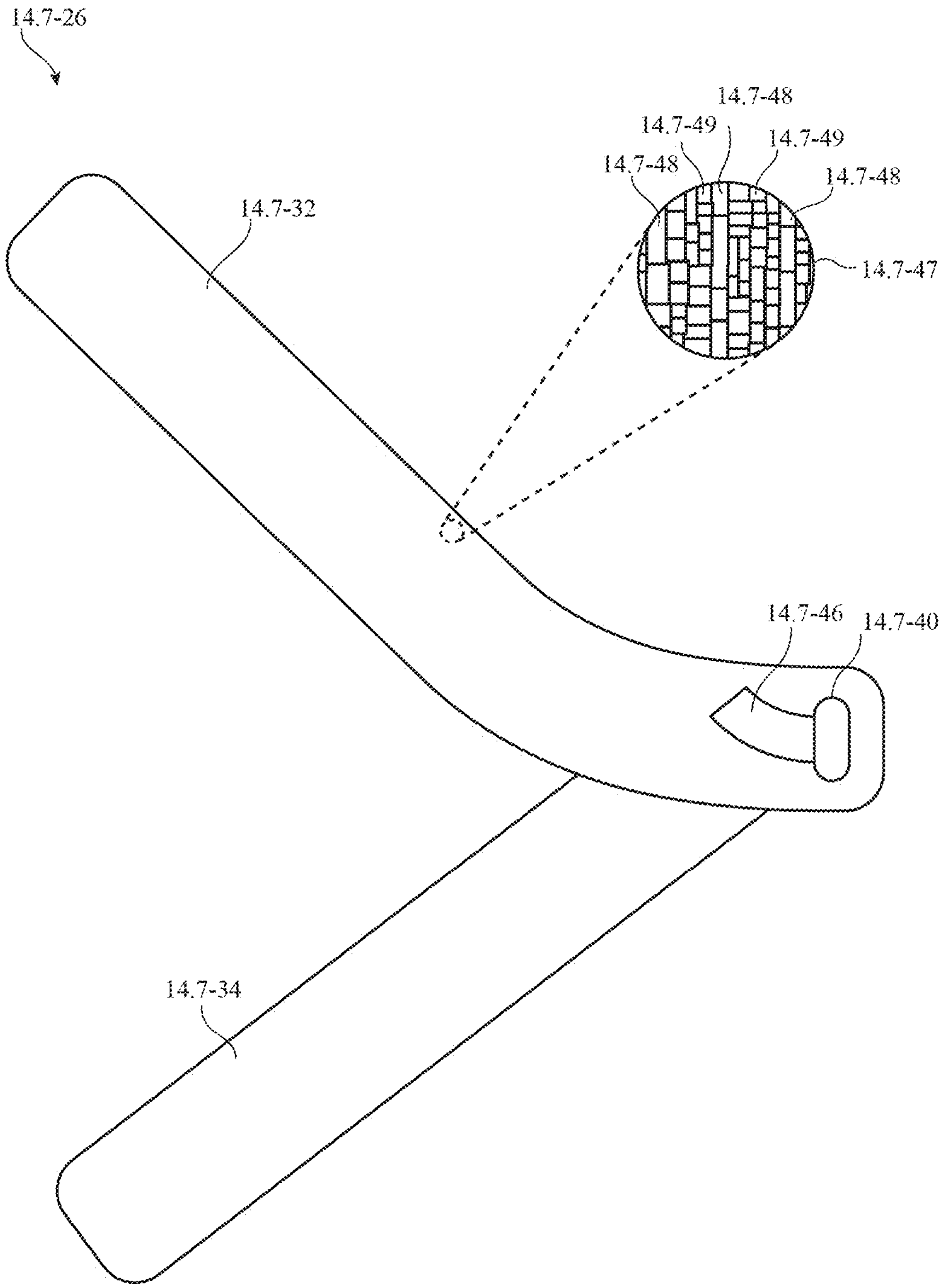
*FIG. 14.7-2B*

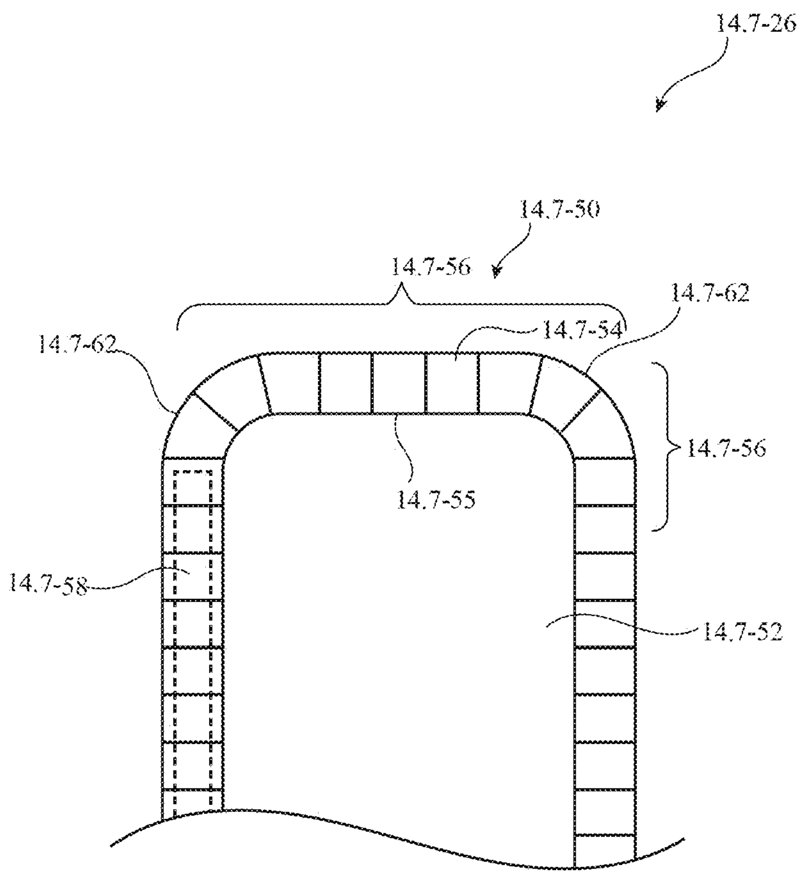
*FIG. 14.7-3*

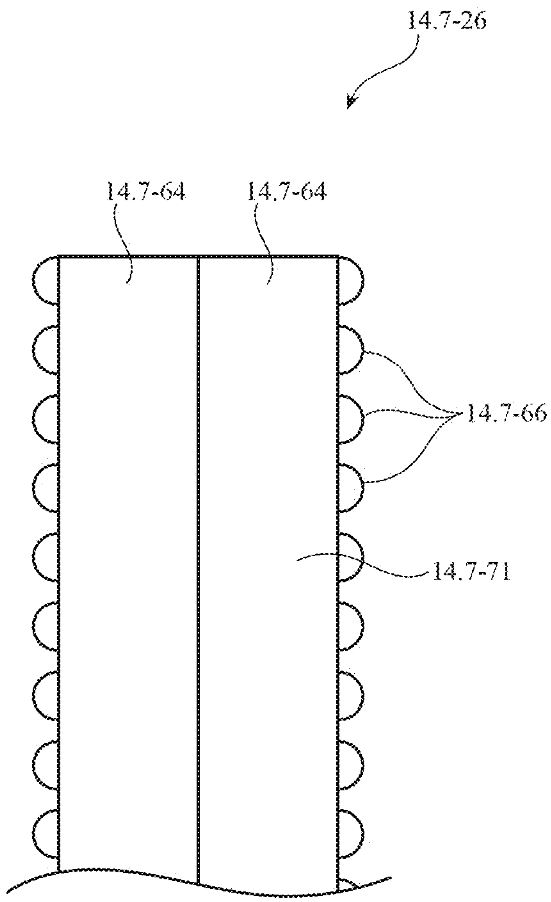
FIG. 14.7-4

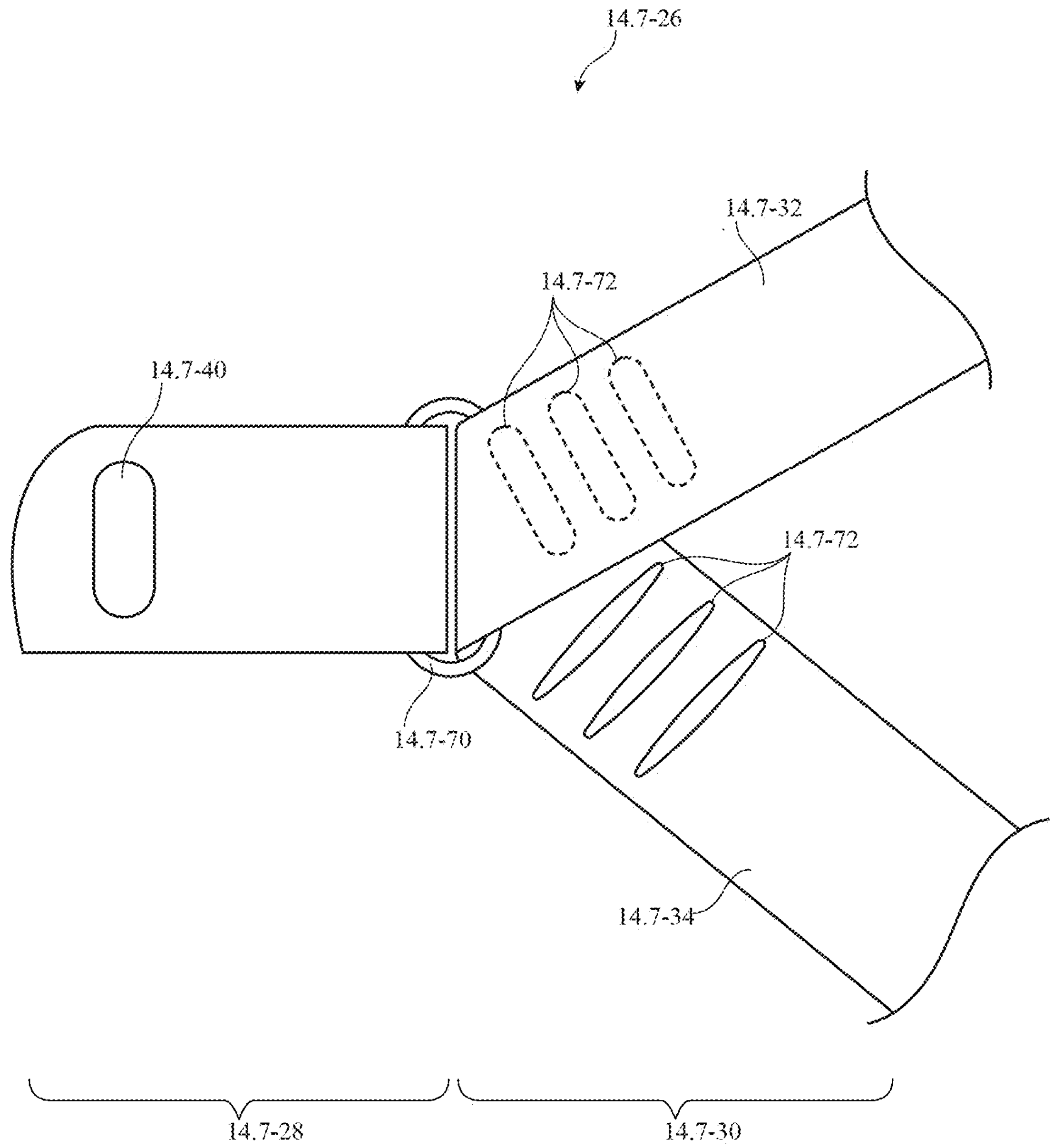
*FIG. 14.7-5*

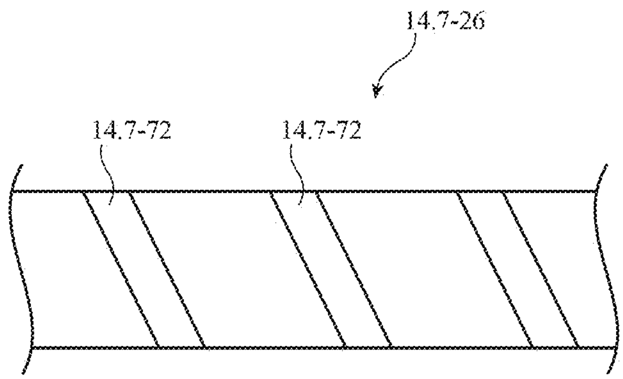
*FIG. 14.7-6A*
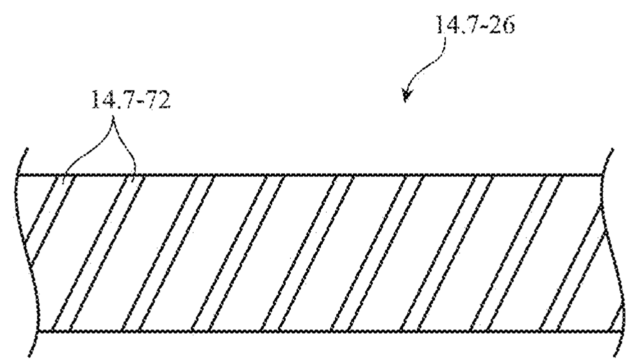
*FIG. 14.7-6B*
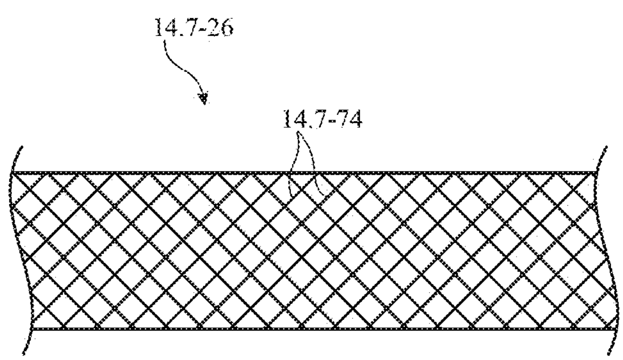
*FIG. 14.7-6C*

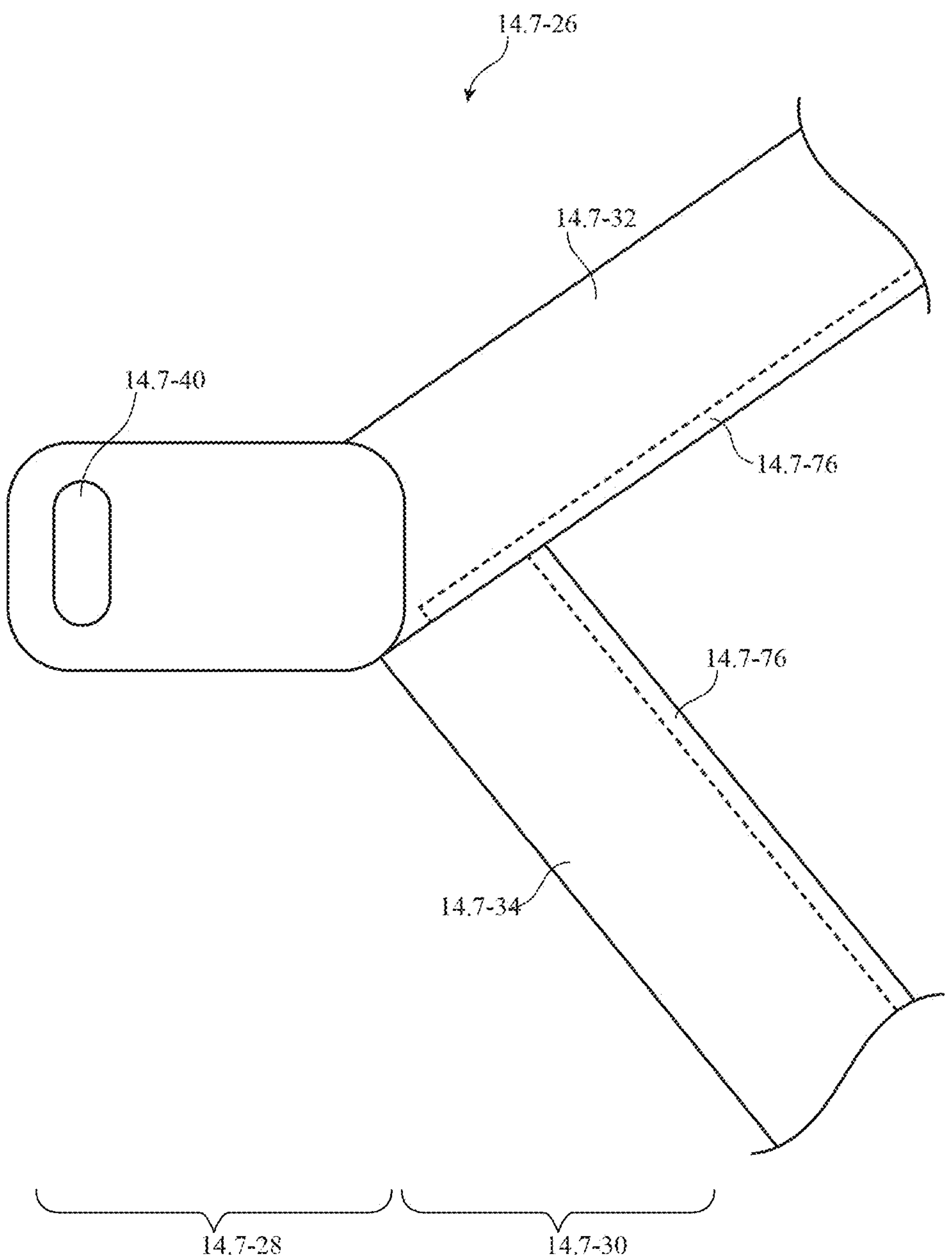
*FIG. 14.7-7*

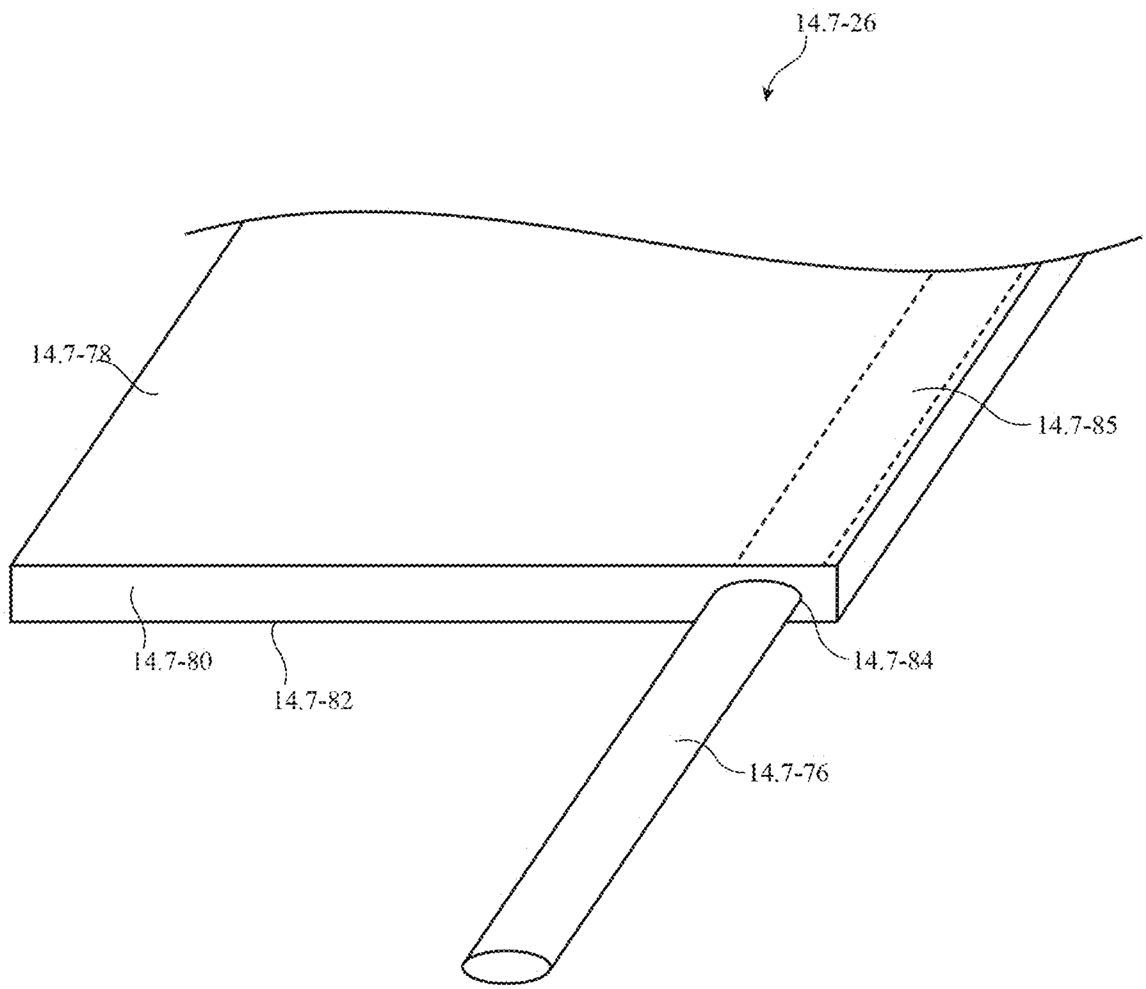
*FIG. 14.7-8*

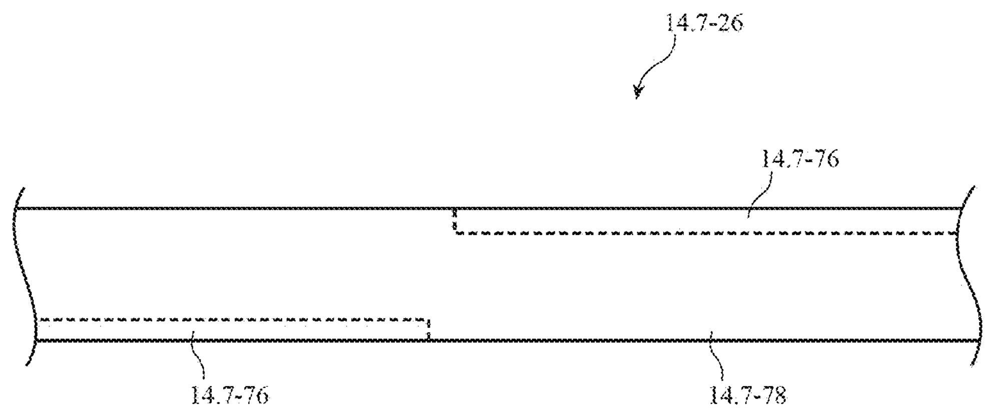
*FIG. 14.7-9A*
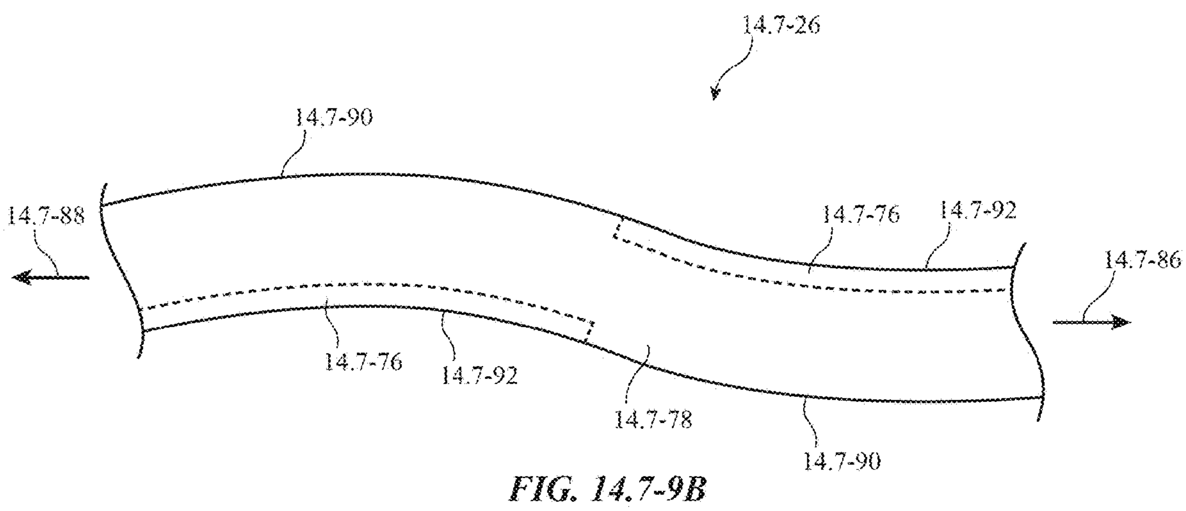
*FIG. 14.7-9B*

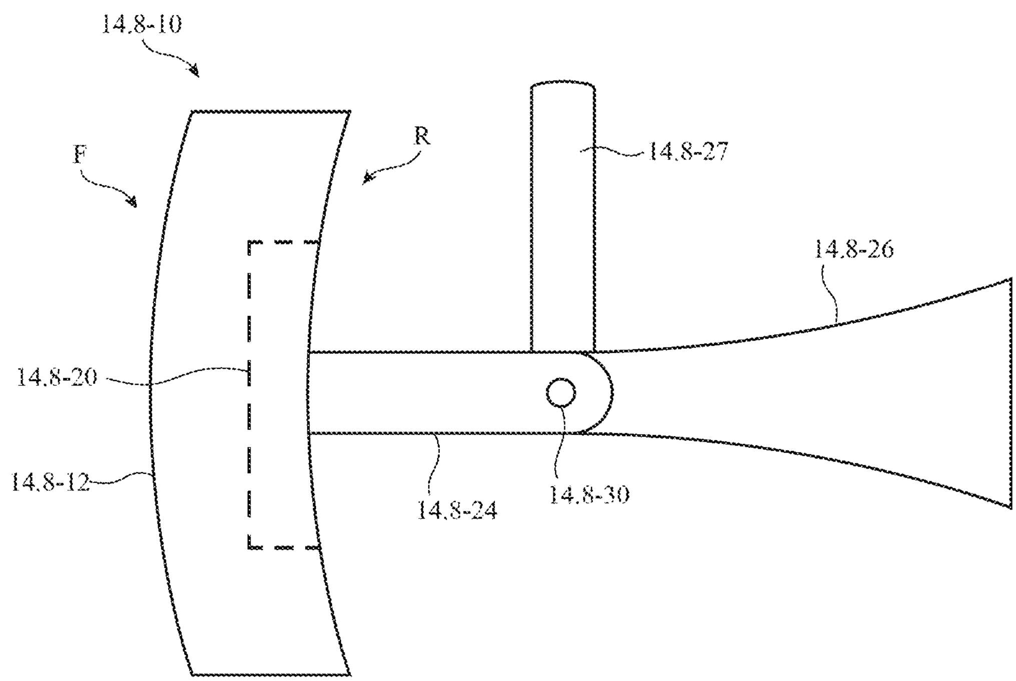
*FIG. 14.8-1*

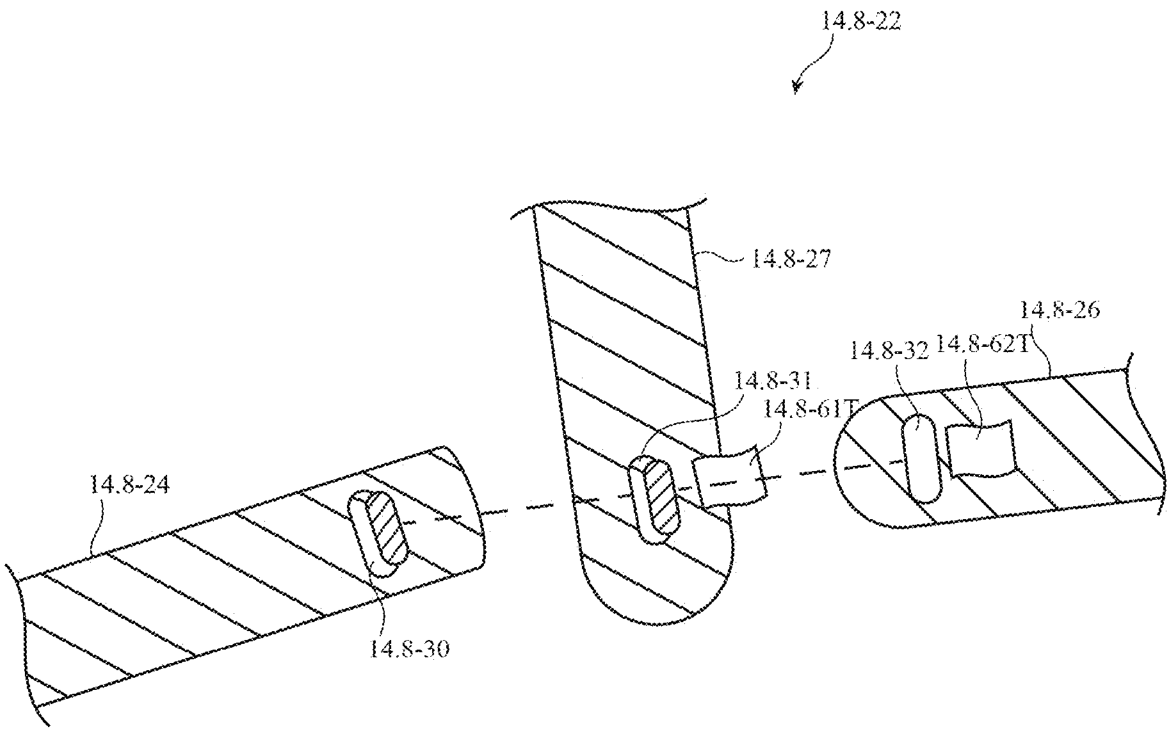
FIG. 14.8-2

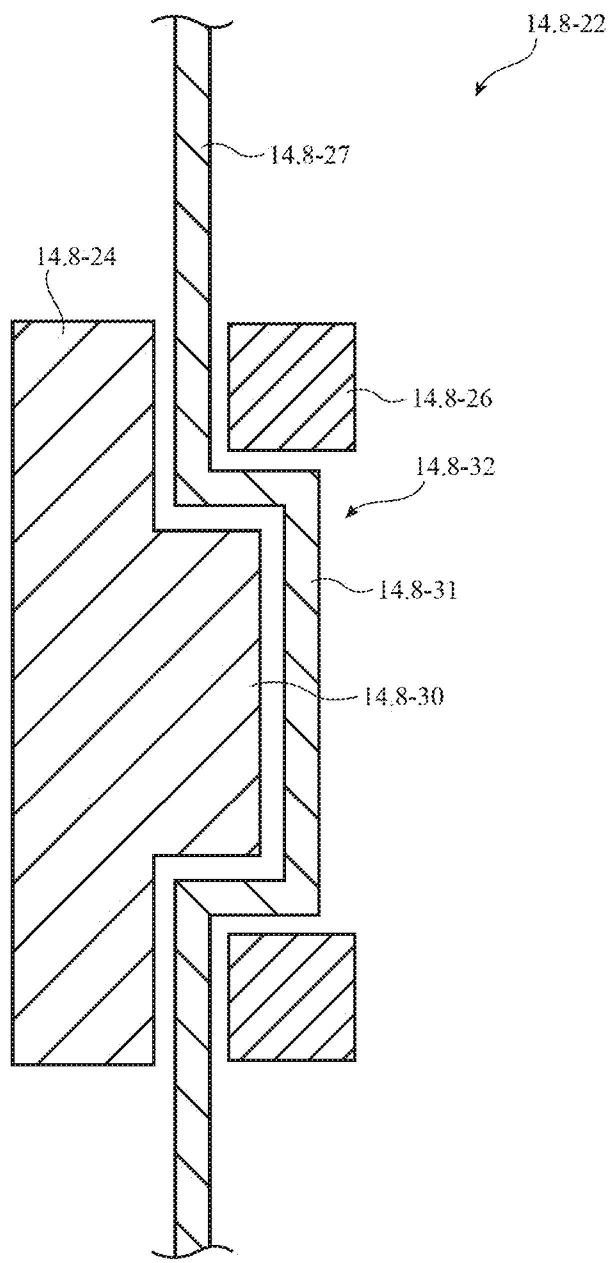
*FIG. 14.8-3*

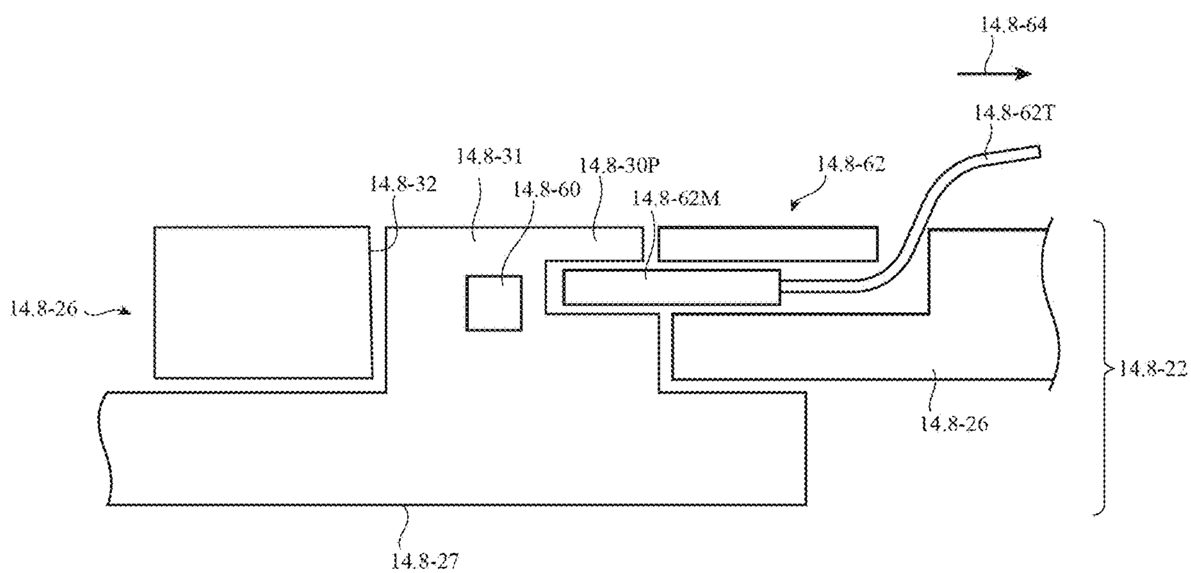
*FIG. 14.8-4*

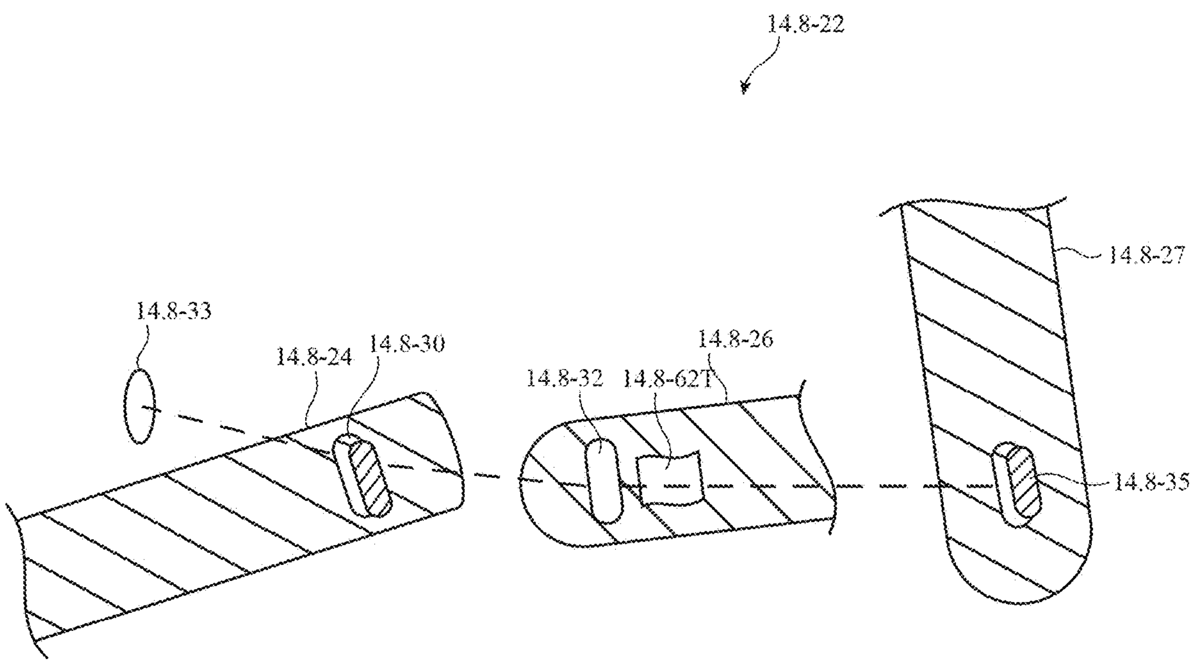
*FIG. 14.8-5*

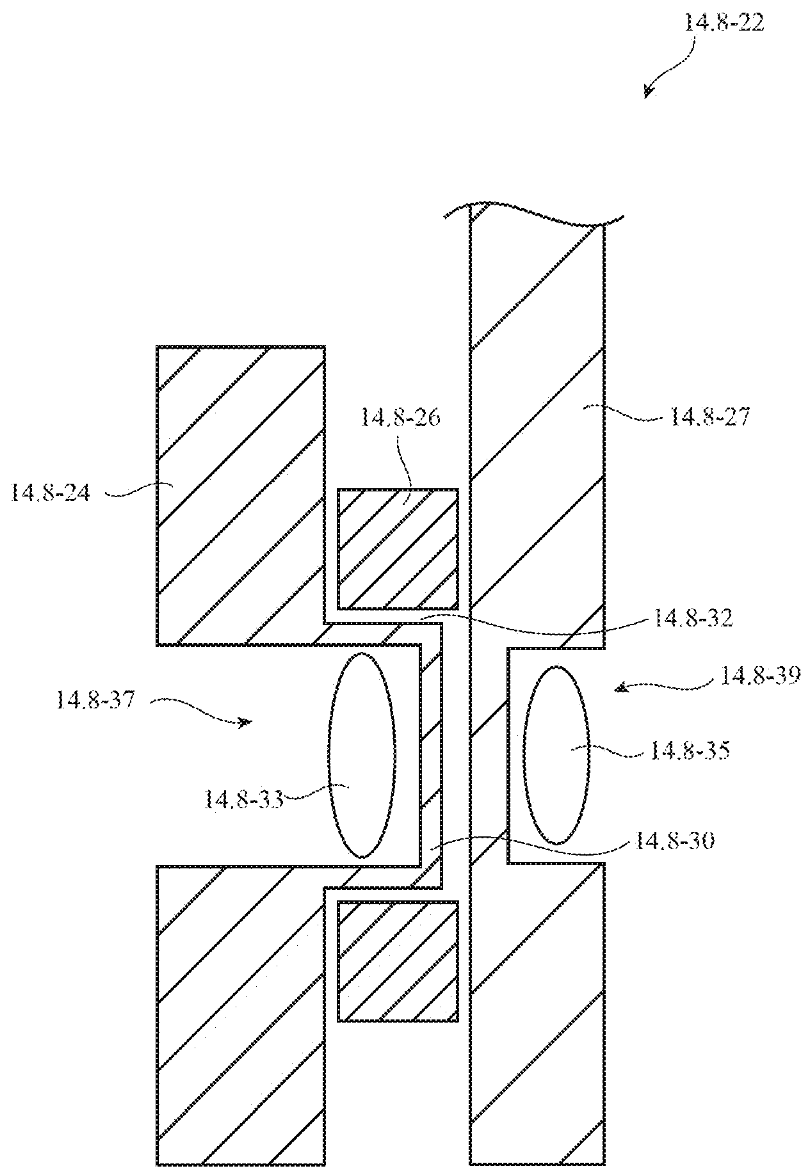
*FIG. 14.8-6*

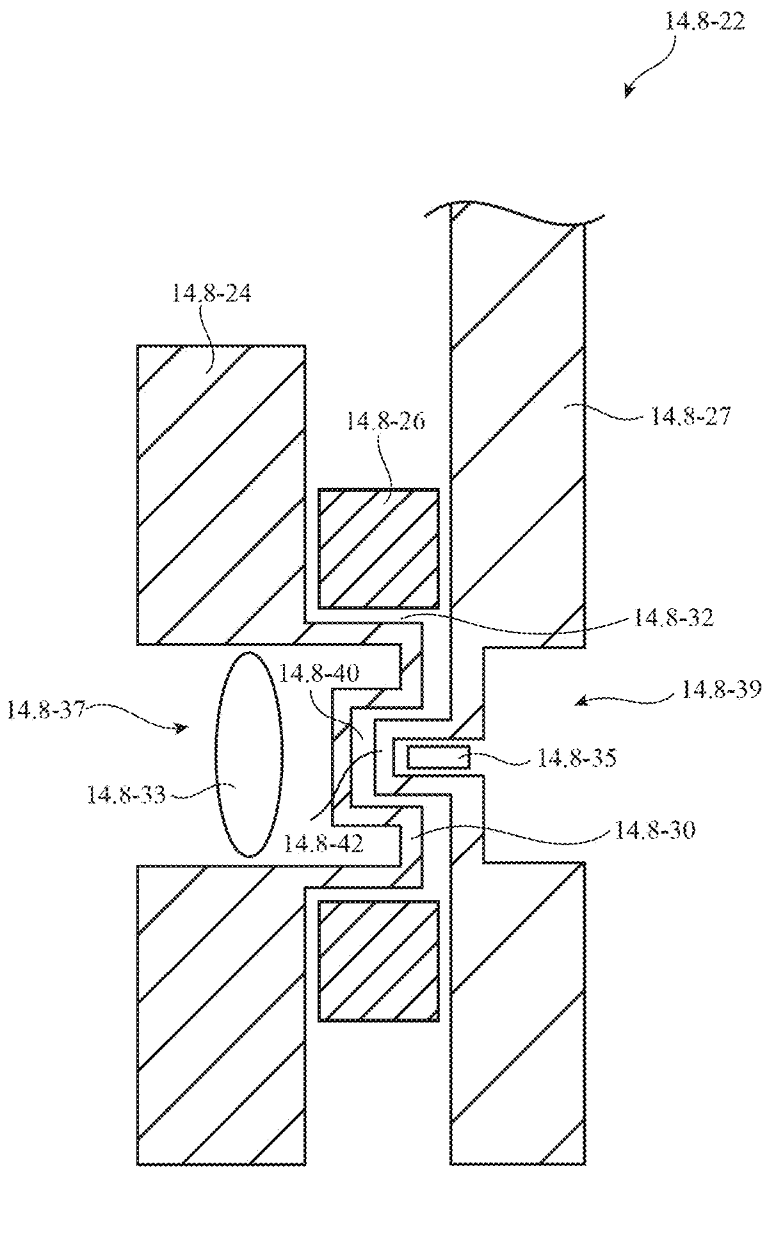
*FIG. 14.8-7*

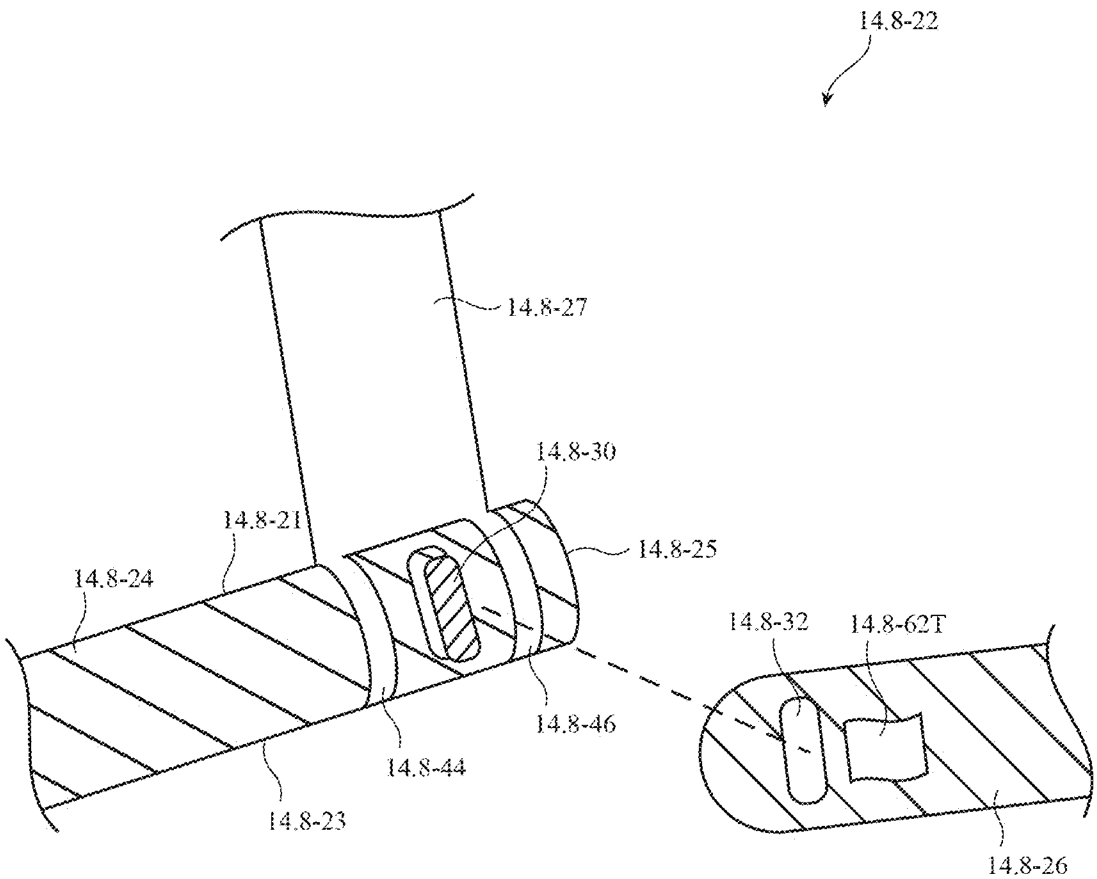
*FIG. 14.8-8*

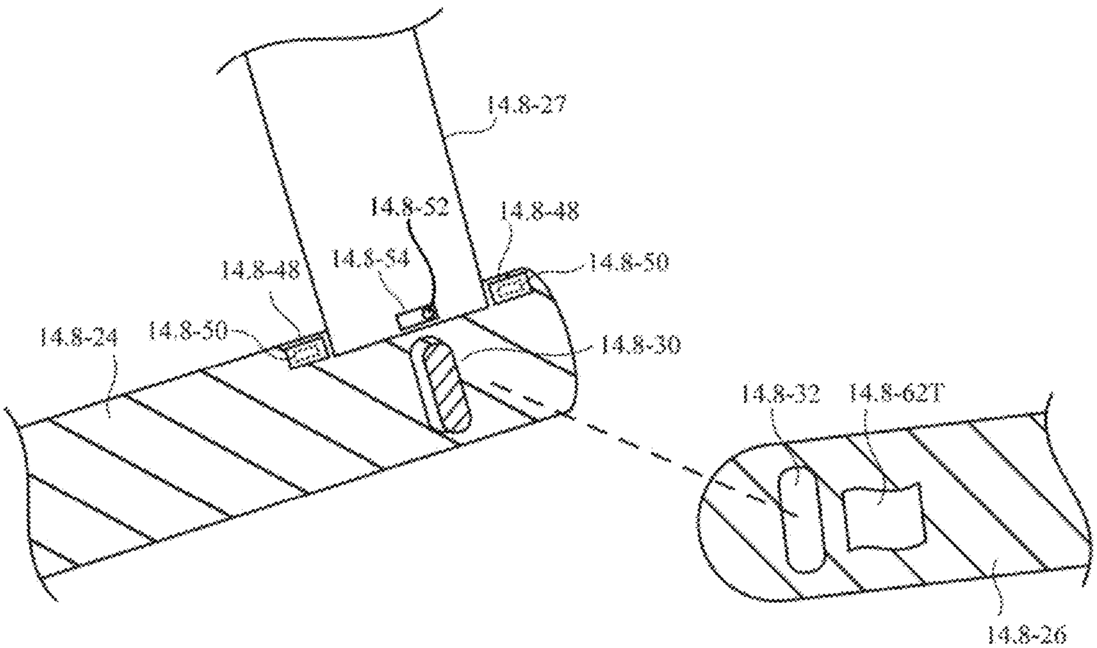
*FIG. 14.8-9*

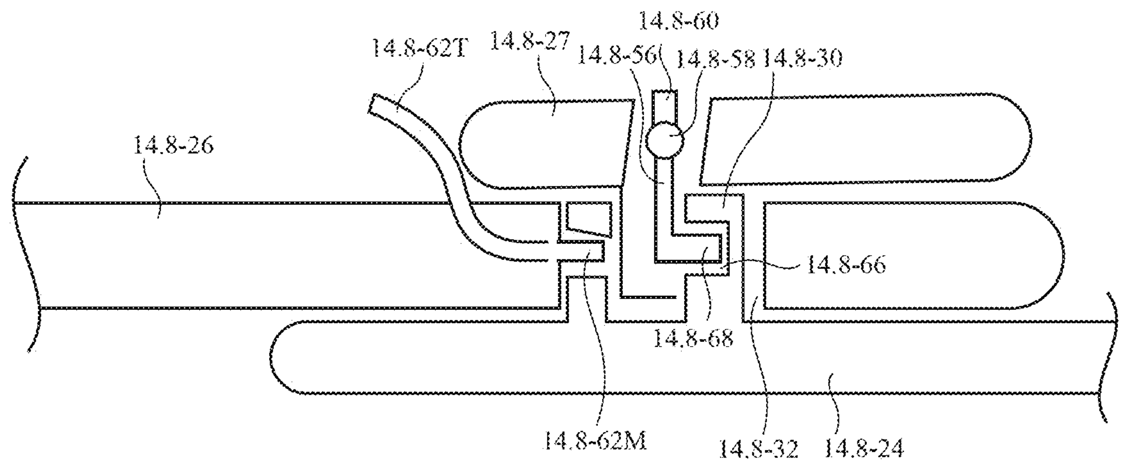
*FIG. 14.8-10*

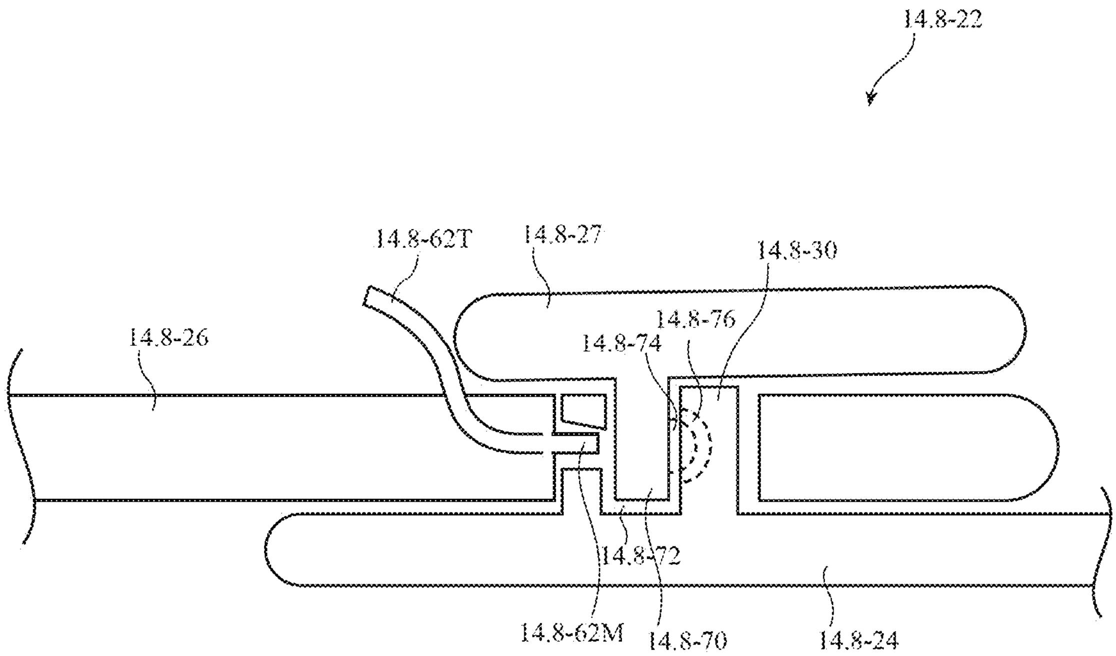
*FIG. 14.8-11*

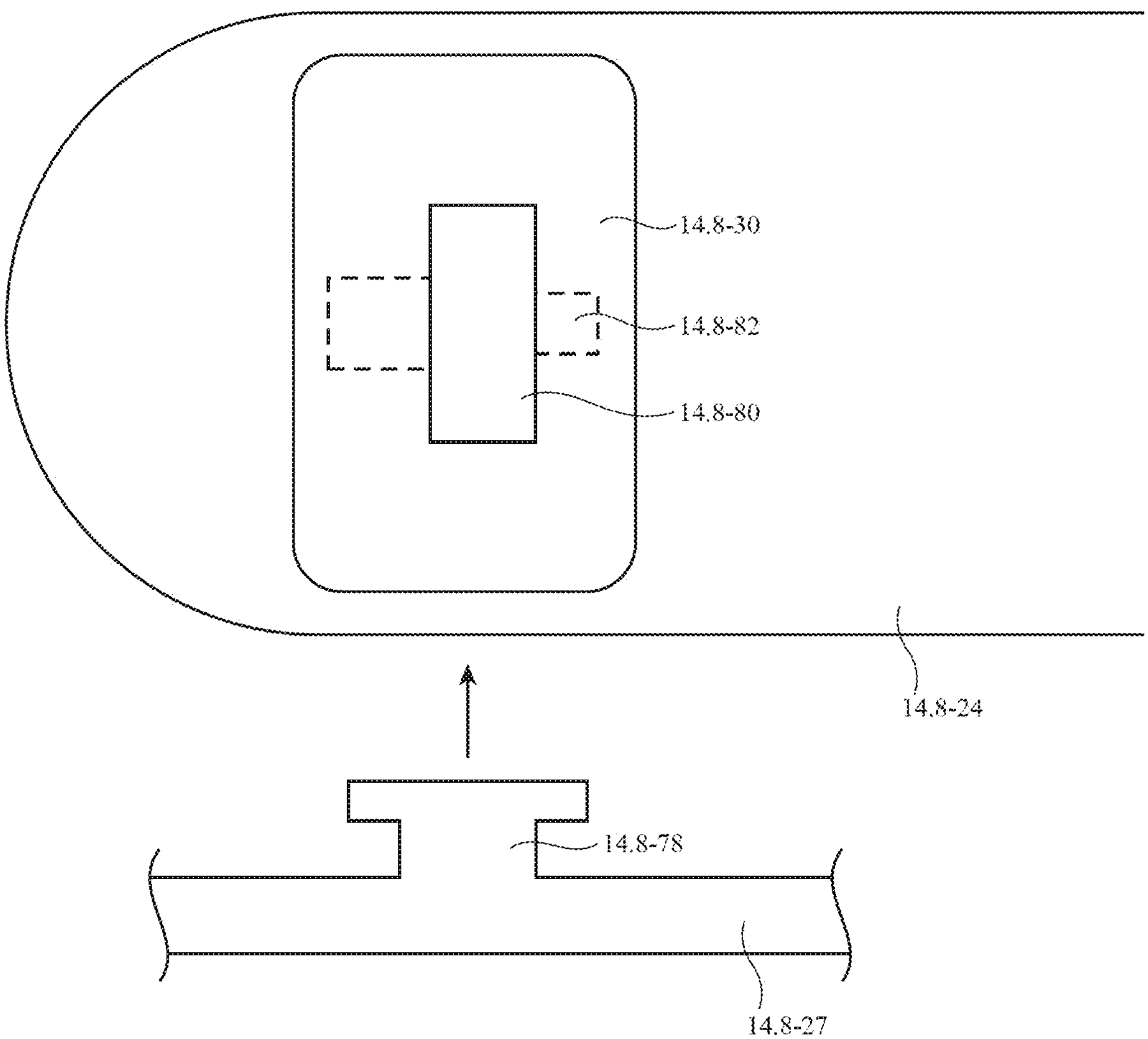
*FIG. 14.8-12*

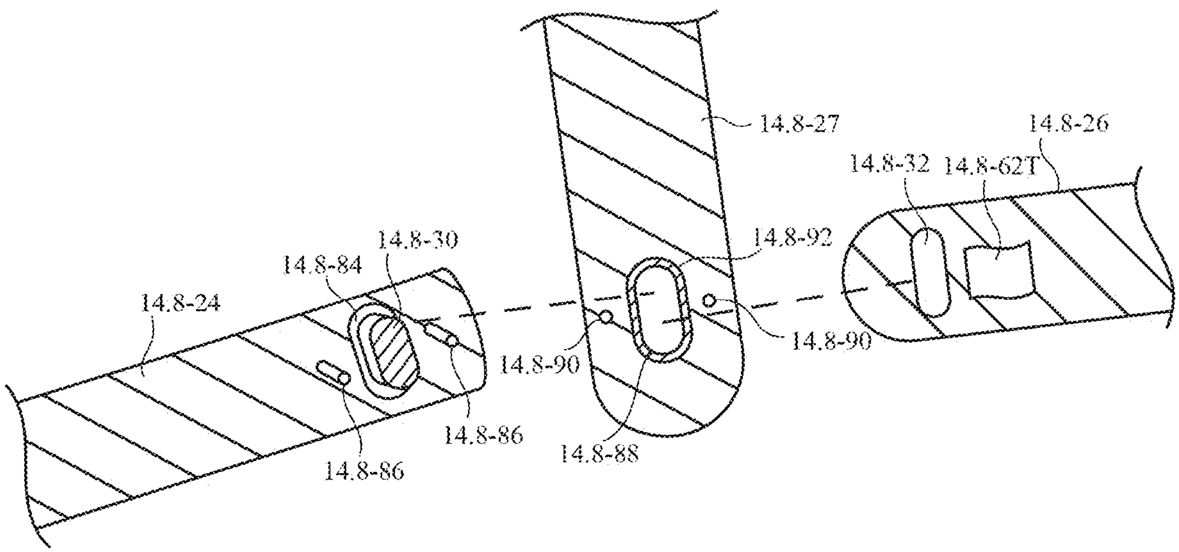
*FIG. 14.8-13*

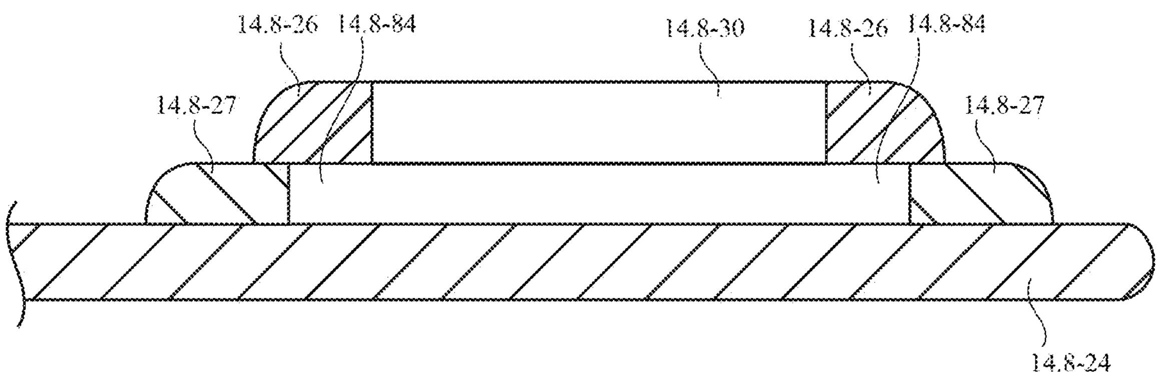
*FIG. 14.8-14*

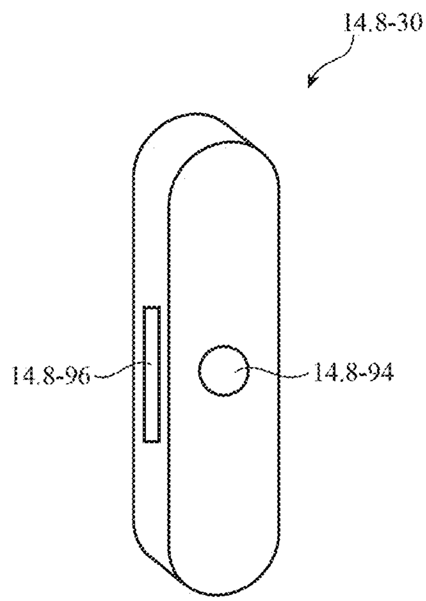
*FIG. 14.8-15A*
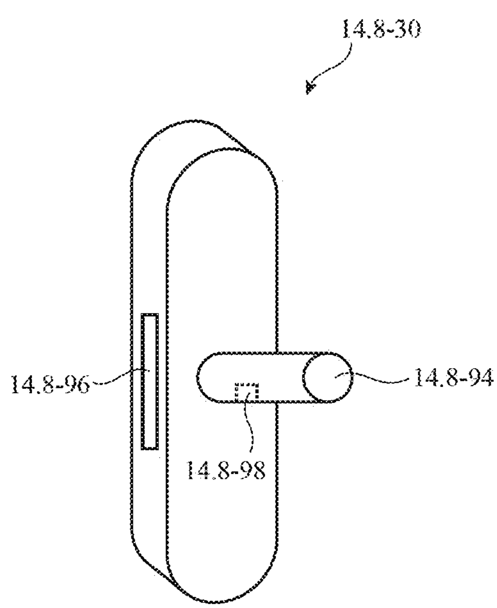
*FIG. 14.8-15B*

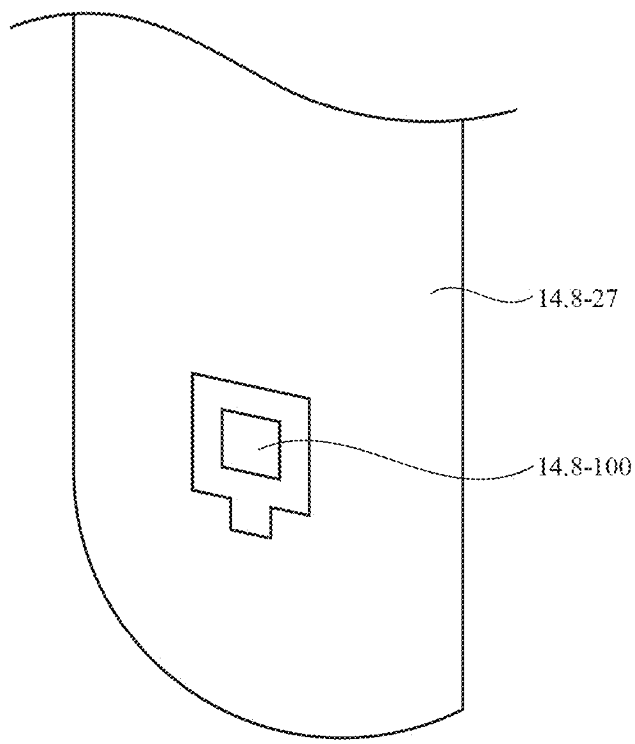
FIG. 14.8-16

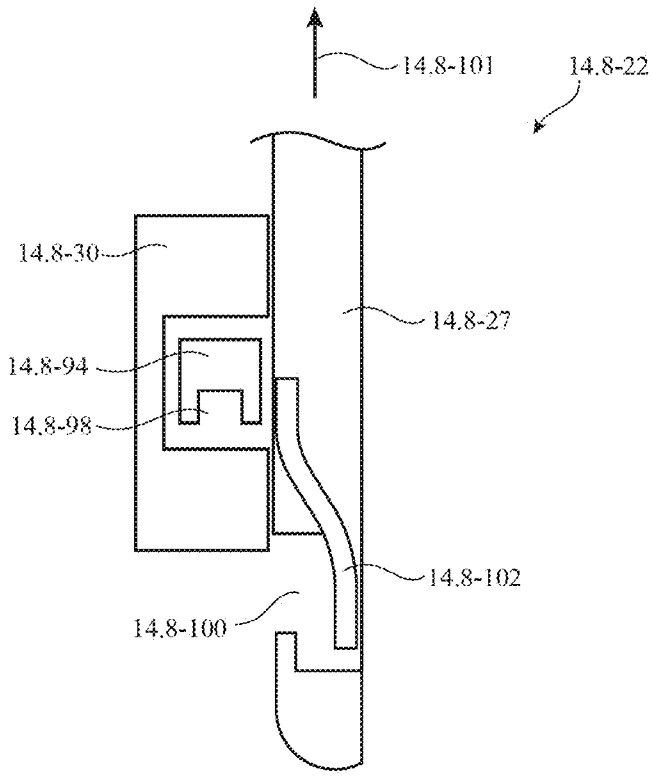
*FIG. 14.8-17A*
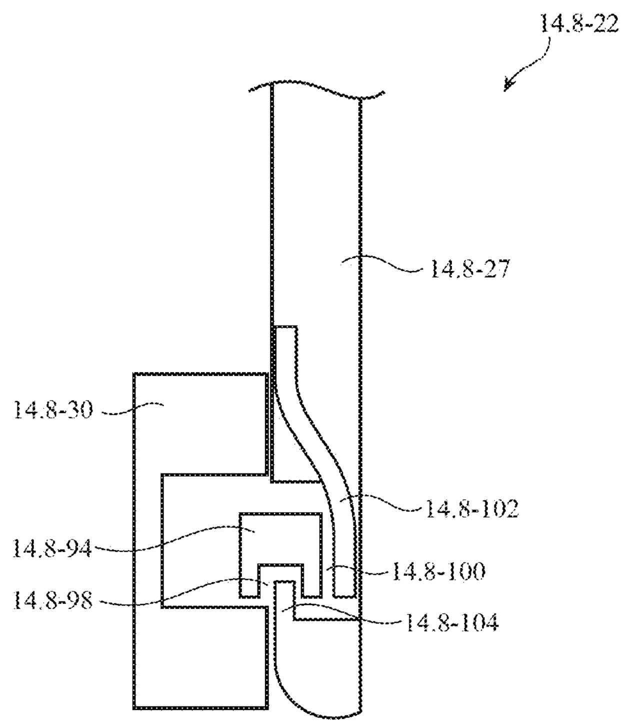
*FIG. 14.8-17B*

HEAD MOUNTABLE DISPLAY

CROSS-REFERENCE TO RELATED APPLICATION(S)

This claims priority to U.S. Provisional Patent Application No. 63/586,403, filed 28 Sep. 2023, and entitled "HEAD MOUNTABLE DISPLAY," to U.S. Provisional Patent Application No. 63/506,020, filed 2 Jun. 2023, and entitled "HEAD MOUNTABLE DISPLAY," and to U.S. Provisional Patent Application No. 63/502,408, filed 15 May 2023, and entitled "HEAD MOUNTABLE DISPLAY," the entire disclosures of which are hereby incorporated by reference in their entirety.

FIELD

The present disclosure relates generally to head mountable computer systems that provide computer-generated experiences, including, but not limited to, electronic devices that provide virtual reality and mixed reality experiences via a display.

BACKGROUND

The development of computer systems for augmented reality, including head mountable computer systems, has increased significantly in recent years. Example augmented reality environments include at least some virtual elements that replace or augment the physical world. Input devices, such as cameras, controllers, joysticks, touch-sensitive surfaces, and touch-screen displays for computer systems and other electronic computing devices are used to interact with virtual/augmented reality environments. Example virtual elements include virtual objects, such as digital images, video, text, icons, and control elements such as buttons and other graphics.

SUMMARY

In at least one example of the present disclosure, a head-mountable device can include an outer frame that can define a first opening, a second opening an internal volume between the first opening and the second opening, an intake port between the first opening and the second opening, and an exhaust port between the first opening and the second opening. In some examples, a front cover assembly can be disposed in the first opening. An inner frame can be coupled to the outer frame, where the inner frame can also define a first aperture and a second aperture. In some examples, a curtain assembly can occlude the second opening. Furthermore, the curtain assembly can include an elastic layer that can define an external surface. The curtain assembly can also include an air-impermeable layer that can define the internal volume.

In at least one example, the head-mountable device can include a fan assembly. In some examples, the fan assembly can include a first fan disposed in the internal volume and aligned with the first aperture and a second fan disposed in the internal volume and aligned with the second aperture. The first fan and the second can be configured to draw air into the internal volume through the intake port and push the air out from the internal volume through the exhaust port. In some examples, the outer frame can include an upper sidewall that can define the exhaust port and a lower sidewall opposite the upper sidewall. In at least one example, the lower sidewall can define the intake port.

In some examples, the head-mountable device can further include a printed circuit board disposed in the internal volume. In at least one example, the first fan can include a first housing thermally coupled to the printed circuit board. Furthermore, a second fan can include a second housing thermally coupled to the printed circuit board.

In at least one example of the present disclosure, a display assembly can be disposed in the internal volume. The fan assembly can be disposed between the display assembly and the printed circuit board. In some examples, the display assembly can include a first display screen and a second display screen. Furthermore, the first display screen can be aligned with the first aperture and the second display screen can be aligned with the second aperture. In at least one example, the display assembly can further include a first lens aligned with the first display screen and a second lens aligned with the second display screen. Additionally, the curtain assembly can occlude the second opening between the outer frame and the first and second lenses.

In at least one example, the head-mountable device can include a frame that can define an internal volume, an intake port, and an exhaust port. In some examples, a curtain assembly can be coupled to the frame. The curtain assembly can also include a first layer that can define an external surface and a second layer that can define the internal volume, where the second layer can be air-permeable. In further examples, head-mountable device can include a heat sink that can be disposed in the internal volume and a fan assembly. In some examples, the fan assembly can include a housing that can include the heat sink. The fan assembly can also include an air mover disposed in the housing and configured to draw air into the internal volume through the intake port and push the air out of the internal volume through the exhaust port. In some examples, the head-mountable device can further include a printed circuit board that can have a heat-generating component. In at least one example, the housing can be thermally coupled to the heat-generating component.

In at least one example of the present disclosure, the heat sink can be a first heat sink. The housing can be a first housing. The heat-generating component can be a first-heat generating component. The printed circuit board can include a second heat-generating component. The head-mountable device can further include a second heat sink. In some examples, the fan assembly can include a second housing that can include the second heat sink. In at least one example, the second housing can be thermally coupled to the second heat-generating component.

In some examples, the first layer can be elastic. Conversely, the second layer can be non-elastic. Furthermore, the first layer can include a woven textile. In at least one example, the second layer can include a polymer.

In at least one example, a wearable device can include an outer frame. In some examples, the outer frame can define an external surface of the wearable device and an internal volume. An inner frame can be coupled to the outer frame at discrete points, and the inner frame can define a first aperture and a second aperture. In some examples, a curtain assembly can be coupled to the outer frame, where the curtain assembly can include an air-impermeable layer that can define the internal volume. Additionally, a metal heat sink can be disposed in the internal volume. In some examples, a printed circuit board can be disposed in the internal volume. A fan assembly can also be disposed in the internal volume. In some examples, the fan assembly can include a first metal housing aligned with the first aperture and thermally coupled to the printed circuit board and a second metal housing aligned with the second aperture and thermally coupled to the printed circuit board. In some examples, the first metal housing can define a first major plane and the second metal hosing can define a second major plane disposed non-parallel to the first major plane In at least one example, the outer frame can include a first material and the inner frame can include a second material different than the first material. In some examples, the second material can be stronger than the first material. Additionally, the first material can include a metal and the second material can include a magnesium alloy.

In some examples, the outer frame can define an intake port and an exhaust port. Furthermore, the outer frame can define an upper sidewall, where the upper sidewall can define the exhaust port and a lower sidewall opposite the upper sidewall. In at least one example, the lower sidewall can define the intake port.

In at least one example, the fan assembly can further include a first air mover disposed in the first metal housing and configured to draw air into the internal volume through the intake port and push the air out from the internal volume through the exhaust port. Additionally, the fan assembly can also include a second air mover disposed in the second metal housing and configured to draw air into the internal volume through the intake port and push the air out from the internal volume through the exhaust port.

BRIEF DESCRIPTION OF THE DRAWINGS

The disclosure will be readily understood by the following detailed description in conjunction with the accompanying drawings, wherein like reference numerals designate like structural elements, and in which:

I: Overall System

FIG. 1-1B illustrates rear, perspective view of an example of an HMD.

FIG. 1-2 illustrates an example of an HMD.

FIG. 1-3 illustrates a display module of an HMD.

FIG. 1-4 illustrates a display module of an HMD.

II: Cover Glass

Figures 1, 1A:
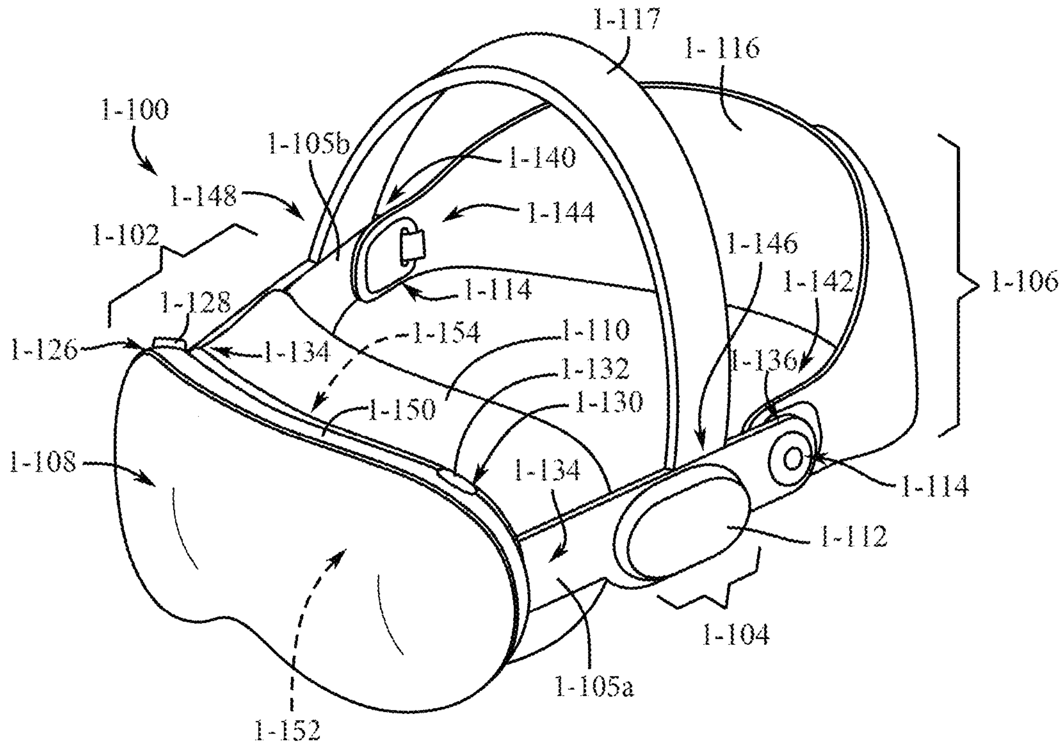
FIG. 1-1A illustrates a front, perspective view of an example of a head-mountable device (HMD).
Figures 1, 1B:
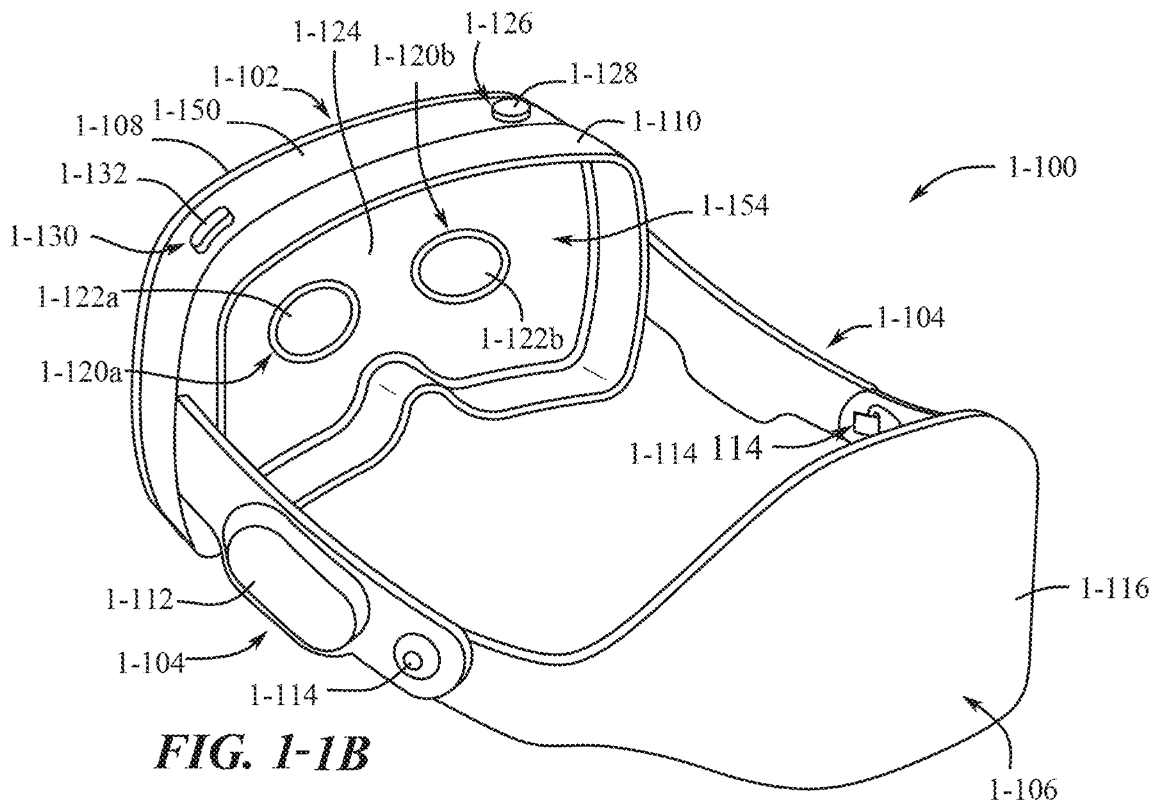
Figures 1, 2:
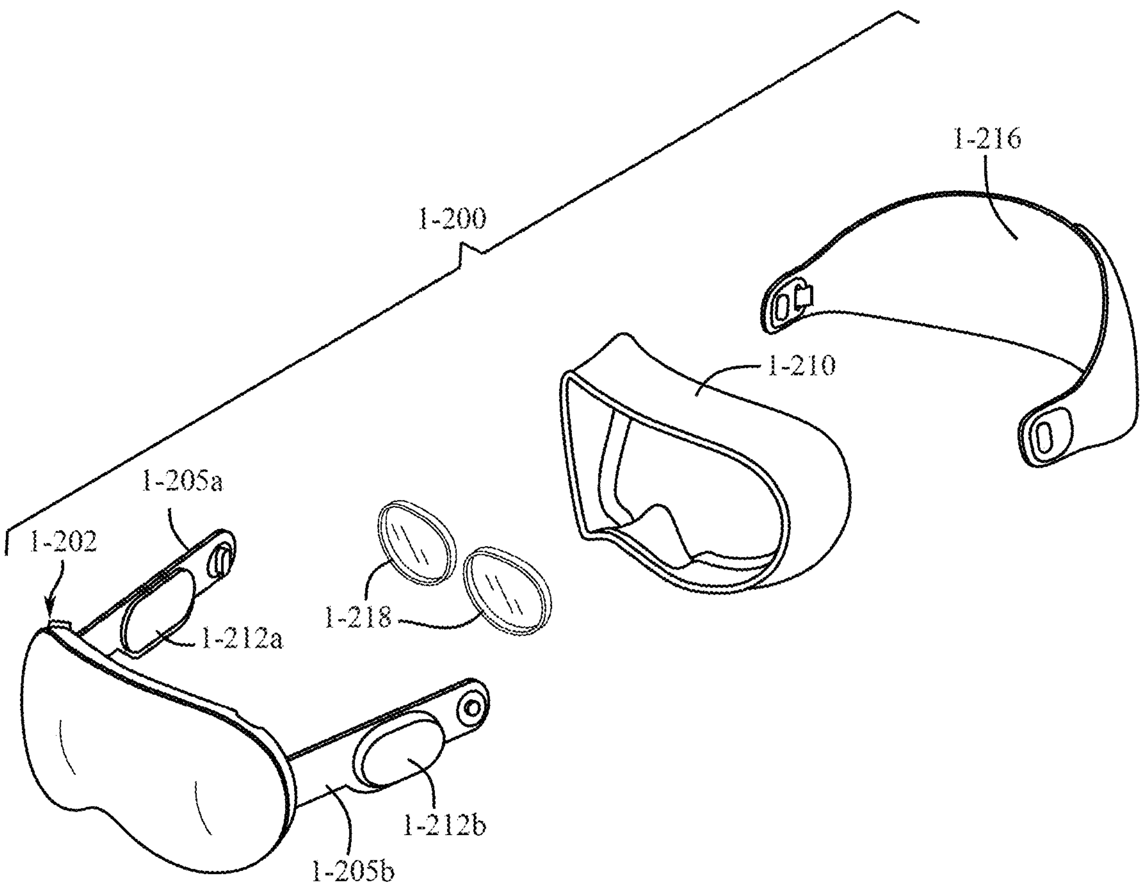

FIG. 2.0-1 illustrates a view of an example of an HMD.

2.1: Systems with Transparent Layers

FIG. 2.1-1 is a perspective view of an illustrative system with a transparent layer in accordance with an embodiment.

FIG. 2.1-2 is a cross-sectional side view of an illustrative transparent layer overlapping optical components that operate through the transparent layer.

FIG. 2.1-3 is a cross-sectional side view of an illustrative transparent layer in accordance with an embodiment.

2.2: Systems with Displays and Sensors

FIG. 2.2-1 is a side view of an illustrative electronic device such as a head-mounted device in accordance with an embodiment.

FIG. 2.2-2 is schematic diagram of an illustrative system with an electronic device in accordance with an embodiment.

FIG. 2.2-3 is a front view of an illustrative head-mounted device in accordance with an embodiment.

FIG. 2.2-4 is a cross-sectional top view of an illustrative head-mounted device in accordance with an embodiment.

FIG. 2.2-5A is a cross-sectional side view of an illustrative head-mounted device in accordance with an embodiment.

FIG. 2.2-5B is a cross-sectional side view of another illustrative head-mounted device in accordance with an embodiment.

FIG. 2.2-6 is a front view of an upper left portion of an illustrative head-mounted device with a publicly viewable display in accordance with an embodiment.

FIGS. 2.2-7, 2.2-8, 2.2-9, 2.2-10, 2.2-11, and 2.2-12 are front views of portions of an illustrative head-mounted device in accordance with embodiments.

FIG. 2.2-13 is a cross-sectional top view of a portion of an illustrative head-mounted device in accordance with an embodiment.

FIG. 2.2-14 is a cross-sectional side view of a portion of an illustrative head-mounted device with a display in accordance with an embodiment.

FIGS. 2.2-15, 2.2-16, and 2.2-17 are cross-sectional side views of illustrative display cover layers overlapping illustrative optical components in accordance with embodiments.

2.3: Systems with Supplemental Illumination

FIG. 2.3-1 is a cross-sectional side view of a portion of an illustrative electronic device with an environmental illumination system in accordance with an embodiment.

FIG. 2.3-2 is a top view of an illustrative electronic device with an environmental illumination system in accordance with an embodiment.

FIGS. 2.3-3, 2.3-4, 2.3-5, and 2.3-6 are cross-sectional side view of illustrative light sources for a supplemental illumination system in accordance with an embodiment.

FIGS. 2.3-7, 2.3-8, and 2.3-9 are graphs showing illustrative illumination patterns that may be produced by a supplemental illumination system in accordance with an embodiment.

FIG. 2.3-10 is a flow chart of illustrative operations involved in using an electronic device such as a head-mounted device with a supplemental illumination system in accordance with an embodiment.

2.4: Systems with Displays and Sensor-Hiding Structures

FIG. 2.4-1 is a front view of an illustrative head-mounted device in accordance with an embodiment.

2.5: Systems with Cover Layer Sealing Structures

FIG. 2.5-1 is a side view of an illustrative electronic device such as a head-mounted device in accordance with an embodiment.

FIG. 2.5-2 is schematic diagram of an illustrative system with an electronic device in accordance with an embodiment.

FIG. 2.5-3 is a front view of an illustrative head-mounted device in accordance with an embodiment.

FIG. 2.5-4 is a front view of an illustrative shroud in accordance with an embodiment.

FIG. 2.5-5 is a top view of a portion of an illustrative head-mounted device with a display, cover layer, and shroud in accordance with an embodiment.

FIG. 2.5-6 is a side view of an illustrative cover layer with encapsulation material that seals an edge surface of the cover layer and overlaps a laminate on the cover layer in accordance with an embodiment.

FIG. 2.5-7 is a side view of an illustrative cover layer with encapsulation material that seals an edge surface of the cover layer in accordance with an embodiment.

FIG. 2.5-8 is a side view of an illustrative cover layer having an edge surface that is spaced apart from a head-mounted device housing in accordance with an embodiment.

FIG. 2.5-9 is a side view of an illustrative cover layer with a bumper ring or overmold structure that seals an edge surface of the cover layer in accordance with an embodiment.

FIG. 2.5-10 is a side view of an illustrative cover layer with an upper laminate that wraps an edge surface of the cover layer in accordance with an embodiment.

FIG. 2.5-11 is a side view of an illustrative cover layer with a lower laminate that wraps an edge surface of the cover layer in accordance with an embodiment.

FIG. 2.5-12 is a side view of an illustrative cover layer and glue that fills a gap between an edge surface of the cover layer and a housing structure in accordance with an embodiment.

FIG. 2.5-13 is a side view of an illustrative cover layer with an upper laminate that extends over the cover layer to a housing structure to separate an edge surface of the cover layer from an exterior of the device in accordance with an embodiment.

FIG. 2.5-14 is a side view of an illustrative cover layer and a lip formed from a shroud or housing member that overlaps an edge portion of the cover layer in accordance with an embodiment.

FIG. 2.5-15 is a side view of an illustrative cover layer and a lip formed from a shroud or housing member that overlaps an edge portion of the cover layer, along with an upper laminate that wraps around the edge portion in accordance with an embodiment.

2.6: Electronic Devices with Antennas and Optical Components

FIG. 2.6-1 is a top view of a head-mounted device.

FIG. 2.6-2 is a rear view of a head-mounted device.

FIG. 2.6-3 is a schematic diagram of a head-mounted device.

FIG. 2.6-4 is a view of a portion of a head-mounted device with a head-mounted housing frame and a camera support member.

FIG. 2.6-5 is a front view of a portion of a head-mounted device with a camera support structure.

FIG. 2.6-6 is a cross-sectional side view of a portion of a head-mounted device with a camera support structure.

FIG. 2.6-7 is a schematic diagram of wireless communications circuitry.

FIG. 2.6-8 is a diagram of an antenna.

FIGS. 2.6-9, 2.6-10, 2.6-11, and 2.6-12 are cross-sectional side views of portions of a support structure, such as a camera support structure with antennas.

FIG. 2.6-13 is a top view of a camera support structure.

FIG. 2.6-14 is a cross-sectional side view of a camera support structure.

FIG. 2.6-15 is a cross-sectional side view of a portion of a camera support structure with a bend sensor to detect camera misalignment.

FIG. 2.6-16 is a cross-sectional side view of a portion of a camera support structure with an adjustable-orientation camera.

III: Display Integration Assembly

Figures 1, 2, 3:
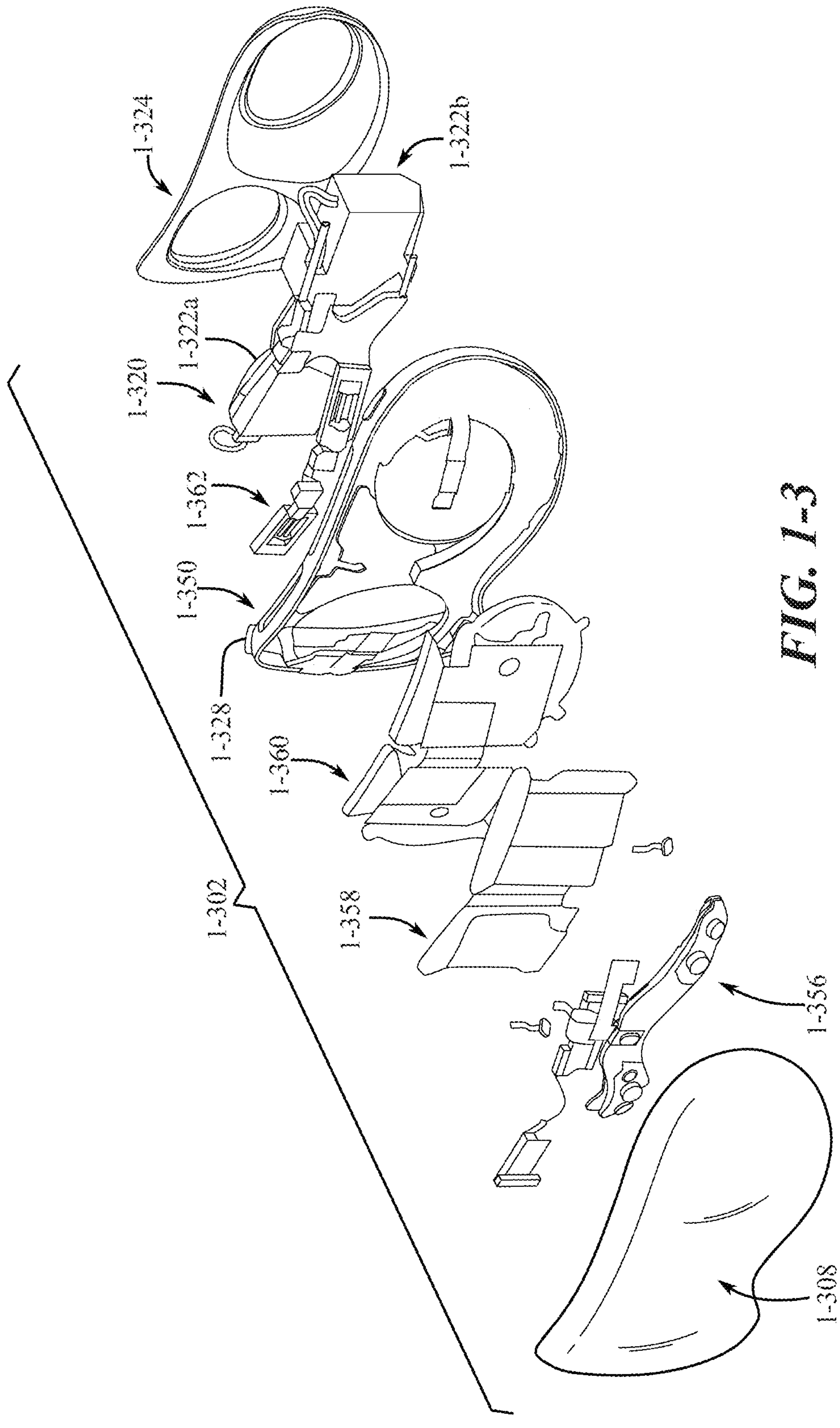

FIG. 3-1 is a view of a display and front-cover assembly of an HMD.

FIG. 3-2 is a cross-sectional view of a portion of a display assembly of an example HMD.

FIG. 3-3 is a side view of an example of a display assembly of an HMD.

Figures 1, 2, 3, 4:
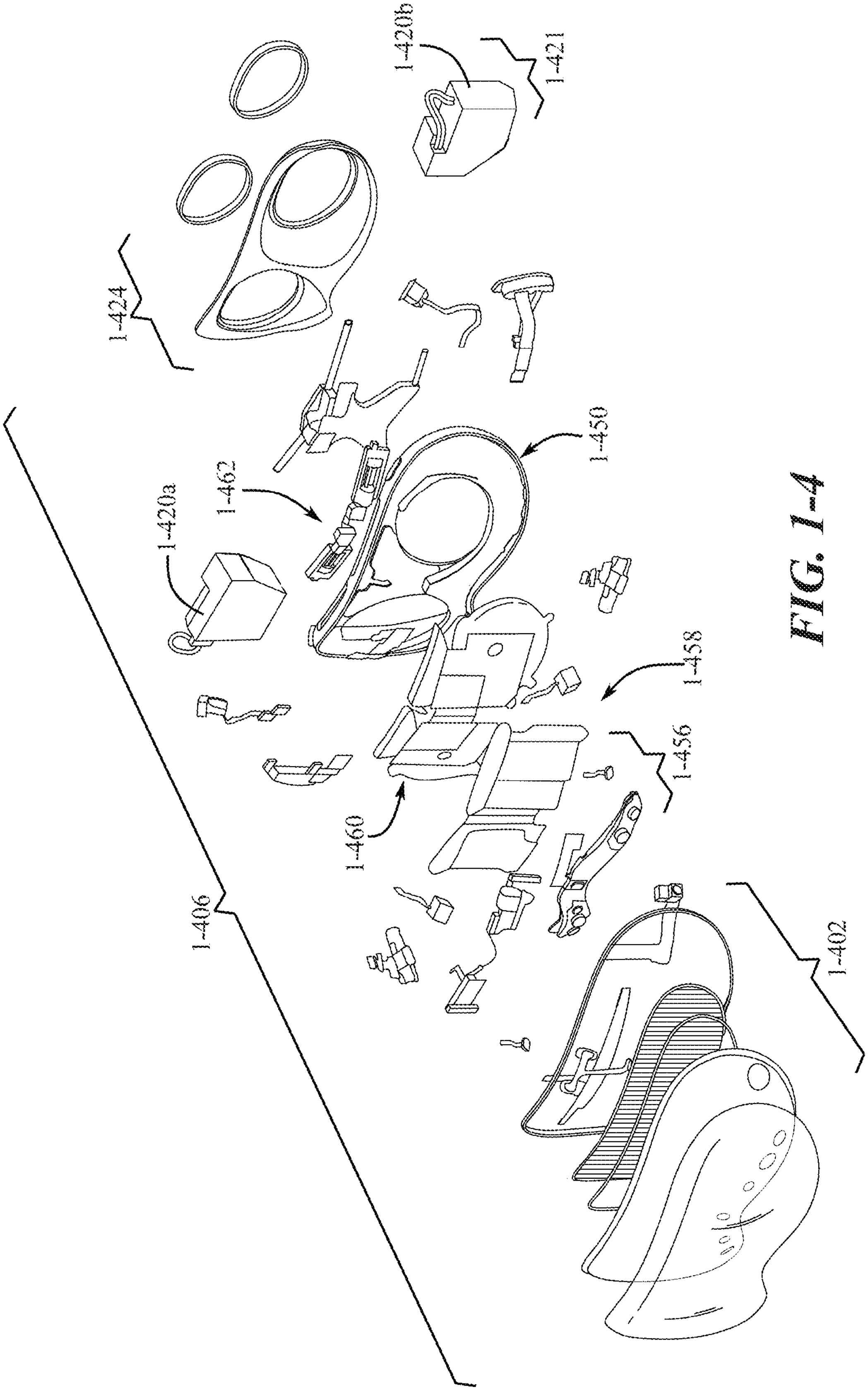

FIG. 3-4 is a side cross-sectional view of a portion of a display assembly of an example HMD.

Figures 1, 3:
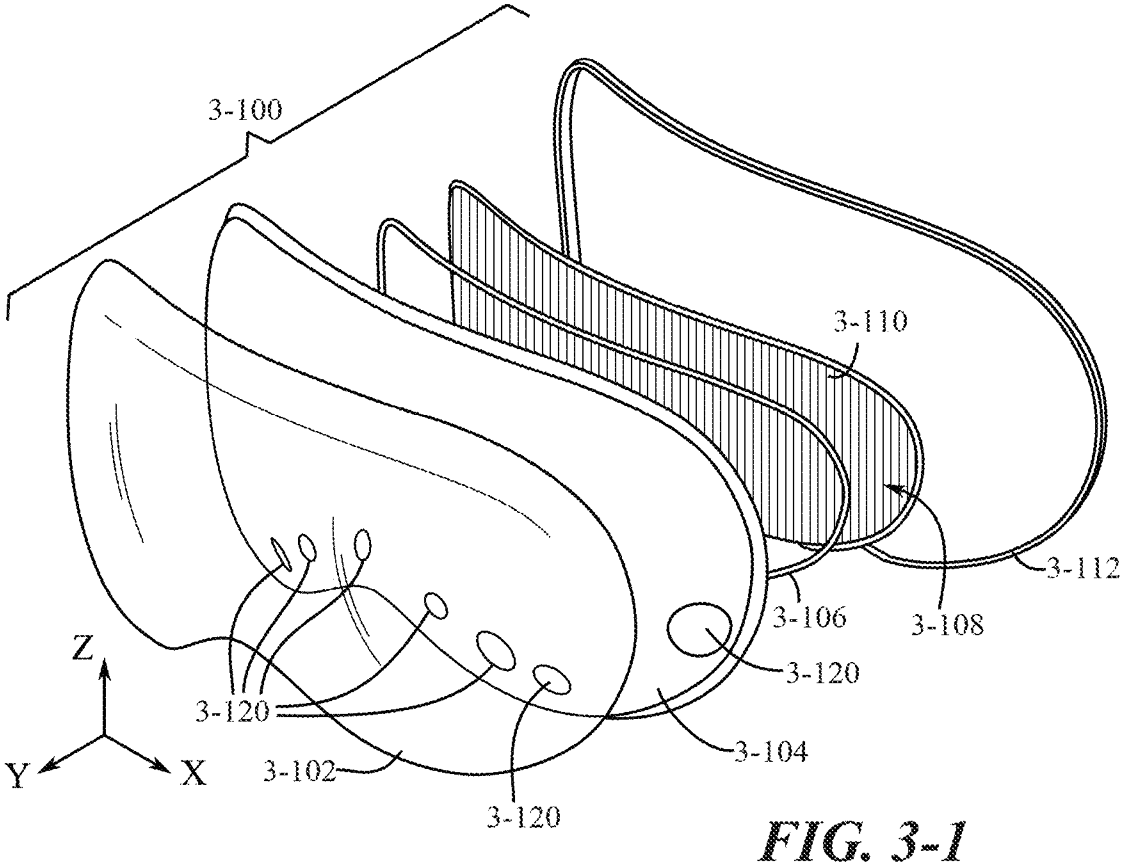
Figures 2, 3:
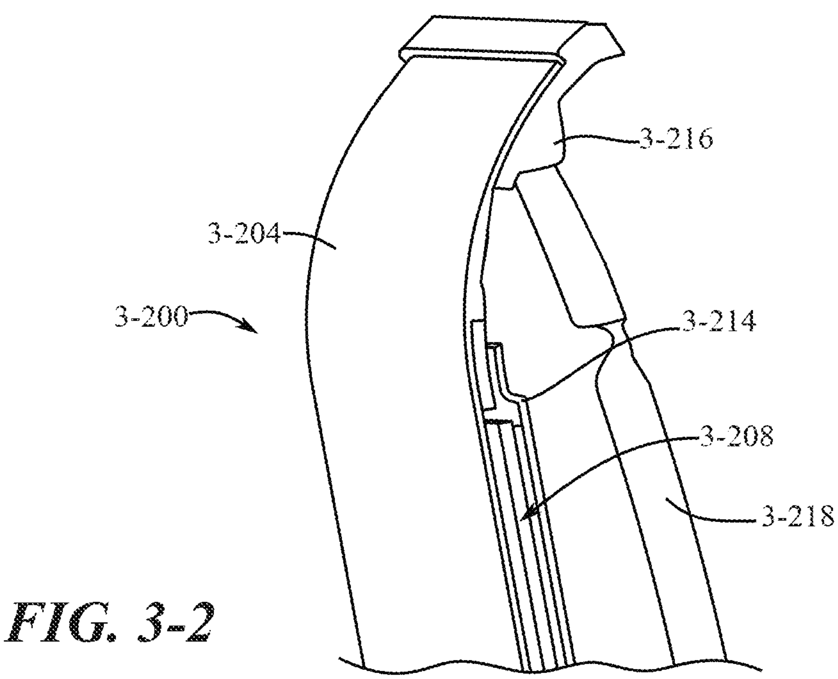
Figure 3:
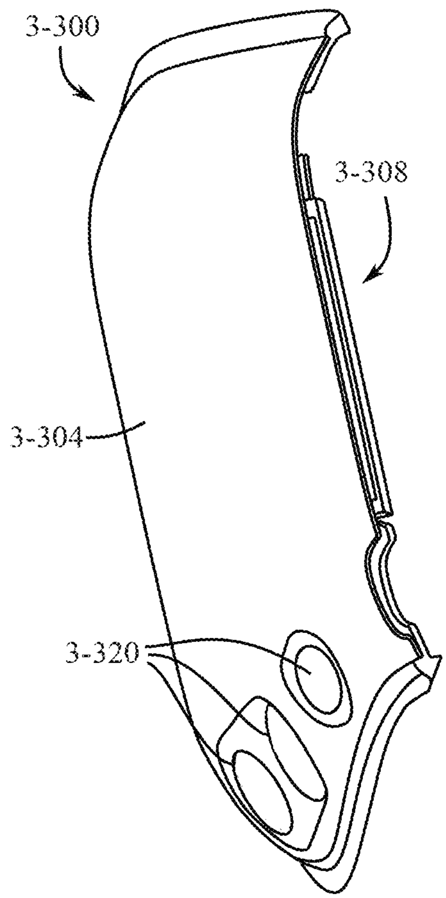
Figures 3, 4:
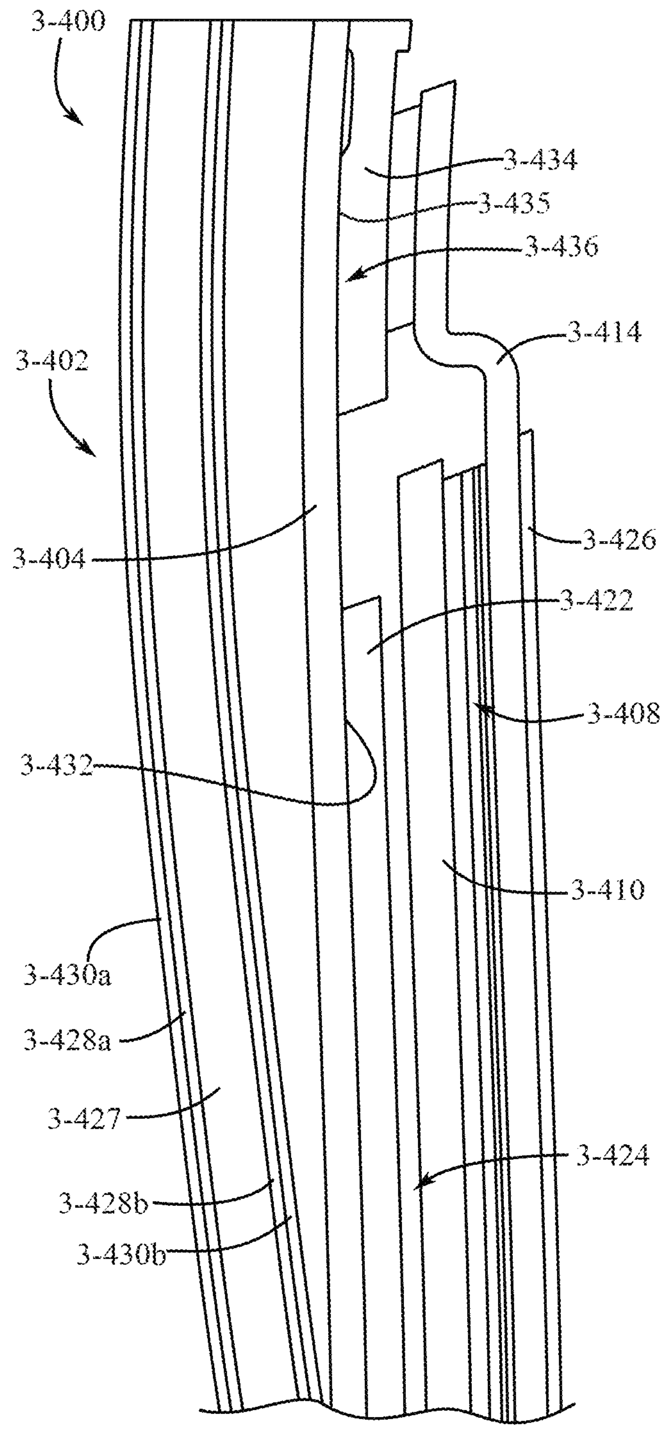
Figures 3, 4, 4A:
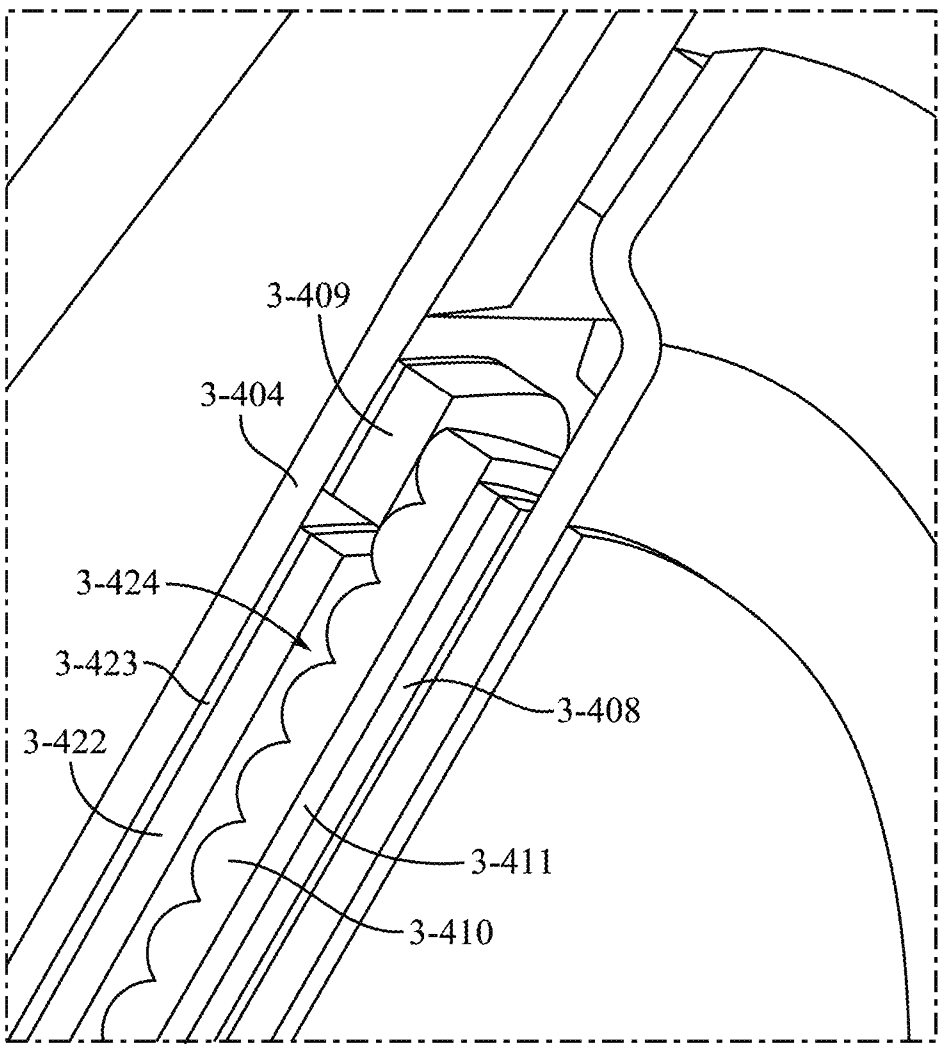

FIG. 3-4A is a side cross-sectional view of a portion of a display assembly of an example HMD.

Figures 3, 4, 4B:
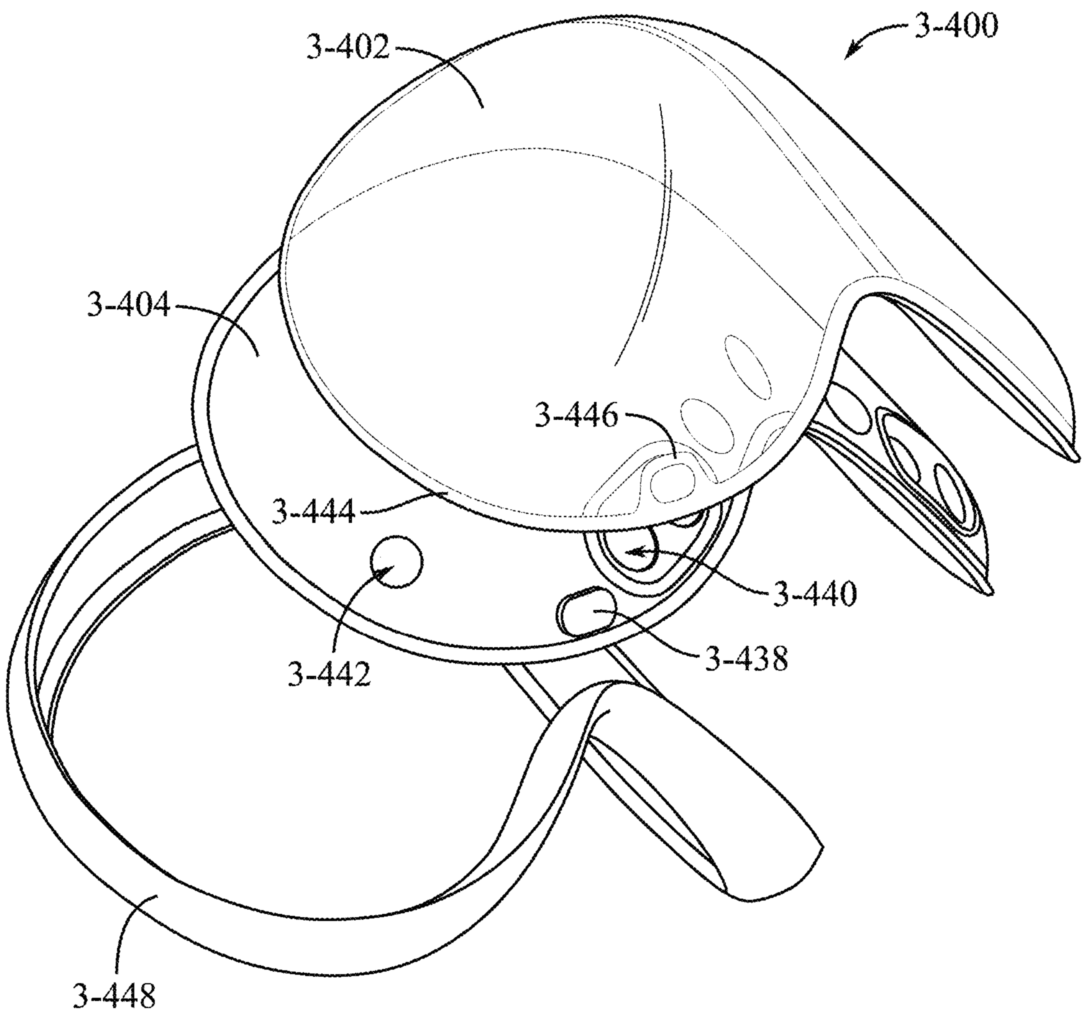

FIG. 3-4B is a perspective cross-sectional view of a portion of a display assembly of an example HMD.

Figures 3, 4, 4C:
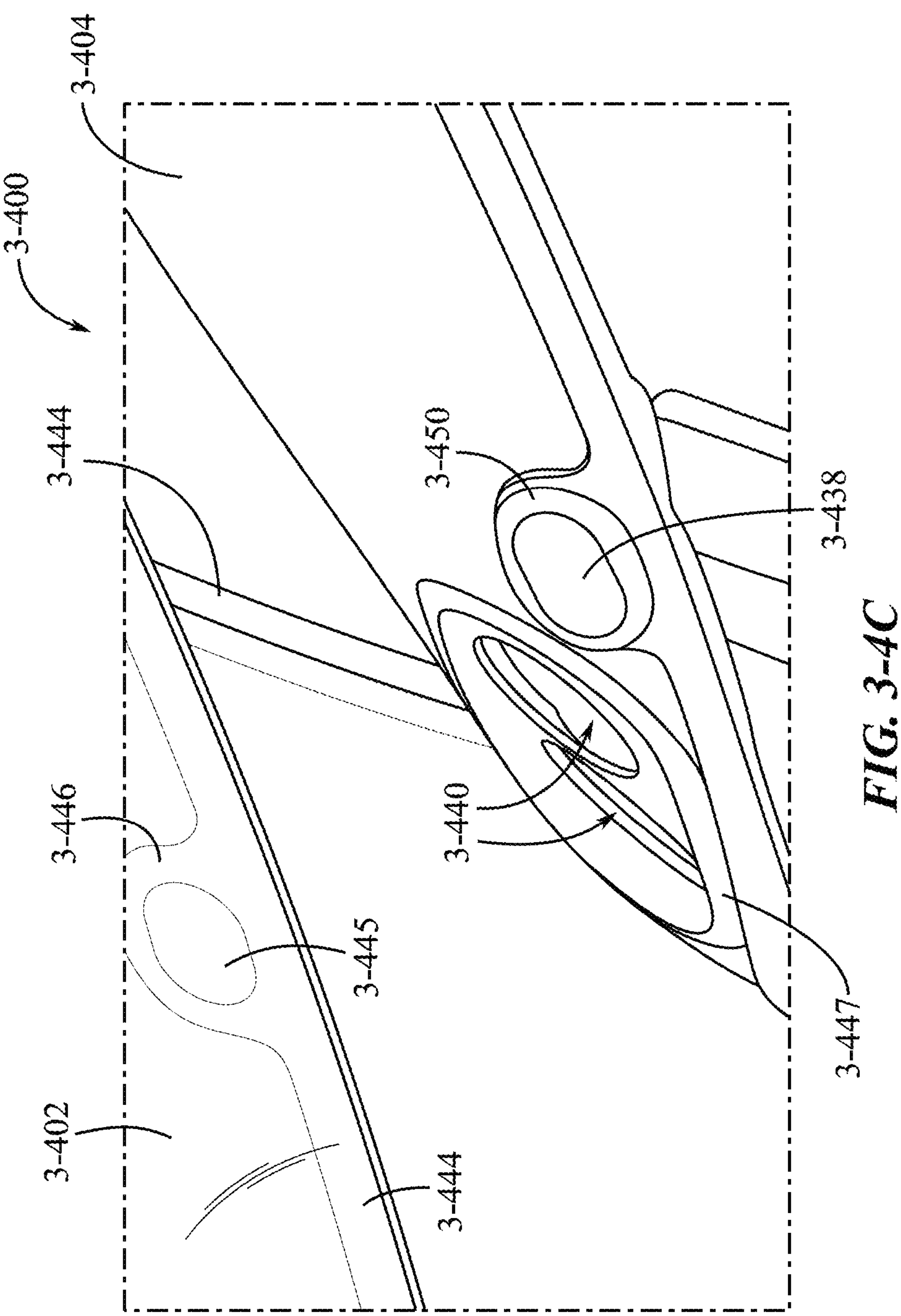

FIG. 3-4C is a perspective cross-sectional view of a portion of a display assembly of an example HMD.

Figures 3, 4, 5, 6:
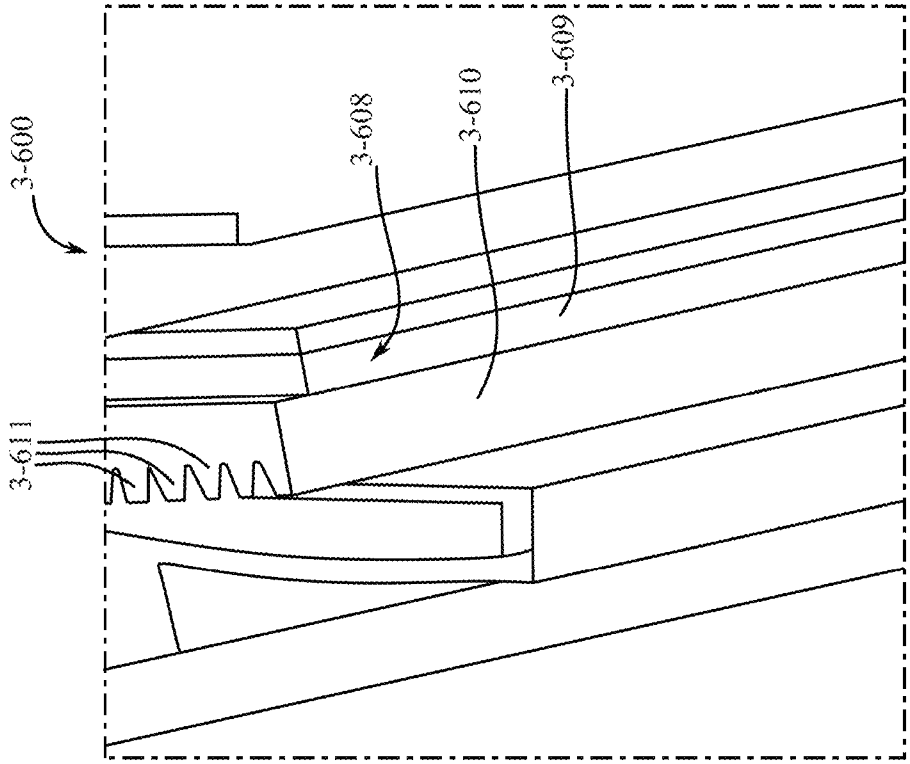
Figures 3, 4, 5:
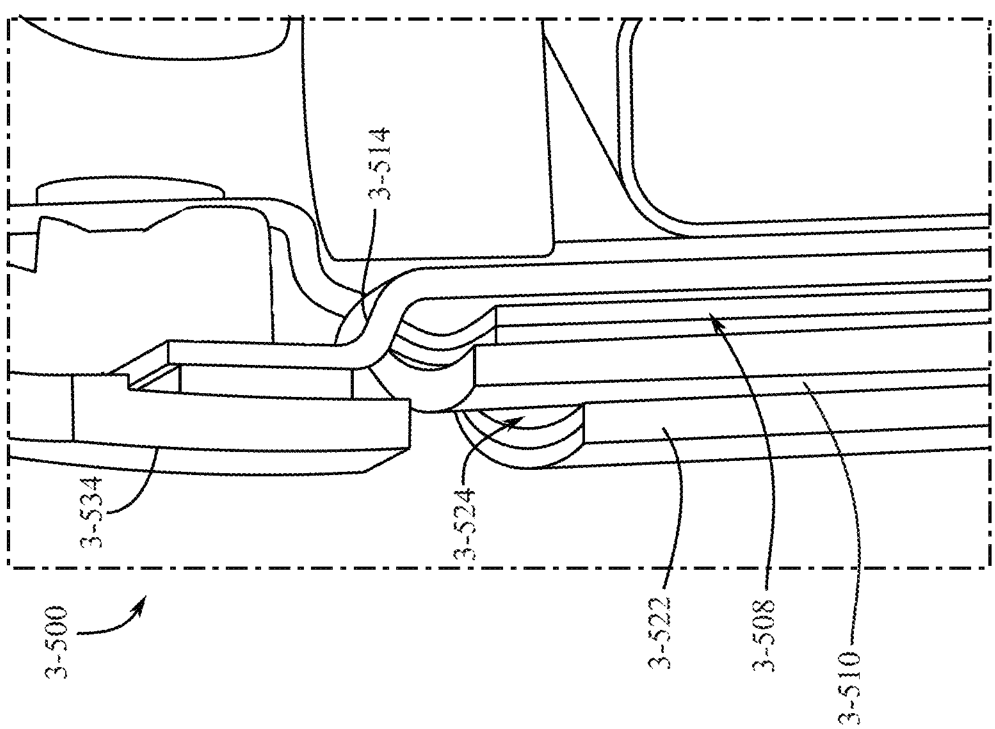

FIG. 3-5 is a perspective cross-sectional view of a portion of a display assembly of an example HMD.

FIG. 3-6 is a perspective cross-sectional view of a portion of a display assembly of an example HMD.

IV: Shroud

4.0: Systems with Displays and Sensor-Hiding Structures

FIG. 4-1 is a front view of an illustrative shroud in accordance with an embodiment.

FIG. 4-2 is a front view of a portion of an illustrative shroud with a curved periphery in accordance with an embodiment.

FIG. 4-3 is a front view of a portion of an illustrative forward-facing display in accordance with an embodiment.

FIG. 4-4 is a cross-sectional top view of a portion of an illustrative display in accordance with an embodiment.

FIG. 4-5 is a cross-sectional top view of a portion of an illustrative head-mounted device with a display and shroud in accordance with an embodiment.

FIG. 4-6 is a cross-sectional side view of a portion of an illustrative shroud with a through-hole opening to accommodate an optical component in accordance with an embodiment.

FIG. 4-7 is a cross-sectional side view of a portion of an illustrative shroud with a window member in a through-hole opening in accordance with an embodiment.

FIG. 4-8 is a cross-sectional side view of a portion of a head-mounted device with a shroud covering a display in accordance with an embodiment.

FIG. 4-9 is a cross-sectional side view of an illustrative head-mounted device optical component mounting arrangement with an optical component window coating in accordance with an embodiment.

FIG. 4-10 is a cross-sectional side view of an illustrative head-mounted device optical component mounting arrangement using shroud through-hole openings in accordance with an embodiment.

FIG. 4-11 is a cross-sectional side view of an illustrative head-mounted device optical component mounting arrangement with a window formed from a transparent window member such as a layer of glass or clear polymer with a coating in accordance with an embodiment.

4.1: System with Cover Layer Sealing Structures

FIG. 4.1-1 is a side view of an illustrative electronic device such as a head-mounted device in accordance with an embodiment.

FIG. 4.1-2 is schematic diagram of an illustrative system with an electronic device in accordance with an embodiment.

FIG. 4.1-3 is a front view of an illustrative head-mounted device in accordance with an embodiment.

FIG. 4.1-4 is a front view of an illustrative shroud in accordance with an embodiment.

FIG. 4.1-5 is a top view of a portion of an illustrative head-mounted device with a display, cover layer, and shroud in accordance with an embodiment.

FIG. 4.1-6 is a side view of an illustrative cover layer with encapsulation material that seals an edge surface of the cover layer and overlaps a laminate on the cover layer in accordance with an embodiment.

FIG. 4.1-7 is a side view of an illustrative cover layer with encapsulation material that seals an edge surface of the cover layer in accordance with an embodiment.

FIG. 4.1-8 is a side view of an illustrative cover layer having an edge surface that is spaced apart from a head-mounted device housing in accordance with an embodiment.

FIG. 4.1-9 is a side view of an illustrative cover layer with a bumper ring or overmold structure that seals an edge surface of the cover layer in accordance with an embodiment.

FIG. 4.1-10 is a side view of an illustrative cover layer with an upper laminate that wraps an edge surface of the cover layer in accordance with an embodiment.

FIG. 4.1-11 is a side view of an illustrative cover layer with a lower laminate that wraps an edge surface of the cover layer in accordance with an embodiment.

FIG. 4.1-12 is a side view of an illustrative cover layer and glue that fills a gap between an edge surface of the cover layer and a housing structure in accordance with an embodiment.

FIG. 4.1-13 is a side view of an illustrative cover layer with an upper laminate that extends over the cover layer to a housing structure to separate an edge surface of the cover layer from an exterior of the device in accordance with an embodiment.

FIG. 4.1-14 is a side view of an illustrative cover layer and a lip formed from a shroud or housing member that overlaps an edge portion of the cover layer in accordance with an embodiment.

FIG. 4.1-15 is a side view of an illustrative cover layer and a lip formed from a shroud or housing member that overlaps an edge portion of the cover layer, along with an upper laminate that wraps around the edge portion in accordance with an embodiment.

FIG. 4.1-16 and 4.1-17 are side views of illustrative cover layers with upper and lower laminates in accordance with some embodiments.

FIG. 4.1-18 is a side view of an illustrative cover layer with a laminate and a seal that covers an edge of the laminate in accordance with some embodiments.

V: Dust Seal

5.1: Seal for an Electronic Device

FIG. 5-1 shows a cross-sectional view of a portion of an electronic device, according to an example;

FIG. 5-2 shows a cross-sectional view of a seal, according to an example;

FIG. 5-3 shows a cross-sectional view of an electronic device, according to an example;

FIG. 5-4A shows a top perspective view of an electronic component and a seal, according to an example;

FIG. 5-4B shows a cross-sectional view of a portion of an electronic device, according to an example; and FIG. 5-4C shows a cross-sectional view of a portion of an electronic device, according to an example.

VI: Sensor System

Figures 0, 6:
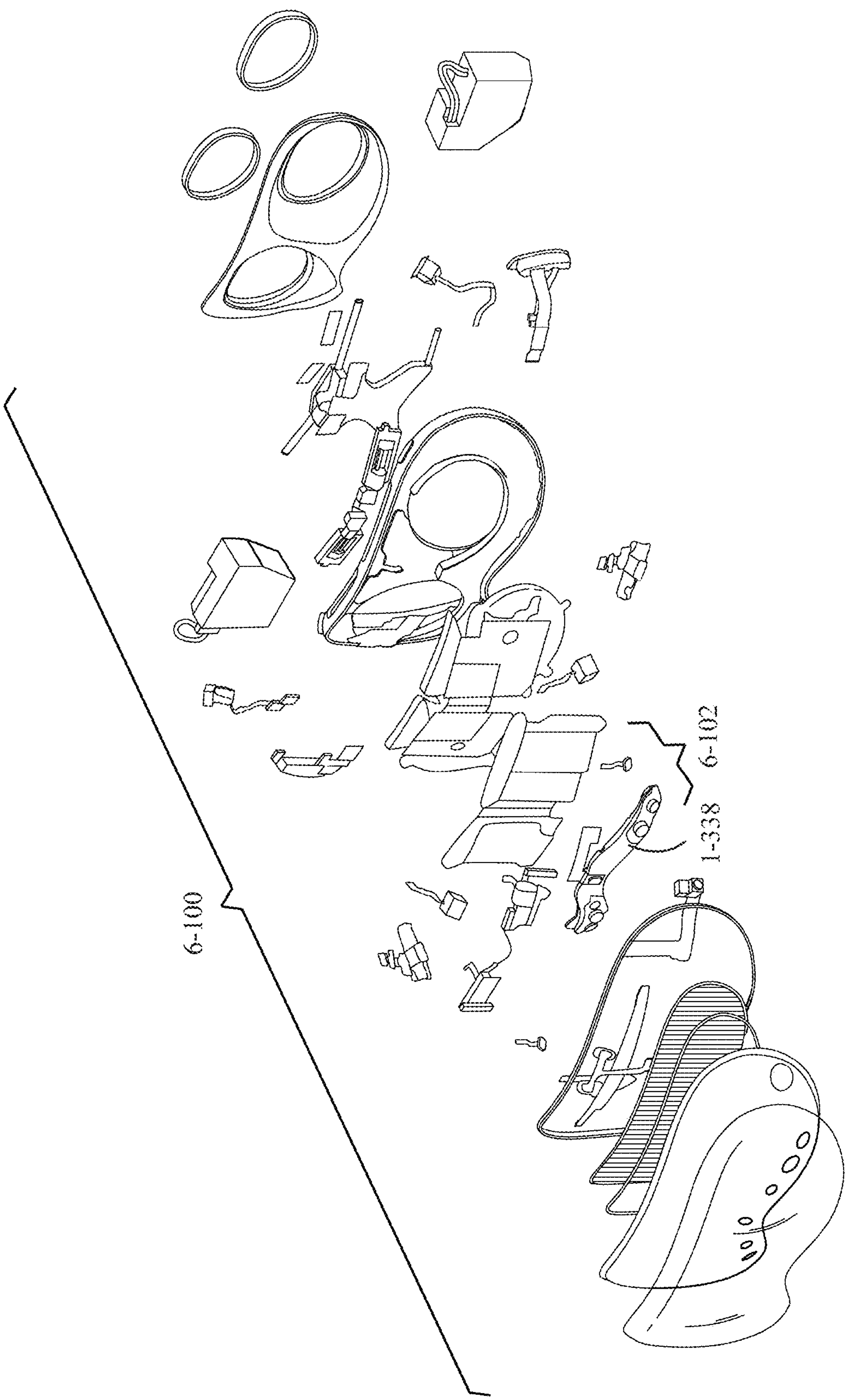
Figures 1, 6:
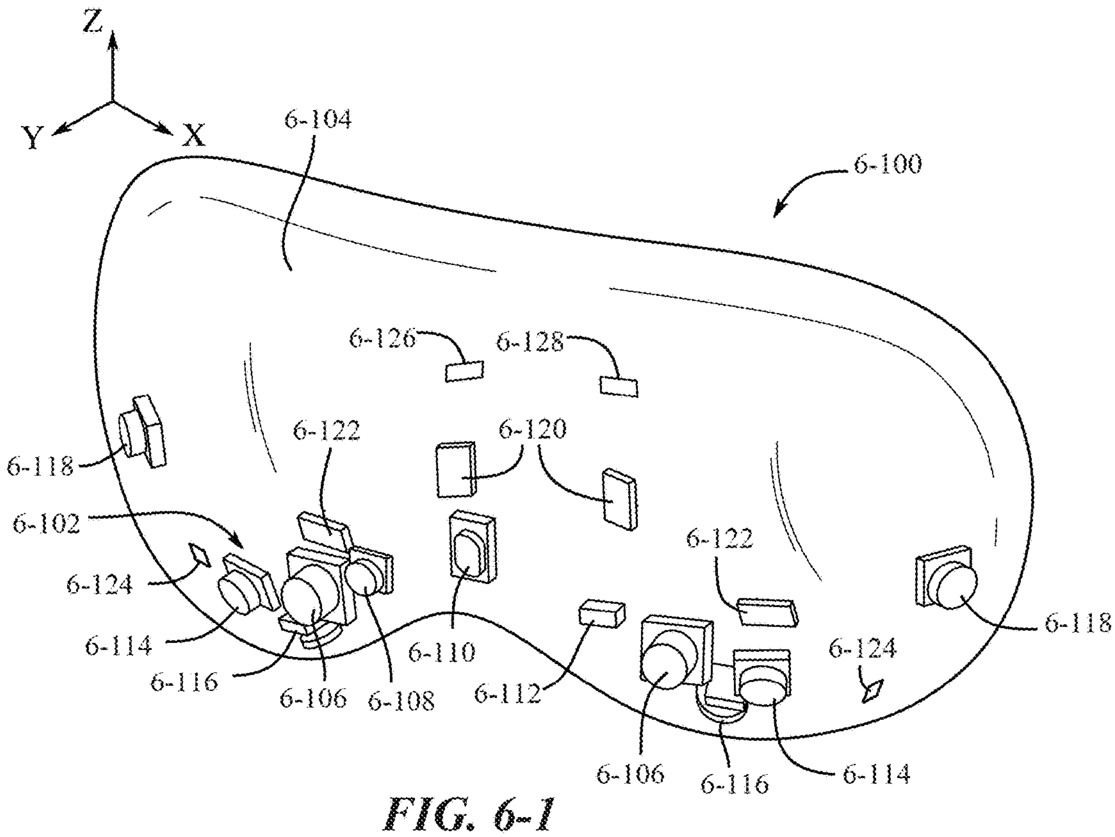
Figures 2, 6:
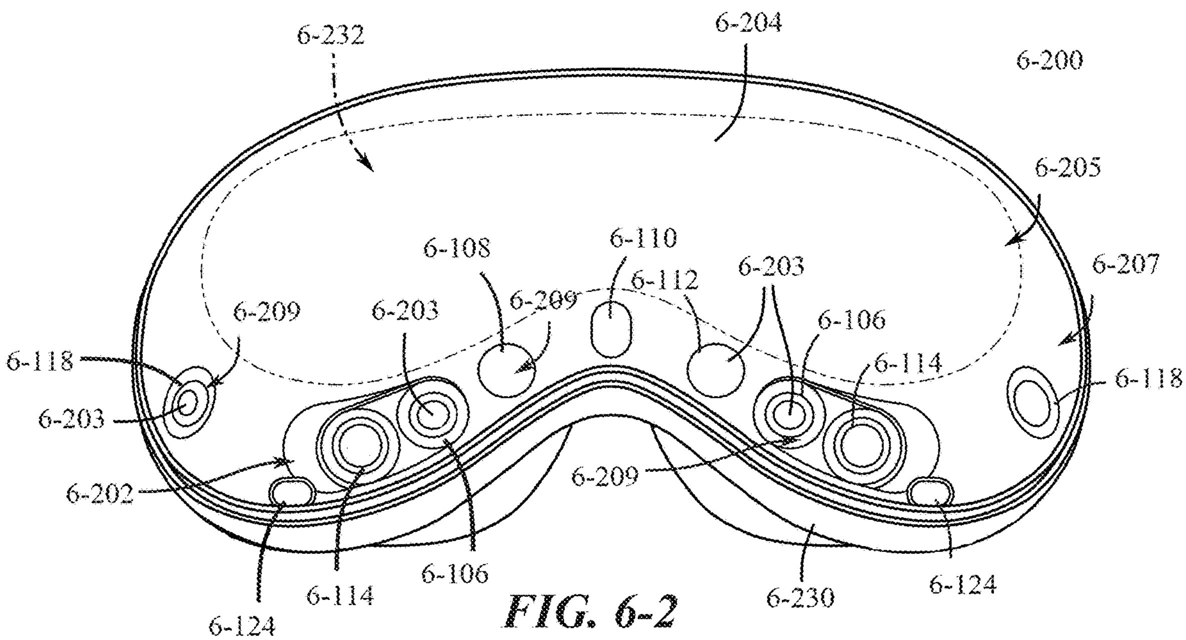
Figures 3, 6:
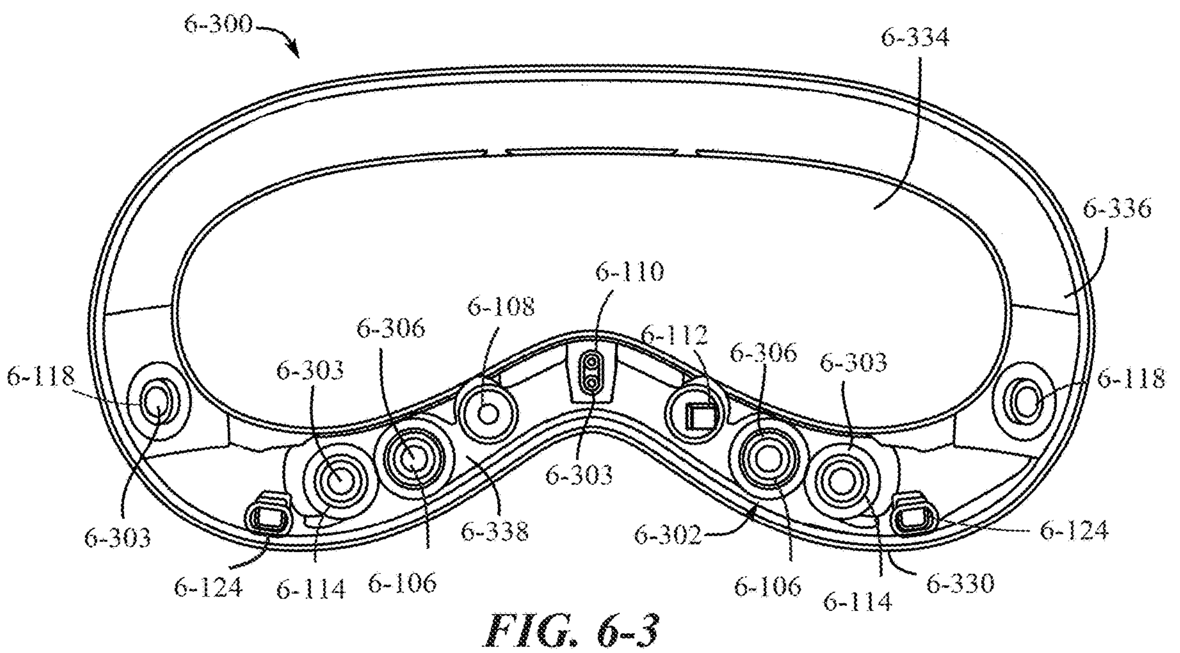
Figures 4, 6:
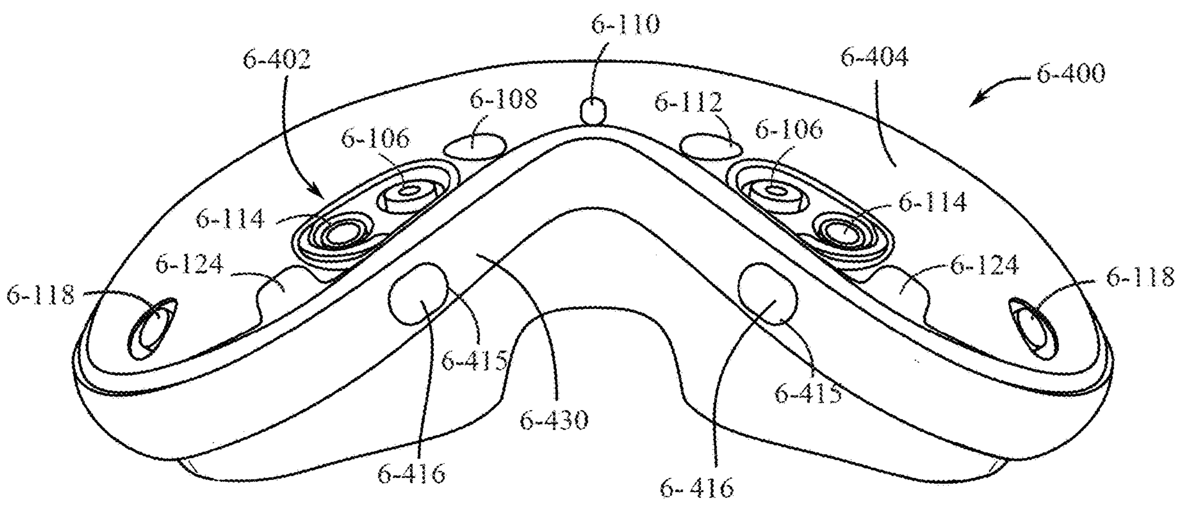
Figures 0, 8:
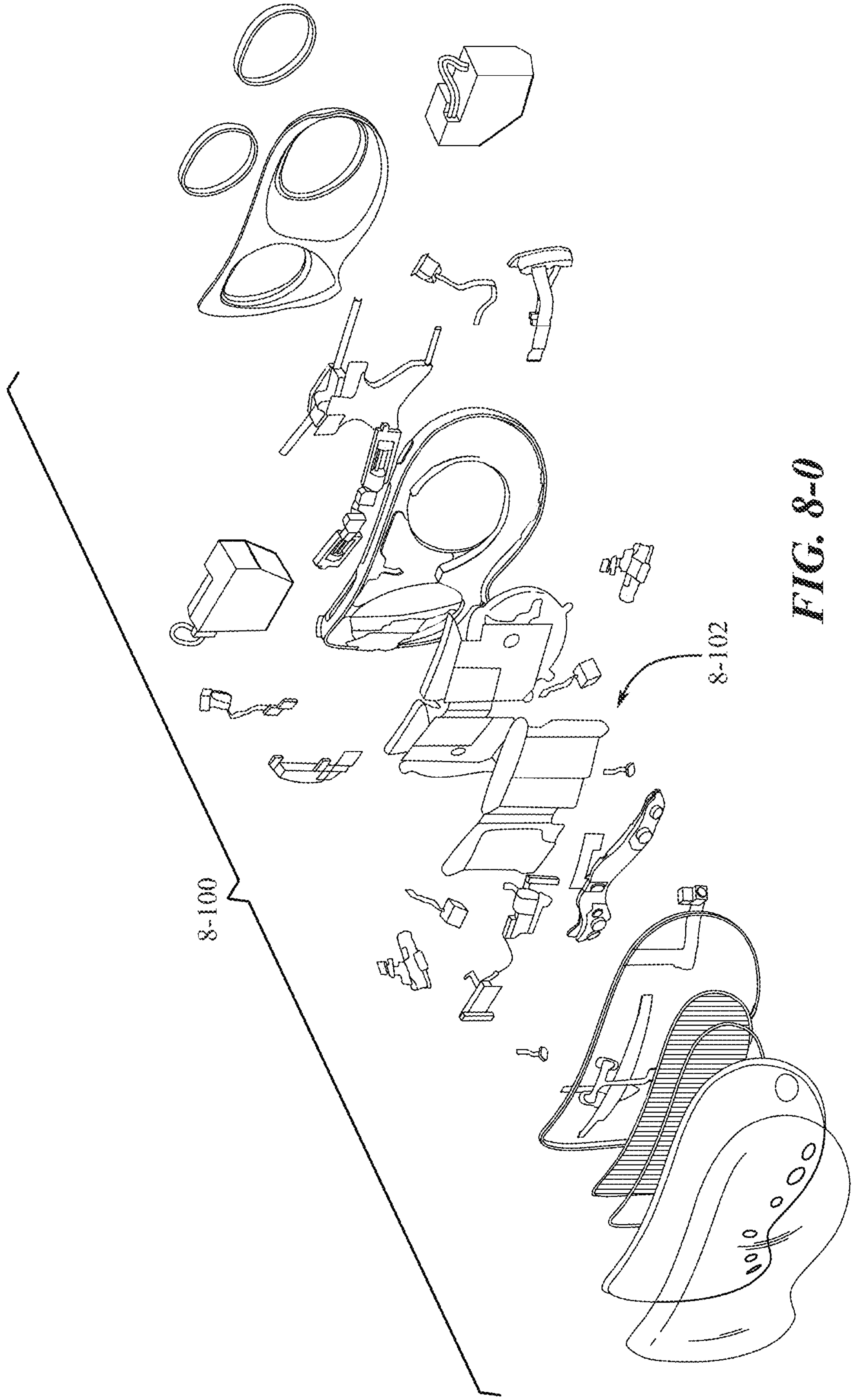
Figures 1, 8:
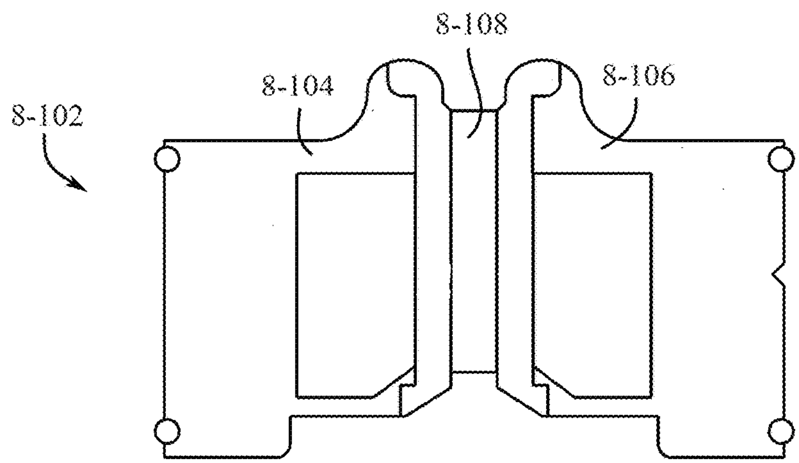
Figures 2, 8:
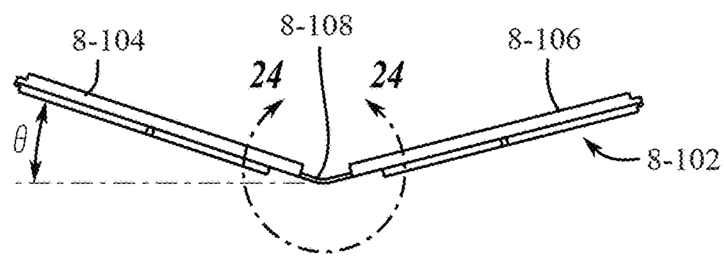
Figures 3, 8:
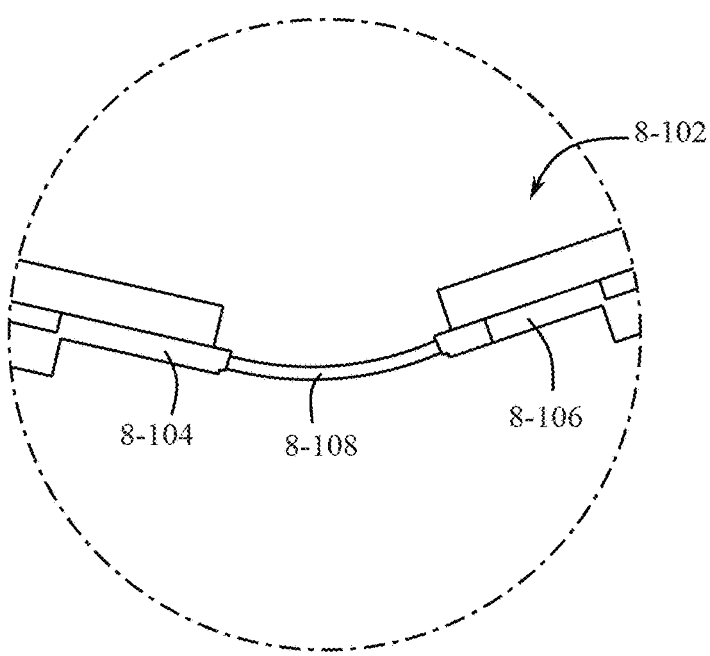
Figures 4, 8:
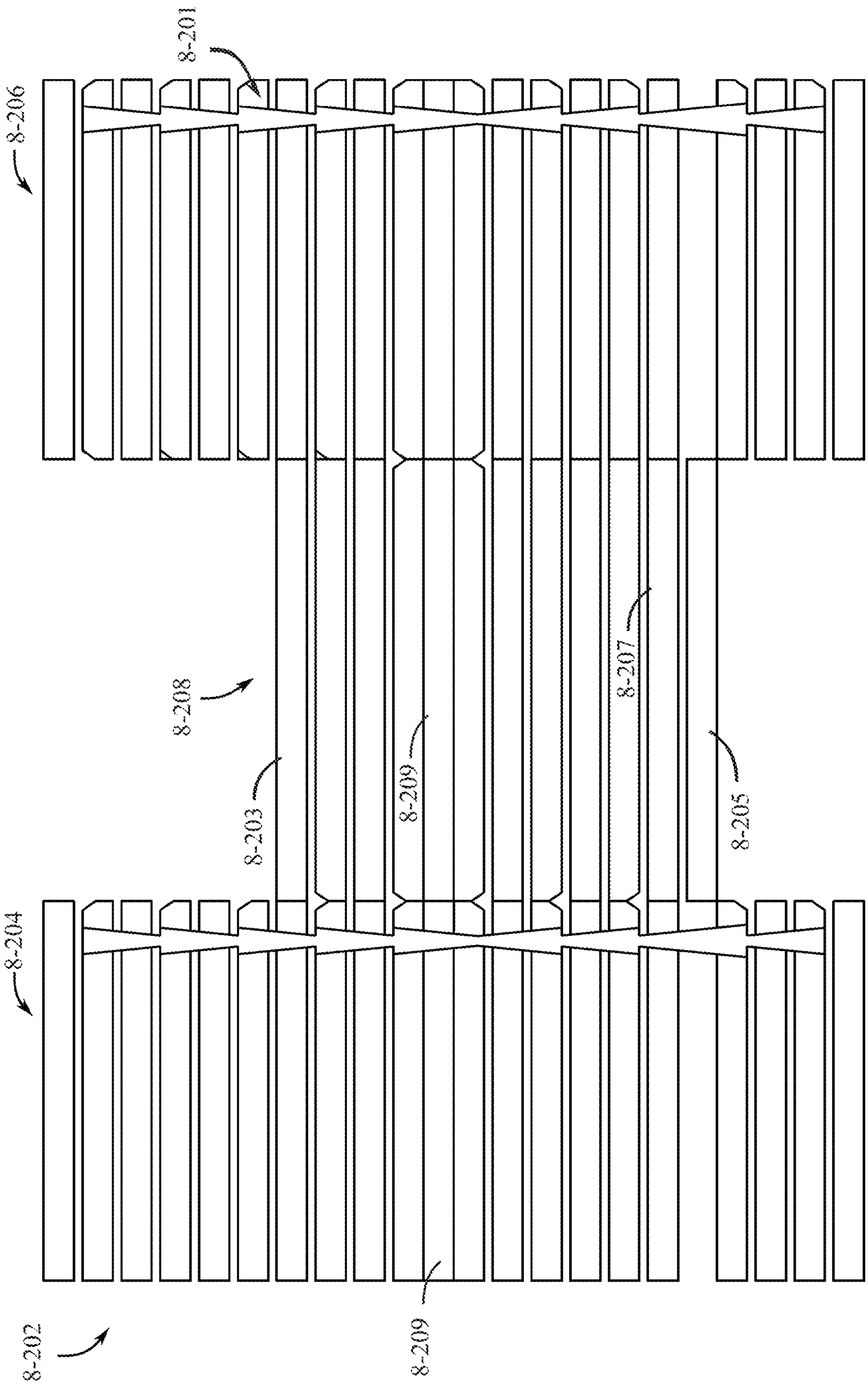
Figures 5, 8:
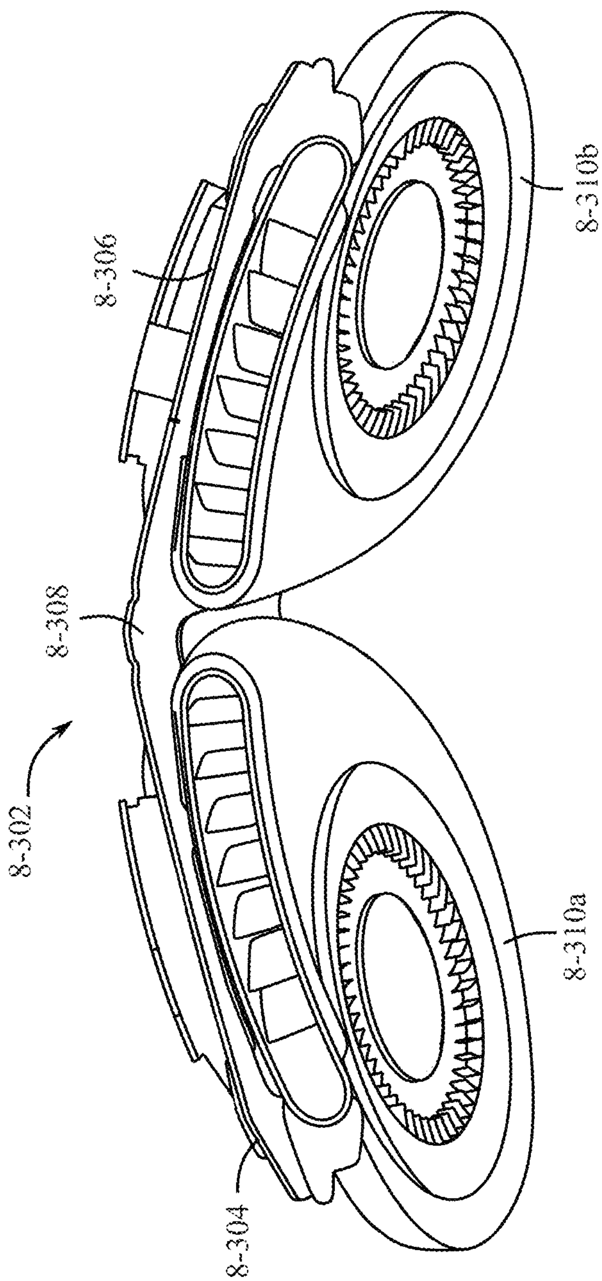
Figures 0, 10:
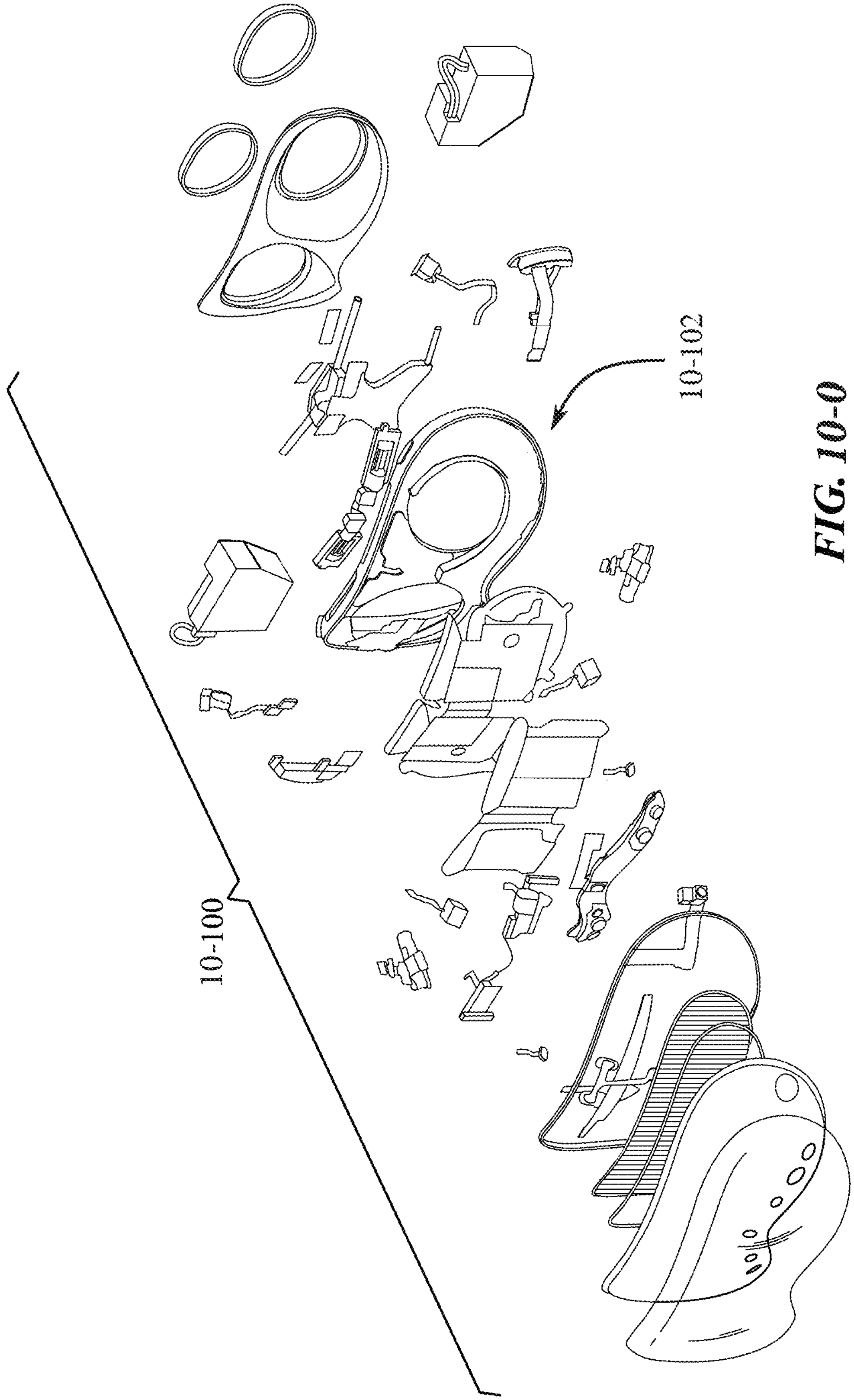
Figures 1, 10:
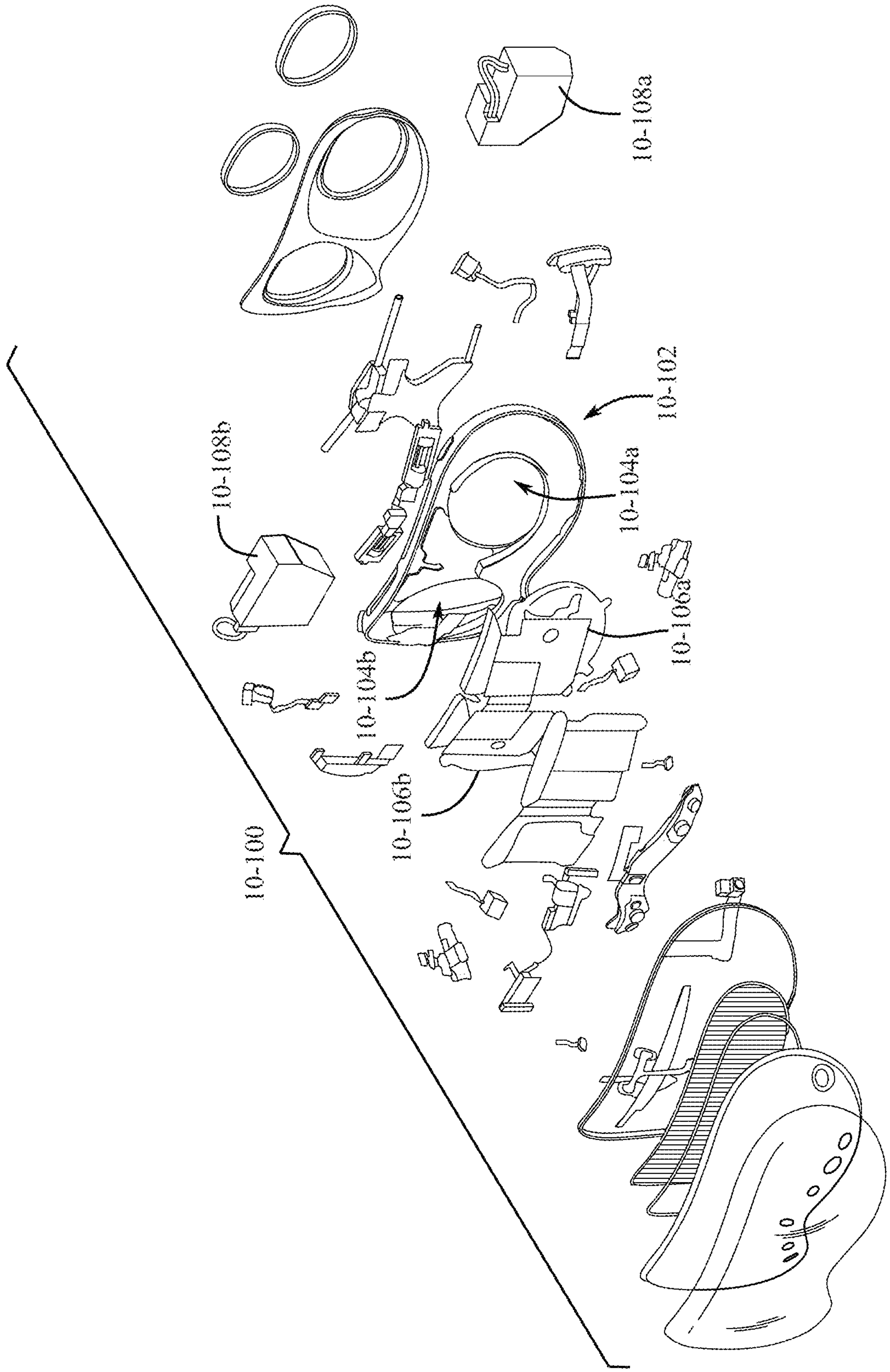
Figures 2, 10:
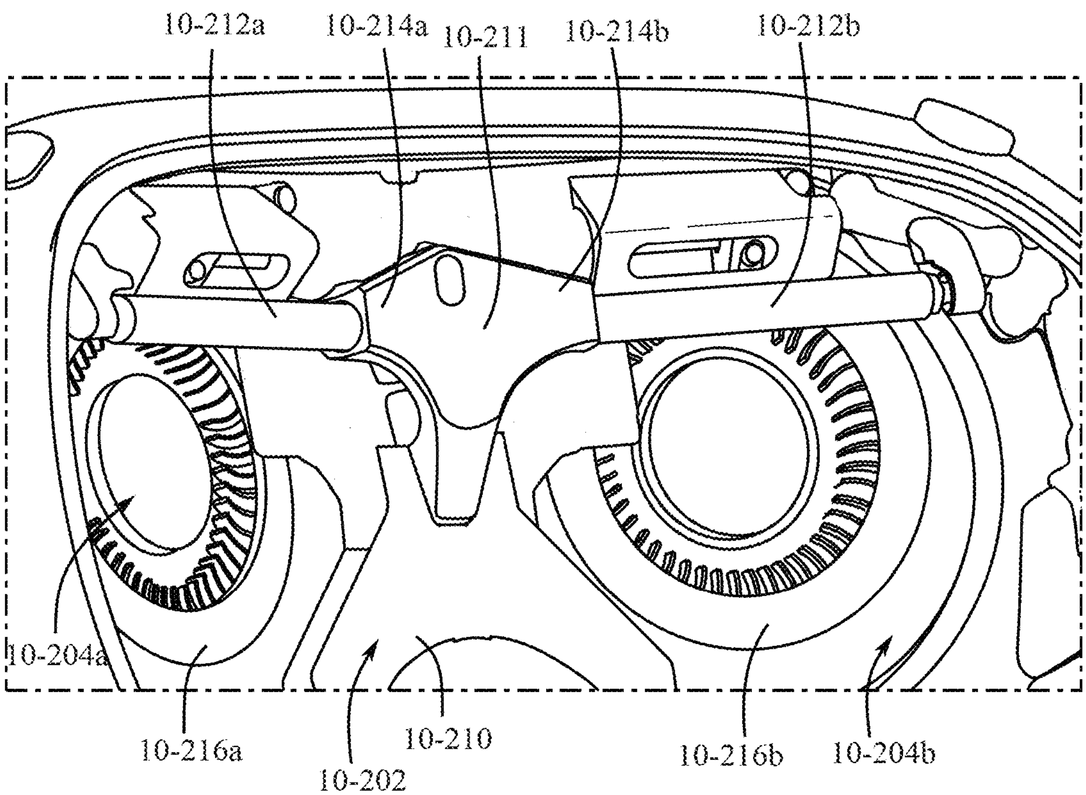
Figures 3, 10:
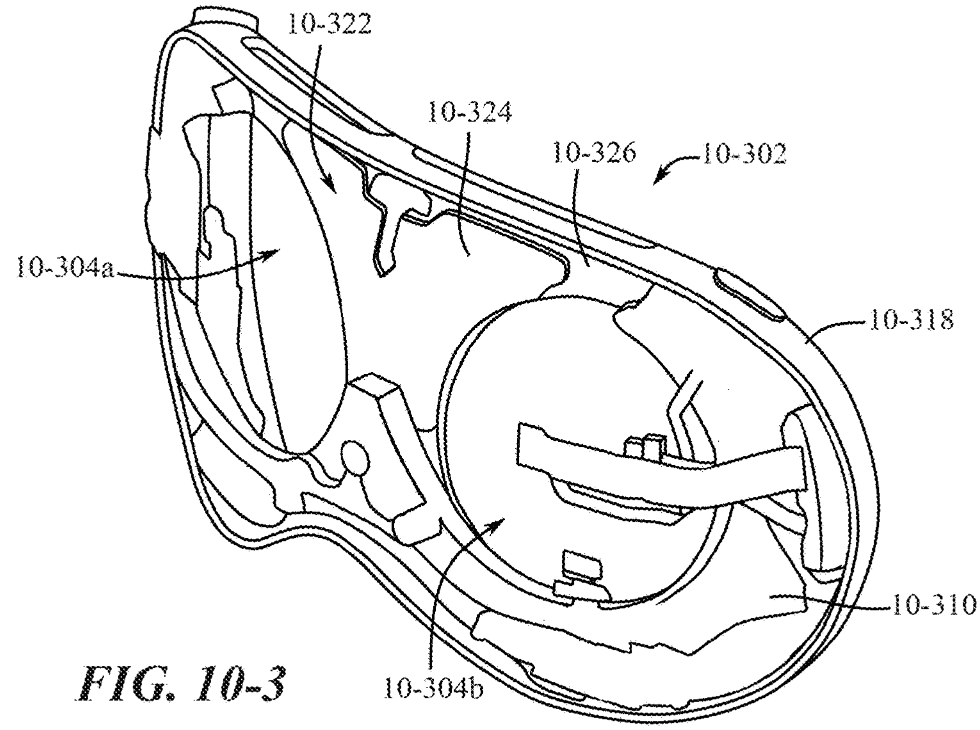
Figures 4, 10:
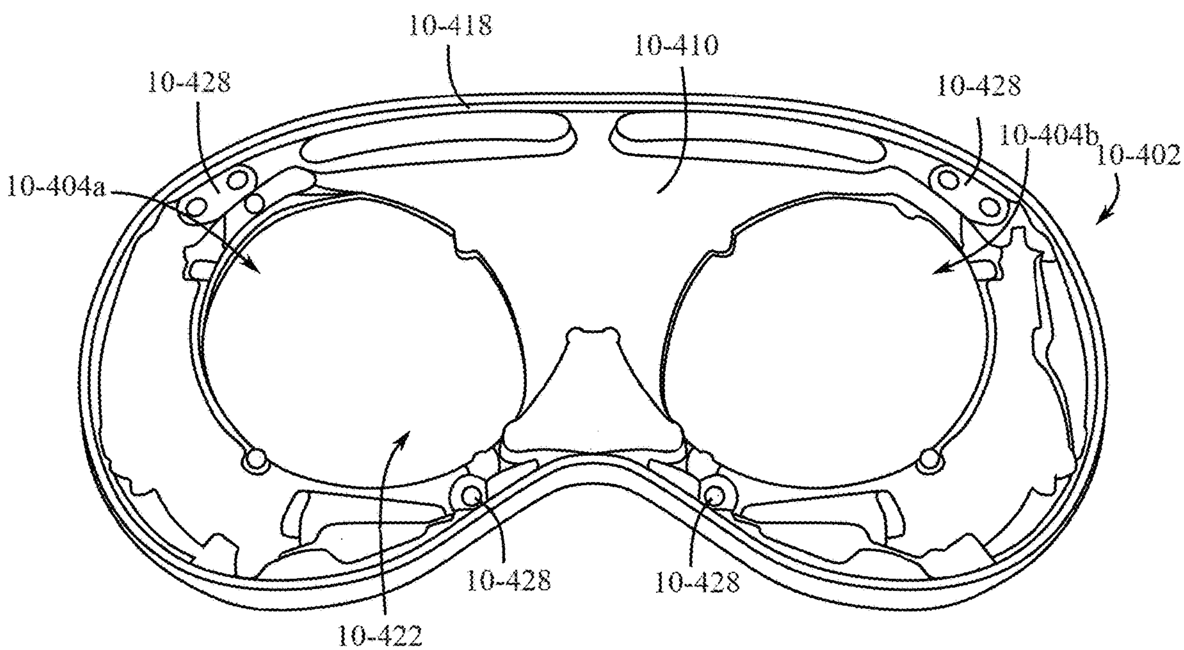
Figures 5, 10:
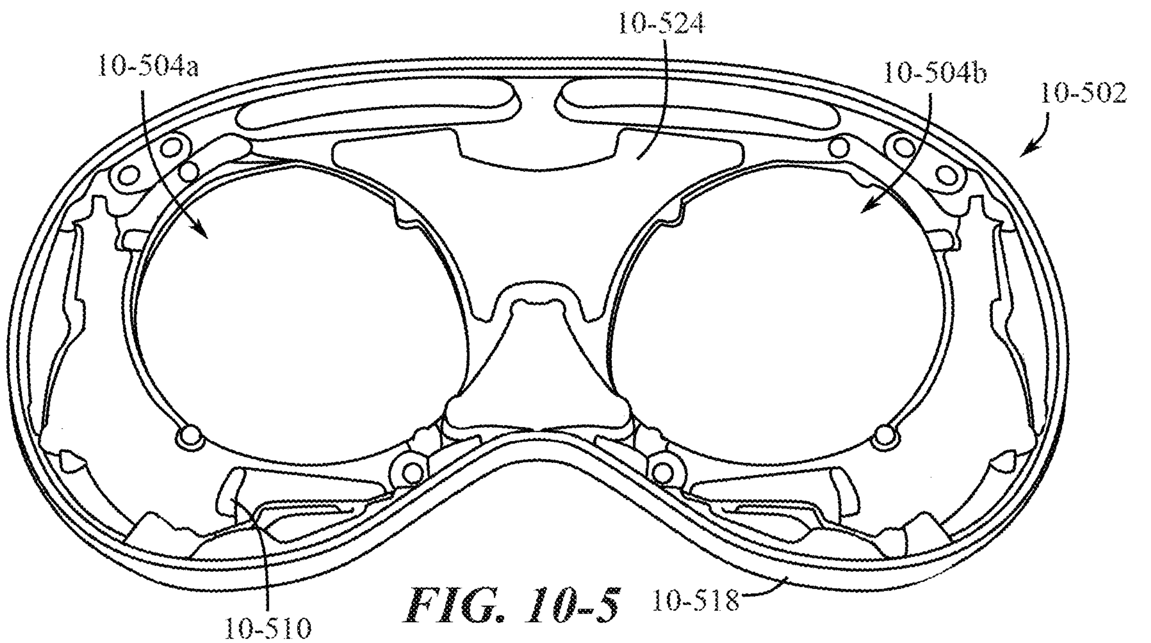
Figures 6, 10:
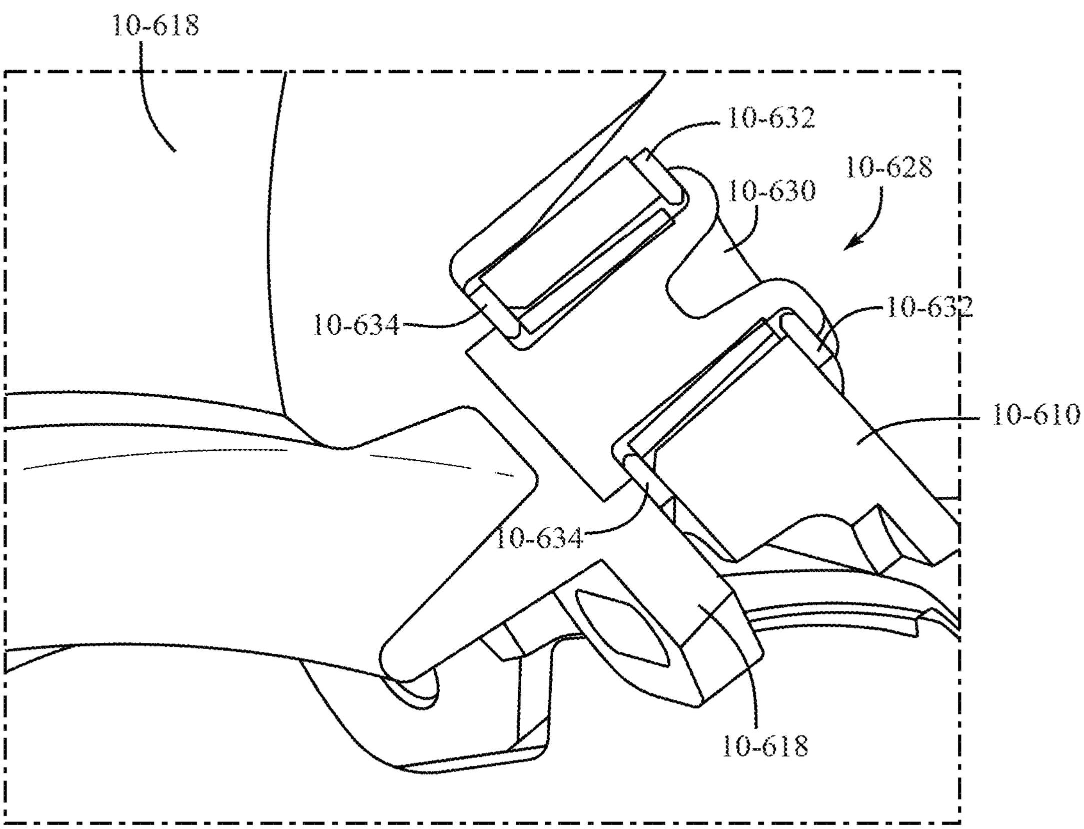
Figures 1, 11:
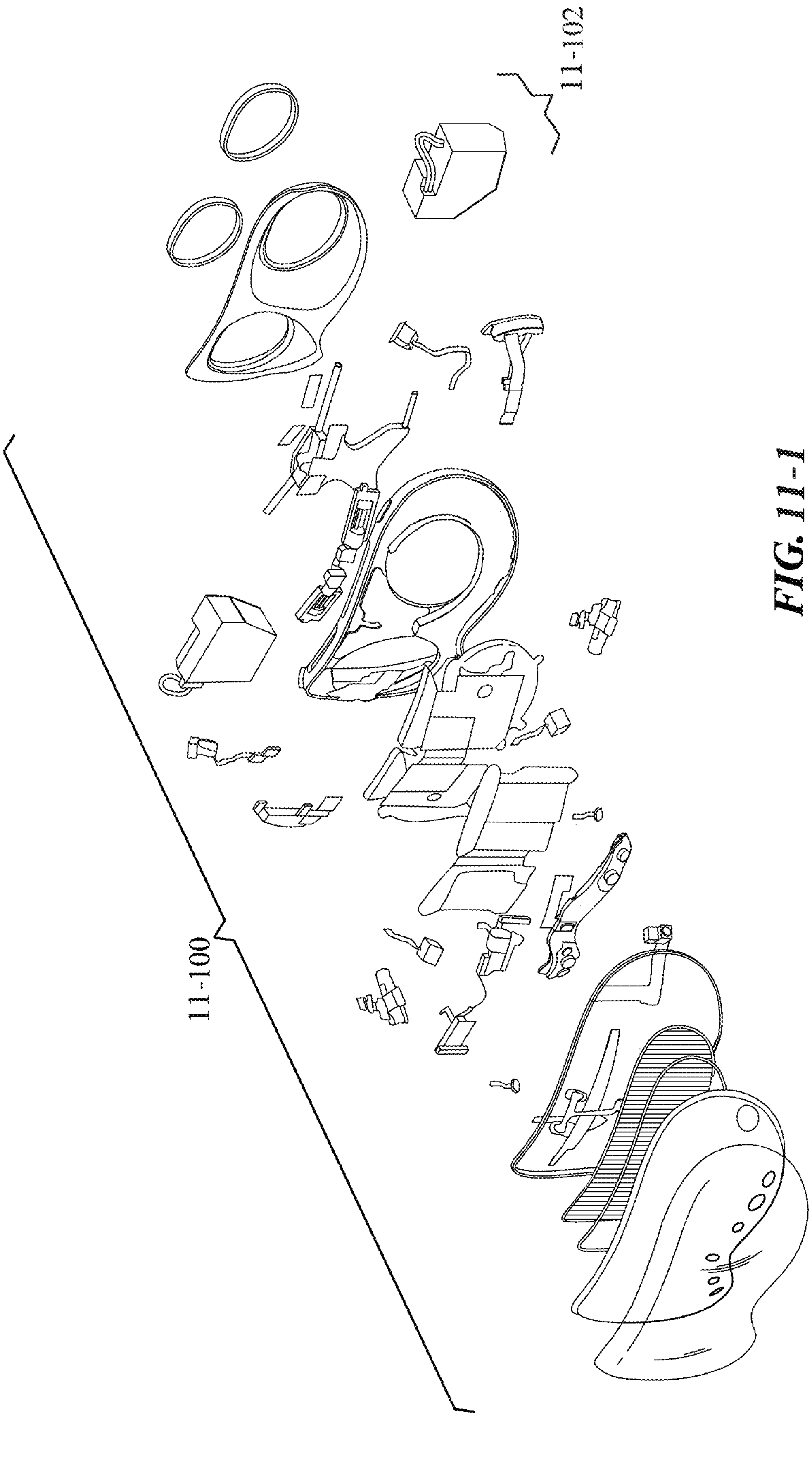

FIG. 6-0 illustrates a view of an example of an HMD.

FIG. 6-1 illustrates a front perspective view of an example of a sensor system for an HMD.

FIG. 6-2 illustrates a lower perspective view of an example of a sensor system for and HMD.

FIG. 6-3 illustrates a lower perspective view of an example of a sensor system for and HMD without a front cover assembly.

FIG. 6-4 illustrates a lower perspective view of an example of a sensor system of and HMD.

VII: Antennas

Figures 1, 4:
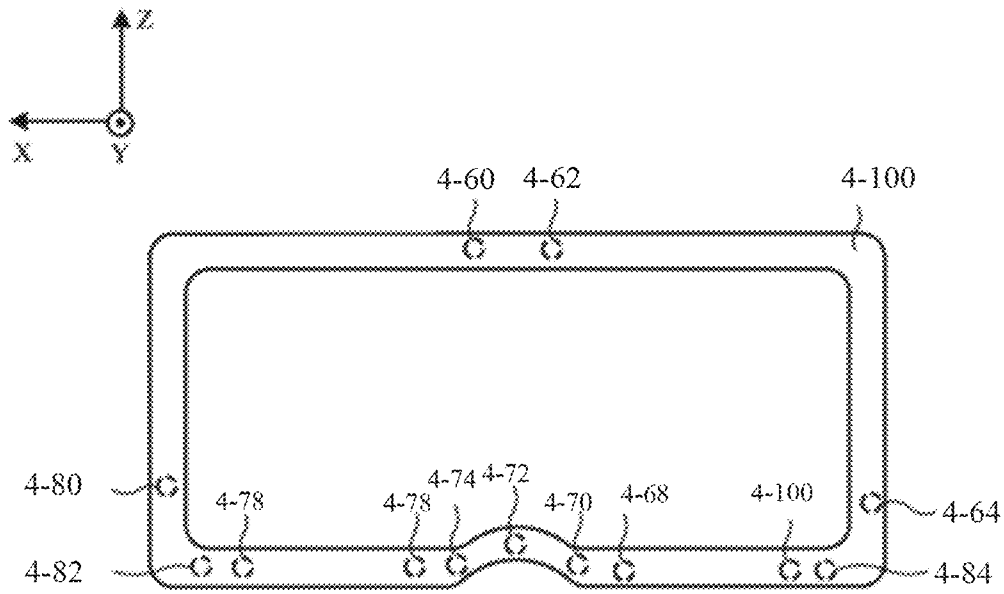
Figures 2, 4:
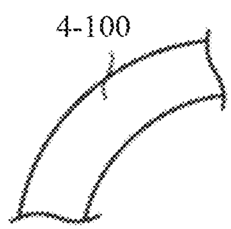
Figures 3, 4:
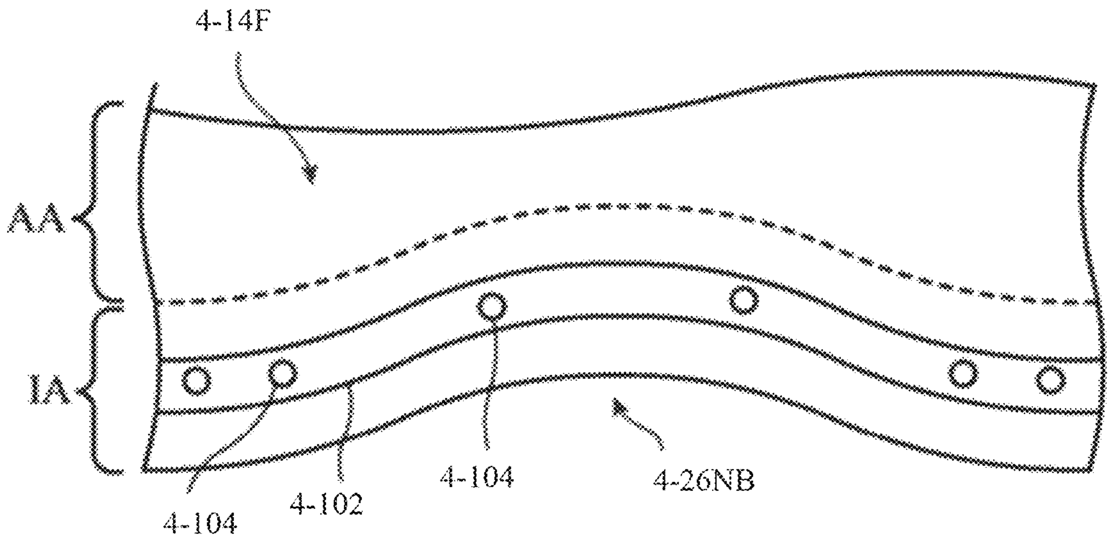
Figure 4:
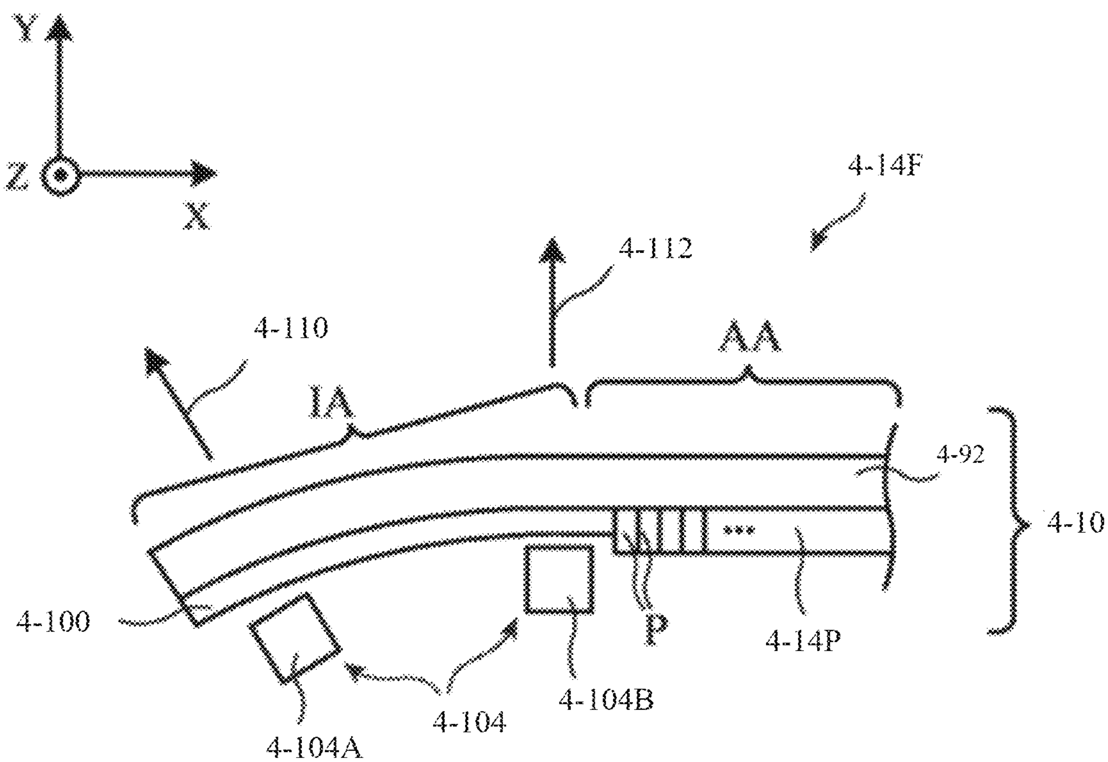
Figures 4, 5:
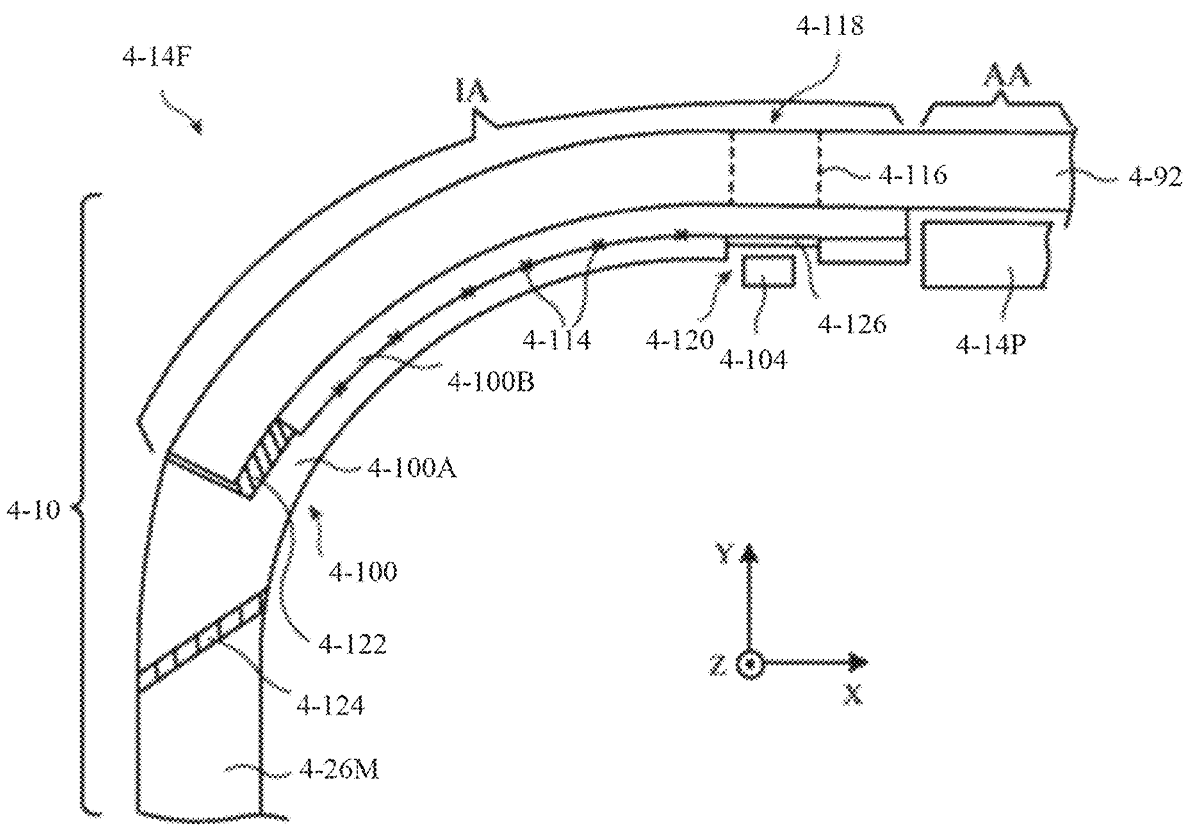
Figures 4, 5, 6:
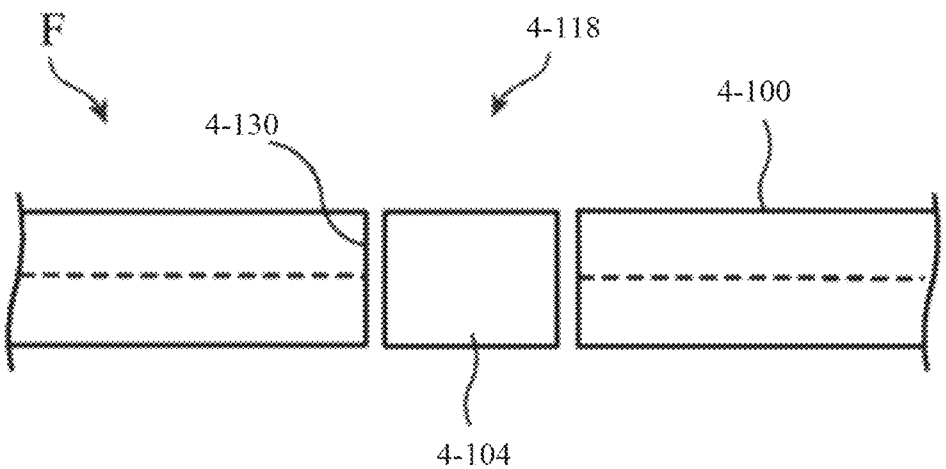
Figures 4, 5, 6, 7:
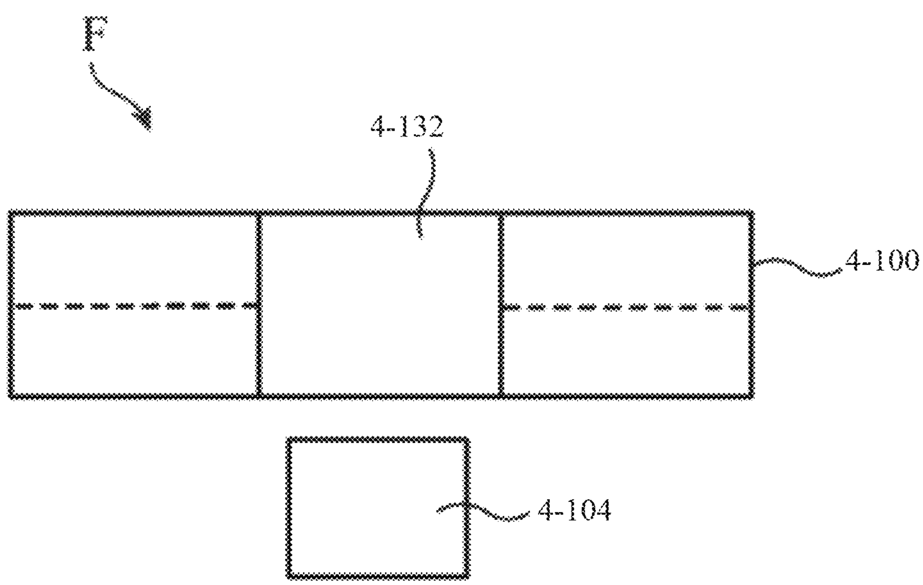

FIG. 7.0-1 illustrates a view of an example of a display unit of and HMD.

7.1: Electronic Devices with Antenna Mounting Structures

FIG. 7.1-1 is a top view of an illustrative electronic device such as a head-mounted device in accordance with an embodiment.

FIG. 7.1-2 is a diagram of an illustrative antenna for an electronic device in accordance with an embodiment.

FIG. 7.1-3 is a perspective view of an illustrative antenna on an illustrative unidirectional structured foam antenna biasing structure in accordance with an embodiment.

FIG. 7.1-4 is a top view of an illustrative structured foam member in accordance with an embodiment.

FIG. 7.1-5 is a diagram illustrating how a structured foam member may exhibit preferential unidirectional compression and expansion characteristics in accordance with an embodiment.

FIG. 7.1-6 is a cross-sectional top view of a right-hand edge portion of an illustrative head-mounted device in which a unidirectional structured foam antenna biasing member (antenna biasing structure) is being used to mount an antenna against a surface of an overlapping layer such as a display cover layer in accordance with an embodiment.

7.2: Electronic Devices with Millimeter Wave Antennas

FIG. 7.2-1 is a top view of an illustrative electronic device with an antenna in accordance with an embodiment.

FIG. 7.2-2 is a front view of an illustrative antenna for an electronic device in accordance with an embodiment.

FIG. 7.2-3 is a side view of an illustrative millimeter wave antenna having an array of patch antenna elements in accordance with an embodiment.

FIG. 7.2-4 is a cross-sectional side view of a corner portion of an illustrative head-mounted device with an antenna in accordance with an embodiment.

FIG. 7.2-5 is a cross-sectional view of a front portion of an illustrative head-mounted device with an antenna in accordance with an embodiment.

7.3: Electronic Devices with Antennas Having Compound Curvature

FIG. 7.3-1 is a top view of an illustrative electronic device with an antenna in accordance with an embodiment.

FIG. 7.3-2 is a diagram of an illustrative antenna for an electronic device in accordance with an embodiment.

FIG. 7.3-3 is a perspective view of an illustrative flexible printed circuit antenna with compound curvature in accordance with an embodiment.

FIG. 7.3-4 is a side view of illustrative equipment for laminating a flexible printed circuit antenna to a dielectric member such as a polymer layer in accordance with an embodiment.

FIG. 7.3-5 is a side view of an illustrative printed circuit antenna with compound curvature attached to a compound curvature surface of dielectric member with compound curvature in accordance with an embodiment.

FIG. 7.3-6 is a perspective view of an illustrative printed circuit antenna with compound curvature laminated to the inner surface of a dielectric member with compound curvature in accordance with an embodiment.

VIII: Bent MLB

Figures 4, 5, 6, 7, 8:
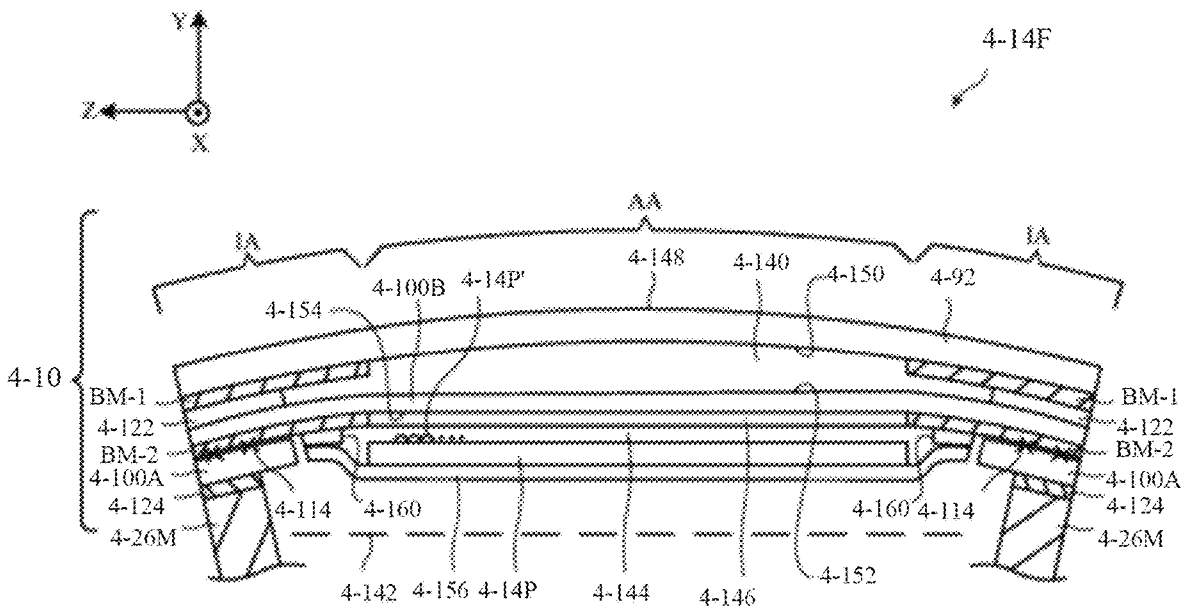

FIG. 8-0 illustrates a view of an HMD including a logic board.

FIG. 8-1 illustrates a plan view of an example of a logic board.

FIG. 8-2 illustrates a top view of an example of a logic board.

FIG. 8-3 illustrates a close up view of the logic board shown in FIG. 8-2.

FIG. 8-4 illustrates an example of a logic board.

FIG. 8-5 illustrates a perspective view of a logic board coupled with a fan assembly of an HMD.

IX: Thermals

Figures 4, 5, 6, 7, 8, 9:
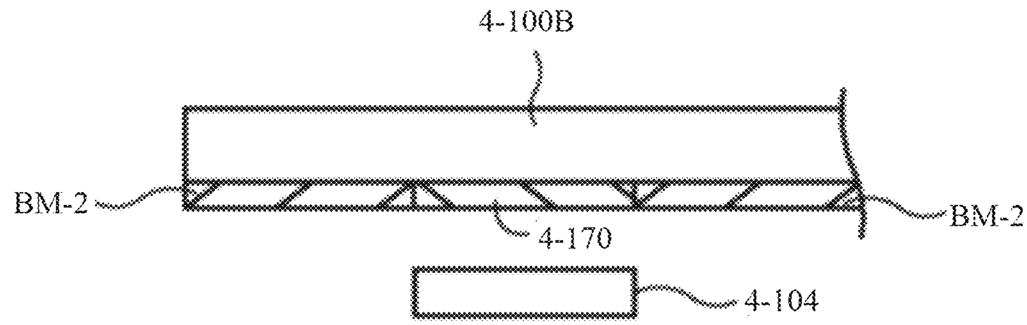

FIG. 9.0-1 illustrates a view of an HMD.

9.1: Air Deflector for a Cooling System in a Head-Mounted Device

FIG. 9.1-1 illustrates a schematic diagram of an example of a head-mounted device.

FIG. 9.1-2 illustrates a front view of an example of a head-mounted device.

FIG. 9.1-3 illustrates a side view of an example of a cooling system.

FIG. 9.1-4 illustrates a side view of an example of a cooling system having an air deflector.

FIG. 9.1-5 illustrates a side view of an example of a cooling system having an air deflector.

FIG. 9.1-6 illustrates a side view of an example of a cooling system having an air deflector.

FIG. 9.1-7 illustrates a side view of an example of air flow in a cooling system.

FIG. 9.1-8 illustrates a side view of an example of air flow in a cooling system.

FIG. 9.1-9 illustrates a block diagram of an example of a head-mounted device.

9.2: Fan with Debris Mitigation

FIG. 9.2-1 illustrates a side view of a head-mountable device, according to some embodiments of the present disclosure.

FIG. 9.2-2 illustrates a perspective view of a fan for a head-mountable device, according to some embodiments of the present disclosure.

FIG. 9.2-3 illustrates a sectional view of an assembly of the head-mountable device of FIG. 9.2-1 including the fan of FIG. 9.2-2 in operation to generate a flow, according to some embodiments of the present disclosure.

FIG. 9.2-4 illustrates another sectional view of the assembly of FIG. 9.2-3 with the fan of FIG. 9.2-2 in stasis and particles entering through the outlet, according to some embodiments of the present disclosure.

FIG. 9.2-5 illustrates a perspective and sectional view of a fan having an annular ring to direct incoming particles, according to some embodiments of the present disclosure.

FIG. 9.2-6 illustrates a perspective and sectional view of a fan having an annular ring to direct incoming particles, according to some embodiments of the present disclosure.

FIG. 9.2-7 illustrates a sectional view of a fan having a base plate with variable thickness, according to some embodiments of the present disclosure.

FIG. 9.2-8 illustrates a view of a fan having a base plate forming openings, according to some embodiments of the present disclosure.

FIG. 9.2-9 illustrates a bottom view of a fan having a base plate forming openings and an adhesive pad, according to some embodiments of the present disclosure.

FIG. 9.2-10 illustrates a sectional view of the fan of FIG. 9.2-9, according to some embodiments of the present disclosure.

FIG. 9.2-11 illustrates a view of a fan having a base plate forming openings, according to some embodiments of the present disclosure.

FIG. 9.2-12 illustrates a perspective and sectional view of the fan of FIG. 9.2-11, according to some embodiments of the present disclosure.

FIG. 9.2-13 illustrates a block diagram of a head-mountable device, in accordance with some embodiments of the present disclosure.

9.3: Ventilation

FIG. 9.3-1 illustrates a view of an example of an HMD.

FIG. 9.3-2 illustrates a rear perspective view of an example of a ventilation assembly of and HMD.

FIG. 9.3-3 illustrates a perspective cross-sectional view of an example of a fan assembly of an HMD.

FIG. 9.3-4 illustrates a cross-sectional view of an example of a fan assembly of an HMD.

FIG. 9.3-5 illustrates a top plan view of an example of a fan for an HMD.

FIG. 9.3-6 illustrates a bottom plan view of an example of a fan for an HMD.

FIG. 9.3-7 illustrates an exploded view of an example of a fan for and HMD.

FIG. 9.3-8 illustrates a rear perspective view of an example of a fan and circuit board assembly of an HMD.

FIG. 9.3-9 illustrates a perspective view of an example of a fan and circuit board assembly of an HMD.

FIG. 9.3-10 illustrates a close up perspective view of an example of a fan and circuit board assembly of an HMD.

FIG. 9.3-11 illustrates a side cross-sectional view of an example of a fan and circuit board assembly of an HMD.

X: Chassis

Figures 4, 5, 6, 7, 8, 9, 10:
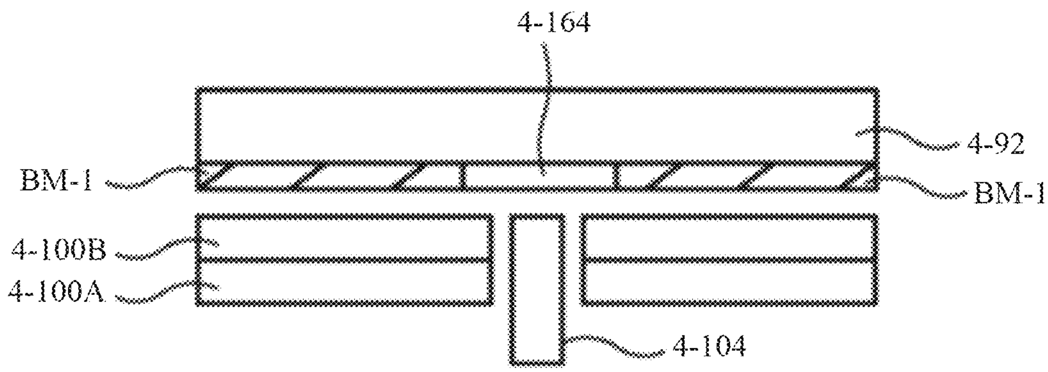

FIG. 10-0 illustrates a view of an example of an HMD.

FIG. 10-1 illustrates a view of an example of an HMD.

FIG. 10-2 illustrates a rear perspective view of an example of an HMD.

FIG. 10-3 illustrates a front perspective view of an example of a frame assembly of an HMD.

FIG. 10-4 illustrates a front plan view of an example of a frame assembly of an HMD.

FIG. 10-5 illustrates a front plan view of an example of a frame assembly of an HMD.

FIG. 10-6 illustrates a close-up cross-sectional view of a portion of an example of an HMD.

XI: Optical Module

Figures 4, 5, 6, 7, 8, 9, 10, 11:
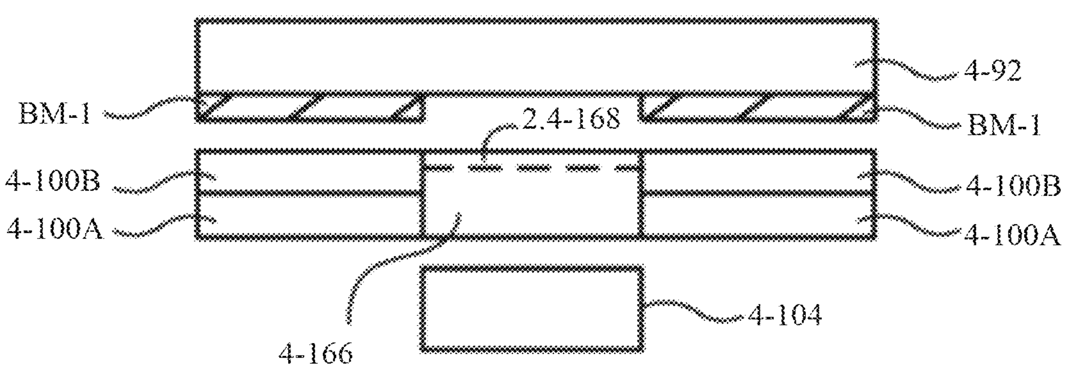
Figures 1, 5:
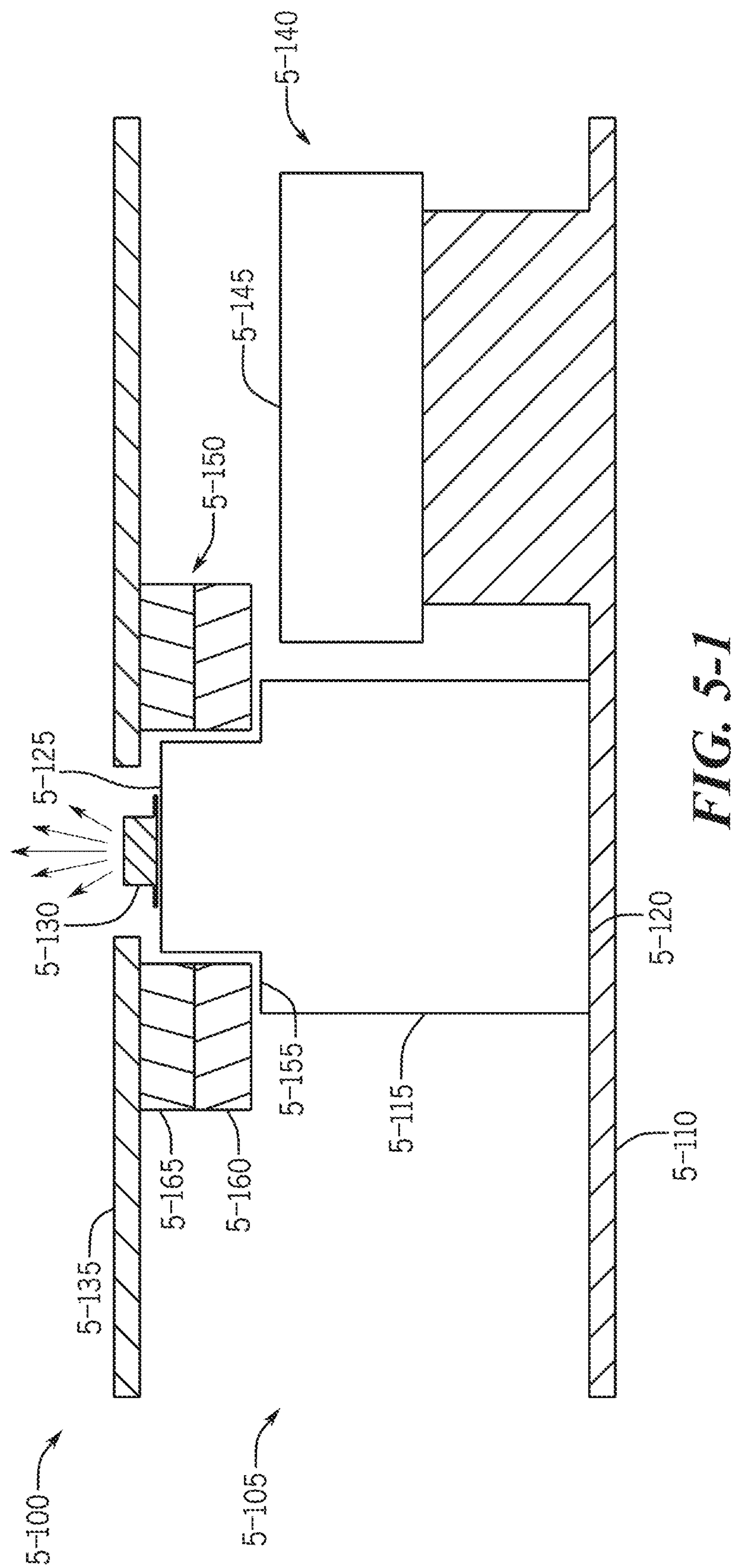
Figures 2, 5:
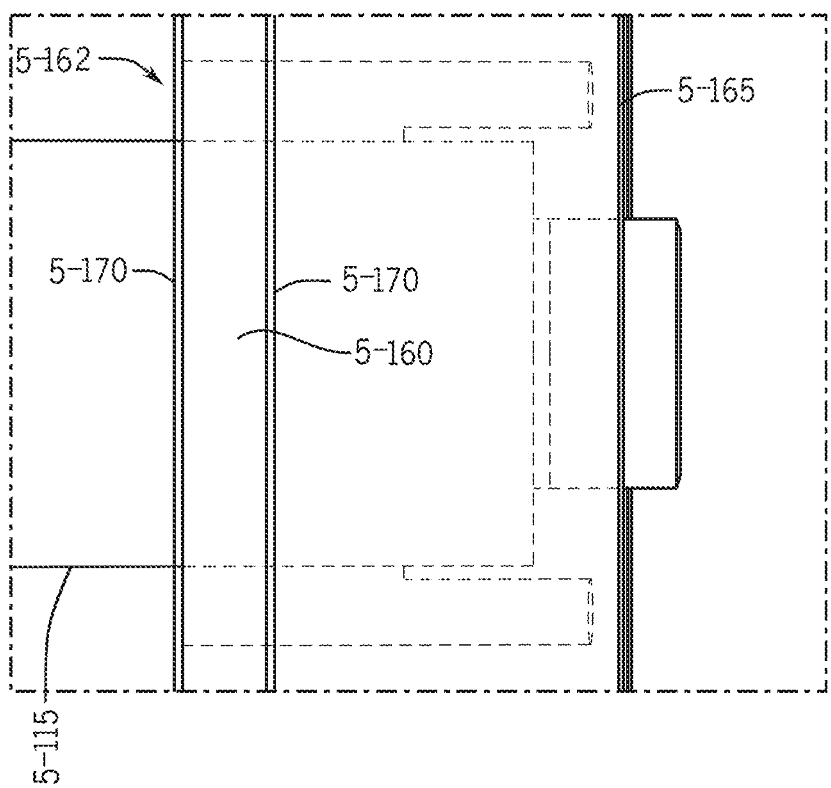
Figures 3, 5:
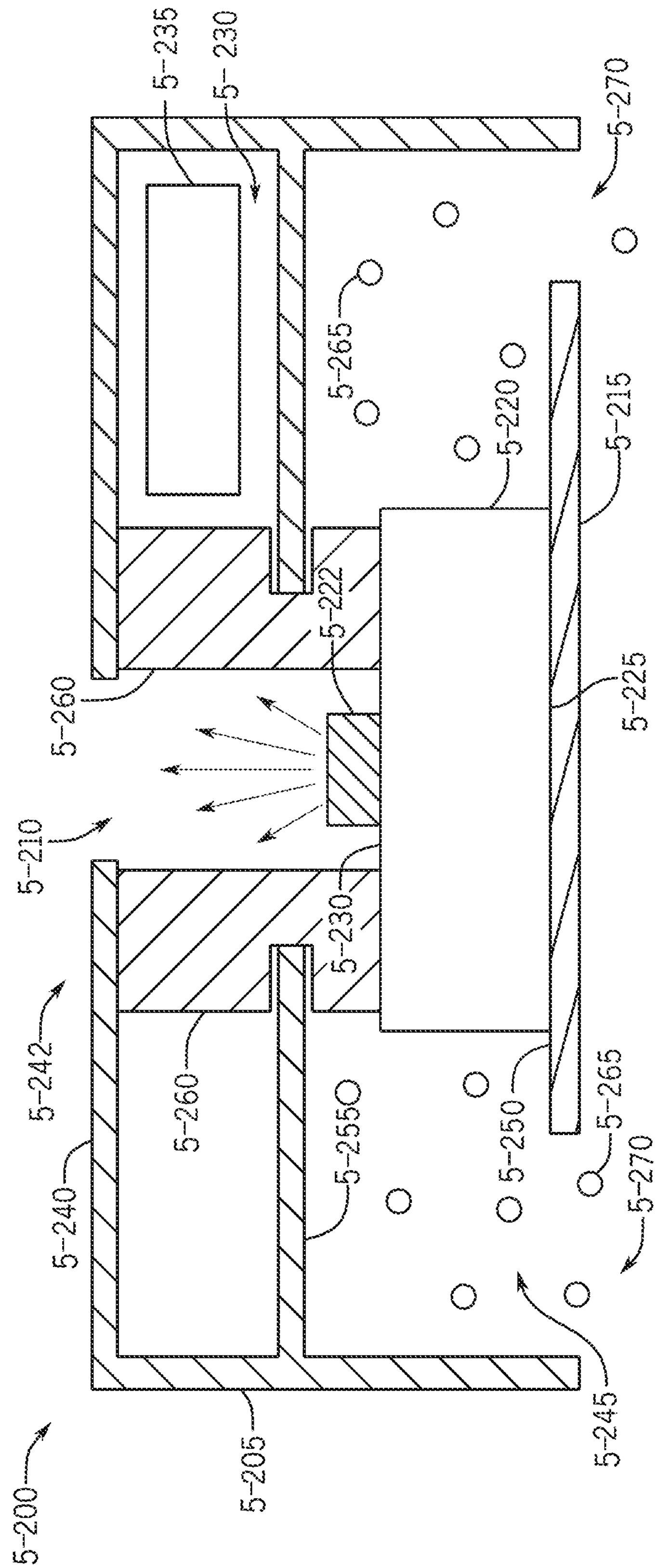
Figures 4A, 5:
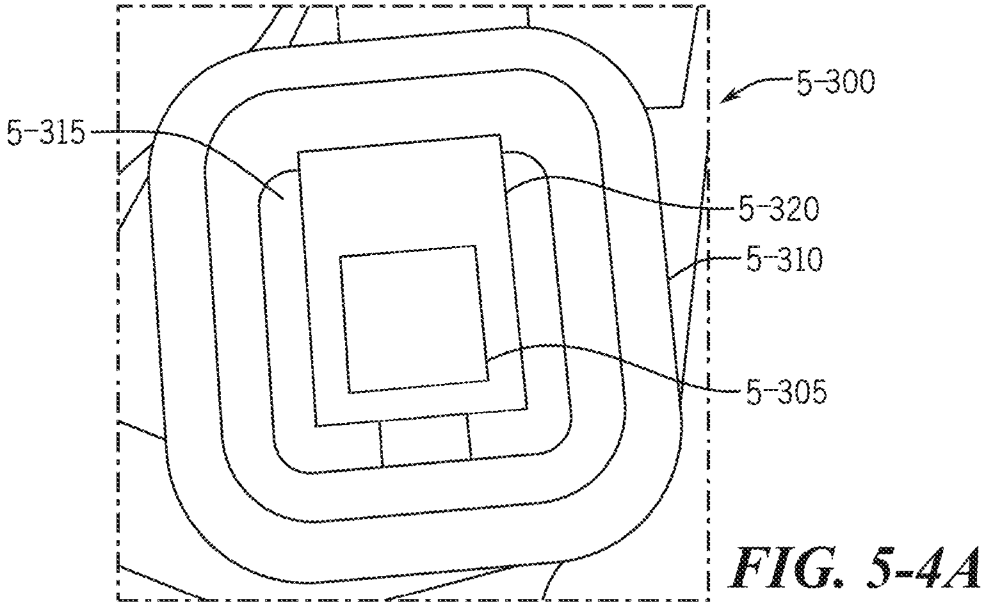
Figures 4B, 5:
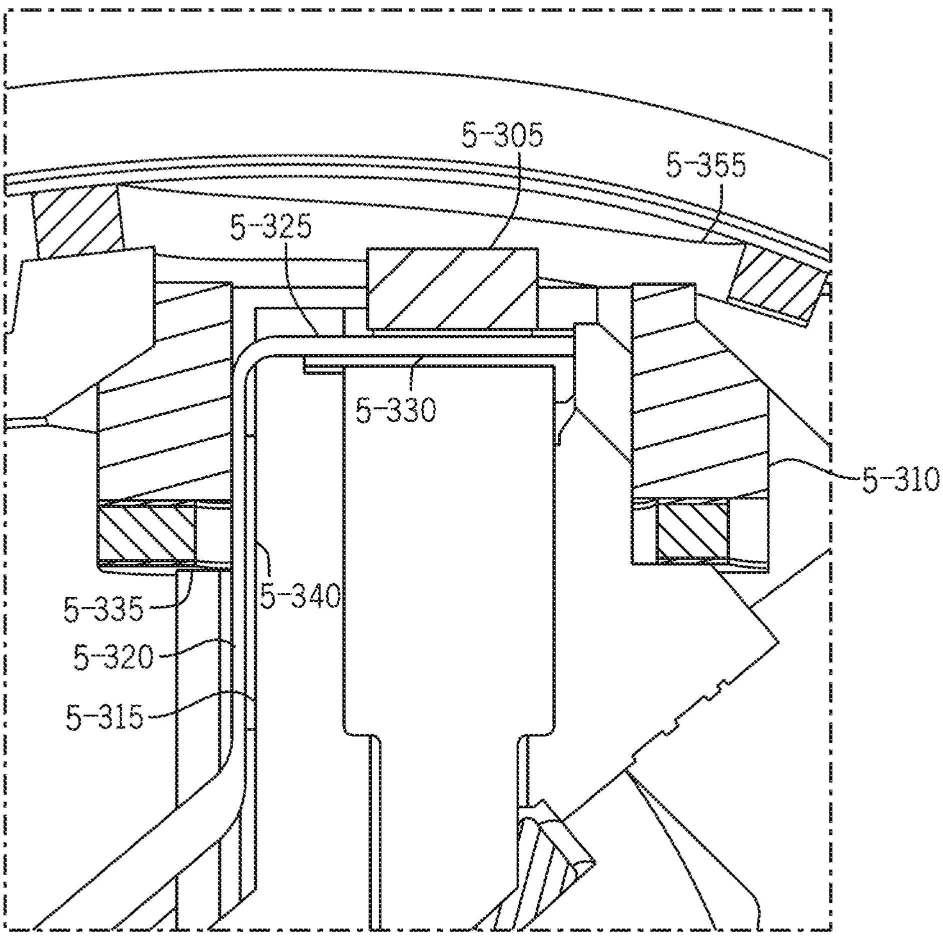
Figures 4C, 5:
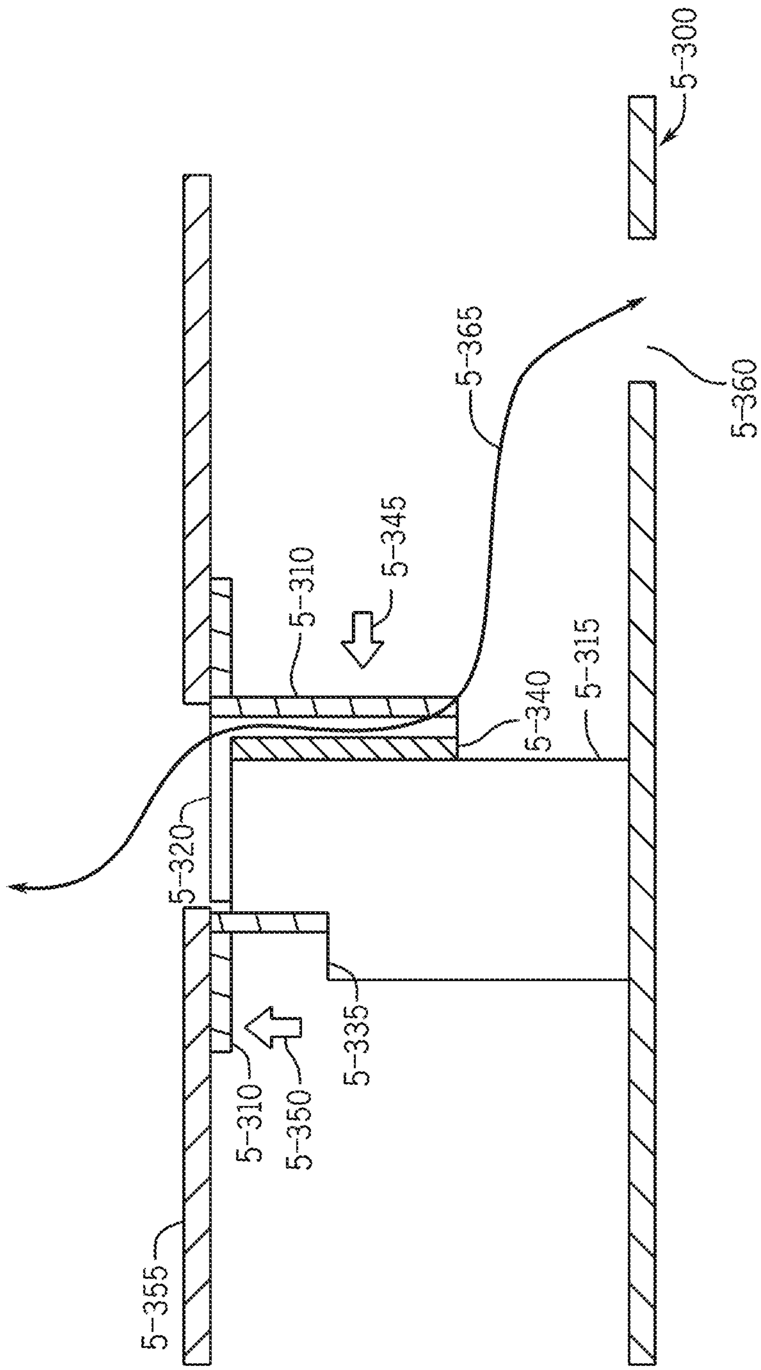

FIG. 11-1 illustrates a view of an example of an HMD.

11.1: IPD Adjust

FIG. 11.1-1 illustrates a partial perspective view of an example of an HMD including an optical module adjustment system.

11.1.1: Crown

FIG. 11.1.1-1 illustrates a partial perspective view of an example of an HMD including an optical module adjustment system.

11.1.1.1: Adjustment Mechanism for Head-Mounted Display

FIG. 11.1.1.1-1 is a top view of a head-mounted display.

FIG. 11.1.1.1-2A is a detail view of an actuator disposed within a head-mounted display similar to the head-mounted display of FIG. 11.1.1.1-1.

FIG. 11.1.1.1-2B is a partially-exploded sectional view of the actuator of FIG. 11.1.1.1-2A.

FIG. 11.1.1.1-3A is a detail view of another actuator disposed within a head-mounted display similar to the head-mounted display of FIG. 11.1.1.1-1.

FIG. 11.1.1.1-3B is a partially-exploded sectional view of the actuator of FIG. 11.1.1.1-3A.

FIG. 11.1.1.1-4A is a detail view of another actuator disposed within a head-mounted display similar to the head-mounted display of FIG. 11.1.1.1-1.

FIG. 11.1.1.1-4B is a partially-exploded sectional view of the actuator of FIG. 11.1.1.1-4A.

FIG. 11.1.1.1-5A is a detail view of an electromagnetic dampening mechanism for an actuator similar to the actuators of FIGS. 11.1.1.1-2A, 11.1.1.1-2B, 11.1.1.1-3A, 11.1.1.1-3B, 11.1.1.1-4A, and 11.1.1.1-4B.

FIG. 11.1.1.1-5B is a detail view of another electromagnetic dampening mechanism for an actuator similar to the actuator of FIGS. 11.1.1.1-2A, 11.1.1.1-2B, 11.1.1.1-3A, 11.1.1.1-3B, 11.1.1.1-4A, and 11.1.1.1-4B.

FIG. 11.1.1.1-6A is a detail view of a mechanical dampening mechanism for an actuator similar to the actuator of FIGS. 11.1.1.1-2A, 11.1.1.1-2B, 11.1.1.1-3A, 11.1.1.1-3B, 11.1.1.1-4A, and 11.1.1.1-4B.

FIG. 11.1.1.1-6B is a detail view of another mechanical dampening mechanism for an actuator similar to the actuator of FIGS. 11.1.1.1-2A, 11.1.1.1-2B, 11.1.1.1-3A, 11.1.1.1-3B, 11.1.1.1-4A, and 11.1.1.1-4B.

FIG. 11.1.1.1-7 is a flowchart depicting a process of operation for an actuator disposed within a head-mounted display similar to the head-mounted display of FIG. 11.1.1.1-1.

FIG. 11.1.1.1-8 is a schematic hardware configuration for a controller in the head-mounted display of FIG. 11.1.1.1-1.

11.1.1.2: Crown Input and Feedback for Head-Mountable Devices

FIG. 11.1.1.2-1 illustrates a top view of a head-mountable device, according to some embodiments of the present disclosure.

FIG. 11.1.1.2-2 illustrates a top exploded view of a head-mountable device, according to some embodiments of the present disclosure.

FIG. 11.1.1.2-3 illustrates a sectional view of a crown module of the head-mountable device of FIG. 11.1.1.2-2, according to some embodiments of the present disclosure.

FIG. 11.1.1.2-4 illustrates a partial sectional view of a crown module of the head-mountable device of FIG. 11.1.1.2-2, according to some embodiments of the present disclosure.

FIG. 11.1.1.2-5 illustrates a sectional view of the crown module of FIG. 11.1.1.2-4 taken along line A-A, according to some embodiments of the present disclosure.

FIG. 11.1.1.2-6 illustrates a side view of the crown module of FIG. 11.1.1.2-4, according to some embodiments of the present disclosure.

FIG. 11.1.1.2-7 illustrates a circuit diagram of a sensor of the crown module of FIG. 11.1.1.2-4, according to some embodiments of the present disclosure.

FIG. 11.1.1.2-8 illustrates a block diagram of a head-mountable device, in accordance with some embodiments of the present disclosure.

11.1.2: Wishbone and Mustache

FIG. 11.1.2-1 illustrates a front perspective view of an HMD with the front cover and display assembly omitted to show an example of a sensor system.

FIG. 11.1.2-2 illustrates a perspective view of a portion of a sensor system including sensors coupled to a bracket.

FIG. 11.1.2-3 illustrates a rear perspective view of a portion of an example HMD including a display module bracket.

FIG. 11.1.2-4 illustrates a top view of a portion of a display assembly of an example HMD.

FIG. 11.1.2-5 illustrates a side cross-sectional view of an example HMD.

11.1.3: Upper Guide Rod System

FIG. 11.1.3-1 illustrates a rear perspective view of an example HMD including a display adjustment system.

FIG. 11.1.3-2 illustrates a close-up view thereof with the display module omitted.

FIG. 11.1.3-3 illustrates a close-up view of the system shown in FIG. 11.1.3-1 with the display module omitted.

11.1.3.1: Motors

FIG. 11.1.3.1-1 illustrates a rear perspective view of an example HMD including a display adjustment system.

FIG. 11.1.3.1-2 illustrates a perspective view of an example of a motor of a display adjustment system of an example HMD.

FIG. 11.1.3.1-3 illustrates a cross-sectional view of an example of a motor of a display adjustment system of an example HMD.

11.1.3.1.1: Electronic Devices with Optical Module Positioning Systems

FIG. 11.1.3.1.1-1 is a top view of an illustrative head-mounted device in accordance with an embodiment.

FIG. 11.1.3.1.1-2 is a rear view of an illustrative head-mounted device in accordance with an embodiment.

FIG. 11.1.3.1.1-3 is a schematic diagram of an illustrative head-mounted device in accordance with an embodiment.

FIG. 11.1.3.1.1-4 is a rear view of an interior portion of an illustrative head-mounted device in accordance with an embodiment.

FIG. 11.1.3.1.1-5 is a side view of an illustrative portion of an optical module that is configured to receive a guide rail and a threaded actuator rod in accordance with an embodiment.

FIG. 11.1.3.1.1-6 is an exploded cross-sectional view of an illustrative guide rod and end cap in accordance with an embodiment.

FIG. 11.1.3.1.1-7 is a side view of the illustrative guide rod of FIG. 11.1.3.1.1-6 following attachment of the end cap in accordance with an embodiment.

FIG. 11.1.3.1.1-8 is a cross-sectional top view of the illustrative guide rod of FIGS. 11.1.3.1.1-6 and 11.1.3.1.1-7 showing how the guide rod may be mounted to a housing structure such as a frame in head-mounted support structures in accordance with an embodiment.

FIGS. 11.1.3.1.1-9, 11.1.3.1.1-10, 11.1.3.1.1-11, and 11.1.3.1.1-12 are views of illustrative guide rods in accordance with embodiments.

FIG. 11.1.3.1.1-13 is a cross-sectional side view of an illustrative guide rod tube that has been partially filled with a core in accordance with an embodiment.

FIG. 11.1.3.1.1-14 is a top view of a portion of an illustrative guide rod formed from fiber-composite material in accordance with an embodiment.

FIG. 11.1.3.1.1-15 is a cross-sectional end view of an illustrative portion of a guide rod formed from fiber-composite material in accordance with an embodiment.

FIG. 11.1.3.1.1-16 is a cross-sectional side view of an illustrative end portion of a guide rod in accordance with an embodiment.

FIG. 11.1.3.1.1-17 is a cross-sectional side view of an illustrative tapered end portion of a guide rod in accordance with an embodiment.

11.1.3.1.2: Electronic Device with Lens Positioning Sensing

FIG. 11.1.3.1.2-1 is a schematic diagram of an illustrative electronic device such as a head-mounted display device in accordance with an embodiment.

FIG. 11.1.3.1.2-2 is a top view of an illustrative head-mounted device in accordance with an embodiment.

FIG. 11.1.3.1.2-3 is a front view of an illustrative lens assembly having a force or position sensor in accordance with an embodiment.

FIG. 11.1.3.1.2-4A is a front view of an illustrative direct force sensor in accordance with an embodiment.

FIG. 11.1.3.1.2-4B is a top view of an illustrative sensor woven into a fabric in accordance with an embodiment.

FIG. 11.1.3.1.2-4C is a cross-sectional side view of an illustrative nasal flap with an air bladder sensor in accordance with an embodiment.

FIG. 11.1.3.1.2-5 is a front view of an illustrative lens assembly having a proximity sensor in accordance with an embodiment.

FIG. 11.1.3.1.2-6 is a front view of an illustrative lens assembly having movable components that block a light-emitting component to indicate a position of the lens assembly in accordance with an embodiment.

FIG. 11.1.3.1.2-7 is a circuit diagram of an illustrative control circuit for controlling a positioner motor while monitoring for feedback from the motor in accordance with an embodiment.

FIG. 11.1.3.1.2-8 is a flow chart of illustrative steps involved operating a head-mounted device in accordance with an embodiment.

11.1.3.2: Sensors/Encoders

FIG. 11.1.3.2-1 illustrates a perspective view of an example encoder for an HMD display adjustment system.

FIG. 11.1.3.2-2 illustrates a top perspective view of an example display adjustment system for an HMD.

FIG. 11.1.3.2-3 illustrates a top view of an example encoder assembly for an HMD display adjustment system.

11.1.3.2.1: Sensor Assembly

FIG. 11.1.3.2.1-1 illustrates a side view of a head-mountable device, according to some embodiments of the present disclosure.

FIG. 11.1.3.2.1-2 illustrates an exploded perspective view of a sensor assembly of the head-mountable device of FIG. 11.1.3.2.1-1, according to some embodiments of the present disclosure.

FIG. 11.1.3.2.1-3 illustrates a side sectional view of a sensor assembly, according to some embodiments of the present disclosure.

FIG. 11.1.3.2.1-4 illustrates a side sectional view of a sensor assembly, according to some embodiments of the present disclosure.

FIG. 11.1.3.2.1-5 illustrates a block diagram of a head-mountable device, in accordance with some embodiments of the present disclosure.

11.1.3.2.2: Electronic Devices with Movable Optical Assemblies

FIG. 11.1.3.2.2-1 is a diagram of an illustrative head-mounted device in accordance with an embodiment.

FIGS. 11.1.3.2.2-2 and 11.1.3.2.2-3 are rear views of portions of illustrative head-mounted devices in accordance with embodiments.

FIG. 11.1.3.2.2-4 is a graph in which illustrative optical assembly adjustment values are plotted as a function of measured eye relief for multiple different illustrative measured interpupillary distances in accordance with an embodiment.

FIG. 11.1.3.2.2-5 is a flow chart of illustrative operations involved in using a head-mounted device in accordance with an embodiment.

11.1.3.2.3: Electronic Devices with Movable Optical Assemblies

FIG. 11.1.3.2.3-1 is a diagram of an illustrative head-mounted device in accordance with an embodiment.

FIGS. 11.1.3.2.3-2 and 11.1.3.2.3-3 are flow charts of illustrative operations involved in using a head-mounted device with movable optical assemblies in accordance with embodiments.

FIG. 11.1.3.2.3-4 is a cross-sectional end view of an illustrative clutch based on a split nut may be used in limiting how much force is applied to an optical assembly in accordance with an embodiment.

FIGS. 11.1.3.2.3-5 and 11.1.3.2.3-6 are diagrams showing how magnetic clutches may be used in limiting the force applied to optical assemblies in accordance with embodiments.

FIGS. 11.1.3.2.3-7, 11.1.3.2.3-8, 11.1.3.2.3-9, and 11.1.3.2.3-10 are diagrams of illustrative mechanical clutch mechanisms that may be used in moving optical assemblies in accordance with embodiments.

FIG. 11.1.3.2.3-11 is a diagram showing how force-sensitive switches may be used in coupling a nut to an optical assembly in accordance with an embodiment.

FIG. 11.1.3.2.3-12 is a diagram showing how torque-sensitive switches may be coupled between a rotating motor and a portion of a rotating shaft in accordance with an embodiment.

FIG. 11.1.3.2.3-13 is a circuit diagram showing how motor load may be measured electrically while moving optical assemblies in accordance with an embodiment.

FIG. 11.1.3.2.3-14 is a diagram of an illustrative motor with a rotary encoder in accordance with an embodiment FIG. 11.1.3.2.3-15 is a diagram of an illustrative motor, movable optical assembly, and associated linear magnetic encoder in accordance with an embodiment.

FIG. 11.1.3.2.3-16 is a graph showing how motor stalling may be detected while controlling a motor to move an optical assembly in accordance with an embodiment.

FIG. 11.1.3.2.3-17 is a flow chart of illustrative operations involved in using a head-mounted device with motors to move optical assemblies in accordance with an embodiment.

11.1.3.3: Hard Stops

FIG. 11.1.3.3-1 illustrates a perspective view of a portion of an example HMD including a hard stop.

FIG. 11.1.3.3-2 illustrates a perspective view of a portion of an example HMD including a hard stop.

11.1.3.4: Upper Biasing Members

FIG. 11.1.3.4-1 illustrates a perspective view of a portion of a display adjustment system of an example HMD.

FIG. 11.1.3.4-2 illustrates a perspective view of a portion of a display adjustment system of an example HMD.

11.1.4: Lower Guide Rod System

11.1.4.1: Electronic Devices with Biased Guide Rails

FIG. 11.1.4.1-1 is a top view of an illustrative electronic device in accordance with an embodiment.

FIG. 11.1.4.1-2 is a schematic diagram of an illustrative electronic device in accordance with an embodiment.

FIG. 11.1.4.1-3 is top view of an illustrative electronic device with optical module guide rails in accordance with an embodiment.

FIG. 11.1.4.1-4 is a rear view of illustrative electronic device with optical module guide rails in accordance with an embodiment.

FIG. 11.1.4.1-5 is a side view of an illustrative optical module with guide rails in accordance with an embodiment.

FIGS. 11.1.4.1-6A, 11.1.4.1-6B, and 11.1.4.1-7 are cross-sectional side views of illustrative guide rail biasing mechanisms in accordance with embodiments.

FIG. 11.1.4.1-8 is a cross-sectional side view of a portion of a kinematic guide rail mounting system in accordance with an embodiment.

FIG. 11.1.4.1-9 is a side view of a kinematic optical module guide rail mounting system in accordance with an embodiment.

FIG. 11.1.4.1-10 is a perspective view of an illustrative guide rail sensor based on a strain gauge in accordance with an embodiment.

FIG. 11.1.4.1-11 is a cross-sectional side view of an illustrative optical module with a guide rail sensor in accordance with an embodiment.

11.1.4.2: Lower Guide Rods

FIG. 11.1.4.2-1 illustrates a plan view of a portion of an example HMD including a guide system for an adjustable display.

11.1.4.2.1: Electrical Contacts

FIG. 11.1.4.2.1-1 illustrates a perspective view of a portion of an example HMD.

11.1.4.2.2: Biasing Members

FIG. 11.1.4.2.2-1 illustrates a perspective view of a portion of an example HMD.

11.2: Barrels and Baskets

11.2.1: Lens Mounting Systems

FIG. 11.2.1-1 is a diagram of an illustrative head-mounted device in accordance with an embodiment.

FIG. 11.2.1-2 is a front view of an illustrative lens in accordance with embodiments.

FIGS. 11.2.1-3 and 11.2.1-4 are cross-sectional side view of peripheral portions of illustrative lenses and associated mounting structures in accordance with embodiments.

FIGS. 11.2.1-5 and 11.2.1-6 are top views of illustrative flexures for mounting a lens in accordance with embodiments.

FIGS. 11.2.1-7, 11.2.1-8, 11.2.1-9, and 11.2.1-10 are cross-sectional side views of additional illustrative flexure arrangements for mounting a lens in accordance with embodiments.

FIG. 11.2.1-11 is a diagram showing how adhesive may be introduced into a gap between an illustrative flexure and a lens in accordance with an embodiment.

11.3: Rear-Facing Cameras

11.3.1: Optical Module for Head-Mounted Device

FIG. 11.3.1-1 is a block diagram that shows an example of a hardware configuration for a head-mounted device.

FIG. 11.3.1-2 is a top view illustration that shows the head-mounted device, including a device housing and a support structure.

FIG. 11.3.1-3 is a rear view illustration taken along line A-A of FIG. 11.3.1-2 that shows the device housing.

FIG. 11.3.1-4 is a perspective view illustration that shows an optical module of the head-mounted device.

FIG. 11.3.1-5 is an exploded side view diagram showing components of an optical module according to an example.

FIG. 11.3.1-6 is a front view that shows the lens according to an example.

FIG. 11.3.1-7 is a cross-section view taken along line B-B of FIG. 11.3.1-6 showing the lens.

FIG. 11.3.1-8 is a front view illustration that shows a housing body of an optical module housing assembly FIG. 11.3.1-9 is a cross-section view illustration taken along line C-C of FIG. 11.3.1-8 showing the housing body.

FIG. 11.3.1-10 is a front view illustration that shows a retainer of the optical module housing assembly.

FIG. 11.3.1-11 is a cross-section view illustration taken along line D-D of FIG. 11.3.1-10 showing the retainer.

FIG. 11.3.1-12 is a front view illustration that shows an infrared emitter.

FIG. 11.3.1-13 is a cross-section view illustration showing a portion of the infrared emitter and a peripheral wall of the housing body.

FIG. 11.3.1-14 is a cross-section view illustration that shows the optical module.

FIG. 11.3.1-15 is a cross-section view illustration that shows the optical module according to an alternative implementation in which an optical axis of the eye camera is angled toward an optical axis of the optical module.

FIG. 11.3.1-16 is a cross-section view illustration that shows the optical module according to an alternative implementation in which the infrared emitter is located outside of the housing body of the optical module housing assembly.

FIG. 11.3.1-17 is a side-view illustration that shows a display module according to an implementation.

FIG. 11.3.1-18 is a top-view illustration that shows interpupillary adjustment mechanisms that each support one of the optical modules.

FIG. 11.3.1-19 is a side view illustration that shows one of the interpupillary adjustment mechanisms.

FIG. 11.3.1-20 is a top-view cross-section illustration that shows front-facing cameras that are supported by each of the optical modules.

FIG. 11.3.1-21 is an illustration that shows connection of the eye camera and the infrared emitter to a computing device by an optical module jumper board.

11.3.2: Cameras and LEDs

FIG. 11.3.2-1 illustrates a perspective view of a portion of an example of an optical module of an HMD.

FIG. 11.3.2-2 illustrates a top view of a portion of an example of an optical module of an HMD.

FIG. 11.3.2-3 illustrates a perspective cutaway view of a portion of an example of an optical module of an HMD.

FIG. 11.3.2-4 illustrates a plan view of a portion of an example of an optical module of and HMD.

FIG. 11.3.2-5 illustrates a cutaway view of a portion of an example of an optical module of an HMD.

11.4: Display

11.4.1: Display System with Interchangeable Lens

FIG. 11.4.1-0 illustrates a view of an HMD.

FIG. 11.4.1-1 is a side view of a display system with hidden components illustrated in dashed lines.

FIG. 11.4.1-2 is a cross-sectional view of the display system of FIG. 11.4.1-1 taken along line 2-2 in FIG. 11.4.1-1.

FIG. 11.4.1-3A is a cross-sectional view of a display unit and interchangeable lens assembly of the display system of FIG. 11.4.1-1 taken along line 3-3 in FIG. 11.4.1-2 and shown in an assembled state.

FIG. 11.4.1-3B is a cross-sectional view of the display unit and the interchangeable lens assembly of FIG. 11.4.1-3A shown in a disassembled state.

FIG. 11.4.1-4 is a rear view of a removable lens of the display system of FIG. 11.4.1-1 with light emission, entry, and exit points illustrated by dashed lines (i.e., dash-dot lines).

FIG. 11.4.1-5 is a rear view of another embodiment of a removable lens.

FIG. 11.4.1-6 is a rear view of another embodiment of a removable lens.

FIG. 11.4.1-7 is a cross-sectional view another embodiment of a removable lens.

FIG. 11.4.1-8 is a cross-sectional view another embodiment of a removable lens.

FIG. 11.4.1-9 is a cross-sectional view another embodiment of a removable lens.

FIG. 11.4.1-10A is a cross-sectional view of another display unit and another interchangeable lens assembly for the display system of FIG. 11.4.1-1 shown in a disassembled state.

FIG. 11.4.1-10B is a cross-sectional view of the display unit and the interchangeable lens assembly of FIG. 11.4.1-10A shown in an assembled state.

FIG. 11.4.1-11A is a cross-sectional view of another display unit and another interchangeable lens assembly for the display system of FIG. 11.4.1-1 shown in a disassembled state.

FIG. 11.4.1-11B is a cross-sectional view of the display unit and the interchangeable lens assembly of FIG. 11.4.1-10A shown in an assembled state.

FIG. 11.4.1-12A is a side view of a display module for use in the display system.

FIG. 11.4.1-12B is a front view of a display module for use in the display system.

FIG. 11.4.1-12C is a front view of a display module for use in the display system.

FIG. 11.4.1-12D is a front view of a display module for use in the display system.

FIG. 11.4.1-13A is a front view of a front view of a display module for use in the display system.

FIG. 11.4.1-13B is a front view of a removable lens assembly for use with the display module of FIG. 11.4.1-13A.

FIG. 11.4.1-13C is a cross-sectional view of the display module of FIG. 11.4.1-13A taken along line 11.4.1-13A-11.4.1-13A.

FIG. 11.4.1-13D is a cross-sectional view of the removable lens assembly of FIG. 11.4.1-13B taken along line 11.4.1-13B-11.4.1-13B.

FIG. 11.4.1-13E is a cross-sectional view of the display module of FIG. 11.4.1-13A and the removable lens assembly of FIG. 11.4.1-13B in a partially coupled state.

FIG. 11.4.1-13F is a cross-sectional view of the display module of FIG. 11.4.1-13A and the removable lens assembly of FIG. 11.4.1-13B in a coupled state.

FIG. 11.4.1-14A is a schematic view of a display system.

FIG. 11.4.1-14B is a flow chart of a method for operating the display system.

FIG. 11.4.1-15 is a flow chart of a process for determining compatibility of a removable lens and a user.

FIG. 11.4.1-16 is a flow chart of a method for determining compatibility of the removable lens and the user.

FIG. 11.4.1-17 is a schematic of an example hardware configuration of a controller of the display system.

11.4.2: Electronic Device System with Supplemental Lenses

FIG. 11.4.2-1 is a schematic diagram of an illustrative electronic device such as a head-mounted display device in accordance with an embodiment.

FIG. 11.4.2-2 is a top view of an illustrative head-mounted device in accordance with an embodiment.

FIG. 11.4.2-3 is a diagram of an illustrative removable supplemental lens in accordance with an embodiment.

FIG. 11.4.2-4 is a flow chart of illustrative operations associated with using a head-mounted device in accordance with an embodiment.

11.4.3: Rx Lenses

FIG. 11.4.3-1 illustrates a perspective view of a portion of an optical assembly of an example HMD FIG. 11.4.3-2 illustrates a perspective view of a portion of an optical assembly of an example HMD.

FIG. 11.4.3-3 illustrates a perspective view of a portion of an optical assembly of an example HMD.

FIG. 11.4.3-4 illustrates a plan and exploded view of a portion of an optical assembly of an example HMD.

FIG. 11.4.3-5 illustrates a magnet array for an example display module of an HMD.

FIG. 11.4.3-6 illustrates a perspective view of an example lens of an HMD.

FIG. 11.4.3-7 illustrates a side view of an example lens of an HMD.

FIG. 11.4.3-8 illustrates a side view of an example lens of an HMD.

FIG. 11.4.3-9 illustrates a side view of an example lens of an HMD.

FIG. 11.4.3-10 illustrates a side view of an example lens of an HMD.

FIG. 11.4.3-11 illustrates a side view of an example lens of an HMD.

XII: Curtain

FIG. 12.0-1 illustrates a view of an HMD.

12.1: Electronic Devices with Stretchable Fabric Covers

FIG. 12.1-1 is a top view of an illustrative head-mounted device in accordance with an embodiment.

FIG. 12.1-2 is a rear view of an illustrative head-mounted device in accordance with an embodiment.

FIG. 12.1-3 is a schematic diagram of an illustrative head-mounted device in accordance with an embodiment.

FIG. 12.1-4 is a top view of an illustrative head-mounted device in which left-eye and right-eye optical modules have been placed close to each other to accommodate a user with a small interpupillary distance in accordance with an embodiment.

FIG. 12.1-5 is a top view of the illustrative head-mounted device of FIG. 12.1-4 in which the optical modules have been moved away from each other to accommodate a user with a large interpupillary distance in accordance with an embodiment.

FIG. 12.1-6 is a front view of an illustrative cover layer with stretchable fabric in an unstretched state in accordance with an embodiment.

FIG. 12.1-7 is a front view of the illustrative cover layer of FIG. 12.1-6 with stretchable fabric in a stretched state in accordance with an embodiment.

FIG. 12.1-8 is a side view of an illustrative first strand that may be used in a cover layer of the type shown in FIGS. 12.1-6 and 12.1-7 in accordance with an embodiment.

FIG. 12.1-9 is a side view of an illustrative second strand that may be used in a cover layer of the type shown in FIGS. 12.1-6 and 12.1-7 in accordance with an embodiment.

FIG. 12.1-10 is a front view of an illustrative cover layer having regions with different levels of stretch and opacity in accordance with an embodiment.

FIG. 12.1-11 is a perspective view of an illustrative cover layer formed from a three-dimensional fabric in accordance with an embodiment.

12.2: Curtain Assembly

FIG. 12.2-1 illustrates a view of an example of an HMD.

FIG. 12.2-2 illustrates a rear perspective view of an example HMD including a curtain assembly.

FIG. 12.2-3 illustrates a rear view of an example HMD including a curtain assembly.

FIG. 12.2-4 illustrates a side cross-sectional view of an example HMD including a curtain assembly.

FIG. 12.2-5 illustrates a perspective view of an example of a curtain assembly of an HMD.

FIG. 12.2-6 illustrates an exploded view of an example of a curtain assembly of an HMD.

FIG. 12.2-7 illustrates a rear view of an example of a curtain assembly of an HMD.

FIG. 12.2-8 illustrates a partial view of an example curtain assembly.

FIG. 12.2-9 illustrates a partial view of an example curtain assembly.

FIG. 12.2-10 illustrates a partial view of an example curtain assembly.

FIG. 12.2-11 illustrates a partial view of an example curtain assembly.

FIG. 12.2-12 illustrates a partial view of an example curtain assembly.

FIG. 12.2-13 illustrates a partial view of an example curtain assembly.

XIII: Light Seal

FIG. 13.0-1 illustrates a view of an HMD.

FIG. 13.0-2A illustrates a front perspective view of a device seal according to one embodiment.

FIG. 13.0-2B illustrates a bottom-rear perspective view of the device seal of FIG. 13.0-2A.

FIG. 13.0-2C illustrates a rear view of the device seal of FIG. 13.0-2A.

13.1: Electronic Devices with Covering Structures

FIG. 13.1-1 is a top view of a head-mounted device.

FIG. 13.1-2 is a rear view of a head-mounted device.

FIG. 13.1-3 is a schematic diagram of a head-mounted device.

FIG. 13.1-4 is a top view of a head-mounted device with left-eye and right-eye optical modules.

FIG. 13.1-5 is a top view of the head-mounted device of FIG. 13.1-4 with the optical modules spaced further apart.

FIG. 13.1-6 is a cross-sectional side view of a head-mounted device with a fan.

FIG. 13.1-7 is an exploded perspective view of a curtain having a frame and a cover layer supported on the frame.

FIG. 13.1-8 is a top view of an optical module and a cover layer.

FIG. 13.1-9 is a view of a cover layer with a peripheral elastic band.

FIG. 13.1-10 is a view of a cover layer with woven elastic strands forming a peripheral elastic band.

FIG. 13.1-11 is a diagram of a cover layer formed from a material that stretches.

FIG. 13.1-12 is a view of a frame for a curtain.

FIG. 13.1-13 is a cross-sectional side view of a cover layer with a peripheral elastic band that moves relative to a rigid frame.

FIG. 13.1-14 is a cross-sectional top view of a head-mounted device with a floating curtain.

FIG. 13.1-15 is a rear view of a curtain with locations for attaching the curtain to a head-mounted device housing member.

FIG. 13.1-16 is a cross-sectional side view of a portion of a head-mounted device showing with a curtain attached to a head-mounted device housing member.

FIG. 13.1-17 is a top view of an apparatus with a movable member surrounded by a curtain.

13.2: Device with a Removable Cushion

FIG. 13.2-1 is a top view of an electronic device such as a head-mounted device.

FIG. 13.2-2 is top view of an optical module for an electronic device.

FIG. 13.2-3A is a cross-sectional top view of a head-mounted device with a removable cushion in an unattached state.

FIG. 13.2-3B is a cross-sectional top view of a head-mounted device with a removable cushion in an attached state.

FIG. 13.2-4 is a perspective view of a head-mounted support structure.

FIG. 13.2-5A is a rear view of a flexible structure of a head-mounted support structure attached to support posts.

FIG. 13.2-5B is a rear view of a removable cushion with high-rigidity portions configured to overlap support posts in a corresponding head-mounted support structure.

FIG. 13.2-6A is a rear view of a flexible structure with primary attachment structures and auxiliary attachment structures.

FIG. 13.2-6B is a rear view of a removable cushion with primary attachment structures and auxiliary attachment structures.

FIG. 13.2-7 is a cross-sectional top view of a head-mounted device with a removable cushion with magnets and recesses.

FIG. 13.2-8 is a rear view of a removable cushion with hinge structures.

FIG. 13.2-9 is a schematic diagram of a system that includes a head-mounted support structure and multiple removable cushions.

13.3: Electronic Devices with Light-Blocking Fabrics

FIG. 13.3-1 is a top view of a head-mounted device.

FIG. 13.3-2 is a rear view of a head-mounted device.

FIG. 13.3-3 is a schematic diagram of a head-mounted device.

FIG. 13.3-4 is a perspective view of a head-mounted device with a fabric-covered face frame.

FIG. 13.3-5A is a schematic diagram of a knitting system.

FIG. 13.3-5B is a schematic diagram of a knitting system.

FIG. 13.3-6 is a diagram of a portion of a weft knit fabric layer.

FIG. 13.3-7 is a cross-sectional side view of a light seal.

FIG. 13.3-8 is a perspective view of an inner fabric layer for a light seal.

FIG. 13.3-9 is a cross-sectional side view of a light seal.

13.4: Electronic Devices with Stretchable Fabrics

FIG. 13.4-6 is a diagram of a portion of a fabric layer with knit stitches.

FIG. 13.4-7 is a diagram of a portion of a fabric layer with knit stitches and miss stitches.

FIG. 13.4-8 is a diagram of a portion of a fabric layer with knit stitches and tuck stitches.

FIG. 13.4-9 is a knitting chart of a fabric layer may have a four-row-repeat-pattern with knit stitches and tuck stitches.

13.5: Contactless Sensors for a Head-Mountable Device

FIG. 13.5-1 shows a top view profile of a head-mountable device including a facial interface.

FIG. 13.5-2A shows a side view of a head-mountable device including a facial interface.

FIG. 13.5-2B shows a front view of a head-mountable device including a facial interface.

FIG. 13.5-3 shows a top view of a facial interface with a sensor.

FIG. 13.5-4 shows a top view of a facial interface with multiple sensors at various positions.

FIG. 13.5-5 shows yet another top view of a facial interface with multiple sensors at various positions.

FIG. 13.5-6A shows a top view of a facial interface with various components, including a sensor.

FIG. 13.5-6B shows a top view of a facial interface with various components, including a sensor.

FIGS. 13.5-7A-13.5-7B shows non-exploded and exploded perspective views of a facial interface with sensors.

13.6: Integrated Health Sensors

FIG. 13.6-1 shows a block diagram of a head-mountable device.

FIG. 13.6-2 shows a top view of an example head-mountable device.

FIG. 13.6-3 shows a rear perspective view of an example head-mountable device including a facial interface incorporated with sensors.

FIG. 13.6-4 shows a cross-sectional view of a facial interface with sensors disposed at various locations.

FIG. 13.6-5 shows a perspective view of a head-mountable device including sensors.

FIG. 13.6-6 shows a perspective view of a head-mountable device including a facial interface, a frame, and a plurality of electronic components.

13.7: Health Sensing Retention Band

FIG. 13.7-1 shows a schematic block diagram of a head-mountable device.

FIG. 13.7-2 shows a top view of a head-mountable device.

FIG. 13.7-3 shows a cross-sectional side view of a head-mountable device.

FIG. 13.7-4A shows a rear perspective view of a retention band.

FIG. 13.7-4B shows a side view of the retention band of FIG. 13.7-4A in an articulated position.

FIG. 13.7-4C shows a side view of the retention band of FIG. 13.7-4A in an articulated position.

FIG. 13.7-5 shows a perspective exploded view of a head-mountable device.

FIG. 13.7-6 shows a side view of a retention band having sensors.

13.8: Conductive Fabric Architecture

FIG. 13.8-1A shows a schematic block diagram of a head-mountable device.

FIG. 13.8-1B shows a top view of a head-mountable device.

FIG. 13.8-2 shows a bottom perspective view of a light seal.

FIG. 13.8-3 shows a top view of a head-mountable device.

FIG. 13.8-4A shows a conductive fabric in a neutral state.

FIG. 13.8-4B shows the conductive fabric of FIG. 13.8-4A in a compressed state.

FIG. 13.8-4C shows the conductive fabric of FIG. 13.8-4A in a stretched state.

FIG. 13.8-5A shows a conductive component on an exterior of a cover.

FIG. 13.8-5B shows a conductive component interwoven into a cover.

FIG. 13.8-5C shows a conductive component on an interior of a cover.

FIG. 13.8-5D shows free-floating conductive components.

FIG. 13.8-6 shows a side perspective view of a light seal.

FIG. 13.8-7 shows a bottom perspective view of a light seal.

13.9: Facial Interface Having Integrated Health Sensors

FIG. 13.9-1 shows a block diagram of a head-mountable device.

FIG. 13.9-2A shows a top view of a head-mountable device.

FIG. 13.9-2B shows a rear view of a facial interface for a head-mountable device.

FIG. 13.9-3 shows a rear perspective view of a facial interface with sensors disposed near a nasal region of a head-mountable device.

FIG. 13.9-4A shows an exploded perspective view of pressure sensor assembly of a head-mountable device.

FIG. 13.9-4B shows an assembled perspective view of a pressure sensor assembly of a head-mountable device.

FIG. 13.9-5A shows sensors disposed on a forehead region of a facial interface of a head-mountable device.

FIG. 13.9-5B shows sensors disposed on a forehead region of a facial interface of a head-mountable device.

FIG. 13.9-6 shows a cross-sectional view of a pressure sensors assembly of a head-mountable device.

13.10: Touch Sensitive Input Surface

FIG. 13.10-1A shows a schematic block diagram of a head-mountable device.

FIG. 13.10-1B shows a top view of a head-mountable device.

FIG. 13.10-2 shows a bottom perspective view of a light seal.

FIG. 13.10-3A shows a top view of a head-mountable device with conducive fabric in a light seal of the head-mountable device.

FIG. 13.10-3B shows a top view of a head-mountable device with a user engaging a touch sensitive surface of a light seal of the head-mountable device.

FIG. 13.10-4 shows a touch sensitive surface of a light seal of a head-mountable device.

FIG. 13.10-5 shows a touch sensitive surface of a light seal of a head-mountable device.

FIG. 13.10-6 shows a touch sensitive surface of a light seal of a head-mountable device.

FIG. 13.10-7 shows a head-mountable device with a sensor incorporated with a frame of the head-mountable device.

FIG. 13.10-8A shows a head-mountable device with a sensor incorporated with a frame of the head-mountable device.

FIG. 13.10-8B shows the head-mountable device of FIG. 13.10-8A with a user mechanically deflecting the frame of the head-mountable device.

13.11: Face Engaging Structures

FIG. 13.11-1 shows a top view of an example head-mountable device.

FIG. 13.11-2A shows a side view of an example head-mountable device.

FIG. 13.11-2B shows a front view of an example head-mountable device.

FIG. 13.11-3A shows a perspective view of a head-mountable device including a connector positioned at a forehead location.

FIGS. 13.11-3B-3E show various connector types.

FIG. 13.11-4A shows a perspective view of a head-mountable device including a connector positioned at the zygoma location.

FIGS. 13.11-4A-4H show various connector types.

FIG. 13.11-5A shows a perspective view of a head-mountable device including a facial interface.

FIGS. 13.11-5B-5G show various facial interfaces.

FIGS. 13.11-6A-6B show another variation of a facial interface.

FIG. 13.11-7A shows a perspective view of a display including a display frame.

FIG. 13.11-7B shows an exploded perspective view of a display including display frame.

FIGS. 13.11-8A-8B show a display frame with a relief cutout.

FIG. 13.11-9A shows a head-mountable device with no relief cutout.

FIG. 13.11-9B shows a head-mountable device with a relief cutout.

FIGS. 13.11-10A-10B show a head-mountable device with a relief cutout at various locations.

FIGS. 13.11-11A-11C show a display frame with a relief cutout.

FIG. 13.11-12 shows a display frame with thru-holes.

FIG. 13.11-13 shows a display frame with stiffeners.

FIG. 13.11-14A is a top view of a frame for a device seal including stiffeners.

FIG. 13.11-14B is a cross-sectional view of the frame of FIG. 13.11-14A.

FIG. 13.11-14C is a bottom view of the frame of FIG. 13.11-14A.

FIG. 13.11-14D is a top view of the frame of FIG. 13.11-14A.

FIG. 13.11-14 shows a perspective view of an example connector.

FIG. 13.11-15A shows a side view of an example connector positioned between a display frame and a facial interface.

FIG. 13.11-15B shows an example facial interface.

FIGS. 13.11-15C-13.11-15D show example cross-sections of the facial interface shown in FIG. 13.11-15B.

FIG. 13.11-16 shows a cross-sectional view of an example connector with a connector frame and post.

FIG. 13.11-17 shows a top view of an example connector.

FIG. 13.11-18 shows a side perspective view of a base of an example connector where attached to an example display frame.

FIG. 13.11-19 shows another cross-sectional view of an example connector.

FIGS. 13.11-20-13.11-21 respectively show perspective and top views of example adhesives in an example head-mountable device.

13.12: Face Engaging Structure

FIG. 13.12-1 shows a top view of a head-mountable device including a facial interface.

FIG. 13.12-2A shows a side view of a head-mountable device including a facial interface connected to a display.

FIG. 13.12-2B shows a top view of a head-mountable device including a facial interface connected to a display.

FIG. 13.12-3 shows a perspective view of a head-mountable device including a facial interface and an example connector.

FIG. 13.12-4A shows a perspective view of a head-mountable device with an example connector between a display and a facial interface.

FIG. 13.12-4B shows a front view of an example connector.

FIG. 13.12-4C shows a side view of an example connector portion.

FIGS. 13.12-5A-13.12-5B show views of a connector in example positional states.

FIG. 13.12-6A shows a perspective view of a head-mountable device including a facial interface and another example connector.

FIG. 13.12-6B shows a top view of an example connector.

FIGS. 13.12-7A-13.12-7B show side views of another connector in example positional states.

FIGS. 13.12-8A-13.12-8B show schematic views of an example sliding connector.

FIG. 13.12-9A shows a bottom view of another example head-mountable device.

FIGS. 13.12-9B-13.12-9F show various positions of a connector of a head-mountable device.

FIG. 13.12-10 shows a cutaway view of an example connector.

FIG. 13.12-11 shows a perspective view of another example connector.

FIG. 13.12-12 shows a side view of yet another example connector.

13.13: Adjustment Mechanism

FIG. 13.13-1 shows a top view profile of a head-mountable device including a facial interface.

FIG. 13.13-2A shows a side view profile of a head-mountable device including a facial interface.

FIG. 13.13-2B shows a top view profile of a head-mountable device including a facial interface.

FIGS. 13.13-3A-13.13-3D show exemplary locations of adjustment mechanism of a head-mountable device.

FIGS. 13.13-4A-13.13-4C show exemplary translatable positions of an adjustment mechanism.

FIGS. 13.13-5A-13.13-5C show exemplary rotatable positions of an adjustment mechanism of a head-mountable device.

FIGS. 13.13-6A-13.13-6B show an exemplary adjustment mechanism.

FIGS. 13.13-7A-13.13-7B show an exemplary rotatable adjustment mechanism.

FIG. 13.13-8 shows another exemplary adjustment mechanism.

FIGS. 13.13-9A-13.13-24B respectively show example head-mountable devices with an actuator control.

FIGS. 13.13-25A-13.13-25D show an example head-mountable device with an example connection and corresponding actuator control.

FIG. 13.13-26 shows an example connection of a head-mountable device.

FIG. 13.13-27 shows another example connection of a head-mountable device.

FIGS. 13.13-28-13.13-30 respectively show top, front, and side views of another example head-mountable device.

FIGS. 13.13-31-13.13-33 respectively show a perspective view of lock-slider disengagement, a front view of lock-slider disengagement, and a front view of lock-slider engagement of a portion of a linear adjustment connection.

FIG. 13.13-34 illustrates a perspective view of a portion of a head-mountable device having multiple linear adjustment connections, according to one exemplary embodiment.

13.14: Nosepiece

FIG. 13.14-1 is a diagram of an illustrative electronic device in accordance with an embodiment.

FIG. 13.14-2 is a front view of an illustrative electronic device with a light-shielding structure in accordance with an embodiment.

FIG. 13.14-3 is a diagram of an illustrative light-shielding structure having a fabric cover in accordance with an embodiment.

FIG. 13.14-4 is a front view of an illustrative light-shielding structure having a structural frame in accordance with an embodiment.

FIG. 13.14-5 is a side view of an illustrative light-shielding structure having a fabric and elastomer layers in accordance with an embodiment.

FIG. 13.14-6 is a front view of an illustrative light-shielding structure having an extension in accordance with an embodiment.

FIG. 13.14-7 is a side view of an illustrative light-shielding structure having an embedded service loop in accordance with an embodiment.

FIG. 13.14-8 is a side view of an illustrative light-shielding structure having an embedded deformable stiffener in accordance with an embodiment.

FIG. 13.14-9A is a side view of an illustrative light-shielding structure having a rolled edge in accordance with an embodiment.

FIG. 13.14-9B is a side view of an illustrative light-shielding structure having embedded foam in accordance with an embodiment.

FIG. 13.14-9C is a top view of an illustrative light-shielding structure having a crumple zone in accordance with an embodiment.

FIG. 13.14-9D is a side view of an illustrative light-shielding structure having a hemmed edge in accordance with an embodiment.

FIG. 13.14-9E is a top view of an illustrative light-shielding structure having a foam in corner regions in accordance with an embodiment.

FIG. 13.14-9F is a side view of an illustrative light-shielding structure having segmented foam or elastomeric regions in accordance with an embodiment FIG. 13.14-9G is a side view of an illustrative light-shielding structure having a stiffener and a foam layer in accordance with an embodiment.

FIG. 13.14-10 is a front view of an illustrative light-shielding structure having a semi-rigid stiffener in accordance with an embodiment.

13.15: Removable Facial Interface

FIG. 13.15-1A is a schematic block diagram of an example of a head-mountable device.

FIG. 13.15-1B is a top view of an example of a head-mountable device.

FIG. 13.15-2A is a perspective view of an example of a device seal.

FIG. 13.15-2B is a perspective view of an example of a facial interface frame.

FIG. 13.15-2C is a perspective view of an example of a facial interface frame and a removable facial interface.

FIG. 13.15-2D is a cross-sectional view of an example of a facial interface shim.

FIG. 13.15-3A is a perspective view of an example of a device seal.

FIG. 13.15-3B is a plan view of an example of a removable facial interface.

FIG. 13.15-4 is a cross-sectional view of an example of a magnetic attachment mechanism.

FIG. 13.15-5A is a cross-sectional view of an example of an interlocking attachment mechanism.

FIG. 13.15-5B is a cross-sectional view of an example of an interlocking attachment mechanism.

FIG. 13.15-6 is a cross-sectional view of an example of a magnetic slide attachment mechanism.

FIG. 13.15-7 is a cross-sectional view of an example of a hook-and-loop attachment mechanism.

FIG. 13.15-8 is a cross-sectional view of an example of a magnetic attachment mechanism.

FIG. 13.15-9 is a cross-sectional view of an example of a spring snap attachment mechanism.

FIG. 13.15-10 is a cross-sectional view of an example of an interlocking attachment mechanism.

FIG. 13.15-11 is a cross-sectional view of an example of a suction attachment mechanism.

FIG. 13.15-12 is a cross-sectional view of an example of a bi-stable attachment mechanism.

FIG. 13.15-13A is a plan view of an example of a removable facial interface.

FIG. 13.15-13B is a plan view of an example of a removable facial interface.

FIG. 13.15-14 is a cross-sectional view of an example facial interface.

FIG. 13.15-15A is a cross-sectional view of a compressible portion.

FIG. 13.15-15B is a cross-sectional view of a compressible portion.

FIG. 13.15-15C is a cross-sectional view of a compressible portion.

13.16: Electronic Devices with Light Blocking Structures

FIG. 13.16-1 is a diagram of an illustrative electronic device in accordance with an embodiment.

FIG. 13.16-2 is a front view of an illustrative electronic device with a light-shielding structure in accordance with an embodiment.

FIG. 13.16-3 is a diagram of an illustrative light-shielding structure having a fabric cover in accordance with an embodiment.

FIGS. 13.16-4A and 13.16-4B are front views of illustrative elastomeric layers that may be used in a nosepiece in accordance with some embodiments.

FIG. 13.16-5 is a front view of an illustrative light-shielding structure having a structural frame in accordance with an embodiment.

FIG. 13.16-6 is a side view of an illustrative light-shielding structure having a fabric and elastomer layers in accordance with an embodiment.

FIG. 13.16-7 is a front view of an illustrative light-shielding structure having an extension in accordance with an embodiment.

FIG. 13.16-8 is a side view of an illustrative light-shielding structure having an embedded service loop in accordance with an embodiment.

FIG. 13.16-9 is a side view of an illustrative light-shielding structure having an embedded deformable stiffener in accordance with an embodiment.

FIG. 13.16-10A is a side view of an illustrative light-shielding structure having a rolled edge in accordance with an embodiment.

FIG. 13.16-10B is a side view of an illustrative light-shielding structure having embedded foam in accordance with an embodiment.

FIG. 13.16-10C is a top view of an illustrative light-shielding structure having a crumple zone in accordance with an embodiment.

FIG. 13.16-10D is a side view of an illustrative light-shielding structure having a hemmed edge in accordance with an embodiment.

FIG. 13.16-10E is a top view of an illustrative light-shielding structure having a foam in corner regions in accordance with an embodiment.

FIG. 13.16-10F is a side view of an illustrative light-shielding structure having segmented foam or elastomeric regions in accordance with an embodiment.

FIG. 13.16-10G is a side view of an illustrative light-shielding structure having a stiffener and a foam layer in accordance with an embodiment.

FIG. 13.16-11 is a front view of an illustrative light-shielding structure having a semi-rigid stiffener in accordance with an embodiment.

FIG. 13.16-12 is a perspective view of an illustrative light-shield structure formed from multiple fabric layers in accordance with an embodiment.

XIV: Powerstraps and Securement Band

FIG. 14.0-1 illustrates a view of an HMD.

14.1: Electrical Connectors

FIG. 14.1-1A shows a perspective side view of an electronic device.

FIG. 14.1-1B shows a perspective side view of the electronic device of FIG. 14.1-1A.

FIG. 14.1-2 shows a perspective view of a display, a support, and a plug connector.

FIG. 14.1-3A shows a perspective view of a receptacle connector.

FIG. 14.1-3B shows a perspective view of a plug connector.

FIG. 14.1-4 shows an exploded view of a receptacle connector.

FIG. 14.1-5A shows a front view of a receptacle connector.

FIG. 14.1-5B shows a partial cut-away front view of the receptacle connector of FIG. 14.1-5A.

FIG. 14.1-6A shows a side sectional view of a receptacle connector.

FIG. 14.1-6B shows a side sectional view of a receptacle connector.

FIG. 14.1-7A shows a detail perspective view of a receptacle connector.

FIG. 14.1-7B shows a detail perspective view of a plug connector.

FIG. 14.1-8A shows a sectional view of a plug connector inserted into a receptacle connector.

FIG. 14.1-8B shows a detail sectional view of the plug connector inserted into the receptacle connector of FIG. 14.1-8A.

FIG. 14.1-9A shows a detail sectional view of a plug connector inserted into a receptacle connector.

FIG. 14.1-9B shows a detail sectional view of the plug connector inserted into the receptacle connector of FIG. 14.1-9A.

FIG. 14.1-9C shows a detail sectional view of a plug connector inserted into a receptacle connector.

FIG. 14.1-9D shows a detail sectional view of the plug connector inserted into the receptacle connector of FIG. 14.1-9C.

FIG. 14.1-9E shows a detail sectional view of a plug connector inserted into a receptacle connector.

FIG. 14.1-9F shows a detail sectional view of the plug connector inserted into the receptacle connector of FIG. 14.1-9E.

FIG. 14.1-10 shows a sectional view of a tool ejecting a plug connector from a receptacle connector.

FIGS. 14.1-11A through 14.1-11D show perspective views of tools for ejecting plug connectors from receptacle connectors.

FIG. 14.1-12A shows a front view of a receptacle connector.

FIG. 14.1-12B shows a front view of a plug connector.

FIG. 14.1-13A shows a sectional view of a receptacle connector.

FIGS. 14.1-13B through 14.1-13D show detail sectional views of seals of the receptacle connector of FIG. 14.1-13A.

FIG. 14.1-14A shows a perspective view of a receptacle connector.

FIG. 14.1-14B shows a detail sectional view of a fastener of the receptacle connector of FIG. 14.1-14A.

FIG. 14.1-15 shows a perspective view of a receptacle connector, a plug connector, and a housing.

FIG. 14.1-16A shows a side sectional view of a receptacle connector and a plug connector.

FIG. 14.1-16B shows a side view of the plug connector of FIG. 14.1-16A.

FIG. 14.1-17A shows a side view of a plug connector.

FIG. 14.1-17B shows a bottom-up view of the plug connector of FIG. 14.1-17A.

FIG. 14.1-18A shows a perspective view of a receptacle connector.

FIG. 14.1-18B shows a top-down view of the receptacle connector of FIG. 14.1-18A.

FIG. 14.1-18C shows a side sectional view of the receptacle connector of FIG. 14.1-18A.

FIG. 14.1-18D shows a side sectional view of the receptacle connector of FIG. 14.1-18A and a plug connector.

FIG. 14.1-18E shows a side sectional view of the receptacle connector of FIG. 14.1-18A and the plug connector of FIG. 14.1-18D.

FIG. 14.1-19A shows a detail top-down view of a receptacle connector.

FIG. 14.1-19B shows a perspective view of a detent of the receptacle connector of FIG. 14.1-19A.

FIG. 14.1-19C shows a sectional view of the detent of FIG. 14.1-19B and a plug connector.

FIG. 14.1-19D shows a detail top-down view of a receptacle connector.

FIG. 14.1-19E shows a perspective view of a detent of the receptacle connector of FIG. 14.1-19D.

FIG. 14.1-19F shows a sectional view of the detent of FIG. 14.1-19E and a plug connector.

FIG. 14.1-19G shows a detail top-down view of a receptacle connector.

FIG. 14.1-19H shows a perspective view of a detent of the receptacle connector of FIG. 14.1-19G.

FIG. 14.1-19I shows a detail top-down view of a receptacle connector.

FIG. 14.1-19J shows a perspective view of a detent of the receptacle connector of FIG. 14.1-19I.

FIG. 14.1-19K shows a sectional view of the detent of FIG. 14.1-19J and a plug connector.

FIG. 14.1-19L shows a detail top-down view of a receptacle connector.

FIG. 14.1-19M shows a perspective view of a detent of the receptacle connector of FIG. 14.1-19L.

FIG. 14.1-20A shows a bottom view of a receptacle connector and a plug connector.

FIG. 14.1-20B shows a bottom view of a receptacle connector and a plug connector.

FIG. 14.1-21A shows a bottom view of a receptacle connector and a plug connector.

FIG. 14.1-21B shows a bottom view of a receptacle connector and a plug connector.

FIG. 14.1-22A through 14.1-22E show sectional side views of a receptacle connector, a plug connector, and seals between the receptacle connector and the plug connector.

FIGS. 14.1-23A through 14.1-23G show sectional side views of a receptacle connector, a plug connector, and seals between the receptacle connector and the plug connector.

FIGS. 14.1-24A and 14.1-24B show exploded views of receptacle connectors.

FIGS. 14.1-25A and 14.1-25B show exploded views of receptacle connectors.

FIG. 14.1-26A shows a perspective view of an electronic device.

FIG. 14.1-26B shows a perspective view of the electronic device of FIG. 14.1-26A and a plug connector.

FIG. 14.1-27A shows a perspective view of a plug connector inserted into an electronic device.

FIG. 14.1-27B shows a partially exploded view of the plug connector of FIG. 14.1-27A, a trim ring, and a receptacle connector.

FIG. 14.1-28A shows a sectional view of a plug connector being inserted into a trim ring and a receptacle connector.

FIG. 14.1-28B shows a detail sectional view of the plug connector and a latch of the trim ring of FIG. 14.1-28A.

FIG. 14.1-28C shows a sectional view of the plug connector being inserted into the trim ring and the receptacle connector of FIG. 14.1-28A.

FIG. 14.1-28D shows a sectional view of the plug connector inserted into the trim ring and the receptacle connector of FIG. 14.1-28A.

FIG. 14.1-28E shows a sectional view of the plug connector being un-latched from the trim ring and the receptacle connector of FIGS. 14.1-28A.

FIG. 14.1-28F shows a perspective view of a lever arm of the trim ring of FIG. 14.1-28A.

FIG. 14.1-29A shows a sectional view of a plug connector in a trim ring and a receptacle connector.

FIG. 14.1-29B shows a sectional view of a tool used to un-latch the plug connector from the trim ring and the receptacle connector of FIG. 14.1-29A.

FIG. 14.1-29C shows a perspective view of the plug connector and the trim ring of FIG. 14.1-29A.

FIG. 14.1-29D shows a sectional view of the trim ring of FIG. 14.1-29A.

FIG. 14.1-29E shows a perspective view of a lever arm of the trim ring of FIG. 14.1-29A.

FIG. 14.1-30A shows a perspective view of a plug connector and a trim ring.

FIG. 14.1-30B shows a sectional view of the plug connector inserted in the trim ring of FIG. 14.1-30A and a receptacle connector.

FIG. 14.1-30C shows a sectional view of the plug connector inserted in the trim ring and the receptacle connector of FIG. 14.1-30B.

FIG. 14.1-31A shows a sectional view of a plug connector being inserted into a trim ring and a receptacle connector.

FIG. 14.1-31B shows a sectional view of the plug connector being un-latched from into the trim ring and the receptacle connector of FIG. 14.1-31A.

FIG. 14.1-32A through 14.1-32C show perspective views of a trim ring and a receptacle connector being assembled in a housing.

FIG. 14.1-33A shows a top-down view of a plug connector being inserted into a trim ring and a receptacle connector.

FIG. 14.1-33B shows a detail view of the trim ring and the plug connector of FIG. 14.1-33A prior to the trim ring latching with the receptacle connector.

FIG. 14.1-33C shows a top-down view of the plug connector latched in the trim ring and the receptacle connector of FIG. 14.1-33A.

FIG. 14.1-33D shows a detail view of the trim ring and the plug connector of FIG. 14.1-33C with the plug connector latched in the trim ring.

FIG. 14.1-33E shows a top-down view of the plug connector being un-latched from the trim ring and the receptacle connector of FIG. 14.1-33A.

FIG. 14.1-33F shows a detail view of the trim ring and the plug connector of FIG. 14.1-33E with the plug connector un-latched from the trim ring.

FIGS. 14.1-34A and 14.1-34B show perspective views of a plug connector inserted into a trim ring and a receptacle connector.

FIG. 14.1-35A shows an exploded view of a receptacle connector.

FIG. 14.1-35B shows a side sectional view of the receptacle connector of FIG. 14.1-35A.

FIGS. 14.1-36A and 14.1-36B respectively illustrate a semi-transparent view and a solid view of an electrical connector portion.

FIGS. 14.1-37 through 14.1-38 illustrate respective top and bottom views of an electrical connector portion.

FIG. 14.1-39 illustrates example method steps for manufacturing an electrical connector portion.

FIG. 14.1-40 depicts example method steps of providing an interface connector to an electrical connector portion.

FIGS. 14.1-41A and 14.1-41B show side schematic views of the assembling an interface connector to an electrical connector portion.

14.2: Modular Components for Wearable Electronic Devices

FIG. 14.2-1A shows a wearable electronic device being worn by a user.

FIG. 14.2-1B shows a top view of the wearable electronic device of FIG. 14.2-1A.

FIG. 14.2-1C shows an exploded view of the wearable electronic device of FIG. 14.2-1A.

FIG. 14.2-2A shows an exploded view of a wearable electronic device.

FIG. 14.2-2B shows a side view of a component of the wearable electronic device of FIG. 14.2-2A.

FIG. 14.2-2C shows a side view of a component of the wearable electronic device of FIG. 14.2-2A.

FIG. 14.2-2D shows a cross-sectional view of the component of FIG. 14.2-2C.

FIG. 14.2-3 shows a side view of a component of a wearable electronic device.

FIG. 14.2-4 shows a side view of a component of a wearable electronic device.

FIG. 14.2-5A shows a top view of a component of a wearable electronic device.

FIG. 14.2-5B shows a side view of the component of FIG. 14.2-5A.

FIG. 14.2-5C shows a cross-sectional view of the component of FIG. 14.2-5A.

FIG. 14.2-6A shows a top view of a component of a wearable electronic device.

FIG. 14.2-6B shows a side view of the component of FIG. 14.2-6A.

FIG. 14.2-6C shows a cross-sectional view of the component of FIG. 14.2-6A.

FIG. 14.2-7A shows a top view of a component of a wearable electronic device.

FIG. 14.2-7B shows a side view of the component of FIG. 14.2-7A.

FIG. 14.2-7C shows a cross-sectional view of the component of FIG. 14.2-7A.

FIG. 14.2-8A shows a top view of a component of a wearable electronic device.

FIG. 14.2-8B shows a side view of the component of 14.2-FIG. 8A.

FIG. 14.2-8C shows a cross-sectional view of the component of FIG. 14.2-8A.

FIG. 14.2-9A shows a top view of a component of a wearable electronic device.

FIG. 14.2-9B shows a side view of the component of FIG. 14.2-9A.

FIG. 14.2-9C shows a cross-sectional view of the component of FIG. 14.2-9A.

FIG. 14.2-10A shows a top view of a component of a wearable electronic device.

FIG. 14.2-10B shows a side view of the component of FIG. 14.2-10A.

FIG. 14.2-10C shows a cross-sectional view of the component of FIG. 14.2-10A.

FIG. 14.2-11 shows an exploded view of a wearable electronic device.

FIG. 14.2-12 shows an exploded view of a wearable electronic device.

FIG. 14.2-13 exploded view of a wearable electronic device.

14.3: Modular Strap for an Electronic Device

FIG. 14.3-1 shows a top view of an example of an electronic device donned by a user.

FIG. 14.3-2 shows a perspective view of an example of an electronic device.

FIG. 14.3-3 shows an exploded perspective view of an example of an electronic device.

FIG. 14.3-4 shows a side profile view of an example removable strap of an HMD system.

FIG. 14.3-5 shows a top cross-sectional profile view of an example electronics pod.

FIG. 14.3-6 shows a top view of another example of an electronic device donned by a user.

FIG. 14.3-7 and 14.3-8 show example cable management mechanisms of an example HMD system.

14.4: Devices with Detachable Headbands

FIG. 14.4-1 is a side view of an electronic device with a detachable headband.

FIG. 14.4-2 is a view of a detachable headband.

FIG. 14.4-3 is a cross-sectional side view of a portion of a detachable headband.

FIG. 14.4-4 is a top view of a spring.

FIG. 14.4-5 is a diagram of a detachable headband having a latch with a release tab.

FIG. 14.4-6 is a cross-sectional side view of a detachable headband with a release tab.

FIG. 14.4-7 is a top view of a magnet arrangement.

FIGS. 14.4-8, 14.4-9, and 14.4-10 are diagrams showing latch biasing mechanisms.

FIG. 14.4-11 is a cross-sectional side view of a latch biasing mechanism.

FIGS. 14.4-12 and 14.4-13 are cross-sectional side views of detachable headbands.

FIG. 14.4-14 is a perspective view of a detachable headband with recesses.

FIG. 14.4-15 is a top view of a headband attachment post.

FIG. 14.4-16 is a cross-sectional side view of a headband attachment post.

FIG. 14.4-17 is a cross-sectional side view of a headband attachment post with a recess and a corresponding detachable headband.

14.5: Cable Tensioning System and Dial

FIG. 14.5-1 is a side view of an example of a head-mountable display device with an adjustable headband;

FIG. 14.5-2 is a plan view of an example of an adjustable headband;

FIG. 14.5-3 is a perspective view of an example of a tensioning system for an adjustable headband;

FIG. 14.5-4 is a partially exploded view of an example of a tensioning system for an adjustable headband;

FIG. 14.5-5 is a partial cross-sectional view of an example of a tensioning system for an adjustable headband;

FIG. 14.5-6 is a partially exploded view of an example of a dial cap for a tensioning system;

FIGS. 14.5-7A and 14.5-7B are partial cross-sectional views of an example of a disc-type angular restraint system;

FIG. 14.5-8 is partial cross-sectional view of an example of a dial cap including a spring detent mechanism; and FIG. 14.5-9A through 14.5-9C are perspective views of an example of angular restraint systems.

14.6: Two-Part Speaker System

FIG. 14.6-1A shows a side view of an electronic device.

FIG. 14.6-1B shows a perspective view of an electronic device.

FIG. 14.6-1C shows a perspective view of an electronic device.

FIG. 14.6-1D shows a perspective view of an electronic device.

FIG. 14.6-2 shows a cross-sectional side view of a speaker assembly.

FIG. 14.6-3A shows a perspective view of a speaker assembly.

FIG. 14.6-3B shows a cross-sectional side view of a speaker assembly.

FIG. 14.6-3C shows a cross-sectional perspective view of a speaker assembly.

FIG. 14.6-3D shows a top perspective view of a speaker assembly.

FIG. 14.6-3E shows a bottom perspective view of a speaker assembly.

FIG. 14.6-4 shows a perspective exploded view of a port barrier.

14.7: Bifurcated Band

FIG. 14.7-1 is a side view of an illustrative electronic device such as a head-mounted display device with an adjustable headband in accordance with some embodiments.

FIGS. 14.7-2A and 14.7-2B are side views of opposing sides of an illustrative headband in accordance with some embodiments.

FIG. 14.7-3 is an illustrative front view of an edge of a headband in accordance with some embodiments.

FIG. 14.7-4 is a side view of an illustrative headband with a seam that is invisible to a naked eye in accordance with some embodiments.

FIG. 14.7-5 is a side view of an illustrative headband having stiffeners on a surface of the headband in accordance with some embodiments.

FIGS. 14.7-6A-14.7-6C are side views of illustrative stiffeners that may be incorporated onto a surface of a headband in accordance with some embodiments.

FIG. 14.7-7 is a side view of an illustrative headband having embedded stiffeners in accordance with some embodiments.

FIG. 14.7-8 is a perspective view of an illustrative stiffener in a channel of a headband in accordance with some embodiments.

FIGS. 14.7-9A and 14.7-9B are side views of illustrative headbands with local stiffeners that change the curvature of the headband when under tension in accordance with some embodiments.

14.8: Over the Head Strap

FIG. 14.8-1 is a side view of an illustrative electronic device such as a head-mounted display device with a detachable headband in accordance with some embodiments.

FIG. 14.8-2 is a perspective view of an illustrative headband with a post that couples to a post on a head-mounted structure in accordance with some embodiments.

FIG. 14.8-3 is a cross-sectional side view of an illustrative headband with a post that couples to a post on a head-mounted structure in accordance with some embodiments.

FIG. 14.8-4 is a cross-sectional side view of an illustrative detachable headband with a release tab in accordance with some embodiments.

FIG. 14.8-5 is a perspective view of an illustrative headband with a magnet that couples to a post on a head-mounted structure in accordance with some embodiments.

FIG. 14.8-6 is a cross-sectional side view of an illustrative headband with a magnet that couples to a post on a head-mounted structure in accordance with some embodiments.

FIG. 14.8-7 is a cross-sectional side view of an illustrative headband with a magnet and a protrusion that couples to a post with a recess on a head-mounted structure in accordance with some embodiments.

FIG. 14.8-8 is a perspective view of an illustrative headband that has portions that wrap around a head-mounted support structure to attach to the support structure in accordance with some embodiments.

FIG. 14.8-9 is a perspective view of an illustrative headband that attaches to a head-mounted support structure with a lug and socket system in accordance with some embodiments.

FIG. 14.8-10 is a cross-sectional side view of two illustrative headbands that attach to a head-mounted support structure with latches in accordance with some embodiments FIG. 14.8-11 is a cross-sectional side view of two illustrative headbands, one of which attaches to a head-mounted support structure with a latch, and one of which attaches to the head-mounted support structure with a protrusion, in accordance with some embodiments FIG. 14.8-12 is a diagram of an illustrative headband that attaches to a head-mounted support structure with a twist-to-lock system in accordance with some embodiments.

FIG. 14.8-13 is a perspective view of an illustrative headband that has an opening to surround a post of a head-mounted support structure in accordance with some embodiments.

FIG. 14.8-14 is a cross-sectional side view of an illustrative headband that has an opening to surround a post of a head-mounted support structure in accordance with some embodiments.

FIG. 14.8-15A and 14.8-15B are perspective views of an illustrative post with an extendable magnet in accordance with some embodiments.

FIG. 14.8-16 is a perspective view of an illustrative headband with an opening to receive a magnet and couple to a head-mounted support structure in accordance with some embodiments.

FIGS. 14.8-17A and 14.8-17B are cross-sectional side views of an illustrative headband engaging with an extendable magnet of a post in accordance with some embodiments.

XV: User Interface

Figures 1, 15:
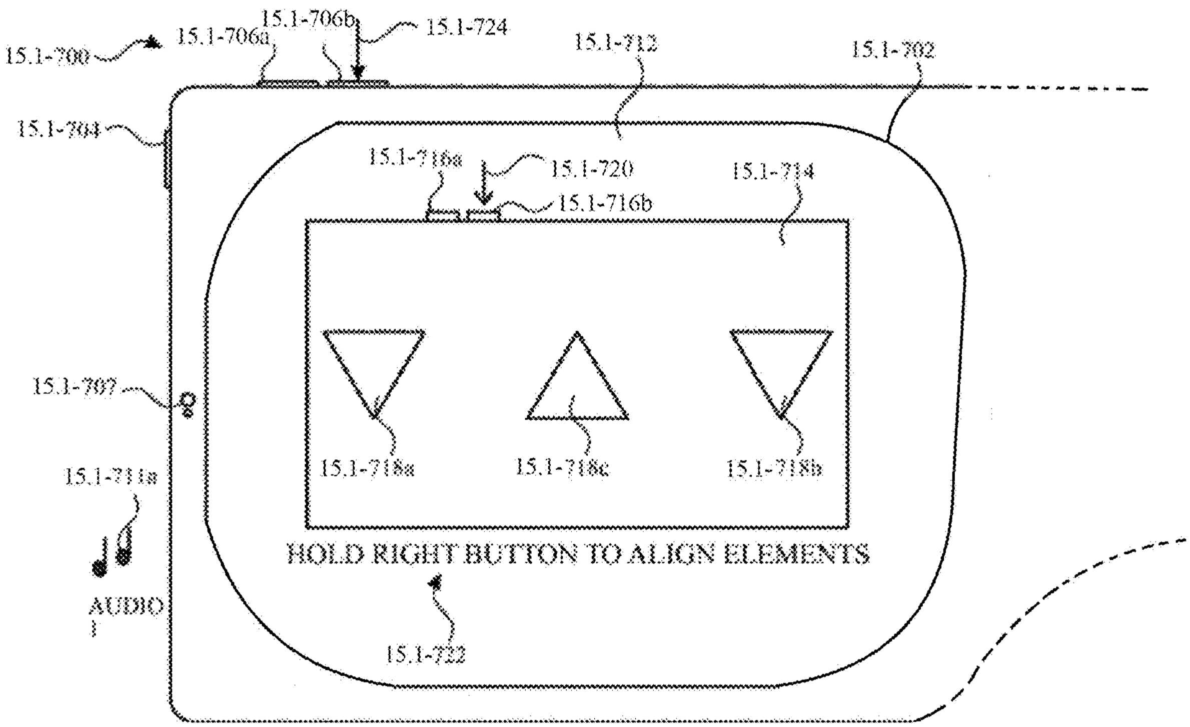

FIG. 15-1 shows an example user interface displayed by a display module of an HMD.

Figures 2A, 15:
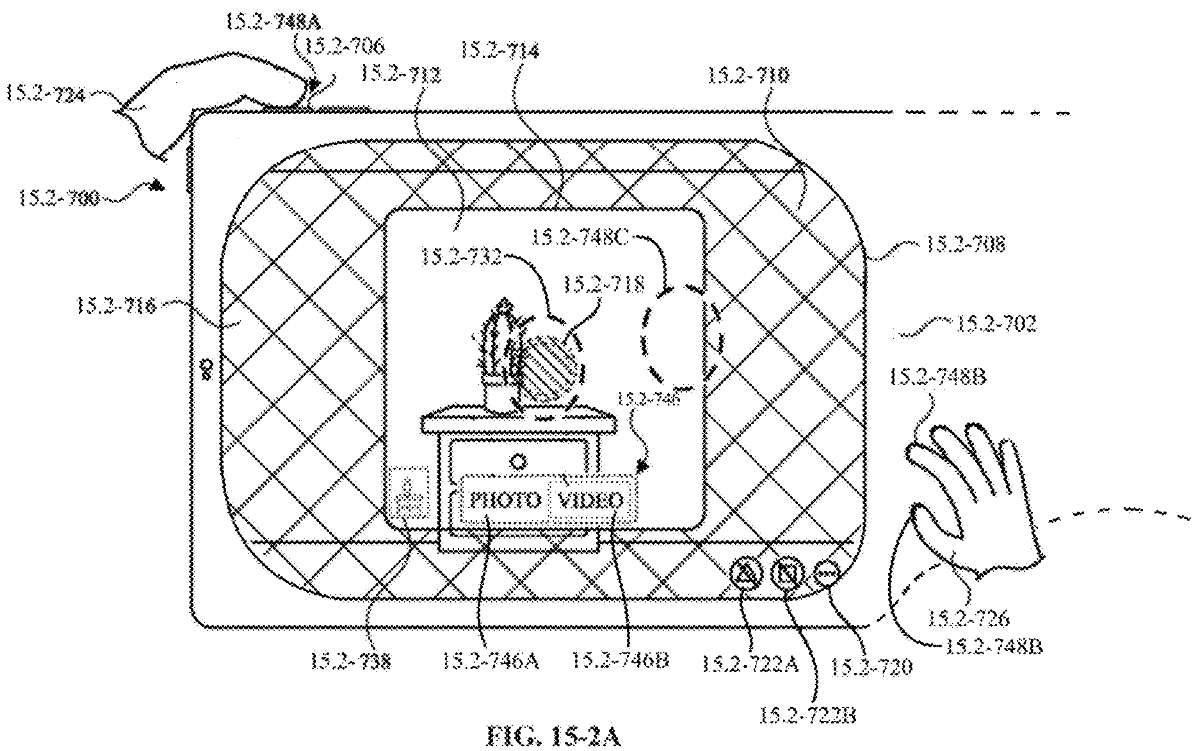

FIG. 15-2A shows an example user interface displayed by a display module of an HMD.

Figures 2B, 15:
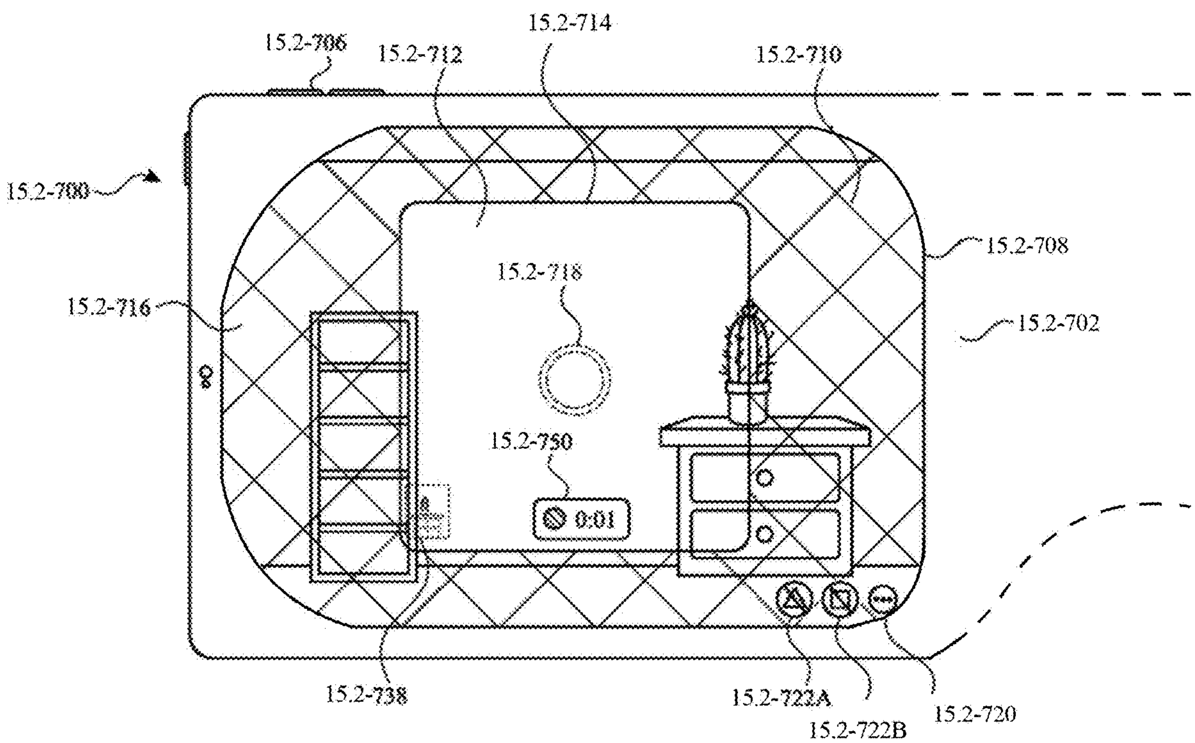

FIG. 15-2B shows an example user interface displayed by a display module of an HMD.

Figures 3A, 15:
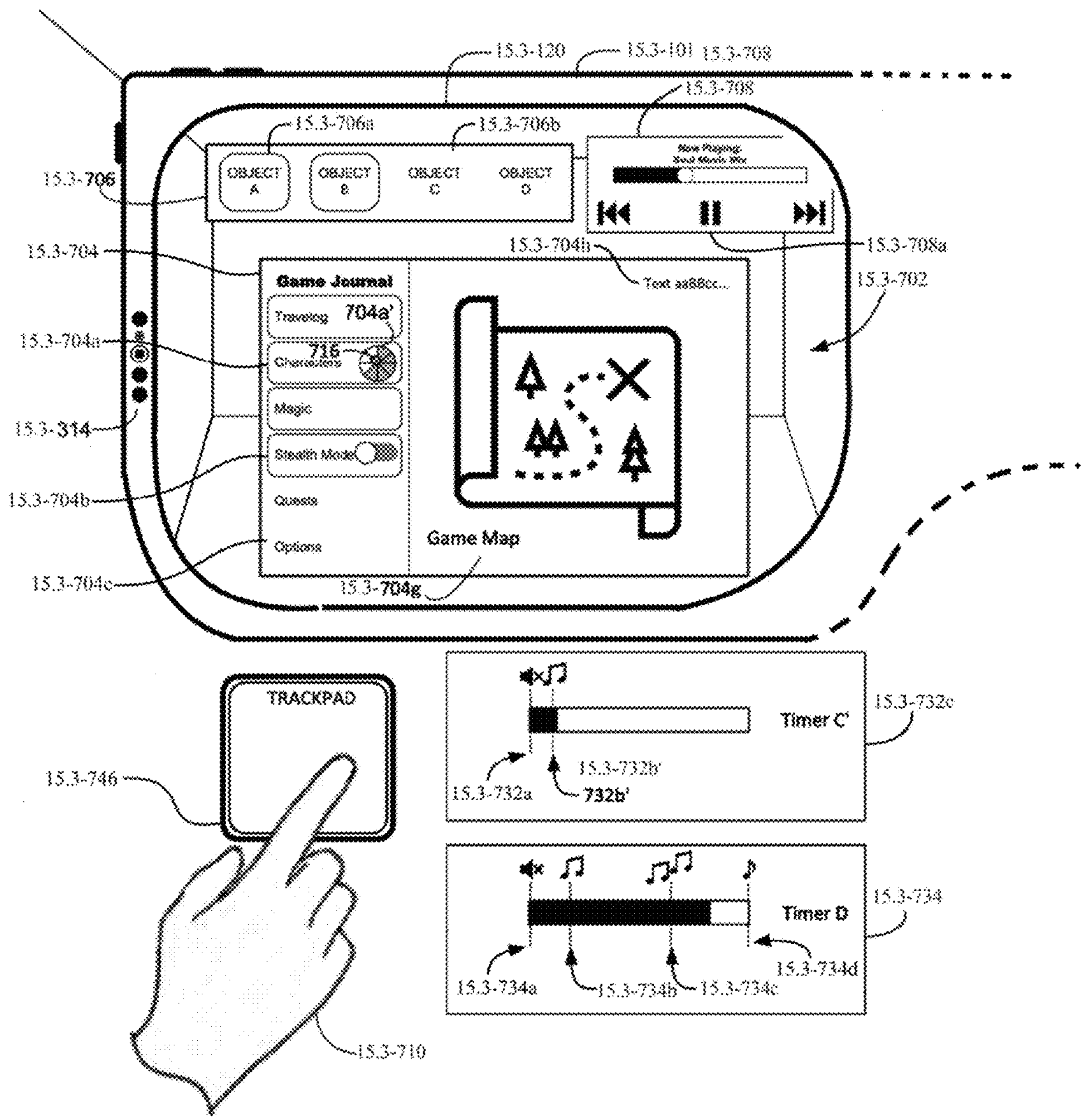

FIG. 15-3A shows an example of a user interface of a display module of an electronic device.

Figures 3B, 15:
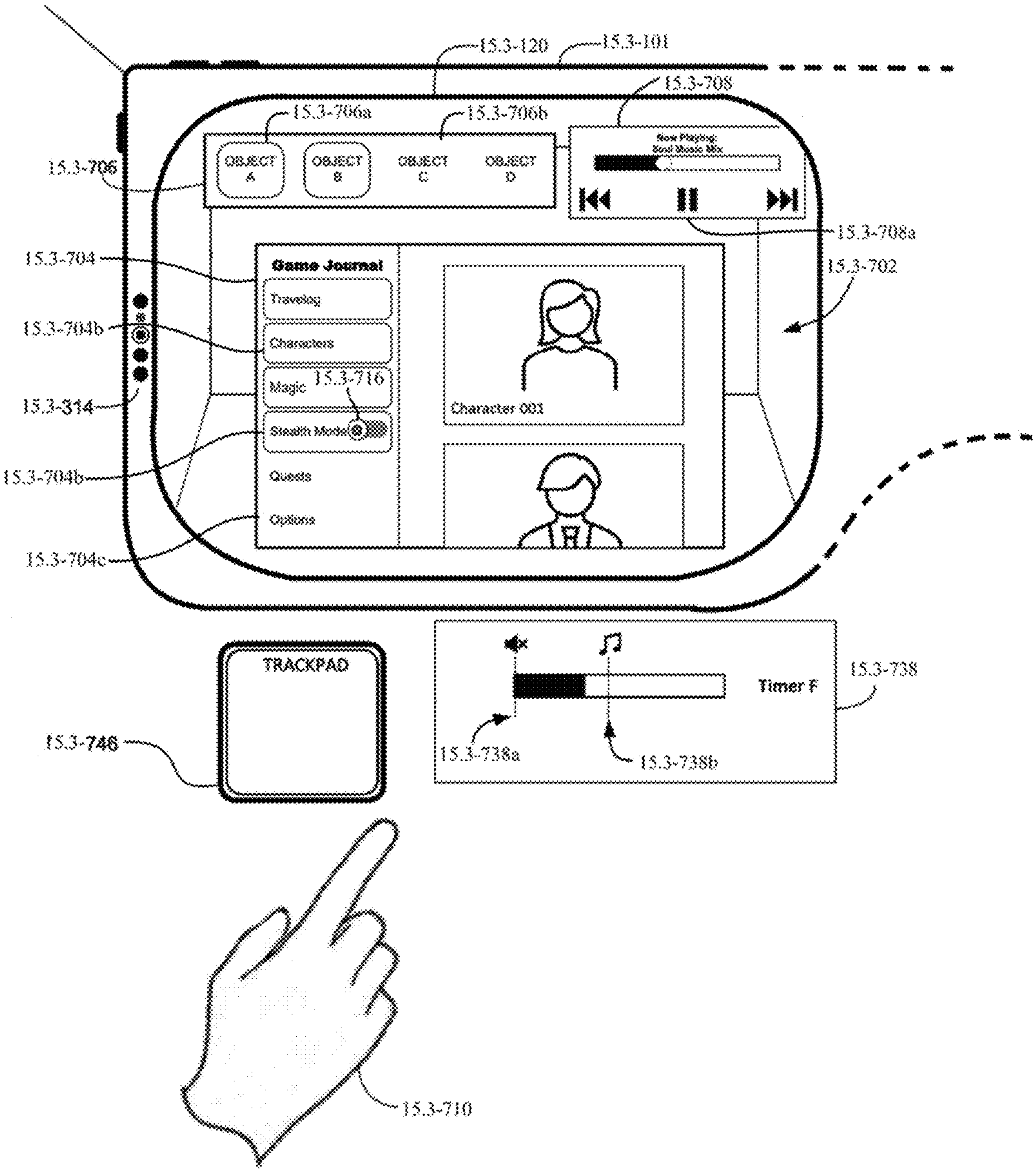
Figures 4A, 15:
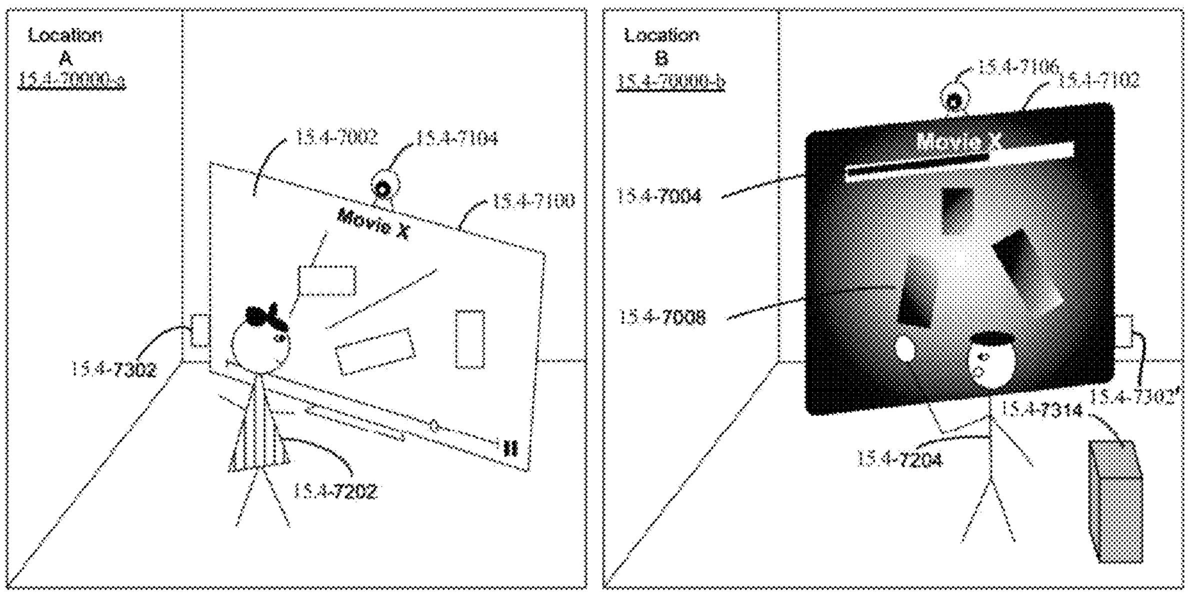
Figures 4B, 15:
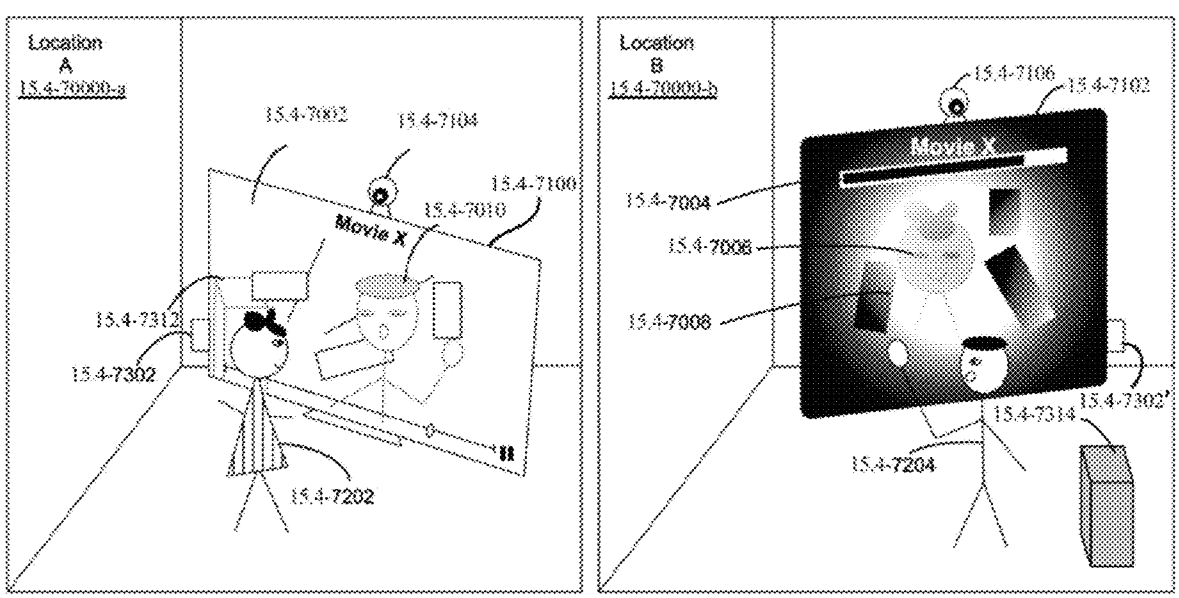

FIG. 15-3B shows an example of a user interface of a display module of an electronic device.

FIG. 15-4A shows an example of users interacting with a user interface of two display modules of an electronic device.

FIG. 15-4B shows an example of users interacting with a user interface of two display modules of an electronic device.

Figures 5A, 15:
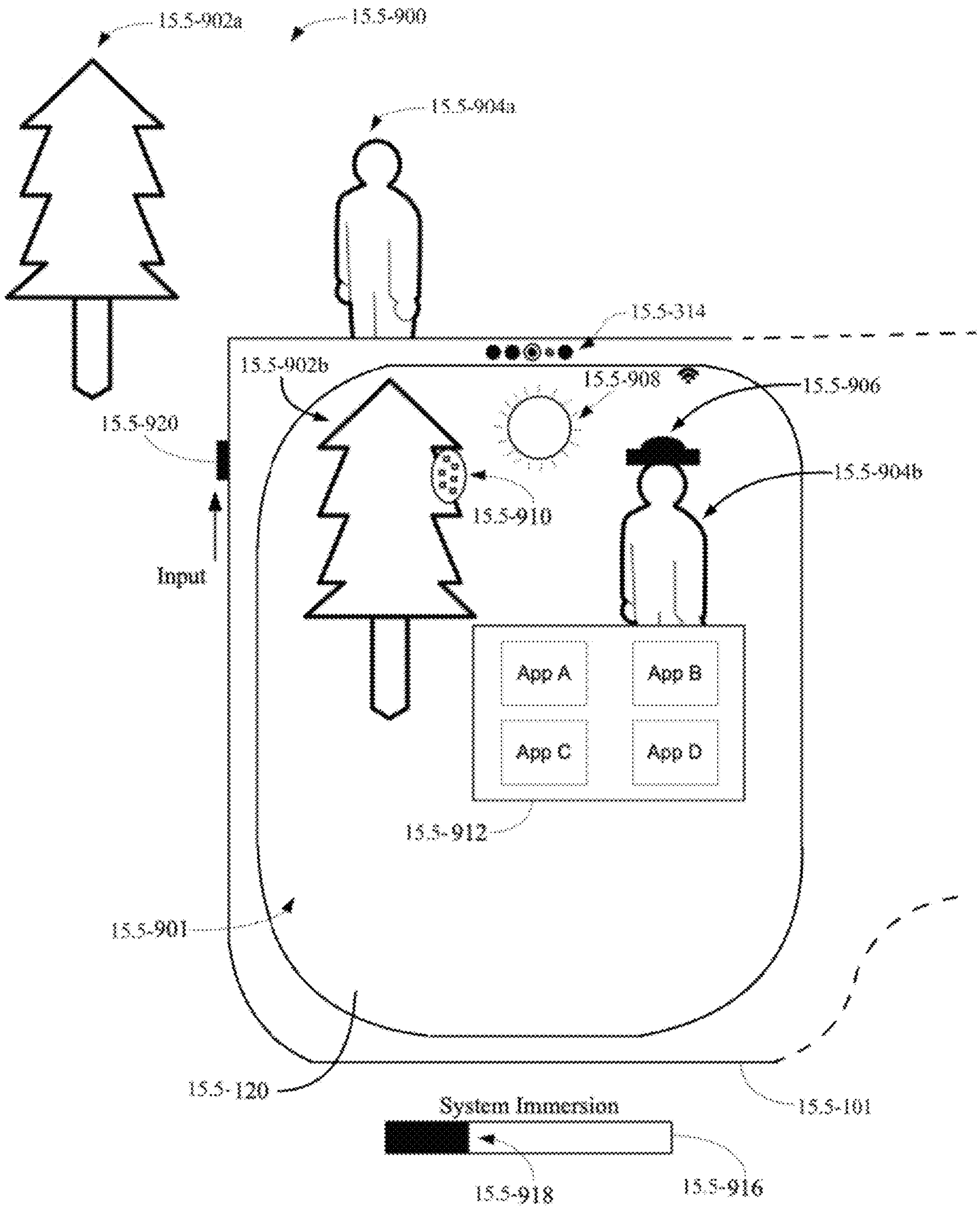

FIG. 15-5A shows an example user interface displayed by a display module of an HMD.

Figures 5B, 15:
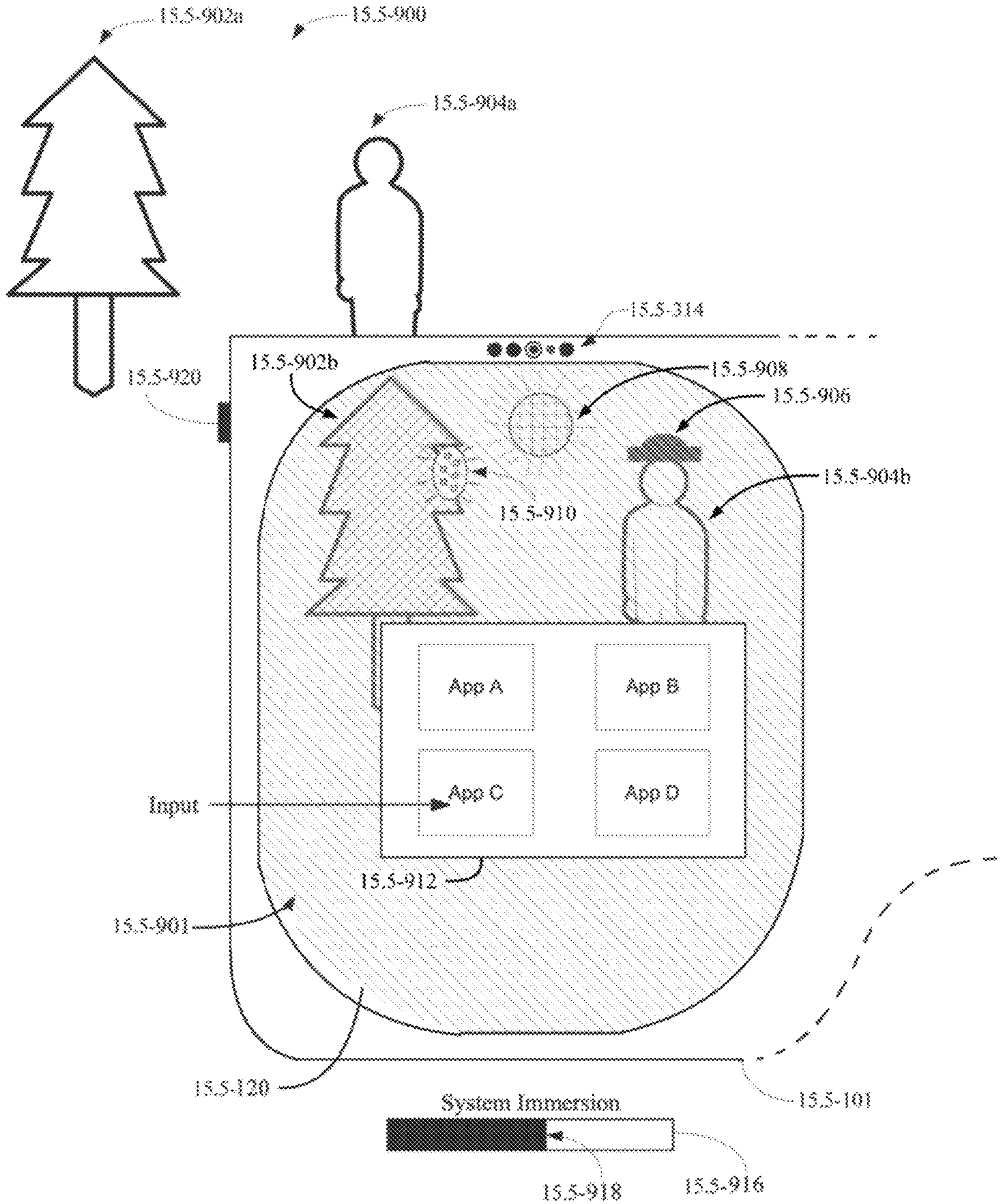

FIG. 15-5B shows an example user interface displayed by a display module of an HMD.

Figures 5C, 15:
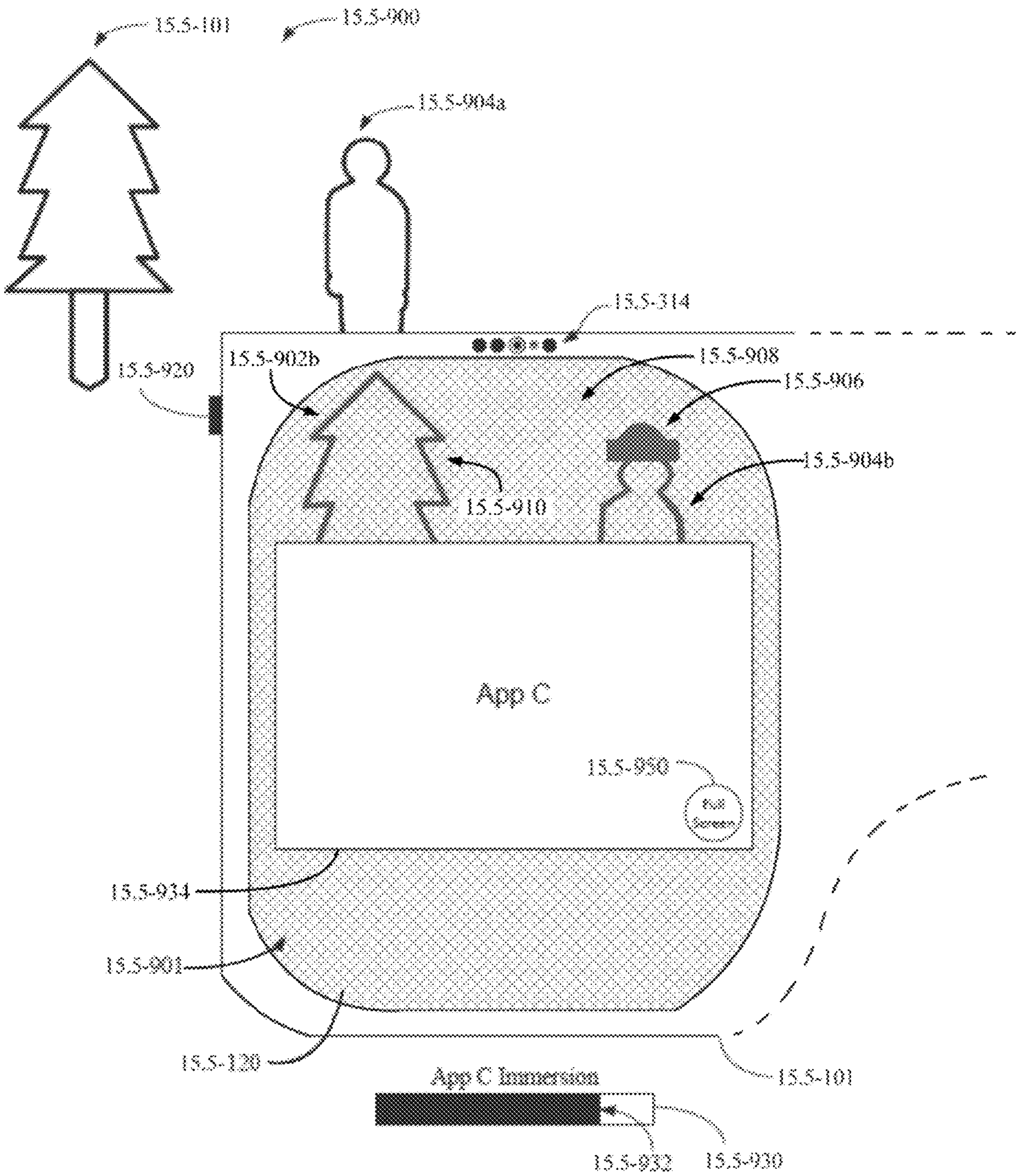

FIG. 15-5C shows an example user interface displayed by a display module of an HMD.

Figures 6A, 15:
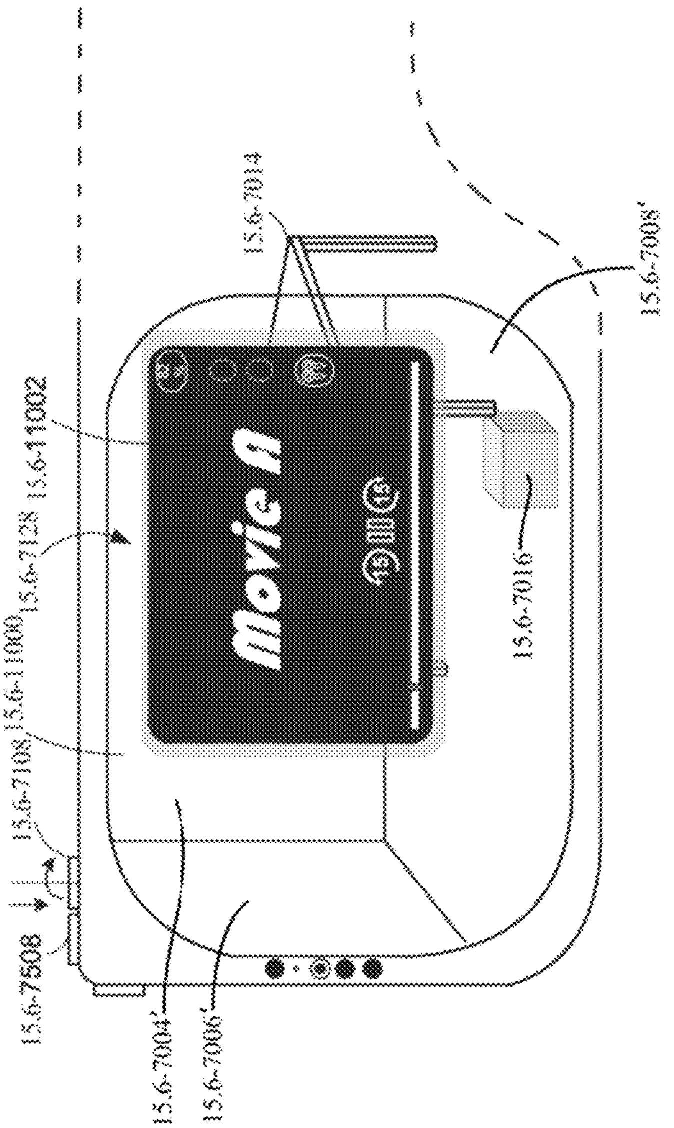

FIG. 15-6A shows an example user interface displayed by a display module of an HMD.

Figures 6B, 15:
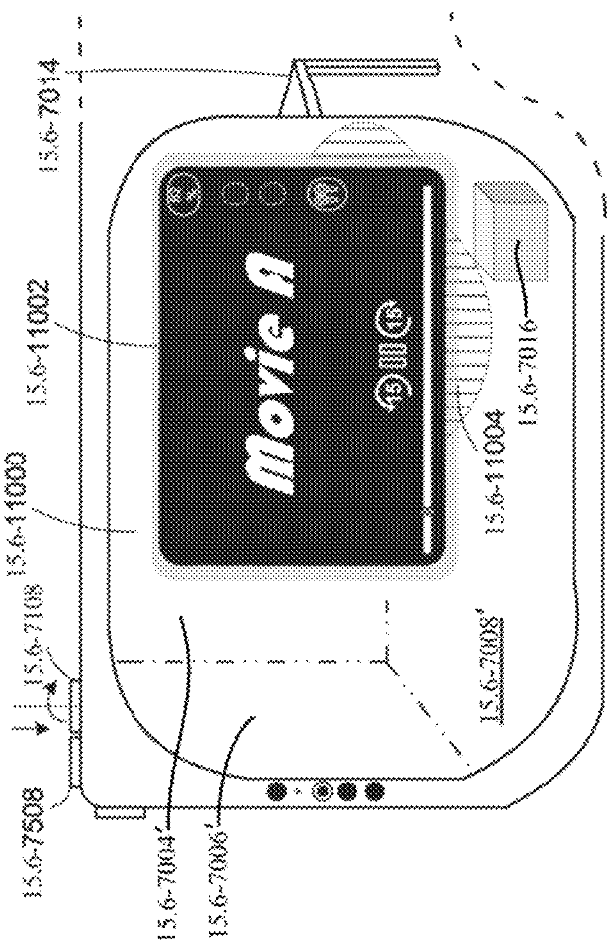

FIG. 15-6B shows an example user interface displayed by a display module of an HMD.

DETAILED DESCRIPTION

I: Overall System

FIG. 1-1A illustrates a front, top, perspective view of an example of a head-mountable display (HMD) device 1-100 configured to be donned by a user and provide virtual and altered/mixed reality (VR/AR) experiences. The HMD 1-100 can include a display unit 1-102 or assembly, an electronic strap assembly 1-104 connected to and extending from the display unit 1-102, and a band assembly 1-106 secured at either end to the electronic strap assembly 1-104. The electronic strap assembly 1-104 and the band 1-106 can be part of a retention assembly configured to wrap around a user's head to hold the display unit 1-102 against the face of the user.

In at least one example, the band assembly 1-106 can include a first band 1-116 configured to wrap around the rear side of a user's head and a second band 1-117 configured to extend over the top of a user's head. The second strap can extend between first and second electronic straps 1-105*a*, 1-105*b* of the electronic strap assembly 1-104 as shown. The strap assembly 1-104 and the band assembly 1-106 can be part of a securement mechanism extending rearward from the display unit 1-102 and configured to hold the display unit 1-102 against a face of a user.

In at least one example, the securement mechanism includes a first electronic strap 1-105*a* including a first proximal end 1-134 coupled to the display unit 1-102, for example a housing 1-150 of the display unit 1-102, and a first distal end 1-136 opposite the first proximal end 1-134. The securement mechanism can also include a second electronic strap 1-105*b* including a second proximal end 1-138 coupled to the housing 1-150 of the display unit 1-102 and a second distal end 1-140 opposite the second proximal end 1-138. The securement mechanism can also include the first band 1-116 including a first end 1-142 coupled to the first distal end 1-136 and a second end 1-144 coupled to the second distal end 1-140 and the second band 1-117 extending between the first electronic strap 1-105*a* and the second electronic strap 1-105*b*. The straps 1-105*a-b* and band 1-116 can be coupled via connection mechanisms or assemblies 1-114. In at least one example, the second band 1-117 includes a first end 1-146 coupled to the first electronic strap 1-105*a* between the first proximal end 1-134 and the first distal end 1-136 and a second end 1-148 coupled to the second electronic strap 1-105*b* between the second proximal end 1-138 and the second distal end 1-140.

In at least one example, the first and second electronic straps 1-105*a-b* include plastic, metal, or other structural materials forming the shape the substantially rigid straps 1-105*a-b*. In at least one example, the first and second bands 1-116, 1-117 are formed of elastic, flexible materials including woven textiles, rubbers, and the like. The first and second bands 1-116, 1-117 can be flexible to conform to the shape of the user' head when donning the HMD 1-100.

In at least one example, one or more of the first and second electronic straps 1-105*a-b* can define internal strap volumes and include one or more electronic components disposed in the internal strap volumes. In one example, as shown in FIG. 1-1A, the first electronic strap 1-105*a* can include an electronic component 1-112. In one example, the electronic component 1-112 can include a speaker. In one example, the electronic component 1-112 can include a computing component such as a processor.

In at least one example, the housing 1-150 defines a first, front-facing opening 1-152. The front-facing opening is labeled in dotted lines at 1-152 in FIG. 1-1A because the front display assembly 1-108 is disposed to occlude the first opening 1-152 from view when the HMD 1-100 is assembled. The housing 1-150 can also define a rear-facing second opening 1-154. The housing 1-150 also defines an internal volume between the first and second openings 1-152, 1-154. In at least one example, the HMD 1-100 includes the display assembly 1-108, which can include a front cover and display screen (shown in other figures) disposed in or across the front opening 1-152 to occlude the front opening 1-152. In at least one example, the display screen of the display assembly 1-108, as well as the display assembly 1-108 in general, has a curvature configured to follow the curvature of a user's face. The display screen of the display assembly 1-108 can be curved as shown to compliment the user's facial features and general curvature from one side of the face to the other, for example from left to right and/or from top to bottom where the display unit 1-102 is pressed.

In at least one example, the housing 1-150 can define a first aperture 1-126 between the first and second openings 1-152, 1-154 and a second aperture 1-130 between the first and second openings 1-152, 1-154. The HMD 1-100 can also include a first button 1-128 disposed in the first aperture 1-126 and a second button 1-132 disposed in the second aperture 1-130. The first and second buttons 1-128, 1-132 can be depressible through the respective apertures 1-126, 1-132. In at least one example, the first button 1-126 and/or second button 1-130 can be twistable dials as well as depressible buttons. In at least one example, the first button 1-126 is a depressible and twistable dial button and the second button 1-132 is a depressible button.

FIG. 1-1B illustrates a rear, perspective view of the HMD 1-100. The HMD 1-100 can include a light seal 1-110 extending rearward from the housing 1-150 of the display assembly 1-108 around a perimeter of the housing 1-150 as shown. The light seal 1-110 can be configured to extend from the housing 1-150 to the user's face around the user's eyes to block external light from being visible. In one example, the HMD 1-100 can include first and second display assemblies 1-120*a*, 1-120*b* disposed at or in the rearward facing second opening 1-154 defined by the housing 1-150 and/or disposed in the internal volume of the housing 1-150 and configured to project light through the second opening 1-154. In at least one example, each display assembly 1-120*a-b* can include respective display screens 1-122*a*, 1-122*b* configured to project light in a rearward direction through the second opening 1-154 toward the user's eyes.

In at least one example, referring to both FIGS. 1-1A and 1-1B, the display assembly 1-108 can be a front-facing, forward display assembly including a display screen configured to project light in a first, forward direction and the rear facing display screens 1-122*a-b* can be configured to project light in a second, rearward direction opposite the first direction. As noted above, the light seal 1-110 can be configured to block light external to the HMD 1-100 from reaching the user's eyes, including light projected by the forward facing display screen of the display assembly 1-108 shown in the front perspective view of FIG. 1-1A. In at least one example, the HMD 1-100 can also include a curtain 1-124 occluding the second opening 1-154 between the housing 1-150 and the rear-facing display assemblies 1-120*a-b*. In at least one example, the curtain 1-124 can be elastic or at least partially elastic.

Any of the features, components, and/or parts, including the arrangements and configurations thereof shown in FIGS. 1-1A and 1-1B can be included, either alone or in any combination, in any of the other examples of devices, features, components, and parts shown in FIG. 1-2-1-4 and described herein. Likewise, any of the features, components, and/or parts, including the arrangements and configurations thereof shown and described with reference to FIG. 2-4 can be included, either alone or in any combination, in the example of the devices, features, components, and parts shown in FIGS. 1-1A and 1-1B.

FIG. 1-2 illustrates a view of an example of an HMD 1-200 including various portions or parts thereof separated according to the modularity and selective coupling of those parts. For example, the HMD 1-200 can include a band 1-216 which can be selectively coupled to first and second electronic straps 1-205*a*, 1-205*b*. The first securement strap 1-205*a* can include a first electronic component 1-212*a* and the second securement strap 1-205*b* can include a second electronic component 1-212*b*. In at least one example, the first and second straps 1-205*a-b* can be removably coupled to the display unit 1-202.

In addition, the HMD 1-200 can include a light seal 1-210 configured to be removably coupled to the display unit 1-202. The HMD 1-200 can also include lenses 1-218 which can be removably coupled to the display unit 1-202, for example over first and second display assemblies including display screens. The lenses 1-218 can include customized prescription lenses configured for corrective vision. As noted, each part shown in the view of FIG. 1-2 and described above can be removably coupled, attached, re-attached, and changed out to update parts or swap out parts for different users. For example, bands such as the band 1-216, light seals such as the light seal 1-210, lenses such as the lenses 1-218, and electronic straps such as the straps 1-205*a-b* can be swapped out depending on the user such that these parts are customized to fit and correspond to the individual user of the HMD 1-200.

Any of the features, components, and/or parts, including the arrangements and configurations thereof shown in FIG. 1-2 can be included, either alone or in any combination, in any of the other examples of devices, features, components, and parts shown in FIGS. 1-1A, 1-1B, and 1-3-1-4 and described herein. Likewise, any of the features, components, and/or parts, including the arrangements and configurations thereof shown and described with reference to FIGS. 1-1A, 1-1B, and 1-3-1-4 can be included, either alone or in any combination, in the example of the devices, features, components, and parts shown in FIG. 1-2.

FIG. 1-3 illustrates a view of an example of a display unit 1-306 of an HMD. The display unit 1-306 can include a front display assembly 1-308, a frame/housing assembly 1-350, and a curtain assembly 1-324. The display unit 1-306 can also include a sensor assembly 1-356, logic board assembly 1-358, and cooling assembly 1-360 disposed between the frame assembly 1-350 and the front display assembly 1-308. In at least one example, the display unit 1-306 can also include a rear-facing display assembly 1-320 including first and second rear-facing display screens 1-322*a*, 1-322*b* disposed between the frame 1-350 and the curtain assembly 1-324.

In at least one example, the display unit 1-306 can also include a motor assembly 1-362 configured as an adjustment mechanism for adjusting the positions of the display screens 1-322*a-b* of the display assembly 1-320 relative to the frame 1-350. In at least one example, the display assembly 1-320 is mechanically coupled to the motor assembly 1-362, with at least one motor for each display screen 1-322*a-b*, such that the motors can translate the display screens 1-322*a-b* to match an interpupillary distance of the user's eyes.

In at least one example, the display unit 1-306 can include a dial or button 1-328 depressible relative to the frame 1-350 and accessible to the user outside the frame 1-350. The button 1-328 can be electronically connected to the motor assembly 1-362 via a controller such that the button 1-328 can be manipulated by the user to cause the motors of the motor assembly 1-362 to adjust the positions of the display screens 1-322*a-b*.

Any of the features, components, and/or parts, including the arrangements and configurations thereof shown in FIG. 1-3 can be included, either alone or in any combination, in any of the other examples of devices, features, components, and parts shown in FIGS. 1-1A-1-2 and 1-4 and described herein. Likewise, any of the features, components, and/or parts, including the arrangements and configurations thereof shown and described with reference to FIGS. 1-1A-1-2 and 1-4 can be included, either alone or in any combination, in the example of the devices, features, components, and parts shown in FIG. 1-3.

FIG. 1-4 illustrates a view of another example of a display unit 1-406 of an HMD device similar to other HMD devices described herein. The display unit 1-406 can include a front display assembly 1-402, a sensor assembly 1-456, a logic board assembly 1-458, a cooling assembly 1-460, a frame assembly 1-450, a rear-facing display assembly 1-421, and a curtain assembly 1-424. The display unit 1-406 can also include a motor assembly 1-462 for adjusting the positions of first and second display sub-assemblies 1-420*a*, 1-420*b* of the rear-facing display assembly 1-421, including first and second respective display screens for interpupillary adjustments, as described above.

The various parts, systems, and assemblies shown in the view of FIG. 1-4 are described in greater detail herein with reference to FIGS. 1-1A-1-3 as well as subsequent figures referenced in the present disclosure. The display unit 1-406 shown in FIG. 1-4 can be assembled and integrated with the securement mechanisms shown in FIGS. 1-1A-1-3, including the electronic straps, bands, and other components including light seals, connection assemblies, and so forth.

Any of the features, components, and/or parts, including the arrangements and configurations thereof shown in FIG. 1-4 can be included, either alone or in any combination, in any of the other examples of devices, features, components, and parts shown in FIGS. 1-1A-1-3 and described herein. Likewise, any of the features, components, and/or parts, including the arrangements and configurations thereof shown and described with reference to FIGS. 1-1A-1-3 can be included, either alone or in any combination, in the example of the devices, features, components, and parts shown in FIG. 1-4.

II: Cover Glass

FIG. 2.0-1 illustrates a view of an HMD 2.0-100 including a front cover and display assembly 2.0-102, including one or more transparent layers, display integration assemblies, shroud, and dust seal. The transparent layers, display assemblies, shroud, and dust seal are described below in sections II, III, IV, and V.

2.1: Systems with Transparent Layers

Transparent layers may be used to form windows in buildings, vehicles, and/or other systems. Transparent layers may also be used in forming protective cover layers such as cover layers for optical components.

FIG. 2.1-1 is a cross-sectional side view of an illustrative system containing a transparent layer. System 2.1-10 of FIG. 2.1-1 has a support such as support 2.1-12 in which one or more transparent layers such as transparent layer 2.1-14 may be mounted. System 2.1-10 may be a building (e.g., support 2.1-12 may include building walls), may be a vehicle (e.g., support 2.1-12 may be vehicle body), may be an electronic device (e.g., support 2.1-12 may be an electronic device housing such as a head-mounted housing for a head-mounted device), and/or may be any other suitable system. In arrangement in which system 2.1-10 is a building or vehicle, layer 2.1-14 may serve as a window. In arrangements in which system 2.1-10 is an electronic device, layer 2.1-14 may overlap and protect components in the device. For example, layer 2.1-14 may serve as a protective cover layer that overlaps optical components. In an illustrative configuration, system 2.1-10 is a portable electronic device (e.g., a cellular telephone, head-mounted device, tablet computer, laptop computer, wristwatch, etc.).

Transparent layer 2.1-14 and support 2.1-12 may separate interior region 2.1-16 of system 2.1-10 from exterior region 2.1-18. System components may be mounted in interior region 2.1-16. Layer 2.1-14 may have opposing inner and outer surfaces. The outer surface of layer 2.1-14 may face exterior region 2.1-18 and the inner surface of layer 2.1-14 may face interior region 2.1-16. The surfaces of layer 2.1-14 may include planar portions and/or portions that are curved. For example, layer 2.1-14 may have a shape with a curved cross-sectional profile such as shape 2.1-20. In arrangements in which layer 2.1-14 is curved, the inner and outer surfaces may be parallel to each other (e.g., the thickness of layer 2.1-14 may be constant across layer 2.1-14). If desired, some or all of the surfaces of layer 2.1-14 may have compound curvature (surfaces that can only be flattened into a plane with distortion). Surface areas of compound curvature may be bent about both the X and Y axes of FIG. 2.1-1.

FIG. 2.1-2 shows how layer 2.1-14 may overlap components in interior region 2.1-16 such as illustrative components 2.1-20 and 2.1-22. Components 2.1-20 and 2.1-22 may include optical components that emit and/or detect light. As an example, component 2.1-22 may be a display that emits visible light that passes though layer 2.1-14. This allows a viewer in exterior region 2.1-18 to view an image on the display through layer 2.1-14 (e.g., layer 2.1-14 may serve as a display cover layer). Components such as component 2.1-20 may include, for example, visible and/or infrared cameras and/or other optical sensors that receive light through layer 2.1-14. By overlapping components 2.1-20 and 2.1-22 as shown in FIG. 2.1-2, layer 2.1-14 may serve as a protective cover layer for components 2.1-20 and 2.1-22.

During events such as drop events in which system 2.1-10 abruptly contacts the ground or other hard surface, layer 2.1-14 may be subjected to undesirably large amounts of stress. To help enhance durability, layer 2.1-14 may be provided with one or more layers of polymer. As an example, a polymer layer may be used to laminate multiple layers of transparent material together and/or polymer layers may be formed on exposed inner and/or outer surfaces of layer 2.1-14.

FIG. 2.1-3 is a cross-sectional side view of layer 2.1-14. As shown in FIG. 2.1-3, layer 2.1-14 may include multiple layers of transparent material such as layers 2.1-40, 2.1-34, 2.1-32, and 2.1-30. In an illustrative configuration, layer 2.1-14 includes two layers of hard transparent material and one or more softer layers that are attached to the harder layers. The softer layers may be, for example, polymer layers that help enhance durability.

In the example of FIG. 2.1-3, layer 2.1-34 may be a hard layer such as a layer of glass (including glass ceramic) or sapphire or other crystalline material. Illustrative configurations in which layer 2.1-34 is a layer of glass may sometimes be described herein as an example. Layer 2.1-34 may be formed from alumina silicate glass or other glass materials and may optionally be chemically strengthened using an ion-exchange chemical strengthening process that places the surfaces of layer 2.1-34 in compression relative to the core of layer 2.1-34. Layer 2.1-34 may have a thickness that is sufficient to provide layer 2.1-14 with some or all of its structural strength, so layer 2.1-34 may sometimes be referred to as a structural layer, structural transparent layer, or structural glass layer. Layer 2.1-34 may, as an example, have a thickness of 700 microns, at least 400 microns, at least 500 microns, at least 600 microns, less than 1200 microns, less than 1000 microns, less than 900 microns, less than 800 microns, 400-1200 microns, 400-1100 microns, 400-1000 microns, 400-800 microns, and/or other suitable thickness.

One or more polymer layers may be attached to layer 2.1-34. In an illustrative configuration, polymer layer 2.1-40 is attached to inner surface 2.1-42 of layer 2.1-34. Layer 2.1-40 may include a first layer such as layer 2.1-38 and a second layer such as layer 2.1-36. Layer 2.1-38 may be a polymer film (e.g., a film of polycarbonate, polyethylene terephthalate, or other polymer film) and may have a thickness of 50 microns, 10-250 microns, 25-100 microns, at least 20 microns, less than 200 microns, less than 150 microns, or other suitable thickness. Layer 2.1-36 may be a polymer layer such as a layer of polymer adhesive (e.g., epoxy, acrylic adhesive, cured liquid adhesive, pressure sensitive adhesive, and/or other adhesive) that attaches layer 2.1-38 to layer 2.1-34 and may have a thickness of 100 microns, 20-500 microns, at least 30 microns, less than 250 microns, less than 300 microns, or other suitable thickness.

If desired, an additional polymer layer such as polymer layer 2.1-32 may be attached to upper surface outer surface 1.3-44 of layer 2.1-34. Layer 2.1-32 may be formed from an elastomeric polymer or other soft polymer material. Examples of materials that may be used in forming polymer layer 2.1-32 include polyvinyl butyral and ethylene vinyl acetate. Other polymers may be used in forming layer 2.1-32, if desired. Layer 2.1-32 may be the outermost layer of material of layer 2.1-14 (e.g., the outer surface of layer 2.1-32 may be exposed to region 2.1-18) or layer 2.1-32 may be covered with a harder outer layer.

As shown in FIG. 2.1-3, for example, layer 2.1-32, which may sometimes be referred to as an elastomeric polymer layer or polymer interlayer, may be used to attach a thin hard layer such as outer layer 2.1-30 to layer 2.1-34. The thickness of layer 2.1-32 may be 50 microns, 25-100 microns, at least 20 microns, at least 40 microns, at least 50 microns, less than 400 microns, 25-400 microns, less than 300 microns, less than 200 microns, 20-200 microns, 50-400 microns, or other suitable thickness. Layer 2.1-30 be formed from glass (including glass ceramic), a crystalline material such as sapphire, or hard polymer (e.g., hardened acrylic). The thickness of layer 2.1-30 is preferably less than the thickness of layer 2.1-34 to help minimize the weight of layer 2.1-14.

In an illustrative arrangement, layer 2.1-30 is formed as a separate layer (e.g., a separate glass layer from layer 2.1-34) that is attached to layer 2.1-34 by laminating layers 2.1-30 and 2.1-34 together using polymer layer 2.1-32. The thickness of layer 2.1-30 in this type of arrangement may be at least 50 microns, at least 75 microns, at least 100 microns, less than 300 microns, less than 250 microns, less than 200 microns, less than 150 microns, less than 100 microns, 50-200 microns, 25-300 microns, 50-150 microns, or other suitable thickness (e.g., a thickness that provides the outermost surface of layer 2.1-14 with sufficient hardness to resist scratches). In addition to resisting scratches, the inclusion of a hard outer layer such as layer 2.1-30 to layer 2.1-14 may help enhance the strength of layer 2.1-14 and thereby allow the thickness of layer 34 to be reduced. To help match the curvature of layers 2.1-30 and 2.1-34 in this type of arrangement, layers 2.1-30 and 2.1-34 may be formed into desired shapes using molding operations (e.g., glass molding), machining and/or polishing operations, etching (wet and/or dry chemical etching), and/or other suitable shaping operations.

In some embodiments, layer 2.1-30 may be deposited as a coating on layer 2.1-32. As an example, deposition techniques such as physical vapor deposition and sol-gel deposition may be used to deposit an inorganic dielectric layer of a hard material (e.g., a glass coating formed of silicon nitride, silicon oxynitride, zirconia, alumina, and/or other hard dielectric coating deposited by physical vapor deposition or a glass coating formed of an inorganic dielectric based on silicon oxide deposited by sol-gel deposition techniques). The thickness of this coating may be sufficient to allow the coating to enhance durability (e.g., to help prevent scratches in layer 2.1-32). As an example, layer 2.1-30 may have a thickness of at least 20 microns, at least 25 microns, at least 35 microns, and/or other suitable thickness). If desired, a liquid polymer (e.g., liquid acrylic) may be deposited and cured to form an acrylic-based hard coat (e.g., layer 2.1-30 may be a polymer hard coat that is harder than layer 2.1-32 and that therefore helps resist scratching).

2.2: Systems with Displays and Sensors

FIG. 2.2-1 is a side view of an illustrative head-mounted electronic device. As shown in FIG. 2.2-1, head-mounted device 2.2-10 may include head-mounted support structure 2.2-26. Support structure 2.2-26 may have walls or other structures that separate an interior region of device 2.2-10 such as interior region 2.2-42 from an exterior region surrounding device 2.2-10 such as exterior region 2.2-44. Electrical components 2.2-40 (e.g., integrated circuits, sensors, control circuitry, light-emitting diodes, lasers, and other light-emitting devices, other control circuits and input-output devices, etc.) may be mounted on printed circuits and/or other structures within device 2.2-10 (e.g., in interior region 2.2-42).

To present a user with images for viewing from eye boxes such as eye box 2.2-34, device 2.2-10 may include rear-facing displays such as display 2.2-14R and lenses such as lens 2.2-38. These components may be mounted in optical modules such as optical module 2.2-36 (e.g., a lens barrel) to form respective left and right optical systems. There may be, for example, a left rear-facing display for presenting an image through a left lens to a user's left eye in a left eye box and a right rear-facing display for presenting an image to a user's right eye in a right eye box. The user's eyes are located in eye boxes 34 at rear side R of device 2.2-10 when structure 2.2-26 rests against the outer surface (face surface 2.2-30) of the user's face.

Support structure 2.2-26 may include a main support structure such as main housing portion 2.2-26M (sometimes referred to as a main portion). Main housing portion 2.2-26M may extend from front side F of device 2.2-10 to opposing rear side R of device 2.2-10. On rear side R, main housing portion 2.2-26M may have cushioned structures to enhance user comfort as portion 2.2-26M rests against face surface 2.2-30. If desired, support structure 2.2-26 may include optional head straps such as strap 2.2-26B and/or other structures that allow device 2.2-10 to be worn on a head of a user.

Device 2.2-10 may have a publicly viewable front-facing display such as display 2.2-14F that is mounted on front side F of main housing portion 2.2-26M. Display 2.2-14F may be viewable to the user when the user is not wearing device 2.2-10 and/or may be viewable by others in the vicinity of device 2.2-10. Display 2.2-14F may, as an example, be visible on front side F of device 2.2-10 by an external viewer such as viewer 2.2-50 who is viewing device 2.2-10 in direction 2.2-52.

A schematic diagram of an illustrative system that may include a head-mounted device is shown in FIG. 2.2-2. As shown in FIG. 2.2-2, system 2.2-8 may have one or more electronic devices 2.2-10. Devices 2.2-10 may include a head-mounted device (e.g., device 2.2-10 of FIG. 2.2-1), accessories such as controllers and headphones, computing equipment (e.g., a cellular telephone, tablet computer, laptop computer, desktop computer, and/or remote computing equipment that supplies content to a head-mounted device), and/or other devices that communicate with each other.

Each electronic device 2.2-10 may have control circuitry 2.2-12. Control circuitry 2.2-12 may include storage and processing circuitry for controlling the operation of device 2.2-10. Circuitry 2.2-12 may include storage such as hard disk drive storage, nonvolatile memory (e.g., electrically-programmable-read-only memory configured to form a solid-state drive), volatile memory (e.g., static or dynamic random-access-memory), etc. Processing circuitry in control circuitry 2.2-12 may be based on one or more microprocessors, microcontrollers, digital signal processors, baseband processors, power management units, audio chips, graphics processing units, application specific integrated circuits, and other integrated circuits. Software code may be stored on storage in circuitry 2.2-12 and run on processing circuitry in circuitry 2.2-12 to implement control operations for device 2.2-10 (e.g., data gathering operations, operations involving the adjustment of the components of device 2.2-10 using control signals, etc.). Control circuitry 2.2-12 may include wired and wireless communications circuitry. For example, control circuitry 2.2-12 may include radio-frequency transceiver circuitry such as cellular telephone transceiver circuitry, wireless local area network transceiver circuitry (e.g., WiFi® circuitry), millimeter wave transceiver circuitry, and/or other wireless communications circuitry.

During operation, the communications circuitry of the devices in system 2.2-8 (e.g., the communications circuitry of control circuitry 2.2-12 of device 2.2-10) may be used to support communication between the electronic devices. For example, one electronic device may transmit video data, audio data, control signals, and/or other data to another electronic device in system 2.2-8. Electronic devices in system 2.2-8 may use wired and/or wireless communications circuitry to communicate through one or more communications networks (e.g., the internet, local area networks, etc.). The communications circuitry may be used to allow data to be received by device 2.2-10 from external equipment (e.g., a tethered computer, a portable device such as a handheld device or laptop computer, online computing equipment such as a remote server or other remote computing equipment, or other electrical equipment) and/or to provide data to external equipment.

Each device 2.2-10 in system 2.2-8 may include input-output devices 2.2-22. Input-output devices 2.2-22 may be used to allow a user to provide device 2.2-10 with user input. Input-output devices 2.2-22 may also be used to gather information on the environment in which device 2.2-10 is operating. Output components in devices 2.2-22 may allow device 2.2-10 to provide a user with output and may be used to communicate with external electrical equipment.

As shown in FIG. 2.2-2, input-output devices 2.2-22 may include one or more displays such as displays 2.2-14. Displays 2.2-14 may include rear facing displays such as display 2.2-14R of FIG. 2.2-1. Device 2.2-10 may, for example, include left and right components such as left and right scanning mirror display devices or other image projectors, liquid-crystal-on-silicon display devices, digital mirror devices, or other reflective display devices, left and right display panels based on light-emitting diode pixel arrays (e.g., organic light-emitting displays with polymer or semiconductor substrates or display devices based on pixel arrays formed from crystalline semiconductor light-emitting diode dies), liquid crystal display panels, and/or or other left and right display devices that provide images to left and right eye boxes for viewing by the user's left and right eyes, respectively. Display components such as these (e.g., an organic light-emitting display with a flexible polymer substrate or a display based on a pixel array formed from crystalline semiconductor light-emitting diode dies on a flexible substrate) may also be used in forming a forward-facing display for device 2.2-10 such as forward-facing display 2.2-14F of FIG. 2.2-1 (sometimes referred to as a front-facing display, front display, or publicly viewable display).

During operation, displays 2.2-14 (e.g., displays 2.2-14R and/or 2.2-14F) may be used to display visual content for a user of device 2.2-10 (e.g., still and/or moving images including pictures and pass-through video from camera sensors, text, graphics, movies, games, and/or other visual content). The content that is presented on displays 2.2-14 may, for example, include virtual objects and other content that is provided to displays 2.2-14 by control circuitry 2.2-12. This virtual content may sometimes be referred to as computer-generated content. Computer-generated content may be displayed in the absence of real-world content or may be combined with real-world content. In some configurations, a real-world image may be captured by a camera (e.g., a forward-facing camera, sometimes referred to as a front-facing camera) and computer-generated content may be electronically overlaid on portions of the real-world image (e.g., when device 2.2-10 is a pair of virtual reality goggles).

Input-output circuitry 2.2-22 may include sensors 2.2-16. Sensors 2.2-16 may include, for example, three-dimensional sensors (e.g., three-dimensional image sensors such as structured light sensors that emit beams of light and that use two-dimensional digital image sensors to gather image data for three-dimensional images from dots or other light spots that are produced when a target is illuminated by the beams of light, binocular three-dimensional image sensors that gather three-dimensional images using two or more cameras in a binocular imaging arrangement, three-dimensional LIDAR (light detection and ranging) sensors, sometimes referred to as time-of-flight cameras or three-dimensional time-of-flight cameras, three-dimensional radio-frequency sensors, or other sensors that gather three-dimensional image data), cameras (e.g., two-dimensional infrared and/or visible digital image sensors), gaze tracking sensors (e.g., a gaze tracking system based on an image sensor and, if desired, a light source that emits one or more beams of light that are tracked using the image sensor after reflecting from a user's eyes), touch sensors, capacitive proximity sensors, light-based (optical) proximity sensors, other proximity sensors, force sensors (e.g., strain gauges, capacitive force sensors, resistive force sensors, etc.), sensors such as contact sensors based on switches, gas sensors, pressure sensors, moisture sensors, magnetic sensors, audio sensors (microphones), ambient light sensors, flicker sensors that gather temporal information on ambient lighting conditions such as the presence of a time-varying ambient light intensity associated with artificial lighting, microphones for gathering voice commands and other audio input, sensors that are configured to gather information on motion, position, and/or orientation (e.g., accelerometers, gyroscopes, compasses, and/or inertial measurement units that include all of these sensors or a subset of one or two of these sensors), and/or other sensors.

User input and other information may be gathered using sensors and other input devices in input-output devices 2.2-22. If desired, input-output devices 2.2-22 may include other devices 2.2-24 such as haptic output devices (e.g., vibrating components), light-emitting diodes, lasers, and other light sources (e.g., light-emitting devices that emit light that illuminates the environment surrounding device 2.2-10 when ambient light levels are low), speakers such as ear speakers for producing audio output, circuits for receiving wireless power, circuits for transmitting power wirelessly to other devices, batteries and other energy storage devices (e.g., capacitors), joysticks, buttons, and/or other components.

As described in connection with FIG. 2.2-1, electronic device 2.2-10 may have head-mounted support structures such as head-mounted support structure 2.2-26 (e.g., head-mounted housing structures such as housing walls, straps, etc.). The head-mounted support structure may be configured to be worn on a head of a user (e.g., against the user's face covering the user's eyes) during operation of device 2.2-10 and may support displays 2.2-14, sensors 2.2-16, other components 2.2-24, other input-output devices 2.2-22, and control circuitry 2.2-12 (see, e.g., components 2.2-40 and optical module 2.2-36 of FIG. 2.2-1).

FIG. 2.2-3 is a front view of device 2.2-10 in an illustrative configuration in which device 2.2-10 has a publicly viewable display such as forward-facing display 2.2-14F. As shown in FIG. 2.2-3, support structure 2.2-26M of device 2.2-10 may have right and left portions such as portions 2.2-26R and 2.2-26L that are coupled by an interposed nose bridge portion such as portion 2.2-26NB. Portion 2.2-26NB may have a curved exterior surface such as nose bridge surface 2.2-90 that is configured to receive and rest upon a user's nose to help support main housing portion 2.2-26M on the head of the user.

Display 2.2-14F may have an active area such as active area AA that is configured to display images and an inactive area IA that does not display images. The outline of active area AA may be rectangular, rectangular with rounded corners, may have teardrop shaped portions on the left and right sides of device 2.2-10, may have a shape with straight edges, a shape with curved edges, a shape with a peripheral edge that has both straight and curved portions, and/or other suitable outlines. As shown in FIG. 2.2-3, active area AA may have a curved recessed portion at nose bridge portion 2.2-26NB of main housing portion 2.2-26. The presence of the nose-shaped recess in active area AA may help fit active area AA within the available space of housing portion 2.2-26M without overly limiting the size of active area AA.

Active area AA contains an array of pixels. The pixels may be, for example, light-emitting diode pixels formed from thin-film organic light-emitting diodes or crystalline semiconductor light-emitting diode dies (sometimes referred to as micro-light-emitting diodes) on a flexible display panel substrate. Configurations in which display 2.2-14F uses other display technologies may also be used, if desired. Illustrative arrangements in which display 2.2-14 is formed from a light-emitting diode display such as an organic light-emitting diode display that is formed on a flexible substrate (e.g., a substrate formed from a bendable layer of polyimide or a sheet of other flexible polymer) may sometimes be described herein as an example. The pixels of active area AA may be formed on a display device such as display panel 2.2-14P of FIG. 2.2-3 (e.g., a flexible organic light-emitting diode display panel). In some configurations, the outline of panel 2.2-14P may have a peripheral edge that contains straight segments or a combination of straight and curved segments. Configurations in which the entire outline of panel 2.2-14P is characterized by a curved peripheral edge may also be used.

Display 2.2-14F may have an inactive area such as inactive area IA that is free of pixels and that does not display images. Inactive area IA may form an inactive border region that runs along one more portions of the peripheral edge of active area AA. In the illustrative configuration of FIG. 2.2-3, inactive area IA has a ring shape that surrounds active area AA. In this type of arrangement, the width of inactive area IA may be relatively constant and the inner and outer edges of area IA may be characterized by straight and/or curved segments or may be curved along their entire lengths. For example, the outer edge of area IA (e.g., the periphery of display 2.2-14F) may have a curved outline that runs parallel to the curved edge of active area AA.

In some configurations, device 2.2-10 may operate with other devices in system 2.2-8 (e.g., wireless controllers and other accessories). These accessories may have magnetic sensors that sense the direction and intensity of magnetic fields. Device 2.2-10 may have one or more electromagnets configured to emit a magnetic field. The magnetic field can be measured by the wireless accessories near device 2.2-10, so that the accessories can determine their orientation and position relative to device 2.2-10. This allows the accessories to wirelessly provide device 2.2-10 with real-time information on their current position, orientation, and movement so that the accessories can serve as wireless controllers. The accessories may include wearable devices, handled devices, and other input devices.

In an illustrative configuration, device 2.2-10 may have a coil such as illustrative coil 2.2-54 that runs around the perimeter of display 2.2-14F (e.g., under inactive area IA or other portion of display 2.2-14F). Coil 2.2-54 may have any suitable number of turns (e.g., 1-10, at least 2, at least 5, at least 10, 10-50, fewer than 100, fewer than 25, fewer than 6, etc.). These turns may be formed from metal traces on a substrate, may be formed from wire, and/or may be formed from other conductive lines. During operation, control circuitry 2.2-12 may supply coil 2.2-54 with an alternating-current (AC) drive signal. The drive signal may have a frequency of at least 1 kHz, at least 10 kHz, at least 100 kHz, at least 1 MHz, less than 10 MHz, less than 3 MHz, less than 300 kHz, or less than 30 kHz (as examples). As AC current flows through coil 2.2-54, a corresponding magnetic field is produced in the vicinity of device 2.2-10. Electronic devices such as wireless controllers with magnetic sensors that are in the vicinity of device 2.2-10 may use the magnetic field as a reference so that the wireless controllers can determine their orientation, position, and/or movement while being moved relative to device 2.2-10 to provide device 2.2-10 with input.

Consider, as an example, a handheld wireless controller that is used in controlling the operation of device 2.2-10. During operation, device 2.2-10 uses coil 2.2-54 to emit a magnetic field. As the handheld wireless controller is moved, the magnetic sensors of the controller can monitor the location of the controller and the movement of the controller relative to device 2.2-10 by monitoring the strength, orientation, and change to the strength and/or orientation of the magnetic field emitted by coil 2.2-54 as the controller is moved through the air by the user. The electronic device can then wirelessly transmit information on the location and orientation of the controller to device 2.2-10. In this way, a handheld controller, wearable controller, or other external accessory can be manipulated by a user to provide device 2.2-10 with air gestures, pointing input, steering input, and/or other user input.

Device 2.2-10 may have components such as optical components (e.g., optical sensors among sensors 2.2-16 of FIG. 2.2-2). These components may be mounted in any suitable location on head-mounted support structure 2.2-26 (e.g. on head strap 2.2-26B, on main housing portion 2.2-26M, etc.). Optical components and other components may face rearwardly (e.g., when mounted on the rear face of device 2.2-10), may face to the side (e.g. to the left or right), may face downwardly or upwardly, may face to the front of device 2.2-10 (e.g., when mounted on the front face of device 2.2-10), may be mounted so as to point in any combination of these directions (e.g., to the front, to the right, and downward) and/or may be mounted in other suitable orientations. In an illustrative configuration, at least some of the components of device 2.2-10 are mounted so as to face outwardly to the front (and optionally to the sides and/or up and down). For example, forward-facing cameras for pass-through video may be mounted on the left and right sides of the front of device 2.2-10 in a configuration in which the cameras diverge slightly along the horizontal dimension so that the fields of view of these cameras overlap somewhat while capturing a wide-angle image of the environment in front of device 2.2-10. The captured image may, if desired, include portions of the user's surroundings that are below, above, and to the sides of the area directly in front of device 2.2-10.

To help hide components such as optical components from view from the exterior of device 2.2-10, it may be desirable to cover some or all of the components with cosmetic covering structures. The covering structures may include transparent portions (e.g., optical component windows) that are characterized by sufficient optical transparency to allow overlapped optical components to operate satisfactorily. For example, an ambient light sensor may be covered with a layer that appears opaque to an external viewer to help hide the ambient light sensor from view, but that allows sufficient ambient light to pass to the ambient light sensor for the ambient light sensor to make a satisfactory ambient light measurement. As another example, an optical component that emits infrared light may be overlapped with a visibly opaque material that is transparent to infrared light.

In an illustrative configuration, optical components for device 2.2-10 may be mounted in inactive area IA of FIG. 2.2-3 and cosmetic covering structures may be formed in a ring shape overlapping the optical components in inactive area IA. Cosmetic covering structures may be formed from ink, polymer structures, structures that include metal, other materials, and/or combinations of these materials. In an illustrative configuration, a cosmetic covering structure may be formed from a ring-shaped member having a footprint that matches the footprint of inactive area IA. If, for example, active area AA has left and right portions with teardrop shapes, the ring-shaped member may have curved edges that follow the curved periphery of the teardrop-shaped portions of active area AA. The ring-shaped member may be formed from one or more polymer structures (e.g., the ring-shaped member may be formed from a polymer ring). Because the ring-shaped member can help hide overlapped components from view, the ring-shaped member may sometimes be referred to as a shroud or ring-shaped shroud member. The outward appearance of the shroud or other cosmetic covering structures may be characterized by a neutral color (white, black, or gray) or a non-neutral color (e.g., blue, red, green, gold, rose gold, etc.).

Display 2.2-14F may, if desired, have a protective display cover layer. The cover layer may overlap active area AA and inactive area IA (e.g., the entire front surface of device 2.2-10 as viewed from direction 2.2-52 of FIG. 2.2-1 may be covered by the cover layer). The cover layer, which may sometimes be referred to as a housing wall or transparent housing wall, may have a rectangular outline, an outline with teardrop portions, an oval outline, or other shape with curved and/or straight edges.

The cover layer may be formed from a transparent material such as glass, polymer, transparent crystalline material such as sapphire, clear ceramic, other transparent materials, and/or combinations of these materials. As an example, a protective display cover layer for display 2.2-14F may be formed from safety glass (e.g., laminated glass that includes a clear glass layer with a laminated polymer film). Optional coating layers may be applied to the surfaces of the display cover layer. If desired, the display cover layer may be chemically strengthened (e.g., using an ion-exchange process to create an outer layer of material under compressive stress that resists scratching). In some configurations, the display cover layer may be formed from a stack of two or more layers of material (e.g., first and second structural glass layers, a rigid polymer layer coupled to a glass layer or another rigid polymer layer, etc.) to enhance the performance of the cover layer.

In active area AA, the display cover layer may overlap the pixels of display panel 2.2-14P. The display cover layer in active area AA is preferably transparent to allow viewing of images presented on display panel 2.2-14P. In inactive area IA, the display cover layer may overlap the ring-shaped shroud or other cosmetic covering structure. The shroud and/or other covering structures (e.g., opaque ink coatings on the inner surface of the display cover layer and/or structures) may be sufficiently opaque to help hide some or all of the optical components in inactive area IA from view. Windows may be provided in the shroud or other cosmetic covering structures to help ensure that the optical components that are overlapped by these structures operate satisfactorily. Windows may be formed from holes, may be formed from areas of the shroud or other cosmetic covering structures that have been locally thinned to enhance light transmission, may be formed from window members with desired light transmission properties that have been inserted into mating openings in the shroud, and/or may be formed from other shroud window structures.

In the example of FIG. 2.2-3, device 2.2-10 includes optical components such as optical components 2.2-60, 2.2-62, 2.2-64, 2.2-66, 2.2-68, 2.2-70, 2.2-72, 2.2-74, 2.2-76, 2.2-78, and 2.2-80 (as an example). Each of these optical components (e.g., optical sensors selected from among sensors 2.2-16 of FIG. 2.2-2, light-emitting devices, etc.) may be configured to detect light and, if desired to emit light (e.g., ultraviolet light, visible light, and/or infrared light).

In an illustrative configuration, optical component 2.2-60 may sense ambient light (e.g., visible ambient light). In particular, optical component 2.2-60 may have a photodetector that senses variations in ambient light intensity as a function of time. If, as an example, a user is operating in an environment with an artificial light source, the light source may emit light at a frequency associated with its source of wall power (e.g., alternating-current mains power at 60 Hz). The photodetector of component 2.2-60 may sense that the artificial light from the artificial light source is characterized by 60 Hz fluctuations in intensity. Control circuitry 2.2-12 can use this information to adjust a clock or other timing signal associated with the operation of image sensors in device 2.2-10 to help avoid undesired interference between the light source frequency and the frame rate or other frequency associated with image capture operations. Control circuitry 2.2-12 can also use measurements from component 2.2-60 to help identify the presence of artificial lighting and the type of artificial lighting that is present. In this way, control circuitry 2.2-12 can detect the presence of lights such as fluorescent lights or other lights with known non-ideal color characteristics and can make compensating color cast adjustments (e.g., white point adjustments) to color-sensitive components such as cameras and displays. Because optical component 2.2-60 may measure fluctuations in light intensity, component 2.2-60 may sometimes be referred to as a flicker sensor or ambient light frequency sensor.

Optical component 2.2-62 may be an ambient light sensor. The ambient light sensor may include one or more photodetectors. In a single-photodetector configuration, the ambient light sensor may be a monochrome sensor that measures ambient light intensity. In a multi-photodetector configuration, each photodetector may be overlapped by an optical filter that passes a different band of wavelengths (e.g. different visible and/or infrared passbands). The optical filter passbands may overlap at their edges. This allows component 2.2-62 to serve as a color ambient light sensor that measures both ambient light intensity and ambient light color (e.g., by measuring color coordinates for the ambient light). During operation of device 2.2-10, control circuitry 2.2-12 can take action based on measured ambient light intensity and color. As an example, the white point of a display or image sensor may be adjusted or other display or image sensor color adjustments may be made based on measured ambient light color. The intensity of a display may be adjusted based on light intensity. For example, the brightness of display 2.2-14F may be increased in bright ambient lighting conditions to enhance the visibility of the image on the display and the brightness of display 2.2-14F may be decreased in dim lighting conditions to conserve power. Image sensor operations and/or light source operations may also be adjusted based on ambient light readings.

The optical components in active area IA may also include components along the sides of device 2.2-10 such as components 2.2-80 and 2.2-64. Optical components 2.2-80 and 2.2-64 may be pose-tracking cameras that are used to help monitor the orientation and movement of device 2.2-10. Components 2.2-80 and 2.2-64 may be visible light cameras (and/or cameras that are sensitive at visible and infrared wavelengths) and may, in conjunction with an inertial measurement unit, form a visual inertial odometry (VIO) system.

Optical components 2.2-78 and 2.2-66 may be visible-light cameras that capture real-time images of the environment surrounding device 2.2-10. These cameras, which may sometimes be referred to as scene cameras or pass-through-video cameras, may capture moving images that are displayed in real time to displays 2.2-14R for viewing by the user when the user's eyes are located in eye boxes 2.2-34 at the rear of device 2.2-10. By displaying pass-through images (pass-through video) to the user in this way, the user may be provided with real-time information on the user's surroundings. If desired, virtual content (e.g. computer-generated images) may be overlaid over some of the pass-through video. Device 2.2-10 may also operate in a non-pass-through-video mode in which components 2.2-78 and 2.2-66 are turned off and the user is provided only with movie content, game content, and/or other virtual content that does not contain real-time real-world images.

Input-output devices 2.2-22 of device 2.2-10 may gather user input that is used in controlling the operation of device 2.2-10. As an example, a microphone in device 2.2-10 may gather voice commands. Buttons, touch sensors, force sensors, and other input devices may gather user input from a user's finger or other external object that is contacting device 2.2-10. In some configurations, it may be desirable to monitor a user's hand gestures or the motion of other user body parts. This allows the user's hand locations or other body part locations to be replicated in a game or other virtual environment and allows the user's hand motions to serve as hand gestures (air gestures) that control the operation of device 2.2-10. User input such as hand gesture input can be captured using cameras that operate at visible and infrared wavelengths such as tracking cameras (e.g., optical components 2.2-76 and 2.2-68). Tracking cameras such as these may also track fiducials and other recognizable features on controllers and other external accessories (additional devices 2.2-10 of system 2.2-8) during use of these controllers in controlling the operation of device 2.2-10. If desired, tracking cameras can help determine the position and orientation of a handheld controller or wearable controller that senses its location and orientation by measuring the magnetic field produced by coil 2.2-54. The use of tracking cameras may therefore help track hand motions and controller motions that are used in moving pointers and other virtual objects being displayed for a user and can otherwise assist in controlling the operation of device 2.2-10.

Tracking cameras may operate satisfactorily in the presence of sufficient ambient light (e.g., bright visible ambient lighting conditions). In dim environments, supplemental illumination may be provided by supplemental light sources such as supplemental infrared light sources (e.g., optical components 2.2-82 and 2.2-84). The infrared light sources may each include one or more light-emitting devices (light-emitting diodes or lasers) and may each be configured to provide fixed and/or steerable beams of infrared light that serve as supplemental illumination for the tracking cameras. If desired, the infrared light sources may be turned off in bright ambient lighting conditions and may be turned on in response to detection of dim ambient lighting (e.g., using the ambient light sensing capabilities of optical component 2.2-62).

Three-dimensional sensors in device 2.2-10 may be used to perform biometric identification operations (e.g., facial identification for authentication), may be used to determine the three-dimensional shapes of objects in the user's environment (e.g., to map the user's environment so that a matching virtual environment can be created for the user), and/or to otherwise gather three-dimensional content during operation of device 2.2-10. As an example, optical components 2.2-74 and 2.2-70 may be three-dimensional structured light image sensors. Each three-dimensional structured light image sensor may have one or more light sources that provide structured light (e.g., a dot projector that projects an array of infrared dots onto the environment, a structured light source that produces a grid of lines, or other structured light component that emits structured light). Each of the three-dimensional structured light image sensors may also include a flood illuminator (e.g., a light-emitting diode or laser that emits a wide beam of infrared light). Using flood illumination and structured light illumination, optical components 2.2-74 and 2.2-70 may capture facial images, images of objects in the environment surrounding device 2.2-10, etc.

Optical component 2.2-72 may be an infrared three-dimensional time-of-flight camera that uses time-of-flight measurements on emitted light to gather three-dimensional images of objects in the environment surrounding device 2.2-10. Component 2.2-72 may have a longer range and a narrower field of view than the three-dimensional structured light cameras of optical components 2.2-74 and 2.2-70. The operating range of component 2.2-72 may be 30 cm to 7 m, 60 cm to 6 m, 70 cm to 5 m, or other suitable operating range (as examples).

FIG. 2.2-4 is a top view of device 2.2-10 in an illustrative arrangement in which display 2.2-14F and main housing portion 2.2-26M have been configured to curve about the curved surface of a user's face (curved face surface 2.2-30). In particular, rear surface 2.2-96 of housing portion 2.2-26M on rear side R of device 2.2-10 may have a curved shape that is bent about axis 2.2-98 (e.g., an axis parallel to the vertical Z axis in the example of FIG. 2.2-4). By wrapping housing portion 2.2-26M smoothly about the curved surface of the user's head, comfort may be enhanced when wearing device 2.2-10.

As shown in FIG. 2.2-4, display 2.2-14F and other structures on the front of device 2.2-10 may have a protective cover layer such as display cover layer 2.2-92 (e.g., a front portion of housing portion 2.2-26M, which may sometimes be referred to as a front housing wall, transparent dielectric housing wall, or dielectric housing member). In some embodiments, display cover layer 2.2-92 may include areas that are characterized by curved surfaces that can be flattened into a plane without distortion (sometimes referred to as developable surfaces or curved surfaces without compound curvature). Display cover layer 2.2-92 may also include areas that are characterized by compound curvature (e.g., surfaces that can only be flattened into a plane with distortion, sometimes referred to as non-developable surfaces).

In active area AA of display 2.2-14F, cover layer 2.2-92 overlaps an array of pixels P in display panel 2.2-14P. In inactive area IA, cover layer 2.2-92 does not overlap any pixels, but may overlap optical components such as the optical components shown in FIG. 2.2-3. To help reduce the size and weight of device 2.2-10, display 2.2-14F may have a curved shape that wraps around the front of the user's head parallel to face surface 2.2-30 and parallel to curved rear surface 2.2-96 of housing portion 2.2-26M. For example, display panel 2.2-14P may have a flexible substrate that allows panel 2.2-14P to bend about bend axis 2.2-94 (e.g., a bend axis that is parallel to the Z axis in the example of FIG. 2.2-4). In active area AA of display 2.2-14F, display cover layer 2.2-92 may have an inner surface with a curved cross-sectional profile that conforms to bent display panel 2.2-14P and a corresponding curved outer surface. In inactive area IA, display cover layer 2.2-92 may also be curved (e.g., with a tighter bend radius and more curvature than in active area AA). If desired, a polymer layer (sometimes referred to as a shroud canopy or polymer member) may be interposed between display cover layer 2.2-92 and display panel 2.2-14P. The polymer layer may be separated from the pixels of panel 2.2-14P by an air gap and may be separated from the inner surface of display cover layer 2.2-92 by an air gap (as an example).

FIG. 2.2-5A is a cross-sectional side view of display 2.2-14F viewed in the X direction. As shown in FIG. 2.2-5A, the cross-sectional profile of display panel 2.2-14P (in planes parallel to the YZ plane) may, in an illustrative configuration, be straight rather than curved. This may help prevent wrinkling or other distortion to the flexible substrate material of display panel 2.2-14P as display panel 2.2-14P is bent about bend axis 2.2-94 to wrap around the curved surface of the user's face. Display panel 2.2-14P may, in this example, have a developable surface (e.g., a surface that has a curved cross-sectional profile but that does not have any compound curvature). Panel 2.2-14P of FIG. 2.2-5A may be attached to the inner surface of layer 2.2-92 (e.g., with adhesive). In this scenario, the inner surface of layer 2.2-92 may be a developable surface that mates with the outwardly facing developable surface of panel 2.2-14P. The corresponding outer surface of layer 2.2-92 in active area AA may be a developable surface or may be a surface of compound curvature. In inactive area IA, layer 2.2-92 may have inner and/or outer surfaces of compound curvature and/or the inner and/or outer surfaces may be developable surfaces. If desired, the entire outer surface of layer 2.2-92 may have compound curvature (both in active area AA and in inactive area IA), the inner surface of layer 2.2-92 in active area AA may be a developable surface to which panel 2.2-14P is laminated with adhesive, and the inner surface of layer 2.2-92 in inactive area IA may have compound curvature and/or may be a developable surface.

Another illustrative configuration for display 2.2-14F is shown in FIG. 2.2-5B. As shown in the cross-sectional side view of FIG. 2.2-5B, display cover layer 2.2-92 may, if desired, have a cross-sectional profile that is curved across all of layer 2.2-92. With this type of arrangement, the surface of inactive area IA of display cover layer 2.2-92 may have compound curvature and active area AA of display cover layer 2.2-92 may have compound curvature (e.g., layer 2.2-92 may be free of any areas with developable surfaces). A polymer layer such as polymer layer 2.2-130, which may sometimes be referred to as a shroud or shroud canopy, may be interposed between the inner surface of display cover layer 2.2-92 and the opposing outer surface of display panel 2.2-14P. The outer surface of display panel 2.2-14P may be a developable surface (e.g., display panel 2.2-14P may be bent about axis 2.2-94). In active area AA, where polymer layer 2.2-130 overlaps the pixels of panel 2.2-14P, polymer layer 2.2-130 may also be bent about axis 2.2-94 (e.g., the inner and outer surfaces of polymer layer 2.2-130 in active area AA may be developable surfaces). In inactive area IA, the inner and outer surfaces of polymer layer 2.2-130 may have compound curvature. Air gaps may separate panel 2.2-14P from the inner surface of layer 2.2-130 and may separate the outer surface of layer 2.2-130 from the inner surface of layer 2.2-92.

If desired, other arrangements for layer 2.2-130 may be used. For example, the side of layer 2.2-130 facing display panel 2.2-14P may have a developable surface in active area AA, whereas the side of layer 2.2-130 facing layer 2.2-92 may have compound curvature in active area AA (e.g., layer 2.2-130 may have a non-uniform thickness). Layer 2.2-92 may also have different configurations. For example, the outer surface of layer 2.2-92 may have compound curvature, whereas the inner surface of layer 2.2-92 in active area AA and/or in area IA may be a developable surface. Other arrangements in which layer 2.2-92 and/or layer 2.2-130 have variable thicknesses may also be used. In inactive area IA, multiple polymer structures may be joined. For example, in area IA, a ring-shaped polymer member, sometimes referred to as a shroud trim, may be joined to layer 2.2-130, which may form a shroud canopy member that extends across the entire front face of device 2.2-10. The shroud trim and shroud canopy may, if desired, sometimes be referred to individually or collectively as forming a shroud, shroud member(s), etc. Tinting (e.g., dye, pigment, and/or other colorant) may be included in layer 2.2-130. For example, layer 2.2-130 may be tinted to exhibit a visible light transmission of 30-80% to help obscure internal structures in device 2.2-10 such as display panel 2.2-14P from view when not in use.

FIG. 2.2-6 is a front view of a portion of display 2.2-14F and display cover layer 2.2-92. The inner and outer surfaces of display cover layer 2.2-92 that directly overlap active area AA and display panel 2.2-14P may be developable surfaces and/or may include areas of compound curvature. In an illustrative configuration, the inner surface of cover layer 2.2-92 in area AA may, as described in connection with FIGS. 4 and 5A, bend about bend axis 2.2-94 without exhibiting curvature about any axis orthogonal to axis 2.2-94. The outer surface of layer 2.2-92 in area AA may be a developable surface or a surface of compound curvature. The use of a developable surface for the inwardly facing side of display cover layer 2.2-92 (and, if desired, the use of a developable surface for the inwardly facing side of optional layer 2.2-130 of FIG. 2.2-5B) may help ensure that display panel 2.2-14P is not wrinkled or otherwise damaged during the bending of panel 2.2-14P to form a curved display shape that conforms to the shape of the user's head.

Display panel 2.2-14P may have an outwardly facing surface in active area AA that is a developable surface. This display panel surface may be adhered to the corresponding inner developable surface of layer 2.2-130 or a corresponding inner developable surface of layer 2.2-92 or may be spaced apart from the layer 2.2-130 and/or the inner surface of layer 2.2-92 by an air gap (as examples).

Some or all portions of the inner and outer surfaces of display cover layer 2.2-92 in inactive area IA may, if desired, be characterized by compound curvature. This allows the periphery of display 2.2-14F to smoothly transition away from the active area and provides an attractive appearance and compact shape for device 2.2-10. The compound curvature of display cover layer 2.2-92 in inactive area IA may also facilitate placement of the optical components under inactive area IA in desired orientations. If desired, all areas of layer 2.2-92 may have compound curvature (e.g., the inner and outer surfaces of layer 2.2-92 may have compound curvature in both area IA and area AA).

In the illustrative configuration of FIG. 2.2-6, in which display cover layer 2.2-92 has a curved peripheral edge and in which the inwardly facing and outwardly facing surfaces of display cover layer 2.2-92 have compound curvature in inactive area IA, the cross-sectional profiles of display cover layer 2.2-92 taken along each of illustrative lines 2.2-100 of FIG. 2.2-6 are curved (e.g., the entire peripheral ring-shaped inactive area of display 2.2-14F in the FIG. 2.2-6 example is covered by a portion of display cover layer 2.2-92 with inner and outer surfaces of compound curvature). This type of shape for display cover layer 2.2-92 may be produced by glass forming, polymer molding, machining, and/or other display cover layer fabrication techniques. Other arrangements (e.g., configurations in which display cover layer 2.2-92 has at least some developable surfaces (inner and/or outer surfaces) in inactive area IA) may also be used. The arrangement of FIG. 2.2-6 is illustrative.

FIGS. 2.2-7, 2.2-8, and 2.2-9 are front views of illustrative upper left portions of display cover layer 2.2-92. Device 2.2-10 may have symmetrical right-hand cover layer portions. The example of FIG. 2.2-7 shows how the peripheral edge of display cover layer 2.2-92 may have straight edges (e.g., a generally rectangular shape with straight edges) and rounded corners. In the example of FIG. 2.2-8, display cover layer 2.2-92 has teardrop shapes on the upper left and right sides. FIG. 2.2-9 shows how the upper corners of display cover layer 2.2-92 may have sweeping curves (e.g., to help soften the visual appearance of device 2.2-10 when viewed from the front).

FIGS. 10, 11, and 12 are front views of illustrative lower left portions of display cover layer 2.2-92. As shown in FIG. 2.2-10, the lower half of cover layer 2.2-92 may be characterized by a rectangular shape with rounded corners. Cover layer 2.2-92 of FIG. 2.2-10 may have an upper portion with a shape of the type shown in FIG. 2.2-7 (as an example). In the nose bridge portion of device 2.2-10, cover layer 2.2-92 may have a recessed curved nose-bridge edge shape (see, e.g., curved edge surface 2.2-90). In the illustrative arrangement of FIG. 2.2-11, display cover layer 2.2-92 has lower left and right sides with teardrop shapes (e.g., shapes that may be used with a display cover layer having upper left and right teardrop shapes of the type shown in FIG. 2.2-8). FIG. 2.2-12 shows how the lower portion of display cover layer 2.2-92 may have a more gradually curved outline.

In general, the upper and lower portions of cover layer 2.2-92 may have any suitable outlines when viewed from the front of device 2.2-10. The shape used for cover layer 2.2-92 may be determined by factors such as aesthetics, size, the ability to facilitate suitable placement for optical components in inactive area IA, the ability to provide desired active area coverage (overlap over active area AA), etc. Any of the illustrative shapes for the upper portion of device 2.2-10 shown in FIGS. 7, 8, and/or 9 may be used in combination with any of the illustrative shapes for the lower portion of device 2.2-10 shown in FIGS. 10, 11, and 12. The overall shape for cover layer 2.2-92 may be symmetric about the nose bridge (e.g., left and right halves of layer 2.2-92 may exhibit mirror symmetry). The shapes of FIGS. 7, 8, 9, 10, 11, and 12 are illustrative. Other shapes may be used, if desired.

FIG. 2.2-13 is an exploded cross-sectional top view of a portion of device 2.2-10 showing how display cover layer 2.2-92 may have a portion overlapping display panel 2.2-14P and a portion overlapping a cosmetic covering structure such as shroud 2.2-130 (e.g., a ring-shaped shroud portion sometimes referred to as a shroud trim or shroud trim member, which may optionally be attached in area IA to a shroud canopy that covers display 2.2-14F such as optional polymer layer 2.2-130). Cosmetic covering structures in inactive area IA may be formed from opaque masking layers (e.g., black ink layers) and/or other coatings on the inner surface of display cover layer 2.2-92 and/or on the shroud, from separate structures formed from metal, polymer, glass, or other materials, and/or other structures that can help hide overlapped components 2.2-104. Components 2.2-104 may include sensors 16 and other input-output devices 2.2-22 of FIG. 2.2-2. For example, components 2.2-104 may be optical components such as components 2.2-60, 2.2-62, 2.2-64, 2.2-84, 2.2-66, 2.2-68, 2.2-70, 2.2-72, 2.2-74, 2.2-76, 2.2-78, 2.2-82, and 2.2-80 of FIG. 2.2-3. In inactive area IA, cover layer 2.2-92 may have curved inner and outer surfaces (e.g., surfaces with compound curvature). Shroud 2.2-102 (and, if desired, layer 2.2-130 in area IA) may optionally have corresponding inner and outer surfaces (e.g., surfaces with compound curvature). Components 2.2-104 may operate through optical component windows in shroud 2.2-102 (and optionally in layer 2.2-130 in area IA) and corresponding areas in layer 2.2-92. These windows may be formed by recesses and/or through-hole openings in shroud 2.2-102 (and optionally in layer 2.2-130) and/or layer 2.2-92, by window members that are installed within openings in shroud 2.2-102 (and optionally in layer 2.2-130) and/or layer 2.2-92, by portions of shroud 2.2-102 (and optionally portions of layer 2.2-130) and/or layer 2.2-92 that exhibit optical transparency sufficient for satisfactory operation of overlapped components, and/or by other structures in shroud 2.2-102 (and optionally in layer 2.2-130) and/or window 2.2-92.

If desired, components 2.2-104 may include components such as cameras (e.g., visible and/or infrared image sensors, time-of-flight sensors, structured light three-dimensional sensors, etc.) that are sensitive to optical distortion imposed by the curved shapes of the curved inner and/or outer surface of cover layer 2.2-92. For example, a camera or other optical component 104 may operate through a portion of cover layer 2.2-92 in inactive area IA that is characterized by an outer surface that has compound curvature and an inner surface with compound curvature or a developable inner surface. In this type of situation, the control circuitry of device 2.2-10 may be configured to digitally compensate for the optical distortion introduced as light (e.g., real-world image light) passes through layer 2.2-92 to the camera or other optical sensor. As an example, the amount of image distortion imposed by layer 2.2-92 (e.g., stretching, shifting, keystoning, barrel distortion, pincushion distortion, and/or other optical distortion) may be measured and characterized for each optical component that operates through layer 2.2-92 (e.g., through a portion of layer 2.2-92 in inactive area IA that has inner and/or outer surfaces of compound curvature). During operation of device 2.2-10, the image data captured by a camera and/or other sensor data that is gathered by an optical component overlapped by layer 2.2-92 may be compensated accordingly (e.g., an equal and opposite amount of digital image warping may be applied to the captured image data, thereby removing the known distortion effects of layer 2.2-92). In this way, high quality (undistorted) images and/or other sensor data may be gathered by cameras and/or other optical components that operate through curved portions of layer 2.2-92. This allows layer 2.2-92 to be provided with an attractive shape (e.g., a shape with one or more surfaces characterized by compound curvature).

When assembled into device 2.2-10, display cover layer 2.2-92 and shroud 2.2-102 (and optionally layer 2.2-130) may be mounted to an exposed edge portion of a polymer housing structure, a metal housing wall, or other housing structure in main housing portion 2.2-26M. As an example, main housing portion 2.2-26M may have a polymer sidewall member that runs around the periphery of display cover layer 2.2-92 and that supports the peripheral edge of display cover layer 2.2-92. Shroud 2.2-102 may have a ring shape that runs along the edge of display cover layer 2.2-92 in inactive area IA. In an illustrative configuration, adhesive is used to attach display cover layer 2.2-92 to shroud 2.2-102 (and/or layer 2.2-130) and adhesive is used to attach shroud 2.2-102 (and/or layer 2.2-130) to the exposed front edge of the sidewall in main housing portion 2.2-26M. Components 2.2-104 may be attached to shroud 2.2-102 (and/or layer 2.2-130) and/or may be supported on internal housing structures (e.g., brackets, frame members, etc.) in alignment with optical windows in shroud 2.2-102 (and/or layer 2.2-130) and corresponding portions of layer 2.2-92.

FIG. 2.2-14 is a cross-sectional side view of a portion of display 2.2-14F. In the example of FIG. 2.2-14, display panel 2.2-14P is a three-dimensional display panel having an array of pixels P overlapped by lenticular lenses 2.2-106 (e.g., display panel 2.2-14P is an autostereoscopic display that produces glasses-free three-dimensional images for viewers such as viewer 2.2-50 of FIG. 2.2-1). Lenses 2.2-106 may, as an example, be formed from semicylindrical lens elements that are elongated along columns of pixels (e.g., lens elements that extend parallel to the Z dimension in the example of FIG. 2.2-14). If desired, lenses 2.2-106 may be omitted (e.g., display panel 2.2-14P may have an array of pixels P that are not overlapped by lenses 2.2-106 to form a two-dimensional display).

An air gap such as gap 2.2-114 may separate display panel 2.2-14P of display 2.2-14F from display cover layer 2.2-92. Optional layer 2.2-130 may be formed within gap 2.2-114 of FIG. 2.2-14, so that layer 2.2-130 has an outer surface that is separated from layer 2.2-92 by a first air gap and an opposing inner surface that is separated from lenses 2.2-106 and pixels P of display panel 2.2-14P by a second air gap. In arrangements in which lenses 2.2-106 are present, air gap 2.2-114 (and the resulting absence of direct contact between the inner surface of layer 2.2-130 and lenses 2.2-106) may allow lenses 2.2-106 to operate satisfactorily. Display cover layer 2.2-92 and optional layer 2.2-130 may be formed from transparent material such as glass, polymer, clear ceramic, crystalline material such as sapphire, one or more sublayers of these materials and/or other materials that have been laminated together (e.g., using adhesive, etc.), etc. Configurations in which layer 2.2-92 is a glass layer and layer 2.2-130 is a polymer layer may sometimes be described herein as an example.

Coatings may be provided on one or more of the layers in display cover layer 2.2-92. As shown in the illustrative configuration of FIG. 2.2-14, display cover layer 2.2-92 may include, for example, a layer such as layer 2.2-108 that is formed from one or more sublayers (e.g., layer(s) of glass and/or polymer), a polymer layer that helps provide layer 2.2-92 with safety glass functionality (see, e.g., illustrative polymer film 112, which has been attached to the inner surface of glass layer 2.2-108 to form a layer of laminated glass), and coating 2.2-110 on the front (outwardly facing) surface of layer 2.2-92 (e.g., the outer surface of glass layer 2.2-108). Coating 2.2-110 may be, for example, an antireflection coating formed from one or more inorganic dielectric layers and/or other layers with thicknesses and refractive index values selected to minimize visible light reflections from the outermost surface of layer 2.2-92 and help maintain a desired appearance (e.g., a neutral tint) for layer 2.2-92. If desired, display panel 2.2-14P may be a touch sensitive display (e.g., a display that is overlapped by or incorporates capacitive touch sensor circuitry). In configurations in which display 2.2-14F is touch sensitive, the outermost surface of layer 2.2-92 may be coated with an oleophobic coating layer (e.g., a fluoropolymer layer).

To help strengthen layer 2.2-92, layer 2.2-108 may be formed from chemically strengthened glass (e.g., a glass layer that has been treated in an ion-exchange bath to place the exterior surfaces of the glass layer under compression relative to the interior of the glass layer). This may help layer 2.2-108 resist scratching and cracks. Layer 2.2-108 may be formed from a single glass layer, a single polymer layer, a stack of two laminated glass layers (e.g., first and second glass layers laminated together with a layer of polymer), a stack of two polymer layers, three or more polymer and/or glass layers, etc. If desired, layer 2.2-108 may be formed from a hybrid stack of layers that includes one or more glass layers attached to one or more polymer layers. As an example, layer 2.2-92 may include a rigid structural polymer layer that is covered with a thin glass layer (e.g., a glass layer attached to the structural polymer layer using heat and/or pressure or a glass layer attached to the structural polymer layer using a layer of polymer adhesive). The thin glass layer in this type of arrangement may help protect the structural polymer layer from scratches.

One or more of the structures in layer 2.2-92 (e.g., coating 2.2-110, the layer(s) forming layer 2.2-108, layer 2.2-112, optional layer 2.2-130, etc.) may, if desired, be provided with a dye, pigment, or other colorant that creates a desired neutral tint (e.g., gray or black) or non-neutral tint (e.g., red). Thin metal coatings, polarizers, and/or other structures may also be incorporated into layer 2.2-92 to help provide layer 2.2-92 with desired optical properties and/or to provide layer 2.2-92 with a desired external appearance.

If desired, the portion of layer 2.2-92 that overlaps optical components 2.2-104 and/or other portions of layer 2.2-92 may be provided with a coating that helps prevent scratches that could adversely affect optical quality for components 2.2-104. As shown in FIG. 2.2-15, for example, display cover layer 2.2-92 may have a transparent layer such as transparent layer 2.2-116 (e.g., one or more layers of polymer, glass, and/or other transparent layers such as layer 2.2-108 of FIG. 2.2-14). Transparent layer 2.2-116 may be covered with one or more coating layers such as coating layer 2.2-118. Layer 2.2-118 may be a thin-film layer formed from an inorganic material (e.g., an oxide, nitride, diamond-like carbon etc.) that helps resist scratches. This type of approach may be used, for example, to ensure that the portion of display cover layer 2.2-92 that overlaps optical component 2.2-104 does not become hazy from scratches when layer 2.2-116 is formed from a material such as polymer that may be prone to scratching when exposed to excessive rubbing from sharp external objects. Layer 2.2-118 may sometimes be referred to as a hard coat and may have a higher hardness (e.g., a higher Mohs hardness) than layer 2.2-116. Layer 2.2-118 may be a thin-film coating with a thickness of less than 3 microns, less than 2 microns, less than 1 micron, less than 0.5 microns, or other suitable thickness.

Another way in which to help prevent undesired scratches on the surface of display cover layer 2.2-92 where layer 2.2-92 overlaps optical components 2.2-104 is illustrated in the cross-sectional side view of display cover layer 2.2-92 of FIG. 2.2-16. As this example demonstrates, the outer surface of display cover layer 2.2-92 may be provided with a recess such as recess 2.2-120 (e.g., a shallow circular depression or a depression with a rectangular shape or other footprint). This places recessed display cover layer surface 2.2-124 of recess 2.2-120 below surrounding external surfaces 2.2-122 of layer 2.2-92. When device 2.2-10 is laid on a tabletop or other surface, the unrecessed portion of the surface of layer 2.2-92 (external surface 122) will contact the tabletop surface and will thereby help prevent the tabletop surface from contacting the recessed portion of the surface of layer 2.2-92 (surface 2.2-124). As a result, recessed surface 2.2-124, which overlaps component 104, will remain free of scratches. Haze will therefore not generally develop in the area of layer 2.2-92 that overlaps component 104, even when layer 2.2-92 is exposed to excessive wear.

Layer 2.2-92 may be formed from materials having optical properties that are compatible with overlapped optical components 2.2-104. For example, if an optical component that is overlapped by a portion of layer 2.2-92 in inactive area IA is configured to operate at visible and infrared wavelengths, that portion of layer 2.2-92 may be provided with sufficient visible light and infrared light transparency to allow the overlapped component to operate satisfactorily at visible and infrared wavelengths. In arrangements in which the material from the bulk of layer 2.2-92 does not have desired optical properties for an optical component, an optical component window member (e.g., a disk of window material such as a disk of infrared-transparent and, if desired, visible-transparent glass or other inserted window member) may be mounted within an opening in layer 2.2-92 overlapping the optical component.

Consider, as an example, an arrangement in which layer 2.2-92 is transparent to visible light but has low transmission at infrared wavelengths. An optical component in this type of arrangement may operate at infrared wavelengths. To ensure that the optical component can transmit and/or receive infrared light through layer 2.2-92, layer 2.2-92 may be provided with a through-hole opening and an infrared-transparent optical component window member such as an infrared-transparent disk. The infrared-transparent window member may be formed from a different material than the material forming layer 2.2-92 and may be mounted within the through-hole opening in layer 2.2-92. This type of arrangement is shown in the cross-sectional side view of FIG. 2.2-17 in which display cover layer 2.2-92 has been provided with optical component window member 2.2-92W in a through-hole opening in layer 2.2-92. Member 2.2-92W may be a glass optical component window member that is transparent to infrared light (and optionally transparent to visible light), whereas surrounding portions of layer 2.2-92 may be formed from different material (e.g., polymer, different glass material, etc.). By providing an infrared-transparent window in layer 2.2-92, the infrared optical component (e.g., optical component 2.2-102 of FIG. 2.2-17) can transmit and/or received infrared light through display cover layer 2.2-92 (e.g., through the window in the display cover layer), even when layer 2.2-92 has been formed from materials that are not infrared-transparent. This approach may be used to provide an optical component window with any suitable optical properties that are different than those of the rest of layer 2.2-92 (e.g., desired amounts of opacity, light transmission, reflection, absorption, and/or haze level, desired polarization properties, etc.).

2.3: Systems with Supplemental Illumination

FIG. 2.3-1 is a cross-sectional side view of a head-mounted device in an illustrative configuration in which the device includes an illumination system for providing environmental illumination. Head-mounted device 2.3-10 of FIG. 2.3-1 may have optical sensors. These sensors may include cameras. The cameras of device 2.3-10 may have lenses and image sensors that are configured to capture images at ultraviolet light wavelengths, visible light wavelengths, and/or infrared wavelengths.

Some cameras (e.g., cameras of the type that may sometimes be referred to as scene cameras) may be used for capturing images of a user's environment that are displayed on displays 2.3-14 in real time (e.g., real-time pass-through video). Cameras in device 2.3-10 may also be used in tracking the positions and movements of external objects. As an example, tracking cameras may track a user's hand (see, e.g., hand 2.3-30H) or the user's torso or other body part (see, e.g., user body part 2.3-30B). Hand gesture input may, as an example, be used in controlling operation of device 2.3-10. Body part monitoring may be used to allow a user's body motions to be replicated by content displayed in a virtual environment. If desired, cameras may also be used in tracking the position of external accessories (e.g., the position and movement of controllers that are moved by a user to control device 2.3-10). In some scenario, visual inertial odometry (VIO) systems or other systems that determine the position, movement, and/or orientation of device 2.3-10 relative to the environment surrounded by device 2.3-10 may be formed by combining data from one or more cameras in device 2.3-10 with additional sensor data (e.g., data from an inertial measurement unit). Cameras may perform dedicated functions (tracking, visual inertial odometry functions, scene capture, ranging, three-dimensional image capture for facial recognition and environment mapping, etc.) or two or more of these operations may be performed by a shared camera.

It may be desirable to allow a user of device 2.3-10 to operate device 2.3-10 in low lighting conditions. As an example, a user may be viewing content on displays 14 while in a dark room or dark vehicle interior. To ensure that camera tracking functions such as hand tracking, body tracking, accessory tracking, and optionally other camera-based functions (e.g., visual inertial odometry, etc.) can be performed satisfactorily, device 2.3-10 may provide supplemental illumination. The supplemental illumination may be provided by light sources that produce supplemental ultraviolet light, supplemental visible light, and/or supplemental infrared light to augment any ambient light that is available. In an illustrative configuration, supplemental illumination is provided at infrared wavelengths, as this light is detectable by tracking cameras or other cameras with infrared sensing capabilities and is invisible to the human eye. Because supplemental infrared illumination is invisible, people in the vicinity of the user of device 2.3-10 (e.g., people in the same room or vehicle as the user) will not be disturbed by the presence of the supplemental illumination.

Any suitable light sources may be used in forming the supplemental illumination system for device 2.3-10 (e.g., light-emitting didoes, lasers, etc.). In an illustrative configuration, these light-emitting devices are laser diodes or light-emitting diodes that emit infrared light at a wavelength of 940 nm or other infrared wavelength (e.g., one or more wavelengths such as 740-1500 nm, at least 800 nm, 940 nm, at least 900 nm, 800-1200 nm, 900-1000 nm, 750-1100 nm, 800-1100 nm, less than 1500 nm, etc.). There may be N cameras that use supplemental illumination in device 2.3-10 and M supplemental light sources. The values of N and M may be 1-10, at least 2, at least 3, at least 4, at least 6, at least 8, 2-10, 4-6, 2-4, less than 10, less than 5, less than 4, or other suitable values. The value of N may be larger than the value of M, the value of N may be equal to the value of M, or the value of N may be less than the value of M. As one example, there may be four cameras that use supplemental infrared illumination and there may be two light sources that emit supplemental illumination.

The cameras that use the supplemental infrared illumination may be configured to be sensitive at the wavelengths illuminated by the supplemental illumination system (e.g., the infrared light wavelengths associated with the M supplemental light sources). The cameras may also be sensitive at visible light wavelengths so that when ample visible ambient light illumination is present, the cameras can operate without any supplemental illumination. To help avoid infrared interference during normal ambient lighting conditions, the supplemental illumination system may, as an example, be configured to emit light in a narrow infrared band (e.g., 940 nm) and the cameras may be provided with filters that pass visible light while blocking all infrared light except light in the narrow infrared band. In another illustrative configuration, the cameras are sensitive across the visible spectrum (e.g., 380 to 740 nm) and into the infrared spectrum (e.g., 740-1000 nm, or other suitable broader infrared wavelength band in which the infrared supplemental illumination is produced). If desired, switchable filters may be sued to block infrared light from the cameras when supplemental infrared illumination is not being used and that pass infrared light when supplemental infrared illumination is being used.

As shown in FIG. 2.3-1, the right-hand side of device 2.3-10 may contain a first camera such as camera 2.3-50 that faces in a direction such as direction 2.3-54 (e.g., in the −Z direction and slightly in the +Y direction as an example) and may contain a second camera such as camera 2.3-52 (sometimes referred to as a forward-facing camera) that faces in a forward direction such as direction 2.3-56 (e.g., in the +Y direction and slightly in the −Z direction as an example). The left-hand side of device 2.3-10 may have a corresponding pair of cameras that are oriented in the same way. The angles of view of the cameras on the left and right sides may be configured to overlap in front of device 2.3-10, so that there are no gaps in coverage in front of the user. If desired, cameras 2.3-50 and 2.3-52 may be replaced by a single camera (e.g., a camera in the position of camera 2.3-52, a camera in the position of camera 2.3-50, or a camera in another suitable forward-facing and/or downward-facing orientation that captures images while viewing outwardly from a location on front side F of device 2.3-10). There may be, for example, a single tracking camera (e.g., camera 2.3-52) on the right side of device 2.3-10 and a corresponding single tracking camera on the left side of device 2.3-10.

Regardless of the number of tracking cameras provided on each side of device 2.3-10, there may be a right-hand infrared light source such as light source 2.3-58 that provides supplemental illumination (infrared light) in direction 2.3-60 to illuminate objects such as hand 2.3-30H, body 2.3-30B, and other external objects for the tracking camera(s) on the right-hand side of device 2.3-10 and there may be a corresponding left-hand infrared light source that provides supplemental infrared light for the tracking camera(s) on the left side of device 2.3-10. The use of a single supplemental infrared light source on each side of device 2.3-10 to provide supplemental illumination for the tracking camera(s) on that side of device 2.3-10 may help to conserve space within the tight confines of housing 2.3-26.

The supplemental illumination system of device 2.3-10 may provide infrared illumination in an area (range of angles) that is larger than the area (range of angles) covered by the tracking camera(s) of device 2.3-10, that is equal in area to the area covered by the camera(s), or that is smaller than the area covered by the camera(s).

Consider, as an example the coverage of the supplemental illumination system of device 2.3-10 of FIG. 2.3-1 within the YZ plane. As shown in the side view of FIG. 2.3-1, downward-facing camera 2.3-50 may be characterized by an angle of view A1 in the YZ plane and forward-facing camera 2.3-52 may be characterized by an angle of view A3 in the YZ plane. These angles of view may overlap to provide continuous tracking coverage in the YZ plane. If desired, the same amount of coverage in the YZ plane or another suitable amount of coverage may be provided using a single tracking camera. The example of FIG. 2.3-1 is illustrative.

Supplemental illumination from light source 2.3-58 may be characterized by an illumination angle A2 in the YZ plane. The value of A2 may be larger than, equal to, or smaller than the combined angle-of-view of cameras 2.3-50 and 2.3-52 or may be larger than, equal to, or smaller than the angle-of-view of a single tracking camera being used in place of cameras 2.3-50 and 2.3-52. In an illustrative configuration, A2 is smaller than the overall angle of view of the tracking camera(s) and is directed outwardly in a forward and downward direction in front of device 2.3-10 (where hand and body tracking is most likely to take place). The use of a somewhat reduced illumination area for the supplemental illumination system (e.g., an area of illumination that is less than the area covered by the tracking camera system) may help to conserve power when operating for extended periods of time in dark operating environments while preserving the ability to track objects in all but peripheral areas.

FIG. 2.3-2 is a top view of device 2.3-10 showing how device 2.3-10 may contain cameras on both the left and right sides of support structure 2.3-26. The center of housing portion 2.3-26M may contain nose bridge portion 2.3-26NB. Nose bridge portion 2.3-26NM may have a lower edge with a curved shape configured to rest on a user's nose while device 2.3-10 is worn on a user's face. Nose bridge portion 2.3-26NB may couple right housing portion 2.3-26R to left housing portion 2.3-26L. Optical components 2.3-62 may include side-facing visible light cameras, forward-facing visible light cameras, a time-of-flight camera (e.g., a time-of-flight sensor in nose bridge portion 2.3-26NM that faces forward), three-dimensional structured light cameras (e.g., left and right structured light cameras adjacent to nose bridge portion 2.3-26NB), a flicker sensor for detecting ambient light fluctuations (e.g., 60 Hz fluctuations associated with indoor artificial lighting), an ambient light sensor, etc.

Right camera 2.3-52 may be supported in right housing portion 2.3-26R and corresponding left camera 2.3-52' may be supported in left housing portion 2.3-26L. Similarly, an optional additional right camera such as camera 2.3-50 of FIG. 2.3-1 may be supported in right housing portion 2.3-26R and a corresponding optional additional left camera may be supported in left housing portion 2.3-26L. In this type of configuration, supplemental illumination for the single right-side tracking camera or the pair of right side tracking cameras may be provided by right supplemental light source 2.3-58 and supplemental illumination for the left side camera(s) may be provided by left supplemental light source 2.3-58'.

During supplemental illumination operations, light sources 2.3-58 and 2.3-58' produce supplemental illumination in directions 2.3-60 and 2.3-60', respectively. As described in connection with the relative coverage areas of the cameras and light source of FIG. 2.3-1, it is not necessary for the illumination coverage area of the supplemental illumination system to exactly match the coverage area of the cameras. For example, the tracking cameras on each side of device 2.3-10 may be characterized by an angle of view that is larger in the XY plane than the angle of coverage of the associated light source. Arrangements in which the illumination from the supplemental light source on each side of device 2.3-10 is provided over the same range of angles as the angle of view of the cameras or in which the illumination is provided over a wider range of angles than the cameras' angle-of-view may also be used.

Supplemental illumination may be provided over a relatively large fixed area in a global fashion or a desired area may be covered by activating or moving a narrower beam of illumination towards or across the desired area. If desired, a dynamic illumination system with a steered or addressable beam of supplemental illumination may steer or activate the illumination beam so that the beam follows a user's hand or other object of interest. In this way, power is not needlessly expended illuminating areas that do not contain objects to track.

FIG. 2.3-5 and 2.3-6 are side views of illustrative fixed-area supplemental illumination light sources. Illustrative light source 2.3-58 of FIG. 2.3-3 has a semiconductor light-emitting device 2.3-70. Device 2.3-70 may be a solid state light-emitting device such as a light-emitting diode, a superluminous light-emitting diode, a resonant cavity light-emitting diode, an edge-emitting light-emitting diode, or a vertical-cavity-surface-emitting diode, may be a diode-pumped laser such as a diode-pumped fiber laser or other diode-pumped laser, etc. As shown in FIG. 2.3-3, device 2.3-70 may be mounted on optional interposer interposer 2.3-72 (e.g., using solder). Interposer interposer 2.3-72 may be mounted to package substrate 2.3-74 (e.g., a printed circuit). During operation, device 2.3-70 may emit infrared light that is spread over a desired illumination area by one or more optical structures that overlap device 2.3-70. In the example of FIG. 2.3-3, these optical structures include optional overmolded polymer lens 3.3-76 and optional secondary optical structures such as peanut lens 3.3-78. It is also possible to form curved reflective optical structures on interposer 2.3-76 or substrate 2.3-74 to enhance side and/or back light recollection. The optical structures that overlap device 2.3-70 may be used to shape the light intensity to produce a desirable far-field distribution different than the native light source intensity distribution (e.g., a light-emitting diode with a Lambertian intensity distribution). If desired, safety enhancement structures such as resistive safety traces or capacitive traces may be embedded in optics or may overlap optics or a photodetector may be used to form a closed loop with a safety interlock on light-source drivers (e.g., in connection with module architectures of the types shown in connection with FIGS. 2.3-5 through 2.3-8).

In the illustrative configuration of FIG. 2.3-4, light-emitting device 2.3-70 (e.g., a laser) has been mounted under a light spreading structure such as beam shaping layer 2.3-82. Layer 2.3-82 may be supported in light source package 2.3-80. Device 2.3-70 may be mounted in package 2.3-80 on optional interposer interposer 2.3-72 on a printed circuit or other substrate. During operation, device 2.3-70 of FIG. 2.3-4 may emit infrared light in an upward direction that is spread out laterally by beam shaping layer 2.3-82 to cover a desired illumination area (e.g., +/−60° or other suitable range of angles).

In general, any suitable optical components that serve as light spreading structures may overlap device 2.3-70 of FIGS. 2.3-5 and 2.3-6. These optical components may include optical components such as refractive beam shaping optical components, diffractive optics, diffusive optics, optical nanostructures (e.g., thin two-dimensional metamaterial layers such as patterned structures of clear dielectric with subwavelength dimensions that form metasurfaces that are configured to spread the emitted beam), curved reflectors, etc. Multiple devices 2.3-70 may be mounted in a common package and/or multiple packaged devices 2.3-70 may be mounted on a printed circuit adjacent to each other when forming light source 2.3-58. The use of a single light-emitting device 2.3-70 in forming light source 58 in the examples of FIGS. 2.3-5 and 2.3-6 is illustrative.

FIGS. 2.3-7 and 2.3-8 are side views of illustrative dynamic pattern illuminators that may be used in an illumination system for device 2.3-10. Using light source of the types shown in FIGS. 2.3-7 and 2.3-8, control circuitry 2.3-12 can selectively activate or steer an emitted beam of infrared light so that one or more objects of interest can be provided with targeted supplemental illumination.

In the example of FIG. 2.3-5, light source 2.3-58 has an array of light-emitting devices 2.3-70. Devices 2.3-70 may include multiple semiconductor dies mounted on a substrate such as printed circuit 2.3-84 in package 2.3-86, may include multiple individually addressable emitters, or may include multiple individually addressable segments of emitters mounted on a substrate such as silicon, ceramic, printed circuit board 2.3-84, or other substrate in package 2.3-86. A zoned beam shaper layer or other optical component such as layer 2.3-88 may overlap devices 2.3-70. Layer 2.3-88 may have multiple zones each with a respective beam steering and beam shaping optical structure. These structures may be refractive structures, diffractive structures, nanostructures, etc. Structures on both surfaces of layer 2.3-88 and/or multiple layers of layer 2.3-88 with vertically aligned or misaligned zones may be employed. Each zone may be used to steer and shape a beam of light emitted from a respective light-emitting device in a different respective direction. For example, a first zone may direct a beam of light that has been emitted vertically from a first device 2.3-70 to the left, whereas a second zone may direct a beam of light that has been emitted vertically from a second device 2.3-70 to the right. By overlapping an array of individually controlled devices 70 with a corresponding array of individualized beam steering structures, each device 2.3-70 can be configured to emit a beam of light in a different respective direction (see, e.g., illustrative beams 2.3-90), providing light source 2.3-58 of FIG. 2.3-5 with the ability to emit a steered beam of light. The emission area of each beam may overlap with adjacent beams to avoid potential gaps in coverage. Beams 2.3-90 may all be emitted simultaneously or one or more selected beams 2.3-90 may be emitted at a time. If desired, beams 2.3-90 may be emitted in sequence (e.g., to scan the emitted beam from light source 58 across an area of interest).

Another illustrative light source that may be used in forming a dynamic pattern illuminator for the supplemental illumination system of device 2.3-10 is shown in FIG. 2.3-6. Light source 2.3-58 of FIG. 2.3-6 may have one or more light-emitting devices such as device 2.3-70 that emit one or more beams of light such as light beam 2.3-92 (e.g., an infrared light beam). Device 2.3-70 may be mounted on a printed circuit or other substrate 2.3-94 in package 2.3-96. Electrically controlled beam steerer 2.3-98 may have one or more beam steerers such as steerable microelectromechanical systems mirror 2.3-100 or other electrically adjustable beam steering element(s) controlled by control signals from control circuitry 2.3-12. When it is desired to emit light in a first direction, mirror 2.3-100 may be placed in a first orientation that reflects beam 2.3-92 to create first emitted beam 2.3-102. When it is desired to emit light in a second direction, mirror 2.3-100 may be placed in a second orientation that is different than the first orientation, thereby reflecting beam 2.3-92 to create second emitted beam 2.3-104. Mirror 2.3-100 may be placed in any suitable number of different orientations (e.g., at least 2, at least 10, at least 25, at least 100, less than 5000, less than 1000, less than 500, or other suitable number). Mirror 2.3-100 may be rotated about a single axis (to change the angle of emitted light beams along a single dimension) or may be rotated about two axes (e.g., to change the angle of emitted light beams arbitrarily in two dimensions). If desired, beam shaping optics (e.g., beam collimating lenses, etc.) may be incorporated into beam steerer 2.3-98 to help ensure that the steered beam has a desired intensity profile.

If desired, a hybrid illuminator architecture may be employed, such that multiple channels of device 2.3-70 or multiple devise 2.3-70 as described in connection with FIG. 2.3-5 can be selectively activated to provide one or more additional dimensions of dynamic illumination to beam steering optics such as mirror 2.3-100 of FIG. 2.3-6.

Light sources that emit static wide-area beams (see, e.g., illustrative light sources 2.3-58 of FIGS. 2.3-5 and 2.3-6) may be configured to emit light beams of any suitable shape to help provide supplemental illumination for the tracking cameras of device 2.3-10. FIG. 2.3-7 is a graph showing how light source 2.3-58 may be configured to emit a circular beam field of regards (FoG) such as circular beam 2.3-110 (e.g., a beam of infrared light with full width half maximum (FWHM) intensity characterized by an angular spread of +/−60° or other suitable coverage area) or may be configured to emit a rectangular beam FoG such as rectangular beam 2.3-112 with a similar angular spread vertically and a smaller angular spread horizontally. Two rectangular beams such as beam 2.3-112 may be produced side by side to provide sufficient horizontal illumination coverage for both the left and right cameras in device 2.3-10 (as an example).

In most general use cases, a goal of the illumination system is to provide a uniform signal-to-noise ratio for the illuminated scene captured by one or more cameras. Within the desired FWHM 2-D FoG, a uniform far-field intensity at each instantaneous FOG (iFoG) can be achieved to provide uniform illumination and working range for the cameras. However, there are cases when non-uniform far-field intensity distributions may be desired. For example, when a target of the illumination is flat or when camera vignetting is significant, a symmetric "bat-wing" intensity distribution may be used to compensate for the relative intensity fall-off of the camera image sensor. Further examples include asymmetric intensity distribution for cameras that are aligned with a non-co-axial orientation relative to the illumination system, for targets such as hands that have asymmetric occurrence/residence across FoGs, for multiple illuminators with overlapping FoGs, for multiple non-co-axial cameras, for irregular occlusions at certain FOG regions, etc.

The graphs of FIGS. 2.3-10 and 2.3-11 show illustrative beam outputs (angular beam distributions) associated with a dynamically adjustable illumination system. In the example of FIG. 2.3-8, a light source such as light source 58 of FIG. 2.3-5 or light source 58 of FIG. 2.3-6 has been configured to produce a beam with an elongated rectangular shape (e.g., a rectangle having a larger horizontal spread than vertical spread). Using beam steering, light source 2.3-58 may emit this elongated rectangular beam in one or more vertical locations, such as illustrative location 2.3-114 of FIGS. 2.3-8. In an arrangement of the type shown in FIG. 2.3-5, each light-emitting device 2.3-70 may produce a different respective elongated rectangular beam each of which is associated with a different vertical position in the output of light source 2.3-58. One or more of these beams may be emitted at the same time by turning on one or more respective light-emitting devices 2.3-70. In an arrangement of the type shown in FIG. 2.3-6, light-emitting device 2.3-70 may produce a beam such as beam 2.3-92 of FIG. 2.3-6 that is steered to a desired location (e.g., illustrative location 2.3-114 of FIG. 2.3-8) and/or to other locations by beam steerer 2.3-98, thereby providing a desired coverage for light source 2.3-58.

In the illustrative example of FIG. 2.3-8, light is output over a larger vertical angular range than horizontal range. Additional horizontal coverage may be supplied using an additional light source (e.g., a light source on an opposing side of device 2.3-10). In this way, a desired angular output range (e.g., +/−60° in both horizontal and vertical dimensions or other suitable angular output range) may be covered.

In the illustrative configuration of FIG. 2.3-9, light source 2.3-58 (e.g., a dynamically configured light source such as light source 58 of FIG. 2.3-5 or FIG. 2.3-6) is configured to supply a relatively small circular or square output beam that can be steered in both horizontal and vertical dimensions so that a desired overall amount of coverage is produced.

In both those light sources that are static and do not have steerable beams and in those light sources with dynamically patterned output, beam power can be controlled in a binary fashion (on/off) or in an analog fashion (e.g., by adjusting output power continuously or in a stepwise fashion between more than two different output levels). As shown in FIG. 2.3-9, for example, no light may be output in certain portions of a coverage area such as areas 2.3-116 (e.g., beam power may be zero for these areas), full power light may be output in areas such as areas 2.3-118 (e.g., beam power may be maximized for these areas), and an intermediate power level may be used when supplying output light to other areas such as areas 2.3-120 that are immediately adjacent to areas 2.3-118.

Arrangements in which full-power light is only output in a subset of the total coverage area for light source 58 may help device 2.3-10 use power efficiently. As shown in the diagram of FIG. 2.3-9, for example, there may be one or more external objects of interest such as objects 2.3-122 within the coverage area of a given light source. Device 2.3-10 may, as an example, be tracking a user's hands or other external objects. When these objects are relatively small compared to the overall angle-of-view of the cameras in device 2.3-10, power can be conserved by restricting the output of supplemental illumination (or at least restricting the output of full-power supplemental illumination) to only those regions that overlap the tracked external objects.

In the FIG. 2.3-9 example, objects 2.3-122 (e.g., the user's hands or other body part or other objects in the user's environment) are being actively tracked by device 2.3-10. As a result, the supplemental illumination system of device 2.3-10 is being used to provide full-power illumination to areas 2.3-118 that overlap objects 2.3-122. Elsewhere in the coverage area of light-emitting device 58, beam power is reduced (see, e.g., intermediate power areas 2.3-120) or shut off entirely (see, e.g., unilluminated areas 2.3-116). This type of approach may be used for either scanned beam arrangements (e.g., using a scanning mirror device or other beam steerer as described in connection with FIG. 2.3-6) or using light sources with addressable arrays of devices 70 each of which can provide output in different directions (e.g., light source 58 of FIG. 2.3-5).

In areas such as areas 2.3-116 of FIG. 2.3-9, no supplemental illumination is present, so items in those areas will not receive supplemental illumination. Nevertheless, once objects such as objects 2.3-122 are being tracked, device 2.3-10 can monitor the position and direction of movement of objects 2.3-122 in real time. This allows device 2.3-10 to provide supplemental illumination of full power to the areas overlapping objects 2.3-122 and intermediate power (or, if desired, full power), to portions of the output area of light source 58 that are immediately adjacent to objects 2.3-122 (e.g., areas where objects 2.3-122 may possibly move and/or are predicted to occupy in the near future based on tracked movements). In the event that the positions of objects 2.3-122 move into one of those adjacent areas, device 2.3-10 can increase the supplemental illumination on those areas to full power and can update the beam powers so that adjacent areas again have intermediate power level coverage.

Although the multi-power-level beam scheme of FIG. 2.3-9 has been described in connection with a two-dimensional scanning light beam from light sources 2.3-58 of FIGS. 7 and 8, such adjustable power output schemes may also be used with light sources 2.3-58 that provide one-dimensional adjustable direction light sources (e.g., light sources that produce slices of supplemental illumination of the type shown in FIG. 2.3-8) and/or may be used with fixed-area light sources. In a fixed-area light source scheme, for example, a right-hand light source 58 of the type shown in FIG. 2.3-3 or FIG. 2.3-4 may be used to supply supplemental illumination for tracking objects 2.3-122 that are in front of the right-hand camera(s) of device 2.3-10, whereas a left-hand light source 58 of the type shown in FIG. 2.3-3 or FIG. 2.3-4 may be used to supply supplemental illumination for tracking objects 2.3-122 that are in front of the left-hand camera(s) of device 2.3-10. Device 2.3-10 can activate either the right-hand light-source or the left-hand light source or both depending on the current and expected locations of objects 2.3-122.

Another way in which to help use power efficiently for the supplemental illumination system involves using light sources 2.3-58 to produce supplemental illumination only when the cameras for which the supplemental illumination is being provided will benefit from the supplemental illumination. For example, in bright lighting conditions, ambient visible light will provide sufficient illumination, so supplemental infrared light beams can be turned off (or at least reduced in power to a lower level than otherwise used) to help conserve power. The activation of supplemental lighting may take place when dim ambient lighting conditions are detected or when other suitable conditions are detected to trigger the production of supplemental lighting.

FIG. 2.3-10 is a flow chart of illustrative operations involved in using electronic device 2.3-10. During the operations of block 2.3-150, device 2.3-10 may be used to provide a user with content such as visual content, audio content, and other output. Device 2.3-10 may, as an example be worn on a user's head while images are presented for viewing. The operations of block 2.3-150 may be performed while device 2.3-10 is in a normal operating environment with satisfactory visible ambient light levels.

Visual content may be presented for the user on displays 2.3-14. This visual content may include camera images from cameras in device 2.3-10 (e.g., pass-through video) and/or other content. In some scenarios, computer-generated content (sometimes referred to as virtual content) may be overlaid on top of real-world content from cameras in device 2.3-10. In this type of mixed reality environment, camera data may be used to help track the locations of the user's hands and other real-world objects and thereby help register the overlaying of virtual content on real-world images. For example, by tracking the location of a user's hand, a computer-generated image of a glove may be accurately overlaid on top of a real-world image of the user's hand. By tracking the location of a table surface, a computer-generated image may be placed on top of the table surface. Camera data can be used to track the motion of a user's hands, fingers, and/or other body parts in real time. In this way, hand gestures, finger gestures, and/or other body part motions that serve as user input (sometimes referred to as air gestures) can be used in controlling the operation of device 2.3-10 (e.g., in a mixed-reality or completely virtual environment).

Device 2.3-10 may have any suitable number of cameras including three-dimensional cameras (e.g., structured light cameras, time-of flight cameras, etc.), cameras for capturing real-world visible-light images (e.g., for video passthrough), and/or cameras that perform tracking operations, that serve as parts of visual inertial odometry systems, and/or that otherwise support the operation of device 2.3-10. The cameras of device 2.3-10 may face forward, down, to the side, up, to the rear, and/or in multiple directions. Some cameras may operate only at visible wavelengths. Other cameras may operate at visible and infrared wavelengths.

As described in connection with FIGS. 3 and 4, device 2.3-10 may, as an example, have a one or more tracking cameras on each side of device 2.3-10. These cameras may be sensitive at visible and infrared wavelengths and may be used for tracking operations (e.g., hand and body tracking, air gesture input tracking, accessory tracking) and optionally additional functions such as imaging structures in the user's environment for a visual inertial odometry system). Tracking cameras may be sensitive at visible and infrared wavelengths such as wavelengths from 400-1000 nm, 400-740 nm and 940 nm, or other suitable visible and infrared wavelengths. The infrared sensitivity of the tracking cameras preferably coincides with the wavelength or wavelengths emitted by light sources 2.3-58 in the supplemental illumination system, allowing these cameras to operate when most or all available illumination is being provided by light sources 2.3-58 rather than ambient light sources.

Supplemental illumination may, if desired, be provided continuously. Arrangements in which power is conserved by at least occasionally depowering the supplemental illumination system are described herein as an example. In configurations for device 2.3-10 in which supplemental illumination is turned on and off, device 2.3-10 may, during the operations of block 2.3-150, monitor for the occurrence of conditions indicating that supplemental illumination should be switched on for satisfactory operation of the cameras (e.g., the tracking cameras). These monitoring activities may take place while the cameras of device 2.3-10 (e.g., the tracking cameras) are operating normally in the absence of supplemental illumination from the supplemental illumination system.

Any suitable trigger criteria may be used to determine when to activate the supplemental illumination system by turning on light sources 2.3-58. As an example, device 2.3-10 may contain an ambient light sensor. The ambient light sensor may measure the amount of visible ambient light that is present in the environment surrounding device 2.3-10. A threshold or other criteria may be applied to ambient light readings from the ambient light sensor. In response to determining that ambient light levels are below a predetermined ambient light threshold or are otherwise too dim for satisfactory operation of the tracking cameras, control circuitry 12 can turn on light sources 2.3-58 to provide supplemental illumination (e.g., infrared light).

Another illustrative criteria that may be used in determining when to activate supplemental illumination involves evaluating an image processing algorithm quality metric. During the operations of bock 2.3-150, captured images may be proceed by one or more image processing algorithms. These algorithms may include, as an example, a hand tracking algorithm. The hand tracking algorithm may produce a quality factor or other metric that is indicative of the ability of the hand tracking algorithm to satisfactorily track the user's hands. In response to detecting that the tracking algorithm quality metric is below a desired threshold value, control circuitry 12 can turn on light sources 2.3-58 to provide supplemental illumination for the cameras.

If desired, the tracking cameras or other image sensor hardware may supply information indicating that performance is being adversely affected by low ambient lighting levels. As an example, frames of image data may be evaluated to determine whether lighting levels are low. The output of the tracking camera hardware of device 2.3-10 may also indicate whether signal-to-noise levels are satisfactory. If the tracking cameras are producing only dark and/or noisy image data, control circuitry 12 can determine that light sources 2.3-58 should be turned on.

In some arrangements, device 2.3-10 may be configured to determine the location of a user relative to walls and other obstructions in the user's environment. As an example, device 2.3-10 may contain a map of known wall locations (e.g., a map obtained from an external source or a map based on previous map-building operations performed by device 2.3-10 when a user wore device 2.3-10 while walking throughout a building or other environment). Satellite navigation system circuitry (e.g., Global Positioning System circuitry) may use satellite signals to determine the location of device 2.3-10 (e.g. the location of device 2.3-10 relative to building walls and other obstructions). From the user's known location and movement and using information on the locations of known obstructions such as walls, device 2.3-10 can predict when a user is likely to approach a wall or other obstruction. Sensors 16 in device 2.3-10 (such as proximity sensors, time of flight sensors, radar, LIDAR, etc.) may also be used in monitoring the user's movements relative to walls and other obstructions. By using some or all of this information in combination with additional information on the operating environment for device 2.3-10 (e.g., ambient light readings indicating that ambient lighting is dim), device 2.3-10 can determine when light sources 2.3-58 should be turned on to provide supplemental illumination to help ensure that the tracking cameras of device 2.3-10 will operate satisfactorily. This may help ensure that the cameras of device 2.3-10 can track the locations of obstructions in the user's environment using the infrared illumination of light sources 2.3-58. By tracking the locations of obstructions accurately, these obstructions or alerts regarding the presence of the obstructions can be displayed on displays 2.3-14 to help the user avoid undesired collisions with the obstructions.

If desired, multiple electronic devices 2.3-10 in system 2.3-8 may monitor for conditions indicating that supplemental illumination is needed. For example, multiple users may be wearing head-mounted devices and one device may detect low levels of ambient lighting before another. In this type of system, any of the devices that detect a low level of ambient lighting can signal the other devices in the system to request that supplemental illumination be provided. In response, one or more of the other devices may provide supplemental illumination to assist the cameras of the requesting device in gathering images. The supplemental illumination systems of different devices may therefore assist each other by contributing shared supplemental illumination. This may allow a wall-powered device to help provide supplemental illumination for a battery powered device or may allow an electronic device that is close to a tracked object to provide supplemental illumination to that object more efficiently than an electronic device that is farther from the tracked object (as examples).

So long as conditions for triggering supplemental illumination are not detected, device 2.3-10 (e.g., control circuitry 12) may continue to monitor for conditions that satisfy supplemental illumination trigger criteria (e.g., dim ambient lighting, reduction of tracking camera image processing quality, reduction of camera hardware performance, criteria based on obstruction proximity, requests from other devices, etc.) during the operations of block 2.3-150.

In the event that the trigger criteria are satisfied, processing may proceed to block 2.3-152. During the operations of block 2.3-152, control circuitry 2.3-14 can use the supplemental illumination system to provide supplemental illumination for the cameras (e.g., infrared light emitted by light sources 2.3-58 that illuminates exterior objects in the field of view of the tracking cameras). In providing the supplemental illumination, the power of the infrared light emitted by each light source 2.3-58 and/or the direction of the light beam(s) emitted by each light source 2.3-58 may be adjusted. For example, some devices 2.3-70 may be turned on while other devices 2.3-70 remain off, beams of emitted light may be directed to areas containing tracked objects (e.g., the known locations of the user's hands or other external objects of interest being tracked by the tracking cameras) and/or adjacent areas, emitted power levels may be adjusted in a stepwise fashion or continuously (e.g., so that sufficient supplemental illumination is provided to ensure satisfactory tracking camera operation without providing excess illumination), etc.

Light sources such as light sources 2.3-58 of FIGS. 2.3-5 and 2.3-6 that are configured to provide illumination over a fixed area may be turned on to ensure that objects in those fixed areas are illuminated. Light sources that emit steerable beams such as light sources 2.3-58 of FIG. 2.3-5 and 2.3-8 may be used to emit supplemental illumination over a relatively large area (e.g. by scanning a beam across the large area or by simultaneously using multiple smaller beams to illuminate different respective parts of the larger area) or may be used to emit supplemental illumination to particular locations such as the location(s) containing the user's hands or other objects being tracked.

Supplemental illumination may be provided for cameras that track user body parts, cameras that track the locations of accessories, cameras that capture pass-through video, cameras that form part of a visual inertial odometry system, and/or other optical components that gather light from objects in the vicinity of device 2.3-10. If desired, light sources 2.3-58 may be configured to emit structured light (e.g., lines, dots, features distributed in pseudorandom patterns, etc.). Structured light may be used, for example, in scenarios in which the tracking cameras gather three-dimensional images.

During the operations of block 2.3-152, device 2.3-10 may monitor for conditions that indicate that supplemental illumination is no longer needed. Control circuitry 2.3-12 may, for example, monitor to determine whether supplemental illumination trigger conditions cease to be satisfied. So long as dim ambient lighting conditions or other conditions indicating that supplemental illumination should be provided continue to be present, device 2.3-10 can continue to use light sources 2.3-58 to provide supplemental illumination. In the event that dim lighting conditions cease or that other conditions in which supplemental illumination is desired are determined to no longer be present, device 2.3-10 can turn off the supplemental illumination system. In particular, control circuitry 2.3-12 can turn off light sources 2.3-58 during the operations of block 156. As indicated by line 2.3-152, operations may then return to block 2.3-150.

2.4: Systems with Displays and Sensor-Hiding Structures

FIG. 2.4-1 is a front view of device 2.4-10 in an illustrative configuration in which device 2.4-10 has a publicly viewable display such as forward-facing display 2.4-14F. As shown in FIG. 2.4-1, support structure 2.4-16M of device 2.4-10 may have right and left portions such as portions 2.4-16R and 2.4-16L that are coupled by an interposed nose bridge portion such as portion 2.4-16NB. Portion 2.4-16NB may have a curved exterior surface such as nose bridge surface 2.4-90 that is configured to receive and rest upon a user's nose to help support main housing portion 2.4-16M on the head of the user.

Display 2.4-14F may have an active area such as active area AA that is configured to display images and an inactive area IA that does not display images. The outline of active area AA may be rectangular, rectangular with rounded corners, may have teardrop shaped portions on the left and right sides of device 2.4-10, may have a shape with straight edges, a shape with curved edges, a shape with a peripheral edge that has both straight and curved portions, and/or other suitable outlines. As shown in FIG. 2.4-1, active area AA may have a curved recessed portion at nose bridge portion 2.4-16NB of main housing portion 2.4-16. The presence of the nose-shaped recess in active area AA may help fit active area AA within the available space of housing portion 2.4-16M without overly limiting the size of active area AA.

Active area AA contains an array of pixels. The pixels may be, for example, light-emitting diode pixels formed from thin-film organic light-emitting diodes or crystalline semiconductor light-emitting diode dies (sometimes referred to as micro-light-emitting diodes) on a flexible display panel substrate. Configurations in which display 2.4-14F uses other display technologies may also be used, if desired. Illustrative arrangements in which display 14 is formed from a light-emitting diode display such as an organic light-emitting diode display that is formed on a flexible substrate (e.g., a substrate formed from a bendable layer of polyimide or a sheet of other flexible polymer) may sometimes be described herein as an example. The pixels of active area AA may be formed on a display device such as display panel 2.4-14P of FIG. 2.4-1 (e.g., a flexible organic light-emitting diode display panel). In some configurations, the outline of active area AA (and, if desired, panel 2.4-14P) may have a peripheral edge that contains straight segments or a combination of straight and curved segments. Configurations in which the entire outline of active area AA (and optionally panel 2.4-14P) is characterized by a curved peripheral edge may also be used.

Display 2.4-14F may have an inactive area such as inactive area IA that is free of pixels and that does not display images. Inactive area IA may form an inactive border region that runs along one more portions of the peripheral edge of active area AA. In the illustrative configuration of FIG. 2.4-1, inactive area IA has a ring shape that surrounds active area AA and forms an inactive border. In this type of arrangement, the width of inactive area IA may be relatively constant and the inner and outer edges of area IA may be characterized by straight and/or curved segments or may be curved along their entire lengths. For example, the outer edge of area IA (e.g., the periphery of display 2.4-14F) may have a curved outline that runs parallel to the curved edge of active area AA.

In some configurations, device 2.4-10 may operate with other devices in system 2.4-8 (e.g., wireless controllers and other accessories). These accessories may have magnetic sensors that sense the direction and intensity of magnetic fields. Device 2.4-10 may have one or more electromagnets configured to emit a magnetic field. The magnetic field can be measured by the wireless accessories near device 2.4-10, so that the accessories can determine their orientation and position relative to device 2.4-10. This allows the accessories to wirelessly provide device 2.4-10 with real-time information on their current position, orientation, and movement so that the accessories can serve as wireless controllers. The accessories may include wearable devices, handled devices, and other input devices.

In an illustrative configuration, device 2.4-10 may have a coil such as illustrative coil 2.4-54 that runs around the perimeter of display 2.4-14F (e.g., under inactive area IA or other portion of display 2.4-14F). Coil 2.4-54 may have any suitable number of turns (e.g., 1-10, at least 2, at least 5, at least 10, 10-50, fewer than 100, fewer than 25, fewer than 6, etc.). These turns may be formed from metal traces on a substrate, may be formed from wire, and/or may be formed from other conductive lines. During operation, control circuitry 2.4-12 may supply coil 2.4-54 with an alternating-current (AC) drive signal. The drive signal may have a frequency of at least 1 kHz, at least 10 kHz, at least 100 kHz, at least 1 MHz, less than 10 MHz, less than 3 MHz, less than 300 kHz, or less than 30 kHz (as examples). As AC current flows through coil 2.4-54, a corresponding magnetic field is produced in the vicinity of device 2.4-10. Electronic devices such as wireless controllers with magnetic sensors that are in the vicinity of device 2.4-10 may use the magnetic field as a reference so that the wireless controllers can determine their orientation, position, and/or movement while being moved relative to device 2.4-10 to provide device 2.4-10 with input.

Consider, as an example, a handheld wireless controller that is used in controlling the operation of device 2.4-10. During operation, device 2.4-10 uses coil 2.4-54 to emit a magnetic field. As the handheld wireless controller is moved, the magnetic sensors of the controller can monitor the location of the controller and the movement of the controller relative to device 2.4-10 by monitoring the strength, orientation, and change to the strength and/or orientation of the magnetic field emitted by coil 2.4-54 as the controller is moved through the air by the user. The electronic device can then wirelessly transmit information on the location and orientation of the controller to device 2.4-10. In this way, a handheld controller, wearable controller, or other external accessory can be manipulated by a user to provide device 2.4-10 with air gestures, pointing input, steering input, and/or other user input.

Device 2.4-10 may have components such as optical components (e.g., optical sensors among sensors 2.4-16 of FIG. 2.4-1). These components may be mounted in any suitable location on head-mounted support structure 2.4-16 (e.g., on head strap 2.4-16B, on main housing portion 2.4-16M, etc.). Optical components and other components may face rearwardly (e.g., when mounted on the rear face of device 2.4-10), may face to the side (e.g., to the left or right), may face downwardly or upwardly, may face to the front of device 2.4-10 (e.g., when mounted on the front face of device 2.4-10), may be mounted so as to point in any combination of these directions (e.g., to the front, to the right, and downward) and/or may be mounted in other suitable orientations. In an illustrative configuration, at least some of the components of device 2.4-10 are mounted so as to face outwardly to the front (and optionally to the sides and/or up and down). For example, forward-facing cameras for pass-through video may be mounted on the left and right sides of the front of device 2.4-10 in a configuration in which the cameras diverge slightly along the horizontal dimension so that the fields of view of these cameras overlap somewhat while capturing a wide-angle image of the environment in front of device 2.4-10. The captured image may, if desired, include portions of the user's surroundings that are below, above, and to the sides of the area directly in front of device 2.4-10.

To help hide components such as optical components from view from the exterior of device 2.4-10, it may be desirable to cover some or all of the components with cosmetic covering structures. The covering structures may include transparent portions (e.g., optical component windows) that are characterized by sufficient optical transparency to allow overlapped optical components to operate satisfactorily. For example, an ambient light sensor may be covered with a layer that appears opaque to an external viewer to help hide the ambient light sensor from view, but that allows sufficient ambient light to pass to the ambient light sensor for the ambient light sensor to make a satisfactory ambient light measurement. As another example, an optical component that emits infrared light may be overlapped with a visibly opaque material that is transparent to infrared light.

In an illustrative configuration, optical components for device 2.4-10 may be mounted in inactive area IA of FIG. 2.4-1 and cosmetic covering structures may be formed in a ring shape overlapping the optical components in inactive area IA. Cosmetic covering structures may be formed from ink, polymer structures, structures that include metal, glass, other materials, and/or combinations of these materials. In an illustrative configuration, a cosmetic covering structure may be formed from a ring-shaped member having a footprint that matches the footprint of inactive area IA. If, for example, active area AA has left and right portions with teardrop shapes, the ring-shaped member may have curved edges that follow the curved periphery of the teardrop-shaped portions of active area AA. The ring-shaped member may be formed from one or more polymer structures (e.g., the ring-shaped member may be formed from a polymer ring). Because the ring-shaped member can help hide overlapped components from view, the ring-shaped member may sometimes be referred to as a shroud or ring-shaped shroud member. The outward appearance of the shroud or other cosmetic covering structures may be characterized by a neutral color (white, black, or gray) or a non-neutral color (e.g., blue, red, green, gold, rose gold, etc.).

Display 2.4-14F may, if desired, have a protective display cover layer. The cover layer may overlap active area AA and inactive area IA (e.g., the entire front surface of device 2.4-10 as viewed from direction 2.4-52 of FIG. 2.4-1 may be covered by the cover layer). The cover layer, which may sometimes be referred to as a housing wall or transparent housing wall, may have a rectangular outline, an outline with teardrop portions, an oval outline, or other shape with curved and/or straight edges.

The cover layer may be formed from a transparent material such as glass, polymer, transparent crystalline material such as sapphire, clear ceramic, other transparent materials, and/or combinations of these materials. As an example, a protective display cover layer for display 2.4-14F may be formed from safety glass (e.g., laminated glass that includes a clear glass layer with a laminated polymer film). Optional coating layers may be applied to the surfaces of the display cover layer. If desired, the display cover layer may be chemically strengthened (e.g., using an ion-exchange process to create an outer layer of material under compressive stress that resists scratching). In some configurations, the display cover layer may be formed from a stack of two or more layers of material (e.g., first and second structural glass layers, a rigid polymer layer coupled to a glass layer or another rigid polymer layer, etc.) to enhance the performance of the cover layer.

In active area AA, the display cover layer may overlap the pixels of display panel 2.4-14P. The display cover layer in active area AA is preferably transparent to allow viewing of images presented on display panel 2.4-14P. In inactive area IA, the display cover layer may overlap the ring-shaped shroud or other cosmetic covering structure. The shroud and/or other covering structures (e.g., opaque ink coatings on the inner surface of the display cover layer and/or structures) may be sufficiently opaque to help hide some or all of the optical components in inactive area IA from view. Windows may be provided in the shroud or other cosmetic covering structures to help ensure that the optical components that are overlapped by these structures operate satisfactorily. Windows may be formed from holes, may be formed from areas of the shroud or other cosmetic covering structures that have been locally thinned to enhance light transmission, may be formed from window members with desired light transmission properties that have been inserted into mating openings in the shroud, and/or may be formed from other shroud window structures.

In the example of FIG. 2.4-1, device 2.4-10 includes optical components such as optical components 2.4-60, 2.4-62, 2.4-64, 2.4-66, 2.4-68, 2.4-70, 2.4-72, 2.4-74, 2.4-76, 2.4-78, and 2.4-80 (as an example). Each of these optical components (e.g., optical sensors selected from among sensors 2.4-16 of FIG. 2.4-1, light-emitting devices, etc.) may be configured to detect light and, if desired to emit light (e.g., ultraviolet light, visible light, and/or infrared light).

In an illustrative configuration, optical component 2.4-60 may sense ambient light (e.g., visible ambient light). In particular, optical component 2.4-60 may have a photodetector that senses variations in ambient light intensity as a function of time. If, as an example, a user is operating in an environment with an artificial light source, the light source may emit light at a frequency associated with its source of wall power (e.g., alternating-current mains power at 60 Hz). The photodetector of component 2.4-60 may sense that the artificial light from the artificial light source is characterized by 60 Hz fluctuations in intensity. Control circuitry 2.4-12 can use this information to adjust a clock or other timing signal associated with the operation of image sensors in device 2.4-10 to help avoid undesired interference between the light source frequency and the frame rate or other frequency associated with image capture operations. Control circuitry 2.4-12 can also use measurements from component 2.4-60 to help identify the presence of artificial lighting and the type of artificial lighting that is present. In this way, control circuitry 2.4-12 can detect the presence of lights such as fluorescent lights or other lights with known non-ideal color characteristics and can make compensating color cast adjustments (e.g., white point adjustments) to color-sensitive components such as cameras and displays. Because optical component 2.4-60 may measure fluctuations in light intensity, component 2.4-60 may sometimes be referred to as a flicker sensor or ambient light frequency sensor.

Optical component 2.4-62 may be an ambient light sensor. The ambient light sensor may include one or more photodetectors. In a single-photodetector configuration, the ambient light sensor may be a monochrome sensor that measures ambient light intensity. In a multi-photodetector configuration, each photodetector may be overlapped by an optical filter that passes a different band of wavelengths (e.g., different visible and/or infrared passbands). The optical filter passbands may overlap at their edges. This allows component 2.4-62 to serve as a color ambient light sensor that measures both ambient light intensity and ambient light color (e.g., by measuring color coordinates for the ambient light). During operation of device 2.4-10, control circuitry 2.4-12 can take action based on measured ambient light intensity and color. As an example, the white point of a display or image sensor may be adjusted or other display or image sensor color adjustments may be made based on measured ambient light color. The intensity of a display may be adjusted based on light intensity. For example, the brightness of display 2.4-14F may be increased in bright ambient lighting conditions to enhance the visibility of the image on the display and the brightness of display 2.4-14F may be decreased in dim lighting conditions to conserve power. Image sensor operations and/or light source operations may also be adjusted based on ambient light readings.

The optical components in active area IA may also include components along the sides of device 2.4-10 such as components 2.4-80 and 2.4-64. Optical components 2.4-80 and 2.4-64 may be pose-tracking cameras that are used to help monitor the orientation and movement of device 2.4-10. Components 2.4-80 and 2.4-64 may be visible light cameras (and/or cameras that are sensitive at visible and infrared wavelengths) and may, in conjunction with an inertial measurement unit, form a visual inertial odometry (VIO) system.

Optical components 2.4-78 and 2.4-66 may be visible-light cameras that capture real-time images of the environment surrounding device 2.4-10. These cameras, which may sometimes be referred to as scene cameras or pass-through-video cameras, may capture moving images that are displayed in real time to displays 2.4-14R for viewing by the user when the user's eyes are located in eye boxes 2.4-24 at the rear of device 2.4-10. By displaying pass-through images (pass-through video) to the user in this way, the user may be provided with real-time information on the user's surroundings. If desired, virtual content (e.g., computer-generated images) may be overlaid over some of the pass-through video. Device 2.4-10 may also operate in a non-pass-through-video mode in which components 2.4-78 and 2.4-66 are turned off and the user is provided only with movie content, game content, and/or other virtual content that does not contain real-time real-world images.

Input-output devices 2.4-12 of device 2.4-10 may gather user input that is used in controlling the operation of device 2.4-10. As an example, a microphone in device 2.4-10 may gather voice commands. Buttons, touch sensors, force sensors, and other input devices may gather user input from a user's finger or other external object that is contacting device 2.4-10. In some configurations, it may be desirable to monitor a user's hand gestures or the motion of other user body parts. This allows the user's hand locations or other body part locations to be replicated in a game or other virtual environment and allows the user's hand motions to serve as hand gestures (air gestures) that control the operation of device 2.4-10. User input such as hand gesture input can be captured using cameras that operate at visible and infrared wavelengths such as tracking cameras (e.g., optical components 2.4-76 and 2.4-68). Tracking cameras such as these may also track fiducials and other recognizable features on controllers and other external accessories (additional devices 2.4-10 of system 2.4-8) during use of these controllers in controlling the operation of device 2.4-10. If desired, tracking cameras can help determine the position and orientation of a handheld controller or wearable controller that senses its location and orientation by measuring the magnetic field produced by coil 2.4-54. The use of tracking cameras may therefore help track hand motions and controller motions that are used in moving pointers and other virtual objects being displayed for a user and can otherwise assist in controlling the operation of device 2.4-10.

Tracking cameras may operate satisfactorily in the presence of sufficient ambient light (e.g., bright visible ambient lighting conditions). In dim environments, supplemental illumination may be provided by supplemental light sources such as supplemental infrared light sources (e.g., optical components 2.4-82 and 2.4-84). The infrared light sources may each include one or more light-emitting devices (light-emitting diodes or lasers) and may each be configured to provide fixed and/or steerable beams of infrared light that serve as supplemental illumination for the tracking cameras. If desired, the infrared light sources may be turned off in bright ambient lighting conditions and may be turned on in response to detection of dim ambient lighting (e.g., using the ambient light sensing capabilities of optical component 2.4-62).

Three-dimensional sensors in device 2.4-10 may be used to perform biometric identification operations (e.g., facial identification for authentication), may be used to determine the three-dimensional shapes of objects in the user's environment (e.g., to map the user's environment so that a matching virtual environment can be created for the user), and/or to otherwise gather three-dimensional content during operation of device 2.4-10. As an example, optical components 2.4-74 and 2.4-70 may be three-dimensional structured light image sensors. Each three-dimensional structured light image sensor may have one or more light sources that provide structured light (e.g., a dot projector that projects an array of infrared dots onto the environment, a structured light source that produces a grid of lines, or other structured light component that emits structured light). Each of the three-dimensional structured light image sensors may also include a flood illuminator (e.g., a light-emitting diode or laser that emits a wide beam of infrared light). Using flood illumination and structured light illumination, optical components 2.4-74 and 2.4-70 may capture facial images, images of objects in the environment surrounding device 2.4-10, etc.

Optical component 2.4-72 may be an infrared three-dimensional time-of-flight camera that uses time-of-flight measurements on emitted light to gather three-dimensional images of objects in the environment surrounding device 2.4-10. Component 2.4-72 may have a longer range and a narrower field of view than the three-dimensional structured light cameras of optical components 2.4-74 and 2.4-70. The operating range of component 2.4-72 may be 30 cm to 7 m, 2.4-60 cm to 6 m, 70 cm to 5 m, or other suitable operating range (as examples).

2.5: Systems with Cover Layer Sealing Structures

A head-mounted device may include a head-mounted support structure that allows the device to be worn on the head of a user. The head-mounted device may have displays that are supported by the head-mounted support structure for presenting a user with visual content. The displays may include rear-facing displays that present images to eye boxes at the rear of the head-mounted support structure. The displays may also include a forward-facing display. The forward-facing display may be mounted to the front of the head-mounted support structure and may be viewed by the user when the head-mounted device is not being worn on the user's head. The forward-facing display, which may sometimes be referred to as a publicly viewable display, may also be viewable by other people in the vicinity of the head-mounted device.

Optical components such as image sensors and other light sensors may be provided in the head-mounted device. In an illustrative configuration, optical components are mounted under peripheral portions of a display cover layer that protects the forward-facing display. The display cover layer, or other layers within the head-mounted device, may be formed from materials, such as glass, that are prone to shattering. Because the head-mounted device is near a user's eyes during operation, it may be desirable to reduce the likelihood that these layers will shatter into the user's eyes. Therefore, laminates, such as plastic laminates, may be formed on top and bottom surfaces of the cover layer. To protect the edges of the cover layer, encapsulation material may be coupled to the edge surface, or the head-mounted device housing structures may be modified to reduce the likelihood that glass from the cover layer exits the device.

FIG. 2.5-1 is a side view of an illustrative head-mounted electronic device. As shown in FIG. 2.5-1, head-mounted device 2.5-10 may include head-mounted support structure 2.5-26. Support structure 2.5-26 may have walls or other structures that separate an interior region of device 2.5-10 such as interior region 2.5-42 from an exterior region surrounding device 2.5-10 such as exterior region 2.5-44. Electrical components 2.5-40 (e.g., integrated circuits, sensors, control circuitry, light-emitting diodes, lasers, and other light-emitting devices, other control circuits and input-output devices, etc.) may be mounted on printed circuits and/or other structures within device 2.5-10 (e.g., in interior region 2.5-42).

To present a user with images for viewing from eye boxes such as eye boxes 2.5-34, device 2.5-10 may include rear-facing displays such as displays 2.5-14R, which may have associated lenses that focus images for viewing in the eye boxes. These components may be mounted in optical modules (e.g., a lens barrel) to form respective left and right optical systems. There may be, for example, a left rear-facing display for presenting an image through a left lens to a user's left eye in a left eye box and a right rear-facing display for presenting an image to a user's right eye in a right eye box. The user's eyes are located in eye boxes 2.5-34 at rear side R of device 2.5-10 when structure 2.5-26 rests against the outer surface of the user's face.

Support structure 2.5-26 may include a main support structure (sometimes referred to as a main portion or housing). The main housing support structure may extend from front side F of device 2.5-10 to opposing rear side R of device 2.5-10. On rear side R, support structure 2.5-26 may have cushioned structures to enhance user comfort as support structure 2.5-26 rests against the user's face. If desired, support structure 2.5-26 may include optional head straps and/or other structures that allow device 2.5-10 to be worn on a head of a user.

Device 2.5-10 may have a publicly viewable front-facing display such as display 2.5-14F that is mounted on front side F of support structure 2.5-26. Display 2.5-14F may be viewable to the user when the user is not wearing device 2.5-10 and/or may be viewable by others in the vicinity of device 2.5-10. Display 2.5-14F may, as an example, be visible on front side F of device 2.5-10 by an external viewer who is viewing device 2.5-10 from front side F.

A schematic diagram of an illustrative system that may include a head-mounted device is shown in FIG. 2.5-2. As shown in FIG. 2.5-2, system 2.5-8 may have one or more electronic devices 2.5-10. Devices 2.5-10 may include a head-mounted device (e.g., device 2.5-10 of FIG. 2.5-1), accessories such as controllers and headphones, computing equipment (e.g., a cellular telephone, tablet computer, laptop computer, desktop computer, and/or remote computing equipment that supplies content to a head-mounted device), and/or other devices that communicate with each other.

Each electronic device 2.5-10 may have control circuitry 2.5-12. Control circuitry 2.5-12 may include storage and processing circuitry for controlling the operation of device 2.5-10. Circuitry 2.5-12 may include storage such as hard disk drive storage, nonvolatile memory (e.g., electrically-programmable-read-only memory configured to form a solid-state drive), volatile memory (e.g., static or dynamic random-access-memory), etc. Processing circuitry in control circuitry 2.5-12 may be based on one or more microprocessors, microcontrollers, digital signal processors, baseband processors, power management units, audio chips, graphics processing units, application specific integrated circuits, and other integrated circuits. Software code may be stored on storage in circuitry 2.5-12 and run on processing circuitry in circuitry 2.5-12 to implement control operations for device 2.5-10 (e.g., data gathering operations, operations involving the adjustment of the components of device 2.5-10 using control signals, etc.). Control circuitry 2.5-12 may include wired and wireless communications circuitry. For example, control circuitry 2.5-12 may include radio-frequency transceiver circuitry such as cellular telephone transceiver circuitry, wireless local area network transceiver circuitry (e.g., WiFi® circuitry), millimeter wave transceiver circuitry, and/or other wireless communications circuitry.

During operation, the communications circuitry of the devices in system 2.5-8 (e.g., the communications circuitry of control circuitry 2.5-12 of device 2.5-10) may be used to support communication between the electronic devices. For example, one electronic device may transmit video data, audio data, control signals, and/or other data to another electronic device in system 2.5-8. Electronic devices in system 2.5-8 may use wired and/or wireless communications circuitry to communicate through one or more communications networks (e.g., the internet, local area networks, etc.). The communications circuitry may be used to allow data to be received by device 2.5-10 from external equipment (e.g., a tethered computer, a portable device such as a handheld device or laptop computer, online computing equipment such as a remote server or other remote computing equipment, or other electrical equipment) and/or to provide data to external equipment.

Each device 2.5-10 in system 2.5-8 may include input-output devices 2.5-22. Input-output devices 2.5-22 may be used to allow a user to provide device 2.5-10 with user input. Input-output devices 2.5-22 may also be used to gather information on the environment in which device 2.5-10 is operating. Output components in devices 2.5-22 may allow device 2.5-10 to provide a user with output and may be used to communicate with external electrical equipment.

As shown in FIG. 2.5-2, input-output devices 2.5-22 may include one or more displays such as displays 2.5-14. Displays 2.5-14 may include rear facing displays such as display 2.5-14R of FIG. 2.5-1. Device 2.5-10 may, for example, include left and right components such as left and right scanning mirror display devices or other image projectors, liquid-crystal-on-silicon display devices, digital mirror devices, or other reflective display devices, left and right display panels based on light-emitting diode pixel arrays (e.g., thin-film organic light-emitting displays with polymer or semiconductor substrates such as silicon substrates or display devices based on pixel arrays formed from crystalline semiconductor light-emitting diode dies), liquid crystal display panels, and/or or other left and right display devices that provide images to left and right eye boxes for viewing by the user's left and right eyes, respectively. Display components such as these (e.g., a thin-film organic light-emitting display with a flexible polymer substrate or a display based on a pixel array formed from crystalline semiconductor light-emitting diode dies on a flexible substrate) may also be used in forming a forward-facing display for device 2.5-10 such as forward-facing display 2.5-14F of FIG. 2.5-1 (sometimes referred to as a front-facing display, front display, or publicly viewable display).

During operation, displays 2.5-14 (e.g., displays 2.5-14R and/or 2.5-14F) may be used to display visual content for a user of device 2.5-10 (e.g., still and/or moving images including pictures and pass-through video from camera sensors, text, graphics, movies, games, and/or other visual content). The content that is presented on displays 2.5-14 may, for example, include virtual objects and other content that is provided to displays 2.5-14 by control circuitry 2.5-12. This virtual content may sometimes be referred to as computer-generated content. Computer-generated content may be displayed in the absence of real-world content or may be combined with real-world content. In some configurations, a real-world image may be captured by a camera (e.g., a forward-facing camera, sometimes referred to as a front-facing camera) and computer-generated content may be electronically overlaid on portions of the real-world image (e.g., when device 2.5-10 is a pair of virtual reality goggles).

Input-output circuitry 2.5-22 may include sensors 2.5-16. Sensors 2.5-16 may include, for example, three-dimensional sensors (e.g., three-dimensional image sensors such as structured light sensors that emit beams of light and that use two-dimensional digital image sensors to gather image data for three-dimensional images from dots or other light spots that are produced when a target is illuminated by the beams of light, binocular three-dimensional image sensors that gather three-dimensional images using two or more cameras in a binocular imaging arrangement, three-dimensional LIDAR (light detection and ranging) sensors, sometimes referred to as time-of-flight cameras or three-dimensional time-of-flight cameras, three-dimensional radio-frequency sensors, or other sensors that gather three-dimensional image data), cameras (e.g., two-dimensional infrared and/or visible digital image sensors), gaze tracking sensors (e.g., a gaze tracking system based on an image sensor and, if desired, a light source that emits one or more beams of light that are tracked using the image sensor after reflecting from a user's eyes), touch sensors, capacitive proximity sensors, light-based (optical) proximity sensors, other proximity sensors, force sensors (e.g., strain gauges, capacitive force sensors, resistive force sensors, etc.), sensors such as contact sensors based on switches, gas sensors, pressure sensors, moisture sensors, magnetic sensors, audio sensors (microphones), ambient light sensors, flicker sensors that gather temporal information on ambient lighting conditions such as the presence of a time-varying ambient light intensity associated with artificial lighting, microphones for gathering voice commands and other audio input, sensors that are configured to gather information on motion, position, and/or orientation (e.g., accelerometers, gyroscopes, compasses, and/or inertial measurement units that include all of these sensors or a subset of one or two of these sensors), and/or other sensors.

User input and other information may be gathered using sensors and other input devices in input-output devices 2.5-22. If desired, input-output devices 2.5-22 may include other devices 2.5-24 such as haptic output devices (e.g., vibrating components), light-emitting diodes, lasers, and other light sources (e.g., light-emitting devices that emit light that illuminates the environment surrounding device 2.5-10 when ambient light levels are low), speakers such as ear speakers for producing audio output, circuits for receiving wireless power, circuits for transmitting power wirelessly to other devices, batteries and other energy storage devices (e.g., capacitors), joysticks, buttons, and/or other components.

As described in connection with FIG. 2.5-1, electronic device 2.5-10 may have head-mounted support structures such as head-mounted support structure 2.5-26 (e.g., head-mounted housing structures such as housing walls, straps, etc.). The head-mounted support structure may be configured to be worn on a head of a user (e.g., against the user's face covering the user's eyes) during operation of device 2.5-10 and may support displays 2.5-14, sensors 2.5-16, other components 2.5-24, other input-output devices 2.5-22, and control circuitry 2.5-12 (see, e.g., components 2.5-40 and displays 2.5-14R and 2.5-14F of FIG. 2.5-1, which may include associated optical modules).

FIG. 2.5-3 is a front view of device 2.5-10 in an illustrative configuration in which device 2.5-10 has a publicly viewable display such as forward-facing display 2.5-14F. As shown in FIG. 2.5-3, support structure 2.5-26 of device 2.5-10 may have right and left portions on either side of nose bridge 2.5-90. Nose bridge 2.5-90 may be a curved exterior surface that is configured to receive and rest upon a user's nose to help support housing 2.5-26 on the head of the user.

Display 2.5-14F may have an active area such as active area AA that is configured to display images and an inactive area IA that does not display images. The outline of active area AA may be rectangular, rectangular with rounded corners, may have teardrop shaped portions on the left and right sides of device 2.5-10, may have a shape with straight edges, a shape with curved edges, a shape with a peripheral edge that has both straight and curved portions, and/or other suitable outlines. As shown in FIG. 2.5-3, active area AA may have a curved recessed portion at nose bridge 2.5-90. The presence of the nose-shaped recess in active area AA may help fit active area AA within the available space of housing 2.5-26 without overly limiting the size of active area AA.

Active area AA contains an array of pixels. The pixels may be, for example, light-emitting diode pixels formed from thin-film organic light-emitting diodes or crystalline semiconductor light-emitting diode dies (sometimes referred to as micro-light-emitting diodes) on a flexible display panel substrate. Configurations in which display 2.5-14F uses other display technologies may also be used, if desired. Illustrative arrangements in which display 2.5-14 is formed from a light-emitting diode display such as an organic light-emitting diode display that is formed on a flexible substrate (e.g., a substrate formed from a bendable layer of polyimide or a sheet of other flexible polymer) may sometimes be described herein as an example. The pixels of active area AA may be formed on a display device such as a display panel (e.g., a flexible organic light-emitting diode display panel). In some configurations, the outline of active area AA may have a peripheral edge that contains straight segments or a combination of straight and curved segments. Configurations in which the entire outline of active area AA is characterized by a curved peripheral edge may also be used.

Display 2.5-14F may have an inactive area such as inactive area IA that is free of pixels and that does not display images. Inactive area IA may form an inactive border region that runs along one more portions of the peripheral edge of active area AA. In the illustrative configuration of FIG. 2.5-3, inactive area IA has a ring shape that surrounds active area AA and forms an inactive border. In this type of arrangement, the width of inactive area IA may be relatively constant and the inner and outer edges of area IA may be characterized by straight and/or curved segments or may be curved along their entire lengths. For example, the outer edge of area IA (e.g., the periphery of display 2.5-14F) may have a curved outline that runs parallel to the curved edge of active area AA.

In some configurations, device 2.5-10 may operate with other devices in system 2.5-8 (e.g., wireless controllers and other accessories). These accessories may have magnetic sensors that sense the direction and intensity of magnetic fields. Device 2.5-10 may have one or more electromagnets configured to emit a magnetic field. The magnetic field can be measured by the wireless accessories near device 2.5-10, so that the accessories can determine their orientation and position relative to device 2.5-10. This allows the accessories to wirelessly provide device 2.5-10 with real-time information on their current position, orientation, and movement so that the accessories can serve as wireless controllers. The accessories may include wearable devices, handled devices, and other input devices.

In an illustrative configuration, device 2.5-10 may have a coil that runs around the perimeter of display 2.5-14F (e.g., under inactive area IA along the periphery of active area AA). The coil may have any suitable number of turns (e.g., 1-10, at least 2, at least 5, at least 10, 10-50, fewer than 100, fewer than 25, fewer than 6, etc.). These turns may be formed from metal traces on a substrate, may be formed from wire, and/or may be formed from other conductive lines. During operation, control circuitry 2.5-12 may supply the coil with an alternating-current (AC) drive signal. The drive signal may have a frequency of at least 1 kHz, at least 10 kHz, at least 100 kHz, at least 1 MHz, less than 10 MHz, less than 3 MHz, less than 300 kHz, or less than 30 kHz (as examples). As AC current flows through the coil a corresponding magnetic field is produced in the vicinity of device 2.5-10. Electronic devices such as wireless controllers with magnetic sensors that are in the vicinity of device 2.5-10 may use the magnetic field as a reference so that the wireless controllers can determine their orientation, position, and/or movement while being moved relative to device 2.5-10 to provide device 2.5-10 with input.

Consider, as an example, a handheld wireless controller that is used in controlling the operation of device 2.5-10. During operation, device 2.5-10 uses the coil to emit a magnetic field. As the handheld wireless controller is moved, the magnetic sensors of the controller can monitor the location of the controller and the movement of the controller relative to device 2.5-10 by monitoring the strength, orientation, and change to the strength and/or orientation of the magnetic field emitted by the coil as the controller is moved through the air by the user. The electronic device can then wirelessly transmit information on the location and orientation of the controller to device 2.5-10. In this way, a handheld controller, wearable controller, or other external accessory can be manipulated by a user to provide device 2.5-10 with air gestures, pointing input, steering input, and/or other user input.

Device 2.5-10 may have components such as optical components (e.g., optical sensors among sensors 2.5-16 of FIG. 2.5-2). These components may be mounted in any suitable location on head-mounted support structure 2.5-26 (e.g. on a head strap, on housing 2.5-26, etc.). Optical components and other components may face rearwardly (e.g., when mounted on the rear face of device 2.5-10), may face to the side (e.g. to the left or right), may face downwardly or upwardly, may face to the front of device 2.5-10 (e.g., when mounted on the front face of device 2.5-10), may be mounted so as to point in any combination of these directions (e.g., to the front, to the right, and downward) and/or may be mounted in other suitable orientations. In an illustrative configuration, at least some of the components of device 2.5-10 are mounted so as to face outwardly to the front (and optionally to the sides and/or up and down). For example, forward-facing cameras for pass-through video may be mounted on the left and right sides of the front of device 2.5-10 in a configuration in which the cameras diverge slightly along the horizontal dimension so that the fields of view of these cameras overlap somewhat while capturing a wide-angle image of the environment in front of device 2.5-10. The captured image may, if desired, include portions of the user's surroundings that are below, above, and to the sides of the area directly in front of device 2.5-10.

To help hide components such as optical components from view from the exterior of device 2.5-10, it may be desirable to cover some or all of the components with cosmetic covering structures. The covering structures may include transparent portions (e.g., optical component windows) that are characterized by sufficient optical transparency to allow overlapped optical components to operate satisfactorily. For example, an ambient light sensor may be covered with a layer that appears opaque to an external viewer to help hide the ambient light sensor from view, but that allows sufficient ambient light to pass to the ambient light sensor for the ambient light sensor to make a satisfactory ambient light measurement. As another example, an optical component that emits infrared light may be overlapped with a visibly opaque material that is transparent to infrared light.

In an illustrative configuration, optical components for device 2.5-10 may be mounted in inactive area IA of FIG. 2.5-3 and cosmetic covering structures may be formed in a ring shape overlapping the optical components in inactive area IA. Cosmetic covering structures may be formed from ink, polymer structures, structures that include metal, glass, other materials, and/or combinations of these materials. In an illustrative configuration, a cosmetic covering structure may be formed from a ring-shaped member having a footprint that matches the footprint of inactive area IA. If, for example, active area AA has left and right portions with teardrop shapes, the ring-shaped member may have curved edges that follow the curved periphery of the teardrop-shaped portions of active area AA. The ring-shaped member may be formed from one or more polymer structures (e.g., the ring-shaped member may be formed from a polymer ring). Because the ring-shaped member can help hide overlapped components from view, the ring-shaped member may sometimes be referred to as a shroud or ring-shaped shroud member. The outward appearance of the shroud or other cosmetic covering structures may be characterized by a neutral color (white, black, or gray) or a non-neutral color (e.g., blue, red, green, gold, rose gold, etc.).

Display 2.5-14F may, if desired, have a protective display cover layer. The cover layer may overlap active area AA and inactive area IA (e.g., the entire front surface of device 2.5-10 as viewed from front F of FIG. 2.5-1 may be covered by the cover layer). The cover layer, which may sometimes be referred to as a housing wall or transparent housing wall, may have a rectangular outline, an outline with teardrop portions, an oval outline, or other shape with curved and/or straight edges.

The cover layer may be formed from a transparent material such as glass, polymer, transparent crystalline material such as sapphire, clear ceramic, other transparent materials, and/or combinations of these materials. As an example, a protective display cover layer for display 2.5-14F may be formed from safety glass (e.g., laminated glass that includes a clear glass layer with a laminated polymer film). Optional coating layers may be applied to the surfaces of the display cover layer. If desired, the display cover layer may be chemically strengthened (e.g., using an ion-exchange process to create an outer layer of material under compressive stress that resists scratching). In some configurations, the display cover layer may be formed from a stack of two or more layers of material (e.g., first and second structural glass layers, a rigid polymer layer coupled to a glass layer or another rigid polymer layer, etc.) to enhance the performance of the cover layer.

In active area AA, the display cover layer may overlap the pixels of display panel 2.5-14P. The display cover layer in active area AA is preferably transparent to allow viewing of images presented on display panel 2.5-14P. In inactive area IA, the display cover layer may overlap the ring-shaped shroud or other cosmetic covering structure. The shroud and/or other covering structures (e.g., opaque ink coatings on the inner surface of the display cover layer and/or structures) may be sufficiently opaque to help hide some or all of the optical components in inactive area IA from view. Windows may be provided in the shroud or other cosmetic covering structures to help ensure that the optical components that are overlapped by these structures operate satisfactorily. Windows may be formed from holes, may be formed from areas of the shroud or other cosmetic covering structures that have been locally thinned to enhance light transmission, may be formed from window members with desired light transmission properties that have been inserted into mating openings in the shroud, and/or may be formed from other shroud window structures.

In the example of FIG. 2.5-3, device 2.5-10 includes optical components such as optical components 2.5-60, 2.5-62, 2.5-64, 2.5-66, 2.5-68, 2.5-70, 2.5-72, 2.5-74, 2.5-76, 2.5-78, and 2.5-80 (as an example). Each of these optical components (e.g., optical sensors selected from among sensors 2.5-16 of FIG. 2.5-2, light-emitting devices, etc.) may be configured to detect light and, if desired to emit light (e.g., ultraviolet light, visible light, and/or infrared light).

In an illustrative configuration, optical component 2.5-60 may sense ambient light (e.g., visible ambient light). In particular, optical component 2.5-60 may have a photodetector that senses variations in ambient light intensity as a function of time. If, as an example, a user is operating in an environment with an artificial light source, the light source may emit light at a frequency associated with its source of wall power (e.g., alternating-current mains power at 60 Hz). The photodetector of component 2.5-60 may sense that the artificial light from the artificial light source is characterized by 60 Hz fluctuations in intensity. Control circuitry 2.5-12 can use this information to adjust a clock or other timing signal associated with the operation of image sensors in device 2.5-10 to help avoid undesired interference between the light source frequency and the frame rate or other frequency associated with image capture operations. Control circuitry 2.5-12 can also use measurements from component 2.5-60 to help identify the presence of artificial lighting and the type of artificial lighting that is present. In this way, control circuitry 2.5-12 can detect the presence of lights such as fluorescent lights or other lights with known non-ideal color characteristics and can make compensating color cast adjustments (e.g., white point adjustments) to color-sensitive components such as cameras and displays. Because optical component 2.5-60 may measure fluctuations in light intensity, component 2.5-60 may sometimes be referred to as a flicker sensor or ambient light frequency sensor.

Optical component 2.5-62 may be an ambient light sensor. The ambient light sensor may include one or more photodetectors. In a single-photodetector configuration, the ambient light sensor may be a monochrome sensor that measures ambient light intensity. In a multi-photodetector configuration, each photodetector may be overlapped by an optical filter that passes a different band of wavelengths (e.g. different visible and/or infrared passbands). The optical filter passbands may overlap at their edges. This allows component 2.5-62 to serve as a color ambient light sensor that measures both ambient light intensity and ambient light color (e.g., by measuring color coordinates for the ambient light). During operation of device 2.5-10, control circuitry 2.5-12 can take action based on measured ambient light intensity and color. As an example, the white point of a display or image sensor may be adjusted or other display or image sensor color adjustments may be made based on measured ambient light color. The intensity of a display may be adjusted based on light intensity. For example, the brightness of display 2.5-14F may be increased in bright ambient lighting conditions to enhance the visibility of the image on the display and the brightness of display 2.5-14F may be decreased in dim lighting conditions to conserve power. Image sensor operations and/or light source operations may also be adjusted based on ambient light readings.

The optical components in active area IA may also include components along the sides of device 2.5-10 such as components 2.5-80 and 2.5-64. Optical components 2.5-80 and 2.5-64 may be pose-tracking cameras that are used to help monitor the orientation and movement of device 2.5-10. Components 2.5-80 and 2.5-64 may be visible light cameras (and/or cameras that are sensitive at visible and infrared wavelengths) and may, in conjunction with an inertial measurement unit, form a visual inertial odometry (VIO) system.

Optical components 2.5-78 and 2.5-66 may be visible-light cameras that capture real-time images of the environment surrounding device 2.5-10. These cameras, which may sometimes be referred to as scene cameras or pass-through-video cameras, may capture moving images that are displayed in real time to displays 2.5-14R for viewing by the user when the user's eyes are located in eye boxes 2.5-34 at the rear of device 2.5-10. By displaying pass-through images (pass-through video) to the user in this way, the user may be provided with real-time information on the user's surroundings. If desired, virtual content (e.g. computer-generated images) may be overlaid over some of the pass-through video. Device 2.5-10 may also operate in a non-pass-through-video mode in which components 2.5-78 and 2.5-66 are turned off and the user is provided only with movie content, game content, and/or other virtual content that does not contain real-time real-world images.

Input-output devices 2.5-22 of device 2.5-10 may gather user input that is used in controlling the operation of device 2.5-10. As an example, a microphone in device 2.5-10 may gather voice commands. Buttons, touch sensors, force sensors, and other input devices may gather user input from a user's finger or other external object that is contacting device 2.5-10. In some configurations, it may be desirable to monitor a user's hand gestures or the motion of other user body parts. This allows the user's hand locations or other body part locations to be replicated in a game or other virtual environment and allows the user's hand motions to serve as hand gestures (air gestures) that control the operation of device 2.5-10. User input such as hand gesture input can be captured using cameras that operate at visible and infrared wavelengths such as tracking cameras (e.g., optical components 2.5-76 and 2.5-68). Tracking cameras such as these may also track fiducials and other recognizable features on controllers and other external accessories (additional devices 2.5-10 of system 2.5-8) during use of these controllers in controlling the operation of device 2.5-10. If desired, tracking cameras can help determine the position and orientation of a handheld controller or wearable controller that senses its location and orientation by measuring the magnetic field produced by coil 2.5-54. The use of tracking cameras may therefore help track hand motions and controller motions that are used in moving pointers and other virtual objects being displayed for a user and can otherwise assist in controlling the operation of device 2.5-10.

Tracking cameras may operate satisfactorily in the presence of sufficient ambient light (e.g., bright visible ambient lighting conditions). In dim environments, supplemental illumination may be provided by supplemental light sources such as supplemental infrared light sources (e.g., optical components 2.5-82 and 2.5-84). The infrared light sources may each include one or more light-emitting devices (light-emitting diodes or lasers) and may each be configured to provide fixed and/or steerable beams of infrared light that serve as supplemental illumination for the tracking cameras. If desired, the infrared light sources may be turned off in bright ambient lighting conditions and may be turned on in response to detection of dim ambient lighting (e.g., using the ambient light sensing capabilities of optical component 2.5-62).

Three-dimensional sensors in device 2.5-10 may be used to perform biometric identification operations (e.g., facial identification for authentication), may be used to determine the three-dimensional shapes of objects in the user's environment (e.g., to map the user's environment so that a matching virtual environment can be created for the user), and/or to otherwise gather three-dimensional content during operation of device 2.5-10. As an example, optical components 2.5-74 and 2.5-70 may be three-dimensional structured light image sensors. Each three-dimensional structured light image sensor may have one or more light sources that provide structured light (e.g., a dot projector that projects an array of infrared dots onto the environment, a structured light source that produces a grid of lines, or other structured light component that emits structured light). Each of the three-dimensional structured light image sensors may also include a flood illuminator (e.g., a light-emitting diode or laser that emits a wide beam of infrared light). Using flood illumination and structured light illumination, optical components 2.5-74 and 2.5-70 may capture facial images, images of objects in the environment surrounding device 2.5-10, etc.

Optical component 2.5-72 may be an infrared three-dimensional time-of-flight camera that uses time-of-flight measurements on emitted light to gather three-dimensional images of objects in the environment surrounding device 2.5-10. Component 2.5-72 may have a longer range and a narrower field of view than the three-dimensional structured light cameras of optical components 2.5-74 and 2.5-70. The operating range of component 2.5-72 may be 30 cm to 7 m, 60 cm to 6 m, 70 cm to 5 m, or other suitable operating range (as examples).

FIG. 2.5-4 is a front view of an illustrative ring-shaped cosmetic covering structure for device 2.5-10. Illustrative ring-shaped shroud 2.5-100 of FIG. 2.5-4 may be mounted under the inner surface of the display cover layer for display 2.5-14F in inactive area IA. This may help hide the optical components and other internal portions of device 2.5-10 from view from the exterior of device 2.5-10. Shroud 2.5-100 may be formed from one or more unbroken ring-shaped members and/or may be formed from multiple shroud segments that are attached using adhesive, fasteners, or other attachment structures. If desired, shroud 2.5-100 may be formed from multiple members that are sandwiched together along some or all of their lengths. In an illustrative configuration, which may sometimes be described herein as an example, shroud 2.5-100 may be formed from an inner piece (e.g., an inner full or partial ring), which may sometimes be referred to as an inner shroud member, shroud trim, or shroud trim member and may be formed from an outer piece or pieces (e.g., one or more strips of material or covering members, an full ring, one or more partial rings, etc.), which may sometimes be referred to as a shroud cover, canopy, or shroud canopy.

As shown in FIG. 2.5-4, shroud 2.5-100 may have optical component windows to accommodate components 2.5-60, 2.5-62, 2.5-64, 2.5-84, 2.5-66, 2.5-68, 2.5-70, 2.5-72, 2.5-74, 2.5-76, 2.5-78, 2.5-82, and 2.5-80. The optical component windows may be formed from through-hole openings in shroud 2.5-100, from recesses or other partial openings that do not pass entirely through shroud 2.5-100, from inserted optical window members in shroud through-hole openings, and/or from other shroud optical component window structures. Display 2.5-14F may have a display cover layer that has corresponding optical component windows (through-hole openings, recessed areas, inserted window members in through-hole openings, etc.) and/or that is formed from bulk material that has desired optical properties (e.g., a display cover layer formed from one or more layers of material such as glass and/or polymer with sufficient transparency at the operating wavelength range of the overlapped optical component to allow the optical component to operate satisfactorily through the cover layer without forming openings or other window structures in the cover layer).

Shroud 2.5-100 may have any suitable shape. For example, the outline of shroud 2.5-100 may be rectangular with rounded corners as shown in FIG. 2.5-4, may have teardrop shapes on the left and right sides of device 2.5-10, may have an oval outline, and/or may have other outlines with curved and/or straight edge segments. For example, the inner and outer edges of shroud 2.5-100 may be curved (e.g., to follow a teardrop shape). Shroud 2.5-100 may, if desired, have a peripheral edge that is curved along most or all of its length.

The width of shroud 2.5-100 may be constant along its length or shroud 2.5-100 may have portions that are wider than others. The thickness of shroud 2.5-100 (e.g., the dimension of shroud 2.5-100 into the page in the orientation of FIG. 2.5-4) may be smaller than the width of shroud 2.5-100 (the lateral dimension of shroud 2.5-100 within the page in the orientation of FIG. 2.5-4) or the thickness of the shroud may be equal to or greater than the width of the shroud. The shroud may have a two-dimensional shape (e.g., shroud 2.5-100 may have a planar shape) or may have a three-dimensional shape (e.g., a shape with a curved cross-sectional profile and/or a shape characterized by inner and/or outer surfaces of compound curvature). In an illustrative configuration, most or all of the inner and outer surfaces of shroud have a compound-curvature surface.

The optical components under inactive area IA may include components on the left and right sides of device 2.5-10 that operate in conjunction with each other. For example, scene cameras, tracking cameras, and/or structured light cameras in device 2.5-10 may be formed in pairs, each of which includes a left camera and a corresponding right camera. A left scene camera and a right scene camera may, as an example, operate together to capture overlapping images that provide device 2.5-10 with a wide field of view for gathering pass-through video. Left and right tracking cameras may operate together to track a user's hands or other external objects. Left and right structured light cameras or other three-dimensional cameras may be used together to capture three-dimensional images of the user's environment. To enhance performance of the left and right optical components in these types of paired component arrangements, it may be desirable to maintain accurate alignment between the left and right optical components. To help maintain left and right optical components on the respective left and right sides of device 2.5-10 in alignment with each other, device 2.5-10 may be provided with one or more housing structures that help support the optical components. An illustrative example of device 2.5-10 having housing structures that support the optical components and a cover layer that overlaps the optical components is shown in FIG. 2.5-5.

As shown in FIG. 2.5-5, shroud 2.5-100 and display cover layer 2.5-92 may be attached to housing 2.5-26 using adhesive, screws and other fasteners, press-fit connections, and/or other attachment mechanisms. An illustrative configuration in which shroud 2.5-100 and cover layer 2.5-92 are attached to forward-facing edge of a housing wall in the main housing portion of structure 2.5-26 using adhesive is shown in FIG. 2.5-5. In the example of FIG. 2.5-5, shroud 2.5-100 has an inner shroud member such as shroud trim 2.5-100A and has a corresponding outer shroud member such as shroud canopy 2.5-100B. Shroud trim 2.5-100A and shroud canopy 2.5-100B may be formed from metal, polymer, ceramic, glass, other materials, and/or combinations of these materials. In an illustrative example, shroud trim 2.5-100A is formed from black polymer or other dark material and shroud canopy 2.5-100B is formed from clear polymer. The outer surface of shroud canopy 2.5-100B may be smooth to provide shroud 2.5-100 with a cosmetically attractive appearance.

A layer of pressure sensitive adhesive may be used in attaching canopy 2.5-100B to trim 2.5-100A, or canopy 2.5-100B may be formed integrally with trim 2.5-100A. Adhesive may also be used in attaching cover layer 2.5-92 and shroud 2.5-100 to housing portion 2.5-26. As shown in FIG. 2.5-5, for example, a first adhesive such as adhesive 2.5-122 may be used to attach display cover layer 2.5-92 to shroud 2.5-100 (e.g., to a ledge in shroud trim 2.5-100A). A second adhesive such as adhesive 2.5-124 may, in turn, be used to attach shroud 2.5-100 (e.g., shroud trim 2.5-100A) to an adjacent lip of a wall in housing 2.5-26.

In some configurations, adhesives 2.5-122 and 2.5-124 may be formed from the same type of material. In an illustrative configuration, adhesives 2.5-122 and 2.5-124 are different. Housing portion 2.5-26 may have a wall with a lip shape that creates a shearing force on adhesive 2.5-124 as display 2.5-14F is attached to housing 2.5-26 by pressing display 2.5-14F against housing 2.5-26. In this type of scenario, it may be desirable to form adhesive 2.5-124 from an adhesive that can bond satisfactorily in the presence of shear forces such as a molten hot melt glue (thermoplastic adhesive) or other liquid adhesive rather than pressure sensitive adhesive. Adhesive 2.5-124 may, if desired, be exposed to a curing agent (ultraviolet light, moisture, etc.) before display 2.5-14F is assembled into housing 2.5-26.

It may be desirable to repair device 2.5-10. For example, if a user exposes display 2.5-14F to excessive force during a drop event, it may be desirable to replace display 2.5-14F with a new display. This can be accomplished by heating adhesive 2.5-124 to loosen the adhesive bond formed by adhesive 2.5-124. To help prevent display cover layer 2.5-92 from detaching from shroud 2.5-100 while softening adhesive 2.5-124 with heat, adhesive 2.5-122 may be provided with a higher-temperature softening point than adhesive 2.5-124 (e.g., adhesive 2.5-122 may be a two-part hot melt glue with a higher melting point than adhesive 2.5-124).

Optical components that are overlapped by display cover layer 2.5-92 and shroud 2.5-100 in inactive area IA may transmit and/or receive light through shroud 2.5-100 and display cover layer 2.5-92. Layer 2.5-92 may be formed from a single layer of glass, laminated glass, or other clear material that allows light for each overlapped optical component 2.5-104 to pass through layer 2.5-92. If desired, a partial recess or a through-hole opening may be formed in the portion of layer 2.5-92. An optional optical component window member may then be inserted within layer 2.5-92 (e.g., a window that overlaps component 2.5-104). As an example, layer 2.5-92 may be formed from one or more layers of glass and/or polymer and may be characterized by a first level of light transmission at operating wavelength(s) for component 2.5-104. A window member in layer 2.5-92 may be formed from polymer, glass, and/or other materials that are characterized by a second level of light transmission at the operating wavelength(s) that is greater than the first level of light transmission. In other illustrative arrangements, no window member is inserted in layer 2.5-92 (e.g., when layer 2.5-92 alone is sufficiently transparent to pass light for component 2.5-104).

Shroud 2.5-100 may be provided with an optical component window that overlaps optical component to help accommodate overlapped optical component 2.5-104. Component 2.5-104 may operate at ultraviolet light wavelengths, visible light wavelengths, and/or infrared light wavelengths. To accommodate component 2.5-104, shroud trim 2.5-100A has been provided with a through-hole opening, whereas shroud canopy 2.5-100B has no openings overlapping component 2.5-104. This effectively forms a window recess in shroud 2.5-100 in alignment with components 2.5-104. Trim 2.5-100A may be formed from black polymer or other light-absorbing material, so the formation of opening 120 in trim 2.5-100A may help ensure that sufficiently light may pass through to allow component 2.5-104 to operate satisfactorily. The portion of canopy 2.5-100B that overlaps component 2.5-104 may be transparent (e.g., clear polymer). Alternatively, canopy 2.5-100B may be formed from light-absorbing material, and a portion of canopy 2.5-100B overlapping component 2.5-104 may be removed.

To help hide component 2.5-104 from view, the inner surface of shroud canopy 2.5-100B may be covered with one or more coatings, which may be used to provide region the region overlapping component 2.5-104 with a desired outward appearance and optical properties that ensure that component 2.5-104 can operate satisfactorily. The coatings may include a thin-film-interference filter formed from a stack of thin-film dielectric layers of alternating refractive index values (with indices and thicknesses selected to create a desired transmission spectrum and a desired reflection spectrum for the filter), may include a layer of ink (e.g., a polymer layer including dye, pigment, and/or other colorant), and/or may include any other suitable coating with desired optical properties.

Consider, as an example, a scenario in which component 2.5-104 transmits and/or receives infrared light. In this type of arrangement, canopy 2.5-100B may be coated with a coating that is opaque at visible wavelengths and transparent at infrared wavelengths. This helps to hide component 2.5-104 from view from the exterior of device 2.5-10 while allowing infrared light associated with the operation of component 2.5-104 to pass through shroud 2.5-100 and layer 2.5-92.

As another example, consider a scenario in which component 2.5-104 is an ambient light sensor. In this configuration, canopy 2.5-100B may be coated with a coating that exhibits a visible light transmission of 1-8% (as an example). This may allow sufficient visible ambient light to reach the ambient light sensor for the ambient light sensor to make an ambient light reading. At the same time, the transmission of the coating may be sufficiently low to reduce the visibility of component 2.5-104 from the exterior of device 2.5-10.

As these examples demonstrate, regions of display 2.5-14F that overlap optical components such as component 2.5-104 of FIG. 2.5-5 may be provided with optical component window structures in layer 2.5-92 and/or shroud 2.5-100 that help accommodate the optical component.

As described in connection with FIGS. 2.5-3 and 2.5-4, there may be numerous optical components such as component 2.5-104 in inactive area IA. Each optical component may potentially have a different type of optical component window structure in shroud 2.5-100 and/or layer 2.5-92 to accommodate that component. For example, some areas of shroud 2.5-100 may have openings that receive components, other areas of shroud 2.5-100 may have inserted optical window member, and/or other areas of shroud 2.5-100 may have partial shroud openings (e.g., non-through-hole recesses) such as the opening of FIG. 2.5-8 (which may optionally be coated to modify the optical properties of shroud 2.5-100).

Because of the proximity of cover layer 2.5-92 to a user's eyes, it may be desirable to reduce the likelihood of the cover layer material (e.g., glass) from shattering and injuring the user's eyes. An illustrative example of cover layer 2.5-92 with encapsulation to reduce the likelihood of such an event is shown in FIG. 2.5-6.

As shown in FIG. 2.5-6, cover layer 2.5-92 may be coupled to shroud 2.5-100. Cover layer 2.5-92 may include glass layer 2.5-126, front laminate 2.5-128 and rear laminate 2.5-130. Front laminate 2.5-128 and rear laminate 2.5-128 may be for example, layers of plastic that are laminated to cover layer 2.5-92, layers of plastic that are adhesively attached to cover layer 2.5-92, or other shatter-resistant material that is attached to the front and rear surfaces of glass layer 2.5-126. Although not shown in FIG. 2.5-6, multiple layers, such as antireflection coatings, antismudge coatings, acrylic layers, or other desired layers, may be included as part of cover layer 2.5-92.

Although front laminate 2.5-128 and rear laminate 2.5-130 may reduce the chances of glass layer 2.5-126 shattering toward the front or rear of device 2.5-10, an edge surface of glass layer 2.5-126 may still be exposed. In the case of a shatter event, such as if device 2.5-10 were dropped, glass layer 2.5-126 could shatter and glass could exit device 2.5-10 from the edge surface of glass layer 2.5-126. To mitigate this risk, encapsulation material 2.5-132 may be attached to the edge surface of glass layer 2.5-126. Encapsulation material 2.5-132 may be an epoxy material, such as a ductile epoxy, that seals the edge surface of glass layer 2.5-126 and prevents glass layer 2.5-126 from shattering at the edge surface. Alternatively, acrylate, polyvinyl butyral (PVB), polyurethane, or moisture cure materials may be used for encapsulation material 2.5-132. In general, encapsulation material 2.5-132 may be formed from material that adheres to glass layer 2.5-126, while preventing glass layer 2.5-126 from shattering.

Encapsulation material 2.5-132 may substantially fill the opening between the edge surface of glass layer 2.5-126 and shroud 2.5-100. For example, encapsulation material 2.5-132 may extend approximately 150 microns from the edge surface. In general, however, any amount of encapsulation material 2.5-132 may be applied to the edge surface.

As shown in FIG. 2.5-6, encapsulation material 2.5-132 may cover the edge surface and may also cover an edge portion of laminate 2.5-128. However, this is merely illustrative. If desired, encapsulation material 2.5-132 may cover the edge surface of glass layer 2.5-126 without covering an edge portion of laminate 2.5-128. For example, as shown in FIG. 2.5-7, encapsulation material may cover only the edge surface of glass layer 2.5-126. In the example of FIG. 7, laminate 2.5-128 may extend over encapsulation material 2.5-132. However, this is merely illustrative. Laminate 2.5-128 may be flush with the edge surface of glass layer 2.5-126, if desired.

In some embodiments, it may be determined that the shattering risk of the edge surface of glass layer 2.5-126 can be mitigated by modifying the position of glass layer 2.5-126 relative to shroud 2.5-100 (or support structure 2.5-126). For example, as shown in the illustrative embodiment of FIG. 2.5-8, the edge surface of glass layer 2.5-126 may be left unencapsulated, but the size of opening 2.5-134 between the edge surface and shroud 2.5-100 may be adjusted to reduce the risk of glass escaping through opening 2.5-134 in the case of a shatter event. For example, if glass layer 2.5-126 is sufficiently close to shroud 2.5-100 (e.g., if opening 2.5-134 is sufficiently small), glass from layer 2.5-126 may not escape through opening 2.5-134 if layer 2.5-126 shatters.

Instead of, or in addition to, adding material to the edge surface of layer 2.5-126, it may be desirable to add material in the gap between layer 2.5-126 and the shroud/support structure. An illustrative example of adding material in this gap is shown in FIG. 2.5-9.

As shown in FIG. 2.5-9, material 2.5-136 may be included between the edge surface of glass layer 2.5-126 and shroud 2.5-100. Material 2.5-136 may be, for example, a bumper ring. The bumper ring may be formed from elastomer, rigid plastic, or another material that helps protect the edge surface of layer 2.5-126.

As an alternative to material 2.5-136 being a bumper ring between layer 2.5-126 and shroud 2.5-100, material 2.5-136 may be an overmolded structure on layer 2.5-126, on shroud 2.5-100, or on a chassis that is coupled to support structure 26. In general, the overmolded structure may fill the gap between layer 2.5-126 and the support structure, shroud, and/or chassis and help to prevent the edge surface of layer 2.5-126 from shattering out of device 2.5-10.

Although not shown in FIG. 2.5-9, a portion of material 2.5-136 may extend underneath layer 2.5-126 if desired. In particular, there may be a portion of material 2.5-136 between the bottom surface of layer 2.5-126 and shroud 2.5-100.

Instead of, or in addition to, adding material between layer 2.5-126 and shroud 2.5-100, upper laminate 2.5-128 and/or lower laminate 2.5-130 may wrap around the edge surface of layer 2.5-126. Illustrative examples of the laminates wrapping the edge surface are shown in FIGS. 2.5-10 and 2.5-11.

As shown in FIG. 2.5-10, upper laminate 2.5-128 may wrap around the edge surface of layer 2.5-126. In particular, upper laminate 2.5-128 may have portion 2.5-128A that extends around and covers the edge surface of layer 2.5-126. Layer 2.5-126 may have a rounded edge surface to allow upper laminate 2.5-128 to wrap the edge surface and sufficiently adhere to the surface, as shown in FIG. 2.5-10. By forming layer 2.5-126 with a rounded edge, the curve of laminate 2.5-128 around the edge may be reduced, thereby reducing stress on laminate 2.5-128. However, layer 2.5-126 may have a planar edge surface, or a surface with any other desired profile, around which upper laminate 2.5-128 wraps, if desired. By wrapping upper laminate around the edge surface of layer 2.5-126, glass may be prevented from shattering out of the edge surface.

As shown in FIG. 2.5-11, lower laminate 2.5-130 may wrap around the edge surface of layer 2.5-126. In particular, lower laminate may have portion 2.5-130A that extends around and covers the edge surface of layer 2.5-126. Layer 2.5-126 may have a rounded edge surface to allow lower laminate 2.5-130 to wrap the edge surface and sufficiently adhere to the surface, may have a planar edge surface, or may have a surface with any other desired profile, around which lower laminate 2.5-130 wraps. By wrapping lower laminate 2.5-130 around the edge surface of layer 2.5-126, glass may be prevented from shattering out of the edge surface.

In the example of FIG. 2.5-11, lower laminate portion 2.5-130A wraps entirely around the edge surface of layer 2.5-126 and partially overlaps upper laminate 2.5-128. This arrangement may ensure that no glass can escape if layer 2.5-126 shatters. However, the arrangement is merely illustrative. If desired, lower laminate portion 2.5-130A may wrap around only the edge surface of layer 2.5-126 without overlapping or extending over upper laminate 2.5-128.

Another example of material that may be used to prevent layer 2.5-126 from shattering and glass from exiting through the edge surface is shown in FIG. 2.5-12. In the example of FIG. 2.5-12, glue (or another similar material) 2.5-138 may be used to completely fill the gap between layer 2.5-126 and shroud 2.5-100. For example, the glue may be inserted into the gap after cover layer 2.5-92 has been assembled into the head-mounted device. Glue 2.5-138 may help prevent glass from exiting through the edge surface of layer 2.5-126 if layer 2.5-126 shatters.

Rather than wrapping the upper or lower laminate around the edge surface of layer 2.5-126, upper laminate 2.5-128 may extend to shroud 2.5-100 to cover the gap between the edge surface and shroud 2.5-100. For example, as shown in FIG. 2.5-13, upper laminate 2.5-128 may have portion 2.5-128B that extends to shroud 2.5-100 (or support structure 2.5-26 or another portion of device 2.5-10). By covering the gap between the edge surface of layer 2.5-126 and shroud 2.5-100, glass may prevented from exiting device 2.5-10 during a shatter event.

Instead of, or in addition to, adding material or extending the laminates to prevent glass from shattering out of device 2.5-10, shroud 2.5-100 or a chassis attached to support structure 2.5-26 may be modified to reduce the risk of layer 2.5-126 shattering. Illustrative examples of modifying these components to reduce the risk of layer 2.5-126 shattering are shown in FIGS. 2.5-14 and 2.5-15.

As shown in FIG. 2.5-14, structure 2.5-140 may have a lip that covers the gap between layer 2.5-126 and shroud 2.5-100/support structure 2.5-126. Structure 2.5-140 may be formed from a portion of shroud 2.5-100 or from a portion of support structure 2.5-126 (e.g., a chassis of support structure 2.5-126). The lip of structure 2.5-140 may help prevent glass that would otherwise shatter from layer 2.5-126 and exit device 2.5-10 from exiting device 2.5-10, thereby protecting users of device 2.5-10.

If desired, the lip of structure 2.5-140 may be combined with the extension of laminate around the edge surface of layer 2.5-126. For example, as shown in FIG. 2.5-15, upper laminate 2.5-128A may wrap the edge surface of layer 2.5-126 to prevent glass from exiting through the edge surface, and the lip of structure 2.5-140 may provide additional protection should some glass get through the laminate.

Although cover layer 2.5-92 has been described as being coupled to shroud 2.5-100, this is merely illustrative. In some embodiments, cover layer 2.5-92 may be coupled directly to support structure 2.5-26. In other embodiments, device 2.5-10 may include a chassis attached to support structure 2.5-26 (e.g., a chassis to support various components in device 2.5-10), and cover layer 2.5-92 may be coupled to the chassis.

Moreover, although cover layer 2.5-92 has been described as including a glass layer that may shatter, this material is merely illustrative. Layer 2.5-126 may be formed from ceramic, sapphire, or any other desired material.

2.6: Electronic Devices with Antennas and Optical Components

An electronic device such as a head-mounted device may have a front face that faces away from a user's head and may have an opposing rear face that faces the user's head. Optical modules may be used to provide images to a user's eyes. The positions of the optical modules may be adjusted to accommodate different user interpupillary distances. The head-mounted device may have actuators and optical module guide structures to allow the optical module positions to be adjusted.

The head-mounted device may have wireless communications circuitry to communicate with external equipment such as a computer, cellular telephone, or other computing device. This allows the external equipment to provide the head-mounted device with content for viewing on the head-mounted device and/or allows the head-mounted device to otherwise interact with the remote equipment. The wireless communications circuitry may include multiple antennas.

The head-mounted device may have one or more cameras. For example, forward-facing (front-facing) cameras may allow the head-mounted device to monitor movement of the head-mounted device relative to the environment surrounding the head-mounted device (e.g., the cameras may be used in forming a visual odometry system or part of a visual inertial odometry system). Forward-facing cameras may also be used to capture images of the environment that are displayed to a user of the head-mounted device. If desired, images from multiple forward-facing cameras may be merged with each other and/or forward-facing camera content can be merged with computer-generated content for a user.

A top view of an illustrative head-mounted device is shown in FIG. 2.6-1. As shown in FIG. 2.6-1, head-mounted devices such as electronic device 2.6-10 may have head-mounted support structures such as housing 2.6-12. Housing 2.6-12 may include portions (e.g., head-mounted support structures 2.6-12T) to allow device 2.6-10 to be worn on a user's head. Support structures 2.6-12T may be formed from fabric, polymer, metal, and/or other material. Support structures 2.6-12T may form a strap or other head-mounted support structures to help support device 2.6-10 on a user's head. A main support structure (e.g., a head-mounted housing such as main housing portion 2.6-12M) of housing 2.6-12 may support electronic components such as displays 2.6-14.

Main housing portion 2.6-12M may include housing structures formed from metal, polymer, glass, ceramic, and/or other material. For example, housing portion 2.6-12M may have housing walls on front face F and housing walls on adjacent top, bottom, left, and right side faces that are formed from rigid polymer or other rigid support structures and these rigid walls may optionally be covered with electrical components, fabric, leather, or other soft materials, etc. Housing portion 2.6-12M may also have internal support structures such as a frame and/or structures that perform multiple functions such as controlling airflow while providing structural support. The walls of housing portion 2.6-12M may enclose internal components 2.6-38 in interior region 2.6-34 of device 2.6-10 and may separate interior region 2.6-34 from the environment surrounding device 2.6-10 (exterior region 2.6-36). Internal components 2.6-38 may include integrated circuits, actuators, batteries, sensors, and/or other circuits and structures for device 2.6-10. Housing 2.6-12 may be configured to be worn on a head of a user and may form glasses, a hat, a helmet, goggles, and/or other head-mounted device. Configurations in which housing 2.6-12 forms goggles may sometimes be described herein as an example.

Front face F of housing 2.6-12 may face outwardly away from a user's head and face. Opposing rear face R of housing 2.6-12 may face the user. Portions of housing 2.6-12 (e.g., portions of main housing 2.6-12M) on rear face R may form a cover such as cover 2.6-12C (sometimes referred to as a curtain). The presence of cover 2.6-12C on rear face R may help hide internal housing structures, internal components 2.6-38, and other structures in interior region 2.6-34 from view by a user.

Device 2.6-10 may have one more cameras such as cameras 2.6-46. For example, device 2.6-10 may have K cameras, where the value of K is at least one, at least two, at least four, at least six, at least eight, at least ten, at least 12, less than 20, less than 14, less than 12, less than 10, from 4 to 10, or other suitable value. Cameras 2.6-46 may be sensitive at infrared wavelengths (e.g., cameras 2.6-46 may be infrared cameras), may be sensitive at visible wavelengths (e.g., cameras 2.6-46 may be visible cameras), and/or cameras 2.6-46 may be sensitive at other wavelengths. If desired, cameras 2.6-46 may be sensitive at both visible and infrared wavelengths.

Cameras 2.6-46 that are mounted on front face F and that face outwardly (towards the front of device 2.6-10 and away from the user) may sometimes be referred to herein as forward-facing or front-facing cameras. Forward-facing cameras (e.g., cameras 2.6-46 of FIG. 2.6-1) may include a first set of two or more front-facing cameras on the left side of front face F of device 2.6-10 and/or may include a second set of two or more front-facing cameras on the right side of front face F of device 2.6-10. Cameras 2.6-46 may also be provided elsewhere in housing portion 2.6-12M. Cameras 2.6-46 may, if desired, include cameras that are oriented at a slight angle relative to the –Z axis of FIG. 2.6-1. For example, some of cameras 2.6-46 may be oriented directly ahead, whereas some cameras 2.6-46 along the left and right edges of front face F may be respectively angled slightly to the left and right of the –Z axis to capture peripheral images on the left and right. Cameras 2.6-46 may capture visual odometry information, image information that is processed to locate objects in the user's field of view (e.g., so that virtual content can be registered appropriately relative to real-world objects), image content that is displayed in real time for a user of device 2.6-10, and/or other suitable image data.

Device 2.6-10 may have left and right optical modules 2.6-40. Optical modules 2.6-40 support electrical and optical components such as light-emitting components and lenses and may therefore sometimes be referred to as optical assemblies, optical systems, optical component support structures, lens and display support structures, electrical component support structures, or housing structures. Each optical module may include a respective display 2.6-14, lens 2.6-30, and support structure such as support structure 2.6-32. Support structure 2.6-32, which may sometimes be referred to as a lens support structure, optical component support structure, optical module support structure, or optical module portion, or lens barrel, may include hollow cylindrical structures with open ends or other supporting structures to house displays 2.6-14 and lenses 2.6-30. Support structures 2.6-32 may, for example, include a left lens barrel that supports a left display 2.6-14 and left lens 2.6-30 and a right lens barrel that supports a right display 2.6-14 and right lens 2.6-30.

Displays 2.6-14 may include arrays of pixels or other display devices to produce images. Displays 2.6-14 may, for example, include organic light-emitting diode pixels formed on substrates with thin-film circuitry and/or formed on semiconductor substrates, pixels formed from crystalline semiconductor dies, liquid crystal display pixels, scanning display devices, and/or other display devices for producing images.

Lenses 2.6-30 may include one or more lens elements for providing image light from displays 2.6-14 to respective eyes boxes 2.6-13. Lenses may be implemented using refractive glass lens elements, using mirror lens structures (catadioptric lenses), using Fresnel lenses, using holographic lenses, and/or other lens systems.

When a user's eyes are located in eye boxes 2.6-13, displays (display panels) 2.6-14 operate together to form a display for device 2.6-10 (e.g., the images provided by respective left and right optical modules 2.6-40 may be viewed by the user's eyes in eye boxes 2.6-13 so that a stereoscopic image is created for the user). The left image from the left optical module fuses with the right image from a right optical module while the display is viewed by the user.

It may be desirable to monitor the user's eyes while the user's eyes are located in eye boxes 2.6-13. For example, it may be desirable to use a camera to capture images of the user's irises (or other portions of the user's eyes) for user authentication. It may also be desirable to monitor the direction of the user's gaze. Gaze tracking information may be used as a form of user input and/or may be used to determine where, within an image, image content resolution should be locally enhanced in a foveated imaging system. To ensure that device 2.6-10 can capture satisfactory eye images while a user's eyes are located in eye boxes 2.6-13, each optical module 2.6-40 may be provided with a camera such as camera 2.6-42 and one or more light sources such as light-emitting diodes 2.6-44 or other light-emitting devices such as lasers, lamps, etc. Cameras 2.6-42 and light-emitting diodes 2.6-44 may operate at any suitable wavelengths (visible, infrared, and/or ultraviolet). As an example, diodes 2.6-44 may emit infrared light that is invisible (or nearly invisible) to the user. This allows eye monitoring operations to be performed continuously without interfering with the user's ability to view images on displays 2.6-14.

Not all users have the same interpupillary distance IPD. To provide device 2.6-10 with the ability to adjust the interpupillary spacing between modules 2.6-40 along lateral dimension X and thereby adjust the spacing IPD between eye boxes 2.6-13 to accommodate different user interpupillary distances, device 2.6-10 may be provided with optical module positioning systems in housing 2.6-12. The positioning systems may have guide members and actuators 2.6-43 that are used to position optical modules 2.6-40 with respect to each other.

Actuators 2.6-43 can be manually controlled and/or computer-controlled actuators (e.g., computer-controlled motors) for moving support structures (lens barrels) 2.6-32 relative to each other. Information on the locations of the user's eyes may be gathered using, for example, cameras 2.6-42. The locations of eye boxes 2.6-13 can then be adjusted accordingly.

As shown in the rear view of device 2.6-10 of FIG. 2.6-2, cover 2.6-12C may cover rear face R while leaving lenses 2.6-30 of optical modules 2.6-40 uncovered (e.g., cover 2.6-12C may have openings that are aligned with and receive modules 2.6-40). As modules 2.6-40 are moved relative to each other along dimension X to accommodate different interpupillary distances for different users, modules 2.6-40 move relative to fixed housing structures such as the walls of main portion 2.6-12M and move relative to each other.

A schematic diagram of an illustrative electronic device such as a head-mounted device or other wearable device is shown in FIG. 2.6-3. Device 2.6-10 of FIG. 2.6-3 may be operated as a stand-alone device and/or the resources of device 2.6-10 may be used to communicate with external electronic equipment. As an example, communications circuitry in device 2.6-10 may be used to transmit user input information, sensor information, and/or other information to external electronic devices (e.g., wirelessly or via wired connections). Each of these external devices may include components of the type shown by device 2.6-10 of FIG. 2.6-3.

As shown in FIG. 2.6-3, a head-mounted device such as device 2.6-10 may include control circuitry 2.6-20. Control circuitry 2.6-20 may include storage and processing circuitry for supporting the operation of device 2.6-10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 2.6-20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 2.6-20 may use display(s) 2.6-14 and other output devices in providing a user with visual output and other output.

To support communications between device 2.6-10 and external equipment, control circuitry 2.6-20 may communicate using communications circuitry 2.6-22. Circuitry 2.6-22 may include antennas, radio-frequency transceiver circuitry, and other wireless communications circuitry and/or wired communications circuitry. Circuitry 2.6-22, which may sometimes be referred to as control circuitry and/or control and communications circuitry, may support bidirectional wireless communications between device 2.6-10 and external equipment (e.g., a companion device such as a computer, cellular telephone, or other electronic device, an accessory such as a point device, computer stylus, or other input device, speakers or other output devices, etc.) over a wireless link. For example, circuitry 2.6-22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link.

Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 2.6-10 may, if desired, include power circuits for transmitting and/or receiving wired and/or wireless power and may include batteries or other energy storage devices. For example, device 2.6-10 may include a coil and rectifier to receive wireless power that is provided to circuitry in device 2.6-10.

Device 2.6-10 may include input-output devices such as devices 2.6-24. Input-output devices 2.6-24 may be used in gathering user input, in gathering information on the environment surrounding the user, and/or in providing a user with output. Devices 2.6-24 may include one or more displays such as display(s) 2.6-14. Display(s) 2.6-14 may include one or more display devices such as organic light-emitting diode display panels (panels with organic light-emitting diode pixels formed on polymer substrates or silicon substrates that contain pixel control circuitry), liquid crystal display panels, microelectromechanical systems displays (e.g., two-dimensional mirror arrays or scanning mirror display devices), display panels having pixel arrays formed from crystalline semiconductor light-emitting diode dies (sometimes referred to as microLEDs), and/or other display devices.

Sensors 2.6-16 in input-output devices 2.6-24 may include force sensors (e.g., strain gauges, capacitive force sensors, resistive force sensors, etc.), audio sensors such as microphones, touch and/or proximity sensors such as capacitive sensors such as a touch sensor that forms a button, trackpad, or other input device), and other sensors. If desired, sensors 2.6-16 may include optical sensors such as optical sensors that emit and detect light, ultrasonic sensors, optical touch sensors, optical proximity sensors, and/or other touch sensors and/or proximity sensors, monochromatic and color ambient light sensors, image sensors (e.g., cameras), fingerprint sensors, iris scanning sensors, retinal scanning sensors, and other biometric sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors such as blood oxygen sensors, heart rate sensors, blood flow sensors, and/or other health sensors, radio-frequency sensors, three-dimensional camera systems such as depth sensors (e.g., structured light sensors and/or depth sensors based on stereo imaging devices that capture three-dimensional images) and/or optical sensors such as self-mixing sensors and light detection and ranging (LIDAR) sensors that gather time-of-flight measurements (e.g., time-of-flight cameras), humidity sensors, moisture sensors, gaze tracking sensors, electromyography sensors to sense muscle activation, facial sensors, and/or other sensors. In some arrangements, device 2.6-10 may use sensors 2.6-16 and/or other input-output devices to gather user input. For example, buttons may be used to gather button press input, touch sensors overlapping displays can be used for gathering user touch screen input, touch pads may be used in gathering touch input, microphones may be used for gathering audio input (e.g., voice commands), accelerometers may be used in monitoring when a finger contacts an input surface and may therefore be used to gather finger press input, etc.

If desired, electronic device 2.6-10 may include additional components (see, e.g., other devices 2.6-18 in input-output devices 2.6-24). The additional components may include haptic output devices, actuators for moving movable housing structures, audio output devices such as speakers, light-emitting diodes for status indicators, light sources such as light-emitting diodes that illuminate portions of a housing and/or display structure, other optical output devices, and/or other circuitry for gathering input and/or providing output. Device 2.6-10 may also include a battery or other energy storage device, connector ports for supporting wired communication with ancillary equipment and for receiving wired power, and other circuitry.

Housing 2.6-12 may include support structures for optical modules 2.6-40 and other components of device 2.6-10. In an illustrative configuration, housing 2.6-12 may include a head-mounted support structure such as frame 2.6-12I of FIG. 2.6-4. Frame 2.6-12I may have support structures that run vertically (e.g., frame portion 2.6-12I-M in the middle of device 2.6-10 that are aligned with the user's nose bridge) and may have support structures that run horizontally across the top edge of housing 2.6-12, along the bottom of edge of housing 2.6-12, and along the left and right edges of housing 2.6-12 (see, e.g., peripheral edge portion 2.6-12I-E). This forms left and right openings in frame 2.6-12I that receive, respectively, left and right optical modules 2.6-40. There may, in general, be one or more supporting members in device housing 2.6-12 that help create housing portion 2.6-12M and that support the components in housing portion 2.6-12M. The frame 2.6-12I of FIG. 2.6-4 is illustrative.

As shown in FIG. 2.6-4, one or more component support structures such as camera support structure 2.6-50 may be coupled to frame 2.6-12I (e.g., left and right camera support structures 2.6-50 may be attached to respective left and right peripheral edges such as edge portions 2.6-12I-E of frame 2.6-12I). Support structures for device 2.6-10 such as frame 2.6-12I and camera support structure 2.6-50 may be formed from polymer, glass, ceramic, metal, carbon-fiber composite material or other fiber-composite material, other materials, and/or combinations of these materials (e.g., sheets of rigid polymer or other material, and/or other structural members).

There may be multiple component support structures coupled to frame 2.6-12I. For example, there may be a right-hand camera support structure 2.6-50 coupled to a right side of frame 2.6-12I and a left-hand camera support structure 2.6-50 coupled to a left side of frame 2.6-12I. A single side of frame 2.6-12I and corresponding camera support structure 2.6-50 is shown in the example of FIG. 2.6-4.

Camera support structure 2.6-50 may be coupled to frame 2.6-12I using adhesive, welds, screws or other fasteners, mating engagement structures (e.g., recesses and protrusions for forming a snap fit), press-fit connections, and/or other coupling arrangements. In the example of FIG. 2.6-4, fasteners 2.6-56 (e.g., threaded fasteners such as screws) pass through through-hole openings 2.6-54 of camera support structure 2.6-50 and are received in corresponding openings 2.6-52 of frame 2.6-12I. Openings 2.6-52 may be threaded openings or may be unthreaded through-hole openings in configurations in which fasteners 2.6-56 are supplied with corresponding threaded nuts (as examples).

Camera support structure 2.6-50 may be configured to receive cameras 2.6-46 (e.g., structure may have recesses, openings, and/or other structures configured to receive front-facing cameras). As an example, camera support structures 2.6-50 may have at least two openings 2.6-58 (e.g., through-hole openings), each of which is configured to receive an associated camera. Each camera 2.6-46, which may sometimes be referred to as a camera module, may have a camera module housing and may have a lens and image sensor coupled to the camera module housing. Cameras 2.6-46 may be sensitive to any suitable wavelengths of light (e.g., infrared, visible, both infrared and visible, and/or other wavelengths), may be stereoscopic (three-dimensional) cameras or two-dimensional cameras, may be time-of-flight cameras, may be structured light three-dimensional cameras may be cameras that gather information for use in placing virtual objects in a scene containing real-world and virtual content, may be cameras that are used as part of a visual odometry system, and/or may be other imaging systems. If desired, other optical components may be mounted to camera mounting structure 2.6-50. For example, ambient light sensors, proximity sensors, and/or other components that emit and/or detect light may be mounted to structure 2.6-50. Configurations in which two or more cameras 2.6-46 are attached to each camera mounting structure 2.6-50 may sometimes be described herein as an example.

When cameras 2.6-46 are received within respective openings 2.6-58 of a rigid unitary camera support structure 2.6-50 and/or are otherwise mounted to camera support structure 2.6-50, the relative position of these cameras becomes fixed. This ensures that the direction in which each camera is pointing (e.g., the orientation of the camera's field of view) is fixed relative to the other, thereby helping to avoid misalignment issues arising from cameras orientations that vary during use of device 2.6-10. By attaching camera support structure 2.6-50 to frame 2.6-12I, the rigidity and strength of frame 2.6-12I may be enhanced. This helps ensure that housing portion 2.6-12M is sturdy and able to maintain sensitive components such as optical modules 2.6-40 in alignment with each other in the event that device 2.6-10 is subjected to an undesired drop event.

Camera support structure 2.6-50 may be formed from a layer of polymer or other material with optional ribs and/or other features to help strengthen structure 2.6-50 without adding excessive weight. To help maintain the rigidity and strength of camera support structure 2.6-50, support structure 2.6-50 may be partly or completely free of large notches along the periphery of structure 2.6-50. This may help ensure that there are no portions with locally narrowed widths along the length of structure 2.6-50 that could compromise the rigidity of structure 2.6-50. The width of support structure may be relatively large near the middle of structure 2.6-50. For example, support structure 2.6-50 may have a maximum width across its shorter lateral dimension that is at least 2 mm, at least 4 mm, at least 8 mm, at least 16 mm, at least 32 mm, less than 40 mm, less than 25 mm, less than 18 mm, less than 15 mm, less than 10 mm, less than 7 mm, or other suitable value. The longitudinal dimension (length) of support structure 2.6-50 may be at least 2 cm, at least 4 cm at least 8 cm, at least 16 cm, less than 20 cm, less than 14 cm, less than 10 cm, less than 6 cm, less than 4 cm, or other suitable value. The minimum thickness of support 2.6-50 may be at least 0.3 mm, at least 0.6 mm, at least 1.2 mm, at least 2.4 mm, less than 5 mm, less than 2.5 mm, less than 1.3 mm, less than 0.8 mm, less than 0.5 mm, or other suitable value.

In addition to supporting cameras 2.6-54 and/or other optical components, camera support structure 2.6-50 may serve as a support for wireless communications components such as antennas 2.6-60. In the example of FIG. 2.6-4, camera support structure 2.6-50 serves as a support member for a pair of antennas 2.6-60. In general, camera support structure 2.6-50 may support at least one antenna, at least two antennas, at least three antennas, fewer than ten antennas, from 2 to 5 antennas, or other suitable number of antennas. Antennas 2.6-60 may be formed using any suitable antenna types. For example, antennas 2.6-60 may include antennas with resonating elements that are formed from loop antenna structures, patch antenna structures, inverted-F antenna structures, slot antenna structures, planar inverted-F antenna structures, monopoles, dipoles, helical antenna structures, Yagi (Yagi-Uda) antenna structures, hybrids of these designs, etc. If desired, one or more of antennas 2.6-60 may be cavity-backed antennas. Different types of antennas may be used for different bands and combinations of bands. For example, one type of antenna may be used in forming a local wireless link antenna and another type of antenna may be used in forming a remote wireless link antenna. Dedicated antennas may be used for receiving satellite navigation system signals or, if desired, antennas 2.6-60 can be configured to receive both satellite navigation system signals and signals for other communications bands (e.g., wireless local area network signals and/or cellular telephone. Antennas 2.6-60 may be formed from metal members, patterned thin-film metal layers, and/or other conductive structures.

The front face of device 2.6-10 may be covered with an inactive housing wall (e.g., a polymer layer). In the example of FIG. 2.6-5, front face F of device 2.6-10 is covered by display 2.6-14F (e.g., an organic light-emitting diode display, a microLED display, an electrophoretic display, liquid crystal display, etc.). The pixels of display 2.6-14F may be covered with an outer protective display cover layer (e.g., a layer of glass, a layer of clear polymer, etc.).

Optical windows such as camera windows 2.6-62 may be provided in the display cover layer. Camera windows 2.6-62 may be formed from portions of the display cover layer or from clear window structures that are mounted in openings in the display cover layer. Each optical window may overlap a corresponding optical component and may allow light from the component to be emitted through the optical window and/or may allow ambient light from the environment to pass to the optical component. Camera windows 2.6-62 (e.g., camera windows in the display cover layer for display 2.6-14F and/or optical windows formed in other portions of housing 2.6-12) may have optical characteristics that allow an associated optical component to operate satisfactorily. Consider, as an example, a camera window 2.6-62 that overlaps one of forward-facing cameras 2.6-46. As shown in FIG. 2.6-5, camera support structure 2.6-50 may be mounted in the interior of device 2.6-10 so that cameras 2.6-46 are aligned with camera windows 2.6-62 and so that antennas 2.6-60 are overlapped by the display cover layer for display 2.6-14F. Each camera window 2.6-62 may have a visible-light and/or infrared-light transparency level sufficient to allow the forward-facing camera 2.6-46 that is overlapped by that window to capture images of real-world objects in the user's environment and/or to gather other image data. The transmission of camera window 2.6-62 may be, as an example, at least 50%, at least 90%, at least 95%, or other suitable value (at visible and/or infrared wavelengths). Non-camera components (e.g., an ambient light sensor, an optical proximity sensor, etc.) may have optical windows with other transmission values.

FIG. 2.6-6 is a cross-sectional view of a portion of device 2.6-10 in an illustrative configuration in which display 2.6-14F is formed on front face F of device 2.6-10. As shown in FIG. 2.6-6, display 2.6-14F includes pixel array 2.6-14M (e.g., a display layer such as an organic light-emitting diode display layer, an array of crystalline light-emitting diodes, an electrophoretic display layer, a liquid crystal display layer, etc.). Display cover layer CG of display 2.6-14F may cover and protect pixel array 2.6-14M. During operation, display 2.6-14F may present images to a user (while device 2.6-10 is or is not being worn on a user's head). If desired, display 2.6-14F may have touch screen functionality, so that a user may supply touch input to front face F of device 2.6-10.

Camera 2.6-46 may be located at the edge of display 2.6-14F (e.g., outside of the active area of the display), camera 2.6-46 may operate through an opening in pixel array 2.6-14M, and/or camera 2.6-46 may sense light that passes through gaps in the opaque structures of pixel array 2.6-14M. In the illustrative configuration of FIG. 2.6-6, camera 2.6-46 is located in an inactive display border region that is free of pixels. As shown in FIG. 2.6-6, camera window 2.6-62 may be formed from an opening in opaque masking layer 2.6-64 that allows light to pass through display cover layer CG. Opaque masking layer 2.6-64 may be, as an example, a layer of black ink that is formed on the inner surface of display cover layer CG.

Camera 2.6-46 may be mounted to an opening in camera support structure 2.6-50 using bonds 2.6-66 (e.g., adhesive bonds, welds, etc.), using screws or other fasteners such as illustrative fastener 2.6-68, or using other attachment mechanisms (press-fit connections, mating engagement structures, etc.). In turn, camera support structure 2.6-50 may be attached to frame 2.6-12I by heat stakes (e.g., heat staked protrusions extending from camera support structure 2.6-50 into mating openings in frame 2.6-12I and/or heat staked protrusions extending from frame 2.6-12I into openings), adhesive, welds (e.g., laser welds joining a metal camera support structure to a metal frame, laser welds joining polymer camera support structure to a polymer frame, and/or other welds), press-fit connections, mating engagement structures (e.g., snaps), or other attachment structures 2.6-70 and/or screws or other fasteners 2.6-56 (e.g., screws that are received within threaded openings in camera support structure 2.6-50 and/or frame 2.6-12I, screws that are received within insert nuts, etc.).

As shown in FIG. 2.6-6, antenna 2.6-60 may be formed from conductive antenna structures (e.g., metal traces, stamped metal foil, etc.) supported by camera support structure 2.6-50. During operation, antenna 2.6-60 may transmit and/or receive wireless signals that pass through display cover layer CG and other portions of housing 2.6-12M.

A schematic diagram of an illustrative antenna (antenna 2.6-60) coupled to illustrative radio-frequency transceiver circuitry 2.6-90 is shown in FIG. 2.6-7. Communications circuitry 2.6-22 of FIG. 3 may include transceiver circuitry 2.6-90 (FIG. 2.6-7) and/or other wireless circuitry formed from one or more integrated circuits, power amplifier circuitry, low-noise input amplifiers, passive radio-frequency (RF) components, one or more antennas 2.6-60, transmission lines, and other circuitry for handling RF wireless signals.

Radio-frequency transceiver circuitry 2.6-90 of FIG. 2.6-7 may use antenna 2.6-60 for handling various radio-frequency communications bands. For example, circuitry 2.6-90 may include wireless local area network transceiver circuitry (e.g., circuitry 2.6-90 may handle 2.4 GHz and 5 GHz bands for WiFi® (IEEE 802.11) communications) and may handle the 2.4 GHz Bluetooth® communications band. If desired, circuitry 2.6-90 may use cellular telephone transceiver circuitry or other circuitry for handling cellular telephone wireless communications and/or other wireless communications in frequency ranges such as a communications band from 700 to 2700 MHz, from 3.4 to 3.6 GHz, from 450 MHz to 6 GHz, from 24 to 53 GHZ, from 5 to 8 GHz, from 60 to 90 GHZ, and/or other communications bands. Circuitry 2.6-90 may handle voice data and non-voice data.

Transceiver circuitry 2.6-90 may include satellite navigation system circuitry such as Global Positioning System (GPS) receiver circuitry for receiving GPS signals at 1575 MHz or for handling other satellite positioning data (e.g., GLONASS signals at 1609 MHz). Satellite navigation system signals are received from a constellation of satellites orbiting the earth.

In satellite navigation system links, cellular telephone links, and other long-range links, wireless signals are typically used to convey data over thousands of feet or miles. In WiFi® and Bluetooth® links at 2.4 and 5 GHz and other short-range wireless links, wireless signals are typically used to convey data over tens or hundreds of feet. If desired, device 2.6-10 may include millimeter wave wireless transceiver circuitry. To enhance signal reception for millimeter wave communications, phased antenna arrays and beam steering techniques may be used (e.g., schemes in which antenna signal phase and/or magnitude for each antenna in an array is adjusted to perform beam steering). Antenna diversity schemes may also be used to ensure that the antennas that have become blocked or that are otherwise degraded due to the operating environment of device 2.6-10 can be switched out of use and higher-performing antennas used in their place. Circuitry 2.6-90 can include circuitry for other short-range and long-range wireless links if desired. For example, circuitry 2.6-90 may include circuitry for receiving television and radio signals, paging system transceivers, near field communications (NFC) circuitry, etc. If desired, circuitry 2.6-90 and/or other wireless circuitry may use antennas such as antenna 2.6-60 for radio-frequency sensing (e.g., to determine the orientation and/or distance between device 2.6-10 and other wireless equipment, to form radar-based sensors, etc.).

As shown in FIG. 2.6-7, radio-frequency transceiver circuitry 2.6-90 may be coupled to antenna feed 2.6-102 of antenna 2.6-60 using transmission line 2.6-92. Antenna feed 2.6-102 may include a positive antenna feed terminal such as positive antenna feed terminal 2.6-98 and may have a ground antenna feed terminal such as ground antenna feed terminal 2.6-100. Transmission line 2.6-92 may be formed from metal traces on a printed circuit or other conductive structures and may have a positive transmission line signal path such as path 2.6-94 that is coupled to terminal 2.6-98 and a ground transmission line signal path such as path 2.6-96 that is coupled to terminal 2.6-100. Transmission line paths such as path 2.6-92 may be used to route antenna signals within device 2.6-10. For example, transmission line paths may be used to couple antenna structures such as one or more antennas in an array of antennas to transceiver circuitry 2.6-90. Transmission lines in device 2.6-10 may include coaxial cable paths, microstrip transmission lines, stripline transmission lines, edge-coupled microstrip transmission lines, edge-coupled stripline transmission lines, transmission lines formed from combinations of transmission lines of these types, etc. Filter circuitry, switching circuitry, impedance matching circuitry, and other circuitry may be interposed within transmission line 2.6-92 and/or circuits such as these may be incorporated into antenna 2.6-60 (e.g., to support antenna tuning, to support operation in desired frequency bands, etc.).

Device 2.6-10 may contain multiple antennas 2.6-60. The antennas may be used together or one of the antennas may be switched into use while other antenna(s) are switched out of use. If desired, control circuitry 2.6-20 may be used to select an optimum antenna to use in device 2.6-10 in real time and/or to select an optimum setting for adjustable wireless circuitry associated with one or more of antennas 2.6-60. Antenna adjustments may be made to tune antennas to perform in desired frequency ranges, to perform beam steering with a phased antenna array, and to otherwise optimize antenna performance. Sensors may be incorporated into antennas 2.6-60 to gather sensor data in real time that is used in adjusting antennas 2.6-60.

FIG. 2.6-8 is a diagram of an illustrative antenna that may be used in device 2.6-10. In the example of FIGS. 2.6-8, antenna 2.6-60 is an inverted-F antenna. As shown in FIG. 2.6-8, antenna 2.6-60 may include an antenna resonating element such as antenna resonating element 2.6-110 and an antenna ground such as antenna ground 2.6-112. Antenna resonating element 2.6-110 may have one or more branches such as antenna resonating element arm 2.6-116 and optional antenna resonating element arm 2.6-116'. Return path 2.6-118 (sometimes referred to as a short circuit path) may be coupled between resonating element arm 2.6-116 and ground 2.6-112. Antenna feed 2.6-102 may include positive antenna feed terminal 2.6-98 and ground antenna feed terminal 2.6-100 and may be coupled between element 2.6-110 (e.g., arm 2.6-116) and ground 2.6-112 in parallel with return path 2.6-118. One or more optional components (switches, tunable circuits such as tunable capacitors, tunable inductors, etc.) may be coupled between antenna ground 2.6-112 and resonating element arm 2.6-116 and may be adjusted to tune antenna 2.6-60. The configuration of FIG. 2.6-8 in which no tunable components are coupled between arm 2.6-116 and ground 2.6-112 is merely illustrative.

Antenna resonating element arm 2.6-116 may be separated from ground 2.6-112 by dielectric opening 2.6-122. If desired, opening 2.6-122 may form a slot antenna element that contributes to the antenna response of antenna 2.6-60. In the example of FIG. 2.6-8, antenna 2.6-40 is an inverted-F antenna that does not include a slot antenna element.

Optional parasitic antenna elements such as optional parasitic element 2.6-124 may be included in antenna 2.6-60 to adjust the frequency response of antenna 2.6-60.

Antennas such as antenna 2.6-60 of FIG. 2.6-8 (e.g., inverted-F antennas, slot antennas, hybrid inverted-F slot antennas, etc.) and/or other types of antenna 2.6-60 (e.g., patch antennas, loop antennas, etc.) may be used in supporting any suitable operations involving transmission and/or reception of wireless signals.

Antennas (e.g., antenna resonating elements, parasitic elements, antenna ground structures, feed structures, and/or other structures for each antenna 2.6-60) may be formed from conductive structures such as metal members (e.g., metal structures formed from wireless, machined metal parts, stamped sheet metal, etc.), metal traces (e.g., patterned metal deposited by physical vapor deposition or laser-assisted deposition techniques), other conductive materials (e.g., carbon nanowires, etc.), and/or other conductive antenna structures. These conductive structures may be supported by substrates such as rigid and/or flexible printed circuit substrates, by polymer housing structures (e.g., by portions of camera support structure 2.6-50), dielectric members formed from glass, ceramic, and/or other dielectric, and/or other antenna support structures.

FIGS. 2.6-9, 2.6-10, 2.6-11, and 2.6-12 are cross-sectional side views of illustrative conductive antenna structures 2.6-126 for use in forming antennas 2.6-60.

In the illustrative configuration of FIG. 2.6-9, laser direct structuring (LDS) techniques are being used to form antenna structures 2.6-126. Laser beam 2.6-128 is used to selectively illuminate area 2.6-130 on the surface of a dielectric antenna support structure such as structure 2.6-50. Structure 2.6-50 in the example of FIG. 2.6-9 may be formed from polymer with additives to help sensitize structure 2.6-50 to laser light exposure. After laser light exposure with beam 2.6-128, electroplating operations are used to selectively electrodeposit conductive structures 2.6-126 on area 2.6-130 without depositing the conductive structures elsewhere on the exposed surface of structure 2.6-50, thereby forming structures 2.6-126 with a desired antenna shape (e.g., to form an antenna resonating element, parasitic element, ground, and/or other patterned antenna structures as shown in FIG. 2.6-8).

In the example of FIG. 2.6-10, conductive antenna structures 2.6-126 are metal traces deposited on printed circuit 2.6-132. These metal traces may be deposited by physical vapor deposition and patterned using photolithography, and/or may be formed using other deposition and patterning techniques. Metal traces 2.6-134 of printed circuit 2.6-132 may help convey radio-frequency signals to and/or from antenna structures 2.6-126. Adhesive 2.6-136 may be used to attach printed circuit 2.6-132 to a surface of support structure 2.6-50.

If desired, conductive antenna structures 2.6-126 can be formed from metal structures embedded in support structure 2.6-50. For example, metal antenna structures (wire, metal foil, structural metal members, sheet metal parts, and/or other conductive antenna structures forming antenna structures 2.6-126) can be embedded in polymer that forms support structure 2.6-50, as shown in FIG. 2.6-11 (e.g., one or more shots of polymer for support structure 2.6-50 may be molded over conductive antenna structures 2.6-126).

In the illustrative example of FIG. 2.6-12, printed circuit 2.6-132 has metal traces forming conductive antenna structures 2.6-126 and metal traces 2.6-134 forming signal paths such as transmission lines. As shown in FIG. 2.6-12, printed circuit 2.6-132 may be embedded within support structure 2.6-50 (e.g., polymer forming support structure 2.6-50 may be molded over printed circuit 2.6-132).

The arrangements of FIGS. 2.6-9, 2.6-10, 2.6-11, and/or 2.6-12 and/or other arrangements may be used in forming antennas 2.6-60 on camera support structure 2.6-50, while camera support structure 2.6-50 simultaneously serves as a support and alignment member for cameras 2.6-46.

FIG. 2.6-13 is a top view of an illustrative camera support structure formed using multiple shots of polymer. One shot of polymer forms portion 2.6-50-1 of camera support structure 2.6-50 and another shot of polymer forms portion 2.6-50-2 of camera support structure 2.6-50. Portion 2.6-50-1 may, as an example, include fibers or other filler embedded in the shot of polymer forming portion 2.6-50-1 or portion 2.6-50-1 may have an embedded fiber-composite member (e.g., a stiffening member formed from a rod, strip, or other elongated member of carbon-fiber material or other stiffening member). This may help to locally stiffen and strengthen portion 2.6-50-1 (e.g., to enhance the stiffness of portion 2.6-50-1 relative to portion 2.6-50-2). As shown in FIG. 2.6-13, stiffening member 2.6-50M may extend between openings 2.6-58 (and therefore cameras 2.6-46) to prevent bending of the intervening portion of structure 2.6-50 (e.g., to prevent bending of structure 2.6-50 out of the X-Y plane of FIG. 2.6-13) and thereby prevent undesired bending-induced camera misalignment. Portion 2.6-50-1 may, if desired, be free of conductive material such as conductive carbon fibers (e.g., to reduce the presence of conductive material that could interfere with the operation of overlapping antennas).

FIG. 2.6-14 is a cross-sectional side view of camera support structure 2.6-50 taken along line 2.6-140 of FIG.

2.6-13 and viewed in direction 2.6-142 of FIG. 2.6-13. As shown in FIG. 2.6-14, camera support structure 2.6-50 may include an embedded stiffening structure such as fiber-composite stiffening member 2.6-50M (e.g., an elongated strip-shaped carbon-fiber stiffening member). Member 2.6-50M may be embedded within portion 2.6-50-2. Portions 2.6-50-1 and 2.6-50-2 may be formed from first and second shots of molded polymer material or may be formed using other techniques.

It may be desirable to detect misalignment of cameras 2.6-46 due to deformation of camera support structure 2.6-50. As shown in the cross-sectional side view of structure 2.6-50 of FIG. 2.6-15, a bend sensor such as sensor 2.6-16B may be mounted to camera support structure 2.6-50 between cameras 2.6-46. Sensor 2.6-16B may be a strain gauge or other sensor that is configured to detect bending of structure 2.6-50 (e.g., bending about bend axis 2.6-150). Flexible printed circuit 2.6-152 may have signal lines that carry bending measurements to control circuitry 2.6-20 (FIG. 3). In response to measuring bending in structure 2.6-50, control circuitry 2.6-20 can take corrective action to compensate for any predicted misalignment between cameras 2.6-46. For example, if cameras 2.6-46 are detected as being misaligned by 1o from data gathered by sensor 2.6-16B, control circuitry 2.6-20 can digitally compensate for the measured misalignment (e.g., by shifting and/or warping the camera image data gathered by cameras 2.6-46 to ensure that the images from cameras 2.6-46 can be stitched together as desired or otherwise used as desired in operating device 2.6-10).

If desired, device 2.6-10 may have one or more camera positioning devices such as actuator 2.6-160 of FIG. 2.6-16. Actuator 2.6-160 can change the angular orientation of camera 2.6-46 relative to structure 2.6-50. In response to detecting with sensor 2.6-16B that structure 2.6-50 has bent about axis 150 of FIG. 2.6-15 by 20, for example, control circuitry 2.6-20 may direct actuator 2.6-160 to move camera 2.6-46 to compensate. For example, camera 2.6-46 may be tilted in an opposing direction by a compensating amount (e.g., −20), thereby ensuring that cameras 2.6-46 remain aligned even if structure 2.6-50 experiences deformation during operation of device 2.6-10.

The use of a strain gauge to detect bending is illustrative. Any suitable sensor 2.6-16 may be used to detect camera misalignment due to deformation of support structure 2.6-50. The effects of camera misalignment may be compensated by physically steering optical components such as cameras 2.6-46 (as described in connection with FIG. 2.6-16), by processing the image data from cameras 2.6-46 (e.g., image warping, etc.), and/or by otherwise compensating for detected misalignment. The examples of FIGS. 2.6-13, 2.6-14, 2.6-15, and 2.6-16 are illustrative.

III: Display Integration Assembly

FIG. 3-1 illustrates a perspective view of a front cover assembly 3-100 of an HMD device described herein, for example the front cover assembly 3-1 of the HMD 3-100 shown in FIG. 3-1 or any other HMD device shown and described herein. The front cover assembly 3-100 shown in FIG. 1 can include a transparent or semi-transparent cover 3-102, shroud 3-104 (or "canopy"), adhesive layers 3-106, display assembly 3-108 including a lenticular lens panel or array 3-110, and a structural trim 3-112. The adhesive layer 3-106 can secure the shroud 3-104 and/or transparent cover 3-102 to the display assembly 3-108 and/or the trim 3-112. The trim 3-112 can secure the various components of the front cover assembly 3-100 to a frame or chassis of the HMD device.

In at least one example, as shown in FIG. 3-1, the transparent cover 3-102, shroud 3-104, and display assembly 3-108, including the lenticular lens array 3-110, can be curved to accommodate the curvature of a user's face. The transparent cover 3-102 and the shroud 3-104 can be curved in two or three dimensions, e.g. vertically curved in the Z-direction in and out of the Z-X plane and horizontally curved in the X-direction in and out of the Z-X plane. In at least one example, the display assembly 3-108 can include the lenticular lens array 3-110 as well as a display panel having pixels configured to project light through the shroud 3-104 and the transparent cover 3-102. The display assembly 3-108 can be curved in at least one direction, for example the horizontal direction, to accommodate the curvature of a user's face from one side (e.g., left side) of the face to the other (e.g., right side). In at least one example, each layer or component of the display assembly 3-108, which will be shown in subsequent figures and described in more detail, but which can include the lenticular lens array 3-110 and a display layer, can be similarly or concentrically curved in the horizontal direction to accommodate the curvature of the user's face.

In at least one example, the shroud 3-104 can include a transparent or semi-transparent material through which the display assembly 3-108 projects light. In one example, the shroud 3-104 can include one or more opaque portions, for example opaque ink-printed portions or other opaque film portions on the rear surface of the shroud 3-104. The rear surface can be the surface of the shroud 3-104 facing the user's eyes when the HMD device is donned. In at least one example, opaque portions can be on the front surface of the shroud 3-104 opposite the rear surface. In at least one example, the opaque portion or portions of the shroud 3-104 can include perimeter portions visually hiding any components around an outside perimeter of the display screen of the display assembly 3-108. In this way, the opaque portions of the shroud hide any other components, including electronic components, structural components, and so forth, of the HMD device that would otherwise be visible through the transparent or semi-transparent cover 3-102 and/or shroud 3-104.

In at least one example, the shroud 3-104 can define one or more apertures transparent portions 3-120 through which sensors can send and receive signals. In one example, the portions 3-120 are apertures through which the sensors can extend or send and receive signals. In one example, the portions 3-120 are transparent portions, or portions more transparent than surrounding semi-transparent or opaque portions of the shroud, through which sensors can send and receive signals through the shroud and through the transparent cover 3-102. In one example, the sensors can include cameras, IR sensors, LUX sensors, or any other visual or non-visual environmental sensors of the HMD device.

Any of the features, components, and/or parts, including the arrangements and configurations thereof shown in FIG. 3-1 can be included, either alone or in any combination, in any of the other examples of devices, features, components, and parts shown in FIG. 3-2-3-6 and described herein. Likewise, any of the features, components, and/or parts, including the arrangements and configurations thereof shown and described with reference to FIG. 3-2-3-6 can be included, either alone or in any combination, in the example of the devices, features, components, and parts shown in FIG. 3-1.

FIG. 3-2 illustrates a partial, cross-sectional view of an example of a front cover assembly 3-200, including a shroud 3-204 and a display assembly 3-208 coupled to the shroud

3-204 via a display bracket 3-214. The shroud 3-204 can be coupled to a shroud bracket 3-216, which can couple the front cover assembly 3-200 to one or more structural frame members 3-218 of an HMD device. The display bracket 3-214 can extend behind the display assembly 3-208 and fixe the display assembly 3-208 adjacent to the shroud 3-204 such that pixels of the display screen of the display assembly 3-208 project light outward through the shroud 3-204.

In at least one example, the display assembly 3-208 is curved in one direction, e.g., the horizontal direction, but not the vertical direction, e.g. up and down in the orientation shown in FIG. 3-2. In such an example, the shroud 3-204 can be curved in both vertical and horizontal directions, as shown in FIG. 1 and described above.

FIG. 3-3 shows a side view of another front cover assembly 3-300 similar to the front cover assembly 3-200 shown in FIG. 3-2. In FIG. 3-3, the front cover assembly 3-300 is shown without an exterior transparent cover but includes a shroud 3-304 defining mechanical or visual apertures 3-320 through which sensors can send and receive signals as well as a display assembly 3-308 secured to a back or rear side of the shroud 3-304.

Any of the features, components, and/or parts, including the arrangements and configurations thereof shown in FIGS. 3-2 and 3-3 can be included, either alone or in any combination, in any of the other examples of devices, features, components, and parts shown in FIGS. 3-1 and 3-4 through 3-6 and described herein. Likewise, any of the features, components, and/or parts, including the arrangements and configurations thereof shown and described with reference to FIGS. 3-1 and 3-4 through 3-6 can be included, either alone or in any combination, in the example of the devices, features, components, and parts shown in FIGS. 3-2 and 3-3.

FIG. 3-4 illustrates a partial, cross-sectional view of an example of a front cover assembly 3-400, including an outer transparent or semi-transparent cover 3-402, a shroud 3-404, a blinker film 3-422 secured to a back/rear side of the shroud 3-404, a display assembly 3-408 including a lenticular lens array 3-410, a display bracket 3-414 securing the display assembly relative to the shroud 3-404 such that an air gap 3-424 is defined between the lenticular lens array 3-410 and the blinker film 3-422, and a graphite layer 3-426 disposed on a back/rear side of the display bracket 3-414. The air gap 3-424 can define an open space or volume between the lenticular lens array 3-410 and the blinker film 3-422 such that no other components are disposed within the gap 3-424 between the lenticular lens array 3-410 and the blinker film 3-422. In at least one example, the blinker film 3-422 can be configured to hide the display from view when the display of the display assembly 3-408 is not on or projecting light and/or when someone views the front display assembly from certain predetermined angles (e.g., wide angles instead of narrow, more "straight on" viewing angles in front of the display 3-408). In at least one example, the lenticular lens array 3-410 can be used to generate a three-dimensional effect of those not donning the HMD and viewing the outward facing display 3-408 through the cover 3-402 and shroud 3-404. The gap 3-424 can be present to allow light transmitted through the cover 3-402, shroud 3-404, and blinker film 3-422 to pass appropriately through the lenses of the lenticular lens array 3-410 to create the desired three-dimensional effect.

In at least one example, the blinker film 3-422 can be adhered to the shroud 3-404 via an optically clear adhesive 3-423 shown in FIG. 3-4A. In one example, the lenticular lens array 3-410 can be adhered to the display assembly 3-408 via an optically clear adhesive 3-411 shown in FIG. 3-4A. In at least one example, the blinker film 3-422 can diffuse and darken light, including specular highlights from the lenticular lens array 3-410, passing through from the display assembly 3-408. In at least one example, diffusion particles can be formed in the optically clear adhesive layer 3-423, which can be referred to as a haze film 3-432, between the blinker film 3-422 and the shroud 3-404. In at least one example, the diffusion particles can be formed within the blinker film 3-422 itself. In at least one example, the diffusion particles can be formed within the shroud 3-404. In at least one example, the diffusion particles can include titanium dioxide. In at least one example, the display assembly 3-408 can include an LCD and/or OLED display layer rather than the lenticular lens array 3-410, e.g., with a flat display assembly (as opposed to the curved display assembly 3-408 shown) to provide 3-d visual effects. The front cover assembly of the HMD can also include a dust seal 3-409 disposed between the shroud 3-404 and the lenticular lens array 3-422 and/or other components of the assembly, including the display assembly 3-408, to prevent dust and other particles/pollutants from entering the air gap 3-424 between the lenticular lens array 3-410 and the blinker film 3-422.

In at least one example, the graphite layer 3-426 can be one of multiple graphite layers, for example two layers, three layers, four layers, or more than four layers. The graphite layers 3-426 can be configured to spread heat from the display assembly 3-408 coupled to the display bracket 3-414. In at least one example, the display bracket 3-414 is a metal material that acts as a heat sink to dissipate heat from the display assembly 3-408. In one example, the display bracket 3-414 includes a thermally conductive material. In one example, the display bracket 3-414 includes magnesium.

In at least one example, the cover 3-402 includes a clear core material 3-427. In one example, the core material 3-427 can include polycarbonate. In one example, the core material includes glass or other ceramic materials. In at least one example, optical clear adhesive (OCA) layers **3-428*a*, 3-428*b* can be disposed on either side, respectively, of the core material 3-427. In at least one example, first and second protective coating layers/films 3-430*a*, 3-430*b* can be disposed on either side, respectively, of the core material 3-427, with the OCA layers 3-428*a*, 3-428*b* disposed between respective protective coating films 3-430*a*, 3-430*b* and the core material 3-4271. In at least one example, an additional hard-coat layer and or an additional anti-reflective coating, which can be part of a hard-coat layer, can be disposed on top of the first polycarbonate film 3-430*a* to define an external surface of the transparent cover 3-402**.

In at least one example, the cover assembly 3-400 can include a haze film 3-432 disposed on the back/rear side of the shroud 3-404. In one example, an optical bonding material, such as an optically clear bonding material, can be disposed between the blinker film 3-422 and the shroud 3-404. In one example, the bonding material can include or form the haze film 3-432 from particles in the bonding material. In at least one example, the front cover assembly 3-400 can also include a bracket 3-434 disposed against a rear/back side of the shroud 3-404 outside a perimeter of the display assembly 3-408. The display bracket 3-414 can be mounted to the shroud 3-404 via the bracket 3-434 as shown in FIG. 3-4. In at least one example, one or more opaque painted portions 3-436 can be applied or formed on the rear/back side of the shroud 3-404, for example, between the bracket 3-434 and the shroud 3-404 to visually hide the bracket 3-434 from being seen from outside or in front of the front cover assembly 3-400. The shroud can also include an opaque portion or multiple portions disposed generally around an outer perimeter area of the shroud to hide components behind the perimeter portion, for example cameras, sensors, brackets, circuitry, frame and structural components of the HMD, and so forth. The opaque portions can be applied to the shroud 3-404.

In at least one example, the bracket 3-434 can be referred to as a shroud canopy. The shroud 3-404 can include a layer of ink, paint, film, or other opaque layer 3-435 disposed between the bracket 3-434 and the shroud 3-404 to visually hide any glue or other connection mechanisms securing the bracket 3-434 to the shroud 3-404 from someone looking in through the front of the device. The bracket 3-434 can also be opaque and provide a visual barrier to components behind/within the HMD device. The film or paint layer 3-435 can be disposed on the shroud 3-404 around a peripheral edge or edge area surrounding the display assembly 3-408 or around a more opaque area of the shroud 3-404 through which the display assembly 3-408 is configured to project light.

FIG. 3-4B illustrates an exploded view of a front cover assembly 3-400 of an HMD device, including a transparent cover 3-402, shroud 3-404, and a frame 3-448 to which the cover glass 3-402 and shroud 3-404 can be secured. The shroud 3-404 can include or define an aperture 3-440 through which one or more cameras or other sensors of the HMD can send and receive signals. The shroud 3-404 can also include a visually opaque and infrared-transparent window 3-438 through which an infrared sensor and/or emitter can send and receive infrared light. The shroud 3-404 can also include another window or opening 3-442 through which another sensor of the HMD can send and receive signals.

In at least one example, the cover 3-402 can include back-painted, opaque trim layer 3-444 disposed on a back side of the cover 3-402 between the cover 3-402 and the shroud 3-404. The trim layer 3-444 can include opaque ink, paint, film, or other opaque layers to reduce stray signals, for example light signals, from the various emitters of the HMD from undesirably bouncing between the cover 3-402 and the shroud 3-404, thus reducing cross-talk between sensors and emitters. The trim layer 3-444 can include a sensor peripheral trim portion 3-402 on a back side of the cover 3-402 as well to limit stray light directly around a sensor disposed behind the window 3-438. The trim portion 3-402 can include the same or different layers and materials as that of the trim layer 3-444 but be aligned with the window 3-438, and thus disposed directly around a periphery of the emitter or sensor of the HMD sending and/or receiving signals through the window 3-438, to prevent stray signals, including stray light signals, from cross-talking with other emitters/sensors. In this way, stray cross-talk between the cover 3-402 and the shroud 3-404 can be reduced.

FIG. 3-4C illustrates another exploded, perspective view of a front cover assembly 3-400, including the shroud 3-404, cover 3-402, trim layer 3-444, trim portion 3-446 defining a sensor window 3-445, windows 3-440, and sensor/emitter window 3-438. In at least one example, the assembly 3-400 can also include a light seal 3-450 disposed around the window 3-438 on a front side of the shroud 3-404 between the shroud 3-404 and the cover 3-402. The light seal 3-450 can be a physical barrier extending between the shroud 3-404 and the cover 3-402, for example physically contacting both the shroud 3-404 and the cover 3-402, and around the window 3-438, such that light or other signals sent by an emitter or received by a sensor of the HMD through the window 3-438 is directed through the window 3-445 of the cover 3-402 to reduce stray signals and cross-talk. The seal 3-450 can be aligned with the trim portion 3-446 of the cover 3-402.

In at least one example, the shroud 3-404 and cover 3-402 can include radio-frequency transparent materials and the HMD can include antennas and emitters configured to pass radio-frequency signals through shroud 3-404 and cover 3-402.

In at least one example, the shroud 3-404 can include a notch or cutout recessed into or disposed on a back side of the shroud 3-404 to accommodate one or more antennas. The cutouts can be shaped and positioned to accommodate the placement of antennas adjacent to or against the shroud to allow more distance between the antennas and one or more grounding planes relative to the antennas. The increased resonating distance of the antennas provided by the shroud cutouts can improve the performance of the antennas. In one example, an increase of about 0.8 mm of distance between an antenna disposed in the cutout and the grounding plane can improve the antenna performance up to about 3 dB.

In at least one example, the backside of shroud 3-404 (e.g., the side of the shroud 3-404 facing inward toward an internal volume of the HMD device) can include posts, brackets, or other datum features to align cameras within the HMD device when assembled.

Any of the features, components, and/or parts, including the arrangements and configurations thereof shown in FIGS. 3-4-3-4C can be included, either alone or in any combination, in any of the other examples of devices, features, components, and parts shown in FIGS. 3-1-3-3 and 3-5-3-6 and described herein. Likewise, any of the features, components, and/or parts, including the arrangements and configurations thereof shown and described with reference to FIGS. 3-1-3-3 and 3-5-3-6 can be included, either alone or in any combination, in the example of the devices, features, components, and parts shown in FIGS. 3-4-3-4C.

FIG. 3-5 shows another cutaway view of an example of a front cover display 3-500 without the shroud or external transparent cover shown. In the illustrated example of FIG. 3-5, the assembly 3-500 includes a blinker film 3-522 separated from the lenticular lens array 3-510 by the gap 3-524, the lenticular lens array 3-510 being part of or disposed on/against the display assembly 3-508. FIG. 3-5 also shows the display bracket 3-514 coupling the display assembly 3-508 to the bracket 3-534. FIG. 3-5 illustrates the curvature of the display assembly 3-508, including the lenticular lens 3-510, and the curvature of the blinker film 3-522.

FIG. 3-6 illustrates a close-up view of a lenticular lens array 3-610 similar to the array 3-510 shown in FIG. 3-5, with individual lens or array portions 3-611 shown. In at least one example, because the lens array 3-610 can be curved, as well as the display screen 3-609 of the display assembly 3-608, as noted above in other examples and as shown in FIG. 3-6, the angle of the array portions 3-611 can vary across a horizontal width or length of the lenticular lens array 3-610. The variation of the angles of the array portions 3-611 can be such that they do not block light from the display screen as the display screen 3-609 curves from the point of view of someone external to and in front of the front cover assembly 3-600, to which the light from the display screen 3-609 is projected. In one example, the display screen 3-609 can include a panel of pixels. In one example, the display screen 3-609 includes and OLED panel.

Any of the features, components, and/or parts, including the arrangements and configurations thereof shown in FIGS. 3-5 and 3-6 can be included, either alone or in any combination, in any of the other examples of devices, features, components, and parts shown in FIGS. 3-1-3-4 and described herein. Likewise, any of the features, components, and/or parts, including the arrangements and configurations thereof shown and described with reference to FIGS. 3-1-3-4 can be included, either alone or in any combination, in the example of the devices, features, components, and parts shown in FIGS. 3-5 and 3-6.

IV: Shroud

4.0: Systems with Displays and Sensor-Hiding Structures

FIG. 4-1 is a front view of an illustrative ring-shaped cosmetic covering structure for device 4-10. Illustrative ring-shaped shroud 4-100 of FIG. 4-1 may be mounted under the inner surface of the display cover layer for display 4-14F in inactive area IA. This may help hide the optical components and other internal portions of device 4-10 from view from the exterior of device 4-10. Shroud 4-100 may be formed from one or more unbroken ring-shaped members and/or may be formed from multiple shroud segments that are attached using adhesive, fasteners, or other attachment structures. If desired, shroud 4-100 may be formed from multiple members that are sandwiched together along some or all of their lengths. In an illustrative configuration, which may sometimes be described herein as an example, shroud 4-100 may be formed from an inner piece (e.g., an inner full or partial ring), which may sometimes be referred to as an inner shroud member, shroud trim, or shroud trim member and may be formed from an outer piece or pieces (e.g., one or more strips of material or covering members, an full ring, one or more partial rings, etc.), which may sometimes be referred to as a shroud cover, canopy, or shroud canopy.

As shown in FIG. 4-1, shroud 4-100 may have optical component windows to accommodate components 4-60, 4-62, 4-64, 4-84, 4-66, 4-68, 4-70, 4-72, 4-74, 4-76, 4-78, 4-82, and 4-80. The optical component windows may be formed from through-hole openings in shroud 4-100, from recesses or other partial openings that do not pass entirely through shroud 4-100, from inserted optical window members in shroud through-hole openings, and/or from other shroud optical component window structures. Display 4-14F may have a display cover layer that has corresponding optical component windows (through-hole openings, recessed areas, inserted window members in through-hole openings, etc.) and/or that is formed from bulk material that has desired optical properties (e.g., a display cover layer formed from one or more layers of material such as glass and/or polymer with sufficient transparency at the operating wavelength range of the overlapped optical component to allow the optical component to operate satisfactorily through the cover layer without forming openings or other window structures in the cover layer).

Shroud 4-100 may have any suitable shape. For example, the outline of shroud 4-100 may be rectangular with rounded corners as shown in FIG. 4-1, may have teardrop shapes on the left and right sides of device 4-10, may have an oval outline, and/or may have other outlines with curved and/or straight edge segments. FIG. 4-2 is a front view of a portion of shroud 4-100 showing how the inner and outer edges of shroud 4-100 may be curved (e.g., to follow a teardrop shape). Shroud 4-100 may, if desired, have a peripheral edge that is curved along most or all of its length.

The width of shroud 4-100 may be constant along its length or shroud 4-100 may have portions that are wider than others. The thickness of shroud 4-100 (e.g., the dimension of shroud 4-100 into the page in the orientation of FIG. 4-1) may be smaller than the width of shroud 4-100 (the lateral dimension of shroud 4-100 within the page in the orientation of FIG. 4-1) or the thickness of the shroud may be equal to or greater than the width of the shroud. The shroud may have a two-dimensional shape (e.g., shroud 4-100 may have a planar shape that lies in the XZ plane in the example of FIG. 4-1) or may have a three-dimensional shape (e.g., a shape with a curved cross-sectional profile and/or a shape characterized by inner and/or outer surfaces of compound curvature). In an illustrative configuration, most or all of the inner and outer surfaces of shroud have a compound-curvature surface.

The optical components under inactive area IA may include components on the left and right sides of device 4-10 that operate in conjunction with each other. For example, scene cameras, tracking cameras, and/or structured light cameras in device 4-10 may be formed in pairs, each of which includes a left camera and a corresponding right camera. A left scene camera and a right scene camera may, as an example, operate together to capture overlapping images that provide device 4-10 with a wide field of view for gathering pass-through video. Left and right tracking cameras may operate together to track a user's hands or other external objects. Left and right structured light cameras or other three-dimensional cameras may be used together to capture three-dimensional images of the user's environment. To enhance performance of the left and right optical components in these types of paired component arrangements, it may be desirable to maintain accurate alignment between the left and right optical components. To help maintain left and right optical components on the respective left and right sides of device 4-10 in alignment with each other, device 4-10 may be provided with one or more housing structures that help support the optical components.

As shown in FIG. 4-3, for example, device 4-10 may be provided with an internal support structure such as bracket 4-102 that helps support optical components 4-104 on the left and right sides of device 4-10. Components 4-104 may be, for example, optical components of the type shown under inactive area IA of FIG. 4-1. Bracket 4-102 may be formed from stiff metal and/or other rigid materials (e.g., rigid polymer, carbon fiber composite material or other fiber-composite material, etc.). A nose-bridge recess in bracket 4-102 (e.g., in the portion of bracket 4-102 near nose-bridge portion 4-16NB) may help bracket 4-102 conform to the shape of the user's face. Bracket 4-102 may have an elongated strip shape that runs along a portion of the length of inactive area IA (e.g., on the lower edge of device 4-10).

Bracket 4-102 may be coupled to device 4-10 with attachment structures (adhesive, fasteners, press-fit connections, and/or other attachment mechanism) that allow bracket 4-102 to float with respect to the rest of housing portion 4-16M during a drop event. The stiffness of bracket 4-102 and the ability of bracket 4-102 to shift in position somewhat relative to other housing structures without deforming the shape of bracket 4-102 significantly may help hold components on the left and right sides of device 4-10 in alignment with each other during periods of excessive stress such as when device 4-10 experiences high stress during an unexpected drop event.

In the example of FIG. 4-3, bracket 4-102 is mounted under inactive area IA and has a nose bridge recess with a curved edge that is configured to accommodate a user's nose when device 4-10 is worn on a user's head. Bracket 4-102 may have other shapes, if desired. Components 4-104 may be attached to respective left and right sides of bracket 4-102 and/or other supporting structures in device 4-10 (e.g., shroud 4-100) using adhesive, fasteners, press fit connections, and/or other attachment structures.

FIG. 4-4 is a cross-sectional top view of a portion of device 4-10. As shown in FIG. 4-4, shroud 4-100 may overlap one or more optical components 4-104 in inactive area IA. Inactive area IA may form a ring-shaped border that surrounds active area AA. Display 4-14F may have a display cover layer such as display cover layer 4-92. Layer 4-92 may be formed from glass, polymer, ceramic, crystalline material such as sapphire, other materials, and/or combinations of these materials. Layer 4-92 may include a single layer of material or multiple stacked layers of material. In active area AA, pixels P in display panel 4-14P display images that are viewable through display cover layer 92. Shroud 4-100 may be absent from active area AA (e.g., shroud may have a ring shape that surrounds an opening over panel 4-14P as shown in FIG. 4-4) or shroud 4-100 may optionally have a portion (sometimes referred to as a canopy or shroud structure) that overlaps display panel 4-14P. The canopy may be fully or partly transparent. In inactive area IA, shroud 4-100 overlaps components 4-104. Components 4-104 may be optical components that emit and/or detect light that passes through transparent portions of layer 92 and shroud 4-100 and/or through optical component windows formed from recesses, through-hole openings, window members, and/or other window structures in layer 4-92 and shroud 4-100.

Display cover layer 4-92 may include planar surfaces and/or curved surfaces. In an illustrative configuration, most or all of the inner and outer surfaces of display cover layer 4-92 have curvature.

The curved surfaces of display cover layer 4-92 may include curved surfaces that can be flattened into a plane without distortion (sometimes referred to as developable surfaces or curved surfaces without compound curvature). Surfaces such as these may, as an example overlap active area AA. The curved surfaces of display cover layer 4-92 may also include curved surfaces that are characterized by compound curvature (e.g., surfaces that can only be flattened into a plane with distortion, sometimes referred to as non-developable surfaces). Some or all portions of the inner and outer surfaces of display cover layer 4-92 in inactive area IA may, as an example, be characterized by compound curvature. This allows the periphery of display 4-14F to smoothly transition away from the active area and provides an attractive appearance and compact shape for device 4-10. The compound curvature of display cover layer 4-92 in inactive area IA may also facilitate placement of the optical components under inactive area IA in desired orientations. The inner and outer surfaces of display cover layer 4-92 in active area AA may have compound curvature, may be developable surfaces, or may include both developable surface areas and compound curvature areas.

Image data and other data gathered by optical components can be warped digitally to compensate for optical distortion associated with display cover layer 4-92. To help minimize optical distortion, one or more of the optical components may optionally be oriented in a direction that is parallel or close to parallel to the surface normal of the portion of the display cover layer surface that is overlapping the optical component.

Consider, as an example, optical components 4-104 of FIG. 4-4. As shown in FIG. 4-4, some optical components such as illustrative optical component 4-104B, which operates in direction 4-112, may face forward (e.g., direction 4-112 may be parallel to or nearly parallel to the Y axis of FIG. 4-4) in portions of display cover layer 4-92 where the surface normal of layer 4-92 is oriented parallel to the Y axis or close to parallel to the Y axis. Other optical components such as illustrative optical component 4-104A, which operates in direction 4-110, may be angled away from the forward direction by a non-zero angle (e.g., by an angle of at least 10°, at least 20°, less than 90°, less than 50°, or other suitable amount). Direction 4-110 may be parallel or closely parallel (e.g., aligned within 30°, within 20°, within 10° or other suitable amount) to the surface normal of the overlapping surface of display cover layer 92 and may lie in the XY plane of FIG. 4-4 or be angled out of the XY plane (e.g., by orienting component 4-104A so that direction 4-110 is angled upwards in the +Z direction or downwards in the −Z direction in addition to angling direction 4-110 away from the +Y direction as shown in FIG. 4-4).

In this type of arrangement, display cover layer 4-92 may have compound curvature in inactive area IA and shroud 4-100 may have a shape with a cross-sectional profile that mirrors that of display cover layer 92 in inactive area IA (e.g., the outer and/or inner surfaces of shroud 4-100 in inactive area IA may be compound-curvature surfaces). When components such as components 4-104A and 4-104B are mounted to shroud 4-100 and/or are otherwise supported by the support structures of device 4-10 to operate through shroud 4-100 and display cover layer 4-92, the curved shape of display cover layer 4-92 and shroud 4-100 may help allow these components to face in desired orientations (e.g., in a forward direction for components such as component 4-104B or angled away from the forward direction for components such as component 4-104A).

As an example, optical components that are mounted to the left and right sides of nose bridge portion 4-16NB may be oriented respectively somewhat to the left and somewhat to the right of the +Y forward direction (e.g., to ensure an adequate angle-of-view for a pair of cameras). As another example, the curved shape of display cover layer 4-92 and shroud 4-100 along the lower edge of device 4-10 may allow the components in this portion to point somewhat downward out of the XY plane, which may help orient cameras such as tracking cameras towards the user's hands.

Display panel 4-14P may be a flexible display such as a flexible organic light-emitting diode display with a flexible substrate or a light-emitting diode display formed from crystalline semiconductor light-emitting diode dies mounted on a flexible substrate. This allows display panel 4-14P and the pixels of panel 4-14P that form active area AA to be bent about a bend axis that runs parallel to vertical axis Z, thereby helping to wrap display 4-14F and housing portion 4-16M about the curved surface of the user's face. If desired, display panel 4-14P may be a lenticular display configured to display three-dimensional images (e.g., an autostereoscopic display having a series of parallel lenticular lenses, each of which overlaps a respective group of multiple columns of pixels).

The outer and inner surfaces of display cover layer 4-92 may have the same shape (e.g., these surfaces may be parallel to each other) or the outer surface and inner surfaces may have different shapes. In arrangements in which display panel 4-14P of display 4-14F is flexible, it may be desirable to configure the inner surface of display cover layer 4-92 in active area AA to exhibit a bent surface shape that matches the bent outwardly-facing surface of display panel 4-14P (e.g., the inner and, if desired, the outer surface of display cover layer 4-92 in active area AA may be developable surfaces without compound curvature to match the developable outward-facing surface of display panel 4-14P).

Shroud 4-100 and display cover layer 4-92 may be attached to main housing portion 4-16M using adhesive, screws and other fasteners, press-fit connections, and/or other attachment mechanisms. An illustrative configuration in which shroud 4-100 and cover layer 4-92 are attached to forward-facing edge of a housing wall in main housing portion 4-16M using adhesive is shown in FIG. 4-4 through 4-6. In the example of FIG. 4-5, shroud 4-100 has an inner shroud member such as shroud trim 4-100A and has a corresponding outer shroud member such as shroud canopy 4-100B. Shroud trim 4-100A and shroud canopy 4-100B may be formed from metal, polymer, ceramic, glass, other materials, and/or combinations of these materials. In an illustrative example, shroud trim 4-100A is formed from black polymer or other dark material and shroud canopy 4-100B is formed from clear polymer. The outer surface of shroud canopy 4-100B may be smooth to provide shroud 4-100 with a cosmetically attractive appearance.

A layer of pressure sensitive adhesive (see, e.g., adhesive 114) may be used in attaching canopy 4-100B to trim 4-100A. Adhesive may also be used in attaching cover layer 92 and shroud 4-100 to housing portion 4-16M. As shown in FIG. 4-5, for example, a first adhesive such as adhesive 4-122 may be used to attach display cover layer 92 to shroud 4-100 (e.g., to a ledge in shroud trim 4-100A). A second adhesive such as adhesive 4-124 may, in turn, be used to attach shroud 4-100 (e.g., shroud trim 4-100A) to an adjacent lip of a wall in main housing portion 4-16M.

In some configurations, adhesives 4-122 and 4-124 may be formed from the same type of material. In an illustrative configuration, adhesives 4-122 and 4-124 are different. Housing portion 4-16M may have a wall with a lip shape that creates a shearing force on adhesive 4-124 as display 4-14F is attached to housing portion 4-16M by pressing display 4-14F against housing portion 4-16M in the −Y direction. In this type of scenario, it may be desirable to form adhesive 4-124 from an adhesive that can bond satisfactorily in the presence of shear forces such as a molten hot melt glue (thermoplastic adhesive) or other liquid adhesive rather than pressure sensitive adhesive. Adhesive 4-124 may, if desired, be exposed to a curing agent (ultraviolet light, moisture, etc.) before display 4-14F is assembled into housing 4-16M.

It may be desirable to repair device 4-10. For example, if a user exposes display 4-14F to excessive force during a drop event, it may be desirable to replace display 4-14F with a new display. This can be accomplished by heating adhesive 4-124 to loosen the adhesive bond formed by adhesive 4-124. To help prevent display cover layer 4-92 from detaching from shroud 4-100 while softening adhesive 4-124 with heat, adhesive 4-122 may be provided with a higher-temperature softening point than adhesive 4-124 (e.g., adhesive 4-122 may be a two-part hot melt glue with a higher melting point than adhesive 4-124).

Optical components that are overlapped by display cover layer 4-92 and shroud 4-100 in inactive area IA may transmit and/or receive light through shroud 4-100 and display cover layer 4-92. Layer 4-92 may be formed from laminated glass or other clear material that allows light for each overlapped optical component 4-104 to pass through layer 4-92. If desired, a partial recess or a through-hole opening may be formed in the portion of layer 4-92. An optional optical component window member 4-116 may then be inserted within layer 4-92 (e.g., in window region 4-118). As an example, layer 4-92 may be formed from one or more layers of glass and/or polymer and may be characterized by a first level of light transmission at operating wavelength(s) for component 4-104, whereas window member 4-116 may be formed from polymer, glass, and/or other materials that are characterized by a second level of light transmission at the operating wavelength(s) that is greater than the first level of light transmission. In other illustrative arrangements, no window member is inserted in layer 4-92 (e.g., optional window member 4-116 of FIG. 4-5 can be omitted when layer 4-92 alone is sufficiently transparent to pass light for component 4-104).

Shroud 4-100 may be provided with an optical component window in region 4-118 to accommodate overlapped optical component 4-104. Component 4-104 may operate at ultraviolet light wavelengths, visible light wavelengths, and/or infrared light wavelengths. To accommodate component 4-104 in the example of FIG. 4-5, shroud trim 4-100A has been provided with a through-hole opening such as opening 120, whereas shroud canopy 4-100B has no openings in region 4-118. This effectively forms a window recess in shroud 4-100 in alignment with components 4-104. Trim 4-100A may be formed from black polymer or other light-absorbing material, so the formation of opening 120 in trim 4-100A may help ensure that sufficiently light may pass through region 4-118 to allow component 4-104 to operate satisfactorily. The portion of canopy 4-100B that overlaps opening 4-120 may be transparent (e.g., clear polymer).

To help hide component 4-104 from view, the inner surface of shroud canopy 4-100B of FIG. 4-5 has been covered with coating 4-126. Coating 4-126 may be used to provide region 4-118 with a desired outward appearance and optical properties that ensure that component 104 can operate satisfactorily. Coating 4-126 may be a thin-film-interference filter formed from a stack of thin-film dielectric layers of alternating refractive index values (with indices and thicknesses selected to create a desired transmission spectrum and a desired reflection spectrum for the filter), may be a layer of ink (e.g., a polymer layer including dye, pigment, and/or other colorant), and/or may be any other suitable coating with desired optical properties.

Consider, as an example, a scenario in which component 4-104 transmits and/or receives infrared light. In this type of arrangement, coating 4-126 may be opaque at visible wavelengths and transparent at infrared wavelengths. This helps to hide component 4-104 from view from the exterior of device 4-10 while allowing infrared light associated with the operation of component 4-104 to pass through shroud 4-100 and layer 4-92.

As another example, consider a scenario in which component 4-104 is an ambient light sensor. In this configuration, coating 4-126 may exhibit a visible light transmission of 1-8% (as an example). This may allow sufficient visible ambient light to reach the ambient light sensor for the ambient light sensor to make an ambient light reading. At the same time, the transmission of coating 4-126 may be sufficiently low that coating 4-126 helps reduce the visibility of component 4-104 from the exterior of device 4-10.

As these examples demonstrate, regions of display 4-14F that overlap optical components such as component 4-104 of FIG. 4-5 may be provided with optical component window structures in layer 4-92 and/or shroud 4-100 that help accommodate the optical component.

If desired, shroud 4-100 may be provided with a through-hole opening to accommodate an overlapped optical component. As shown in FIG. 4-6, for example, shroud 4-100 may contain one or more sublayers (e.g., a trim, a canopy, and/or other layers). Through-hole opening 4-130 may pass from the inner surface of shroud 4-100 to the outer surface of shroud 4-100. Opening 4-130 may be aligned with optical component 104. Component 104 may be mounted behind opening 4-130 and/or may be partly or fully receive within opening 4-130 as shown in FIG. 4-6. This allows light to be emitted and/or received by component 104 without being blocked by shroud 4-100.

In the illustrative configuration of FIG. 4-7, shroud 4-100 also contains one more sublayers (e.g., a trim, a canopy, and/or other layers). As shown in FIG. 4-7, a through-hole opening may formed in shroud 4-100 in alignment with optical component 104 and may be filled with optical component window member 4-132 (e.g., a glass or polymer member or a window structure formed from other material and/or combinations of these materials). Optical component window member 4-132 has optical characteristics (e.g., light transmission, reflection, absorption, haze, etc.) that allow component 4-104 to transmit and/or receive light satisfactorily through region 4-118. As an example, member 4-130 may be formed from glass that is transparent to infrared light and that is opaque or transparent to visible light.

As described in connection with FIGS. 4-2 and 4-3, there may be numerous optical components such as component 4-104 in inactive area IA. Each optical component may potentially have a different type of optical component window structure in shroud 4-100 and/or layer 4-92 to accommodate that component. For example, some areas of shroud 4-100 may have openings that receive components as described in connection with FIG. 4-6, other areas of shroud 4-100 may have inserted optical window member such as member 4-132 of FIG. 4-7, and/or other areas of shroud 4-100 may have partial shroud openings (e.g., non-through-hole recesses) such as opening 4-120 of FIG. 4-5 (which may optionally be covered with a layer such as coating 4-126 to modify the optical properties of shroud 4-100).

FIG. 4-8 is a cross-sectional side view of a portion of a head-mounted device with a fully or partly transparent shroud covering the front face of the device. As shown in FIG. 4-8, head-mounted device 4-10 may include display panel 4-14P for forward-facing display 4-14. Panel 4-14P may be a lenticular display (e.g., an autostereoscopic display with lenticular lenses 4-14P' configured to display three-dimensional images for a user).

In the arrangement of FIG. 4-8, display cover layer 92 has inner and outer surfaces with compound curvature in inactive area IA (e.g., a ring-shaped area running along the periphery of layer 4-92). The inner and outer surfaces of display cover layer 4-92 in active area AA may also have compound curvature or one or both of these surfaces may be developable surfaces. In the example of FIG. 4-8, the inner and outer surfaces of layer 4-92 have compound curvature in both inactive area IA and active area AA (e.g., these surfaces may be free of any developable surfaces), which may help provide device 4-10 with an attractive appearance.

The shroud of device 4-10 of FIG. 4-8 includes a shroud trim 4-100A and shroud canopy 4-100B. Trim 4-100A may have a ring shape and may extend around the periphery of display 14. Canopy 4-100B, which may be formed from a material such as polymer, may have an outline equal to or nearly equal to that of display cover layer 4-92 and may cover substantially the entire front face of device 4-10. With this type of arrangement, shroud canopy 4-100B overlaps all of display panel 4-14P. The polymer that makes up canopy 4-100B may have a bulk tint (e.g., a colorant such as dye and/or pigment that provides canopy 4-100B with a desired optical transmission characteristic). For example, canopy 4-100B may be tinted so that canopy 4-100B exhibits a visible light transmission of 30-80%, at least 20%, at least 40%, less than 95%, less than 90%, less than 85%, less than 75%, 4-60%, or other suitable amount. By configuring canopy 10B to exhibit partial light transmission (e.g., 30-80% or other suitable value), canopy 4-100B may help visually hide internal components such as lenses 4-14P' and other structures of display 4-14P from view (e.g., when display 4-14P is not in use).

The inner surface of canopy 4-100B may also be provided with an optical layer such as optical layer (optical film) 4-146. Layer 4-146 may have texture and/or light-scattering particles that create haze. The haze may help hide the structures of display panel 4-14P from view from the exterior of device 4-10. Layer 4-146 may also have microlouvers or other features that help suppress off-axis light transmission (e.g., layer 4-146 may have privacy structures that reduce light transmission for light rays that are not parallel to the Y axis). Because layer 4-146 may contain haze and/or privacy structures, layer 4-146 may sometimes be referred to as a privacy layer, a haze layer, and/or a privacy and haze layer.

In an illustrative configuration, layer 4-146 may have a flexible substrate layer covered with a hazy coating. The hazy coating may be a pad-printed polymer coating that contains embedded light-scattering particles (e.g., inorganic light-scattering particles such as titanium oxide particles, etc.). The flexible substrate layer may be a privacy film such as a microlouver film or other privacy layer that prevents off-axis (away from the Y axis) viewing of display panel 4-14P).

Haze for layer 4-146 may be provided using any suitable haze structures (e.g., a coating of hazy polymer having a thickness of 3-10 microns on a flexible privacy film or other substrate, a laminated hazy film, or other layer that exhibits 3%-40% haze or other suitable value, sometimes referred to as a haze coating). Haze may be provided by embedded light-scattering particles and/or surface texture (e.g., texture in layer 4-146 or optionally texture on the surface of canopy 4-100B). The haze provided by the hazy coating of layer 4-146 and/or other haze structures is preferably provided sufficiently close to display 4-14P that the resolution of display 4-14P is not significantly affected. At the same time, the presence of the haze (e.g., the hazy coating of layer 4-146) may help hide lenses and other structures in layer 4-14P from view when not in use.

Device 4-10 may have an air gap between display panel 4-14P and canopy 4-100B (e.g., an air gap such as air gap 4-144 may be present between the inwardly facing side of canopy 4-100B and any coatings and/or films on this side of canopy 4-100B such as haze layer 4-146 and the opposing upper surface of display panel 4-14P (and lenses 4-14P' and the pixels on panel 4-14P). The presence of air gap 4-144 may help ensure that lenses 4-14P' operate satisfactorily. Bracket 4-156 may help support display panel 4-14P.

To help hide internal components from view, an opaque masking layer such as layer BM-1 may be formed on the inner surface of display cover layer 4-92 in inactive area IA. Adhesive 4-122 may attach layer 4-92 to the edge of canopy 4-100B. Additional opaque masking material (see, e.g., canopy opaque masking layer BM-2) may be formed on the inner surface of canopy 4-100B in inactive area IA. Adhesive 4-114 may be used to attach shroud trim 4-100A to shroud canopy 4-100B. Adhesive 4-124 may be used to attach shroud trim 4-100A to housing portion 4-16M. Adhesive 14-60 may be used to attach bracket 4-156 (which is attached with adhesive to the rear of panel 4-14P) to canopy 4-100B.

In the example of FIG. 4-8, outer surface 4-148 and inner surface 4-150 of display cover layer 4-92 have compound curvature in inactive area IA and in active area AA. Outer surface 4-152 and opposing inner surface coil 4-54 of shroud canopy 4-100B may have matching compound curvature in inactive area IA. In active area AA, outer surface 4-152 and inner surface 1 coil 4-54 of shroud canopy 4-100B may be developable surfaces (e.g., surfaces without compound curvature that exhibit a curved cross-sectional profile that bends about a single bend axis such as axis 4-142). Axis 4-142 is an axis that runs parallel to the Z axis in this example. Display panel 4-14P may exhibit the same amount of bending about axis 4-142 and may also be characterized by a developable surface (e.g., the pixel array on the outer surface of panel 4-14P may have a developable surface).

The amount of bending of canopy 4-100B and the corresponding amount of bending of display panel 4-14P about axis 4-142 may be selected to help device 4-10 conform to the curved shape of a user's face.

In the illustrative configuration of FIG. 4-8, canopy 4-100B does not have any areas of compound curvature that overlap display panel 4-14P. Rather, the portion of canopy 4-100B that overlaps panel 4-14P has inner and outer developable surfaces. If desired, one or both of surfaces 4-152 and 1 coil 4-54 may have compound curvature. For example, outer surface 4-152 may have compound curvature and may be configured to establish a uniform thickness for air gap 4-140 under some or all of inner surface 4-150 of layer 4-92. In the example of FIG. 4-9, there is an air gap 4-140 of uneven thickness between layer 92 and canopy 4-100B.

Bracket 4-156 may be formed from a metal sheet or other support structure and may be characterized by inner and outer surfaces that are developable surfaces (e.g., surfaces that bend about axis 4-142 and that do not contain areas of compound curvature). By avoiding compound curvature in the structures that support and immediately overlap display panel 4-14P, display panel 4-14P may be formed from a bent flexible substrate such as a polyimide substrate that bends about axis 4-142 without risk of creating wrinkles or other artifacts of the type that might be introduced if panel 4-14P had areas of compound curvature.

The shroud and other structures of device 4-10 of FIG. 4-8 (e.g., the opaque masking layer coatings such as layers BM-1 and BM-2 which may be, for example, black ink layers) may be configured to form optical windows for optical components 4-104.

FIG. 4-9 shows how opaque masking layer BM-2 on canopy 4-100B may have a window opening that is filled with a coating layer such as coating 4-170. Optical component 4-104 (e.g., a flicker sensor, an ambient light sensor, and/or other photodetector) may be aligned with the window opening. A transparent canopy portion may overlap this window opening or a canopy opening may overlap this window opening. Layer BM-2 may be opaque, which helps prevent internal components in device 4-10 from being viewed from the exterior of device 4-10. The presence of the opening in layer BM-2 allows optical component 4-104 to operate satisfactorily (e.g., to receive and measure ambient light). Coating 4-170 may be configured to allow component 104 to operate, while helping to visually hide component 4-104. As an example, coating 4-170 may be formed from a layer of ink with a visible light transmission of 2-25%, at least 1%, at least 2%, at least 4%, less than 80%, less than 30%, or other suitable amount, whereas layer BM-2 may have a visible transmission of less than 2%, less than 1%, or less than 0.5% (as examples).

FIG. 4-10 is a cross-sectional side view of another illustrative head-mounted device optical component mounting arrangement. The arrangement of FIG. 4-10 uses shroud through-hole openings in trim 4-100A and canopy 4-100B. These through-hole openings are aligned with an opening in display opaque masking layer BM-1 (and are optionally aligned with a corresponding opening in canopy opaque masking layer BM-2). An optional coating layer such as layer 4-164 may cover the optical window formed from these openings. Layer 4-164 and the other openings of FIG. 4-11 may be aligned with optical component 4-104, which may be mounted behind the shroud and/or which may have portions protruding into the through-hole openings of the shroud. In a first illustrative configuration, component 4-104 of FIG. 4-10 is an infrared illuminator (e.g., an infrared light-emitting diode). In this type of arrangement, coating layer 4-164 may be formed from a layer of ink, a thin-film interference filter, or other filter layer that blocks visible light and that is transparent to infrared light (e.g., a visible-light-blocking-and-infrared-light-transmitting filter layer). In a second illustrative configuration, component 4-104 of FIG. 4-10 is a camera (e.g., a visible pass-through camera, an infrared camera, and/or other camera operating at visible and/or infrared wavelengths). In this arrangement, coating 4-164 may be omitted (to pass visible and/or infrared light), may be configured to form an antireflection coating, and/or may otherwise be configured to operate with the camera.

FIG. 4-11 is a cross-sectional side view of an illustrative head-mounted device optical component mounting arrangement with an optical component window formed from a transparent window member. Transparent window member 4-166 (e.g., a layer of glass or polymer) may be mounted in through-hole openings in trim 4-100A and canopy 4-100B and may be aligned with optical component 4-104 and an opening in opaque masking layer BM-1 on layer 4-92 (and, if desired, may be aligned with an opening in opaque masking layer BM-2 on canopy 4-100B). Filter coating 4-168 may be provided on window member 4-166. In an illustrative configuration, component 4-104 of FIG. 4-11 is a three-dimensional camera such as a time-of-flight camera or a structured light camera and may operate at infrared wavelengths. Filter 4-168 in this type of arrangement may be transparent to infrared light and may be transparent to visible light or may be opaque to visible light (e.g., filter 4-168 may be an infrared-light-transparent-and-visible-light-blocking filter). Filter coating 4-168 may be formed from ink, from a thin-film interference filter, or other filter structures.

The presence of window member 4-166, which may be configured to exhibit relatively small amounts of optical distortion, may help enhance the optical performance of component 4-104. If desired, optical-component-compatible surface areas for an optical component window for component 4-104 may be formed directly in canopy 4-100B (e.g., so that canopy 4-100B may overlap component 4-104 without forming a through-hole opening in canopy 4-100B).

4.1: System with Cover Layer Sealing Structures

A head-mounted device may include a head-mounted support structure that allows the device to be worn on the head of a user. The head-mounted device may have displays that are supported by the head-mounted support structure for presenting a user with visual content. The displays may include rear-facing displays that present images to eye boxes at the rear of the head-mounted support structure. The displays may also include a forward-facing display. The forward-facing display may be mounted to the front of the head-mounted support structure and may be viewed by the user when the head-mounted device is not being worn on the user's head. The forward-facing display, which may sometimes be referred to as a publicly viewable display, may also be viewable by other people in the vicinity of the head-mounted device.

Optical components such as image sensors and other light sensors may be provided in the head-mounted device. In an illustrative configuration, optical components are mounted under peripheral portions of a display cover layer that protects the forward-facing display. The display cover layer, or other layers within the head-mounted device, may be formed from materials, such as glass, and, laminates, such as plastic laminates, may be formed on top and bottom surfaces of the cover layer. To protect the edges of the cover layer, encapsulation material may be coupled to the edge surface, or the head-mounted device housing structures may be modified.

FIGS. 4.1-1 is a side view of an illustrative head-mounted electronic device. As shown in FIGS. 4.1-1, head-mounted device 4.1-10 may include head-mounted support structure 4.1-26. Support structure 4.1-26 may have walls or other structures that separate an interior region of device 4.1-10 such as interior region 4.1-42 from an exterior region surrounding device 4.1-10 such as exterior region 4.1-44. Electrical components 4.1-40 (e.g., integrated circuits, sensors, control circuitry, light-emitting diodes, lasers, and other light-emitting devices, other control circuits and input-output devices, etc.) may be mounted on printed circuits and/or other structures within device 4.1-10 (e.g., in interior region 4.1-42).

To present a user with images for viewing from eye boxes such as eye boxes 4.1-34, device 4.1-10 may include rear-facing displays such as displays 4.1-14R, which may have associated lenses that focus images for viewing in the eye boxes. These components may be mounted in optical modules (e.g., a lens barrel) to form respective left and right optical systems. There may be, for example, a left rear-facing display for presenting an image through a left lens to a user's left eye in a left eye box and a right rear-facing display for presenting an image to a user's right eye in a right eye box. The user's eyes are located in eye boxes 4.1-34 at rear side R of device 4.1-10 when structure 4.1-26 rests against the outer surface of the user's face.

Support structure 4.1-26 may include a main support structure (sometimes referred to as a main portion or housing). The main housing support structure may extend from front side F of device 4.1-10 to opposing rear side R of device 4.1-10. On rear side R, support structure 4.1-26 may have cushioned structures to enhance user comfort as support structure 4.1-26 rests against the user's face. If desired, support structure 4.1-26 may include optional head straps and/or other structures that allow device 4.1-10 to be worn on a head of a user.

Device 4.1-10 may have a publicly viewable front-facing display such as display 4.1-14F that is mounted on front side F of support structure 4.1-26. Display 4.1-14F may be viewable to the user when the user is not wearing device 4.1-10 and/or may be viewable by others in the vicinity of device 4.1-10. Display 4.1-14F may, as an example, be visible on front side F of device 4.1-10 by an external viewer who is viewing device 4.1-10 from front side F.

A schematic diagram of an illustrative system that may include a head-mounted device is shown in FIG. 4.1-2. As shown in FIG. 4.1-2, system 4.1-8 may have one or more electronic devices 4.1-10. Devices 4.1-10 may include a head-mounted device (e.g., device 4.1-10 of FIG. 4.1-1), accessories such as controllers and headphones, computing equipment (e.g., a cellular telephone, tablet computer, laptop computer, desktop computer, and/or remote computing equipment that supplies content to a head-mounted device), and/or other devices that communicate with each other.

Each electronic device 4.1-10 may have control circuitry 4.1-12. Control circuitry 4.1-12 may include storage and processing circuitry for controlling the operation of device 4.1-10. Circuitry 4.1-12 may include storage such as hard disk drive storage, nonvolatile memory (e.g., electrically-programmable-read-only memory configured to form a solid-state drive), volatile memory (e.g., static or dynamic random-access-memory), etc. Processing circuitry in control circuitry 4.1-12 may be based on one or more microprocessors, microcontrollers, digital signal processors, baseband processors, power management units, audio chips, graphics processing units, application specific integrated circuits, and other integrated circuits. Software code may be stored on storage in circuitry 4.1-12 and run on processing circuitry in circuitry 4.1-12 to implement control operations for device 4.1-10 (e.g., data gathering operations, operations involving the adjustment of the components of device 4.1-10 using control signals, etc.). Control circuitry 4.1-12 may include wired and wireless communications circuitry. For example, control circuitry 4.1-12 may include radio-frequency transceiver circuitry such as cellular telephone transceiver circuitry, wireless local area network transceiver circuitry (e.g., WiFi® circuitry), millimeter wave transceiver circuitry, and/or other wireless communications circuitry.

During operation, the communications circuitry of the devices in system 4.1-8 (e.g., the communications circuitry of control circuitry 4.1-12 of device 4.1-10) may be used to support communication between the electronic devices. For example, one electronic device may transmit video data, audio data, control signals, and/or other data to another electronic device in system 4.1-8. Electronic devices in system 4.1-8 may use wired and/or wireless communications circuitry to communicate through one or more communications networks (e.g., the internet, local area networks, etc.). The communications circuitry may be used to allow data to be received by device 4.1-10 from external equipment (e.g., a tethered computer, a portable device such as a handheld device or laptop computer, online computing equipment such as a remote server or other remote computing equipment, or other electrical equipment) and/or to provide data to external equipment.

Each device 4.1-10 in system 4.1-8 may include input-output devices 4.1-22. Input-output devices 4.1-22 may be used to allow a user to provide device 4.1-10 with user input.

Input-output devices 4.1-22 may also be used to gather information on the environment in which device 4.1-10 is operating. Output components in devices 4.1-22 may allow device 4.1-10 to provide a user with output and may be used to communicate with external electrical equipment.

As shown in FIG. 4.1-2, input-output devices 4.1-22 may include one or more displays such as displays 4.1-14. Displays 4.1-14 may include rear facing displays such as display 4.1-14R of FIG. 4.1-1. Device 4.1-10 may, for example, include left and right components such as left and right scanning mirror display devices or other image projectors, liquid-crystal-on-silicon display devices, digital mirror devices, or other reflective display devices, left and right display panels based on light-emitting diode pixel arrays (e.g., thin-film organic light-emitting displays with polymer or semiconductor substrates such as silicon substrates or display devices based on pixel arrays formed from crystalline semiconductor light-emitting diode dies), liquid crystal display panels, and/or or other left and right display devices that provide images to left and right eye boxes for viewing by the user's left and right eyes, respectively. Display components such as these (e.g., a thin-film organic light-emitting display with a flexible polymer substrate or a display based on a pixel array formed from crystalline semiconductor light-emitting diode dies on a flexible substrate) may also be used in forming a forward-facing display for device 4.1-10 such as forward-facing display 4.1-14F of FIG. 4.1-1 (sometimes referred to as a front-facing display, front display, or publicly viewable display).

During operation, displays 4.1-14 (e.g., displays 4.1-14R and/or 4.1-14F) may be used to display visual content for a user of device 4.1-10 (e.g., still and/or moving images including pictures and pass-through video from camera sensors, text, graphics, movies, games, and/or other visual content). The content that is presented on displays 4.1-14 may, for example, include virtual objects and other content that is provided to displays 4.1-14 by control circuitry 4.1-12. This virtual content may sometimes be referred to as computer-generated content. Computer-generated content may be displayed in the absence of real-world content or may be combined with real-world content. In some configurations, a real-world image may be captured by a camera (e.g., a forward-facing camera, sometimes referred to as a front-facing camera) and computer-generated content may be electronically overlaid on portions of the real-world image (e.g., when device 4.1-10 is a pair of virtual reality goggles).

Input-output circuitry 4.1-22 may include sensors 4.1-16. Sensors 4.1-16 may include, for example, three-dimensional sensors (e.g., three-dimensional image sensors such as structured light sensors that emit beams of light and that use two-dimensional digital image sensors to gather image data for three-dimensional images from dots or other light spots that are produced when a target is illuminated by the beams of light, binocular three-dimensional image sensors that gather three-dimensional images using two or more cameras in a binocular imaging arrangement, three-dimensional lidar (light detection and ranging) sensors, sometimes referred to as time-of-flight cameras or three-dimensional time-of-flight cameras, three-dimensional radio-frequency sensors, or other sensors that gather three-dimensional image data), cameras (e.g., two-dimensional infrared and/or visible digital image sensors), gaze tracking sensors (e.g., a gaze tracking system based on an image sensor and, if desired, a light source that emits one or more beams of light that are tracked using the image sensor after reflecting from a user's eyes), touch sensors, capacitive proximity sensors, light-based (optical) proximity sensors, other proximity sensors, force sensors (e.g., strain gauges, capacitive force sensors, resistive force sensors, etc.), sensors such as contact sensors based on switches, gas sensors, pressure sensors, moisture sensors, magnetic sensors, audio sensors (microphones), ambient light sensors, flicker sensors that gather temporal information on ambient lighting conditions such as the presence of a time-varying ambient light intensity associated with artificial lighting, microphones for gathering voice commands and other audio input, sensors that are configured to gather information on motion, position, and/or orientation (e.g., accelerometers, gyroscopes, compasses, and/or inertial measurement units that include all of these sensors or a subset of one or two of these sensors), and/or other sensors.

User input and other information may be gathered using sensors and other input devices in input-output devices 4.1-22. If desired, input-output devices 4.1-22 may include other devices 4.1-24 such as haptic output devices (e.g., vibrating components), light-emitting diodes, lasers, and other light sources (e.g., light-emitting devices that emit light that illuminates the environment surrounding device 4.1-10 when ambient light levels are low), speakers such as ear speakers for producing audio output, circuits for receiving wireless power, circuits for transmitting power wirelessly to other devices, batteries and other energy storage devices (e.g., capacitors), joysticks, buttons, and/or other components.

As described in connection with FIG. 4.1-1, electronic device 4.1-10 may have head-mounted support structures such as head-mounted support structure 4.1-26 (e.g., head-mounted housing structures such as housing walls, straps, etc.). The head-mounted support structure may be configured to be worn on a head of a user (e.g., against the user's face covering the user's eyes) during operation of device 4.1-10 and may support displays 4.1-14, sensors 4.1-16, other components 4.1-24, other input-output devices 4.1-22, and control circuitry 4.1-12 (see, e.g., components 4.1-40 and displays 4.1-14R and 4.1-14F of FIG. 4.1-1, which may include associated optical modules).

FIG. 4.1-3 is a front view of device 4.1-10 in an illustrative configuration in which device 4.1-10 has a publicly viewable display such as forward-facing display 4.1-14F. As shown in FIG. 4.1-3, support structure 4.1-26 of device 4.1-10 may have right and left portions on either side of nose bridge 4.1-90. Nose bridge 4.1-90 may be a curved exterior surface that is configured to receive and rest upon a user's nose to help support housing 4.1-26 on the head of the user.

Display 4.1-14F may have an active area such as active area AA that is configured to display images and an inactive area IA that does not display images. The outline of active area AA may be rectangular, rectangular with rounded corners, may have teardrop shaped portions on the left and right sides of device 4.1-10, may have a shape with straight edges, a shape with curved edges, a shape with a peripheral edge that has both straight and curved portions, and/or other suitable outlines. As shown in FIG. 4.1-3, active area AA may have a curved recessed portion at nose bridge 4.1-90. The presence of the nose-shaped recess in active area AA may help fit active area AA within the available space of housing 4.1-26 without overly limiting the size of active area AA.

Active area AA contains an array of pixels. The pixels may be, for example, light-emitting diode pixels formed from thin-film organic light-emitting diodes or crystalline semiconductor light-emitting diode dies (sometimes referred to as micro-light-emitting diodes) on a flexible display panel substrate. Configurations in which display 4.1-14F uses other display technologies may also be used, if desired. Illustrative arrangements in which display 4.1-14 is formed from a light-emitting diode display such as an organic light-emitting diode display that is formed on a flexible substrate (e.g., a substrate formed from a bendable layer of polyimide or a sheet of other flexible polymer) may sometimes be described herein as an example. The pixels of active area AA may be formed on a display device such as a display panel (e.g., a flexible organic light-emitting diode display panel). In some configurations, the outline of active area AA may have a peripheral edge that contains straight segments or a combination of straight and curved segments. Configurations in which the entire outline of active area AA is characterized by a curved peripheral edge may also be used.

Display 4.1-14F may have an inactive area such as inactive area IA that is free of pixels and that does not display images. Inactive area IA may form an inactive border region that runs along one more portions of the peripheral edge of active area AA. In the illustrative configuration of FIG. 4.1-3, inactive area IA has a ring shape that surrounds active area AA and forms an inactive border.

In this type of arrangement, the width of inactive area IA may be relatively constant and the inner and outer edges of area IA may be characterized by straight and/or curved segments or may be curved along their entire lengths. For example, the outer edge of area IA (e.g., the periphery of display 4.1-14F) may have a curved outline that runs parallel to the curved edge of active area AA.

In some configurations, device 4.1-10 may operate with other devices in system 4.1-8 (e.g., wireless controllers and other accessories). These accessories may have magnetic sensors that sense the direction and intensity of magnetic fields. Device 4.1-10 may have one or more electromagnets configured to emit a magnetic field. The magnetic field can be measured by the wireless accessories near device 4.1-10, so that the accessories can determine their orientation and position relative to device 4.1-10. This allows the accessories to wirelessly provide device 4.1-10 with real-time information on their current position, orientation, and movement so that the accessories can serve as wireless controllers. The accessories may include wearable devices, handled devices, and other input devices.

In an illustrative configuration, device 4.1-10 may have a coil that runs around the perimeter of display 4.1-14F (e.g., under inactive area IA along the periphery of active area AA). The coil may have any suitable number of turns (e.g., 1-10, at least 2, at least 5, at least 10, 10-50, fewer than 100, fewer than 25, fewer than 6, etc.). These turns may be formed from metal traces on a substrate, may be formed from wire, and/or may be formed from other conductive lines. During operation, control circuitry 4.1-12 may supply the coil with an alternating-current (AC) drive signal. The drive signal may have a frequency of at least 1 kHz, at least 10 kHz, at least 100 kHz, at least 1 MHz, less than 10 MHz, less than 3 MHz, less than 300 kHz, or less than 30 kHz (as examples). As AC current flows through the coil a corresponding magnetic field is produced in the vicinity of device 4.1-10. Electronic devices such as wireless controllers with magnetic sensors that are in the vicinity of device 4.1-10 may use the magnetic field as a reference so that the wireless controllers can determine their orientation, position, and/or movement while being moved relative to device 4.1-10 to provide device 4.1-10 with input.

Consider, as an example, a handheld wireless controller that is used in controlling the operation of device 4.1-10. During operation, device 4.1-10 uses the coil to emit a magnetic field. As the handheld wireless controller is moved, the magnetic sensors of the controller can monitor the location of the controller and the movement of the controller relative to device 4.1-10 by monitoring the strength, orientation, and change to the strength and/or orientation of the magnetic field emitted by the coil as the controller is moved through the air by the user. The electronic device can then wirelessly transmit information on the location and orientation of the controller to device 4.1-10. In this way, a handheld controller, wearable controller, or other external accessory can be manipulated by a user to provide device 4.1-10 with air gestures, pointing input, steering input, and/or other user input.

Device 4.1-10 may have components such as optical components (e.g., optical sensors among sensors 4.1-16 of FIG. 4.1-2). These components may be mounted in any suitable location on head-mounted support structure 4.1-26 (e.g. on a head strap, on housing 4.1-26, etc.). Optical components and other components may face rearwardly (e.g., when mounted on the rear face of device 4.1-10), may face to the side (e.g. to the left or right), may face downwardly or upwardly, may face to the front of device 4.1-10 (e.g., when mounted on the front face of device 4.1-10), may be mounted so as to point in any combination of these directions (e.g., to the front, to the right, and downward) and/or may be mounted in other suitable orientations. In an illustrative configuration, at least some of the components of device 4.1-10 are mounted so as to face outwardly to the front (and optionally to the sides and/or up and down). For example, forward-facing cameras for pass-through video may be mounted on the left and right sides of the front of device 4.1-10 in a configuration in which the cameras diverge slightly along the horizontal dimension so that the fields of view of these cameras overlap somewhat while capturing a wide-angle image of the environment in front of device 4.1-10. The captured image may, if desired, include portions of the user's surroundings that are below, above, and to the sides of the area directly in front of device 4.1-10.

To help hide components such as optical components from view from the exterior of device 4.1-10, it may be desirable to cover some or all of the components with cosmetic covering structures. The covering structures may include transparent portions (e.g., optical component windows) that are characterized by sufficient optical transparency to allow overlapped optical components to operate satisfactorily. For example, an ambient light sensor may be covered with a layer that appears opaque to an external viewer to help hide the ambient light sensor from view, but that allows sufficient ambient light to pass to the ambient light sensor for the ambient light sensor to make a satisfactory ambient light measurement. As another example, an optical component that emits infrared light may be overlapped with a visibly opaque material that is transparent to infrared light.

In an illustrative configuration, optical components for device 4.1-10 may be mounted in inactive area IA of FIG. 4.1-3 and cosmetic covering structures may be formed in a ring shape overlapping the optical components in inactive area IA. Cosmetic covering structures may be formed from ink, polymer structures, structures that include metal, glass, other materials, and/or combinations of these materials. In an illustrative configuration, a cosmetic covering structure may be formed from a ring-shaped member having a footprint that matches the footprint of inactive area IA. If, for example, active area AA has left and right portions with teardrop shapes, the ring-shaped member may have curved edges that follow the curved periphery of the teardrop-shaped portions of active area AA. The ring-shaped member may be formed from one or more polymer structures (e.g., the ring-shaped member may be formed from a polymer ring). Because the ring-shaped member can help hide overlapped components from view, the ring-shaped member may sometimes be referred to as a shroud or ring-shaped shroud member. The outward appearance of the shroud or other cosmetic covering structures may be characterized by a neutral color (white, black, or gray) or a non-neutral color (e.g., blue, red, green, gold, rose gold, etc.).

Display 4.1-14F may, if desired, have a protective display cover layer. The cover layer may overlap active area AA and inactive area IA (e.g., the entire front surface of device 4.1-10 as viewed from front F of FIG. 4.1-1 may be covered by the cover layer). The cover layer, which may sometimes be referred to as a housing wall or transparent housing wall, may have a rectangular outline, an outline with teardrop portions, an oval outline, or other shape with curved and/or straight edges.

The cover layer may be formed from a transparent material such as glass, polymer, transparent crystalline material such as sapphire, clear ceramic, other transparent materials, and/or combinations of these materials. As an example, a protective display cover layer for display 4.1-14F may be formed from safety glass (e.g., laminated glass that includes a clear glass layer with a laminated polymer film). Optional coating layers may be applied to the surfaces of the display cover layer. If desired, the display cover layer may be chemically strengthened (e.g., using an ion-exchange process to create an outer layer of material under compressive stress that resists scratching). In some configurations, the display cover layer may be formed from a stack of two or more layers of material (e.g., first and second structural glass layers, a rigid polymer layer coupled to a glass layer or another rigid polymer layer, etc.) to enhance the performance of the cover layer.

In active area AA, the display cover layer may overlap the pixels of display panel 4.1-14P. The display cover layer in active area AA is preferably transparent to allow viewing of images presented on display panel 4.1-14P. In inactive area IA, the display cover layer may overlap the ring-shaped shroud or other cosmetic covering structure. The shroud and/or other covering structures (e.g., opaque ink coatings on the inner surface of the display cover layer and/or structures) may be sufficiently opaque to help hide some or all of the optical components in inactive area IA from view. Windows may be provided in the shroud or other cosmetic covering structures to help ensure that the optical components that are overlapped by these structures operate satisfactorily. Windows may be formed from holes, may be formed from areas of the shroud or other cosmetic covering structures that have been locally thinned to enhance light transmission, may be formed from window members with desired light transmission properties that have been inserted into mating openings in the shroud, and/or may be formed from other shroud window structures.

In the example of FIG. 4.1-3, device 4.1-10 includes optical components such as optical components 4.1-60, 4.1-62, 4.1-64, 4.1-66, 4.1-68, 4.1-70, 4.1-72, 4.1-74, 4.1-76, 4.1-78, and 4.1-80 (as an example). Each of these optical components (e.g., optical sensors selected from among sensors 4.1-16 of FIG. 4.1-2, light-emitting devices, etc.) may be configured to detect light and, if desired to emit light (e.g., ultraviolet light, visible light, and/or infrared light).

In an illustrative configuration, optical component 4.1-60 may sense ambient light (e.g., visible ambient light). In particular, optical component 4.1-60 may have a photodetector that senses variations in ambient light intensity as a function of time. If, as an example, a user is operating in an environment with an artificial light source, the light source may emit light at a frequency associated with its source of wall power (e.g., alternating-current mains power at 4.1-60 Hz). The photodetector of component 4.1-60 may sense that the artificial light from the artificial light source is characterized by 60 Hz fluctuations in intensity. Control circuitry 4.1-12 can use this information to adjust a clock or other timing signal associated with the operation of image sensors in device 4.1-10 to help avoid undesired interference between the light source frequency and the frame rate or other frequency associated with image capture operations. Control circuitry 4.1-12 can also use measurements from component 4.1-60 to help identify the presence of artificial lighting and the type of artificial lighting that is present. In this way, control circuitry 4.1-12 can detect the presence of lights such as fluorescent lights or other lights with known non-ideal color characteristics and can make compensating color cast adjustments (e.g., white point adjustments) to color-sensitive components such as cameras and displays. Because optical component 4.1-60 may measure fluctuations in light intensity, component 4.1-60 may sometimes be referred to as a flicker sensor or ambient light frequency sensor.

Optical component 4.1-62 may be an ambient light sensor. The ambient light sensor may include one or more photodetectors. In a single-photodetector configuration, the ambient light sensor may be a monochrome sensor that measures ambient light intensity. In a multi-photodetector configuration, each photodetector may be overlapped by an optical filter that passes a different band of wavelengths (e.g. different visible and/or infrared passbands). The optical filter passbands may overlap at their edges. This allows component 4.1-62 to serve as a color ambient light sensor that measures both ambient light intensity and ambient light color (e.g., by measuring color coordinates for the ambient light). During operation of device 4.1-10, control circuitry 4.1-12 can take action based on measured ambient light intensity and color. As an example, the white point of a display or image sensor may be adjusted or other display or image sensor color adjustments may be made based on measured ambient light color. The intensity of a display may be adjusted based on light intensity. For example, the brightness of display 4.1-14F may be increased in bright ambient lighting conditions to enhance the visibility of the image on the display and the brightness of display 4.1-14F may be decreased in dim lighting conditions to conserve power. Image sensor operations and/or light source operations may also be adjusted based on ambient light readings.

The optical components in active area IA may also include components along the sides of device 4.1-10 such as components 4.1-80 and 4.1-64. Optical components 4.1-80 and 4.1-64 may be pose-tracking cameras that are used to help monitor the orientation and movement of device 4.1-10. Components 4.1-80 and 4.1-64 may be visible light cameras (and/or cameras that are sensitive at visible and infrared wavelengths) and may, in conjunction with an inertial measurement unit, form a visual inertial odometry (VIO) system.

Optical components 4.1-78 and 4.1-66 may be visible-light cameras that capture real-time images of the environment surrounding device 4.1-10. These cameras, which may sometimes be referred to as scene cameras or pass-through-video cameras, may capture moving images that are displayed in real time to displays 4.1-14R for viewing by the user when the user's eyes are located in eye boxes 4.1-34 at the rear of device 4.1-10. By displaying pass-through images (pass-through video) to the user in this way, the user may be provided with real-time information on the user's surroundings. If desired, virtual content (e.g. computer-generated images) may be overlaid over some of the pass-through video. Device 4.1-10 may also operate in a non-pass-through-video mode in which components 4.1-78 and 4.1-66 are turned off and the user is provided only with movie content, game content, and/or other virtual content that does not contain real-time real-world images.

Input-output devices 4.1-22 of device 4.1-10 may gather user input that is used in controlling the operation of device 4.1-10. As an example, a microphone in device 4.1-10 may gather voice commands. Buttons, touch sensors, force sensors, and other input devices may gather user input from a user's finger or other external object that is contacting device 4.1-10. In some configurations, it may be desirable to monitor a user's hand gestures or the motion of other user body parts. This allows the user's hand locations or other body part locations to be replicated in a game or other virtual environment and allows the user's hand motions to serve as hand gestures (air gestures) that control the operation of device 4.1-10. User input such as hand gesture input can be captured using cameras that operate at visible and infrared wavelengths such as tracking cameras (e.g., optical components 4.1-76 and 4.1-68). Tracking cameras such as these may also track fiducials and other recognizable features on controllers and other external accessories (additional devices 4.1-10 of system 4.1-8) during use of these controllers in controlling the operation of device 4.1-10. If desired, tracking cameras can help determine the position and orientation of a handheld controller or wearable controller that senses its location and orientation by measuring the magnetic field produced by coil 4.1-54. The use of tracking cameras may therefore help track hand motions and controller motions that are used in moving pointers and other virtual objects being displayed for a user and can otherwise assist in controlling the operation of device 4.1-10.

Tracking cameras may operate satisfactorily in the presence of sufficient ambient light (e.g., bright visible ambient lighting conditions). In dim environments, supplemental illumination may be provided by supplemental light sources such as supplemental infrared light sources (e.g., optical components 4.1-82 and 4.1-84). The infrared light sources may each include one or more light-emitting devices (light-emitting diodes or lasers) and may each be configured to provide fixed and/or steerable beams of infrared light that serve as supplemental illumination for the tracking cameras. If desired, the infrared light sources may be turned off in bright ambient lighting conditions and may be turned on in response to detection of dim ambient lighting (e.g., using the ambient light sensing capabilities of optical component 4.1-62).

Three-dimensional sensors in device 4.1-10 may be used to perform biometric identification operations (e.g., facial identification for authentication), may be used to determine the three-dimensional shapes of objects in the user's environment (e.g., to map the user's environment so that a matching virtual environment can be created for the user), and/or to otherwise gather three-dimensional content during operation of device 4.1-10. As an example, optical components 4.1-74 and 4.1-70 may be three-dimensional structured light image sensors. Each three-dimensional structured light image sensor may have one or more light sources that provide structured light (e.g., a dot projector that projects an array of infrared dots onto the environment, a structured light source that produces a grid of lines, or other structured light component that emits structured light). Each of the three-dimensional structured light image sensors may also include a flood illuminator (e.g., a light-emitting diode or laser that emits a wide beam of infrared light). Using flood illumination and structured light illumination, optical components 4.1-74 and 4.1-70 may capture facial images, images of objects in the environment surrounding device 4.1-10, etc.

Optical component 4.1-72 may be an infrared three-dimensional time-of-flight camera that uses time-of-flight measurements on emitted light to gather three-dimensional images of objects in the environment surrounding device 4.1-10. Component 4.1-72 may have a longer range and a narrower field of view than the three-dimensional structured light cameras of optical components 4.1-74 and 4.1-70. The operating range of component 4.1-72 may be 30 cm to 7 m, 60 cm to 6 m, 70 cm to 5 m, or other suitable operating range (as examples).

FIG. 4.1-4 is a front view of an illustrative ring-shaped cosmetic covering structure for device 4.1-10. Illustrative ring-shaped shroud 4.1-100 of FIG. 4.1-4 may be mounted under the inner surface of the display cover layer for display 4.1-14F in inactive area IA. This may help hide the optical components and other internal portions of device 4.1-10 from view from the exterior of device 4.1-10. Shroud 4.1-100 may be formed from one or more unbroken ring-shaped members and/or may be formed from multiple shroud segments that are attached using adhesive, fasteners, or other attachment structures. If desired, shroud 4.1-100 may be formed from multiple members that are sandwiched together along some or all of their lengths. In an illustrative configuration, which may sometimes be described herein as an example, shroud 4.1-100 may be formed from an inner piece (e.g., an inner full or partial ring), which may sometimes be referred to as an inner shroud member, shroud trim, or shroud trim member and may be formed from an outer piece or pieces (e.g., one or more strips of material or covering members, an full ring, one or more partial rings, etc.), which may sometimes be referred to as a shroud cover, canopy, or shroud canopy.

As shown in FIG. 4.1-4, shroud 4.1-100 may have optical component windows to accommodate components 4.1-60, 4.1-62, 4.1-64, 4.1-84, 4.1-66, 4.1-68, 4.1-70, 4.1-72, 4.1-74, 4.1-76, 4.1-78, 4.1-82, and 4.1-80. The optical component windows may be formed from through-hole openings in shroud 4.1-100, from recesses or other partial openings that do not pass entirely through shroud 4.1-100, from inserted optical window members in shroud through-hole openings, and/or from other shroud optical component window structures. Display 4.1-14F may have a display cover layer that has corresponding optical component windows (through-hole openings, recessed areas, inserted window members in through-hole openings, etc.) and/or that is formed from bulk material that has desired optical properties (e.g., a display cover layer formed from one or more layers of material such as glass and/or polymer with sufficient transparency at the operating wavelength range of the overlapped optical component to allow the optical component to operate satisfactorily through the cover layer without forming openings or other window structures in the cover layer).

Shroud 4.1-100 may have any suitable shape. For example, the outline of shroud 4.1-100 may be rectangular with rounded corners as shown in FIG. 4.1-4, may have teardrop shapes on the left and right sides of device 4.1-10, may have an oval outline, and/or may have other outlines with curved and/or straight edge segments. For example, the inner and outer edges of shroud 4.1-100 may be curved (e.g., to follow a teardrop shape). Shroud 4.1-100 may, if desired, have a peripheral edge that is curved along most or all of its length.

The width of shroud 4.1-100 may be constant along its length or shroud 4.1-100 may have portions that are wider than others. The thickness of shroud 4.1-100 (e.g., the dimension of shroud 4.1-100 into the page in the orientation of FIG. 4.1-4) may be smaller than the width of shroud 4.1-100 (the lateral dimension of shroud 4.1-100 within the page in the orientation of FIG. 4.1-4) or the thickness of the shroud may be equal to or greater than the width of the shroud. The shroud may have a two-dimensional shape (e.g., shroud 4.1-100 may have a planar shape) or may have a three-dimensional shape (e.g., a shape with a curved cross-sectional profile and/or a shape characterized by inner and/or outer surfaces of compound curvature). In an illustrative configuration, most or all of the inner and outer surfaces of shroud have a compound-curvature surface.

The optical components under inactive area IA may include components on the left and right sides of device 4.1-10 that operate in conjunction with each other. for example, scene cameras, tracking cameras, and/or structured light cameras in device 4.1-10 may be formed in pairs, each of which includes a left camera and a corresponding right camera. A left scene camera and a right scene camera may, as an example, operate together to capture overlapping images that provide device 4.1-10 with a wide field of view for gathering pass-through video. Left and right tracking cameras may operate together to track a user's hands or other external objects. Left and right structured light cameras or other three-dimensional cameras may be used together to capture three-dimensional images of the user's environment. To enhance performance of the left and right optical components in these types of paired component arrangements, it may be desirable to maintain accurate alignment between the left and right optical components. To help maintain left and right optical components on the respective left and right sides of device 4.1-10 in alignment with each other, device 4.1-10 may be provided with one or more housing structures that help support the optical components. An illustrative example of device 4.1-10 having housing structures that support the optical components and a cover layer that overlaps the optical components is shown in FIG. 4.1-5.

As shown in FIG. 4.1-5, shroud 4.1-100 and display cover layer 4.1-92 may be attached to housing 4.1-26 using adhesive, screws and other fasteners, press-fit connections, and/or other attachment mechanisms. An illustrative configuration in which shroud 4.1-100 and cover layer 4.1-92 are attached to forward-facing edge of a housing wall in the main housing portion of structure 4.1-26 using adhesive is shown in FIG. 4.1-5. In the example of FIG. 4.1-5, shroud 4.1-100 has an inner shroud member such as shroud trim 4.1-100A and has a corresponding outer shroud member such as shroud canopy 4.1-100B. Shroud trim 4.1-100A and shroud canopy 4.1-100B may be formed from metal, polymer, ceramic, glass, other materials, and/or combinations of these materials. In an illustrative example, shroud trim 4.1-100A is formed from black polymer or other dark material and shroud canopy 4.1-100B is formed from clear polymer. The outer surface of shroud canopy 4.1-100B may be smooth to provide shroud 4.1-100 with a cosmetically attractive appearance.

A layer of pressure sensitive adhesive may be used in attaching canopy 4.1-100B to trim 4.1-100A, or canopy 4.1-100B may be formed integrally with trim 4.1-100A. Adhesive may also be used in attaching cover layer 4.1-92 and shroud 4.1-100 to housing portion 4.1-26. As shown in FIG. 4.1-5, for example, a first adhesive such as adhesive 4.1-122 may be used to attach display cover layer 4.1-92 to shroud 4.1-100 (e.g., to a ledge in shroud trim 4.1-100A). A second adhesive such as adhesive 4.1-124 may, in turn, be used to attach shroud 4.1-100 (e.g., shroud trim 4.1-100A) to an adjacent lip of a wall in housing 4.1-26.

In some configurations, adhesives 4.1-122 and 4.1-124 may be formed from the same type of material. In an illustrative configuration, adhesives 4.1-122 and 4.1-124 are different. Housing portion 4.1-26 may have a wall with a lip shape that creates a shearing force on adhesive 4.1-124 as display 4.1-14F is attached to housing 4.1-26 by pressing display 4.1-14F against housing 4.1-26. In this type of scenario, it may be desirable to form adhesive 4.1-124 from an adhesive that can bond satisfactorily in the presence of shear forces such as a molten hot melt glue (thermoplastic adhesive) or other liquid adhesive rather than pressure sensitive adhesive. Adhesive 4.1-124 may, if desired, be exposed to a curing agent (ultraviolet light, moisture, etc.) before display 4.1-14F is assembled into housing 4.1-26.

Adhesive 4.1-124 may be heated to loosen the adhesive bond formed by adhesive 4.1-124, if desired. To help prevent display cover layer 4.1-92 from detaching from shroud 4.1-100 while softening adhesive 4.1-124 with heat, adhesive 4.1-122 may be provided with a higher-temperature softening point than adhesive 4.1-124 (e.g., adhesive 4.1-122 may be a two-part hot melt glue with a higher melting point than adhesive 4.1-124).

Optical components that are overlapped by display cover layer 4.1-92 and shroud 4.1-100 in inactive area IA may transmit and/or receive light through shroud 4.1-100 and display cover layer 4.1-92. Layer 4.1-92 may be formed from a single layer of glass, laminated glass, or other clear material that allows light for each overlapped optical component 4.1-104 to pass through layer 4.1-92. If desired, a partial recess or a through-hole opening may be formed in the portion of layer 4.1-92. An optional optical component window member may then be inserted within layer 4.1-92 (e.g., a window that overlaps component 4.1-104). As an example, layer 4.1-92 may be formed from one or more layers of glass and/or polymer and may be characterized by a first level of light transmission at operating wavelength(s) for component 4.1-104. A window member in layer 4.1-92 may be formed from polymer, glass, and/or other materials that are characterized by a second level of light transmission at the operating wavelength(s) that is greater than the first level of light transmission. In other illustrative arrangements, no window member is inserted in layer 4.1-92 (e.g., when layer 4.1-92 alone is sufficiently transparent to pass light for component 4.1-104).

Shroud 4.1-100 may be provided with an optical component window that overlaps optical component to help accommodate overlapped optical component 4.1-104. Component 4.1-104 may operate at ultraviolet light wavelengths, visible light wavelengths, and/or infrared light wavelengths. To accommodate component 4.1-104, shroud trim 4.1-100A has been provided with a through-hole opening, whereas shroud canopy 4.1-100B has no openings overlapping component 4.1-104. This effectively forms a window recess in shroud 4.1-100 in alignment with components 4.1-104. Trim 4.1-100A may be formed from black polymer or other light-absorbing material, so the formation of opening 4.1-120 in trim 4.1-100A may help ensure that sufficiently light may pass through to allow component 4.1-104 to operate satisfactorily. The portion of canopy 4.1-100B that overlaps component 4.1-104 may be transparent (e.g., clear polymer). Alternatively, canopy 4.1-100B may be formed from light-absorbing material, and a portion of canopy 4.1-100B overlapping component 4.1-104 may be removed.

To help hide component 4.1-104 from view, the inner surface of shroud canopy 4.1-100B may be covered with one or more coatings, which may be used to provide region the region overlapping component 4.1-104 with a desired outward appearance and optical properties that ensure that component 4.1-104 can operate satisfactorily. The coatings may include a thin-film-interference filter formed from a stack of thin-film dielectric layers of alternating refractive index values (with indices and thicknesses selected to create a desired transmission spectrum and a desired reflection spectrum for the filter), may include a layer of ink (e.g., a polymer layer including dye, pigment, and/or other colorant), and/or may include any other suitable coating with desired optical properties.

Consider, as an example, a scenario in which component 4.1-104 transmits and/or receives infrared light. In this type of arrangement, canopy 4.1-100B may be coated with a coating that is opaque at visible wavelengths and transparent at infrared wavelengths. This helps to hide component 4.1-104 from view from the exterior of device 4.1-10 while allowing infrared light associated with the operation of component 4.1-104 to pass through shroud 4.1-100 and layer 4.1-92.

As another example, consider a scenario in which component 4.1-104 is an ambient light sensor. In this configuration, canopy 4.1-100B may be coated with a coating that exhibits a visible light transmission of 1-8% (as an example). This may allow sufficient visible ambient light to reach the ambient light sensor for the ambient light sensor to make an ambient light reading. At the same time, the transmission of the coating may be sufficiently low to reduce the visibility of component 4.1-104 from the exterior of device 4.1-10.

As these examples demonstrate, regions of display 4.1-14F that overlap optical components such as component 4.1-104 of FIG. 4.1-5 may be provided with optical component window structures in layer 4.1-92 and/or shroud 4.1-100 that help accommodate the optical component.

As described in connection with FIGS. 4.1-3 and 4.1-4, there may be numerous optical components such as component 4.1-104 in inactive area IA. Each optical component may potentially have a different type of optical component window structure in shroud 4.1-100 and/or layer 4.1-92 to accommodate that component. For example, some areas of shroud 4.1-100 may have openings that receive components, other areas of shroud 4.1-100 may have inserted optical window member, and/or other areas of shroud 4.1-100 may have partial shroud openings (e.g., non-through-hole recesses) such as the opening of FIG. 4.1-8 (which may optionally be coated to modify the optical properties of shroud 4.1-100).

In some embodiments, it may be desirable to provide encapsulation material over cover layer 4.1-92. An illustrative example of cover layer 4.1-92 with encapsulation is shown in FIG. 4.1-6.

As shown in FIG. 4.1-6, cover layer 4.1-92 may be coupled to shroud 4.1-100. Cover layer 4.1-92 may include glass layer 4.1-126, front laminate 4.1-128 and rear laminate 4.1-130. Front laminate 4.1-128 and rear laminate 4.1-128 may be for example, layers of plastic that are laminated to cover layer 4.1-92, layers of plastic that are adhesively attached to cover layer 4.1-92, or other protective material that is attached to the front and rear surfaces of glass layer 4.1-126. Although not shown in FIG. 4.1-6, multiple layers, such as antireflection coatings, antismudge coatings, acrylic layers, or other desired layers, may be included as part of cover layer 4.1-92.

Although front laminate 4.1-128 and rear laminate 4.1-130 may protect the front and rear of glass layer 4.1-126, an edge surface of glass layer 4.1-126 may still be exposed. To further protect the edge surface of glass layer 4.1-126, encapsulation material 4.1-132 may be attached to the edge surface of glass layer 4.1-126. Encapsulation material 4.1-132 may be an epoxy material, such as a ductile epoxy, that seals the edge surface of glass layer 4.1-126 and protects glass layer 4.1-126 at the edge surface. Alternatively, acrylate, polyvinyl butyral (PVB), polyurethane, or moisture cure materials may be used for encapsulation material 4.1-132.

In some embodiments, encapsulation material 4.1-132 may be an epoxy that adheres to glass layer 4.1-126 without a primer (e.g., encapsulation material 4.1-132 may be a primer-less adhesive). Moreover, encapsulation material 4.1-132 may have adequate ductility to elongate and not fracture, such as a Young's modulus of less than 3 GPa, less than 4 GPa, less than 2.5 GPa, or other suitable modulus. Additionally, encapsulation material 4.1-132 may be chemically resistant to chemicals and resistant to degradation due to solar exposure. It may also be desirable for encapsulation material 4.1-132 to match an appearance of the shroud. For example, encapsulation material 4.1-132 may have a black appearance, a white appearance, a gray appearance, a shiny appearance, and/or a matte appearance. In general, encapsulation material 4.1-132 may be formed from material that adheres to glass layer 4.1-126, while protecting the edge surface of glass layer 4.1-126.

Encapsulation material 4.1-132 may substantially fill the opening between the edge surface of glass layer 4.1-126 and shroud 4.1-100. For example, encapsulation material 4.1-132 may extend approximately 150 microns from the edge surface. In general, however, any amount of encapsulation material 4.1-132 may be applied to the edge surface.

As shown in FIG. 4.1-6, encapsulation material 4.1-132 may cover the edge surface and may also cover an edge portion of laminate 4.1-128. However, this is merely illustrative. If desired, encapsulation material 4.1-132 may cover the edge surface of glass layer 4.1-126 without covering an edge portion of laminate 4.1-128. For example, as shown in FIG. 4.1-7, encapsulation material may cover only the edge surface of glass layer 4.1-126. In the example of FIG. 4.1-7, laminate 4.1-128 may extend over encapsulation material 4.1-132. However, this is merely illustrative. Laminate 4.1-128 may be flush with the edge surface of glass layer 4.1-126, if desired.

In some embodiments, it may be determined that glass layer 4.1-126 can be protected by modifying the position of glass layer 4.1-126 relative to shroud 4.1-100 (or support structure 4.1-126). For example, as shown in the illustrative embodiment of FIG. 4.1-8, the edge surface of glass layer 4.1-126 may be left unencapsulated, but the size of opening 4.1-134 between the edge surface and shroud 4.1-100 may be adjusted. By increasing or decreasing the size of opening 4.1-134, glass layer 4.1-126 may be protected.

Instead of, or in addition to, adding material to the edge surface of layer 4.1-126, it may be desirable to add material in the gap between layer 4.1-126 and the shroud/support structure. An illustrative example of adding material in this gap is shown in FIG. 4.1-9.

As shown in FIG. 4.1-9, material 4.1-136 may be included between the edge surface of glass layer 4.1-126 and shroud 4.1-100. Material 4.1-136 may be, for example, a bumper ring. The bumper ring may be formed from elastomer, rigid plastic, or another material that helps protect the edge surface of layer 4.1-126.

As an alternative to material 4.1-136 being a bumper ring between layer 4.1-126 and shroud 4.1-100, material 4.1-136 may be an overmolded structure on layer 4.1-126, on shroud 4.1-100, or on a chassis that is coupled to support structure 4.1-26. In general, the overmolded structure may fill the gap between layer 4.1-126 and the support structure, shroud, and/or chassis and help protect the edge surface of layer 4.1-126.

Although not shown in FIG. 4.1-9, a portion of material 4.1-136 may extend underneath layer 4.1-126 if desired. In particular, there may be a portion of material 4.1-136 between the bottom surface of layer 4.1-126 and shroud 4.1-100.

Instead of, or in addition to, adding material between layer 4.1-126 and shroud 4.1-100, upper laminate 4.1-128 and/or lower laminate 4.1-130 may wrap around the edge surface of layer 4.1-126. Illustrative examples of the laminates wrapping the edge surface are shown in FIGS. 4.1-10 and 4.1-11.

As shown in FIG. 4.1-10, upper laminate 4.1-128 may wrap around the edge surface of layer 4.1-126. In particular, upper laminate 4.1-128 may have portion 4.1-128A that extends around and covers the edge surface of layer 4.1-126. Layer 4.1-126 may have a rounded edge surface to allow upper laminate 4.1-128 to wrap the edge surface and sufficiently adhere to the surface, as shown in FIG. 4.1-10. By forming layer 4.1-126 with a rounded edge, the curve of laminate 4.1-128 around the edge may be reduced, thereby reducing stress on laminate 4.1-128. However, layer 4.1-126 may have a planar edge surface, or a surface with any other desired profile, around which upper laminate 4.1-128 wraps, if desired. By wrapping upper laminate around the edge surface of layer 4.1-126, the edge surface may be protected As shown in FIG. 4.1-11, lower laminate 4.1-130 may wrap around the edge surface of layer 4.1-126. In particular, lower laminate may have portion 4.1-130A that extends around and covers the edge surface of layer 4.1-126. Layer 4.1-126 may have a rounded edge surface to allow lower laminate 4.1-130 to wrap the edge surface and sufficiently adhere to the surface, may have a planar edge surface, or may have a surface with any other desired profile, around which lower laminate 4.1-130 wraps. By wrapping lower laminate 4.1-130 around the edge surface of layer 4.1-126, the edge surface may be protected.

In the example of FIG. 4.1-11, lower laminate portion 4.1-130A wraps entirely around the edge surface of layer 4.1-126 and partially overlaps upper laminate 4.1-128. However, the arrangement is merely illustrative. If desired, lower laminate portion 4.1-130A may wrap around only the edge surface of layer 4.1-126 without overlapping or extending over upper laminate 4.1-128.

Another example of material that may be used to protect layer 4.1-126 is shown in FIG. 4.1-12. In the example of FIG. 4.1-12, glue (or another similar material) 4.1-138 may be used to completely fill the gap between layer 4.1-126 and shroud 4.1-100. For example, the glue may be inserted into the gap after cover layer 4.1-92 has been assembled into the head-mounted device. Glue 4.1-138 may help protect the edge surface of layer 4.1-126.

Rather than wrapping the upper or lower laminate around the edge surface of layer 4.1-126, upper laminate 4.1-128 may extend to shroud 4.1-100 to cover the gap between the edge surface and shroud 4.1-100. For example, as shown in FIG. 4.1-13, upper laminate 4.1-128 may have portion 4.1-128B that extends to shroud 4.1-100 (or support structure 4.1-26 or another portion of device 4.1-10). By covering the gap between the edge surface of layer 4.1-126 and shroud 4.1-100, the edge surface may be protected.

Instead of, or in addition to, adding material or extending the laminates to protect the edge surface of layer 4.1-126, shroud 4.1-100 or a chassis attached to support structure 4.1-26 may be modified to protect the edge surface. Illustrative examples of modifying these components to protect layer 4.1-126 are shown in FIGS. 4.1-14 and 4.1-15.

As shown in FIG. 4.1-14, structure 4.1-140 may have a lip that covers the gap between layer 4.1-126 and shroud 4.1-100/support structure 4.1-26. Structure 4.1-140 may be formed from a portion of shroud 4.1-100 or from a portion of support structure 4.1-26 (e.g., a chassis of support structure 4.1-26). The lip of structure 4.1-140 may help protect the edge surface of layer 4.1-126.

If desired, the lip of structure 4.1-140 may be combined with the extension of laminate around the edge surface of layer 4.1-126. For example, as shown in FIG. 4.1-15, upper laminate 4.1-128A may wrap the edge surface of layer 4.1-126 to protect the edge surface, and the lip of structure 4.1-140 may provide additional protection.

Although cover layer 4.1-92 has been described as being coupled to shroud 4.1-100, this is merely illustrative. In some embodiments, cover layer 4.1-92 may be coupled directly to support structure 4.1-26. In other embodiments, device 4.1-10 may include a chassis attached to support structure 4.1-26 (e.g., a chassis to support various components in device 4.1-10), and cover layer 4.1-92 may be coupled to the chassis.

Moreover, although cover layer 4.1-92 has been described as including a glass layer, this material is merely illustrative. Layer 4.1-126 may be formed from ceramic, sapphire, or any other desired material.

In general, laminates 4.1-128 and 4.1-130 may protect layer 4.1-126. An illustrative stackup of cover layer 4.1-92 including detailed laminates 4.1-128 and 4.1-130 is shown in FIG. 4.1-16.

As shown in FIG. 4.1-16, cover layer 4.1-92 may include layer 4.1-126, which may be glass, sapphire, or other material, and laminates 4.1-128 and 4.1-130. Although laminates 4.1-128 and 4.1-130 are shown as planar in FIG. 4.1-16 for illustrative purposes, laminate 4.1-128 may be a convex laminate, and laminate 4.1-130 may be a concave laminate (as shown in FIG. 4.1-6-4.1-15), if desired.

Laminate 4.1-128 may include polymer layer 4.1-134 coupled to layer 4.1-126 with adhesive 4.1-132. Polymer layer 4.1-134 may be a polycarbonate (PC) layer, a polymethyl methacrylate (PMMA) layer, or other suitable polymer layer. Adhesive 4.1-132 may be a pressure-sensitive adhesive (PSA), an optically clear adhesive (OCA), or other suitable adhesive. In some illustrative embodiments, adhesive 4.1-132 may be an ultraviolet-curable OCA. Adhesive 4.1-132 may have a thickness of at least 100 microns, at least 200 microns, 150-250 microns, or other suitable thickness.

Hard coat 4.1-136 may be formed on polymer layer 4.1-134. Hard coat 4.1-136 may be an acrylic layer, a thin glass layer, a sapphire layer, or other material. In some embodiments, if polymer layer 4.1-134 is a PMMA layer, hard coat 4.1-136 may be a polycarbonate layer or a blend of polycarbonate and acrylic material. For example, hard coat 4.1-136 may be formed from an ultraviolet-curable film. Hard coat 4.1-136 may be at least 2 microns thick, three microns thick, 3-5 microns thick, or other suitable thickness.

Coating layers 4.1-138 may be formed on hard coat 4.1-136. Coating layers 4.1-138 may include an antireflection coating (e.g., a layer that matches an index of refraction of glass 4.1-126 to the air outside of glass 4.1-126) and an antismudge coating (e.g., a fluoropolymer or other oleophobic material), as examples.

By including adhesive 4.1-132 between glass 4.1-126 and polymer layer 4.1-134, polymer 4.1-134 and glass 4.1-126 may be decoupled. As a result, less stress may be applied to glass 4.1-126 from polymer 4.1-134. To reduce the amount of stress further, a UV-curable OCA may be used, as such an OCA may be soft when applied. However, this is merely illustrative. Any suitable adhesive may be used to decouple polymer 4.1-134 from glass 4.1-126 and reduce the stress applied to glass 4.1-126.

In some illustrative embodiments, polymer layer 4.1-134 may be formed from PMMA, which may match the optical properties of glass 4.1-126, particularly when cover layer 4.1-92 is curved. However, any suitable material may be used to form polymer layer 4.1-134 and match the appearance of polymer layer 4.1-134 to glass 4.1-126.

Although hard coat 4.1-136 has been described as being overlapped by coating layers 4.1-138, this is merely illustrative. In some embodiments, hard coat 4.1-136 may be formed as the outermost layer of cover layer 4.1-92. For example, as shown in FIG. 4.1-17, hard coat 4.1-136 may be formed as the outermost layer.

If desired, hard coat 4.1-136 may include antismudge properties. For example, hard coat 4.1-136 may have fluoropolymer or other oleophobic material incorporated into the hard coat material. Additionally, if an antireflection coating is desired, antireflection coating 4.1-137 may be formed as the lowermost layer of laminate 4.1-128, directly on glass 4.1-126.

Returning to FIG. 4.1-16, laminate 4.1-130 may include adhesive 4.1-140 that couples polymer 4.1-142 to glass 4.1-126. Adhesive 4.1-140 and polymer 4.1-142 may correspond with adhesive 4.1-132 and polymer layer 4.1-132. For example, adhesive 4.1-140 may be a PSA or OCA (e.g., a UV-curable OCA), and polymer layer 4.1-132 may be polycarbonate or PMMA. Polymer layer 4.1-142 may be acrylic, sapphire, glass, UV-curable material, or other suitable material.

Antireflection coating 4.1-146 may be formed on polymer layer 4.1-142. Although not shown, a UV stabilizer material, such as alumina, may be formed between polymer layer 4.1-142 and antireflection coating 4.1-146. The UV stabilizer material may have a thickness of at least 10 nm, at least 20 nm, or other suitable thickness, and may stabilize the surrounding layers when adhesives 4.1-140 and 4.1-132, and/or polymer layers 4.1-134 and 4.1-142 are cured.

Laminate 4.1-130 may also include ink 4.1-148. Ink 4.1-148 may be formed over an optical component in a head-mounted device, such as one of components 4.1-60, 4.1-62, 4.1-64, 4.1-66, 4.1-68, 4.1-70, 4.1-72, 4.1-74, 4.1-76, 4.1-78, and 4.1-80 of FIG. 4.1-3. In an illustrative embodiment, ink 4.1-148 may overlap a flood illuminator, and ink 4.1-148 may be an infrared-transparent-visible-light-blocking ink, such as an ink with 10% visible light transmission or less. However, this is merely illustrative. In general, ink 4.1-148 may overlap any component in a head-mounted device and may have a corresponding transmission spectrum.

Although FIGS. 4.1-16 and 4.1-17 show laminate 4.1-130 without a hard coat layer, this is merely illustrative. If desired, laminate 4.1-130 may have a hard coat layer, such as hard coat layer 4.1-136, either within laminate 4.1-130 or as an outermost layer of laminate 4.1-130.

An edge seal, such as the seals of FIGS. 4.1-6-4.1-9, may protect one or more layers of laminate 4.1-128 and/or laminate 4.1-130. An illustrative example of a seal overlapping the edges of layers in laminate 4.1-128 is shown in FIG. 4.1-18.

As shown in FIG. 4.1-18, seal 4.1-150 may overlap the edges of laminate 4.1-128. In particular, seal 4.1-150 may overlap and bond to a PMMA layer, a polycarbonate layer, and/or a hard coat layer in laminate 4.1-128. In some embodiments, seal 4.1-150 may form chemical bonds with an upper surface of laminate 4.1-128. Moreover, in the illustrative example of FIG. 4.1-18, seal 4.1-150 may extend to glass layer 4.1-126. Seal 4.1-150 may be formed from polyurethane, epoxy, acrylate, PVB, or other suitable material to protect the edges of laminate 4.1-128.

The foregoing is merely illustrative and various modifications can be made to the described embodiments. The foregoing embodiments may be implemented individually or in any combination.

V: Dust Seal

5.1: Seal for an Electronic Device

The electronic devices described in the present disclosure include components and arrangements configured to protect the LEDs, antennas, sensors, and/or other components communicating with the external environment noted above, from light and debris that may otherwise harm or negatively affect the components. More specifically, the present disclosure describes seals and electronic components that ensure internal components can sufficiently function without interference from an environment external to the electronic device, as needed, without the risk of damage to the internal component. Such interferences can include light, debris, or moisture. Such internal components can include, but are not limited to, cameras, LEDs, ambient light sensors, flicker sensors, and other sensors, and the like. These and other internal components can be disposed adjacent to, or aligned below, one or more apertures/ports of the electronic device, with a seal disposed between the aperture/vent and the internal electronic component. In this way, the seals described herein can act as a barrier between the internal component and the external environment or the internal component and other internal components while also enabling the proper functioning of the internal component.

In a particular example, an electronic device includes a housing that defines an internal volume and an aperture defined by the housing. An electronic component can be disposed within the internal volume and a seal can be disposed between the aperture and the electronic component, the seal being configured to protect the electronic component within the housing.

In a particular example, an electronic component can include a light emitting component coupled to a base support. The electronic device can include other electronic components that are light sensitive. The seal can be disposed and configured between the light emitting component and light sensitive component to prevent and/or minimize light interference.

The seals described herein obstruct light having wavelengths in the visible range, as well as those having wavelengths extending into to ultraviolet and infrared ranges. The seals also inhibit dust and/or debris from traversing into the housing from apertures and/or any vents disposed on the housing of the electronic device. The seals described herein are also compressible to aid in assembly of the electronic device. In addition, the seals and assemblies described herein are durable and resistant to damage. The seal can be die cut and the components of the electronic device can be made of materials intended to minimize the weight of the components and/or the electronic device.

For example, a seal described herein can include an open or closed cell foam. The seal can engage a bracket or base support of the electronic device in an interference fit. In some examples, the seal can include a seal configured to surround the light emitting component. Because the light emitting component is mounted to an end of the base support in some examples, the seal can be die cut to have a precise interference fit with the base support to separate the light emitting component from other electronic components disposed in the electronic device and to facilitate a top-down assembly orientation.

FIG. 5-1 illustrates a cross-section of an electronic device 5-100. The electronic device can include any of the electronic devices described above. The electronic device can include a housing 5-105. The housing can include a first wall 5-110. In some examples, the first wall 5-110 can include an exterior wall of the electronic device 5-100 or can include a wall that separate chambers or compartments within electronic device 5-100. The housing 5-105 can include a base support 5-115 coupled to the first wall 5-110. The base support 5-115 can include a base bracket or support piece for the electronic device 5-100 and/or electronic components disposed within the housing 5-105. In some examples, the base support 5-115 can include one or more stiff metal materials, including steel, stainless steel, magnesium, and/or titanium. In some examples, the base support 5-115 can include plastic and/or plastic components to reduce weight of the electronic device 5-100. The base support 5-115 can be cylindrical shaped or can include a cubic shape and may be a solid material or hollow to reduce weight of the electronic device 5-100. The base support 5-115 can include a first surface 5-120 coupled to the first wall 5-110 by adhesive or any non-limiting fastening method and/or device. An electronic component can be coupled to a second surface 5-125 of the base support 5-115. The second surface 5-125 of the base support 5-115 can be configured opposite the first surface 5-120. The electronic component can include a light emitting component 5-130 (e.g., a light emitting diode or LED).

The electronic device 5-100 can further include a second wall 5-135 disposed over the base support 5-115. The first wall 5-110 and the second wall 5-135 can form an enclosure 5-140 within the housing 5-105 and the base support 5-115 can be disposed within the enclosure 5-140. In some examples, an electronic component 5-145 can also be disposed within the enclosure 5-140. The electronic component 5-145 can include a light sensitive component, in some examples, subject to light interference from the light emitting component 5-130. The electronic component 5-145 can be mounted to a second base support or can be coupled to either the first wall 5-110 and/or the second wall 5-135 directly.

The electronic device 5-100 can further include a seal 5-150 surrounding the light emitting component 5-130. The seal 5-150 can be disposed between the base support 5-115 and the second wall 5-135. In some examples, the seal 5-150 separates the electronic component 5-145 from the light emitting component 5-130. The seal 5-150 can be configured to obstruct light having wavelengths between about 10-8 m and about 10-3 m. In other words, the seal 5-150 can obstruct light in the visible region, the ultraviolet region, and the infrared region. The seal 5-150 can also inhibit dust and/or debris from traversing between the base support 5-115 and the second wall 5-135. In some examples, the seal 5-150 surrounds the light emitting component 5-130 on all sides. As such, the seal 5-150 engages the base support 5-115 either around a perimeter of an upper portion of the base support 5-115 or the second surface 5-125 of the base support 5-115. In some examples, the second surface 5-125 includes the same surface having the light emitting component 5-130 disposed thereon.

In some examples, the base support 5-115 defines a ledge 5-155. The seal 5-150 can surround an upper portion of the base support 5-115 and contact or engage an upper surface of the ledge 5-155. As such, the seal 5-150 and the base support 5-115 can be engaged in an interference fit. For example, the radial seal 5-150 can be disposed in a press fit or friction fit between the base support 5-115 and the second wall 5-135. The seal 5-150 and the base support 5-115 can be held together by friction after the housing 5-105 and other components are assembled. For example, the seal 5-150 can be compressed between the second wall 5-135 and the second surface 5-125 or the ledge 5-155 of the base support 5-115 to separate or seal the light emitting component 5-130 from the electronic component 5-145. In some examples, the seal 5-150 can separate and/or seal off the enclosure 5-140 from an area or environment outside the housing 5-105 or external to the electronic device 5-100.

In some examples, the seal 5-150 can be die cut. The seal 5-150 can be cut into a precise shape by a metal "die" during production. Because of the precise shape (e.g., radial) and dimensions of the seal 5-150 to properly seal against light, dust, and other debris and to fit properly against the second wall 5-135 and the base support 5-115, including the ledge 5-155 defined thereby, the die cutting process can provide the exact shape and properties of the seal 5-150 for proper assembly of the electronic device 5-100.

In some examples, the seal 5-150 can include a silicone material. The silicone seal 5-150 can be manufactured inexpensively and when shaped appropriately, provide the required compressibility and interference fit to the base support 5-115. In some examples, the silicone seal 5-150 can include a foaming agent and/or be dyed to obstruct light from passing through from either the external environment and/or the light emitting component 5-130 to the electronic component 5-145 within the enclosure 5-140. The seal 5-150 can include portions formed of different materials. In some examples, the seal 5-150 can include a plastic shim 5-160. The plastic shim 5-160 can be included as a component of the seal 5-150 to reduce weight of the seal 5-150, and thus, can reduce the weight of the electronic device 5-100. In some examples, the plastic shim 5-160 can contact the base support 5-115. In some examples, the plastic shim 5-160 can contact the ledge 5-155 and/or the upper portion of the base support 5-115. The plastic shim 5-160 can also be impenetrable or resistant to light, dust, and/or debris. The seal can further include a foam material 5-165 coupled to the plastic shim 5-160.

Referring now to FIG. 5-2, a cross-section of the seal 5-150 illustrated in FIG. 5-1 is shown. In some examples, the plastic shim 5-160 can be coupled to the foam material 5-165 with a pressure sensitive adhesive 5-170, or any suitable adhesive. The plastic shim 5-160 can form a precision seal with the base support 5-115 and can be less expensive to manufacture than the silicone and/or a seal including only foam material. The foam material 5-165 can be compressed between the plastic shim 5-160 and the second wall 5-135, as shown in FIG. 5-1. The plastic shim 5-160 can include a bottom surface 5-162 coupled to the base support 5-115. The plastic shim 5-160 can be joined to the base support 5-115 with the pressure sensitive adhesive 5-170. A top surface of the plastic shim 5-160 can also include a pressure sensitive adhesive 5-170 to couple the plastic shim 5-160 to the foam material 5-165. In some examples, the foam material 5-165 can include a compressible open or closed cell foam to inhibit light, dust, and/or debris.

FIG. 5-3 illustrates an electronic device 5-200 having a housing 5-205 and electronic components therein. The electronic device 5-200 can include a head mountable device (e.g., device 30). In some examples, the electronic device 5-200 can include a first enclosure 5-210 having a light emitting component 5-222 disposed therein. The first enclosure can be defined, at least in part, by the housing 5-205, an internal wall 5-255, and an external wall 5-240 defining an external surface 5-242. The housing 5-205 can include a first wall 5-215. In some examples, the first wall 5-215 can include an exterior wall of the electronic device 5-200 or can include a wall that separate chambers or compartments within the electronic device 5-200. The housing 5-205 can include a base support 5-220 coupled to the first wall 5-215. The base support 5-220 can include a first surface 5-225 coupled to the first wall 5-215 by an adhesive or any non-limiting fastening method and/or device. An electronic component can be coupled to a second surface 5-230 of the base support 5-220. The second surface 5-230 of the base support 5-220 can be opposite the first surface 5-225. The light emitting component 5-222 can include a light emitting diode (LED).

The housing 5-205 can further include a second enclosure 5-230. The second enclosure 5-230 can include at least one light sensitive component 5-235 disposed therein. The second enclosure 5-230 can be defined by the housing 5-205, including various internal and external walls. In some examples, the light sensitive component 5-235 can include an optically sensitive device. In some examples, the light sensitive component 5-235 can include at least one of a camera, an ambient light sensor, or a flicker sensor. In some examples, the second enclosure 5-230 can include an exterior surface 5-240 of the housing 5-205. In other words, one of the walls of the second enclosure 5-230 includes the exterior surface 5-240 of the housing 5-205.

In some examples, the housing 5-205 can further define a third enclosure 5-245. The base support 5-220 can be disposed within the third enclosure 5-245. In some examples, the base support 5-220 can include a metal or plastic material. In some examples, the third enclosure 5-245 can include an interior surface 5-250 of the housing 5-205. In other words, one of the walls of the third enclosure 5-245 includes the interior surface 5-250 of the housing 5-205. In some examples, the housing 5-205 of the electronic device 5-200 includes an internal wall 5-255 separating at least a portion of the second enclosure 5-230 and the third enclosure 5-245. In some examples, a seal 5-260 is included. The seal 5-260 can be coupled to a top portion or the second surface 5-230 of the base support 5-220. The seal 5-260 can separate the first enclosure 5-210, the second enclosure 5-230, and the third enclosure 5-245. In other words, the seal 5-260 includes at least a portion of a wall or divider that separates the first enclosure 5-210, the second enclosure 5-230, and the third enclosure 5-245 from each other. In some examples, the seal 5-260 is impenetrable to dust, debris, and/or light. The seal can extend from the second surface 5-230 of the base support 5-220 past the internal wall 5-255 and press fit to the exterior surface 5-240 of the housing 5-205. In such a configuration as shown in FIG. 6, the seal 5-260 functions to both protect the light sensitive component 5-235 from the light emitting component 5-222 and protects both the light sensitive component 5-235 and the light emitting component 5-222 from debris and/or dust 5-265 present either outside the housing 5-205 or within the third enclosure 5-245.

In some examples, the dust 5-265 can ingress into the third enclosure 5-245 through an air vent 5-270 or other aperture. The seal 5-260 prevents or substantially prevents the dust 5-265 or other debris, such as, but in no way limited to, water, dirt, and smoke, from passing through to the first enclosure 5-210 or second enclosure 5-230, which can include sensitive electronic components. The air vent 5-270 can be included on the electronic device 5-200 for temperature control and/or heat dissipation. In some examples, the air vent 5-270 can be included for comfort and/or safety for the user of the electronic device 5-200. According to one example, the air vent 5-270 can include a perforated material to cover the air vent 5-270 or other apertures in the electronic device. The size, locations, and number of perforations extending through such a material can vary from one example to another. Such perforations can include machined, laser cut, or otherwise manufactured openings defined by and extending through the material. Such openings can be sized and arranged to prevent a certain size particle from the external environment from passing through the air vent 5-270. Such openings can also be sized and include other types of filters to prevent moisture or other harmful debris from passing through the air vent 5-270.

In some examples, the seal 5-260 can be cut and/or shaped to seal around the internal wall 5-255 and between the second surface 5-230 of the base support 5-220 and the exterior surface 5-240 of the housing 5-205. The seal 5-260 can include a compressible foam and can compress in an interference or press fit between the exterior surface 5-240 of the housing 5-205 and a top portion or the second surface 5-230 of the base support 5-220. The seal 5-260 can include an open cell polyurethane foam, which is lightweight and more compressible compared to a closed cell foam. In other examples, the seal 5-260 can include a silicone material. The seal 5-260 can include a reticulated Polyurethane, PVC/Nitrile, Ethylene Propylene Diene Monomer (EPDM) rubber, or other suitable material. The materials which can be used to produce the closed cell foam for the seal 5-260 can vary greatly from ethylene-vinyl acetate (EVA), polyethylene, polystyrene, rubber to polypropylene etc. The closed cell foam can include trapped gas bubbles which are formed during the expansion and cure of the foam. The bubbles are permanently locked to a place, as the trapped gas is very efficient in increasing the insulation capability of the foam. The foam which is formed is strong and is usually of a greater density than open cell foam, which enables the gas bubbles to lock into place. The nature of the foam enables it to be vapor retardant and resist liquid water. In some examples, the materials for the seal can be open celled, but can include a sufficiently tortuous path so as to restrict or eliminate the passage of contaminants between enclosures.

In some examples, the top portion of the base support 5-220 can include a ledge (e.g., ledge 5-155 shown in FIG. 5-1). The seal 5-260 can surround an upper portion of the base support 5-220 and contact the ledge. In some examples, the seal 5-260 can further include a plastic shim (e.g., plastic shim 5-160) that contacts the ledge. The seal 5-260 can fit tightly to the base support 5-220. The tight fit can function not only to seal the enclosures within the housing, but also to control and/or retain electronic components in place, which can improve the design of the electronic device 5-200, minimize noise and/or vibrations, and reduce manufacturing costs.

FIGS. 5-4A-5-4C illustrate an electronic device 5-300. FIG. 5-4A shows a top perspective view of an electronic component 5-305 and a dust seal 5-310 surrounding the electronic component 5-305 within the electronic device 5-300, according to one example. In some examples, the dust seal 5-310 can be coupled to a base support 5-315. The dust seal 5-310 can couple to the base support 5-315 via an interference fit. In some examples, the dust seal 5-310 can be adhered to the base support 5-315 with an adhesive (e.g., pressure sensitive adhesive 5-170 shown in FIG. 5-2). In some examples, the electronic component 5-305 can include a light emitting component (e.g., light emitting component 5-222 shown in FIG. 5-3). The electronic device 5-300 can further include a flexible printed circuit board or flexible printed circuit (flex PCB) 5-320. At least a portion of the flex PCB 5-320 can be disposed between the dust seal 5-310 and the base support 5-315. In some examples, a flex PCB can include an arrangement of printed circuitry and/or components that utilize flexible materials with a flexible overlay. A flexible printed circuit board can include a metallic layer of traces, usually copper, bonded to a dielectric layer. Thickness of the metallic layer can be very thin (<. 0001") to very thick (>0.010") and the dielectric thickness can also vary. The flex PCB can be included in the electronic device 5-300 to reduce the assembly process and improve reliability. The flex PCB can be used as a connector, power supply, and also as full circuits assembled with components such as electronic component 5-305. A benefit of including the flex PCB 5-320 in the electronic device 5-300 is connecting the electronic component 5-305 to other components and/or a power source (not shown) and having the flex PCB 5-320 disposed between the dust seal 5-310 and the base support 5-315. In some examples, the dust seal 5-310 retains the flex PCB adjacent to the base support 5-315.

FIG. 5-4B shows a cross-sectional view of a portion of electronic device 5-300. The flex PCB 5-320 can be coupled to the electronic component 5-305. In some examples, electronic component 5-305 can include a light emitting device mounted to the base support 5-315. In some examples, the light emitting device can be coupled to a top surface 5-325 of the flex PCB 5-320 and a bottom surface 5-330 of the flex PCB 5-320 can be coupled to the base support 5-315. The dust seal 5-310 can encircle the light emitting device. In some examples, the dust seal 5-310 is impenetrable or resistant to light, dust, and/or debris. FIG. 5-4B shows the base support 5-315 having a ledge 5-335. The dust seal 5-310 can extend from the upper portion of the base support 5-315 adjacent to the base support 5-315 and past the dust seal 5-310. In some examples, the ledge 5-335 can include a cut-out portion. The cut-out portion can have the width of the flex PCB to minimize folding of the PCB and retain the flex PCB 5-320 adjacent to the base support 5-315. Referring to FIG. 5-4C, the flex PCB 5-320 can further include an adhesive 5-340 on the bottom surface 5-330 to retain the flex PCB 5-320 adjacent to the base support 5-315. FIG. 7C shows components of the dust seal, each component configured to retain the flex PCB 5-320 and/or prevent dust and/or debris ingress into the electronic device.

In some examples, the dust seal 5-310 can act as a radial seal to apply a radial force 5-345 to the flex PCB 5-320 to retain the flex PCB 5-320 adjacent the base support 5-315. In other words, the dust seal 5-310 prevents ingress path and aids adhesive 5-340 in flex management by applying compressive normal force that keeps the flex PCB 5-320 from delaminating from the base support 5-315. The dust seal 5-310 can also act as a compressive seal to apply a compressive force 5-350 to compress the dust seal 5-310 between a housing wall 5-355 and the base support 5-315. As such, the dust seal 5-310 can include a compressible foam. The dust seal 5-310 can be coupled to the base support 5-315 and engaged to the base support and the housing wall 5-355 in an interference fit. As described in other examples above, the housing wall 5-355 of the electronic device 5-300 can include a vent 5-360 and/or other apertures. FIG. 7C includes the dust ingress route 5-365 that the dust seal 5-310 is configured to prevent. Because the dust seal 5-310 includes a compressible foam and is engaged in a compressive seal and a radial seal, the dust ingress route 5-365 is closed off, the dust seal 5-310 being impenetrable to dust and/or debris. In some examples, the dust seal 5-310 is also impenetrable to light.

In some examples, the components described above for the electronic device examples (e.g., electronic device 5-100, 5-200, and/or 5-300) can aid in the assembly of the electronic device housing (e.g. housing 5-305). The assembly process can, in some examples, demand the use of a minimal amount of metal material for the base support 5-315 to maximize the available distance that can be used between the components. The assembly methods can also demand that the ledge 5-335 be minimized so that the base support 5-315 does not interfere with the inclusion/installation of other electronic components (e.g., electronic component 5-145) during assembly. In other words, due to the materials used for the base support 5-315 and/or the shape of the base support 5-315, the base support 5-315 can be installed first, then the other electronic components (e.g., electronic component 5-145) can be installed after the base support 5-315, followed by the dust seal 5-310 being placed on or around the base support, and finally the housing wall (e.g., housing wall 5-355) can be installed to compress the dust seal 5-310 in an interference fit between the housing wall 5-355 and the base support 5-315. In other words, the present exemplary sealing systems and methods facilitate a top or front assembly of the device, while ensuring a secure light and/or dust seal between sections.

VI: Sensor System

FIG. 6-0 illustrates a view of an example of an HMD device 6-100. The HMD device 6-100 can include a sensor array or system 6-102 including one or more sensors, cameras, projectors, and so forth mounted to one or more components of the HMD 6-100. In at least one example, the sensor system 6-102 can include a bracket 1-338 on which one or more sensors of the sensor system 6-102 can be fixed/secured.

FIG. 6-1 illustrates a portion of an HMD device 6-100 including a front transparent cover 6-104 and a sensor system 6-102. The sensor system 6-102 can include a number of different sensors, emitters, receivers, including cameras, IR sensors, projectors, and so forth. The transparent cover 6-104 is illustrated in front of the sensor system 6-102 to illustrate relative positions of the various sensors and emitters as well as the orientation of each sensor/emitter of the system 6-102. As referenced herein, "sideways," "side," "lateral," "horizontal," and other similar terms refer to orientations or directions as indicated by the X-axis shown in FIG. 6-2. Terms such as "vertical," "up," "down," and similar terms refer to orientations or directions as indicated by the Z-axis shown in FIG. 6-2. Terms such as "frontward," "rearward," "forward," backward," and similar terms refer to orientations or directions as indicated by the Y-axis shown in FIG. 6-2.

In at least one example, the transparent cover 6-104 can define a front, external surface of the HMD device 6-100 and the sensor system 6-102, including the various sensors and components thereof, can be disposed behind the cover 6-104 in the Y-axis/direction. The cover 6-104 can be transparent or semi-transparent to allow light to pass through the cover 6-104, both light detected by the sensor system 6-102 and light emitted thereby.

As noted elsewhere herein, the HMD device 6-100 can include one or more controllers including processors for electrically coupling the various sensors and emitters of the sensor system 6-102 with one or more mother boards, processing units, and other electronic devices such as display screens and the like. In addition, as will be shown in more detail below with reference to other figures, the various sensors, emitters, and other components of the sensor system 6-102 can be coupled to various structural frame members, brackets, and so forth of the HMD device 6-100 not shown in FIG. 6-1. FIG. 6-1 shows the components of the sensor system 6-102 unattached and un-coupled electrically from other components for illustrative clarity sake.

In at least one example, the device can include one or more controllers having processors configured to execute instructions stored on memory components electrically coupled to the processors. The instructions can include, or cause the processor to execute, one or more algorithms for self-correcting angles and positions of the various cameras described herein overtime with use as the initial positions, angles, or orientations of the cameras get bumped or deformed due to unintended drop events or other events.

In at least one example, the sensor system 6-102 can include one or more scene cameras 6-106. The system 6-102 can include two scene cameras 6-102 disposed on either side of the nasal bridge or arch of the HMD device 6-100 such that each of the two cameras 6-106 correspond generally in position with left and right eyes of the user behind the cover 6-103. In at least one example, the scene cameras 6-106 are oriented generally forward in the Y-direction to capture images in front of the user during use of the HMD 6-100. In at least one example, the scene cameras are color cameras and provide images and content for MR video pass through to the display screens facing the user's eyes when using the HMD device 6-100. The scene cameras 6-106 can also be used for environment and object reconstruction.

In at least one example, the HMD 6-100 can include a controller electrically coupled to the various sensors and displays of the HMD 6-100. In one example, the controller is configured to cause mixed-reality video passthrough from the first and second scene cameras 6-106 to the rearward facing displays, respectively, including one or more images captured by the first and second scene cameras 6-106.

In at least one example, the sensor system 6-102 can include a first depth sensor 6-108 pointed generally forward in the Y-direction. In at least one example, the first depth sensor 6-108 can be used for environment and object reconstruction as well as user hand and body tracking. In at least one example, the sensor system 6-102 can include a second depth sensor 6-110 disposed centrally along the width (i.e., along the X-axis) of the HMD device 6-100. For example, the second depth sensor 6-110 can be disposed above the central nasal bridge or accommodating features over the nose of the user when donning the HMD 6-100. In at least one example, the second depth sensor 6-110 can be used for environment and object reconstruction as well as hand and body tracking. In at least one example, the second depth sensor can include a LIDAR sensor.

In at least one example, the sensor system 6-102 can include a depth projector 6-112 facing generally forward to project electromagnetic waves, for example in the form of a predetermined pattern of light dots, out into and within a field of view of the user and/or the scene cameras 6-106 or a field of view including and beyond the field of view of the user and/or scene cameras 6-106. In at least one example, the depth projector can project electromagnetic waves of light in the form of a dotted light pattern to be reflected off objects and back into the depth sensors noted above, including the depth sensors 6-108, 6-110. In at least one example, the depth projector 6-112 can be used for environment and object reconstruction as well as hand and body tracking.

In at least one example, the sensor system 6-102 can include downward facing cameras 6-114 with a field of view pointed generally downward relative to the HDM device 6-100 in the Z-axis. In at least one example, the downward cameras 6-114 can be disposed on left and right sides of the HMD device 6-100 as shown and used for hand and body tracking, headset tracking, and facial avatar detection and creation for display a user avatar on the forward facing display screen of the HMD device 6-100 described elsewhere herein. The downward cameras 6-114, for example, can be used to capture facial expressions and movements for the face of the user below the HMD device 6-100, including the cheeks, mouth, and chin.

In at least one example, the sensor system 6-102 can include jaw cameras 6-116. In at least one example, the jaw cameras 6-116 can be disposed on left and right sides of the HMD device 6-100 as shown and used for hand and body tracking, headset tracking, and facial avatar detection and creation for display a user avatar on the forward facing display screen of the HMD device 6-100 described elsewhere herein. The jaw cameras 6-116, for example, can be used to capture facial expressions and movements for the face of the user below the HMD device 6-100, including the user's jaw, cheeks, mouth, and chin. for hand and body tracking, headset tracking, and facial avatar In at least one example, the sensor system 6-102 can include side cameras 6-118. The side cameras 6-118 can be oriented to capture side views left and right in the X-axis or direction relative to the HMD device 6-100. In at least one example, the side cameras 6-118 can be used for hand and body tracking, headset tracking, and facial avatar detection and re-creation.

In at least one example, the sensor system 6-102 can include a plurality of eye tracking and gaze tracking sensors for determining an identity, status, and gaze direction of a user's eyes during and/or before use. In at least one example, the eye/gaze tracking sensors can include nasal eye cameras 6-120 disposed on either side of the user's nose and adjacent the user's nose when donning the HMD device 6-100. The eye/gaze sensors can also include bottom eye cameras 6-122 disposed below respective user eyes for capturing images of the eyes for facial avatar detection and creation, gaze tracking, and iris identification functions.

In at least one example, the sensor system 6-102 can include infrared illuminators 6-124 pointed outward from the HMD device 6-100 to illuminate the external environment and any object therein with IR light for IR detection with one or more IR sensors of the sensor system 6-102. In at least one example, the sensor system 6-102 can include a flicker sensor 6-126 and an ambient light sensor 6-128. In at least one example, the flicker sensor 6-126 can detect overhead light refresh rates to avoid display flicker. In one example, the infrared illuminators 6-124 can include light emitting diodes and can be used especially for low light environments for illuminating user hands and other objects in low light for detection by infrared sensors of the sensor system 6-102.

In at least one example, multiple sensors, including the scene cameras 6-106, the downward cameras 6-114, the jaw cameras 6-116, the side cameras 6-118, the depth projector 6-112, and the depth sensors 6-108, 6-110 can be used in combination with an electrically coupled controller to combine depth data with camera data for hand tracking and for size determination for better hand tracking and object recognition and tracking functions of the HMD device 6-100. In at least one example, the downward cameras 6-114, jaw cameras 6-116, and side cameras 6-118 described above and shown in FIG. 6-1 can be wide angle cameras operable in the visible and infrared spectrums. In at least one example, these cameras 6-114, 6-116, 6-118 can operate only in black and white light detection to simplify image processing and gain sensitivity.

Any of the features, components, and/or parts, including the arrangements and configurations thereof shown in FIG. 6-1 can be included, either alone or in any combination, in any of the other examples of devices, features, components, and parts shown in FIGS. 6-2-6-4 and described herein.

Likewise, any of the features, components, and/or parts, including the arrangements and configurations thereof shown and described with reference to FIGS. 6-2-6-4 can be included, either alone or in any combination, in the example of the devices, features, components, and parts shown in FIG. 6-1.

FIG. 6-2 illustrates a lower perspective view of an example of an HMD 6-200 including a cover or shroud 6-204 secured to a frame 6-230. In at least one example, the sensors 6-203 of the sensor system 6-202 can be disposed around a perimeter of the HDM 6-200 such that the sensors 6-203 are outwardly disposed around a perimeter of a display region or area 6-232 so as not to obstruct a view of the displayed light. In at least one example, the sensors can be disposed behind the shroud 6-204 and aligned with transparent portions of the shroud allowing sensors and projectors to allow light back and forth through the shroud 6-204. In at least one example, opaque ink or other opaque material or films/layers can be disposed on the shroud 6-204 around the display area 6-232 to hide components of the HMD 6-200 outside the display area 6-232 other than the transparent portions defined by the opaque portions, through which the sensors and projectors send and receive light and electromagnetic signals during operation. In at least one example, the shroud 6-204 allows light to pass therethrough from the display (e.g., within the display region 6-232) but not radially outward from the display region around the perimeter of the display and shroud 6-204.

In some examples, the shroud 6-204 includes a transparent portion 6-205 and an opaque portion 6-207, as described above and elsewhere herein. In at least one example, the opaque portion 6-207 of the shroud 6-204 can define one or more transparent regions 6-209 through which the sensors 6-203 of the sensor system 6-202 can send and receive signals. In the illustrated example, the sensors 6-203 of the sensor system 6-202 sending and receiving signals through the shroud 6-204, or more specifically through the transparent regions 6-209 of the (or defined by) the opaque portion 6-207 of the shroud 6-204 can include the same or similar sensors as those shown in the example of FIG. 6-1, for example depth sensors 6-108 and 6-110, depth projector 6-112, first and second scene cameras 6-106, first and second downward cameras 6-114, first and second side cameras 6-118, and first and second infrared illuminators 6-124. These sensors are also shown in the examples of FIGS. 6-3 and 6-4. Other sensors, sensor types, number of sensors, and relative positions thereof can be included in one or more other examples of HMDs.

Any of the features, components, and/or parts, including the arrangements and configurations thereof shown in FIG. 6-2 can be included, either alone or in any combination, in any of the other examples of devices, features, components, and parts shown in FIGS. 6-1 and 6-3-6-4 and described herein. Likewise, any of the features, components, and/or parts, including the arrangements and configurations thereof shown and described with reference to FIGS. 6-1 and 6-3-6-4 can be included, either alone or in any combination, in the example of the devices, features, components, and parts shown in FIG. 6-2.

FIG. 6-3 illustrates a front view of a portion of an example of an HMD device 6-300 including a display 6-334, brackets 6-336, 6-338, and frame or housing 6-330. The example shown in FIG. 6-3 does not include a front cover or shroud in order to illustrate the brackets 6-336, 6-338. For example, the shroud 6-204 shown in FIG. 6-2 includes the opaque portion 6-207 that would visually cover/block a view of anything outside (e.g., radially/peripherally outside) the display/display region 6-334, including the sensors 6-303 and bracket 6-338.

In at least one example, the various sensors of the sensor system 6-302 are coupled to the brackets 6-336, 6-338. In at least one example, the scene cameras 6-306 include tight tolerances of angles relative to one another. For example, the tolerance of mounting angles between the two scene cameras 6-306 can be 0.5 degrees or less, for example 0.3 degrees or less. In order to achieve and maintain such a tight tolerance, in one example, the scene cameras 6-306 can be mounted to the bracket 6-338 and not the shroud. The bracket can include cantilevered arms on which the scene cameras 6-306 and other sensors of the sensor system 6-302 can be mounted to remain un-deformed in position and orientation in the case of a drop event by a user resulting in any deformation of the other bracket 6-226, housing 6-330, and/or shroud.

Any of the features, components, and/or parts, including the arrangements and configurations thereof shown in FIG. 6-3 can be included, either alone or in any combination, in any of the other examples of devices, features, components, and parts shown in FIGS. 6-1-6-2 and 6-4 and described herein. Likewise, any of the features, components, and/or parts, including the arrangements and configurations thereof shown and described with reference to FIGS. 6-1-6-2 and 6-4 can be included, either alone or in any combination, in the example of the devices, features, components, and parts shown in FIG. 6-3.

FIG. 6-4 illustrates a bottom view of an example of an HMD 6-400 including a front display/cover assembly 6-404 and a sensor system 6-402. The sensor system 6-402 can be similar to other sensor systems described above and elsewhere herein, including in reference to FIGS. 6-1-6-3. In at least one example, the jaw cameras 6-416 can be facing downward to capture images of the user's lower facial features. In one example, the jaw cameras 6-416 can be coupled directly to the frame or housing 6-430 or one or more internal brackets directly coupled to the frame or housing 6-430 shown. The frame or housing 6-430 can include one or more apertures/openings 6-415 through which the jaw cameras 6-416 can send and receive signals.

In at least one example, an outward facing sensor assembly configured to capture images from an external environment in front of the head mountable device can include the first scene camera 6-106 pointed in a first direction and the second scene camera 6-106 pointed in a second direction, and an inward facing sensor assembly configured to capture images of the user when the user dons the head mountable device 6-100. The inward facing sensor assembly can include the various eye tracking camera 6-120 and 6-122 pointed in the rearward direction. In at least one example, the device 6-100 can include a controller electrically coupled to the outward facing sensor assembly and the inward facing sensor assembly. The controller can be configured to cause the rearward facing display to project first images captured by the outward facing sensor assembly and cause the forward facing display to project second images captured by the various eye tracking cameras 6-120, 6-122.

Any of the features, components, and/or parts, including the arrangements and configurations thereof shown in FIG. 6-4 can be included, either alone or in any combination, in any of the other examples of devices, features, components, and parts shown in FIGS. 6-1-6-3 and described herein. Likewise, any of the features, components, and/or parts, including the arrangements and configurations thereof shown and described with reference to FIGS. 6-1-6-3 can be included, either alone or in any combination, in the example of the devices, features, components, and parts shown in FIG. 6-4.

VII: Antennas

FIG. 7.0-1 illustrates a view of an example of an HMD display unit 100 including an antenna assembly 7.0-102. Section VII of the present application describes the antennas and various components, assemblies, and systems associated with the antenna system 7.0-102 of the HMD display unit 100.

7.1: Electronic Devices with Antenna Mounting Structures

Electronic devices may be provided with component mounting structures. The electronic devices may include portable electronic devices, wearable devices, desktop devices, embedded systems, and other electronic equipment. Illustrative configurations in which the electronic devices include a head-mounted device with a component mounting system may sometimes be described herein as an example.

Component mounting systems may be used to help mount electrical components in a device. As an example, a biasing member (sometimes referred to as a basing structure) may be used to help mount an antenna in the housing of a device. The biasing member, the antenna, and additional structures such as an antenna support member (sometimes referred to as an antenna support structure or antenna support) may form an antenna assembly that helps mount the antenna in a location in the device in which antenna signals are not blocked by conductive housing structures. If desired, biasing members may be used in mounting components other than antennas in a device. The use of biasing members to help mount antennas in head-mounted devices is illustrative.

A biasing member for an antenna assembly may be formed from a material such as structural foam or other compressible material that exhibits unidirectional compression and expansion characteristics. With this type of arrangement, the foam preferentially compresses and expands along a particular direction and exhibits little or no expansion and compression along orthogonal directions. The direction of preferential compression and expansion, which may sometimes be referred to as a preferential compression direction, unidirectional compression direction, preferential compression/expansion axis, axis of preferential compression, etc., need not be parallel with the surface normals of the biasing member. For example, a biasing member may be formed from a layer of foam with first and second opposing surfaces that are characterized by surface normals and the preferential compression direction may be oriented at a non-zero angle (e.g., an angle of at least 10°, at least 20°, less than 80°, less than 70°, or other suitable angle) with respect to the surface normals.

FIG. 7.1-1 is a top view of an illustrative electronic device that may include a component biasing member. In the example of FIG. 7.1-1, device 7.1-10 is a head-mounted device. As shown in FIG. 7.1-1, head-mounted device 7.1-10 may include housing 7.1-12. Housing 7.1-12 is configured to be worn on a user's head and may sometimes be referred to as a head-mounted housing or head-mounted support structure. Housing 7.1-12 may have curved head-shaped surfaces, a nose-bridge portion such as portion NB that is configured to rest on a user's nose when device 7.1-10 is on a user's head, may have a headband such as strap 7.1-12T for supporting device 7.1-10 on the user's head, and/or may have other features that allow device 7.1-10 to be worn by a user. Housing 7.1-12 may have walls or other structures that separate an interior region of device 7.1-10 such as interior region 7.1-42 from an exterior region surrounding device 7.1-10 such as exterior region 7.1-44. As an example, housing 7.1-12 may include a transparent layer that forms a housing wall on front F of device 7.1-10 such as display cover layer 7.1-12CG. Display cover layer 7.1-12CG may overlap a forward-facing display such as display 7.1-20 (e.g., a pixel array based on organic light-emitting diodes or other display panel). Electrical components 7.1-36 (e.g., integrated circuits, sensors, control circuitry, light-emitting diodes, lasers, and other light-emitting devices, other control circuits and input-output devices, etc.) may be mounted on printed circuits and/or other structures within device 7.1-10 (e.g., in interior region 7.1-42).

To present a user with images for viewing from eye boxes such as eye box 7.1-34, device 7.1-10 may include rear-facing displays in optical modules 7.1-16. There may be, for example, a left rear-facing display in a left optical module 7.1-16 for presenting an image through a left lens to a user's left eye in a left eye box 7.1-34 and a right rear-facing display in right optical module 7.1-16 for presenting an image through a right lens to a user's right eye in a right eye box 7.1-34.

The user's eyes are located in eye boxes 7.1-34 at rear R of device 7.1-10 when inwardly facing surface 7.1-18 of housing 7.1-12 rests against the outer surface of the user's face. On rear R, housing 7.1-12 may have cushioned structures (sometimes referred to as light seal structures) to enhance user comfort as surface 7.1-18 rests against the user's face. Device 7.1-10 may have forward-facing components such has forward-facing cameras and other sensors on front F that face outwardly away from the user. These components may generally be oriented in the +Y (forward) direction of FIG. 7.1-1.

During operation, device 7.1-10 may receive image data (e.g., image data for video, still images, etc.) and may present this information on the displays of optical modules 7.1-16. Device 7.1-10 may also receive other data, control commands, user input, etc. Device 7.1-10 may transmit data to accessories and other electronic equipment. For example, image data from a forward-facing camera may be provided to an associated device, audio output may be provided to a device with speakers such as a headphone device, user input and sensor readings may be transmitted to remote equipment, etc.

Communications such as these may be supported using wired and/or wireless communications. In an illustrative configuration, components 7.1-36 may include wireless communications circuitry for supporting wireless communications between device 7.1-10 and remote wireless equipment (e.g., a cellular telephone, a wireless base station, a computer, headphones or other accessories, a remote control, peer devices, internet servers, and/or other equipment). Wireless communications may be supported using one or more antennas operating at one or more wireless communications frequencies. In an illustrative configuration, one or more antennas may be coupled to wireless transceiver circuitry. The wireless transceiver circuitry may include transmitter circuitry configured to transmit wireless communications signals using the antenna(s) and receiver circuitry configured to receive wireless communications signals using the antenna(s).

The wireless circuitry of device 7.1-10 may be formed from one or more integrated circuits, power amplifier circuitry, low-noise input amplifiers, passive RF components, one or more antennas, transmission lines, and other circuitry for handling RF wireless signals. The wireless circuitry may include radio-frequency transceiver circuitry for handling various radio-frequency communications bands. For example, the wireless circuitry of device 7.1-10 may include wireless local area network (WLAN) and wireless personal area network (WPAN) transceiver circuitry. This transceiver circuitry may handle 2.4 GHz and 5 GHz bands for WiFi® (IEEE 802.11) communications and other WLAN communications and the 2.4 GHz Bluetooth® communications band or other WPAN bands and may sometimes be referred to herein as WLAN/WPAN transceiver circuitry or local transceiver circuitry.

The wireless circuitry of device 7.1-10 may use remote wireless circuitry such as cellular telephone transceiver circuitry for handling wireless communications in frequency ranges (communications bands) such as a cellular low band (LB) from 600 to 960 MHz, a cellular low-midband (LMB) from 1410 to 1510 MHz, a cellular midband (MB) from 1710 to 2170 MHz, a cellular high band (HB) from 2300 to 2700 MHZ, a cellular ultra-high band (UHB) from 3300 to 5000 MHz, or other communications bands between 600 MHz and 5000 MHz. If desired, the cellular telephone transceiver circuitry may support 5G communications using a low band at 600-850 MHz, a mid-band at 2.5-3.7 GHZ, and a high band at 25-39 GHz. Wireless communications may also be provided using other frequency ranges (e.g., frequencies above 100 MHz, above 1 GHz, 1-30 GHz, 100 Mhz-300 GHz, 24 GHz, less than 300 GHz, less than 100 GHz, 10-300 GHz or other mm-wave frequencies, and/or other suitable frequencies). WLAN/WPAN transceiver circuitry and/or cellular transceiver circuitry may handle voice data and non-voice data.

If desired, the antennas and other wireless circuitry of device 7.1-10 may include satellite navigation system circuitry such as Global Positioning System (GPS) receiver circuitry for receiving GPS signals at 1575 MHz or for handling other satellite positioning data (e.g., GLONASS signals at 1609 MHz). Satellite navigation system signals are received from a constellation of satellites orbiting the earth. Wireless circuitry in device 7.1-10 can include circuitry for other short-range (local) and long-range (remote) wireless links if desired. For example, wireless circuitry in device 7.1-10 may be provided to receive television and radio signals, paging signals, near field communications (NFC) signals at 13.56 MHz or other suitable NFC frequencies, ultrawideband (UWB) signals (e.g., UWB signals from 6-8.5 GHZ, UWB signals from 3.5-9 GHZ, etc.). Wireless circuitry in device 7.1-10 may also include antennas and transceiver for handling sensing applications (e.g., radar). If desired, antennas may be provided in arrays (e.g., phased antenna arrays) that support beam steering. These arrangements and other arrangements may be used in supporting wireless communications, wireless sensing, wireless location services, wireless power, and other wireless operations.

The wireless circuitry of device 7.1-10 may include antennas that are formed using any suitable antenna types. For example, the antennas of device 7.1-10 may include antennas with resonating elements that are formed from slot antenna structures, loop antenna structures, patch antenna structures, stacked patch antenna structures, antenna structures having parasitic elements, inverted-F antenna structures, planar inverted-F antenna structures, helical antenna structures, monopole antennas, dipole antenna structures, Yagi (Yagi-Uda) antenna structures, surface integrated waveguide structures, coils, hybrids of these designs, etc. If desired, one or more of the antennas may be cavity-backed antennas.

Different types of antennas may be used for different bands and combinations of bands. For example, one type of antenna may be used in forming a local wireless link antenna whereas another type of antenna is used in forming a remote wireless link antenna. If desired, space may be conserved within device 7.1-10 by using a single antenna to handle two or more different communications bands. For example, a single antenna in device 7.1-10 may be used to handle communications in a WiFi® or Bluetooth® communication band while also handling communications at one or more cellular telephone frequencies. In some configurations, some cellular telephone communications (e.g., low-band and mid-band communications) may be handled using a first antenna (e.g., an inverted-F antenna), whereas other communications (e.g., high-band communications) may be handled using one or more phased antenna arrays (e.g., multiple linear patch antenna arrays each of which is mounted in a different orientation and each of which has a different angle of view so that a desired amount of angular coverage is achieved).

To provide antenna structures in device 7.1-10 with the ability to cover different frequencies of interest, one or more of the antennas of device 7.1-10 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna). If desired, antenna(s) in device 7.1-10 may be provided with adjustable circuits such as tunable components that tune the antenna over communications (frequency) bands of interest. The tunable components may be part of a tunable filter or tunable impedance matching network, may be part of an antenna resonating element, may span a gap between an antenna resonating element and antenna ground, etc.

Radio-frequency transmission line paths may be used to convey antenna signals between the radio-frequency transceiver circuitry of device 7.1-10 and the antenna(s) of device 7.1-10. These paths may include one or more radio-frequency transmission lines (sometimes referred to herein simply as transmission lines). Radio-frequency transmission line paths may each include a positive signal conductor and a ground signal conductor. Transmission lines in device 7.1-10 may include coaxial cable transmission lines, stripline transmission lines, microstrip transmission lines, edge-coupled microstrip transmission lines, edge-coupled stripline transmission lines, transmission lines formed from waveguide structures (e.g., coplanar waveguides or grounded coplanar waveguides), and combinations of these types of transmission lines and/or other transmission line structures.

If desired, matching networks may be used to help match impedances in the wireless circuitry of device 7.1-10. A matching network may, for example, include components such as inductors, resistors, and capacitors configured to match the impedance of an antenna to the impedance of an associated radio-frequency transmission line path that is used in coupling the antenna to a transceiver. Matching network components may be provided as discrete components (e.g., surface mount technology components) or may be formed from housing structures, printed circuit board structures, traces on plastic supports, etc. Components such as these may also be used in forming antenna filter circuitry and may be tunable and/or fixed components.

Radio-frequency transmission line paths may be coupled to antenna feed structures associated with antennas in device 7.1-10. As an example, an antenna in device 7.1-10 such as an inverted-F antenna, a planar inverted-F antenna, a patch antenna, a loop antenna, or other antenna may have an antenna feed with a positive antenna feed terminal and a ground antenna feed terminal. The positive antenna feed terminal may be coupled to an antenna resonating (radiating) element within the antenna. The ground antenna feed terminal may be coupled to an antenna ground in the antenna. The positive feed terminal may be coupled to a positive signal line in a transmission line and the ground feed terminal may be coupled to a ground signal line in the transmission line.

Other types of antenna feed arrangements may be used if desired. For example, an antenna may be fed using multiple feeds each coupled to a respective port of a transceiver over a corresponding transmission line. If desired, a given transmission line signal conductor may be coupled to multiple locations on an antenna and/or switches may be interposed within the paths between a transceiver and the feed terminals of an antenna.

FIG. 7.1-2 is a diagram of illustrative wireless communications circuitry for device 7.1-10. As shown in FIG. 7.1-2, the wireless circuitry includes radio-frequency transceiver 7.1-60, which is coupled to antenna 7.1-40 by transmission line 7.1-62. Antenna 7.1-40 may have an antenna resonating element 7.1-52 and antenna ground 7.1-50. Antenna resonating element 7.1-52 may be formed from any suitable antenna resonating element structures. In the example of FIG. 2, antenna resonating element 7.1-52 is an inverted-F antenna resonating element having resonating element arm 7.1-56, which is coupled to ground 7.1-50 by return path 7.1-54 and which is fed using antenna feed 7.1-58. Feed 7.1-58 has positive and ground feed terminals coupled respectively to positive and ground signal lines in transmission line 7.1-62. Conductive structures making up antenna 7.1-40 may be formed from thin-film metal traces on printed circuits (e.g., rigid printed circuit boards formed from fiberglass-filled epoxy and other rigid printed circuit board substrate material and/or flexible printed circuits formed from sheets of polyimide or other flexible polymer substrates), metal traces on molded polymer antenna substrates, metal traces on other dielectric substrates, metal foil, conductive structural members such as portions of a housing for device 7.1-10 (e.g., a metal chassis and/or other internal and/or external frame structures, metal housing walls, metal component support brackets, and/or other conductive housing structures), and/or other structures in device 7.1-10 that are formed from metal and/or other conductive material.

Antennas may be mounted within device 7.1-10 using mounting brackets, using biasing structures that press antenna components against housing structures, using adhesive, using screws and other fasteners, using press-fit connections, using solder, welds, conductive adhesive, and/or other conductive attachment mechanisms, and/or other mounting arrangements. Due to the order of assembly of device components (e.g., due to the desire to assemble some components such as a display cover layer and/or other housing structures after other structures such as the rear of housing 7.1-12 and optical modules 7.1-16 have been assembled), it may be desirable to mount an antenna using a compressible structure such as a layer of foam or other biasing member that helps bias the antenna towards a known (reference) location in the device when the display cover layer or other housing structure is attached to other device structures.

Consider, as an example, the illustrative antenna mounting structures of FIG. 7.1-3. As shown in FIG. 7.1-3, antenna 7.1-40 may be formed from antenna substrate 7.1-64 (e.g., a flexible printed circuit or other substrate, which may be planar, as shown in FIG. 7.1-3, or which may have a curved developable surface and/or a surface of compound curvature). Antenna substrate 7.1-64 contains metal traces 7.1-66 that have been patterned to form antenna resonating element 7.1-52 and/or other antenna structures.

Antenna 7.1-40 may be mounted in interior 7.1-42 using an antenna support member such as support member 7.1-68 (sometimes referred to as a support structure or support). Support member 7.1-68 may be formed from polymer, glass, ceramic, or other dielectric and/or other materials (e.g., metal, etc.) and/or combinations of these materials. A biasing member such as member 7.1-70 (sometimes referred to as a biasing structure) may be located between antenna 7.1-40 and support member 7.1-68. Member 7.1-70 may be formed from a compressible structure (e.g., one or more springs, foam layers, elastomeric polymer layers, and/or other structures that can exhibit a restoring force when compressed). This allows member 7.1-70 to provide a biasing force that helps hold antenna 7.1-40 (e.g., substrate 7.1-64) against the inner surface of cover layer 7.1-12CG and/or other portions of device 7.1-10 such as other housing structures. As an example, member 7.1-68 may be mounted in device 7.1-10 so that antenna 7.1-40 faces outwardly towards front F (e.g., in the +Y direction away from eye boxes 7.1-34). After mounting member 7.1-68 in this way, one or more additional layers of material may be installed in device 7.1-10 (e.g., by attaching such layer(s) to housing sidewalls and/or other housing structures). The layers of material that are installed in this way (which may sometimes be referred to as housing layers) may include cosmetic covering layers (e.g., a ring-shaped cover, sometimes referred to as a shroud or shroud trim, that runs around the border of display 7.1-20, a tinted polymer layer that covers display 7.1-20 on the front of device 7.1-10 (sometimes referred to as a shroud canopy), display cover layer 7.1-12CG, and/or other layer(s) of material. During installation of one or more of these housing layers (e.g., layer 7.1-12CG, shroud layer(s), etc.), a curved inner surface or other inner surface of layer 7.1-12CG and/or other housing layer(s) may contact antenna 7.1-40 and may press antenna 7.1-40 towards member 7.1-68. This compresses biasing member 7.1-70, which generates a restoring force (biasing force) that helps hold antenna 7.1-40 in place against the inner surface of layer 7.1-12CG and/or other overlapping housing layers. In this way, the location of antenna 7.1-40 relative to layer 7.1-12CG and/or other housing layers may be reliably established.

Substrate 7.1-64 may be formed from a layer with opposing first and second sides characterized by respective surface normals (see, e.g., surface normal n). In configurations in which antenna 7.1-40 (e.g., substrate 7.1-64) and member 7.1-70 are compressed in a direction parallel that is parallel to the surface normal n of antenna 7.1-40 and substrate 7.1-64, member 7.1-70 will compress in the absence of sheering forces (off-axis forces with respect to surface normal n). In some configurations, however, the inner surface of layer 7.1-12CG (or other structure against which antenna 7.1-40 is being placed) may exert force on antenna 7.1-40 and member 7.1-70 in a direction that is orientated at a non-zero angle (see, e.g., angle A2 of FIG. 7.1-4, which may be between 10° and 80°, between 20° and 70°, etc.) with respect to surface normal n. For example, the inner surface of layer 7.1-12CG may be angled with respect to the Y axis. As a result, sheering forces may be generated that give rise to uncertainty in the lateral placement (location along the X axis) of antenna 7.1-40 after an overlapping layer such as layer 7.1-12CG and/or other overlapping housing layer(s) has been assembled into device 7.1-10.

To overcome undesired lateral movement of antenna 7.1-40 in response to installation of layer 7.1-12CG or other overlapping layer(s) and associated application of force from layer 7.1-12CG or other overlapping layer(s) onto antenna 7.1-40 and member 7.1-70, member 7.1-70 may be formed from a compressible structure that exhibits preferential compression along an axis (sometimes referred to as a compression axis, unidirectional compression axis, axis of compression, axis of preferential compression, preferential axis of compression, or unidirectional axis of compression) that is not parallel to surface normals such as surface normal n that are associated with the inner surface of the display cover layer, the surfaces of the antenna substrate, and the adjacent surface of member 7.1-70.

The use of a biasing member with a preferential axis of compression that is not parallel to surface normal n shown in FIG. 7.1-4. In the example of FIG. 7.1-4, member 7.1-70 has been formed from a polymer such as polymer foam (e.g., elastomeric open-cell and/or closed-cell foam). Fibers 7.1-72 (e.g., strands of polymer, glass, carbon, or other materials) have been embedded into member 7.1-70. Most or all of fibers 7.1-72 extend parallel to the X axis of FIG. 7.1-4, which is perpendicular to the Y axis of FIG. 7.1-4, and/or the lengths of fibers 7.1-72 that run parallel to the X axis are longer than those of fibers 7.1-72 that run parallel to the Y axis. The presence of fibers 7.1-72 helps preferentially stiffen and reduce compressibility in member 7.1-70 along the direction in which fibers 7.1-72 are aligned). As a result, the foam material of member 7.1-70 of FIG. 7.1-4 exhibits elevated resistance to compression along the X axis (oriented at a non-zero angle A1 with respect to surface normal n in the example of FIG. 4) and exhibits lowered (e.g., less) resistance to compression along the Y axis (oriented at a non-zero angle A2 with respect to surface normal n in the example of FIG. 7.1-4). The Y axis in this example serves as the preferential axis of compression for member 7.1-70. Because member 7.1-70 compresses and stretches along the Y axis but does not significantly compress or stretch along the X axis, which is orthogonal to the Y axis, member 7.1-70 may sometimes be referred to as unidirectional structural foam antenna biasing member (unidirectional structural foam antenna biasing structure) or unidirectional antenna biasing member (unidirectional antenna biasing structure).

FIG. 7.1-5 is a diagram illustrating the behavior of member 7.1-70 of FIG. 7.1-4 when exposed to applied force along the Y axis (e.g., a direction that is at a non-zero angle A2 with respect to surface normal n). Initially, member 7.1-70 is uncompressed and has thickness T. After compression, member 7.1-70 has reduced thickness TR. Due to the presence of fibers 7.1-72 (FIG. 7.1-4) and/or other structures that promote uniaxial expansion and contraction, when force is applied to the surfaces of member 7.1-70 along the Y axis, member 7.1-70 compresses in direction 7.1-74 along the Y axis from its initially uncompressed state to a compressed state (see, e.g., compressed member shape 7.1-70' of FIG. 7.1-5). During these compression activities, compression occurs along the Y axis and not the orthogonal X axis. As a result, the opposing outwardly facing and inwardly facing surfaces of member 7.1-70 do not shift laterally (e.g., there is no movement of these surfaces relative to each other along the X axis). This helps ensure that antenna 7.1-40 is mounted in a desired location in device 7.1-10 and does not experience undesirable lateral movement during assembly.

FIG. 7.1-6 shows how the uniaxial compression properties of member 7.1-70 may be used to help ensure satisfactory placement of antenna 7.1-40 within device 7.1-10. As shown in FIG. 7.1-6, forward-facing display 7.1-20 may be mounted under display cover layer 7.1-12CG, so that images on display 7.1-20 may be viewed on front F of device 7.1-10. If desired, an air gap may separate display 7.1-20 from display cover layer 7.1-12CG. One or more additional structures (e.g., a shroud having a ring-shaped trim portion that surrounds the pixels of display 7.1-20 and having a canopy portion that covers the pixels of display 7.1-20) may optionally be located between display cover layer 7.1-12CG and antenna 7.1-40, as shown by illustrative dielectric layer(s) 7.1-85. As an example, device 7.1-10 may include an internal housing structure such as a polymer structure forming a shroud (e.g., layer 7.1-85 may be a polymer should layer) and this layer may be interposed between layer 7.1-12CG and antenna 7.1-40. The shroud in this type of arrangement may have a ring shape that extends around the periphery of display 7.1-20 and/or may have portions that overlap display 7.1-20. In general, antenna 7.1-40 may be overlapped by any structure having a surface (e.g., an inner surface) against which antenna 7.1-40 is mounted. The overlapping structure, which may be a housing structure such as display cover layer 7.1-12CG, a shroud trim member, a shroud canopy, or other polymer layer, a dielectric housing wall, and/or any other dielectric member (sometimes referred to as a housing structure or housing layer), may have an inwardly facing surface against which antenna 7.1-40 is mounted. In the illustrative configuration of FIG. 7.1-6, the housing layer that overlaps antenna 7.1-40 is display cover layer 7.1-12CG (or, in the situation where optional interposed layer 7.1-85 is present, the layer that overlaps antenna 7.1-40 is a polymer layer that is between layer 7.1-12CG and antenna 7.1-40). These are illustrative examples. In general, any suitable polymer layer or other dielectric structure may overlap antenna 7.1-40 and may have a surface against which antenna 7.1-40 may be mounted during assembly of device 7.1-10.

In the illustrative configuration of FIG. 7.1-6, antenna 7.1-40 is mounted in device 7.1-10 in peripheral (edge) region 7.1-80 (on the right side of device 7.1-10 in the example of FIG. 7.1-6) under layer 7.1-12CG. Layer 7.1-12CG (and/or other housing structures overlapping antenna 7.1-40) may be planar or may be curved and may be tilted to the right sufficiently to create a region of surface 7.1-84 with a surface normal that is angled with respect to the X and Y axes of FIG. 7.1-6 (see, e.g., surface normal n of antenna 7.1-40, which is parallel to the surface normal of surface 7.1-84 in region 7.1-80). Because region 7.1-80 is angled away from the central portion of layer 7.1-12CG (or other overlapping dielectric layer) and may have a curved cross-sectional profile, region 7.1-80 may sometimes be referred to as forming a curved edge portion of layer 7.1-12CG or a curved edge portion of other overlapping housing layer.

Antenna 7.1-40 is attached (e.g., with adhesive) to biasing member 7.1-70 (e.g., a layer of unidirectional structural foam of the type descried in connection with FIGS. 7.1-4 and 7.1-5 that is configured to serve as an antenna biasing member). Member 7.1-70 has a first side that faces antenna 7.1-40 and an opposing second side that faces support member 7.1-68. Member 7.1-70 is attached (e.g., with adhesive) to support member 7.1-68. Support member 7.1-68, in turn, is mounted to housing 7.1-12 (e.g., fastener 7.1-82 may be used to attach member 7.1-68 to portion 7.1-12P of housing 7.1-12 and/or other attachment mechanisms may be used to secure member 7.1-68 relative to housing 7.1-12 on rear R and/or elsewhere in device 7.1-10). When device 7.1-10 is assembled, there is generally slight compression of member 7.1-70 (e.g., along the Y axis), which creates a restoring force outward against inner surface 7.1-84. The arrangement of FIG. 7.1-6 therefore places antenna 7.1-40 in a known spatial relationship with overlapping structures such display cover layer 7.1-12CG (e.g., in direct contact with surface 7.1-84), thereby eliminating uncertainty in the distance between antenna 7.1-40 and layer 7.1-12CG. This may help avoid the possibility of forming variable-size air gaps between antenna 7.1-40 and surface 7.1-84, which could have varying impacts on antenna performance. Layer 7.1-12CG and/or other overlapping housing structures (e.g., a polymer shroud layer or other polymer layer) is preferably formed from a dielectric such as glass or polymer, so radio-frequency antenna signals for antenna 7.1-40 may pass through portion 7.1-80 of layer 7.1-12CG or other overlapping layer.

Antenna performance, which is affected by the distance between antenna 7.1-40 and the structures of device 7.1-10, and the reliability of the mounting arrangement shown in FIG. 7.1-6 could potentially be adversely affected by undesired lateral movement of antenna 7.1-40 relative to its nominal position under portion 7.1-80. This lateral movement is prevented by using uniaxial foam in forming member 7.1-70. During assembly of device 7.1-10, antenna 7.1-40, member 7.1-70, and member 7.1-68 are initially mounted to housing 7.1-12. In this initial state, the front wall of housing 7.1-12 (e.g., cover layer 7.1-12CG in the current example) may not be present. After components 7.1-36 have been installed within housing 7.1-12, cover layer 7.1-12CG and/or other overlapping housing layer(s) may be moved in the −Y direction and mounted to housing 7.1-12 (e.g., using adhesive layer 7.1-86, using fasteners, and/or using other attachment structures). Because surface normal n of antenna 7.1-40 and the opposing surface normal of surface 7.1-84 in edge region 7.1-80 are at a non-zero angle with respect to the Y axis (see, e.g., angle A2 of FIG. 7.1-4), movement of layer 7.1-12CG in the −Y direction creates a lateral force on antenna 7.1-40 and member 7.1-70 along the X axis that has the potential to compress member 7.1-70 laterally. Nevertheless, because member 7.1-70 is formed from unidirectional structural foam that preferentially compresses along the Y axis, this lateral movement (movement parallel to the X axis) is prevented. Rather, as layer 7.1-12CG (or other overlapping dielectric housing structure) is mounted to housing 7.1-12 and presses inwardly on antenna 7.1-40, member 7.1-70 compresses only along the Y axis. As a result, antenna 7.1-40 moves slightly in the −Y direction when pressed by surface 7.1-84, but does not shift position relative to the X axis. This ensures that antenna 7.1-40 is located satisfactorily in device 7.1-10 relative to housing 7.1-12 (which may include, for example, metal structures such as a metal chassis that forms some or all of antenna ground 7.1-50 of FIG. 7.1-2). Satisfactory performance of antenna 7.1-40 may therefore be achieved.

Although sometimes described herein in the context of an antenna biasing member in a head-mounted device, unidirectional structural foam or other compressible structures with a unidirectional axis of compression may be used in other contexts and/or devices. As an example, unidirectional structural foam may be used in device 7.1-10 for sound management (e.g., to exhibit preferential sound channeling along a particular direction), may be used for directional vibration absorption (perpendicular to the axis of fibers 7.1-72), may be used to exhibit directional electrical conductivity (e.g., for sensing and signal routing applications), and/or may otherwise be used in electronic devices that can benefit from elevated control of antenna placement and/or elevated control of the placement of other device components.

7.2: Systems with Transparent Layers

Electronic devices may be provided with components such as antennas. The electronic devices may include portable electronic devices, wearable devices, desktop devices, embedded systems, and other electronic equipment. Illustrative configurations in which the electronic devices include a head-mounted device may sometimes be described herein as an example.

The antennas in an electronic device may be configured to cover communications bands of interest (e.g., local area network bands, cellular telephone bands, etc.). To handle some communications such as 5G cellular communications, the antennas may include millimeter wave antennas (e.g., antennas operating at one or more frequencies between 20 GHz and 300 GHz, as an example). A millimeter wave antenna may use a phased-antenna array architecture in which multiple antenna elements such as patch antenna elements are arranged in an array (e.g., multiple patches in a row). During operation, the relative phases of each of the elements may be adjusted (e.g., so that the phased-antenna array performs beam steering).

Electronic device housing structures and other parts of an electronic device may include areas that are characterized by curved surfaces that can be flattened into a plane without distortion (sometimes referred to as developable surfaces or curved surfaces without compound curvature). Electronic device housing structures and other parts of an electronic device may also include areas that are characterized by compound curvature (surfaces that can only be flattened into a plane with distortion, sometimes referred to as non-developable surfaces). Mounting millimeter wave antennas and/or other antennas in an electronic device with curved surfaces can be challenging, because the presence of a curved surface adjacent to an antenna may give rise to different amounts of loading for different antenna elements in the antenna.

To help ensure satisfactory antenna operation when integrating a millimeter wave antenna into an electronic device with a curved structure, a dielectric member (sometimes referred to as a dielectric structure or dielectric layer) may be provided between the curved structure and the antenna. The dielectric member may have a planar surface facing the antenna. As an example, in a head-mounted device with a curved display cover layer, a polymer layer with a planar surface facing an antenna may be placed between the antenna and the curved display cover layer. In this way, the dielectric structure may help even out the amount of loading experienced by each antenna element in the antenna. The dielectric structure may also assist in impedance matching.

FIG. 7.2-1 is a top view of an illustrative electronic device having antennas such as one or more millimeter wave antennas. In the example of FIG. 7.2-1, device 7.2-10 is a head-mounted device. In general, device 7.2-10 may be any suitable electronic equipment.

As shown in FIG. 7.2-1, head-mounted device 7.2-10 may include housing 7.2-12. Housing 7.2-12 is configured to be worn on a user's head and may sometimes be referred to as a head-mounted housing or head-mounted support structure. Housing 7.2-12 may have curved head-shaped surfaces, a nose-bridge portion such as portion NB that is configured to rest on a user's nose when device 7.2-10 is on a user's head, may have a headband such as strap 7.2-12T for supporting device 7.2-10 on the user's head, and/or may have other features that allow device 7.2-10 to be worn by a user.

Housing 7.2-12 may have walls or other structures that separate an interior region of device 7.2-10 such as interior region 7.2-42 from an exterior region surrounding device

7.2-10 such as exterior region 7.2-44. As an example, housing 7.2-12 may include a transparent layer that forms a housing wall on front F of device 7.2-10 such as display cover layer 7.2-12CG. Housing 7.2-12 may also include internal frame structures (e.g., a metal chassis), cosmetic covering members, polymer layers (e.g., fully or partly transparent polymer layers), housing walls formed from polymer and/or other materials, and/or other housing structures. In an illustrative configuration, housing 7.2-12 includes a dielectric structure such as dielectric member 7.2-13 that is overlapped by display cover layer 7.2-12CG. Dielectric member 7.2-13, which may sometimes be referred to as a polymer layer, shroud, dielectric layer, or dielectric structure, may be formed from one or more individual dielectric structures (e.g., structures formed from polymer, glass, ceramic, and/or other dielectric). Member 7.2-13 may be formed in a ring shape that runs along the periphery of cover layer 7.2-12CG (e.g., under peripheral edge portion E of cover layer 7.2-12CG) or may, as shown in FIG. 7.2-1, overlap substantially all of display cover layer 7.2-12CG.

Display cover layer 7.2-12CG and member 7.2-13 may overlap a forward-facing display such as display 7.2-20 (e.g., a flexible display panel formed from a pixel array based on organic light-emitting diodes or other display panel). The portion of member 7.2-13 that overlaps display 7.2-20 may be formed from fully transparent polymer or partly transparent polymer that helps hide display 7.2-20 from view. The portion of member 7.2-13 in edge portion E may be opaque or transparent. Display cover layer 7.2-12CG may be formed from transparent polymer or glass (as examples).

Portions of display cover layer 7.2-12CG and member 7.2-13 such as edge portions of display cover layer 7.2-12CG and member 7.2-13 that surround display 7.2-20 may have curved cross-sectional profiles. As an example, edge portion E of cover layer 7.2-12CG and the underlying edge portion of member 7.2-13 may have one or more surfaces characterized by compound curvature (e.g., non-developable surfaces). The central portions of display cover layer 7.2-12CG and member 7.2-13 that overlap pixels of display 7.2-20 may have compound curvature and/or may have developable surfaces. In an illustrative arrangement, cover layer 7.2-12CG has inner and outer surfaces with compound curvature and member 7.2-13 has an outer surface of compound curvature around the edges of device 7.2-10 (e.g., the portion of member 7.2-13 surrounding display 7.2-20) and has developable inner and outer surfaces overlapping display 7.2-20. In the areas of compound curvature, at least some portions of the curved surface of layer 7.2-12CG and/or member 7.2-13 may be characterized by a radius of curvature R of 4 mm to 250 mm, 8 mm to 200 mm, 10 mm to 150 mm, at least 5 mm, at least 12 mm, at least 16 mm, at least 20 mm, at least 30 mm, less than 200 mm, less than 100 mm, less than 75 mm, less than 55 mm, less than 35 mm, and/or other suitable amount of curvature. In this illustrative configuration, display 7.2-20 may be a flexible display panel that is bent into a curved shape (e.g., a curved shape following the curved face of a user) and that is characterized by inner and outer developable surfaces. The portion of member 7.2-13 overlapping display 7.2-20 may have corresponding inner and outer developable surfaces. The innermost surface of member 7.2-13 in edge portion E may be planar to accommodate millimeter wave antennas. Other arrangements for the shapes of display cover layer 7.2-12CG and member 7.2-13 may be used in device 7.2-10, if desired.

Device 7.2-10 may include millimeter wave antennas and other antennas. Millimeter wave antennas may use phased-antenna arrays to implement beam steering. Each millimeter wave antenna may have an associated angle of view. To help provide satisfactory antenna coverage for device 7.2-10 at millimeter wave frequencies, it may be desired to provide device 7.2-10 with multiple millimeter wave antennas and to orient each of these antennas in a different direction so that the angular coverage of each of the antennas overlaps.

Consider, as an example, illustrative device 7.2-10 of FIG. 7.2-1, which has three millimeter wave antennas, each of which is pointed in a different direction. A first of the three antennas (millimeter wave antenna 7.2-40-1) is located under edge portion E of member 7.2-13 and cover layer 7.2-12CG on the left side of device 7.2-10. Antenna 7.2-40-1 is oriented in direction 7.2-72, which is rotated counter clockwise by angle AX relative to the Y axis (where the Y axis is oriented in the forward direction facing outwardly in front of device 7.2-10). A second of the three antennas (millimeter wave antenna 7.2-40-2) is located in the center of device 7.2-10, and, in this illustrative example, points straight ahead (in direction 7.2-74, along the Y axis). A third of the three antennas (millimeter wave antenna 7.2-40-3) is oriented in direction 7.2-76, which is rotated clockwise by an angle AX relative to the Y axis. Directions 7.2-72, 7.2-74, and 7.2-76 may each lie in the XY plane of FIG. 1 or may be angled above or below the XY plane. With this type of arrangement, each antenna has a respective angle of view VA (e.g., a value within the range of 15°–90°, as an example). By overlapping the angle-of-view coverage of each antenna (e.g., by pointing antenna 7.2-40-1 slightly to the left of center, by pointing antenna 7.2-40-2 straight ahead, and by pointing antenna 7.2-40-3 slightly to the right of center), device 7.2-10 can be provided with a larger angular coverage at millimeter wave frequencies than if only one of these antennas were to be used.

During operation, device 7.2-10 may receive image data (e.g., image data for video, still images, etc.) and may present this information on the displays of optical modules 7.2-16. Device 7.2-10 may also receive other data, control commands, user input, etc. Device 7.2-10 may transmit data to accessories and other electronic equipment. For example, image data from a forward-facing camera may be provided to an associated device, audio output may be provided to a device with speakers such as a headphone device, user input and sensor readings may be transmitted to remote equipment, etc.

Communications such as these may be supported using wired and/or wireless communications. In an illustrative configuration, components 7.2-36 may include wireless communications circuitry for supporting wireless communications between device 7.2-10 and remote wireless equipment (e.g., a cellular telephone, a wireless base station, a computer, headphones or other accessories, a remote control, peer devices, internet servers, and/or other equipment). Wireless communications may be supported using one or more antennas operating at one or more wireless communications frequencies (see, e.g., antennas 7.2-40-1, 7.2-40-2, and 7.2-40-3 of FIG. 7.2-1). In an illustrative configuration, one or more antennas may be coupled to wireless transceiver circuitry. The wireless transceiver circuitry may include transmitter circuitry configured to transmit wireless communications signals using the antenna(s) and receiver circuitry configured to receive wireless communications signals using the antenna(s).

The wireless circuitry of device 7.2-10 may be formed from one or more integrated circuits, power amplifier circuitry, low-noise input amplifiers, passive RF components, one or more antennas, transmission lines, and other circuitry for handling RF wireless signals. The wireless circuitry may include radio-frequency transceiver circuitry for handling various radio-frequency communications bands. For example, the wireless circuitry of device 7.2-10 may include wireless local area network (WLAN) and wireless personal area network (WPAN) transceiver circuitry. This transceiver circuitry may handle 2.4 GHz and 5 GHz bands for WiFi® (IEEE 802.11) communications and other WLAN communications and the 2.4 GHz Bluetooth® communications band or other WPAN bands and may sometimes be referred to herein as WLAN/WPAN transceiver circuitry or local transceiver circuitry.

The wireless circuitry of device 7.2-10 may use remote wireless circuitry such as cellular telephone transceiver circuitry for handling wireless communications in frequency ranges (communications bands) such as a cellular low band (LB) from 600 to 960 MHz, a cellular low-midband (LMB) from 1410 to 1510 MHz, a cellular midband (MB) from 1710 to 2170 MHz, a cellular high band (HB) from 2300 to 2700 MHZ, a cellular ultra-high band (UHB) from 3300 to 5000 MHz, or other communications bands between 600 MHz and 5000 MHz. If desired, the cellular telephone transceiver circuitry may support 5G communications using a low band at 600-850 MHz, a mid-band at 2.5-3.7 GHZ, and a high band at 25-39 GHz. Wireless communications may also be provided using other frequency ranges (e.g., frequencies above 100 MHz, above 1 GHz, 1-30 GHz, 100 Mhz-300 GHz, 24 GHz, less than 300 GHz, less than 100 GHz, 10-300 GHz or other millimeter wave frequencies, and/or other suitable frequencies). WLAN/WPAN transceiver circuitry and/or cellular transceiver circuitry may handle voice data and non-voice data.

If desired, the antennas and other wireless circuitry of device 7.2-10 may include satellite navigation system circuitry such as Global Positioning System (GPS) receiver circuitry for receiving GPS signals at 1575 MHz or for handling other satellite positioning data (e.g., GLONASS signals at 1609 MHz). Satellite navigation system signals are received from a constellation of satellites orbiting the earth. Wireless circuitry in device 7.2-10 can include circuitry for other short-range (local) and long-range (remote) wireless links if desired. For example, wireless circuitry in device 7.2-10 may be provided to receive television and radio signals, paging signals, near field communications (NFC) signals at 13.56 MHz or other suitable NFC frequencies, ultrawideband (UWB) signals (e.g., UWB signals from 6-8.5 GHZ, UWB signals from 3.5-9 GHZ, etc.). Wireless circuitry in device 7.2-10 may also include antennas and transceiver for handling sensing applications (e.g., radar). If desired, antennas may be provided in arrays (e.g., phased antenna arrays) that support beam steering. These arrangements and other arrangements may be used in supporting wireless communications, wireless sensing, wireless location services, wireless power, and other wireless operations.

The wireless circuitry of device 7.2-10 may include antennas that are formed using any suitable antenna types. For example, the antennas of device 7.2-10 may include antennas with resonating elements that are formed from slot antenna structures, loop antenna structures, patch antenna structures, stacked patch antenna structures, antenna structures having parasitic elements, inverted-F antenna structures, planar inverted-F antenna structures, helical antenna structures, monopole antennas, dipole antenna structures, Yagi (Yagi-Uda) antenna structures, surface integrated waveguide structures, coils, hybrids of these designs, etc. If desired, one or more of the antennas may be cavity-backed antennas.

Different types of antennas may be used for different bands and combinations of bands. For example, one type of antenna may be used in forming a local wireless link antenna whereas another type of antenna is used in forming a remote wireless link antenna. If desired, space may be conserved within device 7.2-10 by using a single antenna to handle two or more different communications bands. For example, a single antenna in device 7.2-10 may be used to handle communications in a WiFi® or Bluetooth® communication band while also handling communications at one or more cellular telephone frequencies. In some configurations, some cellular telephone communications (e.g., low-band and mid-band communications) may be handled using a first antenna (e.g., an inverted-F antenna), whereas other communications (e.g., high-band cellular communications) may be handled using one or more phased antenna arrays (e.g., multiple linear patch antenna arrays each of which is mounted in a different orientation and each of which has a different angle of view so that a desired amount of angular coverage is achieved).

To provide antenna structures in device 7.2-10 with the ability to cover different frequencies of interest, one or more of the antennas of device 7.2-10 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna). If desired, antenna(s) in device 7.2-10 may be provided with adjustable circuits such as tunable components that tune the antenna over communications (frequency) bands of interest. The tunable components may be part of a tunable filter or tunable impedance matching network, may be part of an antenna resonating element, may span a gap between an antenna resonating element and antenna ground, etc.

Radio-frequency transmission line paths may be used to convey antenna signals between the radio-frequency transceiver circuitry of device 7.2-10 and the antenna(s) of device 7.2-10. These paths may include one or more radio-frequency transmission lines (sometimes referred to herein as transmission lines). Radio-frequency transmission line paths may each include a positive signal conductor and a ground signal conductor. Transmission lines in device 7.2-10 may include coaxial cable transmission lines, stripline transmission lines, microstrip transmission lines, edge-coupled microstrip transmission lines, edge-coupled stripline transmission lines, transmission lines formed from waveguide structures (e.g., coplanar waveguides or grounded coplanar waveguides), and combinations of these types of transmission lines and/or other transmission line structures.

If desired, matching networks may be used to help match impedances in the wireless circuitry of device 7.2-10. A matching network may, for example, include components such as inductors, resistors, and capacitors configured to match the impedance of an antenna to the impedance of an associated radio-frequency transmission line path that is used in coupling the antenna to a transceiver. Matching network components may be provided as discrete components (e.g., surface mount technology components) or may be formed from housing structures, printed circuit board structures, traces on plastic supports, etc. Components such as these may also be used in forming antenna filter circuitry and may be tunable and/or fixed components.

Radio-frequency transmission line paths may be coupled to antenna feed structures associated with antennas in device 7.2-10. As an example, an antenna in device 7.2-10 such as an inverted-F antenna, a planar inverted-F antenna, a patch antenna, a loop antenna, or other antenna may have an antenna feed with a positive antenna feed terminal and a ground antenna feed terminal. The positive antenna feed terminal may be coupled to an antenna resonating (radiating) element within the antenna. The ground antenna feed terminal may be coupled to an antenna ground in the antenna. The positive feed terminal may be coupled to a positive signal line in a transmission line and the ground feed terminal may be coupled to a ground signal line in the transmission line.

Other types of antenna feed arrangements may be used if desired. For example, an antenna may be fed using multiple feeds each coupled to a respective port of a transceiver over a corresponding transmission line. If desired, a given transmission line signal conductor may be coupled to multiple locations on an antenna and/or switches may be interposed within the paths between a transceiver and the feed terminals of an antenna.

FIG. 7.2-2 is a front view of device 7.2-10 showing illustrative locations for millimeter wave antennas 7.2-40-1, 7.2-40-2, and 7.2-40-3. As shown in FIG. 7.2-2, front-facing display 7.2-20 may be surrounded by peripheral edge portions E of display cover layer 7.2-12CG (which may be formed from dielectric materials such as glass and/or polymer) and dielectric member 7.2-13, and these dielectric structures may overlap antennas 7.2-40-1, 7.2-40-2, and 7.2-40-3. During operation, transmitted antenna signals from the millimeter wave antennas and received antenna signals for the millimeter wave antennas may pass through display cover layer 7.2-12CG and member 7.2-13. To enhance antenna efficiency, conductive structures such as conductive pixel structures and other conductive structures associated with display 7.2-20 may be present only in the center of device 7.2-10 (e.g., edge portions E may be free of any conductive display structures overlapping the millimeter wave antennas).

FIG. 7.2-3 is a cross-sectional side view of an illustrative millimeter wave antenna. As shown in FIG. 7.2-3, the wireless circuitry of device 7.2-10 includes radio-frequency transceiver 7.2-60. Transceiver 7.2-60 may be coupled to antenna 7.2-40 by signal path 7.2-62 (e.g., one or more transmission lines). The configuration of millimeter wave antenna 7.2-40 of FIG. 7.2-3 may be used for antenna 7.2-40-1, may be used for antenna 7.2-40-2, and may be used for antenna 7.2-40-3. As shown in FIG. 7.2-3, millimeter wave antenna 7.2-40 may have multiple antenna elements 7.2-40E. Elements 7.2-40E may be formed from millimeter wave antenna resonating elements such as patch antenna elements (e.g., patch antennas formed from thin-film metal structures). The patch antennas may be arranged in a linear array (e.g., a line) on antenna substrate 7.2-40B (e.g., a printed circuit substrate, a ceramic or glass layer, or other dielectric substrate). A ground for antenna 7.2-40 may be formed from a ground antenna trace in substrate 7.2-40B and/or other conductive structures in device 7.2-10 (e.g., a metal chassis in device 7.2-10, a heat sink in device 7.2-10, a support bracket in device 7.2-10, etc.). Antenna 7.2-40 (e.g., elements 7.2-40E and substrate 7.2-40B) may have a planar surface that is characterized by a surface normal (see, e.g., surface normal nb of FIG. 7.2-3). During operation, the control circuitry of device 7.2-10 may perform beam steering operations by adjusting the relative phases of the signals for each respective element 7.2-40E. In this way, angle BA of antenna beam direction 7.2-92 relative to antenna surface normal nb (e.g., the direction in which antenna 7.2-40 is nominally pointed) may be adjusted (e.g., to ensure that antenna signals are transmitted and received along a direction that provides satisfactory antenna performance).

Antennas may be mounted within device 7.2-10 using mounting brackets, using biasing structures that press antenna components against housing structures, using adhesive, using screws and other fasteners, using press-fit connections, using solder, welds, conductive adhesive, and/or other conductive attachment mechanisms, using one or more frames, carriers, and/or other internal support structures, and/or other mounting arrangements.

To ensure even loading for each of elements 7.2-40E, antenna 7.2-40 may be mounted adjacent to a planar dielectric structure that is evenly spaced from each of elements 7.2-40E. In arrangements such as the arrangement of FIGS. 7.2-1 and 7.2-2, in which edge portion E of display cover layer 7.2-12CG has an inner surface with a curved cross-sectional profile (e.g., an inwardly facing concave surface of compound curvature), a dielectric structure such as dielectric member 7.2-13 that is located between display cover layer 7.2-12CG and antenna 7.2-40 may be used to form the planar dielectric structure. (Arrangements in which the planar inner surface is formed directly on the inner side of layer 7.2-12CG and in which member 7.2-13 is omitted may also be used, if desired).

Consider, as an example, the top cross-sectional view of the left front corner of device 7.2-10 that is shown in FIG. 7.2-4. As shown in FIG. 7.2-4, the inner and outer surfaces of display cover layer 7.2-12CG (e.g., the surfaces of edge portion E of layer 7.2-12CG) may have curved cross-sectional profiles. These surfaces may have compound curvature. For example, inner surface 7.2-83 of display cover layer 7.2-12CG may be a concave surface of compound curvature. Antenna elements 7.2-40E of antenna 7.2-40 are supported on planar outer surface 7.2-82 of substrate 7.2-40B. To equalize antenna loading for each of the elements 7.2-40E in antenna 7.2-40 and thereby facilitate beam forming by antenna 7.2-40, dielectric member 7.2-13 may be provided with planar inner surface 7.2-70 that is parallel to planar surface 7.2-82 (e.g., surface normal na of surface 7.2-70 may be parallel to surface normal nb of surface 7.2-82). This ensures that each antenna element 7.2-40E will be separated from surface 7.2-70 by an air gap of equal size, thereby ensuring equal loading on each element 7.2-40E.

The outer surface of member 7.2-13 may be curved (e.g., the outer surface of member 7.2-13 that is attached to or adjacent to inner surface 7.2-83 of layer 7.2-12CG may have a convex shape such as a convex shape with compound curvature that matches the concave shape of surface 7.2-83). The permittivity of member 7.2-13, the thickness of member 7.2-13, and the size of the air gap between antenna 7.2-40 and member 7.2-13 may be selected to help match the impedance of antenna 7.2-40 to the impedance of layer 7.2-12CG, thereby reducing antenna signal reflections. In an illustrative configuration, the permittivity of layer 7.2-12CG has a first permittivity value, the permittivity of air has a second permittivity value that is lower than the first permittivity value, and the permittivity of the polymer that makes up member 7.2-13 has a third permittivity value that is between the first and second values. This configuration may help match the impedance of antenna 7.2-40 to that of layer 7.2-12CG. The presence of the air gap between antenna 7.2-40 and member 7.2-13 may help reduce surface waves and may facilitate assembly of device 7.2-10 (e.g., by physically decoupling antenna 7.2-40 from overlapping structures such as member 7.2-13).

Antenna 7.2-40 may be supported on internal housing structures and/or other support structures (see, e.g., illustrative support structures 7.2-86 of FIG. 7.2-4). The support structures under antenna 7.2-40 may include a metal plate and/or other heatsink structure (see, e.g., heat sink 7.2-84). In the illustrative configuration of FIG. 7.2-4, antenna 7.2-40 is located on the left front corner of device 7.2-10 (e.g., antenna 7.2-40 of FIG. 7.2-4 may serve as antenna 7.2-40-1 of FIG. 7.2-1). If desired, the approach of FIG. 7.2-4 may be used to form antenna 7.2-40-3 on the right front corner of device.

In the center of device 7.2-10, antenna 7.2-40-2 may be installed using an arrangement of the type shown in the top view of FIG. 7.2-5. A shown in FIG. 7.2-5, antenna 7.2-40 (e.g., antenna 7.2-40-2 of FIG. 7.2-1) may be mounted on heatsink 7.2-84 and support structure 7.2-86 so that the planar outer surface of antenna 7.2-40 faces an opposing inwardly facing planar surface of member 7.2-13. The adjacent surfaces of member 7.2-13 and antenna 7.2-40 may be parallel to each other (e.g., surface normal na may be parallel to surface normal nb).

7.3: Systems with Transparent Layers

Electronic devices may be provided with components such as antennas. The electronic devices may include portable electronic devices, wearable devices, desktop devices, embedded systems, and other electronic equipment. Illustrative configurations in which the electronic devices include a head-mounted device may sometimes be described herein as an example.

Antennas may be formed from thin flexible substrates such as flexible printed circuits. A flexible printed circuit antenna may have metal traces that are patterned to form an antenna resonating element (sometimes referred to as an antenna resonating structure or antenna resonator). The metal traces may be supported by a flexible printed circuit substrate layer. The flexible printed circuit substrate layer may be formed from one or more sheets of polyimide or layers of other polymer.

Electronic device housing structures and other parts of an electronic device may include areas that are characterized by curved surfaces that can be flattened into a plane without distortion (sometimes referred to as developable surfaces or curved surfaces without compound curvature). Electronic device housing structures and other parts of an electronic device may also include areas that are characterized by compound curvature (surfaces that can only be flattened into a plane with distortion, sometimes referred to as non-developable surfaces).

To help conform a flexible printed circuit antenna to a surface of an electronic device housing structure or other dielectric member in an electronic device and/or to otherwise provide the antenna with a shape that facilitates installation and use of the antenna in a device with potentially complex shapes such as surfaces with compound curvature, a flexible printed circuit antenna may be formed into a three-dimensional shape (e.g., an unwrinkled shape characterized by surfaces of compound curvature). A flexible printed circuit antenna that has been provided with compound curvature surfaces in this way may then be attached to a supporting housing structure with compound curvature. For example, a flexible printed circuit antenna with compound curvature may be laminated to a dielectric member having matching compound curvature using a layer of adhesive.

FIG. 7.3-1 is a top view of an illustrative electronic device that may include a flexible printed circuit antenna with compound curvature. In the example of FIG. 7.3-1, device 7.3-10 is a head-mounted device. In general, device 7.3-10 may be any suitable electronic equipment.

As shown in FIG. 7.3-1, head-mounted device 7.3-10 may include housing 7.3-12. Housing 7.3-12 is configured to be worn on a user's head and may sometimes be referred to as a head-mounted housing or head-mounted support structure. Housing 7.3-12 may have curved head-shaped surfaces, a nose-bridge portion such as portion NB that is configured to rest on a user's nose when device 7.3-10 is on a user's head, may have a headband such as strap 7.3-12T for supporting device 7.3-10 on the user's head, and/or may have other features that allow device 7.3-10 to be worn by a user.

Housing 7.3-12 may have walls or other structures that separate an interior region of device 7.3-10 such as interior region 7.3-42 from an exterior region surrounding device 7.3-10 such as exterior region 7.3-44. As an example, housing 7.3-12 may include a transparent layer that forms a housing wall on front F of device 7.3-10 such as display cover layer 7.3-12CG. Housing 7.3-12 may also include internal frame structures (e.g., a metal chassis), cosmetic covering members, polymer layers (e.g., fully or partly transparent polymer layers), housing walls formed from polymer and/or other materials, and/or other housing structures. In an illustrative configuration, housing 7.3-12 includes a dielectric structure such as dielectric member 7.3-13 that is overlapped by display cover layer 7.3-12CG. Dielectric member 7.3-13, which may sometimes be referred to as a polymer layer, shroud, dielectric layer, or dielectric structure, may be formed from one or more individual dielectric structures (e.g., structures formed from polymer, glass, ceramic, and/or other dielectric). In the example of FIG. 7.3-1, dielectric member 7.3-13, includes a first dielectric layer such as polymer layer 7.3-13-1 that extends across substantially all of front F of device 7.3-10 (e.g., layer 7.3-13-1 of FIG. 7.3-1 has a footprint similar to or the same as that of layer 7.3-12CG). With this arrangement, layer 7.3-13-1, which may sometimes be referred to as a shroud canopy or shroud, has a central portion that overlaps display 7.3-20 and has a peripheral portion (e.g., the portion under edge portion E of display cover layer 7.3-12CG) with a ring shaped footprint that surrounds display 7.3-20. Dielectric member 7.3-13 of FIG. 7.3-1 also has a second polymer layer such as layer 7.3-13-2. Layer 7.3-13-2, which may sometimes be referred to as a shroud trim or shroud, may have a ring shape that surrounds display 7.3-20. In the peripheral portion of member 7.3-13, layers 7.3-13-1 and 7.3-13-2 may be attached to each other using adhesive, press-fit connections, screws or other fasteners, and/or other attachment mechanisms.

Display cover layer 7.3-12CG and member 7.3-13 (e.g., layer 7.3-13-1) may overlap a forward-facing display such as display 7.3-20 (e.g., a flexible display panel formed from a pixel array based on organic light-emitting diodes or other display panel). Layer 7.3-13-1 may be formed from fully transparent polymer or partly transparent polymer that helps hide display 7.3-20 from view. Display cover layer 7.3-12CG may be formed from transparent polymer or glass (as examples).

Portions of display cover layer 7.3-12CG and member 7.3-13 such as edge portions of display cover layer 7.3-12CG and member 7.3-13 that surround display 7.3-20 may have curved cross-sectional profiles. As an example, edge portion E of cover layer 7.3-12CG and the underlying edge portion of member 7.3-13 may have inner and/or outer surfaces characterized by compound curvature (e.g., non-developable surfaces). The central portions of display cover layer 7.3-12CG and member 7.3-13 may have compound curvature and/or may have developable surfaces. In an illustrative arrangement, cover layer 7.3-12CG has inner and outer surfaces with compound curvature and member 7.3-13 has surfaces of compound curvature around the edges of device 7.3-10 (e.g., the portion of member 7.3-13 surrounding display 7.3-20) and has developable surfaces overlapping display 7.3-20. In this illustrative configuration, display 7.3-20 may be a flexible display panel that is bent into a curved shape (e.g., a curved shape following the curved face of a user) and that is characterized by inner and outer developable surfaces. The portion of member 7.3-13 overlapping display 7.3-20 may have corresponding inner and outer developable surfaces. Other arrangements for the shapes of display cover layer 7.3-12CG and member 7.3-13 may be used in device 7.3-10, if desired.

Device 7.3-10 may have one or more antennas. As an example, antenna 7.3-40 may be mounted in device 7.3-10 along the edge of display 7.3-20. As shown in FIG. 7.3-1, antenna 7.3-40 may, as an example, be mounted to the inner surface of dielectric member 7.3-13 under edge portion E of display cover layer 7.3-12CG. During operation, antenna signals may pass through these overlapping dielectric structures.

Antenna 7.3-40 may be attached to the surface of member 7.3-13 (e.g., the inner surface of layer 7.3-13-2 in the example of FIG. 7.3-1) using adhesive 7.3-15. The portion of the inner surface of member 7.3-13 to which antenna 7.3-40 is mounted in this way may have compound curvature. Antenna 7.3-40 may be formed from a flexible printed circuit with matching compound curvature.

Device 7.3-10 may include electrical components 7.3-36 (e.g., integrated circuits, sensors, control circuitry, light-emitting diodes, lasers, and other light-emitting devices, other control circuits and input-output devices, etc.). Components 7.3-36 may be mounted on printed circuits and/or other structures within device 7.3-10 (e.g., in interior region 7.3-42).

To present a user with images for viewing from eye boxes such as eye box 7.3-34, device 7.3-10 may include rear-facing displays in optical modules 7.3-16. There may be, for example, a left rear-facing display in a left optical module 7.3-16 for presenting an image through a left lens to a user's left eye in a left eye box 7.3-34 and a right rear-facing display in right optical module 7.3-16 for presenting an image through a right lens to a user's right eye in a right eye box 7.3-34.

The user's eyes are located in eye boxes 7.3-34 at rear R of device 7.3-10 when inwardly facing surface 7.3-18 of housing 7.3-12 rests against the outer surface of the user's face. On rear R, housing 7.3-12 may have cushioned structures (sometimes referred to as light seal structures) to enhance user comfort as surface 7.3-18 rests against the user's face. Device 7.3-10 may have forward-facing components such has forward-facing cameras and other sensors on front F that face outwardly away from the user. These components may generally be oriented in the +Y (forward) direction of FIG. 7.3-1.

During operation, device 7.3-10 may receive image data (e.g., image data for video, still images, etc.) and may present this information on the displays of optical modules 7.3-16. Device 7.3-10 may also receive other data, control commands, user input, etc. Device 7.3-10 may transmit data to accessories and other electronic equipment. For example, image data from a forward-facing camera may be provided to an associated device, audio output may be provided to a device with speakers such as a headphone device, user input and sensor readings may be transmitted to remote equipment, etc.

Communications such as these may be supported using wired and/or wireless communications. In an illustrative configuration, components 7.3-36 may include wireless communications circuitry for supporting wireless communications between device 7.3-10 and remote wireless equipment (e.g., a cellular telephone, a wireless base station, a computer, headphones or other accessories, a remote control, peer devices, internet servers, and/or other equipment). Wireless communications may be supported using one or more antennas operating at one or more wireless communications frequencies (see, e.g., antenna 7.3-40 of FIG. 7.3-1). In an illustrative configuration, one or more antennas may be coupled to wireless transceiver circuitry. The wireless transceiver circuitry may include transmitter circuitry configured to transmit wireless communications signals using the antenna(s) and receiver circuitry configured to receive wireless communications signals using the antenna (s).

The wireless circuitry of device 7.3-10 may be formed from one or more integrated circuits, power amplifier circuitry, low-noise input amplifiers, passive RF components, one or more antennas, transmission lines, and other circuitry for handling RF wireless signals. The wireless circuitry may include radio-frequency transceiver circuitry for handling various radio-frequency communications bands. For example, the wireless circuitry of device 7.3-10 may include wireless local area network (WLAN) and wireless personal area network (WPAN) transceiver circuitry. This transceiver circuitry may handle 2.4 GHz and 5 GHz bands for WiFi® (IEEE 802.11) communications and other WLAN communications and the 2.4 GHz Bluetooth® communications band or other WPAN bands and may sometimes be referred to herein as WLAN/WPAN transceiver circuitry or local transceiver circuitry.

The wireless circuitry of device 7.3-10 may use remote wireless circuitry such as cellular telephone transceiver circuitry for handling wireless communications in frequency ranges (communications bands) such as a cellular low band (LB) from 600 to 960 MHz, a cellular low-midband (LMB) from 1410 to 1510 MHz, a cellular midband (MB) from 1710 to 2170 MHz, a cellular high band (HB) from 2300 to 2700 MHZ, a cellular ultra-high band (UHB) from 3300 to 5000 MHz, or other communications bands between 600 MHz and 5000 MHz. If desired, the cellular telephone transceiver circuitry may support 5G communications using a low band at 600-850 MHz, a mid-band at 2.5-3.7 GHZ, and a high band at 25-39 GHz. Wireless communications may also be provided using other frequency ranges (e.g., frequencies above 100 MHz, above 1 GHz, 1-30 GHz, 100 Mhz-300 GHz, 24 GHz, less than 300 GHz, less than 100 GHz, 10-300 GHz or other mm-wave frequencies, and/or other suitable frequencies). WLAN/WPAN transceiver circuitry and/or cellular transceiver circuitry may handle voice data and non-voice data.

If desired, the antennas and other wireless circuitry of device 7.3-10 may include satellite navigation system circuitry such as Global Positioning System (GPS) receiver circuitry for receiving GPS signals at 1575 MHz or for handling other satellite positioning data (e.g., GLONASS signals at 1609 MHz). Satellite navigation system signals are received from a constellation of satellites orbiting the earth. Wireless circuitry in device 7.3-10 can include circuitry for other short-range (local) and long-range (remote) wireless links if desired. For example, wireless circuitry in device 7.3-10 may be provided to receive television and radio signals, paging signals, near field communications (NFC) signals at 13.56 MHz or other suitable NFC frequencies, ultrawideband (UWB) signals (e.g., UWB signals from 6-8.5 GHZ, UWB signals from 3.5-9 GHZ, etc.). Wireless circuitry in device 7.3-10 may also include antennas and transceiver for handling sensing applications (e.g., radar). If desired, antennas may be provided in arrays (e.g., phased antenna arrays) that support beam steering. These arrangements and other arrangements may be used in supporting wireless communications, wireless sensing, wireless location services, wireless power, and other wireless operations.

The wireless circuitry of device 7.3-10 may include antennas that are formed using any suitable antenna types. For example, the antennas of device 7.3-10 may include antennas with resonating elements that are formed from slot antenna structures, loop antenna structures, patch antenna structures, stacked patch antenna structures, antenna structures having parasitic elements, inverted-F antenna structures, planar inverted-F antenna structures, helical antenna structures, monopole antennas, dipole antenna structures, Yagi (Yagi-Uda) antenna structures, surface integrated waveguide structures, coils, hybrids of these designs, etc. If desired, one or more of the antennas may be cavity-backed antennas.

Different types of antennas may be used for different bands and combinations of bands. For example, one type of antenna may be used in forming a local wireless link antenna whereas another type of antenna is used in forming a remote wireless link antenna. If desired, space may be conserved within device 7.3-10 by using a single antenna to handle two or more different communications bands. For example, a single antenna in device 7.3-10 may be used to handle communications in a WiFi® or Bluetooth® communication band while also handling communications at one or more cellular telephone frequencies. In some configurations, some cellular telephone communications (e.g., low-band and mid-band communications) may be handled using a first antenna (e.g., an inverted-F antenna), whereas other communications (e.g., high-band cellular communications) may be handled using one or more phased antenna arrays (e.g., multiple linear patch antenna arrays each of which is mounted in a different orientation and each of which has a different angle of view so that a desired amount of angular coverage is achieved).

To provide antenna structures in device 7.3-10 with the ability to cover different frequencies of interest, one or more of the antennas of device 7.3-10 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna). If desired, antenna(s) in device 7.3-10 may be provided with adjustable circuits such as tunable components that tune the antenna over communications (frequency) bands of interest. The tunable components may be part of a tunable filter or tunable impedance matching network, may be part of an antenna resonating element, may span a gap between an antenna resonating element and antenna ground, etc.

Radio-frequency transmission line paths may be used to convey antenna signals between the radio-frequency transceiver circuitry of device 7.3-10 and the antenna(s) of device 7.3-10. These paths may include one or more radio-frequency transmission lines (sometimes referred to herein as transmission lines). Radio-frequency transmission line paths may each include a positive signal conductor and a ground signal conductor. Transmission lines in device 7.3-10 may include coaxial cable transmission lines, stripline transmission lines, microstrip transmission lines, edge-coupled microstrip transmission lines, edge-coupled stripline transmission lines, transmission lines formed from waveguide structures (e.g., coplanar waveguides or grounded coplanar waveguides), combinations of these types of transmission lines and/or other transmission line structures.

If desired, matching networks may be used to help match impedances in the wireless circuitry of device 7.3-10. A matching network may, for example, include components such as inductors, resistors, and capacitors configured to match the impedance of an antenna to the impedance of an associated radio-frequency transmission line path that is used in coupling the antenna to a transceiver. Matching network components may be provided as discrete components (e.g., surface mount technology components) or may be formed from housing structures, printed circuit board structures, traces on plastic supports, etc. Components such as these may also be used in forming antenna filter circuitry and may be tunable and/or fixed components.

Radio-frequency transmission line paths may be coupled to antenna feed structures associated with antennas in device 7.3-10. As an example, an antenna in device 7.3-10 such as an inverted-F antenna, a planar inverted-F antenna, a patch antenna, a loop antenna, or other antenna may have an antenna feed with a positive antenna feed terminal and a ground antenna feed terminal. The positive antenna feed terminal may be coupled to an antenna resonating (radiating) element within the antenna. The ground antenna feed terminal may be coupled to an antenna ground in the antenna. The positive feed terminal may be coupled to a positive signal line in a transmission line and the ground feed terminal may be coupled to a ground signal line in the transmission line.

Other types of antenna feed arrangements may be used if desired. For example, an antenna may be fed using multiple feeds each coupled to a respective port of a transceiver over a corresponding transmission line. If desired, a given transmission line signal conductor may be coupled to multiple locations on an antenna and/or switches may be interposed within the paths between a transceiver and the feed terminals of an antenna.

FIG. 7.3-2 is a diagram of illustrative wireless communications circuitry for device 7.3-10. As shown in FIG. 7.3-2, the wireless circuitry includes radio-frequency transceiver 7.3-60, which is coupled to antenna 7.3-40 by transmission line 7.3-62. Antenna 7.3-40 may have an antenna resonating element 52 (sometimes referred to as an antenna resonating structure or antenna resonator) and antenna ground 7.3-50. Antenna resonating element 52 may be formed from any suitable antenna resonating element structures. In the example of FIG. 7.3-2, antenna resonating element 52 is an inverted-F antenna resonating element having resonating element arm 7.3-56, which is coupled to ground 7.3-50 by return path 7.3-54 and which is fed using antenna feed 7.3-58. Feed 7.3-58 has positive and ground feed terminals coupled respectively to positive and ground signal lines in transmission line 7.3-62. Conductive structures making up antenna 7.3-40 may be formed from thin-film metal traces on printed circuits (e.g., flexible printed circuits formed from sheets of polyimide or other flexible polymer substrates). If desired, the conductive structures making up antenna 7.3-40 (e.g., ground structures for antenna 7.3-40) may include conductive structural members such as portions of a housing for device 7.3-10 (e.g., a metal chassis and/or other internal and/or external frame structures, metal housing walls, metal component support brackets, and/or other conductive housing structures), and/or other structures in device 7.3-10 that are formed from metal and/or other conductive material.

Antennas may be mounted within device 7.3-10 using mounting brackets, using biasing structures that press antenna components against housing structures, using adhesive, using screws and other fasteners, using press-fit connections, using solder, welds, conductive adhesive, and/or other conductive attachment mechanisms, using one or more frames, carriers, and/or other internal support structures, and/or other mounting arrangements. In an illustrative configuration, flexible printed circuit antenna 7.3-40 has compound curvature and is attached to an overlapping dielectric member such as display cover layer 7.3-12CG and/or member 7.3-13 that has an opposing surface of matching compound curvature. By matching the compound curvature of the substrate of antenna 7.3-40 to the compound curvature of an associated overlapping dielectric layer, antenna 7.3-40 may be configured to fit within the potentially tight confines of device 7.3-10 without adversely affecting the shape and appearance of device 7.3-10. As an example, by matching the compound curvature of the substrate of antenna 7.3-40 to the compound curvature of an overlapping dielectric structure such as member 7.3-13, antenna 7.3-40 can be attached to the inner surface or outer surface of member 7.3-13 with adhesive. Display cover layer 7.3-12CG may then be mounted on device 7.3-10 so that edge portion E of layer 7.3-12CG overlaps member 7.3-13 and antenna 7.3-40.

Consider, as an example, the illustrative antenna structures of FIG. 7.3-3. As shown in FIG. 7.3-3, antenna 7.3-40 may be formed from antenna substrate 7.3-64. Substrate 7.3-64 may be formed from a flexible printed circuit with a surface of compound curvature (sometimes referred to as a non-developable surface). Antenna substrate 7.3-64 contains metal traces such as metal trace 7.3-66 (e.g., a patterned thin-film metal layer). In an illustrative configuration, substrate 7.3-64 has an upper layer (e.g., an upper polyimide layer or other sheet of polymer) and a lower layer (e.g., a lower polyimide layer or other sheet of polymer) and trace 7.3-66 is formed from a patterned thin-film metal layer that is between the upper and lower layers. Trace 7.3-66 is patterned to form antenna resonating element 52 (FIG. 7.3-2) and/or other antenna structures. Antenna 7.3-40 of FIG. 7.3-3 is formed from a planar sheet of printed circuit substrate material that was contoured in a contouring tool to produce a desired three-dimensional shape with compound curvature. At least some portions of the curved surface of substrate 7.3-64 may be characterized by a radius of curvature R of 4 mm to 250 mm, 8 mm to 200 mm, 10 mm to 150 mm, at least 5 mm, at least 12 mm, at least 16 mm, at least 20 mm, at least 30 mm, less than 200 mm, less than 100 mm, less than 75 mm, less than 55 mm, less than 35 mm, and/or other suitable amount of curvature.

After forming a flexible printed circuit antenna with compound curvature of the type shown in FIG. 7.3-3, this compound curvature flexible printed circuit antenna may be attached to the surface of a dielectric support structure in device 7.3-10. In an illustrative arrangement, the compound curvature flexible printed circuit antenna is attached to the inner surface of dielectric member 7.3-13 using a layer of adhesive. FIG. 7.3-4 is a cross-sectional side view of an illustrative vacuum lamination tool that may be used in attaching antenna 7.3-40 to member 7.3-13. As shown in FIG. 7.3-4, tool 7.3-70 may have movable upper and lower dies such as upper die 7.3-82 with concave surface 7.3-72 and lower die 7.3-74 with convex surface 7.3-76. Surfaces 7.3-72 and 7.3-76 may be characterized by compound curvature (e.g., compound curvature that matches the compound curvature of the inner and outer surfaces of member 7.3-13 and that matches the compound curvature of the inner and outer surfaces of flexible printed circuit antenna 7.3-40). Prior to lamination, a layer of adhesive such as adhesive 7.3-15 may be suspended between member 7.3-13 and antenna 7.3-40. During lamination, tool 7.3-70 may use vacuum enclosure 7.3-80 to produce a vacuum while member 30 is pressed against antenna 7.3-40 by moving die 7.3-82 towards die 7.3-74. While pressure is applied between member 7.3-13 and antenna 7.3-40 in this way, dies 7.3-82 and 7.3-74 may optionally apply heat to facilitate lamination. The presence of vacuum helps prevent air bubbles from forming as adhesive 7.3-15 is compressed between member 30 and antenna 7.3-40.

FIG. 7.3-5 is a cross-sectional side view of member 7.3-13 (e.g., layer 7.3-13-2 of FIG. 7.3-1 or other dielectric antenna support structure) following lamination in tool 7.3-70 to attach antenna 7.3-40 to member 7.3-13 with adhesive. In general, antenna 7.3-40 may be attached to an inner or outer surface of a supporting member and this attachment surface may have convex or concave curvature. In the example of FIG. 7.3-5, member 7.3-13 has an inwardly facing concave surface of compound curvature and the outwardly facing surface of antenna 7.3-40 has matching compound curvature.

After antenna 7.3-40 is attached to a shroud or other dielectric member (e.g., member 7.3-13 of FIG. 7.3-1 or other member) using adhesive 7.3-15, the shroud or other dielectric member may be attached to other portions of housing 7.3-12 (e.g., using screws or other fasteners, using adhesive, etc.). In arrangements in which member 7.3-13 is separate from cover layer 7.3-12CG, the attachment of antenna 7.3-40 to member 7.3-13 may help preserve the ability of cover layer 7.3-12CG to be removed (e.g., to permit rework or repair of device 7.3-10).

FIG. 7.3-6 is a perspective view of antenna 7.3-40 on member 7.3-13 taken from the outside of device 7.3-10 with cover layer 7.3-12CG removed. As shown in the example of FIG. 7.3-6, antenna 7.3-40 may be mounted to the underside (inner surface) of member 7.3-13. The outwardly facing surface of member 7.3-13 in FIG. 7.3-6 is convex. The opposing inwardly facing surface of member 7.3-13 in FIG. 7.3-6 is concave (e.g., the surface of member 7.3-13 on the far side of member 7.3-13 of FIG. 7.3-6 is concave). Antenna 7.3-40 may have an outwardly facing convex surface that is attached to the concave inwardly facing surface of member 7.3-13.

One or more metal structures in device 7.3-10 such as metal structure 7.3-90 (e.g., a metal chassis or other metal housing structure) may serve as antenna ground 7.3-50 of FIG. 7.3-2. Member 7.3-13 may have openings 7.3-92 through which leg portions or other protruding portions of antenna 7.3-40 may pass. In the example of FIG. 7.3-6, protruding portion 7.3-40-1 of antenna 7.3-40 has a return path metal trace (forming return path 7.3-54 of FIG. 7.3-2) that is shorted to metal structure 7.3-90 using metal fastener 7.3-94. Protruding portion 7.3-40-2 of antenna 7.3-40 may include a metal trace forming a positive feed terminal. A cable or other transmission line (see, e.g., transmission line 7.3-62 of FIG. 7.3-2) may be coupled to connector 7.3-96. Connector 7.3-96 may have a positive terminal coupled to the positive feed terminal and may have a negative terminal that is shorted to metal structure 7.3-90 (e.g., via metal fastener 7.3-98). Conductive adhesive, solder, welded connections, and/or other conductive connections may be used in attaching the metal trace of antenna 7.3-40 to metal structure 7.3-80 and connector 7.3-96, if desired. The use of fasteners 7.3-94 and 7.3-98 (e.g., screws) is illustrative. Following installation of member 7.3-13 and antenna 7.3-40 into device 7.3-10 (e.g., by attaching member 7.3-13 to housing 7.3-12 and attaching antenna 7.3-40 to structure 7.3-90), cover layer 7.3-12CG may be mounted to the front of housing 7.3-12, thereby covering member 7.3-13 and antenna 7.3-40 as shown in FIG. 7.3-1.

VIII: Bent MLB

FIG. 8-0 illustrates a view of an example of an HMD device 8-100. The HMD device 8-100 can include a logic board system 8-102 including one or more printed circuit boards, processors, other computing components, memory components, circuitry, and so forth mounted to one or more components of the HMD 8-100.

FIG. 8-1 illustrates a plan view of an example of a logic board 8-102, which can include a main logic board of the HMD 8-100 shown in FIG. 8-0. In at least one example, the logic board 8-102 includes a first portion 8-104 and a second portion 8-106 joined together at a transition portion 8-108. As shown in the top view of FIG. 8-23, in at least one example, the first portion 8-104 of the MLB 8-102 can be disposed at an angle θ relative to the second portion 8-106 of the MLB 8-102. In at least one example, the angle θ can disposed the first and second portions 8-104, 8-106 of the MLB 8-102 to accommodate the curvature of a user's face. For example, the lateral (left-to-right) direction of the user's face is curved and the HMD 8-100 can be generally curved to accommodate the user's face. This curvature can form a thin profile against the user's face and minimize the moment arm and thus the torque applied to the user's face from the HMD 8-100, including components within the HMD 8-100.

In order to accommodate the curvature of the user's face, not only is the outside or external surfaces of the HMD 8-100 curved, as shown in FIG. 8-0, but internal components of the HMD 8-100 can be similarly curved to fit tightly and compactly within the HMD 8-100 to minimize bulk and size of the device. For example, in at least one example, the angle θ of the first portion 8-104 relative to the second portion 8-106 can be between about 5-degrees and about 60-degrees to form a bent MLB 8-102. In one example, the angle θ can be between about 5-degrees and about 60-degrees. In one example, the angle θ can be between about 10-degrees and about 50-degrees. In one example, the angle θ can be between about 12-degrees and about 45-degrees. In one example, the angle θ can be about 15-degrees.

As shown in the close up top view of FIG. 8-24, the transition portion 8-108, which can be referred to as the bend portion 8-108, can be thinner than the first and second portion 8-104, 8-106, as shown. In at least one example, the MLB 8-102 can be manufactured and assembled, including the application of adhesive tapes and other components, while the MLB 8-102 is not bent. That is, in its resting state, the MLB 8-102 can be planar such that the first portion 8-104 is not disposed at an angle relative to the second portion 8-106. Then, when the MLB 8-102 is disposed within the HMD 8-100 during assembly/manufacture of the HMD 8-100, the MLB 8-102 can be bent at the transition/bend portion 8-108 as shown and fixed in position within the HMD 8-100.

Any of the features, components, and/or parts, including the arrangements and configurations thereof shown in FIGS. 8-1-8-3 can be included, either alone or in any combination, in any of the other examples of devices, features, components, and parts shown in FIGS. 8-4-8-5 and described herein. Likewise, any of the features, components, and/or parts, including the arrangements and configurations thereof shown and described with reference to FIGS. 8-4-8-5 can be included, either alone or in any combination, in the example of the devices, features, components, and parts shown in FIGS. 8-1-8-3.

FIG. 8-4 illustrates a cross-sectional view of another example of a MLB 8-202 including a first portion 8-204 and a second portion 8-206 with a transition portion 8-208 disposed between the first portion 8-204 and the second portion 8-206. In the illustrated example of FIG. 8-4, the MLB 8-202 is not bent at the transition portion 8-208, for example when the MLB 8-202 has not yet been bent for assembly within the HMD 8-100. In one example, the transition portion 8-208 is thinner than the first and second portion 8-204, 8-206 such that when the first and second portions 8-204, 8-206 are urged toward each other, the MLB 8-202 naturally bends at the transition portion 8-208.

In at least one example, the transition portion 8-208 includes a number of layers 8-201 including conductive layers, such as copper conductive layers, and insulation layers, including pre-preg insulation layers disposed between the conductive layers. The thicknesses of the layers for the first, second, and transition portions 8-204, 8-206, 8-208 of the MLB 8-202 can be between about 0.006 mm and about 0,053 mm. The number of layers, types of layers, and thicknesses of each of those layers can vary in other examples.

In at least one example, the transition portion 8-208 can include an upper combined coverlay-adhesive layer 8-203. In at least one example, the transition portion 8-208 can include a lower sliver shield layer 8-205 below a lower combined coverlay-adhesive layer 8-207. The copper and pre-preg layers can be disposed between the coverlay-adhesive layers 8-203, 8-207. The MLB 8-202 can include a core layer 8-209 disposed between adjacent copper layers and extending from the first portion 8-204, through the transition portion 8-208, on through the second portion 8-206 as a single core layer 8-209. Likewise, any of the other layers noted herein can extend from the first portion 8-204, through the transition portion 8-208, on through the second portion 8-206 as single continuous layers that cross the transition portion 8-208. In one example, the transition portion 8-208 is not a separate MLB portion disposed between separate, unconnected other portions. Rather, the transition portion 8-208 can be an integral part of the MLB 8-202 and include the same or similar layers of material electronically connecting or otherwise connecting the first and second portion 8-204, 8-206 thereof.

In at least one example, one or more core and/or conductive material layers extends continuously from the first portion 8-204 to the second portion 8-206 through the transition portion 8-208. In at least one example, one or more of these layers can form a thermal/heat connection between the first portion 8-204 and the second portion 8-206. In at least one example, there is no need for connectors between the first portion 8-204 and the second portion 8-208. In at least one example, the MLB 8-202 can include aluminum plating for solder-ability.

Any of the features, components, and/or parts, including the arrangements and configurations thereof shown in FIG. 8-4 can be included, either alone or in any combination, in any of the other examples of devices, features, components, and parts shown in FIGS. 8-1-8-3 and 8-5 and described herein. Likewise, any of the features, components, and/or parts, including the arrangements and configurations thereof shown and described with reference to FIGS. 8-1-8-3 and 8-5 can be included, either alone or in any combination, in the example of the devices, features, components, and parts shown in FIG. 8-4.

FIG. 8-5 illustrates a top perspective view of a subassembly of the HMD 8-100 including an MLB 8-302 and first and second fans 8-310*a*, 8-310*b* secured to the MLB 8-302. In at least one example the first fan 8-310*a* is secured to or adjacent the first portion 8-304 of the MLB 8-302 and the second fan 8-310*b* is secured to or adjacent the second portion 8-306 of the MLB 8-302. In such an example, the fans 8-310*a-b* can be disposed at the same angle relative to one another as the first and second portions 8-304, 8-306 of the MLB 8-302 are disposed relative to one another. In this way, the MLB 8-302 as well as the fans 310*a-b* can be disposed compactly within the curved HMD 8-100 device to minimize device volume.

In addition, the first and second fans 8-310*a-b* can be secured to the MLB 8-302 such that thermally conductive housings of the fans 8-310*a-b* can be thermally coupled to one or more heat-generating components of the MLB 8-302. In one example, the fans 8-310*a-b* can be secured to the first and second portions 8-304, 8-306 of the MLB 8-302 such that the housings of the fans 8-310*a-b* form at least part of one or more electromagnetic interference shields for components of the MLB 8-302. More details regarding the EMI shielding and thermal conductivity of the fans 8-310*a-b* with relation to the MLB are given elsewhere herein.

Any of the features, components, and/or parts, including the arrangements and configurations thereof shown in FIG. 8-5 can be included, either alone or in any combination, in any of the other examples of devices, features, components, and parts shown in FIGS. 8-1-8-4 and described herein. Likewise, any of the features, components, and/or parts, including the arrangements and configurations thereof shown and described with reference to FIGS. 8-1-8-5 and 8-5 can be included, either alone or in any combination, in the example of the devices, features, components, and parts shown in FIG. 8-5.

IX: Thermals

FIG. 9.0-1 illustrates a view of an HMD 100 including a thermal management system 102. The thermal management system 102 is described in more detail here in section IX.

9.1: Air Deflector for a Cooling System in a Head-Mounted Device

Head-mounted devices are an attractive technology for providing an immersive user experience. For example, head-mounted devices are gaining increased popularity for providing VR, AR, and MR experiences for applications such as gaming, movies, or simulations for professional training, among other potential applications.

Head-mounted devices can employ a wearable device housing that is secured to a user's head, and various electronic components within the housing, such as displays, integrated circuits, memory, audio devices, or electronic circuitry. As with other electronic devices, head-mounted devices can employ a cooling system based on circulation of air to maintain electronic components at desirable operating temperatures. The cooling system can also be used to cool the user's face from heat build-up inside the head-mounted device.

Maintaining efficient operation without unduly detracting from the user experience is a challenging task for head-mounted devices. The shape of the head-mounted device or layout of internal components can lead to a tortuous flow path for the cooling system. The proximity of the air flow path to the user's head can create undesired effects that detract from the user experience, such as excessive noise that interferes with the audio of the device in a noticeable manner. Some head-mounted devices may employ movable components that can interrupt the air flow path, such as adjustable optics that can be moved to account for a given user's interpupillary distance (IPD). IPD is defined as the distance between the centers of the pupils of a user's eyes. This adjustability can in turn make it difficult to design a cooling system in a given device that is suitable for different users.

According to some embodiments disclosed herein, a cooling system for a head-mounted device may employ an air deflector designed to affect a flow of air within the head-mounted device. The air deflector may be positioned in an air flow path extending through the housing of the head-mounted device, and can be designed to reduce the turbulence of air in the cooling system. For example, the air deflector can be positioned between a surface of an internal component and an incoming stream of air, at a reduced angle relative to the surface of the internal component so as to create smooth or more laminar flow over or across the component. The air deflector can be mounted to a movable component, such as an adjustable display assembly, so as to affect the flow of air as the moveable component is adjusted for particular users in a manner that results in a partial occlusion of the air flow path by the movable component. The air deflector can be configured to pivot or otherwise move to account for changes in the incident angle of air resulting from changes in the position of movable components. The air deflector can include or be coupled to additional thermal structures to enhance heat transfer affects resulting from the flow of air over the air deflector. For example, the air deflector can include an integrated heat sink and/or be coupled to heat-generating components via a thermally conductive interface material to enhance dissipation of heat from such components.

These and other embodiments are discussed below with reference to FIG. 9.1-1 through FIG. 9.1-9. However, those skilled in the art will readily appreciate that the detailed description given herein with respect to these Figures is for explanatory purposes only and should not be construed as limiting.

FIG. 9.1-1 illustrates an example of a head-mounted device 9.1-100 secured to a head 9.1-20 of a user 9.1-10. As seen in FIG. 9.1-1, the head-mounted device 9.1-100 can include a housing 9.1-110 that is securable to the user's head 9.1-20 via a securement element 9.1-150. The securement element 9.1-150 can include a band, a strap, a rim, temples of a glasses frame, or any other suitable mechanism that serves to secure and retain the housing 9.1-110 on the head 9.1-20 of the user 9.1-10. The securement element 9.1-150 can be an integral part of the housing 9.1-110 or be implemented as a separate component attached thereto. The housing 9.1-110 can further include or be coupled to one or more nose pads that serve to rest the housing 9.1-110 on the nose of the user 9.1-10.

The housing 9.1-110 can enclose and support various functional components therein, such as integrated circuits, memory devices, processors, electronic circuitry, input/output devices, or other electronic components. In FIG. 9.1-1, housing 9.1-110 is shown as containing a display 9.1-120, a controller 9.1-130, and an air circulation device 9.1-140 therein. The display 9.1-120 can be positioned in front of the eyes of the user 9.1-10 to provide information within the user's field of view. The air circulation device 9.1-140 can urge air through the housing 9.1-110 and over components such as the display 9.1-120 to cool such components. The controller 9.1-130 can be configured to control operation of one or more components, such as the display 9.1-120 and/or air circulation device 9.1-140.

The display 9.1-120 can transmit light from a physical environment for viewing by the user 9.1-10. For example, the display 9.1-120 can include optical elements, such as lenses for vision correction. The display 9.1-120 can be configured to present information in addition to (e.g., overlaid with) the physical environment viewed by the user. Alternatively, the display 9.1-120 can be configured to provide information to the exclusion of the physical environment. In either case, the display 9.1-120 can be configured to present graphics to, for example, present a computer-generated reality environment to the user 9.1-10.

A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

In contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations, (e.g., for accessibility reasons), adjustments to characteristic(s) of virtual object(s) in a CGR environment may be made in response to representations of physical motions (e.g., vocal commands).

A person may sense and/or interact with a CGR object using any one of their senses, including sight, sound, touch, taste, and smell. For example, a person may sense and/or interact with audio objects that create 3D or spatial audio environment that provides the perception of point audio sources in 3D space. In another example, audio objects may enable audio transparency, which selectively incorporates ambient sounds from the physical environment with or without computer-generated audio. In some CGR environments, a person may sense and/or interact only with audio objects.

Examples of CGR include virtual reality and mixed reality.

A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end.

In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationery with respect to the physical ground.

Different forms of head-mounted devices that enable a person to sense and/or interact with various CGR environments. Examples include smart glasses, helmets, visors, or goggles. A head-mounted device may have one or more speaker(s) and an integrated opaque display. Alternatively, a head-mounted system may be configured to accept an external opaque display (e.g., a smartphone). The head-mounted device may incorporate one or more imaging sensors to capture images or video of the physical environment, and/or one or more microphones to capture audio of the physical environment. Rather than an opaque display, a head-mounted device may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

FIG. 9.1-2 shows an example of the head-mounted device 9.1-100 in front view. As seen in FIG. 9.1-2, the display 9.1-120 (FIG. 9.1-1) can include a first display assembly 9.1-121*a* and a second display assembly 9.1-121*b*, which collectively form a pair of display assemblies corresponding to the two eyes of a user. Each of the display assemblies may include any appropriate combination of electronic and optical elements to present graphical information to the user. For example, each display assembly may include a display layer having an array of electronically controlled pixels that can provide a visual output. The display assembly may further include optical elements, such as lenses, mirrors, etc., and/or a gaze tracking device, to facilitate generation of an enhanced computer generated reality that is responsive to a gaze and/or pose of the user.

The pair of display assemblies can be mounted to the housing 9.1-110 and separated by a distance 9.1-215. The distance 9.1-215 between the pair of display assemblies can designed to correspond to the IPD of a user. The distance 9.1-215 can be adjustable to account for different IPDs of different users that may wear the head-mounted device 9.1-100. For example, either or both of the display assemblies may be movably mounted to the housing 9.1-110 to permit the display assemblies to move or translate laterally to make the distance 9.1-215 larger or smaller. Any type of manual or automatic mechanism may be used to permit the distance 9.1-215 between the display assemblies to be an adjustable distance. For example, the display assemblies can be mounted to the housing via slidable tracks or guides that permit manual or electronically actuated movement of one or more of the display assemblies to adjust the distance 9.1-215.

As seen in FIG. 9.1-2, the air circulation device 9.1-140 can be positioned in or otherwise mounted to the housing 9.1-110 so as to urge a flow of air through an interior space 9.1-225 of the housing 9.1-110. The housing 9.1-110 can include a port that permits fluid communication between the interior space 9.1-225 and an environment external to the housing 9.1-110, to create a flow path of air in the housing 9.1-110. In FIG. 9.1-2, the housing is shown with a pair of inlet ports 9.1-240 at a bottom side thereof, and an outlet port 9.1-250 at a top side thereof, which creates air flow paths 9.1-275 extending from the inlet ports 9.1-240 to the outlet port 9.1-250. Each of the ports can include a vent, screen, hole, porous membrane, and/or other fluidic opening that permits fluid communication thereacross. However, it is contemplated that the housing 9.1-110 can generally include any suitable number inlet ports and outlet ports in any suitable locations with respect to the housing to permit a flow of air therein. The air circulation device 9.1-140 can be implemented as a fan that is configured to draw air into the inlet port(s) 9.1-240 and urge air out of the outlet port 9.1-250. However, any suitable number of fans or other air circulation devices can be included to urge movement of air.

The air flow path 9.1-275 can extend over or across components such as heat-generating electronic components mounted within the housing. For example, the pair of display assemblies may include heat-generating display layers, and the air circulation device 9.1-140 may be configured to generate a flow of air so that the air flow path 9.1-275 extends over each of the display assemblies 9.1-121*a* and 9.1-121*b* to cool the heat-generating layers by dissipating heat therefrom. Alternatively, or in combination, the air circulation device 9.1-140 may be configured to circulate air over other electronic components, such as integrated circuit chips, other input/output devices, or the like, or across the user's face.

FIG. 9.1-3 shows an example of a display assembly 9.1-121, and an air flow path 9.1-275 extending over surfaces of the display assembly. The display assembly 9.1-121 can be one of a pair of display assemblies like in the example shown in FIG. 9.1-2, where each of the first and second display assemblies 9.1-121*a* and 9.1-121*b* can be configured similarly to the display assembly 9.1-121. As seen in FIG. 9.1-3, the display assembly 9.1-121 can include a display layer 9.1-314, a heat sink 9.1-342, a circuit board 9.1-370, one or more components 9.1-386 on the circuit board, and an enclosure 9.1-393 that serves to enclose and support the foregoing components.

As shown in FIG. 9.1-3, the display assembly 9.1-121 can have a front side for viewing images and a back side opposite the front side. The display layer 9.1-314 can include operative components of the display that form images capable of being viewed by the user from the front side thereof. The display layer 9.1-314 can, for example, include any suitable operational display panel having an array of electronically controlled pixels that can provide a visual output, such as an OLED, uLED, or LCD panel. The display assembly 9.1-121 can further include other optional components, which can support specialized display functions for providing an immersive head-mounted display. For example, the display assembly 9.1-121 can include as gaze-tracking devices or eye trackers (e.g., positioned beside the display layer 9.1-314), and/or optics (e.g., positioned in front of the display layer). The optics can be configured to help optically adjust and correctly project the image based content being displayed by the display layer 9.1-314 for close up viewing. The optics can include one or more lenses, mirrors, or other optical elements.

In the example shown in FIG. 9.1-3, the air flow path 9.1-275 passes over the display assembly 9.1-121 across a back side thereof, so as to dissipate heat generated from the display layer 9.1-314 through the back side. To facilitate dissipation of heat, a heat sink 9.1-342 can be positioned behind the back side of the display layer 9.1-314. The heat sink 9.1-342 can include a plurality of fins 9.1-377 positioned in the air flow path 9.1-275 so as to increase a surface area of the back surface that is exposed to the flow of air. The heat sink 9.1-342 can be thermally coupled to the back side or back surface of the display layer 9.1-314 via a thermal interface 9.1-361, such as a thermally conductive adhesive or other appropriate thermally conductive material, to enhance heat transfer (e.g., conduction) from the display layer through the heat sink and to the stream of air.

As seen in FIG. 9.1-3, the display assembly 9.1-121 can further include other structures, such as a circuit board 9.1-370 (e.g., a flexible or rigid printed circuit board) on the back side of the display assembly. The circuit board 9.1-370 can have one or more components 9.1-386 mounted thereon. The components 9.1-386 can be, for example, passive or active electronic components surface mounted to the circuit board 9.1-370, such as integrated circuit chips, resistors, capacitors, or other structures that can protrude from the surface of the circuit board 9.1-370.

The component(s) 9.1-386, and/or or other structures of the display assembly, can partially impede or obstruct the free flow of air and have a tendency to increase a turbulence of the air in the flow path. For example, FIG. 9.1-3 shows an example in which increased impedance caused by the presence of components 9.1-386 causes more turbulent flow, which can degrade the efficiency or user experience as described above.

FIG. 9.1-4 shows another example of the display assembly 9.1-121. The example shown in FIG. 9.1-4 employs a similar structure to FIG. 9.1-3, but additionally includes an air deflector 9.1-400 positioned in the air flow path 9.1-275. The air deflector 9.1-400 is a structure that can be mounted to surfaces within the head-mounted device to reduce a turbulence of air passing through the head-mounted device and across the air deflector. The air deflector 9.1-400 can have a surface designed to create less turbulent, more laminar flow for air that is incident on the surface. For example, the air deflector 9.1-400 can provide a smoother surface or lower angle with respect to an incoming stream of air generated by the air circulation device 9.1-140 (e.g., FIG. 9.1-2), compared to structures in the head-mounted device that the incoming stream of air would otherwise contact if the air deflector were not present. The air deflector 9.1-400 can be a rigid component made of any appropriate material, such as plastic, ceramic, or metal. In some embodiments, the air deflector 9.1-400 can be configured as a dedicated wall structure that is mounted to internal structures or inserted into an interior space of the housing solely to affect the properties of the flow of air incident through the interior space, without providing other mechanical or electrical functions.

In the example shown in FIG. 9.1-4, the air deflector 9.1-400 is mounted to the back side of the display assembly 9.1-121. The air deflector 9.1-400 is mounted on and attached to the circuit board 9.1-370, and extends at least partially over the component(s) 9.1-386 so as to at least partially shield the components 9.1-386 from the incoming air in the air flow path 9.1-275. The air deflector 9.1-400 can, for example, be positioned down-stream from the heat sink 9.1-342 with respect to the air flow path 9.1-275. Compared to the surfaces of the components 9.1-386 in the absence of the air deflector 9.1-400, the surface of the air deflector that is in the flow path and positioned to receive an incident stream of air can have a smoother surface with fewer bends or steps. Accordingly, the air deflector 9.1-400 can be configured to make the air flow path 9.1-275 less tortuous.

Although the air deflector 9.1-400 is shown mounted to the circuit board 9.1-370 on the back side of the display assembly 9.1-121, it is contemplated that the air deflector 9.1-400 can be mounted in any other desired location within the housing of the head-mounted device in which reduced turbulence is desired. For example, the air deflector 9.1-400 can be mounted to the heat-sink or another surface on the back side of the display assembly 9.1-121, another non-back side surface of the display assembly, or another internal component within the housing of the head-mounted device.

FIG. 9.1-5 illustrates another example of the air deflector 9.1-400. In the example shown in FIG. 9.1-5, the air deflector 9.1-400 is configured similar to the example shown in FIG. 9.1-4, but also includes an integral heat sink so that the air deflector 9.1-400 can further dissipate heat from the components 9.1-386 that are shielded by the air deflector 9.1-400, where such components can be heat-generating electronic components. The surface of the air deflector 9.1-400 that receives the incident air can include multiple fins 9.1-477, which increase a surface area of the surface receiving incident air. To maintain sufficiently laminar flow, the fins 9.1-477 can, for example, be configured as longitudinal fins that extend in the direction of air flow, or as a series of aligned pins that are arranged in rows extending along the direction of air flow, among other possible structural arrangements. To facilitate heat transfer, the air deflector 9.1-400 can be made of a material having a sufficiently high thermal conductivity, such as copper or aluminum. The air deflector 9.1-400 can be coupled to one or several of the components 9.1-386. To further enhance the ability of the air deflector 9.1-400 to dissipate heat, the air deflector 9.1-400 can be thermally coupled to such components via a thermally conductive interface 9.1-461, such as a conductive adhesive or other appropriate thermally conductive material.

FIG. 9.1-6 illustrates another example of the air deflector 9.1-400. The air deflector 9.1-400 as shown in FIG. 9.1-6 can be configured similar to the examples of FIG. 9.1-4 or FIG. 9.1-5, except that in FIG. 9.1-6, the air deflector 9.1-400 is movably mounted to a surface (in this case, a surface of the circuit board 9.1-370), rather than non-movably or fixedly mounted to the surface like in the previous examples. The movable mounting can permit the air deflector 9.1-400 to have an adjustable angle with respect to the incoming stream of air in the air flow path 9.1-275. This can be useful to, for example, allow the adjustable angle to be optimized for reduced turbulence in various positions of the air deflector when the position of the air deflector with respect to the flow path or housing is otherwise moved. When the air deflector 9.1-400 is mounted to a display assembly that is movable adjust the distance 9.1-215 (e.g., FIG. 9.1-2), the air deflector 9.1-400 can be configured to compensate for its changed position by also moving with respect to the display assembly. For example, the air deflector 9.1-400 can be configured to move or rotate relative to the display assembly in response to or otherwise in accordance with movement of the display assembly relative to the housing. The movement of the air deflector 9.1-400 can be achieved using, for example, a piezo electric actuator or other actuator, and/or a mechanical linkage that synchronizes movement of the display assembly to rotation of the air deflector 9.1-400. In the example shown in FIG. 9.1-6, the air deflector 9.1-400 is pivotally mounted to the surface of the display assembly 9.1-121. The actuator can be configured to rotate the air deflector 9.1-400 about pivot point 9.1-603, based on movement of the display assembly 9.1-121 relative to the housing or based on changes to the distance 9.1-215 between the pair of display assemblies, so as to adjust an angle of incidence of air onto the surface of the air deflector 9.1-400 to account for a new position of the air deflector with respect to the flow path extending through the housing.

FIGS. 9.1-7 through 9.1-8 show an example of how an air deflector 9.1-400 can reduce turbulence of air in a head-mounted device. FIGS. 9.1-7 through 9.1-8 show examples of arrangement without and with an air deflector, respectively.

FIG. 9.1-7 shows an arrangement having a component 9.1-386 mounted in a flow path and positioned to receive an incoming stream 9.1-735 of air in the flow path (e.g., similar to FIG. 9.1-3). The component 9.1-386 has a surface 9.1-759 positioned in the flow path to receive the incoming stream 9.1-735 of air thereon. The incoming stream 9.1-735 is incident on the surface 9.1-759, and forms an angle 9.1-0 with respect to the surface 9.1-759. In this example, the angle θ between the incoming stream 9.1-735 and the surface of the component 9.1-386 is approximately 90 degrees. Stated another way, the angle of incidence of the incoming stream 9.1-735 is approximately zero, wherein the angle of incidence is defined by the angle between the incoming stream and the normal to the incident surface. The large angle between the incoming stream and the incidence surface, or equivalently the low incident angle, causes a dramatic change in the current of air that tends to create turbulent patterns as the incoming stream impinges on the component, and then continues to flow along a tortuous flow path around the component 9.1-386.

FIG. 9.1-8 shows an identical arrangement to FIG. 9.1-7, except that air deflector 9.1-400 is mounted in the flow path to deflect, at least partially, the incoming stream 9.1-735 of air away from incidence onto the surface 9.1-759 of the component 9.1-386 (e.g., similar to FIG. 9.1-4). The incoming stream 9.1-735 is directed towards the surface 9.1-759 of the component 9.1-386 at the same angle 9.1-0 as shown in FIG. 9.1-7. This is represented in FIG. 9.1-8 by the dashed arrow, which illustrates what the path of the incoming stream 9.1-735 would be if the air deflector 9.1-400 were not present. However, due to the presence of air deflector 9.1-400, the incoming stream 9.1-735 is wholly or partially deflected away from incidence onto the surface 9.1-759 of the component 9.1-386. The air deflector 9.1-400 has a surface 9.1-859 positioned in the flow path to receive the incoming stream 9.1-735 of air thereon, and the surface 9.1-859 of the air deflector 9.1-400 forms an angle 9.1-φ relative to the incoming stream 9.1-735 that is less than the angle 9.1-0. Stated another way, the angle of incidence of the incoming stream 9.1-735 onto the surface 9.1-859 of the air deflector is greater than what the angle of incidence onto the surface 9.1-759 of the component 9.1-386 would be if the air deflector were not present. As a result of such configuration, the air that further propagates downstream after incidence onto the air deflector 9.1-400 is deflected to a less drastic degree compared to if the air deflector 9.1-400 were not present and the air were to be incident unobstructed onto the component 9.1-386. As a result, the air follows a less tortuous flow path, which can beneficially reduce noise within the device for a given flow velocity and/or improve efficiency of the cooling system.

The air deflector 9.1-400 can be configured as any suitable wall structure that forms the desired, turbulence-reducing angle, with respect to the incoming stream 9.1-735 of air. Although the wall is shown in FIG. 9.1-8 as having a straight geometry, in various embodiments the wall can, for example, have a straight, a bent, or curved geometry. As shown in FIG. 9.1-8, the air deflector 9.1-400 and the component 9.1-386 can both be mounted to the same common surface 9.1-801, which can be, for example, any suitable surface of the display assembly. As shown in FIG. 9.1-8, the surface 9.1-859 (air-receiving surface) of the air deflector can further form an obtuse angle with respect to the surface 9.1-801 onto which the air deflector 9.1-400 is mounted, which can be useful for reducing turbulence in cases where the incoming stream 9.1-735 of air propagates in a direction parallel to the surface 9.1-801.

Components of the head-mounted device can be operably connected to provide the performance described herein. FIG. 9.1-9 shows a simplified block diagram of an example of the head-mounted device 9.1-100.

As shown in FIG. 9.1-9, the head-mounted device 9.1-100 can include a controller 9.1-130 with one or more processing units that include or are configured to access a memory 9.1-918 having instructions stored thereon. The instructions or computer programs may be configured to perform one or more of the operations or functions described with respect to the head-mounted device 9.1-100. The controller 9.1-130 can be implemented as any electronic device capable of processing, receiving, or transmitting data or instructions. For example, the controller 9.1-130 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

The memory 9.1-918 can store electronic data that can be used by the head-mounted device 9.1-100. For example, the memory 9.1-918 can store electrical data or content such as, for example, audio and video files, documents and applications, device settings and user preferences, timing and control signals or data for the various modules, data structures or databases, and so on. The memory 9.1-918 can be configured as any type of memory. By way of example only, the memory 9.1-918 can be implemented as random access memory, read-only memory, Flash memory, removable memory, or other types of storage elements, or combinations of such devices.

The head-mounted device 9.1-100 can further include a display 9.1-120 for displaying visual information for a user. The display 9.1-120 can provide visual (e.g., image or video) output, and can include a pair of display assemblies as described herein. The display 9.1-120 can be or include an opaque, transparent, and/or translucent display. The display 9.1-120 may have a transparent or translucent medium through which light representative of images is directed to a user's eyes. The display 9.1-120 may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In some embodiments, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface. The head-mounted device 9.1-100 can include optics configured to help optically adjust and correctly project the image based content being displayed by the display 9.1-120 for close up viewing. The optics can include one or more lenses, mirrors, or other optical devices.

In some embodiments, controller 9.1-130 can receive user inputs from controls 9.1-908 and execute operations in response to the inputs. For example, controller 9.1-130 can be configured to receive sound from the microphone 9.1-930. In response to receiving the sound, controller 9.1-130 can run the voice recognition module to identify voice commands.

Head-mounted device 9.1-100 can include a battery 9.1-920, which can charge and/or power components of the head-mounted device 9.1-100. The battery 9.1-920 can also charge and/or power components connected to the head-mounted device 9.1-100, such as a portable electronic device 9.1-902.

Head-mounted device 9.1-100 can include the air circulation device 9.1-140 for cooling down components of the head-mounted device 9.1-100. The head-mounted device 9.1-100 can further include an air deflector 9.1-400 disposed in an air flow path and configured to receive a stream of air generated by the air circulation device 9.1-140, as further described herein. The air deflector 9.1-400 can optionally be movable by an actuator 9.1-949, as further described herein. The controller 9.1-130 can be configured to operate the actuator 9.1-949 to move or rotate the air deflector based on inputs from a user and/or adjustments to assemblies of the display 9.1-120.

The head-mounted device 9.1-100 can include an input/output component 9.1-926, which can include any suitable component for connecting head-mounted device 9.1-100 to other devices. Suitable components can include, for example, audio/video jacks, data connectors, or any additional or alternative input/output components.

The head-mounted device 9.1-100 can include communications circuitry 9.1-928 for communicating with one or more servers or other external devices 9.1-90 using any suitable communications protocol. For example, communications circuitry 9.1-928 can support Wi-Fi (e.g., a 802.11 protocol), Ethernet, Bluetooth, high frequency systems (e.g., 900 MHZ, 2.4 GHZ, and 5.6 GHz communication systems), infrared, TCP/IP (e.g., any of the protocols used in each of the TCP/IP layers), HTTP, BitTorrent, FTP, RTP, RTSP, SSH, any other communications protocol, or any combination thereof. Communications circuitry 9.1-928 can also include an antenna for transmitting and receiving electromagnetic signals.

The head-mounted device 9.1-100 can include audio devices such as a microphone 9.1-930 and/or speaker 9.1-912. The microphone 9.1-930 can be configured to detect sounds from a user and/or environment. The microphone 9.1-930 can be operably connected to the controller 9.1-130 for detection of sound levels and communication of detections for further processing. The speaker 9.1-212 can be configured to emit sounds to a user and/or environment. The speaker 9.1-212 can be operably connected to the controller 9.1-130 for control of speaker output, including sound levels and/or other sound characteristics.

The head-mounted device 9.1-100 can optionally connect to a portable electronic device 9.1-902, which can provide certain functions. For the sake of brevity, the portable electronic device 9.1-902 will not be described in detail in FIG. 9.1-9. It should be appreciated, however, that the portable electronic device 9.1-902 may be embodied in a variety of forms including a variety of features, all or some of which can be utilized by the head-mounted device 9.1-100 (e.g., input/output, controls, processing, battery, etc.). The portable electronic device 9.1-902 can be configured to receive cooling from operation of air circulation device 9.1-140. The portable electronic device 9.1-902 can provide a handheld form factor (e.g., small portable electronic device which is light weight, fits in a pocket, etc.). Although not limited to these, examples include media players, phones (including smart phones), PDAs, computers, and the like. The portable electronic device 9.1-902 may include a screen 9.1-913 for presenting the graphical portion of the media to the user. The screen 9.1-913 can be utilized as the primary screen of the head-mounted device 9.1-100.

The head-mounted device 9.1-100 can include a dock 9.1-906 operative to receive the portable electronic device 9.1-902. The dock 9.1-906 can include a connector (e.g., Lightning, USB, FireWire, power, DVI, etc.), which can be plugged into a complementary connector of the portable electronic device 9.1-902. The dock 9.1-906 may include features for helping to align the connectors during engagement and for physically coupling the portable electronic device 9.1-902 to the head-mounted device 9.1-100. For example, the dock 9.1-906 may define a cavity for placement of the portable electronic device 9.1-902. The dock 9.1-906 may also include retaining features for securing portable electronic device 9.1-902 within the cavity. The connector on the dock 9.1-906 can function as a communication interface between the portable electronic device 9.1-902 and the head-mounted device 9.1-100.

The head-mounted device 9.1-100 can include one or more other sensors. Such sensors can be configured to sense substantially any type of characteristic such as, but not limited to, images, pressure, light, touch, force, temperature, position, motion, and so on. For example, the sensor can be a photodetector, a temperature sensor, a light or optical sensor, an atmospheric pressure sensor, a humidity sensor, a magnet, a gyroscope, an accelerometer, a chemical sensor, an ozone sensor, a particulate count sensor, and so on. By further example, the sensor can be a bio-sensor for tracking biometric characteristics, such as health and activity metrics. Other user sensors can perform facial feature detection, facial movement detection, facial recognition, eye tracking, user mood detection, user emotion detection, voice detection, etc. Sensors can include a camera which can capture image based content of the outside world.

9.2: Fan with Debris Mitigation

Head-mountable devices, such as head-mountable displays, headsets, visors, smartglasses, head-up display, etc., can perform a range of functions that are managed by the components (e.g., sensors, circuitry, and other hardware) included with the wearable device. The head-mountable device can provide a user experience that is immersive or otherwise natural so the user can easily focus on enjoying the experience without being distracted by the mechanisms of the head-mountable device.

Components of a head-mountable device can generate heat during operation. The performance of electronic devices are often limited by their ability to effectively dissipate the heat generated by computing and other workloads. Excessive heat for long durations of time can damage the components of the head-mountable device and cause discomfort to the user. Heat can be mitigated in a number of ways, including with active mechanisms (e.g., fans, blowers, air movers, and the like) that are integrated into the head-mountable device. In order to dissipate heat effectively within a small form factor, active cooling is sometimes used. Active cooling refers to a thermal architecture wherein heat is dissipated via forced convection.

An active cooling device (e.g., fans, blowers, air movers, and the like) can generate a flow of air from an inlet to an outlet thereof. Such inlets and outlets can define a pathway that receives air from and/or delivers air to an environment external to the head-mountable device. However, by providing such exposure to an external environment, the fan is susceptible to intrusion by particles or other debris from the external environment. In particular, when the fan is not in operation, such particles can collect and become lodged between the parts of the fan. In such a condition, the fan may encounter difficultly resuming operation due to the introduction of particles between moving parts of the fan. In particular, particles lodged between the stationary parts (i.e., fan housing) and moving parts (i.e., rotor, impeller, etc.) can cause the fan to stall.

Systems of the present disclosure can provide fans that mitigate the intrusion of particles and other debris. Fans can include a protrusion that creates a tortuous pathway to direct incoming particles away from sensitive regions. Fans can include openings to allow particles to exit the fan. Fans can include a variable spacing between the stationary parts (i.e., fan housing) and moving parts (i.e., rotor, impeller, etc.) to avoid collection of particles. Fans can include an adhesive pad that collects and retains particles at a location that does not interfere with operation of the impeller.

These and other embodiments are discussed below with reference to FIG. 9.2-1 through 9.2-13. However, those skilled in the art will readily appreciate that the detailed description given herein with respect to these Figures is for explanatory purposes only and should not be construed as limiting.

According to some embodiments, for example as shown in FIG. 9.2-1, a head-mountable device 9.2-100 includes a frame 9.2-110 that is worn on a head of a user. The frame 9.2-110 can be positioned in front of the eyes of a user to provide information within a field of view of the user. The frame 9.2-110 can provide nose pads or another feature to rest on a user's nose. The frame 9.2-110 can be supported on a user's head with the head engager 9.2-120. The head engager 9.2-120 can wrap or extend along opposing sides of a user's head. The head engager 9.2-120 can include earpieces for wrapping around or otherwise engaging or resting on a user's ears. It will be appreciated that other configurations can be applied for securing the head-mountable device 9.2-100 to a user's head. For example, one or more bands, straps, belts, caps, hats, or other components can be used in addition to or in place of the illustrated components of the head-mountable device 9.2-100. By further example, the head engager 9.2-120 can include multiple components to engage a user's head.

The frame 9.2-110 can provide structure around a peripheral region thereof to support any internal components of the frame 9.2-110 in their assembled position. For example, the frame 9.2-110 can enclose and support various internal components (including for example integrated circuit chips, processors, memory devices, cameras, displays, lenses, and other circuitry) to provide computing and functional operations for the head-mountable device 9.2-100, as discussed further herein. Any number of components can be included within and/or on the frame 9.2-110 and/or the head engager 9.2-120.

The frame 9.2-110 can include and/or support one or more cameras 9.2-130. The cameras 9.2-130 can be positioned on or near an outer side of the frame 9.2-110 to capture images of views external to the head-mountable device 9.2-100. The captured images can be used for display to the user or stored for any other purpose.

The head-mountable device can be provided with displays that provide visual output for viewing by a user wearing the head-mountable device. As further shown in FIG. 9.2-1, one or more displays 9.2-140 can be positioned on an inner side 9.2-124 of the head-mountable device 9.2-100, for example within an eye chamber 9.2-126. For example, a pair of displays 9.2-140 can be provided, where each display 9.2-140 is movably positioned to be within the field of view of each of a user's two eyes. Each display 9.2-140 can be adjusted to align with a corresponding eye of the user. For example, each display 9.2-140 can be moved along one or more axes until a center of each display 9.2-140 is aligned with a center of the corresponding eye.

A display 9.2-140 can transmit light from a physical environment (e.g., as captured by a camera) for viewing by the user. Such a display 9.2-140 can include optical properties, such as lenses for vision correction based on incoming light from the physical environment. Additionally or alternatively, a display 9.2-140 can provide information as a display within a field of view of the user. Such information can be provided to the exclusion of a view of a physical environment or in addition to (e.g., overlaid with) a physical environment.

A physical environment relates to a physical world that people can sense and/or interact with without necessarily requiring the aid of an electronic device. A computer-generated reality environment relates to a wholly or partially simulated environment that people sense and/or interact with the assistance of an electronic device. Examples of computer-generated reality include mixed reality and virtual reality. Examples of mixed realities can include augmented reality and augmented virtuality. Some examples of electronic devices that enable a person to sense and/or interact with various computer-generated reality environments include head-mountable systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head-mountable device can have an integrated opaque display, have a transparent or translucent display, or be configured to accept an external opaque display (e.g., smartphone).

Referring again to FIG. 9.2-1, the head-mountable device can be provided with one or more flow channels that extend through at least a portion of the frame thereof to provide cooling to components of the head-mountable device. As shown in FIG. 9.2-1, the flow channels can include and/or be connected to a system inlet 9.2-112. The system inlet 9.2-112 can provide airflow directly to the fan 9.2-200 and/or one or more components of the head-mountable device 9.2-100, such as a circuit component 9.2-150. The air received by the system inlet 9.2-112 can be directed to a system outlet 9.2-116 and/or other outlets for exhaust out of the head-mountable device 9.2-100 by the fan 9.2-200.

While the system inlet 9.2-112 is depicted at a bottom portion of the frame 9.2-110 and the system outlet 9.2-116 is depicted at a top portion of the frame 9.2-110, it will be recognized that inlets, outlets, and flow channels there between can be positioned at any portion of the head-mountable device 9.2-100. The system outlet 9.2-116 can be provided at a location that will allow exiting air to exhaust to an environment that is not disruptive to the user. For example, the system outlet 9.2-116 can be provided at a location and in and orientation that directs hot air away from the user. Multiple flow channels can be interconnected, such that multiple inlets and/or multiple outlets are connected to each other.

One or more fans 9.2-200 can be operated to provide cooling to one or more circuit components 9.2-150 of the head-mountable device 9.2-100. The circuit component 9.2-150 can be an electrical component that generates heat during operation. The circuit component 9.2-150 can be a component of a circuit board 9.2-152. The circuit component 9.2-150 can be operably and structurally coupled to the circuit board 9.2-152. A portion of the fan 9.2-200 can be thermally connected to the circuit component 9.2-150.

The fan 9.2-200 can receive a flow of air from a system inlet 9.2-112 and direct the flow of air to a system outlet 9.2-116. For example, the fan 9.2-200, the circuit component 9.2-150, and/or the circuit board 9.2-152 can be positioned within an internal chamber 9.2-118 (e.g., plenum chamber) of the head-mountable device 9.2-100.

While several components are shown within the frame 9.2-110, it will be understood that some or all of these components can be located anywhere within or on the head-mountable device 9.2-100. For example, one or more of these components can be positioned within the head engager 9.2-120 of the head-mountable device 9.2-100.

Referring now to FIG. 9.2-2, the fan can provide features for moving air across surfaces for dissipating heat. As shown in FIG. 9.2-2, the fan 9.2-200 can include a fan housing 9.2-208 that includes a cover 9.2-210 over an impeller 9.2-220. The cover 9.2-210 can form a fan inlet 9.2-212, for example through a top surface thereof. The cover 9.2-210 can include or be connected to an exhaust duct 9.2-290 that forms a fan outlet 9.2-292 of the fan 9.2-200.

The impeller 9.2-220 of the fan 9.2-200 can be positioned to receive air through the fan inlet 9.2-212 and direct the air to the fan outlet 9.2-292. The fan 9.2-200 can include a motor to drive rotation of the impeller 9.2-220. For example, the fan 9.2-200 can include a stator and an impeller 9.2-220 configured to rotate about the stator. The impeller 9.2-220 can include multiple blades 9.2-224 that extend radially outwardly away from the central hub of the impeller. As the impeller 9.2-220 rotates, the blades 9.2-224 receive air from the fan inlet 9.2-212 and direct the air radially outwardly and toward the fan outlet 9.2-292. The impeller 9.2-220 can be stabilized by one or more bearings between the impeller 9.2-220 and the stator. The bearing can include a fluid hydrodynamic bearing, for example with oil or another fluid between the impeller 9.2-220 and the stator. It will be understood that other types of bearings are contemplated, including mechanical bearings, journal bearings, plain bearings, ball bearings, and the like. The bearing can provide radial and/or axial support to the impeller 9.2-220 as it rotates about the stator.

The impeller 9.2-220 can direct air or another gas within, against, or across one or more components of the fan 9.2-200. The fan 9.2-200 can be operated based on one or more operating parameters that are controllable during use. The operating parameters can be determined, at least in part, based on a demand for cooling (e.g., based on a temperature of one or more components). The operating parameters can be further determined based on acceptable sound levels and characteristics to be produced by the fan 9.2-200 and along the flow channel.

Referring now to FIGS. 9.2-3 and 9.2-4, the fan can be thermally connected to components to be cooled. As shown in FIG. 9.2-3, the fan housing 9.2-208 can further include a base plate 9.2-230. The cover 9.2-210 and the base plate 9.2-230 of the fan housing 9.2-208 can, together, define an interior space 9.2-280 there between. The impeller 9.2-220 can be positioned within the interior space 9.2-280 and mounted to the base plate 9.2-230. As such, the base plate 9.2-230 provides structural support to the impeller 9.2-220 for stable operation (e.g., during rotation).

A heat sink 9.2-240 can provide one or more fins 9.2-242 between the interior space 9.2-280 and the fan outlet 9.2-292 formed by the exhaust duct 9.2-290. The heat sink 9.2-240 is thermally connected to the circuit component 9.2-150, which is operably and structurally coupled to the circuit board 9.2-152. The heat sink 9.2-240 can be thermally connected to the circuit component 9.2-150 by a direct connection (e.g., no intervening structure) or by a thermal interface 9.2-160. For example, a thermal paste or other thermally conductive material can be provided to thermally and/or structurally connect the circuit component 9.2-150 to the heat sink 9.2-240.

The base plate 9.2-230, the heat sink 9.2-240, and/or the fins 9.2-242 can be of a metal or other material having high thermal conductivity. The material can provide high rigidity and strength to provide support to components mounted to the base plate 9.2-230 and to securely mount to other components (e.g., the frame) of the head-mountable device.

The cover 9.2-210 can be of a material that provides protection to the impeller 9.2-220 and any other components in the interior space. The material can be plastic, metal, and/or another material. The cover 9.2-210 can be a monolithic, unitary, and/or unibody structure, rather than an assembly of parts.

As shown in FIG. 9.2-3 and FIG. 9.2-4, the fan 9.2-200 can generate a flow of air from an inlet (e.g., system inlet 9.2-112 and/or fan inlet 9.2-212) to an outlet (e.g., system outlet 9.2-116 and/or fan outlet 9.2-292). It will be understood that the system outlet 9.2-116 can be directly connected to the fan outlet 9.2-292, such that all air directed through the fan outlet 9.2-292 can be further directed to the system outlet 9.2-116. Such inlets and outlets can define a pathway that receives air from and/or delivers air to an environment external to the head-mountable device. During operation of the fan 9.2-200, the air flow can be maintained such that any particles or other debris travelling with the air flow moves through the fan 9.2-200 without remaining therein. Furthermore, the movement of the impeller 9.2-220 can disrupt and propel any resting particles until they are ejected from the fan 9.2-200.

However, as shown in FIG. 9.2-5, by providing such exposure to an external environment, the fan 9.2-200 is susceptible to intrusion by particles or other debris from the external environment. In particular, when the fan 9.2-200 is not in operation (e.g., when the impeller 9.2-220 is not rotating), particles 9.2-2 can collect and become lodged between the moving and stationary parts of the fan 9.2-200. For example, the particles 9.2-2 can enter through the system inlet 9.2-112 and into the fan inlet 9.2-212 and/or through the system outlet 9.2-116 and into the fan outlet 9.2-292 and become lodged between the stationary parts (i.e., fan housing, base plate, etc.) and moving parts (i.e., rotor, impeller, etc.) of the fan 9.2-200. In such a condition, the fan 9.2-200 may encounter difficultly resuming operation due to the introduction of particles between moving and stationary parts of the fan 9.2-200. In particular, particles 9.2-2 lodged between the impeller 9.2-220 and the base plate 9.2-230 can cause the impeller 9.2-220 to stall.

It can be desirable to provide features that mitigate the collection of such particles while the fan 9.2-200 is not in operation without reducing the effectiveness of the fan while it is in operation.

Referring now to FIG. 9.2-5, a fan can include features that create a tortuous pathway to prevent the incoming particles from entering the sensitive regions. For example, as shown in FIGS. 9.2-5, a protrusion 9.2-232 can extend from the base plate 9.2-230 to block and/or redirect a pathway of an incoming particle 9.2-2. For example, the protrusion 9.2-232 can be positioned between at least a portion of the impeller 9.2-220 and the fan outlet 9.2-292. The protrusion 9.2-232 can extend toward the cover 9.2-210 while allowing an air flow pathway over the protrusion between the impeller 9.2-220 and the fan outlet 9.2-292.

The impeller 9.2-220 can be formed with a support disk 9.2-228 on one side of the blades 9.2-224. Where a support disk 9.2-228 is provided, such as is shown in FIG. 9.2-5, the protrusion 9.2-232 can extend from the base plate 9.2-230 to at least a height of a portion of the support disk 9.2-228. Where blades 9.2-224 are provided, the protrusion 9.2-232 can extend from the base plate 9.2-230 to at least a height of one or more of the blades 9.2-224. As such, the protrusion 9.2-232 can shield and/or occupy a space between the base plate 9.2-230 and the support disk 9.2-228. It will be understood that a tortuous pathway around the protrusion 9.2-232 can connect the fan outlet 9.2-292 to the space between the base plate 9.2-230 and the support disk 9.2-228. However, the protrusion can be formed such that incoming particles 9.2-2 are instead deflected to above the support disk 9.2-228, so that they do not lodge between the base plate 9.2-230 and the support disk 9.2-228.

In some embodiments, as further shown in FIG. 9.2-5, the protrusion 9.2-232 can be formed as an annular ring or closed loop. Such a closed loop can surround a periphery of the impeller 9.2-220. For example, the annular ring can encircle the support disk 9.2-228 and/or a portion of each of the blades 9.2-224.

In some embodiments, as further shown in FIG. 9.2-5, the protrusion 9.2-232 defines a surface 9.2-286 facing away from the impeller 9.2-220. This surface 9.2-286 can be that on which the particle 9.2-2 is incident upon entry through the fan outlet 9.2-292. The surface 9.2-286 can be formed to direct the particle away from the space between the base plate 9.2-230 and the impeller 9.2-220. For example, the surface can form an angle that is oblique with respect to the base plate 9.2-230 to form a ramp.

Referring now to FIG. 9.2-6, the protrusion 9.2-232 can overlap with at least a portion of the impeller 9.2-220. For example, the blades 9.2-224 can be positioned between the cover 9.2-210 and the base plate 9.2-230, and each of the blades can form a notch 9.2-288. The protrusion 9.2-232 extends from the base plate 9.2-230 and into at least some of the notches 9.2-288. As the impeller 9.2-220 rotates, the notches 9.2-288 pass over the protrusion 9.2-232 without physical contact.

Where a support disk 9.2-228 of the impeller 9.2-220 is provided, such as is shown in FIG. 9.2-6, the protrusion 9.2-232 can extend from the base plate 9.2-230 to at least a height of a portion of the support disk 9.2-228. In some embodiments, as further shown in FIG. 9.2-6, the protrusion 9.2-232 can be formed as an annular ring. For example, the annular ring can encircle the support disk 9.2-228 without encircling the blades 9.2-224, but instead protruding towards the blades 9.2-224 and into the notches 9.2-288. As such, the protrusion 9.2-232 can block a space between the base plate 9.2-230 and the support disk 9.2-228. It will be understood that a tortuous pathway around the protrusion 9.2-232 can connect the fan outlet 9.2-292 to the space between the base plate 9.2-230 and the support disk 9.2-228. However, the protrusion can be formed such that incoming particles are instead deflected to above the support disk 9.2-228, so that they do not lodge between the base plate 9.2-230 and the support disk 9.2-228.

It will be understood that any protrusion 9.2-232 disclosed herein need not form an annular ring and that a variety of other shapes are contemplated, such as an arc, a flat wall, and the like. It will be understood that any number of protrusions 9.2-232 can be provided. For example, both the protrusion of FIG. 9.2-5 (i.e., overlapping the impeller 9.2-220) and the protrusion of FIG. 9.2-6 (i.e., surrounding the impeller 9.2-220) can be provided in combination.

In some embodiments, a distance between any protrusion 9.2-232 disclosed herein and the impeller 9.2-220 (e.g., the support disk 9.2-228 and/or the blades 9.2-224) can be smaller than a distance between the base plate 9.2-230 and the impeller 9.2-220 (e.g., the support disk 9.2-228). The smaller distance between the protrusion 9.2-232 and the impeller 9.2-220 can serve to block particles having a dimension that is greater than such a distance. As such, only particles smaller than such a distance can pass the protrusion 9.2-232. When such small particles are between the base plate 9.2-230 and the impeller 9.2-220, the particles will not be large enough to extend to both the base plate 9.2-230 and the impeller 9.2-220 and will thereby be unable to lodge therein or arrest operation of the impeller 9.2-220.

Referring now to FIG. 9.2-7, the base plate can have features that facilitate particle blocking and promote impeller operation. For example, as shown in FIG. 9.2-7, the base plate 9.2-230 can have a variable profile at different portions thereof and with respect to the impeller 9.2-220. For example, the base plate can form a base plate central portion 9.2-262 and one or more base plate peripheral portions 9.2-260. The impeller 9.2-220 can form an impeller central portion 9.2-252 and one or more impeller peripheral portions 9.2-250. A distance 9.2-266 between the base plate central portion 9.2-262 and the impeller central portion 9.2-252 is greater than a distance 9.2-264 between the base plate peripheral portion 9.2-260 and the impeller peripheral portion 9.2-250. The smaller distance 9.2-264 between the base plate central portion 9.2-262 and the impeller central portion 9.2-252 can serve to block particles having a dimension that is greater than the distance 9.2-264. As such, only particles smaller than such a distance can pass the gap defined by the distance 9.2-264. When such small particles are between the base plate central portion 9.2-262 and the impeller central portion 9.2-252, the particles will not be large enough to span the distance 9.2-266 to contact both the base plate central portion 9.2-262 and the impeller central portion 9.2-252 and will thereby be unable to lodge therein or arrest operation of the impeller 9.2-220. It will be understood that a number of variations can be provided, including any number of different distances and/or transitions there between.

Referring now to FIG. 9.2-8, the base plate can have features that facilitate particle evacuation and/or capture. For example, as shown in FIG. 9.2-8, the base plate 9.2-230 can define one or more openings 9.2-270 that extend entirely through the base plate 9.2-230. The impeller 9.2-220 can be positioned to overlap at least some of the openings 9.2-270 of the base plate 9.2-230. When particles are introduced between the base plate 9.2-230 and the impeller 9.2-220, the particles can be provided with an exit from such a region through the openings 9.2-270. The openings 9.2-270 can be connected to an external environment or a collection chamber for releasing and/or capturing the particles. It will be understood that any number of openings 9.2-270 can be provided in any arrangement. It will be further understood that the openings 9.2-270 can have any size and/or dimension to facilitate particle removal. It will be understood that openings can be provided at any location, including other than the base plate 9.2-230.

Referring now to FIGS. 9.2-9 and 9.2-10, a fan can include a retention mechanism that captures particles. For example, as shown in FIG. 9.2-9, a pad 9.2-272 can be provided on a side of the base plate 9.2-230 facing and/or covering the openings 9.2-270. In such an embodiment, the openings 9.2-270 can be the same or similar to those described elsewhere herein. As shown in FIG. 9.2-10, the pad 9.2-272 can be positioned on a side of the openings that is opposite the impeller 9.2-220, such as on an outer side of the base plate 9.2-230. Rather than releasing the particles that pass through the openings 9.2-270, the pad 9.2-272 can capture the particles and retain them away from the impeller 9.2-220.

Once the particles are removed from the interior space 9.2-280 containing the impeller 9.2-220, they can be retained at a location that does not interfere with the operation of the impeller 9.2-220. For example, the pad 9.2-272 can provide a surface that retains particles upon contact of the particle with the pad 9.2-272. For example, the pad 9.2-272 can include an adhesive (e.g., pressure-sensitive adhesive). As used herein, an adhesive can include any material that has adhesion properties and/or stickiness, such as a polymer, glue, cement, paste, laminate, and/or other material that bonds to particles upon contact therewith. By further example, the pad 9.2-272 can include an uncured or partially cured substance that is exposed to the interior space 9.2-280 and/or the openings 9.2-270. In some embodiments, the fan 9.2-200 can include one or more other retention mechanisms, such as an operable electrode or other surface that is configured to be electrically charged to attract particles. Additionally or alternatively, the fan 9.2-200 can include a filter and/or a mechanically actuated container for selectively containing particles that migrate out of the interior space 9.2-280 and/or through the openings 9.2-270.

Referring now to FIGS. 9.2-11 and 9.2-12, a fan can provide multiple features that provide particle mitigation properties. For example, the fan 9.2-200 of FIGS. 9.2-11 and 9.2-12 includes one or more protrusions 9.2-232 extending from the base plate 9.2-230 to block and/or redirect a pathway of an incoming particle. Such protrusion(s) 9.2-232 can include any one or more features described herein with respect to the fan of FIG. 9.2-5 or 9.2-6.

By further example, the fan 9.2-200 of FIGS. 9.2-11 and 9.2-12 includes a base plate 9.2-230 having a variable profile at different portions thereof and with respect to the impeller 9.2-220, such as with a base plate central portion 9.2-262 and one or more base plate peripheral portions 9.2-260. Along with features of the impeller 9.2-220, the base plate 9.2-230 can define different distances there between, as described with respect to the fan of FIG. 9.2-7.

By further example, the fan 9.2-200 of FIGS. 9.2-11 and 9.2-12 includes a base plate 9.2-230 that defines one or more openings 9.2-270 extending entirely through the base plate

9.2-230. Such openings 9.2-270 can include any one or more features described herein with respect to the fan of FIG. 9.2-8.

By further example, the fan 9.2-200 of FIGS. 9.2-11 and 9.2-12 includes a pad 9.2-272 on an outer side of the base plate 9.2-230 to capture particles from the interior space 9.2-280. The pad 9.2-272 can include any one or more features described herein with respect to the fan of FIGS. 9.2-9 and 9.2-10.

It will be understood that any number of features described herein can be combined in a single fan to provide particle mitigation. It will be further understood that no one feature is necessary to provide effective particle mitigation to a fan.

Referring now to FIG. 9.2-13, components of the head-mountable device can be operably connected to provide the performance described herein. FIG. 9.2-13 shows a simplified block diagram of an illustrative head-mountable device 9.2-100 in accordance with one embodiment of the invention. It will be appreciated that components described herein can be provided on either or both of a frame and/or a head engager of the head-mountable device 9.2-100. It will be understood that additional components, different components, or fewer components than those illustrated may be utilized within the scope of the subject disclosure.

As shown in FIG. 9.2-13, the head-mountable device 9.2-100 can include a controller 9.2-180 with one or more processing units that include or are configured to access a memory 9.2-182 having instructions stored thereon. The instructions or computer programs may be configured to perform one or more of the operations or functions described with respect to the head-mountable device 9.2-100. The controller 9.2-180 can be implemented as any electronic device capable of processing, receiving, or transmitting data or instructions. For example, the controller 9.2-180 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

The memory 9.2-182 can store electronic data that can be used by the head-mountable device 9.2-100. For example, the memory 9.2-182 can store electrical data or content such as, for example, audio and video files, documents and applications, device settings and user preferences, timing and control signals or data for the various modules, data structures or databases, and so on. The memory 9.2-182 can be configured as any type of memory. By way of example only, the memory 9.2-182 can be implemented as random access memory, read-only memory, Flash memory, removable memory, or other types of storage elements, or combinations of such devices.

The head-mountable device 9.2-100 can further include a display 9.2-140 for displaying visual information for a user. The display 9.2-140 can provide visual (e.g., image or video) output. The display 9.2-140 can be or include an opaque, transparent, and/or translucent display. The display 9.2-140 may have a transparent or translucent medium through which light representative of images is directed to a user's eyes. The display 9.2-140 may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface. The head-mountable device 9.2-100 can include an optical subassembly 9.2-214 configured to help optically adjust and correctly project the image-based content being displayed by the display 9.2-140 for close up viewing. The optical subassembly 9.2-214 can include one or more lenses, mirrors, or other optical devices.

The head-mountable device 9.2-100 can include the fan 9.2-200 and/or any other suitable component for cooling down components of the head-mountable device 9.2-100. Suitable components can include, for example, impellers, pipes for transferring heat, vents, apertures, holes, any other component suitable for distributing and diffusing heat, or any combination thereof. The fan 9.2-200 may also or instead be manufactured from materials selected for heat dissipation properties. For example, a housing of the head-mountable device 9.2-100 may be configured to distribute heat away from components thereof and/or the user.

The head-mountable device 9.2-100 can include a battery 9.2-184, which can charge and/or power components of the head-mountable device 9.2-100. The battery 9.2-184 can also charge and/or power components connected to the head-mountable device 9.2-100.

The head-mountable device 9.2-100 can include an input/output component 9.2-186, which can include any suitable component for connecting head-mountable device 9.2-100 to other devices. Suitable components can include, for example, audio/video jacks, data connectors, or any additional or alternative input/output components. The input/output component 9.2-186 can include buttons, keys, or another feature that can act as a keyboard for operation by the user.

The head-mountable device 9.2-100 can include the microphone 9.2-188 as described herein. The microphone 9.2-188 can be operably connected to the controller 9.2-180 for detection of sound levels and communication of detections for further processing, as described further herein.

The head-mountable device 9.2-100 can include the speakers 9.2-190 as described herein. The speakers 9.2-190 can be operably connected to the controller 9.2-180 for control of speaker output, including sound levels, as described further herein.

The head-mountable device 9.2-100 can include one or more other sensors. Such sensors can be configured to sense substantially any type of characteristic such as, but not limited to, images, pressure, light, touch, force, temperature, position, motion, and so on. For example, the sensor can be a photodetector, a temperature sensor, a light or optical sensor, an atmospheric pressure sensor, a humidity sensor, a magnet, a gyroscope, an accelerometer, a chemical sensor, an ozone sensor, a particulate count sensor, and so on. By further example, the sensor can be a bio-sensor for tracking biometric characteristics, such as health and activity metrics. Other user sensors can perform facial feature detection, facial movement detection, facial recognition, eye tracking, user mood detection, user emotion detection, voice detection, etc. Sensors can include a camera which can capture image based content of the outside world.

The head-mountable device 9.2-100 can include communications circuitry 9.2-192 for communicating with one or more servers or other devices using any suitable communications protocol. For example, communications circuitry

9.2-192 can support Wi-Fi (e.g., a 802.11 protocol), Ethernet, Bluetooth, high frequency systems (e.g., 900 MHz, 2.4 GHz, and 5.6 GHz communication systems), infrared, TCP/IP (e.g., any of the protocols used in each of the TCP/IP layers), HTTP, BitTorrent, FTP, RTP, RTSP, SSH, any other communications protocol, or any combination thereof. Communications circuitry 9.2-192 can also include an antenna for transmitting and receiving electromagnetic signals.

While various embodiments and aspects of the present disclosure are illustrated with respect to a head-mountable device, it will be appreciated that the subject technology can encompass and be applied to other devices. For example, a noise mitigation system in accordance with embodiments disclosed herein can be included with an electronic device that generates heat during operation. Such an electronic device can be or include a desktop computing device, a laptop-computing device, a display, a television, a portable device, a phone, a tablet computing device, a mobile computing device, a wearable device, a watch, and/or a digital media player. Such devices can include an impeller and flow channels to facilitate cooling as described herein.

Accordingly, embodiments of the present disclosure provide a head-mountable device that provides a fan that effectively manages heat while also mitigating the intrusion of particles and other debris. Fans can include a protrusion that creates a tortuous pathway to direct incoming particles away from sensitive regions. Fans can include openings to allow particles to exit the impeller. Fans can include a variable spacing between the impeller and the base plate to avoid collection of particles. Fans can include an adhesive pad that collects and retains particles at a location that does not interfere with operation of the impeller.

9.3: Ventilation

FIG. 9.3-1 illustrates an example of a head-mountable display (HMD) 9.3-100. The HMD 9.3-100 can include a ventilation system 9.3-102 for controlling airflow through the HMD 9.3-100 and cooling various components of the HMD 9.3-100 described herein. In at least one example, the ventilation system 9.3-102 can be configured to cool one or more heat generating components or subsystems of the HMD 9.3-100, including, for example, the optical modules 9.3-108*a*, 9.3-108*b* and/or one or more processors or other heat generating components of the logic board 9.3-110. The ventilation system 9.3-102 can include a frame assembly 9.3-106, which can include a multi-part chassis, and a fan assembly 9.3-104. The fan assembly 9.3-104 can be coupled to the frame assembly 9.3-106 and the frame assembly 9.3-106 such that the fan assembly 9.3-104 is disposed between the frame assembly 9.3-106 and the logic board 9.3-110.

In at least one example, when the HMD 9.3-100 is assembled, the optical modules 9.3-108*a*, 9.3-108*b* can be coupled to the frame assembly 9.3-106 such that the optical modules 9.3-108*a*, 9.3-108*b* are each aligned with an aperture defined by the frame assembly 9.3-106 (illustrated in subsequent figures, including FIGS. 9.3-2 and 9.3-11). In this way, in at least one example, the optical modules 9.3-108*a*, 9.3-108*b* can be in fluid communication with the fan assembly 9.3-104 through the frame assembly 9.3-106 disposed between the optical modules 9.3-108*a*, 9.3-108*b* and the fan assembly 9.3-104. In at least one example, one or the optical modules 9.3-108*a*, 9.3-108*b* can each include one or more display screens (illustrated in subsequent figures, for example FIG. 9.3-11) or other heat-generating electronic components. For example, the first optical module 9.3-108*a* can include a first display screen and the second optical module 9.3-108*b* can include a second display screen, both of which can be oriented toward the user's eyes when donning the HMD 9.3-100.

FIG. 9.3-2 illustrates an example of a ventilation system 9.3-202 in an assembled configuration. In at least one example, the ventilation system 9.3-202 includes a first fan 9.3-112*a* and a second fan 9.3-112*b* coupled with a frame assembly 9.3-206 (e.g., the chassis). In at least one example, the frame assembly 9.3-206 can include an outer frame 9.3-215 and an inner frame 9.3-214 coupled to the outer frame 9.3-215. The frame assembly 9.3-206 can be a structural frame assembly. The outer frame 9.3-215 can be a structural outer frame and define an exterior surface of the HMD 9.3-100 and the inner frame 9.3-214 can be and inner structural frame disposed within an internal volume 9.3-226 defined by the outer frame 9.3-215. As noted above with reference to FIG. 9.3-1, an optical module including a display screen (not shown in FIG. 9.3-2) can be coupled to the frame assembly 9.3-206, for example coupled to the inner frame 9.3-214, and aligned with a first aperture 9.3-216*a* or the second aperture 9.3-216*b*. In one example, a first optical module with a first screen can be aligned with the first aperture 9.3-216*a* and a second optical module with a second screen can be aligned with the second aperture 9.3-216*b*.

In at least one example, the inner frame 9.3-214 of the frame assembly 9.3-206 of the head mountable display device can be coupled to the outer frame 9.3-215 at discrete touch points 9.3-218 to minimize contact and thermal transfer between the inner frame 9.3-214 and the outer frame 9.3-215. Two discrete touch points 9.3-218 are labeled and shown in FIG. 9.3-2 and are given as non-limiting examples. More or less than the touch points 9.3-218 shown can be included at various positions or locations of the inner frame 9.3-214 and outer frame 9.3-215. The discrete touch points 9.3-218 where the inner frame 9.3-214 is coupled to the outer frame 9.3-215 can be a part of a first set of discrete touch points such that the inner frame 9.3-214 is thermally isolated from the outer frame 9.3-215 via the first set of discrete touch points. The inner frame 9.3-214 can be referred to as an internal frame and the outer frame 9.3-215 can be referred to as an external frame.

In at least one example, each touch-point 9.3-218 of the first set of discrete touch points can include an insulating member 9.3-220 disposed between the inner frame 9.3-214 and the outer frame 9.3-215. In this way, the inner frame 9.3-214 can be thermally isolated from the outer frame 9.3-215 via a first set of insulating members, including the insulating members 9.3-220 shown in FIG. 9.3-2, disposed between the inner frame 9.3-214 and the outer frame 9.3-215 at the first set of discrete touch points, with at least one insulating member 9.3-220 of the first set of insulating members disposed at each discrete touch point 9.3-218 of the first set of discrete touch points.

In at least one example, the outer frame 9.3-215 can include a first material and the inner frame 9.3-214 can include a second material different than the first material. The first material of the outer frame 9.3-215 can include aesthetically pleasing materials, including aluminum, other metals, plastics, composite materials, and so forth. In at least one example, the second material of the inner frame 9.3-214 can include a material stronger than the first material of the outer frame 9.3-215. In one example, the second material can include a magnesium alloy. Other examples of the second material can include other metals stiffer and/or stronger than the first material, including, metal alloys, carbon fiber, composite materials and alloys, and so forth.

The external/outer frame 9.3-215 can define the internal volume 9.3-226 as well as a first opening 9.3-122 (shown in the front, perspective view of the frame assembly 9.3-106 of FIG. 9.3-1) and a second opening 9.3-224 opposite the first opening 9.3-122. In at least one example, the outer frame 9.3-215 can define one or more intake ports 9.3-228 between the first opening 9.3-122 and the second opening 9.3-224. The intake ports 9.3-228 can include one or more apertures defined by the outer frame 9.3-215 through which the internal volume 9.3-226 can be in fluid communication with an external environment.

In at least one example, the external/outer frame 9.3-215 can define one or more exhaust ports 9.3-230 between the first opening 9.3-122 and the second opening 9.3-224. The exhaust ports 9.3-230 can include one or more apertures defined by the outer frame 9.3-215 through which the internal volume 9.3-226 can be in fluid communication with the external environment. In at least one example, one or more of the exhaust ports 9.3-230 can be centrally located between the first and second apertures 9.3-216*a-b* of the internal frame 9.3-214.

In at least one example, the fan assembly 9.3-204 of the HMD 9.3-100 can include a first fan 9.3-212*a* disposed in the internal volume 9.3-226 and a second fan 9.3-212*b* disposed in the internal volume 9.3-226. The first fan 9.3-212*a* can be aligned with the first aperture 9.3-216*a* and the second fan 9.3-212*b* can be aligned with the second aperture 9.3-216*b*. In general, the term "aligned" as used herein can refer to a relative position with two components adjacent or near one another. For example, the first fan 9.3-212*a* can be aligned with the first aperture 9.3-216*a* such that an air intake feature or opening of the first fan 9.3-212*a* is positioned or configured to receive air into the first fan 9.3-212*a* through the first aperture 9.3-216*a*. In at least one example, the first fan 9.3-212*a* can be "aligned" with the first aperture 9.3-216*a* such that an axis of rotation of a fan blade assembly 9.3-217*a* of the first fan 9.3-212*a* can pass through the first aperture 9.3-216*a*. In one example, the axis of rotation of the fan blade assembly 9.3-217*a* can be parallel, aligned with, or close in proximity and angle with a central, normal axis of the first aperture 9.3-216*a* defined by the inner frame 9.3-214. Thus, the term "aligned" is used herein to denote the arrangement of the fans 9.3-212*a-b* and respective apertures 9.3-216*a-b* as shown in FIG. 9.3-2. The same use of the term "aligned" can be used to describe the relative position of the second fan 9.3-212*b* with the second aperture 9.3-216*a*, as illustrated in FIG. 9.3-2.

In at least one example, the first fan 9.3-212*a* and the second fan 9.3-212*b* are configured to draw air into the internal volume 9.3-226 through the intake port 9.3-228 and push the air out from the internal volume 9.3-226 through the exhaust port 9.3-230. As noted above, the first and second fans 9.3-212*a*, 9.3-212*b* can be aligned with the first and second apertures 9.3-216*a*, 9.3-216*b* of the inner frame 9.3-214, respectively, to draw air through the apertures 9.3-216*a-b* and into the fans 9.3-212*a-b* via fan inlets 9.3-232*a*, 9.3-232*b*, respectively. The first fan 9.3-212*a* can include a housing 9.3-234*a* defining the fan inlet 9.3-232*a* through which air can enter the first fan 9.3-212*a* before being blown through the exhaust port 9.3-230. Likewise, the second fan 9.3-212*b* can include a housing 9.3-234*b* defining the fan inlet 9.3-232*b* through which air can enter the second fan 9.3-212*b* before being blown through the exhaust port 9.3-230. The fan inlets 9.3-232*a-b* can be adjacent to and/or aligned with the apertures 9.3-216*a-b*, respectively, such that air flows into the internal volume 9.3-226 through the intake ports 9.3-228 then through the apertures 9.3-216*a-b* and then through the fan inlets 9.3-232*a-b*. The fans 9.3-212*a-b* are configured to blow the air out from the internal volume 9.3-226 through the exhaust ports 9.3-230.

Any of the features, components, and/or parts, including the arrangements and configurations thereof shown in FIG. 9.3-2 can be included, either alone or in any combination, in any of the other examples of devices, features, components, and parts shown in FIGS. 9.3-3-9.3-11 and described herein. Likewise, any of the features, components, and/or parts, including the arrangements and configurations thereof shown and described with reference to FIGS. 9.3-3-9.3-11 can be included, either alone or in any combination, in the example of the devices, features, components, and parts shown in FIG. 9.3-2.

FIG. 9.3-3 illustrates an example of a fan 9.3-312 including a housing 9.3-334. The housing 9.3-334 can include a first housing shell 9.3-336 and a second housing shell 9.3-338 coupled to the first housing shell 9.3-336. The first and second housing shells 9.3-336, 9.3-338 can define an internal fan volume 9.3-340. The first and second housing shells 9.3-336, 9.3-338 can also be referred to as first and second housings, respectively. In at least one example, a plurality of fan fins or blades 9.3-342 are disposed in the internal fan volume 9.3-340 and configured or assembled to rotate about an axis of rotation 9.3-344. This axis of rotation 9.3-344 can be the same axis of rotations discussed above with reference to FIG. 9.3-2 and which is aligned to pass through the aperture 9.3-216*a* or 9.3-216*b* shown in FIG. 9.3-2. In at least one example, the first housing shell 9.3-336 and the second housing shell 9.3-338 can define a fan outlet 9.3-346 through which air is pushed by the blades 9.3-342 when rotated. In at least one example, the second housing shell 9.3-338 can define a fan inlet 9.3-332 through which the blades 9.3-342 are configured to draw air into the internal fan volume 9.3-340.

In at least one example, the fan 9.3-312 can be coupled to a logic board assembly 9.3-310 including one or more printed circuit boards (PCBs) and electronic components. In particular, the first housing shell 9.3-336 can be thermally coupled with or in direct thermal or mechanical contact with a heat generating component 9.3-348 of the logic board assembly 9.3-310. In at least one example, the first housing shell 9.3-336 can be formed of or include a thermally conductive material, such as a metal, such that heat generated by the heat generating component 9.3-348 is conductively transferred through the first housing shell 9.3-336 and air blowing through the internal fan volume 9.3-340 can convectively cool the first housing shell 9.3-336. In this way, heat generated by the heat generating component 9.3-348 is carried out through the fan outlet 9.3-346.

Any of the features, components, and/or parts, including the arrangements and configurations thereof shown in FIG. 9.3-3 can be included, either alone or in any combination, in any of the other examples of devices, features, components, and parts shown in FIGS. 9.3-2 and 9.3-4-9.3-11 and described herein. Likewise, any of the features, components, and/or parts, including the arrangements and configurations thereof shown and described with reference to FIGS. 9.3-2 and 9.3-4-9.3-11 can be included, either alone or in any combination, in the example of the devices, features, components, and parts shown in FIG. 9.3-3.

FIG. 9.3-4 illustrates a side, cross-sectional view of a fan 9.3-412 including a housing 9.3-434. The housing 9.3-434 can include a first housing shell 9.3-436 and a second housing shell 9.3-438, which can also be referred to as first and second housings, respectively, defining an internal fan volume 9.3-440. In at least one example, a plurality of fan fins or blades 9.3-442 are disposed in the internal fan volume 9.3-440 and configured or assembled to rotate about an axis of rotation 9.3-444. This axis of rotation 9.3-444 can be the same axis of rotations discussed above with reference to FIG. 9.3-2 and which is aligned to pass through the aperture 9.3-216*a* or 9.3-216*b* shown in FIG. 9.3-2. In at least one example, the first housing shell 9.3-436 and the second housing shell 9.3-438 can define a fan outlet 9.3-446 through which air is pushed by the blades 9.3-442 when rotated. In at least one example, the second housing shell 9.3-438 can define a fan inlet (not shown in the side view of FIG. 9.3-4) through which the blades 9.3-442 are configured to draw air into the internal fan volume 9.3-440.

In at least one example, the fan 9.3-412 can be coupled to a logic board assembly or printed circuit board (PCB) 9.3-410 including one or more electronic components. In particular, the first housing shell 9.3-436 can be thermally coupled with or in direct thermal or mechanical contact with a heat generating component 9.3-448 of the PCB 9.3-410. In at least one example, the first housing shell 9.3-436 can be formed of or include a thermally conductive material, such as a metal, such that heat generated by the heat generating component 9.3-448 is conductively transferred through the first housing shell 9.3-436 and air blowing through the internal fan volume 9.3-440 can convectively cool the first housing shell 9.3-436. In this way, heat generated by the heat generating component 9.3-448 is carried out through the fan outlet 9.3-446.

In at least one example, the first housing shell 9.3-436 can be thermally coupled directly with the heat generating component 9.3-448 via a thermal paste or adhesive 9.3-450 disposed between the heat generating component 9.3-448 and the first housing shell 9.3-436. In this way, the first housing shell 9.3-436 can be a heat sink disposed in the internal volume of an electronic device, such as the HMD 9.3-100 shown in FIG. 9.3-1. The housing 9.3-434 of the fan 9.3-412 can include the metal heat sink. As noted above and shown in FIG. 9.3-2, multiple fans 9.3-212*a-b* can be disposed in the HMD 9.3-100 such that the fan 9.3-412 shown in FIG. 9.3-4, which can also serve as and thus be referred to as a heat sink for the heat generating component 9.3-448, can be one of multiple fans including a second fan and heat sink of an HMD or other electronic device.

In at least one example, the system or device shown in FIG. 9.3-4 can include an electrically conductive fence 9.3-452 coupled to the PCB 9.3-410 and surrounding a perimeter of the electronic/heat generating component 9.3-448. As noted above, the fan 9.3-412 or fan assembly, can include the housing 9.3-434 having the first housing shell 9.3-436 coupled to the fence 9.3-452 and disposed over the electronic/heat generating component 9.3-448. The first housing shell 9.3-436 and the fence 9.3-452 can form an electromagnetic interference (EMI) shield around the electronic/heat generating component 9.3-448 or any other electronic component coupled to or part of the PCB 9.3-410.

In at least one embodiment, the fence 9.3-452, which can also be referred to as an EMI fence 9.3-452, can include an EMI foam 9.3-456 and a metal portion 9.3-454 disposed between the PCB 9.3-410 and the first housing shell 9.3-436 as shown, with the EMI foam 9.3-456 disposed between the metal fence 9.3-452 or fence portion/sidewall 9.3-454 and the second housing shell 9.3-436. The metal fence or fence portion 9.3-454 can be disposed between the EMI foam 9.3-456 and the PCB 9.3-410. In at least one example, housing 9.3-434, including the second housing shell 9.3-436, can be coupled to the metal EMI fence 9.3-452 or metal portion/sidewall 9.3-454 via the EMI foam 9.3-456. In at least one example, the fence 9.3-452 or sidewall 9.3-454 can extend from the second housing shell 9.3-436 of the housing 9.3-434 of the fan 9.3-412.

In at least one example, the first housing shell 9.3-436 defines or is disposed in a first major plane 9.3-458 parallel to the PCB 9.3-410, or parallel to a second major plane 9.3-460 in which the PCB 9.3-410 is disposed or which the PCB 9.3-410 defines. In at least one example, the second housing shell 9.3-436 defines or includes a planar portion 9.3-464 disposed parallel to the PCB 9.3-410, for example parallel to the second major plane 9.3-460, and the heat generating component 9.3-448 is coupled to the planar portion 9.3-464.

The fan 9.3-412 shown in FIG. 9.3-4 can thus be part of an EMI shield assembly protecting the various component of the PCB or electronic components coupled thereto, including the heat generating component 9.3-448. The metal housing 9.3-434, and in particular the second housing shell 9.3-436 thereof, can form a shield volume 9.3-462 in which the heat generating component and other components associated with the PCB 9.3-410 can be disposed. The components within the shield assembly can include one or more antennas or other components sensitive to electromagnetic waves. In at least one example, the heat generating component 9.3-448 can include one or more processors or processing units. The EMI shielding assembly can also be referred to as a shield can and the fan 9.3-412 can be a part of a convective cooling EMI shield can that simultaneously acts to cool various components associated with the PCB 9.3-410 and shield those components from electromagnetic interference.

Any of the features, components, and/or parts, including the arrangements and configurations thereof shown in FIG. 9.3-4 can be included, either alone or in any combination, in any of the other examples of devices, features, components, and parts shown in FIGS. 9.3-2-9.3-3 and 9.3-5-9.3-11 and described herein. Likewise, any of the features, components, and/or parts, including the arrangements and configurations thereof shown and described with reference to FIGS. 9.3-2-9.3-3 and 9.3-5-9.3-11 can be included, either alone or in any combination, in the example of the devices, features, components, and parts shown in FIG. 9.3-4.

FIG. 9.3-5 illustrates a plan view of a fan 9.3-512 having a first side or housing shell 9.3-536. The housing shell 9.3-536 can define a fan inlet 9.3-532 and a plurality of fan blades 9.3-542 can be arranged and configured to draw air into the fan 9.3-512 when rotated. The housing shell 9.3-536 can also at least partially define a fan outlet 9.3-546 through which air is expelled from the fan when the blades 9.3-542 rotate.

In at least one example, the housing or housing shell 9.3-536 can include one or more discrete connection features or points 9.3-566. These discrete connection features or points 9.3-566 can be used to couple the fan 9.3-512 to one or more other components of an electronic device, including the HMD 9.3-100 shown in 9.3-100, by providing material features through which connectors or connector assemblies can extend or couple to one or more frames, chassis, or other structural components of the HMD 9.3-100. In at least one example, the discrete connection features or points 9.3-566 can provide reduce surface area contacting other structural components, relative to a total area or perimeter of the housing shell 9.3-536, such that heat transfer from the fan 9.3-512 (as pulled from the heat-generating components with which the fan can be contacting as shown in FIG. 9.3-4 and described above) to structural components with which a user may come into contact is limited.

Any of the features, components, and/or parts, including the arrangements and configurations thereof shown in FIG. 9.3-5 can be included, either alone or in any combination, in any of the other examples of devices, features, components, and parts shown in FIGS. 9.3-2-9.3-4 and 9.3-6-9.3-11 and described herein. Likewise, any of the features, components, and/or parts, including the arrangements and configurations thereof shown and described with reference to FIGS. 9.3-2-9.3-4 and 9.3-6-9.3-11 can be included, either alone or in any combination, in the example of the devices, features, components, and parts shown in FIG. 9.3-2.

FIG. 9.3-6 illustrates a plan view of a fan 9.3-612 having a second side or housing shell 9.3-638. The housing shell 9.3-638 can at least partially define a fan outlet 9.3-646 through which air is expelled from the fan during operation.

In at least one example, the housing or housing shell 9.3-638 can include one or more discrete connection features or points 9.3-666. These discrete connection features or points 9.3-666 can be used to couple the fan 9.3-612 to one or more other components of an electronic device, including the HMD 9.3-100 shown in 9.3-100, by providing material features through which connectors or connector assemblies can extend or couple to one or more frames, chassis, or other structural components of the HMD 9.3-100. In at least one example, the discrete connection features or points 9.3-666 can provide reduce surface area contacting other structural components, relative to a total area or perimeter of the housing shell 9.3-638, such that heat transfer from the fan 9.3-612 (as pulled from the heat-generating components with which the fan can be contacting as shown in FIG. 9.3-4 and described above) to structural components with which a user may come into contact is limited.

Any of the features, components, and/or parts, including the arrangements and configurations thereof shown in FIG. 9.3-6 can be included, either alone or in any combination, in any of the other examples of devices, features, components, and parts shown in FIGS. 9.3-2-9.3-5 and 9.3-7-9.3-11 and described herein. Likewise, any of the features, components, and/or parts, including the arrangements and configurations thereof shown and described with reference to FIGS. 9.3-2-9.3-5 and 9.3-7-9.3-11 can be included, either alone or in any combination, in the example of the devices, features, components, and parts shown in FIG. 9.3-6.

FIG. 9.3-7 is an exploded perspective view of a fan 9.3-712 that can be similar to the fans 9.3-512, 9.3-612 shown in FIGS. 9.3-5 and 9.3-6, respectively. The fan 9.3-712 can include a housing including a first housing shell 9.3-736 and an opposing second housing shell 9.3-738 defining an internal volume in which a fan blade assembly including a plurality of fan blades 9.3-742 are disposed. The first or second housing shells 9.3-736, 9.3-738 can include or be coupled to one or more outlet fins 9.3-768 to direct air out through an outlet of the fan 9.3-712 defined by the first and/or second housing shells 9.3-736, 9.3-738.

In at least one example, the first housing shell 9.3-736 can include or be coupled to one or more discrete connection features or points 9.3-766 similar to those discrete connection features or points 9.3-566, 9.3-666 described above with reference to FIGS. 9.3-5 and 9.3-6, respectively. In at least one example, the first housing shell 9.3-736 can define a fan inlet 9.3-732 through which air is pulled into an internal volume of the fan 9.3-712.

Any of the features, components, and/or parts, including the arrangements and configurations thereof shown in FIG. 9.3-7 can be included, either alone or in any combination, in any of the other examples of devices, features, components, and parts shown in FIGS. 9.3-2-9.3-6 and 9.3-8-9.3-11 and described herein. Likewise, any of the features, components, and/or parts, including the arrangements and configurations thereof shown and described with reference to FIGS. 9.3-2-9.3-6 and 9.3-8-9.3-11 can be included, either alone or in any combination, in the example of the devices, features, components, and parts shown in FIG. 9.3-7.

FIG. 9.3-8 illustrates a perspective view of a fan assembly 9.3-804 including a first fan **9.3-812*a* and a second fan 9.3-812*b*. Each fan 9.3-812*a-b* can include respective housings 9.3-836*a-b*. The housings 9.3-836*a-b* can be similar to the first housing shell 9.3-736 shown in FIG. 9.3-7 and the first housing shell 9.3-436 shown in FIG. 9.3-4 and contacting the heat generating component 9.3-448. In at least one example, the housings 9.3-836*a-b*, or housing shells, can include respective etched portions 9.3-870*a* and 9.3-870*b*. The etched portions 9.3-870*a* and 9.3-870*b* can correspond in position and shape to the EMI fence 9.3-452 shown in FIG. 9.3-4 such that the EMI fence 9.3-452 is coupled or in contact with the housings 9.3-836*a-b* of the fans 9.3-812*a-b* at the etched portions 9.3-870*a* and 9.3-870*b*, respectively. The etched portions 9.3-870*a-b* can be formed using chemical etching, laser etching, or other etching processes used to prepare the surface of the housings 9.3-836*a-b* for conductive contact with the EMI fence 9.3-452. In at least one example, the etched portions 9.3-870*a-b* are better suited than other portions or surfaces of the housings 9.3-836*a-b* to make contact with the EMI fence 9.3-452 so that an effective EMI shield is formed as noted above with reference to at least FIG. 9.3-4**.

In at least one example, as shown in FIG. 9.3-8, the first fan **9.3-812*a* can be disposed in or define a first major plane 9.3-872*a* and the second fan 9.3-812*a* can be disposed in or define a second major plane 9.3-872*b*. The term "major plane" when referring to major planes 9.3-872*a-b* can include a plane that intersects or define a cross-sectional area of each fan 9.3-812*a-b* parallel to a planar surface of the first or second housing shells of the respective housings 9.3-836*a-b*. A cross-sectional areas of the fans 9.3-812*a-b* disposed in the major planes 9.3-872*a-b* are greater than cross-sectional areas of the fans 9.3-812*a-b* disposed in planes orthogonal to the major planes 9.3-872*a-b*. In at least one example, the fans 9.3-812*a-b* include blades rotating about an axis or rotation normal to the major planes 9.3-872*a-b*. These axes of rotation can be similar to the axis of rotation 9.3-444 shown in FIG. 9.3-4 and the major planes 9.3-872*a-b* can be similar to and/or parallel to the plane 9.3-458 shown in FIG. 9.3-4**.

In at least one example, the first major plane **9.3-872*a* and the second major plane 9.3-872*b* are disposed at an angle θ relative to one another such that the first and second major planes 9.3-872*a-b* are non-parallel with one another. The angle θ can accommodate a curvature of one or more other components of the HMD 9.3-100 shown in FIG. 9.3-1, including the frame, front cover and display screen, and so forth. This curvature, and the angle θ of the major planes 9.3-872*a-b* relative to one another can be designed to accommodate and complements the curvature of a user's face, including relative angles of left and right facial features and brow/forehead/cheek curvatures. The angle θ can dispose the fans 9.3-812*a-b* such that the fans 9.3-812*a-b* can fit compactly within the HMD 9.3-100** and a general curvature thereof as the fans are aligned with apertures of the internal frame and various MLBs and other components disposed relative to one another at the same or similar angle θ.

In at least one example, the fan assembly 9.3-804 can include a graphite bridge between the fans **9.3-812*a-b*. In at least one example, the fan assembly 9.3-804 can include tape disposed between bodies of the fans 9.3-812***a-b* for heat transfer equalization between the fans 9.3-812*a-b*.

Any of the features, components, and/or parts, including the arrangements and configurations thereof shown in FIG. 9.3-8 can be included, either alone or in any combination, in any of the other examples of devices, features, components, and parts shown in FIGS. 9.3-2-9.3-7 and 9.3-9-9.3-11 and described herein. Likewise, any of the features, components, and/or parts, including the arrangements and configurations thereof shown and described with reference to FIGS. 9.3-2-9.3-7 and 9.3-9-9.3-11 can be included, either alone or in any combination, in the example of the devices, features, components, and parts shown in FIG. 9.3-8.

FIG. 9.3-9 illustrates a partially assembled view of an MLB 9.3-910 including one or more heat generating components 9.3-948*a-b* surrounded by respective EMI fences 9.3-952*a-b*. A fan 9.3-912 is illustrated in dotted lines to indicate a position of the fan overlaying the MLB 9.3-910 and coupled with the first EMI fence 9.3-952 forming a first EMI fence about the component 9.3-948 and other components illustrated on the MLB 9.3-910. The fan 9.3-912 is transparent to illustrate component otherwise visually blocked in the view of FIG. 9.3-9.

In at least one example, a barrier 9.3-974 can be coupled to the MLB 9.3-910 surrounding the heat generating component 9.3-948*b* with which the housing of a fan can be thermally coupled, as shown and described with reference to FIG. 9.3-4. The barrier can extend from the MLB 9.3-910 to contact a housing or other surface of the fan 9.3-912 disposed against the heat generating component 9.3-948 to define a containment volume in which the heat generating component 9.3-948*b* is disposed. In at least one example, the barrier 9.3-974 is configured to contain a thermal paste, such as the thermal paste 9.3-450 shown in FIG. 9.3-4, thermally coupling the heat generating component 9.3-948 and the fan contacting the heat generating component 9.3-948*b*, which is not shown but can be similar to the fan 9.3-912 shown in contact with the heat generating component 9.3-948*a*. That is, during assembly, as the fan is pressed toward or against the heat generating component 9.3-948*b*, the thermal paste disposed there between can expand outward but the barrier 9.3-974 contains the thermal paste and prevents it from contacting or contaminating other component of or on the MLB 9.3-910 outside the barrier 9.3-974. In at least one example, the barrier 9.3-974 can include foam, silicone gel, other compressible materials, or other materials suitable for forming the barrier 9.3-974 as described above.

Any of the features, components, and/or parts, including the arrangements and configurations thereof shown in FIG. 9.3-9 can be included, either alone or in any combination, in any of the other examples of devices, features, components, and parts shown in FIGS. 9.3-2-9.3-8 and 9.3-10-9.3-11 and described herein. Likewise, any of the features, components, and/or parts, including the arrangements and configurations thereof shown and described with reference to FIGS. 9.3-2-9.3-8 and 9.3-10-9.3-11 can be included, either alone or in any combination, in the example of the devices, features, components, and parts shown in FIG. 9.3-9.

FIG. 9.3-10 illustrates a partial perspective view of an example of a fan 9.3-1012 coupled to an inner frame 9.3-1014 of an HMD device, which can be similar to the HMD 9.3-100 shown in FIG. 9.3-1. In the example of FIG. 9.3-10, the housing or housing shell 9.3-1036 of the fan 9.3-1012 can be coupled to the inner frame 9.3-1014 at a discrete touch point 9.3-1018 of a set of discrete touch points that minimize or reduce thermal transfer from the fan 9.3-1012 to the inner frame 9.3-1014. In at least one example, the touch point 9.3-1018 can be an assembly including one or more insulating members or insulators 9.3-1020*a* and 9.3-1020*b* disposed between the housing shell 9.3-1036 of the fan 9.3-1012 and the inner frame 9.3-1014.

In such an example, the internal/inner frame 9.3-1014 can be thermally isolated from the housing/housing shell 9.3-1036. In at least one example, the touch point 9.3-1018 or touch point assembly can include an interface between the housing or housing shell 9.3-1036 of the fan 9.3-1012 including the insulator(s) 9.3-1020*a-b* thermally isolating the fan 9.3-1012 from the internal frame 9.3-1014.

Any of the features, components, and/or parts, including the arrangements and configurations thereof shown in FIG. 9.3-10 can be included, either alone or in any combination, in any of the other examples of devices, features, components, and parts shown in FIGS. 9.3-2-9.3-9 and 9.3-11 and described herein. Likewise, any of the features, components, and/or parts, including the arrangements and configurations thereof shown and described with reference to FIGS. 9.3-2-9.3-9 and 9.3-11 can be included, either alone or in any combination, in the example of the devices, features, components, and parts shown in FIG. 9.3-10.

FIG. 9.3-11 illustrates a side, cross-sectional view of an example of an HMD 9.3-1100 including an outer frame 9.3-1115 defining a first opening 9.3-1122 and a second opening 9.3-1124 and an internal volume 9.3-1126. The outer frame 9.3-1115 can define an external surface of the HMD 9.3-1100 and be thus referred to as an external frame. In at least one example, a front cover assembly 9.3-1176 can be disposed in or across the first opening 9.3-1122 and a curtain assembly 9.3-1178 can occlude the second opening 9.3-1124. In at least one example, the curtain assembly 9.3-1178 can include an elastic layer 9.3-1180 defining an external surface and an air-impermeable layer 9.3-1182 defining the internal volume 9.3-1126.

In at least one example, the external frame 9.3-1115 can define an intake port 9.3-1128 disposed between the first and second openings 9.3-1122, 9.3-1124 and an exhaust port 9.3-1130 disposed between the first and second openings 9.3-1122, 9.3-1124. In particular, the external frame can include an upper sidewall 9.3-1113 defining the exhaust port 9.3-1130 and a lower sidewall 9.3-1119 defining the inlet port 9.3-1128. The lower sidewall 9.3-1119 can be disposed opposite the upper sidewall 9.3-1113.

In at least one example, the HMD 9.3-1100 includes an internal or inner frame 9.3-1114 disposed in the internal volume 9.3-1126 and coupled to the external frame 9.3-1115. The inner frame 9.3-1114 can define an aperture 9.3-1116. The HMD 9.3-1100 can also include a fan 9.3-1112 disposed in the internal volume 9.3-1126. The fan can include a housing defining an internal fan volume in which a fan blade assembly 9.3-1117 is disposed. In at least one example, the housing of the fan 9.3-1112 can include a first housing shell 9.3-1136 and a second housing shell 9.3-1138. In one example, the second housing shell 9.3-1138 can define a fan inlet 9.3-1132 and the first and second housing shells 9.3-1136, 9.3-1138 can together define a fan outlet 9.3-1146.

In at least one example, the HMD 9.3-1100 can include an MLB or PCB 9.3-1110 disposed in the internal volume 9.3-1126. The HMD 9.3-1100 can also include one or more heat generating components 9.3-1148 coupled to the MLB 9.3-1110. In at least one example, the first housing shell 9.3-1136 can be thermally coupled or in direct contact with the PCB 9.3-1110 and in particular with the heat generating component 9.3-1148. In one or more examples, the second housing shell 9.3-1138 can be coupled to the inner frame 9.3-1114 and the fan inlet 9.3-1132 can be aligned with the aperture 9.3-1116 defined by the inner frame 9.3-1114 as shown. The second housing shell 9.3-1138 defining the fan inlet 9.3-1132 can face the display assembly, including the display screen 9.3-1188 of the optical module 9.3-1108.

In at least one example, the HMD 9.3-1100 can include an optical module 9.3-1108 disposed in the internal volume 9.3-1126 and connected to the inner frame 9.3-1114. In one example, the optical module 9.3-1108 is coupled to the inner frame 9.3-1114 via a bracket 9.3-1184. In one example, the optical module 9.3-1108 can include a display assembly having a housing 9.3-1186, a display screen 9.3-1188, and a lens 9.3-1190 aligned with the display screen 9.3-1188. The fan 9.3-1112 can be disposed between the display assembly of the optical module 9.3-1108 and the PCB 9.3-1110. As shown, in at least one example, the curtain assembly 9.3-1178 can be coupled to the outer frame 9.3-1115 and occlude the second opening 9.3-1124 between the outer frame 9.3-1115 and the lens 9.3-1190.

In at least one example, the fan 9.3-1112 is configured to draw air (represented by dotted arrows in FIG. 9.3-11) from an external environment into the internal volume 9.3-1126 through the intake port 9.3-1128 and push the air out from the internal volume through the exhaust port 9.3-1130. In at least one example, the fan 9.3-1112 can be an air mover configured to draw air into the internal volume 9.3-1126 through the intake port 9.3-1128 and push the air out of the internal volume 9.3-1126 through the exhaust port 9.3-1130.

In at least one example, the air inlet port 9.3-1128, the fan inlet 9.3-1132, the fan outlet 9.3-1146, and the air exhaust port 9.3-1130 can define an airflow path (as indicated by the dotted arrows in FIG. 9.3-11) with the air inlet port 9.3-1128 upstream from the fan inlet 9.3-1132, the fan inlet 9.3-1132 upstream from the fan outlet 9.3-1146 and the fan outlet 9.3-1148 upstream from the air exhaust port 9.3-1130. The airflow path can thus be defined between the display assembly of the optical module 9.3-1108 and the fan inlet 9.3-1132. In at least one example, the internal frame 9.3-1114 can be coupled to the external frame 9.3-1115 such that the internal frame 9.3-1114 is disposed between the display assembly, including the display screen 9.3-1188, and the fan 9.3-1112 defining the fan inlet 9.3-1132 aligned with the aperture 9.3-1116 (or "opening"). In at least one example, the fan 9.3-1112 is coupled to the internal frame 9.3-1114 such that the internal frame 9.3-1114 is disposed between the fan 9.3-1112 and the optical module 9.3-1108 and the fan 9.3-1112 is disposed between the internal frame 9.3-1114 and the PCB 9.3-1110, including the heat generating component 9.3-1148 thermally coupled to the fan 9.3-1112. In at least one example, the heat generating component 9.3-1148 can include a processor or multiple processors and components of a processing unit.

In this way, the fan 9.3-1112 is configured to convectively cool the display assembly, including the display screen 9.3-1188 of the optical module 9.3-1108 via the air flowing in the airflow path. The fan 9.3-1112 can also be configured to conductively cool the processor 9.3-1148 via direct contact with the housing or first housing shell 9.3-1136 of the housing, as shown. The air moving through the fan 9.3-1112 via the fan blade assembly 9.3-1117 can convectively cool the first housing shell 9.3-1136 such that the processor 9.3-1148 is indirectly convectively cooled by the fan 9.3-1112. In at least one example, the processor 9.3-1148 is disposed outside the airflow path. In one example, the metal housing shell 9.3-1136 is disposed between the processor 9.3-1148 and the airflow path.

The external/outer frame 9.3-1115 can be referred to as a housing or an outer housing. In at least one example, the fan 9.3-1112 is configured to draw air through the inlet port 9.3-1128, through the aperture 9.3-1116 of the inner frame 9.3-1114 downstream from the inlet port 9.3-1128, through the fan inlet 9.3-1132 downstream from the aperture 9.3-1116, and through the exhaust port 9.3-1130 downstream from the fan inlet 9.3-1132. The aperture/opening 9.3-1116 defined by the internal frame 9.3-1114 can be aligned with the display screen 9.3-1188 and the fan 9.3-1112 can be disposed between the display screen 9.3-1188 and the processor 9.3-1148. The fan 9.3-1112 can be aligned with the aperture. In at least one example, the fan outlet 9.3-1146 is positioned, oriented, and otherwise shaped or configured to direct the air away from the processor 9.3-1148 and the PCB 9.3-1110 in general as the fan 9.3-1112 pushed the air out through the exhaust port 9.3-1130 from the internal volume 9.3-1126 to the external environment. The fan outlet 9.3-1146 is configured to direct air toward the exhaust port 9.3-1130.

In at least one example, the inner frame 9.3-1114 can define a first side 9.3-1192 and a second side 9.3-1194 opposite the first side 9.3-1192. In at least one example, the optical module 9.3-1108, including the display screen 9.3-1188 of the display assembly can be coupled to the first side 9.3-1192 of the inner frame 9.3-1114 and be aligned with the aperture 9.3-1116 defined by the inner frame 9.3-1114. In at least one example, the fan 9.3-1112 can be coupled to the second side 9.3-1194 of the inner frame 9.3-1114 and be aligned with the aperture 9.3-1116.

In the example of the HMD 9.3-1100 shown in FIG. 9.3-11, only one of the fan 9.3-1112, optical module 9.3-1108, aperture 9.3-1116, MLB/PCB 9.3-1110, and heat generating component 9.3-1148 are shown based on the cross-sectional side view of the HMD 9.3-1100. However, it will be understood that examples of the HMD 9.3-1100 can include multiple of these components, including two fans, two optical modules, two apertures, two MLB/PCB components, and two heat generating components as illustrated in examples of other HMD devices and components illustrated in FIGS. 9.3-1-9.3-10. Any of the features described with reference to these components in FIG. 9.3-11 can be applied to the second of any of these components included in the HMD 9.3-1100.

Any of the features, components, and/or parts, including the arrangements and configurations thereof shown in FIGS. 9.3-11 can be included, either alone or in any combination, in any of the other examples of devices, features, components, and parts shown in FIGS. 9.3-2-9.3-10 and described herein. Likewise, any of the features, components, and/or parts, including the arrangements and configurations thereof shown and described with reference to FIGS. 9.3-2-9.3-10 can be included, either alone or in any combination, in the example of the devices, features, components, and parts shown in FIG. 9.3-11.

X: Chassis

FIG. 10.0-1 illustrates a view of an example of an HMD 10-100 including a structural frame assembly 10-102. The structural frame assembly 10-102 is described in more detail here in section X.

FIG. 10-1 illustrates a view of a head mountable device (HMD) 10-100 similar to examples described herein. The HMD 10-100 can include a structural frame assembly 10-102 referred to as a chassis or frame assembly including gone or more frame components or sub-frames coupled together. The structural frame assembly 10-102 can be configured to provide mechanical strength and support to one or more other components of the HMD 10-100 coupled thereto. Other components are described herein and can include optical modules, fan assemblies, printed circuit boards, processors and other electronic computing components, sensor, displays, screens, and any other component disclosed herein.

The term "structural" as used herein can include components adding to the structural rigidity, durability, shape, and strength of the HMD 10-100. As shown and noted elsewhere with reference to other figures, the frame assembly 10-102 can define two or more apertures, for example first and second apertures 10-104*a*, 10-104*b*, which align in position with corresponding fan assemblies 10-106*a*, 10-106*b*, which each include a fan. The apertures 10-104*a*, 10-104*b* can also correspond in position, when assembled, to corresponding optical modules 10-108*a*, 10-108*b*, which can each include a display screen.

FIG. 10-2 shows a partially assembled view of the HMD 10-100 shown in FIG. 10-1, including a frame assembly 10-202 defining first and second apertures 10-204*a*, 10-204*b*. In at least one example, the frame assembly 10-202 can include an intermediate frame 10-210 defining the apertures 10-204*a-b*. In at least one example, an optical mounting bracket 10-211 can be coupled to the intermediate frame 10-210 between the apertures 10-204*a*, 10-204*b*. The display screens of the optical modules 10-108*a-b* shown in FIG. 10-1 can be coupled to first and second cantilevered guide rods 10-212*a*, 10-212*b* of the mounting bracket 10-211. The optical modules 10-108*a-b* are not shown in FIG. 10-2 in order to illustrate the intermediate frame 10-210, the mounting bracket 10-211, and the cantilevered guide rods 10-212*a-b*, but when assembled, the optical modules 10-108*a-b* can be coupled to respective guide rods 10-212*a-b* such that the first optical module 10-108*a* is aligned in position with the first aperture 10-204*a* and the second optical module 10-108*b* is aligned with the second aperture 10-204*b*.

The optical mounting bracket 10-211 can also be referred to as a mounting frame or an optical mounting frame where respective display assemblies of the optical modules 10-108*a-b* can slidably engage the guide rods 10-212*a-b*. In at least one example, the mounting bracket 10-211 can include first and second cantilever arms 10-214*a*, 10-214*b* from which the respective guide rods 10-212*a*, 10-212*b* extend. In this way, one or more optical modules, assemblies, display assemblies, display screens, and so forth can be coupled to the mounting bracket 10-211 to align with respective apertures 10-204*a*, 10-204*b*. In this way, the fans of the fan assemblies 10-216*a*, 10-216*b* coupled to the intermediate frame 10-210 and aligned with the apertures 10-204*a-b* as shown, can convectively cool the displays or display assemblies coupled to the guide rods 10-212*a-b* through the apertures 10-204*a-b*. The intermediate frame 10-210 can be disposed between the mounting bracket 10-211 and any display assemblies coupled thereto such that the display assemblies are mounted to a first side of the intermediate frame 10-210 and the fan assemblies 10-216*a-b* are mounted to a second side of the intermediate frame 10-210 opposite the first side.

Any of the features, components, and/or parts, including the arrangements and configurations thereof shown in FIGS. 10-1 and 10-2 can be included, either alone or in any combination, in any of the other examples of devices, features, components, and parts shown in FIGS. 10-3-10-6 described herein. Likewise, any of the features, components, and/or parts, including the arrangements and configurations thereof shown and described with reference to FIGS. 10-3-10-6 can be included, either alone or in any combination, in the example of the devices, features, components, and parts shown in FIGS. 10-1 and 10-2.

FIG. 10-3 shows a perspective view of a sub-assembly of an HMD similar to the HMD 10-100 of FIG. 10-1. The sub-assembly shown in FIG. 9.3-3 includes a frame assembly 10-302. The frame assembly 10-302 can be referred to as a chassis or a chassis assembly and include an outer frame 10-318 and an intermediate frame 10-310. The outer frame 10-318 can include a first material and define an internal volume 10-322. In at least one example, the intermediate frame 10-310 can be disposed in the internal volume 10-322 and be coupled to the external frame 10-318. The intermediate frame 10-310 can include a second material different than the first material. The intermediate frame 10-310 can define a first aperture 10-304*a* and a second aperture 10-304*b*.

In at least one example, the frame assembly 10-302 can also include an inner frame 10-324 coupled to the intermediate frame 10-310. In at least one example, the inner frame 10-324 can include at third material. In one example, the third material can be different than the first and second materials of the outer/external frame 10-318 and the intermediate frame 10-310, respectively. In at least one example, the second material of the intermediate frame 10-310 is stronger than the first material of the outer frame 10-318. In at least one example, the third material of the inner frame 10-324 is stiffer than the first material of the outer frame 10-318 and the second material of the intermediate frame 10-310. In at least one example, the inner frame 10-324 is stiffer due to its geometry and/or size.

In at least one example, the outer frame 10-318 can define an outer visible surface of the HMD 10-100 and the internal volume 10-322. In at least one example, the intermediate frame 10-310 can be coupled to the outer frame 10-318 and define a first aperture 10-304*a* and a second aperture 10-304*b*. In at least one example, the inner frame 10-324 can be coupled to the intermediate frame 10-310 between the first aperture 10-304*a* and the second aperture 10-304*b* on a first side 10-326 of the intermediate frame 10-324.

The first material of the outer frame 10-318 can include any number of materials providing structure to the HMD 10-100 and can include aesthetically pleasing materials defining the external, visible surface of the HMD 10-100. In at least one example, the first material can include aluminum, titanium, other metals, ceramics, plastics, composites, carbon fibers, and so forth. In at least one example, the second material of the intermediate frame 10-318 can include materials stronger than the first material. Examples of the second material can include magnesium and magnesium alloys. In at least one example the third material of the inner frame can include carbon fiber.

Accordingly, the first material of the outer frame 10-318 can be aesthetically pleasing and light-weight as well as color-customizable and so forth while the second material of the intermediate frame 10-310 can include a stronger, machine-able material for structural integrity and durability. The intermediate frame 10-310 can also thus be machined to include features compatible with other components of the HMD 10-100 coupling thereto. Also, the third material of the inner frame 10-324 can be stiffer to provide added structural strength and integrity in the center of the structure between the apertures 10-304*a-b* to reduce deformation of the frame assembly 10-302 as a whole in case of user drop events and so forth.

Any of the features, components, and/or parts, including the arrangements and configurations thereof shown in FIG. 10-3 can be included, either alone or in any combination, in any of the other examples of devices, features, components, and parts shown in FIGS. 10-1-10-2 and 10-4-10-6 and described herein. Likewise, any of the features, components, and/or parts, including the arrangements and configurations thereof shown and described with reference to FIGS. 10-1-10-2 and 10-4-10-6 can be included, either alone or in any combination, in the example of the devices, features, components, and parts shown in FIG. 10-3.

FIG. 10-4 in at least one example, such as the frame assembly 10-402 shown in FIG. 10-4, the frame assembly 10-402 can include an outer frame 10-418 and an inner frame 10-410. The frame assembly 10-402 can be referred to as a chassis or a chassis assembly and include an outer frame 10-418 and an intermediate frame 10-410 without any inner frame coupled to the intermediate frame 10-410 as shown in the example of FIG. 10-3 with the inner frame 10-324 coupled to the intermediate frame 10-324. Referring back to FIG. 10-4, the outer frame 10-418 can include a first material and define an internal volume 10-422. In at least one example, the intermediate frame 10-410 can be disposed in the internal volume 10-422 and be coupled to the external frame 10-418. The intermediate frame 10-410 can include a second material different than the first material. The intermediate frame 10-410 can define a first aperture 10-404*a* and a second aperture 10-404*b*.

In at least one example, the outer frame 10-418 can define an outer visible surface of the HMD 100 and the internal volume 10-422. In at least one example, the intermediate frame 10-410 can be coupled to the outer frame 10-418 and define a first aperture 10-404*a* and a second aperture 10-404*b*.

The first material of the outer frame 10-418 can include any number of materials providing structure to the HMD 10-100 and can include aesthetically pleasing materials defining the external, visible surface of the HMD 10-100. In at least one example, the first material can include aluminum, titanium, other metals, ceramics, plastics, composites, carbon fibers, and so forth. In at least one example, the second material of the intermediate frame 10-418 can include materials stronger than the first material. Examples of the second material can include magnesium and magnesium alloys.

Accordingly, the first material of the outer frame 10-418 can be aesthetically pleasing and light-weight as well as color-customizable and so forth while the second material of the intermediate frame 10-410 can include a stronger, machine-able material for structural integrity and durability. The intermediate frame 10-410 can also thus be machined to include features compatible with other components of the HMD 10-100 coupling thereto.

In at least one example, the intermediate frame 10-410 can be coupled to the outer frame 10-418 at discrete touch points 10-428 which limit the heat transfer between the intermediate frame 10-410 and the external/outer frame 10-418. In at least one example, the intermediate frame 10-410 is not coupled continuously around an outer edge thereof to the external/outer frame 10-418. Rather, a set of discrete touch points 10-428 are the only physical contact between the intermediate frame 10-410 and the outer frame 10-418. In this way, heat generated by components of the HMD 10-100 and transferred to the intermediate frame 10-410, for example by heat generating components coupled to the intermediate frame 10-410, does not substantially transfer to the user-facing, external surface defining outer frame 10-418 with which the user can make contact. In this way, the external/outer frame 10-418 can act as a thermal barrier between the user and the intermediate frame 10-410 and any heat generating components coupled thereto.

Any of the features, components, and/or parts, including the arrangements and configurations thereof shown in FIG. 10-4 can be included, either alone or in any combination, in any of the other examples of devices, features, components, and parts shown in FIGS. 10-1-10-3 and 10-5-10-6 and described herein. Likewise, any of the features, components, and/or parts, including the arrangements and configurations thereof shown and described with reference to FIGS. 10-1-10-3 and 10-5-10-6 can be included, either alone or in any combination, in the example of the devices, features, components, and parts shown in FIG. 10-4.

FIG. 10-5 illustrates a plan view of an example of a frame assembly 10-402 for an HMD device including an outer frame 10-518, an intermediate frame 10-510 coupled to the outer frame 10-518 and an inner frame 10-524 coupled to the intermediate frame 10-510. In at least one example, the intermediate frame 10-510 can define two apertures 10-504*a*, 10-504*b* and the inner frame 10-524 can be coupled to the inner frame 10-510 centrally between the apertures 10-504*a-b*.

In at least one example, the inner frame 10-524 can be coupled mechanically to the intermediate frame 10-510 via one or more fasteners or fastener assemblies. In at least one example, the inner frame 10-524 can be coupled to the inner frame 10-510 via an adhesive such as glue or epoxy. In at least one example, the inner frame 10-524 is glued to the intermediate frame 10-510 along substantially an entire surface area of the inner frame 10-524 facing the intermediate frame 10-510. In this way, mechanical stresses are transferred from the intermediate frame 10-510 to substantially all of the inner frame 10-524 to structurally support and stiffen the intermediate frame 10-510 and thus the whole frame assembly 10-502. In at least one example, the outer frame 10-518 surrounds a periphery of the intermediate frame 10-510.

Any of the features, components, and/or parts, including the arrangements and configurations thereof shown in FIG. 10-5 can be included, either alone or in any combination, in any of the other examples of devices, features, components, and parts shown in FIGS. 10-1-10-4 and 10-6 and described herein. Likewise, any of the features, components, and/or parts, including the arrangements and configurations thereof shown and described with reference to FIGS. 10-1-10-4 and 10-6 can be included, either alone or in any combination, in the example of the devices, features, components, and parts shown in FIG. 10-5.

FIG. 10-6 shows a close-up, cutaway view of an example of a touch point 10-628 where an intermediate frame 10-610 is coupled to an outer frame 10-618. In at least one example, the intermediate frame 10-610 can be coupled to the outer frame 10-618 at discrete connection or touch points 10-628 which limit the heat transfer between the intermediate frame 10-610 and the external/outer frame 10-618. In at least one example, the intermediate frame 10-610 is not coupled continuously around an outer edge thereof to the external/outer frame 10-618. Rather, a set of discrete touch points 10-628 are the only physical contact between the intermediate frame 10-610 and the outer frame 9.3-618. In this way, heat generated by components of the HMD 10-100 and transferred to the intermediate frame 10-610, for example by heat generating components coupled to the intermediate frame 10-610, does not substantially transfer to the user-facing, external surface defining outer frame 10-618 with which the user can make contact. In this way, the external/outer frame 10-618 can act as a thermal barrier between the user and the intermediate frame 10-610 and any heat generating components coupled thereto.

In at least one example, each of the discrete touch points 10-628 where the intermediate frame 10-610 couples to the external/outer frame 10-618 includes a fastener 10-630 and one or more insulating members, for example a first insulating member 10-632 disposed between the fastener 10-630 and the intermediate frame 10-610 and a second insulating member 10-634 disposed between the fastener 10-630 and the outer frame 10-618. These insulating members 10-632, 10-634 can be referred to as insulating interfaces or can be a part of an insulating interface to reduce heat transfer between the intermediate frame 10-610 and the outer frame 10-618. In at least one example, the insulating members 10-632, 10-634 can be O-rings. In at least one example, the insulating members 10-632, 10-634 of the insulating interfaces at the touch points 10-628 can include insulating materials such as plastics, rubbers, foams, or other insulating, non-conductive materials. In at least one example, the fastener 10-630 can include an insulating material, such as a plastic, rubber, foam, or other non-conductive material preventing heat transfer between the intermediate frame 10-610 and the outer frame 10-618.

Any of the features, components, and/or parts, including the arrangements and configurations thereof shown in FIG. 10-6 can be included, either alone or in any combination, in any of the other examples of devices, features, components, and parts shown in FIGS. 10-1-10-5 and described herein. Likewise, any of the features, components, and/or parts, including the arrangements and configurations thereof shown and described with reference to FIGS. 10-1-10-5 can be included, either alone or in any combination, in the example of the devices, features, components, and parts shown in FIG. 10-6.

XI: Optical Module

FIG. 11-1 illustrates a view of an example of an HMD 11-100 including an optical module system 11-102. The optical module system 11-102 is described in more detail here in section XI.

11.1: IPD Adjust

FIG. 11.1-1 illustrates a rear perspective view of a display assembly 11.1-102 of an HMD 11.1-100 with one or more components removed, including a curtain assembly, in order to illustrate various internal components of the HMD 11.1-100. FIG. 1 illustrates the display assembly 11.1-102, which can include a first display module **11.1-104*a* and a second display module 11.1-104*b*. The first display module 11.1-104*a* can be slidably engaged/coupled with a first adjustment mechanism 11.1-106*a* and the second optical module 11.1-104*b* can be slidably engaged/coupled with a second adjustment mechanism 11.1-106*b*. The first and second adjustment mechanisms 11.1-106*a-b* can include first and second respective guide-rods 11.1-108*a-b* and motors 11.1-110*a-b*. The first and second guide-rods can be similar such that the description of one applies to the other, with the first guide-rod 11.1-108*a* extending a first direction away from a bracket 11.1-112 and the second guide-rod 11.1-108*b* extending a second direction away from the bracket 11.1-112** opposite the first direction.

Likewise, the first and second motors **11.1-110*a-b* can be similar such that the description of one applies to the other, with the first motor 110*a* mechanically engaging the first optical module 11.1-104*a* to adjust the position thereof via the first guide-rod 11.1-108*a* and the second motor 11.1-110*b* mechanically engaging the second optical module 11.1-104*b* to adjust the position thereof via the second guide-rod 11.1-108*b*. In at least one example, the HMD 11.1-100 also includes a depressible and/or rotatable button 11.1-114 electrically coupled to the first and second motors 11.1-110*a-b*. The button 11.1-114 can electrically communicate with the first and second motors 11.1-110*a-b* via a processor or other circuitry components to cause the first and second motors 11.1-110*a-b* to activate and cause the first and second optical modules 11.1-104*a-b***, respectively, to change position relative to one another.

In at least one example, the first and second optical modules **11.1-104*a-b* can include respective display screens configured to project light toward the user's eyes when donning the HMD 11.1-100. In at least one example, the user can manipulate (i.e., depress and/or rotate) the button 11.1-114 to activate a positional adjustment of the optical modules 11.1-104*a-b* to match the inter-pupillary distance of the user's eyes. The optical modules 11.1-104*a-b* can also include one or more cameras or other sensors/sensor systems for imaging and measuring the IPD of the user such that the optical modules 11.1-104*a-b*** can be adjusted to match the IPD.

Any of the features, components, and/or parts, including the arrangements and configurations thereof shown in FIG. 11.1-1 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1-1.

11.1.1: Crown

FIG. 11.1.1-1 illustrates a rear perspective view of an inter-pupillary distance (IPD) adjustment system 11.1.1-102 including first and second optical modules **11.1.1-104*a-b* slidably engaging/coupled to respective guide-rods 11.1.1-108*a-b* and motors 11.1.1-110*a-b* of left and right adjustment subsystems 11.1.1-106*a-b*. The IPD adjustment system 11.1.1-102 can be coupled to a bracket 11.1.1-112 and include a button 11.1.1-114 in electrical communication with the motors 11.1.1-110*a-b*. In at least one example, the button 11.1.1-114 can electrically communicate with the first and second motors 11.1.1-110*a-b* via a processor or other circuitry components to cause the first and second motors 11.1.1-110*a-b* to activate and cause the first and second optical modules 11.1.1-104*a-b***, respectively, to change position relative to one another.

In at least one example, the first and second optical modules **11.1.1-104*a-b* can include respective display screens configured to project light toward the user's eyes when donning the HMD 11.1.1-100. In at least one example, the user can manipulate (i.e., depress and/or rotate) the button 11.1.1-114 to activate a positional adjustment of the optical modules 11.1.1-104*a-b* to match the inter-pupillary distance of the user's eyes. The optical modules 11.1.1-104*a-b* can also include one or more cameras or other sensors/sensor systems for imaging and measuring the IPD of the user such that the optical modules 11.1.1-104*a-b*** can be adjusted to match the IPD.

In one example, the user can manipulate the button 11.1.1-114 to cause an automatic positional adjustment of the first and second optical modules **11.1.1-104*a-b*. In one example, the user can manipulate the button 11.1.1-114 to cause a manual adjustment such that the optical modules 11.1.1-104*a-b* move further or closer away, for example when the user rotates the button 11.1.1-114 one way or the other, until the user visually matches her/his own IPD. In one example, the manual adjustment is electronically communicated via one or more circuits and power for the movements of the optical modules 11.1.1-104***a-b* via the motors 11.1.1-110*a-b* is provided by an electrical power source. In one example, the adjustment and movement of the optical modules 11.1.1-104*a-b* via a manipulation of the button 11.1.1-114 is mechanically actuated via the movement of the button 11.1.1-114.

In at least one example, the IPD adjustment system, including the button 11.1.1-114, motors, guide-rods, optical modules 11.1.1-104*a-b*, encoders, sensors, controllers, and/or other IPD adjustment components described herein, can include an automatic back-off functionality. In such an example, when the user pushes the button 11.1.1-104*a-b* to adjust the optical modules 11.1.1-104*a-b*, the optical modules 11.1.1-104*a-b* can move closer together, for example toward a user's nose. At a predetermined/set position of the optical modules 11.1.1-104*a-b* during IPD adjustment, the predetermined position being detected by the encoders or otherwise determined by the controller controlling the IPD adjustment motors, the controller can cause the optical modules 11.1.1-104*a-b* to reverse direction and move away from one another, either after the user has released the button 11.1.1-114 and/or even if the user has not released the button 11.1.1-114. In this way, the automatic back-off operation of the optical modules 11.1.1-104*a-b* during IPD adjustments can prevent the optical modules 11.1.1-104*a-b* from contacting or running into any facial features of the user or unintended contact against any other components of the HMD.

In at least one example, the automatic back-off function of the IPD adjust system can cause the optical modules 11.1.1-104*a-b* to back off or reverse direction so the optical modules 11.1.1-104*a-b* move away from one another a set distance away from where the unintended contact or facial feature interference position occurs. In at least one example, the automatic back-off function of the IPD adjust system can cause the optical modules 11.1.1-104*a-b* to back off or reverse direction so the optical modules 11.1.1-104*a-b* move away from one another to a set position predetermined to be a position where the optical modules 11.1.1-104*a-b* are not in any contact with user facial features or any unintended contact with other HMD components.

Any of the features, components, and/or parts, including the arrangements and configurations thereof shown in FIG. 11.1.1-1 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.1-1.

11.1.1.1: Adjustment Mechanism for Head-Mounted Display

For improved performance, head-mounted displays require the alignment of optical components such as lenses, projection units, displays, screens, etc. to unique facial features among a variety of users in order to promote comfort, fit, performance, etc. During the alignment process, optical components can be physically repositioned in respect to other components within a head-mounted display. As packaging space is constrained within head-mounted displays, physical repositioning mechanisms should be small in size with tightly controlled motion, for example, small electro-mechanical actuators. Though small in size, the actuators should be able to withstand dynamic events and properly function after experiencing these dynamic events. Dynamic events can include shaking, jostling, dropping, impacting, or otherwise handling the head-mounted display in a manner that leads to forces being exerted upon optical components or subcomponents within the electro-mechanical actuators.

In an example where an actuator used to reposition optical components employs a lead screw, locking-release mechanisms that allow disengagement or slip along the lead screw can be used in conjunction with dampening mechanisms that allow controlled sliding and/or stopping along a guide rail to prevent damage both to the actuator and to the optical components that undergo motion through use of the actuator. The locking-release and dampening mechanisms can include motor-driven, lead-screw system designs that leverage linear spring-loaded nut assemblies, torsional spring-loaded plates, drop-detection-based lock engagement or disengagement, and optical-component motion dampening during dynamic events. Detailed descriptions of these and other applicable mechanisms that improve performance of physical repositioning within a head-mounted display are described herein.

In a first aspect, a head-mounted display includes an optical assembly and an actuator. The actuator includes a movement mechanism configured to adjust a position of an optical component within the optical assembly, a locking-release mechanism configured to modify operation of the movement mechanism upon detection of a dynamic event, and a dampening mechanism configured to control positional changes of the optical component during the dynamic event.

In the first aspect, the movement mechanism can be configured to adjust the position of the optical component within the optical assembly to a pre-dynamic event position in accordance with detection of an end of the dynamic event. The movement mechanism can comprise a lead screw and a nut assembly, the nut assembly configured to translate along the lead screw based on rotation of the lead screw. The nut assembly can comprise separable first and second portions, and the locking-release mechanism can include a spring that linearly biases one of the first and second portions of the nut assembly against the lead screw. The modified operation of the movement mechanism can include one of the first and second portions of the nut assembly being disengaged from the lead screw. The dampening mechanism can comprise an electromagnetic component configured to generate attraction between the nut assembly and the lead screw during the dynamic event. The movement mechanism can comprise a lead screw and a plate configured to translate along the lead screw based on rotation of the lead screw. The locking-release mechanism can include a spring that torsionally biases the plate against the lead screw. Modified operation of the movement mechanism can include the plate being disengaged from the lead screw. The dampening mechanism can comprise an electromagnetic component configured to generate attraction between the plate and the lead screw during the dynamic event. The dampening mechanism can comprise an electromagnetic component configured to repel the movement mechanism from end portions of the actuator during the dynamic event. The dampening mechanism can comprise a spring or cable configured to restrict motion of the movement mechanism during the dynamic event. The first aspect may include any combination of the features described in this paragraph.

In a second aspect, a method includes detecting, using a sensor in a head-mounted display, a start of a dynamic event. In accordance with detection of the start of the dynamic event and using a locking-release mechanism, the method includes modifying operation of a movement mechanism. The movement mechanism is configured to adjust a position of an optical component within an optical assembly of the head-mounted display. The method includes detecting, using the sensor in the head-mounted display, an end of the dynamic event. In accordance with detection of the end of the dynamic event and using the movement mechanism, the method includes adjusting the position of the optical component within the optical assembly to a pre-dynamic event position.

In the second aspect, and in accordance with detection of the start of the dynamic event and using a dampening mechanism, the method can include controlling positional changes of the movement mechanism during the dynamic event. The dampening mechanism can comprise an electromagnetic component configured to repel components within the movement mechanism during the dynamic event. The dampening mechanism can comprise an electromagnetic component configured to cause attraction between components within the movement mechanism during the dynamic event. The dampening mechanism can comprise a spring or cable configured to restrict motion of the movement mechanism during the dynamic event. The movement mechanism can comprise a lead screw and a nut assembly nut assembly configured to translate along the lead screw based on rotation of the lead screw. The nut assembly can comprise separable first and second portions. The locking-release mechanism can include a spring that linearly biases one of the first and second portions of the nut assembly against the lead screw. Modified operation of the movement mechanism can include one of the first and second portions of the nut assembly being disengaged from the lead screw. The movement mechanism can comprise a lead screw and a plate configured to translate along the lead screw based on rotation of the lead screw. The locking-release mechanism can include a spring that torsionally biases the plate against the lead screw. Modified operation of the movement mechanism can include the plate being disengaged from the lead screw. The second aspect may include any combination of the features described in this paragraph.

In a third aspect, an actuator includes a movement mechanism configured to adjust a position of an optical component within an optical assembly of a head-mounted display. The movement mechanism includes a lead screw and a threaded component. The threaded component is configured to translate along the lead screw based on rotation of the lead screw. The actuator also includes a locking-release mechanism configured to modify operation of the movement mechanism upon detection of a dynamic event. The locking-release mechanism includes a spring configured to bias the threaded component against the lead screw. Modified operation of the movement mechanism includes the threaded component being disengaged from the lead screw. The actuator also includes a dampening mechanism configured to control positional changes of the movement mechanism during the dynamic event.

In the third aspect, the dampening mechanism can comprise an electromagnetic component configured to generate attraction between the threaded component and the lead screw during the dynamic event. The dampening mechanism can comprise an electromagnetic component configured to repel the movement mechanism from end portions of the actuator during the dynamic event. The third aspect may include any combination of the features described in this paragraph.

FIG. 11.1.1.1-1 is a top view of a head-mounted display 11.1.1.1-100 that includes a display assembly 11.1.1.1-102 and a head support 11.1.1.1-104. The display assembly 11.1.1.1-102 can include a housing 11.1.1.1-106 and various sub-assemblies and electronics therein, such as one or more optical assemblies 11.1.1.1-108, 11.1.1.1-110, sensors 11.1.1.1-112 (e.g., detecting gaze and/or user status), power electronics 11.1.1.1-114, and actuators 11.1.1.1-116. Various portions or subcomponents of the optical assemblies 11.1.1.1-108, 11.1.1.1-110 (e.g., such as lenses, projection units, screens, or displays) can be repositionable using the one or more actuators 11.1.1.1-116, details of which are described further herein. The optical assemblies 11.1.1.1-108, 11.1.1.1-110, sensors 11.1.1.1-112, power electronics 11.1.1.1-114, and actuators 11.1.1.1-116 are depicted schematically and in dashed lines to illustrate being hidden from view and disposed within the display assembly 11.1.1.1-102.

The head support 11.1.1.1-104 is coupled to left and right sides of the display assembly 11.1.1.1-102 (e.g., to the housing 11.1.1.1-106), extending rearward of the display assembly 11.1.1.1-102 and between the left and right sides thereof. When the head-mounted display 11.1.1.1-100 is worn on a head of a user, the display assembly 11.1.1.1-102 extends across a front of the head of the user (i.e., the face of the user), while the head support 11.1.1.1-104 extends rearward along left and right sides of the head of the user and across a rear of the head of the user. Thus, the display assembly 11.1.1.1-102 and the head support 11.1.1.1-104 cooperatively extend around the head of the user. The head support 11.1.1.1-104 includes a band 11.1.1.1-118 and one or more circumferential adjustment mechanisms 11.1.1.1-120 (e.g., two as shown on the left and right sides)

The band 11.1.1.1-118 forms a primary portion of the head support 11.1.1.1-104, which engages the head of the user to support the head-mounted display 11.1.1.1-100 worn on the head of the user. Each of the circumferential adjustment mechanisms 11.1.1.1-120 removably couples the head support 11.1.1.1-104 to the display assembly 11.1.1.1-102 and allows the head support 11.1.1.1-104 to change length overall by changing the length between the band 11.1.1.1-118 and the circumferential adjustment mechanisms 11.1.1.1-120. Though two circumferential adjustment mechanisms 11.1.1.1-120 are shown as acting from opposing sides of the head support 11.1.1.1-104, the head support 11.1.1.1-104 may alternatively employ a single adjustment mechanism.

The band 11.1.1.1-118 can be elastic, flexible, or otherwise deformable to accommodate different shapes of heads of the users. The band 11.1.1.1-118 can be formed of or otherwise include an elastic or silicone material. The band 11.1.1.1-118 may also be configured to transfer electrical power from a power source (e.g., an external battery) to the display assembly 11.1.1.1-102. For example, the band 11.1.1.1-118 may include a flexible circuit 11.1.1.1-122 extending from a power connector 11.1.1.1-124, through the circumferential adjustment mechanism 11.1.1.1-120, to a corresponding power connector (not shown) of the display assembly 11.1.1.1-102. The flexible circuit 11.1.1.1-122 (hidden and illustrated in dash-dot lines) may be embedded in the elastic or silicone material of the band 11.1.1.1-118 or otherwise hidden from view by the material of the band 11.1.1.1-118. In this manner, the band 11.1.1.1-118 may supply electrical current to the display assembly 11.1.1.1-102 inclusive of the optical assemblies 11.1.1.1-108,

11.1.1.1-110, sensors 11.1.1.1-112, power electronics 11.1.1.1-114, and actuators 11.1.1.1-116.

FIGS. 11.1.1.1-2A and 11.1.1.1-2B are detail and partially-exploded sectional views of an actuator 11.1.1.1-200. The partially-exploded sectional view of FIG. 11.1.1.1-2B is representative of the location indicated in FIG. 11.1.1.1-2A. The actuator 11.1.1.1-200 may serve as the actuator 11.1.1.1-116 disposed in the head-mounted display 11.1.1.1-100 of FIG. 11.1.1.1-1.

The actuator 11.1.1.1-200 includes a movement mechanism formed by a motor 11.1.1.1-202, a lead screw 11.1.1.1-204, a guide rail 11.1.1.1-206, and a nut assembly 11.1.1.1-208. The nut assembly 11.1.1.1-208 is configured to translate along the lead screw 11.1.1.1-204 based on rotation of the lead screw 11.1.1.1-204 and thread engagement between the nut assembly 11.1.1.1-208 and the lead screw 11.1.1.1-204. For example, the lead screw 11.1.1.1-204 can be rotationally driven by the motor 11.1.1.1-202 to cause translation of the nut assembly 11.1.1.1-208. In this manner, the movement mechanism is configured to adjust a position of an optical component (e.g., a lens, a display, a projector, a screen, a lens and a display, etc., not shown) within an optical assembly (e.g., within the optical assemblies 11.1.1.1-108, 11.1.1.1-110 within the head-mounted display 11.1.1.1-100). The threads on the lead screw 11.1.1.1-204, the threads on the nut assembly 11.1.1.1-208, or both, can be coated to provide a longer life for the actuator 11.1.1.1-200 and to reduce friction and noise associated with operation of the actuator 11.1.1.1-200.

Positional adjustment of optical component(s) can be achieved using the described movement mechanism, for example, by coupling the optical component(s) that require(s) repositioning to a portion of the nut assembly 11.1.1.1-208, though the coupling is not shown. The movement mechanism can be used to modify optical component spacing along a focal axis or modify interpupillary distance, for example, between optical assemblies within the same head-mounted display. The nut assembly 11.1.1.1-208 can be designed to avoid unintended rotation, for example, by use of the guide rail 11.1.1.1-206 extending parallel to the lead screw 11.1.1.1-204, though other anti-rotation features in the actuator 11.1.1.1-200 are also possible. When the guide rail 11.1.1.1-206 is used as shown in FIGS. 11.1.1.1-2A and 11.1.1.1-2B, the nut assembly 11.1.1.1-208 translates along both the lead screw 11.1.1.1-204 and the guide rail 11.1.1.1-206 based on rotation of the lead screw 11.1.1.1-204 as driven by the motor 11.1.1.1-202.

The actuator 11.1.1.1-200 also includes a locking-release mechanism formed by separable halves or portions 11.1.1.1-210, 11.1.1.1-212 of the nut assembly 11.1.1.1-208 and one or more springs 11.1.1.1-214 that can linearly bias the portion 11.1.1.1-212 against the lead screw 11.1.1.1-204, against the guide rail 11.1.1.1-206, and against the portion 11.1.1.1-210 of the nut assembly 11.1.1.1-208 as is best seen in the partially-exploded sectional view of FIG. 11.1.1.1-2B. In this example, the nut assembly 11.1.1.1-208 has a split-nut configuration with the portion 11.1.1.1-212 of the nut assembly 11.1.1.1-208 configured to translate away from the portion 11.1.1.1-210 of the nut assembly 11.1.1.1-208 when a load experienced is sufficient to overcome a load generated by the springs 11.1.1.1-214 against the portion 11.1.1.1-212 of the nut assembly 11.1.1.1-208. Sufficient loads of this type can occur during dynamic events (e.g., shaking, jostling, dropping, or impacting a head-mounted display that includes the actuator 11.1.1.1-200).

During a dynamic event that generates sufficient force, the threads on the lead screw 11.1.1.1-204 and the threads on the portions 11.1.1.1-210, 11.1.1.1-212 can be disengaged, and the nut assembly 11.1.1.1-208 becomes free to slide along the lead screw 11.1.1.1-204 and the guide rail 11.1.1.1-206, thus limiting or avoiding damage to the nut assembly 11.1.1.1-208 and/or to the lead screw 11.1.1.1-204 during the dynamic event based on operation of the described locking-release mechanism. After a dynamic event, when sufficient loads are no longer experienced by the actuator 11.1.1.1-200, the threads on the lead screw 11.1.1.1-204 and the threads on the portions 11.1.1.1-210, 11.1.1.1-212 of the nut assembly 11.1.1.1-208 can become reengaged, and the nut assembly 11.1.1.1-208 can once again be driven along the lead screw 11.1.1.1-204 by the motor.

Upon reengagement, the nut assembly 11.1.1.1-208 may be in a different position along the lead screw 11.1.1.1-204 than prior to or during the dynamic event. In this case, the movement mechanism may be configured to adjust the position of the nut assembly 11.1.1.1-208, and in turn, any optical components coupled or otherwise connected to the nut assembly 11.1.1.1-208, to a pre-dynamic event position, that is, to a position that was documented for the nut assembly 11.1.1.1-208 in respect to the lead screw 11.1.1.1-204 prior to the dynamic event. Though both portions 11.1.1.1-210, 11.1.1.1-212 of the nut assembly 11.1.1.1-208 are shown as being threaded at the interface to the lead screw 11.1.1.1-204, in some examples, only the portion 11.1.1.1-212 may include threads without impacting operation of the actuator 11.1.1.1-200.

To effectively implement the locking-release mechanism of the actuator 11.1.1.1-200, a position sensor (not shown) can be used to determine a position of the nut assembly 11.1.1.1-208 in respect to the lead screw 11.1.1.1-204 before, during, and after a dynamic event. An accelerometer, inertial measurement unit, or any other sensor (not shown) can be used to determine a beginning, duration, and end of the dynamic event. In another example, a magnetic encoder system can include a sensor that determines a landing position of the portions 11.1.1.1-210, 11.1.1.1-212 of the nut assembly 11.1.1.1-208 in respect to the lead screw 11.1.1.1-204 (or other portion of the actuator 11.1.1.1-200), and a controller can perform a recalibration, repositioning the portions 11.1.1.1-210, 11.1.1.1-212 of the nut assembly 11.1.1.1-208 to pre-dynamic event positions along the lead screw 11.1.1.1-204 after the dynamic event.

FIGS. 11.1.1.1-3A and 11.1.1.1-3B are detail and partially-exploded sectional views of another actuator 11.1.1.1-300. The partially-exploded sectional view of FIG. 11.1.1.1-3B is representative of the location indicated in FIG. 11.1.1.1-3A. The actuator 11.1.1.1-300 may serve as the actuator 11.1.1.1-116 disposed in the head-mounted display 11.1.1.1-100 of FIG. 11.1.1.1-1 and may be similar to the actuator 11.1.1.1-200 described in respect to FIGS. 11.1.1.1-2A and 11.1.1.1-2B. Differences between the actuator 11.1.1.1-300 and the actuator 11.1.1.1-200 are highlighted herein.

The actuator 11.1.1.1-300 includes a movement mechanism formed by a motor 11.1.1.1-302, a lead screw 11.1.1.1-304, a guide rail 11.1.1.1-306, and a nut assembly 11.1.1.1-308. The nut assembly 11.1.1.1-308 is configured to translate along the lead screw 11.1.1.1-304 and the guide rail 11.1.1.1-306 based on rotation of the lead screw 11.1.1.1-304 and thread engagement between the nut assembly 11.1.1.1-308 and the lead screw 11.1.1.1-304. The nut assembly 11.1.1.1-308 can be designed to avoid unintended rotation, for example, by use of the guide rail 11.1.1.1-306 extending parallel to the lead screw 11.1.1.1-304, though other anti-rotation features in the actuator 11.1.1.1-300 are also possible.

The actuator 11.1.1.1-300 also includes a locking-release mechanism formed by separable portions 11.1.1.1-310, 11.1.1.1-311, 11.1.1.1-312 of the nut assembly 11.1.1.1-308 and one or more springs 11.1.1.1-314 that can linearly bias the portion 11.1.1.1-312 against the guide rail 11.1.1.1-306 and the central-most portion 11.1.1.1-311 of the nut assembly 11.1.1.1-308. In turn, the portion 11.1.1.1-311 can be linearly biased against the lead screw 11.1.1.1-304 and the portion 11.1.1.1-310 of the nut assembly 11.1.1.1-308 as is best seen in the partially-exploded sectional view of FIG. 11.1.1.1-3B. In this example, the nut assembly 11.1.1.1-308 has three portions 11.1.1.1-310, 11.1.1.1-311, 11.1.1.1-312, with the portions 11.1.1.1-311, 11.1.1.1-312 of the nut assembly 11.1.1.1-208 configured to translate away and become disengaged from the portion 11.1.1.1-310 of the nut assembly 11.1.1.1-308 when a load experienced is sufficient to overcome a load generated by the springs 11.1.1.1-314 against the portion 11.1.1.1-312 of the nut assembly 11.1.1.1-208. Sufficient loads of this type can occur during dynamic events (e.g., shaking, jostling, dropping, or impacting a head-mounted display that includes the actuator 11.1.1.1-300).

The actuator 11.1.1.1-300 of FIGS. 11.1.1.1-3A and 11.1.1.1-3B differs from the actuator 11.1.1.1-200 of FIGS. 11.1.1.1-2A and 11.1.1.1-2B in that the nut assembly 11.1.1.1-308 is used in place of the nut assembly 11.1.1.1-208. The actuator 11.1.1.1-300 of FIGS. 11.1.1.1-3A and 11.1.1.1-3B may be useful in vertically tight packaging spaces, that is, the actuator 11.1.1.1-300 may be shorter in height than the actuator 11.1.1.1-200 due to the construction of the nut assemblies 11.1.1.1-208, 11.1.1.1-308. In comparison, the actuator 11.1.1.1-200 of FIGS. 11.1.1.1-2A and 11.1.1.1-2B may be useful in horizontally tight packaging spaces, that is, the actuator 11.1.1.1-200 may be narrower in width than the actuator 11.1.1.1-300 due to the construction of the nut assemblies 11.1.1.1-208, 11.1.1.1-308.

FIGS. 11.1.1.1-4A and 11.1.1.1-4B are detail and partially-exploded sectional views of another actuator 11.1.1.1-400. The partially-exploded sectional view of FIG. 11.1.1.1-4B is representative of the location indicated in FIG. 11.1.1.1-4A. The actuator 11.1.1.1-400 may serve as the actuator 11.1.1.1-116 disposed in the head-mounted display 11.1.1.1-100 of FIG. 11.1.1.1-1 and may be similar to the actuators 11.1.1.1-200, 11.1.1.1-300 described in respect to FIGS. 11.1.1.1-2A, 11.1.1.1-2B, 11.1.1.1-3A, and 11.1.1.1-3B. Differences between the actuator 11.1.1.1-400 and the actuators 11.1.1.1-200, 11.1.1.1-300 are highlighted herein.

The actuator 11.1.1.1-400 includes a movement mechanism formed by a motor 11.1.1.1-402, a lead screw 11.1.1.1-404, a guide rail 11.1.1.1-406, and a torsion assembly 11.1.1.1-408. The torsion assembly 11.1.1.1-408 is configured to translate along the lead screw 11.1.1.1-404 and the guide rail 11.1.1.1-406 based on rotation of the lead screw 11.1.1.1-404 and thread engagement between the torsion assembly 11.1.1.1-408 and the lead screw 11.1.1.1-404. The torsion assembly 11.1.1.1-408 can be designed to avoid unintended rotation, for example, by use of the guide rail 11.1.1.1-406 extending through the torsion assembly 11.1.1.1-408, though other anti-rotation features in the actuator 11.1.1.1-400 are also possible.

The torsion assembly 11.1.1.1-408 includes a plate 11.1.1.1-410, a support 11.1.1.1-412, and a torsional spring 11.1.1.1-414 that can torsionally bias the plate 11.1.1.1-410 against the lead screw 11.1.1.1-404 to form a locking-release mechanism of the actuator 11.1.1.1-400. In this example, the torsional spring 11.1.1.1-414 acts against both the plate 11.1.1.1-410 and the support 11.1.1.1-412 such that the plate 11.1.1.1-410 is configured to rotate away and become disengaged from the lead screw 11.1.1.1-404 when a load experienced is sufficient to overcome a load generated by the spring 11.1.1.1-414 against the plate 11.1.1.1-410 and the support 11.1.1.1-412. Sufficient loads of this type can occur during dynamic events (e.g., shaking, jostling, dropping, or impacting a head-mounted display that includes the actuator 11.1.1.1-400).

The actuator 11.1.1.1-400 of FIGS. 11.1.1.1-4A and 11.1.1.1-4B differs from the actuators 11.1.1.1-200, 11.1.1.1-300 of FIGS. 11.1.1.1-2A, 11.1.1.1-2B, 11.1.1.1-3A, and 11.1.1.1-3B in that the torsion assembly 11.1.1.1-408 with the rotatable plate 11.1.1.1-410 is used in place of the nut assemblies 11.1.1.1-208, 11.1.1.1-308. Use of the actuator 11.1.1.1-400 of FIGS. 11.1.1.1-4A and 11.1.1.1-4B can support unique positional relationships between the lead screw 11.1.1.1-404 and the guide rail 11.1.1.1-406 since these components can be both vertically and horizontally offset while remaining generally parallel. Further, there is less physical engagement between the plate 11.1.1.1-410 and the lead screw 11.1.1.1-404 than is present between the nut assemblies 11.1.1.1-208, 11.1.1.1-308 and the lead screws 11.1.1.1-204, 11.1.1.1-304, reducing for example, friction-based and wear-based failure potential.

The actuators 11.1.1.1-200, 11.1.1.1-300, 11.1.1.1-400 described in respect to FIGS. 11.1.1.1-2A, 11.1.1.1-2B, 11.1.1.1-3A, 11.1.1.1-3B, 11.1.1.1-4A, and 11.1.1.1-4B include split-nut and torsional-type movement mechanisms using lead screws 11.1.1.1-204, 11.1.1.1-304, 11.1.1.1-404. Additional designs for movement mechanisms can include living-hinge nut assemblies and back-driveable lead screws (not shown). For example, a living-hinge nut assembly can be separated along a central axis with coupled top and bottom edges such that the sides of the nut assembly disengage from the lead screw under sufficient force while the top and bottom edges remain coupled. In another example, a back-driveable lead screw can be controlled to reduce forces experienced during a dynamic event by enabling back-driving during the dynamic event. In addition, movement mechanisms may use rack-and-pinion, pneumatic, hydraulic, piezo-actuated, and electromagnetic designs (not shown) to achieve positioning and repositioning of optical components within optical assemblies.

A consequence of using the locking-release mechanisms described in respect to FIGS. 11.1.1.1-2A, 11.1.1.1-2B, 11.1.1.1-3A, 11.1.1.1-3B, 11.1.1.1-4A, and 11.1.1.1-4B is that the nut assemblies 11.1.1.1-208, 11.1.1.1-308 and torsion assembly 11.1.1.1-408 can become generally free-sliding along the guide rails 11.1.1.1-206, 11.1.1.1-306, 11.1.1.1-406 during a dynamic event sufficient to disengage the nut assemblies 11.1.1.1-208, 11.1.1.1-308 and torsion assembly 11.1.1.1-408 from the lead screws 11.1.1.1-204, 11.1.1.1-304, 11.1.1.1-404. To avoid damage to optical components having motion controlled by the actuators 11.1.1.1-200, 11.1.1.1-200, 11.1.1.1-400, various dampening mechanisms can be implemented to control positional changes of the otherwise free-sliding optical components during dynamic events.

FIGS. 11.1.1.1-5A and 11.1.1.1-5B are detail views of magnetic dampening mechanisms for an actuator 11.1.1.1-500 similar to the actuators 11.1.1.1-200, 11.1.1.1-300, 11.1.1.1-400 of FIGS. 11.1.1.1-2A, 11.1.1.1-2B, 11.1.1.1-3A, 11.1.1.1-3B, 11.1.1.1-4A, and 11.1.1.1-4B. The actuator 11.1.1.1-500 may serve as the actuator 11.1.1.1-116 disposed in the head-mounted display 11.1.1.1-100 of FIG. 11.1.1.1-1. The actuator 11.1.1.1-500 includes a movement mechanism formed by a motor 11.1.1.1-502, a lead screw 11.1.1.1-504, a guide rail 11.1.1.1-506, and a nut assembly 11.1.1.1-508. The nut assembly 11.1.1.1-508 is configured to translate along the lead screw 11.1.1.1-504 and the guide rail 11.1.1.1-506 based on rotation of the lead screw 11.1.1.1-504 and thread engagement between the nut assembly 11.1.1.1-508 and the lead screw 11.1.1.1-504.

Locking-release mechanisms similar to those described in reference to FIGS. 11.1.1.1-2A, 11.1.1.1-2B, 11.1.1.1-3A, and 11.1.1.1-3B, can cause the nut assembly 11.1.1.1-508 to become disengaged from the lead screw 11.1.1.1-504, for example, during a dynamic event. To minimize free sliding of the nut assembly 11.1.1.1-508, the actuator 11.1.1.1-500 can include an electromagnetic dampening mechanism formed by an electromagnetic component 11.1.1.1-516 disposed within or forming a portion of the nut assembly 11.1.1.1-508 as shown in dotted line in FIGS. 11.1.1.1-5A and 11.1.1.1-5B.

Referring to FIG. 11.1.1.1-5A, the electromagnetic dampening mechanism can include electromagnetic components 11.1.1.1-518, 11.1.1.1-520 disposed at ends of the guide rail 11.1.1.1-506 as shown in dotted line for hidden representation. In this embodiment, the electromagnetic components 11.1.1.1-518, 11.1.1.1-520 can be controlled to actuate and repel the electromagnetic component 11.1.1.1-516 during a dynamic event, thus serving as cushions or bumpers to slow or prohibit the nut assembly 11.1.1.1-508 from impacting the ends of the guide rail 11.1.1.1-506 when sliding. In other embodiments, the nut assembly 11.1.1.1-508 may include portions formed of ferritic or other material susceptible to magnetic repulsion, and the nut assembly 11.1.1.1-508 may be repelled by the electromagnetic components 11.1.1.1-518, 11.1.1.1-520 during dynamic events.

Referring to FIG. 11.1.1.1-5B, the electromagnetic dampening mechanism can include electromagnetic component 11.1.1.1-522 that runs the length of the guide rail 11.1.1.1-506 as shown in dotted line. In this embodiment, the electromagnetic component 11.1.1.1-522 can be controlled to actuate and attract the electromagnetic component 11.1.1.1-516 during a dynamic event, thus serving to slow motion of the nut assembly 11.1.1.1-508 during the dynamic event due to attraction between the electromagnetic components 11.1.1.1-516, 11.1.1.1-522. In other embodiments, the guide rail 11.1.1.1-506 may be formed of ferritic or other material susceptible to magnetic attraction, and the electromagnetic component 11.1.1.1-516 may be attracted to the guide rail 11.1.1.1-506 during dynamic events.

Other magnetic dampening mechanisms are also possible. For example, the electromagnetic components 11.1.1.1-516, 11.1.1.1-518, 11.1.1.1-520, 11.1.1.1-522 may be designed to repel in non-powered states and attract in powered states (or vice-versa), and some of the electromagnetic components 11.1.1.1-516, 11.1.1.1-518, 11.1.1.1-520, 11.1.1.1-522 may be replaced with non-powered ferritic or other magnetically-susceptible materials without changing the overall function of the dampening mechanism.

FIG. 11.1.1.1-6A and 11.1.1.1-6B are detail views of mechanical dampening mechanisms for an actuator 11.1.1.1-600 similar to the actuators 11.1.1.1-200, 11.1.1.1-300, 11.1.1.1-500 of FIGS. 11.1.1.1-2A, 11.1.1.1-2B, 11.1.1.1-3A, 11.1.1.1-3B, 11.1.1.1-5A, and 11.1.1.1-5B. The actuator 11.1.1.1-600 may serve as the actuator 11.1.1.1-116 disposed in the head-mounted display 11.1.1.1-100 of FIG. 11.1.1.1-1. The actuator 11.1.1.1-600 includes a movement mechanism formed by a motor 11.1.1.1-602, a lead screw 11.1.1.1-604, a guide rail 11.1.1.1-606, and a nut assembly 11.1.1.1-608. The nut assembly 11.1.1.1-608 is configured to translate along the lead screw 11.1.1.1-604 and the guide rail 11.1.1.1-606 based on rotation of the lead screw 11.1.1.1-604 and thread engagement between the nut assembly 11.1.1.1-608 and the lead screw 11.1.1.1-604.

Locking-release mechanisms similar to those described in reference to FIGS. 11.1.1.1-2A, 11.1.1.1-2B, 11.1.1.1-3A, and 11.1.1.1-3B can cause the nut assembly 11.1.1.1-608 to become disengaged from the lead screw 11.1.1.1-604, for example, during a dynamic event. To minimize free sliding of the nut assembly 11.1.1.1-608, the actuator 11.1.1.1-600 can include a mechanical dampening mechanism such as those described in reference to FIGS. 11.1.1.1-6A and 11.1.1.1-6B.

Referring to FIG. 11.1.1.1-6A, the mechanical dampening mechanism can include one or more cables 11.1.1.1-626, 11.1.1.1-628 (two are shown in solid and dotted line) disposed proximate to ends of the lead screw 11.1.1.1-604 and the guide rail 11.1.1.1-606. In this embodiment, the cables 11.1.1.1-626, 11.1.1.1-628 can either wind or unwind during a dynamic event, serving to slow or counteract motion of the nut assembly 11.1.1.1-608 to avoid having the nut assembly 11.1.1.1-608 impact the ends of the lead screw 11.1.1.1-604 and guide rail 11.1.1.1-606 when sliding. For example, the cables 11.1.1.1-626, 11.1.1.1-628 can be engaged under high torque conditions, or the cables 11.1.1.1-626, 11.1.1.1-628 can be designed with a predetermined amount of unwinding or stretching that occurs before stopping movement of the nut assembly 11.1.1.1-608.

Referring to FIG. 11.1.1.1-6B, the mechanical dampening mechanism can include one or more springs 11.1.1.1-630, 11.1.1.1-632 (two are shown) disposed proximate to ends of the lead screw 11.1.1.1-604 and the guide rail 11.1.1.1-606. In this embodiment, the springs 11.1.1.1-630, 11.1.1.1-632 can compress or expand during a dynamic event, serving to slow or counteract motion of the nut assembly 11.1.1.1-608 to avoid having the nut assembly 11.1.1.1-608 impact the ends of the lead screw 11.1.1.1-604 and guide rail 11.1.1.1-606 when sliding. In another example, the springs 11.1.1.1-630, 11.1.1.1-632 can be coupled to bumpers or electromagnetic components in order to combine mechanical and electromagnetic dampening means (not shown).

FIG. 11.1.1.1-7 is a flowchart depicting a process 11.1.1.1-700 of operation for an actuator similar to the actuators 11.1.1.1-200, 11.1.1.1-300, 11.1.1.1-400, 11.1.1.1-500, 11.1.1.1-600 of FIGS. 11.1.1.1-2A, 11.1.1.1-2B, 11.1.1.1-3A, 11.1.1.1-3B, 11.1.1.1-4A, 11.1.1.1-4B, 11.1.1.1-5A, 11.1.1.1-5B, 11.1.1.1-6A, and 11.1.1.1-6B disposed within a head-mounted display similar to the head-mounted display 11.1.1.1-100 of FIG. 11.1.1.1-1.

At 11.1.1.1-710, the process 11.1.1.1-700 includes detecting a start of a dynamic event, for example, using a sensor such as a position sensor, an accelerometer, an inertial measurement unit, or other sensor within or associated with the head-mounted display. The dynamic event can include events such as shaking, jostling, dropping, impacting, or otherwise handling the head-mounted display in a manner that leads to forces above a disengagement threshold being exerted upon components of the actuator and optical components of an optical assembly.

At 11.1.1.1-720, the process 11.1.1.1-700 includes activating a locking-release mechanism such as the locking-release mechanisms described in reference to the actuators 11.1.1.1-200, 11.1.1.1-300, 11.1.1.1-400. The locking-release mechanism can be activated in accordance with detection of the start of the dynamic event, for example, based on or associated with detection of the start of the dynamic event. The locking-release mechanism can modify operation of the movement mechanism within the associated actuator. The movement mechanism can include a lead screw and a nut assembly or a torsion assembly. Modifying operation of the movement mechanism can include disengaging the nut assembly (e.g., the nut assemblies 11.1.1.1-208, 11.1.1.1-308) or the torsion assembly (e.g., the torsion assembly 11.1.1.1-408) from the lead screw (e.g., the lead screws 11.1.1.1-204, 11.1.1.1-304, 11.1.1.1-404).

At 11.1.1.1-730, shown in dotted line to represent its optional nature, the process 11.1.1.1-700 includes activating a dampening mechanism such as the dampening mechanisms described in reference to the actuators 11.1.1.1-500, 11.1.1.1-600. The dampening mechanism can be activated in accordance with detection of the start of the dynamic event. In another example, the dampening mechanism can be activated in accordance with detected motion of the movement mechanism that surpasses a predetermined threshold speed or distance, indicating that a dynamic event is ongoing. The dampening mechanism can include electromagnetic components susceptible to attraction or repulsion or mechanical components such as springs and cables.

At 11.1.1.1-740, the process 11.1.1.1-700 includes detecting an end of the dynamic event, for example, using a sensor such as a position sensor, an accelerometer, an inertial measurement unit, or other sensor within or associated with the head-mounted display. The end of the dynamic event can also be detected based on detecting arrested motion of components within a movement mechanism that were previously in motion during the dynamic event.

At 11.1.1.1-750, shown in dotted line to represent its optional nature, the process 11.1.1.1-700 includes adjusting a position of an optical component within an optical assembly to a pre-dynamic event position. The movement mechanism can be used to move, for example, a nut assembly or a torsion assembly within an actuator from its current post-dynamic event position to the pre-dynamic event position. Movement of the optical component is tied to movement of the movement mechanism in this example. Repositioning supports improved function of the overall head-mounted display as the user will not be required to readjust optical components within optical assemblies after a dynamic event.

FIG. 11.1.1.1-8 shows an example of a hardware configuration for a controller 11.1.1.1-800 that may be used to implement portions of the head-mounted display 11.1.1.1-100. In the illustrated example, the controller 11.1.1.1-800 includes a processor 11.1.1.1-802, a memory device 11.1.1.1-804, a storage device 11.1.1.1-806, one or more input devices 11.1.1.1-808, and one or more output devices 11.1.1.1-810. These components may be interconnected by hardware such as a bus 11.1.1.1-812 that allows communication between the components.

The processor 11.1.1.1-802 may be a conventional device such as a central processing unit and is operable to execute computer program instructions and perform operations described by the computer program instructions. The memory device 11.1.1.1-804 may be a volatile, high-speed, short-term information storage device such as a random-access memory module. The storage device 11.1.1.1-806 may be a non-volatile information storage device such as a hard drive or a solid-state drive. The input devices 11.1.1.1-808 may include sensors and/or any type of human-machine interface, such as buttons, switches, a keyboard, a mouse, a touchscreen input device, a gestural input device, or an audio input device. The output devices 11.1.1.1-810 may include any type of device operable to provide an indication to a user regarding an operating state, such as a display screen, a light-control panel, or an audio output.

11.1.1.2: Crown Input and Feedback for Head-Mountable Devices

It can be desirable to provide a mechanism for a user to provide inputs to a head-mountable device to facilitate user interaction with the head-mountable device. It can be further desirable to provide a mechanism for providing feedback to the user. Such feedback can be provided in the form of haptic feedback delivered to the user. However, haptic feedback can feel unpleasant when applied across an entire device that is mounted on a head of the user. Where the user is providing tactile inputs by contacting an input member with another portion of the body, such as a finger or hand, the haptic feedback can be locally applied to that portion of the user's body, so that the haptic feedback is delivered in a way that is effective and pleasant to the user.

Systems of the present disclosure can provide a head-mountable device with a crown module with an input system that allows a user to provide inputs by rotating or otherwise applying torque to a crown of the crown module. The head-mountable device can interpret the rotation and/or torque as a user input. The crown module can further include a feedback system that provides localized haptic feedback at the crown. The haptic feedback can be effectively perceived by the user at the crown without causing the entire head-mountable device to vibrate against the head and/or face of the user.

According to some embodiments, for example as shown in FIG. 11.1.1.2-1, a head-mountable device 11.1.1.2-100 includes a frame 11.1.1.2-110 that is worn on a head of a user. The frame 11.1.1.2-110 can be positioned in front of the eyes of a user to provide information within a field of view of the user. The frame 11.1.1.2-110 can provide nose pads or another feature to rest on a user's nose. The frame 11.1.1.2-110 can be supported on a user's head with the securement element 11.1.1.2-120. The securement element 11.1.1.2-120 can wrap or extend along opposing sides of a user's head. The securement element 11.1.1.2-120 can include earpieces for wrapping around or otherwise engaging or resting on a user's ears. It will be appreciated that other configurations can be applied for securing the head-mountable device 11.1.1.2-100 to a user's head. For example, one or more bands, straps, belts, caps, hats, or other components can be used in addition to or in place of the illustrated components of the head-mountable device 11.1.1.2-100. By further example, the securement element 11.1.1.2-120 can include multiple components to engage a user's head.

The frame 11.1.1.2-110 can provide structure around a peripheral region thereof to support any internal components of the frame 11.1.1.2-110 in their assembled position. For example, the frame 11.1.1.2-110 can enclose and support various internal components (including for example integrated circuit chips, processors, memory devices and other circuitry) to provide computing and functional operations for the head-mountable device 11.1.1.2-100, as discussed further herein. Any number of components can be included within and/or on the frame 11.1.1.2-110 and/or the securement element 11.1.1.2-120.

The frame 11.1.1.2-110 can include and/or support one or more cameras 11.1.1.2-50. The cameras 11.1.1.2-50 can be positioned on or near an outer side 11.1.1.2-112 of the frame 11.1.1.2-110 to capture images of views external to the head-mountable device 11.1.1.2-100. As used herein, an outer side 11.1.1.2-112 of a portion of a head-mountable device is a side that faces away from the user and/or towards an external environment. The captured images can be used for display to the user or stored for any other purpose.

The head-mountable device can be provided with one or more display screens 11.1.1.2-90 that provide visual output for viewing by a user wearing the head-mountable device. As shown in FIG. 11.1.1.2-1, one or more optical modules containing display screens 11.1.1.2-90 can be positioned on an inner side 11.1.1.2-114 of the frame 11.1.1.2-110. As used herein, an inner side of a portion of a head-mountable device is a side that faces toward the user and/or away from the external environment. For example, a pair of optical modules can be provided, where each optical module is movably positioned to be within the field of view of each of a user's two eyes. Each optical module can be adjusted to align with a corresponding eye of the user. Movement of each of the optical modules can match movement of a corresponding camera 11.1.1.2-50. Accordingly, the optical module is able to accurately reproduce, simulate, or augment a view based on a view captured by the camera 11.1.1.2-50 with an alignment that corresponds to the view that the user would have naturally without the head-mountable device 11.1.1.2-100.

A display screen 11.1.1.2-90 can transmit light from a physical environment (e.g., as captured by a camera) for viewing by the user. Such a display screen can include optical properties, such as lenses for vision correction based on incoming light from the physical environment. Additionally or alternatively, a display screen 11.1.1.2-90 can provide information as a display within a field of view of the user. Such information can be provided to the exclusion of a view of a physical environment or in addition to (e.g., overlaid with) a physical environment.

As further shown in FIG. 11.1.1.2-1, the head-mountable device 11.1.1.2-100 can include a crown module 11.1.1.2-200 that received input from a user and provides feedback to the user. The crown module 11.1.1.2-200 can be provided on exterior surface of the head-mountable device 11.1.1.2-100, such as on the frame 11.1.1.2-110. As shown in FIG. 11.1.1.2-1, the crown module 11.1.1.2-200 can be provided on a lateral side 11.1.1.2-116 that is defined by and outwardly facing surface between the outer side 11.1.1.2-112 and the inner side 11.1.1.2-114 of the frame 11.1.1.2-110. It will be understood that the crown module 11.1.1.2-200 can be provided at any portion of the head-mountable device 11.1.1.2-100, including any portion of the frame 11.1.1.2-110 (e.g., outer side 11.1.1.2-112 or inner side 11.1.1.2-114) and/or on the securement element 11.1.1.2-120. It will be further understood that multiple crown modules 11.1.1.2-200 can be provided by the head-mountable device 11.1.1.2-100. For example, separate crown modules 11.1.1.2-200 can be provided on a same side or opposing sides of the head-mountable device 11.1.1.2-100.

Referring now to FIG. 11.1.1.2-2, the crown module 11.1.1.2-200 can be provided as a self-contained component that is connected both to other portions of the head-mountable device 11.1.1.2-100. For example, the frame 11.1.1.2-110 or another portion of the head-mountable device 11.1.1.2-100 can provide a recess 11.1.1.2-118 into which the crown module 11.1.1.2-200 can be inserted. By providing the crown module 11.1.1.2-200 as a self-contained component, the crown module 11.1.1.2-200 can be sealed so that its internal components are protected from an external environment.

The crown module 11.1.1.2-200 can include one or more attachment elements configured to facilitate mechanical coupling or connection of the crown module 11.1.1.2-200 and the frame 11.1.1.2-110 by engaging complementary attachment elements of the frame 11.1.1.2-110 (e.g., within the recess 11.1.1.2-118). The attachment elements can include protrusions, grooves, locks, latches, snaps, screws, clasps, threads, magnets, and/or pins can be included on the crown module 11.1.1.2-200 and/or the frame 11.1.1.2-110 for securely attaching the crown module 11.1.1.2-200 to the frame 11.1.1.2-110.

The crown module 11.1.1.2-200 and the frame 11.1.1.2-110 can each include one or more communication interfaces that facilitate a communication link between the crown module 11.1.1.2-200 and the frame 11.1.1.2-110 (e.g., a controller within the frame 11.1.1.2-110). The communication interfaces can include one or more of a variety of features, such as electrical connectors, pogo pins, conductive surfaces, wireless receivers/transmitters, and/or inductive coupling features (e.g., coils) for communicably coupling the components of the frame 11.1.1.2-110 and the crown module 11.1.1.2-200.

Referring now to FIG. 11.1.1.2-3, the crown module 11.1.1.2-200 can provide an input system 11.1.1.2-230 that facilitates receiving input by a user and a feedback system 11.1.1.2-240 that provides feedback to the user. For the purposes of the following description, the described crown module 11.1.1.2-200 is one example of that shown and discussed above with respect to FIGS. 11.1.1.2-1 and 11.1.1.2-2. However, certain features of the crown module 11.1.1.2-200, including the external surface geometry, may be simplified or vary with respect to aspects of the crown module 11.1.1.2-200 discussed above.

As shown in FIG. 11.1.1.2-3, the crown module 11.1.1.2-200 can include a housing 11.1.1.2-210 that defines at least a portion of an outer periphery of the crown module 11.1.1.2-200 and contains internal components thereof. A crown 11.1.1.2-222 can be provided at an exterior portion of the housing 11.1.1.2-210. For example, the crown 11.1.1.2-222 can protrude from a surface of the housing 11.1.1.2-210 to be accessible by user. The crown 11.1.1.2-222 can be connected to a shaft 11.1.1.2-220 that extends within the housing 11.1.1.2-210. The crown 11.1.1.2-222 and/or the shaft 11.1.1.2-220 can be supported relative to the housing 11.1.1.2-210 by one or more bearings 11.1.1.2-236 that facilitates rotation and/or translation of the crown 11.1.1.2-222 and/or the shaft 11.1.1.2-220 relative to the housing 11.1.1.2-210.

The housing 11.1.1.2-210 can define a first chamber 11.1.1.2-232 that is sealed from an external environment. Components of the input system 11.1.1.2-230 can be positioned within the first chamber 11.1.1.2-232. As such, the components of the input system 11.1.1.2-230 can be protected from ingress of fluids and/or particles that would interfere with operation of the input system 11.1.1.2-230. The first chamber 11.1.1.2-232 can be defined at least in part by one or more seal members (e.g., O-rings) that move with the shaft 11.1.1.2-220 within the first chamber 11.1.1.2-232 of the housing 11.1.1.2-210.

The housing 11.1.1.2-210 can define a second chamber 11.1.1.2-242 that is also sealed from an external environment. Components of the feedback system 11.1.1.2-240 can be positioned within the second chamber 11.1.1.2-242. As such, the components of the feedback system 11.1.1.2-240 can be protected from ingress of fluids and/or particles that would interfere with operation of the feedback system 11.1.1.2-240. At least one component (e.g., connector 11.1.1.2-250) of the feedback system 11.1.1.2-240 (e.g., in the second chamber 11.1.1.2-242) can be connected to the shaft 11.1.1.2-220 or another component of the input system 11.1.1.2-230 (e.g., in the first chamber 11.1.1.2-232). The second chamber 11.1.1.2-242 and the first chamber 11.1.1.2-232 can optionally be connected to form a single continuous chamber.

The crown 11.1.1.2-222 and/or the shaft 11.1.1.2-220 can be supported by one or more bearings 11.1.1.2-236 that facilitates rotation and/or translation of the crown 11.1.1.2-222 and/or the shaft 11.1.1.2-220 relative to the housing 11.1.1.2-210. The connector 11.1.1.2-250 can be supported by one or more bearings 11.1.1.2-246 that facilitates translation of the connector 11.1.1.2-250 with the crown 11.1.1.2-222 and/or the shaft 11.1.1.2-220. The bearings 11.1.1.2-246 can optionally allow rotation of the connector 11.1.1.2-250 relative to the crown 11.1.1.2-222 and/or the shaft 11.1.1.2-220 while coupling the connector 11.1.1.2-250 to the shaft 11.1.1.2-220 for translation in unison.

In some embodiments, the crown 11.1.1.2-222 may be used to accept rotary input from the user, which may be used to control aspects of the head-mountable device. The crown 11.1.1.2-222 may be knurled or otherwise textured to improve grip with the user's finger and/or thumb. In some embodiments, a crown 11.1.1.2-222 may be turned by the user to scroll a display or select from a range of values. In other embodiments, the crown 11.1.1.2-222 may be rotated to move a cursor or other type of selection mechanism from a first displayed location to a second displayed location in order to select an icon or move the selection mechanism between various icons that are output on the display. The crown may also be used to control the volume of a speaker, the brightness of the display screen, visual output of the head-mountable device, or control other hardware settings.

In some embodiments, an optical encoder may be used to detect the rotational motion of the crown about an axis. More specifically, the example provided below with respect to FIG. 11.1.1.2-3 may use an optical encoder to detect rotational movement, rotational direction and/or rotational speed of a component of the electronic device. Once the rotational movement, rotational direction and/or rotational speed have been determined, this information may be used to output or change information and images that are presented on a display or user interface of the head-mountable device.

As shown in the example embodiment of FIG. 11.1.1.2-3, the optical encoder of the present disclosure includes a light source 11.1.1.2-270, an optical sensor 11.1.1.2-272 (e.g., photodiode and/or photodiode array), and a shaft 11.1.1.2-220. In some embodiments, the optical encoder of the present disclosure can utilize an encoding pattern 11.1.1.2-262 disposed directly on the shaft 11.1.1.2-220. For example, the encoding pattern 11.1.1.2-262 can include a number of light and dark markings or stripes that are axially disposed along the shaft 11.1.1.2-220. Each stripe or combination of stripes on the shaft 11.1.1.2-220 may be used to identify a position of the shaft 11.1.1.2-220. For example, as light is emitted from the light source 11.1.1.2-270 and reflected off of the shaft 11.1.1.2-220 into the optical sensor 11.1.1.2-272, a position, rotation, rotation direction and rotation speed of the shaft 11.1.1.2-220 may be determined. Once the rotation direction and speed are determined, this information may be used to output or change information or images that are presented on the display or user interface of the head-mountable device.

In other embodiments, the shape or form of the shaft 11.1.1.2-220 of the encoder may be used to determine a position, rotation, rotation direction and rotation speed of the shaft 11.1.1.2-220. For example, the shaft 11.1.1.2-220 may be fluted or have a number of channels that cause the light to be reflected in a number of different directions. Accordingly, a diffractive pattern may be used to determine the rotation, rotation direction and rotation speed of the shaft 11.1.1.2-220.

As shown in FIG. 11.1.1.2-3, a crown assembly may be provided partially within the housing 11.1.1.2-210 of the crown module 11.1.1.2-200 and may be formed from a crown 11.1.1.2-222 disposed at the end of a shaft 11.1.1.2-220. As discussed above, the crown module 11.1.1.2-200 includes an optical encoder that includes a shaft 11.1.1.2-220, a light source 11.1.1.2-270, and an optical sensor 11.1.1.2-272. Although an optical sensor is specifically mentioned, embodiments disclosed herein may use various types of sensors that are arranged in various configurations for detecting the movement described herein. For example, the movement of the shaft 11.1.1.2-220 may be detected by an image sensor, a light sensor such as a CMOS light sensor or imager, a photovoltaic cell or system, photo resistive component, a laser scanner and the like.

The optical encoder may produce an encoder output that is used to determine positional data of the crown 11.1.1.2-222. In particular, the optical encoder may produce an output that is used to detect that movement of the crown 11.1.1.2-222 including the direction of the movement, speed of the movement and so on. The movement may be rotational movement (e.g., about the axis 11.1.1.2-290), translational movement (e.g., along or parallel to the axis 11.1.1.2-290), angular movement (e.g., tilt relative to the axis 11.1.1.2-290), and so on. The optical encoder may also be used to detect the degree of the change of rotation of the crown 11.1.1.2-222 and/or the angle of rotation of the crown 11.1.1.2-222 as well as the speed and the direction of the rotation of the crown 11.1.1.2-222.

The crown 11.1.1.2-222 can be coupled to and/or monolithically formed with the shaft 11.1.1.2-220. In some cases, the shaft 11.1.1.2-220 and crown 11.1.1.2-222 may be formed as a single piece. As the shaft 11.1.1.2-220 is coupled to, or is otherwise a part of the crown 11.1.1.2-222, as the crown 11.1.1.2-222 rotates or moves in a particular direction and at a particular speed, the shaft 11.1.1.2-220 also rotates or moves in the same direction and with the same speed.

As further shown in FIG. 11.1.1.2-3, the feedback system 11.1.1.2-240 can include mechanisms that facilitate haptic feedback. A feedback system can be implemented as any suitable device configured to provide force feedback, vibratory feedback, tactile sensations, and the like. For example, in one embodiment, the feedback system may be implemented as a linear actuator configured to provide a punctuated haptic feedback, such as a tap or a knock.

According to some embodiments, the feedback system 11.1.1.2-240 can include a magnetic element 11.1.1.2-252. The magnetic element 11.1.1.2-252 can be coupled to the shaft 11.1.1.2-220 (e.g., via a connector 11.1.1.2-250) such that the magnetic element 11.1.1.2-252 moves along the axis 11.1.1.2-290 relative to the housing 11.1.1.2-210 along with the shaft 11.1.1.2-220. For example, the magnetic element 11.1.1.2-252 can be directly or indirectly (e.g., via the connector 11.1.1.2-250 and/or the intermediate bearing 11.1.1.2-246) connected to the shaft 11.1.1.2-220.

The magnetic element 11.1.1.2-252 can include a temporary magnet of a soft magnetic material or a permanent magnet of a hard magnetic material. As used herein, "magnet" can include a magnet of a hard magnetic material and/or a magnet of a soft magnetic material. Hard magnetic materials include materials that retain their magnetism even after the removal of an applied magnetic field. Magnets that include hard magnetic material can form permanent magnets. Hard magnetic materials include neodymium (NdFeB), iron-neodymium, iron-boron, cobalt-samarium, iron-chromium-cobalt, and combinations or alloys thereof. Soft magnetic materials include materials that are responsive to magnetic fields, but do not retain their magnetism after removal of an applied magnetic field. Magnets that include soft magnetic material can form temporary magnets. Soft magnetic materials include iron, iron-cobalt, iron-silicon, steel, stainless steel, iron-aluminum-silicon, nickel-iron, ferrites, and combinations or alloys thereof. It will be recognized that "hard magnetic" and "soft magnetic" does not necessarily relate to the rigidity of the materials.

The feedback system 11.1.1.2-240 can further include a magnetic field generator to induce a magnetic field in the magnetic element 11.1.1.2-252. For example, one or more coils 11.1.1.2-244 can be positioned on one or more sides of the magnetic element 11.1.1.2-252. The coils 11.1.1.2-244 can include one or more helical windings in one or more layers. It will be recognized that any number of windings and arrangements of the coil can be provided to induce a magnetic field.

It will be recognized that various arrangements and alterations to the above description can be implemented to provide haptic feedback. For example, the magnetic element 11.1.1.2-252 can be exchanged with the coils 11.1.1.2-244 such that the magnetic element 11.1.1.2-252 is moveable with the housing 11.1.1.2-210 and the coils 11.1.1.2-244 are moveable with the shaft 11.1.1.2-220. The magnetic element 11.1.1.2-252 can have a variety of shapes and sizes. Multiple magnetic elements can be provided. These and other designs can be implemented to facilitate an induced magnetic field and magnetic forces between the magnetic elements.

As shown in FIG. 11.1.1.2-3, the coils 11.1.1.2-244 are operated to induce a magnetic field near the magnetic element 11.1.1.2-252. When the coils 11.1.1.2-244 are activated with an electric current, the causes the magnetic element 11.1.1.2-252 to move under the influence of a magnetic force. For example, where the magnetic element 11.1.1.2-252 is a temporary magnet of a soft magnetic material, the magnetic field can cause the magnetic domains of the magnetic element 11.1.1.2-252 to align with the magnetic field. The magnetic element 11.1.1.2-252 will then be attracted toward a direction based on the activated coils 11.1.1.2-244. Additionally or alternatively, the magnetic element 11.1.1.2-252 can be a permanent magnet of a hard magnetic material. Based on the alignment (i.e., polarity) of such a permanent magnet, the magnetic field causes the magnetic element 11.1.1.2-252 to attract toward or repel away from one or more coils 11.1.1.2-244 when activated.

As the magnetic element 11.1.1.2-252 moves (e.g., along the axis 11.1.1.2-290), the shaft 11.1.1.2-220 moves relative to the housing 11.1.1.2-210 (e.g., along the axis 11.1.1.2-290). As described above, the magnetic element 11.1.1.2-252 is connected to the shaft 11.1.1.2-220 to move with the shaft 11.1.1.2-220 and the coils 11.1.1.2-244 are connected to the housing 11.1.1.2-210 to move with the housing 11.1.1.2-210. As such, magnetic forces between the magnetic element 11.1.1.2-252 and the coils 11.1.1.2-244 are transmitted to the shaft 11.1.1.2-220 and the housing 11.1.1.2-210 to cause relative movement there between.

The haptic feedback can include movement of the shaft 11.1.1.2-220 relative to the housing and along the axis 11.1.1.2-290 of the crown module 11.1.1.2-200. For example, the magnetic element 11.1.1.2-252 can be aligned along the axis 11.1.1.2-290 of the crown module 11.1.1.2-200. Movement from haptic feedback can be along the same axis 11.1.1.2-290 about which the crown 11.1.1.2-222 and the shaft 11.1.1.2-220 rotate. Additionally or alternatively, movement from haptic feedback can be along another axis or in multiple axes and directions.

In use, the coils 11.1.1.2-244 can be operated to provide haptic feedback while the user is operating (e.g., contacting and/or rotating) the crown 11.1.1.2-222. The haptic feedback can be provided based on a variety of conditions and parameters. For example, the haptic feedback can be controlled by providing an electric current to the coils 11.1.1.2-244. The induced and corresponding magnetic force between the magnetic element 11.1.1.2-252 and the coils 11.1.1.2-244 is based on the current in the coils 11.1.1.2-244. As such, the current can have a duration, amplitude, frequency, waveform, duty cycle, or other parameters as desired for a desired and corresponding haptic feedback.

For example, the shaft 11.1.1.2-220 can be made to vibrate by applying a control signal to the coils 11.1.1.2-244. The control signal may be a wave having a predetermined amplitude and/or frequency. When the control signal is applied, the induced magnetic field causes the shaft 11.1.1.2-220 to vibrate at the frequency of the control signal. The frequency can be in a range between 10 Hz and 5,000 Hz, 50 Hz and 1,000 Hz, or 100 Hz and 500 Hz. The frequency of the control signal may be adjusted to alter the rate of movement of the shaft 11.1.1.2-220 if a certain vibration is desired. The amplitude of the control signal may be correlated to the magnitude of movement of the shaft 11.1.1.2-220, and may be adjusted to alter the intensity of the vibration.

The feedback system 11.1.1.2-240 can provide haptic feedback to a user by moving the shaft 11.1.1.2-220 of the crown module 11.1.1.2-200 relative to the housing 11.1.1.2-210. In contrast to haptic feedback applied directly to the housing 11.1.1.2-210 and/or other portions of the head-mountable device, haptic feedback provided at the shaft 11.1.1.2-220 more directly provides sensations relating to the shaft 11.1.1.2-220. For example, haptic feedback can be provided while the user is operating (e.g., contacting and/or rotating) the crown 11.1.1.2-222. As the shaft 11.1.1.2-220 and the crown 11.1.1.2-222 are moved (e.g., vibrated) relative to the housing 11.1.1.2-210, the rest of the head-mountable device can remain stationary, so that the haptic feedback is not felt by the user at other locations of contact. By further example, while the user is wearing the head-mountable device, the haptic feedback can nonetheless be localized to the crown 11.1.1.2-222 so that the user feels the haptic feedback only at that location.

The feedback system 11.1.1.2-240 can provide haptic feedback based on operation of the crown module 11.1.1.2-200. For example, haptic feedback can be provided while the crown 11.1.1.2-222 and/or the shaft 11.1.1.2-220 are rotated by the user. Incremental and/or periodic haptic feedback can be provided based on the rotation performed by the user. By further example, the haptic feedback can be provided at a speed that corresponds to the speed of rotation performed by the user. As such, the haptic feedback can provide confirmation to the user relating to the input that is received by the user.

The feedback system 11.1.1.2-240 can provide haptic feedback based on activities performed by the head-mountable device. For example, the haptic feedback can correspond to visual information that is output to the user by the head-mountable device. By further example, visual information can be modified by use or operation of the crown, and haptic feedback can be provided to indicate how the user can interact with the visual information. For example, the user can rotate the crown in one or both of two directions to cause the head-mountable device to perform certain actions.

Such rotation be performed to control the volume of a speaker, the brightness of the display screen, visual output of the head-mountable device, optical settings of an optical subassembly, or control other hardware settings. Rotation can be performed to scroll through a list or other set of items visually displayed by the head-mountable device.

While a first type of haptic feedback can be provided as the user rotates the crown, a second type of haptic feedback can be provided to indicate how the user can interact with the head-mountable device and/or limitations regarding the user input. For example, as the user scrolls through a list displayed by the head-mountable device, a first type of haptic feedback can be provided based on the user input (e.g., speed of rotation, etc.). By further example, as the user reaches the end of a list, a second type of haptic feedback can be provided to indicate that the user has reached the end of the list. Additionally or alternatively, different types of feedback can be provided in this way for other actions, such as zooming in on or out from an image, changing volume settings, changing display brightness, and the like.

The feedback system 11.1.1.2-240 can provide haptic feedback for one or more other purposes. According to some embodiments, the haptic feedback can notify the user based on a message, alert, or alarm. Such notifications can be accompanied by other feedback, including tactile, auditory, and/or visual feedback on the crown module 11.1.1.2-200 and/or the external device. According to some embodiments, the haptic feedback can provide confirmation that a user selection (e.g., made with the crown module 11.1.1.2-200) has been received by the head-mountable device and/or an external device. According to some embodiments, the haptic feedback can inform the user regarding status or operation of the head-mountable device and/or an external device.

Referring now to FIGS. 11.1.1.2-4-11.1.1.2-7, a crown module 11.1.1.2-300 can be provided for receiving input from a user and providing feedback to the user. The crown module 11.1.1.2-300 can be provided with the head-mountable device as an alternative to and/or in addition to the crown module 11.1.1.2-200. For example, the crown module 11.1.1.2-300 can be a self-contained module that is assembled with other components of the head-mountable device as described herein with respect to the crown module 11.1.1.2-200.

As shown in FIG. 11.1.1.2-4, the crown module 11.1.1.2-300 can include a housing 11.1.1.2-310 that defines at least a portion of an outer periphery of the crown module 11.1.1.2-300 and contains internal components thereof. A crown 11.1.1.2-322 can be provided at an exterior portion of the housing 11.1.1.2-310. For example, the crown 11.1.1.2-322 can protrude from a surface of the housing 11.1.1.2-310 to be accessible by user. The crown 11.1.1.2-322 can be connected to a shaft 11.1.1.2-320 that extends within the housing 11.1.1.2-310. The crown 11.1.1.2-322 and/or the shaft 11.1.1.2-320 can be supported relative to the housing 11.1.1.2-310 by one or more bearings 11.1.1.2-336.

The housing 11.1.1.2-310 can define a chamber 11.1.1.2-332 that is sealed from an external environment. As such, the components of the crown module 11.1.1.2-300 can be protected from ingress of fluids and/or particles that would interfere with operation thereof.

The crown module 11.1.1.2-300 can include a torque sensor 11.1.1.2-330 configured to detect torque that is applied by a user to the crown 11.1.1.2-322 and transferred to the shaft 11.1.1.2-320. For example, the user can apply a torque to the crown 11.1.1.2-322 by urging the crown 11.1.1.2-322 to rotate about the axis 11.1.1.2-390. It will be understood that such a torque may not result in significant rotation about the axis 11.1.1.2-390. For example, the crown 11.1.1.2-322 and/or the shaft 11.1.1.2-320 can be coupled to the housing 11.1.1.2-310 such that no significant rotation is achieved. Despite this coupling, a torque can be applied to the crown 11.1.1.2-322 and transferred to the shaft 11.1.1.2-320. As the shaft 11.1.1.2-320 is subjected to such a torque, the torque sensor 11.1.1.2-330 can detect the torque and interpret the torque as an input from the user. Mechanisms for detecting torque are described further herein.

In some embodiments, the crown 11.1.1.2-322 may be used to accept torque input from the user, which may be used to control aspects of the head-mountable device. The crown 11.1.1.2-322 may be knurled or otherwise textured to improve grip with the user's finger and/or thumb. In some embodiments, the crown 11.1.1.2-322 may be operated to provide inputs such as those described with respect to the crown module 11.1.1.2-200. For example, the crown 11.1.1.2-322 may be torqued by the user to scroll a display or select from a range of values. In other embodiments, the crown 11.1.1.2-322 may be torqued to move a cursor or other type of selection mechanism from a first displayed location to a second displayed location in order to select an icon or move the selection mechanism between various icons that are output on the display. The crown may also be used to control the volume of a speaker, the brightness of the display screen, visual output of the head-mountable device, or control other hardware settings.

As further shown in FIG. 11.1.1.2-4, the crown module 11.1.1.2-300 can be provided with a feedback system 11.1.1.2-350 that includes mechanisms that facilitate haptic feedback. According to some embodiments, the feedback system 11.1.1.2-350 can be the same or similar to the feedback system 11.1.1.2-240 of the crown module 11.1.1.2-200. For example, the feedback system 11.1.1.2-350 can be coupled to the shaft 11.1.1.2-320 such that a component of the feedback system 11.1.1.2-350 moves along the axis 11.1.1.2-390 relative to the housing 11.1.1.2-310 along with the shaft 11.1.1.2-320. Additionally or alternatively, the feedback system 11.1.1.2-350 can include or be connected to motors, hydraulic actuators, pneumatic actuators, magnetic actuators, piezoelectric actuators, electroactive materials (e.g., polymers), stepper motors, shape-memory alloys, and/or the like for providing mechanical movement as haptic feedback.

As shown in FIGS. 11.1.1.2-5 and 11.1.1.2-6, the torque sensor 11.1.1.2-330 can include multiple strain gauges 11.1.1.2-330A, 11.1.1.2-330B, 11.1.1.2-330C, and 11.1.1.2-330D. The strain gauges of the torque sensor 11.1.1.2-330 can operate as a resistive sensor formed from a material that exhibits a change in electrical resistance (e.g., conductance) in response to a dimensional change such as compression, tension, or force. The strain gauges can each be a compliant material that exhibits at least one electrical property that is variable in response to deformation, deflection, or shearing of the electrode. The strain gauges may be formed from a piezoelectric, piezoresistive, resistive, or other strain-sensitive materials.

As further shown in FIGS. 11.1.1.2-5 and 11.1.1.2-6, the strain gauges 11.1.1.2-330A, 11.1.1.2-330B, 11.1.1.2-330C, and 11.1.1.2-330D can be distributed at different locations on the shaft 11.1.1.2-320. For example, as shown in FIG. 11.1.1.2-5, some of the strain gauges can be placed on a first radial side of the shaft 11.1.1.2-320, and other strain gauges can be placed on a second radial side of the shaft 11.1.1.2-320. By further example, as shown in FIG. 11.1.1.2-6, some of the strain gauges can be placed in a first orientation relative to an axis of the shaft 11.1.1.2-320, and other strain gauges can be placed in a second orientation relative to the axis of the shaft 11.1.1.2-320. In such different orientations, an applied torque will cause some of the strain gauges to be placed in compression whereas another strain gauge is placed into tension (e.g., tensile strain) in response to the torque.

As shown in FIG. 11.1.1.2-7, the strain gauges 11.1.1.2-330A, 11.1.1.2-330B, 11.1.1.2-330C, and 11.1.1.2-330D can be coupled to each other in an electrical circuit 11.1.1.2-360. The electrical circuit can be configured to monitor one or more electrical properties (e.g., resistance, capacitance, accumulated charge, inductance, and so on) of the strain gauges for changes. The electrical circuit 11.1.1.2-360 then quantifies these changes, which may be used to estimate the applied torque. For example, the electrical circuit 11.1.1.2-360 can include a Wheatstone bridge arrangement to measure an electrical resistance by balancing two legs of a bridge circuit with opposing pairs of strain gauges. An applied voltage can be compared to a measured voltage within the Wheatstone bridge of the electrical circuit 11.1.1.2-360 to determine a combined effect of torque on the multiple strain gauges 11.1.1.2-330A, 11.1.1.2-330B, 11.1.1.2-330C, and 11.1.1.2-330D.

The multiple strain gauges 11.1.1.2-330A, 11.1.1.2-330B, 11.1.1.2-330C, and 11.1.1.2-330D can be connected to approximate a magnitude of torsional strain (e.g., torque) experienced by the shaft 11.1.1.2-320. In some embodiments, a magnitude of strain can be obtained by measuring a common property (e.g., parallel and/or series resistance) and/or a differential property (e.g., voltage division) of the multiple strain gauges. For example, differential property estimates can be combined with or compared to common property estimates. By further example, the differential property estimate and common property estimate can be combined by unweighted or weighted averaging. In some embodiments, the maximum or minimum of the two estimates can be used. In some embodiments, other methods of combining or deciding between the two estimates can be used.

Once the resistance of each strain gauge is obtained via calculation or measurement, each can be compared to a known baseline resistance value in order to determine whether the strain gauges are experiencing tension or compression. In other words, when the force-sensitive structure experiences a reaction force, it may deform, causing one or more strain gauges to either expand (e.g., tension) or contract (e.g., compression), which can cause the resistance thereof to change in a mathematically predictable manner. In some cases, the resistance or other electrical property of a strain gauge is measured as a relative value, which may factor environmental effects, such as temperature and/or residual or static strain.

For certain materials, resistance can change linearly with compression or tension. For other materials, resistance can change following a known curve in response to compression or tension. Accordingly, depending upon the material selected for the strain gauges, and the position of the strain gauges on the shaft 11.1.1.2-320, a particular resistance and/or measured voltage can be correlated to a particular amount of strain experienced by a particular strain gauge, which in turn can itself be correlated to an amount of force applied to the force-sensitive structure, which in turn can be correlated to an amount of torque applied to the crown.

Referring now to FIG. 11.1.1.2-8, components of the head-mountable device can be operably connected to provide the performance described herein. FIG. 11.1.1.2-8 shows a simplified block diagram of an illustrative head-mountable device 11.1.1.2-100 in accordance with one embodiment of the invention. It will be appreciated that components described herein can be provided on either or both of a frame and/or a securement element of the head-mountable device 11.1.1.2-100.

As shown in FIG. 11.1.1.2-8, the head-mountable device 11.1.1.2-100 can include a controller 11.1.1.2-70 with one or more processing units that include or are configured to access a memory 11.1.1.2-18 having instructions stored thereon. The instructions or computer programs may be configured to perform one or more of the operations or functions described with respect to the head-mountable device 11.1.1.2-100. The controller 11.1.1.2-70 can be implemented as any electronic device capable of processing, receiving, or transmitting data or instructions. For example, the controller 11.1.1.2-70 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

The memory 11.1.1.2-18 can store electronic data that can be used by the head-mountable device 11.1.1.2-100. For example, the memory 11.1.1.2-18 can store electrical data or content such as, for example, audio and video files, documents and applications, device settings and user preferences, timing and control signals or data for the various modules, data structures or databases, and so on. The memory 11.1.1.2-18 can be configured as any type of memory. By way of example only, the memory 11.1.1.2-18 can be implemented as random access memory, read-only memory, Flash memory, removable memory, or other types of storage elements, or combinations of such devices.

The head-mountable device 11.1.1.2-100 can include the camera 11.1.1.2-50 for capturing a view of an environment external to the head-mountable device 11.1.1.2-100. The camera 11.1.1.2-50 can include an optical sensor, such as a photodiode or a photodiode array. Additionally or alternatively, the camera 11.1.1.2-50 can include one or more of various types of optical sensors that are arranged in various configurations for detecting user inputs described herein. The camera 11.1.1.2-50 may be configured to capture an image of a scene or subject located within a field of view of the camera 11.1.1.2-50. The image may be stored in a digital file in accordance with any one of a number of digital formats. In some embodiments, the head-mountable device 11.1.1.2-100 includes a camera, which includes an image sensor formed from a charge-coupled device (CCD) and/or a complementary metal-oxide-semiconductor (CMOS) device, a photovoltaic cell, a photo resistive component, a laser scanner, and the like. It will be recognized that a camera can include other motion sensing devices.

The head-mountable device 11.1.1.2-100 can include a battery 11.1.1.2-20, which can charge and/or power components of the head-mountable device 11.1.1.2-100.

The head-mountable device 11.1.1.2-100 can include one or more other input/output components 11.1.1.2-26, which can include any suitable component for connecting head-mountable device 11.1.1.2-100 to other devices. Suitable components can include, for example, audio/video jacks, data connectors, and/or any additional or alternative input/output components. The input/output components 11.1.1.2-26 can include a microphone. The microphone can be operably connected to the controller 11.1.1.2-70 for receiving audio input, including voice commands from the user.

The input/output components 11.1.1.2-26 can include one or more speakers. The speakers can be operably connected to the controller 11.1.1.2-70 for control of speaker output, including sound levels.

The head-mountable device 11.1.1.2-100 can include communications circuitry 11.1.1.2-28 for communicating with one or more servers or other devices using any suitable communications protocol. For example, the communications circuitry 11.1.1.2-28 can support Wi-Fi (e.g., a 802.11 protocol), Ethernet, Bluetooth, high frequency systems (e.g., 900 MHZ, 2.4 GHz, and 5.6 GHz communication systems), infrared, TCP/IP (e.g., any of the protocols used in each of the TCP/IP layers), HTTP, BitTorrent, FTP, RTP, RTSP, SSH, any other communications protocol, or any combination thereof. The communications circuitry 11.1.1.2-28 can also include an antenna for transmitting and receiving electromagnetic signals.

The head-mountable device 11.1.1.2-100 can further include an optical module for displaying visual information for a user, including the display screen 11.1.1.2-90 and/or an optical subassembly 11.1.1.2-14. The head-mountable device 11.1.1.2-100 can include an optical subassembly 11.1.1.2-14 configured to help optically adjust and correctly project the image based content being displayed by the display 11.1.1.2-90 for close up viewing. The optical subassembly 11.1.1.2-14 can include one or more lenses, mirrors, or other optical devices.

The head-mountable device 11.1.1.2-100 can optionally connect to a portable electronic device 11.1.1.2-22, which can provide certain functions. The portable electronic device 11.1.1.2-22 can provide a handheld form factor (e.g., small portable electronic device which is light weight, fits in a pocket, etc.). Although not limited to these, examples include media players, phones (including smart phones), PDAs, watches, computers, and the like. The portable electronic device may include a screen for presenting the graphical portion of the media to the user. The portable electronic device can provide processing capabilities by communicating with the controller 11.1.1.2-70 of the head-mountable device 11.1.1.2-100. The portable electronic device can provide actuation to dislodge particles from components of the head-mountable device 11.1.1.2-100 by operating a haptic feedback element of the portable electronic device.

The head-mountable device 11.1.1.2-100 can include a dock 11.1.1.2-32 operative to receive the portable electronic device 11.1.1.2-22. The dock 11.1.1.2-32 can include a connector (e.g., Lightning, USB, FireWire, power, DVI, etc.), which can be plugged into a complementary connector of the portable electronic device 11.1.1.2-22. The dock 11.1.1.2-32 may include features for helping to align the connectors during engagement and for physically coupling the portable electronic device 11.1.1.2-22 to the head-mountable device 11.1.1.2-100. For example, the dock 11.1.1.2-32 may define a cavity for placement of the portable electronic device 11.1.1.2-22. The dock 11.1.1.2-32 may also include retaining features for securing portable electronic device 11.1.1.2-22 within the cavity. The connector on the dock 11.1.1.2-32 can function as a communication interface between the portable electronic device 11.1.1.2-22 and the head-mountable device 11.1.1.2-100.

The head-mountable device 11.1.1.2-100 can include one or more other sensors 11.1.1.2-40. Such sensors can be configured to sense substantially any type of characteristic such as, but not limited to, images, pressure, light, touch, force, temperature, position, motion, and so on. For example, the sensor can be a photodetector, a temperature sensor, a light or optical sensor, an atmospheric pressure sensor, a humidity sensor, a magnet, a gyroscope, an accelerometer, a chemical sensor, an ozone sensor, a particulate count sensor, and so on. By further example, the sensor can be a bio-sensor for tracking biometric characteristics, such as health and activity metrics. Other user sensors can perform facial feature detection, facial movement detection, facial recognition, eye tracking, user mood detection, user emotion detection, voice detection, etc.

The head-mountable device 11.1.1.2-100 can include one or more sensors (e.g., eye sensor) for tracking features of the user wearing the head-mountable device 11.1.1.2-100. For example, such sensors can perform facial feature detection, facial movement detection, facial recognition, eye tracking, user mood detection, user emotion detection, voice detection, etc. For example, an eye sensor can optically capture a view of an eye (e.g., pupil) and determine a direction of a gaze of the user. Such eye tracking may be used to determine a location and/or direction of interest. Detection and/or amplification of sound can then be focused if it is received from sources at such a location and/or along such a direction.

While some embodiments of touch-based input devices disclosed herein relate to head-mountable devices, it will be appreciated that the subject technology can encompass and be applied to other devices. For example, an input device (e.g., crown module) in accordance with embodiments disclosed herein can include a phone, a tablet computing device, a mobile computing device, a watch, a laptop computing device, a mouse, a game controller, a remote control, a digital media player, a stylus, and/or any other electronic device. Further, the external device can be any device that interacts with a touch-based input device. For example, an external device in accordance with embodiments disclosed herein can include a tablet, a phone, a laptop computing device, a desktop computing device, a wearable device, a mobile computing device, a tablet computing device, a display, a television, a phone, a digital media player, and/or any other electronic device.

Accordingly, embodiments of the present disclosure provide a head-mountable device with a crown module having an input system that allows a user to provide inputs by rotating or otherwise applying torque to a crown of the crown module. The head-mountable device can interpret the rotation and/or torque as a user input. The crown module can further include a feedback system that provides localized haptic feedback at the crown. The haptic feedback can be effectively perceived by the user at the crown without causing the entire head-mountable device to vibrate against the head and/or face of the user.

Various examples of aspects of the disclosure are described below as clauses for convenience. These are provided as examples, and do not limit the subject technology.

Clause A: a head-mountable device comprising: a housing; a crown positioned at least partially outside the housing; a shaft positioned within the housing and connected to the crown such that the shaft rotates with the crown and about an axis; a sensor for detecting rotation of the shaft; a magnetic element coupled to the shaft such that the magnetic element moves along the axis with the shaft; and a coil coupled to the housing and configured to induce a magnetic field in the magnetic element, such that, when the coil is activated, the magnetic element provides haptic feedback by moving the shaft and the crown relative to the housing.

Clause B: a head-mountable device comprising: a housing; a crown positioned at least partially outside the housing; a shaft positioned within the housing and connected to the crown such that a torque applied to the crown is transferred to the shaft; a sensor for detecting the torque transferred to the shaft; and a haptic feedback device coupled to the housing and configured to provide haptic feedback by moving the shaft and the crown relative to the housing.

Clause C: a crown module for a head-mountable device, the crown module comprising: a housing configured to be coupled to a frame of the head-mountable device; a crown positioned at least partially outside the housing; a shaft positioned within a sealed chamber of the housing and connected to the crown such that the shaft rotates with the crown and about an axis; a sensor for detecting rotation of the shaft and positioned within the sealed chamber; and a haptic feedback device positioned within the sealed chamber of the housing and configured to provide haptic feedback by moving the shaft and the crown along the axis and relative to the housing.

One or more of the above clauses can include one or more of the features described below. It is noted that any of the following clauses may be combined in any combination with each other, and placed into a respective independent clause, e.g., clause A, B, or C.

Clause 1: a frame; a display on an inner side of the frame; a camera on an outer side of the frame; a speaker; and a microphone.

Clause 2: the shaft is positioned within a sealed chamber of the housing that contains the sensor.

Clause 3: a pair of seal members each sealingly engaging an inner surface of the housing and an outer surface of the shaft, wherein the sensor is positioned axially between the pair of seal members.

Clause 4: the sensor is an optical sensor and the shaft comprises a visual feature for detection by the optical sensor.

Clause 5: the magnetic element and the coil are positioned within a sealed chamber of the housing.

Clause 6: the magnetic element is coupled to the shaft such that the magnetic element is configured to rotate independently of the shaft.

Clause 7: the coil is a first coil on a first axial side of the magnetic element; and the head-mountable device comprises a second coil on a second axial side of the magnetic element.

Clause 8: a controller configured to operate the coil in response to a detection by the sensor that the shaft is rotating.

Clause 9: the torque is about an axis and the haptic feedback comprises movement along the axis.

Clause 10: the sensor comprises multiple strain gauges.

Clause 11: the sensor comprises multiple strain gauges electrically connected to each other in a Wheatstone bridge arrangement.

Clause 12: at least two of the multiple strain gauges have different orientations relative to a longitudinal axis of the shaft.

Clause 13: the haptic feedback device comprises an actuator configured to expand toward and contract away from the shaft.

Clause 14: a controller configured to operate the haptic feedback device in response to a detection by the sensor that the torque is applied to the crown.

Clause 15: a pair of seal members each sealingly engaging an inner surface of the housing and an outer surface of the shaft, wherein the sensor is positioned axially between the pair of seal members.

Clause 16: the sensor is an optical sensor and the shaft comprises a visual feature for detection by the optical sensor.

Clause 17: the haptic feedback device comprises: a magnetic element coupled to the shaft such that the magnetic element moves along the axis with the shaft; and a coil coupled to the housing and configured to induce a magnetic field in the magnetic element, such that, when the coil is activated, the magnetic element provides haptic feedback by moving the shaft and the crown relative to the housing.

11.1.2: Wishbone and Mustache

FIG. 11.1.2-1 illustrates a front perspective view of a portion of an HMD 11.1.2-100, including an outer structural frame 11.1.2-102 and an inner or intermediate structural frame 11.1.2-104 defining first and second apertures 11.1.2-106*a*, 11.1.2-106*b*. The apertures 11.1.2-106*a-b* are shown in dotted lines in FIG. 11.1.2-1 because a view of the apertures 11.1.2-106*a-b* can be blocked by one or more other components of the HMD 11.1.2-100 coupled to the inner frame 11.1.2-104 and/or the outer frame 11.1.2-102, as shown. In at least one example, the HMD 11.1.2-100 can include a first mounting bracket 11.1.2-108 coupled to the inner frame 11.1.2-104. In at least one example, the mounting bracket 11.1.2-108 is coupled to the inner frame 11.1.2-104 between the first and second apertures 11.1.2-106*a-b*.

The mounting bracket 11.1.2-108 can include a middle or central portion 11.1.2-109 coupled to the inner frame 11.1.2-104. In some examples, the middle or central portion 11.1.2-109 may not be the geometric middle or center of the bracket 11.1.2-108. Rather, the middle/central portion 11.1.2-109 can be disposed between first and second cantilevered extension arms extending away from the middle portion 11.1.2-109. In at least one example, the mounting bracket 108 includes a first cantilever arm 11.1.2-112 and a second cantilever arm 11.1.2-114 extending away from the middle portion 11.1.2-109 of the mount bracket 11.1.2-108 coupled to the inner frame 11.1.2-104.

As shown in FIG. 11.1.2-1, the outer frame 11.1.2-102 can define a curved geometry on a lower side thereof to accommodate a user's nose when the user dons the HMD 11.1.2-100. The curved geometry can be referred to as a nose bridge 11.1.2-111 and be centrally located on a lower side of the HMD 11.1.2-100 as shown. In at least one example, the mounting bracket 11.1.2-108 can be connected to the inner frame 11.1.2-104 between the apertures 11.1.2-106*a-b* such that the cantilevered arms 11.1.2-112, 11.1.2-114 extend downward and laterally outward away from the middle portion 11.1.2-109 to compliment the nose bridge 11.1.2-111 geometry of the outer frame 11.1.2-102. In this way, the mounting bracket 11.1.2-108 is configured to accommodate the user's nose as noted above. The nose bridge 11.1.2-111 geometry accommodates the nose in that the nose bridge 11.1.2-111 provides a curvature that curves with, above, over, and around the user's nose for comfort and fit.

The first cantilever arm 11.1.2-112 can extend away from the middle portion 11.1.2-109 of the mounting bracket 11.1.2-108 in a first direction and the second cantilever arm 11.1.2-114 can extend away from the middle portion 11.1.2-109 of the mounting bracket 11.1.2-10 in a second direction opposite the first direction. The first and second cantilever arms 11.1.2-112, 11.1.2-114 are referred to as "cantilevered" or "cantilever" arms because each arm 11.1.2-112, 11.1.2-114, includes a distal free end 11.1.2-116, 11.1.2-118, respectively, which are free of affixation from the inner and outer frames 11.1.2-102, 11.1.2-104. In this way, the arms 11.1.2-112, 11.1.2-114 are cantilevered from the middle portion 11.1.2-109, which can be connected to the inner frame 11.1.2-104, with distal ends 11.1.2-102, 11.1.2-104 unattached.

In at least one example, the HMD 11.1.2-100 can include one or more components coupled to the mounting bracket 11.1.2-108. In one example, the components include a plurality of sensors 11.1.2-110*a-f*. Each sensor of the plurality of sensors 11.1.2-110*a-f* can include various types of sensors, including cameras, IR sensors, and so forth. In some examples, one or more of the sensors 11.1.2-110*a-f* can be used for object recognition in three-dimensional space such that it is important to maintain a precise relative position of two or more of the plurality of sensors 11.1.2-110*a-f*. The cantilevered nature of the mounting bracket 11.1.2-108 can protect the sensors 11.1.2-110*a-f* from damage and altered positioning in the case of accidental drops by the user. Because the sensors 11.1.2-110*a-f* are cantilevered on the arms 11.1.2-112, 11.1.2-114 of the mounting bracket 11.1.2-108, stresses and deformations of the inner and/or outer frames 11.1.2-104, 11.1.2-102 are not transferred to the cantilevered arms 11.1.2-112, 11.1.2-114 and thus do not affect the relative positioning of the sensors 11.1.2-110*a-f* coupled/mounted to the mounting bracket 11.1.2-108.

Any of the features, components, and/or parts, including the arrangements and configurations thereof shown in FIG. 11.1.2-1 can be included, either alone or in any combination, in any of the other examples of devices, features, components, and parts shown in FIGS. 11.1.2-2-11.1.2-5 and described herein. Likewise, any of the features, components, and/or parts, including the arrangements and configurations thereof shown and described with reference to FIGS. 11.1.2-2-11.1.2-5 can be included, either alone or in any combination, in the example of the devices, features, components, and parts shown in FIG. 11.1.2-1.

FIG. 11.1.2-2 illustrates a perspective view of an example of a mounting bracket 11.1.2-208 including a middle portion 11.1.2-209 and first and second arms 11.1.2-212, 11.1.2-214 extending from the middle portion 11.1.2-209 to form a nose bridge 11.1.2-211 geometry. One or more components including sensors 11.1.2-210*a-f* can be coupled to the mounting bracket 11.1.2-208, including to the cantilever arms 11.1.2-212, 11.1.2-214. In at least one example, the material of the mounting bracket 11.1.2-208 can include a strong, durable, and stiff material and/or geometry to maintain a relative position between sensors 11.1.2-210*a-f* during drop events or other forces causing deformations to the frame to which the mounting bracket 11.1.2-209 is coupled. The material of the mounting bracket 11.1.2-208 can include metals such as aluminum, steel including stainless steel, magnesium or magnesium alloys, hard plastics, ceramics, composite materials, carbon fiber, or any combination thereof.

In at least one example, a first sensor, including any of the sensors 11.1.2-210*a-c* can be coupled to the first cantilever arm 11.1.2-212 and a second sensor, including any of the sensors 11.1.2-210*e-f* can be coupled to the second cantilever arm 11.1.2-214. In at least one example, the first sensor can include a visual sensor such as a camera or an infrared sensor. In at least one example, the second sensor can include a visual sensor such as a camera or an infrared sensor.

Any of the features, components, and/or parts, including the arrangements and configurations thereof shown in FIG. 11.1.2-2 can be included, either alone or in any combination, in any of the other examples of devices, features, components, and parts shown in FIGS. 11.1.2-1 and 11.1.2-3-11.1.2-5 and described herein. Likewise, any of the features, components, and/or parts, including the arrangements and configurations thereof shown and described with reference to FIGS. 11.1.2-1 and 11.1.2-3-11.1.2-5 can be included, either alone or in any combination, in the example of the devices, features, components, and parts shown in FIG. 11.1.2-2.

FIG. 11.1.2-3 illustrates a perspective view of a partially assembled HMD 11.1.2-300 including an outer frame 11.1.2-302, an inner frame 11.1.2-304 coupled to the outer frame 11.1.2-302, and a second mounting bracket 11.1.2-320 coupled to the inner frame 11.1.2-304 between first and second apertures 11.1.2-306*a-b* defined by the inner frame 11.1.2-304. In at least one example, the second mounting bracket 11.1.2-320 can include first and second cantilevered mounting arms 11.1.2-322, 11.1.2-324 extending in opposite directions from one another from a middle portion 11.1.2-326 of the mounting bracket 11.1.2-320. The first and second cantilever arms 11.1.2-322, 11.1.2-324 can be free of affixation to any other component or frame of the HMD 11.1.2-300 similar to the cantilever arms 11.1.2-112, 11.1.2-114 of the mounting bracket 11.1.2-108 shown in FIG. 11.1.2-1. In at least one example, the mounting bracket 11.1.2-320 can be coupled to the inner frame 11.1.2-304 at the middle portion 11.1.2-326 of the mounting bracket 11.1.2-320.

In at least one example, the first cantilever arm 11.1.2-322 can extend from the middle portion 11.1.2-326 in a first direction and the second cantilever arm 11.1.2-324 can extend from the middle portion 11.1.2-326 in a second direction opposite the first direction. In at least one example, a first guide rod 11.1.2-328 can be coupled to the first cantilever arm 11.1.2-322 and extend in the first direction and a second guide rod 11.1.2-330 can be coupled to the second cantilever arm 11.1.2-324 and extend in the second direction opposite the first direction.

In at least one example, first and second optical modules (not shown in FIG. 11.1.2-3) can be slidably/adjustably coupled to the mounting bracket 11.1.2-320 via the first and second guide rods 11.1.2-328, 11.1.2-330. The guide rods 11.1.2-328, 11.1.2-330 can include distal ends 11.1.2-332, 11.1.2-334, respectively, which are opposite respective proximal ends 11.1.2-333, 11.1.2-335. The distal ends 11.1.2-332, 11.1.2-334 can be free of affixation to any other component of frame 11.1.2-302, 11.1.2-304 of the HMD 11.1.2-300. In this way, the guide rods 11.1.2-328, 11.1.2-330 are cantilevered with free ends floating. In one or more examples, as noted above, one or more optical modules, including display screens, sensors, structural components, and electronic components can be slidably coupled to the inner frame 11.1.2-304 via the guide rods 11.1.2-328, 11.1.2-330 and cantilever arms 11.1.2-322, 11.1.2-324 of the mounting bracket 11.1.2-320. The sensors, display screens, and other components of the optical module may be such that they operate most effectively when a relative distance between and position of those coupled to the first guide rod 11.1.2-328 and the second guide rod 11.1.2-330 are maintained, even during drop events and when other structural components, including the outer and/or inner frames 11.1.2-302, 11.1.2-304 are inadvertently deformed or bent.

Along these lines, the cantilevered nature of the mounting bracket 11.1.2-320 can protect the optical modules and components thereof from damage and altered positioning in the case of accidental drops by the user. Because the optical modules cantilevered on the guide rods 11.1.2-328, 11.1.2-330 and the cantilever arms 11.1.2-322, 11.1.2-324 of the mounting bracket 11.1.2-320, stresses and deformations of the inner and/or outer frames 11.1.2-304, 11.1.2-302 are not transferred to the cantilevered arms 11.1.2-322, 11.1.2-323 and/or the guide rods 11.1.2-328, 11.1.2-330 and thus do not affect the relative positioning of the optical modules slidably coupled/mounted to the mounting bracket 11.1.2-320. Along these lines, the material of the mounting bracket 11.1.2-320 can include metals such as aluminum, steel including stainless steel, magnesium or magnesium alloys, hard plastics, ceramics, composite materials, carbon fiber, or any combination thereof. In at least one example, the guide rods 11.1.2-328, 11.1.2-330 can include low weight, low friction materials. For example, the guide rods 11.1.2-328, 11.1.2-330 can include carbon fiber laminate materials. The guide rods 11.1.2-328, 11.1.2-330 can be formed as hollow tubes to decrease weight.

In at least one example, the first and second cantilever arms 11.1.2-322 and 11.1.2-324 and/or the first and second guide-rods 11.1.2-328 and 11.1.2-330 extending therefrom, respectively, can be disposed at an angle relative to one another. The angle can be such that the bracket 11.1.2-326 and associated components, including guide-rods 11.1.2-328 and 11.1.2-330, cantilever arms 11.1.2-322 and 11.1.2-324, and display units connected to the guide-rods 11.1.2-328 and 11.1.2-330 are curved and/or oriented to complement the curvature of the user's face. In at least one example, the angle can be between about 5-degrees and about 25-degrees. In one example, the angle can be between about 10-degrees and about 20-degrees, for example about 15-degrees. In at least one example, the bracket 11.1.2-326 can be made of magnesium and carbon fiber panels on a rear side thereof to add stiffness.

Any of the features, components, and/or parts, including the arrangements and configurations thereof shown in FIG. 11.1.2-3 can be included, either alone or in any combination, in any of the other examples of devices, features, components, and parts shown in FIGS. 11.1.2-1-11.1.2-2 and 11.1.2-4-11.1.2-5 and described herein. Likewise, any of the features, components, and/or parts, including the arrangements and configurations thereof shown and described with reference to FIGS. 11.1.2-1-11.1.2-2 and 11.1.2-4-11.1.2-5 can be included, either alone or in any combination, in the example of the devices, features, components, and parts shown in FIG. 11.1.2-3.

FIG. 11.1.2-4 illustrates a portion of an HMD 11.1.2-400 including an optical module 11.1.2-436 slidably engaged to a mounting bracket via a guide rod 11.1.2-428, which can be similar to the guide rod 11.1.2-328 shown in FIG. 11.1.2-3 and described above. The optical module 11.1.2-436 can include a display assembly 11.1.2-438 including a display screen 11.1.2-440, all of which can be slidably engaged with the guide rod 11.1.2-428 as shown. As noted above, the components and parts shown and described in FIGS. 11.1.2-1-11.1.2-3 can be one of a set of components, including a set of two optical modules as part of a single HMD 11.1.2-400 such that the optical module 11.1.2-428 shown in FIG. 11.1.2-4 is one of two optical modules with the second optical module slidably engaged/coupled with a guide rod extending in an opposite direction to that of the guide rod 11.1.2-428 shown from a mounting bracket. Likewise, the display assembly 11.1.2-438 and the display screen 11.1.2-440 can be one of a set of two display assemblies and display screens within the single HMD 11.1.2-400.

In at least one example, the optical module 11.1.2-436 can include a micro-OLED display coupled to a heat sink via and adhesive, such as a pressure sensitive adhesive or other adhesive. In at least one example, the optical module 11.1.2-436 can include a silicone backplane. The heat sink can include magnesium and have no fins. In one example, a drop or more of structural adhesive can be applied during assembly/manufacturing to the center of the back of the display of the optical module 11.1.2-436 to lock the display in with the heat sink. The adhesive can include epoxy.

Any of the features, components, and/or parts, including the arrangements and configurations thereof shown in FIG. 11.1.2-4 can be included, either alone or in any combination, in any of the other examples of devices, features, components, and parts shown in FIGS. 11.1.2-1-11.1.2-3 and 11.1.2-5 and described herein. Likewise, any of the features, components, and/or parts, including the arrangements and configurations thereof shown and described with reference to FIGS. 11.1.2-1-11.1.2-3 and 11.1.2-5 can be included, either alone or in any combination, in the example of the devices, features, components, and parts shown in FIG. 11.1.2-4.

FIG. 11.1.2-5 illustrates an example of an HMD 11.1.2-500 including a first, outer structural frame 11.1.2-502 defining an internal volume 11.1.2-542. A front cover 11.1.2-541 and a rear cover 11.1.2-543 disposed opposite the front cover 11.1.2-541 can also define the internal volume 11.1.2-542. In at least one example, the HMD 11.1.2-500 can also include a second, inner structural frame 11.1.2-504 disposed in the internal volume 11.1.2-542 and coupled to the outer frame 11.1.2-502. The inner frame 11.1.2-502 can define a first side 11.1.2-503 and a second side 11.1.2-505 opposite the first side 11.1.2-503.

In at least one example, the HMD 11.1.2-500 can include a first mounting bracket 11.1.2-508 coupled to the first side 11.1.2-503 of the inner frame 11.1.2-504 and a second mounting bracket 11.1.2-520 coupled to the second side 11.1.2-505 of the inner frame 11.1.2-504. In at least one example, the first mounting bracket 11.1.2-508 can be similar to the first mounting brackets 11.1.2-108, 11.1.2-208 shown in FIGS. 11.1.2-1 and 11.1.2-2 and described above. In at least one example, the second mounting bracket 11.1.2-520 can be similar to the other second mounting bracket 11.1.2-320 described above and shown in FIG. 11.1.2-3.

In at least one example, one or more sensors 11.1.2-510*a*, 11.1.2-510*b* can be mounted or coupled to a cantilever arm or middle portion of the first mounting bracket 11.1.2-508. In at least one example, an optical module 11.1.2-536 can be slidably engaged/coupled to the second mounting bracket 11.1.2-520. The optical module 11.1.2-536 can include a display assembly including a display screen 11.1.2-540 and one or more sensors 11.1.2-544*a*, 11.1.2-544*b*. In at least one example, at least one of the sensors 11.1.2-544*a-b* can include a visual sensor such as a camera. In at least one example, the first and second sensors 11.1.2-544*a-b* are both cameras.

As oriented in the view of FIG. 11.1.2-5, the sensors 11.1.2-510*a-b* coupled to the first mounting bracket 11.1.2-508 can be pointed in a forward direction and the sensors 11.1.2-544*a-b* and/or display screen 11.1.2-540 of the optical module 11.1.2-536 can be pointed in a rearward direction opposite the forward direction. In at least one example, the sensors 11.1.2-510*a-b* coupled to the first mounting bracket 11.1.2-508 can include image capturing sensors or other sensors configured to object recognition and detection in front of or around the HMD 11.1.2-500. The detected, sensed, or captured images and objects can be displayed by the display screen 11.1.2-536, which can be configured to project the images and light rearward toward a user's eyes when the user dons the HMD 11.1.2-500.

In at least one example, the HMD 11.1.2-500 can also include a controller electronically coupled to the sensors 11.1.2-510*a-b* and optical module 11.1.2-536, including the display screen 11.1.2-540 and sensors 11.1.2-544*a-b*. The controller can be configured to capture an image via one or more of the sensors 11.1.2-510*a-b* coupled to the first mounting bracket 11.1.2-508 and display the image on the display screen 11.1.2-540 of the optical module 11.1.2-536 coupled to the second mounting bracket 11.1.2-520. In order to project an accurate representation of the captured objects in real space to the user on the display screen 11.1.2-540, the relative position, distance, angles, and orientation between the sensors 11.1.2-510*a-b* and the display screen 11.1.2-540 can be maintained even during drop events or when the outer/inner frames 11.1.2-502, 11.1.2-504 are deformed or bumped. The first mounting bracket 11.1.2-508 can be cantilevered and centrally coupled to the inner frame 11.1.2-504 at the first side 11.1.2-503 thereof as noted above and the second mounting bracket 11.1.2-520 can be cantilevered and centrally coupled to the inner frame 11.1.2-504 at the second side 11.1.2-505 thereof. In this way, the positions, orientations, angles, and distances between sensors 11.1.2-510*a-b* of the first mounting bracket 11.1.2-508 and the sensors 11.1.2-544*a-b* and display screen 11.1.2-540 of the second mounting bracket 11.1.2-520 can be maintained.

Any of the features, components, and/or parts, including the arrangements and configurations thereof shown in FIG. 11.1.2-5 can be included, either alone or in any combination, in any of the other examples of devices, features, components, and parts shown in FIGS. 11.1.2-1-11.1.2-4 and described herein. Likewise, any of the features, components, and/or parts, including the arrangements and configurations thereof shown and described with reference to FIGS. 11.1.2-1-11.1.2-4 can be included, either alone or in any combination, in the example of the devices, features, components, and parts shown in FIG. 11.1.2-5.

11.1.3: Upper Guide Rod System

FIG. 11.1.3-1 illustrates a rear perspective view of a display assembly 11.1.3-102 of an HMD 11.1.3-100 with one or more components removed, including a curtain assembly, in order to illustrate various internal components of the HMD 11.1.3-100. FIG. 11.1.3-1 illustrates the display assembly 11.1.3-102, which can include a first display module 11.1.3-104*a* and a second display module 11.1.3-104*b*. The first display module 11.1.3-104*a* can be slidably engaged/coupled with a first adjustment mechanism 11.1.3-106*a* and the second optical module 11.1.3-104*b* can be slidably engaged/coupled with a second adjustment mechanism 11.1.3-106*b*. The first and second adjustment mechanisms 11.1.3-106*a-b* can include first and second respective guide-rods 11.1.3-108*a-b* and motors 11.1.3-110*a-b*. The first and second guide-rods can be similar such that the description of one applies to the other, with the first guide-rod 11.1.3-108*a* extending a first direction away from a bracket 11.1.3-112 and the second guide-rod 11.1.3-108*b* extending a second direction away from the bracket 11.1.3-112 opposite the first direction.

Likewise, the first and second motors 11.1.3-110*a-b* can be similar such that the description of one applies to the other, with the first motor 11.1.3-110*a* mechanically engaging the first optical module 11.1.3-104*a* to adjust the position thereof via the first guide-rod 11.1.3-108*a* and the second motor 11.1.3-110*b* mechanically engaging the second optical module 11.1.3-104*b* to adjust the position thereof via the second guide-rod 11.1.3-108*b*. In at least one example, the HMD 11.1.3-100 also includes a depressible and/or rotatable button 11.1.3-114 electrically coupled to the first and second motors 11.1.3-110*a-b*. The button 11.1.3-114 can electrically communicate with the first and second motors 11.1.3-110*a-b* via a processor or other circuitry components to cause the first and second motors 11.1.3-110*a-b* to activate and cause the first and second optical modules 11.1.3-104*a-b*, respectively, to change position relative to one another.

In at least one example, the first and second optical modules 11.1.3-104*a-b* can include respective display screens configured to project light toward the user's eyes when donning the HMD 11.1.3-100. In at least one example, the user can manipulate (i.e., depress and/or rotate) the button 11.1.3-114 to activate a positional adjustment of the optical modules 11.1.3-104*a-b* to match the inter-pupillary distance of the user's eyes. The optical modules 11.1.3-104*a-b* can also include one or more cameras or other sensors/sensor systems for imaging and measuring the IPD of the user such that the optical modules 11.1.3-104*a-b* can be adjusted to match the IPD.

The first and second optical modules 11.1.3-104*a-b* can be mechanically and slidably coupled to the first and second guide-rods 11.1.3-108*a-b*, respectively. In at least one example, the first optical module 11.1.3-104*a* can include an aperture, through-hole, or channel engaged with the guide-rod 11.1.3-108*a* to hold the optical module 11.1.3-104*a* in position axially with the guide-rod 11.1.3-108*a* as the optical module 11.1.3-104*a* slides along the guide-rod 11.1.3-108*a* during IPD adjustments. The same can be included in the second optical module 11.1.3-104*b*. In some examples, the optical modules 11.1.3-104*a-b* can include a guide-rod slidably engaged with respective channels of the adjustment mechanism 11.1.3-102.

Any of the features, components, and/or parts, including the arrangements and configurations thereof shown in FIG. 11.1.3-1 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.3-1.

FIG. 11.1.3-2 illustrates a close up view of an example of an HMD 11.1.3-200 and an adjustment mechanism 11.1.3-202 similar to those shown in FIG. 11.1.3-1 but with the optical module removed to more clearly illustrate the upper guide-rod 11.1.3-208. The guide rod 11.1.3-208 can extend at or near or above a top portion or side of the optical module and guide the optical module back and forth axially along the guide-rod 11.1.3-208 during IPD adjustments described above. In at least one example, the guide-rod 11.1.3-208 extends from a central bracket 11.1.3-212 secured to a frame or chassis 11.1.3-216 of the HMD 11.1.3-200. In one example, the guide-rod 11.1.3-208 is cantilevered such that a first, proximal end 11.1.3-220 of the guide-rod 11.1.3-208 is secured to the bracket 11.1.3-212 and a second, distal end 11.1.3-222 opposite the first end 11.1.3-220 is free of affixation to any other structure. In this way, the guide-rod 11.1.3-208 can be cantilevered away from the bracket 11.1.3-212.

In at least one example, the adjustment mechanism 11.1.3-202 also includes a stop 11.1.3-218 positioned at or near the distal end 11.1.3-222 of the guide-rod 11.1.3-208. In at least one example, the stop 11.1.3-218 can include a cavity or channel in which the distal end of the guide-rod 11.1.3-208 extends. However, in at least one example, no contact is made between the guide-rod 11.1.3-208 and the stop 11.1.3-218 such that the guide-rod 11.1.3-208 is cantilevered as noted above. The stop 11.1.3-218 can be configured to prevent the optical module (not shown) from travelling too far distally along the guide-rod 11.1.3-208 and beyond the distal end 11.1.3-222 thereof during IPD adjustment. The stop 11.1.3-218 can also serve to prevent too much deformation of the cantilevered guide-rod 11.1.3-208 during unintended drop events or other forces that would cause a deformation of the guide-rod 11.1.3-208 and a movement of the distal end 11.1.3-222 of the guide-rod 11.1.3-208. In at least one example, the distal end 11.1.3-222 of the guide-rod 11.1.3-208 extends into or is a least partially surrounded by the stop 11.1.3-218 without making contact during normal use of the HMD 11.1.3-200. If unintentionally moved or deformed elastically, the distal end 11.1.3-222 or portion of the guide-rod 11.1.3-208 can make contact with the stop 11.1.3-218 such that the stop 11.1.3-218 prevents too much deformation of the guide-rod 11.1.3-208, thus preventing plastic deformation and damage to the guide-rod 11.1.3-208.

Any of the features, components, and/or parts, including the arrangements and configurations thereof shown in FIG. 11.1.3-1-11.1.3-2 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIGS. 11.1.3-1-11.1.3-2.

FIG. 11.1.3-3 shows another view of an example of an adjustment system 11.1.3-302 similar to those shown in FIGS. 11.1.3-1 and 11.1.3-2 but with a first guide-rod **11.1.3-308*a* and a second guide-rod 11.1.3-308*b* shown extending in opposite directions from a central bracket 11.1.3-312. In the illustrated example, the adjustment mechanism 11.1.3-302 also includes a second stop 11.1.3-318*a* associated with the distal end of the first guide-rod 11.1.3-308*a*, which can be similar in form and function to the stop 11.1.3-218 described above with reference to FIG. 11.1.3-2**.

Any of the features, components, and/or parts, including the arrangements and configurations thereof shown in FIG. 11.1.3-3 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIGS. 11.1.3-3. 11.1.3.1: MOTORS FIG. 1 illustrates a rear perspective view of a display assembly 11.1.3.1-102 of an HMD 11.1.3.1-100 with one or more components removed, including a curtain assembly, in order to illustrate various internal components of the HMD 11.1.3.1-100. FIG. 11.1.3.1-1 illustrates the display assembly 11.1.3.1-102, which can include a first display module **11.1.3.1-104*a* and a second display module 11.1.3.1-104*b*. The first display module 11.1.3.1-104*a* can be slidably engaged/coupled with a first adjustment mechanism 11.1.3.1-106*a* and the second optical module 11.1.3.1-104*b* can be slidably engaged/coupled with a second adjustment mechanism 11.1.3.1-106*b*. The first and second adjustment mechanisms 11.1.3.1-106*a-b* can include first and second respective guide-rods 11.1.3.1-108*a-b* and motors 11.1.3.1-110*a-b*. The first and second guide-rods can be similar such that the description of one applies to the other, with the first guide-rod 11.1.3.1-108*a* extending a first direction away from a bracket 11.1.3.1-112 and the second guide-rod 11.1.3.1-108*b* extending a second direction away from the bracket 11.1.3.1-112** opposite the first direction.

Likewise, the first and second motors **11.1.3.1-110*a-b* can be similar such that the description of one applies to the other, with the first motor 11.1.3.1-110*a* mechanically engaging the first optical module 11.1.3.1-104*a* to adjust the position thereof via the first guide-rod 11.1.3.1-108*a* and the second motor 11.1.3.1-110*b* mechanically engaging the second optical module 11.1.3.1-104*b* to adjust the position thereof via the second guide-rod 11.1.3.1-108*b*. In at least one example, the HMD 11.1.3.1-100 also includes a depressible and/or rotatable button 11.1.3.1-114 electrically coupled to the first and second motors 11.1.3.1-110*a-b*. The button 11.1.3.1-114 can electrically communicate with the first and second motors 11.1.3.1-110*a-b* via a processor or other circuitry components to cause the first and second motors 11.1.3.1-110*a-b* to activate and cause the first and second optical modules 11.1.3.1-104*a-b***, respectively, to change position relative to one another.

In at least one example, the motors **11.1.3.1-110*a-b* are configured to operate the optical modules 11.1.3.1-104*a-b* inward and outward relative to the bracket 11.1.3.1-112 and thus relative to the user's nose. As such, in at least one example, the motors 11.1.3.1-110*a-b* operate under MS1 safety standards and the button 11.1.3.1-114 operating/instigating the motors 11.1.3.1-110*a-b* includes a "dead-man's button" so the motors 11.1.3.1-110*a-b* are only operable when the button 11.1.3.1-110*a-b*** is manipulated, e.g. depressed and/or rotated.

Any of the features, components, and/or parts, including the arrangements and configurations thereof shown in FIG. 11.1.3.1-1 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.3.1-1.

FIG. 11.1.3.1-2 illustrates a perspective view of an example of a motor 11.1.3.1-210 similar to those **11.1.3.1-110*a-b* shown in FIG. 11.1.3.1-1. FIG. 11.1.3.1-3 illustrates a cross-sectional view thereof to illustrate internal components of the motor 11.1.3.1-210. In at least one example, the motor 11.1.3.1-210 can include a gear box and breakaway, spring-loaded clutches in a nut (e.g., "split nut"). The split nut can be configured to prevent forces in a drop event from transferring through the motor 11.1.3.1-210. In at least one example, during use, the motor 11.1.3.1-210** can be operated in resonant valleys to reduce noise.

In at least one example, the motor can include one or more dust covers (not shown) surrounding the housing to prevent dust and other debris from contaminating the internal volume of the motor 11.1.3.1-210 where the lead screw and other components are disposed. In at least one example, the dust covers can include tape wraps. In at least one example, the motor 11.1.3.1-11.1.3.1-210 can include a split screw/nut, as noted above, to reduce noise and form a breakaway component to release the optical module driven by the motor 11.1.3.1-210 such that forces transferred from the motor 11.1.3.1-210 to the optical module are minimized during high impact scenarios such as a drop event.

In at least one example, the motor 11.1.3.1-210 can include a gear reduction mechanism or assembly, such as a planetary gear reduction assembly. In at least one example, the motor 11.1.3.1-210 can include a clutch to tune the force to a certain level to release down length. In at least one example, the motor 11.1.3.1-210 can include pre-loaded ball bearings to reduce play in the motor 11.1.3.1-210.

Any of the features, components, and/or parts, including the arrangements and configurations thereof shown in FIGS. 11.1.3.1-2 and 11.1.3.1-3 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIGS. 11.1.3.1-2 and 11.1.3.1-3.

11.1.3.1.1: Electronic Devices with Optical Module Positioning Systems

A head-mounted device may have optical modules that present images to a user's eyes. Each optical module may have a lens barrel with a display and a lens that presents an image from the display to a corresponding eye box.

To accommodate users with different interpupillary distances, the optical modules may be slidably coupled to guide members such as guide rods. Actuators may slide the optical modules towards or away from each other along the guide rods, thereby accommodating different interpupillary distances.

The guide rods may be formed from fiber-reinforced composite tubes with one or more end caps that are fastened to a frame in the head-mounted device. A common end cap may, if desired, be used to join a pair of guide rods. End caps may be formed as separate pieces that are attached to the ends of the fiber composite tubes or other guide rod structures and/or may be integral portions of the fiber composite tubes or other guide rod structures.

The guide rods may include a left guide rod or left pair of guide rods slidably engaged with a left optical module and a right guide rod or right pair of guide rods slidably engaged with a right optical module. Left and right guide rods may be angled at a non-zero angle with respect to each other to help guide the optical modules parallel to the surface of a user's face.

The tubes of the guide rods may be partly or completely filled with cores to add strength. Low-friction coatings such as metal coatings may be applied to the tubes and on corresponding inner surfaces of the optical module structures that receive the tubes.

An electronic device such as a head-mounted device may have a front face that faces away from a user's head and may have an opposing rear face that faces the user's head. Optical modules at the rear face may be used to provide images to a user's eyes. The positions of the optical modules may be adjusted to accommodate different user interpupillary distances. The head-mounted device may have actuators and optical module guide structures to allow the optical module positions to be adjusted.

A top view of an illustrative head-mounted device is shown in FIG. 11.1.3.1.1-1. As shown in FIG. 11.1.3.1.1-1, head-mounted devices such as electronic device 11.1.3.1.1-10 may have head-mounted support structures such as housing 11.1.3.1.1-12. Housing 11.1.3.1.1-12 may include portions (e.g., head-mounted support structures 11.1.3.1.1-12T) to allow device 11.1.3.1.1-10 to be worn on a user's head. Support structures 11.1.3.1.1-12T may be formed from fabric, polymer, metal, and/or other material. Support structures 11.1.3.1.1-12T may form a strap or other head-mounted support structures to help support device 11.1.3.1.1-10 on a user's head. A main support structure (e.g., main housing portion 11.1.3.1.1-12M) of housing 11.1.3.1.1-12 may support electronic components such as displays 11.1.3.1.1-14.

Main housing portion 11.1.3.1.1-12M may include housing structures formed from metal, polymer, glass, ceramic, and/or other material. For example, housing portion 11.1.3.1.1-12M may have housing walls on front face F and housing walls on adjacent top, bottom, left, and right side faces that are formed from rigid polymer or other rigid support structures and these rigid walls may optionally be covered with electrical components, fabric, leather, or other soft materials, etc. Housing portion 11.1.3.1.1-12M may also have internal support structures such as a frame and/or structures that perform multiple functions such as controlling airflow while providing structural support. The walls of housing portion 11.1.3.1.1-12M may enclose internal components 11.1.3.1.1-38 in interior region 11.1.3.1.1-34 of device 11.1.3.1.1-10 and may separate interior region 11.1.3.1.1-34 from the environment surrounding device 11.1.3.1.1-10 (exterior region 11.1.3.1.1-36). Internal components 11.1.3.1.1-38 may include integrated circuits, actuators, batteries, sensors, and/or other circuits and structures for device 11.1.3.1.1-10. Housing 11.1.3.1.1-12 may be configured to be worn on a head of a user and may form glasses, a hat, a helmet, goggles, and/or other head-mounted device. Configurations in which housing 11.1.3.1.1-12 forms goggles may sometimes be described herein as an example.

Front face F of housing 11.1.3.1.1-12 may face outwardly away from a user's head and face. Opposing rear face R of housing 11.1.3.1.1-12 may face the user. Portions of housing 11.1.3.1.1-12 (e.g., portions of main housing 11.1.3.1.1-12M) on rear face R may form a cover such as cover 11.1.3.1.1-12C (sometimes referred to as a curtain). The presence of cover 11.1.3.1.1-12C on rear face R may help hide internal housing structures, internal components 11.1.3.1.1-38, and other structures in interior region 11.1.3.1.1-34 from view by a user.

Device 11.1.3.1.1-10 may have left and right optical modules 11.1.3.1.1-40. Optical modules 11.1.3.1.1-40 support electrical and optical components such as light-emitting components and lenses and may therefore sometimes be referred to as optical assemblies, optical systems, optical component support structures, lens and display support structures, electrical component support structures, or housing structures. Each optical module may include a respective display 11.1.3.1.1-14, lens 11.1.3.1.1-30, and support structure such as lens barrel 11.1.3.1.1-32. Lens barrel 11.1.3.1.1-32, which may sometimes be referred to as lens support structures, optical component support structures, optical module support structures, or optical module portions, may include hollow cylindrical structures with open ends or other supporting structures to house displays 11.1.3.1.1-14 and lenses 11.1.3.1.1-30. Lens barrels 11.1.3.1.1-32 may, for example, include a left lens barrel that supports a left display 11.1.3.1.1-14 and left lens 11.1.3.1.1-30 and a right lens barrel that supports a right display 11.1.3.1.1-14 and right lens 11.1.3.1.1-30.

Displays 11.1.3.1.1-14 may include arrays of pixels or other display devices to produce images. Displays 11.1.3.1.1-14 may, for example, include organic light-emitting diode pixels formed on substrates with thin-film circuitry and/or formed on semiconductor substrates, pixels formed from crystalline semiconductor dies, liquid crystal display pixels, scanning display devices, and/or other display devices for producing images.

Lenses 11.1.3.1.1-30 may include one or more lens elements for providing image light from displays 11.1.3.1.1-14 to respective eyes boxes 11.1.3.1.1-13. Lenses may be implemented using refractive glass lens elements, using mirror lens structures (catadioptric lenses), using Fresnel lenses, using holographic lenses, and/or other lens systems.

When a user's eyes are located in eye boxes 11.1.3.1.1-13, displays (display panels) 11.1.3.1.1-14 operate together to form a display for device 11.1.3.1.1-10 (e.g., the images provided by respective left and right optical modules 11.1.3.1.1-40 may be viewed by the user's eyes in eye boxes 11.1.3.1.1-13 so that a stereoscopic image is created for the user). The left image from the left optical module fuses with the right image from a right optical module while the display is viewed by the user.

It may be desirable to monitor the user's eyes while the user's eyes are located in eye boxes 11.1.3.1.1-13. For example, it may be desirable to use a camera to capture images of the user's irises (or other portions of the user's eyes) for user authentication. It may also be desirable to monitor the direction of the user's gaze. Gaze tracking information may be used as a form of user input and/or may be used to determine where, within an image, image content resolution should be locally enhanced in a foveated imaging system. To ensure that device 11.1.3.1.1-10 can capture satisfactory eye images while a user's eyes are located in eye boxes 11.1.3.1.1-13, each optical module 11.1.3.1.1-40 may be provided with a camera such as camera 11.1.3.1.1-42 and one or more light sources such as light-emitting diodes 11.1.3.1.1-44 or other light-emitting devices such as lasers, lamps, etc. Cameras 11.1.3.1.1-42 and light-emitting diodes 11.1.3.1.1-44 may operate at any suitable wavelengths (visible, infrared, and/or ultraviolet). As an example, diodes 11.1.3.1.1-44 may emit infrared light that is invisible (or nearly invisible) to the user. This allows eye monitoring operations to be performed continuously without interfering with the user's ability to view images on displays 11.1.3.1.1-14.

Not all users have the same interpupillary distance IPD. To provide device 11.1.3.1.1-10 with the ability to adjust the interpupillary spacing between modules 11.1.3.1.1-40 along lateral dimension X and thereby adjust the spacing IPD between eye boxes 11.1.3.1.1-13 to accommodate different user interpupillary distances, device 11.1.3.1.1-10 may be provided with optical module positioning systems in housing 11.1.3.1.1-12. The positioning systems may have guide members and actuators 11.1.3.1.1-43 that are used to position optical modules 11.1.3.1.1-40 with respect to each other.

Actuators 11.1.3.1.1-43 can be manually controlled and/or computer-controlled actuators (e.g., computer-controlled motors) for moving lens barrels 11.1.3.1.1-32 relative to each other. Information on the locations of the user's eyes may be gathered using, for example, cameras 11.1.3.1.1-42. The locations of eye boxes 11.1.3.1.1-13 can then be adjusted accordingly.

As shown in the rear view of device 11.1.3.1.1-10 of FIG. 11.1.3.1.1-2, cover 11.1.3.1.1-12C may cover rear face R while leaving lenses 11.1.3.1.1-30 of optical modules 11.1.3.1.1-40 uncovered (e.g., cover 11.1.3.1.1-12C may have openings that are aligned with and receive modules 11.1.3.1.1-40). As modules 11.1.3.1.1-40 are moved relative to each other along dimension X to accommodate different interpupillary distances for different users, modules 11.1.3.1.1-40 move relative to fixed housing structures such as the walls of main portion 11.1.3.1.1-12M and move relative to each other.

A schematic diagram of an illustrative electronic device such as a head-mounted device or other wearable device is shown in FIG. 11.1.3.1.1-3. Device 11.1.3.1.1-10 of FIG. 11.1.3.1.1-3 may be operated as a stand-alone device and/or the resources of device 11.1.3.1.1-10 may be used to communicate with external electronic equipment. As an example, communications circuitry in device 11.1.3.1.1-10 may be used to transmit user input information, sensor information, and/or other information to external electronic devices (e.g., wirelessly or via wired connections). Each of these external devices may include components of the type shown by device 11.1.3.1.1-10 of FIG. 11.1.3.1.1-3.

As shown in FIG. 11.1.3.1.1-3, a head-mounted device such as device 11.1.3.1.1-10 may include control circuitry 11.1.3.1.1-20. Control circuitry 11.1.3.1.1-20 may include storage and processing circuitry for supporting the operation of device 11.1.3.1.1-10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 11.1.3.1.1-20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 11.1.3.1.1-20 may use display(s) 11.1.3.1.1-14 and other output devices in providing a user with visual output and other output.

To support communications between device 11.1.3.1.1-10 and external equipment, control circuitry 11.1.3.1.1-20 may communicate using communications circuitry 11.1.3.1.1-22. Circuitry 11.1.3.1.1-22 may include antennas, radio-frequency transceiver circuitry, and other wireless communications circuitry and/or wired communications circuitry. Circuitry 11.1.3.1.1-22, which may sometimes be referred to as control circuitry and/or control and communications circuitry, may support bidirectional wireless communications between device 11.1.3.1.1-10 and external equipment (e.g., a companion device such as a computer, cellular telephone, or other electronic device, an accessory such as a point device, computer stylus, or other input device, speakers or other output devices, etc.) over a wireless link. For example, circuitry 11.1.3.1.1-22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link. Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 11.1.3.1.1-10 may, if desired, include power circuits for transmitting and/or receiving wired and/or wireless power and may include batteries or other energy storage devices. For example, device 11.1.3.1.1-10 may include a coil and rectifier to receive wireless power that is provided to circuitry in device 11.1.3.1.1-10.

Device 11.1.3.1.1-10 may include input-output devices such as devices 11.1.3.1.1-24. Input-output devices 11.1.3.1.1-24 may be used in gathering user input, in gathering information on the environment surrounding the user, and/or in providing a user with output. Devices 11.1.3.1.1-24 may include one or more displays such as display(s) 11.1.3.1.1-14. Display(s) 11.1.3.1.1-14 may include one or more display devices such as organic light-emitting diode display panels (panels with organic light-emitting diode pixels formed on polymer substrates or silicon substrates that contain pixel control circuitry), liquid crystal display panels, microelectromechanical systems displays (e.g., two-dimensional mirror arrays or scanning mirror display devices), display panels having pixel arrays formed from crystalline semiconductor light-emitting diode dies (sometimes referred to as microLEDs), and/or other display devices.

Sensors 11.1.3.1.1-16 in input-output devices 11.1.3.1.1-24 may include force sensors (e.g., strain gauges, capacitive force sensors, resistive force sensors, etc.), audio sensors such as microphones, touch and/or proximity sensors such as capacitive sensors such as a touch sensor that forms a button, trackpad, or other input device), and other sensors. If desired, sensors 11.1.3.1.1-16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, iris scanning sensors, retinal scanning sensors, and other biometric sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors such as blood oxygen sensors, heart rate sensors, blood flow sensors, and/or other health sensors, radio-frequency sensors, depth sensors (e.g., structured light sensors and/or depth sensors based on stereo imaging devices that capture three-dimensional images), optical sensors such as self-mixing sensors and light detection and ranging (LIDAR) sensors that gather time-of-flight measurements, humidity sensors, moisture sensors, gaze tracking sensors, electromyography sensors to sense muscle activation, facial sensors, and/or other sensors. In some arrangements, device 11.1.3.1.1-10 may use sensors 11.1.3.1.1-16 and/or other input-output devices to gather user input. For example, buttons may be used to gather button press input, touch sensors overlapping displays can be used for gathering user touch screen input, touch pads may be used in gathering touch input, microphones may be used for gathering audio input (e.g., voice commands), accelerometers may be used in monitoring when a finger contacts an input surface and may therefore be used to gather finger press input, etc.

If desired, electronic device 11.1.3.1.1-10 may include additional components (see, e.g., other devices 11.1.3.1.1-18 in input-output devices 11.1.3.1.1-24). The additional components may include haptic output devices, actuators for moving movable housing structures, audio output devices such as speakers, light-emitting diodes for status indicators, light sources such as light-emitting diodes that illuminate portions of a housing and/or display structure, other optical output devices, and/or other circuitry for gathering input and/or providing output. Device 11.1.3.1.1-10 may also include a battery or other energy storage device, connector ports for supporting wired communication with ancillary equipment and for receiving wired power, and other circuitry.

A rear view of device 11.1.3.1.1-10 is shown in FIG. 11.1.3.1.1-4. In the example of FIG. 11.1.3.1.1-4, cover 11.1.3.1.1-12C has been removed to expose internal housing structures such as frame 11.1.3.1.1-12FC. Frame 11.1.3.1.1-12FC may be formed from polymer support structures, support structurers formed from carbon-fiber composite and/or other fiber-composite materials, metal support structures, glass housing structures, and/or other support structures for main housing portion 11.1.3.1.1-12M. Portions of frame 11.1.3.1.1-12FC that run horizontally (along the upper and lower edges of device 11.1.3.1.1-10 parallel to the X axis of FIG. 11.1.3.1.1-4) may be joined by vertically extending edge portions of frame 11.1.3.1.1-12FC (see, e.g., frame edge portions 11.1.3.1.1-12FC-E) along the left and right sides of device 11.1.3.1.1-10 and may be joined in the center of device 11.1.3.1.1-10 by a vertically extending nose bridge portion (see, e.g., frame center portion 11.1.3.1.1-12FC-M).

Optical modules 11.1.3.1.1-40 may be guided using optical module guide structures such as optical module guide rods 11.1.3.1.1-50. Guide rods 11.1.3.1.1-50 may extend horizontally across device 11.1.3.1.1-10 (e.g., parallel to the X axis of FIG. 11.1.3.1.1-4). In the example of FIG. 11.1.3.1.1-4, guide rods 11.1.3.1.1-50 include an upper set of left and right guide rods at upper position 11.1.3.1.1-52 and a lower set of left and right guide rods at lower position 11.1.3.1.1-54. There may be more guide rods or fewer guide rods in device 11.1.3.1.1-10, if desired. Fasteners 11.1.3.1.1-56 (e.g., screws) or other attachment structures (e.g., adhesive, welds, etc.) may be used to attach guide rods 11.1.3.1.1-50 to frame 11.1.3.1.1-12FC. The fasteners may, as an example, attach the ends of rods 11.1.3.1.1-50 that are located on the left of device 11.1.3.1.1-10 between left frame edge portion 11.1.3.1.1-12FC-E and frame center portion 11.1.3.1.1-12FC-M and may attach the ends of rods 11.1.3.1.1-50 that are located on the right of device 11.1.3.1.1-10 between right frame edge portion 11.1.3.1.1-12FC-E and frame center portion 11.1.3.1.1-12FC-M. Guide rods 11.1.3.1.1-50 may also be attached to the frame or to an intermediary subframe. Guide rods may be fixed to a frame or subframe at both ends (as illustrated) or each guide rod may only be attached to the frame at a single end. For example, each guide rod may only be fixed to the frame at a central portion of the frame.

Each optical module may have portions that slidably engage guide rods 11.1.3.1.1-50. For example, each optical module 11.1.3.1.1-40 may have an upper guide rod engagement portion (sometimes referred to as a hanger or hanger portion) such as optical module portion 11.1.3.1.1-40H that receives and engages a respective guide rod 11.1.3.1.1-50 at upper guide rod position 11.1.3.1.1-52. Each optical module 11.1.3.1.1-40 may also have a lower guide rod engagement portion (sometimes referred to as a toe or toe portion) such as optical module portion 11.1.3.1.1-40T that receives and engages a respective guide rod 11.1.3.1.1-50 at lower guide rod position 11.1.3.1.1-54. Portion 11.1.3.1.1-40T may be an integral portion of lens barrel 11.1.3.1.1-32 or other support structure for optical module 11.1.3.1.1-40 or may be formed from one or more separate structures attached to lens barrel 11.1.3.1.1-32. Portion 11.1.3.1.1-40H may be an integral portion of lens barrel 11.1.3.1.1-32 or may, as shown in FIG. 11.1.3.1.1-4, be formed from one or more separate optical module structures that are attached to lens barrel 11.1.3.1.1-32 by fasteners 11.1.3.1.1-60 (e.g., screws). If desired, guide rods 11.1.3.1.1-50 may be provided with structures that serve as stops to prevent over-travel of optical modules 11.1.3.1.1-40. As an example, each of guide rods 11.1.3.1.1-50 may have one or more stop structures such as plug 11.1.3.1.1-57. During sliding movement of optical module 11.1.3.1.1-40, excessive movement will be prevented when portion 11.1.3.1.1-40H contacts plug 11.1.3.1.1-57 and is thereby stopped by plug 11.1.3.1.1-57. Optical module sliding motion stop structures such as plug 11.1.3.1.1-57 may be attached to guide rods 11.1.3.1.1-50 by screwing, by welding, using adhesive, or using other attachment structures. Plug 11.1.3.1.1-57 may be a separate structure from rods 11.1.3.1.1-50 or such structures may be formed as part of guide rods 11.1.3.1.1-50 (e.g., a metal guide rod or other guide rod may be machined or otherwise formed into a shape that includes an integral sliding motion stop structure).

Guide rods 11.1.3.1.1-50 may have circular cross-sectional shapes (when viewed in the Y-Z plane of FIG. 11.1.3.1.1-4) or may have other suitable cross-sectional shape. The portions of optical module 11.1.3.1.1-40 that receive guide rods 11.1.3.1.1-50 may have corresponding mating shapes (e.g., full or partial circular openings with inner diameters corresponding to the outer diameters of guide rods 11.1.3.1.1-50). To prevent sticking, the inner surfaces of the optical module guide rod openings and/or the outer surfaces of guide rods 11.1.3.1.1-50 may be provided with low stick surfaces (e.g., using low-stick coatings, lubricant such as grease, etc.).

Actuators 11.1.3.1.1-43 may have associated threaded members such as threaded actuator rods 11.1.3.1.1-62. Optical module portions 11.1.3.1.1-40H may have corresponding threaded nuts 11.1.3.1.1-64 or other threaded portions that receive threaded actuator rods 11.1.3.1.1-62. During operation, actuators 11.1.3.1.1-43 may rotate threaded actuator rods 11.1.3.1.1-62 about actuator rod rotational axes 11.1.3.1.1-66, thereby moving optical modules 11.1.3.1.1-40 outwardly (away from each other) in directions 11.1.3.1.1-68 or inwardly (towards each other) in directions 11.1.3.1.1-70 as desired to adjust the positions of optical modules 11.1.3.1.1-40 relative to each other (e.g., to adjust the lens-center-to-lens-center spacing of the left and right lenses in device 11.1.3.1.1-10 to accommodate different interpupillary distances for different users).

FIG. 11.1.3.1.1-5 is an end view of an illustrative portion of optical module 11.1.3.1.1-40 such as portion 11.1.3.1.1-40H of FIG. 11.1.3.1.1-4. As shown in FIG. 11.1.3.1.1-5, optical module portion 11.1.3.1.1-40H may have a first opening such as opening 11.1.3.1.1-72 (e.g., a threaded opening in nut 11.1.3.1.1-64 or other portion of optical module portion 11.1.3.1.1-40H). Opening 72 may receive threaded rod 11.1.3.1.1-62.

Optical module portion 11.1.3.1.1-40H may also have a second opening such as opening 11.1.3.1.1-76. Opening 11.1.3.1.1-76 may receive a guide rod (e.g., a guide rod located at upper position 11.1.3.1.1-52). If desired, optical module portion 11.1.3.1.1-40T may have an opening such as opening 11.1.3.1.1-76 to receive a guide rod (e.g., a guide rod located at lower position 11.1.3.1.1-54). As shown in FIG. 11.1.3.1.1-5, the inner surfaces of opening 11.1.3.1.1-76 may have one or more layers of material that form low-friction coating 11.1.3.1.1-78. In an illustrative configuration, optical module 11.1.3.1.1-40 (e.g., optical module portion 11.1.3.1.1-40H, lens barrel 11.1.3.1.1-32, and/or optical module portion 11.1.3.1.1-40T) are formed from metal (e.g., aluminum) and coating 11.1.3.1.1-78 is formed from one or more deposited (e.g., electrodeposited) metal layers (e.g., nickel, etc.). Configurations in which modules 11.1.3.1.1-40 are formed from polymer coated with metal and/or in which modules 11.1.3.1.1-40 are formed from other materials may be used, if desired.

Guide rods 11.1.3.1.1-52 may be formed from elongated guide member structures such as tubes. The tubes may be cylindrical tubes or may be tubes of other suitable shapes (e.g., tubes with rectangular cross-sectional shapes, etc.). Guide rods 11.1.3.1.1-52 may be formed from tubes that are completed hollow, that are partly hollow and partly filled with cores, or tubes that are completely filled with filler material (e.g., rods that are formed from tubes entirely filled with a core material that differs in composition, density, method of fabrication, or other respects from the material of the tubes such as a composite core material formed from fibers or other structures embedded in polymer, rods that are formed from a single material such as solid cylindrical rods, solid composite rods of fiber-composite material such as solid cylindrical composite rods, rods formed from other composites, solid rods of metal or polymer, etc.). The use of tubes that are at least partly hollow may help save weight and thereby help enhance the comfort of a user wearing device 11.1.3.1.1-10.

FIG. 11.1.3.1.1-6 is a cross-sectional view of an illustrative guide rod. As shown in FIG. 11.1.3.1.1-6, guide rod 11.1.3.1.1-50 may include guide rod tube 11.1.3.1.1-82 and a guide rod end member such as end cap 11.1.3.1.1-86. Guide rod tube 11.1.3.1.1-82 may be hollow and may be characterized by cylindrical walls surrounding interior 84. In the example of FIG. 11.1.3.1.1-6, tube 11.1.3.1.1-82 extends along longitudinal axis 11.1.3.1.1-80 and is rotationally symmetric around axis 11.1.3.1.1-80 (e.g., tube 11.1.3.1.1-82 is cylindrical). End cap 11.1.3.1.1-86 may be attached to the end of tube 11.1.3.1.1-82 using adhesive, fasteners, welds, by molding polymer end cap material over the end of tube 11.1.3.1.1-82, and/or other attachment mechanisms. In an illustrative configuration, end cap 11.1.3.1.1-86 may have a first opening such as opening 11.1.3.1.1-88 (e.g., a through-hole opening) to receive a first fastener (e.g., a first screw) and may have a second opening such as opening 11.1.3.1.1-90 (e.g., a through-hole opening) to receive a second fastener (e.g., a second screw). The first screw may be used to attach end cap 11.1.3.1.1-86 to the end of tube 11.1.3.1.1-82 and the second screw may be used to attach end cap 11.1.3.1.1-86 to main housing portion 11.1.3.1.1-12M (e.g., frame 11.1.3.1.1-12FC). Other numbers of end cap openings and/or different features (e.g., threads) in end cap 11.1.3.1.1-86 for attaching end cap 11.1.3.1.1-86 to the end of tube 11.1.3.1.1-82 may be used, if desired.

FIG. 11.1.3.1.1-7 is a side view of guide rod 11.1.3.1.1-50 of FIG. 11.1.3.1.1-7 following insertion of end cap 11.1.3.1.1-86 into the end of tube 11.1.3.1.1-82. The portion of end cap 11.1.3.1.1-86 that is inserted into tube 11.1.3.1.1-82 may have an outer diameter that corresponds to the inner diameter of tube 11.1.3.1.1-82.

As shown in the cross-sectional view of FIG. 11.1.3.1.1-8, fasteners 11.1.3.1.1-92 (e.g., screws) may be received by opening 11.1.3.1.1-88 (to attach end cap 11.1.3.1.1-86 to tube 11.1.3.1.1-82) and opening 11.1.3.1.1-90 (to attach end cap 11.1.3.1.1-86 and the rest of guide rod 11.1.3.1.1-50 to a housing structure such as frame 11.1.3.1.1-12FC (e.g., by screwing a threaded end of the fastener passing through opening 11.1.3.1.1-90 into threaded frame opening 11.1.3.1.1-94. If desired, end cap 11.1.3.1.1-86 may have a flattened surface portion such as planar surface 96 that rests against a corresponding planar portion of frame 11.1.3.1.1-12FC when end cap 11.1.3.1.1-86 is attached to frame 11.1.3.1.1-12FC. The presence of mating planar surfaces may help prevent undesired rotation of guide rod 11.1.3.1.1-50 about axis 11.1.3.1.1-80.

As shown in FIG. 11.1.3.1.1-4, device 11.1.3.1.1-10 may have left and right guide rods (e.g., upper left and right guide rods and lower left and right guide rods). Left and right guide rods 11.1.3.1.1-50 may have separate end caps 11.1.3.1.1-86 each with a respective opening 90, as shown in FIG. 11.1.3.1.1-9, or left and right guide rods 11.1.3.1.1-50 may share a common end cap 11.1.3.1.1-86 with one or more openings 90, as shown in FIG. 11.1.3.1.1-10. A shared end cap may be straight (e.g., so that axes 11.1.3.1.1-80 of the left and right guide rods are parallel and aligned with each other as shown by straight end cap 11.1.3.1.1-86 of FIG. 11.1.3.1.1-11) or a shared end cap may be bent (e.g., so that axes 11.1.3.1.1-80 of the left and right guide rods are not parallel and instead are angled at a non-zero angle A with respect to each other as shown by bent end cap 11.1.3.1.1-86 of FIG. 11.1.3.1.1-12). Bent end cap structures such as the bent end cap of FIG. 11.1.3.1.1-12 may be formed from single pieces of metal (or other material) or may be formed from two members (e.g., two metal members) joined by a welded joint (e.g., a laser weld), an adhesive joint, or other bond 11.1.3.1.1-98. The use of separate or common end cap structures to orient the left and right guide rods 11.1.3.1.1-50 at a non-zero angle A with respect to each other (e.g., an angle A of at least 3°, at least 6°, at least 9°, at least 15°, at least 20°, at least 30°, at least 40°, less than 50°, less than 45°, less than 35°, less than 25°, and/or less than 15°) may help orient the left and right optical modules of device 11.1.3.1.1-10 in front of the left and right sides of the user's face (which tend to angle away from each other slightly). Left and right guide rods may also be made from a single tube. The single tube may be straight (e.g., left and right guide rods may be formed from respective left and right portions of a single straight tube) or the left and right guide rods may be formed from respective left and right portions of a single tube that has been molded or bent so that the left and right guide rods are oriented at a non-zero angle A with respect to each other.

If desired, rods 11.1.3.1.1-50 may be attached to housing 11.1.3.1.1-12M (e.g., frame 11.1.3.1.1-12FC) using press-fit connections between rods 11.1.3.1.1-50 and housing 11.1.3.1.1-12M, using shrink-fit connections between rods 11.1.3.1.1-50 and housing 11.1.3.1.1-12M, and/or using other attachment mechanisms such as gluing (e.g., gluing rods 11.1.3.1.1-50 to housing 11.1.3.1.1-12M). In some arrangements, some or all of end caps 11.1.3.1.1-86 may be omitted (e.g., to help reduce weight). For example, housing 11.1.3.1.1-12M (e.g., frame 11.1.3.1.1-12FC) may include portions that are configured to be received within the cylindrical hollow interior of rods 11.1.3.1.1-50 at the ends of rods 11.1.3.1.1-50 (e.g., housing 11.1.3.1.1-12M may have integral housing portions with the shapes of end caps 11.1.3.1.1-84 that attach to the insides of rods 11.1.3.1.1-50 using a friction fit from a press-fit or shrink-fit connection and/or using adhesive), housing 11.1.3.1.1-12M may include portions that are configured to form cylindrical openings or other shapes (e.g., clamp shapes) that receive the ends of rods 11.1.3.1.1-50 (e.g., rods 11.1.3.1.1-50 may be inserted within openings in housing 11.1.3.1.1-12M to attach to the outer surfaces of the ends of rods 11.1.3.1.1-50 to housing 11.1.3.1.1-12M with a friction fit and/or adhesive), and/or other housing structures (e.g., portions of housing 11.1.3.1.1-12M such as portions of frame 11.1.3.1.1-12FC) that mount rods 11.1.3.1.1-50 to housing 11.1.3.1.1-12M directly.

If desired, some or all of the interior of each guide rod tube may be filled with supporting material. Consider, as an example, guide rod 11.1.3.1.1-50 of FIG. 11.1.3.1.1-13. As shown in FIG. 11.1.3.1.1-13, each guide rod 11.1.3.1.1-50 in device 11.1.3.1.1-10 may have a pair of end caps 11.1.3.1.1-86 (one at each of the opposing ends of guide rod tube 11.1.3.1.1-82). At one or more locations along the length of tube 11.1.3.1.1-82 such as illustrative location 11.1.3.1.1-100, tube 11.1.3.1.1-82 may be provided with a solid supportive core such as core 11.1.3.1.1-102 (e.g., a polymer core such as a cylindrical rod-shaped polymer foam core, a gel core, low-density thermoplastic polymer, or other low-density core of polymer, a metal core, a wood core, or a core formed from other supportive structures). Location 11.1.3.1.1-100 may correspond to the center portion of tube 11.1.3.1.1-82 over which openings in optical module 11.1.3.1.1-40 such as opening 11.1.3.1.1-76 travel (as an example). Core 11.1.3.1.1-102 may be shear-coupled to the inner surface of tube 11.1.3.1.1-82 and may help provide guide tube 11.1.3.1.1-50 with bending strength and torsional strength.

Tube 11.1.3.1.1-82 may be formed from metal, polymer, and/or fiber-composite material such as carbon-fiber material, fiberglass material (e.g., glass-fiber-reinforced structural polymer), other fiber-reinforced polymer, etc. The use of fiber-composite tubes may help reduce the weight of rods 11.1.3.1.1-50.

Consider, as an example, tube 11.1.3.1.1-82 of FIGS. 11.1.3.1.1-14 and 11.1.3.1.1-15. As shown in the side view of FIG. 11.1.3.1.1-14 and the cross-sectional end view of FIG. 11.1.3.1.1-15, fiber-composite tube 11.1.3.1.1-82 of FIGS. 11.1.3.1.1-14 and 11.1.3.1.1-15 may have fibers 11.1.3.1.1-104 embedded in polymer 11.1.3.1.1-106. Fibers 11.1.3.1.1-104 may be carbon fibers, glass fibers, or other strands of material for enhancing the strength of polymer 11.1.3.1.1-106. Polymer 11.1.3.1.1-106, which may sometimes be referred to as binder or resin, may be epoxy, polyether ether ketone (PEEK), a thermoset polymer, a thermoplastic polymer, and/or other polymer material. Materials such as PEEK may exhibit satisfactory wear properties and a low coefficient of friction. Other polymers may be used for forming binder for tube 11.1.3.1.1-82 if desired.

Fibers 11.1.3.1.1-104 may extend in one or more different directions. For example, fibers 11.1.3.1.1-104 may include fibers that extend longitudinally (parallel to tube longitudinal axis 11.1.3.1.1-80), that wrap around the circumference of tube 84 (e.g., about axis 11.1.3.1.1-80), and/or that have angled orientations (e.g., +/−45°) relative to axis 11.1.3.1.1-80. These different types of fiber may be formed in a single layer of fibers or multiple layers of fiber may overlap in a stack. The stack of fiber layers may wrap around tube 11.1.3.1.1-82 and may optionally be covered with a low-friction coating.

Consider, as an example, the fiber-composite guide rod tube in the cross-sectional side view of FIG. 11.1.3.1.1-16. In the example of FIG. 11.1.3.1.1-16, guide rod 11.1.3.1.1-50 includes tube 11.1.3.1.1-82 and end cap 11.1.3.1.1-86. End cap 11.1.3.1.1-86 has a hollow tube shape with hollow interior region 11.1.3.1.1-110. The outer diameter of end cap 11.1.3.1.1-86 (which includes a hollow portion in the example of FIG. 11.1.3.1.1-16) corresponds to the inner diameter of tube 11.1.3.1.1-82. A layer of optional adhesive 11.1.3.1.1-112 may be used to help attach end cap 11.1.3.1.1-86 to tube 11.1.3.1.1-82.

Tube 11.1.3.1.1-82 is hollow and surrounds interior region 11.1.3.1.1-84. Tube 11.1.3.1.1-82 has a hollow cylindrical fiber-composite tube portion formed (in the example of FIG. 11.1.3.1.1-16) from fiber-composite layers 11.1.3.1.1-114 covered with low-friction coating 11.1.3.1.1-116. Layers 11.1.3.1.1-114 form a hollow cylindrical fiber-composite tube surrounding interior 11.1.3.1.1-84. There may be any suitable number N of fiber layers in the tube formed from layers 11.1.3.1.1-114 (e.g., N may be at least one, at least three, at least four, at least six, less than ten, less than eight, less than seven, 3-8, etc.). Fiber composite layers 11.1.3.1.1-114 in the example of FIG. 11.1.3.1.1-16 include six fiber-composite layers: L1, L2, L3, L4, L5, and L6. These layers may have uniaxially aligned fibers and may have fibers that are oriented at 0°, 90°, 0°, 0°, 90°, and 0°, respectively relative to axis 11.1.3.1.1-80. Configurations in which layers 11.1.3.1.1-114 include fibers oriented at +/−45° or other angles may also be used. Fibers oriented along the length of tube 11.1.3.1.1-82 may enhance bend strength. Fibers that wrap around tube 11.1.3.1.1-82 perpendicular to axis 11.1.3.1.1-80 may enhance tube strength. Fibers oriented at +/−45° may enhance torsional rigidity. If desired, different portions along the length of tube 11.1.3.1.1-82 may have different fiber orientations and/or different number of fiber layers.

Coating layer 11.1.3.1.1-116 may, if desired, be formed from one or more metal layers. As an example, first (inner) metal layer C1 may be a nickel cobalt layer that has a thickness of 50 microns or other suitable thickness and second (outer) metal layer C2 may be an electroless nickel layer that is deposited on top of the nickel cobalt layer and has a thickness of 50-400 microns thick, 100-200 microns thick, or other suitable thickness. Layer C1 may serve as an adhesion promotion layer. The outer surface of layers 11.1.3.1.1-114 may be etched prior to coating layers 11.1.3.1.1-114 with layer C1 to enhance adhesion of layer C1 to layers 11.1.3.1.1-114. Layer C1 may interlock with epoxy (or other polymer) in layers 11.1.3.1.1-114 and may enhance adhesion of layer C2. Layer C2 may help provide tube 11.1.3.1.1-82 with low friction as tube 11.1.3.1.1-82 moves back and forth within an opening in portion 11.1.3.1.1-40H or 11.1.3.1.1-40T of optical module 11.1.3.1.1-40 (see, e.g., opening 11.1.3.1.1-76 of FIG. 11.1.3.1.1-5, which may have a nickel coating or other low-friction coating 11.1.3.1.1-78). The thickness of layer C2 may help enhance the strength of tube 11.1.3.1.1-82 (e.g., bending strength).

By using guide rods 11.1.3.1.1-50, the lateral positions of modules 11.1.3.1.1-40 in device 11.1.3.1.1-10 may be adjusted to accommodate different user interpupillary distances. Optical module position adjustments may be automated or manual. The optical positioning system(s) of device 11.1.3.1.1-10 may use guide structures such as guide rods 11.1.3.1.1-50 to allow optical modules 11.1.3.1.1-40 to move along a desired axis. The guide rods and the mounting structures used to attach the guide rods to housing 11.1.3.1.1-12M (e.g., frame 11.1.3.1.1-12FC) may be sufficiently rigid and strong to resist deformation and misalignment in the event that device 11.1.3.1.1-10 is inadvertently dropped.

To reduce the burden on actuators 11.1.3.1.1-43 as actuators 11.1.3.1.1-43 rotate threaded rods 11.1.3.1.1-62 to move modules 11.1.3.1.1-40 along guide rods 11.1.3.1.1-50, guide rods 11.1.3.1.1-50 may be slidably coupled to modules 11.1.3.1.1-40 using low-friction structures. These low friction structures may include using low-friction coating materials such as nickel. The coating layer(s) may be polished (e.g., using a centerless grinding tool) and/or otherwise finished to help reduce friction. If desired, the use of nickel coating material may be omitted (e.g., when finishing rods 11.1.3.1.1-50 using burnishing, grinding, or polishing to provide a low-friction surface). The weight of guide rods 11.1.3.1.1-50, which may affect user comfort, may be reduced by using fiber-composite materials or other light materials in forming guide rod tubes 11.1.3.1.1-82.

An example of a finishing process that may be used to help reduce friction between modules 11.1.3.1.1-40 and rods 11.1.3.1.1-50 is superfinishing. Superfinishing is a microfinishing technique that can be used to enhance the surface finish of an item while also enhancing the accuracy of the contours of the item (e.g., enhancing the accuracy of the desired shapes of rods 11.1.3.1.1-50 such as enhancing the cylindricity of rods 11.1.3.1.1-50 and/or the accuracy of the desired shapes for the mating portions of modules 11.1.3.1.1-40). With superfinishing, small amounts of surface material (e.g., 1-2 microns) are removed by superfinishing equipment using abrasive. The surface of a superfinished item may be less smoothly polished than when the item is finished using smooth polishing equipment (e.g., there may be residual cross-hatched microscratches on the surface of a superfinished item due to oscillations and/or other movements of the abrasive and rotations of the item during finishing). By superfinishing or otherwise treating (e.g., by burnishing, grinding, polishing, etc.) one or more surfaces of parts that slide relative to each other (e.g., the surface of rods 11.1.3.1.1-50), wear may be decreased and smooth sliding operations may be ensured (with or without using coatings such as nickel coating layers).

Fiber-composite tubes may include multiple layers of fiber-composite material (e.g., carbon fiber layers with different fiber orientations). The fiber orientations used in the fiber-composite layers may be selected to enhance bending strength, hoop strength (resistance to tube crushing), and/or torsional strength. End caps 11.1.3.1.1-86 may have solid portions and/or hollow portions and may be formed from one or more metals, polymer, fiber-composite material, etc.

Low-friction coatings for tubes 11.1.3.1.1-82 (see, e.g., coating layers 11.1.3.1.1-116 of FIG. 11.1.3.1.1-16) may be formed from metals such as nickel, nickel cobalt, nickel iron, cobalt, chrome (e.g., a top coat of chrome to serve as a hard coat that reduces friction), and/or other low-friction durable (low-wear) coatings.

If desired, the fibers in tubes 11.1.3.1.1-82 may have different fiber orientations (layups) at different portions of tubes 11.1.3.1.1-82 (e.g., bending strength may be enhanced with fibers that run the length of tubes 11.1.3.1.1-82, torsional rigidity may be enhanced by fibers oriented +/−45° with respect to axis 11.1.3.1.1-80, and these fibers may be present along the entire length of tubes 11.1.3.1.1-82 or only parts of tubes 11.1.3.1.1-82), and/or crush/hoop strength may be enhanced using fibers that wrap around axis 11.1.3.1.1-80 (e.g., particularly at the ends of tubes 11.1.3.1.1-82 where tubes 11.1.3.1.1-82 are being attached to end caps 11.1.3.1.1-86).

Tubes 11.1.3.1.1-82 may, if desired, be provided with strength-enhancing members such as overmolded polymer strengthening members, bonded polymer and/or metal pieces, etc. The surface of tube 11.1.3.1.1-82 may be treated using acid, laser ablation, primer, sand blasting, and/or other treatments to enhance adhesion prior to overmolding operations.

If desired, tubes 11.1.3.1.1-82 may be provided with tapered portions. As shown in FIG. 11.1.3.1.1-17, for example, tube 11.1.3.1.1-82 may have tapered portions 11.1.3.1.1-82T that are formed by grinding and/or machining the end of tube 11.1.3.1.1-82. By forming a tapered outer surface formed at the end of tube 11.1.3.1.1-82, tube 11.1.3.1.1-82 may be precisely aligned with a mating tapered portion of housing 11.1.3.1.1-12 (e.g., a tapered opening in a portion of main housing portion 11.1.3.1.1-12M, a portion of frame 11.1.3.1.1-12FC, or other tapered portion of housing 11.1.3.1.1-12 that is machined or otherwise formed in the housing). Tapered tube 11.1.3.1.1-82 of FIG. 11.1.3.1.1-17 may be retained within the corresponding tapered opening of housing 11.1.3.1.1-12 using a press-fit connection, using adhesive, using fasteners, and/or using other suitable attachment mechanisms. In the example of FIG. 11.1.3.1.1-17, tube 11.1.3.1.1-82 has been provided with insert 11.1.3.1.1-120. Insert 11.1.3.1.1-120 may be a solid cylindrical member or a tube that is configured to be received within the end of the hollow center of tube 11.1.3.1.1-82. Adhesive 111.1.3.1.1-22 or other attachment mechanisms may be used to help attach insert 11.1.3.1.1-120 to tube 11.1.3.1.1-82. Insert 11.1.3.1.1-120 may be formed from metal or other suitable materials and may have threads 11.1.3.1.1-124 that mate with corresponding threads in housing 11.1.3.1.1-12. These threads provide axial retention for tube 11.1.3.1.1-82 (e.g., threads 11.1.3.1.1-124 help hold the tapered end of tube 11.1.3.1.1-82 into the corresponding tapered opening of housing 11.1.3.1.1-12). Adhesive may, if desired, be used to lock threads 11.1.3.1.1-124 in place, may be used to help attach the outer surface of tapered portion 11.1.3.1.1-82T to housing 11.1.3.1.1-12, and/or may otherwise be used to help reinforce the joint between tube 11.1.3.1.1-82 and housing 11.1.3.1.1-12.

11.1.3.1.2: Electronic Device with Lens Positioning Sensing

To accommodate users with different interpupillary distances, the left and right lens assemblies may be moved towards or away from each other. A user may supply the interpupillary distance of the user to the head-mounted device, an image sensor or other device may be used in measuring the interpupillary distance to provide to the head-mounted device, and/or gaze tracking sensors in the head-mounted device may measure the interpupillary distance of the user while the head-mounted device is being worn on the head of the user. Other sensing arrangements may be used to measure lens assembly positions relative to the user's nose, if desired.

To prevent excessive pressure on the surface of the user's nose, force sensors can be used determine how much pressure is applied to the user's nose with the lenses as the lens-to-lens spacing is changed. Control circuitry in the head-mounted device may adjust the left and right lenses to match the user's interpupillary distance, unless the lenses apply too much pressure to the user's nose (e.g., the pressure measured by the force sensors exceeds a threshold). In some situations, the left and right lenses may be spaced so that the lens-to-lens spacing between the left and right lenses matches the user's interpupillary distance. In other situations, the lens-to-lens spacing between the left and right lenses will be slightly larger than the user's interpupillary distance to ensure that the lenses do not press excessively against the user's nose. Sensor circuitry such as force sensing circuitry may be used to provide the control circuitry with real-time feedback on the pressure applied by the lenses to the user's nose, thereby ensuring that the positions of the left and right lenses are adjusted satisfactorily.

A schematic diagram of an illustrative system having an electronic device with sensor circuitry that ensures satisfactory placement of lenses relative to a user's facial features is shown in FIG. 11.1.3.1.2-1. As shown in FIG. 11.1.3.1.2-1, system 11.1.3.1.2-8 may include one or more electronic devices such as electronic device 11.1.3.1.2-10. The electronic devices of system 11.1.3.1.2-8 may include computers, cellular telephones, head-mounted devices, wristwatch devices, and other electronic devices. Configurations in which electronic device 11.1.3.1.2-10 is a head-mounted device are sometimes described herein as an example.

As shown in FIG. 11.1.3.1.2-1, electronic devices such as electronic device 11.1.3.1.2-10 may have control circuitry 11.1.3.1.2-12. Control circuitry 11.1.3.1.2-12 may include storage and processing circuitry for controlling the operation of device 11.1.3.1.2-10. Circuitry 11.1.3.1.2-12 may include storage such as hard disk drive storage, nonvolatile memory (e.g., electrically-programmable-read-only memory configured to form a solid-state drive), volatile memory (e.g., static or dynamic random-access-memory), etc. Processing circuitry in control circuitry 11.1.3.1.2-12 may be based on one or more microprocessors, microcontrollers, digital signal processors, baseband processors, power management units, audio chips, graphics processing units, application specific integrated circuits, and other integrated circuits. Software code may be stored on storage in circuitry 11.1.3.1.2-12 and run on processing circuitry in circuitry 11.1.3.1.2-12 to implement control operations for device 11.1.3.1.2-10 (e.g., data gathering operations, operations involved in processing three-dimensional facial image data, operations involving the adjustment of components using control signals, etc.). Control circuitry 11.1.3.1.2-12 may include wired and wireless communications circuitry. For example, control circuitry 11.1.3.1.2-12 may include radio-frequency transceiver circuitry such as cellular telephone transceiver circuitry, wireless local area network (WiFi®) transceiver circuitry, millimeter wave transceiver circuitry, and/or other wireless communications circuitry.

During operation, the communications circuitry of the devices in system 11.1.3.1.2-8 (e.g., the communications circuitry of control circuitry 11.1.3.1.2-12 of device 11.1.3.1.2-10), may be used to support communication between the electronic devices. For example, one electronic device may transmit video and/or audio data to another electronic device in system 11.1.3.1.2-8. Electronic devices in system 11.1.3.1.2-8 may use wired and/or wireless communications circuitry to communicate through one or more communications networks (e.g., the internet, local area networks, etc.). The communications circuitry may be used to allow data to be received by device 11.1.3.1.2-10 from external equipment (e.g., a tethered computer, a portable device such as a handheld device or laptop computer, online computing equipment such as a remote server or other remote computing equipment, or other electrical equipment) and/or to provide data to external equipment.

Device 11.1.3.1.2-10 may include input-output devices 11.1.3.1.2-22. Input-output devices 11.1.3.1.2-22 may be used to allow a user to provide device 11.1.3.1.2-10 with user input. Input-output devices 11.1.3.1.2-22 may also be used to gather information on the environment in which device 11.1.3.1.2-10 is operating. Output components in devices 11.1.3.1.2-22 may allow device 11.1.3.1.2-10 to provide a user with output and may be used to communicate with external electrical equipment.

As shown in FIG. 11.1.3.1.2-1, input-output devices 11.1.3.1.2-22 may include one or more displays such as display 11.1.3.1.2-14. In some configurations, display 11.1.3.1.2-14 of device 11.1.3.1.2-10 includes left and right display panels (sometimes referred to as left and right portions of display 11.1.3.1.2-14 and/or left and right displays) that are in alignment with the user's left and right eyes and are viewable through left and right lens assemblies, respectively. In other configurations, display 11.1.3.1.2-14 includes a single display panel that extends across both eyes.

Display 11.1.3.1.2-14 may be used to display images. The visual content that is displayed on display 11.1.3.1.2-14 may be viewed by a user of device 11.1.3.1.2-10. Displays in device 11.1.3.1.2-10 such as display 11.1.3.1.2-14 may be organic light-emitting diode displays or other displays based on arrays of light-emitting diodes, liquid crystal displays, liquid-crystal-on-silicon displays, projectors or displays based on projecting light beams on a surface directly or indirectly through specialized optics (e.g., digital micromirror devices), electrophoretic displays, plasma displays, electrowetting displays, microLED displays, or any other suitable displays.

Display 11.1.3.1.2-14 may present computer-generated content such as virtual reality content and mixed reality content to a user. Virtual reality content may be displayed in the absence of real-world content. Mixed reality content, which may sometimes be referred to as augmented reality content, may include computer-generated images that are overlaid on real-world images. The real-world images may be captured by a camera (e.g., a forward-facing camera) and merged with overlaid computer-generated content or an optical coupling system may be used to allow computer-generated content to be overlaid on top of real-world images. As an example, a pair of mixed reality glasses or other augmented reality head-mounted display may include a display device that provides images to a user through a beam splitter, prism, holographic coupler, or other optical coupler. Configurations in which display 11.1.3.1.2-14 is used to display virtual reality content to a user through lenses are described herein as an example.

Input-output devices 11.1.3.1.2-22 may include sensors 11.1.3.1.2-16. Sensors 11.1.3.1.2-16 may include, for example, three-dimensional sensors (e.g., three-dimensional image sensors such as structured light sensors that emit beams of light and that use two-dimensional digital image sensors to gather image data for three-dimensional images from light spots that are produced when a target is illuminated by the beams of light, binocular three-dimensional image sensors that gather three-dimensional images using two or more cameras in a binocular imaging arrangement, three-dimensional LIDAR (light detection and ranging) sensors, three-dimensional radio-frequency sensors, or other sensors that gather three-dimensional image data), cameras (e.g., infrared and/or visible digital image sensors), gaze tracking sensors (e.g., a gaze tracking system based on an image sensor and, if desired, a light source that emits one or more beams of light that are tracked using the image sensor after reflecting from a user's eyes), touch sensors, buttons, force sensors, sensors such as contact sensors based on switches, gas sensors, pressure sensors, moisture sensors, magnetic sensors, audio sensors (microphones), ambient light sensors, microphones for gathering voice commands and other audio input, sensors that are configured to gather information on motion, position, and/or orientation (e.g., accelerometers, gyroscopes, compasses, and/or inertial measurement units that include all of these sensors or a subset of one or two of these sensors), fingerprint sensors and other biometric sensors, optical position sensors (optical encoders), and/or other position sensors such as linear position sensors, and/or other sensors. As shown in FIG. 11.1.3.1.2-1, sensors 11.1.3.1.2-16 may include sensing circuitry (sensor circuitry) that is configured to measure the pressure applied between objects in system 11.1.3.1.2-8. The sensing circuitry may include one or more sensors such as one or more force sensors 11.1.3.1.2-20. Sensing circuitry such as force sensors 11.1.3.1.2-20 may, for example, be used to sense an amount of pressure applied by lens assemblies in device 11.1.3.1.2-10 to a user's nose.

User input and other information may be gathered using sensors and other input devices in input-output devices 11.1.3.1.2-22. If desired, input-output devices 11.1.3.1.2-22 may include other devices 11.1.3.1.2-24 such as haptic output devices (e.g., vibrating components), light-emitting diodes and other light sources, speakers such as ear speakers for producing audio output, and other electrical components. Device 11.1.3.1.2-10 may include circuits for receiving wireless power, circuits for transmitting power wirelessly to other devices, batteries and other energy storage devices (e.g., capacitors), joysticks, buttons, and/or other components.

Electronic device 11.1.3.1.2-10 may have housing structures (e.g., housing walls, straps, etc.), as shown by illustrative support structures 11.1.3.1.2-26 of FIG. 11.1.3.1.2-1. In configurations in which electronic device 11.1.3.1.2-10 is a head-mounted device (e.g., a pair of glasses, goggles, a helmet, a hat, a headband, etc.), support structures 11.1.3.1.2-26 may include head-mounted support structures (e.g., a helmet housing, head straps, temples in a pair of eyeglasses, goggle housing structures, and/or other head-mounted structures). The head-mounted support structures may be configured to be worn on a head of a user during operation of device 11.1.3.1.2-10 and may support display(s) 11.1.3.1.2-14, sensors 11.1.3.1.2-16, other components 11.1.3.1.2-24, other input-output devices 11.1.3.1.2-22, and control circuitry 11.1.3.1.2-12.

FIG. 11.1.3.1.2-2 is a top view of electronic device 11.1.3.1.2-10 in an illustrative configuration in which electronic device 11.1.3.1.2-10 is a head-mounted device. As shown in FIG. 11.1.3.1.2-2, electronic device 11.1.3.1.2-10 may include support structures (see, e.g., support structures 11.1.3.1.2-26 of FIG. 11.1.3.1.2-1) that are used in housing the components of device 11.1.3.1.2-10 and mounting device 11.1.3.1.2-10 onto a user's head. These support structures may include, for example, structures that form housing walls and other structures for main unit 11.1.3.1.2-26-2 (e.g., exterior housing walls, lens assembly structures, etc.) and straps or other supplemental support structures such as structures 11.1.3.1.2-26-1 that help to hold main unit 11.1.3.1.2-26-2 on a user's face so that the user's eyes are located within eye boxes 11.1.3.1.2-60.

Display 11.1.3.1.2-14 may include left and right display panels (e.g., left and right pixel arrays, sometimes referred to as left and right displays or left and right display portions) that are mounted respectively in left and right display modules 11.1.3.1.2-70 corresponding respectively to a user's left eye (and left eye box 11.1.3.1.2-60) and right eye (and right eye box). Modules 11.1.3.1.2-70, which may sometimes be referred to as lens support structures, lens assemblies, lens housings, or lens and display housings, may be individually positioned relative to the housing wall structures of main unit 11.1.3.1.2-26-2 and relative to the user's eyes using positioning circuitry such as respective left and right positioners 11.1.3.1.2-58. Positioners 11.1.3.1.2-58 may include stepper motors, piezoelectric actuators, motors, linear electromagnetic actuators, and/or other electronic components for adjusting lens assembly positions. Positioners 11.1.3.1.2-58 may be controlled by control circuitry 11.1.3.1.2-12 during operation of device 11.1.3.1.2-10. For example, positioners 11.1.3.1.2-58 may be used to adjust the spacing between modules 11.1.3.1.2-70 (and therefore the lens-to-lens spacing between the left and right lenses of modules 11.1.3.1.2-70) to match the interpupillary distance (IPD) of a user's eyes. This allows the user to view the left and right display portions of display 11.1.3.1.2-14 in the left and right lens modules. In some cases, however, the lenses may apply excess pressure to the user's nose if adjusted to the user's IPD. Therefore, sensors may be incorporated into device 11.1.3.1.2-10 to monitor the pressure on the user's nose. An illustrative arrangement that includes force sensors to monitor the pressure applied to the user's nose is shown in FIG. 11.1.3.1.2-3.

As shown in FIG. 11.1.3.1.2-3, lens assembly 11.1.3.1.2-70 (e.g., one of the two lens modules 11.1.3.1.2-70 shown in FIG. 11.1.3.1.2-2) may be adjacent to the user's nose 11.1.3.1.2-40 when device 11.1.3.1.2-10 is being worn on a user's head. Only one of the two lens modules is shown in FIG. 11.1.3.1.2-3 for simplicity, but the other lens assembly 11.1.3.1.2-70 may have the same structure.

To ensure that display 11.1.3.1.2-14 is viewable by the user when the user's eyes are located in eye boxes 11.1.3.1.2-60 (FIG. 11.1.3.1.2-2), control circuitry 11.1.3.1.2-12 may attempt to align lens centers LC with the centers PC of the user's eyes. At the same time, control circuitry 11.1.3.1.2-12 may use sensor circuitry such as force sensors 11.1.3.1.2-20 to monitor the pressure applied to nose 11.1.3.1.2-40 by lens modules 11.1.3.1.2-70 to ensure that lens modules 11.1.3.1.2-70 do not press excessively on nose 11.1.3.1.2-40 and cause discomfort.

In scenarios in which the user's nose is small, there may be ample room available to align lens centers LC with eye centers PC. In scenarios in which the user's nose is larger, control circuitry 11.1.3.1.2-12 may position modules 11.1.3.1.2-70 as shown in FIG. 11.1.3.1.2-3. For example, a distance between lens modules 11.1.3.1.2-70 (the lens-to-lens spacing) may be larger than would be desired for perfect alignment of lens centers LC with eye centers PC. The use of this wider lens-to-lens spacing helps ensure that lens modules 11.1.3.1.2-70 will not exert more inward force on nose 11.1.3.1.2-40 than would be comfortable to a user, while still allowing satisfactory viewing of content on display 11.1.3.1.2-14 through lenses 11.1.3.1.2-72. Lens modules 11.1.3.1.2-70 may be placed at a non-zero distance (gap) from the side surfaces of nose 11.1.3.1.2-40 or may be spaced apart from the side surfaces of nose 11.1.3.1.2-40 by a predetermined gap. A user may select which of these options is most comfortable to the user and/or a default setting may be supplied to control circuitry 11.1.3.1.2-12.

In operation, positioners 11.1.3.1.2-58 may move lens modules 11.1.3.1.2-70 (FIG. 11.1.3.1.2-2) toward nose 11.1.3.1.2-40, attempting to align the lens center LC of each lens with eye centers PC. Sensors may be incorporated into device 11.1.3.1.2-10 to ensure that excess pressure is not applied to nose 11.1.3.1.2-40 by lens modules 11.1.3.1.2-70. In general, any desired sensor circuitry may be used to measure the pressure on nose 11.1.3.1.2-40. In one example, each lens module 11.1.3.1.2-70 may have one or more force sensors 11.1.3.1.2-20.

Force sensor 11.1.3.1.2-20 may be incorporated between nasal flap 11.1.3.1.2-29 and each lens assembly 11.1.3.1.2-70. Nasal flap 11.1.3.1.2-29 may be a fabric, polymer, or other material component that allows for a comfortable fit for a user of device 11.1.3.1.2-10. For example, nasal flap 11.1.3.1.2-29 may be interposed between each lens assembly 11.1.3.1.2-70 and nose 11.1.3.1.2-40. In some embodiments, nasal flap 11.1.3.1.2-29 may extend along both sides and over the top of nose 11.1.3.1.2-40 (e.g., over at least a portion of a bridge of nose 11.1.3.1.2-40). However, this is merely illustrative. Nasal flap 11.1.3.1.2-29 may have two separate portion, one between left lens assembly 11.1.3.1.2-70 and nose 11.1.3.1.2-40 and another between right lens assembly 11.1.3.1.2-70 and nose 11.1.3.1.2-40, or may be omitted from device 11.1.3.1.2-10 if desired.

In embodiments in which nasal flap 11.1.3.1.2-29 is included in device 11.1.3.1.2-10, force sensors 11.1.3.1.2-20 may be incorporated between each lens assembly 11.1.3.1.2-70 (i.e., left lens assembly 11.1.3.1.2-70 and right lens assembly 11.1.3.1.2-70) and nasal flap 11.1.3.1.2-29. However, this location of force sensors 11.1.3.1.2-20 is merely illustrative. In general, force sensors 11.1.3.1.2-20 may be included in any desired location within device 11.1.3.1.2-10. For example, force sensors 11.1.3.1.2-20 may be formed between nasal flap 11.1.3.1.2-29 and nose 11.1.3.1.2-40 as shown by position 11.1.3.1.2-20', may be formed within nasal flap 11.1.3.1.2-29 or be integral with nasal flap 11.1.3.1.2-29 as shown by position 11.1.3.1.2-20", or may be formed within lens assembly 11.1.3.1.2-70 as shown by position 11.1.3.1.2-20".

Although FIG. 11.1.3.1.2-3 shows a single force sensor 11.1.3.1.2-20 between nose 11.1.3.1.2-40 and lens assembly 11.1.3.1.2-70, this is merely illustrative. Device 11.1.3.1.2-10 may have one force sensor 11.1.3.1.2-20 between nose 11.1.3.1.2-40 and each lens assembly 11.1.3.1.2-70, may have multiple force sensors between nose 11.1.3.1.2-40 and each lens assembly 11.1.3.1.2-70, may have one single force sensor between nose 11.1.3.1.2-40 and one lens assembly 11.1.3.1.2-70, or may have any other desired arrangement of force sensor(s) 11.1.3.1.2-20.

Regardless of where force sensors 11.1.3.1.2-20 are formed within device 11.1.3.1.2-10, force sensors 11.1.3.1.2-20 may monitor the amount of force applied to nose 11.1.3.1.2-40 by lens modules 11.1.3.1.2-70 to ensure that excess pressure is not applied to nose 11.1.3.1.2-40. Force sensors 11.1.3.1.2-20 may continuously monitor the applied force, or may flag control circuitry 11.1.3.1.2-12 when the applied force surpasses a threshold. Force sensors 11.1.3.1.2-20 may be any desired type of sensor that monitors the amount of force/pressure applied to nose 11.1.3.1.2-40. Some examples of force sensors 11.1.3.1.2-20 are shown in FIGS. 11.1.3.1.2-4A-11.1.3.1.2-4C.

In some examples, force sensor(s) 11.1.3.1.2-20 may be direct force sensors, such as force sensor 11.1.3.1.2-20 of FIG. 11.1.3.1.2-4A. Direct force sensor 11.1.3.1.2-20 of FIG. 11.1.3.1.2-4A may be a pressure sensitive resistor and may include electrodes formed form interdigitated finger traces 11.1.3.1.2-27. In particular, when pressure is applied to direct force sensor 11.1.3.1.2-20, the resistance may be determined due to a change in distance between portions of interdigitated finger traces 11.1.3.1.2-27, and circuitry, such as control circuitry 11.1.3.1.2-12, may determine the force applied to direct force sensor 11.1.3.1.2-20. If direct force sensor 11.1.3.1.2-20 is placed in any of the possible locations shown in FIG. 11.1.3.1.2-3, or otherwise placed between a user's nose and lens assembly 11.1.3.1.2-70, direct force sensor 11.1.3.1.2-20 may be used to determine the force that lens assembly 11.1.3.1.2-70 applies to nose 11.1.3.1.2-40 as it is moved toward nose 11.1.3.1.2-40. Direct force sensor 11.1.3.1.2-20 may be used to continuously measure the pressure against nose 11.1.3.1.2-40, or may be used as a thresholding sensor (i.e., control circuitry 11.1.3.1.2-12 may determine that the resistance of direct force sensor 11.1.3.1.2-20 is over a threshold and that the force on nose 11.1.3.1.2-40 is therefore too great).

In other examples, force sensor(s) 11.1.3.1.2-20 may be formed from conductive strands, yarn, or fibers and incorporated into a fabric in device 11.1.3.1.2-10. For example, force sensor(s) 11.1.3.1.2-20 may be formed form smart fabrics or other fabrics that include conductive strands. The conductive strands may be arranged to form a force sensor. An example of this arrangement is shown in FIG. 11.1.3.1.2-4B.

As shown in FIG. 11.1.3.1.2-4B, force sensor 11.1.3.1.2-20 may be incorporated into fabric 11.1.3.1.2-31. In particular, fabric 11.1.3.1.2-31 may include conductive strands 11.1.3.1.2-28 and non-conductive strands 11.1.3.1.2-33. Conductive strands 11.1.3.1.2-28 may be arranged to form a force sensor. For example, control circuitry, such as control circuitry 11.1.3.1.2-12, may measure capacitance or resistance changes between conductive strands 11.1.3.1.2-28. Because the capacitance/resistance will change as the distance between conductive strands 11.1.3.1.2-28 changes, the capacitance/resistance measurements are indicative of the amount of force on fabric 11.1.3.1.2-31. Conductive strands may be formed from a metal, such as silver or copper, which may optionally be coated onto a polymer or fabric strand.

Although conductive strands 11.1.3.1.2-28 are shown as straight strands in FIG. 11.1.3.1.2-4B, this is merely illustrative. In some embodiments, conductive strands 11.1.3.1.2-28 may be serpentine or have other desired shapes, which may allow fabric 11.1.3.1.2-31 to have improved flexibility.

Non-conductive strands 11.1.3.1.2-33 may be interspersed between at least some of conductive strands 11.1.3.1.2-28, if desired. As shown in FIG. 11.1.3.1.2-4B, every other strand may be a non-conductive strand. However, this is merely illustrative. Any desired number of conductive and non-conductive strands may be incorporate into fabric 11.1.3.1.2-31 to form force sensor 11.1.3.1.2-20.

Fabric 11.1.3.1.2-31 may form some or all of nasal flap 11.1.3.1.2-29, or may otherwise cover nasal flap 11.1.3.1.2-29. Because nasal flap 11.1.3.1.2-29 is between nose 11.1.3.1.2-40 and lens assembly 11.1.3.1.2-70 when device 11.1.3.1.2-10 is worn by a user (FIG. 11.1.3.1.2-2), force sensor 11.1.3.1.2-20 may indicate the amount of force applied to nose 11.1.3.1.2-40 by lens assembly 11.1.3.1.2-70. Any desired number of force sensors 11.1.3.1.2-20 may be incorporated into nasal flap 11.1.3.1.2-29 in this way.

Alternatively or additionally, fabric 11.1.3.1.2-31 may be otherwise incorporated into device 11.1.3.1.2-10. For example, fabric 11.1.3.1.2-31 may form a curtain fabric that is incorporated into device 11.1.3.1.2-10 between support structure 11.1.3.1.2-26-2 and lenses 11.1.3.1.2-70 (FIG. 11.1.3.1.2-2) to hide internal components. At least a portion of the curtain fabric having force sensor(s) 11.1.3.1.2-20 may be between lens assembly 11.1.3.1.2-70 and nose 11.1.3.1.2-40 (e.g., between lens assembly 11.1.3.1.2-70 and nasal flap 11.1.3.1.2-29) and may therefore measure the force applied to nose 11.1.3.1.2-40 by lens assembly 11.1.3.1.2-70. In general, however, fabric 11.1.3.1.2-31 may be incorporated into device 11.1.3.1.2-10 into any desired manner. Any desired number of force sensors 11.1.3.1.2-20 may be incorporated into fabric 11.1.3.1.2-31.

In other examples, force sensor(s) 11.1.3.1.2-20 may be incorporated into an interior region of nasal flap 11.1.3.1.2-29. An example of an arrangement in which a force sensor is located in the interior of nasal flap 11.1.3.1.2-29 is shown in FIG. 11.1.3.1.2-4C.

As shown in FIG. 11.1.3.1.2-4C, nasal flap 11.1.3.1.2-29 may have peripheral region 11.1.3.1.2-29A that surrounds inner region 11.1.3.1.2-29B (also referred to as a cavity herein). Peripheral region 11.1.3.1.2-29A may be formed from polymer, rubber, or any other desired material. Inner region 11.1.3.1.2-29B may be filled with air, gas, liquid, or any other desired substance. Force sensor 11.1.3.1.2-20 may be located in inner region 11.1.3.1.2-29B and may produce a force measurement in response to increased pressure in inner region 11.1.3.1.2-29B. For example, as lens assembly 11.1.3.1.2-70 squeezes nasal flap 11.1.3.1.2-29 against nose 11.1.3.1.2-40 (FIG. 11.1.3.1.2-2), the pressure of the air, gas, liquid, or other material within nasal flap 11.1.3.1.2-29 may increase, increasing the pressure on force sensor 11.1.3.1.2-20. In some examples, force sensor 11.1.3.1.2-20 may be a barometric pressure sensor that measures the increased pressure within inner region 11.1.3.1.2-29B when lens assembly 11.1.3.1.2-70 is moved against nose 11.1.3.1.2-40. Therefore, force sensor 11.1.3.1.2-20 may produce a force measurement indicative of the force applied to the user's nose by lens assembly 11.1.3.1.2-70.

Although FIG. 11.1.3.1.2-4C shows one side or portion of nasal flap 11.1.3.1.2-29, this is merely illustrative. Any desired number of force sensors 11.1.3.1.2-20 may be incorporated into inner region 11.1.3.1.2-29B of nasal flap 11.1.3.1.2-29 on one or both sides of the user's nose. Additionally, although FIG. 11.1.3.1.2-4C shows force sensor 11.1.3.1.2-20 implemented as a pressure sensor in nasal flap 11.1.3.1.2-29, force sensor 11.1.3.1.2-20 may be a pressure sensor anywhere between nose 11.1.3.1.2-40 and lens assembly 11.1.3.1.2-70 when worn by a user. For example, force sensor 11.1.3.1.2-20 may be implemented as a pressure sensor within an edge portion of lens assembly 11.1.3.1.2-70 (i.e., in position 11.1.3.1.2-20" of FIG. 11.1.3.1.2-3), if desired.

As an alternative to the sensors shown in FIGS. 11.1.3.1.2-4A-11.1.3.1.2-4C, force sensor 11.1.3.1.2-20 may be implemented to measure the deflection of nasal flap 11.1.3.1.2-29 relative to lens assembly 11.1.3.1.2-70. An example of this type of force sensor is shown in FIG. 11.1.3.1.2-5.

As shown in FIG. 11.1.3.1.2-5, force sensor 11.1.3.1.2-20 may be mounted to (or within) a portion of lens assembly 11.1.3.1.2-70. Force sensor 11.1.3.1.2-20 may be a sensor that measures the proximity of nasal flap 11.1.3.1.2-29, such as a capacitive proximity sensor, a resistive proximity sensor, an optical proximity sensor, an ultrasonic proximity sensor, or any other desired type of proximity sensor. Optionally, magnet 11.1.3.1.2-32 may be embedded within (or mounted to) nasal flap 11.1.3.1.2-29, and force sensor 11.1.3.1.2-20 may be implemented as a Hall Effect sensor. In this way, the Hall Effect sensor may determine the proximity of magnet 11.1.3.1.2-32 and therefore the proximity of nasal flap 11.1.3.1.2-29. By measuring the proximity of nasal flap 11.1.3.1.2-29 (i.e., the amount by which nasal flap 11.1.3.1.2-29 has moved), the proximity sensor may provide an output that is indicative of the amount of force applied to the user's nose by lens assembly 11.1.3.1.2-70.

Although the previous embodiments have included a dedicated force sensor 11.1.3.1.2-20 to ensure that excessive force is not applied to a user's nose, this is merely illustrative. Device 11.1.3.1.2-10 may use other sensors (such as sensors 11.1.3.1.2-16) to determine if the force applied to nose 11.1.3.1.2-40 exceeds a threshold. An example of this arrangement is shown in FIG. 11.1.3.1.2-6.

As shown in FIG. 11.1.3.1.2-6, one or more flexible members 11.1.3.1.2-34 may extend from lens assembly 11.1.3.1.2-70. Flexible members 11.1.3.1.2-34 may be formed from rubber, polymer, fabric, or any other desired flexible material. Device 11.1.3.1.2-10 may also include light-emitting component 11.1.3.1.2-36 and light-detecting component 11.1.3.1.2-42, which may be used in gaze tracking or other desired operations. For example, light-emitting component 11.1.3.1.2-36 may be an infrared light-emitting component and light-detecting component 11.1.3.1.2-42 may be an infrared light-detecting component. To determine the gaze of a user of device 11.1.3.1.2-10, infrared light-emitting component 11.1.3.1.2-36 may emit light toward the eye of the user, and the reflections from the user's eye may be detected by infrared light-detecting component 11.1.3.1.2-42. These reflections may indicate the direction of the user's gaze. In general, however, light-emitting component 11.1.3.1.2-36 and light-detecting component 11.1.3.1.2-42 may be any desired components and may operate in any desired wavelength.

When assembly 11.1.3.1.2-70 moves toward nasal flap 11.1.3.1.2-29 (and therefore nose 11.1.3.1.2-40), it will eventually contact and push against nasal flap 11.1.3.1.2-29 and nose 11.1.3.1.2-40, causing flexible members 11.1.3.1.2-34 to be moved in direction 11.1.3.1.2-38. If flexible members 11.1.3.1.2-34 move far enough (i.e., the amount of force applied to nose 11.1.3.1.2-40 exceeds or meets a threshold), flexible members 11.1.3.1.2-34 may block light-emitting component 11.1.3.1.2-36. As a result, light-detecting component 11.1.3.1.2-42 may stop detecting light emitted by light-emitting component 11.1.3.1.2-36. Based on the changed signal of light-detecting component 11.1.3.1.2-42, control circuitry 11.1.3.1.2-12 may stop positioners 11.1.3.1.2-58 from moving lens assembly 11.1.3.1.2-70 further toward the user's nose.

Although flexible members 11.1.3.1.2-34 are shown as covering light-emitting component 11.1.3.1.2-36, this is merely illustrative. Flexible members 11.1.3.1.2-34 may cover light-detecting component 11.1.3.1.2-42, or may merely move between light-emitting component 11.1.3.1.2-36 and light-detecting component 11.1.3.1.2-42. Additionally, any desired number of flexible members 11.1.3.1.2-34 may be used.

If desired, the position of lens modules 11.1.3.1.2-70 relative to the corresponding surfaces of nose 11.1.3.1.2-40 may be measured using feedback from motors in positioners 11.1.3.1.2-58 as lens modules 11.1.3.1.2-70 are moved into contact with the surfaces of nose 11.1.3.1.2-40. An illustrative control circuit for a positioner such as positioner 11.1.3.1.2-58 is shown in FIG. 11.1.3.1.2-7. Control circuitry 11.1.3.1.2-12 (FIG. 11.1.3.1.2-1) may include a motor controller such as controller 11.1.3.1.2-80. Controller 11.1.3.1.2-80 may drive motor 11.1.3.1.2-86 in a positioner 11.1.3.1.2-58 to move an associated lens module 11.1.3.1.2-70 by suppling a power supply voltage Vin to motor 11.1.3.1.2-86 using path 11.1.3.1.2-84. While voltage Vin is being supplied to motor 11.1.3.1.2-86, controller 11.1.3.1.2-80 of control circuitry 11.1.3.1.2-12 monitors the resulting current flow (current I) through path 11.1.3.1.2-84 using sensor circuit 82 (e.g., a current sensing resistor with a corresponding analog-to-digital converter circuit, etc.). Power supply voltage Vin may remain relatively constant while motor 11.1.3.1.2-86 moves lens assembly 11.1.3.1.2-70. Positioner 11.1.3.1.2-58 may initially be used to position an edge of lens assembly 11.1.3.1.2-70 at a location that is distant from nose 11.1.3.1.2-40. Control circuitry 11.1.3.1.2-12 may then direct positioner 11.1.3.1.2-58 to move lens assembly 11.1.3.1.2-70 toward nose 11.1.3.1.2-40. Controller 11.1.3.1.2-80 of control circuitry 11.1.3.1.2-12 may monitor the current I that flows through path 11.1.3.1.2-84 and I sensed by sensor 82. When lens assembly 11.1.3.1.2-70 is pressed against the side of nose 11.1.3.1.2-40, current I will increase. When current I surpasses a desired threshold (that is related to the force applied to nose 11.1.3.1.2-40), control circuitry 11.1.3.1.2-12 may stop positioner 11.1.3.1.2-58 from applying more force to nose 11.1.3.1.2-40 with lens assembly 11.1.3.1.2-70.

Illustrative operations involved in operating device 11.1.3.1.2-10 in system 11.1.3.1.2-8 are shown in FIG. 11.1.3.1.2-8.

During the operations of block 11.1.3.1.2-100, information on the distance between the user's eyes (interpupillary distance IPD, sometimes referred to as pupillary distance) may be gathered. With one illustrative arrangement, device 11.1.3.1.2-10 or other equipment in system 11.1.3.1.2-8 gathers the user's interpupillary distance from the user by prompting the user to type the interpupillary distance into a data entry box on display 11.1.3.1.2-14 or a display in other equipment in system 11.1.3.1.2-8. The user may also supply the user's interpupillary distance using voice input or other user input arrangements. With another illustrative arrangement, a sensor in device 11.1.3.1.2-10 or other a sensor in a stand-alone computer, portable device, or other equipment in system 11.1.3.1.2-8 may measure the user's interpupillary distance. For example, a sensor such as a two-dimensional or three-dimensional image sensor may gather an image of the user's face to measure the value of interpupillary distance IPD. After the measurement of the interpupillary distance has been made, the interpupillary distance may be provided to device 11.1.3.1.2-10 (e.g., over a wired or wireless communications paths). If desired, gaze trackers may measure the locations of the centers of the user's eyes PD and thereby determine IPD from direct measurement as a user is wearing device 11.1.3.1.2-10 on the user's head.

After gathering interpupillary distance IPD, control circuitry 11.1.3.1.2-12 of device 11.1.3.1.2-10 may, during the operations of block 11.1.3.1.2-102, use positioners 11.1.3.1.2-58 to adjust the lens-to-lens spacing between lens centers LC so that this distance matches interpupillary distance IPD and so that the centers of lenses 11.1.3.1.2-72 are aligned with respective eye centers PC. While positioners 11.1.3.1.2-58 are moving lens modules 11.1.3.1.2-70 and lenses 11.1.3.1.2-72 (e.g., while the lens-to-lens spacing is being reduced to move modules 11.1.3.1.2-70 towards adjacent surfaces of the user's nose), control circuitry 11.1.3.1.2-12 uses force sensing circuitry (e.g., force sensor(s) 11.1.3.1.2-20) to monitor the force applied by lens modules 11.1.3.1.2-70 on nose 11.1.3.1.2-40). In some situations, the user's nose 11.1.3.1.2-40 may prevent lenses 11.1.3.1.2-72 from being brought sufficiently close to each other to allow the lens-to-lens spacing to exactly match IPD without creating a risk of discomfort for the user. In other words, force sensor(s) 11.1.3.1.2-20 may indicate that too much force is being applied to nose 11.1.3.1.2-40 by lens modules 11.1.3.1.2-70, or that the force being applied to nose 11.1.3.1.2-40 by lens modules 11.1.3.1.2-70 has reached a threshold. Control circuitry 11.1.3.1.2-12 may then stop positioners 11.1.3.1.2-58 from moving lens modules 11.1.3.1.2-70 further toward nose 11.1.3.1.2-40. If desired, positioners 11.1.3.1.2-58 may move lens modules 11.1.3.1.2-70 off of nose 11.1.3.1.2-40 by a desired gap (e.g., a gap G of at least 0.1 mm, at least 0.2 mm, at least 1 mm, at least 2 mm, less than 5 mm, or other suitable spacing).

Following the positioning of modules 11.1.3.1.2-70 at desired locations relative to nose 11.1.3.1.2-40 to ensure user comfort while wearing device 11.1.3.1.2-10, control circuitry 11.1.3.1.2-12 may use display 11.1.3.1.2-14 to present visual content to the user through lenses 11.1.3.1.2-72 (block 11.1.3.1.2-104).

11.1.3.2: Sensors/Encoders

FIG. 11.1.3.2-1 illustrates a front, right, perspective view of a portion of an HMD 11.1.3.2-100 including first and second optical modules 11.1.3.2-102_a_, 11.1.3.2-102_b_. The first and second optical modules 11.1.3.2-102_a-b_ can be secured to an adjustment mechanism configured to alter the position of the optical modules 11.1.3.2-102_a-b_ relative to other components of the HMD 11.1.3.2-100, for example relative to the bracket 11.1.3.2-108. For example, the first optical module 11.1.3.2-102_a_ can include follower 11.1.3.2-104 slidably engaged with a guide-rod 11.1.3.2-106 via a channel of the follower 11.1.3.2-104 such that the optical module 11.1.3.2-102_a_ can be adjusted laterally in the axial direction of the guide-rod 11.1.3.2-106. In some examples, the optical modules 11.1.3.2-102_a-b_ can include a guide-rod slidably engaged with a follower mechanism or some other sliding track system. The illustrated example is not limiting.

In at least one example, a motor (not shown) can be activated to move and adjust the position of the optical module 11.1.3.2-102_a_ along the guide rod 11.1.3.2-106. In order to determine the position of the optical module 11.1.3.2-102_a_ relative to the second optical module 11.1.3.2-102_b_ or relative to other components of the HMD 11.1.3.2-100, the HMD 11.1.3.2-100 can include an encoder 11.1.3.2-109. In one example, the encoder 11.1.3.2-109 is not on or disposed with the motor. Rather, in at least one example, such as the example shown in FIG. 11.1.3.2-1, the encoder 11.1.3.2-109 can be disposed outside the motor and secured in to the frame or bracket 11.1.3.2-108 of the HMD 11.1.3.2-100. In one example, the encoder 109 can be secured to the frame and/or bracket 108 of the HMD 11.1.3.2-100 directly. In one example, the encoder assembly 11.1.3.2-109 can be secured to the frame and/or bracket 11.1.3.2-108 of the HMD 11.1.3.2-100 indirectly via an encoder bracket.

In one example, the encoder 11.1.3.2-109 assembly can include a magnet 11.1.3.2-110 having a master strip 11.1.3.2-113 and a Nonius strip 11.1.3.2-111, each including magnetic pole strips 11.1.3.2-112, forming adjacent magnetic pole pairs, for interacting with a ferromagnetic or magnetic chip component translatable with the optical module when the optical module 11.1.3.2-102_a_ is moved along the guide-rod 11.1.3.2-106. In at least one example, the magnetic pole pairs 11.1.3.2-112 of the Nonius strip 11.1.3.2-111 are phase shifted relative to the master strip 11.1.3.2-113 such that the master strip 11.1.3.2-113 can be used for local position detection and the Nonius strip 11.1.3.2-111 can be used for determining which pole pair is correlated to the detected position. In this way, the magnet 11.1.3.2-110 of the encoder 11.1.3.2-109 can serve as part of an absolute encoder for detecting position across the whole range of movement of the optical module 11.1.3.2-102_a_.

In at least one example, the encoder 11.1.3.2-109 is a non-contact encoder. In one example, the encoder 11.1.3.2-109 is a Hall-effect encoder.

Any of the features, components, and/or parts, including the arrangements and configurations thereof shown in FIG. 11.1.3.2-1 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.3.2-1.

FIG. 11.1.3.2-2 illustrates a top, left, perspective view of a portion of an HMD 11.1.3.2-200 including an optical module 11.1.3.2-202 having a follower 11.1.3.2-204 slidably engaged with a guide-rod 11.1.3.2-206. The optical module 11.1.3.2-202 can be slid along the guide-rod 11.1.3.2-206 via a motor (not shown). In at least one example, the HMD 11.1.3.2-200 can include an encoder assembly 11.1.3.2-209. The encoder assembly 11.1.3.2-209 can include a magnet 11.1.3.2-210 fixed in position to the HMD 11.1.3.2-200, for example to the chassis, frame, or bracket 11.1.3.2-208 of the HMD 11.1.3.2-200. In at least one example, the encoder assembly 11.1.3.2-209 can include a chip 11.1.3.2-216 or chip assembly including a housing and a chip configured to slide relative to the magnet 11.1.3.2-210 along with the optical module 11.1.3.2-202. The chip 11.1.3.2-216 can be secured with the optical module 11.1.3.2-202 via a flexure bracket 11.1.3.2-214 secured to the chip 11.1.3.2-216 (or chip assembly 11.1.3.2-216). In at least one example, the flexure bracket 11.1.3.2-214 is fixed to the optical module 11.1.3.2-202 at a first end 11.1.3.2-218 and biased against the magnet 11.1.3.2-210 at a second end 11.1.3.2-222. In one example, the flexure bracket 11.1.3.2-214 biases the chip 11.1.3.2-216 against the magnet 11.1.3.2-210 at the second end 11.1.3.2-222 thereof so the chip 11.1.3.2-216 is disposed adjacent to the magnet 11.1.3.2-210 and configured to slide relative to the magnet 11.1.3.2-210 when the optical module 11.1.3.2-202 is moved via the motor (not shown).

Any of the features, components, and/or parts, including the arrangements and configurations thereof shown in FIG. 11.1.3.2-2 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.3.2-2.

FIG. 11.1.3.2-3 illustrates an example of an encoder assembly 11.1.3.2-309 including a bracket 11.1.3.2-314 biasing a chip 11.1.3.2-316 against a magnet 11.1.3.2-310. In at least one example, the bracket 11.1.3.2-314 includes a first end/portion 11.1.3.2-318 secured to an optical module of an HMD device and a second end 11.1.3.2-322 opposite the first In at least one example, the flexure bracket 11.1.3.2-314 is fixed to the chip 11.1.3.2-316 via a secondary flexure bracket 11.1.3.2-320 to correct for the angle of the magnet 11.1.3.2-310 during assembly of the encoder assembly 11.1.3.2-309. The secondary flexure bracket 11.1.3.2-320 can extend from a distal end 11.1.3.2-322 of a primary flexure bracket 11.1.3.2-317 which is coupled to a proximal end/portion 11.1.3.2-318 configured to be fixed to an optical module of an HMD device.

In at least one example, the primary and/or secondary flexure brackets 11.1.3.2-317, 11.1.3.2-320, as well as the proximal portion 11.1.3.2-318, can be formed of a plastic such as Ultum. In one example, the encoder magnet 11.1.3.2-310 can include a low friction tape, for example a Teflon tape.

Any of the features, components, and/or parts, including the arrangements and configurations thereof shown in FIG. 11.1.3.2-3 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.3.2-3.

11.1.3.2.1: Sensor Assembly

Systems of the present disclosure can provide a head-mountable device that securely supports sensors that are isolated from an external environment within a sealed container and orientations over time and avoids applying excessive strain on the sensors, thereby protecting them from harm. The sensor can be mounted on a flex circuit or circuit board, which is rigidly secured within an enclosure, including for example a plate and a case. The case and the plate can be sealed together with the flex circuit extending there through (e.g., at an opening formed by sealing glue) to operably connected to another component.

Accordingly, the sensor assemblies described herein facilitate effective performance of sensors mounted therein. The sensor assemblies provides high robustness during the entirety of the service life of the head-mountable device without placing strain on the sensors themselves. The seal of the enclosure can isolate the sensor from external influences by preventing ingress of elements through the case and plate. The sensor assemblies further enable the mounting of sensors on a flex circuit, where desired.

These and other embodiments are discussed below with reference to FIGS. 11.1.3.2.1-1 through 11.1.3.2.1-5. However, those skilled in the art will readily appreciate that the detailed description given herein with respect to these Figures is for explanatory purposes only and should not be construed as limiting.

According to some embodiments, for example as shown in FIG. 11.1.3.2.1-1, a head-mountable device 11.1.3.2.1-100 includes a frame 11.1.3.2.1-110 that is worn on a head of a user. The frame 11.1.3.2.1-110 can be positioned in front of the eyes of a user to provide information within a field of view of the user. The frame 11.1.3.2.1-110 can provide nose pads or another feature to rest on a user's nose. The frame 11.1.3.2.1-110 can be supported on a user's head with the head engager 11.1.3.2.1-120. The head engager 11.1.3.2.1-120 can wrap or extend along opposing sides of a user's head. The head engager 11.1.3.2.1-120 can include earpieces for wrapping around or otherwise engaging or resting on a user's ears. It will be appreciated that other configurations can be applied for securing the head-mountable device 11.1.3.2.1-100 to a user's head. For example, one or more bands, straps, belts, caps, hats, or other components can be used in addition to or in place of the illustrated components of the head-mountable device 11.1.3.2.1-100. By further example, the head engager 11.1.3.2.1-120 can include multiple components to engage a user's head.

The frame 11.1.3.2.1-110 can provide structure around a peripheral region thereof to support any internal components of the frame 11.1.3.2.1-110 in their assembled position. For example, the frame 11.1.3.2.1-110 can enclose and support various internal components (including for example integrated circuit chips, processors, memory devices and other circuitry) to provide computing and functional operations for the head-mountable device 11.1.3.2.1-100, as discussed further herein. While several components are shown within the frame 11.1.3.2.1-110, it will be understood that some or all of these components can be located anywhere within or on the head-mountable device 11.1.3.2.1-100. For example, one or more of these components can be positioned within the head engager 11.1.3.2.1-120 of the head-mountable device 11.1.3.2.1-100.

The frame 11.1.3.2.1-110 can include and/or support one or more cameras 11.1.3.2.1-130. The cameras 11.1.3.2.1-130 can be positioned on or near an outer side 11.1.3.2.1-122 of the frame 11.1.3.2.1-110 to capture images of views external to the head-mountable device 11.1.3.2.1-100. As used herein, an outer side of a portion of a head-mountable device is a side that faces away from the user and/or towards an external environment. The captured images can be used for display to the user or stored for any other purpose. Each of the cameras 11.1.3.2.1-130 can be movable along the outer side 11.1.3.2.1-122. For example, a track or other guide can be provided for facilitating movement of the camera 11.1.3.2.1-130 therein.

The head-mountable device 11.1.3.2.1-100 can include displays 11.1.3.2.1-140 that provide visual output for viewing by a user wearing the head-mountable device 11.1.3.2.1-100. One or more displays 11.1.3.2.1-140 can be positioned on or near an inner side 11.1.3.2.1-124 of the frame 11.1.3.2.1-110. As used herein, an inner side 11.1.3.2.1-124 of a portion of a head-mountable device is a side that faces toward the user and/or away from the external environment.

A display 11.1.3.2.1-140 can transmit light from a physical environment (e.g., as captured by a camera) for viewing by the user. Such a display 11.1.3.2.1-140 can include optical properties, such as lenses for vision correction based on incoming light from the physical environment. Additionally or alternatively, a display 11.1.3.2.1-140 can provide information as a display within a field of view of the user. Such information can be provided to the exclusion of a view of a physical environment or in addition to (e.g., overlaid with) a physical environment.

The head-mountable device 11.1.3.2.1-100 can include one or more sensors 11.1.3.2.1-70. The sensors 11.1.3.2.1-70 can be mounted to the frame 11.1.3.2.1-110 in a secure manner, as described further herein. Any number and type of sensors can be provided. For example, one or more of the sensors 11.1.3.2.1-70 can be or include an inertial measurement unit ("IMU") that provides information regarding a characteristic of the head-mountable device 11.1.3.2.1-100, such as inertial angles thereof. For example, the IMU can include a six-degrees of freedom IMU that calculates the position, velocity, and/or acceleration of the head-mountable device 11.1.3.2.1-100 based on six degrees of freedom (x, y, z, $\theta_x$, $\theta_y$, and $\theta_z$). The IMU can include one or more of an accelerometer, a gyroscope, and/or a magnetometer. Additionally or alternatively, the sensors 11.1.3.2.1-70 can detect motion characteristics of the head-mountable device 11.1.3.2.1-100 with one or more other motion sensors, such as an accelerometer, a gyroscope, a global positioning sensor, a tilt sensor, and so on for detecting movement and acceleration of the head-mountable device 11.1.3.2.1-100. The sensors 11.1.3.2.1-70 can provide data to a controller for processing. Such data can influence other operations of the head-mountable device 11.1.3.2.1-100, such as the information provided on the display 11.1.3.2.1-140.

It will be understood that the sensors 11.1.3.2.1-70 (e.g., IMUs) and associated assemblies can be coupled to and/or integrated with one or more other components of the head-mountable device 11.1.3.2.1-100. For example, one or more sensors 11.1.3.2.1-70 can be coupled to components that move relative to the frame 11.1.3.2.1-110 or other components of the head-mountable device 11.1.3.2.1-100. By further example, one or more sensors 11.1.3.2.1-70 can be coupled to one or more displays 11.1.3.2.1-140, the frame 11.1.3.2.1-110, and/or other components 11.1.3.2.1-160 of the head-mountable device 11.1.3.2.1-100 (e.g., controllers, input/output devices, and the like). Accordingly, by operating multiple sensors 11.1.3.2.1-70, the absolute and/or relative position and/or orientation of each of the associated components can be determined. For example, one or more (e.g., a pair of) displays 11.1.3.2.1-140 can move relative to each other and/or the frame 11.1.3.2.1-110 to be aligned with the eyes of the user, and sensors 11.1.3.2.1-70 coupled to each of the displays 11.1.3.2.1-140 can track such movement. By further example, the sensors 11.1.3.2.1-70 of separate head-mountable devices 11.1.3.2.1-100 (e.g., worn by different users) can share information so that each of the head-mountable devices 11.1.3.2.1-100 can determine the absolute and/or relative position and/or orientation of the other and optionally output corresponding information (e.g., visual information via displays 11.1.3.2.1-140) so the users can perceive each other's presence, for example in a shared CGR environment.

Solid state motion sensors, such as IMUs, can be affected by strain, temperature, and humidity. Over time, exposure to these influences can result in a wider and less predictable operating range over the life of the IMU. For example, devices relying on absolute measurement of orientation and/or acceleration using MEMS IMUs may require bounded changes in bias, axis orthogonality, and cross-axis sensitivity. Typically, these sensors are surface mounted on a rigid PCB and care is taken to choose PCB locations that minimize strain and temperature shift. However, for some more demanding applications this is not sufficient to extract all performance from the sensor.

Referring now to FIGS. 11.1.3.2.1-2-11.1.3.2.1-4, a sensor assembly can be provided to securely support one or more sensors of a head-mountable device while simultaneously protecting the sensors from exposure to an external environment as well as forces applied to the assembly. It will be understood that the assembly described herein can be one of multiple assemblies and can include one or more other components of the head-mountable device. It will be further understood that a sensor assembly can be integrated into the head-mountable device and/or provided as a module thereto.

As shown in FIG. 11.1.3.2.1-2, a sensor assembly 11.1.3.2.1-10 can include a sensor 11.1.3.2.1-70 (e.g., IMU) housed within a protective case. A top case 11.1.3.2.1-20 of the sensor assembly 11.1.3.2.1-10 can be securely coupled to the bottom plate 11.1.3.2.1-112 or another component of the head-mountable device. For example, the bottom plate 11.1.3.2.1-112 can be part of, integrated with, and/or coupled to a frame and/or another component of the head-mountable device.

The sensor 11.1.3.2.1-70 can be coupled to a flex circuit 11.1.3.2.1-60. For example, the sensor 11.1.3.2.1-70 can be directly mounted to a surface of the flex circuit 11.1.3.2.1-60. Additionally or alternatively, the sensor 11.1.3.2.1-70 can be mounted to board that is directly or indirectly coupled to the flex circuit 11.1.3.2.1-60. The flex circuit 11.1.3.2.1-60 can, in turn, directly or indirectly couple the sensor 11.1.3.2.1-70 and/or the board to other components of the sensor assembly 11.1.3.2.1-10, such as the top case 11.1.3.2.1-20 and/or the bottom plate 11.1.3.2.1-112.

The sensor 11.1.3.2.1-70 can be implemented as an integrated circuit, such as one or more of an industry standard integrated circuit, an application-specific integrated circuit (ASIC), an application-specific standard product (ASSP), and the like. The sensor 11.1.3.2.1-70 can have a size and shape that is accommodated by the housing structure of the assembly and provides the desired performance characteristics. For example, the sensor 11.1.3.2.1-70 can be integrated with a wafer and/or board.

The one or more sensors 11.1.3.2.1-70 of the sensor assembly 11.1.3.2.1-10 can be mounted to the flex circuit 11.1.3.2.1-60 that operably connects the sensors 11.1.3.2.1-70 of the sensor assembly 11.1.3.2.1-10 to each other and/or other components. As used herein, "flexible circuit" or "flex circuit" is a structure that includes a conductive layer, an insulation layer, and optionally a substrate layer. A flex circuit can be provided in electrical communication with at least one electrode, terminal, and/or connector. A flex circuit forms circuitry that includes a pattern of conductors of the conductive layer typically in the form of pads, which are typically formed on a surface of an insulating material of the insulation layer. Such circuitry is typically metallic, such as of a copper or copper alloy. In general, a flex circuit is thin, having a total thickness of from about 1 mm to about 30 mm. A flex circuit is generally flexible, such that it can conform to contours of other components. A flex circuit may be any suitable size and constructed in any suitable shape. For example, the size of a flex circuit may be determined by the power requirements of the components connected thereto, the conductivity of the flex circuit, the distance between operably connected components, or any other suitable criteria. It will be understood that, additionally or alternatively, a cable or other conductive material surrounded by an insulating layer can be provided. Such a cable can be connected via a connector and/or a hot bar and/or wire bond to one or more boards and/or other electronic components.

Providing operable connections to and from the sensors 11.1.3.2.1-70 via a flex circuit 11.1.3.2.1-60 can facilitate such connections while occupying little space within the head-mountable device. Additionally, a flex circuit 11.1.3.2.1-60 can conform and bend around other components of the head-mountable device. These features can help the head-mountable device maintain a low weight and small size.

The flex circuit 11.1.3.2.1-60 can include multiple segments that have different characteristics. For example, a first segment 11.1.3.2.1-62 of the flex circuit 11.1.3.2.1-60 can support the sensor 11.1.3.2.1-70. The first segment 11.1.3.2.1-62 can defined a terminal and portion of the flex circuit 11.1.3.2.1-60 for residing within the enclosure of the sensor assembly 11.1.3.2.1-10. The flex circuit 11.1.3.2.1-60 can further include a second segment 11.1.3.2.1-64 that extends from the first segment 11.1.3.2.1-62 and/or within the enclosure. The second segment 11.1.3.2.1-64 can provide strain relief features, such as a shape and/or size that promotes flexibility, bending, and/or stretching. For example, as shown in FIG. 11.1.3.2.1-2, the second segment 11.1.3.2.1-64 can include an S-curve, a serpentine shape, an undulating shape, and/or another non-linear shape. With such a shape, the second segment 11.1.3.2.1-64 can easily alter it shape upon application of tension and/or other forces along the length of the flex circuit 11.1.3.2.1-60. For example, tension and/or other forces applied at a third segment 11.1.3.2.1-66 of the flex circuit 11.1.3.2.1-60 that is away from the sensor 11.1.3.2.1-70 (e.g., within or outside the enclosure) can be absorbed by adjustments along the second segment 11.1.3.2.1-64, such that such tension and/or other forces are not transmitted to the sensor 11.1.3.2.1-70. Such adjustments can include an adjustment to the effective length of the second segment 11.1.3.2.1-64 (e.g., between the first segment 11.1.3.2.1-62 and the third segment 11.1.3.2.1-66), adjustments to the curvature along the second segment 11.1.3.2.1-64, and the like. By further example, the second segment 11.1.3.2.1-64 can alter its shape along and/or about one or more axes extending through the second segment 11.1.3.2.1-64. As such, the sensor 11.1.3.2.1-70 can maintain a consistent position and/or orientation despite the application of external forces.

A base plate 11.1.3.2.1-80 can provide support to the sensor 11.1.3.2.1-70 and the flex circuit 11.1.3.2.1-60. For example, the base plate 11.1.3.2.1-80 can be disposed adjacent to the sensor 11.1.3.2.1-70 on a side of the flex circuit 11.1.3.2.1-60 that is opposite the sensor 11.1.3.2.1-70. Additionally or alternatively, the flex circuit 11.1.3.2.1-60 can be or include a circuit board that provides a rigid substrate with electrical connections between components and/or to other components. Where the flex circuit 11.1.3.2.1-60 includes or forms a rigid circuit board, the base plate 11.1.3.2.1-80 can optionally be omitted.

The sensor assembly 11.1.3.2.1-10 can further include a mounting adhesive 11.1.3.2.1-50 disposed between the base plate 11.1.3.2.1-80 and the bottom plate 11.1.3.2.1-112. The mounting adhesive 11.1.3.2.1-50 can bond opposing surfaces of the base plate 11.1.3.2.1-80 and the bottom plate 11.1.3.2.1-112 to each other. The mounting adhesive 11.1.3.2.1-50 can have a coefficient of thermal expansion that is complementary to the coefficients of thermal expansion of the base plate 11.1.3.2.1-80 and/or the bottom plate 11.1.3.2.1-112 to minimize strain on the sensor 11.1.3.2.1-70. As used herein, a coefficient of thermal expansion can refer to either a linear coefficient of thermal expansion and/or a volumetric coefficient of thermal expansion. As used herein, any two coefficients of thermal expansion are "complementary" when one is within +20%, +15%, +10%, +9%, +8%, +7%, +6%, +5%, +4%, +3%, +2%, or #1% of the other, inclusive of any intermediate value there between. For example, the mounting adhesive 11.1.3.2.1-50 can have a coefficient of thermal expansion that is within +10%, +9%, +8%, +7%, +6%, +5%, +4%, +3%, +2%, or +1% of the coefficient of thermal expansion of the base plate 11.1.3.2.1-80 and/or the bottom plate 11.1.3.2.1-112.

The top case 11.1.3.2.1-20 defines an opening 11.1.3.2.1-28 to permit electrical communication with the sensor 11.1.3.2.1-70, for example, at a side portion 11.1.3.2.1-22 of the top case 11.1.3.2.1-20. For example, the flex circuit 11.1.3.2.1-60 (e.g., at the third segment 11.1.3.2.1-66 thereof) can extend through the opening 11.1.3.2.1-28, so that a connector 11.1.3.2.1-68 at a terminal end of the flex circuit 11.1.3.2.1-60 (e.g., at an end opposite the sensor 11.1.3.2.1-70 and the first segment 11.1.3.2.1-62) can connect to another component. The connector 11.1.3.2.1-68 coupled to the flex circuit 11.1.3.2.1-60 can be in electrical or other operably communication with the sensor 11.1.3.2.1-70. As such, the connector 11.1.3.2.1-68 can operably connect the sensor 11.1.3.2.1-70 to another component, such as a controller of the head-mountable device.

The sensor assembly 11.1.3.2.1-10 further includes a sealing member 11.1.3.2.1-52 disposed within the opening 11.1.3.2.1-28 to seal the enclosure from an external environment and permit electrical communication with the sensor 11.1.3.2.1-70 along the flex circuit 11.1.3.2.1-60. For example, the sealing member 11.1.3.2.1-52 can entirely surround a portion of the flex circuit 11.1.3.2.1-60 (e.g., along the third segment 11.1.3.2.1-66). The flex circuit 11.1.3.2.1-60 can extend entirely through the sealing member 11.1.3.2.1-52 to extend to either side thereof, such as to the interior and exterior of the enclosure. The sealing member 11.1.3.2.1-52 can include an adhesive, silicone, and/or other sealing member. The sealing member 11.1.3.2.1-52 can be provided as a liquid that solidifies (e.g., cures) during assembly.

As shown in FIG. 11.1.3.2.1-3, the sensor assembly 11.1.3.2.1-10 can form an enclosure 11.1.3.2.1-12 to house the sensor 11.1.3.2.1-70 (e.g., IMU). For example, the top case 11.1.3.2.1-20, the bottom plate 11.1.3.2.1-112, and the sealing member 11.1.3.2.1-52 can form a sealed enclosure 11.1.3.2.1-12 that surrounds a sealed volume. The sensor 11.1.3.2.1-70, the base plate 11.1.3.2.1-80, and a portion of the flex circuit 11.1.3.2.1-60 can be contained within the sealed volume.

To form the enclosure 11.1.3.2.1-12, the top case 11.1.3.2.1-20 can be coupled to the bottom plate 11.1.3.2.1-112 in a sealing manner. For example, the top case 11.1.3.2.1-20 can be welded (e.g., laser welded) to the bottom plate 11.1.3.2.1-112. Other types of couplings are contemplated, such as bonding, adhesion, and the like. The coupling can maintain the opening 11.1.3.2.1-28, for example at a side portion 11.1.3.2.1-22 of the top case 11.1.3.2.1-20.

The flex circuit 11.1.3.2.1-60, including the connector 11.1.3.2.1-68, can be provided through the opening 11.1.3.2.1-28. The sealing member 11.1.3.2.1-52 can be formed about a portion of the flex circuit 11.1.3.2.1-60 that extends through the opening 11.1.3.2.1-28. The sealing member 11.1.3.2.1-52 can extend from the top case 11.1.3.2.1-20 to the bottom plate 11.1.3.2.1-112. As such, the sealing member 11.1.3.2.1-52 can fill the only opening 11.1.3.2.1-28 that provides fluid communication between the interior of the enclosure 11.1.3.2.1-12 and an external environment (e.g., exterior to the enclosure 11.1.3.2.1-12).

As further shown in FIG. 11.1.3.2.1-3, the opening 11.1.3.2.1-28 can be defined on a side portion 11.1.3.2.1-22 of the top case 11.1.3.2.1-20. It will be understood that the opening 11.1.3.2.1-28 can be provided at any portion of the top case 11.1.3.2.1-20, as described further herein. Regardless of its location, the opening 11.1.3.2.1-28 can be filled with the sealing member 11.1.3.2.1-52 and around the flex circuit 11.1.3.2.1-60.

By coupling the top case 11.1.3.2.1-20 to the bottom plate 11.1.3.2.1-112 and by filling the opening 11.1.3.2.1-28 with the sealing member 11.1.3.2.1-52, the enclosure 11.1.3.2.1-12 can provide a sealed volume for the sensor 11.1.3.2.1-70. As used herein, and enclosure, volume, or other space that is "sealed" is at least partially and/or selectively isolated from an external environment. For example, the top case 11.1.3.2.1-20 and the bottom plate 11.1.3.2.1-112 can be impermeable, such that they form a barrier against ingress and/or egress of matter there through. The sealing member 11.1.3.2.1-52 can also form a barrier. It will be understood that one or more barriers can be selectively permeable while still maintaining a sealed volume and/or enclosure. For example, the sealing member 11.1.3.2.1-52 can be permeable to one or more gases and/or substances on an atomic level. However, the sealing member 11.1.3.2.1-52 can be impermeable to (e.g., preventing ingress or egress of) molecules, compounds, and/or liquids. In some embodiments, the enclosure can be hermetically or "airtight" sealed, however other seals are contemplated.

As shown in FIG. 11.1.3.2.1-4, the connector 11.1.3.2.1-68 can extend through other portions of the top case 11.1.3.2.1-20, such as an upper portion 11.1.3.2.1-24 of the top case 11.1.3.2.1-20. The upper portion 11.1.3.2.1-24 can be a portion of the top case that is opposite the bottom plate 11.1.3.2.1-112. One or more openings 11.1.3.2.1-28 can be defined on the upper portion 11.1.3.2.1-24 of the top case 11.1.3.2.1-20, and corresponding connectors 11.1.3.2.1-68 can extend through the openings 11.1.3.2.1-28. Outside of the enclosure 11.1.3.2.1-12, a mating connector 11.1.3.2.1-90 can be operably coupled to the connectors 11.1.3.2.1-68. For example, the interface between the mating connector 11.1.3.2.1-90 and the connector(s) 11.1.3.2.1-68 can include one or more electrodes, contact plates, wires, pogo pins, and the like.

Where the connectors 11.1.3.2.1-68 extend through the opening 11.1.3.2.1-28, one or more sealing members 11.1.3.2.1-52 can be formed to fill the openings 11.1.3.2.1-28 and surround corresponding portions of the connectors 11.1.3.2.1-68. Where the openings are formed in the upper portion 11.1.3.2.1-24 of the top case 11.1.3.2.1-20, the sealing members 11.1.3.2.1-52 need not engage the bottom plate 11.1.3.2.1-112. As such, the top case 11.1.3.2.1-20 and the bottom plate 11.1.3.2.1-112 can be coupled with a continuous seal, such as a weld.

It will be understood that the opening(s) 11.1.3.2.1-28 can be provided at any portion of the top case 11.1.3.2.1-20 and/or the bottom plate 11.1.3.2.1-112. Regardless of its location, the opening 11.1.3.2.1-28 can be filled with the sealing member 11.1.3.2.1-52 and around the flex circuit 11.1.3.2.1-60 and/or connector(s) 11.1.3.2.1-68.

Sensor assemblies of the present disclosure can provide predictable performance over the life of the head-mountable device by isolating the sensor from strain and humidity changes. This can enables absolute orientation measurements between multiple sensors over the life of the head-mountable device, without requiring repeated calibration. By providing each sensor (e.g., IMU) in a consistent position and orientation, any one or multiple sensors can be dedicated as a reference sensor for the entire head-mountable device.

Referring now to FIG. 11.1.3.2.1-5, components of the head-mountable device can be operably connected to provide the performance described herein. FIG. 11.1.3.2.1-5 shows a simplified block diagram of an illustrative head-mountable device 11.1.3.2.1-100 in accordance with one embodiment of the invention. It will be appreciated that components described herein can be provided on either or both of a frame and/or a head engager of the head-mountable device 11.1.3.2.1-100. It will be understood that additional components, different components, or fewer components than those illustrated may be utilized within the scope of the subject disclosure.

As shown in FIG. 11.1.3.2.1-5, the head-mountable device 11.1.3.2.1-100 can include a controller 11.1.3.2.1-180 (e.g., control circuitry) with one or more processing units that include or are configured to access a memory 11.1.3.2.1-182 having instructions stored thereon. The instructions or computer programs may be configured to perform one or more of the operations or functions described with respect to the head-mountable device 11.1.3.2.1-100. The controller 11.1.3.2.1-180 can be implemented as any electronic device capable of processing, receiving, or transmitting data or instructions. For example, the controller 11.1.3.2.1-180 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

The memory 11.1.3.2.1-182 can store electronic data that can be used by the head-mountable device 11.1.3.2.1-100. The memory 11.1.3.2.1-182 can include the memory of the flex circuit 11.1.3.2.1-170 described herein. For example, the memory 11.1.3.2.1-182 can store electrical data or content such as, for example, audio and video files, documents and applications, device settings and user preferences, timing and control signals or data for the various modules, data structures or databases, and so on. The memory 11.1.3.2.1-182 can be configured as any type of memory. By way of example only, the memory 11.1.3.2.1-182 can be implemented as random access memory, read-only memory, Flash memory, removable memory, or other types of storage elements, or combinations of such devices.

The head-mountable device 11.1.3.2.1-100 can further include a display 11.1.3.2.1-140 for displaying visual information for a user. The display 11.1.3.2.1-140 can provide visual (e.g., image or video) output. The display 11.1.3.2.1-140 can be or include an opaque, transparent, and/or translucent display. The display 11.1.3.2.1-140 may have a transparent or translucent medium through which light representative of images is directed to a user's eyes. The display 11.1.3.2.1-140 may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface. The head-mountable device 11.1.3.2.1-100 can include an optical subassembly configured to help optically adjust and correctly project the image-based content being displayed by the display 11.1.3.2.1-140 for close up viewing. The optical subassembly can include one or more lenses, mirrors, or other optical devices.

The head-mountable device 11.1.3.2.1-100 can include one or more sensors 11.1.3.2.1-70, such as the sensors of a sensor assembly, as described herein. The head-mountable device 11.1.3.2.1-100 can include one or more other sensors, including sensors of a sealed enclosure assembly and/or other sensors. Such sensors can be configured to sense substantially any type of characteristic such as, but not limited to, images, pressure, light, touch, force, temperature, position, motion, and so on. For example, the sensor can be a photodetector, a temperature sensor, a light or optical sensor, an atmospheric pressure sensor, a humidity sensor, a magnet, a gyroscope, an accelerometer, a chemical sensor, an ozone sensor, a particulate count sensor, and so on. By further example, the sensor can be a bio-sensor for tracking biometric characteristics, such as health and activity metrics. Other user sensors can perform facial feature detection, facial movement detection, facial recognition, eye tracking, user mood detection, user emotion detection, voice detection, etc. Sensors can include a camera which can capture image based content of the outside world.

The head-mountable device 11.1.3.2.1-100 can include an input/output component 11.1.3.2.1-186, which can include any suitable component for connecting head-mountable device 11.1.3.2.1-100 to other devices. Suitable components can include, for example, audio/video jacks, data connectors, or any additional or alternative input/output components. The input/output component 11.1.3.2.1-186 can include buttons, keys, or another feature that can act as a keyboard for operation by the user.

The head-mountable device 11.1.3.2.1-100 can include the microphone 11.1.3.2.1-188 as described herein. The microphone 11.1.3.2.1-188 can be operably connected to the controller 11.1.3.2.1-180 for detection of sound levels and communication of detections for further processing, as described further herein.

The head-mountable device 11.1.3.2.1-100 can include the speakers 11.1.3.2.1-190 as described herein. The speakers 11.1.3.2.1-190 can be operably connected to the controller 11.1.3.2.1-180 for control of speaker output, including sound levels, as described further herein.

The head-mountable device 11.1.3.2.1-100 can include communications circuitry 11.1.3.2.1-192 for communicating with one or more servers or other devices using any suitable communications protocol. For example, communications circuitry 11.1.3.2.1-192 can support Wi-Fi (e.g., a 802.11 protocol), Ethernet, Bluetooth, high frequency systems (e.g., 900 MHz, 2.4 GHz, and 5.6 GHz communication systems), infrared, TCP/IP (e.g., any of the protocols used in each of the TCP/IP layers), HTTP, BitTorrent, FTP, RTP, RTSP, SSH, any other communications protocol, or any combination thereof. Communications circuitry 11.1.3.2.1-192 can also include an antenna for transmitting and receiving electromagnetic signals.

The head-mountable device 11.1.3.2.1-100 can include a battery, which can charge and/or power components of the head-mountable device 11.1.3.2.1-100. The battery can also charge and/or power components connected to the head-mountable device 11.1.3.2.1-100.

While various embodiments and aspects of the present disclosure are illustrated with respect to a head-mountable device, it will be appreciated that the subject technology can encompass and be applied to other devices. For example, a sensor assembly in accordance with embodiments disclosed herein can be included with an electronic device that is moved while in use. Such an electronic device can be or include a desktop computing device, a laptop-computing device, a display, a television, a portable device, a phone, a tablet computing device, a mobile computing device, a wearable device, a watch, and/or a digital media player.

Accordingly, embodiments of the present disclosure provide a head-mountable device that securely supports sensors in a manner that maintains their positions and orientations over time and avoids applying excessive strain on the sensors, thereby protecting them from harm. Accordingly, the sensor assemblies described herein facilitate effective performance of sensors mounted therein. The sensor assemblies provides high robustness during the entirety of the service life of the head-mountable device without placing strain on the sensors themselves. The seal of the enclosure can isolate the sensor from external influences by preventing ingress of elements through the case and plate. The sensor assemblies further enable the mounting of sensors on a flex circuit, where desired.

Various examples of aspects of the disclosure are described below as clauses for convenience. These are provided as examples, and do not limit the subject technology.

Clause A: a sensor assembly for a head-mountable device, the sensor assembly comprising: a flex circuit; an inertial measurement unit coupled to the flex circuit; a base plate disposed adjacent to the inertial measurement unit on a side of the flex circuit that is opposite the inertial measurement unit; and an enclosure disposed around the inertial measurement unit, the base plate, and a portion of the flex circuit, wherein the enclosure comprises: a top case; and a bottom plate coupled to the top case, wherein the bottom plate and the top case are positioned to define a sealed volume containing the inertial measurement unit, the base plate, and the portion of the flex circuit.

Clause B: a sensor assembly for a head-mountable device, the sensor assembly comprising: a flex circuit; an inertial measurement unit coupled to the flex circuit; an enclosure disposed around the inertial measurement unit and a first portion of the flex circuit, wherein the enclosure defines an opening, wherein a second portion of the flex circuit extends through the opening to permit electrical communication with the inertial measurement unit; and a sealing member disposed within the opening and around the second portion of the flex circuit to seal the enclosure from an external environment.

Clause C: a sensor assembly for a head-mountable device, the sensor assembly comprising: a flex circuit; an inertial measurement unit coupled to the flex circuit; a connector in electrical communication with the inertial measurement unit and coupled to the flex circuit; an enclosure disposed around the inertial measurement unit and the flex circuit, wherein the enclosure defines an opening, wherein the connector extends through the opening to permit electrical communication with the inertial measurement unit; and a sealing member disposed within the opening and around the connector to seal the enclosure from an external environment.

One or more of the above clauses can include one or more of the features described below. It is noted that any of the following clauses may be combined in any combination with each other, and placed into a respective independent clause, e.g., clause A, B, or C.

Clause 1: the inertial measurement unit comprises an accelerometer, a gyroscope, or a magnetometer.

Clause 2: the top case defines an opening to permit electrical communication with the inertial measurement unit.

Clause 3: the flex circuit extends through the opening in the top case.

Clause 4: a connector coupled to the flex circuit and in electrical communication with the inertial measurement unit, wherein the connector extends through the opening in the top case.

Clause 5: the opening is defined on a side portion of the top case.

Clause 6: the opening is defined on an upper portion of the top case.

Clause 7: a sealing member disposed within the opening to seal the enclosure from an external environment and permit electrical communication with the inertial measurement unit.

Clause 8: the sealing member comprises a sealing adhesive or silicone.

Clause 9: a mounting adhesive disposed between the base plate and the bottom plate, wherein the mounting adhesive has a coefficient of thermal expansion that is complementary to a coefficient of thermal expansion of the top case and the bottom plate to minimize strain on the inertial measurement unit.

Clause 10: the inertial measurement unit is mounted to the flex circuit extending entirely through the enclosure.

Clause 11: the first portion of the flex circuit within the enclosure defines an S-curve portion.

Clause 12: the connector comprises a plurality of pins extending through the sealing member.

11.1.3.2.2: Electronic Devices with Movable Optical Assemblies

The optical assemblies may have gaze trackers. The gaze trackers may be used to make interpupillary distance measurements and eye relief measurements. Adjustments to the positions of the optical assemblies may be made by the motors based on the interpupillary distance measurements and eye relief measurements. For example, no position adjustments may be made unless a measured eye relief measurement exceeds an eye relief threshold and the measured interpupillary distance is lower than an interpupillary distance threshold. If the measured eye relief measurement is sufficiently large and the measured interpupillary distance is sufficiently small, adjustments to the positions of the optical assemblies may be made in which, for a given measured eye relief, a smaller measured interpupillary distance results in a larger adjustment to an optical assembly position than a larger measured interpupillary distance.

FIG. 11.1.3.2.2-1 is a schematic diagram of an illustrative electronic device of the type that may include movable components. Device 11.1.3.2.2-10 of FIG. 11.1.3.2.2-1 may be a head-mounted device (e.g., goggles, glasses, a helmet, and/or other head-mounted device), a cellular telephone, a tablet computer, a laptop computer, a wristwatch, a peripheral device (sometimes referred to as a peripheral) such as a pair of headphones, or other electronic equipment. In an illustrative configuration, device 11.1.3.2.2-10 is a head-mounted device such as a pair of goggles (sometimes referred to as virtual reality goggles, mixed reality goggles, augmented reality glasses, etc.).

As shown in the illustrative top view of device 11.1.3.2.2-10 of FIG. 11.1.3.2.2-1, device 11.1.3.2.2-10 may have a housing such as housing 11.1.3.2.2-12 (sometimes referred to as a head-mounted support structure or head-mounted support). Housing 11.1.3.2.2-12 may include a main portion such as portion 11.1.3.2.2-12M (sometimes referred to as a main unit or head-mounted unit) and other head-mounted support structures such as head strap 11.1.3.2.2-12T. When housing 11.1.3.2.2-12 is being worn on the head of a user, the front of housing 11.1.3.2.2-12 may face outwardly away from the user, the rear of housing 11.1.3.2.2-12 may face towards the user, and the user's eyes may be located in eye boxes 11.1.3.2.2-36.

Device 11.1.3.2.2-10 may have electrical and optical components that are used in displaying images to eye boxes 11.1.3.2.2-36 when device 11.1.3.2.2-10 is being worn. These components may include left and right optical assemblies 11.1.3.2.2-20 (sometimes referred to as optical modules). Each optical assembly 11.1.3.2.2-20 may have an optical assembly support 11.1.3.2.2-38 (sometimes referred to as a lens barrel or optical module support) and guide rails 11.1.3.2.2-22 along which optical assemblies 11.1.3.2.2-20 may slide to adjust optical-assembly-to-optical-assembly separation to accommodate different user interpupillary distances.

Each assembly 11.1.3.2.2-20 may have a display 11.1.3.2.2-32 that has an array of pixels for displaying images and a lens 11.1.3.2.2-34. Display 11.1.3.2.2-32 and lens 11.1.3.2.2-34 of each assembly 11.1.3.2.2-20 may be coupled to and supported by support 11.1.3.2.2-38. During operation, images displayed by displays 11.1.3.2.2-32 may be presented to eye boxes 11.1.3.2.2-36 through lenses 11.1.3.2.2-34 for viewing by a user. Each optical assembly 11.1.3.2.2-20 may also have a gaze tracker 11.1.3.2.2-50. Gaze trackers 11.1.3.2.2-50 may each include one or more light sources (e.g., infrared light-emitting diodes that provide flood illumination and glints for eye tracking) and an associated camera (e.g., an infrared camera). Using gaze trackers 11.1.3.2.2-50, which may sometimes be referred to as gaze tracking systems or gaze tracking sensors, device 11.1.3.2.2-10 can gather data on a user's eyes located in eye boxes 11.1.3.2.2-36. As an example, the direction in which a user's eyes are pointing (sometimes referred to as a user's point of gaze or direction of view) may be measured. Biometric information such as iris scan information may also be gathered. In addition, gaze trackers 11.1.3.2.2-50, may be used to measure the location of a user's eyes relative to device 11.1.3.2.2-10 and thereby measure the eye relief of the user's eyes (e.g., the distance between the lenses of device 11.1.3.2.2-10 and the eyes) and the separation between the user's left and right eyes (sometimes referred to as the user's interpupillary distance). If desired, gaze trackers 11.1.3.2.2-50 (e.g., the cameras of trackers 11.1.3.2.2-50) may capture images of the skin of the user's face surrounding the user's eyes (e.g., to measure whether this skin is loose or taut).

Each optical assembly may have magnets, clips, and/or other engagement features to allow removable vision correction lenses (sometimes referred to as prescription lenses) to be removably attached to assemblies 11.1.3.2.2-20 in alignment with lenses 11.1.3.2.2-34 (see, e.g., illustrative optional vision correction lenses 11.1.3.2.2-51). Lenses 11.1.3.2.2-51 may have magnets that are sensed by sensors 11.1.3.2.2-53 (e.g., magnetic sensors in assemblies 11.1.3.2.2-20) or sensors 11.1.3.2.2-53 may be optical sensors, switches, or other sensors configured to gather other information indicating when lenses 11.1.3.2.2-51 are present.

Housing 11.1.3.2.2-12 may have a flexible curtain (sometimes referred to as a flexible rear housing wall or fabric housing wall) such as curtain 11.1.3.2.2-12R on the rear of device 11.1.3.2.2-10 facing eye boxes 11.1.3.2.2-36. Curtain 11.1.3.2.2-12R has openings that receive assemblies 11.1.3.2.2-20. The edges of curtain 11.1.3.2.2-12R that surround each support 11.1.3.2.2-38 may be coupled to that support 11.1.3.2.2-38. The outer peripheral edge of curtain 11.1.3.2.2-12R may be attached to rigid housing walls forming an outer shell portion of main housing 11.1.3.2.2-12M.

The walls of housing 11.1.3.2.2-12 may separate interior region 11.1.3.2.2-28 within device 11.1.3.2.2-10 from exterior region 11.1.3.2.2-30 surrounding device 11.1.3.2.2-10.

Inner ends 11.1.3.2.2-24 of guide rails 11.1.3.2.2-22 may be attached to central housing portion 11.1.3.2.2-12C. Opposing outer ends 11.1.3.2.2-26 may, in an illustrative configuration, be unsupported (e.g., the outer end portions of rails 11.1.3.2.2-22 may not directly contact housing 11.1.3.2.2-12, so that these ends float in interior region 11.1.3.2.2-28 with respect to housing 11.1.3.2.2-12).

Device 11.1.3.2.2-10 may include control circuitry and other components such as component 11.1.3.2.2-40. The control circuitry may include storage, processing circuitry formed from one or more microprocessors and/or other circuits. To support communications between device 11.1.3.2.2-10 and external equipment, the control circuitry may include wireless communications circuitry. Components 11.1.3.2.2-40 may include sensors such as such as force sensors (e.g., strain gauges, capacitive force sensors, resistive force sensors, etc.), audio sensors such as microphones, touch and/or proximity sensors such as capacitive sensors, optical sensors such as optical sensors that emit and detect light, ultrasonic sensors, and/or other touch sensors and/or proximity sensors, monochromatic and color ambient light sensors, image sensors, sensors for detecting position, orientation, and/or motion (e.g., accelerometers, magnetic sensors such as compass sensors, gyroscopes, and/or sensors such as inertial measurement units that contain some or all of these sensors), radio-frequency sensors, depth sensors (e.g., structured light sensors and/or depth sensors based on stereo imaging devices), optical sensors such as self-mixing sensors and light detection and ranging (LIDAR) sensors that gather time-of-flight measurements, humidity sensors, moisture sensors, visual inertial odometry sensors, gaze tracking sensors, and/or other sensors. In some arrangements, devices 11.1.3.2.2-10 may use sensors to gather user input (e.g., button press input, touch input, etc.). Sensors may also be used in gathering environmental motion (e.g., device motion measurements, temperature measurements, ambient light readings, etc.) and/or may be used in measuring user activities and/or attributes (e.g., point-of-gaze, eye relief, interpupillary distance, etc.). If desired, position sensors such as encoders (e.g., optical encoders, magnetic encoders, etc.) may measure the position and therefore the movement (e.g., the velocity, acceleration, etc.) of optical assemblies 11.1.3.2.2-20 along rails 11.1.3.2.2-22.

FIG. 11.1.3.2.2-2 is a rear view of an illustrative portion of device 11.1.3.2.2-10 (e.g., an inside left portion). Device 11.1.3.2.2-10 may have left and right actuators (e.g., motors) such as motor 11.1.3.2.2-48 that are used to rotate an elongated threaded shaft such as screw 11.1.3.2.2-44. Nut 11.1.3.2.2-46 has threads that engage the threads on screw 11.1.3.2.2-44. As the motor 11.1.3.2.2-48 on each side of device 11.1.3.2.2-10 is turned, a corresponding nut 11.1.3.2.2-46 is driven in the +X or −X direction (in accordance with whether screw 11.1.3.2.2-44 is being rotated clockwise or counterclockwise). In turn, this moves the optical assembly 11.1.3.2.2-20 on that side of device 11.1.3.2.2-10 in the +X or −X direction along its optical assembly guide rail 11.1.3.2.2-22. If desired, the left and right motors 11.1.3.2.2-48 may be adjusted independently, so that optical assemblies 11.1.3.2.2-20 on the left and right of device 11.1.3.2.2-10 may be moved independently.

Each assembly 11.1.3.2.2-20 (e.g., each support 11.1.3.2.2-38 of FIG. 11.1.3.2.2-1) may have portions that receive a corresponding rail 11.1.3.2.2-22 and that guide that assembly 11.1.3.2.2-20 along that rail 11.1.3.2.2-22. By controlling the activity of motors 11.1.3.2.2-48 in tandem or individually, the spacing between the left and right optical assemblies of device 11.1.3.2.2-10 can be adjusted to accommodate the interpupillary distance of different users. For example, if gaze trackers 11.1.3.2.2-50 determine that a user has closely spaced eyes, assemblies 11.1.3.2.2-20 may be moved inwardly (towards each other) and if a user has widely spaced eyes, assemblies 11.1.3.2.2-20 may be moved outwardly (away from each other). By matching the spacing between optical assemblies 11.1.3.2.2-20 to the measured interpupillary distance of a user, the user may satisfactorily view visual content being presented by the displays of the optical assemblies.

The position and therefore the movement of each optical assembly may be monitored using one or more sensors. In the illustrative configuration of FIG. 11.1.3.2.2-2, motor 11.1.3.2.2-48 (e.g., the motor on the left side of device 11.1.3.2.2-10) and optical module 11.1.3.2.2-20 have been provided with an optical assembly position sensor based on a magnetic encoder. The encoder includes magnetic strip 11.1.3.2.2-54 and magnetic sensor 11.1.3.2.2-52. Magnetic sensor 11.1.3.2.2-52 may be a Hall Effect sensor or other suitable magnetic sensor that is configured to move with optical assembly 11.1.3.2.2-20. Magnetic strip 11.1.3.2.2-54, which may be affixed to housing 11.1.3.2.2-12, has a series of magnet poles (e.g., north and south poles) that extend along the X dimension parallel to guide rail 11.1.3.2.2-22 and parallel to the X-axis position adjustment direction associated with optical assembly 11.1.3.2.2-20. As optical assembly 11.1.3.2.2-20 is moved along guide rail 11.1.3.2.2-22, the magnetic encoder (e.g., sensor 11.1.3.2.2-52) measures the change in magnetic field resulting as magnetic sensor 11.1.3.2.2-52 passes by different magnets in strip 11.1.3.2.2-54. In this way, optical assembly 11.1.3.2.2-20 is provided with a position reference (e.g., by counting north and south magnetic poles in strip 11.1.3.2.2-54). The position measurements made with the position sensor may reveal attributes of the motion of optical assembly 11.1.3.2.2-20 such as the velocity of optical assembly 11.1.3.2.2-20 and, if desired, the acceleration and deceleration of assembly 11.1.3.2.2-20. Accordingly, the magnetic encoder (or other position sensor) associated with each optical assembly 11.1.3.2.2-30 may be used by device 11.1.3.2.2-10 to measure the location of that optical assembly so that the spacing between optical assemblies 11.1.3.2.2-20 can be satisfactorily adjusted (e.g., to help ensure that the spacing between optical assemblies 11.1.3.2.2-20 has been adjusted to match or nearly match the user's interpupillary distance). The position readings from the optical assembly position sensors (e.g., the magnetic encoders) may also be used to determine the velocities of the optical assemblies as they are moved.

Optical assembly velocity information and/or other information from the optical assembly position sensors (e.g., linear position sensors formed from the magnetic encoders) may be used in monitoring whether the optical assemblies have slowed down their movement due to contact between the optical assemblies and the nose of a user. Consider, as an example, the arrangement of FIG. 11.1.3.2.2-3. FIG. 11.1.3.2.2-3 is a rear view of a central nose-bridge portion NB of device 11.1.3.2.2-10. As shown in FIG. 11.1.3.2.2-3, nose bridge portion NB of housing portion 11.1.3.2.2-12C has a nose-shaped recess 11.1.3.2.2-60, which is configured to receive the user's nose (see, e.g., illustrative nose surface 11.1.3.2.2-62). In some situations (e.g., when a user has a wide interpupillary distance), optical assemblies 11.1.3.2.2-20 reside at a non-zero distance G from surface 11.1.3.2.2-62 (sometimes referred to as gap G) after motors 11.1.3.2.2-48 adjusted the positions of assemblies 11.1.3.2.2-20 to match the user's interpupillary distance. In other situations, such as when a user has a large eye relief and small interpupillary distance, motors 11.1.3.2.2-48 may move optical assemblies inward until curtain 11.1.3.2.2-12R (FIG. 11.1.3.2.2-1) and optical assemblies 11.1.3.2.2-20 contact the left and right sides of nose surface 11.1.3.2.2-62.

When optical assemblies 11.1.3.2.2-20 contact the left and right sides of nose surface of 11.1.3.2.2-62, motors 11.1.3.2.2-48 will encounter resistance to further lateral movement of the optical assemblies along the X axis. This will cause optical assemblies 11.1.3.2.2-20 to move more slowly. The optical assembly position sensors will sense the reduction in the velocity of the optical assemblies. In this way, device 11.1.3.2.2-10 is informed that optical assemblies 11.1.3.2.2-20 are contacting and pressing against nose surface 11.1.3.2.2-62. To ensure that device 11.1.3.2.2-10 is comfortable as device 11.1.3.2.2-10 is being worn on the head of the user, the position of the optical assemblies may, in response to this detected nose contact, be adjusted outward, away from nose surface 11.1.3.2.2-62 (e.g., by 1-3 mm or other suitable amount). This outward nudge in the positions of the optical assemblies may be made even if the final separation between the optical assemblies is slightly larger than the user's measured interpupillary distance.

Following outward adjustment of optical assemblies 11.1.3.2.2-20, a non-zero gap G may be created between optical assemblies 11.1.3.2.2-20 and corresponding side portions of the user's nose (e.g., adjacent portions of nose surface 11.1.3.2.2-62) and/or inward pressure imposed on the sides of the user's nose by optical assemblies 11.1.3.2.2-20 can be reduced to enhance comfort. By monitoring the optical assembly position sensors during optical assembly position adjustment with motors 11.1.3.2.2-48, device 11.1.3.2.2-10 can identify a location for assemblies 11.1.3.2.2-20 in which the left and right assemblies 11.1.3.2.2-20 are separated by distance that is matched as closely as possible to the user's measured interpupillary distance while ensuring satisfactory comfort for the user.

Another way in which the position of optical assemblies 11.1.3.2.2-20 can be adjusted satisfactorily involves the use of eye relief measurements from gaze trackers 11.1.3.2.2-50. When device 11.1.3.2.2-10 is placed onto the head of the user, gaze trackers 11.1.3.2.2-50 may measure the user's interpupillary distance and may measure the user's eye relief. Motors 11.1.3.2.2-48 may then adjust the positions of optical assemblies 11.1.3.2.2-20 based on the measured eye relief and measured interpupillary distance of the user. In an illustrative configuration, the positions of optical assemblies 11.1.3.2.2-20 maybe offset (e.g., nudged outwards from the location where the spacing between assemblies 11.1.3.2.2-20 matches the measured interpupillary distance of the user) by an amount that varies depending on both measured interpupillary distance and measured eye relief.

This type of approach is illustrated in the graph of FIG. 11.1.3.2.2-4. In the graph of FIG. 11.1.3.2.2-4, lateral offset AX represents the distance by which an optical assembly is adjusted outwardly (beyond the nominal position in which optical assembly separation matches measured interpupillary distance) to enhance fit. There are three illustrative curves in the graph of FIG. 11.1.3.2.2-4. Curve 11.1.3.2.2-64 corresponds to a measured interpupillary distance IPDA, curve 11.1.3.2.2-66 corresponds to a measured interpupillary distance IPDB, which is larger than interpupillary distance IPDA, and curve 11.1.3.2.2-68 corresponds to a measured interpupillary distance IPDC, which is larger than interpupillary distance IPDA and larger than interpupillary distance IPDB. The values of IPDA, IPDB, and IPDC may be in the range of 52 to 74 mm or any other suitable range. In practice, device 11.1.3.2.2-10 may store a family of curves (e.g., empirically determined curves) for any suitable number of measured interpupillary distances and/or may represent the relationships embodied in curves such as curves 11.1.3.2.2-64, 11.1.3.2.2-66, and 11.1.3.2.2-68 using tables, functions, and/or other data structures.

As the graph of a FIG. 11.1.3.2.2-4 illustrates, if the measured eye relief a user falls below a predetermined threshold (e.g., ERTH in the example of FIG. 11.1.3.2.2-4), the user is unlikely to experience pressure from optical assemblies 11.1.3.2.2-20 on the sides of the user's nose. Accordingly, for measured user eye relief values below eye relief threshold ERTH, optical assemblies 11.1.3.2.2-20 may be separated along the X axis by a distance that matches the measured interpupillary distance of the user (e.g., there is no need to use a non-zero value of AX to adjust the position of optical assemblies 11.1.3.2.2-20 outwardly after they have reached the appropriate spacing to match the user's interpupillary distance). The value of AX is therefore zero for users with measured eye relief values of less than ERTH (which may be, for example, a value between 18 mm and 22 mm or other suitable eye relief threshold value).

If however, the measured eye relief of a user exceeds eye relief threshold ERTH, it may be beneficial for certain users to increase the spacing between optical assemblies 11.1.3.2.2-20 by nudging each optical assembly outwardly by an amount AX. As an example, consider users with measured interpupillary distances of IPDA. For this class of user, it may be beneficial to adjust the spacing of optical assemblies 11.1.3.2.2-20 outwardly by AX values that follow curve 11.1.3.2.2-64. As shown by curve 11.1.3.2.2-64, AX may be zero for measured eye relief values of less than ERTH, whereas for measured eye relief values exceeding ERTH, AX may rise progressively as a function of measured eye relief (e.g., up to a maximum AX value at a maximum measured eye relief value of ERMX, which may be, for example, 25 mm or other suitable value). Users with larger interpupillary distances, such as a measured interpupillary distance of IPDB, may benefit from a less aggressive outward increase in optical assembly spacing, as shown by curve 11.1.3.2.2-66 in which the value of AX rises more slowly as a function of increasing measured eye relief over ERTH than curve 11.1.3.2.2-64.

An interpupillary distance threshold may be present above which it may not be desirable to make any AX adjustments for a user, regardless of their measured eye relief. When, for example, a user has a large measured interpupillary distance (e.g., a measured interpupillary distance of IPDC, which exceeds the interpupillary distance threshold), there will generally not be a comfort benefit in increasing optical assembly spacing. As a result, the recommended outward adjustment in optical assembly position AX as a function of measured eye relief for users with these larger measured interpupillary distances follows curve 11.1.3.2.2-68 (e.g., AX remains at zero, even for a measured eye relief of ERMX). With this approach, only at measured interpupillary distances below the interpupillary distance threshold will outward adjustments in optical assembly position be used.

The graph of FIG. 11.1.3.2.2-4 illustrates how motors 11.1.3.2.2-48 may place optical assemblies 11.1.3.2.2-20 at positions that vary from the measured positions of the user's eyes. In the example of FIG. 11.1.3.2.2-4, measured eye relief and interpupillary distance values were are in determining satisfactory positions for assemblies 11.1.3.2.2-20. In particular, outward adjustments AX in the positions of optical assemblies 11.1.3.2.2-20 were recommended as a function of the interpupillary distance and eye relief values measured for a user with gaze trackers 11.1.3.2.2-50. If desired, additional factors may be taken into consideration in making optical assembly adjustments such as these (e.g., additional factors that may be used in combination with or as an alternative to using interpupillary distance measurements and eye relief measurements) and/or other suitable action may be taken based on data gathered with gaze trackers 11.1.3.2.2-50 and/or other sensors in device 11.1.3.2.2-10.

FIG. 11.1.3.2.2-5 is a flow chart illustrating operations involved in using motors 11.1.3.2.2-48 and other components in device 11.1.3.2.2-10 to make adjustments to device 11.1.3.2.2-10 as a function of data gathered with gaze trackers 11.1.3.2.2-50 and/or other sensors.

During the operations of block 11.1.3.2.2-70, device 11.1.3.2.2-10 may gather data. The gathered data may include, for example, measurements obtained by gaze trackers 11.1.3.2.2-50. These measurements may include, for example, the measured interpupillary distance of a user wearing device 11.1.3.2.2-10, the measured eye relief of a user wearing device 11.1.3.2.2-10, the measured skin tautness around the eyes of a user wearing device 11.1.3.2.2-10, and/or other gaze tracker measurements. The measurements of block 11.1.3.2.2-70 may also include measurements with the position sensors (e.g., the magnetic encoders) of optical assemblies 11.1.3.2.2-20. For example, when a user dons device 11.1.3.2.2-10, motors 11.1.3.2.2-48 may automatically start to move optical assemblies 11.1.3.2.2-20 to positions associated with the user's measured interpupillary distance from gaze trackers 11.1.3.2.2-50. During this initial movement or during movement in response to a user input command or other movement, the position sensors may be used to monitor the velocities of assemblies 11.1.3.2.2-20. In response to detected slowing of the speed of inward movement of assemblies 11.1.3.2.2-20, device 11.1.3.2.2-10 can conclude that assemblies 11.1.3.2.2-20 are beginning to exert pressure on the sides of the user's nose (e.g., nose surface 11.1.3.2.2-62). The locations associated with the measured reduction in optical assembly velocity are another form of measurement data that may be gathered during block 11.1.3.2.2-70.

Further information that can be gathered during the operations of block 11.1.3.2.2-70 relates to the status of vision correction lenses 11.1.3.2.2-51 on device 11.1.3.2.2-10. Vision correction lenses 11.1.3.2.2-51 may contain magnets that produce a magnetic field. Device 11.1.3.2.2-10 (e.g., assemblies 11.1.3.2.2-20) may have vision correction lens sensors such as magnetic sensors 11.1.3.2.2-53 that determine whether or not lenses 11.1.3.2.2-51 are present by monitoring for the presence of the magnetic fields produced by lenses 11.1.3.2.2-51. In response to detection of the magnetic fields from lenses 11.1.3.2.2-51 with sensors 11.1.3.2.2-53, it can be concluded that lenses 11.1.3.2.2-51 are present.

During the operations of block 11.1.3.2.2-72, device 11.1.3.2.2-10 can take action based on the data gathered at block 11.1.3.2.2-70. As an example, the positions of optical assemblies 11.1.3.2.2-20 may be adjusted using motors 11.1.3.2.2-48. In some configurations, the positions of optical assemblies 11.1.3.2.2-20 may be nudged outwards by an amount AX determined from measured interpupillary distance and eye relief values, as described in connection with FIG. 11.1.3.2.2-4. If desired, optical assemblies 11.1.3.2.2-20 may, in some scenarios, be moved inward slightly (e.g., assemblies 11.1.3.2.2-20 may be moved towards each other such that assemblies 11.1.3.2.2-20 are closer than dictated by the measured value of a user's interpupillary distance to increase nasal field-of-view overlap when doing so presents a low risk of optical assembly nose surface contact or when any potential nose contact can be detected with an optical module position sensor or other sensor). To reduce wrinkles in rear curtain 11.1.3.2.2-12R, optical assemblies 11.1.3.2.2-20 may be moved inwards or outwards slightly to tighten curtain 11.1.3.2.2-12R. Optical assembly movement with motors 11.1.3.2.2-48 may also be used to provide a user with an alert (e.g., a haptic alert indicating that an incoming message has been received and/or another condition has been determined to be present). In some arrangements, gaze sensor measurements from trackers 11.1.3.2.2-50 during block 11.1.3.2.2-70 can be used to determine whether the user's skin surrounding the user's eyes is taut. In response to detecting an increase in skin tautness as assemblies 11.1.3.2.2-20 are moved (e.g., as assemblies 11.1.3.2.2-20 are being moved towards each other), it can be concluded that assemblies 11.1.3.2.2-20 are pressing or are about to press on nose surface 11.1.3.2.2-62, so further movement inward of assemblies 11.1.3.2.2-20 can be halted and/or assemblies 11.1.3.2.2-20 may be nudged outwardly to compensate. The positions of optical assemblies 11.1.3.2.2-20 may also be adjusted in response to detection that vision correction lenses 11.1.3.2.2-51 are present or are not present. The presence of lenses 11.1.3.2.2-51 may, as an example, increase or decrease the risk of nose contact by assemblies 11.1.3.2.2-20, so information on the presence of lenses 11.1.3.2.2-51 (and, if desired, the prescription associated with lenses 11.1.3.2.2-51) may be taken into account when using motors 11.1.3.2.2-48 to adjust the position of assemblies 11.1.3.2.2-20. In general, these types of adjustments and/or other suitable actions may be taken during the operations of block 11.1.3.2.2-72 in response to gaze tracker measurement data and/or other data measured during the operations of block 11.1.3.2.2-70.

11.1.3.2.3: Electronic Devices with Movable Optical Assemblies

The force with which the motors move the optical assemblies towards a central nose bridge portion of the device and therefore towards nose surfaces located at the nose bridge portion may be limited. The force may be limited using a clutch such as a magnetic clutch or a physical clutch based on structures that decouple from each other to limit the force. The force may also be limited by monitoring the force and halting the motors in response to detection of a given amount of force. Sensor measurements and electrical motor load measurements may be used in measuring the force. If desired, motor operation may be controlled by a user-operated button. The direction of permitted optical assembly movement when accommodating different interpupillary distances may also be controlled.

FIG. 11.1.3.2.3-1 is a schematic diagram of an illustrative electronic device of the type that may include movable optical assemblies to accommodate different interpupillary distances. Device 11.1.3.2.3-10 of FIG. 11.1.3.2.3-1 may be a head-mounted device (e.g., goggles, glasses, a helmet, and/or other head-mounted device. In an illustrative configuration, device 11.1.3.2.3-10 is a head-mounted device such as a pair of goggles (sometimes referred to as virtual reality goggles, mixed reality goggles, augmented reality glasses, etc.).

As shown in the illustrative cross-sectional top view of device 11.1.3.2.3-10 of FIG. 11.1.3.2.3-1, device 11.1.3.2.3-10 may have a housing such as housing 11.1.3.2.3-12 (sometimes referred to as a head-mounted support structure, head-mounted housing, or head-mounted support). Housing 11.1.3.2.3-12 may include a front portion such as front portion 11.1.3.2.3-12F and a rear portion such as rear portion 11.1.3.2.3-12R. When device 11.1.3.2.3-10 is worn on the head of a user, rear portion 11.1.3.2.3-12R rests against the face of the user and helps block stray light from reaching the eyes of the user and nose bridge portion NB of housing 11.1.3.2.3-12 rests on the nose of the user.

Main portion 11.1.3.2.3-12M of housing 11.1.3.2.3-12 may be attached to head strap 11.1.3.2.3-12T. Head strap 11.1.3.2.3-12T may be used to help mount main portion 11.1.3.2.3-12 on the head and face of a user. Main portion 11.1.3.2.3-12M may have a rigid shell formed from housing walls of polymer, glass, metal, and/or other materials. When housing 11.1.3.2.3-12 is being worn on the head of a user, the front of housing 11.1.3.2.3-12 may face outwardly away from the user, the rear of housing 11.1.3.2.3-12 (and rear portion 11.1.3.2.3-12R) may face towards the user. In this configuration, rear portion 11.1.3.2.3-12R may face the user's eyes located in eye boxes 11.1.3.2.3-36.

Device 11.1.3.2.3-10 may have electrical and optical components that are used in displaying images to eye boxes 11.1.3.2.3-36 when device 11.1.3.2.3-10 is being worn. These components may include left and right optical assemblies 11.1.3.2.3-20 (sometimes referred to as optical modules). Each optical assembly 11.1.3.2.3-20 may have an optical assembly support 11.1.3.2.3-38 (sometimes referred to as a lens barrel, optical module support, or support structure) and guide rails 11.1.3.2.3-22 along which optical assemblies 11.1.3.2.3-20 may slide to adjust optical-assembly-to-optical-assembly separation to accommodate different user interpupillary distances.

Each assembly 11.1.3.2.3-20 may have a display 11.1.3.2.3-32 that has an array of pixels for displaying images and a lens 11.1.3.2.3-34. Lens 11.1.3.2.3-34 may optionally have a removable vision correction lens for correcting user vision defects (e.g., refractive errors such as nearsightedness, farsightedness, and/or astigmatism). In each assembly 11.1.3.2.3-20, display 11.1.3.2.3-32 and lens 11.1.3.2.3-34 may be coupled to and supported by support 11.1.3.2.3-38. During operation, images displayed by displays 11.1.3.2.3-32 may be presented to eye boxes 11.1.3.2.3-36 through lenses 11.1.3.2.3-34 for viewing by the user.

Rear portion 11.1.3.2.3-12R may include flexible structures (e.g., a flexible polymer layer, a flexible fabric layer, etc.) so that portion 11.1.3.2.3-12R can stretch to accommodate movement of supports 11.1.3.2.3-38 toward and away from each other to accommodate different user interpupillary distances.

The walls of housing 11.1.3.2.3-12 may separate interior region 11.1.3.2.3-28 within device 11.1.3.2.3-10 from exterior region 11.1.3.2.3-30 surrounding device 11.1.3.2.3-10. In interior region 11.1.3.2.3-28, optical assemblies 11.1.3.2.3-20 may be mounted on guide rails 11.1.3.2.3-22. Guide rails 11.1.3.2.3-22 may be attached to central housing portion 11.1.3.2.3-12C. If desired, the outer ends of guide rails 11.1.3.2.3-22 may be unsupported (e.g., the outer end portions of rails 11.1.3.2.3-22 may not directly contact housing 11.1.3.2.3-12, so that these ends float in interior region 11.1.3.2.3-28 with respect to housing 11.1.3.2.3-12).

Device 11.1.3.2.3-10 may include control circuitry and other components such as components 11.1.3.2.3-40. The control circuitry may include storage, processing circuitry formed from one or more microprocessors and/or other circuits. To support communications between device 11.1.3.2.3-10 and external equipment, the control circuitry may include wireless communications circuitry. Components 11.1.3.2.3-40 may include sensors such as such as force sensors (e.g., strain gauges, capacitive force sensors, resistive force sensors, etc.), audio sensors such as microphones, touch and/or proximity sensors such as capacitive sensors, optical sensors such as optical sensors that emit and detect light, ultrasonic sensors, and/or other touch sensors and/or proximity sensors, monochromatic and color ambient light sensors, image sensors, sensors for detecting position, orientation, and/or motion (e.g., accelerometers, magnetic sensors such as compass sensors, gyroscopes, and/or sensors such as inertial measurement units that contain some or all of these sensors), radio-frequency sensors, depth sensors (e.g., structured light sensors and/or depth sensors based on stereo imaging devices), optical sensors such as self-mixing sensors and light detection and ranging (LIDAR) sensors that gather time-of-flight measurements, humidity sensors, moisture sensors, visual inertial odometry sensors, current sensors, voltage sensors, and/or other sensors. In some arrangements, devices 11.1.3.2.3-10 may use sensors to gather user input (e.g., button press input, touch input, etc.). Sensors may also be used in gathering environmental motion (e.g., device motion measurements, temperature measurements, ambient light readings, etc.).

Optical assemblies 11.1.3.2.3-20 may have gaze trackers 11.1.3.2.3-62 (sometimes referred to as gaze tracker sensors). Gaze trackers 11.1.3.2.3-62, which may operate through lenses 11.1.3.2.3-34, may include one or more light sources such as infrared light-emitting diodes that emit infrared light to illuminate the eyes of a user in eye boxes 11.1.3.2.3-36. Gaze trackers 11.1.3.2.3-62 also include infrared cameras for capturing images of the user's eyes and measuring reflections (glints) of infrared light from each of the infrared light sources. By processing these eye images, gaze trackers 11.1.3.2.3-62 may track the user's eyes and determine the point-of-gaze of the user. Gaze trackers 11.1.3.2.3-62 may also measure the locations of the user's eyes (e.g., the user's eye relief and the user's interpupillary distance).

To accommodate users with different interpupillary distances (eye-to-eye spacings), the spacing between the left and right optical assemblies 11.1.3.2.3-20 in device 11.1.3.2.3-10 can be adjusted (e.g., to match or nearly match the user's measured interpupillary distance). Device 11.1.3.2.3-10 may have left and right actuators (e.g., motors) such as motors 11.1.3.2.3-48. Each motor 11.1.3.2.3-48 may be used to rotate an elongated threaded shaft (screw) such as shaft 11.1.3.2.3-44. A nut 11.1.3.2.3-46 is provided on each shaft 11.1.3.2.3-44. The nut has threads that engage the threads on that shaft 11.1.3.2.3-44. When a shaft is rotated, the nut on the shaft is driven in the +X or −X direction (in accordance with whether the shaft is being rotated clockwise or counterclockwise). In turn, this moves the optical assembly 11.1.3.2.3-20 that is attached to the nut in the +X or −X direction along its optical assembly guide rail 11.1.3.2.3-22. Each assembly 11.1.3.2.3-20 (e.g., support 11.1.3.2.3-38) may have portions that receive one of guide rails 11.1.3.2.3-22 so that the assembly is guided along the guide rail. By controlling the activity of motors 11.1.3.2.3-48, the spacing between the left and right optical assemblies of device 11.1.3.2.3-10 can be adjusted to accommodate the interpupillary distance of different users. For example, if a user has closely spaced eyes, assemblies 11.1.3.2.3-20 may be moved inwardly (towards each other and towards nose bridge portion NB of housing 11.1.3.2.3-12) and if a user has widely spaced eyes, assemblies 11.1.3.2.3-20 may be moved outwardly (away from each other).

When device 11.1.3.2.3-10 is being worn by a user, the user's head is located in region 11.1.3.2.3-68. The presence of the user's head (and therefore a determination of whether device 11.1.3.2.3-10 is being worn or is unworn) may be made using one or more sensors (e.g., gaze trackers 11.1.3.2.3-62, which may detect the presence of the eyes of the user in eye boxes 11.1.3.2.3-36, rear-facing sensors such as sensor 11.1.3.2.3-66 on main housing 11.1.3.2.3-12M, head-facing sensors mounted on strap 11.1.3.2.3-12T such as sensor 11.1.3.2.3-64, and/or other head presence sensors. These sensors may include cameras, light sensors (e.g., visible light or infrared sensors that measure when ambient light levels have dropped due to shadowing by the head of a user), proximity sensors (e.g., sensors that emit light such as infrared light and that measure corresponding reflected light from a user's head with an infrared light sensor, capacitive proximity sensors, ultrasonic acoustic proximity sensors, etc.), switches and/or other force-sensing sensors that detect head pressure when a user's head is present, and/or other head presence sensors.

When device 11.1.3.2.3-10 is being worn and a user's head is present in region 11.1.3.2.3-68, the nose of the user will be present under nose bridge portion NB of housing 11.1.3.2.3-12. When optical assemblies 11.1.3.2.3-20 are moved towards each other so that assemblies 11.1.3.2.3-20 are spaced apart by an amount that matches or nearly matches the user's interpupillary distance, inner side surfaces 11.1.3.2.3-60 of support structures 11.1.3.2.3-38 in assemblies 11.1.3.2.3-20 will move toward opposing outer side surfaces 11.1.3.2.3-61 of the user's nose. With sufficient inward movement of assemblies 11.1.3.2.3-20, surfaces 11.1.3.2.3-60 may contact and press against nose surfaces 11.1.3.2.3-61. As a result, an outward force on assemblies 11.1.3.2.3-20 is created by nose surfaces 11.1.3.2.3-61. To avoid discomfort that might arise if the user's nose is pressed against by more than a desired amount, device 11.1.3.2.3-10 may be provided with features to limit inward nose pressure (e.g., to limit inward force by assemblies 11.1.3.2.3-20).

With an illustrative embodiment, whenever device 11.1.3.2.3-10 is mounted on the head of a user, motors 11.1.3.2.3-48 may only be permitted to move optical assemblies 11.1.3.2.3-20 away from each other and not towards each other. This ensures that surfaces 11.1.3.2.3-60 will never move towards each other while the user's nose is present, so that the user's nose will never be pressed excessively by moving surfaces 11.1.3.2.3-60.

The operation of device 11.1.3.2.3-10 in this type of arrangement is illustrated in the flow chart of FIG. 11.1.3.2.3-2.

During the operations of block 11.1.3.2.3-80, device 11.1.3.2.3-10 may be powered up. Device 11.1.3.2.3-10 may, for example, be powered up in response to detection of a user button press on button 11.1.3.2.3-70. During power up operations, a power supply supplies power (e.g., a power supply voltage) to the control circuits, sensors, displays, and other components 11.1.3.2.3-40 of device 11.1.3.2.3-10.

During the operations of block 11.1.3.2.3-82, motors 11.1.3.2.3-48, in response to detection of the power-up condition (e.g., in response to detecting the presence of the power supply voltage), may move optical assemblies 11.1.3.2.3-20 away from each other. Gaze trackers 11.1.3.2.3-62 may, in response to detection of the power up condition (e.g., in response to the power supply voltage), capture images of the user's eyes in eye boxes 11.1.3.2.3-36 and may use this information in determining a target separation between optical assemblies 11.1.3.2.3-20 (e.g., gaze trackers 11.1.3.2.3-62 may measure the user's interpupillary distance and/or other eye characteristics such as the user's eye relief and may use the user's measured interpupillary distance and/or other eye characteristics in establishing a target separation for optical assemblies 11.1.3.2.3-20). During the operations of block 11.1.3.2.3-82, motors 11.1.3.2.3-48 may move optical assemblies 11.1.3.2.3-20 apart until the target separation (target positions) for optical assemblies 11.1.3.2.3-20 is reached.

During the operations of block 11.1.3.2.3-84, after motors 11.1.3.2.3-48 have placed optical assemblies 11.1.3.2.3-20 into their desired positions, further movement of assemblies 11.1.3.2.3-20 may be halted and device 11.1.3.2.3-10 may be used to present images to eye boxes 11.1.3.2.3-36 for viewing by the user.

After the user has finished viewing content with device 11.1.3.2.3-10, device 11.1.3.2.3-10 may be powered down for storage. In an illustrative scenario, a button press on button 11.1.3.2.3-70 or other input is used to instruct device 11.1.3.2.3-10 to shut down. Optical assemblies 11.1.3.2.3-20 may be maintained in their current position while device 11.1.3.2.3-10 is powered down or can be moved towards each other in preparation for subsequent outward movements (see, e.g., block 11.1.3.2.3-82). When moving optical assemblies 11.1.3.2.3-20 towards each other (at block 11.1.3.2.3-86 or another time such as during initial power up operations), a head-presence sensor may be used to detect whether the user's head is present in region 11.1.3.2.3-68. The head-presence sensor may, as an example, be used to confirm that the user's head is not present whenever optical assemblies 11.1.3.2.3-82 are being moved towards each other. For example, during the operations of block 11.1.3.2.3-86, motors 11.1.3.2.3-48 may move optical assemblies 11.1.3.2.3-20 towards each other in response to the detected user power down command (e.g., the button press input on button 11.1.3.2.3-70) provided that no head is being detected by the head-presence sensor.

With another illustrative embodiment, which is illustrated in the flow chart of FIG. 11.1.3.2.3-3, motors 11.1.3.2.3-48 may be configured to only move optical assemblies toward each other when a user actively permits movement of optical assemblies 11.1.3.2.3-20. As an example, a user input device such as button 11.1.3.2.3-70 may be mounted on housing 11.1.3.2.3-12 (e.g., on an external surface of housing 11.1.3.2.3-12M or other external surface of housing 11.1.3.2.3-12). Motors 11.1.3.2.3-48 may be configured to inhibit movement of assemblies 11.1.3.2.3-20 (e.g., motors 11.1.3.2.3-48 may remain stationary) whenever button 11.1.3.2.3-70 is not being pressed. In response to detecting the pressing and continual holding of button 11.1.3.2.3-70 by a user, motors 11.1.3.2.3-48 may move optical assemblies 11.1.3.2.3-20 to adjust the spacing between assemblies 11.1.3.2.3-20. Motors 11.1.3.2.3-48 may, for example, move optical assemblies 11.1.3.2.3-20 from an initial configuration in which optical assemblies 11.1.3.2.3-20 are spaced apart by their maximum spacing or other wide spacing to a target configuration in which optical assemblies 11.1.3.2.3-20 are separated by a distance equal to or nearly equal to the measured interpupillary distance associated with the user's eyes (e.g., assemblies 11.1.3.2.3-20 may be moved toward their target positions as measured by gaze trackers 11.1.3.2.3-62).

As shown in FIG. 11.1.3.2.3-3, device 11.1.3.2.3-10 may be powered up during the operations of block 11.1.3.2.3-90. Following power-up operations, when device 11.1.3.2.3-10 is being worn on the head of the user, gaze trackers 11.1.3.2.3-62 may optionally measure the user's interpupillary distance and/or other eye characteristics of the user's eyes. These measurements may establish a desired separation (e.g., target positions) for optical assemblies 11.1.3.2.3-20.

During the operations of block 11.1.3.2.3-92, a user has an opportunity to press button 11.1.3.2.3-70. When no button press input is detected, motors 11.1.3.2.3-48 remain stationary, so that optical assemblies 11.1.3.2.3-20 do not move. When button press input is detected, motors 11.1.3.2.3-48 are allowed to move to adjust the separation between assemblies 11.1.3.2.3-20. As an example, motors 11.1.3.2.3-48 may move assemblies 11.1.3.2.3-20 inwardly towards their target positions. During movement of assemblies 11.1.3.2.3-20, motors 11.1.3.2.3-48 may be halted in response to any detected user release of button 11.1.3.2.3-70. In this way, the positions of assemblies 11.1.3.2.3-20 will be adjusted so long as button 11.1.3.2.3-70 is being pressed, but will stop in response to release of button 11.1.3.2.3-70 (e.g., when the user desires to prevent movement of assemblies 11.1.3.2.3-20 that could press against nose surfaces 11.1.3.2.3-62). The user in this scenario remains in continuous control of assemblies 11.1.3.2.3-20.

Once the desired positions of assemblies 11.1.3.2.3-20 have been reached, device 11.1.3.2.3-10 may be used to view images while being worn by the user. Motors 11.1.3.2.3-48 may stop automatically when the target positions measured by gaze trackers 11.1.3.2.3-62 are reached or motors 11.1.3.2.3-48 may stop when the user releases button 11.1.3.2.3-70. If desired, the direction of movement of assemblies 11.1.3.2.3-20 may be controlled by providing device 11.1.3.2.3-10 with two of buttons 11.1.3.2.3-70 (e.g., an inward movement button and an outward movement button) or by providing a first button 11.1.3.2.3-70 to control movement (e.g., a go/stop button) and a second button (e.g., a slider with two positions) that is used to choose between inward and outward movement settings. Arrangements in which device 11.1.3.2.3-10 has non-button user input devices such as microphones for gather voice commands, touch screen displays, and/or other user input devices may also be used in controlling movement of motors 11.1.3.2.3-48.

Clutches may be used to limit the amount of inward force that is applied by optical assemblies 11.1.3.2.3-20 when assemblies 11.1.3.2.3-20 are moved towards nose surfaces 11.1.3.2.3-61 by motors 11.1.3.2.3-48.

In the example of FIG. 11.1.3.2.3-4, a split nut arrangement is used for nut 11.1.3.2.3-46, forming a mechanical clutch (sometimes referred to as a force limiter). As shown in FIG. 11.1.3.2.3-4, nut 11.1.3.2.3-46 may be moved (parallel to the X axis) by rotating threaded shaft 11.1.3.2.3-44. Nut 11.1.3.2.3-46 may have a split such as split 11.1.3.2.3-91. When excess force is experienced (e.g., when assembly 11.1.3.2.3-20 starts to press against nose surface 11.1.3.2.3-61), nut 11.1.3.2.3-46 will be forced apart in directions 11.1.3.2.3-93 and will slide over the threads on shaft 11.1.3.2.3-44 rather than being driven inwardly by the interaction between the threads on shaft 11.1.3.2.3-44 and the corresponding threads in nut 11.1.3.2.3-46. In this way, excess force is released and the clutch provided by split 11.1.3.2.3-91 helps prevent more than a desired amount of force from being applied to the user's nose. The split nut configuration of FIG. 11.1.3.2.3-4 therefore serves as a release mechanism that limits pressure from assembly 11.1.3.2.3-20 on nose surface 11.1.3.2.3-61.

Illustrative magnetic clutches are shown in FIGS. 11.1.3.2.3-5 and 11.1.3.2.3-6. In the magnetic clutch arrangement of FIG. 11.1.3.2.3-5, a magnet 11.1.3.2.3-95 is attached to nut 11.1.3.2.3-46 and a magnet 11.1.3.2.3-96, which is attracted to magnet 11.1.3.2.3-95, is attached to support 11.1.3.2.3-38. Optional structures 11.1.3.2.3-98 (e.g., non-magnetic coatings and/or protruding structures that establish an air gap between magnets 11.1.3.2.3-95 and 11.1.3.2.3-96) may be used to adjust the holding force established by the attraction between magnets 11.1.3.2.3-95 and 11.1.3.2.3-96. During normal operations, magnets 11.1.3.2.3-95 and 11.1.3.2.3-96 are magnetically coupled to each other, so that optical assembly support 11.1.3.2.3-38 is moved back and forth along the length of shaft 11.1.3.2.3-44 (e.g., parallel to the X axis in the example of FIG. 11.1.3.2.3-5), thereby adjusting the spacing between assemblies 11.1.3.2.3-20. If, however, inward movement of assemblies 11.1.3.2.3-20 is resisted due to contact between surfaces 11.1.3.2.3-60 and nose surfaces 11.1.3.2.3-61, the holding force of the magnetic clutch will be exceeded, magnets 11.1.3.2.3-95 and 11.1.3.2.3-96 will separate, and this decoupling of magnets 11.1.3.2.3-95 and 11.1.3.2.3-96 will prevent further inward movement of assemblies 11.1.3.2.3-20.

In the example of FIG. 11.1.3.2.3-6, two rows of magnets are provided that are configured so that their exposed poles oppose each other. With this type of arrangement, the poles of magnets 11.1.3.2.3-95' attract the poles of magnets 11.1.3.2.3-96', so that during normal operations, nut 11.1.3.2.3-46 is magnetically coupled to support 11.1.3.2.3-38 and is able to move support 11.1.3.2.3-38 and thereby adjust the position of the optical assembly associated with support 11.1.3.2.3-38. In the event that surface 11.1.3.2.3-60 of support 11.1.3.2.3-38 presses against nose surface 11.1.3.2.3-61, the magnetic holding ability of the magnetic clutch of FIG. 11.1.3.2.3-6 will be exceeded, magnets 11.1.3.2.3-95' and 11.1.3.2.3-96' will decouple and will slide past each other, and additional inward movement of assemblies 11.1.3.2.3-20 towards the nose of the user will be prevented.

FIG. 11.1.3.2.3-7 is a diagram showing how interlocking physical features may be used to implement a mechanical version of the magnetic clutch of FIG. 11.1.3.2.3-6. In the example of FIG. 11.1.3.2.3-7, pin 11.1.3.2.3-100 is coupled to nut 11.1.3.2.3-46 and protrusions 11.1.3.2.3-102 (sometimes referred to as snap features, locking structures, or a releasable pin lock), which are coupled to support 11.1.3.2.3-38. During normal operations, pin 11.1.3.2.3-100 will not bend and will transfer force along the X direction from nut 11.1.3.2.3-46 to support 11.1.3.2.3-38 to move assembly 11.1.3.2.3-20. If excess force is generated (e.g., when assembly 11.1.3.2.3-20 contacts nose surface 11.1.3.2.3-61), pin 11.1.3.2.3-100 will bend and slip past protrusions 11.1.3.2.3-102 in the pin lock, thereby decoupling nut 11.1.3.2.3-46 from support 11.1.3.2.3-38 and preventing further movement of assemblies 11.1.3.2.3-20 towards the user's nose.

FIGS. 11.1.3.2.3-8, 11.1.3.2.3-9, and 11.1.3.2.3-10 show illustrative mechanical clutch designs that may be used to implement mechanical version of the magnetic clutch of FIG. 11.1.3.2.3-5. In the arrangement of FIG. 11.1.3.2.3-8, pin 11.1.3.2.3-108 is coupled to nut 11.1.3.2.3-46 and interlocks with a releasable pin lock formed from snap 11.1.3.2.3-110 on support 11.1.3.2.3-38. When excess force is applied, snap 11.1.3.2.3-110 deforms and pin 11.1.3.2.3-108 escapes from snap 11.1.3.2.3-110 to release the clutch. In the arrangement of FIG. 11.1.3.2.3-9, the downward protrusion of snap 11.1.3.2.3-110 of FIG. 11.1.3.2.3-8 has been replaced with protrusion 11.1.3.2.3-112 to form a releasable pin lock. In the example of FIG. 11.1.3.2.3-10, a releasable pin lock is formed from spring 11.1.3.2.3-114 and movable ball 11.1.3.2.3-116 instead of protrusion 11.1.3.2.3-112 of FIG. 11.1.3.2.3-9.

As shown in FIG. 11.1.3.2.3-11, force-sensitive components (sometimes referred to as switches or force sensors) may be used in detecting when more than a desired amount of force is being applied by nut 11.1.3.2.3-46 to support 11.1.3.2.3-38. Motors 11.1.3.2.3-48 are configured to deactivate in response to detecting this high amount of force (e.g., a force exceeding a predetermined threshold), thereby preventing excess nose pressure from assemblies 11.1.3.2.3-20. In the illustrative arrangement of FIG. 11.1.3.2.3-11, a protruding structure such as pin 11.1.3.2.3-122 is attached to nut 11.1.3.2.3-46. Pin 11.1.3.2.3-122 extends between first and second switches 11.1.3.2.3-120 (or other force sensors such as strain gauges, etc.). Each switch 11.1.3.2.3-120 in the example of FIG. 11.1.3.2.3-11 has a stationary switch body 11.1.3.2.3-124 within which a movable plunger 11.1.3.2.3-126 is mounted. As nut 11.1.3.2.3-46 is moved back and forth along the X axis by rotation of shaft 11.1.3.2.3-44 from motors 11.1.3.2.3-48, pin 11.1.3.2.3-122 pushes against plungers 11.1.3.2.3-126 (e.g., the plunger in the right-hand switch 11.1.3.2.3-120 when pushing support 11.1.3.2.3-38 to the right and the plunger in the left-hand switch 11.1.3.2.3-120 when pushing support 11.1.3.2.3-38 to the left). Plungers 11.1.3.2.3-126 are not pressed significantly into bodies 11.1.3.2.3-124 so long as a threshold amount of force on the plungers 11.1.3.2.3-126 is not exceeded. The interaction between pin 11.1.3.2.3-122 and switches 11.1.3.2.3-120 therefore allows lateral force to be transferred from nut 11.1.3.2.3-46 to support 11.1.3.2.3-38 to slide support 11.1.3.2.3-38 along rails 11.1.3.2.3-22 parallel to the X axis. If, however, assembly 11.1.3.2.3-20 contacts nose surface 11.1.3.2.3-61, support 11.1.3.2.3-38 will resist further movement and pin 11.1.3.2.3-122 will push against the plunger 11.1.3.2.3-126 that is in contact with pin 11.1.3.2.3-122 with more than the threshold amount of force. In response to detecting a change in the state of switch 11.1.3.2.3-120 due to this elevated force, motors 11.1.3.2.3-48 are e halted, thereby preventing more than a desired amount of force from being applied to nose surface 11.1.3.2.3-61.

In the example of FIG. 11.1.3.2.3-12, a torque-sensitive switch mechanism (switch 11.1.3.2.3-130, sometimes referred to as a torque sensor or torque-sensitive switch) is used to couple rotating shaft portion 11.1.3.2.3-44-2 of shaft 11.1.3.2.3-44 to rotating shaft portion 11.1.3.2.3-44-1 of shaft 11.1.3.2.3-44. Nut 11.1.3.2.3-46 may be coupled to portion 11.1.3.2.3-44-1 and may be used to move support 11.1.3.2.3-38 parallel to shaft 11.1.3.2.3-44. Motor 11.1.3.2.3-48 may rotate shaft portion 11.1.3.2.3-44-2 to move nut 11.1.3.2.3-46. Switch 11.1.3.2.3-130 may have a first switch portion 11.1.3.2.3-130-1 and a second switch portion 11.1.3.2.3-130-2. When less than a threshold amount of torque is applied to portion 11.1.3.2.3-130-2 by shaft portion 11.1.3.2.3-44-2, portion 11.1.3.2.3-130-2 transfers this applied torque to portion 11.1.3.2.3-130-1, which, in turn, transfers this applied torque to portion 11.1.3.2.3-44-1. The rotation of portion 11.1.3.2.3-44-1 moves nut 11.1.3.2.3-46 laterally to adjust the lateral position of support 11.1.3.2.3-38 and assembly 11.1.3.2.3-20. In the event that support 11.1.3.2.3-38 contacts nose surface 11.1.3.2.3-61, support 11.1.3.2.3-38 will resist further lateral motion by nut 11.1.3.2.3-46. This will create a rise in torque that is detected by switch 11.1.3.2.3-130. In response, motor 11.1.3.2.3-48 halts its motion. By stopping motors 11.1.3.2.3-48 in response to detecting an amount of torque exceeding a predetermined torque threshold, motors 11.1.3.2.3-48 can be prevented from applying more force than desired to nose surfaces 11.1.3.2.3-61.

If desired, the load on motors 11.1.3.2.3-48 can be monitored electronically, so that motors 11.1.3.2.3-48 can be halted if more than a desired motor load is encountered. An illustrative motor control circuit is shown in FIG. 11.1.3.2.3-13. As shown in FIG. 11.1.3.2.3-13, motor 11.1.3.2.3-48 may be driven using a drive circuit such as driver 11.1.3.2.3-140. Driver 11.1.3.2.3-140 may apply any suitable drive signal to motor 11.1.3.2.3-48 (e.g., a sinusoidal motor drive current, etc.). Current sensor 11.1.3.2.3-144 may measure the current Imeas that flows through motor 11.1.3.2.3-48. Voltage sensor 11.1.3.2.3-142 may measure the voltage Vmeas across the terminals of motor 11.1.3.2.3-48. The counterelectromotive force ("back EMF") that is produced when operating motor 11.1.3.2.3-48 is equal to (Imeas*Rm—Vmeas), where Rm is the known motor resistance associated with motor 11.1.3.2.3-48. During operation of motor 11.1.3.2.3-48, back EMF may be calculated in real time and the phase difference between Imeas and the back EMF may be monitored to determine the motor load being experienced by motor 11.1.3.2.3-48 (e.g., motor 11.1.3.2.3-48 may be determined to be unloaded when the measured phase difference is 90°, may be determined to be fully loaded when the measured phase difference is 0°, and may be determined to be experiencing an intermediate amount of load when the measured phase difference is between 0° and 90°). Motors 11.1.3.2.3-48 may be configured to halt operation in response to a determination that the motor load has exceeded a desired amount (e.g., a determination that the measured phase difference between Imeas and back EMF is less than a predetermined threshold phase shift value such as less than 85° or less than 40°).

If desired, motor 11.1.3.2.3-48 may be supplied with a rotatory encoder, as shown in the example of FIG. 11.1.3.2.3-14. In this example, magnet 11.1.3.2.3-150 is attached to shaft 11.1.3.2.3-44 and magnetic sensor 11.1.3.2.3-152 is used to monitor the magnetic field produced by magnet 11.1.3.2.3-150. Sensor 11.1.3.2.3-152 and magnet 11.1.3.2.3-152 therefore serve as an encoder that measures the rotation of shaft 11.1.3.2.3-44 and therefore the rotation of the rotor in motor 11.1.3.2.3-48. With this arrangement, the phase shift between the angle of the rotor and the drive current (e.g., Imeas) may be used as a measure of motor load or (in an arrangement in which motor 11.1.3.2.3-48 is being controlled by establishing a phase of 0° between rotor angle and drive current) motor load may be determined by monitoring Imeas and comparing Imeas to a threshold (as examples). When motor load is not elevated (e.g., below a predetermined threshold), motors 11.1.3.2.3-48 may rotate normally to move nut 11.1.3.2.3-46 along shaft 11.1.3.2.3-44 and thereby move optical assemblies 11.1.3.2.3-20. When optical assemblies 11.1.3.2.3-20 contact nose surfaces 11.1.3.2.3-61, motor load will increase beyond a threshold amount. In response, motors 11.1.3.2.3-48 may be halted, thereby preventing excess pressure on nose surfaces 11.1.3.2.3-61.

Another illustrative technique for electronically monitoring motor load involves the use of a linear encoder of the type shown in FIG. 11.1.3.2.3-15. As shown in FIG. 11.1.3.2.3-15, encoder 11.1.3.2.3-156 may include a strip of magnets 11.1.3.2.3-158 and a corresponding magnetic sensor 11.1.3.2.3-160. Sensor 11.1.3.2.3-160 may be attached to nut 11.1.3.2.3-46. Magnets 11.1.3.2.3-158 may be attached to a stationary support surface (e.g., a portion of housing 11.1.3.2.3-12). When motor 11.1.3.2.3-48 rotates shaft 11.1.3.2.3-44, nut 11.1.3.2.3-46 is moved parallel to shaft 11.1.3.2.3-44. This causes sensor 11.1.3.2.3-160 to move past magnets 11.1.3.2.3-158 while measuring the magnetic fields from magnets 11.1.3.2.3-158. By monitoring the measured changes in magnetic field strength due to movement of sensor 11.1.3.2.3-160 past magnets 11.1.3.2.3-158, motors 11.1.3.2.3-48 can determine the speed of nut 11.1.3.2.3-46 and can determine when nut 11.1.3.2.3-46 has stopped and motors 11.1.3.2.3-48 have stalled (e.g., when applied current to motors 11.1.3.2.3-48 is failing to cause lateral motion in nuts 11.1.3.2.3-46).

The graph of FIG. 11.1.3.2.3-16 illustrates how stall detection may be used in measuring the force experienced by assemblies 11.1.3.2.3-20 when motors 11.1.3.2.3-48 contact nose surfaces 11.1.3.2.3-61. Solid line 11.1.3.2.3-160 represent an increasing amount of force F of the type that may be experienced by optical assemblies 11.1.3.2.3-20 (e.g., support 11.1.3.2.3-38 and nut 11.1.3.2.3-46) as optical assemblies 11.1.3.2.3-20 come into contact with nose surfaces 11.1.3.2.3-61 and begin to feel resistance (back pressure) from nose surfaces 11.1.3.2.3-61. Current Im may be applied to motors 11.1.3.2.3-48 by driver 11.1.3.2.3-140 (FIG. 11.1.3.2.3-13) in a pattern that follows dashed line 11.1.3.2.3-162, which represents the amount of resulting motor force produced by current Im.

In the example of FIG. 11.1.3.2.3-16, motor 11.1.3.2.3-48 periodically stalls at stall points 11.1.3.2.3-170. This is because the amount of forward force produced by the current Im applied to the motor is equaled by the back pressure (reverse force F) produced as nose surface 11.1.3.2.3-61 resists further forward motion by optical assembly 11.1.3.2.3-20. By using an encoder such as encoder 11.1.3.2.3-156 of FIG. 11.1.3.2.3-15, the motion of nut 11.1.3.2.3-46 and therefore the movement of support 11.1.3.2.3-38 and optical assembly 11.1.3.2.3-20 can be monitored. Whenever no motion is detected in response to a particular value of applied current Im, it can be concluded that optical assembly 11.1.3.2.3-20 has halted (e.g., motor 11.1.3.2.3-48 has stalled at one of stall points 11.1.3.2.3-170). Motor 11.1.3.2.3-48 may be a stepper motor that is controlled by application of sets of pulses (e.g., 10 pulses at a time). Following detection of a stall (e.g., when it is detected that motor 11.1.3.2.3-48 moved assembly 11.1.3.2.3-20 less than expected after a given set of current pulses was applied), the magnitude of applied current Im may, as shown in FIG. 11.1.3.2.3-16, initially increase (to ensure further movement) and then decrease until the force being produced by motor 11.1.3.2.3-48 matches the reverse force due to nose surface contact. Each time a stall point 11.1.3.2.3-170 is reached in this way, the amount of current Im may be evaluated. With this approach, the magnitude of the current applied to motor 11.1.3.2.3-48 closely tracks the increase in force F due to nose contact so that the magnitude of the current can be used as a measure of pressure on nose surface 11.1.3.2.3-61. Motors 11.1.3.2.3-48 may be configured to halt (e.g., no more current will be applied) in response to the value of Im exceeding a predetermined threshold value.

The flow chart of FIG. 11.1.3.2.3-17 shows illustrative operations that may be involved in operating device 11.1.3.2.3-10 in an arrangement in which electrical monitoring of motor load is used to determine when to halt motor operation and thereby prevent more than a desired amount of force being applied by optical assemblies 11.1.3.2.3-20 on nose surfaces 11.1.3.2.3-61.

During the operations of block 11.1.3.2.3-200, device 11.1.3.2.3-10 may be powered up (e.g., in response to a detected button press or other activity).

Once device 11.1.3.2.3-10 has powered up, gaze trackers 11.1.3.2.3-62 may measure the separation between the user's eyes (user interpupillary distance) and other eye characteristics to determine target positions for optical assemblies 11.1.3.2.3-20. Motors 11.1.3.2.3-48 may then rotates shafts 11.1.3.2.3-44 to move optical assemblies 11.1.3.2.3-20 towards the target positions (e.g., by moving assemblies 11.1.3.2.3-20 towards nose bridge portion NB of housing 11.1.3.2.3-12). During motor operation, motor load may be electrically monitored (e.g., using back EMF measurements, using encoder output, using measurements of applied current, and/or using other measurements of the types described in connection with FIGS. 11.1.3.2.3-13, 11.1.3.2.3-14, 11.1.3.2.3-15, and 11.1.3.2.3-16).

If optical assemblies 11.1.3.2.3-20 contact nose surfaces 11.1.3.2.3-61, nose surfaces 11.1.3.2.3-61 will produce a force against optical assemblies 11.1.3.2.3-20 that tends to resist further movement. Motors 11.1.3.2.3-48 are configured to halt operation in response to detection of more than a desired amount of motor load (see, e.g., block 11.1.3.2.3-204). At this point, device 11.1.3.2.3-10 may be operated normally and used in presenting images to the user's eyes in eye boxes 11.1.3.2.3-36.

Following use of device 11.1.3.2.3-10, device 11.1.3.2.3-10 can be powered down (see, e.g., the operations of block 11.1.3.2.3-206). Device 11.1.3.2.3-10 may, as an example, be powered down in response to detection of a user button press or other activities.

11.1.3.3: Hard Stops

FIG. 11.1.3.3-1 illustrates a portion of an example of an HMD 11.1.3.3-100 including a frame 11.1.3.3-102 and an optical module 11.1.3.3-104 adjustably connected to the frame 11.1.3.3-102. The HMD 11.1.3.3-100 can also include a stop bracket 11.1.3.3-106 coupled to the frame adjacent the optical module 11.1.3.3-104. In at least one example, the stop bracket 11.1.3.3-106 can include a first hard-stop feature **11.1.3.3-108*a* and a second hard stop feature 11.1.3.3-108*b* extending/protruding therefrom to form a stop surface against which the optical module 11.1.3.3-104 can contact in cases where the optical module 11.1.3.3-104** travels or is adjusted too far laterally during IPD adjustments described elsewhere herein.

In particular, the optical module 11.1.3.3-104 can include a housing 11.1.3.3-110 configured to contact the stop bracket 11.1.3.3-106, or the tabs **11.1.3.3-108*a-b* thereof, in a drop event or, for example, when a user adjusts or causes the optical module 11.1.3.3-104** to move too far laterally during the IPD adjustment.

Any of the features, components, and/or parts, including the arrangements and configurations thereof shown in FIG. 11.1.3.3-1 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.3.3-1.

FIG. 11.1.3.3-2 illustrates another view of an example of an HMD 11.1.3.3-200 including an optical module 11.1.3.3-204 having a housing 11.1.3.3-210 and a stop bracket 11.1.3.3-206, including a tab 11.1.3.3-208, secured to a frame 11.1.3.3-202. The HMD 11.1.3.3-200 can also include an adjustment mechanism 11.1.3.3-203 for the optical module 11.1.3.3-204 of an HMD 11.1.3.3-200. In at least one example, the adjustment mechanism 11.1.3.3-203 also includes a stop 11.1.3.3-218 positioned at or near a distal end of a guide-rod 11.1.3.3-212. The guide rod 11.1.3.3-212 can be disposed at least partially within a follower 11.1.3.3-214 of the optical module 11.1.3.3-204 such that the optical module 11.1.3.3-204 can be translated laterally along the guide rod 11.1.3.3-212 during adjustment for user IPD.

In at least one example, the stop 11.1.3.3-218 can include a cavity or channel in which the distal end of the guide-rod 11.1.3.3-212 extends. However, in at least one example, no contact is made between the guide-rod 11.1.3.3-212 and the stop 11.1.3.3-218 such that the guide-rod 11.1.3.3-212 is cantilevered. The stop 11.1.3.3-218 can be configured to prevent the optical module 11.1.3.3-204 from travelling too far distally along the guide-rod 11.1.3.3-212 and beyond the distal end thereof during IPD adjustment. The stop 11.1.3.3-218 can also serve to prevent too much deformation of the cantilevered guide-rod 11.1.3.3-212 during unintended drop events or other forces that would cause a deformation of the guide-rod 11.1.3.3-212 and a movement of the distal end of the guide-rod 11.1.3.3-212. In at least one example, the distal end of the guide-rod 11.1.3.3-212 extends into or is a least partially surrounded by the stop 11.1.3.3-218 without making contact during normal use of the HMD 11.1.3.3-200. If unintentionally moved or deformed elastically, the distal end or portion of the guide-rod 11.1.3.3-212 can make contact with the stop 11.1.3.3-218 such that the stop 11.1.3.3-218 prevents too much deformation of the guide-rod 11.1.3.3-212, thus preventing plastic deformation and damage to the guide-rod 11.1.3.3-212.

Any of the features, components, and/or parts, including the arrangements and configurations thereof shown in FIG. 11.1.3.3-2 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.3.3-2.

11.1.3.4: Upper Biasing Members

FIG. 11.1.3.4-1 illustrates an example of an adjustment mechanism 11.1.3.4-102 of an HMD 11.1.3.3-100 including a follower 11.1.3.3-104 of an optical module slidably engaged with a guide-rod 11.1.3.4-106. The adjustment mechanism 11.1.3.4-102 can also include an encoder 11.1.3.4-110 for position sensing as the optical module is adjusted/moved along the guide-rod 11.1.3.4-106 for IPD adjustments.

In at least one example, the adjustment mechanism 11.1.3.4-102 can also include a biasing element 11.1.3.4-108 biasing the guide-rod 11.1.3.4-106 within the follower 11.1.3.4-104 to reduce slack and play between the follower 11.1.3.3-104 and the guide-rod 11.1.3.4-106, either during adjustments or when stationary. In at least one example, the biasing element 11.1.3.4-108 includes an elongate spring finger fixed to the follower 11.1.3.3-104 or other optical module component at fixation points 11.1.3.4-112 and a distal end 11.1.3.4-114 biased toward the guide-rod 11.1.3.3-106 and extending through an aperture 11.1.3.4-116 of the follower 11.1.3.4-104 to contact the guide-rod 11.1.3.4-106 through the aperture 11.1.3.4-116.

Any of the features, components, and/or parts, including the arrangements and configurations thereof shown in FIG. 11.1.3.4-1 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.3.4-1.

FIG. 11.1.3.4-2 illustrates a portion of another example of an adjustment mechanism 11.1.3.4-202 including a guide-rod 11.1.3.4-206 and a biasing member 11.1.3.4-208. The follower is not illustrated in FIG. 11.1.3.4-2 for illustrative purposes but the biasing element 11.1.3.4-208 can be fixed to a follower at the fixation point 11.1.3.4-212. The distal end 11.1.3.4-214 of the biasing element 11.1.3.4-208 can include a distal spring finger 11.1.3.4-218 or other feature biased toward and contacting the guide-rod in order to bias the guide-rod 11.1.3.4-206 within the follower (to which the biasing element 11.1.3.4-208 is fixed) to remove slack and play between the follower and the guide-rod 11.1.3.4-206.

Any of the features, components, and/or parts, including the arrangements and configurations thereof shown in FIG. 11.1.3.4-2 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.3.4-2.

11.1.4: Lower Guide Rod System

11.1.4.1: Electronic Devices with Biased Guide Rails

An electronic device may have input-output devices for gathering input and providing output. These devices may include optical components such as cameras, displays, and lenses.

A top view of an illustrative electronic device is shown in FIG. 11.1.4.1-1. Electronic device 11.1.4.1-10 of FIG. 11.1.4.1-1 may be a head-mounted device or other suitable device. As shown in FIG. 11.1.4.1-1, device 11.1.4.1-10 may have a housing such as housing 11.1.4.1-12. Housing 11.1.4.1-12, which may sometimes be referred to as a housing wall, external housing, housing structures, enclosure, or case, may be formed from materials such as polymer, glass, metal, crystalline materials such as sapphire, ceramic, fabric, foam, wood, other materials, and/or combinations of these materials.

Device 11.1.4.1-10 may have any suitable shape. Housing 11.1.4.1-12 may, for example, be configured to form a head-mounted housing in the shape of a pair of goggles (e.g., goggles having optional head straps such as straps 11.1.4.1-12T, a nose bridge portion in nose bridge region NB that is configured to fit over a user's nose and help support housing 11.1.4.1-12 on the user's nose, etc.) and/or other head-mounted structures. Housing 11.1.4.1-12 may separate interior region 11.1.4.1-26 from exterior region 11.1.4.1-28. Housing 11.1.4.1-12 may include portions such as front portion (front wall) 11.1.4.1-12F on front face F of device 11.1.4.1-10, rear portion (rear wall) 11.1.4.1-12R on opposing rear face R of device 11.1.4.1-10, and sidewall portions such as sidewall portions 11.1.4.1-12W on sides W that extend between front portion 11.1.4.1-12F and rear portion 11.1.4.1-12R, so that housing 11.1.4.1-12 encloses interior region 11.1.4.1-26.

Electrical and optical components may be mounted within housing 11.1.4.1-12 (e.g., in interior region 11.1.4.1-26). As an example, housing 11.1.4.1-12 may have optical components in interior region 11.1.4.1-26 such as displays 11.1.4.1-14 and lenses 11.1.4.1-38. Displays 11.1.4.1-14 and lenses 11.1.4.1-38 may be mounted in optical modules 11.1.4.1-30 (sometimes referred to as lens barrels, display and lens support structures, etc.). Images from displays 11.1.4.1-14 may be viewable from eye boxes 11.1.4.1-36 through lenses 11.1.4.1-38. A left display and left lens in a left optical module 11.1.4.1-30 may be used to present a left-eye image to a user's left eye in a left eye box 11.1.4.1-36 and a right display and right lens in a right optical module 11.1.4.1-30 may be used to present a right-eye image to a user's right eye in right eye box 11.1.4.1-36. Manual adjustment mechanisms and/or electrically adjustable actuators 11.1.4.1-13 (e.g., motors or other electrically adjustable positioners) may be used to move optical modules 11.1.4.1-30 horizontally across the front of the user's face (e.g., to adjust distance D between modules 11.1.4.1-30 along a direction parallel to the X-axis or nearly parallel to the X-axis of FIG. 11.1.4.1-1). Optical modules 11.1.4.1-30 may, for example, be moved closer to each other or farther apart from each other as needed to accommodate different user interpupillary distances.

A schematic diagram of an illustrative electronic device is shown in FIG. 11.1.4.1-2. Device 11.1.4.1-10 of FIG. 11.1.4.1-2 may be operated as a stand-alone device and/or the resources of device 11.1.4.1-10 may be used to communicate with external electronic equipment. As an example, communications circuitry in device 11.1.4.1-10 may be used to transmit user input information, sensor information, and/or other information to external electronic devices (e.g., wirelessly or via wired connections) and/or may be used to receive such information from external electronic devices. Each of these external devices may include components of the type shown by device 11.1.4.1-10 of FIG. 11.1.4.1-2.

As shown in FIG. 11.1.4.1-2, electronic device 11.1.4.1-10 may include control circuitry 11.1.4.1-20. Control circuitry 11.1.4.1-20 may include storage and processing circuitry for supporting the operation of device 11.1.4.1-10. The storage and processing circuitry may include storage such as nonvolatile memory (e.g., flash memory or other electrically-programmable-read-only memory configured to form a solid-state drive), volatile memory (e.g., static or dynamic random-access-memory), etc. Processing circuitry in control circuitry 11.1.4.1-20 may be used to gather input from sensors (e.g., cameras) and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 11.1.4.1-20 may use display(s) 11.1.4.1-14 and other output devices in providing a user with visual output and other output.

To support communications between device 11.1.4.1-10 and external equipment, control circuitry 11.1.4.1-20 may communicate using communications circuitry 11.1.4.1-22. Circuitry 11.1.4.1-22 may include antennas, radio-frequency transceiver circuitry, and other wireless communications circuitry and/or wired communications circuitry. Circuitry 11.1.4.1-22, which may sometimes be referred to as control circuitry and/or control and communications circuitry, may support bidirectional wireless communications between device 11.1.4.1-10 and external equipment (e.g., a companion device such as a computer, cellular telephone, or other electronic device, an accessory such as a point device, computer stylus, or other input device, speakers or other output devices, etc.) over a wireless link. For example, circuitry 11.1.4.1-22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link. Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 11.1.4.1-10 may, if desired, include power circuits for transmitting and/or receiving wired and/or wireless power and may include batteries or other energy storage devices. For example, device 11.1.4.1-10 may include a coil and rectifier to receive wireless power that is provided to circuitry in device 11.1.4.1-10.

Device 11.1.4.1-10 may include input-output devices such as devices 11.1.4.1-24. Electronic components such as input-output devices 11.1.4.1-24 may be used in gathering user input, in gathering information on the environment surrounding the user, and/or in providing a user with output.

Devices 11.1.4.1-24 may include one or more displays such as display(s) 11.1.4.1-14. Display(s) 11.1.4.1-14 may include one or more display devices such as organic light-emitting diode display panels (panels with organic light-emitting diode pixels formed on polymer substrates or silicon substrates that contain pixel control circuitry), liquid crystal display panels, microelectromechanical systems displays (e.g., two-dimensional mirror arrays or scanning mirror display devices), display panels having pixel arrays formed from crystalline semiconductor light-emitting diode dies (sometimes referred to as microLEDs), and/or other display devices.

Devices 11.1.4.1-24 may also include cameras 11.1.4.1-34. Cameras 11.1.4.1-34 may include visible light cameras, infrared cameras, and/or cameras that are sensitive at multiple wavelengths, may include three-dimensional camera systems such as depth sensors (e.g., structured light sensors and/or depth sensors based on stereo imaging devices that capture three-dimensional images), may include time-of-flight cameras, and/or may include other cameras. Cameras 11.1.4.1-34 may face toward the user of device 11.1.4.1-10 and/or away from the user of device 11.1.4.1-10.

Sensors 11.1.4.1-16 in input-output devices 11.1.4.1-24 may include force sensors (e.g., strain gauges, capacitive force sensors, resistive force sensors, etc.), audio sensors such as microphones, touch and/or proximity sensors such as capacitive sensors such as a touch sensor that forms a button, trackpad, or other input device), and other sensors. If desired, sensors 11.1.4.1-16 may include optical sensors such as optical sensors that emit and detect light, ultrasonic sensors, optical touch sensors, optical proximity sensors, and/or other touch sensors and/or proximity sensors, monochromatic and color ambient light sensors, fingerprint sensors, iris scanning sensors, retinal scanning sensors, and other biometric sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors such as blood oxygen sensors, heart rate sensors, blood flow sensors, and/or other health sensors, radio-frequency sensors, optical sensors such as self-mixing sensors and light detection and ranging (LIDAR) sensors, humidity sensors, moisture sensors, gaze tracking sensors, electromyography sensors to sense muscle activation, facial sensors, interferometric sensors, time-of-flight sensors, magnetic sensors, resistive sensors, distance sensors, angle sensors, and/or other sensors. In some arrangements, device 11.1.4.1-10 may use sensors 11.1.4.1-16 and/or other input-output devices 11.1.4.1-24 to gather user input. For example, input-output devices 11.1.4.1-24 such as buttons may be used to gather button press input, touch sensors overlapping displays can be used for gathering user touch screen input, touch pads may be used in gathering touch input, microphones may be used for gathering audio input (e.g., voice commands), accelerometers may be used in monitoring when a finger contacts an input surface and may therefore be used to gather finger press input, etc.

Input-output devices 11.1.4.1-24 may include optical components such as depth sensors (e.g., structured light sensors or other sensors that gather three-dimensional image data), optical proximity sensors, ambient light sensors (e.g., color ambient light sensors), optical time-of-flight sensors and other sensors 11.1.4.1-16 that are sensitive to visible and/or infrared light and that may emit visible and/or infrared light (e.g., devices 11.1.4.1-24 may contain optical sensors that emit and/or detect light). For example, a visible-light image sensor in a camera may have a visible light flash or an associated infrared flood illuminator to provide illumination while the image sensor captures a two-dimensional and/or three-dimensional image. An infrared camera such as an infrared structured light camera that captures three-dimensional infrared images may have an infrared flood illuminator that emits infrared flood illumination and/or may have a dot projector the emits an array of infrared light beams. Infrared proximity sensors may emit infrared light and detect the infrared light after the infrared light has reflected from a target object.

If desired, electronic device 11.1.4.1-10 may include additional components (see, e.g., other devices 11.1.4.1-18 in input-output devices 11.1.4.1-24). The additional components may include haptic output devices, actuators for moving movable structures in device 11.1.4.1-10, audio output devices such as speakers, light-emitting diodes for status indicators, light sources such as light-emitting diodes that illuminate portions of a housing and/or display structure, other optical output devices, and/or other circuitry for gathering input and/or providing output. Device 11.1.4.1-10 may also include a battery or other energy storage device, connector ports for supporting wired communication with ancillary equipment and for receiving wired power, and other circuitry.

To help maintain desired alignment between optical modules 11.1.4.1-30 as optical modules 11.1.4.1-30 are moved by actuators 11.1.4.1-13 (FIG. 11.1.4.1-1), optical modules 11.1.4.1-30 may be mounted on optical module guiding structures such as guide rails or other elongated support members. This type of arrangement is shown in the top view of device 11.1.4.1-10 of FIG. 11.1.4.1-3. As shown in FIG. 11.1.4.1-3, optical modules 11.1.4.1-30 may be slidably coupled to guide rails 11.1.4.1-44 to allow modules 11.1.4.1-30 to move horizontally (e.g., laterally along the X-axis to accommodate different user interpupillary distances).

Guide rails 11.1.4.1-44 may have circular cross-sectional shapes (e.g., guide rails 11.1.4.1-44 may be cylindrical rods) or may have other cross-sectional shapes. Guide rods 11.1.4.1-44 may be formed from metal, polymer, and/or other materials. Hollow and/or solid members may be used in forming guide rods 11.1.4.1-44. To help reduce friction between guide rods 11.1.4.1-44 and optical modules 11.1.4.1-30, guide rods 11.1.4.1-44 and/or mating portions of modules 11.1.4.1-30 may, if desired, be provided with a low-friction coating (e.g., nickel, etc.).

Guide rails 11.1.4.1-44 may span the width of housing 11.1.4.1-12. There may be left and right guide rails 11.1.4.1-44 in device 11.1.4.1-10 that are joined at a housing support structure aligned with nose bridge portion NB or left and right guide rails 11.1.4.1-44 may be formed as integral portions of a single guide rail member that extends across housing 11.1.4.1-12. Rails 11.1.4.1-44 may be straight or may, if desired, have a slight bend at nose bridge portion NB (e.g., to rake the left and right sides of the guide rails backwards slightly to conform to the shape of a user's face). As shown in the rear view of device 11.1.4.1-10 of FIG. 11.1.4.1-4, there may be upper and lower guide rails 11.1.4.1-44 on the left and right of device 11.1.4.1-10 such as upper guide rail 11.1.4.1-44T and lower guide rail 11.1.4.1-44. Arrangements with fewer guide rails or more guide rails may be used, if desired.

FIG. 11.1.4.1-5 is a side view of an illustrative optical module 11.1.4.1-30 mounted on guide rails 11.1.4.1-44. In the example of FIG. 11.1.4.1-5, optical module 11.1.4.1-30 has an upper portion such as portion 11.1.4.1-30T and a lower portion such as portion 11.1.4.1-30B. Portions 11.1.4.1-30T and/or 11.1.4.1-30B may be integrally formed with main supporting structure 11.1.4.1-30M of the lens barrel structures and/or other support structures of optical module 11.1.4.1-30 and/or may be separate members that are coupled (e.g., using welds, fasteners, adhesive, etc.) to main supporting structure 11.1.4.1-30M. Lens 11.1.4.1-38 may be aligned with display 11.1.4.1-14 so that an image on display 11.1.4.1-14 may be viewed through lens 11.1.4.1-38 from eye box 11.1.4.1-36.

As shown in FIG. 11.1.4.1-5, optical module 11.1.4.1-30 may have portions that receive and couple to guide rails 11.1.4.1-44 while allowing optical module 11.1.4.1-30 to slide along guide rails 11.1.4.1-44. For example, upper portion 11.1.4.1-30T may have a guide rail opening (optical module opening) 11.1.4.1-50 such as opening 11.1.4.1-50T that receives upper guide rail 11.1.4.1-44T and lower portion 11.1.4.1-30B may have a guide rail opening such as opening 11.1.4.1-50B that receives lower guide rail 11.1.4.1-44B. Openings 11.1.4.1-50T and 11.1.4.1-50B may by cylindrical openings with circular cross-sectional shapes that receive the cylindrical members forming rails 11.1.4.1-44T and 11.1.4.1-44B and/or may have other shapes that partly or fully surround rails 11.1.4.1-44T and 11.1.4.1-44B.

To prevent rails 11.1.4.1-44 from becoming stuck in guide rail openings 11.1.4.1-50 of optical module 11.1.4.1-30, the inner diameter of optical module openings may be slightly larger (e.g., by 2-50 microns, at least 5 microns, less than 100 microns, or other suitable amount) than the outer diameter of rails 11.1.4.1-44. To prevent excess motion, which could lead to misalignment of optical modules, device 11.1.4.1-10 may be provided with guide rail biasing systems. The guide rail biasing systems may have movable biasing members (e.g., pins, plates, spherical members, hemispherical members, etc.) and biasing elements that apply force to the biasing members. The biasing elements may be, for example, springs such as coil springs, leaf springs, and/or other spring members, may be compressed polymer (e.g., elastomeric material, foam, etc.), may be magnets, and/or may be other biasing components that can be used to bias the biasing members in a desired direction.

Using the guide rail biasing systems, guide rails 11.1.4.1-44 may be pushed towards desired positions within openings 11.1.4.1-50 to help remove undesired play between guide rails 11.1.4.1-44 and openings 11.1.4.1-50. As an example, guide rails 11.1.4.1-44 may be pressed against the inner surfaces of openings 11.1.4.1-50 (e.g., at a location on the side of openings 11.1.4.1-50 that faces eye boxes 11.1.4.1-36 rather than the opposing side of openings 11.1.4.1-50 that faces outwardly away from the user) and/or may be pressed against a structure mounted within openings 11.1.4.1-50 such as a pin or other support member.

Consider, as an example, the cross-sectional side view of optical module portion 11.1.4.1-30B of FIG. 11.1.4.1-6A. As shown in FIG. 11.1.4.1-6A, portion 11.1.4.1-30B may have an opening such as opening 11.1.4.1-50B that receives lower guide rail 11.1.4.1-44B. Lower guide rail biasing system 11.1.4.1-52B may have a lower guide rail biasing element such as lower guide rail biasing element 11.1.4.1-54B (e.g., a spring) and a corresponding movable biasing system member such as biasing member 11.1.4.1-56B (e.g., a pin with a hemispherical head) and/or system 11.1.4.1-52B may be formed from other biasing structures (e.g., a leaf spring, compressed foam, etc.). Under pressure from biasing element 11.1.4.1-54B, member 11.1.4.1-56B may press in direction 11.1.4.1-58 against an adjacent surface of guide rail 11.1.4.1-44B (e.g., the side of rail 11.1.4.1-44B facing biasing system 11.1.4.1-52B and facing away from the user). Pin 11.1.4.1-60 may be mounted on an opposing side of opening 11.1.4.1-50B. As a result of the force imposed on guide rail 11.1.4.1-44B in direction 11.1.4.1-58, guide rail 11.1.4.1-44B may bear against member 11.1.4.1-56 (or, if desired, the inner surface of opening 11.1.4.1-50B) at contact location 11.1.4.1-62 (e.g., a location on the surface of opening 11.1.4.1-50B facing the user and eye boxes). This creates a well-defined location for guide rail 11.1.4.1-44B relative to the structures of optical module 11.1.4.1-30 and helps prevent rail 11.1.4.1-44B from moving excessively in the Y and/or Z dimensions within opening 11.1.4.1-50B, thereby helping to ensure that optical module 11.1.4.1-30 is aligned satisfactorily with respect to eye box 11.1.4.1-30. Additional friction and resistance to sliding of optical module 11.1.4.1-30 along the X axis is created by the use of biasing systems such as biasing system 11.1.4.1-52B of FIG. 11.1.4.1-6A, but when it is desired to move optical modules 11.1.4.1-30 with respect to each other to adjust their spacing to accommodate a user interpupillary distance, sufficient force along the X dimension can be applied to overcome this friction.

If desired, spring 11.1.4.1-54B and biasing element 11.1.4.1-56B may be located on opposite sides of guide rail 11.1.4.1-44B. Consider, as an example, the illustrative configuration of biasing system 11.1.4.1-52B that is shown in FIG. 11.1.4.1-6B. In this configuration, biasing system 11.1.4.1-52B has a biasing member 11.1.4.1-57 with a portion that forms biasing element 11.1.4.1-56B. Biasing member 11.1.4.1-57 may be attached to portion 11.1.4.1-30B of optical module 11.1.4.1-30 using an attachment mechanism such as screw 11.1.4.1-67 or other fastener. Screw 11.1.4.1-67 may have a threaded shaft or other structure that is fixedly attached to portion 11.1.4.1-30B. The shaft of screw 11.1.4.1-67 may be received within a slot in member 11.1.4.1-57. The slot may extend parallel to the Y axis of FIG. 11.1.4.1-6B to allow biasing member 11.1.4.1-57 to slide back and forth parallel to the Y axis.

A biasing element such as spring 11.1.4.1-54B (e.g., a compression spring or other biasing spring) may be used to bias member 11.1.4.1-57 in the −Y direction. Spring 11.1.4.1-54B may have a first end that presses against a surface of member 11.1.4.1-57 such as surface 11.1.4.1-61 and an opposing second end that presses against a surface of portion 11.1.4.1-30B such as surface 11.1.4.1-63. When member 11.1.4.1-57 is moved in direction 11.1.4.1-65, spring 11.1.4.1-59 is compressed. Spring 11.1.4.1-59 thereafter presses against surface 11.1.4.1-61 and biases the portion of member 11.1.4.1-57 that forms element 11.1.4.1-54B in direction 11.1.4.1-58 relative to portion 11.1.4.1-30B. This causes member 11.1.4.1-57 to contact rail 11.1.4.1-44B at contact location 11.1.4.1-69 and to thereby bias the opposing side of rail 11.1.4.1-44B against pin 11.1.4.1-60 at contact location 11.1.4.1-62.

Member 11.1.4.1-57 may be formed from one or more materials. For example, member 11.1.4.1-57 may be formed from a metal (e.g., aluminum, stainless steel, etc.). The metal may be covered with a hard low-friction coating such as an electroless nickel coating to enhance wear resistance. As another example, member 11.1.4.1-57 may be formed from a polymer (e.g., a low-friction composite polymer filled with carbon fibers, fiberglass fibers, or other fibers). The low-friction composite polymer may be formed from a polymer such as PEEK (polyether ether ketone) or other polymer (e.g., a polymer that may be shaped by a molding process such as injection molding).

The examples of FIG. 11.1.4.1-6A and 11.1.4.1-6B demonstrate how lower guide rail 11.1.4.1-44B may be provided with an associated guide rail biasing system (illustrative system 11.1.4.1-52B). If desired, upper guide rails 11.1.4.1-44T may also be provided with guide rail biasing systems. As shown in the cross-sectional side view of upper portion 11.1.4.1-30T of optical module 11.1.4.1-30, optical module 11.1.4.1-30 may have biasing systems 11.1.4.1-52T-1 and 11.1.4.1-52T-2. System 11.1.4.1-52T-1 may have biasing element 11.1.4.1-54T-1 for forcing movable biasing member 11.1.4.1-56T-1 against an adjacent surface of guide rail 11.1.4.1-44T in direction 11.1.4.1-66 (or may have other biasing structures such as a leaf spring, compressed foam, etc.). System 11.1.4.1-52T-2 may have biasing element 11.1.4.1-54T-2 for forcing movable biasing member 11.1.4.1-56T-2 against an adjacent surface of guide rail 11.1.4.1-44 (or may have other biasing structures such as a leaf spring, compressed foam, etc.). Using systems 11.1.4.1-52T-1 and 11.1.4.1-52T-2, guide rail 11.1.4.1-44T may be biased leftward so that the surface of guide rail 11.1.4.1-44T contacts the inner surface of opening 11.1.4.1-50T at nominal biasing location 11.1.4.1-68 (e.g., a location on the surface of opening 11.1.4.1-50T that faces the user and the eye boxes associated with device 11.1.4.1-10). The force of gravity tends to pull downwardly (in the −Z direction of FIG. 11.1.4.1-7) on guide rail 11.1.4.1-44T. To compensate for the force of gravity and thereby ensure that location 11.1.4.1-68 is located on the left side of guide rail 11.1.4.1-44T (facing the user and eye box 11.1.4.1-36) as shown in FIG. 11.1.4.1-7, biasing element 11.1.4.1-54T-1 may be stronger than biasing element 11.1.4.1-54T-2.

During operation of device 11.1.4.1-10, a user's face and/or other external objects may impose forces on optical modules 11.1.4.1-30. This gives rise to a potential for three different types of misalignment between the left and right optical modules in device 11.1.4.1-10.

Rotation of optical modules 11.1.4.1-30 about the X axis, which may sometimes be referred to as splay, may cause a first type of misalignment in which one image appears at a different height than the other image. For example, splay may rotate the left eye image from the left optical module up relative to the left eye box while rotating the right eye image from the right optical module down relative to the right eye box.

Rotation of optical modules 11.1.4.1-30 about the Y axis, which may sometimes be referred to as image rotation, may produce a second type of misalignment in which the left and/or right images from modules 11.1.4.1-30 to appear tilted relative to the horizon. For example, the left eye image may be rotated counterclockwise and the right eye image may be rotated clockwise.

Another type of misalignment that may arise between optical modules 11.1.4.1-30 relates to rotation of one or both of optical modules 11.1.4.1-30 about the Z axis. This type of misalignment, which may sometimes be referred to as vergence, may be characterized by situations in which the left and/or right optical module points too far to the left or right in the X-Y plane.

All of these types of misalignment are preferably maintained at low levels (e.g., below +/−0.5°, below +/−0.4°, below +/−0.3°, or below +/−0.2°, as examples). In some situations, splay is the most undesired type of misalignment for users, so minimization of splay may be particular helpful in enhancing user comfort.

The use of guide rail biasing systems such as the illustrative biasing systems of FIGS. 11.1.4.1-6A, 11.1.4.1-6B, and 11.1.4.1-7 may help minimize optical module misalignment. When biasing systems 11.1.4.1-52T-1 and 11.1.4.1-52T-2 perform satisfactorily, the left optical module will be biased against upper rail 11.1.4.1-44T at a location such as location 11.1.4.1-68 of FIG. 11.1.4.1-7 and will be biased against lower rail 11.1.4.1-44B at a location such as location 11.1.4.1-62 of FIG. 11.1.4.1-6A or FIG. 11.1.4.1-6B, whereas the right optical module will likewise be biased against upper rail 11.1.4.1-44T at a location such as location

11.1.4.1-68 of FIG. 11.1.4.1-7 and will be biased against lower rail 11.1.4.1-44B at a location such as location 11.1.4.1-62 of FIG. 11.1.4.1-6A or FIG. 11.1.4.1-6B. In this case, both the left and right optical modules will have the same position relative to guide rails 11.1.4.1-44T and 11.1.4.1-44B and there will be no splay. A potential for splay may arise when stress from a drop event or other unexpected excessive force causes a biasing system to fail.

Consider, as an example, a worse case splay scenario in which biasing system 11.1.4.1-52T-2 in the left optical module fails due to excessive force and in which biasing system 11.1.4.1-52T-1 in the right optical module fails due to excessive force. Although this type of asymmetric failure changes the biasing locations of the left and right optical modules, the biasing arrangement of FIG. 11.1.4.1-7 helps prevent undesired splay from arising. Failure of biasing system 11.1.4.1-52T-2 in the left optical module will cause guide rail 11.1.4.1-44T in the left optical module to be positioned against the inner surface of opening 11.1.4.1-50T at location 11.1.4.1-72, whereas failure of biasing system 11.1.4.1-52T-1 in the right optical module will cause guide rail 11.1.4.1-44T in the right optical module to be positioned against the inner surface of opening 11.1.4.1-50T at a different location such as location 11.1.4.1-70.

In the example of FIG. 11.1.4.1-7, system 11.1.4.1-52T-2 is located at an angle A=+45° relative to the Y axis and system 11.1.4.1-52T-1 is located at an angle A=−45° relative to the Y axis. When systems 11.1.4.1-52T-2 and 11.1.4.1-52T-1 are operating satisfactorily, guide rail 11.1.4.1-44T will therefore press against the inner side wall of opening 11.1.4.1-50T at location 11.1.4.1-68. When opening 11.1.4.1-50T in the left optical module contacts rail 11.1.4.1-44T at location 11.1.4.1-72 while opening 11.1.4.1-50T in the right optical module contacts rail 11.1.4.1-44T at location 11.1.4.1-70, both the left and right optical modules will be positioned more to the right (in the orientation of FIG. 11.1.4.1-7) than when in their desired nominal biased position. Lower guide rod 11.1.4.1-44B is biased satisfactorily at location 11.1.4.1-62 with respect to lower optical module portion 11.1.4.1-30B for both the left and right optical modules (in this example). As a result, both the left and right optical modules will tip forward slightly (rotating a small amount about the X axis), under outward pressure from the user's face. Although both the left and right optical modules tilt forward in this way, the amount of tilt of the left optical module, which is dictated by the lateral displacement of rail 11.1.4.1-44T experienced when rail 11.1.4.1-44T contacts opening 11.1.4.1-50T at position 11.1.4.1-72, is equal to the amount of tilt of the right optical module, which is dictated by the lateral displacement of rail 11.1.4.1-44T experienced when rail 11.1.4.1-44T contacts opening 11.1.4.1-50T at position 11.1.4.1-70. No splay will therefore result. Because the configuration of the biasing systems of FIG. 11.1.4.1-7 tends to prevent splay from arising, this configuration may sometimes be referred to as a splay-optimized or splay-immune biasing scheme. Other biasing schemes may be used, if desired (e.g., schemes for the upper guide rail that have more biasing systems per optical module, schemes with fewer biasing systems per optical module, schemes in which the biasing systems press in different directions such as the +Z direction, −Y direction, etc.). The configuration of FIG. 11.1.4.1-7 is illustrative.

FIGS. 11.1.4.1-8 and 11.1.4.1-9 show how a kinematic mounting scheme may be used to couple guide rails 11.1.4.1-44 and optical modules 11.1.4.1-30. As shown in FIG. 11.1.4.1-8, upper guide rails 11.1.4.1-44T may be biased in the −Y direction by biasing system 11.1.4.1-70. Biasing system 11.1.4.1-70 may include biasing element 11.1.4.1-72 and movable biasing member 11.1.4.1-74 that contacts an adjacent portion of guide rail 11.1.4.1-44T and pushes guide rail 11.1.4.1-44T in direction 11.1.4.1-78 or may include other biasing structures (e.g., a leaf spring, compressed foam, etc.). Biasing system 11.1.4.1-80 may have a biasing element such as biasing element 11.1.4.1-82 that pushes biasing member 11.1.4.1-84 (e.g., a cylindrical pin) in direction 11.1.4.1-86 until motion of member 11.1.4.1-84 is stopped by stop structures 11.1.4.1-88. Biasing system 11.1.4.1-90 may have a biasing element such as biasing element 11.1.4.1-92 that pushes biasing member 11.1.4.1-94 in direction 11.1.4.1-96 until motion of member 11.1.4.1-94 is stopped by stop structures 11.1.4.1-88. In this configuration, guide rail 11.1.4.1-44T is biased into contact with member 11.1.4.1-84 at known location 11.1.4.1-100 and into contact with member 11.1.4.1-94 at known location 11.1.4.1-102. Lower guide rail 11.1.4.1-44B may be biased to known location 11.1.4.1-62 using a biasing system such as system 11.1.4.1-52B of FIG. 11.1.4.1-6A or FIG. 11.1.4.1-6B.

FIG. 11.1.4.1-9 is a rear view of optical module 11.1.4.1-30 with this type of kinematic rail mounting arrangement. As shown in FIG. 11.1.4.1-9, there may be two of biasing systems 11.1.4.1-80 in portion 11.1.4.1-30T of module 11.1.4.1-30 and two of biasing systems 11.1.4.1-90 in portion 11.1.4.1-30T of module 11.1.4.1-30 in addition to two of biasing systems 11.1.4.1-70. This establishes a first pair of known contact locations towards the right end of rail 11.1.4.1-44T (e.g., a first location 11.1.4.1-100 and a first location 11.1.4.1-102) and, establishes a second pair of known contact locations at a different location along the length of rail 11.1.4.1-44T such as towards the left end of rail 11.1.4.1-44T (e.g., a second location 11.1.4.1-100 and a second location 11.1.4.1-102). In lower portion 11.1.4.1-30B, the location of optical module relative to guide rail 11.1.4.1-44B is established at known location 11.1.4.1-62. Determining these five known locations on optical module 11.1.4.1-30 where rails 11.1.4.1-44 contact module 11.1.4.1-30 (e.g., two locations 11.1.4.1-100 in upper portion 11.1.4.1-30T, two locations 11.1.4.1-102 in upper portion 11.1.4.1-30T, and one location 11.1.4.1-62 in lower portion 11.1.4.1-30B), helps constrain five of the six degrees of freedom for motion of module 11.1.4.1-30 relative to rails 11.1.4.1-44 and the other support structures of device 11.1.4.1-10. The sixth degree of freedom (motion along the X axis) is not constrained except by operation of actuator 11.1.4.1-13, so that actuator 11.1.4.1-13 may be used to adjust the X-axis location of module 11.1.4.1-30 to accommodate different user interpupillary distances.

If desired, control circuitry 11.1.4.1-20 may use one or more sensors 11.1.4.1-16 to monitor the location of optical modules 11.1.4.1-30. If misalignment is detected, corresponding action can be taken. For example, positioners may be adjusted to correct for the misalignment, image data for a display and/or camera may be warped to compensate for misalignment, alerts may be provided to the user and/or others, etc.

An illustrative optical module sensor system is shown in FIGS. 11.1.4.1-10 and 11.1.4.1-11. FIG. 11.1.4.1-10 is a perspective view of an illustrative guide rail position sensor. Sensor 11.1.4.1-120 of FIG. 11.1.4.1-10 has a biasing member such as leaf spring member 11.1.4.1-122 with a protruding portion such as portion 11.1.4.1-124. Strain gauge 11.1.4.1-126 may be coupled to member 11.1.4.1-122 and may be monitored by control circuitry 11.1.4.1-20 to detect bending in member 11.1.4.1-122. As shown in FIG. 11.1.4.1-

11, sensor 11.1.4.1-120 of FIG. 11.1.4.1-10 may be attached to optical module 11.1.4.1-30 with a fastener such as screw 11.1.4.1-128 or other attachment mechanism so that protruding portion 11.1.4.1-124 protrudes into opening 11.1.4.1-50 and into contact an adjacent surface of guide rail 11.1.4.1-44. Changes in the position of guide rail 11.1.4.1-44 will result in changes in the detected strain by sensor 11.1.4.1-120, so sensor 11.1.4.1-120 can monitor the position of guide rail 11.1.4.1-44 relative to optical module 11.1.4.1-30 along axis 11.1.4.1-130. If desired, additional sensors such as sensor 11.1.4.1-120 may be located at additional positions about rail 11.1.4.1-44 (see, e.g., illustrative orthogonal position 11.1.4.1-120' of FIG. 11.1.4.1-11, which allows position measurements along axis 11.1.4.1-132).

11.1.4.2: Lower Guide Rods

FIG. 11.1.4.2-1 illustrates a subassembly of an HMD 11.1.4.2-100 including a display bracket 11.1.4.2-106 having upper arms **11.1.4.2-110*a*, 11.1.4.2-110*b* extending outward in opposite directions and lower arms 11.1.4.2-112*a*, 11.1.4.2-112*b* extending in opposite directions, respectively. The subassembly can include a first optical module 11.1.4.2-108*a* slidably coupled to the display bracket 11.1.4.2-106 at a first upper guide-rod 11.1.4.2-102*a* and a first lower guide-rod 11.1.4.2-104*a* as well as a second optical module 11.1.4.2-108*b* slidably coupled to the display bracket 11.1.4.2-106 at a second upper guide rod 11.1.4.2-102*b* and a second lower guide-rod 11.1.4.2-104*b*. The first and second optical modules 11.1.4.2-108*a-b* can be adjusted laterally relative to one another and/or the display bracket 11.1.4.2-106 along the guide-rods 11.1.4.2-102*a-b*, 11.1.4.2-104*a-b* during IPD adjustments. The first and second upper guide-rods 11.1.4.2-102*a-b* can be part of an upper guide-rod assembly 11.1.4.2-102 and the first and second lower guide-rods 11.1.4.2-104*a-b* can be part of a lower guide-rod assembly 11.1.4.2-104**.

Any of the features, components, and/or parts, including the arrangements and configurations thereof shown in FIG. 11.1.4.2-1 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.4.2-1.

11.1.4.2.1: Electrical Contacts

FIG. 11.1.4.2.1-1 illustrates a lower guide-rod system 11.1.4.2.1-102 of an HMD 11.1.4.2.1-100 including a lower guide-rod 11.1.4.2.1-106 configured to guide the movement of an optical module 11.1.4.2.1-104 In at least one example, the lower guide-rod system 11.1.4.2.1-102 also includes a stop 11.1.4.2.1-108 similar to other stops described herein, for protecting the cantilevered guide-rod 11.1.4.2.1-106, which does not make contact with the stop 11.1.4.2.1-108 during normal use but through which the distal end of the guide-rod 11.1.4.2.1-106 may extend to contact the stop 11.1.4.2.1-108 in a drop event or other circumstance causing a deflection of the distal end of the guide-rod 11.1.4.2.1-106. In at least one example, stop 11.1.4.2.1-108 can also prevent the optical module 11.1.4.2.1-104 from travelling too far along the guide-rod 11.1.4.2.1-106.

In at least one example, the lower guide-rod system 11.1.4.2.1-102 can also include an electrical contact 11.1.4.2.1-110 biased against the guide-rod 11.1.4.2.1-106. The biased electrical contact 11.1.4.2.1-110 can thus maintain contact with the guide-rod 11.1.4.2.1-106 during operation, including movements, vibrations, and other disturbances in the position of the guide-rod 11.1.4.2.1-106 during use. The biased electrical contact 11.1.4.2.1-110 can maintain electrical contact for electrical grounding purposes and for forming other electrical pathways between the guide-rod 11.1.4.2.1-106 and other components of the HMD 11.1.4.2.1-100.

Any of the features, components, and/or parts, including the arrangements and configurations thereof shown in FIG. 11.1.4.2.1-1 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.4.2.1-1.

11.1.4.2.2: Biasing Members

FIG. 11.1.4.2.2-1 illustrates a perspective view of an example of an adjustment mechanism or assembly 11.1.4.2.2-100 including a lower guide-rod 11.1.4.2.2-102 and a stop 11.1.4.2.2-104. The adjustment assembly 11.1.4.2.2-100 can also include a spring 11.1.4.2.2-106 biasing the guide-rod 11.1.4.2.2-106 passing through the stop 11.1.4.2.2-104. The spring 11.1.4.2.2-106 can press the guide-rod 11.1.4.2.2-106 against the stop 11.1.4.2.2-104 to remove any slack or play between the guide-rod 11.1.4.2.2-102 and the stop 11.1.4.2.2-104 during use while allowing some flexure of the guide-rod 11.1.4.2.2-102. In at least one example, the spring 11.1.4.2.2-106 can be a conductive biasing member maintaining contact with the guide-rod 11.1.4.2.2-102 for electrical grounding or providing other electrical pathways between the guide-rod 11.1.4.2.2-102 and one or more other components of the HMD.

Any of the features, components, and/or parts, including the arrangements and configurations thereof shown in FIG. 11.1.4.2.2-1 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.1.4.2.2-1.

11.2: Barrels and Baskets 11.2.1: Lens Mounting Systems

The lenses may be mounted in a head-mounted device using support structures that help minimize lens stress. In an illustrative embodiment, the lenses are mounted in rigid lens supports such as metal lens barrels using lens mounts based on flexures. The flexures help prevent stress from being applied to the lenses even when the electronic devices are subjected to changes in operating temperature that cause the lenses to expand and contract.

FIG. 11.2.1-1 is a schematic diagram of an illustrative electronic device of the type that may include lenses mounted with flexures. Device 11.2.1-10 of FIG. 11.2.1-1 may be a head-mounted device (e.g., goggles, glasses, a helmet, and/or other head-mounted device. In an illustrative configuration, device 11.2.1-10 is a head-mounted device such as a pair of goggles (sometimes referred to as virtual reality goggles, mixed reality goggles, augmented reality glasses, etc.).

As shown in the illustrative cross-sectional top view of device 11.2.1-10 of FIG. 11.2.1-1, device 11.2.1-10 may have a housing such as housing 11.2.1-12 (sometimes referred to as a head-mounted support structure, head-mounted housing, or head-mounted support). Housing 11.2.1-12 may include a front portion such as front portion 11.2.1-12F and a rear portion such as rear portion 11.2.1-12R. When device 11.2.1-10 is worn on the head of a user, rear portion 11.2.1-12R rests against the face of the user and helps block stray light from reaching the eyes of the user.

Main portion 11.2.1-12M of housing 11.2.1-12 may be attached to head strap 11.2.1-12T. Head strap 11.2.1-12T may be used to help secure main portion 11.2.1-12 on the head and face of a user. Main portion 11.2.1-12M may have a rigid shell formed from housing walls of polymer, glass, metal, and/or other materials. When housing 11.2.1-12 is being worn on the head of a user, the front of housing 11.2.1-12 may face outwardly away from the user and the rear of housing 11.2.1-12 (and rear portion 11.2.1-12R) may face towards the user. In this configuration, rear portion 11.2.1-12R may face the user's eyes located in eye boxes 11.2.1-36.

Device 11.2.1-10 may have electrical and optical components that are used in displaying images to eye boxes 11.2.1-36 when device 11.2.1-10 is being worn. These components may include left and right optical assemblies 11.2.1-20 (sometimes referred to as optical modules). Each optical assembly 11.2.1-20 may have an optical assembly support 11.2.1-38 (sometimes referred to as a lens barrel, optical module support, or support structure). Supports 11.2.1-38 may have hollow tubular shapes or other suitable shapes. Optical assemblies 11.2.1-20 may slide laterally along guide rails to adjust optical-assembly-to-optical-assembly separation to accommodate different user interpupillary distances. Rear portion 11.2.1-12R may include flexible structures (e.g., a flexible polymer layer, a flexible fabric layer, etc.) so that portion 11.2.1-12R can stretch to accommodate movement of assemblies 11.2.1-20.

Each assembly 11.2.1-20 may have a display 11.2.1-32 coupled to one end of support 11.2.1-38 and a lens mounted to an opposing end of support 11.2.1-38. Display 11.2.1-32 has an array of pixels for displaying images. Lens 11.2.1-34 may optionally have a removable vision correction lens for correcting user vision defects (e.g., refractive errors such as nearsightedness, farsightedness, and/or astigmatism). During operation, images displayed by displays 11.2.1-32 may be presented to eye boxes 11.2.1-36 through lenses 11.2.1-34 for viewing by the user.

To help satisfy design constraints (e.g., low weight, compact size, wide field of view, high resolution, etc.), lenses 11.2.1-34 may be catadioptric lenses. A catadioptric lens incorporates optical components such as polarizers and wave plates to create a folded optical path that can help reduce lens size. The use of these polarization-sensitive optical components may, however, make lenses 11.2.1-34 sensitive to performance degradation due to stress-induced birefringence effects. Lenses 11.2.1-34 may, as an example, include lens elements formed from polymers (for example, COC polymer (cyclic olefin copolymer) or other suitable polymers) that help minimize lens weight, but these polymers may exhibit birefringence when subjected to excess stress.

Satisfactory operation for lenses 11.2.1-34 may be achieved by mounting lenses 11.2.1-34 using lens mounts that help isolate lenses 11.2.1-34 from sources of stress. In an illustrative configuration, supports 11.2.1-38 may be formed from strong rigid materials such as metal (e.g., aluminum, etc.). When operating device 11.2.1-10 over wide temperature ranges (e.g., 0-50° C.), there is a risk that expansion and contraction of materials in assemblies 11.2.1-20 and, more particularly, mismatches in the coefficient of thermal expansion between the polymer of lenses 11.2.1-34 and the metal of supports 11.2.1-38, can give rise to unwanted stress in lenses 11.2.1-34, leading to unwanted stress-induced birefringence in lenses 11.2.1-34. Unwanted temperature-change-induced stress may be avoided by mounting lenses 11.2.1-34 within supports 11.2.1-38 using lens mounts based on flexures.

FIG. 11.2.1-2 is a front view of an illustrative lens for device 11.2.1-10. A shown in FIG. 11.2.1-2, lens 11.2.1-34 may be surrounded by flexible lens mount 11.2.1-40. Lens mount 11.2.1-40 may include one or more flexures. In an illustrative embodiment, lens mount 11.2.1-40 contains a ring-shaped flexure that runs around the entire perimeter of lens 11.2.1-34. Arrangements in which mount 11.2.1-40 includes a number of separate segments (see, e.g., illustrative segment SG) each of which has a separate strip-shaped flexure segment or in which mount 11.2.1-40 includes discrete flexures such as illustrative discrete flexure DL (e.g., a set of three discrete flexures attached to the periphery of lens 11.2.1-34 at three evenly spaced locations along the periphery) may also be used. Support 11.2.1-38 may be attached to mount 11.2.1-40 along the outer peripheral edge of mount 11.2.1-40 or support 11.2.1-38 may be attached to mount 11.2.1-40 where support 11.2.1-38 overlaps mount 11.2.1-40 (see, e.g., FIG. 11.2.1-3).

FIG. 11.2.1-3 is a cross-sectional side view of an illustrative peripheral portion of lens 11.2.1-38 and mount 11.2.1-40 of FIG. 11.2.1-2 taken along line 11.2.1-42 of FIG. 11.2.1-2 and viewed in direction 11.2.1-44. As shown in FIG. 11.2.1-3, support (lens barrel) 11.2.1-38 may be overlapped by mount 11.2.1-40. Mount 11.2.1-40 may be formed from polymer, metal, or other material that is shaped to form a flexure. In the example of FIG. 11.2.1-3, mount 11.2.1-40 is a ring-shaped flexure with a U-shaped cross section that runs along the ring-shaped peripheral edge of lens 11.2.1-34. First portion 11.2.1-40-1 of the flexure is attached to the peripheral edge of lens 11.2.1-34 with a first ring of adhesive 11.2.1-50 and second portion 11.2.1-40-2 of the flexure is attached to support 11.2.1-38 with a second ring of adhesive 11.2.1-52. Bend 11.2.1-40-3 runs along mount 11.2.1-40 between portions 11.2.1-40-1 and 11.2.1-4-2 and allows mount 11.2.1-40 to flex. For example, portion 11.2.1-40-1 may move radially outwardly towards portion 11.2.1-40-2 when lens 11.2.1-34 expands radially due to an increase in operating temperature. The metal of support 11.2.1-38 has a significantly lower coefficient of thermal expansion than the polymer of lens 11.2.1-34, but is separated by an air gap from the edge of lens 11.2.1-34, so that lens 11.2.1-34 can expand radially outwardly without contacting support 11.2.1-38 and is therefore not stressed due to pressure from contact with support 11.2.1-38.

Mount 11.2.1-40 may, if desired, be formed from a material such as polyetherimide (PEI) or other rigid polymer that exhibits a high yield strength and a high elongation-to-failure value. The elastic modulus of the material forming mount 11.2.1-40 may be, for example, at least 1.5 GPa, at least 2 GPa, or at least 3 GPa, as examples. The high strength and high rigidity of the material forming mount 11.2.1-40 helps mount 11.2.1-40 accurately hold lens 11.2.1-34 in place. The material of mount 11.2.1-40 may exhibit a yield strength (e.g., at least 30 MPa, at least 70 MPa, or at least 100 MPa), so that mount 11.2.1-40 exhibits a good yield-strength-to-stiffness ratio. To provide mount 11.2.1-40 with satisfactory durability, it may be desirable for the material of mount to have an elongation-to-failure value of at least 25%, at least 35%, or at least 40%. To ensure satisfactory attachment of mount 11.2.1-40 with adhesive 11.2.1-52 and 11.2.1-50, the material of mount 11.2.1-40 preferably also exhibits satisfactory compatibility (bond strength) with adhesives 11.2.1-52 and 11.2.1-50. Adhesives 11.2.1-52 and 11.2.1-50 may be, for example, epoxy, so the material of mount 11.2.1-40 preferably forms satisfactory bonds with epoxy. The coefficient of thermal expansion of the material of mount 11.2.1-40 may be matched (e.g., within 20%, within 10%, within 5%, or within 2%) to the coefficient of thermal expansion of the material of lens 11.2.1-34. In this way, lens stress can be avoided that might otherwise be imposed by mount 11.2.1-40 on lens 11.2.1-34 if, for example, the perimeter of mount 11.2.1-40 were to expand less quickly than the perimeter of lens 11.2.1-34 as a function of increasing operating temperature and thereby constrain the expansion of lens 11.2.1-34. Other types of materials may be used in forming mount 11.2.1-40, if desired. The use of polyetherimide that is matched to the polymer of lens 11.2.1-34 in its coefficient of thermal expansion and that exhibits high yield strength and high elongation-to-failure values is illustrative.

If desired, thermally induced lens stress may be minimized using a reverse flange adhesive attachment arrangement of the type shown in FIG. 11.2.1-4. With this type of arrangement, lens 11.2.1-34 may be provided with a milled flange that is bonded to a surface of support 11.2.1-38 that faces radially outward (away from lens 11.2.1-34). As shown in FIG. 11.2.1-4, adhesive 11.2.1-50 (e.g., a soft adhesive) may be used to attach outwardly facing surface 11.2.1-53 of support 11.2.1-38 to opposing inwardly faced milled flange surface 11.2.1-54 of lens 11.2.1-34. An air gap such as air gap 11.2.1-56 is preferably present between outer peripheral edge surface 11.2.1-58 of lens 11.2.1-34 and opposing inwardly facing surface 11.2.1-60 of support 11.2.1-38, thereby ensuring that the periphery of lens 11.2.1-34 (surface 11.2.1-58) will not contact support 11.2.1-38 and will therefore not receive stress from support 11.2.1-38 even as lens 11.2.1-34 expands radially outward as a function of increasing operating temperature.

If desired a set of discretely located flexures such as the illustrative flexures of FIGS. 11.2.1-5 and 11.2.1-6 may also be used in supporting lens 11.2.1-34 (e.g., at three points along the perimeter of lens 11.2.1-34). In the examples of FIGS. 11.2.1-5 and 11.2.1-6, lens 11.2.1-34 is viewed from the rear of device 11.2.1-10 (e.g., along the Z axis). One side of illustrative flexures 11.2.1-64 and 11.2.1-66 may be attached to the periphery of lens 11.2.1-34 using adhesive 11.2.1-68 and another side of flexures 11.2.1-64 and 11.2.1-66 may be attached to support 11.2.1-38 (e.g., using adhesive, screws or other fasteners, etc.). During fluctuations in operating temperature, lens 11.2.1-34 may expand radially outward and may contract radially inward. With the flexure arrangements of FIGS. 11.2.1-5 and 11.2.1-6, flexures 11.2.1-64 and 11.2.1-66 may radially flex to accommodate the lens expansion and contraction, while accurately maintaining a desired mounting location for lens 11.2.1-34 within support 11.2.1-38. In arrangements in with flexures are located at discrete locations around the periphery of lens 11.2.1-34 (e.g., three discrete locations), sealing structures (e.g., ring-shaped elastomeric boots) may be used to help seal the periphery of lens 11.2.1-34 against support 11.2.1-38 and thereby prevent dust and moisture ingress into assembly 11.2.1-20. As with the ring-shaped flexure of FIGS. 11.2.1-2 and 11.2.1-3, the discrete flexures of FIGS. 11.2.1-5 and 11.2.1-6 may be used to maintain lens 11.2.1-34 in a satisfactory position (without significant lateral shifting in X and Y position and without significant tilt away from the Z axis) while flexing to accommodate expansion and contraction due to temperature changes. The strength of mount 11.2.1-40 may help assemblies 11.2.1-20 resist plastic deformation and other damage during drop events and other undesired impacts leading to excessive stress.

FIGS. 11.2.1-7, 11.2.1-8, 11.2.1-9, and 11.2.1-10 are illustrative cross-sectional side views of illustrative flexures for mount 11.2.1-40. The flexures of FIGS. 11.2.1-7, 11.2.1-8, 11.2.1-9, and 11.2.1-10 may extend in a continuous ring around the periphery of lens 11.2.1-34, may be formed from a number of segments that extend around lens 11.2.1-34, or may be formed from discretely located flexures (as shown, for example, in FIGS. 11.2.1-5 and 11.2.1-6). In the arrangements of FIGS. 11.2.1-7, 11.2.1-8, and 11.2.1-9, mount 11.2.1-40 has a U-shaped cross-sectional shape.

In the example of FIG. 11.2.1-7, screw 11.2.1-70 attaches mount (flexure) 11.2.1-40 to support 11.2.1-38 and adhesive 11.2.1-78 attaches mount 11.2.1-40 to lens 11.2.1-34. When using a screw such as screw 11.2.1-70 to attach mount 11.2.1-40 to support 11.2.1-38 instead of adhesive, a separate seal such as seal 11.2.1-72 may be used to seal lens 11.2.1-34 to support 11.2.1-38 and thereby help prevent moisture and dust ingress into the interior of assembly 11.2.1-20. Seal 11.2.1-72 may be an O-ring formed from an elastomeric gasket material, may be a ring of adhesive (e.g., pressure sensitive adhesive or other soft sealing adhesive), or may be other sealant. If desired, adhesive 11.2.1-76 may be provided at the interface between mount 11.2.1-40 and support 11.2.1-38 (e.g., epoxy or other rigid adhesive) and may be used both to attach mount 11.2.1-40 to support 11.2.1-38 and to seal mount 11.2.1-40 to support 11.2.1-38. The use of screws such as screw 11.2.1-70 of FIG. 11.2.1-7 to attach mount 11.2.1-40 to support 11.2.1-38 is illustrative.

The illustrative configurations of FIGS. 11.2.1-8, 11.2.1-9, and 11.2.1-10 may also involve the use of screws 11.2.1-70, adhesive 11.2.1-76, and/or seal 11.2.1-72 to attach and seal mount 11.2.1-40 to support 11.2.1-38. In the example of FIG. 11.2.1-8, mount 11.2.1-40 protrudes inwardly under the outer edge of lens 11.2.1-34. In the example of FIG. 11.2.1-9, screw 11.2.1-70 extends radially inward towards the center of lens 11.2.1-34. In the example of FIG. 11.2.1-10, the flexure formed by mount 11.2.1-40 does not have a central bend, but rather relies on its length to ensure that sufficient flexure bending is available to accommodate radial outward expansion of lens 11.2.1-34 as operating temperatures rise.

The diagram of FIG. 11.2.1-11 shows how adhesive 11.2.1-78 may be dispensed to attach mount 11.2.1-40 to the outer edge of lens 11.2.1-34. In the example of FIG. 11.2.1-11, lens 11.2.1-34 and mount 11.2.1-40 have been flipped upside down relative to the orientation of FIG. 11.2.1-3. As shown in FIG. 11.2.1-11, mount 11.2.1-40 may have a chamfer such as chamfer 11.2.1-84 that locally widens the gap between lens 11.2.1-34 and mount 11.2.1-40 to facilitate the introduction of liquid adhesive into this gap. Adhesive may be dispensed in liquid form in direction 11.2.1-82 from dispenser 11.2.1-80 and may then be drawn into the gap between mount 11.2.1-40 and lens 11.2.1-34 by capillary action. After the liquid adhesive material has been drawn into the gap, the adhesive may be cured to form adhesive 11.2.1-78 (e.g., using ultraviolet light curing, curing using a two-part adhesive arrangement, etc.). To help control the downward progress of adhesive 11.2.1-78 while adhesive 11.2.1-78 is liquid, mount 11.2.1-40 may be provided with a stop feature such as step 11.2.1-86. The presence of step 11.2.1-86 on the inwardly facing surface of mount 11.2.1-40 creases a surface tension break that stops the downward flow of adhesive 11.2.1-78 when flowing into the joint between lens 11.2.1-34 and mount 11.2.1-40. In this way, the dispensing of adhesive 11.2.1-78 may be limited to a desired bonding area between mount 11.2.1-40 and lens 11.2.1-34.

11.3: Rear-Facing Cameras

11.3.1: Optical Module for Head-Mounted Device

One aspect of the disclosure is an optical module for a head-mounted device that is configured to present content to a user. The optical module includes an optical module housing assembly, a display assembly, and an eye camera. The optical module housing assembly has a first end and a second end. The lens is connected to the optical module housing assembly and positioned at the first end of the optical module housing assembly. The display assembly is connected to the optical module housing assembly and is positioned at the second end of the optical module housing assembly. The display assembly is configured to cause the content to be displayed to the user through the lens. The eye camera is connected to the optical module housing assembly and is positioned at the second end of the optical module housing assembly. The eye camera is configured to obtain images through the lens.

In some implementations of the optical module, the optical module housing assembly includes a first portion that is connected to a second portion, and the lens is retained between the first portion and the second portion. In some implementations of the optical module, projections are defined on the lens and channels are defined on the first portion of the optical module housing assembly such that the projections are located in the channels and engage the first portion of the optical module housing assembly within the channels to secure the lens relative to the optical module housing assembly and restrain movement of the lens relative to the optical module housing assembly. In some implementations of the optical module, the lens and the display assembly are connected to the optical module housing assembly in a side-by-side arrangement. In some implementations of the optical module, the optical module housing assembly defines an internal space between the lens and the display assembly.

In some implementations of the optical module, the optical module also includes a vent port that allows air to travel between the internal space and an outside environment, and a filter element that restrains foreign particles from entering the internal space. In some implementations of the optical module, the optical module also includes a dust trap that is located in the internal space and is configured to retain foreign particles.

In some implementations of the optical module, the optical module also includes a fiducial marker that is formed on the lens and is visible in images obtained by the eye camera for use in calibration. In some implementations of the optical module, the lens is a catadioptric lens. In some implementations of the optical module, the lens is a part of a catadioptric optical system.

Another aspect of the disclosure is an optical module for a head-mounted device that is configured to present content to a user. The optical module includes an optical module housing assembly that defines an internal space, a lens that is connected to the optical module housing assembly, a display assembly that is connected to the optical module housing assembly. The display assembly is configured to cause the content to be displayed to the user through the lens. An infrared emitter is located between the lens and the display assembly in the internal space of the optical module housing assembly. The infrared emitter is configured to emit infrared radiation through the lens.

In some implementations of the optical module, the infrared emitter includes a flexible circuit and emissive components that are connected to the flexible circuit and are configured to emit infrared radiation. In some implementations of the optical module, wherein the emissive components are arranged in an array around an optical axis of the optical module housing assembly. In some implementations of the optical module, the flexible circuit extends through an electrical port that is formed through the optical module housing assembly and a sealing element is formed on the flexible circuit and is engaged with the optical module housing assembly at the electrical port. In some implementations of the optical module, the optical module housing assembly defines an optical pathway opening that is adjacent to the display assembly and is configured to allow light to pass from the display assembly to the lens, a base surface that extends around the optical pathway opening, wherein the infrared emitter is located on the base surface, and a peripheral wall that is located outward from the base surface.

In some implementations of the optical module, the optical module also includes an eye camera that is configured to obtain images that show reflected portions of the infrared radiation that is emitted by the infrared emitter. In some implementations of the optical module, the eye camera is connected to the optical module housing assembly and is configured to obtain the images through the lens. In some implementations of the optical module, the lens is a catadioptric lens. In some implementations of the optical module, the lens is a part of a catadioptric optical system.

Another aspect of the disclosure is a head-mounted device that is configured to present content to a user. The head-mounted device includes a housing, a first optical module that is located in the housing, and a second optical module that is located in the housing. An interpupillary distance adjustment assembly supports the first optical module and the second optical module with respect to the housing to allow adjustment of a distance between the first optical module and the second optical module. The head-mounted device also includes a first front-facing camera that is connected to the first optical module and is movable in unison with the first optical module by the interpupillary distance adjustment assembly, and a second front-facing camera that is connected to the second optical module and is movable in unison with the second optical module by the interpupillary distance adjustment assembly. Adjustment of the distance between the first optical module and the second optical module by the interpupillary distance adjustment assembly also adjusts a distance between the first front-facing camera and the second front-facing camera.

In some implementations of the head-mounted device, the housing includes one or more optically transmissive panels through which the first front-facing camera and the second front-facing camera may obtain images of an environment.

In some implementations of the head-mounted device, an optical axis of the first front-facing camera is aligned with an optical axis of the first optical module and an optical axis of the second front-facing camera is aligned with an optical axis of the second optical module.

In some implementations of the head-mounted device, the first front-facing camera is connected in a fixed relationship with respect to the first optical module, and the second front-facing camera is connected in a fixed relationship with respect to the second optical module.

In some implementations of the head-mounted device, the interpupillary distance adjustment assembly maintains a first spacing between an optical axis of the first optical module and an optical axis of the second optical module generally equal to a second spacing between an optical axis of the first front-facing camera and an optical axis of the second front facing camera during adjustment of the distance between the first optical module and the second optical module.

FIG. 11.3.1-1 is a block diagram that shows an example of a hardware configuration for a head-mounted device 11.3.1-100. The head-mounted device 11.3.1-100 is intended to be worn on the head of a user and includes components that are configured to display content to the user. Components that are included in the head-mounted device 11.3.1-100 may be configured to track motion of parts of the user's body, such as the user's head and hands. Motion tracking information that is obtained by components of the head-mounted device can be utilized as inputs that control aspects of the generation and display of the content to the user, so that the content displayed to the user can be part of a CGR experience in which the user is able to view and interact with virtual environments and virtual objects. In the illustrated example, the head-mounted device 11.3.1-100 includes a device housing 11.3.1-102, a face seal 11.3.1-104, a support structure 11.3.1-106, a processor 11.3.1-108, a memory 11.3.1-110, a storage device 11.3.1-112, a communications device 11.3.1-114, sensors 11.3.1-116, a power source 11.3.1-118, and optical modules 11.3.1-120. The head-mounted device 11.3.1-100 includes two of the optical modules 11.3.1-120, to display content to the user's eyes. The optical modules 11.3.1-120 may each include an optical module housing 11.3.1-122, a display assembly 11.3.1-124, and a lens assembly 11.3.1-126.

The device housing 11.3.1-102 is a structure that supports various other components that are included in the head-mounted device. The device housing 11.3.1-102 may be an enclosed structure such that certain components of the head-mounted device 11.3.1-100 are contained within the device housing 11.3.1-102 and thereby protected from damage.

The face seal 11.3.1-104 is connected to the device housing 11.3.1-102 and is located at areas around a periphery of the device housing 11.3.1-102 where contact with the user's face is likely. The face seal 11.3.1-104 functions to conform to portions of the user's face to allow the support structure 11.3.1-106 to be tensioned to an extent that will restrain motion of the device housing 11.3.1-102 with respect to the user's head. The face seal 11.3.1-104 may also function to reduce the amount of light from the physical environment around the user that reaches the user's eyes. The face seal 11.3.1-104 may contact areas of the user's face, such as the user's forehead, temples, and cheeks. The face seal 11.3.1-104 may be formed from a compressible material, such as open-cell foam or closed cell foam.

The support structure 11.3.1-106 is connected to the device housing 11.3.1-102. The support structure 11.3.1-106 is a component or collection of components that function to secure the device housing 11.3.1-102 in place with respect to the user's head so that the device housing 11.3.1-102 is restrained from moving with respect to the user's head and maintains a comfortable position during use. The support structure 11.3.1-106 can be implemented using rigid structures, elastic flexible straps, or inelastic flexible straps.

The processor 11.3.1-108 is a device that is operable to execute computer program instructions and is operable to perform operations that are described by the computer program instructions. The processor 11.3.1-108 may be implemented using a conventional device, such as a central processing unit, and provided with computer-executable instructions that cause the processor 11.3.1-108 to perform specific functions. The processor 11.3.1-108 may be a special-purpose processor (e.g., an application-specific integrated circuit or a field-programmable gate array) that implements a limited set of functions. The memory 11.3.1-110 may be a volatile, high-speed, short-term information storage device such as a random-access memory module.

The storage device 11.3.1-112 is intended to allow for long term storage of computer program instructions and other data. Examples of suitable devices for use as the storage device 11.3.1-112 include non-volatile information storage devices of various types, such as a flash memory module, a hard drive, or a solid-state drive.

The communications device 11.3.1-114 supports wired or wireless communications with other devices. Any suitable wired or wireless communications protocol may be used.

The sensors 11.3.1-116 are components that are incorporated in the head-mounted device 11.3.1-100 to provide inputs to the processor 11.3.1-108 for use in generating CGR content. The sensors 11.3.1-116 include components that facilitate motion tracking (e.g., head tracking and optionally handheld controller tracking in six degrees of freedom). The sensors 11.3.1-116 may also include additional sensors that are used by the device to generate and/or enhance the user's experience in any way. The sensors 11.3.1-116 may include conventional components such as cameras, infrared cameras, infrared emitters, depth cameras, structured-light sensing devices, accelerometers, gyroscopes, and magnetometers. The sensors 11.3.1-116 may also include biometric sensors that are operable to physical or physiological features of a person, for example, for use in user identification and authorization. Biometric sensors may include fingerprint scanners, retinal scanners, and face scanners (e.g., two-dimensional and three-dimensional scanning components operable to obtain image and/or three-dimensional surface representations). Other types of devices can be incorporated in the sensors 11.3.1-116. The information that is generated by the sensors 11.3.1-116 is provided to other components of the head-mounted device 11.3.1-100, such as the processor 11.3.1-108, as inputs.

The power source 11.3.1-118 supplies electrical power to components of the head-mounted device 11.3.1-100. In some implementations, the power source 11.3.1-118 is a wired connection to electrical power. In some implementations, the power source 11.3.1-118 may include a battery of any suitable type, such as a rechargeable battery. In implementations that include a battery, the head-mounted device 11.3.1-100 may include components that facilitate wired or wireless recharging.

In some implementations of the head-mounted device 11.3.1-100, some or all of these components may be included in a separate device that is removable. For example, any or all of the processor 11.3.1-108, the memory 11.3.1-110, and/or the storage device 11.3.1-112, the communications device 11.3.1-114, and the sensors 11.3.1-116 may be incorporated in a device such as a smart phone that is connected (e.g., by docking) to the other portions of the head-mounted device 11.3.1-100.

In some implementations of the head-mounted device 11.3.1-100, the processor 11.3.1-108, the memory 11.3.1-110, and/or the storage device 11.3.1-112 are omitted, and the corresponding functions are performed by an external device that communicates with the head-mounted device 11.3.1-100. In such an implementation, the head-mounted device 11.3.1-100 may include components that support a data transfer connection with the external device using a wired connection or a wireless connection that is established using the communications device 11.3.1-114.

The components that are included in the optical modules support the function of displaying content to the user in a manner that supports CGR experiences. The optical modules 11.3.1-120 are each assemblies that include multiple components, which include the optical module housing 11.3.1-122, the display assembly 11.3.1-124, and the lens assembly 11.3.1-126, as will be described further herein.

Other components may also be included in each of the optical modules. Although not illustrated in FIGS. 11.3.1-2-3, the optical modules 11.3.1-120 may be supported by adjustment assemblies that allow the position of the optical modules 11.3.1-120 to be adjusted. As an example, the optical modules 11.3.1-120 may each be supported by an interpupillary distance adjustment mechanism that allows the optical modules 11.3.1-120 to slide laterally toward or away from each other. As another example, the optical modules 11.3.1-120 may be supported by an eye relief distance adjustment mechanism that allows adjustment of the distance between the optical modules 11.3.1-120 and the user's eyes.

FIG. 11.3.1-2 is a top view illustration that shows the head-mounted device 11.3.1-100, including the device housing 11.3.1-102, the face seal 11.3.1-104, and the support structure 11.3.1-106. FIG. 11.3.1-3 is a rear view illustration taken along line A-A of FIG. 11.3.1-2. In the illustrated example, the device housing 11.3.1-102 is a generally rectangular structure having a width that is selected to be similar to the width of the head of a typical person, and a height selected so as to extend approximately from the forehead to the base of the nose of a typical person. This configuration is an example, and other shapes and sizes may be used.

An eye chamber 11.3.1-328 is defined by the device housing 11.3.1-102 and is bordered by the face seal 11.3.1-104 at its outer periphery. The eye chamber 11.3.1-328 is open to the exterior of the head-mounted device 11.3.1-100 to allow the user's face to be positioned adjacent to the eye chamber 11.3.1-328, which is otherwise enclosed by the device housing 11.3.1-102. The face seal 11.3.1-104 may extend around part of all of the periphery of the device housing 11.3.1-102 adjacent to the eye chamber 11.3.1-328. The face seal 11.3.1-104 may function to exclude some of the light from the environment around the head-mounted device 11.3.1-100 from entering the eye-chamber 11.3.1-328 and reaching the user's eyes.

In the illustrated example, the support structure 11.3.1-106 is a headband type device that is connected to left and right lateral sides of the device housing 11.3.1-102 and is intended to extend around the user's head. Other configurations may be used for the support structure 11.3.1-106, such as a halo-type configuration in which the device housing 11.3.1-102 is supported by a structure that is connected to a top portion of the device housing 11.3.1-102, engages the user's forehead above the device housing 11.3.1-102, and extends around the user's head, or a mohawk-type configuration in which a structure extends over the user's head. Although not illustrated, the support structure 11.3.1-106 may include passive or active adjustment components, which may be mechanical or electromechanical, that allow portions of the support structure 11.3.1-106 to expand and contract to adjust the fit of the support structure 11.3.1-106 with respect to the user's head.

The optical modules 11.3.1-120 are located in the device housing 11.3.1-102 and extend outward into the eye chamber 11.3.1-328. Portions of the optical modules 11.3.1-120 are located in the eye chamber 11.3.1-328 so that the user can see the content that is displayed by the optical modules 11.3.1-120. The optical modules 11.3.1-120 are located within the eye chamber 11.3.1-328 at locations that are intended to be adjacent to the user's eyes. As an example, the head-mounted device 11.3.1-100 may be configured to position portions of the lens assemblies 11.3.1-126 of the optical modules 11.3.1-120 approximately 15 millimeters from the user's eyes.

FIG. 11.3.1-4 is a perspective view illustration that shows one of the optical modules 11.3.1-120, including the optical module housing 11.3.1-122, the display assembly 11.3.1-124, and the lens assembly 11.3.1-126. The display assembly 11.3.1-124 and the lens assembly 11.3.1-126 are each connected to the optical module housing 11.3.1-122. In the illustrated example, the lens assembly 11.3.1-126 is positioned at a front end of the optical module 11.3.1-120, and the display assembly 11.3.1-124 is positioned at a rear end of the optical module 11.3.1-120. The optical module housing 11.3.1-122 defines an internal space between the display assembly 11.3.1-124 and the lens assembly 11.3.1-126 to allow light to travel from the display assembly 11.3.1-124 to the lens assembly 11.3.1-126 within an environment that is sealed and protected from external contaminants while protecting sensitive components from damage.

The display assembly 11.3.1-124 includes a display screen that is configured to display content, such as images, according to signals received from the processor 11.3.1-108 and/or from external devices using the communications device 11.3.1-114 in order to output CGR content to the user. As an example, the display assembly 11.3.1-124 may output still images and/or video images in response to received signals. The display assembly 11.3.1-124 may include, as examples, an LED screen, an LCD screen, an OLED screen, a micro LED screen, or a micro OLED screen.

The lens assembly 11.3.1-126 includes one or more lenses that direct light to the user's eyes in a manner that allows viewing of CGR content. In some implementations, the lens assembly 11.3.1-126 is a catadioptric optical system that utilizes both reflection and refraction in order to achieve desired optical properties in a small package size. Reflection, in some implementations, may be achieved by internal reflection at boundaries between material layers of a single lens. Thus, in some implementations, the lens assembly 11.3.1-126 may be implemented using a single multi-layered catadioptric lens.

The lens assembly 11.3.1-126 may be positioned partially within the optical module housing 11.3.1-122. As will be explained further herein, the optical module housing 11.3.1-122 may include two or more components that are configured to retain the lens assembly in a desired position and orientation.

FIG. 11.3.1-5 is an exploded side view diagram showing components of an optical module 11.3.1-520 according to a first example. FIG. 11.3.1-5 is a schematic view intended to show the positional relationships between various features and does not include specific structural details of the components of the optical module 11.3.1-520. The optical module 11.3.1-520 can be implemented in the context of a head-mounted display (e.g., the head-mounted device 11.3.1-100) and may be implemented according to the description of the optical module 11.3.1-120 and the further description herein. The optical module 11.3.1-520 includes an optical module housing assembly 11.3.1-522, a display assembly 11.3.1-524, a lens 11.3.1-526, an eye camera 11.3.1-530, and an infrared emitter 11.3.1-532. As will be described further herein, these components are arranged along an optical axis 11.3.1-521 of the optical module 11.3.1-520 such that images generated using the display assembly are projected to the user along the optical axis 11.3.1-521.

Although the lens 11.3.1-526 is described as a single element herein, it should be understood that the lens 11.3.1-526 may be part of an assembly of optical elements or may be an assembly of optical elements, as described with respect to the lens assembly 11.3.1-126. Thus, for example the lens 11.3.1-526 may be a catadioptric lens or the lens 11.3.1-526 may be part of a catadioptric optical system.

The optical module housing assembly 11.3.1-522 may include multiple parts that are connected to each other. In the illustrated example, the optical module housing assembly 11.3.1-522 includes a housing body 11.3.1-534 and a retainer 11.3.1-536. The housing body 11.3.1-534 is configured to be connected to other structures within the housing of a head-mounted display (e.g., in the device housing 11.3.1-102 of the head-mounted device 11.3.1-100). The housing body 11.3.1-534 is also provides a structure to which other components of the optical module 11.3.1-520 may be attached, including the display assembly 11.3.1-524, the eye camera 11.3.1-530 and the infrared emitter 11.3.1-532. The primary portions of the optical module housing assembly 11.3.1-522, such as the housing body 11.3.1-534 and the retainer 11.3.1-536, may be made from a rigid material, such as plastic or aluminum. The optical module housing assembly 11.3.1-522 is arranged around the optical axis 11.3.1-521, and both visible light and infrared radiation may be incident on surfaces of the optical module housing assembly 11.3.1-522. For this reason, portions of the optical module housing assembly 11.3.1-522 may be coated with materials (e.g., paints or other coating materials) that exhibit low reflectance of both visible and infrared wavelengths of electromagnetic radiation.

The retainer 11.3.1-536 is connected to an outer (e.g., user-facing) end of the housing body 11.3.1-534 of the optical module 11.3.1-520. As examples, the retainer 11.3.1-536 may be connected to the housing body 11.3.1-534 by fasteners or by an adhesive. The retainer 11.3.1-536 and the housing body 11.3.1-534 of the optical module housing assembly 11.3.1-522 are configured such that the lens 11.3.1-526 is retained between the retainer 11.3.1-536 and the housing body 11.3.1-534, as will be explained further herein. The retainer 11.3.1-536 and the housing body 11.3.1-534 have ring-like configurations along the optical axis 11.3.1-521 to allow light from the display assembly 11.3.1-524 to pass through the lens 11.3.1-526 and toward the user.

The display assembly 11.3.1-524 includes a seal 11.3.1-538, a bezel 11.3.1-540, a display module 11.3.1-542, a thermal interface 11.3.1-544, and a heat sink 11.3.1-546. The display assembly 11.3.1-524 is connected to the optical module housing assembly 11.3.1-522. As an example, the display assembly 11.3.1-524 may be connected to the optical module housing assembly 11.3.1-522 by screws or other fasteners that allow disassembly of the display assembly 11.3.1-524 from the optical module housing assembly 11.3.1-522 (e.g., to allow for inspection and/or repair). The seal 11.3.1-538 is a sealing material of any suitable type that is configured to prevent foreign particle (e.g., dust) intrusion at the interface of the display assembly 11.3.1-524 with the optical module housing assembly 11.3.1-522. The bezel 11.3.1-540 is a structural component that supports the display module 11.3.1-542 and protects it from damage. As an example, bezel 11.3.1-540 may be connected to the heat sink 11.3.1-546 (e.g., by screws of other fasteners) to capture the display module 11.3.1-542 and the heat sink 11.3.1-546. The seal 11.3.1-538 may be engaged with the bezel 11.3.1-540 and the optical module housing assembly 11.3.1-522 to seal the interface between them.

The seal 11.3.1-538 and the bezel 11.3.1-540 have a ring-like configuration with central openings along the optical axis 11.3.1-521 in order to avoid blocking light emission from the display module 11.3.1-542 toward the lens 11.3.1-526.

The display module 11.3.1-542 includes a display screen that displays images (e.g., by emitting light using a grid of light-emitting elements to define a picture). The display module 11.3.1-542 may be implemented using any suitable display technology, including light-emitting diode-based display technologies, organic light-emitting diode-based display technologies, and micro light-emitting diode-based display technologies. In some implementations, a layer of cover glass is attached (e.g., by laminating) to the display surface of the display module 11.3.1-542 to provide strength, to serve as a mounting feature, and to serve as a sealing interface.

The thermal interface 11.3.1-544 is a thermally conductive and electrically non-conductive material that is located between the display module 11.3.1-542 and the heat sink 11.3.1-546 to promote heat transfer from the display module 11.3.1-542 to the heat sink 11.3.1-546. The thermal interface 11.3.1-544 is a compliant material that is able to fill in gaps that would otherwise be present between the display module 11.3.1-542 and the heat sink 11.3.1-546, and which would reduce the efficiency of heat transfer. As an example, the thermal interface may be dispensable thermal gel that is applied to the display module 11.3.1-542 or the heat sink 11.3.1-546. A reworkable material may be used for the thermal interface 11.3.1-544, such as a material that is applied by room-temperature vulcanization.

The heat sink 11.3.1-546 is a rigid structure (e.g., formed from metal) that readily conducts heat and is configured to release heat to the ambient environment. As an example, the heat sink 11.3.1-546 may incorporate structures that increase surface area, such as fins, to promote heat dissipation, and/or may include features that conduct heat away from heat-generating components (e.g., the display module 11.3.1-542), such as a heat pipe.

FIG. 11.3.1-6 is a front view illustration that shows the lens 11.3.1-526 according to an example, and FIG. 11.3.1-7 is a cross-section view illustration taken along line B-B of FIG. 11.3.1-6 showing the lens 11.3.1-526. The lens 11.3.1-526 is an optical element (or combination of multiple optical elements, e.g., multiple lenses) that is configured to refract and/or reflect light that is incident on the lens 11.3.1-526. In the illustrated example, the lens 11.3.1-526 is formed from molded transparent plastic, by glass may be used. Surface configurations that cause refraction and/or reflection of light (e.g., convexity and concavity) are not shown in the figures for simplicity and clarity, and these features may be defined as needed for desired performance of the optical system.

The lens 11.3.1-526 includes a lens body 11.3.1-648 and projections 11.3.1-649 that extend outward from the lens body 11.3.1-648. The lens body 11.3.1-648 extends from an outer surface 11.3.1-750 (oriented toward the user) to an inner surface 11.3.1-751 (oriented toward the display assembly 11.3.1-524. The lens body 11.3.1-648 will typically have a width (or range of widths) that is greater than the height of the lens body 11.3.1-648 as measured along the optical axis 11.3.1-521 of the optical module 11.3.1-520. The lens body 11.3.1-648 may be formed in any shape (as viewed from an end along the optical axis 11.3.1-521), such as generally cylindrical, oval, rounded rectangle, or irregular. The projections 11.3.1-649 may have a height (in the direction of the optical axis 11.3.1-521) that is less than the height of the lens body 11.3.1-648, such as 10 percent to 50 percent of the height of the lens body 11.3.1-648. As will be explained herein, the projections 11.3.1-649 facilitate alignment and retention of the lens 11.3.1-526 relative to the optical module housing assembly 11.3.1-522.

In the illustrated example, a peripheral wall of the lens body 11.3.1-648 extends from the outer surface 11.3.1-750 to the inner surface 11.3.1-751 without tapering, so that the peripheral wall is generally in alignment with the optical axis 11.3.1-521 and the outer surface 11.3.1-750 and the inner surface 11.3.1-751 are generally the same in shape and size (e.g., except for minor deviations such as the projections 11.3.1-649). In other implementations, the peripheral wall of the lens body 11.3.1-648 may be tapered. For example, the peripheral wall of the lens body 11.3.1-648 may be tapered progressively away from the optical axis 11.3.1-521 in a direction of travel extending from the outer surface 11.3.1-750 to the inner surface 11.3.1-751, so that that the size of the outer surface 11.3.1-750 is smaller than the size of the inner surface 11.3.1-751.

FIG. 11.3.1-8 is a front view illustration that shows the housing body 11.3.1-534 of the optical module housing assembly 11.3.1-522, and FIG. 11.3.1-9 is a cross-section view illustration taken along line C-C of FIG. 11.3.1-8 showing the housing body 11.3.1-534. The housing body 11.3.1-534 includes a base portion 11.3.1-852, an optical pathway opening 11.3.1-853 that is formed through the base portion 11.3.1-852, a peripheral wall 11.3.1-854 that extends around the optical pathway opening 11.3.1-853.

The base portion 11.3.1-852 extends generally perpendicular to the optical axis 11.3.1-521 of the optical module 11.3.1-520. The base portion 11.3.1-852 may incorporate features that allow attachment of other components to the optical module housing assembly 11.3.1-522. As one example, the display assembly 11.3.1-524 may be attached to the base portion 11.3.1-852 (e.g., by fasteners or adhesives). As another example, the eye camera 11.3.1-530 may be attached to the base portion 11.3.1-852 (e.g., by fasteners or adhesives).

The peripheral wall 11.3.1-854 extends outward from the base portion 11.3.1-852 in a direction that is generally toward the user and generally aligned with the optical axis 11.3.1-521 of the optical module 11.3.1-520. As viewed along the optical axis 11.3.1-521, the shape and size of the peripheral wall 11.3.1-854 is similar to that of the outer periphery of the lens 11.3.1-526, since the peripheral wall 11.3.1-854 is part of the structure that supports and retains the lens 11.3.1-526, as will be described further herein. A vent port 11.3.1-855 is formed through the peripheral wall 11.3.1-854 and may extend, for example, between inner and outer surfaces of the peripheral wall 11.3.1-854 in a direction that is generally perpendicular to the optical axis 11.3.1-521 of the optical module 11.3.1-520. An electrical port 11.3.1-856 is formed through the peripheral wall 11.3.1-854 and may extend, for example, between inner and outer surfaces of the peripheral wall 11.3.1-854 in a direction that is generally perpendicular to the optical axis 11.3.1-521 of the optical module 11.3.1-520.

A base surface 11.3.1-857 is defined on the base portion 11.3.1-852 and is located inward from the peripheral wall 11.3.1-854. The base surface 11.3.1-857 is adjacent to and extends around the optical pathway opening 11.3.1-853, which is an opening that is defined by the housing body 11.3.1-534 to allow light to travel from the display assembly 11.3.1-524 to the lens 11.3.1-526. A camera opening 11.3.1-858 is formed through the base surface 11.3.1-857 and is adjacent to, but separate from, the optical pathway opening 11.3.1-853. The camera opening 11.3.1-858 extends through the base surface 11.3.1-857 in a direction that is generally toward the user. As examples the camera opening 11.3.1-858 may extend through the base surface 11.3.1-857 in a direction that is generally aligned with the optical axis 11.3.1-521 of the optical module 11.3.1-520, or within 45 degrees of parallel to the optical axis 11.3.1-521 of the optical module 11.3.1-520.

FIG. 11.3.1-10 is a front view illustration that shows the retainer 11.3.1-536 of the optical module housing assembly 11.3.1-522, and FIG. 11.3.1-11 is a cross-section view illustration taken along line D-D of FIG. 11.3.1-10 showing the retainer 11.3.1-536. The retainer 11.3.1-536 includes a peripheral wall 11.3.1-1060 that extends around an optical pathway opening 11.3.1-1061. The peripheral wall 11.3.1-1060 includes an upper inner periphery portion 11.3.1-1062 that borders and extends around the optical pathway opening 11.3.1-1061. The upper inner periphery portion 11.3.1-1062 is configured to receive the lens body 11.3.1-648 of the lens 11.3.1-526. Channels 11.3.1-1063 are formed in the upper inner periphery portion 11.3.1-1062 and are open to the optical pathway opening 11.3.1-1061. The size and position of the channels 11.3.1-1063 corresponds to the size and position of the projections 11.3.1-649 of the lens 11.3.1-526 such that the projections 11.3.1-649 can be received in the channels 11.3.1-1063 to secure the lens 11.3.1-526 relative to the housing body 11.3.1-534 and restrain relative movement. The peripheral wall 11.3.1-1060 includes a lower inner periphery portion 11.3.1-1064 that borders and extends around the optical pathway opening 11.3.1-1061. The lower inner periphery portion 11.3.1-1064 is configured for connection to the peripheral wall 11.3.1-854 of the housing body 11.3.1-534.

FIG. 11.3.1-12 is a front view illustration that shows the infrared emitter 11.3.1-532. The infrared emitter 11.3.1-532 includes a flexible circuit 11.3.1-1266, emissive components 11.3.1-1267, an electrical connector 11.3.1-1268, and a sealing element 11.3.1-1269. The flexible circuit 11.3.1-1266 is a flexible substrate that has electrical conductors formed on it. The flexible substrate may be nonconductive polymer film. The electrical conductors may be conductive traces formed from copper. As an example, the flexible circuit 11.3.1-1266 may be formed by multiple layers of nonconductive polymer film with conductive traces formed between adjacent layers of the film. As will be explained further herein, the shape of the flexible circuit 11.3.1-1266 may be arranged such that is conforms to the shape of a portion of the optical module housing assembly 11.3.1-522 such that the infrared emitter may be located in or connected to the optical module housing assembly 11.3.1-522. In the illustrated example, the flexible circuit 11.3.1-1266 has a c-shaped configured that allows the flexible circuit 11.3.1-1266 to extend around the optical axis 11.3.1-521 of the optical module 11.3.1-520 so that the emissive components 11.3.1-1267 may be arranged around the optical axis 11.3.1-521 in an array without blocking the optical path (pathway along which light may travel) between the display assembly 11.3.1-524 and the lens 11.3.1-526 of the optical module 11.3.1-520.

The emissive components 11.3.1-1267 are components that are configured to emit infrared radiation within one or more wavelength bands. The infrared radiation that is emitted by the emissive components 11.3.1-1267 and reflected by the user's eye may be imaged by the eye camera 11.3.1-530 for use in imaging tasks.

The emissive components 11.3.1-1267 may be for example, infrared light emitting diodes. In one implementation, the emissive components 11.3.1-1267 include a first group of components that are configured to emit infrared radiation in a first wavelength band and a second group of components that are configured to emit infrared radiation in a second wavelength band. The first and second wavelength bands may correspond to different imaging tasks. As an example, the first wavelength band may be configured for use in biometric identification by iris scanner (e.g., a wavelength band including 850 nanometers), and the second wavelength band may be configured for use in eye gaze direction tracking (e.g., a wavelength band including 940 nanometers).

The electrical connector 11.3.1-1268 of the infrared emitter 11.3.1-532 is a standard component of any suitable type that allows connection to other components to provide electrical power and, optionally, operating commands, to the infrared emitter 11.3.1-532. The sealing element 11.3.1-1269 is formed on the flexible circuit 11.3.1-1266 between the electrical connector 11.3.1-1268 and the emissive components 11.3.1-1267. As best seen in FIG. 11.3.1-13, which is a cross-section view illustration showing the flexible circuit and a portion of the peripheral wall 11.3.1-854 of the housing body 11.3.1-534 of the optical module housing assembly 11.3.1-522, the flexible circuit 11.3.1-1266 extends through and is surrounded by the sealing element 11.3.1-1269. The sealing element 11.3.1-1269 is formed from a resilient flexible material that is configured to engage a portion of the optical module housing assembly 11.3.1-522 to allow the flexible circuit 11.3.1-1266 to exit the interior of the optical module housing assembly 11.3.1-522 without providing a pathway along which foreign particles (e.g., dust particles) may enter the interior of the optical module housing assembly 11.3.1-522. As an example, the sealing element 11.3.1-1269 may be formed from silicone that is overmolded onto the flexible circuit 11.3.1-1266 such that the flexible circuit extends through the sealing element 11.3.1-1269. In the illustrated example, the flexible circuit 11.3.1-1266 extends through the electrical port 11.3.1-856 of the housing body 11.3.1-534 such that the sealing element 11.3.1-1269 is located in the electrical port 11.3.1-856 and is engaged with the housing body 11.3.1-534 and the electrical port 11.3.1-856 to define a seal and occupy the electrical port 11.3.1-856 to prevent entry of foreign particles.

FIG. 11.3.1-14 is a cross section view illustration that shows the optical module 11.3.1-520.

The lens 11.3.1-526 is disposed between the housing body 11.3.1-534 and the retainer 11.3.1-536. The housing body 11.3.1-534 is connected to the retainer 11.3.1-536 such that the lens 11.3.1-526 is located between the housing body 11.3.1-534 and the retainer 11.3.1-536. Thus, the housing body 11.3.1-534 and the retainer 11.3.1-536 engage the lens 11.3.1-526 such that the lens 11.3.1-526 is restrained from moving relative to the housing body 11.3.1-534 and the retainer 11.3.1-536. To protect the lens 11.3.1-526 from damage (e.g., if the head-mounted device 11.3.1-100 is dropped), a layer of adhesive may be present between the lens 11.3.1-526 and portions of the housing body 11.3.1-534 and/or the retainer 11.3.1-536. The adhesive that is used for this purposes is strong to secure the lens 11.3.1-526 in a desired alignment and is flexible and elastic to cushion the lens 11.3.1-526 in the event of vibration or impact shock, and to allow the lens 11.3.1-526 to return to its original position.

The vent port 11.3.1-855 is formed through the peripheral wall 11.3.1-854 of the housing body 11.3.1-534 and allows air to enter and exit an internal space 11.3.1-1470 of the optical module 11.3.1-520. The internal space 11.3.1-1470 is defined within the optical module housing assembly 11.3.1-522 by the housing body 11.3.1-534 and the retainer 11.3.1-536 and between the lens 11.3.1-526 and the display assembly 11.3.1-524. The internal space 11.3.1-1470 is sealed from the outside environment except at the vent port 11.3.1-855. The vent port 11.3.1-885 is a passage that allows air to travel between the internal space 11.3.1-1470 and the outside environment that is located around the optical module 11.3.1-520. By allowing air to enter and exit the internal space 11.3.1-1470, air pressure within the internal space 11.3.1-1470 remains at or near ambient (e.g., outside the optical module 11.3.1-520) air pressure. To exclude foreign particles from the internal space 11.3.1-1470, a filter element 11.3.1-1471 is connected to the vent port 11.3.1-885 such that any air that passes through the vent port 11.3.1-855 must pass through filter element 11.3.1-1471. The filter element 11.3.1-1471 is configured to restrain foreign particles from entering the internal space through the vent port 11.3.1-885 (e.g., by preventing entry of foreign particles that are larger than a pore size of the filter material). As examples, the filter element 11.3.1-1471 may be located in or on the vent port 11.3.1-855. The filter element 11.3.1-1471 has a small pore size that is intended to exclude small particles (e.g., dust particles) from the internal space 11.3.1-1470. As one example, the filter element 11.3.1-1471 may be formed from a polytetrafluoroethylene (PTFE) filter material. To capture particles that are present inside the internal space 11.3.1-1470, a dust trap 11.3.1-1472 may be located in the internal space 11.3.1-1470, for example, connected to an internal surface of the housing body 11.3.1-534. The dust trap 11.3.1-1472 is configured to retain foreign particles on its surface, so that the foreign particles do not instead settle on surfaces where they may cause an optical aberration. As an example, the dust trap 11.3.1-1472 may be an adhesive element, such as a sheet coated in adhesive material, to which airborne particles that are inside the internal space 11.3.1-1470 may become affixed, which prevents the particles from attaching to the display assembly 11.3.1-524, or the lens 11.3.1-526, which could cause optical aberrations that are perceptible to the user (e.g., a visual artifact similar to a dead pixel).

The eye camera 11.3.1-530 is a still image camera or video camera that is configured to obtain images. When in use, the images that are obtained by the eye camera 11.3.1-530 include a visual representation of part of or all of the user's eye, so that the obtained images may be used for biometric identification (e.g., verifying the identity of the user based on an image of the user's eye) and gaze tracking. In the implementations that are discussed herein, the eye camera 11.3.1-530 is sensitive to infrared light (i.e., electromagnetic radiation in the infrared portion of the electromagnetic spectrum). Thus, the eye camera 11.3.1-530 may be configured to obtain images that show reflected portions of the infrared radiation that is emitted by the infrared emitter 11.3.1-532, and these reflected portions of infrared radiation, as represented in the images, are useful for observing and identifying features of the user's eye, which may be done using a machine vision-based system that is implemented in software that is executed by the head-mounted device 11.3.1-100. In alternative implementations, the eye camera 11.3.1-530 may instead by implemented using a visible spectrum camera or may be supplemented using the visible spectrum camera in addition to an infrared spectrum camera.

The eye camera 11.3.1-530 is connected to the housing body 11.3.1-534 of the optical module housing assembly 11.3.1-522 adjacent to the camera opening 11.3.1-858 of the housing body 11.3.1-534 such that an optical axis 11.3.1-1431 of the eye camera 11.3.1-530 extends through the camera opening 11.3.1-858. In the illustrated example, the eye camera 11.3.1-530 is oriented such that an optical axis 11.3.1-1431 of the eye camera 11.3.1-530 is substantially aligned with the optical axis 11.3.1-521 of the optical module 11.3.1-520. However, the eye camera 11.3.1-530 is positioned near an outer periphery of the lens 11.3.1-526 and is therefore offset and outward from the optical axis 11.3.1-521 of the optical module 11.3.1-520. Thus, the housing body 11.3.1-534 and/or the eye camera 11.3.1-530 may be configured (e.g., by an inclined mounting surface) such that the optical axis 11.3.1-1431 of the eye camera 11.3.1-530 is angled toward the optical axis 11.3.1-521 of the optical module 11.3.1-520, as shown in FIG. 11.3.1-15, which is a cross-section view illustration that shows the optical module 11.3.1-520 according to an alternative implementation.

Returning to FIG. 11.3.1-14, in some implementations, a fiducial marker 11.3.1-1465 may be formed on the lens 11.3.1-526. The fiducial marker 11.3.1-1465 is any manner of marking that can be perceived and located in images obtained by the eye camera 11.3.1-530. The fiducial marker 11.3.1-1465 is visible in images obtained by the eye camera 11.3.1-530 for use in calibration. The head-mounted device 11.3.1-100 is calibrated to account for manufacturing conditions, user attributes, and/or other factors that may cause visual aberrations. During an initial calibration, the position of the fiducial marker 11.3.1-1465 is determined and stored. The lens 11.3.1-526 may shift with respect to other components, such as the optical module housing assembly 11.3.1-522, for example, if the head-mounted device 11.3.1-100 is dropped. The changed position of the lens 11.3.1-526 can be identified by comparing the position of the lens 11.3.1-526 in images obtained by the eye camera 11.3.1-530 with the position of the lens 11.3.1-526 in the images that was obtained at the time of calibration. In response to determining that the lens position has changed, calibration is performed again to address any visual aberrations that may have resulted from the shift in position of the lens 11.3.1-526.

The infrared emitter 11.3.1-532 is located on the base surface 11.3.1-857 of the housing body 11.3.1-534 and extends around the optical axis 11.3.1-521 within the internal space 11.3.1-1470 that is defined within the optical module housing assembly 11.3.1-522 by the housing body 11.3.1-534 and the retainer 11.3.1-536 and between the lens 11.3.1-526 and the display assembly 11.3.1-524. The display assembly 11.3.1-524 is connected to the housing body 11.3.1-534 of optical module housing assembly 11.3.1-522 adjacent to the optical pathway opening 11.3.1-853 of the housing body 11.3.1-534.

In one implementation, the optical module 11.3.1-520 includes the optical module housing assembly 11.3.1-522, the display assembly 11.3.1-524, the lens 11.3.1-526, and the eye camera 11.3.1-530. The lens 11.3.1-526 is positioned at a first end of the optical module housing assembly 11.3.1-522, the display assembly and the eye camera 11.3.1-530 are positioned at a second end of the optical module housing assembly 11.3.1-522, and the internal space 11.3.1-1470 is defined within the optical module housing assembly 11.3.1-522 between the first end and the second end. The lens 11.3.1-526 is positioned such that it is able to obtain images of the user's eye through the lens 11.3.1-526. The lens 11.3.1-526 may be connected to the optical module housing assembly 11.3.1-522 such that it is positioned adjacent to the display assembly 11.3.1-524, such as in a side-by-side arrangement with respect to the display assembly 11.3.1-524.

In one implementation, the optical module 11.3.1-520 includes the optical module housing assembly 11.3.1-522, the display assembly 11.3.1-524, the lens 11.3.1-526, and the infrared emitter 11.3.1-532. The lens 11.3.1-526 is positioned at a first end of the optical module housing assembly 11.3.1-522, the display assembly is positioned at a second end of the optical module housing assembly 11.3.1-522, and the internal space 11.3.1-1470 is defined within the optical module housing assembly 11.3.1-522 between the first end and the second end. The infrared emitter 11.3.1-532 is positioned in the internal space 11.3.1-1470 between the lens 11.3.1-526 and the display assembly 11.3.1-524. The infrared emitter 11.3.1-532 is positioned such that is able to project infrared radiation onto the user's eye through the lens 11.3.1-526. The optical module 11.3.1-520 also includes the eye camera 11.3.1-530, which is connected to the optical module housing assembly 11.3.1-522 such that the infrared emitter 11.3.1-532 is positioned between (e.g., along the optical axis 11.3.1-521) the eye camera 11.3.1-530 and the lens 11.3.1-526.

The lens 11.3.1-526 may be connected to the optical module housing assembly 11.3.1-522 such that it is positioned adjacent to the display assembly 11.3.1-524, such as in a side-by-side arrangement with respect to the display assembly 11.3.1-524.

In the implementation shown in FIG. 11.3.1-14, the infrared emitter 11.3.1-532 is located on the base surface 11.3.1-857 of the housing body 11.3.1-534 in the internal space 11.3.1-1470. FIG. 11.3.1-16 is a cross-section view illustration that shows the optical module 11.3.1-520 according to an alternative implementation in which the infrared emitter 11.3.1-532 is located outside of the housing body 11.3.1-534 of the optical module housing assembly 11.3.1-522. In this implementation, the infrared emitter 11.3.1-532 is connected (e.g., by an adhesive) to an exterior surface of the housing body 11.3.1-534 such that it is positioned adjacent to and extends around the display assembly 11.3.1-524.

An infrared-transmissive panel 11.3.1-1673 is formed in the housing body 11.3.1-534 to allow infrared radiation that is emitted by the infrared emitter 11.3.1-532 to travel through the optical module housing assembly 11.3.1-522 and the lens 11.3.1-526. The infrared-transmissive panel 11.3.1-1673 is formed from a material that allows infrared radiation to pass through it without significant losses. As examples, the infrared-transmissive panel 11.3.1-1673 may be formed from glass or from an infrared transmissive plastic. In the illustrated example, the infrared-transmissive panel 11.3.1-1673 extends through an aperture that is formed through the base surface 11.3.1-857. The infrared-transmissive panel 11.3.1-1673 may be a single panel that extends along the base surface 11.3.1-857 adjacent to all of the emissive components 11.3.1-1267 of the infrared emitter 11.3.1-532, or may be multiple panels that extend through separate apertures that are formed through the base surface 11.3.1-857 adjacent to individual ones of the emissive components 11.3.1-1267. In some implementations, the infrared-transmissive panel 11.3.1-1673 may be omitted in favor of forming part or all of the optical module housing assembly 11.3.1-522 (e.g., the housing body 11.3.1-534) from an infrared-transmissive material.

In the examples shown in FIGS. 11.3.1-14-16, the optical module 11.3.1-120 is shown as including a single eye camera, which is represented by the eye camera 11.3.1-530. The optical module 11.3.1-120 could instead include more than one eye camera (e.g., two eye cameras), with each of the eye cameras being configured to obtain images showing infrared radiation that is reflected from the eye of the user. The eye cameras are located at different locations (e.g., opposite lateral sides of the eye of the user) and may be oriented at different angular orientations. The images output by multiple eye cameras may provide a more complete view of the eye of the user.

FIG. 11.3.1-17 is a side-view illustration that shows the display module 11.3.1-542 according to an implementation. The display module 11.3.1-542 includes a silicon wafer 11.3.1-1775 and a display element layer 11.3.1-1776 (e.g., an organic light-emitting diode layer) that is located on the silicon wafer 11.3.1-1775. The display element layer 11.3.1-1776 may be covered by a glass layer 11.3.1-1777. A display connector 11.3.1-1778 includes a first portion 11.3.1-1779 and a second portion 11.3.1-1780. The first portion 11.3.1-1779 of the display connector 11.3.1-1778 is a flexible connector (e.g., a two-layer flexible connector) that is connected to silicon wafer 11.3.1-1775 by an electrical connection 11.3.1-1781 that connects individual conductors formed on the silicon wafer 11.3.1-1775 with individual conductors formed on the first portion 11.3.1-1779 of the display connector 11.3.1-1778. As an example, the electrical connection 11.3.1-1781 may include an anisotropic film that bonds the display connector 11.3.1-1778 to the silicon wafer 11.3.1-1775 while allowing electrical communication.

The second portion 11.3.1-1780 of the display connector 11.3.1-1778 is a multi-layer (e.g., six layer) flexible connector, of the type commonly referred to as a "rigid flex" connector. The second portion 11.3.1-1780 may include a cavity 11.3.1-1782 that is defined by removal of one or more of the layers of the multi-layer structure of the second portion 11.3.1-1780. A driver integrated circuit 11.3.1-1783 is located in the cavity 11.3.1-1782 in order to protect the driver integrated circuit 11.3.1-1783. The function of the driver integrated circuit 11.3.1-1783 is to receive display signals in a first format (e.g., encoded or multiplexed) and interpret the signals into a second format that is usable by the display element layer 11.3.1-1776 of the display module 11.3.1-542 to output images. A connector 11.3.1-1784 (e.g., a micro-coaxial connector) may be located on and electrically connected to the second portion 11.3.1-1780 of the display connector 11.3.1-1778 in order to connect the display module 11.3.1-542 to other components (e.g., to a computing device that provides content to be displayed).

FIG. 11.3.1-18 is a top-view illustration that shows interpupillary distance adjustment mechanisms 11.3.1-1885 that each support one of the optical modules 11.3.1-520 (i.e., left and right optical modules) with respect to the device housing 11.3.1-102. The interpupillary distance adjustment mechanisms 11.3.1-1885 are an example of an interpupillary distance adjustment assembly that is configured to adjust a distance between the optical modules 11.3.1-520 that display content to the left eye and the right eye of the user, in order to match the spacing between the optical modules 11.3.1-520 with the spacing between the user's eyes.

The optical modules 11.3.1-520 may be supported such that the optical axis 11.3.1-521 of each of the optical modules 11.3.1-520 extends generally in a front-to-back direction of the device housing 11.3.1-102. The interpupillary distance adjustment mechanisms 11.3.1-1885 include support rods 11.3.1-1886 and actuator assemblies 11.3.1-1887 that are configured to cause movement of the optical modules 11.3.1-520 along the support rods 11.3.1-1886 in response to a control signal. The actuator assemblies 11.3.1-1887 may include conventional motion control components such as electric motors that are connected to the optical modules 11.3.1-520 by components such as lead screws or belts to cause movement. Mounting brackets 11.3.1-1888 may be connected to the optical modules 11.3.1-520 such that the support rods 11.3.1-1886 are connected to the mounting brackets 11.3.1-1888, such as by extending through apertures 11.3.1-1889 that are formed through the mounting brackets 11.3.1-1888. The interpupillary distance adjustment mechanisms 11.3.1-1885 may also include biasing elements such as springs that are engaged with the mounting brackets 11.3.1-1888 to reduce or eliminate unintended motion of the mounting brackets 11.3.1-1888 and/or the optical modules 11.3.1-520 with respect to the support rods 11.3.1-1886. The support rods 11.3.1-1886 may be angled relative to a lateral (e.g., side-to-side) dimension of the device housing 11.3.1-102 such that they move toward the user as they move outward. As an example, the support rods may be angled by five degrees relative to the lateral dimension.

FIG. 11.3.1-19 is a side view illustration that shows one of the interpupillary distance adjustment mechanisms 11.3.1-1885. The support rods 11.3.1-1886 may include upper and lower support rods for each of the optical modules that support the optical modules 11.3.1-520 such that the optical axis 11.3.1-521 of each optical module 11.3.1-520 is angled slightly downward, such as by five degrees. Springs 11.3.1-1990 (e.g., leaf springs) may be seated in the apertures 11.3.1-1889 of the mounting brackets 11.3.1-1888 and located forward from the support rods 11.3.1-1886 to bias the optical modules 11.3.1-520 toward the user.

FIG. 11.3.1-20 is a top-view cross-section illustration that shows front-facing cameras 11.3.1-2091 that are supported by each of the optical modules 11.3.1-520. Openings or optically-transmissive panels 11.3.1-2092 (e.g., clear plastic) are included in the device housing 11.3.1-102 such that the front-facing cameras 11.3.1-2091 are able to obtain images of the surrounding environment through the optically-transmissive panels 11.3.1-2092. A single panel or separate panels may be used for the optically-transmissive panels 11.3.1-2092, and as such the device housing 11.3.1-102 may include one or more of the optically-transmissive panels 11.3.1-2092. Thus, the device housing 11.3.1-102 may include one or more of the optically-transmissive panels 11.3.1-2092 through which the front-facing cameras may obtain images of an environment from a point of view that simulates the point of view of the user.

The front-facing cameras 11.3.1-2091 may be connected to and supported by a corresponding one of the optical modules 11.3.1-520. The front-facing cameras 11.3.1-2091 may be positioned such that they are located on and substantially aligned with the optical axis 11.3.1-521 of a corresponding one of the optical modules 11.3.1-520 (e.g., the optical axes of the front-facing cameras 11.3.1-2091 may be substantially aligned with the optical axes of the optical modules 11.3.1-520). The front-facing cameras 11.3.1-2091 are oriented away from the user and are supported such that they are moved by the interpupillary distance adjustment mechanisms 11.3.1-1885. Accordingly, when the user adjusts the interpupillary distance between the optical modules 11.3.1-520, the distance between the front-facing cameras 11.3.1-2091 is also adjusted. Thus, images from the front-facing cameras 11.3.1-2091, when displayed to the user, have been captured at the user's own interpupillary distance and therefore are presented more accurately in stereo vision. Thus, in some implementations, the optical axis of a first one of the front-facing cameras 11.3.1-2091 is aligned with an optical axis of a first one of the optical modules 11.3.1-520 and an optical axis of a second one of the front-facing cameras 11.3.1-2091 is aligned with an optical axis of a second one of the optical modules 11.3.1-520. Thus, in some implementations, a first one of the front-facing cameras 11.3.1-2091 is connected in a fixed relationship with respect to a first one of the optical modules 11.3.1-520, and a second one of the front-facing cameras 11.3.1-2091 is connected in a fixed relationship with respect to a second one of the optical modules 11.3.1-520. Thus, in some implementations, the interpupillary distance adjustment mechanisms a first spacing between an optical axis of a first one of the optical modules 11.3.1-520 and an optical axis of a second one of the optical modules 11.3.1-520 generally equal to a second spacing between an optical axis of a first one of the front-facing cameras 11.3.1-2091 and an optical axis of a second one of the front facing cameras 11.3.1-2091 during adjustment of the distance between the optical modules 11.3.1-520.

FIG. 11.3.1-21 is an illustration that shows connection of the eye camera 11.3.1-530 and the infrared emitter 11.3.1-532 to a computing device 11.3.1-2193 by an optical module jumper board 11.3.1-2194. The computing device 11.3.1-2193 may be, for example, a computing device that incorporates the processor 11.3.1-108 of the head-mounted device 11.3.1-100. The optical module jumper board 11.3.1-2194 has a data connection to the computing device 11.3.1-2193 over which signals and data to and from the eye camera 11.3.1-530 and the infrared emitter 11.3.1-532 are transmitted. The optical module jumper board 11.3.1-2194 also has separate data connections to each of the eye camera 11.3.1-530 and the infrared emitter 11.3.1-532. Additional components could be included in the optical module 11.3.1-520 and connected to the optical module jumper board 11.3.1-2194 by additional separate connections. The optical module jumper board 11.3.1-2194 may be mounted to the optical module 11.3.1-520, and therefore, moves in unison with the optical module 11.3.1-520 during interpupillary distance adjustment. As a result, the number and size of electrical connections that are made to components that are not mounted to the optical module (e.g., the computing device 11.3.1-2193) is decreased. The optical module jumper board 11.3.1-2194 may be, as examples, a rigid flex circuit board, a flexible circuit board, or a printed component board.

11.3.2: Cameras and LEDs

FIG. 11.3.2-1 illustrates an example of an optical module 11.3.2-100 for use in an electronic device such as an HMD, including HDM devices described herein. As shown in one or more other examples described herein, the optical module 11.3.2-100 can be one of two optical modules within an HMD, with each optical module aligned to project light toward a user's eye. In this way, a first optical module can project light via a display screen toward a user's first eye and a second optical module of the same device can project light via another display screen toward the user's second eye.

In at least one example, the optical module 11.3.2-100 can include an optical frame or housing 11.3.2-102, which can also be referred to as a barrel or optical module barrel. The optical module 11.3.2-100 can also include a display 11.3.2-104, including a display screen or multiple display screens, coupled to the housing 11.3.2-102. The display 11.3.2-104 can be coupled to the housing 11.3.2-102 such that the display 11.3.2-104 is configured to project light toward the eye of a user when the HMD of which the display module 11.3.2-100 is a part is donned during use. In at least one example, the housing 11.3.2-102 can surround the display 11.3.2-104 and provide connection features for coupling other components of optical modules described herein.

In one example, the optical module 11.3.2-100 can include one or more cameras 11.3.2-106 coupled to the housing 11.3.2-102. The camera 11.3.2-106 can be positioned relative to the display 11.3.2-104 and housing 11.3.2-102 such that the camera 11.3.2-106 is configured to capture one or more images of the user's eye during use. In at least one example, the optical module 11.3.2-100 can also include a light strip 11.3.2-108 surrounding the display 11.3.2-104. In one example, the light strip 11.3.2-108 is disposed between the display 11.3.2-104 and the camera 11.3.2-106. The light strip 11.3.2-108 can include a plurality of lights 11.3.2-110. The plurality of lights can include one or more light emitting diodes (LEDs) or other lights configured to project light toward the user's eye when the HMD is donned. The individual lights 11.3.2-110 of the light strip 11.3.2-108 can be spaced about the strip 11.3.2-108 and thus spaced about the display 11.3.2-104 uniformly or non-uniformly at various locations on the strip 11.3.2-108 and around the display 11.3.2-104.

In at least one example, the housing 11.3.2-102 defines a viewing opening 11.3.2-101 through which the user can view the display 11.3.2-104 when the HMD device is donned. In at least one example, the LEDs are configured and arranged to emit light through the viewing opening 11.3.2-101 and onto the user's eye. In one example, the camera 11.3.2-106 is configured to capture one or more images of the user's eye through the viewing opening 11.3.2-101.

As noted above, each of the components and features of the optical module 11.3.2-100 shown in FIG. 11.3.2-1 can be replicated in another (e.g., second) optical module disposed with the HMD to interact (e.g., project light and capture images) of another eye of the user.

Any of the features, components, and/or parts, including the arrangements and configurations thereof shown in FIG. 11.3.2-1 can be included, either alone or in any combination, in any of the other examples of devices, features, components, and parts shown in FIGS. 11.3.2-2-11.3.2-5 and described herein. Likewise, any of the features, components, and/or parts, including the arrangements and configurations thereof shown and described with reference to FIGS. 11.3.2-2-11.3.2-5 can be included, either alone or in any combination, in the example of the devices, features, components, and parts shown in FIG. 11.3.2-1.

FIG. 11.3.2-2 illustrates a cross-sectional view of an example of an optical module 11.3.2-200 including a housing 11.3.2-202, display assembly 11.3.2-204 coupled to the housing 11.3.2-202, and a lens 11.3.2-216 coupled to the housing 11.3.2-202. In at least one example, the housing 11.3.2-202 defines a first aperture or channel 11.3.2-212 and a second aperture or channel 11.3.2-214. The channels 11.3.2-212, 11.3.2-214 can be configured to slidably engage respective rails or guide rods of an HMD device to allow the optical module 11.3.2-200 to adjust in position relative to the user's eyes for match the user's interpapillary distance (IPD). The housing 11.3.2-202 can slidably engage the guide rods to secure the optical module 11.3.2-200 in place within the HMD.

In at least one example, the optical module 11.3.2-200 can also include a lens 11.3.2-216 coupled to the housing 11.3.2-202 and disposed between the display assembly 11.3.2-204 and the user's eyes when the HMD is donned. The lens 11.3.2-216 can be configured to direct light from the display assembly 11.3.2-204 to the user's eye. In at least one example, the lens 11.3.2-216 can be a part of a lens assembly including a corrective lens removably attached to the optical module 11.3.2-200. In at least one example, the lens 11.3.2-216 is disposed over the light strip 11.3.2-208 and the one or more eye-tracking cameras 11.3.2-206 such that the camera 11.3.2-206 is configured to capture images of the user's eye through the lens 11.3.2-216 and the light strip 11.3.2-208 includes lights configured to project light through the lens 11.3.2-216 to the users' eye during use.

Any of the features, components, and/or parts, including the arrangements and configurations thereof shown in FIG. 11.3.2-2 can be included, either alone or in any combination, in any of the other examples of devices, features, components, and parts shown in FIGS. 11.3.2-1 and 11.3.2-3-11.3.2-5 and described herein. Likewise, any of the features, components, and/or parts, including the arrangements and configurations thereof shown and described with reference to FIGS. 11.3.2-1 and 11.3.2-3-11.3.2-5 can be included, either alone or in any combination, in the example of the devices, features, components, and parts shown in FIG. 11.3.2-2.

FIG. 11.3.2-3 illustrates a close-up cutaway view of an example of an optical module 11.3.2-304 for use in HMD devices described herein. The illustrated example includes a display assembly 11.3.2-304, a lens 11.3.2-316, and a light strip 11.3.2-308 including a plurality of lights 11.3.2-310 coupled to the optical module barrel/housing 11.3.2-302. In at least one example, the light strip 11.3.2-308 is secured to the housing 11.3.2-302 via an adhesive 11.3.2-318 strip or portion. The adhesive 11.3.2-318 can include a pressure sensitive adhesive, epoxy, or other adhesive. The display assembly 11.3.2-304 can include a display housing 11.3.2-319 coupling various layers, including display layers and covers of the display assembly 11.3.2-304 to the housing 11.3.2-302. In at least one example, the display housing 11.3.2-319 of the display assembly 11.3.2-304 can be coupled to the optical module housing 11.3.2-302 via a dust seal component 11.3.2-320. The dust seal component 11.3.2-320 can be configured to prevent dust and debris from the air and/or external environment from infiltrating the display assembly 11.3.2-304 and lens 11.3.2-316 and spaces there between. In at least one example, the dust seal component 11.3.2-320 can include an adhesive. In one example, the dust seal component 11.3.2-320 can include a foam. In one example, the dust seal component 11.3.2-320 can include a material block or portion disposed between the display assembly housing 11.3.2-319 and the optical module housing 11.3.2-302.

Any of the features, components, and/or parts, including the arrangements and configurations thereof shown in FIG. 11.3.2-3 can be included, either alone or in any combination, in any of the other examples of devices, features, components, and parts shown in FIGS. 11.3.2-1-11.3.2-2 and 11.3.2-4-11.3.2-5 and described herein. Likewise, any of the features, components, and/or parts, including the arrangements and configurations thereof shown and described with reference to FIGS. 11.3.2-1-11.3.2-2 and 11.3.2-4-11.3.2-5 can be included, either alone or in any combination, in the example of the devices, features, components, and parts shown in FIG. 11.3.2-3.

FIG. 11.3.2-4 illustrates a plan view of a portion of an example of an optical module 11.3.2-400 for use in HMD devices described herein. The optical module 11.3.2-400 can include a structural frame or housing 11.3.2-402 defining a viewing opening 11.3.2-401 and a display screen 11.3.2-404 coupled to the housing 11.3.2-402. The display screen 11.3.2-404 can be a part of a multi-component/layered display assembly. The display screen 11.3.2-404 can include or define an inner edge 11.3.2-422, an outer edge 11.3.2-424 opposite the inner edge 11.3.2-422, a lower edge 11.3.2-426 extending between the inner edge 11.3.2-422 and the outer edge 11.3.2-424 and an upper edge 11.3.2-428 opposite the lower edge 11.3.2-426 and also extending between the inner edge 11.3.2-422 and the outer edge 11.3.2-424. The optical module 11.3.2-400 can also include a first camera **11.3.2-406*a* and a second camera 11.3.2-406*b* coupled to the housing 11.3.2-402**.

In at least one example, the first and second cameras **11.3.2-406*a-b* can be positioned to capture images and visualize the user's pupil without being obstructed in view by other facial features of the user, including eyelids and eyelashes, cheeks protrusion, and the like. Accordingly, in at least one example the first camera 11.3.2-406*a* can be disposed adjacent the inner edge 11.3.2-422 and the second camera 11.3.2-406*b* can be disposed adjacent the lower edge 11.3.2-426. In one example, the first camera 11.3.2-406*a* can be disposed closer to the lower edge 11.3.2-426 than the upper edge 11.3.2-428. In one example, the second camera 11.3.2-406*b* can be disposed closer to the outer edge 11.3.2-424 than the inner edge 11.3.2-422**.

In at least one example, the optical module 11.3.2-400 can include an illumination strip 11.3.2-408 disposed on the housing 11.3.2-402 between the first and second cameras **11.3.2-406*a-b* and the display screen 11.3.2-404. The illumination strip 11.3.2-408 can be disposed around a periphery of the display screen 11.3.2-404. In at least one example, the illumination strip 11.3.2-408 can include a plurality of lights 11.3.2-410**, which can include one or more types of lights or light sources, such as LEDs.

As noted above with reference to FIG. 11.3.2-1, the optical modules described herein can be one of two optical modules of an HMD, each optical module configured to align and project light onto one eye of the user. Accordingly, the inner edge 11.3.2-422, outer edge 11.3.2-424, lower edge 11.3.2-426, and upper edge 11.3.2-428 of the display screen 11.3.2-404 shown in FIG. 11.3.2-4 can each be one of a set of inner edges, outer edges, lower edges, and upper edges of two adjacent display screens within an HMD. In such an example, the inner edges of the adjacent display screens of adjacent optical modules within a single HMD device can be disposed between respective outer edges.

Any of the features, components, and/or parts, including the arrangements and configurations thereof shown in FIG. 11.3.2-4 can be included, either alone or in any combination, in any of the other examples of devices, features, components, and parts shown in FIGS. 11.3.2-1-11.3.2-3 and 11.3.2-5 and described herein. Likewise, any of the features, components, and/or parts, including the arrangements and configurations thereof shown and described with reference to FIGS. 11.3.2-1-11.3.2-3 and 11.3.2-5 can be included, either alone or in any combination, in the example of the devices, features, components, and parts shown in FIG. 11.3.2-4.

In the examples of optical modules shown and described with reference to FIGS. 11.3.2-1-511.3.2- and elsewhere herein, a controller of the HMD can be electrically coupled to the first and second cameras **11.3.2-406*a*, 11.3.2-406*b* as well as to the plurality of lights 11.3.2-410 of the illumination strip 11.3.2-408. The controller can be configured to determine a gaze direction of an eye of the user by analyzing a pattern of light reflected off the eye and projected by the plurality of lights 11.3.2-410. In at least one example, determining the gaze direction can include assigning a first weight to a first pattern of reflected light from the plurality of lights 11.3.2-410 and captured by the first camera 11.3.2-**

410*a* and assigning a second weight to a second pattern of reflected light from the plurality of lights 11.3.2-410 and captured by the second camera 11.3.2-410*b*. Then, the controller can determine a weighted average pattern from the first pattern and the second pattern. The first weight and the second weight can be set based on a position of the display screen relative to the user's eye.

The position of the display screen 11.3.2-404 relative to the eye of the user can be determined by a first image capture by the first camera 11.3.2-406*a* and a second image captured by the second camera 11.3.2-406*b*. In at least one example, the controller can be configured to change the first weight and the second weight as the position of the display screen 11.3.2-404 relative to the eye changes. That is, as the user moves the gaze direction of the eye such that the position of the pupil relative to the display screen 11.3.2-404 and the first and second cameras 11.3.2-406*a-b* changes, the weight given to images taken by the first and second cameras 11.3.2-406*a-b* can be changed to rely more heavily on the camera 11.3.2-406*a-b* positioned for the best determination of gaze direction based on the new position of the pupil. In addition, changes to the overall position of the cameras 11.3.2-406*a-b* and screen 11.3.2-404 relative to the user's eye, for example when donning and using the HMD device as the device slightly shifts around or is adjusted for comfort by the user over time during use, the weights can be changed to optimize gaze direction measurement and determination. Other factors, such as optical module adjustment for IPD adjustments and so forth can also affect the weight given to each camera 11.3.2-406*a-b* during gaze detection determination.

FIG. 11.3.2-5 illustrates a partial cutaway view of an example of an optical module 11.3.2-500 including a display assembly 11.3.2-504 and a camera 11.3.2-506 mounted on or coupled with a housing 11.3.2-502. The display assembly 11.3.2-504 can include a display screen disposed within, parallel to, or defining a first major plane 11.3.2-530. The major plane 11.3.2-530 can define a first normal axis 11.3.2-532 perpendicular to the major plane 11.3.2-530. The display screen of the display assembly 11.3.2-504 is configured to direct light in a direction parallel to the first normal axis 11.3.2-532. The camera 11.3.2-506 can include a lens 11.3.2-534 disposed within, parallel to, or defining a second major plane 11.3.2-536 defining a second normal axis 11.3.2-538 perpendicular to the second major plane 11.3.2-536.

In at least one example, the first normal axis 11.3.2-532 is disposed at a first angle relative to the second normal axis 11.3.2-538 such that the first normal axis 11.3.2-532 and the second normal axis 11.3.2-528 are non-parallel. The first camera 406*a* of FIG. 11.3.2-4 illustrates a similar first lens 11.3.2-434 and the second camera 11.3.2-406*b* includes a second lens 11.3.2-440. In at least one example, the second lens 11.3.2-440 can define a normal axis disposed at a second angle relative to the first normal axis 11.3.2-532. The first angle can be different than the second angle. The normal axis defined by the second lens 11.3.2-440 of the second camera 11.3.2-406*b* can also be non-parallel, or disposed at an angle relative to, the second normal axis 11.3.2-538 of the other camera 11.3.2-406*a* (or 11.3.2-506 illustrated in FIG. 11.3.2-5). The first angle can be different than the second angle relative to the first major plane 530 defined by the display screen of the display assembly 11.3.2-504. The angles of the cameras and lenses thereof can be configured to provide unobstructed and direct visualization of the user's pupil to capture images and track the user's gaze.

In at least one example, the cameras, including the camera 11.3.2-506 illustrated in FIG. 11.3.2-5 are disposed between the display assembly 11.3.2-504 and the viewing opening 11.3.2-501 defined by the housing 11.3.2-502 and/or the HMD frame.

Any of the features, components, and/or parts, including the arrangements and configurations thereof shown in FIG. 11.3.2-5 can be included, either alone or in any combination, in any of the other examples of devices, features, components, and parts shown in FIGS. 11.3.2-1-11.3.2-4 and described herein. Likewise, any of the features, components, and/or parts, including the arrangements and configurations thereof shown and described with reference to FIGS. 11.3.2-1-11.3.2-4 can be included, either alone or in any combination, in the example of the devices, features, components, and parts shown in FIG. 11.3.2-5.

11.4: Display

11.4.1: Display System with Interchangeable Lens

FIG. 11.4.1-0 illustrates a view of an HMD 11.4.1-100 including a display assembly 11.4.1-102. The display assembly 11.4.1-102 is described here in more detail in sections 11.4.1-11.4.3.

Different users may have different refractive errors of their eyes, such that different users require different corrective lenses. Disclosed herein are implementations of display systems. In one implementation, a display system includes a display, a removable lens assembly, and a lens detection sensor. The removable lens is removably coupleable to the display. The lens detection sensor detects the removable lens assembly coupled to the display. The display system may further include a head-mounted display unit that includes the display and the lens detection sensor. The display system may determine lens information from the removable lens with the lens detection sensor, and may provide an indicator of the removable lens according to the lens information.

In another implementation, a method is provided for operating a head-mounted display unit, which includes identifying a removable lens coupled to a display module of the head-mounted display unit, and providing an indication according to the identifying of the removable lens. The indication may be a configuration indication that differs between the removable lens and another removable lens coupleable to the display module. The method may further include identifying a user, while the indication may be a compatibility indication of compatibility between the removable lens and the user.

In another implementation, a display system includes a head-mounted display unit and a removable lens assembly. The head-mounted display unit includes a display module. The removable lens assembly includes a lens element and a frame coupled to the lens element. The removable lens assembly may be removably to the display module in a single orientation with a magnetic attachment features coupled to the frame and surrounding the lens element. The removable lens assembly may be removably coupleable to the display module with an interference fit, for example, with the removably lens include a compliant annular protrusion that receives a lens mount of the display module axially therein. The removable lens assembly may be removably coupleable to the display module with sprung latch mechanisms.

In an implementation, a display system includes a head-mounted display unit and a removable lens assembly. The head mounted display unit includes a display module and a corresponding mechanical coupling feature. The removable lens assembly includes a corrective lens element, a frame coupled to the corrective lens element, and a mechanical coupling feature coupled to the frame. The mechanical coupling feature is receivable by the corresponding mechanical coupling feature to removably couple the removable lens assembly to the head-mounted display unit.

The mechanical coupling feature may engage the corresponding mechanical coupling feature to prevent movement of the removable lens assembly relative to the head-mounted display unit transverse to, along, and/or about an optical axis of the corrective lens element. The removable lens assembly may further include a magnetic coupling feature spaced part from the mechanical coupling feature and by which the removable lens assembly is magnetically coupleable to the head-mounted display unit. The display module may include a lens mount that includes the corresponding mechanical coupling feature, and the removable lens assembly may be removably coupleable to the display module.

Disclosed herein are embodiments of display systems that include a head-mounted display unit and one or more interchangeable lenses. The interchangeable lenses may be configured according to characteristics of different eyes of different users (e.g., according to an eyeglass prescription). For example, one pair of interchangeable lenses may be associated with (e.g., prescribed for) one user, while another pair of interchangeable. Lenses may be associated with another user. The interchangeable lenses are mountable to the head-mounted display unit in an interchangeable manner such that different lenses may be mounted to the head-mounted display unit to accommodate different users with different eye characteristics. The interchangeable lenses may be mounted to the head-mounted display unit in various different manners. The display system may also identify the interchangeable lenses mounted to the head-mounted display unit and/or identify the user and perform various operations in response thereto.

Referring to FIGS. 11.4.1-1 and 11.4.1-2, a display system 11.4.1-100 generally includes a head-mounted display unit 11.4.1-110 and one or more removable lens assemblies 11.4.1-120. The head-mounted display unit 11.4.1-110 generally includes a housing 11.4.1-112, a head support 11.4.1-114, one or more display modules 11.4.1-116 (e.g., two; one for each eye), and various other electronics (e.g., controller or computing device, communications interface, audio input and/or output devices, sensors, battery or other power electronics; see also FIG. 11.4.1-12). The display system 11.4.1-100 is configured to provide a computer-generated reality (e.g., virtual reality or mixed reality) in which case the display system 11.4.1-100 may be considered a computer-generated reality system or computer-generated reality display system, a virtual reality system or a virtual reality display system, or a mixed reality display system or mixed reality system. The terms computer-generated reality, virtual reality, and mixed reality are discussed in further detail below.

The housing 11.4.1-112 contains or is otherwise coupled to the one or more display modules 11.4.1-116 and the other electronics. The housing 11.4.1-112 may also include various compliant components coupled thereto for engaging the face of the user to be supported thereon (not shown). The head support 11.4.1-114 is coupled to the housing 11.4.1-112 to support the head-mounted display unit 11.4.1-110 on a head of a user with the one or more display modules 11.4.1-116 in suitable positions relative to eyes of the user. As shown, the head support 11.4.1-114 may be configured as a strap or band that is configured to extend around the head of the user. The display module 11.4.1-116 is coupled to the housing 11.4.1-112 in a fixed position (as shown).

Referring to FIGS. 11.4.1-3A-3B, the display module 11.4.1-116 generally includes a display **11.4.1-316*a*, a primary lens 11.4.1-316*b*, and a lens mount 11.4.1-316*c*. The display 11.4.1-316*a* is configured to display graphics to the user. The display 11.4.1-316*a* may, for example, be a display screen, such as a liquid crystal display (LCD), organic light-emitting diode (OLED) display, or other suitable display. The display 11.4.1-316*a*** may be coupled to a circuit board or other support.

The primary lens **11.4.1-316*b* is coupled to the display 11.4.1-316*a*. The primary lens 11.4.1-116*b* is positioned between the display 11.4.1-116*a* and the eye of the user and refracts light emitted from the display 11.4.1-316*a* before reaching the eye of the user. The primary lens 11.4.1-316*b* may be omitted depending on configurations of the display 11.4.1-316*a* and/or the removable lens assemblies 11.4.1-120**.

The lens mount **11.4.1-316*c* is configured to couple to and support the removable lens assembly 11.4.1-120 between the display 11.4.1-316*a* and the eye of the user (i.e., with the primary lens 11.4.1-316*b* being between the display 11.4.1-316*a* and the removable lens assembly 11.4.1-120). As shown, the lens mount 11.4.1-316*c* may additionally couple to and support the primary lens 11.4.1-316*b* relative to the display 11.4.1-316*a*, such as by being coupled to the circuit board or other support of the display 11.4.1-316*a*. The lens mount 11.4.1-316*c* may surround the primary lens 11.4.1-316*b* (e.g., forming a bezel or barrel structure of the primary lens 11.4.1-316*b***).

The removable lens assembly 11.4.1-120 generally includes a lens element 11.4.1-330 and a lens frame 11.4.1-340. The lens frame 11.4.1-340 is coupled to the lens element 11.4.1-330 and is configured to removably couple to the lens mount **11.4.1-316*c* for supporting the lens element 11.4.1-330 in a predetermined position on to the display module 11.4.1-116 (e.g., relative to the display 11.4.1-316*a* and/or the primary lens 11.4.1-316*b*). The lens frame 11.4.1-340 is, for example, coupled to an outer peripheral surface of the lens element 11.4.1-330. Variations of the lens mount 11.4.1-316*c* and interaction with the lens frame 11.4.1-340 are discussed in further detail below. The removable lens assembly 11.4.1-120** may also be referred to as an interchangeable lens assembly, an interchangeable lens, a removable lens, or a lens.

The lens element 11.4.1-330 may be a corrective lens, for example, to address refractive errors of the eye of the user, such as myopia, hypermetropia, and/or astigmatism. The removable lens assembly 11.4.1-120 and the lens element 11.4.1-330 may be associated with a particular user by having particular lens characteristics to address the particular refractive errors of the eye of the particular user (e.g., eye characteristics). Such lens characteristics and eye characteristics may each include sphere, cylinder, axis, and/or other parameters conventionally used to define eyeglass prescriptions or refractive errors of eyes of one or more users.

The lens characteristics of the lens element 11.4.1-330 and, thereby the removable lens assembly 11.4.1-120, may also include a center (e.g., optical axis) that is to be aligned with a pupil of the user. Therefore, the removable lens assembly 11.4.1-120 may be mounted to the lens mount **11.4.1-316*c* in a predetermined position (i.e., up/down, left/right, and rotational position) to ensure proper spatial positioning of the lens element 11.4.1-330** relative to the eye of the user.

The lens element 11.4.1-330 may, instead, be a non-corrective lens that protects the primary lens **11.4.1-316*b* from contact by the user and/or debris, which might otherwise interfere with the user viewing the display 11.4.1-316*a* (e.g., scratching or obstructing the view). For example, one pair of removable lens assemblies 11.4.1-120 may include lens elements 11.4.1-330 that are corrective for use by a particular user, while another pair of removable lens assemblies 11.4.1-120 may include lens elements 11.4.1-330** that are non-corrective for use by other users (e.g., users not requiring corrective lenses).

Referring to FIGS. 11.4.1-4-11.4.1-6, an outer periphery of the removable lens assembly 11.4.1-120 may have different shapes. As shown in FIG. 11.4.1-4, the removable lens assembly 11.4.1-120 has an outer periphery that is formed by the lens frame 11.4.1-340 and that is ovular (i.e., having curved left and right ends; as shown). The outer periphery may instead be circular (see lens frame 11.4.1-540 of lens assembly 11.4.1-520 in FIG. 11.4.1-5) or may be rectangular (see lens frame 11.4.1-640 of lens assembly 11.4.1-620 in FIG. 11.4.1-6). As discussed in further detail below, those lens assemblies having outer peripheries that are rotationally symmetric (e.g., being ovular, circular, rectangular, or other suitable shape) may be further configured to couple to the lens mount **11.4.1-316*c* in different rotational positions about the optical axis of the lens element 11.4.1-330 for use with the display module 11.4.1-116. Alternatively, the removable lens assemblies 11.4.1-120 may have outer peripheries that are rotationally asymmetric, such that the lens mount 11.4.1-316*c* is coupleable in only one position for use with the display module 11.4.1-116**.

Referring again to FIG. 11.4.1-3A and FIG. 11.4.1-4, light is emitted by the display **11.4.1-316*a* and passes through the primary lens 11.4.1-316*b* and then through the lens element 11.4.1-330 before reaching the eye of the user. For example, light emitted from outer edges 11.4.1-360*a* of the display 11.4.1-316*a* may generally follow an outer light path 11.4.1-360 (e.g., a ray trace), whereby the light emitted from the display 11.4.1-316*a* is refracted by the primary lens 11.4.1-316*b* and is subsequently refracted by the lens element 11.4.1-330. The outer light path 11.4.1-360 passes through the primary lens 11.4.1-316*b* generally a passage location 11.4.1-360*b*. The outer light path 11.4.1-360 enters an entry side 11.4.1-330*a* of the lens element 11.4.1-330 at entry point 11.4.1-360*c* and exits an exit side 11.4.1-330*b* of the light path at an entry point 11.4.1-360*c*. Moving through the lens element 11.4.1-330 from the entry side 11.4.1-330*a* to the exit side 11.4.1-330*b*, the outer light path 11.4.1-360** narrows, so as to focus toward the eye of the user.

Areas of the lens element 11.4.1-330 outside of the entry point **11.4.1-360*c* and the exit point 11.4.1-360*d* (i.e., radially outward toward edges of the lens element 11.4.1-330) do not function to refract light toward the eye of the user and may be considered non-functional (e.g., non-refractive). Such non-functional areas of the lens element 11.4.1-330 may be removed and/or blocked by the lens frame 11.4.1-340, thereby permitting different structural configurations of the lens frame 11.4.1-340. As shown in FIG. 11.4.1-4, the functional area of the lens element 11.4.1-330 may, as shown, be smaller than a functional area of the primary lens 11.4.1-316*b* (e.g., smaller in area, width, and/or height than the functional the passage location 11.4.1-360*b* on the entry side 11.4.1-330*a* at the entry point 11.4.1-360*c* and/or on the exit side 11.4.1-330*b* at the exit point 11.4.1-360*d*). The functional area of the lens element 11.4.1-330 may also, as shown, be smaller than the display 11.4.1-316*a* (e.g., smaller in area, width and/or height than the light emitting of the display 11.4.1-316*a* on the entry side 11.4.1-330*a* at the entry point 11.4.1-360*c* and/or on the exit side 11.4.1-330*b* at the exit point 11.4.1-360*d*). The functional area of the primary lens 11.4.1-316*b* may, as shown, be larger than the display 11.4.1-316*a* (e.g., larger in area, width, and/or height than a light emitting area of the display 11.4.1-316*a*). Additionally, the functional areas of the primary lens 11.4.1-316*b* and the lens element 11.4.1-330 may allow for any eye camera 11.4.1-319 of the head-mounted display unit 11.4.1-110 (e.g., of the display module 11.4.1-116) to observe the eye of the user (e.g., light moving in a direction opposite that emitted by the display 11.4.1-316*a***).

Still referring to FIGS. 11.4.1-3A-3B, an outer periphery of the lens element 11.4.1-330 is coupled to an inner periphery of the lens frame 11.4.1-340, for example, being engaged thereby and/or adhered thereto. The outer periphery of the lens element 11.4.1-330 and the inner periphery of the lens frame 11.4.1-340 have corresponding shapes allowing coupling therebetween, such as being straight (e.g., having the same cross-sectional shape moving axially) or tapering (e.g., widening moving toward the display module 11.4.1-116). The outer periphery of the lens element 11.4.1-330 may have generally the same size as the primary lens **11.4.1-316*b* (e.g., having generally the same area, width, and/or height), which defines non-functional area of the lens element 11.4.1-330**.

Referring to FIGS. 11.4.1-7-11.4.1-9 and as referenced above, the non-functional area of the lens element 11.4.1-330 may be reduced with the lens element 11.4.1-330 being smaller than the primary lens **11.4.1-316*b***.

As shown in FIG. 11.4.1-7, a removable lens assembly 11.4.1-720 is a variation of the removable lens assembly 11.4.1-120 and generally includes a lens element 11.4.1-730 and a lens frame 11.4.1-740. The lens element 11.4.1-730 is a variation of the lens element 11.4.1-330 differing by being smaller, such as by being smaller than the primary lens **11.4.1-316*b* (e.g., smaller in area, width, and/or height). The lens frame 11.4.1-740 is a variation of the lens frame 11.4.1-340 differing by extending radially inward further than the lens frame 11.4.1-740, such as by having an inner periphery that is smaller than the primary lens 11.4.1-316*b* and/or the lens mount 11.4.1-316*c*** (e.g., being smaller in area, width, and/or height).

Referring to FIG. 11.4.1-8, a removable lens assembly 11.4.1-820 is a variation of the removable lens assembly 11.4.1-120 and generally includes a lens element 11.4.1-830 and a lens frame 11.4.1-840. The lens element 11.4.1-830 is a variation of the lens element 11.4.1-830 differing by having edges that are beveled (e.g., tapered) at an angle or curvature that more closely conforms to the angle at which the outer light path 11.4.1-360 (e.g., the angle of refraction) passes through the lens element 11.4.1-830. For example, an outer peripheral surface of the lens element 11.4.1-830 may extend at an angle measured relative to the optical axis of the lens element that is greater than zero, such as between 15 and 75 degrees, such as between 30 and 60 degrees). Edges of the outer peripheral surface on entry and exit sides of the lens element 11.4.1-830 may be smaller than peripheral dimensions of the primary lens **11.4.1-316*b* (e.g., being smaller in area, width, and/or height). The edge of the peripheral surface on the exit side of the lens element 11.4.1-830 may be smaller than the edge of the peripheral surface on the entry side thereof (e.g., reducing in size moving away from the primary lens 11.4.1-316*b* and toward the eye of the user). The lens frame 11.4.1-840 is a variation of the lens frame 11.4.1-340 by extending radially inward further than the lens frame 11.4.1-340, such as by having an inner periphery that is smaller than the primary lens 11.4.1-316*b* on one or both of entry and exit sides of the lens element 11.4.1-830. The lens frame 11.4.1-840 is coupled to the outer peripheral surface of the lens element 11.4.1-830 and may follow or otherwise accommodate the shape of the peripheral surface of the lens element 11.4.1-830** (e.g., having a matching bevel or contour).

Referring to FIG. 11.4.1-9 a removable lens assembly 11.4.1-920 is a variation of the removable lens assembly 11.4.1-120 and generally includes a lens element 11.4.1-930 and a lens frame 11.4.1-940. The lens element 11.4.1-930 is a variation of the lens element 11.4.1-330 differing by having non-functional areas of the exit side (e.g., or other concave side) forming a forward surface, which may be planar, that is coupled to the lens frame 11.4.1-940 and surrounds functional areas of the lens element 11.4.1-930. The lens frame 11.4.1-940 is a variation of the lens frame 11.4.1-340 by being coupled to the forward surface of the exit side **11.4.1-930*b* of the lens element 11.4.1-930, and protruding inward from the lens mount 11.4.1-316*c***.

Referring again to FIGS. 11.4.1-3-11.4.1-4, the lens mount **11.4.1-316*c* and the removable lens assembly 11.4.1-120 are cooperatively configured for the removable lens assembly 11.4.1-120 to removably couple to the lens mount 11.4.1-316*c* to be supported thereby. As shown, the lens mount 11.4.1-316*c* and the removable lens assembly 11.4.1-120 include cooperative coupling features 11.4.1-316*d*, 11.4.1-322, respectively. The cooperative coupling features 11.4.1-316*d*, 11.4.1-322 are magnetic and may be referred to as magnetic coupling features. The magnetic coupling features 11.4.1-316*d*, 11.4.1-322 are arranged at corresponding positions of the lens mount 11.4.1-316*c* and the lens frame 11.4.1-340 of the removable lens assembly 11.4.1-120 for the lens mount 11.4.1-316*c* to support the removable lens assembly 11.4.1-120 in the one or more predetermined positions (i.e., vertically, laterally, and rotationally) at which the lens element 11.4.1-330** is properly aligned with the eye of the user.

For each pair of the corresponding magnetic coupling features **11.4.1-316*d*, 11.4.1-322, one may be a permanent magnet, while the other the other is an attractor element (e.g., an attractor plate made of a ferromagnetic material) or another permanent magnet of suitable orientation. For example, the magnetic coupling features 11.4.1-316*d* of the lens mount 11.4.1-316*c* may be attractor plates, while the magnetic coupling features 11.4.1-322 of the removable lens assembly 11.4.1-120** are permanent magnets.

The magnetic coupling features **11.4.1-316*d*, 11.4.1-322 are provided in suitable size, number, and location for the lens mount 11.4.1-316*c* to adequately support the removable lens assembly 11.4.1-120 during use, while still allowing the removable lens assembly 11.4.1-120 to be easily removed by the user. For example, as shown, the lens mount 11.4.1-316*c* and the removable lens assembly 11.4.1-120 may include six pairs of the magnetic coupling features 11.4.1-316*d*, 11.4.1-322**, more or less.

The removable lens assembly 11.4.1-120 and the lens mount **11.4.1-316*c* may be configured for the removable lens assembly 11.4.1-120 to be mounted to the lens mount 11.4.1-316*c* in only one predetermined position. For example, the lens element 11.4.1-330 may have an optical axis that is to be positioned off-center relative to the lens mount 11.4.1-316*c*, thereby requiring the removable lens assembly 11.4.1-120 to be coupled to the lens mount 11.4.1-316*c* in one predetermined position. If the removable lens assembly 11.4.1-120 were instead coupled the lens mount 11.4.1-316*c* in another position rotated therefrom, the optical axis would be moved relative to the lens mount 11.4.1-316*c* and, thereby, relative to the display 11.4.1-316*a*** and the eye of the user, resulting in reduced image quality perceived by the user.

The magnetic coupling features **11.4.1-316*d*, 11.4.1-322 may be configured to prevent incorrect positioning of the removable lens assembly 11.4.1-120 relative to the lens mount 11.4.1-316*c*. For example, as shown in FIG. 11.4.1-4 with the magnetic coupling features 11.4.1-322 illustrated in dashed lines in FIG. 11.4.1-4 (e.g., being embedded, hidden, or otherwise coupled to the lens frame 11.4.1-340), the magnetic coupling features 11.4.1-316*d*, 11.4.1-322 may be positioned and/or distributed asymmetrically to prevent alignment of corresponding pairs of the magnetic coupling features 11.4.1-316*d*, 11.4.1-322 and, thereby, prevent coupling of the removable lens assembly 11.4.1-120 to the lens mount 11.4.1-316*c* in another position (e.g., rotated by 180 degrees). Instead or additionally, the magnetic characteristics of the magnetic coupling features 11.4.1-316*d*, 11.4.1-322 (e.g., orientation and whether being an attractor plate or a permanent magnetic) may prevent magnetic coupling of those magnetic coupling features 11.4.1-316*d* that do not correspond to each other in another position (e.g., rotated orientation). For example, if the removable lens assembly 11.4.1-120 were rotated by 180 degrees, the magnetic coupling features 11.4.1-316*d*, 11.4.1-322** that are aligned but do not correspond to each other may not attract each other (e.g., two attractor plates) or may repel each other (e.g., permanent magnets with common poles positioned adjacent each other).

The lens mount **11.4.1-316*c* and the removable lens assembly 11.4.1-120 may be further configured to mechanically prevent misalignment thereof. For example, the lens mount 11.4.1-316*c* and the removable lens assembly 11.4.1-120 may further include mechanical engagement features 11.4.1-316*e*, 11.4.1-324, respectively. The mechanical engagement features 11.4.1-316*e*, 11.4.1-324 mechanically engage each other to ensure proper positioning and/or alignment between the lens mount 11.4.1-316*c* and the removable lens assembly 11.4.1-120. The mechanical engagement features 11.4.1-316*e*, 11.4.1-324 may further engage each other to further prevent relative movement of the removable lens assembly 11.4.1-120 to the lens mount 11.4.1-316*c* (e.g., in vertical and left-to-right directions relative to the optical axis, while the magnetic coupling features 11.4.1-316*d*, 11.4.1-322** prevent movement in along the optical axis).

The mechanical engagement features **11.4.1-316*e*, 11.4.1-324 may, for example, be a recess and a protrusion, respectively, that is received by the recess, or vice versa. If the removable lens assembly 11.4.1-120 were arranged in different position relative to the lens mount 11.4.1-316*c*, the protrusion would instead engage another surface of the lens mount 11.4.1-316*c* to prevent mating of the removable lens assembly 11.4.1-120 thereto. Alternatively, the opposed axially-facing (e.g., mating) surfaces of the display module 11.4.1-116 (e.g., the lens mount 11.4.1-316*c*) and the removable lens assembly 11.4.1-120 (e.g., of the lens frame 11.4.1-340) may have three-dimensional contours that prevent misalignment of the removable lens assemble 11.4.1-120 relative to the lens mount 11.4.1-316*c***.

Instead of having only one mounting position, the removable lens assembly 11.4.1-120 and the lens mount **11.4.1-316*c* may be configured for the removable lens assembly 11.4.1-120 to be mounted to the lens mount 11.4.1-316*c* in more than one position. For example, the lens frame 11.4.1-340 and the lens mount 11.4.1-316*c*, the coupling features, and/or the mechanical alignment features may be cooperatively configured for the removable lens assembly 11.4.1-120 to couple to the lens mount 11.4.1-316*c* in two predetermined positions (e.g., by being two-fold rotationally symmetric) or more (e.g., three, or four) and to not couple to the lens mount 11.4.1-316**c in other positions.

Referring to FIG. 11.4.1-10A-11.4.1-11B, variations of the removable lens assembly 11.4.1-120 and the lens mount 11.4.1-316c are configured for mechanically coupling the removable lens assembly 11.4.1-120 to the lens mount 11.4.1-316c.

As shown in FIGS. 11.4.1-10A-11.4.1-10B, a display module 11.4.1-1016 includes a lens mount 11.4.1-1016c to which removable lens assembly 11.4.1-1020 is removably coupleable with interfitting structures (e.g., forming an interference fit). The removable lens assembly 11.4.1-1020 includes the lens element 11.4.1-330 and a lens frame 11.4.1-1040, which may be coupled to each other and otherwise configured in the manners described previously (see, e.g., FIGS. 11.4.1-3A-11.4.1-9). The lens frame 11.4.1-1040 includes a barrel 11.4.1-1042 having an annular protrusion 11.4.1-1044 (e.g., a lip or circumferential lip). The barrel 11.4.1-1042 extends axially rearward (e.g., of the lens element 11.4.1-330), while the annular protrusion 11.4.1-1044 protrudes radially inward therefrom. The lens frame 11.4.1-1040 may further define an annular recess 11.4.1-1046 (e.g., a circumferential channel; not labeled) extending radially outward from the annular protrusion 11.4.1-1044 and positioned axially outward thereof (i.e., away from the display 11.4.1-316a). The annular protrusion 11.4.1-1044 and the annular recess 11.4.1-1046 extend circumferentially around the axis of the lens element 11.4.1-330 entirely or substantially entirely (e.g., 80% or more).

The lens mount 11.4.1-1016c includes a barrel 11.4.1-1016d having an annular protrusion 11.4.1-1016e. The barrel 11.4.1-1016d extends axially forward, while the annular protrusion 11.4.1-1016e protrudes radially outward therefrom. The annular protrusion 11.4.1-1016e further defines an annular recess 11.4.1-1016f (e.g., a circumferential channel) positioned axially forward and extending radially inward thereof. The annular protrusion 11.4.1-1016e and the annular recess 1016f defined thereby extend circumferentially around the axis of the lens element 11.4.1-330 entirely or substantially entirely.

The barrel 11.4.1-1042 of the lens frame 11.4.1-1040 is configured to receive the barrel 11.4.1-1016d of the lens mount 11.4.1-1016c therein, so as to removably couple the removable lens assembly 11.4.1-1020 to the lens mount 11.4.1-1016c. The annular protrusion 11.4.1-1044 of the lens frame 11.4.1-1040 is received by and retained in the annular recess 11.4.1-1016f of the lens mount 11.4.1-1016c, while the annular protrusion 11.4.1-1016e of the lens mount 11.4.1-1016c is received by and retained in the annular recess 11.4.1-1046 of the lens frame 11.4.1-1040.

An inner periphery of the annular protrusion 11.4.1-1044 of the lens frame 11.4.1-1040 is smaller than an outer periphery of the annular protrusion 11.4.1-1016e of the lens mount 11.4.1-1016c, such that axial surfaces of the annular protrusions 11.4.1-1044, 11.4.1-1016e overlap each other radially and engage each other axially to prevent unintended decoupling of the removable lens assembly 11.4.1-1020 from the display module 11.4.1-1016. The annular protrusion 11.4.1-1044, as may be the barrel 11.4.1-1042, of the lens frame 11.4.1-1040 is formed of a compliant material, such as rubber or other polymer, that allows the inner periphery of the annular protrusion 11.4.1-1044 to expand and stretch over the annular protrusion 11.4.1-1016e of the lens mount 11.4.1-1016c. The lens frame 11.4.1-1040 being formed of, or otherwise including, the compliant material forming the annular protrusion 11.4.1-1044 may also provide a soft material that may incidentally contact or otherwise engage the face of the user. Alternatively, the barrel 11.4.1-1042 and/or the annular protrusion 11.4.1-1044 may form a flexure. In a still further alternative, the barrel 11.4.1-1042 and the annular protrusion 11.4.1-1044 of the removable lens assembly 11.4.1-1020 are rigid, while the barrel 11.4.1-1016d and/or the annular protrusion 11.4.1-1016e of the display module 11.4.1-1016 are compliant or form a flexure.

While the lens frame 11.4.1-1040 and the lens mount 11.4.1-1016c have been shown and described with the lens mount 11.4.1-1016c (e.g., the barrel 11.4.1-1016d and the annular protrusion 11.4.1-1016e) being received within the lens frame 11.4.1-1040, the lens frame 11.4.1-1040 and the lens mount 11.4.1-1016c may be arranged in an opposite manner with the lens frame 11.4.1-1040 receiving the lens mount 11.4.1-1016c.

As shown in FIGS. 11.4.1-11A-11.4.1-11B, a display module 11.4.1-1116 includes a lens mount 11.4.1-1116c to which a removable lens assembly 11.4.1-1120 is removably coupled with sprung mechanisms. The removable lens assembly 11.4.1-1120 includes retractable latches 11.4.1-1122 (e.g., latch members) that are normally sprung radially outward for receipt into receptacles 11.4.1-1116d of the lens mount 11.4.1-1116c corresponding thereto. For example, the retractable latches 11.4.1-1122 extend axially rearward from a rear axial surface of a lens frame 11.4.1-1140 and include inner ends 11.4.1-1124 (e.g., hooked or outwardly protruding ends) that extend radially outward therefrom (e.g., hooked ends). When the retractable latches 11.4.1-1122 are retracted (e.g., by a user pressing on exposed ends of the protrusions), the retractable latches 11.4.1-1122 are axially insertable into or removable from the receptacles 11.4.1-1116d in the forward axial surface of the lens mount 11.4.1-1116c corresponding thereto. The inner ends of the retractable latches 11.4.1-1122 are received behind lips 11.4.1-1116e of the receptacles 11.4.1-1116d. Springs (shown schematically; not labeled) bias the retractable latches 11.4.1-1122 radially outward upon release by the user, such that the inner ends of the retractable latches 11.4.1-1122 are arranged behind and engage the lips 11.4.1-1116e of the receptacles 11.4.1-1116d to retain the removable lens assembly 11.4.1-1120 on the lens mount 11.4.1-1116c. While the retractable latches 11.4.1-1122 have been shown and described as being part of the removable lens assembly 11.4.1-1120, retractable latches may instead be provided on the display module 11.4.1-1116 for releasably engaging the removable lens assembly 11.4.1-1120 in a similar manner (e.g., engaging receptacles in an outer peripheral surface of the lens frame 11.4.1-1140.

Referring to FIGS. 11.4.1-12A-11.4.1-12B, in still further examples, variations of the removable lens assembly 11.4.1-120 may be coupled to the lens mount 11.4.1-1216c in other manners. For example, a removable lens assembly 11.4.1-1220 and the lens mount 11.4.1-1216c may include corresponding mating features 11.4.1-1222, 11.4.1-1223 (e.g., tabs and detents or protrusions) that allow for coupling of the removable lens assembly 11.4.1-1220 to the lens mount 11.4.1-1216c with one or more of an axial motion 11.4.1-1222a, a vertical motion 11.4.1-1222b, or a turning motion 11.4.1-1222c. The axial motion 11.4.1-1222a, the vertical motion 11.4.1-1222b, or the turning motion 11.4.1-1222c (e.g., a quarter turn) cause engagement and coupling of the removable lens assembly 11.4.1-1220 to the lens mount 11.4.1-1216c via the corresponding mating features 11.4.1-1222, 11.4.1-1223.

Referring additionally to FIG. 11.4.1-12C, a removable lens assembly 11.4.1-1220' is coupled to a display unit

11.4.1-1216' via a friction or interference fit. In particular, the removable lens assembly 11.4.1-1220 includes a lens frame 11.4.1-1240' that is received by a lens mount **11.4.1-1216*c*' of the display unit 11.4.1-1216', so as to be retained thereby via friction (e.g., with the lens frame 11.4.1-1240' being compressed radially inward by the lens mount 11.4.1-1216*c*'**).

Referring additionally to FIG. 11.4.1-12D, the removable lens assembly 11.4.1-1220' is coupled to the display unit 11.4.1-1216' via the retractable pins **11.4.1-1216*d*. For example, the display unit 11.4.1-1216' includes the lens mount 11.4.1-1216*c*' that receives the lens frame 11.4.1-1240' of the removable lens assembly 11.4.1-1220' therein and the retractable pins 11.4.1-1216*d*, which are selectively extended into corresponding recesses of the lens frame 11.4.1-1240'. For example, the pins 11.4.1-1216*d*' may be spring biased radially inward, so as to be received by the lens frame 11.4.1-1240'**.

Referring to FIGS. 11.4.1-13A-11.4.1-13F, in a still further example, a removable lens assembly 11.4.1-1320 includes a mechanical coupling feature 11.4.1-1322 (e.g., a male component, or protrusion), which may be referred to as a lens mechanical coupling feature 11.4.1-1322, while a display module 11.4.1-1310 includes a corresponding mechanical coupling feature 11.4.1-1312 (e.g., a female component, recess, or receptacle), which may be referred to as a display mechanical coupling feature 11.4.1-1312. The lens mechanical coupling feature 11.4.1-1322 and the display mechanical coupling feature 11.4.1-1312 mechanically mate with each other to mechanically couple the removable lens assembly 11.4.1-1320 to the display module 11.4.1-1310. For example, as discussed in further detail below, the lens mechanical coupling feature 11.4.1-1322 and the display mechanical coupling feature 11.4.1-1312 may prevent movement of the removable lens assembly 11.4.1-1320 relative to the display module 11.4.1-1310 in directions generally perpendicular to, generally parallel with, and/or about an optical axis of the removable lens assembly 11.4.1-1320.

The removable lens assembly 11.4.1-1320 may further include one or more magnetic coupling features 11.4.1-1324, which may be referred to as lens magnetic coupling features 11.4.1-1324, while the display module 11.4.1-1310 includes one or more corresponding magnetic coupling features 11.4.1-1314, which may be referred to as display magnetic coupling features 11.4.1-1314. The lens magnetic coupling feature 11.4.1-1324 and the display magnetic coupling feature 11.4.1-1314 magnetically couple to each other to magnetically couple the removeable lens assembly 11.4.1-1320 to the display module 11.4.1-1310. For example, as discussed in further detail below, the lens magnetic coupling feature 11.4.1-1324 and the display magnetic coupling feature 11.4.1-1314 may prevent movement of the removable lens assembly 11.4.1-1320 relative to the display module 11.4.1-1310 in directions generally parallel with the optical axis of the removable lens assembly 11.4.1-1320.

The lens mechanical coupling feature 11.4.1-1322 of the removable lens assembly 11.4.1-1320 may be arranged on a first side thereof (e.g., left, right, upper, lower, inner, or outer), while the one or more lens magnetic coupling features 11.4.1-1324 may be arranged on a second side thereof, which may be spaced apart from and/or opposite the first side (e.g., right, left, lower, upper, outer, or inner, respectively, such as with the lens element 11.4.1-330 being positioned therebetween). The lens mechanical coupling feature 11.4.1-1322 may be formed by (e.g., be integrally-formed with) a lens frame 11.4.1-340, while the one or more lens magnetic coupling features 11.4.1-1324 are coupled to the lens frame 11.4.1-340. The lens magnetic coupling features 11.4.1-1324 may be or include one or more permanent magnets and/or an attractor material (e.g., ferromagnetic material or component).

The display module 11.4.1-1310 includes a lens mount 11.4.1-1311 having the lens mechanical coupling feature 11.4.1-1322 and the one or more lens magnetic coupling features 11.4.1-1324. As discussed in further detail below, the display mechanical coupling feature 11.4.1-1312 of the lens mount 11.4.1-1311 is configured to receive the lens mechanical coupling feature 11.4.1-1322 therein. The one or more display magnetic coupling features 11.4.1-1314 of the lens mount 11.4.1-1311 magnetically couple to the lens magnetic coupling features 11.4.1-1324 (e.g., being a permanent magnet of opposite polarity or being an attractor material).

As referenced above, the lens mechanical coupling feature 11.4.1-1322 of the removable lens assembly 11.4.1-1320 and the display mechanical coupling feature 11.4.1-1312 of the display module 11.4.1-1310 are configured to mate with each other and, in particular, with the lens mechanical coupling feature 11.4.1-1322 being received by the display mechanical coupling feature 11.4.1-1312. When received thereby, the lens mechanical coupling feature 11.4.1-1322 engages the display mechanical coupling feature 11.4.1-1312 to prevent relative movement therebetween. For example, the lens mechanical coupling feature 11.4.1-1322 engages the display mechanical coupling feature 11.4.1-1312 to prevent relative shearing movement between the removable lens assembly 11.4.1-1320 and the display module 11.4.1-1310, such as upward movement, lateral movement (e.g., in a direction generally perpendicular to an optical axis of the removable lens assembly 11.4.1-1320), and/or rotational movement of the removable lens assembly 11.4.1-1320 relative to the display module 11.4.1-1310 (e.g., generally about the optical axis of the removable lens assembly 11.4.1-1320).

To prevent relative upward movement, an upwardly-facing surface of the lens mechanical coupling feature 11.4.1-1322 engages a downwardly facing surface of the display mechanical coupling feature 11.4.1-1312. To prevent relative downward movement, a downwardly-facing surface of the lens mechanical coupling feature 11.4.1-1322 engages an upwardly-facing surface of the display mechanical coupling feature 11.4.1-1312. For example, upper and lower ends of the lens mechanical coupling feature 11.4.1-1322 engaging respective upper and lower ends of the display mechanical coupling feature 11.4.1-1312 (see FIGS. 11.4.1-13A and 11.4.1-13B). Alternatively, upward- and downward-facing surfaces at intermediate heights of the lens mechanical coupling feature 11.4.1-1322 and the display mechanical coupling feature 11.4.1-1312 engage each other to prevent upward and downward relative movement.

To prevent relative lateral outward movement (e.g., away from the nose of the user), a laterally outward-facing surface of the lens mechanical coupling feature 11.4.1-1322 engages a laterally inwardly-facing surface of the display mechanical coupling feature 11.4.1-1312 (e.g., a leftward facing surface and a rightward facing surface, respectively, for a left removable lens assembly 11.4.1-1320). To prevent relative lateral inward movement (e.g., toward the nose of the user), a laterally inward-facing surface of the lens mechanical coupling feature 11.4.1-1322 engages a laterally outward-facing surface of the display mechanical coupling feature 11.4.1-1312 (e.g., a rightward facing surface and a leftward facing surface, respectively, for a left removable lens assembly 11.4.1-1320), as is shown in FIG. 11.4.1-13F. For example, as is illustrated, the lens mechanical coupling feature 11.4.1-1322 and the display mechanical coupling feature 11.4.1-1312 have curved shapes with outward and inward sides of the lens mechanical coupling feature 11.4.1-1322 (e.g., concave and convex surfaces) engaging respective outward and inward sides of the display mechanical coupling feature 11.4.1-1312 (e.g., convex and concave surfaces, respectively).

To prevent relative rotational movement, the lens mechanical coupling feature 11.4.1-1322, in spaced apart locations on opposite sides thereof (e.g., two on each side), engages the display mechanical coupling feature 11.4.1-1312 on opposite sides thereof. For example, as a clockwise torque is applied to the removable lens assembly 11.4.1-1320, upper inner surfaces and lower outer surfaces of the lens mechanical coupling feature 11.4.1-1322 and the display mechanical coupling feature 11.4.1-1312 engage each other to constrain (e.g., prevent) relative clockwise rotation therebetween. As a counterclockwise torque is applied to the removable lens assembly 11.4.1-1320, upper outer surface and lower inner surfaces of the lens mechanical coupling feature 11.4.1-1322 and the display mechanical coupling feature 11.4.1-1312 engage each other to constrain (e.g., prevent) relative counterclockwise rotation therebetween.

The lens mechanical coupling feature 11.4.1-1322 and the display mechanical coupling feature 11.4.1-1312 may additionally be configured to prevent normal movement (e.g., in the general direction of the optical axis) away from the display module 11.4.1-1310. For example, the display mechanical coupling feature 11.4.1-1312 may include a forward-facing surface (e.g., an undercut or toe-in feature) that engages a rearward facing surface of the lens mechanical coupling feature 11.4.1-1322.

Referring to FIG. 11.4.1-13E, to couple the removable lens assembly 11.4.1-1320 to the display module 11.4.1-1310, the lens mechanical coupling feature 11.4.1-1322 is first inserted into the display mechanical coupling feature 11.4.1-1312, and the removable lens assembly 11.4.1-1320 is rotated to bring the magnetic coupling features 11.4.1-1324, 11.4.1-1314 closer to each other to magnetically couple, as discussed in further detail below.

As referenced above, the lens magnetic coupling features 11.4.1-1324 of the removable lens assembly 11.4.1-1320 and the display magnetic coupling features 11.4.1-1314 of the display module 11.4.1-1310 couple to each other magnetically. The lens magnetic coupling features 11.4.1-1324 and the display magnetic coupling features 11.4.1-1314 are arranged at corresponding positions and with corresponding magnetic properties (e.g., being opposite polarity, or one being a ferromagnetic material and the other a permanent magnetic). The lens magnetic coupling features 11.4.1-1324 and the display magnetic coupling features 11.4.1-1314 couple to each other magnetically with force therebetween applied generally in the direction of the optical axis. The lens magnetic coupling features 11.4.1-1324 and the display magnetic coupling features 11.4.1-1314 are also spaced apart from the pivot axis defined by the display mechanical coupling feature 11.4.1-1312, such that the magnetic coupling for therebetween prevent rotation about the pivot axis defined the display mechanical coupling feature 11.4.1-1312. For example, as shown, the lens magnetic coupling features 11.4.1-1324 and the display magnetic coupling features 11.4.1-1314 are positioned generally opposite the lens mechanical coupling feature 11.4.1-1322 and the display mechanical coupling feature 11.4.1-1312, respectively.

Variations of the removable lens assembly 11.4.1-1320 and the display module 11.4.1-1310 are contemplated. For example, the lens mechanical coupling feature 11.4.1-1322 and the display mechanical coupling feature 11.4.1-1312 may have different shapes (e.g., being straight), may be provided in different numbers (e.g., two or more sets thereof, such as pins and apertures, at spaced apart locations to prevent movement as described above), and/or may be provided at different locations (e.g., at upper, lower, or inner sides thereof). Furthermore, the display mechanical coupling feature 11.4.1-1312 may be provided by a different part of the head-mounted display unit 11.4.1-110, such as to the housing 11.4.1-112 (e.g., a curtain or other structure surrounding the display module 11.4.1-1310). Further, instead of the magnetic coupling features 11.4.1-1324, 11.4.1-1314, the removable lens assembly 11.4.1-1320 and the display module 11.4.1-1310 may instead or additionally include mechanical coupling features (e.g., interfitting structures or latches as described above).

It should be noted that, for each of the manners for coupling described above with respect to FIGS. 11.4.1-3A-3B and 11.4.1-10A-11.4.1-13F, the lens mount may be coupled to another portion of the head-mounted display unit 11.4.1-110, such as the housing 11.4.1-112 (e.g., chassis), as opposed to the display module 11.4.1-116 or variations thereof.

Referring to FIGS. 11.4.1-14A-11.4.1-16, the display system 11.4.1-100 and the removable lens assemblies 11.4.1-120 are cooperatively configured for the display system 11.4.1-100 to detect the removable lens assembly 11.4.1-120 coupled to the head-mounted display unit 11.4.1-110. For example, the head-mounted display unit 11.4.1-110 includes one or more lens detection sensors 11.4.1-1418*a* for detecting the one or more removable lens assemblies 11.4.1-120 coupled thereto. In detecting the removable lens assembly 11.4.1-120, the display system 11.4.1-100 may determine whether or not any of the removable lens assemblies 11.4.1-120 is coupled to the display module 11.4.1-116 (e.g., using a proximity sensor, image recognition, and/or mechanical switch), whether the removable lens assembly 11.4.1-120 is properly coupled (e.g., using a proximity sensor, image recognition, or hall sensors with magnets coupled to the removable lens assembly 120), and/or other information about the removable lens assembly 11.4.1-120 (e.g., corrective or not, serial or model number, associated user, and/or lens characteristics using other types of lens detection sensors 11.4.1-1418*a* discussed below) to support other functionality. The display system 11.4.1-100 may provide an indication of whether or not the removable lens assembly 11.4.1-120 is coupled to the display module 11.4.1-116, whether the removable lens assembly 11.4.1-120 is properly position relative to the display module 11.4.1-116, and/or other indications (e.g., of the lens configuration and/or lens compatibility as discussed below).

Each removable lens assembly 11.4.1-120 may further include a lens tag 11.4.1-1428 that is in communication with or otherwise readable by the one or more lens detection sensors 11.4.1-1418*a*. According to detection of the removable lens assembly 11.4.1-120, the display system 11.4.1-100 may perform one or more subsequent operations, which may include changing output of the display module 11.4.1-116, providing an indicator of the removable lens assembly 11.4.1-120, and/or providing an indicator of compatibility of the removable lens assembly 11.4.1-120 with a user. The display system also includes a controller 11.4.1-1450 that controls operation of the head-mounted display unit 11.4.1-110, for example, to detect the removable lens assemblies 11.4.1-120 coupled thereto and/or perform subsequent operations in response thereto. The controller 11.4.1-1450 may be wholly or partially physically incorporated into the head-mounted display unit 11.4.1-110 (as indicated by dash-lines) or may be wholly or partially provided physically separate therefrom (e.g., in an external computing device). An example hardware configuration for the controller 11.4.1-1450 is discussed below with reference to FIG. 11.4.1-14.

In detecting the removable lens assembly 11.4.1-120, the display system 11.4.1-100 may identify or determine information about the removable lens assembly 11.4.1-120, which may be referred to as lens information. The lens information may include an identifier and/or technical characteristics of the removable lens assembly 11.4.1-120. The identifier may be of the removable lens assembly 11.4.1-120 itself (e.g., a serial number or a model number; referred to as a lens identifier), a user associated with the lens (e.g., a user name or user ID; referred to as an associated user identifier), and/or other identifying information (e.g., manufacturer, date; referred to as manufacturing information). The technical characteristics may include refractive characteristics, such as sphere, cylinder, and/or axis parameters and/or an optical axis location of the removable lens assembly 11.4.1-120, which may be referred to as lens characteristics, lens characteristic information, or prescription information. The lens information determined by the display system 11.4.1-100 may then be used by the display system 11.4.1-100 to perform the subsequent operations referenced above and described in further detail below.

The display system 11.4.1-100 may determine the lens information of the removable lens assembly 11.4.1-120 actively coupled (e.g., being coupled or currently coupled) to the head-mounted display unit 11.4.1-110 in various different manners and with different devices. The display system 11.4.1-100 may determine the lens information from the removable lens assembly 11.4.1-120, such as with the lens detection sensor **11.4.1-1418*a* from the lens tag 11.4.1-1428. In a first example, the lens tag 11.4.1-1428 is an electronic device that stores or otherwise electrically provides the lens information. For example, the lens tag 11.4.1-1428 each removable lens assembly 11.4.1-120 may be an electrically-erasable programmable read-only memory device (EEPROM), a radio frequency identification device (RFID), or an internal resistance device (e.g., an electrical resistance or resistor). The lens detection sensor 11.4.1-1418*a* is a corresponding electrical device or system configured to receive and/or otherwise receive the lens information from the lens tag 11.4.1-1428**, such as by being in wireless or physical communication with the EEPROM, to read a signal of the RFID, and/or to measure or otherwise determine a resistance signature of the resistance device.

In a second example, the lens tag 11.4.1-1428 has a magnetic signature. The removable lens assembly 11.4.1-120 includes various magnets (e.g., the magnetic coupling features 11.4.1-322) or other magnets, which may provide a magnetic signature by having varied strength and/or position and which are detected by the lens detection sensor **11.4.1-1418*a*, which may include one or more hall sensors or other magnetic sensors that sense the magnetic field of the magnets. The combination of magnetic fields detected by the lens detection sensor 11.4.1-1418*a* provide the lens information (e.g., a lens identifier of a particular magnetic signature). Hall sensors may instead or additionally be used to determine whether the removable lens assembly 11.4.1-120 is properly coupled to the In a third example, the lens tag 11.4.1-1428 is an optical marking that displays or otherwise communicates the lens information. For example, the lens tag 11.4.1-1428 may be an optical or infrared (IR) marking on the removable lens assembly 11.4.1-120, such as a quick response code (QR Code), a bar code, or alphanumeric characters. The lens detection sensor 11.4.1-1418*a* of the head-mounted display unit 11.4.1-110 is a corresponding optical reading device, such as a camera or a combined illuminator/sensor device (e.g., a QR Code scanner), which may be the eye camera 11.4.1-319 that also observes the eye as described previously. In one particular example, the lens tag 11.4.1-1428** is an infrared bar code.

The display system 11.4.1-100 may determine the lens information required for one or more further operations directly from the removable lens assembly 11.4.1-120 itself. Instead or additionally, the display system 11.4.1-100 may determine additional lens information from other sources for performing subsequent operations. For example, the display system 11.4.1-100 may receive only initial lens information (e.g., the lens identifier or the associated user identifier) from the removable lens assembly 11.4.1-120, while other lens information (e.g., the associated user identifier and/or lens characteristics) are stored in association therewith by the display system 11.4.1-100 (e.g., by a storage of the controller 11.4.1-1450). Thus, by determining initial lens information from the removable lens assembly 11.4.1-120, the display system 11.4.1-100 may determine (e.g., retrieve) other lens information to support subsequent operations.

The lens information of the removable lens assembly 11.4.1-120 coupled to the display module 11.4.1-116 may be used to control various functionality of the display system 11.4.1-100, which may include operating the display **11.4.1-316*a*, providing an indication to the user of the removable lens assemblies 11.4.1-120 coupled thereto, and/or determining compatibility of the removable lens assemblies 11.4.1-120 with the user. Operation of the display 11.4.1-316*a* may be performed according to the lens information of the removable lens assembly 11.4.1-120 coupled to the display module 11.4.1-116, such that operation of the display 11.4.1-316*a* may differ between one of the removable lens assemblies 11.4.1-120 having one set of lens characteristics and another of the removable lens assemblies 11.4.1-120 having another set of lens characteristics (e.g., different brightness and/or pixel output to account for different characteristics of the optical system formed by the primary lens 11.4.1-316*b* and the lens elements 11.4.1-330** or different lens characteristics).

Instead or additionally, the lens information of the removable lens assembly 11.4.1-120 coupled to the display module 11.4.1-116 may be used to provide an indication to the user or potential users of the removable lens assembly 11.4.1-120 coupled thereto, which may be referred to as a lens configuration indication. The lens configuration indication differs for different ones of the removable lens assemblies 11.4.1-120, for example, those removable lens assemblies 11.4.1-120 associated with different users. A first lens configuration indication is provided for one of the removable lens assemblies 11.4.1-120 (or one pair of the removable lens assemblies 11.4.1-120 associated with each other), while a second, different lens configuration indication is provided another of the removable lens assemblies 11.4.1-120 (or another pair of the removable lens assemblies 11.4.1-120 associated with each other). The display indication (e.g., or output instruction) may be stored in association with the lens information (e.g., the lens identifier, associated user identifier, or lens characteristics), for example, by the display system 11.4.1-100 and retrieved upon determining the lens identifier. The configuration indication may be provided irrespective of the user (e.g., without detecting or identifying the user).

The lens configuration indication may be provided as, for example, an external light indicator, a display indicator, or an audible indictor. The external light indicator is provided with an external visual indicator 11.4.1-1418*b* (e.g., a light-emitting diode) of the head-mounted display unit 11.4.1-110, which is visible by potential users prior to wearing the head-mounted display unit 11.4.1-110 and may differ, for example, by color (e.g., red vs. blue to differentiate between first and second users). The display indicator is provided by the display 11.4.1-316*a* and is viewable by the user or potential users through the removable lens assembly 11.4.1-120. The display indicator may for example, be a color, symbol, or set of characters that differs for different users and is identifiable even for potential users having low acuity with the removable lens assembly 11.4.1-120 (e.g., for which the display 11.4.1-316*a* may appear blurry). The audible indicator is provided by an audio output device 11.4.1-1418*c* of or associated with the head-mounted display unit 11.4.1-110 (e.g., a speaker or headphones) and may be audible to potential users prior to or after wearing the head-mounted display unit 11.4.1-110. The audible indicator may, for example, be spoken words (e.g., identifying the user associated with the removable lens assembly 11.4.1-120) or tones that for different users associated with the removable lens assemblies 11.4.1-120.

Referring to FIGS. 11.4.1-14A and 11.4.1-14B, a method 11.4.1-1400 is provided for indicating a lens configuration, which generally includes a first operation 11.4.1-1410 of identifying a removable lens assembly 11.4.1-120 coupled to a display module 11.4.1-116, a second operation 11.4.1-1420 of retrieving a configuration indicator instruction, and a third operation 11.4.1-1430 of providing a configuration indication according to the instruction. The first operation 11.4.1-1410 of identifying the interchangeable lens assembly is performed with the lens detection sensor 11.4.1-1418*a* and the controller 11.4.1-1450 determining lens information from the lens tag 11.4.1-1428 of the one or more removable lens assembly 11.4.1-120 coupled to the one or more display modules 11.4.1-116 of the head-mounted display unit 11.4.1-110. The second operation 11.4.1-1420 of retrieving a configuration indication instruction is performed, for example, by the controller 11.4.1-1450 retrieving from a storage the instruction associated with the lens information. The third operation 11.4.1-1430 of providing the configuration indication is provided, for example, by the display module 11.4.1-116, the external visual indicator 11.4.1-1418*b*, and/or the audio output device 11.4.1-1418*c*, as operated by the controller 11.4.1-1450.

Referring to FIGS. 11.4.1-14A-11.4.1-16, instead or additionally, the display system 11.4.1-100 may use the lens information of the removable lens assembly 11.4.1-120 coupled thereto to determine compatibility with the user and accordingly provide a compatibility indicator to the user (e.g., only of incompatibility is determined). The display system 11.4.1-100, in addition to determining the lens information of the removable lens assembly 11.4.1-120 coupled to the head-mounted display unit 11.4.1-110, identifies the current user, and compares user information with the lens information to determine compatibility.

The display system 11.4.1-100 may identify the user in various manners, for example, with biometric sensing, receipt of user credentials, and/or authentication by another device. To identify the user via biometrics, the display system 11.4.1-100 may include a biometric sensor 11.4.1-1418*d* to identify the user with biometrics (e.g., facial recognition, fingerprint recognition, voice recognition, iris recognition, and/or recognition of other biometric parameters, such as ear geometry, bone conduction or density characteristics, forehead features, or skin). The biometric sensor 11.4.1-1418*d* is, for example, coupled physically coupled to the head-mounted display unit. For example, in the case of identifying the user with iris detection, the biometric sensor 11.4.1-1418*d* may be the eye camera 11.4.1-319 described previously and which may be the same sensor for identifying the removable lens assembly 11.4.1-120. To identify the user via user credentials, the display system 11.4.1-100 receives user credentials (e.g., a username and password) from an input device of or associated with the display system 11.4.1-100 (e.g., a microphone of the head-mounted display unit, or an external device 11.4.1-1460 in communication with the controller 11.4.1-1450 or the head-mounted display unit 11.4.1-110). To identify the user by authentication from another device, the external device 11.4.1-1460 may authenticate the user (e.g., via biometrics or credentials) and communicate such authentication to the controller 11.4.1-1450. The external device 11.4.1-1460 may be considered part of the display system 11.4.1-100 but may function independent thereof (e.g., a smartphone).

The display system 11.4.1-100 stores or otherwise receives user information. The user information may include a user identifier (e.g., a username or user number) stored in association with an associated lens identifier (e.g., a serial number or model number of one or more of the removable lens assemblies 11.4.1-120 associated with the user) and/or eye characteristic information (e.g., sphere, cylinder, and/or axis parameters; referred to herein as eye characteristics).

The display system 11.4.1-100 may receive the user information during an initializing process in which the user information is associated with the lens information. During the initializing process, the user information may be input by the user or received from another source (e.g., the external device 11.4.1-1460). The lens information may be obtained from the removable lens assemblies 11.4.1-120 when coupled to the display module 11.4.1-116 as described above (e.g., electronically and/or optically), or be input by the user (e.g., inputting the serial or model number of the removable lens assembly 11.4.1-120) or received from another source (e.g., the external device 11.4.1-1460).

Referring to FIG. 11.4.1-15, to determine compatibility, the display system 11.4.1-100 compares the lens information 11.4.1-1510 to the user information 11.4.1-1520, for example, using a compatibility determiner 11.4.1-1500. For example, or more of: (a) the lens information 11.4.1-1510 of the lens identifier 11.4.1-1512 is compared to the user information 11.4.1-1520 of the associated lens identifier 11.4.1-1522, (b) the lens information 11.4.1-1510 of the associated user identifier 11.4.1-1514 is compared to the user information 11.4.1-1520 of the user identifier 11.4.1-1524), or (c) the lens information 11.4.1-1510 of the lens characteristics 11.4.1-1516 is compared to the user information 11.4.1-1520 of the eye characteristics 11.4.1-1526. The display system 11.4.1-100 determines the one or more removable lens assemblies 11.4.1-120 to be compatible if the lens information matches (e.g., equals) the user information, or incompatible if not matching.

If determined compatible, the compatibility indication may provide a positive indication (e.g., that the removable lens assembly 11.4.1-120 is compatible with the user) or be omitted (e.g., proceeding to normal operation). If determined incompatible, the compatibility indication is negative (e.g., indicating that the removable lens assembly 11.4.1-120 is not compatibility with the user). Such a negative indication may, for example, include an icon that graphically indicates incompatibility, textual instructions or information, and/or audible instructions or information.

Referring to FIG. 11.4.1-16, a method 11.4.1-1600 is provided for operating the display system 11.4.1-100 to determine and indicate compatibility of the removable lens assembly 11.4.1-120 with the user. The method includes a first operation 11.4.1-1610 of identifying the one or more removable lens assemblies 11.4.1-120 coupled to the one or more display modules 11.4.1-116, a second operation 11.4.1-1620 of identifying the user, a third operation 11.4.1-1630 of comparing the lens information to the user information, and a fourth operation 11.4.1-1640 of indicating compatibility. The first operation 11.4.1-1610 of identifying the one or more removable lens assemblies 11.4.1-120 may be performed by the one or more lens detection sensors **11.4.1-1418*a* in cooperation with the controller 11.4.1-1450. The first operation 11.4.1-1610 may also include determining lens information. The second operation 11.4.1-1620 of identifying the user may be performed biometrically (e.g., cooperatively by the biometric sensor 11.4.1-1418*d* in cooperation with controller 11.4.1-1450), by receiving credentials from the user, and/or by user authentication with the external device 11.4.1-1460. The second operation 11.4.1-1620 may also include determining user information. The third operation 11.4.1-1630 of determining lens compatibility is performed by comparing the lens information to the user information, for example, with the controller 11.4.1-1450 according to the compatibility determiner 11.4.1-1500. The fourth operation 11.4.1-1640 of indicating compatibility is performed, for example, with the head-mounted display unit 11.4.1-110 as operated by the controller 11.4.1-1450. If compatible, a positive indication is provided, which may be usual operation of the display system 11.4.1-100. If incompatible, a negative indication is provided reflecting incompatibility (e.g., by the head-mounted display unit 11.4.1-110 as operated by the controller 11.4.1-1450**).

Referring to FIG. 11.4.1-17, an example hardware configuration of the controller 11.4.1-1450 is shown. The controller 11.4.1-1450 is a computing device, which may generally include a processing device 11.4.1-1710 (e.g., a processor or CPU), a memory 11.4.1-1720 (e.g., a volatile short-term memory, such as a random-access memory module), a storage 11.4.1-1730 (e.g., a long-term storage device, such as a hard disk or solid state drive), a communications interface 11.4.1-1740 by which the controller sends and/or receives signals to and/or from other components (e.g., the display module 11.4.1-116 and various sensors), and a bus 11.4.1-1750 by which the other components of the controller 11.4.1-1450 communicate with each other. The controller 11.4.1-1450 may be physically connected to the head-mounted display unit 11.4.1-110 or otherwise be in communication therewith. The display system 11.4.1-100 may include additional controllers 11.4.1-1450 or components thereof. The controller 11.4.1-1450 may include software programming (e.g., stored by the storage 11.4.1-1730) that includes instructions executable by the processing device 11.4.1-1710 to perform the methods and operations described herein.

11.4.2: Electronic Device System with Supplemental Lenses

Some users of head-mounted devices have visual defects such as myopia, hyperopia, astigmatism, or presbyopia. It can be challenging to ensure that an optical system in a head-mounted device operates satisfactorily for these users. If care is not taken, it may be difficult or impossible for a user with visual defects to focus properly on content that is being displayed.

A head-mounted device may have a display that displays content for a user. Head-mounted support structures in the device may support the device on the head of the user. A non-removable lens system may be supported by the head-mounted support structures and may be used to present content on the display to eye boxes. The user may view the content when the user's eyes are located in the eye boxes.

The head-mounted support structures may be configured to receive a removable supplemental lens system in alignment with the non-removable lens system. Magnetic coupling structures or other engagement structures may be used to removably couple the supplemental lens system to the head-mounted device.

The removable supplemental lens system may be used to adjust the lens characteristics of the non-removable lens system and thereby customize the head-mounted display to accommodate the user's vision. For example, the removable supplemental lens system may include supplemental left and right lenses that align with and supplemental corresponding left and right lenses in the non-removable lens system and that include astigmatic lens characteristics and other characteristics that allow the head-mounted device to be used by a user with astigmatism or other visual defects.

Removable supplemental lens systems associated with different users may be configured to operate with a shared head-mounted device. To ensure that the head-mounted device can customize its operation for each user, the removable supplemental lens system of each user may be provided with information that identifies the user associated with that removable supplemental lens system and other stored information. This information be stored in the removable supplemental lens system using bar codes or other optically readable patterns, programmable memory, or other data storage. A memory reader, gaze tracking system, or other sensor may be used in retrieving the stored information.

The information that is stored in the removable supplemental lens system may include information on the optical characteristics of the removable supplemental lens system, user information such as the user's eyeglass prescription, and/or other information. When the removable supplemental lens system is installed in the head-mounted device, control circuitry in the head-mounted device may retrieve the stored information and may take appropriate action. For example, the control circuitry may use lens positioners to adjust lens spacing and other operating parameters of the lens systems based on the user's interpupillary distance and other information on the user.

A head-mounted device may contain a display formed from one or more display panels (displays) for displaying visual content to a user. A lens system may be used to allow the user to focus on the display and view the visual content. To ensure that a wide range of users are able to clearly focus on the display and view visual content, the head-mounted device may receive removable supplemental lenses. The supplemental lenses may address the visual defects of users that are not otherwise addressed by the lens system. For example, a user with astigmatism may have supplemental lenses that correct for astigmatism. When this user desires to view content with the head-mounted device, the supplemental lenses may be installed within the head-mounted device to help correct for the user's astigmatism. With one illustrative arrangement, the supplemental lenses may be coupled to the head-mounted support structures using magnets or other removable fasteners that attach the supplemental lenses to non-removable lenses in the device.

If desired, removable supplemental lenses may be provided with the ability to store information that is subsequently retrieved and used by the head-mounted device. This information, which may sometimes be referred to as supplemental lens information or stored information may include lens power information and other information that is specific to the supplemental lenses and/or user information for a user associated with the lenses (e.g., a username, eyeglasses prescription information, etc.). Storage circuitry such as programmable read-only memory may be used to store the supplemental lens information and/or the supplemental lens information may be stored in other ways (e.g., using bar codes, text on the supplemental lenses, other patterned optically readable information, etc.). During operation, after a user has installed the supplemental lenses in a head-mounted device, the head-mounted device may retrieve and use the supplemental lens information. For example, information on the optical characteristics of the lens may be used by the head-mounted device to help correct for optical aberrations in the lenses (e.g., spherical aberration, chromatic aberration, pincushion distortion, barrel distortion, etc.), information on the user may be used to adjust the interpupillary distance of lenses or may be used to present the user with a login screen that has been prepopulated with the user's username, etc.

A schematic diagram of an illustrative system that may use supplemental head-mounted display lenses is shown in FIG. 11.4.2-1. As shown in FIG. 11.4.2-1, system 11.4.2-8 may include one or more electronic devices such as electronic device 11.4.2-10. The electronic devices of system 11.4.2-8 may include computers, cellular telephones, head-mounted devices, wristwatch devices, and other electronic devices. Configurations in which electronic device 11.4.2-10 is a head-mounted device are sometimes described herein as an example.

As shown in FIG. 11.4.2-1, electronic devices such as electronic device 11.4.2-10 may have control circuitry 11.4.2-12. Control circuitry 11.4.2-12 may include storage and processing circuitry for controlling the operation of device 11.4.2-10. Circuitry 11.4.2-12 may include storage such as hard disk drive storage, nonvolatile memory (e.g., electrically-programmable-read-only memory configured to form a solid-state drive), volatile memory (e.g., static or dynamic random-access-memory), etc. Processing circuitry in control circuitry 11.4.2-12 may be based on one or more microprocessors, microcontrollers, digital signal processors, baseband processors, power management units, audio chips, graphics processing units, application specific integrated circuits, and other integrated circuits. Software code may be stored on storage in circuitry 11.4.2-12 and run on processing circuitry in circuitry 11.4.2-12 to implement control operations for device 11.4.2-10 (e.g., data gathering operations, operations involved in processing three-dimensional facial image data, operations involving the adjustment of components using control signals, etc.). Control circuitry 11.4.2-12 may include wired and wireless communications circuitry. For example, control circuitry 11.4.2-12 may include radio-frequency transceiver circuitry such as cellular telephone transceiver circuitry, wireless local area network (WiFi®) transceiver circuitry, millimeter wave transceiver circuitry, and/or other wireless communications circuitry.

During operation, the communications circuitry of the devices in system 11.4.2-8 (e.g., the communications circuitry of control circuitry 11.4.2-12 of device 11.4.2-10), may be used to support communication between the electronic devices. For example, one electronic device may transmit video and/or audio data to another electronic device in system 11.4.2-8. Electronic devices in system 11.4.2-8 may use wired and/or wireless communications circuitry to communicate through one or more communications networks (e.g., the internet, local area networks, etc.). The communications circuitry may be used to allow data to be received by device 11.4.2-10 from external equipment (e.g., a tethered computer, a portable device such as a handheld device or laptop computer, online computing equipment such as a remote server or other remote computing equipment, or other electrical equipment) and/or to provide data to external equipment.

Device 11.4.2-10 may include input-output devices 11.4.2-22. Input-output devices 11.4.2-22 may be used to allow a user to provide device 11.4.2-10 with user input. Input-output devices 11.4.2-22 may also be used to gather information on the environment in which device 11.4.2-10 is operating. Output components in devices 11.4.2-22 may allow device 11.4.2-10 to provide a user with output and may be used to communicate with external electrical equipment.

As shown in FIG. 11.4.2-1, input-output devices 11.4.2-22 may include one or more displays such as display(s) 11.4.2-14. In some configurations, display 11.4.2-14 of device 11.4.2-10 includes left and right display panels in alignment with the user's left and right eyes, respectively. In other configurations, display 11.4.2-14 includes a single display panel that extends across both eyes.

Display 11.4.2-14 may be used to display images. The visual content that is displayed on display 11.4.2-14 may be viewed by a user of device 11.4.2-10. Displays in device 11.4.2-10 such as display 11.4.2-14 may be organic light-emitting diode displays or other displays based on arrays of light-emitting diodes, liquid crystal displays, liquid-crystal-on-silicon displays, projectors or displays based on projecting light beams on a surface directly or indirectly through specialized optics (e.g., digital micromirror devices), electrophoretic displays, plasma displays, electrowetting displays, or any other suitable displays.

Display 11.4.2-14 may present computer-generated content such as virtual reality content and mixed reality content to a user. Virtual reality content may be displayed in the absence of real-world content. Mixed reality content, which may sometimes be referred to as augmented reality content, may include computer-generated images that are overlaid on real-world images. The real-world images may be captured by a camera (e.g., a forward-facing camera) and merged with overlaid computer-generated content or an optical coupling system may be used to allow computer-generated content to be overlaid on top of real-world images. As an example, a pair of mixed reality glasses or other augmented reality head-mounted display may include a display device that provides images to a user through a beam splitter, prism, holographic coupler, or other optical coupler. Configurations in which display 11.4.2-14 is used to display virtual reality content to a user through lenses are described herein as an example.

Input-output circuitry 11.4.2-22 may include sensors 11.4.2-16. Sensors 11.4.2-16 may include, for example, three-dimensional sensors (e.g., three-dimensional image sensors such as structured light sensors that emit beams of light and that use two-dimensional digital image sensors to gather image data for three-dimensional images from light spots that are produced when a target is illuminated by the beams of light, binocular three-dimensional image sensors that gather three-dimensional images using two or more cameras in a binocular imaging arrangement, three-dimensional LIDAR (light detection and ranging) sensors, three-dimensional radio-frequency sensors, or other sensors that gather three-dimensional image data), cameras (e.g., infrared and/or visible digital image sensors), gaze tracking sensors (e.g., a gaze tracking system based on an image sensor and, if desired, a light source that emits one or more beams of light that are tracked using the image sensor after reflecting from a user's eyes), touch sensors, buttons, capacitive proximity sensors, light-based (optical) proximity sensors, other proximity sensors, force sensors, sensors such as contact sensors based on switches, gas sensors, pressure sensors, moisture sensors, magnetic sensors, audio sensors (microphones), ambient light sensors, microphones for gathering voice commands and other audio input, sensors that are configured to gather information on motion, position, and/or orientation (e.g., accelerometers, gyroscopes, compasses, and/or inertial measurement units that include all of these sensors or a subset of one or two of these sensors), and/or other sensors.

User input and other information may be gathered using sensors and other input devices in input-output devices 11.4.2-22. If desired, input-output devices 11.4.2-22 may include other devices 11.4.2-24 such as haptic output devices (e.g., vibrating components), light-emitting diodes and other light sources, speakers such as ear speakers for producing audio output, and other electrical components. Device 11.4.2-10 may include circuits for receiving wireless power, circuits for transmitting power wirelessly to other devices, batteries and other energy storage devices (e.g., capacitors), joysticks, buttons, and/or other components.

Electronic device 11.4.2-10 may have housing structures (e.g., housing walls, straps, etc.), as shown by illustrative support structures 11.4.2-26 of FIG. 11.4.2-1. In configurations in which electronic device 11.4.2-10 is a head-mounted device (e.g., a pair of glasses, goggles, a helmet, a hat, etc.), support structures 11.4.2-26 may include head-mounted support structures (e.g., a helmet housing, head straps, temples in a pair of eyeglasses, goggle housing structures, and/or other head-mounted structures). The head-mounted support structures may be configured to be worn on a head of a user during operation of device 11.4.2-10 and may support display(s) 11.4.2-14, sensors 11.4.2-16, other components 11.4.2-24, other input-output devices 11.4.2-22, and control circuitry 11.4.2-12.

FIG. 11.4.2-2 is a top view of electronic device 11.4.2-10 in an illustrative configuration in which electronic device 11.4.2-10 is a head-mounted device. As shown in FIG. 11.4.2-2, electronic device 11.4.2-10 may include support structures (see, e.g., support structures 11.4.2-26 of FIG. 11.4.2-1) that are used in housing the components of device 11.4.2-10 and mounting device 11.4.2-10 onto a user's head. These support structures may include, for example, structures that form housing walls and other structures for main unit 11.4.2-26-2 and straps or other supplemental support structures such as structures 11.4.2-26-1 that help to hold main unit 11.4.2-26-2 on a user's face so that the user's eyes are located within eye boxes 11.4.2-60.

Display 11.4.2-14 may include left and right display panels (e.g., left and right pixel arrays, sometimes referred to as left and right displays) that are mounted respectively in left and right display modules 11.4.2-70 corresponding respectively to a user's left eye (and left eye box 11.4.2-60) and right eye (and right eye box). Modules 11.4.2-70, which may sometimes be referred to as lens support structures or lens housings, may be individually positioned relative to the housing wall structures of main unit 11.4.2-26-2 and relative to the user's eyes using respective left and right positioners 11.4.2-58 (e.g., stepper motors, piezoelectric actuators, motors, linear electromagnetic actuators, and/or other electronic components for adjusting position). Positioners 11.4.2-58 may be controlled by control circuitry 11.4.2-12 during operation of device 11.4.2-10. For example, positioners 11.4.2-58 may be used to adjust the spacing between modules 11.4.2-70 (and therefore the lens-to-lens spacing between the lenses of modules 11.4.2-70) to match the interpupillary distance IPD of a user's eyes.

Device 11.4.2-10 may include a non-removable lens system (sometimes referred to as a permanent lens system or fixed lens system) to which the user of device 11.4.2-10 may attach removable supplemental lenses to accommodate the user's vision (astigmatism, etc.). When the removable supplemental lenses are absent, a user may use the non-removable lens system. Users with particular visual defects (e.g., astigmatism), may benefit from the attachment of the removable supplemental lenses to the non-removable lenses. When the supplemental lenses are coupled to device 11.4.2-10 in alignment with the non-removable lenses, the supplemental lenses and non-removable lenses operate together to form a combined lens system with combined optical properties determined by both the non-removable lenses and the supplemental lenses.

As shown in FIG. 11.4.2-2, for example, each lens module 11.4.2-70 may include a non-removable lens 11.4.2-72. Lenses 11.4.2-72 may be Fresnel lenses, single-element or multiple-element lenses formed from clear materials such as glass or plastic, mirror lenses, catadioptric lenses, and/or lenses of other types. The position of lenses 11.4.2-72 along the X axis may be adjusted so that lenses 11.4.2-72 are separated by a distance that matches the user's interpupillary distance (distance IPD). The position of lenses 11.4.2-72 along the Z axis may be adjusted to help a user focus on display 11.4.2-14.

The amount of travel available to lenses 11.4.2-72 may be limited and/or lenses 11.4.2-72 may have attributes that make it difficult for lenses 11.4.2-72 alone to be used to view content on display 11.4.2-14 by all users. For example, a user may have astigmatism or may be strongly nearsighted or farsighted. In situations such as these, lenses 11.4.2-72 when used alone may not be able to correct for the user's vision. To ensure that the user's vision is fully corrected, supplemental lenses 11.4.2-76 may be coupled to lenses 11.4.2-72 to provide further adjustments. For example, if a user is astigmatic, supplemental lenses 11.4.2-76 may be configured to compensate for the astigmatism of the user. If there are multiple users associated with device 11.4.2-10, each of the multiple users may potentially have a different respective set of supplemental lenses 11.4.2-76. Lenses 11.4.2-76 may be joined together to form a supplemental lens system based on a single supplemental lens module or may be housed in separate lens modules that form a multi-lens-module supplemental lens system.

As shown in FIG. 11.4.2-2, for example, supplemental lenses 11.4.2-76 may be mounted in supplemental lens modules (sometimes referred to as supplemental lens support structures or housings) such as supplemental lens modules 11.4.2-74. Lens modules 11.4.2-74 may be removably coupled to support structures 11.4.2-26 by using coupling structures 11.4.2-78 in non-removable lens modules 11.4.2-70 and corresponding coupling structures that mate with coupling structures 11.4.2-78 such as coupling structures 11.4.2-80 in removable lens modules 11.4.2-74 to couple lens modules 11.4.2-74 to lens modules 11.4.2-70. Coupling structures 11.4.2-78 and 11.4.2-80 may be formed from magnetic couplers (e.g., magnets and/or magnetic structures such as iron bars), clips, hook-and-loop fasteners, snaps, screws and other threaded fasteners, temporary adhesive, spring-loaded engagement structures, and/or other coupling mechanisms.

Device 11.4.2-10 may include a gaze detection system that is configured to monitor a user's eyes in eye boxes 11.4.2-60. The gaze detection system may, as an example, use optical eye monitoring components to monitor the user's direction of gaze as the user is using device 11.4.2-10. With one illustrative configuration, a gaze tracker such a gaze tracker 11.4.2-86 may be located in each lens module 11.4.2-70. In this position, the gaze tracker 11.4.2-86 in each lens module 11.4.2-70 may monitor a user's eye in a respective eye box 11.4.2-60 through a respective lens 11.4.2-72 and a respective mating supplemental lens 11.4.2-76. Gaze trackers 11.4.2-86 may be placed at peripheral portions of lens modules 11.4.2-70 so that gaze trackers 11.4.2-86 do not block the user's view of display 11.4.2-14 through removable lenses 11.4.2-76 and non-removable lenses 11.4.2-72.

If desired, the removable lens system of FIG. 11.4.2-2 (e.g., one or both of lens modules 11.4.2-74 and/or a single removable lens holder that is configured to support both of removable lenses 11.4.2-76) may be provided with electronic storage such as storage 11.4.2-84. Storage 11.4.2-84 may be programmable read-only memory (e.g., electrically programmable read-only memory, memory formed from laser-programmed fuses, and/or other programmable memory), may be formed from a pattern of metal traces and/or resistive elements (e.g., to encode information in the form of a pattern of conductive paths, a pattern of resistors and/or their associated resistance values, and/or other circuitry that is configured to serve as storage that stores data in the removable lenses for electrical retrieval by device 11.4.2-10). Storage 11.4.2-84, which may be formed as part of the removable lens system (e.g., as part of one or more of modules 11.4.2-74 and associated removable lenses 11.4.2-76), may be used in storing lens information, user information, and/or other information electrically. When the removable lens system is coupled to the non-removable lens system (e.g., one or both lens modules 11.4.2-70 such as storage 11.4.2-84), electrically stored information reader 11.4.2-82 may retrieve the data stored in storage 11.4.2-84. Information reader 11.4.2-82 may be, for example, an electrically programmed read-only memory reader, a memory reader that reads laser-programmed storage or other programmable memory, circuitry that electrically measures storage 11.4.2-84 (e.g., to detect a pattern of conductive traces and/or resistive elements that are being used to store data), and/or other reader circuitry.

Information such as lens information, user information, and other information may also be stored using non-electrical storage. This storage may include, for example, bar codes, text, patterns of dots, and/or other information that can be detected optically. Optical data reading operations may be performed using infrared and/or visible cameras or other equipment (e.g., bar code scanning equipment) that reads optically encoded information. As an example, optical data reading equipment that reads data on the removable lens by imaging the removable lens such as infrared digital image sensors in gaze tracking sensors 11.4.2-86 and/or visible-light digital image sensors may be used in reading bar codes, text, and/or other optically encoded information.

Gaze trackers 11.4.2-86 (sometimes referred to as gaze monitoring systems, gaze tracking systems, eye monitoring systems, etc.) may monitor the eyes of the user in eye boxes 11.4.2-60 during operation of device 11.4.2-10. Gaze trackers 11.4.2-86 may include light sources and light-detecting components such as image sensors. Each gaze tracker 11.4.2-86 may, as an example, include a light source such as a light-emitting diode light source or laser light source that produces an array of light beams (e.g., infrared light beams that do not interfere with the vision of the user). Blanket (flood) illumination at infrared and/or visible wavelengths may also be provided. Each gaze tracker 11.4.2-86 may also include a respective infrared image sensor (and/or visible-light image sensor) that faces a user's eye in a respective eye box 11.4.2-60 and capture images of the user's eye through lenses 11.4.2-72 and lenses 11.4.2-76 while the user's eye is being illuminated with the light beams from the light source of that gaze tracker. During normal operation, control circuitry 11.4.2-20 may use gaze trackers 11.4.2-86 to track a user's gaze (e.g., so that images being displayed on displays 11.4.2-14 can be adjusted based on the direction of the user's gaze, etc.). When it is desired to read information in the removable lens system that has been optically stored (e.g., by encoding the information in the form of a bar code, text, etc.), one or more image sensors such as one or more infrared image sensors in one or more gaze trackers 11.4.2-86 may optically read the information from the supplemental lens system (e.g., from one or more lens modules 11.4.2-74).

FIG. 11.4.2-3 is a front view of an illustrative removable lens module showing arrangements that may be used to store information in the lens module. As shown in FIG. 11.4.2-3, lens module 11.4.2-74 may include lens support structures 11.4.2-74H. Support structures 11.4.2-74H may be formed from polymer, metal, and/or other materials and may surround or otherwise support lens 11.4.2-76 to form lens module 11.4.2-74. Coupling structures 11.4.2-80 may be supported by support structures 11.4.2-74H, so that coupling structures 11.4.2-80 hold lens module 11.4.2-74 to lens module 11.4.2-70 and support structures 11.4.2-26 when coupling structures 11.4.2-80 are coupled to mating coupling structures 11.4.2-78 in lens module 11.4.2-70.

Lens information, user information, and other information can be stored in removable lens module 11.4.2-74 using one or more approaches. With one illustrative arrangement, electrical storage 11.4.2-84 is included in lens module 11.4.2-74. Data may be stored in electrical storage 11.4.2-84. When removable lens module 11.4.2-74 is coupled to non-removable lens module 11.4.2-70, reader 11.4.2-82 may couple to electrical storage 11.4.2-84 and may retrieve the stored data from electrical storage 11.4.2-84.

With another illustrative arrangement, a bar code such as bar code 11.4.2-92 may be included in lens module 11.4.2-74. Bar code 11.4.2-92 may, as an example, be an infrared bar code that is formed from an ink that is visibly transparent while being opaque to infrared light (e.g., infrared light at the wavelength emitted by an infrared light source in gaze tracker 11.4.2-86) or other bar code structure that is transparent to visible light and opaque at infrared wavelengths. With this type of arrangement, bar code 11.4.2-92 will be transparent to the user and will not interfere with the user's viewing of content on display 11.4.2-14, even though bar code 11.4.2-92 is formed on lens 11.4.2-76. At the same time, gaze tracker 11.4.2-86 is pointed towards lens 11.4.2-76 so that gaze tracker 11.4.2-86 may capture an image of bar code 11.4.2-92 at infrared wavelengths.

Bar codes, text information, or other visible-light (and/or infrared light) markings may be formed from laser markings, patterned ink, patterned metal coatings, and/or other markings formed in regions such as region 11.4.2-90. Visible-light-encoded information of this type (e.g., information stored optically) may be read by a visible light image sensor in lens module 11.4.2-70 or an image sensor elsewhere in device 11.4.2-10 (e.g., a visible light image sensor in sensors 11.4.2-16). In some situations, visible-light-encoded information such as text, icons, or other optically readable patterns may contain information that is recognizable to a user (e.g., text that a user can read such as the user's name or user name, an icon that a user can recognize, etc.). User recognizable information may be used to label lens modules 11.4.2-74 so that lens modules that belong to different users are not mixed up. An image sensor in device 11.4.2-10 (e.g., an image sensor in gaze tracker 11.4.2-87 and/or other image sensors) may optically read text, icons, or other patterned structures on the removable lens system that are also recognizable to the user and/or the image sensor may read patterns such as bar codes and other patterns that do not contain user-recognizable text or icons.

In some situations, it may be desirable to encrypt the information that is being stored in removable lens module 11.4.2-74. Stored information may be encrypted using a cryptographic key. Control circuitry 11.4.2-12 can decrypt the encrypted information using a corresponding cryptographic key suitable for decryption (which may be the same as the encrypting key or may be related to the encrypting key). Control circuitry 11.4.2-12 can obtain the key from the user (e.g., using input-output devices 11.4.2-22). If desired, control circuitry 11.4.2-12 can obtain the key from a remote server (e.g., an online service). A user password, username, or other information may, if desired, be gathered from the user and/or storage in device 11.4.2-10 and may be used by control circuitry 11.4.2-12 in obtaining the key from the online service. In some arrangements, keys may be stored in control circuitry 11.4.2-12 for use in decrypting encrypted information stored in lens module 11.4.2-74 (e.g., when device 11.4.2-10 is only used by the members of a single household). These illustrative arrangements and/or other arrangements for encrypting and decrypting the information stored in removable lens module 11.4.2-74 may be used to enhance privacy for stored user information.

Illustrative steps involved in using system 11.4.2-8 are shown in FIG. 11.4.2-4.

During the operations of block 11.4.2-100, a user who desires to use device 11.4.2-10 but who has specific visual defects (astigmatism, etc.) may attach a removable lens system that is associated with that user to device 11.4.2-10. During attachment of the removable lens system, removable lens support structures such as lens modules 11.4.2-74 may be aligned with non-removable lens support structures such as lens modules 11.4.2-70, so that lenses 11.4.2-76 are aligned with corresponding lenses 11.4.2-72. Coupling structures 11.4.2-82 and 11.4.2-84 may be used to hold lens modules 11.4.2-74 and 11.4.2-72 together. The presence of lenses 11.4.2-76 in alignment with lenses 11.4.2-72 allows the optical properties of lenses 11.4.2-76 to modify the optical properties of lenses 11.4.2-72 (e.g., to increase or decrease lens power, to add lens asymmetry to compensate for user astigmatism, etc.). In this way, the optical system of device 11.4.2-10 may be tailored to the user's vision.

During the operations of block 11.4.2-102, control circuitry 11.4.2-12 of head-mounted device 11.4.2-10 may read information that has been stored in the removable lens system (e.g., using gaze trackers 11.4.2-86, a visible-light image sensor, a memory reader such as reader 11.4.2-82, etc.). The information that is read may be stored using a bar code, text, other optically readable patterns (e.g., patterned ink, patterned metal, or other patterned structures), and/or using electrical data storage arrangements (see, e.g., bar code 11.4.2-92, visible information 11.4.2-90, and electrically stored information in storage 11.4.2-84 of FIG. 11.4.2-3).

In general, any suitable data may be stored in the removable lens system. This information may include, for example, information regarding the user that is associated with the removable lens system such as the user's eyeglass prescription (e.g., the spherical component of the user's prescription to be handled by spherical lens power, the astigmatic component of the user's prescription to be handled by an aspherical lens power, and/or the interpupillary distance of the user's prescription), the date of the prescription, the expiration date of the prescription, the user's username and other user credentials, manufacturing information such as the date of manufacture of the removable lens system, the name of the manufacturer, a serial number, a lot number, and a model name or other model type information, lens materials for lenses 11.4.2-76, lens powers (e.g., spherical lens power and/or aspherical lens power) and/or other optical characteristics of lenses 11.4.2-76 such as known aberrations that can be later corrected using compensating image warping operations performed by control circuitry 11.4.2-12 during video playback, and/or other information.

After reading this information from the removable lens system during the operations of block 11.4.2-102, control circuitry 11.4.2-12 may, if desired, make adjustments to the components in device 11.4.2-10. These adjustments may be made based on real-time measurements from gaze trackers 11.4.2-86 and/or based on the stored data obtained from the removable lens system. For example, control circuitry 11.4.2-12 may use positioners 11.4.2-58 to adjust lens-to-lens spacing based on real-time measurements of the user's interpupillary distance determined from the positions of the user's pupils measured with gaze trackers 11.4.2-86 and/or based on stored interpupillary distance information for the user that is obtained from removable lens modules 11.4.2-74. Control circuitry 11.4.2-12 may also adjust the positions of the lenses in device 11.4.2-10 along the Z axis of FIG. 11.4.2-2 to place lenses 11.4.2-72 and associated supplemental lenses 11.4.2-76 in a satisfactory location to allow the user to view content on displays 11.4.2-14. These focusing adjustments with lenses 11.4.2-72 and 11.4.2-76 may be made based on the user's prescription, the powers of lenses 11.4.2-76, and other information obtained using the stored information in lenses 11.4.2-76. In arrangements in which lenses 11.4.2-72 have adjustable power (e.g., when lenses 11.4.2-72 are tunable lenses), control circuitry 11.4.2-12 can adjust lenses 11.4.2-72 to implement the spherical component of the user's prescription. The asymmetric component of a user's prescription may be handled using the asymmetric portion of supplemental lenses 11.4.2-76 (as an example).

After making adjustments to device 11.4.2-10 based on information from the supplemental lens system formed from lenses 11.4.2-76, a user may place device 11.4.2-10 on the user's head.

During the operations of block 11.4.2-104, control circuitry 11.4.2-12 may make further adjustments to the components in device 11.4.2-10. For example, control circuitry 11.4.2-12 may use positioners 11.4.2-58 to adjust the lens-to-lens separation of left and right lenses 11.4.2-72 (and left and right lenses 11.4.2-76) based on information from sensors in device 11.4.2-10 (e.g., based on a measured interpupillary distance gathered using gaze trackers 11.4.2-86).

During the operations of block 11.4.2-104, an iris scanner, fingerprint sensor, input-output devices that gather username and password information, or other components may be used in authenticating the user. The user may, for example, be directed to supply a username and password so that control circuitry 11.4.2-12 can establish a communications link with an online service that provides media content (block 11.4.2-108). If the user is not authenticated by control circuitry 11.4.2-12 (e.g., if the user' username and password or other credentials (biometric information, etc.) are not authenticated, control circuitry 11.4.2-12 can, during the operations of block 11.4.2-110, prevent the user from accessing the online service, selectively block content, and/or take other suitable action. If desired, the user may be allowed to override the authentication process at block 11.4.2-110 and/or additional authentication techniques may be used in scenarios in which the user fails authentication during the operations block 11.4.2-106.

In some configurations of device 11.4.2-10, lenses 11.4.2-76 may carry user information (e.g., user game preferences, user movie preferences, etc.). In these configurations, control circuitry 11.4.2-12 can refrain from decoding this information until the user has been authenticated during the operations of block 11.4.2-106 and an appropriate decryption key has been obtained (e.g., the user's password).

In some embodiments, user information is stored by control circuitry 11.4.2-12. The user information may include information on a user's eye glasses prescription (e.g., a required optical prescription strength). The information stored in lenses 11.4.2-76 may include information on the optical prescription strength of lenses 11.4.2-76. After determining the user of device 11.4.2-10 and retrieving the user's stored prescription from control circuitry 11.4.2-12, control circuitry 11.4.2-12 may compare this retrieved user prescription information with the prescription of lenses 11.4.2-76 to determine if there is a satisfactory match. In the event that the prescription of lenses 11.4.2-76 does not match the user's prescription, control circuitry 11.4.2-12 may use display 11.4.2-14 and/or other output circuitry to issue a visible and/or audible alert for the user and may, if desired, decline to display content on display 11.4.2-14.

In scenarios in which optical aberration information is included in the information stored in lenses 11.4.2-76 (e.g., information indicating that lenses 11.4.2-76 have a particular amount of barrel distortion, pincushion distortion, spherical aberration, chromatic aberration, etc.), control circuitry 11.4.2-12 may, during the playback operations of block 11.4.2-108, apply geometric transformations or other video processing to the content being displayed on display 11.4.2-14 that compensates for this distortion. In this way, a user may view content that is free or nearly free of aberrations. If, as an example, lenses 11.4.2-76 exhibit pincushion distortion of a particular amount, information on this amount of pincushion distortion can be stored in lenses 11.4.2-76. During playback operations, control circuitry 11.4.2-12 can apply compensating (barrel) image warping to the content for display 11.4.2-14 to ensure that the displayed content exhibits low distortion and aberrations, thereby enhancing the content viewing experience for the user. In general, control circuitry 11.4.2-12 may apply any image processing correction that helps enhance image quality and the user's viewing experience. For example, corrections can be applied to correct for chromatic aberration, spherical aberration, etc.

In accordance with an embodiment, a system is provided that includes a head-mounted support structure, a display coupled to the head-mounted support structure, control circuitry configured to supply content using the display, a non-removable lens coupled to the head-mounted support structure that is configured to present the content from the display in an eye box, and a removable supplemental lens removably coupled to head-mounted support structure between the non-removable lens and the eye box, the removable supplemental lens is configured to store information that is retrieved by the control circuitry.

In accordance with another embodiment, the system includes a gaze tracking system having a light emitter and an infrared image sensor, the removable supplemental lens has a bar code that stores the information, the bar code is opaque at infrared wavelengths and transparent at visible wavelengths, and the image sensor is configured to read the bar code while the removable supplemental lens is removably coupled to the head-mounted support structure.

In accordance with another embodiment, the bar code includes infrared-opaque-and-visible-light-transparent ink on a clear lens element in the removable supplemental lens.

In accordance with another embodiment, the information includes information selected from the group consisting of an eyeglass prescription, an eyeglass prescription date of expiration, a username, a manufacturing date, a manufacturer, a serial number, a manufacturing lot number, a model name, a model type, and information on optical characteristics of the removable supplemental lens.

In accordance with another embodiment, the system includes a data reading device coupled to the head-mounted support structure, the control circuitry is configured to use the data reading device to obtain the information from the removable supplemental lens.

In accordance with another embodiment, the information includes an eyeglasses prescription.

In accordance with another embodiment, the removable supplemental lens includes memory and the data reading device is configured to obtain the information from the memory.

In accordance with another embodiment, the removable supplemental lens includes text and the data reading device is configured to obtain the information by optically reading the text.

In accordance with another embodiment, the removable supplemental lens includes circuitry configured to store data and the data reading device is configured to obtain the information from the circuitry.

In accordance with another embodiment, the removable supplemental lens includes programmable read only memory, the data reading device is configured to obtain the information from the programmable read only memory, and the information includes a lens characteristics of the removable supplemental lens.

In accordance with another embodiment, the lens characteristic includes a lens power associated with the removable supplemental lens.

In accordance with another embodiment, the lens characteristic includes an aspherical lens power associated with the removable supplemental lens.

In accordance with another embodiment, the lens characteristic includes an optical aberration associated with the removable supplemental lens.

In accordance with another embodiment, the control circuitry is configured to obtain the information when the removable supplemental lens is coupled to the head-mounted support structure.

In accordance with another embodiment, the information includes information selected from the group consisting of a username, a serial number, optical characteristics of the removable supplemental lens, and eyeglass prescription information.

In accordance with an embodiment, a head-mounted device, is provided that includes head-mounted support structures, a display configured to display content, left and right positioners, a non-removable lens system having left and right lenses that are positioned respectively by the left and right positioners, a removable lens system with removable supplemental left and right lenses that are removably coupled to the head-mounted support structures in alignment respectively with the right and left lenses, and control circuitry configured to obtain information stored in the removable lens system.

In accordance with another embodiment, the information includes an interpupillary distance for a user and the control circuitry is configured to use the left and right positioners to adjust a lens-center-to-lens-center spacing associated with the left and right lenses to match the interpupillary distance.

In accordance with another embodiment, the head-mounted device includes an optically readable pattern on the removable lens system that stores the information.

In accordance with another embodiment, the head-mounted device includes an image sensor that optically reads the optically readable pattern to retrieve the information from the removable lens system.

In accordance with another embodiment, the image sensor includes an infrared image sensor in a gaze tracking system.

In accordance with another embodiment, the information includes a user's eyeglass prescription and the control circuitry is configured to adjust the left and right positioners based on the user's eyeglass prescription.

In accordance with an embodiment, an electronic device configured to operate with a removable supplemental lens system is provided that includes a display that displays content, control circuitry, a non-removable lens system configured to allow the display content to be viewed from eye boxes, a removable supplemental lens system, and head-mounted support structures that support the display and that support the non-removable lens system between the eye boxes and the display, the removable supplemental lens system is configured to be supported between the non-removable lenses and the eye boxes, the removable supplemental lens system is configured to store information, and the control circuitry is configured to obtain the information from the removable supplemental lens system when the removable supplemental lens system is between the non-removable lenses and the eye boxes.

In accordance with another embodiment, the electronic device includes lens positioners, the control circuitry is configured to use the lens positioners to adjust a lens-to-lens spacing associated with left and right lenses in the non-removable lens system based on the information obtained from the removable supplemental lens system.

In accordance with another embodiment, the information includes an optical prescription associated with the removable supplemental lens system and the control circuitry is configured to issue an alert to a user in response to determining that there is a mismatch between the user's prescription and the optical prescription associated with the removable supplemental lens system.

In accordance with another embodiment, the information includes distortion information specifying an optical distortion associated with the supplemental lens system and the control circuitry is configured to apply a compensating correction to the content being displayed on the display based on the distortion information.

The foregoing is merely illustrative and various modifications can be made to the described embodiments. The foregoing embodiments may be implemented individually or in any combination.

11.4.3: RX Lenses

FIG. 11.4.3-1 illustrates an optical assembly 11.4.3-100 for use in an HMD device such as those described herein. The optical assembly 11.4.3-100 can be configured to project light toward the user's eyes when donning the HMD. In at least one example, the optical assembly 11.4.3-100 can include a removably attachable prescription ("Rx") lens 11.4.3-102. The Rx lens 11.4.3-102 can be removably coupled to a rim 11.4.3-104. The rim 11.4.3-104 can be fixed to an outer housing 11.4.3-106 of the optical assembly 11.4.3-106. The Rx lens 11.4.3-102 can be swappable to accommodate the vision correction needs of various users of the HMD. The optical assembly 11.4.3-100 can also include a display, such as a display screen (not shown), configured to project light toward the user's eye(s) through the Rx lens 11.4.3-102.

FIG. 11.4.3-2 illustrates the optical assembly 11.4.3-100 with the Rx lens removed to illustrate another lens 11.4.3-108 of the optical assembly. The fixed lens 11.4.3-108 shown in FIG. 11.4.3-2 can be disposed below/behind the Rx lens 11.4.3-102 shown in FIG. 11.4.3-1 (e.g., with the Rx lens 11.4.3-102 disposed between the fixed lens 11.4.3-108 and the user's eye 11.4.3-108 during use) and substantially un-removably fixed to the optical assembly 11.4.3-100, for example to the rim 11.4.3-104 of the optical assembly 11.4.3-100.

FIG. 11.4.3-3 illustrates another example of the optical assembly with the Rx lens 11.4.3-102, rim 11.4.3-104, and housing 11.4.3-106 removed to illustrate an array of magnets 11.4.3-110 disposed peripherally to the lens 11.4.3-108 and the Rx lens 11.4.3-102. The magnets 11.4.3-110 can be embedded in the rim or otherwise fixed in the optical assembly 11.4.3-100 as shown to provide magnetic securement of the Rx lens 11.4.3-102, which can also include a complimentary array of magnets to removably attach the Rx lens 11.4.3-102 to the optical assembly 11.4.3-100 over the fixed lens 11.4.3-108.

The magnet array 11.4.3-110 can be used for macro-alignment of the Rx lens 11.4.3-102 to the assembly 11.4.3-100 to ensure the Rx lens 11.4.3-102 is rotated correctly relative to the fixed lens 11.4.3-108 and the rest of the assembly 11.4.3-100, including the rim 11.4.3-104 and the housing 11.4.3-106.

Any of the features, components, and/or parts, including the arrangements and configurations thereof shown in FIGS. 11.4.3-1-11.4.3-3 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIGS. 11.4.3-1-11.4.3-3.

FIG. 11.4.3-4 illustrates an example of an optical assembly 11.4.3-200 configured for receiving a removably attachable Rx lens. FIG. 11.4.3-4 shows the assembly 11.4.3-200 as assembled as well as an exploded view thereof. The two magnet arrays 11.4.3-210 and 11.4.3-212 are also shown. The assembly 11.4.3-200 can include a housing 11.4.3-206, rim 11.4.3-204, a first magnet array 11.4.3-210, and a second magnet array 11.4.3-212. In at least one example, the Rx lens (not shown) can be coupled with the rim 11.4.3-204 such that the Rx lens and the rim 11.4.3-204 are removably secured to the housing 11.4.3-206. The second magnet array 11.4.3-212 can be embedded or otherwise secured with the rim 11.4.3-204 such that the second magnet array 11.4.3-212 magnetically couples to the first magnet array 11.4.3-210 to removably secure the Rx lens and the rim 11.4.3-204 to the housing 11.4.3-206.

In at least one example, the magnet arrays 11.4.3-210, 11.4.3-212, either those fixed to the rim 11.4.3-204 or those fixed to the Rx lens, can be mapped when the lenses are installed by the user to ensure proper lens alignment with the system/assembly 11.4.3-200 in order to ensure the correct lens (Rx lens) is being installed. The Rx lens itself can be mapped (e.g., automatically mapped by imaging components such as rear-facing cameras, including gaze tracking cameras . . . etc.) upon user install to ensure the correct lens is being secured by the user.

FIG. 11.4.3-5 illustrates left and right magnet arrays **11.4.3-310*a*, 11.4.3-310*b*, respectively, which can be used for attaching left and right Rx lenses, respectively. In at least one example, the left and right arrays 11.4.3-310*a-b* can include individual magnets with alternating polarities, where the polarities of the left magnet array 11.4.3-310*a* are opposite relative to the corresponding magnets of the right magnet array 11.4.3-310*b*. The polarities of the individual magnets of the left and right arrays 11.4.3-310*a-b* can be flipped about a line of symmetry 11.4.3-314 between the user's eyes and/or between the left and right arrays 11.4.3-310*a-b***.

Any of the features, components, and/or parts, including the arrangements and configurations thereof shown in FIGS. 11.4.3-4 and 11.4.3-5 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIGS. 11.4.3-4 and 11.4.3-5.

FIGS. 11.4.3-6 and 11.4.3-7 illustrate a perspective view and a side/cross-sectional view of an example of an Rx lens 11.4.3-402 configured to be removably attached to an optical assembly/module of an HMD device. Depending on the prescription of the Rx lens 11.4.3-402, one or more proximal, perimeter edges of the lens 11.4.3-402 may be disposed proud of the housing or rim of the optical assembly. In at least one example, the proximal, peripheral edge 11.4.3-416 of the lens 11.4.3-402 can include a rounded and/or chamfered geometry to reduce sharp or abrupt edge features.

Any of the features, components, and/or parts, including the arrangements and configurations thereof shown in FIGS. 11.4.3-6 and 11.4.3-7 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIGS. 11.4.3-6 and 11.4.3-7.

FIG. 11.4.3-8 illustrates an example of an Rx lens assembly including an Rx lens 11.4.3-502 secured to a rim 11.4.3-504 and a magnet array 11.4.3-512 embedded in the rim 11.4.3-504. In at least one example, the magnets of the magnet array 11.4.3-512 can be molded into the rim 11.4.3-504. In at least one example, the assembly includes a notched feature 11.4.3-520 where a protruding feature 11.4.3-524 of the lens 11.4.3-502 extends into a recess 11.4.3-522 of the rim 11.4.3-504 to form a mechanical fit between the lens 11.4.3-502 and the rim 11.4.3-504. In at least one example, the notched feature 11.4.3-520 includes a protrusion of the rim 11.4.3-504 extending into a cavity of the lens 11.4.3-502. In at least one example, the rim 11.4.3-504 is removably securable to the housing of an optical module via the magnets of the magnet array 11.4.3-512 and the lens 11.4.3-502 is removably securable to the rim 11.4.3-504 via the notched feature 502. In addition, in at least one example, the optical assemblies described herein can include multiple notch assemblies similar to the notch assembly 11.4.3-520 shown in FIG. 8 between the lens 11.4.3-502 and the rim 11.4.3-504, including one or more notch features securing the rim 11.4.3-504 to a housing or other component of the optical assembly, and/or a notch assembly securing the optical assembly to other component of the HMD. In at least one example, the magnets of the magnet array 11.4.3-512 can vary in size to achieve desired attraction forces where the magnets of the magnet array 11.4.3-512 include a shaved or chamfered corner to accommodate the lens edges adjacent the magnets.

In at least one example, the assembly can include one or more opaque films or inks applied to the proximal, peripheral edges 11.4.3-526, 11.4.3-528 of the lens 11.4.3-502 and the rim 11.4.3-504, respectively, to minimize edge glares and unsightly light features at the peripheral edge of the assembly. In at least one example, as shown in FIG. 11.4.3-8, the proximal, peripheral edge 11.4.3-526 of the lens 11.4.3-502 can extend beyond the proximal, peripheral edge 11.4.3-528 of the rim 11.4.3-504.

Any of the features, components, and/or parts, including the arrangements and configurations thereof shown in FIG. 11.4.3-8 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIG. 11.4.3-8.

FIG. 11.4.3-9 illustrates another example of a removable Rx lens assembly including an Rx lens 11.4.3-602 secured to a rim 11.4.3-604 at a notch feature 11.4.3-620. The assembly can also include one or more magnets of a magnet array 11.4.3-612 embedded within, e.g., molded with, the rim 11.4.3-604. In the illustrated example of FIG. 11.4.3-9, the proximal, peripheral edge 11.4.3-628 of the rim 11.4.3-604 extends beyond the proximal, peripheral edge 11.4.3-626 of the lens 11.4.3-602.

FIG. 11.4.3-10 illustrates another example of a removable Rx lens assembly including an Rx lens 11.4.3-702 secured to a rim 11.4.3-704 at a notch feature 11.4.3-720. The assembly can also include one or more magnets of a magnet array 11.4.3-712 embedded within, e.g., molded with, the rim 11.4.3-704. In the illustrated example of FIG. 11.4.3-10, the proximal, peripheral edge 11.4.3-728 of the rim 11.4.3-704 extends beyond the proximal, peripheral edge 11.4.3-726 of the lens 11.4.3-702. In the illustrated example of FIG. 11.4.3-10, a film or ink 11.4.3-718 can be applied to the edge 11.4.3-728 of the rim 11.4.3-702 to reduce glare and edge/lensing effects around a periphery of the assembly.

FIG. 11.4.3-11 illustrates another example of a removable Rx lens assembly including an Rx lens 11.4.3-802 secured to a rim 11.4.3-804 at a notch feature 11.4.3-820. The assembly can also include one or more magnets of a magnet array 11.4.3-812 embedded within, e.g., molded with, the rim 11.4.3-804. In the illustrated example of FIG. 11.4.3-11, the proximal, peripheral edge 11.4.3-828 of the rim 11.4.3-804 can be substantially flush with the proximal, peripheral edge 11.4.3-826 of the lens 802.

Any of the features, components, and/or parts, including the arrangements and configurations thereof shown in FIGS. 11.4.3-8-11.4.3-11 can be included, either alone or in any combination, in any of the other examples of devices, features, components, and parts shown in any other figures shown and described herein. Likewise, any of the features, components, and/or parts, including the arrangements and configurations thereof shown and described with reference to any other figure shown and described herein, either alone or in any combination, in the example of the devices, features, components, and parts shown in FIGS. 11.4.3-8-11.4.3-11.

In at least one example of the present disclosure, the lenses of HMD devices disclosed herein, including the Rx lenses disclosed herein, can include multiple layers or lenses stacked together as layers. In at least one example, an HMD lens stack can include three or more lenses or layers of lenses stacked together to form a single lens. In at least one example, the lens stack can include four or more lenses. In at least one example, a four-lens stack can include a first lens, a second lens coupled to the first lens, a third lens coupled to the second with the second lens between the first lens and the third lens, and a fourth lens coupled to the third lens with the third lens between the fourth lens and the second lens. In such an example, the fourth lens can be an Rx lens customized to the prescription of the user. In one example, the lens stack can include a first, second, and third lens with the second lens disposed between the third lens and the first lens. In such an example, the third lens can include the Rx lens customized to the user's prescription. In such examples, e.g., the third lens of a three stack lens being the Rx lens or the fourth lens of a four-stack lens being Rx lens, the other lenses can be standard lenses of the HMD across other SKUs or HMD devices. The Rx lens of the stacks can be permanently fixed to the other lenses or lens layers of the stack or the Rx lenses can be removably coupled thereto to allow replacement.

In at least one example, any of the lenses, including Rx lenses, of HMD devices described herein, can include identification features recognizable by the HMD device, including via the various cameras, sensors, and controllers of the optical systems of the HMD, to recognize and verify the correct lens is attached for a given user. In one example, lenses described herein can include radio-frequency identification features detectable by the HMD. In one example, the lenses can include IR visible barcodes detectable by IR sensors/cameras of the HMD. In one example, the lenses can include QR codes or other codes or visual identification features which the HMD can detect and compare against server-based data or other data to verify the correct lenses for given users and/or for lens calibration purposes. In at least one example, the sensor system of the optical module of the HMD, including the cameras, sensors, controllers/processors, can be used to detect a distortion of light through an Rx lens and match the distortion to a certain prescription and/or user associated with the prescription to verify the correct lens is being used for the given user.

In at least one example of the present disclosure, any of the lenses described herein, including Rx lenses described herein, can be formed to accommodate a prescription based on a visual/focal distance provided by the display/lens system of the HMD to the user, which can be determined based on a traditional prescription of a user based on infinity and 60 cm standard prescription distances. In one example, if a user provides a standard prescription, for example a prescription associated with a visual distance of infinity and 60 cm, or other distances common in standard prescriptions, the Rx lenses of the HMD can be made based on that prescription to be a prescription for a visual distance of 1-meter. 1-meter is used as a non-limiting example of a focal distance of the optical display system of the HMD. Other distances can be used to match the effective focal distance provided by the HMD, if that effective focal distance displayed by the HMD is a distance other than 1-meter.

XII: Curtain

FIGS. 12.0-1 illustrates a view of an HMD 12.0-100 including a curtain assembly 12.0-102. The curtain assembly 12.0-102 is described in more detail here in section XII.

12.1: Electronic Devices with Stretchable Fabric Covers

Electronic devices such as head-mounted electronic devices may include displays for presenting images to users. To accommodate variations in the interpupillary distances associated with different users, a head-mounted device may have left-eye and right-eye optical modules that move with respect to each other. Each optical module may include a display device for producing an image and an associated optical component such as a lens for providing the image to an associated eye box in which an eye of the user is located for viewing the image. The optical modules, which may sometimes be referred to as optical systems, display systems, lens systems, lens and display assemblies, etc., may each have a support structure such as a lens barrel that supports a respective display and lens.

Actuators may be used to position the lens barrels within the housing of a head-mounted device. To hide the actuators and other electrical components such as integrated circuits, batteries, sensors, etc. and to hide potentially unsightly internal housing structures from view, the rear of a head-mounted device that faces the user may be provided with a cosmetic covering. Openings in the cosmetic covering may receive the lens barrels of the optical modules. The cosmetic covering may be configured to accommodate movement in the positions of the optical modules for different interpupillary distances.

The covering may be a stretchable fabric cover having first strands that form a warp knit layer with diamond-shaped openings and second strands that zig-zag back and forth within the diamond-shaped openings. The first strands may be elastic and may provide stretch in the warp direction, while the second strands may be covered strands that provide stretch in the weft direction. The covered strands may have a drawn textured yarn covering that forms a fuzzy and opaque layer for hiding electrical components.

If desired, the cover may be a jacquard fabric with different zones of stretch, opacity, and/or other characteristics. For example, the cover may have a nose bridge region interposed between eye regions. The nose bridge region may have greater opacity and less stretch than the eye regions. Arrangements in which the cover is formed from three-dimensional fabric having cylindrical portions that move relative to one another in response to optical module movements may also be used.

An electronic device such as a head-mounted device may have a front face that faces away from a user's head and may have an opposing rear face that faces the user's head. Optical modules on the rear face may be used to provide images to a user's eyes. The positions of the optical modules may be adjusted to accommodate different user interpupillary distances. Internal device structures may be hidden from view by the user by covering the rear face of the device with a curtain. The curtain, which may sometimes be referred to as a cover, covering structure, rear housing cover, rear housing wall, rear housing structure, cosmetic covering, etc., may help block potentially unsightly internal structures from view, while accommodating movement of the optical modules.

A top view of an illustrative head-mounted device with a curtain is shown in FIG. 12.1-1. As shown in FIG. 12.1-1, head-mounted devices such as electronic device 12.1-10 may have head-mounted support structures such as housing 12.1-12. Housing 12.1-12 may include portions (e.g., support structures 12.1-12T) to allow device 12.1-10 to be worn on a user's head. Support structures 12.1-12T may be formed from fabric, polymer, metal, and/or other material. Support structures 12.1-12T may form a strap or other head-mounted support structures that help support device 12.1-10 on a user's head. A main support structure (e.g., main housing portion 12.1-12M) of housing 12.1-12 may support electronic components such as displays 12.1-14. Main housing portion 12.1-12M may include housing structures formed from metal, polymer, glass, ceramic, and/or other material. For example, housing portion 12.1-12M may have housing walls on front face F and housing walls on adjacent top, bottom, left, and right side faces that are formed from rigid polymer or other rigid support structures and these rigid walls may optionally be covered with electrical components, fabric, leather, or other soft materials, etc. The walls of housing portion 12.1-12M may enclose internal components 12.1-38 in interior region 12.1-34 of device 12.1-10 and may separate interior region 12.1-34 from the environment surrounding device 12.1-10 (exterior region 12.1-36). Internal components 12.1-38 may include integrated circuits, actuators, batteries, sensors, and/or other circuits and structures for device 12.1-10. Housing 12.1-12 may be configured to be worn on a head of a user and may form glasses, a hat, a helmet, goggles, and/or other head-mounted device. Configurations in which housing 12.1-12 forms goggles may sometimes be described herein as an example.

Front face F of housing 12.1-12 may face outwardly away from a user's head and face. Opposing rear face R of housing 12.1-12 may face the user. Portions of housing 12.1-12 (e.g., portions of main housing 12.1-12M) on rear face R may form a cover such as curtain 12.1-12C. In an illustrative configuration, curtain 12.1-12C includes a fabric layer that separates interior region 12.1-34 from the exterior region to the rear of device 12.1-10. Other structures may be used in forming curtain 12.1-12C, if desired. The presence of curtain 12.1-12C on rear face R may help hide internal housing structures, internal components 12.1-38, and other structures in interior region 12.1-34 from view by a user.

Device 12.1-10 may have left and right optical modules 12.1-40 (sometimes referred to as optical assemblies). Each optical module may include a respective display 12.1-14, lens 12.1-30, and support structure 12.1-32. Support structures 12.1-32, which may sometimes be referred to as lens barrels or optical module support structures, may include hollow cylindrical structures with open ends or other supporting structures to house displays 12.1-14 and lenses 12.1-30. Support structures 12.1-32 may, for example, include a left lens barrel that supports a left display 12.1-14 and left lens 12.1-30 and a right lens barrel that supports a right display 12.1-14 and right lens 12.1-30. Displays 12.1-14 may include arrays of pixels or other display devices to produce images. Displays 12.1-14 may, for example, include organic light-emitting diode pixels formed on substrates with thin-film circuitry and/or formed on semiconductor substrates, pixels formed from crystalline semiconductor dies, liquid crystal display pixels, scanning display devices, and/or other display devices for producing images. Lenses 12.1-30 may include one or more lens elements for providing image light from displays 12.1-14 to respective eyes boxes 12.1-13. Lenses may be implemented using refractive glass lens elements, using mirror lens structures (catadioptric lenses), using holographic lenses, and/or other lens systems. When a user's eyes are located in eye boxes 12.1-13, displays (display panels) 12.1-14 operate together to form a display for device 12.1-10 (e.g., the images provided by respective left and right optical modules 12.1-40 may be viewed by the user's eyes in eye boxes 12.1-13 so that a stereoscopic image is created for the user). The left image from the left optical module fuses with the right image from a right optical module while the display is viewed by the user.

Not all users have the same interpupillary distance P. To provide device 12.1-10 with the ability to adjust the interpupillary spacing between modules 12.1-40 along lateral dimension X and thereby adjust the spacing P between eye boxes 12.1-13 to accommodate different user interpupillary distances, device 12.1-10 may be provided with actuators 12.1-42. Actuators 12.1-42 can be manually controlled and/or computer-controlled actuators (e.g., computer-controlled motors) for moving support structures 12.1-32 relative to each other.

As shown in FIG. 12.1-2, curtain 12.1-12C may cover rear face R while leaving lenses 12.1-30 of optical modules 12.1-40 uncovered (e.g., curtain 12.1-12C may have openings that are aligned with and receive modules 12.1-40). As modules 12.1-40 are moved relative to each other along dimension X to accommodate different interpupillary distances for different users, modules 12.1-40 move relative to fixed housing structures such as the walls of main portion 12.1-12M and move relative to each other. To prevent undesired wrinkling and buckling of curtain 12.1-12C as optical modules 12.1-40 are moved relative to rigid portions of housing 12.1-12M and relative to each other, a fabric layer or other cover layer in curtain 12.1-12C may be configured to slide, stretch, open/close, and/or otherwise adjust to accommodate optical module movement.

A schematic diagram of an illustrative electronic device such as a head-mounted device or other wearable device is shown in FIG. 12.1-3. Device 12.1-10 of FIG. 12.1-3 may be operated as a stand-alone device and/or the resources of device 12.1-10 may be used to communicate with external electronic equipment. As an example, communications circuitry in device 12.1-10 may be used to transmit user input information, sensor information, and/or other information to external electronic devices (e.g., wirelessly or via wired connections). Each of these external devices may include components of the type shown by device 12.1-10 of FIG. 12.1-3.

As shown in FIG. 12.1-3, a head-mounted device such as device 12.1-10 may include control circuitry 12.1-20. Control circuitry 12.1-20 may include storage and processing circuitry for supporting the operation of device 12.1-10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 12.1-20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 12.1-20 may use display(s) 12.1-14 and other output devices in providing a user with visual output and other output.

To support communications between device 12.1-10 and external equipment, control circuitry 12.1-20 may communicate using communications circuitry 12.1-22. Circuitry 12.1-22 may include antennas, radio-frequency transceiver circuitry, and other wireless communications circuitry and/or wired communications circuitry. Circuitry 12.1-22, which may sometimes be referred to as control circuitry and/or control and communications circuitry, may support bidirectional wireless communications between device 12.1-10 and external equipment (e.g., a companion device such as a computer, cellular telephone, or other electronic device, an accessory such as a point device, computer stylus, or other input device, speakers or other output devices, etc.) over a wireless link. For example, circuitry 12.1-22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link. Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 12.1-10 may, if desired, include power circuits for transmitting and/or receiving wired and/or wireless power and may include batteries or other energy storage devices. For example, device 12.1-10 may include a coil and rectifier to receive wireless power that is provided to circuitry in device 12.1-10.

Device 12.1-10 may include input-output devices such as devices 12.1-24. Input-output devices 12.1-24 may be used in gathering user input, in gathering information on the environment surrounding the user, and/or in providing a user with output. Devices 12.1-24 may include one or more displays such as display(s) 12.1-14. Display(s) 12.1-14 may include one or more display devices such as organic light-emitting diode display panels (panels with organic light-emitting diode pixels formed on polymer substrates or silicon substrates that contain pixel control circuitry), liquid crystal display panels, microelectromechanical systems displays (e.g., two-dimensional mirror arrays or scanning mirror display devices), display panels having pixel arrays formed from crystalline semiconductor light-emitting diode dies (sometimes referred to as microLEDs), and/or other display devices.

Sensors 12.1-16 in input-output devices 12.1-24 may include force sensors (e.g., strain gauges, capacitive force sensors, resistive force sensors, etc.), audio sensors such as microphones, touch and/or proximity sensors such as capacitive sensors such as a touch sensor that forms a button, trackpad, or other input device), and other sensors. If desired, sensors 12.1-16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, iris scanning sensors, retinal scanning sensors, and other biometric sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors such as blood oxygen sensors, heart rate sensors, blood flow sensors, and/or other health sensors, radio-frequency sensors, depth sensors (e.g., structured light sensors and/or depth sensors based on stereo imaging devices that capture three-dimensional images), optical sensors such as self-mixing sensors and light detection and ranging (LIDAR) sensors that gather time-of-flight measurements, humidity sensors, moisture sensors, gaze tracking sensors, electromyography sensors to sense muscle activation, facial sensors, and/or other sensors. In some arrangements, device 12.1-10 may use sensors 12.1-16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 12.1-10 may include additional components (see, e.g., other devices 12.1-18 in input-output devices 12.1-24). The additional components may include haptic output devices, actuators for moving movable housing structures, audio output devices such as speakers, light-emitting diodes for status indicators, light sources such as light-emitting diodes that illuminate portions of a housing and/or display structure, other optical output devices, and/or other circuitry for gathering input and/or providing output. Device 12.1-10 may also include a battery or other energy storage device, connector ports for supporting wired communication with ancillary equipment and for receiving wired power, and other circuitry.

FIGS. 12.1-4 and 12.1-5 are top views of device 12.1-10 showing how the optical modules of device 12.1-10 move with respect to each other along lateral dimension X to accommodate different interpupillary distances P (the distance between a user's left and right eyes). In the example of FIG. 12.1-4, left optical module 12.1-40L and right optical module 12.1-40R have been moved towards each other to accommodate a small interpupillary distance. In the example of FIG. 12.1-5, left optical module 12.1-40L and right optical module 12.1-40R have been moved away from each other to accommodate a large interpupillary distance.

Curtain 12.1-12C has edge portions such as left portion 12.1-12C-L between left housing wall 12.1-12M-L and left optical module 12.1-40L and right portion 12.1-12C-R between right housing wall 12.1-12M-R and right optical module 12.1-40R. Middle portion 12.1-12C-M of curtain 12.1-12C extends between left optical module 12.1-40L and right optical module 12.1-40R. In the configuration of FIG. 12.1-4, optical modules 12.1-40L and 12.1-40R are relatively close to each other, so middle portion 12.1-12C-M is relatively small and portions 12.1-12C-L and 12.1-12C-R are relatively large. In the configuration of FIG. 12.1-5, optical modules 12.1-40L and 12.1-40R are relatively far from each other, so left portion 12.1-12C-L and right portion 12.1-12C-R are shorter along lateral dimension X and middle portion 12.1-12C-M has been enlarged relative to the configuration of FIG. 12.1-4.

To help accommodate differences in size for curtain 12.1-12C (e.g., length changes for portions of curtain 12.1-12C along lateral dimension X), curtain 12.1-12C may include a cover layer such as cover layer 12.1-12CC formed from a stretchable material such as fabric. Cover layer 12.1-12CC may be supported by a rigid frame. The fabric of cover layer 12.1-12CC may be provided with a peripheral elastic band that helps allow the fabric to slide relative to the frame while being retained securely on the frame, thereby further helping curtain 12.1-12C to be dynamically adjusted without exhibiting undesired buckling and wrinkling. Cover layer 12.1-12CC may have left and right openings to receive respective left and right optical modules 12.1-40L and 12.1-40R.

Cover layer 12.1-12CC may be formed from fabric having the desired opacity (e.g., sufficiently opaque to hide electronic components in device 12.1-10), stretch (e.g., cover 12.1-12CC may be configured to stretch by at least 50%, at least 75%, at least 100%, or at least 150% of its length to allow dynamic expansion and contraction of cover 12.1-12CC as optical modules 12.1-40L and 12.1-40R are adjusted, as an example), modulus of elasticity (e.g., the elastic modulus of cover 12.1-12CC may be sufficiently low so that less electrical power is required for actuators 12.1-42 to stretch cover 12.1-12CC), durability (e.g., cover 12.1-12CC may be configured to maintain dimensional stability over long term use by avoiding wrinkling after being exposed to skin sebum and/or other chemicals, repeated stretching, etc.), cosmetic appeal, and/or other suitable characteristics.

FIG. 12.1-6 is a front view of an illustrative cover layer for curtain 12.1-12C. As shown in FIG. 12.1-6, cover layer 12.1-12CC may include fabric formed from fabric such as fabric 12.1-62. Fabric 12.1-62 may be warp knit fabric, weft knit fabric, or other knit fabric (e.g., to promote stretchiness), may be woven fabric, braided fabric, non-woven fabric, etc. If desired, a layer of stretchy plastic may be attached to fabric 12.1-62 and/or an elastomeric polymer layer may be used in place of some or all of fabric 12.1-62 in forming layer 12.1-12CC. Fabric 12.1-62 may be formed from interlaced (intertwined) strands of material such as polymer strands, strands of cotton or other natural material, synthetic material, and/or other materials. The strands in fabric 12.1-62 may include monofilament strands and/or multi-filament strands. In an illustrative configuration, some of the strands of fabric 12.1-62 may be selected to provide fabric 12.1-62 with strength, some of strands in fabric 12.1-62 may be formed from elastomeric material that enhances the ability of fabric 12.1-62 to stretch (and that has a lower elastic modulus than the strands that provide fabric 12.1-62 with strength). Examples of stretchable strand materials include elastomeric materials such as silicone, spandex, and thermoplastic polyurethane (TPU). Examples of strength-enhancing strand materials include polyester, nylon, etc. Other materials may be used in forming the strands in fabric 12.1-62, if desired.

Strands in fabric 12.1-62 may be dyed at the fabric level (e.g., after strands are knit, woven, or otherwise interlaced to form fabric 12.1-62), may be dyed at the strand or yarn level (e.g., after material is made into monofilament or multifilament strands), and/or may be dyed at the polymerization level (e.g., before material is made into monofilament or multifilament strands). Dyeing yarn may cause some shrinkage and should therefore be taken into account when determining the appropriate amount of stretch for fabric 12.1-62.

In the example of FIG. 12.1-6, fabric 12.1-62 includes warp knit strands 12.1-44 and zig-zag strands 12.1-46. Warp knit strands 12.1-44 may be warp knit strands that form a pattern of openings such as diamond-shaped openings 12.1-64. If desired, openings 12.1-64 may have other shapes. The use of diamond shapes for openings 12.1-64 is merely illustrative. Warp knit strands 12.1-44 may be formed from stretchable materials such as silicone, spandex, thermoplastic polyurethane (TPU), and or other stretchable materials, or warp strands 12.1-44 may be formed from strength-enhancing strand materials such as polyester, nylon, etc. Other materials may be used in forming strands 12.1-44, if desired.

Zig-zag strands 12.1-46 may be interlaced with warp knit strands 12.1-44 and may zig-zag back and forth (e.g., back in forth in the weft or x-direction) multiple times within each diamond-shaped opening 12.1-64. Zig-zag strands 12.1-46 (sometimes referred to as running strands, accordion strands, etc.) may be formed from stretchable materials such as silicone, spandex, thermoplastic polyurethane (TPU), and or other stretchable materials, or zig-zag strands 12.1-46 may be formed from strength-enhancing strand materials such as polyester, nylon, etc. Other materials may be used in forming strands 12.1-46, if desired. Strands 12.1-46, may, if desired, be covered strands that include a covering. The covering may be a different material than the core. For example, the core may be a stretchable material such as spandex and the covering may be a less-stretchable material such as polyester or polyethylene terephthalate. If desired, the covering may be relatively "fuzzy" (e.g., may have a frayed or otherwise not smooth texture) to increase opacity of cover 12.1-12CC.

In some arrangements, warp knits strands 12.1-44 and zig-zag strands 12.1-46 are formed in the same layer (e.g., formed in single layer). In other arrangements, warp knit strands 12.1-44 may be formed in front of or behind zig-zag strands 12.1-46 (e.g., warp knit strands 12.1-44 may be formed in a first layer and zig-zag strands 12.1-46 may be formed in a second layer that overlaps the first layer). In one illustrative arrangement, zig-zag strands 12.1-46 are positioned on the side closer to the user's face and warp strands 12.1-44 are positioned on the side closer to the electrical components in device 12.1-10. In configurations where zig-zag strands 12.1-46 include a covering (e.g., a covering of polyester, polyethylene terephthalate, and/or other suitable material), placing zig-zag strands 12.1-46 on the user-facing side of cover 12.1-12CC may help protect the stretchable strands in fabric 12.1-62 (e.g., strands 12.1-44 and/or the core of strands 12.1-46) from facial chemicals such as sebum that may otherwise cause wear to elastic strands in fabric 12.1-62. If desired, warp knit strands 12.1-44 may be smooth strands and zig-zag strands 12.1-46 may be textured fuzzy strands.

The use of warp knit strands 12.1-44 and zig-zag strands 12.1-46 may provide cover 12.1-12CC with different features. For example, warp knit strands 12.1-44 extend in the warp direction, thereby promoting shrinkage and increasing stretch in the warp direction. In contrast, zig-zag strands 12.1-46 may zig-zag in the weft direction, thereby promoting shrinkage and increasing stretch in the weft direction. For example, when fabric 12.1-62 is in an unstretched state, each diamond-shaped opening 12.1-64 has dimension D1 in the vertical (warp) direction (e.g., parallel to the y-axis of FIG. 12.1-6) and dimension D2 in the horizontal (weft)

direction (e.g., parallel to the x-axis of FIG. 12.1-6). When fabric 12.1-62 is in a stretched state, as shown in FIG. 12.1-7, each diamond-shaped opening 12.1-64 has dimension D3 in the vertical (warp) direction (e.g., parallel to the y-axis of FIG. 12.1-7) and dimension D4 in the horizontal (weft) direction (e.g., parallel to the x-axis of FIG. 12.1-7). Dimension D3 may be larger than dimension D1, and dimension D4 may be larger than dimension D2. In other words, openings 12.1-64 may open and expand when cover 12.1-12CC is stretched. Warp knit strands 12.1-44 stretch in the warp direction, thereby allowing the opening and closing of openings 12.1-64, whereas zig-zag strands 12.1-44 stretch in the weft direction, thereby providing fabric 12.1-62 with four-way stretch capabilities. The opacity provided by the fuzzy covering on zig-zag strands 12.1-46 may also serve to hide electrical components from view when openings 12.1-64 are expanded.

Another factor that may affect the stretchability of fabric 12.1-62 of cover 12.1-12CC is heat setting. In arrangements where fabric 12.1-62 is heat set, fabric 12.1-62 may be stretched and heat set to remove wrinkles. This may, however, reduce some of the stretch in fabric 12.1-62. If desired, fabric 12.1-62 of cover 12.1-12CC may be produced without any heat setting (e.g., may only undergo washing, dyeing, and drying) to retain the desired stretchability of fabric 12.1-62.

FIG. 12.1-8 is a side view of an illustrative strand 12.1-44 that may be used to form warp knit strands 12.1-44 of fabric 12.1-62. In the example of FIG. 12.1-8, strand 12.1-44 may be a single strand of material such as spandex, silicone, thermoplastic polyurethane (TPU), and/or other stretchable material, or strand 12.1-44 may be a single strand of strength-enhancing strand materials such as polyester, nylon, etc. In one illustrative configuration, strand 12.1-44 is a single strand of spandex having 20 denier, 40 denier, 30 denier, between 15 and 60 denier, between 20 and 50 denier, greater than 40 denier, less than 40 denier, etc. This is merely illustrative. If desired, strand 12.1-44 may be formed from other suitable materials and/or may have other denier values.

FIG. 12.1-9 is a side view of an illustrative strand 12.1-46 that may be used to form zig-zag strands 12.1-46 of fabric 12.1-62. In the example of FIG. 12.1-9, strand 12.1-46 may include a core such as core 12.1-48. Core 12.1-48 may be an elastic core formed from one or more strands of material such as spandex, silicone, thermoplastic polyurethane (TPU), and/or other stretchable material, or core 12.1-48 may be one or more strands of strength-enhancing strand materials such as polyester, nylon, etc. In one illustrative configuration, core 12.1-48 is an elastic core formed from a single strand of spandex having 20 denier, 40 denier, 30 denier, between 15 and 60 denier, between 20 and 50 denier, greater than 40 denier, less than 40 denier, etc. The denier value of core 12.1-48 of zig-zag strand 12.1-46 may, for example, be less than the denier value of warp knit strands 12.1-44. This is merely illustrative. If desired, strand 12.1-46 may be formed from other suitable materials and/or may have other denier values.

As shown in FIG. 12.1-9, core 12.1-48 of strand 12.1-46 may be covered with one or more covering strands 12.1-50. Covering strands 12.1-50 may be formed from strength-enhancing strand materials such as polyester, nylon, etc., or covering strands 12.1-50 may be formed from elastic material such as spandex, silicone, thermoplastic polyurethane (TPU), and/or other stretchable material. Cover 12.1-50 may have any suitable denier value such as 30 denier, 20 denier, 40 denier, between 15 and 60 denier, between 20 and 50 denier, greater than 40 denier, less than 40 denier, etc. The denier value of cover 12.1-50 of zig-zag strand 12.1-46 may, for example, be greater than the denier value of core 12.1-48 of strands 12.1-46. Covering strand 12.1-50 may be a single filament covering or may include multiple filaments such as 12.1-24 filaments, 12.1-30 filaments, 12.1-20 filaments, more than 12.1-20 filaments, less than 12.1-20 filaments, etc. Covering strand 12.1-50 may be textured, non-textured, bright, semi-dull, etc. In one illustrative configuration, covering strand 12.1-50 is a drawn textured yarn of polyester that is simultaneously twisted and drawn to provide a textured, fuzzy covering over core 12.1-48. Because polyester is less sensitive to facial chemicals such as sebum than spandex, covering core 12.1-48 with a fuzzy yarn such as strand 12.1-50 ensures that most of the surface facing the user is polyester and thus more durable throughout continued use. The use of drawn textured yarn for covering 12.1-50 may also increase the opacity of cover 12.1-12CC to help hide electronic components even when cover 12.1-12CC and curtain 12.1-12C are stretched and openings 12.1-64 expand.

If desired, covering strand 12.1-50 may be formed from a conductive material. Using conductive strands for covering 12.1-50 may provide a conductive layer on fabric 12.1-62 in which conductive covering strands 12.1-50 are in contact with one another across the surface of the fabric. In other configurations, strand 12.1-46 may be a polycarbonate or braided cord with an electrically conductive core. Arrangements in which strand 12.1-46 includes a multi-component yarn with different polymers joined together within each filament may also be used. When exposed to heat, the different polymers may shrink to different degrees, thereby producing a smooth helical crimp. This may provide strands 12.1-46 with texture while still allowing strands 12.1-46 to maintain durable stretch and recovery.

If desired, cover 12.1-12CC may have regions with different levels of stretch, opacity, and/or other characteristics. This type of arrangement is illustrated in FIG. 12.1-10. As shown in FIG. 12.1-10, cover 12.1-12CC may have regions with different fabric characteristics such as eye regions 12.1-54 and nose region 12.1-56. Eye regions 12.1-54 may surround left and right openings such as lens barrel openings 12.1-52 for receiving respective left and right lenses 12.1-30 of respective left and right optical modules 12.1-40. Nose region 12.1-56 may be interposed between eye regions 12.1-54 and may be configured to overlap the nose bridge of the user when device 12.1-10 is mounted on the user's head.

If desired, fabric 12.1-62 of cover 12.1-12CC may be a jacquard knit fabric that allows for different zones of fabric to have different features such as different fabric construction, different strand material(s), different stretch capabilities, different opacity levels, etc. For example, nose region 12.1-56 may be constructed to have a higher opacity and/or lower stretch capability than eye regions 12.1-54. For example, to reduce stretch in nose region 12.1-56 relative to eye regions 12.1-54, zig-zag strands 12.1-46 may be omitted from fabric 12.1-62 in region 12.1-56 and may only be present in eye regions 12.1-54. Additionally or alternatively, strands in nose region 12.1-56 may be mostly or entirely formed from less-stretchable material such as polyester instead of spandex. More textured yarns may be present in nose region 12.1-56 than in eye regions 12.1-54 to increase opacity of nose region 12.1-56 relative to eye regions 12.1-54, if desired.

FIG. 12.1-11 is a perspective view of an illustrative example in which cover 12.1-12CC is formed from three-dimensional fabric 12.1-62. Three-dimensional fabric 12.1-62 of FIG. 12.1-11 may have a fabric construction similar to a pair of pants, where fabric 12.1-62 forms left and right cylindrical portions around openings 12.1-52. Instead of being mostly flat in the z-direction, fabric 12.1-62 may have a non-zero dimension P1 in the z-direction, may have a dimension P2 in the x-direction, with openings 12.1-52 having a diameter P3 and separated by a distance P4. With this type of configuration, movement of optical modules 12.1-40 may be accommodated by moving the "legs" of fabric 12.1-62 around openings 12.1-52 towards or away from one another (e.g., moving the left and right cylindrical portions of fabric 12.1-62 relative to one another), which involves less stretching of fabric 12.1-62 and instead involves moving an entire piece of fabric 12.1-62 in a given direction. The use of three-dimensional fabric 12.1-62 of FIG. 12.1-11 is merely illustrative. If desired, cover 12.1-12CC may be formed from a mostly flat fabric 12.1-62.

In accordance with an embodiment, a fabric cover for a head-mounted device having first and second lenses is provided that includes first strands that form a warp knit layer having diamond-shaped openings, in which the warp knit layer is configured to stretch in a warp direction; second strands that are interlaced with the first strands and that zig-zag back and forth within the diamond-shaped openings, in which the second strands are configured to stretch in a weft direction; and first and second openings for receiving the respective first and second lenses.

In accordance with another embodiment, the first strands include elastic strands.

In accordance with another embodiment, the second strands include covered strands.

In accordance with another embodiment, the covered strands each include an elastic core and a covering strand.

In accordance with another embodiment, the covering strand includes a drawn textured yarn that increases an opacity within the diamond-shaped openings.

In accordance with another embodiment, the drawn textured yarn includes polyester.

In accordance with another embodiment, the elastic strands each have a first denier value and the elastic core has a second denier value that is less than the first denier value.

In accordance with another embodiment, at least some of the first strands and second strands are dyed at a polymerization level.

In accordance with another embodiment, at least some of the first strands and second strands are dyed at a fabric level.

In accordance with another embodiment, the fabric cover also includes a nose bridge region interposed between the first and second openings, in which the nose bridge region has higher opacity and lower stretch than other portions of the fabric cover.

In accordance with an embodiment, a head-mounted device is provided that includes a housing separating an interior region from an exterior region that surrounds the housing, first and second lenses in the housing that are configured to provide images respectively to first and second eye boxes, and a fabric cover configured to block the interior region from view, in which the fabric cover includes: first and second cover openings that are respectively aligned with the first and second lenses; smooth strands that stretch in a first direction; and textured strands that stretch in a second direction.

In accordance with another embodiment, the textured strands include an elastic core and a fuzzy covering.

In accordance with another embodiment, the smooth strands include warp knit strands.

In accordance with another embodiment, the warp knit strands have a higher denier value than the elastic core.

In accordance with another embodiment, the elastic core is less than 40 denier.

In accordance with another embodiment, the smooth strands form a pattern of openings and the textured strands zig-zig back and forth within the openings.

In accordance with another embodiment, the openings include diamond-shaped openings.

In accordance with another embodiment, the first direction is a warp direction and the second direction is a weft direction.

In accordance with an embodiment, a head-mounted device is provided that includes a housing, left and right lenses supported by the housing, in which the left lens is configured to provide a left image to a left eye box, in which the right lens is configured to provide a right image to a right eye box, and in which the left and right lenses are configured to move relative to each other, and a three-dimensional fabric cover that has a left cylindrical portion that is aligned with the left lens and a right cylindrical portion that is aligned with the right lens, in which the three-dimensional fabric cover is configured to block an interior region of the housing from view and in which the left and right cylindrical portions are configured to move relative to one another in response to movement of the right and left lenses to accommodate different interpupillary distances.

In accordance with another embodiment, the three-dimensional fabric cover includes a nose bridge portion coupled between the first and second cylindrical portions.

The foregoing is merely illustrative and various modifications can be made to the described embodiments. The foregoing embodiments may be implemented individually or in any combination.

12.2: Curtain Assembly

FIG. 12.2-1 illustrates a view of an example of an HMD 12.2-100 including a frame assembly 12.2-102 and first and second optical modules 12.2-104*a*, 12.2-104*b* configured to be coupled to the frame assembly 12.2-102. In at least one example, the frame assembly 12.2-102 defines a rearward facing viewing opening through which the user donning the HMD 12.2-100 can view light projected from display screens of the optical module 12.2-104*a-b*. The frame assembly 12.2-102 of the HMD 12.2-100 can define first and second apertures aligned with the first and second optical modules 12.2-104*a-b* as shown in FIG. 12.2-1 and described elsewhere herein with reference to other figures.

In at least one example, the optical modules 12.2-104*a-b* can include optical components and assemblies such as display screens, lenses, and so forth. The HMD 12.2-100 can also include a curtain assembly 12.2-106 coupled to the frame assembly 12.2-102 and extending across the viewing opening between the frame assembly 12.2-102 and the optical modules 12.2-104*a-b*, for example between the frame assembly 12.2-102 and the lenses of the optical modules 12.2-104*a-b*. The curtain assembly can include multiple components, parts, and layers, to manage airflow through the HMD 12.2-100 due to cooling systems having fans blowing air through an internal volume of the HMD 100.

Any of the features, components, and/or parts, including the arrangements and configurations thereof shown in FIG. 12.2-1 can be included, either alone or in any combination, in any of the other examples of devices, features, components, and parts shown in FIG. 12.2-2-12.2-13 and described herein. Likewise, any of the features, components, and/or parts, including the arrangements and configurations thereof shown and described with reference to FIGS. 12.2-2-12.2-13 can be included, either alone or in any combination, in the example of the devices, features, components, and parts shown in FIG. 12.2-1.

FIG. 12.2-2 shows a rear, perspective view of an HMD 12.2-200 including a frame assembly 12.2-202 defining an external surface of the device, an internal volume 12.2-208, and a rear-facing viewing opening 12.2-210, which can also be referred to as an aperture or viewing aperture. The HMD 12.2-200 also includes a display module 12.2-204 including a lens 12.2-218 through which the user can view the light projected from a display screen of the optical module 12.2-204 disposed in the internal volume 12.2-208. In at least one example, the HMD 12.2-200 also includes a curtain assembly 12.2-206 occluding the viewing opening 12.2-210 between the lens 12.2-218 and the frame assembly 12.2-202.

In at least one example, the HMD 12.2-200 can include one or more motors mechanically coupled to the optical module 12.2-204 to alter a position of the optical module 12.2-204, including the lens 12.2-218, relative to the frame assembly 12.2-202. Such motors are illustrated in other figures and described elsewhere herein. These motors can be used to adjust the optical module(s) 12.2-204 of the HMD 12.2-200 to match the interpupillary distance defined by the user's eyes. In at least one example, the curtain assembly 12.2-206 can be elastically deformable or stretchy to accommodate the different possible positions of the optical module 12.2-204, including the lens 12.2-218, such that the curtain assembly occludes the viewing aperture/opening 12.2-210 between the frame assembly 12.2-202 and the optical module(s) 12.2-204 or lens(es) 12.2-218 thereof regardless of the position or movement of the optical module 12.2-204 and lens 12.2-218.

The HMD 12.2-200 shown in FIG. 12.2-2 includes a first optical module 12.2-204 configured to align with a user's left eye but does not show a second optical module configured to align with a user's right eye so that the internal volume 12.2-208 and fan 12.2-212 can be seen. The HMD 12.2-200 can include one or more fans 12.2-212 in the internal volume. The HMD 12.2-200 can include a second fan, not seen, aligned with the optical module 12.2-204 shown. The frame assembly 12.2-202 can define one or more intake ports 12.2-214 and one or more exhaust ports 12.2-216 on an opposing side of the frame assembly 12.2-202 relative to the intake ports 12.2-214. The fan 12.2-212 can be configured to draw air into the internal volume 12.2-208 through the intake ports 12.2-214 and exhaust the air from the internal volume 12.2-208 out through the exhaust ports 12.2-216.

The fan 12.2-212 can be configured to draw air in and out of the internal volume 12.2-208 to cool various heat-generating components within the HMD 12.2-200. Such components can include processors, display screens of the optical module(s) 12.2-204, sensors, and so forth. In such an example, the curtain assembly 12.2-206 can be configured to prevent the flow of air from reaching the user's eyes when donning the HMD 12.2-200 such that the airflow through the HMD 12.2-200 does not dry the eyes out and cause discomfort.

Accordingly, in order serve the dual purpose of preventing airflow from reaching the user's eyes and maintaining an elastic, aesthetically pleasing barrier occluding the viewing aperture/opening 12.2-210, the curtain assembly 12.2-206 can include a first layer defining an external surface of the HMD 12.2-200 and a second layer defining the internal volume 12.2-208, with the first layer being elastic and the second layer being non-elastic and/or air-impermeable. In one example, the second layer can be semi-elastic, or have some elasticity, but remain air-impermeable when stretched or deformed.

Any of the features, components, and/or parts, including the arrangements and configurations thereof shown in FIG. 12.2-2 can be included, either alone or in any combination, in any of the other examples of devices, features, components, and parts shown in FIG. 12.2-1 and 12.2-3-12.2-13 and described herein. Likewise, any of the features, components, and/or parts, including the arrangements and configurations thereof shown and described with reference to FIG. 12.2-1 and 12.2-3-12.2-13 can be included, either alone or in any combination, in the example of the devices, features, components, and parts shown in FIG. 12.2-2.

FIG. 12.2-3 shows a rear, plan view of an example of an HMD 12.2-300 similar to the HMD 12.2-200 shown in FIG. 12.2-2, including a frame 12.2-302 defining an internal volume 12.2-308, viewing opening 12.2-310, intake port(s) 12.2-314, and exhaust port(s) 12.2-316. The HMD 12.2-300 can also include first and second fans **12.2-312*a*, 12.2-312*b* disposed in the internal volume 12.2-308 and drawing air through the internal volume 12.2-308 via the intake ports 12.2-314 and exhaust ports 12.2-316. FIG. 12.2-3 does not include optical modules in order to visualize the internal volume 12.2-308 and fans 12.2-312*a-b* aligned with the apertures and optical module positions. The HMD 12.2-300 can also include a curtain assembly 12.2-306 similar to the curtain assembly 12.2-206 illustrated in FIG. 12.2-2, where the curtain assembly 12.2-306 occludes the viewing opening 12.2-310 between the frame 12.2-302** and the optical modules.

Any of the features, components, and/or parts, including the arrangements and configurations thereof shown in FIG. 12.2-3 can be included, either alone or in any combination, in any of the other examples of devices, features, components, and parts shown in FIG. 12.2-1-12.2-2 and 12.2-4-12.2-13 and described herein. Likewise, any of the features, components, and/or parts, including the arrangements and configurations thereof shown and described with reference to FIG. 12.2-1-12.2-2 and 12.2-4-12.2-13 can be included, either alone or in any combination, in the example of the devices, features, components, and parts shown in FIG. 12.2-3.

FIG. 12.2-4 illustrates a side, cross-sectional view of an example of and HMD 12.2-400 donned by a user 12.2-401. The HMD 12.2-400 can include a frame, also referred to as a housing 12.2-402, defining an internal volume 12.2-408 and a fan assembly 12.2-412 disposed in the internal volume 12.2-408. The housing 12.2-402 can define an intake port 12.2-414 and an exhaust port 12.2-416 and the fan assembly 12.2-412 can be configured to draw air 12.2-424 through the intake port 12.2-414 into the internal volume and push the air 12.2-424 out from the internal volume 12.2-408 through the exhaust port 12.2-416.

In at least one example, the HMD 12.2-400 can include an optical module 12.2-404 directing light from a display screen toward the user's eye and a light seal 12.2-420 extending around a perimeter of the HMD 12.2-400 between the housing 12.2-402 and the user's face when the user 12.2-401 dons the HMD 12.2-400 as shown. In at least one example, the HMD 12.2-400 also includes a curtain assembly 12.2-406 extending between the housing 12.2-402 and the optical module 12.2-404. The curtain assembly 12.2-406 can be configured to block the air 12.2-424 from entering a space 12.2-422 between the eyes/face of the user 12.2-401, the space being defined by the user 12.2-401, the light seal 12.2-420, the optical module 12.2-404, and the curtain assembly 12.2-406.

Any of the features, components, and/or parts, including the arrangements and configurations thereof shown in FIG. 12.2-4 can be included, either alone or in any combination, in any of the other examples of devices, features, components, and parts shown in FIG. 12.2-1-12.2-3 and 12.2-5-12.2-13 and described herein. Likewise, any of the features, components, and/or parts, including the arrangements and configurations thereof shown and described with reference to FIG. 12.2-1-12.2-3 and 12.2-5-12.2-13 can be included, either alone or in any combination, in the example of the devices, features, components, and parts shown in FIG. 12.2-4.

FIG. 12.2-5 illustrates a perspective view of a curtain assembly 12.2-506 for use in HMD devices described herein. The curtain assembly 12.2-506 can define first and second apertures 12.2-526*a* and 12.2-526*b*. As noted above, examples of curtain assemblies can include multiple layers, including a first elastic layer and a second non-elastic, air-impermeable layer. For reference, FIG. 12.2-3 shows the user facing side of a curtain assembly 12.2-306 including the first, elastic layer 12.2-334. The view of FIG. 12.2-5 shows an internal side or surface of the curtain assembly 12.2-506 including a second, internal air-impermeable, layer 12.2-528 defining an internal volume of an HMD.

In at least one example, the second layer can extend between curtain trim rings 12.2-530*a* and 12.2-530*b* and a structural curtain backplate 12.2-532. The rings 12.2-530*a-b* and backplate 12.2-532 can be made of more rigid, structural material including plastics, metals, and so forth, to give structure and shape to the first and second layers of the curtain assembly 12.2-506 attached thereto.

In at least one example, the layers of the curtain assembly 12.2-506, including the second layer 12.2-528 shown in FIG. 12.2-5, can be coupled around a first perimeter edge 12.2-542 thereof to the backplate 12.2-532 and to the rings 12.2-530*a-b* and/or one or more optical assemblies at a second and third inner edges 12.2-544 of the layers forming or defining the apertures 12.2-526*a-b*, respectively.

Any of the features, components, and/or parts, including the arrangements and configurations thereof shown in FIG. 12.2-5 can be included, either alone or in any combination, in any of the other examples of devices, features, components, and parts shown in FIG. 12.2-1-12.2-4 and 12.2-6-12.2-13 and described herein. Likewise, any of the features, components, and/or parts, including the arrangements and configurations thereof shown and described with reference to FIG. 12.2-1-12.2-4 and 12.2-6-12.2-13 can be included, either alone or in any combination, in the example of the devices, features, components, and parts shown in FIG. 12.2-5.

FIG. 12.2-6 shows a view of a curtain assembly 12.2-606, which can be similar to the assembled curtain assembly 12.2-506 shown in FIG. 12.2-5. The view of FIG. 12.2-6 illustrates a curtain assembly 12.2-606 including a structural backplate 12.2-632, trim rings 12.2-630, a second air-impermeable layer 12.2-628, and a first elastic layer 12.2-634. The curtain assembly 12.2-606 can also include first adhesive portions or layers 12.2-636 disposed between and coupling the second layer 12.2-628 to the backplate 12.2-632 and the trim rings 12.2-630 and second adhesive portions or layers 12.2-638 disposed between and coupling the second layer 12.2-628 and the first layer 12.2-634. The curtain assembly can also include additional stiffener components or assemblies 12.2-640 coupled to the first layer 12.2-634.

In at least one example, the first and second layers 12.2-628, 12.2-634 are coupled together and/or to the backplate 12.2-632 and/or stiffener components 12.2-640 around a first perimeter edge of the layers 12.2-628, 12.2-634. The layers 12.2-628, 12.2-634 can also be coupled together at second edges defining the apertures at the optical modules and/or trim rings 12.2-630. In at least one example, the layers 12.2-628, 12.2-634 are fixed in position relative to one another at these edges only and are free of affixation to one another between the edges. That is, the layers 12.2-628, 12.2-634 can extend between the first and second edges (i.e., perimeter and aperture edges) free of affixation to one another. In this way, the layers 12.2-628, 12.2-634 of the curtain assembly 12.2-606 are fixed relative to each other at the edges 12.2-542, 12.2-544 but free to move relative to one another between the edges 12.2-542, 12.2-544.

In at least one example, the first, elastic layer 12.2-634 includes a woven fabric material/textile. In at least one example, the first, elastic layer 634 includes an elastic polymer material. In at least one example, the first, elastic layer 12.2-634 includes natural woven fibers. In at least one example, the first, elastic layer 12.2-634 includes synthetic woven fibers. In at least one example, the second, air-impermeable and/or non-elastic layer 12.2-628 includes plastic, or other non-elastic material configured to prevent air from passing through the curtain assembly 12.2-606.

In at least one example, the first layer 12.2-634 of the curtain assembly 12.2-606 extends between the lens and frame of an HMD, as described above, in tension. As such, as the lens is moved relative to the housing/frame of the HMD, when certain portions or areas of the first layer 12.2-634 are reduced in size or span a short distance, the portion or area of the layer 12.2-634 remains in tension to avoid wrinkling or folding during use. In at least one example, the second layer 628 of the curtain assembly 12.2-606 extends between the lens and frame of an HMD, as described above, in compression such that certain areas or portions of the second layer 12.2-628 can expand to cover a larger distance or area as the lens connected to the second edge 12.2-544 moves.

Along these lines, in at least one example, the first and second layers 12.2-634, 12.2-628 occupy the same area between the lenses and the frame of an HMD, as described above, but have different surface areas. That is, in at least one example, the first layer 12.2-634 can include a first surface area and the second layer 12.2-628 can include a second surface greater than the first surface area while the first and second layers 12.2-634, 12.2-628 extend across the same area defined between the frame/housing and the optical modules/lenses of an HMD, as shown in other figures. In this way, as the lenses are moved relative to the frame, the second layer 12.2-628, which is non-elastic, can accommodate the movement without tearing or being damaged and the first layer 12.2-634 can accommodate the movement while staying taught.

In at least one example, the second layer 12.2-632 can include one more materials, including but not limited to, acrylic copolymers, silicone, TPU silicone blends, TPU, nitrile rubber, to achieve the impermeability as well as low crinkle noises as the optical modules are adjusted. In at least one example, the second layer 12.2-632 can be thermoformed to include dimples.

In at least one example, the curtain assembly 12.2-606 can prevent dust and chemical ingress into the HMD device and reliability performance can be enhanced due to the curtain assembly 12.2-606.

Any of the features, components, and/or parts, including the arrangements and configurations thereof shown in FIG. 12.2-6 can be included, either alone or in any combination, in any of the other examples of devices, features, components, and parts shown in FIG. 12.2-1-12.2-5 and 12.2-7-12.2-13 and described herein. Likewise, any of the features, components, and/or parts, including the arrangements and configurations thereof shown and described with reference to FIG. 12.2-1-12.2-5 and 12.2-7-12.2-13 can be included, either alone or in any combination, in the example of the devices, features, components, and parts shown in FIG. 12.2-6.

FIG. 12.2-7 illustrates a plan view of an example of a curtain assembly 12.2-706 including first and second layers 12.2-734, 12.2-728, respectively, coupled to a frame or backplate 12.2-732 at an outer perimeter edge 12.2-742 and extending to inner edges **12.2-744*a*, 12.2-744*b* coupled to trim rings 12.2-730*a*, 12.2-730*b* and/or optical modules 12.2-704*a*, 12.2-704*b*, respectively. In at least one example, the first layer can extend to cover substantially all of an area between the backplate 12.2-732 and trim rings 12.2-744*a-b* coupling the layers 12.2-734, 12.2-728 to the optical modules 12.2-704*a-b*. In the plan view of FIG. 12.2-7, the second layer 12.2-728 overlies the first layer 12.2-734 such that much of the first layer 12.2-734 is not visible. However, as noted above, the first layer 12.2-734 can occlude substantially all of the aperture/opening between the lenses of the optical modules 12.2-704*a-b* and the frame or backplate 12.2-732**.

In at least one example, the second layer 12.2-728 can extend between the frame or backplate 12.2-732 and the lenses of the optical modules **12.2-704*a-b* and/or the trim rings 12.2-730*a-b* to define laterally positioned gaps 12.2-746*a* and 12.2-746*b* where the second layer 12.2-728 does not extend between the frame/backplate 12.2-732 and the lenses/optical modules 12.2-704*a-b*. In at least one example, the second layer 12.2-728 covers between about 70% and about 90% of the area between the frame/backplate 12.2-732 and the optical modules 12.2-704*a-b*/trim rings 12.2-730*a-b*. In some examples, the second layer 12.2-728 covers between about 75% and about 90% of the area, for examples between about 80% and about 85% of the area. The gaps 12.2-746*a* and 12.2-746*b* can also allow for some airflow through the curtain assembly 12.2-706** and to the user's eyes, which can keep the face and eye area of the user cool as well as provide de-fogging airflow for the screens of the displays and lenses of the HMD.

The curtain assembly 12.2-706 can define a middle portion 12.2-748 extending between the first lens or optical module **12.2-704*a* and the second lens or optical module 12.2-704*b*. The curtain assembly 12.2-706 can also define a first side portion 12.2-750 extending between the first lens or optical module 12.2-704*a* and the frame/backplate 12.2-732 and a second side portion 12.2-752 extending between the second lens or optical module 12.2-704*b* and the frame/backplate 12.2-732. In such an example, the gaps 12.2-746*a-b* can be disposed or positioned at the first and second side portions 12.2-750, 12.2-752, respectively. As such, as the lenses/optical modules 12.2-704*a-b* are moved laterally back and forth in the direction indicated by arrows 12.2-754, the absence of material of the second layer 12.2-728 at the gaps 12.2-746*a-b* can reduce forces opposing the static positioning of the optical modules 12.2-704*a-b* and/or opposing the forces of motors configured to move the optical modules 12.2-704*a-b* relative to the frame/backplate 12.2-732**, as described above.

In at least one example, the curtain assembly 12.2-706 can bias the optical modules against the guide-rods to remove slack or backlash between the components of the IPD adjustment system.

Any of the features, components, and/or parts, including the arrangements and configurations thereof shown in FIG. 12.2-7 can be included, either alone or in any combination, in any of the other examples of devices, features, components, and parts shown in FIG. 12.2-1-12.2-6 and 12.2-8-12.2-13 and described herein. Likewise, any of the features, components, and/or parts, including the arrangements and configurations thereof shown and described with reference to FIG. 12.2-1-12.2-6 and 12.2-8-12.2-13 can be included, either alone or in any combination, in the example of the devices, features, components, and parts shown in FIG. 12.2-7.

FIG. 12.2-8 illustrates a partial view of an example of a curtain assembly 12.2-806 including first and second layers 12.2-834, 12.2-828 coupled to an optical module 12.2-804. In particular, FIG. 12.2-8 shows the first and second layers 12.2-834, 12.2-828 coupled to the housing 12.2-856 of the optical module 12.2-804 coupled to a lens 12.2-818. In at least one example, the layers 12.2-834, 12.2-828 can be pressed or coupled between the housing 12.2-856 and a curtain trim ring 12.2-830 as shown. In at least one example, the layers 12.2-834, 12.2-828 can be adhered to the ring 12.2-830 and the housing 12.2-856 of the optical module 12.2-804 via opposing adhesive portions **12.2-860*a*, 12.2-860*b*. In the illustrated example, the layers 12.2-834, 12.2-828 can curve around the ring 12.2-830 and around between the ring 12.2-830 and housing 12.2-856 such that the ring 12.2-830** is hidden from view from the perspective of the user.

Any of the features, components, and/or parts, including the arrangements and configurations thereof shown in FIG. 12.2-8 can be included, either alone or in any combination, in any of the other examples of devices, features, components, and parts shown in FIG. 12.2-1-12.2-7 and 12.2-9-12.2-13 and described herein. Likewise, any of the features, components, and/or parts, including the arrangements and configurations thereof shown and described with reference to FIG. 12.2-1-12.2-7 and 12.2-9-12.2-13 can be included, either alone or in any combination, in the example of the devices, features, components, and parts shown in FIG. 12.2-8.

FIGS. 12.2-9-12.2-13 shown partial, cross-sectional views of examples of curtain assemblies. FIGS. 12.2-9-12.2-13 illustrate various examples of how various parts of the curtain assemblies can be coupled together. For example, FIG. 12.2-9 illustrates first and second layers 12.2-934, 12.2-928 of a curtain assembly 12.2-906 can be coupled to the backplate 12.2-932 with various adhesive layers and glue portions. In one example, a first adhesive layer **12.2-960*a* is disposed between and coupling a stiffener 12.2-940 and the first layer 12.2-934. The first layer 12.2-934 can include an end abutting or adjacent a sidewall 12.2-933 of the backplate 12.2-932. A second adhesive layer 12.2-960*b* can be disposed between and coupling the second layer 12.2-928 and the first layer 12.2-934. A third adhesive layer 12.2-960*c* can be disposed between and couple the second layer 12.2-928 and the backplate 12.2-932. A glue portion 12.2-961 can be disposed between and couple the first layer 12.2-934 and the backplate 12.2-932 and extend between an end of the second layer 12.2-928 and the sidewall 12.2-933**.

FIG. 12.2-10 illustrates an example of a curtain assembly 12.2-1006 including a first adhesive layer between and coupling a stiffener 12.2-1040 to the first layer 12.2-1034, a second adhesive layer 12.2-1060*b* between and coupling the first layer 12.2-1034 and the second layer 12.2-1028, and a third adhesive layer 12.2-1060*c* between and coupling the second layer 12.2-1028 and the backplate 12.2-1032. In one example, a glue portion 12.2-1061 can couple the stiffener 12.2-1040, first layer 12.2-1034, and the second layer 12.2-1028, as well as the various adhesive layers 12.2-1060*a-c*, to the backplate 12.2-1032 at the ends of the various components and layers between the sidewall 12.2-1033 and the layers 12.2-1034, 12.2-1028. In at least one example, a space remains between the glue portion 12.2-1061 and a sidewall 12.2-1033 of the backplate 12.2-1032.

FIG. 12.2-11 illustrates an example of a curtain assembly 12.2-1106 including a first adhesive layer 12.2-1160*a* between and coupling a stiffener 12.2-1140 and a first layer 12.2-1134, a second adhesive layer 12.2-1160*b* between and coupling the first layer 12.2-1134 and the second layer 12.2-1128, and a third adhesive layer 12.2-1160*c* between and coupling the second layer 12.2-1128 and the backplate 12.2-1132. An end of the first layer 12.2-1134 can abut or be disposed adjacent to a sidewall 12.2-1133 of the backplate 12.2-1132 and a glue portion 12.2-1161 can be disposed between an end of the second layer 12.2-1128 and the sidewall 12.2-1133. The glue portion 12.2-1161 can be disposed between and couple the first layer 12.2-1134 and the backplate 12.2-1132. In at least one example, the backplate 12.2-1132 can define an aperture 12.2-1162 through which the glue portion 12.2-1162 can be dispensed and at least partially disposed, as shown.

FIG. 12.2-12 illustrates an example of a curtain assembly 12.2-1206 including a first adhesive layer 12.2-1260*a* disposed between and coupling a stiffener 12.2-1240 to a first layer 12.2-1234, a second adhesive layer 12.2-1260*b* disposed between and coupling the first layer 12.2-1234 and the second layer 12.2-1228, and a third adhesive layer disposed between and coupling the second layer 12.2-1228 and the backplate 12.2-1232. In the illustrates example of FIG. 12.2-12, the first layer 12.2-1234 can curve around and be coupled to the backplate 12.2-1232 via a fourth adhesive layer 12.2-1260*d* such that a portion of the backplate is disposed between opposing portions of the first layer 1234 within the curved geometry thereof.

FIG. 12.2-13 illustrates an example of a curtain assembly 12.2-1306 including a first adhesive layer between and coupling a stiffener 12.2-1340 to the first layer 12.2-1334, a second adhesive layer 12.2-1360*b* between and coupling the first layer 12.2-1334 and the second layer 12.2-1328, and a third adhesive layer 12.2-1360*c* between and coupling the second layer 12.2-1328 and the backplate 12.2-1332. In one example, a glue portion 12.2-1361 can couple the stiffener 12.2-1340, first layer 12.2-1334, and the second layer 12.2-1328, as well as the various adhesive layers 12.2-1360*a-c*, to the backplate 12.2-1332 at the end of the various components and layers between the sidewall 12.2-1333 and the layers 12.2-1334, 12.2-1328. In at least one example, the glue portion 12.2-1361 can extend substantially all the way between the ends of the layers 12.2-1334, 12.2-1328 and a sidewall 12.2-1333 of the backplate 12.2-1332.

Any of the features, components, and/or parts, including the arrangements and configurations thereof shown in FIGS. 12.2-9-12.2-13 can be included, either alone or in any combination, in any of the other examples of devices, features, components, and parts shown in FIG. 12.2-1-12.2-8 and described herein. Likewise, any of the features, components, and/or parts, including the arrangements and configurations thereof shown and described with reference to FIG. 12.2-1-12.2-8 can be included, either alone or in any combination, in the example of the devices, features, components, and parts shown in FIGS. 12.2-9-12.2-13.

XIII: Light Seal

FIG. 13.0-1 illustrates a view of an HMD 13.0-100 including a light seal 13.0-102. The light seal 13.0-102 is described in more detail here in section XIII.

FIG. 13.0-2A illustrates a front perspective view of a device seal 13.0-202 according to one embodiment. FIG. 13.0-2B illustrates a bottom-rear perspective view of the device seal 13.0-202. FIG. 13.0-2C illustrates a rear view of the device seal 13.0-202. The device seal 13.0-202 illustrated in FIG. 13.0-2A through FIG. 13.0-2C can be substantially similar to, including some or all of the features of, the device seals or light seals described herein.

In some examples, the device seal 13.0-202 can be constructed and designed as depicted in FIG. 13.0-2A through FIG. 13.0-2C. The device seal 13.0-202 can include a facial interface 13.0-216 to contact a wearer's face. The facial interface 13.0-216 can include a compressible material, such as a foam, that is compliant and comfortable against the user's face.

The device seal 13.0-202 can include a cover 13.0-214 extending from the facial interface 13.0-216 and defining an aperture through which the user can view a display of the HMD. The cover 13.0-214 can help to block light from the outside environment. The device seal 13.0-202 can include a nose relief 13.0-215 positioned, sized, and shaped to accommodate for the user's nose. While other designs and configurations are envisions, those depicted in FIG. 13.0-2A through FIG. 13.0-2C provide the user with exceptional user experience and engagement with the HMD.

13.1: Electronic Devices with Covering Structures

Electronic devices such as head-mounted devices are configured to be worn on a head of a user. A head-mounted device may have left and right optical systems for presenting images to a user's left and right eyes. Not all users have the same physical distance separating their eyes. To accommodate differences in interpupillary distance between different users, a head-mounted device may have a mechanism for adjusting the positions of the left and right optical systems.

An electronic device such as a head-mounted device may have a front face that faces away from a user's head and may have an opposing rear face that faces the user's head. Optical modules on the rear face may be used to provide images to a user's eyes. The positions of the optical modules may be adjusted to accommodate different user interpupillary distances. Internal device structures may be hidden from view by the user by covering the rear face of the device with a curtain. The curtain, which may sometimes be referred to as a cover, covering structure, rear housing cover, rear housing wall, rear housing structure, cosmetic covering, etc., may help block potentially unsightly internal structures from view, while accommodating movement of the optical modules.

A top view of an illustrative head-mounted device with a curtain is shown in FIG. 13.1-1. As shown in FIG. 13.1-1, head-mounted devices such as electronic device 13.1-10 may have head-mounted support structures such as housing 13.1-12. Housing 13.1-12 may include portions (e.g., support structures 13.1-12T) to allow device 13.1-10 to be worn on a user's head. Support structures 13.1-12T may be formed from fabric, polymer, metal, and/or other material. Support structures 13.1-12T may form a strap or other head-mounted support structures that help support device 13.1-10 on a user's head. A main support structure (e.g., main housing portion 13.1-12M) of housing 13.1-12 may support electronic components such as displays 13.1-14. Main housing portion 13.1-12M may include housing structures formed from metal, polymer, glass, ceramic, and/or other material. For example, housing portion 13.1-12M may have housing walls on front face F and housing walls on adjacent top, bottom, left, and right side faces that are formed from rigid polymer or other rigid support structures and these rigid walls may optionally be covered with electrical components, fabric, leather, or other soft materials, etc. The walls of housing portion 13.1-12M may enclose internal components 13.1-38 in interior region 13.1-34 of device 13.1-10 and may separate interior region 13.1-34 from the environment surrounding device 13.1-10 (exterior region 13.1-36). Internal components 13.1-38 may include integrated circuits, actuators, batteries, sensors, and/or other circuits and structures for device 13.1-10. Housing 13.1-12 may be configured to be worn on a head of a user and may form glasses, a hat, a helmet, goggles, and/or other head-mounted device. Configurations in which housing 13.1-12 forms goggles may sometimes be described herein as an example.

Front face F of housing 13.1-12 may face outwardly away from a user's head and face. Opposing rear face R of housing 13.1-12 may face the user. Portions of housing 13.1-12 (e.g., portions of main housing 13.1-12M) on rear face R may form a cover such as curtain 13.1-12C. In an illustrative configuration, curtain 13.1-12C includes a fabric layer that separates interior region 13.1-34 from the exterior region to the rear of device 13.1-10. Other structures may be used in forming curtain 13.1-12C, if desired. The presence of curtain 13.1-12C on rear face R may help hide internal housing structures, internal components 13.1-38, and other structures in interior region 13.1-34 from view by a user.

Device 13.1-10 may have left and right optical modules 13.1-40. Each optical module may include a respective display 13.1-14, lens 13.1-30, and support structure 13.1-32. Support structures 13.1-32, which may sometimes be referred to as lens barrels or optical module support structures, may include hollow cylindrical structures with open ends or other supporting structures to house displays 13.1-14 and lenses 13.1-30. Support structures 13.1-32 may, for example, include a left lens barrel that supports a left display 13.1-14 and left lens 13.1-30 and a right lens barrel that supports a right display 13.1-14 and right lens 13.1-30. Displays 13.1-14 may include arrays of pixels or other display devices to produce images. Displays 13.1-14 may, for example, include organic light-emitting diode pixels formed on substrates with thin-film circuitry and/or formed on semiconductor substrates, pixels formed from crystalline semiconductor dies, liquid crystal display pixels, scanning display devices, and/or other display devices for producing images. Lenses 13.1-30 may include one or more lens elements for providing image light from displays 13.1-14 to respective eyes boxes 13.1-13. Lenses may be implemented using refractive glass lens elements, using mirror lens structures (catadioptric lenses), using holographic lenses, and/or other lens systems. When a user's eyes are located in eye boxes 13.1-13, displays (display panels) 13.1-14 operate together to form a display for device 13.1-10 (e.g., the images provided by respective left and right optical modules 13.1-40 may be viewed by the user's eyes in eye boxes 13.1-13 so that a stereoscopic image is created for the user). The left image from the left optical module fuses with the right image from a right optical module while the display is viewed by the user.

Not all users have the same interpupillary distance IPD. To provide device 13.1-10 with the ability to adjust the interpupillary spacing between modules 13.1-40 along lateral dimension X and thereby adjust the spacing IPD between eye boxes 13.1-13 to accommodate different user interpupillary distances, device 13.1-10 may be provided with actuators 13.1-42. Actuators 13.1-42 can be manually controlled and/or computer-controlled actuators (e.g., computer-controlled motors) for moving support structures 13.1-32 relative to each other.

As shown in FIG. 13.1-2, curtain 13.1-12C may cover rear face F while leaving lenses 13.1-30 of optical modules 13.1-40 uncovered (e.g., curtain 13.1-12C may have openings that are aligned with and receive modules 13.1-40). As modules 13.1-40 are moved relative to each other along dimension X to accommodate different interpupillary distances for different users, modules 13.1-40 move relative to fixed housing structures such as the walls of main portion 13.1-12M and move relative to each other. To prevent undesired wrinkling and buckling of curtain 13.1-12C as optical modules 13.1-40 are moved relative to rigid portions of housing 13.1-12M and relative to each other, a fabric layer or other cover layer in curtain 13.1-12C may be configured to slide, stretch, open/close, and/or otherwise adjust to accommodate optical module movement.

A schematic diagram of an illustrative electronic device such as a head-mounted device or other wearable device is shown in FIG. 13.1-3. Device 13.1-10 of FIG. 13.1-3 may be operated as a stand-alone device and/or the resources of device 13.1-10 may be used to communicate with external electronic equipment. As an example, communications circuitry in device 13.1-10 may be used to transmit user input information, sensor information, and/or other information to external electronic devices (e.g., wirelessly or via wired connections). Each of these external devices may include components of the type shown by device 13.1-10 of FIG. 13.1-3.

As shown in FIG. 13.1-3, a head-mounted device such as device 13.1-10 may include control circuitry 13.1-20. Control circuitry 13.1-20 may include storage and processing circuitry for supporting the operation of device 13.1-10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 13.1-20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 13.1-20 may use display(s) 13.1-14 and other output devices in providing a user with visual output and other output.

To support communications between device 13.1-10 and external equipment, control circuitry 13.1-20 may communicate using communications circuitry 13.1-22. Circuitry 13.1-22 may include antennas, radio-frequency transceiver circuitry, and other wireless communications circuitry and/or wired communications circuitry. Circuitry 13.1-22, which may sometimes be referred to as control circuitry and/or control and communications circuitry, may support bidirectional wireless communications between device 13.1-10 and external equipment (e.g., a companion device such as a computer, cellular telephone, or other electronic device, an accessory such as a point device, computer stylus, or other input device, speakers or other output devices, etc.) over a wireless link. For example, circuitry 13.1-22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link. Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 13.1-10 may, if desired, include power circuits for transmitting and/or receiving wired and/or wireless power and may include batteries or other energy storage devices. For example, device 13.1-10 may include a coil and rectifier to receive wireless power that is provided to circuitry in device 13.1-10.

Device 13.1-10 may include input-output devices such as devices 13.1-24. Input-output devices 13.1-24 may be used in gathering user input, in gathering information on the environment surrounding the user, and/or in providing a user with output. Devices 13.1-24 may include one or more displays such as display(s) 13.1-14. Display(s) 13.1-14 may include one or more display devices such as organic light-emitting diode display panels (panels with organic light-emitting diode pixels formed on polymer substrates or silicon substrates that contain pixel control circuitry), liquid crystal display panels, microelectromechanical systems displays (e.g., two-dimensional mirror arrays or scanning mirror display devices), display panels having pixel arrays formed from crystalline semiconductor light-emitting diode dies (sometimes referred to as microLEDs), and/or other display devices.

Sensors 13.1-16 in input-output devices 13.1-24 may include force sensors (e.g., strain gauges, capacitive force sensors, resistive force sensors, etc.), audio sensors such as microphones, touch and/or proximity sensors such as capacitive sensors such as a touch sensor that forms a button, trackpad, or other input device), and other sensors. If desired, sensors 13.1-16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, iris scanning sensors, retinal scanning sensors, and other biometric sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors such as blood oxygen sensors, heart rate sensors, blood flow sensors, and/or other health sensors, radio-frequency sensors, depth sensors (e.g., structured light sensors and/or depth sensors based on stereo imaging devices that capture three-dimensional images), optical sensors such as self-mixing sensors and light detection and ranging (LIDAR) sensors that gather time-of-flight measurements, humidity sensors, moisture sensors, gaze tracking sensors, electromyography sensors to sense muscle activation, facial sensors, and/or other sensors. In some arrangements, device 13.1-10 may use sensors 13.1-16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 13.1-10 may include additional components (see, e.g., other devices 13.1-18 in input-output devices 13.1-24). The additional components may include haptic output devices, actuators for moving movable housing structures, audio output devices such as speakers, light-emitting diodes for status indicators, light sources such as light-emitting diodes that illuminate portions of a housing and/or display structure, other optical output devices, and/or other circuitry for gathering input and/or providing output. Device 13.1-10 may also include a battery or other energy storage device, connector ports for supporting wired communication with ancillary equipment and for receiving wired power, and other circuitry.

FIG. 13.1-4 and 13.1-5 are top views of device 13.1-10 showing how the optical modules of device 13.1-10 move with respect to each other along lateral dimension X to accommodate different interpupillary distances IPD (the distance between a user's left and right eyes). In the example of FIG. 13.1-4, left optical module 13.1-40L and right optical module 13.1-40R have been moved towards each other to accommodate a small interpupillary distance. In the example of FIG. 13.1-5, left optical module 13.1-40L and right optical module 13.1-40R have been moved away from each other to accommodate a large interpupillary distance.

Curtain 13.1-12C has edge portions such as left portion 13.1-12C-L between left housing wall 13.1-12M-L and left optical module 13.1-40L and right portion 13.1-12C-R between right housing wall 13.1-12M-R and right optical module 13.1-40R. Middle portion 13.1-12C-M of curtain 13.1-12C extends between left optical module 13.1-40L and right optical module 13.1-40R. In the configuration of FIG. 13.1-4, optical modules 13.1-40L and 13.1-40R are relatively close to each other, so middle portion 13.1-12C-M is relatively small and portions 13.1-12C-L and 13.1-12C-R are relatively large. In the configuration of FIG. 13.1-5, optical modules 13.1-40L and 13.1-40R are relatively far from each other, so left portion 13.1-12C-L and right portion 13.1-12C-R are shorter along lateral dimension X and middle portion 13.1-12C-M has been enlarged relative to the configuration of FIG. 13.1-4.

To help accommodate differences in size for curtain 13.1-12C (e.g., length changes for portions of curtain 13.1-12M along lateral dimension X), curtain 13.1-12C may include a cover layer formed from a stretchable material such as fabric. The cover layer may be supported by a rigid frame. The fabric may be provided with a peripheral elastic band that helps allow the fabric to slide relative to the frame while being retained securely on the frame, thereby further helping curtain 13.1-12M to be dynamically adjusted without exhibiting undesired buckling and wrinkling.

FIG. 13.1-6 is a side view of device 13.1-10 showing how device 13.1-10 may, if desired, include cooling features to help cool display 13.1-14 and other internal components 13.1-38. As shown in FIG. 13.1-6, for example, device 13.1-10 may have a fan such as fan 13.1-50. Fan 13.1-50 may be mounted in housing 13.1-12 (e.g., a fan housing in housing 13.1-12, etc.) in a configuration that allows fan 13.1-50 to expel air from housing 13.1-12. To allow cool air to move past the face of the user while cooling electrical components in interior region 13.1-34 such as internal components 13.1-38 and display 13.1-14, curtain 13.1-12C may be permeable to air. Curtain 13.1-12C may, as an example, have one or more air-flow-promotion openings. In some examples, curtain 13.1-12C is formed from knit or woven fabric that has a sufficiently loose knit or weave to allow air to flow through the interstitial gaps between adjacent strands of material in the fabric (e.g., between warp and weft strands). Openings may also be formed by laser cutting and/or other opening formation techniques. In examples in which curtain 13.1-12C is permeable to air, air may flow into device 13.1-10 through curtain 13.1-12C, may flow past display 13.1-14 and other internal components 13.1-38, and may exit interior region 13.1-34 through fan 13.1-50. Air may flow in this way to cool device 13.1-10 while device 13.1-10 is being worn on a head of a user. If desired, housing 13.1-12 may have additional openings (e.g., slot shaped openings on an upper wall, side wall, and/or lower wall) that provide additional pathways for air flow.

To allow a cover layer in curtain 13.1-12C to slide back and forth during adjustments to the positions of modules 13.1-40, curtain 13.1-12C may be provided with a rigid frame that supports the cover layer without excessively restricting lateral motion of the cover layer. FIG. 13.1-7 is an exploded perspective view of a left-hand portion of an illustrative curtain. As shown in FIG. 13.1-7, curtain 13.1-12C may include frame 13.1-12CF and cover layer 13.1-12CC. Cover layer 13.1-12CC may have left and right openings such as lens barrel opening 13.1-52 to receive respective left and right optical modules 13.1-40. Frame 13.1-54 may have corresponding left and right openings such as illustrative opening 13.1-54. Opening 13.1-54 may be larger than opening 13.1-52 to accommodate lateral movement of module 13.1-40. When mounted in device 13.1-10, cover layer 13.1-12CC may be attached to frame 13.1-12CF so that cover layer 13.1-12CC can stretch and/or slide relative to frame 13.1-12CF.

If desired, cover layer 13.1-12CC may include multiple layers of material. As shown in the top view of FIG. 13.1-8, for example, cover layer 13.1-12CC may, include outer layer 13.1-56 and inner layer 13.1-58. Outer layer 13.1-56 may be, for example, a fabric layer. Inner layer 13.1-58 may be, for example, a layer of fabric formed form polymer strands that have been thermally formed into an accordion shape. In this type of arrangement, outer layer 13.1-56 may be a fabric with a desired visual appearance, whereas inner layer 13.1-58 may be a fabric or other layer that provides cover layer 13.1-12CC with a desired opacity to help block internal device components from view. Layer 13.1-12CC may be attached to module 13.1-40 using attachment structures 13.1-60. Structures 13.1-60 may include retention rings, screws and other fasteners, clips, and other structures that mechanically attach layer 13.1-12CC to support structures 13.1-32 of module 13.1-40 and/or may include adhesive for attaching layer 13.1-12CC to module 13.1-40.

If desired, layer 13.1-12CC may be provided with a peripheral elastic band. This type of arrangement is shown in FIG. 13.1-9. As shown in FIG. 13.1-9, cover layer 13.1-12CC may have fabric 13.1-62 and peripheral elastic band 13.1-64. Fabric 13.1-62 may be warp knit fabric, weft knit fabric, or other knit fabric (e.g., to promote stretchiness), may be woven fabric, braided fabric, non-woven fabric, etc. If desired, a layer of stretchy plastic may be attached to fabric 13.1-62 and/or an elastomeric polymer layer may be used in place of some or all of fabric 13.1-62 in forming layer 13.1-12CC. Fabric 13.1-62 may be formed from interlaced (intertwined) strands of material such as polymer strands, strands of cotton or other natural material, synthetic material, and/or other materials. The strands in fabric 13.1-62 may include monofilament strands and/or multi-filament strands. In some examples, some of the strands of fabric 13.1-62 may be selected to provide fabric 13.1-62 with strength, whereas other strands in fabric 13.1-62 may be formed from elastomeric material that enhances the ability of fabric 13.1-62 to stretch (and that has a lower elastic modulus than the strands that provide fabric 13.1-62 with strength). Examples of stretchable strand materials include elastomeric materials such as silicone and thermoplastic polyurethane (TPU). Examples of strength-enhancing strand materials include polyester, nylon, etc. Elastic band 13.1-64 may be formed from a strand of elastomeric material such as a strand of silicone or thermoplastic polyurethane or other stretchable material. Other materials may be used in forming the strands in fabric 13.1-62, if desired.

Elastic band 13.1-64 may be attached to along the outer edge of fabric 13.1-62 by sewing, by knitting band 13.1-64 into a knit fabric, using adhesive, using crimped connections or other fasteners, and/or by otherwise attaching band 13.1-64 to the periphery of fabric 13.1-62. If desired, band 13.1-64 may be formed from warp strands and weft strands in a woven fabric (see, e.g., band 13.1-64 of fabric 13.1-62 of FIG. 13.1-10).

The fabric or other material forming cover layer 13.1-12CC may be stretchable. As shown in FIG. 13.1-11, for example, layer 13.1-12CC may be configured to be stretched without damage from a first shape characterized by length 13.1-L1 along dimension X to a second larger shape characterized by length 13.1-L2 along dimension X. The amount of stretching (13.1-L2/13.1-L1) that layer 13.1-12CC may accommodate may be, for example, at least 50%, at least 75%, at least 100%, or at least 150%.

When attaching cover layer 13.1-12CC to frame 13.1-12CC, band 13.1-64 may fit over the outside of frame 13.1-12CC. Band 13.1-64 may then tug inwardly on the portions of cover layer 13.1-12CC that overlap the edges of the frame. This, in turn, will help to tension the main portion of layer 13.1-12CC outwardly (e.g., in lateral dimensions X and Y), thereby ensuring that cover layer 13.1-12CC will remain taut. At the same time, there may be at least some allowed lateral slippage of layer 13.1-12CC back and forth as needed to accommodate changes in the positions of modules 13.1-40.

An example shape for frame 13.1-12CF of curtain 13.1-12C is shown in FIG. 13.1-12. As shown in FIG. 13.1-12, frame 13.1-12CF may have left and right openings 13.1-54 to overlap the desired range of positions achievable by modules 13.1-40. Frame 13.1-12CF may have an outer ring-shaped portion 13.1-66 bridged in the portion of frame 13.1-12CF that overlaps the user's nose by bridging middle portion 13.1-68. Openings 13.1-54 may be rectangular, oval, teardrop shaped, circular, and/or may have other suitable shapes.

FIG. 13.1-13 shows how elastic band 13.1-64 may help provide fabric 13.1-62 of cover 13.1-12CC with the ability to slide laterally relative to frame to accommodate movement in optical modules 13.1-40 while helping to keep fabric 13.1-62 taut. Elastic band 13.1-64 is normally in a stretched state. As a result, band 13.1-64 attempts to contract and, in doing so, tends to pull fabric 13.1-62 around frame 13.1-12CF in direction 13.1-74. On the inner side of frame 13.1-12CF, the tightening force from band 13.1-64 is therefore normally pulling fabric 13.1-62 in direction 13.1-76, whereas on the opposing outer (rear-facing) side of frame 13.1-12CF, the tightening force of band 13.1-64 tends to pull fabric 13.1-62 towards the periphery of frame 13.1-12CF in direction 13.1-78. The presence of band 13.1-64 therefore helps tighten fabric 13.1-62 and prevent wrinkles in cover layer 13.1-12CC.

When it is desired to move optical module 13.1-40, fabric 13.1-62 can slide back and forth over frame 13.1-12CF as needed. Consider, as an example, a scenario in which module 13.1-40 is moved in direction 13.1-70. This pulls fabric 13.1-62 on the outer side of frame 13.1-12CF (e.g., frame portion 13.1-66) in direction 13.1-80. On the inner side of frame 13.1-12CF, the edge of fabric 13.1-62 is pulled in direction 13.1-72, causing band 13.1-64 to stretch and expand slightly (e.g., so that band 13.1-64 moves to position 13.1-64'). Due to the pull on fabric 13.1-62 in direction 13.1-80, fabric 13.1-62 slides around frame 13.1-12CF and across the outer surface of frame 13.1-12CF in direction 13.1-82, thereby helping to accommodate movement of module 13.1-40 without wrinkling cover layer 13.1-12CC.

To facilitate sliding movement of cover 13.1-12CC around the edges of frame 13.1-12CF in this way, at least the left and right edges of cover 13.1-12CC (and adjacent portions along the upper and lower edges of cover 13.1-12CC) may not be fixedly attached to frame 13.1-12CF or housing 13.1-12. An illustrative configuration for mounting curtain 13.1-12C within housing portion 13.1-12M of housing 13.1-12 of device 13.1-10 is shown in FIG. 13.1-14. In the example of FIG. 13.1-14, housing portion 13.1-12M has a central support such as housing structure 13.1-84. Curtain 13.1-12C may be fixedly attached to structure 13.1-84 using attachment mechanism 13.1-86. Mechanism 13.1-86 may include, for example, glue and/or mechanical structures that grip fabric 13.1-62 and/or other portions of curtain 13.1-12C to hold curtain 13.1-12C firmly in place within device 13.1-10. Mechanism 13.1-86 may, if desired, include engagement structures (e.g., snap features) that allow curtain 13.1-12C to be removed and replaced with another curtain. When mounted in device 13.1-10, however, mechanism 13.1-86 will hold curtain 13.1-12C securely.

As shown in FIG. 13.1-14, device 13.1-10 may, if desired, have a ring-shaped opaque light seal such as light seal 13.1-90. Light seal 13.1-90 may be configure to be removable (e.g. so that light seal 13.1-90 may be replaced when worn). Foam or other soft materials may be used in forming light seal 13.1-90.

The attachment structures used in mechanism 13.1-86 of FIG. 13.1-14 may or may not permit fabric 13.1-62 to slide freely with respect to frame 13.1-12CF. To permit fabric 13.1-62 to slide freely with respect to frame 13.1-12CF of curtain 13.1-12C elsewhere in curtain 13.1-12C (e.g., at the left and right edges of curtain 13.1-12C and at other portions of curtain 13.1-12C away from attachment mechanism 13.1-86), curtain 13.1-12C may float with respect to housing 13.1-12M (except at attachment mechanism 13.1-86). As an example, the opposing ends of curtain 13.1-12C at the left and right edges of curtain 13.1-12C may be separated from nearby portions of housing portion 13.1-12M by air gaps 13.1-88. This prevents the fabric of layer 13.1-12CC from becoming caught between frame 13.1-12CF and housing 13.1-12. FIG. 13.1-15 shows how attachment structures 13.1-86 may, if desired, be used to couple a bridging central portion of frame 13.1-12CF such as portion 13.1-68 to housing structure 13.1-84 in the center of frame 13.1-12C (e.g., along the upper and lower edges of curtain 13.1-12C).

FIG. 13.1-16 is a cross-sectional view of curtain 13.1-12C showing how attachment mechanism 13.1-86 for attaching curtain 13.1-12 to housing structure 13.1-84 may include trim member 13.1-94. Adhesive 13.1-92 may be used to attach fabric 13.1-62 and frame 13.1-12CF to trim member 13.1-94 (e.g., in the vicinity of attachment mechanism 13.1-86 in the areas of curtain 13.1-12C that overlap bridging portion 13.1-86 of frame 13.1-12CF). Trim member 13.1-94 and housing structure 13.1-84 may have mating engagement structures. For example, trim member 13.1-94 may have a snap such as snap 13.1-96 that mates with a corresponding hook such as hook 13.1-98 on housing structure 13.1-84. When it is desired to snap curtain 13.1-12C in place, curtain 13.1-12C may be pressed into housing 13.1-12M in the −Z direction. If desired, curtain 13.1-12C may be removed by disengaging (e.g., unsnapping) the engagement structures (e.g., when it is desired to remove or replace curtain 13.1-12C).

If desired, curtain 13.1-12C may be used in equipment other than devices 13.1-10. Consider, as an example, the arrangement of FIG. 13.1-17. As shown in FIG. 13.1-17, apparatus 13.1-100 may have a movable member such as movable member 13.1-102. Apparatus 13.1-100 may be, for example, a joystick or automobile stick shift and movable member 13.1-102 may be a movable shaft. Movable member 13.1-102 may move in one or more directions 13.1-104. Curtain 13.1-12C may have a cover layer 13.1-12CC formed from fabric 13.1-62 or other covering material and may have peripheral elastic band 13.1-64. Cover layer 13.1-12CC may be mounted over a frame such as frame 13.1-12CF. This allows cover layer 13.1-12CC to slip and/or stretch during movement of member 13.1-102 to help avoid wrinkling in curtain 13.1-12C.

13.2: Device with a Removable Cushion

A head-mounted device may include a head-mounted support structure that allows the device to be worn on the head of a user. The head-mounted device may have displays that are supported by the head-mounted support structure for presenting a user with visual content. The head-mounted device may also have sensors such as front-facing cameras and other sensors for gathering information on the environment surrounding the device.

The head-mounted device may include a removable cushion that is configured to be attached to the head-mounted support structure. The removable cushion may contact the user's face when the head-mounted device is worn by the user. There are many advantages to using a removable cushion of this type in the head-mounted device. Because the cushion contacts the user's face during operation, the cushion may tend to become dirty over time. If the cushion is not removable, it may be difficult to clean the cushion. However, the removable cushion is easy to remove from the head-mounted device to wash. The removable cushion is therefore easy to keep clean during repeated uses.

In addition to making the cushion easier to clean, the removability of the cushion makes the cushion easier to replace. If the cushion becomes worn down over time or damaged, the removable cushion may simply be replaced with a new removable cushion. This extends the lifetime of the head-mounted device.

The removable cushion may also be customizable. If the cushion is not removable, the properties of the cushion in the head-mounted device are fixed. With a removable cushion, an optimal removable cushion out of multiple options may be selected by a user. For example, the user may select a removable cushion with a desired color, softness, and dimensions. In this way, the user may select a custom removable cushion that is the most comfortable for them.

FIG. 13.2-1 is a top view of a head-mounted electronic device 13.2-10. As shown in FIG. 13.2-1, head-mounted device 13.2-10 may include housing 13.2-12. Housing 13.2-12 is configured to be worn on a user's head and may sometimes be referred to as a head-mounted housing or head-mounted support structure. Housing 13.2-12 may have curved head-shaped surfaces, a nose-bridge portion such as portion NB that is configured to rest on a user's nose when device 13.2-10 is on a user's head, a strap 13.2-12T for supporting device 13.2-10 on the user's head, and/or may have other features that allow device 13.2-10 to be worn by a user. Housing 13.2-12 may have walls or other structures that separate an interior region of device 13.2-10, such as interior region 13.2-42, from an exterior region surrounding device 13.2-10, such as exterior region 13.2-44. Electrical components 13.2-40 (e.g., integrated circuits, sensors, control circuitry, light-emitting diodes, lasers, and other light-emitting devices, other control circuits and input-output devices, etc.) may be mounted on printed circuits and/or other structures within device 13.2-10 (e.g., in interior region 13.2-42).

To present a user with images for viewing from eye boxes such as eye box 13.2-34, device 13.2-10 may include rear-facing displays in optical modules 13.2-16 (sometimes referred to as optical assemblies, etc.). There may be, for example, a left rear-facing display in left optical module 13.2-16L for presenting an image through a left lens to a user's left eye in a left eye box and a right rear-facing display in right optical module 13.2-16R for presenting an image through a right lens to a user's right eye in a right eye box.

The user's eyes are located in eye boxes 13.2-34 at rear side R of device 13.2-10 when inwardly facing surface 13.2-18 of housing 13.2-12 rests against the outer surface of the user's face. On rear side R, housing 13.2-12 may have cushioned structures (sometimes referred to as light seal structures) to enhance user comfort as surface 13.2-18 rests against the user's face.

Device 13.2-10 may have forward-facing components such has forward-facing cameras 13.2-20 on front side F that face outwardly away from the user. Cameras 13.2-20 may generally be oriented in the +Y direction of FIG. 13.2-1. If desired, the left-hand camera may face slightly to the left and the right-hand camera may face slightly to the right to enhance the overall coverage of cameras 13.2-20. During operation, images captured by cameras 13.2-20 (sometimes referred to as pass-through video and/or pass-through images) and/or computer-generated content such as text, graphics, etc. may be displayed for the user by displays in modules 13.2-16.

FIG. 13.2-2 is a cross-sectional top view of an optical module 13.2-16. As shown in FIG. 13.2-2, optical module 13.2-16 may include display 13.2-14 and lens 13.2-22 mounted in optical module housing 13.2-24. Display 13.2-14 presents images in eye box 13.2-34.

FIG. 13.2-3A is a cross-sectional top view of a head-mounted device 13.2-10 with a removable cushion 13.2-60 in its unattached (removed) state. As shown in FIG. 13.2-3A, head-mounted support structure 13.2-12 may include a rigid front structure 13.2-52 (sometimes referred to as front portion, rigid structure, etc.) at the front side F of the head-mounted device 13.2-10. Head-mounted support structure 13.2-12 additionally includes support posts 13.2-54 (sometimes referred to as rigid support posts, rigid sidewall portions, side portions, sidewall portions, support structures, etc.). The support structures 13.2-54 extend from the front portion 13.2-52 towards the rear side R. The support structures 13.2-54 may couple the front portion 13.2-52 to a flexible rear portion 13.2-56 (sometimes referred to as flexible structure, flexible ring, flexible light seal structure, etc.) of the head-mounted support structure 13.2-12. Interior 13.2-42 (with associated optical modules 13.2-16L/13.2-16R and other electronic components) is formed in the volume between front structure 13.2-52 and rear structure 13.2-56.

In some examples, a sidewall extending from front structure 13.2-52 in the –Y-direction may be formed continuously around the perimeter of the front structure 13.2-52. In some examples, to minimize the weight of the head-mounted support structure 13.2-12, discrete support posts 13.2-54 may be dispersed around the perimeter of the front structure 13.2-52. The support posts are each coupled between the rigid front structure 13.2-52 and the flexible rear structure 13.2-56. Air-filled gaps (or gaps filled with another desired light filler material) may separate adjacent support posts 13.2-54.

Front structure 13.2-52 may be an opaque structure that extends across the entire front side of device 13.2-10. Alternatively, front structure 13.2-52 may be a ring-shaped structure that extends in a ring around the front side of device 13.2-10. Flexible rear structure 13.2-56 may be a ring-shaped structure that extends in a ring around some or all of the rear side of device 13.2-10. Flexible rear structure 13.2-56 may be ring-shaped (with a central opening) to allow the user to view optical modules 13.2-16 while device 13.2-10 is worn by the user.

Head-mounted support structure 13.2-12 may optionally be covered on one or more sides by a textile layer 13.2-64 (sometimes referred to as fabric layer, etc.). Textile layer 13.2-64 may be formed from an opaque or light-shielding material (e.g., black yarn) or may formed from an underlying material coated with an opaque or light-shielding material (e.g., black dye or ink). The textile layer 13.2-64 may be formed by a woven fabric or a nonwoven fabric. As examples, the textile layer 13.2-64 may be formed from any suitable type of fabric such as knit fabric, woven fabric, braided fabric, etc.

In addition to head-mounted support structure 13.2-12, the head-mounted device includes a removable cushion 13.2-60 (sometimes referred to as a removable cushion member, removable foam, removable foam member, cushion, foam, etc.). Removable cushion 13.2-60 includes a cushion member 13.2-58 (sometimes referred to as cushion, cushion structure, foam member, foam structure, foam, etc.) that is optionally covered by a textile layer 13.2-62. Cushion member 13.2-58 may be formed from foam or another desired compressible material. Textile layer 13.2-62 may be formed from an opaque or light-shielding material (e.g., black yarn) or may formed from an underlying material coated with an opaque or light-shielding material (e.g., black dye or ink). The textile layer 13.2-62 may be formed by a woven fabric or a nonwoven fabric. As examples, the textile layer 13.2-62 may be formed from any suitable type of fabric such as knit fabric, woven fabric, braided fabric, etc.

The removable cushion may be attached to flexible structure 13.2-56 of head-mounted support structure 13.2-12. FIG. 13.2-3B is a cross-sectional top view of a head-mounted device 13.2-10 with a removable cushion 13.2-60 attached to an associated head-mounted support structure 13.2-12. As shown, when attached, the removable cushion 13.2-60 may be adjacent to flexible rear structure 13.2-56. Flexible structure 13.2-56 and removable cushion 13.2-60 may combine to form light seal structures 13.2-66 for the head-mounted device 13.2-10. Flexible structure 13.2-56 may therefore sometimes be referred to as a light seal structure, flexible light seal structure, non-removable light seal structure, etc. Removable cushion 13.2-60 may sometimes be referred to as a light seal structure, cushioning light seal structure, removable light seal structure, etc.

When head-mounted device 13.2-10 is worn on the head of a user, the light seal structures 13.2-66 may conform to the user's face. To provide an immersive experience to the viewer and preserve high contrast in the display viewed by the user during operation, it may be desirable to block ambient light from reaching the user's eyes. This ensures the only light viewed by the user is from the display in the head-mounted device 13.2-10. Light seal structures 13.2-66 may be sufficiently flexible and/or compressible to conform to a user's face during operation, preventing stray light from entering the head-mounted device 13.2-10.

Flexible light seal structure 13.2-56 may be formed from a flexible plastic structure. The flexible plastic structure may be sufficiently flexible to conform to the shape of a user's face when worn by the user. However, the flexible plastic structure may have sufficient rigidity to hold its shape while being worn (e.g., and does not bias towards or away from the user's face while being worn). Flexible light seal structure 13.2-56 may not be compressible (e.g., may be less compressible than cushion 13.2-60). Removable cushion 13.2-60 may also be sufficiently flexible to conform to the shape of a user's face when worn by the user. Cushion 13.2-60 may be compressible. The compressible cushion may be pressed against the user's face to form a tight light seal while still remaining comfortable for the user.

There are many advantages to using a removable cushion as shown in FIG. 13.2-3A and 13.2-3B in the head-mounted device 13.2-10 (as opposed to a permanently fixed cushion). Because the cushion 13.2-60 contacts the user's face during operation, the cushion 13.2-60 may tend to become dirty over time. If the cushion 13.2-60 is not removable, it may be difficult to clean the cushion 13.2-60. However, the removable cushion 13.2-60 is easy to remove from the head-mounted device 13.2-10 to wash. The removable cushion 13.2-60 therefore is easy to keep clean during repeated uses. The removable cushion 13.2-60 may be formed using materials that will not be damaged by water to promote easy cleaning. The removable cushion 13.2-60 may be formed using materials that dry quickly so that the removable cushion 13.2-60 is ready for use quickly after cleaning.

In addition to making the cushion 13.2-60 easier to clean, the removability of the cushion 13.2-60 makes the cushion 13.2-60 easier to replace. If the cushion 13.2-60 becomes worn down over time or damaged, the removable cushion 13.2-60 may simply be replaced with a new removable cushion 13.2-60. This extends the lifetime of the head-mounted device 13.2-10.

The removable cushion 13.2-60 may also be customizable. If the cushion 13.2-60 is not removable, the properties of the cushion in the head-mounted device 13.2-10 are fixed. With a removable cushion 13.2-60, an optimal removable cushion 13.2-60 out of multiple options may be selected by a user. For example, the user may select a removable cushion 13.2-60 with a desired color and/or dimensions. In this way, the user may select a custom removable cushion 13.2-60 that is the most comfortable for them.

There are numerous dimensions of the removable cushion 13.2-60 that may be customized for different users. One such dimension is the cushion's thickness 13.2-92 (e.g., the dimension parallel to the Y-direction) as shown in FIG. 13.2-3B. Some users may prefer a thicker cushion 13.2-60 for maximum comfort whereas other users may prefer a thinner cushion 13.2-60 for maximum comfort.

The cushion thickness 13.2-92 may also impact the eye relief of the optical system. The eye relief is defined as the distance 13.2-94 between an optical module and a respective eye box that views that optical module. The thickness 13.2-92 of the removable cushion 13.2-60 therefore influences the eye relief distance 13.2-94. A thicker removable cushion 13.2-60 will result in a larger associated eye relief distance whereas a thinner removable cushion 13.2-60 will result in a smaller associated eye relief distance.

In some examples, depending on the characteristics of a user's eye (e.g., a user's glasses prescription), a specific eye relief may be preferable. For example, a first user may not require glasses. For the first user, a first eye relief distance may be optimal. A second user may have a glasses prescription. The optical module may be customized for the user's glasses prescription (e.g., by adding removable lenses to the optical module). In this scenario, for the second user, a second eye relief distance that is different than the first eye relief distance may be optimal. In this situation, the first user may use a first removable cushion having a first thickness (that produces the first eye relief distance) whereas the second user may use a second removable cushion having a second thickness that is different than the first thickness (and that produces the second eye relief distance).

Thickness 13.2-92 may be any desired magnitude (e.g., between 1.5 millimeters and 2.5 millimeters, between 2.5 millimeters and 3.5 millimeters, between 3.5 millimeters and 4.5 millimeters, between 1 millimeter and 5 millimeters, between 1 millimeter and 10 millimeters, etc.).

The removable cushion selected by a user may therefore have a thickness 13.2-92 that is optimized for their comfort and/or optimizes eye relief distance for the system.

Instead of (or in addition to) customizing the thickness (or other dimensions) of the removable cushion, a user may customize the material of the removable cushion. For example, some users may prefer a softer foam in the removable cushion whereas other users may prefer a harder foam in the removable cushion. Different options for the removable cushions may therefore have the same dimensions but be formed from different materials.

FIG. 13.2-4 is a perspective view of head-mounted support structure 13.2-12 (without the removable cushion 13.2-60). As shown, front structure 13.2-52 covers the entire front side of the head-mounted device 13.2-10 (e.g., front structure 13.2-52 does not have a central opening). In contrast, flexible rear structure 13.2-56 is ring-shaped with a central opening (e.g., the flexible rear structure 13.2-56 defines a central opening). The user may view optical modules 13.2-16 through the central opening while using the head-mounted device. As shown in FIG. 13.2-4, support posts 13.2-54 connect the flexible rear structure 13.2-56 to rigid front structure 13.2-52. Interior volume 13.2-42 (with associated optical modules 13.2-16 and other electronic components) is formed between front structure 13.2-52 and rear structure 13.2-56. Any desired number of support structures may be included in the device. The support structures may be distributed around the periphery of the device to ensure that the central opening with optical modules 13.2-16 is not blocked.

Each support structure may optionally be attached to the flexible structure 13.2-56 using a pivoting portion with a spherical joint. The spherical joint may allow for the flexible structure 13.2-56 to be pressed against the user's face at any desired angle, allowing the flexible structure 13.2-56 to conform to the user's face as much as possible (promoting a tight light seal).

It should be noted that head-mounted support structure 13.2-12 in FIG. 13.2-4 may also be covered by textile layer 13.2-64, similar to as shown and discussed in connection with FIG. 13.2-3A. The textile layer is omitted from FIG. 13.2-4 so as to not obfuscate the drawing.

FIG. 13.2-5A is a rear view of flexible structure 13.2-56. As shown, flexible structure 13.2-56 may have a ring-shape that extends partially or completely in a ring around a central opening 13.2-70. The flexible structure 13.2-56 may have a gap along the lower edge to accommodate the nose of the user during operation. If desired, an optional nasal-region-mounted structure 13.2-72 that is configured to rest on the nose of a user may bridge the gap between the first and second ends of the flexible structure. Structure 13.2-72 may conform to the facial topology of the user around the nasal region and block light from entering the head-mounted device during operation. Alternatively, nasal-region-mounted structure 13.2-72 may be omitted and flexible structure 13.2-56 may form a complete ring around the central opening such that a portion of the flexible structure 13.2-56 rests on the nose of the user during operation of the head-mounted device 13.2-10.

The flexible structure 13.2-56 be attached to support posts 13.2-54 at various points around the flexible structure. FIG. 13.2-5A shows an example where four support posts 13.2-54 are coupled to the flexible structure. As previously mentioned, each support post may be coupled to the flexible structure with a spherical joint to accommodate the different curvatures of different users' faces.

FIG. 13.2-5B is a rear view of removable cushion 13.2-60. As shown, removable cushion 13.2-60 may have a ring-shape that extends partially or completely in a ring around a central opening 13.2-74. The cushion 13.2-60 may have a gap along the lower edge to accommodate the nose of the user during operation. If desired, an optional nasal-region-mounted structure 13.2-76 that is configured to rest on the nose of a user may bridge the gap between the first and second ends of the removable cushion. Structure 13.2-76 may conform to the facial topology of the user around the nasal region and block light from entering the head-mounted device during operation. Alternatively, nasal-region-mounted structure 13.2-76 may be omitted and cushion 13.2-60 may form a complete ring around the central opening such that a portion of the cushion 13.2-60 rests on the nose of the user during operation of the head-mounted device.

Although it is generally desirable for cushion 13.2-60 to be compressible (for user comfort and a tight light seal), cushion 13.2-60 may include one or more high-rigidity portions 13.2-60-1. The high-rigidity portions 13.2-60-1 may provide sufficient structural integrity to prevent cushion 13.2-60 from being totally compressed. This may, for example, prevent a user's face from striking internal electronic components of the head-mounted device and/or flexible structure 13.2-56 during an impact event. High-rigidity portions 13.2-60-1 are distributed across cushion 13.2-60. Low-rigidity portions 13.2-60-2 are interposed in the remaining areas of the cushion (e.g., between each adjacent pair of high-rigidity portions 13.2-60-1).

The high-rigidity portions 13.2-60-1 have a greater rigidity and a lower compressibility than low-rigidity portions 13.2-60-2. The high-rigidity portions 13.2-60-1 may be formed from a different material than low-rigidity portions 13.2-60-2. In other words, cushion structure 13.2-58 (see FIGS. 13.2-3A and 13.2-3B) includes high-rigidity portions 13.2-60-1 formed from a first material and low-rigidity portions 13.2-60-2 formed from a second material that is different than the first material. As another example, the entire cushion structure 13.2-58 may be formed from the same base material. However, high-rigidity portions 13.2-60-1 may include an additive (e.g., a second material) that increases rigidity relative to low-rigidity portions 13.2-60-2.

As shown in FIG. 13.2-5B, the cushion 13.2-60 may have approximately the same footprint as flexible rear structure 13.2-56 from FIG. 13.2-5A (when viewed from the rear). Additionally, high-rigidity portions 13.2-60-1 may be positioned to overlap support posts 13.2-54 (in the Y-direction) when the removable cushion 13.2-60 is attached to flexible rear structure 13.2-56. In other words, each high-rigidity portion 13.2-60-1 is aligned (in the Y-direction) with a respective portion of flexible structure 13.2-56 that is attached to a support post. Each high-rigidity portion 13.2-60-1 is therefore aligned (in the Y-direction) with a respective support post. This type of arrangement may ensure that the high-rigidity portions 13.2-60-1 provide the target structural integrity for cushion 13.2-60 while minimizing detectability to the user. The presence of support posts 13.2-54 make flexible structure 13.2-56 more rigid in these locations. Therefore, positioning high-rigidity portions 13.2-60-1 in the same location consolidates the high-rigidity portions.

FIG. 13.2-5B shows another dimension 13.2-96 of the removable cushion that may be customized. Dimension 13.2-96 may be referred to as the height (e.g., in the Z-direction) of the cushion along an upper edge of the cushion. The upper edge of the cushion may be adjacent to the user's forehead during use and may therefore sometimes be referred to as a forehead portion of the cushion. Some users may prefer a larger upper-edge height 13.2-96 than others for maximum comfort. A user may therefore select a removable cushion 13.2-60 that has an optimal upper-hedge height 13.2-96 for their needs. Height 13.2-96 may be greater than 3 millimeters, greater than 5 millimeters, greater than 10 millimeters, greater than 15 millimeters, greater than 20 millimeters, greater than 30 millimeters, greater than 50 millimeters, less than 3 millimeters, less than 5 millimeters, less than 10 millimeters, less than 15 millimeters, less than 20 millimeters, less than 30 millimeters, less than 50 millimeters, between 5 millimeters and 30 millimeters, etc.

Dimension 13.2-98 (as shown in FIG. 13.2-5B) may also be customized. Dimension 13.2-98 may be referred to as the total height (e.g., in the Z-direction) of the cushion. The total height may influence factors such as the separation between the upper edge of the cushion and a user's eyebrow. Some users may prefer greater separation between the upper edge of the cushion and the user's eyebrow than others for maximum comfort. A user may therefore select a removable cushion 13.2-60 that has an optimal height 13.2-98 for their needs. Height 13.2-98 may be greater than 5 centimeters, greater than 8 centimeters, greater than 10 centimeters, greater than 15 centimeters, greater than 20 centimeters, less than 8 centimeters, less than 10 centimeters, less than 15 centimeters, less than 20 centimeters, between 5 centimeters and 15 centimeters, etc.

Head-mounted support structure 13.2-12 and/or removable cushion 13.2-60 may include attachment structures that are used to secure removable cushion 13.2-60 to the head-mounted support structure. FIG. 13.2-6A is a rear view of flexible rear structure 13.2-56 (of head-mounted support structure 13.2-12) showing how the flexible rear structure may include one or more primary attachment structures 13.2-82P and, optionally, one or more auxiliary attachment structures 13.2-82A. FIG. 13.2-6B is a rear view of removable cushion 13.2-60 showing how the removable cushion may include one or more primary attachment structures 13.2-84P and, optionally, one or more auxiliary attachment structures 13.2-84A.

Each primary attachment structure 13.2-82P in flexible rear structure 13.2-56 may be configured to attach to a corresponding primary attachment structure 13.2-84P in removable cushion 13.2-60. Similarly, each auxiliary attachment structure 13.2-82A in flexible rear structure 13.2-56 may be configured to attach to a corresponding auxiliary attachment structure 13.2-84A in removable cushion 13.2-60. As shown in FIG. 13.2-6A, each primary attachment structure 13.2-82P in flexible rear structure 13.2-56 may align in the Y-direction with a corresponding primary attachment structure 13.2-84P in removable cushion 13.2-60 and each auxiliary attachment structure 13.2-82A in flexible rear structure 13.2-56 may align in the Y-direction with a corresponding auxiliary attachment structure 13.2-84A in removable cushion 13.2-60.

A wide range of attachment structures may be used for attachment structures 13.2-82P, 13.2-84P, 13.2-82A, and 13.2-84A. The attachment structures may include protrusions, recesses, grooves, posts, magnets, flexible fabric, hooks, loops, snaps, buttons, suction cups, a draw string, a zipper, adhesive (e.g., tape), a flexible band, or any other desired type of attachment structure.

As some specific examples of possible attachment structures, primary attachment structures 13.2-82P on flexible structure 13.2-56 may be protrusions that are configured to mate (interlock) with corresponding recesses (13.2-84P) on cushion 13.2-60. Primary attachment structures 13.2-82P on flexible structure 13.2-56 may be magnets (e.g., permanent magnets) that are configured to magnetically couple with corresponding magnets (13.2-84P) on cushion 13.2-60. Primary attachment structures 13.2-82P and 13.2-84P may form hook-and-loop fasteners (e.g., with hooks on structures 13.2-56 and loops on cushion 13.2-60 or vice versa). Primary attachment structures 13.2-82P and 13.2-84P may form snap fasteners. The first halves of the snaps may be formed on structures 13.2-56 and may have recesses and the second halves of the snaps may be formed on cushion 13.2-60 and may have protrusions with grooves that snap into place when pressed into the recesses (or vice versa). As yet another example, primary attachment structures 13.2-82P on flexible structure 13.2-56 may be grooves that are configured to mate (interlock) with corresponding posts (13.2-84P) on cushion 13.2-60. As yet another example, primary attachment structures 13.2-82P on flexible structure 13.2-56 may be posts. Cushion 13.2-60 may have a layer (ring) of flexible fabric that is configured to be stretched around the posts. As yet another example, rear flexible structure 13.2-56 may include an attached fabric channel. The removable cushion is then placed in the fabric channel during operation.

The specific example of a locations for primary attachment structures 13.2-82P and 13.2-84P in FIG. 13.2-6A and 13.2-6B are merely illustrative. In general, primary attachment structures may be included at any desired locations.

The primary attachment structures may be the primary mechanism by which the removable cushion is secured onto the head-mounted support structure. However, in order to provide additional attachment strength and/or to ensure a tight light seal, auxiliary attachment structures 13.2-82A and 13.2-84A may also be included. As shown in FIG. 13.2-6B, auxiliary attachment structures 13.2-82A and 13.2-84A may be included along the left and right edges of the rear flexible structure and removable cushion. The rear flexible structure and removable cushion may commonly have high degrees of curvature in these areas when the head-mounted device is in operation (due to the curvature of the user's face). These high degrees of curvature may make the cushion and rear flexible structure susceptible to light leakage (e.g., through a gap between the cushion and rear flexible structure when the cushion and rear flexible structure are bent to conform to the user's face). The auxiliary attachment structures 13.2-82A and 13.2-84A in these high-risk areas may ensure a tight seal around the entire perimeter of the removable cushion and the rear flexible structure. The specific example of a locations for auxiliary attachment structures 13.2-82A and 13.2-84A in FIGS. 13.2-6A and 13.2-6B are merely illustrative. In general, auxiliary attachment structures may be included at any desired locations (e.g., adjacent/between any desired primary attachment structures).

Auxiliary attachment structures 13.2-82A and 13.2-84A may form hook-and-loop fasteners (e.g., with hooks on structures 13.2-56 and loops on cushion 13.2-60 or vice versa). Auxiliary attachment structures 13.2-82A and 13.2-84A may alternatively form snap fasteners. The first halves of the snaps may be formed on structures 13.2-56 and may have recesses and the second halves of the snaps may be formed on cushion 13.2-60 and may have protrusions with grooves that snap into place when pressed into the recesses (or vice versa). In general, any of the aforementioned attachment structures may be used for the auxiliary attachment structures.

If desired, multiple types of attachment structures may be used at each attachment point to ensure a secure attachment between the removable cushion 13.2-60 and the head-mounted support structure 13.2-12. FIG. 13.2-7 is a cross-sectional top view of an illustrative head-mounted device showing how protrusions, recesses, and magnets may be used to secure the removable cushion 13.2-60 to head-mounted support structure 13.2-12. As shown in FIG. 13.2-7, protrusions 13.2-82P-2 extend from flexible rear structure 13.2-56 in the −Y-direction (e.g., towards the removable cushion 13.2-60). Removable cushion 13.2-60 has corresponding recesses 13.2-84P-2. Each recess 13.2-84P-2 may mate with a corresponding protrusion 13.2-82P-2.

In addition to the protrusions and recesses, magnets are also used as attachment structures for the head-mounted device. As shown in FIG. 13.2-7, magnets 13.2-82P-1 may be embedded in protrusions 13.2-82P-2. A single magnet may be embedded in each protrusion or multiple magnets may be embedded in each protrusion. A corresponding magnet 13.2-84P-1 may be formed in cushion structure 13.2-58 adjacent to each respective recess 13.2-84P-2. When removable structure 13.2-60 is attached to the head-mounted support structure, protrusions 13.2-82P-2 extend into and mate with recesses 13.2-84P-2. When the protrusions 13.2-82P-2 and recesses 13.2-84P-2 are mated, magnets 13.2-82P-1 will also be magnetically coupled to magnets 13.2-84P-1. This provides additional security for the removable cushion attachment and prevents gravity from causing the removable cushion to fall off of the head-mounted support structure.

The example of FIG. 13.2-7 is merely illustrative. In addition to the primary attachment structures of protrusions, recesses, and magnets, auxiliary attachment structures such as snaps or hook-and-loop fasteners may also be included to secure the removable cushion to head-mounted support structure 13.2-12 and ensure a tight light seal.

In some examples, protrusions 13.2-82P-2 may be formed integrally with rear flexible structure 13.2-56 or may be formed from a separate material that is attached to rear flexible structure 13.2-56. Alternatively, in the arrangement of FIG. 13.2-7, the protrusions 13.2-82P-2 are formed integrally with support posts 13.2-54. In other words, portions of support posts 13.2-54 extend through openings in rear flexible structure 13.2-56 to form attachment structures 13.2-82P-2. The support posts 13.2-54 may also extend through openings in textile layer 13.2-64 (which covers head-mounted support structure 13.2-12). In this away, the support post protrusions 13.2-82P-2 serve as a visual indicator to a user that the head-mounted support structure is not yet attached to a removable cushion. The support post protrusions 13.2-82P-2 also provide recognizable alignment markers that allow the user to easily align and attach the removable cushion to the head-mounted support structure.

FIG. 13.2-8 is a rear view of an illustrative removable cushion 13.2-60. As shown in FIG. 13.2-8, the removable cushion may have one or more incorporated hinge structures 13.2-86. The hinge structures 13.2-86 may be formed by a highly flexible portion of the cushion member. Alternatively, the foldable portions 13.2-86 may be formed by a post that is formed separately from the cushion member. Hinge structures 13.2-86 allow for rotation of portions of the cushion member relative to other portions of the cushion member. Each hinge structure 13.2-86 may allow for rotation of the cushion member around a respective bend axis 13.2-88. The presence of hinge structures 13.2-86 may therefore allow for the cushion member to be folded to have a smaller footprint than in the unfolded state, increasing the portability of the cushion member.

In one possible arrangement, each hinge structure 13.2-86 may be formed by a post that allows rotation of adjacent cushion portions relative to each other. The post may optionally double as an attachment structure for attaching the removable cushion to the head-mounted support structure. For example, the head-mounted support structure may have a groove and the post (which defines a hinge structure for the cushion) slides into the groove to attach the removable cushion to the head-mounted support structure.

The example of two hinge structures being included in the removable cushion is merely illustrative. In general, any desired number of hinge structures may be included in the removable cushion.

FIG. 13.2-9 is a schematic diagram of a system 13.2-200 that includes a head-mounted support structure 13.2-12 (with optical modules 13.2-16L/13.2-16R and other associated electronics at its interior) and numerous removable cushions 13.2-60. As previously shown and discussed, one of the removable cushions may be attached to the head-mounted support structure to form a head-mounted device 13.2-10 with an attached cushion.

System 13.2-200 may include any desired number of removable cushions 13.2-60-1 through 13.2-60-N having different properties. As previously discussed, the varying properties of the removable cushions may include color, thickness, upper-edge height, total height, any other desired dimension, the softness of the material, or any other desired characteristic.

As specific examples, a user may select a removable cushion having a desired color out of many color options. A user may select a removable cushion having a thickness that optimizes the optical properties (e.g., eye relief) of the head-mounted device. A user may select a removable cushion having a desired upper-edge height to maximize their comfort when wearing the head-mounted device.

System 13.2-200 may include any desired number removable cushions, each with a unique set of properties. As one example, a user may purchase a head-mounted device and receive the head-mounted support structure and multiple removable cushions having various sizes (e.g., thicknesses and/or total heights). The multiple removable cushions may include a small removable cushion, a medium removable cushion that is larger in at least one dimension than the small removable cushion, and a large removable cushion that is larger than the medium removable cushion in at least one dimension. The user may attach their preferred removable cushion to the head-mounted support structure before using the head-mounted device.

As another example, a user may select their preferred removable cushion (e.g., preferred color, size, etc.) when purchasing a head-mounted device. The user receives their preferred removable cushion in addition to the head-mounted support structure and may attach their preferred removable cushion to the head-mounted support structure before using the head-mounted device. The removable cushion may then repeatedly be removed and washed during the lifetime of the head-mounted device.

In accordance with some examples, a head-mounted device is provided that includes a head-mounted support structure including a rigid structure, a flexible structure, and support structures that couple the flexible structure to the rigid structure, the flexible structure at least partially defines a central opening, left and right optical assemblies configured to display images, the left and right optical assemblies are coupled to the head-mounted support structure, and a removable cushion that is configured to be selectively attached to the flexible structure, the removable cushion at least partially surrounds the central opening.

In accordance with some examples, the left and right optical assemblies are viewable through the central opening, the head-mounted support structure is covered by a first textile layer, the removable cushion is covered by a second textile layer, the removable cushion has first portions having a first rigidity and second portions having a second rigidity, the removable cushion has recesses and first magnets, at least one of the first magnets is adjacent to each recess, and the head-mounted support structure includes protrusions at the flexible structure that extend away from the rigid structure, each protrusion is configured to mate with a respective recess of the removable cushion when the removable cushion is attached to the flexible structure, and second magnets, at least one of the second magnets is positioned in each protrusion and the first magnets are configured to magnetically couple to the second magnets when the removable cushion is attached to the flexible structure.

In some examples, the left and right optical assemblies are viewable through the central opening. In some examples the head-mounted support structure is covered by a textile layer. In some examples, the support structures are configured to protrude past the flexible structure and through openings in the textile layer. In some examples, the removable cushion has recesses that are configured to receive the protruding portions of the support structures when the removable cushion is attached to the flexible structure. In some examples, first magnets are formed in the removable cushion adjacent to the recesses, second magnets are formed in protruding portions of the support structures, and the first magnets are configured to magnetically couple to the second magnets when the removable cushion is attached to the flexible structure.

In accordance with some examples, the flexible structure includes a first auxiliary attachment structure between first and second protruding portions, the removable cushion includes a second auxiliary attachment structure between first and second recesses, and the first auxiliary attachment structure is configured to couple to the second auxiliary attachment structure when the removable cushion is attached to the flexible structure. In some examples, the first and second auxiliary attachment structures include a hook-and-loop fastener. In some examples, the removable cushion includes a cushion that is covered by a textile layer.

In accordance with some examples, first magnets are formed in the removable cushion, second magnets are formed in the head-mounted support structure, and the first magnets are configured to magnetically couple to the second magnets when the removable cushion is attached to the flexible structure. In some examples, the removable cushion has first portions having a first rigidity and second portions having a second rigidity that is lower than the first rigidity. In some examples, each one of the first portions is aligned with a respective support structure. In some examples, the removable cushion includes a hinge structure that allows a first portion of the removable cushion to rotate relative to a second portion of the removable cushion.

In accordance with some examples, a head-mounted device is provided that includes a head-mounted support structure including a flexible portion that is configured to conform to a face when the head-mounted support structure is worn, a rigid portion that is separated from the flexible portion by a gap, side portions that bridge the gap between the rigid portion and the flexible portion, and protrusions at the flexible portion that extend away from the rigid portion, and a first set of magnets, each one of the first set of magnets is positioned in a respective one of the protrusions, and a removable cushion that is configured to be selectively attached to the flexible portion, the removable cushion is configured to conform to and directly contact the face when the head-mounted support structure is worn while the removable cushion is attached and the removable cushion includes recesses that are configured to mate with the protrusions of the head-mounted support structure, and a second set of magnets that is configured to magnetically couple to the first set of magnets. In some examples, the head-mounted support structure is covered by a textile layer and the protrusions extend through openings in the textile layer. In some examples, the protrusions are formed by the side portions. In some examples, the head-mounted device includes left and right optical assemblies configured to display images, the left and right optical assemblies are formed in an interior volume of the head-mounted support structure.

In accordance with some examples, a system is provided that includes a head-mounted support structure, left and right optical assemblies configured to display images, the left and right optical assemblies are coupled to the head-mounted support structure, and a plurality of removable cushions, each one of the removable cushions is configured to be selectively attached to the head-mounted support structure and each one of the plurality of removable cushions has a property that is unique relative to that property in the remaining removable cushions. In some examples, the property includes a property selected from the group consisting of a color, a thickness, a cushion material, a total height, and an upper-edge height.

13.3: Electronic Devices with Light-Blocking Fabrics

An electronic device, such as a head-mounted device, may have a front face that faces away from a user's head and may have an opposing rear face that faces the user's head. The head-mounted device may include a main housing portion with displays that display images and optical modules through which the images are viewable from eye boxes. A face frame that is coupled to the main housing portion may form a light seal around the eye boxes. The light seal may include one or more fabric layers such as knit fabric layers. The light seal may include inner and outer fabric layers, a face portion that rests against the user's face, and a nose bridge portion that accommodates the user's nose. The outer fabric layer may be a seamless tube of knit fabric that forms an outermost layer of the light seal. The inner fabric layer may be a light-blocking fabric that lines the inner surface of the seamless tube of knit fabric. The knit fabric may have a modified bird's eye pattern that incorporates knit stitches and tuck stitches. The tuck stitches may provide the fabric with additional lengthwise stretch so that the light seal fabric does not buckle when the head-mounted device is placed on the user's head. The tuck stitches also allow for strands of different colors to be visible on the outer surface of the light seal.

The light-blocking fabric may include a dark-colored weft knit layer facing the eye box, a light-colored weft knit layer facing the seamless tube of knit fabric, and a middle layer joining the light-colored weft knit layer and the dark-colored weft knit layer. The light-colored weft knit layer may match a color of the seamless tube of knit fabric. The dark-colored weft knit layer may ensure sufficient opacity without being visible through the seamless tube of knit fabric.

A top view of an illustrative head-mounted device that may include a fabric light seal is shown in FIG. 13.3-1. As shown in FIG. 13.3-1, head-mounted devices such as electronic device 13.3-10 may have head-mounted support structures such as housing 13.3-12. Housing 13.3-12 may include portions (e.g., support structures 13.3-12T) to allow device 13.3-10 to be worn on a user's head. Support structures 13.3-12T (sometimes referred to as temple housing structures or temple housing portions) may be formed from fabric, polymer, metal, and/or other material. Support structures 13.3-12T may form a strap or other head-mounted support structures that help support device 13.3-10 on a user's head. Some or all of temple housing portions 13.3-12T may overlap a user's temples when device 13.3-10 is worn on the user's head. A main support structure (e.g., main housing portion 13.3-12M) of housing 13.3-12 may support electronic components such as displays 13.3-14. Main housing portion 13.3-12M may include housing structures formed from metal, polymer, glass, ceramic, and/or other material. For example, housing portion 13.3-12M may have housing walls on front face F and housing walls on adjacent top, bottom, left, and right side faces that are formed from rigid polymer or other rigid support structures and these rigid walls may optionally be covered with electrical components, fabric, leather, or other soft materials, etc. The walls of housing portion 13.3-12M may enclose internal components 13.3-38 in interior region 13.3-34 of device 13.3-10 and may separate interior region 13.3-34 from the environment surrounding device 13.3-10 (exterior region 13.3-36). Internal components 13.3-38 may include integrated circuits, actuators, batteries, sensors, and/or other circuits and structures for device 13.3-10. Housing 13.3-12 may be configured to be worn on a head of a user and may form glasses, a hat, a helmet, goggles, and/or other head-mounted device. Configurations in which housing 13.3-12 forms goggles may sometimes be described herein as an example.

Front face F of housing 13.3-12 may face outwardly away from a user's head and face. Opposing rear face R of housing 13.3-12 may face the user. Portions of housing 13.3-12 (e.g., portions of main housing 13.3-12M) on rear face R may form a cover such as curtain 13.3-12C. In some examples, curtain 13.3-12C includes a fabric layer that separates interior region 13.3-34 from the exterior region to the rear of device 13.3-10. Other structures may be used in forming curtain 13.3-12C, if desired. The presence of curtain 13.3-12C on rear face R may help hide internal housing structures, internal components 13.3-38, and other structures in interior region 13.3-34 from view by a user.

Device 13.3-10 may have left and right optical modules 13.3-40. Each optical module may include a respective display 13.3-14, lens 13.3-30, and support structure 13.3-32. Support structures 13.3-32, which may sometimes be referred to as lens barrels or optical module support structures, may include hollow cylindrical structures with open ends or other supporting structures to house displays 13.3-14 and lenses 13.3-30. Support structures 13.3-32 may, for example, include a left lens barrel that supports a left display 13.3-14 and left lens 13.3-30 and a right lens barrel that supports a right display 13.3-14 and right lens 13.3-30. Displays 13.3-14 may include arrays of pixels or other display devices to produce images. Displays 13.3-14 may, for example, include organic light-emitting diode pixels formed on substrates with thin-film circuitry and/or formed on semiconductor substrates, pixels formed from crystalline semiconductor dies, liquid crystal display pixels, scanning display devices, and/or other display devices for producing images. Lenses 13.3-30 may include one or more lens elements for providing image light from displays 13.3-14 to respective eyes boxes 13.3-13. Lenses may be implemented using refractive glass lens elements, using mirror lens structures (catadioptric lenses), using holographic lenses, and/or other lens systems. When a user's eyes are located in eye boxes 13.3-13, displays (display panels) 13.3-14 operate together to form a display for device 13.3-10 (e.g., the images provided by respective left and right optical modules 13.3-40 may be viewed by the user's eyes in eye boxes 13.3-13 so that a stereoscopic image is created for the user). The left image from the left optical module fuses with the right image from a right optical module while the display is viewed by the user.

Not all users have the same interpupillary distance P. To provide device 13.3-10 with the ability to adjust the interpupillary spacing between modules 13.3-40 along lateral dimension X and thereby adjust the spacing P between eye boxes 13.3-13 to accommodate different user interpupillary distances, device 13.3-10 may be provided with one or more actuators 13.3-42. Actuators 13.3-42 can be manually controlled and/or computer-controlled actuators (e.g., computer-controlled motors) for moving support structures 13.3-32 relative to each other.

As shown in FIG. 13.3-2, curtain 13.3-12C may cover rear face F while leaving lenses 13.3-30 of optical modules 13.3-40 uncovered (e.g., curtain 13.3-12C may have openings that are aligned with and receive modules 13.3-40). As modules 13.3-40 are moved relative to each other along dimension X to accommodate different interpupillary distances for different users, modules 13.3-40 move relative to fixed housing structures such as the walls of main portion 13.3-12M and move relative to each other. To prevent undesired wrinkling and buckling of curtain 13.3-12C as optical modules 13.3-40 are moved relative to rigid portions of housing 13.3-12M and relative to each other, a fabric layer or other cover layer in curtain 13.3-12C may be configured to slide, stretch, open/close, and/or otherwise adjust to accommodate optical module movement.

A schematic diagram of an illustrative electronic device such as a head-mounted device or other wearable device is shown in FIG. 13.3-3. Device 13.3-10 of FIG. 13.3-3 may be operated as a stand-alone device and/or the resources of device 13.3-10 may be used to communicate with external electronic equipment. As an example, communications circuitry in device 13.3-10 may be used to transmit user input information, sensor information, and/or other information to external electronic devices (e.g., wirelessly or via wired connections). Each of these external devices may include components of the type shown by device 13.3-10 of FIG. 13.3-3.

As shown in FIG. 13.3-3, a head-mounted device such as device 13.3-10 may include control circuitry 13.3-20. Control circuitry 13.3-20 may include storage and processing circuitry for supporting the operation of device 13.3-10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 13.3-20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 13.3-20 may use display(s) 13.3-14 and other output devices in providing a user with visual output and other output.

To support communications between device 13.3-10 and external equipment, control circuitry 13.3-20 may communicate using communications circuitry 13.3-22. Circuitry 13.3-22 may include antennas, radio-frequency transceiver circuitry, and other wireless communications circuitry and/or wired communications circuitry. Circuitry 13.3-22, which may sometimes be referred to as control circuitry and/or control and communications circuitry, may support bidirectional wireless communications between device 13.3-10 and external equipment (e.g., a companion device such as a computer, cellular telephone, or other electronic device, an accessory such as a point device, computer stylus, or other input device, speakers or other output devices, etc.) over a wireless link. For example, circuitry 13.3-22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link. Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 13.3-10 may, if desired, include power circuits for transmitting and/or receiving wired and/or wireless power and may include batteries or other energy storage devices. For example, device 13.3-10 may include a coil and rectifier to receive wireless power that is provided to circuitry in device 13.3-10.

Device 13.3-10 may include input-output devices such as devices 13.3-24. Input-output devices 13.3-24 may be used in gathering user input, in gathering information on the environment surrounding the user, and/or in providing a user with output. Devices 13.3-24 may include one or more displays such as display(s) 13.3-14. Display(s) 13.3-14 may include one or more display devices such as organic light-emitting diode display panels (panels with organic light-emitting diode pixels formed on polymer substrates or silicon substrates that contain pixel control circuitry), liquid crystal display panels, microelectromechanical systems displays (e.g., two-dimensional mirror arrays or scanning mirror display devices), display panels having pixel arrays formed from crystalline semiconductor light-emitting diode dies (sometimes referred to as microLEDs), and/or other display devices.

Sensors 13.3-16 in input-output devices 13.3-24 may include force sensors (e.g., strain gauges, capacitive force sensors, resistive force sensors, etc.), audio sensors such as microphones, touch and/or proximity sensors such as capacitive sensors such as a touch sensor that forms a button, trackpad, or other input device), and other sensors. If desired, sensors 13.3-16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, iris scanning sensors, retinal scanning sensors, and other biometric sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors such as blood oxygen sensors, heart rate sensors, blood flow sensors, and/or other health sensors, radio-frequency sensors, depth sensors (e.g., structured light sensors and/or depth sensors based on stereo imaging devices that capture three-dimensional images), optical sensors such as self-mixing sensors and light detection and ranging (LIDAR) sensors that gather time-of-flight measurements, humidity sensors, moisture sensors, gaze tracking sensors, electromyography sensors to sense muscle activation, facial sensors, and/or other sensors. In some arrangements, device 13.3-10 may use sensors 13.3-16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 13.3-10 may include additional components (see, e.g., other devices 13.3-18 in input-output devices 13.3-24). The additional components may include haptic output devices, actuators for moving movable housing structures, audio output devices such as speakers, light-emitting diodes for status indicators, light sources such as light-emitting diodes that illuminate portions of a housing and/or display structure, other optical output devices, and/or other circuitry for gathering input and/or providing output. Device 13.3-10 may also include a battery or other energy storage device, connector ports for supporting wired communication with ancillary equipment and for receiving wired power, and other circuitry.

FIG. 13.3-4 is a perspective view of device 13.3-10 showing how a face frame may form a light seal around eye boxes 13.3-13 (FIG. 13.3-1) to help prevent outside light from leaking into the viewing area of head-mounted device 13.3-10. As shown in FIG. 13.3-4, device 13.3-10 may include main housing portion 13.3-12M which is configured to be mounted on a user's head. To help block outside light (e.g., ambient light in the user's environment that is not emitted by displays 13.3-14 of device 13.3-10) from entering the viewing area of head-mounted device 13.3-10 where eye boxes 13.3-13 are located, a light seal such as light seal 13.3-52 may be formed between main housing portion 13.3-12M and the user's face. For example, light seal 13.3-52 may extend between main housing portion 13.3-12M and temple housing portions 13.3-12T (FIG. 13.3-1) to help prevent light from entering any gaps between device 13.3-10 and the user's face.

Light seal 13.3-52 (sometimes referred to as face frame 13.3-52) may include one or more rigid structures such as a rigid internal frame member or other stiff structure and one or more flexible materials such as fabric, foam, polymer, or other suitable materials. For example, light seal 13.3-52 may include a ring-shaped or horseshoe-shaped frame that surrounds eye boxes 13.3-13 (FIG. 13.3-1) and that is covered by one or more layers of fabric. As shown in FIG. 13.3-4, light seal 13.3-52 may include one or more different fabric layers such as outer fabric layer 13.3-72, inner fabric layer 13.3-58, nose bridge fabric 13.3-60, and face fabric 13.3-56. Face fabric 13.3-56 may rest against the user's face when device 13.3-10 is worn on the user's head. Face fabric 13.3-56 may include one or more layers of foam covered in one or more layers of fabric (e.g., a warp knit fabric, a weft knit fabric, a spacer fabric, a woven fabric, and/or any other suitable fabric). Nose bridge fabric 13.3-60 may be formed from a stretchable textile to accommodate different nose shapes.

Outer fabric layer 13.3-72 may be a seamless tube of fabric that loops around the optical axes A of lenses 13.3-30 of optical modules 13.3-40. The optical axis A of each lens 13.3-30 extends parallel to the Y-direction of FIG. 13.3-4. The lengthwise direction L of outer fabric layer 13.3-72 may extend parallel to the optical axes A of lens 13.3-30 (and thus parallel to the Y-axis of FIG. 13.3-4), whereas the widthwise direction W of outer fabric layer 13.3-72 may extend perpendicular to the optical axes A of lens 13.3-30 of optical modules 13.3-40. In a weft knit fabric, the rows of loops (referred to as courses) extend in the width direction W, while the columns of loops (referred to as wales) extend in the length direction L.

Outer fabric layer 13.3-72 may form an outermost surface of device 13.3-10, if desired. Outer layer 13.3-72 may be formed from fabric such as knit fabric (e.g., warp knit fabric, weft knit fabric, etc.), woven fabric, spacer fabric (e.g., inner and outer knit layers separated by a gap and joined by a spacer layer such as a monofilament strand), braided fabric, and/or any other suitable fabric. In some examples, outer fabric layer 13.3-72 is a stretchable, seamless tube of weft knit fabric having a bird's eye pattern or other suitable two-color pattern (as an example). Arrangements in which outer layer 13.3-72 is formed from non-fabric materials such as polymer, silicone, or elastomer may also be used. Arrangements in which outer fabric layer 13.4-72 of light seal 13.4-52 is formed from a stretchable fabric are sometimes described herein as an example.

If desired, outer fabric layer 13.3-72 may be formed from weft knit fabric with a bird's eye pattern that uses two types of strands such as strands with a first property (e.g., a first color, material, fuzziness, denier, elasticity, etc.) and strands with a second property (e.g., a second color, material, fuzziness, denier, elasticity, etc.). The two types of strands may be visible on the outer surface of outer fabric layer 13.3-72 to provide the outer surface of outer fabric layer 13.3-72 with color variation, material variation, texture variation, etc. For example, the color variation on the outer surface of outer fabric layer 13.3-72 may form a checker pattern, a stripe pattern, a diamond pattern, a grid pattern, a dot pattern, or any other suitable pattern alternating between a first color and a second color (e.g., black and white, white and grey, grey and black, etc.).

If care is not taken, outer fabric layer 13.3-72 may not have sufficient stretch in the length direction L, which in turn may cause outer fabric layer 13.3-72 to buckle (e.g., wrinkle) when face seal 13.3-52 is pressed against the user's face. To avoid buckling in outer fabric layer 13.3-72, outer fabric layer 13.3-72 may incorporate one or more tuck stitches. The tuck stitches may be used in place of miss stitches (sometimes referred to as float stitches) to add stretch in length direction L. Tuck stitches allow outer fabric layer 13.3-72 to have a bird's eye pattern (to allow for color variation across the outer surface of outer fabric layer 13.3-72) while providing additional stretch in lengthwise direction L of outer fabric layer 13.3-72.

Inner fabric layer 13.3-58 may be a light-blocking fabric that lines the interior surface of outer fabric layer 13.3-72 of light seal 13.3-52. Inner fabric layer 13.3-58 may be formed from one or more opaque (e.g., black) fabric layers. Inner fabric layer 13.3-58 may include one or more layers of knit fabric, warp knit fabric, weft knit fabric, woven fabric, spacer fabric, braided fabric, and/or any other suitable type of fabric. It may be desirable to use dark-colored fabric for inner fabric layer 13.3-58 to help keep the viewing area around eye boxes 13.3-13 sufficiently dark while the user is viewing images on displays 13.3-14 of device 13.3-10. If care is not taken, however, the dark color of inner fabric layer 13.3-58 may be visible through outer fabric layer 13.3-72. If outer fabric layer 13.3-72 is a light color such as white or gray and inner fabric layer 13.3-58 is a dark color such as black, for example, the black color of inner fabric layer 13.3-58 may be visible through openings or gaps between strands in outer fabric layer 13.3-72, which may be visually distracting. If inner fabric layer 13.3-58 is instead made from a light-colored fabric such as white or gray, inner fabric layer 13.3-58 may not be as visible through outer fabric layer 13.3-72, but the opacity of inner fabric layer 13.3-58 may be reduced, which can lead to an unsatisfactory viewing experience if care is not taken.

To prevent inner fabric layer 13.3-58 from being overly visible through outer fabric layer 13.3-72 without compromising opacity, inner fabric layer 13.3-58 may include one or more dark-colored inner fabric layers on the viewing side (e.g., facing eye boxes 13.3-13 and lenses 13.3-30 of optical modules 13.3-40) and one or more light-colored outer fabric layers on the non-viewing side (e.g., facing outer fabric layer 13.3-72). The dark-colored inner fabric layer of inner fabric layer 13.3-58 may be black, dark gray, or other suitable dark color, whereas the light-colored outer fabric layer of inner fabric layer 13.3-58 may be white, gray, light gray, cream, off-white, or other suitable light color. The dark inner layer and light outer layer of inner fabric layer 13.3-58 may be weft knit layers that are coupled by a middle spacer layer, if desired. For example, a spacer layer formed from a multi-filament or monofilament strand may be used to join the dark inner layer and light outer layer of inner fabric layer 13.3-58. The spacer layer may be a drawn textured yarn with a low denier value such as 20D or other suitable denier value to ensure that the spacer layer has sufficient density to block outside light from entering the viewing area. If desired, strands that make up inner fabric layer 13.3-58 may be extruded, solution-dyed strands with high texture and high stretch, thereby increasing the shrinkage and opacity of inner fabric layer 13.3-58.

A knitting machine or other equipment may be used in forming fabric for device 13.3-10 such as inner fabric layer 13.3-58. FIG. 13.3-5A is a schematic diagram of an illustrative knitting system. As shown in FIG. 13.3-5A, strand source 13.3-66 in knitting system 13.3-64 may be used in supplying strands 13.3-68 to guide and needle structures 13.3-70. Structures 13.3-70 may include strand guide structures (e.g., a system of movable guide bars with eyelets that guide strands 13.3-68) and needle systems (e.g., needle guide systems that guide sets of individually adjustable needles so that the needles may interact with the strands dispensed by the guide bars). During operations, a controller may control electrically adjustable positioners in system 13.3-64 to manipulate the positions of guide bars and needles in system 13.3-64 and thereby knit strands 13.3-68 into fabric 13.3-58. Take down 13.3-74 (e.g., a pair of mating rollers or other equipment forming a takedown system) may be used to gather fabric 13.3-58 that is produced during knitting.

A knitting machine or other equipment may be used in forming fabric for device 13.4-10 such as outer fabric layer 13.4-72. FIG. 13.3-5B is a schematic diagram of an illustrative knitting system. As shown in FIG. 13.3-5B, strand source 13.4-66 in knitting system 13.4-64 may be used in supplying strands 13.4-68 to guide and needle structures 13.4-70. Structures 13.4-70 may include strand guide structures (e.g., a system of movable guide bars with eyelets that guide strands 13.4-68) and needle systems (e.g., needle guide systems that guide sets of individually adjustable needles so that the needles may interact with the strands dispensed by the guide bars). During operations, a controller may control electrically adjustable positioners in system 13.4-64 to manipulate the positions of guide bars and needles in system 13.4-64 and thereby knit strands 13.4-68 into fabric 13.4-72. Take down 13.4-74 (e.g., a pair of mating rollers or other equipment forming a takedown system) may be used to gather fabric 13.4-72 that is produced during knitting.

FIG. 13.3-6 is a diagram of a layer of a weft knit fabric that may be included in inner fabric layer 13.3-58. Knit fabric such as fabric 13.3-58 may be made up of courses 13.3-78 (e.g., rows of loops formed by strands 13.3-68) and wales 13.3-76 (e.g., columns of loops formed by strands 13.3-68). In a weft knit fabric of the type shown in FIG. 13.3-6 (sometimes referred to as a flat knit fabric), strands 13.3-68 form loops that extend horizontally across the fabric. An illustrative strand 13.3-68' among strands 13.3-68 has been highlighted to show the horizontal path taken by each strand 13.3-68 in fabric 13.3-72. In contrast, a warp knit fabric includes wales 13.3-76 formed from strands 13.3-68 that follow zig-zag paths vertically down the fabric.

A cross-sectional side view of a portion of light seal 13.3-52 of device 13.3-10 is illustrated in FIG. 13.3-7. As shown in FIG. 13.3-7, light seal 13.3-52 may include inner fabric layer 13.3-58 and outer fabric layer 13.3-72. Outer fabric layer 13.3-72 may form an outermost surface of light seal 13.3-52 and may be viewed in direction 13.3-82 by an outside viewer such as viewer 13.3-80. Inner fabric layer 13.3-58 may line the inner surface of outer fabric layer 13.3-72 and may face towards eye boxes such as eye box 13.3-13. When device 13.3-10 is placed on a user's head, the user's eyes may be located in eye boxes such as eye box 13.3-13.

Inner fabric layer 13.3-58 may have inner and outer fabric layers such as light-colored outer fabric layer 13.3-58L and dark-colored inner fabric layer 13.3-58D coupled by a spacer layer such as spacer layer 13.3-58M. Light-colored outer fabric layer 13.3-58L may be white, off-white, cream, gray, light gray, or other suitable light color. Light-colored outer fabric layer 13.3-58L may, for example, match a color of outer fabric layer 13.3-72. Dark-colored inner fabric layer 13.3-58D may be black, dark gray, dark blue, or other suitable dark color. Dark-colored inner fabric layer 13.3-58D and light-colored outer fabric layer 13.3-58L may be weft knit layers (e.g., of the type shown in FIG. 13.3-6), and may be formed from strands 13.3-68 (e.g., drawn textured yarns) having a denier value of 40D (or two-ply 20D strands) or other suitable denier value.

Spacer layer 13.3-58M (sometimes referred to as middle layer, etc.) may be formed from one or more multifilament strands 13.3-68 with a low denier value such as 20D, 25D, or other suitable denier value. Spacer layer 13.3-58M may be formed from black strands, white strands, gray strands, or strands of any other suitable color. By selecting strands 13.3-68 for spacer layer 13.3-58M that have half the denier value of strands 13.3-68 of light-colored inner fabric layer 13.3-58L and dark-colored fabric layer 13.3-58D, fabric 13.3-58 may appear truly white (or other suitable light color) when viewed in direction 13.3-82) and may appear truly black (or other suitable dark color) when viewed from eye box 13.3-13), regardless of the color of spacer layer 13.3-58M.

Strands in light-colored inner fabric layer 13.3-58L, dark-colored outer fabric layer 13.3-58D, and spacer layer 13.3-58M may be formed from materials such as nylon, polyester, elastic material such as spandex, or other suitable materials. In general, nylon is bulkier than polyester due to less intermingling points and intermingling intensity among individual filaments. If polyester strands are used, the polyester may be modified to reduce intermingling between filaments such that the filaments in each polyester strand spread out more and thus block more light.

Inner fabric layer 13.3-58 may be formed using a circular knitting machine. The circular knitting machine may have a high gauge such as 80 gauge or other suitable gauge to ensure a higher number of strands per inch in the fabric. The higher number of strands per inch in fabric 13.3-58, the higher the opacity will be. For example, fabric 13.3-58 may have more than 80 strands per inch, more than 90 strands per inch, more than 100 strands per inch, less than 100 strands per inch, or other suitable density of strands 13.3-68. Additionally, fabric 13.3-58 may include stretchable strands (e.g., strands formed from spandex or other elastic material) to add shrinkage to fabric 13.3-58 and further increase the opacity of light seal 13.3-52. Fabric 13.3-58 may be heat set at a low heat setting (or not heat set at all) to help maintain opacity and stretch.

FIG. 13.3-8 is a perspective view of inner fabric layer 13.3-58. As shown in FIG. 13.3-8, inner fabric layer 13.3-58 may include dark-colored inner fabric layer 13.3-58D facing eye box 13.3-13 and light-colored outer fabric layer 13.3-58L facing outside viewers such as viewer 13.3-80 viewing light seal 13.3-52 in direction 13.3-82. Spacer layer 13.3-58M may include one or more multifilament strands such as multifilament strand 13.3-68M coupled between dark-colored inner fabric layer 13.3-58D and light-colored outer fabric layer 13.3-58L. Spacer layer 13.3-58M may be a low denier yarn (e.g., 20D, 25D, or other suitable denier value) to increase fabric density and minimize the gap G between dark-colored inner fabric layer 13.3-58D and light-colored outer fabric layer 13.3-58L.

Strands 13.3-68D of dark-colored inner fabric layer 13.3-58D and strands 13.3-68L of light-colored outer fabric layer 13.3-58L may have twice the denier value of spacer strand 13.3-68M (e.g., strands 13.3-68M may have a denier value of 20D, whereas strands 13.3-68D and 13.3-68L may have a denier value of 40D or may be two-ply strands with each ply having a denier value of 20D) such that fabric 13.3-58 appears truly white (or other light color) when viewed in direction 13.3-82 by viewer 13.3-80 and truly black (or other dark color) when viewed from eye box 13.3-13. In general, strands 13.3-68L, 13.3-68D, and 13.3-68M may be formed from any suitable material, such as nylon, polyester, and spandex or other elastic material, etc. If desired, strands 13.3-68D and 13.3-68L may be two-ply strands that each include an elastic strand having a denier value of 20D and a polyester strand having a denier value of 20D.

FIG. 13.3-9 is a cross-sectional side view of light seal 13.3-52 in an example in which outer fabric layer 13.3-72 has been omitted. With this type of arrangement, light-colored outer fabric layer 13.3-58L may form the outermost surface of light seal 13.3-52 and may be viewed directly by viewer 13.3-80 in direction 13.3-82. Due to the presence of middle layer 13.3-58M, dark-colored fabric 13.3-58D may not be viewable through light-colored outer fabric layer 13.3-58L. In other words, fabric layer 13.3-58 may appear truly white (or other light color) when viewed in direction 13.3-82 and truly black (or other dark color) when viewed from eye box 13.3-13.

13.4: Electronic Devices with Stretchable Fabrics

FIGS. 13.4-6, 13.4-7, and 13.4-8 show illustrative types of stitches that may be incorporated into fabric 13.4-72 to adjust the amount of stretch in the fabric.

In the example of FIG. 13.4-6, fabric 13.4-72 is a weft knit fabric made up of courses 13.4-78 (e.g., rows of loops formed by strands 13.4-68) and wales 13.4-76 (e.g., columns of loops formed by strands 13.4-68). In a weft knit fabric of the type shown in FIG. 13.4-6 (sometimes referred to as a flat knit fabric), strands 13.4-68 form loops that extend horizontally across the fabric. An illustrative strand 13.4-68' among strands 13.4-68 has been highlighted to show the horizontal path taken by each strand 13.4-68 in fabric 13.4-72. In contrast, a warp knit fabric includes wales 13.4-76 formed from strands 13.4-68 that follow zig-zag paths vertically down the fabric.

The example of FIG. 13.4-6 shows courses (rows) 13.4-78 that are made up entirely of knit stitches. This is sometimes referred to as a plain jersey or single jersey fabric. If desired, color variations may be incorporated into fabric 13.4-72 by incorporating miss stitches and/or float stitches. A miss stitch is illustrated in FIG. 13.4-7.

As shown in FIG. 13.4-7, fabric 13.4-72 may include courses 13.4-78 such as first course 13.4-78-1, second course 13.4-78-2, third course 13.4-78-3, and fourth course 13.4-78-4. First course 13.4-78-1, third course 13.4-78-3, and fourth course 13.4-78-4 each include a series of knit stitches 13.4-80. The legs of each knit stitch loop are connected to the head of the previous loop in the previous course. Second course 13.4-78-2 incorporates miss stitch 13.4-84. To create a miss stitch such as miss stitch 13.4-84 during knitting, a given strand is not collected by a needle, which causes the strand to float behind the needle while remaining connected to the loops on either side of miss stitch 13.4-84. If the strands of courses 13.4-78 include different colors, miss stitch 13.4-84 will create a dual color pattern on each side of the fabric.

If desired, outer fabric layer 13.4-72 may have a bird's eye pattern that incorporates alternating knit stitches 13.4-80 and miss stitches 13.4-84. For example, outer fabric layer 13.4-72 may have a four row repeat pattern. In the first and second rows, the odd-numbered wales 13.4-76 may be knit stitches 13.4-80, while the even-numbered wales 13.4-76 may be tuck stitches 13.4-84. In the third and fourth rows, the odd-numbered wales 13.4-76 may be tuck stitches 13.4-84, while the even-numbered wales 13.4-76 maybe knit stitches 13.4-80. This pattern may repeat to create a two-color bird's eye pattern on the outer surface of outer fabric layer 13.4-72.

As shown in FIG. 13.4-7, miss stitches 13.4-84 extend in the width direction W of fabric 13.4-72 and float horizontally across the fabric. If additional stretch is desired in lengthwise direction L of fabric 13.4-72, some or all of the miss stitches 13.4-84 may be replaced by tuck stitches. This type of arrangement is illustrated in FIG. 13.4-8.

As shown in FIG. 13.4-8, fabric 13.4-72 may include courses 13.4-78 such as first course 13.4-78-1, second course 13.4-78-2, and third course 13.4-78-3. First course 13.4-78-1, second course 13.4-78-2, and third course 13.4-78-3 may each include alternating knit stitches 13.4-80 and tuck stitches 13.4-82. Tuck stitches 13.4-82 may be created by placing two strands 13.4-68 on a single needle, thereby tucking the extra strand 13.4-68 behind the first strand 13.4-68. The legs of tuck stitch 13.4-82 are not connected to the head of the previous loop. For example, as shown in FIG. 13.4-8, the legs of each tuck stitch 13.4-82 in course 13.4-78-3 are not connected to head 13.4-84 of the previous loop in course 13.4-78-2.

If desired, outer fabric layer 13.4-72 may have a bird's eye pattern that incorporates alternating knit stitches 13.4-80 and tuck stitches 13.4-82. For example, outer fabric layer 13.4-72 may have a four-row-repeat-pattern of the type shown in FIG. 13.4-9.

As shown in FIG. 13.4-9, the odd numbered wales of the first course may be tuck stitches 13.4-82 (represented as a "V" in FIG. 13.4-9), whereas the even numbered wales of the first course may be knit stitches 13.4-80 (represented as an "O" in FIG. 13.4-9). The second course may be all knit stitches 13.4-80. The odd numbered wales of the third course may be knit stitches 13.4-80, whereas the even numbered wales of the second course may be tuck stitches 13.4-82. The fourth course may be all knit stitches 13.4-80. This pattern may repeat to create a two-color modified bird's eye pattern on the outer surface of outer fabric layer 13.4-72.

The incorporation of tuck stitches 13.4-82 provides additional stretch in the lengthwise direction L because tuck stitches 13.4-82 have strand segments that extend in the L direction to form the tuck stitch. The longer stitch length in length direction L from incorporating one or more tuck stitches 13.4-82 allows the seamless tube of fabric 13.4-72 to stretch and shrink in direction L without buckling or wrinkling when device 13.4-10 is placed on the user's head and light seal 13.4-52 is pressed against the user's face. If desired, strands 13.4-68 of fabric 13.4-72 may include strands of first and second colors to create a two-color pattern on the outside of light seal 13.4-52. This is merely illustrative, however. If desired, more than two colors may be used or strands 13.4-68 may have other distinct properties (e.g., different deniers, different amounts of fuzziness, different textures, different diameters, different materials, etc.).

If desired, fabric 13.4-72 may be placed in boiling water after fabric 13.4-72 is formed. The post-processing step of boiling fabric 13.4-72 may cause additional shrinkage in the length direction L of fabric 13.4-72, which in turn reduces the tendency of light seal 13.4-52 to buckle when pressed against the user's face. The boiling step may, for example, result in more shrinkage in length direction L of fabric 13.4-72 than in width direction W of fabric 13.4-72. Additionally, the increased stretch in the length direction L of modified bird's eye fabric 13.4-72 results in greater frame mobility and deflection (e.g., light seal 13.4-52 may be more mobile and deflect more easily when covered by fabric 13.4-72 having increased lengthwise stretch), which can significantly increase user comfort.

The pattern of FIGS. 13.4-8 and 13.4-9 is merely illustrative. If desired, fabric 13.4-72 may include both miss stitches 13.4-84 and tuck stitches 13.4-82, depending on the amount of stretch desired in length direction L. For example, if more or maximum stretch in lengthwise direction L is desired, fabric 13.4-72 may be free of miss stitches 13.4-84 and may follow the four-row-repeat-pattern of FIG. 13.4-9.

13.5: Contactless Sensors for a Head-Mountable Device

The following disclosure relates to a facial interface in a head-mountable device. More particularly, the present embodiments relate to a facial interface that contains sensorally transparent materials for head-mountable devices used for AR/VR experiences. These facial interfaces can enable sensors to interact with a user through sensorally transparent materials. As used herein, the term "sensorally transparent materials" include materials that allow for the transfer of sensor signals therethrough.

In one example, the head-mountable device of the present disclosure includes a display and a light seal portion (hereafter "light seal"). Light seals enable a user to experience a light shielded environment, where outside ambient light and possibly other environmental items, are blocked form the user field of view. The shielded environment allows for better user interaction and a more immersive experience. The light seal, as a facial interface, can be customized to a user's facial profile such that the light seal physically interacts with the user's face to fit snugly on or around the forehead, eyes, nose, and other features or bones, such as the maxilla regions, that can vary user to user. Additionally, a light seal can include components connecting the display to the facial interface, such as a webbing, housing or a frame positioned between the display and facial interface.

Conventional light seals of conventional head-mountable devices are passive and do not include a facial interface with sensorally transparent materials. Indeed, passive light seals create a light shielded environment, but do not include active component integration to enable contactless readings from sensors embedded in a facial interface. Therefore, conventional light seals do not provide contactless readings of a user via sensorally transparent materials and sensors.

By contrast, a light seal of the present disclosure includes a facial interface with sensorally transparent materials for active component integration. A light seal with active components has advantages over a traditional passive light seal. A light seal with sensorally transparent materials can include active components that can monitor user responses without direct contact, lending to improved user comfort while wearing the head-mountable device. Sensors configured in this contactless manner can also avoid biological ingress from user skin (e.g., lotion, makeup, sunscreen, etc.). A head-mountable device that monitors such user responses can also create a highly customized user experience (unlike the sensors of conventional head-mountable devices that are "blind" to the user experience).

Sensors can be important for creating a customized user experience. An active light seal can contain sensors to measure a user's response or engagement via indicators, such as core body temperature, sweat, heart rate, electrical signals from the heart (e.g., ECG, EKG, EXG, etc.), brain activity (e.g., EEG signals, frontal lobe activity), etc. Additionally, the sensor data can be used as feedback data, for example, to monitor user fatigue or obtain activity-specific metrics.

Sensors of the present disclosure can be implemented on or within a facial interface in myriad different ways. For example, a sensor can be oriented towards a user and positioned on a facial interface surface opposite of the surface that contacts a user. In another example, a sensor can be oriented towards a user and embedded inside the facial interface. In these or other examples, the sensor can include a field of view that projects towards a user and through at least a portion of the facial interface. Thus, such portions of the facial interface can be sensorally transparent to allow the sensor to obtain a sensor reading through at least a portion of the facial interface.

Sensors can also be implemented in different ways for different facial interfaces. That is, the head-mountable device of the present disclosure can implement a facial interface with a base layer and an interchangeable layer. The interchangeable layer can be exchanged or swapped out for a different interchangeable layer. In some examples, the different interchangeable layer can correspond to a different user activity, such as a yoga activity versus a movie-watching activity. In certain implementations, the yoga interchangeable layer can include a different sensor arrangement than the movie-watching interchangeable layer (e.g., for obtaining different, activity-specific metrics).

These and other embodiments are discussed below with reference to FIGS. 13.5-1-13.5-7B. However, those skilled in the art will readily appreciate that the detailed description given herein with respect to these figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 13.5-1 illustrates a top view profile of a head-mountable device 13.5-100 worn on a user head. The head-mountable device 13.5-100 can include a display 13.5-102 (e.g., one or more optical lenses or display screens in front of the eyes of the user). The display 13.5-102 can include a display for presenting an augmented reality visualization, a virtual reality visualization, or other suitable visualization.

The head-mountable device 13.5-100 also includes a facial interface 13.5-103 and a sensor 13.5-108 positioned (e.g., attached to or embedded within) on the facial interface 13.5-103. As used herein, the terms "facial interface" or "engagement interface" refer to a portion of the head mountable device 13.5-100 that engages a user face via direct contact. In particular, a facial interface includes portions of the head-mountable device 13.5-100 that conform to (e.g., compress against) regions of a user face. To illustrate, a facial interface can include a pliant (or semi-pliant) face-track that spans the forehead, wraps around the eyes, contacts the zygoma and maxilla regions of the face, and bridges the nose. In addition, a facial interface can include various components forming a structure, webbing, cover, fabric, or frame of a head-mountable device disposed between the display 13.5-102 and the user skin. In particular implementations, a facial interface can include a seal (e.g., a light seal, environment seal, dust seal, air seal, etc.). It will be appreciated that the term "seal" can include partial seals or inhibitors, in addition to complete seals (e.g., a partial light seal where some ambient light is blocked and a complete light seal where all ambient light is blocked when the head-mountable device is donned).

In addition, the term "sensor" refers to one or more different sensing devices, such as a camera or imaging device, temperature device, oxygen device, movement device, brain activity device, sweat gland activity device, breathing activity device, muscle contraction device, etc. Some particular examples of sensors include an electrooculography sensor, electrocardiogra sensor, EKG sensor, heart rate variability sensor, blood volume pulse sensor, SpO2 sensor, compact pressure sensor, electromyography sensor, core-body temperature sensor, galvanic skin sensor, accelerometer, gyroscope, magnetometer, inclinometer, barometer, infrared sensor, global positioning system sensor, etc.

In one example, the head mountable device 13.5-100 includes a sensor controller 13.5-104. The sensor controller 13.5-104 can include a processor (e.g., a system on chip, integrated circuit, driver, microcontroller, application processor, crossover processor, etc.). Further the sensor controller 13.5-104 can include one or more memory devices (e.g., individual nonvolatile memory, processor-embedded nonvolatile memory, random access memory, memory integrated circuits, DRAM chips, stacked memory modules, storage devices, memory partitions, etc.). In certain implementations, the sensor controller 13.5-104 is positioned within one or both arms 13.5-105, 13.5-106 of the head-mountable device 13.5-100 (e.g., for integration with an HMD processor/memory component). In alternative implementations, the sensor controller 13.5-104 is physically integrated within the sensors 13.5-108 themselves.

The sensor controller 13.5-104 can perform myriad different functions. For example, the memory device can store computer-executable instructions that, when executed by the processor, cause the sensor controller 13.5-104 to receive sensor data from the sensors 13.5-108 and transmit a signal based on the sensor data. For instance, the sensor controller 13.5-104 can transmit a sensor signal to the display 13.5-102. In response to the sensor signal, the display 13.5-102 can power off, present a digital notification (e.g., user-generated notification, push notification, context-generated notification, system-generated notification, smart notification, etc.), or render at least one of an avatar or an avatar emotional response. As used herein, the term "avatar" is a visual representation of a person for use in digital context, such as with the head mountable device 13.5-100. An avatar can include animated characters, animals, objects, emojis, etc. that can depict human emotion (e.g., as detected via the sensors 13.5-108 of the head-mountable device 13.5-100). The depiction of human emotion through an avatar constitutes an avatar emotional response.

Additionally shown in FIG. 13.5-1, the head-mountable device 13.5-100 includes one or more arms 13.5-105, 13.5-106. The arms 13.5-105, 13.5-106 are connected to the display 13.5-102 and extend distally toward the rear of the head. The arms 13.5-105, 13.5-106 are configured to secure the display 13.5-102 in a position relative to the head (e.g., such that the display 13.5-102 is maintained in front of a user's eyes). For example, the arms 13.5-105, 13.5-106 extend over the user's ears 13.5-107. In certain examples, the arms 13.5-105, 13.5-106 rest on the user's ears 13.5-107 to secure the head-mountable device 13.5-100 via friction between the arms 13.5-105, 13.5-106 and the head. Additionally, or alternatively, the arms 13.5-105, 13.5-106 can rest against the head. For example, the arms 13.5-105, 13.5-106 can apply opposing pressures to the sides of the head to secure the head-mountable device 13.5-100 to the head. Optionally, the arms 13.5-105, 13.5-106 can be connected to each other via a strap (shown in dashed lines) that can compress the head-mountable device 13.5-100 against the head).

Any of the features, components, and/or parts, including the arrangements and configurations thereof shown in FIG. 13.5-1 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.5-1.

FIGS. 13.5-2A-13.5-2B respectively illustrate a side view and front view profiles of an example of the head mountable device 13.5-100. As discussed above, the head mountable device 13.5-100 includes the display 13.5-102, the facial interface 13.5-103, the sensor controller 13.5-104, and the sensors 13.5-108. Indeed, at least one sensor 13.5-108 is positioned on or within the facial interface 13.5-103. Additionally, the facial interface 13.5-103 can wrap around eyes 13.5-201 and bridge a nose 13.5-202 of a user. The head-mountable device 13.5-100 can also include connections 13.5-206 that movably constrain the display 13.5-102 and the facial interface 13.5-103 (e.g., at forehead and cheek regions of a user face). Examples of the connections 13.5-206 include a pivot connection, spring connection, etc.

The sensors 13.5-108 can be positioned in myriad different configurations. In one example, at least one of the sensors 13.5-108 is positioned in a pliant region 13.5-212 of the facial interface 13.5-103 between the connections 13.5-206. A "pliant region" refers to the portion(s) of the facial interface 13.5-103 disposed between the connections 13.5-206, where the facial interface 13.5-103 is more flexible and conformable. In certain implementations, one or more of the sensors 13.5-108 is positioned in a middle portion of the pliant region 13.5-212 (approximately equidistant from the connections 13.5-206). By positioning one or more of the sensors 13.5-108 within the pliant region 13.5-212, pressure points felt by the user can be mitigated. Additionally, or alternatively, the sensors 13.5-108 can be positioned in certain configurations, depending on the desired location (on the user) to be sensed (e.g., a forehead region, an eye region, a nasal region, etc.).

Further, the term "forehead region" refers to the anatomical area of a human head between the eyes and scalp. Additionally, the term "nasal region" refers to the anatomical area of a human nose.

Also shown in FIGS. 13.5-2A-13.5-2B, the head-mountable device 13.5-100 can include a power source 13.5-203. In some examples, the power source 13.5-203 can include one or more electrochemical cells with connections for powering electrical devices. For example, in some examples, the power source 13.5-203 includes a lithium-ion battery, alkaline battery, carbon zinc battery, lead-acid battery, nickel-cadmium battery, nickel-metal hydride battery, etc. It will therefore be appreciated that the power source 13.5-203 can be dispensable or rechargeable, as may be desired. In certain implementations, the power source 13.5-203 is connected to the sensor controller 13.5-104 via one or more electrical connections. In some examples, though not required, the power source 13.5-203 is mounted to the sensor controller 13.5-104.

The head-mountable device 13.5-100 can also include an interface 13.5-210, which can be electromechanical or wireless. The interface 13.5-210 can communicatively couple the sensors 13.5-108 to at least one of the power source 13.5-203, the sensor controller 13.5-104, or an HMD processor/memory component (not shown).

In some examples, the sensor 13.5-108 can connect to the sensor controller 13.5-104 (or the HMD processor/memory component, not shown) via certain wireless communication protocols, such as via a wireless local area network protocol, wireless area network protocol, wireless personal area network protocol, wide area protocol, etc. Some particular examples of wireless communication via such protocols include a Wi-Fi based communication, mesh network communication, BlueTooth® communication, near-field communication, low-energy communication, Zigbee communication, Z-wave communication, and 6LoWPAN communication. In a particular implementation, the sensor 13.5-108 is communicatively coupled to the sensor controller 13.5-104 (or the HMD processor/memory component, not shown via a wireless 60 GHz frequency.

Any of the features, components, and/or parts, including the arrangements and configurations thereof shown in FIGS. 13.5-2A-13.5-2B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.5-2A-13.5-2B.

As discussed above, sensors can be disposed on or within the facial interface of the present disclosure. In accordance with one or more such examples, FIG. 13.5-3 illustrates one of the sensors 13.5-108 positioned on a surface of the facial interface 13.5-103. Specifically, as shown in FIG. 13.5-3, the sensor 13.5-108 is positioned on a first surface 13.5-318 oriented towards a user side 13.5-324 (and away from a display side 13.5-326). Additionally, the sensor 13.5-108 includes a field of view 13.5-320 that crosses through an interface material 13.5-301 from the first surface 13.5-318 to a second surface 13.5-322 opposing the first surface 13.5-318. Thus, the portion of the interface material 13.5-301 corresponding to the field of view 13.5-320 between the first surface 13.5-318 and the second surface 13.5-322 can be sensorally transparent-constituting a sensorally transparent window through the interface material 13.5-301.

The terms "sensorally transparent" refers to a type of material penetrable by a sensor measurement signal without substantial loss to the quality or accuracy of the sensor measurement signal (where "substantial" means greater than about 5%, about 10%, about 25%, about 50%, or greater than 50% discrepancy from a ground truth signal). For example, a sensorally transparent material can allow a heart rate sensor to accurately detect electrical, magnetic, or audio heart data indicative of a heart palpation, heartbeat, heart rhythm, etc. despite the sensorally transparent material being disposed between the heart rate sensor and the user. The sensor measurement signal is therefore a wireless signal to and/or from a sensor, where the wireless signal comprises wavelike properties (e.g., frequency, amplitude, etc.) that allow the wireless signal to propagate through the sensorally transparent material.

Relatedly, the term "sensorally transparent window" refers to the portion of the interface material 13.5-301 that is sensorally transparent. In some examples, the sensorally transparent window includes an entirety of the interface material 13.5-301. In other examples, the sensorally transparent window includes at least a portion of the interface material 13.5-301 for the field of view 13.5-320. In these or other examples, the sensorally transparent window can be sized and shaped according to the field of view 13.5-320.

The interface material 13.5-301 composes or defines (at least in part) the facial interface 13.5-103. The interface material 13.5-301 can include the first surface 13.5-318 and the second surface 13.5-322 opposing the first surface 13.5-318, as illustrated in at least FIG. 13.5-3. In at least some examples, the second surface 13.5-322 is configured to contact user skin.

Additionally, the interface material 13.5-301 can include at least one of foam, gel, or fabric. The interface material 13.5-301 can likewise include a combination of foam (e.g., polyurethane foam cushion, cotton foam), gel (e.g., silicone, polyurethane, etc.), or fabric (e.g., cotton, leather, leatherette, etc.). For example, the interface material 13.5-301 can include multiple different layers (e.g., an outer leatherette layer forming the second surface 13.5-322 and a foam layer underneath forming the first surface 13.5-318). The combination described is merely exemplary and other embodiments, materials, configurations and/or combinations are contemplated herein.

Any of the features, components, and/or parts, including the arrangements and configurations thereof shown in FIG. 13.5-3 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.5-3.

Other sensor arrangements are also within the scope of the present disclosure. In accordance with one or more examples, FIG. 13.5-4 illustrates the facial interface 13.5-103 which can include sensorally transparent windows through which sensor measurement signals to or from the sensors 13.5-108*a*, 13.5-108*b* can pass. The sensors 13.5-108*a*, 13.5-108*b* can detect physiological or biological changes of the user's body through corresponding fields of view 13.5-320*a*, 13.5-320*b*. For example, a head-mountable device 13.5-100 can detect changes to a user body temperature or a heat profile via an infrared sensor. Other biological sensors can be added or substituted, as may be desired.

In particular, FIG. 13.5-4 shows the sensor 13.5-108*a* in a same or similar position as described above in relation to FIG. 13.5-3. The sensor 13.5-108*a* is positioned as a contactless sensor on the first surface 13.5-318 (i.e., on the display side 13.5-326). In addition, FIG. 13.5-4 shows the facial interface 13.5-103 includes the sensor 13.5-108*b* disposed between the first surface 13.5-318 and the second surface 13.5-322. That is, the sensor 13.5-320*b* is embedded within the facial interface 13.5-103 such that the sensor 13.5-320*b* is invisible and inaccessible from the second surface 13.5-322 (i.e., the skin-facing surface). By being offset from the second surface 13.5-322, the sensor 13.5-108*b* is also a contactless sensor.

In one or more examples, the sensors 13.5-108*a*, 13.5-108*b* are the same type of sensors (albeit positioned differently). In other examples, the sensors 13.5-108*a*, 13.5-108*b* are different types of sensors. Similarly, the sensors 13.5-108*a*, 13.5-108*b* can have the same field of view or a different field of view, as may be desired. Alternative embodiments can also include the same or different sensors with alternative fields of view. For instance, the fields of view 13.5-320*a*, 13.5-320*b* can be oriented or angled towards a particular location along the second surface 13.5-322 (e.g., for measuring a particular location on the user). Additionally, or alternatively, the fields of view 13.5-320*a*, 13.5-320*b* can intersect, overlap, and/or include mutually exclusive measurement regions.

One of ordinary skill in the art will appreciate that the sensor depth for the sensor 13.5-320*b* can vary any distance from the first surface 13.5-318 to the second surface 13.5-322. An example of sensor depth variation is shown where the sensor 13.5-108*a* is on the first surface 13.5-318 of the interface material 13.5-301, which increases the sensor field of view 13.5-320*a*. Similarly, sensor 13.5-108*b* is a distance from the first surface 13.5-318, being disposed within the interface material 13.5-301, and therefore closer to the second surface 13.5-322 than the sensor 13.5-108*a*. In some instances, this closer positioning of the sensor 13.5-108*b* to the second surface 13.5-322 can correspondingly reduce the field of view 13.5-320*b*. This is only one example variation of sensor depth, as a multitude of sensors can be disposed on the first surface 13.5-318 of the interface material 13.5-301, or between the first surface 13.5-318 and the second surface 13.5-322, within the interface material 13.5-301. In one example, the second surface 13.5-322 abuts a forehead region or a nasal region of a user head when the head-mountable device 13.5-100 is donned.

Any of the features, components, and/or parts, including the arrangements and configurations thereof shown in FIG. 13.5-4 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.5-4.

FIG. 13.5-5 illustrates yet another example of the facial interface 13.5-103, which can include multiple sensors embedded within the interface material 13.5-301. FIG. 13.5-5 also illustrates none of the sensors 13.5-108*a*, 13.5-108*b* are positioned on the first surface 13.5-318. In this example, the sensors 13.5-108*a*, 13.5-108*b* can be wirelessly coupled to a power source and/or an HMD memory/processor component. Indeed, the sensors 13.5-108*a*, 13.5-108*b* can be powered by an inductive coil running through the head-mountable device 13.5-100 (e.g., adjacent to the first surface 13.5-318). Similarly, the sensors 13.5-108*a*, 13.5-108*b* can be communicatively coupled to an HMD memory/processor component via a wireless communication protocol (e.g., for sending sensor data/sensor signals or receiving sensor feedback).

As further shown in FIG. 13.5-5, sensor 13.5-108*a* and sensor 13.5-108*b* are disposed within the interface material 13.5-301. Sensors 13.5-108*a*, 13.5-108*b* can be positionally modified to different locations (e.g., laterally, or depth-wise) than illustrated in FIG. 13.5-5. Similarly, the sensor 13.5-108*a* can vary in type and configuration, transmission power, shape, and size from the sensor 13.5-108*b* (as indicated above). The field of view 13.5-320*a* of the sensor 13.5-108*a* can vary from the field of view 13.5-320*b* of 13.5-108*b*. In another example, the fields of view **13.5-320*a*, 13.5-320*b*** can be the same configuration (also indicated above).

Any of the features, components, and/or parts, including the arrangements and configurations thereof shown in FIG. 13.5-5 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.5-5.

FIGS. 13.5-6A and 13.5-6B illustrate another example of the facial interface 13.5-103 comprising multiple layers of interface material. In a particular example shown in FIGS. 13.5-6A-13.5-6B, the interface material includes a base layer 13.5-624 and an interchangeable layer 13.5-626. The base layer 13.5-624 is affixed to the head-mountable device 13.5-100—thereby forming a permanent portion of the facial interface 13.5-103. By contrast, the interchangeable layer 13.5-626 is removably attached to the base layer 13.5-624 (e.g., via fasteners **13.5-628*a*, 13.5-628*b*) such that the interchangeable layer 13.5-626** can be swapped out for a different interchangeable layer (e.g., that supports or is designated for a different user activity).

The fasteners **13.5-628*a*, 13.5-628*b* can include myriad different fasteners. For example, the fasteners 13.5-628*a*, 13.5-628*b*** can include brooches, buttons, buckles, clasps, eyelets, fabric ties, frog closures, grommets, hook and eyes, laces, loop fasteners, pins, poppers, press studs, snap fasteners, toggles, hook and loop Velcro® tape, zippers, etc. Additionally, rather than fasteners, temporary adhesives (e.g., tape, glue, tack, etc.) can be implement. It will be appreciated that more than two fasteners can be utilized. Additionally, only a single fastener may be implanted in certain instances.

In one example, FIG. 13.5-6A shows a configuration where the interchangeable layer 13.5-626 of the facial interface 13.5-103 can be removably attached to the base layer 13.5-624 via the fasteners **13.5-628*a*, 13.5-628*b*. The interchangeable layer 13.5-626 can include sensor 13.5-108*a* with a field of view 13.5-320*a*. The sensor 13.5-108*a* can be a wireless biometric sensor, which can include a temperature sensor, a respiration sensor, a heart activity sensor, or a brain activity sensor. Additionally or alternatively, the sensor 13.5-108*a* can include a sensor indicative of certain biological responses (e.g., a stress response). The sensor 13.5-108*a* can be disposed such that the sensor field of view 13.5-320*a*, when oriented toward a region of the face, can detect characteristics unique to the user. In a particular example, the sensor 13.5-108*a*** can include an infrared sensor capable of detecting user characteristics, such as body temperature or changes to body temperature.

In another example, FIG. 13.5-6B shows a configuration where an additional interchangeable layer 13.5-630 of the facial interface 13.5-103 can be removably attached to the base layer 13.5-624. The additional interchangeable layer 13.5-630 can be removably attached to the base layer 13.5-624 via the fasteners **13.5-628*a*, 13.5-628*b*, as similarly described above. Different from the interchangeable layer 13.5-626, the additional interchangeable layer 13.5-630 can include an additional sensor 13.5-108*b* with an additional field of view 13.5-320*b*. Here, the sensor 13.5-108*b* and corresponding field of view differs from the sensor 13.5-108*a*. In this manner, facial interface 13.5-103** can be compatible with myriad different interchangeable layers as may be desired for different user activities (or different types of users, such as kids or adults).

Any of the features, components, and/or parts, including the arrangements and configurations thereof shown in FIGS. 13.5-6A-13.5-6B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.5-6A-13.5-6B.

FIG. 13.5-7A illustrates a perspective view of an electronic device 13.5-700 including a wearable display 13.5-702, an engagement interface 13.5-726, and a contactless sensor 13.5-714 coupled to the engagement interface 13.5-726. In one or more examples, the electronic device 13.5-700 is the same as or similar to the head-mountable device 13.5-100 described above. For example, the engagement interface 13.5-726 can be the same as or similar to the facial interface 13.5-103 described above. Similarly, the wearable display 13.5-702 can be the same as or similar to the display 13.5-102 described above.

The engagement interface 13.5-726 is adjustable for different size, shapes, and contours of facial features. For example, the engagement interface 13.5-726 can flexibly conform to a user face via connections **13.5-628*a*-13.5-628*d* (e.g., that are the same as or similar to the connections 13.5-206 described above). To illustrate, the connections 13.5-628*a*-13.5-628*d* each include pivot connections. However, the connections 13.5-628*a*-13.5-628*d*** can be adjusted to include different types of connections (e.g., foam hard stops, leaf springs, compliant mechanisms, etc.).

In another example, the engagement interface 13.5-726 includes an interfacing material 13.5-727, wherein the contactless sensor **13.5-714*a* can be invisible and inaccessible through a skin-facing surface of the interfacing material 13.5-727. The contactless sensor 13.5-714*a* can be oriented toward the first facial region 13.5-725*a***, such a user's forehead, when the device is worn.

In another example, the electronic device includes additional contactless sensors **13.5-714*b*, 13.5-714*c* coupled to the engagement interface 13.5-726. The additional contactless sensors 13.5-714*b*, 13.5-714*c* can be mounted on (or within) an engagement interface 13.5-732 (e.g., a nose piece). The additional contactless sensors 13.5-714*b*, 13.5-714*c* can be oriented toward a second facial region 13.5-730, such as a user's nose, different from the first facial region 13.5-725*a* when the device is worn. In this manner, the contactless sensors 13.5-714*a*-13.5-714*c* can be oriented away from the wearable display 13.5-702** (and instead oriented towards a user head or skin, not shown).

FIG. 13.5-7B shows a perspective exploded view of the electronic device 13.5-700 with sensors **13.5-714*a*, 13.5-714*b*, and 13.5-714*c*. In one example, the sensors can be removably attached to the engagement interfaces 13.5-726, 13.5-732 (e.g., for swapping out with different sensors). In other examples, the sensors are permanently affixed to the engagement interfaces 13.5-726, 13.5-732. Additionally, the sensors 13.5-714*a*-13.5-714*c* can be disposed on the engagement interfaces 13.5-726, 13.5-732 such that the sensors are positioned over corresponding sensorally transparent windows 13.5-734*a*-13.5-734*c*. The sensorally transparent windows 13.5-734***a*, 13.5-734*b*, and 13.5-734*c* allow sensor measurement signals to pass to and from the sensors 13.5-714*a*-13.5-714*c*.

Any of the features, components, and/or parts, including the arrangements and configurations thereof shown in FIGS. 13.5-7A-13.5-7B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.5-7A-13.5-7B.

13.6: Integrated Health Sensors

The following disclosure relates to a facial interface of a head-mountable device. More particularly, the present embodiments relate to a facial interface of a head-mountable device including health sensors used for acquiring biometric information of the user, and performing actions in response to the detected biometric information. These facial interfaces can enable health sensors to interact with a user to collect biometric information. In some examples, a processor causes a component of the HMD to perform an action in response to the biometric information collected by the sensor. As used herein "an action" or "perform an action" can refer to any electrical or mechanical act the causes a change in one or more components of the HMD. For example, the action can include displaying a notification for the user, or activating or deactivating one or more components. In some examples, a sensor can collect biometric information of a user who is exercising. The biometric information can be related to temperature, respiration, stress response, heart activity, or brain activity or any other pertinent data. Further, in response to the collected data, they system can perform an action (e.g., notify the user of the collected data.

Head-mountable devices equipped with sensors are utilized for various purposes that detect limited user feedback, such as movement or positioning feedback, providing limited information in response to the user. For example, a user may have an increase in heartrate or brain activity while performing an action or movement. Conventional head-mountable devices are not suitably equipped to capture all the necessary biometric information generated during use.

In contrast, the head-mountable devices of the present disclosure include a facial interface that can be integrated or incorporated with sensors configured to collect user data, such as biometric information, including heartrate, respiration, brain activity, etc. By capturing the user data, the facial interface sensors can provide improved and increased feedback to the user. A head-mountable device with sensors monitoring user biometric or health feedback can create highly customized user experiences, unlike the sensors of conventional head-mountable devices that are unable to consider, react to, or further enhance the user experience.

Sensors positioned on the facial interface are important to create a customized user experience. The head-mountable device of the present disclosure can contain sensors to measure a user's response or engagement via indicators, such as heart rate, electrical signals from the heart (e.g., ECG, EKG, EXG, etc.), brain activity (e.g., EEG signals, frontal lobe activity), core body temperature, etc. Additionally, the sensor data can be used as feedback data, for example, to monitor user fatigue, facial expressions, or obtain activity-specific metrics.

The head-mountable device can have different sensors implemented in different ways. For example, the head-mountable device of the present disclosure can implement sensors removably attached to the facial interface. In some examples, the removably attached sensors correspond to a different user activity, such as exercise, learning activities, health, clinical settings, etc. In certain implementations, the exercise sensors can include a different sensor, such as a heart rate monitor sensor, whereas the learning activity sensor may include a brain activity sensor. The sensors can be implemented in different applications and arrangement/combinations for obtaining different, activity biometric readings.

These and other embodiments are discussed below with reference to FIGS. 13.6-1-13.6-6. However, those skilled in the art will readily appreciate that the detailed description given herein with respect to these Figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 13.6-1 illustrates a block diagram of a head-mountable device 13.6-100 including a frame 13.6-116, a display 13.6-108, a facial interface 13.6-112, and a support or retention band 13.6-123. The display 13.6-108 can include one or more optical lenses or display screens in front of the eyes of a user. The display 13.6-108 can include a display or display unit for presenting an augmented reality visualization, a virtual reality visualization, or other suitable visualization to a user. Additionally, the display 13.6-108 can be positioned in or on the frame 13.6-116. Similarly, a facial interface 13.6-112 can be connected to the frame 13.6-116. In some examples, the frame 13.6-116 can be a housing for the display 13.6-108. Alternatively, a separate housing can form an exterior portion of the head-mountable device 13.6-100.

The facial interface 13.6-112 can include one or more sensors 13.6-124, support attachments 13.6-132, display attachments 13.6-128, and feedback or output modules 13.6-136. The sensors 13.6-124 can be removably attached to the facial interface 13.6-112. As used herein, the terms "facial interface", "engagement interface", or "light seal" refer to a portion of the head mountable device 13.6-100 that engages (i.e., contacts or conforms to) a user's face. In particular, the facial interface 13.6-112 can include portions of a head-mountable device that conform or press against regions of a user's face. The facial interface 13.6-112 can be positioned between the display 13.6-108 and the user's face. In some examples, the facial interface 13.6-112 can include a pliant (or semi-pliant) facetrack or lumen that spans the forehead, wraps around the eyes, contacts other regions of the face (etc., zygoma and maxilla regions), and bridges the nose.

In addition, the facial interface 13.6-112 can include various components forming a frame, structure, or webbing of a head mountable device disposed between the display 13.6-108 and the user's skin. In particular implementations, the facial interface 13.6-112 can include a seal (e.g., a light seal, environment seal, dust seal, air seal, etc.). It will be appreciated that the term "seal" can include partial seals or inhibitors, in addition to complete seals (e.g., a partial light seal where come ambient light is blocked and a complete light seal where all ambient light is blocked when the head-mountable device 13.6-100 is donned). The facial interface 13.6-112 can be removably attached to the frame 13.6-116 and in electrical communication with the display 13.6-108.

The sensor 13.6-124 of the facial interface 13.6-112 can collect biometric information, such as the user's vital sign (including body temperature, pulse data, respiration data, and blood pressure). The sensor 13.6-124 can generate a signal based on the collected user information and transmit the signal to a processor that can cause an output 13.6-136 to perform an action in response to the signal (i.e., in response to the biometric information collected by the sensor 13.6-124. For example, a user may perform a rigorous activity, such as lifting weights or working out while wearing the HMD 13.6-100. During such activity, the user's heart rate or other vital signs may be elevated or changed and is detectable by the sensor 13.6-124. The sensor 13.6-124 can generate one or more signals based on the received input. The sensor 13.6-124 can transmit the signal to one or more components of the HMD 13.6-100 (e.g., to the display 13.6-108, to the output 13.6-136). The display 13.6-108, being in electrical communication with the facial interface 13.6-112, can receive electrical communication and provide feedback to the user related to their biometric readings (e.g., visual feedback, audio feedback, haptic feedback, etc.). Feedback can include determining when the user needs to take a break, or when the difficulty of an activity needs to be lowered or raised, the output can include scheduling various activities for the user or recommending adjustment of the HMD.

As used herein, the term "sensor" refers to one or more different sensing devices, such as a camera or imaging device, temperature device, oxygen device, movement device, brain activity device, sweat gland activity device, breathing activity device, muscle contraction device, etc. As used herein, the term "biometric," "biometric information," or "biometric feature" can refer to vital signs, including heart rate, pulse, respiration rate, respiration amplitude, or any other health related data. The term "biometric," "biometric information," or "biometric feature" can also refer to biological measurements or physical characteristics, such as facial expressions or emoting. In some examples, the sensor can detect or sense biometric features including features of the autonomic nervous system. Some particular examples of sensors include an electrooculography (EOG) sensor, electrocardiography (ECG or EKG) sensor, photoplethysmography (PPG) sensor heart rate sensor, hear rate variability sensor, blood volume pulse sensor, oxygen saturation (SpO2) sensor, compact pressure sensor, electromyography (EMG) sensor, core-body temperature sensor, galvanic skin response (GSR) sensor, functional near-infrared spectroscopy (FNIR) sensor, non-contact passive infrared (IR) sensor, accelerometer, gyroscope, magnetometer, inclinometer, barometer, infrared sensor, global positioning system sensor, etc. Additional sensor examples can include, contact microphones (e.g., pressure-based MEMS), bioelectrical activity sensors, UV exposure sensors, or particle sensors. In some examples, certain sensors can be used to assess stress and emotion. The HMD can then provide feedback or output related to the detected stress and emotion. In some examples, the sensors can operate through coin cell battery or Bluetooth connectivity. In some examples, the sensors are powered by a primary battery of the HMD.

The sensors described herein can allow for observations of the autonomic nervous system (ANS), to observe relaxation and stress indicators, mental health, medical treatments, etc. Using the sensors, physicians and care takers could have live feedback of biometrics. Use cases can include fitness settings, user content, workplace, telepresence, clinical, education, training, pain, therapy, etc. In some examples, the sensors can be used to capture facial expressions. This is particularly relevant given the user's face is covered by HMD. For example, the HMD could use MEMS or motion tracking sensors to detect facial expressions Any of the features, components, and/or parts, including the arrangements and configurations thereof shown in FIG. 13.6-1 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.6-1.

FIG. 13.6-2 illustrates a head-mountable device 13.6-200. The head-mountable device 13.6-200 can be substantially similar to, including some or all of the features of, the head-mountable devices described herein, such as head-mountable device 13.6-100. In some examples, the head-mountable device 13.6-200 includes a controller 13.6-213 (e.g., sensor controller). While the controller 13.6-213 is illustrated as being positioned in the support 13.6-223, the position of the controller 13.6-213 is not limited to the support 13.6-223, but can be positioned in/on the facial interface 13.6-212 or in the HMD display housing. The controller 13.6-213 can include a processor and a memory device storing computer-executable instructions that, when executed by the processor, cause the controller to receive biometric data from one or more sensors 13.6-224, transmit a signal based on the sensor data, and generate a signal to cause a component to perform an action in response to the signal.

The controller 13.6-213 can include one or more processors (e.g., a system on chip, integrated circuit, driver, microcontroller, application processor, crossover processor, etc.). Further, the controller 13.6-213 can include one or more memory devices (e.g., individual nonvolatile memory, processor-embedded nonvolatile memory, random access memory, memory integrated circuits, DRAM chips, stacked memory modules, storage devices, memory partitions, etc.). In certain implementations, the controller 13.6-213 is communicatively coupled to a power source (e.g., a battery).

In some examples, the controller 13.6-213 stores sensor data received from the sensor(s) 13.6-224 in the memory. The controller 13.6-213 can receive and/or transmit signals based on sensor data. For example, as will be described below, the controller 13.6-213, by way of the processor and memory, can transmit a signal to the display 13.6-208 based on the sensor data (e.g., causing the display 13.6-208 or the head-mountable device 13.6-200 to perform an action, such as present a certain message, power off, react to biometric feedback, etc.

The controller 13.6-213 can perform any number of different functions. For example, the memory device can store computer-executable instructions that, when executed by the processor, cause the controller to receive sensor data from the sensors 13.6-224 and transmit a signal based on the sensor data. For instance, the controller 13.6-213 can transmit a sensor signal to a display 13.6-208. In response to the controller 13.6-213 the display 13.6-208 can perform a wide variety of actions, including power off or power on, react to a user generated facial expression, present a digital notification (e.g., user-generated notification, push notification, context-generated notification, system-generated notification, smart notification, etc.). In some examples, the memory device storing computer-executable instructions that, when executed by the processor, cause the controller 13.6-213 to receive biometric data from the sensor(s) 13.6-224, transmit a signal based on the sensor data, and perform an action in response to the signal.

As illustrated, the head-mountable device (e.g., wearable electronic device) 13.6-200 can include the display 13.6-208, the facial interface 13.6-212, and the sensor(s) 13.6-224 coupled to the engagement interface 13.6-212. The sensors 13.6-224 can be embedded, encapsulated, deposited, adhered, or otherwise attached to the facial interface 13.6-212. The sensors 13.6-224 can be non-contact sensors or can directly contact or touch the user's head. The sensor(s) 13.6-224 can be configured to detect a biometric feature of the user 13.6-220. The sensor(s) 13.6-224, upon detecting a signal from the biometric feature, can transmit the signal to a component of the head-mountable device 13.6-200 causing the head-mountable device 13.6-200 to perform an action. For example, the head-mountable device 13.6-200 can change shape (i.e., tighten or loosen), move, vibrate, rotate, recalibrate, or reposition in response to the sensor signal of the biometric feature.

The head-mountable device 13.6-200 can include a support, headband, or retention band 13.6-223 connected to the display 13.6-208 and/or frame 13.6-216. The retention band 13.6-223 is configured to secure the display 13.6-108 and/or frame 13.6-216 relative to the user's head 13.6-220 (e.g., such that the display 13.6-208 is maintained in front of a user's eyes). The retention band 13.6-223 can be constructed from elastic material, inelastic material, or a combination of elastic and inelastic material. The retention band 13.6-223 is adjustable such that the retention band 13.6-223 conforms to the various shapes and sizes of a user's head 13.6-220. In some examples, the retention band 13.6-223 secures the head-mountable device 13.6-200 via friction between the user's head 13.6-220 and the retention band 13.6-223. In some examples, the retention band 13.6-223 elastically secures the head-mountable device 13.6-200 to the user's head 13.6-220. In some examples, the retention band 13.6-223 is coupled to a ratchet system or mechanism securing the head-mountable device 13.6-200 to the user's head 13.6-220. In some examples, the retention band 13.6-223 is disposed above or on an ear 13.6-221 of the user 13.6-220, supporting the head-mountable device 13.6-200.

In some examples, the housing or frame 13.6-216 of the head-mountable display 13.6-200 is connected via a connector 13.6-215 to the facial interface 13.6-212, the retention band 13.6-223 being connected to the frame 13.6-216 and/or the facial interface 13.6-212, securing the head-mountable device 13.6-200 to the user's head 13.6-220 above or over the ears 13.6-221 of the user.

Any of the features, components, and/or parts, including the arrangements and configurations thereof shown in FIG. 13.6-2 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.6-2.

FIG. 13.6-3 shows a rear view of a head-mountable device 13.6-300. The head-mountable device 13.6-300 can be substantially similar to, including some or all of the features of, the head-mountable devices described herein, such as head-mountable device 13.6-100 and 13.6-200. The head-mountable device 13.6-300 can include a facial interface (e.g., a facial engagement feature) 13.6-312 and a retention band 13.6-323. The head-mountable device 13.6-300 further includes connectors **13.6-332*a*, 13.6-332*b* (collectively referred to as connector(s) 13.6-332) connecting the retention band 13.6-323 and the facial engagement interface 13.6-312. In some examples, the facial interface 13.6-312** is adjustable, accommodating to a user's head in a comfortable and secure way that shields the user from ambient light.

The connector 13.6-332 connecting the retention band 13.6-323 to the facial engagement interface 13.6-312 includes a first connector side **13.6-332*a* attached to the retention band 13.6-323 and a second connector side 13.6-332*b* attached to the facial engagement feature 13.6-312. In addition to forming a mechanical attachment between the retention band 13.6-323 and the facial interface 13.6-312, the connector 13.6-332 can include various types of electrical connections, such as a pogo-pin connection, or other connection types to electrically connect the retention band 13.6-323 with the facial interface 13.6-312. When mated, the first connector side 13.6-332*a* and the second connector side 13.6-332*b* mate (e.g., mechanically mate, magnetically mate via a magnet, electrically mate, etc.) such that the connectors 13.6-332 are in mechanical contact and electrical contact. When the first connector side 13.6-332*a* and the second connector side 13.6-332*b* are connected in this manner, electrical signals can be relayed through the from the retention band 13.6-323 to the facial engagement interface 13.6-312, and vice versa. That is, when connected, the facial engagement interface 13.6-312 can provide data and/or power to the retention band 13.6-323, for example to a sensor or electrical component 13.6-324*c* of the retention band. Likewise, when connected via connector 13.6-332, the retention band 13.6-323 can provide data and/or power to the facial interface 13.6-312, for example, to the sensors 13.6-324*a* and/or 13.6-324*b*. In some examples, the connectors 13.6-332*a*, 13.6-332*b*** can magnetically mate or couple one to the other, transmitting information via a wireless communication connection and receiving power from a wireless power source (e.g., an inductive charger).

The head-mountable device 13.6-300 includes one or more sensor(s) **13.6-324*a*, 13.6-324*b*, 13.6-324*c* (collectively "sensors 13.6-324"). In some examples, the sensors 13.6-324 can be in contact (indirect or direct) with a user. For example, the sensors be positioned to receive input from a user's forehead, cheek, nose, temple region, back of the head, or at any location on the user's head/face. In some examples, the sensors 13.6-324 can be in indirect contact with a user. For example, the sensors 13.6-324** may detect a user's biometric features via infrared, IR, optics, imaging, or other means of detecting biometric features in an indirect or contactless way. The sensors can be a biometric or health sensor, such as any of those described above.

In some examples, the sensors 13.6-324 include a first sensor **13.6-324*a* oriented towards a first facial region (e.g., the forehead) and coupled to the engagement interface 13.6-312, a second sensor 13.6-324*b* oriented towards a second facial region (e.g., a nasal region) and coupled to the engagement interface 13.6-312, and a third sensor or sensor set 13.6-324c coupled to the retention band 13.6-323 and configured to contact a side or back of the user's head. When wearing the head-mountable device 13.6-300 the first sensor 13.6-324a orients towards the first facial region is different in orientation and location from the second sensor 13.6-324** which orients toward the second facial region. It will be appreciated by one skilled in the art that other configurations are contemplated herein, and the above example is for illustrative purposes only.

The sensors 13.6-324 can be located at various locations of the head-mountable device 13.6-300 and can differ in function or sensing capacity depending on where the sensor is located. For example, the sensors 13.6-324b are positioned on the engagement interface 13.6-312 proximate a nose of the user and may sense a user's respiratory biometrics providing a user with feedback indicating oxygen saturation (e.g., $SPO_2$). In some examples, the sensor 13.6-324a is positioned on the engagement interface 13.6-312 contacting a forehead of a user. In some examples, the sensor 13.6-324a detects pulse, facial expression, brain activity or stress response while performing an activity. In some examples, the sensor 13.6-324c is positioned on the retention band 13.6-323, adjacent the temple(s) of a user or at another location where the retention band 13.6-323 is contacting the user. In some examples, a sensor fusion exists in which one or more of the sensors 13.6-324 coordinate and communicate with each other and/or with other sensors on the HMD 13.6-300 to collectively gather user data.

In some examples, forehead sensors, such as sensor 13.6-324a, can be used for brain imaging and observations of the central nervous system. While a single forehead sensor 13.6-324a is shown in FIG. 13.6-3B, it will be understood that multiple sensors or a sensor array can be located on the facial interface 13.6-312 to contact, or be proximate to, the user's head. In some examples, the sensors can be configured to perform EEG (electroencephalography) or functional near-infrared spectroscopy (FNIR).

In some examples, the position of the forehead sensors 13.6-324a can be tuned or tailored to sense brain areas related to language, learning, memory, comprehension, sleep, stress, pain, attention, fear, discomfort, etc. In some examples, the facial interface 13.6-312 can be integrated with a sensor array that includes one or more transmitters that emit a signal. The transmitter(s) can be positioned a certain distance away from one or more detectors that sense the emitted signal. Based on the received signals by the detectors, a processor can infer or determine certain brain activity. In some examples, the sensors 13.6-324a can form a brain-computer interface (BCI), such as a non-invasive neural interface. In some examples, the integrated sensor array can be used to detect the parieto-frontal network of the brain.

In some examples, the sensors 13.6-324a, 13.6-324c can be used to perform EEG detections. The sensors 13.6-324a, 13.6-324c can measure the electrical activity in the cerebral cortex (the outer layer of the brain). The sensors 13.6-324a, 13.6-324c can include electrodes that are placed on a user's head, then the electrodes can non-invasively detect brainwaves from the subject. The EEG sensors 13.6-324a, 13.6-324c can record up to several thousands of snapshots of the electrical activity generated in the brain every second. The recorded brainwaves can be sent to amplifiers, then to a local processor, a remote electronic device, or the cloud to process the data.

In some examples, the sensors 13.6-324a, 13.6-324c can be used to perform functional near-infrared spectroscopy (FNIR). The sensors 13.6-324a, 13.6-324c can use low levels of non-ionizing light to record changes in cerebral blood flow in the brain through optical sensors placed on the surface of the head.

The sensors described herein can perform both passive and active EEG. The passive electrode signals can be sent to a remote processor to analyze. Amplification of the active EEG signals can be performed locally at the site to eliminate coexistence and interference that may be present with passive signal.

The HMD can include an output or feedback module that provides feedback based on the detections from the sensors. The feedback from the system can include displaying visualizations to the user. For example, the feedback can include breathing visualizations, visualization that relate to the user's attention, promptings or suggestions to the user to take a break or change an activity, or make other recommendations or notifications to the user.

Any of the features, components, and/or parts, including the arrangements and configurations thereof shown in FIG. 13.6-3 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.6-3.

FIG. 13.6-4 shows a side or cross-sectional view of portion of a facial interface 13.6-412 wherein a sensor(s) 13.6-424 is embedded in the facial interface 13.6-412. The facial interface 13.6-412 includes a first side or surface 13.6-407 facing the display side 13.6-429 (i.e., toward the HMD display) and a second side or surface 13.6-409 facing toward a user side 13.6-427. In some examples, the first surface 13.6-407 attaches to a frame of the HMD. In some examples, the second surface 13.6-409 directly contacts or touches the user's head when the HMD is donned or being worn by the user.

The facial interface 13.6-412 can include one or more sensors 13.6-424a, 13.6-424b, 13.6-424c (collectively "sensors 13.6-424). The sensor 13.6-424a can be positioned on the first surface 13.6-407 of the facial interface 13.6-412. In some examples, the first surface 13.6-409 can an interior and the second surface 13.6-409 can be an exterior of the facial interface 13.6-412. Thus, the sensor 13.6-424a can be positioned on an interior of the facial interface 13.6-412. In some examples, the facial interface 13.6-412 can include a sensor 13.6-424b is embedded, encapsulated, or otherwise surrounded by the facial interface 13.6-412. The facial interface 13.6-412 can include, a sensor 13.6-424c that positioned such that a portion of the sensor 13.6-424c is exposed through the second surface 13.6-409. In other words, the sensor 13.6-424c can at least partially define the second surface 13.6-409 and can directly contact or touch the user's skin. In some examples, the sensor 13.6-424c can be partially surrounded or embedded in the facial interface 13.6-412. In some examples, the sensor 13.6-424c is external to the facial interface 13.6-412, positioned on the exterior 13.6-409 of the facial interface 13.6-412.

The sensors 13.6-424a and 13.6-424b can have corresponding sensor areas 13.6-425a, 13.6-425b, respectively. The sensor areas 13.6-425a, 13.6-425b can represent a field of view or cone of influence that is transparent to a signal emitted by the sensors 13.6-424a, 13.6-424b. In some examples, the field of view of the sensors 13.6-424 can be approximately 50 degrees. The sensors 13.6-424a, 13.6-424b can detect physiological, biological, and/or biometric changes of the user's body through corresponding sensor areas 13.6-425a, 13.6-425b. For example, the sensors 13.6-424a, 13.6-424b can detect changes to a user through the material of the facial interface 13.6-412. Other sensors may be added or substituted, as may be desired. In some examples, the sensor areas 13.6-425a, 13.6-425b can comprises a different material than the rest of the facial interface 13.6-412. For example, the sensor areas 13.6-425a, 13.6-425b can be transparent to certain signals from the sensors 13.6-424a, 13.6-424b or from the user, while the remainder of the facial interface 13.6-412 is not transparent or transmissive to such signals.

Sensor 13.6-424b is a distance from the first surface 13.6-407, disposed with in the facial interface 13.6-412, and therefore closer to the second surface 13.6-409 than the sensor 13.6-424a. In some instances, this closer positioning of the sensor 13.6-424b to the second surface 13.6-409 can correspondingly reduce the field of view 13.6-425b. In some examples, the sensor 13.6-424c may be flush with the second surface 13.6-409 and/or directly contacting a user's face and/or skin. This is only one example of sensor depth variation, as a plurality of sensors can be disposed on the first surface 13.6-407 of the facial interface 13.6-412, or between the first surface 13.6-407 and the second surface 13.6-409 of the facial interface 13.6-412. In some examples, the second surface 13.6-409 (e.g., user side 13.6-427) abuts a forehead region or nasal region of a user head when the head-mountable device 13.6-100 is donned.

Any of the features, components, and/or parts, including the arrangements and configurations thereof shown in FIG. 13.6-4 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.6-4.

FIG. 13.6-5 shows a front perspective view of a facial interface 13.6-512. The facial interface 13.6-512 can be substantially similar to, including some or all of the features of, the facial interface described herein, such as facial interfaces 13.6-112, 13.6-212, 13.6-312, and 13.6-412. In some examples, the facial interface 13.6-512 can include a framed or clamshell design. In some examples, various components and/or circuitry can be discretely positioned within the volume of the clamshell design. The facial interface 13.6-512 can include a first side 13.6-540a and a second side 13.6-540b. The first side 13.6-540a can be proximate the user when donned. In some examples, the first side 13.6-540a can contact the user's face. The second side 13.6-540b can be positioned between the first side 13.6-540a and a display of the HMD. In some examples, the second side 13.6-540b is attached to the display housing.

The first side 13.6-540a can include a connector 13.6-532 configured to attach the facial interface 13.6-512 to a component, such as a retention band. The connector 13.6-532 can be mechanical and/or electrical. In some examples, the connector 13.6-532 is electrically connected to a sensor 13.6-524c. The first side 13.6-540a can configured to contact a face of a user. The first side 13.6-540a can include sensors 13.6-524a, 13.6-524b, 13.6-524c, 13.6-524d that can be configured to detect a biometric feature(s) of the user. In some examples, the facial interface includes a nasal support 13.6-539. The nasal support 13.6-539 can be configured to contact the user's nose. The nasal support 13.6-539 can include at least one sensor 13.6-524b.

In some examples, the facial interface 13.6-512 can be interchangeable with a different facial interface having different sensors or structure. For example, a user may exercise with the head-mountable device 13.6-100 using a first facial interface with specific sensors for exercising. The same user then may game or perform a leisure activity using the head-mountable device 13.6-100 fitted with a different facial interface with different sensors or structure for those activities. This is only one example and one of ordinary skill in the art will appreciate other examples are contemplated herein.

In some examples, the sensors 13.6-524 are removably attached to the facial interface 13.6-512. For example, a user may wish to replace or add certain sensors to the facial interface 13.6-512. A user can selectively attach or remove a sensor 13.6-524 and replace it with a different sensor depending on the activity of the user or purpose of the sensor. In this way, the sensors can accommodate the needs or demands of a user for a specific activity requiring specific sensors without needing to replace the entire HMD or facial interface 13.6-512.

In some examples, the facial interface 13.6-512 includes a connector 13.6-536. The connector 13.6-536 can be electrically connected one or more of the sensors 13.6-524 via a wired or wireless connection 13.6-543. In some examples, the facial interface 13.6-512 is in electrical communication with a display via the wired connection link 13.6-543 and/or the connector 13.6-536, such as, a braided electrical cable, a pogo connection, or other type of wired connection. In some examples, the facial interface 13.6-512 can be in electrical communication with the display 13.6-208 via a wireless connection (e.g., low-power Bluetooth BLE connection). In some examples, data or signals from the sensors 13.6-524 are transmitted through the link 13.6-543 to the connector 13.6-536, where they are further transmitted to the HMD itself to be processed. Thus, in some examples, the facial interface 13.6-512 serves as an interconnect between the retention band and the display unit. In some examples, the retention band can mate directly into the display unit, bypassing the facial interface 13.6-612. In some examples, the facial interface 13.6-512 can include an Orion style connection (e.g., 3 contact pads and 3 contact pins).

In some examples, the facial interface 13.6-512 includes a bridging feature 13.6-541 structurally connecting the first side 13.6-540a and the second side 13.6-540b. In some examples, the bridging features 13.6-541 can provide a conduit for wires or electronics, such as the link 13.6-543. In some examples, the bridging feature 13.6-541 is flexible permitting the facial interface first side 13.6-540a to move, pivot, or change shape relative to the facial interface second side 13.6-540b. In some examples, the bridging feature 13.6-541 is rigid maintaining the facial interface first side 13.6-540a unmoved relative to the facial interface second side 13.6-540b.

Any of the features, components, and/or parts, including the arrangements and configurations thereof shown in FIG. 13.6-5 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.6-5.

FIG. 13.6-6 illustrates a perspective view of select components of a head-mountable device 13.6-600. The HMD 13.6-600 can be substantially similar to, including some or all of the features of, the HMDs described herein. The HMD 13.6-600 can include chassis or a frame 13.6-609 that can at least partially house a display, and a facial interface 13.6-612 that can contact a user's face. In some examples, the HMD 13.6-600 changes shape in response to a signal from one or more sensor(s) 13.6-624*a*, 13.6-624*b*, 13.6-624*c* (collectively "sensors 13.6-624"). The frame 13.6-609 can be connected via a connector(s) 13.6-615 to the facial interface 13.6-612. In some examples, the connectors 13.6-615 are electrical and/or mechanical connectors configured to establish electrical and/or mechanical connections between the frame 13.6-609 and the facial interface 13.6-612. In some examples, the connectors 13.6-615 are articulable or movable, such that the connectors 13.6-615 can move to change a shape of the HMD 13.6-600. In some examples, the HMD 13.6-600 can include strain gauges or point load pressure sensors that can be used on posts 13.6-615 to act as pressure sensors to extrapolate retention band tension. The system can then guide the user to adjust for proper fitting of the HMD (e.g., prompt to tighten or loosen or change an angle of the band. In some examples, the display can illustrate for the user how to adjust band up/down based on the detected tension. In some examples, semiconductor(s) can be embedded in the facial interface (e.g., in the foam of the facial interface).

In some examples, the facial interface 13.6-612 can be integrated with one or more feedback modules or outputs 13.6-650, 13.6-653. The sensors 13.6-624 can receive biometric input from a user. Based on the input detected by the sensors 13.6-624, the outputs 13.6-650, 13.6-653 can perform some action. The outputs 13.6-650, 13.6-653 can include LEDs, haptics, speakers, motors, displays, or any other feedback devices that creates an output in response to the signals of biometric information from the sensors 13.6-624. For example, one or more of the sensors 13.6-624 can detect when the HMD is donned, for example through capacitive or pressure sensors. The sensors 13.6-624 can then generate a signal to be analyzed by a processor. The processor can then cause a first feedback output 13.6-650, such as an LED to emit a certain color of light indicating that the head-mountable device 13.6-600 is donned. In some examples, the second feedback output 13.6-653 can be a feedback output such as a haptic feedback output alerting a user of a notification (e.g., message notification, text notification, email notification, etc.) In some examples, the output 13.6-653 can be a display visible by the user and which can extend the peripheral view of the user. It should be appreciated by one of normal skill in the art that the above example is one example and other examples of feedback outputs are contemplated herein.

In some examples, the chassis or frame 13.6-609 can at least partially define an exterior surface of the HMD 13.6-600. In some examples, health sensors 13.6-616 can be mounted, attached, or otherwise integrated into/onto the chassis 13.6-609. While two health sensors 13.6-616 are illustrated, it will be understood that one, two, or more than two sensors can be used and are contemplated by the present disclosure. The health sensors 13.6-616 can be substantially similar to, including some or all of the features of, the sensor described herein (e.g., sensors 13.6-624). In some examples, the health sensors 13.6-616 can be non-contact sensors (i.e., the health sensors 13.6-616 can collect the intended data without needing to be in direct physical contact with the user. The health sensors 13.6-616 can be positioned on a bottom surface of the chassis 13.6-609. The health sensors 616 can at least partially define an exterior surface of the HMD 13.6-600.

Any of the features, components, and/or parts, including the arrangements and configurations thereof shown in FIG. 13.6-6 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.6-6.

13.7: Health Sensing Retention Band

According to some aspects of the present disclosure, a head-mountable device can include a housing, a display positioned in the housing, a processor positioned in the housing, and a retention band connected to the housing, the retention band including a sensor to monitor a brain activity of a user.

In some examples, the retention band includes a sensor array positionable adjacent a back of a head of the user when the head-mountable device is worn by the user. The sensor array can detect brain activity of the user. The sensor can transmit a signal to the processor, the signal based on the biometric information. The processor can analyze the signal and cause the head-mountable device to perform an action in response to the analysis of the signal. The action can be at least one of providing a visual feedback, providing an audio feedback, or providing a haptic feedback.

In some examples, the retention band is removably attached to the housing. The sensor can be removably attached to the retention band. The retention band can be in electrical communication with the display. The retention band can be pivotably attached to the housing.

According to some aspects, a headband for a head-mountable device can include a first end to attach to the head-mountable device, a second end to attach to the head-mountable device, and a sensor positioned between the first end and the second end. The sensor can detect brain activity of a user, and generate a signal based on the detected brain activity.

In some examples, the sensor can be embedded in the headband. The headband can include an area that is transparent to the signal emitted by the sensor. The headband can be articulable relative to the head-mountable device. The headband can include an expandable surface area. The signal can include a display command signal.

According to some aspects, a wearable electronic device can include a display, a retention band attached to the display, the retention band having a first orientation and a second orientation, and a sensor connected to the retention band. The sensor can detect a brain activity of a user and produce a signal based on the brain activity. A processor can perform a first analysis of the signal in response to the retention band being in the first orientation, and can perform a second analysis of the signal in response to the retention band being in the second orientation.

In some examples, the wearable electronic device can perform an action in response to the signal. The wearable electronic device can include a head-mountable device. The retention band can be adjustable. The sensor can perform at least one of functional near-infrared spectroscopy or electroencephalography.

In some examples, the retention band is movable between a first position and a second position. The sensor can be oriented toward a first brain region in the first position, and a second brain region in the second position when the wearable electronic device is worn by the user. The retention band can produce at least one of visual, audio, or haptic feedback in response to the signal from the sensor. The sensor can be a first sensor. The wearable device can further include a second sensor connected to the retention band. The second sensor can collect vital signs.

The present disclosure includes details of a retention band for a head-mountable device that is integrated with health sensors. The integrated retention band can enable both optical and electrical neural imaging of the user's head. In some examples, the sensor-integrated headband can be used for brain imaging. For example, the sensors can be configured to perform functional near-infrared spectroscopy (FNIR). In some examples, the sensors can be used to perform EEG (electroencephalography).

The retention band can be adjustable or articulable to position the sensors at desired locations on the user's head. By having the ability to adjust the retention band, the sensors can observe specific areas of the brain. For example, the position of the sensors can be tuned or tailored to look at brain areas related to language, learning, memory, comprehension, sleep, stress, pain, attention, fear, discomfort, etc.

In some examples, the retention band can be integrated with a sensor array that includes one or more transmitters that emit a signal. The transmitter(s) can be positioned a certain distance away from one or more detectors that sense the emitted signal. Based on the received signals by the detectors, a processor can infer or determine certain brain activity. In some examples, the integrated sensors on the retention band form a brain-computer interface (BCI), such as a non-invasive neural interface. In some examples, the integrated sensor array can be used to detect the parieto-frontal network of the brain.

The HMD can include an output or feedback module that provides feedback based on the detections from the sensors. The feedback from the system can include displaying visualizations to the user. For example, the feedback can include breathing visualizations, visualization that relate to the user's attention, promptings or suggestions to the user to take a break or change an activity, or make other recommendations or notifications to the user.

These and other embodiments are discussed below with reference to FIGS. 13.7-1-13.7-6. However, those skilled in the art will readily appreciate that the detailed description given herein with respect to these Figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 13.7-1 shows a schematic block diagram of a head-mountable device 13.7-100 including a display 13.7-104, a retention band 13.7-108, a memory 13.7-106, and a processor 13.7-120. The display 13.7-104 can include one or more optical lenses or display screens in front of the eyes of a user. The display 13.7-104 can present an augmented reality visualization, a virtual reality visualization, or other suitable visualization to a user. Additionally, the display 13.7-104 can be positioned in or on a housing or frame that supports the display 13.7-104 and additional electronic components. The display 13.7-104 in combination with the frame or the housing and other electronic components supported by the housing can be referred to as the display unit 13.7-104 and the display 13.7-104. The retention band 13.7-108 can be connected to the frame or housing of the display 13.7-104.

In some examples, the retention band 13.7-108 can include a support, strap, headband, belt, arms, or any other attachment mechanism capable of supporting the HMD 13.7-100 on the user's head. In some examples, the retention band 13.7-108 can include a pliant (or semi-pliant) material or fabric that wraps partially around the user's head.

The retention band 13.7-108 can be made from a flexible material and can securely and snuggly fit around a head of the user. The retention band 13.7-108 can be made from a woven fabric, leather, polymer, or any other material compatible to be integrated with the sensors 13.7-112 or having electromagnetic transmissive properties. In some examples, the retention band 13.7-108 can be made from silicone or thermoplastic polyurethane (TPU). In some examples, the retention band 13.7-108 can be made from compression molded materials, such as rubber. The sensors 13.7-112 can be integrated into the compression molded materials. In some examples, the retention band 13.7-108 is semi-rigid. For example, the retention band 13.7-108 can be rigid where the sensors 13.7-112 are located. The sensors 13.7-112 can be flexible or deformable relative to each other such that the sensor array can move, flex, or stretch with the retention band 13.7-108. The retention band 13.7-108 can include rigid sections where electronic components are located.

The retention band 13.7-108 can include two ends, straps or sidebands **13.7-108*a* that connect to the display 13.7-104. The retention band 13.7-108 can include a middle section 13.7-108*b* that is positioned between the ends 13.7-108*a* of the retention band 13.7-108. The middle section 13.7-108*b* can configured to contact the back of the user's head, while the sidebands 13.7-108*a* can be considered to contact the sides of the user's head. The retention band 13.7-108 can include pivots 13.7-115. The pivots 13.7-115 can be located between the display 13.7-104 and the sidebands 13.7-108*a* such that the entire retention band 13.7-108 can pivot or rotate relative to the display 13.7-104. In some examples, the pivots 13.7-115 can be positioned between the sidebands 13.7-108*a* and the middle section 13.7-108*b* to enable the middle section 13.7-108*b* to pivot or rotate relative to the sidebands 13.7-108*b* and display 13.7-104. Further detail of the pivots will be provided below with regard to FIGS. 13.7-4A-13.7-4**C.

The retention band 13.7-108 can include one or more sensors 13.7-112. It will be understood that throughout the disclosure, reference to "sensors" can refer to one or more sensors. The phrase "sensors" allows for, but does not necessarily require, multiple sensors. In some examples, the sensors 13.7-112 can be removably attached to the retention band 13.7-108. The retention band 13.7-108 can be removably attached to the display 13.7-104 and in electrical communication with the display 13.7-104. In other words, the sensors 13.7-112 can be in electrical communication with the display 13.7-104.

The sensor 13.7-112 of the retention band 13.7-108 can collect biometric information, such as brain activity and vital signs (including body temperature, pulse data, respiration data, and blood pressure). The sensor 13.7-112 can generate a signal based on the collected user information and transmit the signal to the processor 13.7-120 to be analyzed.

In some examples, the memory 13.7-106 can include programmed instructions responsive to the signals from the sensors 13.7-112. In some examples, the instructions can cause an output or feedback module to perform an action in response to the signal (i.e., in response to the biometric information collected by the sensor 13.7-112). In some examples, the retention band 13.7-108 itself provides feedback (e.g., through LEDs, tactile or haptic feedback, changing its shape, color, etc.) based on the collected biometric information.

For example, a user may be in a meditation or mental awareness session that is facilitated by the HMD 13.7-100. During the activity, the user's brain waves or other biometric may change in a way that is detectable by the sensors 13.7-112. The sensors 13.7-112 can generate one or more signals based on the received input. The sensors 13.7-112 can transmit the signals to the processor 13.7-120, which may cause an action by one or more components of the HMD 13.7-100 (e.g., to the display 13.7-104 to provide a visual feedback to the user). The display 13.7-104, being in electrical communication with the retention band 13.7-108, can receive electrical communication and provide feedback to the user related to their biometric readings (e.g., visual feedback, audio feedback, haptic feedback, etc.). Feedback can include determining when the user needs to take a break, or when the difficulty of an activity needs to be lowered or raised, the output can include scheduling various activities for the user or recommending adjustment of the HMD 13.7-100.

The sensors 13.7-112 can include a variety of different sensing devices. The sensors 13.7-112 can include, but are not limited to, brain activity sensors, a camera or imaging device, temperature device, oxygen device, movement device, brain activity device, sweat gland activity device, breathing activity device, muscle contraction device, etc. In some examples, the sensor can detect or sense biometric features including features of the autonomic nervous system.

Some particular examples of sensors include an electrooculography (EOG) sensor, electrocardiography (ECG or EKG) sensor, EEG (electroencephalography), photoplethysmography (PPG) sensor heart rate sensor, hear rate variability sensor, blood volume pulse sensor, oxygen saturation (SpO2) sensor, compact pressure sensor, electromyography (EMG) sensor, core-body temperature sensor, galvanic skin response (GSR) sensor, functional near-infrared spectroscopy (FNIR) sensor, functional magnetic infrared imaging (FMRI) sensor, non-contact passive infrared (IR) sensor, accelerometer, gyroscope, magnetometer, inclinometer, barometer, infrared sensor, global positioning system sensor, etc.

In some examples, the sensors 13.7-112 can include, contact microphones (e.g., pressure-based MEMS), bioelectrical activity sensors, UV exposure sensors, or particle sensors. In some examples, certain sensors can be used to assess stress and emotion. In some examples, the sensors can operate through coin cell battery or Bluetooth connectivity. In some examples, the sensors are powered by a primary battery of the HMD.

The sensors 13.7-112 described herein can allow for observations of the autonomic nervous system (ANS), to observe relaxation and stress indicators, mental health, medical treatments, etc. Using the sensors, physicians and care takers could have live feedback of biometrics. Use cases can include fitness settings, user content, workplace, telepresence, clinical, education, training, pain, therapy, etc. In some examples, the sensors can be used to capture facial expressions. This is particularly relevant given the user's face is covered by HMD. For example, the HMD could use MEMS or motion tracking sensors to detect facial expressions.

In some examples, the sensors 13.7-112 can be used to perform EEG detections. The sensors 13.7-112 can measure the electrical activity in the cerebral cortex (the outer layer of the brain). The sensors 13.7-112 can include electrodes that are placed on a participant's head, then the electrodes can non-invasively detect brainwaves from the subject. The EEG sensors 13.7-112 can record up to several thousands of snapshots of the electrical activity generated in the brain every second. The recorded brainwaves can be sent to amplifiers, then to the processor 13.7-120, a remote electronic device, or the cloud to process the data.

In some examples, the sensors 13.7-112 can be used to perform functional near-infrared spectroscopy (FNIR). The sensors 13.7-112 can use low levels of non-ionizing light to record changes in cerebral blood flow in the brain through the optical sensors 13.7-112 placed on the surface of the scalp. The signals can be recorded via flexible fiber optic cables.

The HMD 13.7-100 can be a wearable device can include electronic components that are communicatively coupled to each other and to the sensors 13.7-112 via a wired or wireless communications link. The communications link can be a physical connection, such as an electrical wire, or can be a wireless connection, such as Bluetooth, Wi-Fi, proximity sensors, etc. In some examples, the HMD 13.7-100 can be communicatively coupled to a companion electronic device, such as a remote, or a personal computing device such as a smart phone, a smart watch, a laptop, a tablet, an HMD, or any other form of electronic device. As described in further detail below, the signals from the sensors 13.7-112 can influence the HMD 13.7-100. For example, the sensors 13.7-112 can influence the visual information, content, style, frequency, and operation of the content provided by the sensors 13.7-212.

Any of the features, components, and/or parts, including the arrangements and configurations thereof shown in FIG. 13.7-1 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.7-1.

FIG. 13.7-2 shows a top view of a head-mountable device (HMD) 13.7-200. The HMD 13.7-200 can be substantially similar to, and can include some or all of the features of, the head-mountable devices described herein, such as HMD 13.7-100. The HMD 13.7-200 can include a display unit 13.7-204 and a retention band 13.7-208. The display unit 13.7-204 can include electronic components, such as a display, processor, memory, controller, battery, and other circuitry and electronics. The display unit 13.7-204 can include a frame or housing structurally supporting the electronic components. In some examples, the display 13.7-204 includes an opaque, translucent, transparent, or semi-transparent screen, including any number lenses, for presenting visual data.

The frame can at least partially border one or more edges of the display. In some examples, the frame can be configured to contact a user's head or face. In some examples, the frame blocks outside light and limits the peripheral view of the user. Various components of the display unit 13.7-204 can be housed within the frame. For example, the hardware and electronics which allow functionality of the HMD can be housed within the frame. In some examples, the frame can include attachment mounts for connecting the display unit 13.7-204 to the retention band 13.7-208. For example, the frame can include mechanical attachments, magnetic attachments, or any other suitable connector to attach the retention band 13.7-208 to the display unit 13.7-204.

The HMD 13.7-200 can be worn on the user's head such that the display unit 13.7-204 is positioned over the user's face and disposed over one or both of the user's eyes. In some examples, the retention band 13.7-208 can be positioned against (i.e., contacting or pressing against) the side and/or back of a user's head when worn. In some examples, the retention band 13.7-208 can be at least partially positioned above the user's ear or ears. In some examples, the retention band 13.7-208 can be positioned adjacent to the user's ear or ears. The display unit 13.7-204 and the retention band 13.7-208 can form a loop defining an aperture 13.7-205 for the user's head. It should be understood, however, that this configuration is just one example of how the components of an HMD 13.7-200 can be arranged, and that in some examples, a different number of connector straps and/or retention bands can be included.

In some examples, the retention band 13.7-208 includes a first sensor array **13.7-212*a* including one or more sensors. The sensor array 13.7-212*a* can be positioned on the back of the retention band 13.7-208, located to contact or be proximate the back of the user's head when the HMD 13.7-200 is donned by the user. In some examples, the retention band 13.7-208 includes a second sensor array 13.7-212*b* including one or more sensors. The second sensor array 13.7-212*b* can be positioned on a side strap or arm of the retention band 13.7-208, located to contact or be proximate the side of the user's head when the HMD 13.7-200 is donned by the user. In some examples, the first sensor array 13.7-212*a* and the second sensor array 13.7-212*b* are separate and distinct, both in form and functionality. The first sensor array 13.7-212*a* can include different sensors than the second sensor array 13.7-212*b***.

In some examples, the first sensor array **13.7-212*a* can translate or move along the retention band 13.7-208. For examples, the first sensor array 13.7-212*a* can slide from a first position on the retention band 13.7-208 (e.g., the back of the band) to a second position on the retention band 13.7-208 (e.g., the side strap). Translation of the sensor array 13.7-212*a* can be manually or automatically actuated. In the manner, the sensor array 13.7-212*a*** can move to monitor different regions of the user's head.

In some examples, the first sensor array **13.7-212*a* and the second sensor array 13.7-212*b* (collectively referred to as "sensors 13.7-212") include the same sensors and are considered part of a single array of sensors. The sensors 13.7-212 can be positioned on an interior surface 13.7-207 of the retention band 13.7-208. In some examples, the sensors 13.7-212 are positioned in the retention band 13.7-208 (i.e., between the interior surface 13.7-207 and the exterior surface 13.7-209. In some examples, the sensors 13.7-212 can span substantially across an entirety of a length of the retention band 13.7-208. As will be discussed in greater detail herein, the sensors 13.7-212 can be integrated with the retention band 13.7-208** in a variety of ways.

In some examples, the sensors 13.7-212 can be used to perform EEG detections. The sensors 13.7-212 can measure the electrical activity in the cerebral cortex (the outer layer of the brain). The sensors 13.7-212 can include electrodes that are placed on a participant's head, then the electrodes can non-invasively detect brainwaves from the subject. The EEG sensors 13.7-212 can record up to several thousands of snapshots of the electrical activity generated in the brain every second. The recorded brainwaves can be sent to amplifiers, then to the HMD computer, a remote electronic device, or the cloud to process the data.

In some examples, the sensors 13.7-212 can be used to perform functional near-infrared spectroscopy (FNIR). The sensors 13.7-212 can use low levels of non-ionizing light to record changes in cerebral blood flow in the brain through the optical sensors 13.7-212 placed on the surface of the scalp. The signals can be recorded via flexible fiber optic cables.

Any of the features, components, and/or parts, including the arrangements and configurations thereof shown in FIG. 13.7-2 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.7-2. Further details regarding the integration of sensors into an HMD retention band are described below with reference to FIG. 13.7-3.

FIG. 13.7-3 shows a cross-sectional side view of a head-mountable device (HMD) 13.7-300. The HMD 13.7-300 can be substantially similar to, and can include some or all of the features of, the head-mountable devices described herein, such as HMDs 13.7-100 and 13.7-200. In some examples, sensor(s) 13.7-312 positioned in/on the retention band 13.7-308 can be operatively coupled to one or more electronic components in the display unit 13.7-304. For example, the sensors 13.7-312 can be electrically coupled a power source, such as a battery 13.7-335 that is disposed within or on the housing of the display unit 13.7-304 via an electrical connection 13.7-311. The sensor 13.7-312 can be communicatively coupled with a processor 13.7-320 or other controller that is housed within the head-mountable device 13.7-300. The battery 13.7-335 and/or the processor 13.7-320 can be located with the housing of the display unit 13.7-304, located within the retention band 13.7-108, disposed exterior to the housing of the display unit 13.7-304 and the retention band 13.7-108, or combinations thereof. The sensor 13.7-312 can generate and transmit signals reflective of the biometrics of the user to the processor 13.7-320. The processor 13.7-320 can then cause commands or instructions to be issued.

Although the sensors 13.7-312 are shown as being connected to the battery 13.7-335 and the processor 13.7-320 through a wired connection 13.7-311, in some examples, the sensor 13.7-312 can wirelessly receive data and/or power from the battery 13.7-335 and/or processor 13.7-320 by any desired method or technology. In some examples, the sensors 13.7-312 can be communicatively coupled to an external device that is not located on the HMD 13.7-300.

Further, although the components of the wearable electronic device 13.7-300 are shown as being connected to one another at certain locations, it should be understood that any of the components of the HMD 13.7-300 can be electrically and/or mechanically connected to one or more of any of the other components of the HMD 13.7-300, in any manner and location, as desired.

In some examples, the retention band 13.7-308 can include other operational or functional components in addition to the sensors 13.7-312. For example, the retention band 13.7-108 can include a battery 13.7-335 that can be in electrical communication with the display unit 13.7-304 and/or the sensors 13.7-312.

Any of the features, components, and/or parts, including the arrangements and configurations thereof shown in FIG. 13.7-3 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.7-3.

FIG. 13.7-4A shows a rear perspective view of a retention band 13.7-408. The retention band 13.7-408 can be substantially similar to, and can include some or all of the features of, the retention bands described herein, such as retention bands 13.7-108, 13.7-208, and 13.7-308. While FIG. 13.7-4A illustrates the sensors 13.7-412 being visible on an exterior of the retention band 13.7-408, it will be understood that in some examples, the sensors 13.7-412 are concealed or hidden behind a cover or layer of the retention band 13.7-408. The sensors 13.7-412 can be configured to directly contact or touch the user's head. In some examples, the sensors 13.7-412 are non-contact sensors. In some examples, the retention band 13.7-408 is made up of multiple components. For example, the retention band 13.7-408 can include sidebands or arms 13.7-408*a* and a middle section or back 13.7-408*b* (collectively retention band 13.7-408). The back 13.7-408*b* can be connected at each end to the arms 13.7-408*a* via pivots 13.7-415.

In some examples, the sensors 13.7-412 can be interconnected (i.e., electrically connected) via wires 13.7-411. The wires 13.7-411 can further define a communications link between the display unit and the retention band 13.7-408. The sensors 13.7-412 can be disposed substantially across the entirety of the back 13.7-408*b* of the retention band 13.7-408. In some examples, the sensors 13.7-412 can be intentionally positioned to align with specific portions of the user's head when donned. As shown in greater detail with reference to FIG. 13.7-4B and 13.7-4C, the retention band 13.7-408 can be articulable. By adjusting, articulating, or moving the position of the retention band 13.7-408 relative to the HMD, the sensors 13.7-412 can be positioned at various regions of the user's head.

In some examples, the sensors 13.7-412 can include a grounding sensor. For example, one or more of the sensors 13.7-412 can be a grounding sensor that is used as a reference sensor. Detections from the sensors 13.7-412 can be compared against the grounding reference sensor to analyze the detections. In some examples, the sensors 13.7-412 can included rounded edges and/or elastomeric or soft material that is transparent to the signal produced by the sensors 13.7-412. The rounded edges and soft material can help to reduce discomfort when the sensors 13.7-412 are contacting the user's head. In some examples, the geometry of the sensors 13.7-412 can be specifically designed to assist in parting the user's hair to ensure efficient contact against the user's head. In some examples, the sensors move (e.g., vibrate, rotate or oscillate) to aid in proper contact against the user's skull.

In some examples, the retention band 13.7-408 is a specialized band that can be interchanged with other headbands that are customized for different uses. For example, there can be individual custom retention bands for education, sports, industrial applications, health, learning application, training application, etc. Each different retention band can be integrated with sensors specific for its needs.

In some examples, the retention band 13.7-408 can be detachable or removable from the HMD. In other words, the HMD can include a standard headband that is replaced or modified with the retention band 13.7-408. In some examples, the retention band 13.7-408 can be an add-on component that is added to the HMD when desired or needed. The retention band 13.7-408 can include electrical/mechanical attachment mechanisms to attach to the HMD. For example, the retention band 13.7-408 can include attachment mechanisms 13.7-418 that can electrically, mechanically, and or magnetically connect the retention band 13.7-408 to an HMD. In some examples, the retention band wirelessly connects to the HMD to transmit data. The retention band 13.7-408 can include its own power source and processing capabilities.

In some examples, the retention band 13.7-408 can be expandable to reveal additional sensors 13.7-412. For example, the retention band 13.7-408 can fold or overlap itself to reduce a surface area of the retention band 13.7-408. Then when desired, the retention band 13.7-408 can be stretched, unfolded, or expanded, revealing additional sensors that were previously covered.

FIG. 13.7-4B shows a side view of the retention band 13.7-408 rotated upward. As illustrated, the back 13.7-408*b* of the retention band 13.7-408 can rotate relative to the side arms 13.7-408*a* via the pivots 13.7-415. In some examples, the entire retention band 13.7-408 can rotate relative to a housing or frame of the HMD (i.e., the pivots 13.7-415 can be located on the HMD housing). Movement of the retention band 13.7-408 can be manual or automated. In some examples, the user is prompted, guided, or instructed to move the retention band 13.7-408 into a certain position or configuration. For example, the system may prompt the user to adjust the retention band 13.7-408 to optimize the ability of the sensors 13.7-412 to detect the desired biometric data. In this configuration the sensors 13.7-412 would be positioned at or near the top of the user's head.

In some examples, the HMD include multiple retention bands 13.7-408. For example, the HMD can include a back-of-the-head band that wrap around the back of the user's head, and an over-the-head band that wraps over the top of the user's head. Each of the bands can include the sensors described herein. In some examples, the retention band 13.7-408 can be a bifurcated strap with sensors on each bifurcated section to increase the coverage area of the sensors over the head.

FIG. 13.7-4C shows a side view of the retention band 13.7-408 rotated downward. As illustrated, the back 13.7-408*b* of the retention band 13.7-408 can rotate relative to the side arms 13.7-408*a* via the pivots 13.7-415. In some examples, the entire retention band 13.7-408 can rotate relative to a housing or frame of the HMD (i.e., the side straps 13.7-408*a* also rotate and the pivots 13.7-415 are located on the HMD housing). Movement of the retention band 13.7-408 can be manual or automated. In some examples, the user is prompted, guided, or instructed to move the retention band 13.7-408 into a certain position or configuration. For example, the system may prompt the user to adjust the retention band 13.7-408 downward to optimize the ability of the sensors 13.7-412 to detect the desired biometric data. In this configuration the sensors 13.7-412 would be positioned at or near the bottom of the user's head, near the top of the neck. In this configuration, the sensors 13.7-412 can be used to detect information about neck muscles. In some examples, the location or position of the retention band 13.7-408 can determine what type of analysis is performed by the processor. For example, the processor can interpret a signal differently based on the detected position of the retention band 13.7-408 relative to the HMD and/or user when the signal was acquired. In some examples, the signal analysis changes based on the region of the brain being monitored by the sensors 13.7-412. In some examples, operation of the sensors themselves changes based on the position of the retention band 13.7-408. For example, different sensors can be used when monitoring different areas of the brain, or different sensor emission/detections can be used based on the location of the sensors relative to the user. According to one example, a position detecting IMU, sensor, encoder, or the like can be positioned in the retention band 13.7-408 to detect the relative position of the band and generate a signal indicative of the position. The processor can then use that signal to determine the type of analysis to be performed on the data collected from the sensors 13.7-412.

Any of the features, components, and/or parts, including the arrangements and configurations thereof shown in FIGS. 13.7-4A-13.7-4C can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.7-4A-13.7-4C.

FIG. 13.7-5 illustrates a perspective exploded view of an HMD 13.7-500. The HMD 13.7-500 can be substantially similar to, and can include some or all of the features of, any of the HMDs described herein, such as HMD 13.7-100, 13.7-200, 13.7-300, and 13.7-500. The HMD 13.7-500 can include a display unit 13.7-504 and a retention band 13.7-508. The retention band 13.7-508 can include an inner portion 13.7-507 that contacts a user's head when worn, and an outer portion 13.7-509 at least partially defining an exterior surface of the wearable device 13.7-500. The outer portion 13.7-509 can be integrally formed with the inner portion 13.7-507. In other words, the inner portion 13.7-507 and the outer portion 13.7-509 can be made from a single piece of material (shown separated here for simplicity). In some examples, the outer portion 13.7-509 and the inner portion 13.7-507 can be coupled together, for example using adhesive, thread, or other coupling techniques.

In some examples, the HMD 13.7-500 can include a first sensor array **13.7-512*a* and a second sensor array 13.7-512*b* (collectively referred to as "sensors 13.7-512"). In some examples, the inner portion 13.7-507 can include a material that is transmissive to the sensors 13.7-512. The sensors 13.7-512 can be positioned between the inner portion 13.7-507 and the outer portion 13.7-509, such that the sensors 13.7-512 are positioned within the retention band 13.7-508. In some examples, the inner portion 13.7-507 of the retention band 13.7-508 can include a perforated section adjacent the sensors 13.7-512. The perforated section can include holes, gaps, or apertures formed in the material of the inner portion 13.7-507**.

The holes in the inner portion 13.7-507 can correspond to locations of the sensors 13.7-512 and can allow signals from the sensors, or the sensors themselves to pass through the holes. In other words, the sensors 13.7-512 can be exposed and accessible at the inner portion 13.7-507, for example, to contact the user's head. In some examples, the sensors 13.7-512 are embedded or sandwiched between the inner portion 13.7-507 and the outer portion 13.7-509 of the retention band 13.7-508. In some examples, the sensors 13.7-512 can be position adjacent a sensorally transparent or transmissive window 13.7-530 that allows for the transmission and reception of signals between the user's head and the sensors 13.7-512. The sensors 13.7-512 can be electrically coupled to an electronic component 13.7-520 in the display unit 13.7-504, such as a processor or battery, via one or more electrical connections 13.7-511.

In some examples, the sensor arrays 13.7-512 can flexible and capable of bending or curving to according to a shape of the retention band 13.7-508 on the user's head. In some examples, the sensors 13.7-512 include flex cables and/or optical fibers or fiber optic cables that are woven into the fabric of the retention band 13.7-508. In some examples, the retention band 13.7-508 can include conductive fibers woven into the fabric of the retention band 13.7-508.

The retention band 13.7-508 can be made from a flexible material and can securely and snuggly fit around a head of the user. The retention band 13.7-508 can be made from a woven fabric, leather, polymer, or any other material compatible with micro-perforations or having electromagnetic transmissive properties. In some examples, the retention band 13.7-508 can be made from silicone or thermoplastic polyurethane (TPU). In some examples, the retention band 13.7-508 can be made from compression molded materials, such as rubber. The sensors 13.7-512 can be integrated into the compression molded materials. In some examples, the retention band 13.7-508 is semi-rigid. For example, the retention band 13.7-508 can be rigid where the sensors 13.7-512 are located.

Any of the features, components, and/or parts, including the arrangements and configurations thereof shown in FIG. 13.7-5 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.7-5.

FIG. 13.7-6 shows a side or cross-sectional view of portion of a retention band 13.7-608. The retention band 13.7-608 can be substantially similar to, and can include some or all of the features of, the retention bands described herein, such as retention band 13.7-108, 13.7-208, 13.7-308, 13.7-408, and 13.7-508. The retention band 13.7-608 can include one or more sensors **13.7-612*a*, 13.7-612*b*, and 13.7-612*c* (collectively referred to as "sensors 13.7-612"). The sensors 13.7-612 can be partially or entirely embedded or encapsulated in the retention band 13.7-608. The retention band 13.7-608 can include a first, interior surface 13.7-607 facing the user's head when donned, and a second, exterior surface 13.7-609 facing away from the user and defining an exterior of the retention band 13.7-608. In some examples, the first surface 13.7-607** directly contacts or touches the user's head when the HMD is donned or being worn by the user.

The sensor **13.7-612*a* can be positioned on the exterior surface 13.7-609 of the retention band 13.7-608. In some examples, the first surface 13.7-607 can define an interior and the second surface 13.7-609 can be an exterior of the retention band 13.7-608. Thus, the sensor 13.7-612*a* can be positioned on an exterior of the retention band 13.7-608. In some examples, the retention band 13.7-608 can include a sensor 13.7-612*b* that is embedded, encapsulated, or otherwise surrounded by the retention band 13.7-608. The retention band 13.7-608 can include, a sensor 13.7-612***c* that is positioned such that a portion of the sensor 13.7-612*c* is exposed through the inner surface 13.7-607. In other words, the sensor 13.7-612*c* can at least partially define an interior of the retention band 13.7-608 and can directly contact or touch the user's head. In some examples, the sensor 13.7-612*c* can be partially surrounded or embedded in the retention band 13.7-608. In some examples, the sensor 13.7-612*c* is externally attached to the retention band 13.7-608, positioned on the interior of the retention band 13.7-608.

The sensors 13.7-612*a* and 13.7-612*b* can have corresponding sensor areas 13.7-625*a*, 13.7-625*b*, respectively. The sensor areas 13.7-625*a*, 13.7-625*b* can represent a field of view or cone of influence that is transparent to a signal emitted by the sensors 13.7-612*a*, 13.7-612*b*. In some examples, the field of view of the sensors 13.7-612 can be approximately 50 degrees. The sensors 13.7-612*a*, 13.7-612*b* can detect physiological, biological, and/or biometric changes of the user's body through corresponding sensor areas 13.7-625*a*, 13.7-625*b*. For example, the sensors 13.7-612*a*, 13.7-612*b* can detect changes to a user through the material of the retention band 13.7-608. Other sensors may be added or substituted, as may be desired. In some examples, the sensor areas 13.7-625*a*, 13.7-625*b* can include a different material than the rest of the retention band 13.7-608. For example, the sensor areas 13.7-625*a*, 13.7-625*b* can be transparent to certain signals from the sensors 13.7-612*a*, 13.7-612*b* or from the user, while the remainder of the retention band 13.7-608 is not transparent or transmissive to such signals.

In some instances, the closer positioning of sensor 13.7-612*b* to the first surface 13.7-607 than the sensor 13.7-612*a* can correspondingly reduce the field of view 13.7-625*b*. In some examples, the sensor 13.7-612*c* may be flush with the inner surface 13.7-607 and/or directly contacting a user's head. This is only one example of sensor depth variation, as a plurality of sensors can be disposed on the first surface 13.7-607 of the retention band 13.7-608, or between the first surface 13.7-607 and the second surface 13.7-609 of the retention band 13.7-608.

Any of the features, components, and/or parts, including the arrangements and configurations thereof shown in FIG. 13.7-6 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.7-6.

13.8: Conductive Fabric Architecture

In some examples, a head mountable device includes a display, a housing at least partially surrounding the display, a facial interface attached to the housing, and a cover positioned between the housing and the facial interface, the cover including a conductive fabric.

In some examples of the head-mountable device, the facial interface directly contacts a face of a user, the cover blocks ambient light, the conductive fabric elastically deforms in response to a movement of the cover, and an electrical property of the conductive fabric detectably changes in response to the movement.

In additional examples, the conductive fabric is elastic. Additionally, the conductive fabric can be interwoven with the cover. During use, the geometry of the conductive fabric can change in response to a user input. In other examples, the conductive fabric is configured to detect a change in a distance between the housing and the facial interface. In yet other examples, the conductive fabric forms a serpentine pattern. In some instances, the conductive fabric includes an array of parallel conductive threads arranged perpendicular to a direction of deformation of the cover, and a distance between two of the parallel conductive threads changes in response to a facial movement of a user. The conductive fabric can include a user input member.

In some examples, a wearable electronic device can include a display, a frame at least partially surrounding the display, and a light-blocking material attached to the frame, the light-blocking material including a conductive fabric.

In some examples the conductive fabric elastically deforms in response to a facial movement of a user. Additionally, a capacitance of the conductive fabric can detectably change in response to a deformation of the conductive fabric. In some examples, the conductive fabric includes or acts as a switch. In other examples, the conductive fabric electrically connects a first electronic component and a second electronic component. In other examples the conductive fabric directly contacts a user's skin. In some instances the conductive fabric includes a touch-sensitive input member.

In other embodiments a facial interface for a head-mountable device can include a facial contact, a conductive component incorporated into the facial contact, the conductive component configured to generate a signal based on a change in a capacitance of the conductive component, and a processor connected to the conductive component.

In some examples the facial contact is positioned adjacent a nasal region when the head-mountable device is worn by a user. In other examples, the conductive component is configured to detect a facial expression.

The following embodiments relate to a light seal of a head-mountable device including conductive fabric. As used herein "conductive fabric" can refer to the material or fabric into/onto which conductive elements are incorporated, or can also refer to the conductive elements themselves, separate from the material or fabric with which they are integrated. The conductive fabric can act as sensors, input members, and electrical interconnects to enable sensors and other electronic components to interact with one another. An input member can be any button, switch, capacitive surface, dial, slider, or other physically activated input system that can be used to provide an indication to a processor of a user's intent.

Conventional head-mountable devices equipped with sensors are utilized for various purposes that detect limited user feedback, such as movement or positioning feedback, providing limited information in response to the user. These conventional sensors and electrical interconnects are often located in non-ideal and burdensome locations, taking up much needed space and unable to seamlessly integrated with the existing HMD architecture.

By contrast, the head-mountable device of the present disclosure includes a light seal with conduct fabric that collects user information, captures changes in user motion, such as facial movements, and can receive user input, such as touch input. The conductive fabric can accomplish this while being unobtrusively integrated with the light seal. A head-mountable device with such conductive fabrics accomplishes increased functionality without adding burdensome components or structures.

There are a number of different uses for "smart" conductive fabric described herein. For example, the disclosed conductive fabrics can be used for: detecting respiration patterns and amplitudes, receiving user input (such as touch/force inputs and playback controls), detecting facial expressions, detecting tension or force on a user's face from the facial interface and/or headband support, raising or lowering the temperature of the light seal, moisture detection, and low power "on-head" detection of when the HMD is being handled or worn by the user.

These and other embodiments are discussed below with reference to FIGS. 13.8-1A-13.8-7. However, those skilled in the art will readily appreciate that the detailed description given herein with respect to these Figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 13.8-1A illustrates a block diagram of a head-mountable device 13.8-100 including a frame 13.8-104, a display 13.8-105, a support 13.8-109, and a light seal 13.8-112. The display 13.8-105 can include one or more optical lenses or display screens in front of the eyes of a user. The display 13.8-105 can include a display for presenting an augmented reality visualization, a virtual reality visualization, or other suitable visualization. Additionally, the display 13.8-105 can be positioned at least partially in or on the frame 13.8-104. Similarly, the light seal 13.8-112 can be connected to the frame 13.8-104. In some examples, the light seal 13.8-112 includes the frame 13.8-104 (i.e., the frame 13.8-104 is part of the light seal 13.8-112).

The light seal 13.8-112 can include electrical components (e.g., sensors 13.8-120), a cover 13.8-113, a facial interface 13.8-108, and conductive fabric 13.8-116. The frame 13.8-104 can be a housing of the display 13.8-105. Further, the frame 13.8-104 can also be considered to be a part of or separate from the light seal 13.8-112. As used herein, the term "light seal" can refer to a portion of the head mountable device 13.8-100 that engages or shields a user's face. In particular, the light seal 13.8-112 includes portions (e.g., the facial interface) that conform to, contact, or press against regions of the user's face.

The light seal 13.8-112 can include a pliant (or semi-pliant) facetrack or face engagement component that spans the forehead, wraps around the eyes, contacts other regions of the face (e.g., zygoma and maxilla regions), and bridges the nose. In addition, the light seal 13.8-112 can include various components forming a frame, structure, or webbing of a head-mountable device disposed between the display 13.8-105 and the user's skin, such as the cover 13.8-113. The cover 13.8-113 can include a seal, environment seal, dust seal, air seal, etc. that is positioned between the gap between the display 13.8-105 and the user's face. The cover 13.8-113 can be a woven fabric that is non-rigid or deformable. The cover 13.8-113 can be elastically deformable. In some examples, the cover 13.8-113 can be a plastic, rubber, or polymer material. In some examples, the cover 13.8-113 can be rigid.

The cover 13.8-113 can form an eye-box through which the user can view the display 13.8-105. It will be appreciated that the term "seal" can include partial seals or inhibitors, in addition to complete seals (e.g., a partial light seal where come ambient light is blocked and a complete light seal where all ambient light is blocked when the head-mountable device 13.8-100 is donned).

The light seal 13.8-112 can be removeably attached to the frame 13.8-104 and in electrical communication with the display 13.8-105. The light seal 13.8-112 can include an electrical component 13.8-120, such as a sensor 13.8-120. The sensor 13.8-120 can collect user or environmental data, such as biometric information. The sensor 13.8-120 can transmit signals to the HMD, and more particularly to the display 13.8-105. The sensor 13.8-120 can transmit signals to an output configured to perform an action in response to the information collected by the sensor 13.8-120.

The light seal 13.8-112 can include conductive fabric 13.8-116. In some examples, the conductive fabric 13.8-116 can include highly elastic copper threads that can compress and stretch while still maintaining electrical connectivity. The conductive fabric 13.8-116 can be elastically deformable (i.e., capable of temporary change in length, volume, or shape). In some examples, the conductive fabric 13.8-116 can include electrically conductive carbon fibers. In some examples, the conductive fabric 13.8-116 can collect biometric information of the user. More specifically, the biometric information of the user can manifest itself in movement of the user's face (e.g., nasal movements indicative of respiration or breathing patterns). These movement can cause a change in the conductive fabric (i.e., stretching or compressing). The degree or amount to which the conductive fabric is moved by the user's facial movements can be detectable by the conductive fabric and can be used to generate signals that can be analyzed by a processor of the HMD 13.8-100. As described in greater detail below, the conductive fabric can be a thread, line, wire, plate, or any other structure that is capable of conducting electricity. The conductive fabric 13.8-116 can be integrated with the light seal 13.8-112. For example, the conductive fabric 13.8-116 can be embedded, interwoven, or encapsulated with the cover 13.8-113 or facial interface 13.8-108.

The display 13.8-105, being in electrical communication with the light seal 13.8-112, and more specifically with the conductive fabric 13.8-116, can receive electrical communication and provide feedback to the user related to the readings of the readings of the conductive fabric 13.8-116 (e.g. visual feedback, audio feedback, haptic feedback, etc.).

As used herein, the term "sensor" refers to one or more different sensing devices, such as a camera or imaging device, temperature device, oxygen device, movement device, brain activity device, sweat gland activity device, breathing activity device, muscle contraction device, etc. In some examples, the sensor can sense biometric features including features of the autonomic nervous system. Some particular examples of sensors include an electrooculography sensor, electrocardiography sensor, EKG sensor, hear rate variability sensor, blood volume pulse sensor, SpO2 sensor, compact pressure sensor, electromyography sensor, core-body temperature sensor, galvanic skin sensor, accelerometer, gyroscope, magnetometer, inclinometer, barometer, infrared sensor, global positioning system sensor, etc. Additional sensor examples can include, contact microphones (e.g., press based MEMS), bioelectrical activity sensors, UV exposure sensors, or particle sensors.

Any of the features, components, and/or parts, including the arrangements and configurations thereof shown in FIG. 13.8-1A can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.8-1A.

FIG. 13.8-1B shows a top partial view of a head-mountable device 13.8-100. The head-mountable device 13.8-100 of FIG. 13.8-1 can be substantially similar to, including some or all of the features of, the head-mountable device 13.8-100 described in FIG. 13.8-1A. The HMD 13.8-100 can include a display (also referred to as a display unit, or housing) 13.8-105 and a retention band 13.8-109. The display 13.8-105 can include any number of internal electronic components 13.8-107. The HMD 13.8-100 can include a frame 13.8-104 (which can also be referred to as a housing) attached to the display 13.8-105. In some examples, the display 13.8-105 includes an opaque, translucent, transparent, or semi-transparent screen, including any number lenses, for presenting visual data. The frame 13.8-104 can at least partially border one or more edges of the display 13.8-105. The frame 13.8-104 can be attached to a cover 13.8-128 at one end of the cover 13.8-128. At an opposite end, the cover 13.8-128 can form, or be attached to, a facial interface 13.8-108. In some examples, the frame 13.8-104, cover 13.8-113, and facial interface 13.8-108 can together form the light seal 13.8-112. It will be understood, however, that the light seal 13.8-112 can include fewer or more components that those listed or shown.

The HMD 13.8-100 can be worn on a user's head 13.8-102 such that the display 13.8-105 is positioned over the user's face and disposed over one or both of the user's eyes. The display 13.8-105 can be connected to the retention band 13.8-109 and/or the light seal 13.8-112. In some examples, the retention band 13.8-109 can be positioned against the side of a user's head 13.8-102 and in contact therewith. In some examples, the retention band 13.8-109 can be at least partially positioned above the user's ear or ears. In some examples, the retention band 13.8-109 can be positioned adjacent to the user's ear or ears. The retention band 13.8-109 can extend around the user's head 13.8-102. In this way, the display 13.8-105 and the retention band 13.8-109 can form a loop that can retain the wearable electronic device 13.8-100 on the user's head 13.8-102. It should be understood, however, that this configuration is just one example of how the components of a modular wearable electronic device 13.8-100 can be arranged, and that in some examples, a different number of connector straps and/or retention bands can be included. Although the particular component 13.8-100 can be referred to as an HMD, it should be understood that the terms wearable device, wearable electronic device, HMD, HMD device, and/or HMD system can be used to refer to any wearable device, including smart glasses.

In some examples, the frame 13.8-104 is attached to a facial interface 13.8-108. The facial interface 13.8-108 can contact a user's head and/or face. In some examples, the cover 13.8-113 can be a light blocking component that extends between the frame 13.8-104 and the facial interface 13.8-108. The light blocking component can cover or surround a perimeter of the frame 13.8-104 and/or the facial interface 13.8-108.

The cover 13.8-113 can be a cloth, fabric, woven material, plastic, rubber, or any other suitable opaque or semi-opaque material. In some examples, the cover 13.8-113 is flexible, having the ability to repeatedly stretch, compress, and deform. The cover 13.8-113 can be elastically or in-elastically deformable. The facial interface 13.8-108 in combination with the cover 13.8-113 can block outside light and limits the peripheral view of the user 13.8-102. In some examples, the cover 13.8-113 and the facial interface 13.8-108 is the same or a unitary component. As will be discussed in greater detail below, the light seal 13.8-112 can include a conductive fabric that is able to serve multiple functions and provide added benefits and functionality to the HMD 13.8-100.

Any of the features, components, and/or parts, including the arrangements and configurations thereof shown in FIG. 13.8-1B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.8-1B.

FIG. 13.8-2 shows a bottom perspective view of select components of a light seal 13.8-212. The light seal 13.8-212 can be substantially similar to, including some or all of the features of, the light seals described herein, such as light seal 13.8-112. The light seal 13.8-212 can be implemented on an HMD, such as HMD 13.8-100.

The light seal 13.8-212 can be integrated with conductive fabrics 13.8-216*a*, 13.8-216*b*, 13.8-216*c*, 13.8-216*d*, and 13.8-216*e* (collectively referred to as conductive fabric 13.8-216). The conductive fabric 13.8-216 or thread can be positioned at various locations on the light seal 13.8-212. For example, the conductive fabric 13.8-216 can be positioned on or in the cover (e.g., embedded, encapsulated, or interwoven into the cover)

In some examples, the conductive fabric 13.8-216 can be positioned on the facial interface 13.8-208 of the light seal 13.8-212. In one example, the conductive fabric 13.8-216 can be in direct contact with a user, for example, touching a user's forehead, cheek, nose, temple region, back of the head, or at any location where the HMD contacts the user.

The light seal 13.8-212 can include a nasal region 13.8-218 that is configured to contact a user's nose. The nasal region 13.8-218 can be considered part of the facial interface 13.8-208 and/or the cover 13.8-213, or can be its own separate section of the light seal 13.8-212. The nasal region 13.8-218 can include two sections corresponding to each side of a user's nose. As illustrated in FIG. 13.8-2, conductive threads 13.8-216*a* can be positioned in the nasal region 13.8-218. In some examples, the conductive thread 13.8-216*a* is a single continuous wire that spans the nasal region 13.8-218 (i.e., both sides of the nose and across the bridge of the nose). In some examples, each side of the nasal region 13.8-218 of the light seal 13.8-212 can include separate or distinct conductive threads 13.8-216*a*.

The conductive thread 13.8-216*a* can be intentionally located to detect movements of the user's nose. For example, when a user breathes, the nose can move a certain amount based on the intensity or amplitude of the breath. This movement can in turn cause the nasal region 13.8-218 of the light seal 13.8-212 to change shape or move (e.g., compress or stretch). The conductive thread 13.8-216*a* can be ideally positioned such that as the nasal region 13.8-218 moves in response to nasal movements. The conductive threads 13.8-216 are likewise stretched or compressed by nasal movements.

The movement of the conductive thread 13.8-216*a* can result in a detectable change in the conductivity and/or capacitance of the conductive threads 13.8-216, which can be used to infer respiration or facial expression data. As used herein "detectable" can refer to a change in a signal generated by the conductive fabric that is able to be recognized and analyzed by a processor. In some examples, the conductive threads 13.8-216 can directly contact the user's nose and can be impacted by the capacitance of the user's nose. In some examples, the conductive threads 13.8-216*a* are embedded, encapsulated, or interwoven into the material of the nasal region (i.e., the fabric of the cover 13.8-213 and/or the facial interface 13.8-208) such that the conductive threads 13.8-216*a* do not directly contact the user's skin, but still respond to movements of the user's face relative to the light seal 13.8-212.

The light seal 13.8-212 can include a forehead region that is configured to contact a user's forehead when the HMD is donned by the user. The forehead region can be impacted (e.g., moved by) movements of the user's forehead and/or eyebrows. As illustrated in FIG. 13.8-2, conductive threads 13.8-216*d* can be positioned in the forehead region of the cover 13.8-213. In some examples, the conductive thread 13.8-216*d* is a single continuous wire that spans a substantial portion of the forehead region. In some examples, the forehead region of the cover 13.8-213 includes multiple conductive threads 13.8-216*d* (e.g., one over each eyebrow).

The conductive thread 13.8-216*d* can be intentionally located to be able to detect movements of the user's forehead and/or eyebrows. For example, a user's facial expression can be inferred from the position and movements of the forehead. This movement can in turn result in movements of the light seal 13.8-212. The conductive thread 13.8-216*d* can be ideally positioned such that as the forehead moves, the conductive thread 13.8-216*d* are likewise stretched or compressed. This movement of the conductive thread 13.8-216*d* can result in a detectable change in an electrical property (e.g., conductivity and/or capacitance) of the conductive thread 13.8-216*d*, which can be used to infer biometric information, such as facial expressions. In some examples, the conductive threads 13.8-216*d* can directly contact the user's skin and can be excited by the capacitance of the user's skin. In some examples, the conductive threads 13.8-216*d* are embedded, encapsulated, or interwoven into the material of the nasal region (i.e., the fabric of the cover 13.8-213 and/or the facial interface 13.8-208) such that the conductive threads 13.8-216*d* do not directly contact the user's skin, but still respond to movements of the user's face relative to the light seal 13.8-212.

The light seal 13.8-212 can include a facial interface 13.8-208 that is configured to directly contact and conform against the user's face when the HMD is donned by the user. The facial interface 13.8-208 can be a distinct components from the cover 13.8-213 or can be a single unitary piece of the cover 13.8-213. For example, the facial interface 13.8-208 can include foam that is attached to the cover 13.8-213. The facial interface can be impacted (e.g., moved by) movements of the user's face. As illustrated in FIG. 13.8-2, conductive threads 13.8-216*e* can be positioned in/on the facial interface 13.8-208.

The conductive thread 13.8-216*e* can be intentionally located to be able to detect movements of the user's face. Movement of the user's face can transfer to movement of the facial interface 13.8-208 and movements of the conductive thread 13.8-216*e*, resulting in a detectable change in an electrical property (e.g., conductivity and/or capacitance) of the conductive thread 13.8-216*e*. In some examples, the conductive threads 13.8-216*e* can directly contact the user's skin and can be excited by the capacitance of the user's skin. In some examples, the conductive threads 13.8-216*e* are embedded, encapsulated, or interwoven into the material of the facial interface such that the conductive threads 13.8-216*e* do not directly contact the user's skin, but still respond to movements of the user's face relative to the light seal 13.8-212. In some examples, the conductive fabric 13.8-216*e* can be interwoven into the facial interface 13.8-208 while still being exposed and capable of contacting the user's face.

The light seal 13.8-212 can include one or more electronic components 13.8-220. The electronic component 13.8-220 can be any form of module, sensor, unit, input, or output that performs a function of the light seal 13.8-212 and/or the HMD. For example, the component 13.8-220 can be a battery, processor, haptic actuator, LED, display, speaker, biometric sensor, etc.

The component 13.8-220 can be positioned at various locations on the light seal 13.8-212. The component 13.8-220 can be positioned on or in the cover (e.g., embedded, encapsulated, or interwoven into the cover). In some examples, the component 13.8-220 can be positioned on the facial interface 13.8-208 or the frame of the light seal 13.8-212. In one example, the component 13.8-220 can be in direct contact with a user, for example, touching a user's forehead, cheek, nose, temple region, back of the head, or at any location where light seal 13.8-212 contacts the user's head.

In some examples, a conductive fabric 13.8-216*c* can be electrically connected to the component 13.8-220. The conductive fabric 13.8-216*c* can be an interconnect to electrically connect the components with another component of the HMD. In some examples, the component 13.8-220 is a processor configured to analyze the signals transmitted/generated by the conductive thread 13.8-216*c*.

Any of the features, components, and/or parts, including the arrangements and configurations thereof shown in FIG. 13.8-2 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.8-2.

FIG. 13.8-3 shows a top view of a head-mountable device (HMD) 13.8-300. The HMD 13.8-300 can be substantially similar to, including some or all of the features of, the devices described herein, such as HMD 13.8-100 and light seal 13.8-212. In some examples, the HMD 13.8-300 can include an electronic module 13.8-307. The electronic module 13.8-307 can be positioned on or housed in the display unit 13.8-305. The electronic module 13.8-307 can be a battery, a processor, a display, a camera, or any other electronic component. In some examples the electronic module 13.8-307 can be attached to the frame 13.8-304. The electronic module 13.8-307 can be in electrical communication with an electronic component 13.8-320 attached to the light seal 13.8-312.

In some examples, the electronic component 13.8-307 and the electronic module 13.8-320 can be electrically connected by a conductive fabric 13.8-316*a* that runs through the cover 13.8-313 of the light seal 13.8-312. In some examples, the conductive fabric 13.8-316*a* runs through or across the headband or support 13.8-309. In some examples, the conductive fabric 13.8-316*a* runs through or across the frame 13.8-304. In this manner, the conductive fabric 13.8-316*a* serves as an interconnect (i.e., electrical connection) between the electronic component 13.8-320 on the light seal 13.8-312 and the electronic module 13.8-307. In some examples, the detections of the conductive fabrics 13.8-216 can be combined with other sensors on-board or remote from the HMD 13.8-300 to gather data is a sensor fusion manner. For example, the conductive threads in combination with user facing cameras can be used for facial expression detection.

In some examples, the HMD 13.8-300 can include a conductive fabric 13.8-316*b* incorporated onto and/or into the support 13.8-309 of the HMD 13.8-300. The support 13.8-309 can be a headband having flexible sections. The conductive fabric 13.8-316*b* can be configured to stretch or compress in response to the headband 13.8-309 stretching or compressing. In some examples, the conductive fabric 13.8-316*b* can generate signals indicative of the tightness or position of the headband. In some examples, a user can be notified based on the signals generated by the conductive fabric 13.8-316*b*. The headband 13.8-309 can be automatically adjusted based on the signals generated by the conductive fabric 13.8-316*b*.

Any of the features, components, and/or parts, including the arrangements and configurations thereof shown in FIG. 13.8-3 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.8-3.

FIG. 13.8-4A shows a conductive fabric 13.8-416 in a neutral or rest state. In some examples, the conductive fabric 13.8-416 is positioned in a serpentine pattern (curving, undulating, or winding in a repeated pattern). As illustrated in FIG. 13.8-4A, in a rest or neutral state (i.e., when no external forces are acting on the conductive fabric 13.8-416, the nodes or peaks of the conductive fabric 13.8-416 can be a distance $d_1$ from each other. The distance $d_1$ can be visualized as the wavelength or distance between parallel sections of the conductive fabric 13.8-416.

By monitoring the electrical current passing through the conductive fabric, a processor can determine the amount and direction of strain the fabric is experiencing. In some examples, the conductive fabric 13.8-416 arranged in a serpentine pattern can be excited using a 100-140 kHz sine or square wave to generate a capacitive field. The system can then monitor for changes in the alternating current (AC) component over time (e.g., to determine respiration data). In some examples, a frequency sweep is performed to acquire a frequency/phase dependent signal.

In some examples, the geometry or shape of conductive threads 13.8-416 can be tuned depending on what is being monitored and the required sensitivity levels. In some examples, the system primarily monitors the change in capacitance of the conductive threads 13.8-416.

FIG. 13.8-4B shows the conductive fabric 13.8-416 in a compressed state. The compressed state may be the result of the light seal (such as the cover and/or facial interface) being acted upon by the user. In the compressed state, the distance separating the peaks or the parallel sections of the conductive fabric is a distance $d_2$. The distance $d_2$ can be less than the distance $d_1$. As a result, the conductive properties (e.g., capacitance) of the conductive fabric can change in a detectable manner. Thus, it can be determined that the conductive fabric 13.8-416 is compressed and even the degree to which the conductive fabric 13.8-416 is compressed. From this, biometric information, facial expression, breathing patterns, user input, and other user information can be determined.

FIG. 13.8-4C shows the conductive fabric 13.8-416 in a stretched state. The stretched state may be the result of the light seal (such as the cover and/or facial interface) being acted upon by the user. In the stretched state, the distance separating the peaks or the parallel sections of the conductive fabric is a distance $d_3$. The distance $d_3$ can be greater than the rest distance $d_1$. As a result, the conductive properties of the conductive fabric change in a detectable manner as the area and geometry of the conductive fabric 13.8-416 is modified. Thus, it can be determined that the conductive fabric 13.8-416 is stretched and even the degree to which the conductive fabric 13.8-416 is stretched. From this, biometric information, facial expression, breathing patterns, user input, and other user information can be determined.

Any of the features, components, and/or parts, including the arrangements and configurations thereof shown in FIGS. 13.8-4A-13.8-4C can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.8-4A-13.8-4C.

FIG. 13.8-5A shows a conductive component 13.8-516*a* on an exterior 13.8-517 of a cover 13.8-513. The conductive component 13.8-516*a* can be substantially similar to, including some or all of the features of, the conductive fabrics described herein, such as conductive fabric 13.8-216, 13.8-316, and 13.8-416. As described herein, a light seal can include a cover 13.8-513 that extends between the HMD and the user's face. The cover 13.8-513 can define a hollow, aperture, or opening that forms an internal volume or eye-box. The cover 13.8-513 can therefore include an internal or interior surface 13.8-515 that defines the internal volume, and an exterior surface 13.8-517 that defines an exterior of the light seal.

As illustrated in FIG. 13.8-5A, the conductive component 13.8-516*a*, can be positioned on the exterior surface 13.8-517. In some examples, the conductive component 13.8-516*a* at least partially defines the exterior of the light seal. In some examples, the conductive component 13.8-516*a* is accessible to the user from the exterior of the HMD. For example, the conductive component 13.8-516*a* can be responsive to a user's touch or deformation of the conductive component 13.8-516*a*. In this manner, a user who is wearing the HMD can control or provide input by touch (e.g., tapping or sliding a finger) or physically manipulation (e.g., deforming) the conductive component 13.8-516*a* with their hand. The conductive component 13.8-516*a* can be attached to the cover 13.8-513 using any suitable methods, including but not limited to adhesion, molding, mechanical fasteners, friction, weaving, magnets, etc.

FIG. 13.8-5B shows a conductive component 13.8-516*b* interwoven into the cover 13.8-513. The conductive component 13.8-516*b* can be substantially similar to, including some or all of the features of, the conductive fabrics described herein, such as conductive fabric 13.8-216, 13.8-316, 13.8-416, and 13.8-516*a*. As described herein, a light seal can include a cover 13.8-513 that extends between the HMD and the user's face. The cover 13.8-513 can be made from a fabric or material having a thickness within which the conductive component 13.8-516*b* can be deposited.

As illustrated in FIG. 13.8-5B, the conductive component 13.8-516*b*, can be positioned in (e.g., surrounded, encapsulated, embedded, interwoven, etc.) the cover 13.8-513. In some examples, the conductive component 13.8-516*b* at least partially defines the exterior of the light seal. In some examples, at least a portion of the conductive component 13.8-516*b* is accessible to the user from the exterior of the HMD, even while being woven into the cover 13.8-513. For example, the conductive component 13.8-516*b* can be responsive to a user's touch or deformation of the conductive component 13.8-516*b*. In this manner, a user who is wearing the HMD can control or provide input by touch or physically manipulation the conductive component 13.8-516*b* (e.g., with their hand). The conductive component 13.8-516*b* can be attached to the cover 13.8-513 using any suitable methods, including but not limited to adhesion, molding, mechanical fasteners, friction, weaving, magnets, etc. Further, it will be understood that as the cover 13.8-513 is deformed (e.g., by movements of the user's face) the embedded or interwoven conductive component 13.8-516*b* can likewise be deformed. This deformation change the conductive properties of the conductive component 13.8-516*b* is a detectable manner, which can then cause the HMD to perform an action.

FIG. 13.8-5C shows a conductive component 13.8-516*c* on an interior 13.8-515 of the cover 13.8-513. The conductive component 13.8-516*c* can be substantially similar to, including some or all of the features of, the conductive fabrics described herein, such as conductive fabric 13.8-216, 13.8-316, 13.8-416, 13.8-516*a*, and 13.8-516*b*. As described herein, a light seal can include a cover 13.8-513 that extends between the HMD and the user's face. The cover 13.8-513 can define a hollow, aperture, or opening that forms an internal volume or eye-box. The cover 13.8-513 can therefore include an internal or interior surface 13.8-515 that defines the internal volume, and an exterior surface 13.8-517 that defines an exterior of the light seal.

As illustrated in FIG. 13.8-5C, the conductive component 13.8-516*c*, can be positioned on the interior surface 13.8-515. In some examples, the conductive component 13.8-516*c* at least partially defines the interior surface of the light seal. In some examples, the conductive component 13.8-516*c* is accessible to the face of the user from the interior of the light seal. For example, the conductive component 13.8-516*c* can be responsive to a user's facial touch or movements. The conductive component 13.8-516*c* can be attached to the cover 13.8-513 using any suitable methods, including but not limited to adhesion, molding, mechanical fasteners, friction, weaving, magnets, etc.

FIG. 13.8-5D shows free-floating conductive components. In some examples, the light seal includes a continuous conductive plate 13.8-519 free-floating (i.e., not anchored) in/on the cover 13.8-513 in a position that cover, overlays, overlaps, or is adjacent to conductors 13.8-521 deposited in the cover 13.8-513. In this manner, the deposited conductors 13.8-521 can freely move and still provide signals representative of the deformations of the cover 13.8-513, even if not galvanically connected to the plate 13.8-519. It will be understood that a light seal can include multiple conductive components, conductive fabrics, and plates. For example, a cover 13.8-513 can include one or more of the conductive component arrangements described with reference to FIGS. 13.8-5A-13.8-5D. In some examples, the conductive components includes metal material that is deposited (e.g., using laser direct structuring (LDS) methods) onto fabric of the cover and/or facial interface. In some examples, the conductive components could be a combination of rigid and flexible conductive materials.

Any of the features, components, and/or parts, including the arrangements and configurations thereof shown in FIGS. 13.8-5A-13.8-5D can be included, either alone or in any combination, in any of the other examples of devices, features, components, and parts shown in the other figures, including in any of FIGS. 13.8-5A-13.8-5D, described herein. Likewise, any of the features, components, and/or parts, including the arrangements and configurations thereof shown and described with reference to the other figures can be included, either alone or in any combination, in the example of the devices, features, components, and parts shown in FIGS. 13.8-5A-13.8-5D.

FIG. 13.8-6 shows a side perspective view of a light seal 13.8-612. The light seal 13.8-612 can be substantially similar to, including some or all of the features of, any of the light seals described herein, such as light seal 13.8-112, 13.8-212, and 13.8-312. The light seal 13.8-612 can include a frame 13.8-604 configured to attached to a display unit, a facial interface 13.8-608 configured to contact and conform to a user's face, and a cover 13.8-613 extending between the frame 13.8-604 and the facial interface 13.8-608 and establishing a light-blocking component or shielding.

The cover 13.8-613 can include a first conductive fabric 13.8-616*a* that is connected to the cover 13.8-613 in a fashion described herein. The first conductive fabric 13.8-616*a* can include a wire or thread arranged in a generally serpentine pattern or in a zig-zag pattern. In some examples, the first conductive fabric 13.8-616*a* can include a geometry that is responsive to (i.e., prone to move) force in the vertical direction (as oriented in FIG. 13.8-6).

The configuration of the conductive fabric 13.8-616*a* can be ideal for receiving user input. For example, the user can squeeze or pinch the cover 13.8-613 along the vertical axis to provide input to the system. In some examples, the conductive fabric 13.8-616*a* can be configured to detect an inward force, orthogonal to the surface plane of the side of the cover 13.8-613. For example, the conductive fabric 13.8-616*a* can detect the user pushing the cover inward with their finger (e.g., toward the user's temple).

In some examples, the cover 13.8-613 can include a second conductive fabric 13.8-616*b* that is connected to the cover 13.8-613 in a fashion described herein. The second conductive fabric 13.8-616*b* can be oriented substantially perpendicular to the first conductive fabric 13.8-616*a*. In other words, a longitudinal axis of the first conductive fabric 13.8-616*a* can be perpendicular to the longitudinal axis of the second conductive fabric 13.8-616*b*. It will be understood that the light seal 13.8-612 can include one of or both the first conductive fabric 13.8-616*a* and the second conductive fabric 13.8-616*b*. The conductive fabric 13.8-616*b* can include a wire or thread arranged in a generally serpentine pattern or in a zig-zag pattern. In some examples, the conductive fabric 13.8-616*b* can include a geometry that is responsive to a force in the horizontal direction (as oriented in FIG. 13.8-6).

The configuration of the conductive fabric 13.8-616*b* can be ideal for receiving user input. For example, the user can squeeze or pinch the cover 13.8-613 along the horizontal axis to provide input to the system. In some examples, the conductive fabric 13.8-616*b* is sensitive to changes in the distance between the frame 13.8-604 and the facial interface 13.8-608. A user can provide input by pressing the display unit or frame 13.8-604 toward the facial interface 13.8-608.

In some examples, the conductive fabric 13.8-616*b* can be configured to detect an inward force, orthogonal to the surface plane of the side of the cover 13.8-613. For example, the conductive fabric 13.8-616*b* can detect the user pushing the cover inward with their finger (e.g., toward the user's temple). In some examples, the light seal 13.8-612 can include multiple serpentine patterned conductive threads that run parallel to one another.

Any of the features, components, and/or parts, including the arrangements and configurations thereof shown in FIG. 13.8-6 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.8-6.

FIG. 13.8-7 shows a bottom perspective view of a light seal 13.8-712. The light seal 13.8-712 can be substantially similar to, including some or all of the features of, any of the light seals described herein, such as light seal 13.8-112, 13.8-212, 13.8-312, and 13.8-612. The light seal 13.8-712 can include a cover 13.8-713 and a first and second nasal sections 13.8-718*a* and 13.8-718*b*, respectively (collectively referred to as nasal sections 13.8-718). In some examples, the light seal can include an array of conductive threads 13.8-716*a* and 13.8-716*b* (collectively referred to as the array of conductive threads 13.8-716). The array of conductive thread 13.8-716 can be arranged parallel to one another such that changes in a distance separating the parallel threads is detectable and can be used to infer nasal movements and respiration data, such as instantaneous estimation of breath amplitude. The parallel conductive threads 13.8-716 can be arranged perpendicular to the direction of travel or deformation of the nasal regions 13.8-718.

For example, it can be seen in FIG. 13.8-7 that the distances separating the first array of conductive threads 13.8-716*a* is less than the distances between the threads of the second array of conductive threads 13.8-716*b*. It can therefore be determined (e.g., by a processor) that the first nasal section 13.8-718*a* is being compressed and/or the second nasal section 13.8-718*b* is being stretched.

It will be understood that location of the array of conductive threads 13.8-716 is not limited to the nasal sections 13.8-718. For example, any of the conductive fabrics described herein can instead be arranged as a parallel array of conductive threads.

Any of the features, components, and/or parts, including the arrangements and configurations thereof shown in FIG. 13.8-7 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.8-7.

13.9: Facial Interface Having Integrated Health Sensors

The following disclosure relates to a facial interface of a head-mountable device. More particularly, the present embodiments relate to a facial interface of a head-mountable device including a pressure sensor assembly used for acquiring biometric information. It will be understood the head-mountable device (HMD) in the present disclosure can apply to AR/VR head sets and also to smart computer glasses. In some examples, a processor causes a component of the HMD to perform an action in response to the biometric information collected by the sensor(s). As used herein "an action" or "perform an action" can refer to any electrical or mechanical act causing a change in one or more of the components of the HMD. For example, an action can include displaying a notification for the user and/or activating or deactivating one or more components.

In some examples, a sensor can collect biometric information from the nose and/or forehead of the user wearing the device, including when they are performing an activity, like exercising. The biometric information can be related to pulse, respiration, facial expression, heart rate, blood pressure, changes in the cartilage, chewing, or any other pertinent data. In some examples, a combination of sensors (sensor fusion) can be used to determine the biometric information. For example, a facial expression can be determined using both the pressure-based MEMS sensor described herein as well as an internal facing camera of the HMD. Further, in response to the collected data, the system can perform an action, for example, notifying the user of the collected data.

Head-mountable devices equipped with sensors are utilized for various purposes that detect user feedback, such as positioning or movement feedback, providing limited information in response to a user. For example, a user may have an increase in respiration or heart rate while performing a movement or action. Conventional head-mountable devices are not appropriately equipped to capture all the desired biometric information.

In contrast, the head-mountable devices of the present disclosure include a facial interface that can be incorporated or integrated with sensor(s), such as a pressure sensor assembly, configured to collect user data, such as biometric information, including pulse, respiration, facial expressions, heart rate, blood pressure, etc. By capturing the user data, the pressure sensor assembly of the facial interface can provide increased and improved feedback to the user. A head-mountable device with sensors monitoring user biometrics or health feedback creates a highly customized user experience, unlike the sensors of a conventional head-mountable device, which are unable to consider the user experience to such a degree.

Pressure sensor assemblies positioned on the facial interface can be used to create a customized user experience. The head-mountable device of the present disclosure can include pressure sensors to measure a user's response or engagement via indicators, such as pulse, respiration, facial expressions, heart rate, blood pressure, etc. Additionally, the sensor data can be used to monitor user fatigue, facial expressions, change in a user state, or obtain activity-specific metrics.

The head-mountable device can include sensors that are integrated on/in the facial interface in a variety of different ways. For example, the head-mountable device of the present disclosure can implement a first facial interface with a first sensor assembly being interchangeable, along with a second facial interface with a second sensor assembly. In some examples, the removeably attached sensor assembly can correspond to a different user activity, such as exercise, health, clinical settings, learnings activities, etc.

These and other embodiments are discussed below with reference to FIG. 13.9-1 through 13.9-6. However, those skilled in the art will readily appreciate that the detailed description given herein with respect to these Figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 13.9-1 illustrates a block diagram of a head-mountable device 13.9-100 including a frame or housing 13.9-116, a display 13.9-108, a facial interface 13.9-112, and a support 13.9-123. The display 13.9-108 can include one or more optical lenses or display screens in front of the eyes of a user. The display 13.9-108 can include a screen or display unit for presenting an augmented reality visualization, a virtual reality visualization, or other suitable visualization to a user. Additionally, the display 13.9-108 can be positioned in or on the housing 13.9-116. Similarly, a facial interface 13.9-112 can be connected to the housing 13.9-116. In some examples, the housing 13.9-116 can support or house a variety of electronic components, including the display 13.9-108.

The facial interface 13.9-112 can include one or more sensors (e.g., pressure sensors) 13.9-124, support attachments 13.9-132, display attachments 13.9-128, and feedback or output modules 13.9-136. The sensors 13.9-124 can be removably attached to the facial interface 13.9-112. As used herein, the terms "facial interface," "engagement interface," or "light seal" refer to a portion of the head mountable device 13.9-100 that engages (i.e., contacts or conforms to) a user's face.

In particular, the facial interface 13.9-112 can include portions of a head-mountable device that conform to, or press against, regions of a user's face. The facial interface 13.9-112 can be positioned between the display 13.9-108 or frame 13.9-116 and the user's face. In some examples, the facial interface 13.9-112 can include a pliant (or semi-pliant) facetrack or lumen that spans the forehead, wraps around the eyes, contacts other regions of the face (e.g., zygoma and maxilla regions), and bridges the nose.

In addition, the facial interface 13.9-112 can include various components forming a frame, structure, housing, or webbing of the head mountable device 13.9-100 disposed between the display 13.9-108 and the user's skin. In some examples, the facial interface 13.9-112 can include a seal (e.g., a light seal, environment seal, dust seal, air seal, etc.). As used herein, the term "seal" can include partial seals or inhibitors, in addition to complete seals (e.g., a partial light seal where some ambient light is blocked and a complete light seal where all ambient light is blocked when the head-mountable device 13.9-100 is donned). The facial interface 13.9-112 can be removably attached to the housing 13.9-116 and can be in electrical communication with the display 13.9-108.

The sensor(s) 13.9-124 of the facial interface 13.9-112 can collect biometric information, such as the user's vital sign (including pulse data, respiration data, and blood pressure). The pressure sensor assembly 13.9-124 can generate a signal based on the collected user information and transmit the signal to a processor that can cause an output 13.9-136 to perform an action in response to the signal (i.e., in response to the biometric information collected). For example, a user can perform a rigorous activity, such as lifting weights or working out while wearing the HMD 13.9-100. During such activity, the user's heart rate or other vital signs can elevate or change, being detectable by the sensor 13.9-124.

The sensor 13.9-124 can generate one or more signals based on the received input. The sensor 13.9-124 can transmit the signal to one or more components of the HMD 13.9-100 (e.g., to the display 13.9-108 and/or the output 13.9-136). The display 13.9-108, being in electrical communication with the facial interface 13.9-112, can receive electrical communication and provide feedback to the user related to their biometric readings (e.g., visual feedback, audio feedback, haptic feedback, etc.). Feedback can include determining when a user needs to take a break, or when the difficulty of an activity needs to be lowered or raised, the output 13.9-136 can include scheduling various activities for the user or recommending adjustment of the HMD 13.9-100.

As used herein, the term "sensor," "sensors," "pressure sensor assembly," or "sensor assembly" can refer to one or more sensing devices, such as a MEMS pressure sensor. In some examples, the HMD 13.9-100 includes a pressure sensing assembly having a deformable pad that deflects in response to a movement of a user's face, creating an increase or decrease in internal pressure of a pressure channel (e.g., a fluid volume connecting a deformable pad and a pressure sensors in fluid communication with the deformable pad) that changes in response to the deflection. The change in internal pressure caused by a movement in the user's face can be detected by a pressure sensor connected fluidly connected to the channel and attached to the deformable pad.

In some examples, the sensor is capable of detecting a deflection of the deformable pad as small as 10 microns. In some examples, the sensor is capable of detecting a deflection of the deformable pad that is less than as 10 microns. In some examples, the sensor is capable of detecting a deflection of the deformable pad as small as 20 microns. In some examples, the sensor is capable of detecting a deflection of the deformable pad as small as 50 microns. In some examples, the sensor is capable of detecting a deflection of the deformable pad as small as 100 microns. In some examples, the sensor is capable of detecting a deflection of the deformable pad greater than 100 microns. In some examples, the sensor is capable of detecting a deflection of the deformable pad that is approximately 100 nanometers or less.

The term "pressure sensor" or "sensor" used within the context of this application can refer to a sensor capable of sensing pressure, such as a compact based microphone (e.g., a MEMS sensor) with a sensitivity of about 2.5 millibar. In some examples, the pressure-based MEMS sensor can have a sensitivity of about 250 Pascals. In some examples, the pressure-based MEMS sensor can include an electrical circuit, such as a Winston bridge, to detect nano-metric deflections of the deformable pad. A pressure sensor or a sensor used for this application can be sensitive enough to detect a pulse, respiration, or other pressure related feedback related to a user.

In some instances, the change in pressure detected in a pressure sensor or sensor can generate an electrical signal capable of being interpreted by a controller/processor as a facial expression. In some examples, the pressure assembly is tuned to capture a specific pressure range applicable to a certain activity requiring other sensitivity values including approximately 1 millibar, 1.5 millibar, 3 millibar, or 4.5 millibar. When the pressure sensor is paired with another pressure sensor, a rate can be captured, such as blood volume, pulse rate, or other rates applicable and interpretable from the cardiovascular system.

In some examples, certain sensors can be used to assess stress and emotion through changes in pressures via direct contact with a user's face. The HMD can then provide feedback or output related to the detected stress and emotion. In some examples, the sensors can operate through coin cell battery or Bluetooth connectivity. In some examples, the sensors are powered by a primary battery of the HMD.

The sensors described herein can allow for observations of the cardiovascular system and respiration, to observe relaxation and stress indicators, mental health, medical treatments, etc. Using the disclosed sensors integrated on the facial interface, physicians and care takers could have live feedback of biometrics. Use cases can include fitness settings, user content, workplace, telepresence, clinical, education, training, pain, therapy, etc. In some examples, the sensors can be used to capture facial expressions. This is particularly relevant given the user's face is covered by the HMD when worn. For example, the HMD could include a micro electromechanical system (MEMS) to detect changes in blood vessel diameter, blood pressure, pulse, heat rate, respiration, and detecting facial expressions.

Any of the features, components, and/or parts, including the arrangements and configurations thereof shown in FIG. 13.9-1 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.9-1.

FIG. 13.9-2A illustrates a head-mountable device 13.9-200. The head-mountable device 13.9-200 can be substantially similar to, including some or all of the features of, the head-mountable devices described herein, such as head-mountable device 13.9-100. In some examples, the head-mountable device 13.9-200 includes a controller 13.9-213 (e.g., a sensor controller). While the controller 13.9-213 is illustrated as being positioned in a support (e.g., a support arm) 13.9-223, the position of the controller 13.9-213 is not limited to the support 13.9-223, and the controller 13.9-213 can be positioned in/on the facial interface 13.9-212 or in the HMD display housing.

The controller 13.9-213 can include a processor and a memory device storing computer-executable instructions that, when executed by the processor, cause the controller to receive biometric data from one or more pressure sensor assemblies 13.9-224, transmit a signal based on the sensor data, and generate a signal to cause a component to perform an action in response to the received signal.

The controller 13.9-213 can include one or more processors (e.g., a system on chip, integrated circuit, driver, microcontroller, application processor, crossover processor, etc.). Further, the controller 13.9-213 can include one or more memory devices (e.g., individual nonvolatile memory, processor-embedded nonvolatile memory, random access memory, memory integrated circuits, DRAM chips, stacked memory modules, storage devices, memory partitions, etc.). In certain implementations, the controller 13.9-213 is communicatively coupled to a power source (e.g., a battery).

In some examples, the controller 13.9-213 stores sensor data received from the sensor assembly 13.9-224 in the memory. The controller 13.9-213 can receive and/or transmit signals based on sensor data. For example, as will be described below, the controller 13.9-213, by way of the processor and memory, can transmit a signal to the display 13.9-208 based on the sensor data from the pressure sensor (e.g., causing the display 13.9-208 or the head-mountable device 13.9-200 to perform an action, such as present a certain message, power off, react to biometric feedback, etc.).

The controller 13.9-213 can perform any number of different functions. For example, the memory device can store computer-executable instructions that, when executed by the processor, cause the controller to receive sensor data from the sensor assemblies 13.9-224 and transmit a signal based on the sensor data. For instance, the controller 13.9-213 can transmit a sensor signal to a display 13.9-208.

In response to the controller 13.9-213 the display 13.9-208 can perform a wide variety of actions, including power off or power on, react to a user generated facial expression, present a digital notification (e.g., a user-generated notification, a push notification, a context-generated notification, a system-generated notification, a smart notification, etc.). In some examples, the memory device can store computer-executable instructions that, when executed by the processor, cause the controller 13.9-213 to receive biometric data from the sensor assemblies 13.9-224, transmit a signal based on the sensor data, and perform an action in response to the signal.

As illustrated, the head-mountable device (e.g., a wearable electronic device) 13.9-200 can include the display 13.9-208, the facial interface 13.9-212, and the pressure sensor(s) 13.9-224 coupled to the facial interface 13.9-212. The pressure sensor assembly 13.9-224 can be embedded, encapsulated, deposited, adhered, or otherwise attached to the facial interface 13.9-212. A portion of the pressure sensor assembly 13.9-224, such as a deformable pad configured to contact a user's face, can deflect in response to a movement of a user's face.

The pressure sensor assembly 13.9-224 can be configured to detect a biometric feature of the user 13.9-220. The pressure sensor assembly 13.9-224, upon detecting a signal from the biometric feature, can transmit the signal to a component of the head-mountable device 13.9-200 causing the head-mountable device 13.9-200 to perform an action. For example, the head-mountable device 13.9-200 can change shape (i.e., tighten or loosen), move, vibrate, rotate, recalibrate, or reposition in response to the sensor signal of the biometric feature.

The head-mountable device 13.9-200 can include a headband, a retention band, a strap, or a support 13.9-223 connected to the display 13.9-208 and/or the frame 13.9-216. The support 13.9-223 can secure the display 13.9-108 and/or housing 13.9-216 relative to the user's head 13.9-220 (e.g., such that the display 13.9-208 is maintained in front of a user's eyes). The support 13.9-223 can be constructed from elastic material, inelastic material, or a combination of elastic and inelastic material.

The support 13.9-223 can be adjustable such that the support 13.9-223 conforms to the various shapes and sizes of a user's head 13.9-220. In some examples, the support 13.9-223 secures the head-mountable device 13.9-200 via friction between the user's head 13.9-220 and the retention band 13.9-223. In some examples, the support 13.9-223 elastically secures the head-mountable device 13.9-200 to the user's head 13.9-220. In some examples, the support 13.9-223 is coupled to a ratchet system or mechanism securing the head-mountable device 13.9-200 to the user's head 13.9-220. In some examples, the support 13.9-223 is disposed above or on an ear 13.9-221 of the user's head 13.9-220, supporting the head-mountable device 13.9-200.

In some examples, the housing or frame 13.9-216 of the head-mountable display 13.9-200 is connected via a connector 13.9-215 to the facial interface 13.9-212, the retention band 13.9-223 being connected to the frame 13.9-216 and/or the facial interface 13.9-212, securing the head-mountable device 13.9-200 to the user's head 13.9-220 above or over the ears 13.9-221 of the user.

FIG. 13.9-2B shows an example facial interface 13.9-212 including one or more deformable pads 13.9-225*a* and 13.9-225*b* (collectively referred to as "deformable pads 13.9-225") disposed on the facial interface 13.9-212. The deformable pads 13.9-225 can include thin membranes or sheets. The deformable pads 13.9-225 can be inflatable membranes or pillows. While multiple deformable pads 13.9-225 are shown, it will be understood that one deformable pad 13.9-225 and sensor 13.9-224 can be used to achieve the same or similar results. The deformable pads 13.9-225 can be in fluid communication with one or more pressure sensors 13.9-224*a* and 13.9-224*b* (collectively referred to as "pressure sensors 13.9-224").

It will be noted that because of the use of deformable pad 13.9-225, the pressure sensors 13.9-225 do not need to be in direct contact with the user's skin. This allows the sensors 13.9-225 to be more securely housed within the facial interface 13.9-212 where motion on the user's skin can be transferred through various materials of the facial interface 13.9-212 to the deformable pad 13.9-225. The deformable pads 13.9-225 can be located at any location of the facial interface 13.9-212 that enables them to contact a face of a user. In some examples, the deformable pads 13.9-225*a* are located at/on a nose of a user when the head-mountable device is worn. The deformable pads 13.9-225*a* can be in fluid communication with the pressure sensors 13.9-224*a*. The pressure sensors 13.9-224*a* can detect changes in pressure caused by a movement in the deformable pads 13.9-225*a*.

The movement in the deformable pads 13.9-225*a* can be caused by a movement of the user's face. For example, a user may breathe through his/her nose, deflecting the deformable pads 13.9-225*a*, and thereby a change in internal pressure of the pressure sensor assembly. The pressure sensors 13.9-224 can detect the change in pressure and transmit a signal based on the change to the head-mountable device, such as the head-mountable device 13.9-200 shown in FIG. 13.9-2A, via an electrical signal. In some examples the change in pressure results in a piezoelectric reaction, a change in resistance, or a diaphragm deflection to generate the signal.

Similarly, the deformable pads 13.9-225*b* can be located near a forehead region of a user's face when the facial interface 13.9-212 is donned. The deformable pads 13.9-225*b* can be in fluid communication with the pressure sensors 13.9-224*b*. The pressure sensors 13.9-224*b* can detect changes in pressure caused by a movement in the deformable pads 13.9-225*b* in response to a movement of a user's face. For example, a user may perform an activity, such as making a facial expression or exercising, increasing the user's blood pressure, and thereby causing the detectable forehead vasculature to enlarge.

As the forehead vasculature enlarges, deformable pads 13.9-225*b* deflect, causing a change in internal pressure to the pressure assembly. The pressure sensors 13.9-224*b* detects the change in pressure and communicates the pressure change by generating an electrical signal in response to the pressure change, which signal can then be transmitted to the head-mountable device. Likewise, a change in the user's facial expression can cause a deflection of the deformable pads 13.9-225*b* which can be detected by the pressure sensors 13.9-224*b*. The pressure sensors 13.9-224*b* then generate an electrical signal in response to the detected deflection, which signal can then be analyzed by a processor to infer a characteristic of the user's facial expression.

Any of the features, components, and/or parts, including the arrangements and configurations thereof shown in FIGS. 13.9-2A and 13.9-2B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.9-2A and 13.9-2B.

FIG. 13.9-3 shows a rear perspective view of a head-mountable device 13.9-300. The head-mountable device 13.9-300 can be substantially similar to, and can include some or all of the features of, the head-mountable devices described herein, such as head-mountable device 13.9-100 and 13.9-200. The head-mountable device 13.9-300 shown in FIG. 13.9-3 includes a support 13.9-323, a facial interface 13.9-312, overmolded portions 13.9-313*a* and 13.9-313*b* (collectively referred to as "overmolded portions 13.9-313") connected to the facial interface 13.9-312, deformable pads 13.9-325, channels 13.9-326, and sensors 13.9-324.

The channel 13.9-326 allows for fluid communication between the deformable pad 13.9-325 and the sensor 13.9-324. As described in further detail with regards to FIG. 13.9-4A and 13.9-4B, the channel 13.9-326 can define an internal volume. In some examples, the channel 13.9-326 defines a support arm for the deformable pad 13.9-325. The channel 13.9-326 can be adjustable such that the position of the deformable pad 13.9-325 relative to the user's nose can be modified for varied applications or users. For example, one user may have specific nose shape, and another user may have a substantially different nose shape. The channel 13.9-326 can be adjusted, such that the nose shape can be accommodated in a comfortable and precise manner.

In some examples, the deformable pads 13.9-325 can be adjustable. For example, the deformable pads 13.9-325 can move or pivot relative to the facial interface 13.9-312. The deformable pads 13.9-325 can change their pitch, yaw, or roll in order to establish a better fit and comfort on the user's face. In some examples, the stiffness or rigidity of the deformable pads 13.9-325 can be adjusted or tuned based on needs and preferences. The stiffness of the deformable pads 13.9-325 can be adjusted based on the pressure in the channels 13.9-326. In some examples, the deformable pads 13.9-325 are automatically adjusted based on the user or application. Further details regarding deformable pads are provided below with reference to FIGS. 13.9-4A and 13.9-4B.

In some examples, a user may perform a rigorous activity, requiring more rigid contact of the deformable pad 13.9-325. The deformable pad 13.9-325 can be replaced with a more rigid deformable pad. In some examples, the deformable pad 13.9-325 can be replaced with a less rigid deformable pad to accommodate other certain activities, such as test taking or learning activities.

The overmolded portion 13.9-313 can include portions contacting the user's face. For example, overmolded portion 13.9-313*b* can contact the maxilla and/or zygoma facial regions, creating a comfortable conforming fit to a user's face. Similarly, the overmolded portion 13.9-313*a* can contact a user's forehead conforming to each user's forehead unique attributes, providing a comfortable customized fit for an individual user. In some examples, the overmolded portion 13.9-313 can be considered part of the facial interface 13.9-312. The overmolded portions 13.9-313 can secure the sensor assembly to the facial interface 13.9-312, creating an esthetically pleasing head-mountable display. In some examples, the overmolded portions 13.9-313 can create or define the channels 13.9-326. In some examples, the overmolded portions 13.9-313 can form a housing to house or conceal the sensors 13.9-324 and/or channels 13.9-326.

Any of the features, components, and/or parts, including the arrangements and configurations thereof shown in FIG. 13.9-3 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.9-3.

FIG. 13.9-4A shows a perspective view of a portion of a facial interface 13.9-412. The facial interface 13.9-412 can be substantially similar to, and can include some or all of the features of, the facial interfaces described herein, such as facial interfaces 13.9-112, 13.9-212, and 13.9-312. The facial interface 13.9-412 can include an arm or channel 13.9-426 that defines an internal volume 13.9-428. The internal volume 13.9-428 can establish a fluid communication between a deformable pad 13.9-425 and a sensor 13.9-424. In some examples, the internal volume includes air or some other gas. In some examples, the internal volume 13.9-428 include a liquid or pneumatic fluid. The sensor 13.9-424 can be a pressure-based MEMS sensor 13.9-424. The sensor 13.9-424 can be disposed within the arm 13.9-426 of the facial interface 13.9-412. In some examples, the sensor 13.9-424 is positioned on an exterior of the arm 13.9-426.

The deformable pad 13.9-425 can include an inflatable member that can flex or deform in response to an external force. The deformable pad 13.9-425 can be removably attached to the arm 13.9-426 via a connector 13.9-433. The connector 13.9-433 can any suitable mechanical or magnetic attachment mechanisms. In some examples, the connector 13.9-433 can include a barbed configuration capable of removably securing the deformable pad 13.9-425 to the arm 13.9-426. The deformable pad 13.9-425 can include a female connector 13.9-435 to receive a male connector 13.9-433 on the arm 13.9-426. In some examples, the connector 13.9-433 can be threaded such that the deformable pad 13.9-425 is threaded onto the connector 13.9-433.

The term "barbed" used within the context of this application can define one end of a component connecting to another end of a different component. For example, the deformable pad can connect to the facial interface 13.9-412 via a barbed connection. The connection can be physical and contain egressed portions on one component and ingress portions on another components. These egressed portions and ingress portions can form a threaded fit, snap fit, compressive fit, or other fit that can produce fluid communication between the deformable pad 13.9-425 and the sensor 13.9-424.

As shown in FIG. 13.9-4B, in some examples, the connector 13.9-433 can establish a substantially air-tight seal between the deformable pad 13.9-425 and the internal volume 13.9-428 of the channel. In some examples, the gasket, O-ring, or other type of seal is positioned around the connector 13.9-433 to improve the seal. In some examples, a known and predetermined amount of air is permitted to escape the internal volume 13.9-428 as the deformable pad 13.9-425 moves. By controlling the amount of escaped air, the pressure sensor is still able to deduce facial movement.

The deformable pad 13.9-425 can be include an elastomeric material. The deformable pad 13.9-425 can include a soft material that is comfortable on the user's skin. The deformable pad 13.9-425 can include, but is not limited to, any of the following: Natural Rubber, Polyisoprene, Butyl Rubber (IIR, Isobutene-isoprene), Chloroprene (CR, Neoprene®), Ethylene Propylene Diene (EPDM), Fluorocarbon (FMK, Viton®), Fluorosilicone (FSI), Nitrile Butadiene (NBR), Saturated Nitrile (HNBR), Silicone Rubber (SI, Gum and Liquid), Styrene Butadiene (SBR), and Urethane (PU, Polyurethane).

In some examples, the deformable pad can include a compressible elastomer such as a silicon material that is durable and not likely to wear down. The deformable pad can be soft and resilient to moisture, such as sweat. In some examples, the deformable pad is overmolded or can be a stand-alone piece that is attached to the facial interface.

Further, the deformable pad 13.9-425 can be tuned for specific needs or users. For example, one deformable pad can be constructed of one elastomeric material for one application or user, and another deformable pad can include elastomeric material designed for another application or user. In some examples, the deformable pad 13.9-425 can be shaped or manufactured to increase or decrease sensitivity of the deformable pad 13.9-425 for a certain activity. In some examples, the deformable pad 13.9-425 can be constructed of a combination of materials, such as two or more types of elastomeric materials.

An example operation of the sensor module can occur when a user, wearing the HMD, has facial movement. A facial movement can include movement in the nose, forehead, cheeks, or any other portion of the face/head. Facial movements can be indicative of respiration, pulse, and facial expressions. Because the deformable pad 13.9-425 is in close proximity or touching the user, the facial movement can push or deflect the deformable pad 13.9-425 a certain amount. The deflection of the deformable pad 13.9-425 can cause a temporary increase in the pressure within the channel 13.9-428. The change in pressure can be detected by the sensor 13.9-424, which transmits a signal, based on the pressure fluctuation to be processed (e.g., by a processor on board the HMD). In some examples, the sensor 13.9-424 can be integrated into other components of the HMD (e.g., integrated onto the headband of the HMD).

Any of the features, components, and/or parts, including the arrangements and configurations thereof shown in FIGS. 13.9-4A and 13.9-4B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.9-4A and 13.9-4B.

FIG. 13.9-5A shows a rear view of a facial interface 13.9-512. The facial interface 13.9-512 can be substantially similar to, and can include some or all of the features of, the facial interfaces described herein, such as facial interfaces 13.9-112, 13.9-212, 13.9-312, and 13.9-412. In some examples, the facial interface 13.9-512 can include a pressure sensor located in a forehead-contacting region of the facial interface 13.9-512. The pressure sensor can include a deformable pad (e.g., inflatable member) 13.9-525. In some examples, the deformable pad is overmolded to the facial interface 13.9-512, sealing the deformable pad 13.9-525 and creating a pressure chamber wherein facial movements of a user cause the deformable pad 13.9-525 to deflect or deform. The deflection of the deformable pad 13.9-525 creates a change in pressure within the pressure chamber. The change in pressure can be detectible to the pressure sensor which can then generate a signal to be analyzed or interpreted by a processor/controller.

As illustrated in FIG. 13.9-5A, the deformable pad 13.9-525 can include an elongated shape. The elongated shape of the deformable pad 13.9-525 can span across a substantial portion of the user's forehead when the user is wearing the HMD. The elongated horizontal shape of the deformable pad 13.9-525 can be predetermined to cover a maximum amount of veins/vessels in the forehead. In some examples, the deformable pad 13.9-525 can be centered on the facial interface 13.9-512, and therefore positioned to contact a center of the user's forehead. However, other positioned are also possible. In some examples, the deformable pad 13.9-525 is off-center from the center or middle of the facial interface 13.9-512. In some examples, the facial interface 13.9-512 wraps partially around the user's head, such that the deformable pad 13.9-525 can be positioned proximate a temple of the user when the HMD is donned.

FIG. 13.9-5B shows a rear view of the facial interface 13.9-512 having a plurality of deformable pads **13.9-525*a*, 13.9-525*b*, 13.9-525*c*, 13.9-525*d* (collectively referred to as "deformable pads 13.9-525"). The deformable pads 13.9-525 can each deflect to cause a change in pressure. In some examples, the facial interface 13.9-512 includes a plurality of pressure chambers. The pressure chambers can be isolated and distinct or can be in fluid communication with each other. The pressure within the channel(s) can be equalized. In some examples, each deformable pad 13.9-525** can be fluidically connected to a single sensor.

In some examples, the system include multiple sensors, each of which is fluidically connected to one or more of the deformable pads 13.9-525. The increased number of deformable pads 13.9-525 can increase accuracy and sensitivity for a head-mountable device used in combination with the facial interface 13.9-512. In some examples, a combination of the deformable pads 13.9-525 can be used to detect or track motions along the user's forehead. For example, by using at least pad **13.9-525*a* and pad 13.9-525*b*, a vertical signal or input can be monitored or tracked across the user's forehead. Likewise, using at least pad 13.9-525*c* and pad 13.9-525*d***, a horizontal signal or input can be tracked as it traverses horizontally across a user's forehead.

In some examples, the combination of pads 13.9-525 can detect a user's pulse transit time (e.g., the time it takes a pulse wave to travel between two pulse sites). For example, deformable pad **13.9-525*a* and deformable pad 13.9-525*b* can be placed over the supratrochlear artery (e.g. the arterial supply to the forehead and the anterior part of the scalp) measuring the pulse transit time from deformable pad 13.9-525*a* to deformable pad 13.9-525*b***. Similarly, any artery or combination thereof can be used to measure arterial functions, such as pulse transit times in a vertical, horizontal, or combinatory manner.

Any of the features, components, and/or parts, including the arrangements and configurations thereof shown in FIG. 13.9-5A and 13.9-5B can be included, either alone or in any combination, in any of the other examples of devices, features, components, and parts shown in the other figures described herein. Likewise, any of the features, components, and/or parts, including the arrangements and configurations thereof shown and described with reference to the other figures, can be included, either alone or in any combination, in the example of the devices, features, components, and parts shown in FIGS. 13.9-5A and 13.9-5B.

FIG. 13.9-6 illustrates a side cross-sectional view of a portion of a sensor module of a facial interface 13.9-612. The facial interface 13.9-612 can be substantially similar to, and can include some or all of the features of, the facial interfaces described herein, such as facial interface 13.9-112, 13.9-212, 13.9-312, 13.9-412, and 13.9-512. The sensor module of FIG. 13.9-6 includes a deformable pad 13.9-625, a contact portion 13.9-627 configured to contact a user's head, and a sensor 13.9-624.

A channel 13.9-628 can define an internal volume that places the deformable pad 13.9-625 and the sensor 13.9-624 in fluid communication. In some examples, the deformable pad 13.9-625 can deform in response to facial movements. The deformable pad 13.9-625 can be constructed of a compressible elastomer. The facial interface 13.9-612 can include an overmolded portion 13.9-627. The overmolded portion 13.9-627 can contact a user's face and can provide a comfortable point of contact to the user's forehead, nose, around the user's eyes, and other contact regions the overmolded portion contacts the user's face.

In some examples, the overmolded portion 13.9-627 is formed of a soft elastomer that is resilient to sweat/perspiration from a user. As illustrated, a pressure-based MEMS sensor 13.9-624 can be embedded or housed within the facial interface 13.9-612. The MEMS sensor can have dimension of approximately 2 mm by 2 mm. FIG. 13.9-6 illustrates the deformable pad 13.9-625 being proud from (extending or protruding from) the facial interface 13.9-612. However, in some examples, the deformable pad 13.9-625 can be flush with the facial interface 13.9-612, specifically flush with the section of the facial interface 13.9-612 that abuts or contacts the forehead of the user.

An example operation of the sensor module can occur when a user, wearing the HMD, has facial movement. A facial movement can include movement in the nose, forehead, cheeks, or any other portion of the face/head. Facial movements can be indicative of respiration, pulse, and facial expressions. Because the deformable pad 13.9-625 is in close proximity or touching the user, the facial movement can push or deflect the deformable pad 13.9-625 a certain amount.

The deflection of the deformable pad 13.9-625 causes a temporary increase in the pressure within the channel 13.9-628. The change in pressure can be detected by the sensor 13.9-624, which transmits a signal, based on the pressure fluctuation to be processed (e.g., by a processor on board the HMD). In some examples, the sensor 13.9-624 can be integrated into other components of the HMD (e.g., integrated onto the headband of the HMD).

Any of the features, components, and/or parts, including the arrangements and configurations thereof shown in FIG. 13.9-6 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.9-6.

13.10: Touch Sensitive Input Surface

The following disclosure relates to a head-mountable device. More particularly, the present embodiments relate to a light seal of a head-mountable device including manual touch sensitive input surfaces for a user donning the head-mountable device to provide commands to the head-mountable device. As used herein the term "conductive fabric" can refer to the material or fabric into/onto which conductive elements are incorporated, or can refer to the conductive elements themselves, separate from the material or fabric with which they are integrated. The conductive fabric can include a plurality of conductive fibers. The conductive fabric can act as sensors, input members, and electrical interconnects to enable sensors and other electronic components to interact with one another. A manual input sensor can be a physically activated input system that can be used to provide an indication to a processor of a user's intent.

The head-mountable device of the present disclosure includes a manual input sensor that utilizes a touch sensitive surface that receives user input, such as touch input. The touch sensitive surface can accomplish this while being unobtrusively integrated with the light seal. A head-mountable device with such touch sensitive surfaces adds another way for a user to provide input or commands to a head-mountable device and adding functionality without adding burdensome components or structures.

These and other embodiments are discussed below with reference to FIGS. 13.10-1A through 13.10-8B. However, those skilled in the art will readily appreciate that the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 13.10-1A illustrates a block diagram of a head-mountable device ("HMD") 13.10-100 including a frame 13.10-104, a display 13.10-105, a support (e.g., a retention band 13.10-109), and a light seal or cover 13.10-112. The display 13.10-105 can include one or more optical lenses or display screens in front of the eyes of a user. The display 13.10-105 can include a display for presenting an augmented reality visualization, a virtual reality visualization, or other suitable visualization. Additionally, the frame 13.10-104 can at least partially surround the display 13.10-105. Similarly, the light seal 13.10-112 can be connected to the frame 13.10-104. In some examples, the light seal 13.10-112 includes the frame 13.10-104 (i.e., the frame 13.10-104 is part of the light seal 13.10-112).

The light seal 13.10-112 can include electrical components (e.g., sensors 13.10-120), a cover 13.10-113, a facial interface 13.10-108, and a conductive fabric 13.10-116. The frame 13.10-104 can be a housing of the display 13.10-105. Further, the frame 13.10-104 can also be considered to be a part of or separate from the light seal 13.10-112. As used herein, the term "light seal" can refer to a portion of the HMD 13.10-100 that engages or shields a user's face. In particular, the light seal 13.10-112 includes portions (e.g., the facial interface) that conform to, contact, or press against regions of the user's face.

The light seal 13.10-112 includes a body with an inner surface and an outer surface. The outer surface is exposed to the external environment and the inner surface is disposed within the space formed by the HMD 13.10-100 and the user's face. The light seal can include a pliant (or semi-pliant) facetrack or face engagement component that spans the forehead, wraps around the eyes, contacts other regions of the face (e.g., zygoma and maxilla regions), and bridges the nose. In addition, the light seal 13.10-112 can include various components forming a frame, structure, or webbing of a head-mountable device disposed between the display 13.10-105 and the user's skin, such as the cover 13.10-113. The cover 13.10-113 can include a seal, environment seal, dust seal, air seal, etc. that is positioned between the gap between the display 13.10-105 and the user's face. The cover 13.10-113 can be a woven fabric that is non-rigid or deformable. The cover 13.10-113 can be elastically deformable. In some examples, the cover 13.10-113 can be a plastic, rubber, or polymer material. In some examples, the cover 13.10-113 can be rigid.

The cover 13.10-113 can form an eye-box through which the user can view the display 13.10-105. It will be appreciated that the term "seal" can include partial seals or inhibitors, in addition to complete seals (e.g., a partial light seal where come ambient light is blocked and a complete light seal where all ambient light is blocked when the HMD 13.10-100 is donned).

The light seal 13.10-112 can have a removable fastener that enables the light seal to be removably attachable to the frame 13.10-104 and in electrical communication with the display 13.10-105. The light seal 13.10-112 can include an electrical component, such as a sensor 13.10-120. The sensor 13.10-120 can collect user or environmental data, such as biometric information. The sensor 13.10-120 may receive input from the user, such as the user physically touching the sensor to input or command to the HMD 13.10-100 as an indication of the user's intent. The sensor 13.10-120 can transmit signals to the HMD 13.10-100, and more particularly to the display 13.10-105. The sensor 13.10-120 can transmit signals to an output configured to perform an action in response to the information collected by the sensor 13.10-120.

The light seal 13.10-112 can include conductive fabric 13.10-116. In some examples, the conductive fabric 13.10-116 can include highly elastic copper threads that can compress and stretch while still maintaining electrical connectivity. The conductive fabric 13.10-116 can be elastically deformable (i.e., capable of temporary change in length, volume, or shape). In some examples, the conductive fabric 13.10-116 can include electrically conductive carbon fibers. In some examples, the conductive fabric 13.10-116 can collect input from the user by the user engaging the conductive fabric through touch, such as with a finger or fingers. These movements can cause a change in the conductive fabric 13.10-116 (i.e., stretching or compressing). The degree or amount to which the conductive fabric 13.10-116 is moved by the user's finger can be detectable by the conductive fabric 13.10-116 and can be used to generate signals that can be analyzed by a processor of the HMD 13.10-100. As described in greater detail below, the conductive fabric 13.10-116 can be a thread, line, wire, plate, or any other structure that is capable of conducting electricity. The conductive fabric 13.10-116 can be integrated with the light seal 13.10-112. For example, the conductive fabric

13.10-116 can be embedded, interwoven, or encapsulated with the cover 13.10-113 or facial interface 13.10-108.

The display 13.10-105, being in electrical communication with the light seal 13.10-112, and more specifically with the conductive fabric 13.10-116, can receive electrical communication and provide feedback to the user related to the readings of the conductive fabric 13.10-116 (e.g., visual feedback, audio feedback, haptic feedback, etc.).

As used herein, the term "sensor" refers to one or more different sensing devices, such as a camera or imaging device, strain gauge, capacitance sensors, proximity sensors, touch sensitive sensors, accelerometers, and the like. Additional sensors can include a temperature sensor, oxygen sensor, movement sensor, brain activity sensor, sweat gland activity sensor, breathing activity sensor, muscle contraction sensor, etc. In some examples, the sensor can sense biometric features including features of the autonomic nervous system. Some examples of sensors include an electrooculography sensor, electrocardiography sensor, EKG sensor, hear rate variability sensor, blood volume pulse sensor, SpO2 sensor, compact pressure sensor, electromyography sensor, core-body temperature sensor, galvanic skin sensor, accelerometer, gyroscope, magnetometer, inclinometer, barometer, infrared sensor, global positioning system sensor, etc. Additional sensor examples can include, contact microphones (e.g., press-based MEMS), bioelectrical activity sensors, UV exposure sensors, or particle sensors.

Any of the features, components, and/or parts, including the arrangements and configurations thereof shown in FIG. 13.10-1A can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.10-1A.

FIG. 13.10-1B shows a top partial view of an HMD 13.10-100. The HMD 13.10-100 of FIG. 13.10-1B can be substantially similar to, including some or all of the features of, the HMD 13.10-100 described in FIG. 13.10-1A. The HMD 13.10-100 can include a display (also referred to as a display unit) 13.10-105. The display 13.10-105 can include any number of internal electronic components 13.10-107. The HMD 13.10-100 can include a frame 13.10-104 (which can also be referred to as a housing) attached to the display 13.10-105. In some examples, the display 13.10-105 includes an opaque, translucent, transparent, or semi-transparent screen, including any number lenses, for presenting visual data. The frame 13.10-104 can at least partially border one or more edges of the display 13.10-105. The frame 13.10-104 can be attached to a cover 13.10-128 at one end of the cover 13.10-128. At an opposite end, the cover 13.10-128 can form, or be attached to, a facial interface 13.10-108. In some examples, the frame 13.10-104, cover 13.10-113, and facial interface 13.10-108 can together form the light seal 13.10-112. It will be understood, however, that the light seal 13.10-112 can include fewer or more components that those listed or shown.

The HMD 13.10-100 can be worn on a user's head 13.10-20 such that the display 13.10-105 is positioned over the user's face and disposed over one or both of the user's eyes. The HMD 13.10-100 can further include a retention band 13.10-109. The retention band 13.10-109 can secure the HMD 13.10-100 to the user's head 13.10-20 during use so that they user can enjoy the experience provided by the HMD 13.10-100. The display 13.10-105 can be connected to the retention band 13.10-109 and/or the light seal 13.10-112. In some examples, the retention band 13.10-109 can be positioned against the side of a user's head 13.10-20 and in contact therewith. In some examples, the retention band 13.10-109 can be at least partially positioned above the user's ear or ears. In some examples, the retention band 13.10-109 can be positioned adjacent to the user's ear or ears. The retention band 13.10-109 can extend around the user's head 13.10-20. In this way, the display 13.10-105 and the retention band 13.10-109 can form a loop that can retain the HMD 13.10-100 on the user's head 13.10-20. It should be understood, however, that this configuration is just one example of how the components of the HMD 13.10-100 can be arranged, and that in some examples, a different number of connector straps and/or retention bands can be included. Although the HMD 13.10-100 is referred to as an HMD, it should be understood that the terms wearable device, wearable electronic device, head-mountable device, HMD, HMD device, and/or HMD system can be used to refer to any wearable device, including smart glasses.

In some examples, the frame 13.10-104 is attached to a facial interface 13.10-108. The facial interface 13.10-108 can contact a user's head 13.10-20 and/or face. In some examples, the cover 13.10-113 can be a light blocking component that extends between the frame 13.10-104 and the facial interface 13.10-108. The light blocking component can cover or surround a perimeter of the frame 13.10-104 and/or the facial interface 13.10-108.

The cover 13.10-113 can be a cloth, fabric, woven material, plastic, rubber, or any other suitable opaque or semi-opaque material. In some examples, the cover 13.10-113 is flexible, having the ability to repeatedly stretch, compress, and deform. The cover 13.10-113 can be elastically or in-elastically deformable. The facial interface 13.10-108 in combination with the cover 13.10-113 can block outside light and limits the peripheral view of the user. In some examples, the cover 13.10-113 and the facial interface 13.10-108 is the same or a unitary component. As will be discussed in greater detail below, the light seal 13.10-112 can include the conductive fabric 13.10-116 that is able to serve multiple functions and provide added benefits and functionality to the HMD 13.10-100.

Any of the features, components, and/or parts, including the arrangements and configurations thereof shown in FIG. 13.10-1B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.10-1B.

FIG. 13.10-2 shows a bottom perspective view of select components of a light seal 13.10-212. The light seal 13.10-212 can be substantially similar to, including some or all of the features of, the light seals described herein, such as light seal 13.10-112. The light seal 13.10-212 can be implemented on an HMD, such as HMD 13.10-100.

The light seal 13.10-212 can be integrated with conductive fabrics 13.10-216*a*, 13.10-216*b* (collectively referred to as conductive fabric 13.10-216). The conductive fabric 13.10-216 or thread can be positioned at various locations on the light seal 13.10-212. For example, the conductive fabric

13.10-216 can be positioned on or in the cover 13.10-213 (e.g., embedded, encapsulated, or interwoven into the cover).

In some examples, the conductive fabric 13.10-216 can be positioned on the facial interface 13.10-208 of the light seal 13.10-212. In one example, the conductive fabric 13.10-216 can be in direct contact with a user, for example, touching a user's forehead, cheek, nose, temple region, back of the head, or at any location where the HMD contacts the user. In some examples, the conductive fabrics 13.10-216 is disposed on an outer surface of the light seal 13.10-212.

In the illustrated example of FIG. 13.10-2, conductive fabrics 13.10-216*a* are disposed on a left side of the light seal and conductive fabrics 13.10-216*b* are disposed on a right side of the light seal 13.10-212. The conductive fabrics 13.10-216*a* can be disposed in a specific touch sensitive surface 13.10-218*a* and conductive fabrics 13.10-216*b* can be disposed in a touch sensitive surface 13.10-218*b*. The touch sensitive surfaces 13.10-218*a*, 13.10-218*b* can be manual input sensors to receive input from the user by manually or physically touching the touch sensitive surfaces 13.10-218*a*, 13.10-218*b* to provide input and/or commands to the HMD 13.10-100. However, the conductive fabric 13.10-216 can be located in a variety of different locations of the light seal 13.10-212.

FIG. 13.10-3A shows a top view of an HMD 13.10-300. The HMD 13.10-300 can be substantially similar to, including some or all of the features of, the devices described herein, such as the HMD 13.10-100 and the light seal 13.10-212. In some examples, the HMD 13.10-300 can include an electronic component (e.g., a sensor 13.10-320). The electronic component can be positioned on or housed in the display unit 13.10-305. The electronic component can be a battery, a processor, a display, a camera, or any other electronic component. In some examples, the electronic module can be attached to the frame 13.10-304.

In some examples, the electronic component (e.g., the sensor 13.10-320) can be electrically connected by a conductive fabric 13.10-316 that runs through the cover 13.10-313 of the light seal 13.10-312. In some examples, the conductive fabric 13.10-316 runs through or across a retention band 13.10-309. In some examples, the conductive fabric 13.10-316 runs through or across the frame 13.10-304. In this manner, the conductive fabric 13.10-316 serves as an interconnect (i.e., an electrical connection) between the sensor 13.10-320 on the light seal 13.10-312. In some examples, the detections of the conductive fabrics 13.10-316 can be combined with other sensors on-board or remote from the HMD 13.10-300 to gather data is a sensor fusion manner. In the illustrated example, the light seal 13.10-312 includes a conductive fabric 13.10-316*a* disposed on a left side of the light seal 13.10-312 and a conductive fabric 13.10-316*b* disposed on a right side of the light seal 13.10-312. The conductive fabric 13.10-316*a* can be disposed in a specific touch sensitive surface 13.10-318*a* and the conductive fabric 13.10-316*b* can be disposed in a specific touch surface 13.10-318*b*. These specific touch sensitive surfaces 13.10-318*a*, 13.10-318*b* are configured to allow a user to provide input to the HMD 13.10-100 by touching the specific touch sensitive surfaces 13.10-318*a*, 13.10-318*b*.

In the illustrated example, the light seal 13.10-312 includes two touch sensitive surfaces 13.10-318*a*, 13.10-318*b*, however, the present disclosure is not so limited and can include more or less than two touch sensitive surfaces. In some examples, the entire light seal 13.10-312 can be a touch sensitive surface that allows the user to input information or commands to the HMD 13.10-300 from any location on the light seal 13.10-312. In some examples, there can be a distinct number of touch sensitive surfaces to enable the user to input information or commands into the HMD 13.10-300. In some examples, each distinct touch sensitive surface can be directed to a specific type of input or functionality. For example, one touch sensitive surface can be for volume control, another touch sensitive input can be for scrolling, and the like. The HMD 13.10-300 can include an indicator that directs the user to the location of the distinct touch sensitive surfaces on the outer surface of the light seal 13.10-312.

In some examples, the HMD 13.10-300 can include conductive fabrics 13.10-316*c*, 13.10-316*d* incorporated onto and/or into the retention band 13.10-309 of the HMD 13.10-300. The retention band 13.10-309 can be a headband having flexible sections. The conductive fabrics 13.10-316*c*, 13.10-316*d* can be configured to stretch or compress in response to the retention band 13.10-309 stretching or compressing. In some examples, the conductive fabrics 13.10-316*c*, 13.10-316*d* can generate signals indicative of the tightness or position of the retention band 13.10-309. In some examples, a user can be notified based on the signals generated by the conductive fabrics 13.10-316*c*, 13.10-316*d*. The retention band 13.10-309 can be automatically adjusted based on the signals generated by the conductive fabrics 13.10-316*c*, 13.10-316*d*. In the illustrated example, the retention band 13.10-309 include the conductive fabric 13.10-316*c* disposed on a left side of the retention band 13.10-309 and the conductive fabric 13.10-316*d* disposed on a right side of the retention band 13.10-309 and can be connected to electrical components 13.10-320 on the frame 13.10-304 of the HMD 13.10-300.

FIG. 13.10-3B illustrates a top view of a user interacting with the touch sensitive surface 13.10-318*b*. For ease of illustration, the touch sensitive surface 13.10-318*b* depicts a single conductive fiber but can includes a plurality of conductive fibers. In some examples, the conductive fabric 13.10-316*b* is woven into a strain gauge pattern and the conductive fabric 13.10-316*b* is electrically connected to an electrical component (e.g., a sensor 13.10-320) of the HMD 13.10-300. The user's engagement with the touch sensitive surface 13.10-318*b* can be interpreted as input to provide commands to the HMD 13.10-300.

In some examples, the conductive fabric 13.10-316*b* is physically connected to the sensor 13.10-320. The sensor 13.10-320 can be a strain gauge and the conductive fabric 13.10-316*b* is physically coupled to the strain gauge 13.10-320. The strain gauge 13.10-320 can measure the displacement of the conductive fabric 13.10-316*b* and interpret or transform the displacement of the conductive fabric 13.10-316*b* into input for the HMD 13.10-300.

In some examples, the touch sensitive surface 13.10-318*b* includes yarn that is physically connected to the strain gauge 13.10-320. All the yarn disposed within a perimeter of the touch sensitive surface 13.10-318*b* can be physically connected to the strain gauge 13.10-320. The touch sensitive surface 13.10-318*b* leverages the elastic nature of the yarn. In other words, as the user presses or touches the yarn of the touch sensitive surface 13.10-318*b*, the strain is transferred to the strain gauge 13.10-320 that is disposed away from the touch sensitive surface 13.10-318*b* and the strain gauge can measure the displacement of the yarn and interpreted the displacement as input for the HMD 13.10-300. In some examples, the touch sensitive surface 13.10-318 can include both conductive fabric 13.10-316*b* and yarn.

FIG. 13.10-3B illustrates the user pushing or poking the specific touch sensitive surface 13.10-318*b* with a finger 13.10-10, which displaces the conductive fabric 13.10-316*b* and transfers the displacement to the strain gauge 13.10-320, which interprets the displacement as a command or input to the HMD 13.10-300. However, the user can use a number of different gestures with their finger 13.10-10 to provide input to the HMD 13.10-300. As discuss above, the user can press (e.g., poke) against the touch sensitive surface 13.10-318*b*. The user can also slide their finger 13.10-10 along the touch sensitive surface 13.10-318*b*. The user can stretch the touch sensitive surface 13.10-318*b* by using two fingers to stretch the conductive fabric 13.10-316*b* between the two fingers or push the conductive fabric 13.10-316*b* closer together. This gesture can be interpreted as zooming in or zooming out. The user can also pinch the conductive fabric 13.10-316. This gesture can be interpreted as taking a picture. In some examples, the number of fingers used in the gesture can indicate a different type of input. For example, two fingers swiping can be interpreted by the system as a different input relative to a single finger swiping, or three fingers swiping.

The strain gauge 13.10-320 can be incorporated into the frame 13.10-304 of the HMD 13.10-300. In some examples, the strain gauge 13.10-320 can be disposed on the frame 13.10-304 of the HMD 13.10-300. In some examples, the strain gauge 13.10-320 can be disposed within the frame 13.10-304. For example, the frame 13.10-304 can includes a slot in which the strain gauge 13.10-320 is disposed and the yarn and/or conductive fabric 13.10-316*b* can enter to physically connect to the strain gauge 13.10-320. Accordingly, the strain gauge 13.10-320 is shielded from environmental conditions, such as sweat, fluid, debris, and the like.

Any of the features, components, and/or parts, including the arrangements and configurations thereof shown in FIG. 13.10-3 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.10-3.

FIG. 13.10-4 illustrates a touch sensitive surface 13.10-418 on a light seal 13.10-412 of an HMD 13.10-400. The HMD 13.10-400 can be substantially similar to, including some or all of the features of, the devices described herein, such as the HMDs 13.10-100, 13.10-300 and the light seal 13.10-212. The touch sensitive surface 13.10-418 can include a distinct perimeter 13.10-419. In the illustrated example, the perimeter 13.10-419 of the touch sensitive surface 13.10-418 is a circle, however, the perimeter 13.10-419 can include a plurality of different shapes. For example, the perimeter 13.10-419 can be semi-circular, ovoid, rectangular, trapezoidal, polygonal, triangular, and a variety of different shapes. As discuss above, the touch sensitive surface 13.10-418 can include a conductive fabric with conductive fibers (not shown) and/or yarn that can be connected to a strain gauge.

The touch sensitive surface 13.10-418 can include an indicator to alert or guide the user to the touch sensitive surface 13.10-418. For example, when the user is donning the HMD 13.10-400, the user cannot see the outer surface of the light seal 13.10-412 or the touch sensitive surface 13.10-418 on the light seal 13.10-412 as the HMD 13.10-400 is intentionally blocking their view outside of light seal 13.10-412 and HMD 13.10-400. Therefore, when the user is donning the HMD 13.10-400, the user attempts to engage with the touch sensitive surface 13.10-418 blindly. The indicator can provide feedback to help to user locate the touch sensitive surface 13.10-418 in a variety of different ways so that the user can input commands to the HMD 13.10-400 using the touch sensitive surface 13.10-418.

In the illustrated example of FIG. 13.10-4, the indicator can use tactile feedback to guide the finger 13.10-10 of the user to the touch sensitive surface 13.10-418. For example, a plurality of projections 13.10-417 or bumps can project outward from the surface of a light seal 13.10-412 along the perimeter 13.10-419 of the touch sensitive surface. Therefore, when the user slides their finger 13.10-10 over the projections 13.10-417, the user's feels a tactile sensation on the tip of their finger 13.10-10. These tactile sensations can orient and alert the user to the perimeter of the touch sensitive surface 13.10-418. In other words, as the finger 13.10-10 of the user approaches the touch sensitive surface 13.10-418 the projections 13.10-417 provide tactile feedback to the user to know that they have arrived at the touch sensitive surface 13.10-418. The projections 13.10-417 can be spaced along the perimeter 13.10-419 of the touch sensitive surface 13.10-418. The space between adjacent projections 13.10-417 may be less than the width a fingertip, so that user can feel it. In some examples, the projection 13.10-417 may be a continuous projection that extends along the entire perimeter 13.10-419 of the touch sensitive surface 13.10-418. In this manner, the user knows when they are approaching the perimeter 13.10-419 of the touch sensitive surface 13.10-418, either from the outside of the touch sensitive surface 13.10-418 or from the inside of the touch sensitive surface 13.10-418.

The projections 13.10-417 can have a variety of different shapes. In the illustrated example, the projections 13.10-417 have a circular shape. However, the scope of the present disclosure incorporates a variety of different shapes for the projections, such a rectangular, triangular, polygonal, and the like.

In some examples, the projections 13.10-417 can be positioned in patterns to help orient the user. For example, the bottom portion of the perimeter 13.10-419 can have a different pattern than the rest of the perimeter 13.10-419. For example, the bottom portion of the perimeter can have a cluster of three projections 13.10-419 that are closer to each other to indicate to the user that they are approaching the bottom portion of the perimeter 13.10-419 of the touch sensitive surface 13.10-418. Similarly, a top portion of the perimeter 13.10-419 can have a similar pattern as the bottom portion of a different pattern. The same goes for a left portion of the perimeter 13.10-419 and a right portion of the perimeter 13.10-419.

In some examples, the tactile feedback can be dynamic. In other words, in some examples the projections 13.10-417 can be felt, and in other examples the projections 13.10-417 cannot be felt. For example, in situations where the touch sensitive surface 13.10-418 is turned on and active, the projections 13.10-417 can be felt and in situations where the touch sensitive surface 13.10-418 is turned off and not active the projections 13.10-417 cannot be felt. In some examples, the projections 13.10-417 can be part of an inflatable bladder that inflates to make the projections 13.10-417 project outward from the outer surface of the light seal 13.10-412 and deflate to make the projections 13.10-417 retract back into the light seal 13.10-412. In some other examples, the projections 13.10-417 can be selectively activated by a solenoid or other electrically actuated system that extends the projections 13.10-417 outward from the outer surface of the light seal 13.10-412 when the touch sensitive surface 13.10-418 is active, and retracts the projections 13.10-417 when the touch sensitive surface 13.10-418 is not active. As discussed below in more detail, the touch sensitive surface 13.10-418 can become active when a position sensor detects a near touch. When a near touch is detected, the touch sensitive surface 13.10-418 can be turned on and the projections 13.10-417 can be activated and extended.

In other examples, the indicator can include visual feedback that alerts or guides the finger 13.10-10 of the user to the touch sensitive surface 13.10-418. Visual feedback can be displayed on a display 13.10-405 of the HMD 13.10-400 to the user. The HMD 13.10-400 can include a sensor, such as a camera, that is disposed on the frame 13.10-404 of the HMD 13.10-400. The sensor can capture images or video of the touch sensitive surface 13.10-418 on the outer surface of the light seal 13.10-412. Accordingly, the display 13.10-405 can display the images or video from the sensor directly to the user on the display 13.10-405 to show the user where their finger 13.10-10 is in relation to the touch sensitive surface 13.10-418 to help the user find and utilize the touch sensitive surface 13.10-418.

In another example, the display 13.10-405 can merely display animations or visual cues to the user to orient the finger 13.10-10 of the user toward the touch sensitive surface 13.10-418. For example, the display 13.10-405 can display to the user an animation, rather than a real-time video or image of how close the finger 13.10-10 of the user is relative to the touch sensitive surface 13.10-418. The animations or visual cues may be display in a corner on a peripheral of the display 13.10-405 so that the animations or visual cues are not overlap over the central area of the display 13.10-405.

In another example, an inner surface of the light seal 13.10-412 can include a plurality of light emitting diodes. The light emitting diodes can be used to provide feedback to the user to guide the user to the touch sensitive surface 13.10-418. In some examples, the light emitting diodes can outline the touch sensitive surface 13.10-418 on the inner surface of the light seal 13.10-412. When the light emitting diodes light up, the user can see the relative location of the touch sensitive surface 13.10-418, albeit, from the inside of the light seal 13.10-412. In some examples, the light emitting diodes on the inner surface of the light seal 13.10-412 may light up to show the user the current location of the finger 13.10-10 of the user from the inside of the light seal so that user can see the approximate location of their finger 13.10-10 relative to the touch sensitive surface 13.10-418.

In another example, the color of the light emitting diodes can change color based on the location of the finger 13.10-10 of the user relative to the location of the touch sensitive surface 13.10-418. For example, the light emitting diode can transition from a red color to a yellow color to a green color based on the location of the finger 13.10-10. The light emitting diode can be red when the finger 13.10-10 of is not near the touch sensitive surface 13.10-418, transition to a yellow color as the finger 13.10-10 get closer to the perimeter 13.10-419 of the touch sensitive surface 13.10-418 and turn green when the finger 13.10-10 engages the touch sensitive surface 13.10-418.

In some examples, the indicator can include haptic feedback. The light seal 13.10-412 can include a haptic engine 13.10-434 that is electrically connected to processor 13.10-430 via a wire 13.10-432. The haptic engine is configured to provide haptic feedback (e.g., vibration) to the user when their finger 13.10-10 approaches the perimeter 13.10-419 of the touch sensitive surface 13.10-418. The vibration of the haptic engine 13.10-434 can orient and alert the user to the perimeter 13.10-419 of the touch sensitive surface 13.10-418. In other words, as the finger 13.10-10 of the user approaches the touch sensitive surface 13.10-418 the haptic engine 13.10-434 vibrates to provide feedback to the user to know that they have arrived at the touch sensitive surface 13.10-418. In this manner, the user knows when they are approaching the perimeter 13.10-419 of the touch sensitive surface 13.10-418, either from the outside of the touch sensitive surface 13.10-418 or from the inside of the touch sensitive surface 13.10-418.

The processor 13.10-430 can also perform a variety of different functions, including communicating with each of the feedback mechanisms discussed above. The processor 13.10-430 can function as a triggering device that can turn on and turn off the touch sensitive surface. In an attempt to conserve power, the touch sensitive surface 13.10-418 can be turned on for a user to provide input to the HMD 13.10-400 and turned off when the touch sensitive surface 13.10-418 is not in use. The processor 13.10-430 can be in communication with a number of different sensors.

The processor 13.10-430 can be in communication with a position sensor that detects a near touch, which is when the finger 13.10-10 or hand of the user is within a predetermined distance of the touch sensitive surface 13.10-418. For example, the processor 13.10-430 can be in communication with a plurality of proximity sensors that are disposed around the perimeter 13.10-419 of touch sensitive surface 13.10-418 or disposed within the touch sensitive surface 13.10-418. The proximity sensor can detect a near touch. Accordingly, when the proximity sensor senses a near touch, the processor 13.10-430 triggers the touch sensitive surface 13.10-418 to turn on so that the user can engage with the touch sensitive surface 13.10-418. In other words, the processor 13.10-430 can turn on the touch sensitive surface 13.10-418 when the sensor detects a near touch.

In another example, the processor 13.10-430 can be in communication with a camera that captures images and/or video of the touch sensitive surface 13.10-418. The camera monitors the touch sensitive surface 13.10-418 on the outer surface of the light seal 13.10-412 and captures images and/or video of the touch sensitive surface 13.10-418. When the camera detects a near touch, the processor 13.10-430 determines that the user is about to touch the touch sensitive surface 13.10-418 and triggers the touch sensitive surface 13.10-418 to turn on so that the user can engage with the touch sensitive surface 13.10-418.

The HMD 13.10-400 can use a number of different position sensors, such as proximity sensors, cameras, capacitance sensors, or any other type of sensor to detect a near touch (e.g., the approach of the user's finger, hand, etc. to trigger turning on the touch sensitive surface 13.10-418). These systems can be used to avoid having environmental factors, such as fluid, water, humidity, sweat, accidently engaging with the touch sensitive surface 13.10-418 and triggering input to the HMD 13.10-400 when the user was not intending to.

FIGS. 13.10-5 through 13.10-8B illustrate additional ways in which the user can provide input for the HMD in a variety of different manners. FIG. 13.10-5 illustrates an HMD 13.10-500 with a frame 13.10-504. The frame 13.10-504 of the HMD 13.10-500 is coupled to the light seal 13.10-512. The light seal 13.10-512 includes a touch sensitive surface 13.10-518 that is disposed on an outer surface of a light seal 13.10-512. In the illustrated example, the touch sensitive surface 13.10-518 can include a plurality of conductive fabrics 13.10-516 organized (e.g., weaved) in a specific pattern. In the illustrated example, the conduct fabric 13.10-516 is organized in a matrix pattern. When the conductive fabric 13.10-516 is organized in this pattern, the conductive fabric 13.10-516 can track the movement of the finger 13.10-10 along the touch sensitive surface 13.10-518. The conductive fabrics 13.10-516 can be spaced apart a predetermined distance such that environmental factors can not adversely affect input to the touch sensitive surface 13.10-518.

FIG. 13.10-6 illustrates an HMD 13.10-600 with a frame 13.10-604. The frame 13.10-604 of the HMD 13.10-600 is connected to the light seal 13.10-612. The light seal 13.10-612 includes a touch sensitive surface 13.10-618 that is disposed on an outer surface of a light seal 13.10-612. In the illustrated example, the touch sensitive surface 13.10-618 includes a plurality of planes 13.10-616 that are woven into the light seal 13.10-612 and are spaced vertically from each other. The planes 13.10-616 can get a capacitance reading to track the movement of the finger 13.10-10 of the user. In other words, the finger 13.10-10 can do a swiping motion or gesture in a vertical direction and the planes 13.10-616 can track the movement. This gesture can be used for volume control or scrolling. In some examples, the planes 13.10-616 can be spaced horizontally form each other and the user can do a swiping motion or gesture in a horizontal direction.

FIG. 13.10-7 illustrates an HMD 13.10-700 with a frame 13.10-704. The frame 13.10-704 can include a sensor 13.10-720. The sensor 13.10-720 can be an accelerometer that can detect vibrations in the frame 13.10-704. Accordingly, the user can tap the frame 13.10-704 of the HMD 13.10-700 with their finger 13.10-10. Tapping on the frame 13.10-704 can interpreted as input from the user to the HMD 13.10-700.

FIGS. 13.10-8A and 13.10-8B illustrate an HMD 13.10-800 with a frame 13.10-804. The frame 13.10-804 can include a sensor 13.10-820. The sensor 13.10-820 can be a strain gauge that can detect mechanical deflection of the frame 13.10-804. FIG. 13.10-8A illustrates the frame 13.10-804 in a natural or unconstrained state. FIG. 13.10-8B illustrates the frame 13.10-804 in constrained state in which the user is squeezing a top and a bottom of the frame 13.10-804 toward each other, thereby mechanically deflecting the frame 13.10-804. The deflection of the frame 13.10-804 can be interpreted as input to the HMD 13.10-800. For example, squeezing the HMD 13.10-800 as illustrated can be interpreted as a command to take a picture of the display of the HMD 13.10-800.

13.11: Face Engaging Structures

The following disclosure relates to wearable electronic devices (e.g., head-mountable device). More particularly, the present embodiments relate to connections between a display and a facial interface of a head-mountable device. Additionally, the present embodiments relate to lightweight variations of a facial interface.

When donning a head-mountable device or during use, the position and weight of the head-mountable device can affect the quality of user experience. Indeed, conventional head-mountable devices can be heavy due to the mass of materials (or combination of materials) used in manufacture. The additional weight can apply excess pressure to a user's face causing discomfort and pressure points at certain regions of the face. This user discomfort can degrade the overall AR/VR experience.

Exacerbating the weight factor, facial regions that contact a head-mountable device can have unique facial characteristics, such as variations of cranial width or length or variations in facial bones (e.g., frontal bone, zygoma, maxilla, etc.). Thus, these areas of high facial variability can undergo acute pressure or lend to faster user exhaustion.

Connections of the present disclosure address these and/or other issues of conventional head-mountable devices by providing dynamic adjustment. Indeed, connections of the present disclosure can dynamically adjust to the facial variability of users to provide a comfortable user experience. Additionally, connections (and associated connector positioning) of the present disclosure can better distribute applied loads across the user face for improved comfort compared to conventional head-mountable device. These connections can range from mechanical-based connectors providing more mechanical ranges of motion to organic connectors providing more organic ranges of motion.

To illustrate, the connectors may be positioned at various locations (e.g., maxilla, zygoma, frontal bone, etc.). The connectors can include various types of joints (e.g., pivot joint, soft joint, flexure joint, spring joint, etc.). The connectors can, in combination, provide a comfortable pressure distribution.

Additionally, or alternatively to connectors, a head-mountable device of the present disclosure includes facial interface with a flexible (or flexure) portion. The flexure portion of the facial interface can include an elastomer material capable of recovering to an original shape after being flexed or stretched. In certain instances, the flexure region includes a particular pattern (e.g., a serpentine pattern) that can naturally flex, move, and conform to a user face.

Furthermore, embodiments described below provide examples of adjustment mechanisms, connectors, and facial interfaces of head-mountable devices that are lighter and more comfortable than conventional head-mountable devices. To illustrate, a head-mountable device can include a display frame with relief cutouts (e.g., lozenge-shaped thru-holes, cored-out portions, dimples, etc.). The relief cutouts can reduce the weight of the head-mountable device while maintaining structural integrity of the head-mountable device.

In another example, the head-mountable device includes a stiffener member that allows for a reduced amount of implemented material (and hence, weight savings). The stiffener member can be positioned between the display frame and the facial interface. The stiffener member can also be implemented as an additional shot of material in manufacturing. Additionally, or alternatively, the stiffener member can be overmolded to strengthen certain areas (e.g., at connection sites).

These and other embodiments are discussed below with reference to FIGS. 13.11-1-13.11-13. However, those skilled in the art will readily appreciate that the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 13.11-1 illustrates a top view of a head-mountable device 100 worn on a user head 13.11-101. The head mountable device can include a display 13.11-102 (e.g., one or more optical lenses or display screens in front of the eyes of the user). The display 13.11-102 can include a display for presenting a virtual reality visualization, an augmented reality visualization, or other suitable visualization.

The head-mountable device 13.11-100 also includes a facial interface 13.11-104. As used herein, the term "facial interface" refers to a portion of the head-mountable device 13.11-100 that engages a user face via direct contact. In particular, a facial interface includes portions of the head-mountable device 13.11-100 that conform to (e.g., compress against) regions of the user face. For example, a facial interface may include a pliant (or semi-pliant) face track that spans the forehead, wraps around the eyes, contacts the zygoma and maxilla regions of the face, and bridges the nose. Furthermore, a facial interface can include various components forming a structure, webbing, cover, fabric, or frame of a head-mountable device disposed between the display 13.11-102 and the user skin. In particular implementations, a facial interface can include a seal (e.g., a light seal, environment seal, dust seal, air seal, etc.). It will be appreciated that the term "seal" can include partial seals or inhibitors, in addition to complete seals (e.g., a partial light seal where some ambient light is blocked and a complete light seal where all ambient light is blocked when the head-mountable device is donned).

In addition, the head-mountable device 13.11-100 includes connector(s) 13.11-106. As used herein, the terms "connector" or "joint" refer to a joining between the display 13.11-102 and facial interface 13.11-104. In some examples, a connector allows the facial interface 13.11-104 to translate or rotate relative to the display 13.11-102 via the connector. In other examples, the connector allows the facial interface 13.11-104 to both translate and rotate relative to the facial interface 13.11-104. For example, the connector(s) 13.11-106, when acted on can translate the facial interface 13.11-104 toward or away from the display 13.11-102 (e.g., in a linear fashion). In another example, the connection(s) 13.11-106 when acted on can rotate the facial interface 13.11-104 up or down relative to the display 13.11-102 (e.g., in an angular fashion). In particular implementations, the connector(s) 13.11-106 moveably constrain the facial interface 13.11-104 to the display 13.11-102 at a forehead location, a zygoma location, or a maxilla location.

In this manner, the connection(s) 13.11-106 can movably constrain the display 13.11-102 relative to the facial interface 13.11-104. As used herein, the term "movably constrain" refers to the type of connection that can dynamically move (e.g., translate or rotate), yet retain control over a particular element's movement or position. For example, to "movably constrain" means the connection(s) 13.11-106 can bound movement of the display 13.11-102 within two degrees of freedom (e.g., along a horizontal plane and along an additional plane non-planar with the horizontal plane) relative to the facial interface 13.11-104.

As used herein, the term "forehead region" refers to an area of a human face between the eyes and the scalp of a human. Additionally, the term "maxilla region" refers to an area of a human face corresponding to the zygomatic bone structure of a human. Similarly, the term "maxilla region" refers to an area of a human face corresponding to the maxilla bone structure of a human. Further, the term "temple region" refers to an area of a human face between a respective eye and ear on a particular side of a face (e.g., between cheek bones and a forehead region). It will be appreciated that the foregoing regions can correspond to particular structure of the head-mountable device 13.11-100. However, such structure of the head-mountable device 13.11-100 is not dependent on a face or a user.

The connector(s) 13.11-106 allow the facial interface 13.11-104 to conform freely to a wide range of facial topographies, thereby allowing the facial interface 13.11-104 to pivot and flex relative to the display 13.11-102. The connector(s) 13.11-106 can also distribute loads (e.g., forces exerted from different facial topographies or compression from the strap 13.11-103) evenly on a user's face. The connector(s) 13.11-106 can include one or more joints (e.g., pivot joint, soft joint, flexure joint, spring joint, etc.) that allow (or actively provide) translation or rotation of the facial interface 13.11-104 relative to the display 13.11-102.

Furthermore, locations of the connector(s) 13.11-106 can be modified or tuned, as can the number of connections. For example, the location and or number of the connector(s) 13.11-106 can correlate to an amount of force or pressure exerted on the user at any one datum (e.g., forehead region, maxilla region, zygoma region, etc.) In other instances, the location and/or the number of connector(s) 13.11-106 can correspond to rigidity (or rigidity variances) between the connector(s) 13.11-106.

Additionally shown in FIG. 13.11-1, the head-mountable device 13.11-100 includes one or more arms 13.11-108, 13.11-110. The arms 13.11-108, 13.11-110 are connected to the display 13.11-102 and extend distally toward the rear of the head. The arms 13.11-108, 13.11-110 are configured to secure the display in a position relative to the user head 13.11-101 (e.g., such that the display 13.11-102 is maintained in front of a user's eyes). For example, the arms 13.11-108, 13.11-110 extend over the user's ears 13.11-112. In certain examples, the arms 13.11-108, 13.11-110 rest on the user's ears 13.11-112 to secure the head-mountable device 13.11-100 via friction between the arms 13.11-108, 13.11-110 and the user head 13.11-101. For example, the arms 13.11-108, 13.11-110 can apply opposing pressures to the sides of the user head 13.11-101 to secure the head-mountable device 13.11-100 to the user head 13.11-101. Optionally, the arms 13.11-108, 13.11-110 can be connected to each other via a strap 13.11-103 (shown in the dashed lines) that can compress the head-mountable device 13.11-100 against the user head 13.11-101.

Any of the features, components, and/or parts, including the arrangements and configurations thereof shown in FIG. 13.11-1 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.11-1.

FIGS. 13.11-2A-13.11-2B respectively illustrate side and front view profiles of an example of the head-mountable device 13.11-100. As discussed above, the head-mountable device 13.11-100 includes the display 13.11-102, the facial interface 13.11-104, and the connector(s) 13.11-106. In particular, as shown in FIGS. 13.11-2A-13.11-2B, the facial interface 13.11-104 can indeed wrap around the eyes 13.11-201, bridge the nose 13.11-202, span the forehead 13.11-203, and contact a maxilla facial region 13.11-204 and a zygoma facial region 13.11-205.

Additionally shown in FIG. 13.11-2B are the locations of the connector(s) 13.11-106. In particular examples, the connector(s) 13.11-106 are located at the forehead 13.11-203, the maxilla facial region 13.11-204, and the zygoma facial region 13.11-205. Other locations of the connector(s) 13.11-106 are herein contemplated. However, the connector(s)

13.11-106 in at least these positions can provide a dynamic, yet stable connection between the display 13.11-102 and the facial interface 13.11-104.

It will be appreciated that the connector(s) 13.11-106 at the different locations can be the same, or in certain cases, different. For instance, the connector(s) 13.11-106 can include a first joint (e.g., socket joint, soft joint, molded hinge joint, butterfly flexure joint, cam pivot joint, cross axis pivot joint, etc.) positioned at the forehead 13.11-203. In addition, the connector(s) 13.11-106 can include a second joint, different from the first joint, such as a pivot joint, elastomer spring joint, soft joint, single ball joint, etc. Indeed, different arrangements and types of the connector(s) 13.11-106 can be implemented to provide a particular force profile, amount of rigidity, etc.

Any of the features, components, and/or parts, including the arrangements and configurations thereof shown in FIGS. 13.11-2A-13.11-2B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-2A-13.11-2B.

As previously discussed, head-mountable device 13.11-100 can include connections at various locations. The forehead location of the connector(s) will now be discussed below.

FIG. 13.11-3A illustrates an example of the connection(s) 13.11-106 located at the forehead 13.11-203. The connector(s) 13.11-106 can translate and/or rotate the facial interface 13.11-104 relative to the display 13.11-102 via the connector(s) 13.11-106. The connector(s) 13.11-106 can vary in mobility (e.g., ranging from mechanical to organic), as will be discussed below. Specifically, FIGS. 13.11-3B-13.11-3E illustrate a few examples of the connector(s) 13.11-106, namely connectors 13.11-300-13.11-306, respectively.

FIG. 13.11-3B illustrates the connector 13.11-300. The connector 13.11-300 includes a single degree of freedom. In particular, the connector 13.11-300 can include a pivot connection that rotatably connects the display 13.11-102 to the facial interface 13.11-104. For instance, the facial interface 13.11-104 can laterally pivot relative to the display 13.11-102, where the display 13.11-102 includes a pivot point. In these or other examples, the connector 13.11-300 limits the amount of motion (e.g., to certain angular thresholds relative to the pivot point).

FIG. 13.11-3C illustrates the connector 13.11-302. The connector 13.11-302 includes one degree of freedom plus translation. In certain implementations, the connector 13.11-302 includes a cam pivot. The connector 13.11-302 can rotationally pivot similar to the connector 13.11-300. In addition, the connector 13.11-302 can slide laterally such that the pivot point can also move. In this manner, the connector 13.11-302 can slidably and rotationally connect the display 13.11-102 to the facial interface 13.11-104. With more free range of motion, the connector 13.11-302 allows more organic motion than the connector 13.11-300.

FIG. 13.11-3D illustrates the connector 13.11-304. The connector 13.11-304 includes a cross-axis pivot joint connector (e.g., butterfly flexure). The connector 13.11-304 therefore includes a cross-axis design allowing each contact point on the facial interface 13.11-104 to move independently in a plane (e.g., x-y plane). The thickness of the cross-axis pivot joint can vary in flexure dependent on the thickness of a cross-axis member. For example, increasing the thickness (e.g., cross-sectional area) or decreasing the length of the cross-axis member(s) increases the flexural rigidity of the cross-axis pivot joint. Inversely, decreasing the thickness or increasing the length of the cross-axis member(s) decreases the flexural rigidity of the cross-axis pivot joint. For instance, a cross-axis member with a larger cross-sectional area while maintaining the length of the cross-axis member(s) increases the amount of compression force required to deflect the cross-axis member(s). In addition, the flexural rigidity can be altered by varying the material type or durometer.

FIG. 13.11-3E illustrates the connector 13.11-306. The connector 13.11-306 includes a flexure joint connector (e.g., a compliant mechanism capable of storing strain energy in one or more deformable/elastic members). The connector 13.11-306 can include a symmetrical design. In addition, the connector 13.11-306 can include a predetermined amount of stiffness in one or more directions, and a predetermined amount of flexibility in one or more different directions. The topology or architecture of the flexure joint can coincide with desired rigidity/flexibility properties in particular directions for providing mobility and/or support of the facial interface 13.11-104 relative to the display 13.11-102.

Any of the features, components, and/or parts, including the arrangements and configurations thereof shown in FIGS. 13.11-3A-13.11-3E can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-3A-13.11-3E.

FIG. 13.11-4A illustrates the connector(s) 13.11-106 located at the zygoma facial region 13.11-205. The connector(s) 13.11-106 can moveably constrain the facial interface 13.11-104 to the display 13.11-102 in the same or similar ways as discussed above. The connector(s) 13.11-106 can include a variety of different connectors. Examples of the connector(s) 13.11-106, namely connectors 13.11-400-13.11-414, are respectively discussed below in relation to FIGS. 13.11-4B-13.11-4E.

FIG. 13.11-4B illustrates the connector 13.11-400. The connector 13.11-400 can include a pivot joint (e.g., a single ball joint). The connector 13.11-400 includes a male portion and a female portion. The male portion is positioned on the display 13.11-102, and the female portion is positioned on the facial interface 13.11-104. When the male and female portions of the connector 13.11-400 are joined, the facial interface 13.11-104 can move relative to the display 13.11-102. In particular, the connector 13.11-400 can allow for spherical motion between the facial interface 13.11-104 and the display 13.11-102 of about 5 degrees, about 10 degrees, about 25 degrees, about 50 degrees, about 70 degrees, or more.

FIG. 13.11-4C illustrates the connector 13.11-402. The connector 13.11-402 can include a spring joint connector (e.g., metal spring, elastomer spring, plastic spring, composite spring, etc.) located at the zygomatic location. The connector 13.11-402 can translate and rotate (e.g., to accommodate cheek or eye movement, or a user's particular facial features). The connector 13.11-402 can be rigidly attached to the display 13.11-102, while being rotatably and translatably connected to the facial interface 13.11-104.

FIGS. 13.11-4D-13.11-4E illustrate the connectors 13.11-406-13.11-408, respectively. The connectors 13.11-406-13.11-408 include soft joints with compressible portions 13.11-407. The term "soft joint" references a joint that can compress and decompress. For example, a soft joint includes datums or hardstops, between which the soft joint can compress. The connector 13.11-406 includes two compressible portions 13.11-407, while the connector 13.11-408 includes a single compressible portion. The compressible portions 13.11-407 can be disposed between rigid portions of the connectors 13.11-406, 13.11-408. In addition, the positioning of the compressible portions 13.11-407 within the connectors 13.11-406, 13.11-408 can provide corresponding mobility in a predetermined direction. For instance, the connector 13.11-406 with two of the compressible portions 13.11-407 can include mobility (e.g., compressibility) in a first direction and mobility in a second direction different than the first direction. The connector 13.11-408 includes mobility in at least the first direction by virtue of a single compressible portion.

In one example, the compressible portions 13.11-407 include a foam material. The foam material can be adhered (e.g., glued, pasted, melted, etc.) in between portions of the connectors 13.11-406, 13.11-408. Additionally, or alternatively, the compressible portions 13.11-407 can include materials with properties that impart flexibility, softness, compressibility, deformability, etc. Examples of such material can include silicone, polymers, elastomers, hydrogels, etc. In addition, the compressible portions 13.11-407 can include molded material, printed material, cast material, etc.

FIGS. 13.11-4F-13.11-4G respectively illustrate cross-sectional views of the connectors 13.11-410, 13.11-412. The connector 13.11-410 includes a socket connector. The connector 13.11-412 includes a mini-socket connector. The connectors 13.11-410, 13.11-412 are similar to the connector 13.11-400—each including a male and female portion. The female portion (i.e., socket) corresponds to the facial interface 13.11-104, and the male portion (i.e., pin and ball) corresponds to the display 13.11-102. In particular, however, the connectors 13.11-410, 13.11-412 include a pivot center located at a specific place. For instance, the connector 13.11-410 includes a pivot center 13.11-411 located on the surface of the facial interface 13.11-104. By contrast, the connector 13.11-412 includes a pivot center 13.11-413 that is positionally offset from the surface of the facial interface 13.11-104 (e.g., by about 0.5 mm to about 5 mm, or about 1.4 mm). In at least some examples, these variations of a pivot center can provide different rotational mobility.

FIGS. 13.11-4H illustrates the connector 13.11-414. The connector 13.11-414 is the same as the connector 13.11-306 discussed above in relation to FIG. 13.11-3E. Indeed, connector 13.11-414 can include a flexure joint providing compliant-mechanism based mobility between the facial interface 13.11-104 and the display 13.11-102.

Any of the features, components, and/or parts, including the arrangements and configurations thereof shown in FIGS. 13.11-4A-13.11-4H can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-4A-13.11-4H.

As briefly indicated above, examples of a head-mountable device disclosed herein include a facial interface with one or more flexure portions that conform to myriad facial profiles and contours, thereby evenly distributing pressure and providing a comfortable user experience. These flexure portions can, via connectors described above, allow the facial interface 13.11-104 to more easily translate or rotate relative to the display 13.11-102. In accordance with one or more such examples, FIGS. 13.11-5A-13.11-5G illustrate example facial interfaces with flexure portions.

FIG. 13.11-5A illustrates a perspective view of a head-mountable device 13.11-500 including the display 13.11-102, a facial interface 13.11-502, and the connector(s) 13.11-106. The facial interface 13.11-502 includes a flexure portion 13.11-504.

As used herein, the term "flexure portion" refers to a section of a facial interface that is independently movable from other sections of the facial interface. In particular examples, a flexure portion is movable, bendable, flexible, deformable, translatable, rotatable (i.e., twistable), etc. relative to one or more other sections of the facial interface 13.11-104. A flexure portion can include various patterns, relief cutouts, slits, holes, etc. defined by the facial interface facial interface 13.11-104 to impart the desired flexibility. In certain implementations, a flexure portion includes a serpentine pattern (e.g., winds, turns, curvature, folds, etc.). Additionally, a flexure portion can include a same material as other non-flexure (e.g., solid) sections of the facial interface 13.11-104. In other examples, the flexure portion includes a different material than other non-flexure sections of the facial interface 13.11-104.

As will be described below in relation to FIGS. 13.11-5B-13.11-5G, the flexure portion 13.11-504 can be positioned at various locations (e.g., top corner region, bottom corner region, forehead region, temple region, etc.). In particular, the various flexure portions will be described positionally in relation to connectors **13.11-106*a*-13.11-106*f*. The connectors 13.11-106*a*, 13.11-106*b* correspond to forehead connectors for engaging a forehead of a face. The connectors 13.11-106*c*, 13.11-106*d* correspond to zygoma connectors for engaging a zygoma region of a face. The connectors 13.11-106*e*, 13.11-106*f*** correspond to maxilla connectors for engaging a maxilla region of a face.

FIG. 13.11-5B illustrates a facial interface 13.11-506. The facial interface 13.11-506 is devoid of a flexure portion. That is, each section between the connectors **13.11-106*a*-106*f*** includes a solid section.

By contrast, FIG. 13.11-5C illustrates a facial interface 13.11-508 with flexure portions **13.11-510*a*-13.11-510*b* positioned a temple region of a face. Indeed, the flexure portions 13.11-510*a*-13.11-510*b* are respectively positioned in between the forehead connectors (i.e., the connectors 13.11-106*a*, 13.11-106*b*) and the zygoma connectors (i.e., the connectors 13.11-106*c*, 13.11-106*d*). The flexure portions 13.11-510*a*-13.11-510*b* can span an entire section of the facial interface 13.11-508 between the forehead connectors and the zygoma connectors. In other implementations, the flexure portions 13.11-510*a*-13.11-510*b* can span a partial section of the facial interface 13.11-508 between the forehead connectors and the zygoma connectors. For instance, the flexure portions 13.11-510*a*-13.11-510*b* may stop at a connector support area that encompasses a threshold distance around one or more of the connectors 13.11-106*a*-106*d*, thereby leaving a more supportive region underneath and immediately adjacent to the connectors 13.11-106*a*-13.11-106*d***.

In FIG. 13.11-5C, solid sections-devoid of flexure portions of the facial interface 13.11-508 also exist. In particular, the forehead region between the connectors **13.11-106*a***,

13.11-106*b* includes a solid section. Similarly, the bottom corner region between the zygoma connectors and the maxilla connectors are solid sections.

FIG. 13.11-5D illustrates a facial interface 13.11-512 with flexure portions 13.11-514*a*, 13.11-514*b* positioned at the temple region, and flexure portions 13.11-514*c*, 13.11-514*d* positioned at a bottom corner region. In particular, the flexure portions 13.11-514*a*, 13.11-514*b* are similarly positioned between the forehead connectors (i.e., the connectors 13.11-106*a*, 13.11-106*b*) and the zygoma connectors (i.e., the connectors 13.11-106*c*, 13.11-106*d*). In addition, the flexure portions 13.11-514*c*, 13.11-514*d* are respectively positioned between the zygoma connectors and the maxilla connectors (i.e., the connectors 13.11-106*e*, 13.11-106*f*). FIG. 13.11-5D also shows a solid section in the forehead region between the connectors 13.11-106*a*, 13.11-106*b*.

FIG. 13.11-5E illustrates a facial interface 13.11-516 with flexure portions 13.11-518*a*-13.11-518*e*. The flexure portions 13.11-518*a*, 13.11-518*c* are respectively positioned at temple regions of a face between the forehead connectors (i.e., the connectors 13.11-106*a*, 13.11-106*b*) and the zygoma connectors (i.e., the connectors 13.11-106*c*, 13.11-106*d*). The flexure portion 13.11-518*b* is positioned at a forehead region of a face (i.e., between the connectors 13.11-106*a*, 13.11-106*b*). The flexure portions 13.11-518*d*, 13.11-518*e* are positioned at a bottom corner region between the zygoma connectors and the maxilla connectors (i.e., the connectors 13.11-106*e*, 13.11-106*f*). Further shown in FIG. 13.11-5E, the only portions of the facial interface 13.11-516 devoid of a flexure portion includes the regions at the joints or connectors themselves (and a surrounding radius).

FIG. 13.11-5F illustrates a facial interface 13.11-520 with flexure portions positioned at the forehead region and a bottom temple region (as a temple flare). In particular, the facial interface 13.11-520 includes the flexure portion 13.11-522*a* positioned at a forehead region of a face between the connectors 13.11-106*a*, 13.11-106*b*. In addition, the facial interface 13.11-520 includes flexure portions 13.11-522*b*, 13.11-522*c* respectively positioned between the forehead connectors and the zygoma connectors, and adjacent to the zygoma connectors (i.e., connectors 13.11-106*c*, 13.11-106*d*). In FIG. 13.11-5F, solid regions devoid of flexure portions also include portions of the forehead region, portions of the temple region, and all of the bottom corner region between the zygoma and maxilla connectors.

FIG. 13.11-5G illustrates a facial interface 13.11-524 with flexure portions 13.11-526*a*-13.11-526*e*. The flexure portions 13.11-526*a*, 13.11-526*e* are respectively positioned between the forehead connectors and the zygoma connectors, and adjacent to the zygoma connectors (i.e., connectors 13.11-106*c*, 13.11-106*d*). The flexure portions 13.11-526*b*, 13.11-526*d* are respectively positioned between the forehead connectors and the zygoma connectors, and adjacent to the forehead connectors (i.e., connectors 13.11-106*a*, 13.11-106*b*). In addition, the flexure portion 13.11-526*c* is positioned at a forehead region of a face between the connectors 13.11-106*a*, 13.11-106*b*. In FIG. 13.11-5G, solid regions devoid of flexure portions include portions of the temple region and all of the bottom corner region between the zygoma and maxilla connectors.

It will be appreciated that the foregoing examples of flexure portions can be implemented to provide varying degrees (and places) of flexibility and conformability. In this manner, the head-mountable device of the present disclosure can provide myriad different forms of flexibility as may be desired.

Any of the features, components, and/or parts, including the arrangements and configurations thereof shown in FIGS. 13.11-5A-13.11-5G can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-5A-13.11-5G.

The head-mountable device of the present disclosure can be manufactured in myriad different ways. Some methods or manufacturing processes can provide various advantages (e.g., decreased material consumption, weight savings, manufacturing friendliness, etc.). The following description in relation to FIGS. 13.11-6A-12 describes manufacturing and/or associated apparatus aspects.

FIGS. 13.11-6A-13.11-6B illustrate an example assembly 13.11-600 of a head-mountable device implementing a double shot of material in accordance with one or more examples of the present disclosure. As shown, the assembly 13.11-600 includes the connectors 13.11-106*a*-13.11-106*f* described above. In addition, the assembly 13.11-600 includes a facial interface 13.11-602 having flexure portions 13.11-604. The flexure portions 13.11-604 may be the same as, or similar to the flexure portions 13.11-510*a*, 13.11-510*b* described above in relation to FIG. 13.11-5C.

In particular implementations, the assembly 13.11-600 in FIG. 13.11-6A includes only a first shot of material. In some examples, the first shot of material includes an injection molded material. For instance, the first shot of material includes a more rigid material, such as at least one of Pebax, TPU, TPE, PP, ABS, etc. In other examples, the first shot of material is less rigid (and more flexible).

Additionally shown in FIG. 13.11-6A, the assembly 13.11-600 can include tooling inserts 13.11-606. The tooling inserts 13.11-606 can be positioned at locations configured to receive a second shot of material. The tooling inserts 13.11-606 can be positioned at various locations along the facial interface 13.11-602. In particular implementations, however, the tooling inserts 13.11-606 are positioned at the forehead region between the connectors 13.11-106*a*, 13.11-106*b*, and at temple regions between the forehead connectors and the zygoma connectors (i.e., between the connectors 13.11-106*a*, 13.11-106*b* and the connectors 13.11-106*c*, 13.11-106*d*).

In FIG. 13.11-6B, the assembly 13.11-600 includes a second shot of material applied to the tooling inserts 13.11-606. In one or more examples, the second shot of material includes an overmolded, flexible material. For instance, the second shot of material includes an elastomer material (e.g., Neoprene, EVA, PVC, Acrylonitrile Butadiene Rubber, Ethylene Propylene, Fluorelastomer, Silicone, etc.). Thus, in some examples, the first shot of material and the second shot of material can be different. In these or other examples, the assembly 13.11-600 implementing double shots of material can provide various advantages, such as strategically positioned support, improved flexibility, etc.

In alternative examples, more than two shots of material can be implemented. Further, in some alternative examples, only a single shot of material is implemented. For instance, the assembly 13.11-600 can include a single, lightweight material (e.g., all aluminum).

Any of the features, components, and/or parts, including the arrangements and configurations thereof shown in FIGS. 13.11-6A-13.11-6B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-6A-13.11-6B.

Other variations of combined materials are also herein contemplated. For example, some head-mountable devices of the present disclosure include a display frame of the display 13.11-102, where the display frame includes a combination of frame shells forming a box-type frame enclosure. In accordance with one or more such examples, FIGS. 13.11-7A-13.11-7B illustrate an example display 13.11-700 of a head-mountable device. In particular, FIGS. 13.11-7A-13.11-7B respectively illustrate assembled and exploded views of the display 13.11-700.

As shown, the display 13.11-700 includes a first frame shell 13.11-702 and a second frame shell 13.11-704. The first frame shell 13.11-702 includes a pocket 13.11-706 defined by the surface of the first frame shell 13.11-702. The pocket 13.11-706 can include one or more recesses, cutouts, etc. In certain implementations, the pocket 13.11-706 is defined by tooling surfaces (e.g., for injection molding, casting, etc.). The pocket 13.11-706 can additionally include webbing, such as a mold webbing, (indicated in dashed lines) that sections off or separates different portions of the pocket 13.11-706.

In some examples, the first frame shell 13.11-702 and the second frame shell 13.11-704 include different materials (albeit not required). For instance, the first frame shell 13.11-702 can include a plastic material, and the second frame shell 13.11-704 can include a metal material. In this manner, the second frame shell 13.11-704 can be combined with the first frame shell 13.11-702 to increase a stiffness or rigidity across the display 13.11-700. Indeed, the second frame shell 13.11-704 as a stiffener member can provide structural support, thereby stabilizing the display frame and increasing resistance to stresses (e.g., torsional stress, compressive stress, tension stress, etc.).

The first frame shell 13.11-702 and the second frame shell 13.11-704 can be formed or assembled in a variety of different ways. In some examples, the first frame shell 13.11-702 and the second frame shell 13.11-704 can be manufactured using molding techniques (e.g., injection molding, casting, etc.). In certain implementations, the first frame shell 13.11-702 includes a first-shot mold, and the second frame shell 13.11-704 includes a second-shot mold.

Any of the features, components, and/or parts, including the arrangements and configurations thereof shown in FIGS. 13.11-7A-13.11-7B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-7A-13.11-7B.

As discussed above, displays (specifically display frames) can include a combination of materials. Additionally, or alternatively, display frames have one or more a relief cutouts. In accordance with one or more such examples, FIGS. 13.11-8A-13.11-8B illustrate an example display 13.11-800.

As shown, the display 13.11-800 includes relief cutouts 13.11-802 defined by the surface of the display frame. As used herein, the term "relief cutouts" refers to thru-holes, dimples, slits, slots, core-outs, recesses, etc. In addition, a relief cutout provides weight advantages over a conventional head-mountable device while maintaining the structural integrity (e.g., deflection integrity, stress integrity, etc.) of the display frame.

Here, the relief cutouts 13.11-802 include thru-holes in the display frame. The thru-holes can be sized and shaped in myriad different ways. In some examples, the thru-holes are rectangular, square, triangular, circular, etc. In other examples, the thru-holes are lozenge-shaped (e.g., cylindrical, pill-shaped) thru-holes. The relief cutouts 13.11-802 also include a spacing that can be optimized or tuned (as may be desired). Indeed, the relief cutouts 13.11-802 can be spaced apart to satisfy (e.g., meet or exceed) a threshold force or stress/strain profile of the display 13.11-800. Additionally, or alternatively, the relief cutouts 13.11-802 can be spaced apart to provide a particular amount of flexibility or rigidity. In certain implementations, the relief cutouts 13.11-802 are omitted from certain areas (e.g., at connector support areas corresponding to the connector(s) 13.11-106). Thus, some connector support areas are devoid of the relief cutouts 13.11-802.

Additionally, as shown in FIG. 13.11-8B, the display 13.11-800 includes a support structure 13.11-804 and an overmolding 13.11-806. The support structure 13.11-804 can be rigid (e.g., a metal material). By contrast, the overmolding 13.11-806 can include a plastic material, elastomer material, etc. The support structure 13.11-804 can be positioned at predetermined areas of the display 13.11-800, for instance, at areas corresponding to the connector(s) 13.11-106 (e.g., for increased rigidity and/or structural integrity per finite element analysis). To illustrate, the support structure 13.11-804 is positioned directly underneath the connector(s) 13.11-106 and extends a distance past at least one relief cutout. In certain implementations, the support structure 13.11-804 is positioned all along the display 13.11-800.

In particular implementations, the support structure 13.11-804 is positioned at an offset distance 13.11-808 from the overmolding 13.11-806. The offset distance 13.11-808 can range from about 0.2 mm to about 4 mm. In certain examples, the offset distance 13.11-808 is about 0.75 mm.

Any of the features, components, and/or parts, including the arrangements and configurations thereof shown in FIGS. 13.11-8A-13.11-8B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-8A-13.11-8B.

The head-mountable devices, and in particular the frames of the displays of the present disclosure, can be formed of various materials and with different geometric variations. These example display frames can provide various advantages, including decreased weight. In accordance with one or more such examples, FIGS. 13.11-9A-13.11-9B respectively show example head-mountable devices **13.11-900*a*, 13.11-900*b* with example displays 13.11-902, 13.11-904**.

In FIG. 13.11-9A, the head-mountable device **13.11-900*a* includes the display 13.11-902 connected to the facial interface 13.11-104 via the connector(s) 13.11-106. The display 13.11-902 in this example includes a frame including a single, lightweight material. For instance, the display 13.11-902 includes an all-metal frame. In certain implementations, the display 13.11-902 includes stainless steel (e.g., SUS 17-4PH). In other implementations, the display 13.11-902 includes aluminum (e.g., AL 6061). In alternative embodiments, the display 13.11-902** includes at least one of a composite material (e.g., carbon fiber), polycarbonate or thermoplastic material (e.g., Lexan), or other suitable material with a higher strength-to-weight ratio (e.g., titanium, magnesium, graphene, ceramics, etc.).

In FIG. 13.11-9B, the head-mountable device 13.11-900*b* similarly includes the display 13.11-904 connected to the facial interface 13.11-104 via the connector(s) 13.11-106. The display 13.11-904 can include one or more materials as just described for the display 13.11-902. In particular, however, the display 13.11-904 includes a frame including cored-out regions 13.11-906 in the forehead and temple areas of a face. The cored-out regions 13.11-906 can reduce the amount of material in the display 13.11-904, thereby reducing the weight of the display 13.11-904. In certain implementations, the cored-out regions 13.11-906 correspond to areas of the display 13.11-904 between the connector(s) 13.11-106. However, it will be appreciated that the cored-out regions 13.11-906 can be positioned in additional or alternative locations along the frame of the display 13.11-904, as may be desired.

Any of the features, components, and/or parts, including the arrangements and configurations thereof shown in FIGS. 13.11-9A-13.11-9B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-9A-13.11-9B.

The present disclosure also contemplates stiffener members disposed between the facial interface 13.11-104 and the display 13.11-102. In accordance with one or more such examples, FIGS. 13.11-10A-13.11-10B illustrate head-mountable devices 13.11-1000*a*, 13.11-1000*b*. In particular, FIG. 13.11-10A shows the head-mountable device 13.11-1000*a* includes a display 13.11-1002*a* (i.e., a display frame) connected to the facial interface 13.11-104 via the connector(s) 13.11-106, as similarly described above. In addition, the head-mountable device 13.11-1000*a* includes a stiffener member 13.11-1004*a* disposed between the display 13.11-1002*a* and the facial interface 13.11-104. The stiffener member 13.11-1004*a* can include an additional frame, skeleton, hoop, or support structure. The stiffener member 13.11-1004*a* can extend partially along the display 13.11-1002*a* (e.g., until the zygoma connector), or in certain cases all along the display 13.11-1002*a* (e.g., until the maxilla connector).

In particular implementations, a gap exists between the stiffener member 13.11-1004*a* and the display 13.11-1002*a*. In these cases, the connectors 13.11-106 can bridge the gap between the stiffener member 13.11-1004*a* and the display 13.11-1002*a*.

The display 13.11-1002*a* further includes cored-out regions 13.11-1006. The cored-out regions 13.11-1006 can provide weight savings, as may be desired.

Likewise, FIG. 13.11-10B shows the head-mountable device 13.11-1000*b* includes a display 13.11-1002*b* connected to the facial interface 13.11-104 via the connector(s) 13.11-106, as similarly described above. In addition, the head-mountable device 13.11-1000*b* includes a stiffener member 13.11-1004*b* disposed between the display 13.11-1002*b* and the facial interface 13.11-104. The stiffener member 13.11-1004*b* can include an additional frame, skeleton, hoop, or support structure. The stiffener member 13.11-1004*b* can extend partially along the display 13.11-1002*b* (e.g., until the zygoma connector), or in certain cases all along the display 13.11-1002*a* (e.g., until the maxilla connector). The display 13.11-1002*b* further includes cored-out regions 13.11-1010, similar to the cored-out regions 13.11-1006 described above.

Any of the features, components, and/or parts, including the arrangements and configurations thereof shown in FIGS. 13.11-10A-13.11-10B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-10A-13.11-10B.

As mentioned above, the head-mountable devices of the present disclosure can include myriad different configurations of cored-out portions. In accordance with one or more such examples, FIGS. 13.11-11A-13.11-11C illustrate display frames 13.11-1100*a*-13.11-1100*c* with respective cored-out portions (e.g., thru-holes, partial holes, recesses, etc.). In particular, FIG. 13.11-11A shows the display frame 13.11-1100*a* includes cored-out portions 13.11-1102*a*-13.11-1102*d* at the forehead and temple regions of a face. FIG. 13.11-11B shows the display frame 13.11-1100*b* including cored-out portions 13.11-1102*a*-13.11-1102*b* (thus only including cored-out regions at the forehead). In addition, FIG. 13.11-11C shows the display frame 13.11-1100*c* including cored-out portions 13.11-1104. The cored-out portions 13.11-1104 are defined by one or more backside surfaces oriented towards a facial interface (not shown). Thus, the cored-out portions 13.11-1104 are perpendicular to the cored-out portions shown in FIGS. 13.11-11A-13.11-11B.

It will be appreciated that the cored-out portions of the display frames 13.11-1100*a*-13.11-1100*c* can be located in various positions and in various configurations or patterns (e.g., to decrease the overall weight of the display frame). The cored-out portions can also be configured to maintain a structural stability of the display frame.

Any of the features, components, and/or parts, including the arrangements and configurations thereof shown in FIGS. 13.11-11A-13.11-11C can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-11A-13.11-11C.

FIG. 13.11-12 illustrates a display frame 13.11-1200 including an array of holes 13.11-1202 in accordance with one or more examples of the present disclosure. The array of holes 13.11-1202 can reduce an amount of material (and therefore, weight) of the display frame 13.11-1200. The array of holes 13.11-1202 can include a hole density such that at least (or at most) a certain number of holes is found within a predetermined area of the display frame 13.11-1200. As an alternative to the array of holes 13.11-1202, dimples or non-thru-holes can similarly be implemented in the display frame 13.11-1200.

Any of the features, components, and/or parts, including the arrangements and configurations thereof shown in FIG. 13.11-12 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.11-12.

FIG. 13.11-13 shows a display frame 13.11-1300 in accordance with one or more examples of the present disclosure. As illustrated, the display frame 13.11-1300 includes a single-shot plastic portion 13.11-1302. A variety of different plastics can be implemented. Moreover, the single-shot plastic portion 13.11-1302 can assume any number of different shapes and forms (albeit schematically shown as a block with various straight and curved edges).

In addition, the display frame 13.11-1300 can include metal stiffeners 13.11-1304. Examples of the metal stiffeners 13.11-1304 include sheets or pieces of metal (whether molded, shaped, cast, etc.). Further, the metal stiffeners 13.11-1304 can be arranged in different ways. For example, the metal stiffeners 13.11-1304 can be arranged in an array that structurally couples or connects them to each other (e.g., via attachment mechanisms 13.11-1308 and fasteners 13.11-1310). For instance, the metal stiffeners 13.11-1304 can be arranged partially around a perimeter of the single-shot plastic portion 13.11-1302. In other examples, the metal stiffeners can be arranged entirely around a perimeter of the single-shot plastic portion 13.11-1302.

The attachment mechanisms 13.11-1308 can include various pins, clasps, hinges, cams, swivels, balls, knuckles, springs, etc. Likewise, the fasteners 13.11-1310 can include screws, bolts, pins, press-fits, welds, bonds, etc.

In some examples, the display frame 13.11-1300 includes adhesives (not shown) to structurally couple the metal stiffeners 13.11-1304 (and associated attachment mechanisms 13.11-1308) and the single-shot plastic portion 13.11-1302. Examples of adhesives include glue, epoxy, thermal bonds, tape strips, etc. In alternative examples, the metal stiffeners 13.11-1304 and the single-shot plastic portion 13.11-1302 include no adhesives in between these components. For example, the metal stiffeners 13.11-1304 and the single-shot plastic portion 13.11-1302 can be sandwiched together via applied pressure from one or more additional frame layers, fabric, etc.

In some examples, the display frame 13.11-1300 can include additional layers (not shown). For instance, the display frame 13.11-1300 can include a final plastic "cover" to provide cosmetic and/or additional stiffness properties to the display frame 13.11-1300. The additional cover can be attached to the metal stiffeners 13.11-1304 in a same or similar fashion as just described between the metal stiffeners 13.11-1304 and the single-shot plastic portion 13.11-1302.

Any of the features, components, and/or parts, including the arrangements and configurations thereof shown in FIG. 13.11-13 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.11-13.

FIG. 13.11-14A illustrates a top view of a frame 13.11-1410 of a device seal according to one embodiment. The frame 13.11-1410 can be substantially similar to, including some or all of the features of, the frames described herein.

In some examples, the frame 13.11-1410 can include one or more stiffeners. For example, the frame 13.11-1410 can include a top stiffener 13.11-1421 that is positioned on a top forehead region of the frame 13.11-1410. The top stiffener 13.11-1421 can be curved or angled to match a curve of the frame 13.11-1410. In some examples, the curve of the top of the frame 13.11-1410 and the top stiffener 13.11-1421 are designed to match the curvature of a user's forehead. In some examples, the curvature of the top of the frame 13.11-1410 and the top stiffener 13.11-1421 are designed to allow for a gap between the user's forehead and the frame 13.11-1410. The top stiffener 13.11-1421 can aid in maintaining the gap between the frame 13.11-1410 and the user's forehead. Thus, the top stiffener 13.11-1421 can provide structural support to the frame 13.11-1410 and can be used to modify the stiffness and/or structural integrity of the frame. In some examples, there can be multiple top stiffeners in the forehead region of the frame 13.11-1410, and each of the multiple top stiffeners can have different profiles, geometries, and/or material properties that effect the properties imparted to the frame 13.11-1410.

The top stiffener 13.11-1421 can include or can be made from any suitable stiff or rigid material capable of maintaining its shape under the amounts of stress likely to be encountered from typical use of the HMD, thereby increasing comfort and predictability to the user. In some examples, the top stiffener 13.11-1421 can undergo elastic deformation. The top stiffener 13.11-1421 can include sheet metal, aluminum, steel, carbon fiber, plastic, combinations thereof, or any other suitable material capable of stiffening the frame 13.11-1410.

The top stiffener 13.11-1421 can be secured to the frame 13.11-1410 using any suitable attachment methods. In some examples, the top stiffener 13.11-1421 is fastened to the frame 13.11-1410 using fastening screws 13.11-1423. In some examples, the fastening screws 13.11-1423 can attached ends of the top stiffener 13.11-1421 to a metallic anchor 13.11-1425 of the frame 13.11-1410, which in turn is connected to posts 13.11-1427 that engage the facial interface of the device seal. In some examples, the top stiffener 13.11-1421 can be laser welded to the frame 13.11-1410, such as via the metallic anchor 13.11-1425 of the frame 13.11-1410. In some examples, the top stiffener 13.11-1421 can be adhered to the frame 13.11-1421 using any suitable adhesive.

In some examples, the frame 13.11-1410 can include one or more side stiffeners 13.11-1429 that are positioned on along a side region of the frame 13.11-1410. The side stiffeners 13.11-1429 can be curved or angled to match a curvature of the frame 13.11-1410. In some examples, the curve of the side of the frame 13.11-1410 and the side stiffeners 13.11-1429 are designed to match the curvature of a user's brow, temple, and/or cheeks. In some examples, the curvature of the side of the frame 13.11-1410 and the side stiffener 13.11-1429 are designed to allow for a gap between the user's face and the frame 13.11-1410. The side stiffeners 13.11-1429 can aid in maintaining the gap between the frame 13.11-1410 and the user's face. Thus, the side stiffeners 13.11-1429 can provide structural support and added comfort to the frame 13.11-1410.

The side stiffeners 13.11-1429 can include or be made from any suitable stiff or rigid material. In some examples, the side stiffeners 13.11-1429 can experience elastic deformation during use. For example, the side stiffeners 13.11-1429 can include sheet metal, aluminum, steel, carbon fiber, polymer, or any other suitable material capable of stiffening the frame 13.11-1410. The side stiffener 13.11-1429 can be made from the same material or a different material than the top stiffener 13.11-1421.

The side stiffeners 13.11-1429 can be secured to the frame 13.11-1410 using any suitable attachment methods or systems. In some examples, the side stiffeners 13.11-1429 are fastened to the frame 13.11-1410 using fastening screws 13.11-1423. In some examples, the fastening screws 13.11-1423 can attached ends of the side stiffeners 13.11-1429 to a metallic anchor 13.11-1425 of the frame 13.11-1410, which in turn is connected to posts 13.11-1427 that engage the facial interface of the device seal. In some examples, the side stiffeners 13.11-1429 can be laser welded to the frame 13.11-1410, such as the metallic anchor 13.11-1425 of the frame 13.11-1410. In some examples, the side stiffeners 13.11-1429 can be adhered to the frame 13.11-1421 using any suitable adhesive.

FIG. 13.11-14B illustrates a cross-sectional view of the frame 13.11-1410 of a device seal according to one embodiment. As illustrated, the stiffener 13.11-1421 can be positioned within a housing of the frame 13.11-1410. For instance, the frame 13.11-1410 can include an upper portion 13.11-1411 and a lower portion 13.11-1412 that engage to form an internal volume. The upper portion 13.11-1411 and the lower portion 13.11-1412 can be plastic, metal, or any other suitable material for the frame 13.11-1410. The stiffener 13.11-1421 can be positioned directly on the lower portion 13.11-1412 of the frame 13.11-1410 to directly strengthen and stabilize the frame 13.11-1410. In some examples, the stiffener 13.11-1421 is secured in place by adhesive 13.11-1433. The adhesive 13.11-1433 can be located at a number of locations between the stiffener 13.11-1421 and the lower portion 13.11-1412. Adhesive can also be placed between the stiffener 13.11-1421 and the upper cover 13.11-1411. In this way, forces experienced by the lower portion 13.11-1412 and the upper cover 13.11-1411 can be passed through the adhesive 13.11-1433 to be carried by the stiffener 13.11-1421. In some examples, the stiffener 13.11-1421 is secured in place by being sandwiched or pressed between the upper cover 13.11-1411 and the lower portion 13.11-1412 of the frame 13.11-1410.

In some examples, the stiffener 13.11-1421 can include an angled edge. For example, the edge of the stiffener 13.11-1421 closest to the user's face can be angle so as to run substantially perpendicular or flat to the user's face. The angled edge can prevent a hard or sharp edge of the stiffener from being directed toward the user to enhance prolonged user comfort. The angled edge of the stiffener 13.11-1421 can also assist in securing the stiffener 13.11-1421 in place and prevent movement within the internal volume of the frame 13.11-1410.

FIG. 13.11-14C illustrates a bottom view of the frame 13.11-1410 of a device seal according to one exemplary embodiment. The frame 13.11-1410 can include one or more stiffeners along the sides of the frame 13.11-1410. For example, the frame 13.11-1410 can include two stiffeners 13.11-1429 along each side of the frame 13.11-1410. In some examples, the frame 13.11-1410 can include a nose stiffener 13.11-1431 positioned along the nose region 13.11-1415.

The nose stiffener 13.11-1431 can be substantially similar to, including some or all of the features of, the stiffeners described herein, such as top stiffener 13.11-1421 and side stiffeners 13.11-1429. In some examples, there can be multiple nose stiffeners in the nose region 13.11-1415 of the frame 13.11-1410

The nose stiffener 13.11-1431 can be curved or angled to match a curve of the nose region 13.11-1415. In some examples, the curve of the nose region 13.11-1415 and the nose stiffener 13.11-1431 is designed to match the curvature of a user's nose. In some examples, the curvature of the nose region 13.11-1415 and the nose stiffener 13.11-1431 is designed to allow for a gap between the user's nose and the frame 13.11-1410. The nose stiffener 13.11-1431 can aid in maintaining the gap between the frame 13.11-1410 and the user's nose. Thus, the nose stiffener 13.11-1431 can provide structural support to the frame 13.11-1410. The nose stiffener 13.11-1431 can be made from the same or different material than the top stiffener 13.11-1421 or the side stiffeners 13.11-1429. The nose stiffener 13.11-1431 can be attached to the nose portion 13.11-1415 of the frame 13.11-1410 by at least one of the following: laser welding, fastening screws, adhesive, or any other suitable coupling method.

FIG. 13.11-14D illustrates a top view of the frame 13.11-1410 including stiffeners 13.11-1421, 13.11-1429 to improve the structural stability and rigidity of the frame 13.11-1410. In some examples, adhesive 13.11-1433 can be placed on a top surface of the stiffeners 13.11-1421, 13.11-1429 to secure the stiffeners to the top cover of the frame (shown in FIG. 13.11-14B).

In some examples, the frame 13.11-1410 can include a hard stop component 13.11-1435. The hard stop component 13.11-1435 can be an adhesive or any other suitable coupler to fixedly secure the ends of the stiffeners, and the anchor 13.11-1425 in place on the frame 13.11-1410. Thus, when a force is applied to the post 13.11-1427, the hard stop component 13.11-1435 can prevent the anchor 13.11-1425 from moving relative to the frame 13.11-1410 and stiffeners 13.11-1421, 13.11-1429. Thus, the hard stop component 13.11-1435 acts as a deflection limiter. In the case that the hard stop component 13.11-1435 is an adhesive, it can be the same or a different adhesive than the adhesives 13.11-1433 applied on the stiffeners.

As mentioned above, many different types of connectors between a facial interface and a display frame are herein contemplated. The following description for FIGS. 13.11-14-13.11-19 corresponds to an example connector that includes a floating connection between a facial interface and a display frame. As a floating connection, the connector can be attached to one of the display frame or the facial interface, but not both, as will be described in more detail below.

FIG. 13.11-14 illustrates a perspective view of an example connector 13.11-1400 in accordance with one or more examples of the present disclosure. The connector 13.11-1400 can include a floating connection. The connector 13.11-1400 can therefore include a bumper, a compliant stop, or a contact mechanism positioned between a display frame 13.11-1402 and a facial interface 13.11-1404. The display frame 13.11-1402 and the facial interface 13.11-1404 are, respectively, the same as or similar to the display frames and facial interfaces discussed above. However, as shown specifically in FIG. 13.11-14, the connector 13.11-1400 is only attached to the display frame 13.11-1402 (i.e., not also attached to the facial interface 13.11-1404). This constitutes a floating connection where the connector 13.11-1400 can contact or abut the facial interface 13.11-1404, but can also move relative to the facial interface 13.11-1404. For example, the connector 13.11-1400 can translate or rotate along a surface of the facial interface 13.11-1404. In certain examples, rounded edges or smooth surfaces of the connector 13.11-1400 can facilitate such movement or range of motion. As another example, the connector 13.11-1400 can compress against (or have more surface area contact with) the facial interface 13.11-1404, such as when donning the head-mountable device. In yet another example, the connector 13.11-1400 can retract or bias away from the facial interface 13.11-1404. Accordingly, the connector 13.11-1400 can provide desired flexibility and compliance (e.g., for improved comfort when wearing or adjusting the head-mountable device), yet also provide desired rigidity, support, and load-bearing functionality.

Any of the features, components, and/or parts, including the arrangements and configurations thereof shown in FIG. 13.11-14 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.11-14.

FIG. 13.11-15A illustrates a side view of an example connector positioned between a display frame and a facial interface in accordance with one or more examples of the present disclosure. As shown, the connector 13.11-1400 can include one or more posts. In particular implementations, the connector 13.11-1400 includes a post 13.11-1502*a*. In other implementations, the connector 13.11-1400 includes a post 13.11-1502*b*.

In these or other examples, a post can include an element with rigid and/or pliant portions. In some examples, a post can include a soft outer portion and a rigid inner portion (e.g., a sheath or sheet metal overmolded by a softer, cushioning material). A post can include a contact mechanism for contacting the facial interface 13.11-1404. Additionally or alternatively, a post can include an arm, a bumper, a mechanical stop, a damper, a shock absorber, a spring, an actuator, a crumple element, a mechanical fuse, a breakaway element, etc. In at least some examples, a post can include surfaces, joints, etc. that include a radius (or curvature) allowing movement, deflection, and/or energy absorption.

As shown in FIG. 13.11-15A, the post 13.11-1502*a* is longer than the post 13.11-1502*b*. It will be appreciated that the length of the posts 13.11-1502*a*, 13.11-1502*b* can determine the gap or distance between the connector 13.11-1400 and the facial interface 13.11-1404. For example, the post 13.11-1502*a* is positioned a distance 13.11-1506 from a contact surface 13.11-1508 of the facial interface 13.11-1404. Similarly, the post 13.11-1502*b* is positioned a distance 13.11-1504 from the contact surface 13.11-1508 of the facial interface 13.11-1404.

In addition to length of the posts 13.11-1502*a*, 13.11-1502*b*, an angle of the posts 13.11-1502*a*, 13.11-1502*b* relative to the display frame 13.11-1402 can also affect the distances 13.11-1504, 13.11-1506 to the facial interface 13.11-1404. The post 13.11-1502*a* is positioned at an angle 13.11-1510 relative to the display frame 13.11-1402. The post 13.11-1502*b* is positioned at an angle 13.11-1512 relative to the display frame 13.11-1402. These angles may be preset, adjusted, or actuated. In particular examples, the angles 13.11-1510, 13.11-1512 can be dynamically modified (e.g., decreased) in response to the post contacting the contact surface 13.11-1508 and flexing upward. The angles 13.11-1510, 13.11-1512 can also correspond to the angle of incidence or angle of contact with the contact surface 13.11-1508. Likewise, the angles 13.11-1510, 13.11-1512 can affect the point of contact with the contact surface 13.11-1508. The point of contact and angle of incidence (as well as the distances 13.11-1504, 13.11-1506) can include tunable factors for tuning comfort, fit, adjustability, load responsiveness, etc. as may be desired.

Any of the features, components, and/or parts, including the arrangements and configurations thereof shown in FIG. 13.11-15A can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.11-15A.

With respect to the facial interface 13.11-1404, it will be appreciated that the facial interface 13.11-1404 can include many different variations. In some examples, the facial interface 13.11-1404 can include thicker regions and/or thinner regions at certain locations along the facial interface 13.11-1404, can be fixed or removable, and can be removably attached by any number of systems such as hook and loop, magnets, fasteners, and the like. In accordance with one or more such examples, FIG. 13.11-15B illustrates a cross-sectional view of a facial interface 15-1502. FIG. 15C illustrates a cross-sectional view of a forehead region 13.11-15-1503 of the facial interface 13.11-15-1502, while FIG. 15D illustrates a cross-sectional view of a cheek region 13.11-15-1505 of the facial interface 13.11-15-1502. The facial interface 13.11-15-1502 can be substantially similar to, including some or all of the features of, the facial interfaces described herein.

In some examples, the facial interface 13.11-15-1502 includes a compressible portion that can include a central region 13.11-15-1509 and an extended region 13.11-15-1507. In some examples, the central region 13.15-1509 and the extended region 13.11-15-1507 can be a single unitary component (e.g., a foam piece). In some examples, the central region 13.11-15-1509 can be a separate and distinct material from the extended region 13.11-15-1507 (e.g., two different types of foam pieces). The central region 13.11-15-1509 can be shaped, sized, and positioned to correspond to the base of the frame. In other words, the central region 13.11-15-1509 can reside directly adjacent the base plastic. In contrast, the extended region 13.11-15-1507 can extend beyond a footprint of the base, such that the extended region 13.11-15-1507 overhangs the base.

In some examples, the extended region 13.11-15-1507 can run along an entirety of the facial interface 13.11-15-1502. The compressible portion (or combination of the extended region 13.11-15-1507 and the central region 13.11-15-1509) can have a varying cross-section or be asymmetric relative to the base. For example, the extended region 13.11-15-1507 can taper as it travels from the forehead region 13.11-15-1503 to the cheek region 13.11-15-1505. In other words, the extended region 13.11-15-1507 can decrease in size as it approaches the cheek region 13.11-15-1505, so that it is wider at the forehead, and less wide at the cheeks. For example, at the forehead region 13.11-15-1503 shown in FIG. 13.11-15C, the extended region 13.11-15-1507 can overhang a base by approximately equal to or greater than 3.4 mm. In contrast, at the cheek region 13.11-15-1505 shown in FIG. 13.11-15C, the extended region 13.11-15-1507 can overhang a base by approximately equal to or less than 3.4 mm. Accordingly, the extended region 13.11-15-1507 can extend beyond or overhang the central region 13.11-15-1509 and the base plastic both above and below, as oriented in the figures. The varying asymmetric cross-section of the extended region 13.11-15-1507 can be intentionally varied to correspond to user facial features, thereby increasing comfort and fit of the head-mountable device.

Any of the features, components, and/or parts, including the arrangements and configurations thereof shown in FIGS. 13.11-15B-13.11-15D can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-15B-13.11-15D.

As mentioned above, a connector of the present disclosure can include multiple portions with differing material properties. In accordance with one or more such examples, FIG. 13.11-16 illustrates a cross-sectional view of the connector 13.11-1400 including a connector frame 13.11-1600 for a post 13.11-1602. The cross-sectional view of FIG. 13.11-16 is taken along the cross-sectional slice indicated in FIG. 13.11-15A.

As shown in FIG. 13.11-16, the connector frame 13.11-1600 can include a rigid or semi-rigid core extending at least partially through the post 13.11-1602. The connector frame 13.11-1600 can provide a desired stiffness or shape to the post 13.11-1602. For example, as shown in FIG. 13.11-16, the connector frame 13.11-1600 includes a bend adjoining a portion attached to the display frame 1402 and the post 13.11-1602 extending away from the display frame 13.11-1402. In certain examples, the post 13.11-1602 is overmolded onto, adhered to, or fastened to the connector frame 13.11-1600. In other examples, the post 13.11-1602 is formed integral with the connector frame 13.11-1600. In at least one example, the connector frame 13.11-1600 includes sheet metal and the surrounding portion of the post 13.11-1602 can include an elastomer material, a rubber, a silicone, a composite, a plastic, or any combination thereof.

As will be shown more below in relation to FIG. 13.11-17, the connector frame 13.11-1600 can include one or more elements for attaching the connector 13.11-1400 to the display frame 13.11-1402.

Any of the features, components, and/or parts, including the arrangements and configurations thereof shown in FIG. 13.11-16 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.11-16.

FIG. 13.11-17 illustrates a top view of an example connector in accordance with one or more examples of the present disclosure. As shown, the connector 13.11-1400 can include the connector frame 13.11-1600 discussed above. In particular, the connector frame 1600 can include one or more through holes 13.11-1700. Via the through-holes 13.11-1700, the connector frame 13.11-1600 can be fastened to the display frame 13.11-1402 (having corresponding holes that are align-able with the connector frame 13.11-1600). In this way, the connector frame 13.11-1600 can be secured to the display frame 13.11-1402.

In some examples, the connector 13.11-1400 can be attached to a stiffener 13.11-1604. The stiffener 13.11-1604 can provide certain material property advantages to the connector 13.11-1400. For example, the stiffener 13.11-1604 can be used to tune the spring force, biasing strength, flexibility, etc. of the connector frame 13.11-1600. Additionally or alternatively, the spring force, biasing strength, flexibility, etc. for the connector 13.11-1400 as a whole can be tuned via pre-biasing the connector frame 13.11-1600 according to a predetermined force-displacement curve. In other examples, the spring force, biasing strength, flexibility, etc. for the connector 13.11-1400 can be tuned via an overmolded material for the post 13.11-1602 or by adding a spring member, a torsion bar, or an actuator to the connector 13.11-1400.

Additionally or alternatively, the stiffener 13.11-1604 can provide a datum surface (e.g., a flat mating surface) for the connector frame 1600. In certain examples, the fixture biasing can be implemented to properly position, orient, and/or attach the connector frame 13.11-1600 to the stiffener 13.11-1604. Additionally or alternatively to the stiffener being used as a datum, an adhesive can be used to flow into a desired position and solidify into a datum-like element relative to the connector frame 13.11-1600.

Additionally, in particular examples, the connector frame 13.11-1600 (and the connector 13.11-1400 as a whole) can be removed from the display frame 13.11-1402. For example, fasteners (not shown) can be removed from the through-holes 13.11-1700 to allow removal of the connector 13.11-1400 from the display frame 13.11-1402. In some examples, the fasteners and the through-holes 13.11-1700 can be user-accessible and/or manufacturer-accessible for swapping out the connector 13.11-1400 for a connector with a different size post and/or a post with a different angle relative to the display frame (e.g., a shorter or longer post as shown in FIG. 13.11-15A). Accordingly, in some examples, the connector 13.11-1400 is modular.

Any of the features, components, and/or parts, including the arrangements and configurations thereof shown in FIG. 13.11-17 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.11-17. For example, a connector 13.11-1606 shown in the background of FIG. 13.11-16 can include one or more other connectors described above in the present disclosure.

It will be appreciated that one or more connectors of the present disclosure can be modified to exhibit certain material properties (e.g., increased strength, resilience, flexibility, etc.). In accordance with one or more such examples, FIG. 13.11-18 illustrates a side perspective view of a base of a connector where it is attached to a display frame. In particular, FIG. 13.11-18 illustrates a gusset 13.11-1800 formed on the surface of the connector frame 13.11-1600. The gusset 13.11-1800 can include a feature on the connector 13.11-1400 that helps to reinforce the connector attachment to the display frame 13.11-1402 (e.g., via the stiffener 13.11-1604). In some examples, the gusset 13.11-1800 includes a plate adhered, bonded, welded, or molded onto the connector frame 13.11-1600. In certain examples, the gusset 1800 includes a reinforced joint. In at least one example, the gusset 13.11-1800 is shaped to distribute loads from concentrating around fasteners 13.11-1802 on the connector frame 13.11-1600.

Any of the features, components, and/or parts, including the arrangements and configurations thereof shown in FIG. 13.11-18 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.11-18.

FIG. 13.11-19 illustrates another cross-sectional view of the connector 13.11-1400 in accordance with one or more examples of the present disclosure. As shown in FIG. 13.11-19, the connector frame 13.11-1600 can be discontinuous at certain areas of the connector frame 1600. For example, the connector frame 13.11-1600 can include one or more reliefs 13.11-1900 (e.g., cutouts for added flexibility, decreased weight, or less material consumption). In these or other examples, the post 13.11-1602 can include corresponding portions positioned inside the relief 13.11-1900 that are solid plastic, elastomer, or other material.

Any of the features, components, and/or parts, including the arrangements and configurations thereof shown in FIG. 13.11-19 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.11-19. The following description discusses example adhesives in a head-mountable device. Indeed, a head-mountable device of the present disclosure can include a variety of different adhesives that perform various functions and/or impart certain properties.

In particular, FIGS. 13.11-20-13.11-21 respectively show perspective and top views of example adhesives in an example head-mountable device. The term adhesives can refer to one or more types of glue, epoxy adhesives, polyurethane adhesives, polyimide adhesives, paste adhesives, liquid adhesives, film adhesives, pellet adhesives, strip adhesives, hot melt, thermosetting adhesives, pressure sensitive adhesives, contact adhesives, structural adhesives, non-structural adhesives, semi-structure adhesives, tape, bonds, welds, etc.

Specifically, as shown, the display frame 13.11-1402 is depicted with a cover or housing portion removed for illustration purposes (e.g., to expose various adhesives that can be included within the display frame 13.11-1402). In some examples, the display frame 13.11-1402 includes a connector 13.11-2000, as described above. In at least certain implementations, the connector 13.11-2000 can include a different material than the stiffener 13.11-1604. For instance, in one example, the connector 13.11-2000 can include a 13.11-316 stainless steel, and the stiffener 13.11-1604 can include a 17-4 steel. In such an example, laser welding the dissimilar materials can cause oxidation, such as oxidation of the chromium in the 13.11-316 stainless steel. In specific examples, adhesives 13.11-2002 can help prevent (or at least reduce an amount of) oxidation on one or both of the connector 2000 or the stiffener 13.11-1604. Thus, the adhesives 13.11-2002 can be positioned on the surface of the stiffener 13.11-1604 at an end portion adjacent to the connector 13.11-2000. In at least one example, the adhesives 13.11-2002 are positioned at least partially around fasteners attaching the stiffener 13.11-1604 to the display frame 13.11-1402. In these or other examples, the adhesives 13.11-2002 can interact with the surface of the stiffener 13.11-1604 and/or the connector 13.11-2000 (e.g., when under thermal loads from laser welding applications) to inhibit oxidation. Other cosmetic advantages can also be imparted by the adhesives 13.11-2002, as desired.

The display frame 13.11-1402 can also include adhesives 13.11-2004. The adhesives 13.11-2004 are strips of adhesive, which can be positioned longitudinally along a top surface of the stiffener 13.11-1604. In particular, the adhesives 13.11-2004 can couple the outer portion or shell (removed for interior illustration purposes) of the display frame to the stiffener 13.11-1604. This coupling can impart increased stiffness to the display frame 13.11-1402 as a whole (and in particular, impart more stiffness to the less rigid or stiff outer shell)—by leveraging stiffness of the stiffener 13.11-1604.

In addition, the display frame 13.11-1402 can include adhesives 13.11-2006. The adhesives 13.11-2006 can include adhesives positioned underneath the stiffener 13.11-1604. The adhesives 13.11-2006 can specifically adhere the stiffener 13.11-1604 to the bottom housing or shell of the display frame 13.11-1402.

In some examples, the display frame 13.11-1402 can include adhesives 13.11-2008. The adhesives 13.11-2008 can include a discontinuous glue strip between top and bottom shells of the display frame 13.11-1402. In at least one example, the gaps between the adhesives 13.11-2008 can impart thermal advantages. For instance, the adhesives 13.11-2008 can reduce or eliminate deformation in the display frame 13.11-1402 caused by the different coefficients of thermal expansion in response to higher heat and/or humid environments.

In one or more examples, the display frame 13.11-1402 can include an adhesive 13.11-2010. The adhesive 13.11-2010 can include a gap filler or hardstop glue to limit travel of the connector 13.11-2000. For example, the adhesive 13.11-2010 can bound the travel of the connector 2000 towards the optical system such that the adhesive 13.11-2010 serves as a mechanical stop. In these or other examples, the adhesive 13.11-2010 can include an adhesive with higher compressive stiffness compared to other adhesives. For example, the adhesive 13.11-2010 can be load bearing (e.g., to at least partially transfer an applied load to the connector 13.11-2000).

Additionally or alternatively to the foregoing adhesives, it will be appreciated that other examples are also contemplated. For instance, in some implementations, the display frame 13.11-1402 can include near net molding (which can obviate one or more adhesives discussed above).

Any of the features, components, and/or parts, including the arrangements and configurations thereof shown in FIGS. 13.11-20-13.11-21 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.11-20-13.11-21. The following description discusses example adhesives in a head-mountable device. Indeed, a head-mountable device of the present disclosure can include a variety of different adhesives that perform various functions and/or impart certain properties.

It will be noted that in addition to forming the frame in the manner described herein, it is also contemplated to form the frame and its structural components using machined configurations, carbon fiber configurations, 3D modeled configurations, fixed molded configurations, etc.

13.12: Face Engaging Structure

The following disclosure relates to connectors of a head-mountable device used for AR/VR experiences. More particularly, the present embodiments relate to connectors positioned at a maxilla region (and nearby zygoma regions) of a face when the head-mountable device is donned. These connectors can dynamically adjust to different heads, as well as dynamically adjust in real time in response to force events. The connectors can also include a variety of different types of connections, as will be described below.

In one example, a head-mountable device includes a connector between a display and a facial interface. In certain implementations, the connector between the display and the facial interface has a stop (e.g., a hard stop). The connector allows for free movement (or multiple degrees of freedom) of the facial interface while still grossly constraining the facial interface. Because the facial interface can freely react to the user's face, pressure can be more evenly distributed to the user's face. The improved load distribution across a user's face can create a pleasant and enjoyable AR/VR experience for the user.

Conventional head-mountable devices do not include connections with a stop. By contrast, the head-mountable device of the present disclosure includes connections with a stop. A stop can stabilize (and in some cases protect from undue force distribution to) the HMD and internal components. A stop can also improve HMD robustness by preventing damage to sensitive components and efficiently transferring a force load through the stop (e.g., to a force-dissipation member, force-spreader member, or predetermined facial feature), thereby improving user comfort.

In one example, a head-mountable device of the present disclosure includes a display and a facial interface with a connector positioned at the maxilla facial region. The connector can include two degrees of freedom and can be a pin-and-bowl connection.

In another example, the connector can include a foam stop adhered to the facial interface. In certain implementations, the foam stop is also coupled to the display. For instance, the foam stop can be preloaded to remain positioned in a "home" (e.g., non-deflected or deflected) state until the head-mountable device is donned.

In yet another example, the connector can include a slidable post. The slidable post can slide relative to the facial interface or the display, as desired.

Accordingly, the apparatuses and systems described herein can provide facial feature adjustments and connections that can increase user customization, reduce facial pressure, and improve distribution of force loads for a head-mountable device, thereby increasing comfort.

These and other embodiments are discussed below with reference to FIGS. 13.12-1-13.12-8B. However, those skilled in the art will readily appreciate that the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 13.12-1 illustrates a top view profile of a head-mountable device 13.12-100 worn on a user head 13.12-101. The head-mountable device 13.12-100 can include a display 13.12-102 (e.g., one or more optical lenses or display screens in front of the eyes of the user). The display 13.12-102 can include a display for presenting augmented reality visualizations, a virtual reality visualization, or other suitable visualizations.

The head-mountable device 13.12-100 also includes a facial interface 13.12-104. As used herein, the term "facial interface" refers to a portion of the head-mountable device 13.12-100 that engages with a user face via direct contact. In particular, a facial engagement portion includes portions of the head-mountable device 13.12-100 that conform to (e.g., press against) regions of a user face. To illustrate a facial interface can include a pliant (or semi-plaint) face track that spans the forehead, wraps around the eyes, contacts the zygoma and maxilla regions of the face, and bridges the nose. In addition, a facial interface can include various components forming a structure, webbing, cover, fabric, or frame of a head-mountable device disposed between the display 13.12-102 and the user skin. In particular implementations, a facial interface can include a seal (e.g., a light seal, environment seal, dust seal, air seal, etc.). It will be appreciated that the term "seal" can include partial seals or inhibitors, in addition to complete seals (e.g., a partial light seal where some ambient light is blocked and a complete light seal where all ambient light is blocked when the head-mountable device is donned).

The head-mountable device 13.12-100 further includes connector(s) 13.12-103. As used herein, the term "connector" refers to a connection or touch point between the display 13.12-102 and the facial interface 13.12-104. For instance, a connector can movably constrain the facial interface 13.12-104 to the display 13.12-102. In certain implementations, a connector includes a joint that physically connects the display 13.12-102 and the facial interface 13.12-104. In these or other implementations, a connector includes a floating joint or mechanical stop where the facial interface 13.12-104 and the display 13.12-102 can contact each other (e.g., at rest, after certain amounts of deflection, etc.).

To illustrate, the connector(s) 13.12-103 can allow the facial interface 13.12-104 to translate (e.g., left-right, up-down,) in one plane. Additionally or alternatively, the connector(s) 13.12-103 can allow the facial interface 13.12-104 to translate (e.g., depth-wise) in another plane relative to the display 13.12-102. For example, the connector(s) 13.12-103 allow the facial interface 13.12-104 to move between a first state (e.g., a home state when the head-mountable device 13.12-100 is not donned by a user) to a second state (e.g., when the head-mountable device 13.12-100 is donned by a user). The connector(s) 13.12-103 help enable the facial interface 13.12-104 to flexibly accommodate the facial profile of the user by deflecting according to the user's facial features. When the head-mountable device 13.12-100 is removed from the user's head 13.12-101, the connector(s)

13.12-103 can return to the first state-thereby causing the facial interface 13.12-104 to correspondingly move.

The connector(s) 13.12-103 can include one or more components (e.g., pins, bowls, slidable posts, foam, mechanical stops, dampeners, spring connections, etc.) that can allow (or actively provide) translation in one or more planes (e.g., at a maxilla region of a face). The connector(s) 13.12-103 can include proud engagement portions (e.g., pin, slidable post) and recessed engagement portions (e.g., receptacle, cup, slidable post-track). The proud engagement portions and recessed engagement portions can mate, forming a floating connection (e.g., a receptacle, touch point, mechanical stop, etc. constraining a post from moving in certain directions or beyond certain distances or depths).

Additionally, as shown in FIG. 13.12-1, the head-mountable device 13.12-100 can include one or more arms 13.12-108, 13.12-110. The arm 13.12-108, 13.12-110 are connected to the display 13.12-102 and extend distally toward the rear of the head. The arms 13.12-108, 13.12-110 are configured to secure the display 13.12-102 in a position relative to the user head 13.12-101 (e.g., such that the display is maintained in front of a user's eyes). For example, the arms 13.12-108, 13.12-110 extend over the user's ears 13.12-106. In certain examples, the arms 13.12-108, 13.12-110 rest on the user's ears 13.12-106 to secure the head-mountable device 13.12-100 via friction between the arms 13.12-108, 13.12-110 and the user head 13.12-101. Optionally, the arms 13.12-108, 13.12-110 can be connected to each other via a strap 13.12-112 (shown in the dashed lines) that can compress the head-mountable device 13.12-100 against the user head 13.12-101.

Any of the features, components, and/or parts, including the arrangements and configurations thereof shown in FIG. 13.12-1 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.12-1.

FIGS. 13.12-2A-13.12-2B illustrate side and front view profiles, respectively, of an example of the head-mountable device 13.12-100. As discussed above, the head-mountable device 13.12-100 includes the display 13.12-102, the facial interface 13.12-104, and the connector(s) 13.12-103. In particular, as shown in FIGS. 13.12-2A-13.12-2B, the facial interface 13.12-104 can indeed wrap around the eyes 13.12-206, bridge the nose 13.12-208, span a forehead region 13.12-203, contact a zygoma facial region 13.12-202, and contact a maxilla facial region 13.12-204.

In addition, the connector(s) 13.12-103 can be positioned along the maxilla facial region 13.12-204 and connect directly (e.g., having a direct connection) or indirectly (e.g., having a floating connection) to the facial interface 13.12-104 and the display 13.12-102. The connector(s) 13.12-103 can similarly be positioned along the zygoma facial region 13.12-202 and/or the forehead region 13.12-203. In at least some examples, the connector(s) 13.12-103 are spatially configured to provide a particular force profile when donned and/or during a force event applying a force load to the display 13.12-102.

Further below, this disclosure describes with more particularity how the connector(s) 13.12-103 can be constructed. For example, the connector(s) 13.12-103 can include pivot connectors, floating connectors, foam connectors, stop connectors, or other connection types (e.g., sliding connectors, rigid connectors), including combinations thereof (such as a hybrid elastomer and mechanical slider).

Any of the features, components, and/or parts, including the arrangements and configurations thereof shown in FIGS. 13.12-2A-13.12-2B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.12-2A-13.12-2B.

The connector(s) 13.12-103 can provide a stable and flexible interface between the facial interface 13.12-104 and the display 13.12-102. Additionally or alternatively, the connector(s) 13.12-103 include an amount of travel (e.g., an amount of possible displacement). The connector(s) 13.12-103 can also provide a datum or a hard stop limiting the travel to a particular separation distance (e.g., a maximum displacement) of the display 13.12-102 relative to the facial interface 13.12-104. These connector(s) 13.12-103 can also increase movement of the facial interface 13.12-104 in the maxilla facial region 13.12-204 in such a way that the facial interface 13.12-104 freely interacts (e.g., conforms) with the user's face without applying excessive pressure back on to the user's face.

In accordance with one or more such examples of the present disclosure, FIG. 13.12-3 illustrates an example of the head-mountable device 13.12-100 including the display 13.12-102, the facial interface 13.12-104, and the connector(s) 13.12-103 (namely, connectors 13.12-303*a*-13.12-303*f*). The connector(s) 13.12-103 (albeit positionable in different places) can specifically be positioned at the maxilla facial region 13.12-204 to distribute pressure exerted on a user's face. For example, elastic forces exerted by the strap 13.12-112 (not shown) when donning the head-mountable device 13.12-100 can be distributed from the display 13.12-102 to the facial interface 13.12-104 in a comfortable manner via the connectors 13.12-303*a*-13.12-303*f*. In particular, the connectors 13.12-103*a*-13.12-103*b* positioned at the maxilla facial region 13.12-204 can conform (e.g., flex, pivot, rotate, etc.) to a user's face evenly distributing the weight of the head-mountable device 13.12-100 across the maxilla facial region 13.12-204, thereby helping to provide increased comfort to a user.

As shown in FIG. 13.12-3, the connectors 13.12-303*a*-13.12-303*b* at the maxilla facial region 13.12-204 include a pivot connection. A pivot connection can include one or more different connections that allow pivot action relative to an anchored portion. Thus, a pivot connection can include a ball-and-socket joint, hinged joint, condyloid joint, atlanto-axial joint, radioulnar joint, serial manipulators, etc.

In certain implementations, the anchored portion of the pivot connection for the connectors 13.12-303*a*-13.12-303*b* is positioned on the display 13.12-102. Thus, the facial interface 13.12-104 can move or pivot relative to the display 13.12-102 (e.g., for a comfortable, conforming fit to the user face). In other implementations, however, the anchored portion of the pivot connection for the connectors 13.12-303*a*-13.12-303*b* is positioned on the facial interface 13.12-104.

The pivot connection for the connectors 13.12-303*a*-13.12-303*b* can include travel defined by the amount of possible deflection or linear distance movement. In some cases, the pivot connection includes a range of travel between about 2 mm to about 20 mm. In particular implementations, the pivot connection includes about 6 mm of travel. It will be appreciated that the pivot connection also includes a stop (e.g., a portion of the socket joint) bounding the travel.

In at least some examples, the head-mountable device 13.12-100 implements additional connectors to change a pressure profile to reduce or avoid "hot-spot loading" lending to acute pressure against a user's face. For example, the head-mountable device 13.12-100 includes the connectors **13.12-303*e*-13.12-303*f* positioned at the zygoma facial region 13.12-202 to at least partially offload an applied force distributed through the connectors 13.12-303*a*-13.12-303*b* at the maxilla facial region 13.12-204. In certain implementations, the connectors 13.12-303*e*-13.12-303*f* include the same type of connection as the connectors 13.12-303*a*-13.12-303*b*. In other implementations, the connectors 13.12-303*e*-13.12-303*f* include a different type of connection than the connectors 13.12-303*a*-13.12-303*b*. For instance, the connectors 13.12-303*e*-13.12-303*f* can include a floating foam joint or a leaf spring joint, and the connectors 13.12-303*a*-13.12-303*b*** can include a pivot connection.

Any of the features, components, and/or parts, including the arrangements and configurations thereof shown in FIG. 13.12-3 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.12-3.

As mentioned above, the head-mountable device of the present disclosure can implement a pin-and-bowl connection between the display 13.12-102 and the facial interface 13.12-104. In accordance with one or more such examples, FIG. 13.12-4A illustrates an example of the head-mountable device 13.12-100 including the display 13.12-102, the facial interface 13.12-104, and the connector(s) 13.12-103 (namely connectors 13.12-402). FIGS. 13.12-4B-13.12-4C show a front profile view and side profile view, respectively, of the connectors 13.12-402 located at the maxilla facial region 13.12-204.

As shown, the connectors 13.12-402 include a pin-and-bowl connection. In particular, the connectors 13.12-402 include a bowl 13.12-404 and a pin 13.12-405. The bowl 13.12-404 includes a receptacle defined within the display 13.12-102 that is configured to receive the pin 13.12-405 affixed to the facial interface 13.12-104. In particular implementations, the bowl 13.12-404 is sized and shaped to receive a particular portion of the pin 13.12-405 (e.g., an entirety of the pin 13.12-405, an end portion of the pin 13.12-405, or a predetermined depth of the pin 13.12-405).

In these or other examples, the bowl 13.12-404 includes a stop 13.12-410 (e.g., an axial dead stop) coupled to the display 13.12-102. The stop 13.12-410 can control the penetration depth of the pin 13.12-405 into the bowl 13.12-404. Specifically, the stop 13.12-410 allows a maximum displacement or penetration of the pin 13.12-405 in an axial direction 13.12-412. When the pin 13.12-405 abuts the stop 13.12-410, the pin 13.12-405 is stopped out and cannot proceed further in the axial direction 13.12-412—at which point the facial interface 13.12-104 and the display 13.12-102 are positioned at a predetermined distance from each other (e.g., a minimum separation distance).

The stop 13.12-410 can also control other movement of the pin 13.12-405 within the bowl 13.12-404. In particular, the stop 13.12-410 can limit or define translational movement of the pin 13.12-405 in directions perpendicular to the axial direction 13.12-412.

In particular implementations, the connectors 13.12-402 include two degrees of freedom. As illustrated in FIG. 13.12-4B, a first degree of freedom includes a translational degree of freedom in a first plane (e.g., defined by a first axis 13.12-406 and a second axis 13.12-408). A second degree of freedom includes depth-based motion in the axial direction 13.12-412, as illustrated in FIG. 13.12-4C. The combination of the first degree of freedom and the second degree of freedom allow the facial interface 13.12-104 to conform to a user's face while also providing rigidity and stability where appropriate.

According to some examples, the connectors 13.12-402 can move along the first degree of freedom (i.e., along the first axis 13.12-406) when the pin 13.12-405 is positioned at a variety of different depths along the axial direction 13.12-412. For example, the connectors 13.12-402 can move along the first axis 13.12-406 even when the pin 13.12-405 is fully depressed (i.e., when the pin 13.12-405 is stopped out). In this manner, the connectors 13.12-402 can move in response to various forces, such as at least one of an applied load or a shear force. Nonetheless, such movement of the connectors 13.12-402 can be bounded by virtue of the pin 13.12-405 being retained within the bowl 13.12-404.

The pin 13.12-405 can include a variety of components and/or materials. In one example, the pin 13.12-405 includes a contact portion 13.12-418. The contact portion 13.12-418 can be firm and rigid. In other examples, the contact portion 13.12-418 is soft or compressive. In some examples, the contact portion 13.12-418 includes a material such as a foam, an elastomer, a gel, a silicon, a metal, or a thermoplastic.

The pin 13.12-405 can also include a variety of different shapes and sizes. In some examples, the pin 13.12-405 is cone-shaped. In some instances, a cone shape can allow more freedom of motion at greater distances of separation between the display 13.12-102 and the facial interface 13.12-104. That is, as the pin 13.12-405 compresses further into the bowl 13.12-404, the cone-shape of the pin 13.12-405 fills more and more volume of the bowl 13.12-404, leaving little or no motion for the pin 13.12-405. Other shapes, however, are herein contemplated. For instance, the pin 13.12-405 can be shaped to resemble a square, rectangle, cylinder, oval, triangle, or other suitable shape.

Further, the connectors 13.12-402 can include one or more mechanisms for retaining the pin 13.12-405 within the bowl 13.12-404 (not shown). For example, a tip of the pin 13.12-405 can be sized greater than the opening of the bowl 13.12-404. According to another example, the pin 13.12-405 and/or the bowl 13.12-404 can be sized and shaped such that the pin 13.12-405 cannot escape the bowl 13.12-404. For example, the pin 13.12-405 and/or the bowl 13.12-404 can be sized greater than the amount of pin displacement between positional states. In yet another example, the bowl 13.12-404 can include a socket-like structure that retains the pin 13.12-405.

Any of the features, components, and/or parts, including the arrangements and configurations thereof shown in FIGS. 13.12-4A-13.12-4C can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.12-4A-13.12-4C.

In one example, the connectors of the present disclosure are preloaded (e.g., via springs, elastic materials, etc.) to return to a certain position or state after being moved. In accordance with one or more such examples, FIGS. 13.12-5A-13.12-5B respectively illustrate states (or positions) of the connectors 13.12-402 described above. In particular, FIG. 13.12-5A illustrates a first state 13.12-500 of the connectors 13.12-402 where the pin 13.12-405 is stopped out (i.e., bottomed out) within the bowl 13.12-404. When in the first state 13.12-500, the display 13.12-102 and the facial interface 13.12-104 are positioned at a predetermined separation distance (e.g., a minimum separation distance). In the first state 13.12-500, further travel of the pin 13.12-405 into the bowl 13.12-404 is disallowed.

In some examples, the first state 13.12-500 includes a home state. The home state refers to a position that the connectors 13.12-402 rebound to after being deflected. In particular, the home state is the unperturbed position of the connectors 13.12-402.

In other examples, however, the first state 13.12-500 includes a deflected state. The deflected state refers to a position that the connectors 13.12-402 can achieve in response to deflection (e.g., when donning the head-mountable device or during a force event.

FIG. 13.12-5B illustrates a second state 13.12-502 of the connectors 13.12-402 where the pin 13.12-405 is only partially disposed within the bowl 13.12-404. In certain cases, the pin 13.12-405 is complete withdrawn from the bowl 13.12-404. When in the second state 13.12-502, the display 13.12-102 and the facial interface 13.12-104 are movable relative to each other (either closer to or farther away). In the second state 13.12-502, further travel of the pin 13.12-405 into the bowl 13.12-404 is allowed.

Similar to the first state 13.12-500, the second state 13.12-502 can include a home state. In other implementations, the second state 13.12-502 includes a deflected state.

In at least some examples, fabric 13.12-504 shown in FIGS. 13.12-5A-13.12-5B can be stretched or tensioned to accommodate the first state 13.12-500 and the second state 13.12-502 just described. The fabric 13.12-504 can include an adjustable external shell that flexes with movement of the display 13.12-102 and the facial interface 13.12-104. Thus, as the connectors 13.12-402 move to and from the first state 13.12-500 and the second state 13.12-502, the fabric 13.12-504 can correspondingly adjust (e.g., stretch, tighten, loosen, wrinkle, fold, etc.).

According to some examples, the fabric 13.12-504 shown in FIGS. 13.12-5A-13.12-5B can be implemented to bias the connectors of the present disclosure. For example, the fabric 13.12-504 can be stretched or tensioned to bias the connectors 13.12-402 in a particular home state or a deflected state. In at least some examples, the induced bias of the connectors 13.12-402 (provided by the tension from the fabric 13.12-504) can facilitate a broad range of connector architectures, ranges of motion, etc.

Any of the features, components, and/or parts, including the arrangements and configurations thereof shown in FIGS. 13.12-5A-13.12-5B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.12-5A-13.12-5B.

As mentioned above, the connectors of the present disclosure can include a variety of different connectors, including foam connectors positioned at a maxilla facial region. In accordance with one or more such examples, FIG. 13.12-6A illustrates another example of the head-mountable device 13.12-100 including the display 13.12-102 and the facial interface 13.12-104, and the connector(s) 13.12-103 (namely connectors 13.12-602).

In these or other examples, the connectors 13.12-602 include foam connectors. Specifically, the connectors 13.12-602 include a foam portion 13.12-604 affixed to the facial interface 13.12-104 and a base 13.12-606 affixed to the display 13.12-102. The base 13.12-606 is sized and shaped to receive the foam portion 13.12-604. In particular implementations, the foam portion 13.12-604 is permanently adhered to the base 13.12-606 via an attachment 13.12-608. The attachment 13.12-608 can include glue, bond, or other type of adhesion. Additionally or alternatively, the attachment 13.12-608 includes a fastener, such as a bolt, screw, etc.

In at least one example, the connectors 13.12-602 include a compressible portion 13.12-610, as illustrated in 13.12-6B. The compressible portion 13.12-610 can also include a foam or other compressible material. In certain implementations, the compressible portion 13.12-610 may include a predefined thickness (e.g., about 2 mm, about 3 mm, about 10 mm, etc.) that dictates a corresponding amount of displacement or compression.

Any of the features, components, and/or parts, including the arrangements and configurations thereof shown in FIGS. 13.12-6A-13.12-6B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.12-6A-13.12-6B.

As similarly described above, the connectors of the present disclosure can move between states or positions. Foam connections can likewise move between states or positions. In accordance with one or more such examples, FIGS. 13.12-7A-13.12-7B illustrate positional states of the connectors 13.12-602.

A first state 13.12-700 of the connector 13.12-602 is shown in FIG. 13.12-7A. In the first state 13.12-700, the compressible portion 13.12-610 is uncompressed and has a first thickness. The second state 13.12-702 of the connector 13.12-602 is shown in FIG. 13.12-7B. Specifically, in the second state 13.12-702, the compressible portion 13.12-610 is compressed (e.g., reduced in thickness from the first thickness) and has a second thickness less than the first thickness. The compressible portion 13.12-610 in the second state 13.12-702 need not fully compress. Indeed, the compressible portion 13.12-610 can compress partially or fully, as may be the case (e.g., when donning the head-mountable device or during a force event).

It will be appreciated that the first state 13.12-700 and the second state 13.12-702 can be, respectively, home states and deflected states. However, in certain implementations, the first state 13.12-700 and the second state 13.12-702 can oppositely configured (i.e., deflected states and home states, respectively).

In at least some examples, the fabric 13.12-504 described above can correspondingly move and flex to accommodate the first state 13.12-700 and the second state 13.12-702 for the connectors 13.12-602. Alternatively, the fabric 13.12-504 can be attached to non-deflecting portions (e.g., exclusive of the compressible portion 13.12-610) such that the fabric 13.12-504 need not flex or move.

Any of the features, components, and/or parts, including the arrangements and configurations thereof shown in FIGS. 13.12-7A-13.12-7B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.12-7A-13.12-7B.

Also discussed above, the connectors of the present disclosure can include sliding posts that slide relative to the display 13.12-102 or the facial interface 13.12-104. These sliding connectors can provide improved ranges of motion (e.g., lateral motion of the maxilla region) while still maintaining comfortable stability and rigidity. In accordance with one or more such examples, FIGS. 13.12-8A-13.12-8B illustrate connectors 13.12-802*a*-13.12-802*b* positioned at the maxilla region of the facial interface 13.12-104.

As shown in FIG. 13.12-8A, the connector 13.12-802*a* is affixed to the facial interface 13.12-104 and slidably engaged with the display 13.12-102. In particular, the connector 13.12-802*a* includes a slidable post with a proud engagement portion 13.12-801. The proud engagement portion 13.12-801 interfaces with a recessed engagement portion 13.12-804 positioned within the display 13.12-102. The recessed engagement portion 13.12-804 can include a slidable-post track (e.g., slide mechanism, track, guide, groove, recess, or raceway) defined by one or more surfaces of the display 13.12-102. The recessed engagement portion 13.12-804 can guide a range of motion for the connector 13.12-802*a* along a direction 13.12-808. In this manner, the connector 13.12-802*a* allows the facial interface 13.12-104 to comfortably conform to or move with the user's face in a stabilized fashion.

Alternatively, as shown in FIG. 13.12-8B, the connector 13.12-802*b* is affixed to the display 13.12-102 and slidably engaged with the facial interface 13.12-104. The connector 13.12-802*b* is the same as the connector 13.12-802*a*, except configured in a different positional relationship. In particular, the connector 13.12-802*b* includes a slidable post with a proud engagement portion 13.12-801. The proud engagement portion 13.12-801 interfaces with a recessed engagement portion 13.12-804 positioned within the facial interface 13.12-104. The proud engagement portion 13.12-801 can move along the direction 13.12-808 within the facial interface 13.12-104.

According to some examples, the mechanical slider examples illustrated in FIGS. 13.12-8A-13.12-8B can be implemented utilizing a variety of different materials. For example, at least one of the proud engagement portion 13.12-801 or the recessed engagement portion 13.12-804 can be an elastomer material, metal material, plastic material, composite materials, and the like.

Any of the features, components, and/or parts, including the arrangements and configurations thereof shown in FIGS. 13.12-8A-13.12-8B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.12-8A-13.12-8B.

Myriad other types of connectors are herein contemplated. For instance, the connector(s) 13.12-106 of the present disclosure can include a piston-based mechanism. In accordance with one or more such examples, FIGS. 13.12-9A-13.12-9F illustrate a head-mountable device 13.12-900 with a maxilla connector 13.12-902 and a zygoma connector 13.12-904. The maxilla connector 13.12-902 and the zygoma connector 13.12-904 movably join the facial interface 13.12-104 and the display 13.12-102 as similarly described above.

As shown, however, the maxilla connector 13.12-902 includes a piston connection, and the zygoma connector 13.12-904 includes a pivot connection. The maxilla connector 13.12-902 can move in and out in response to application and release of a compressive force at the maxilla region of a face. As the maxilla connector 13.12-902 moves, the zygoma connector 13.12-904 correspondingly moves (e.g., pivots).

FIG. 13.12-9B shows that the maxilla connector 13.12-902 includes a cap 13.12-906, a plunger 13.12-908, a compression spring 13.12-910, and a housing 13.12-912. The cap 13.12-906 maintains the components of the maxilla connector 13.12-902 in place. The plunger 13.12-908 moves in and out of the housing 13.12-912, with resistance provided by the compression spring 13.12-910. The plunger 13.12-908 is also a stop, where compression of the plunger 13.12-908 is mechanically stopped due to the body of the plunger 13.12-908 abutting a bottom of the housing 13.12-912.

FIG. 13.12-9C illustrates the maxilla connector 13.12-902 in a nominal (e.g., uncompressed) position. FIG. 13.12-9D shows the maxilla connector 13.12-902 in a compressed position.

FIGS. 13.12-9E-13.12-9F show a positional relationship of the maxilla connector 13.12-902 relative to the zygoma connector 13.12-904 at depth positions 13.12-914-918 of the maxilla connector 13.12-902. The maxilla connector 13.12-902 is positioned in a perpendicular fashion relative to the zygoma connector 13.12-904. In particular, the maxilla connector 13.12-902 is positioned perpendicular to the zygoma connector 13.12-904 at a median (i.e., middle) position, namely the depth position 13.12-916. By aligning the piston direction of the maxilla connector 13.12-902 to be perpendicular to the depth position 13.12-916, an amount of horizontal displacement can be minimized or reduced. In turn, the risk of binding the maxilla connector 13.12-902 due to horizontal displacement is also minimized or reduced.

Specifically, a displacement distance 13.12-920 in FIG. 13.12-9F corresponds to the piston alignment with the depth position 13.12-916. In addition, a displacement distance 13.12-922 corresponds to an alternative piston alignment (i.e., with the depth position 13.12-914). Comparatively, the displacement distance 13.12-922 is far greater than the displacement distance 13.12-920. In certain implementations, the displacement distance 13.12-920 is (for example) about 0.2 mm, and the displacement distance 13.12-922 is (for example) about 0.8 mm (e.g., for a 0 to 15 degree rotation of the zygoma connector 13.12-904 and a radial distance of about 24 mm). Myriad other positional relationships of the maxilla connector 13.12-902 relative to the zygoma connector 13.12-904 are herein contemplated.

Any of the features, components, and/or parts, including the arrangements and configurations thereof shown in FIGS. 13.12-9A-13.12-9F can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.12-9A-13.12-9F.

FIG. 13.12-10 illustrates a cutaway view of an example connector 13.12-1000 in accordance with one or more examples of the present disclosure. As shown, the connector 13.12-1000 includes a spring element 13.12-1002. The spring element 13.12-1002 can bias internal portions of the connector 13.12-1000 (e.g., to facilitate more or less travel or compression of the connector 13.12-1000).

Additionally or alternatively to the spring element 13.12-1002 (or other suitable internal biasing components), the connector 13.12-1000 can include external biasing component(s). For example, a textile 13.12-1004 forming an exterior surface of the connector 13.12-1000 can also bias the connector 13.12-1000. Indeed, the textile 13.12-1004 can be stretched or otherwise positioned over the connector 13.12-1000 to bias internal components of the connector 13.12-1000. In these or other examples, the textile 13.12-1004 can include silicone, stretchy fabric (e.g., spandex, polyester, etc.), or other suitable materials.

It will be appreciated that the connector 13.12-1000 can be implemented in a variety of ways. In some examples, the connector 13.12-1000 includes a floating connection that does not integrally secure the display 13.12-102 and the facial interface 13.12-104. Rather, the connector 13.12-1000 can make contact with (and can compress against) the display 13.12-102 or the facial interface 13.12-104.

Any of the features, components, and/or parts, including the arrangements and configurations thereof shown in FIG. 13.12-10 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.12-10.

As discussed above, the connectors of the present disclosure can include a variety of different materials. In accordance with one or more examples of the present disclosure, FIG. 13.12-11 illustrates an example connector 13.12-1100 with an elastomer portion 13.12-1102 adjoining the display 13.12-102 and the facial interface 13.12-104. In some examples, the elastomer portion 13.12-1102 can include a thickness of a predetermined amount (e.g., based on a force-displacement profile). Further, in some examples, the elastomer portion 13.12-1102 can vary in thickness (e.g., in a tapered fashion). In these or other examples, the elastomer portion 13.12-1102 can include various different types of elastomers, such as cis-polyisoprene (natural rubber), cis-polybutadiene (butadiene rubber), styrene-butadiene rubber, and ethylene-propylene monomer. Additionally or alternatively, the elastomer portion 13.12-1102 can include a hybrid elastomer material (e.g., part elastomer and part non-elastomer).

Any of the features, components, and/or parts, including the arrangements and configurations thereof shown in FIG. 13.12-11 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.12-11.

FIG. 13.12-12 illustrates another example connector 13.12-1200 in accordance with one or more examples of the present disclosure. As shown, the connector 13.12-1200 includes a ball joint 13.12-1202 and a leaf spring 13.12-1204. In this manner, the connector 13.12-1200 can allow at least some pivoting or twisting about the ball joint 13.12-1202. In addition, the connector 13.12-1200 can allow tensioned (and tunable) depth adjustment via the leaf spring 13.12-1204. Indeed, the leaf spring 13.12-1204 can include a variety of different lengths, thicknesses, etc. to provide the desired stiffness (or flexibility) of connection between the display 13.12-102 and the facial interface 13.12-104. As with other connectors, the leaf spring 13.12-1204 can also be formed of various materials, such as metal, plastic, or composite material.

Any of the features, components, and/or parts, including the arrangements and configurations thereof shown in FIG. 13.12-12, can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.12-12.

13.13: Adjustment Mechanism

The following disclosure relates to adjustment mechanisms of a head-mountable device (e.g., for AR/VR experiences). More particularly, the present embodiments relate to adjustment mechanisms of a head-mountable device for altering angle and/or distance of a head-mountable device relative to the user head (or eyes). These adjustment mechanisms include depth (e.g., translation) adjustments and/or angular (e.g., rotation) adjustments.

In one example, a head-mountable device includes a connection between a display and a facial interface. The connection allows the display to be translatable or rotatable relative to the facial interface. The translatable or rotatable movements allow the head-mountable device to achieve positions and combinations of positions that otherwise could not be achieved.

Conventional head-mountable devices do not include connections between the display and facial interfaces that allow translatable or rotatable movements. Therefore, conventional head-mountable devices do not allow the movement required to adjust depth for eye relief or angular adjustments to optimize viewing. Thus, conventional head-mountable devices cannot accommodate for different facial profiles, viewing preferences, eyesight capacities, etc.

By contrast, a head-mountable device of the present disclosure provides connections allowing translatable or rotatable motion relative to a facial interface. Such a head-mountable device has many advantages over a conventional head-mountable device. A head-mountable device with connections allowing movement of a display relative to the user's face allows a user adjust the depth and angle of the display screen as needed to accommodate their personal preferences or requirements. Additionally, a head mountable display with connections allows motion of the display relative to different users' faces, thereby improving a shareability of head-mountable device over conventional HMDs.

As disclosed herein, controlling the movement (e.g., linear translation or angular tilt) of a head-mounted display entails user friendly and simple actuation controls (e.g., lever, button, dial, rocker, slider, toggle, etc.) that are intuitive and easy to manipulate. Several examples of these devices are discussed below.

In one example, a head-mountable device includes a display, a strap connected to the display (e.g., the display frame), a facial interface, which is customizable to a user's facial profile, and a connection. The connection can be between the display and the facial interface such that the display is translatable and/or rotatable relative to the facial interface via the connection.

In another example, a head-mountable device includes a display, a strap connected to the display (e.g., the display frame), a facial interface, which is customizable to a user's facial profile, and an actuator. The actuator can moveably constrain the display relative to the facial interfaces.

In yet another example, a head-mountable device includes a display, a facial interface, which is customizable to a user's facial profile, and an angular and linear adjustment connection between the display and facial interface.

Accordingly, the apparatus and systems described herein provide angular and linear adjustments for a display of a head-mountable device in a user-friendly way, creating an enhanced more customizable user experience.

These and other embodiments are discussed below with reference to FIGS. 13.13-1-13.13-26B. However, those skilled in the art will readily appreciate that the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 13.13-1 illustrates a top view profile of a head-mountable device 13.13-100 worn on a user head 13.13-101. While the present systems and methods are described in the context of a head-mountable device 13.13-100, the systems and methods can be used with any wearable apparatus, or any apparatus or system that can be physically attached to a user's body, but are particularly relevant to an electronic device worn on a user's head. The head-mountable device 13.13-100 can include a display 13.13-102 (e.g., one or more optical lenses or display screens in front of the eyes of the user). The display 13.13-102 can include a display for presenting augmented reality visualizations, a virtual reality visualization, or other suitable visualization. The display 13.13-102 can also include a display frame 13.13-105 that houses optical components of the display 13.13-102. It will therefore be appreciated that when referencing the display 13.3-102 herein, the display frame 13.3-105 can be implemented as part of specific aspects or functionality for the display 13.3-102. For example, connection(s) 13.3-106 (described further below) can connect the facial interface 13.3-104 to at least one of the display 13.3-102 (e.g., optical elements of the display 13.3-102) or structural elements of the display 13.3-102 (e.g., the display frame 13.3-105).

The head-mountable device 13.13-100 also includes a facial interface 13.13-104 and a connection(s) 13.13-106 between the display 13.13-102 (e.g., the display frame 13.13-105) and the facial interface 13.13-104. As used herein, the term "facial interface" refers to a portion of the head-mountable device 13.13-100 that engages a user face via direct contact. In particular, a facial interface includes portions of the head-mountable device 13.13-100 that conform to (e.g., compress against) regions of a user face. To illustrate, a facial interface can include a pliant (or semi-pliant) face track that spans the forehead, wraps around the eyes, contacts the zygoma and maxilla regions of the face, and bridges the nose. In addition, a facial interface can include various components forming a structure, webbing, cover, fabric, or frame of a head-mountable device disposed between the display 13.13-102 and the user skin. In particular implementations, a facial interface can include a seal (e.g., a light seal, environment seal, dust seal, air seal, etc.). It will be appreciated that the term "seal" can include partial seals or inhibitors, in addition to complete seals (e.g., a partial light seal where some ambient light is blocked and a complete light seal where all ambient light is blocked when the head-mountable device is donned).

In addition, the term "connection" refers to a joining between the display 13.13-102 (e.g., the display frame 13.13-105) and the facial interface 13.13-104. In some examples, a connection allows the display 13.13-102 to translate or rotate relative to the facial interface 13.13-104. In other examples, a connection allows the display 13.13-102 to both translate and rotate relative to the facial interface 13.13-104. For instance, the connection(s) 13.13-106, when adjusted, can slide (e.g., translate) the display 13.13-102 toward or away from the facial interface 13.13-104 (e.g., in a linear fashion). In another example, the connection(s) 13.13-106, when adjusted, can rotate the display 13.13-102 up or down relative to the facial interface 13.13-104 (e.g., in an angular fashion). Thus a connection can slidably join or rotatably join the display 13.13-102 and the facial interface 13.13-104.

In this manner, the connection(s) 13.13-106 can movably constrain the display 13.13-102 relative to the facial interface 13.13-104. As used herein, the term "movably constrain" or "movably constraining" refers to the type of connection that can dynamically move (e.g., translate or rotate), yet retain control over a particular element's movement or position. For example, to "movably constrain" means the connection(s) 13.13-106 can bound movement of the display 13.13-102 within two degrees of freedom (e.g., along a horizontal plane and along an additional plane non-planar with the horizontal plane) relative to the facial interface 13.13-104.

The connection(s) 13.13-106 can include one or more components (e.g., actuators, sliders, gears, levers, mechanical advantage devices, posts, mechanical stops, dampeners, etc.) that can allow (or actively provide) translation or rotation of the display 13.13-102 relative to the facial interface 13.13-104. The connection(s) 13.13-106 can have an adjustable resolution that is a continuous resolution or a non-continuous resolution, and capable of transitioning between states (e.g., between a first display position and a second display position). The connection(s) 13.13-106 can include a manual actuator control or an automated actuator control that is operable from a single interface location (or multiple interface locations).

In certain implementations, the connection(s) 13.13-106 are positioned between inner and outer surfaces of the head-mountable device 13.13-100. As used herein, an "outer surface" refers to an exterior surface of the head-mountable device 13.13-100 that outwardly faces the ambient environment. By contrast, as used herein, an "inner surface" refers to an exterior surface of the head-mountable device 13.13-100 that is oriented to face towards (or contact) a human face or skin.

Furthermore, the connection 13.13-106 can include a variety of different adjustment mechanisms, members, or movement mechanisms or movable connectors (e.g., bearings/bushings, dovetail slides, scissor mechanisms, sarrus linkages, gears, movable arms, etc.), cables (e.g., tensioned cables), actuators (e.g., mechanical, electromechanical, hydraulic, pneumatic, piezoelectric, etc.), and locking mechanisms (toggles, latches, ratchets, clamps, friction brakes, toothed brakes, hydraulic brakes, pneumatic bladders, non-back-drivable mechanisms, etc.), and other components. Locations of the connection 13.13-106 can be modified or tuned, as can the number of connections. For instance, the location and/or the number of the connection(s) 13.13-106 can correlate to an amount of force or pressure exerted on the user at any one datum (e.g., forehead region, maxilla region, zygoma region, etc.). In other instances, the location and/or the number of the connection(s) 13.13-106 can correspond to rigidity (or rigidity variances) between the connection(s) 13.13-106.

As used herein, the term "forehead region" refers to an area of a human face between the eyes and the scalp of a human. Additionally, the term "maxilla region" refers to an area of a human face corresponding to the zygomatic bone structure of a human. Similarly, the term "maxilla region" refers to an area of a human face corresponding to the maxilla bone structure of a human.

Additionally shown in FIG. 13.13-1, the head-mountable device 13.13-100 includes one or more arms 13.13-108, 13.13-110. The arms 13.13-108, 13.13-110 are connected to the display 13.13-102 and extend distally toward the rear of the head. The arms 13.13-108, 13.13-110 are configured to secure the display in a position relative to the user head 13.13-101 (e.g., such that the display 13.13-102 is maintained in front of a user's eyes). For example, the arms 13.13-108, 13.13-110 extend over the user's ears 13.13-112. In certain examples, the arms 13.13-108, 13.13-110 rest on the user's ears 13.13-112 to secure the head-mountable device 13.13-100 via friction between the arms 13.13-108, 13.13-110 and the user head 13.13-101. For example, the arms 13.13-108, 13.13-110 can apply opposing pressures to the sides of the user head 13.13-101 to secure the head-mountable device 13.13-100 to the user head 13.13-101. Optionally, the arms 13.13-108, 13.13-110 can be connected to each other via a strap 13.13-103 (shown in the dashed lines) that can compress the head-mountable device 13.13-100 against the user head 13.13-101. In particular examples, the strap 13.13-103 is connected to at least the frame of the display 13.13-102 or the facial interface 13.13-104.

In specific examples, the arms 13.13-108, 13.13-110 are connected to the display 13.13-102 (by way of the display frame 13.13-105) via a pivot joint 13.13-114. The pivot joint 13.13-114 can be external or internal with respect to the arms 13.13-108, 13.13-110 and/or the display frame 13.13-105. In these or other examples, the pivot joint 13.13-114 can allow the display frame 13.13-105 to rotate about the pivot joint 13.13-114 independent of the arms 13.13-108, 13.13-110. To do so, the pivot joint 13.13-114 can include a detent hinge, a friction hinge, a passive hinge, a full lock-out hinge, etc.

Any of the features, components, and/or parts, including the arrangements and configurations thereof shown in FIG. 13.13-1 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.13-1.

FIGS. 13.13-2A-13.13-2B respectively illustrate side and front view profiles of an example of the head-mountable device 13.13-100. As discussed above, the head-mountable device 13.13-100 includes the display 13.13-102, the facial interface 13.13-104, and the connection(s) 13.13-106. In particular, as shown in FIGS. 13.13-2A-13.13-2B, the facial interface 13.13-104 can indeed wrap around the eyes 13.13-201, bridge the nose 13.13-202, span the forehead 13.13-203, and contact the zygoma and maxilla regions 13.13-205 of the face.

Additionally shown in FIGS. 13.13-2A-13.13-2B, the head-mountable device 13.13-100 includes sensors 13.13-204 which can be attached to (or embedded within) the facial interface 13.13-104. As used herein, the tem "sensor" refers to one or more different sensing devices, such as a camera or imaging device, temperature device, oxygen device, movement device, brain activity device, sweat gland activity device, breathing activity device, muscle contraction device, etc. some particular examples of sensors include an electrooculography sensor, electrocardiography sensor, EKG sensor, heart rate variability sensor, blood volume pulse sensor, SpO2 sensor, compact pressure sensor, electromyography sensor, core-body temperature sensor, galvanic skin sensor, accelerometer, gyroscope, magnetometer, inclinometer, barometer, infrared sensor, global positioning system sensor, etc.

Further below, this disclosure describes with more particularity how the connection(s) 13.13-106 as adjustment mechanisms can be positioned within the head-mountable device 13.13-100. In addition, subsequent portions of this disclosure provide additional detail with respect to user interactions for controlling or actuating adjustment mechanisms.

Any of the features, components, and/or parts, including the arrangements and configurations thereof shown in FIGS. 13.13-2A-13.13-2B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.13-2A-13.13-2B.

The location and positioning of the connection(s) 13.13-106 can provide a stable yet flexible and adjustable interface between the facial interface 13.13-104 and the display 13.13-102. In accordance with one or more examples of the present disclosure, FIGS. 13.13-3A-13.13-3D illustrate a plurality of positions where the connection(s) 13.13-106 can be located between the display 13.13-102 and the facial interface 13.13-104. Although FIGS. 13.13-3A-13.13-3D illustrate particular locations, it will be appreciated that the locations of the connection(s) 13.13-106 can be modified within the scope of the present disclosure.

In one example, FIG. 13.13-3A, shows the connection(s) 13.13-106 includes a single adjustment mechanism located at the forehead 13.13-203 of a user. The connection(s) 13.13-106 can be configured to provide a linear or angular connection between the display 13.13-102 and the facial interface 13.13-104. In particular implementations, the connection(s) 13.13-106 provides only angular (tilt) adjustment by pivoting the display 13.13-102 relative to the facial interface 13.13-104.

In at least some instances, a single-point system as shown in FIG. 13.13-3A can provide the simplest and most direct means of adjustment. For example, the connection(s) 13.13-106 in FIG. 13.13-3A can avoid potential angular misalignment or racking issues of multi-point systems. As another example, the connection(s) 13.13-106 in FIG. 13.13-3A can facilitate single-handed user adjustment of the head-mountable device 13.13-100.

FIG. 13.13-3B shows another example where the connection(s) 13.13-106 include two adjustment mechanisms oppositely positioned between the facial interface 13.13-104 and the display 13.13-102. Specifically, the connection(s) 13.13-106 in FIG. 13.13-3B include a first adjustment mechanism on a left side and a second adjustment mechanism on a right side (e.g., near regions of the user eye). Similarly, in another example, the connection(s) 13.13-106 may be located near the zygoma or maxilla regions 13.13-205 of the face. The two connections can provide at least two points of angular or linear adjustment of the display 13.13-102 relative to the facial interface 13.13-104. For example, both of the connection(s) 13.13-106 in FIG. 13.13-3B can be adjusted linearly together to provide a depth adjustment, or adjusted angularly together to provide a vertical (up/down) tilt adjustment. In another example, one of the connections 13.13-106 can be extended outward and the other of the connection(s) 13.13-106 can be pushed inward (so as to provide a side-to-side or horizontal tilt adjustment).

FIG. 13.13-3C shows the connection(s) 13.13-106 include three adjustment mechanisms—one near the forehead 13.13-203 and two at bottom corner areas at the zygoma or maxilla regions. Additionally, FIG. 13.13-3D shows the connection (s) 13.13-106 include four connection(s) 13.13-106—two at the top corners and two at the bottom corners. In at least some examples, multi-point systems like those shown in FIGS. 13.13-3B-13.13-3D can provide improved load distribution and/or rigidity. Multi-point systems like those shown in FIGS. 13.13-3B-13.13-3D can also satisfy larger load requirements, such as increased loads during a sudden impact event to the head-mountable device 13.13-100. In the case of multi-point systems, synchronization mechanisms can be added to ensure that each of the connection(s) 13.13-106 move in lockstep.

Any of the features, components, and/or parts, including the arrangements and configurations thereof shown in FIGS. 13.13-3A-13.13-3D can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.13-3A-13.13-3D. Moreover, although not shown, it will be appreciated that more than four of the connection(s) 13.13-106 are also contemplated, and the locations of any one the connection(s) 13.13-106 described can vary in position and location relative to the figures in which they were described.

As mentioned above, the connection(s) 13.13-106 can include adjustment mechanisms that allow (or provide) movement of the display 13.13-102 relative to the facial interface 13.13-104. This movement can include motion in a single degree of freedom or multiple degrees of freedom. In accordance with one or more such examples, FIGS. 13.13-4A-13.13-4C illustrate an example of depth adjustment via depth adjustment mechanisms 13.13-402 (e.g., linear adjustment connections). For example, FIG. 13.13-4A shows the display 13.13-102 positioned relative to the facial interface 13.13-104 in a home state. In the home state, depth adjustment mechanisms 13.13-402 can be positioned at a default position, a customized position, etc. in which the display 13.13-102 is a predetermined distance (i.e., eye relief distance) away from the facial interface 13.13-104. In other instances, the home state can include a current positioning of the display 13.13-102 relative to the display 13.13-102.

FIG. 13.13-4B shows the depth adjustment mechanisms 13.13-402 in an extended state. In the extended state, the depth adjustment mechanisms 13.13-402 are extended or otherwise altered from the home state (or another state) to increase a relative distance between the display 13.13-102 and the facial interface 13.13-104.

FIG. 13.13-4C shows the depth adjustment mechanisms 13.13-402 in a retracted state. In the retracted state, the depth adjustment mechanisms 13.13-402 are retracted or otherwise altered from the home state (or another state) to decrease a relative distance between the display 13.13-102 and the facial interface 13.13-104.

In some examples, the various states shown in FIGS. 13.13-4A-13.13-4C can include discrete or predefined positions of the display 13.13-102 relative to the facial interface 13.13-104—where the predefined positions are differentiated by set (or customizable) step-sizes. For instance, the depth adjustment mechanisms 13.13-402 can be utilized to vary the position of the display 13.13-102 relative to the facial interface 13.13-104 in positional steps from 0 mm eye relief distance in a fully retracted state, to 6 mm eye relief distance in a fully extended state. In other examples, however, the various states shown in FIGS. 13.13-4A-13.13-4C can include non-discrete positions of the display 13.13-102 relative to the facial interface 13.13-104—where the positions are configurable via continuous adjustment of the depth adjustment mechanisms 13.13-402, due to a continuous interface that is gradually adjusting over a substantially smooth surface, providing a continuous adjustment resolution.

Adjustment of the depth adjustment mechanisms 13.13-402 can be performed in different ways. In some examples, user interactions to the depth adjustment mechanisms 13.13-402 (e.g., via one or more user controls) can actuate or move the depth adjustment mechanisms 13.13-402. Additionally or alternatively, the depth adjustment mechanisms 13.13-402 can actuate in response to one or more sensors of the head-mountable device 13.13-100 detecting a voice command or gesture (e.g., eye gesture, hand gesture, touch, etc.). Still further, in some examples, the head-mountable device 13.13-100 can automatically adjust the depth adjustment mechanisms 13.13-402 (e.g., based on one or more sensors of the head-mountable device 13.13-100 detecting a user field of view indicating adjustment is needed). Thus, in certain implementations, the head-mountable device 13.13-100 includes a motor to auto-drive certain actuation. In this example, the motor can mechanically interface with the connections or adjustment mechanisms to automate or controllably drive the adjustment mechanisms.

Any of the features, components, and/or parts, including the arrangements and configurations thereof shown in FIGS. 13.13-4A-13.13-4C can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.13-4A-13.13-4C. Moreover, although not shown, it will be appreciated that more than four of the connection(s) 13.13-106 are also contemplated, and the locations of any one the connection(s) 13.13-106 described can vary in position and location relative to the figures in which they were described.

The connection(s) 13.13-106 can also allow (or provide) angular or rotational adjustment of the display 13.13-102 relative to the facial interface 13.13-104. In accordance with one or more such examples, FIGS. 13.13-5A-13.13-5C illustrate an example of tilt adjustment via angular adjustment mechanisms 13.13-502 (e.g., angular adjustment connections). Via adjustment of the angular adjustment mechanisms 13.13-502, the display 13.13-102 can pivot (e.g., rotate) the display 13.13-102 up or down by an angular displacement relative to the facial interface 13.13-104, as illustrated in FIGS. 13.13-5A-C.

In particular, FIG. 13.13-5A shows the angular adjustment mechanisms 13.13-502 in a home state (e.g., with no angular tilt). It will be appreciated, however, that alternative home states with angular tilt are herein contemplated.

FIG. 13.13-5B shows the angular adjustment mechanisms 13.13-502 in a negative angular state (e.g., downward angular tilt) relative to the home state. By contrast, FIG. 13.13-5C shows the angular adjustment mechanisms 13.13-502 in a positive angular state (e.g., upward angular tilt) relative to the home state.

As with the depth adjustment mechanisms 13.13-402 described above, the angular adjustment mechanisms 13.13-502 can also be adjusted in myriad different ways. For example, the angular adjustment mechanisms 13.13-502 can be adjusted manually (e.g., via user controls, voice commands, or user gestures). As another example, the head-mountable device 13.13-100 can automatically adjust the angular adjustment mechanisms 13.13-502 based on a detected user field of view.

In certain implementations, the angular state can have angular range of negative 7.5 degrees in a fully extended negative angular tilt state, to positive 7.5 degrees in a fully extended positive angular tilt state. The angular state can be discrete (e.g., with limited positional states) or continuous (e.g., unlimited positional states).

Any of the features, components, and/or parts, including the arrangements and configurations thereof shown in FIGS. 13.13-5A-13.13-5C can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.13-5A-13.13-5C.

In some cases, the connection(s) 13.13-106 can be statically adjusted, customized, or set. For instance, the connection(s) 13.13-106 may be adjusted upon initially donning the head-mountable device 13.13-100, and thereafter the connection(s) 13.13-106 is set without the ability to externally modify the connection(s) 13.13-106. That is, the connection(s) 13.13-106 nor a corresponding actuator control may be externally accessible when the apparatus is donned (e.g., without some disassembly of the head-mountable device 13.13-100). In accordance with one or more such examples, FIGS. 13.13-6A-13.13-6B illustrate an example head-mountable device 13.13-600 with adjustment connections 13.13-602 between the display 13.13-102 and the facial interface 13.13-104. In particular, FIG. 13.13-6A shows the head-mountable device assembly, while FIG. 13.13-6B provides a zoomed-in view of one of the adjustment connections 13.13-602.

The adjustment connections 13.13-602 can connectively join the display 13.13-102 at a distance from the facial interface 13.13-104 (as similarly described above for the connection(s) 13.13-106). The adjustment connections 13.13-602 can be positioned in myriad different locations. As shown, however, the adjustment connections 13.13-602 are positioned in upper corners of the forehead region and at the zygoma regions.

Additionally, the adjustment connections 13.13-602 as shown include an adjustable pillar 13.13-604. The adjustable pillar 13.13-604 is configured to slide into and out of an adjustment connection. Specifically, the adjustable pillar 13.13-604 moves relative to a base 13.13-603 of the adjustment connection. The adjustable pillar 13.13-604 is connected to the facial interface 13.13-104, and the base 13.13-603 is connected to the display 13.13-102. Alternatively, opposite configurations are herein contemplated (e.g., the adjustable pillar 13.13-604 connected to the display 13.13-102 and the base 13.13-603 connected to the facial interface 13.13-104). Thus, adjusting the adjustable pillar 13.13-604 (in or out of the base 13.13-603) causes a corresponding change in distance between the display 13.13-102 and the facial interface 13.13-104. The adjustable pillar 13.13-604 further includes holes 13.13-606 configured to receive a set screw (or other fastener) by which the adjustable pillar 13.13-604 can be positionally affixed upon setting to the desired position.

The adjustable pillar 13.13-604 can include a variety of different specifications (e.g., according to desired load distribution). For example, in some instances, the adjustable pillars 13.13-604 are constructed to withstand the compressive force of the strap 13.13-103 (not shown) pulling the display 13.13-102 towards the facial interface 13.13-104. In certain implementations, the adjustment connections 13.13-602 can distribute up to a 6 kN applied load (e.g., from the display 13.13-102 along the facial interface 13.13-104).

Any of the features, components, and/or parts, including the arrangements and configurations thereof shown in FIGS. 13.13-6A-13.13-6B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.13-6A-13.13-6B.

In contrast to static adjustment, the following description for FIGS. 13.13-7A-27 discusses various examples of dynamic adjustment (e.g., for different users, head sizes, head shapes, etc.)—where "dynamic" refers to on-the-fly or real time adjustment as may be desired for a given user at a given time. Moreover, as discussed above, the head-mountable device of the present disclosure can include single-point systems with a singular adjustment mechanism. In accordance with one or more examples of the present disclosure, FIGS. 13.13-7A-13.13-7B show an example head-mountable device 13.13-700 including the display 13.13-102 and the facial interface 13.13-104. In particular, the head-mountable device 13.13-700 includes an angular adjustment connection 13.13-702 that movably constrains the display 13.13-102 relative to the facial interface 13.13-104.

The angular adjustment connection 13.13-702 specifically includes a linkage 13.13-704 attached to the display 13.13-102. The linkage 13.13-704 includes notches 13.13-706 configured to receive a locking element 13.13-708, where the locking element 13.13-708 is connected to the facial interface 13.13-104. The notches 13.13-706 correspond to positions at which the locking element 13.13-708 can engage the linkage 13.13-704 for maintaining a position of the linkage 13.13-704.

The display 13.13-102 can be moved (e.g., rotated) by sliding the linkage 13.13-704 relative to the locking element 13.13-708. For example, the linkage 13.13-704 allows the display 13.13-102 to pivot relative to the facial interface 13.13-104 when the linkage 13.13-704 extends or the linkage 13.13-704 retracts relative to the locking element 13.13-708.

In certain implementations, the linkage 13.13-704 automatically moves in response to direct manipulation of the display 13.13-102. For example, the linkage 13.13-704 can extend or retract relative to the locking element 13.13-708 in response to user manipulation (e.g., a user hand tilting) of the display 13.13-102.

Any of the features, components, and/or parts, including the arrangements and configurations thereof shown in FIGS. 13.13-7A-13.13-7B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.13-7A-13.13-7B.

The head-mountable device of the present disclosure can also include a multi-point system where multiple adjustment mechanisms in combination can allow (or provide) multiple degrees of freedom (e.g., multiple directions of display mobility). In accordance with one or more such examples, FIG. 13.13-8 illustrates the display 13.13-102 and facial interface 13.13-104 connected by adjustable connections **13.13-802*a*-13.13-802*d*. The adjustable connections 13.13-802*a*-13.13-802*d* are disposed between the display 13.13-102 and the facial interface 13.13-104. Each of the adjustable connections 13.13-802** can be individually adjusted such that the display and be displaced linearly and/or angularly.

For example, the adjustable connections **13.13-802*a*, 13.13-802*b* can be adjusted so the top of the display is a first distance $d_1$ from the facial interface. The adjustable connections 13.13-802*c*, 13.13-802*d* can be adjusted differently than the adjustable connections 13.13-802*a*, 13.13-802*b* so that the bottom of the display is a second distance $d_2$ from the facial interface 13.13-104. In downward tilting cases, the second distance $d_2$ can be less that the first distance $d_1$. By contrast, for upward tilting cases, the second distance $d_2$ can be more than the first distance $d_1$. In this way, the adjustable connections 13.13-802*a*-13.13-802*d* make the angular adjustment connection between the facial interface 13.13-104 and the display 13.13-102, and the adjustable connections 13.13-802 make the linear adjustment connection between the facial interface 13.13-104 and the display 13.13-102**.

As another example, the adjustable connections **13.13-802*a*-13.13-802*d* can be adjusted in other ways. For instance, the adjustable connections 13.13-802*a*-13.13-802*d* can be adjusted in a same or similar fashion (e.g., all lengthened or retracted by a same distance) to linearly translate the display 13.13-102 towards or away from the facial interface 13.13-104**.

Any of the features, components, and/or parts, including the arrangements and configurations thereof shown in FIG. 13.13-8 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.13-8.

Where FIG. 13.13-6-8 depict example adjustment mechanisms without actuator controls (moving instead via direct user manipulation or setting of the head-mountable device), the following figures depict adjustment mechanisms with dynamic actuator controls. Indeed, as mentioned above, the connections (i.e., adjustment mechanisms or actuators) of the present disclosure can include adjustment controls configured for myriad different modes of user input and in various locations. In accordance with one or more such embodiments, FIGS. 13.13-9A-13.13-24B show example adjustment mechanism variations of the head-mountable device 13.13-100. In particular, the head-mountable device 13.13-100 includes the display 13.13-102, the facial interface 13.13-104, and the strap 13.13-103 (each described above).

In addition, FIGS. 13.13-9A-13.13-24B respectively depict front and side-view profiles of head-mountable devices 13.13-900-13.13-2400 with corresponding connections 13.13-902-13.13-2402 (which are the same as or similar to the connection(s) 13.13-106 also described above). The connections 13.13-902-13.13-2402 movably constrain the display 13.13-102 relative to the facial interface 13.13-104. The connections 13.13-902-13.13-2402 can therefore include myriad different forms of connections (e.g., mechanical connections) as indicated previously. Further, the connections 13.13-902-13.13-2402 can include myriad different forms of control mechanisms (e.g., actuator controls) that actuate the connections 13.13-902-13.13-2402 in response to user input.

In many examples, the head-mountable devices 13.13-900-13.13-2400 include actuator controls such as levers (e.g., side peel lever, vertical slide lever, etc.), buttons (push-button, side push button, top push button, automatic release button, etc.), dials (vertical scroll wheel dial, horizontal scroll wheel dial, top scroll wheel dial, etc.), rockers, sliders, or toggles. The actuator controls can be combined with multiple control mechanisms. For example, a sliding actuator controller can include a lever which can be user to lock a head-mountable device in position at the desired viewing state. In another example, a combined actuator control may include a rocker combined with a scroll wheel, such that the scroll wheel, when engaged by the rocker rotates, causing a change in distance between the display 13.13-102 and the facial interface 13.13-104. It can be appreciated that a number of variations and examples are contemplated herein and the examples provided below serve to illustrate a few of the possible configurations.

FIGS. 13.13-9A-13.13-9B illustrate a head-mountable device 13.13-900 with a connection 13.13-902. The connection 13.13-902 includes an actuator control 13.13-904. The actuator control 13.13-904 is positioned on a side portion of the display 13.13-102 or the facial interface 13.13-104. The actuator control 13.13-904 includes a side push button 13.13-906. In response to actuation of the side push button 13.13-906 (e.g., an inward push, press, tap), the connection 13.13-902 can translate the display 13.13-102 to or from a first state 13.13-908, a second state 13.13-910, or a third state 13.13-912. Although FIGS. 13.13-9A-13.13-9B illustrate discrete states or positions (i.e., the first state 13.13-908, the second state 13.13-910, and the third state 13.13-912), it will be appreciated that head-mountable device 13.13-900 can include more or fewer positional states. In certain implementations, the head-mountable device 13.13-900 includes a continuous resolution of positional states (as opposed to discrete, predetermined positional states).

In one or more examples, the side push button 13.13-906 can be actuated in various ways. For instance, the side push button 13.13-906 can include a push-to-release button, a push-and-hold button, slide-push buttons, top-push buttons, etc.). The buttons can be located in various locations (e.g., top portion, side portion, bottom portion, etc.) of the head-mountable device 13.13-900, either on the display 13.13-102 or on the facial interface 13.13-104.

FIGS. 13.13-10A-13.13-10B illustrate a head-mountable device 13.13-1000 with a connection 13.13-1002. The connection 13.13-1002 includes an actuator control 13.13-1004. The actuator control 13.13-1004 is similar to the actuator control 13.13-904. In particular, the actuator control 13.13-1004 includes a top push button positioned at a top portion of the display 13.13-102 or the facial interface 13.13-104 (e.g., at one or both top corners of the head-mountable device 13.13-1000). When the actuator control 13.13-1004 is pressed, the connection 13.13-1002 can translate the display 13.13-102 to or from the first state 13.13-908, the second state 13.13-910, or the third state 13.13-912, as described above.

In another example, the head-mountable device 13.13-100 includes actuation components that have actuator controls that slide or twist (e.g., by levers, buttons, rotatable components, etc.) causing the display 13.13-102 to move relative to the facial interface 13.13-104. FIGS. 13.13-11A-13.13-14B illustrate such examples.

In particular, FIGS. 13.13-11A and 13.13-11B illustrate a head-mountable device 13.13-1100 with a connection 13.13-1102. The connection 13.13-1102 includes an actuator control 13.13-1104. The actuator control 13.13-1104 is positioned on a side portion of the display 13.13-102 or the facial interface 13.13-104. The actuator control 13.13-1104 includes a side peel lever. The side peel lever of the actuator control 13.13-1104, when pulled downward, releases a lock (e.g., a cam lock) allowing the connection 13.13-1102 to move the display 13.13-102 relative to the facial interface 13.13-104. Additionally, the actuator control 13.13-1104, when pushed upward into a locked position, causes the connection 13.13-1102 to lock the display 13.13-102 into position relative to the facial interface 13.13-104.

FIGS. 13.13-12A and 13.13-12B illustrate a head-mountable device 13.13-1200 with a connection 13.13-1202. The connection 13.13-1202 includes an actuator control 13.13-1204. The actuator control 13.13-1204 is also positioned on a side portion of the display 13.13-102 or the facial interface 13.13-104. The actuator control 13.13-1204 includes a twist sleeve lever. Thus, the twist sleeve lever of the actuator control 13.13-1204 can rotate (e.g., outward in a clockwise direction), allowing the connection 13.13-1202 to move the display 13.13-102 relative to the facial interface 13.13-104. Likewise, the actuator control 13.13-1204 can be rotated in an opposite direction (e.g., inward in a counterclockwise direction), allowing the connection 13.13-1202 to positionally fix the display 13.13-102 relative to the facial interface 13.13-104.

FIGS. 13.13-13A and 13.13-13B illustrate a head-mountable device 13.13-1300 with a connection 13.13-1302. The connection 13.13-1302 includes an actuator control 13.13-1304. The actuator control 13.13-1304 is similarly positioned on a side portion of the display 13.13-102 or the facial interface 13.13-104. The actuator control 13.13-1304 includes a finger pinch slider. The finger pinch slider of the actuator control 13.13-1304 can slide frontwards and backwards allowing the connection 13.13-1302 to positionally move (or lock) the display 13.13-102 relative to the facial interface 13.13-104.

FIGS. 13.13-14A and 14B illustrate a head-mountable device 13.13-1400 with a connection 13.13-1402. The connection 13.13-1402 includes an actuator control 13.13-1404. The actuator control 13.13-1404 is positioned on a side portion of the display 13.13-102 or the facial interface 13.13-104. The actuator control 13.13-1404 includes a sleeve slide. The sleeve slide of the actuator control 13.13-1404 can slide along the actuator control 13.13-904 allowing the connection 13.13-1402 to move the display 13.13-102 relative to the facial interface 13.13-104.

FIGS. 13.13-15A and 13.13-15B illustrate a head-mountable device 13.13-1500 with a connection 13.13-1502. The connection 13.13-1502 includes an actuator control 13.13-1504. The actuator control 13.13-1504 is positioned along an outer periphery of the head-mountable device 13.13-1500 (e.g., from top to bottom corners at a side portion of the display 13.13-102 or the facial interface 13.13-104). The actuator control 13.13-1504 includes a vertical slide that moves approximately up and down along the outer periphery of the head-mountable device 13.13-1500. The vertical slide of the actuator control 13.13-1504 can be toggled between positions (e.g., the first state 13.13-908, the second state 13.13-910, and the third state 13.13-912). Additional detail of this embodiment is discussed further below in relation to FIGS. 13.13-25A-13.13-25D.

FIGS. 13.13-16A and 13.13-16B illustrate a head-mountable device 13.13-1500 with a connection 13.13-1602. The connection 13.13-1602 includes an actuator control 13.13-1604. The actuator control 13.13-1604 is positioned on a side portion of the display 13.13-102 or the facial interface 13.13-104. The actuator control 13.13-1604 includes a side temple squeeze button (e.g., spring button) that, when squeezed, allows the connection 13.13-1602 to contemporaneously move the display 13.13-102 relative to the facial interface 13.13-104. The side temple squeeze button of the actuator control 13.13-1604 can automatically release when one of the first state 13.13-908, the second state 13.13-910, or the third state 13.13-912 is reached. The side temple squeeze button of the actuator control 13.13-1604 can have the button oriented upward (or in alternative cases, downward) relative to the head-mountable device 13.13-1600.

FIGS. 13.13-17A and 13.13-17B illustrate a head-mountable device 13.13-1700 with a connection 13.13-1702. The connection 13.13-1702 includes an actuator control 13.13-1704. The actuator control 13.13-1704 is positioned on a side portion of the display 13.13-102 or the facial interface 13.13-104. The actuator control 13.13-1704 includes a scroll wheel rotatable about an axis 13.13-1706 proceeding inward and outward of the head-mountable device 13.13-1700. In some examples, the scroll wheel of the actuator control 13.13-1704 rotates in response to tangential forces (e.g., a finger swipe from front to back or up and down). In other examples, the scroll wheel of the actuator control 13.13-1704 rotates in response to twisting fingers. The scroll wheel of the actuator control 13.13-1704, when rotated about the axis 13.13-1706, can cause the connection 13.13-1702 to correspondingly adjust the distance between the display 13.13-102 and the facial interface 13.13-104.

FIGS. 13.13-18A and 13.13-18B illustrate a head-mountable device 13.13-1800 with a connection 13.13-1802. The connection 13.13-1802 includes an actuator control 13.13-1804. The actuator control 13.13-1804 is positioned on a side portion of the display 13.13-102 or the facial interface 13.13-104. The actuator control 13.13-1804 includes a scroll wheel rotatable about an axis 13.13-1806. The actuator control 13.13-1804, like the actuator control 13.13-1704, can respond to tangential forces (such as a finger swipe up or down). The scroll wheel of the actuator control 13.13-1804, when rotated about the axis 13.13-1806, can cause the connection 13.13-1802 to correspondingly adjust the distance between the display 13.13-102 relative to the facial interface 13.13-104.

FIGS. 13.13-19A and 13.13-19B illustrate a head-mountable device 13.13-1900 with a connection 13.13-1902. The connection 13.13-1902 includes an actuator control 13.13-1904. The actuator control 13.13-1904 is positioned on a side portion of the display 13.13-102 or the facial interface 13.13-104. The actuator control 13.13-1904 is similar to the actuator control 13.13-1804. In particular, the actuator control 13.13-1904 includes a scroll wheel rotatable about an axis 13.13-1906. The scroll wheel of the actuator control 13.13-1904 can therefore respond to tangential forces (e.g., a finger swipe front to back, and vice-versa). In response to this user interaction, the connection 13.13-1902 can move the display 13.13-102 relative to the facial interface 13.13-104.

FIGS. 13.13-20A and 13.13-13.13-20B illustrate a head-mountable device 13.13-2000 with a connection 13.13-2002. The connection 13.13-2002 includes an actuator control 13.13-2004. The actuator control 13.13-2004 includes a slider (e.g., toggle) positioned on the top region of the display 13.13-102 or the facial interface 13.13-104 (e.g., along a forehead region). The actuator control 13.13-904 moves laterally (e.g., inward and outward) to correspondingly cause the connection 13.13-2002 to adjust the distance between the display 13.13-102 relative to the facial interface 13.13-104 (e.g., frontwards or backwards).

FIGS. 13.13-21A and 13.13-13.13-21B illustrate a head-mountable device 13.13-2100 with a connection 13.13-2102. The connection 13.13-2102 includes an actuator control 13.13-2104. The actuator control 13.13-2104 includes a rocker positioned on the top region of the display 13.13-102 or the facial interface 13.13-104. The actuator control 13.13-2104 moves up or down about a pivot 13.13-2106. In response to up/down actuation of the actuator control 13.13-2104, the connection 13.13-2102 adjusts the distance between the display 13.13-102 relative to the facial interface 13.13-104.

FIGS. 13.13-22A-13.13-24B illustrate an actuator control that includes a scroll wheel disposed on top of a head-mountable device. The scroll wheel can be rotated around different axes to adjust the distance between the display 13.13-102 relative to the facial interface 13.13-104. Further detail is provided below.

In particular, FIGS. 13.13-22A and 13.13-13.13-22B illustrate a head-mountable device 13.13-2200 with a connection 13.13-2202. The connection 13.13-2202 includes the actuator control 13.13-1804 described above. Here, however, the actuator control 13.13-1804 is positioned on a top portion of the display 13.13-102 or the facial interface 13.13-104. Indeed, the actuator control 13.13-1804 includes a scroll wheel rotatable about an axis 13.13-2204. The scroll wheel of the actuator control 13.13-1804, when rotated up or down about the axis 13.13-2204, causes the connection 13.13-2202 to adjust the distance between the display 13.13-102 relative to the facial interface 13.13-104.

FIGS. 13.13-23A and 13.13-13.13-23B illustrate a head-mountable device 13.13-2300 with a connection 13.13-2302. The connection 13.13-2302 also includes the actuator control 13.13-1804 described above. Differently though, the actuator control 13.13-1804 is positioned on a top portion of the display 13.13-102 or the facial interface 13.13-104. The actuator control 13.13-1804 also includes a scroll wheel rotatable about an axis 13.13-2304. The scroll wheel of the actuator control 13.13-1804, when rotated up or down about the axis 13.13-2304, causes the connection 13.13-2302 to adjust the distance between the display 13.13-102 relative to the facial interface 13.13-104.

FIGS. 13.13-24A and 13.13-13.13-24B illustrate a head-mountable device 13.13-2400 with a connection 13.13-2402. The connection 13.13-2402 includes the actuator control 13.13-1704 described above, albeit differently located in FIGS. 13.13-24A-13.13-24B. In particular, the actuator control 13.13-1704 is positioned on a top portion of the display 13.13-102 or the facial interface 13.13-104. The actuator control 13.13-1704 includes a scroll wheel rotatable about an axis 13.13-2404. The scroll wheel of the actuator control 13.13-1704, when rotated about the axis 13.13-2404, causes the connection 13.13-2402 to adjust the distance between the display 13.13-102 relative to the facial interface 13.13-104.

Any of the features, components, and/or parts, including the arrangements and configurations thereof shown in FIGS. 13.13-9A-13.13-24B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.13-9A-13.13-24B.

As discussed above, a head-mountable device of the present disclosure can include connections (e.g., adjustment mechanisms) that can toggle from position to position via a sliding actuation. In accordance with one or more such examples, FIG. 13.13-25A shows a perspective view of the head-mountable device 13.13-1500 shown in FIGS. 13.13-15A and 13.13-15B. The head-mountable device 13.13-1500 includes connections 13.13-2502*a*, 13.13-2502*b* having an actuator control 13.13-1504. The actuator control 13.13-1504 includes a handle or lever that juts out from the head-mountable device 13.13-1500 for convenient user manipulation of the connections 13.13-2502*a*, 13.13-2502*b* (e.g., a sliding motion along the periphery of the head-mountable device 13.13-1500).

As shown, user interaction with the actuator control 13.13-1504 can move the connections 13.13-2502*a*, 13.13-

2502*b* in a manner that toggles the connections **13.13-2502*a*, 13.13-2502*b* between three discrete states (e.g., positions) including the first state 13.13-908, the second state 13.13-910, and the third state 13.13-912. The connections 13.13-2502*a*, 13.13-2502*b* are independently movable. In other implementations, however, the connections 13.13-2502*a*, 13.13-2502*b* are movably connected to each other. It will be appreciated that the connections 13.13-2502*a*, 13.13-2502*b* can move within the head-mountable device 13.13-1500 in myriad different ways. In particular examples, the connections 13.13-2502*a*, 13.13-2502*b*** follow a track having a constant radius.

As the connections **13.13-2502*a*, 13.13-2502*b* move, the display 13.13-102 correspondingly moves relative to the facial interface 13.13-104. The particular movement of the connections 13.13-2502*a*, 13.13-2502*b* causing the head-mountable device adjustment is described below in relation to FIGS. 13.13-25B-13.13-25D (depicting the connection 13.13-2502*a* in greater detail). In particular, FIG. 13.13-25B illustrates the connection 13.13-2502*a* including a stepped adjustment portion 13.13-2503 in a first state. In the first state, the facial interface 13.13-104 and the display 13.13-102 are positioned a distance 13.13-2504*a*** apart (e.g., about zero mm).

By contrast, FIG. 13.13-25C illustrates the connection **13.13-2502*a* moving left as indicated in the provided arrow. In doing so, the stepped adjustment portion 13.13-2503 correspondingly moves in a stepwise fashion, thereby creating increased separation between the display 13.13-102 and the facial interface 13.13-104 of a distance 13.13-2504*b* (e.g., about 3 mm) to a second positional state. Still further, FIGS. 13.13-1-13.13-25D illustrates the connection 13.13-2502*a* moving further left as indicated in the provided arrow. With this additional movement, the stepped adjustment portion 13.13-2503 moves another step to create more separation between the display 13.13-102 and the facial interface 13.13-104 of a distance 13.13-2504*c* (e.g., about 6 mm) to a third positional state. Thus, the geometry or structure of the stepped adjustment portion 13.13-2503 can provide a desired stepwise resolution between positional states by causing the display 13.13-102 to move away from (or towards) the facial interface 13.13-104**.

Any of the features, components, and/or parts, including the arrangements and configurations thereof shown in FIGS. 13.13-25A-13.13-25D can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.13-25A-13.13-25D.

As briefly mentioned above, multiple connections of a head-mountable device can be linked together as a single connection. The links between connections of a head-mountable device form a timing mechanism that causes the connections to move together uniformly. In accordance with one or more such examples, FIG. 13.13-26-27 illustrate respective perspective views of assemblies 13.13-2600-2700 for head-mountable devices.

In particular, FIG. 13.13-26 depicts the assembly 13.13-2600 for a head-mountable device with a connection 13.13-2602 that is movably adjustable via an actuator control 13.13-2604. The actuator control 13.13-2604 is positioned along a forehead region, but oriented downward (albeit myriad other orientations are herein contemplated). In response to actuation of the actuator control 13.13-2604, stepped adjustment portions 13.13-2606 each move in unison in a stepwise fashion (as similarly described above for the stepped adjustment portion 13.13-2503 in relation to FIGS. 13.13-25B-13.13-25D). Linkage arms 13.13-2608 movably connect portions of the connection 13.13-2602 to provide such a timing mechanism that transfers motion in a coordinated manner. While FIG. 13.13-26 illustrates stepped adjustment portions 13.13-2606, the adjustment portions can have additional steps or even a gradual incline surface that provides a finer adjustment capability.

In contrast to stepped adjustment portions, FIG. 13.13-27 depicts the assembly 13.13-2700 for a head-mountable device with a connection 13.13-2702 with toggle links. In particular, the connection 13.13-2702 is movably adjustable via the actuator control 13.13-2604. In response to actuation of the actuator control 13.13-2604, toggle links 13.13-2704 toggle between stowed and locked positions. When the toggle links 13.13-2704 move in unison, the display 13.13-102 correspondingly moves relative to the facial interface 13.13-104. Moreover, in this configuration, the connection 13.13-2702 moves in binary fashion between a first positional state and a second positional state. The linkage arms 13.13-2608 in FIG. 13.13-27 also movably connect portions of the connection 13.13-2702 to provide such a timing mechanism that transfers motion in a coordinated manner.

Any of the features, components, and/or parts, including the arrangements and configurations thereof shown in FIG. 13.13-26-27 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.13-26-27. The following figure descriptions for FIGS. 13.13-28-13.13-33 relate to example head-mountable devices, wearable apparatuses, or wearable electronic devices that can implement two degrees of freedom-namely angular tilt and linear translation toward and away from the user's face. In these examples, a linear slide can be implemented with certain structure to control actuation of the linear slide (whether in response to user adjustment or an applied force).

FIGS. 13.13-28-13.13-30 illustrate top, front, and side views, respectively, of a head-mountable device 13.13-2800 in accordance with one or more examples of the present disclosure. As shown, the head-mountable device 13.13-2800 can include a display frame 13.13-2802, a facial interface 13.13-2804, and connections **13.13-2806*a*-13.13-2806*d*. The display frame 13.13-2802 and associated display can be the same as, or similar to, the display frame 13.13-105 (and associated display 13.13-102) discussed above. The facial interface 13.13-2804 can be the same as, or similar to, the facial interface 13.13-104 discussed above. Likewise, the connections 13.13-2806*a*-13.13-2806*d* can be the same as or similar to the connection(s) 13.13-106** discussed above.

In particular, however, the head-mountable device 13.13-2800 can include actuators 13.13-2808, 13.13-2810. The actuators 13.13-2808, 13.13-2810 can include a variety of different actuators. In particular examples, the actuators 13.13-2808, 13.13-2810 include linear actuators of a linear adjustment system (e.g., that facilitate translational movement of the facial interface 13.13-2804 toward or away from the display frame 13.13-2802). For instance, the actuators

13.13-2808, 13.13-2810 can include linear slides and/or linear springs that can translate in and out to vary a distance (e.g., a depth distance, eye relief, etc.) between the facial interface 13.13-2804 and the display frame 13.13-2802. In particular, the actuators 13.13-2808 correspond to forehead actuators or top actuators, and the actuators 13.13-2810 correspond to zygoma actuators or side actuators. It will be appreciated that additional or alternative configurations of the actuators 13.13-2808, 13.13-2810 are herein contemplated. For instance, actuators can be positioned in the cheek (maxilla region) along a bottom portion of the head-mountable device 13.13-2800. Additional details regarding the actuators 13.13-2808, 13.13-2810 are described below in relation to FIGS. 13.13-31-13.13-33.

In some examples, the actuators 13.13-2808, 13.13-2810 are controlled or manipulated via at least one of actuator controls 13.13-2812*a*, 13.13-2812*b*. In these or other examples, the actuator controls 13.13-2812*a*, 13.13-2812*b* can include a variety of different types of controls, such as a lever, button, dial, rocker, slider, or toggle (as described above). The actuator controls 13.13-2812*a*, 13.13-2812*b* can be engaged via manual manipulation and/or via hands-free or automated methods (also mentioned above). The actuator controls 13.13-2812*a*, 13.13-2812*b* can be positioned in various locations on or within the head-mountable device 13.13-2800. In particular examples, the actuator controls 13.13-2812*a*, 13.13-2812*b* can be positioned adjacent to a maxilla region of a human face when the head-mountable device 13.13-2800 is donned. Other example positions for the actuator controls 13.13-2812*a*, 13.13-2812*b* can include the zygoma region, forehead region, on the arms (not shown), or within an interior portion of the optical space adjacent the display.

In these or other examples, the actuator controls 13.13-2812*a*, 13.13-2812*b* can control or manipulate the actuators in a variety of ways. In some examples, the actuator controls 13.13-2812*a*, 13.13-2812*b* are connected to flexible drive shafts 13.13-2814, 13.13-2816. In particular examples, the flexible drive shafts 13.13-2814, 13.13-2816 can transfer energy or movement from engagement (e.g., depression) of at least one of the actuator controls 13.13-2812*a*, 13.13-2812*b* to the actuators 13.13-2808, 13.13-2810 (or associated locks, as described below). Examples of the flexible drive shafts 13.13-2814, 13.13-2816 can include cables, tensioned wires, rods, dowels, etc. In some examples, the flexible drive shafts 13.13-2814, 13.13-2816 are positioned inside the display frame 13.13-2802 (hidden from exterior viewing). In other examples, the flexible drive shafts 13.13-2814, 13.13-2816 are positioned externally (e.g., on an outside surface of the display frame 13.13-2802).

In at least some examples, the flexible drive shafts 13.13-2814, 13.13-2816 can provide synchronized movement or parallel motion for each of the actuators 13.13-2808, 13.13-2810. For example, the flexible drive shafts 13.13-2814, 13.13-2816 can be connected to each other via a linkage 13.13-2818. Examples of the linkage 13.13-2818 include a gear system, a pulley system, a pivot connection, etc.

The flexible drive shafts 13.13-2814, 13.13-2816 can be motion-synchronized via the linkage 13.13-2818 to mitigate (or prevent) uneven translation between the actuators 13.13-2808, 13.13-2810. Further, in some examples, the linkage 13.13-2818 can allow a single input to one of the actuators 13.13-2808, 13.13-2810 to control both of the flexible drive shafts 13.13-2814, 13.13-2816. That is, in certain implementations, engagement of both of the actuator controls 13.13-2812*a*, 13.13-2812*b* is not required to actuate all of the actuators 13.13-2808, 13.13-2810 (and/or their corresponding locks, described below).

Any of the features, components, and/or parts, including the arrangements and configurations thereof shown in FIGS. 13.13-28-13.13-30 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.13-28-13.13-30. The following figure descriptions in relation to FIGS. 13.13-31-13.13-33 relate to specific examples of the actuators 13.13-2808, 13.13-2810 discussed above. Indeed, the actuators 13.13-2808, 13.13-2810 can include a linear adjustment connection between the display and the facial interface, where the linear adjustment connection includes a linear slide actuator with a locking mechanism.

FIGS. 13.13-31-13.13-33 respectively illustrate a perspective view of lock-slider disengagement, a front view of lock-slider disengagement, and a front view of lock-slider engagement of a portion of a linear adjustment connection 13.13-3100 in accordance with one or more examples of the present disclosure. In these or other examples, the linear adjustment connection 13.13-3100 includes an actuator 13.13-3102 (i.e., a linear slide), an actuator lock 13.13-3104 (otherwise referred to as a lock), and an actuator control (e.g., the actuator controls 13.13-2808, 13.13-2810 not shown). As will be discussed below, in response to an actuator control, the actuator lock 13.13-3104 can engage the actuator 13.13-3102 to hold the actuator 13.13-3102 in position, or else to release the actuator 13.13-3102 for desired adjustability.

As shown, the actuator 13.13-3102 can be designed to translate in a slide direction 13.13-3116 (e.g., to move the facial interface 13.13-2804 away from the display frame 13.13-2802). The actuator 13.13-3102 can also freely translate in a direction opposite the slide direction 13.13-3116 (e.g., to move the facial interface 13.13-2804 toward the display frame 13.13-2802) when the actuator lock 13.13-3104 is disengaged from the actuator 13.13-3102. To perform this function, the actuator 13.13-3102 can include certain structures. For example, the actuator 13.13-3102 can include teeth 13.13-3106 positioned on a top surface 13.13-3107. The teeth 13.13-3106 can extend upward from the top surface 13.13-3107 for a tooth height 13.13-3110. In some examples, the tooth height 13.13-3110 can be tuned based on various design factors. For example, the tooth height 13.13-3110 can affect a stack thickness of one or more portions of the display frame 13.13-2802. As another example, the tooth height 13.13-3110 can affect an ability of the actuator lock 13.13-3104 to deflect upwards in a direction 13.13-3122 (e.g., without damage to the actuator lock 13.13-3104). Thus, in some examples, the tooth height 13.13-3110 can be minimized or reduced.

As an additional example, the teeth 13.13-3106 can include a tooth pitch (e.g., an amount of teeth per inch defining a distance 13.13-3112 between teeth). Like the tooth height 13.13-3110, the tooth pitch can also be tuned based on various design factors. For example, a finer tooth pitch (e.g., a smaller distance 13.13-3112 or more teeth per inch) can be utilized as the tooth height 13.13-3110 is decreased. Additionally or alternatively, tooth pitch and/or the tooth height 13.13-3110 can be tuned for a desired amount of force at which back-drivability can occur (or to entirely prevent back-drivability according to some examples). In these or other examples, the term "back-drive" or "back-drag" refers to translation of the actuator 13.13-3102 in a direction opposite the slide direction 13.13-3116 (e.g., when the facial interface 13.13-2804 and the display frame 13.13-2802 move toward each other in response to an applied force from one of the display frame 13.13-2802 or the facial interface 13.13-2804).

In more detail, the teeth 13.13-3106 can include leading tips 13.13-3114. The leading tips 13.13-3114 can include a lead-in structure where teeth 13.13-3108 (and specifically leading tips 13.13-3118) of the actuator lock 13.13-3104 can begin to engage. The leading tips 13.13-3114, 13.13-3118 can include tapered portions or angled portions of the teeth 13.13-3106, 13.13-3108 that serve as ramps (e.g., to avoid dead-band or teeth misalignment/blunt collisions where the actuator lock 13.13-3104 is prevented from engaging the actuator 13.13-3102). That is, when transitioning from slider-lock disengagement (shown in FIG. 13.13-32) to slider-lock engagement (shown in FIG. 13.13-33), the leading tips 13.13-3114, 13.13-3118 allow the teeth 13.13-3108 of the actuator lock to smoothly slide into and seat between the teeth 13.13-3106 of the actuator 13.13-3102.

With respect to FIG. 13.13-32 specifically, the actuator lock 13.13-3104 can translate in a lock translation direction 13.13-3120 (e.g., perpendicular to the slide direction 13.13-3116). In particular, the actuator lock 13.13-3104 can translate in the lock translation direction 13.13-3120 in response to at least one of the actuator controls 13.13-2812*a*, 13.13-2812*b* being engaged (e.g., depressed) and the flexible drive shafts 13.13-2814, 13.13-2816 correspondingly engaging the actuator lock 13.13-3104. Thereafter, the actuator 13.13-3102 can be adjusted to translate the facial interface 13.13-2804 toward or away from the display frame 13.13-2802 (or associated display). Additionally, upon release of the actuator controls 13.13-2812*a*, 13.13-2812*b*, the actuator lock 13.13-3104 can move to an engaged position (shown in FIG. 13.13-33) in which the teeth 13.13-3106 and the teeth 13.13-3108 are engaged or otherwise positioned adjacent each other. In this position, the actuator 13.13-3102 is positionally locked in place to inhibit translation of the facial interface 13.13-2804 toward or away from the display frame 13.13-2802 (or associated display). As further shown in FIG. 13.13-33, the leading tips 13.13-3114 can extend beyond the teeth 13.13-3108, and the leading tips 13.13-3118 can extend beyond the teeth 13.13-3106.

When the teeth 13.13-3106, 13.13-3108 are engaged (as shown in FIG. 13.13-33), the actuator lock 13.13-3104 can be deflected upward in a lock deflection direction 13.13-3122. The lock deflection direction 13.13-3122 can be perpendicular to both the slide direction 13.13-3116 and the lock translation direction 13.13-3120. In these or other examples, the actuator lock 13.13-3104 can deflect in the lock deflection direction 13.13-3122 during a back-driving or back-dragging event in which the actuator 13.13-3102 moves opposite the slide direction 13.13-3116. To facilitate this back-driving or back-dragging, the actuator lock 13.13-3104 can act as a cantilever spring to deflect in the lock deflection direction 13.13-3122 in response to an applied force at the facial interface 13.13-2804 or the display frame 13.13-2802. In some examples, actuator lock 13.13-3104 can be tuned to deflect in response to a predetermined amount of force (e.g., about 5 Newtons to about 500 Newtons per actuator, about 10 Newtons to about 100 Newtons per actuator, or about 20 Newtons to about 40 Newtons per actuator). In these or other examples, various design factors for the actuator lock 13.13-3104, such as tooth angles or bending stiffness, can be adjusted to provide the desired force tuning.

Any of the features, components, and/or parts, including the arrangements and configurations thereof shown in FIGS. 13.13-31-13.13-33 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 13.13-31-13.13-33. The following description provides more detail regarding an example implementation of multiple linear adjustment connections connected to a flexible driveshaft (or multiple flexible drive shafts).

FIG. 13.13-34 illustrates a perspective view of a portion of a head-mountable device 13.13-3400 in accordance with one or more examples of the present disclosure. As shown, the head-mountable device 13.13-3400 includes multiple actuators (e.g., multiple linear adjustment connections 13.13-3100*a*-13.13-3100*d*) discussed above with respect to the linear adjustment connection 13.13-3100. As also mentioned, each linear adjustment connection 13.13-3100*a*-13.13-3100*d* can be actuated via the flexible drive shafts 13.13-2814, 13.13-2816. The flexible drive shafts 13.13-2814, 13.13-2816 can be motion-synchronized via the linkage 13.13-2818 to mitigate (or prevent) uneven translation between each linear adjustment connection 13.13-3100*a*-13.13-3100*d*. Further, in some examples, the linkage 13.13-2818 can allow a single input (e.g., a single button press) to actuate each of the linear adjustment connections 13.13-3100*a*-13.13-3100*d*. The following description of FIG. 13.13-34 gives an example implementation in which this can be performed.

As shown in FIG. 13.13-34, the head-mountable device 13.13-3400 can include actuator controls 13.13-3401*a*, 13.13-3401*b* (which can be the same as or similar to the actuator controls 13.13-2812*a*, 13.13-2812*b* discussed above). In response to a force 13.13-3402*a* applied to the actuator control 13.13-3401*a*, the lock 13.13-3104*a* can correspondingly deflect, translate, or otherwise move to release the slide 13.13-3102*a* of the linear adjustment connection 13.13-3100*a*. In addition, the flexible drive shaft 13.13-2816 can be attached to a joint 13.13-3404 (e.g., a ball joint) connected to the lock 13.13-3104*a*. As the lock 13.13-3104*a* deflects, translates, or otherwise moves in response to the applied force 13.13-3402*a*, the flexible drive shaft 13.13-2816 can be tensioned or pulled in a direction 13.13-3406.

The flexible drive shaft 13.13-2816 can be attached to a gear anchor 13.13-3410 such that, upon pulling of the flexible drive shaft 13.13-2816 in the direction 13.13-3406, a first gear 13.13-3409*a* connected to the gear anchor 13.13-3410 rotates in a direction 13.13-3412. In turn, the lock 13.13-3104*b* (which is movably attached to the first gear 13.13-3409) is pulled back away from the slide 13.13-3102*b* of the linear adjustment connection 13.13-3100*b* as the first gear 13.13-3409 rotates in the direction 13.13-3412.

Furthermore, rotation of the first gear 13.13-3409*a* in the direction 13.13-3412 can simultaneously induce rotation of the second gear 13.13-3409*b* in a direction 13.13-3414. The rotation of the second gear 13.13-3409*b* in the direction 13.13-3414 can cause the lock 13.13-3104*c* (which is movably attached to the second gear 13.13-3409*b*) to pull back away from the slide 13.13-3102*c* of the linear adjustment connection 13.13-3100*c*.

In addition, rotation of the second gear 13.13-3409*b* in the direction 13.13-3414 can cause a gear anchor 13.13-3416 connected to the second gear 13.13-3409*b* to push the flexible drive shaft 13.13-2814. Specifically, the flexible drive shaft 13.13-2814 can be connected to the gear anchor 13.13-3416 such that, upon rotation of the second gear 13.13-3409*b* in the direction 13.13-3414, the flexible drive shaft 13.13-2814 is pushed in a direction 13.13-3408. Pushing of the flexible drive shaft 13.13-2814 can cause the lock 13.13-3104*d* to release from the slide 13.13-3102*d* of the linear adjustment connection 13.13-3100*d*. For instance, the flexible drive shaft 13.13-2814 can be connected to the lock 13.13-3104*d* in a same or similar manner as the flexible drive shaft 13.13-2816 is attached to the lock 13.13-3104*a* to impart slide-lock disengagement.

Additionally or alternatively, it will be appreciated that a force 13.13-3402*b* can be applied to the actuator control 13.13-3401*b*, which is in mechanical communication with the lock 13.13-3104*d* (in a same or similar manner as the actuator control 13.13-3401*a* is mechanically coupled to the lock 13.13-3104*a*). Thus, dual inputs via both of the actuator controls 13.13-3401*a*, 13.13-3401*b* can be applied, but are not required, for synchronized actuation of each of the linear adjustment connections 13.13-3100*a*-13.13-3100*d*. Alternatively, the applied force 13.13-3402*b* alone (i.e., without the applied force 13.13-3402*a*) can be used to actuate each of the linear adjustment connections 13.13-3100*a*-13.13-3100*d*.

Further, in some examples, additional or alternative modes of actuating the linear adjustment connections 13.13-3100*a*-13.13-3100*d* can be implemented. For example, solenoids or small motors can be utilized to actuate linear adjustment connections 13.13-3100*a*-13.13-3100*d* (with or without the flexible drive shafts 13.13-2814, 13.13-2816). Similarly, in some examples, the actuator controls 13.13-3401*a*, 13.13-3401*b* can include alternative types of actuator controls. For example, the actuator controls 13.13-3401*a*, 13.13-3401*b* can be arch sliders that move in an arc path (e.g., along a display frame not shown of the head-mountable display 13.13-3400). The arch sliders can be connected to the flexible drive shafts 13.13-2814, 13.13-2816 as discussed above to actuate the linear adjustment connections 13.13-3100*a*-13.13-3100*d*.

Any of the features, components, and/or parts, including the arrangements and configurations thereof shown in FIG. 13.13-34 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 13.13-34.

13.14: Nosepiece

Head-mounted devices include head-mounted support structures that allow the devices to be worn on the heads of users. The head-mounted support structures may include device housings for housing components such as displays that are used for presenting a user with visual content. Head-mounted devices may also include a light-shielding nosepiece that rests on the nose of the user. The light-shielding nosepiece may include an elastomeric layer with perforations and fabric that covers the elastomeric layer. The elastomeric layer with the perforations may allow the light-shielding nosepiece to conform to the user's nose while the device is worn, while maintaining enough rigidity to be wrapped by a low force, high stretch textile or other low force, high stretch material. Additional structures, such as rigid structures or semi-rigid structures, may be included in the light-shielding nosepiece to provide additional support for the device while it is worn.

A schematic diagram of an illustrative system having an electronic device with a light-shielding nosepiece is shown in FIG. 13.14-1. As shown in FIG. 13.14-1, system 13.14-8 may include one or more electronic devices such as electronic device 13.14-10. The electronic devices of system 13.14-8 may include computers, cellular telephones, head-mounted devices, wristwatch devices, and other electronic devices. Configurations in which electronic device 13.14-10 is a head-mounted device are sometimes described herein as an example.

As shown in FIG. 13.14-1, electronic devices such as electronic device 13.14-10 may have control circuitry 13.14-12. Control circuitry 13.14-12 may include storage and processing circuitry for controlling the operation of device 13.14-10. Circuitry 13.14-12 may include storage such as hard disk drive storage, nonvolatile memory (e.g., electrically-programmable-read-only memory configured to form a solid-state drive), volatile memory (e.g., static or dynamic random-access-memory), etc.

Processing circuitry in control circuitry 13.14-12 may be based on one or more microprocessors, microcontrollers, digital signal processors, baseband processors, power management units, audio chips, graphics processing units, application specific integrated circuits, and other integrated circuits. Software code may be stored on storage in circuitry 13.14-12 and run on processing circuitry in circuitry 13.14-12 to implement control operations for device 13.14-10 (e.g., data gathering operations, operations involved in processing three-dimensional facial image data, operations involving the adjustment of components using control signals, etc.). Control circuitry 13.14-12 may include wired and wireless communications circuitry. For example, control circuitry 13.14-12 may include radio-frequency transceiver circuitry such as cellular telephone transceiver circuitry, wireless local area network (WiFi®) transceiver circuitry, millimeter wave transceiver circuitry, and/or other wireless communications circuitry.

During operation, the communications circuitry of the devices in system 13.14-8 (e.g., the communications circuitry of control circuitry 13.14-12 of device 13.14-10), may be used to support communication between the electronic devices. For example, one electronic device may transmit video and/or audio data to another electronic device in system 13.14-8. Electronic devices in system 13.14-8 may use wired and/or wireless communications circuitry to communicate through one or more communications networks (e.g., the internet, local area networks, etc.). The communications circuitry may be used to allow data to be received by device 13.14-10 from external equipment (e.g., a tethered computer, a portable device such as a handheld device or laptop computer, online computing equipment such as a remote server or other remote computing equipment, or other electrical equipment) and/or to provide data to external equipment.

Device 13.14-10 may include input-output devices 13.14-22. Input-output devices 13.14-22 may be used to allow a user to provide device 13.14-10 with user input. Input-output devices 13.14-22 may also be used to gather information on the environment in which device IO is operating.

Output components in devices 13.14-22 may allow device 13.14-10 to provide a user with output and may be used to communicate with external electrical equipment.

As shown in FIG. 1, input-output devices 13.14-22 may include one or more displays such as display 13.14-14. In some configurations, display 13.14-14 of device 13.14-10 includes left and right display panels (sometimes referred to as left and right portions of display 13.14-14 and/or left and right displays) that are in alignment with the user's left and right eyes and are viewable through left and right lens assemblies, respectively. In other configurations, display 13.14-14 includes a single display panel that extends across both eyes.

Display 13.14-14 may be used to display images. The visual content that is displayed on display 13.14-14 may be viewed by a user of device 13.14-10. Displays in device 13.14-10 such as display 13.14-14 may be organic light-emitting diode displays or other displays based on arrays of light-emitting diodes, liquid crystal displays, liquid-crystal-on-silicon displays, projectors or displays based on projecting light beams on a surface directly or indirectly through specialized optics (e.g., digital micromirror devices), electrophoretic displays, plasma displays, electrowetting displays, microLED displays, or any other suitable displays.

Display 13.14-14 may present computer-generated content such as virtual reality content and mixed reality content to a user. Virtual reality content may be displayed in the absence of real-world content. Mixed reality content, which may sometimes be referred to as augmented reality content, may include computer-generated images that are overlaid on real-world images. The real-world images may be captured by a camera (e.g., a forward-facing camera) and merged with overlaid computer-generated content or an optical coupling system may be used to allow computer-generated content to be overlaid on top of real-world images. As an example, a pair of mixed reality glasses or other augmented reality head-mounted display may include a display device that provides images to a user through a beam splitter, prism, holographic coupler, or other optical coupler. Configurations in which display 13.14-14 is used to display virtual reality content to a user through lenses are described herein as an example.

Input-output devices 13.14-22 may include sensors 13.14-16. Sensors 13.14-16 may include, for example, three-dimensional sensors (e.g., three-dimensional image sensors such as structured light sensors that emit beams of light and that use two-dimensional digital image sensors to gather image data for three-dimensional images from light spots that are produced when a target is illuminated by the beams of light, binocular three-dimensional image sensors that gather three-dimensional images using two or more cameras in a binocular imaging arrangement, three-dimensional LIDAR (light detection and ranging) sensors, three-dimensional radio-frequency sensors, or other sensors that gather three-dimensional image data), cameras (e.g., infrared and/or visible digital image sensors), gaze tracking sensors (e.g., a gaze tracking system based on an image sensor and, if desired, a light source that emits one or more beams of light that are tracked using the image sensor after reflecting from a user's eyes), touch sensors, buttons, force sensors, sensors such as contact sensors based on switches, gas sensors, pressure sensors, moisture sensors, magnetic sensors, audio sensors (microphones), ambient light sensors, microphones for gathering voice commands and other audio input, sensors that are configured to gather information on motion, position, and/or orientation (e.g., accelerometers, gyroscopes, compasses, and/or inertial measurement units that include all of these sensors or a subset of one or two of these sensors), fingerprint sensors and other biometric sensors, optical position sensors (optical encoders), and/or other position sensors such as linear position sensors, and/or other sensors.

User input and other information may be gathered using sensors and other input devices in input-output devices 13.14-22. If desired, input-output devices 13.14-22 may include other devices 13.14-24 such as haptic output devices (e.g., vibrating components), light-emitting diodes and other light sources, speakers such as ear speakers for producing audio output, and other electrical components. Device 13.14-10 may include circuits for receiving wireless power, circuits for transmitting power wirelessly to other devices, batteries and other energy storage devices (e.g., capacitors), joysticks, buttons, and/or other components.

Electronic device 13.14-10 may have housing structures (e.g., housing walls, straps, etc.), as shown by illustrative support structures 13.14-26 of FIG. 13.14-1. In configurations in which electronic device IO is a head-mounted device (e.g., a pair of glasses, goggles, a helmet, a hat, a headband, etc.), support structures 13.14-26 may include head-mounted support structures (e.g., a helmet housing, head straps, temples in a pair of eyeglasses, goggle housing structures, and/or other head-mounted structures). The head-mounted support structures may be configured to be worn on a head of a user during operation of device IO and may support display(s) 13.14-14, sensors 13.14-16, other components 13.14-24, other input-output devices 13.14-22, and control circuitry 13.14-12.

In some embodiments, support structures 13.14-26 may include a light-shielding nosepiece. The light-shielding nosepiece may be attached to support structures 13.14-26, such as a main housing portion of electronic device 13.14-10, and may rest on the user's nose while device 13.14-10 is worn. The light-shielding nosepiece may be flexible, to allow the nosepiece to conform to the user's nose, while retaining enough rigidity to support device 13.14-10 on the user's face while it is being worn (i.e., to maintain its shape on the user's nose while the device is worn) and to be wrapped by a fabric or other material. If desired, the light-shielding nosepiece may also include stiffeners or other components that help maintain the nosepiece on the user's nose to prevent light from reaching the user's eyes. An example of an illustrative electronic device having a nosepiece is shown in FIG. 13.14-2.

As shown in FIG. 13.14-2, head-mounted device 13.14-10 may include support structures 13.14-26, which may include a head-mounted housing (sometimes referred to as a main housing, main housing unit, head-mounted support structure, etc.). The housing may have walls or other structures that separate an interior housing region from an exterior region surrounding the housing. For example, the housing may have walls formed from polymer, glass, metal, and/or other materials. Electrical and optical components may be mounted in the housing. These components may include components such as integrated circuits, sensors, control circuitry, input-output devices, etc.

To present a user with images for viewing from eye boxes (e.g., eye boxes in which the user's eyes are located when device 13.14-10 is being worn on the user's head), device 13.14-10 may include displays and lenses. These components may be mounted in optical modules or other supporting structure in the housing to form respective left and right optical systems. There may be, for example, a left display for presenting an image through a left lens to a user's left eye in a left eye box and a right display for presenting an image through a right lens to a user's right eye in a right eye box.

If desired, the housing may have forward-facing components such as cameras and other sensors on a front side for gathering sensor measurements and other input and may have a soft cushion on an opposing rear side of the housing. The rear side of the housing may have openings that allow the user to view images (image light 13.14-32) from the left and right optical systems (e.g., when the rear side of the housing is resting on the user's head).

If desired, device 13.14-10 may have an adjustable strap or headband, and if desired, may have other structures (e.g., an over-the-head strap) to help hold the housing on the user's head.

As shown in FIG. 13.14-2, when worn by the user, device 13.14-10 may include a nosepiece, such as nosepiece 13.14-28 that rests on the nasal region the user's head (e.g., on the user's nose). In particular, nosepiece 13.14-28 (sometimes referred to as a light-shielding structure or a light-shielding nosepiece herein) may serve as an extension of the housing that rests on the user's nose and bridges between the opposing cheeks of the user. If desired, nosepiece 13.14-28 may be attached to the housing and/or may include one or more members formed from a portion of the housing. In some embodiments, nosepiece 13.14-28 may be a portion of a light seal or attached to a light seal that extends around some or all of a periphery of the housing (e.g., the light seal is attached to the housing around the periphery). When device 13.14-10 is in use, the light seal may compress against the user's face and prevent interference from ambient light. In general, however, nosepiece 13.14-28 may be attached to the housing in any desired manner.

Nosepiece 13.14-28 may be configured as a light-shielding structure and may therefore be sometimes referred to as light-shielding structure 13.14-28 or light-shielding nosepiece 13.14-28. As an example, it may be desirable to enhance the viewing experience of the user by blocking external environmental light from entering the interior of device 13.14-10 (e.g., from entering the eye boxes) when device 13.14-10 is worn by the user. Nosepiece 13.14-28 may conform to the facial topology of the user around the user's nose and block light from entering the eye boxes. In some illustrative configurations, nosepiece 13.14-28 may be adjustable to conform to varying facial topologies of different users (e.g., portions of nosepiece 13.14-28 may deform differently based on the nose shapes of the users).

Nosepiece 13.14-28 may be mounted to a housing portion of electronic device 13.14-10, such as head-mounted support structures 13.14-26, at mounting points 13.14-30. The housing may include a housing frame that runs along the periphery of device 13.14-10. If desired, the housing frame may be overlapped by a cushion member on the rear side of the housing facing the user. As an example, the cushion member may include foam structures or other soft compressible structures affixed to the housing frame. A fabric may overlap and extend over the housing frame and/or the cushion member on the rear side of the housing. If desired, the fabric may enclose only the cushion member, and the fabric-enclosed cushion member may be removably coupled to the housing frame.

Mounting points 13.14-30 may be located at a bottom portion of the housing frame (e.g., a bottom portion of support structures 13.14-26). As examples, mounting points 13.14-30 may include coupling mechanisms such as magnets, adhesive, hinges, or any other suitable coupling mechanisms.

In the example of FIG. 13.14-2, nosepiece 13.14-28 is attached to support structures 13.14-26 such that nosepiece 13.14-28 extends into a portion of support structures 13.14-26. This is merely illustrative. If desired, the housing frame, a cushion member, and/or fabric may split into multiple portions to surround nosepiece 13.14-28. As an example, a fabric-enclosed cushion member may run in front of nosepiece 13.14-28, and a housing frame may run behind nosepiece 13.14-28. In general, the housing portions, cushion member, and/or fabric may define an opening in which nosepiece 13.14-28 is disposed.

In some illustrative examples, nosepiece 13.14-28 may be removably coupled (via magnetics) to the housing frame or other portions of the housing. In some illustrative examples, a portion of nosepiece 13.14-28 may form an integral portion of the housing frame and/or may not be removable from the housing.

Support structures 13.14-26 (e.g., housing frames) and nosepiece 13.14-28 (along with other desired structures) may define the periphery of the eye boxes of device 13.14-10 at which the user's eyes are located. Components, such as displays, lenses, sensors, etc., may overlap and/or be located within the eye boxes of device 13.14-10, and may be enclosed by and/or mounted to support structures 13.14-26 and/or nosepiece 13.14-28. As illustratively shown in FIGS. 13.14-2, display 13.14-14 emit image light 13.14-32 through a lens to an eye box. Nosepiece 13.14-28 may be configured to block environmental light from an exterior of device 13.14-10 from entering the eye box and interfering with image light 13.14-24. An example of a nosepiece that may be used in device 13.14-10 is shown in FIG. 13.14-3.

As shown in FIG. 13.14-3, a nosepiece, such as nosepiece 13.14-28, may include elastomer 13.14-34 (also referred to as elastomeric layer 13.14-34 herein). Elastomer 13.14-34 may be any desired elastomeric material, such as thermoplastic polyurethane (TPU), nitrile butadiene rubber (NBR), or silicone (such as a low-durometer silicone). Elastomer 13.14-34 may have a thickness of greater than 0.1 mm, greater than 0.25 mm, greater than 0.5 mm, about 1 mm, less than 2 mm, less than 5 mm, etc.

In some embodiments, elastomer 13.14-34 may include perforations 13.14-36. Perforations 13.14-36 may allow elastomer 13.14-34 to bend to accommodate a user's nose (i.e., in the horizontal left and right directions of FIG. 13.14-3), while maintaining sufficient rigidity (i.e., in the vertical up and down directions of FIG. 13.14-3) to support device IO on the user's nose. The rigidity of elastomer 13.14-34 may also allow elastomer 13.14-34 to be wrapped by fabric 13.14-38 or other low force, high stretch material.

Perforations 13.14-36 may be formed in any desired pattern. In the example of FIG. 13.14-3, perforations 13.14-36 are formed as an array of perforations across the entire surface of elastomer 13.14-34. Perforations 13.14-36 may be formed in a brick pattern, as in FIG. 13.14-3, or may be formed in any other desired pattern. Additionally, any desired number of perforations 13.14-36 may be formed in elastomer 13.14-34, such as at least one perforation, at least 13.14-5 perforations, or any other desired number of perforations. Perforations 13.14-36 may extend entirely through elastomer 13.14-34, or may extend partially through elastomer 13.14-34.

Elastomer 13.14-34 may have a shape that generally conforms to a user's nose, such as a chevron shape, as shown in FIG. 13.14-3, or any other desired shape, such as a rounded shape, or a rectangular shape. Elastomer 13.14-34 may be covered by fabric 13.14-38. In particular, fabric 13.14-38 may overlap and/or encapsulate elastomer 13.14-

34 in region 13.14-40. Fabric region 13.14-40 may have the same shape as elastomer 13.14-34, as shown in FIG. 13.14-3, or may have a different shape than elastomer 13.14-34. Fabric members 13.14-40 and/or 13.14-38 may serve as a light-shielding member or layer for light-shielding structure 13.14-28. In particular, illustrative configurations in which fabric 13.14-40/38 is a fabric cover (sometimes referred to as a fabric cover layer or a cover layer) are described herein as an illustrative example. To serve light-shielding functions, the fabric cover may be formed from an opaque or light-shielding material (e.g., black yam) or may formed from an underlying material coated with an opaque or light-shielding material (e.g., black dye or ink). As examples, the fabric cover may be formed any suitable type of fabric such as knit fabric, woven fabric, braided fabric, etc.

Fabric 13.14-40 may be tented over elastomer 13.14-34. Tenting of the fabric cover over an underlying structure may be achieved by the underlying structure contacting or otherwise supporting the fabric cover at one or more points or areas of support as the fabric cover extends over one or more sides of the underlying structure. The tenting of the fabric cover over the underlying structure may cause the fabric cover to follow the general outline of the underlying structure, especially around the areas of support. If desired, differences in the outlines of the fabric cover and of the underlying structure may exist, especially in some regions away from the areas of support, thereby causing some portions of the fabric cover to be suspended in air and therefore readily deflectable. As an example, the fabric cover may be deflectable to the boundary of the underlying structure (or even beyond the boundary of the underlying structure if the boundary is defined by a flexible or deformable member).

The rigidity of elastomer 13.14-34, which is preserved in the vertical direction by perforations 13.14-36, may allow elastomer 13.14-34 to be wrapped by fabric 13.14-40 (or other low force, high stretch textile, or other low force, high stretch material) without deforming. In other words, elastomer 13.14-34 may be rigid enough to maintain its shape while fabric 13.14-40 is applied to/wrapped around elastomer 13.14-34 (as well as to maintain its shape when the device is worn by a user), but flexible enough that it can conform to a user's nose.

In such a way, the fabric cover may have a three-dimensional shape (based on an outline of the underlying structure) that includes portions (e.g., directly supported by the underlying structure) that are more defined and portions (e.g., not directly supported by the underlying structure, suspended in air, etc.) that are less defined, and more flexible or yielding. These less-defined portions (e.g., a yielding fabric surface) may help form flexible boundaries such as those for an opening configured to receive a user's nose.

As a particular illustrative example, the underlying structure may have surfaces that define an opening for accommodating a user's nose. The surfaces may be surrounded by peripheral edges. The fabric cover may be tented over the underlying structure such that the fabric cover is directly supported by the underlying structure along one or more of the peripheral edges of the underlying structure and may be suspended in air around the opening, thereby providing a fabric surface that is deflectable by the user's nose. This may help with improving user comfort as well as providing a more conformal fit when the light shielding structure rests on the user's nose.

Regardless of the shape of fabric region 13.14-40, fabric region 13.14-40 (and/or elastomer 13.14-34) may be bonded to support structures 13.14-26 (such as a housing frame) using adhesive 13.14-42. However, the use of adhesive 13.14-42 is merely illustrative. Fabric 13.14-40 and/or elastomer 13.14-34 may be formed integrally with support structures 13.14-26, or may be attached to support structures 13.14-26 using any desired attachment mechanism.

Although nosepiece 13.14-28 is shown as including both elastomer 13.14-34 and fabric 13.14-40, this is merely illustrative. If desired, nosepiece 13.14-28 may include elastomer 13.14-34 without an overlapping fabric layer. In this case, another layer, such as a polymer or rubber, may overlap elastomer 13.14-34, or elastomer 13.14-34 may directly contact a user's nose as they wear device 13.14-10. Alternatively, nosepiece 13.14-28 may include fabric 13.14-40 without elastomer 13.14-34, if desired. In this case, fabric 13.14-40 may be a flat knit fabric to provide sufficient stretching over a user's nose, while providing enough support for device 13.14-10.

Although fabric 13.14-38/40 is described as fabric, this is merely illustrative. In general, fabric 13.14-38/40 may be any low force, high stretch material, such as a low force, high stretch textile.

In some embodiments, although elastomer 13.14-34 may have rigidity to support device 13.14-10 on a user's nose (i.e., in the vertical direction of FIG. 13.14-3) and to be wrapped by fabric, it may be desirable to add additional rigid or semi-rigid structures to a nosepiece. An illustrative example of a nosepiece having a rigid structure is shown in FIG. 13.14-4.

As shown in FIG. 13.14-4, nosepiece 13.14-28 may include fabric 13.14-40 (which may cover an elastomeric layer, such as elastomer 13.14-34) and adhesive 13.14-42, which in turn may attach fabric 13.14-40 to structural frame 13.14-43. Structural frame 13.14-43 may be a plastic frame, as an example. Structural frame 13.14-43 may provide additional rigidity to ensure that nosepiece 13.14-28 retains its shape and support when worn by a user.

Although FIG. 13.14-4 shows the use of adhesive 13.14-42, this is merely illustrative. Adhesive 13.14-42 may be omitted, if desired. In some examples, elastomer 13.14-34 may be co-molded to structural frame 13.14-43. Alternatively, elastomer 13.14-34 may be fit into a recessed portion of structural frame 13.14-43 or otherwise attached to structural frame 13.14-43.

Additionally, although FIG. 13.14-4 shows structural frame 13.14-43 on three sides of fabric 13.14-40/elastomer 13.14-34, this is merely illustrative. Structural frame 13.14-43 may be attached to one side (e.g., the bottom side) of fabric 13.14-40/elastomer 13.14-34 or any other desired number of sides. Regardless of the attachment of structural frame 13.14-43 to elastomer 13.14-34 and/or fabric 13.14-40, fabric 13.14-40 may extend over all or some of both frame 13.14-43 and/or elastomer 13.14-34. An example of a stack up of nosepiece 13.14-28 is shown in FIG. 13.14-5.

As shown in FIG. 13.14-5, nosepiece 13.14-28 may include fabric 13.14-40, which is shown as having fabric portions 13.14-40-1 and 13.14-40-2, on either side of elastomer 13.14-34. If desired, fabric 13.14-40 may be bonded to elastomer 13.14-34 at a periphery of elastomer 13.14-34, which is shown in FIG. 13.14-5 as points 13.14-44. For example, fabric 13.14-40 may be bonded to elastomer 13.14-34 around a periphery (such as an entire periphery or a portion of the periphery) of the elastomer layer. Fabric 13.14-40 may be bonded to elastomer 13.14-34 using an adhesive or other desired mounting mechanism. In some cases, it may be desirable to allow elastomer 13.14-34 to move to a greater extent, and therefore leave elastomer 13.14-34 unbonded from fabric 13.14-40. For example, elastomer 13.14-34 may be fully surrounded fabric 13.14-40 and float within the fabric. In some embodiments portions of fabric 13.14-40 may be bonded directly to each other, rather than to elastomer 13.14-34. In this way, elastomer 13.14-34 may float within fabric 13.14-40, which may allow 13.14-34 to move more freely.

Because nosepiece 13.14-28 is designed to block light from reaching the eye boxes of a user wearing device 13.14-10, it may be desirable to ensure a tight fit between nosepiece 13.14-28 and the user's nose and a similarly tight fit between nosepiece 13.14-28 and device 13.14-10. An example of an extension piece that may allow for nosepiece 13.14-28 to fit tightly with device 13.14-10 is shown in FIG. 13.14-6.

As shown in FIG. 13.14-6, extension piece 13.14-46 may be added below nosepiece 13.14-28. In particular, if a user's nose bridge protrudes only a small amount, nosepiece 13.14-28 may not reach the user's nose. Therefore, extension piece 13.14-46 may be attached between support structures of device 13.14-10, such as support structures 13.14-26, and nosepiece 13.14-28. Extension piece 13.14-28 may be formed from fabric, foam, plastic, and/or any other desired material. In some cases, extension piece 13.14-28 may allow nosepiece 13.14-28 to align with other light-blocking structures in device 13.14-10, such as a foam member that fits against the user's face. In this way, light may be prevented from reaching the user's eye boxes and interfering with the user's visibility of a display in device 13.14-10.

In addition or as an alternative to extension piece 13.14-46, it may be desirable to ensure a close fit to a user's nose to prevent light from entering the user's eye boxes. Examples of nosepieces that have additional structures to improve the fit to a user's nose are shown in FIGS. 13.14-7 and 13.14-8.

As shown in FIG. 13.14-7, service loop 13.14-49 may be included within nosepiece 13.14-28. In particular, service loop 13.14-49 (and other portions of nosepiece 13.14-28, if desired) may be attached to supports 13.14-50-1 and 13.14-50-2. Service loop 13.14-49 may be tightened and loosened as desired to conform nosepiece 13.14-28 to the nose of a user. For example, as shown in FIG. 13.14-7, service loop 13.14-49 may be tightened to move nosepiece 13.14-28 to position 13.14-28' by moving nosepiece 13.14-28 downward in direction 13.14-56, right in direction 13.14-52, and left in direction 13.14-54 toward to the nose of the user. In this way, service loop 13.14-49 may allow nosepiece 13.14-28 to fit more securely to the user's nose, preventing light from entering the user's eye boxes through gaps between nosepiece 13.14-28 and the nose.

Alternatively or additionally, nosepiece 13.14-28 may include foam 13.14-48. Foam 13.14-48 may fill a gap between nosepiece 13.14-28 and the user's nose, and may be compressible to allow for a secure fit between nosepiece 13.14-28 and the nose. Foam 13.14-48 may directly contact the nose of the user (e.g., may be on a surface of a fabric layer, such as fabric 13.14-40), as shown in FIG. 13.14-7, may be embedded within nosepiece 13.14-28 (e.g., covered by fabric, such as fabric 13.14-40), or may otherwise be attached to nosepiece 13.14-28.

Instead of service loop 13.14-49, a deformable stiffener, such as deformable stiffener 13.14-58, may be incorporated into nosepiece 13.14-28. As shown in FIG. 13.14-8, deformable stiffener 13.14-58 may allow for nosepiece 13.14-28 to be adjusted in directions 13.14-52, 13.14-54, and 13.14-56 toward the nose of the user to conform nosepiece 13.14-28 to the user's nose at position 13.14-28'. Deformable stiffener 13.14-58 may be formed within nosepiece 13.14-28 (i.e., may be covered by fabric), as shown in FIG. 13.14-8, or may be formed on a surface of the fabric (e.g., an inner or outer surface of fabric 13.14-40). Although not shown in FIG. 13.14-8, a gap-filling foam, such as foam 13.14-48 of FIG. 13.14-7, may be incorporated in or on nosepiece 13.14-28 in addition to deformable stiffener 13.14-58.

In some embodiments, to ensure that nosepiece 13.14-28 is tightly sealed to the nose of a user, internal components of device 13.14-10, such as fans, may be used to move air toward nosepiece 13.14-28, thereby sealing nosepiece 13.14-28 around the user's nose.

In addition to improving the fit of nosepiece 13.14-28 to prevent light from entering the eye boxes of the user, it may also be desirable to incorporate layers into nosepiece 13.14-28 that improve the comfort for the user. Examples of various modifications that may be made to nosepiece 13.14-28 to improve user comfort are shown in FIGS. 13.14-9A-13.14-9G.

As shown in FIG. 13.14-9A, a nosepiece, which includes elastomer 13.14-34 and fabric 13.14-40 (such as nosepiece 13.14-28) may have a rolled edge and may approach the user's nose at a shallow angle of contact to conform to a curved portion of nose 13.14-60. The rolled edge may prevent elastomer 13.14-34 from digging into the user's skin on nose 13.14-60, while the shallower angle of contact may allow the nosepiece to move up the user's nose rather than hitting the user's nose directly. Therefore, by having a rolled edge and/or a shallower angle of contact, nosepiece 13.14-28 may improve comfort for a user of device 13.14-10.

Alternatively or additionally, a nosepiece may include foam, such as foam 13.14-62, between some or all of elastomer 13.14-34 and fabric 13.14-40, as shown in FIG. 13.14-9B. In particular, foam 13.14-62 may be at an edge portion of the nosepiece that contacts the user's nose, and therefore prevent elastomer 13.14-34 from hurting the user's nose or reducing discomfort as the nosepiece pushes against the nose.

In some examples, it may be desirable to have a series of openings in elastomer 13.14-34 that are either unfilled or filled with different material, such as foam. For example, in FIG. 13.14-9C, openings 13.14-64 may be provided in a portion of the nosepiece that will contact the user's nose. Openings 13.14-64 may be through openings, partial openings, may be filled with other material, such as foam, or may otherwise be more flexible than the surrounding regions of elastomer 13.14-34. As the nosepiece pushes against the user's nose, openings 13.14-64 may crumple, thereby preventing or reducing discomfort to the user.

If desired, a portion of fabric may be extended from the portion that contacts the user's nose to provide an additional buffer between the nose and elastomer 13.14-34. As shown in FIG. 13.14-9D, fabric portion 13.14-66 may extend from fabric 13.14-40. When worn by a user, fabric portion 13.14-66 may contact the nose of the user first, and therefore increase the amount of fabric between the nose and elastomer 13.14-34, which may improve user comfort. In some examples, fabric portion 13.14-66 may be a hemmed edge of fabric 13.14-40.

If desired, at least some portions of elastomer 13.14-34 that would otherwise contact the user's nose may be cut and replaced by more flexible material, such as foam. As shown in FIG. 13.14-9E, foam portions 13.14-68 may replace portions of elastomer 13.14-34 that would otherwise contact the user's nose. Although fabric 13.14-40 does not cover foam portions 13.14-68 in FIG. 13.14-9E, fabric 13.14-40 may overlap foam portions 13.14-68, if desired.

In addition to, or instead of, the modifications of FIGS. 13.14-9A-13.14-9E, in which an edge portion of a nosepiece is modified to prevent the elastomer from providing discomfort to a user's nose, a bottom portion of the nosepiece may be modified. As shown in FIG. 13.14-9F, segmented material 13.14-69 may be added to a bottom surface of nosepiece 13.14-28. For example, segmented material 13.14-69 may contact the top of the user's nose (i.e., the nose bridge), and prevent nosepiece 13.14-28 from directly contacting the nose and causing discomfort. Material 13.14-69 may be foam or may be elastomer flaps.

Although FIG. 13.14-9F shows material 13.14-69 as being segmented and non-overlapping, material 13.14-69 may be segmented and overlapping, or may be one connected piece of material, if desired. For example, in FIG. 13.14-9G, foam 13.14-73 may be provided between nosepiece 13.14-28 and the user's nose while device 13.14-10 is worn. If desired, optional deformable stiffener 13.14-71 may be provided on the bottom surface of nosepiece 13.14-28 to improve the fit of nosepiece 13.14-28 on the user's nose. If stiffener 13.14-71 is included, foam 13.14-73 may also prevent stiffener 13.14-71 from directly contacting the user's nose and providing discomfort.

All of the examples in FIGS. 13.14-9A-13.14-9F are merely illustrative examples of improving user comfort while ensuring that a nosepiece fits tightly to the user's nose. The examples are not limiting and may be implemented individually or together in any combination. Regardless of whether any structures in FIGS. 13.14-9A-13.14-9F are used, it may be desirable to strengthen a portion of nosepiece 13.14-28. Although the use of a structural frame was described in connection with FIG. 13.14-4, such a frame may add unnecessary bulk or add too much rigidity to nosepiece 13.14-28 in some cases. Therefore, a semi-rigid member may be used. An example of using a semi-rigid member on a nosepiece is shown in FIG. 13.14-10.

As shown in FIG. 13.14-10, a nosepiece, such as nosepiece 13.14-28, may include portions 13.14-70 and 13.14-72. Portion 13.14-70 may include an elastomer, such as elastomer 13.14-34, and/or a fabric, such as fabric portion 13.14-72 may be coupled to portion 13.14-70 and may include a semi-rigid member. In particular, the semi-rigid member may be formed on a bottom portion of nosepiece 13.14-28 (i.e., toward the bottom of the user's nose when device 13.14-10 is worn), and may provide additional rigidity to nosepiece 13.14-28. The semi-rigid members may be formed from any desired material, such as rubber or plastic. In this way, nosepiece 13.14-28 may remain sufficiently flexible to conform to the shape of a user's nose, while retaining its shape when after it has been conformed to the shape of the nose and the device is being worn by the user.

The foregoing is merely illustrative and various modifications can be made to the described embodiments. The foregoing embodiments may be implemented individually or in any combination.

13.15: Removable Facial Interface

According to some aspects of the present disclosure, a head-mountable device (HMD) can include a display; a facial interface frame at least partially surrounding the display; a removable facial interface attached to the facial interface frame; a first attachment mechanism attached to one of the facial interface frame or the removable facial interface; and a second attachment mechanism attached to the other of the facial interface frame or the removable facial interface. In some examples, the removable facial interface can be attached to the facial interface frame by the first attachment mechanism and the second attachment mechanism.

In some examples, the first attachment mechanism and the second attachment mechanism can include magnets. In some examples, the first attachment mechanism can include a spherical magnetic receptacle. The second attachment mechanism can include a spherical magnet. In some examples, the first attachment mechanism can include a capsule-dished magnetic receptacle. The second attachment mechanism can include a spherical magnet. In some examples, the first attachment mechanism can include a magnetic post. The second attachment mechanism can include a magnetic protrusion. The first attachment mechanism can be configured to slidably engage and disengage the second attachment mechanism.

In some examples, the first attachment mechanism and the second attachment mechanism can include hook-and-loop fasteners. In some examples, the first attachment mechanism can include a post and a flange on the post. The second attachment mechanism can include a spring-snap feature. The spring-snap feature can include an opening; a detent adjacent the opening; and a spring attached to the detent.

In some examples, the first attachment mechanism can include a receptacle and a first magnet in the receptacle. The second attachment mechanism can include a protrusion and a second magnet in the protrusion. The protrusion can have a first shape complementary to a second shape of the receptacle.

In some examples, the first attachment mechanism and the second attachment mechanism can include interlocking elastic fasteners. In some examples, the first attachment mechanism can include a suction cup. The second attachment mechanism can include a curved surface shaped to interface with the suction cup.

In some examples, the removable facial interface can be C-shaped. The facial interface frame can include a C-shaped base complementary to the removable facial interface.

In some examples, the removable facial interface can include a fabric material encircling one of the first attachment mechanism or the second attachment mechanism. The facial interface frame can include a compressible material encircling the other of the first attachment mechanism or the second attachment mechanism. The first attachment mechanism can be directly attached to the second attachment mechanism.

According to some aspects, a wearable electronic device can include a display; a facial interface frame physically coupled to the display; and a removable facial interface removably attached to the connector of the facial interface frame by a first attachment mechanism. The facial interface frame may include a frame partially surrounding the display; a connector attached to the frame; and a base attached to the connector. The connector may extend through the base.

In some examples, the first attachment mechanism can include a magnetic attachment mechanism. The magnetic attachment mechanism can include a post on one of the connector or the removable facial interface, and a receptacle on the other of connector or the removable facial interface.

In some examples, the first attachment mechanism can include a hook-and-loop attachment mechanism. The hook-and-loop attachment mechanism can include a post on one of the connector or the removable facial interface and a receptacle on the other of connector or the removable facial interface.

In some examples, the wearable electronic device can further include a compressible member attached to the base.

The compressible member can encircle the connector and the connector can be exposed through the compressible member.

According to some aspects, a light seal for a head-mountable device can include a facial interface frame. The light seal can include a base; a compressible portion; and a magnet attached to the base.

In some examples, the light seal can further include a hook-and-loop fastener attached to the base. In some examples, the light seal can further include an interlocking fastener attached to the base. In some examples, the light seal can further include a receptacle attached to the base.

The following disclosure relates to wearable electronic devices (e.g., head-mountable devices (HMDs)), including those that include a removable facial interface. Prolonged use of a head-mountable device can cause components of the head-mountable device to wear and to become dirty. In particular, components of the head-mountable device that contact a user's face are subject to wear and becoming dirty due to the contact with the user's face. It can be desirable to clean the portions of the head-mountable device that contact the user's face in order to remove oils, sweat, and the like. However, the head-mountable device can include sensitive components, small components, and oddly shaped components that are difficult to clean in-situ. Further, it can be desirable to replace portions of the head-mountable device that contact the user's face when those portions become worn out, in order to obtain a more comfortable fit for specific users, based on other user preferences, or the like.

A head-mountable device of the present disclosure includes a removable facial interface. As will be discussed in detail below, the removable facial interface can be attached to a facial interface frame through various attachment mechanisms, such as magnets, interlocking features, sliding features, hook-and-loop features (e.g., Velcro), spring snaps, suction features, bi-stable features, stretch features, re-usable adhesives, mating posts, combinations thereof, or the like. The removable facial interface can be easily removed from the facial interface frame, and can be re-installed on the facial interface frame in order to allow for the removable facial interface to be cleaned, replaced, or the like. Allowing the removable facial interface to be removed and cleaned increases the longevity of the removable facial interface. Replacing the removable facial interface improves the longevity of the head-mountable device, reduces user costs, provides users with choices of removable facial interfaces based on fit and personal preferences, and provides additional benefits.

These and other examples are discussed below with reference to FIG. 13.15-1A through 13.15-15C. However, those skilled in the art will readily appreciate that the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 13.15-1A illustrates a block diagram of a head-mountable device (HMD) 13.15-100 including a display 13.15-106, a frame 13.15-104, a device seal 13.15-116, and a retention band 13.15-118. The display 13.15-106 can include one or more optical lenses or display screens that are configured to be positioned in front of the eyes of a user. The display 13.15-106 can be configured to present an augmented reality visualization, a virtual reality visualization, or another suitable visualization to the user. The display 13.15-106 can be positioned at least partially in or on the frame 13.15-104. The frame 13.15-104 can be a housing of the display 13.15-106. The device seal 13.15-116 can be physically coupled to the frame 13.15-104. The retention band 13.15-118 can be physically coupled to the device seal 13.15-116 and/or the frame 13.15-104 and can be used to secure the HMD 13.15-100 on the head of the user. In some examples, the device seal 13.15-116 includes the frame 13.15-104 (e.g., the frame 13.15-104 is part of the device seal 13.15-116).

The device seal 13.15-116 includes a facial interface frame 13.15-112, a removable facial interface 13.15-110, a cover 13.15-114, and electrical components (e.g., sensors 13.15-120). The device seal 13.15-116 can also be referred to as a light seal. In some examples, the device seal 13.15-116 can refer to a portion of the HMD 13.15-100 that engages or shields a user's face. The device seal 13.15-116 can include portions of the HMD 13.15-100 that conform to, contact, or press against regions of the user's face (e.g., the facial interface frame 13.15-112 and the removable facial interface 13.15-110).

The removable facial interface 13.15-110 refers to a portion of the HMD 13.15-100 that directly contacts a user's face. The facial interface frame 13.15-112 refers to a portion of the HMD 13.15-100 to which the removable facial interface 13.15-110 is attached, and which is physically coupled between the removable facial interface 13.15-110 and the frame 13.15-104. The removable facial interface 13.15-110 and/or the facial interface frame 13.15-112 can also be referred to as a face track. The removable facial interface 13.15-110 and the facial interface frame 13.15-112 can conform to (e.g., compress against and assume the shape of) regions of the user's face. In some examples, the removable facial interface 13.15-110 and the facial interface frame 13.15-112 include pliant (or semi-pliant) materials that span the forehead, wrap partially around the eyes, and contact the zygoma and maxilla regions of the user's face.

In some examples, the facial interface frame 13.15-112 can be formed of a relatively stiff or rigid material, while the removable facial interface 13.15-110 can be formed of a relatively soft, deformable, elastic material. In some examples, the facial interface frame 13.15-112 can be formed from plastics, metals, polymers, combinations thereof, or the like. The removable facial interface 13.15-110 can be formed from plastics, metals, polymers, fabrics, foams, rubbers, silicone, elastomers, hydrogels, combinations thereof, or the like. In some examples, the removable facial interface 13.15-110 can include a stiffener, which can be formed from metals, plastics, polymers, combinations thereof, or the like. The removable facial interface 13.15-110 can include a pliable material surrounding the stiffener, which can be formed from rubbers, foams, polymers, silicone, elastomers, hydrogen gels, combinations thereof, or the like. The pliable material can be formed around the stiffener through overmolding or the like. The removable facial interface 13.15-110 can further include a fabric material surrounding the pliable material. The fabric material can be wrapped around the pliable material. The stiffener can provide the removable facial interface 13.15-110 with a desired degree of stiffness. The pliable material can be pliant or semi-pliant and can be provided to increase user comfort. The fabric material can be configured to contact a user's skin and can also be provided to increase user comfort.

The removable facial interface 13.15-110 can be attached to the facial interface frame 13.15-112 through various attachment mechanisms. For example, the attachment mechanisms can include magnets, interlocking features, sliding features, hook-and-loop features (e.g., Velcro), spring snaps, suction features, bi-stable features, stretch features, re-usable adhesives, mating posts, combinations thereof, or the like. The attachment mechanisms can be provided on both the removable facial interface 13.15-110 and the facial interface frame 13.15-112. For example, a male attachment mechanism can be provided on the removable facial interface 13.15-110 and a female attachment mechanism can be provided on the facial interface frame 13.15-112, or vice versa. The attachment mechanisms can be self-aligning or can entail alignment by a user. The attachment mechanisms can be configured such that the removable facial interface 13.15-110 is removed from, and attached to, the facial interface frame 13.15-112 in one-handed operations. Each of the respective attachment mechanisms can datum the removable facial interface 13.15-110 to the facial interface frame 13.15-112, or allow the removable facial interface 13.15-110 to float or move relative to the facial interface frame 13.15-112. The respective attachment mechanisms can have variable shapes and/or sizes around the perimeters of the removable facial interface 13.15-110 and the facial interface frame 13.15-112, which can improve the ability to interchange various removable facial interfaces 13.15-110 and facial interface frames 13.15-112. More specifically, the variable shapes and/or sizes of the attachment mechanisms around the perimeters of the removable facial interface 13.15-110 and the facial interface frame 13.15-112 can allow for different shaped removable facial interfaces 13.15-110 and facial interface frames 13.15-112 to be connected together.

Providing the removable facial interface 13.15-110 and the facial interface frame 13.15-112 allows for the removable facial interface 13.15-110 to be easily removed and cleaned. The removable facial interface 13.15-110 can be replaced based on wear, user preferences, or the like. For example, specific removable facial interfaces 13.15-110 can be provided based on different facial structures of various users. Removable facial interfaces 13.15-110 can be provided based on different intended user uses, such as a specific removable facial interface 13.15-110 designed for sport use. Providing the removable facial interface 13.15-110 allows for a portion of the HMD 13.15-100 that is subject to the greatest amount of wear to be cheaply and easily replaced.

The cover 13.15-114 can include a seal, such as an environment seal, a dust seal, an air seal, a light seal, or the like. The cover 13.15-114 can be positioned in a gap between the display 13.15-106 and the user's face. The cover 13.15-114 can form an eye-box through which the user can view the display 13.15-106. It will be appreciated that the term "seal" can include partial seals or inhibitors, in addition to complete seals. For example, a seal can be a partial light seal, where some ambient light is blocked. In some examples, a seal can be a complete light seal where all ambient light is blocked when the HMD 13.15-100.

The cover 13.15-114 can be a woven fabric that is non-rigid or deformable. The cover 13.15-114 can be elastically deformable. In some examples, the cover 13.15-114 can be formed from a plastic, a rubber, a polymer material, or the like. The cover 13.15-114 can be a cosmetic textile material with stretch and can feature an open mesh pattern. In some examples, the cover 13.15-114 can be rigid. Providing the removable facial interface 13.15-110 separate from the cover 13.15-114 allows for the cover 13.15-114 and a material covering the removable facial interface 13.15-110 to be formed from different materials, such as the cover 13.15-114 being formed from a cosmetic material and the removable facial interface 13.15-110 being formed from a comfortable material. In some examples, the cover 13.15-114 and the covering of the removable facial interface 13.15-110 can be formed from the same materials.

The device seal 13.15-116 can be removably attached to the frame 13.15-104. The device seal 13.15-116 can be electrically coupled to the display 13.15-106. The device seal 13.15-116 can include various electrical components, such as the sensors 13.15-120. The sensors 13.15-120 can include various sensors, such as sensors that collect user data, or environmental data. In some examples, the sensors 13.15-120 can collect biometric information. The sensors 13.15-120 can transmit signals to other components of the HMD 13.15-100, such as the display 13.15-106. The sensors 13.15-120 can transmit signals to various outputs, such as an output configured to perform an action in response to information collected by the sensors 13.15-120.

FIG. 13.15-1B illustrates a top view of an HMD 13.15-100. The HMD 13.15-100 of FIG. 13.15-1B can be substantially similar to, including some or all of the features of, the HMD 13.15-100 described with respect to FIG. 13.15-1A. The HMD 13.15-100 includes a display (also referred to as a display unit) 13.15-106 and a retention band 13.15-118. In some examples, the display 13.15-106 includes an opaque, translucent, transparent, or semi-transparent screen, including any number lenses, for presenting visual data to a user. The display 13.15-106 can include any number of internal electronic components 13.15-108. The HMD 13.15-100 can be mounted on a user's head 13.15-102 using the retention band 13.15-118.

The HMD 13.15-100 further includes a frame 13.15-104 (also referred to as a housing), a facial interface frame 13.15-112, a removable facial interface 13.15-110, and a cover 13.15-114. The frame 13.15-104 can be physically coupled to the display 13.15-106. The frame 13.15-104 can at least partially border one or more edges of the display 13.15-106. One end of the cover 13.15-114 can be attached to the frame 13.15-104 and an opposite end of the cover 13.15-114 can be attached to the facial interface frame 13.15-112. The facial interface frame 13.15-112 and the removable facial interface 13.15-110 provide an interface between a user's head 13.15-102 and the frame 13.15-104. The combination of the frame 13.15-104, the facial interface frame 13.15-112, the removable facial interface 13.15-110, and the cover 13.15-114 can form a device seal 13.15-116. It will be understood, however, that the device seal 13.15-116 can include fewer or additional components from those listed or shown.

The HMD 13.15-100 can be worn on the user's head 13.15-102 such that the display 13.15-106 is positioned on the user's face and disposed in front of one or both of the user's eyes. The display 13.15-106 can be physically coupled to the retention band 13.15-118 and/or the device seal 13.15-116. In some examples, the retention band 13.15-118 can be positioned against sides of the user's head 13.15-102 and in contact therewith. In some examples, the retention band 13.15-118 can be at least partially positioned above the user's ear or ears. In some examples, the retention band 13.15-118 can be positioned adjacent to the user's ear or ears. The retention band 13.15-118 can extend around the user's head 13.15-102. In this way, the display 13.15-106 and the retention band 13.15-118 can form a loop configured to retain the HMD 13.15-100 on the user's head 13.15-102. It should be understood, however, that this configuration is just one example of how the components of the HMD 13.15-100 can be arranged. In some examples, a different number of connector straps and/or retention bands can be included. Although the HMD 13.15-100 is referred to as an HMD, it should be understood that the terms wearable device, wearable electronic device, HMD device, and/or HMD system can be used to refer to any wearable device, including smart glasses.

In some examples, the frame 13.15-104 is physically coupled to the facial interface frame 13.15-112. The removable facial interface 13.15-110 is removably attached to the facial interface frame 13.15-112. The removable facial interface 13.15-110 can contact the user's head 13.15-102, such as a user's face. In some examples, the cover 13.15-114 can be a light blocking component that extends between the frame 13.15-104 and the removable facial interface 13.15-110, such as along portions of the facial interface frame 13.15-112. The cover 13.15-114 can cover or surround a perimeter of the frame 13.15-104 and/or the facial interface frame 13.15-112.

The cover 13.15-114 can be formed from a cloth, fabric, woven material, plastic, rubber, or any other suitable opaque or semi-opaque material. In some examples, the cover 13.15-114 is flexible, having the ability to repeatedly stretch, compress, and deform. The cover 13.15-114 can be elastically or in-elastically deformable. The facial interface frame 13.15-112, the cover 13.15-114, and the removable facial interface 13.15-110 can be configured to block outside light and limit the peripheral view of the user. In some examples, the cover 13.15-114 and the facial interface frame 13.15-112 are part of the same or a unitary component.

Any of the features, components, and/or parts, including the arrangements and configurations thereof shown in FIGS. 13.15-1A and 13.15-1B can be included, either alone or in any combination, in any of the other examples of devices, features, components, and parts shown in the other figures, including in any of FIGS. 13.15-1A and 13.15-1B, described herein. Likewise, any of the features, components, and/or parts, including the arrangements and configurations thereof shown and described with reference to the other figures can be included, either alone or in any combination, in the example of the devices, features, components, and parts shown in FIGS. 13.15-1A and 13.15-1B.

FIGS. 13.15-2A illustrates a perspective view of a device seal 13.15-200. The device seal 13.15-200 can be substantially similar to, including some or all of the features of, the device seals described herein, such as the device seal 13.15-116. The device seal 13.15-200 can be implemented on an HMD, such as the HMD 13.15-100 described in reference to FIGS. 13.15-1A and 13.15-1B. The device seal 13.15-200 can include a removable facial interface 13.15-202, a facial interface frame 13.15-204, and a cover 13.15-206. The removable facial interface 13.15-202, the facial interface frame 13.15-204, and the cover 13.15-206 can be substantially similar to, including some or all of the features of, the removable facial interface 13.15-110, the facial interface frame 13.15-112, and the cover 13.15-114, respectively. The cover 13.15-206 can be included in the device seal 13.15-200 to provide a seal between the device seal 13.15-200 and the outer environment.

The facial interface frame 13.15-204 can include a frame 13.15-210, connectors 13.15-212, a base 13.15-214, and a compressible portion 13.15-216. The frame 13.15-210 can be physically coupled to a display of the HMD, and the frame 13.15-210 can be configured provide an interface between the display and the facial interface frame 13.15-204. The removable facial interface 13.15-202 can be removably attached to the base 13.15-214, and the base 13.15-214 can be configured provide an interface between the removable facial interface 13.15-202 and the facial interface frame 13.15-204. The connectors 13.15-212 can be configured to provide a desired distance between the display and a user's eyes when the HMD is donned by the user. The connectors 13.15-212 and/or the base 13.15-214 can include attachment mechanisms that are used to attach the removable facial interface 13.15-202 to the facial interface frame 13.15-204.

The compressible portion 13.15-216 can be included in the facial interface frame 13.15-204 to fill a gap between the base 13.15-214 and the removable facial interface 13.15-202, and to provide improved user comfort. The compressible portion 13.15-216 can also be referred to as a compressible member or a compressible material. In some examples, the connectors 13.15-212 (e.g., an attachment mechanism) can extend through the compressible portion 13.15-216. The compressible portion 13.15-216 can encircle portions of the connectors 13.15-212 that extend through the compressible portion 13.15-216. The connectors 13.15-212 can also extend through the base 13.15-214, and attachment mechanisms provided on the connectors 13.15-212 can be exposed through both the compressible portion 13.15-216 and the base 13.15-214 for access and connection. In some examples, the compressible portion 13.15-216 can include a foam material. In some examples, the compressible portion 13.15-216 can include materials with properties that impart flexibility, softness, compressibility, deformability, and the like. Examples of materials that can be used for the compressible portion 13.15-216 include silicone, polymers, elastomers, hydrogels, combinations thereof, or the like. The compressible portion 13.15-216 can be formed by molding, printing, casting, or the like. In some examples, attachment mechanisms, such as perimeter attachments, can be included on the compressible portion 13.15-216. The compressible portion 13.15-216 provides a soft, flexible, deformable interface between the removable facial interface 13.15-202 and rigid components of the removable facial interface 13.15-202, such as the frame 13.15-210, the connectors 13.15-212, and the base 13.15-214. This interface provides for improved user comfort when the HMD is donned.

The removable facial interface 13.15-202 is a removable component that is configured to contact a user's face. The removable facial interface 13.15-202 can be formed of conformable and comfortable materials. The removable facial interface 13.15-202 is configured to be easily removed from and attached to the facial interface frame 13.15-204. This allows for the removable facial interface 13.15-202 to be removed, cleaned, replaced, and the like. In some examples, the attachment mechanisms used to attach the removable facial interface 13.15-202 to the facial interface frame 13.15-204 can be simple mechanisms that allow the removable facial interface 13.15-202 to be removed from and attached to the facial interface frame 13.15-204 in a one-handed manner. Alignment features can be provided on the removable facial interface 13.15-202 and/or the facial interface frame 13.15-204 to aid in the alignment of the removable facial interface 13.15-202 with respect to the facial interface frame 13.15-204. Providing the removable facial interface 13.15-202 as a removable component allows the removable facial interface 13.15-202 to be easily cleaned, replaced as a result of wear, replaced due to user preferences, and the like. This reduces maintenance costs for HMDs including the removable facial interface 13.15-202.

The removable facial interface 13.15-202 can be formed of a relatively pliant material, while the components of the facial interface frame 13.15-204 are formed of relatively rigid materials. This allows the removable facial interface 13.15-202 to conform to the shape of the facial interface frame 13.15-204 and the shape of a user's face or head when the user dons the HMD. As illustrated in FIG. 13.15-2A, the base 13.15-214, the compressible portion 13.15-216, and the removable facial interface 13.15-202 can be C-shaped and can have shapes corresponding to one another. In other words, the removable facial interface 13.15-202 is C-shaped, and the base 13.15-214 and the compressible portion 13.15-216 are C-shaped and complementary to the C-shaped removable facial interface 13.15-202. This provides a visual cue to users when the removable facial interface 13.15-202 is removed from the base 13.15-214 that the removable facial interface 13.15-202 is intended to be attached to the base 13.15-214. In some examples, attachment mechanisms on the removable facial interface 13.15-202 and the facial interface frame 13.15-204 can be visible when the removable facial interface 13.15-202 is removed from the facial interface frame 13.15-204, which provides further visual cues as to how the removable facial interface 13.15-202 is intended to be attached to the facial interface frame 13.15-204. Moreover, upon seeing the attachment mechanisms on the facial interface frame 13.15-204, a user can realize that something is missing from the facial interface frame 13.15-204 when the removable facial interface 13.15-202 is removed from the facial interface frame 13.15-204.

FIG. 13.15-2B illustrates a perspective view of a facial interface frame 13.15-204. The facial interface frame 13.15-204 can include a frame 13.15-210, connectors 13.15-212, and a base 13.15-214. The frame 13.15-210, the connectors 13.15-212, and the base 13.15-214 of the facial interface frame 13.15-204 can be formed of relatively rigid materials, such as plastics, metals, polymers, combinations thereof, or the like. In some examples, the base 13.15-214 can be formed of a relatively flexible material, such that the base 13.15-214 is allowed to flex when an HMD including the facial interface frame 13.15-204 is donned by a user. In some examples, the frame 13.15-210, the connectors 13.15-212, and/or the base 13.15-214 can include rigid materials that can be coated in relatively soft materials, such as polymers, fabrics, foams, rubbers, silicone, elastomers, hydrogels, combinations thereof, or the like to increase user comfort.

The frame 13.15-210 can provide an interface between a display of the HMD and the facial interface frame 13.15-204. For example, the frame 13.15-210 can be physically coupled to the display of the HMD and can hold the display in a desired position. The connectors 13.15-212 can control the spacing between the display and a user's face. For example, depending on a length of the connectors 13.15-212, the display can be disposed closer to or further from a user's face. The base 13.15-214 and/or the connectors 13.15-212 can provide an interface between the facial interface frame 13.15-204 and a removable facial interface. For example, attachment mechanisms can be included on the base 13.15-214 and/or the connectors 13.15-212 and can be used to removably attach the removable facial interface to the base 13.15-214 and/or the connectors 13.15-212.

In some examples, post attachments can be provided on the connectors 13.15-212 and perimeter attachments can be provided on the base 13.15-214. As will be discussed in detail below, the post attachments and corresponding attachment mechanisms on the removable facial interface can be configured to remain fixed relative to one another or have a limited amount of travel when the removable facial interface is mounted to the facial interface frame 13.15-204. The perimeter attachments and corresponding attachment mechanisms on the removable facial interface can be configured to slide relative to one another when the removable facial interface is mounted to the facial interface frame 13.15-204. Including both the post attachments and the perimeter attachments allows the removable facial interface to be securely mounted on the facial interface frame 13.15-204, while allowing the removable facial interface to conform comfortably to a user's face.

FIG. 13.15-2C illustrates a perspective view of portions of a removable facial interface 13.15-202 and a facial interface frame 13.15-204. The removable facial interface 13.15-202 can include a body portion 13.15-220, a side mount 13.15-222, a top mount 13.15-224, and a mounting area 13.15-226. The body portion 13.15-220 can be formed of materials such as plastics, metals, polymers, fabrics, foams, rubbers, silicone, elastomers, hydrogels, combinations thereof, or the like. The facial interface frame 13.15-204 can include a frame 13.15-210, connectors 13.15-212, and a base 13.15-214.

The side mount 13.15-222, the top mount 13.15-224, and the mounting area 13.15-226 are examples of attachment mechanisms that can be included in the removable facial interface 13.15-202. The side mount 13.15-222, the top mount 13.15-224, and the mounting area 13.15-226 can be used to removably attach the removable facial interface 13.15-202 to the facial interface frame 13.15-204. In some examples, post attachments can be provided on the connectors 13.15-212 corresponding to the side mount 13.15-222 and the top mount 13.15-224. Perimeter attachments can be provided on the base 13.15-214 corresponding to the mounting area 13.15-226. Specifically, when the removable facial interface 13.15-202 is aligned with and mounted to the facial interface frame 13.15-204, the side mount 13.15-222 and the top mount 13.15-224 are aligned with corresponding post attachments on the connectors 13.15-212 and the mounting area 13.15-226 is aligned with corresponding perimeter attachments on the base 13.15-214.

The side mount 13.15-222, the top mount 13.15-224, and corresponding post attachments of the connectors 13.15-212 can include attachment mechanisms that are configured to remain fixed relative to one another, or to have a relatively small travel relative to one another (e.g., the attachment mechanisms can float relative to one another). In some examples, the side mount 13.15-222 and a corresponding post attachment can be configured to remain fixed relative to one another and the top mount 13.15-224 and a corresponding post attachment can be configured to have some travel relative to one another. In some examples, the side mount 13.15-222, the top mount 13.15-224, and corresponding post attachments can include magnets, interlocking features, sliding features, hook-and-loop features (e.g., Velcro), spring snaps, suction features, bi-stable features, stretch features, re-usable adhesives, mating posts, combinations thereof, or the like. Posts and corresponding holes or other self-aligning features can be included in the side mount 13.15-222, the top mount 13.15-224, and the post attachments in order to align the removable facial interface 13.15-202 with the facial interface frame 13.15-204. Male features can be provided in the side mount 13.15-222 and the top mount 13.15-224 and corresponding female features can be provided in the post attachments of the facial interface frame 13.15-204, or vice versa. By using the prescribed attachment mechanisms and fixing the positions of the side mount 13.15-222 and the top mount 13.15-224 relative to the post attachments, the removable facial interface 13.15-202 can be aligned with the facial interface frame 13.15-204. Moreover, the relative positions of the removable facial interface 13.15-202 and the facial interface frame 13.15-204 can be fixed to one another during use of an HMD by a user. This prevents misalignment of the removable facial interface 13.15-202 and the facial interface frame 13.15-204 from negatively impacting a user's experience when using the HMD.

The mounting area 13.15-226 and the corresponding perimeter attachments of the facial interface frame 13.15-204 can include attachment mechanisms that are configured to slide relative to one another. For example, the mounting area 13.15-226 and the corresponding perimeter attachments can include longitudinal interlocking features, rows of interlocking features, rows of magnets, lengths of flexible magnets, lengths of hook-and-loop fasteners, combinations thereof, or the like. Male features can be provided in the mounting area 13.15-226 and corresponding female features can be provided in the perimeter attachments of the facial interface frame 13.15-204, or vice versa. In some examples, the mounting area 13.15-226 and the corresponding perimeter attachments are disposed in curved or corner regions of the removable facial interface 13.15-202 and the facial interface frame 13.15-204, respectively. The mounting area 13.15-226 and the corresponding perimeter attachments can be disposed in areas of the removable facial interface 13.15-202 and the facial interface frame 13.15-204 that move or bend when the removable facial interface 13.15-202 is mounted on the facial interface frame 13.15-204 and when an HMD including the removable facial interface 13.15-202 and the facial interface frame 13.15-204 is donned by a user. This causes an arc length of the mounting area 13.15-226 and the corresponding perimeter attachments to change. By using the prescribed attachment mechanisms, the mounting area 13.15-226 and the corresponding perimeter attachments are allowed to slide relative to one another, and the removable facial interface 13.15-202 is securely fastened to the facial interface frame 13.15-204 even when the removable facial interface 13.15-202 moves relative to the facial interface frame 13.15-204.

In the example of FIG. 13.15-2C, a single top mount 13.15-224 and a single side mount 13.15-222 are illustrated. The top mount 13.15-224 can be configured to be disposed adjacent a user's forehead when the HMD is donned and the side mount 13.15-222 can be configured to be disposed adjacent the user's cheek bones when the HMD is donned. However, any number of top mounts 13.15-224 and side mounts 13.15-222 can be included in the removable facial interface 13.15-202, and the top mounts 13.15-224 and the side mounts 13.15-222 can be configured to be disposed adjacent any portions of the user's face or head when the HMD is donned. Moreover, although the mounting area 13.15-226 is illustrated as being in a corner area of the removable facial interface 13.15-202 between the top mount 13.15-224 and the side mount 13.15-222, the mounting area 13.15-226 can be disposed in any area along the perimeter of the removable facial interface 13.15-202 and any number or length of mounting areas 13.15-226 can be included.

FIG. 13.15-2D illustrates a cross-sectional view of a facial interface shim 13.15-219. The facial interface shim 13.15-219 can be used in conjunction with connectors of an HMD in order to control the spacing between a display of the HMD and a user's face. In some examples, the facial interface shim 13.15-219 can be disposed between a removable facial interface and a connector of a facial interface frame. For example, the facial interface shim 13.15-219 can be disposed in a mount opening 13.15-218 of the removable facial interface to which the connector of the facial interface frame is attached. In some examples, the facial interface shim 13.15-219 can be disposed between a base of a facial interface frame and a connector of the facial interface frame. For example, the connector can pass through the mount opening 13.15-218, and the facial interface shim 13.15-219 can be disposed between the connector and the base. The facial interface shim 13.15-219 can have a thickness in a range from about 2 mm to about 4 mm. The facial interface shim 13.15-219 allows for distances between a display of an HMD and a user's face to be altered while standard length connectors are used, which decreases manufacturing costs.

Any of the features, components, and/or parts, including the arrangements and configurations thereof shown in FIGS. 13.15-2A through 13.15-2D can be included, either alone or in any combination, in any of the other examples of devices, features, components, and parts shown in the other figures, including in any of FIGS. 13.15-2A through 13.15-2D, described herein. Likewise, any of the features, components, and/or parts, including the arrangements and configurations thereof shown and described with reference to the other figures can be included, either alone or in any combination, in the example of the devices, features, components, and parts shown in FIGS. 13.15-2A through 13.15-2D.

FIGS. 13.15-3A and 13.15-3B illustrate a perspective view of a device seal 13.15-200 and a plan view of a removable facial interface 13.15-202, respectively. The device seal 13.15-200 includes the removable facial interface 13.15-202, a facial interface frame 13.15-204, and a cover 13.15-206. The device seal 13.15-200 can be substantially similar to, including some or all of the features of, the device seals described herein, such as the device seals 13.15-116 and 13.15-200. The device seal 13.15-200 can be implemented on an HMD, such as the HMD 13.15-100 described in reference to FIGS. 13.15-1A and 13.15-1B.

FIGS. 13.15-3A and 13.15-3B illustrate an example in which the attachment mechanisms used to attach the removable facial interface 13.15-202 to the facial interface frame 13.15-204 include magnets. In some examples, six connectors 13.15-212 can be provided between a base 13.15-214 and a frame 13.15-210 of the facial interface frame 13.15-204. Four circular receptacles 13.15-250 can be provided corresponding to four of the connectors 13.15-212. The connectors 13.15-212 can extend through the base 13.15-214, such that the attachment mechanisms provided on the connectors 13.15-212 are exposed through the base 13.15-214. The circular receptacles 13.15-250 can be disposed along portions of the facial interface frame 13.15-204 configured to be disposed adjacent to a user's cheek bones when an HMD including the device seal 13.15-200 is donned. A spherically-dished magnet 13.15-252 can be disposed in each of the circular receptacles 13.15-250. Each of the circular receptacles 13.15-250 in combination with a corresponding spherically-dished magnet 13.15-252 may be referred to as a spherical magnetic receptacle. Two stadium or lozenge-shaped receptacles 13.15-254 can be provided corresponding to two of the connectors 13.15-212. The stadium or lozenge-shaped receptacles 13.15-254 can be disposed along portions of the facial interface frame 13.15-204 configured to be disposed adjacent to a user's forehead when the HMD is donned. A capsule-dished magnet 13.15-256 can be disposed in each of the stadium or lozenge-shaped receptacles 13.15-254. Each of the stadium or lozenge-shaped receptacles 13.15-254 in combination with a corresponding capsule-dished magnet 13.15-256 may be referred to as a capsule-dished magnetic receptacle.

In the example of FIG. 13.15-3B, four circular receptacles 13.15-260 can be provided in the replaceable facial interface 13.15-202. The circular receptacles 13.15-260 can be disposed along portions of the replaceable facial interface 13.15-202 configured to be disposed adjacent to a user's cheek bones when the HMD is donned. A spherical magnet 13.15-262 can be disposed in each of the circular receptacles 13.15-260. Two stadium or lozenge-shaped receptacles 13.15-264 can be provided in the replaceable facial interface 13.15-202. The stadium or lozenge-shaped receptacles 13.15-264 can be disposed along portions of the replaceable facial interface 13.15-202 configured to be disposed adjacent to a user's forehead when the HMD is donned. A spherical magnet 13.15-266 can be disposed in each of the stadium or lozenge-shaped receptacles 13.15-264. Although the receptacles 13.15-250, 13.15-254, 13.15-260, and 13.15-264 and the magnets 13.15-252, 13.15-256, 13.15-262, and 13.15-266 are described as being various rounded shapes, any suitable shapes can be used.

The spherical magnets 13.15-262 can be configured to interface with the spherically-dished magnets 13.15-252, and the spherical magnets 13.15-266 can be configured to interface with the capsule-dished magnets 13.15-256. The spherical magnets 13.15-262 and the spherically-dished magnets 13.15-252 can have corresponding shapes, which provides for a small amount of relative travel between the spherical magnets 13.15-262 and the spherically-dished magnets 13.15-252 in the x direction and the y direction illustrated in FIG. 13.15-3A and 13.15-3B. The spherical magnets 13.15-266 and the capsule-dished magnets 13.15-256 can have corresponding shapes, which provides for a small amount of relative travel between the spherical magnets 13.15-266 and the capsule-dished magnets 13.15-256 in the y direction illustrated in FIGS. 13.15-3A and 13.15-3B. The capsule-dished magnets 13.15-256 have a longitudinal axis extending in the x direction of FIG. 13.15-3A. This provides for a greater amount of relative travel between the spherical magnets 13.15-266 and the capsule-dished magnets 13.15-256 in the x direction illustrated in FIGS. 13.15-3A and 13.15-3B. The distances and directions that each of the magnets 13.15-252, 13.15-256, 13.15-262, and 13.15-266 are allowed to travel relative to one another can be controlled by appropriately selecting the sizes and shapes of each of the magnets 13.15-252, 13.15-256, 13.15-262, and 13.15-266.

In the example illustrated in FIGS. 13.15-3A and 13.15-3B, the receptacles 13.15-250 and 13.15-254 and the magnets 13.15-252 and 13.15-256 in the facial interface frame 13.15-204 and the receptacles 13.15-260 and 13.15-264 and the magnets 13.15-262 and 13.15-266 in the removable facial interface 13.15-202 are visible to a user. In addition, the base 13.15-214 of the facial interface frame 13.15-204 and the removable facial interface 13.15-202 are C-shaped and have shapes corresponding to one another. This provides visual cues to users that the removable facial interface 13.15-202 is meant to mount to the facial interface frame 13.15-204. Moreover, if the removable facial interface 13.15-202 is not attached to the facial interface frame 13.15-204, the facial interface frame 13.15-204 looks as though a piece is missing. This encourages a user to install the removable facial interface 13.15-202 onto the facial interface frame 13.15-204 so that the HMD can be comfortably donned. In some examples, any of the receptacles 13.15-250, 13.15-254, 13.15-260, and 13.15-264 and/or the magnets 13.15-252, 13.15-256, 13.15-262, and 13.15-266 can be covered or otherwise hidden from view.

The magnets 13.15-252, 13.15-262 can datum relative to one another (e.g., maintain relatively fixed positions relative to one another), and the magnets 13.15-256, 13.15-266 can float relative to one another (e.g., move relative to one another). Although the magnets 13.15-252, 13.15-256, 13.15-262, and 13.15-266 are illustrated in particular positions in the example of FIGS. 13.15-3A and 13.15-3B, any of the magnets 13.15-252, 13.15-256, 13.15-262, and 13.15-266 can be positioned in any desired positions relative to the removable facial interface 13.15-202 and the facial interface frame 13.15-204, depending on areas of the removable facial interface 13.15-202 and the facial interface frame 13.15-204 that are desired to remain fixed or float. Moreover, the magnets 13.15-252, 13.15-256, 13.15-262, and 13.15-266 and the receptacles 13.15-250, 13.15-254, 13.15-260, and 13.15-264 can have varying shapes and sizes, which can improve the ability to interchange various removable facial interfaces 13.15-202 and facial interface frames 13.15-204, and can aid in the alignment of the removable facial interface 13.15-202 relative to the facial interface frame 13.15-204. In some examples, the variable shapes and/or sizes of the magnets 13.15-252, 13.15-256, 13.15-262, and 13.15-266 and the receptacles 13.15-250, 13.15-254, 13.15-260, and 13.15-264 around the perimeters of the removable facial interface 13.15-202 and the facial interface frame 13.15-204 can allow for different shaped removable facial interfaces 13.15-202 and facial interface frames 13.15-204 to be connected together.

Any of the features, components, and/or parts, including the arrangements and configurations thereof shown in FIGS. 13.15-3A and 13.15-3B can be included, either alone or in any combination, in any of the other examples of devices, features, components, and parts shown in the other figures, including in any of FIGS. 13.15-3A and 13.15-3B, described herein. Likewise, any of the features, components, and/or parts, including the arrangements and configurations thereof shown and described with reference to the other figures can be included, either alone or in any combination, in the example of the devices, features, components, and parts shown in FIGS. 13.15-3A and 13.15-3B.

FIG. 13.15-4 illustrates a cross-sectional view of a magnetic attachment mechanism 13.15-300, which is an example of a post mount. The magnetic attachment mechanism 13.15-300 includes a connector 13.15-301, which can be magnetically attached to a base 13.15-310. The connector 13.15-301 can be substantially similar to, including some or all of the features of, the connectors described herein, such as the connectors 13.15-212. The base 13.15-310 can be substantially similar to, including some or all of the features of, the stiffeners described herein, such as the stiffeners of the removable facial interfaces 13.15-202. The connector 13.15-301 can be physically coupled to a receptacle 13.15-302, which can be physically coupled to a magnet 13.15-304. The base 13.15-310 can be physically coupled to a protrusion 13.15-312, which can surround or otherwise house a magnet 13.15-316.

As illustrated in FIG. 13.15-4, the protrusion 13.15-312 and the receptacle 13.15-302 can have shapes that are configured to correspond to one another. For example, the receptacle 13.15-302 can include a squared opening, and the protrusion 13.15-312 can have a squared shape configured to fit into the squared opening of the receptacle 13.15-302. The protrusion 13.15-312 can be an alignment post. Providing the protrusion 13.15-312 and the receptacle 13.15-302 with corresponding shapes aids in self-aligning a removable facial interface with a facial interface frame when the removable facial interface is attached to the facial interface frame. The magnet 13.15-304 and the magnet 13.15-316 are then attracted to one another and retain the protrusion 13.15-312 in the receptacle 13.15-302.

Any of the features, components, and/or parts, including the arrangements and configurations thereof shown in FIG. 13.15-4 can be included, either alone or in any combination, in any of the other examples of devices, features, components, and parts shown in the other figures, including in any of FIG. 13.15-4, described herein. Likewise, any of the features, components, and/or parts, including the arrangements and configurations thereof shown and described with reference to the other figures can be included, either alone or in any combination, in the example of the devices, features, components, and parts shown in FIG. 13.15-4.

FIG. 13.15-5A illustrates a cross-sectional view of an interlocking attachment mechanism 13.15-400, which is an example of a post mount. The interlocking attachment mechanism 13.15-400 can be referred to as an interlocking fastener. The interlocking attachment mechanism 13.15-400 includes a connector 13.15-401, to which a base 13.15-410 can be attached. The connector 13.15-401 can be substantially similar to, including some or all of the features of, the connectors described herein, such as the connectors 13.15-212. The base 13.15-410 can be substantially similar to, including some or all of the features of, the stiffeners described herein, such as the stiffeners of the removable facial interfaces 13.15-202. The connector 13.15-401 can be physically coupled to a receptacle 13.15-402, which can include one or more openings 13.15-404. In the cross-sectional view illustrated in FIG. 13.15-5A, the receptacle 13.15-402 includes three openings 13.15-404; however, the receptacle 13.15-402 of FIG. 13.15-5A can include two openings 13.15-404 that are circular- or annular-shaped in a bottom-up view. Any number of openings 13.15-404 can be included in the receptacle 13.15-402. The base 13.15-410 can be physically coupled to protrusions 13.15-412. The protrusions 13.15-412 can have shapes corresponding to the openings 13.15-404, such as having circular- or annular-shapes in a top-down view. In some examples, the openings 13.15-404 and the protrusions 13.15-412 can have triangular shapes, rectangular shapes, or any other suitable shapes. Providing the openings 13.15-404 and the protrusions 13.15-412 with corresponding shapes aids in self-aligning the base 13.15-410 with the connector 13.15-401.

The protrusions 13.15-412 can be configured to interface with the openings 13.15-404 in the receptacle 13.15-402 to attach the base 13.15-410 to the connector 13.15-401 when the base 13.15-410 and the connector 13.15-401 are pressed together. The protrusions 13.15-412 and the receptacle 13.15-402 can be formed of elastic, flexible materials with high coefficients of friction. In examples in which the protrusions 13.15-412 and the receptacle 13.15-402 are formed from elastic materials, the interlocking attachment mechanism 13.15-400 may be referred to as an interlocking elastic fastener. Forming the protrusions 13.15-412 and the receptacle 13.15-402 from flexible materials allows the protrusions 13.15-412 to be inserted into the openings 13.15-404. Forming the protrusions 13.15-412 and the receptacle 13.15-402 from elastic materials having high coefficients of friction helps to retain the protrusions 13.15-412 in the openings 13.15-404 once the protrusions 13.15-412 are inserted into the openings 13.15-404. In some examples, the protrusions 13.15-412 and the receptacle 13.15-402 can be formed of polymers, elastomers, plastics, combinations thereof, or the like. Providing the protrusions 13.15-412 and the openings 13.15-404 in the receptacle 13.15-402 with corresponding shapes aids in self-aligning a removable facial interface with a facial interface frame when the removable facial interface is attached to the facial interface frame.

FIG. 13.15-5B illustrates a cross-sectional view of an interlocking attachment mechanism 13.15-420, which is an example of a perimeter mount. The interlocking attachment mechanism 13.15-420 can be referred to as an interlocking fastener. The interlocking attachment mechanism 13.15-420 includes a base 13.15-421, which can be physically attached to a base 13.15-430. The base 13.15-421 can be substantially similar to, including some or all of the features of, the bases of the facial interface frames described herein, such as the base 13.15-214. The base 13.15-430 can be substantially similar to, including some or all of the features of, the stiffeners described herein, such as the stiffeners of the removable facial interfaces 13.15-202. The base 13.15-421 can be physically coupled to an outer layer 13.15-424. The base 13.15-421 can include one or more protrusions 13.15-422 and the outer layer 13.15-424 can include one or more protrusions 13.15-426. The base 13.15-430 can be physically coupled to an outer layer 13.15-434. The base 13.15-430 can include one or more protrusions 13.15-436 and the outer layer 13.15-434 can include one or more protrusions 13.15-436. Any number of protrusions can be included in the base 13.15-421, the outer layer 13.15-424, the base 13.15-430, and the outer layer 13.15-434.

The protrusions 13.15-432 and 13.15-436 of the base 13.15-430 can have shapes corresponding to the protrusions 13.15-422 and 13.15-426 of the base 13.15-421. For example, the protrusion 13.15-422 can have a shape corresponding to an opening between the protrusions 13.15-432; the protrusions 13.15-432 can have shapes corresponding to openings between the protrusion 13.15-422 and the protrusions 13.15-426; and the protrusions 13.15-426 can have shapes corresponding to openings between the protrusions 13.15-432 and the protrusions 13.15-436. The protrusions 13.15-422, 13.15-426, 13.15-432, and 13.15-436 can have longitudinal shapes with open ends and longitudinal axes extending in a direction into and out of the page in the view of FIG. 13.15-5B. This allows for the base 13.15-430 to slide relative to the base 13.15-421. This can aid a user in attaching a removable facial interface of an HMD to a facial interface frame. Further, this allows for the removable facial interface to conform to the user's face when the user dons the HMD.

The protrusions 13.15-432 and 13.15-436 of the base 13.15-430 can be configured to interface with the protrusions 13.15-422 and 13.15-426 of the base 13.15-421 to attach the base 13.15-430 to the base 13.15-421 when the base 13.15-430 and the base 13.15-421 are pressed together. The protrusions 13.15-422, 13.15-426, 13.15-432, and 13.15-436, the outer layers 13.15-424 and 13.15-434, and the bases 13.15-421 and 13.15-430 can be formed of elastic, flexible materials with high coefficients of friction. In examples in which the protrusions 13.15-422, 13.15-426, 13.15-432, and 13.15-436 are formed from elastic materials, the interlocking attachment mechanism 13.15-420 may be referred to as an interlocking elastic fastener. The outer layers 13.15-424 and 13.15-434 and the bases 13.15-421 and 13.15-430 can be formed of any combinations of materials, such as the base 13.15-421 and the outer layer 13.15-424 being formed of the same or different materials and the base 13.15-430 and the outer layer 13.15-434 being formed of the same or different materials. Forming the protrusions 13.15-422, 13.15-426, 13.15-432, and 13.15-436 from flexible materials allows the protrusions 13.15-422, 13.15-426, 13.15-432, and 13.15-436 to be inserted into corresponding openings. Forming the protrusions 13.15-422, 13.15-426, 13.15-432, and 13.15-436 from elastic materials having high coefficients of friction helps to retain the protrusions 13.15-422, 13.15-426, 13.15-432, and 13.15-436 in the corresponding openings once the protrusions 13.15-422, 13.15-426, 13.15-432, and 13.15-436 are inserted into the corresponding openings. In some examples, the protrusions 13.15-422, 13.15-426, 13.15-432, and 13.15-436, the outer layers 13.15-424 and 13.15-434, and the bases 13.15-421 and 13.15-430 can be formed of polymers, elastomers, plastics, combinations thereof, or the like.

Any of the features, components, and/or parts, including the arrangements and configurations thereof shown in FIGS. 13.15-5A and 13.15-5B can be included, either alone or in any combination, in any of the other examples of devices, features, components, and parts shown in the other figures, including in any of FIGS. 13.15-5A and 13.15-5B, described herein. Likewise, any of the features, components, and/or parts, including the arrangements and configurations thereof shown and described with reference to the other figures can be included, either alone or in any combination, in the example of the devices, features, components, and parts shown in FIGS. 13.15-5A and 13.15-5B.

FIG. 13.15-6 illustrates a cross-sectional view of a magnetic slide attachment mechanism 13.15-500, which is an example of a post mount. The magnetic slide attachment mechanism 13.15-500 includes a connector 13.15-501, to which a base 13.15-510 can be attached. The connector 13.15-501 can be substantially similar to, including some or all of the features of, the connectors described herein, such as the connectors 13.15-212. The base 13.15-510 can be substantially similar to, including some or all of the features of, the stiffeners described herein, such as the stiffeners of the removable facial interfaces 13.15-202.

The connector 13.15-501 can be physically coupled to a magnetic post 13.15-504 through a fastener 13.15-502. The magnetic post 13.15-504 can include a flange 13.15-506. The base 13.15-510 can be physically coupled to a magnetic protrusion 13.15-512. The magnetic post 13.15-504 is magnetically attracted to the magnetic protrusion 13.15-512, which helps to align the connector 13.15-501 with the base 13.15-510 and helps to secure the flange 13.15-506 of the magnetic post 13.15-504 under a lip 13.15-514 of the magnetic protrusion 13.15-512. A magnet 13.15-516 of the magnetic protrusion 13.15-512 can be disposed under the lip 13.15-514 of the magnetic protrusion 13.15-512 to pull the magnetic post 13.15-504 into an opening 13.15-518 of the magnetic protrusion 13.15-512 under the lip 13.15-514 of the magnetic protrusion 13.15-512. In the view of FIG. 13.15-6, the magnetic post 13.15-504 can move from left to right as the connector 13.15-501 is attached to the base 13.15-510. In other words, the magnetic post 13.15-504 can be slidably engaged with the magnetic protrusion 13.15-512 by sliding the flange 13.15-506 under the lip 13.15-514. The connector 13.15-501 can be removed from the base 13.15-510 by moving the magnetic post 13.15-504 from right to left, then moving the magnetic post 13.15-504 in an upwards direction once the flange 13.15-506 of the magnetic post 13.15-504 clears the lip 13.15-514 of the protrusion 13.15-512. In other words, the magnetic post 13.15-504 can be slidably disengaged with the magnetic protrusion 13.15-512 by sliding the flange 13.15-506 out from under the lip 13.15-514.

Any of the features, components, and/or parts, including the arrangements and configurations thereof shown in FIG. 13.15-6 can be included, either alone or in any combination, in any of the other examples of devices, features, components, and parts shown in the other figures, including in any of FIG. 13.15-6, described herein. Likewise, any of the features, components, and/or parts, including the arrangements and configurations thereof shown and described with reference to the other figures can be included, either alone or in any combination, in the example of the devices, features, components, and parts shown in FIG. 13.15-6.

FIG. 13.15-7 illustrates a cross-sectional view of a hook-and-loop attachment mechanism 13.15-600, which is an example of a post mount. The hook-and-loop attachment mechanism 13.15-600 includes a connector 13.15-601, to which a base 13.15-610 can be attached. The connector 13.15-601 can be substantially similar to, including some or all of the features of, the connectors described herein, such as the connectors 13.15-212. The base 13.15-610 can be substantially similar to, including some or all of the features of, the stiffeners described herein, such as the stiffeners of the removable facial interfaces 13.15-202.

The connector 13.15-601 can be physically coupled to a hook-and-loop feature 13.15-604 through a fastener 13.15-602. The hook-and-loop feature 13.15-604 can include a post 13.15-606. The base 13.15-610 can be physically coupled to a hook-and-loop feature 13.15-612. The hook-and-loop feature 13.15-604 can include an opening 13.15-614 configured to receive the post 13.15-606. In the example of FIG. 13.15-7, the post 13.15-606 and the opening 13.15-614 can have corresponding frustum shapes, however any suitable shapes can be used. The opening 13.15-614 and the post 13.15-606 can be included to aid in self-aligning the connector 13.15-601 and the base 13.15-610; however, in some examples, the opening 13.15-614 and the post 13.15-606 can be omitted.

One of the hook-and-loop feature 13.15-604 or the hook-and-loop feature 13.15-612 can include a plurality of hooks, and the other of the hook-and-loop feature 13.15-604 or the hook-and-loop feature 13.15-612 can include a plurality of loops. The hooks of the hook-and-loop feature 13.15-604 or the hook-and-loop feature 13.15-612 are retained in the corresponding loops of the hook-and-loop feature 13.15-604 or the hook-and-loop feature 13.15-612 in order to attach the base 13.15-610 to the connector 13.15-601. Velcro is an example of a hook-and-loop attachment mechanism that can be used for the hook-and-loop feature 13.15-604 and the hook-and-loop feature 13.15-612. Fine hook and loop features can be provided in the hook-and-loop feature 13.15-604 and/or the hook-and-loop feature 13.15-612 in order to lessen a tearing sound when the connector 13.15-601 and the base 13.15-610 are separated from one another.

Any of the features, components, and/or parts, including the arrangements and configurations thereof shown in FIG. 13.15-7 can be included, either alone or in any combination, in any of the other examples of devices, features, components, and parts shown in the other figures, including in any of FIG. 13.15-7, described herein. Likewise, any of the features, components, and/or parts, including the arrangements and configurations thereof shown and described with reference to the other figures can be included, either alone or in any combination, in the example of the devices, features, components, and parts shown in FIG. 13.15-7.

FIG. 13.15-8 illustrates a cross-sectional view of a magnetic attachment mechanism 13.15-700, which is an example of a post mount. The magnetic attachment mechanism 13.15-700 includes a connector 13.15-701, which can be magnetically attached to a base 13.15-710. The connector 13.15-701 can be substantially similar to, including some or all of the features of, the connectors described herein, such as the connectors 13.15-212. The base 13.15-710 can be substantially similar to, including some or all of the features of, the stiffeners described herein, such as the stiffeners of the removable facial interfaces 13.15-202.

The connector 13.15-701 can be physically coupled to a magnet 13.15-706 through a fastener 13.15-702. The connector 13.15-701 can be further physically coupled to a post 13.15-704, which houses the magnet 13.15-706. In some examples, the post 13.15-704 can be referred to as a protrusion, and the magnet 13.15-706 can be disposed in the protrusion. The base 13.15-710 can be physically coupled to a magnet 13.15-714, and a receptacle 13.15-712 can be physically coupled to the base 13.15-710 and/or the magnet 13.15-714. In some examples, the magnet 13.15-714 can be disposed in the receptacle 13.15-712. As illustrated in FIGS. 13.15-8, the receptacle 13.15-712 can include an opening configured to receive the post 13.15-704. In the example of FIG. 13.15-8, the post 13.15-704 and the opening of the receptacle 13.15-712 can have corresponding frustum shapes, however any suitable shapes can be used. In some examples, the post 13.15-704 (e.g., the protrusion) and the receptacle 13.15-712 have shapes that are complementary to one another, such that they can nest, stack, or be received in one-another. The opening of the receptacle 13.15-712 and the post 13.15-704 can be included to aid in self-aligning the connector 13.15-701 and the base 13.15-710; however, in some examples, the opening of the receptacle 13.15-712 and the post 13.15-704 can be omitted. The magnet 13.15-706 and 13.15-714 are magnetically attracted to one another and retain the post 13.15-704 of the connector 13.15-701 within the opening of the receptacle 13.15-712 of the base 13.15-710.

Any of the features, components, and/or parts, including the arrangements and configurations thereof shown in FIG. 13.15-8 can be included, either alone or in any combination, in any of the other examples of devices, features, components, and parts shown in the other figures, including in any of FIG. 13.15-8, described herein. Likewise, any of the features, components, and/or parts, including the arrangements and configurations thereof shown and described with reference to the other figures can be included, either alone or in any combination, in the example of the devices, features, components, and parts shown in FIG. 13.15-8.

FIG. 13.15-9 illustrates a cross-sectional view of a spring-snap attachment mechanism 13.15-800, which is an example of a post mount. The spring-snap attachment mechanism 13.15-800 includes a connector 13.15-801, which can be physically attached to a base 13.15-801. The connector 13.15-801 can be substantially similar to, including some or all of the features of, the connectors described herein, such as the connectors 13.15-212. The base 13.15-810 can be substantially similar to, including some or all of the features of, the stiffeners described herein, such as the stiffeners of the removable facial interfaces 13.15-202.

The connector 13.15-801 is physically coupled to a spring-snap feature 13.15-804 through a fastener 13.15-802. The spring-snap feature 13.15-804 includes detents 13.15-806 that are attached to the spring-snap feature 13.15-804 through springs in the spring-snap feature 13.15-804. The base 13.15-810 is physically coupled to a post 13.15-812, which includes flange 13.15-814. When the base 13.15-810 is attached to the connector 13.15-801, the flange 13.15-814 of the post 13.15-812 push the detents 13.15-806 outwards relative to the post 13.15-812 and into openings in the spring-snap feature 13.15-804. Once the flange 13.15-814 pass the detents 13.15-806, the springs of the spring-snap feature 13.15-804 push the detents 13.15-806 against the post 13.15-812 to retain the flange 13.15-814 of the post 13.15-812 within an opening of the spring-snap feature 13.15-804. In other words, the spring force of the spring-snap feature 13.15-804 pressing the detents 13.15-806 against the post 13.15-812 adjacent the flange 13.15-814 retains the post 13.15-812 within the spring-snap feature 13.15-804, attaching the base 13.15-810 to the connector 13.15-801. When the base 13.15-810 is removed from the connector 13.15-801, this same process occurs in reverse. In the example of FIG. 13.15-9, the post 13.15-812 and the opening of the spring-snap feature 13.15-804 that receives the post can have corresponding cylindrical shapes, however any suitable shapes can be used. The opening of the spring-snap feature 13.15-804 and the post 13.15-812 aid in self-aligning the connector 13.15-801 and the base 13.15-810.

Any of the features, components, and/or parts, including the arrangements and configurations thereof shown in FIG. 13.15-9 can be included, either alone or in any combination, in any of the other examples of devices, features, components, and parts shown in the other figures, including in any of FIG. 13.15-9, described herein. Likewise, any of the features, components, and/or parts, including the arrangements and configurations thereof shown and described with reference to the other figures can be included, either alone or in any combination, in the example of the devices, features, components, and parts shown in FIG. 13.15-9.

FIG. 13.15-10 illustrates a cross-sectional view of an interlocking attachment mechanism 13.15-900, which is an example of a post mount or a perimeter mount. The interlocking attachment mechanism 13.15-900 can be referred to as an interlocking fastener. The interlocking attachment mechanism 13.15-900 includes a base 13.15-910, which can be interlocked with a base 13.15-901. The base 13.15-901 or 13.15-910 can be substantially similar to, including some or all of the features of, the bases of the facial interface frames described herein, such as the base 13.15-214. The other of the base 13.15-901 or 13.15-910 can be substantially similar to, including some or all of the features of, the stiffeners described herein, such as the stiffeners of the removable facial interfaces 13.15-202. The base 13.15-901 can include a plurality of protrusions 13.15-902, such as two protrusions 13.15-902 in the example of FIG. 13.15-10. The base 13.15-910 can include a protrusion 13.15-912. In some examples, any number of protrusions 13.15-912 and 13.15-902 can be included in the base 13.15-910 and the base 13.15-901.

As illustrated in FIG. 13.15-10, the protrusion 13.15-912 can be configured to interlock with the protrusions 13.15-902. The protrusion 13.15-912 can be mushroom-shaped and can have a flange at an end of a post. The protrusions 13.15-902 can define an opening and include lips adjacent to the protrusion 13.15-912 when the protrusion 13.15-912 is inserted into the opening defined by the protrusions 13.15-902. The lips of the protrusions 13.15-902 and the flange of the protrusion 13.15-912 can secure the protrusion 13.15-912 within the opening defined between the protrusions 13.15-902.

In some examples, the protrusions 13.15-902 and 13.15-912 can have longitudinal shapes with open ends and longitudinal axes extending in a direction into and out of the page in the view of FIG. 13.15-10. This allows for the base 13.15-901 to slide relative to the base 13.15-910. This can aid a user in attaching a removable facial interface of an HMD to a facial interface frame. Further, this allows for the removable facial interface to conform to the user's face when the user dons the HMD. In some examples, the protrusion 13.15-912 can have a circular shape in a bottom-up view and the protrusions 13.15-902 can have an annular shape in a top-down view. In some examples, the protrusions 13.15-902 and 13.15-912 can have triangular, rectangular, or other shapes in bottom-up and top-down views, respectively. Providing the protrusions 13.15-902 and 13.15-912 with corresponding shapes aids in self-aligning the base 13.15-901 with the base 13.15-910.

The protrusions 13.15-902 and 13.15-912 can be formed of elastic, flexible materials with high coefficients of friction. In examples in which the protrusions 13.15-902 and 13.15-912 are formed from elastic materials, the interlocking attachment mechanism 13.15-900 may be referred to as an interlocking elastic fastener. The protrusions 13.15-902 and 13.15-912 can be formed from the same or different materials. Forming the protrusions 13.15-902 and 13.15-912 from flexible materials allows the protrusion 13.15-912 to be inserted into the corresponding opening between the protrusions 13.15-902. Forming the protrusions 13.15-902 and 13.15-912 from elastic materials having high coefficients of friction helps to retain the protrusion 13.15-912 in the corresponding opening between the protrusions 13.15-902. In some examples, the protrusions 13.15-902 and 13.15-912 can be formed of polymers, elastomers, plastics, combinations thereof, or the like.

Any of the features, components, and/or parts, including the arrangements and configurations thereof shown in FIG. 13.15-10 can be included, either alone or in any combination, in any of the other examples of devices, features, components, and parts shown in the other figures, including in any of FIG. 13.15-10, described herein. Likewise, any of the features, components, and/or parts, including the arrangements and configurations thereof shown and described with reference to the other figures can be included, either alone or in any combination, in the example of the devices, features, components, and parts shown in FIG. 13.15-10.

FIG. 13.15-11 illustrates a cross-sectional view of a suction attachment mechanism 13.15-1000, which is an example of a post mount. The suction attachment mechanism 13.15-1000 includes a connector 13.15-1010, which can be attached to a base 13.15-1001 through a suction force. The connector 13.15-1010 can be substantially similar to, including some or all of the features of, the connectors described herein, such as the connectors 13.15-212. The base 13.15-1001 can be substantially similar to, including some or all of the features of, the stiffeners described herein, such as the stiffeners of the removable facial interfaces 13.15-202.

The base 13.15-1001 can include a curved opening 13.15-1002 formed at a top surface thereof. In some examples, the curved opening 13.15-1002 may be referred to as a curved surface. A suction cup 13.15-1012 can be physically coupled to the connector 13.15-1010. The base 13.15-1001 can be attached to the connector 13.15-1010 by pressing the suction cup 13.15-1012 into the curved opening with sufficient force. The connector 13.15-1010 can be removed from the base 13.15-1001 by pulling the connector 13.15-1010 away from the base 13.15-1001 with sufficient force. Removing the connector 13.15-1010 from the base 13.15-1001 can be aided by tilting the connector 13.15-1010 relative to the base 13.15-1001. The curved opening 13.15-1002 of the base 13.15-1001 can have a smooth hard surface, which can be surrounded by softer surfaces, such as fabrics or the like. This aids in self-aligning the base 13.15-1001 and the connector 13.15-1010, as the suction cup 13.15-1012 cannot easily be mounted to portions of the base 13.15-1001 surrounding the curved opening 13.15-1002.

Any of the features, components, and/or parts, including the arrangements and configurations thereof shown in FIG. 13.15-11 can be included, either alone or in any combination, in any of the other examples of devices, features, components, and parts shown in the other figures, including in any of FIG. 13.15-11, described herein. Likewise, any of the features, components, and/or parts, including the arrangements and configurations thereof shown and described with reference to the other figures can be included, either alone or in any combination, in the example of the devices, features, components, and parts shown in FIG. 13.15-11.

FIG. 13.15-12 illustrates a cross-sectional view of a bi-stable attachment mechanism 13.15-1100, which is an example of a post mount. The bi-stable attachment mechanism 13.15-1100 includes a connector 13.15-1101, which can be attached to a base 13.15-1110 through a suction force. The connector 13.15-1101 can be substantially similar to, including some or all of the features of, the connectors described herein, such as the connectors 13.15-212. The base 13.15-1110 can be substantially similar to, including some or all of the features of, the stiffeners described herein, such as the stiffeners of the removable facial interfaces 13.15-202.

The connector 13.15-1101 can include a curved opening 13.15-1102 formed at a bottom surface thereof. A bi-stable element 13.15-1114 can be physically coupled to the base 13.15-1110 through a joint 13.15-1112. The bi-stable element 13.15-1114 can be stable in two positions, such as a first position 13.15-1114A and a second position 13.15-1114C. The third position 13.15-1114B is an intermediate position between the first position 13.15-1114A and the second position 13.15-1114C. The bi-stable element 13.15-1114 can flip between the first position 13.15-1114A and the second position 13.15-1114C. For example, when the connector 13.15-1101 is pressed into the base 13.15-1110, the bi-stable element 13.15-1114 can move from the first position 13.15-1114A to the second position 13.15-1114C. When the connector 13.15-1101 is pulled from the base 13.15-1110, the bi-stable element 13.15-1114 can move from the second position 13.15-1114C to the first position 13.15-1114A. The connector 13.15-1101 can be attached to the base 13.15-1110 through a suction force similar to the suction attachment mechanism 13.15-1100. Removing the connector 13.15-1101 from the base 13.15-1110 can be aided by tilting the connector 13.15-1101 relative to the base 13.15-1110. The curved opening 13.15-1102 of the connector 13.15-1101 can have a smooth hard surface, which can be surrounded by softer surfaces, such as fabrics or the like. This aids in self-aligning the base 13.15-1110 and the connector 13.15-1101, as the bi-stable element 13.15-1114 cannot easily be mounted to portions of the connector 13.15-1101 surrounding the curved opening 13.15-1102.

Any of the features, components, and/or parts, including the arrangements and configurations thereof shown in FIG. 13.15-12 can be included, either alone or in any combination, in any of the other examples of devices, features, components, and parts shown in the other figures, including in any of FIG. 13.15-12, described herein. Likewise, any of the features, components, and/or parts, including the arrangements and configurations thereof shown and described with reference to the other figures can be included, either alone or in any combination, in the example of the devices, features, components, and parts shown in FIG. 13.15-12.

FIGS. 13.15-13A and 13.15-13B are plan views of removable facial interfaces 13.15-1200A and 13.15-1200B, respectively. The removable facial interfaces 13.15-1200A and 13.15-1200B include a base 13.15-1204A and a base 13.15-1204B, respectively. A pliant material 13.15-1202 can be formed surrounding the respective bases 13.15-1204A and 13.15-1204B. Top mounts 13.15-1214, side mounts 13.15-1210, and bottom mounts 13.15-1208 can be physically coupled to the respective bases 13.15-1204A and 13.15-1204B through the pliant material 13.15-1202. Any of the above-described attachment mechanisms, such as the post attachments, can be provided on the top mounts 13.15-1214, the side mounts 13.15-1210, and the bottom mounts 13.15-1208. Additional attachment mechanisms, such as the perimeter attachments, can be provided on the removable facial interfaces 13.15-1200A and 13.15-1200B, such as along the bases 13.15-1204A and 13.15-1204B between the top mounts 13.15-1214, the side mounts 13.15-1210, and the bottom mounts 13.15-1208. FIGS. 13.15-13A and 13.15-13B illustrate magnets 13.15-1212 and 13.15-1206 physically coupled to the top mounts 13.15-1214 and the bottom mounts 13.15-1208, respectively. Although 13.15-6 mounts are illustrated as being provided for the removable facial interfaces 13.15-1200A and 13.15-1200B; any number of mounts can be provided.

In the example of FIG. 13.15-13A, the base 13.15-1204A includes thick portions and thin portions. The thick portions can be included to provide stiffness to the removable facial interface 13.15-1200A, while the thin portions can be included to provide flexibility to the removable facial interface 13.15-1200A. In the example of FIG. 13.15-13B, the base 13.15-1204B includes slits formed along the perimeter of the base 13.15-1204B. The slits portions can be included to provide flexibility to the removable facial interface 13.15-1200B. Any suitable bases with any suitable configurations can be included to provide desired flexibility and stiffness to the removable facial interfaces.

The bases 13.15-1204A and 13.15-1204B can be formed from metals, plastics, polymers, combinations thereof, or the like. The pliable material 13.15-1202 can be formed from rubbers, foams, polymers, silicone, elastomers, hydrogen gels, combinations thereof, or the like. The removable facial interfaces 13.15-1200A and 13.15-1200B further include a fabric material surrounding the pliable material 13.15-1202, the top mounts 13.15-1214, the side mounts 13.15-1210, and the bottom mounts 13.15-1208. The fabric material may encircle the top mounts 13.15-1214, the side mounts 13.15-1210, and the bottom mounts 13.15-1208, and the top mounts 13.15-1214, the side mounts 13.15-1210, and the bottom mounts 13.15-1208 may be exposed through the fabric material. The bases 13.15-1204A and 13.15-1204B can provide the removable facial interfaces 13.15-1200A and 13.15-1200B with a desired degree of stiffness. The pliable material 13.15-1202 can be pliant or semi-pliant and can be provided to increase user comfort. The fabric material can be configured to contact a user's skin and can also be provided to increase user comfort.

Any of the features, components, and/or parts, including the arrangements and configurations thereof shown in FIGS. 13.15-13A and 13.15-13B can be included, either alone or in any combination, in any of the other examples of devices, features, components, and parts shown in the other figures, including in any of FIGS. 13.15-13A and 13.15-13B, described herein. Likewise, any of the features, components, and/or parts, including the arrangements and configurations thereof shown and described with reference to the other figures can be included, either alone or in any combination, in the example of the devices, features, components, and parts shown in FIGS. 13.15-13A and 13.15-13B.

In some examples, the device seal can include an asymmetric compressible portion that contacts a user's face. The asymmetry in the design of the compressible portion improves comfort and reduces contact between the user's face and hard edges of the device seal. While the asymmetric compressible portion is described herein as part of a removable device seal, the asymmetric compressible portion can similarly be a part of a fixed or non-removable facial interface to be used with an HMD.

FIG. 13.15-14 illustrates a cross-sectional view of a device seal 13.15-1400. The device seal 13.15-1400 can be substantially similar to, including some or all of the features of, the device seals described herein. The device seal 13.15-1400 can include a facial interface 13.15-1402, and a cover 13.15-1406. The cover 13.15-1406 can be included in the device seal 13.15-1400 to provide a seal between the device seal 13.15-1400 and the outer environment.

The device seal 13.15-1400 can include a frame 13.15-1410, a base 13.15-1414, and a compressible portion 13.15-1416. The frame 13.15-1410 can be physically coupled to a display portion of the HMD, and the frame 13.15-1410 can be configured provide an interface between the display portion and the facial interface 13.15-1402. The facial interface 13.15-1402 can be removably attached to the base 13.15-1414, or non-removably fixed to the base.

The compressible portion 13.15-1416 can fill a gap between the base 13.15-1414 and the facial interface 13.15-1402, and can provide improved user comfort relative to traditional interfaces. The compressible portion 13.15-1416 can also be referred to as a compressible member or a compressible material. In some examples, the compressible portion 13.15-1416 can include a foam material. In some examples, the compressible portion 13.15-1416 can include materials with properties that impart flexibility, softness, compressibility, deformability, and the like. Examples of materials that can be used for the compressible portion 13.15-1416 include, but are in no way limited to, silicone, polymers, elastomers, hydrogels, combinations thereof, or the like. The compressible portion 13.15-1416 can be formed by molding, printing, casting, or the like. In some examples, attachment mechanisms, such as perimeter attachments, can be included on the compressible portion 13.15-1416. The compressible portion 13.15-1416 provides a soft, flexible, deformable interface between the removable facial interface 202 and rigid components of the removable facial interface 13.15-1402, such as the frame 13.15-1410, the connectors, and the base 13.15-1414. This interface can provide for improved user comfort when the HMD is donned.

In some examples, the compressible portion 13.15-1416 extends beyond the edges of the base 13.15-1414. In other words, the compressible portion 13.15-1416 can be wider than the base 13.15-1414, such that the compressible portion 13.15-1416 overhangs the base 13.15-1414. The compressible portion 13.15-1416 can overhang, extend from, or be proud of the cover 13.15-1406. For example, the compressible portion 13.15-1416 can extend a distance d above the edge of the base 13.15-1414. In some examples, the distance "d" can be approximately 3.4 mm. However, as discussed in greater detail below, the width of the compressible portion 13.15-1416 can vary based on the position of the compressible portion 13.15-1416 relative to the user's face when donned. In some examples, the lower part of the compressible portion 13.15-1416 is substantially even or flush with the lower edge of the base 13.15-1416, while the upper part of the compressible portion 13.15-1416 is proud of or extended beyond the upper edge of the base 13.15-1414.

The increased width of the compressible portion 13.15-1416 advantageously increases comfort and wearability of the HMD. As the HMD is worn, the compressible portion 13.15-1416 can bend or fold around the upper edge of the base 13.15-1414. The base 13.15-1414 can, in some examples, be made from a rigid material, such as plastic. Thus, the overhanging compressible portion 13.15-1416 can shield the user's face from the edges of the base 13.15-1414 during use. The overhanging compressible portion 13.15-1416 can also, in some examples, become more compliant over time, improving comfort.

FIG. 13.15-15A illustrates a cross-sectional view of a facial interface 13.15-1502. FIG. 13.15-15B illustrates a cross-sectional view of a forehead region 13.15-1503 of the facial interface 13.15-1502. FIG. 13.15-15C illustrates a cross-sectional view of a cheek region 13.15-1505 of the facial interface 13.15-1502. The facial interface 13.15-15 can be substantially similar to, including some or all of the features of, the facial interfaces described herein.

In some examples, the compressible portion 13.15-1516 can include a central region 13.15-1509 and an extended region 13.15-1507. In some examples, the central region 13.15-1509 and the extended region 13.15-1507 can be a single unitary component (e.g., a foam piece). In some examples, the central region 13.15-1509 can be a separate and distinct material from the extended region 13.15-1507 (e.g., two different types of foam pieces). The central region 13.15-1509 can be shaped, sized, and positioned to correspond to the base of the frame. In other words, the central region 13.15-1509 can reside directly adjacent the base plastic. In contrast, the extended region 13.15-1507 can extend beyond a footprint of the base, such that the extended region 13.15-1507 overhangs the base.

In some examples, the extended region 13.15-1507 can run along an entirety of the facial interface 13.15-1502. The compressible portion 13.15-1516 can have a varying cross-section or be asymmetric relative to the base. The extended region 13.15-1507 can taper as it travels from the forehead region 13.15-1503 to the cheek region 13.15-1505. In other words, the extended region 13.15-1507 can decrease in size as it approaches the cheek region 13.15-1505, so that it is wider at the forehead, and less wide at the cheeks. For example, at the forehead region 13.15-1503, the extended region 13.15-1507 can overhang a base by approximately equal to or greater than 3.4 mm, while at the forehead region 13.15-1505, the extended region 13.15-1507 can overhang a base by approximately equal to or less than 3.4 mm. As shown in FIG. 13.15-15B. As shown, the compressible portion 13.15-1516 can extend beyond or overhang the central region 13.15-1509 and the base plastic both above and below, as oriented in the figures. The varying asymmetric cross-section of the extended region 13.15-1507 can be intentionally varied to correspond to user facial features, thereby increasing comfort and fit of the device seal 13.15-1400 during use.

13.16: Electronic Devices with Light Blocking Structures

Head-mounted devices include head-mounted support structures that allow the devices to be worn on the heads of users. The head-mounted support structures may include device housings for housing components such as displays that are used for presenting a user with visual content. Head-mounted devices may also include a light-shielding nosepiece that rests on the nose of the user. The light-shielding nosepiece may include an elastomeric layer with perforations and fabric that covers the elastomeric layer. The elastomeric layer with the perforations may allow the light-shielding nosepiece to conform to the user's nose while the device is worn, while maintaining enough rigidity to be wrapped by a low force, high stretch textile or other low force, high stretch material. Additional structures, such as rigid structures or semi-rigid structures, may be included in the light-shielding nosepiece to provide additional support for the device while it is worn.

A schematic diagram of an illustrative system having an electronic device with a light-shielding nosepiece is shown in FIG. 13.16-1. As shown in FIG. 13.16-1, system 13.16-8 may include one or more electronic devices such as electronic device 13.16-10. The electronic devices of system 13.16-8 may include computers, cellular telephones, head-mounted devices, wristwatch devices, and other electronic devices. Configurations in which electronic device 13.16-10 is a head-mounted device are sometimes described herein as an example.

As shown in FIG. 13.16-1, electronic devices such as electronic device 13.16-10 may have control circuitry 13.16-12. Control circuitry 13.16-12 may include storage and processing circuitry for controlling the operation of device 13.16-10. Circuitry 13.16-12 may include storage such as hard disk drive storage, nonvolatile memory (e.g., electrically-programmable-read-only memory configured to form a solid-state drive), volatile memory (e.g., static or dynamic random-access-memory), etc. Processing circuitry in control circuitry 13.16-12 may be based on one or more microprocessors, microcontrollers, digital signal processors, baseband processors, power management units, audio chips, graphics processing units, application specific integrated circuits, and other integrated circuits. Software code may be stored on storage in circuitry 13.16-12 and run on processing circuitry in circuitry 13.16-12 to implement control operations for device 13.16-10 (e.g., data gathering operations, operations involved in processing three-dimensional facial image data, operations involving the adjustment of components using control signals, etc.). Control circuitry 13.16-12 may include wired and wireless communications circuitry. For example, control circuitry 13.16-12 may include radio-frequency transceiver circuitry such as cellular telephone transceiver circuitry, wireless local area network (WiFi®) transceiver circuitry, millimeter wave transceiver circuitry, and/or other wireless communications circuitry.

During operation, the communications circuitry of the devices in system 13.16-8 (e.g., the communications circuitry of control circuitry 13.16-12 of device 13.16-10), may be used to support communication between the electronic devices. For example, one electronic device may transmit video and/or audio data to another electronic device in system 13.16-8. Electronic devices in system 13.16-8 may use wired and/or wireless communications circuitry to communicate through one or more communications networks (e.g., the internet, local area networks, etc.). The communications circuitry may be used to allow data to be received by device 13.16-10 from external equipment (e.g., a tethered computer, a portable device such as a handheld device or laptop computer, online computing equipment such as a remote server or other remote computing equipment, or other electrical equipment) and/or to provide data to external equipment.

Device 13.16-10 may include input-output devices 13.16-22. Input-output devices 13.16-22 may be used to allow a user to provide device 13.16-10 with user input. Input-output devices 13.16-22 may also be used to gather information on the environment in which device 13.16-10 is operating. Output components in devices 13.16-22 may allow device 13.16-10 to provide a user with output and may be used to communicate with external electrical equipment.

As shown in FIG. 13.16-1, input-output devices 13.16-22 may include one or more displays such as display 13.16-14. In some configurations, display 13.16-14 of device 13.16-10 includes left and right display panels (sometimes referred to as left and right portions of display 13.16-14 and/or left and right displays) that are in alignment with the user's left and right eyes and are viewable through left and right lens assemblies, respectively. In other configurations, display 13.16-14 includes a single display panel that extends across both eyes.

Display 13.16-14 may be used to display images. The visual content that is displayed on display 13.16-14 may be viewed by a user of device 13.16-10. Displays in device 13.16-10 such as display 13.16-14 may be organic light-emitting diode displays or other displays based on arrays of light-emitting diodes, liquid crystal displays, liquid-crystal-on-silicon displays, projectors or displays based on projecting light beams on a surface directly or indirectly through specialized optics (e.g., digital micromirror devices), electrophoretic displays, plasma displays, electrowetting displays, microLED displays, or any other suitable displays.

Display 13.16-14 may present computer-generated content such as virtual reality content and mixed reality content to a user. Virtual reality content may be displayed in the absence of real-world content. Mixed reality content, which may sometimes be referred to as augmented reality content, may include computer-generated images that are overlaid on real-world images. The real-world images may be captured by a camera (e.g., a forward-facing camera) and merged with overlaid computer-generated content or an optical coupling system may be used to allow computer-generated content to be overlaid on top of real-world images. As an example, a pair of mixed reality glasses or other augmented reality head-mounted display may include a display device that provides images to a user through a beam splitter, prism, holographic coupler, or other optical coupler. Configurations in which display 13.16-14 is used to display virtual reality content to a user through lenses are described herein as an example.

Input-output devices 13.16-22 may include sensors 13.16-16. Sensors 13.16-16 may include, for example, three-dimensional sensors (e.g., three-dimensional image sensors such as structured light sensors that emit beams of light and that use two-dimensional digital image sensors to gather image data for three-dimensional images from light spots that are produced when a target is illuminated by the beams of light, binocular three-dimensional image sensors that gather three-dimensional images using two or more cameras in a binocular imaging arrangement, three-dimensional lidar (light detection and ranging) sensors, three-dimensional radio-frequency sensors, or other sensors that gather three-dimensional image data), cameras (e.g., infrared and/or visible digital image sensors), gaze tracking sensors (e.g., a gaze tracking system based on an image sensor and, if desired, a light source that emits one or more beams of light that are tracked using the image sensor after reflecting from a user's eyes), touch sensors, buttons, force sensors, sensors such as contact sensors based on switches, gas sensors, pressure sensors, moisture sensors, magnetic sensors, audio sensors (microphones), ambient light sensors, microphones for gathering voice commands and other audio input, sensors that are configured to gather information on motion, position, and/or orientation (e.g., accelerometers, gyroscopes, compasses, and/or inertial measurement units that include all of these sensors or a subset of one or two of these sensors), fingerprint sensors and other biometric sensors, optical position sensors (optical encoders), and/or other position sensors such as linear position sensors, and/or other sensors.

User input and other information may be gathered using sensors and other input devices in input-output devices 13.16-22. If desired, input-output devices 13.16-22 may include other devices 13.16-24 such as haptic output devices (e.g., vibrating components), light-emitting diodes and other light sources, speakers such as ear speakers for producing audio output, and other electrical components. Device 13.16-10 may include circuits for receiving wireless power, circuits for transmitting power wirelessly to other devices, batteries and other energy storage devices (e.g., capacitors), joysticks, buttons, and/or other components.

Electronic device 13.16-10 may have housing structures (e.g., housing walls, straps, etc.), as shown by illustrative support structures 13.16-26 of FIG. 13.16-1. In configurations in which electronic device 13.16-10 is a head-mounted device (e.g., a pair of glasses, goggles, a helmet, a hat, a headband, etc.), support structures 13.16-26 may include head-mounted support structures (e.g., a helmet housing, head straps, temples in a pair of eyeglasses, goggle housing structures, and/or other head-mounted structures). The head-mounted support structures may be configured to be worn on a head of a user during operation of device 13.16-10 and may support display(s) 13.16-14, sensors 13.16-16, other components 13.16-24, other input-output devices 13.16-22, and control circuitry 13.16-12.

In some embodiments, support structures 13.16-26 may include a light-shielding nosepiece. The light-shielding nosepiece may be attached to support structures 13.16-26, such as a main housing portion of electronic device 13.16-10, and may rest on the user's nose while device 13.16-10 is worn. The light-shielding nosepiece may be flexible, to allow the nosepiece to conform to the user's nose, while retaining enough rigidity to support device 13.16-10 on the user's face while it is being worn (i.e., to maintain its shape on the user's nose while the device is worn) and to be wrapped by a fabric or other material. If desired, the light-shielding nosepiece may also include stiffeners or other components that help maintain the nosepiece on the user's nose to prevent light from reaching the user's eyes. An example of an illustrative electronic device having a nosepiece is shown in FIG. 13.16-2.

As shown in FIG. 13.16-2, head-mounted device 13.16-10 may include support structures 13.16-26, which may include a head-mounted housing (sometimes referred to as a main housing, main housing unit, head-mounted support structure, etc.). The housing may have walls or other structures that separate an interior housing region from an exterior region surrounding the housing. For example, the housing may have walls formed from polymer, glass, metal, and/or other materials. Electrical and optical components may be mounted in the housing. These components may include components such as integrated circuits, sensors, control circuitry, input-output devices, etc.

To present a user with images for viewing from eye boxes (e.g., eye boxes in which the user's eyes are located when device 13.16-10 is being worn on the user's head), device 13.16-10 may include displays and lenses. These components may be mounted in optical modules or other supporting structure in the housing to form respective left and right optical systems. There may be, for example, a left display for presenting an image through a left lens to a user's left eye in a left eye box and a right display for presenting an image through a right lens to a user's right eye in a right eye box.

If desired, the housing may have forward-facing components such as cameras and other sensors on a front side for gathering sensor measurements and other input and may have a soft cushion on an opposing rear side of the housing. The rear side of the housing may have openings that allow the user to view images (image light 13.16-32) from the left and right optical systems (e.g., when the rear side of the housing is resting on the user's head).

If desired, device 13.16-10 may have an adjustable strap or headband, and if desired, may have other structures (e.g., an over-the-head strap) to help hold the housing on the user's head.

As shown in FIG. 13.16-2, when worn by the user, device 13.16-10 may include a nosepiece, such as nosepiece 13.16-28 that rests on the nasal region the user's head (e.g., on the user's nose). In particular, nosepiece 13.16-28 (sometimes referred to as a light-shielding structure or a light-shielding nosepiece herein) may serve as an extension of the housing that rests on the user's nose and bridges between the opposing cheeks of the user. If desired, nosepiece 13.16-28 may be attached to the housing and/or may include one or more members formed from a portion of the housing. In some embodiments, nosepiece 13.16-28 may be a portion of a light seal or attached to a light seal that extends around some or all of a periphery of the housing (e.g., the light seal is attached to the housing around the periphery). When device 13.16-10 is in use, the light seal may compress against the user's face and prevent interference from ambient light. In general, however, nosepiece 13.16-28 may be attached to the housing in any desired manner.

Nosepiece 13.16-28 may be configured as a light-shielding structure and may therefore be sometimes referred to as light-shielding structure 13.16-28 or light-shielding nosepiece 13.16-28. As an example, it may be desirable to enhance the viewing experience of the user by blocking external environmental light from entering the interior of device 13.16-10 (e.g., from entering the eye boxes) when device 13.16-10 is worn by the user. Nosepiece 13.16-28 may conform to the facial topology of the user around the user's nose and block light from entering the eye boxes. In some illustrative configurations, nosepiece 13.16-28 may be adjustable to conform to varying facial topologies of different users (e.g., portions of nosepiece 13.16-28 may deform differently based on the nose shapes of the users).

Nosepiece 13.16-28 may be mounted to a housing portion of electronic device 13.16-10, such as head-mounted support structures 13.16-26, at mounting points 13.16-30. The housing may include a housing frame that runs along the periphery of device 13.16-10. If desired, the housing frame may be overlapped by a cushion member on the rear side of the housing facing the user. As an example, the cushion member may include foam structures or other soft compressible structures affixed to the housing frame. A fabric may overlap and extend over the housing frame and/or the cushion member on the rear side of the housing. If desired, the fabric may enclose only the cushion member, and the fabric-enclosed cushion member may be removably coupled to the housing frame.

Mounting points 13.16-30 may be located at a bottom portion of the housing frame (e.g., a bottom portion of support structures 13.16-26). As examples, mounting points 13.16-30 may include coupling mechanisms such as magnets, adhesive, hinges, or any other suitable coupling mechanisms.

In the example of FIG. 13.16-2, nosepiece 13.16-28 is attached to support structures 13.16-26 such that nosepiece 13.16-28 extends into a portion of support structures 13.16-26. This is merely illustrative. If desired, the housing frame, a cushion member, and/or fabric may split into multiple portions to surround nosepiece 13.16-28. As an example, a fabric-enclosed cushion member may run in front of nosepiece 13.16-28, and a housing frame may run behind nosepiece 13.16-28. In general, the housing portions, cushion member, and/or fabric may define an opening in which nosepiece 13.16-28 is disposed.

In some illustrative examples, nosepiece 13.16-28 may be removably coupled (via magnetics) to the housing frame or other portions of the housing. In some illustrative examples, a portion of nosepiece 13.16-28 may form an integral portion of the housing frame and/or may not be removable from the housing.

Support structures 13.16-26 (e.g., housing frames) and nosepiece 13.16-28 (along with other desired structures) may define the periphery of the eye boxes of device 13.16-10 at which the user's eyes are located. Components, such as displays, lenses, sensors, etc., may overlap and/or be located within the eye boxes of device 13.16-10, and may be enclosed by and/or mounted to support structures 13.16-26 and/or nosepiece 13.16-28. As illustratively shown in FIGS. 13.16-2, display 13.16-14 emit image light 13.16-32 through a lens to an eye box. Nosepiece 13.16-28 may be configured to block environmental light from an exterior of device 13.16-10 from entering the eye box and interfering with image light 13.16-24. An example of a nosepiece that may be used in device 13.16-10 is shown in FIG. 13.16-3.

As shown in FIG. 13.16-3, a nosepiece, such as nosepiece 13.16-28, may include elastomer 13.16-34 (also referred to as elastomeric layer 13.16-34 herein). Elastomer 13.16-34 may be any desired elastomeric material, such as thermoplastic polyurethane (TPU), nitrile butadiene rubber (NBR), or silicone (such as a low-durometer silicone). Elastomer 13.16-34 may have a thickness of greater than 0.1 mm, greater than 0.25 mm, greater than 0.5 mm, about 1 mm, less than 2 mm, less than 5 mm, etc.

In some embodiments, elastomer 13.16-34 may include perforations 13.16-36. Perforations 13.16-36 may allow elastomer 13.16-34 to bend to accommodate a user's nose (i.e., in the horizontal left and right directions of FIG. 13.16-3), while maintaining sufficient rigidity (i.e., in the vertical up and down directions of FIG. 13.16-3) to support device 13.16-10 on the user's nose. The rigidity of elastomer 13.16-34 may also allow elastomer 13.16-34 to be wrapped by fabric 13.16-38 or other low force, high stretch material.

Perforations 13.16-36 may be formed in any desired pattern. In the example of FIG. 13.16-3, perforations 13.16-36 are slits formed as an array of perforations across the entire surface of elastomer 13.16-34. Perforations 13.16-36 may be formed in a brick pattern, as in FIG. 13.16-3, or may be formed in any other desired pattern. Additionally, any desired number of perforations 13.16-36 may be formed in elastomer 13.16-34, such as at least 1 perforation, at least 5 perforations, or any other desired number of perforations. Perforations 13.16-36 may extend entirely through elastomer 13.16-34, or may extend partially through elastomer 13.16-34.

The use of slits formed in a brick pattern, as shown in FIG. 13.16-3, are merely illustrative. Other illustrative examples of perforations in elastomer 13.16-34 are shown in FIGS. 13.16-4A and 13.16-4B.

As shown in FIG. 13.16-4A, elastomer 13.16-34 may include three-part openings 13.16-37. Three-part openings 13.16-37 may be arranged in a brick pattern, similar to the slits of FIG. 13.16-3. Alternatively, three-part openings 13.16-37 may be formed in any other suitable pattern.

Three-part openings 13.16-37 may allow elastomer 13.16-34 to stretch/deform in two or more axes. As a result, elastomer 13.16-34 (and therefore nosepiece 13.16-28) may contour to a user's nose more accurately (e.g., elastomer 13.16-34 may be able to deform to a user's nose and therefore adapt to the shape of the user's nose). In this way, elastomer 13.16-34 may seal to the user's nose and prevent light from interfering with displays in the head-mounted device.

Different types of perforations may be used in a single elastomeric member. For example, as shown in FIG. 13.16-4B, slits 13.16-36 may be formed on a top half of elastomer 13.16-34, while three-part openings 13.16-37 may be formed on a bottom half of elastomer 13.16-34. In some embodiments, using three-part openings 13.16-37 at the bottom portion of elastomer 13.16-34 may allow elastomer 13.16-34 to stretch more (e.g., along two or more axes) at the user's nose. However, the example of an upper half of elastomer 13.16-34 having slits 13.16-36 and the bottom half having three-part openings 13.16-37 is merely illustrative. In general, slits 13.16-36 and three-part openings (or other suitable perforations) may be formed anywhere on elastomer 13.16-34, and may fill any suitable portion of elastomer 13.16-34 to allow elastomer 13.16-34 to conform to a user's nose.

Elastomer 13.16-34 may have a shape that generally conforms to a user's nose, such as a chevron shape, as shown in FIG. 13.16-3, or any other desired shape, such as a rounded shape, or a rectangular shape.

As shown in FIG. 13.16-3, elastomer 13.16-34 may be covered by fabric 13.16-38. In particular, fabric 13.16-38 may overlap and/or encapsulate elastomer 13.16-34 in region 13.16-40. Fabric region 13.16-40 may have the same shape as elastomer 13.16-34, as shown in FIG. 13.16-3, or may have a different shape than elastomer 13.16-34. Fabric members 13.16-40 and/or 13.16-38 may serve as a light-shielding member or layer for light-shielding structure 13.16-28. In particular, illustrative configurations in which fabric 13.16-40/13.16-38 is a fabric cover (sometimes referred to as a fabric cover layer or a cover layer) are described herein as an illustrative example. To serve light-shielding functions, the fabric cover may be formed from an opaque or light-shielding material (e.g., black yarn) or may formed from an underlying material coated with an opaque or light-shielding material (e.g., black dye or ink). As examples, the fabric cover may be formed any suitable type of fabric such as knit fabric, woven fabric, braided fabric, etc.

Fabric 13.16-40 may be tented over elastomer 13.16-34. Tenting of the fabric cover over an underlying structure may be achieved by the underlying structure contacting or otherwise supporting the fabric cover at one or more points or areas of support as the fabric cover extends over one or more sides of the underlying structure. The tenting of the fabric cover over the underlying structure may cause the fabric cover to follow the general outline of the underlying structure, especially around the areas of support. If desired, differences in the outlines of the fabric cover and of the underlying structure may exist, especially in some regions away from the areas of support, thereby causing some portions of the fabric cover to be suspended in air and therefore readily deflectable. As an example, the fabric cover may be deflectable to the boundary of the underlying structure (or even beyond the boundary of the underlying structure if the boundary is defined by a flexible or deformable member).

The rigidity of elastomer 13.16-34, which is preserved in the vertical direction by perforations 13.16-36, may allow elastomer 13.16-34 to be wrapped by fabric 13.16-40 (or other low force, high stretch textile, or other low force, high stretch material) without deforming. In other words, elastomer 13.16-34 may be rigid enough to maintain its shape while fabric 13.16-40 is applied to/wrapped around elastomer 13.16-34 (as well as to maintain its shape when the device is worn by a user), but flexible enough that it can conform to a user's nose.

In such a way, the fabric cover may have a three-dimensional shape (based on an outline of the underlying structure) that includes portions (e.g., directly supported by the underlying structure) that are more defined and portions (e.g., not directly supported by the underlying structure, suspended in air, etc.) that are less defined, and more flexible or yielding. These less-defined portions (e.g., a yielding fabric surface) may help form flexible boundaries such as those for an opening configured to receive a user's nose.

As a particular illustrative example, the underlying structure may have surfaces that define an opening for accommodating a user's nose. The surfaces may be surrounded by peripheral edges. The fabric cover may be tented over the underlying structure such that the fabric cover is directly supported by the underlying structure along one or more of the peripheral edges of the underlying structure and may be suspended in air around the opening, thereby providing a fabric surface that is deflectable by the user's nose. This may help with improving user comfort as well as providing a more conformal fit when the light shielding structure rests on the user's nose.

Regardless of the shape of fabric region 13.16-40, fabric region 13.16-40 (and/or elastomer 13.16-34) may be bonded to support structures 13.16-26 (such as a housing frame) using adhesive 13.16-42. However, the use of adhesive 13.16-42 is merely illustrative. Fabric 13.16-40 and/or elastomer 13.16-34 may be formed integrally with support structures 13.16-26, or may be attached to support structures 13.16-26 using any desired attachment mechanism.

Although nosepiece 13.16-28 is shown as including both elastomer 13.16-34 and fabric 13.16-40, this is merely illustrative. If desired, nosepiece 13.16-28 may include elastomer 13.16-34 without an overlapping fabric layer. In this case, another layer, such as a polymer or rubber, may overlap elastomer 13.16-34, or elastomer 13.16-34 may directly contact a user's nose as they wear device 13.16-10. Alternatively, nosepiece 13.16-28 may include fabric 13.16-40 without elastomer 13.16-34, if desired. In this case, fabric 13.16-40 may be a flat knit fabric to provide sufficient stretching over a user's nose, while providing enough support for device 13.16-10.

Although fabric 13.16-38/13.16-40 is described as fabric, this is merely illustrative. In general, fabric 13.16-38/13.16-40 may be any low force, high stretch material, such as a low force, high stretch textile.

In some embodiments, although elastomer 13.16-34 may have rigidity to support device 13.16-10 on a user's nose (i.e., in the vertical direction of FIG. 13.16-3) and to be wrapped by fabric, it may be desirable to add additional rigid or semi-rigid structures to a nosepiece. An illustrative example of a nosepiece having a rigid structure is shown in FIG. 13.16-5.

As shown in FIG. 13.16-5, nosepiece 13.16-28 may include fabric 13.16-40 (which may cover an elastomeric layer, such as elastomer 13.16-34) and adhesive 13.16-42, which in turn may attach fabric 13.16-40 to structural frame 13.16-43. Structural frame 13.16-43 may be a plastic frame, as an example. Structural frame 13.16-43 may provide additional rigidity to ensure that nosepiece 13.16-28 retains its shape and support when worn by a user.

Although FIG. 13.16-5 shows the use of adhesive 13.16-42, this is merely illustrative. Adhesive 13.16-42 may be omitted, if desired. In some examples, elastomer 13.16-34 may be co-molded to structural frame 13.16-43. Alternatively, elastomer 13.16-34 may be fit into a recessed portion of structural frame 13.16-43 or otherwise attached to structural frame 13.16-43.

Additionally, although FIG. 13.16-5 shows structural frame 13.16-43 on three sides of fabric 13.16-40/elastomer 13.16-34, this is merely illustrative. Structural frame 13.16-43 may be attached to one side (e.g., the bottom side) of fabric 13.16-40/elastomer 13.16-34 or any other desired number of sides.

Regardless of the attachment of structural frame 13.16-43 to elastomer 13.16-34 and/or fabric 13.16-40, fabric 13.16-40 may extend over all or some of both frame 13.16-43 and/or elastomer 13.16-34. An example of a stack up of nosepiece 13.16-28 is shown in FIG. 13.16-6.

As shown in FIG. 13.16-6, nosepiece 13.16-28 may include fabric 13.16-40, which is shown as having fabric portions 13.16-40-1 and 13.16-40-2, on either side of elastomer 13.16-34. If desired, fabric 13.16-40 may be bonded to elastomer 13.16-34 at a periphery of elastomer 13.16-34, which is shown in FIG. 13.16-6 as points 13.16-44. For example, fabric 13.16-40 may be bonded to elastomer 13.16-34 around a periphery (such as an entire periphery or a portion of the periphery) of the elastomer layer. Fabric 13.16-40 may be bonded to elastomer 13.16-34 using an adhesive or other desired mounting mechanism.

In some cases, it may be desirable to allow elastomer 13.16-34 to move to a greater extent, and therefore leave elastomer 13.16-34 unbonded from fabric 13.16-40. For example, elastomer 13.16-34 may be fully surrounded fabric 13.16-40 and float within the fabric. In some embodiments portions of fabric 13.16-40 may be bonded directly to each other, rather than to elastomer 13.16-34. In this way, elastomer 13.16-34 may float within fabric 13.16-40, which may allow 13.16-34 to move more freely.

Because nosepiece 13.16-28 is designed to block light from reaching the eye boxes of a user wearing device 13.16-10, it may be desirable to ensure a tight fit between nosepiece 13.16-28 and the user's nose and a similarly tight fit between nosepiece 13.16-28 and device 13.16-10. An example of an extension piece that may allow for nosepiece 13.16-28 to fit tightly with device 13.16-10 is shown in FIG. 13.16-7.

As shown in FIG. 13.16-7, extension piece 13.16-46 may be added below nosepiece 13.16-28. In particular, if a user's nose bridge protrudes only a small amount, nosepiece 13.16-28 may not reach the user's nose. Therefore, extension piece 13.16-46 may be attached between support structures of device 13.16-10, such as support structures 13.16-26, and nosepiece 13.16-28. Extension piece 13.16-28 may be formed from fabric, foam, plastic, and/or any other desired material. In some cases, extension piece 13.16-28 may allow nosepiece 13.16-28 to align with other light-blocking structures in device 13.16-10, such as a foam member that fits against the user's face. In this way, light may be prevented from reaching the user's eye boxes and interfering with the user's visibility of a display in device 13.16-10.

In addition or as an alternative to extension piece 13.16-46, it may be desirable to ensure a close fit to a user's nose to prevent light from entering the user's eye boxes. Examples of nosepieces that have additional structures to improve the fit to a user's nose are shown in FIGS. 13.16-8 and 13.16-9.

As shown in FIG. 13.16-8, service loop 13.16-49 may be included within nosepiece 13.16-28. In particular, service loop 13.16-49 (and other portions of nosepiece 13.16-28, if desired) may be attached to supports 13.16-50-1 and 13.16-50-2. Service loop 13.16-49 may be tightened and loosened as desired to conform nosepiece 13.16-28 to the nose of a user. For example, as shown in FIG. 13.16-7, service loop 13.16-49 may be tightened to move nosepiece 13.16-28 to position 13.16-28' by moving nosepiece 13.16-28 downward in direction 13.16-56, right in direction 13.16-52, and left in direction 13.16-54 toward to the nose of the user. In this way, service loop 13.16-49 may allow nosepiece 13.16-28 to fit more securely to the user's nose, preventing light from entering the user's eye boxes through gaps between nosepiece 13.16-28 and the nose.

Alternatively or additionally, nosepiece 13.16-28 may include foam 13.16-48. Foam 13.16-48 may fill a gap between nosepiece 13.16-28 and the user's nose, and may be compressible to allow for a secure fit between nosepiece 13.16-28 and the nose. Foam 13.16-48 may directly contact the nose of the user (e.g., may be on a surface of a fabric layer, such as fabric 13.16-40), as shown in FIG. 13.16-8, may be embedded within nosepiece 13.16-28 (e.g., covered by fabric, such as fabric 13.16-40), or may otherwise be attached to nosepiece 13.16-28.

Instead of service loop 13.16-49, a deformable stiffener, such as deformable stiffener 13.16-58, may be incorporated into nosepiece 13.16-28. As shown in FIG. 13.16-9, deformable stiffener 13.16-58 may allow for nosepiece 13.16-28 to be adjusted in directions 13.16-52, 13.16-54, and 13.16-56 toward the nose of the user to conform nosepiece 13.16-28 to the user's nose at position 13.16-28'. Deformable stiffener 13.16-58 may be formed within nosepiece 13.16-28 (i.e., may be covered by fabric), as shown in FIG. 13.16-9, or may be formed on a surface of the fabric (e.g., an inner or outer surface of fabric 13.16-40). Although not shown in FIG. 13.16-9, a gap-filling foam, such as foam 13.16-48 of FIG. 13.16-8, may be incorporated in or on nosepiece 13.16-28 in addition to deformable stiffener 13.16-58.

In some embodiments, to ensure that nosepiece 13.16-28 is tightly sealed to the nose of a user, internal components of device 13.16-10, such as fans, may be used to move air toward nosepiece 13.16-28, thereby sealing nosepiece 13.16-28 around the user's nose.

In addition to improving the fit of nosepiece 13.16-28 to prevent light from entering the eye boxes of the user, it may also be desirable to incorporate layers into nosepiece 13.16-28 that improve the comfort for the user. Examples of various modifications that may be made to nosepiece 13.16-28 to improve user comfort are shown in FIGS. 13.16-10A-13.16-10G.

As shown in FIG. 13.16-10A, a nosepiece, which includes elastomer 13.16-34 and fabric 13.16-40 (such as nosepiece 13.16-28) may have a rolled edge and may approach the user's nose at a shallow angle of contact to conform to a curved portion of nose 13.16-60. The rolled edge may prevent elastomer 13.16-34 from digging into the user's skin on nose 13.16-60, while the shallower angle of contact may allow the nosepiece to move up the user's nose rather than hitting the user's nose directly. Therefore, by having a rolled edge and/or a shallower angle of contact, nosepiece 13.16-28 may improve comfort for a user of device 13.16-10.

Alternatively or additionally, a nosepiece may include foam, such as foam 13.16-62, between some or all of elastomer 13.16-34 and fabric 13.16-40, as shown in FIG. 13.16-10B. In particular, foam 13.16-62 may be at an edge portion of the nosepiece that contacts the user's nose, and therefore prevent elastomer 13.16-34 from hurting the user's nose or reducing discomfort as the nosepiece pushes against the nose.

In some examples, it may be desirable to have a series of openings in elastomer 13.16-34 that are either unfilled or filled with different material, such as foam. For example, in FIG. 13.16-10C, openings 13.16-64 may be provided in a portion of the nosepiece that will contact the user's nose. Openings 13.16-64 may be through openings, partial openings, may be filled with other material, such as foam, or may otherwise be more flexible than the surrounding regions of elastomer 13.16-34. As the nosepiece pushes against the user's nose, openings 13.16-64 may crumple, thereby preventing or reducing discomfort to the user.

If desired, a portion of fabric may be extended from the portion that contacts the user's nose to provide an additional buffer between the nose and elastomer 13.16-34. As shown in FIG. 13.16-10D, fabric portion 13.16-66 may extend from fabric 13.16-40. When worn by a user, fabric portion 13.16-66 may contact the nose of the user first, and therefore increase the amount of fabric between the nose and elastomer 13.16-34, which may improve user comfort. In some examples, fabric portion 13.16-66 may be a hemmed edge of fabric 13.16-40.

If desired, at least some portions of elastomer 13.16-34 that would otherwise contact the user's nose may be cut and replaced by more flexible material, such as foam. As shown in FIG. 13.16-10E, foam portions 13.16-68 may replace portions of elastomer 13.16-34 that would otherwise contact the user's nose. Although fabric 13.16-40 does not cover foam portions 13.16-68 in FIG. 13.16-10E, fabric 13.16-40 may overlap foam portions 13.16-68, if desired.

In addition to, or instead of, the modifications of FIGS. 13.16-10A-13.16-10E, in which an edge portion of a nosepiece is modified to prevent the elastomer from providing discomfort to a user's nose, a bottom portion of the nosepiece may be modified. As shown in FIG. 13.16-10F, segmented material 13.16-69 may be added to a bottom surface of nosepiece 13.16-28. For example, segmented material 13.16-69 may contact the top of the user's nose (i.e., the nose bridge), and prevent nosepiece 13.16-28 from directly contacting the nose and causing discomfort. Material 13.16-69 may be foam or may be elastomer flaps.

Although FIG. 13.16-10F shows material 13.16-69 as being segmented and non-overlapping, material 13.16-69 may be segmented and overlapping, or may be one connected piece of material, if desired. For example, in FIG. 13.16-10G, foam 13.16-73 may be provided between nosepiece 13.16-28 and the user's nose while device 13.16-10 is worn. If desired, optional deformable stiffener 13.16-71 may be provided on the bottom surface of nosepiece 13.16-28 to improve the fit of nosepiece 13.16-28 on the user's nose. If stiffener 13.16-71 is included, foam 13.16-73 may also prevent stiffener 13.16-71 from directly contacting the user's nose and providing discomfort.

All of the examples in FIGS. 13.16-10A-13.16-10G are merely illustrative examples of improving user comfort while ensuring that a nosepiece fits tightly to the user's nose. The examples are not limiting and may be implemented individually or together in any combination. Regardless of whether any structures in FIGS. 13.16-10A-13.16-10G are used, it may be desirable to strengthen a portion of nosepiece 13.16-28. Although the use of a structural frame was described in connection with FIG. 13.16-5, such a frame may add unnecessary bulk or add too much rigidity to nosepiece 13.16-28 in some cases. Therefore, a semi-rigid member may be used. An example of using a semi-rigid member on a nosepiece is shown in FIG. 13.16-11.

As shown in FIG. 13.16-11, a nosepiece, such as nosepiece 13.16-28, may include portions 13.16-70 and 13.16-72. Portion 13.16-70 may include an elastomer, such as elastomer 13.16-34, and/or a fabric, such as fabric 13.16-40. Portion 13.16-72 may be coupled to portion 13.16-70 and may include a semi-rigid member. In particular, the semi-rigid member may be formed on a bottom portion of nosepiece 13.16-28 (i.e., toward the bottom of the user's nose when device 13.16-10 is worn), and may provide additional rigidity to nosepiece 13.16-28. The semi-rigid members may be formed from any desired material, such as rubber or plastic. In this way, nosepiece 13.16-28 may remain sufficiently flexible to conform to the shape of a user's nose, while retaining its shape when after it has been conformed to the shape of the nose and the device is being worn by the user.

Although nosepieces, such as nosepiece 13.16-28, have been described as including an elastomeric member, such as elastomer 13.16-34, this is merely illustrative. In some embodiments, elastomer 13.16-34 may be omitted. For example, in the example of FIG. 13.16-3, elastomer 13.16-34 may be omitted or may be replaced with thick fabric, which may be surrounded by thinner, more stretchy fabric. In the illustrative example of FIG. 13.16-12, nosepiece 13.16-28 may include fabric 13.16-73 that may be formed from fabric layers 13.16-74 and 13.16-76. Fabric layers 13.16-74 and 13.16-76 may be bonded at points 13.16-78, such as with laser welding, ultrasonic welding, or adhesive. The use of two (or more) fabric layers 13.16-74 and 13.16-76 may make fabric 13.16-73 thicker, thereby providing more support in the region of a user's nose. In general, however, fabric 13.16-73 may include any suitable number of fabric layers.

The foregoing is merely illustrative and various modifications can be made to the described embodiments. The foregoing embodiments may be implemented individually or in any combination.

XIV: Powerstraps and Securement Band

FIG. 14.0-1 illustrates a view of an HMD 14.0-100 including power straps 14.0-102 and a securement band 14.0-104. The power straps 14.0-102 and a securement band 14.0-104 are described in more detail here in section XIV.

14.1: Electrical Connectors

Portable electronic devices, such as smart phones, laptops, tablet computing devices, smart watches, head-mountable devices (also referred to as head-mountable displays (HMDs)), and headphones, have become commonplace for persons undertaking daily activities (travel, communication, education, entertainment, employment, and the like). Indeed, portable electronic devices can provide assistance in completing daily tasks and errands, such as, watching an instructional video or monitoring progress during and after an exercise routine. However, some electronic devices incorporate a temporary or permanent cabled connection to operate (e.g., charging the device, providing electrical power to an electronic component, interconnecting a peripheral input or output device, and the like).

Regarding HMDs, an electronic device can include one or more cabled connections, each of which can have unique and specific requirements. As an example, a temporary or permanent cabled connection can be coupled to a display portion of the HMD. The HMD can include one or more battery packs or electrical power sources that demand regular charging to operate the HMD for an extended period of time. However, a cabled connection to the display portion can inhibit (e.g., snag on a user or objects around the user while in use) or otherwise limit a user from operating the HMD while charging.

In some examples of the present disclosure, a display portion of the HMD can receive electrical power and/or control signals through a support electrically coupled to the display portion. The support can include a plug connector which is connected (structurally and electrically) within a receptacle connector of the display portion. While connected, the support can define an electrical path that enables electrical power and/or control signals to pass between the display portion and another electronic device (e.g., an electrical power source, such as, a battery pack) electrically connected to the support. The support can include a receptacle connector configured to electrically connect an electronic device to the support.

One aspect of the present disclosure relates to an electronic device, (e.g., an HMD) including an enclosure and a receptacle connector coupled or joined to the enclosure. The receptacle connector can include a housing defining an aperture and an internal volume. In some examples, the housing is configured to receive a plug connector of a support within the internal volume. The receptacle connector can include one or more electrical contacts at least partially disposed within the internal volume and contacting one or more correlating electrical contacts on the plug connector. In some examples, the plug connector and the receptacle connector can define respective convex surfaces and respective concave surfaces such that a cross-sectional shape of the plug connector and/or the receptacle connector has a curved longitudinal axis. The electrical contacts of the receptacle connector can be coupled or connected to the housing at angles normal to the concave and convex surfaces of the plug connector, which provides for improved electrical contact between the electrical contacts of the receptacle connector and the plug connector. In some examples, the receptacle connector can include a spring-driven fastener configured to retain the plug connector within the receptacle connector and configured to release the plug connector in response to a tool actuation. Bumpers can be provided in the housing to supply an ejection force to the plug connector, and seals can be provided adjacent an opening of the cavity to provide sealing and/or an ejection force to the plug connector.

In some examples, abruptly or accidentally removing electrical power and/or control signals from an electronic device can damage the components of the electronic device and/or data stored on the electronic device. As such, cabled connections that do not unwantedly or accidentally disconnect can be desirable. In some examples, a cable assembly that reliably interlocks with the electronic device to limit unwanted or accidental extraction of the cable assembly is provided. In some examples, a connection that requires more force to remove the connection than to establish the connection (e.g., disconnecting a cable assembly from a port versus inserting the cable assembly into the port) is provided. In some examples, a cable assembly and a receptacle connector of an electronic device can be configured to prevent damage to the electronic device and loss of data, even in cases in which the cable assembly is accidentally or undesirably extracted from the receptacle connector.

One aspect of the present disclosure relates to an electronic device including an enclosure and a receptacle connector attached to the enclosure. The receptacle connector can form a recess that interlocks or otherwise engages with a plug connector of a cable assembly. In some examples, the plug connector can include a boot, a central member coupled to the boot, and one or more protrusions extending laterally from the central member. The one or more protrusions can extend laterally into a channel, or respective channels, formed within the recess of the receptacle connector.

In some examples, the receptacle connector can include one more detents disposed within the recess. Each of the one or more detents can interlock with a respective protrusion of the central member. The detents can be biased to extend into the recess by one or more leaf springs, canted coil springs, elastic foam, a combination thereof, or another biasing element. Each of the detents can form an angled surface which interfaces with a respective protrusion to retain the plug connector within the receptacle connector. At least one of the spring force of the biasing element and/or the angle of the angled surface can correlate to a force required to extract the plug connector from the receptacle connector. In some examples, each respective angle of the angled surfaces can vary so the plug connector can be more easily extracted by lifting one side of the plug connector (e.g., a non-cable-side) than another side of the plug connector (e.g., a cable-side of the plug connector).

In some examples, the central member can be rotated to interlock (or release) the plug connector and the receptacle connector. In other words, the plug connector can be rotatably received within the receptacle connector. Alternatively, a push-button, a latch, a slide-button, or another actuating mechanism can be used to interlock (or release) the plug connector and the receptacle connector. For example, an actuating mechanism can be incorporated into the boot of the plug connector. Additionally, or alternatively, one or more magnets can be disposed within the plug connector and/or the receptacle connector to orient the plug connector relative to the receptacle connector and/or retain the plug connector to the receptacle connector.

One aspect of the present disclosure relates to an electronic device including a housing that defines an exterior surface of the electronic device. The housing can form an aperture within the exterior surface. An electronic component can be disposed within the housing and can include a receptacle connector coupled to the electronic component. The receptacle connector can be fastened to a trim ring, which can be fastened to the housing. The housing, the trim ring, and the receptacle connector can form an electrical port. The electronic device can further include a first engagement feature and a cable having a plug connector. The plug connector can include a boot, a plug, and a second engagement feature. The boot is receivable within the aperture formed within the exterior surface of the housing and can be receivable within the trim ring. The plug is receivable within the receptacle connector to electrically couple the electronic device with the cable. The second engagement feature can interconnect or otherwise engage the first engagement feature to retain the cable to the electronic device.

In some examples, the first and second engagement features can be one or more: biasing elements, latches, arms, protrusions, recesses, channels, magnets, canted coiled springs, rotating members, sliding members, another type of engagement feature, or a combination thereof. In some examples, the first engagement feature can be included in the trim ring, the second engagement feature can be included in the boot, and the first and second engagement features can latch, interlock, or otherwise secure the boot in the trim ring such that the cable is interconnected with the electronic device. In some examples, the first engagement feature and the second engagement feature can involve a lesser force to connect the cable to the electronic device (e.g., insert the plug connector into the electrical port) and a greater force to disconnect the cable from the electronic device (e.g., remove the plug connector from the electrical port). In other words, a force required to withdraw the plug connector from the electrical port can be sufficiently large to prevent or limit unwanted or accidental removal of the cable from the electronic device. In some examples, the first engagement feature and the second engagement feature can be spring-driven features that are actuated by a tool in order to release the plug connector from the electrical port. In other words, a tool actuation to withdraw the plug connector from the electrical port can prevent or limit unwanted or accidental removal of the cable from the electronic device.

While the electronic devices are described herein as HMDs, the electronic devices can include a smart phone, a laptop, a tablet computing device, a smart watch, headphones, or any other electronic device.

These and other examples are discussed below with reference to FIGS. 14.1-1A through 14.1-35B. However, those skilled in the art will readily appreciate that the detailed description given herein with respect to these figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIGS. 14.1-1A and 14.1-1B show a first electronic device 14.1-100, a cable assembly 14.1-140, and a second electronic device 14.1-130. In some examples, the first electronic device 14.1-100 can be a head-mountable display (HMD) including a display portion 14.1-102 and one or more supports 14.1-120. While the first electronic device 14.1-100 is illustrated as an HMD, the first electronic device 14.1-100 can be a tablet computing device, smart phone, smart watch, or any other electronic device in other examples. The display portion 14.1-102 can output visual content viewable by a user of the electronic device 14.1-100. For example, the display portion 14.1-102 can include a light-emitting diode (LED) display, an organic light-emitting diode (OLED) display, a liquid-crystal display (LCD) display, a micro-LED display, or the like. In some examples, the display portion 14.1-102 can be any form of display now known in the art, or as can be developed in the future.

The supports 14.1-120 can retain the electronic device 14.1-100 relative to a user's head 14.1-110. In some examples, the first electronic device 14.1-100 can include a first support 14.1-120 disposed on a first side of the user's head 14.1-110 and illustrated in FIGS. 14.1-1A and 14.1-1B, and a second support 14.1-120 (not separately illustrated) coupled to the display portion 14.1-102 and disposed on a second side of the user's head 14.1-110 opposite the side of the user's head 14.1-110 illustrated in FIGS. 14.1-1A and 14.1-1B. In some examples, a single support 14.1-120 can be included, and can be a band 14.1-123 or can include a band portion coupled to the display portion 14.1-102. The support 14.1-120 can be configured to wrap around or otherwise encircle a portion of the user's head 14.1-110 and can be coupled to the display portion 14.1-102 at two or more locations. In some examples in which the support 14.1-120 includes a band 14.1-123 or band portion, the support 14.1-120 can be made of an elastomer material which can flex or stretch and thereafter return to an initial state. In other examples, the supports 14.1-120 can be separate structural straps including electronics, processors, speakers, plugs, and/or other functional elements. These structural straps can then be connected to a band 14.1-123 that flexibly engages a user's head to impart a retention force on the system, in connection with facial engagement points. As used herein, the supports will be described as separate structural straps including wires, electronics, speakers, and/or other functional elements.

The supports 14.1-120 can include plug connectors 14.1-122, which can be coupled to receptacle connectors 14.1-104 of the display portion 14.1-120. The receptacle connectors 14.1-104 can include recesses that are configured to receive portions of the supports 14.1-120, such as the plug connectors 14.1-122. As illustrated in FIG. 14.1-1A, the plug connectors 14.1-122 can be disposed at proximal ends of the supports 14.1-120. The plug connectors 14.1-122 and the receptacle connectors 14.1-104 can each include one or more electrical contacts (not separately illustrated) that electrically couple the plug connectors 14.1-122 and the supports 14.1-120 to the display portion 14.1-102. In other words, as shown in FIG. 14.1-1B, the supports 14.1-120 can be electrically coupled to the display portion 14.1-102 through the plug connectors 14.1-122 and the receptacle connectors 14.1-104 when the plug connectors 14.1-122 are coupled to the receptacle connectors 14.1-104 (e.g., the plug connectors 14.1-122 are at least partially disposed within recesses of the receptacle connectors 14.1-104). Examples of the plug connectors 14.1-122 and the receptacle connectors 14.1-104 will be discussed in greater detail below with reference to FIGS. 14.1-2 through 14.1-15. In some examples, the supports 14.1-120 can be welded, adhered, fastened, crimped, clipped, mechanically engaged with, or otherwise retained by the display portion 14.1-102.

The supports 14.1-120 can each include an enclosure 14.1-121 (also referred to as a housing) formed from a polymer, metal, ceramic, or combinations thereof. In some examples, the enclosure 14.1-121 can form a channel or cavity extending between a receptacle connector 14.1-124 of each support 14.1-120 and the plug connector 14.1-122. The supports 14.1-120 can be electrically coupled to the plug connector 14.1-122 (and the display portion 14.1-102 through the plug connector 14.1-122 and the receptacle connector 14.1-104) such that electrical signals and/or electrical power received at the receptacle connector 14.1-124 can be provided to the plug connector 14.1-122 or other electronic components of the first electronic device 14.1-100. For example, one or more electronic components (e.g., printed circuit boards, processors, electrical wires, digital logic circuitry, digital processing circuitry, or the like) can be positioned within the cavity formed within the enclosure 14.1-121 and extend between the receptacle connector 14.1-124 and the plug connector 14.1-122 to form an electrical path between the receptacle connector 14.1-124 and the plug connector 14.1-122.

Each of the supports 14.1-120 can include a receptacle connector 14.1-124 disposed on or within an enclosure 14.1-121. The receptacle connector 14.1-124 can form a recess 14.1-126 that can receive a portion of the cable assembly 14.1-140. The cable assembly 14.1-140 can include a plug connector 14.1-142 at a distal end of the cable assembly 14.1-140. The plug connector 14.1-142 can include a boot 14.1-143 and a central member 14.1-145 at least partially disposed within the boot 14.1-143. The central member 14.1-145 can include one or more electrical contacts (not separately illustrated) that electrically couple the plug connector 14.1-142 to the first electronic device 14.1-100. In other words, as shown in FIG. 14.1-1B, the first electronic device 14.1-100 can be electrically coupled to the second electronic device 14.1-130 through the cable assembly 14.1-140 when the plug connector 14.1-142 is at least coupled to the receptacle connector 14.1-124 (e.g., the central member 14.1-145 is at least partially disposed within the recess 14.1-126). Examples of the receptacle connector 14.1-124 and the plug connector 14.1-142 will be discussed in greater detail below with reference to FIGS. 14.1-16A through 14.1-25B.

As illustrated in FIGS. 14.1-1A and 14.1-1B, each receptacle connector 14.1-124 can be positioned on or within the enclosure 14.1-121 of a respective support 14.1-120. In some examples, the receptacle connector 14.1-124 can be positioned on the enclosure 14.1-121 and disposed a distance from the display portion 14.1-102. The plug connector 14.1-142 can be operably coupled to the enclosure 14.1-121 (e.g., through the receptacle connector 14.1-124 of the enclosure 14.1-121) rather than directly coupling the plug connector 14.1-142 to the display portion 14.1-102. The receptacle connector 14.1-124 can be disposed on or within the enclosure 14.1-121 such that the display portion 14.1-102 and the receptacle connector 14.1-124 are disposed on opposing sides of a user's ear 14.1-112. In some examples, the display portion 14.1-102 can be coupled to a proximal end of the support 14.1-120 and the receptacle connector 14.1-124 can be positioned on or within a distal end of the support 14.1-120 opposite the display portion 14.1-102. In some examples, the receptacle connector 14.1-124 can be disposed on or within the enclosure 14.1-121 between the proximal end and the distal end of the support 14.1-120 such that the display portion 14.1-102 and the user's ear 14.1-112 are disposed on opposing sides of the receptacle connector 14.1-124 (as shown in FIGS. 14.1-1A and 14.1-1B). In some examples, the receptacle connector 14.1-124 can be disposed within the enclosure 14.1-121 at a location that is closer to the distal end than the proximal end. In some examples, the receptacle connector 14.1-124 can be disposed within the enclosure 14.1-121 at a location that is closer to the proximal end than the distal end. In some examples, the receptacle connector 14.1-124 can be disposed behind the user's ear 14.1-112 such that the user's ear 14.1-112 is between the display portion 14.1-102 and the receptacle connector 14.1-124.

Some HMDs utilize a re-chargeable power source (e.g., a battery) affixed to the HMD to provide electrical power to the electronic components (e.g., processors, displays, speakers, and the like). The size or capacity of the re-chargeable power source can be limited by the desired size, shape, and weight of the HMD. After the re-chargeable power source has been substantially depleted of electrical power, the user can be required to discontinue use of the HMD to allow re-charging of the electrical power source.

In some aspects of the present disclosure, rather than solely relying on a power source disposed within the HMD (e.g., the first electronic device 14.1-100), at least one power source (e.g., the second electronic device 14.1-130) can be additionally, or alternatively, electrically coupled to the HMD by a cabled connection (e.g., the cable assembly 14.1-140), which is electrically coupled to the enclosure 14.1-121 of the support 14.1-120 via the receptacle connector 14.1-124. Electrically coupling the power source (e.g., the second electronic device 14.1-130) to the receptacle connector 14.1-124 of the support 14.1-120 can be advantageous. For example, electrical power and/or electrical signals can be provided to the first electronic device 14.1-100, while the second electronic device 14.1-130 is disposed within a case, pocket, pouch, or otherwise retained by the user. Relocating the electrical power source away from the first electronic device 14.1-100 can accommodate a larger electrical power source than can be directly disposed on the first electronic device 14.1-100, which can provide for extended use of the first electronic device 14.1-100. Positioning the receptacle connector 14.1-124 between the proximal end and distal end of the support 14.1-120 can be beneficial in at least partially limiting user contact with the cable assembly 14.1-140 by positioning the cable assembly 14.1-140 at the side of the user rather than dangling or hanging the cable assembly 14.1-140 in front of the user near the first electronic device 14.1-100.

Electrically coupling a power source (e.g., the second electronic device 14.1-130) to the receptacle connector 14.1-124 of the support 14.1-120, as opposed to disposing the power source directly on the display portion 14.1-102 can also enable a reduction in the weight and/or a size of the display portion 14.1-102. A reduction in the weight and/or size of the display portion 14.1-102 can render the first electronic device 14.1-100 more comfortable during use, more convenient to transport, and more convenient to store.

While the receptacle connectors 14.1-124 and the plug connectors 14.1-142 are shown in FIGS. 14.1-1A and 14.1-1B as having cubic shape or square cross-sections, the receptacle connectors 14.1-124 and the plug connectors 14.1-142 can define other shapes and cross-sections in some examples. For example, the cross-sections of the receptacle connectors 14.1-124 and the plug connectors 14.1-142 can be circular or rounded to enable rotation of the plug connectors 14.1-142 relative to the receptacle connectors 14.1-124. In other words, the plug connectors 14.1-142 can be rotatably received within the receptacle connectors 14.1-124.

In some examples, the second electronic device 14.1-130 can provide electrical power and/or electrical signals to the first electronic device 14.1-100 through the cable assembly 14.1-140. For example, the second electronic device 14.1-130 can be an external electrical power source, such as, a lithium battery pack or other device capable of supplying electrical power to the first electronic device 14.1-100. The cable assembly 14.1-140 can include a plug connector 14.1-144, which can be coupled to a receptacle connector 14.1-132 of the second electronic device 14.1-130.

The plug connector 14.1-144 can include a boot 14.1-146 and a plug 14.1-147 at least partially disposed within the boot 14.1-146. The receptacle connector 14.1-132 of the second electronic device 14.1-130 can include a recess configured to receive portions of the plug connector 14.1-144. The plug 14.1-147 can include one or more electrical contacts (not separately illustrated) that electrically couple the plug connector 14.1-144 to the receptacle connector 14.1-132 of the second electronic device 14.1-130. In other words, as shown in FIG. 14.1-1B, the second first electronic device 14.1-130 can be electrically coupled to the cable assembly 14.1-140 through the plug connector 14.1-144 and the receptacle connector 14.1-132. The second electronic device 14.1-130 can be electrically coupled to the first electronic device 14.1-100 through the cable assembly 14.1-140 and the supports 14.1-120. Examples of the receptacle connector 14.1-132 and the plug connector 14.1-144 will be discussed in greater detail below with reference to FIGS. 14.1-26A through 14.1-35B.

As will be discussed in detail below, the various plug connectors and receptacle connectors included in an HMD (e.g., coupling the first electronic device 14.1-100 and the second electronic device 14.1-130) can be fastened to one another through various fastening mechanisms. In some examples, the fastening mechanisms can require a relatively small force to mate a plug connector and a receptacle connector and can require a relatively large force to un-mate the plug connector and the receptacle connector. In some examples, a tool actuation can be required to un-mate a plug connector and a receptacle connector once the plug connector and the receptacle connector are mated. In some examples, various seals can be provided on plug connectors and/or receptacle connectors to provide sealing between the plug connectors and receptacle connectors. The seals can provide forces between the plug connectors and receptacle connectors, such as ejection forces to aid in the removal of plug connectors from receptacle connectors.

FIGS. 14.1-2 through 14.1-15 illustrate various examples of receptacle connectors and plug connectors that can be used as the receptacle connectors 14.1-104 of the display portion 14.1-102 and the plug connectors 14.1-122 of the supports 14.1-120.

FIG. 14.1-2 shows a first electronic device 14.1-200 including a display portion 14.1-202, supports 14.1-210, and a cable assembly 14.1-220. In some examples, the first electronic device 14.1-200 can be a head-mountable device (HMD). While the first electronic device 14.1-200 is illustrated as an HMD, the first electronic device 14.1-200 can be a tablet computing device, a smart phone, a smart watch, headphones, or any other electronic device. The display portion 14.1-202 can output visual content viewable by a user of the first electronic device 14.1-200. The first electronic device 14.1-200, the display portion 14.1-202, the supports 14.1-210, and the cable assembly 14.1-220 can be similar to or the same as the first electronic device 14.1-100, the display portion 14.1-102, the supports 14.1-120, and the cable assembly 14.1-140, respectively, discussed above with respect to FIGS. 14.1-1A and 14.1-1B.

The supports 14.1-210 can retain the first electronic device 14.1-200 relative to a user's head. As illustrated in FIG. 14.1-2, the first electronic device 14.1-200 can include two supports 14.1-210 coupled to the display portion 14.1-202 and configured to be positioned on either side of the user's head. The supports 14.1-210 can be connected to the display portion 14.1-202 at two or more locations.

The supports 14.1-210 can each include a housing or an enclosure 14.1-212 formed from a polymer, metal, ceramic, combination thereof, or the like. In some examples, the enclosure 14.1-212 can form a channel or cavity extending between a receptacle connector 14.1-222 of the support 14.1-210 and a plug connector 14.1-214 of the support 14.1-210. The support 14.1-210 can be electrically coupled to the display portion 14.1-202 such that electrical signals and/or electrical power received at the receptacle connector 14.1-222 can be provided to the display portion 14.1-202 through the plug connector 14.1-214. For example, one or more electronic components (e.g., printed circuit boards, processors, electrical wires, digital logic circuitry, digital processing circuitry, or the like) can be positioned within the cavity formed within the enclosure 14.1-212 and extend between the receptacle connector 14.1-222 and the plug connector 14.1-214 to form an electrical path between the receptacle connector 14.1-222 and the plug connector 14.1-214.

In some examples, the support 14.1-210 can be coupled to the display portion 14.1-202. For example, the support 14.1-210 can be welded, adhered, fastened, crimped, clipped, or otherwise retained within a receptacle connector 14.1-206 of the display portion 14.1-202. In some examples, a proximal end of the support 14.1-210 can be electrically conductive or include the plug connector 14.1-214 that enables electrical power and/or electrical signals received by the receptacle connector 14.1-222 of the support 14.1-210 to be transferred to the display portion 14.1-202 through the plug connector 14.1-214 and the receptacle connector 14.1-206.

As illustrated in FIG. 14.1-2, each of the supports 14.1-210 can include a plug connector 14.1-214 disposed at a proximal end of the support 14.1-210. The plug connector 14.1-214 can be coupled (e.g., electrically and structurally) to the display portion 14.1-202 by disposing the proximal end of the support 14.1-210 into a receptacle connector 14.1-206 coupled to a housing 14.1-204 of the display portion 14.1-202. The receptacle connector 14.1-206 can be positioned on or within the housing 14.1-204 of the display portion 14.1-202. In some examples, the receptacle connector 14.1-206 of the display portion 14.1-202 can be in electrical communication with the receptacle connector 14.1-222 of the support 14.1-210. That is, the cable assembly 14.1-220 can operably couple to the receptacle connector 14.1-222 of the support 14.1-210 rather than directly coupling to the display portion 14.1-202 to electrical power and/or electrical signals can be transferred between the receptacle connector 14.1-222 of the support 14.1-210 and the receptacle connector 14.1-206 of the display portion 14.1-202.

The plug connector 14.1-214 can include one or more electrical contacts 14.1-216A, 14.1-216B, 14.1-216C which electrically couple to respective electrical contacts 14.1-208A, 14.1-208B, and 14.1-208C disposed within the receptacle connector 14.1-206 while the plug connector 14.1-214 is disposed within the receptacle connector 14.1-206. The one or more electrical contacts 14.1-216A, 14.1-216B, 14.1-216C and the correlating one or more electrical contacts 14.1-208A, 14.1-208B, 14.1-208C can provide electrical signals, electrical power, a grounding path, another electrical communication, or a combination thereof between the support 14.1-210 and the display portion 14.1-202.

Electrically coupling a power source (e.g., the second electronic device 104) to the receptacle connector 14.1-222 within the support 14.1-210, as opposed to disposing the power source directly on the display portion 14.1-202 can also enable a reduction in the weight and/or a size of the display portion 14.1-202. A reduction in the weight and/or size of the display portion 14.1-202 can render the first electronic device 14.1-200 more comfortable during use, more convenient to transport, and more convenient to store. While the receptacle connector 14.1-206 and the plug connector 14.1-214 are shown in FIG. 14.1-2 as having a cubic shape or square cross-section, the receptacle connector 14.1-206 and the plug connector 14.1-214 can define other shapes and cross-sections in other examples. For example, the cross-section of the receptacle connector 14.1-206 and the plug connector 14.1-214 can be elongated and/or curved such that the support 14.1-210 can only be inserted into the receptacle connector 14.1-206 of the display portion 14.1-202 in a single orientation.

FIGS. 14.1-3A and 14.1-3B show perspective views of a receptacle connector 14.1-300 and a plug connector 14.1-320. The receptacle connector 14.1-300 can be used as the receptacle connector 14.1-104 or the receptacle connector 14.1-206 and the plug connector 14.1-320 can be used as the plug connector 14.1-122 or the plug connector 14.1-214 of the first electronic devices 14.1-100/14.1-200 of FIGS. 14.1-1A through 14.1-2. The receptacle connector 14.1-300 can include a receptacle housing 14.1-304, one or more electrical contacts (e.g., electrical contacts 14.1-308A, 14.1-308B, and 14.1-308C), a cover member 14.1-302, and a printed circuit board (PCB) 14.1-316.

In some examples, the receptacle housing 14.1-304 can be manufactured from an electrically insulating material, such as, a polymer or ceramic and can be molded, machined, cast, stamped, or a combination thereof. The receptacle housing 14.1-304 can one include or more sidewalls defining a recess 14.1-310. The recess 14.1-310 can be configured to accept and retain the plug connector 14.1-320. For example, at least a portion of the plug connector 14.1-320 can be inserted into and received within the recess 14.1-310. The recess 14.1-310 can define a cross-sectional shape having a longitudinal axis that curves or bends. For example, the recess 14.1-310 can have a cross-sectional shape that substantially conforms to a cross-sectional shape of a plug connector (e.g., the plug connector 14.1-320). In other words, the sidewalls of the receptacle housing 14.1-304 can define a convex surface and a concave surface that correlate in size, shape, and contour with convex and concave surfaces of the plug connector 14.1-320.

The one or more electrical contacts (e.g., the electrical contacts 14.1-308A, 14.1-308B, and 14.1-308C) can extend from a sidewall of the receptacle connector 14.1-300 into the recess 14.1-310. The electrical contacts can provide electrical signals, electrical power, a grounding path, another electrical communication, or a combination thereof to the PCB 14.1-316. In some examples, a first set of electrical contacts, including the electrical contacts 14.1-308A, 14.1-308B, and 14.1-308C, can be disposed on a first side of the recess 14.1-310 and a second set of electrical contacts (not separately illustrated) can be disposed on a second, opposite, side of the recess 14.1-310. As will be discussed in detail below, the electrical contacts can be attached to the receptacle housing 14.1-304 at angles normal to a surface of the plug connector 14.1-320, which the electrical contacts are configured to contact. This provides improved contact between the electrical contacts of the receptacle connector 14.1-300 and electrical contacts of the plug connector 14.1-320.

In FIG. 14.1-3B, the plug connector 14.1-320 can define a top surface and a bottom surface. The top surface can be a convex external surface or otherwise form a radius of curvature. The bottom surface can be a concave external surface extending parallel or substantially parallel to the top surface. One or more electrical contacts (e.g., electrical contacts 14.1-324A, 14.1-324B, and 14.1-324C) can be disposed on the top surface and/or the bottom surface of the plug connector 14.1-320. In some examples, the electrical contacts can be provided on the bottom surface of the plug connector 14.1-320, and the top surface of the plug connector 14.1-320 can be free from any electrical contacts; or the electrical contacts can be provided on the top surface of the plug connector 14.1-320, and the bottom surface of the plug connector 14.1-320 can be free from any electrical contacts.

In some examples, the plug connector 14.1-320 can include one or more guide channels 14.1-328 and one or more retention channels 14.1-326. The guide channels 14.1-328 and/or the retention channels 14.1-326 can be formed within the top surface, the bottom surface, or other surfaces (e.g., side surfaces) of the plug connector 14.1-320. The guide channels 14.1-328 can receive guide rails (such as guide rails 14.1-313, illustrated in FIG. 14.1-5A) of a receptacle connector of a display portion to limit or inhibit movement between a support including the plug connector 14.1-320 and the display portion. The guide channels 14.1-328 can also be beneficial to enable insertion of the plug connector 14.1-320 into a receptacle connector in a limited combination of configurations. For example, a guide rail will prevent insertion of the plug connector 14.1-320 within a receptacle connector unless the plug connector 14.1-320 has a correlating guide channel 14.1-328.

The retention channels 14.1-326 can receive latches 14.1-312 of the receptacle connector 14.1-300 in order to retain the plug connector 14.1-320 within the recess 14.1-310 of the receptacle connector 14.1-300. The retention channels 14.1-326 and the latches 14.1-312 can prevent undesired removal of the plug connector 14.1-320 from the recess 14.1-310. In some examples, the retention channels 14.1-326 and the latches 14.1-312 can retain the plug connector 14.1-320 in the recess 14.1-310 of the receptacle connector 14.1-300 in a position in which electrical contacts of the plug connector 14.1-320 are aligned with electrical contacts of the receptacle connector 14.1-300.

As will be discussed in detail below, the receptacle connector 14.1-314 can include a push block 14.1-314 operably coupled to the latches 14.1-312. The push block 14.1-314 can be actuated by a tool and actuating the push block 14.1-314 can rotate the latches 14.1-312 out of the recess 14.1-310 such that the plug connector 14.1-320 can be removed from the recess 14.1-310. The latches 14.1-312 can be configured such that a large force is required to pull the plug connector 14.1-320 from the recess 14.1-310, but a small force is required to pull the plug connector 14.1-320 from the recess 14.1-310 when the push block 14.1-314 is actuated and the latches 14.1-312 release the plug connector 14.1-320. This allows for the plug connector 14.1-320 to be removed when needed but prevents the plug connector 14.1-320 from being accidentally or unintentionally removed from the receptacle connector 14.1-300.

The guide channels 14.1-328 and the retention channels 14.1-326 are illustrated with partial cylindrical shapes. However, any suitable shapes can be used for the guide channels 14.1-328 and the retention channels 14.1-326, and the guide channels 14.1-328 and the retention channels 14.1-326 can have square, rectangular, semi-circular, triangular, U-shaped, V-shaped, other geometric-shaped, combinations thereof, or the like cross-sectional shapes. In some examples, the cross-sectional shape of the guide channels 14.1-328 and the retention channels 14.1-326 can vary along a length of the channels. For example, the guide channels 14.1-328 and the retention channels 14.1-326 can form rectangular cross-sectional shapes that taper to square cross-section shapes along the length of the respective channels.

The receptacle connector 14.1-300 can include a face seal 14.1-306 adjacent the recess 14.1-310. The face seal 14.1-306 can encircle at least a portion of the recess 14.1-310, such as a distal portion of the recess 14.1-310. The face seal 14.1-306 can act as a seal which prevents or limits ingress of contaminants (e.g., liquid, dust, lint, debris, or the like) into the receptacle connector 14.1-300 through the recess 14.1-310, such as when the plug connector 14.1-320 is inserted into the recess 14.1-310 of the receptacle connector 14.1-300. In some examples, the face seal 14.1-306 can be configured to provide an ejection force to the plug connector 14.1-320. This can aid a user in removing the plug connector 14.1-320 from the receptacle connector 14.1-300, such as when the push block 14.1-314 is actuated.

The cover member 14.1-302 can include an upper portion and a lower portion. The upper portion and the lower portion can be machined, molded, stamped, extruded, or otherwise manufactured from one or more materials, such as a metal, a ceramic, or a polymer. In some examples, the lower portion can at least partially form the holes, which can be used to mount the receptacle connector to a housing or enclosure of a display portion. Each of the upper portion and the lower portion can provide a support structure for the receptacle connector 14.1-300. The upper portion and the lower portion can shield the receptacle connector 14.1-300 from propagating errant electromagnetic waves out of the receptacle connector 14.1-300.

The PCB 14.1-316 can be electrically coupled to the electrical contacts of the receptacle connector 14.1-300 (e.g., the electrical contacts 14.1-308A, 14.1-308B, and 14.1-308C). For example, the PCB 14.1-316 can include one or more electrical traces which carry electrical signals and/or electrical power from the electrical contacts to an electronic component (e.g., a processor, electrical wires, digital logic circuitry, digital processing circuitry, or the like) disposed on the PCB 14.1-316. The PCB 14.1-316 and/or the one or more electronic components electrically coupled to the PCB 14.1-316 can be electrically coupled to one or more electrical wires (not shown) to form at least a portion of an electrical path for electrical signals, electrical power, an electrical ground, another electrical communication, or a combination thereof to transfer between the receptacle connector 14.1-300 and a display or other electronic components within the display portion (e.g., the display portion 14.1-102/14.1-202). Similarly, the PCB 14.1-316 can form at least a portion of an electrical path for electrical signals, electrical power, an electrical ground, another electrical communication, or a combination thereof to transfer between the receptacle connector 14.1-300 and the plug connector 14.1-320.

FIG. 14.1-4 shows an exploded view of the receptacle connector 14.1-300 including the receptacle housing 14.1-304. The receptacle housing 14.1-304 can form slits or slots within the sidewalls of the receptacle housing 14.1-304, which enable a first set of electrical contacts (e.g., the electrical contacts 14.1-308A, 14.1-308B, and 14.1-308C) to extend through the sidewalls and into the recess 14.1-310. In some examples, the receptacle housing 14.1-304 can further include slits or slots within the sidewalls, which enable a second set of electrical contacts (e.g., electrical contacts 14.1-309A, 14.1-309B, and 14.1-309C) to extend through the sidewalls of the receptacle housing 14.1-304 and into the recess 14.1-310. The second set of electrical contacts can extend into the recess 14.1-310 through a different sidewall of the receptacle housing 14.1-304 from the first set of electrical contacts. In some examples, the plug connector 14.1-320 can be devoid of electrical contacts that make contact with both the first set of electrical contacts and the second set of electrical contacts. In other words, one example of a support can include electrical contacts that only utilize one of the sets of electrical contacts shown in FIG. 14.1-4. Another example of a support can include electrical contacts that utilize both sets of electrical contacts shown in FIG. 14.1-4. Thus, a single configuration of the receptacle connector 14.1-300 having two sets of electrical contacts can be operable with multiple configurations of supports (e.g., supports having varied electrical contact configurations).

As shown in FIG. 14.1-4, in some examples, each of the electrical contacts of the first set of electrical contacts can be provided with a corresponding electrical contact of the second set of electrical contacts. Each set of corresponding electrical contacts can be disposed in and coupled to the receptacle housing 14.1-304 at an oblique angle to a longitudinal axis of the recess 14.1-310 (e.g., a lateral axis of the receptacle housing 14.1-304). Each set of electrical contacts can be coupled to the receptacle housing 14.1-304 at an angle normal to a surface of the plug connector 14.1-310 that the electrical contacts are configured to contact. This improves the electrical contact between the electrical contacts of the receptacle connector 14.1-300 and the plug connector 14.1-320. Each set of electrical contacts can also be disposed in and coupled to the receptacle housing 14.1-304 at an angle oblique to other sets of the electrical contacts, such as adjacent sets of electrical contacts.

The receptacle connector 14.1-300 can include a fastening mechanism for retaining the plug connector 14.1-320 in the recess 14.1-310. In the example illustrated in FIG. 14.1-4, the fastening mechanism includes a push block 14.1-314, a spring 14.1-318, a guide rail 14.1-319, and latches 14.1-312. The latches 14.1-312 extend through openings in the receptacle housing 14.1-304 into the recess 14.1-310. The latches 14.1-312 are pivotally coupled to the receptacle housing 14.1-304. The latches 14.1-312 can be in an engaged configuration when the latches 14.1-312 are pivoted into the recess 14.1-310, and in an un-engaged configuration when the latches are pivoted out of the recess 14.1-310.

The push block 14.1-314 is coupled to the latches 14.1-312, the spring 14.1-319, and the guide rail 14.1-319. The push block 14.1-314 is configured to slide along the guide rail 14.1-319 and rotate the latches 14.1-312 between the engaged configuration and the un-engaged configuration. The spring 14.1-318 is configured to retain the push block 14.1-314 in an initial position in which the latches 14.1-312 are in the engaged configuration. A user can use a tool or the like to apply force to the push block 14.1-314 and push the push block 14.1-314 along the guide rail 14.1-319. This rotates the latches 14.1-312 to the un-engaged configuration. Once the latches are in the un-engaged configuration, a plug connector 14.1-320 can be released from the recess 14.1-310 and removed from the receptacle connector 14.1-300. The spring 14.1-318 resists force applied to the push block 14.1-314 and movement of the push block 14.1-314 and returns the push block 14.1-314 to the initial position with the latches 14.1-312 in the engaged configuration once the force is no longer applied to the push block 14.1-314. As such, the latches 14.1-312, the push block 14.1-314, the spring 14.1-318, and the guide rail 14.1-319 are used to retain the plug connector 14.1-320 in the recess 14.1-310 of the receptacle connector 14.1-300 and release the plug connector 14.1-320 from the receptacle connector 14.1-300.

The face seal 14.1-306 can be coupled to a front surface of the receptacle housing 14.1-304 and can encircle the recess 14.1-310. The face seal 14.1-306 can be molded, adhered, welded, fastened, or otherwise secured to a surface of the receptacle housing 14.1-304. In some examples, the face seal 14.1-306 can include an elastic material that can be stretched around a lip of the receptacle housing 14.1-304 and can be secured to the receptacle housing 14.1-304 by interference with the receptacle housing 14.1-304. Bumpers 14.1-307 can be coupled to the receptacle housing 14.1-304 at a back surface of the recess 14.1-310. The bumpers 14.1-307 can be molded, adhered, welded, fastened, or otherwise secured to a surface of the receptacle housing 14.1-304. The bumpers 14.1-307 and the face seal 14.1-306 can provide an ejection force to a plug connector 14.1-320 inserted into the recess 14.1-310 of the receptacle connector 14.1-300. For example, the bumpers 14.1-307 and the face seal 14.1-306 can provide resistance to the plug connector 14.1-320 as the plug connector 14.1-320 is inserted into the recess 14.1-310 and can help to eject the plug connector 14.1-320 from the recess 14.1-310 when the latches 14.1-312 are rotated to the un-engaged configuration. This can allow the plug connector 14.1-320 to be ejected from the recess by actuating the push block 14.1-314 with a tool, and without requiring a user to otherwise pull on the plug connector 14.1-320 or the like. The bumpers 14.1-307 and the face seal 14.1-306 can also retain the electrical contacts of the plug connector 14.1-320 in a desired position relative to the electrical contacts of the receptacle connector 14.1-300.

The cover member 14.1-302 can include an upper portion 14.1-302A, a lower portion 14.1-302B, front portions 14.1-302C, and a rear portion 14.1-302D. Each of the portions of the cover member 14.1-302 can be coupled to the receptacle housing 14.1-304. For example, the portions of the cover member 14.1-302 can adhered (such as by a polymer-based adhesive tape), fastened, welded, or otherwise affixed to the receptacle housing 14.1-304. The cover member 14.1-302 can provide shielding and a support structure for the receptacle housing 14.1-304.

FIGS. 14.1-5A and 14.1-5B illustrate front views of the receptacle connector 14.1-300. As illustrated in FIG. 14.1-5A, the face seal 14.1-306 can encircle the recess 14.1-310 of the receptacle housing 14.1-304. The bumpers 14.1-307 can be disposed at a rear surface of the receptacle housing 14.1-304 adjacent the recess 14.1-310. When the plug connector 14.1-320 is inserted into the recess 14.1-310, the bumpers 14.1-307 can be disposed between the plug connector 14.1-320 and a rear inner surface of the receptacle housing 14.1-304. The bumpers 14.1-307 and the face seal 14.1-306 can each provide an ejection force to the plug connector 14.1-320, as discussed previously.

As illustrated in FIG. 14.1-5A, the receptacle housing 14.1-304 can include one or more guide rails 14.1-313. Each guide rail 14.1-313 can be disposed on a respective sidewall of the receptacle housing 14.1-304 and can extend into the recess 14.1-310. The guide rails 14.1-313 can be molded, co-molded, or otherwise formed with the receptacle housing 14.1-304 as a singular and unitary structure. The guide rails 14.1-313 can be received within guide channels 14.1-328 of the plug connector 14.1-320 to provide a rigid connection between a support including the plug connector 14.1-320 and a display portion including the receptacle connector 14.1-300. In other words, the guide rails 14.1-313 and the guide channels 14.1-328 can limit motion or free play between the support and the display portion. Additionally, or alternatively, the guide rails 14.1-313 can limit or prevent the plug connector 14.1-320 from being inserted into the receptacle connector 14.1-300 in an undesirable orientation and/or configuration.

FIG. 14.1-5B illustrates orientations of the electrical contacts (e.g., the electrical contacts 14.1-308A, 14.1-308B, 14.1-308C, 14.1-309A, 14.1-309B, and 14.1-309C) of the receptacle connector 14.1-300 relative to the receptacle housing 14.1-304. As illustrated in FIG. 14.1-5B, each of the electrical contacts can be disposed at an angle oblique to a lateral axis and a vertical axis of the receptacle housing 14.1-304. The electrical contacts can be disposed such that surfaces of the electrical contacts configured to contact a plug connector 14.1-320 are normal to surfaces of the plug connector 14.1-320 those electrical contacts are configured to contact. This provides for improved contact between the electrical contacts of the receptacle connector 14.1-300 and electrical contacts of the plug connector 14.1-320, as surfaces of the electrical contacts of the receptacle connector 14.1-300 rather than just edges or corners are configured to contact the plug connector 14.1-320. Each of the electrical contacts of the receptacle connector 14.1-300 can also be disposed at an angle oblique to adjacent electrical contacts.

FIGS. 14.1-6A and 14.1-6B illustrate side sectional views of receptacle connectors. In FIG. 14.1-6A, a receptacle connector 14.1-400A includes an electrical contact 14.1-402A vertically stitched to a receptacle housing 14.1-404A. The electrical contact 14.1-402A can have a longitudinal axis extending in a horizontal direction, and the electrical contact 14.1-402A can be stitched to the receptacle housing 14.1-404A in a vertical direction. The electrical contact 14.1-402A can be stitched to the receptacle housing 14.1-404A in a direction perpendicular to an insertion direction of a plug connector. The electrical contact 14.1-402A is configured to contact the plug connector when the plug connector is inserted into a recess 14.1-410 of the receptacle housing 14.1-404A.

A cover member 14.1-406 can be provided around the receptacle housing 14.1-404A to provide support for and shielding of the receptacle housing 14.1-404A. A face seal 14.1-408 can be provided along an inner surface of the receptacle housing 14.1-404A adjacent the recess 14.1-410 into which a plug connector is to be inserted. A bumper 14.1-412 can be provided along an inner surface of the receptacle housing 14.1-404A adjacent the recess 14.1-410, at a back surface of the recess 14.1-410 relative to an opening of the recess 14.1-410 through which the plug connector is to be inserted. The bumper 14.1-412 provides a stop when the plug connector is inserted into the recess 14.1-410, and the bumper 14.1-412 and the face seal 14.1-408 can provide ejection forces to the plug connector when the plug connector is un-latched from the receptacle connector 14.1-400A. The bumper 14.1-412 and the face seal 14.1-408 are configured to be disposed between the plug connector and the receptacle housing 14.1-404A when the plug connector is inserted into the recess 14.1-410.

In FIG. 14.1-6B, a receptacle connector 14.1-400B includes an electrical contact 14.1-402B horizontally stitched to a receptacle housing 14.1-404B. The electrical contact 14.1-402B can have a longitudinal axis extending in a horizontal direction, and the electrical contact 14.1-402B can be stitched to the receptacle housing 14.1-404B in the horizontal direction. The electrical contact 14.1-402B can be stitched to the receptacle housing 14.1-404B in a direction parallel to an insertion direction of a plug connector. The electrical contact 14.1-402B is configured to contact the plug connector when the plug connector is inserted into a recess 14.1-410 of the receptacle housing 14.1-404B.

A cover member 14.1-406 can be provided around the receptacle housing 14.1-404B to provide support for and shielding of the receptacle housing 14.1-404B. A face seal 14.1-408 can be provided along an inner surface of the receptacle housing 14.1-404B adjacent the recess 14.1-410 into which a plug connector is to be inserted. A bumper 14.1-412 can be provided along an inner surface of the receptacle housing 14.1-404B adjacent the recess 14.1-410, at a back surface of the recess 14.1-410 relative to an opening of the recess 14.1-410 through which the plug connector is to be inserted. The bumper 14.1-412 provides a stop when the plug connector is inserted into the recess 14.1-410, and the bumper 14.1-412 and the face seal 14.1-408 can provide ejection forces to the plug connector when the plug connector is un-latched from the receptacle connector 14.1-400B. The bumper 14.1-412 and the face seal 14.1-408 are configured to be disposed between the plug connector and the receptacle housing 14.1-404B when the plug connector is inserted into the recess 14.1-410.

FIGS. 14.1-7A and 14.1-7B illustrate perspective views of a receptacle connector 14.1-500 and a plug connector 14.1-520, respectively. The receptacle connector 14.1-500 includes a receptacle housing 14.1-504 defining a recess 14.1-505 and a cover member 14.1-502 coupled to the receptacle housing 14.1-504. The recess 14.1-505 can be configured to receive the plug connector 14.1-520. The cover member 14.1-502 can be configured to provide support and shielding for the receptacle housing 14.1-504.

A face seal 14.1-510 can be coupled to the receptacle housing 14.1-504, such as adjacent to the recess 14.1-505. The face seal 14.1-510 can surround or encircle the recess 14.1-505 in the receptacle housing 14.1-504. The face seal 14.1-510 can provide sealing between the receptacle housing 14.1-504 and the plug connector 14.1-520 when the plug connector is received in the recess 14.1-505. A bumper 14.1-512 can be coupled to the receptacle housing 14.1-504. The bumper 14.1-512 can be coupled to a surface of the receptacle housing 14.1-504 at a back of the recess 14.1-505. The bumper 14.1-512 can be configured to be disposed between the receptacle housing 14.1-504 and the plug connector 14.1-520 when the plug connector 14.1-520 is inserted into the recess 14.1-505. The bumper 14.1-512 and/or the face seal 14.1-510 can be configured to provide an ejection force to the plug connector 14.1-520. For example, the bumper 14.1-512 and/or the face seal 14.1-510 can resist movement of the plug connector 14.1-520 as the plug connector 14.1-520 is inserted into the recess 14.1-505. After the plug connector 14.1-520 is latched in the recess 14.1-505, the bumper 14.1-512 and/or the face seal 14.1-510 can provide the ejection force to the plug connector 14.1-520 such that the plug connector 14.1-520 is ejected from the recess 14.1-505 when the plug connector is un-latched from the receptacle housing 14.1-504.

The receptacle housing 14.1-504 can further include a latch 14.1-506 rotatably or pivotally coupled to the receptacle housing 14.1-504. The latch 14.1-506 can correspond to a retention channel 14.1-526 formed in a body portion 14.1-522 of the plug connector 14.1-520. The latch 14.1-506 can be pivotable between an engaged configuration and an un-engaged configuration. When the latch 14.1-506 is in the engaged configuration, the latch 14.1-506 extends into the recess 14.1-505 of the receptacle housing 14.1-504, as illustrated in FIG. 14.1-7A. Although the latch 14.1-506 is illustrated as extending into a side portion of the recess 14.1-505, the latch 14.1-506 can be provided in a top portion, a bottom portion, or the like of the recess 14.1-505. When the latch 14.1-506 is in the un-engaged configuration, the latch 14.1-506 can be disposed outside of the recess 14.1-505, or less of the latch 14.1-506 can be disposed in the recess 14.1-505. The latch 14.1-506 can be biased in the engaged configuration by a spring or the like, and can be un-latched by a user, such as with a tool actuation.

The retention channel 14.1-526 can be disposed in a sidewall of the plug connector 14.1-520. The retention channel 14.1-526 can be etched, drilled, molded, co-molded, or otherwise formed with the plug connector 14.1-520 as a singular and unitary structure. As illustrated in FIG. 14.1-7B, the retention channel 14.1-526 can be disposed in the body portion 14.1-522 at an angle perpendicular to an insertion direction 14.1-528 in which the plug connector 14.1-520 is to be inserted into the recess 14.1-505 of the receptacle connector 14.1-500, which can aid in the retention of the plug connector 14.1-520 by the latch 14.1-506. The latch 14.1-506 can be received within the retention channel 14.1-526 of the plug connector 14.1-520 to retain the plug connector 14.1-520 within the recess 14.1-505 of the receptacle connector 14.1-500, when the latch 14.1-506 is in the engaged configuration. The latch 14.1-506 can then be transitioned into the un-engaged configuration to release the plug connector 14.1-520 from the recess 14.1-505 of the receptacle connector 14.1-500.

The receptacle housing 14.1-504 can further include a guide rail 14.1-508, which can correspond to a guide channel 14.1-524 formed in a body portion 14.1-522 of the plug connector 14.1-520. The guide rail 14.1-508 can be disposed on a sidewall of the receptacle housing 14.1-504 and can extend into the recess 14.1-505. The guide rail 14.1-508 can be molded, co-molded, or otherwise formed with the receptacle housing 14.1-504 as a singular and unitary structure. The guide channel 14.1-524 can be disposed in a sidewall of the plug connector 14.1-520. The guide channel 14.1-524 can be etched, drilled, molded, co-molded, or otherwise formed with the plug connector 14.1-520 as a singular and unitary structure. As illustrated in FIG. 14.1-7B, the guide channel 14.1-524 can be disposed in the body portion 14.1-522 at an angle parallel to an insertion direction 14.1-528 in which the plug connector 14.1-520 is to be inserted into the recess 14.1-505 of the receptacle connector 14.1-500. The guide rail 14.1-508 can be received within the guide channel 14.1-524 of the plug connector 14.1-520 to provide a rigid connection between a support including the plug connector 14.1-520 and a display portion including the receptacle connector 14.1-500. In other words, the guide rail 14.1-508 and the guide channel 14.1-524 can limit motion or free play between the support and the display portion. Additionally, or alternatively, the guide rail 14.1-508 can limit or prevent the plug connector 14.1-520 from being inserted into the receptacle connector 14.1-500 in an undesirable orientation and/or configuration.

As illustrated in FIG. 14.1-7A, a fastener 14.1-514 can extend through holes formed in the receptacle housing 14.1-504 and the cover member 14.1-502. The fastener 14.1-514 can be used to attach the receptacle connector to an enclosure or housing of the display portion.

FIG. 14.1-8A illustrates a sectional view of a support 14.1-620 including a plug connector 14.1-624 retained in a receptacle connector 14.1-600. FIG. 14.1-8B illustrates a detailed view of a region 14.1-610 of FIG. 14.1-8A. The receptacle connector 14.1-600 can include a receptacle housing 14.1-602, latches 14.1-604 extending through the receptacle housing 14.1-602 and configured to retain the plug connector 14.1-622, a face seal 14.1-606 coupled to the receptacle housing 14.1-602, and bumper seals 14.1-608 coupled to the receptacle housing 14.1-602. The support 14.1-620 can include the plug connector 14.1-624, an enclosure 14.1-622, and retention channels 14.1-626 formed in the plug connector 14.1-624.

The latches 14.1-604 can be configured to retain the plug connector 14.1-624 in a recess of the receptacle connector 14.1-600. As illustrated in FIG. 14.1-8B, the latches 14.1-604 can extend through a cover member 14.1-612 or the like, which can be coupled to the receptacle housing 14.1-602. The latches 14.1-604 can have trapezoidal shapes, and the retention channels 14.1-626 in the plug connector 14.1-624 can have corresponding trapezoidal shapes. In some examples, the latches 14.1-604 and the retention channels can have rounded shapes, U-shapes, V-shapes, triangular shapes, or any other suitable shapes. The latches 14.1-604 can have widths less than widths of the retention channels 14.1-626, which can provide for deeper engagement of the latches 14.1-604 in the retention channels 14.1-626. In some examples, the latches 14.1-604 can have widths equal to or greater than widths of the retention channels 14.1-626, such that only portions of the latches 14.1-604 extend into the retention channels 14.1-626. This can result in shallower engagement between the latches 14.1-604 and the retention channels 14.1-626 but can also provide a tighter connection between the latches 14.1-604 and the retention channels 14.1-626 and can reduce wiggle or other movement between the plug connector 14.1-624 and the receptacle connector 14.1-600.

The face seal 14.1-606 can be coupled to the receptacle housing 14.1-602 adjacent the recess configured to accept the plug connector 14.1-624. The face seal 14.1-606 can provide sealing between the plug connector 14.1-624 and the receptacle housing 14.1-602. The bumpers 14.1-608 can be provided on a surface of the receptacle housing 14.1-602 at a back of the recess, such that the bumpers 14.1-608 are between the plug connector 14.1-624 and the receptacle housing 14.1-602 when the plug connector 14.1-624 is disposed in the recess. The face seal 14.1-606 and the bumpers 14.1-608 can each be configured to provide an ejection force to the plug connector 14.1-624. For example, when the latches 14.1-604 are in an un-engaged configuration, the face seal 14.1-606 and/or the bumpers 14.1-608 can eject the plug connector 14.1-624 from the recess in the receptacle housing 14.1-602, or aid in the ejection of the plug connector 14.1-624 from the recess in the receptacle housing 14.1-602.

FIGS. 14.1-9A through 14.1-9F illustrate various configurations of latches and retention channels that can be included in receptacle connectors and plug connectors. FIGS. 14.1-9A, 14.1-9C, and 14.1-9E illustrate sectional views, and FIGS. 14.1-9B, 14.1-9D, and 14.1-9F illustrate detail views of regions 14.1-710A, 14.1-710B, and 14.1-710C of FIGS. 14.1-9A, 14.1-9C, and 14.1-9E, respectively.

In FIGS. 14.1-9A and 14.1-9B, a latch 14.1-706A of a receptacle connector 14.1-700A extends through a receptacle housing 14.1-702 and a cover member 14.1-704 adjacent a face seal 14.1-702. The latch 14.1-706A extends into a retention channel 14.1-722A formed in a plug connector 14.1-720. The retention channel 14.1-722A and the latch 14.1-706A can have corresponding trapezoidal cross-sectional shapes; however, any suitable corresponding shapes can be used. The latch 14.1-706A extends into the retention channel 14.1-722A a distance 14.1-$L_1$, which can be in a range from about 0 mm to about 10 mm, from about 1 mm to about 2 mm, from about 2 mm to about 5 mm, from about 0 mm to about 2 mm, or the like. In some examples, side surfaces of the latch 14.1-706A and the retention channel 14.1-722A can taper at an angle in a range from about 0° to about 10°. In the example of FIGS. 14.1-9A and 14.1-9B, tolerances between the latch 14.1-706A and the retention channel 14.1-722A can be relatively large, which results in the latch 14.1-706A extending further into the retention channel 14.1-722A. For example, a ratio of a width of the retention channel 14.1-722A to a width of the latch 14.1-706A can be in a range from about 0.8 to about 1.2, from about 1.0 to about 1.2, from about 0.5 to about 2.0, from about 1.0 to about 1.5, or the like.

In FIGS. 14.1-9C and 14.1-9D, a latch 14.1-706B of a receptacle connector 14.1-700B extends through a receptacle housing 14.1-702 and a cover member 14.1-704 adjacent a face seal 14.1-702. The latch 14.1-706B extends into a retention channel 14.1-722B formed in a plug connector 14.1-720. The retention channel 14.1-722B and the latch 14.1-706B can have corresponding trapezoidal cross-sectional shapes; however, any suitable corresponding shapes can be used. The latch 14.1-706B extends into the retention channel 14.1-722B a distance 14.1-$L_2$, which can be in a range from about 0 mm to about 10 mm, from about 1 mm to about 2 mm, from about 2 mm to about 5 mm, from about 0 mm to about 2 mm, or the like. In some examples, side surfaces of the latch 14.1-706B and the retention channel 14.1-722B can taper at an angle in a range from about 0° to about 10°. In the example of FIGS. 14.1-9C and 14.1-9D, tolerances between the latch 14.1-706B and the retention channel 14.1-722B can be intermediate, which results in the latch 14.1-706B extending less far into the retention channel 14.1-722B than in the example of FIGS. 14.1-9A and 14.1-9B. For example, a ratio of a width of the retention channel 14.1-722B to a width of the latch 14.1-706B can be in a range from about 0.8 to about 1.2, from about 1.0 to about 1.2, from about 0.5 to about 2.0, from about 1.0 to about 1.5, or the like.

In FIGS. 14.1-9E and 14.1-9F, a latch 14.1-706C of a receptacle connector 14.1-700C extends through a receptacle housing 14.1-702 and a cover member 14.1-704 adjacent a face seal 14.1-702. The latch 14.1-706C extends into a retention channel 14.1-722C formed in a plug connector 14.1-720. The retention channel 14.1-722C and the latch 14.1-706C can have corresponding trapezoidal cross-sectional shapes; however, any suitable corresponding shapes can be used. The latch 14.1-706C extends into the retention channel 14.1-722C a distance 14.1-$L_3$, which can be in a range from about 0 mm to about 10 mm, from about 1 mm to about 2 mm, from about 2 mm to about 5 mm, from about 0 mm to about 2 mm, or the like. In some examples, side surfaces of the latch 14.1-706C and the retention channel 14.1-722C can taper at an angle in a range from about 0° to about 10°. In the example of FIGS. 14.1-9E and 14.1-9F, tolerances between the latch 14.1-706C and the retention channel 14.1-722C can be tight, which results in the latch 14.1-706C extending less far into the retention channel 14.1-722C than in the examples of FIGS. 14.1-9A through 14.1-9D. For example, a ratio of a width of the retention channel 14.1-722C to a width of the latch 14.1-706C can be in a range from about 0.8 to about 1.2, from about 1.0 to about 1.2, from about 0.5 to about 2.0, from about 1.0 to about 1.5, or the like.

Examples with larger tolerances between the latch and the retention channel can result in the latch extending deeper into the retention channel, but can result in wiggle or other movement between the latch and the retention channel, and between the plug connector and the receptacle connector. On the other hand, examples with tighter tolerances can result in the latch extending a shallow distance into the retention channel, but can result in less wiggle or other movement between the latch and the retention channel, and between the plug connector and the receptacle connector. Forming the latch and the retention channel with too tight of tolerances, or with the latch having too great a width relative to a width of the retention channel can result in the latch not being capable of engaging with the retention channel.

FIG. 14.1-10 illustrates actuation of a push block 14.1-806 of a receptacle connector 14.1-800 with a tool 14.1-840, which can be used to release a plug connector 14.1-820 from the receptacle connector 14.1-800. The receptacle connector 14.1-800 can include a receptacle housing 14.1-802 and a cover member 14.1-804 coupled to the receptacle housing 14.1-802. A fastening mechanism of the receptacle connector 14.1-800 can include the push block 14.1-806, a spring 14.1-808, and a guide rail 14.1-810. Although not separately illustrated in FIG. 14.1-10, the push block 14.1-806 can be coupled to latches that interact with retention channels of the plug connector 14.1-820 to retain the plug connector 14.1-820 within the receptacle connector 14.1-800. The spring 14.1-808 retains the push block 14.1-806 in an initial position in which the latches are in an engaged configuration. The spring 14.1-808 also resists a force supplied to the push block 14.1-806 by the tool 14.1-840. When the push block 14.1-806 is pushed by the force of the tool 14.1-840, the push block 14.1-806 slides or translates along the guide rail 14.1-810. As the push block 14.1-806 moves along the guide rail 14.1-810, the push block 14.1-806 pivots the latches from the engaged configuration to an un-engaged configuration in which the plug connector 14.1-820 can be removed from the receptacle connector 14.1-800. Once the force is no longer supplied by the tool 14.1-840, the spring 14.1-808 returns the push block 14.1-806 to the initial position and the latches pivot from the un-engaged configuration back to the engaged configuration.

The receptacle connector 14.1-800 further includes a face seal 14.1-814 and bumpers 14.1-812. The face seal 14.1-814 and the bumpers 14.1-812 can be disposed between the plug connector 14.1-820 and the receptacle housing 14.1-802 in a direction parallel to an insertion/extraction direction of the plug connector 14.1-820. This helps the face seal 14.1-814 and/or the bumpers 14.1-812 to provide an ejection force to the plug connector 14.1-820. For example, when the latches are in the un-engaged configuration, the face seal 14.1-814 and/or the bumpers 14.1-812 can provide the ejection force to the plug connector 14.1-820 to push the plug connector 14.1-820 out of the receptacle connector 14.1-800. This allows a user to remove the plug connector 14.1-820 by actuating the push block 14.1-806 with the tool 14.1-840, without having to apply a separate force to the plug connector 14.1-820. In some examples, the ejection force of the face seal 14.1-814 and the bumpers 14.1-812 can be relatively small, and a pull force on the plug connector 14.1-820 can be used in addition to the ejection force to eject the plug connector 14.1-820 from the receptacle connector 14.1-800. In some examples, the bumpers 14.1-812 and the face seal 14.1-814 do not provide the ejection force. For example, the bumpers 14.1-812 can be provided to ensure proper alignment of electrical contacts of the plug connector 14.1-820 with electrical contacts of the receptacle connector 14.1-800. The face seal 14.1-814 can provide sealing between the plug connector 14.1-820 and the receptacle connector 14.1-800.

The receptacle connector 14.1-800 can be mounted to an enclosure 14.1-830 (also referred to as a housing) of a display. In some examples, the receptacle connector 14.1-800 can be mounted to the enclosure 14.1-830 using fasteners; however, any suitable mounting means can be used. The enclosure 14.1-830 can include an opening through which the plug connector 14.1-820 can be inserted into a recess of the receptacle connector 14.1-800. The enclosure 14.1-830 can further include an opening through which the tool 14.1-840 is inserted to interact with the push block 14.1-806.

FIGS. 14.1-11A through 14.1-11D illustrate various configurations of tools that can be used to release a plug connector from a receptacle connector. In FIGS. 14.1-11A through 14.1-11D, a display 14.1-904 is provided in an enclosure 14.1-902 (also referred to as a housing), and a support 14.1-906 is coupled to the enclosure 14.1-902. The support 14.1-906 can include a plug connector, which can be retained in a receptacle connector provided in the enclosure 14.1-902. In FIGS. 14.1-11A, a tool 14.1-900A can include a stadium-shaped handle with a stadium-shaped cutout therein, and a cylindrical-shaped protrusion. The cylinder-shaped protrusion of the tool 14.1-900A can be inserted into a hole in the enclosure 14.1-902 and can actuate a push block or the like to release the plug connector of the support 14.1-906 from the receptacle connector of the enclosure 14.1-902.

In FIG. 14.1-11B, a tool 14.1-900B can include a stadium-shaped handle and a cylindrical-shaped protrusion. The cylinder-shaped protrusion of the tool 14.1-900B can be inserted into a hole in the enclosure 14.1-902 and can actuate a push block or the like to release the plug connector of the support 14.1-906 from the receptacle connector of the enclosure 14.1-902.

In FIG. 14.1-11C, a tool 14.1-900C can include a cylinder-shaped handle and a cylindrical-shaped protrusion. The cylinder-shaped protrusion of the tool 14.1-900C can be inserted into a hole in the enclosure 14.1-902 and can actuate a push block or the like to release the plug connector of the support 14.1-906 from the receptacle connector of the enclosure 14.1-902.

In FIG. 14.1-11D, a tool 14.1-900D can include a handle that interfaces with the support 14.1-906 and a cylindrical-shaped protrusion. The handle of the tool 14.1-900D can be slidably attached to the support 14.1-906 and can be used to align the cylinder-shaped protrusion with a hole in the enclosure. The cylinder-shaped protrusion of the tool 14.1-900D can be inserted into the hole in the enclosure 14.1-902 and can actuate a push block or the like to release the plug connector of the support 14.1-906 from the receptacle connector of the enclosure 14.1-902.

FIGS. 14.1-12A and 14.1-12B illustrate a configuration of a guide rail 14.1-1006 of a receptacle connector 14.1-1000 and a guide channel 14.1-1014 of a plug connector 14.1-1010. The receptacle connector 14.1-1000 can include a receptacle housing 14.1-1002 having a recess 14.1-1004 formed therein. The recess 14.1-1004 can be configured to receive and retain the plug connector 14.1-1010. The guide rail 14.1-1006 can be formed in the receptacle housing 14.1-1002 and can extend into a portion of the recess 14.1-1004. The plug connector 14.1-1012 can include a main body portion 14.1-1012 having the guide channel 14.1-1014 formed therein. As illustrated in FIGS. 14.1-12A and 14.1-12B, the guide rail 14.1-1006 and the guide channel 14.1-1014 can be formed in longitudinally central portions of the receptacle housing 14.1-1002 and the main body 14.1-1012 of the plug connector 14.1-1010, respectively. The guide rail 14.1-1006 and the guide channel 14.1-1014 can be disposed on corresponding portions of the receptacle housing 14.1-1002 and the main body 14.1-1012 and can have shapes corresponding to one another. The guide rail 14.1-1006 can be received within the guide channel 14.1-1014 of the plug connector 14.1-1010 to provide a rigid connection between a support including the plug connector 14.1-1010 and a display portion including the receptacle connector 14.1-1000. In other words, the guide rail 14.1-1006 and the guide channel 14.1-1014 can limit motion or free play between the support and the display portion. Additionally, or alternatively, the guide rail 14.1-1006 can limit or prevent the plug connector 14.1-1010 from being inserted into the receptacle connector 14.1-1000 in an undesirable orientation and/or configuration.

FIGS. 14.1-13A through 14.1-13D illustrate various configurations of face seals that can be included in a receptacle connector 14.1-1100. FIGS. 14.1-13B through 14.1-13D illustrate detail views of region 14.1-1108 illustrated in FIG. 14.1-13A. As illustrated in FIG. 14.1-13A, the receptacle connector 14.1-1100 can include a receptacle housing 14.1-1102, which defines a recess 14.1-1104. A plug connector can be received in the recess 14.1-1104. A face seal 14.1-1106 can be coupled to the receptacle housing 14.1-1102 adjacent the recess 14.1-1104 and can be used to provide sealing between the receptacle housing 14.1-1102 and the plug connector. The face seal 14.1-1106 can further provide an ejection force to the plug connector to assist in the removal of the plug connector from the recess 14.1-1104 of the receptacle connector 14.1-1100.

In FIG. 14.1-13B, a face seal 14.1-1106A coupled to the receptacle housing 14.1-1102 in a region 14.1-1108A extends from the receptacle housing 14.1-1102 at an angle perpendicular to an insertion/extraction direction of the plug connector with respect to the recess 14.1-1104. The face seal 14.1-1106A is then ramped down and extends distally past the receptacle housing 14.1-1102.

In FIG. 14.1-13C, a face seal 14.1-1106B coupled to the receptacle housing 14.1-1102 in a region 14.1-1108B extends from the receptacle housing 14.1-1102 at an angle perpendicular to an insertion/extraction direction of the plug connector with respect to the recess 14.1-1104. The face seal 14.1-1106B is then ramped down and extends distally past the receptacle housing 14.1-1102. The face seal 14.1-1106B can extend a smaller distance from the receptacle housing 14.1-1102 relative to the face seal 14.1-1106A and can be ramped from a proximal edge to a distal edge to a lesser degree relative to the face seal 14.1-1106A. This provides less resistance to insertion and extraction of the plug connector, while still providing good sealing between the plug connector and the receptacle housing 14.1-1102.

In FIG. 14.1-13D, a face seal 14.1-1106C coupled to the receptacle housing 14.1-1102 in a region 14.1-1108C extends from flush with the receptacle housing 14.1-1102, ramps out from the receptacle housing 14.1-1102, and then ramps back towards the receptacle housing 14.1-1102. The face seal 14.1-1106C extends distally past the receptacle housing 14.1-1102. The face seal 14.1-1106C can extend a smaller distance from the receptacle housing 14.1-1102 relative to the face seals 14.1-1106A and 14.1-1106B and can be ramped to lesser degrees relative to the face seals 14.1-1106A and 14.1-1106B. This provides less resistance to insertion and extraction of the plug connector, while still providing good sealing between the plug connector and the receptacle housing 14.1-1102.

FIGS. 14.1-14A and 14.1-14B illustrate a perspective view and a sectional view of a receptacle connector 14.1-1200. FIGS. 14.1-14A and 14.1-14B illustrate gaskets 14.1-1208 that can be provided with fasteners 14.1-1206 to fasten a receptacle housing 14.1-1202 of the receptacle connector 14.1-1200 to an enclosure or housing of a display portion or the like. The receptacle housing 14.1-1202 can include a cover member 14.1-1204 coupled thereto, which provides structural support and shielding for the receptacle housing 14.1-1202. Holes can be provided in the receptacle housing 14.1-1202 and the cover member 14.1-1204, and the gaskets 14.1-1208 and the fasteners 14.1-1206 can be provided in the holes extending through the receptacle housing 14.1-1202 and the cover member 14.1-1204. The fasteners 14.1-1206 can be used to fasten the receptacle housing 14.1-1202 and the cover member 14.1-1204 to the enclosure of the display portion. The gaskets 14.1-1208 can be provided between the fasteners 14.1-1206 and the cover member 14.1-1204/receptacle housing 14.1-1202 to provide give or flexibility between the receptacle connector 14.1-1200 and the enclosure. The gaskets 14.1-1208 can be formed of a relatively soft material, such as a rubber, a polymer, an elastomer, or the like. Providing the gaskets 14.1-1208 allows the receptacle connector 14.1-1200 and a plug connector inserted into the receptacle connector 14.1-1200 to move together, and to move relative to the enclosure. Large forces can be transferred between the plug connector and the receptacle connector 14.1-1200 and providing the gaskets 14.1-1208 limits any negative impacts of these forces from being transferred between the receptacle connector 14.1-1200 and the enclosure.

A plurality of electrical contacts 14.1-1210A, 14.1-1210B, 14.1-1210C, 14.1-1211A, 14.1-1211B, and 14.1-1211B can be coupled to the receptacle housing 14.1-1202. As illustrated in FIG. 14.1-14A, the electrical contacts can be coupled to the receptacle housing 14.1-1202 along a radius of curvature, with each electrical contact being provided at an oblique angle relative to other electrical contacts, such as adjacent electrical contacts. This allows for surfaces of the electrical contacts that are to be in contact with a plug connector inserted into the receptacle connector to be disposed at angles normal to surfaces of the plug connector that the electrical contacts are to contact. This provides for improved electrical contact between the electrical contacts of the receptacle connector 14.1-1200 and electrical contacts of the plug connector.

A fastening mechanism can be provided on the receptacle connector 14.1-1200. The fastening mechanism can include a primary push block 14.1-1212, a spring 14.1-1214, latches 14.1-1220, a secondary push block 14.1-1222, and a guide rail 14.1-1224. The fastening mechanism can be provided to transition the latches 14.1-1220 between an engaged configuration and an un-engaged configuration, which can be used to retain and release the plug connector in the receptacle connector 14.1-1200. The spring 14.1-1214 can be coupled to the cover member 14.1-1204 and/or the receptacle housing 14.1-1202. The primary push block 14.1-1212 can be pivotally coupled to the spring 14.1-1214 and the cover member 14.1-1204 and/or the receptacle housing 14.1-1202. The primary push block 14.1-1212 can be configured to interact with a tool in order to transition the latches 14.1-1220 between the engaged configuration and the un-engaged configuration. The spring 14.1-1214 retains the primary push block 14.1-1212 in an initial position in which the latches 14.1-1220 are in the engaged configuration. The spring 14.1-1214 also resists a force supplied to the primary push block 14.1-1212 by the tool.

The secondary push block 14.1-1222 transfers movement between the primary push block 14.1-1212 and the latches 14.1-1220. The secondary push block 14.1-1222 can be configured to translate along the guide rail 14.1-1224, such that the secondary push block 14.1-1222 moves back and forth in a single direction. Using the tool to actuate the primary push block 14.1-1212 moves the secondary push block 14.1-1222 along the guide rail 14.1-1224, and the secondary push block 14.1-1222 pivots the latches 14.1-1220 from the engaged configuration to the un-engaged configuration. After force from the tool is removed from the primary push block 14.1-1212, the secondary push block 14.1-1222 returns to its initial position and the latches 14.1-1220 return to the engaged configuration. Thus, the fastening mechanism is used to retain and release a plug connector with respect to the receptacle connector 14.1-1200.

FIG. 14.1-15 illustrates an example in which a support 14.1-1320 is fastened to a receptacle connector 14.1-1300 and/or an enclosure 14.1-1330 using fasteners 14.1-1338. The fastening mechanism of FIG. 14.1-15 can be used in addition to or alternative to the fastening mechanisms of FIGS. 14.1-3A through 14.1-14B. The receptacle connector 14.1-1300 can include a receptacle housing 14.1-1302 having a recess 14.1-1304 formed therein. The recess 14.1-1304 can be configured to receive and retain the support 14.1-

1320. Fasteners 14.1-1306 can extend through holes in the receptacle housing 14.1-1302 and can be used to fasten the receptacle connector 14.1-1300 to the enclosure 14.1-1330.

The enclosure 14.1-1330 (also referred to as a housing) can be an enclosure of a display portion or the like. The enclosure 14.1-1330 can include a housing body 14.1-1332, openings 14.1-1334, and openings 14.1-1336. The openings 14.1-1336 can be configured to receive the fasteners 14.1-1306 and can be used to mount the receptacle connector 14.1-1300 to the enclosure 14.1-1330. As will be discussed in greater detail below, the support 14.1-1320 can be fastened to the enclosure 14.1-1330 through the openings 14.1-1334.

The support 14.1-1320 includes a plug connector 14.1-1322 and an enclosure 14.1-1324. Openings 14.1-1326 can be included in the plug connector 14.1-1322 and/or the enclosure 14.1-1324. The plug connector 14.1-1322 can include electrical contacts 14.1-1328A, 14.1-1328B, and 14.1-1328C. Fasteners 14.1-1338 can be provided and can extend through the openings 14.1-1326 in the support 14.1-1320 and into the openings 14.1-1334 in the enclosure 14.1-1330. In some examples, the openings 14.1-1334 can be provided on the receptacle connector 14.1-1300 rather than the enclosure 14.1-1330. Fastening the support 14.1-1320 to the enclosure 14.1-1330 and/or the receptacle connector 14.1-1300 prevents unwanted disconnects of the support 14.1-1320 from the receptacle connector 14.1-1300 and/or the enclosure 14.1-1330. The fasteners 14.1-1338 can be contained within the enclosure 14.1-1330, unseen to a user, and thus accidental removal by a user can be avoided. Fastening the support 14.1-1320 directly to the enclosure 14.1-1330 with the fasteners 14.1-1338 further ensures the support 14.1-1320 does not move relative to the chassis 14.1-1330.

FIGS. 14.1-16A through 14.1-25B illustrate various examples of receptacle connectors and plug connectors that can be used as the receptacle connectors 14.1-124 of the supports 14.1-120 and the plug connectors 14.1-142 of the cable assembly 14.1-140 illustrated in FIGS. 14.1-1A and 14.1-1B.

FIG. 14.1-16A illustrates a side section view of a receptacle connector 14.1-1400 and a cable assembly 14.1-1420 including a plug connector 14.1-1422 inserted into and retained by the receptacle connector 14.1-1400. FIG. 14.1-16B illustrates an electrical contact of the plug connector 14.1-1422 and a raised portion of the receptacle connector 14.1-1400. The cable assembly 14.1-1420 includes a shielded cable 14.1-1426 coupled to the plug connector 14.1-1422. The plug connector 14.1-1422 can include a boot 14.1-1424 and a central member 14.1-1430. In some examples, the boot 14.1-1424 can have a circular or semi-circular cross-sectional shape. The plug connector 14.1-1422 can be centered or substantially centered about a central axis of the circular cross-sectional shape of the boot 14.1-1424. The boot 14.1-1424 can form a cavity or volume and at least a portion of the central member 14.1-1430 and/or a portion of the shielded cable 14.1-1426 can be disposed within the volume.

The central member 14.1-1430 can extend from the boot 14.1-1424. In some examples, the central member 14.1-1430 can have a cylindrical shape that enables rotation of the central member 14.1-1430 within the receptacle connector 14.1-1400. The central member 14.1-1430 can form an external surface and an internal surface. In some examples, the central member 14.1-1430 can include one or more protrusions 14.1-1428 extending laterally from, or substantially perpendicular to, the external surface. In some examples, the central member 14.1-1430 can form a cavity or volume. For example, the internal surface can form a cavity or volume. One or more electrical contacts can be disposed on the internal surface, such as an electrical contact 14.1-1425 illustrated in FIG. 14.1-16B. The one or more electrical contacts can extend into the volume of the central member 14.1-1430 from the internal surface. The one or more electrical contacts can define an electrical grounding path, provide electrical power, and/or provide one or more control signals to the receptacle connector 14.1-1400.

The shielded cable 14.1-1426 can be one or more wires (e.g., metallic wires capable of transferring electrical signals and/or electrical power). The one or more wires can be individually shielded or collectively shielded. The shielding can prevent each of the one or more wires from contacting one another. Additionally, or alternatively, the shielding can prevent or limit the influence of electromagnetic waves on each of the one or more wires.

The receptacle connector 14.1-1400 can be disposed on an enclosure of an electronic device (e.g., the supports 14.1-120 of the first electronic device 14.1-100). In some examples, the receptacle connector 14.1-1400 can be disposed on or within the enclosure, such that a trim ring 14.1-1402 of the receptacle connector 14.1-1400 is at least partially disposed within the enclosure. In some examples, the trim ring 14.1-1402 can be disposed on or within the enclosure such that the trim ring 14.1-1402 is flush with an exterior surface of the enclosure.

In some examples, the receptacle connector 14.1-1400 can include the trim ring 14.1-1402, a base, one or more detents 14.1-1406, and a raised portion 14.1-1404. The trim ring 14.1-1402 can be coupled to the base to form a recess and one or more undercut regions at a periphery of the recess. Each of the undercut regions can house or retain a respective detent 14.1-1406. When the central member 14.1-1430 of the cable assembly 14.1-1420 is disposed within the recess, the protrusion 14.1-1428 can extend into a channel defined by a respective detent 14.1-1406. In some examples, each of the detents 14.1-1406 can be biased toward the raised portion 14.1-1404 by a biasing element. In other words, each detent 14.1-1406 can radially translate within their respective undercut regions toward and away from the raised portion 14.1-1404.

In some examples, the raised portion 14.1-1404 can be disposed in the center of the recess, such that the recess forms a ring within the receptacle connector 14.1-1400. The raised portion 14.1-1404 can be a distinct component of the receptacle connector 14.1-1400. For example, the raised portion 14.1-1404 can be adhered, fastened, interlocked, welded, or otherwise coupled to the base. In some examples, one or more electrical contacts 14.1-1407A and 14.1-1407B can be disposed on the raised portion 14.1-1404 and can be used to provide connections between the raised portion 14.1-1404 and the plug connector 14.1-1422, such as the electrical contact 14.1-1425 of the plug connector 14.1-1422. Each of the one or more electrical contacts 14.1-1407A and 14.1-1407B can physically contact one or more electrical contacts of the plug connector 14.1-1422 (e.g., the electrical contact 14.1-1425) when the plug connector 14.1-1422 is coupled to the receptacle connector 14.1-1400. The raised portion 14.1-1404 can further include one or more electrical contacts 14.1-1409A and 14.1-1409B that provide connections between the raised portion 14.1-1404 and electronic components contained within the enclosure (e.g., processors, electrical wires, digital logic circuitry, digital processing circuitry, or the like).

In some examples, the raised portion 14.1-1404 can include a body 14.1-1414 and a cap 14.1-1412. In some examples, the body 14.1-1414 can be manufactured from a material that electrically insulates the one or more electrical contacts 14.1-1407A, 14.1-1407B, 14.1-1409A, and 14.1-1409B, such that each of the one or more electrical contacts are electrically isolated from one another. For example, each of the one or more electrical contacts can be at least partially disposed within a respective through-hole defined within the body 14.1-1414. The cap 14.1-1412 can be coupled to the body 14.1-1414.

The raised portion 14.1-1404 can include a seal 14.1-1408 extending around a periphery of the body 14.1-1414. As illustrate in FIG. 14.1-16B, the seal 14.1-1408 can encircle the body 14.1-1414 of the raised portion 14.1-1404. The seal 14.1-1408 can act as a seal which prevents or limits ingress of contaminants (e.g., liquid, dust, lint, debris, or the like) into the receptacle connector 14.1-1400 through the recess, such as when the plug connector 14.1-1422 is inserted into the recess of the receptacle connector 14.1-1400.

FIGS. 14.1-17A and 14.1-17B show respective side and bottom views of a cable assembly 14.1-1500 including a plug connector 14.1-1502 and a shielded cable 14.1-1504. The plug connector 14.1-1502 can include a boot 14.1-1506 and a central member 14.1-1508. In some examples, the boot 14.1-1506 can have a circular or semi-circular cross-sectional shape. The plug connector 14.1-1502 can be centered or substantially centered about a central axis of the circular cross-sectional shape of the boot 14.1-1506. For example, as shown in FIG. 14.1-17A, the central member 14.1-1508 can be centered about an axis A that extends through a center of the boot 14.1-1506. The boot 14.1-1506 can form a cavity or volume and at least a portion of the central member 14.1-1508 and/or a portion of the shielded cable 14.1-1504 can be disposed within the volume.

The central member 14.1-1508 can extend from the boot 14.1-1506. In some examples, the central member 14.1-1508 can have a cylindrical shape that enables rotation of the central member 14.1-1508 within a receptacle connector (e.g., the receptacle connector 14.1-1400 of FIG. 14.1-16A). The central member 14.1-1508 can form an external surface 14.1-1510 and an internal surface 14.1-1512. In some examples, the central member 14.1-1508 can include one or more protrusions 14.1-1514 extending laterally from, or substantially perpendicular to, the external surface 14.1-1510. In some examples, the central member 14.1-1508 can form a cavity or volume, for example, the internal surface 14.1-1512 can form a cavity or volume 14.1-1516. One or more electrical contacts 14.1-1518 can be disposed on the internal surface 14.1-1512, such that the one or more electrical contacts 14.1-1518 extend into the volume 14.1-1516 from the internal surface 14.1-1512. The one or more electrical contacts 14.1-1518 can define an electrical grounding path, provide electrical power, and/or provide one or more control signals to a receptacle connector.

The shielded cable 14.1-1504 can be one or more wires (e.g., metallic wires capable of transferring electrical signals and/or electrical power). The one or more wires can be individually shielded or collectively shielded. The shielding can prevent each of the one or more wires from contacting one another. Additionally, or alternatively, the shielding can prevent or limit the influence of electromagnetic waves on each of the one or more wires.

FIGS. 14.1-18A and 14.1-18B show a perspective view and a top view of a receptacle connector 14.1-1600 disposed on an enclosure 14.1-1602 of an electronic device (e.g., the supports 14.1-120 of the first electronic device 14.1-100 of FIGS. 14.1-1A and 14.1-1B). In some examples, the receptacle connector 14.1-1600 can be disposed on or within the enclosure 14.1-1602, such that a trim ring 14.1-1604 of the receptacle connector 14.1-1600 is at least partially disposed within the enclosure 14.1-1602. Alternatively, the trim ring 14.1-1604 can be disposed on or within the enclosure 14.1-1602 such that the trim ring 14.1-1604 is flush with an exterior surface 14.1-1606 of the enclosure 14.1-1602.

In some examples, the receptacle connector 14.1-1600 can include the trim ring 14.1-1604, a base 14.1-1608, one or more detents 14.1-1610, and a raised portion 14.1-1612. The trim ring 14.1-1604 can couple to the base 14.1-1608 to form a recess 14.1-1614 and one or more undercut regions at a periphery of the recess 14.1-1614. Each of the one or more undercut regions can house or retain a respective detent 14.1-1610. While a central member (e.g., the central member 14.1-1508 of FIGS. 14.1-17A and 14.1-17B) is disposed within the recess 14.1-1614, a protrusion (e.g., the protrusions 14.1-1514 of FIGS. 14.1-17A and 14.1-17B) can extend into a channel defined by each of the detents 14.1-1610. In some examples, each of the detents 14.1-1610 can be biased toward the raised portion 14.1-1612 by a biasing element. In other words, each detent 14.1-1610 can radially translate within their respective undercut regions toward and away from the raised portion 14.1-1612.

In some examples, the raised portion 14.1-1612 can be disposed in the center of the recess 14.1-1614, such that the recess 14.1-1614 forms a ring within the receptacle connector 14.1-1600. The raised portion 14.1-1612 can be a distinct component of the receptacle connector 14.1-1600. For example, the raised portion 14.1-1612 can be adhered, fastened, interlocked, welded, or otherwise coupled to the base 14.1-1608. In some examples, one or more electrical contacts 14.1-1618 can be disposed on the raised portion 14.1-1612. Each of the one or more electrical contacts 14.1-1618 can physically contact one or more electrical contacts of the plug connector (e.g., the electrical contacts 14.1-1518 of FIGS. 14.1-17A and 14.1-17B) when the plug connector is coupled to the receptacle connector 14.1-1600.

FIG. 14.1-18C illustrates a sectional view of the receptacle connector of FIGS. 14.1-18A and 14.1-18B. As illustrated in FIG. 14.1-18C, biasing elements 14.1-1611 can be housed within the trim ring 14.1-1604 between the detents 14.1-1610 and the trim ring 14.1-1604. The biasing elements 14.1-1611 can be configured to bias the detents 14.1-1610 radially towards protrusions of the plug connector when the plug connector is inserted into and retained in the recess 14.1-1614 of the receptacle connector 14.1-1600. In other words, each of the detents 14.1-1610 can radially translate within their respective undercut regions toward and away from the raised portion 14.1-1612 to engage and disengage with respective protrusions of the plug connector. The biasing elements 14.1-1611 can provide forces to the detents 14.1-1610 to retain the detents 14.1-1610 in the radially extended position to engage the protrusions of the plug connector, and to resist the detents being disengages from the protrusions of the plug connector. The biasing elements 14.1-1611 are illustrated as a canted coil; however various biasing elements 14.1-1611 can be included, such as a coiled spring, an elastic foam, leaf springs, or the like.

The raised portion 14.1-1612 can include a body 14.1-1626 and a cap 14.1-1628. In some examples, the body 14.1-1626 can be manufactured from a material that electrically insulates one or more electrical contacts of the raised portion 14.1-1612, such that each of the one or more electrical contacts are electrically isolated from one another. For example, each of the one or more electrical contacts can be at least partially disposed within a respective through-hole defined within the body 14.1-1626. The cap 14.1-1628 can be coupled to the body 14.1-1626.

The raised portion 14.1-1612 can include a seal 14.1-1632 extending around a periphery of the body 14.1-1626. As illustrate in FIG. 14.1-18C, the seal 14.1-1632 can encircle the body 14.1-1626 of the raised portion 14.1-1612. The seal 14.1-1632 can act as a seal which prevents or limits ingress of contaminants (e.g., liquid, dust, lint, debris, or the like) into the receptacle connector 14.1-1600 through the recess 14.1-1614, such as when the plug connector is inserted into the recess 14.1-1614 of the receptacle connector 14.1-1600. In the example of FIG. 14.1-18C, the seal 14.1-1632 is disposed between the body 14.1-1626 of the raised portion 14.1-1612 and the base 14.1-1608. The seal 14.1-1632 can further prevent the ingress of contaminants between the raised portion 14.1-1612 and the base 14.1-1608.

FIG. 14.1-18D shows the cable assembly 14.1-1500, including the plug connector 14.1-1502 and the shielded cable 14.1-1504 of FIGS. 14.1-17A and 14.1-17B, being pulled away from the receptacle connector 14.1-1600 of FIGS. 14.1-18A through 14.1-18C. The plug connector 14.1-1502 can be unintentionally and abruptly extracted from the receptacle connector 14.1-1600, for example, when the shielded cable 14.1-1504 snags on an object and pulls the plug connector 14.1-1502 in a direction away from the receptacle connector 14.1-1600 (as represented by the arrow shown in FIG. 14.1-18D). When the plug connector 14.1-1502 is abruptly and/or undesirably extracted from the receptacle connector 14.1-1600, the electrical contacts 14.1-1518A and 14.1-1518B of the plug connector 14.1-1502 can be pulled out of contact with the correlating electrical contacts 14.1-1618A and 14.1-1618B of the receptacle connector 14.1-1600 causing a loss of: electrical power, control signals, an electrical ground, or a combination thereof. An abrupt loss of electrical power, electrical ground, or one or more control signals can damage the electronic device and/or compromise or corrupt information stored on the electronic device.

In some examples, at least one of the electrical contacts (e.g., electrical contact 14.1-1618A) within the receptacle connector 14.1-1600 can detect when the plug connector 14.1-1502 is being removed from the receptacle connector 14.1-1600. For example, the electronic device can detect an undesirable extraction of the plug connector 14.1-1502 from the receptacle connector 14.1-1600 when the electrical contact 14.1-1518A of the plug connector 14.1-1502 is pulled out of contact with the electrical contact 14.1-1618A of the receptacle connector 14.1-1600. An undesirable extraction of the plug connector 14.1-1502 from the receptacle connector 14.1-1600 can occur when the plug connector 14.1-1502 is pulled away from the receptacle connector 14.1-1600 from the side of the plug connector 14.1-1502 where the shielded cable 14.1-1504 enters the boot 14.1-1506. This undesirable extraction scenario can be most probable as the shielded cable 14.1-1504 can get snagged on an object and can pull the plug connector 14.1-1502 away from the receptacle connector 14.1-1600 (as illustrated by the arrow).

In some examples, the electrical contacts 14.1-1618 can be disposed about the raised portion 14.1-1612 such that the electrical contact 14.1-1518A moves out of contact from the electrical contact 14.1-1518A before the electrical contacts 14.1-1518B of the plug connector 14.1-1502 move out of contact with the electrical contact 14.1-1618B of the receptacle connector 14.1-1600. While the electrical contact 14.1-1518A is out of contact from the electrical contact 14.1-1618A but before the electrical contacts 14.1-1518B of the plug connector 14.1-1502 move out of contact with the electrical contact 14.1-1618B of the receptacle connector 14.1-1600, a duration of time can pass. The duration of time can be sufficient to enable the electronic device to mitigate any destructive effects of unintentionally extracting the plug connector 14.1-1502 from the receptacle connector 14.1-1600. The size, shape, and position of each of the electrical contacts 14.1-1518, 14.1-1618 can impact the duration of time when the electrical contact 14.1-1518A is out of contact from the electrical contact 14.1-1618A but before the electrical contacts 14.1-1518B move out of contact with the electrical contact 14.1-1618B.

In some examples, a contact area defined by the electrical contact 14.1-1618A (e.g., a surface area of the electrical contact 14.1-1618 that can be engaged by one or more of the electrical contacts 14.1-1518) can be different from a contact area defined by the electrical contact 14.1-1618B. In other words, each electrical contact 14.1-1618A, 14.1-1618B can be sized or shaped such that one or more correlating electrical contacts 14.1-1518 can physically contact the contact area defined by each respective electrical contact 14.1-1618. As shown in FIG. 14.1-18D, the contact area of the electrical contact 14.1-1618B can be larger than the contact area of the electrical contact 14.1-1618A. As such, the electrical contact 14.1-1618B can interface with more than one corresponding electrical contacts 14.1-1518B while the plug connector 14.1-1502 is inserted into the receptacle connector 14.1-1600. The size, shape, and position of the contact area of each electrical contact 14.1-1518, 14.1-1618 can impact the duration of time when the electrical contact 14.1-1518A is out of contact from the electrical contact 14.1-1618A but before the electrical contacts 14.1-1518B move out of contact with the electrical contact 14.1-1618B.

A loss of the electrical signal passed between the electrical contacts 14.1-1518A, 14.1-1618A can alert the electronic device (e.g., a processor of the electronic device) that an unexpected or undesirable extraction of the plug connector 14.1-1502 is occurring. Accordingly, the electronic device can react to the loss of signal by implementing one or more actions to safeguard the electrical components and information of the electronic device. For example, a processor within the electronic device can: withdraw electrical power from one or more electronic components, cause data to be saved, or perform another preventative task or action. While FIG. 14.1-18D shows the plug connector 14.1-1502 being extracted from the receptacle connector 14.1-1600 from the side of the plug connector 14.1-1502 adjacent the shielded cable 14.1-1504 (e.g., rocking out of the receptacle connector 14.1-1600 starting from the side of the plug connector 14.1-1502 adjacent the shielded cable 14.1-1504), the plug connector 14.1-1502 can be undesirably detached from another side of the plug connector 14.1-1502 in some examples.

FIG. 14.1-18E illustrates various configurations of the raised portion 14.1-1612 that can be used to alter the force required to insert and extract the plug connector 14.1-1502 into and out of the receptacle connector 14.1-1600. As illustrated in FIG. 14.1-18E, side surfaces of the raised portion 14.1-1612 can be disposed at different angles with respect to the base 14.1-1608. In some examples, an angle 14.1-01 between side surfaces of the raised portion 14.1-1612 and the base 14.1-1608 can be in a range from about 95° to about 105°, from about 90° to about 180°, from about 90° to about 120°, from about 95° to about 135°, from about 92° to about 110°, or the like. In some examples, an angle 14.1-02 between side surfaces of the raised portion 14.1-1612 and the base 14.1-1608 can be relatively larger than the angle 14.1-01 and can be in a range from about 95° to about 105°, from about 90° to about 180°, from about 90° to about 120°, from about 95° to about 135°, from about 92° to about 110°, or the like. Providing the angle 14.1-02 between the raised portion 14.1-1612 and the base 14.1-1608 allows the plug connector 14.1-1502 to be inserted into and extracted from the receptacle connector 14.1-1600 with a relatively small force. Providing the angle 14.1-01 between the raised portion 14.1-1612 and the base 14.1-1608 allows the plug connector 14.1-1502 to be inserted into and extracted from the receptacle connector 14.1-1600 with a relatively large force. Thus, the angle between the raised portion 14.1-1612 and the base 14.1-1608 can be selected based on the forces desired to insert the plug connector 14.1-1502 into the receptacle connector 14.1-1600 and to extract the plug connector 14.1-1502 from the receptacle connector 14.1-1600.

FIGS. 14.1-19A through 14.1-19M illustrate various configurations of detents 14.1-1710 that can be included in a receptacle connector 14.1-1700. The receptacle connector 14.1-1700 can include a trim ring 14.1-1704, a base 14.1-1708, a raised portion 14.1-1712, and a recess between the trim ring 14.1-1704 and the raised portion 14.1-1712. The detents 14.1-1710 can be disposed within a cavity formed in the trim ring 14.1-1704.

FIGS. 14.1-19A through 14.1-19C illustrate a detent 14.1-1710A that includes a central region 14.1-1711 and peripheral regions 14.1-1713 on either side of the central region 14.1-1711. The central region 14.1-1711 can be notched to form a channel 14.1-1733 that can receive a protrusion 14.1-1724 of a plug connector 14.1-1720. For example, a lower portion of the central region 14.1-1711 can be notched to form an undercut portion of the detent 14.1-1710A in the central region 14.1-1711. The notches can be omitted from the peripheral regions 14.1-1713, which can prevent, limit, or reduce rotation of the plug connector 14.1-1720. Including the un-notched peripheral regions 14.1-1713 can also increase mating forces and un-mating forces between the plug connector 14.1-1720 and the receptacle connector 14.1-1700.

FIG. 14.1-19C shows a cross-sectional view of the protrusion 14.1-1724 of the plug connector 14.1-1720 disposed within the channel 14.1-1733 and interfacing the detent 14.1-1710A taken along reference line A-A' of FIG. 14.1-19A. In some examples, the detent 14.1-1710A can define the channel 14.1-1733 such that a first surface 14.1-1731 of the channel 14.1-1733 is angled relative to a second surface 14.1-1732 of the channel 14.1-1733 to form an angle 14.1-03. The protrusion 14.1-1714 can engage or contact the first surface 14.1-1730 while disposed within the channel 14.1-1733. The angle 14.1-03 can directly correlate to a force required to overcome a biasing element coupled to the detent 14.1-1710A to cause the detent 14.1-1710A to move away from the central member 14.1-1712 and enable extraction of the protrusion 14.1-1724 from the channel 14.1-1733 (e.g., enabling extraction of the plug connector 14.1-1720 from the receptacle connector 14.1-1700). For example, a relatively smaller angle 14.1-03 can require a relatively greater force to extract the plug connector 14.1-1720 from the receptacle connector 14.1-1700. Alternatively, a relatively larger angle 14.1-03 can require relatively smaller force to extract the plug connector 14.1-1720 from the receptacle connector 14.1-1700. The angle 14.1-03 can be about 30 degrees, between about 30 degrees and about 60 degrees, between about 60 degrees and about 90 degrees, between about 90 degrees and about 120 degrees, between about 120 degrees and about 150 degrees, between about 150 degrees and about 180 degrees, or less than 180 degrees. A third surface 14.1-1730 adjacent the first surface 14.1-1731 can extend in a direction parallel to the second surface 14.1-1732.

FIGS. 14.1-19D through 14.1-19F illustrate a detent 14.1-1710B that includes a central region 14.1-1711 and peripheral regions 14.1-1713 on either side of the central region 14.1-1711. The central region 14.1-1711 can be notched to form a channel 14.1-1733 that can receive a protrusion 14.1-1724 of a plug connector 14.1-1720. For example, a lower portion of the central region 14.1-1711 can be notched to form an undercut portion of the detent 14.1-1710B in the central region 14.1-1711. Further, an upper portion of the central region 14.1-1711 can be notched to form a sloped upper surface of the detent 14.1-1710B in the central region 14.1-1711. The notches can be omitted from the peripheral regions 14.1-1713, which can prevent, limit, or reduce rotation of the plug connector 14.1-1720. Including the un-notched peripheral regions 14.1-1713 can also increase mating forces and un-mating forces between the plug connector 14.1-1720 and the receptacle connector 14.1-1700. In the example of FIGS. 14.1-19D through 14.1-19F, one of the peripheral regions 14.1-1713 can be un-notched, and the other peripheral region 14.1-1713 can be notched, which reduces breakaway forces (e.g., reduces un-mating forces). The notched upper surface of the detent 14.1-1710B can reduce a mating force for mating the plug connector 14.1-1720 in the receptacle connector 14.1-1700. In other words the notched upper surface of the detent 14.1-1710B can reduce the force require to move the protrusions 14.1-1724 past the detent 14.1-1710B into the channel 14.1-1733. Further, the peripheral regions 14.1-1713 can extend radially inward relative to the central region 14.1-1711 and can include protuberances or the like. In the example of FIGS. 14.1-19D through 14.1-19F, protuberances can be included in both of the peripheral regions 14.1-1713. This can increase mating and/or un-mating forces of the plug connector 14.1-1720 relative to the receptacle connector 14.1-1700.

FIG. 14.1-19F shows a cross-sectional view of the protrusion 14.1-1724 of the plug connector 14.1-1720 disposed within the channel 14.1-1733 and interfacing the detent 14.1-1710B taken along reference line A-A' of FIG. 14.1-19D. In some examples, the detent 14.1-1710B can define the channel 14.1-1733 such that a first surface 14.1-1737 of the channel 14.1-1733 is angled relative to a second surface 14.1-1738 of the channel 14.1-1733 to form an angle 14.1-04. The protrusion 14.1-1714 can engage or contact the first surface 14.1-1737 while disposed within the channel 14.1-1733. The angle 14.1-04 can directly correlate to a force required to overcome a biasing element coupled to the detent 14.1-1710B to cause the detent 14.1-1710B to move away from the central member 14.1-1712 and enable extraction of the protrusion 14.1-1724 from the channel 14.1-1733 (e.g., enabling extraction of the plug connector 14.1-1720 from the receptacle connector 14.1-1700). For example, a relatively smaller angle 14.1-04 can require a relatively greater force to extract the plug connector 14.1-1720 from the receptacle connector 14.1-1700. Alternatively, a relatively larger angle 14.1-04 can require relatively smaller force to extract the plug connector 14.1-1720 from the receptacle connector 14.1-1700. The angle 14.1-04 can be about 30 degrees, between about 30 degrees and about 60 degrees, between about 60 degrees and about 90 degrees, between about 90 degrees and about 120 degrees, between about 120 degrees and about 150 degrees, between about 150 degrees and about 180 degrees, or less than 180 degrees. A third surface 14.1-1736 adjacent the first surface 14.1-1737 can extend in a direction parallel to the second surface 14.1-1738.

In some examples, a top surface of the detent 14.1-1710B is also notched. As such, a fourth surface 14.1-1734 of the detent 14.1-1710B is angled relative to the third surface 14.1-1736 of the detent 14.1-1710B to form an angle. The protrusion 14.1-1714 can engage or contact the fourth surface 14.1-1734 as the protrusion 14.1-1714 is inserted into the channel 14.1-1733. The angle can directly correlate to a force required to overcome a biasing element coupled to the detent 14.1-1710B to cause the detent 14.1-1710B to move away from the central member 14.1-1712 and enable insertion of the protrusion 14.1-1724 into the channel 14.1-1733 (e.g., enabling insertion of the plug connector 14.1-1720 from the receptacle connector 14.1-1700). For example, a relatively smaller angle can require a relatively greater force to extract the plug connector 14.1-1720 from the receptacle connector 14.1-1700. Alternatively, a relatively larger angle can require relatively smaller force to extract the plug connector 14.1-1720 from the receptacle connector 14.1-1700. The angle can be about 30 degrees, between about 30 degrees and about 60 degrees, between about 60 degrees and about 90 degrees, between about 90 degrees and about 120 degrees, between about 120 degrees and about 150 degrees, between about 150 degrees and about 180 degrees, or less than 180 degrees.

FIGS. 14.1-19G and 14.1-19H illustrate a detent 14.1-1710C that includes a central region 14.1-1711 and a peripheral region 14.1-1713 on one side of the central region 14.1-1711. The central region 14.1-1711 can be notched to form a channel 14.1-1733 that can receive a protrusion 14.1-1724 of a plug connector 14.1-1720. The central region 14.1-1711 can also be notched to form a notched top surface. For example, a lower portion of the central region 14.1-1711 can be notched to form an undercut portion of the detent 14.1-1710C in the central region 14.1-1711. Further, an upper portion of the central region 14.1-1711 can be notched to form a sloped upper surface of the detent 14.1-1710C in the central region 14.1-1711. The notches can be omitted from the peripheral region 14.1-1713, which can prevent, limit, or reduce rotation of the plug connector 14.1-1720. Including the un-notched peripheral region 14.1-1713 can also increase mating forces and un-mating forces between the plug connector 14.1-1720 and the receptacle connector 14.1-1700. In the example of FIGS. 14.1-19G and 14.1-19H, the peripheral region 14.1-1713 can be un-notched, which can increase mating and/or un-mating forces between the plug connector 14.1-1720 and the receptacle connector 14.1-1700. The notched upper surface of the detent 14.1-1710C can reduce a mating force for mating the plug connector 14.1-1720 in the receptacle connector 14.1-1700. In other words, the notched upper surface of the detent 14.1-1710C can reduce the force require to move the protrusions 14.1-1724 past the detent 14.1-1710C into the channel 14.1-1733. Further, the peripheral region 14.1-1713 can extend radially inward relative to the central region 14.1-1711 and can include a protuberance or the like. In the example of FIGS. 14.1-19G and 14.1-19H, a protuberance can be included in the un-notched peripheral region 14.1-1713 of the detent 14.1-1710C. This can increase mating and/or un-mating forces of the plug connector 14.1-1720 relative to the receptacle connector 14.1-1700. A cross-sectional view of the detent 14.1-1710C taken along cross-section A-A' of FIG. 14.1-19G can be the same as or similar to the cross-sectional view of FIG. 14.1-19F, discussed above.

FIGS. 14.1-19I through 14.1-19K illustrate a detent 14.1-1710D that includes a central region 14.1-1711 and a peripheral region 14.1-1713 on one side of the central region 14.1-1711. The central region 14.1-1711 can be notched to form a channel 14.1-1733 that can receive a protrusion 14.1-1724 of a plug connector 14.1-1720. For example, a lower portion of the central region 14.1-1711 can be notched to form an undercut portion of the detent 14.1-1710D in the central region 14.1-1711. Further, an upper portion of the central region 14.1-1711 and the peripheral region 14.1-1713 can be notched to form a sloped upper surface of the detent 14.1-1710D in the central region 14.1-1711 and the peripheral region 14.1-1713. In the example of FIGS. 14.1-19I through 14.1-19K, the notched portions of the detent 14.1-1710D can reduce mating and/or un-mating forces of the plug connector 14.1-1720 relative to the receptacle connector 14.1-1700. The peripheral region 14.1-1713 can extend radially inward relative to the central region 14.1-1711 and can include a protuberance or the like. In the example of FIGS. 14.1-19I through 14.1-19K, a protuberance can be included in the peripheral region 14.1-1713 with the un-notched lower portion and the notched upper portion. This can increase mating and/or un-mating forces of the plug connector 14.1-1720 relative to the receptacle connector 14.1-1700.

FIG. 14.1-19K shows a cross-sectional view of the protrusion 14.1-1724 of the plug connector 14.1-1720 disposed within the channel 14.1-1733 and interfacing the detent 14.1-1710D taken along reference line A-A' of FIG. 14.1-19I. In some examples, the detent 14.1-1710D can define the channel 14.1-1733 such that a first surface 14.1-1744 of the channel 14.1-1733 is angled relative to a second surface 14.1-1746 of the channel 14.1-1733 to form an angle 14.1-05. The protrusion 14.1-1714 can engage or contact the first surface 14.1-1744 while disposed within the channel 14.1-1733. The angle 14.1-05 can directly correlate to a force required to overcome a biasing element coupled to the detent 14.1-1710D to cause the detent 14.1-1710D to move away from the central member 14.1-1712 and enable extraction of the protrusion 14.1-1724 from the channel 14.1-1733 (e.g., enabling extraction of the plug connector 14.1-1720 from the receptacle connector 14.1-1700). For example, a relatively smaller angle 14.1-05 can require a relatively greater force to extract the plug connector 14.1-1720 from the receptacle connector 14.1-1700. Alternatively, a relatively larger angle 14.1-05 can require relatively smaller force to extract the plug connector 14.1-1720 from the receptacle connector 14.1-1700. The angle 14.1-05 can be about 30 degrees, between about 30 degrees and about 60 degrees, between about 60 degrees and about 90 degrees, between about 90 degrees and about 120 degrees, between about 120 degrees and about 150 degrees, between about 150 degrees and about 180 degrees, or less than 180 degrees. A third surface 14.1-1742 adjacent the first surface 14.1-1744 can extend in a direction parallel to the second surface 14.1-1746.

In some examples, a top surface of the detent 14.1-1710D is also notched. As such, a fourth surface 14.1-1740 of the detent 14.1-1710D is angled relative to the third surface 14.1-1742 of the detent 14.1-1710D to form an angle 14.1-06. The protrusion 14.1-1714 can engage or contact the fourth surface 14.1-1740 as the protrusion 14.1-1714 is inserted into the channel 14.1-1733. The angle 14.1-06 can directly correlate to a force required to overcome a biasing element coupled to the detent 14.1-1710D to cause the detent 14.1-1710D to move away from the central member 14.1-1712 and enable insertion of the protrusion 14.1-1724 into the channel 14.1-1733 (e.g., enabling insertion of the plug connector 14.1-1720 from the receptacle connector 14.1-1700). For example, a relatively smaller angle 14.1-06 can require a relatively greater force to extract the plug connector 14.1-1720 from the receptacle connector 14.1-1700. Alternatively, a relatively larger angle 14.1-06 can require relatively smaller force to extract the plug connector 14.1-1720 from the receptacle connector 14.1-1700. The angle 14.1-06 can be about 30 degrees, between about 30 degrees and about 60 degrees, between about 60 degrees and about 90 degrees, between about 90 degrees and about 120 degrees, between about 120 degrees and about 150 degrees, between about 150 degrees and about 180 degrees, or less than 180 degrees.

FIGS. 14.1-19L and 14.1-19M illustrate a detent 14.1-1710E that includes a central region 14.1-1711 and a peripheral region 14.1-1713 on one side of the central region 14.1-1711. The central region 14.1-1711 can be notched to form a channel 14.1-1733 that can receive a protrusion 14.1-1724 of a plug connector 14.1-1720. For example, a lower portion of the central region 14.1-1711 can be notched to form an undercut portion of the detent 14.1-1710E in the central region 14.1-1711. The notches can be omitted from lower portion of the peripheral regions 14.1-1713, which can prevent, limit, or reduce rotation of the plug connector 14.1-1720. Including the un-notched peripheral regions 14.1-1713 can also increase mating forces and un-mating forces between the plug connector 14.1-1720 and the receptacle connector 14.1-1700. The central region 14.1-1711 and the peripheral region 14.1-1713 can be notched to form a notched top surface. The notched upper surface of the detent 14.1-1710E can reduce a mating force for mating the plug connector 14.1-1720 in the receptacle connector 14.1-1700. In other words, the notched upper surface of the detent 14.1-1710E can reduce the force require to move the protrusions 14.1-1724 past the detent 14.1-1710E into the channel 14.1-1733. A cross-sectional view of the detent 14.1-1710E taken along cross-section A-A' of FIG. 14.1-19L can be the same as or similar to the cross-sectional view of FIG. 14.1-19F, discussed above.

FIGS. 14.1-20A and 14.1-20B illustrate different configurations of a cable assembly 14.1-1800 relative to a receptacle connector 14.1-1802. FIGS. 14.1-20A and 14.1-20B show a portion of the cable assembly 14.1-1800 inserted into the receptacle connector 14.1-1802. The cable assembly 14.1-1800 can be substantially similar to, and can include some or all of, the features of any of the previously described cable assemblies. For example, the cable assembly 14.1-1800 can include a shielded cable 14.1-1803 and a plug connector 14.1-1804 having a boot 14.1-1806 and a central member 14.1-1808A/14.1-1808B. The central member 14.1-1808 can form an external surface 14.1-1810 and an internal surface 14.1-1812. In some examples, the central member 14.1-1808 can include one or more protrusions 14.1-1814 extending laterally from, or substantially perpendicular to, the external surface 14.1-1810. In some examples, the central member 14.1-1808 can form a cavity or volume, for example, the internal surface 14.1-1812 can form a cavity or volume.

The receptacle connector 14.1-1802 can be substantially similar to, and can include some or all of, the features of the previously described receptacle connectors. For example, the receptacle connector 14.1-1802 can include a trim ring 14.1-1816, one or more detents 14.1-1818A/14.1-1818B/14.1-1818C (collectively referred to as detents 14.1-1818), and a raised portion 14.1-1820. The trim ring 14.1-1816 can form one or more undercut regions which house or retain the detents 14.1-1818. While a central member 14.1-1808 is disposed within the receptacle connector 14.1-1802, the protrusions 14.1-1814 can extend into respective channels defined by the detents 14.1-1818. In some examples, each detent 14.1-1818 can be biased toward the raised portion 14.1-1820 by a biasing element. In other words, each detent 14.1-1818 can radially translate within their respective undercut regions toward and away from the raised portion 14.1-1820 to engage and disengage respective protrusions 14.1-1814.

Each of the detents 14.1-1818 can include different configurations and different biasing elements to customize mating and un-mating forces for each of the detents 14.1-1818. Specific configurations of the detents 14.1-1818 and the shielded cable 14.1-1803 relative to the detents 14.1-1818 can be used to provide different mating an un-mating forces, and to provide different breakaway forces. In the example of FIG. 14.1-20A, the detents 14.1-1818A and 14.1-1818C are offset from the shielded cable 14.1-1803 (e.g., the shielded cable 14.1-1803 splits the detents 14.1-1818A and 14.1-1818B) distal the shielded cable 14.1-1803, and the detent 14.1-1818B is aligned with the shielded cable 14.1-1803 proximal the shielded cable 14.1-1803. Protrusions 14.1-1814 distal the shielded cable 14.1-1803 are offset from the shielded cable 14.1-1803 (e.g., the shielded cable 14.1-1803 splits the protrusions 14.1-1814), and the protrusion 14.1-1814 proximal the shielded cable 14.1-1803 is aligned with the shielded cable 14.1-1803. In the example of FIG. 14.1-20B, the detents 14.1-1818A and 14.1-1818C are offset from the shielded cable 14.1-1803 (e.g., the shielded cable 14.1-1803 splits the detents 14.1-1818A and 14.1-1818B) proximal the shielded cable 14.1-1803, and the detent 14.1-1818B is aligned with the shielded cable 14.1-1803 distal the shielded cable 14.1-1803. Protrusions 14.1-1814 proximal the shielded cable 14.1-1803 are offset from the shielded cable 14.1-1803 (e.g., the shielded cable 14.1-1803 splits the protrusions 14.1-1814), and the protrusion 14.1-1814 distal the shielded cable 14.1-1803 is aligned with the shielded cable 14.1-1803. The detents 14.1-1818 can include any of the previously described detents, such as the detents described with respect to FIGS. 14.1-19A through 14.1-19M, and the biasing elements can include any of the previously described biasing elements. Any combination of detents 14.1-1818 and biasing elements can be provided.

FIGS. 14.1-21A and 14.1-21B illustrate examples in which the receptacle connector 14.1-1802 includes protrusions 14.1-1830 and the plug connector 14.1-1804 includes openings 14.1-1831 configured to receive the protrusions. The protrusions 14.1-1830 and the openings 14.1-1831 can be configured to ensure that the plug connector 14.1-1804 is properly aligned with and installed in a proper orientation relative to the receptacle connector 14.1-1802. FIGS. 14.1-21A and 14.1-21B further illustrate protrusions 14.1-1832 in dashed lines. In some examples, the receptacle connector 14.1-1802 includes a single protrusion 14.1-1830; however, the receptacle connector 14.1-1802 can include the protrusions 14.1-1832 in addition to or in place of the protrusion 14.1-1830, and the plug connector 14.1-1804 can include any number of the openings 14.1-1831 configured to receive the protrusion 14.1-1830 and/or the protrusions 14.1-1832. In some examples, the receptacle connector 14.1-1802 can include one protrusion 14.1-1830; one protrusion 14.1-1830 and one protrusion 14.1-1832; one protrusion 14.1-1830 and two protrusions 14.1-1832; or a greater number of protrusions.

FIGS. 14.1-21A and 14.1-21B illustrate alternative angular spacings of the protrusions 14.1-1830/14.1-1832 of the receptacle connector 14.1-1802. In FIG. 14.1-21A, the protrusions 14.1-1830/14.1-1832 are evenly spaced relative to one another, with angles 14.1-07, 14.1-08, and 14.1-09 being about 60°. A protrusion 14.1-1830 and a protrusion 14.1-1832 distal the shielded cable 14.1-1803 can be offset from the shielded cable 14.1-1803 (e.g., the shielded cable 14.1-1803 splits the protrusion 14.1-1830 and the protrusion 14.1-1832), and a protrusion 14.1-1832 proximal the shielded cable 14.1-1803 can be aligned with the shielded cable 14.1-1803. Any rotational configuration of the protrusions 14.1-1830/14.1-1832 relative to the shielded cable 14.1-1803 can be provided. In FIG. 14.1-21B, the protrusions 14.1-1830/14.1-1832 are spaced at different intervals relative to one another. Angles 14.1-010, 14.1-011, and 14.1-012 between adjacent protrusions 14.1-1830/14.1-1832 can be about 30 degrees, between about 30 degrees and about 60 degrees, between about 60 degrees and about 90 degrees, between about 90 degrees and about 120 degrees, between about 120 degrees and about 150 degrees, between about 150 degrees and about 180 degrees, or less than 180 degrees. A protrusion 14.1-1830 and a protrusion 14.1-1832 distal the shielded cable 14.1-1803 can be offset from the shielded cable 14.1-1803 (e.g., the shielded cable 14.1-1803 splits the protrusion 14.1-1830 and the protrusion 14.1-1832), and a protrusion 14.1-1832 proximal the shielded cable 14.1-1803 can also be offset from the shielded cable 14.1-1803. Any rotational configuration of the protrusions 14.1-1830/14.1-1832 relative to the shielded cable 14.1-1803 can be provided. Various configurations of the protrusions 14.1-1830/14.1-1832 can be used to ensure proper alignment of the plug connector 14.1-1804 with the receptacle connector 14.1-1802 and can also be used to ensure that incompatible plug connectors are not inadvertently installed in the receptacle connector 14.1-1802.

FIGS. 14.1-22A through 14.1-22E show cross-sectional side views of a plug connector 14.1-1904 of a cable assembly 14.1-1900 disposed within a receptacle connector 14.1-1902. The plug connector 14.1-1904 includes a central member 14.1-1908 with a protrusion 14.1-1914. The protrusion 14.1-1914 engages a channel of a detent 14.1-1918. The detent 14.1-1918 is biased towards a raised portion 14.1-1920 of the receptacle connector 14.1-1902 by a biasing element 14.1-1924. The biasing element 14.1-1924 and the detent 14.1-1918 are disposed within a trim ring 14.1-1916, which is coupled to a base 14.1-1930 of the receptacle connector 14.1-1902. An external surface 14.1-1910 of the central member 14.1-1908 includes the protrusion 14.1-1914 and is configured to engage the detent 14.1-1918. An internal surface 14.1-1912 of the central member 14.1-1908 includes an electrical contact 14.1-1919 and is electrically coupled to the raised portion 14.1-1920 of the receptacle connector 14.1-1902.

FIGS. 14.1-22A through 14.1-22E show various seals 14.1-1932 disposed between the central member 14.1-1908 and the receptacle connector 14.1-1902 at various locations to prevent ingress of contaminants into the receptacle connector 14.1-1902, such as, fluids, dust, liquids, and other materials that can degrade or impede the functionality of the plug connector 14.1-1904 and the receptacle connector 14.1-1902. The seal 14.1-1932 can be affixed to any surface of the plug connector 14.1-1904 and/or the receptacle connector 14.1-1902. For example, the seal 14.1-1932 can be molded, adhered, welded, fastened, or otherwise secured to a surface of the plug connector 14.1-1904 and/or the receptacle connector 14.1-1902.

FIG. 14.1-22A shows a seal 14.1-1932A disposed between the base 14.1-1930 and the central member 14.1-1908. As illustrated in FIG. 14.1-22A, an opening 14.1-1934A can be provided in a bottom portion of the central member 14.1-1908, and the seal 14.1-1932A can be disposed in the opening 14.1-1934A in the central member 14.1-1908.

FIG. 14.1-22B shows a seal 14.1-1932B disposed between the base 14.1-1930 and the central member 14.1-1908. As illustrated in FIG. 14.1-22B, an opening 14.1-1934B can be provided in a portion of the base 14.1-1930 adjacent a bottom portion of the central member 14.1-1908, and the seal 14.1-1932B can be disposed in the opening 14.1-1934B in the base 14.1-1930.

FIG. 14.1-22C shows a seal 14.1-1932C disposed between the raised portion 14.1-1920 and the central member 14.1-1908. As illustrated in FIG. 14.1-22C, an opening 14.1-1934C can be provided in a portion of the raised portion 14.1-1920 adjacent a bottom portion of the central member 14.1-1908, and the seal 14.1-1932C can be disposed in the opening 14.1-1934C in the raised portion 14.1-1920.

FIG. 14.1-22D shows a seal 14.1-1932D disposed between the trim ring 14.1-1916 and the central member 14.1-1908. As illustrated in FIG. 14.1-22D, the seal 14.1-1932D can be coupled to the central member 14.1-1908 between the central member 14.1-1908 and the trim ring 14.1-1916. The seal 14.1-1932D can include a protrusion that interacts with the trim ring 14.1-1916 to provide sealing between the central member 14.1-1908 and the trim ring 14.1-1916.

FIG. 14.1-22E shows a seal 14.1-1932E disposed between the trim ring 14.1-1916 and the central member 14.1-1908. As illustrated in FIG. 14.1-22E, the seal 14.1-1932E can be coupled to the central member 14.1-1908 between the central member 14.1-1908 and the trim ring 14.1-1916. The seal 14.1-1932E can include an opening, which gives flexibility to the seal 14.1-1932E as the seal 14.1-1932E interacts with the trim ring 14.1-1916 to provide sealing between the central member 14.1-1908 and the trim ring 14.1-1916. While FIGS. 14.1-22A through 14.1-22E only depict a single seal 14.1-1932 in each example disposed between the central member 14.1-1908 and the receptacle connector 14.1-1902, other examples can include multiple seals 14.1-1932, each disposed at one of a plurality of positions within the receptacle connector 14.1-1902 and/or the central member 14.1-1908.

FIGS. 14.1-23A through 14.1-23G illustrate various configurations of seals 14.1-2002 that can be included between a raised portion 14.1-2000 and a base 14.1-2006 of a receptacle connector and a central member 14.1-2008 of a plug connector. The seals 14.1-2002 can be disposed at various locations and can include different sizes and shapes to prevent ingress of contaminants into the receptacle connector, such as, fluids, dust, liquids, and other materials that can degrade or impede the functionality of the plug connector and the receptacle connector. The seals 14.1-2002 can be affixed to any surface of the plug connector and/or the receptacle connector. For example, the seals 14.1-2002 can be molded, adhered, welded, fastened, or otherwise secured to a surface of the plug connector and/or the receptacle connector.

FIG. 14.1-23A shows a seal 14.1-2002A disposed vertically between the base 14.1-2006 and the raised portion 14.1-2000 and horizontally between the raised portion 14.1-2000 and the central member 14.1-2008. The seal 14.1-2002A can include a triangular portion that interfaces with the central member 14.1-2008. An opening 14.1-2004A can be provided in the raised portion 14.1-2000 and the seal 14.1-2002A can be disposed in the opening 14.1-2004A. The seal 14.1-2002A can include a protrusion 14.1-2012A that interfaces with an opening 14.1-2010A of the base 14.1-2006. The protrusion 14.1-2012A can be generally rectangular. The seal 14.1-2002A can be attached to the raised portion 14.1-2000. The seal 14.1-2002A can further be attached to the base 14.1-2006 through the protrusion 14.1-2012A.

FIG. 14.1-23B shows a seal 14.1-2002B disposed vertically between the base 14.1-2006 and the raised portion 14.1-2000 and horizontally between the raised portion 14.1-2000 and the central member 14.1-2008. The seal 14.1-2002B can be generally L-shaped, with a rectangular portion interfacing with the central member 14.1-2008. An opening 14.1-2004B can be provided in the raised portion 14.1-2000 and the seal 14.1-2002B can be disposed in the opening 14.1-2004B. The seal 14.1-2002B can be attached to the raised portion 14.1-2000.

FIG. 14.1-23C shows a seal 14.1-2002C disposed vertically between the base 14.1-2006 and the raised portion 14.1-2000 and horizontally between the raised portion 14.1-2000 and the central member 14.1-2008. The seal 14.1-2002C can include a rounded portion that interfaces with the central member 14.1-2008. An opening 14.1-2004C can be provided in the raised portion 14.1-2000 and the seal 14.1-2002C can be disposed in the opening 14.1-2004C. The seal 14.1-2002C can include a protrusion 14.1-2012C that interfaces with an opening 14.1-2010C of the base 14.1-2006. The protrusion 14.1-2012C can be generally rounded. The seal 14.1-2002C can be generally D-shaped. The seal 14.1-2002C can be attached to the raised portion 14.1-2000. The seal 14.1-2002C can further be attached to the base 14.1-2006 through the protrusion 14.1-2012C.

FIG. 14.1-23D shows a seal 14.1-2002D disposed vertically between the base 14.1-2006 and the raised portion 14.1-2000 and horizontally between the raised portion 14.1-2000 and the central member 14.1-2008. The seal 14.1-2002D can further extend vertically below a top surface of the base 14.1-2006 and laterally adjacent the base 14.1-2006 in a direction opposite the central member 14.1-2008. The seal 14.1-2002D can include a rounded/generally rectangular portion that interfaces with the central member 14.1-2008. An opening 14.1-2004D can be provided in the raised portion 14.1-2000 and the seal 14.1-2002D can be disposed in the opening 14.1-2004A. The seal 14.1-2002A can include a protrusion 14.1-2012D that interfaces with an opening 14.1-2010D of the base 14.1-2006. The opening 14.1-2010D of the base can be laterally opposite the central member 14.1-2008. The seal 14.1-2002D can further include an opening 14.1-2014D disposed therein, which can be generally U-shaped. The opening 14.1-2014D can provide additional flexibility to the seal 14.1-2002D and can improve sealing between the central member 14.1-2008 and the receptacle connector. The seal 14.1-2002D can be attached to the base 14.1-2006 through the protrusion 14.1-2012D in the opening 14.1-2010D. The seal 14.1-2002D can further be attached to the raised portion 14.1-2000.

FIG. 14.1-23E shows a seal 14.1-2002E disposed vertically between the base 14.1-2006 and the raised portion 14.1-2000 and horizontally between the raised portion 14.1-2000 and the central member 14.1-2008. The seal 14.1-2002E can include a rounded portion that interfaces with the central member 14.1-2008. An opening 14.1-2004E can be provided in the raised portion 14.1-2000 and the seal 14.1-2002E can be disposed in the opening 14.1-2004E. The seal 14.1-2002E can be generally stadium-shaped, or rectangular with rounded corners. The seal 14.1-2002E can be attached to the raised portion 14.1-2000. The seal 14.1-2002E can further be attached to the base 14.1-2006.

FIG. 14.1-23F shows a seal 14.1-2002F disposed vertically between the base 14.1-2006 and the raised portion 14.1-2000 and horizontally between the raised portion 14.1-2000 and the central member 14.1-2008. The seal 14.1-2002F can include a rounded portion that interfaces with the central member 14.1-2008. An opening 14.1-2004F can be provided in the raised portion 14.1-2000 and the seal 14.1-2002F can be disposed in the opening 14.1-2004F. The seal 14.1-2002F can be generally stadium-shaped, or rectangular with rounded corners. In the example of FIG. 14.1-23F, corners of the seal 14.1-2002F proximal the central member 14.1-2008 are more rounded relative to corners of the seal 14.1-2002F distal the central member 14.1-2008. The seal 14.1-2002F can be attached to the raised portion 14.1-2000. The seal 14.1-2002F can further be attached to the base 14.1-2006.

FIG. 14.1-23G shows a seal 14.1-2002G disposed vertically between the base 14.1-2006 and the raised portion 14.1-2000 and horizontally between the raised portion 14.1-2000 and the central member 14.1-2008. The seal 14.1-2002G can include a rounded portion that interfaces with the central member 14.1-2008. An opening 14.1-2004G can be provided in the raised portion 14.1-2000 and the seal 14.1-2002G can be disposed in the opening 14.1-2004G. The seal 14.1-2002G can be generally stadium-shaped, or rectangular with rounded corners. In the example of FIG. 14.1-23G, the seal 14.1-2002E further includes an opening 14.1-2014G in a bottom surface thereof, adjacent to the base 14.1-2006. The opening 14.1-2014G can provide improved flexibility to the seal 14.1-2002G. The seal 14.1-2002G can be attached to the raised portion 14.1-2000. The seal 14.1-2002G can further be attached to the base 14.1-2006.

While FIGS. 14.1-23A through 14.1-23G only depict a single seal 14.1-2002 in each example disposed between the central member 14.1-2008 and the raised portion 14.1-2000 and the base 14.1-2006 of a receptacle connector, other examples can include multiple seals, each disposed at one of a plurality of positions within the receptacle connector and/or the central member. The seals 14.1-2002 of FIGS. 14.1-23A through 14.1-23G can be used in addition to or in place of any of the seals discussed above, such as the seals discussed with respect to FIGS. 14.1-22A through 14.1-22E.

FIGS. 14.1-24A and 14.1-24B show exploded views of a receptacle connector 14.1-2100. The receptacle connector 14.1-2100 includes a base 14.1-2102, a raised portion 14.1-2110, mounting clips 14.1-2114, a lower mounting ring 14.1-2116, and an upper mounting ring 14.1-2122. The mounting clips 14.1-2114, the lower mounting ring 14.1-2116, and the upper mounting ring 14.1-2122 can affix the raised portion 14.1-2110 to the base 14.1-2102. For example, the upper mounting ring 14.1-2122 and the lower mounting ring 14.1-2116 can be coupled to the base 14.1-2102. The base 14.1-2102 can include protrusions 14.1-2106 and a raised electronic component 14.1-2104. The upper mounting ring 14.1-2122 can include openings 14.1-2124 configured to receive the protrusions 14.1-2106 of the base 14.1-2102. The lower mounting ring 14.1-2116 can include openings 14.1-2120 configured to receive the protrusions 14.1-2106 of the base 14.1-2102. The openings 14.1-2124 and the openings 14.1-2120 can have shapes corresponding to shapes of the protrusions 14.1-2106 (e.g., capsule shapes, rounded shapes, rectangular shapes, or the like). The lower mounting ring can further include an opening 14.1-2118 configured to receive the raised electronic component 14.1-2104 of the base 14.1-2102. The opening 14.1-2118 can have a shape corresponding to a shape of the raised electronic component 14.1-2104 (e.g., a capsule shape, a rounded shape, a rectangular shape, or the like).

The mounting clips 14.1-2114 can be configured to receive a raised component 14.1-2112 of the raised portion 14.1-2110. Each of the mounting clips 14.1-2114 can be generally L-shaped, with an outer surface of the mounting clips 14.1-2114 being rounded. Central portions of the mounting clips 14.1-2114 can receive the raised component 14.1-2112. The lower mounting ring 14.1-2116 and the upper mounting ring 14.1-2122 can be affixed to the base 14.1-2102, and the mounting clips 14.1-2114 can affix the raised component 14.1-2112 of the raised portion 14.1-2110 to the lower mounting ring 14.1-2116, the upper mounting ring 14.1-2122, and the base 14.1-2102. The upper mounting ring 14.1-2122 and the lower mounting ring 14.1-2116 can be affixed to the base 14.1-2102, the mounting clips 14.1-2114 can be affixed to the raised component 14.1-2112, and the raised portion 14.1-2110 can be affixed to the base 14.1-2102 by adhesives, adhesive tapes, fasteners, welding, a combination thereof, or any other mechanism from permanently or temporarily securing the various components to one another.

In the example of FIG. 14.1-24B, the mounting clips 14.1-2114 are replaced by mounting clips 14.1-2126. The mounting clips 14.1-2126 interface with openings 14.1-2128 in the lower mounting ring 14.1-2116 to attach the raised portion 14.1-2110 to the base 14.1-2102 through the lower mounting ring 14.1-2116.

FIGS. 14.1-25A and 14.1-25B show exploded views of a receptacle connector 14.1-2200. The receptacle connector 14.1-2200 includes a base 14.1-2210 and a raised portion that includes a body 14.1-2204 and a cap 14.1-2202. The base includes a contact tab 14.1-2212 with contacts 14.1-2214 disposed in an opening 14.1-2218 in a raised portion 14.1-2216 of the base 14.1-2210. In the example of FIG. 14.1-25A, the contact tab 14.1-2212 is relatively wider and includes a greater number of contacts, such as six contacts. In the example of FIG. 14.1-25B, the contact tab 14.1-2212 is relatively narrower and includes a lower number of contacts, such as three contacts. Any number of contacts and appropriate width of the contact tab 14.1-2212 can be provided. Providing the contact tab 14.1-2212 with a greater width and a greater number of contacts improves the strength of the connection between the body 14.1-2204 and the base 14.1-2210 and provides for more electrical connections between the receptacle connector 14.1-2200 and other electronic components, such as a plug connector.

FIGS. 14.1-25A and 14.1-25B further illustrate different configurations of contacts 14.1-2206 included in an opening 14.1-2208 in the body 14.1-2204. In the example of FIG. 14.1-25A, four contacts 14.1-2206 are included in the opening 14.1-2208 in the body 14.1-2204. In the example of FIG. 14.1-25B, two contacts 14.1-2206 are included in the opening 14.1-2208 in the body 14.1-2204. Any number of contacts 14.1-2206 can be provided. Providing a greater number of the contacts 14.1-2206 in the body 14.1-2204 provides for more electrical connections between the receptacle connector 14.1-2200 and other electronic components, such as a plug connector.

FIGS. 14.1-26A through 14.1-35B illustrate various examples of receptacle connectors and plug connectors that can be used as the plug connectors 14.1-144 of the cable assembly 14.1-140 and the receptacle connectors 14.1-132 of the second electronic device 14.1-130 illustrated in FIGS. 14.1-1A and 14.1-1B.

FIG. 14.1-26A shows an electronic device 14.1-2300 having a housing 14.1-2302 forming an external surface 14.1-2304 of the electronic device 14.1-2300. The housing 14.1-2302 can form or define one or more apertures 14.1-2306, 14.1-2308. Each of the one or more apertures 14.1-2306, 14.1-2308 can receive a connector of an electrical cord or cable (see cable 14.1-2310 of FIG. 14.1-26B) to electrically couple the electronic device 14.1-2300 to another electronic device (not shown) and/or a power source (e.g., a wall-mounted electrical outlet).

The electronic device 14.1-2300 can be a smart phone, a laptop, a tablet computing device, a smart watch, a head-mounted display (HMD), a pair of headphones, a combination thereof, or any other electronic device. Alternatively, or additionally, the electronic device 14.1-2300 can be a sub-component or an accessory to one or more of the electronic devices previously listed above, such as, an external power supply or electrical power source, a display, a user interface, an audio component or speaker, or a combination thereof. As such, the electronic device 14.1-2300 can be electrically and/or communicatively coupled to one or more other electronic devices (not shown) via electrical receptacle connectors or ports disposed within the one or more apertures 14.1-2306, 14.1-2308.

The housing 14.1-2302 can define a cavity or volume wherein one or more electronic components can be disposed. For example, the one or more electrical components disposed within the housing 14.1-2302 can be a battery (e.g., a lithium battery pack), a processor, a wireless communication module, one or more antennas, or any other component or assembly housed within portable electronic devices. In some examples, the one or more electronic components can be electrically coupled to a receptacle connector (see receptacle connector 2424 in FIG. 14.1-27A) accessible by a cable or cord inserted into one of the apertures 14.1-2306, 14.1-2308. For example, the one or more electronic components can provide electrical power to the receptacle connector and the cable or cord can transfer the electrical power to another electronic device (i.e., the electronic device 14.1-2300 can be a power source or external battery electrically coupled to a portable electronic device). The housing 14.1-2302 can be molded, machined, cast, stamped, or otherwise assembled from a metal, polymer, ceramic, or combination thereof.

The aperture 14.1-2306 can be formed within or defined by the external surface 14.1-2304 of the housing 14.1-2302. The aperture 14.1-2306 can be sized and shaped to receive and retain a plug connector of a cable (see cable 14.1-2310 in FIG. 14.1-26B). In some examples, a cable operably coupled to a receptacle connector within the aperture 14.1-2306 can transfer electrical power to the electronic device 14.1-2300 while the plug connector is disposed within the aperture 14.1-2306. In other words, a receptacle connector within the aperture 14.1-2306 can be configured to receive electrical power (e.g., from a wall-mounted electrical outlet) and deliver the electrical power to the one or more components within the housing 14.1-2302 (e.g., charging a battery disposed within the housing 14.1-2302).

The aperture 14.1-2308 can be formed within or defined by the external surface 14.1-2304 of the housing 14.1-2302. The aperture 14.1-2308 can be sized and shaped to receive a plug connector of a cable. In some examples, a cable operably coupled to a receptacle connector within the aperture 14.1-2308 can transfer electrical power from the electronic device 14.1-2300 while the plug connector is disposed within the aperture 14.1-2308. In other words, the receptacle connector within the aperture 14.1-2308 can be configured to deliver or provide electrical power from the one or more components within the housing 14.1-2302 to a portable electronic device electrically coupled to the cable.

While the apertures 14.1-2306, 14.1-2308 are shown as being positioned on a particular side of the housing 14.1-2302, the apertures 14.1-2306, 14.1-2308 can be formed or otherwise positioned at any location on the external surface 14.1-2304 of the housing 14.1-2302. Similarly, while the apertures 14.1-2306, 14.1-2308 are shown as being disposed adjacent or substantially adjacent to one another, in some examples, the apertures 14.1-2306, 14.1-2308 can be formed or otherwise positioned at nonadjacent locations on the external surface 14.1-2304 of the housing 14.1-2302 (e.g., on opposite sides of the housing 14.1-2302). While the apertures 14.1-2306, 14.1-2308 are depicted as having different dimensions (i.e., the aperture 14.1-2306 is illustrated as being relatively smaller than the aperture 14.1-2308), the apertures 14.1-2306, 14.1-2308 can have the same dimensions or substantially similar dimensions to one another in some examples. While two apertures (e.g., apertures 14.1-2306, 14.1-2308) are shown in FIGS. 14.1-26A and 14.1-26B, some examples can have more or fewer apertures. For example, the housing 14.1-2302 can form a single aperture which is operable to provide electrical power and/or signals to a portable electronic device and also operable to receive electrical power and/or signals (e.g., from a portable electronic device and/or a wall-mounted electrical outlet). In some examples, the housing 14.1-2302 can form two apertures, such as a first aperture operable to provide electrical power and/or signals to a portable electronic device and also operable to receive electrical power and/or signals (e.g., from a portable electronic device and/or a wall-mounted electrical outlet), and a second aperture operable to receive a tool that can be used to remove a cable from the first aperture.

FIG. 14.1-26B shows the electronic device 14.1-2300 and a cable 14.1-2310 receivable within one or more of the apertures 14.1-2306, 14.1-2308. The cable 14.1-2310 can have a plug connector 14.1-2312 having a plug 14.1-2314 and a boot 14.1-2316. The plug connector 14.1-2312 can be electrically coupled to a length of shielded wire 14.1-2318. The shielded wire 14.1-2318 can be one or more wires (e.g., metallic wires capable of transferring electrical signals and/or electrical power). The one or more wires can be individually shielded or collectively shielded. The shielding can prevent each of the one or more wires from contacting one another. Additionally, or alternatively, the shielding can prevent or limit the influence of electromagnetic waves on each of the one or more wires. The plug connector 14.1-2312 can be received within one of the apertures 14.1-2306, 14.1-2308 to electrically couple the cable 14.1-2310 with the electronic device 14.1-2300. For example, the plug 14.1-2314 can be inserted within a receptacle connector (e.g., receptacle connector 14.1-2424 of FIG. 14.1-27A) disposed within the housing 14.1-2302 of the electronic device 14.1-2300 to enable transfer of electrical power and/or signals relative to the electronic device 14.1-2300. The boot 14.1-2316 can be inserted within a trim ring (e.g., trim ring 14.1-2422 of FIG. 14.1-27A) disposed within the housing 14.1-2302 of the electronic device 14.1-2300, between the receptacle connector and the housing 14.1-2302. One or more of the plug 14.1-2314, the boot 14.1-2316, the apertures 14.1-2306, 14.1-2308, the receptacle connector, and the trim ring can include one or more engagement features that retain the plug connector 14.1-2312 to the electronic device 14.1-2300. The mechanisms and components capable of inter coupling the cable 14.1-2310 and the electronic device 14.1-2300 will be discussed in greater detail below with reference to FIGS. 14.1-27A through 14.1-35B.

FIG. 14.1-27A shows an electronic device 14.1-2400 and a cable 14.1-2410. The electronic device 14.1-2400 can be substantially similar to, and can include some or all of, the features of the electronic device 14.1-2300. For example, the electronic device 14.1-2400 can include a housing 14.1-2402 forming a cavity or volume 14.1-2420. One or more electronic components can be disposed within the volume 14.1-2420. For example, the one or more electronic components disposed within the volume 14.1-2420 can include a trim ring 14.1-2422 and a receptacle connector 14.1-2424 operably coupled to a battery 14.1-2426, a processor 14.1-2428, a combination thereof, or any other electronic component. The trim ring 14.1-2422 and the receptacle connector 14.1-2424 can form an electrical port disposed within the volume 14.1-2420. In some examples, an external surface 14.1-2404 of the housing 14.1-2402 can form an aperture 14.1-2408 capable of receiving a plug connector 14.1-2412 of the cable 14.1-2410. The trim ring 14.1-2422 can be positioned adjacent the aperture 14.1-2408 such that a boot 14.1-2416 of the plug connector 14.1-2412 is disposed within the trim ring 14.1-2422. The receptacle connector 14.1-2424 can be positioned adjacent the trim ring 14.1-2422 such that a plug of the plug connector 14.1-2412 is disposed within the receptacle connector 14.1-2424. The trim ring 14.1-2422 and the receptacle connector 14.1-2424 will be discussed in detail below with reference to FIG. 14.1-27B.

FIG. 14.1-27B shows a partially exploded view of the cable 14.1-2410, the trim ring 14.1-2422, and the receptacle connector 14.1-2424. The cable 14.1-2410 can be substantially similar to, and can include some or all of, the features of the cable 14.1-2310. For example, the cable 14.1-2410 can include the plug connector 14.1-2412 having a plug 14.1-2414 and a boot 14.1-2416. The plug connector 14.1-2412 can be electrically coupled to a length of shielded wire 14.1-2418.

In some examples, the boot 14.1-2416 can be sized or otherwise shaped to be at least partially receivable within a cavity 14.1-2430 formed within the trim ring 14.1-2422. In some examples, the boot 14.1-2416 can be sized or otherwise shaped to be at least partially receivable within the cavity 14.1-2430 of the trim ring 14.1-2422 and partially receivable within the aperture 14.1-2408 of the housing 14.1-2402. The cavity 14.1-2430 can be shaped as cubic, cylindrical, triangular, or any other geometric shape. The boot 14.1-2416 can form a corresponding geometric shape, which can be inserted or otherwise positioned within the cavity 14.1-2430. In some examples, the boot 14.1-2416 can be partially disposed within the cavity 14.1-2430 such that a portion of the boot 14.1-2416 protrudes from the cavity 14.1-2430. In some examples, the boot 14.1-2416 can be entirely surrounded or substantially surrounded by the trim ring 14.1-2422 and within the cavity 14.1-2430, such that a wire-side surface 14.1-2434 of the boot 14.1-2416 adjacent the shielded wire 14.1-2418 is flush or substantially flush with a surface 14.1-2436 of the trim ring 14.1-2422 adjacent the cavity 14.1-2430. In some examples, the surface 14.1-2432 of the boot 14.1-2416 can be disposed within the cavity 14.1-2430 of the trim ring 14.1-2422 such that the wire-side surface 14.1-2434 is flush or substantially flush with the external surface 14.1-2404 of the housing 14.1-2402 and the boot 14.1-2416 is substantially concealed or hidden within the cavity 14.1-2430 of the trim ring 14.1-2422. In some examples, while the boot 14.1-2416 is disposed within the cavity 14.1-2430, the boot 14.1-2416 can be substantially covered by the trim ring 14.1-2422. This prevents the boot 14.1-2416 from being gripped (e.g., by a user) and pulled from the trim ring 14.1-2416. In other words, a substantial portion of the boot 14.1-2416 can be disposed within the cavity 14.1-2430 such that the boot 14.1-2416 is inaccessible to grasp to pull the plug connector 14.1-2412 from the trim ring 14.1-2422 and the receptacle connector 14.1-2424.

The plug 14.1-2414 can include one or more electrical contacts 14.1-2438A, 14.1-2438B, and 14.1-2438C, which can provide electrical signals, electrical power, a grounding path, another electrical communication, or a combination thereof between the shielded wire 14.1-2418 and the receptacle connector 14.1-2424.

The trim ring 14.1-2422 can be molded, machined, cast, stamped, or otherwise manufactured from a metal, polymer, ceramic, or combination thereof. For example, the trim ring 14.1-2422 can be molded or co-molded from a thermoplastic or other polymer. The cavity 14.1-2430 formed within the trim ring 14.1-2422 can be at least partially defined by internal walls 14.1-2440. In some examples, the boot 14.1-2416 can contact one or more of the internal walls 14.1-2440 while the boot 14.1-2416 is positioned within the cavity 14.1-2430 such that the boot 14.1-2416 is at least partially retained within the cavity 14.1-2430 by a frictional engagement between the boot 14.1-2416 and the internal walls 14.1-2440.

In some examples, the receptacle connector 14.1-2424 can be adhered, molded, welded, fastened, or otherwise affixed to the trim ring 14.1-2422. For example, the receptacle connector 14.1-2424 can define one or more receptacle apertures 14.1-2444A, 14.1-2444B, which correspond to and align with respective trim ring apertures 14.1-2442A, 14.1-2442B of the trim ring 14.1-2422. A respective fastener (not shown) can be disposed within the receptacle aperture 14.1-2444A and the trim ring aperture 14.1-2442A to couple the receptacle connector 14.1-2424 to the trim ring 14.1-2422. Similarly, a respective fastener (not shown) can be disposed within the receptacle aperture 14.1-2444B and the trim ring aperture 14.1-2442B to couple the receptacle connector 14.1-2424 to the trim ring 14.1-2422. The fastener can be a pin, rivet, screw, bolt, a combination thereof, or any other fastener.

The boot 14.1-2416 can be molded, machined, cast, stamped, or otherwise manufactured from a metal, polymer, ceramic, or combination thereof. As illustrated in FIG. 14.1-27B, the boot 14.1-2416 can include recesses 14.1-2462A and 14.1-2462B formed in opposite sides of the boot 14.1-2416. The recesses 14.1-2462A and 14.1-2462B can be machined, molded, etched, or otherwise recessed into an exterior surface of the boot 14.1-2416. In the example of FIG. 14.1-27B, the recesses 14.1-2462A and 14.1-2462B extend along only a portion of the periphery of the boot 14.1-2416. For example, the recesses 14.1-2462A and 14.1-2462B can extend along one or more sides of the boot 14.1-2416 (e.g., two sides in the example of FIG. 14.1-27B). In some examples, recesses can extend along an entire periphery of the boot 14.1-2416. In other words, the recesses can form a channel encircling the boot 14.1-2416. The recesses 14.1-2462A and 14.1-2462B can be formed between a plug-side surface and a wire-side surface of the boot 14.1-2416. In some examples, the recesses 14.1-2462A and 14.1-2462B can extend parallel to and between the plug-side surface and the wire-side surface of the boot 14.1-2416. The recesses 14.1-2462A and 14.1-2462B can be included to interface with structures of the trim ring 14.1-2422 in order to retain the boot 14.1-2416 and the plug connector 14.1-2412 within the channel 14.1-2430. The trim ring 14.1-2422 and the boot 14.1-2416 will be discussed in greater detail below with reference to FIGS. 14.1-28A through 14.1-28F.

In some examples, the receptacle connector 14.1-2424 can include an exterior portion 14.1-2446 and an interior portion 14.1-2448. For example, the exterior portion 14.1-2446 can at least partially encompass the interior portion 14.1-2448. In other words, the exterior portion 14.1-2446 can act as a sleeve or shell that at least partially surrounds the interior portion 14.1-2448. The exterior portion 14.1-2446 and interior portion 14.1-2448 can be interlocked or affixed to one another. For example, the exterior portion 14.1-2446 can include a through-hole 14.1-2450 that receives a protrusion 14.1-2452 of the interior portion 14.1-2448 when the interior portion 14.1-2448 is affixed within the exterior portion 14.1-2446. In some examples, the receptacle connector 14.1-2424 can be formed from a singular or monolithic structure instead of the external portion 14.1-2446 and the internal portion 14.1-2448. The receptacle connector 14.1-2424 can form a slot 14.1-2454 capable of receiving and retaining the plug 14.1-2414.

FIG. 14.1-28A shows sectional views of a cable assembly 14.1-2500 including a plug connector 14.1-2502 received within an opening 14.1-2522 of a trim ring 14.1-2520 and a slot 14.1-2554 of a receptacle connector 14.1-2550. In some examples, one or more internal contacts 14.1-2512A, 14.1-2512B, 14.1-2512C are disposed within the slot 14.1-2554 of the receptacle connector 14.1-2550 such that the contacts 14.1-2512A, 14.1-2512B, 14.1-2512C of the plug connector 14.1-2502 touch or otherwise engage internal contacts 14.1-2552A, 14.1-2552B, 14.1-2552C positioned within the slot 14.1-2554. In some examples, the internal contacts 14.1-2552A, 14.1-2552B, 14.1-2552C disposed within the slot 14.1-2554 can be one or more metal prongs biased to engage the contacts 14.1-2512A, 14.1-2512B, 14.1-2512C while the plug connector 14.1-2502 is disposed within the slot 14.1-2554. The internal contacts 14.1-2552A, 14.1-2552B, 14.1-2552C can be electrically connected to a printed circuit board (PCB), a processor, one or more wires, a combination thereof, or another component positioned within the housing (e.g., the housing 14.1-2302, 14.1-2402, discussed above with respect to FIGS. 14.1-26A through 14.1-27B).

The cable assembly 14.1-2500 includes the plug connector 14.1-2502 and a shielded cable 14.1-2508. The plug connector 14.1-2502 includes a boot 14.1-2506 having openings 14.1-2510 formed in the side surfaces thereof and a plug 14.1-2504 including the contacts 14.1-2512A, 14.1-2512B, and 14.1-2512C.

In the example of FIGS. 14.1-28A through 14.1-28F, the trim ring 14.1-2520 includes a detent element 14.1-2530 that can be configured to interface the recesses 14.1-2510 of the boot 14.1-2506 in order to retain the plug connector 14.1-2502 within the cavity 14.1-2522. Although a single detent element 14.1-2530 is illustrated in FIGS. 14.1-28A through 14.1-28F, some examples can include multiple detent elements 14.1-2530. For example, in some examples, the trim ring 14.1-2520 can include two detent elements 14.1-2530 disposed on opposite sides of the plug connector 14.1-2502 when the plug connector 14.1-2502 is inserted into the cavity 14.1-2522. While the plug connector 14.1-2502 is disposed within the cavity 14.1-2522, the detent element 14.1-2530 can be inserted into the recesses 14.1-2510 defined in the boot 14.1-2506.

FIG. 14.1-28A illustrates the plug connector 14.1-2502 and the detent element 14.1-2530 as the plug connector 14.1-2502 is inserted into the cavity 14.1-2522. The detent element 14.1-2530 includes a protrusion 14.1-2532, which is used couple the detent element 14.1-2530 to a lever arm 14.1-2540. The lever arm 14.1-2540 can be included in the trim ring 14.1-2520 to apply a force, such as a spring force, to the detent element 14.1-2530. The lever arm 14.1-2540 can be rotatable around a pivot 14.1-2542. A spring (not illustrated in FIG. 14.1-28A) can be wrapped around the pivot 14.1-2542 to apply a force to the lever arm 14.1-2540 in a direction 14.1-$D_1$. The lever arm 14.1-2540 includes protrusions 14.1-2544, which interface with the protrusion 14.1-2532 of the detent element 14.1-2530. The detent element 14.1-2530 is physically coupled to the lever arm 14.1-2540 through the protrusion 14.1-2532 and the protrusions 14.1-2544. The lever arm 14.1-2540 can apply the force to the detent element 14.1-2530 through the protrusions 14.1-2544 and the protrusion 14.1-2532 in a direction 14.1-$D_2$ in order to retain the detent element 14.1-2530 in an initial position (illustrated in FIG. 14.1-28A) prior to the plug connector 14.1-2502 being inserted into the cavity 14.1-2522. When the plug connector 14.1-2502 is further inserted into the cavity 14.1-2522 (illustrated in FIG. 14.1-28C), the force applied by the lever arm 14.1-2540 can cause friction between the detent element 14.1-2530 and the boot 14.1-2506. Once the plug connector 14.1-2502 is fully inserted into the cavity 14.1-2522, the force applied by the lever arm 14.1-2540 causes the detent element 14.1-2530 to slide into one of the recesses 14.1-2510 (illustrated in FIG. 14.1-28D).

The lever arm 14.1-2540 can be rotatable around the pivot 14.1-2542 in the direction 14.1-$D_1$ and a direction 14.1-$D_3$ (illustrated in FIGS. 14.1-28C and 14.1-28E) opposite the direction 14.1-$D_1$. The lever arm 14.1-2540 can include the spring, which exerts a force on the lever arm 14.1-2540 in the direction 14.1-$D_1$. The lever arm 14.1-2540 can include a protrusion 14.1-2546, which can be used to rotate the lever arm 14.1-2540 in the direction 14.1-$D_3$. The detent element 14.1-2530 can translate or slide in the direction 14.1-$D_2$ and a direction 14.1-$D_4$ (illustrated in FIGS. 14.1-28C and 14.1-28E) opposite the direction 14.1-$D_2$.

The detent element 14.1-2530 and the boot 14.1-2506 of the plug connector 14.1-2502 can include sloped portions 14.1-2534 and 14.1-2511, respectively. The sloped portions 14.1-2534 and 14.1-2511 are provided in the detent element 14.1-2530 and the boot 14.1-2506 to allow the boot 14.1-2506 and the detent element 14.1-2530 to slide over one another as the plug connector 14.1-2502 is inserted into the cavity 14.1-2522. This reduces the amount of force required to translate the detent element 14.1-2530 in the direction 14.1-$D_4$ as the plug connector 14.1-2502 is inserted into the cavity 14.1-2522 and reduces the force required to insert the plug connector 14.1-2502 into the cavity 14.1-2522. The sloped portions 14.1-2534 and 14.1-2511 of the detent element 14.1-2530 and the boot 14.1-2506 will be described in detail below with reference to FIG. 14.1-28B.

FIG. 14.1-28B shows a detail view of the detent element 14.1-2530 and the boot 14.1-2506. Specifically, FIG. 14.1-28B illustrates details of the sloped portions 14.1-2534 and 14.1-2511 of the detent element 14.1-2530 and the boot 14.1-2506. FIG. 14.1-28B also illustrates details of a sloped portion 14.1-2514 of the boot 14.1-2506 adjacent the recess 14.1-2510.

In the example of FIG. 14.1-28B, the detent element 14.1-2530 includes the sloped portion 14.1-2534 adjacent a linear portion 14.1-2536. In some examples, the sloped portion 14.1-2534 can be curved, rather than sloped. The linear portion 14.1-2536 and the sloped portion 14.1-2534 can form a first angle 14.1-013. The first angle 14.1-013 can be less than 90 degrees, such as, between about 89 degrees and about 60 degrees, between about 60 degrees and about 30 degrees, between about 30 degrees and about 5 degrees, or greater than about 5 degrees.

The boot 14.1-2506 includes the sloped portion 14.1-2511 adjacent a linear portion 14.1-2513. In some examples, the sloped portion 14.1-2511 can be curved, rather than sloped. The linear portion 14.1-2513 and the sloped portion 14.1-2511 can form a second angle 14.1-014. The second angle 14.1-014 can be less than 90 degrees, such as, between about 89 degrees and about 60 degrees, between about 60 degrees and about 30 degrees, between about 30 degrees and about 5 degrees, or greater than about 5 degrees. In some examples, the second angle 14.1-014 can be the same as the first angle 14.1-013, or the second angle 14.1-014 can be different from the first angle 14.1-013.

In some examples, a force required to insert the plug connector 14.1-2502 into the cavity 14.1-2522 can correlate to the first angle 14.1-013 and/or the second angle 14.1-014. For example, a relatively smaller first angle 14.1-013 (e.g., between about 5 degrees and 45 degrees) can cause the force required to insert the plug connector 14.1-2502 into the cavity 14.1-2522 to be relatively greater. Similarly, a relatively smaller second angle 14.1-014 (e.g., between about 5 degrees and 45 degrees) can cause the force required to insert the plug connector 14.1-2502 into the cavity 14.1-2522 to be relatively greater. Alternatively, a relatively larger first angle 14.1-013 (e.g., between about 45 degrees and 89 degrees) can cause the force required to insert the plug connector 14.1-2502 into the cavity 14.1-2522 to be relatively smaller. A relatively larger second angle 14.1-014 (e.g., between about 45 degrees and 89 degrees) can cause the force required to insert the plug connector 14.1-2502 into the cavity 14.1-2522 to be relatively smaller. In other words, sizes of the first angle 14.1-013 and the second angle 14.1-014 can be chosen to generate a desired force required to insert the plug connector 14.1-2502 into the cavity 14.1-2522 (i.e., move the detent element 14.1-2530 out of the path of the boot 14.1-2506 as the plug connector 14.1-2502 is inserted into the cavity 14.1-2522). The force required to insert the plug connector 14.1-2502 into the cavity 14.1-2522 can be in a range from about 1 kgf to about 1.2 kgf, in a range from about 1 kgf to about 2 kgf, in a range from about 0.5 kgf to about 5 kgf, in a range from about 0 kgf to about 1 kgf, in a range from about 1 kgf to about 10 kgf, or the like.

In the example of FIG. 14.1-28B, the boot 14.1-2506 includes the sloped portion 14.1-2514 adjacent a linear portion 14.1-2512. The sloped portion 14.1-2514 defines a side surface of the recess 14.1-2510. In some examples, the sloped portion 14.1-2514 can be curved, rather than sloped. The linear portion 14.1-2512 and the sloped portion 14.1-2514 can form a third angle 14.1-015. The third angle 14.1-015 can be less than 90 degrees, such as, between about 89 degrees and about 60 degrees, between about 60 degrees and about 30 degrees, between about 30 degrees and about 5 degrees, or greater than about 5 degrees.

In some examples, a force required to remove the plug connector 14.1-2502 from the cavity 14.1-2522 can correlate to the third angle 14.1-015. For example, a relatively smaller third angle 14.1-015 (e.g., between about 5 degrees and 45 degrees) can cause the force required to remove the plug connector 14.1-2502 from the cavity 14.1-2522 to be relatively smaller. Alternatively, a relatively larger third angle 14.1-015 (e.g., between about 45 degrees and 89 degrees) can cause the force required to remove the plug connector 14.1-2502 from the cavity 14.1-2522 to be relatively greater. In other words, a size of the third angle 14.1-015 can be chosen to generate a desired force required to remove the plug connector 14.1-2502 from the cavity 14.1-2522 (i.e., move the detent element 14.1-2530 out of the path of the boot 14.1-2506 as the plug connector 14.1-2502 is removed from the cavity 14.1-2522). The force required to remove the plug connector 14.1-2502 from the cavity 14.1-2522 can be in a range from about 5 kgf to about 7 kgf, in a range from about 1 kgf to about 12 kgf, in a range from about 10 kgf to about 20 kgf, in a range from about 5 kgf to about 50 kgf, in a range from about 1 kgf to about 10 kgf, in a range from about 10 kgf to about 100 kgf, or the like.

FIG. 14.1-28C illustrates the plug connector 14.1-2502 and the detent element 14.1-2530 as the plug connector 14.1-2502 is being inserted into the cavity 14.1-2522. As illustrated in FIG. 14.1-28C, inserting the boot 14.1-2506 into the cavity 14.1-2522 causes the detent element 14.1-2470 to slide/translate in the direction 14.1-$D_4$. The movement of the detent element 14.1-2530 causes the lever arm 14.1-2540 to rotate around the pivot 14.1-2542 in the direction 14.1-$D_3$ through the protrusions 14.1-2544 and the protrusion 14.1-2532. The spring of the lever arm 14.1-2540 causes a force to be applied to the detent element 14.1-2530 in the direction 14.1-$D_2$, which results in friction between the detent element 14.1-2530 and the boot 14.1-2506 as the plug connector 14.1-2502 is inserted into the cavity 14.1-2522. The force required to insert the plug connector 14.1-2502 into the cavity 14.1-2522 can be in a range from about 1 kgf to about 1.2 kgf, in a range from about 1 kgf to about 2 kgf, in a range from about 0.5 kgf to about 5 kgf, in a range from about 0 kgf to about 1 kgf, in a range from about 1 kgf to about 10 kgf, or the like.

FIG. 14.1-28D illustrates the plug connector 14.1-2502 and the detent element 14.1-2530 after the plug connector 14.1-2502 has been fully inserted into the cavity 14.1-2522. As illustrated in FIG. 14.1-28D, the spring of the lever arm 14.1-2540 causes a force to be applied to the detent element 14.1-2530. This rotates the lever arm 14.1-2540 in the direction 14.1-$D_1$ and translates the detent element 14.1-2530 in the direction 14.1-$D_2$ such that the detent element 14.1-2530 slides into the recess 14.1-2510. The detent element 14.1-2530 can contact a side surface of the boot 14.1-2506 when the plug connector 14.1-2502 is fully inserted into the cavity 14.1-2522 (e.g., the detent element 14.1-2530 is fully inserted into the recess 14.1-2510). For example, the detent element 14.1-2530 can contact a side surface of the boot 14.1-2506 adjacent the recess 14.1-2510 and the sloped portion 14.1-2514.

As described previously, the sloped portion 14.1-2514 of the boot 14.1-2506 can be configured such that a force required to remove the plug connector 14.1-2502 from the cavity 14.1-2522 can be in a range from about 5 kgf to about 7 kgf, in a range from about 1 kgf to about 12 kgf, in a range from about 10 kgf to about 20 kgf, in a range from about 5 kgf to about 50 kgf, in a range from about 1 kgf to about 10 kgf, in a range from about 10 kgf to about 100 kgf, or the like. A ratio of the force required to remove the plug connector 14.1-2502 from the cavity 14.1-2522 to the force required to insert the plug connector 14.1-2502 into the cavity 14.1-2522 can be in a range from about 1 to about 10, from about 1.5 to about 3, from about 2 to about 4, from about 3 to about 5, from about 1.5 to about 5, or the like. In some examples, the detent element 14.1-2530 can also include a sloped portion, which can be configured to interface with the sloped portion 14.1-2514 and can reduce the force required to remove the plug connector 14.1-2502 from the cavity 14.1-2522. As illustrated in FIG. 14.1-28D, in some examples, the boot 14.1-2506 can be flush with the trim ring 14.1-2520 (i.e., an external-facing surface of the boot 14.1-2506 can be flush with an external-facing surface of the trim ring 14.1-2520) when the plug connector 14.1-2502 is disposed within the trim ring 14.1-2520.

FIG. 14.1-28E illustrates the detent element 14.1-2530 and the lever arm 14.1-2540 after a tool 14.1-2560 is used to release the plug connector 14.1-2502. In some examples, the trim ring 14.1-2520 can include an aperture 14.1-2524 that can receive the tool 14.1-2560. The tool 14.1-2560 can be shaped as cubic, cylindrical, triangular, or any other geometric shape. The aperture 14.1-2524 can form a corresponding geometric shape, into which the tool 14.1-2560 can be inserted or otherwise positioned. A user can use the tool 14.1-2560 to rotate the lever arm 14.1-2540 in the direction 14.1-$D_3$, which moves the detent element 14.1-2530 in the direction 14.1-$D_4$. This slides the detent element 14.1-2530 out of the recess 14.1-2510 and allows the plug connector 14.1-2502 to be removed from the cavity 14.1-2522. Once the detent element 14.1-2530 is moved out of the recess 14.1-2510, a force required to remove the plug connector 14.1-2502 from the cavity 14.1-2522 can be in a range from about 1 kgf to about 1.2 kgf, in a range from about 1 kgf to about 2 kgf, in a range from about 0.5 kgf to about 5 kgf, in a range from about 0 kgf to about 1 kgf, in a range from about 1 kgf to about 10 kgf, or the like. A force required to use the tool 14.1-2560 to remove the detent element 14.1-2530 from the recess 14.1-2519 can be in a range from about 1 kgf to about 1.2 kgf, in a range from about 1 kgf to about 2 kgf, in a range from about 0.5 kgf to about 5 kgf, in a range from about 0 kgf to about 1 kgf, in a range from about 1 kgf to about 10 kgf, or the like.

FIG. 14.1-28F illustrates a perspective view of the lever arm 14.1-2540. As illustrated in FIG. 14.1-28F, the lever arm 14.1-2540 includes a body portion that is rotatable around a pivot 14.1-2542. The pivot 14.1-2542 can be a pin, rivet, screw, bolt, a combination thereof, or any other fastener. A spring 14.1-2541 is disposed in the body portion and wrapped around the pivot 14.1-2542. The spring 14.1-2541 is configured to apply a spring force to the body portion of the lever arm 14.1-2540 in a direction 14.1-$D_1$. The body portion of the lever arm 14.1-2540 includes protrusions 14.1-2544 and a protrusion 14.1-2546. The protrusions 14.1-2544 can be used to physically interact with a detent element, as discussed previously. The protrusion 14.1-2546 can be used to interact with a tool, as discussed previously, and can be used to aid in removing a plug connector from a trim ring.

Providing the detent element 14.1-2530 and the lever arm 14.1-2540 to retain the plug connector 14.1-2502 in the cavity 14.1-2522 allows the plug connector 14.1-2502 to be inserted into the cavity 14.1-2522 with a relatively small force and requires a relatively large force to remove the plug connector 14.1-2502 from the cavity 14.1-2522. This prevents the plug connector 14.1-2502 from unwantedly or accidentally being disconnected from an electronic device. Moreover, by providing the aperture 14.1-2524 and the tool 14.1-2560, the plug connector 14.1-2502 can be easily removed when desired.

FIGS. 14.1-29A through 14.1-29E illustrate seals 14.1-2626 that can be included in a trim ring 14.1-2620 for providing sealing between the trim ring 14.1-2620 and a boot 14.1-2606 of a plug connector 14.1-2602 of a cable assembly 14.1-2600. The cable assembly 14.1-2600 includes the plug connector 14.1-2602 and a shielded cable 14.1-2608 coupled to the plug connector 14.1-2602. The plug connector 14.1-2602 includes a plug 14.1-2604 and the boot 14.1-2606 coupled to the plug 14.1-2604 and the shielded cable 14.1-2608.

The plug connector 14.1-2602 can be received in a cavity 14.1-2622 of an enclosure 14.1-2610 and the trim ring 14.1-2620. The trim ring 14.1-2620 can be coupled to the enclosure 14.1-2610, and a receptacle connector 14.1-2650 can be coupled to the trim ring 14.1-2620. The trim ring 14.1-2620 can include a detent element 14.1-2630 and a lever arm 14.1-2640. The detent element 14.1-2630 can include a protrusion 14.1-2632 configured to interface with the lever arm 14.1-2640. The detent element 14.1-2630 can be configured to interface with openings 14.1-2609 in the boot 14.1-2606 to fasten the plug connector 14.1-2602 in the cavity 14.1-2622. The lever arm 14.1-2640 can be rotatable around a pivot 14.1-2642 and can include protrusions 14.1-2644 configured to interface with the protrusion 14.1-2632 of the detent element 14.1-2632. The lever arm 14.1-2640 can further include a protrusion 14.1-2646 configured to interface with a tool 14.1-2660 in order to un-fasten the plug connector 14.1-2602 from the cavity 14.1-2622. An aperture 14.1-2624 can be provided in the trim ring 14.1-2620 and the enclosure 14.1-2610 in order to provide access to the tool 14.1-2660. As such, the tool 14.1-2660 can extend through the enclosure 14.1-2610 and the trim ring 14.1-2620 to interface with the protrusion 14.1-2646.

FIG. 14.1-29A shows a sectional view of the cable assembly 14.1-2600, the enclosure 14.1-2610, the trim ring 14.1-2620, and the receptacle connector 14.1-2650. As shown in FIG. 14.1-29A, the seal 14.1-2626 can be L-shaped in a cross-sectional view. The seal 14.1-2626 can be provided on the trim ring 14.1-2620, between the trim ring 14.1-2620 and the enclosure 14.1-2610. This provides sealing between the trim ring 14.1-2620 and the enclosure 14.1-2610. The seal 14.1-2626 is also provided between a body of the trim ring 14.1-2620 and the cavity 14.1-2622 of the trim ring 14.1-2620. This provides sealing between the trim ring 14.1-2620 and the boot 14.1-2606 of the plug connector 14.1-2602. Placing the seal 14.1-2626 in this configuration provides sealing between the trim ring 14.1-2620 and both the boot 14.1-2606 and the enclosure 14.1-2610. The seal 14.1-2626 can include an elastic material that can be stretched around a lip of the trim ring 14.1-2620 and can be secured to the trim ring 14.1-2620 by interference with the lip of the trim ring 14.1-2620.

FIG. 14.1-29B shows a sectional view of the cable assembly 14.1-2600, the enclosure 14.1-2610, the trim ring 14.1-2620, and the receptacle connector 14.1-2650. FIG. 14.1-29E shows a perspective view of the lever arm 14.1-2640. The lever arm 14.1-2640 includes a spring 14.1-2641 wrapped around the pivot 14.1-2642 and configured to apply a spring force to a body portion of the lever arm 14.1-2640. A seal 14.1-2647 is coupled to the protrusion 14.1-2646 of the lever arm 14.1-2640. The spring 14.1-2641 can apply a spring force to the lever arm 14.1-2640 that presses the seal 14.1-2647 against the enclosure 14.1-2610. This provides sealing between the trim ring 14.1-2620 and an exterior of an electronic device. The tool 14.1-2660 can be configured to pass through an opening 14.1-2643 in the seal 14.1-2647 when the tool 14.1-2660 is used to actuate the protrusion 14.1-2646. The seal 14.1-2647 can be a soft gasket or the like.

FIG. 14.1-29C shows a perspective view of the plug connector 14.1-2602 and the trim ring 14.1-2620 and FIG. 14.1-29D illustrates a partial sectional view of the trim ring 14.1-2620. In some examples, the boot 14.1-2606, the plug 14.1-2604, and the cavity 14.1-2622 can be stadium-shaped in a cross-sectional view. In some examples, the boot 14.1-2606, the plug 14.1-2604, and the cavity 14.1-2622 can be rectangular, triangular, rounded, or can have any other shape in a cross-sectional view. The trim ring 14.1-2620 can include a first cavity portion 14.1-2622A configured to receive the boot 14.1-2606 and a second cavity portion 14.1-2622B configured to receive the plug 14.1-2604. The trim ring 14.1-2620 can include a third cavity portion 14.1-2622C configured to receive the detent element 14.1-2630. The third cavity portion 14.1-2622C can be adjacent the first cavity portion 14.1-2622A, and can align the 14.1-2630 with openings 14.1-2609 in the side surfaces of the boot 14.1-2606.

FIGS. 14.1-29C and 14.1-29D further illustrate details of the seal 14.1-2626. As illustrated in FIG. 14.1-29D, the seal 14.1-2626 can have an L-shape in a cross-sectional view. The seal 14.1-2626 can be wrapped around at least a portion of a body of the trim ring 14.1-2620, such as a lip of the trim ring 14.1-2620. The seal 14.1-2626 can be formed of an elastic material, and an elastic force of the elastic material can retain the seal 14.1-2626 on the lip of the trim ring 14.1-2620. In some examples, an adhesive or the like can be provided between the seal 14.1-2626 and the body of the trim ring 14.1-2620 to secure the seal 14.1-2626 to the trim ring 14.1-2620.

The seal 14.1-2626 can act as a seal which prevents or limits ingress of contaminants (e.g., liquid, dust, lint, debris, or the like) into the trim ring 14.1-2620 and the receptacle connector 14.1-2650 through the cavity 14.1-2622, such as when the plug connector 14.1-2602 is inserted into the cavity 14.1-2622. The seal 14.1-2626 can provided sealing between the trim ring 14.1-2620 and the plug connector 14.1-2602 and between the trim ring 14.1-2620 and the enclosure 14.1-2610. The seal 14.1-2647 can act as a seal which prevents or limits ingress of contaminants (e.g., liquid, dust, lint, debris, or the like) into the trim ring 14.1-2620 and the through the aperture 14.1-2624.

FIGS. 14.1-30A through 14.1-30C illustrate a seal 14.1-2726 included on a trim ring 14.1-2720 and a seal 14.1-2705 included on a plug connector 14.1-2702 of a cable assembly 14.1-2700. The seal 14.1-2726 can provide sealing between an enclosure 14.1-2710 and the trim ring 14.1-2720 and between the trim ring 14.1-2720 and the plug connector 14.1-2702. The seal 14.1-2705 can provide sealing between the plug connector 14.1-2702 and the enclosure 14.1-2710. The plug assembly 14.1-2700 includes the plug connector 14.1-2702 coupled to a shielded cable 14.1-2708. The plug connector 14.1-2702 includes a plug 14.1-2704 and the boot 14.1-2706 coupled to the plug 14.1-2704 and the shielded cable 14.1-2708.

The plug connector 14.1-2702 can be received in a cavity 14.1-2722 of an enclosure 14.1-2710 and the trim ring 14.1-2720. The trim ring 14.1-2720 can be coupled to the enclosure 14.1-2710, and a receptacle connector 14.1-2750 can be coupled to the trim ring 14.1-2720. The trim ring 2620 can include a detent element 14.1-2730 and a lever arm 14.1-2740. The detent element 14.1-2730 can be configured to interface with openings 14.1-2709 in the boot 14.1-2706 to fasten the plug connector 14.1-2702 in the cavity 14.1-2722. The lever arm 14.1-2740 can be rotatable around a pivot. The lever arm 14.1-2740 can include a protrusion 14.1-2746 configured to interface with a tool in order to un-fasten the plug connector 14.1-2702 from the cavity 14.1-2722.

The seal 14.1-2705 can be coupled to the boot 14.1-2706 between the shielded cable 14.1-2708 and the openings 14.1-2709. In the example illustrated in FIG. 14.1-30B, the seal 14.1-2705 can be provided adjacent the enclosure 14.1-2710. Providing the seal 14.1-2705 in this position provides sealing between the boot 14.1-2706 and the enclosure 14.1-2710, which also seals the trim ring 14.1-2720 from an external environment. In the example illustrated in FIG. 14.1-30C, the seal 14.1-2705 can be provided adjacent the enclosure 14.1-2710 and the trim ring 14.1-2720. Providing the seal 14.1-2705 in this position can provide sealing between the boot 14.1-2706 and each of the enclosure 14.1-2710 and the trim ring 14.1-2720 and can also provide sealing between the enclosure 14.1-2710 and the trim ring 14.1-2720. Although the seal 14.1-2705 is illustrated as being between the seal 14.1-2726 and the shielded cable 14.1-2708, the seal 14.1-2705 can be positioned at any point along the boot 14.1-2706, such as between the seal 14.1-2726 and the plug 14.1-2704, between the seal 14.1-2726 and the openings 14.1-2709, between the openings 14.1-2704 and the plug 14.1-2704, or the like. Moreover, the seal 14.1-2705 can be provided in place of, or in addition to the seal 14.1-2726.

FIG. 14.1-30B shows a sectional view of the cable assembly 14.1-2700, the enclosure 14.1-2710, the trim ring 14.1-2720, and the receptacle connector 14.1-2750. As shown in FIG. 14.1-30B, the seal 14.1-2726 can be L-shaped in a cross-sectional view. The seal 14.1-2726 can be provided on the trim ring 14.1-2720, between the trim ring 14.1-2720 and the enclosure 14.1-2710. This provides sealing between the trim ring 14.1-2720 and the enclosure 14.1-2710. The seal 14.1-2726 is also provided between a body of the trim ring 14.1-2720 and the cavity 14.1-2722 of the trim ring 14.1-2720. This provides sealing between the trim ring 14.1-2720 and the boot 14.1-2706 of the plug connector 14.1-2702. Placing the seal 14.1-2726 in this configuration provides sealing between the trim ring 14.1-2720 and both the boot 14.1-2706 and the enclosure 14.1-2710. The seal 14.1-2726 can include an elastic material that can be stretched around a lip of the trim ring 14.1-2720 and can be secured to the trim ring 14.1-2720 by interference with the lip of the trim ring 14.1-2720.

FIG. 14.1-30C shows a sectional view of the cable assembly 14.1-2700, the enclosure 14.1-2710, the trim ring 14.1-2720, and the receptacle connector 14.1-2750. As shown in FIG. 14.1-30C, the seal 14.1-2726 can be rectangular in a cross-sectional view. Other shapes can be used for the seal 14.1-2726, such as rounded, triangular, or the like. The seal 14.1-2726 can be provided between the body of the trim ring 14.1-2720 and the boot 14.1-2706, between an outer surface of the trim ring 14.1-2720 facing the enclosure 14.1-2710 and an inner surface of the trim ring 14.1-2720 facing the receptacle connector 14.1-2750. The seal 14.1-2726 can provide sealing between the trim ring 14.1-2720 and the boot 14.1-2706.

The seal 14.1-2726 can act as a seal which prevents or limits ingress of contaminants (e.g., liquid, dust, lint, debris, or the like) into the trim ring 14.1-2720 and the receptacle connector 14.1-2750 through the cavity 14.1-2722, such as when the plug connector 14.1-2702 is inserted into the cavity 14.1-2722. The seal 14.1-2726 can provided sealing between the trim ring 14.1-2720 and the plug connector 14.1-2702 and between the trim ring 14.1-2720 and the enclosure 14.1-2710. The seal 14.1-2705 can act as a seal which prevents or limits ingress of contaminants (e.g., liquid, dust, lint, debris, or the like) into the trim ring 14.1-2720 and the receptacle connector 14.1-2750 through the cavity 14.1-2722, such as when the plug connector 14.1-2702 is inserted into the cavity 14.1-2722. The seal 14.1-2705 can provided sealing between the plug connector 14.1-2702 and the enclosure 14.1-2710, between the plug connector 14.1-2702 and both of the trim ring 14.1-2720 and the enclosure 14.1-2710, or the like.

FIGS. 14.1-31A and 14.1-31B show sectional views of a plug connector 14.1-2800 inserted into a receptacle connector 14.1-2820 and fastened by a detent element 14.1-2830. The plug connector 14.1-2800 includes a boot 14.1-2804 and a plug 14.1-2802 coupled to the boot 14.1-2804. The boot includes recesses 14.1-2806 formed in side surfaces thereof. The detent element 14.1-2830 can interface with the recesses 14.1-2806 to retain the boot 14.1-2806 and the plug connector 14.1-2800 in a cavity of the receptacle connector 14.1-2820 and a trim ring.

The detent element 14.1-2830 includes a protrusion 14.1-2832 configured to interface with a lever arm 14.1-2810. The detent element 14.1-2830 and the lever arm 14.1-2810 can be included in a trim ring, as discussed in examples previously. The lever arm 14.1-2810 includes protrusions 14.1-2814 configured to interface with the protrusion 14.1-2832 of the detent element 14.1-2830. The lever arm 14.1-2810 can include a spring and can be configured to supply a spring force to the detent element 14.1-2830 through the protrusions 14.1-2814 and the protrusion 14.1-2832 to retain the detent element 14.1-2830 in an engaged configuration (illustrated in FIG. 14.1-31A). The lever arm 14.1-2810 can include a protrusion 14.1-2816 configured to interact with a tool 14.1-2840 in order to transition the lever arm 14.1-2810 and the detent element 14.1-2830 from the engaged configuration to an un-engaged configuration (illustrated in FIG. 14.1-31B). As such, the lever arm 14.1-2810 can be used to retain the detent element 14.1-2830 in an engaged configuration and transition the detent element 14.1-2830 to an un-engaged configuration. The detent element 14.1-2830 can also include fasteners 14.1-2834, which can couple the detent element 14.1-2830 to a body of a trim ring. The detent element 14.1-2830 can translate relative to the fasteners 14.1-2834 as the detent element 14.1-2830 moves from the engaged configuration to the un-engaged configuration.

The lever arm 14.1-2810 can include a protrusion 14.1-2811 configured to interact with a spring 14.1-2819. The spring 14.1-2819 can interact with the protrusion 14.1-2811 to resist movement of the lever arm 14.1-2810. In some examples, the spring 14.1-2819 can provide a desired feel to a user using the tool 14.1-2840 to un-latch the detent element 14.1-2830 and the lever arm 14.1-2810. For example, as illustrated in FIGS. 14.1-31A and 14.1-31B, the spring 14.1-2819 can move over the protrusion 14.1-2811 as the lever arm 14.1-2810 rotates from the engaged configuration (shown in FIG. 14.1-31A) to the un-engaged configuration (shown in FIG. 14.1-31B). This can provide a physical click through the tool 14.1-2840, which informs the user that the lever arm 14.1-2810 and the detent element 14.1-2830 are un-latched, and the plug connector 14.1-2800 can be removed from the trim ring and the receptacle connector 14.1-2820. Positions of the spring 14.1-2819 and the protrusion 14.1-2811, as well as lengths of the spring 14.1-2819, angles of the spring 14.1-2819, shapes of the protrusion 14.1-2811, and the like can be altered to alter the force required to rotate the lever arm 14.1-2810, as well as the feel to a user of moving the lever arm 14.1-2810.

In some examples, the receptacle connector 14.1-2820 can include an exterior portion 14.1-2824 and an interior portion 14.1-2822. For example, the exterior portion 14.1-2824 can at least partially encompass the interior portion 14.1-2822. In other words, the exterior portion 14.1-2824 can act as a sleeve or shell that at least partially surrounds the interior portion 14.1-2822. The exterior portion 14.1-

2824 and interior portion 14.1-2822 can be interlocked or affixed to one another. In some examples, the receptacle connector 14.1-2820 can be formed from a singular or monolithic structure instead of the external portion 14.1-2824 and the internal portion 14.1-2822. The receptacle connector 14.1-2820 can form a slot capable of receiving and retaining the plug connector 14.1-2800.

FIGS. 14.1-32A through 14.1-32C illustrate a method of assembling a trim ring 14.1-2930 and a plug connector 14.1-2940 in an enclosure 14.1-2900. In FIG. 14.1-32A, a frame 14.1-2910 is attached to the enclosure 14.1-2900. The enclosure can include a side surface 14.1-2902, an opening 14.1-2904 for receiving a plug connector, a bottom surface 14.1-2906, and a top surface 14.1-2908. The frame 14.1-2910 can be attached to structures of the bottom surface 14.1-2906 and the side surface 14.1-2902 through fasteners 14.1-2920. The fasteners 14.1-2920 can extend longitudinally in a direction from the top surface 14.1-2908 towards the bottom surface 14.1-2906 and can pull the frame 14.1-2910 down towards the bottom surface 14.1-2906. Although three fasteners 14.1-2920 are illustrated for attaching the frame 14.1-2910 to the enclosure 14.1-2900, any number of the fasteners 14.1-2920 can be included.

In FIG. 14.1-32B, the trim ring 14.1-2930 is attached to the frame 14.1-2910. The trim ring 14.1-2930 can be attached to the frame 14.1-2910 through fasteners 14.1-2922. The fasteners 14.1-2922 can extend into openings 14.1-2912 of the frame 14.1-2910, illustrated in FIG. 14.1-32A. The fasteners 14.1-2922 can extend longitudinally in a direction parallel to the bottom surface 14.1-2906, and can pull the trim ring 14.1-2930 towards the frame 14.1-2910 and the side surface 14.1-2902 of the enclosure 14.1-2900. A dummy trim ring can be inserted through the opening 14.1-2904 in the enclosure 14.1-2900 and into an opening 14.1-2932 in the trim ring 14.1-2930 in order to align the trim ring 14.1-2930 with the enclosure 14.1-2900. Although three fasteners 14.1-2922 are illustrated for attaching the trim ring 14.1-2930 to the frame 14.1-2910, any number of the fasteners 14.1-2922 can be included.

In FIG. 14.1-32C, the receptacle connector 14.1-2940 is attached to the trim ring 14.1-2930. The receptacle connector 14.1-2940 can be attached to the trim ring 14.1-2930 through fasteners 14.1-2924. The fasteners 14.1-2924 can extend into openings 14.1-2934 of the trim ring 14.1-2930, illustrated in FIG. 14.1-32A. The fasteners 14.1-2924 can extend longitudinally in a direction parallel to the bottom surface 14.1-2906 and can pull the receptacle connector 14.1-2940 towards the trim ring 14.1-2930, the frame 14.1-2910, and the side surface 14.1-2902 of the enclosure 14.1-2900. The dummy trim ring can be inserted through the opening 14.1-2904 in the enclosure 14.1-2900, the opening 14.1-2932 in the trim ring 14.1-2930, and into an opening in the receptacle connector 14.1-2940 in order to align the receptacle connector 14.1-2940 with the trim ring 14.1-2930 and the enclosure 14.1-2900. Although two fasteners 14.1-2924 are illustrated for attaching the receptacle connector 14.1-2940 to the trim ring 14.1-2930, any number of the fasteners 14.1-2924 can be included.

FIGS. 14.1-33A through 14.1-33F illustrate an example of a plug connector 14.1-3000 inserted into a receptacle connector 14.1-3030 and fastened in the receptacle connector 14.1-3030 by a lever arm 14.1-3010. The plug connector 14.1-3000 includes a boot 14.1-3002 and a plug 14.1-3004 coupled to the boot 14.1-3002. The boot 14.1-3002 includes recesses 14.1-3003.

The lever arm 14.1-3010 can be included in a trim ring coupled to the receptacle connector 14.1-3030. The lever arm 14.1-3010 is rotatable around a pivot 14.1-3012. The lever arm 14.1-3010 includes a protrusion 14.1-3014 configured to interact with the recesses 14.1-3003 of the boot 14.1-3002 to retain the plug connector 14.1-3000 in the trim ring and the receptacle connector 14.1-3030. The lever arm 14.1-3010 can be rotatable between an engaged configuration, with the protrusion 14.1-3014 disposed in a respective recess 14.1-3003, and an un-engaged configuration, with the protrusion 14.1-3014 retracted from the recess 14.1-3003.

The lever arm 14.1-3010 further includes a protrusion 14.1-3016. The protrusion 14.1-3016 can be configured to interact with a tool 14.1-3060 to transition the lever arm 14.1-3010 from the engaged configuration to the un-engaged configuration. The lever arm 14.1-3010 includes a protrusion 14.1-3018 configured to interact with a spring mechanism 14.1-3020. The spring mechanism 14.1-3020 can interact with the protrusion 14.1-3018 to retain the lever arm 14.1-3010 in the engaged configuration and can resist movement or forces of the lever arm 14.1-3010 transitioning to the un-engaged configuration.

The spring mechanism 14.1-3020 can include a central member 14.1-3022 extending into a spring 14.1-3024 and a stop 14.1-3026. The protrusion 14.1-3018 interacts with the central member 14.1-3022 to compress the spring 14.1-3024 into the stop 14.1-3026. This compression of the spring 14.1-3024 exerts a spring force on the protrusion 14.1-3018 through the central member 14.1-3022 to retain the lever arm 14.1-3010 in the engaged configuration, and to resist the lever arm 14.1-3010 from transitioning to the un-engaged configuration.

In some examples, the receptacle connector 14.1-3030 can include an exterior portion 14.1-3034 and an interior portion 14.1-3032. For example, the exterior portion 14.1-14.1-3024 can at least partially encompass the interior portion 14.1-3032. In other words, the exterior portion 14.1-3034 can act as a sleeve or shell that at least partially surrounds the interior portion 14.1-3032. The exterior portion 14.1-3034 and interior portion 14.1-3032 can be interlocked or affixed to one another. In some examples, the receptacle connector 14.1-3030 can be formed from a singular or monolithic structure instead of the external portion 14.1-3034 and the internal portion 14.1-3032. The receptacle connector 14.1-3030 can form a slot capable of receiving and retaining the plug connector 14.1-3000.

FIG. 14.1-33B is a detailed view of a region 14.1-3050 of FIG. 14.1-33A. As illustrated in FIGS. 14.1-33A and 14.1-33B, as the plug connector 14.1-3000 is inserted into a trim ring and the receptacle connector 14.1-3030, the protrusion 14.1-3014 extends along a side surface of the boot 14.1-3002. Once the plug connector 14.1-3000 is fully inserted into the trim ring and the receptacle connector 14.1-3030, the protrusion 14.1-3014 can extend into the recess 14.1-3003 and can retain the plug connector 14.1-3000 in the trim ring and the receptacle connector 14.1-3030. The protrusion 14.1-3014 can extend through a body portion 14.1-3046 of the trim ring. The spring 14.1-3024 of the spring mechanism 14.1-3020 is in a compressed state and pushes the protrusion 14.1-3014 of the lever arm 14.1-3010 against the side surface of the boot 14.1-3002 through the interaction between the central member 14.1-3022 and the protrusion 14.1-3018. The lever arm 14.1-3010 is in the engaged configuration, such that the lever arm 14.1-3010 applies a force against the boot 14.1-3002 in a clockwise direction.

FIGS. 14.1-33C and 14.1-33D illustrate the lever arm 14.1-3010 after the plug connector 14.1-3000 is fully inserted into the trim ring and the receptacle connector 14.1-3030, such that the protrusion 14.1-3014 extend into the recess 14.1-3003. Spring force from the spring 14.1-3024 of the spring mechanism 14.1-3020 through the central member 14.1-3022 and the protrusion 14.1-3018 causes the lever arm 14.1-3010 to rotate in a counterclockwise direction. The protrusion 14.1-3014 extends through the body portion 14.1-3046 of the trim ring into the recess 14.1-3003 of the boot 14.1-3002. This is the engaged configuration in which the protrusion 14.1-3014 secures and fastens the boot 14.1-3002 into the trim ring and the receptacle connector 14.1-3030. The spring 14.1-3024 of the spring mechanism 14.1-3020 is in a partially extended state and pushes the protrusion 14.1-3014 of the lever arm 14.1-3010 against a side surface of the boot 14.1-3002 adjacent the recess 14.1-3003 through the interaction between the central member 14.1-3022 and the protrusion 14.1-3018. The lever arm 14.1-3010 is in the engaged configuration, such that the lever arm 14.1-3010 applies a force against the boot 14.1-3002 in a clockwise direction.

FIGS. 14.1-33E and 14.1-33F illustrate the lever arm 14.1-3010 after the tool 14.1-3060 is used to actuate the lever arm 14.1-3010, transitioning the lever arm 14.1-3010 from the engaged configuration to the un-engaged configuration. Force from the tool 14.1-3060 overcomes a spring force of the spring 14.1-3024 of the spring mechanism 14.1-3020 and causes the lever arm 14.1-3010 to rotate in a clockwise direction. The protrusion 14.1-3014 retracts from the recess 14.1-3003 through the body portion 14.1-3046 of the trim ring such that the plug connector 14.1-3000 can be removed from the trim ring and the receptacle connector 14.1-3030. This is the un-engaged configuration in which the protrusion 14.1-3014 no longer secures and fastens the boot 14.1-3002 into the trim ring and the receptacle connector 14.1-3030. The spring 14.1-3024 of the spring mechanism 14.1-3020 is in a compressed state and resists the force supplied by the tool 14.1-3060. The lever arm 14.1-3010 is in the un-engaged configuration, such that the lever arm does not apply a force against the boot 14.1-3002.

The spring mechanism 14.1-3020 can be part of the trim ring, or part of the receptacle connector 14.1-3030 and fastened to the receptacle connector 14.1-3030. The lever arm 14.1-3010 and the spring mechanism 14.1-3020 can overlap portions of the plug connector 14.1-3000 and the receptacle 14.1-3030, which can enable the fastener of FIGS. 14.1-33A through 14.1-33F to be formed in a smaller package, providing more space within an enclosure for other components, or providing for a smaller enclosure.

FIGS. 14.1-34A and 14.1-34B illustrate perspective views of a cable assembly 14.1-3006 inserted into a trim ring 14.1-3040 and a receptacle connector 14.1-3030. The cable assembly 14.1-3006 includes a shielded cable 14.1-3007 and a plug connector 14.1-3000. The plug connector 14.1-3002 includes a boot 14.1-3002. The boot includes recesses 14.1-3003 formed in the side surfaces thereof.

The trim ring 14.1-3040 includes a lever arm 14.1-3010 and a spring mechanism 14.1-3020. The lever arm 14.1-3010 is provided for fastening the plug connector 14.1-3030 in the trim ring 14.1-3040 and the receptacle connector 14.1-3030. The lever arm 14.1-3010 includes a protrusion 14.1-3014 configured to be inserted into a respective recess 14.1-3003 of the boot 14.1-3002 (such as by rotation around a pivot 14.1-3012) and to retain the plug connector 14.1-3002 within the trim ring 14.1-3040 and the receptacle connector 14.1-3030. The lever arm 14.1-3010 includes a protrusion 14.1-3016 configured to interact with a tool in order to transition the lever arm 14.1-3010 to an un-engaged configuration and to release the plug connector 14.1-3000 from the trim ring 14.1-3040 and the receptacle connector 14.1-3030. The lever arm 14.1-3010 includes a protrusion 14.1-3018 configured to interact with the spring mechanism 14.1-3020, to retain the lever arm in the engaged configuration, and to resist force supplied by the tool through the protrusion 14.1-3016.

The spring mechanism 14.1-3020 is provided for retaining the lever arm 14.1-3010 in an engaged configuration. The spring mechanism 14.1-3020 includes a central member 14.1-3022, a spring 14.1-3024, and a stop 14.1-3026. The central member 14.1-3022 is provided for interacting with the protrusion 14.1-3018 of the lever arm 14.1-3010. The spring 14.1-3024 is provided for providing a spring force to the central member 14.1-3022 to retain the lever arm 14.1-3010 in the engaged configuration through the protrusion 14.1-3018. The stop 14.1-3026 is provided for compressing the spring 14.1-3024, thereby supplying the spring force to the central member 14.1-3022.

As illustrated in FIGS. 14.1-34A and 14.1-34B, the lever arm 14.1-3010 can be disposed in a side surface of the trim ring 14.1-3040, and the spring mechanism 14.1-3020 can be disposed on a top surface of the trim ring 14.1-3040 and/or the receptacle connector 14.1-3030. The lever arm 14.1-3010 can include components extending through a portion of a sidewall of the trim ring 14.1-3040, which allows for the trim ring 14.1-3040 and the lever arm 14.1-3010 to take up less space in an enclosure. The spring mechanism 14.1-3020 can be disposed in different position to maximize space use within the enclosure.

In some examples, the receptacle connector 14.1-3030 can include an exterior portion 14.1-3034 and an interior portion 14.1-3032. For example, the exterior portion 2824 can at least partially encompass the interior portion 14.1-3032. In other words, the exterior portion 14.1-3034 can act as a sleeve or shell that at least partially surrounds the interior portion 14.1-3032. The exterior portion 14.1-3034 and interior portion 14.1-3032 can be interlocked or affixed to one another. In some examples, the receptacle connector 14.1-3030 can be formed from a singular or monolithic structure instead of the external portion 14.1-3034 and the internal portion 14.1-3032. The receptacle connector 14.1-3030 can form a slot capable of receiving and retaining the plug connector 14.1-3000. The receptacle connector 14.1-3030 can further include a printed circuit board (PCB) 14.1-3036. The PCB 14.1-3036 can be coupled to the plug of the plug connector 14.1-3000 through the interior portion 14.1-3032. The receptacle connector 14.1-3030 can be coupled to the trim ring 14.1-3040 through a portion of the interior portion 14.1-3032.

FIGS. 14.1-35A and 14.1-35B illustrate an exploded view and a side sectional view of a receptacle connector 14.1-3100. The receptacle connector 14.1-3100 includes an interior portion 14.1-3102, electrical contacts 14.1-3110, a contact block 14.1-3112, an anchor 14.1-3114, and an exterior portion 14.1-3120. The interior portion 14.1-3102 includes an opening 14.1-3104 for receiving a plug of a plug connector, openings 14.1-3106A, 14.1-3106B, and 14.1-3106C for receiving the electrical contacts 14.1-3110 (e.g., the electrical contacts 14.1-3110A, 14.1-3110B, and 14.1-3110C, respectively), and openings 14.1-3108 for fastening the interior portion 14.1-3102 to a trim ring or the like.

The electrical contacts 14.1-3110 are provided in the openings 14.1-3106 of the interior portion 14.1-3102. The contact block 14.1-3112 can be used to isolate the electrical contacts 14.1-3110 from one another, and to aid in positioning the electrical contacts 14.1-3110 relative to the openings 14.1-3106 in the interior portion 14.1-3102. The electrical contacts 14.1-3110 can be stitched to the anchor 14.1-3114, which can be stitched to the interior portion 14.1-3102 to couple the electrical contacts 14.1-3110 to the interior portion 14.1-3102 of the receptacle connector 14.1-3100. In some examples, the electrical contacts 14.1-3110 can be stitched to the contact block 14.1-3112 and/or the anchor 14.1-3114.

The exterior portion 14.1-3120 can surround at least a portion of the interior portion 14.1-3102. The exterior portion can include openings 14.1-3122 for fastening the exterior portion 14.1-3120 to the trim ring or the like. The openings 14.1-3122 can also fasten the exterior portion 14.1-3120 to the interior portion 14.1-3102.

The following description is directed to certain example connectors (including example method steps of manufacturing these connectors) shown in FIGS. 14.1-36A through 14.1-41B. In particular, the below description will include examples of electrical connectors with a protective overmold onto a flexible circuit board at a wire termination region. In some examples, the structural features of these electrical connectors can help mitigate potential issues (e.g., solder crack, electrical discontinuity, loading stresses, heat stresses, etc.) involved with overmolding elements with lower mechanical stiffness (e.g., a flex circuit board and wires). In particular implementations, and as discussed below, a stiffener element and a wrap element can allow such sensitive components to be overmolded in an effective manner. For instance, at least one of the stiffener element or the wrap element can help decrease high-temperature exposure to the flexible circuit board and wires during the overmolding process.

FIGS. 14.1-36A and 14.1-36B respectively illustrate a semi-transparent view and a solid view of an electrical connector portion 14.1-3600 in accordance with one or more examples of the present disclosure. In FIG. 14.1-36A, a connector assembly 14.1-3612 is hidden (or made partially transparent) for illustration purposes; whereas in FIG. 14.1-36B, the connector assembly 14.1-3612 is depicted for viewing. The connector assembly 14.1-3612 can include an assembled (or partially assembled) harness with prongs, sleeves, frame members, etc. The connector assembly 14.1-3612 can thus be sized and shaped to receive electrical components inside a receptacle 14.1-3616 defined by the internal walls of the connector assembly 14.1-3612. In particular implementations, the connector assembly 14.1-3612 is sized and shaped such that one or more electrical components can be withdrawn from inside the receptacle 14.1-3616 to expose at least a portion of one or more such components for manufacturing (as will be discussed below, and as shown in FIG. 14.1-36A). Once these manufacturing steps have been performed, the electrical components can be inserted (e.g., pushed) back into the receptacle 14.1-3616 (as will also be discussed below, and as shown in FIG. 14.1-36B).

FIGS. 14.1-36A and 14.1-36B illustrate the electrical connector portion 14.1-3600 including a wrap 14.1-3602. The wrap 14.1-3602 can include one or more elements that can help support or protect wires 14.1-3606 leading into a termination region. In certain examples, the wrap 14.1-3602 can help stiffen the wires 14.1-3606 (e.g., so as to decrease bending or flex at the wire termination region). Additionally or alternatively, the wrap 14.1-3602 help keep the wires 14.1-3606 from fraying under pressure from the overmold tooling. In these or other examples, the wrap 14.1-3602 includes a jacket, coating, or tape to at least partially wrap around the wires 14.1-3606 and provide the foregoing functionality. To do so, the wrap 14.1-3602 can be made of a variety of materials. In particular examples, however, the wrap 14.1-3602 includes at least one of a silicone jacket or an acetate tape.

The electrical connector portion 14.1-3600 further includes an overmold 14.1-3608 positioned adjacent to (e.g., over, around, at least partially encompassing, etc.) a wire termination region. The overmold 14.1-3608 can be injection molded, form molded, etc. The overmold can include a variety of materials. In some examples, the overmold 14.1-3608 includes a polymer material. In particular examples, the overmold 14.1-3608 includes a liquid crystal polymer material.

In addition, the electrical connector portion 14.1-3600 can include a stiffener 14.1-3610 and 14.1-3614. The stiffener 14.1-3610 can include stiffener surfaces that can be used to glue and weld to portions of the connector assembly 14.1-3612. Additionally or alternatively, the stiffener 14.1-3610 can include stiffener surfaces that can be used to glue or welded to portions of a flex circuit 14.1-3604. In these or other examples, the attachment regions at the stiffener surfaces of the stiffener 14.1-3610 can help prevent assembly loading stresses from transferring to electrical components (e.g., the flex circuit 14.1-3604). Accordingly, the stiffener 14.1-2610 can help increase the likelihood of electrical continuity after the overmold and product assembly process.

The stiffener 14.1-3610 also includes surfaces that function as contact points for overmold tooling components (e.g., heated tooling surfaces). In some examples, surfaces of the stiffener 14.1-3610 can also include datum surfaces (e.g., to guide or center overmolded parts with respect to the tool structure, thereby reducing scalding risk).

In these or other examples, the stiffener 14.1-3610 includes one or more surfaces for hotbar termination of the flex circuit 14.1-3604 to an interfacing connector (shown in FIG. 14.1-40). In these or other examples, one or more surfaces of the stiffener 14.1-3610 can be exposed (e.g., withdrawn from inside the receptacle 14.1-3616) to perform the hotbar termination, which reduces manufacturing complexity of needing to make the hotbar termination inside the connector assembly 14.1-3612.

The stiffener 14.1-3610 can include a variety of materials. In some examples, the stiffener 14.1-3610 comprises a rigid material. In some examples, the stiffener 14.1-3610 comprises a conductive material. In some examples, the stiffener 14.1-3610 comprises a metal material. In particular examples, the stiffener 14.1-3610 comprises a steel stiffener.

The following description provides more detail at least with respect to one or more stiffener surfaces (e.g., datum surfaces). FIGS. 14.1-37 through 14.1-38 illustrate respective top and bottom views of the electrical connector portion 14.1-3600 discussed above. As mentioned, the stiffener 14.1-3610 can include datum surfaces for contacting the overmold tooling. Examples of these datum surfaces are depicted as datum surfaces 14.1-3702. The datum surfaces 14.1-3702 can include extensions, wings, jut-outs, arms, flaps, flat spots, faces, curved surfaces, etc. that are designed to contact the overmold tooling at specific locations. In these or other examples, the datum surfaces 14.1-3702 can be specially designed for custom tooling. Alternatively, the datum surfaces 14.1-3702 can be designed for many different overmold tooling.

The following description provides example method steps for manufacturing the electrical connector portion 14.1-3600 discussed above. Indeed, FIG. 14.1-39 illustrates example method steps 1-6 for manufacturing the electrical connector portion 14.1-3600 in accordance with one or more examples of the present disclosure. It will be appreciated that the following steps can be modified, omitted, or added thereto (as may be desired).

At step 1, the flex circuit 14.1-3604 is provided. At step 2, at least a portion of the stiffener 14.1-3610 is attached to the flex circuit 14.1-3604. For example, the stiffener 14.1-3610 is adhered (e.g., via pressure sensitive adhesive) or fastened via screws or the like.

At step 3, the wires 14.1-3606 (wrapped by the wrap 14.1-3602) are terminated onto the flex circuit 14.1-3604. At this step, the stiffener 14.1-3610 acts as support during the termination process. At step 4, the overmold 14.1-3608 is applied to the termination region. At step 5, the wire harness portion assembled thus far can be inserted into the receptacle 14.1-3616 of the connector assembly 14.1-3612. At step 6, an end region of the electrical connector portion 14.1-3600 is left exposed for hot-bar termination (now discussed below in relation to FIG. 14.1-40).

FIG. 14.1-40 depicts example method steps of providing an interface connector to the electrical connector portion 14.1-3600 discussed above in accordance with one or more examples of the present disclosure. At step 1, the electrical connector portion 14.1-3600 is provided (e.g., as discussed above in connection with FIG. 14.1-39). At step 2, the end region 14.1-3900 of the electrical connector portion 14.1-3600 is exposed.

At step 3, a connection 14.1-4002 is formed between the stiffener 14.1-3610 and an interface connector 14.1-4000 (e.g., a plug-in connection, prong connection, magnetic connection, etc.). In these or other examples, the connection 14.1-4002 includes a hot-bar connection, welding connection, solder connection, metal bond connection, etc. In some examples, the stiffener 14-3610 is used to transfer loading stresses from the interface connector 14.1-4000, thereby bypassing stresses to the sensitive electrical components (e.g., the flex circuit board). At step 4, the interface connector 14.1-4000 is pushed back into (e.g., flush with) the electrical connector portion 3600.

FIGS. 14.1-41A and 14.1-41B show side schematic views of the assembling the interface connector 14.1-4000 to the electrical connector portion 14.1-3600 in accordance with one or more examples of the present disclosure. In particular, FIG. 14.1-41A illustrates the end region 14.1-3900 of the electrical connector portion 3600 exposed for attaching the interface connector 14.1-4000. Then, FIG. 14.1-41B illustrates the end region 14.1-3900 of the electrical connector portion 3600 pushed inside the receptacle of the connector assembly (with the interface connector 14.1-4000 flush against the electrical connector portion 14.1-3600).

As mentioned above in relation to FIG. 14.1-40, the stiffener 14.1-3610 can prevent the transfer of stress between the interface connector. To do so, the stiffener 14.1-3610 can include one or more attachment regions to the various components. For example, the stiffener 14.1-3610 can attach to the flex circuit 14.1-3604 at the attachment region 14.1-4104, which is located adjacent to the interface connector 14.1-4000 at an underside of the stiffener 14.1-3610. Additionally or alternatively, a top side of a stiffener 14.1-4110 can attach to the flex circuit 14.1-3604 at an attachment region 14.1-4108 positioned adjacent to the overmold 14.1-3608. The underside of the stiffener 14.1-4110 can be attached to the connector assembly 14.1-3612 (e.g., a frame member of the connector assembly).

Additionally shown, an underside of the stiffener 14.1-3610 can attach to the topside of the interface connector 14.1-4000 at an attachment region 14.1-4102. Further, a top side of the flex circuit 14.1-3604 can attach to the bottom side of the interface connector 14.1-4000. In addition, the wires 14.1-3606 can attach to the flex circuit 14.1-3604 at an attachment region 14.1-4100.

With the foregoing attachments at the attachment regions discussed, the stiffener 14.1-3610 can avoid the transfer of loading stress from the interface connector 14.1-4000 to either of the flex circuit 14.1-3604 (at associated attachment regions) or the wires (and associated attachment regions). The foregoing configuration can also enable the flex circuit 14.1-3604 to be rolled up or folded (e.g., into a serpentine pattern) for positioning/storage of the extended portions of the flex circuit 14.1-3604.

Any of the features, components, and/or parts, including the arrangements and configurations thereof shown in FIGS. 14.1-36 through 14.1-41B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 14.1-36 through 14.1-41B.

14.2: Modular Components for Wearable Electronic Devices

As virtual reality (VR) and mixed reality (MR) become more ubiquitous, the demand for user friendly head-mounted displays with quality components increases. Traditionally, these VR/MR systems have been devices that include a wearable display component, often referred to as a head-mounted display (HMD) and a supplemental unit. The supplemental unit can be part of the HMD, or can be a separate component that is permanently connected to the HMD through a cable, wires, or other conductors. The supplemental unit can provide power and/or added processing functionality to the system. The components of these systems are not interchangeable and thus only have a single configuration. VR/MR systems are increasingly being used in a variety of different environments and scenarios. Thus, it can be desirable for a VR/MR system to have different properties depending on the desired use or uses.

For example, certain components can maximize comfort levels and audio quality, while other components can reduce the weight of the wearable and maximize securement of the device. The modular nature of a wearable VR/MR system and its associated components can allow particular components to be selected for incorporation into the device. For example, the components that maximize comfort and audio quality can be selected for scenarios where a user may wear a device for long periods of time, while the components that maximize weight reduction and securement may be selected for scenarios where a user desired to be highly mobile.

Further, traditional VR/MR systems, including HMD systems and devices, have packaged most or all of the components of the device in a housing that is worn on the user's face. Even in systems that contain a separate processing unit, almost all of the electronic components of the HMD portion are packaged in a single housing that is mounted to the user's head. In addition to reducing the customizability of the HMD device, this type of design can concentrate the devices weight in a single location, potentially reducing comfort for the user. In contrast, the HMD devices and systems described herein can include multiple modular and connectable parts that can distribute the electronic and functional components of the device in more than one location, increasing both modularity and comfort for a user.

These and other embodiments are discussed below with reference to FIGS. 14.2-1 through 14.2-13. However, those skilled in the art will readily appreciate that the detailed description given herein with respect to these figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 14.2-1A shows a wearable electronic device 14.2-100 being worn on the head 14.2-101 of a user. The wearable electronic device 14.2-100 can include a number of modular components. For example, the wearable device 14.2-100 can include a head-mounted display (HMD) 14.2-110 including a housing 14.2-105 and a display 14.2-107 attached to the housing for displaying images to a user (shown in FIG. 14.2-1B), one or more intermediate members, flexible straps, or connector straps 14.2-130, a retention band 14.2-120 that can be a flexible band or a band that is moldable to a user's head, and an optional supplemental unit 14.2-140 such as an external power supply, memory component, and/or processor. Although referred to as a wearable electronic device 14.2-100, it should be understood that the device 14.2-100 can include multiple modular components or devices and can be interchangeably referred to as a wearable electronic device, wearable electronic device system, and/or wearable electronic system. Additionally, although the particular component 14.2-110 can be referred to as an HMD, it should be understood that the terms HMD, HMD device, and/or HMD system can be used to refer to the wearable device 14.2-100 as a whole.

In some examples, and as shown, the device 14.2-100 can be worn on the user's head 14.2-101 such that the HMD 14.2-110 is worn on the user's face and disposed over one or both of their eyes. The HMD can be removably and/or releasably connected to the connector strap or straps 14.2-130 as described further herein. In some examples, the connector straps 14.2-130 can be positioned against the side of a user's head 14.2-101 and in contact therewith. In some examples, the connector straps 14.2-130 can be positioned above the user's ear 14.2-150 or ears, as shown. In some examples, the connector straps 14.2-130 can be positioned adjacent to the user's ear or ears. The connector straps 14.2-130 can be removably connected to the retention band 14.2-120, which can extend around the user's head 14.2-101 and removably connect to the other of the connector straps 14.2-130 (not shown). In this way, the HMD, connector straps 14.2-130, and retention band 14.2-120 can form a loop that can retain the wearable electronic device 14.2-100 on the user's head 14.2-101. As shown in FIG. 14.2-1A, the connector straps 14.2-130 can connect to the HMD 14.2-110, both mechanically and electrically, at an HMD connection location 14.2-154 that can include an electrical input or electrical connector that is attached to the housing 14.2-105 and electrically connected to the display 14.2-107 (as illustrated in FIG. 14.2-2). This location can be identified as a temple area "Y" that can be defined as an area near a user's temple adjacent to the user's eye, and can span from in front of the user's eye to approximately 1-1.5 inches past the outer corner of a user's eye, along the side of the user's head. Similarly, the connector straps 14.2-130 can connect to the retention band 14.2-120 at a retention band connection location 14.2-152 identified as an ear area "X" that can span to include the area above the user's ear 14.2-150 or within 0.5 inches of the outer edge of the ear on either side. In this manner, the connector straps 14.2-130 are able to provide structural support between the HMD 14.2-110 and the user's ear 14.2-150, while securely connecting the retention band 14.2-120 and translating the retention forces of the retention band through the wearable electronic device 14.2-100. It should be understood, however, that this configuration is just one example of how the components of a modular wearable electronic device 14.2-100 can be arranged, and that in some, a different number of connector straps and/or retention bands can be included.

FIG. 14.2-1B shows a top view of the wearable electronic device 14.2-100, demonstrating how the components of the device 14.2-100 can be mechanically and/or electrically connected to one another in some examples. In the example shown in FIG. 14.2-1B, a first connector strap 14.2-130 and a second connector strap 14.2-131 can each be removably connected or coupled to either side of the HMD 14.2-110. In some examples, the connector straps 14.2-130, 14.2-131 can both be electrically and mechanically coupled or connected to the HMD and can operate as an intermediate member located between the HMD and the retention band 14.2-120. In some examples, one of the connector straps 14.2-130, 14.2-131 can be mechanically connected, but may not be electrically connected to the HMD. The connector straps 14.2-130, 14.2-131 can each be connected to the retention band 14.2-120 at a different location on the connector strap 14.2-130, 14.2-131 than the connection to the HMD. For example, the HMD can be connected to a first end of each connector strap 14.2-130, 14.2-131, and the retention band 14.2-120 can be connected to a second, opposite end of each connector strap 14.2-130, 14.2-131.

In some examples, and as shown, at least one of the connector straps 14.2-130 can also be connected to a supplemental unit 14.2-140. The supplemental unit 14.2-140 can contain one or more processors, batteries or power supplies, antennas, and any other electrical and/or processing components, as desired. In some examples, power and/or data from the supplemental unit can be provided to the HMD through the connector strap 14.2-130 via a connection between the supplemental unit 14.2-140 and the connector strap 14.2-130, as described herein. In the present example, a conductor or cable 14.2-142 can electrically connect the supplemental unit 14.2-140 to the connector strap 14.2-130, through which the supplemental unit can provide power and/or communicate with the HMD 14.2-110, second connector strap 14.2-131, and/or retention band 14.2-120.

Although the supplemental unit 14.2-140 is shown as being connected to the connector strap 14.2-130 through a wired connection 14.2-142, it should be understood that in some examples the supplemental unit 14.2-140 may wirelessly connect or communicate data and/or power with the connector strap 14.2-130 and/or HMD 14.2-110 by any desired method or technology. Additionally, in some examples, the supplemental unit 14.2-140 can be incorporated into, or can be an integral part of, one or more of the other components of the device 14.2-100, including the retention band 14.2-120, the connector straps 14.2-130, 14.2-131, and/or the HMD 14.2-110. Further, although the components of the wearable electronic device 14.2-100 are shown as being connected to one another at certain locations, it should be understood that any of the components of the device 14.2-100 can be electrically and/or mechanically connected to one or more of any of the other components of the device 14.2-100, in any manner and location, as desired.

FIG. 14.2-1C shows an exploded view of the wearable electronic device 14.2-100, including the locations of connectors on the various components, as described herein. As can be seen, the connector strap 14.2-130 can include a first connector 14.2-132, also referred to as an HMD connector, to provide electrical communication between the connector strap 14.2-130 and the HMD 14.2-110 by removably or releasably attaching to a corresponding connector 14.2-112 on the HMD 14.2-110. As used herein, providing electrical communication between two elements can include providing any type of electrical signal including power and/or data. Additionally, in some examples, an intermediate component can include conductive elements that are in electrical communication with two or more components and can transmit an electrical signal from one component to another. In other words, multiple components can be in electrical communication with one another, including components that conduct electrical signals, and not just components that are transmitting or receiving the electrical signals. The first connector 14.2-132 can be positioned at a first end of the connector strap 14.2-130, and/or the flexible housing thereof. The connector strap 14.2-130 can also include a second connector 14.2-134 positioned at a second end, such as an opposite end, of the connector strap 14.2-130. The second connector 14.2-134 can be referred to as a retention band connector or a flexible band connector, and can be removably connectable to the retention band 14.2-120 by attaching to a corresponding connector 14.2-124 on the retention band 14.2-120. The second connector 14.2-134 can at least partially define an external surface of the connector strap 14.2-130.

The connector strap 14.2-130 can further include a third connector 14.2-136, also referred to as a supplemental unit connector, that can provide electrical communication between the connector strap 14.2-130 and the supplemental unit 14.2-140, such as through a corresponding connector 14.2-141 that can be coupled to the conductor 14.2-142. In some examples, the supplemental unit connector 14.2-136 can be positioned at or near an end of the flexible housing of the connector strap 14.2-130, opposite the first end. In some examples, the connector 14.2-136 can include a mechanical connector surrounding an electrical connector, and the connector 14.2-141 can be configured to rotate relative to the supplemental unit connector 14.2-136 when connected thereto to facilitate placement and relative freedom for the positioning of the supplemental unit 14.2-140.

Similar to the connector strap 14.2-130, the second connector strap 14.2-131 can include a first connector 14.2-133, also referred to as an HMD connector or a display connector, and a second connector 14.2-135, also referred to as a retention band connector. These connectors 14.2-133, 14.2-135 can be positioned at or near opposite ends of the housing of the connector strap 14.2-131. The connectors 14.2-133, 14.2-135, can have substantially the same or similar functionalities as any of the connectors 14.2-132, 14.2-134, 14.2-136. In some examples, the connector 14.2-133 can be releasably attached to a corresponding connector of the HMD (not shown), and the connector 14.2-135 can be releasably attached to a corresponding connector 14.2-125 of the retention band 14.2-120.

Any number or variety of components in any of the configurations described herein can be included in a wearable electronic device, such as the HMD devices and/or HMD systems described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIGS. 14.2-2A through 14.2-4.

FIG. 14.2-2A shows an exploded view of a wearable electronic device 14.2-200 that can include modular components which can be selectively and removably or releasably attached or coupled to one another as described herein. In some examples, the device 14.2-200 can be substantially similar to, or can include some or all of the features of the other wearable electronic devices described herein. As with the electronic device 14.2-100, the device 14.2-200 can include an HMD 14.2-210, a retention band 14.2-220, and one or more connector straps 14.2-230, 14.2-231. The device 14.2-200 can also include a supplemental unit (not shown) that can be connected to one or more of the components of the device 14.2-200 to provide additional functionality, power, processing speed, and the like.

Similar to the connector strap 14.2-130, the connector strap 14.2-230 can include an HMD connector 14.2-232 that can releasably couple to a corresponding connector 14.2-212, a retention band connector 14.2-234 that can releasably couple to a corresponding connector 14.2-224, and a supplemental unit connector 14.2-236 that can releasably couple to a supplemental unit. In some examples, the supplemental unit connector 14.2-236 includes a battery input and/or a data input, and can alternatively be referred to as a power connector and/or a data connector. In some examples, the HMD connected 14.2-232 can be positioned at an edge of the connector strap 14.2-230, while the retention band connector 14.2-234 and/or the supplemental unit connector 14.2-236 can be positioned at a major surface(s) of the connector strap 14.2-230, such as a side surface(s).

In some examples, and as shown, the retention band connector 14.2-234 and its associated connector 14.2-224 on the retention band 14.2-220, can include multiple connection points. In some examples, these multiple connection points can be aligned in a single line and can thus rotationally fix the connector strap 14.2-230 and the retention band 14.2-220 to one another. In some examples, any other type of connection can be implemented that can provide rotational fixation between the connector strap 14.2-230 and the retention band 14.2-220. In some examples, where the device 14.2-200 includes a second connector strap 14.2-231, that connector strap 14.2-231 can also include an HMD connector 14.2-233 and a retention band connector 14.2-235 that can be releasably coupled to a corresponding connector 14.2-225 so as to be rotationally fixed thereto.

In some examples, and as described further herein, one or more of the connector straps 14.2-230, 14.2-231 can include one or more operational elements or components 14.2-237, 14.2-238 disposed at least partially in an internal volume defined by the housing of the connector strap 14.2-230, 14.2-231. The operational element, component, or components 14.2-237, 14.2-238 can include any number of functional and/or electrical components, including output components, such as an audio module or component, display module, or data output component, input components, such as a touch sensor or touch sensitive element or component, button, toggle, switch, fingerprint sensor, camera, or other form of sensor, or any other functional and/or operational component desired. Further details of the connector straps

14.2-230, 14.2-231 are described below with respect to FIGS. 14.2-2B through 14.2-2D.

FIG. 14.2-2B shows a side view of a connector strap 14.2-231 of the electronic device 14.2-200 shown in FIG. 14.2-2A, including an HMD connector 14.2-233 disposed at an end of the strap 14.2-231, and a retention band connector 14.2-235 including multiple connection locations disposed at an opposite end of the strap 14.2-231. As can be seen, an operational component 14.2-237 can be disposed at least partially in the internal volume of the strap 14.2-231 and between the HMD connector 14.2-233 and the retention band connector 14.2-235. In some examples, and as described further herein, the housing of the strap 14.2-231 can be raised or offset at the location of the operational component 14.2-237, as desired. In some examples, the operational component 14.2-237 itself can at least partially define an exterior surface of the strap 14.2-231. Additionally, and as described with respect to FIG. 14.2-2D, the operational component 14.2-237 can be electrically connected to at least one of the first connector 14.2-233 or the second connector 14.2-235.

FIG. 14.2-2C shows a side view of the other connector strap 14.2-230 of the wearable electronic device 14.2-200. Whereas the connector strap 14.2-231 of FIG. 14.2-2B included an HMD connector 14.2-233 and a retention strap connector 14.2-235, but may not have included a supplemental unit connector, the connector strap 14.2-230 of FIG. 14.2-2C includes an HMD connector 14.2-232, a retention band connector (not shown), and a supplemental unit connector 14.2-236. As with the connector strap 14.2-231, the strap 14.2-230 can include an operational component 14.2-238 that can be disposed between the HMD connector 14.2-232 and the supplemental unit connector 14.2-236, and at least partially within an internal volume defined by the housing 14.2-239 of the strap 14.2-230.

FIG. 14.2-2D shows a cross-sectional or partial cut-away view of the connector strap 14.2-230 shown in FIGS. 14.2-2A and 14.2-2C. In this view, a portion of the housing 14.2-239, as well as the operational component 14.2-238, are not shown in order to illustrate the internal volume of the strap 14.2-230. As can be seen, in some examples, the HMD connector 14.2-232 can be electrically connected to the supplemental unit connector 14.2-236. In this particular example, a transmission array or transmission component(s) 14.2-251, 14.2-253, such as wires or other conductive elements, can be disposed in the internal volume to electrically connect the HMD connector 14.2-232 and the supplemental unit connector 14.2-236, such as to provide data and/or power therebetween. In some examples, the transmission array can include multiple conductors, cables, wires, or other transmission lines 14.2-251, 14.2-253 for transmitting data and/or power between the HMD connector 14.2-232 and the supplemental unit connector 14.2-236. In some examples, the lines 14.2-251, 14.2-253 can be in communication to the connectors through connection points 14.2-250, as shown. Additionally, in some examples, the supplemental unit connector 14.2-236 can include a printed circuit board 14.2-256 that can be at least partially disposed in the internal volume. In some examples, the connector strap 14.2-230 can include a processor or a processing unit 14.2-257. The conductors 14.2-251, 14.2-253 of the transmission array can be coupled to one or more locations on this printed circuit board 14.2-256, and/or can be directly connected to the supplemental unit connector 14.2-236.

In some examples, the housing 14.2-239 of the strap 14.2-230 can include a relatively flexible material, such as polymeric material, fabric, and/or any desired flexible material or materials. In some examples, the strap 14.2-230 can further include a stiffening component or a stiffener 14.2-254 disposed at least partially in the internal volume defined by the housing 14.2-239. In some examples, the stiffener 14.2-254 can be positioned at any desired location or locations in the internal volume, and can extend along any portion of the length of the strap 14.2-230. In some examples, the stiffener 14.2-254 can be disposed adjacent to the internal components associated with one or both of the HMD connector 14.2-232, the supplemental unit connector 14.2-236, and/or the retention band connector (not shown).

In some examples, such as where the housing 14.2-239 of the strap 14.2-230 is relatively flexible, the stiffener 14.2-254 can serve to provide structural support to the strap 14.2-230 in one or more directions. For example, the stiffener 14.2-254 can be flexible along a first axis, and rigid along at least one axis that is perpendicular to the first axis. In some examples, the stiffener 14.2-254 can be flexible along a first axis and can be rigid along two axes that are perpendicular to the first axis and to each other. That is, the stiffener 14.2-254 can be flexible along a first bend direction, such as a direction extending into and out of the page of FIG. 14.2-2D, while being rigid in one or more other bend directions, such as one or more directions parallel to the plane of the page of FGS. 14.2-2D. In some examples, the stiffener 14.2-254 can include a polymer material, metallic material, and/or combinations thereof. In some examples, the stiffener 14.2-254 can have a higher stiffness than the material including the housing 14.2-239 in at least one bend direction or axis. In some examples, the stiffener 14.2-254 can include metal in the form of a metallic sheet. Further details regarding the connector straps of a modular wearable electronic device, including details regarding the operational components thereof are provided with respect to FIGS. 14.2-3 and 14.2-4.

FIG. 14.2-3 shows a side view of a component 14.2-330 that can be used as part of a module wearable electronic device as described herein. In some examples, the component 14.2-330 can be a connector strap 14.2-330 and can be substantially similar to, or can include some or all of the features of the other connector straps and/or electronic device described herein. The example shown in FIG. 14.2-3 can be substantially similar to the connector strap 14.2-230 shown in FIG. 14.2-2C, and can include an HMD connector 14.2-332, a supplemental unit connector 14.2-336, and a retention band connector (not shown) disposed on an opposite side of the supplemental unit connector 14.2-336.

In the example shown in FIG. 14.2-3, the operational component 14.2-338 of the strap 14.2-330 can include a data output component. That is, the operational component 14.2-338 can be configured to transmit data from the strap 14.2-330 and/or any of the components of a wearable device in communication with the strap, such as an HMD and/or supplemental unit, to another electronic device. In some examples, the output device 14.2-338 can output data at a relatively high bitrate. In some examples, the output component 14.2-338 can have a direct electrical connection to a secondary device through a conductor or cable 14.2-339 as shown. In some examples, however, the output component 14.2-338 can include one or more antennas to wireless transmit data to a secondary device as desired.

In some examples, a user can include the strap 14.2-330 including the output component 14.2-338 in a module electronic device in place of, for example the strap 14.2-230 shown in FIGS. 14.2-2A, 14.2-2C, and 14.2-2D in situations where high throughput transfer of data from the wearable device to a secondary device is desired. In other scenarios where this functionality may not be needed or desired, however, the strap 14.2-230 can be included in the wearable device instead.

FIG. 14.2-4 shows a side view of a component 14.2-430 that can be used as part of a module wearable electronic device, as described herein. In some examples, the component 14.2-430 can be a connector strap 14.2-430 and can be substantially similar to, or can include some or all of the features of the other connector straps and/or electronic device described herein. The example shown in FIG. 14.2-4 can be substantially similar to the connector strap 230 shown in FIG. 14.2-2C, and can include an HMD connector 14.2-432, a supplemental unit connector 14.2-436, and a retention band connector (not shown) disposed on an opposite side of the supplemental unit connector 14.2-436.

The strap 14.2-430 can also include an operational component 14.2-439 including a visual or display component. In the example shown in FIG. 14.2-4, the operational component 14.2-439 can take the form of one or more LEDs that can be selectively illuminated in order to visually display information. In some examples, the operational component 14.2-439 can include any other type of display or display technology, or combinations thereof. In some examples, the display 14.2-439 can be used to present visual information to persons other than the user when the wearable electronic device of which the strap 14.2-430 is part. In some examples, the display 14.2-439 can be configured to present visual information to a user when the wearable device is not being worn. For example, the display 14.2-439 can communicate a battery level of the device before a user puts the device on. Further, as shown, the strap 14.2-430 can include a second additional operational component 14.2-438 in addition to the display 14.2-439.

Any number or variety of components in any of the configurations described herein can be included in a wearable electronic device, such as the HMD devices and/or HMD systems described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIGS. 14.2-5A through 14.2-10C.

FIG. 14.2-5A shows a top view of a component 14.2-530 that can be part of, or can be used with, a wearable electronic device, as described herein. In some examples, the component 14.2-530 can be a connector strap 14.2-530 and can be substantially similar to, or can include some or all of the features of the other connector straps and/or electronic device described herein. As with other connector straps described herein, the connector strap 14.2-530 can include a first connector 14.2-532 that can be an HMD connector 14.2-532, a second connector 14.2-536 that can be a supplemental unit connector, and a third connector 14.2-534 that can be a retention band connector. As described herein, in some examples, the retention band connector 14.2-534 can include multiple connection portions. In the example shown in FIG. 14.2-5A, the retention band connector 14.2-534 can include a first connection portion and a second connection portion 14.2-534' spaced apart from the first connection portion on the same side of the connector strap 14.2-530.

The connector strap 14.2-530 can have a housing 14.2-539 that can at least partially define an internal volume and an offset surface that is proud of a major surface of the housing 14.2-539. That is, the housing can define a protrusion or protruding portion 14.2-538 and one or more operational components can be positioned in or at this protrusion 14.2-538. Additionally, in some examples, one or more connectors of the connector strap 14.2-530 can also be positioned at or in this protrusion 14.2-538. For example, the supplemental unit connector 14.2-536 can be positioned at least partially at an external surface of the housing 14.2-539 defined by the protrusion 14.2-538. In some examples, the external surface of the housing can include the outer surface of the housing. In some additional examples, the external surface can further include an outer surface of the housing that is oriented away from a user's head when worn by the user.

FIG. 14.2-5B shows a side view of the connector strap 14.2-530. In addition to defining an internal volume and external surface of the connector strap 14.2-530, the housing 14.2-539 of the connector strap 14.2-530 can define one or more openings or ports 14.2-533. In some examples, the housing 14.2-539 can define one or more audio ports 14.2-533 that are acoustically connected to an audio module or speaker and can allow an audio module or a speaker positioned in the internal volume defined by the housing 14.2-539 to communicate with the ambient environment. In some examples, the housing 14.2-539 can define two opposing major surfaces and the audio port 14.2-533 can be position at an edge or a minor surface joining the two opposing surfaces. Additionally, while one of the major surfaces, such as the major surface shown in FIG. 14.2-5B can be interrupted by a protrusion 14.2-538, at least one of the major surfaces (not shown) can extend an entire length of the connector strap 14.2-530 and/or an entire length of the internal volume of the strap 14.2-530.

FIG. 14.2-5C shows a cross-sectional view of the connector strap 14.2-530 in the position shown in FIG. 14.2-5B, but with a major surface of the housing 14.2-539 not shown in order to illustrate the positioning of components in the internal volume. In the present example, the strap 14.2-530 can include two or more operational components 14.2-557, 14.2-558, at least one or which can be positioned at the protrusion 14.2-538. In some examples, a first operational component 14.2-557 can include a first audio module disposed in the internal volume and can be configured to output a first range of audio frequencies, while a second operational component 14.2-558 can include a second audio module disposed in the internal volume and configured to output a second range of audio frequencies different than the first range. Additionally drivers of the first and/or second audio modules 14.2-557, 14.2-558 can be in communication with the audio port 14.2-533 in order to output sound therefrom. In some examples, one or more of the audio modules 14.2-557, 14.2-558 can have open-box or ported speaker construction or closed-box or sealed speaker construction. In some examples, one audio module 14.2-557 can function as a tweeter, while the second audio module 14.2-558 can function as a woofer.

As with other straps 14.2-530 described herein, the strap 14.2-530 can include a stiffener 14.2-552 that is flexible in a first direction, and rigid in at least one direction that is perpendicular to the first direction. One or more of the operational components 14.2-557, 14.2-558 and/or connectors 14.2-536 can be positioned on, or can be connected to a printed circuit board 14.2-556 positioned in the internal volume. The printed circuit board 14.2-556 can also include components or electronic elements, including memory and processors positioned thereon. In some examples, the strap 14.2-530 can also include a rigid support member 14.2-553 positioned between the printed circuit board 14.2-556 and the stiffener 14.2-552, the rigid support member 14.2-553 being more rigid than the stiffener in the first direction.

In this particular example, a transmission array or transmission component(s) 14.2-551 can be disposed in the internal volume to electrically connect the HMD connector 14.2-532 to the printed circuit board 14.2-556, the supplemental unit connector 14.2-536 and/or one or more operational components 14.2-557, 14.2-558. In some examples, the transmission component 14.2-551 can extend along a center-line of the housing 14.2-539. In some examples including multiple conductors or transmission components, a first conductor can be positioned or disposed adjacent to one internal surface of the housing of the strap 14.2-530, and a second conductor can be positioned or disposed adjacent to another different internal surface of the housing of the strap. In some examples, different conductors may be positioned on opposite sides of internal components, such as the printed circuit board 14.2-556, operational components 14.2-557, 14.2-558, stiffeners, and the like. In some examples, the components of the strap 14.2-530 can be maintained in their desired locations by internal fixtures and/or attachment features defined by, or attached to the housing 14.2-539. In some examples, such as where the housing 14.2-539 includes a relatively flexible material, such as a polymeric material, the housing 14.2-539 be at least partially overmolded around at least some of the components of the strap 14.2-530, including the printed circuit board 14.2-556, operational components 14.2-557, 14.2-558, and/or connectors 14.2-532, 14.2-536. Further details of connector straps for wearable electronic devices are described with respect to FIGS. 14.2-6A through 14.2-6C.

FIG. 14.2-6A shows a top view of a component 14.2-630 that can be part of, or can be used with a wearable electronic device, as described herein. In some examples, the component 14.2-630 can be a connector strap 14.2-630 and can be substantially similar to, or can include some or all of the features of the other connector straps and/or electronic device described herein. As with other connector straps described herein, the connector strap 14.2-630 can include a first connector 14.2-632 that can be an HMD connector 14.2-632, a second connector 14.2-636 that can be a supplemental unit connector, and a third connector 14.2-634 that can be a retention band connector. As described herein, in some examples, the retention band connector 14.2-634 can include multiple connection portions. The connector strap 14.2-630 can have a housing 14.2-639 that can at least partially define an internal volume and an offset surface that is proud of a major surface of the housing 14.2-639. That is, the housing can define a protrusion or protruding portion 14.2-638 and one or more operational components can be positioned in or at this protrusion 14.2-638. The protruding portion 14.2-638 can be a portion of the housing that is wider that another portion, in any direction.

FIG. 14.2-6B shows a side view of the connector strap 14.2-630. In addition to defining an internal volume and external surface of the connector strap 14.2-630, the housing 14.2-639 of the connector strap 14.2-630 can define one or more openings or ports 14.2-633. In some examples, the housing 14.2-639 can define one or more audio ports 14.2-633 that can allow an audio module or speaker positioned in the internal volume defined by the housing 14.2-639 to communicate with the ambient environment. Additionally, as shown, the connector strap 14.2-630 may not have a constant height or thickness along its entire length. In some examples, a portion of the housing can be enlarged relative to other portions of the strap 14.2-630, such as to provide room for operational components, and/or to position operational components nearer to their desired location relative to a user.

FIG. 14.2-6C shows a cross-sectional view of the connector strap 14.2-630 in the position shown in FIG. 14.2-6B, but with a major surface of the housing 14.2-639 not shown in order to illustrate the positioning of components in the internal volume. In the present example, the strap 14.2-630 can include two or more operational components 14.2-657, 14.2-658, at least one or which can be positioned at the protrusion 14.2-638. In some examples, a first operational component 14.2-657 can include a first audio module disposed in the internal volume and configured to output a first range of audio frequencies, while a second operational component 14.2-658 can include a second audio module disposed in the internal volume and configured to output a second range of audio frequencies different than the first range. Additionally drivers of the first and/or second audio modules 14.2-657, 14.2-658 can be in communication with the audio port 14.2-633 in order to output sound therefrom. In some examples, one or more of the audio modules 14.2-657, 14.2-658 can have open-box speaker construction or closed-box speaker construction. In some examples, one audio module 14.2-657 may function as a tweeter, while the second audio module 14.2-658 can function as a woofer. In some examples, the strap 14.2-630 can include one or more sensors, for example a sensor that can detect a location of a user's ear relative to the strap and can aid in directing sound from the audio port 14.2-633 to the user's ear.

As with other straps 14.2-630 described herein, the strap 14.2-630 can include a stiffener 14.2-652 that is flexible in a first direction and rigid in at least one direction that is perpendicular to the first direction. One or more of the operational components 14.2-657, 14.2-658 and/or connectors 14.2-636 can be positioned on, or connected to, a printed circuit board 14.2-656 positioned in the internal volume. The printed circuit board 14.2-656 can also include components, including memory and processors positioned thereon. In some examples, the strap 14.2-630 can also include a support member 14.2-653 positioned between the printed circuit board 14.2-656 and the stiffener 14.2-652, the support member 14.2-653 being more rigid than the stiffener in the first direction.

In this particular example, a transmission array or transmission component(s) 14.2-650, 14.2-651 can be disposed in the internal volume to electrically connect the HMD connector 14.2-632 to the printed circuit board 14.2-656, the supplemental unit connector 14.2-636 and/or one or more operational components 14.2-657, 14.2-658. In some examples, the transmission components 14.2-650, 14.2-651 can extend along a center-line "C" of the housing 14.2-639. In some examples, the components of the strap 14.2-630 can be maintained in their desired locations by internal fixtures and/or attachment features defined by, or attached to the housing 14.2-639. In some examples, such as where the housing 14.2-639 includes a relatively flexible material, such as a polymeric material, the housing 14.2-639 be at least partially overmolded around at least some of the components of the strap 14.2-630, including the printed circuit board 14.2-656, operational components 14.2-657, 14.2-658, and/or connectors 14.2-632, 14.2-636.

In some examples, the housing 14.2-639 can include a first portion, such as the portion containing the stiffener 14.2-652, and a second portion, such as the portion containing the first audio module 14.2-657 and the second audio module 14.2-658. In some examples, this second portion can have a greater height than the first portion, as shown. Additionally, because this second portion can also be where the protrusion 14.2-638 is located, the second portion can also have a thickness or width that is greater than a thickness or width of the first portion. Further details of connector straps for wearable electronic devices are described with respect to FIGS. 14.2-7A through 14.2-7C.

FIG. 14.2-7A shows a top view of a component 14.2-730 that can be part of, or used with a wearable electronic device, as described herein. In some examples, the component 14.2-730 can be a connector strap 14.2-730 and can be substantially similar to, or can include some or all of the features of the other connector straps and/or electronic device described herein. As with other connector straps described herein, the connector strap 14.2-730 can include a first connector 14.2-732 that can be an HMD connector 14.2-732, a second connector 14.2-736 that can be a supplemental unit connector, and a third connector 14.2-734 that can be a retention band connector. As described herein, in some examples, the retention band connector 14.2-734 can include multiple connection portions. The connector strap 14.2-730 can have a housing 14.2-739 that can at least partially define an internal volume and an offset surface that is proud of a major surface of the housing 14.2-739. That is, the housing can define a protrusion or protruding portion 14.2-738 and one or more operational components can be positioned in or at this protrusion 14.2-738.

FIG. 14.2-7B shows a side view of the strap 14.2-730. As can be seen in FIGS. 14.2-7A and 14.2-7B, in some examples, the protrusion 14.2-738 defined by the housing 14.2-739 of the strap 14.2-730 can be positioned at any desired location on the strap 14.2-730. Additionally, the protrusion 14.2-738 can be spaced apart from an audio port 14.2-733 defined by the housing 14.2-739. Further, as can be seen in FIG. 14.2-7C, this means that an operational component, such as an audio module 14.2-758 can be positioned in the internal volume of the strap 14.2-730 away from the audio port 14.2-733. It can still be desirable, however, for the audio module 14.2-758 and/or a driver thereof to be in communication with the audio port 14.2-733 (shown with dashed lines). In order to facilitate this communication, the strap 14.2-730 can include an acoustic guide 14.2-759 that can include one or more channels in communication with the audio module 14.2-758 and the audio port 14.2-733. In this way, the audio module 14.2-758 can be positioned away from the audio port 14.2-733, but can still direct sound to a user from the audio port 14.2-733. In some examples, the acoustic guide 14.2-759 can include any material desired, including metals or polymers. In some examples, the acoustic guide 14.2-759 can be flexible and can bend or flex with the strap 14.2-730 while still providing acoustic communication. In some examples, the acoustic guide 14.2-759 may not be a separate or discrete component and may be at least partially defined by the housing 14.2-739 itself.

The strap 14.2-730 can also include some or all of the other components and features of the other straps described herein. For example, while the audio module 14.2-758 can be positioned away from the audio port 14.2-733 and communicate with the audio port 14.2-733 through an acoustic guide 14.2-759, the strap 14.2-730 can include another audio module 14.2-757 that can be positioned near to the audio port 14.2-733 to communicate therewith. The strap can also include a printed circuit board that can be connected through various transmission components 14.2-751 to other connectors 14.2-732 and/or components 14.2-757, 14.2-758 of the strap 14.2-730. Further details of connector straps for wearable electronic devices are described with respect to FIGS. 14.2-8A through 14.2-8C.

FIG. 14.2-8A shows a top view of a component 14.2-830 that can be part of, or can be used with a wearable electronic device, as described herein. In some examples, the component 14.2-830 can be a connector strap 14.2-830 and can be substantially similar to, or can include some or all of the features of the other connector straps and/or electronic device described herein. As with other connector straps described herein, the connector strap 14.2-830 can include a first connector 14.2-832 that can be an HMD connector 14.2-832, a second connector 14.2-836 that can be a supplemental unit connector, and a third connector 14.2-834 that can be a retention band connector. As described herein, in some examples, the retention band connector 14.2-834 can include multiple connection portions. The connector strap 14.2-830 can have a housing 14.2-839 that can at least partially define an internal volume and an offset surface that is proud of a major surface of the housing 14.2-839. That is, the housing can define a protrusion or protruding portion 14.2-838 and one or more operational components can be positioned in or at this protrusion 14.2-838.

As seen in the side view of FIG. 14.2-8B, the strap 14.2-830 can have a similar configuration as other straps described herein, such as straps 14.2-530, 14.2-630, where the protrusion 14.2-838 is positioned at an end of the strap that includes the supplemental unit connector 14.2-836. In addition to the audio port 14.2-833, the housing 14.2-839 can further define a vent, an exit, or a back port 14.2-835 that can be positioned at an opposite side of the strap from the audio port 14.2-833. In some examples, the back port 14.2-835 can also be positioned at an opposite end of the strap 14.2-830 from the audio port 14.2-833. In some examples, it can be desirable to position the back port 14.2-835 at a location on the strap 14.2-830 that is as far away from the audio port as possible or feasible.

FIG. 14.2-8C shows a cross-sectional view of the strap 14.2-830, including first and second audio modules 14.2-857, 14.2-858, printed circuit board 14.2-856, and transmission component 14.2-851 including a conductor such as cables or wires. In the present example, the strap 14.2-830 also includes an acoustic guide 14.2-859 that can be in communication with the audio module 14.2-858 or a driver thereof. Whereas the acoustic guide 14.2-759 shown in FIG. 14.2-7C is configured to direct sound generated by the audio module 14.2-758 to the audio port 14.2-733, the acoustic guide 14.2-859 can be configured to direct the back wave generated by the driver of the audio module 14.2-858 to the back port, and thus, away from the user's ear. Accordingly, the audio module 14.2-858 can include an open-box or open-back speaker and the acoustic guide 14.2-859 can be in communication with the back or rear surface of the speaker's diaphragm so as to release backpressure and/or direct negative sound waves generated by the speaker away from the user's ear. This construction can thus allow for the audio modules 14.2-857, 14.2-858 to generate high quality audio in a relatively small package. Further details of connector straps for wearable electronic devices are described with respect to FIGS. 14.2-9A through 14.2-9C.

FIG. 14.2-9A shows a top view of a component 14.2-930 that can be part of, or used with a wearable electronic device, as described herein. In some examples, the component 14.2-930 can be a connector strap 14.2-930 and can be substantially similar to, or can include some or all of the features of the other connector straps and/or electronic device described herein. As with other connector straps described herein, the connector strap 14.2-930 can include a first connector 14.2-932 that can be an HMD connector 14.2-932, a second connector 14.2-936 that can be a supplemental unit connector, and a third connector 14.2-934 that can be a retention band connector. As described herein, in some examples, the retention band connector 14.2-934 can include multiple connection portions. The connector strap 14.2-930 can have a housing 14.2-939 that can at least partially define an internal volume and an offset surface that is proud of a major surface of the housing 14.2-939. That is, the housing can define a protrusion or protruding portion 14.2-938 and one or more operational components can be positioned in or at this protrusion 14.2-938.

FIG. 14.2-9B shows a side view of the strap 14.2-930. As can be seen in FIGS. 14.2-9A and 14.2-9B, in some examples, the protrusion 14.2-938 defined by the housing 14.2-939 of the strap 14.2-930 can be positioned at any desired location on the strap 14.2-930. Additionally, the protrusion 14.2-938 can be spaced apart from an audio port 14.2-933 defined by the housing 14.2-939. Further, as can be seen in FIG. 14.2-9C, this means that an operational component, such as an audio module 14.2-958 can be positioned in the internal volume of the strap 14.2-930 away from the audio port 14.2-933. In some examples, the strap 14.2-930 can include an acoustic guide 14.2-959 that can include one or more channels in communication with the audio module 14.2-958 and the audio port 14.2-933. In some examples, the acoustic guide 14.2-959 can define two or more, three or more, four or more, or even more channels. In some examples, the acoustic guide 14.2-959 can define three channels. In some examples, the acoustic guide 14.2-959 can also function as a stiffener for the strap 14.2-930. That is, the acoustic guide 14.2-959 can be flexible along a first bend direction, and rigid along a second, different bend direction. In some examples, the acoustic guide 14.2-959 can thus be considered a flexible acoustic guide, or a semi-rigid acoustic guide.

The strap 14.2-930 can also include some or all of the other components and features of the other straps described herein. For example, while the audio module 14.2-958 can be positioned away from the audio port 14.2-933 and communicate with the audio port 14.2-933 through an acoustic guide 14.2-959, the strap 14.2-930 can include another audio module 14.2-957 that can be positioned near to the audio port 14.2-933 to communicate therewith. The strap can also include a printed circuit board that can be connected through various transmission components 14.2-951 to other connectors 14.2-932 and/or components 14.2-957, 14.2-958 of the strap 14.2-930. Further details of connector straps for wearable electronic devices are described with respect to FIGS. 14.2-10A through 14.2-10C.

FIG. 14.2-10A shows a top view of a component 14.2-1030 that can be part of, or can be used with, a wearable electronic device, as described herein. In some examples, the component 14.2-1030 can be a connector strap 14.2-1030 and can be substantially similar to, or can include some or all of the features of the other connector straps and/or electronic device described herein. As with other connector straps described herein, the connector strap 14.2-1030 can include a first connector 14.2-1032 that can be an HMD connector 14.2-1032, a second connector 14.2-1036 that can be a supplemental unit connector, and a third connector 14.2-1034 that can be a retention band connector. As described herein, in some examples, the retention band connector 14.2-1034 can include multiple connection portions. The connector strap 14.2-1030 can have a housing 14.2-1039 that can at least partially define an internal volume and an offset surface that is proud of a major surface of the housing 14.2-1039. That is, the housing can define a protrusion or protruding portion 14.2-1038 and one or more operational components can be positioned in or at this protrusion 14.2-1038.

FIG. 14.2-10B shows a side view of the strap 14.2-1030. As can be seen in FIGS. 14.2-10A and 14.2-10B, in some examples, the protrusion 14.2-1038 defined by the housing 14.2-1039 of the strap 14.2-1030 can be positioned at any desired location on the strap 14.2-1030. Additionally, the protrusion 14.2-1038 can be spaced apart from an audio port 14.2-1033 defined by the housing 14.2-1039. Further, as can be seen in FIG. 14.2-10C, this means that an operational component, such as an audio module 14.2-1058 can be positioned in the internal volume of the strap 14.2-1030 away from the audio port 14.2-1033. In some examples, the strap 14.2-1030 can include an acoustic guide 14.2-1059 that can include one or more channels in communication with the audio module 14.2-1058 and the audio port 14.2-1033. In some examples, the acoustic guide 14.2-1059 can include multiple channels. In some examples, the multiple channels of the acoustic guide 14.2-1059 can have a same size and cross-sectional area, or different sizes and/or cross-sectional areas. In some examples, one or more of the channels defined by the acoustic guide 14.2-1059 can have a rectangular cross-sectional shape, a round or circular cross-sectional shape, or any cross-sectional shape or shapes as desired. In some examples, the number of channels and their cross-sectional area can allow for the acoustic guide 14.2-1059 to be relatively flexible in at least one direction, while being relatively resistance to compression or collapse along other directions.

The strap 14.2-1030 can also include some or all of the other components and features of the other straps described herein. For example, while the audio module 14.2-1058 can be positioned away from the audio port 14.2-1033 and communicate with the audio port 14.2-1033 through an acoustic guide 14.2-1059, the strap 14.2-1030 can include another audio module 14.2-1057 that can be positioned near to the audio port 14.2-1033 to communicate therewith. The strap can also include a printed circuit board that can be connected through various transmission components 14.2-1051 to other connectors 14.2-1032 and/or components 14.2-1057, 14.2-1058 of the strap 14.2-1030.

Any number or variety of components in any of the configurations described herein can be included in a wearable electronic device, such as the HMD devices and/or HMD systems described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIGS. 14.2-11 through 14.2-13.

FIG. 14.2-11 shows an exploded view of a wearable electronic device 14.2-1100 that can include modular components which can be selectively and removably or releasably attached or coupled to one another as described herein. In some examples, the device 14.2-1100 can be substantially similar to, or can include some or all of the features of the other wearable electronic devices described herein. As with the electronic device 14.2-200, the device 14.2-1100 can include an HMD 14.2-1110, a retention band 14.2-1120, and one or more connector straps 14.2-1130, 14.2-1131.

The connector straps 14.2-1130, 14.2-1131 can include a number of connectors, such as HMD connectors 14.2-1132, 14.2-1133 that can releasably couple to corresponding connectors on the HMD, such as connector 14.2-1112. While the straps 14.2-230, 14.2-231 of FIG. 14.2-2A included separate retention band connectors and supplemental unit connectors, the device 14.2-1100 can include a retention band 14.2-1120 that includes an integrated supplemental unit 14.2-1122. Accordingly, the straps 14.2-1130, 14.2-1131 can include a combined retention band and supplemental unit connector 14.2-1136, 14.2-1137 that can both mechanically couple the straps 14.2-1130, 14.2-1131 to the retention band 14.2-1120 and electrically communicate data and/or power with the supplemental unit 14.2-1122 of the retention band 14.2-1120. The retention band 14.2-1120 itself can include corresponding connectors 14.2-1126, 14.2-1127 that can be releasably coupled to the retention band connectors 14.2-1136, 14.2-1137.

Additionally, as noted above, the connector straps 14.2-1130, 14.2-1131 can include a stiffener 14.2-1152 disposed in the flexible housing, the stiffener 14.2-1152 can be flexible along a first bend direction, such as a direction extending into and out of the page of FIG. 14.2-11, represented as the "Z" direction. Additionally, the stiffener 14.2-1152 can be rigid in one or more other bend directions, such as one or more directions parallel to the plane of the page of FIG. 14.2-11, represented as the "X" and "Y" directions, which are each substantially perpendicular to the "Z" direction. Stiffness in the "X" and "Y" directions allow the connector straps 14.2-1130, 14.2-1131 to support both the HMD 14.2-1110 and the retention band 14.2-1120 during operation, counteracting the moment or rotational force caused by the HMD 14.2-1110 and the retention band 14.2-1120. In this manner, the connector straps 14.2-1130, 14.2-1131 provide sufficient structural rigidity to maintain the relative position of each component in the system during use. Simultaneously, the flexibility provided in the "Z" direction provides a snug and comfortable fit to the side of a user's head during use, and can continue and enhance the secured fit provided by the retention band 14.2-1120. In some examples, the stiffener 14.2-1152 can include a polymer material, a metallic material, and/or combinations thereof. In some examples, the stiffener 14.2-1152 can have a higher stiffness than the material forming a majority of the connector straps 14.2-1130, 14.2-1131 in at least one bend direction or axis. In some examples, the stiffener 14.2-1152 can include metal in the form of a metallic sheet.

According to one example, the shape and material of the connector straps 14.2-1130, 14.2-1131 provide the desired combination of flexibility in the "Z" direction and rigidity in the "X" and "Y" directions even without the stiffener 14.2-1152. According to this example, the approximately rectangular cross-sectional profile of the connector straps 14.2-1130, 14.2-1131 having a height that is approximately between 5 and 10, between 10 and 20, between 20 and 50, or between 50 and 100 times that of the width facilitates bending or low-force buckling of the connector strap in the "Z" direction, while resisting buckling in the "X" and "Y" directions. In other words, buckling the connector straps 14.2-1130, 14.2-1131 in the "X" and "Y" directions can require 10, 20, 30, 50, or more times the force that is needed to buckle the connector straps in the "Z" direction. Additional modifications, such as profile curves or directional stiffeners, can be added to the connector straps 14.2-1130, 14.2-1131 to further strengthen the connector straps in desired directions.

In some examples, the retention band 14.2-1120 can include other operational or functional components in addition, or in alternative, to the supplemental unit 14.2-1122. For example, the component 14.2-1122 can include a battery module that can be in electrical communication with the straps 14.2-1130, 14.2-1131. Additionally, the device 14.2-1100 may include a separate processing unit (not shown), such as the supplemental unit 14.2-140 shown in FIG. 14.2-1C that can be connected to the strap 14.2-1130, while the retention band 14.2-1120 includes a second additional processing unit 14.2-1122. Further details regarding various configurations of wearable electronic devices are discussed with respect to FIG. 14.2-12.

FIG. 14.2-12 shows an exploded view of a wearable electronic device 14.2-1200 that can include modular components which can be selectively and removably or releasably attached or coupled to one another, as described herein. In some examples, the device 14.2-1200 can be substantially similar to, or can include some or all of the features of the other wearable electronic devices described herein. As with the electronic device 14.2-100, the device 14.2-1200 can include an HMD 14.2-1210, a retention band 14.2-1220, and one or more connector straps 14.2-1230, 14.2-1231, and a supplemental unit 14.2-1240.

The connector straps 14.2-1230, 14.2-1231 can include a number of connectors, such as HMD connectors 14.2-1232, 14.2-1233, that can releasably couple to corresponding connectors on the HMD, such as connector 14.2-1212. The connector straps 14.2-1230, 14.2-1231 can also include retention band connectors 14.2-1234, 14.2-1235 that can releasably couple to corresponding connectors 14.2-1224, 14.2-1225 on the retention band 14.2-1220. The connector strap 14.2-1230 can include a supplemental unit connector 14.2-1236 that can be releasably coupled to the supplemental unit 14.2-1240 through a conductor or cable 14.2-1242. In some examples, the retention band 14.2-1220 can include a band 14.2-1222 designed to secure the device 14.2-1200 to a user, and a pocket or compartment 14.2-1226 that can be attached to the band 14.2-1222 and which can be configured to hold or retain the supplemental unit 14.2-1240. In this way, the supplemental unit 14.2-1240 can be carried entirely on the device 14.2-1200 without the need to attach the supplemental unit 14.2-1240 to the user at another location.

FIG. 14.2-13 shows an exploded view of a wearable electronic device 14.2-1300 that can include modular components which can be selectively and removably or releasably attached or coupled to one another as described herein. In some examples, the device 14.2-1300 can be substantially similar to, or can include some or all of the features of the other wearable electronic devices described herein. As with the electronic device 14.2-100, the device 14.2-1300 can include an HMD 14.2-1310, a retention band 14.2-1320, and one or more connector straps 14.2-1330, 14.2-1331.

The connector straps 14.2-1330, 14.2-1331 can include a number of connectors, such as HMD connectors 14.2-1332, 14.2-1333 that can releasably couple to corresponding connectors on the HMD, such as connector 14.2-1312. The connector straps 14.2-1330, 14.2-1331 can also include retention band connectors 14.2-1334, 14.2-1335 that can releasably couple to corresponding connectors 14.2-1324, 14.2-1325 on the retention band 14.2-1320. The connector strap 14.2-1330 can include a supplemental unit connector 14.2-1336 that can be releasably coupled to the supplemental unit 14.2-1340 through a conductor or cable 14.2-1342. Whereas some examples described herein can include two or more modular or separate connector straps, in some examples, the connector straps 14.2-1330, 14.2-1331 can be releasably or permanently joined to one another, such as by a third strap or a head strap 14.2-1339. In some examples, this head strap 14.2-1339 can extend over a user's head when the wearable electronic device 14.2-1300 is worn by a user. The head strap 14.2-1339 can thus provide a secured and comfortable fit to the user. Further, in examples where the strap 14.2-1339 is removably or releasably attached to the straps 14.2-1330, 14.2-1331, the user can opt whether or not to use the straps 14.2-1339 depending on the particular use scenario of the device 14.2-1300. In some examples, the strap 14.2-1339 can include any material as desired, including polymeric materials, fabric materials, and any of the materials described with respect to connector straps and/or retention bands. 14.3: Modular Strap for an Electronic Device As virtual reality (VR) and mixed reality (MR) become more ubiquitous, the demand for user friendly head-mounted displays with quality components increases. Traditionally, these VR/MR systems have been devices that include a wearable display component, often referred to as a head-mounted display (HMD) and a supplemental unit. The supplemental unit can be part of the HMD, or can be a separate component that is permanently or removably connected to the HMD through a cable, wires, or other conductors. The supplemental unit can provide power and/or added processing functionality to the system.

Devices of the present disclosure include one or more additional dongles for improved connectivity to such supplemental components. For example, an HMD system of the present disclosure includes a first dongle for attaching a power supply to a first removable strap (e.g., a modular band of the HMD system). In addition, the HMD system includes a second dongle for attaching an external computing device or display to a second removable strap (e.g., another modular band of the HMD system). With separate, designated dongles (e.g., one for power and the other for data transmission), the HMD system of the present disclosure can significantly improve throughput. Advantageously, this can facilitate developers or programmers to rapidly upload and download data from the HMD system, while separately powering the device.

In addition, the present disclosure relates to various thermal ergonomic improvements for a removable strap. Removable straps can include a variety of electrical components, including a battery, integrated circuit, and a speaker (to name a few). Such electrical components can generate large amounts of thermal energy, particularly for longer use durations and heavy computing applications. Thus, given the location of a removable strap (and its associated electrical components) being next to a user's head, managing thermal output is important.

To reduce or mitigate hotspots along the removable straps, the present disclosure includes electrical pods positioned along the removable straps. These electrical pods can include a thermal shell and other thermal elements that provide a combination of heat shielding and heat dissipation. In so doing, the removable straps can provide increased comfort to a user. In addition, the removable straps can reduce (or more efficiently spread) a thermal load.

These and other embodiments are discussed below with reference to FIGS. 14.3-1 through 14.3-8. However, those skilled in the art will readily appreciate that the detailed description given herein with respect to these figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 14.3-1 shows a top view of a wearable electronic device 14.3-100 being worn on the head 14.3-101 of a user. The wearable electronic device 14.3-100, as well as other wearable electronic devices disclosed herein, can also be referred to as HMD systems, electronic devices, or simply as devices. The device 14.3-100 can include a number of modular components. For example, the device 14.3-100 can include a head-mounted display (HMD) 14.3-102 including a housing 14.3-104 and a display 14.3-106 attached to the housing 14.3-104 for displaying images to a user.

The HMD can also be referred to as a display portion or display module having the display 14.3-106. The display portion can include the housing 14.3-104 and display 14.3-106 that at least partially constitutes the HMD. In one or more examples, including the example shown in FIG. 14.3-1 and other examples shown in other figures, the HMD 14.3-102 can also be referred to as an output component, output module. Such output components, modules, or portions can include one or more outputs other than visual outputs from a display. For example, an output module similar to the HMD 14.3-102 can include a speaker that outputs sound instead of or in addition to the display 14.3-106 shown in FIG. 14.3-1.

In addition, one example of the device 14.3-100 can include a modular securement assembly 14.3-108 that secures the HMD 14.3-102 to the user's head 14.3-101. The modular securement assembly 14.3-108 includes removable straps 14.3-110, 14.3-112. The modular securement assembly 14.3-108 further includes a retention band 14.3-114. The modular securement assembly 14.3-108 is therefore configured to removably secure the wearable electronic device 14.3-100, including the HMD 14.3-102, to the head 14.3-101 of the user when the removable straps 14.3-110, 14.3-112 and retention band 14.3-114 are connected as shown in FIG. 14.3-1.

In particular examples, the removable straps 14.3-110, 14.3-112 removably (e.g., detachably) connect to both of the HMD 14.3-102 and the retention band 14.3-114. For example, each of the removable straps 14.3-110, 14.3-112 can be removably connected to the HMD 14.3-102 (or the housing or the display portion thereof) and the retention band 14.3-114 at opposing ends of each removable strap 14.3-110, 14.3-112 as shown in FIG. 14.3-1. In such an example, the modular securement assembly 14.3-108 is modular in that each of the removable straps 14.3-110, 14.3-112, and the retention band 14.3-114 can be connected and detached, as may be desired. For instance, each of the removable straps 14.3-110, 14.3-112 can be removed from the modular securement assembly 14.3-108 and swapped out for one or more other modules, straps, or electronic components.

One or more other examples of the device 14.3-100 can include alternative configurations of the removable straps 14.3-110, 14.3-112 shown in FIG. 14.3-1. For example, the device 14.3-100 can be positioned elsewhere along the modular securement assembly 14.3-108 (differently than what is shown in FIG. 14.3-1). In addition, one or more examples of wearable electronic devices described herein can include one or more intermediate members, flexible straps, or other optional supplemental components and electronic modules such as external power supplies, memory components, and/or processors.

In the example shown in FIG. 14.3-1, when the device 14.3-100 is worn on the head of the user, the removable strap 14.3-110 is positioned on the left side of the user's head and the removable strap 14.3-112 is positioned on the right side of the user's head. The retention band 14.3-114 can span between the removable straps 14.3-110, 14.3-112 to wrap around the back of the user's head 14.3-101, as shown.

In some examples, and as shown, the device 14.3-100 can be worn on the user's head 14.3-101 such that the HMD 14.3-102 is worn on the user's face and disposed over one or both of their eyes. The HMD 14.3-102 can be removably and/or releasably connected to one or more of the removable straps 14.3-110, 14.3-112 as mentioned above. In some examples, the removable straps 14.3-110, 14.3-112 can be positioned against the side of a user's head 14.3-101 and in contact therewith. In some examples, the removable straps 14.3-110, 14.3-112 can be positioned above the user's ear or ears. In some examples, the removable straps 14.3-110, 14.3-112 can be positioned adjacent to the user's ear or ears. The removable straps 14.3-110, 14.3-112 can be removably connected to the retention band 14.3-114, which can extend around the user's head 14.3-101 and removably connect to the other of the removable straps 14.3-110, 14.3-112. In this way, the HMD 14.3-102, removable straps 14.3-110, 14.3-112, and retention band 14.3-114 can form a loop that can retain the wearable electronic device 14.3-100 on the user's head 14.3-101.

As shown in FIG. 14.3-1, the removable straps 14.3-110, 14.3-112 can connect to the HMD 14.3-102, both mechanically and electrically. In particular examples, the removable straps 14.3-110, 14.3-112 can receive and/or relay at least one of data or power via such connections. In these or other examples, the removable straps 14.3-110, 14.3-112 can connect to the HMD 14.3-102 at an HMD connection location that can include an electrical input or electrical connector that is attached to the housing 14.3-104 and electrically connected to the display 14.3-106. This location can be identified as a temple area that can be defined as an area near a user's temple adjacent to the user's eye, and can span from in front of the user's eye to approximately 1-1.5 inches past the outer corner of a user's eye, along the side of the user's head 14.3-101.

Similarly, the removable straps 14.3-110, 14.3-112 can connect to the retention band 14.3-114 at a retention band connection location identified as an area that can span to include the area above the user's ear or within 0.5 inches of the outer edge of the ear on either side. In this manner, the removable straps 14.3-110, 14.3-112 are able to provide structural support between the HMD 14.3-102 and the user's ear, while securely connecting the retention band 14.3-114 and transferring the retention forces of the retention band 14.3-114 through the device 14.3-100. It should be understood, however, that this configuration is just one example of how the components of a modular wearable electronic device 14.3-100 can be arranged, and that in some, a different number of removable straps and/or retention bands can be included.

While a user wearing an HMD 14.3-102 on his or her head 14.3-101 is shown as one example of a wearable electronic device, the modular components, features, and advantages of various examples of electronic devices disclosed herein can also apply to other wearable electronic devices having securement mechanisms, including but not limited to wearable smart watches, fitness trackers, smart glasses, medical monitor devices, and so forth. For example, the housing 14.3-104 and display 14.3-106 of HMD 14.3-102 shown in FIG. 14.3-1 can also be configured as a housing and display for a smart watch module secured to the user's arm or wrist via a modular securement mechanism or assembly similar to the securement assembly 14.3-108 shown in FIG. 14.3-1. Although referred to as a wearable electronic device 14.3-100, it should be understood that the device 14.3-100 can include multiple modular components or devices and can be interchangeably referred to as a wearable electronic device, wearable electronic device system, and/or wearable electronic system. Additionally, although the particular component 14.3-102 can be referred to as an HMD, it should be understood that the terms HMD, HMD device, and/or HMD system can be used to refer to the wearable device 14.3-100 as a whole.

In particular examples, the device 14.3-100 (or HMD system) includes one or more dongles 14.3-116, 14.3-118 that are connectable to external components or devices, as will now be discussed. As used herein, the term "dongle" can refer to a piece of electrical hardware such as a connection, adapter, or coupling between an external device/component and one or more components of the device 14.3-100 to provide additional functionality, or enable a pass-through to another device that adds functionality. A dongle can include electrical connections for data and/or power transmission through the dongle. In particular examples, a dongle can be unidirectional or bidirectional in terms of data and/or a power transmission.

As shown in FIG. 14.3-1, the dongle 14.3-116 connects the removable strap 14.3-110 to a power supply 14.3-120. As used herein, the term "power supply" refers to any power source that supplies power to one or more components of the device 14.3-100 (e.g., to charge a battery or power a processor such as a microcontroller within the removable strap 14.3-110). For example, a power supply can include fuel cells, battery cells, generators, alternators, solar power converters, motion-based converters (e.g., that convert vibrations or oscillations into power), etc. In particular implementations, a power supply can convert alternating current to direct current (or vice-versa) for charging or recharging components of the device 14.3-100. Some particular examples of a power supply can include a switched mode power supply, an uninterruptible power supply, an alternating current power supply, a direct current power supply, a regulated power supply, a programmable power supply, a computer power supply, and a linear power supply.

Additionally shown in FIG. 14.3-1, the dongle 14.3-118 connects the removable strap 14.3-112 to an external device or display (DoD) 14.3-122. An external device can include a smartphone, a tablet, a smart television, a desktop computer, a laptop computer, a server/network device, a virtual reality device, an augmented reality device, a smart watch, a sound/speaker device, a camera device, or other computing device. Further, an external display can include a monitor, device screen (e.g., a display screen for a laptop, television, phone, tablet, etc.), projector, or other suitable visual medium.

In at least some examples, the external DoD 14.3-122 includes a developer computer (e.g., for receiving and/or transmitting data from one or more components of the device 14.3-100). In particular examples, the external DoD 14.3-122 uploads computer-executable instructions to one or more components of the device 14.3-100 (e.g., the removable strap 14.3-112) through the dongle 14.3-118. Additionally or alternatively, the external DoD 14.3-122 can also provide data to and/or receive data from certain component (s) of the device 14.3-100 (e.g., the removable strap 14.3-110) through other dongle configurations, such as through the dongle 14.3-116 or a split-dongle configuration (described below in relation to FIG. 14.3-6).

In some examples, the external DoD 14.3-122 receives performance data (e.g., thermal data, power data, data throughput data, etc.). In certain implementations, the external DoD 14.3-122 provides power to one or more components of the device 14.3-100. For example, the external DoD 14.3-122 can power or charge components of the removable strap 14.3-112 by providing power through the dongle 14.3-118. In other examples, the external DoD 14.3-122 provides no power, in which case the power supply 14.3-120 can provide power to components of both the removable strap 14.3-110 and the removable strap 14.3-112. For instance, the power supply 14.3-120 can relay power to the removable strap 14.3-112 via electrical connections between the power supply 14.3-120, the removable strap 14.3-110, the HMD 14.3-102, and the removable strap 14.3-112. Alternatively, the power supply 14.3-120 can relay power to the removable strap 14.3-112 via alternative dongle configurations (as described below in relation to FIG. 14.3-6).

Additionally or alternatively, the external DoD 14.3-122 includes a display that outputs visual information. For example, the external DoD 14.3-122 includes a monitor that outputs the same visual content that is shown at the display 14.3-106. Thus, advantageously, the external DoD 14.3-122 can provide visual feedback (e.g., to developers or programmers) without needing to wear the device 14.3-100. Similarly, the external DoD 14.3-122 can provide visual feedback (e.g., on a developer computer screen) while a user is simultaneously wearing the device 14.3-100.

In one or more examples of the present disclosure, the dongles 14.3-116, 14.3-118 can include a variety of bandwidth capacities. In certain examples, the dongle 14.3-116 includes a first bandwidth, and the dongle 14.3-118 includes a second bandwidth greater than the first bandwidth. For example, the dongle 14.3-118 can provide (relative to the dongle 14.3-116) increased throughput of at least one of data or power. In this manner, the dongle 14.3-118 can facilitate larger and/or faster data uploads and downloads (for developer work or testing on the device 14.3-100).

In some examples, the dongles 14.3-116, 14.3-118 can also include variable bandwidths that can be throttled (e.g., reduced) or increased, as may be desired. For example, the dongles 14.3-116, 14.3-118 can include adjusted bandwidths based on one or more performance metrics (e.g., throughput speeds, visual content quality/resolution, thermal output, etc.). Indeed, as will be discussed more below in relation to FIGS. 14.3-4 and 14.3-5, an electronics pod on one or both of the removable straps 14.3-110, 14.3-112 can generate a thermal output that is spread out or dissipated into the ambient environment (e.g., to reduce heat transfer to a user). To help lessen the thermal output of the electronics pod (and/or an amount of thermal output to dissipate), one or more components of the device 14.3-100 can vary (e.g., decrease) the bandwidth through the dongles 14.3-116, 14.3-118. As used herein, the term "bandwidth" refers to a rate of power transfer (e.g., power bandwidth) or a rate of data transfer (e.g., data bandwidth) through electrical wiring and connections, or else wirelessly. In some cases, the term bandwidth can include a maximum rate of transfer across a given path.

In these or other examples, at least one of data bandwidth or power bandwidth through the dongles 14.3-116, 14.3-118 can be reduced when the thermal output achieves a threshold thermal output (e.g., a predetermined temperature reading). For instance, a micro controller (discussed below) can throttle bandwidth through at least one of the dongles 14.3-116, 14.3-118 in response to a temperature sensor in the removable straps 14.3-110, 14.3-112 indicating a temperature in excess of a certain temperature, such as one hundred degrees Fahrenheit.

Any of the features, components, parts, including the arrangements and configurations thereof shown in FIG. 14.3-1 can be included, either alone or in any combination, in any of the other examples of devices, features, components, and parts shown in the other figures. Likewise, any of the features, components, parts, including the arrangements and configurations thereof shown in the other figures can be included, either alone or in any combination, in the example of the devices, features, components, and parts shown in FIG. 14.3-1.

FIG. 14.3-2 shows a perspective view of an example of a wearable electronic device 14.3-200 that includes a display portion 14.3-202 in the form of an HMD with a housing 14.3-204. The display portion 14.3-202 can be secured to the head of a user via a modular securement assembly 14.3-208 that can include a first removable strap 14.3-210, a second removable strap 14.3-212, and a retention band 14.3-214. The first removable strap 14.3-210 can be removably connected to the display portion 14.3-202, or the housing 14.3-204 thereof, at a first end 14.3-216 of the first removable strap 14.3-210. A second end 14.3-218 of the first removable strap 14.3-210 can be removably connected to a first end 14.3-220 of the retention band 14.3-214. Likewise, the second removable strap 14.3-212 can be removably connected to the display portion 14.3-202, or the housing 14.3-204 thereof, at a first end 14.3-222 of the second removable strap 14.3-212. A second end 14.3-224 of the second removable strap 14.3-212 can be removably connected to a second end 14.3-226 of the retention band 14.3-214.

FIG. 14.3-3 shows an exploded perspective view of an example of a wearable electronic device 14.3-300, similar to the device 14.3-200 shown in FIG. 14.3-2. The device 14.3-300 of FIG. 14.3-3 includes a display portion 14.3-302 in the form of an HMD with a housing 14.3-304. The display portion 14.3-302 can be secured to the head of a user via a modular securement assembly 14.3-308 that can include a first removable strap 14.3-310, a second removable strap 14.3-312, and a retention band 14.3-314. The first removable strap 14.3-310 can be removably connected to the display portion 14.3-302, or the housing 14.3-304 thereof, at a first end 14.3-316 of the first removable strap 14.3-310. A second end 14.3-318 of the first removable strap 14.3-310 can be removably connected to a first end 14.3-320 of the retention band 14.3-314. Likewise, the second removable strap 14.3-312 can be removably connected to the display portion 14.3-302, or the housing 14.3-304 thereof, at a first end 14.3-322 of the second removable strap 14.3-312. A second end 14.3-324 of the second removable strap 14.3-312 can be removably connected to a second end 14.3-326 of the retention band 14.3-314.

The example of the device 14.3-300 in FIG. 14.3-3 is shown in an exploded view to illustrate the modularity of the securement assembly 14.3-308, where each of the first and second removable straps 14.3-310, 14.3-312 can be individually removed or replaced and removably connected with the retention band 14.3-314 and display portion 14.3-302 or other display component or other output component such as a speaker component or module.

Any of the features, components, parts, including the arrangements and configurations thereof shown in FIGS. 14.3-2 and 14.3-3 can be included, either alone or in any combination, in any of the other examples of devices, features, components, and parts shown in the other figures. Likewise, any of the features, components, parts, including the arrangements and configurations thereof shown in the other figures can be included, either alone or in any combination, in the example of the devices, features, components, and parts shown in FIGS. 14.3-2 and 14.3-3. For example, at least one of the dongles 14.3-116, 14.3-118 shown in FIG. 14.3-1 above can be correspondingly implemented with the removable straps 14.3-210, 14.3-212 and/or the removable straps 14.3-310, 14.3-312 of FIGS. 14.3-2 and 14.3-3.

FIG. 14.3-4 illustrates a side profile view of an example removable strap of an HMD system in accordance with one or more examples of the present disclosure. In particular, FIG. 14.3-4 illustrates a removable strap 14.3-412 that includes an electronics pod 14.3-400, a thermal spreader 14.3-402, and a thermal spreader 14.3-404. Although a single removable strap is shown, it will be appreciated that both removable straps of an HMD system of the present disclosure can include the same or similar structure shown and described in relation to FIG. 14.3-4.

As used herein, the term "electronics pod" refers to a subassembly, an enclosure, or a shell dedicated for housing certain electronics. In certain implementations, electrical components of the electronics pod 14.3-400 are communicatively coupled to the HMD 14.3-102 (e.g., via wire(s) 14.3-534 shown in FIG. 14.3-5). Additionally or alternatively, the electronics pod 14.3-400 can be coupled to one or more dongles (e.g., the dongles 14.3-116, 14.3-118 discussed above).

Furthermore, the electronics pod 14.3-400 can generate thermal energy or heat as a result of operation. In some examples, it is desirable to dissipate this thermal energy or heat away from a user (e.g., towards an ambient environment and away from a user's head). In some examples, it is also desirable to spread this thermal energy or heat away from the electronics pod 14.3-400 (e.g., by utilizing the thermal spreaders 14.3-402, 14.3-404). In particular examples, the thermal spreader 14.3-404 dissipates thermal energy from inside the electronics pod 14.3-400. Optionally, the thermal spreader 14.3-402 also dissipates thermal energy from inside electronics pod 14.3-400.

As will be shown below, a thermal spreaders 14.3-402, 14.3-404 are in thermal communication with the electronics pod 14.3-400. For example, the thermal spreaders 14.3-402, 14.3-404 contact conductive portions of the electronics pod 14.3-400. In particular examples, the thermal spreaders 14.3-402, 14.3-404 are positioned beyond the electronics pod 14.3-400. In these or other examples, the term "beyond" refers to an exterior or outside positioning relative to a boundary/perimeter. For instance, the thermal spreaders 14.3-402, 14.3-404 are at least partially positioned beyond the electronics pod 14.3-400 (e.g., outside of the exterior shell of the electronics pod 14.3-400).

As used herein, the term "thermal spreader" refers to a material that transfers or distributes heat from a hotter source to a colder source. In some examples, a thermal spreader is a thermally conductive element that disperses or spreads out thermal energy from the electronics pod 14.3-400. To illustrate, a thermal spreader can include conductive wires, foil, strips, sheets, layers, contacts, etc. Thermal spreaders can also include a variety of materials. For example, thermal spreaders can include copper, graphite, diamond, silver, gold, silken carbide, aluminum, tungsten, zinc, carbon fiber (e.g., pitched carbon fiber), etc. In the example of pitched carbon fiber, it will be appreciated that the fibers can be oriented in one or more predetermined directions for directional heat transfer.

FIG. 14.3-5 illustrates a top cross-sectional profile view of an example electronics pod in accordance with one or more examples of the present disclosure. As shown, the electronics pod 14.3-400 includes a thermal shell 14.3-500 and a cover 14.3-502. Together, the thermal shell 14.3-500 and the cover 14.3-502 define an internal volume 14.3-504. Multiple electrical components can be housed within the internal volume 14.3-504. These electrical components can also generate thermal energy during operation.

In addition, the thermal shell 14.3-500 and the cover 14.3-502 can form an at least partially enclosed bowl or U-shaped cross-section. In particular, the example thermal shell 14.3-500 includes a plateaued surface. In some examples the plateaued surface can be oriented towards a user's head. In this manner, audio can be transmitted from the electronics pod 14.3-400 in a directional fashion towards a user's ear. In alternative examples, the plateaued surface of the electronics pod 14.3-400 can contact a user skin (e.g., for vibrational sound via bone conduction).

In certain examples, the cover 14.3-502 includes one or more of a variety of materials. In some examples, the cover 14.3-502 includes at least one of a foam portion or an aluminum portion. In particular examples, the cover 14.3-502 includes a stainless steel portion. Further in some examples, the cover 14.3-502 forms a complete enclosure over the internal volume 14.3-504. In other examples, the cover 14.3-502 forms a partial enclosure over the internal volume 14.3-504.

In these or other examples, a bottom surface of the cover 14.3-502 can attach to a removable strap. Additionally or alternatively, the cover 14.3-502 can be integrated into a removable strap itself. Further, in some examples, the thermal shell 14.3-500 includes a variety of layers of material. In some examples, the thermal shell 14.3-500 includes a clad (e.g., an overmolded clad). The clad can include a first metal layer 14.3-508, a thermal interface material 14.3-510, and a second metal layer 14.3-512.

The metal layers 14.3-508, 14.3-512 can include one or more of a variety of metal materials. In some examples, the metal layers 14.3-508, 14.3-512 include stainless steel. In other examples, the metal layers 14.3-508, 14.3-512 include chrome, titanium, etc. It will be appreciated, however, that the metal layers 14.3-508, 14.3-512 need not be metal. For instance, the layers 14.3-508, 14.3-512 can be a variety of insulative materials, such as foam, plastic, rubber, ceramic, etc. It will also be appreciated that the layers 14.3-508, 14.3-512 can be different materials, as may be desired.

In some examples, the thermal interface material 14.3-510 can include a variety of thermally conductive materials. As used herein, the term "thermal interface material" refers to a material inserted between components or surfaces to enhance a thermal coupling therebetween and/or provide a thermal pathway. Examples of a thermal interface material include a thermal epoxy, thermal paste, thermal adhesive, thermal gap filler, thermally conductive pad, thermal tape, phase-change materials, or thermally conductive coatings (e.g., metallic coatings, diamond coatings, etc.). A thermal interface material can thus have high thermal conductivity. In specific examples, the thermal interface material 14.3-510 includes one or more copper layers. In one or more examples, the thermal interface material 14.3-510 can move, mold, or conform to the shape of the electronics pod 14.3-400. Moreover, as will be discussed below, the thermal interface material 14.3-510 can transfer or dissipate thermal energy out of the internal volume 14.3-504.

An overmold 14.3-506 can be positioned over the thermal shell 14.3-500. The overmold 14.3-506 can include a variety of materials. To illustrate, the overmold 14.3-506 can include softer materials, textured materials, fabric materials, etc. In particular examples, the overmold 14.3-506 includes an elastomer material. For instance, the overmold 14.3-506 includes a fluorocarbon rubber (e.g., Viton® rubber). In these or other examples, the overmold 14.3-506 can conform to a shape of the thermal shell 14.3-500. Additionally or alternatively, the overmold 14.3-506 can provide rigidity or support to the thermal shell 14.3-500.

As mentioned, the electronics pod 400 can house a variety of electrical components. Shown in FIG. 14.3-5, the electrical components can include a printed circuit board (PCB) 14.3-514, a battery 14.3-516, a processor such as a microcontroller 14.3-518, a system-on-chip (SoC) 14.3-520, and a speaker 14.3-522.

The terms "PCB" or "printed circuit board" refer to a logic assembly that includes electronic components. The PCB 14.3-514 includes electrical connections and circuitry for mounting various components, including the SoC 14.3-520. The PCB 14.3-514 can also relay power to mounted electrical components from a power supply (e.g., a battery, not separately illustrated). In certain examples, the PCB 14.3-514 is a main logic board. The PCB 14.3-514 can be a rigid board (e.g., composed of glass-epoxy compounds). In some examples, the PCB 14.3-514 is a multi-layer PCB (e.g., a laminated sandwich structure of conductive and insulating layers). In some examples, the PCB 14.3-514 is flexible (e.g., with flexible circuitry made with polyimide). In certain examples, the PCB 14.3-514 includes stiffeners added via lamination or pressure sensitive adhesive.

The battery 14.3-516 can include a myriad of different types of batteries or power sources. Indeed, the battery 14.3-516 can include one or more electrochemical cells with external connections for powering electrical devices or electrical components. For example, in some implementations, the battery 14.3-516 includes a lithium ion battery, alkaline battery, etc. In a specific example, the battery 14.3-516 includes a rechargeable battery. In other words, the battery 14.3-516 can be dispensable or rechargeable, as may be desired.

The microcontroller 14.3-518 can direct operation of one or more other components (e.g., within the electronics pod 14.3-400 the display 14.3-106, etc.). As used herein, the term "microcontroller" refers to a device capable of generating an electrical (or digital) signal responsive to sensor data from a sensor. In one or more embodiments, a microcontroller includes any of a variety of processors (e.g., a system-on-chip, integrated circuit, driver, application processor, crossover processor, etc.). In some embodiments, a microcontroller further includes one or more memory devices (e.g., individual nonvolatile memory, processor-embedded nonvolatile memory, random access memory, memory integrated circuits, DRAM chips, stacked memory modules, storage devices, memory partitions, etc.). In particular embodiments, a microcontroller further includes one or more of input/output ports, counters, timers, etc. It will be appreciated that such a microcontroller can be mounted on a printed circuit board (e.g., a rigid circuit board or a flexible printed circuit).

The SoC 14.3-520 can include an integrated circuit that integrates a combination of electrical components for operation of the HMD system. The terms "SoC," and "system-on-chip" refer to an electronic chip that generates thermal energy during operation. One or more of the SoC 14.3-520, the microcontroller 14.3-518, or the battery 14.3-516 can be a "heat source," which term generally refers to component(s) that can generate thermal energy. In some examples, the SoC 14.3-520 can include a microchip to generate (e.g., drive) visualizations presented at the display 14.3-106 (shown in FIG. 14.3-1). It will be appreciated that the thermal energy or heat generated by the SoC 14.3-520 can become greater over a duration of use. Similarly, the thermal energy or heat generated by the SoC 14.3-520 can become greater when executing more data-intensive operations (e.g., for more complex or high fidelity visualizations).

The speaker 14.3-522 can include one or more audio-generating components. Example components of the speaker 14.3-522 include a transducer, magnet, coil, diaphragm/driver, etc.

Myriad other components in the electronics pod 14.3-400 can be included (albeit not expressly shown in FIG. 14.3-5). For example, the electronics pod 14.3-400 can include a heat sink, microphone, antenna, one or more sensors (e.g., temperature sensors, pressure sensor, accelerometer, magnetometer, etc.), or other suitable electronic elements.

In one or more examples, components of the electronics pod 14.3-400 can be electrically coupled to a power supply positioned outside of the electronics pod 14.3-400. For example, wire(s) 14.3-534 can extend through a wire opening 14.3-536 defined by the cover 14.3-502. The wire(s) 14.3-534 can connect to the PCB 14.3-514 on one end, and the wire(s) 14.3-534 can connect to a power supply (not shown) on the other end. In this manner, the wire(s) 14.3-534 can provide power to each component electrically coupled to the PCB 14.3-514.

Components of the electronics pod 14.3-400 can also be thermally coupled to at least one of the ambient environment outside the electronics pod 14.3-400 or various thermal elements. To illustrate, the electronics pod 14.3-400 comprises a thermal conduit. As used herein, the term "thermal conduit" refers to a thermal path for heat flow. A thermal conduit may be conceptualized as linear or direct (e.g., along wire paths). However, a thermal conduit is not limited to such a flow path. Indeed, thermal paths can be linear or curved (e.g., non-linear), as a function of thermal properties for a given medium (whether solid, liquid, or gaseous). Further, thermal conduits are not limited to two-dimensional space. It will be appreciated that thermal conduits of the present disclosure include three-dimensional thermal paths through a given volume. In at least some examples, however, a thermal conduit of the present disclosure includes at least one of a thermal connector 14.3-524 or a thermal connector 14.3-526, both of which can be composed of one or more wires (e.g., copper wires) for conductive heat transfer.

In some examples, the thermal conduit includes a thermal connector 14.3-524. The thermal connector 14.3-524 is positioned inside the internal volume 14.3-504 and connects the PCB 14.3-514 and each associated component to the thermal interface material 14.3-510 at a connection point 14.3-528. Alternatively, the thermal connector 14.3-524 connects a specific component of the electronics pod 14.3-400 (e.g., the SoC 14.3-520) to the thermal interface material 14.3-510.

Thermal energy can be conductively transferred from components of the electronics pod 14.3-400 through the thermal connector 14.3-524. In turn, the thermal energy can be spread or dissipated along the thermal interface material 14.3-510. In at least some examples, a thermal conduit includes a thermal connector 14.3-526. The thermal connector 14.3-526 is attached to the thermal interface material 14.3-510 at the connection point 14.3-528. The thermal connector 14.3-526 then extends between clad layers of the thermal shell 14.3-500 (or over the thermal shell 14.3-500 underneath the overmold 14.3-506 as shown). The thermal connector 14.3-526 further extends to a connection 14.3-538 beyond the electronics pod 14.3-400, where the thermal connector 14.3-526 and the thermal interface material 14.3-510 thermally couple to the thermal spreader 14.3-404. By coupling the thermal connector 14.3-526 and the thermal interface material 14.3-510 to the thermal spreader 14.3-404, thermal energy from the electronics pod 14.3-400 can be even further dissipated or spread along the removable strap. In specific examples, the thermal spreader 14.3-404 directs this thermal energy towards a second end 14.3-424 that opposes a first end 14.3-422 of the removable strap 14.3-412. In doing so, the thermal energy is directed away from a user's temple.

However, as indicated via dashed lines, the removable strap 14.3-412 can include the thermal spreader 14.3-402 and associated heat-dissipation elements. The thermal spreader 14.3-402, like the thermal spreader 14.3-404, can connect to the thermal interface material 14.3-510 and a thermal connector, in a similar manner as just discussed above. In this way, thermal energy from the electronics pod 14.3-400 can be directed along the thermal spreader 14.3-402 towards the first end 14.3-422 of the removable strap 14.3-412, as may be desired (e.g., to decrease a thermal load through the thermal connector 14.3-524, the thermal connector 14.3-526, and/or the thermal spreader 14.3-404).

To accommodate these and/or other thermal couplings of the present disclosure, the thermal shell 14.3-500 includes certain etched portions that expose segments of the thermal interface material 14.3-510. Indeed, the thermal shell 14.3-500 includes an etched opening 14.3-530 and an etched opening 14.3-532. The etched openings 14.3-530, 14.3-532 can be formed in a variety of ways. In some examples, chemical etching may be used to form the etched openings 14.3-530, 14.3-532. In other examples, laser etching may be used to form the etched openings 14.3-530, 14.3-532. In such examples, the etched opening 14.3-530 is defined by a removed portion of the metal layer 14.3-512. Similarly, the etched opening 14.3-532 is defined by a removed portion of the metal layer 14.3-508. Through the etched openings 14.3-530, 14.3-532, the thermal interface material 14.3-510 is exposed for one or more conductive connections (e.g., for conductive heat transfer).

Additionally or alternatively to the thermal connector 14.3-524, heat can be transferred from electrical components of the electronics pod 14.3-400 to the thermal interface material 14.3-510 via forced convection or non-force convection. For example, thermal energy can convectively move through the etched opening 14.3-530 and impinge upon the thermal interface material 14.3-510. As used herein, the terms "conduction" or "natural conduction" refer to the heat transfer via conductively connected components. By contrast, the term "non-force convection" refers to free or natural convection, where air motion is caused by natural, buoyancy forces that result from the density variations due to variations of thermal temperature in the air. Non-forced convection differs from forced convection, where a fluid (e.g., air) is forced to flow by an internal source such as fans, by stirring, or pumps to create an artificially induced convection current.

FIG. 14.3-6 shows a top view of a wearable electronic device 14.3-600 being worn on the head 14.3-101 of a user. The wearable electronic device 14.3-600 is the same as or similar to the wearable electronic device 100 discussed above in relation to FIG. 14.3-1. Differently however, the wearable electronic device 14.3-600 includes a dongle 14.3-618. As shown, the dongle 14.3-618 is a split dongle. In particular, the dongle 14.3-618 includes a first portion 14.3-619 connecting the removable strap 14.3-112 and the external DoD 14.3-122. In addition, the dongle 14.3-618 includes a second portion 14.3-621 connecting the removable strap 14.3-112 to at least one of the power supply 14.3-120 or the removable strap 14.3-110.

Advantageously, the dongle 14.3-618 can provide a variety of use-case applications. For instance, the power supply 14.3-120 can additionally provide power to the removable strap 14.3-112 via the second portion 14.3-621. In another example, the external DoD 14.3-122 can provide data to both of the removable straps 14.3-110, 14.3-112 via the dongle 14.3-618. In at least some examples, the dongle 14.3-618 can improve bandwidth through the wearable electronic device 14.3-600 (e.g., by circumventing the HMD 14.3-102 for transmission of data around the wearable electronic device 14.3-600). By transmitting data to the removable strap 14.3-110 through the dongle 14.3-618, and in particular through the second portion 14.3-621, the wearable electronic device 14.3-600 can also include reduced thermal loads in the bypassed components (e.g., through the removable strap 14.3-112 and the HMD 14.3-102).

FIGS. 14.3-7 and 14.3-8 illustrate schematic views of example cable management mechanisms for HMD systems in accordance with one or more examples of the present disclosure. In particular, FIG. 14.3-7 shows a dongle 14.3-718 connected to the removable strap 14.3-112. The dongle 14.3-718 can be the same as or similar to the dongles 14.3-118, 14.3-618 discussed above. The dongle 14.3-718 also includes slack 14.3-702 (e.g., a cable portion for routing to the external DoD 14.3-122). To help prevent unwanted positioning or tangling, the retention band 14.3-114 can include a cable management mechanism 14.3-700.

The cable management mechanism 14.3-700 can route, position, tension, or otherwise manage the slack 14.3-702 for the dongle 14.3-718. In some examples, the cable management mechanism 14.3-700 includes an external ring, clip, button snap, Velcro® strip, tie, etc. attached to the retention band 14.3-114. In other examples, the cable management mechanism 14.3-700 includes an aperture, slot, or recess within the retention band 14.3-114.

Similarly, FIG. 14.3-8 shows a dongle 14.3-818 connected to the removable strap 14.3-112. The dongle 14.3-818 can be the same as or similar to the dongles 14.3-118, 14.3-618 discussed above. Like the dongle 14.3-718, the dongle 14.3-818 includes slack 14.3-802 (e.g., for routing to the external DoD 14.3-122). A cable management mechanism 14.3-800 is configured to efficiently handle the slack 14.3-802, including one or more of a length or tension of the slack 14.3-802.

In some examples, the cable management mechanism 14.3-800 includes a retractable spool. Via the retractable spool, the slack 14.3-802 can be pulled out or lengthened with manual interaction. In some examples, the slack 14.3-802 can be pulled out to a desired length and locked in place such that the retractable spool maintains an amount or tension of the slack 14.3-802. In certain examples, the cable management mechanism 14.3-800 can automatically wind the slack 14.3-802. In other examples, the cable management mechanism 14.3-800 winds the slack 14.3-802 in response to user interaction with at least one of the slack 14.3-802 or the cable management mechanism 14.3-800. For instance, the cable management mechanism 14.3-800 includes a button release to initiate winding of the slack 14.3-802. In other instances, the cable management mechanism 14.3-800 can wind the slack 14.3-802 in response to a pull (e.g., a directional tug) of the slack 14.3-802.

14.4: Devices with Detachable Headbands

Head-mounted devices include head-mounted support structures that allow the devices to be worn on the heads of users. The head-mounted support structures may include device housings that enclose components such as displays. The displays may be used for presenting a user with visual content. The head-mounted support structures for a head-mounted device may also include headbands and other structures that help hold a device housing on the face of a user. The headband of a head-mounted device may be removable. This allows users to swap different headbands into use to accommodate different head sizes and/or to update the style of headband being used.

FIG. 14.4-1 is a side view of a head-mounted electronic device with a detachable headband. As shown in FIG. 14.4-1, head-mounted device 14.4-10 may include head-mounted housing 14.4-12 (sometimes referred to as a main housing, main housing unit, head-mounted support structure, main housing portion, etc.). Housing 14.4-12 may have walls or other structures that separate an interior housing region from an exterior region surrounding housing 14.4-12. For example, housing 14.4-12 may have walls formed from polymer, glass, metal, and/or other materials. Electrical and optical components may be mounted in housing 14.4-12. These components may include components such as integrated circuits, sensors, control circuitry, input-output devices, etc.

To present a user with images for viewing from eye boxes (e.g., eye boxes in which the user's eyes are located when device 14.4-10 is being worn on the users' head), device 14.4-10 may include displays and lenses. These components may be mounted in optical modules 14.4-20 that face towards rear R of device 14.4-10 or may be mounted in other supporting structures in housing 14.4-12 to form respective left and right optical systems. There may be, for example, a left display for presenting an image through a left lens to a user's left eye in a left eye box and a right display for presenting an image to a user's right eye in a right eye box.

If desired, housing 14.4-12 may have forward-facing components such as cameras and other sensors on front F for gathering sensor measurements and other input and may have a soft cushion on opposing rear R. Rear R may have openings that allow the user to view images from left and right optical modules 14.4-20 (e.g., when rear R is resting on the front of the user's head).

Device 14.4-10 may have a strap such as headband 14.4-26 and, if desired, may have other structures (e.g., an optional over-the-head strap) to help hold housing 14.4-12 on the user's head. Headband 14.4-26 may have a fixed length or may be adjustable. Headband 14.4-26 may have first and second ends coupled, respectively, to the left and right sides of housing 14.4-12. In the example of FIG. 14.4-1, coupling members 14.4-24, which serve as extensions of housing 14.4-12, are provided on the left and right sides of housing 14.4-12. Members 14.4-24 may be formed from rigid materials such as rigid polymer and/or other materials and may contain sensors, buttons, speakers, and other electrical components. Hinges and/or other mechanisms may be used to couple members 14.4-24 to housing 14.4-12 or members 14.4-24 may be formed as integral portions of a main housing unit. The ends of headband 14.4-26 may have coupling mechanisms such as openings configured to receive posts 14.4-30 (pins) or other protrusions on members 14.4-24 or other housing structures. In some examples, these posts face inwardly towards the user's head and are not visible to people in the vicinity of device 14.4-10 when device 14.4-10 is being worn by the user. Releasable latch mechanisms can be used to help secure the ends of headband 14.4-26 to member 14.4-24. For example, a first detachable latch may be used to removably couple the left end of headband 14.4-26 to a left post in a left member 14.4-24 on a left side of housing 14.4-12 and a second detachable latch may be used to removably couple the right end of headband 14.4-26 to a right post in a right member 14.4-24 on a right side of housing 14.4-12. If desired, a user may flip the headband 14.4-26 over so that the first detachable latch removable couples the end of headband 14.4-26 that was previously coupled to the left post to the right post and so that the second detachable latch removably couples the end of headband 14.4-26 that was previously coupled to the right post to the left post (e.g., the user may flip the left and right sides of the band without flipping the band inside out). A user may open and close the latches when housing 14.4-12 is being worn or when housing 14.4-12 is not being worn.

The use of latch-based coupling mechanisms in device 14.4-10 may help allow a user to removably attach headband 14.4-26 to members 14.4-24 and thereby removably attach headband 14.4-26 to housing 14.4-12. Members 14.4-24 may have elongated shapes of the type shown in FIG. 14.4-1 and/or other suitable shapes and may sometimes be referred to as rigid straps, rigid coupling members, power straps head-mounted device housing structures, elongated head-mounted device housing members, elongated housing structures, elongated housing members, or head-mounted device housing members (as examples).

Headband 14.4-26 may have soft flexible portions and/or rigid portions. As an example, a central portion of headband 14.4-26 may be formed from stretchable fabric. Left and right end portions of headband 14.4-26 may be coupled to opposing ends of this central portion. The left and right end portions may, as an example, have stiffening structures (e.g., the left and right end portions may be stiffer than the central stretchable portion). Other types of configuration may be used for headband 14.4-26, if desired (e.g., arrangements with adjustable tensioning cables, etc.).

FIG. 14.4-2 is a diagram of an end portion of a headband 14.4-26 and a corresponding end portion of a member 14.4-24. Headband 14.4-26 and housing structures such as members 14.4-24 may sometime be collectively referred to as a forming a head-mounted device headband system (headband system 14.4-22). As shown in the example of FIG. 14.4-2, member 14.4-24 may have a protruding post such as post 14.4-30 (e.g., a post that protrudes out of member 14.4-24 towards a user head while device 14.4-10 is being worn by a user). Headband 14.4-26 may have a corresponding opening 14.4-32 that is configured to receive post 14.4-30.

Opening 14.4-32 may be a through-hole opening with a shape that matches the outline of post 14.4-30. In the present example, post 14.4-30 and opening 14.4-32 have elongated shapes when viewed end-on (e.g., rectangular shapes with rounded corners). These elongated shapes may help resist rotational motion between longitudinal axis 14.4-34 of headband 14.4-26 and longitudinal axis 14.4-36 of member 14.4-24. This helps prevent headband 14.4-26 from slipping up or down along the rear surface of a user's head during use. In general, post 14.4-30 and/or mating opening 14.4-32 may have any suitable shapes (e.g., the shape of post 14.4-30 and/or opening 14.4-32 may be circular, oval, rectangular, triangular, may be a shape with curved edges and/or straight edges, may be a shape with drafted edges to help with alignment and/or insertion, etc.). The use of rectangular shapes with rounded corners and/or other shapes that are elongated (e.g., along respective longitudinal axes 14.4-40 and 14.4-38 of FIG. 14.4-2, respectively), is merely for illustrative purposes.

FIG. 14.4-3 is a cross-sectional side view of system 14.4-22. As shown in FIG. 14.4-3, member 14.4-24 may have main portion 14.4-24M. Main portion 14.4-24M may serve as a support for post 14.4-30 and may be formed from rigid polymer, metal, fabric, carbon-fiber composite materials, and/or other materials. Post 14.4-30 may be attached to main portion 14.4-24M and may protrude inwardly (or, in some examples, outwardly) from portion 14.4-24M. Post 14.4-30 may be formed from metal, rigid polymer, other materials, and/or combinations of these materials. Post 14.4-30 may have main portion 14.4-30C, which protrudes away from the surface of portion 14.4-24M. Post 14.4-30 may also have a peripheral protruding portion such as peripheral protruding portion 14.4-30P. Portion 14.4-30P may, as an example, run along the periphery of post 14.4-30 and may protrude radially outward from main portion 14.4-30C. In the example of FIG. 14.4-3, protruding portion 14.4-30P has bevels to facilitate entry of post 14.4-30 into opening 14.4-32 of headband 14.4-26 in direction 14.4-54 and to facilitate removal of post 14.4-30 from opening 14.4-32 in the opposite direction when detaching headband 14.4-26 from member 14.4-24.

Headband 14.4-26 has a main strap portion 14.4-44. Strap portion 14.4-44, which may sometimes be referred to as a strap or headband member, may have internal stiffening members, external fabric coverings and or other covering layers, strips of strengthening fabric, stretchable fabric portions (e.g., stretchable knit fabric), cosmetic coverings, and/or other headband structures. Through-hole opening 14.4-32 may be formed by cutting or otherwise forming an opening in portion 14.4-44. The periphery of opening 14.4-32 may be strengthened using a mating pair of ring members 14.4-40. Members 14.4-40, which may sometimes be referred to as a cap and socket, may have ring shapes and may capture portions of strap 14.4-44. Members 14.4-40 may be attached to each other using laser welding and/or other attachment mechanisms. Adhesive may optionally be used to help secure members 14.4-40 to strap 14.4-44.

When members 14.4-50 are attached to each other, a ring shaped recess such as recess 14.4-52 is formed. Spring 14.4-42 (e.g., a spring formed from metal, foam, stretchy rubber gasket material or other elastomeric material, and/or other spring structures) may have a ring shape surrounding opening 14.4-32 and may be received within recess 14.4-52. Gap 14.4-46 may be formed on one side of spring 14.4-42. As shown in the top view of spring 14.4-42 of FIG. 14.4-4, the presence of gap 14.4-46 allows spring 14.4-42 to expand outwardly in direction 14.4-56 when post 14.4-30 is inserted within opening 14.4-32 and the bevels on protruding portion 14.4-30P press spring 14.4-42 radially outward. Once post 14.4-30 has been inserted within opening 14.4-32 sufficiently for protruding portion 14.4-30P to have passed spring 14.4-42, spring 14.4-42 may contract inwardly against main portion 14.4-30C, thereby retaining post 14.4-30 within opening 14.4-32 and securing headband 14.4-26 to member 14.4-24. When it is desired to remove headband 14.4-26, headband 14.4-26 may be pulled away from member 14.4-24. During headband removal, the bevels on portion 14.4-30P press against spring 14.4-42 and expand spring 14.4-42 radially, thereby allowing post 14.4-30 to be removed from opening 14.4-32.

The illustrative spring-based headband retention arrangement of FIGS. 14.4-3 and 14.4-4 allows headband 14.4-26 to be attached and detached from member 14.4-24. If desired a latch-based mechanism maybe used to secure and release headband 14.4-26. This type of arrangement is shown in FIG. 14.4-5. As shown in the example of FIG. 14.4-5, system 14.4-22 may include a latching mechanism such as latch 14.4-62. Latch 14.4-62, which may sometimes be referred to as a latch mechanism or latch structures, may be opened and closed using magnets, springs, sliding members, toggling members, rotating members such as knobs, buttons, and/or other latch structures that may be manipulated by a user (e.g., a user's fingers). In the example of FIG. 14.4-5, the latch of headband 14.4-26 has a movable latch member that engages post 14.4-30 when post 14.4-30 is within opening 14.4-32 and has an associated release mechanism such as release tab 14.4-62T. Tab 14.4-62T, which may be formed from a flexible strip of material (e.g., fabric, polymer, and/or other material) may be pulled in direction 14.4-64 by a user (e.g., when a user grasps tab 14.4-62T between the user's fingers), thereby moving the movable latch member out of engagement with post 14.4-30. This releases post 14.4-30 and allows post 14.4-30 to be removed from opening 14.4-32. Magnets, spring structures, and/or other biasing structures may be used in closing the latch. In some examples, member 14.4-24 and headband 14.4-26 may have magnets that facilitate attachment of headband 14.4-26 and member 14.4-24. As shown in FIG. 14.4-5, for example, post 14.4-30 may have one or more magnets such as magnet 14.4-60. Magnet 14.4-60 may be used to attract and/or repel corresponding magnets in strap 14.4-44, which can assist in attaching headband 14.4-26 to member 14.4-24 and/or can assist in closing latch 14.4-62.

FIG. 14.4-6 is a side view of system 14.4-22 in a configuration in which latch 14.4-62 has a release tab. Tab 14.4-62T may be attached to slidable (movable) latch member 14.4-62M. Latch member 14.4-62M may be moved laterally towards post 14.4-30 in response to magnetic force, spring force, or other biasing force from a latch member biasing mechanism so that the tip of the member 14.4-62M protrudes under a lip portion (portion 14.4-30P) of post 14.4-30. In this way, post 14.4-30 is retained within opening 14.4-32 until latch 14.4-62 is released (e.g., by pulling on tab 14.4-62T in direction 14.4-64).

FIG. 14.4-7 is a top view of system 14.4-22 in an example in which post 14.4-30 of member 14.4-24 and headband 14.4-26 have magnets. Post 14.4-30 has magnet 14.4-60. Strap 14.4-44 of headband 14.4-26 has magnets 14.4-66, 14.4-68, and 14.4-70. When post 14.4-30 is inserted within opening 14.4-32 of headband 14.4-26, magnet 14.4-60 lies between magnets 14.4-66 and 14.4-68. In this configuration, the south pole of magnet 14.4-60 attracts the north pole of magnet 14.4-68. Magnet 14.4-68 is attached to slidable latch member 14.4-62M. The magnetic attraction between magnet 14.4-60 and magnet 14.4-68 pulls latch member 14.4-62M towards post 14.4-30 until the tip of latch member 14.4-62M is received under protruding portion (lip) 14.4-30P of post 14.4-30 (as shown in FIG. 14.4-6). In this position, latch 14.4-62 is closed and post 14.4-30 is retained within opening 14.4-32 (e.g., headband 14.4-62 is attached to member 14.4-24).

When post 14.4-30 is not inserted in opening 14.4-32, the south poles of magnets 14.4-70 attract the north poles of magnet 14.4-68 and vice versa, so that magnet 14.4-68 aligns with magnet 14.4-70 when post 14.4-30 is not present.

Magnets 14.4-70 are attached to strap 14.4-44, whereas magnet 14.4-68 is attached to slidable latch member 14.4-62M. Due to the magnetic attraction between magnets 14.4-70 and magnet 14.4-68, 14.4-70, member 14.4-62M is moved to open latch position 14.4-62M'. This ensures that the tip of member 14.4-62M that faces opening 14.4-32 will not protrude into opening 14.4-32 in the absence of post 14.4-30 and will therefore not visible within opening 14.4-32. The magnetic retraction of latch member 14.4-62M thereby helps enhance the visual appearance of headband 14.4-26 when headband 14.4-26 is not attached to member 14.4-24 and latch 14.4-62 is open.

When a user desires to attach headband 14.4-26 to member 14.4-24, the user places opening 14.4-32 of headband 14.4-26 adjacent to post 14.4-30. As opening 14.4-32 moves towards post 14.4-30, the south pole of magnet 14.4-66 attracts the north pole of magnet 14.4-60 while the north pole of magnet 14.4-68 attracts the south pole of magnet 14.4-60 in an almost perfectly symmetrical fashion, so that the force exhibited on post 14.4-30 feels balanced. This tends to align post 14.4-30 with opening 14.4-32 and pull post 14.4-30 into opening 14.4-32, thereby reducing the need for the user to accurately align post 14.4-30 with opening 14.4-32.

The illustrative example of FIG. 14.4-7 uses magnetic force for three different functions. Firstly, while headband 14.4-26 and member 14.4-24 are detached, magnetic force is used to automatically retract latch member 14.4-62M into position 14.4-62M'. This automatic magnetic latch opening mechanism helps maintain latch member 14.4-62M out of opening 14.4-32 when not in use. Secondly, when a user is first attaching headband 14.4-26 to member 14.4-24, magnetic attraction is used to guide post 14.4-30 into opening 14.4-32 without excessive user attention. Thirdly, after post 14.4-30 has been received within opening 14.4-32, magnetic attraction is used to pull latch member 14.4-62M towards post 14.4-30 under protruding (lip) portion 14.4-30P, thereby magnetically closing latch 14.4-62.

Other biasing mechanisms may be used in addition to or in the alternative to magnetic biasing arrangements. For example, FIGS. 14.4-8, 14.4-9, 14.4-10, and 14.4-11 and their related description disclose spring-based biasing mechanisms that can be used in addition to or in the alternative to magnetic biasing arrangements.

As shown in FIG. 14.4-8, latch member 14.4-26M may be biased using biasing member 14.4-80. Biasing member 14.4-80 may be a spring (e.g., a compression spring formed from metal or other springy material, etc.), may be a spring formed from elastomeric material (e.g., polymer foam), and/or may be formed from other spring structures that exhibit spring force. Member 14.4-80 of FIG. 14.4-8 may be used, for example, to push away from strap 14.4-44 and thereby push latch member 14.4-62M into engagement with post 14.4-30 when post 14.4-30 has been received within opening 14.4-32. Compression springs or other expanding biasing members may be used to move any suitable movable structures associated with latch 14.4-62 (e.g., member 14.4-62M and/or other movable members).

As shown in FIG. 14.4-9, biasing members 14.4-80 may be used in tension (e.g., members 14.4-80 may be tension springs). In the illustrative configuration of FIG. 14.4-9, members 14.4-80 are pulling member 14.4-62M towards opening 14.4-32. Tension springs or other tensioned biasing members may, in general, pull on any suitable latch structures in latch 14.4-62.

FIGS. 14.4-10 and 14.4-11 illustrate the use of a spring formed from an elastomeric band. As shown in the top view of FIG. 14.4-10, for example, spring member 14.4-80 (e.g., an elastomeric band having a ring shape) may extend between a portion of headband 14.4-26 (e.g., strap 14.4-44) and latch member 14.4-62M. When member 14.4-62M is moved away from opening 14.4-32, member 14.4-80 is stretched. This creates an opposing restoring spring force that tends to pull member 14.4-62M towards opening 14.4-32, allowing member 14.4-62M to engage post 14.4-30 in opening 14.4-32. This type of elastomeric band spring biasing mechanism is further illustrated in the cross-sectional side view of system 14.4-22 of FIG. 14.4-11. As shown in FIG. 14.4-11, biasing member 14.4-80 (e.g., a spring formed from an elastomeric band) may have a ring shape that extends (on the left) through a portion of strap 14.4-44 and (on the right) through a grooved portion of latch member 14.4-62M. Post 14.4-30 may have a protruding portion such as portion 14.4-30P that creates a post recess (recess 14.4-82) into which latch member 14.4-62M can be received when latch 14.4-62 is closed. When it is desired to open latch 14.4-62, a release tab or other release mechanism that is coupled to member 14.4-62M may pull the tip of latch member 14.4-62M out of recess 14.4-82. This releases protruding portion 14.4-30P from the tip of latch member 14.4-62M and thereby unlocks latch 14.4-62 so that post 14.4-30 can be removed from opening 14.4-32. At the same time, moving latch member 14.4-62M away from opening 14.4-32 tensions member 14.4-80. When it is desired to attach headband 14.4-26 to member 14.4-24, this tension can be used to move member 14.4-62M into recess 14.4-82, so that member 14.4-62M engages post 14.4-30.

In the latch arrangement of FIG. 14.4-11, latch member 14.4-62M has a cam surface such as angled surface 14.4-84. This surface may interact with protruding portion 14.4-30P. For example, as post 14.4-30 is being inserted into opening 14.4-32, portion 14.4-30P may bear against surface 14.4-84 and thereby force latch member 14.4-62M away from post 14.4-30 to open latch 14.4-62. Once portion 14.4-30P has moved across all of surface 14.4-84, latch member 14.4-62M may move into recess 14.4-82 under the latch-closing biasing force of biasing member 14.4-80.

FIG. 14.4-12 shows how latch member 14.4-62M may have both outwardly and inwardly facing cam surfaces 14.4-88. Protruding portion 14.4-30P may have corresponding outwardly and inwardly cam surfaces 14.4-86. With this type of arrangement, the outwardly facing cam surface of protrusion 14.4-30P may bear against the inwardly facing cam surface of latch member 14.4-62M when post 14.4-30 is being inserted into opening 14.4-32, thereby moving latch member 14.4-62M away from post 14.4-30 to place latch 14.4-62 in its open state. After inserting post 14.4-30 in opening 14.4-32, the biasing mechanism that is being used to close latch 14.4-62 (e.g., magnetic biasing, spring biasing, etc.) pushes latch member 14.4-62M toward post 14.4-30 and engages protrusion 14.4-30P to hold post 14.4-30 in place in opening 14.4-32. When a user desires to remove headband 14.4-26 from member 14.4-24, the user may pull headband 14.4-26 and member 14.4-24 apart, causing the inwardly facing cam surface 14.4-86 of protruding portion 14.4-30P to bear against the outwardly facing cam surface 14.4-88 of latch member 14.4-62M and thereby push latch member 14.4-62M into its open position. Because a pulling force from a user is used to disengage member 14.4-24 and headband 14.4-26 in systems such as system 14.4-22 of FIG. 14.4-12, these systems may sometimes be referred to as pull-to-release systems (e.g., latch 14.4-62 of FIG. 14.4-12 may be referred to as a pull-to-release latch). Any suitable latch closing mechanism may be used with this type of latch (e.g., member 14.4-62M may be biased towards post 14.4-30 using magnetic biasing, metal spring biasing, elastomeric band spring biasing, etc.

In addition to or instead of using a pull-to-release mechanism to release latch 14.4-62, latch 14.4-62 may be provided with one or more of the latch release mechanisms of FIG. 14.4-13. As shown in FIG. 14.4-13, latch 14.4-62 may have a movable latch member such as latch member 14.4-62M that has a cam surface such as cam surface 14.4-94. A biasing mechanism (magnetic, spring-based, etc.) may be used to push latch member 14.4-62M into its closed position in which latch member 14.4-62M engages protruding portion 14.4-30P of post 14.4-30 and holds member 14.4-24 and headband 14.4-26 together.

In some examples, latch 14.4-62 uses a push-button release mechanism. With this arrangement, latch 14.4-62 is provided with a button. The button may have a movable button member such as button member 14.4-90 that is coupled to post 14.4-30. When a use desires to release latch 14.4-62, the user may press inwardly on button member 14.4-90, to move button 14.4-90 inwardly and cause button member cam surface 14.4-92 to bear against cam surface 14.4-94 of latch member 14.4-62M. This pushes latch member 14.4-62M away from post 14.4-30 and thereby opens the latch so that post 14.4-30 can be removed from opening 14.4-32.

In some examples, latch 14.4-62 is provided with a toggle release mechanism. As shown in FIG. 14.4-13, for example, toggle lever 14.4-96 may be coupled to latch member 14.4-62M by pivoting connection 14.4-100 and may be coupled to structures in strap 14.4-44 of headband 14.4-26 by pivoting connection 14.4-98. This allows a user to move latch member 14.4-62M to its open position (disengaged from post 14.4-30) by flipping lever 14.4-96.

In some examples, a slider mechanism may be used for latch release operations. As shown in FIG. 14.4-13, for example, slider member 14.4-102 may be attached to latch member 14.4-62M. With this arrangement, a user may open latch 14.4-62 by sliding member 14.4-102 (and thereby sliding latch member 14.4-62M) away from post 14.4-30.

Additional latch release arrangements may be used, if desired (e.g., release mechanisms based on pull tabs, rotating knobs, push buttons, pull buttons, sliders, toggle switches, other release structures and/or combinations of these structures). These latch release arrangements may be used with any suitable latch-biasing scheme (e.g., arrangements in which latch member 14.4-62M is biased towards its closed position magnetically, using a metal spring, using a tension spring, using a compression spring, using a coil spring, using a leaf spring, using a spring based on a stretchable band such as an elastomeric ring, and/or other spring, using a biasing device based on compressible foam, etc.). There may be a single latch member 14.4-62M in latch 14.4-62 or multiple latch members 14.4-62M may be used in latch 14.4-62.

FIG. 14.4-14 is a perspective view of headband 14.4-26 in an example in which strap 14.4-44 has latch member recesses 14.4-104. Recesses 14.4-104 may be formed on opposing sides of opening 14.4-32 and may be configured to receive respective latch members that are located on opposing sides of post 14.4-30. With this type of arrangement, the latch members are retracted into post 14.4-30 to open latch 14.4-62 and are extended out of post 14.4-30 into openings 14.4-104 of headband strap 14.4-44 to close latch 14.4-62.

FIG. 14.4-15 is a top view of a post for member 14.4-24 that has movable latch members 14.4-62M for forming latch 14.4-62. In this example, post 14.4-30 has a main portion 14.4-30MP to which latch members 14.4-26M are slidably coupled. When it is desired to release headband 14.4-26 from member 14.4-24, movable post latch members 14.4-26M are placed in the retracted position shown in FIG. 14.4-15. After inserting post 14.4-30 into opening 14.4-32 of strap 14.4-44 of headband 14.4-26, latch members 14.4-26M may be moved outwardly in directions 14.4-106. This causes latch members 14.4-62M to move into openings 14.4-104 of strap 14.4-44 of FIG. 14.4-14, thereby closing the latch and securing headband 14.4-26 to member 14.4-24.

A cross-sectional side view of a system based on a strap of the type shown in FIG. 14.4-14 and a post with latch members of the type shown in FIG. 14.4-15 is shown in FIG. 14.4-16. As shown in FIG. 14.4-16, latch 14.4-62 may have movable latch members 14.4-26M that are slidably coupled to post 14.4-30 (e.g., in slots in main post portion 14.4-30MP). Each latch member 14.4-26M may have a biasing mechanism (magnetic, spring-based, etc.) that pushes that member outwardly into a corresponding strap recess 14.4-104 in strap 14.4-44 of headband 14.4-26 when post 14.4-30 is inserted into opening 14.4-32. This closes latch 14.4-62 and secures headband 14.4-26 to member 14.4-24.

Latch 14.4-62 may have a button release or other release mechanism. As shown in FIG. 14.4-16, for example, button member 14.4-110 may be coupled to post 14.4-30 and may move in and out with respect to main post portion 14.4-30MP. When the biasing mechanisms coupled to latch members 14.4-26M are pushing members 14.4-26M to their greatest outward extent (away from each other), cam surfaces 14.4-116 of members 14.4-62M bear against structures 14.4-108 (e.g., a hollow tube or other structure coupled to member 14.4-24). This forces latch members 14.4-62M in upward direction 14.4-120. When it is desired to release latch 14.4-62, a user may press on button member 14.4-130. This causes button member 14.4-130 to move inwardly in direction 14.4-122, so that button member surface 14.4-112 bears against surfaces 14.4-114 of latch members 14.4-62M, causing cam surfaces 14.4-116 of latch members 14.4-62M to bear against structures 14.4-108. As cam surfaces 14.4-116 interact with structures 14.4-108 under pressure in direction 14.4-122 from button member 14.4-110, latch members 14.4-62M are forced inwardly towards each other (overcoming their outward biases). Once latch members 14.4-62M have been fully retracted into post 14.4-30, latch members 14.4-62M will become disengaged with recesses 14.4-104 of strap 14.4-44, thereby allowing strap 14.4-44 to be removed from post 14.4-30.

In the example of FIG. 14.4-16, recesses 14.4-104 are located in strap 14.4-44. If desired, recesses for receiving latch members 14.4-62M may be located in post 14.4-30. Consider, as an example, the arrangement shown in the cross-sectional side view of system 14.4-22 of FIG. 14.4-17. As shown in FIG. 14.4-17, latch members 14.4-26M may be slidably coupled to strap 14.4-44 of headband 14.4-26 (e.g., latch members 14.4-26M may slide back and forth laterally within recesses in strap 14.4-44). Biasing mechanisms (magnetic biasing structures, spring-based biasing structures, etc.) may be used to bias latch members 14.4-26M towards post 14.4-30. Post 14.4-30 may have one or more recesses 14.4-124 that are configured to receive latch members 14.4-62M. When latch members 14.4-26M are biased into recesses 14.4-124, post 14.4-30 will be retained within opening 14.4-32 and headband 14.4-26 will therefore be secured to member 14.4-24. When it is desired to release latch 14.4-62, members 14.4-26M may be moved out of post recesses 14.4-120 (e.g., using a release mechanism based on a press or pull button, a sliding button, a toggling button, a pull tab, etc.). Recess 14.4-124 may extend around the entire periphery of post 14.4-30 or there may be one or more recesses 14.4-124 located at different locations about the periphery of post 14.4-30, each of which is aligned with a respective member 14.4-26M.

Although sometimes described herein in the context of examples where posts 14.4-30 are formed on members 14.4-24 and openings 14.4-32 are formed in headband 14.4-26, posts 14.4-30 may, if desired, be formed as part of headband 14.4-26 and openings 14.4-32 may be formed in members 14.4-24.

14.5: Cable Tensioning System and Dial

Dial-based cable tensioning systems are used in an increasing number of applications, including clothing, such as lacing systems for footwear, tensioning systems for headwear, and the like. Dial-based tensioning systems can feature various improvements over conventional tensioning systems, such as low friction and equilibrated tensioning pressure across contact surfaces (e.g., in the case of headwear, equal pressure is applied around a user's head). However, current dial-based tensioning systems are often noisy when users manipulate the dial, which can be problematic or irritating. In addition, current dial-based tensioning systems can fail to maintain the desired pressure across the contact surface over time. Improvements and advances to dial-based tensioning systems can be desirable to provide additional functionality in a variety of situations and environments.

Portable electronic devices, such as smart phones, laptops, tablet computing devices, smart watches, head-mountable displays (HMDs), and headphones, have become commonplace for persons undertaking daily activities (travel, communication, education, entertainment, employment, etc.). Indeed, portable electronic devices can provide assistance in completing daily tasks and errands, such as, watching an instructional video or monitoring progress during and after an exercise routine. Some electronic devices, such as HMDs, require mounting systems for mounting the electronic devices on a user's body, such as on a user's head. As an example, an HMD can be mounted on a user's head using an adjustable headband, which can include a dial-based tensioning system. Tensioning systems described herein can be silent and non-back-drivable, for example tensioning systems for HMDs, so as to not cause unwanted sounds near a user's ear and to maintain the HMD on a user's head. The tensioning systems described herein can be applicable to other applications, such as lacing systems for footwear, tensioning systems for other headwear, tensioning systems for other clothing, tensioning systems for bindings, and the like.

Various examples disclosed herein relate to improved tensioning systems, such as improved dial-based tensioning systems, which can be used for adjustable headbands in head-mountable display devices along with any other applications. The improved tensioning systems include a clutch that interacts with a spool on which a cable can be wound and a wheel that can be used by a user to wind the spool. The clutch is a roller-and-wedge system, which includes rollers in roller openings of a cam wheel. When the rollers are wedged between the cam wheel and a housing of the tensioning system, the cam wheel is locked. When the rollers are not wedged between the cam wheel and the housing, the cam wheel is unlocked. The roller-and-wedge system is non-back-drivable (cable can be pushed into the tensioning system, but not pulled out of the tensioning system without rotating the wheel) and silent. The tensioning system can also include various angular restraint systems, which prevent the tensioning system from over-spooling (winding too much cable into the spool and damaging the tensioning system) and operating in a backwards direction.

HMDs described herein can include head-mountable support structures that allow the devices to be worn on the heads of users. The head-mountable support structures can include device housings for housing components, such as displays that are used for presenting a user with visual content. The head-mountable support structures for an HMD can also include headbands and other structures that help hold a device housing on the face of a user. The headband of an HMD device can be adjustable, and can include a tensioning system or the like for adjusting the headband.

These and other examples are discussed below with reference to FIGS. 14.5-1 through 14.5-9C. However, those skilled in the art will readily appreciate that the detailed description given herein with respect to these figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 14.5-1 is a side view of a head-mountable display (HMD) 14.5-110 with an adjustable headband 14.5-126 (sometimes referred to herein as a "band"), in accordance with some examples. As illustrated in FIG. 14.5-1, the HMD 14.5-110 can include a head-mountable housing 14.5-112. The head-mountable housing 14.5-112 can include a main housing, a main housing unit, a head-mountable support structure, or the like. The head-mountable housing 14.5-112 can have walls or other structures that separate an interior housing region from an exterior housing region of the head-mountable housing 14.5-112. In some examples, the walls of the head-mountable housing 14.5-112 can be formed from a material such as polymer, glass, metal, combinations thereof, or the like. Electrical and optical components can be mounted in the head-mountable housing 14.5-112. These components can include components such as integrated circuits, sensors, control circuitry, input-output devices, and the like.

The HMD 14.5-110 can be used to present images to a user for viewing from eye boxes (e.g., eye boxes in which the user's eyes are located when the HMD 14.5-110 is being worn on the users' head, as representatively illustrated by a user's head 14.5-122 in FIG. 14.5-1). Specifically, the HMD 14.5-110 can include displays, lenses, and the like in the eye boxes. These components can be mounted in optical modules or other supporting structure in the head-mountable housing 14.5-112 to form respective left and right optical systems. A left display can be included for presenting an image through a left lens to a user's left eye in a left eye box and a right display can be included for presenting an image to a user's right eye in a right eye box.

In some examples, the head-mountable housing 14.5-112 can include forward-facing components, such as cameras, other sensors, and the like on a front-side F of the head-mountable housing 14.5-112. The forward-facing components can be used for gathering sensor measurements and other inputs. A soft cushion can be disposed on an opposing rear side of the head-mountable housing 14.5-112. The rear side of the head-mountable housing 14.5-112 can include openings that allow the user to view images from the left and right optical systems (e.g., when the rear of the head-mountable housing 14.5-112 is resting on a front surface 14.5-120F of the user's head 14.5-122).

The HMD 14.5-110 can include an adjustable band, such as an adjustable headband 14.5-126 or band. In some examples, the HMD 14.5-110 can include other structures (e.g., an optional over-the-head band or the like) to help hold the head-mountable housing 14.5-112 on the user's head 14.5-122. The adjustable headband 14.5-126 can have first and second ends that are physically coupled to left and right sides of the head-mountable housing 14.5-112, respectively. In the example illustrated in FIG. 14.5-1, coupling members 14.5-124 or straps, which serve as extensions of the head-mountable housing 14.5-112, are provided on the left and right sides of the head-mountable housing 14.5-112 to physically couple the adjustable headband 14.5-126 to the head-mountable housing 14.5-112. The coupling members 14.5-124 or straps can be formed from rigid materials, such as rigid polymers and/or other materials. The coupling members 14.5-124 can contain sensors, buttons, speakers, and/or other electrical components. Hinges and/or other mechanisms can be used to couple the coupling members 14.5-124 to the head-mountable housing 14.5-112. In some examples, the coupling members 14.5-124 or straps can be formed integrally as portions of the head-mountable housing 14.5-112.

The first and second ends of the adjustable headband 14.5-126 can have coupling mechanisms, such as openings, that are configured to receive posts or other protrusions 14.5-124P of the coupling members 14.5-124 or straps (or other coupling structures of the head-mountable housing 14.5-112). The adjustable headband 14.5-126 can be coupled to the coupling members 14.5-124 or straps such that a user removably attaches the adjustable headband 14.5-126 to the coupling members 14.5-124 or straps. As such, the user can remove the adjustable headband 14.5-126 from the head-mountable housing 14.5-112. The coupling members 14.5-124 or straps can have elongated shapes, as illustrated in FIG. 14.5-1, and/or other suitable shapes. Examples of the coupling members 14.5-124 or straps can include rigid straps, rigid coupling members, power straps, or the like.

The adjustable headband 14.5-126 can include a soft flexible portion, such as a central portion 14.5-130. The central portion 14.5-130 can be formed between two stiffer portions, such as end portions 14.5-128 on the left and right ends of the adjustable headband 14.5-126 (e.g., the first and second ends of the adjustable headband 14.5-126). The end portions 14.5-128 can be stiffened using embedded polymer stiffeners (e.g., single-layer or multi-layer polymer stiffening strips) and/or other stiffening members. The central portion 14.5-130 can be formed from a stretchable material such as stretchy fabric. In some examples, the central portion 14.5-130 can be formed from a band of flat knit fabric that includes stretchable strands of material (e.g., elastomeric strands) and/or which uses a stretchable fabric construction (e.g., a stretchable knit construction). The central portion 14.5-130 can include narrowed end portions, which can extend over stiffening members in the end portions 14.5-128. This can ensure that the adjustable headband 14.5-126 has a uniform external appearance. Forming the central portion 14.5-130 of a stretchable material and including the central portion in the adjustable headband 14.5-126 allows the adjustable headband 14.5-126 be stretched along its length. This allows the length of the adjustable headband 14.5-126 to be temporarily increased to help a user place the adjustable headband 14.5-126 over the user's head 14.5-122 when a user is donning the HMD 14.5-110. When the adjustable headband 14.5-126 is released, the stretchiness and the elastic nature of the central portion 14.5-130 of the adjustable headband 14.5-126 help to shorten the adjustable headband 14.5-126 and pull the adjustable headband 14.5-126 against the user's head. This allows the adjustable headband 14.5-126 to rest against a rear surface 14.5-120R the user's head.

A tensioning mechanism (such as the tensioning mechanism 14.5-100, discussed below with respect to FIGS. 14.5-2 through 14.5-5) can be included to provide further adjustment of the effective length and tension of the adjustable headband 14.5-126 to secure the adjustable headband 14.5-126 and the HMD 14.5-110 on the user's head 14.5-122. The tensioning mechanism can be provided to adjust the effective length and tension in a headband tensioning cable 14.5-132. The tensioning mechanism can be a rotatable knob, lever, slider, or other mechanism for adjusting the headband tensioning cable 14.5-132. When the effective length of the cable 14.5-132 is greater, or the tension lower, the adjustable headband 14.5-126 will be looser. The increased effective length and low cable tension of the headband tensioning cable 14.5-132 helps to create slack in the adjustable headband 14.5-126, which can aid in donning and doffing of the HMD 14.5-110. When cable tension is increased, the adjustable headband 14.5-126 is secured against the user's head.

As illustrated in FIG. 14.5-1, the headband tensioning cable 14.5-132 can have a loop shape and can include an upper cable segment 14.5-132T that runs along an upper edge of the adjustable headband 14.5-126 and an opposing lower cable segment 14.5-132B that runs along the opposing lower edge of the adjustable headband 14.5-126. In the middle of the central portion 14.5-130 of the adjustable headband 14.5-126, the upper and lower cable segments 14.5-132T and 14.5-132B can be separated by a distance BW (sometimes referred to as a cable bifurcation distance). The separation between the upper and lower cable segments 14.5-132T and 14.5-132B helps secure the adjustable headband 14.5-126 on the curved rear surface 14.5-120R of the user's head 14.5-122. When the adjustable headband 14.5-126 is worn on the rear surface 14.5-120R, as illustrated in FIG. 14.5-1, the upper cable segment 14.5-132T can apply an upward force F1 on the adjustable headband 14.5-126 that can prevent the headband 14.5-126 from slipping downwards off of the user's head 14.5-122. Similarly, the lower cable segment 14.5-132B can apply a downward force F2 that can prevent the adjustable headband 14.5-126 from slipping upwards off of the user's head 14.5-122.

FIG. 14.5-2 illustrates a plan view of an adjustable headband 14.5-126. The adjustable headband 14.5-126 can be substantially similar to, and can include some or all of, the features of the adjustable headband 14.5-126 discussed above with respect to FIG. 14.5-1. As illustrated in FIG. 14.5-2, the adjustable headband 14.5-126 can include a central portion 14.5-130 and end portions 14.5-128. As discussed above, the central portion 14.5-130 can be stretchable and can be formed from a stretchy knit fabric, and the end portions can be stiffened using stiffeners embedded in fabric. One or more openings 14.5-140 can be formed in the end portions 14.5-128 of the adjustable headband 14.5-126. The openings 14.5-140 can receive posts or other protrusions, such as the protrusions 14.5-124P discussed above with respect to FIG. 14.5-1. The openings 14.5-140 can be used in conjunction with the protrusions 14.5-124P to secure the end portions 14.5-128 of the adjustable headband 14.5-126 to coupling members 14.5-124 or straps of a head-mountable housing 14.5-112. In some examples, a single opening 14.5-140 or other attachment mechanism can be disposed on each of the end portions 14.5-128 of the adjustable headband 14.5-126. In some examples, each of the end portions 14.5-128 of the adjustable headband 14.5-126 can include two or more of the openings 14.5-140. In some examples, other attachment mechanisms (e.g., magnets, snaps, hook-and-loop fasteners, screws or other fasteners, combinations thereof, or the like) can be used to attach the adjustable headband 14.5-126 to the coupling members 14.5-124 or straps, or other portions of the head-mountable housing 14.5-112 in an HMD 14.5-110.

A headband tensioning cable 14.5-132 can extend in a loop around the perimeter of the central portion 14.5-130 of the adjustable headband 14.5-126. In the example illustrated in FIG. 14.5-2, the adjustable headband 14.5-126 includes a pulley 14.5-142 coupled to a left end portion 14.5-128 of the adjustable headband 14.5-126. The adjustable headband 14.5-126 includes a tensioning mechanism 14.5-100 coupled to a right end portion 14.5-128 of the adjustable headband 14.5-126. In some examples, the tensioning mechanism 14.5-100 can be an adjustment knob or dial. The tensioning mechanism 14.5-100 can be a two-way dial that can be rotated in a first direction 14.5-148 about a rotational axis 14.5-146 (e.g., a clockwise direction) to shorten the length of the loop of the headband tensioning cable 14.5-132 and thereby increase tension on the headband tensioning cable 14.5-132. The length of the loop of the headband tensioning cable 14.5-132 outside the tensioning mechanism 14.5-100 and disposed in the central portion 14.5-130 can be referred to as the "effective length" of the tensioning cable 14.5-132. A dial of the tensioning mechanism 14.5-100 can be rotated in an opposing second direction 14.5-150 about the rotational axis 14.5-146 (e.g., a counterclockwise direction) to increase the length of the loop of the headband tensioning cable 14.5-132 and thereby decrease tension on the headband tensioning cable 14.5-132. By tightening the headband tensioning cable 14.5-132, tension in the adjustable headband 14.5-126 can be increased and the HMD 14.5-110 can be held more snugly on a user's head 14.5-122. The pulley 14.5-142 can be included to allow tension in upper and lower portions of the headband tensioning cable 14.5-132 to be balanced, ensuring a consistent cupping of the adjustable headband 14.5-126 across various head shapes. By loosening the headband tensioning cable 14.5-132, effective length can be increased and the tension in the adjustable headband 14.5-126 can be decreased.

The tensioning mechanism 14.5-100 can include a variety of improvements. In some examples, the tensioning mechanism 14.5-100 can include a cam and wedge system that allows the tensioning mechanism 14.5-100 to silently spool the headband tensioning cable 14.5-132 into the tensioning mechanism 14.5-100 and silently unspool the headband tensioning cable 14.5-132 from the tensioning mechanism 14.5-100. The tensioning mechanism 14.5-100 can be non-back-drivable. In other words, the tensioning mechanism 14.5-100 can allow the headband tensioning cable 14.5-132 to be spooled into the tensioning mechanism 14.5-100 without rotating the tensioning mechanism 14.5-100, but cannot allow the headband tensioning cable 14.5-132 to be unspooled from the tensioning mechanism 14.5-100 without rotating the tensioning mechanism 14.5-100. The tensioning mechanism 14.5-100 can include an angular stop mechanism (also referred to as a hard stop, an angular stop, or the like). The angular stop mechanism prevents too much of the headband tensioning cable 14.5-132 from being spooled into the tensioning mechanism 14.5-100, preventing damage to the tensioning mechanism 14.5-100. The angular stop mechanism also prevents the tensioning mechanism 14.5-100 from operating in a backwards direction, which can impact the user experience. The tensioning mechanism 14.5-100 can further include a spring detent or the like. The spring detent can provide a desired sound, feel, and other user experience features to the tensioning mechanism 14.5-100. These and other features of the tensioning mechanism 14.5-100 will be discussed below with respect to FIGS. 14.5-3 through 14.5-9C.

FIG. 14.5-3 illustrates a perspective view of a tensioning mechanism or system 14.5-300 that can be included in an HMD 14.5-110 to adjust the tension in a headband tensioning cable 14.5-132 of an adjustable headband 14.5-126, in accordance with some examples. The tensioning system 14.5-300 includes a dial cap 14.5-302 and a housing 14.5-304. The housing 14.5-304 can be directly fixed to an adjustable headband 14.5-126 of the head-mounted device 14.5-110, or can be fixed to the adjustable headband 14.5-126 through an interface. The housing 14.5-104 can be fixed to the adjustable headband 14.5-126 such that the housing 14.5-304 cannot rotate relative to the adjustable headband 14.5-126.

In one example, the dial cap 14.5-302 includes a center cap 14.5-306 and a wheel 14.5-308 (also referred to as a tire or the like). The wheel 14.5-308 can be configured to be rotated by a user in order to spool the headband tensioning cable 14.5-132 into the tensioning system 14.5-300 or unspool the headband tensioning cable 14.5-132 from the tensioning system 14.5-300. The wheel 14.5-308 rotates around a central axis of the center cap 14.5-306. The center cap 14.5-306 and the housing 14.5-304 can be fixed to one another such that the center cap 14.5-306 does not rotate relative to the housing 14.5-304. As such, the wheel 14.5-308 can be rotatable relative to the center cap 14.5-306 and the housing 14.5-304.

As will be discussed in more detail below, the housing 14.5-304 can be configured to contain a spool within the housing 14.5-304. The housing 14.5-304 includes a cable opening 14.5-310. The headband tensioning cable 14.5-132 extends through the cable opening 14.5-310 into the housing 14.5-304 and is fixed to the spool. The headband tensioning cable 14.5-132 moves through the cable opening 14.5-310 as the headband tensioning cable 14.5-132 is spooled into or unspooled from the tensioning system 14.5-300, such as by rotating the wheel 14.5-308 of the dial cap 14.5-302.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system described herein, can apply not only to the specific examples discussed herein, but to any number of examples in any combination. Examples of a configuration of the various components of the tensioning system relative to one another are described below, with reference to FIG. 14.5-4.

FIG. 14.5-4 illustrates a partially exploded view of a tensioning system 14.5-300. The tensioning system 14.5-300 includes a headband tensioning cable 14.5-132, a dial cap 14.5-302, a housing 14.5-304, a cam wheel 14.5-312, rollers 14.5-314, a spool 14.5-316, and a cap post 14.5-318.

The dial cap 14.5-302 and the housing 14.5-304 can be substantially similar to, and can include some or all of, the features of the dial cap 14.5-302 and the housing 14.5-304 discussed above with respect to FIG. 14.5-3.

The housing 14.5-304 can include a housing post 14.5-322. The housing post 14.5-322 can be disposed centrally in the housing 14.5-304. The housing 14.5-304 can further include an outer wall 14.5-320 in which a cable opening 14.5-310 is disposed.

In at least one example, the spool 14.5-316 is configured to sit in the housing 14.5-304 between the outer wall 14.5-320 and the housing post 14.5-322. The spool 14.5-316 can include a hollow central portion 14.5-330, which surrounds the housing post 14.5-322. The spool 14.5-316 can be configured to rotate around the housing post 14.5-322 while the headband tensioning cable 14.5-132 is spooled into or unspooled from the tensioning system 14.5-300. The spool 14.5-316 includes a cable opening 14.5-334, into which the headband tensioning cable 14.5-132 extends. The headband tensioning cable 14.5-132 can be retained or fixed within the cable opening 14.5-334 of the spool 14.5-316. The spool 14.5-316 includes a barrel 14.5-338 around which the headband tensioning cable 14.5-132 is wound, and flanges 14.5-336, which prevent the headband tensioning cable 14.5-132 from being wound around or into other portions of the tensioning system 14.5-300 or otherwise escaping the spool 14.5-316. The spool 14.5-316 further includes protrusions 14.5-332, which allow the spool 14.5-316 to interface with and be rotatably coupled to the cam wheel 14.5-312.

The cam wheel 14.5-312 and the rollers 14.5-314 are used to transfer rotation between the dial cap 14.5-302 and the spool 14.5-316. The cam wheel 14.5-312 can be configured to rotate the spool 14.5-316 in response to a user rotating the wheel 14.5-308 in either direction. The cam wheel 14.5-312 and the rollers 14.5-314 can be configured to allow the headband tensioning cable 14.5-132 to be spooled into the tensioning system 14.5-300 by pushing the headband tensioning cable 14.5-132 into the housing 14.5-304 (e.g., without a user rotating the wheel 14.5-308). The cam wheel 14.5-312 and the rollers 14.5-314 can be configured not to allow the cable to be unspooled from of the tensioning system 14.5-300 when the headband tensioning cable 14.5-132 is pulled. The cam wheel 14.5-312 and the rollers 14.5-314 are configured to resist torque in a first direction (e.g., a direction in which the headband tensioning cable 14.5-132 is unspooled from the tensioning system 14.5-300) and allow torque in a second direction (e.g., a direction in which the headband tensioning cable 14.5-132 is spooled into the tensioning system 14.5-300). Details of the cam wheel 14.5-312 and the rollers 14.5-314 are discussed below with respect to FIG. 14.5-5. The cam wheel 14.5-312 can include protrusions 14.5-340, which interact with the protrusions 14.5-332 of the spool 14.5-316 to transfer rotation between the spool 14.5-316 and the cam wheel 14.5-312. The cam wheel 14.5-312 includes an opening 14.5-342 and is configured to sit on top of the spool 14.5-316 between the spool 14.5-316 and the dial cap 14.5-302.

The cap post 14.5-318 can be disposed in a post opening 14.5-324 in the housing 14.5-304. The cap post 14.5-318 can be fixed to the housing 14.5-304, such that the cap post 14.5-318 is in a fixed position. In some examples, the cap post 14.5-318 can be fixed to the housing 14.5-304 through an adhesive, a fastener, or the like. In some examples, the cap post 14.5-318 can have a semi-circular cross-sectional shape. The cap post 14.5-318 can be configured to interface with a center cap post 14.5-307 of the center cap 14.5-306 to hold the center cap 14.5-306 in place in the housing 14.5-304. The cap post 14.5-318 can prevent the center cap 14.5-306 from rotating relative to the housing 14.5-304. The center cap post 14.5-307 can have a complementary cross-sectional shape to the cap post 14.5-318 (e.g., the center cap post 14.5-307 and the cap post 14.5-318 can each have semi-circular cross-sectional shapes). In some examples, the center cap post 14.5-307 can have a key-shape, and the cap post 14.5-318 can have a complementary key-hole shape.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system described herein, can apply not only to the specific examples discussed herein, but to any number of examples in any combination. Examples of an operation of the tensioning system are described below, with reference to FIG. 14.5-5.

FIG. 14.5-5 illustrates a partial cross-sectional view of a portion of a tensioning system 14.5-300. FIG. 14.5-5 illustrates the operation of a cam wheel 14.5-312 and rollers 14.5-314 included in the tensioning system 14.5-300, in accordance with some examples. The tensioning system 14.5-300 includes a housing 14.5-304, a spool 14.5-316 in the housing 14.5-304, and a wheel 14.5-308. The wheel 14.5-308 can include an external portion 14.5-308A and an internal portion 14.5-308B. The external portion 14.5-308A is configured to be interacted with by a user. The external portion 14.5-308A can include ridges, bumps, grooves, or other features, which can be used by a user to grip the external portion. The external portion 14.5-308A can be formed of a relatively soft material, such as a rubber, a polymer, or the like. The internal portion 14.5-308B can include protrusions 14.5-308B, which are configured to interact with the rollers 14.5-314 and the cam wheel 14.5-312. The internal portion 14.5-308B can also be used to connect the external portion 14.5-308A to other structures of the tensioning system 14.5-300. In some examples, the internal portion 14.5-308B can include posts, and the external portion 14.5-308A can include corresponding holes in which the posts are inserted to fix the internal portion 14.5-308B and the external portion 14.5-308A to one another. In some examples, an adhesive can be disposed between the internal portion 14.5-308B and the external portion 14.5-308A to fix the internal portion 14.5-308B and the external portion 14.5-308A to one another.

The wheel 14.5-312 can include a protrusion 14.5-342, which is configured to interface with the spool 14.5-316. For example, as illustrated in FIG. 14.5-5, the spool 14.5-316 can include an opening 14.5-343, which has a complementary shape to the protrusion 14.5-342. This allows for the spool 14.5-316 and the wheel 14.5-312 to be rotationally coupled to one another. A cap post 14.5-318 is disposed in an opening in the housing 14.5-304. The cap post 14.5-318 can be adhered to the housing 14.5-304. The housing 14.5-304 can be physically coupled to a center cap post 14.5-307 of a center cap by a protrusion 14.5-319 of the center cap post 14.5-307. The center cap post 14.5-307, including the protrusion 14.5-319, and the cap post 14.5-318 can have complementary shapes, such that the center cap post 14.5-307 is physically coupled to (e.g., rotationally coupled to) the cap post 14.5-318 by the protrusion 14.5-319. For example, the protrusion 14.5-319 and the center cap post 14.5-307 can have a key shape, and the cap post 14.5-318 can have a complementary key-hole shape, as illustrated in FIG. 14.5-5.

The housing 14.5-304 can include a main body portion 14.5-304A and an inner ring 14.5-304B. The inner ring 14.5-304B can be configured to interact with the rollers 14.5-314, and can be formed of a relatively hard material, such as metals (e.g., stainless steel, such SAE 304 stainless steel, 420 stainless steel, or the like; aluminum, brass, or any other suitable metals), high-hardness polymers, other polymers, plastics, or the like. The main body portion 14.5-304A can be formed of a relatively soft material, such as polymers, plastics, or the like. The spool 14.5-316 can be formed of a relatively soft material, such as polymers, plastics, or the like. The inner ring 14.5-304B can be fixed to the main body portion 14.5-304A through an adhesive, fasteners, or the like.

The cam wheel 14.5-312 can include roller openings 14.5-313, in which the rollers 14.5-314 and the protrusions 14.5-308B are disposed. The roller openings 14.5-313 are configured to interact with the rollers 14.5-314 and the protrusions 14.5-308B to lock and unlock the cam wheel 14.5-312 and the housing 14.5-304 together. Specifically, the cam wheel 14.5-312 and the housing 14.5-304 can be locked together when the rollers 14.5-314 are wedged between the cam wheel 14.5-312 and the housing 14.5-304. This system can be referred to as a roller-and-wedge system or a roller-and-wedge clutch. The roller openings 14.5-313 include ramped surfaces 14.5-340 that are inclined relative to the inner ring 14.5-304B of the housing 14.5-304 at a cam angle 14.5-θ. Specifically, the cam angle 14.5-θ for each ramped surface 14.5-340 defining a respective roller opening 14.5-313 can be measured between the respective ramped surface 14.5-340 and a line tangential to a point on the inner ring 14.5-304B of the housing 14.5-304 in contact with a roller 14.5-314 in the respective roller opening 14.5-313. The cam angle 14.5-θ can be in a range from about 5° to about 30°.

In at least one example, tension from the cable can supply a force to the cam wheel 14.5-312 through the spool 14.5-316, which causes the cam wheel to rotate in a third direction 14.5-354 (e.g., a counterclockwise direction). When the cam wheel 14.5-312 rotates in third direction 14.5-354 as a result of the tension in the cable 14.5-132, the rollers 14.5-314 move in a fourth direction 14.5-356 (e.g., a clockwise direction) up the ramped surfaces 14.5-340, and are wedged between the protrusions 14.5-308B of the internal portion 14.5-308B of the wheel 14.5-308 and the ramped surfaces 14.5-344 of the cam wheel 14.5-312 defining the roller openings 14.5-313. The wedged rollers 14.5-314 lock the cam wheel 14.5-312 and the housing 14.5-304 together due to friction being present between the cam wheel 14.5-312, the inner ring 14.5-304B of the housing 14.5-304, and the wedged rollers 14.5-314, and prevents the cable 14.5-132 from rotating the spool 14.5-316 in the third direction 14.5-354. When the cable is pushed into the tensioning system 14.5-300, the cam wheel 14.5-312 and the housing 14.5-304 are unlocked from one another. Specifically, when the cable 14.5-132 is pushed into the tensioning system 14.5-300, the cam wheel 14.5-312 rotates in a direction opposite the third direction 14.5-354, the rollers 14.5-314 are un-wedged and roll down the ramped surfaces 14.5-344 in a direction opposite the fourth direction 14.5-356, and the spool 14.5-316 is free to rotate such that the cable 14.5-132 wraps around the spool 14.5-316.

In some examples, the cam wheel 14.5-312, the rollers 14.5-314, and the inner ring 14.5-304B of the housing 14.5-304 can be formed of materials such as metals (e.g., stainless steel, such SAE 304 stainless steel, 420 stainless steel, or the like; aluminum, brass, or any other suitable metals), high-hardness polymers, other polymers, plastics, or the like. In some examples, one or more of the cam wheel 14.5-312, the rollers 14.5-314, and the inner ring 14.5-304B can be coated or plated with a material to increase the hardness of the cam wheel 14.5-312, the rollers 14.5-314, and/or the inner ring 14.5-304B. In some examples, the rollers 14.5-314 can be formed of materials having a higher hardness than materials of the cam wheel 14.5-312 and the inner ring 14.5-304B. For example, the cam wheel 14.5-312, the rollers 14.5-314, and the inner ring 14.5-304B can be formed of 14.5-304 stainless steel, with a coating being applied to the rollers 14.5-314 to increase the hardness of the rollers 14.5-314 relative to the cam wheel 14.5-312 and the inner ring 14.5-304B.

The cam angle 14.5-θ can be selected based on friction resulting from the materials selected for the cam wheel 14.5-312, the inner ring 14.5-304B of the housing 14.5-304, and the rollers 14.5-314; the scale of the tensioning system 14.5-300; and clearances and tolerances required for the tensioning system; among other factors. Providing a smaller cam angle 14.5-θ allows the cam wheel 14.5-312 and the rollers 14.5-314 to lock with less friction being present between the cam wheel 14.5-312, the inner ring 14.5-304B of the housing 14.5-304, and the rollers 14.5-314. Providing too large of a cam angle 14.5-θ can allow for slipping between the cam wheel 14.5-312 and the housing 14.5-304, such that the cam wheel 14.5-312 and the housing 14.5-304 are not sufficiently locked. Providing a smaller cam angle 14.5-θ requires more space for the rollers 14.5-314 to move in order to lock the cam wheel 14.5-312 and the housing 14.5-304, which requires larger tolerances and clearances. This results in a larger dead zone between movement of the cable 14.5-132 before the cam wheel 14.5-312 and the housing 14.5-304 lock, and in movement of the wheel 14.5-308 before the spool 14.5-316 spools or unspools the cable. The dead zone (also referred to as a roller travel) can be a distance or an angular distance 14.5-$D_1$ between a center of the rollers 14.5-314 in the locked position and the unlocked position, and can be in a range from about 0.5 mm to about 8 mm, or in a range from about 5° and about 30°, respectively. A smaller cam angle 14.5-θ results in higher normal forces, which requires more force to be used to remove the rollers 14.5-314 from between the cam wheel 14.5-312 and the inner ring 14.5-304B when the cam wheel 14.5-312 and the housing 14.5-304 are locked. Providing the cam angle 14.5-θ in the prescribed range allows for the cam wheel 14.5-312 and the housing 14.5-304 to be locked without slipping, while a minimal dead zone is present and minimal force is required to rotate the wheel 14.5-308.

Although six protrusions 14.5-308B, six rollers 14.5-314, and six roller openings 14.5-313 are illustrated in FIG. 14.5-5, any number of the protrusions 14.5-308B, the rollers 14.5-314, and the roller openings 14.5-313 can be provided. Providing larger numbers of the protrusions 14.5-308B, the rollers 14.5-314, and the roller openings 14.5-313 can increase strength, while also increasing complexity, size, and cost. Providing smaller numbers of the protrusions 14.5-308B, the rollers 14.5-314, and the roller openings 14.5-313 can decrease strength, complexity, size, and cost.

FIG. 14.5-5 illustrates all of the protrusions 14.5-308B, the rollers 14.5-314, and the roller openings 14.5-313 facing in the same direction with respect to an axis of rotation. In some examples, half or another percentage of the protrusions 14.5-308B, the rollers 14.5-314, and the roller openings 14.5-313 can face in opposite directions with respect to the axis of rotation. This allows for the tensioning system 14.5-300 to be locked in both directions, rather than a single direction. In examples in which the protrusions 14.5-308B, the rollers 14.5-314, and the roller openings 14.5-313 face opposite directions with respect to the axis of rotation, the wheel 14.5-308 can be used to spool the cable into the spool 14.5-316 and out of the spool 14.5-316.

The wheel 14.5-308 can be rotated in a first direction 14.5-350 (e.g., a clockwise direction) around a center cap post 14.5-307 of a center cap 14.5-306 (illustrated in FIG. 14.5-4) and the housing 14.5-304 and a second direction 14.5-352 (e.g., a counterclockwise direction) opposite the first direction 14.5-350 around the center cap post 14.5-307 and the housing 14.5-304. Rotating the wheel 14.5-308 in the first direction 14.5-350 can spool a cable onto the spool 14.5-316, adding tension to the cable. In other words, rotating the wheel 14.5-308 in the first direction 14.5-350 wraps the cable onto the spool 14.5-316 in order to tighten the cable. Rotating the wheel 14.5-308 in the second direction 14.5-352 can unspool the cable from the spool 14.5-316, reducing tension in the cable. In other words, rotating the wheel 14.5-308 in the second direction 14.5-352 unwraps the cable from the spool 14.5-316 in order to loosen the cable.

Rotating the wheel 14.5-308 in the first direction 14.5-350 or the second direction 14.5-352 unlocks the cam wheel 14.5-312 and the housing 14.5-304, and allows the cable to be spooled into the tensioning system 14.5-300 or out of the tensioning system 14.5-300. For example, when the wheel 14.5-308 is rotated in the first direction 14.5-350, the rollers 14.5-314 roll down the ramped surfaces 14.5-344 and the tensioning system 14.5-300 is unlocked. When the wheel 14.5-308 is rotated in the second direction 14.5-352, the protrusions 14.5-308B push the rollers 14.5-314 down the ramped surfaces and the tensioning system 14.5-300 is unlocked. This allows the wheel 14.5-308 to rotate in either direction in order to increase or decrease tension on the cable.

The tensioning system 14.5-300, which includes the rollers 14.5-314 and the cam wheel 14.5-312, can be locked in either direction or both directions. In contrast to conventional systems, which can use spring-driven pawls, ratcheting systems, or the like, the tensioning system 14.5-300 uses the rollers 14.5-314, which roll within the roller openings 14.5-313 to lock and unlock the tensioning system 14.5-300. This is a silent or relatively silent system. The tensioning system 14.5-300 can be locked in one or both directions, and is thus non-back-drivable. In other words, the cable can be pushed into the tensioning system 14.5-300, but cannot be pulled from the tensioning system 14.5-300 without using the wheel 14.5-308. This allows for the cable to be spooled into the tensioning system 14.5-300 and for the tensioning system 14.5-300 to hold tension in the cable.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system described herein, can apply not only to the specific examples discussed herein, but to any number of examples in any combination. Examples of a configuration of the various components of a dial cap included in the tensioning system relative to one another, and a configuration of an angular restraint are described below, with reference to FIG. 14.5-6.

FIG. 14.5-6 illustrates a partially exploded view of dial cap 14.5-302 and a perspective view of a cam wheel 14.5-312. The dial cap 14.5-302 includes a center cap 14.5-306, a center cap post 14.5-307, a wheel 14.5-308 including an external portion 14.5-308A and an internal portion 14.5-308B, a wheel adhesive 14.5-360, and a clamp ring 14.5-364. The center cap 14.5-306, the center cap post 14.5-307, the wheel 14.5-308, and the cam wheel 14.5-312 can be substantially similar to, and can include some or all of, the features of the center cap 14.5-306, the center cap post 14.5-307, the wheel 14.5-308, and the cam wheel 14.5-312, respectively, discussed above with respect to FIGS. 14.5-3 through 14.5-5.

As discussed previously, a user can interact with the external portion 14.5-308A of the wheel 14.5-308 to turn the wheel 14.5-308 and wind or unwind a cable in a tensioning system to tighten or loosen the cable. The internal portion 14.5-308B of the wheel 14.5-308 can include protrusions 14.5-308B. The protrusions 14.5-308B can be used to interact with rollers and the cam wheel 14.5-312 to lock and unlock the cam wheel 14.5-312 and a housing of the tensioning system. The wheel adhesive 14.5-360 and the clamp ring 14.5-364 can be used to fasten the inner portion 14.5-308B to the external portion 14.5-308A of the wheel 14.5-308.

The example of FIG. 14.5-6 includes a disc-type angular stop mechanism. Specifically, in the example of FIG. 14.5-6, a first disc 14.5-351 and a second disc 14.5-355 are included, which provide angular stops for the dial cap 14.5-302. The first disc 14.5-351 and the second disc 14.5-355 can be mounted on the center cap post 14.5-307 by a clip 14.5-358. The first disc 14.5-351 and the second disc 14.5-355 can be fastened on the center cap post 14.5-307 by any method, which allows the first disc 14.5-351 and the second disc 14.5-355 to rotate around the center cap post 14.5-307. For example, the first disc 14.5-351 and the second disc 14.5-355 can be fastened on the center cap post 14.5-307 by a pin, a clip, another fastener, or the like. The center cap 14.5-306 can include a protrusion 14.5-309, which provides an angular stop for the first disc 14.5-351.

The first disc 14.5-351 can include a first protrusion 14.5-352A, which interacts with a first side of the protrusion 14.5-309 to stop angular rotation of the first disc 14.5-351 in a first direction, or interacts with a second side of the protrusion 14.5-309 opposite the first side to stop angular rotation of the first disc 14.5-351 in a second direction opposite the first direction. The first disc 14.5-351 includes a second protrusion (such as the second protrusion 14.5-350B, discussed below with respect to FIGS. 14.5-7A and 14.5-7B) opposite the first protrusion, which interacts with the second disc 14.5-355. The second disc 14.5-355 interacts with a protrusion 14.5-359 on the cam wheel 14.5-312. The cam wheel 14.5-312 can rotate freely until the protrusion 14.5-359 interacts with a first protrusion 14.5-356A on the second disc 14.5-355. The cam wheel 14.5-312 and the second disc 14.5-355 can then rotate freely until a second protrusion (such as the second protrusion 14.5-356B, discussed below with respect to FIG. 14.5-7B) of the second disc 14.5-355 interacts with the second protrusion of the first disc 14.5-351. The cam wheel 14.5-312, the second disc 14.5-355, and the first disc 14.5-351 can then rotate freely until the first protrusion 14.5-352A of the first disc 14.5-351 interacts with the protrusion 14.5-309 of the center cap 14.5-306. When the first protrusion 14.5-352A of the first disc 14.5-351 interacts with the protrusion 14.5-309 of the center cap 14.5-306, the protrusion 14.5-309 provides an angular stop, which prevents the first disc 14.5-351, the second disc 14.5-355, and the cam wheel 14.5-312 from turning in one direction, but allows the first disc 14.5-351, the second disc 14.5-355, and the cam wheel 14.5-312 to turn in the opposite direction. This prevents a user from over-spooling a tensioning system (e.g., spooling more cable into a housing of the tensioning system than the housing is configured to hold), or from loosening the tensioning system too much such that the tensioning system winds the cable into the housing in the wrong direction.

Each of the first disc 14.5-351 and the second disc 14.5-355 can allow for roughly 360 degrees of rotation and the cam wheel 14.5-312 can allow for an additional roughly 360 degrees of rotation. Specifically, each of the first disc 14.5-351 and the second disc 14.5-355 can allow for 360 degrees of rotation minus the angular width of the protrusions included in the first disc 14.5-351, the second disc 14.5-355, the center cap 14.5-306, and the cam wheel 14.5-312. Including a larger number of discs in the angular stop increases the angular rotation allowed by the angular stop, while decreasing the number of discs in the angular stop decreases the angular rotation allowed by the angular stop. The first disc 14.5-351 and the second disc 14.5-355 can be formed of a relatively hard material, such as metals (e.g., stainless steel, such SAE 304 stainless steel, 420 stainless steel, or the like; aluminum, brass, or any other suitable metals), high-hardness polymers, other polymers, plastics, or the like. Including the first disc 14.5-351 and the second disc 14.5-355 in the angular stop and forming the first disc 14.5-351 and the second disc 14.5-355 of relatively hard materials provides a strong, robust angular stop, which is difficult for a user to damage.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system and an angular restraint described herein, can apply not only to the specific examples discussed herein, but to any number of examples in any combination. Examples of a configuration and operation of a disc-type angular restraint included in the tensioning system are described below, with reference to FIGS. 14.5-7A and 14.5-7B.

FIGS. 14.5-7A and 14.5-7B illustrate plan views of a center cap 14.5-306, a first disc 14.5-351, a second disc 14.5-355, and a cam wheel 14.5-312. FIGS. 14.5-7A and 14.5-7B illustrate additional details of the disc-type angular stop mechanism of the example illustrated in FIG. 14.5-6. The center cap 14.5-306, the first disc 14.5-351, the second disc 14.5-355, and the cam wheel 14.5-312 can be substantially similar to, and can include some or all of, the features of the center cap 14.5-306, the first disc 14.5-351, the second disc 14.5-355, and the cam wheel 14.5-312, respectively, discussed above with respect to FIG. 14.5-6.

As illustrated in FIG. 14.5-7A, the first disc 14.5-351 can sit in a channel 14.5-311 of the center cap 14.5-306. The first disc 14.5-351 is free to rotate in the channel 14.5-311, but is stopped by the first protrusion 14.5-352A of the first disc 14.5-351 contacting either side of the protrusion 14.5-309 of the center cap 14.5-306. The first disc 14.5-351 can rotate 360 degrees relative to the center cap 14.5-306, minus the angular widths of the protrusion 14.5-309 and the first protrusion 14.5-352A. The first disc 14.5-351 further includes a second protrusion 14.5-352B opposite the first protrusion 14.5-352A, which interacts with the second disc 14.5-355, illustrated in FIG. 14.5-7B.

As illustrated in FIG. 14.5-7B, the second disc 14.5-355 sits on the first disc 14.5-351. The second protrusion 14.5-352B of the first disc 14.5-351 can sit in a channel 14.5-353 of the second disc 14.5-355, which includes a second protrusion 14.5-356B opposite the first protrusion 14.5-356A. The second disc 14.5-355 is free to rotate, and begins to rotate the first disc 14.5-351 when the second protrusion 14.5-356B of the second disc 14.5-355 contacts either side of the second protrusion 14.5-352B of the first disc 14.5-351. The second disc 14.5-355 can rotate 360 degrees relative to the first disc 14.5-351, minus the angular widths of the second protrusion 14.5-352B and the second protrusion 14.5-356B.

In at least one example, the cam wheel 14.5-312 sits on the second disc 14.5-355. The cam wheel 14.5-312 can include a channel in which the second disc 14.5-355 is disposed, and the protrusion 14.5-359 of the cam wheel 14.5-312 and the first protrusion 14.5-356A of the second disc 14.5-355 can be disposed in the channel of the cam wheel 14.5-312. The cam wheel 14.5-312 is free to rotate, and begins to rotate the second disc 14.5-355 when the protrusion 14.5-359 of the cam wheel 14.5-312 contacts either side of the first protrusion 14.5-356A of the second disc 14.5-355. The cam wheel 14.5-312 can rotate 360 degrees relative to the second disc 14.5-355, minus the angular widths of the protrusion 14.5-359 and the first protrusion 14.5-356A. Although the protrusion 14.5-359 has been discussed as being disposed on the cam wheel 14.5-312, the protrusion 14.5-359 can be located on any of the parts that rotate relative to the housing and the center cap 14.5-306, such as on the spool, the wheel, or the like.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system and an angular restraint described herein, can apply not only to the specific examples discussed herein, but to any number of examples in any combination. Examples of a configuration and operation of a dial cap including a ball detent mechanism that can be included in the tensioning system are described below, with reference to FIG. 14.5-8.

FIG. 14.5-8 illustrates a partial cross-sectional view of a dial cap 14.5-302. The dial cap 14.5-302 includes a center cap 14.5-306, a wheel 14.5-308, and a ball detent mechanism. The center cap 14.5-306 and the wheel 14.5-308 can be substantially similar to, and can include some or all of, the features of the center cap 14.5-306 and the wheel 14.5-308, respectively, discussed above with respect to FIGS. 14.5-3 through 14.5-6. The ball detent mechanism includes a ball 14.5-370, a detent spring 14.5-372, springs 14.5-374, and a grooved surface 14.5-376 in the wheel 14.5-308. The ball 14.5-370, the detent spring 14.5-372, and the springs 14.5-374 can be contained within protrusions 14.5-315 of the center cap 14.5-306. As described previously, the wheel 14.5-308 can rotate relative to the center cap 14.5-306. As the wheel 14.5-308 rotates, the springs 14.5-374 push the detent spring 14.5-372, which pushes the ball 14.5-370 into the grooves of the grooved surface 14.5-376 in the wheel 14.5-308. The ball detent mechanism generates both a clicking sound and a clicking feel as wheel 14.5-308 turns and the ball 14.5-370 moves between adjacent grooves of the grooved surface 14.5-376. Because the locking mechanism provided by the rollers and the cam wheel is silent, the ball detent mechanism can be included in a tensioning system in order to provide a desired user experience that includes a clicking feel and sound when the wheel 14.5-308 is rotated.

Any number or variety of components in any of the configurations described herein can be included in the tensioning system and the electronic device. The components can include any combination of the features described herein and can be arranged in any of the various configurations described herein. The structure and arrangement of components of a tensioning system having a roller-and-wedge locking system and an angular restraint described herein, can apply not only to the specific examples discussed herein, but to any number of examples in any combination. Examples of configurations and operations of various angular restraints that can be included in the tensioning system are described below, with reference to FIGS. 14.5-9A through 14.5-9C.

FIGS. 14.5-9A through 14.5-9C illustrate various angular stop mechanisms, which can be used in place of or in addition to the disc-type angular stop mechanism of FIGS. 14.5-6 through 14.5-7B. In the example of FIG. 14.5-9A, a cable-type angular stop mechanism is illustrated. A cable 14.5-380 can be provided and attached to a center cap 14.5-306 and a cam wheel 14.5-312. The cable 14.5-380 can be attached to the center cap 14.5-306 and the cam wheel 14.5-312 using an adhesive or the like. The cable 14.5-380 can be provided such that the cable 14.5-380 wraps around a center cap post 14.5-307 of the center cap 14.5-306 as the cam wheel 14.5-312 is rotated relative to the center cap 14.5-306. Once the cable 14.5-380 is wrapped tightly around the center cap post 14.5-307, the cable 14.5-380 prevents the cam wheel 14.5-312 from rotating relative to the center cap 14.5-306, while allowing the cam wheel 14.5-312 to rotate in the opposite direction. The cable 14.5-380 can be a cheap method for providing an angular stop mechanism for the tensioning system. This prevents a user from over-spooling a tensioning system (e.g., spooling more cable into a housing of the tensioning system than the housing is configured to hold), or from loosening the tensioning system too much such that the tensioning system winds cable into the housing in the wrong direction. Although the cable 14.5-380 has been discussed as being attached to the center cap 14.5-306 and the cam wheel 14.5-312, the cable 14.5-380 can be attached to any components of the tensioning system that are desired to include an angular stop. For example, the cable 14.5-380 can be attached to the center cap 14.5-306 and a spool of the tensioning system, a wheel of the tensioning system, or the like. In some examples, the cable 14.5-380 can be attached to a housing of the tensioning system and the cam wheel 14.5-312, the housing and the spool, the housing and the wheel, or the like.

In the example of FIG. 14.5-9B, a screw-type angular stop mechanism is illustrated. A helical ridge 14.5-382 is formed on a center cap post 14.5-307 of a center cap 14.5-306 and a corresponding helical groove 14.5-384 is formed on a cam wheel 14.5-312. As the cam wheel 14.5-312 rotates relative to the center cap 14.5-306, the cam wheel 14.5-312 moves up or down the center post 14.5-307 of the center cap 14.5-306. Vertical stops can be included on the center cap post 14.5-307, which prevent the cam wheel 14.5-312 from rotating too far in either direction. This prevents a user from over-spooling a tensioning system (e.g., spooling more cable into a housing of the tensioning system than the housing is configured to hold), or from loosening the tensioning system too much such that the tensioning system winds cable into the housing in the wrong direction. Although the helical ridge 14.5-382 has been discussed as being disposed on the center cap post 14.5-307 of the center cap 14.5-306, the helical ridge 14.5-382 can be disposed on a portion of a housing of a tensioning system or the like. The helical groove 14.5-384 can be disposed on a spool of the tensioning system or the like.

In the example of FIG. 14.5-9C, a spiral-type angular stop mechanism is illustrated. A spiral 14.5-386 is formed in a center cap 14.5-306. A center cap post 14.5-307 of the center cap 14.5-306 can be formed adjacent the spiral 14.5-386. The spiral 14.5-386 can be a spiral-shaped groove formed in the center cap 14.5-306. The spiral 14.5-386 can interact with a protrusion 14.5-388 of a cam wheel 14.5-312. The protrusion 14.5-388 can be attached to the cam wheel 14.5-312 such that the protrusion can slide relative to the cam wheel 14.5-312. For example, the protrusion 14.5-388 can slide in a direction along a radius of the cam wheel 14.5-312. As the cam wheel 14.5-312 rotates relative to the center cap 14.5-306, the protrusion 14.5-388 slides relative to the cam wheel 14.5-312 along the radius of the cam wheel 14.5-312 closer to or further from a center of the cam wheel 14.5-312 depending on which direction the cam wheel 14.5-312 turns. When the protrusion 14.5-388 reaches either end of the spiral 14.5-386, the protrusion 14.5-388 and the spiral 14.5-386 prevent the cam wheel 14.5-312 from rotating relative to the center cap 14.5-306, while allowing the cam wheel 14.5-312 to rotate in the opposite direction. This prevents a user from over-spooling a tensioning system (e.g., spooling more cable into a housing of the tensioning system than the housing is configured to hold), or from loosening the tensioning system too much such that the tensioning system winds cable into the housing in the wrong direction. Although the spiral 14.5-386 has been discussed as being disposed on the center cap 14.5-306, the spiral 14.5-386 can be disposed on a portion of a housing of a tensioning system or the like. The protrusion 14.5-388 can be disposed on a spool of the tensioning system, a wheel of the tensioning system, or the like.

14.6: Two-Part Speaker System

The following disclosure relates to speaker assemblies for electronic devices. More specifically, the following disclosure describes a two-part speaker assembly having a single outlet port. Electronic devices typically include a housing that surrounds internal system components, such as audio speaker assemblies, circuitry, processing units, display elements, and other electronic components. However, as electronic devices become smaller and smaller the available space for such components is reduced. Further, it may be desirable to reduce the number of openings or ports visible on the electronic device. The speaker assembly described herein uniquely addresses the challenges that arise from reductions in available space, as well as aesthetic and performance requirements.

In a particular embodiment, an electronic device, such as a head-mounted device ("HMD"), can include a housing defining an internal volume. The housing can also define an opening that is in fluid communication with the internal volume of the housing and with the ambient environment. A speaker assembly or unit can be positioned within the internal volume of the electronic device. In some examples, the speaker assembly is positioned within a support of an HMD, such as within a support arm or support band positioned along a user's head. The speaker assembly can be positioned proximate a user's ear and can be oriented to direct sound in the direction of the user's ear.

In some examples, the speaker assembly can include a speaker pod or housing that is positioned within the electronic device. The speaker pod can house various components of the speaker assembly. The speaker pod can further define a port or outlet that is aligned with the opening of the electronic device. Thus, the port can be in fluid communication with an interior volume of the speaker pod and with the outside environment. The speaker assembly can include multiple audio transducers or speakers.

The speaker can include a diaphragm coupled to a magnetic component. The magnetic component can include gaps or grooves within which is disposed a wound coil, such as a copper coil or any conductive coil that is capable of being influenced by an electromagnetic field. In some examples, the coil is capable of generating or being influenced by a desired electromagnetic field. The diaphragm can be affixed to the coil. As pulses of electricity pass through the coil, the direction of its magnetic field is rapidly changed, resulting in alternating attraction and repulsion to the magnetic component, causing vibrations back and forth. The coil can be attached to the diaphragm which amplifies these vibrations, pumping sound waves into the surrounding air. Notably, despite having multiple audio transducers, the speaker assembly may include only one outlet or port.

In one example, the speaker assembly includes a first speaker, such as a woofer, that is positioned within the pod and is in fluid communication with a first channel. The woofer channel can include a winding, tortuous path to the outlet port. A second speaker, such as a tweeter, can also be positioned within the pod and can be in fluid communication with a second channel or tweeter channel. As described in greater detail below, the woofer channel and the tweeter channel can merge, converge, or combine into a shared channel that leads to the port.

In some examples, the tweeter can at least partially overlap the woofer, thereby reducing the footprint of the assembly along at least one major dimension. This can enable the speaker pod to better fit within an electronic device with space constraints. In some examples, the speaker assembly can include a port barrier positioned at the port. The port barrier can cover the port. The port barrier can include a woven mesh, a metallic screen defining an exterior of the electronic device, and a support frame to reinforce the woven mesh. Likewise, the speaker assembly can include a woofer mesh positioned in a channel leading to the woofer. The woofer mesh can have a higher density than the mesh of the port barrier. In some examples, the woofer mesh can have a lower density than the port barrier mesh. Thus, the speaker assembly can include multiple meshes.

A challenge that arises from a shared port system as described herein is potential interference of the tweeter from the acoustic waves or sound generated by the woofer. The woofer diaphragm is larger than the tweeter diaphragm, and can therefore negatively impact operation of the tweeter. Accordingly, in some examples, the speaker assembly can include a wall positioned between the tweeter and the woofer channel. The wall can shield the tweeter from the acoustic waves generated by the woofer. In some examples, the shielding wall can at least partially defining the one or more of the channels of the speaker assembly and can be shaped to direct the flow of the sound.

These and other embodiments are discussed below with reference to FIGS. 14.6-1 through 14.6-4. However, those skilled in the art will readily appreciate that the detailed description given herein with respect to these figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

It will further be understood that various directional indicators used herein (e.g., up, down, sideways, vertical, horizontal, top, bottom, above, below, etc.) are made in relation to the orientation of the figure at issue. For example, a vertical axis is to be understood as an axis extending from a top of the page to a bottom of the page.

FIGS. 14.6-1A through 14.6-1D illustrate various electronic devices that are capable of being used in conjunction with the speaker assembly described herein. The electronic devices can correspond to any form of a wearable electronic device, a portable media player, a media storage device, a portable digital assistant ("PDA"), a tablet computer, a computer, a mobile communication device, a GPS unit, a remote-control device, or any other electronic device. Specific examples of such devices are described below.

FIG. 14.6-1A illustrates an electronic device, such as a head-mounted device **14.6-100*a* positioned on a user's head 14.6-120. The head-mounted device can include a display device used for virtual or augmented reality simulations. The head-mounted device 14.6-100*a* can further relate to any form of computer glasses or smart glasses. The head-mounted device 14.6-100*a* can include a display 14.6-104 and a support 14.6-108, such as a headband or support arms. In some examples, the display 14.6-104** includes an opaque, translucent, transparent, or semi-transparent screen, including any number lenses, for presenting visual data.

The head-mounted device **14.6-100*a* can be worn on the user's head 14.6-120 such that the display 14.6-104 is positioned over the user's face and disposed over one or both of the user's eyes. The display 14.6-104 can be connected to the support 14.6-108. In some examples, the support 14.6-108 can be positioned against the side of a user's head 14.6-120 and in contact therewith. In some examples, the support 14.6-108 can be at least partially positioned above the user's ear or ears 14.6-124. In some examples, the support 14.6-108 can be positioned adjacent to the user's ear or ears 14.6-124. The support 14.6-108 can extend around the user's head 14.6-120. In this way, the display 14.6-104 and the support 14.6-108 can retain the head-mounted device 14.6-100*a* on the user's head 14.6-120. It should be understood, however, that this configuration is just one example of how the components of a modular head-mounted device 14.6-100*a*** can be arranged, and that in some examples, a different number of connector straps and/or retention bands can be included.

The head-mounted device **14.6-100*a* can include a frame or housing that houses various electrical components. Various components of the display 14.6-104 can be housed within the housing. For example, the hardware and electronics which allow functionality of the HMD can be housed within the housing. The housing can be defined by any portion of the support 14.6-108 and/or the display 14.6-104**.

In some examples, the head-mounted device **14.6-100*a* can include a speaker assembly 14.6-112. The speaker assembly 14.6-112 can be positioned in a housing of the head-mounted device 14.6-100*a*. For example, the speaker assembly 14.6-112 can be positioned in or on the support 14.6-108. The support 14.6-108 can define an opening 14.6-116 that is positioned proximate the speaker assembly 14.6-112 to permit passage of acoustic waves generated by the speaker assembly 14.6-112 to emit into the outside environment. In some examples, when the head-mounted device 14.6-100***a* is worn on the user's head 14.6-120, the speaker assembly 14.6-112 and the opening 14.6-116 are positioned proximate the user's ear 14.6-124. The support 14.6-108 and/or the opening 14.6-116 can be oriented such that sound can be directed toward the user's ear 14.6-124 when the user 14.6-120 is wearing the head-mounted device 14.6-100*a*. Further details regarding electronic devices capable of implementing a single port speaker system are described below with reference to FIG. 14.6-1B.

FIG. 14.6-1B illustrates an example in which the electronic device is a wearable device 14.6-100*b*. The wearable device 14.6-100*b* can be a watch, such as a smartwatch. The wearable device 14.6-100*b* of FIG. 14.6-1B is merely one representative example of a device that can be used in conjunction with the components and methods disclosed herein. In other words, the wearable device 14.6-100*b* is one non-limiting example of a device that can include a single port speaker assembly as described herein.

The wearable device 14.6-100*b* can include an enclosure or housing 14.6-103. The housing 14.6-103 can be connected to a front display 14.6-105 and can have a strap 14.6-109 designed to attach the wearable device 14.6-100*b* to a user, or to provide wearable functionality. The housing 14.6-103 can define a port 14.6-116 that is in fluid communication with a speaker assembly disposed within the housing 14.6-103. A number of input elements, such as a rotatable crown and/or a button 14.6-107 can be attached to and can protrude from the housing 14.6-103. The housing 14.6-103 can define a single speaker port 14.6-116 that can be integrally formed in and defined by the housing 14.6-103.

In some examples, the wearable device 14.6-100*b* can include a speaker assembly (not shown in FIG. 14.6-1B). The speaker assembly can be positioned in the housing 14.6-103 of the wearable device 14.6-100*b*. The housing 14.6-103 can define the port 14.6-116 that is positioned in relation to the speaker assembly 14.6-112 to permit passage of acoustic waves generated by the speaker assembly to emit into the outside environment. In some examples, when the wearable device 14.6-100*b* is worn by a user, the port 14.6-116 is positioned or oriented to be directed toward the user's ear 14.6-124. The port 14.6-116 can be positioned such that sound can be directed toward the user's ear when the user is wearing the wearable device 14.6-100*b*. Further details regarding electronic devices capable of implementing a single port speaker system are described below with reference to FIG. 14.6-1C.

FIG. 14.6-1C illustrates an example in which the electronic device is a computer 14.6-100*c*, such as a laptop or desktop. The computer 14.6-100*c* of FIG. 14.6-1C is merely one representative example of a device that can be used in conjunction with the components and methods disclosed herein. Specifically, the computer 14.6-100*c* is one representative example of a device that can include a single port speaker assembly as described herein.

The computer 14.6-100*c* can include an enclosure or housing 14.6-111. The housing 14.6-111 can be connected to a display 14.6-113. The housing 14.6-111 can define a port 14.6-116 that is in fluid communication with a speaker assembly housed within the housing 14.6-111. A number of input members 14.6-115, such as a keyboard, can be attached to and can protrude from the housing 14.6-111.

The housing 14.6-111 can substantially define an internal volume and at least a portion of an exterior surface of the computer 14.6-100*c*. The display 14.6-113 can include a touch sensitive surface, such as a touchscreen. The display 14.6-113 can define an exterior surface of the computer 14.6-100*c*.

The housing 14.6-111 can also include features, such as such as button apertures or charging port apertures. In some examples, the housing 14.6-111 defines only a single speaker port 14.6-116 by the process described herein. The speaker port 14.6-116 can be integrally formed in and defined by the housing 14.6-111.

In some examples, the computer 14.6-100*c* can include a speaker assembly (not shown in FIG. 14.6-1C). The speaker assembly can be positioned in the internal volume of housing 14.6-111 of the computer 14.6-100*c*. The housing 14.6-111 can define the port 14.6-116 that is positioned in relation to the speaker assembly to permit passage of acoustic waves generated by the speaker assembly to emit into the outside environment. The port 14.6-116 can be positioned such that sound can be directed toward the user's ear when the user is using the computer 14.6-100*c*. Further details regarding electronic devices capable of implementing a single port speaker system are described below with reference to FIG. 14.6-1D.

FIG. 14.6-1D illustrates an example in which the electronic device is a mobile device 14.6-100*d*, such as a smartphone or tablet computer. The mobile device 14.6-100*d* of FIG. 14.6-1D is merely one representative example of a device that can be used in conjunction with the components and methods disclosed herein. Specifically, the mobile device 14.6-100*d* is merely one representative example of a device that can include a single port speaker assembly as described herein.

The mobile device 14.6-100*d* can include an enclosure or housing 14.6-117. The housing 14.6-117 can be connected to a display 14.6-119. The housing 14.6-117 can define a port 14.6-116 that is in fluid communication with a speaker assembly disposed within the housing 14.6-117.

The housing 14.6-117 can substantially define at least a portion of an exterior surface of the mobile device 14.6-100*d*. The display 14.6-119 can include a touch sensitive surface, such as a touchscreen. The display 14.6-119 can define an exterior surface of the mobile device 14.6-100*d*.

The housing 14.6-117 can also include features, such as such as button apertures or charging port apertures. In some examples, the housing 14.6-117 defines only a single speaker port 14.6-116 by the process described herein. The speaker port 14.6-116 can be integrally formed in the housing 14.6-117.

In some examples, the mobile device 14.6-100*d* can include a speaker assembly (not shown in FIG. 14.6-1C). The speaker assembly can be positioned in the housing 14.6-117 of the mobile device 14.6-100*d*. The housing 14.6-117 can define the port 14.6-116 that is positioned in relation to the speaker assembly 14.6-112 to permit passage of acoustic waves generated by the speaker assembly to emit into the outside environment. The port 14.6-116 can be positioned such that sound can be directed toward the user's ear when the user is using the mobile device 14.6-100*d*. Further details regarding speaker assemblies are described below with reference to FIG. 14.6-2.

FIG. 14.6-2 shows a schematic view of an electronic device 14.6-200 that includes a speaker assembly 14.6-212. The electronic device 14.6-200 can be substantially similar to, and can include some or all of the features of the electronic devices described herein, such as the head-mounted device 14.6-100*a*, the wearable device 14.6-100*b*, the computer 14.6-100*c*, and the mobile device 14.6-100*d*.

The electronic device 14.6-200 can define an interior volume 14.6-201 to house electronic components. The speaker assembly 14.6-212 can be positioned within the internal volume 14.6-201. In some examples, an entirety of the speaker assembly 14.6-212 is positioned within the internal volume 14.6-201. The electronic device 14.6-200 can define an aperture or opening 14.6-216*a* that is in fluid communication with the ambient environment and the speaker assembly 14.6-212.

The speaker assembly 14.6-212 can include a pod 14.6-213, which can otherwise be referred to as a speaker assembly housing or enclosure, which defines an internal volume 14.6-215 of the speaker assembly. The pod 14.6-213 can house various electrical and acoustic components. The speaker assembly 14.6-212 can include various acoustic components, such as audio transducers, woofers, tweeters, midrange drivers and any other types of drivers or speaker components.

In some examples, the speaker pod 14.6-213 includes a woofer 14.6-230 and a tweeter 14.6-234. The woofer 14.6-230 (also known as a bass speaker or a loudspeaker driver) can be designed to produce low frequency sounds. The woofer 14.6-230 can be an electrodynamic driver. In some examples, the woofer 14.6-230 can produce sound from about 50 Hz to about 2000 Hz.

The speaker assembly 14.6-212 can include a tweeter 14.6-234. The tweeter 14.6-234 can also be referred to as a treble speaker or loudspeaker. The tweeter 14.6-234 can be a speaker driver that produces acoustic output at a high frequency range or a range of frequencies higher than the range of frequencies output by the woofer. In some examples, the tweeter 14.6-234 produces sound from about 2 kHz to about 20 kHz. In some examples, the tweeter 14.6-234 can produce sound up to about 100 kHz. The tweeter 14.6-234 can be positioned to be proximate an opening, outlet, or port 14.6-216*b* in the speaker pod 14.6-213 that leads to the ambient environment. The port 14.6-216*b* can be aligned with or in fluid communication with the opening 14.6-216*a* defined by the housing of the electronic device 14.6-200.

Notably, in some examples, the speaker assembly 14.6-212 includes only one port 14.6-216*b* that vents sounds into the ambient environment. The tweeter 14.6-234 and the woofer 14.6-230 can be stacked vertically. For example, the tweeter 14.6-234 can be positioned over or on top (in relation to the view of FIG. 14.6-2) of the woofer 14.6-230. In some examples, the tweeter 14.6-234 overlaps the woofer 14.6-230 along a horizontal axis such that the woofer 14.6-230 and tweeter are stacked along a vertical axis. The stacking of the woofer 14.6-230 and the tweeter 14.6-234 can allow the speaker pod 14.6-213 to have a reduced dimension (e.g., along the horizontal axis). As shown, the tweeter 14.6-234 can be positioned closer to the port 14.6-216*b* than the woofer 14.6-230. In other words, a distance between the port 14.6-216*b* and the woofer 14.6-230 is greater than a distance between the port 14.6-216*b* and the tweeter 14.6-234.

The speaker assembly 14.6-212 can include internal walls or barrier components that define one or more channels, passages, or tunnels that are designed to guide sound within the speaker assembly 14.6-212. In some examples, a woofer channel 14.6-250 can be in fluid communication with an interior of the woofer 14.6-230 to receive sound produced by the woofer 14.6-230 and guide the sound, at least partially, to the port 14.6-216*b*. Likewise, a tweeter channel 14.6-251 can be in fluid communication with the tweeter 14.6-234 to receive sound produced by the tweeter 14.6-234 and guide the sound to the port 14.6-216*b*.

As described herein, the pod 14.6-213 can define a single outlet port 14.6-216*b*. Thus, in some configurations the woofer channel 14.6-250 and the tweeter channel 14.6-251 converge into a shared channel 14.6-252 leading to the port 14.6-216*b*. In at least one example, the woofer channel 14.6-250, tweeter channel 14.6-251, and the shared channel 14.6-252 can be formed as a single channel leading to a single port 14.6-216*b*. In other words, the woofer channel 14.6-250 can direct primarily low frequency sound generated by the woofer 14.6-230 and the tweeter channel 14.6-251 can direct primarily high frequency sound generated by the tweeter 14.6-234. Accordingly, the shared channel 14.6-252 can include both high and low frequency acoustic waves produced by both the woofer 14.6-230 and the tweeter 14.6-234. In some examples, the woofer channel 14.6-250 and the tweeter channel 14.6-251 terminate at the port 14.6-216*b*.

In at least one example, the shared channel 14.6-252 can be removed or reduced in size with the woofer channel 14.6-250 and the tweeter channel 14.6-252 extending to the port 14.6-216*b*. In such an example, the woofer channel 14.6-250 can terminate at the tweeter channel 14.6-251 and the tweeter channel can terminate at the port 14.6-216. In this way, in at least one example, the woofer channel 14.6-250 and the tweeter channel 14.6-251 can join to form a single channel that terminates at a single port 14.6-216*b*. As shown in FIG. 14.6-2, the port 14.6-216*b* and opening 14.6-216 can align to form a single opening or port defined at least in part by an external housing of the device 14.6-200 and visible from the outside environment.

In some examples, a mesh 14.6-258 can be positioned within or across the woofer channel 14.6-250. The mesh 14.6-258 can include cloth or fabric (also referred to as grille cloth, acoustic cloth, or speaker mesh) that is designed to allow for sound transmission through the material. The mesh 14.6-258 can aid in acoustic dampening, distortion control, and flow noise control.

The speaker mesh 14.6-258 can include a predetermined sound transmissibility suitable for sound generated by the woofer 14.6-230. The woofer 14.6-230 can have a frequency range of about 20 Hz to about 2 kHz. The tweeter 14.6-234 can have a frequency range of about 200 Hz to about 20 kHz. In some examples, the woofer 14.6-230 can have a frequency range as low as about 20 Hz to about 50 Hz, and as high as about 200 Hz to about 2 kHz. The tweeter 14.6-234 can have a frequency range as low as about 200 Hz to about 2 kHz, and as high as about 20 kHz. In some examples, the mesh 14.6-258 can allow for passage of frequencies lower than frequencies produced by the tweeter 14.6-234. For example, the mesh 14.6-258 can substantially allow sound generated by the woofer 14.6-230 below 2000 Hz to pass there through but substantially prevent or reduce the transmission of frequencies produced by the tweeter 14.6-234 from transferring therethrough. For example, the mesh 14.6-258 can substantially block or prevent sound frequencies above about 2000 Hz from transferring from the tweeter channel 14.6-252 backward into the woofer channel 14.6-250. The mesh 14.6-258 can at least partially block or prevent sound from the tweeter 14.6-234 from traveling into the woofer channel 14.6-250. The mesh 14.6-258 can be made from synthetic materials or threads in a woven pattern, or can include a foam. The mesh 14.6-258 can be an air-permeable component.

The mesh 14.6-258 can be positioned at or near a terminus or outlet 14.6-249 of the woofer channel 14.6-250. The mesh 14.6-258 can occupy substantially an entire volume defined by the woofer channel 14.6-250. In some other examples, however, the mesh 14.6-258 may only occupy a portion of the woofer channel 14.6-250. In use, the mesh 14.6-258 can serve to reduce the velocity of air flowing through the woofer channel 14.6-250, thereby reducing undesirable flow noise and providing for a clearer acoustic signal to be heard by the user. In some examples, the mesh 14.6-258 can block or prevent particle ingress through the woofer channel 14.6-250.

The speaker assembly 14.6-212 can include a port mesh 14.6-260 that is positioned within or across the opening 14.6-216*a*, the port 14.6-216*b*, and/or the shared channel 14.6-252. In some examples, the port mesh 14.6-260 is positioned across the tweeter channel 14.6-251. The port mesh can be substantially similar to the mesh 14.6-258. However, in at least one example, the port mesh 14.6-260 can have a lower density than the mesh 14.6-258. The port mesh 14.6-260 can include cloth or fabric that is designed to allow for easy sound transmission through the material. The port mesh 14.6-260 can include a predetermined sound transmissibility suitable for sound generated by the tweeter 14.6-234. The port mesh 14.6-260 can supplement the mesh 14.6-258 in further dampening the sound. In some examples, the port mesh 14.6-260 can allow for passage of frequencies as high as 20 kHz. The port mesh 14.6-260 can be made from synthetic materials or threads in a woven pattern. As described in greater detail with regard to FIG. 14.6-4, a cosmetic steel screen can be combined with the port mesh 14.6-260 to define an exterior of the electronic device 14.6-200. Further, a frame defined by a series of support ribs can support the port mesh 14.6-260 to prevent damage to the port mesh 14.6-260.

The port mesh 14.6-260 can be an air-permeable component. In some examples, the port mesh 14.6-260 can occupy substantially an entire volume defined by at least one of the shared channel 14.6-252, the port 14.6-216*b*, and the opening 14.6-216*a*. In some other examples, however, the port mesh 14.6-260 may only occupy a portion of at least one of the shared channel 14.6-252, the port 14.6-216*b*, and the opening 14.6-216*a*. In use, the port mesh 14.6-260 can serve to reduce the velocity of air flowing through the shared channel 14.6-252, thereby reducing undesirable flow noise and providing for a clearer acoustic signal to be heard by a user. In some examples, the port mesh 14.6-260 can block or prevent particle ingress through the shared channel 14.6-252.

As noted above and shown in FIG. 14.6-2, the mesh 14.6-258 can be disposed between the woofer channel 14.6-250 and the tweeter channel 14.6-252 such that the mesh 14.6-258 aid in acoustic dampening, distortion control, and flow noise control for specific frequencies output by the woofer 14.6-230 without attenuating or otherwise interfering with the passage of sound frequencies passing through the tweeter channel 14.6-252 and out the port mesh 14.6-260. In this way, the denser mesh 14.6-258 provides the advantages tuned for the sound output by the woofer 14.6-230 and the port mesh is configured to optimally provide dampening, distortion control, and flow noise control of the higher frequencies output by the tweeter 14.6-234 without those same high frequencies having to first passing through the mesh 14.6-258. As noted above, the port mesh 14.6-260 is also configured to allow the passage of lower frequencies from the woofer 14.6-230 to pass through the port 14.6-216*b* and the opening 14.6-216*a* without substantially or noticeably attenuating or otherwise interfering with the woofer sound. In this way, with both the mesh 14.6-258 and port mesh 14.6-260 positioned as shown in FIG. 14.6-2, both the lower woofer frequencies and the higher tweeter frequencies produced by the speaker assembly 14.6-212 can be optimally controlled for quality as the sound passes through a single shared outlet or aperture, such as the opening 14.6-216*a*. Further details regarding speaker assemblies are described below with reference to FIGS. 14.6-3A through 14.6-3E.

FIG. 14.6-3A illustrates a top perspective view of an example of a speaker assembly 14.6-312. The speaker assembly 14.6-312 can be substantially similar to, and can include some or all of the features of the speaker assemblies described herein, such a speaker assembly 14.6-112 and 14.6-212. FIG. 14.6-3A is merely one illustrative example of how the speaker assembly 14.6-312 can be designed and is not limited to the depicted design or componentry. As illustrated, the speaker assembly 14.6-312 can include a housing or pod 14.6-313 that houses various components of the speaker assembly 14.6-312, such as audio transducers. The pod 14.6-313 can include stainless steel. In some examples, the pod 14.6-313 can include a bottom portion (shown in FIG. 14.6-3A) and a top portion (not shown). The top and bottom portions of the pod 14.6-313 can substantially surround or encapsulate the components of the speaker assembly 14.6-312. The bottom portion of the pod 14.6-313 can include a curved or non-planar surface that defines an internal volume, such as internal volume 14.6-215 of FIG. 14.6-2. The speaker assembly 14.6-312 can include an elastomeric gasket (not shown in FIG. 14.6-3A) positioned around a perimeter of the pod 14.6-313. The elastomeric gasket can provide a seal between the top portion and bottom portion of the pod 14.6-313. In some examples, the pod 14.6-313 does not include a top portion, but is instead sealed directly to an interior surface of the housing of the electronic device.

As illustrated in FIG. 14.6-3A, the pod 14.6-313 can house a woofer 14.6-330 and a tweeter 14.6-334. The tweeter 14.6-334 can be positioned at least partially adjacent to the woofer 14.6-330. As described herein, the tweeter 14.6-334 can at least partially stack or overlap the woofer 14.6-330 in order to accommodate for a reduced dimension of the pod 14.6-313.

The pod 14.6-313 can define the port 14.6-316, out of which sound from both the woofer 14.6-330 and tweeter 14.6-334 are emitted into the ambient environment. As discussed herein, the pod 14.6-313 can include or define a single outlet port 14.6-316. The single outlet port 14.6-316 can improve an aesthetic appearance of the electronic device. Further, the single outlet port 14.6-316 can provide the advantage of having fewer entry points for dust, particles, or debris, thereby reducing the likelihood of foreign objects entering the electronic device. The pod 14.6-313 can define grooves 14.6-338 that are shaped to allow for electrical wires to pass into the internal volume of the pod 14.6-313 even when the top portion is secured to the bottom portion. The electrical wires can be in electrical communication with the woofer 14.6-330 and the tweeter 14.6-334. In some examples, a printed circuit board or PCB (not shown in FIG. 14.6-3A) can be secured to a top of the woofer 14.6-330. The PCB can be secured, at least partially, by protrusions 14.6-342 that anchor the PCB in place above the woofer 14.6-330. The protrusions 14.6-342 can be helical coils. A heat sink can be positioned on top of or above the PCB. In some examples, the speaker assembly 14.6-312 can include a vent 14.6-346. The vent 14.6-346 can be a barometric vent that allows for air equalization within the speaker assembly 14.6-312.

FIG. 14.6-3B shows a cross-sectional side view of the speaker assembly 14.6-312 according to one embodiment. Similarly, FIG. 14.6-3C illustrates a perspective cross-sectional view of the speaker assembly 14.6-312 according to one embodiment. The woofer 14.6-330 can include a diaphragm 14.6-332 that oscillates along the vertical axis when an electrical current is provided to the woofer 14.6-330. Sound produced by the woofer diaphragm 14.6-332 can travel downward in a woofer volume 14.6-349 and can then be guided laterally or horizontally through the woofer channel 14.6-350. In some examples, at least a portion of the woofer volume 14.6-349 and the woofer channel 14.6-350 can be defined by an interior surface of a bottom wall of the pod 14.6-313.

In some examples, the sound produced by the woofer 14.6-330 can take a winding or tortuous path as it travels to the port 14.6-316. For example, the sound from the woofer 14.6-330 may need to change directions several times in order to reach the port 14.6-316. A long tortuous path can impact acoustic modes of that path, consequently impacting the output. As used herein, a tortuous path can refer to a winding or snaking path (e.g., non-linear). The tortuous path described herein can be a result of a horizontal interface 14.6-357 between the woofer 14.6-330 and tweeter 14.6-334 with the tweeter stacked or overlapping the woofer 14.6-330 as shown.

As illustrated in FIG. 14.6-3B, the pod 14.6-313 can include an overhang or lip 14.6-315. A perimeter or footprint of the lip 14.6-315 can be smaller than a perimeter or footprint of the combined audio components (e.g., woofer 14.6-330, tweeter 14.6-334, etc.) housed within the pod 14.6-313. Accordingly, the system may need to be assembled in a certain order and fashion due to the lip 14.6-315. For example, the dimensions of the pod 14.6-313 may prevent the woofer 14.6-330 and tweeter 14.6-334 from being simply attached or assembled before being placed into the pod 14.6-313. Instead, it may be necessary to first position the tweeter 14.6-334 or woofer 14.6-330 within the pod 14.6-313 and then place the remaining components into position. The components of the speaker assembly 14.6-312 may need to be angled or slid horizontally to be set into the correct position within the pod 14.6-313. The lip 14.6-315 can overlap or overhang a portion of the tweeter 14.6-334.

Further, as described herein, modern electronic devices often demand reduced dimensions that require novel solutions to fit the electronics within the housings or enclosures. For example, the electronic devices described herein can include integrated speaker assemblies that maintain a broad frequency range and desirable acoustic performance levels, despite residing in smaller, more compact housings. In some examples, this is achieved by overlapping or stacking the tweeter 14.6-334 and the woofer 14.6-330.

The overlapping tweeter 14.6-334 and woofer 14.6-330 configuration increases the compactness of the speaker assembly 14.6-312 and allows for assembly tolerances in the horizontal direction when assembling the speaker assembly 14.6-312. In addition, in at least one example, the overlapping configuration of the tweeter 14.6-334 and woofer 14.6-330 can result in the woofer channel 14.6-350 and/or tweeter channel 14.6-351 to change directions in a tortuous manner, for example from horizontal to vertical and/or other channel angles. The stacked nature of the speaker assembly 14.6-312 in combination with a single port 14.6-316 may result in a tortuous and winding path for the sound waves. For example, the horizontal interface 14.6-357 allows for horizontal assembly tolerances while causing the woofer channel 14.6-350 to direct upward in order to accommodate for the horizontal interface 14.6-357. In some examples, the tortuous path can be defined by smooth or curved walls to reduce or eliminate turbulence.

As shown in FIG. 14.6-3B, the horizontal interface 14.6-357 can include contacting or at least overlapping portions of the tweeter 14.6-334 and woofer 14.6-330, or the contacting or overlapping of certain walls or other components of the tweeter 14.6-334 and woofer 14.6-330, due to the stacked nature of the tweeter 14.6-334 and the woofer 14.6-330. Also, as used herein and as viewed in the orientation of FIG. 14.6-3B, the term "horizontal" can refer to a plane generally parallel to the planes in which the tweeter diaphragm 14.6-335 and the woofer diaphragm 14.6-332 are disposed. In one or more other examples, the stacked configuration/positioning of the tweeter 14.6-334 and woofer 14.6-330 can form an interface at an angle from the referenced "horizontal" orientation of the diaphragms 14.6-335, 14.6-332, such as any angle between horizontal and vertical (with "vertical" referencing an angle, plane, or orientation perpendicular to the diaphragms 14.6-335, 14.6-332 shown in FIG. 14.6-3B). Accordingly, in at least on example, the interface 14.6-357 included surfaces or components of the tweeter 14.6-334 and the woofer 14.6-330 coming together at an angle other than vertical, for example at a 45-degree angle from horizontal or any other angle from horizontal or vertical directions. As noted above, this angled or horizontal interface 14.6-357 can cause the path of sound generated by the woofer 14.6-330 and/or tweeter 14.6-334 to be tortuous or winding as shown in FIG. 14.6-3B.

A sloped or curved ramp 14.6-354 can be positioned and shaped to direct sound from the woofer volume 14.6-349 to the shared volume 14.6-352. For example, as the sound travels laterally, the curved ramp 14.6-354 guides the sound upward. The curved ramp 14.6-354 can include a smooth transition surface to reduce turbulence. The curved ramp 14.6-354 can include a radius of curvature of about 0.2 cm to 0.3 cm. It will be understood that the ramp 14.6-354 is optional and that in some examples, the sound produced by the woofer 14.6-330 travels in a primarily lateral or horizontal direction to the port 14.6-316.

In some examples, a mesh 14.6-358 (similar to the mesh 14.6-258) can be positioned at a terminus of the woofer channel 14.6-350. The mesh 14.6-358 can be positioned at an interface between the woofer 14.6-330 and the tweeter 14.6-334.

The speaker assembly 14.6-312 can include a wall 14.6-353. The wall 14.6-353 can be made from plastic and can be positioned below the tweeter 14.6-334 (e.g., between the tweeter 14.6-334 and the woofer channel 14.6-350). The wall 14.6-353 can be positioned to shield the tweeter 14.6-334 from the sound produced by the woofer 14.6-330. In some examples, the wall 14.6-353 can be curved to provide a smooth transition surface to direct upward directed sound laterally toward the port 14.6-316. In some examples, the wall 14.6-353 is positioned and/or shaped to direct sound from the tweeter 14.6-334 toward the port 14.6-316. The wall 14.6-353 can at least partially prevent sound from the tweeter 14.6-334 from passing into the woofer channel 14.6-350. The wall 14.6-353 can at least partially define the tweeter channel 14.6-351 and/or the woofer channel 14.6-350. In some examples, the wall 14.6-353 can extend substantially across the tweeter 14.6-334. The wall 14.6-353 can extend to the port mesh 14.6-360. Thus, the shared channel 14.6-352 can be omitted due to the wall 14.6-353 maintaining a separation of the woofer channel 14.6-350 and the tweeter channel 14.6-351.

The tweeter 14.6-334 can include a diaphragm 14.6-335. The diaphragm 14.6-335 can oscillate or vibrate along a vertical axis. The diaphragm 14.6-335 can oscillate in the same direction(s) as the diaphragm 14.6-332. The woofer diaphragm 14.6-332 can include a surface area that is approximately 10 times larger than that of the tweeter diaphragm 14.6-335.

In some examples, the tweeter 14.6-334 can be positioned closer to the port 14.6-316 than the woofer 14.6-330. The path taken by sound produced by the tweeter 14.6-334 can be substantially linear, or at least substantially less tortuous than the path taken by sound from the woofer 14.6-330. In some examples, sound generated by the tweeter 14.6-334 is initially directed in a downward direction but is guided substantially laterally, toward the port 14.6-316.

The speaker assembly 14.6-312 can include several interfaces (e.g., horizontal interface 14.6-357) between the woofer 14.6-330 and the tweeter 14.6-334 or between the speaker components and the pod 14.6-313. Foams can be positioned between the interfaces of the components and the speaker housing 14.6-313. Specifically, FIG. 14.6-3B shows a foam 14.6-363*a* positioned between a sidewall 14.6-364 of the pod 14.6-313 and the tweeter 14.6-334. Further, a foam 14.6-363*b* can be positioned between the interior surface of the pod 14.6-313 and a channel wall 14.6-366.

The foams 14.6-363*a*, 14.6-363*b* can include re-workable properties such as flexibility and malleability to allow free play within the speaker assembly 14.6-312. The foams 14.6-363*a*, 14.6-363*b* can be used in addition to or as a replacement for pressure sensitive adhesive (PSA). The foams 14.6-363*a*, 14.6-363*b* beneficially may not be permanently set, allowing for adjustment and repositioning of the components of the assembly. In some examples, the foams 14.6-363*a*, 14.6-363*b* can be used in conjunction with an adhesive. Advantageously, the foams between various interfaces of the components and the pod 14.6-313 can take up tolerances within the system. For example, a minimum sealing tolerance can be about 300 microns. The position of the foams 14.6-363*a*, 14.6-363*b* are merely example locations that foam can reside. It will be understood that foam can be located at various positions or interfaces not shown in FIGS. 14.6-3B and 14.6-3C.

In some examples, the port 14.6-316 is about 30 $mm^2$ across its cross-sectional face. The size of the port 14.6-316 can depend on the capability of the woofer 14.6-330. The size of the port 14.6-316 can be driven by a desired particle velocity. For example, particle velocity can be a volume velocity (e.g., the volume of sound waves or air passing an area per unit time) divided by a cross sectional area of the port, where the volume velocity is dictated by the maximum output of the system at low frequencies. The particle velocity can be up to 50 meters per second. In some examples, the particle velocity is 10 meters per second. The port 14.6-316 can include a sleeve 14.6-319 positioned within the port 14.6-316 and extending around a perimeter of the port 14.6-316. The sleeve 14.6-319 can be made from plastic. The sleeve 14.6-319 can extend through the port opening 14.6-316 in the pod 14.6-313 and can also extend through the opening in the housing of the electronic device (e.g., opening 14.6-216*a* in FIG. 14.6-2).

FIG. 14.6-3D shows a top perspective view of a speaker module 14.6-317. The speaker module 14.6-317 can represent the certain electronics removed from the pod 14.6-313 described above. The speaker module 14.6-317 can include the woofer 14.6-330 and the tweeter 14.6-334. In some examples, the speaker module 14.6-317 can include a frame 14.6-347. The frame 14.6-347 can be secured to an interior surface of the pod 14.6-313. FIG. 14.6-3E shows a bottom perspective view of a speaker module 14.6-317. An underside surface of the frame 14.6-347 can be sealed to a bottom of the pod 14.6-313. In some examples, the speaker module 14.6-317 is sealed to the pod using an adhesive and/or foam, such as the foam 14.6-363 discussed above with regard to FIG. 14.6-3B. The woofer diaphragm 14.6-332, woofer channel 14.6-350, and mesh 14.6-358 are also visible from the underside of the speaker module 14.6-317 shown in FIG. 14.6-3E. In some examples, a barometric vent 14.6-346 can be positioned as illustrated between the mesh 14.6-358 and the woofer diaphragm 14.6-332.

FIG. 14.6-4 shows a perspective view of a port barrier 14.6-460. The port barrier 14.6-460 can be substantially similar to, including some or all of the features of, the meshes described herein, such as mesh 14.6-260 and 14.6-360. The port barrier 14.6-460 can be positioned within or across the opening of the electronic device, the port of the speaker assembly, and/or a shared channel (e.g., shared channel 14.6-252). The port barrier 14.6-460 can include an external screen 14.6-460*a*, a woven mesh 14.6-460*b*, and a frame 14.6-460*c*.

The external screen 14.6-460*a* can be a metallic structure that defines at least a portion of an exterior surface of the electronic device. In other words, the external screen 14.6-460*a* can be a cosmetic feature, visible to a user. In some examples, the external screen 14.6-460*a* can provide structural support to the woven mesh 14.6-460*b*. The external screen 14.6-460*a* can act as a particle or debris barrier to prevent particle ingress into the speaker assembly.

As discussed in greater detail above, with regard to FIG. 14.6-3B, the woven mesh 14.6-460*b* can include a cloth or fabric that is designed to allow for easy sound transmission through the material. The speaker port barrier 14.6-460 can include a predetermined sound transmissibility suitable for sound generated by the tweeter 14.6-234. The port barrier 14.6-460 can partially dampen the sound. In some examples, the woven mesh 14.6-460*b* can allow passage of frequencies from 20 Hz to 20 kHz. In some examples, the woven mesh 14.6-460*b* can allow passage of frequencies from 2 kHz to 20 kHz. The woven mesh 14.6-460*b* can be made from synthetic materials or threads in a woven pattern.

The port barrier 14.6-460 can be air-permeable. The port barrier 14.6-460 can occupy substantially an entire volume defined by at least one of the shared channel, the port (e.g., port 14.6-216*b*, 14.6-316), and the opening (e.g., opening 14.6-116, 14.6-216*a*). In some other examples, however, the port barrier 14.6-460 may only occupy a portion of at least one of the shared channel 14.6-252, the port 14.6-216*b*, and the opening 14.6-216*a*. In use, the port barrier 14.6-460 can serve to reduce the velocity of air flowing through the shared channel 14.6-252, thereby reducing undesirable flow noise and providing for a clearer acoustic signal to be heard by a user. In some examples, the port barrier 14.6-460 can block or prevent particle ingress through the shared channel 14.6-252. The port barrier 14.6-460 can have a lower density than the mesh 14.6-258.

The frame 14.6-460*c* can be positioned interior to the external screen 14.6-460*a* and woven mesh 14.6-460*b*. In some examples, the woven mesh 14.6-460*b* is positioned between or sandwiched between the external screen 14.6-460*a* and the frame 14.6-460*c*. The frame 14.6-460*c* can include a series of support ribs 14.6-461 to strengthen, shield, or provide support the woven mesh 14.6-460*b*. In some examples, the frame 14.6-460*c* is positioned external to the woven mesh 14.6-460*b* (e.g., between the external screen 14.6-460*a* and the woven mesh 14.6-460*b*. The frame 14.6-460*c* can be made from any suitable material, such as plastic or metal.

14.7: Bifurcated Band

Head-mounted devices include head-mounted support structures that allow the devices to be worn on the heads of users. The head-mounted support structures may include device housings for housing components such as displays that are used for presenting a user with visual content. The head-mounted support structures for a head-mounted device may also include headbands and other structures that help hold a device housing on the face of a user. The headband of a head-mounted device may be adjustable.

In some embodiments, it may be desirable to incorporate a bifurcated headband that contacts the user's head in multiple locations while the head-mounted device is worn. The headband may include different woven textures on opposite sides of the headband (e.g., on the side in contact with the user's head vs. facing away from the user's head), and may include hair-safe hook and loop fasteners. The headband may have ends with seamless curved webbings. To prevent the headband from slipping with respect to the user's head, stiffeners and/or cords may be included on and/or in the headband. If cords are included in the headband, the headband may have adaptive curvature based on the location of the cords within the headband. As a result, the headband may conform to the user's head.

FIG. 14.7-1 is a side view of an illustrative head-mounted electronic device with an adjustable headband. As shown in FIG. 14.7-1, head-mounted device 14.7-10 may include head-mounted housing 14.7-12 (sometimes referred to as a main housing, main housing unit, head-mounted support structure, etc.). Housing 14.7-12 may have walls or other structures that separate an interior housing region from an exterior region surrounding housing 14.7-12. For example, housing 14.7-12 may have walls formed from polymer, glass, metal, and/or other materials. Electrical and optical components may be mounted in housing 14.7-12. These components may include components such as integrated circuits, sensors, control circuitry, input-output devices, etc.

To present a user with images for viewing from eye boxes (e.g., eye boxes in which the user's eyes are located when device 14.7-10 is being worn on the users' head such as head 14.7-22 of FIG. 14.7-1), device 14.7-10 may include displays and lenses. These components may be mounted in optical modules or other supporting structure in housing 14.7-12 to form respective left and right optical systems. There may be, for example, a left display for presenting an image through a left lens to a user's left eye in a left eye box and a right display for presenting an image to a user's right eye in a right eye box.

If desired, housing 14.7-12 may have forward-facing components such as cameras, other sensors, and/or a display on front F for gathering sensor measurements/other input and/or display information on front F. Housing 14.7-12 and may have a soft cushion on an opposing rear side of housing 14.7-12. The rear of housing 14.7-12 may have openings that allow the user to view images from the left and right optical systems (e.g., when the rear of housing 14.7-12 is resting on front surface 14.7-20F of the user's head 14.7-22.

Device 14.7-10 may have an adjustable strap such as adjustable headband 14.7-26 and, if desired, may have other structures (e.g., an optional over-the-head strap) to help hold housing 14.7-12 on head 14.7-22. Headband 14.7-26 may have first and second ends coupled, respectively, to the left and right sides of housing 14.7-12. In the example of FIG. 14.7-1, coupling members 14.7-24, which serve as extensions of housing 14.7-12 (e.g., extend from housing 14.7-12 directly or are attached directly to housing 14.7-12), are provided on the left and right sides of housing 14.7-12. Members 14.7-24 may be formed from rigid materials such as rigid polymer and/or other materials and may contain sensors, buttons, speakers, and other electrical components. Hinges and/or other mechanisms may be used to couple members 14.7-24 to housing 14.7-12 or members 14.7-24 may be formed as integral portions of a main housing unit. The ends of headband 14.7-26 may have coupling mechanisms such as openings configured to receive posts or other protrusions 14.7-24P on members 14.7-24 or other housing structures. These coupling mechanisms allow a user to removably attach headband 14.7-26 to members 14.7-24 and thereby removable attach headband 14.7-26 to housing 14.7-12. Members 14.7-24 may have elongated shapes of the type shown in FIG. 14.7-1 and/or other suitable shapes and may sometimes be referred to as rigid straps, rigid coupling members, or power straps.

Headband 14.7-26 may have a soft flexible portion such as central portion 14.7-30. Portion 14.7-30 may be formed between two stiffer portions such as end portions 14.7-28 on the left and right ends of headband 14.7-26. Portions 14.7-28 may be stiffened using embedded polymer stiffeners (e.g., single-layer or multilayer polymer stiffening strips) and/or other stiffening members.

Portion 14.7-30 may be formed from a stretchable material such as stretchy fabric. Portion 14.7-30 may, as an example, be formed from a band of flat knit fabric that includes stretchable strands of material (e.g., elastomeric strands) and/or which uses a stretchable fabric construction (e.g., a stretchable knit construction). Alternatively, portion 14.7-30 may be formed from a band of woven fabric, which may include stretchable strands of material and/or may use a stretchable fabric construction. Narrowed end portions of the band of knit fabric may, if desired, extend over stiffening members in end portions 14.7-28 (e.g., to ensure that headband 14.7-26 has a uniform external appearance).

Portion 14.7-30 may include two bifurcated headband portions 14.7-32 and 14.7-34. In particular, bifurcated headband portions 14.7-32 and 14.7-34 may form two portions of the same headband 14.7-26 (e.g., headband portions 14.7-32 and 14.7-34 may be connected to the same points in portions 14.7-28). In the illustrative embodiment of FIG. 14.7-1, portion 14.7-32 may be attached to protrusions 14.7-24P, and portion 14.7-34 may extend from portion 14.7-32 at a fixed angle. In other embodiments, headband portions 14.7-32 and 14.7-34 may both be attached to protrusions 14.7-24P, thereby being able to pivot about protrusions 14.7-24P individually.

Headband portions 14.7-32 and 14.7-34 may both contact rear portions of head 14.7-22. In particular, headband portion 14.7-32 may contact an upper rear portion of head 14.7-22 (e.g., in the upper half of the rear of head 14.7-22), while headband portion 14.7-34 may contact a lower rear portion of head 14.7-22 (e.g., in the lower half of the rear of head 14.7-22). By contacting the rear of head 14.7-22 in two different locations, headband portions 14.7-32 and 14.7-34 may secure device 14.7-10 to head 14.7-22 while mitigating the amount of stress applied to any portion of head 14.7-22.

The stretchability of headband portion 14.7-30 (and therefore headband portions 14.7-32 and 14.7-34 of headband 14.7-26) allows headband 14.7-26 be stretched along its length. This allows the length of headband 14.7-26 to be temporarily increased to help a user place headband 14.7-26 over the user's head when a user is donning device 14.7-10.

When headband 14.7-26 is released, the stretchiness and elastic nature of portion 14.7-30 of headband 14.7-26 will help shorten headband 14.7-26 and pull headband 14.7-26 against the user's head so that headband 14.7-26 rests against rear surface 14.7-20R the user's head.

Further adjustment of the tension of headband 14.7-26 to secure headband 14.7-26 and device 14.7-10 on the user's head may be provided by tightening doubled-back portions 14.7-33 and 14.7-35 of headband 14.7-26. In particular, doubled-back portions 14.7-33 and 14.7-35 may pass through adjustment loops 14.7-36 and 14.7-38, respectively. Doubled-back portions 14.7-33 and 14.7-35 may have hook-and-loop fasteners on an inner surface, allowing doubled-back portions 14.7-33 and 14.7-35 to be secured to headband portions 14.7-32 and 14.7-34. In this way, headband portions 14.7-32 and 14.7-34 may be tightened or loosened as desired by a user of device 14.7-10.

FIG. 14.7-2A is an illustrative side view of an outer surface (e.g., the surface that faces away from head 14.7-22 when worn) of headband 14.7-26 in a configuration in which headband 14.7-26 is not attached to housing 14.7-12. As shown in FIG. 14.7-2A, headband 14.7-26 may have a stretchable central portion 14.7-30 that includes portions 14.7-32 and 14.7-34 formed from stretchy woven or knit fabric and may have ends 14.7-28 (e.g., end portions that are stiffened using stiffeners embedded in the fabric)—one of ends 14.7-28 is shown in the side view of FIG. 14.7-2A. One or more openings 14.7-40 may be formed in the ends of headband 14.7-26 in portion 14.7-31. Openings 14.7-40 may receive posts or other protrusions such as protrusion 14.7-24P of FIG. 14.7-1 to secure the left and right ends of headband 14.7-26 to the left and right members 14.7-24 of device 14.7-10. There may be a single opening 14.7-40 or other attachment mechanism located on each end of headband 14.7-26 or each end of headband 14.7-26 may have two or more openings 14.7-40. If desired, other attachment mechanism (e.g., magnets, snaps, latches, hook-and-loop fasteners, screws or other fasteners, etc.) may be used in attaching headband 14.7-26 to members 14.7-24 or other portions of the housing of device 14.7-10.

As shown in FIG. 14.7-2A, portions 14.7-32 and 14.7-34 of headband 14.7-26 may both extend from portion 14.7-31 of headband 14.7-26. In other words, portions 14.7-32 and 14.7-34 may extend from portion 14.7-31 at a fixed angle to one another. Portion 14.7-31 may be more rigid (e.g., less stretchy) than portions 14.7-32 and 14.7-34, if desired. For example, portion 14.7-31 may include one or more rigid or semi-rigid layers, such as polymer layers or metal layers.

By coupling (e.g., weaving, knitting, or otherwise intertwining) portions 14.7-32 and 14.7-34 with portion 14.7-31, portions 14.7-32 and 14.7-34 may be kept at a constant angle with respect to one another. In other words, portions 14.7-32 and 14.7-34 may remain separated by a fixed angle when worn on head 14.7-22.

Headband portions 14.7-32 and 14.7-34 may respectively include hook-and-loop fasteners 14.7-42 and 14.7-44, which may secure the ends of portions 14.7-32 and 14.7-34 when the end portions are doubled back to tighten headband 14.7-26 (as shown in FIG. 14.7-1). Hook-and-loop fasteners 14.7-42 may be, for example, hair-safe hook-and-loop fasteners that prevent hair from being caught in fasteners 14.7-42.

The outer surface of headband 14.7-26 may be woven. As shown in FIG. 14.7-2A, on the outer side of headband 14.7-26, headband 14.7-26 may have solid loop weave 14.7-46. Solid loop weave 14.7-46 may be tightly woven and have a uniform appearance across headband 14.7-26. The loops in solid loop weave 14.7-46 may provide the loops for hook-and-loop fasteners 14.7-42.

FIG. 14.7-2B is an illustrative side view of an inner surface (e.g., the surface in contact with head 14.7-22 when worn) of headband 14.7-22 in a configuration in which headband 14.7-26 is not attached to housing 14.7-12.

Headband 14.7-26 may have a tab, such as tab 14.7-46. Tab 14.7-46 may be attached to a latch (or other suitable attachment mechanism) in opening 14.7-40 that attaches headband 14.7-26 to post 14.7-24P. By pulling on tab 14.7-46, a user may release the latch from post 14.7-24P, and headband 14.7-26 may be removed from member 14.7-24. However, this attachment mechanism of headband 14.7-26 to member 14.7-24 is merely illustrative. In general, headband 14.7-26 may attach to member 14.7-24 in any suitable manner.

The inner surface of headband 14.7-26 may be woven. As shown in FIG. 14.7-2B, on the inner side of headband 14.7-26, headband 14.7-26 may have ribbed loop weave 14.7-47. Ribbed loop weave 14.7-47 may provide sufficient friction for headband 14.7-26 to remain in place on head 14.7-22, while being comfortable on head 14.7-22 (e.g., on a user's hair). Ribbed loop weave 14.7-47 may include loops 14.7-49 and rib portions 14.7-48. By having ribbed loop weave 14.7-47, the inner surface of headband 14.7-26 may have less tightly-packed loops than solid loop weave 14.7-46 on the outer surface of headband 14.7-26, thereby improving the user's comfort.

Although FIGS. 14.7-2A and 14.7-2B show headband 14.7-26 as being woven, this is merely illustrative. In general, headband 14.7-26 may be formed from fabric including strands that are intertwined using knitting, weaving, braiding, and/or other strand intertwining techniques.

In some embodiments, it may be desirable to create a curved edge that appears seamless at the end of headband 14.7-26. An illustrative headband strap with a curved edge with a seam that is invisible to the naked eye is shown in FIG. 14.7-3.

As shown in FIG. 14.7-3, strap 14.7-50 may be formed from inner woven portion 14.7-52 and webbing 14.7-54. In particular, webbing 14.7-54 may be sewn, woven, or otherwise coupled to woven portion 14.7-52. Woven portion 14.7-52 may have a solid loop weave (e.g., solid loop weave 14.7-45 of FIG. 14.7-2A) or a ribbed loop weave (e.g., ribbed loop weave 14.7-47 of FIG. 14.7-2B), as examples.

Although portion 14.7-52 has been described as being woven, this is merely illustrative. In general, portion 14.7-52 may be knitted, woven, braided, and/or formed using other strand intertwining techniques.

Webbing 14.7-54 may have portion 14.7-56 that wraps from one side of inner woven portion 14.7-52 (e.g., the left side of inner woven portion 14.7-52), across edge 14.7-55 of strap 14.7-50, to the opposite side of inner woven portion 14.7-52 (e.g., the right side of inner woven portion 14.7-52).

A stiffener may be inserted into webbing 14.7-54, if desired. In the illustrative example of FIG. 14.7-3, stiffener 14.7-58 may be inserted into webbing 14.7-54, such as one side of webbing 14.7-54. In particular, webbing 14.7-54 may have multiple layers, and stiffener 14.7-58 may be inserted between the multiple layers. Alternatively, webbing 14.7-54 may be formed as a single piece using a flat knitting technique and includes a built-in channel (sometimes referred to as a pocket or cavity), and stiffener 14.7-58 may be inserted into the built-in channel. In general, however, stiffener 14.7-58 may be inserted into webbing 14.7-54 in any desired manner.

Stiffener 14.7-58 may be formed from a cord, such as a braided cord, or a flexible strip of polymer (e.g., an elastomer such as thermoplastic polyurethane). Stiffener 14.7-58 may be sufficiently flexible to permit the headband to bend and twist, but may not stretch substantially along its length and may therefore sometimes be referred to as a non-stretchable stiffener, non-stretchable member, non-stretchable stiffening structure, etc. Stiffener 14.7-58 may significantly less stretchy and soft than the fabric of strap 14.7-50 and may serve to increase the stiffness and decrease (or eliminate) stretchiness at desired portions along strap 14.7-50. At the same time, the flexibility of stiffener 14.7-58 may allow strap 14.7-50 to bend around the curvature of a user's head. Stiffener 14.7-58 may be inserted into selected portions of strap 14.7-50 to selectively stiffen strap 14.7-50 at desired portions along its length, if desired.

Headband 14.7-26 may have rounded corners 14.7-62 of webbing 14.7-54 and may not have visible seams. An illustrative side view of headband 14.7-26 is shown in FIG. 14.7-4.

As shown in FIG. 14.7-4, headband 14.7-26 may include layers 14.7-64 and loops 14.7-66 (e.g., in webbing 14.7-54 of FIG. 14.7-3). Webbing from one side of headband 14.7-26 (e.g., portion 14.7-56 of FIG. 14.7-3) may be bonded to the other side of the webbing at point 14.7-71 (e.g., headband 14.7-26 may have single seam at point 14.7-71 one only one side of headband 14.7-26). As shown in FIG. 14.7-5, there may be no visible seam at point 14.7-71. In this way, a one-sided seam that is not visible to the naked eye may be formed in headband 14.7-26.

Although FIGS. 14.7-2A and 14.7-2B show portions 14.7-32 and 14.7-34 of headband 14.7-26 extending from common portion 14.7-31, this is merely illustrative. If general, portions 14.7-32 and 14.7-34 may be coupled and attached to a head-mounted device in any suitable manner, such as attaching portions 14.7-32 and 14.7-34 separately to a common post or wrapping a single band through a ring to double back on itself. An illustrative embodiment of a single band wrapped through a ring is shown in FIG. 14.7-5.

As shown in FIG. 14.7-5, headband 14.7-26 may be wrapped through ring 14.7-70 to form portions 14.7-32 and 14.7-34. Ring 14.7-70 may be a metal ring, a rigid polymer ring, or a ring of other suitable material. To ensure that portions 14.7-32 and 14.7-34 remain at a desired angle with respect to one another when worn by a user, stiffeners 14.7-72 may be added to headband 14.7-26. Stiffeners 14.7-72 may be formed from rigid polymer, metal, or other suitable material.

Stiffeners 14.7-72 may locally increase the stiffness of band 14.7-26 in the area around ring 14.7-70. As a result, portions 14.7-32 and 14.7-34 may maintain the angle between each other about ring 14.7-70 when band 14.7-26 is worn on a user's head. Moreover, stiffeners 14.7-72 may create detents to provide a user of headband 14.7-26 with feedback regarding how tight headband 14.7-26 is on the user's head. In other words, because stiffeners 14.7-72 have to pass through ring 14.7-70 when a user tightens or loosens headband 14.7-26, stiffeners 14.7-72 may indicate to the user how tight the headband is (e.g., by how may stiffeners the user feels pass through ring 14.7-70).

The stiffeners shown in FIG. 14.7-5 are merely illustrative. In general, stiffeners may be added to headband 14.7-26 in any suitable manner. For example, as shown in illustrative FIGS. 14.7-6A and 14.7-6B, stiffeners 14.7-72 may be added with different sizes, pitches, and/or geometries to adjust the stiffness of headband 14.7-26 about ring 14.7-70. Stiffeners 14.7-72 may be proud of the surface of headband 14.7-26, or may be formed flush or sub-flush with the surface of headband 14.7-26. As another illustrative example, as shown in FIG. 14.7-6C, cuts 14.7-74 may be made in headband 14.7-26. Cuts 14.7-74 may selectively modify the stiffness of headband 14.7-26 in different regions, and cuts 14.7-74 may be made so that headband 14.7-26 has more stiffness in the region adjacent to ring 14.7-70 than in other regions. In general, stiffeners in headband 14.7-26 may have any suitable geometries and may help maintain the angle between portions 14.7-32 and 14.7-34 about ring 14.7-70.

Although stiffeners 14.7-72 are shown in FIG. 14.7-5 as being used when headband 14.7-26 extends through ring 14.7-70, this is merely illustrative. Stiffeners 14.7-72 may be included on a surface of headband 14.7-26 if the portions of headband 14.7-26 are in a fixed position (as shown in FIG. 14.7-1, as an example).

In addition to, or instead of, stiffeners 14.7-72, headband 14.7-26 may be have stiffeners that run along a length of headband 14.7-26. An illustrative example of a headband with stiffeners of this type is shown in FIG. 14.7-7.

As shown in FIG. 14.7-7, portions 14.7-32 and 14.7-34 of headband 14.7-26 may include stiffeners 14.7-76. Stiffeners 14.7-76 may be the same as stiffener 14.7-58 of FIG. 14.7-3, as an example. Stiffeners 14.7-76 may be formed from a cord, such as a braided cord, or a flexible strip of polymer (e.g., an elastomer such as thermoplastic polyurethane). Stiffeners 14.7-76 may be more rigid (e.g., less flexible/stretchy) than the other portions of headband 14.7-26.

Stiffeners 14.7-76 may be inserted along one side of portions 14.7-32 and 14.7-34, as shown in FIG. 14.7-7. In particular, because stiffeners 14.7-76 stretch less than the rest of portions 14.7-32 and 14.7-34, portions 14.7-32 and 14.7-34 may conform to a user's head (e.g., head 14.7-22 of FIG. 14.7-1) and support the head-mounted device against the user's face more effectively.

Stiffeners 14.7-76 may extend entirely along the lengths of portions 14.7-32 and 14.7-34, or may extend across parts of the lengths of portions 14.7-32 and 14.7-34. In general, stiffeners 14.7-76 may be coupled to suitable parts of portions 14.7-32 and 14.7-34 to adjust the stiffness of portions 14.7-32 and 14.7-34 across their length as needed.

Stiffeners 14.7-76 may be inserted into channels within headband 14.7-26. As shown in illustrative FIG. 14.7-8, headband 14.7-26 may include strap 14.7-78 (which may correspond to strap 14.7-50 of FIG. 14.7-3) having surfaces 14.7-80 and 14.7-82. Between surfaces 14.7-80 and 14.7-82, strap 14.7-78 may have channel 14.7-85 with opening 14.7-84 at an edge of strap 14.7-78. Stiffener 14.7-76 may be mounted within channel 14.7-85. In other words, stiffener 14.7-76 may be embedded within strap 14.7-78 (e.g., within headband 14.7-26).

Stiffeners 14.7-76 may adjust the stiffness and curvature of headband 14.7-26. In particular, by adding stiffeners 14.7-76 to different regions of headband 14.7-26, headband 14.7-26 may curve differently in different regions. An illustrative example of a headband having stiffeners in different regions to create regions with different curvatures is shown in FIGS. 14.7-9A and 14.7-9B.

As shown in FIG. 14.7-9A, headband 14.7-26 may be straight when not under tension. In other words, when headband 14.7-26 is not on a user's head or otherwise under tension, headband 14.7-26 may return to a straight configuration. However, when headband 14.7-26 is pulled in opposite directions, headband may curve differently based on the locations of stiffeners 14.7-76.

As shown in FIG. 14.7-9B, portions 14.7-90 of headband 14.7-26 may curve more than portions 14.7-92 in response to headband 14.7-26 being pulled in directions 14.7-88 and 14.7-86. In particular, because stiffeners 14.7-76 are formed in portions 14.7-92, portions 14.7-92 may be stiffer than regions 14.7-90, which do not have stiffeners 14.7-76 (in other words, stiffeners 14.7-76 are stiffer than fabric 14.7-78). As a result, in response to pulling both ends of headband 14.7-26 in directions 14.7-88 and 14.7-86, headband 14.7-26 may extend in a serpentine pattern.

In some embodiments, headband 14.7-26 may be straight when not under tension (e.g., FIG. 14.7-9A) an may bend to conform to compound curvature (e.g., a user's head) when under tension (e.g., FIG. 14.7-9B). However, this is merely illustrative. In general, stiffeners 14.7-76 may be included in any suitable portion of headband 14.7-26 so that headband 14.7-26 bends as desired when under tension.

Returning to FIG. 14.7-7, by forming stiffener 14.7-76 on the bottom edge of portion 14.7-32 and stiffener 14.7-76 on the upper edge of portion 14.7-34, headband 14.7-26 may conform to a user's head when worn by the user. In other words, headband 14.7-26 may sit flat against the user's head across different curvatures of the head (e.g., headband 14.7-26 may distribute pressure evenly across a non-uniform surface). However, this is merely illustrative. If desired, stiffeners 14.7-76 may be formed on the upper edge of portion 14.7-32 or on the lower edge of portion 14.7-34, depending on the shape to which headband 14.7-26 needs to conform.

The foregoing is merely illustrative and various modifications can be made to the described embodiments. The foregoing embodiments may be implemented individually or in any combination.

14.8: Over the Head Strap

Head-mounted devices include head-mounted support structures that allow the devices to be worn on the heads of users. The head-mounted support structures may include device housings that enclose components such as displays. The displays may be used for presenting a user with visual content. The head-mounted support structures for a head-mounted device may also include headbands and other structures that help hold a device housing on the face of a user. The headbands of a head-mounted device may be removable. This allows users to swap different headbands into use to accommodate different head sizes and/or to update the style of headband being used.

In some embodiments, it may be desirable to attach multiple headbands to a head-mounted device. For example, one detachable headband may extend from the head-mounted support structures around the back of a user's head when worn, and another detachable headband may extend over the user's head. The user of two (or more) headbands may hold the head-mounted device against the user's face and prevent excessive pressure on the face when the device is worn. Both headbands may attach and detach from the same portion of the head-mounted support structures.

FIG. 14.8-1 is a side view of an illustrative head-mounted electronic device with multiple detectable headbands. As shown in FIG. 14.8-1, head-mounted device 14.8-10 may include head-mounted housing 14.8-12 (sometimes referred to as a main housing, main housing unit, head-mounted support structure, main housing portion, etc.). Housing 14.8-12 may have walls or other structures that separate an interior housing region from an exterior region surrounding housing 14.8-12. For example, housing 14.8-12 may have walls formed from polymer, glass, metal, and/or other materials. Electrical and optical components may be mounted in housing 14.8-12. These components may include components such as integrated circuits, sensors, control circuitry, input-output devices, etc.

To present a user with images for viewing from eye boxes (e.g., eye boxes in which the user's eyes are located when device 14.8-10 is being worn on the users' head), device 14.8-10 may include displays and lenses. These components may be mounted in optical modules 14.8-20 that face towards rear R of device 14.8-10 or may be mounted in other supporting structures in housing 14.8-12 to form respective left and right optical systems. There may be, for example, a left display for presenting an image through a left lens to a user's left eye in a left eye box and a right display for presenting an image to a user's right eye in a right eye box.

If desired, housing 14.8-12 may have forward-facing components such as cameras and other sensors on front F for gathering sensor measurements and other input and may have a soft cushion on opposing rear R. Rear R may have openings that allow the user to view images from left and right optical modules 14.8-20 (e.g., when rear R is resting on the front of the user's head).

Device 14.8-10 may have strap such as headband 14.8-26 and over-the-head headband 14.8-27 to help hold housing 14.8-12 on the user's head. Headbands 14.8-26 and 14.8-27 may have a fixed length or may be adjustable. Headbands 14.8-26 and 14.8-27 may have first and second ends coupled, respectively, to the left and right sides of housing 14.8-12. In the example of FIG. 14.8-1, coupling members 14.8-24, which serve as extensions of housing 14.8-12, are provided on the left and right sides of housing 14.8-12. Members 14.8-24 may be formed from rigid materials such as rigid polymer and/or other materials and may contain sensors, buttons, speakers, and other electrical components. Hinges and/or other mechanisms may be used to couple members 14.8-24 to housing 14.8-12 or members 14.8-24 may be formed as integral portions of a main housing unit.

The ends of headbands 14.8-26 and 14.8-27 may have coupling mechanisms such as openings, magnets, second posts, or other structures configured to attach to posts 14.8-30 (pins) or other protrusions on members 14.8-24 or other housing structures. In an illustrative configuration, these posts face inwardly towards the user's head and are not visible to people in the vicinity of device 14.8-10 when device 14.8-10 is being worn by the user. Releasable latch mechanisms can be used to help secure the ends of headband 14.8-26 and/or headband 14.8-27 to member 14.8-24. For example, a first detachable latch may be used to removably couple the left end of headband 14.8-26 to a left post in a left member 14.8-24 on a left side of housing 14.8-12 and a second detachable latch may be used to removably couple the right end of headband 14.8-26 to a right post in a right member 14.8-24 on a right side of housing 14.8-12. Third and fourth detachable latches may couple respective left and right ends of headband 14.8-27 to the left and right posts. Alternatively or additionally, headband 14.8-27 may be attached to the posts between the head-mounted support structures 14.8-24 and headband 14.8-26 to keep headband 14.8-27 attached to structures 14.8-24 when headband 14.8-26 is attached, and/or may use another structures, such as a magnetic structure or additional post, to attach to posts 14.8-30.

If desired, a user may flip the headband over so that the first detachable latch removable couples the end of headband 14.8-26 that was previously coupled to the left post to the right post and so that the second detachable latch removably couples the end of headband 14.8-26 that was previously coupled to the right post to the left post (e.g., the user may flip the left and right sides of the band without flipping the band inside out). Headband 14.8-27 also may have reversible ends, if desired. A user may open and close the latches when housing 14.8-12 is being worn or, in an illustrative configuration that is sometimes described herein as an example, a user may open and close the latches when housing 14.8-12 is not being worn.

The use of latch-based coupling mechanisms, magnetic structures, and/or or other mechanisms in device 14.8-10 may help allow a user to removably attach headbands 14.8-26 and 14.8-27 to members 14.8-24 and thereby removably attach headbands 14.8-26 and 14.8-27 to housing 14.8-12. Members 14.8-24 may have elongated shapes of the type shown in FIG. 14.8-1 and/or other suitable shapes and may sometimes be referred to as rigid straps, rigid coupling members, power straps, head-mounted device housing structures, elongated head-mounted device housing members, elongated housing structures, elongated housing members, or head-mounted device housing members (as examples).

Headbands 14.8-26 and 14.8-27 may be straps with soft flexible portions and/or rigid portions. As an example, a central portion of headband 14.8-26 and/or headband 14.8-27 may be formed from stretchable fabric. The central portions of headband 14.8-26 and/or headband 14.8-27 may have internal stiffening members, external fabric coverings and or other covering layers, strips of strengthening fabric, stretchable fabric portions (e.g., stretchable knit fabric), cosmetic coverings, and/or other headband structures.

Left and right end portions of headband 14.8-26 and/or headband 14.8-27 may be coupled to opposing ends of this central portion. The left and right end portions may, as an example, have stiffening structures (e.g., the left and right end portions may be stiffer than the central stretchable portion). Other types of configuration may be used for headband 14.8-26, if desired (e.g., arrangements with adjustable tensioning cables, etc.).

FIG. 14.8-2 is an illustrative diagram of an end portion of an illustrative headband 14.8-26, an end portion of an illustrative headband 14.8-27, and a corresponding end portion of an illustrative member 14.8-24. Headband 14.8-26, headband 14.8-27, and housing structures such as members 14.8-24 may sometimes be collectively referred to as a forming a head-mounted device headband system (headband system) 14.8-22. As shown in the example of FIG. 14.8-2, member 14.8-24 may have a protruding post such as post 14.8-30 (e.g., a post that protrudes out of member 14.8-24 towards a user's head while device 14.8-10 is being worn by the user). Headband 14.8-26 may have a corresponding opening 14.8-32 that is configured to receive post 14.8-30.

Post 14.8-30 may protrude inwardly (or, in some embodiments, outwardly) from member 14.8-24. Post 14.8-30 may be formed from metal, rigid polymer, other materials, and/or combinations of these materials. Member 14.8-24 may have a rigid portion to which post 14.8-30 is attached. This rigid portion may be formed from rigid polymer, metal, fabric, carbon-fiber composite materials, and/or other materials.

In the illustrative embodiment of FIG. 14.8-2, to attach headband 14.8-27 to post 14.8-30, headband 14.8-27 may include post 14.8-31. Post 14.8-31 may be formed from metal, rigid polymer, other materials, and/or combinations of these materials. In the present example, post 14.8-31 and post 14.8-30 have elongated shapes when viewed end-on (e.g., rectangular shapes with rounded corners). These elongated shapes may help resist rotational motion between longitudinal axis 14.8-34 of headband 14.8-26 and longitudinal axis 14.8-36 of member 14.8-24. This helps prevent headband 14.8-26 from slipping up or down along the rear surface of a user's head during use. In general, post 14.8-30 and/or mating opening 14.8-32 may have any suitable shapes (e.g., the shape of post 14.8-30 and/or opening 14.8-32 may be circular, oval, rectangular, triangular, may be a shape with curved edges and/or straight edges, may be a shape with drafted edges to help with alignment and/or insertion, etc.). The use of rectangular shapes with rounded corners and/or other shapes that are elongated is illustrative.

Post 14.8-31 may be slightly larger than post 14.8-30 to fit on top of post 14.8-30. If desired, post 14.8-31 may snugly fit onto post 14.8-30 to attach headband 14.8-27 to member 14.8-24. Additionally or alternatively, post 14.8-31 may include a latch, such as a structure biased with a spring or other suitable latch that engages an opening in the side of post 14.8-30, a magnet, or another suitable attachment to attach headband 14.8-27 to member 14.8-24. If a latch is used to attach headband 14.8-27 to post 14.8-30, tab 14.8-61T may be attached to the latch, and may be pulled to disengage the latch so that headband 14.8-27 may be released from member 14.8-24.

Opening 14.8-32 in headband 14.8-26 may be a through-hole opening with a shape that matches the outline of post 14.8-31. Through-hole opening 14.8-32 may be formed by cutting or otherwise forming an opening in headband 14.8-26. The periphery of opening 14.8-32 may be strengthened using a mating pair of ring members, which may sometimes be referred to as a cap and socket and may capture portions of headband 14.8-26.

In the present example, post 14.8-31 and opening 14.8-32 have elongated shapes when viewed end-on (e.g., rectangular shapes with rounded corners). Headband 14.8-26 may have a latch such as a structure biased with a spring or other suitable latch, in opening 14.8-32 that engages an opening in the side of post 14.8-31 to attach headband 14.8-26 to member headband 14.8-27. Tab 14.8-62T may be attached to the latch, and may be pulled to disengage the latch so that headband 14.8-26 may be released from member 14.8-27.

By including post 14.8-31 on headband 14.8-27 to overlap and attach to post 14.8-30, both headband 14.8-27 and band 14.8-26 may be attached to member 14.8-24. An illustrative cross-sectional side view of member 14.8-24, headband 14.8-26, and headband 14.8-27 attached together is shown in FIG. 14.8-3.

As shown in FIG. 14.8-3, post 14.8-30 on member 14.8-24 may extend into post 14.8-31 of headband 14.8-27. For example, post 14.8-31 may be a small amount larger than post 14.8-30 (e.g., less than 1 mm larger, less than 2 mm larger, or other suitable size difference) to allow post 14.8-31 to press onto post 14.8-30 and remain attached to post 14.8-30. Post 14.8-31 may then be inserted into opening 14.8-32 of headband 14.8-26, thereby attaching headband 14.8-26 to headband 14.8-27 and member 14.8-24.

In some embodiments, post 14.8-31 may be attached to post 14.8-30 with a latch, and/or headband 14.8-26 may be attached to post 14.8-31 with a latch. A cross-sectional side view of an illustrative latch that may be used to attach posts 14.8-30 and 14.8-31, and/or headband 14.8-26 and post 14.8-31 is shown in FIG. 14.8-4.

As shown in FIG. 14.8-4 system 14.8-22 may include a latching mechanism such as latch 14.8-62. Latch 14.8-62, which may sometimes be referred to as a latch mechanism or latch structures, may be opened and closed using magnets, springs, sliding members, toggling members, rotating members such as knobs, buttons, and/or other latch structures that may be manipulated by a user (e.g., a user's fingers). In the example of FIG. 14.8-4, the latch of headband 14.8-26 has a movable latch member that engages post 14.8-31 when post 14.8-31 is within opening 14.8-32 and has an associated release mechanism such as release tab 14.8-62T. Tab 14.8-62T, which may be formed from a flexible strip of material (e.g., fabric, polymer, and/or other material) may be pulled in direction 14.8-64 by a user (e.g., when a user grasps tab 14.8-62T between the user's fingers), thereby moving the movable latch member out of engagement with post 14.8-31. This releases post 14.8-31 and allows post 14.8-31 to be removed from opening 14.8-32. Magnets, spring structures, and/or other biasing structures may be used in closing the latch. In some embodiments, headband 14.8-27 and headband 14.8-26 may have magnets that facilitate attachment of headband 14.8-27 and headband 14.8-26. As shown in FIG. 14.8-4, for example, post 14.8-31 may have one or more magnets such as magnet 14.8-60. Magnet 14.8-60 may be used to attract and/or repel corresponding magnets in headband 14.8-26, which can assist in attaching headband 14.8-26 to headband 14.8-27 and/or can assist in closing latch 14.8-62.

Although FIG. 14.8-4 shows latch 14.8-62 attaching headband 14.8-26 to headband 14.8-27, latch 14.8-62 may additionally or alternatively be used to attach headband 14.8-27 to member 14.8-24. In particular, latch 14.8-62 may be formed in post 14.8-31 of headband 14.8-27, and may be moved in and out of a recess within post 14.8-30 of member 14.8-24 using tab 14.8-61T. In this way, headband 14.8-27 may be removably coupled to member 14.8-24 with a latch, such as latch 14.8-62.

In addition to, or instead of, using a post on headband 14.8-27 to attach headband 14.8-27 to member 14.8-24, magnets may be used for this attachment. An illustrative embodiment in which headband 14.8-27 is attached to member 14.8-24 using magnets is shown in FIG. 14.8-5.

As shown in FIG. 14.8-5, headband 14.8-26 may attach to post 14.8-30 at opening 14.8-32. For example, headband 14.8-26 may attach to post 14.8-30 in the same manner as headband 14.8-26 attaches to post 14.8-31 in FIG. 14.8-3. In particular, a latch in opening 14.8-32 (e.g., latch 14.8-62 of FIG. 14.8-4) may move into an opening within post 14.8-30, removably attaching headband 14.8-26 to member 14.8-24.

Headband 14.8-27 may be magnetically attached to post 14.8-30. In particular, magnet 14.8-33 may be inserted within post 14.8-30, and magnet 14.8-35 of headband 14.8-27 may be magnetically attached to magnet 14.8-33 of post 14.8-30. Because post 14.8-30 passes through opening 14.8-32 of headband 14.8-26, headband 14.8-27 may contact the upper surface of post 14.8-30, as magnets 14.8-33 and 14.8-35 attract post 14.8-30 and headband 14.8-27 together. An illustrative cross-sectional view of a magnetic attachment of headband 14.8-27 and member 14.8-24 is shown in FIG. 14.8-6.

As shown in FIG. 14.8-6, member 14.8-24 may have recess 14.8-37 formed in post 14.8-30. Magnet 14.8-33 may be coupled to post 14.8-30 within recess 14.8-37. Similarly, headband 14.8-27 may include recess 14.8-39, and magnet 14.8-35 may be coupled to headband 14.8-27 within recess 14.8-39. Magnets 14.8-33 and 14.8-35 may attach headband 14.8-27 to member 14.8-24.

Headband 14.8-26 may be between member 14.8-24 and headband 14.8-27 when headband 14.8-27 is magnetically attached to member 14.8-24. In particular, opening 14.8-32 of headband 14.8-26 may surround post 14.8-30. Headband 14.8-26 may be removably attached to member 14.8-24 with a latch in opening 14.8-32 (as shown in FIG. 14.8-5), and/or headband 14.8-26 may remain attached to member 14.8-24 due to headband 14.8-27 being magnetically attached to member 14.8-24.

The presence of recesses 14.8-37 and 14.8-39 to accommodate magnets 14.8-33 and 14.8-35 are merely illustrative. In general, one or more magnets may be attached to each of member 14.8-24 and headband 14.8-27 in any suitable manner.

Instead of, or in addition to, having recesses to accommodate magnets in member 14.8-24 and/or headband 14.8-27, recesses and protrusions may help attach and align headband 14.8-27 to member 14.8-24. An illustrative embodiment in which a recess and a protrusion are used for aligning and attaching member 14.8-24 and headband 14.8-27 is shown in FIG. 14.8-7.

As shown in FIG. 14.8-7, in addition to having magnets 14.8-35 and 14.8-37 coupling headband 14.8-27 to member 14.8-24, member 14.8-24 may have recess 14.8-40 in post 14.8-30, and headband 14.8-27 may have protrusion 14.8-42. Protrusion 14.8-42 may be inserted within recess 14.8-40 when headband 14.8-27 and member 14.8-24 are attached, which may improve the alignment and/or the attachment of headband 14.8-27 and member 14.8-24.

As in the embodiment of FIG. 14.8-6, headband 14.8-26 may be between member 14.8-24 and headband 14.8-27 when headband 14.8-27 is magnetically attached to member 14.8-24. In particular, opening 14.8-32 of headband 14.8-26 may surround post 14.8-30. Headband 14.8-26 may be removably attached to member 14.8-24 with a latch in opening 14.8-32 (as shown in FIG. 14.8-5), and/or headband 14.8-26 may remain attached to member 14.8-24 due to headband 14.8-27 being magnetically attached to member 14.8-24.

Although member 14.8-24 is shown as having recess 14.8-40, and headband 14.8-27 is shown as having protrusion 14.8-42, this is merely illustrative. Headband 14.8-27 may have a recess in which a protrusion of member 14.8-24 is inserted, if desired.

In other embodiments, headband 14.8-27 may be attached to member 14.8-24 directly, rather than at post 14.8-30, such as by wrapping around member 14.8-24 or clipping onto member 14.8-24. An illustrative embodiment in which headband 14.8-27 is attached to member 14.8-24 directly is shown in FIG. 14.8-8.

As shown in FIG. 14.8-8, headband 14.8-27 may be attached to member 14.8-24 with portions 14.8-44 and 14.8-46 that wrap around member 14.8-24. In particular, portions 14.8-44 and 14.8-46 may extend from the rest of headband 14.8-27, and may be on either side of post 14.8-30 of member 14.8-24. In some embodiments, headband 14.8-27 may be slid onto member 14.8-24 at end 14.8-25, and portions 14.8-44 and 14.8-46 may attach headband 14.8-27 to member 14.8-24.

Headband 14.8-26 may attach to post 14.8-30 directly, as opening 14.8-32 of headband 14.8-26 may surround post 14.8-30. Headband 14.8-26 may be removably attached to member 14.8-24 with a latch in opening 14.8-32 (as shown in FIG. 14.8-5) or another mechanism.

Although FIG. 14.8-8 shows portions 14.8-44 and 14.8-46 wrapping entirely around member 14.8-24, this is merely illustrative. If desired, headband 14.8-27 may have a single or multiple portions that clip onto (e.g., extend partially around) edges 14.8-21 and 14.8-23 of member 14.8-24. In this arrangement, headband 14.8-27 may be detached from member 14.8-24 (e.g., by unclipping the clip-on portions) without removing headband 14.8-26 from post 14.8-31. Alternatively or additionally, portion 14.8-46 may extend around and cover end 14.8-25 of member 14.8-24.

Instead of having portions of headband 14.8-27 that surround member 14.8-24 or clip onto member 14.8-24, headband 14.8-27 may include lugs that fit into openings in member 14.8-24 (e.g., headband 14.8-27 and member 14.8-24 may have a lug and socket system to attach headband 14.8-27 to member 14.8-24). An illustrative example of headband 14.8-27 attached to member 14.8-24 with a lug and socket system is shown in FIG. 14.8-9.

As shown in FIG. 14.8-9, headband 14.8-27 may have lugs 14.8-48 that are received within sockets 14.8-50 of member 14.8-24. Lugs 14.8-48 may be coupled by one or more springs or otherwise biased outward (e.g., into sockets 14.8-50). To release headband 14.8-27 from member 14.8-24, sliding member 14.8-52 may be slid within opening 14.8-54 of headband 14.8-27 to retract one of lugs 14.8-50. Headband 14.8-27 may then be removed from member 14.8-24. Headband 14.8-27 may be reattached to member 14.8-24 by inserting lugs 14.8-48 into sockets 14.8-50, which may include retracting one of the lugs by sliding member 14.8-52 within opening 14.8-54. In this way, headband 14.8-27 may be attached to member 14.8-24 using a lug and socket system.

Headband 14.8-26 may attach to post 14.8-30 directly, as opening 14.8-32 of headband 14.8-26 may surround post 14.8-30. Headband 14.8-26 may be removably attached to member 14.8-24 with a latch in opening 14.8-32 (as shown in FIG. 14.8-5) or another mechanism.

In some embodiments, post 14.8-30 of member 14.8-24 may be modified to accommodate both headband 14.8-26 and headband 14.8-27. For example, headband 14.8-27 may have an additional latch that connects headband 14.8-27 to member 14.8-24. An illustrative example of attaching headband 14.8-27 to member 14.8-24 with an additional latch is shown in FIGS. 14.8-10.

As shown in FIG. 14.8-10, headband 14.8-27 may include latch 14.8-56, and member 14.8-24 may have post 14.8-30 with recess 14.8-66. Latch 14.8-56 may be formed from metal, rigid polymer, or other material. Latch 14.8-56 may include protruding portion 14.8-68 that attaches to post 14.8-31 within recess 14.8-66. For example, latch 14.8-56 may be biased toward recess 14.8-66 by a spring, magnet, or other component. If it is desired to remove headband 14.8-27 from member 14.8-24, a user may push on portion 14.8-60 of latch 14.8-56 so that latch 14.8-56 rotates about hinge 14.8-58. Protruding portion 14.8-68 may slide out of recess 14.8-66, and headband 14.8-27 may be removed from member 14.8-24. To reattach headband 14.8-27, the user may use portion 14.8-60 to move protruding portion, which may move into position when released by the user. In some embodiments, post 14.8-30 and/or protruding portion 14.8-68 may be beveled so that user may insert headband 14.8-27 into post 14.8-30 without engaging portion 14.8-60 of latch 14.8-56.

Headband 14.8-26 may attach to post 14.8-30 directly, as opening 14.8-32 of headband 14.8-26 may surround post 14.8-30. Headband 14.8-26 may be removably attached to member 14.8-24 with a slidable latch member 14.8-62M that may be moved with tab 14.8-62T. As shown in FIG. 14.8-10, headband 14.8-26 may be attached to member 14.8-24 between member 14.8-24 and headband 14.8-27.

Instead of using latch 14.8-56 to attach headband 14.8-27 to member 14.8-24, an internal structure may be used. An illustrative example in which headband 14.8-27 is attached to member 14.8-24 using an internal structure is shown in FIG. 14.8-11.

As shown in FIG. 14.8-11, headband 14.8-27 may have protruding portion 14.8-70 that is inserted into opening 14.8-72 of post 14.8-30. Protruding portion 14.8-70 be formed from metal, rigid plastic, or other material. In some embodiments, protruding portion 14.8-70 may be slightly smaller (e.g., less than 1 mm smaller, less than 2 mm smaller, or other suitable difference) than opening 14.8-72. By inserting protruding portion 14.8-70 into opening 14.8-72, headband 14.8-27 may remain attached to member 14.8-24.

To remove headband 14.8-27 from, or attach headband 14.8-27 to, member 14.8-24, a user would merely have to apply enough force to overcome the friction between protruding portion 14.8-70 and opening 14.8-72.

If desired, additional material, such as material 14.8-74, may be added to protruding portion 14.8-70 to further secure headband 14.8-27 to member 14.8-24. Material 14.8-74 may be, for example, a polymer material, a gasket, or another suitable material. Post 14.8-30 may optionally have recessed portion 14.8-76 that matches the shape of material 14.8-74 to hold protruding portion 14.8-70 in place within opening 14.8-72.

To remove headband 14.8-27 from, or attach headband 14.8-27 to, member 14.8-24, a user would merely have to apply enough force to overcome the friction between material 14.8-74 and the sides of opening 14.8-72 (or the recess 14.8-76 once inserted).

Another attachment mechanism for coupling headband 14.8-27 to member 14.8-24 is a twist-to-lock system. An illustrative example of a twist-to-lock system is shown in FIG. 14.8-12

As shown in FIG. 14.8-12, headband 14.8-27 may have protrusion 14.8-78. Member 14.8-24 may have post 14.8-30 with opening 14.8-80. Protrusion 14.8-78 may fit through opening 14.8-80 perpendicularly, and may be twisted into proper position 14.8-82 once protrusion 14.8-78 passes through opening 14.8-80. Post 14.8-30 may have an at least partially hollow interior to allow protrusion 14.8-78 to swivel within post 14.8-30 into position 14.8-82. Once protrusion 14.8-78 is in position 14.8-82 within post 14.8-30, it may be locked into place. A user may detach headband 14.8-27 from member 14.8-24 by twisting headband 14.8-27 so that protrusion 14.8-78 is aligned with opening 14.8-82. In this way, a twist-to-lock system may attach headband 14.8-27 to member 14.8-24.

Although not shown in FIG. 14.8-12, headband 14.8-27 and post 14.8-30 may include magnets to further attach headband 14.8-27 to member 14.8-24. These magnets may be similar to those shown in FIGS. 14.8-5-14.8-7.

Moreover, although not shown in FIG. 14.8-12, headband 14.8-26 may be between member 14.8-24 and headband 14.8-27 prior to attaching headband 14.8-27 to member 14.8-24 with the twist-to-lock system. In particular, opening 14.8-32 of headband 14.8-26 may surround post 14.8-30. Headband 14.8-26 may be attached with a latch, such as the latch of FIG. 14.8-5, and/or may be held in place by headband 14.8-27 once it is attached to post 14.8-30 with the twist-to-lock system.

In some embodiments, headband 14.8-27 may be attached to member 14.8-24 and held in place by headband 14.8-26 attaching to member 14.8-24 with a latch. An illustrative example of such an embodiment is shown in FIG. 14.8-13.

As shown in FIG. 14.8-13, member 14.8-24 may have post 14.8-30 with shoulder 14.8-84. Member 14.8-24 may also have pins 14.8-86, although pins 14.8-86 may be omitted if desired. Headband 14.8-27 may have opening 14.8-88 that is slightly larger (e.g., less than 1 mm larger, less than 2 mm larger, or other suitable difference) than shoulder 14.8-84 of post 14.8-30. Headband 14.8-27 may be attached to member 14.8-24 by passing post 14.8-30 through opening 14.8-88, so that headband 14.8-27 surrounds shoulder 14.8-84.

To prevent headband 14.8-27 from detaching from member 14.8-24, headband 14.8-26 may be attached to post 14.8-30. In particular, opening 14.8-32 of headband 14.8-26 may surround post 14.8-30, and headband 14.8-26 may be removably attached to member 14.8-24 with a latch in opening 14.8-32 (as shown in FIG. 14.8-5) or another mechanism. When the latch is engaged and headband 14.8-26 is attached to member 14.8-24, headband 14.8-26 will be unable to detach from member 14.8-24.

Optional pins 14.8-86 may pass through optional holes 14.8-90 in headband 14.8-27. Pins 14.8-26 may prevent headband 14.8-27 from moving/rotating with respect to member 14.8-24. In this way, pins 14.8-26 may maintain headband 14.8-27 in a desired position on the user's head when worn.

Elastomer 14.8-92 may surround opening 14.8-88. Elastomer 14.8-92 may be formed from any desired elastomeric material, and may help prevent headband 14.8-27 from moving with respect to shoulder 14.8-84 or detaching from post 14.8-30. However, elastomer 14.8-92 may be omitted, if desired.

Regardless of whether elastomer 14.8-92 or pins 14.8-86 are included in the embodiment of FIG. 14.8-13, a cross-sectional side view is shown in FIG. 14.8-14. As shown in FIG. 14.8-14, headband 14.8-27 may surround shoulder portions 14.8-84 of post 14.8-30. Headband 14.8-26 may then rest on top of shoulders 14.8-84 of post 14.8-30. In this way, headband 14.8-27 may be held in place against member 14.8-24 by headband 14.8-26.

Although not shown in FIGS. 14.8-13 and 14.8-14, because headband 14.8-27 will be directly on member 14.8-24, material may be included on member 14.8-24 to keep headband 14.8-27 from moving (e.g., swiveling) when the head-mounted device is worn. For example, a gasket, such as a compressible gasket, elastomeric material, or other material may be formed on the surface of member 14.8-24 that is contacted by headband 14.8-27 when headband 14.8-27 is attached to member 14.8-24.

In some embodiments, headband 14.8-27 may be attached to member 14.8-24 with extendable magnets. Illustrative embodiments in which headband 14.8-27 is attached to member 14.8-24 with extendable magnets are shown in FIGS. 14.8-15A-14.8-17B.

As shown in FIG. 14.8-15A, post 14.8-30 may have magnet 14.8-94 in a stowed (e.g., non-extended) position. Post 14.8-30 may also include opening 14.8-96, which may accommodate a latch mechanism to attach headband 14.8-26 (e.g., the latch mechanism of FIG. 14.8-5). As shown in FIG. 14.8-15B, magnet 14.8-94 may extend into an extended position. Magnet 14.8-94 may include optional recess 14.8-98, which may be used to attach headband 14.8-27 to member 14.8-24.

As shown in FIG. 14.8-16, headband 14.8-27 may have opening 14.8-100. Opening 14.8-100 may receive magnet 14.8-94 when it is in the expanded position. Illustrative examples of magnet 14.8-94 expanding and attaching headband 14.8-27 is shown in FIGS. 14.8-17A and 14.8-17B.

As shown in FIG. 14.8-17A, headband 14.8-27 may be brought into contact with post 14.8-30 (e.g., with member 14.8-24). Headband 14.8-27 may have stationary magnet 14.8-102 within opening 14.8-100. As headband 14.8-27 is moved in direction 14.8-101, magnet 14.8-102 may attract magnet 14.8-94 in post 14.8-30. Eventually, as shown in FIG. 14.8-17B, magnet 14.8-94 may be moved into opening 14.8-100 of headband 14.8-27 due to the attractive magnetic force of magnet 14.8-102. Recess 14.8-98 of magnet 14.8-94 may be coupled to portion 14.8-104 of opening 14.8-100, thereby attaching headband 14.8-27 to post 14.8-30 with magnet 14.8-94. In this way, an extendable magnet may attach headband 14.8-27 to post 14.8-30 (and to member 14.8-24).

Although the embodiments of FIG. 14.8-2-17B have described attaching headband 14.8-27 to member 14.8-24 in a variety of ways, this is merely illustrative. In general, headband 14.8-26 or any other headband may be attached to member 14.8-24 using any of the attachments of FIG. 14.8-2-17B. Alternatively or additionally, although sometimes described herein in the context of examples where posts 14.8-30 are formed on members 14.8-24 and openings 14.8-32 are formed in headband 14.8-26, posts 14.8-30 may, if desired, be formed as part of headband 14.8-26 and openings 14.8-32 may be formed in members 14.8-24.

The foregoing is merely illustrative and various modifications can be made to the described embodiments. The foregoing embodiments may be implemented individually or in any combination.

XV: User Interface

FIGS. 1-1A to 14.6-4 illustrate various examples of computer systems that can be used to perform the methods and provide audio, visual and/or haptic feedback as part of user interfaces described herein. In some embodiments, the exemplary computer system includes one or more display generation components (e.g., first and second display assemblies 1-120*a*, 1-120*b* and/or first and second optical modules 11.1.1-104*a* and 11.1.1-104*b*) for displaying virtual elements and/or a representation of a physical environment to a user of the computer system, optionally generated based on detected events and/or user inputs detected by the computer system. User interfaces generated by the computer system are optionally corrected by one or more corrective lenses 11.3.2-216 that are optionally removably attached to one or more of the optical modules to enable the user interfaces to be more easily viewed by users who would otherwise use glasses or contacts to correct their vision. While many user interfaces illustrated herein show a single view of a user interface, user interfaces in an HMD are optionally displayed using two optical modules (e.g., first and second display assemblies 1-120*a*, 1-120*b* and/or first and second optical modules 11.1.1-104*a* and 11.1.1-104*b*), one for a user's right eye and a different one for a user's left eye, and slightly different images are presented to the two different eyes to generate the illusion of stereoscopic depth, the single view of the user interface would typically be either a right-eye or left-eye view and the depth effect is explained in the text or using other schematic charts or views. In some embodiments, the computer system includes one or more external displays (e.g., display assembly 1-108) for displaying status information for the computer system to the user of the computer system (when the computer system is not being worn) and/or to other people who are near the computer system, optionally generated based on detected events and/or user inputs detected by the computer system. In some embodiments, the computer system includes one or more audio output components (e.g., electronic component 1-112) for generating audio feedback, optionally generated based on detected events and/or user inputs detected by the computer system. In some embodiments, the computer system includes one or more input devices for detecting input such as one or more sensors (e.g., one or more sensors in sensor assembly 1-356, and/or FIG. 1I) for detecting information about a physical environment of the device which can be used (optionally in conjunction with one or more illuminators such as the illuminators describe in FIG. 61) to generate a digital passthrough image, capture visual media corresponding to the physical environment (e.g., photos and/or video), or determine a pose (e.g., position and/or orientation) of physical objects and/or surfaces in the physical environment so that virtual objects ban be placed based on a detected pose of physical objects and/or surfaces. In at least one example, the virtual objects can represent structural objects, and can be referred to as virtual structural objects, with which the user can interact via detected hand gestures and other body movement. In one example, the virtual structural objects can include virtual buttons, dials, crowns, keyboards, or other physical input mechanisms and devices represented virtually and manipulatable by the user. In some embodiments, the computer system includes one or more input devices for detecting input such as one or more sensors for detecting hand position and/or movement (e.g., one or more sensors in sensor assembly 1-356, and/or FIG. 1I) that can be used (optionally in conjunction with one or more illuminators such as the illuminators 6-124 describe in FIG. 61) to determine when one or more air gestures have been performed. In some embodiments, the computer system includes one or more input devices for detecting an input such as one or more sensors for detecting eye movement (e.g., eye tracking and gaze tracking sensors in FIG. 1I) which can be used (optionally in conjunction with one or more lights such as lights 11.3.2-110 in FIG. 10) to determine attention or gaze position and/or gaze movement, which can optionally be used to detect gaze-only inputs based on gaze movement and/or dwell. A combination of the various sensors described above can be used to determine user facial expressions and/or hand movements for use in generating an avatar or representation of the user such as an anthropomorphic avatar or representation for use in a real-time communication session where the avatar has facial expressions, hand movements, and/or body movements that are based on or similar to detected facial expressions, hand movements, and/or body movements of a user of the device. Gaze and/or attention information is, optionally, combined with hand tracking information to determine interactions between the user and one or more user interfaces based on direct and/or indirect inputs such as air gestures or inputs that use one or more hardware input devices such as one or more buttons (e.g., first button 1-128, button 11.1.1-114, second button 1-132, and or dial or button 1-328), knobs (e.g., first button 1-128, button 11.1.1-114, and/or dial or button 1-328), digital crowns (e.g., first button 1-128 which is depressible and twistable or rotatable, button 11.1.1-114, and/or dial or button 1-328), trackpads, touch screens, keyboards, mice and/or other input devices. One or more buttons (e.g., first button 1-128, button 11.1.1-114, second button 1-132, and or dial or button 1-328) are optionally used to perform system operations such as recentering content in a three-dimensional environment that is visible to a user of the device, displaying a home user interface for launching applications, starting real-time communication sessions, or initiating display of virtual three-dimensional backgrounds. Knobs or digital crowns (e.g., first button 1-128 which is depressible and twistable or rotatable, button 11.1.1-114, and/or dial or button 1-328) are optionally rotatable to adjust parameters of the visual content such as a level of immersion of a virtual three-dimensional environment (e.g., a degree to which virtual-content occupies the viewport of the user into the three-dimensional environment) or other parameters associated with the three-dimensional environment and the virtual content that is displayed via the optical modules (e.g., first and second display assemblies 1-120*a*, 1-120*b* and/or first and second optical modules 11.1.1-104*a* and 11.1.1-104*b*).

Viewpoint/View

In an augmented reality, mixed reality, or virtual reality environment, a view of a three-dimensional environment is visible to a user. The view of the three-dimensional environment is typically visible to the user via one or more display generation components (e.g., a display or a pair of display modules that provide stereoscopic content to different eyes of the same user) through a virtual viewport that has a viewport boundary that defines an extent of the three-dimensional environment that is visible to the user via the one or more display generation components. In some examples, the region defined by the viewport boundary is smaller than a range of vision of the user in one or more dimensions (e.g., based on the range of vision of the user, size, optical properties or other physical characteristics of the one or more display generation components, and/or the location and/or orientation of the one or more display generation components relative to the eyes of the user). In some embodiments, the region defined by the viewport boundary is larger than a range of vision of the user in one or more dimensions (e.g., based on the range of vision of the user, size, optical properties or other physical characteristics of the one or more display generation components, and/or the location and/or orientation of the one or more display generation components relative to the eyes of the user). The viewport and viewport boundary typically move as the one or more display generation components move (e.g., moving with a head of the user for a head mounted device or moving with a hand of a user for a handheld device such as a tablet or smartphone). A viewpoint of a user determines what content is visible in the viewport, a viewpoint generally specifies a location and a direction relative to the three-dimensional environment, and as the viewpoint shifts, the view of the three-dimensional environment will also shift in the viewport. For a head mounted device, a viewpoint is typically based on a location and direction of the head, face, and/or eyes of a user to provide a view of the three-dimensional environment that is perceptually accurate and provides an immersive experience when the user is using the head-mounted device. For a handheld or stationed device, the viewpoint shifts as the handheld or stationed device is moved, and/or as a position of a user relative to the handheld or stationed device changes (e.g., a user moving toward, away from, up, down, to the right, and/or to the left of the device). For devices that include display generation components with virtual passthrough, portions of the physical environment that are visible (e.g., displayed, and/or projected) via the one or more display generation components are based on a field of view of one or more cameras in communication with the display generation components which typically move with the display generation components (e.g., moving with a head of the user for a head mounted device or moving with a hand of a user for a handheld device such as a tablet or smartphone) because the viewpoint of the user moves as the field of view of the one or more cameras moves (and the appearance of one or more virtual objects displayed via the one or more display generation components is updated based on the viewpoint of the user (e.g., displayed positions and poses of the virtual objects are updated based on the movement of the viewpoint of the user)). For display generation components with optical passthrough, portions of the physical environment that are visible (e.g., optically visible through one or more partially or fully transparent portions of the display generation component) via the one or more display generation components are based on a field of view of a user through the partially or fully transparent portion(s) of the display generation component (e.g., moving with a head of the user for a head mounted device or moving with a hand of a user for a handheld device such as a tablet or smartphone) because the viewpoint of the user moves as the field of view of the user through the partially or fully transparent portions of the display generation components moves (and the appearance of one or more virtual objects is updated based on the viewpoint of the user).

Air Gestures

In some embodiments, a gesture includes an air gesture. An air gesture is a gesture that is detected without the user touching (or independently of) an input element that is part of a device (e.g., computer system 101, one or more input device 125, and/or hand tracking device 140) and is based on detected motion of a portion (e.g., the head, one or more arms, one or more hands, one or more fingers, and/or one or more legs) of the user's body through the air including motion of the user's body relative to an absolute reference (e.g., an angle of the user's arm relative to the ground or a distance of the user's hand relative to the ground), relative to another portion of the user's body (e.g., movement of a hand of the user relative to a shoulder of the user, movement of one hand of the user relative to another hand of the user, and/or movement of a finger of the user relative to another finger or portion of a hand of the user), and/or absolute motion of a portion of the user's body (e.g., a tap gesture that includes movement of a hand in a predetermined pose by a predetermined amount and/or speed, or a shake gesture that includes a predetermined speed or amount of rotation of a portion of the user's body).

In some embodiments, input gestures used in the various examples and embodiments described herein include air gestures performed by movement of the user's finger(s) relative to other finger(s) or part(s) of the user's hand) for interacting with an XR environment (e.g., a virtual or mixed-reality environment), in accordance with some embodiments. In some embodiments, an air gesture is a gesture that is detected without the user touching an input element that is part of the device (or independently of an input element that is a part of the device) and is based on detected motion of a portion of the user's body through the air including motion of the user's body relative to an absolute reference (e.g., an angle of the user's arm relative to the ground or a distance of the user's hand relative to the ground), relative to another portion of the user's body (e.g., movement of a hand of the user relative to a shoulder of the user, movement of one hand of the user relative to another hand of the user, and/or movement of a finger of the user relative to another finger or portion of a hand of the user), and/or absolute motion of a portion of the user's body (e.g., a tap gesture that includes movement of a hand in a predetermined pose by a predetermined amount and/or speed, or a shake gesture that includes a predetermined speed or amount of rotation of a portion of the user's body).

In some embodiments in which the input gesture is an air gesture (e.g., in the absence of physical contact with an input device that provides the computer system with information about which user interface element is the target of the user input, such as contact with a user interface element displayed on a touchscreen, or contact with a mouse or trackpad to move a cursor to the user interface element), the gesture takes into account the user's attention (e.g., gaze) to determine the target of the user input (e.g., for direct inputs, as described below). Thus, in implementations involving air gestures, the input gesture is, for example, detected attention (e.g., gaze) toward the user interface element in combination (e.g., concurrent) with movement of a user's finger(s) and/or hands to perform a pinch and/or tap input, as described in more detail below.

Air Tap and Air Pinch

In some embodiments, input gestures that are directed to a user interface object are performed directly or indirectly with reference to a user interface object. For example, a user input is performed directly on the user interface object in accordance with performing the input gesture with the user's hand at a position that corresponds to the position of the user interface object in the three-dimensional environment (e.g., as determined based on a current viewpoint of the user). In some embodiments, the input gesture is performed indirectly on the user interface object in accordance with the user performing the input gesture while a position of the user's hand is not at the position that corresponds to the position of the user interface object in the three-dimensional environment while detecting the user's attention (e.g., gaze) on the user interface object. For example, for direct input gesture, the user is enabled to direct the user's input to the user interface object by initiating the gesture at, or near, a position corresponding to the displayed position of the user interface object (e.g., within 0.5 cm, 1 cm, 5 cm, or a distance between 0-5 cm, as measured from an outer edge of the option or a center portion of the option). For an indirect input gesture, the user is enabled to direct the user's input to the user interface object by paying attention to the user interface object (e.g., by gazing at the user interface object) and, while paying attention to the option, the user initiates the input gesture (e.g., at any position that is detectable by the computer system) (e.g., at a position that does not correspond to the displayed position of the user interface object).

In some embodiments, input gestures (e.g., air gestures) used in the various examples and embodiments described herein include pinch inputs and tap inputs, for interacting with a virtual or mixed-reality environment, in accordance with some embodiments. For example, the pinch inputs and tap inputs described below are performed as air gestures.

In some embodiments, a pinch input is part of an air gesture that includes one or more of: a pinch gesture, a long pinch gesture, a pinch and drag gesture, or a double pinch gesture. For example, a pinch gesture that is an air gesture includes movement of two or more fingers of a hand to make contact with one another, that is, optionally, followed by an immediate (e.g., within 0-1 seconds) break in contact from each other. A long pinch gesture that is an air gesture includes movement of two or more fingers of a hand to make contact with one another for at least a threshold amount of time (e.g., at least 1 second), before detecting a break in contact with one another. For example, a long pinch gesture includes the user holding a pinch gesture (e.g., with the two or more fingers making contact), and the long pinch gesture continues until a break in contact between the two or more fingers is detected. In some embodiments, a double pinch gesture that is an air gesture comprises two (e.g., or more) pinch inputs (e.g., performed by the same hand) detected in immediate (e.g., within a predefined time period) succession of each other. For example, the user performs a first pinch input (e.g., a pinch input or a long pinch input), releases the first pinch input (e.g., breaks contact between the two or more fingers), and performs a second pinch input within a predefined time period (e.g., within 1 second or within 2 seconds) after releasing the first pinch input.

In some embodiments, a pinch and drag gesture that is an air gesture includes a pinch gesture (e.g., a pinch gesture or a long pinch gesture) performed in conjunction with (e.g., followed by) a drag input that changes a position of the user's hand from a first position (e.g., a start position of the drag) to a second position (e.g., an end position of the drag). In some embodiments, the user maintains the pinch gesture while performing the drag input, and releases the pinch gesture (e.g., opens their two or more fingers) to end the drag gesture (e.g., at the second position). In some embodiments, the pinch input and the drag input are performed by the same hand (e.g., the user pinches two or more fingers to make contact with one another and moves the same hand to the second position in the air with the drag gesture). In some embodiments, the pinch input is performed by a first hand of the user and the drag input is performed by the second hand of the user (e.g., the user's second hand moves from the first position to the second position in the air while the user continues the pinch input with the user's first hand. In some embodiments, an input gesture that is an air gesture includes inputs (e.g., pinch and/or tap inputs) performed using both of the user's two hands. For example, the input gesture includes two (e.g., or more) pinch inputs performed in conjunction with (e.g., concurrently with, or within a predefined time period of) each other. For example, a first pinch gesture performed using a first hand of the user (e.g., a pinch input, a long pinch input, or a pinch and drag input), and, in conjunction with performing the pinch input using the first hand, performing a second pinch input using the other hand (e.g., the second hand of the user's two hands).

In some embodiments, a tap input (e.g., directed to a user interface element) performed as an air gesture includes movement of a user's finger(s) toward the user interface element, movement of the user's hand toward the user interface element optionally with the user's finger(s) extended toward the user interface element, a downward motion of a user's finger (e.g., mimicking a mouse click motion or a tap on a touchscreen), or other predefined movement of the user's hand. In some embodiments a tap input that is performed as an air gesture is detected based on movement characteristics of the finger or hand performing the tap gesture movement of a finger or hand away from the viewpoint of the user and/or toward an object that is the target of the tap input followed by an end of the movement. In some embodiments the end of the movement is detected based on a change in movement characteristics of the finger or hand performing the tap gesture (e.g., an end of movement away from the viewpoint of the user and/or toward the object that is the target of the tap input, a reversal of direction of movement of the finger or hand, and/or a reversal of a direction of acceleration of movement of the finger or hand).

Attention

In some embodiments, attention of a user is determined to be directed to a portion of the three-dimensional environment based on detection of gaze directed to the portion of the three-dimensional environment (optionally, without requiring other conditions). In some embodiments, attention of a user is determined to be directed to a portion of the three-dimensional environment based on detection of gaze directed to the portion of the three-dimensional environment with one or more additional conditions such as requiring that gaze is directed to the portion of the three-dimensional environment for at least a threshold duration (e.g., a dwell duration) and/or requiring that the gaze is directed to the portion of the three-dimensional environment while the viewpoint of the user is within a distance threshold from the portion of the three-dimensional environment in order for the device to determine that attention of the user is directed to the portion of the three-dimensional environment, where if one of the additional conditions is not met, the device determines that attention is not directed to the portion of the three-dimensional environment toward which gaze is directed (e.g., until the one or more additional conditions are met). Further details of the user interface and user experience are provided below with reference to FIG. 15-1.

In FIG. 15-1, electronic device 15.1-700 detects that an interpupillary distance (IPD) setting of electronic device 15.1-700 does not match an interpupillary distance of a user of electronic device 15.1-700 (e.g., as detected, estimated, and/or determined by electronic device 15.1-700). For example, in some embodiments, electronic device 15.1-700 is a head-mounted system that includes two or more optical components (e.g., two or more optical lenses and/or two or more display generation components such as, for example, two or more transparent display generation components), with a first optical component positioned in front of a first eye of the user and a second optical component positioned in front of a second eye of the user. In some embodiments, the IPD setting of electronic device 15.1-700 corresponds to the distance between the two optical components, and the IPD setting is adjustable to move the two optical components further apart or closer together so that they are positioned correctly relative to the two eyes of the user (e.g., the IPD setting is adjustable to move the two optical components further apart or closer together until the IPD setting of electronic device 15.1-700 matches the interpupillary distance of the user). At FIG. 15-1, electronic device 15.1-700 detects the interpupillary distance of the user (e.g., via sensors 15.1-707), and determines that the IPD setting of electronic device 15.1-700 does not match the interpupillary distance of the user (e.g., the two optical components should be moved closer together or further apart). In FIG. 15-1, in response to detecting that the IPD setting of electronic device 15.1-700 does not match the interpupillary distance of the user (and, optionally, in response to determining that electronic device 15.1-700 does not satisfy the one or more error conditions), electronic device 15.1-700 displays user interface 15.1-712. In some embodiments, when electronic device 15.1-700 detects that the IPD setting of electronic device 15.1-700 matches the interpupillary distance of the user (e.g., the two optical components of electronic device 15.1-700 are positioned in a predetermined position, or within a predetermined range of positions, relative to the two eyes of the user), electronic device 15.1-700 forgoes display of user interface 15.1-712 (and, optionally, displays a different user interface).

In FIG. 15-1, user interface 15.1-712 includes object 15.1-714, which is representative of electronic device 15.1-700, and objects **15.1-716*a*-15.1-716*b*, which are representative of buttons 15.1-706*a* and 15.1-706*b*, respectively. User interface 15.1-712 also includes objects 15.1-718*a*-15.1-718*c*. In some embodiments, one or more of objects 15.1-718*a*-15.1-718*c* are representative of physical components of electronic device 15.1-700. For example, in some embodiments, object 15.1-718*a* is representative of a first optical component (e.g., a first optical lens and/or a first display generation component), and object 15.1-718*b* is representative of a second optical component (e.g., a second optical lens and/or a second display generation component). As will be described and shown in greater detail below, in some embodiments, object 15.1-718*a* and object 15.1-718*b* move relative to one another on display 15.1-702 to indicate movement of the corresponding physical components of electronic device 15.1-700. User interface 15.1-712 also includes arrow 15.1-720 and prompt 15.1-722, which instruct the user to hold down button 15.1-706*b* (represented in user interface 15.1-712 by object 15.1-716*b*) in order to align one or more physical components of electronic device 15.1-700 (e.g., in order to adjust the IPD setting of electronic device 15.1-700 and/or to move one or more optical components of electronic device 15.1-700). In FIG. 15-1, while the IPD setting of electronic device 15.1-700 is not being adjusted (e.g., while a user does not provide user input to button 15.1-706*a* and/or button 15.1-706*b*), electronic device 15.1-700 outputs audio output 15.1-711*a*. In some embodiments, audio output 15.1-711*a* is an ambient audio output that indicates that the IPD setting of the electronic device 15.1-700 is not currently being modified and/or changed. At FIG. 15-1, electronic device 15.1-700 detects user input 15.1-724, which is a button press of button 15.1-706*b*. In FIG. 15-1, user input 15.1-724 is a button press of button 15.1-706*b*. However, in some embodiments, user input 15.1-724 is a different type of user input (e.g., a gesture, an air gesture, a touch input, a rotation input, a gaze-based input, and/or any combination of the foregoing). In addition, the device 15.1-700 can include other buttons, including button 15.1-704, which can also be pressed, turned, or otherwise actuated to perform similar or different functions to those described above with reference to buttons 15.1-706*a-b*. Buttons 15.1-706*a-b* and 15.1-704** can include mechanically depressible buttons, touch sensitive buttons such as capacitive sensing buttons, twistable/rotatable dials such as the crowns or buttons described elsewhere herein, or any other type of button.

Any of the features, components, and/or parts, including the arrangements and configurations thereof shown in FIG. 15-1 can be included, either alone or in any combination, in any of the other examples of devices, features, components, and parts shown elsewhere and described herein. Likewise, any of the features, components, and/or parts, including the arrangements and configurations thereof shown and described with reference to figures shown elsewhere can be included, either alone or in any combination, in the example of the devices, features, components, and parts shown in FIG. 15-1.

As illustrated in FIG. 15-2A, while displaying mode control affordance 15.2-746 having photo mode affordance 15.2-746A and video mode affordance 15.2-746B, with video mode affordance 15.2-746B highlighted and shutter affordance 15.2-718 with the color fill, computer system 15.2-700 detects a sixth potential media capture input, such as button press input 15.2-748A of hardware button 15.2-706, air gesture input 15.2-748B, and/or tap input 15.2-748C while gaze 15.2-732 is directed at shutter affordance 15.2-718 and accordingly initiates media capture. As the video media capture mode is currently selected, computer system 15.2-700 begins capturing video media. The computer system 15.2-700 can include an electronic device 15.2-702, which in one example can be a part of a head-mountable device or other wearable electronic device including a display screen displaying images. The device 15.2-700 can include a border 15.2-714 of a housing or other structural frame, a user interface 15.2-710 displayed on a display 15.2-708. The device 15.2-702 can be configured to detect eye gaze and hand 15.2-726 gestures for controlling the user interface 15.2-710. The user interface 15.2-710 of the display 15.2-708 can include indicators 15.2-722A and 15.2-722B as well as darkened area 15.2-716. The display 15.2-708 can be a user facing display of the HMDs described herein. Finger 15.2-724 can be used by the user to depress any number of buttons of the HMD to input commands to alter the user interface 15.2-710 as described herein.

As illustrated in FIG. 15-2B, while capturing video media, computer system 15.2-700 ceases display of mode control affordance 15.2-746 and instead displays video status affordance 15.2-750 in the lower region of camera viewfinder 15.2-712. Video status affordance 15.2-750 indicates that video media is currently being captured and includes the currently elapsed time of the video capture. Upon beginning the video capture, computer system 15.2-700 initially displays video status affordance 15.2-750 opaquely. After a threshold amount of time (e.g., a few seconds) without detecting gaze 15.2-732 directed at video status affordance 15.2-750, computer system 15.2-700 increases the translucency (e.g., reduces the opacity) of video status affordance 15.2-750 (e.g., as described above with respect to changing the visual prominence of captured media icon 15.2-738 and/or mode control affordance 15.2-746). In response to detecting gaze 15.2-732 directed at video status affordance 15.2-750, computer system 15.2-700 decreases the translucency (e.g., increases the opacity) of video status affordance 15.2-750.

Any of the features, components, and/or parts, including the arrangements and configurations thereof shown in FIG. 15-2A and FIG. 15-2B can be included, either alone or in any combination, in any of the other examples of devices, features, components, and parts shown elsewhere and described herein. Likewise, any of the features, components, and/or parts, including the arrangements and configurations thereof shown and described with reference to figures shown elsewhere can be included, either alone or in any combination, in the example of the devices, features, components, and parts shown in FIG. 15-2A and FIG. 15-2B.

FIG. 15-3A and FIG. 15-3B show an example of a computer system 15.3-101, which can include a device such as an HMD. The HMD can include rearward facing displays or display screens, similar to the display showing the three-dimensional environment 15.3-702 illustrated in FIG. 15-3A and 15-3B. The device can include one or more image sensors 314, similar to other sensors and cameras of HMDs shown and described elsewhere herein. The display can show various virtual objects **15.3-*a*-15.3-*h*, 15.3-706, 15.3-708, 15.3-732*a* and 15.3-732*c*, as well indicators for thresholds 15.3-734*a-d* and 15.3-738*a-b***. The display can be configured to project light toward a user's eyes when donning the HMD and forward facing cameras and sensors can capture the environment external to the device and the display can display those images, as well as various virtual objects, to the user through the display projecting the various virtual objects noted herein and shown in the figures.

In some embodiments, if the attention input indicates that the attention of the user has changed away from the gaze virtual object (or corresponding virtual object) and subsequently moved back to the gaze virtual object (or corresponding virtual object), the computer system 15.3-101 updates the visual indication of progress of the attention of the user directed towards satisfying the one or more criteria for performing an operation associated with a corresponding virtual object based on whether the attention input moved back to the object within a threshold time (e.g., 0.03, 0.05, 0.07, 0.09, 0.1, 0.15, 0.2, 0.25, 0.3, 0.5, 1, 3, 5, 10, 15, 20, or 30 seconds). For example, in FIG. 15-3A, the visual indication of progress in the gaze target for object **15.3-704*a* is maintained (e.g., continued from the amount of fill prior to the attention of the user changed away) because the attention of the user (e.g., attention input 15.3-716**) changed from being directed away from the gaze virtual object 15.3-704*a*' of virtual object 15.3-704*a* to being directed to the gaze virtual object 15.3-704*a*' of virtual object 15.3-704*a* within the time threshold. In some embodiments, the computer system 15.3-101 updates the visual indication of progress, different from maintaining the indication of progress as will be described in the following figures.

In some embodiments, if the attention input includes an activation input, the computer system 15.3-101 performs the operation associated with the virtual object. For example, in FIG. 15-3A, the computer system 15.3-101 detects an activation input (e.g., finger of hand 15.3-710 touching trackpad 15.3-746 and/or an air pinch gesture from hand 15.3-710) before attention 15.3-716 satisfies the one or more criteria with respect to the gaze virtual object 15.3-704*a*' for object 15.3-704*a* for performing the operation associated with the virtual object; for example, before the duration of the attention input 15.3-716 directed towards the gaze virtual object 15.3-704*a*' associated with virtual object 15.3-704*a* reaches threshold 15.3-734*d* as shown by timer 15.3-734 in FIG. 15-3A. In response to detecting the activation input before satisfying the one or more criteria (e.g., reaching threshold 15.3-734*d*), the computer system 15.3-101 optionally performs the operation associated with the virtual object 15.3-704*a* such as updating the right side of virtual object 15.3-704 to include content associated with virtual object 15.3-704*a* as shown in FIG. 15-3B.

In some embodiments, in response to detecting that recent interactions with computer system include attention-only inputs or non-attention inputs, the computer system 15.3-101 optionally changes (e.g., shortens or lengthens) the threshold requirement to display gaze virtual objects. For example, after detecting that the attention input includes attention-only inputs (e.g., does not include non-attention inputs, such as inputs from hand 15.3-710), the computer system 15.3-101 shortens the time threshold for displaying a gaze virtual object for a virtual object to 15.3-732*b*', as shown in FIG. 15-3A. In another example, after detecting that recent interaction with computer system 15.3-101 includes non-attention inputs, the computer system 15.3-101 optionally lengthens the time threshold for displaying a gaze virtual object for a virtual object to 738*b*, as shown in FIG. 15-3B.

Any of the features, components, and/or parts, including the arrangements and configurations thereof shown in FIG. 15-3A and 15-3B can be included, either alone or in any combination, in any of the other examples of devices, features, components, and parts shown elsewhere and described herein. Likewise, any of the features, components, and/or parts, including the arrangements and configurations thereof shown and described with reference to figures shown elsewhere can be included, either alone or in any combination, in the example of the devices, features, components, and parts shown in FIG. 15-3A and 15-3B.

FIG. 15-4A and FIG. 15-4B show first and second display generation components 15.4-7100 and 15.4-7102, which can include cameras or sensors 15.4-7104 and 15.4-7106, respectively. The display generation components 15.4-7100 and 15.4-7102 be or include head mountable display devices operated in different locations 15.4-7000-*a* and 15.4-7000*b*, as shown in FIGS. 15-4A and 15-4B. In at least one example, the HMDs can also include one or more buttons 15.4-7302 to control the displayed content or other functionalities of the device, as described elsewhere herein. The button 15.4-7302 can include a dial. In at least one example, the display generation components 15.4-7100 and 15.4-7102 can display mixed/virtual reality (MR, VR, or XR) content 15.4-7002. Various virtual objects, including a progress bar 15.4-7004 and overlay 15.4-7008 can be displayed as shown.

In some embodiments, the computer system detects whether criteria for changing the current level of immersion are met, while displaying the XR content via the first display generation component 15.4-7100 with a respective level of immersion. In response to detecting that the criteria for changing the current level of immersion are met, the computer system changes the level of immersion with which the XR content is displayed via the first display generation component 15.4-7100, and changes the appearance of the graphical elements that represent the status associated with the user shown via the second display generation component 15.4-7102. For example, as shown in FIGS. 15-4A-15-4B, in some embodiments, the computer system determines that the criteria for changing the level of immersion are met in accordance with detection of actions of the second user 15.4-7204 that is present in the physical environment (e.g., in the location B 15.4-7000-*b* in FIG. 15-4A). For example, in some embodiments, detecting the actions of the second user 15.4-7204 that cause the computer system to change the current level of immersion (e.g., when the current level of immersion is a fully immersive level, or more than a threshold level of immersion) includes detecting that the second user 15.4-7204 has moved into a region in front of the second display generation component 15.4-7102 (e.g., also the region in front of the first user 15.4-7202 if the first user is wearing the HMD including the first display generation component 15.4-7100 and the second display generation component 15.4-7102). In some embodiments, detecting the actions of the second user 15.4-7204 that cause the computer system to change the current level of immersion (e.g., when the current level of immersion is a fully immersive level, or more than a threshold level of immersion) includes detecting that the second user 15.4-7204 is making a gesture (e.g., waving to the first user 15.4-7202, tapping on the shoulder or arm of the first user 15.4-7202, or other gestures that calls for the attention of the first user 15.4-7202) to the first user 15.4-7202. As shown in FIG. 15-4A, the second user 15.4-7204 has moved to a region in front of the second display generation component 15.4-7102, is waving to the first user 15.4-7202, and/or is calling out the name of the first user 15.4-7202; and upon detecting one or more of the above, the computer system determines that the criteria for changing the current level of immersion are met, in accordance with some embodiments. In Figure M, in response to detecting that the criteria for changing the current level of immersion are met, the computer system changes the way that XR content is displayed via the first display generation component in accordance with the change of the current level of immersion, in accordance with some embodiments. In this example scenario shown in FIGS. 15-4A-15-4B, the computer system decreases the level of immersion from a fully immersive level to an intermediate level of immersion, and displays a representation of the physical environment (e.g., including a representation 15.4-7312 of the physical object 15.4-7314 in the physical environment (e.g., in location B 15.4-7000-*b*), and a representation 15.4-7010 of the second user 15.4-7204) in front of the first user (e.g., in location B 15.4-7000-*b*) among the XR content displayed via the first display generation component 15.4-7100. In addition, when the computer system decreases the level of immersion from a fully immersive level to an intermediate level of immersion, the computer system also displays the representation 15.4-7006 of the portion of the body of the first user 15.4-7202 via the second display generation component 15.4-7102, in accordance with some embodiments. The representation 15.4-7006 of the portion of the body of the first user 15.4-7202 are updated in accordance with the changes in appearance of the first user 15.4-7202, and the graphical elements that indicate the status of the XR content and the current level of immersion are updated in accordance with the changes in the status of the XR content and the level of immersion.

In at least one example, the computer system can vary a level of engagement between the user and the user interface, including changing the level at which a user can engage with (e.g., manipulate, interact with, move . . . etc.) a virtual object displayed to the user. In at least one example, the computer system can vary a level of engagement between the user and the user interface, including changing the level at which a user can engage with (e.g., manipulate, interact with, move . . . etc.) a 3-D space or 3-D environment, including virtual 3-D spaces displayed to the user. In one example, the levels of engagement between the user and the virtual objects and/or 3-D spaces can be automatically changed based on detected facial features, hand gestures, gaze direction, and so forth. In one example, the levels of engagement between the user and the virtual objects and/or 3-D spaces can be manually adjusted using the buttons, dials, crowns, and other physical interactions between the user and the device having the computer system described herein.

Any of the features, components, and/or parts, including the arrangements and configurations thereof shown in FIG. 15-4A and 15-4B can be included, either alone or in any combination, in any of the other examples of devices, features, components, and parts shown elsewhere and described herein. Likewise, any of the features, components, and/or parts, including the arrangements and configurations thereof shown and described with reference to figures shown elsewhere can be included, either alone or in any combination, in the example of the devices, features, components, and parts shown in FIG. 15-4A and 15-4B.

FIGS. 15-5A-15-5C illustrate examples of setting levels of immersion for operating system user interfaces as compared with application user interfaces. FIG. 15-5A illustrates an electronic device 15.5-101 displaying, via a display generation component (e.g., a display screen or generation component of a head mountable device), a three-dimensional environment 15.5-901 in a user interface. The electronic device 15.5-101 optionally includes a display generation component (e.g., a touch screen) and a plurality of image sensors (e.g., image sensors including cameras of an HMD described herein). The image sensors optionally include one or more of a visible light camera, an infrared camera, a depth sensor, or any other sensor the electronic device 15.5-101 would be able to use to capture one or more images of a user or a part of the user while the user interacts with the electronic device 15.5-101. In some embodiments, the user interfaces shown below could also be implemented on a head-mounted display that includes a display generation component that displays the user interface to the user and sensors to detect the physical environment and/or movements of the user's hands (e.g., external sensors facing outwards from the user), and/or gaze of the user (e.g., internal sensors facing inwards towards the face of the user).

As shown in FIG. 15-5A, device 15.5-101 captures one or more images of the physical environment 15.5-900 around device 15.5-101, including one or more objects in the physical environment 15.5-900 around device 15.5-101. In some embodiments, device 15.5-101 displays representations of the physical environment in three-dimensional environment 15.5-901. For example, three-dimensional environment 15.5-901 includes a representation **15.5-902*b* of a tree (e.g., corresponding to tree 15.5-902*a* in physical environment 15.5-900) and a representation 15.5-904*b* of a person (e.g., corresponding to person 15.5-904*a* in physical environment 15.5-900). In some embodiments, device 15.5-101 also displays one or more virtual objects (e.g., objects that are not in the physical environment 15.5-900) in the three-dimensional environment 15.5-901. For example, in FIG. 15-5A, device 15.5-101 is displaying virtual object 15.5-910 (e.g., an ornament) on representation 15.5-902*b* of a tree, virtual object 15.5-906 (e.g., a hat) on representation 15.5-904*b* of a person, and representation 15.5-908 of the sun. In some embodiments, representation 15.5-908 of the sun is displayed and treated as a light source in the three-dimensional environment 15.5-901, and the lighting effects resulting from representation 15.5-908 of the sun are applied, by device 15.5-101, to representations of physical objects and/or virtual objects displayed in three-dimensional environment 15.5-901**.

In FIG. 15-5A, device 15.5-101 is also displaying a user interface 15.5-912 of the operating system of the device 15.5-101. User interface 15.5-912 is optionally an application browsing user interface of the operating system of the device 15.5-101 from which one or more applications that are accessible on device 15.5-101 can be displayed/launched. In some embodiments, user interface 15.5-912 is any other user interface of the operating system of the device 15.5-101 (e.g., as compared with being a user interface of an application on device 15.5-101). In FIG. 15-5A, user interface 15.5-912 includes icons corresponding to different applications that are accessible on device 15.5-101 (e.g., an icon for App A, an icon for App B, an icon for App C, and an icon for App D), which are selectable to display the respective selected application via the display generation component 15.5-120 of device 15.5-101. In at least one example, the display generation component 15.5-120 can be a display module or screen of a head mountable device configured to project light toward a user's eyes when the user dons the head mountable device. The button 15.5-920 can be similar to or the same as the crowns, dials, and other buttons shown and described on other head mountable devices described herein and shown in other figures.

In some embodiments, user interface 15.5-912 is displayed at a location within three-dimensional environment 15.5-901 such that it overlays one or more representations of physical objects and/or virtual objects in three-dimensional environment 15.5-901 (e.g., overlaying and in front of part of representation **15.5-904*b* of the person, corresponding to person 15.5-904*a* in physical environment 15.5-900). In some embodiments, user interface 15.5-912 is located within three-dimensional environment 15.5-901 such that one or more virtual objects are in front of and overlay part of user interface 15.5-912 and/or one or more representations of physical objects are in front of and overlay part of user interface 15.5-912**.

In some embodiments, device 15.5-101 displays three-dimensional environment 15.5-901 and/or user interfaces displayed via display generation component 15.5-120 at a particular level of immersion. In FIG. 15-5A, device 15.5-101 is displaying three-dimensional environment 15.5-901 at a particular level of immersion 15.5-918 (e.g., indicated on immersion scale 15.5-916, the left-most side of which corresponds to no immersion, and the right-mode side of which corresponds to maximum immersion) at which representations **15.5-902*b* and 15.5-904*b* of physical objects are visible via display generation component 15.5-120. In some embodiments, a level of immersion includes an associated degree to which the content displayed by the electronic device obscures background content (e.g., content other than the user interface 15.5-912) around/behind the user interface 15.5-912, optionally including the number of items of background content displayed and the visual characteristics (e.g., colors, contrast, opacity) with which the background content is displayed. In some embodiments, the background content is included in a background over which the user interface 15.5-912 is displayed. In some embodiments, the background content includes additional user interfaces (e.g., user interfaces generated by the device 15.5-101 corresponding to applications, system user interfaces, etc.), virtual objects (e.g., files, representations of other users, etc. generated by the device 15.5-101) not associated with or included in the user interface 15.5-912, and/or real objects (e.g., pass-through objects representing real objects in the physical environment of the electronic device 15.5-101** that are displayed by the device such that they are visible via the display generation component). In some embodiments, at a first (e.g., low) level of immersion, the background, virtual and/or real objects are displayed in an unobscured manner. For example, a respective user interface with a low level of immersion is optionally displayed concurrently with the background content, which is optionally displayed with full brightness, color, and/or translucency. In some embodiments, at a second (e.g., higher) level of immersion, the background, virtual and/or real objects are displayed in an obscured manner (e.g., dimmed, blurred, removed from display, etc.). For example, a respective user interface with a high level of immersion is displayed without concurrently displaying the background content (e.g., in a full screen or fully immersive mode). As another example, a user interface displayed with a medium level of immersion is displayed concurrently with darkened, blurred, or otherwise de-emphasized background content. In some embodiments, the visual characteristics of the background objects vary among the background objects. For example, at a particular immersion level, one or more first background objects are visually de-emphasized (e.g., dimmed, blurred, displayed with increased transparency) more than one or more second background objects, and one or more third background objects cease to be displayed.

In FIG. 15-5A, an input is received on input element 15.5-920 of device 15.5-101. Input element 15.5-920 is optionally a mechanical input element that can be manipulated to change the level of immersion of the user interface(s) currently-displayed by device 15.5-101, such as a slider element or a rotational input element, where the amount and direction (e.g., increase or decrease) of the change in immersion is based on the magnitude and direction of the manipulation of the input element 15.5-920 (e.g., the direction and/or magnitude of the movement of input element 15.5-920, or the direction and/or magnitude of the rotation of a rotatable input element). In some embodiments, device 15.5-101 and/or input element 15.5-920 generate tactile feedback as the level of immersion is changes (e.g., minor tactile outputs for each increases or decreases stage of immersion, and different major tactile outputs upon reaching minimum or maximum immersion).

In FIG. 15-5A, the input received on input element 15.5-920 is an input to slide the input element 15.5-920 upward to increase the level of immersion of the currently displayed user interface(s) by an amount based on the amount of movement of element 15.5-920 upward. In response to the input in FIG. 15-5A, device 15.5-101 increases the level of immersion at which operating system user interface 15.5-912 is displayed to an intermediate level of immersion, as shown in FIG. 15-5B and immersion scale 15.5-916. In particular, in some embodiments, increasing the level of immersion at which user interface 15.5-912 is displayed causes device 15.5-101 to display user interface at a larger size via display generation component 15.5-120, as shown in FIG. 15-5B. Further, as described previously, additionally or alternatively, the content displayed surrounding and/or behind user interface 15.5-912 (e.g., representations of physical objects 15.5-902*b* and 15.5-904*b*, and virtual objects 15.5-910 and 15.5-906) is darkened and/or blurred in FIG. 15-5B, while user interface 15.5-912 is not darkened or blurred. In some embodiments, increasing the level of immersion at which the currently-displayed user interface(s) is displayed additionally or alternatively increases atmospheric visual and/or audio effects associated with virtual or physical objects displayed via display generation component 15.5-120. For example, in FIG. 15-5B, the rays of light being emitted from representation 15.5-908 of the sun have been lengthened (e.g., corresponding to more virtual light being emitted from representation 15.5-908), and ornament 15.5-910 on representation 15.5-902*b* of the tree has begun to shine as a result. Additional or alternative changes in atmospheric lighting, visual, audio, etc. effects in conjunction with changes in levels of immersion are similarly contemplated.

As previously mentioned, in some embodiments, the levels of immersion at which different user interfaces are displayed are optionally set independently from one another. For example, changes in the level of immersion at which operating system user interfaces are displayed optionally do not change the level of immersion at which application user interfaces are displayed, and in some embodiments, changes in the level of immersion at which the user interface of a first application is displayed do not change the level of immersion at which the user interface of a second application is displayed. Thus, in some embodiments, in response to an input to switch from displaying one user interface to displaying another user interface, device 15.5-101 optionally displays the switched-to user interface at the level of immersion at which that user interface was last displayed, independent of any changes of immersion that were applied to the currently-displayed user interface.

For example, in FIG. 15-5B, device 15.5-101 detects an input selecting the icon corresponding to App C in user interface 15.5-912. In response, device 15.5-101 displays user interface 15.5-934 of App C, as shown in FIG. 15-5C. App C is optionally an application that is accessible via (e.g., installed on) device 15.5-101, and is optionally any type of application (e.g., a content viewing application, a word processing application, etc.). App C is optionally different from the operating system of device 15.5-101, and thus user interface 15.5-934 is optionally not a user interface of the operating system of device 15.5-101, but rather a user interface of App C.

As shown in FIG. 15-5C, in response to the input to display App C, device 15.5-101 is displaying user interface 15.5-934 at a level of immersion 15.5-932 that is higher than the level of immersion 15.5-918 at which device 15.5-101 was displaying user interface 15.5-912 in FIG. 15-5B (e.g., as indicated by immersion scale 15.5-930 for App C). This is optionally because, as previously described, the levels of immersion set for applications are optionally independent of the level of immersion set for the operating system of device 15.5-101. Therefore, it is optionally the case that the higher level of immersion at which device 15.5-101 is displaying user interface 15.5-934 of App C in FIG. 15-5C is the level of immersion at which user interface 15.5-934 was last displayed by device 15.5-101. If user interface 15.5-934 had last been displayed at a lower level of immersion than the level of immersion 15.5-918 for user interface 15.5-912 shown in FIG. 15-5B, device 15.5-101 would have optionally displayed user interface 15.5-934 in FIG. 15-5C at that lower level of immersion rather than at the higher level of immersion shown in FIG. 15-5C. Also shown in FIG. 15-5C is the increased size of user interface 15.5-934 on display generation component 15.5-120 (as compared with the size of user interface 15.5-912 in FIG. 15-5B) and the increased darkening and/or blurring of the content outside of/surrounding user interface 15.5-934 (as compared with the darkening and/or blurring of the content outside of/surrounding user interface 15.5-912 in FIG. 15-5B)—these changes in display characteristics are optionally some of the changes that occur in response to increased immersion, as previously described. Additional or alternative changes in display characteristics, such as those previously described, are also contemplated.

As previously described, changes in immersion at which a user interface in one application is displayed optionally do not change the level of immersion at which user interfaces of other applications and/or user interfaces of the operating system are displayed. For example, if device 15.5-101 detects an input to change the level of immersion of user interface 15.5-934 of App C in FIG. 15-5C (e.g., via input element 15.5-920), device 15.5-101 would change the level of immersion at which user interface 15.5-934 is displayed in accordance with that input, as previously described. After changing the level of immersion at which user interface 15.5-934 is displayed, in response to an input to redisplay user interface 15.5-912 (e.g., an input to cease display of user interface 15.5-934), device would optionally return to the display of FIG. 15-5B in which user interface 15.5-912 is displayed at level of immersion 15.5-918, which is the level of immersion at which user interface 15.5-912 was last displayed, and is independent from the changed level of immersion at which user interface 15.5-934 was displayed when the input to redisplay user interface 15.5-912 was detected.

In some embodiments, applications (e.g., App C) include controls in their user interfaces for changing the level of immersion at which those applications are displayed. For example, in some embodiments, user interface 15.5-934 of App C includes controls for increasing or decreasing the level of immersion at which user interface 15.5-934 is displayed, and the immersion at which App C is displayed is changed by device 15.5-101 in response to interaction with those controls additionally or alternatively to interaction with input element 15.5-920. Further, in some embodiments, immersion above a threshold (e.g. maximum immersion) for an operating system user interface is reachable in response to inputs detected at input element 15.5-920. However, in some embodiments, immersion above that threshold for an application user interface is not reachable in response to inputs detected at input element 15.5-920—in some embodiments, the immersion at which an application user interface is displayed can only reach the threshold immersion using the input element, and once at that threshold, a different type of input is required to increase the immersion at which the application user interface is displayed beyond that threshold. For example, in FIG. 15-5C, the level of immersion 15.5-932 at which user interface 15.5-934 is displayed is optionally the highest immersion that can be reached for user interface 15.5-934 via inputs at input element 15.5-920. To increase immersion past the level of immersion 15.5-932, device 15.5-101 optionally requires an input selecting a user interface element shown in user interface 15.5-934. For example, in FIG. 15-5C, user interface 15.5-934 includes user interface element 15.5-950 that is selectable to increase the immersion at which user interface 15.5-934 is displayed past level of immersion 15.5-932 (e.g., a user input selecting user interface element 15.5-950 optionally results in device 15.5-101 displaying user interface 15.5-934 at maximum immersion, or full screen, where no content surrounding user interface 15.5-934 is displayed by device 15.5-101). In some embodiments, user interface 15.5-934 only includes element 15.5-950 once the level of immersion at which user interface 15.5-934 is displayed has reached the threshold level of immersion previously described. In some embodiments, user interface 15.5-934 includes element 15.5-950 irrespective of whether the level of immersion at which user interface 15.5-934 is displayed has reached the threshold level of immersion previously described.

Any of the features, components, and/or parts, including the arrangements and configurations thereof shown in FIG. 15-5A-15-5C can be included, either alone or in any combination, in any of the other examples of devices, features, components, and parts shown elsewhere and described herein. Likewise, any of the features, components, and/or parts, including the arrangements and configurations thereof shown and described with reference to figures shown elsewhere can be included, either alone or in any combination, in the example of the devices, features, components, and parts shown in FIG. 15-5A-15-5C.

FIG. 15-6A shows application user interface 15.6-11002 displayed in three-dimensional environment 15.6-11000, 15.6-7128 that includes representation 15.6-7014' of physical object 15.6-7014 (e.g., a physical table), representations 15.6-7004' and 15.6-7006' of physical walls 15.6-7004 and 15.6-7006, respectively, and representation 15.6-7008' of physical floor 15.6-7008. In some embodiments, both computer-generated virtual objects that do not correspond to any specific objects in the physical environment (e.g., box 15.6-7016) and representations of objects in the physical environment are displayed to a user.

In some embodiments, as shown in FIG. 15-6A, application user interface 15.6-11002 provides media content to a user. For example, application user interface 15.6-11002 is a video player that includes a display of playback controls. In some embodiments, physical environment is a spatially constrained space (e.g., indoor space) surrounded by walls, physical objects, or other obstructions. Features of physical environment can be visible in the three-dimensional environment 15.6-11000 (e.g., an XR environment) displayed to a user, as shown in FIG. 15-6A, by the presence of representations 15.6-7004' and 15.6-7006' of physical walls 15.6-7004 and 15.6-7006, representation 15.6-7008' of physical floor 15.6-7008, and representation 15.6-7014' of physical object 15.6-7014 (e.g., a table). In some embodiments, computer generated virtual content, such as box 15.6-7016, which has no correspondence in the physical environment is also displayed to a user by computer system.

As shown in FIG. 15-6A, a first portion of the three-dimensional environment 15.6-11000 includes computer-generated virtual objects that are not present in the physical environment, and a second portion of the virtual three-dimensional environment includes representations of objects in physical environment displayed as a part of three-dimensional environment 15.6-11000. FIG. 15-6A shows a first level of immersion generated by the display generation component of computer system in which a display of the XR environment concurrently includes a passthrough portion of a physical environment of computer system, virtual content from the application user interface 15.6-11002, and computer-generated virtual content, such as box 15.6-7016, that is distinct from the content provided by application user interface 15.6-11002.

In some embodiments, when a level of immersion is increased, an amount of input signals from the physical environment that user receives is reduced. For example, reducing inputs from the physical environment by not displaying representations 15.6-7004', 15.6-7006', and 15.6-7008' to a user, and/or displaying computer generated virtual content that provide visual inputs to a user to simulate a more spacious environment (e.g., open fields, outdoor spaces, or outer space) than that offered by physical environment, increases a level of immersion that is provided to a user in the three-dimensional environment 15.6-11000. In some embodiments, increasing a level of immersion that is provided to a user decreases an influence the physical environment has on user.

User may wish to be more fully immersed in the content of the media that is provided through application user interface 15.6-11002. Without exiting the application user interface 15.6-11002, user provides rotational inputs to rotational input element 15.6-7108 (e.g., by turning rotational input element 15.6-7108 or 15.6-7508). The input elements 15.6-7108 and 15.6-7508 can be similar to the buttons, crowns, dials, and other input mechanisms of head mountable display devices described herein. In some embodiments, user provides a first rotational input to rotational input element 15.6-7108 by turning in a first rotational direction (e.g., a clockwise rotation, or a counter-clockwise rotation). The first rotational direction changes a level of immersion presented by the display generation component (e.g., increases a level of immersion, or decreases a level of immersion). For example, by turning in a first rotational direction that increases the level of immersion, passthrough portions of physical environment are displayed with lower fidelity and/or fewer passthrough portions of physical environment are displayed (e.g., some passthrough portions of the experience cease to be displayed) than before the first rotational input. For example, representation 15.6-7014 ceases to be displayed, as shown in FIG. 15-6B. Instead, computer generated content, shown by dash lines, is presented as virtual content 15.6-11004 to a user.

In addition to increasing a level of immersion during a media consumption experience (e.g., watching a video, or listening to music), the level of immersion can also be increased to help user's concentration and focus while working. For example, increasing the level of immersion reduces noises from the ambient physical environment, and/or content from a smaller number of applications (e.g., a single application, a word processing application) is presented to a user (e.g., notifications from other applications are blocked while user is using a particular application at a high level of immersion).

Increasing a proportion of virtual (e.g., computer generated) content that is not a representation of the physical environment, increases a level of immersion presented to a user. Virtual content refers generally to content that is distinct from representations of the physical world (e.g., physical environment). For example, presenting a larger number of computer-generated virtual content, such as box 15.6-7016, which has no correspondence in the physical environment, increases a level of immersion represented to a user. In some embodiments, as the immersion level increases, computer generated content previously presented at a lower immersion level continues to be displayed (e.g., maintaining display of computer-generated content as level of immersion increases).

In some embodiments, a level of immersion presented to a user is related to an associated size (e.g., a magnitude) of a spatial extent (e.g., an angular range) of a field of view within which computer-generated content is displayed. At a lower level of immersion, computer generated virtual content is displayed within a smaller field of view. At a higher level of immersion, computer generated virtual content is displayed within and covers a larger field of view.

For example, in FIG. 15-6A, although box 15.6-7016 is computer-generated virtual content, it appears in a peripheral portion of a field of view of user. In contrast, as shown in FIG. 15-6B, in response to detecting a rotational input to the rotatable input element 15.6-7108 along the first direction, the passthrough portion showing representation 15.6-7014 ceases to be displayed, and a first portion (e.g., central portion) of the user's field of view is replaced with computer-generated virtual content 15.6-11004. In some embodiments, the computer-generated virtual content occupies an extended portion of user's field of view, starting in the central portion of user's field of view.

In some embodiments, the central portion of the user's field of view coincides with a middle region of the application user interface 15.6-110002. In some embodiments, a level of immersion has an associated angle of view, which is an angular size of a view cone of the field of view within which computer-generated virtual content is displayed. A higher level of immersion has a larger associated angle of view, and a lower level of immersion has a smaller associated angle of view.

In some embodiments, for the level of immersion shown in FIG. 15-6B, the angle of view is about #10°. For example, for an angle of view of about +10°, computer generated virtual content is displayed, from a perspective of user, starting at an angle of about 10° to the left, to about 10° to the right, and from about 10° above, to about 10° below an axis of user (e.g., an axis lying in a sagittal plane of user, for example, the axis of user projects forward, perpendicularly from a front surface plane of user's body). In some embodiments, computer generated virtual content occupies (e.g., completely occupies) the field of view of user within the angle of view. In some embodiments, computer generated virtual content partially occupies a portion of the field of view of user within the angle of view, but no input from the physical environment of computer system is provided, within the angle of view, in the field of view of user.

In some embodiments, decreasing a level of immersion involves changing a level of immersion from an initial virtual reality (VR) environment in which no passthrough portion of a physical environment of the computer system is displayed to a first immersion level that includes a display of the XR environment. In some embodiments, a highest level of immersion for a three-dimensional environment is a virtual reality environment in which no passthrough portion of the physical environment is provided.

Level of immersion influences a user's perception experience by changing properties of a mixed reality three-dimensional environment. Changing a level of immersion changes a relative prominence of virtual content to content from the physical world (visual and/or audio). For example, for audio components, increasing an immersion level includes, for example, increasing noise cancellation, increasing a spatiality of spatial audio associated with the XR environment (e.g., by moving audio sources to more points around the user or increasing a number and/or volume of point sources of audio), and/or by increasing a volume of audio associated with the virtual environment. In some embodiments, increasing a level of immersion changes a degree to which the mixed-reality environment reduces (or eliminates) signals from the physical world that are presented to the user (e.g., audio and/or visual passthrough of a portion of the physical environment of the computer system). For example, increasing an immersion level includes increasing a proportion of the visual field of view that displays the virtual content, or decreasing a prominence of a representation of the real world (e.g., physical environment) by dimming, fading, or reducing an amount of the representation of the real world that is displayed to the user.

Changing a level of immersion can also include changing a visual presentation of the mixed-reality environment, including an extent of a field of view and a degree to which visibility of the external physical environment is reduced. Changing a level of immersion can include varying a number or extent of sensory modalities that a user can use to interact with the mixed-reality three-dimensional environment (e.g., interacting through user's voice, gaze, and body motion). Changing a level of immersion can also include changing an extent of a fidelity and a resolution with which the mixed-reality environment simulates a desired environment. Changing a level of immersion can also include modifying an extent to which a viewpoint of the mixed-reality environment is modified to match a user's viewpoint or perspective, e.g., through capture of the user's motion and timely adjustment of portions of the three-dimensional environment that lie within a field of view.

At the level of immersion shown in FIG. 15-6B, some visual inputs from the physical environment are still provided to a user. In some embodiments, the representations 15.6-7004', 15.6-7006', and 15.6-7008' are provided at a lower fidelity (e.g., less focused, with less contrast, or more monochromatic) in the level of immersion shown in FIG. 15-6B compared to the level of immersion shown in FIG. 15-6A. Thus, while inputs from the physical environment are still provided to a user, the visibility of the external physical environment is reduced at a higher level of immersion compared to a lower level of immersion.

Rotatable input mechanism 15.6-7108, in addition to changing a level of immersion presented to a user, is also able to receive one or more press inputs that cause the computer system (e.g., a wearable device) to perform various operations, as described in Table 3 below.

The use of a single input device (e.g., rotatable input mechanism 15.6-7108) that accepts two (or more) different types of input (e.g., rotational inputs as a first type of input, and/or press inputs as a second type of input) reduces the number of distinct input devices that have to be provided to request or instruct performance of different functionalities. Reducing the number of input devices that have to be provided reduces manufacturing costs of the computer system, and reduces the number of components in the computer system that can fails. Reducing the number of components reduces the cost and complexity of manufacturing the computer system, and increases the reliability of the computer system. Reducing the number of input devices also reduces physical clutter on the computer system, freeing up more physical space on the computer system and helps to prevent accidental inputs from inadvertent contacts.

Table 15-1 below describes the behavior of the computer system in response to different operations on button 15.6-7108 (e.g., a hardware button, a solid-state button), in accordance with some embodiments.

TABLE 15-1

| Number of presses | Device On (Worn) | Device On (Not Worn) | Device Off |
|---|---|---|---|
| 1 press | Show home UI or passthrough or exit full screen | Standby (temporary tracking state) | N/A |
| 2 presses | Force quit menu | N/A | N/A |
| 3 presses | Accessibility mode | N/A | N/A |
| Turn | Change immersion | N/A | N/A |
| Press and hold | Re-center (fade out and fade in) | N/A | N/A |

For a computer system that is a wearable device (e.g., a head-mounted device, a strapped-on device, or a watch), while the wearable device is turned on and worn on the body of user, in response to detecting a rotational input to rotatable input element 15.6-7108 (e.g., a bidirectional rotatable input element), a level of immersion presented by the wearable device changes in the manner described above in reference to FIGS. 15-6A and 15-6B. For example, a level of immersion increases when a rotational input in the first rotational direction is provided to rotatable input element 15.6-7108. In another example, when the wearable device is turned on but not worn on the body of a user (e.g., user), in response to detecting a rotational input to rotatable input element 15.6-7108, no operation is triggered (e.g., the wearable device remains in a sleep state).

For a computer system that is a wearable device (e.g., a head-mounted device, a strapped-on device, or a watch), while the wearable device is turned on and worn on the body of user, in response to detecting a single press input to rotatable input element 15.6-7108, a home menu user interface is presented to a user, or an application user interface that was in an immersive or full-screen display mode when the single press input was detected exits the full-screen or immersive display mode. Thus, the wearable device is configured to perform different operations depending on a type of user input provided to the rotatable input element 15.6-7108 (e.g., a press input, or a rotational input).

For a computer system that is a wearable device (e.g., a head-mounted device, a strapped-on device, or a watch), while the wearable device is turned on but not worn on the body of user, in response to detecting a single press input to rotatable input element 15.6-7108, the wearable device transitions from a sleep state into a standby state.

For a computer system that is a wearable device (e.g., a head-mounted device, a strapped-on device, or a watch), while the wearable device is turned on and worn on the body of user, in response to detecting two press inputs within a preset time interval (e.g., less than 3 seconds, less than 2 seconds, less than 1 second) to rotatable input element 15.6-7108, an operating system menu (e.g., a force quit menu) is presented to a user.

For a computer system that is a wearable device (e.g., a head-mounted device, a strapped-on device, or a watch), while the wearable device is turned on and worn on the body of user, in response to detecting three press inputs within a preset time interval (e.g., less than 5 seconds, less than 3 seconds, less than 2 second) to rotatable input element 15.6-7108, an option to enter an accessibility mode is presented to a user.

In some embodiments, the rotatable input mechanism 15.6-7108 is also used to re-center a field of view of user. For example, instead of having a central portion of the view of field of view of user be aligned with a middle portion of the application user interface 15.6-11002, user recenters a central portion of his field of view to a different location in the three-dimensional environment 15.6-11000. For example, the new center of user's field of view corresponds to a point along an intersection of representations 15.6-7004' and 15.6-7006'. In some embodiments, recentering a field of view includes a display of computer generated virtual content fading out of the user's field of view at the previous center location of the user's field of view and then fading in, at the newly defined center location of the field of view of user, computer generated virtual content in that region. Optionally, the virtual content is presented with a higher fidelity or displayed with a higher contrast than prior to the recentering of the field of view of the user. While the wearable device is turned on and worn on the body of user, a press input on the rotatable input mechanism 15.6-7108 that is held (e.g., persists) for a preset time duration (e.g., about 2 second, or about 5 second) causes the wearable device to begin the recentering operation described above. While the press input is held, user can rotate or move her head so a central portion of her field of view is re-positioned to a new location. Upon selecting the new location, releasing the press input recenters the central portion of user's field of view to the new location.

As shown in Table 3, different numbers of inputs (e.g., individual or sequential inputs) of a type distinct from rotational inputs (e.g., press inputs) cause different operations to be performed by computer system. For example, in some embodiments, for a single press input: (1) a home menu user interface is displayed, (2) a passthrough portion of the physical environment is provided, or (3) the application exits a full-screen mode. For two press inputs provided in close succession (e.g., within 3 seconds, within 2 seconds, within 1 second), a force quit menu is displayed. For three press inputs provided in close succession (e.g., within 5 seconds, within 3 seconds, within 2 seconds), an accessibility mode is activated, or an option to activate the accessibility mode is provided.

Using the number of press inputs to determine which operation(s) to perform reduces the number of distinct input devices that have to be provided to accomplish different. Reducing the number of input devices that have to be provided reduces physical clutter on the device, freeing up more physical space on the device and helps to prevent accidental inputs from inadvertent contacts. Reducing the number of input devices also reduces the need to provide additional hardware wiring within the device, and instead, the processor can be programmed to interpret more types of inputs (e.g., based on a number of press inputs) from a particular input device.

The use of a rotational input mechanism allows the user to easily provide a range of inputs, which may be a continuous range or a range that encompasses a sequence of discrete steps or values, and bidirectionality of the rotational input mechanism allows the input to be easily and intuitively varied, in either direction, without having to display additional controls to the user. The same rotational input mechanism 15.6-7108 is able to receive a second type of input (e.g., a press input) that requests or instructs performance of discrete functions (e.g., dismiss or display a user interface object). Reducing the number of input devices that have to be provided reduces physical clutter on the device, freeing up more physical space on the device and helps to prevent accidental inputs from inadvertent contacts. The use of the rotational input mechanism provides direct access to changes in immersion levels and the performance of different operations, reducing the amount of time needed to effect particular outcomes (e.g., the user does not have to navigate through menus or visually displayed control elements to make a selection for performing the operation and/or changing an immersion level), thereby improving operational efficiency of the computer system.

With respect to immersion level, increasing an immersion level can helps to lessen constraints imposed by the physical environment of the computer system. For example, a more spacious virtual or XR environment can be realistically simulated by blocking out sensory out inputs from the physical environment (e.g., blocking visual input of a small/confined room, removing (audio) echoes from a small physical space) to provide a virtual environment that is more conducive for the user to interact with an application in the three-dimensional environment 15.6-11000.

User further increases a level of immersion from the level of immersion shown in FIG. 15-6B by applying a further rotational input in the same direction (e.g., the first rotational direction) as that applied to increase the level of immersion from that shown in FIG. 15-6A to FIG. 15-6B. In response to a second rotational input, the immersion level associated with display of the XR environment generated by the display generation component shown in FIG. 15-6B, increases to a second immersion level by displaying additional virtual content to a user.

Any of the features, components, and/or parts, including the arrangements and configurations thereof shown in FIG. 15-6A and 15-6B can be included, either alone or in any combination, in any of the other examples of devices, features, components, and parts shown elsewhere and described herein. Likewise, any of the features, components, and/or parts, including the arrangements and configurations thereof shown and described with reference to figures shown elsewhere can be included, either alone or in any combination, in the example of the devices, features, components, and parts shown in FIG. 15-6A and 15-6B.

While a number of user interface features and experiences that can be achieved with the system described in FIGS. 1-1A to 14.6-4 are provided above, additional user input systems and methods can operate in conjunction with the exemplary systems and methods in a variety of ways. According to one exemplary embodiment, the user can dynamically change the level of immersion by actuating an input. For example, a user can manipulate a input to gradually increases the level of immersion of the AR experience as an input progresses. This gradual change in the immersion can include, but is in no way limited to, a switch between a plurality of levels of immersion, a smooth animation between levels of immersion, the display of a window from AR space to VR space, where light from VR space is cast onto objects in AR space. Additionally, any number of motions can be detected and cause the initiation of a designated action, including, but in no way limited to, a user swipe to change a view, a swipe to change lighting, a horizontal swipe to change location or time of day while a vertical swipe changes level of immersion (and vice-versa), or a detection of a progression of swipes, such as a first swipe to expand windows, a second swipe that removes a wall, and a third swipe removes multiple walls and a roof in the displayed environment, as an example. Other detected input variations can also be used to modify the user's experience with the HMD, including, but in no way limited to, detecting repeated inputs to change levels of immersion, detecting a single continuous input to change through multiple levels of immersion, detecting a relatively long press to get navigation menu (geographic location, time of day, level of immersion). Similarly, as the AR/VR environment is being adjusted or presented, different combinations of removal and immersion can be performed, such as the floor remains even when the walls disappear, some furniture remains in place even when walls disappear, and/or a detected air swipe over by the user can change content, while a detected air swipe up or down changes a level of immersion. Additional input motions and resulting system outputs can be incorporated by the exemplary system.

Additionally, as noted above, some examples of the HMD include a set of power straps that include a speaker system, or can be in communication with earphones or another separate audio device. According to some examples, the audio output style can change or otherwise be modified to correspond to a level of immersion. According to one example, the power strap can be designed to produce spatial audio. As the dial or button 1-328 is actuated (either by pushing, pulling, rotating, etc.), the actuation can cause a dedicated audio change or setting. By way of example, if the user is watching a movie on the HMD, the system can provide stereo audio when movie is displayed in frame, and can provide surround sound audio when movie is displayed in an immersive environment. Furthermore, in some examples the audio level corresponds to a change in a level of immersion (e.g. window slide down, walls slide away, etc.).

In other examples, the effect of the level of immersion can be related to the operating system only. For example, the system can use dedicated control to adjust a level of immersion for the operating system, and according to this example, applications have their own immersion controls (while the operating system is in a first level of immersion, a user can enter an application, adjust the immersion in the application, and then return to the operating system that is at the first level of immersion). According to one example of this configuration, the Digital Crown can be a dedicated control wherein the immersion varies based on a direction and/or magnitude of rotation of the Digital Crown. In some examples, major haptics can be disposed at either end of the crown, and minor haptics can be located throughout the dial of the crown to provide desired haptic effects. In some examples, the system can gradually change the level of immersion in the first experience in accordance with a user input (e.g., based on magnitude and/or direction of the user input). Additionally, application controls can be different for different applications, and can be displayed in the user interface. Furthermore, in some examples, the level of immersion can include directing amount of passthrough content that is replaced. The level of immersion include an amount of de-emphasis of passthrough content or an amount of display area occupied with the corresponding experience. In some examples the level of immersion also controls or corresponds to atmospheric effects, and/or audio effects. In some examples, the controls enable a 360 degree experience. The video content provided to the user can be in either a VR or an AR environment.

In some examples, the user will leave a first application and enter a second application, each having a different level of immersion. According to one example, when the user toggles between the applications, an adjustment to a level of immersion in a first application, will not affect the second application or the system as a whole. If the user returns to the first application (or the second application) after exiting to the operating system, the system will return to the level of immersion set in the application previously (e.g., without regard to any changes in level of immersion for the operating system). Similarly, the system can remember the user's level of immersion when toggling between AR/VR modes. For example, while displaying a first experience with a first level of immersion, the system can detect an input to adjust the level of immersion, increase to a second level of immersion selected based on user input, and detect a request to reduce to a low level of immersion. Upon resuming the experience, the user can resume at the second level of immersion.

Additionally, the present system includes various levels of immersion and passthrough. According to one example, a low level of immersion is essentially a passthrough. In one example, a level of immersion can be adjusted by rotating a digital crown (e.g., based on direction and/or magnitude of rotation). In some examples, a request to reduce to a low level of immersion can be a press of the digital crown (e.g., in a direction perpendicular to the direction of rotation). Similarly, in some examples, rotating the crown can resume the experience from the second level of immersion, or can resume the experience gradually increasing the level of immersion from the low level of immersion (e.g., not from the second level of immersion). In addition to the crown rotation, any number of gestures can be used to trigger the system to resume an experience. Similarly, a long press that exceeds a threshold amount of time can cause the system to initiate a passthrough setting, and a release of the long press can cause the system to go back out of passthrough mode.

In some examples, when displaying a simulated environment, the system can use a first transition if the physical environment meets a first criteria, and can use a second transition if the physical environment meets a second criteria. According to this example, the first criteria can be that a portion of the physical environment in front of the user is more than a threshold distance away from a viewpoint of the user. The second criteria can be that a portion of the physical environment in front of the user is less than the threshold distance away from the viewpoint of the user. According to some embodiments, the environment can replace at least a portion of a view of the physical environment, and the transition can be gradual based on user input, such as a rotation of the crown. In some examples, the beginning and end states can be the same, but the intermediate states can be different. In some examples, the first transition can take into account depth information about a respective portion of the environment and the second transition does not take into account depth information about the respective portion of the environment. The first transition can be a cross dissolve starting with a portion of the simulated environment that is furthest away from a viewpoint of the user, and the second transition can be a transition that gradually encompasses portions of the physical environment based on a distance from the viewpoint of the user to the portions of the physical environment. According to these examples, portions of the room (e.g., architecture or furniture) that are "in front of" the portion of the physical environment that has been taken over by the simulated environment can be shown in front of the simulated environment (e.g., occlude portions of the simulated environment) and portions of the room (e.g., architecture or furniture) that are "behind" the portion of the physical environment that has been taken over by the simulated environment can be hidden by the simulated environment (e.g., are occluded by portions of the simulated environment). In some examples, the environment includes light sources that shine onto portions of the physical environment, the environment can take into account the geometry of the room, the system can take into account the architecture of the room (location of walls/windows/doors, etc.), the environment can include volumetric effects that fill space within the physical environment, can include lighting effects, and/or particle effects.

In some examples, the present system includes a spatial effect (environments/atmosphere) immersion adjustment. According to this example, when initiating a spatial effect, the spatial effect can be in an intermediate immersive state, detect an input, and if the input is a first input, increase immersion in spatial effect if the input is a second input, decrease immersion in spatial effect. In some examples, the spatial effect can be an environment that replaces at least a portion of the view of the physical space. In some examples, the system can detect if the user looks to the side and can, in response to the detected motion, fade the audio component of the environment. The user can also, in some examples, choose extent of visuals for maximum level of immersion (e.g., between 180 degree immersion and 360 degree immersion as maximum level of immersion). Alternatively, the application can designate an extent of visuals for maximum level of immersion (e.g., between 180 degree immersion and 360 degree immersion as maximum level of immersion).

In some examples, the spatial effect is an atmosphere that modifies at least a portion of the view of the physical space (e.g., with lighting or particle effects). In some examples, the system can detect the user look to the side to fade the atmosphere effect. In some examples, there are more levels of immersion for environments than atmospheres. Additionally, displaying the atmosphere can include replacing something outside of the room (e.g., ceiling, imagery outside of windows), can include increasing an amount of light in the room, and/or can include reducing the amount of light in the room.

Any number of visual indicators can be used to communicate the level of immersion, including, but in no way limited to a graphical indicator. According to this example, major indicators can indicate major levels of immersion, and minor indicators can indicate minor levels of immersion. In some examples, the first major level of immersion can be audio only, the second major level of immersion can be audio and some visuals, and the third major level can include audio and expanded visuals.

In some examples, a threshold distance is established by the system such that if a user moves more than a threshold distance while displaying an environment, the system can cease to display the environment. According to this example, the environment gradually fades out as the user approaches the threshold distance. In some examples, if the user moves more than a threshold distance while displaying an environment, the system can cease to display the environment/if displaying an atmosphere, maintain display of the atmosphere.

In one example, the system can detect the motion of the user and adjust the user interface accordingly. According to one example, when the user looks to the side or back, the system can add duck audio for the environment. In response to a detected movement, the system can reduce spatial audio, reduce noise cancellation, and or reduce complexity of audio (e.g., number of tracks). Similarly, when the user looks to the side or back, the system can fade out some of the visuals of the environment. For example, the system can feather cutout around user's feet.

In some examples, the system can include an environment breakthrough where the system will reveal a portion of the physical environment during use. According to one example, the environment appears to approach a user as the user increases immersion. Further, in some examples, the environment rotates based on body movement, but not based on head movement. For example, a virtual environment is viewable from a particular region, and when a user shifts position toward a boundary of the region, the system can reveal a portion of the physical environment to the user. Alternatively, the system can reduce a level of immersion in the environment when revealing the portion of the physical environment; can reveal the portion of the physical environment without regard to the presence or absence of obstacles; and/or if user moves away from the boundary, cease to display the portion of the physical environment. In some examples, the amount of the physical environment that is revealed can be based on the distance from the boundary, the speed of movement toward the boundary, and/or the acceleration of the user. In some examples, if the user continues moving toward a boundary, the system can cease to display the virtual environment. In some examples, the physical environment is not displayed, such as if the user is just looking around, or if the user moves toward the boundary but is not within a threshold distance of the boundary. In some examples, the system uses spatial transition to reveal physical space. In some examples, the breakthrough is not applied to atmospheres. Similarly, if a user leaves a virtual environment when an application is in a virtual environment, the system can cease to display the application. If, however, the user leaves a virtual environment when the application is outside the virtual environment, the system can continue to display the application on the system. Alternatively, if the user leaves a virtual environment when the application is in the virtual environment, the system can reduce the size of the application and move into physical space.

Additionally, the present system can, in some examples, set time and day for the system, to be used with different applications. In one example, when a user requests to display an environment, the system can pick a time of day for the environment based on a system setting (e.g., if time of day has a first setting, environment is displayed with a first time of day, if time of day has a second setting, environment is displayed with second time of day). In some examples the user can select the time of day manually or automatically by the device. In some examples, the selection can be based on a current time of the day, or alternatively, can be selected based on a lighting level of the room. In some examples, the system can provide the user with access to a control center that includes setting inputs for setting the time of day, using any number of system controls. According to this example, the control center can fade from display after the time of day is set. Additionally, according to one example, when displaying an environment picker user interface, the system can update displayed icons to represent current time of day (e.g., daytime or nighttime); can display different simulated times of day for different nighttime environments (e.g., dusk, midnight, or predawn); and can display different simulated times of day for different daytime environments (e.g., morning, afternoon, or early evening). According to one embodiment, the system can include a night mode that darkens passthrough for portions of the field of view of the user that are showing passthrough content. According to one example, if an atmosphere is currently selected, the system can disable time of day picker. Similarly, the time of day setting can be ignored for some applications/experiences (e.g., mindfulness and other contemplative experiences). In some examples, changing the time of day setting can affect UI outside of the app/experience. Further variations can also include, but are in no way limited to, setting different degrees of passthrough dimming for different times of day (e.g., more dimming for nighttime, less dimming for daytime); changing immersion in environment with a physical control or a control center setting; allowing access to settings for environment even if environment is hidden (e.g., at 0% immersion); and/or displaying the environment volume control.

In at least one example, when joining a communication session while in a simulated environment with a user in a different environment, the devices described herein can maintain a simulated environment. The first user can see a representation of the second user in the first user's environment and the second user can see a representation of the first user in the second user's environment. In one example, when predetermined criteria are met, the environment(s) can be shared between users. In such an example, the environment can automatically switch when one user switches, the switch can occur when a user accepts a prompt to switch environments, the switch can occur after the environment is downloaded after a user accepts a prompt to switch environments, and/or the switch can occur after the new environment has been fully downloaded.

In one example, the current environment can be shared from an information panel. The system/user-interface of the HMD can prompt the user to share the environment with other users if the user switches while in a communication session. An environmental picker can indicate which environment is currently being shared with the user. The environment picker can indicate which environments have been downloaded. The user-interface can present an option to switch for all users or just switch for themselves. Switching environments can be based on a user request that switches the system environment even when a communication session ends, switching the environment based on a prompt to share other user's environment may not switch the system environment. In one example, if a user switches the environment while not in a communication session, the user may not be prompted to share with others.

In one example, the user-interface can prompt a user to join an environment of another user and the other user has the option to decline or accept. In one example, an even can be based on a user switching the environment. In one example, an even can be based on a user starting to share content. In one example, if a user declines to switch environments, that user can leave the sharing session. In one example, when content sharing sessions end, the user-interface can revert back to the original environment. In one example, when users are in a shared environment, the users can have shared spatial truth. In one example, the users can be seeing different portions of the environment when there is a shared environment. In one example, there is no spatial truth for even if both users have selected the same environment if the users are only in a shared environment and if they are not in a shared environment.

In one example, when switching to a shared environment, the current immersion level can be maintained. In one example, when switching to a shared environment, if the level of immersion is below a threshold, the current immersion level may not be maintained. In one example, different users can set different immersion levels. In one example, different users can set different volume levels. In one example, different users can set different immersion levels while not in full screen viewing mode, but if the content is changed to full screen viewing mode, all the user can have immersion set to at least a threshold level (e.g., the same level or a level that is a "high" level). In one example, and if users are sharing an environment, the time of day is synchronized, if users aren't sharing an environment, the time of day is not synchronized. In one example, any user can change the time of day. In one example, other users can receive a notice of the change of time of day.

In one example, while participating in a communication session and the environment changes, and if a first set of conditions is met, the user-interface can change the environment for multiple users in the communication session. If the first set of conditions are not met, the environment for different users remain different from each other. The first set of conditions can include a user confirmation that the environment should be shared. In one example, when a user displays an environment, the user is displayed at a predefined orientation. In one example, if the user joins a communication session with a shared environment, the user can be placed at a different orientation. In one example, the different orientation can be based on the positions of other participants in the environment. The different orientation can be based on the number of other participants in the environment. In one example, when an activity of the communication session changes, the participants can be shifted based on the selected activity. In one example, the participants can be shifted to face the same direction for shared visual experience (e.g., video). In one example, the participants can be shifted to face different directions (e.g., toward each other) for a participatory experience (e.g., a game).

In at least one example, the immersion state can be maintained for different participants and a notification can be displayed when the shared environment is changed. The notification can indicate who changed the environment. In one example, other users may need download the environment before displaying the environment. In one example, multiple participants (e.g., all participants) can be placed in a center of the environment, and in some examples facing different directions. In one example, one user can see other users at locations that are different from where those users see themselves. In one example, the time of day for the environment can be synchronized between different users. In one example, when one user changes the time of day, the time of day can change for multiple or all users.

In one example, the user can pick a new environment from session UI for communication session (e.g., with audio/video start/stop option, call end option, and/or user status information). In one example, the user can pick a new environment from home UI (e.g., with multiple environment options, option to display available apps, and/or option to display available people for a communication session). The UI can highlight around a currently selected environment. Different color highlights can be used for shared environments vs. non-shared environments. In one example, the home UI can be displayed over representations of one or more other participants. In one example, new participants can be added to the conversation.

In one example, while the user is in a first viewing angle viewing an environment from a first angle, the system can detect a predetermined event in accordance with a determination that the perspective of the user meets respective criteria, change a viewing angle of the environment in accordance with a determination that the perspective of the user doesn't meet the respective criteria, and maintain the viewing angle of the environment. In one example, the angle of the environment can determine a location of the portal into the environment. In one example, the predetermined even can be dragging a window. In one example, the predetermined even can be detecting a change in an orientation of the user. In one example, the change in orientation can be a change in orientation of the user's body. In one example, the change in orientation can be a change in orientation of the user's head or a change in orientation of a portion of the user relative to the horizon of the environment or relative to the horizon of the physical world. In one example, the viewing angle for a different type of change in perspective of the user is not shifted (e.g., turning left/right as opposed to tilting with respect to the horizon). In one example, the predetermined event includes detecting a request to change a position of content. In one example, the predetermined event includes detecting a request to re-center content. These can be carried out be pressing a hardware button or by activating a software button. The software button can be displayed in response to a determination that the perspective of the user has changed.

In one example, a horizon of the environment remains consistent as the viewing angle of the environment changes. In one example, a degree of immersion of the environment remains consistent as the viewing angle of the environment changes. In one example, the environment can be viewed through a portal in the real world and the location of the portal can shift. In one example, when the environment is shifted, content that was at a first distance into the environment is shifted in distance relative to the users, for example shifted closer or content was docked at a predefined location and is turned into a window that can be repositioned at a user defined position. In one example, if a first kind of content was displayed with the environment, the first kind of content can shift to maintain the same or similar angle relative to the perspective of the user and if a second kind of content was displayed with the environment (e.g., user-positionable windows), that content can remain at a world locked position.

In one example, another predetermined event can be detected after the perspective of the user shifts again and in response, the viewing angle of the environment can be shifted. In one example, if the perspective of the user shifts back, the viewing angle of the environment can shift back. If the perspective of the user shifted to a different perspective, the viewing angle of the environment can shift to a different viewing angle. If a docked window was undocked when the viewing angle shifted the first time, the window can move back to the docked location.

In one example, a mechanical or software button of the HMD can be pressed once to go to home UI and again to hide home UI. In one example, while displaying an application, a button can be pressed to replace at least a portion of the application with a home UI. When pressed again, the home UI can be hidden. In one example, home UI can include representations of people, environments, and apps. Hiding home UI can include replacing home UI with pass-through display. In one example, hiding home UI can include ceasing to display a virtual environment in which the home UI is display. The home UI can be used to switch which virtual environment is displayed. IN one example, if an application is a media application with media playing, the UI can display a min-player, including video PiP, audio player, including representation of video or audio content, playback controls. In one example, the mini-player can persist after home UI is hidden.

In one example, when the home UI is displayed, the user can scroll through home UI and the user can navigate through sections of the UI (e.g., environments, people, and/or apps). In one example, a current section can be maintained when the user leaves and returns to home UI. In one example, the current selection can be maintained if the user returns to home UI within a time threshold and resets to a predetermined section (e.g., first page of applications) if the user returns to home UI after the time threshold (e.g., the next day, next session, or one hour). In one example, a quick look object (e.g., an object dragged out of an application) can remain when the application is dismissed. In one example, the quick look object is an object pulled out of the application before it was replaced with the home UI. In one example, the quick look objects hide when home UI is hidden (e.g., on a second button press). In one example, a second application can be launched from home UI while the quick look object is displayed. In one example, the quick look object can be dragged by the user in the UI into a second application to perform an operation in the second application based on the quick look object (e.g., added to a message or document).

In one example, the user can press the home button again to re-display the home UI. In one example, the button is a hardware button. In one example, the button is a solid state button. In one example, the system UI can be treated as the same as was the application (e.g., a button press while they are displayed can cause the system UI to be replaced with the home UI). In one example, a quick double press of the button can be a command to get an application management UI (e.g., force quit menu or multitasking UI).

In one example, the system can detect a press input on a button. If the device is displaying an immersive experience of an application, the UI can display the application in a non-immersive mode. If the device is displaying a non-immersive experience, the UI can replace the non-immersive experience with the home UI. In one example, the button can be pressed again during a non-immersive experience to cease to display the home UI. In one example, the non-immersive experience can be displayed in a virtual environment that continues to be displayed after the home button is pressed. In one example, virtual environment continues to be displayed while the home UI is displayed. In one example, the home UI can be used to switch which virtual environment is displayed.

In one example, the rotatable input mechanism of the HMD can be used to perform a UI immersion level change operation when a first input type is detected and a different operation when a second input type is detected. For example, the change in immersion can be based on a rotation of the mechanism, a direction of rotation, an amount of rotation, and so forth. In one example, the first input type is a rotation and the second input type is a depression of the mechanism. In one example, the number of presses can change what operation is performed. In one example, the duration of the press can change what operation is performed. In one example, the second operation can be a home display operation. In one or more other examples, the second operation can include an application dismiss operation, a virtual object dismiss operation, an application manager UI display operation, an accessibility mode operation, reentering virtual UI elements in the AR/VR environment, and/or an operation that can be used in accordance with another input device to perform a third operation. In one or more other examples, the third operation can depend on the duration and/or pattern of inputs and can include taking a screenshot, powering off the device, restarting the device, and/or entering a hardware reset mode.

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

Physical environment: A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

Computer-generated reality: in contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations (e.g., for accessibility reasons), adjustments to characteristic(s) of virtual object(s) in a CGR environment may be made in response to representations of physical motions (e.g., vocal commands). A person may sense and/or interact with a CGR object using any one of their senses, including sight, sound, touch, taste, and smell. For example, a person may sense and/or interact with audio objects that create 3D or spatial audio environment that provides the perception of point audio sources in 3D space. In another example, audio objects may enable audio transparency, which selectively incorporates ambient sounds from the physical environment with or without computer-generated audio. In some CGR environments, a person may sense and/or interact only with audio objects. Examples of CGR include virtual reality and mixed reality.

Virtual reality: A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

Mixed reality: In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end. In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationery with respect to the physical ground. Examples of mixed realities include augmented reality and augmented virtuality.

Augmented reality: an augmented reality (AR) environment refers to a simulated environment in which one or more virtual objects are superimposed over a physical environment, or a representation thereof. For example, an electronic system for presenting an AR environment may have a transparent or translucent display through which a person may directly view the physical environment. The system may be configured to present virtual objects on the transparent or translucent display, so that a person, using the system, perceives the virtual objects superimposed over the physical environment. Alternatively, a system may have an opaque display and one or more imaging sensors that capture images or video of the physical environment, which are representations of the physical environment. The system composites the images or video with virtual objects, and presents the composition on the opaque display. A person, using the system, indirectly views the physical environment by way of the images or video of the physical environment, and perceives the virtual objects superimposed over the physical environment. As used herein, a video of the physical environment shown on an opaque display is called "pass-through video," meaning a system uses one or more image sensor(s) to capture images of the physical environment, and uses those images in presenting the AR environment on the opaque display. Further alternatively, a system may have a projection system that projects virtual objects into the physical environment, for example, as a hologram or on a physical surface, so that a person, using the system, perceives the virtual objects superimposed over the physical environment. An augmented reality environment also refers to a simulated environment in which a representation of a physical environment is transformed by computer-generated sensory information. For example, in providing pass-through video, a system may transform one or more sensor images to impose a select perspective (e.g., viewpoint) different than the perspective captured by the imaging sensors. As another example, a representation of a physical environment may be transformed by graphically modifying (e.g., enlarging) portions thereof, such that the modified portion may be representative but not photorealistic versions of the originally captured images. As a further example, a representation of a physical environment may be transformed by graphically eliminating or obfuscating portions thereof.

Augmented virtuality: an augmented virtuality (AV) environment refers to a simulated environment in which a virtual or computer generated environment incorporates one or more sensory inputs from the physical environment. The sensory inputs may be representations of one or more characteristics of the physical environment. For example, an AV park may have virtual trees and virtual buildings, but people with faces photorealistically reproduced from images taken of physical people. As another example, a virtual object may adopt a shape or color of a physical article imaged by one or more imaging sensors. As a further example, a virtual object may adopt shadows consistent with the position of the sun in the physical environment.

Hardware: there are many different types of electronic systems that enable a person to sense and/or interact with various CGR environments. Examples include head mounted systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head mounted system may have one or more speaker(s) and an integrated opaque display. Alternatively, a head mounted system may be configured to accept an external opaque display (e.g., a smartphone). The head mounted system may incorporate one or more imaging sensors to capture images or video of the physical environment, and/or one or more microphones to capture audio of the physical environment. Rather than an opaque display, a head mounted system may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light sources, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

The foregoing is merely illustrative and various modifications can be made to the described embodiments. The foregoing embodiments may be implemented individually or in any combination.

What is claimed is:

1. A head-mountable display device, comprising:
an outer frame defining:
- a first opening;
- a second opening;
- an internal volume between the first opening and the second opening;
- an intake port between the first opening and the second opening; and
- an exhaust port between the first opening and the second opening;

a front cover assembly disposed in the first opening;

an inner frame coupled to the outer frame, the inner frame defining a first aperture and a second aperture;

a curtain assembly occluding the second opening, the curtain assembly comprising an elastic layer defining an external surface and an air-impermeable layer defining the internal volume; and a fan assembly, comprising:

a first fan disposed in the internal volume and aligned with the first aperture; and a second fan disposed in the internal volume and aligned with the second aperture;

wherein the first fan and the second fan are configured to draw air into the internal volume through the intake port and push the air out from the internal volume through the exhaust port.

2. The head-mountable display device of claim 1, wherein the outer frame includes:

an upper sidewall defining the exhaust port; and a lower sidewall opposite the upper sidewall, the lower sidewall defining the intake port.

3. The head-mountable display device of claim 1, further comprising a printed circuit board disposed in the internal volume.

4. The head-mountable display device of claim 3, wherein:

the first fan includes a first housing thermally coupled to the printed circuit board; and the second fan includes a second housing thermally coupled to the printed circuit board.

5. The head-mountable display device of claim 4, further comprising a display assembly disposed in the internal volume.

6. The head-mountable display device of claim 5, wherein the fan assembly is disposed between the display assembly and the printed circuit board.

7. The head-mountable display device of claim 5, wherein the display assembly includes a first display screen and a second display screen.

8. The head-mountable display device of claim 7, wherein:

the first display screen is aligned with the first aperture; and the second display screen is aligned with the second aperture.

9. The head mountable device of claim 8, wherein:

the display assembly further includes:

a first lens aligned with the first display screen; and a second lens aligned with the second display screen; and the curtain assembly occludes the second opening between the outer frame and the first and seconds lenses.

10. A head-mountable device, comprising:

a frame defining:

an internal volume;

an intake port; and an exhaust port;

a curtain assembly coupled to the frame, the curtain assembly including:

a first layer defining an external surface; and a second layer defining the internal volume, the second layer being air-impermeable;

a heat sink disposed in the internal volume; and a fan assembly, comprising:

a housing including the heat sink; and an air mover disposed in the housing and configured to draw air into the internal volume through the intake port and push the air out of the internal volume through the exhaust port.

11. The head-mountable device of claim 10, further comprising a printed circuit board having a heat-generating component, wherein the housing is thermally coupled to the heat-generating component.

12. The head-mountable device of claim 11, wherein:

the heat sink is a first heat sink;

the housing is a first housing;

the heat-generating component is a first heat-generating component;

the printed circuit board includes a second heat-generating component;

the head-mountable device further comprises a second heat sink; and the fan assembly comprises a second housing including the second heat sink, the second housing thermally coupled to the second heat-generating component.

13. The head-mountable device of claim 10, wherein:

the first layer is elastic; and the second layer is non-elastic.

14. The head-mountable device of claim 13, wherein:

the first layer comprises a woven textile; and the second layer comprises a polymer.

15. A wearable device, comprising:

an outer frame defining:

an external surface of the wearable device; and an internal volume;

an inner frame coupled to the outer frame at discrete points, the inner frame defining a first aperture and a second aperture;

a curtain assembly coupled to the outer frame, the curtain assembly including an air-impermeable layer defining the internal volume;

a metal heat sink disposed in the internal volume;

a printed circuit board disposed in the internal volume; and a fan assembly disposed in the internal volume, the fan assembly including:

a first metal housing aligned with the first aperture and thermally coupled to the printed circuit board; and a second metal housing aligned with the second aperture and thermally coupled to the printed circuit board;

wherein:

the first metal housing defines a first major plane; and the second metal housing defines a second major plane disposed non-parallel to the first major plane.

16. The wearable device of claim 15, wherein:

the outer frame comprises a first material; and the inner frame comprises a second material different than the first material, the second material being stronger than the first material.

17. The wearable device of claim 16, wherein:

the first material comprises a metal; and the second material comprises a magnesium alloy.

18. The wearable device of claim 16, wherein the outer frame defines an intake port and an exhaust port.

19. The wearable device of claim 18, wherein the outer frame defines an upper sidewall defining the exhaust port and a lower sidewall opposite the upper sidewall, the lower sidewall defining the intake port.

20. The wearable device of claim 19, the fan assembly further including:

a first air mover disposed in the first metal housing and configured to draw air into the internal volume through the intake port and push the air out from the internal volume through the exhaust port; and a second air mover disposed in the second metal housing and configured to draw air into the internal volume through the intake port and push the air out from the internal volume through the exhaust port.

* * * * *